United States Patent [19]

Sharrit et al.

[11] Patent Number: 4,636,717

[45] Date of Patent: Jan. 13, 1987

[54] VECTOR NETWORK ANALYZER WITH INTEGRAL PROCESSOR

[75] Inventors: David D. Sharrit; Robert G. Dildine, both of Santa Rosa; Mark D. Roos, San Carlos; John T. Barr, IV, Santa Rosa, all of Calif.

[73] Assignee: Hewlett-Packard Company, Palo Alto, Calif.

[21] Appl. No.: 569,05[illegible]

[22] Filed: Jan. 9, 1984

[51] Int. Cl.$^{4}$ .............................................. G01R 23/16

[52] U.S. Cl. .................................. 324/77 B; 364/485

[58] Field of Search ................ 455/226; 364/484, 485; 324/77 R, 77 B, 77 C, 77 CS, 77 D, 77 E, 77 F

[56] References Cited

U.S. PATENT DOCUMENTS

| | | | |
|---|---|---|---|
| 4,004,137 | 1/1977 | Schroder | 324/79 D |
| 4,181,967 | 1/1980 | Nash | 324/79 D |
| 4,244,024 | 1/1981 | Marzalek et al. | 324/77 B |
| 4,363,099 | 12/1982 | Srinivasan | 364/484 |
| 4,380,732 | 4/1983 | Tanaka | 324/77 E |

OTHER PUBLICATIONS

Theory and Application of Digital Signal Processing, by Lawrence R. Rabiner and Bernard Gold, pp. 393–398, 1975.

Automatic Network Analyzer 8542, Section IV Fundamentals, Hewlett-Packard Operating and Service Manual, Oct. 1969.

*Primary Examiner*—Michael J. Tokar
*Attorney, Agent, or Firm*—Jeffery B. Fromm; Joseph H. Smith

[57] ABSTRACT

A precision vector network analyzer which is suitable for a wide range of applications including both laboratory and automated production measurements and testing is disclosed. New measurement capabilities, greater ease of use, and nearly complete automation are provided. Contributions include fully coordinated communications between subsystem modules; real time, two channel, precision vector measurements with complete, internal error correction; wide frequency capability from RF to millimeter bands; combined time and frequency domain analysis and display; measurements either in the swept or step frequency modes; and user definable test functions and calibration device sets.

4 Claims, 518 Drawing Figures

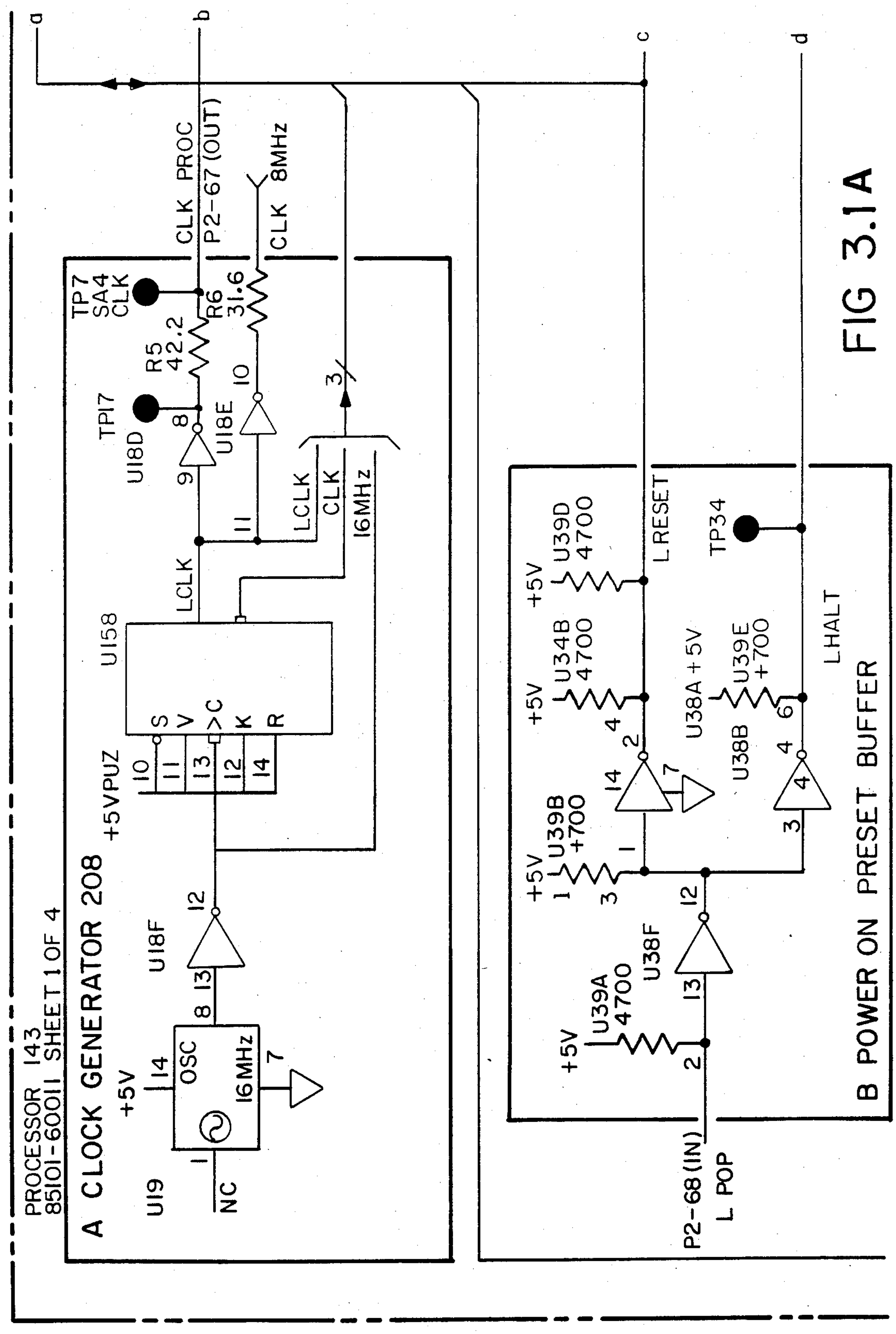
FIG 3.1A

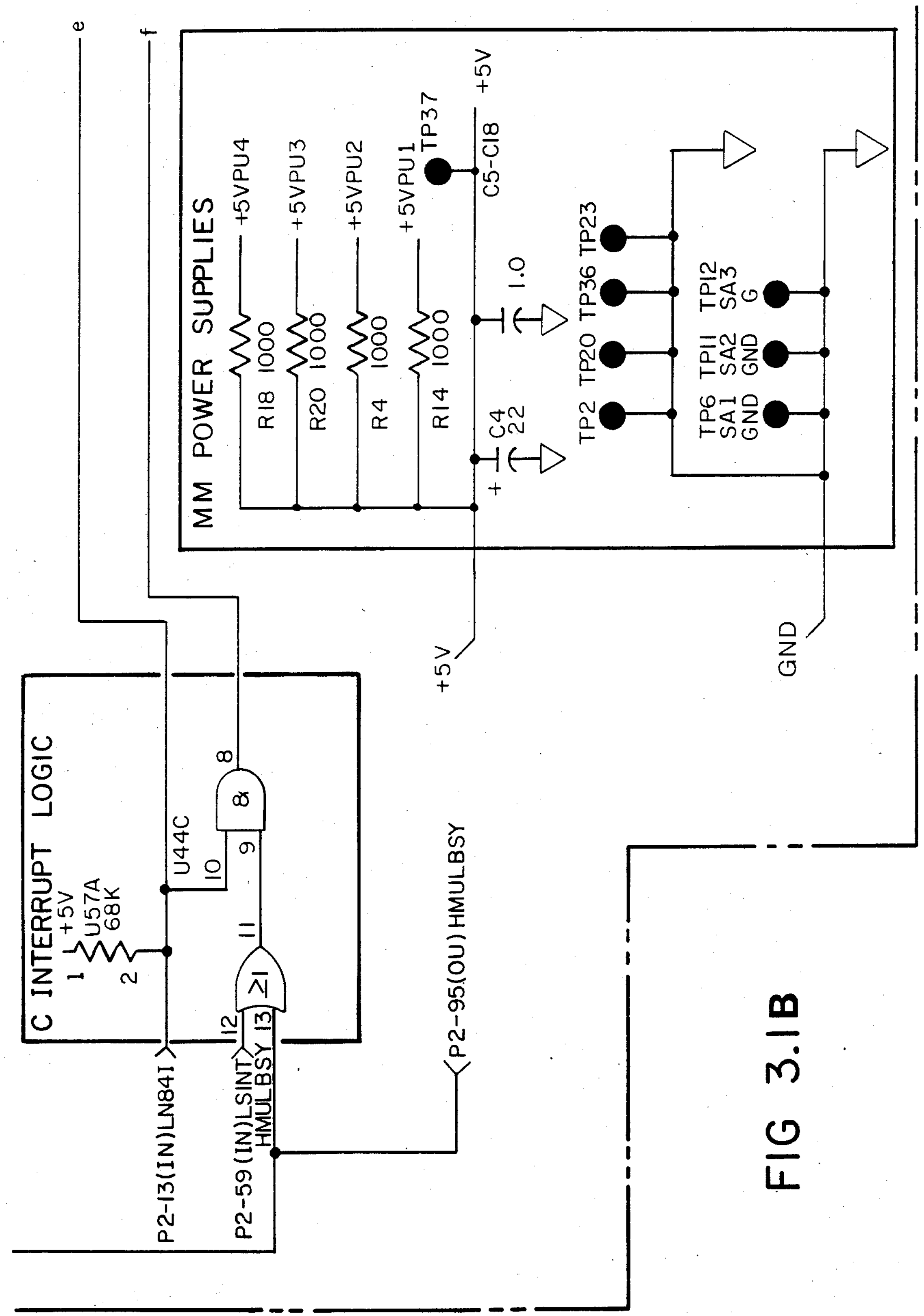
FIG 3.1B

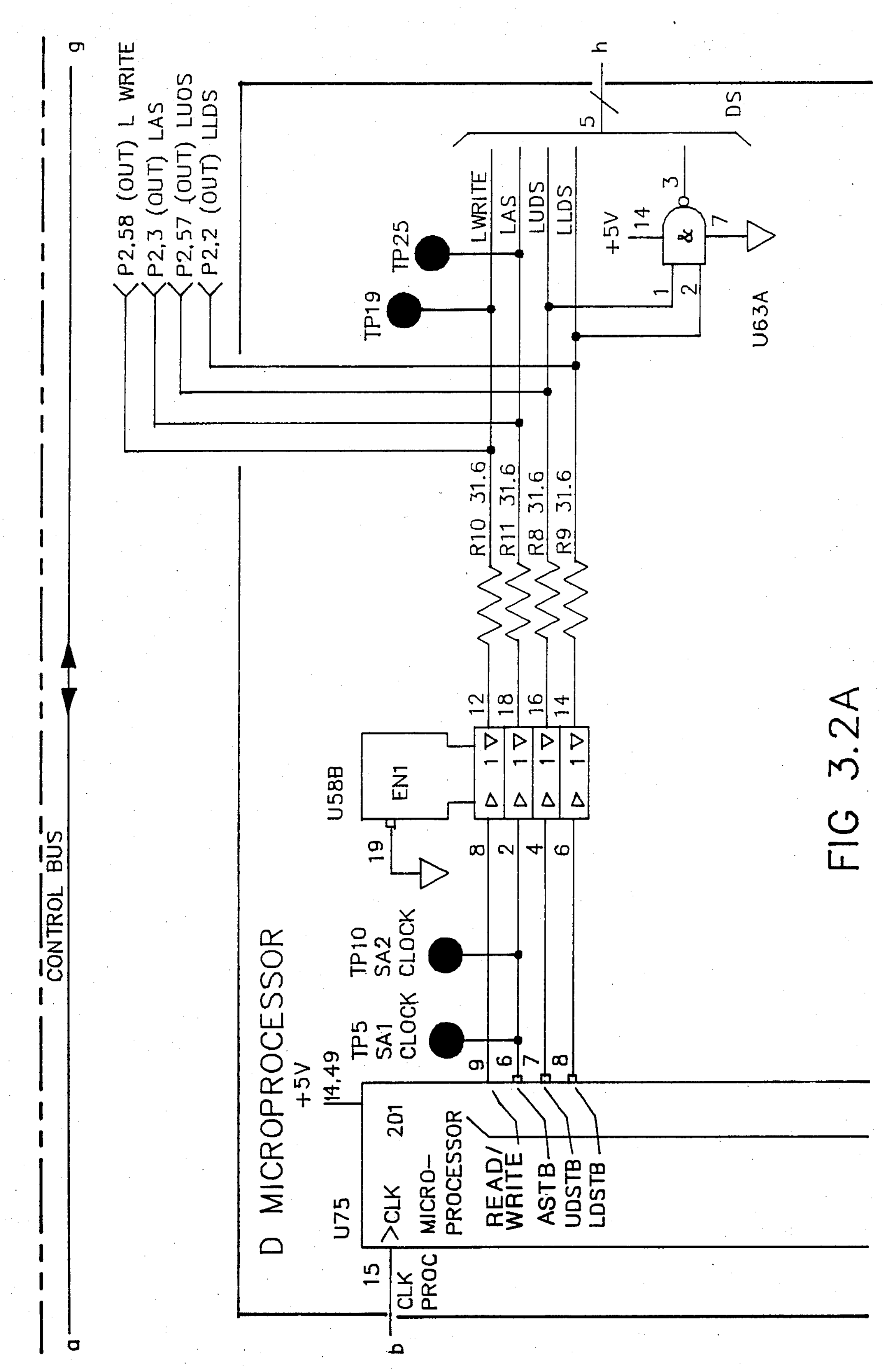
FIG 3.2A

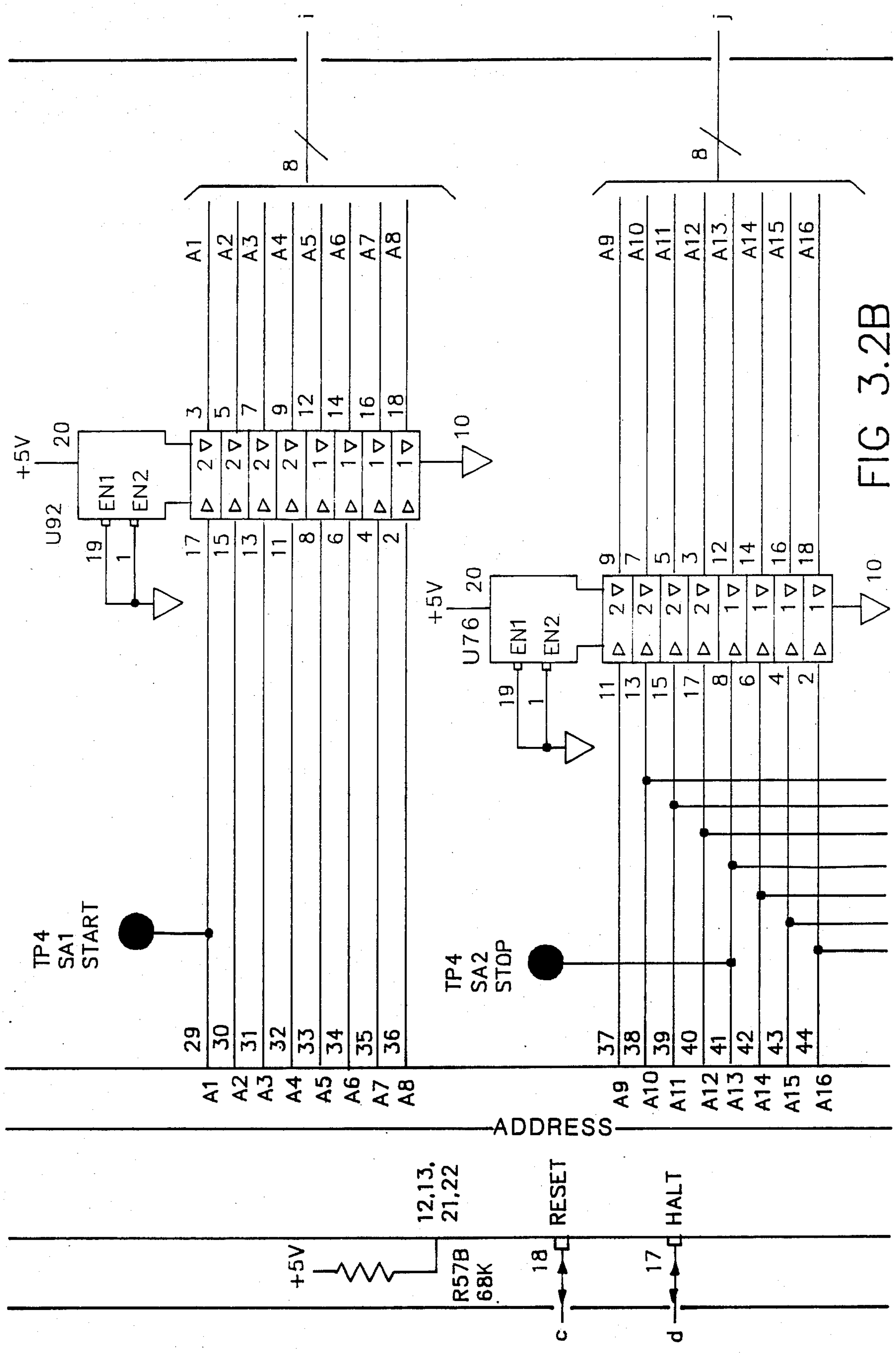
FIG 3.2B

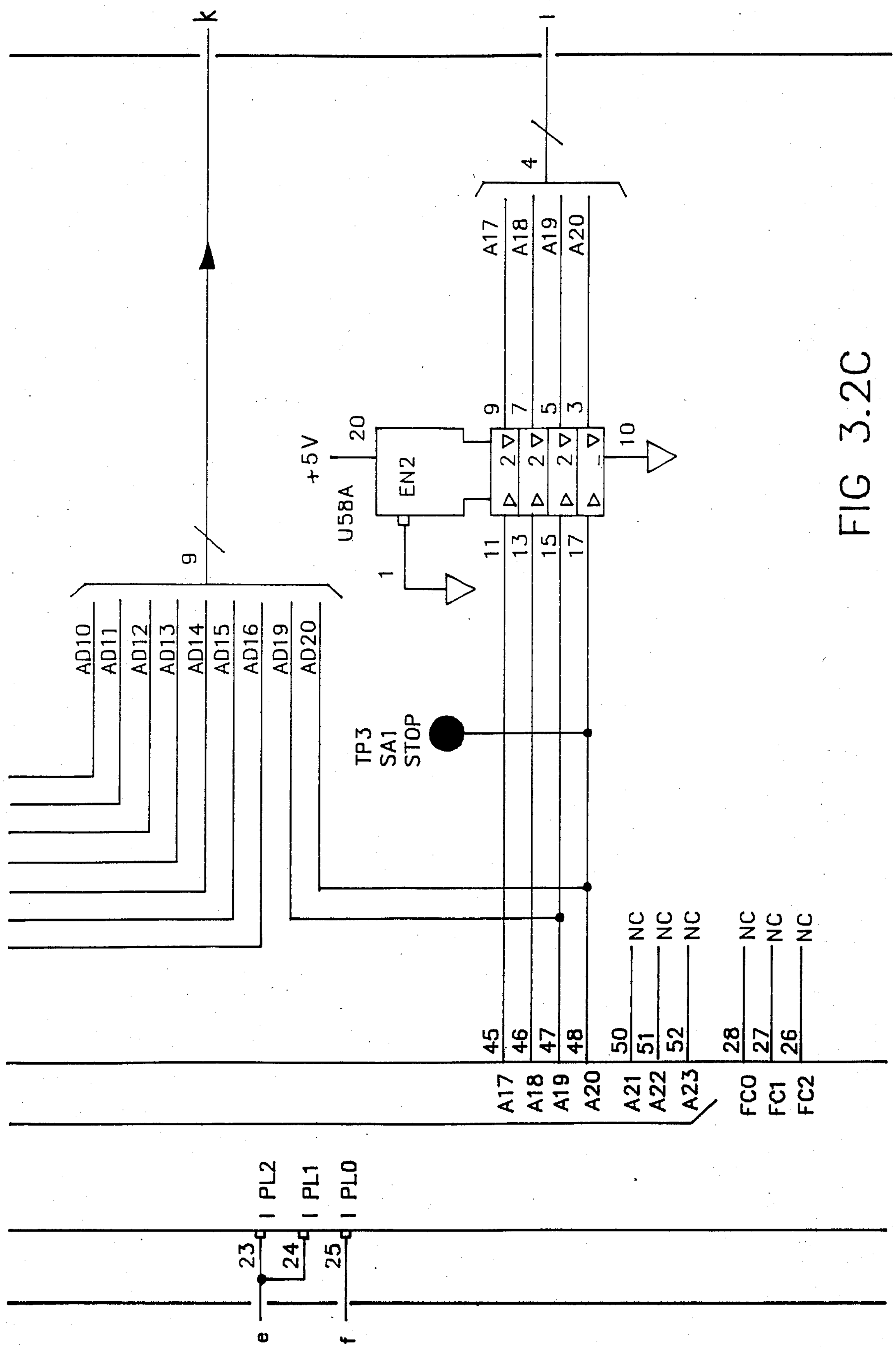
FIG 3.2C

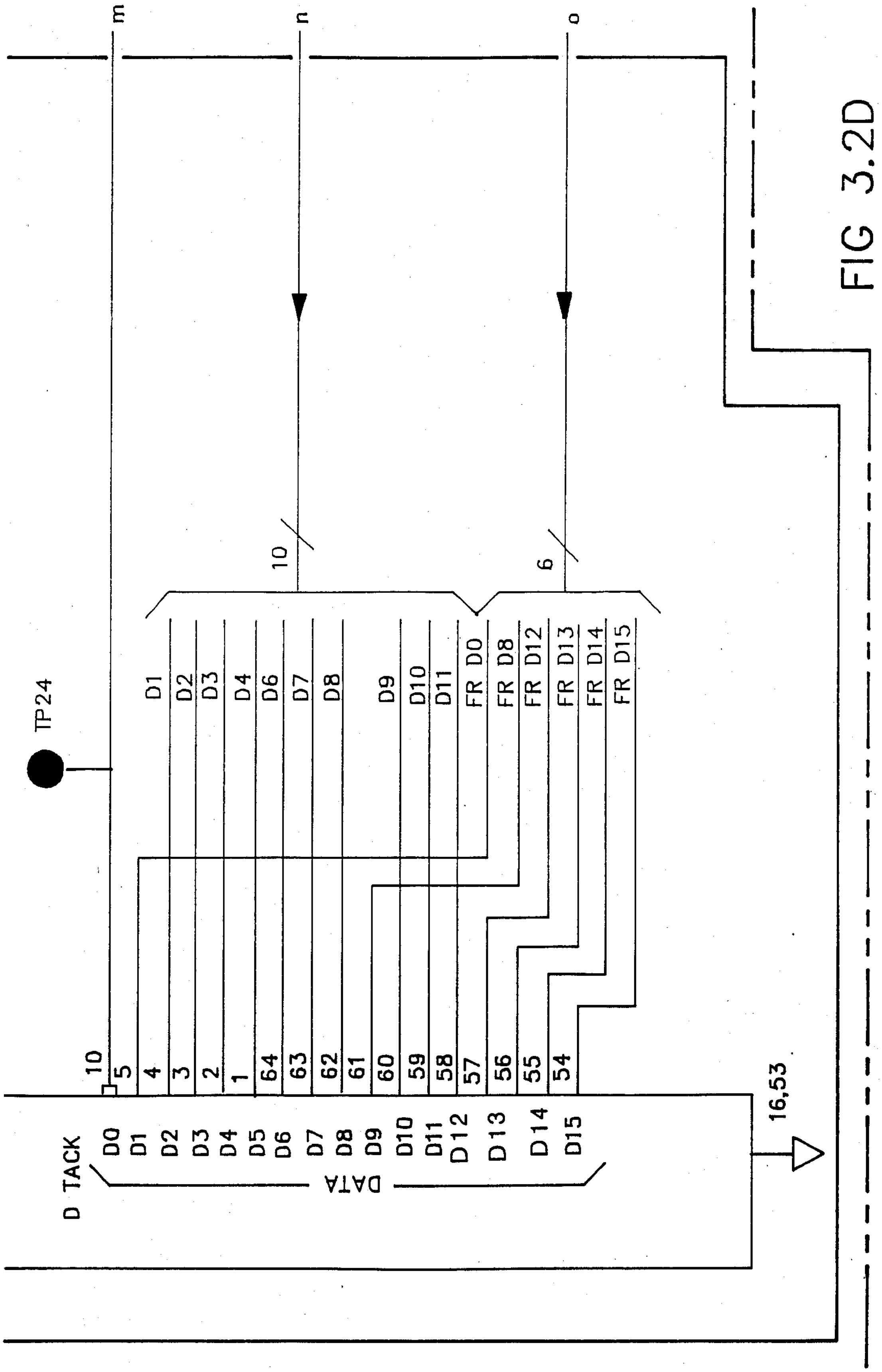
FIG 3.2D

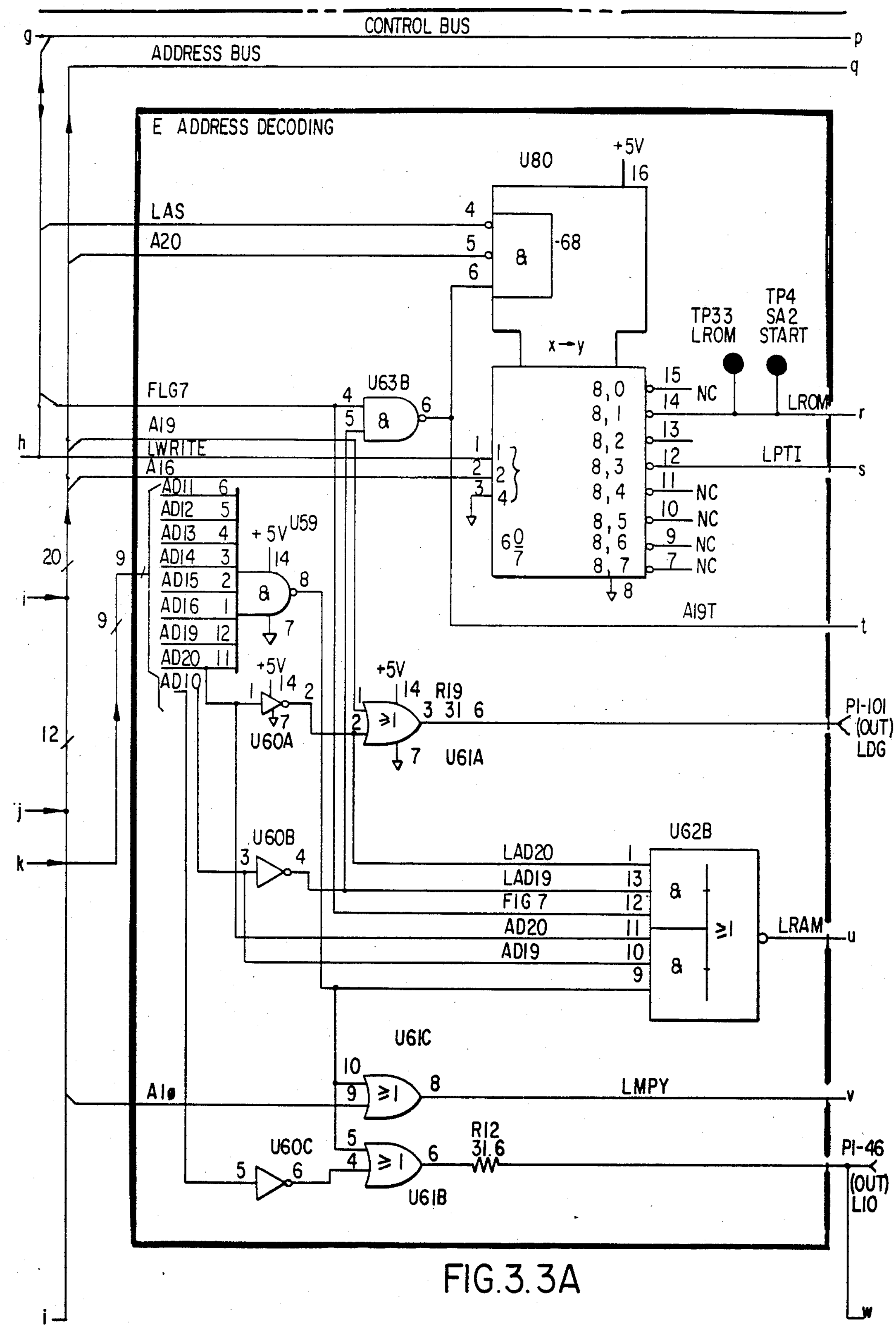
FIG.3.3A

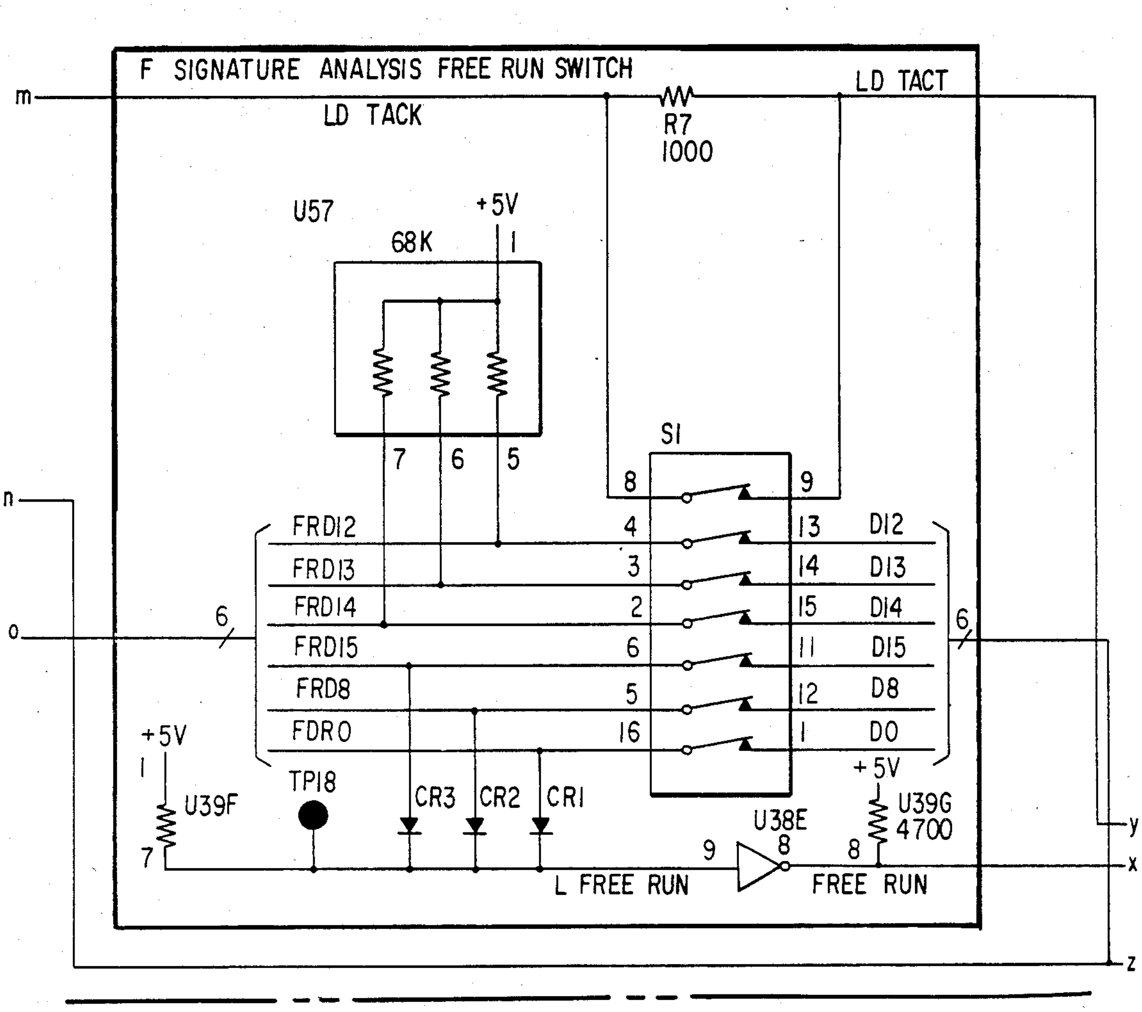
FIG. 3.3B

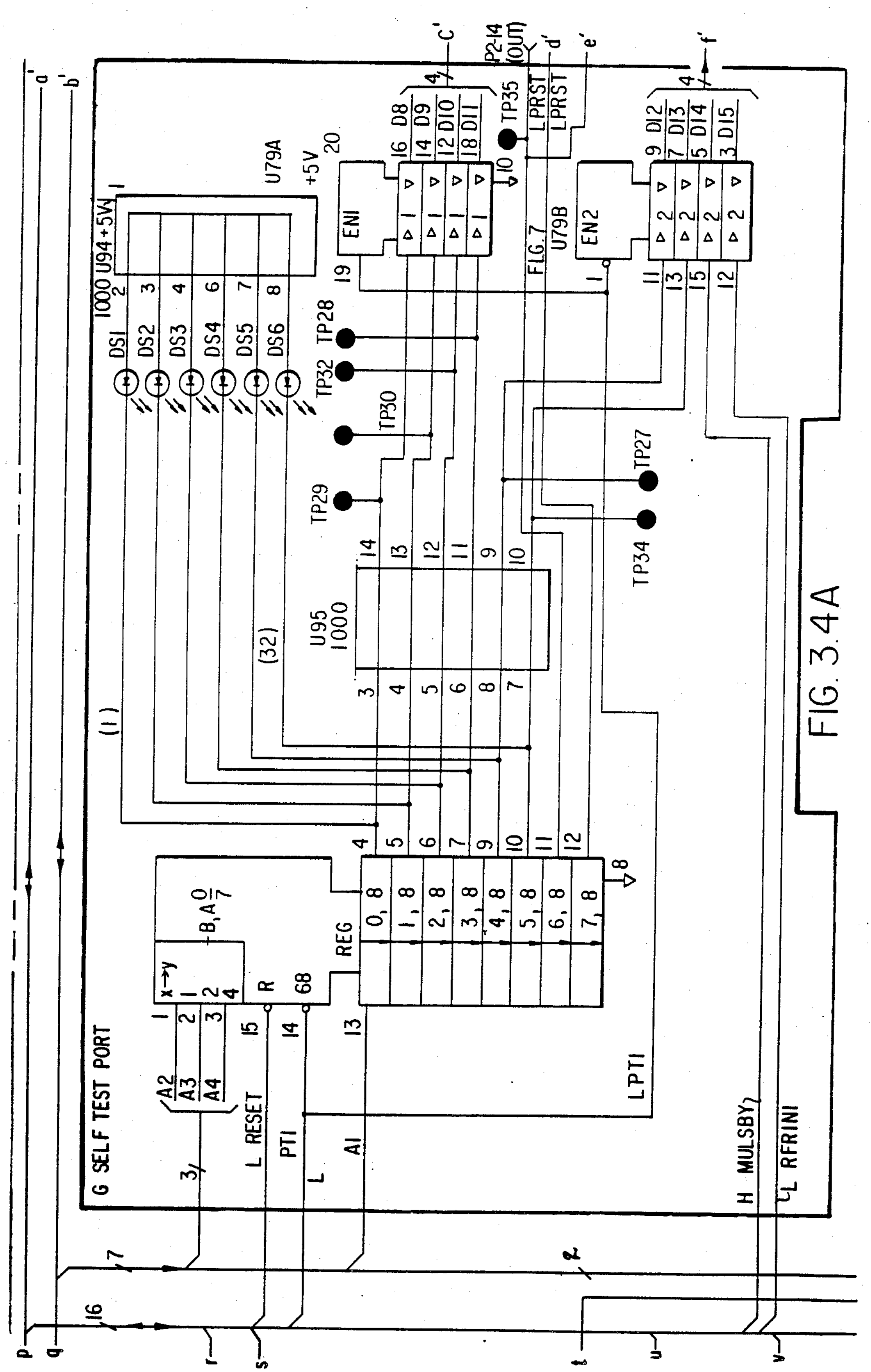
FIG. 3.4A

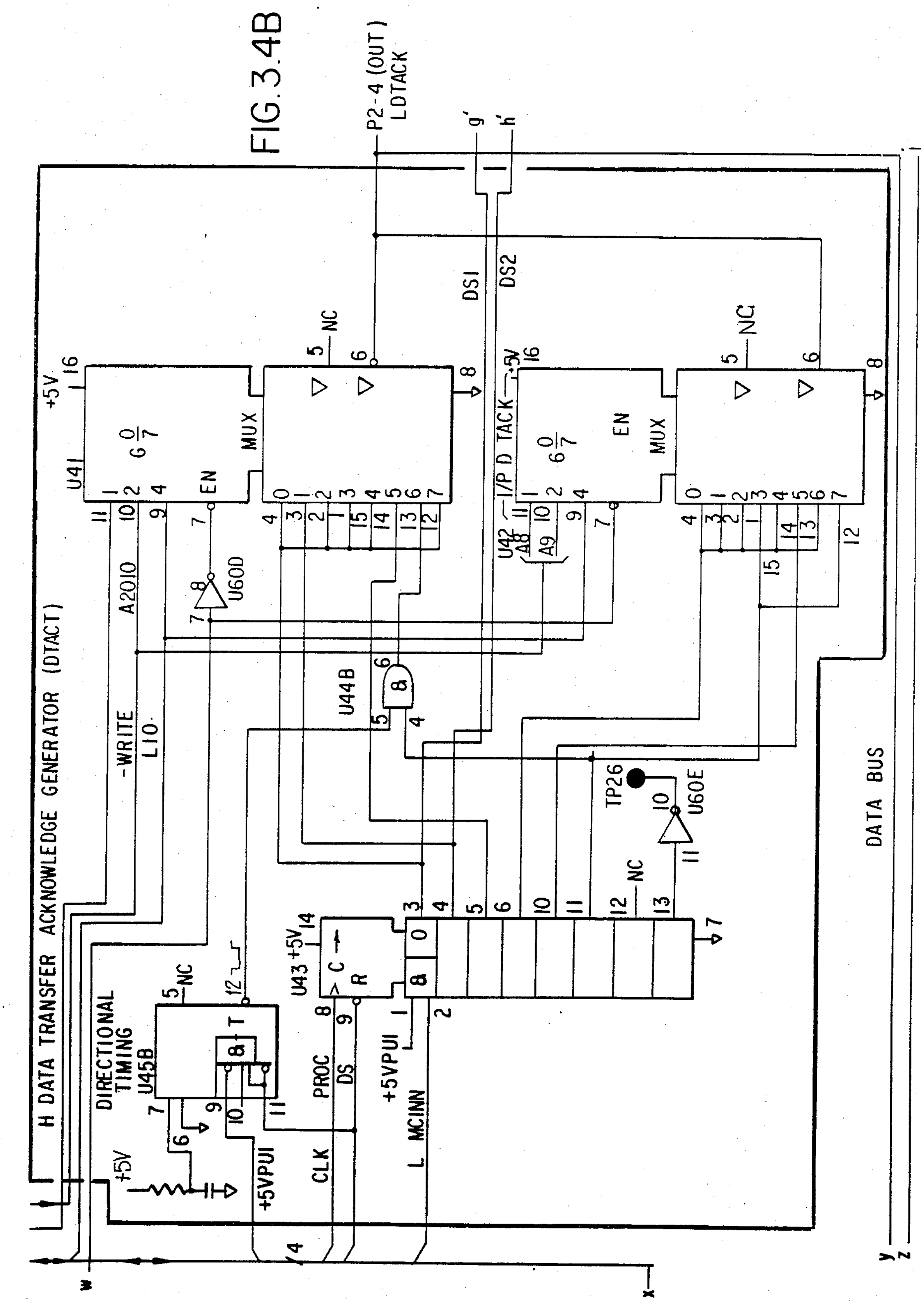
FIG. 3.4B

FIG. 3.5
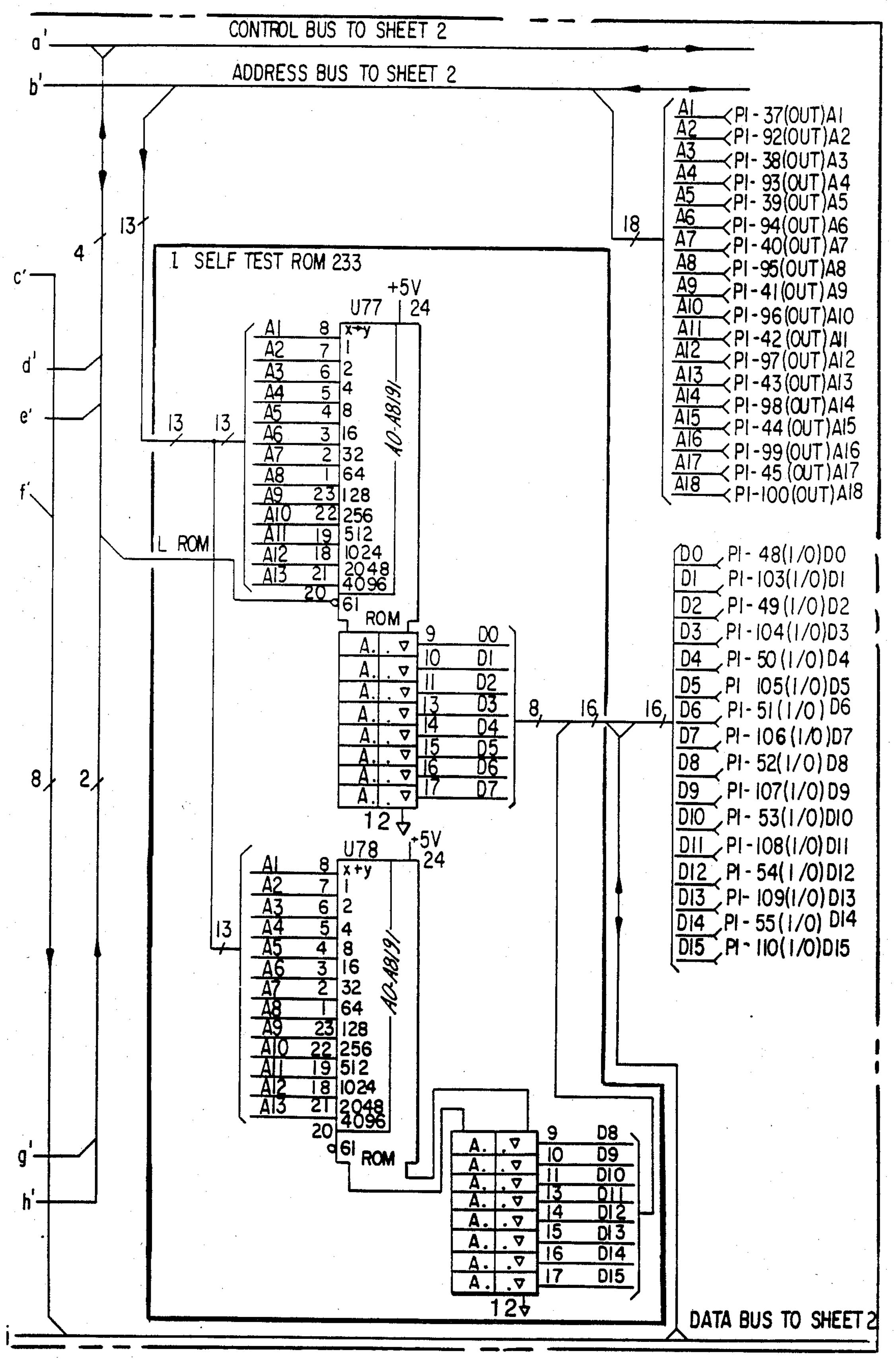

UNLESS OTHERWISE INDICATED,:
RESISTANCE VALUES SHOWN ARE IN OHMS,
CAPACITANCE IN MICROFARADS,
AND INDUCTANCE IN MICROHENRIES.
SIGNALS ENTER AT LEFT SIDE AND EXIT AT
RIGHT SIDE OF FUNCITON BLOCKS.

ROMS SUPPLIED IN MATCHED SETS
U10,12,13, REPLACED AS A SET.
U77 AND U78 REPLACED AS A SET

ACTIVE COMPONENTS APRTS LISTS (U's and Q's)

| REFERENCE DESIGNATORS | PART NUMBER | MANUFACTURER'S PART NUMBER |
|---|---|---|
| U1-8,20-27 | 1818-3005 | RAM 64KX1 |
| U9 | 1820-2076 | I 3242 |
| U10 NOTE 3 | 85010-80001 | PROM 512X8 |
| U11,31,32 | 1820-1858 | 74LS377 |
| U12 NOTE 3 | 85101-80002 | PROM 512X8 |
| U12 NOTE 3 | 85101-80003 | PROM 512X8 |
| U14,33 | 1820-1432 | 74LS163 |
| U15,49 | 1820-0629 | 74S112 |
| U16,29,30,80 | 1820-1216 | 74LS138 |
| U17,18,48 | 1820-0683 | 74S04 |
| U19 | 1813-0130 | 16 MHz OSC |
| U28,52,61 | 1820-1449 | 74S32 |
| U34 | 1820-0681 | 74S00 |
| U35 | 1820-1440 | 74LS279 |
| U36 | 1820-0648 | 74S20 |
| U37 | 1820-1191 | 74S175 |
| U38 | 1820-1200 | 74LS05 |
| U39 | 1810-0205 | RES 4.7K OHM |
| U40 | NOT USED | |
| U41,42 | 1820-1298 | 74LS251 |
| U43 | 1820-1433 | 74LS164 |
| U44 | 1820-1201 | 74LS08 |
| U45 | 1820-1423 | 74LS123 |
| U46 | NOT USED | |
| U47,54,55,96 | 1820-1367 | 74S08 |
| U50,63 | 1820-1197 | 74LS00 |
| U51 | 1820-1322 | 74LS02 |
| U53,56,74,97 | 1820-0998 | 74S153 |
| U57 | 1810-0208 | RES 68K OHM |
| U58,76,79,92 | 1820-2024 | 74LS244 |
| U59 | 1820-1207 | 74LS30 |
| U60 | 1820-1199 | 74LS04 |
| U62 | 1820-1210 | 74LS51 |
| U64,81 | 1820-2075 | 74LS245 |
| U65-68,82-85 | 1820-2120 | 25LS14 |
| U69-72,86084 | 1820-2906 | 25LS299 |
| U73,90 | 1820-3217 | 74ALS569 |
| U75 | 1820-2505 | 63000 |
| U77 NOTE 3 | 55101-80004 | PROM 8KX 8 |
| U78 | 35101-80005 | PROM 8KX 8 |
| U91 | 1820-2220 | 74LS385 |
| U93 | 1820-1729 | 74LS259 |
| U94 | 1810-0204 | RES 1K ohm |
| U95 | 1810-0037 | RES 1K ohm |
| U98 | 1820-0694 | 74S86 |
| | | |
| | | |
| | | |

FIG 3.6

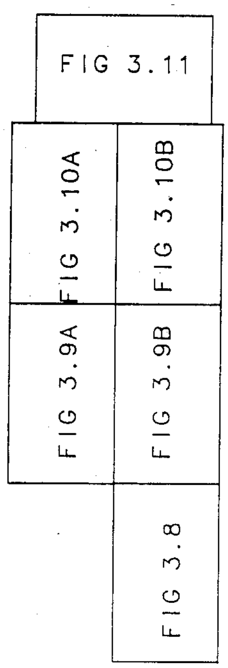
FIG 3.12
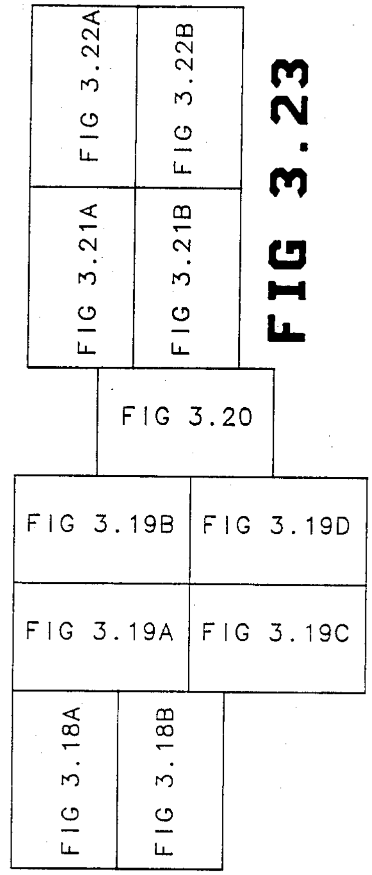
FIG 3.23
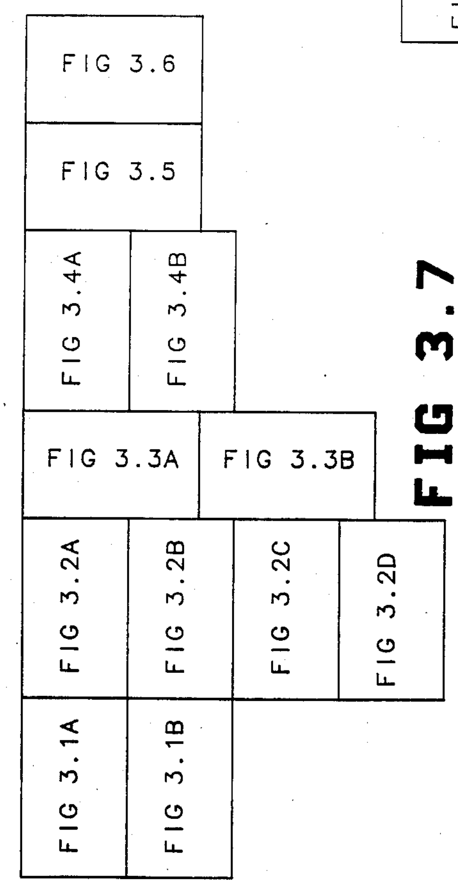
FIG 3.7
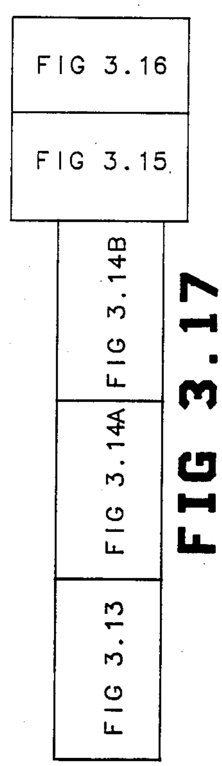
FIG 3.17

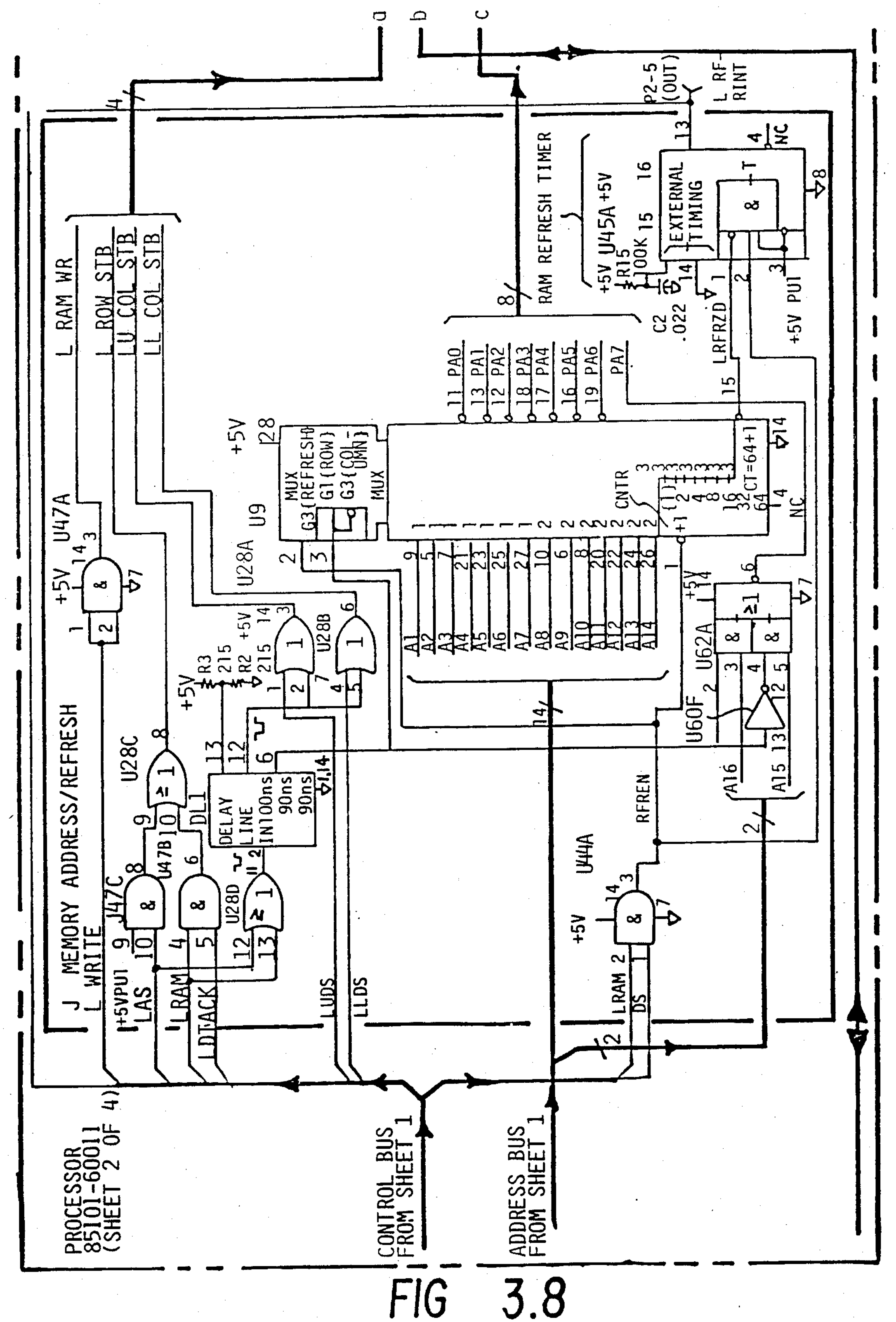
FIG 3.8

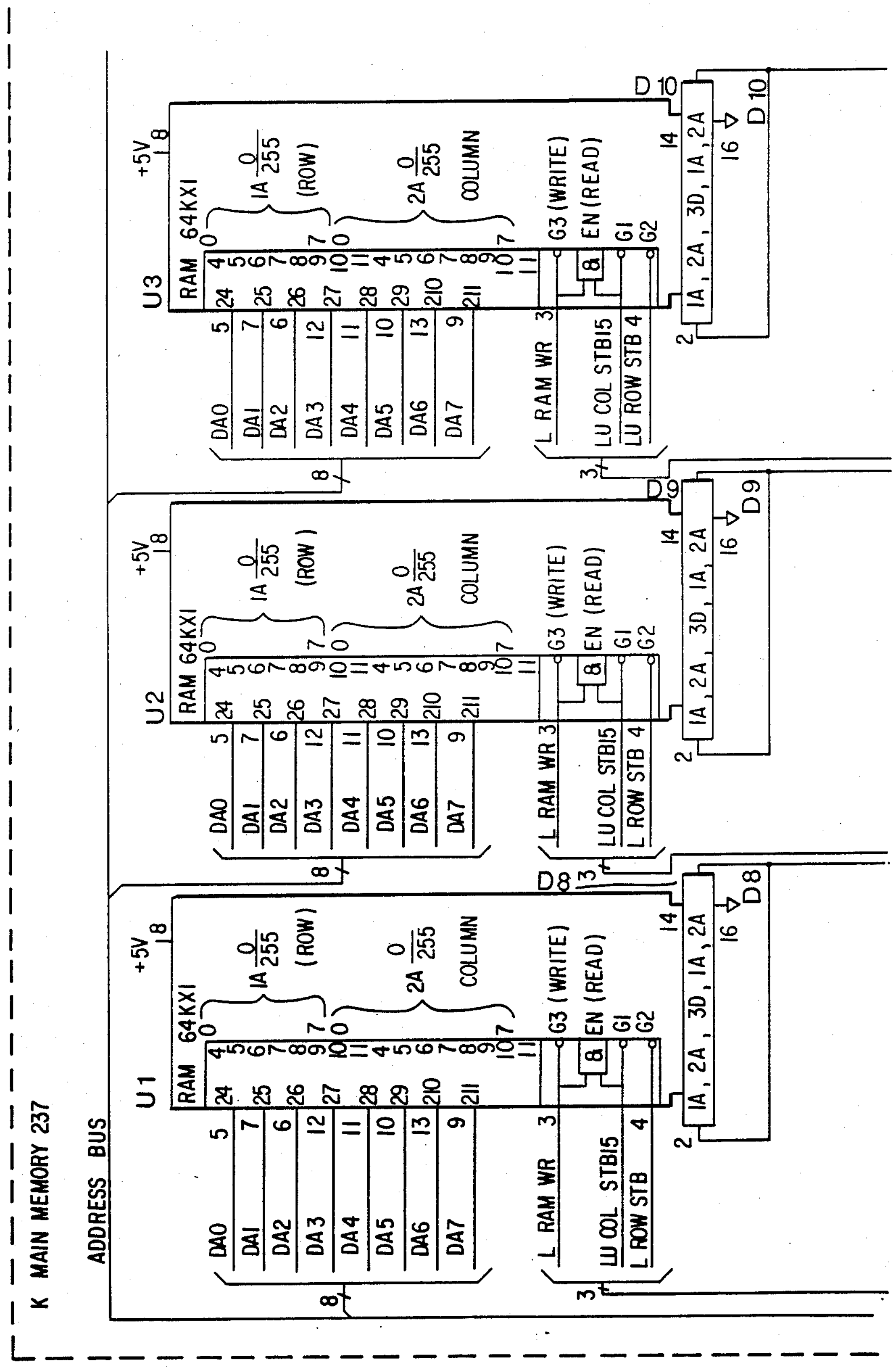
FIG. 3.9A

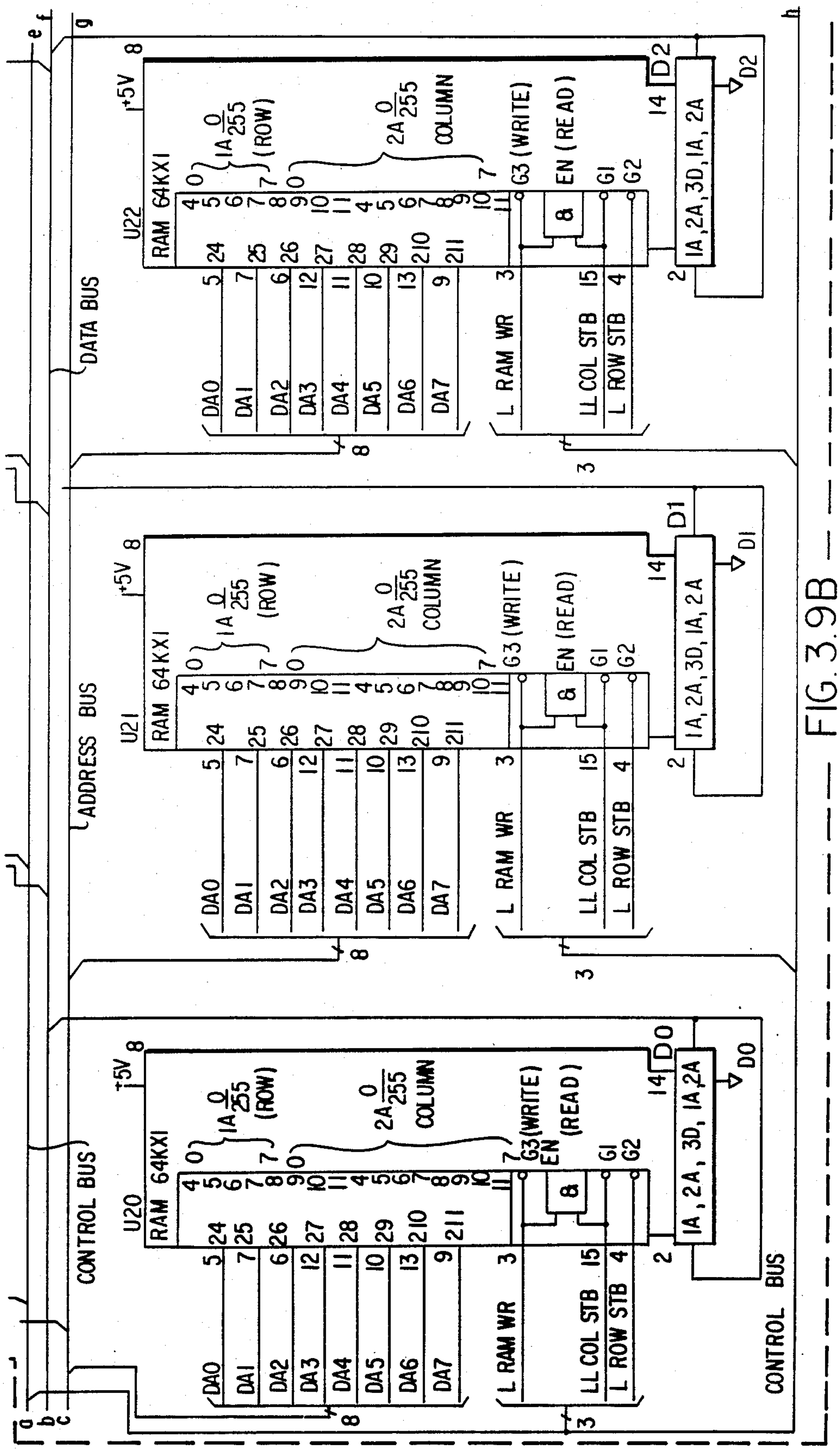
FIG. 3.9B

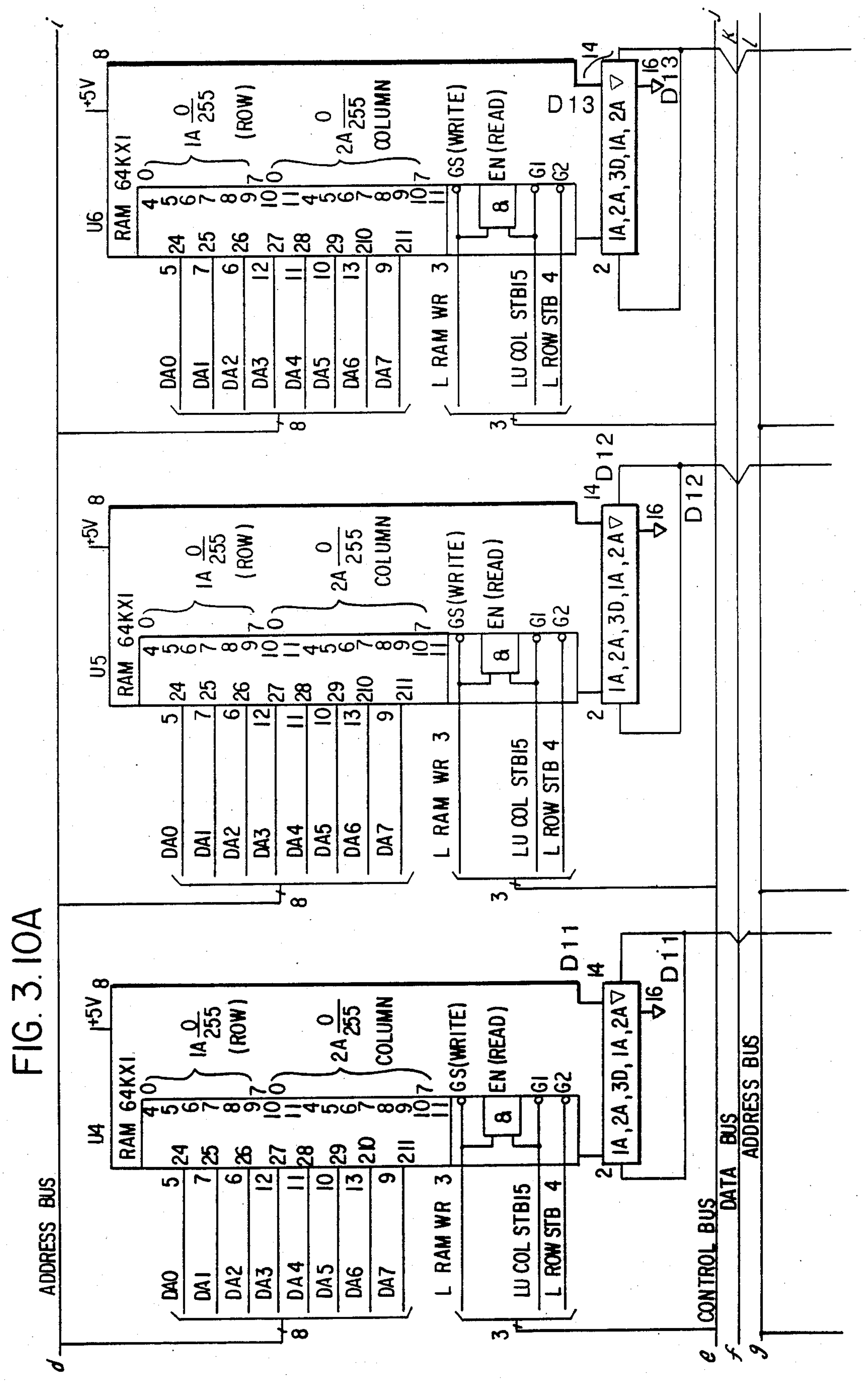
FIG. 3.10A

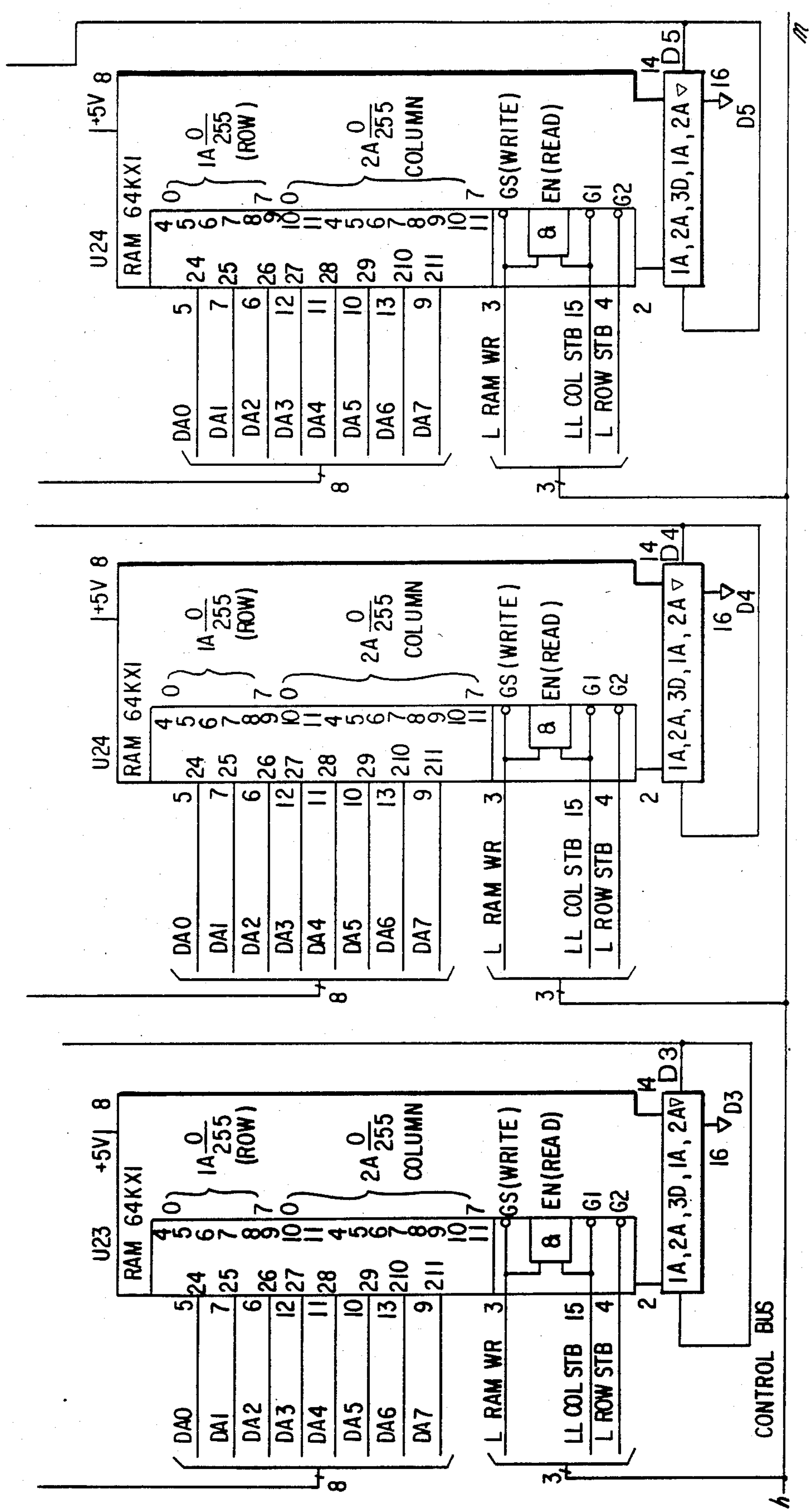
FIG. 3.10B

FIG 3.11
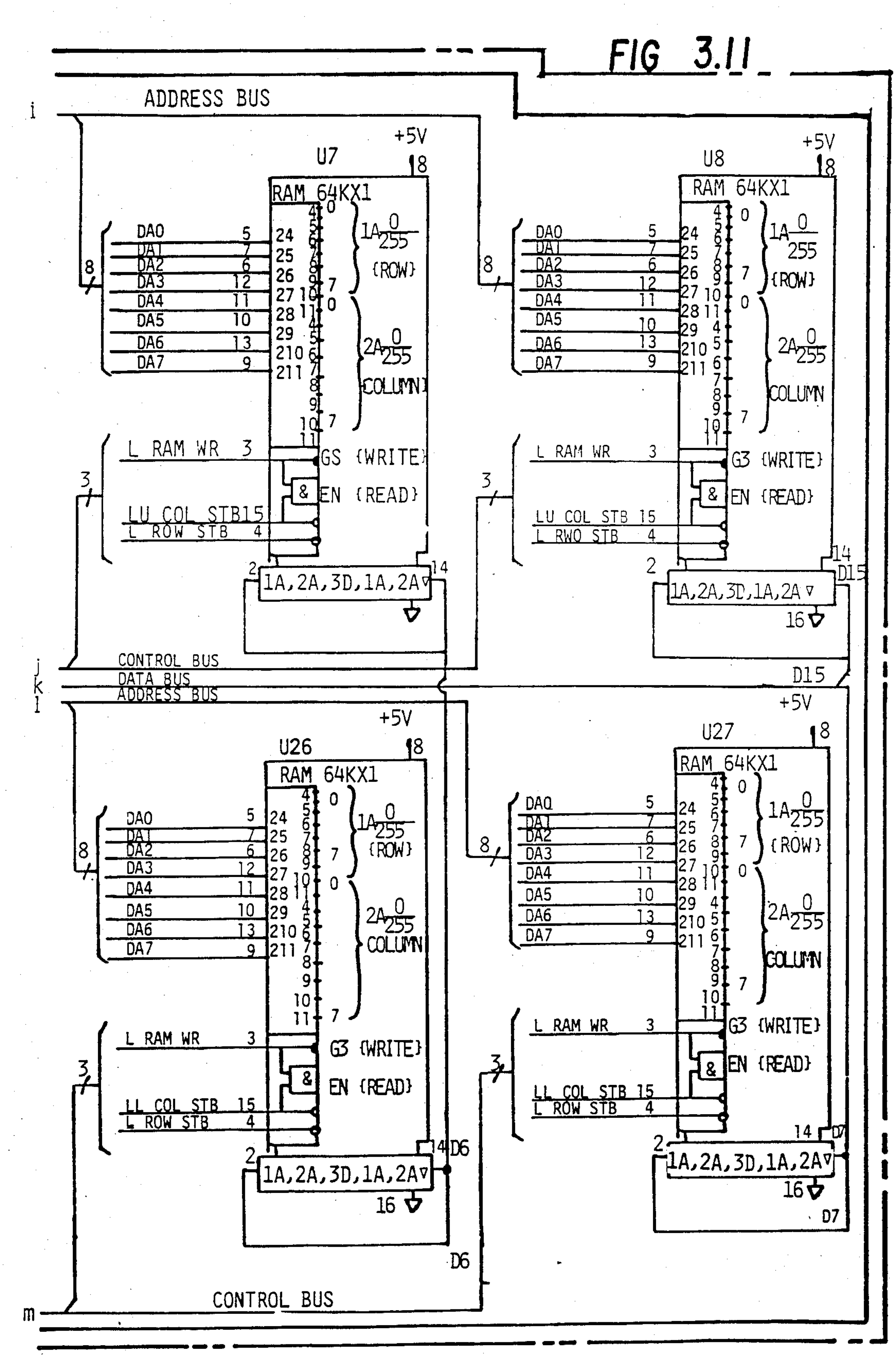

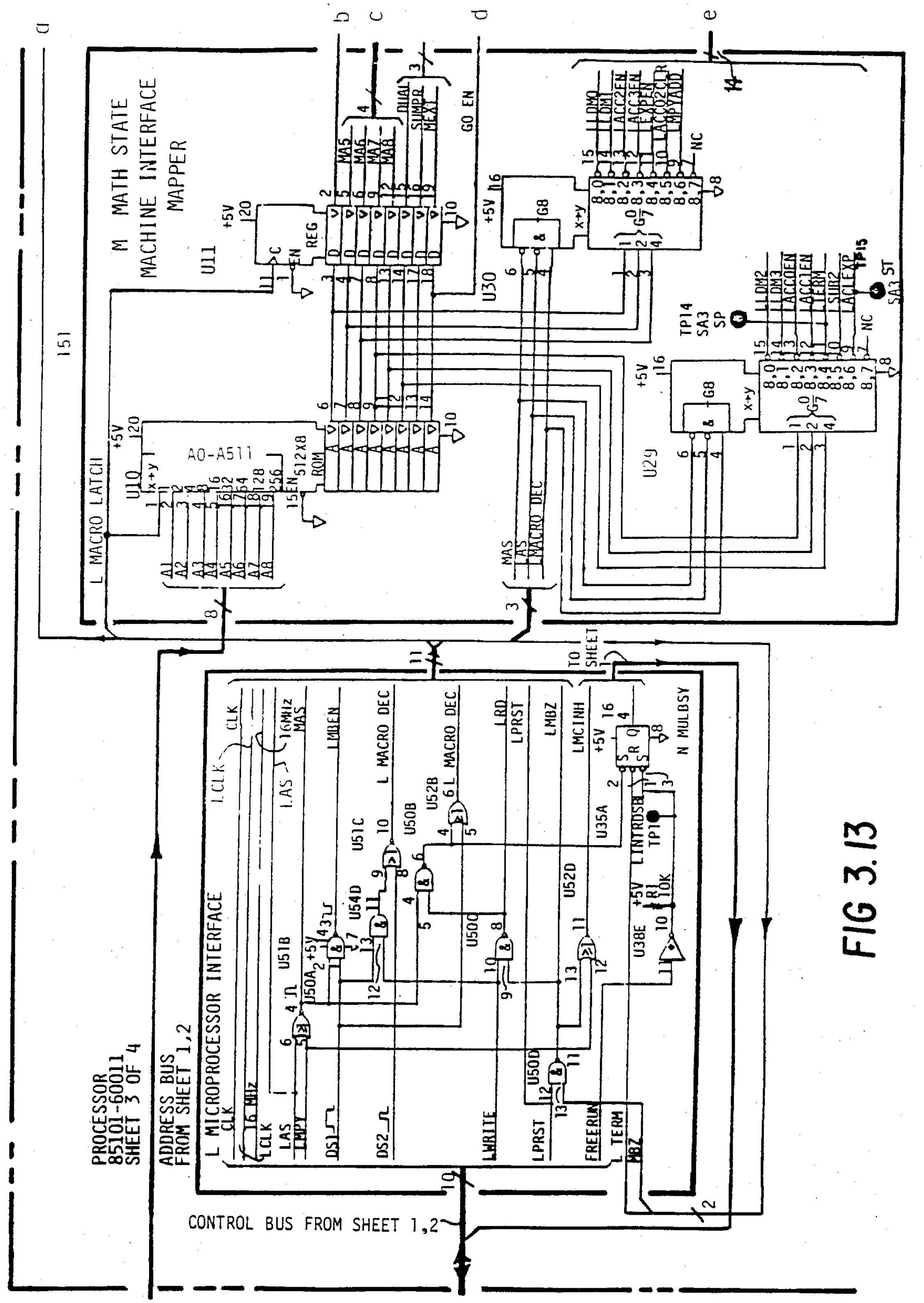
FIG 3.13

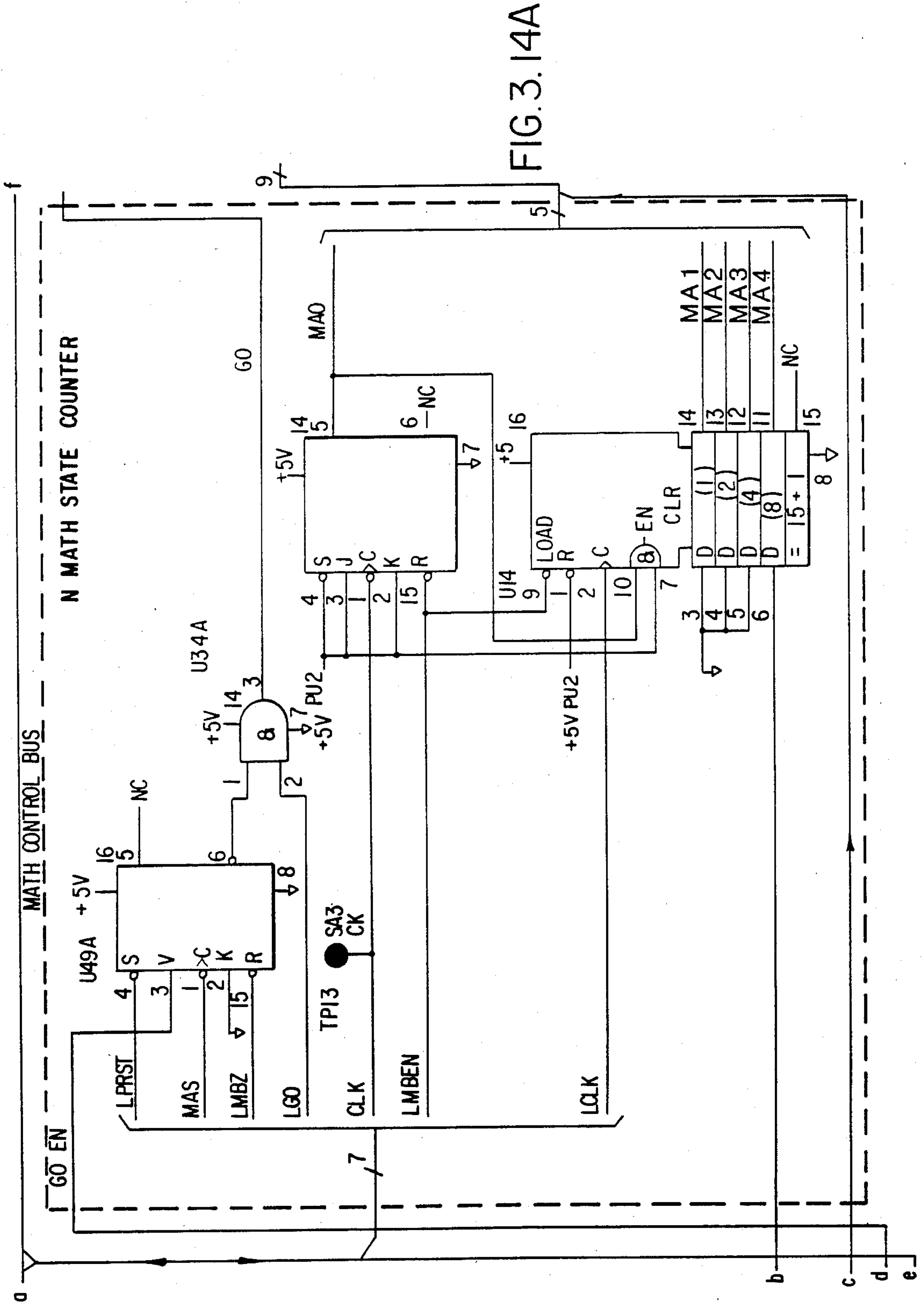
FIG. 3.14A

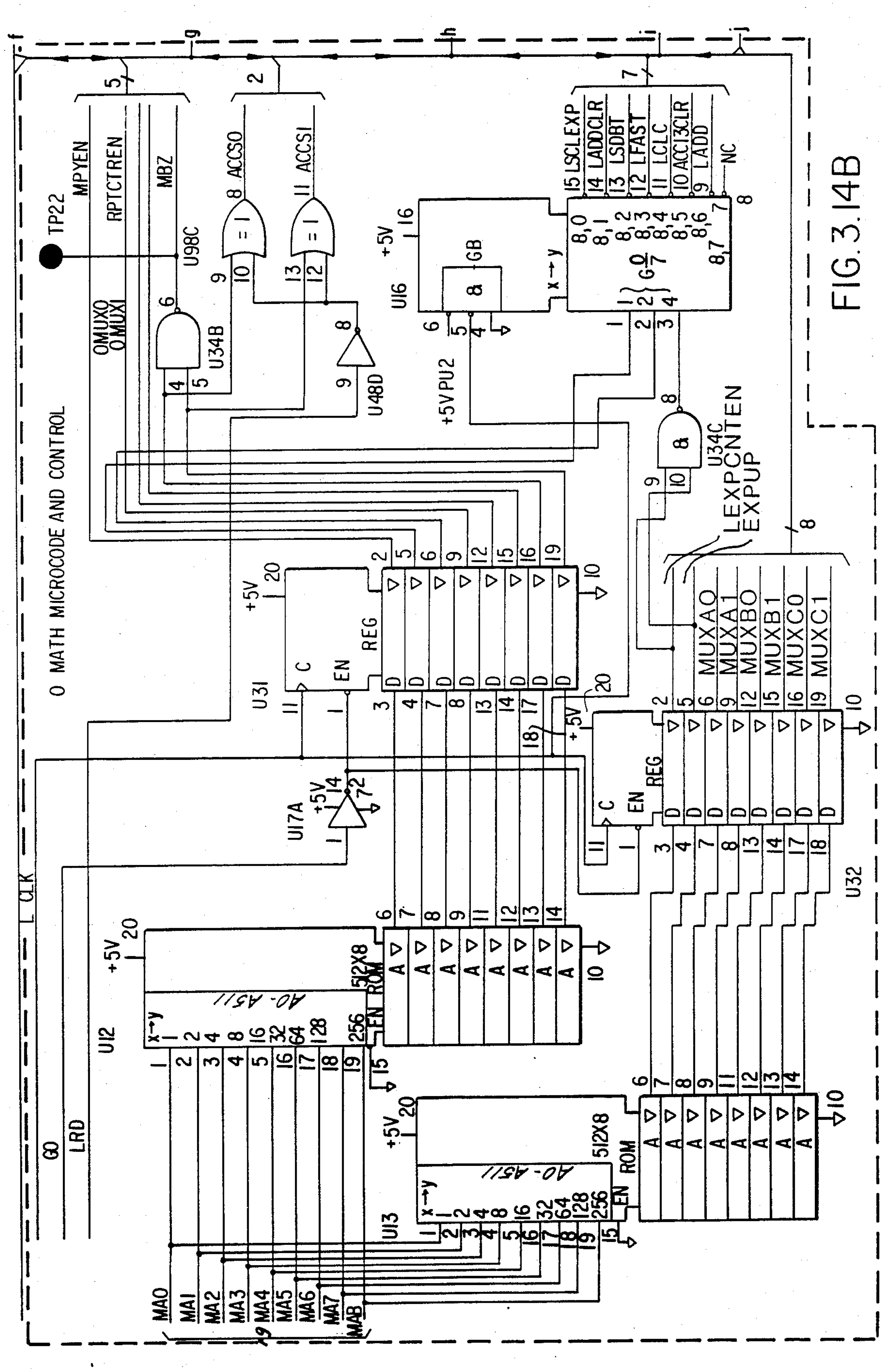
FIG. 3.14B

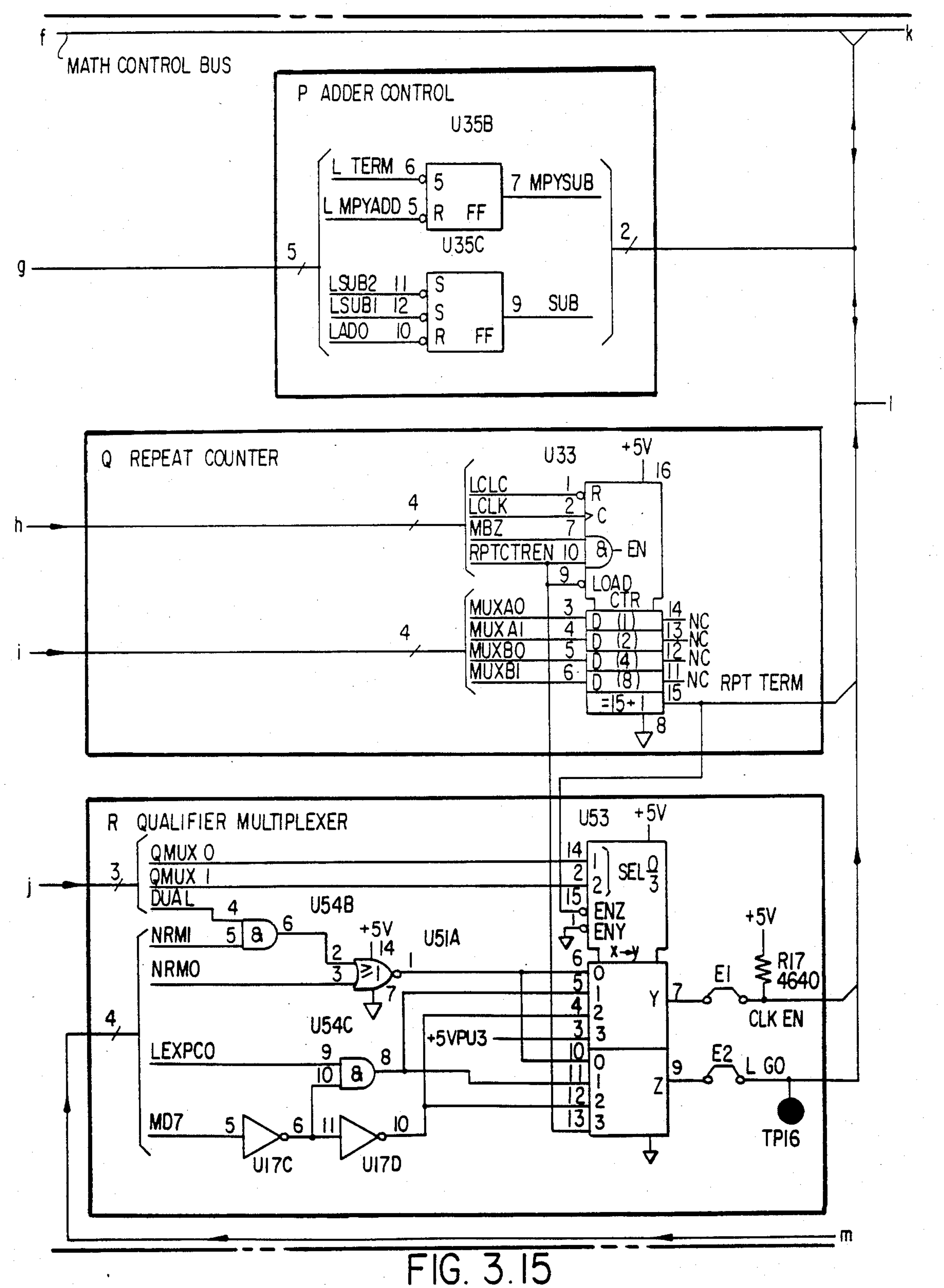
FIG. 3.15

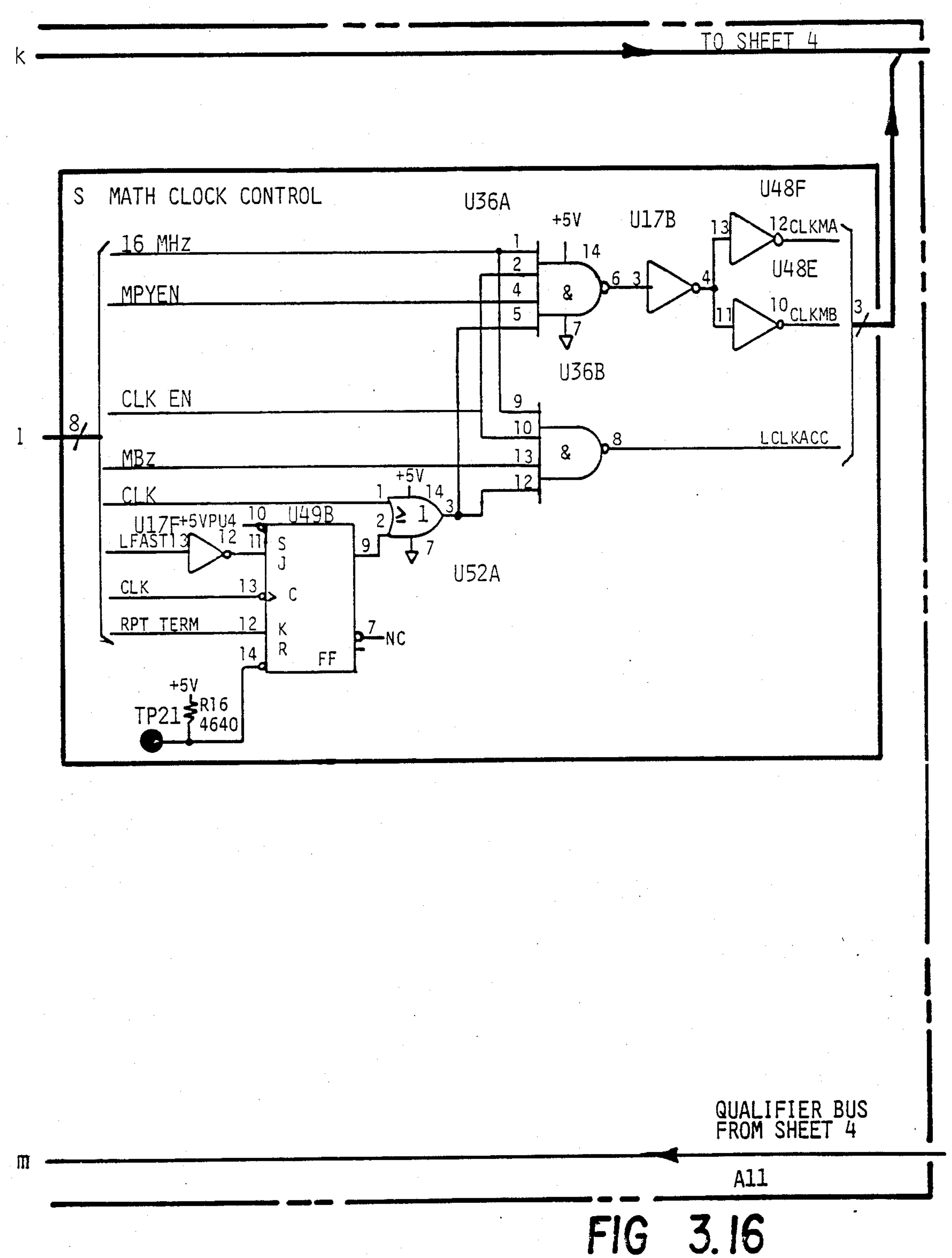
FIG 3.16

FIG. 3.18A
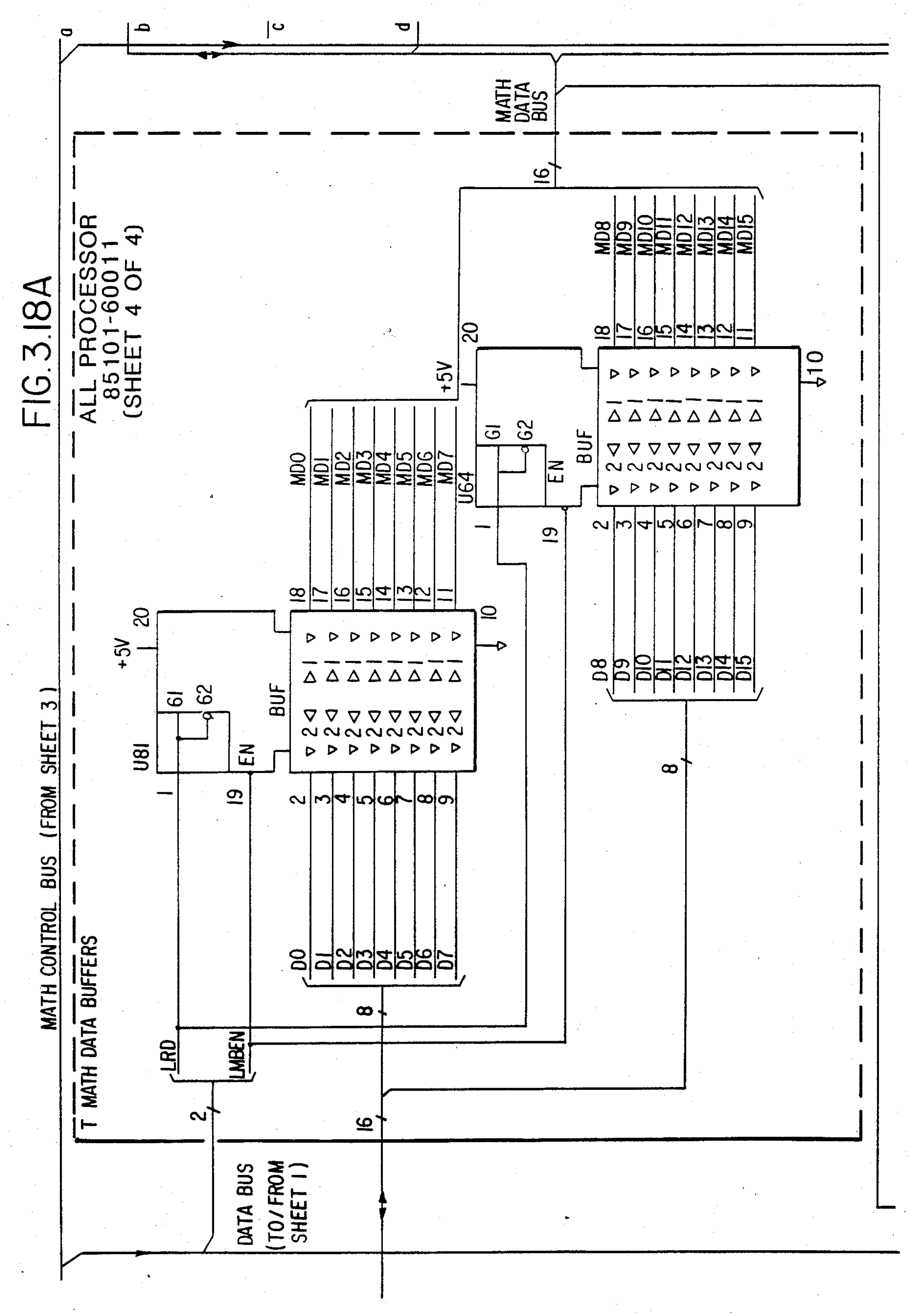

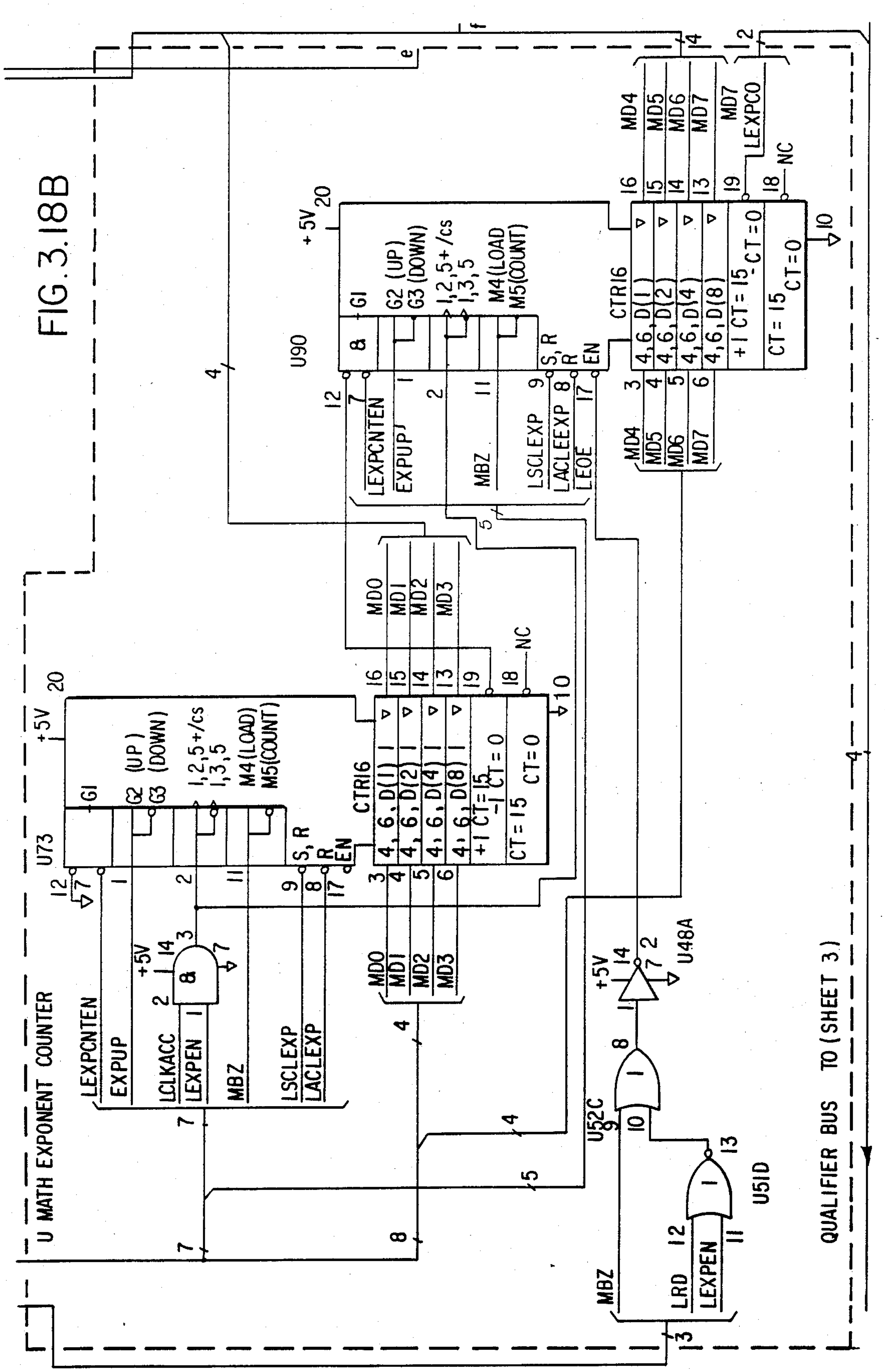
FIG. 3.18B

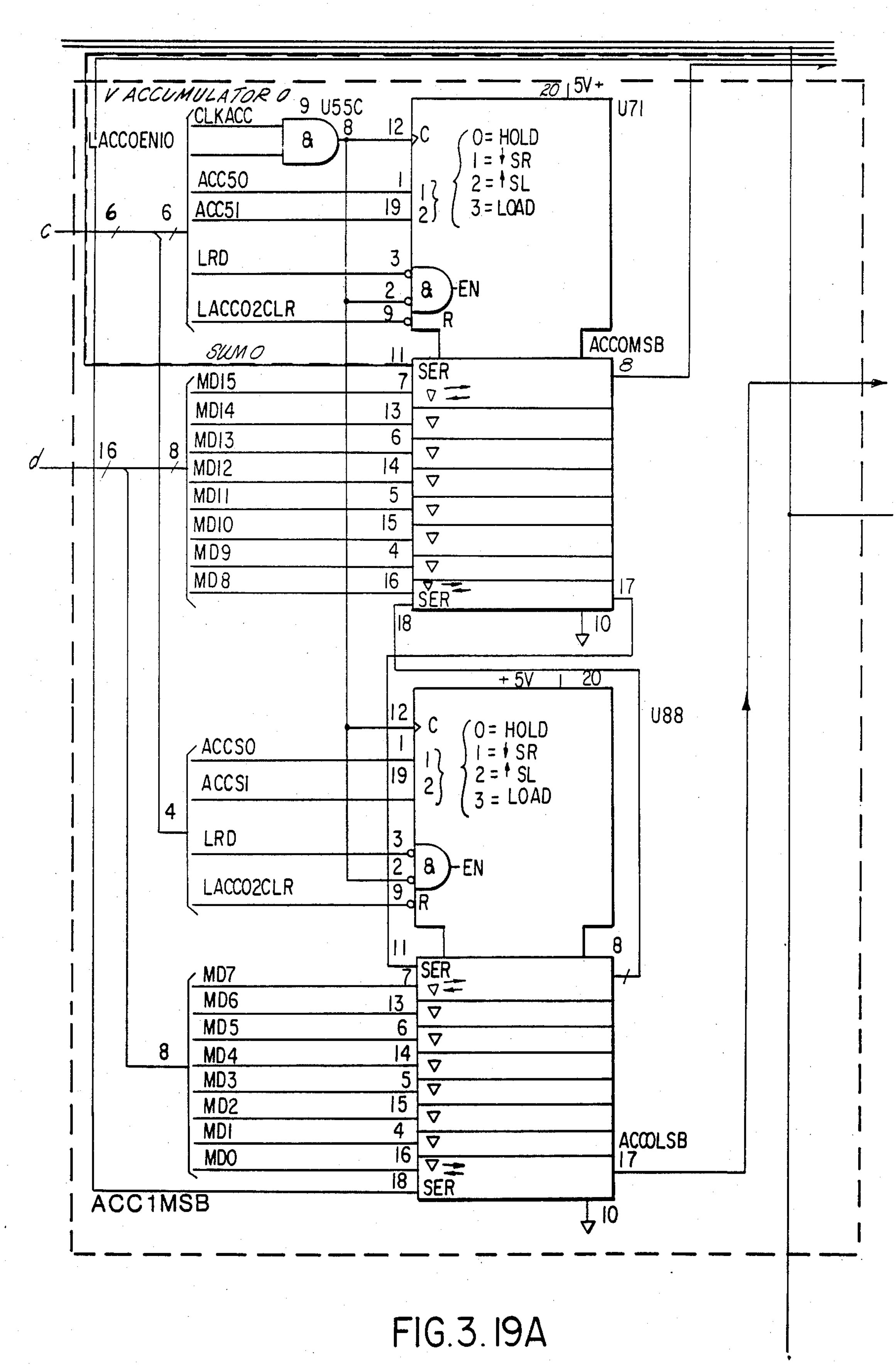
FIG.3.19A

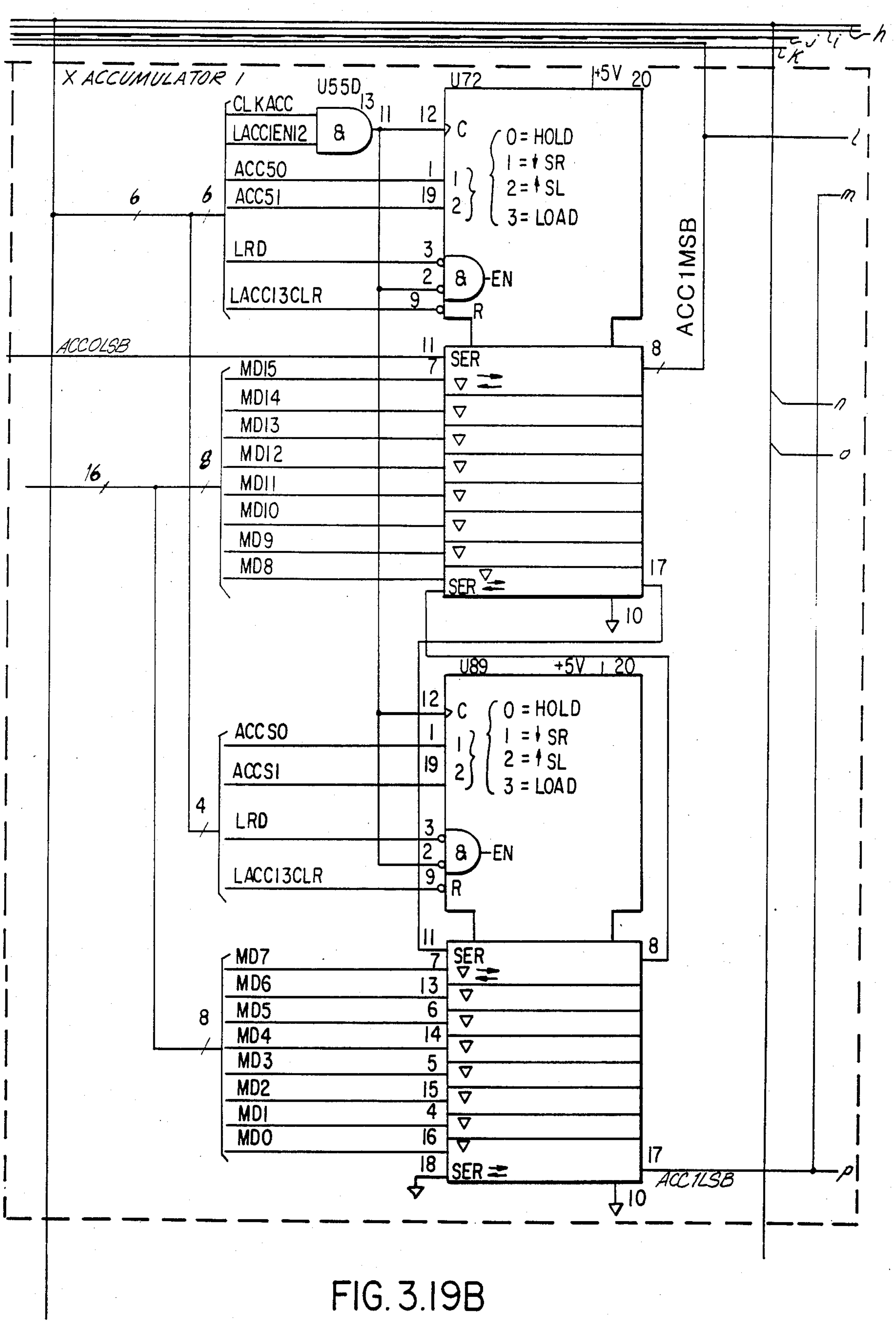
FIG. 3.19B

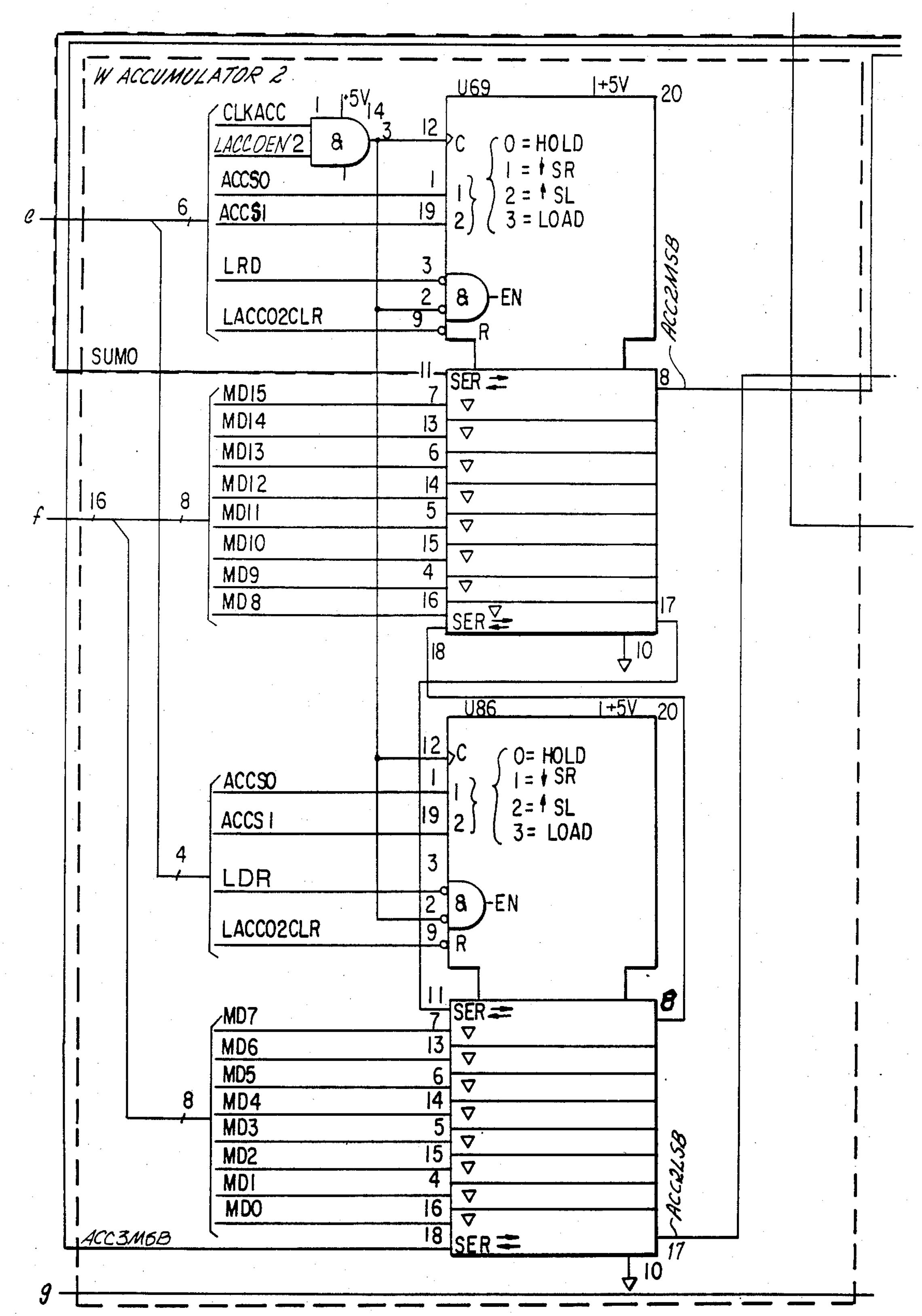
FIG. 3.19C

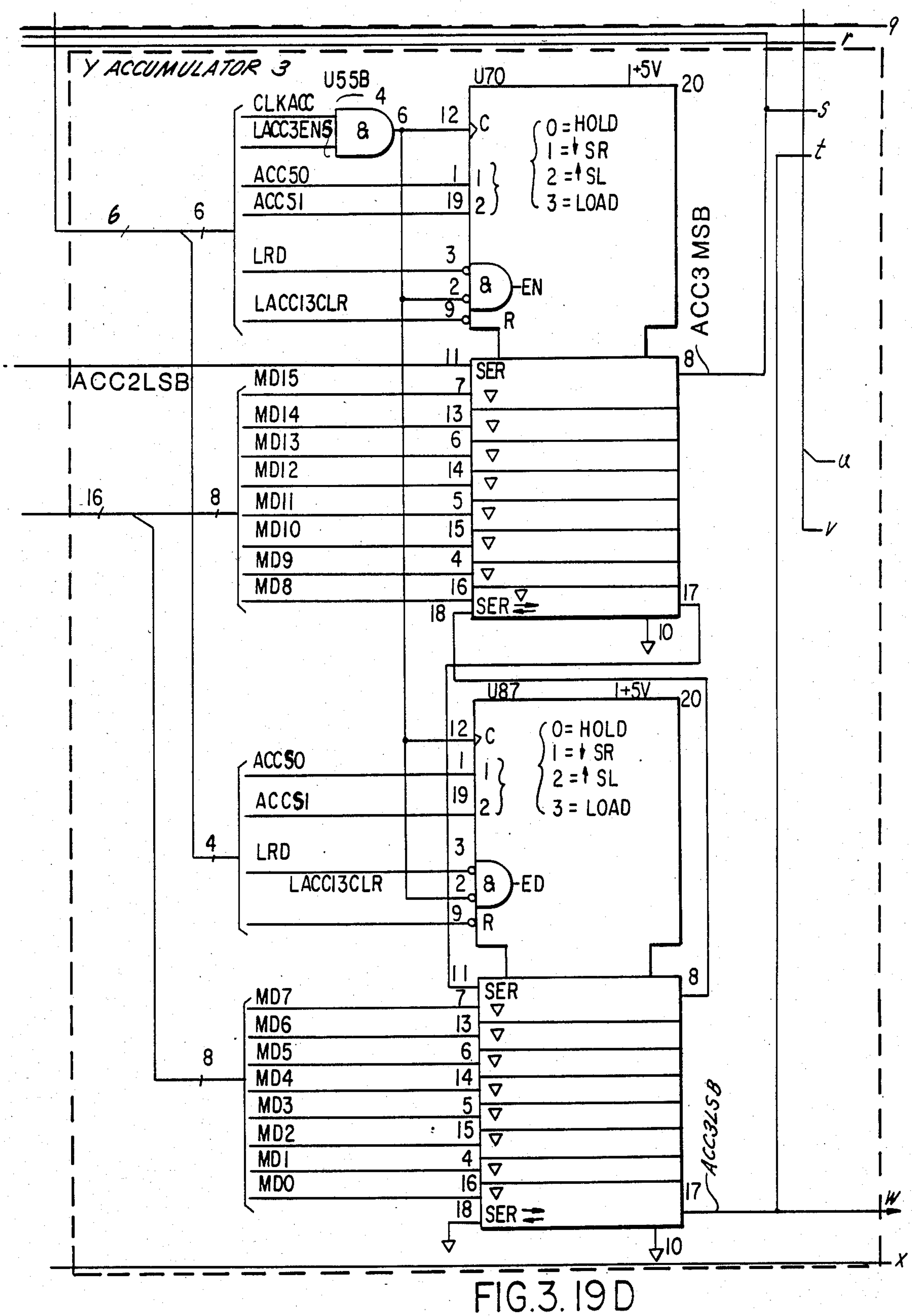
FIG.3.19D

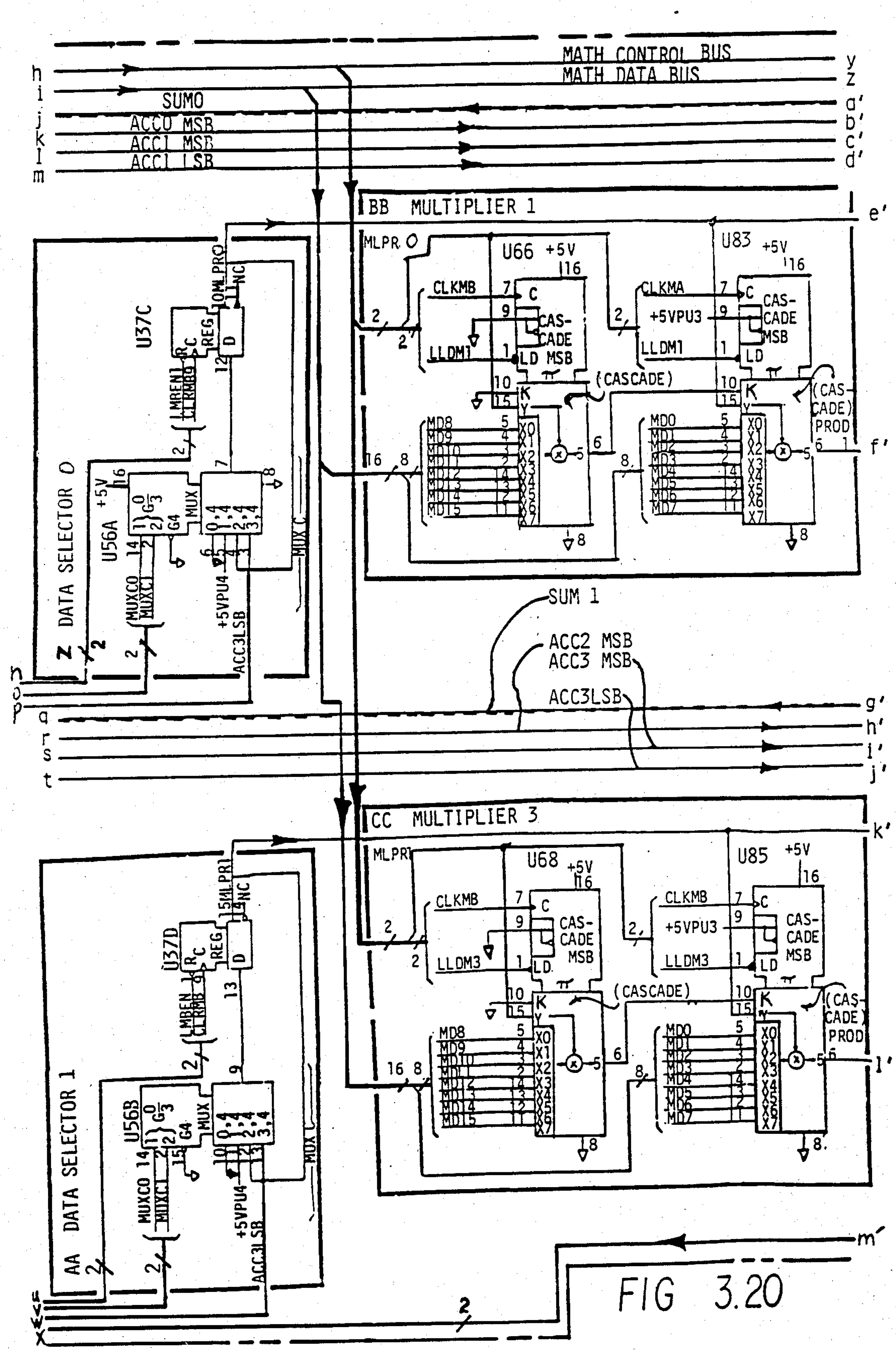
FIG 3.20

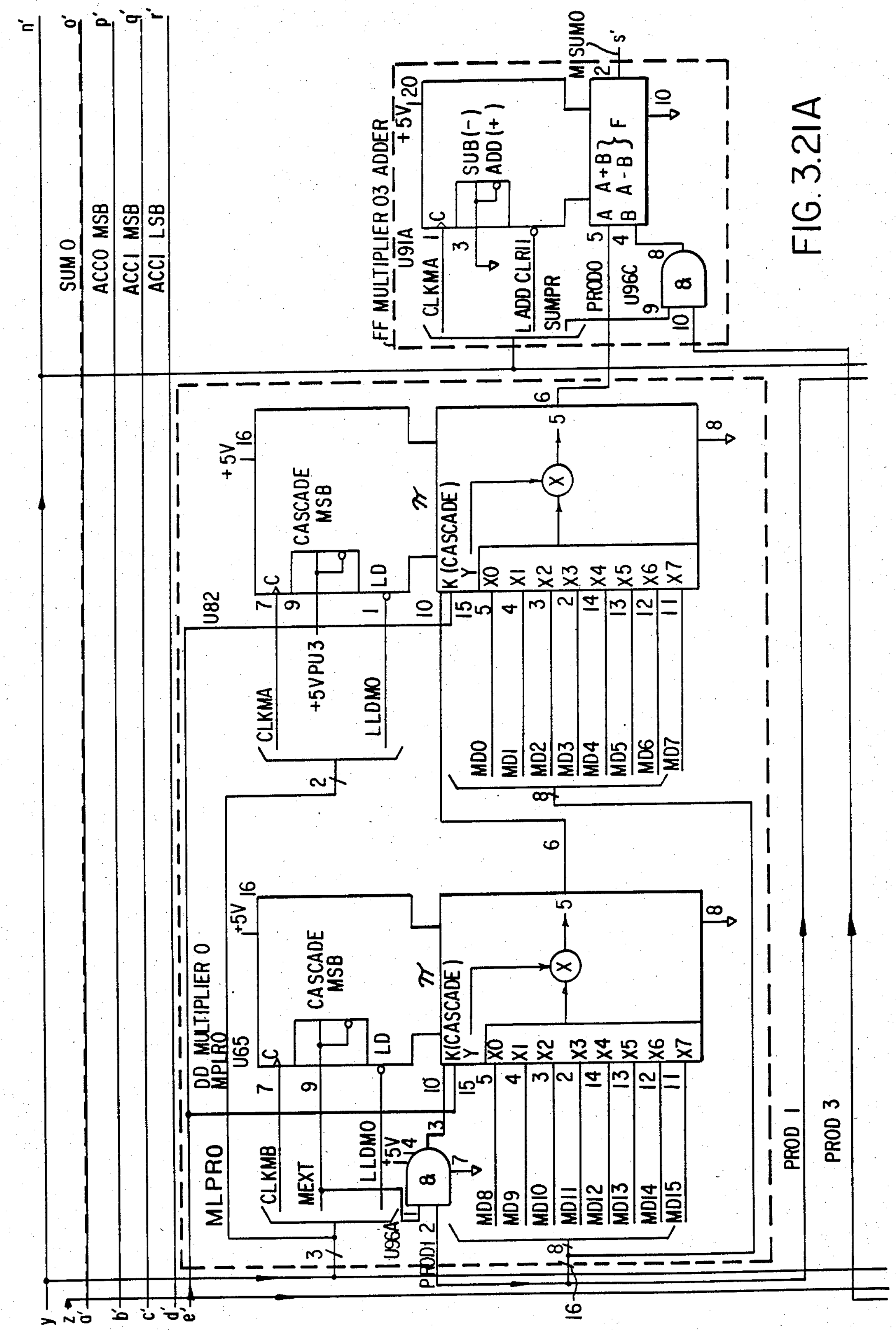
FIG. 3.21A

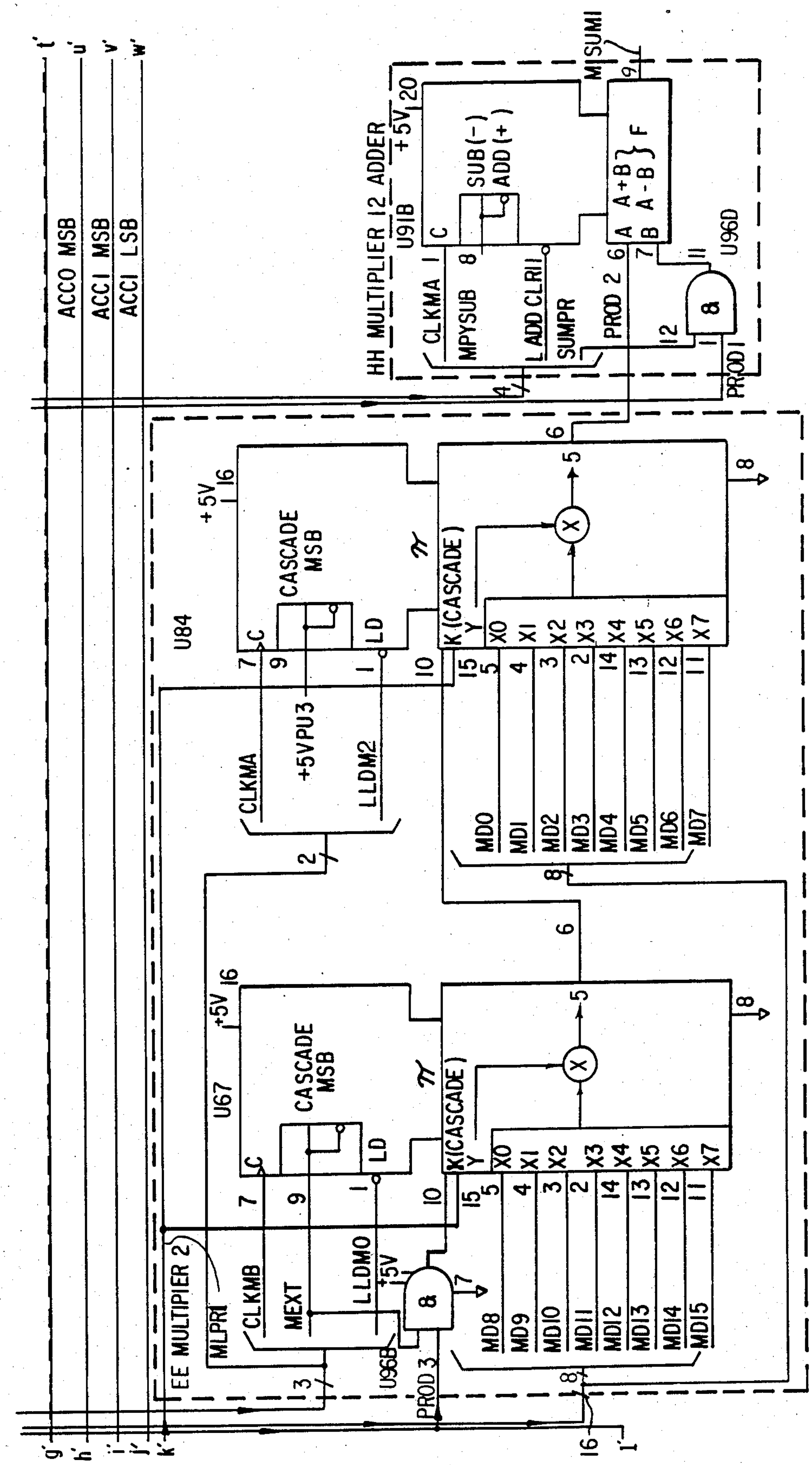
FIG. 3.21B

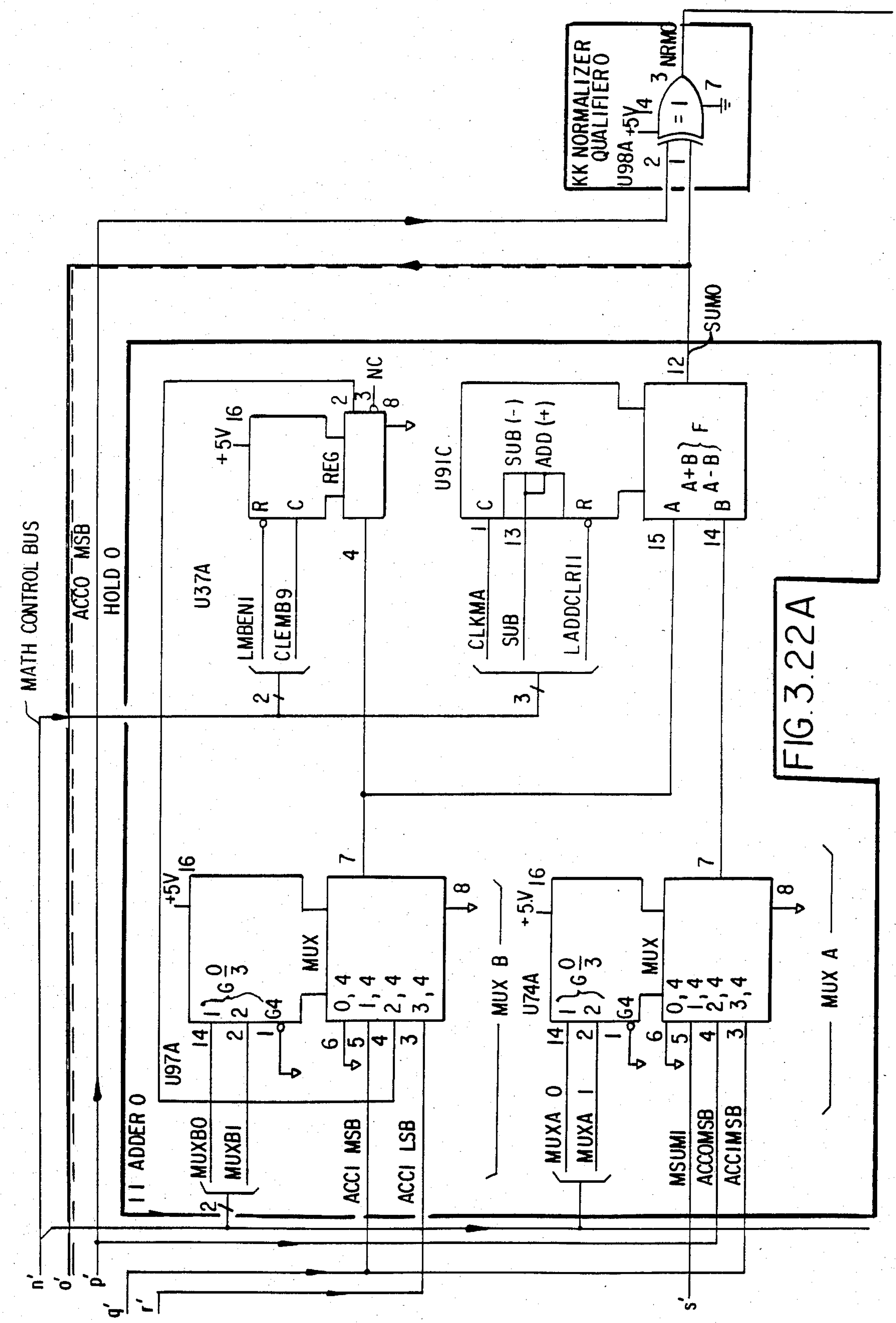
FIG. 3.22A

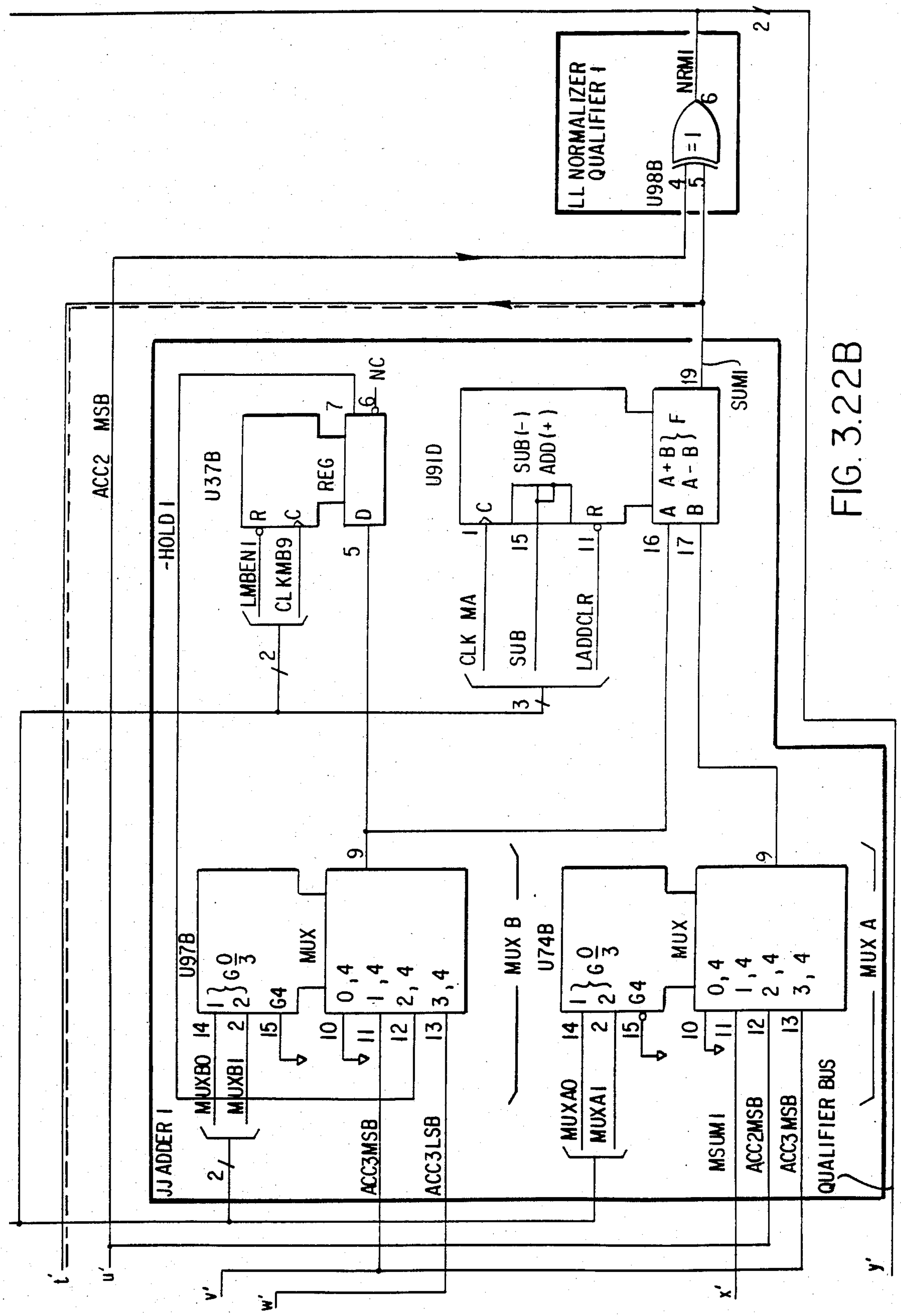
FIG. 3.22B

A13 BUBBLE MEMORY 147
08510-60013

ACTIVE COMPONENTS PARTS LISTS (U's and Q's)

| Reference Designators | Part Number | Manufacturer's Part Number |
|---|---|---|
| Q1 | 1854-0477 | 2N2222A |
| Q2, Q3 | 1855-0423 | |
| U2,4,23,25 | 1858-0081 | I7254 |
| U1 | 1820-2520 | 75463 |
| U3,24 | 1820-2816 | I7250 |
| U5, 19 | 1820-2817 | I7242 |
| U7, 17 | 1820-2807 | BUBBLE 1MX1 |
| U8, 16 | 1820-2818 | I7230 |
| U9 | 1820-1197 | 74LS00 |
| U10 | 1820-2806 | I7220 |
| U11 | 1820-2024 | 74LS244 |
| U12 | 1820-1730 | 74LS273 |
| U13 | 1820-2075 | 74LS245 |
| U14 | 1820-1112 | 74LS74 |
| U15 | 1820-1216 | 74LS138 |
| U20, 21 NOTE 3 | 1818-0850 | PROM 4KX8 D2732 |
| U22 | 1820-1144 | 74LS02 |
| | | |
| | | |
| | | |
| | | |
| | | |
| | | |
| | | |
| | | |

FIG 3.24

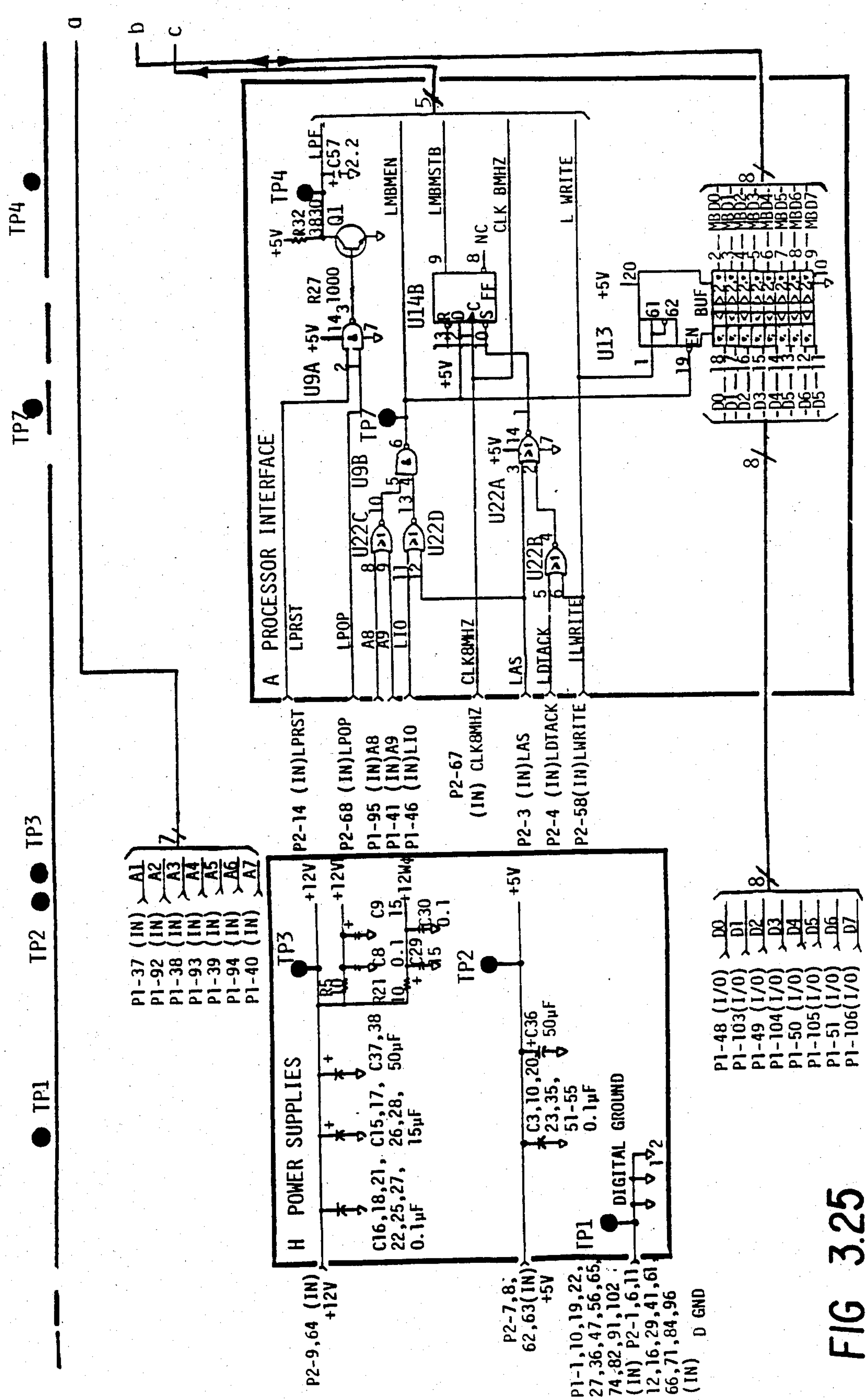
FIG 3.25

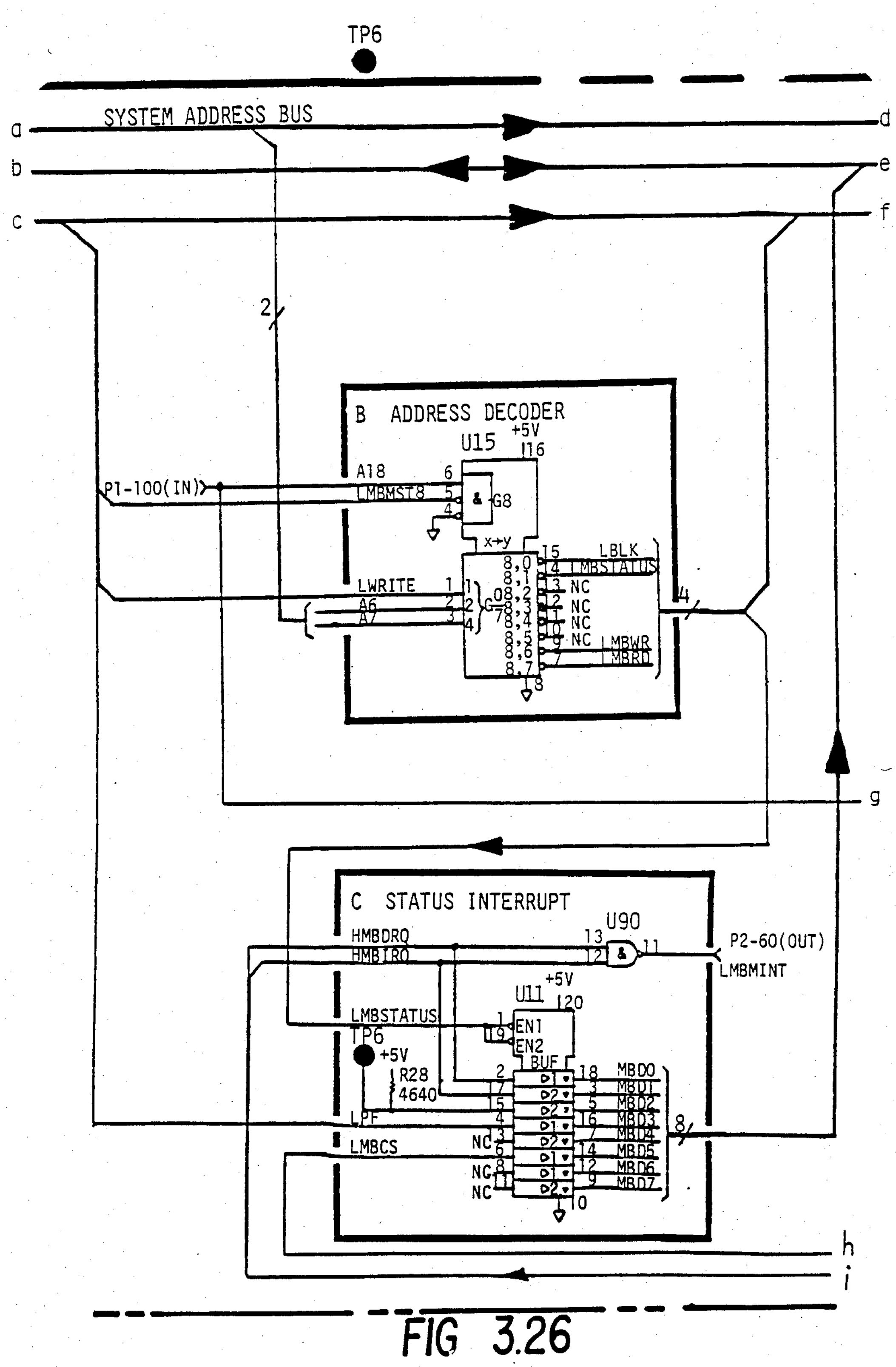
FIG 3.26

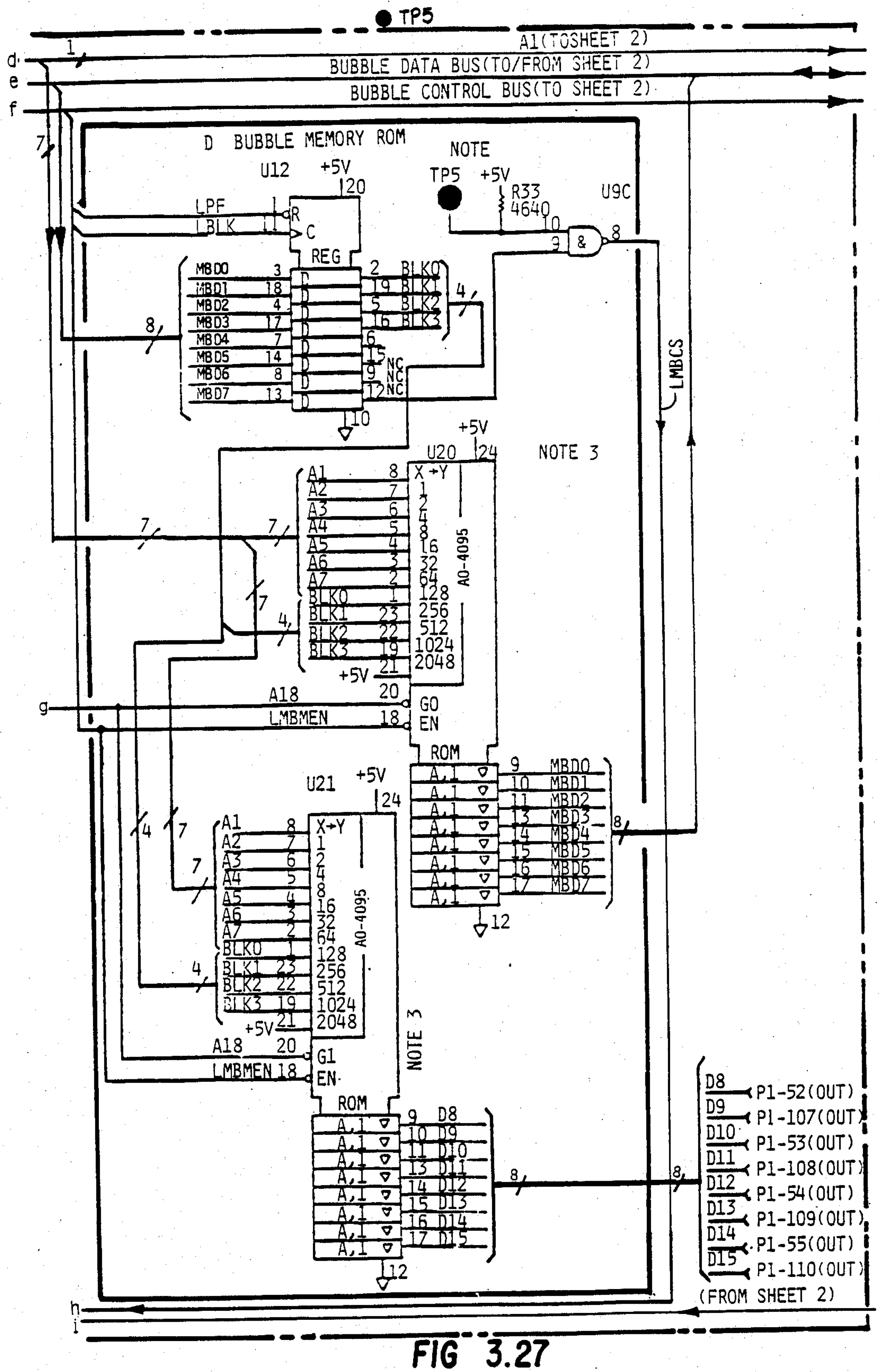
FIG 3.27

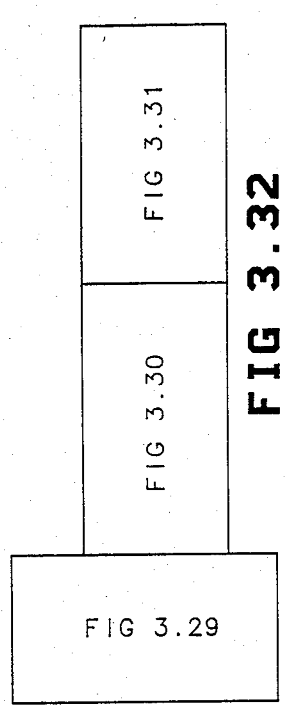
FIG 3.32
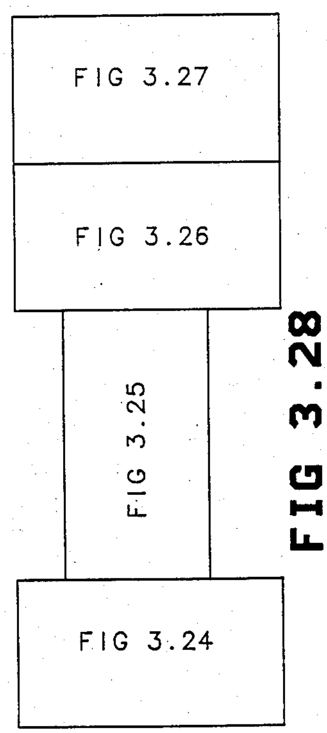
FIG 3.28
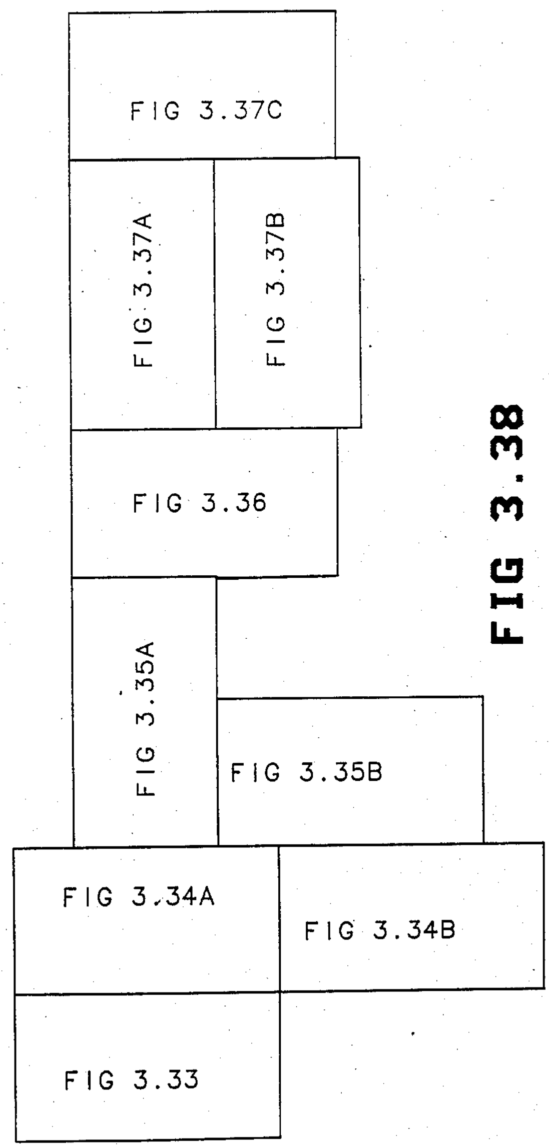
FIG 3.38

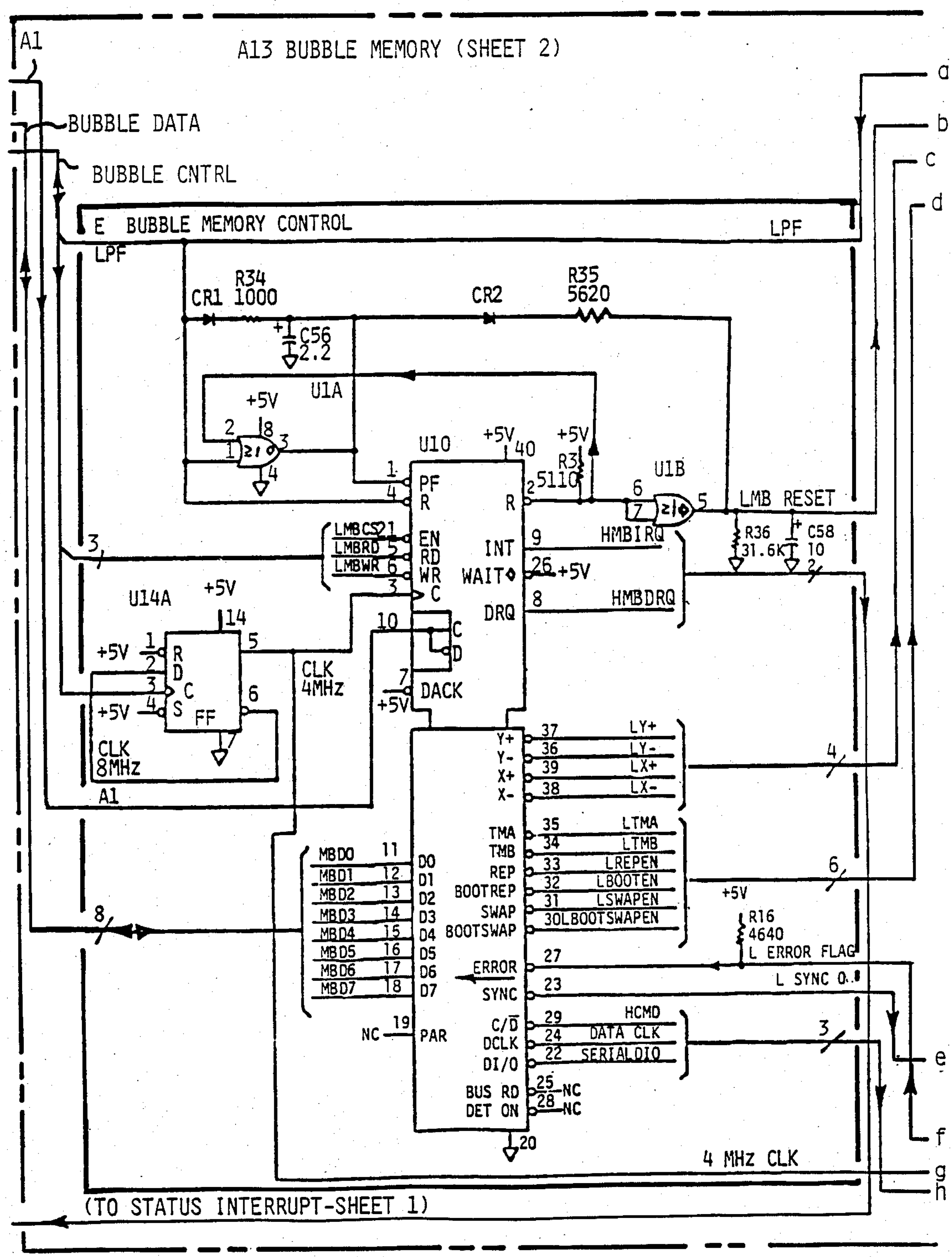
FIG 3.29

FIG 3.30
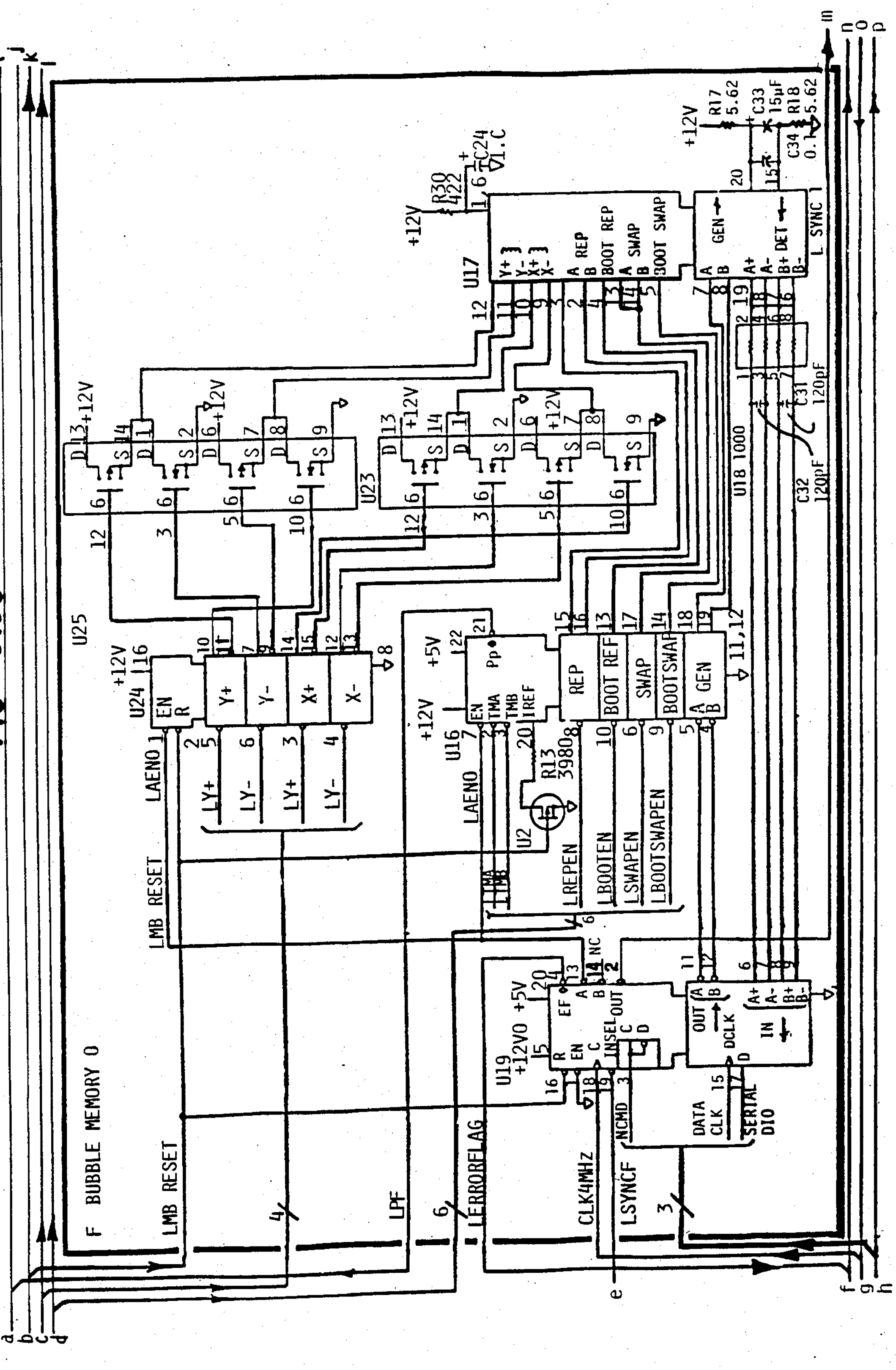

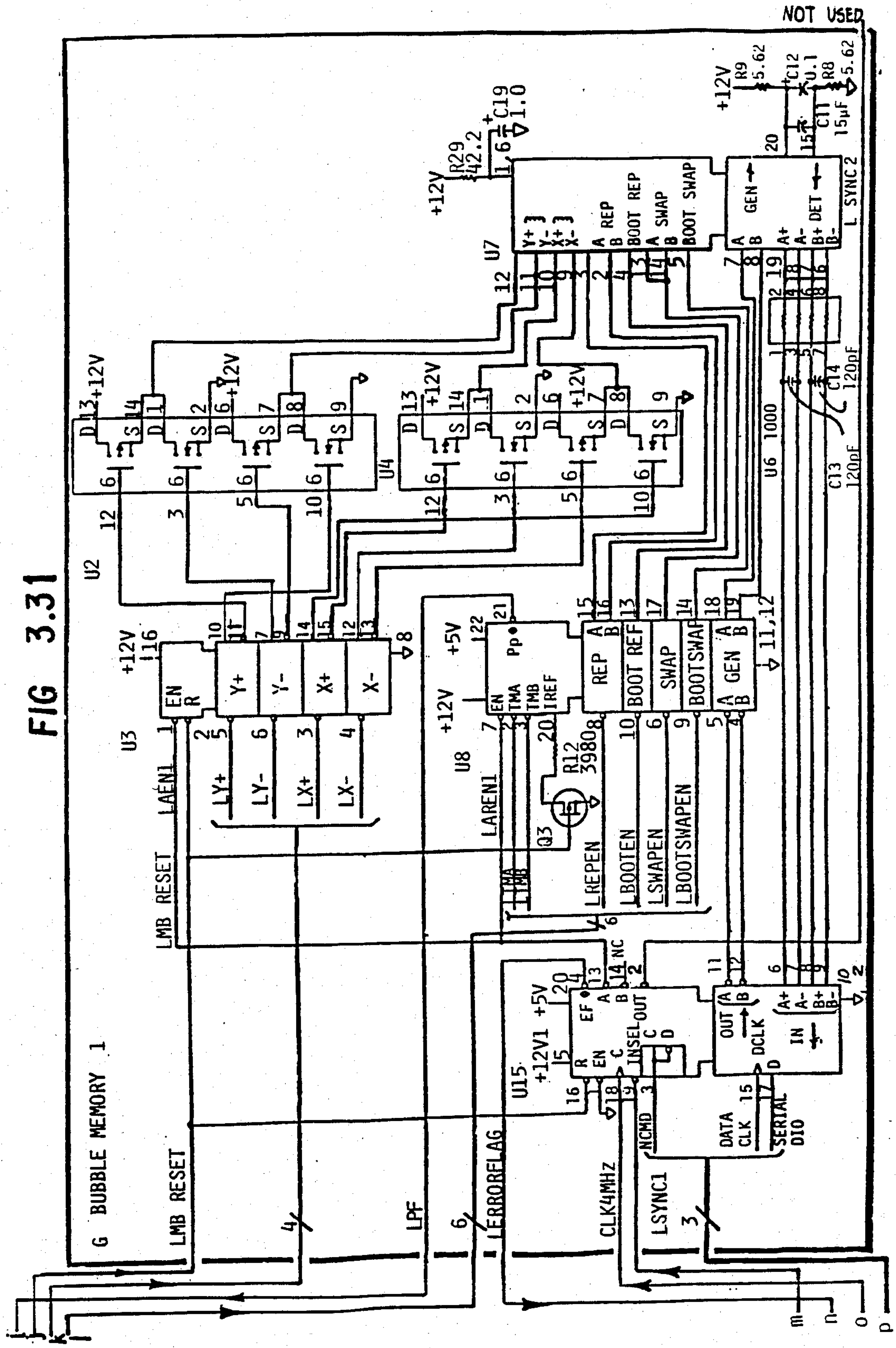
FIG 3.31

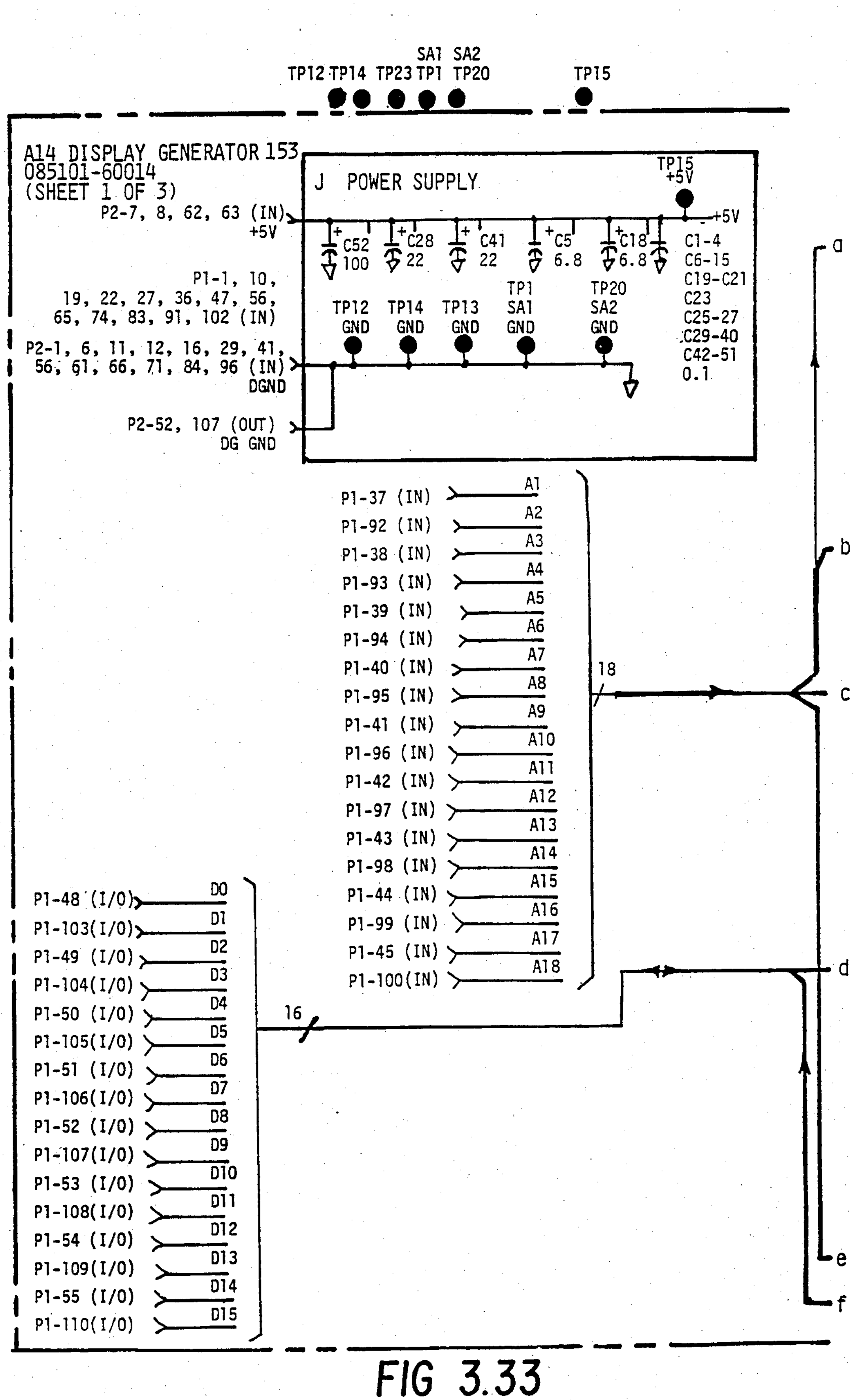
FIG 3.33

FIG. 3.34A
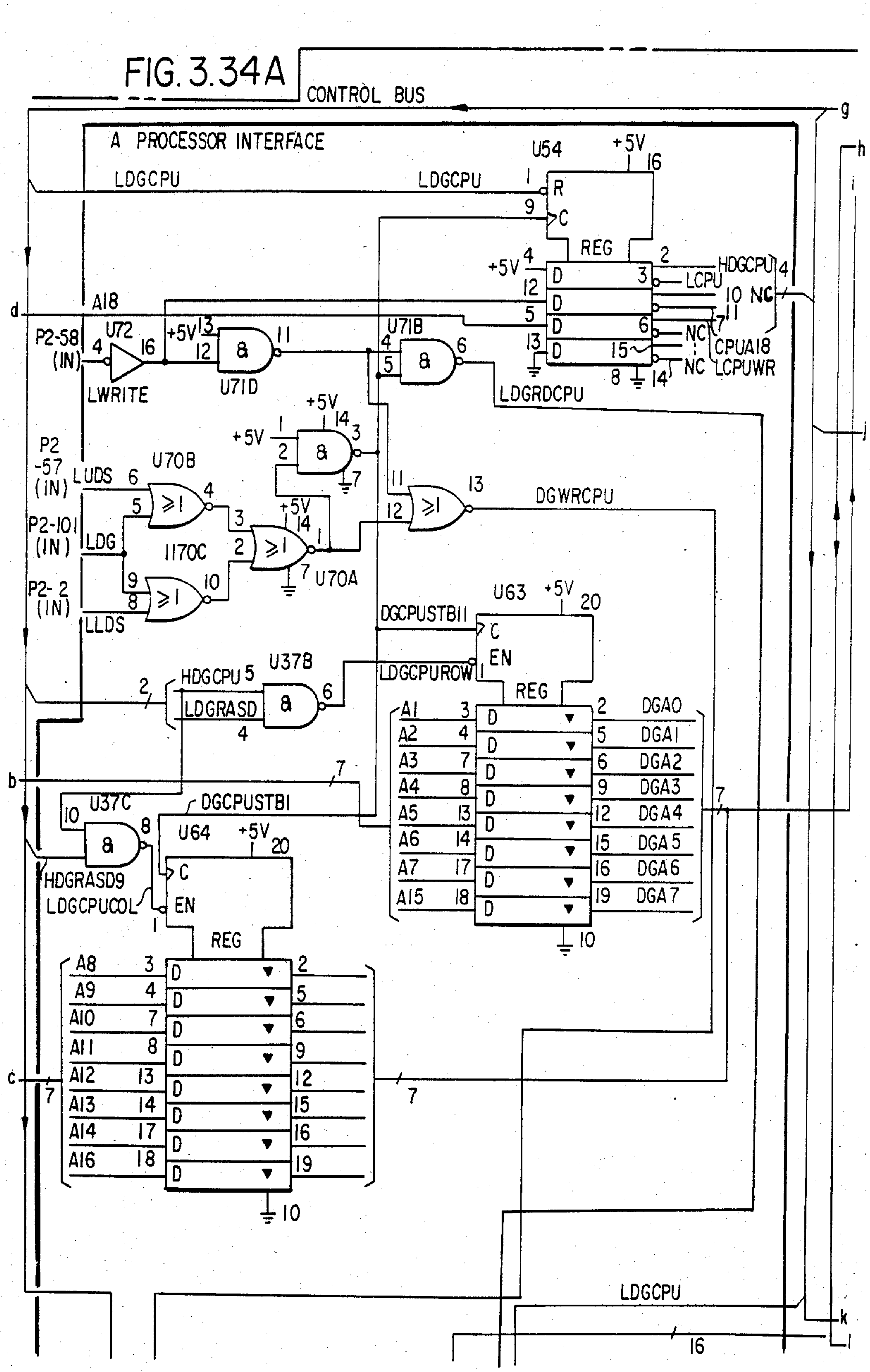

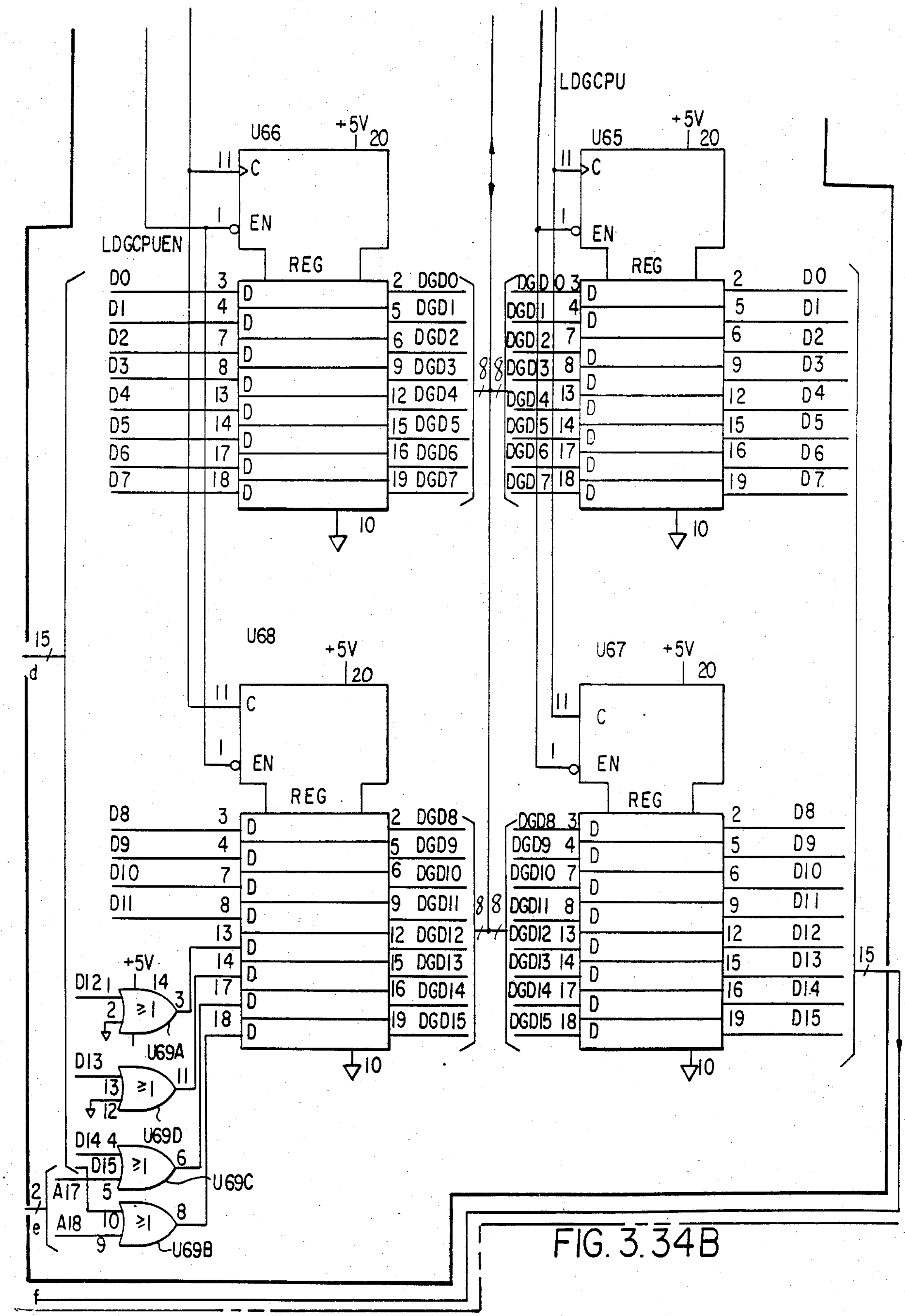
FIG. 3.34B

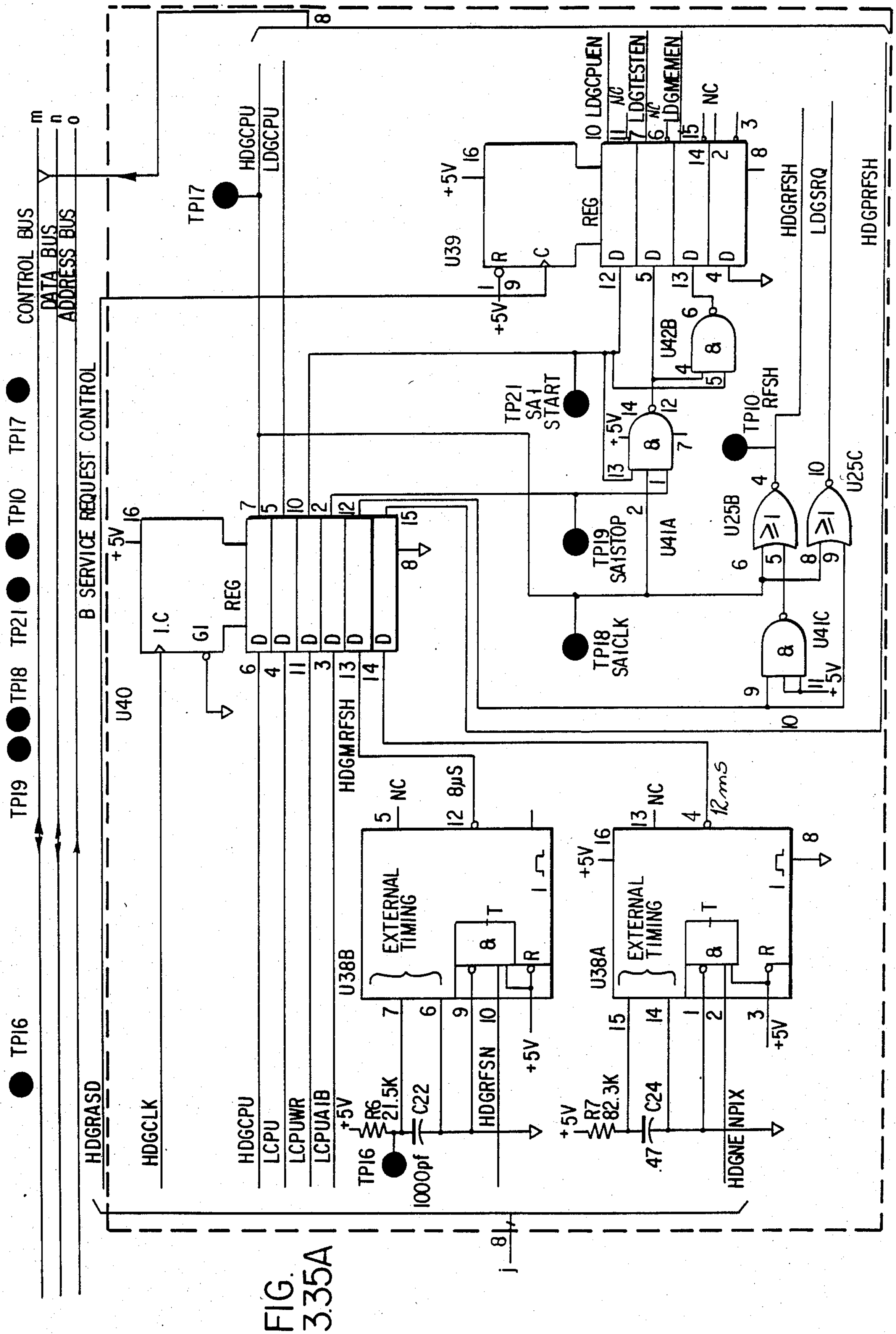
FIG. 3.35A

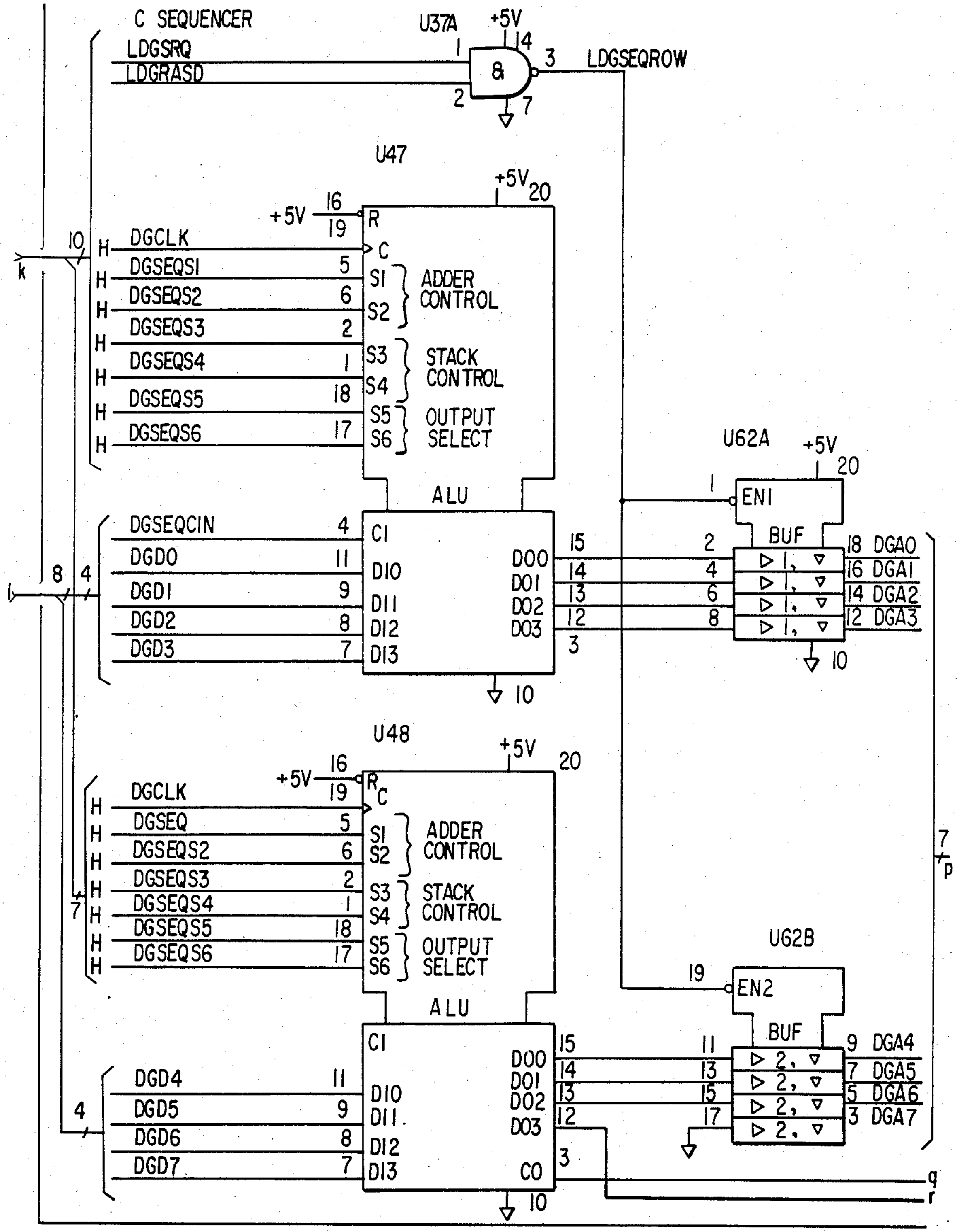
FIG. 3.35B

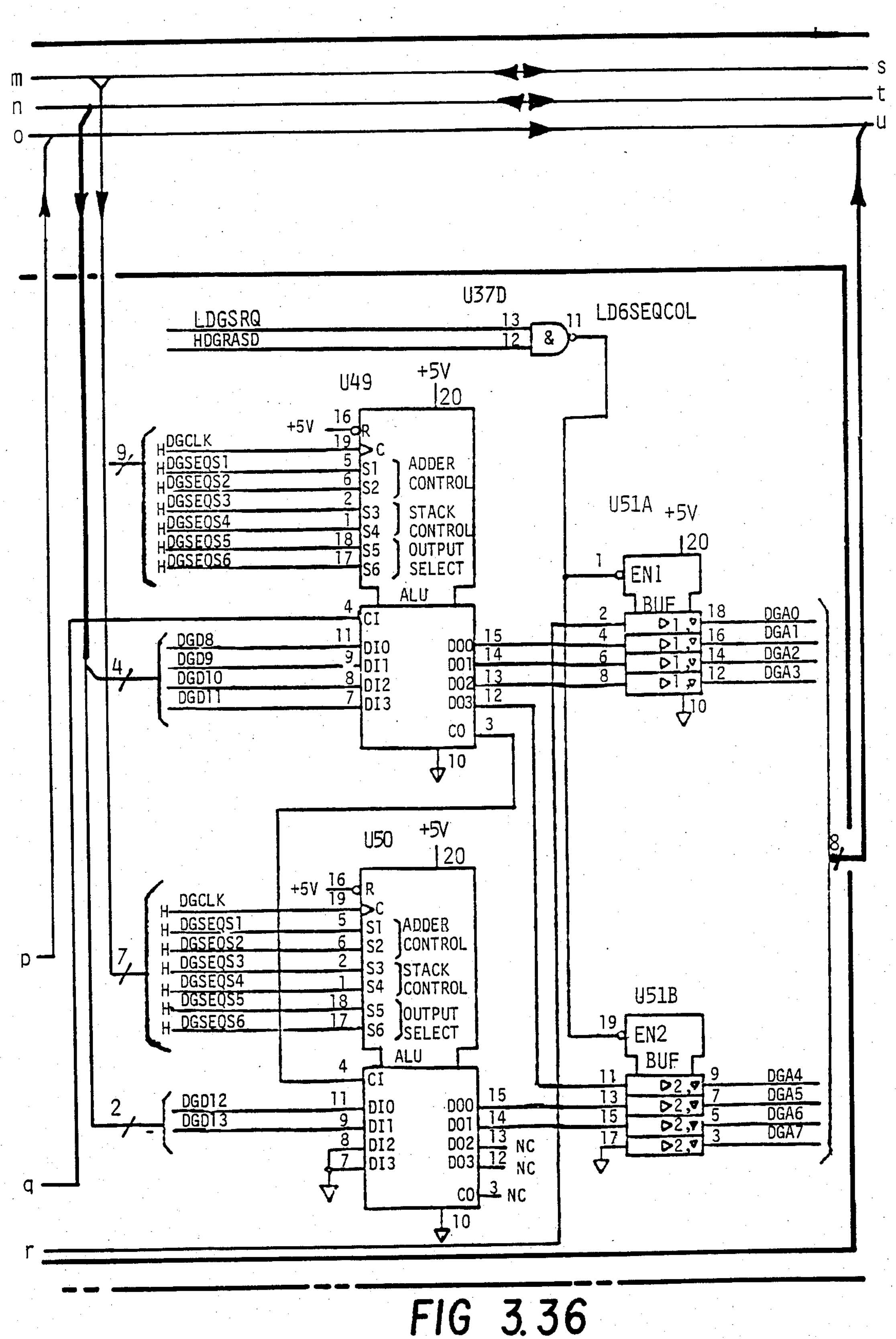
FIG 3.36

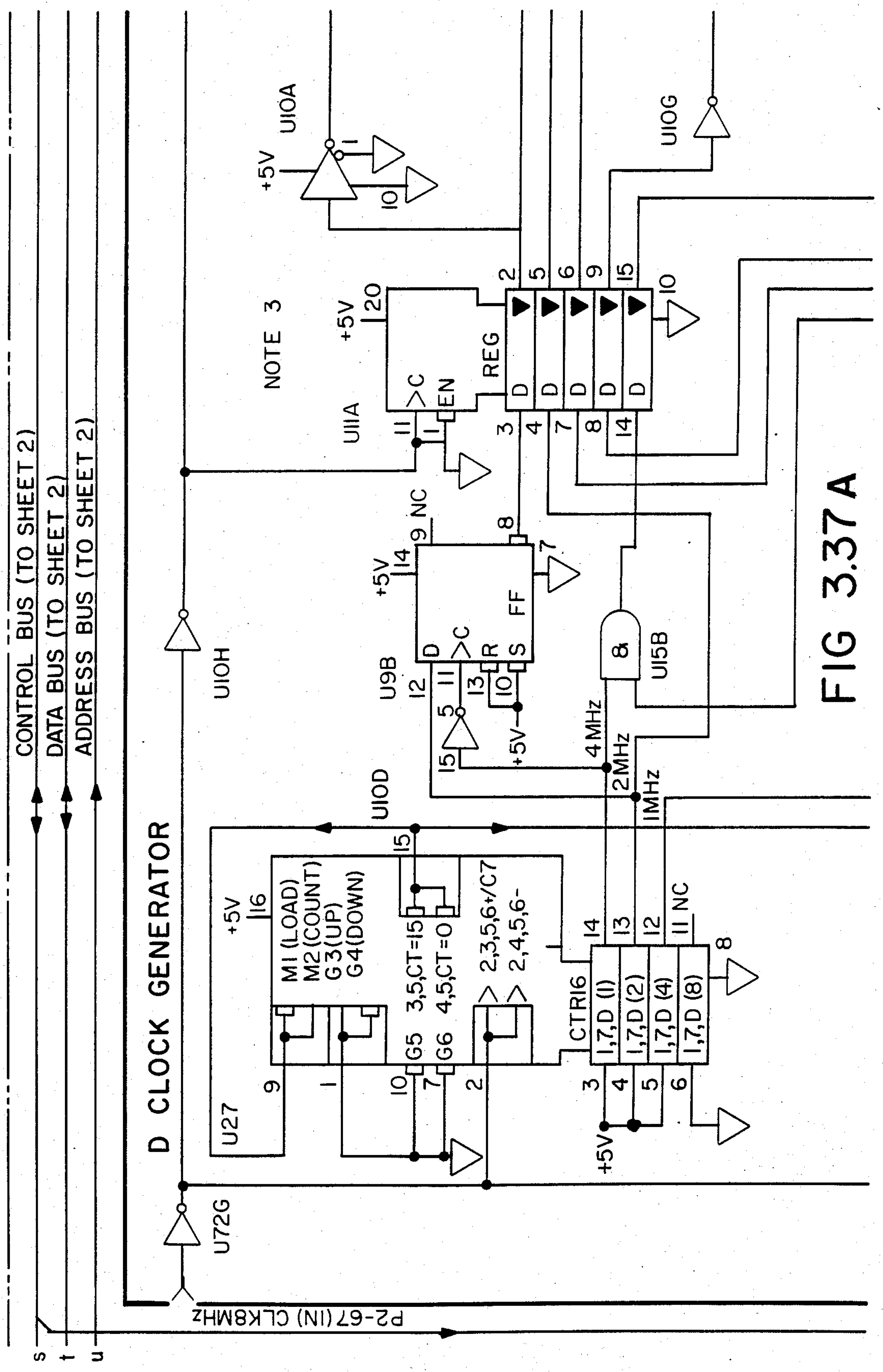
FIG 3.37A

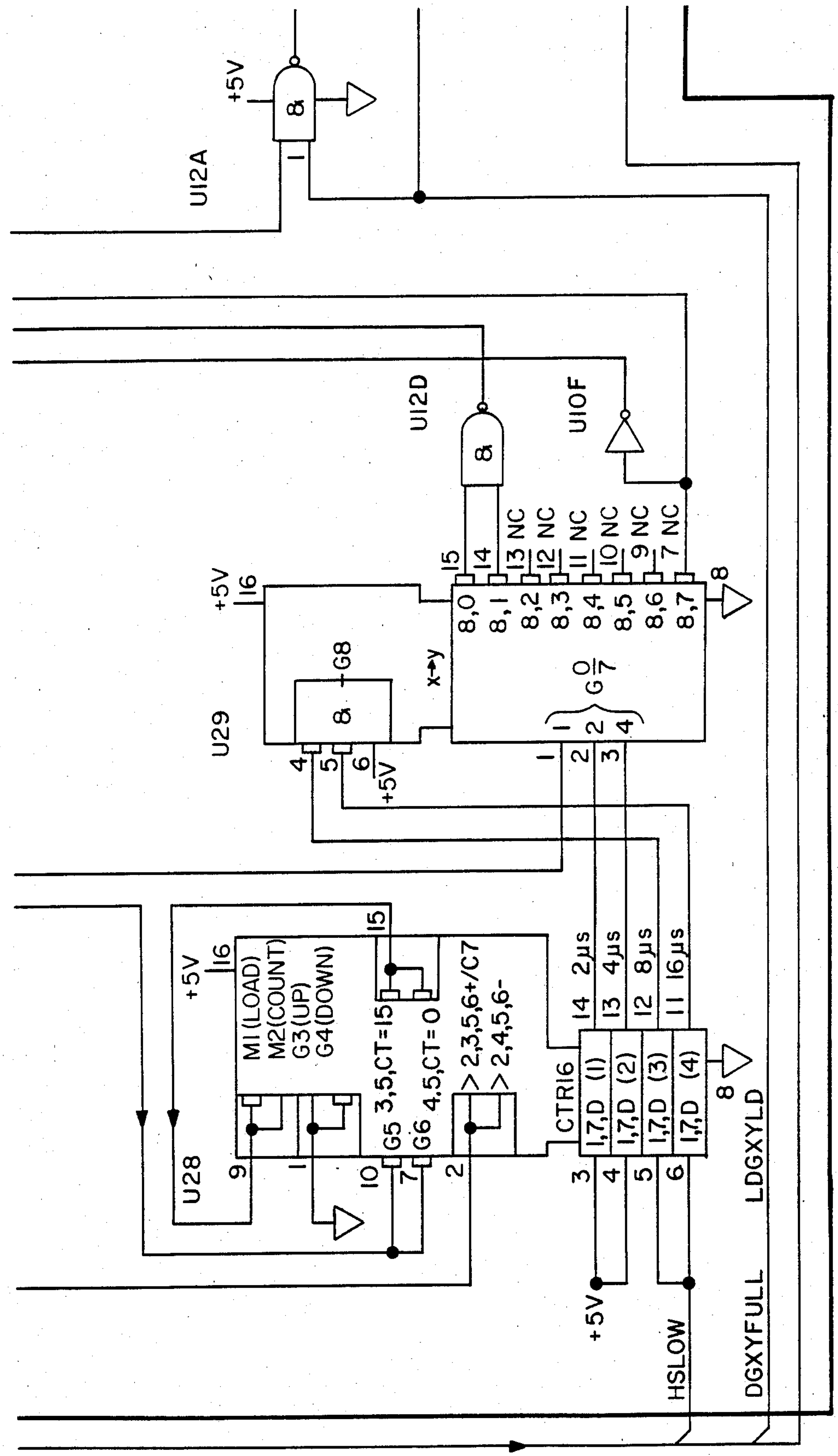
FIG 3.37B

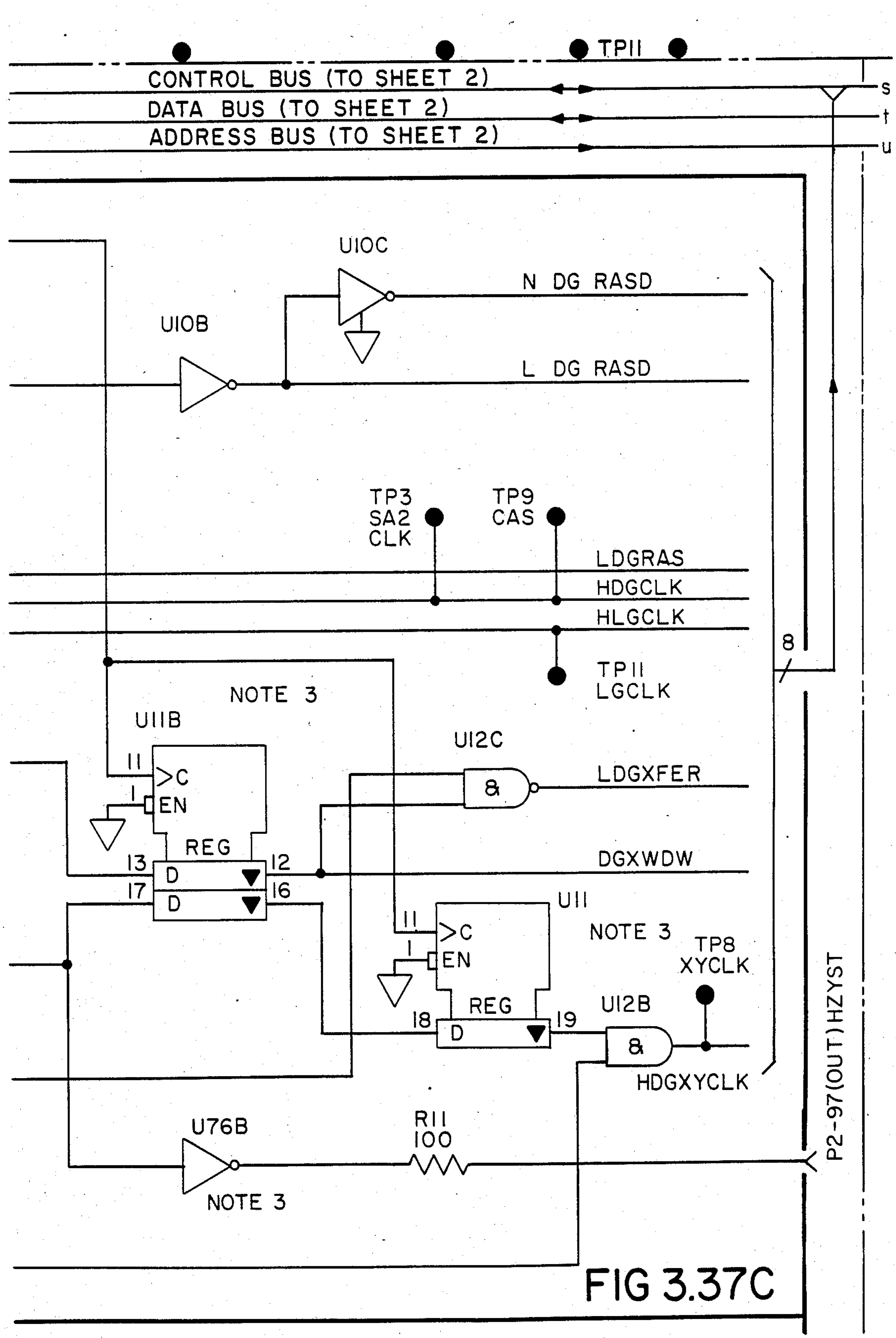
FIG 3.37C

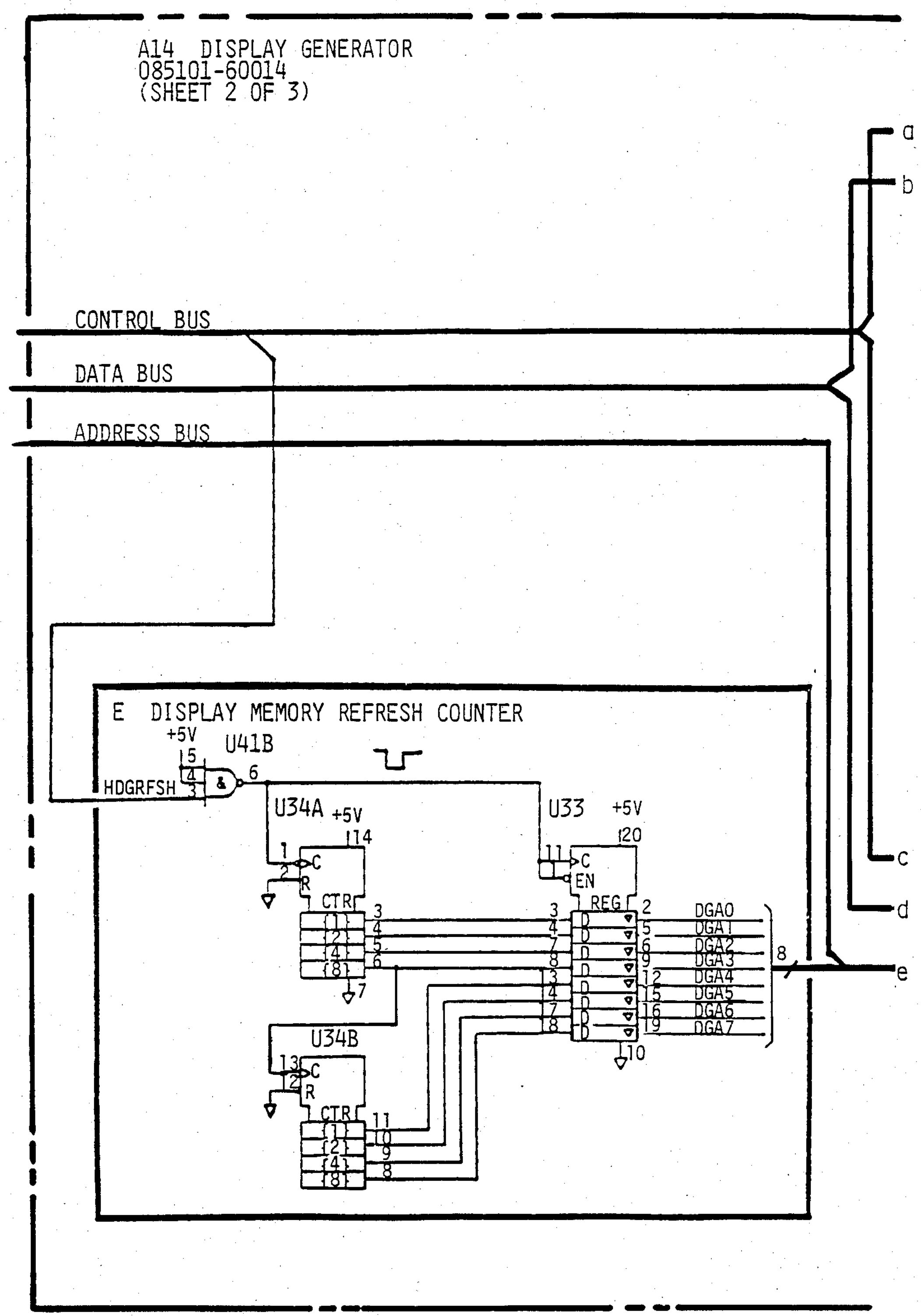
FIG 3.39

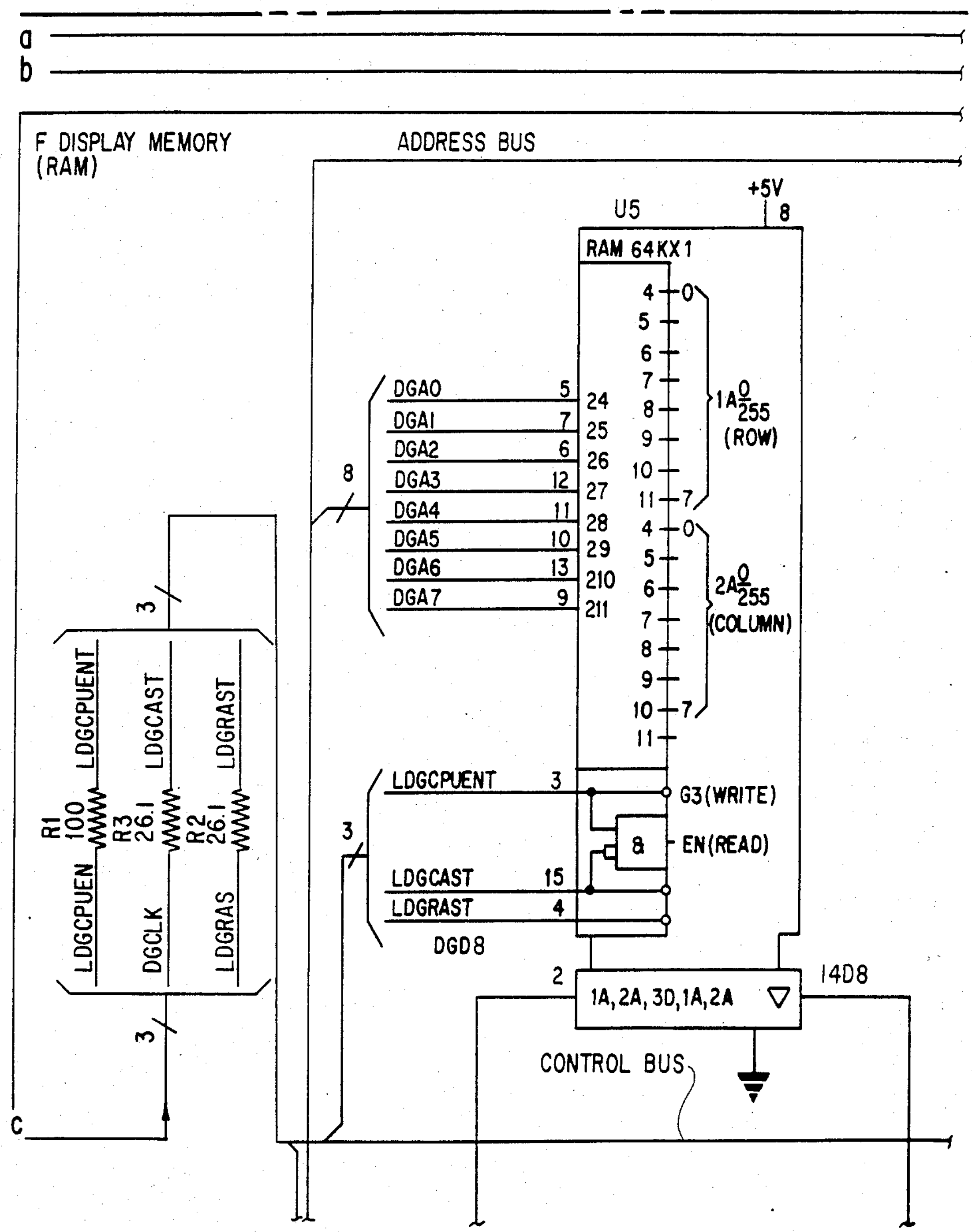
FIG. 3.40A

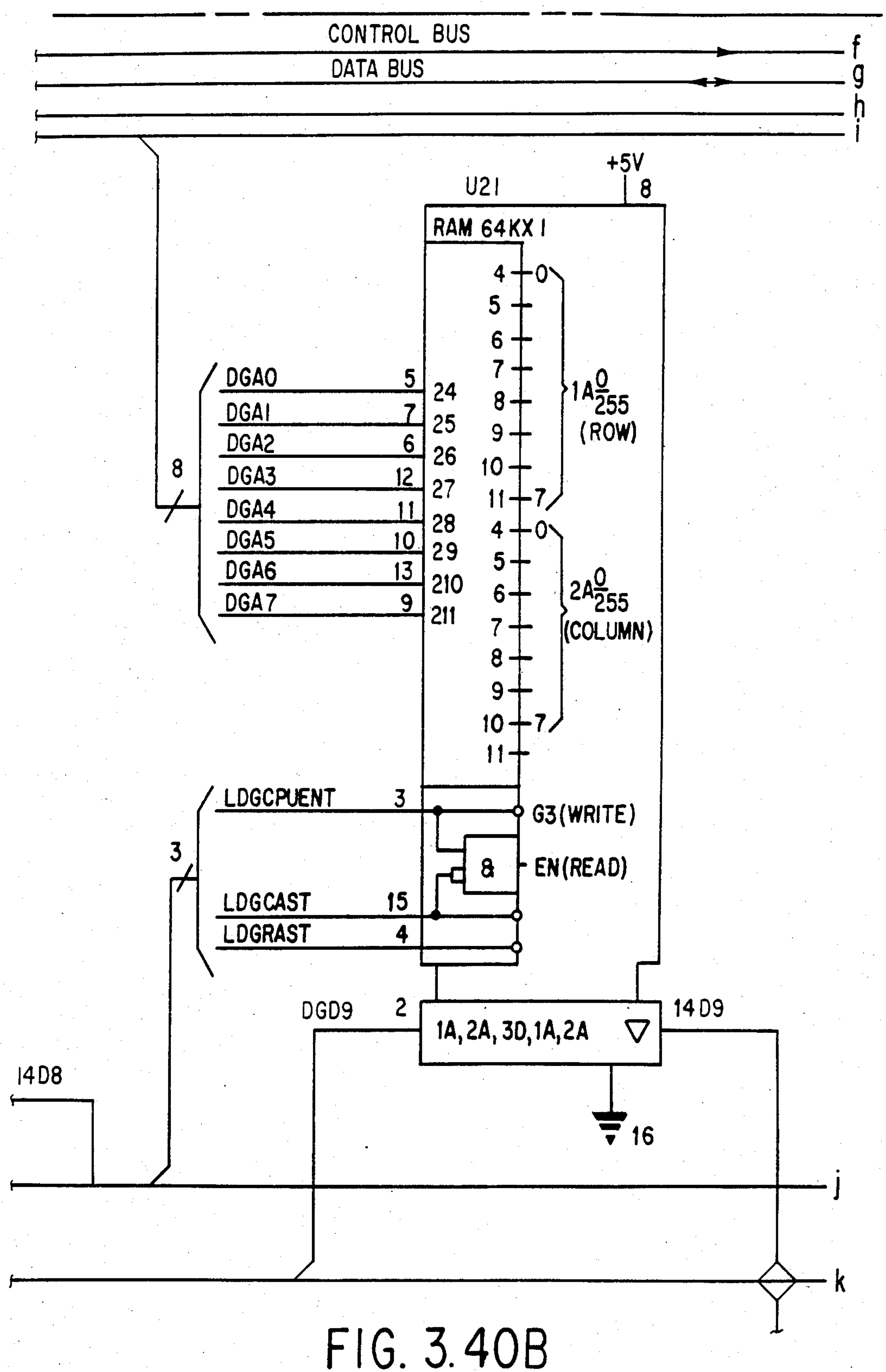
FIG. 3.40B

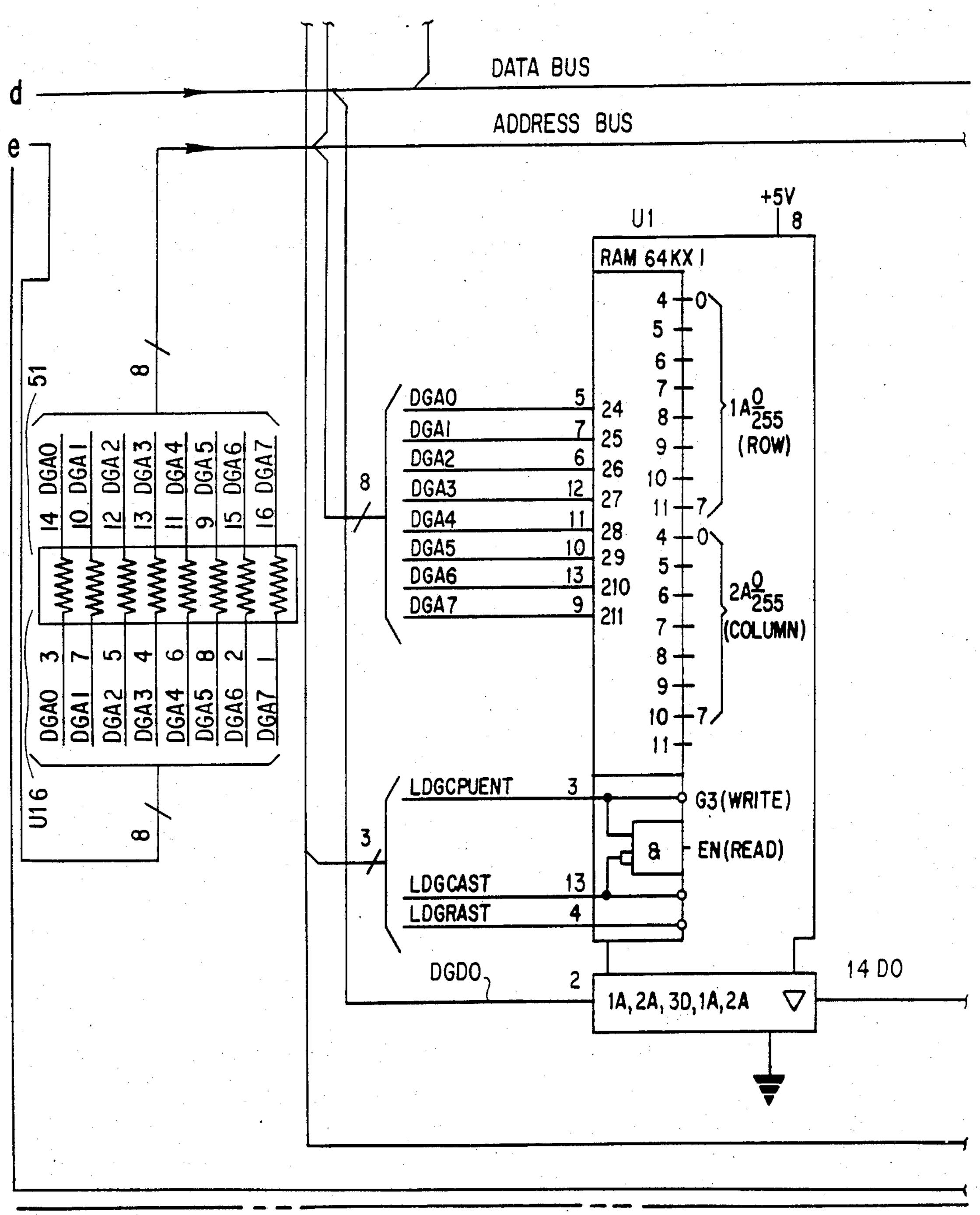
FIG. 3.40C

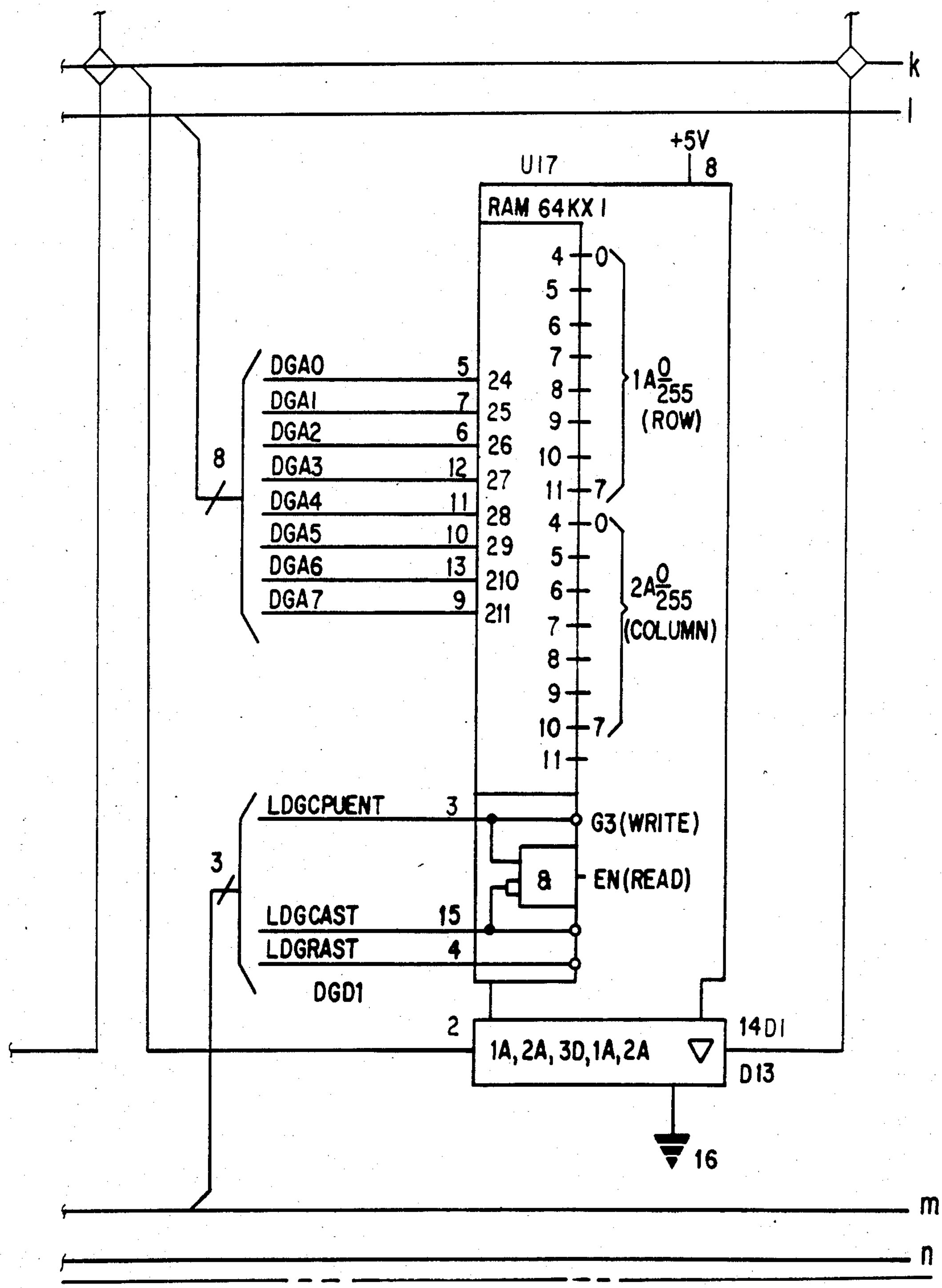
FIG. 3.40D

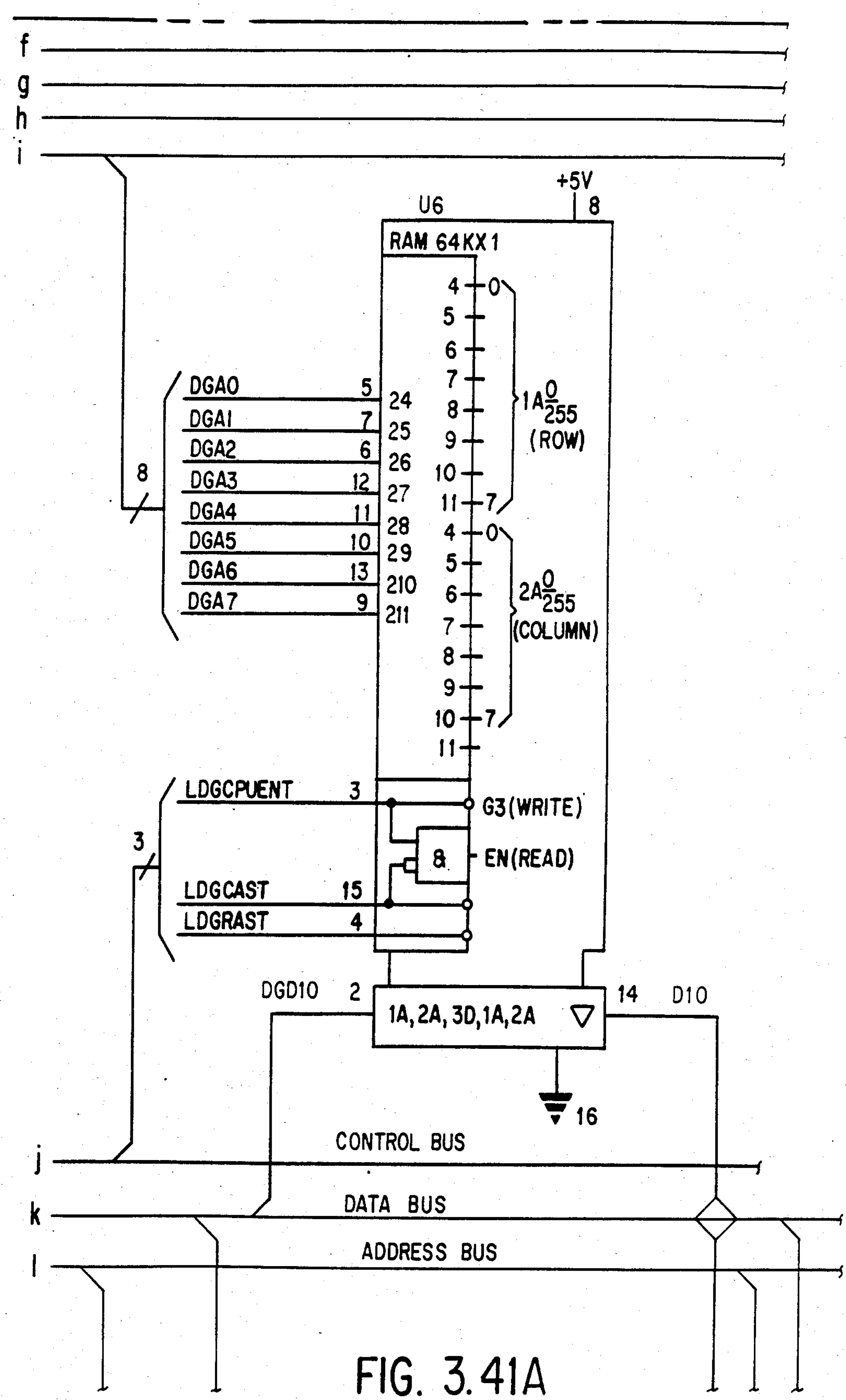
FIG. 3.41A

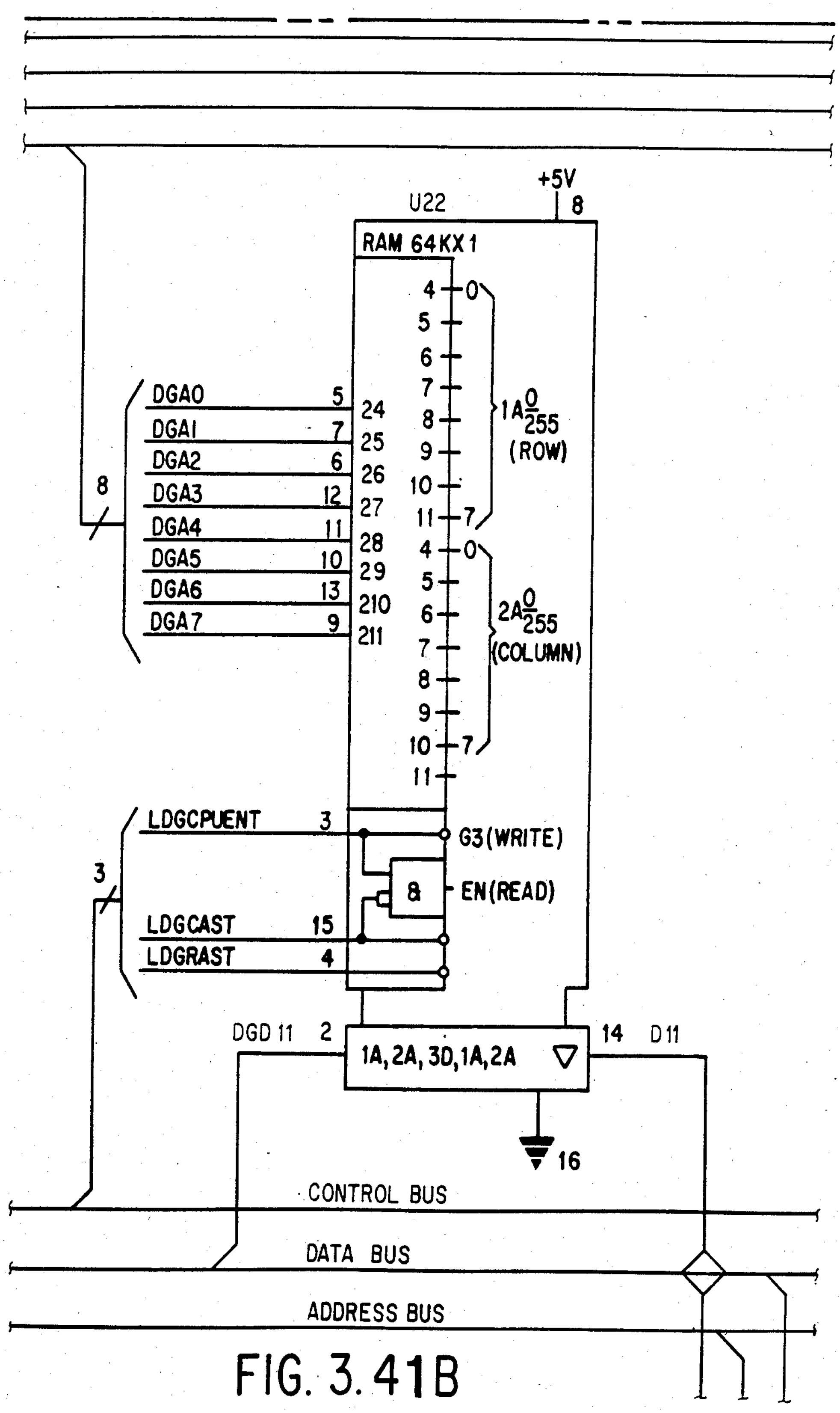
FIG. 3.41B

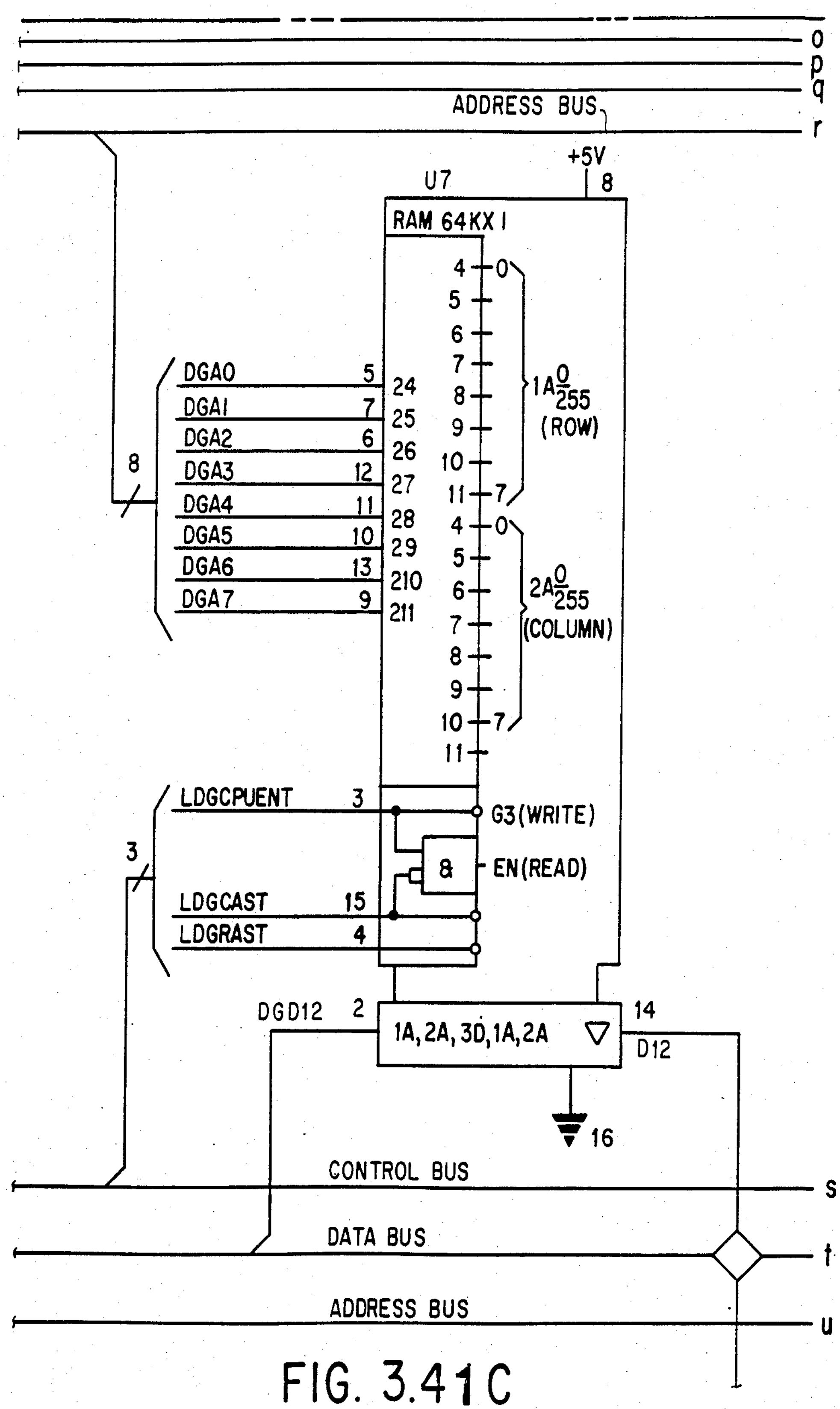
FIG. 3.41C

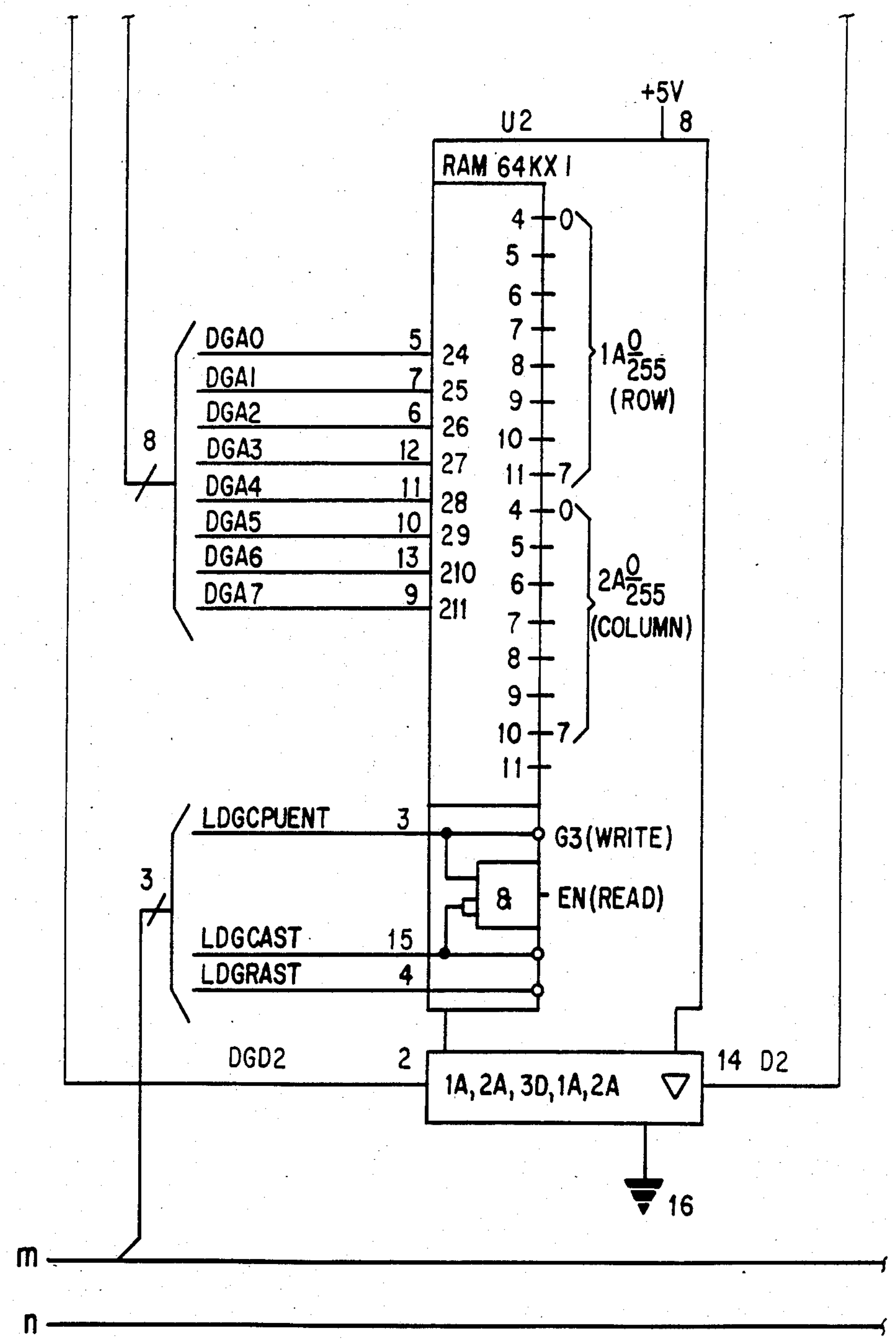
FIG. 3.41D

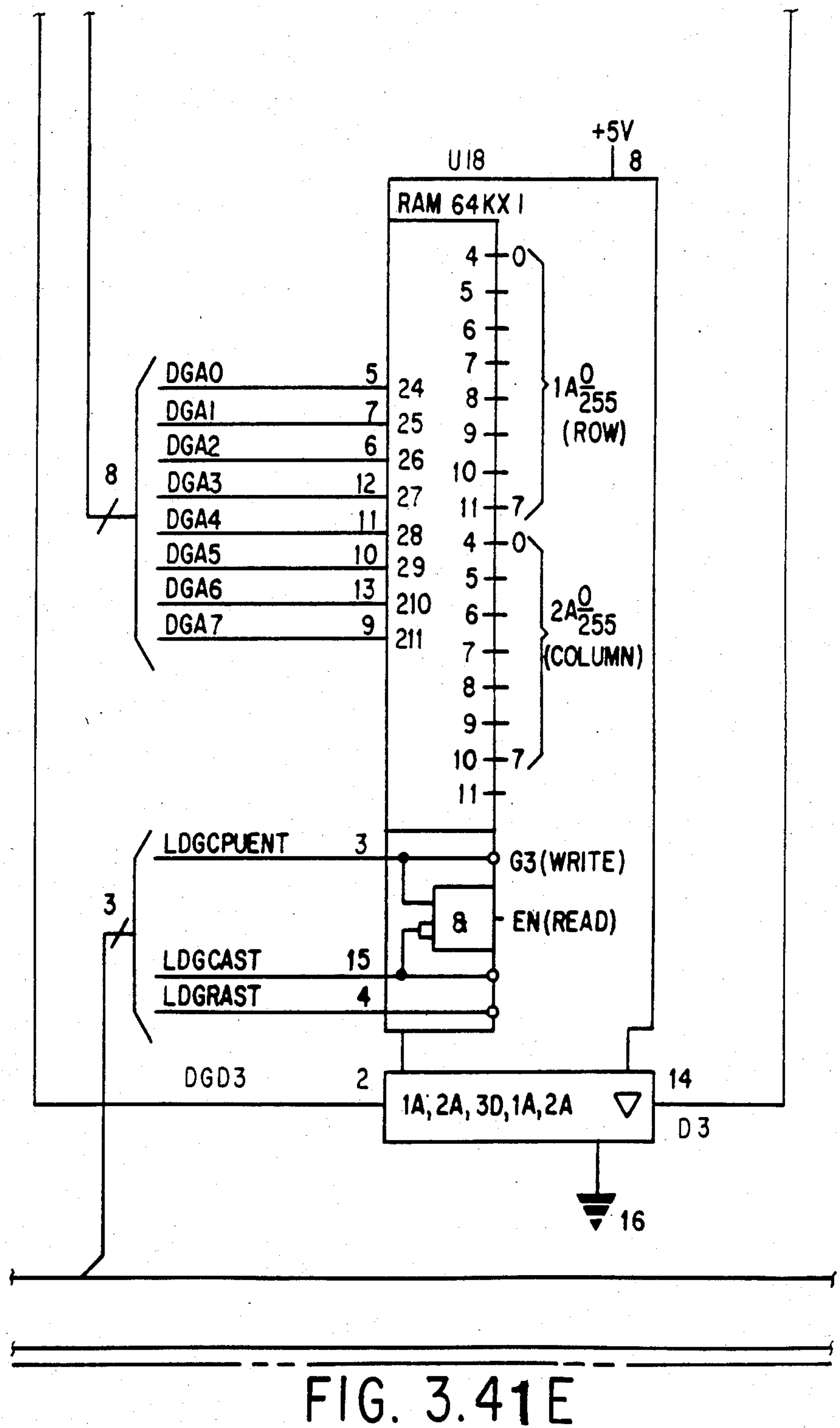
FIG. 3.41E

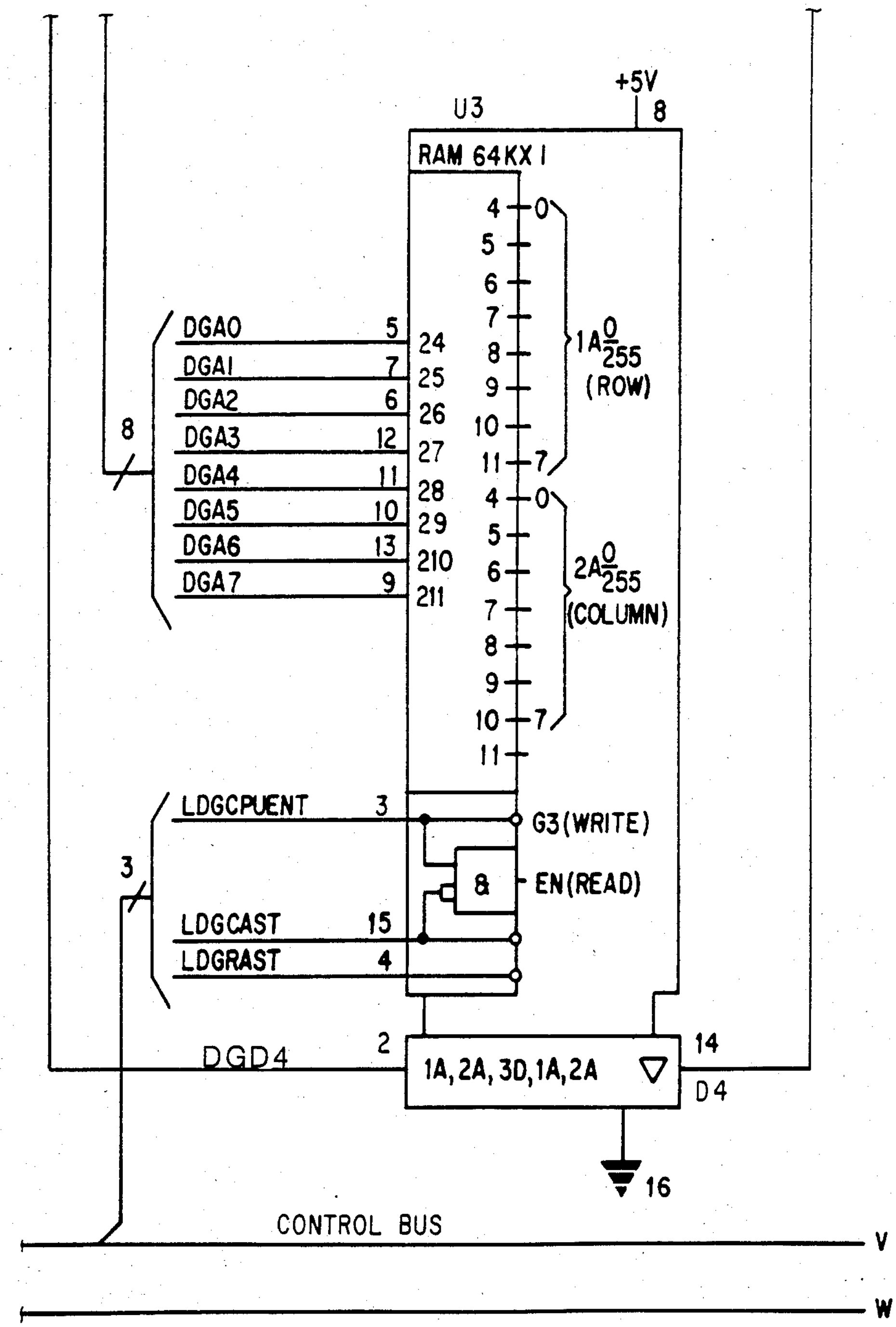
FIG. 3.41F

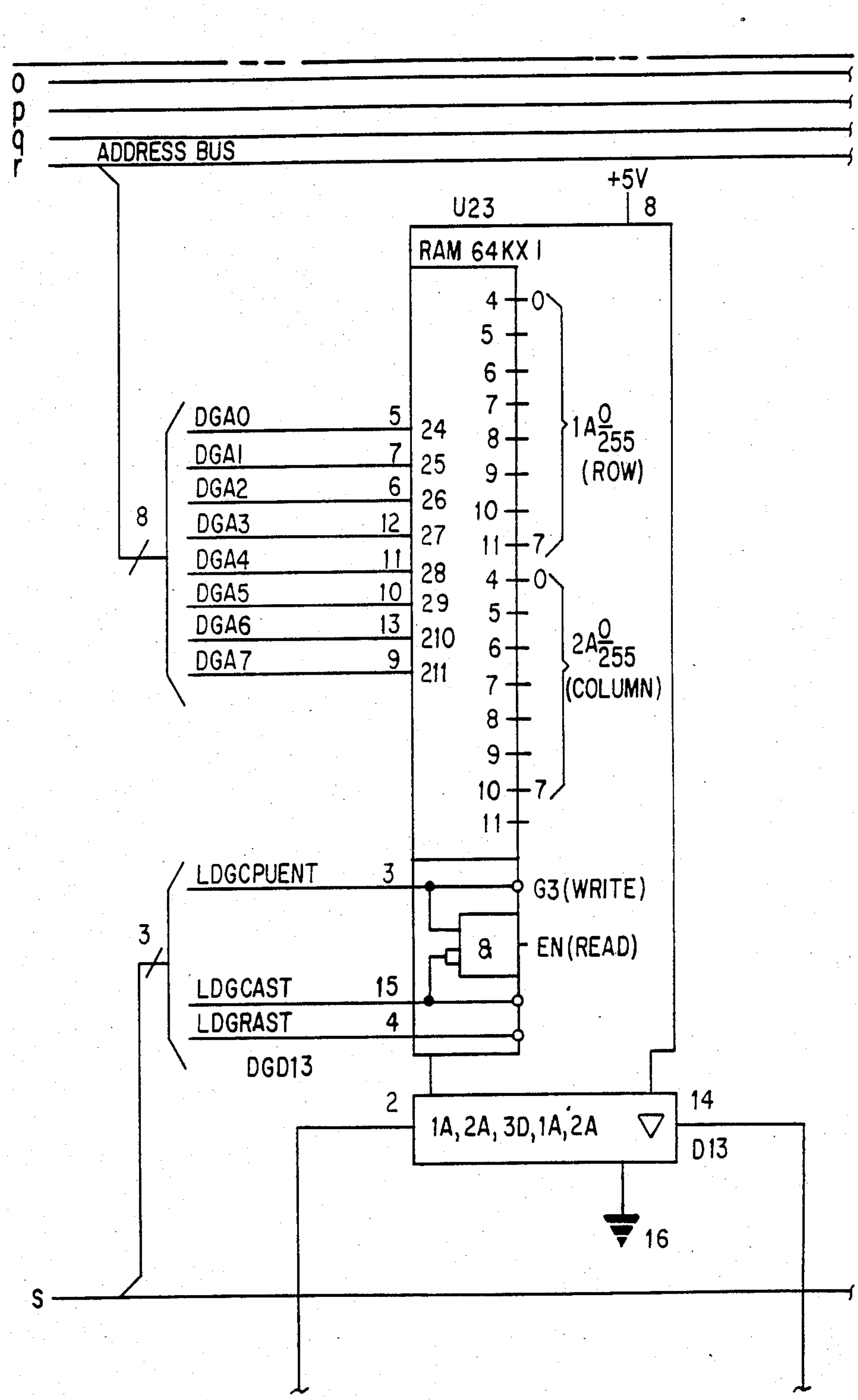
FIG. 3.42A

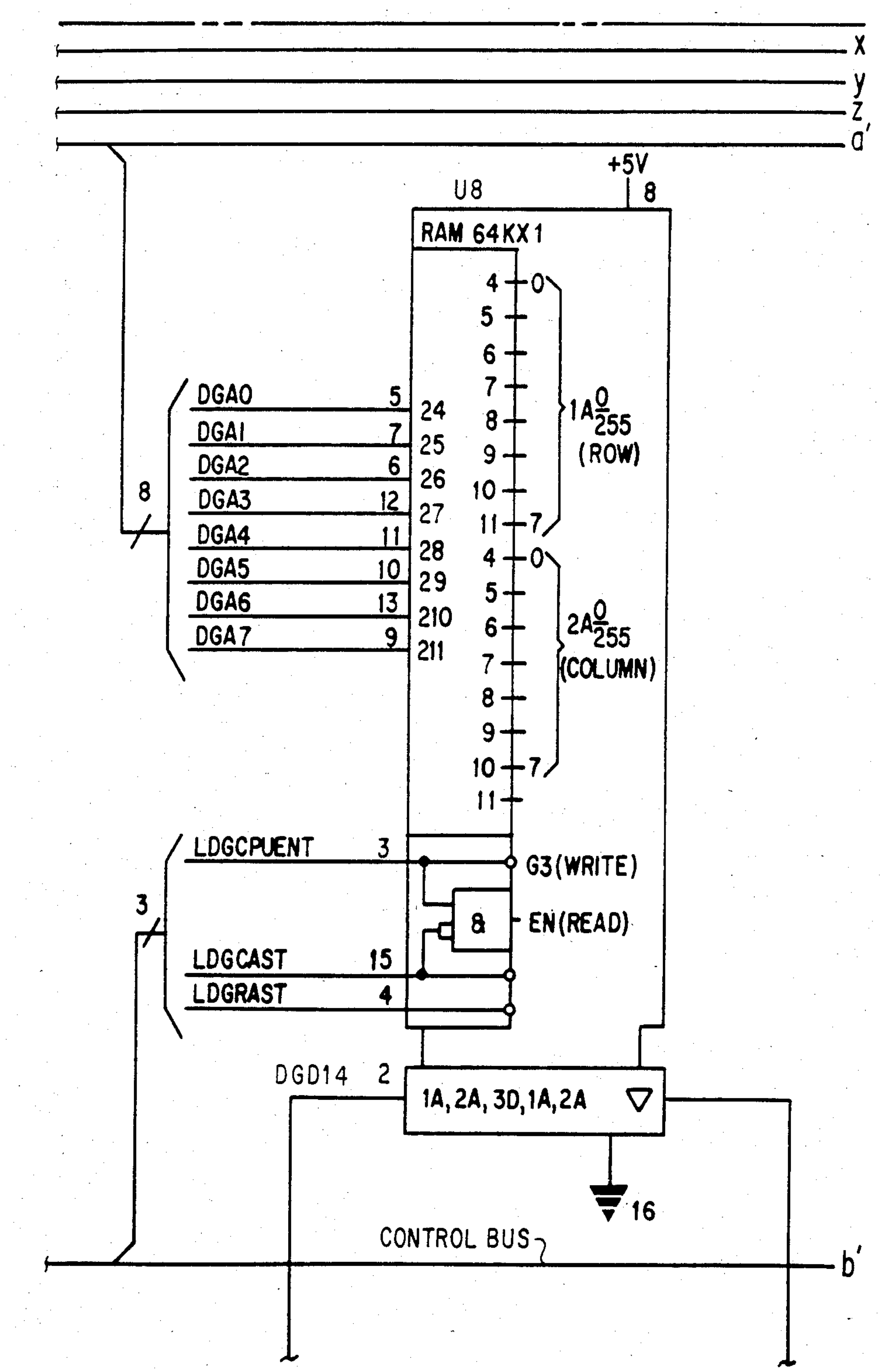
FIG. 3.42B

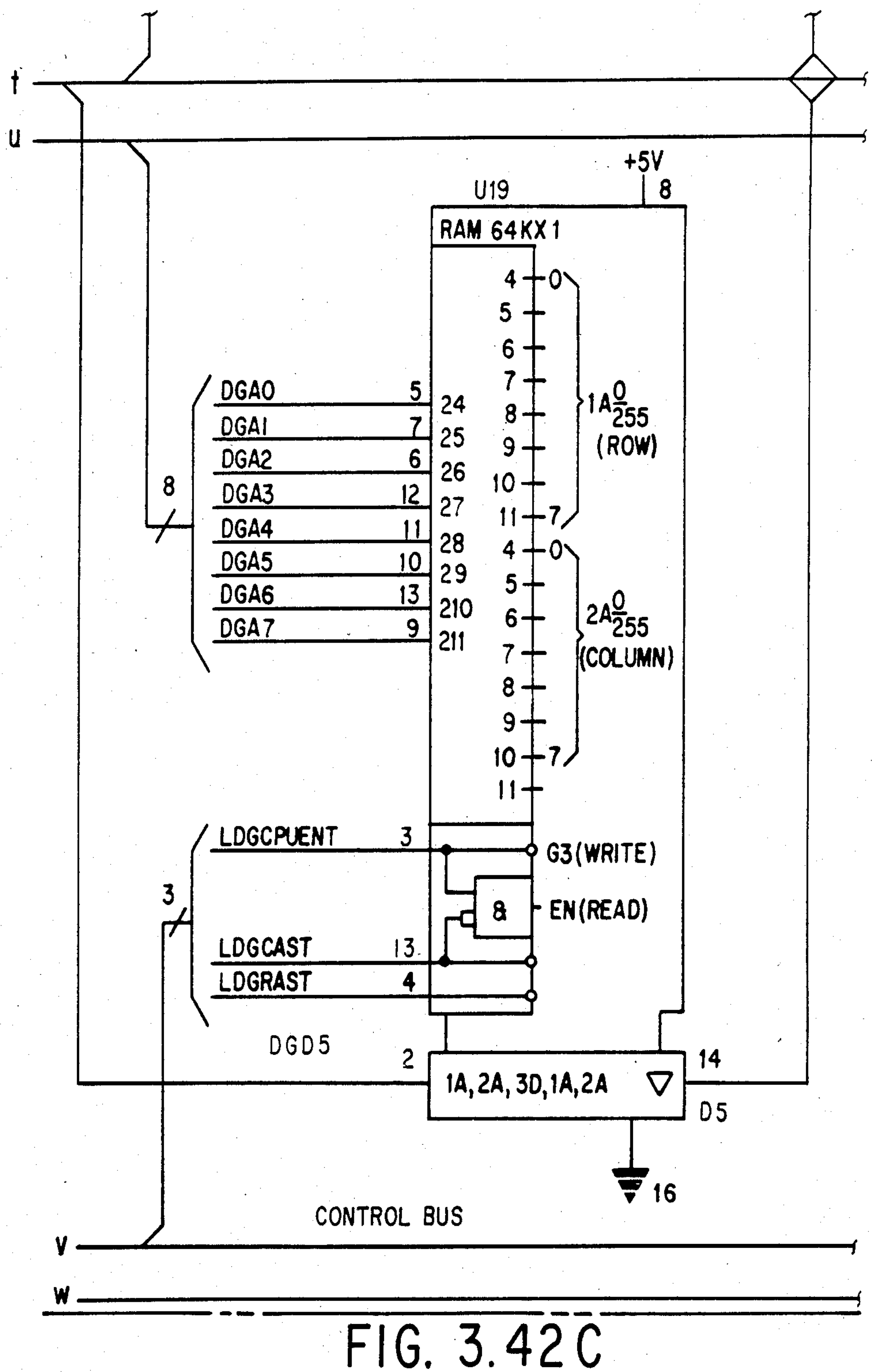
FIG. 3.42C

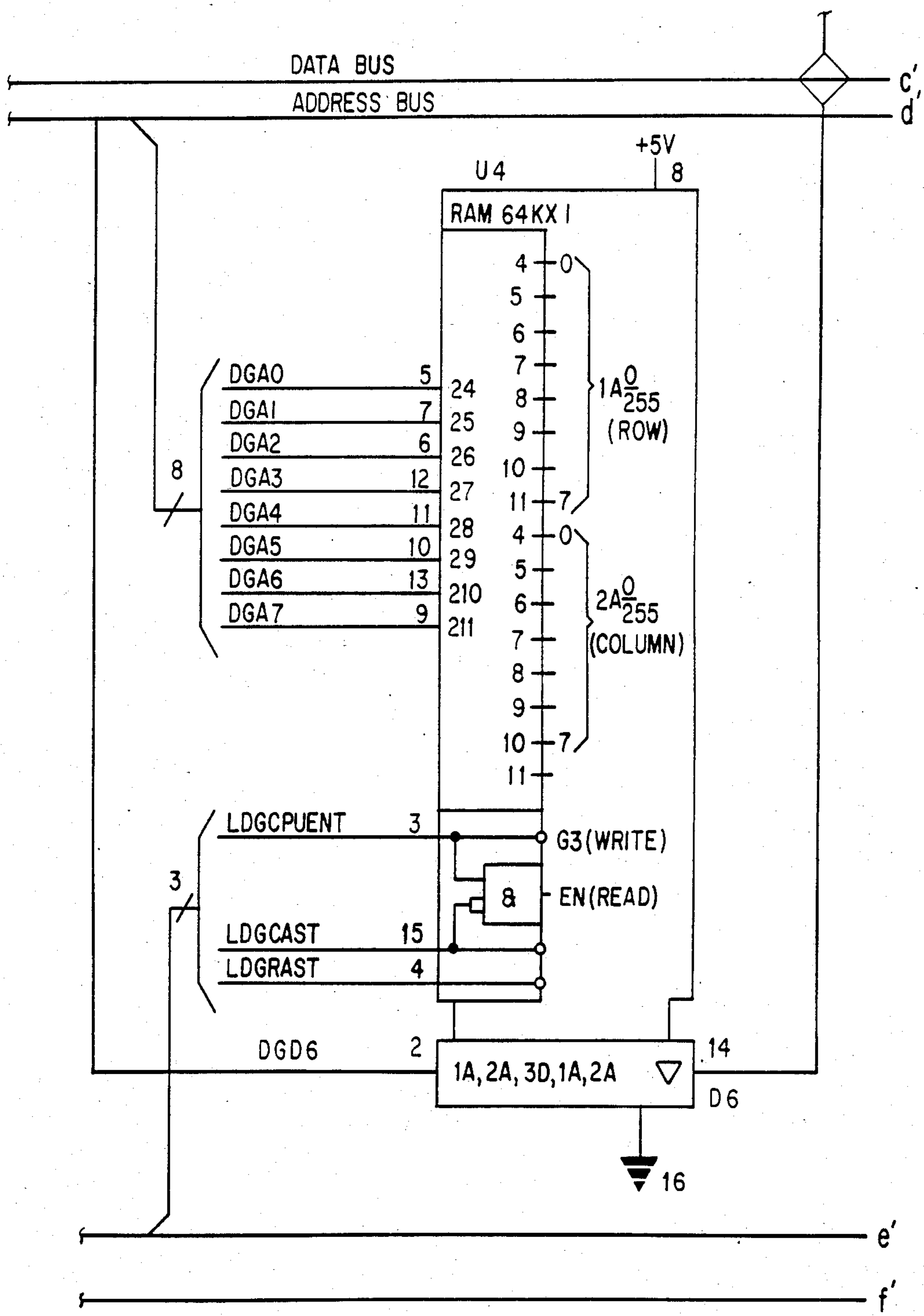
FIG. 3.42D

FIG. 3.43A
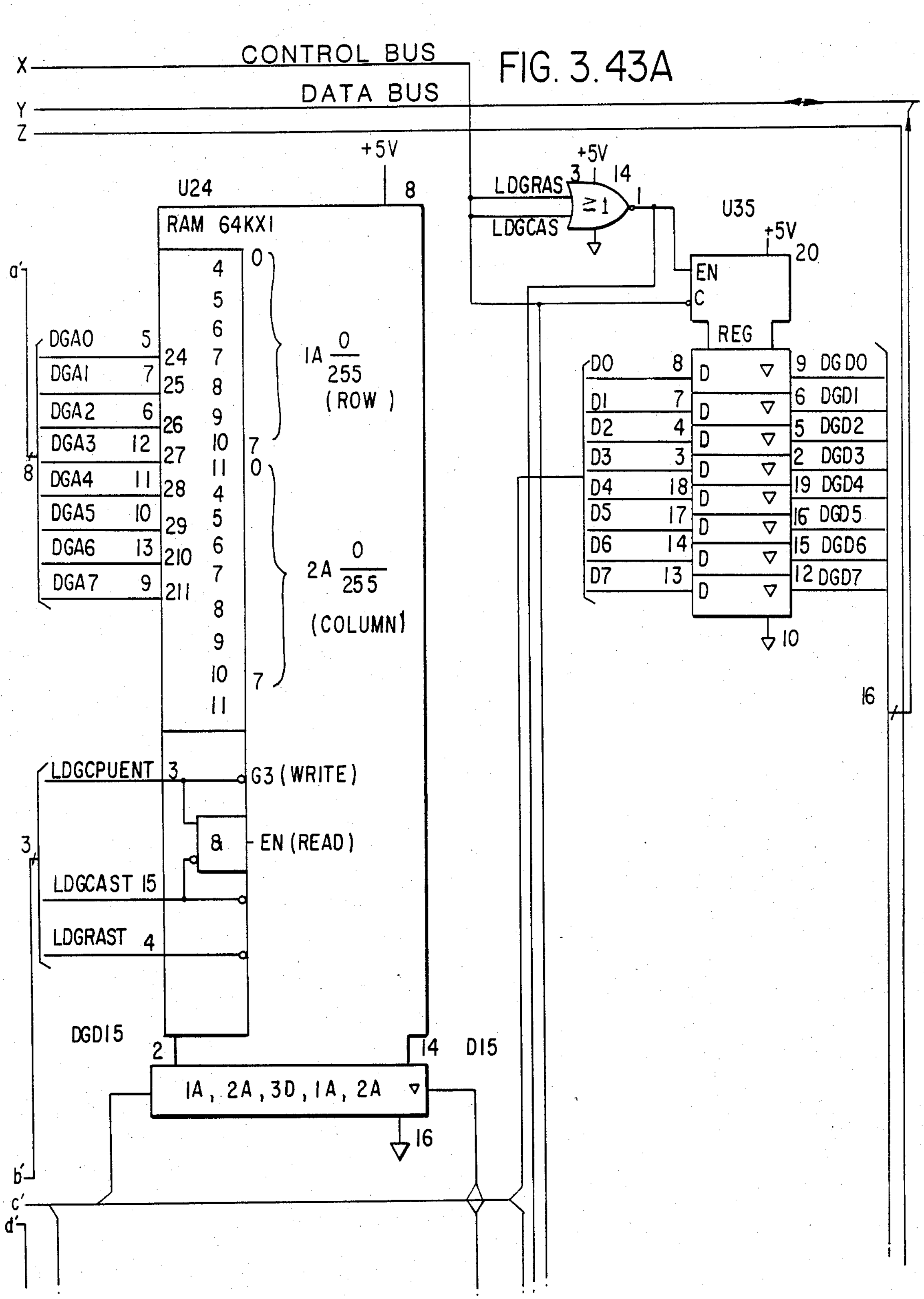

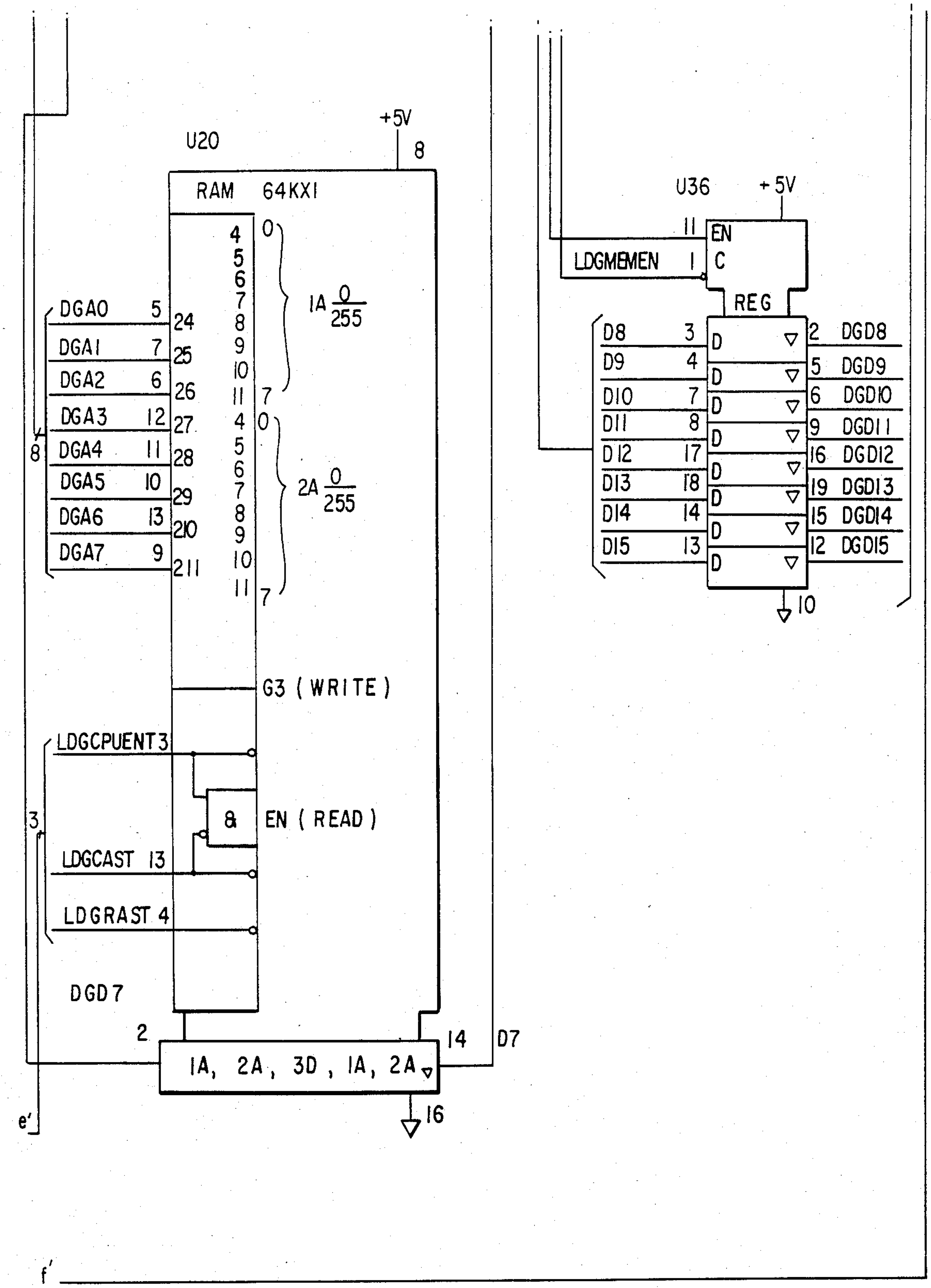
FIG. 3.43B

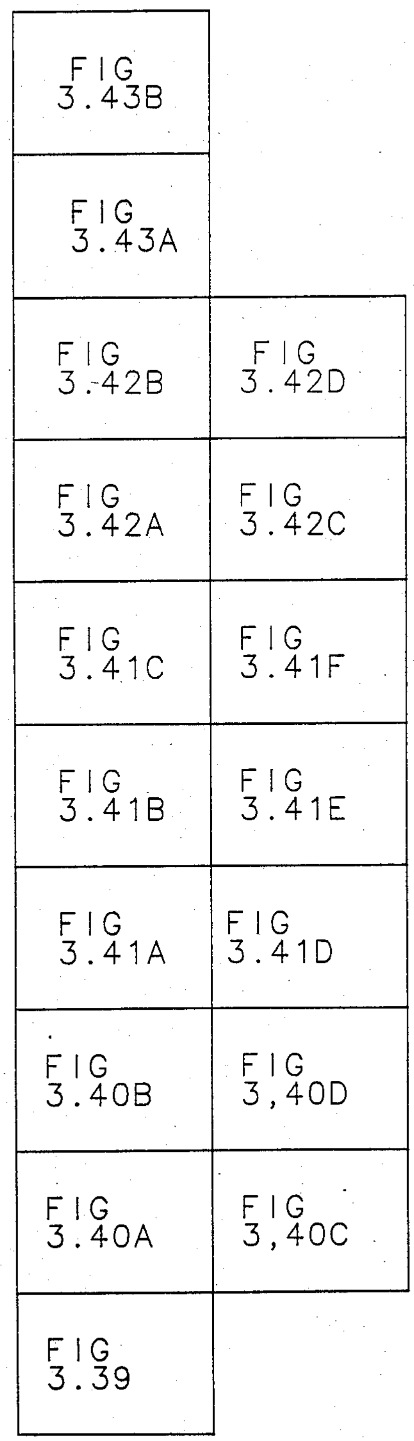
FIG 3.44
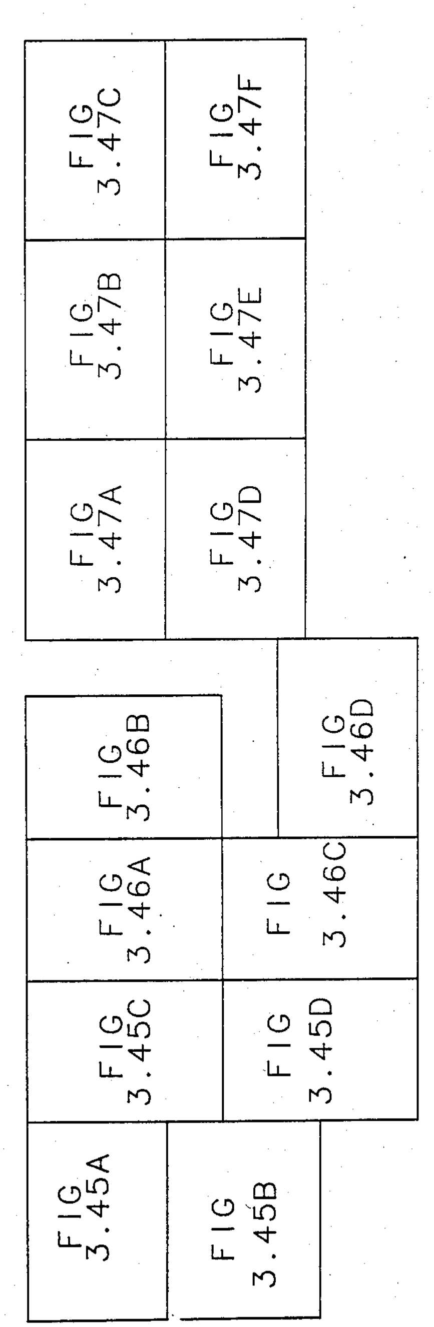
FIG 3.48

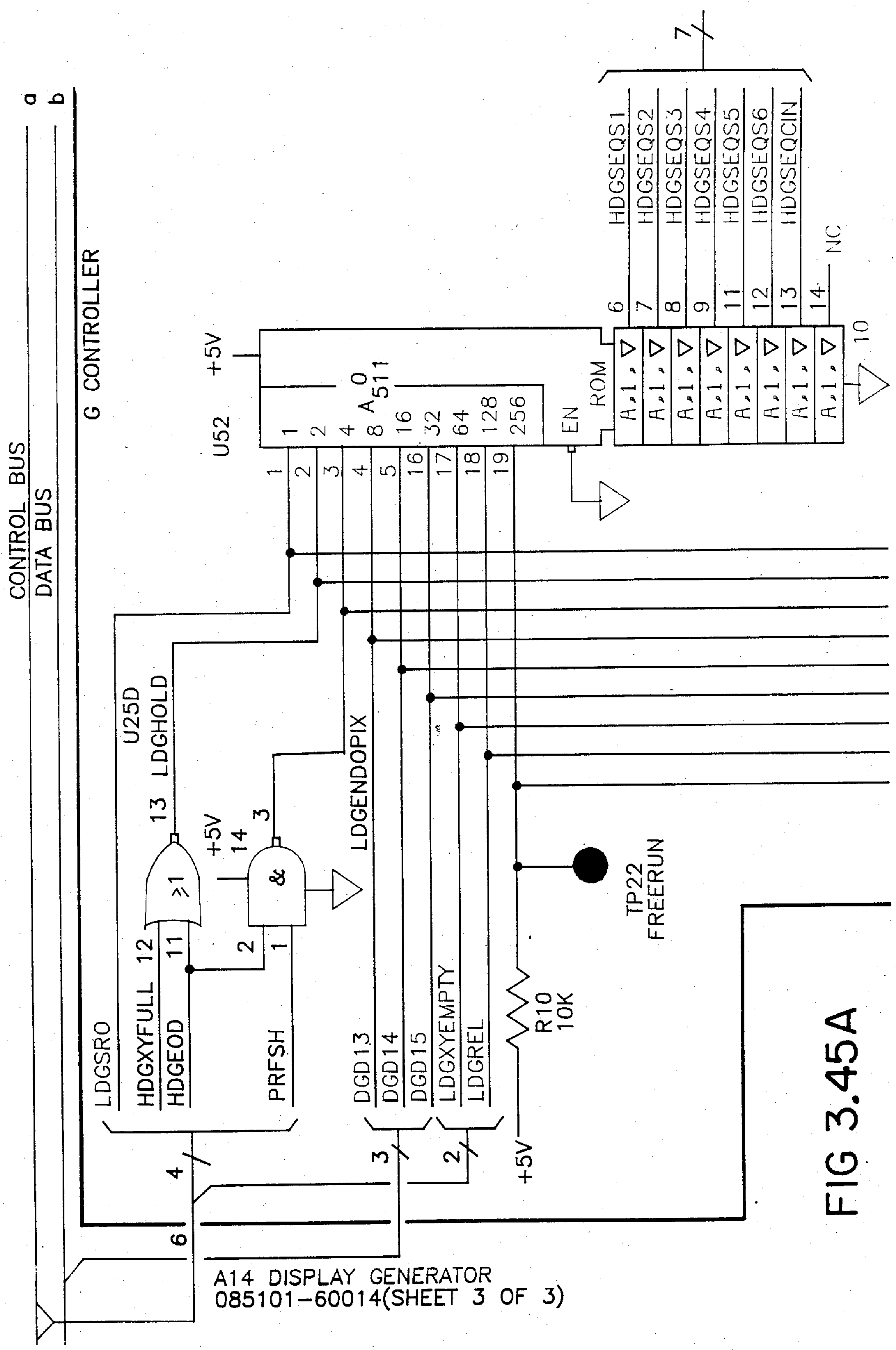
FIG 3.45A

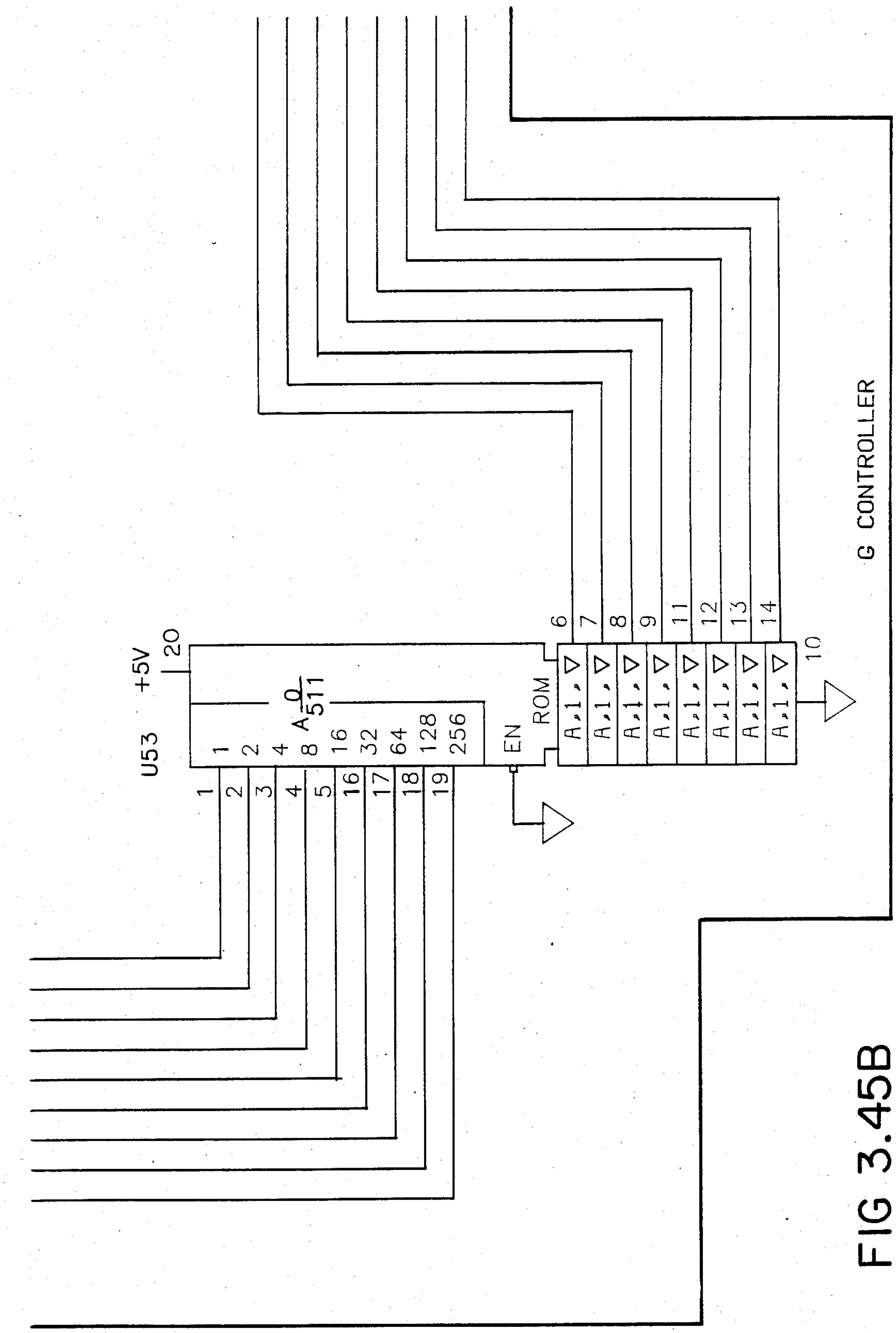
FIG 3.45B

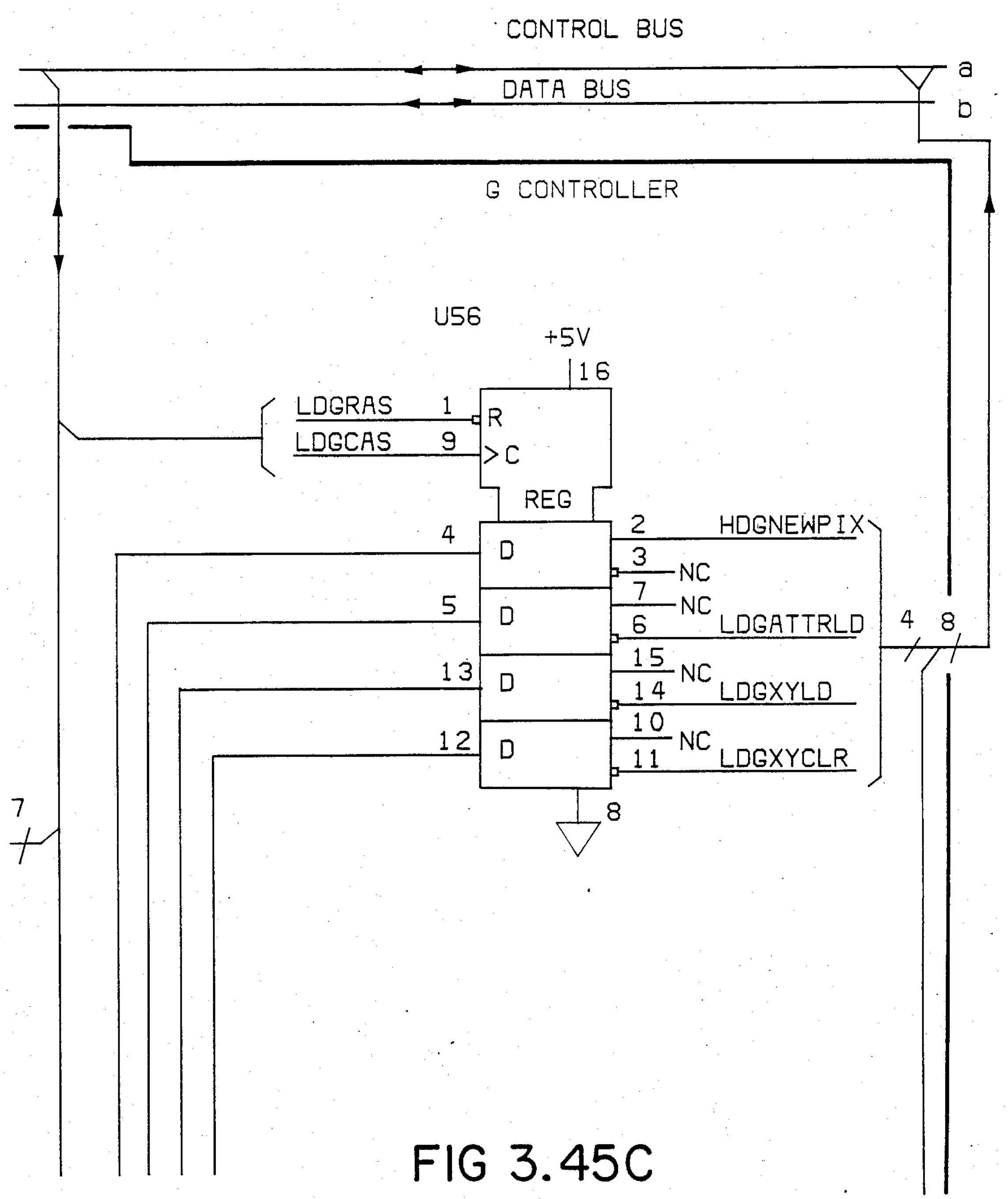
FIG 3.45C

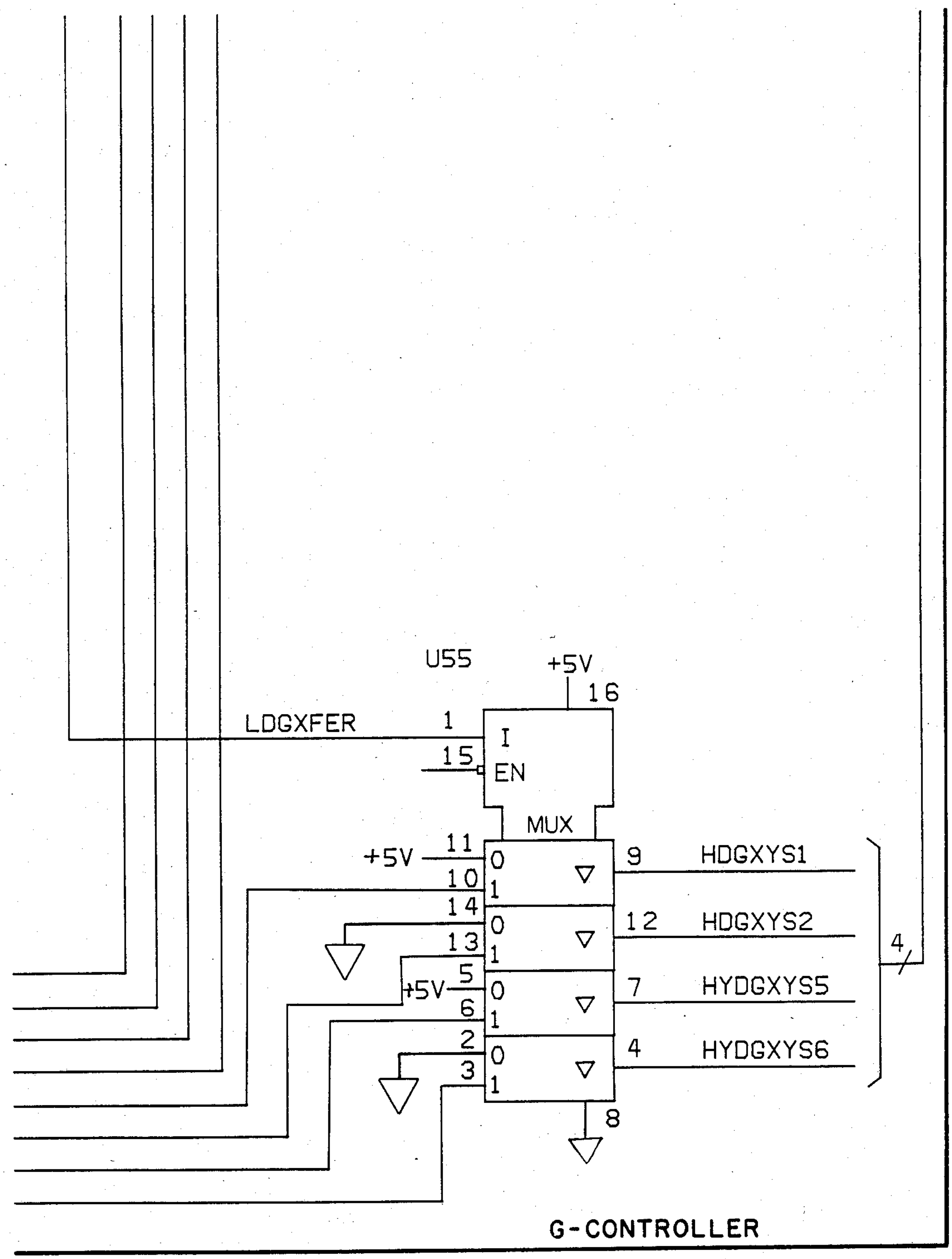
FIG 3.45D

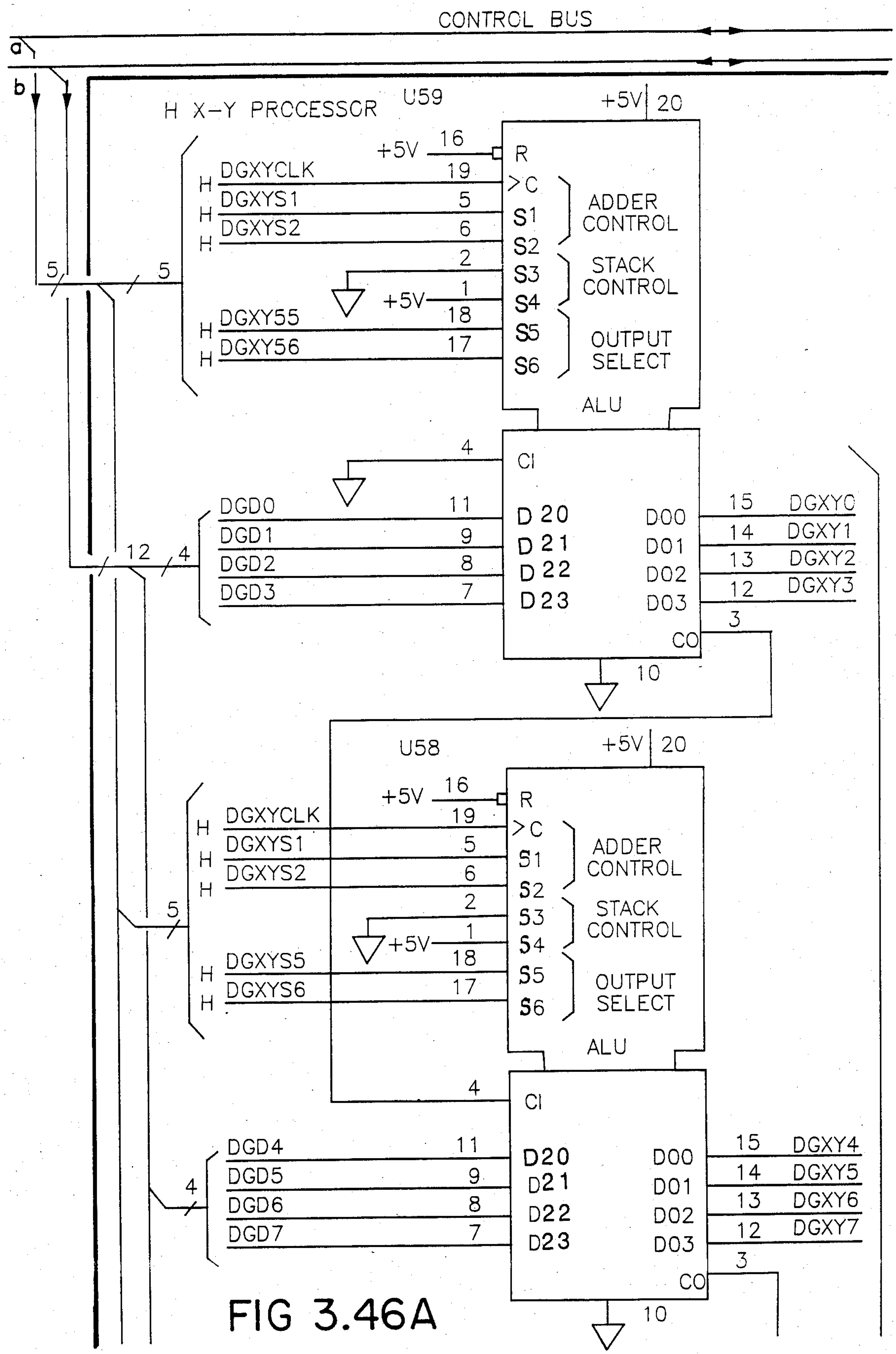
FIG 3.46A

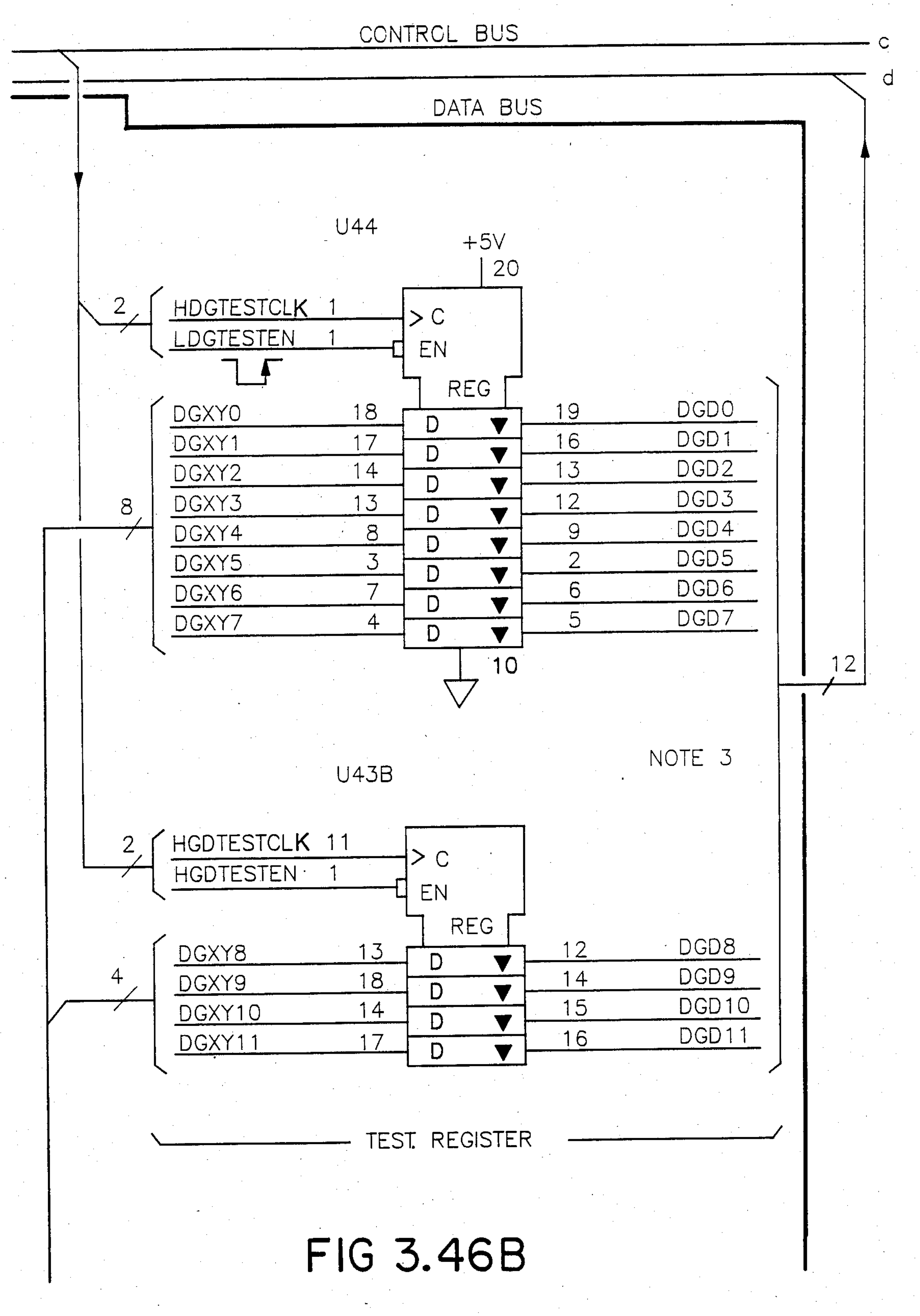
FIG 3.46B

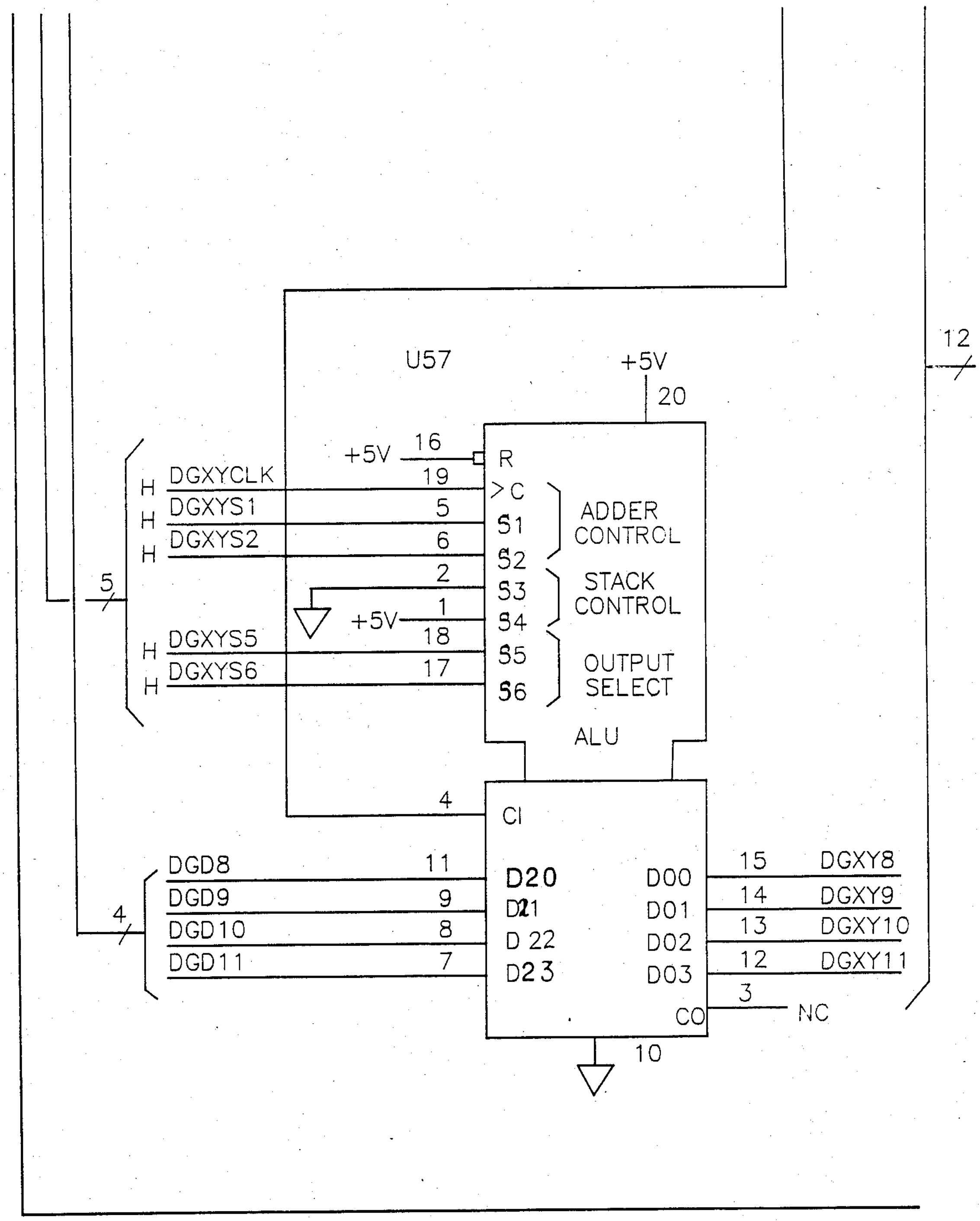
FIG 3.46C

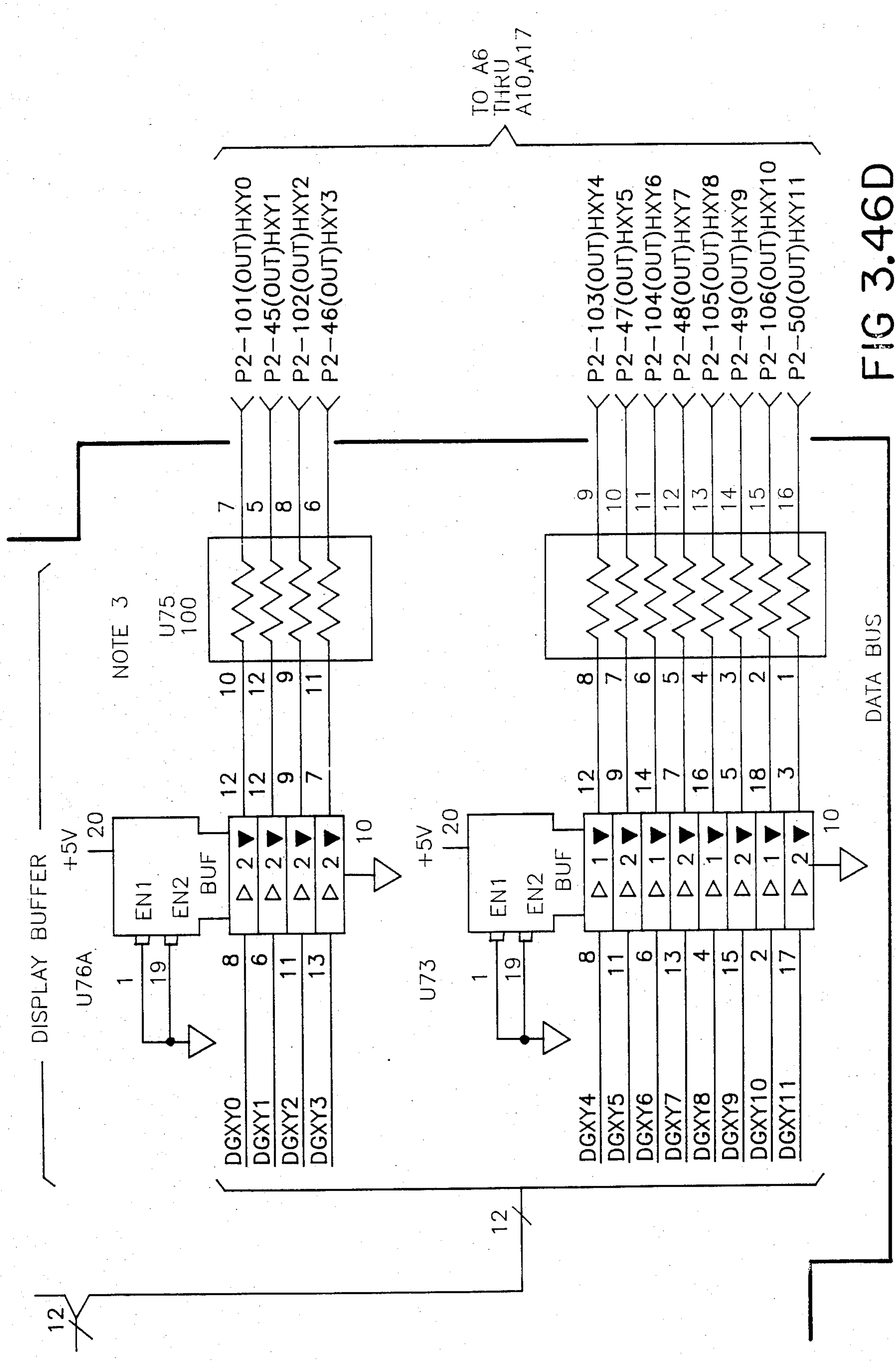
FIG 3.46D

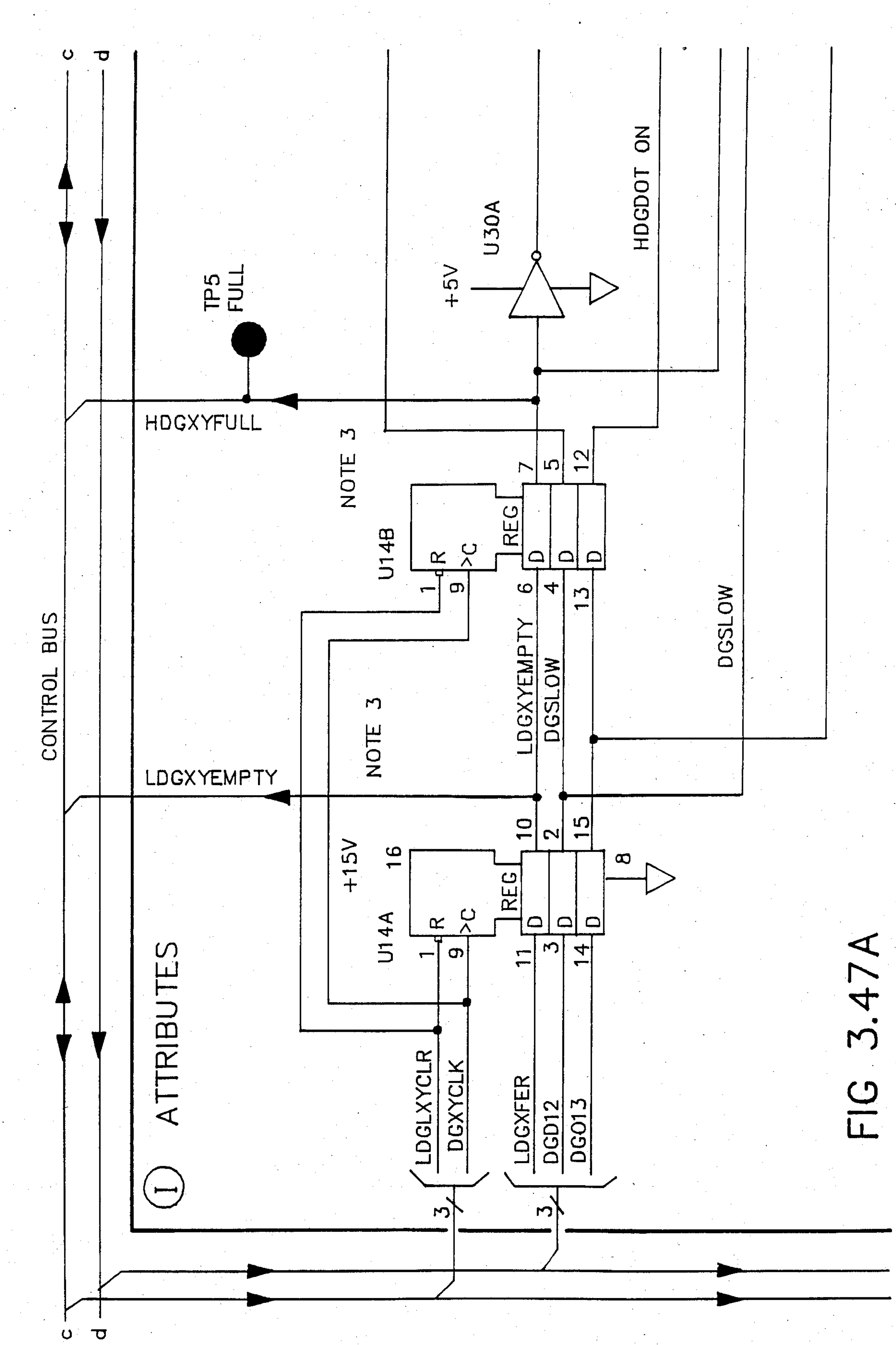
FIG 3.47A

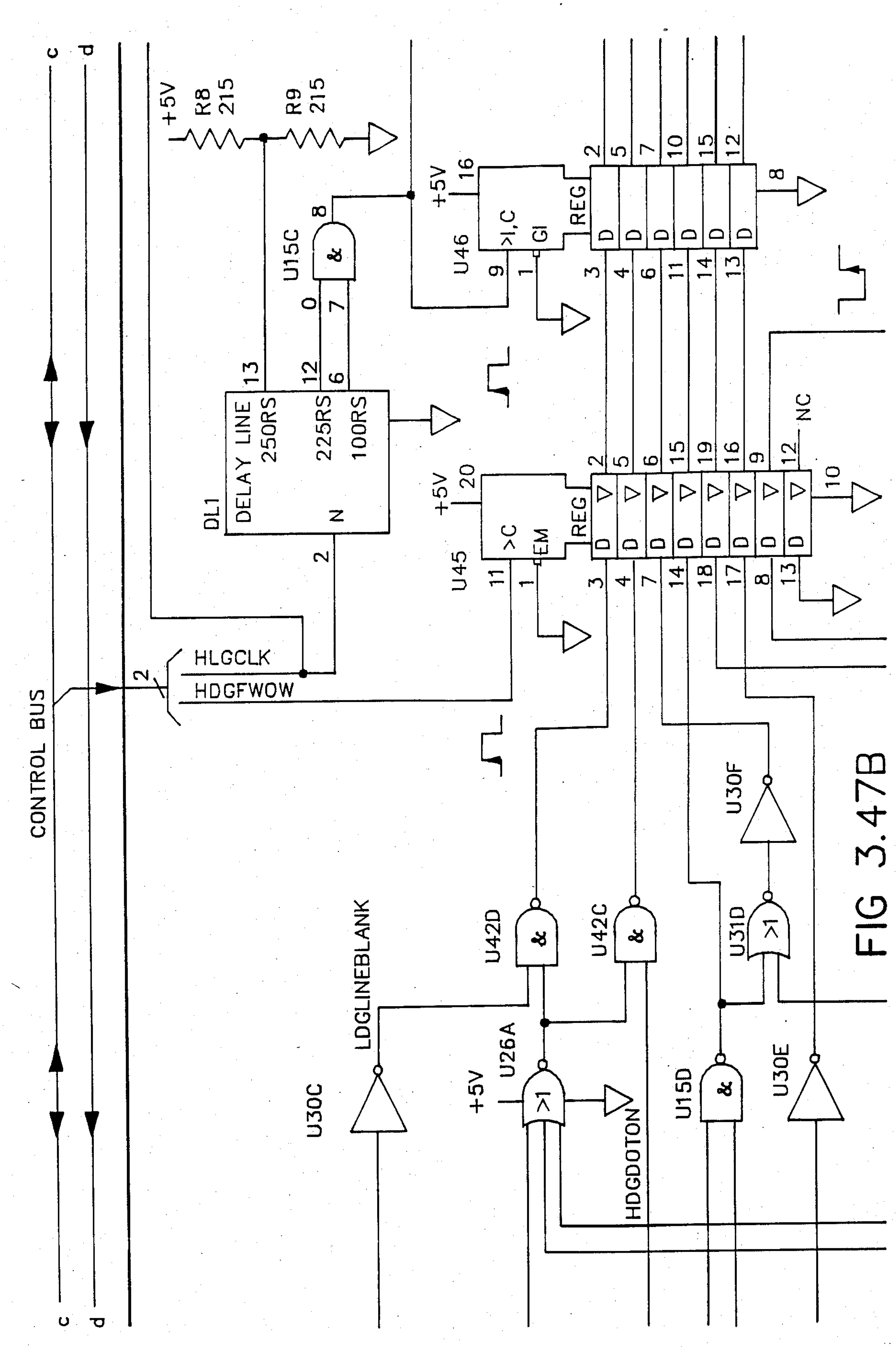
FIG 3.47B

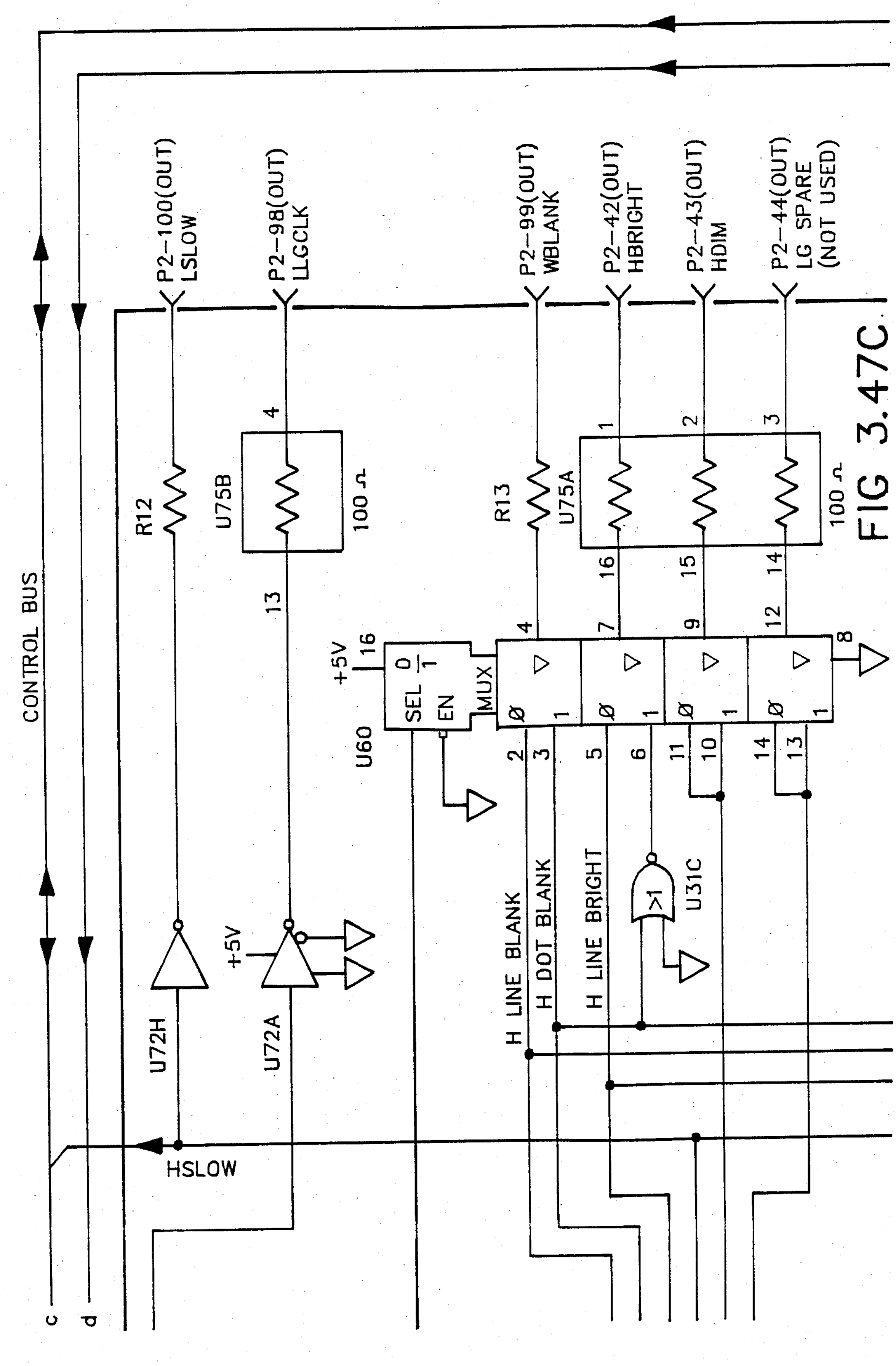
FIG 3.47C

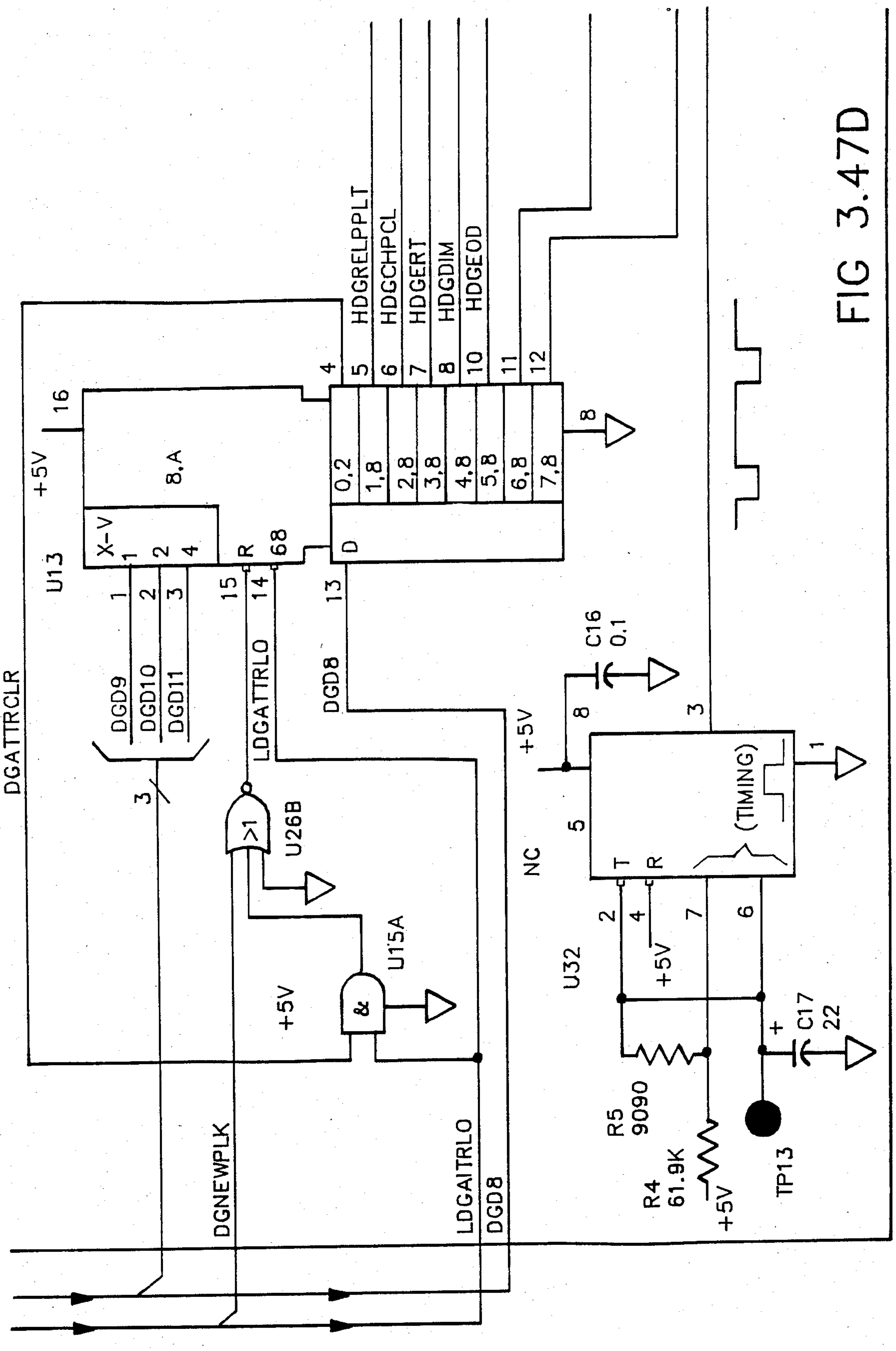
FIG 3.47D

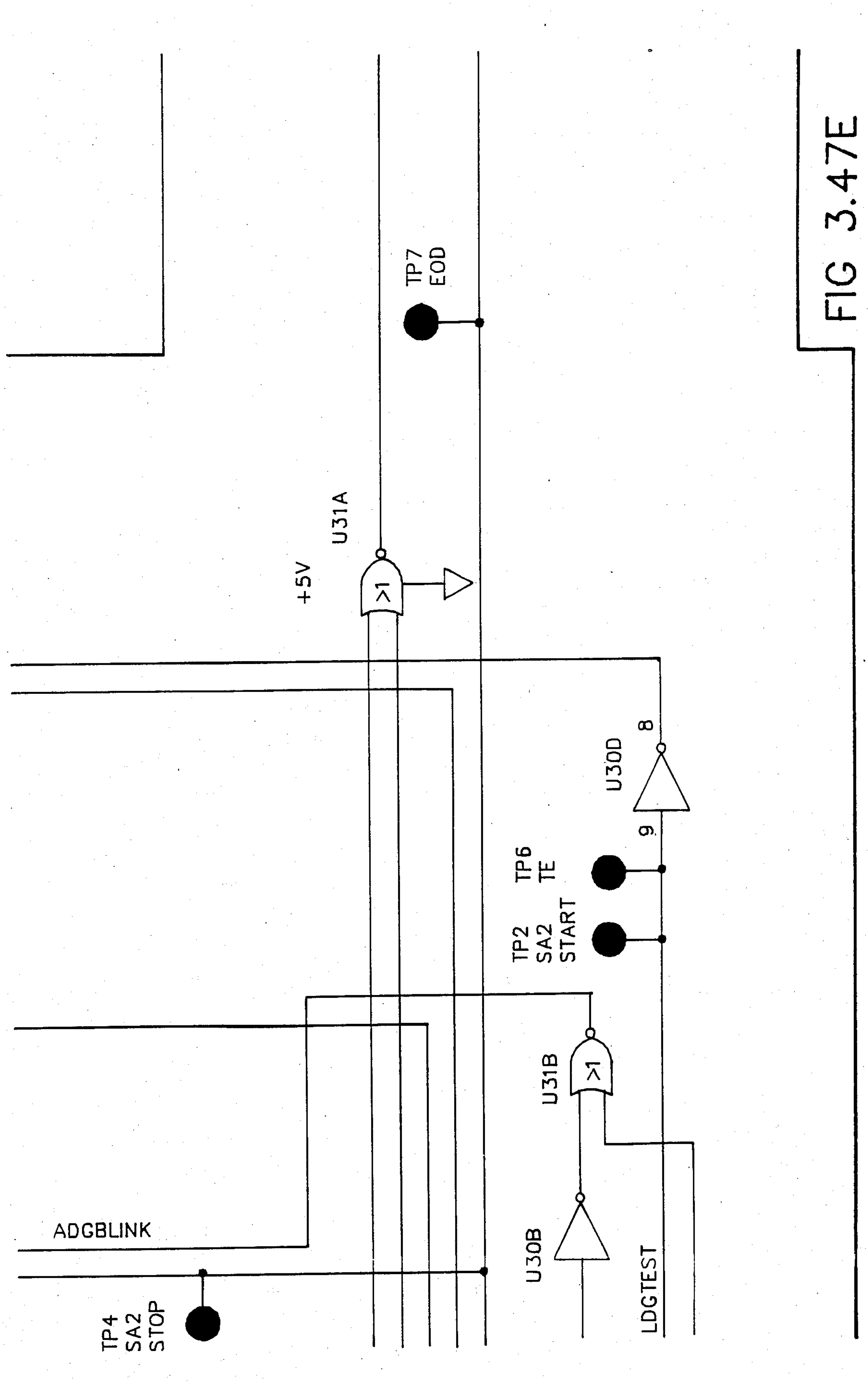
FIG 3.47E

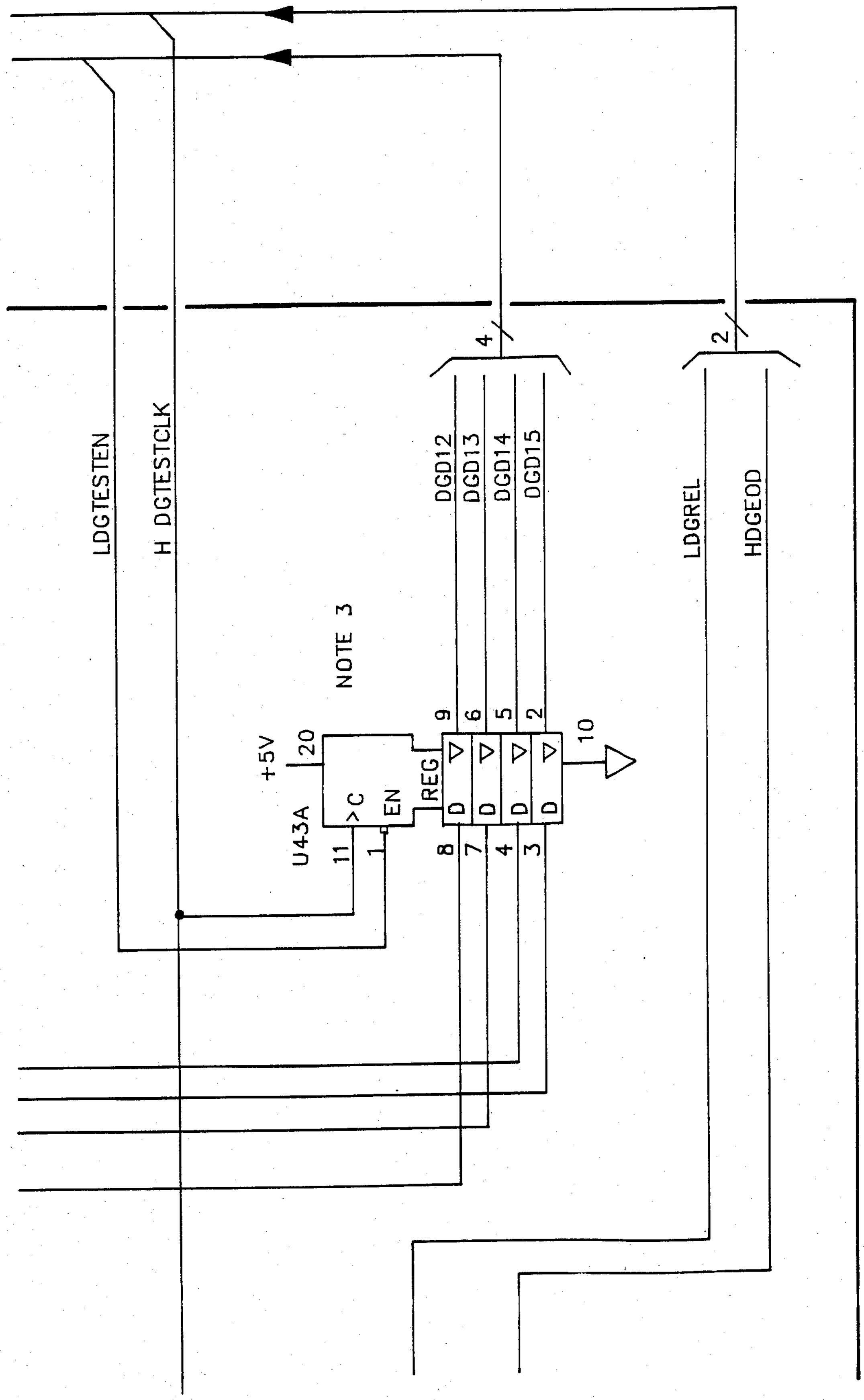
FIG 3.47F

A15 I.O BOARD
085101-60015
(SHEET 1 OF 2)
FIG. 3.49
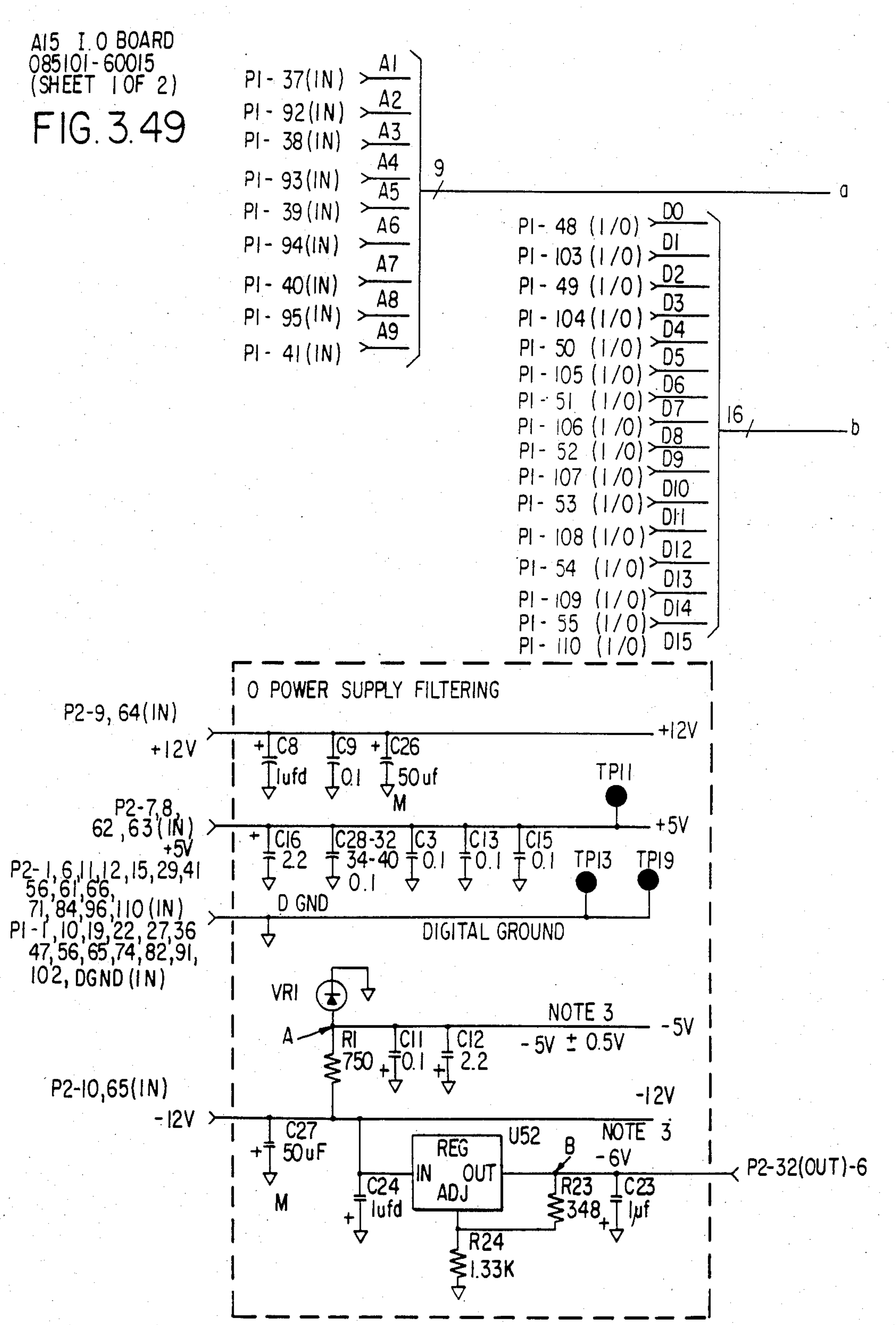

FIG 3.50A
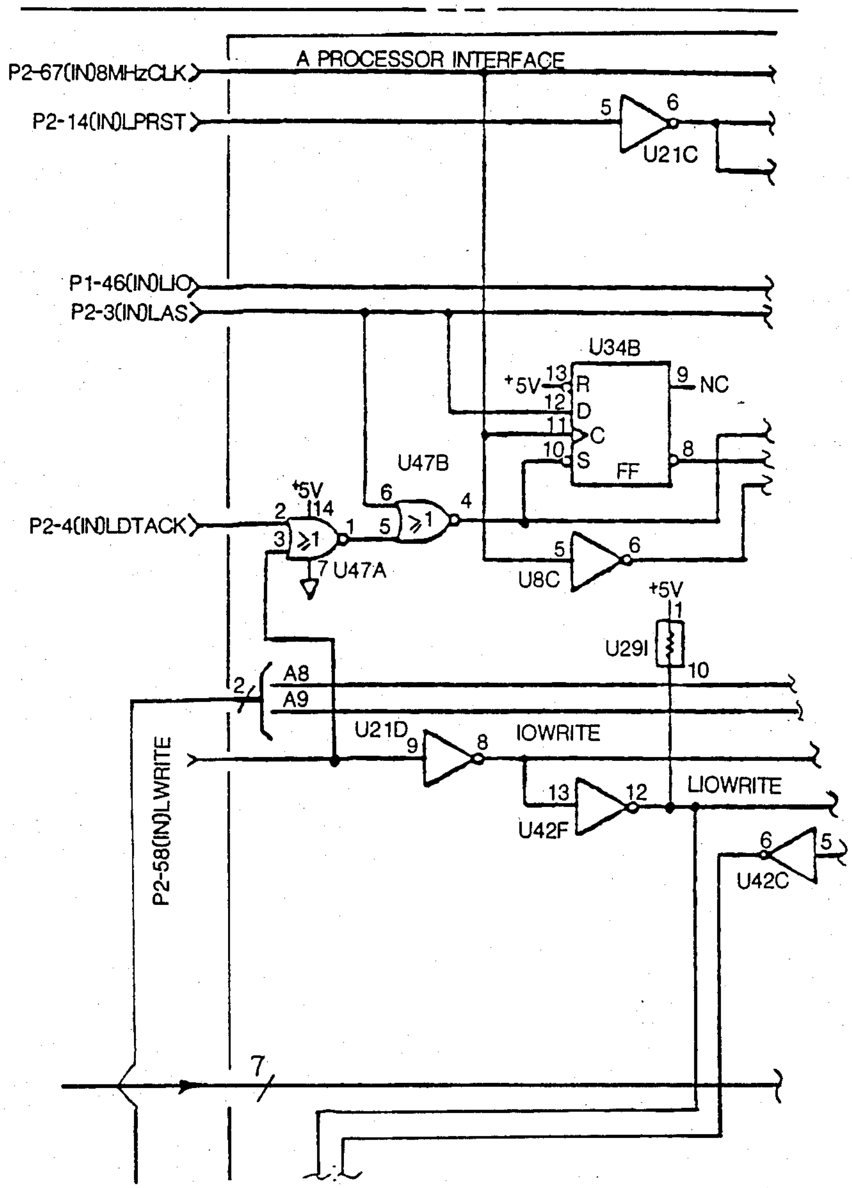

FIG 3.50B
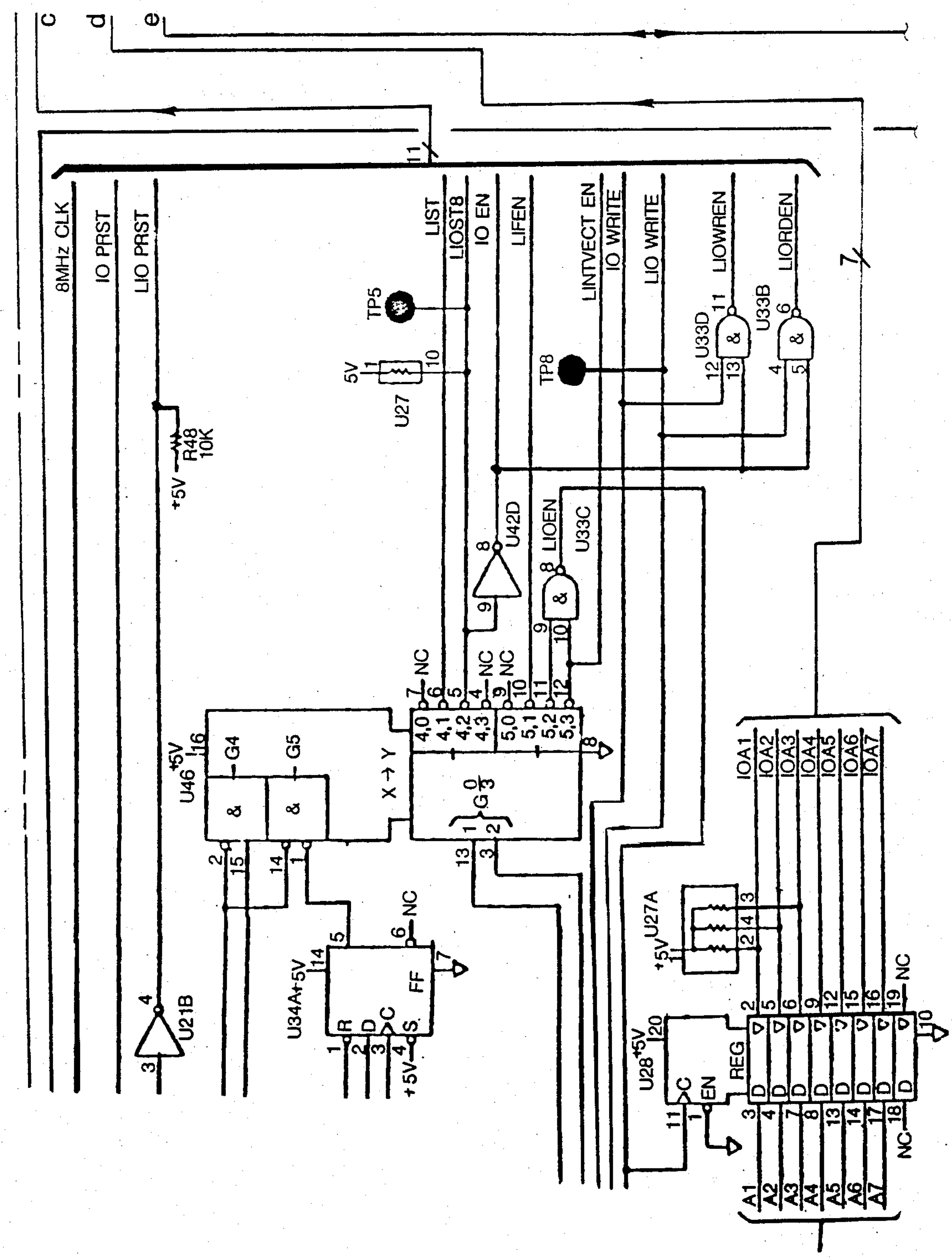

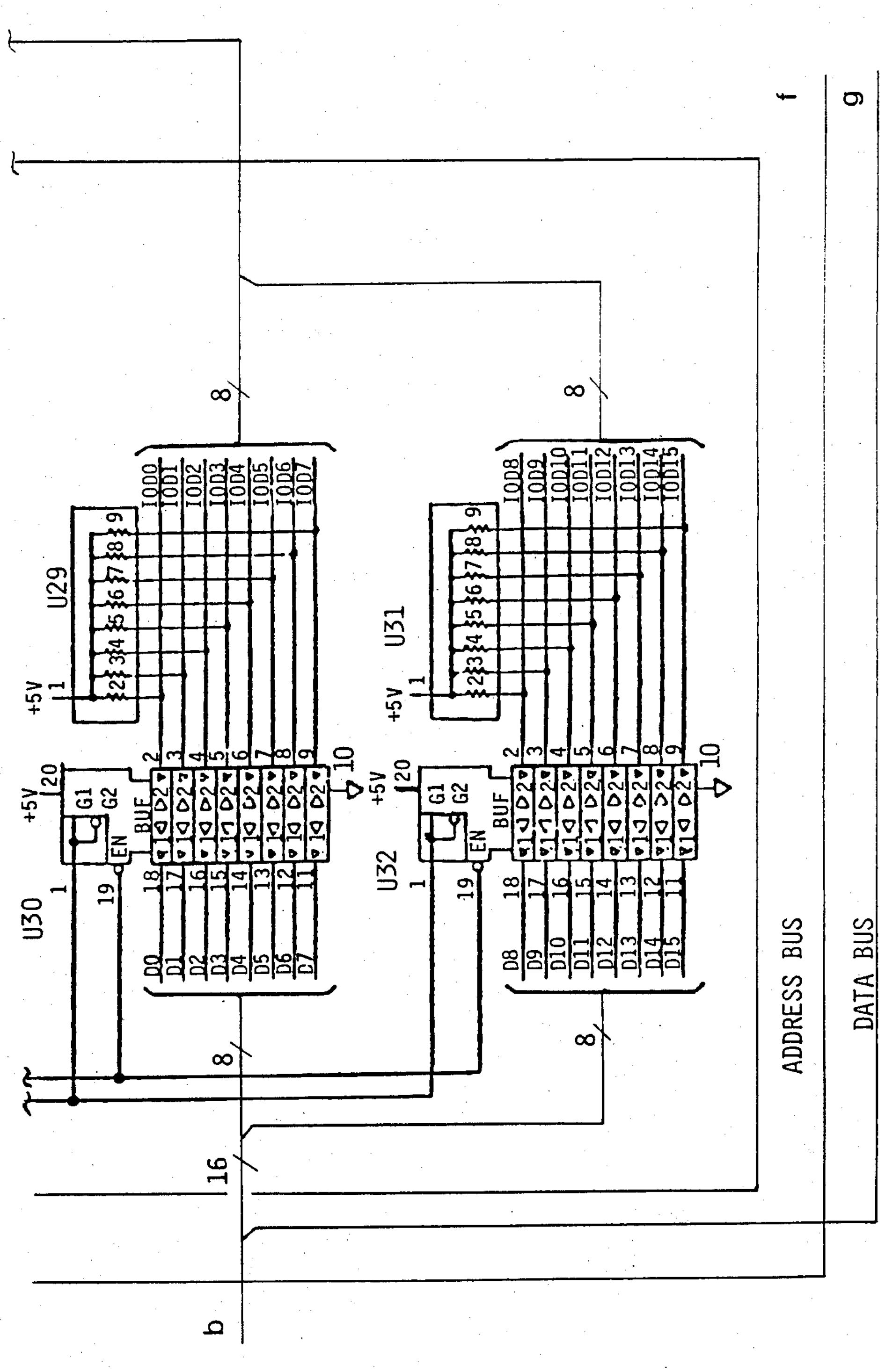
FIG 3.50C

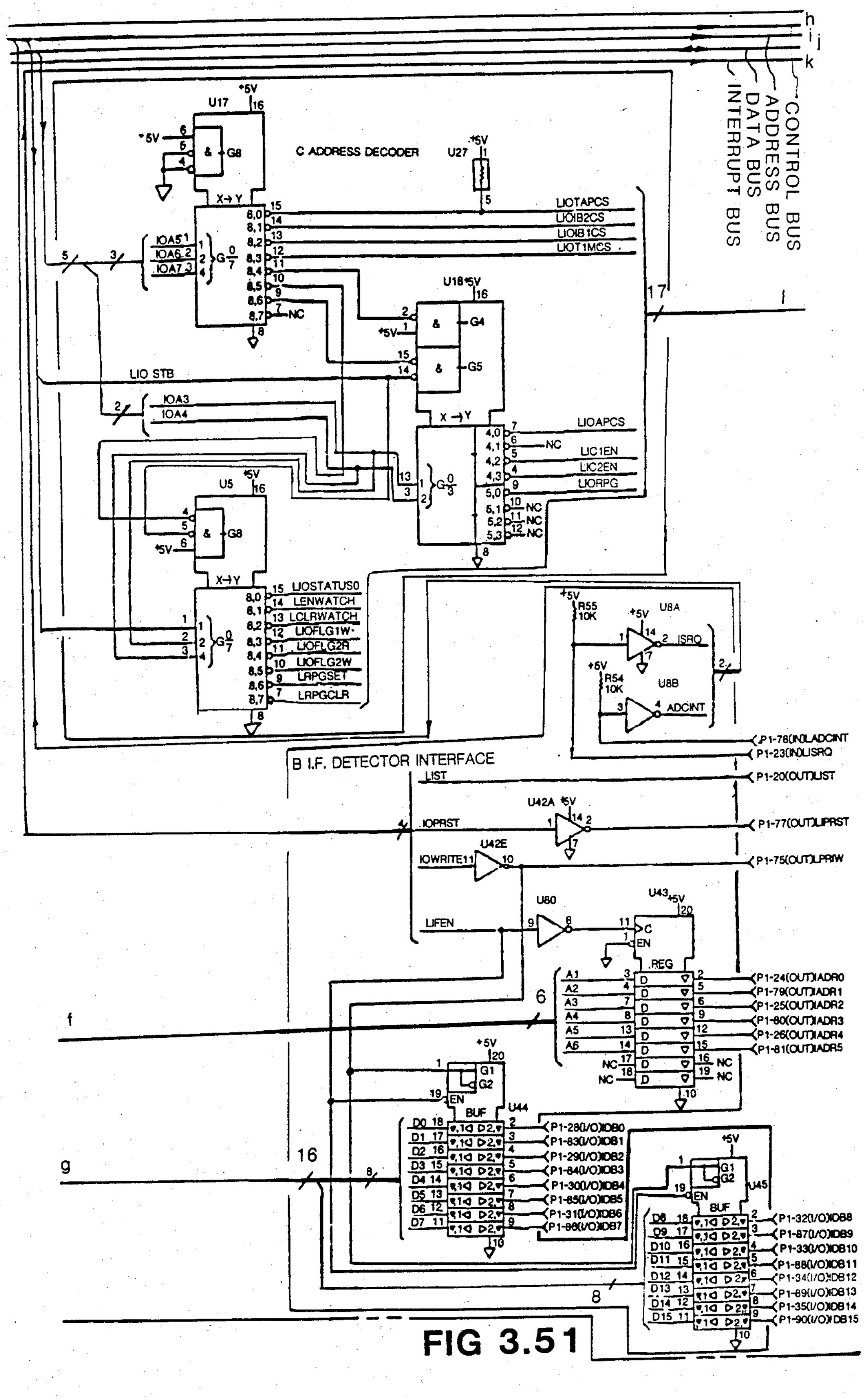
FIG 3.51

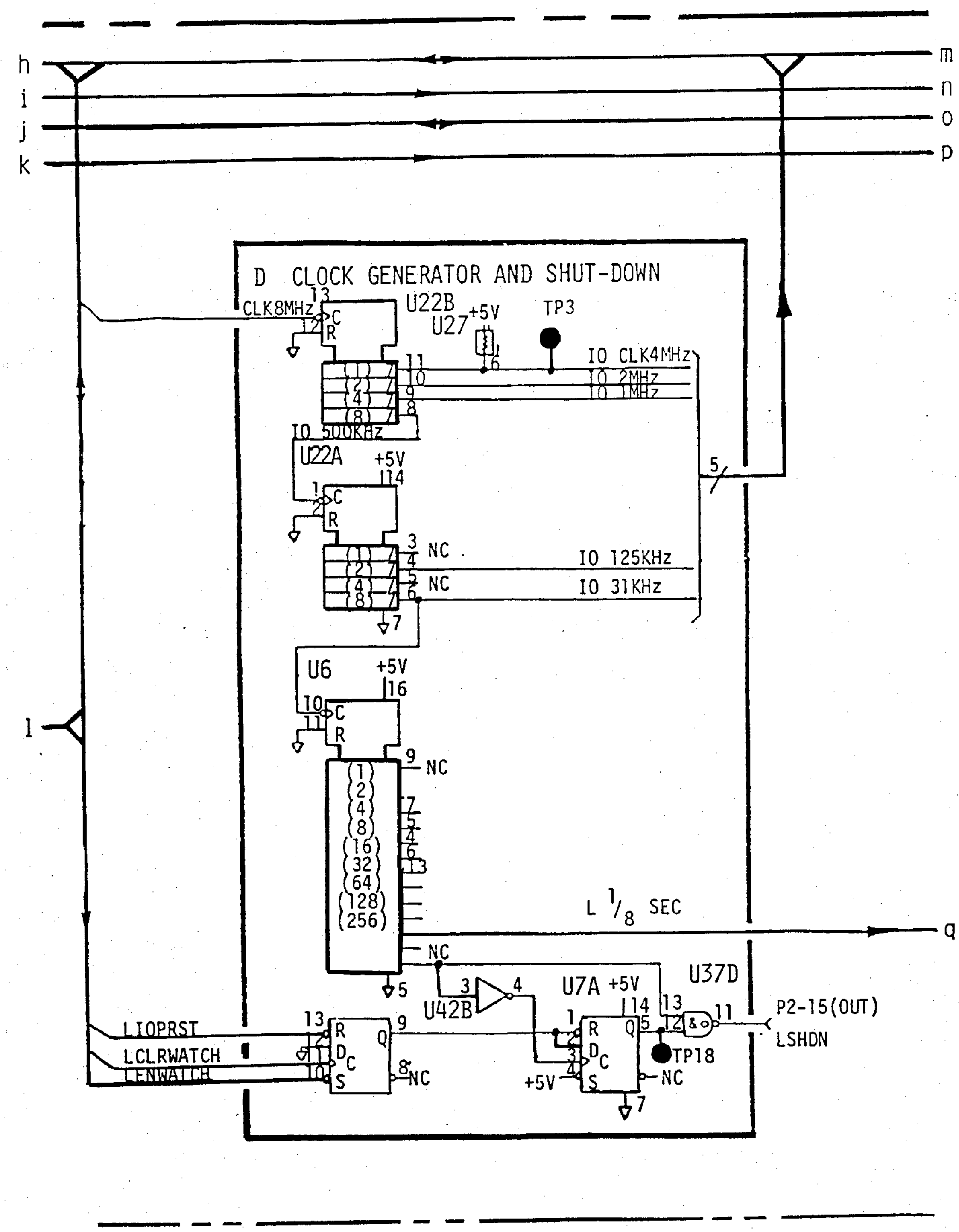
FIG 3.52

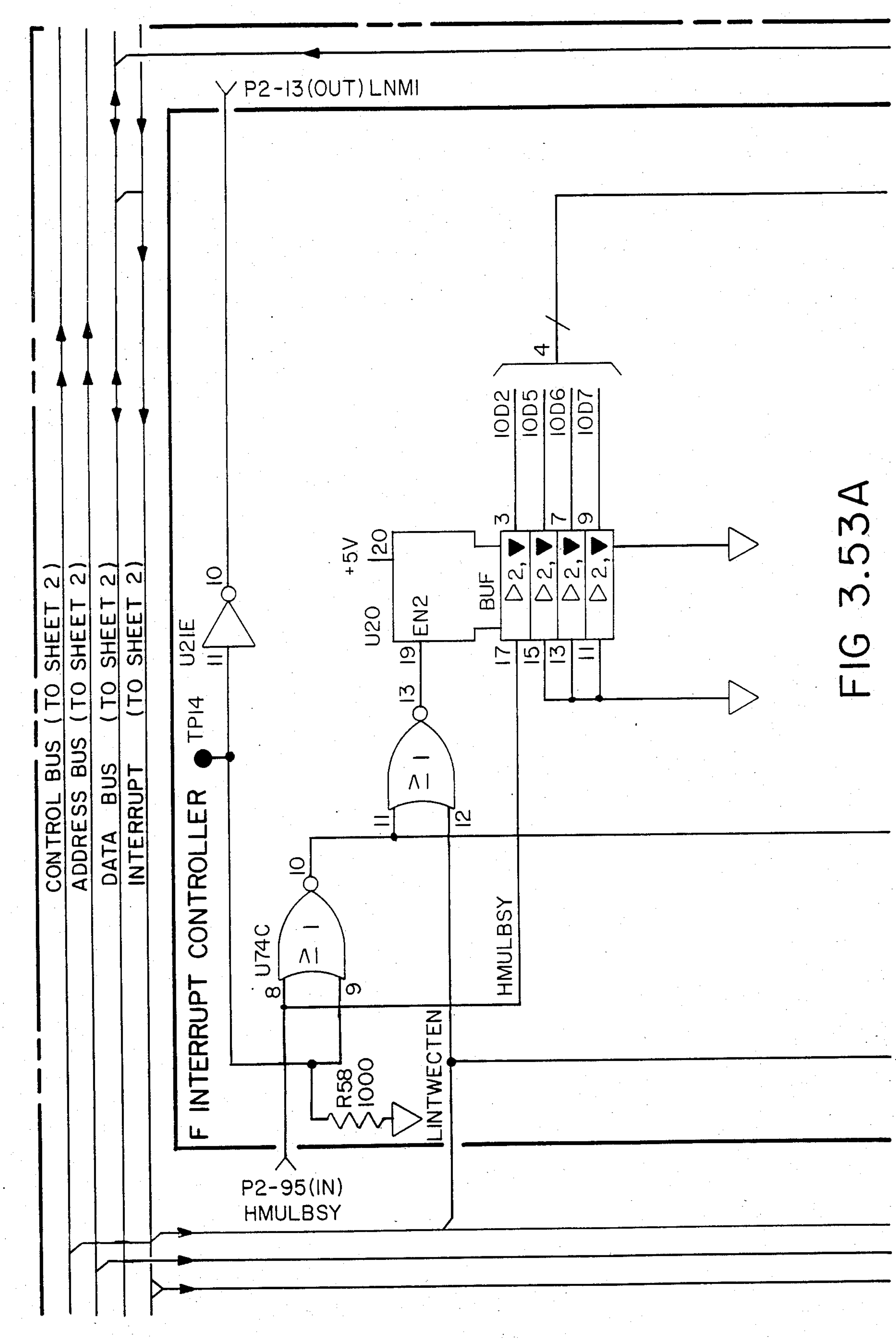
FIG 3.53A

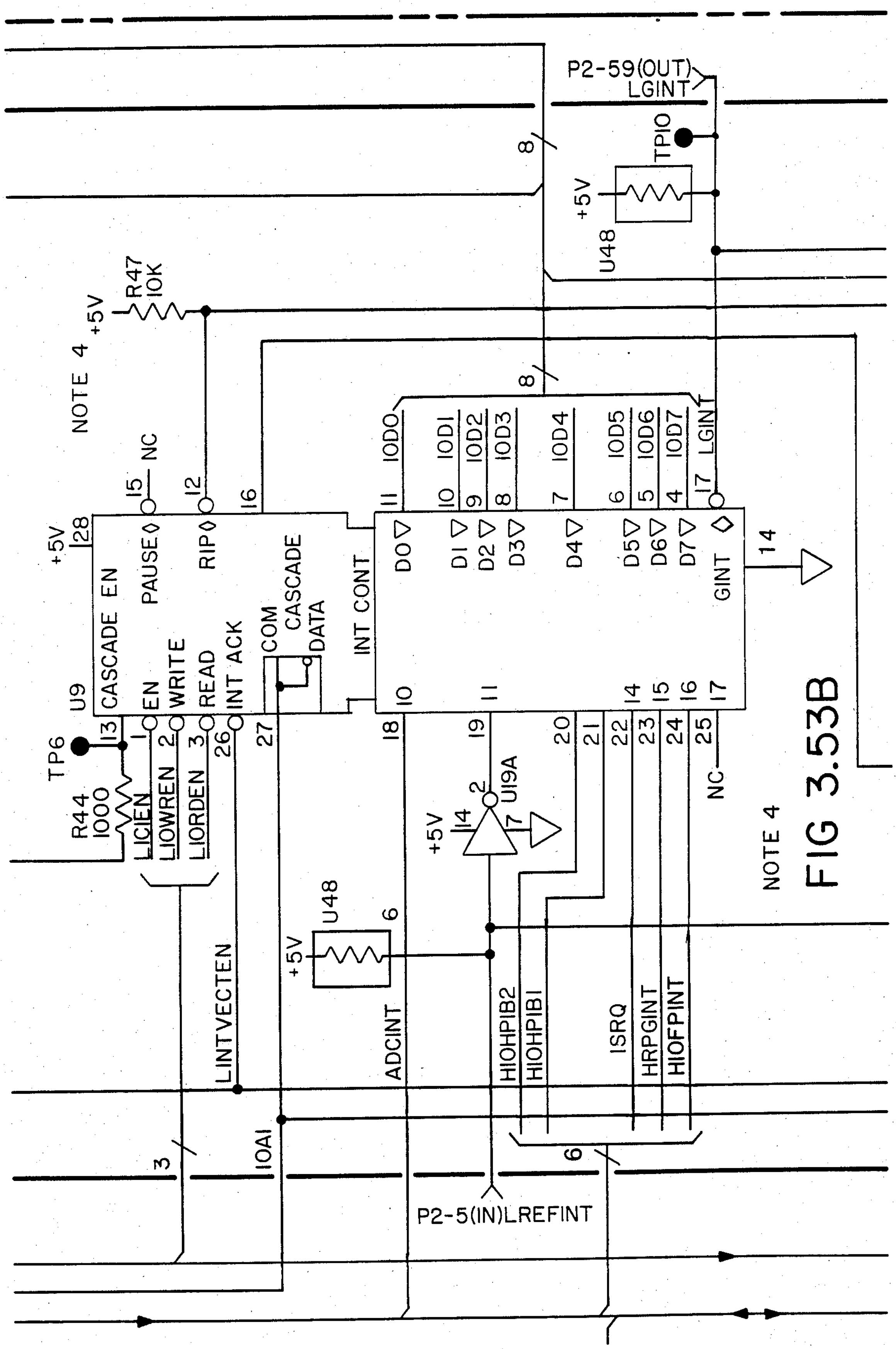
FIG 3.53B

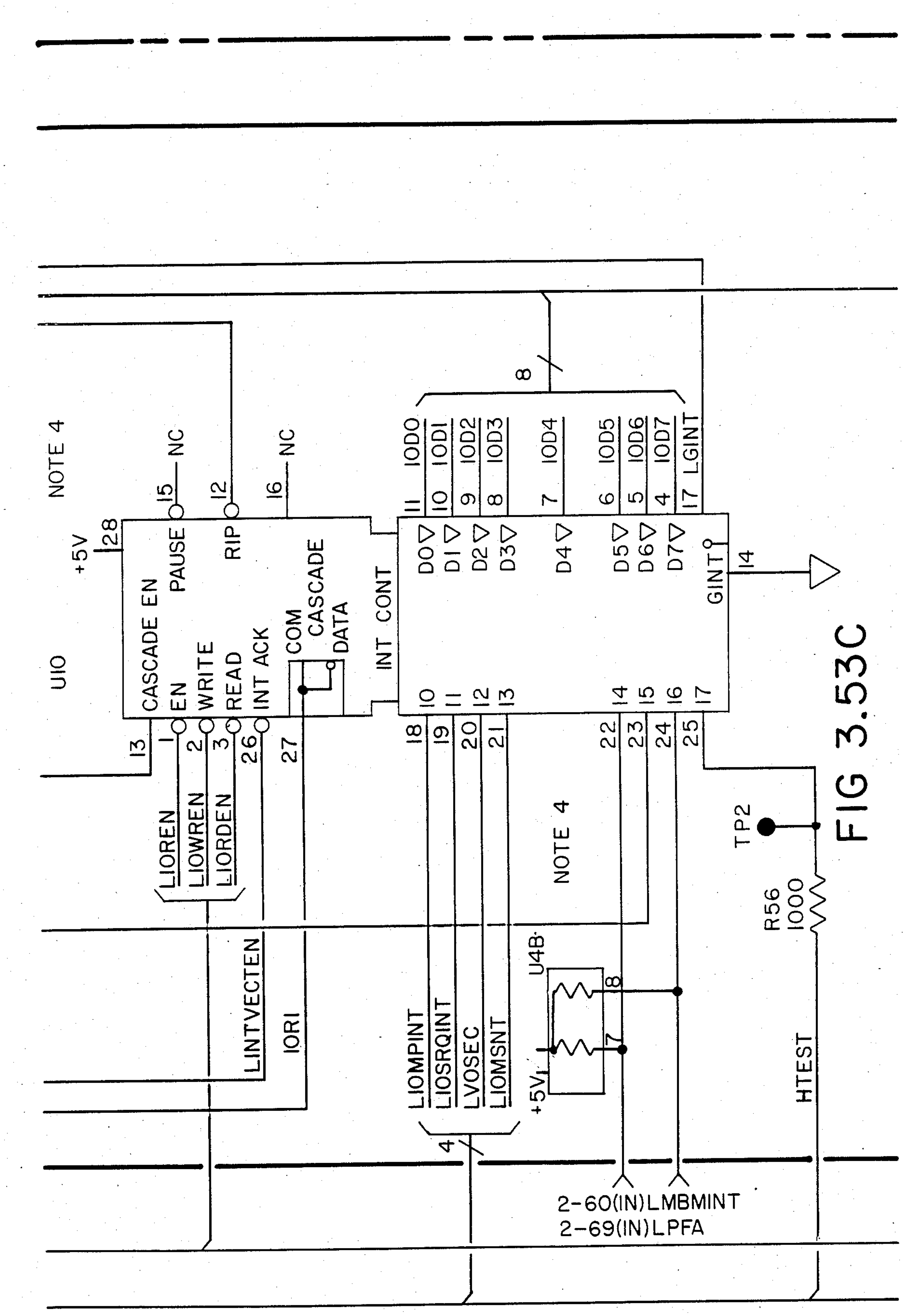
FIG 3.53C

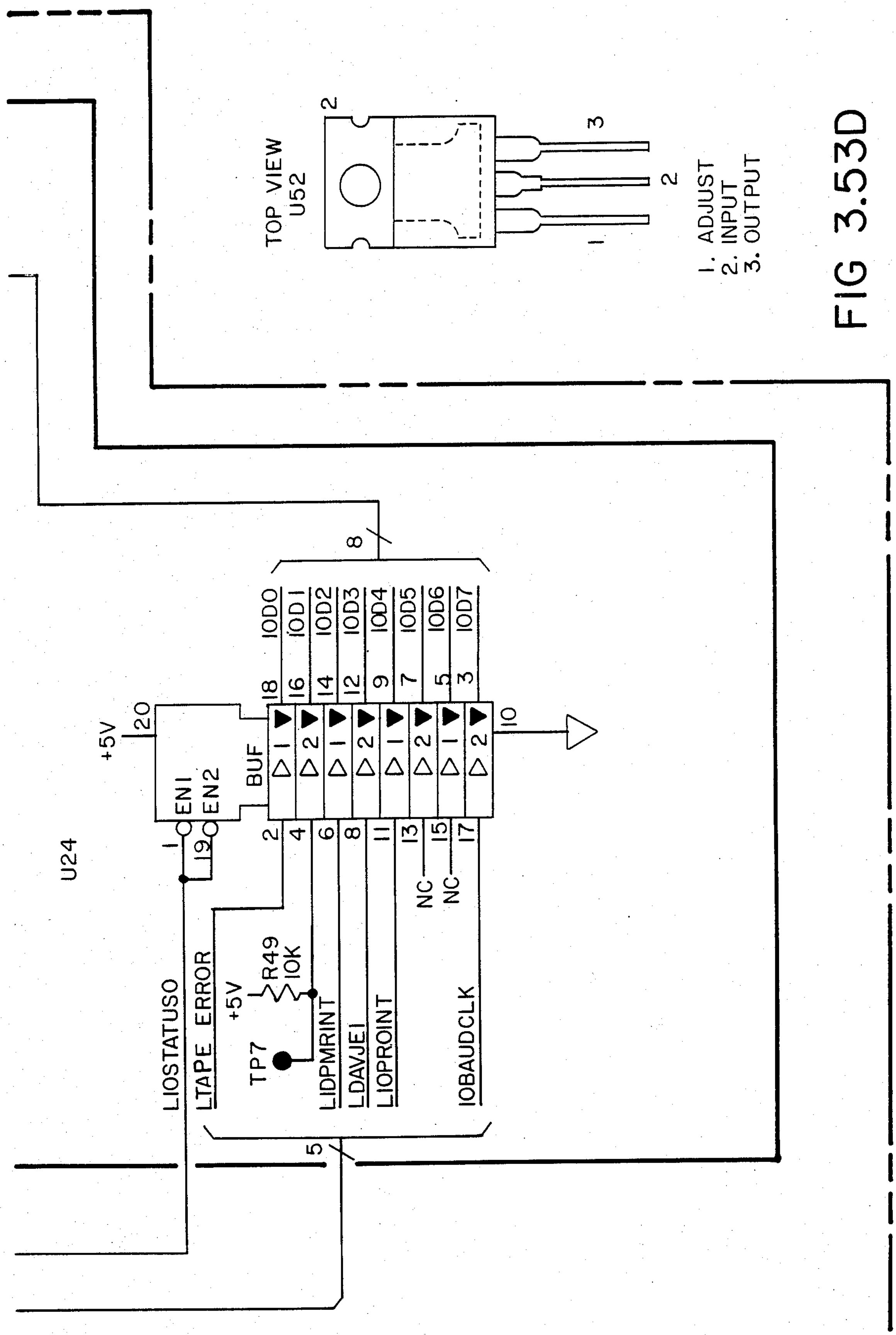
FIG 3.53D

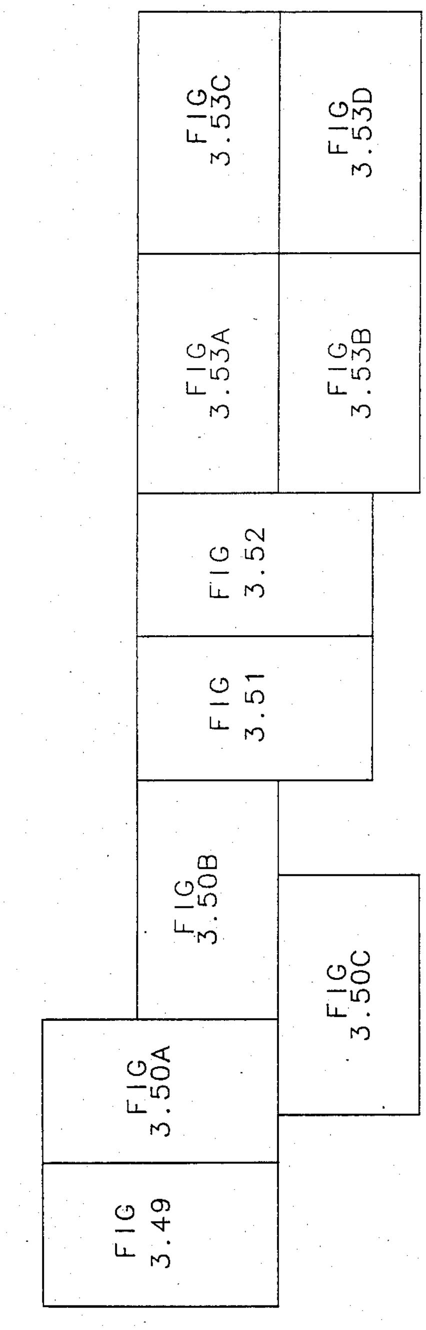
FIG 3.54
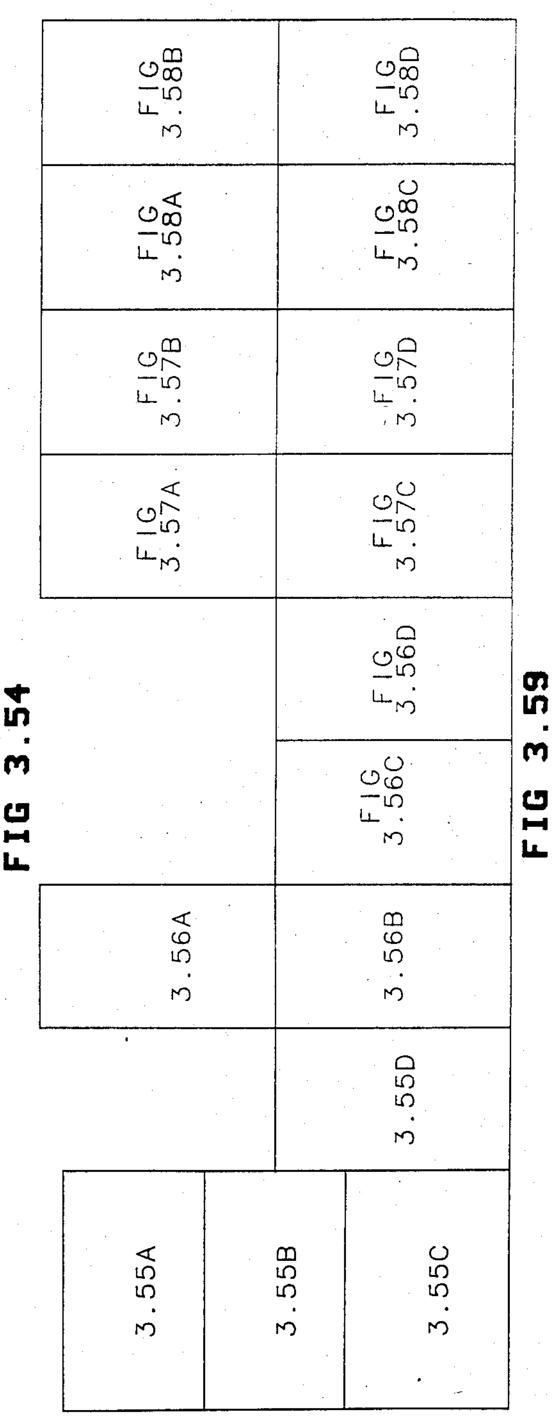
FIG 3.59

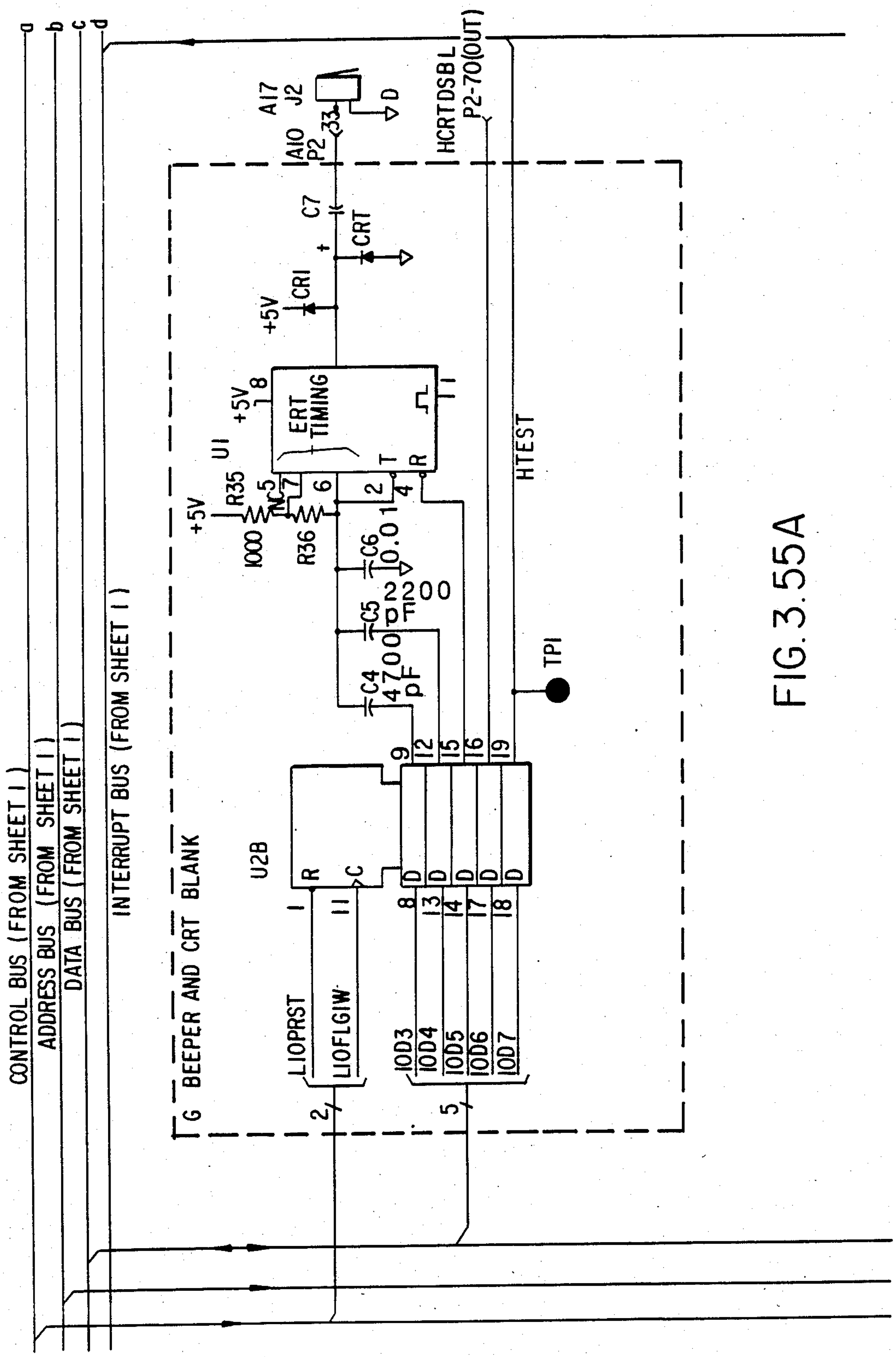
FIG. 3.55A

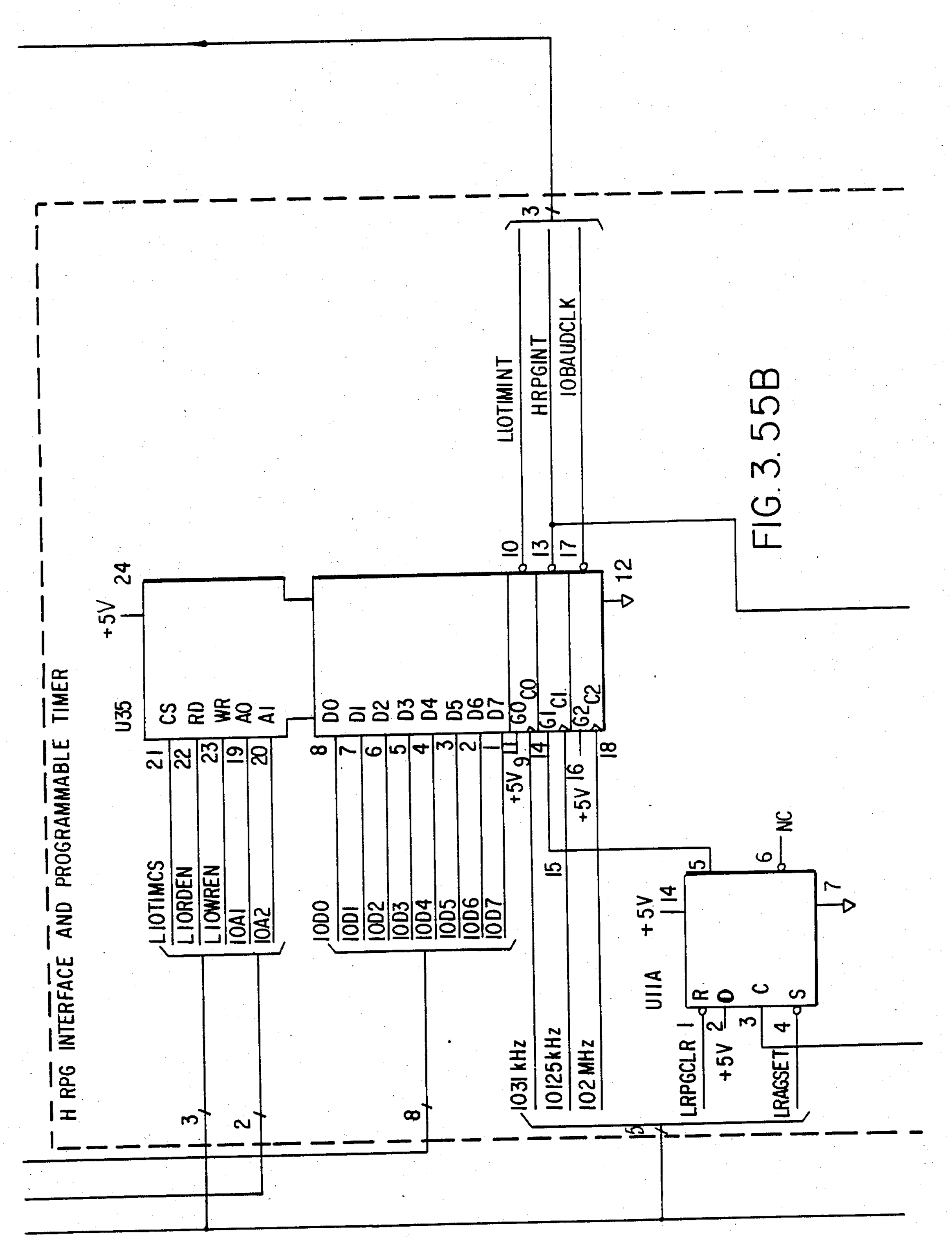
FIG. 3.55B

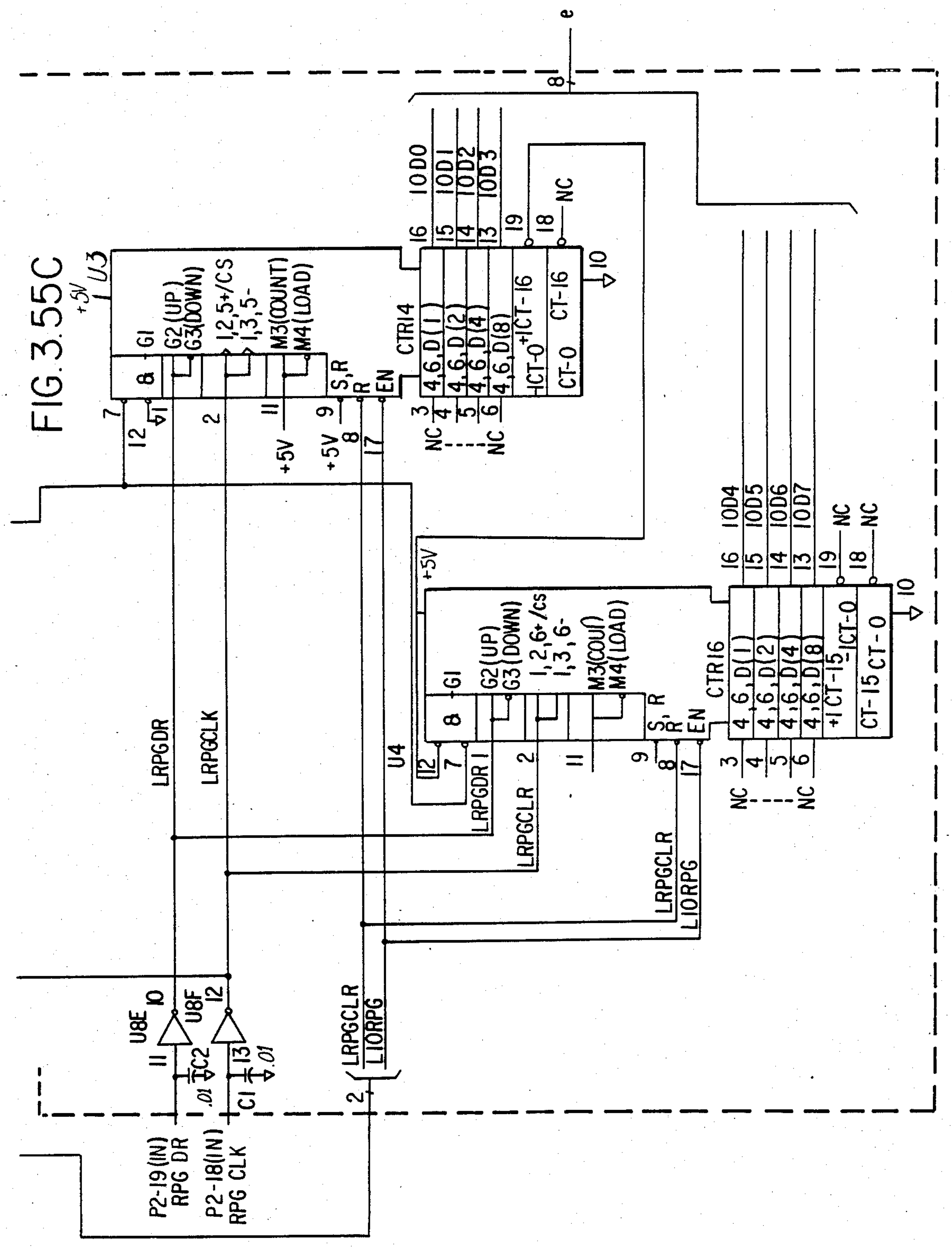
FIG. 3.55C

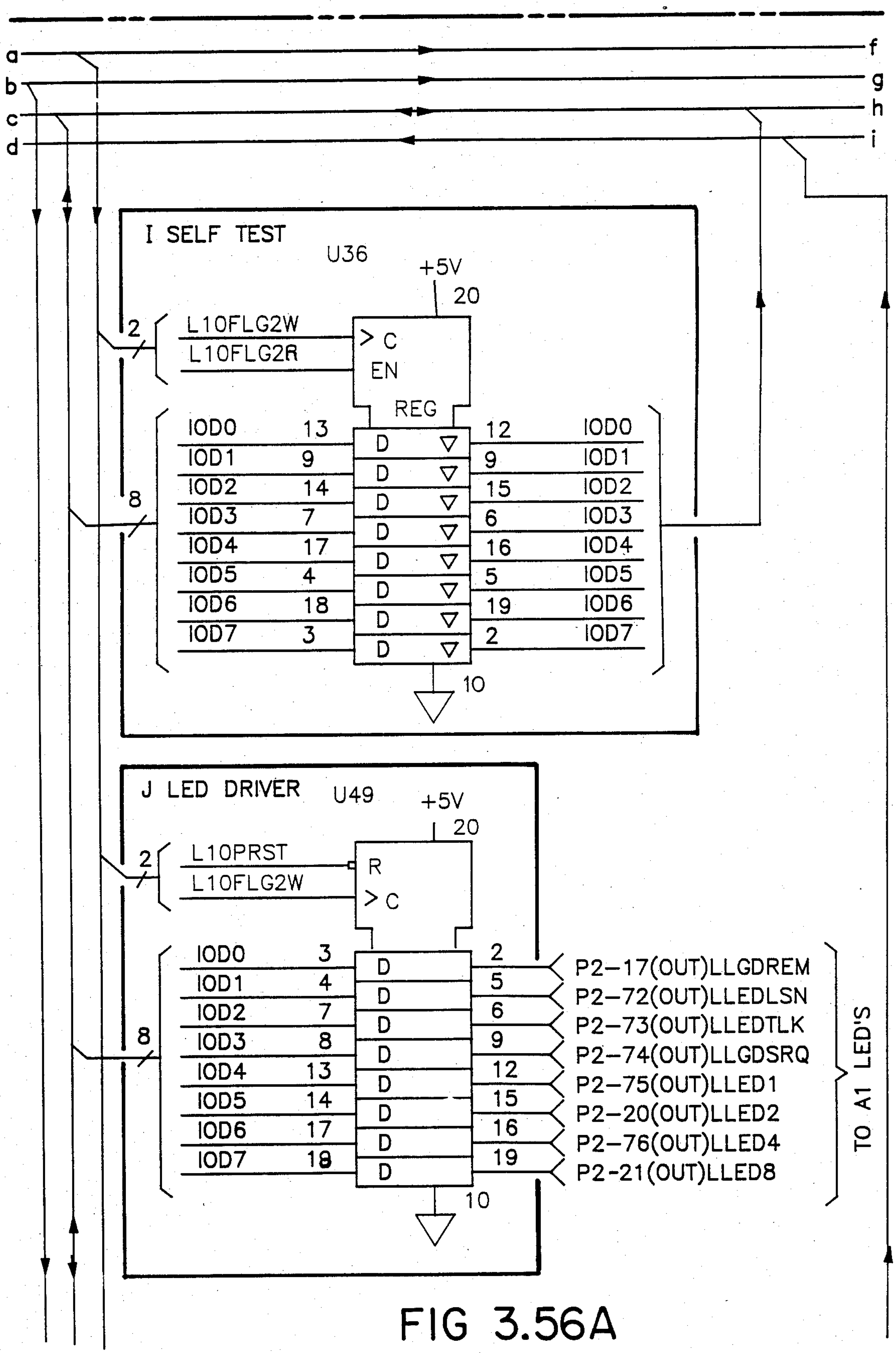
FIG 3.56A

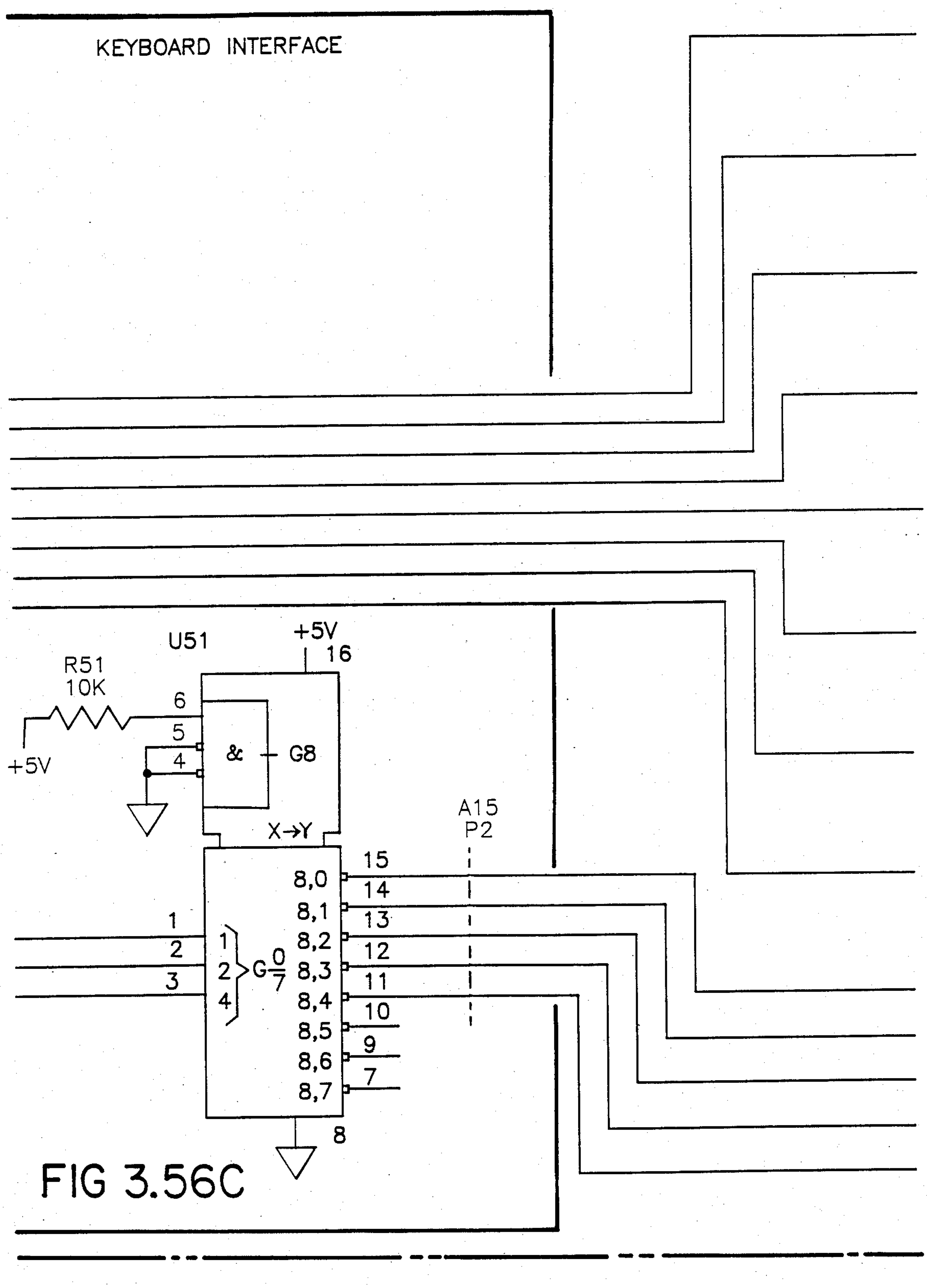
FIG 3.56C

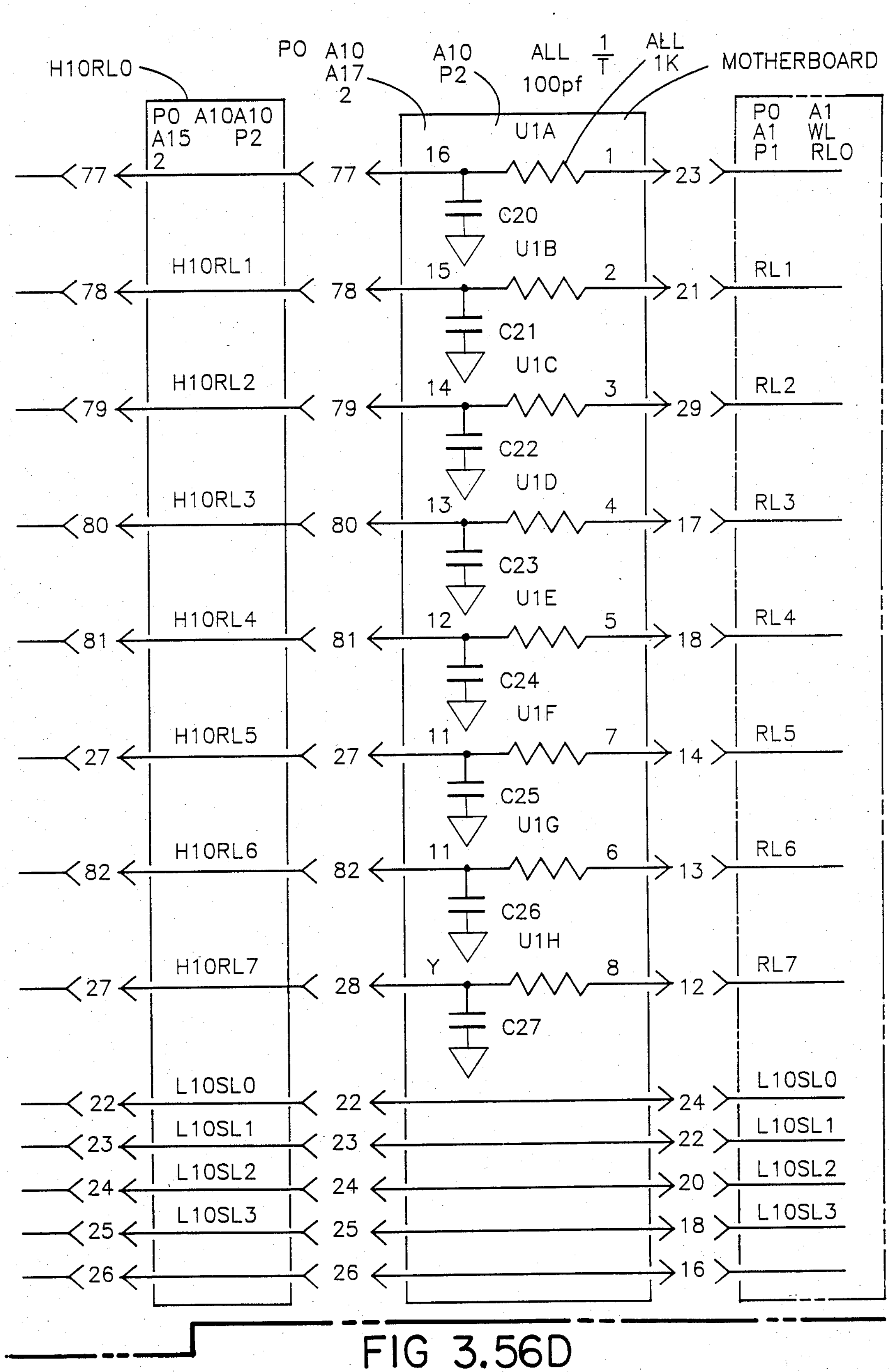
FIG 3.56D

FIG 3.57A
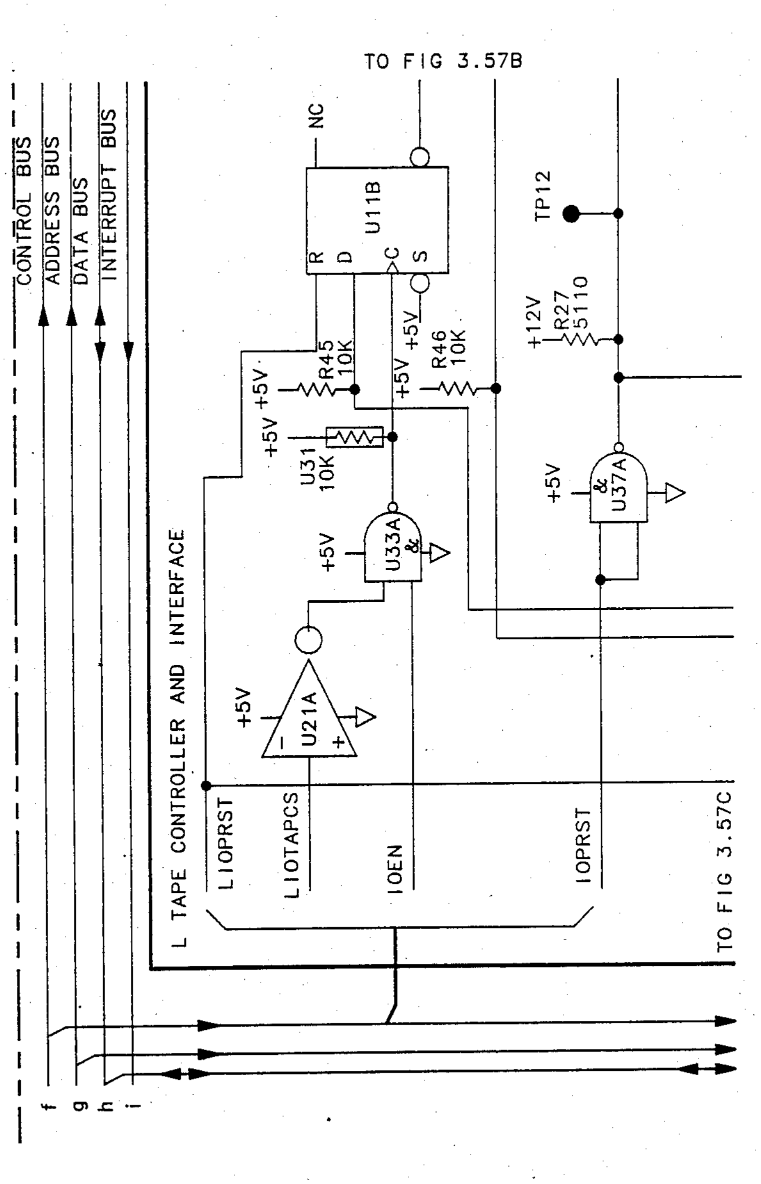

FIG 3.57B
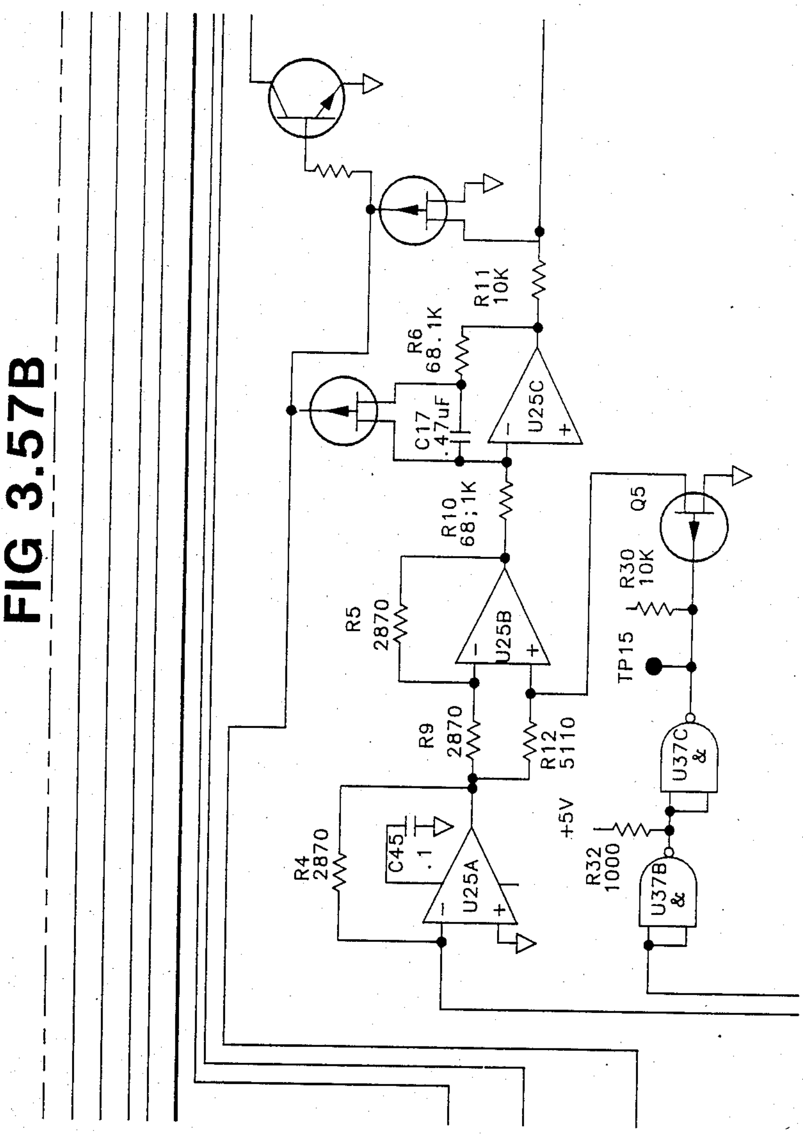

FIG 3.57C
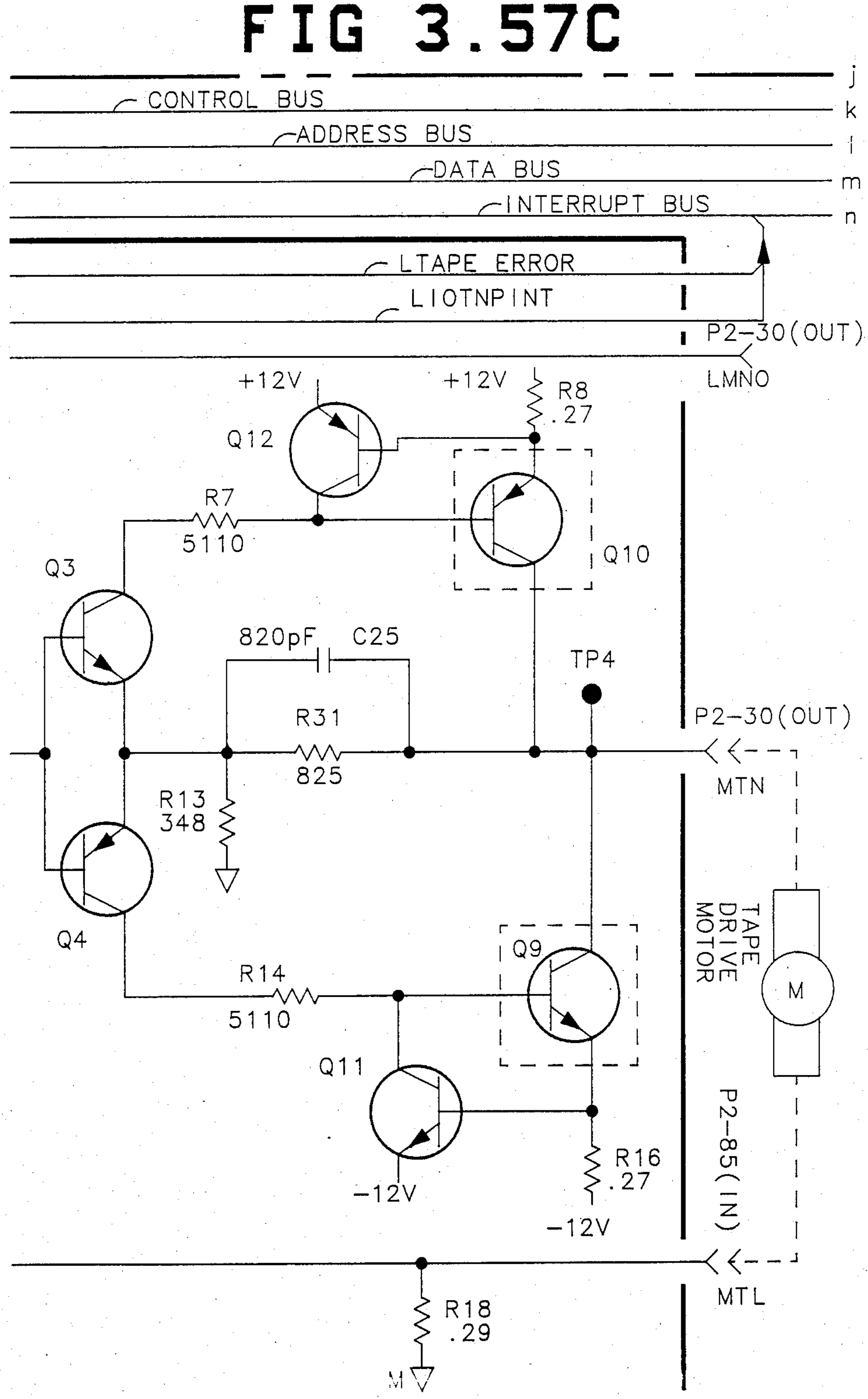

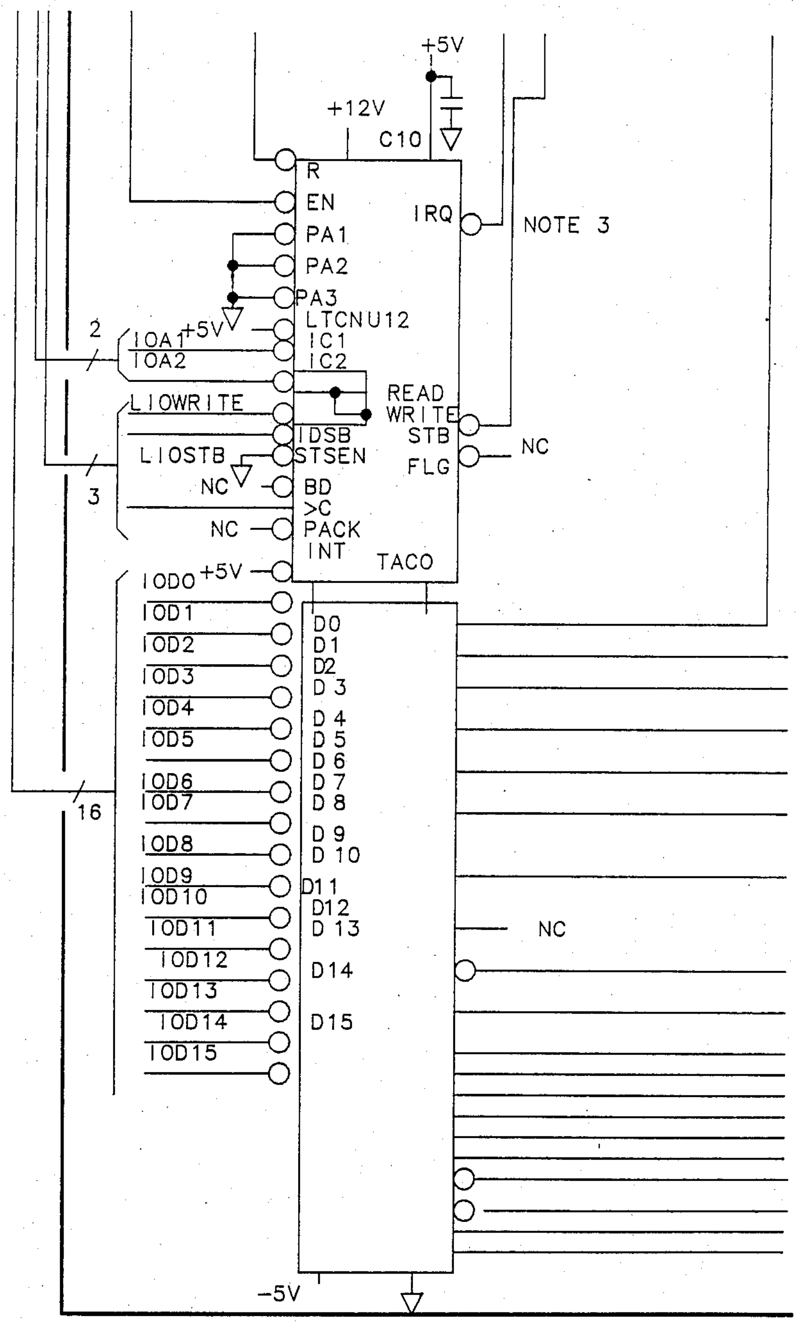
FIG 3.57D

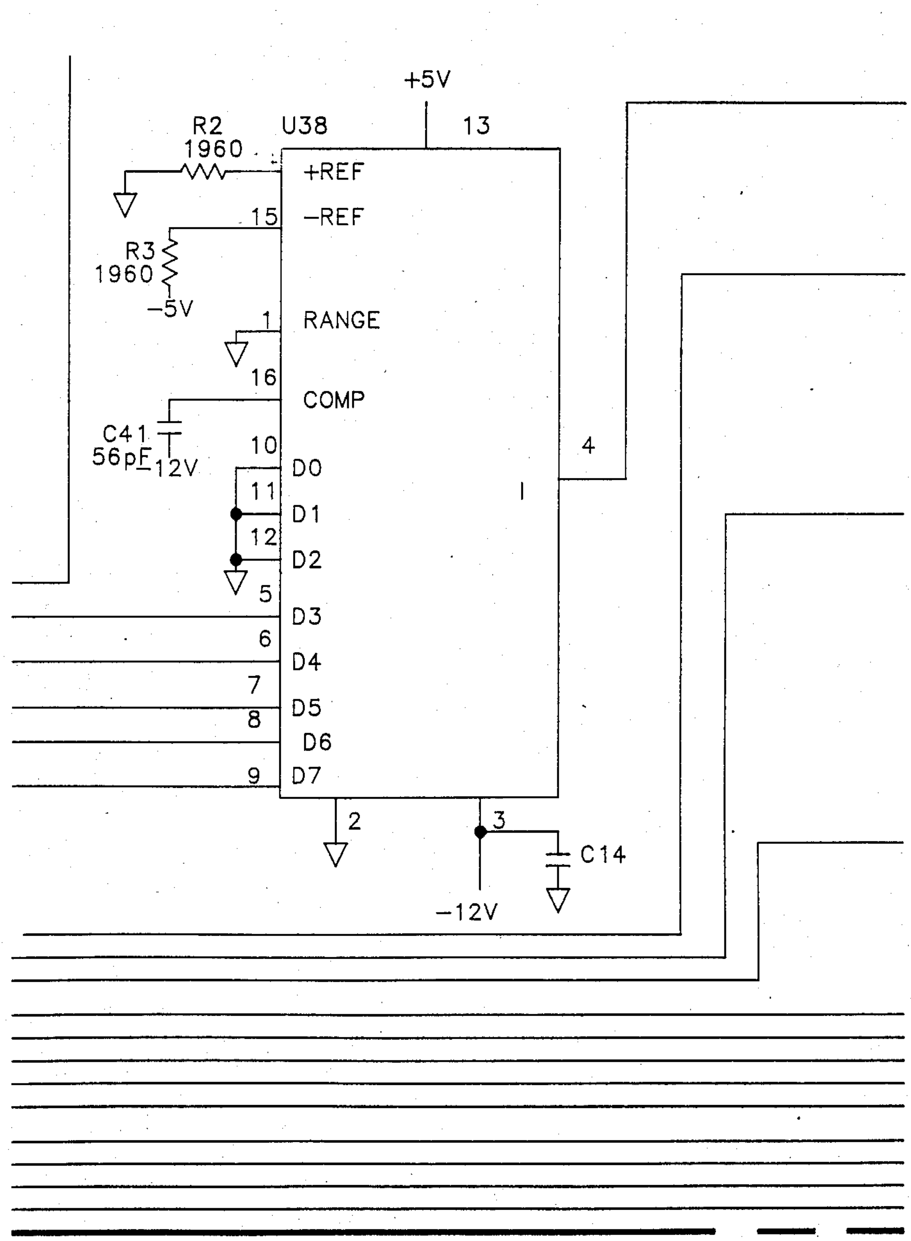
FIG 3.57E

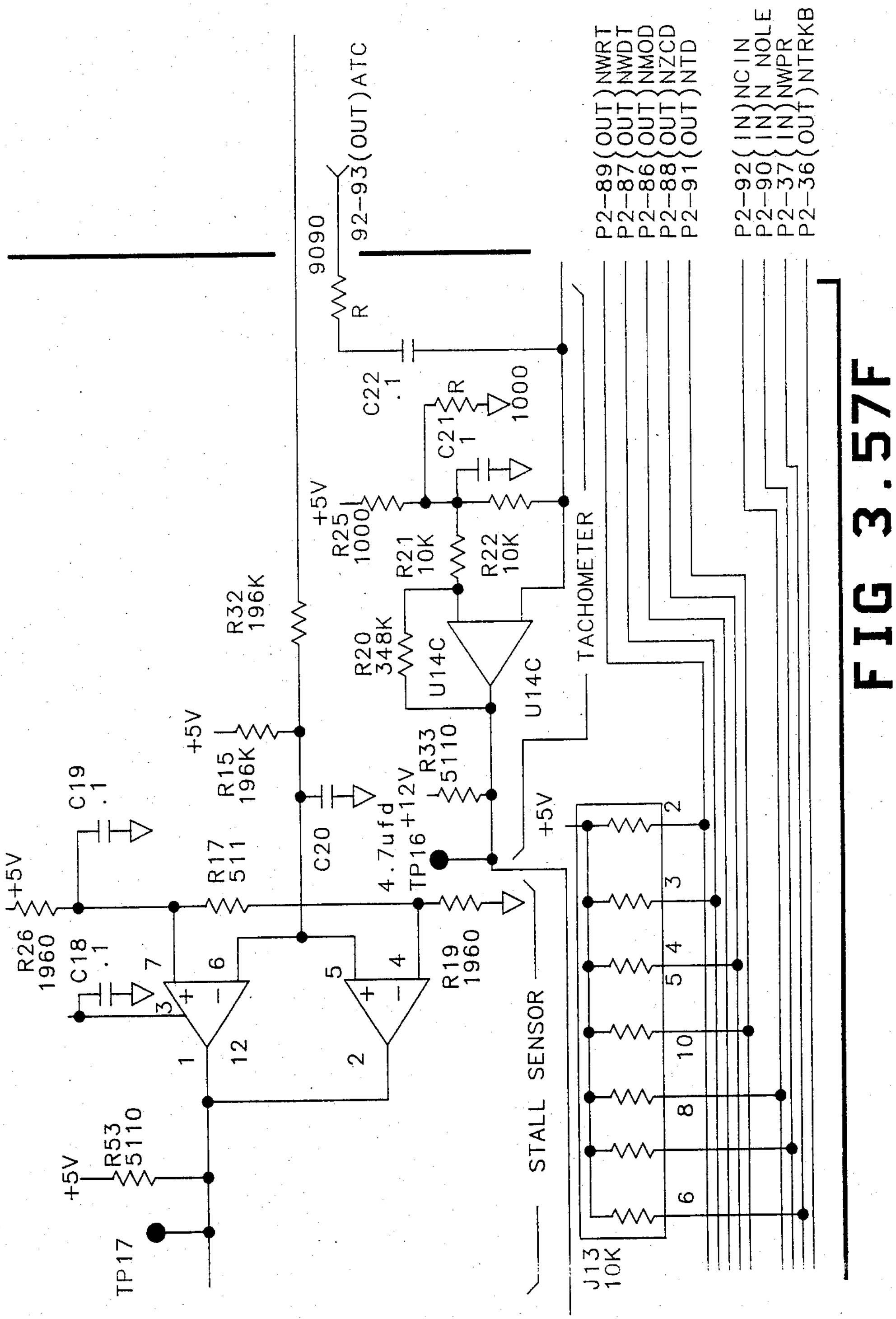
FIG 3.57F

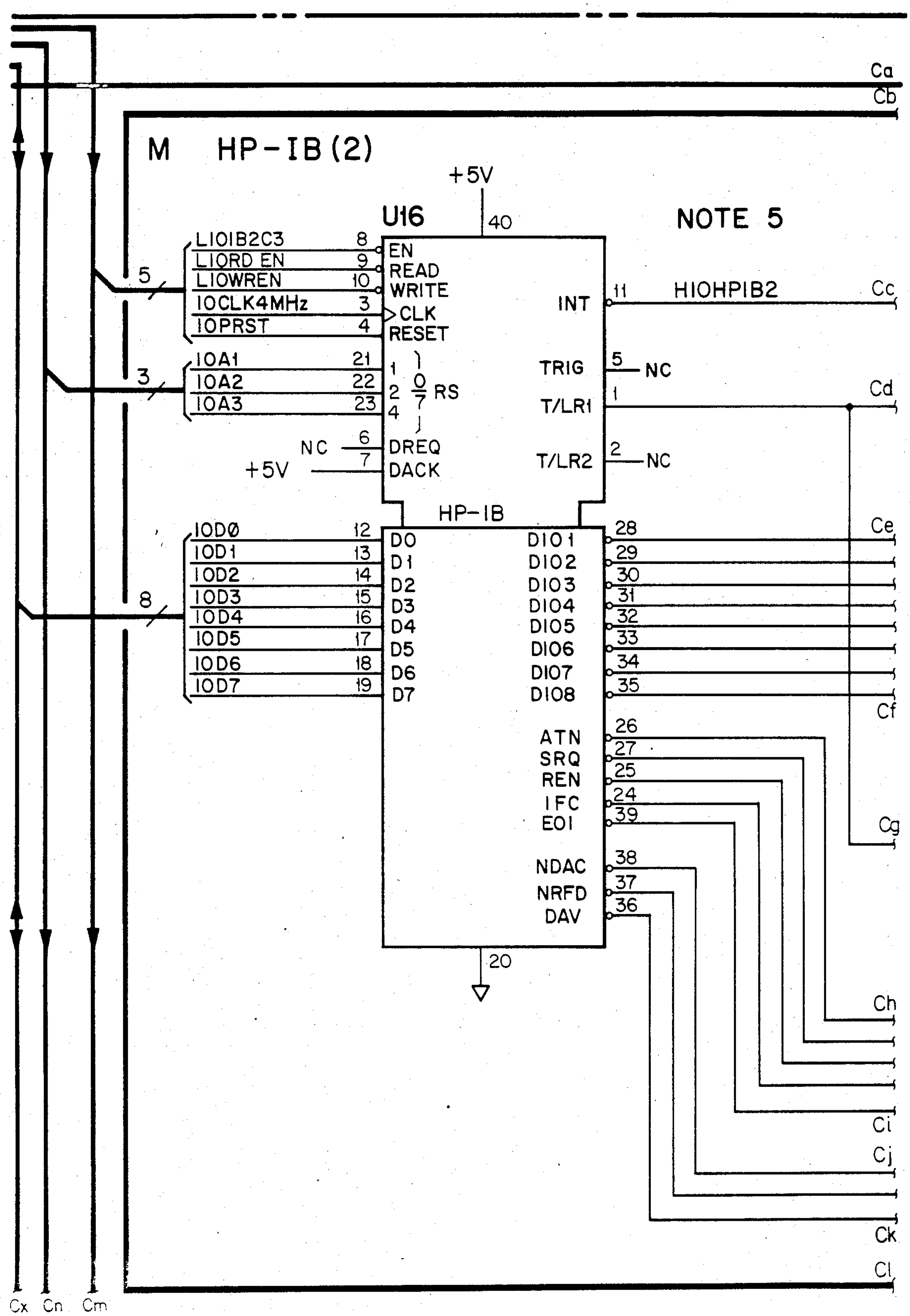
FIG 3.58A

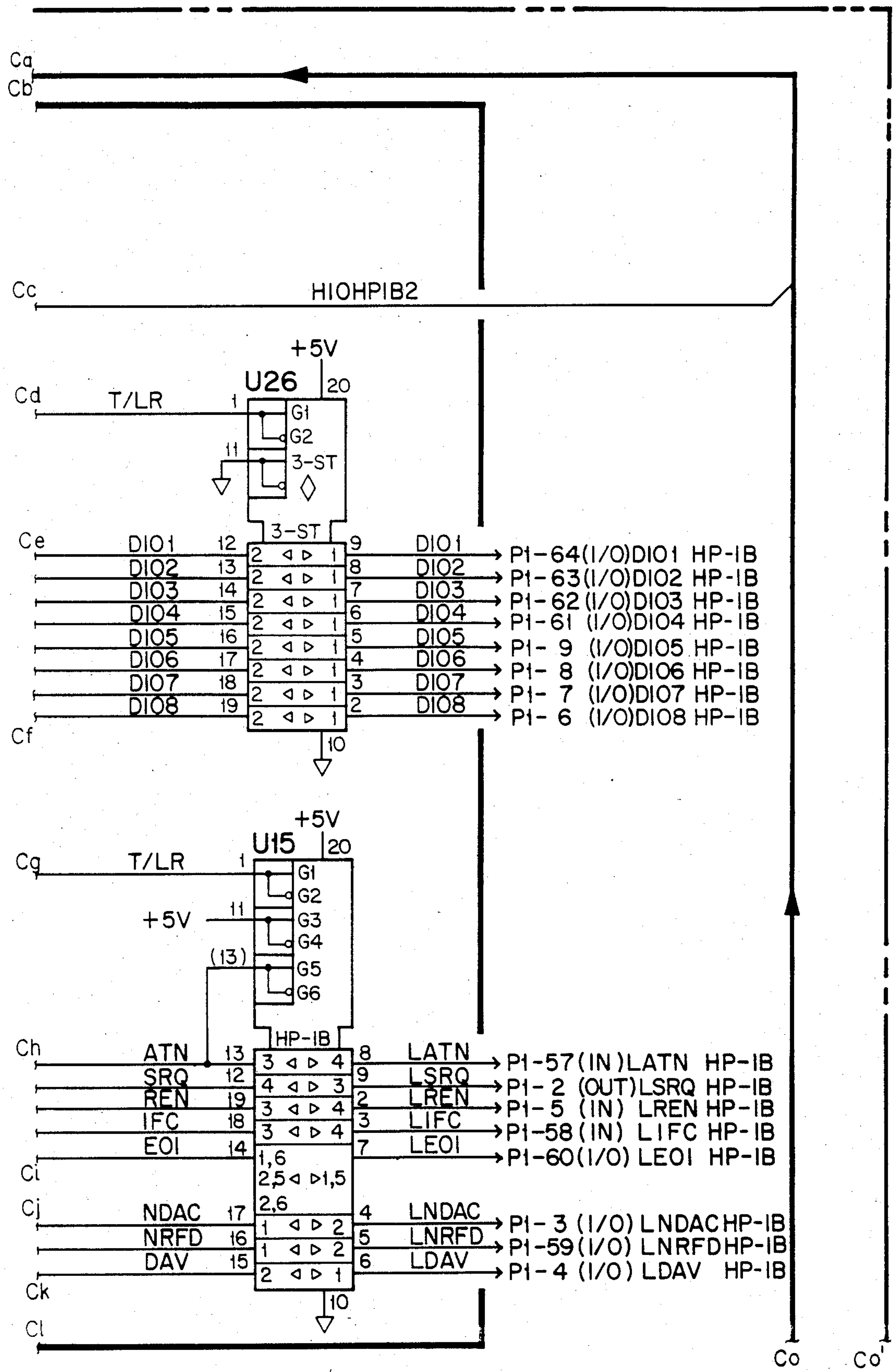
FIG 3.58B

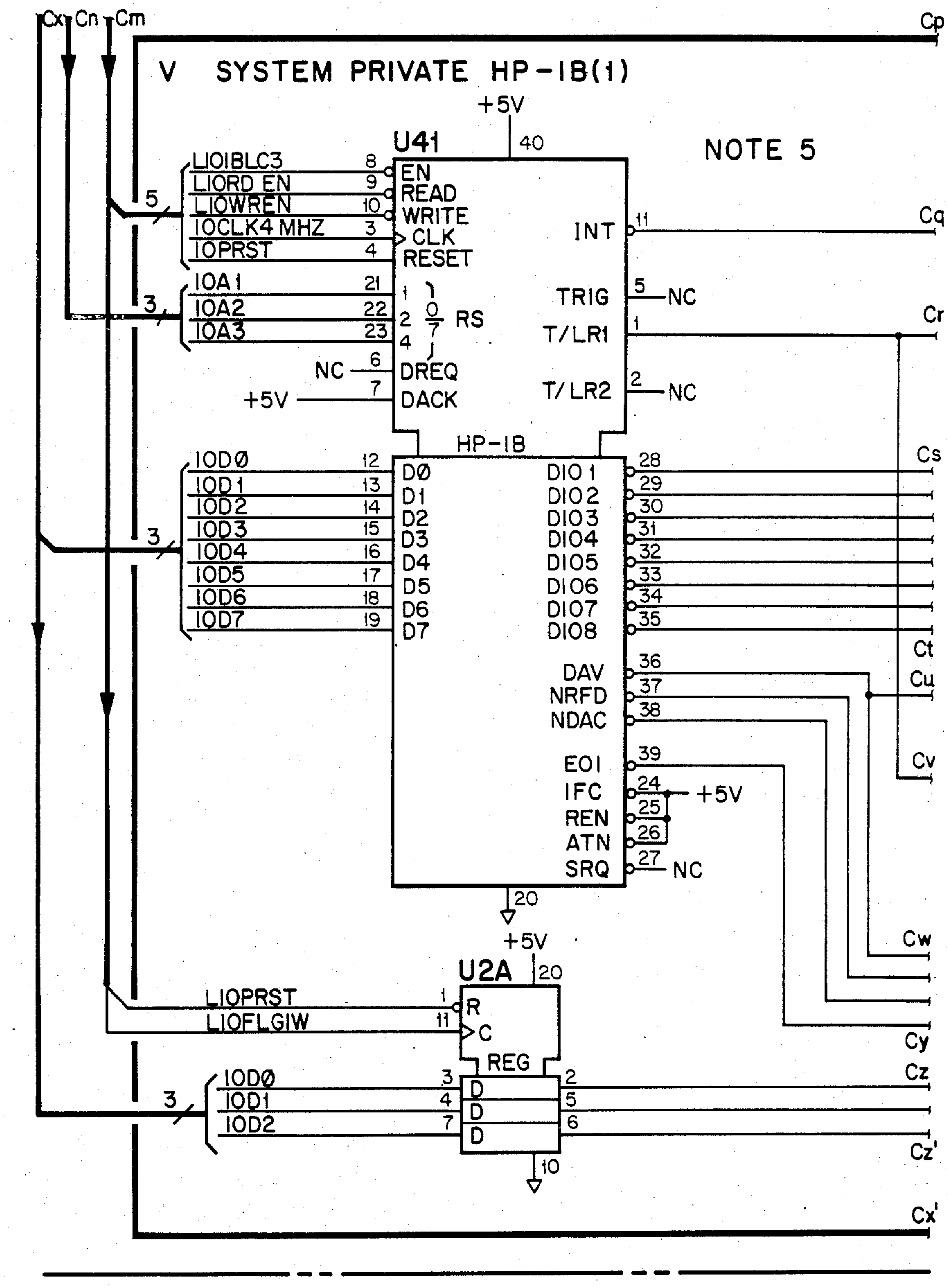
FIG 3.58C

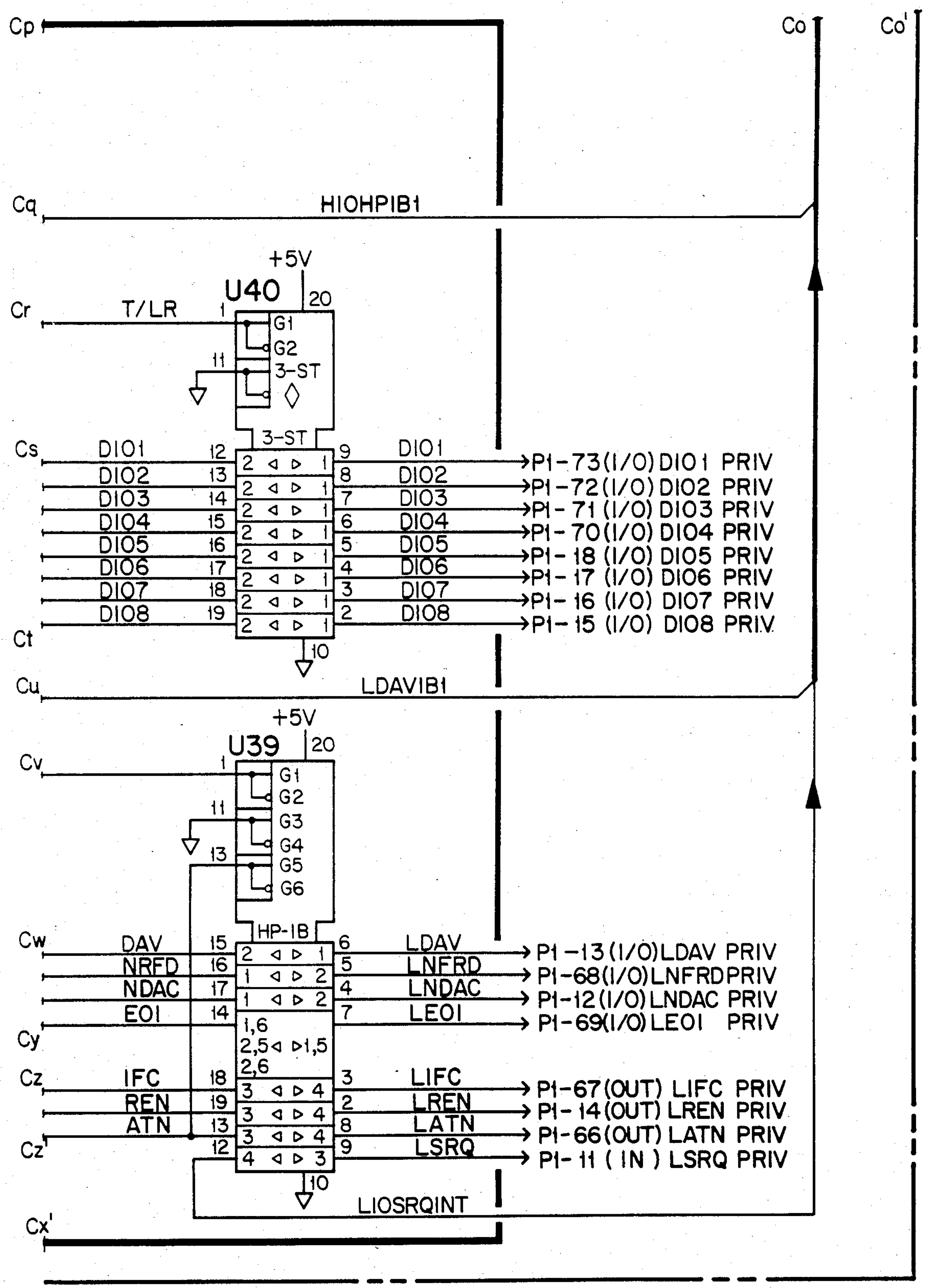
FIG 3.58D

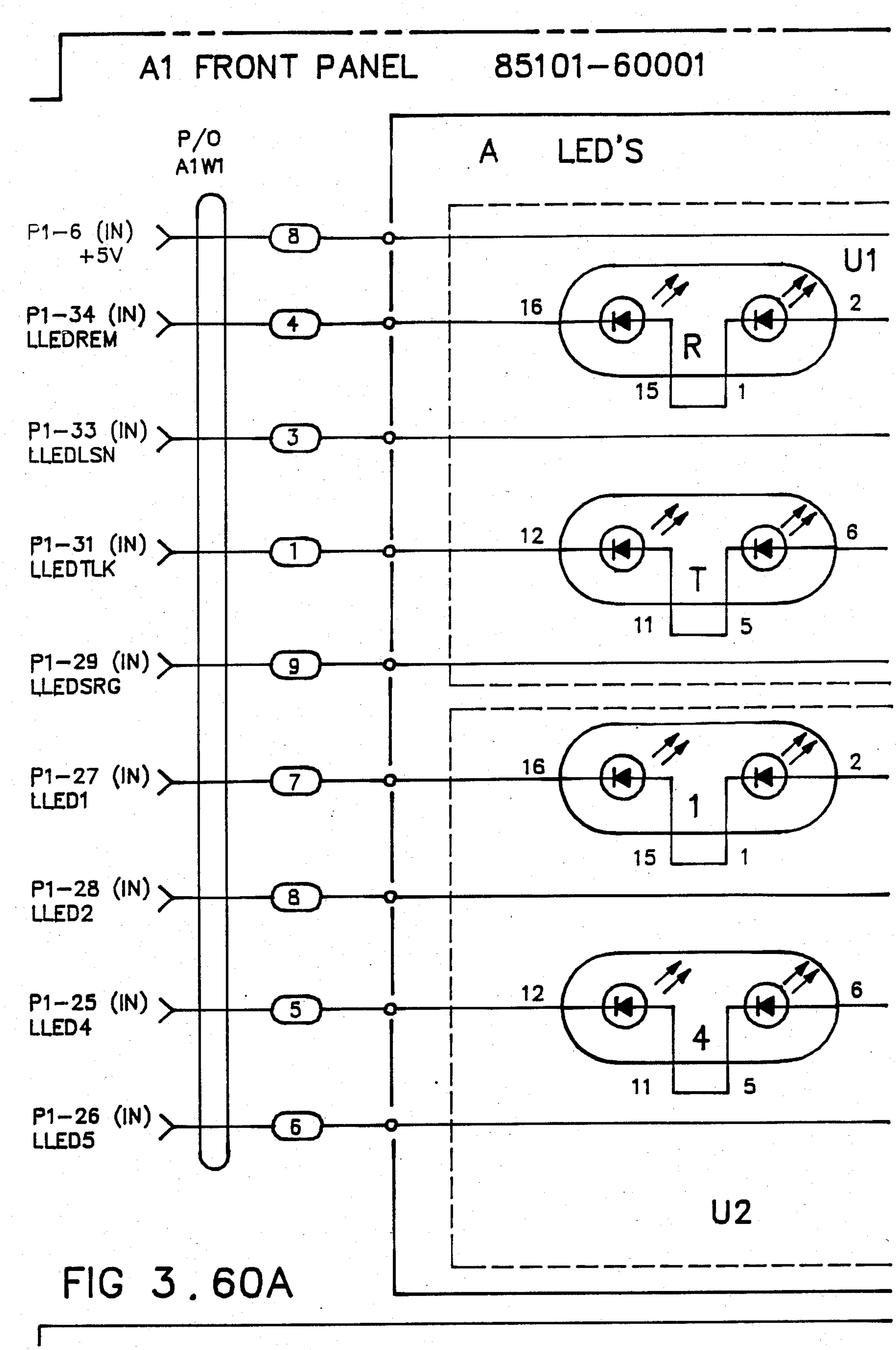
FIG 3.60A

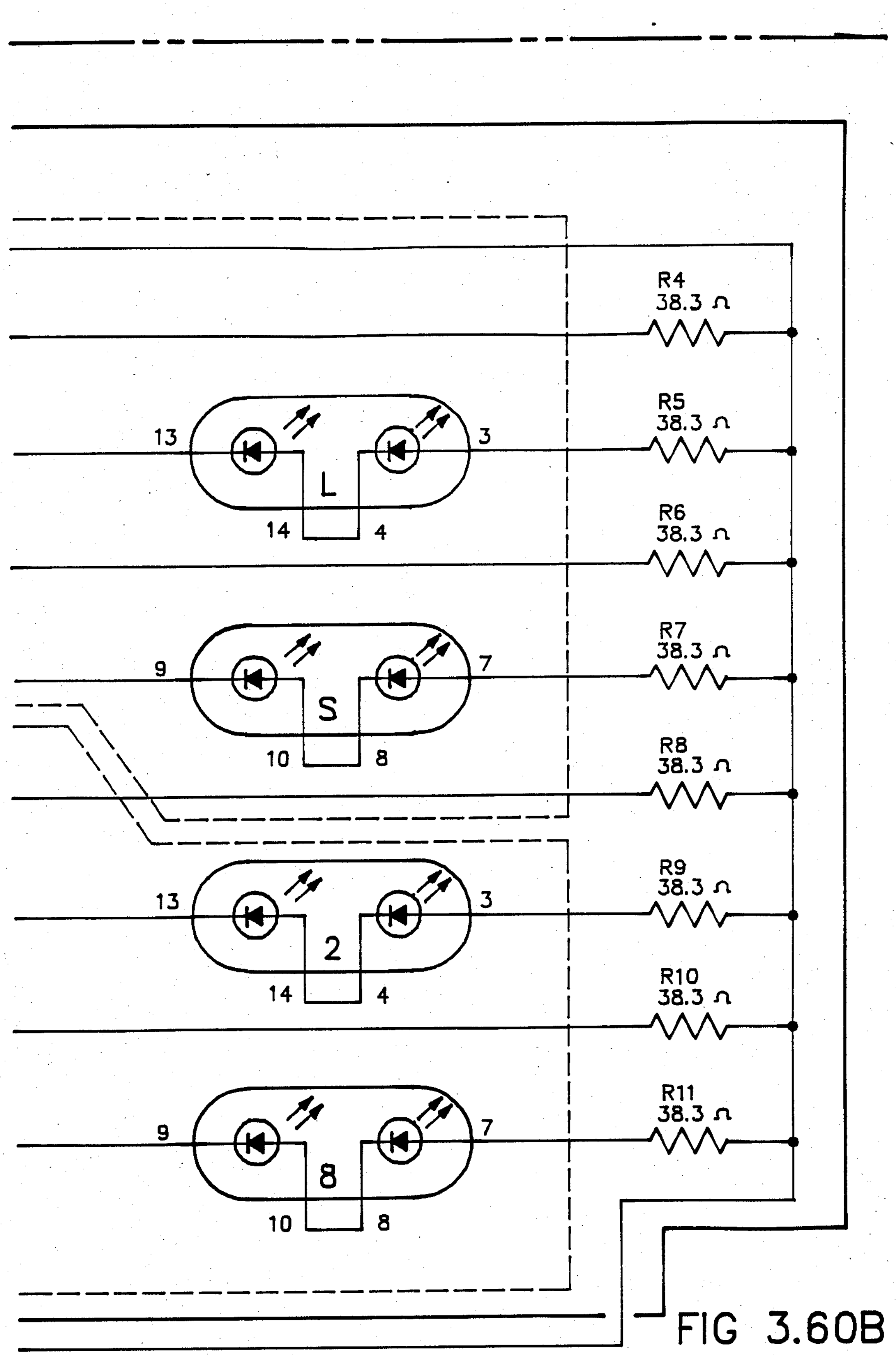
FIG 3.60B

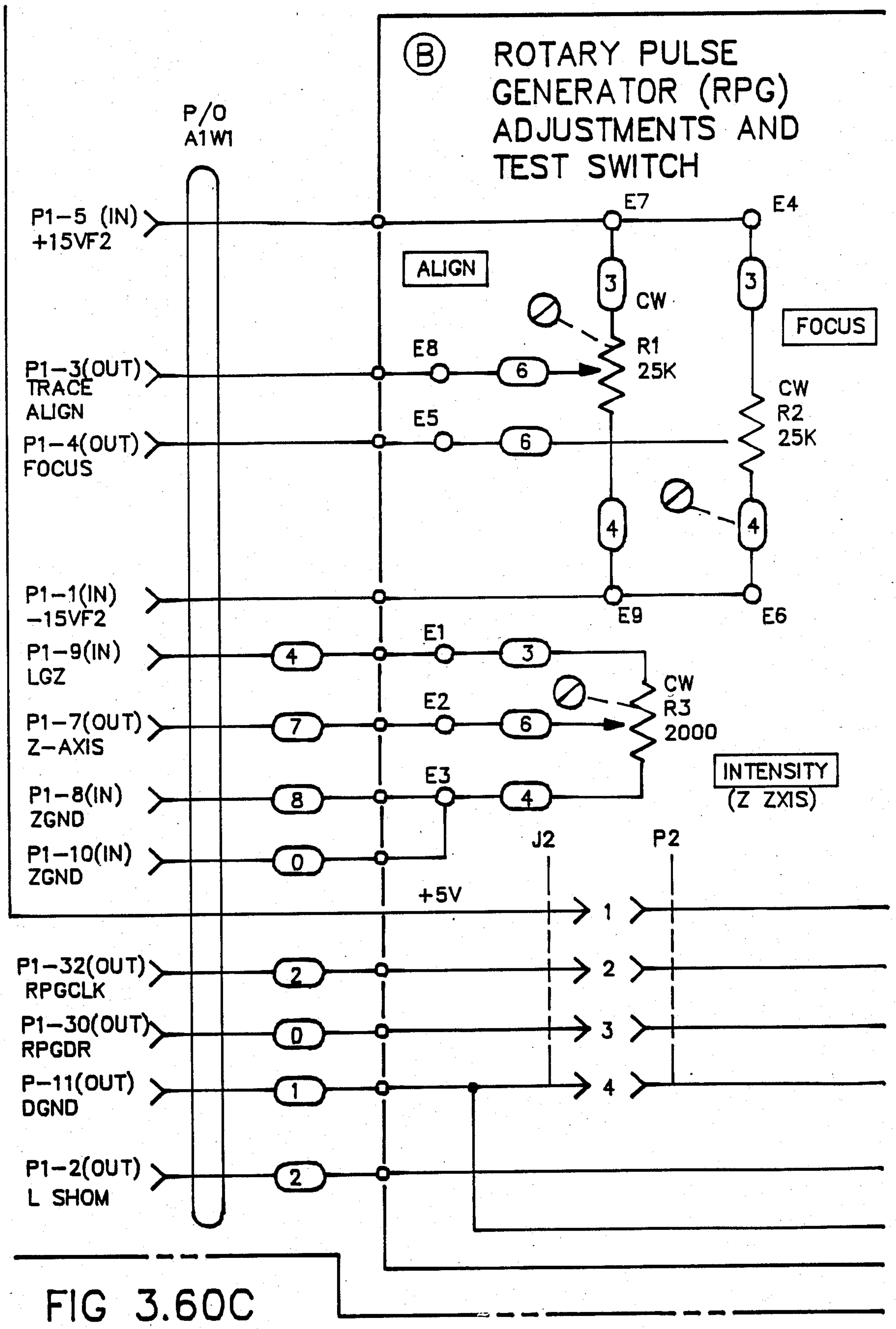
FIG 3.60C

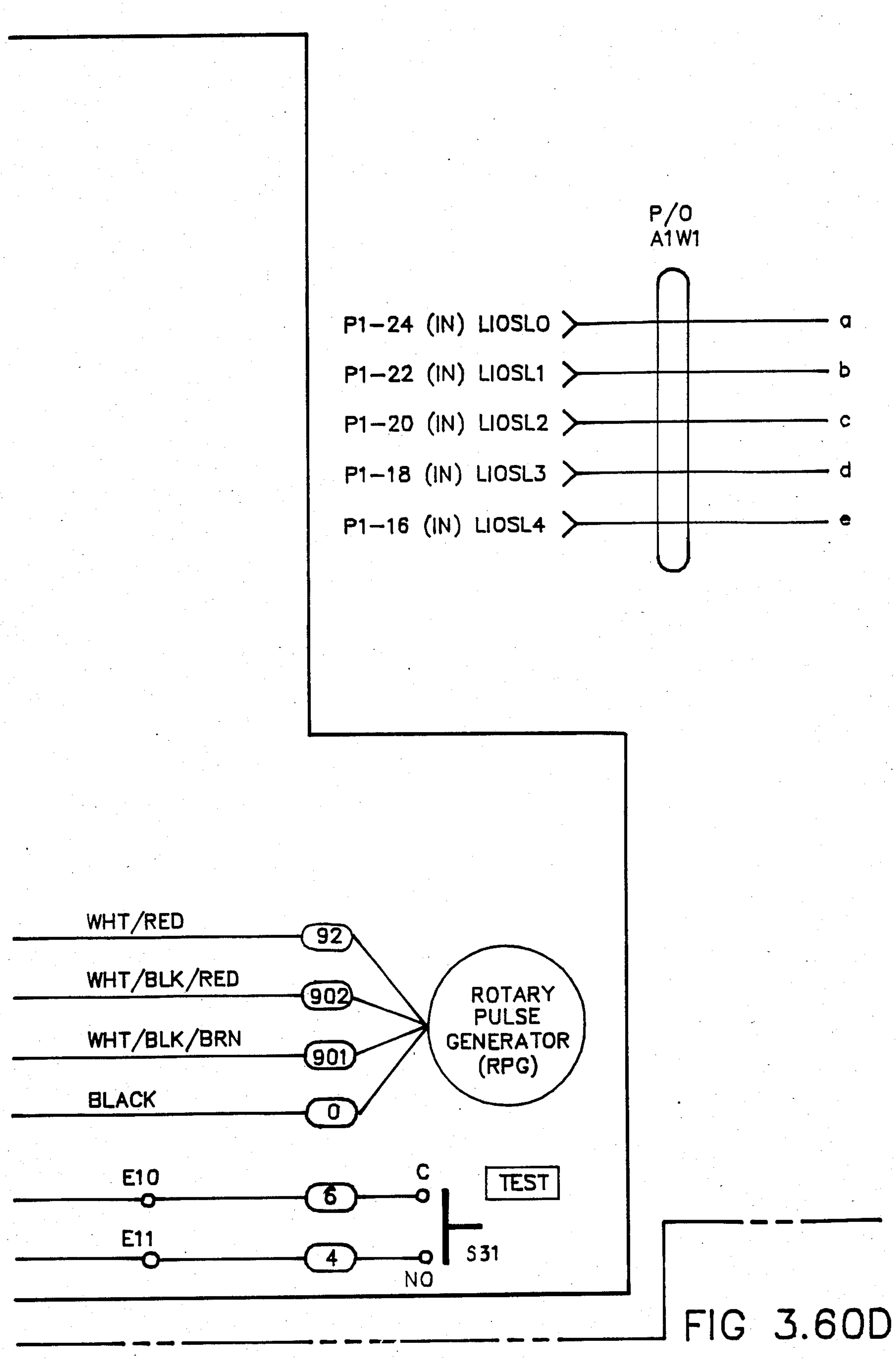
FIG 3.60D

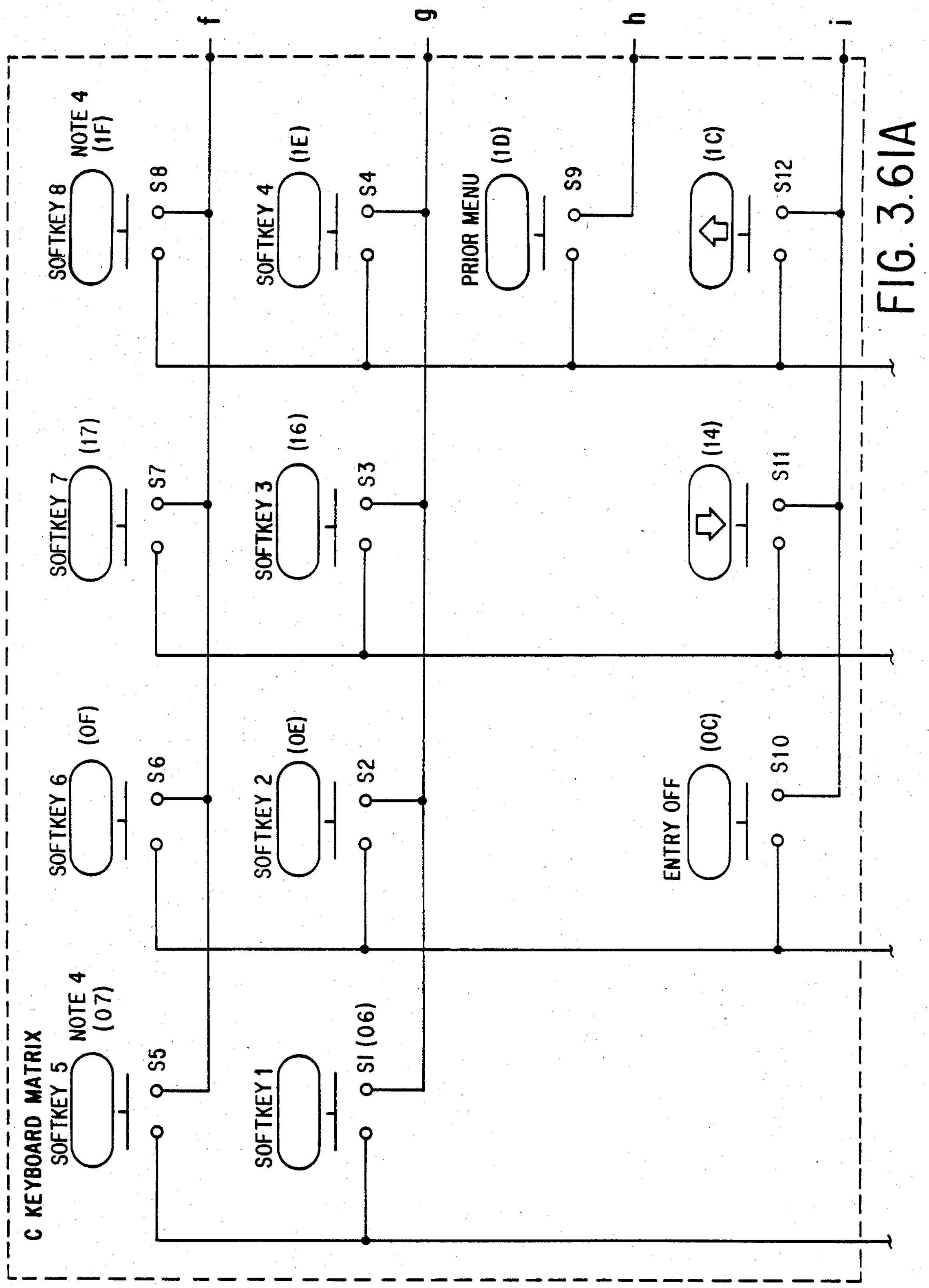
FIG. 3.61A

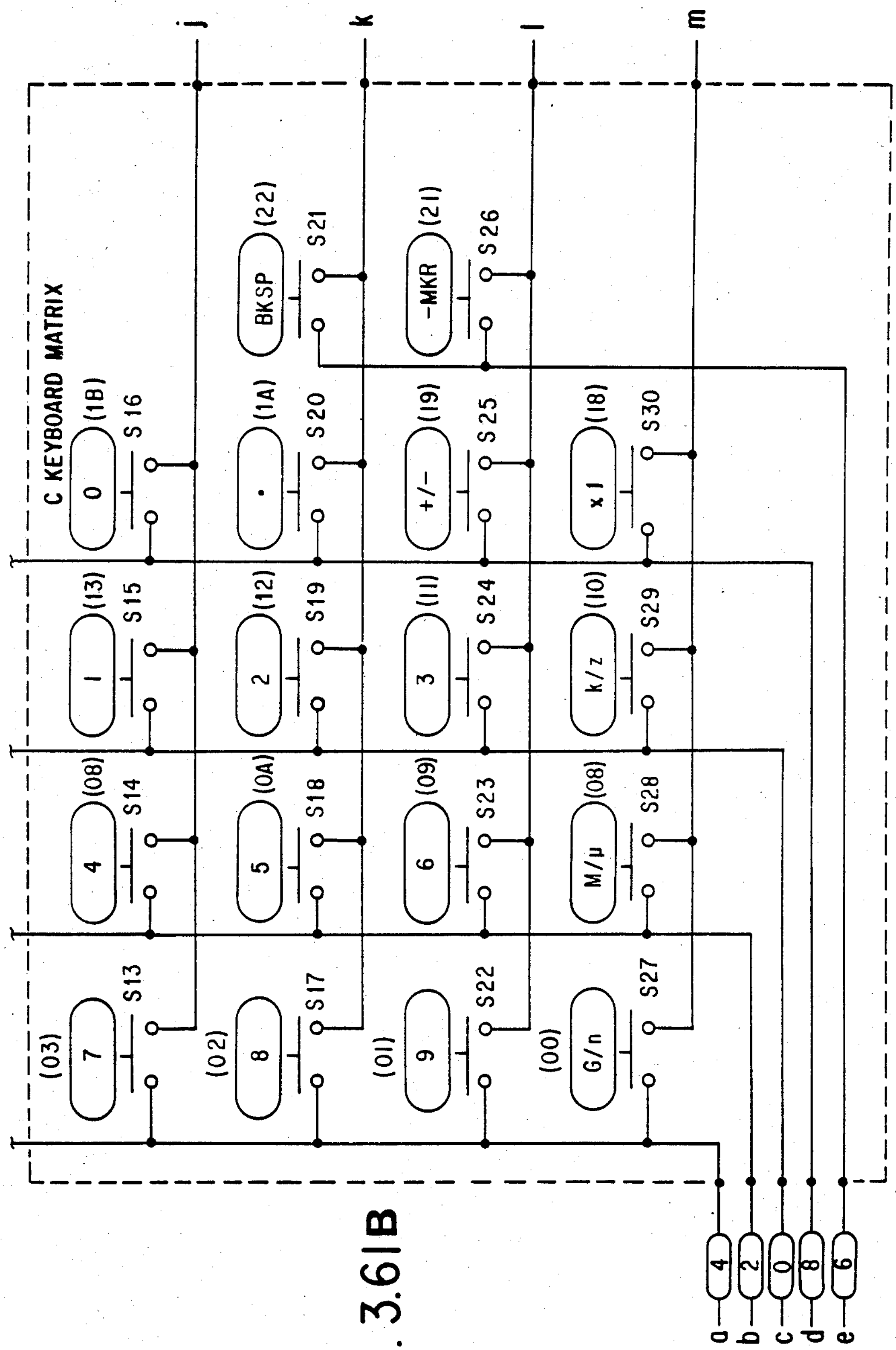
FIG. 3.61B

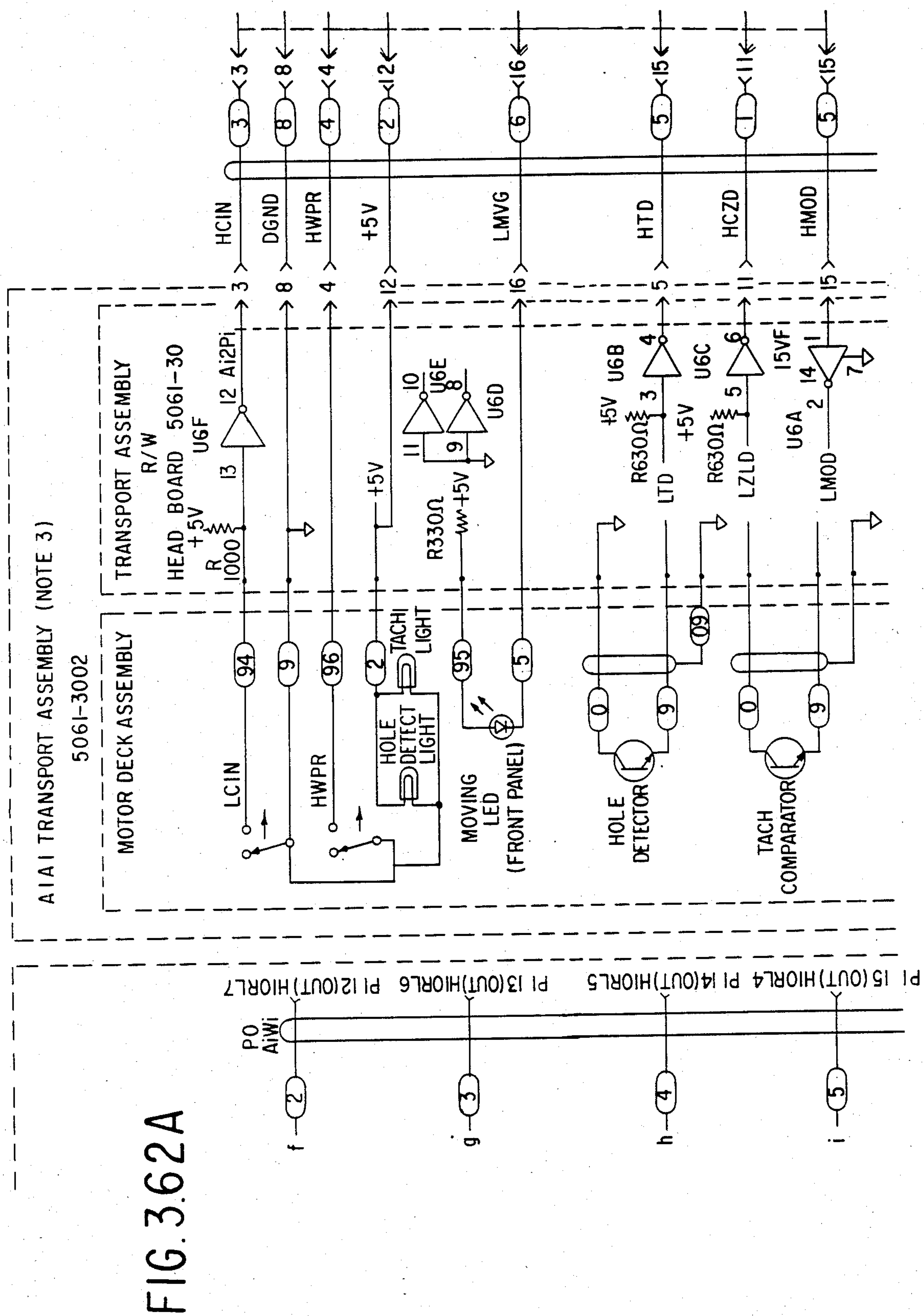
FIG. 3.62A

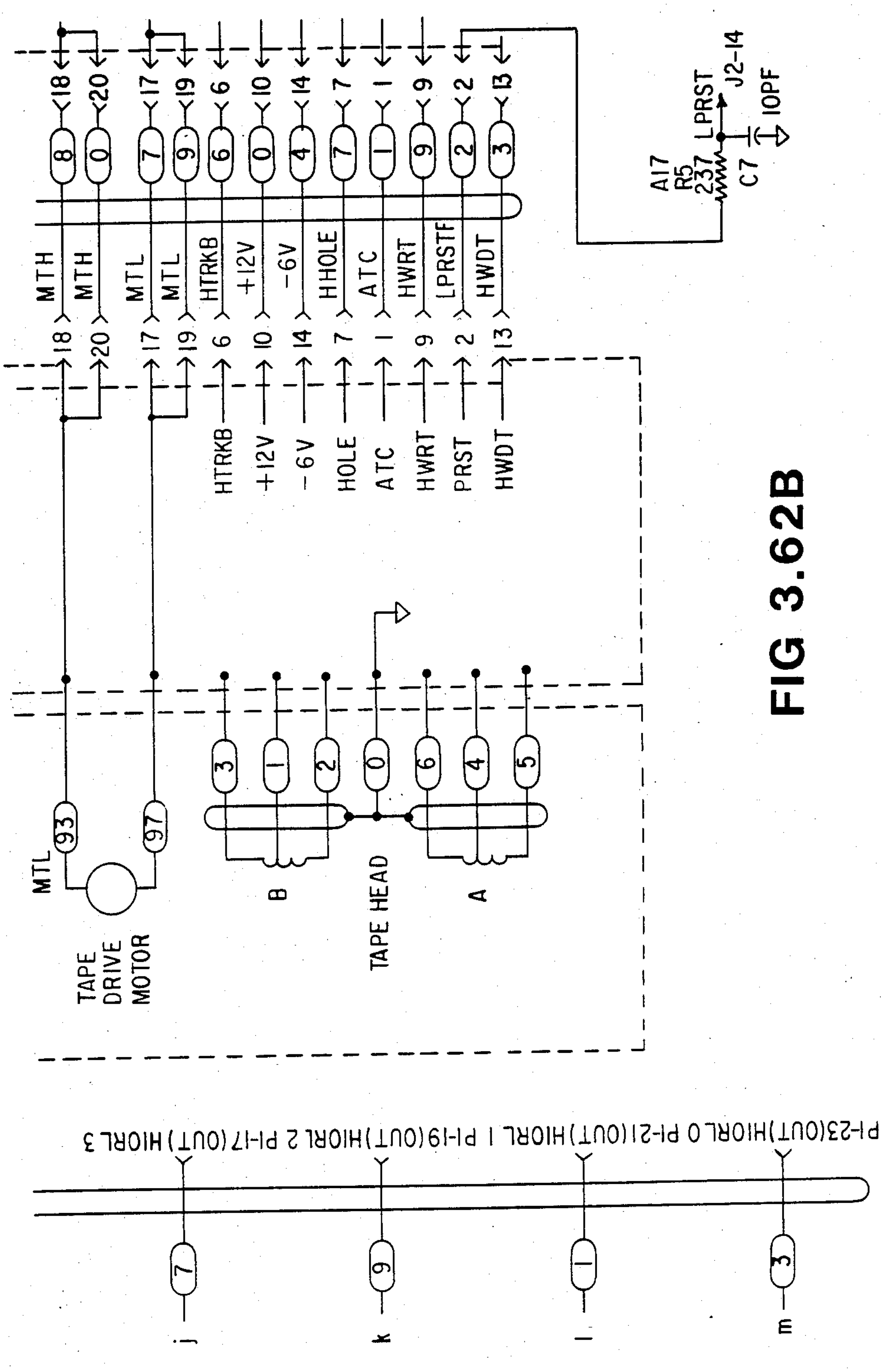
FIG 3.62B

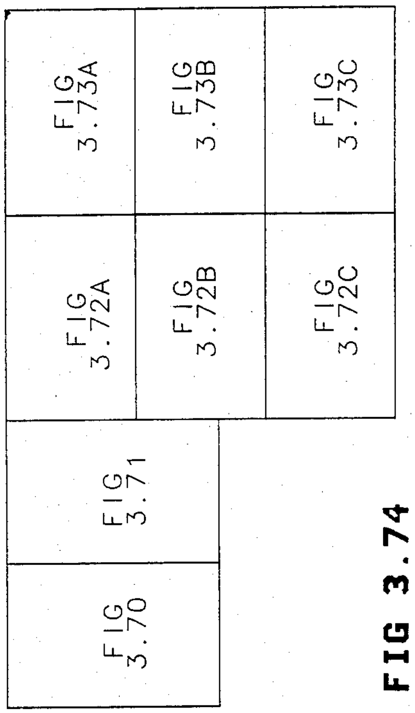
FIG 3.74
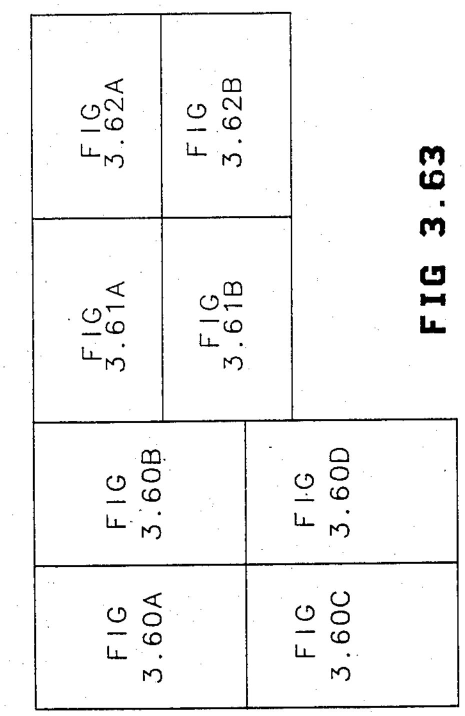
FIG 3.63
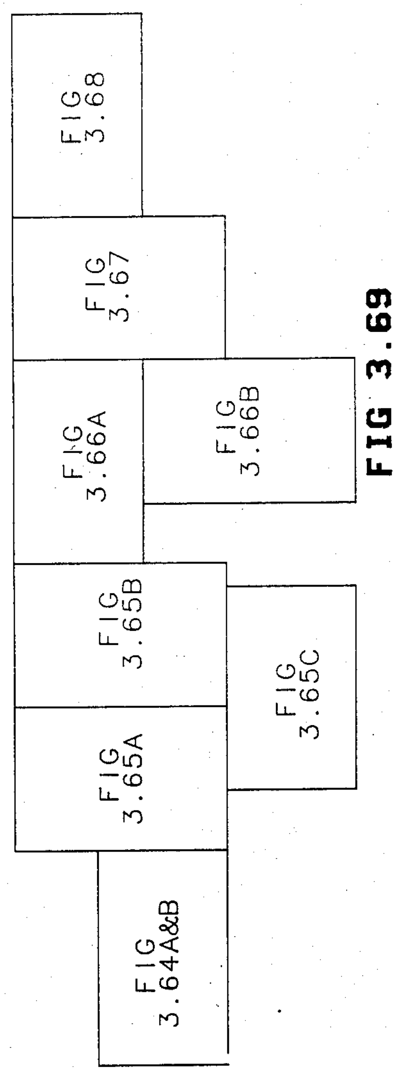
FIG 3.69

| MNEMONIC | DESCRIPTION |
|---|---|
| ACC | WRITE GUN ACCELERATOR |
| ASTIG | ASTIGMATISM |
| CONTROL GATE | BLANKING AND INTENSITY CONTROL |
| FOCUS | FOCUS CONTROL INPUT |
| HF GAIN | HIGH FREQUENCY GAIN |
| HF TRIM | HIGH FREQUENCY COMPENSATION |
| INT GAIN | INTENSITY GAIN |
| INTLIMIT | INTENSITY LIMIT |
| LBLANKO | LO-BLANK DELAYED |
| LGZ | LINE GENERATOR Z-AXIS OUTPUT |
| MESH | EXPANSION MESH |
| ORTHO | ORTHOGONAL |
| PATT | PATTERN |
| Z-AXIS | INTENSITY SIGNAL |
| ZGND | Z-AXIS GROUND RETURN |

FIG 3.64A

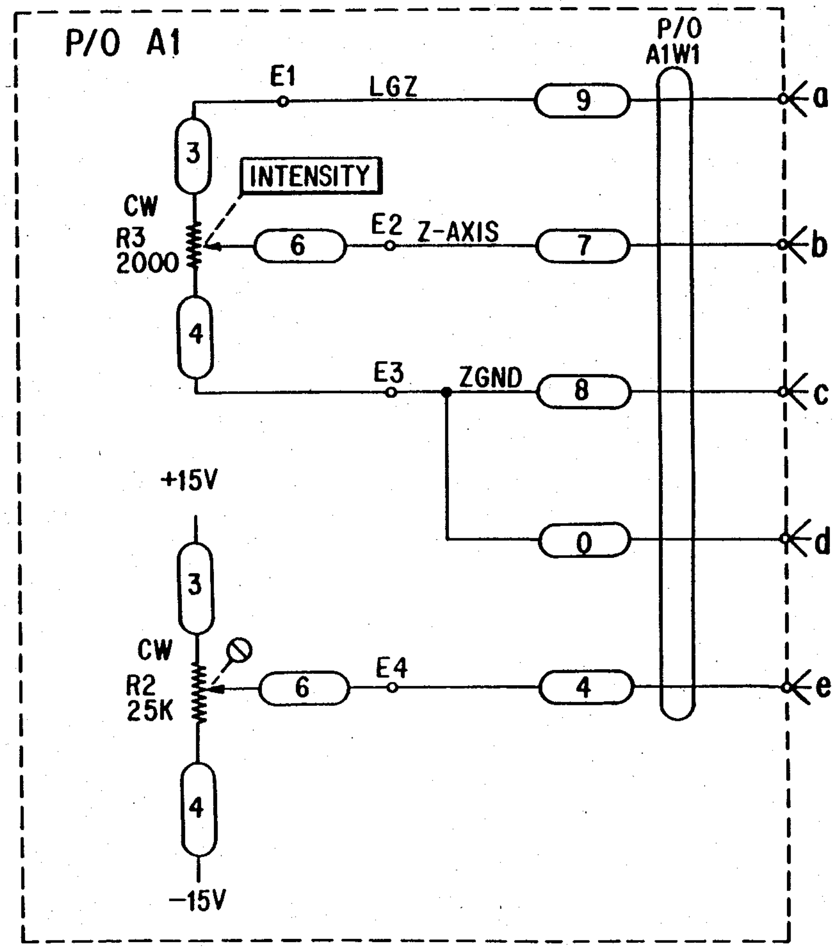

| PIN | SIGNAL | TO/FROM | FUNCTION BLOCK |
|---|---|---|---|
| 1<br>16 | ORTHO<br>ZGND | V1<br>A17C1-NEG | E,G<br>F |
| 2<br>17 | FOCUS GATE<br>CONTROL GATE | A3<br>A3 | D<br>C |
| 3<br>18 | PATTERN INTENSITY LIMIT | V1<br>A3 | E,G<br>E |
| 4<br>19 | ASTIG<br>ZGND | V1<br>A17C1-NEG | E,G<br>F |
| 5<br>20 | MESH<br>ZGND | V1<br>A17C1-NEG | E,G<br>F |
| 6<br>21 | ACC<br>LBLANKD | V1<br>A6 | E,G<br>B |
| 7<br>22 | -15V<br>NC | AB.A17 | F |
| 8<br>23 | ZGND<br>ZGND | A17C1-NEG | F<br>F |
| 9<br>24 | +15V<br>FOCUS | A17. A8<br>A1 | F<br>D |
| 10<br>25 | TRACE ALIGN<br>NC | A1 | G |
| 11<br>26 | ZGND<br>ZGND | A17C1-NEG | F<br>F |
| 12<br>27 | +100V<br>ZGND | AB<br>A17C1-NEG | F<br>F |
| 13<br>28 | ZGND<br>ZGND | A17C1-NEG | F<br>F |
| 14<br>29 | ZGND<br>Z-AXIS | A17C1-NEG<br>A1 | F<br>A |
| 15<br>30 | ZGND<br>ZGND | A17C1-NEG | F<br>F |

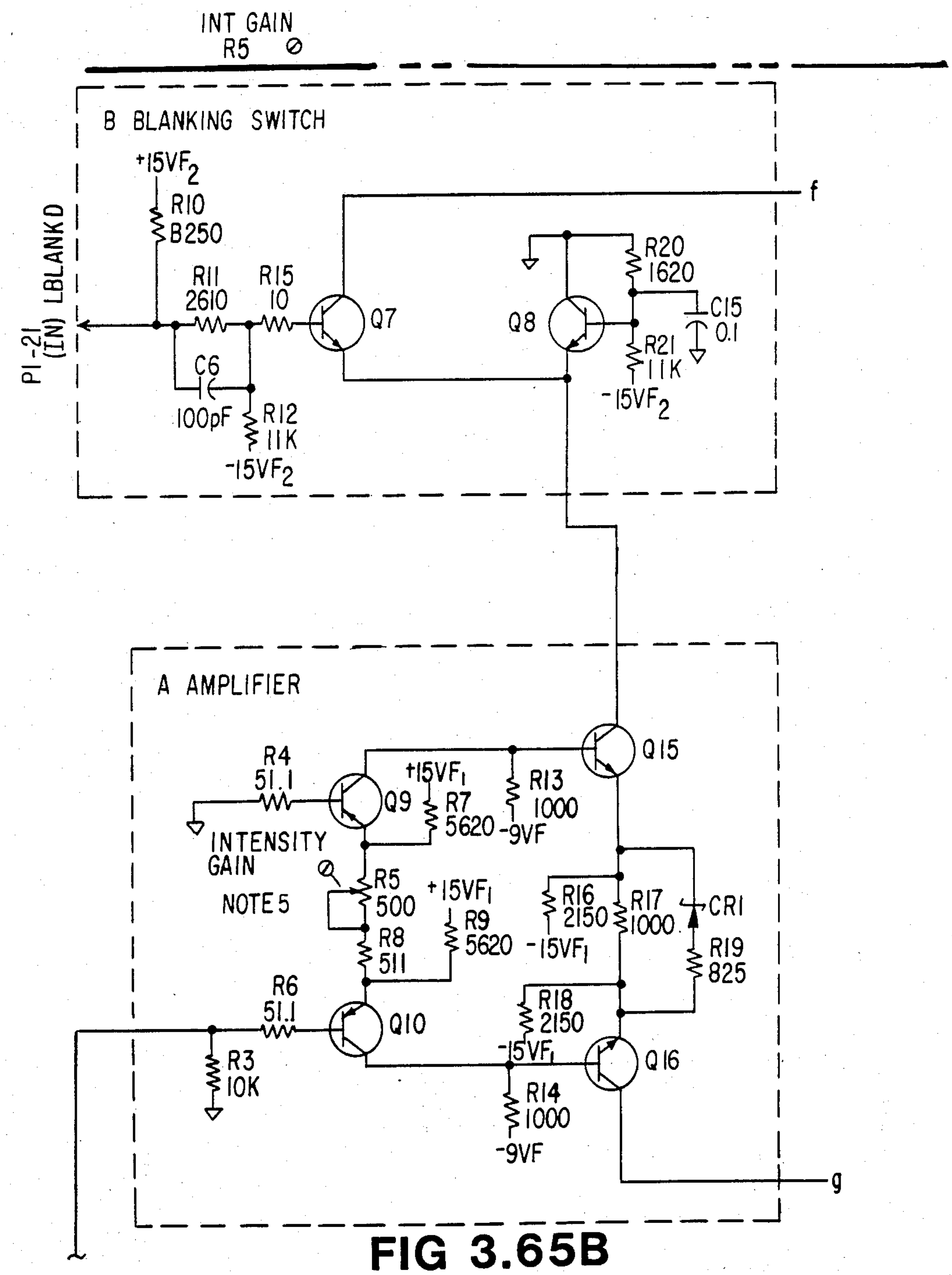
FIG 3.65B

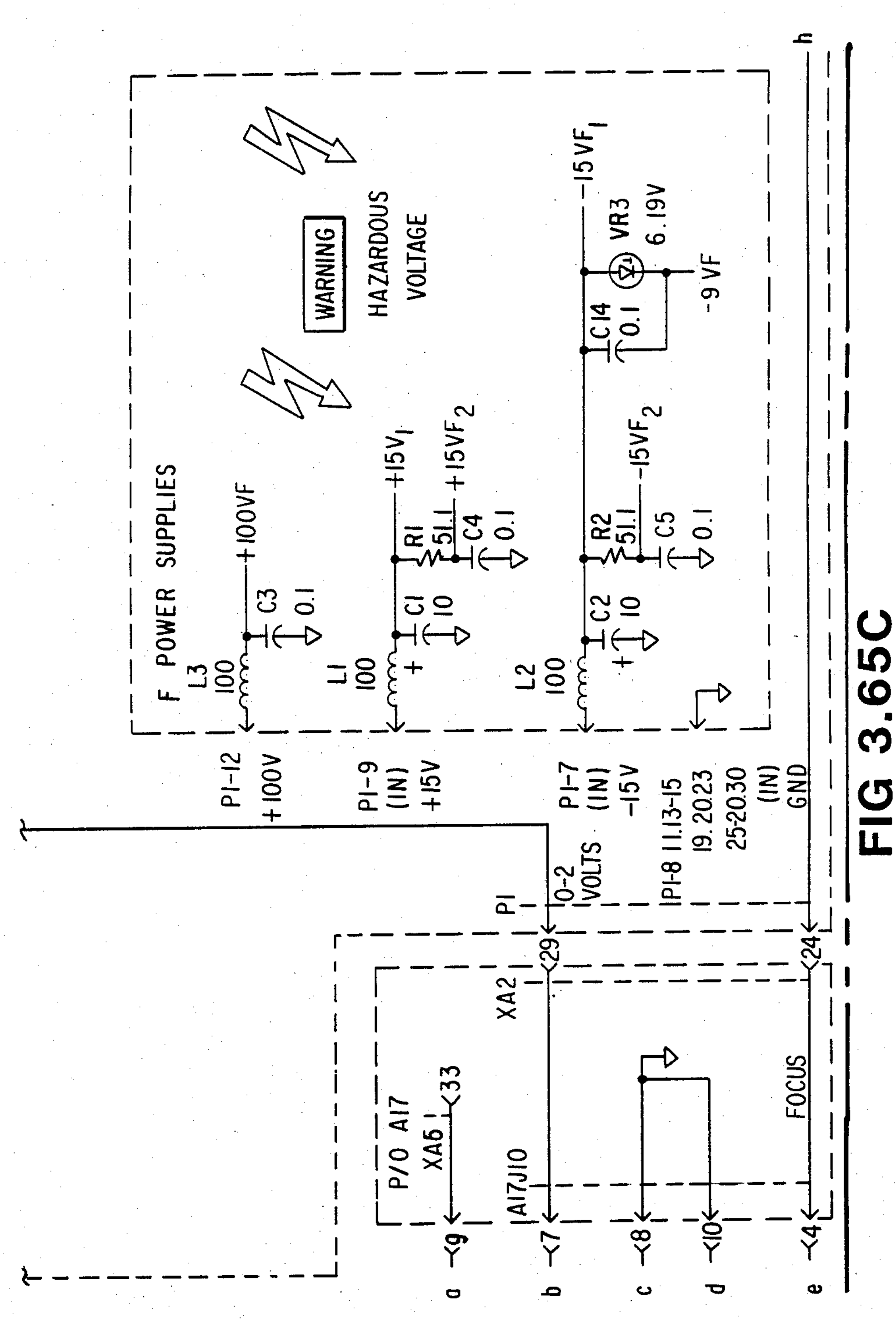
FIG 3.65C

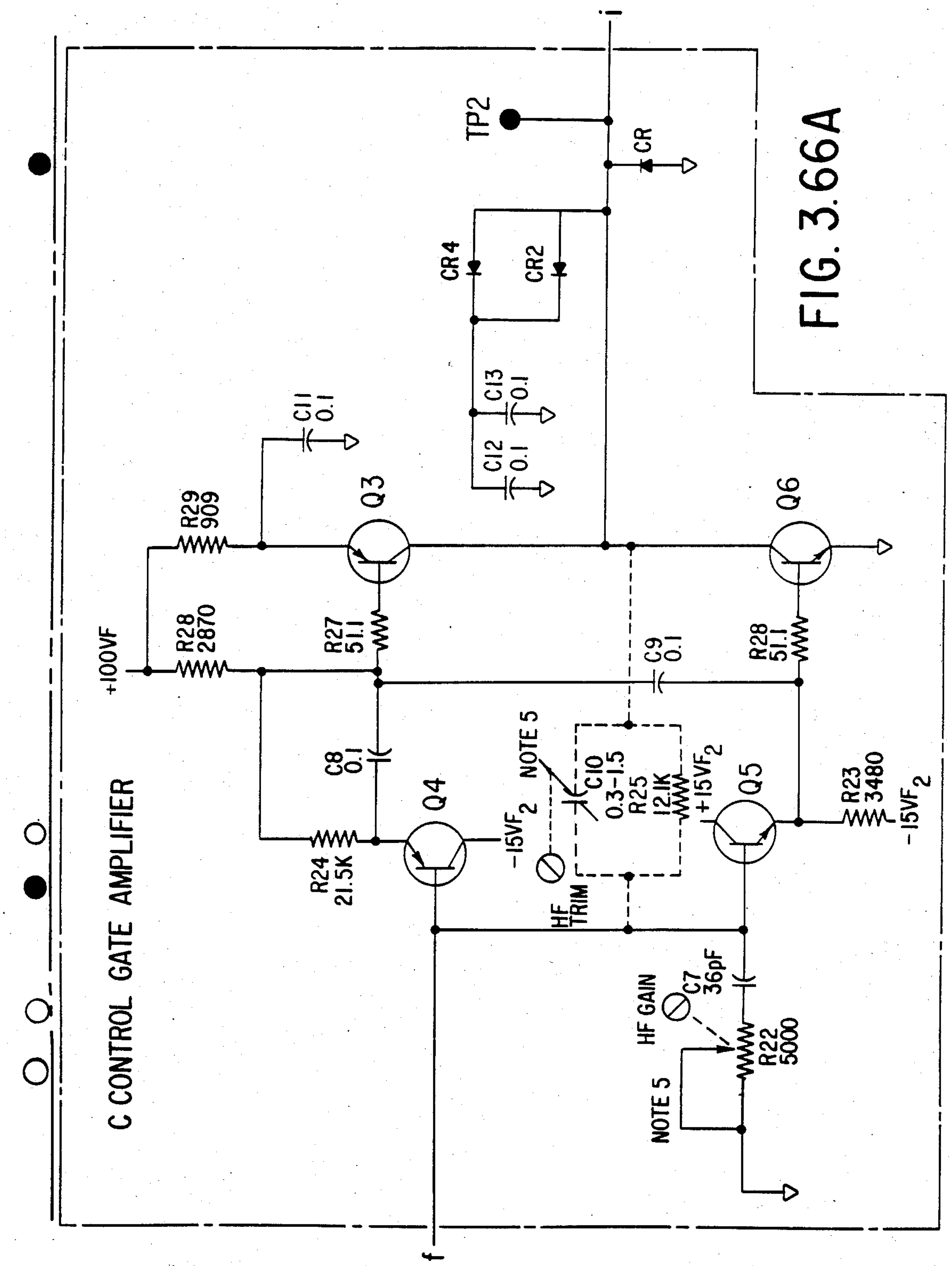
FIG. 3.66A

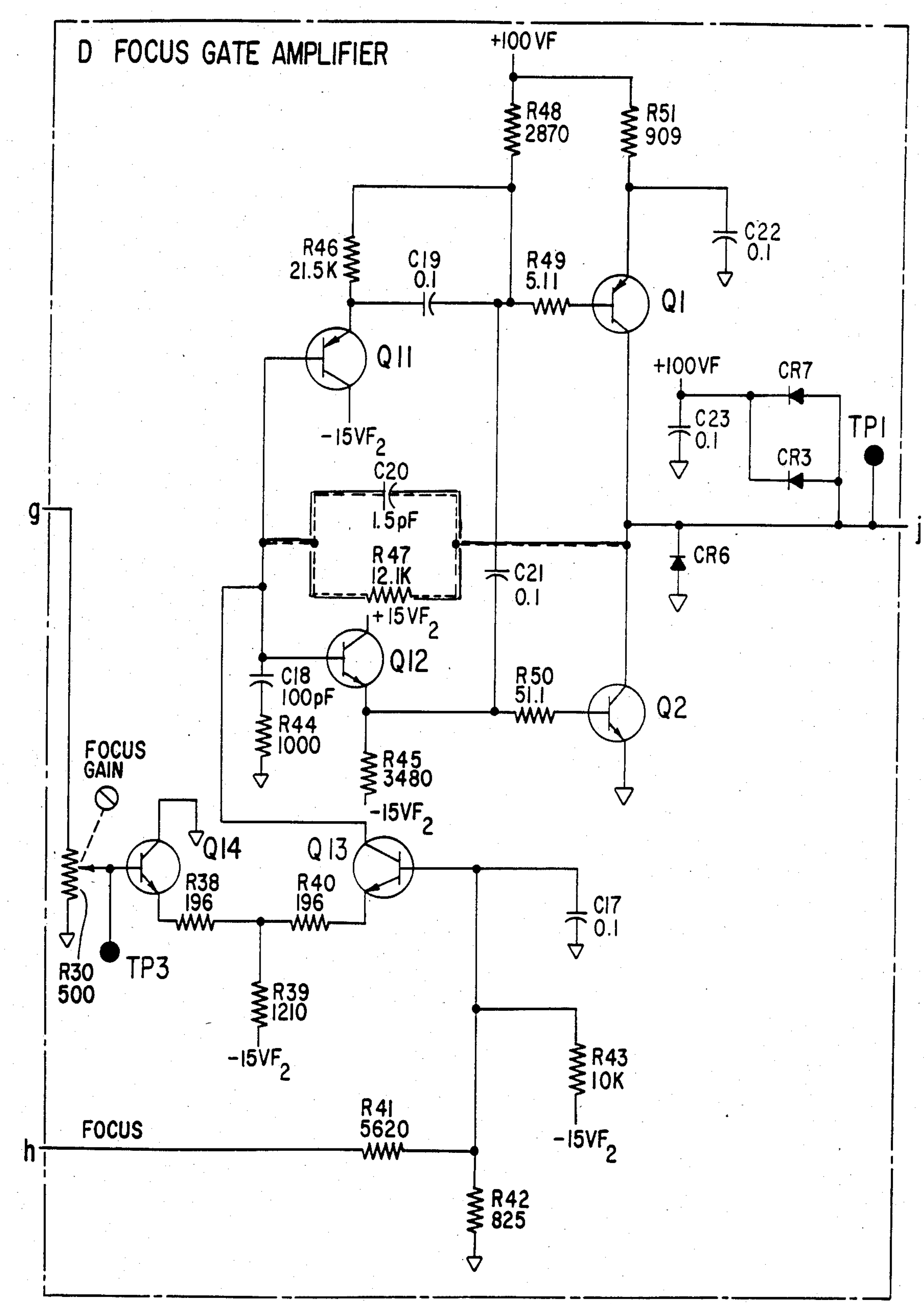
FIG. 3.66B

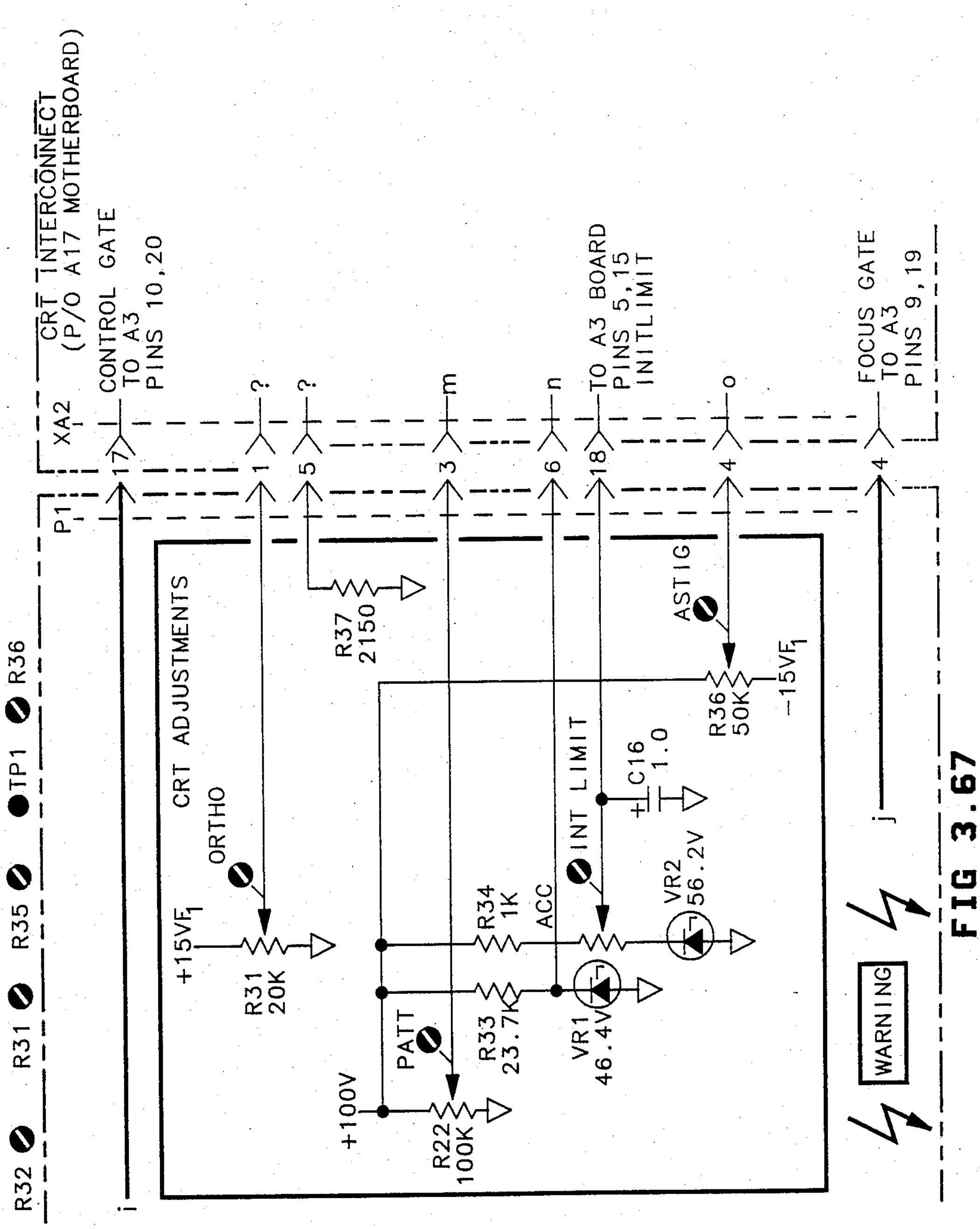
FIG 3.67

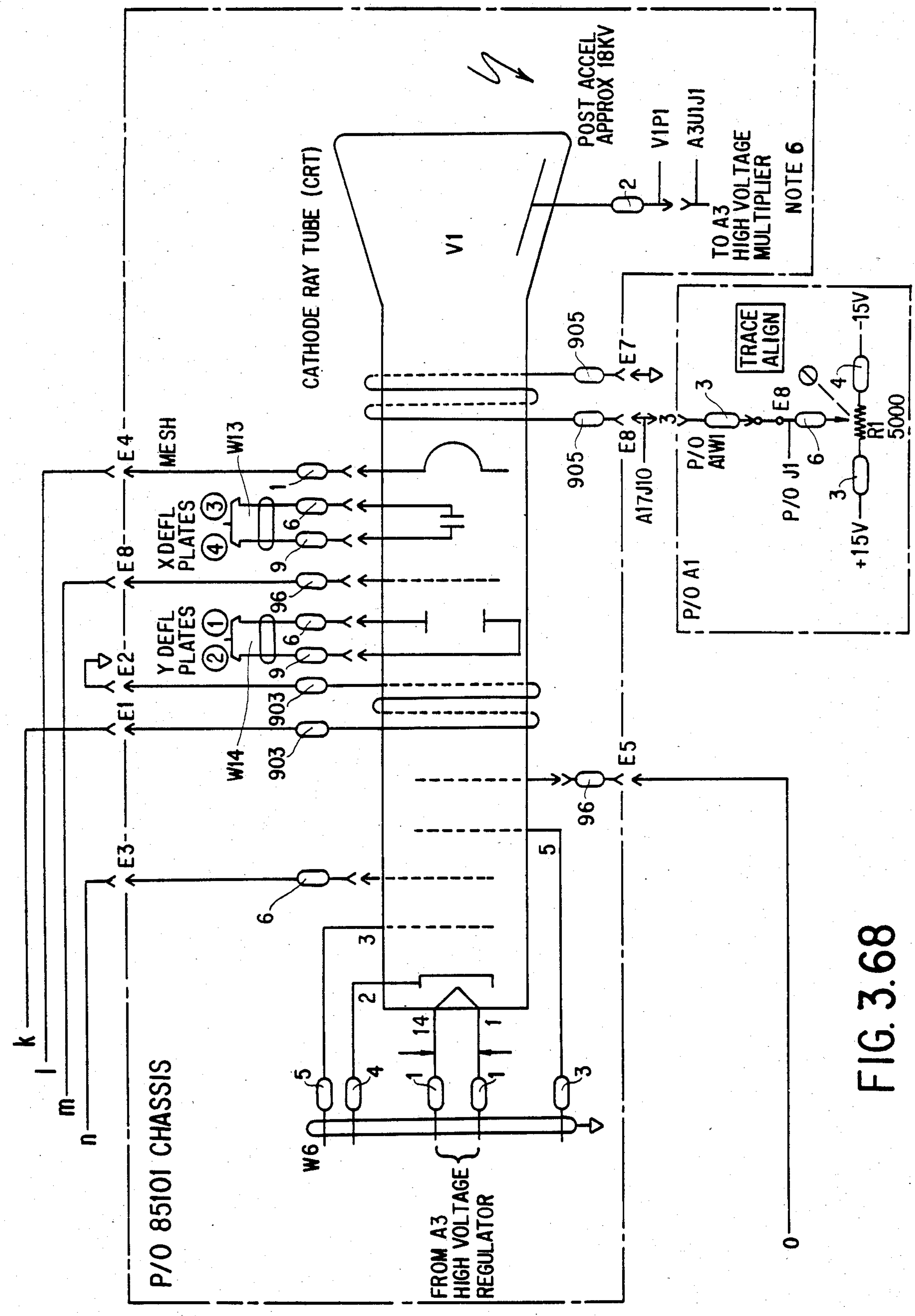
FIG. 3.68

MNEMONIC TABLE

| MNEMONIC | DESCRIPTION | SOURCE |
|---|---|---|
| ACC | WRITE GUNACCELERATOR | A2 |
| ASTIG | ASTIGMATISM | A2 |
| BASE | Q4 BASE DRIVE | A3 |
| COLL | Q4 COLLECTOR OUTPUT | Q4 CHASSIS |
| CONTROL GATE | CONTROL INPUT FOR INTENSITY | A2 |
| DGND | DIGITAL GROUND | A17 CI-NEG |
| FOCUS GATE | DYNAMIC FOCUS INPUT | A2 |
| HV FEEDBACK | HV CONTROL FEEDBACK | A3 |
| INT LIMIT | INTENSITY LIMIT | A2 |
| OSCILLATOR DRIVE | HV REGULATOR OUTPUT | A8 |
| +20V RAW | +20V UNREGULATED | A17 |

A3 HIGH VOLTAGE REGULATOR
85101-60003

P1

| PIN | SIGNAL | TO/FROM | FUNCTION BLOCK |
|---|---|---|---|
| 1 11 | COLL | A8 | A |
| 2 12 | BASE | A8 | A |
| 3 13 | OSCILLATOR DRIVE | A8 | A |
| 4 14 | +20 RAW | A8 | A |
| 5 15 | INT LIMIT | A2 | C |
| 5 15 | GND GND | | A A |
| 7 17 | HV FEEDBACK | A8 | B |
| 8 18 | GND GND | | A A |
| 9 19 | FOCUS GATE | A2 | D |
| 10 20 | CONTROL GATE | A2 | C |

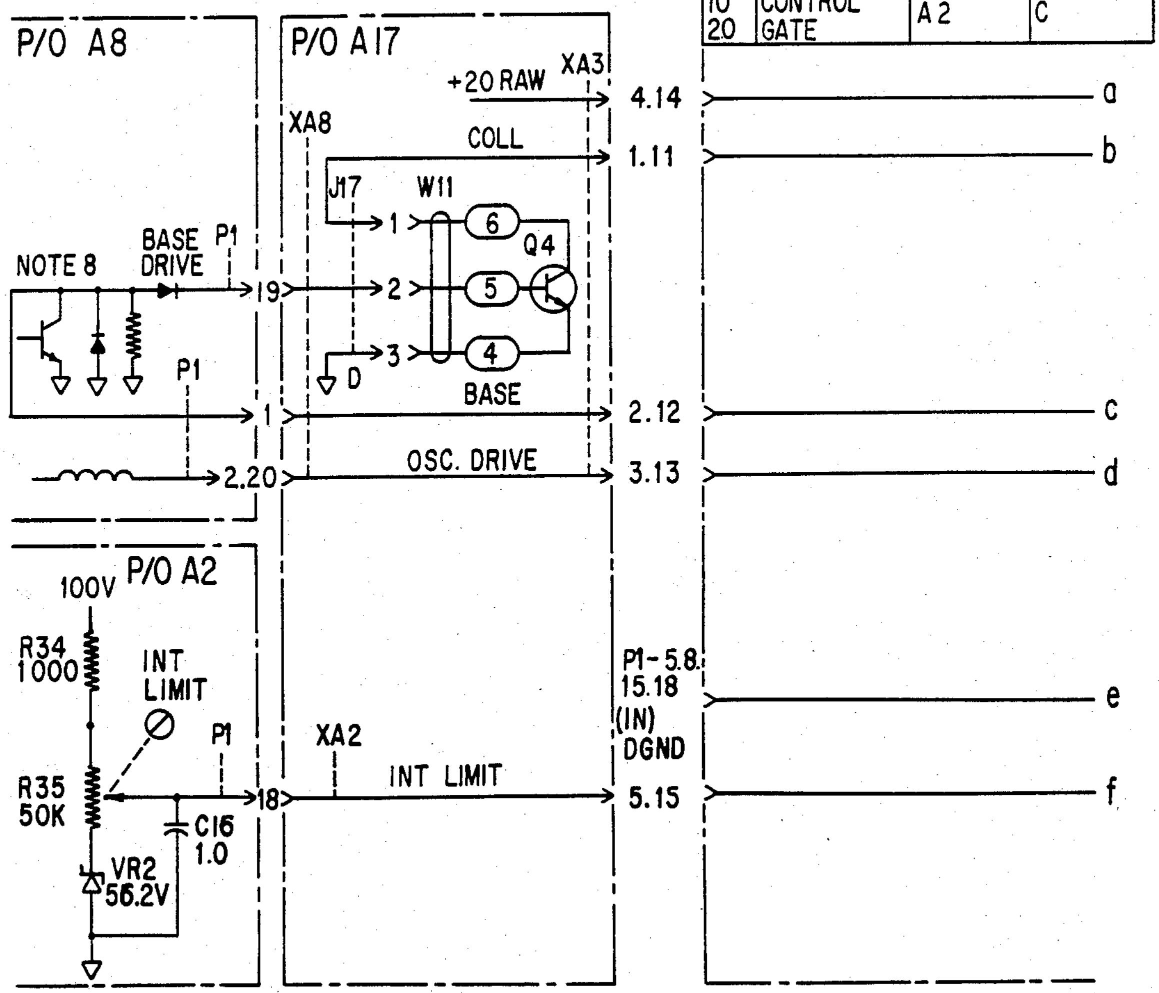

FIG. 3.70

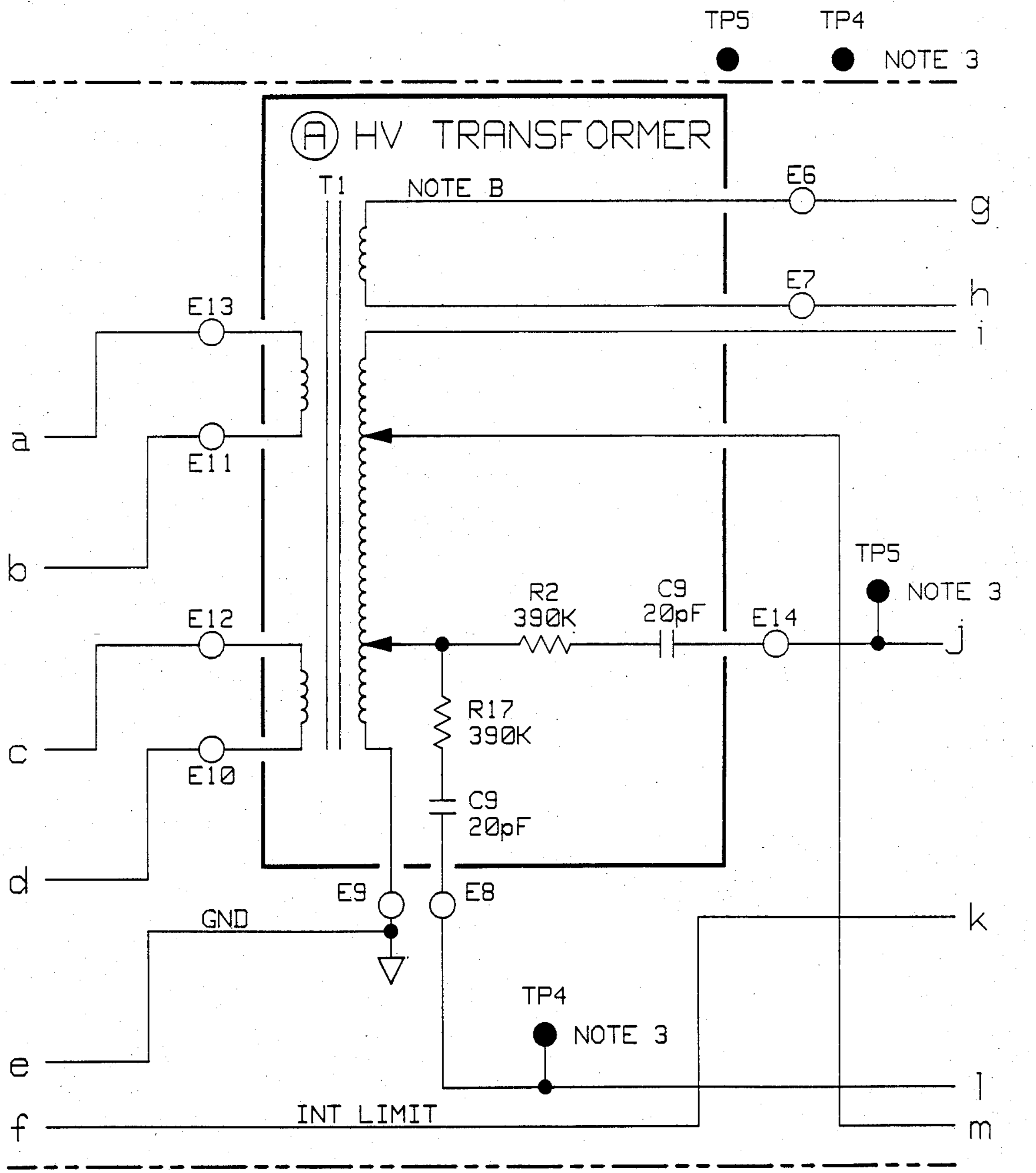
FIG 3.71

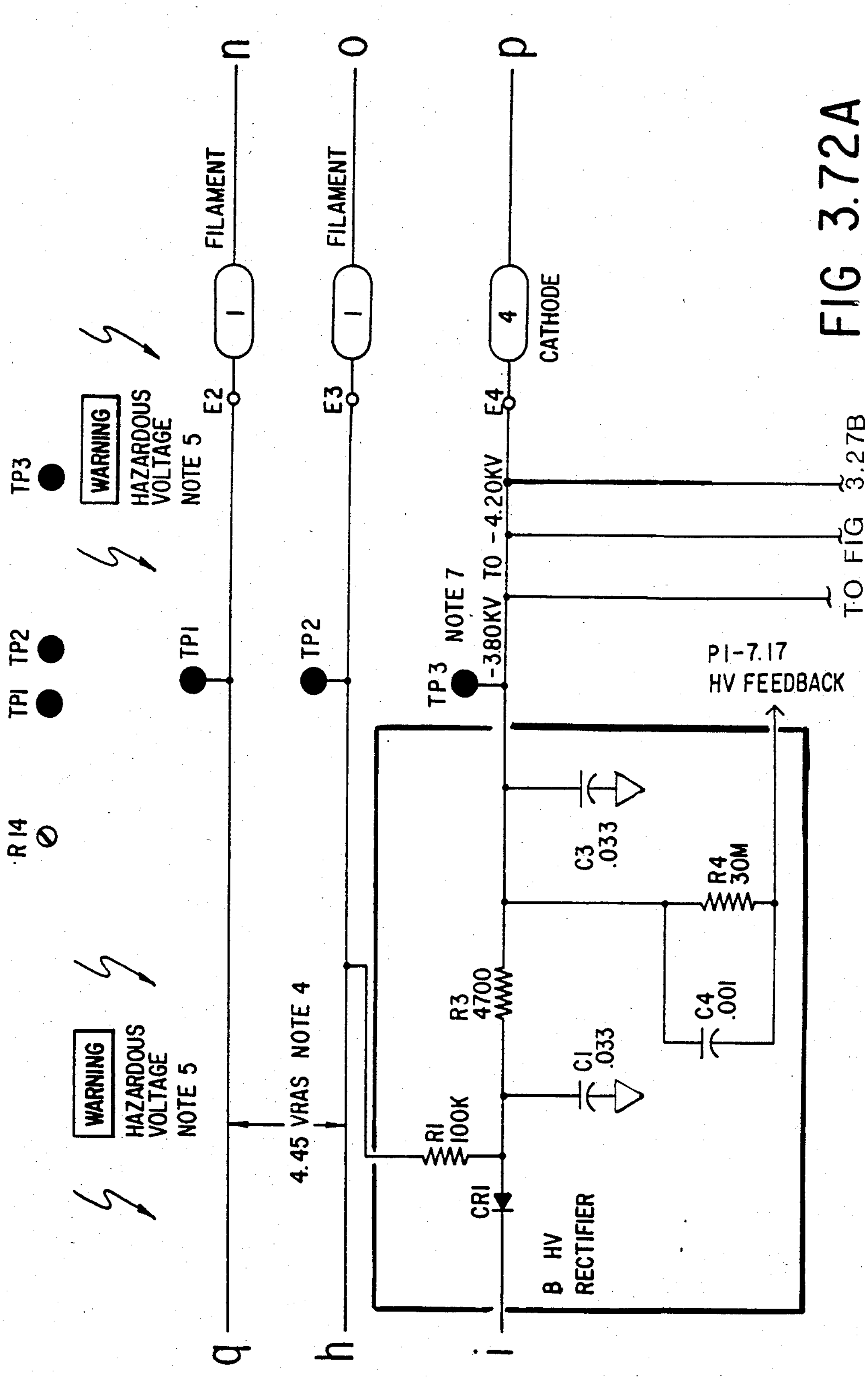
FIG 3.72A

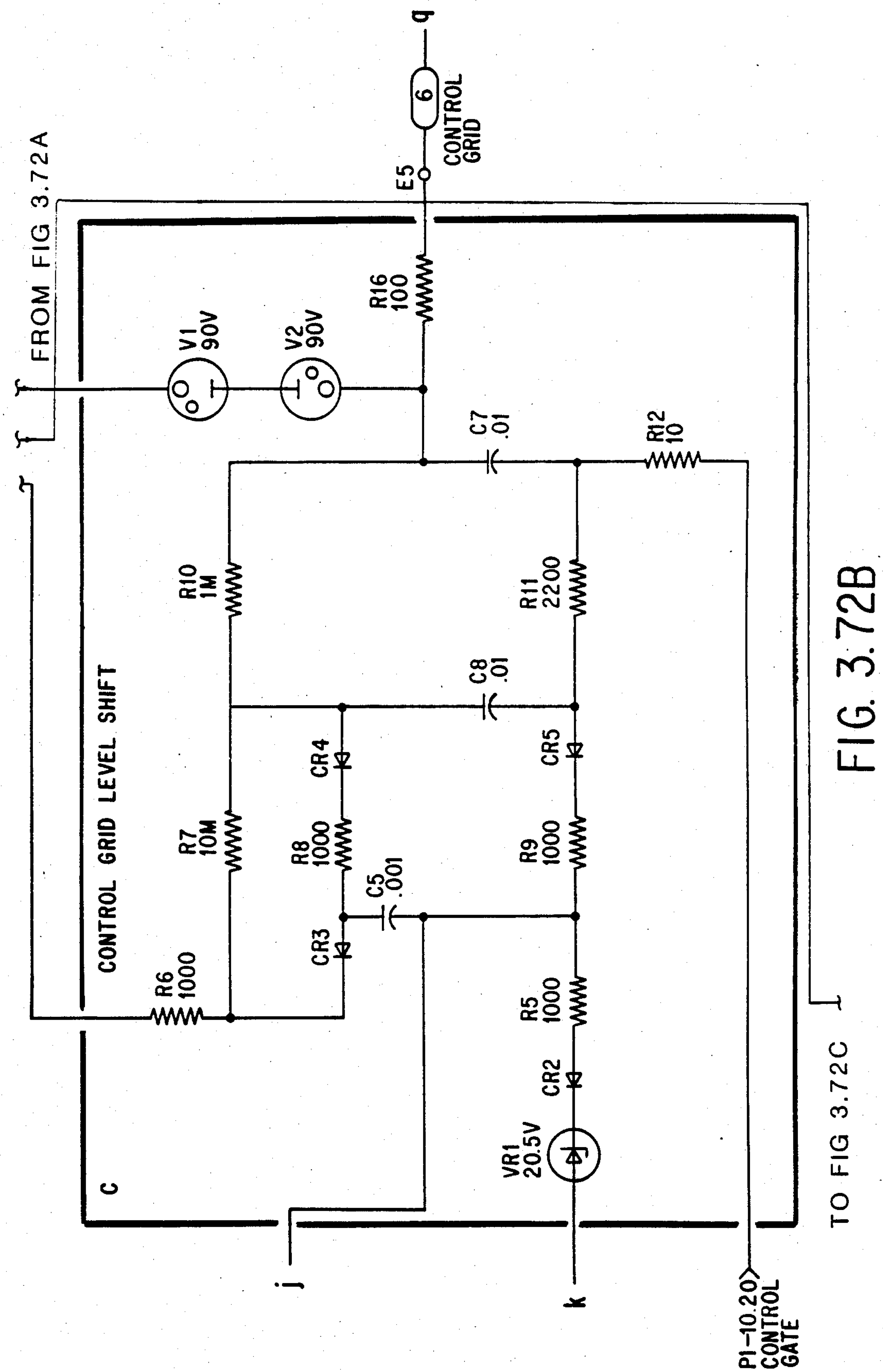
FIG. 3.72B

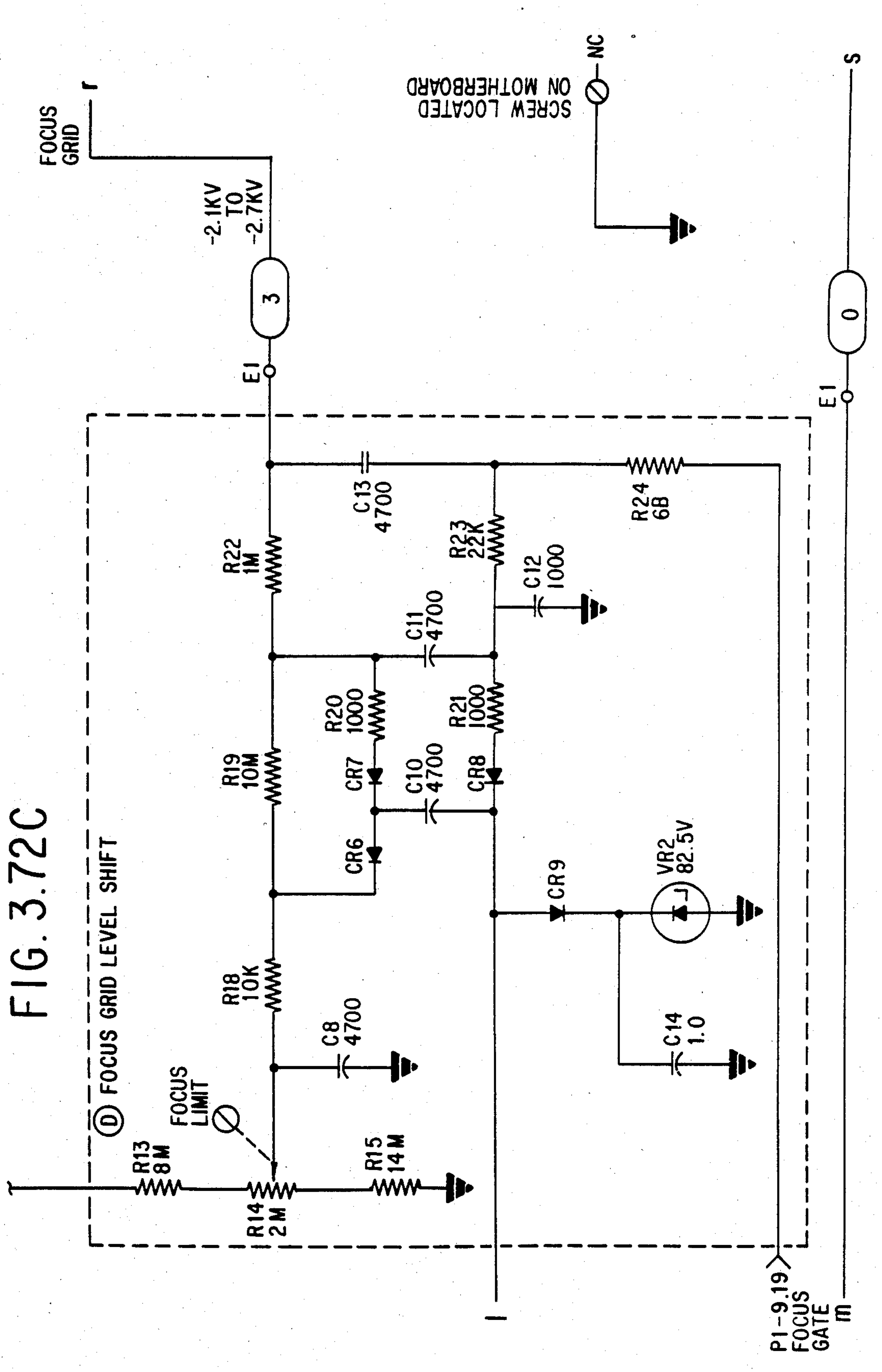
FIG. 3.72C

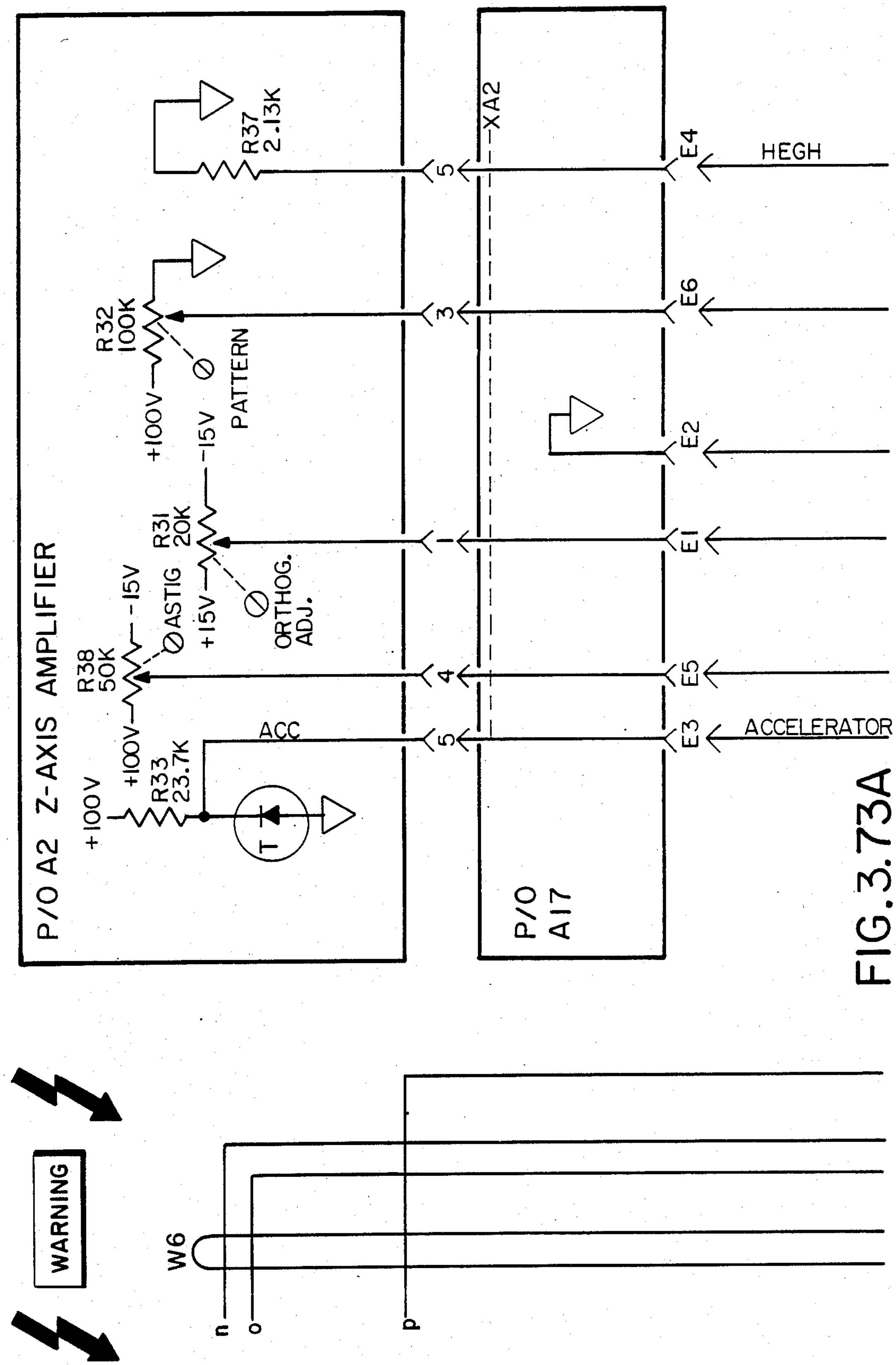
FIG.3.73A

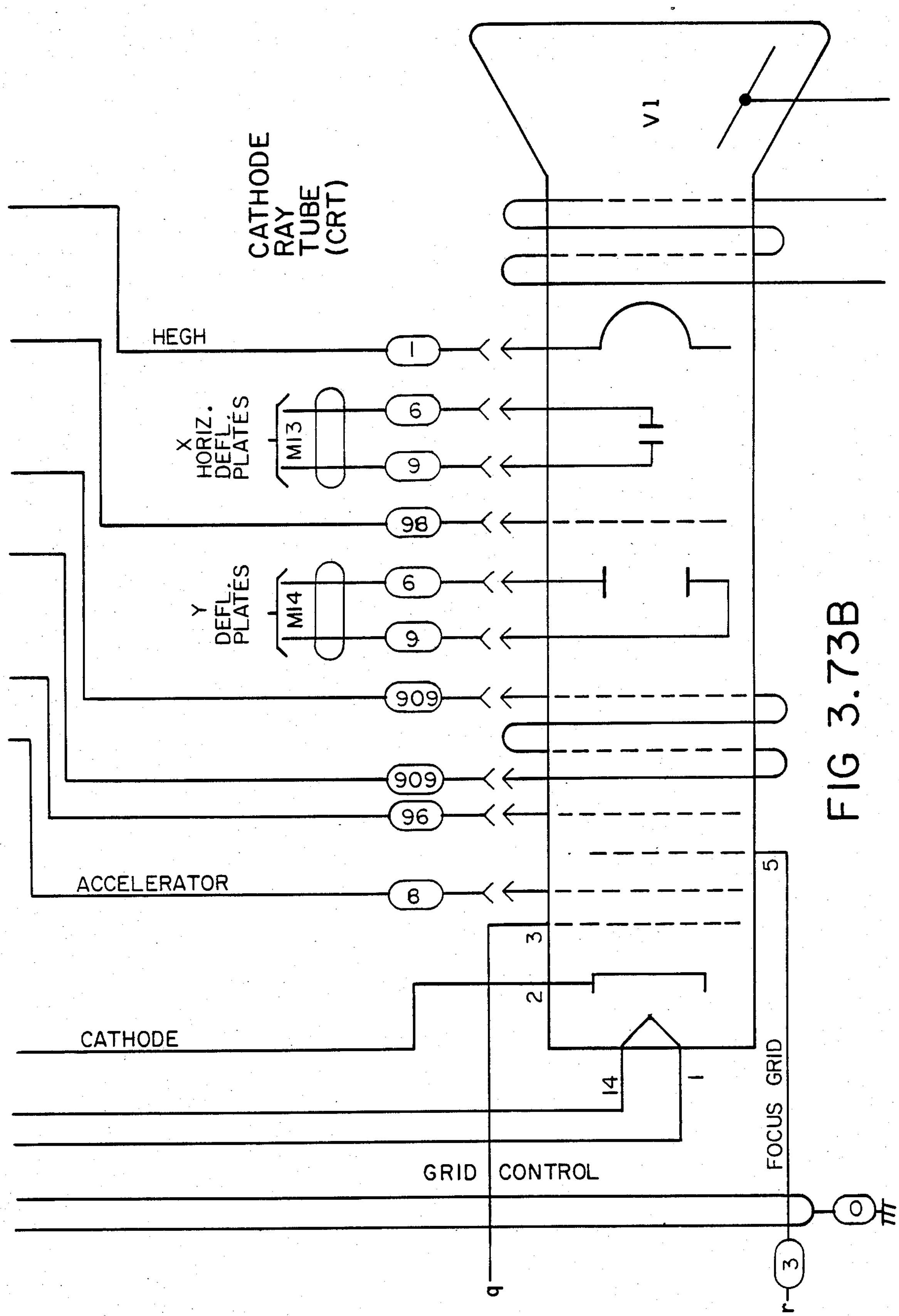
FIG 3.73B

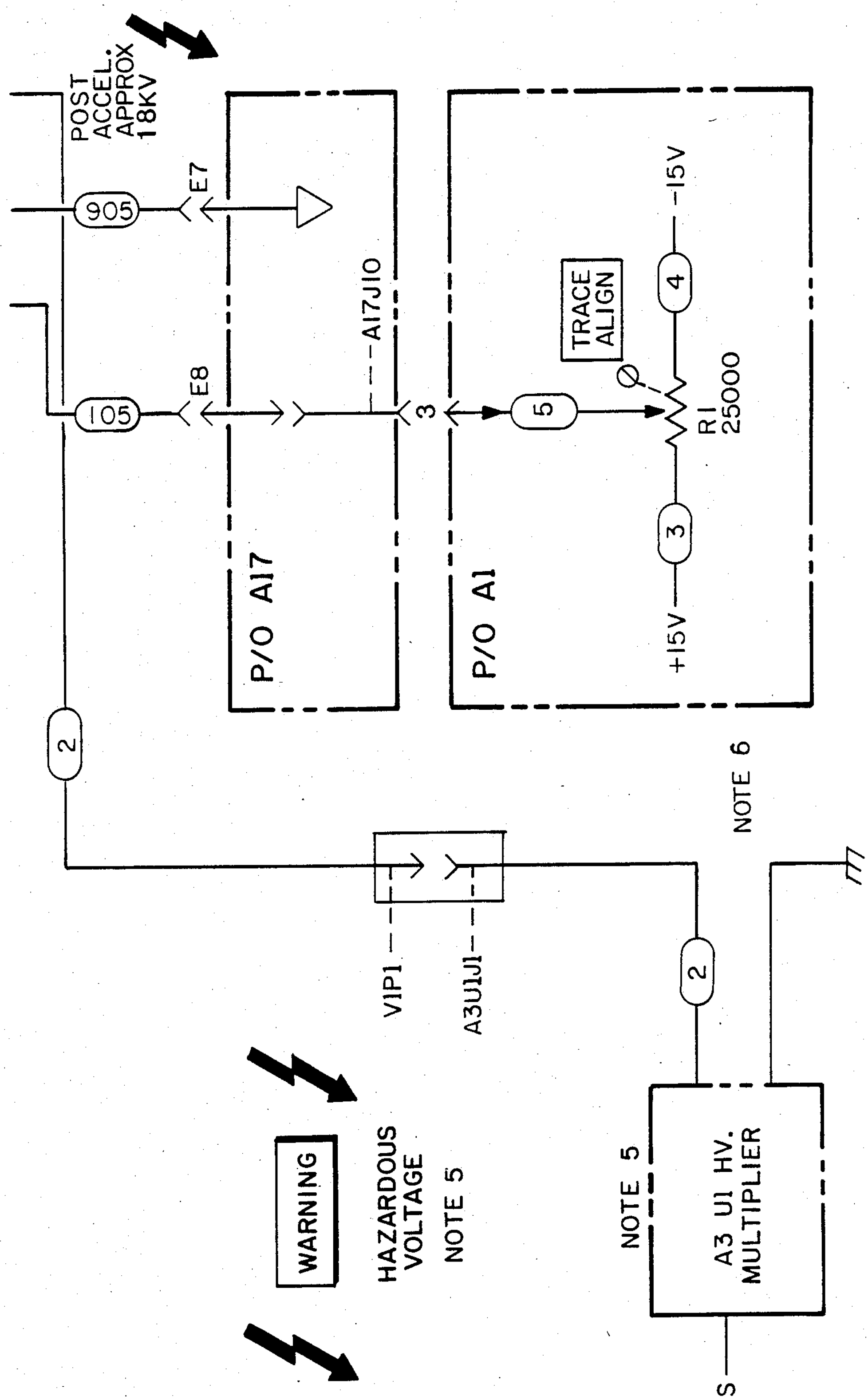
FIG 3.73C

A4 X DEFLECTION AMPLIFIER
A5 Y DEFLECTION AMPLIFIER

P1 85101-60004

| PIN | SIGNAL | TO/FROM | FUNCTION BLOCK |
|---|---|---|---|
| 1<br>16 | LGX/LGY<br>INPUT | A5 P1-5/7 | A |
| 2<br>17 | AGND<br>AGND | A17 CI-NEG | F |
| 3<br>18 | NC<br>NC | | |
| 4<br>19 | NC<br>NC | | |
| 5<br>20 | AUX-X/AUX-Y | REAR PANEL<br>AUX OUT | B |
| 6<br>21 | NC<br>NC | | |
| 7<br>22 | -15VF1<br>-15VF1 | A17L5.L8 | F |
| 8<br>23 | AGND<br>AGND | A17 CI-NEG | F |
| 9<br>24 | +15VF1<br>+15VF1 | A17L4.L7 | F |
| 10<br>25 | NC<br>NC | | |
| 11<br>26 | NC<br>NC | | |
| 12<br>27 | +100VF<br>+100VF | A17L3 | F |
| 13<br>28 | NC<br>NC | | |
| 14<br>29 | AGND<br>AGND | A17 CI-NEG | F |
| 15<br>30 | NC<br>NC | | |

FIG 3.75A

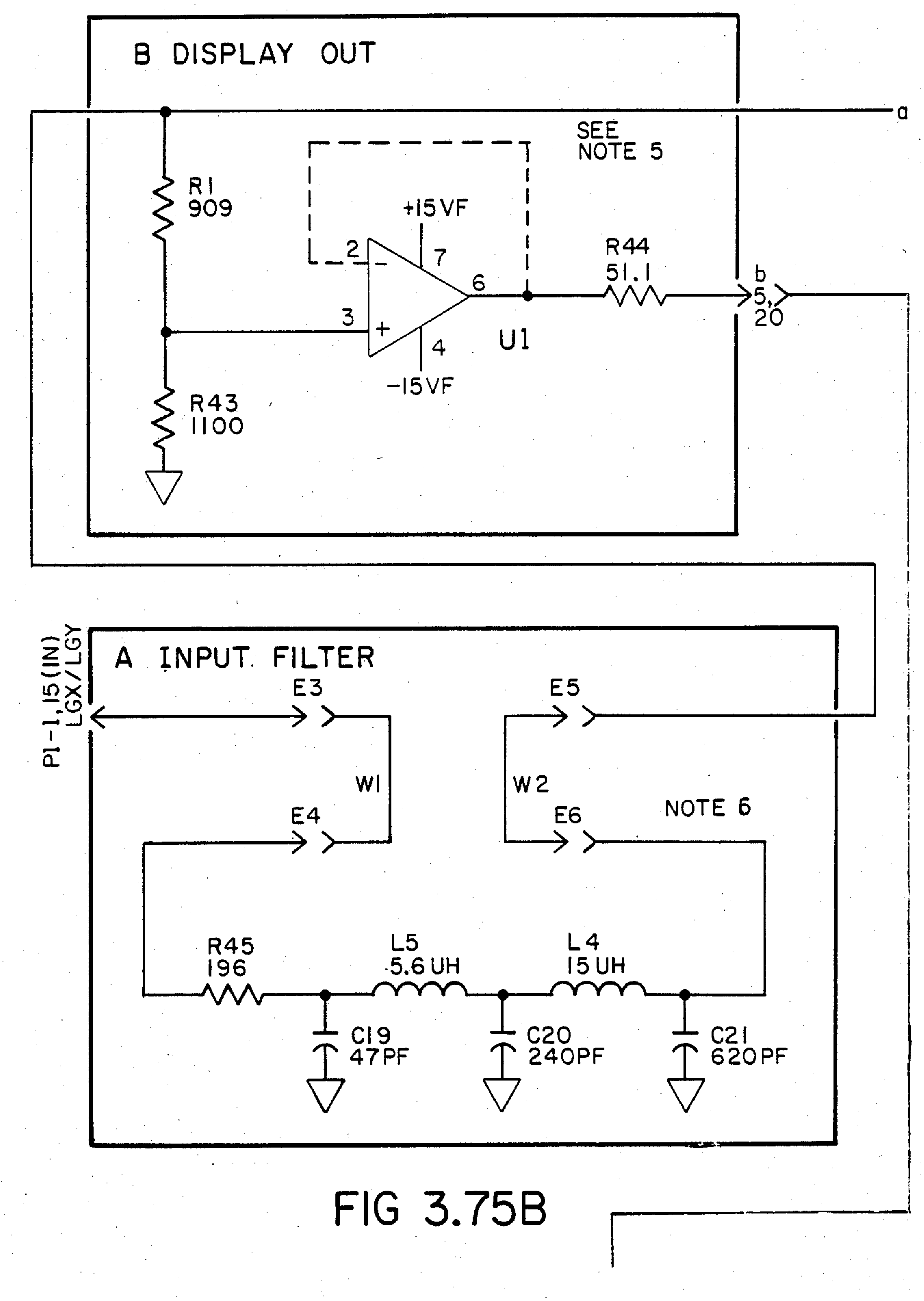
FIG 3.75B

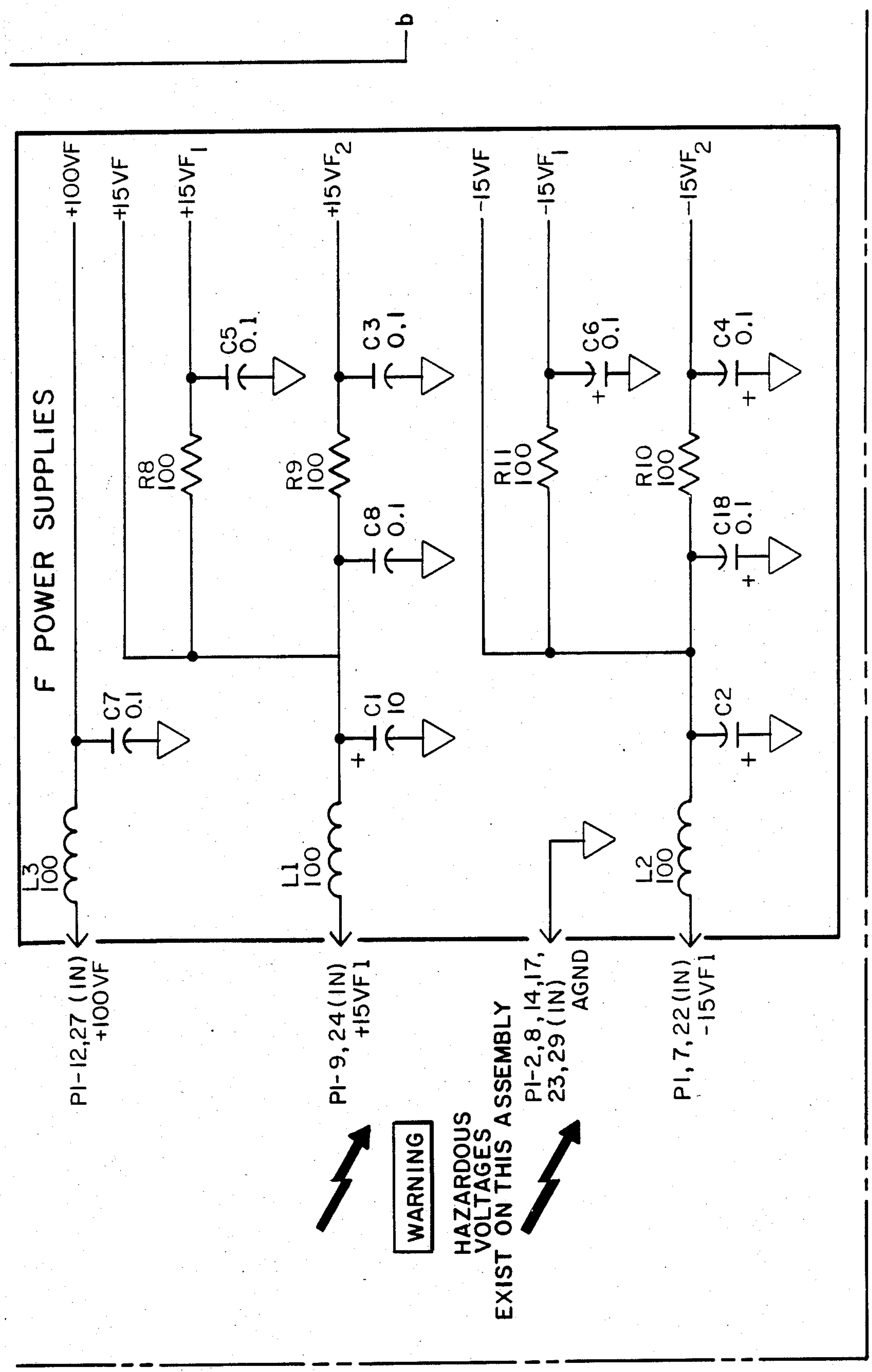
FIG 3.75C

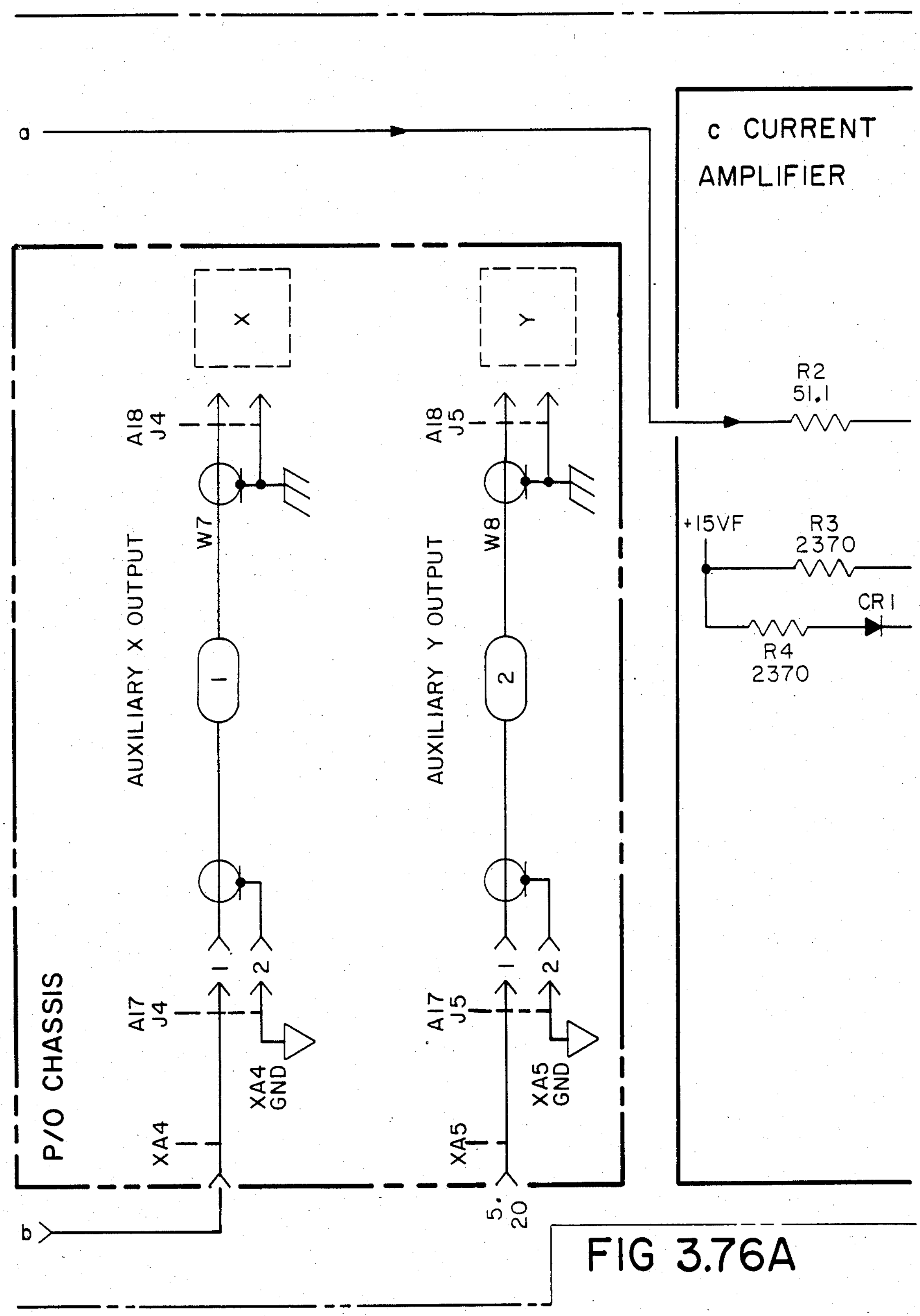
FIG 3.76A

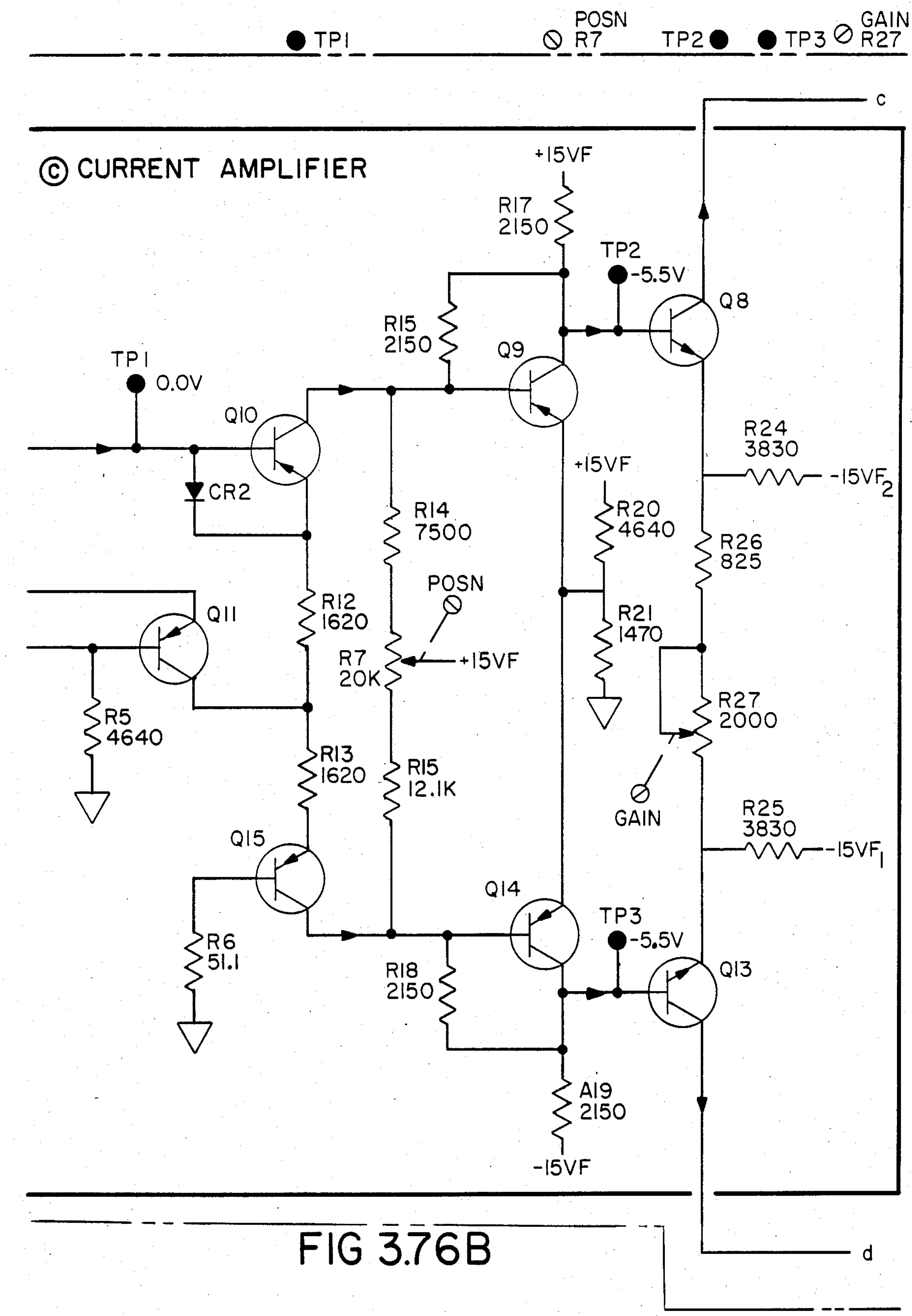
FIG 3.76B

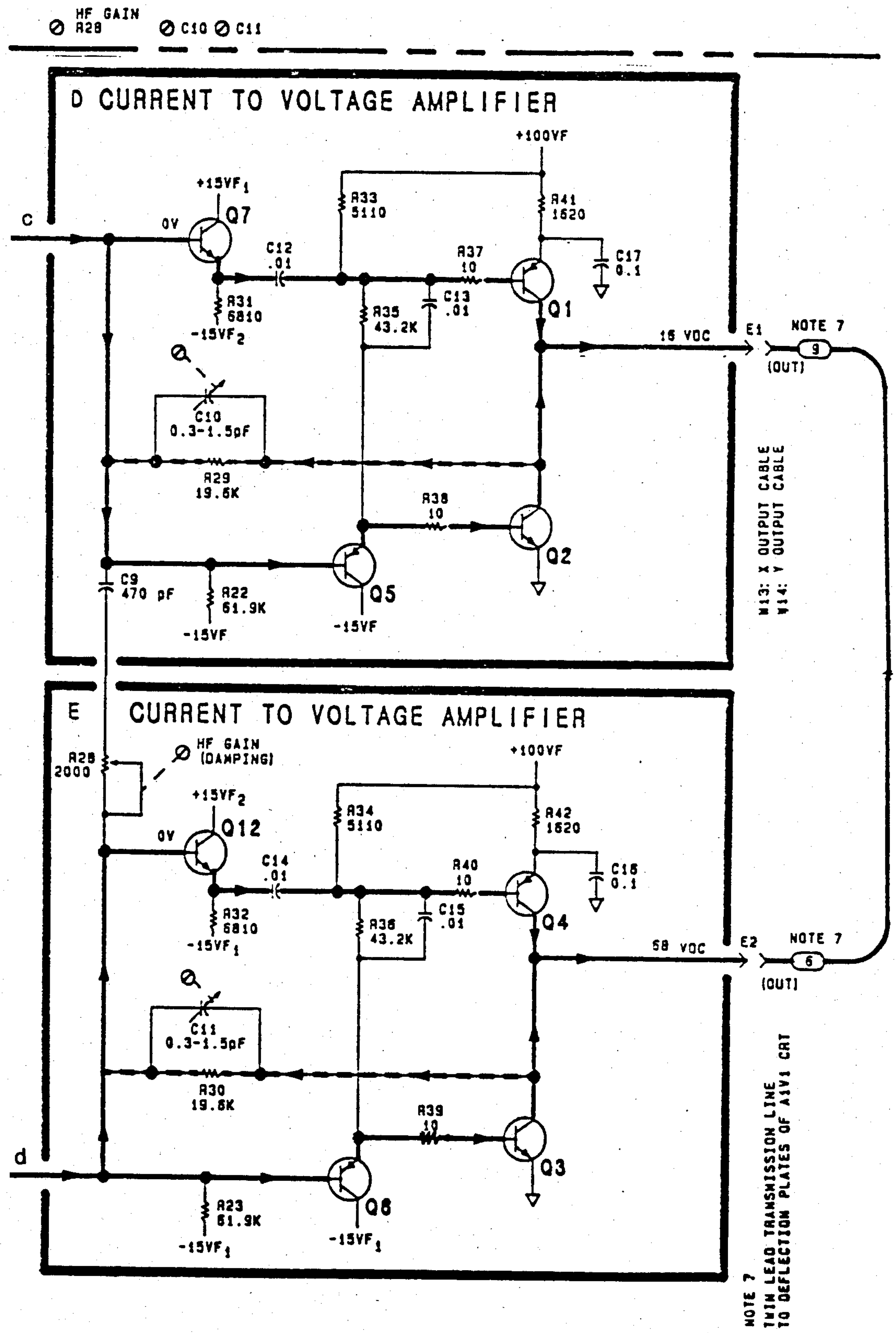
FIG 3.77

FIG 3.78
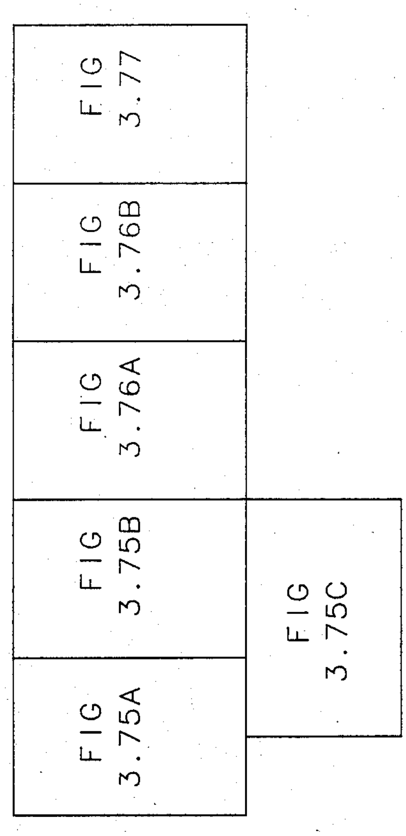
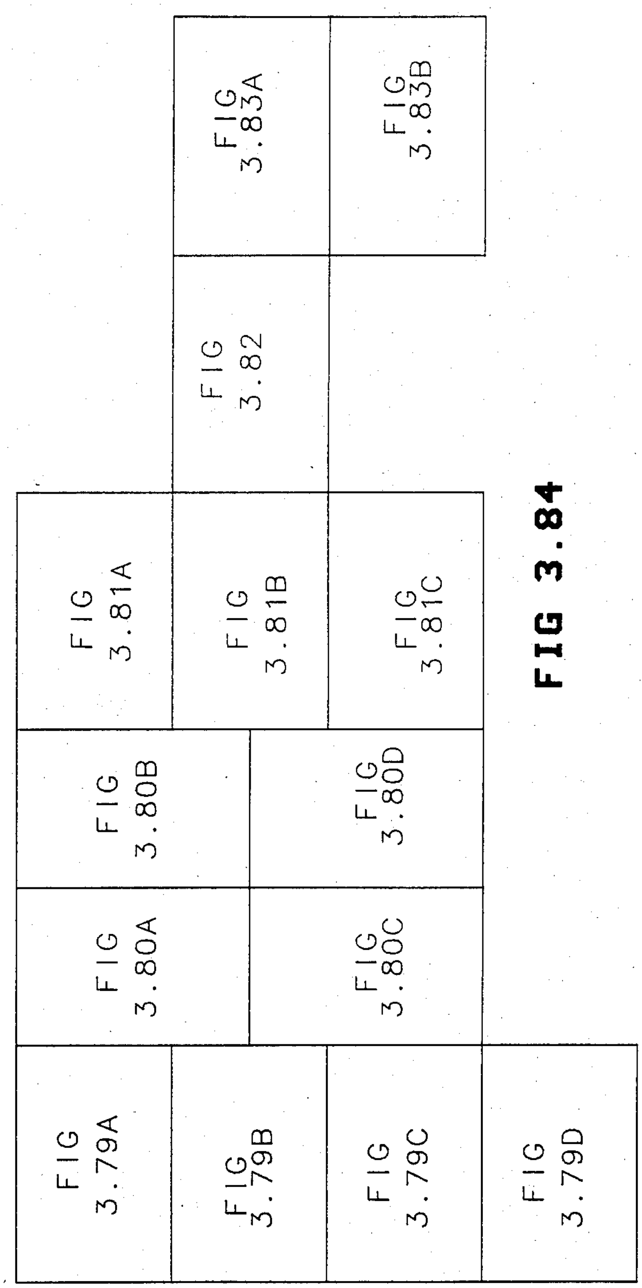
FIG 3.84

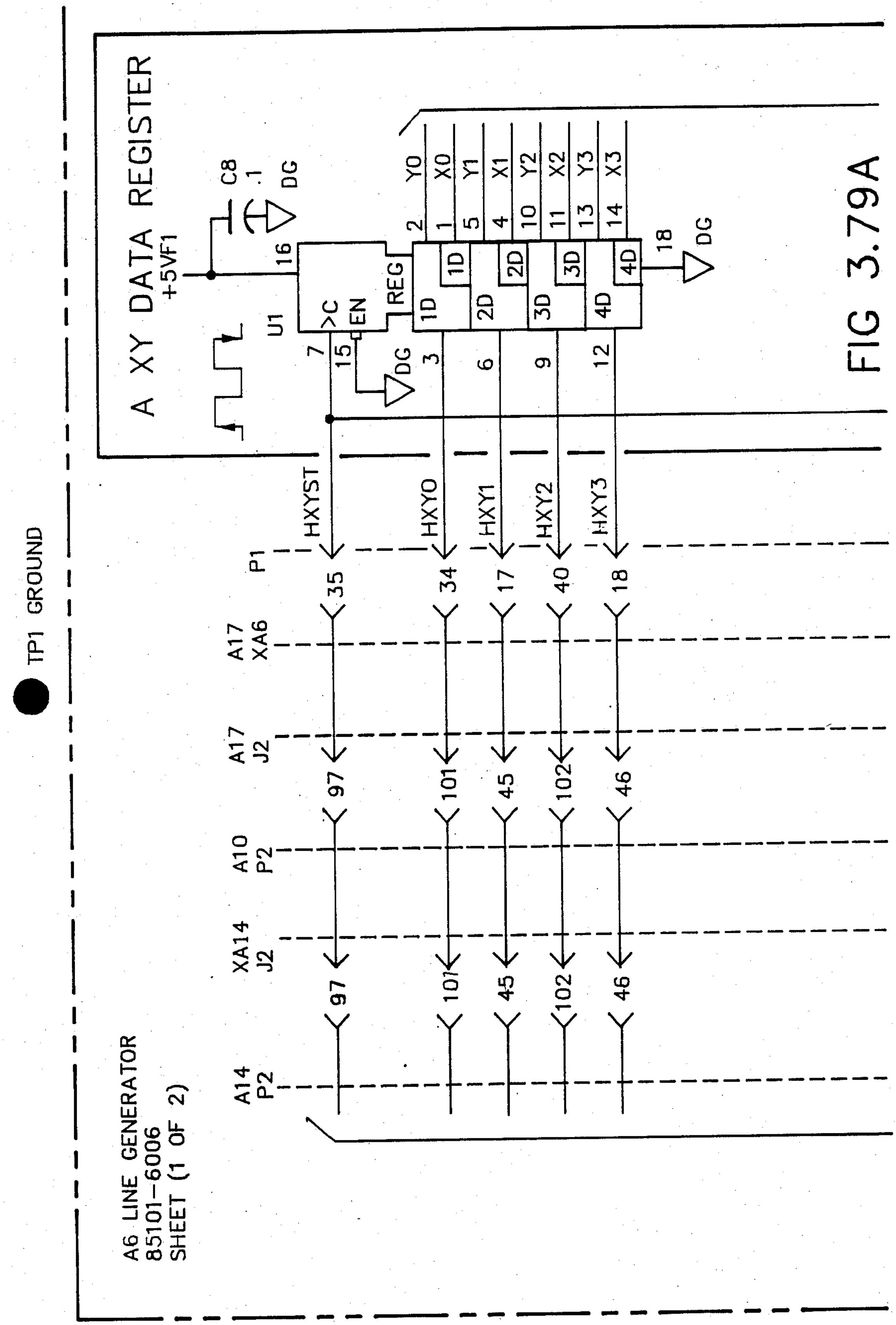
FIG 3.79A

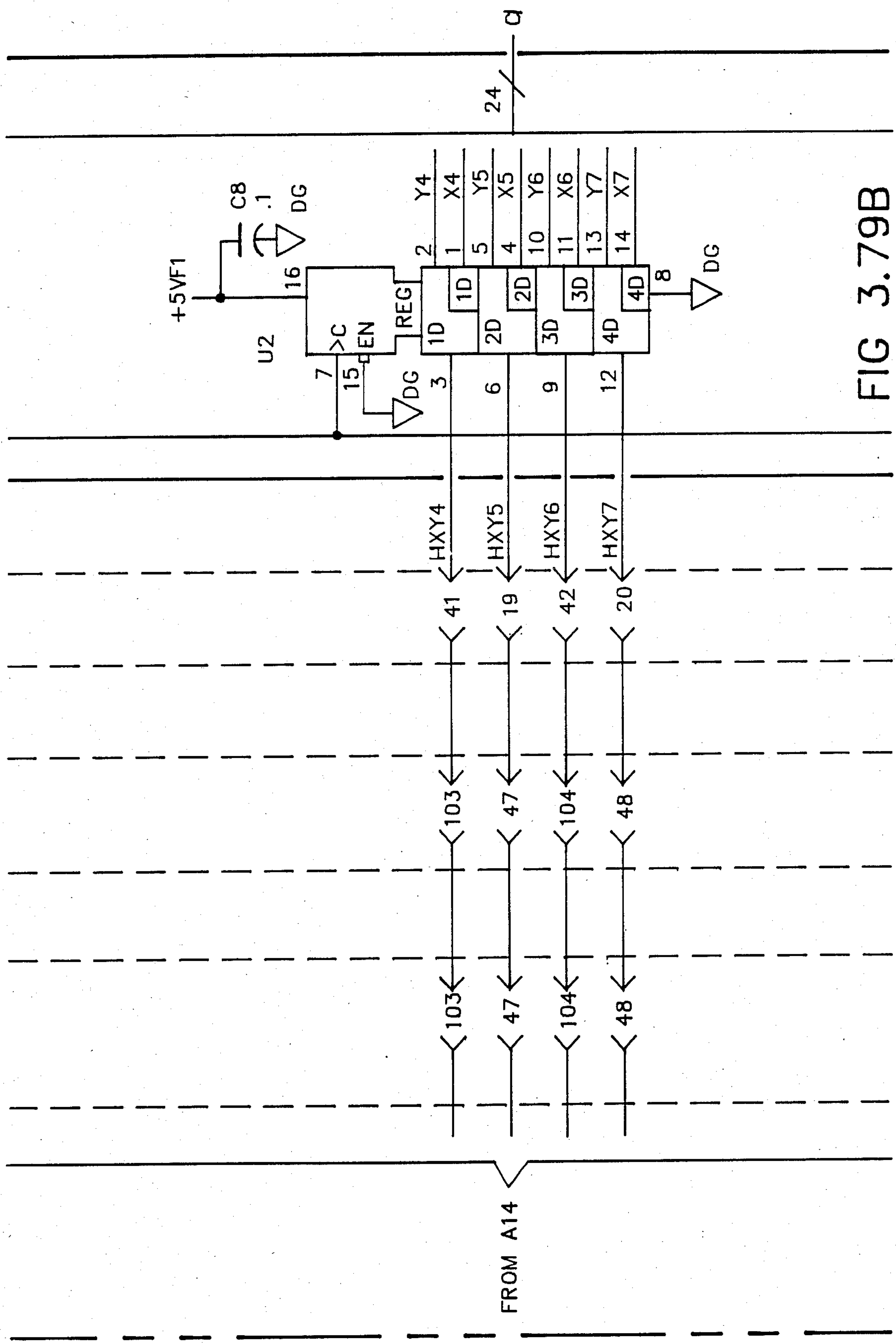
FIG 3.79B

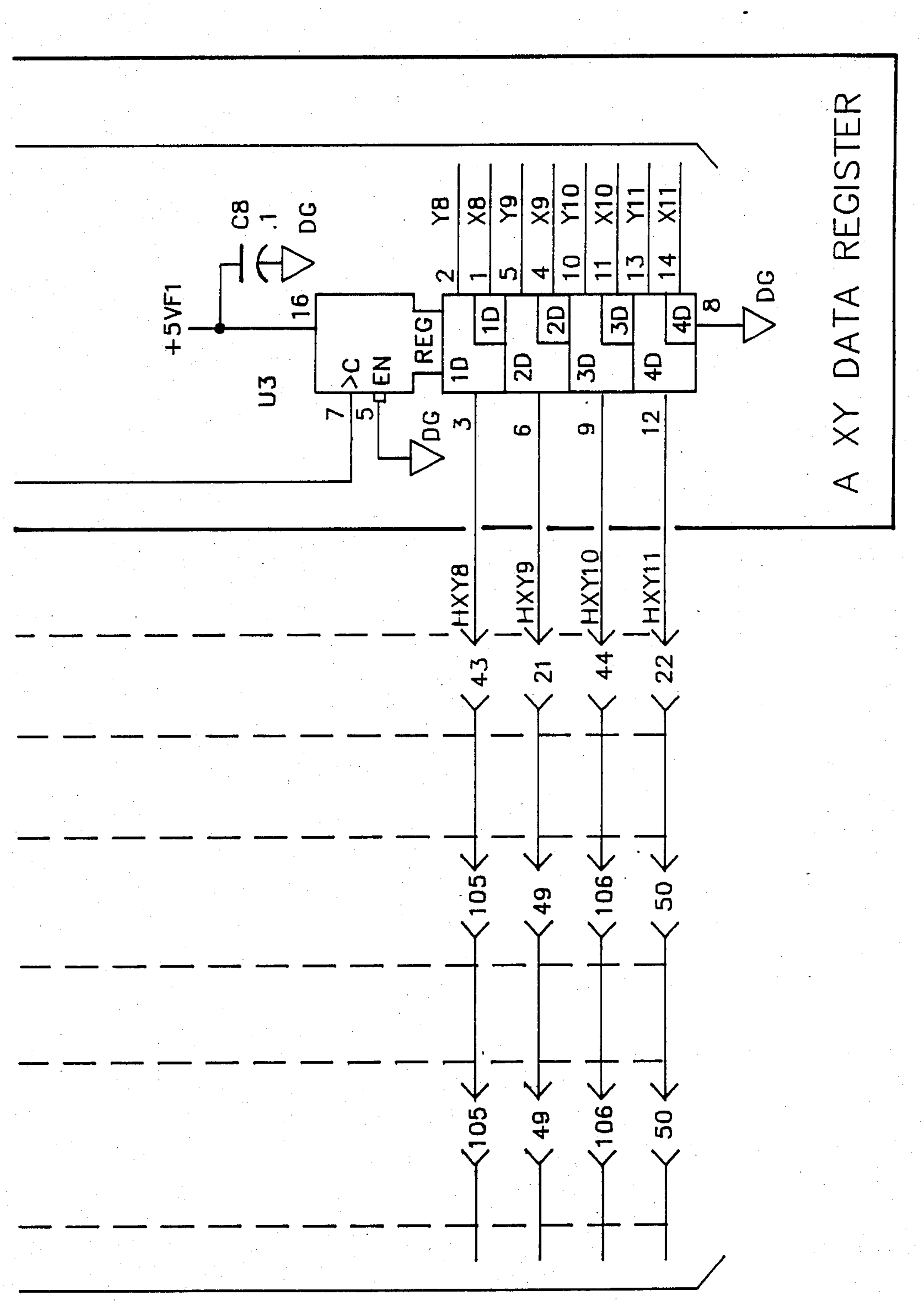
FIG 3.79C

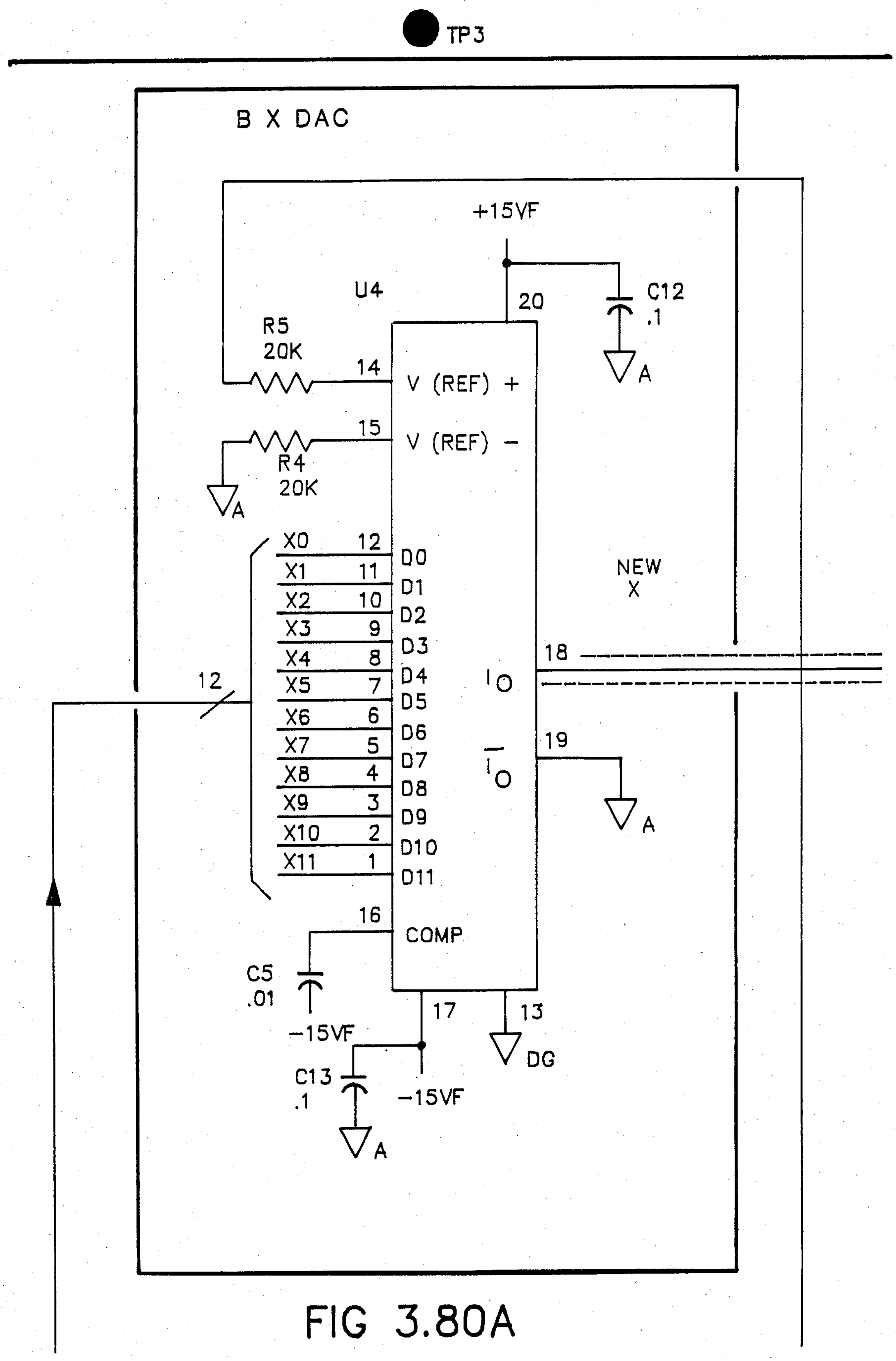
FIG 3.80A

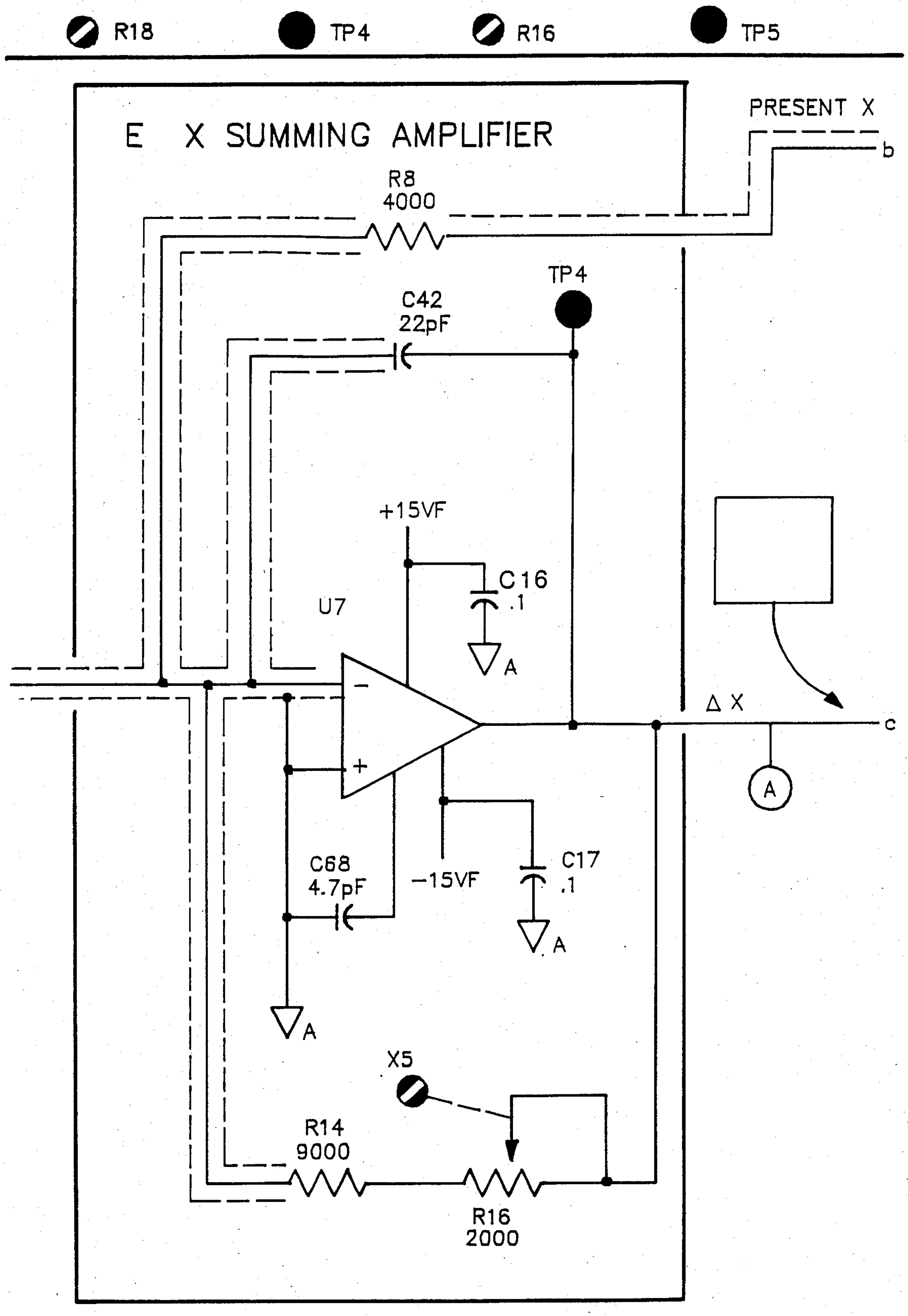
FIG 3.80B

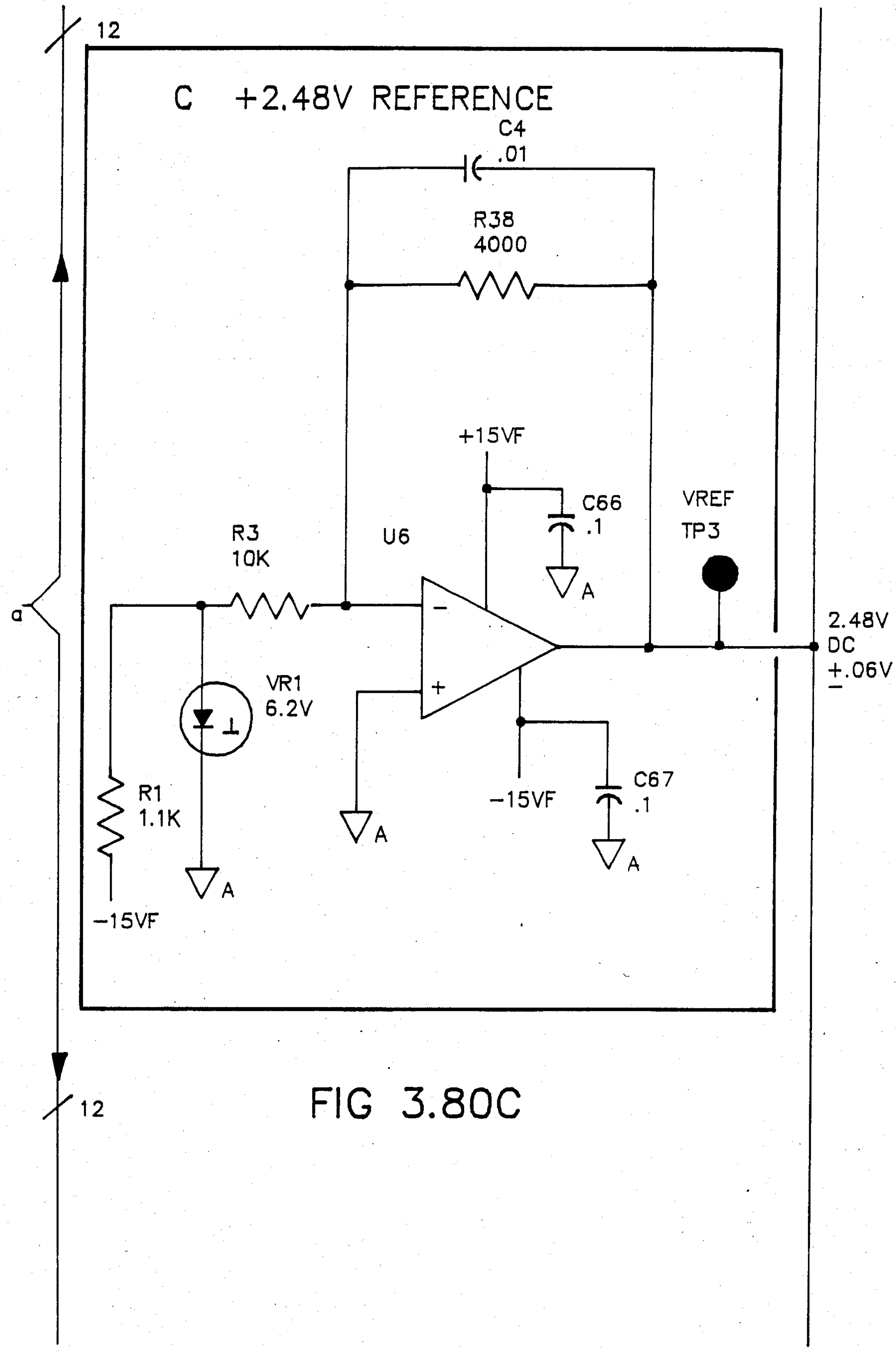
FIG 3.80C

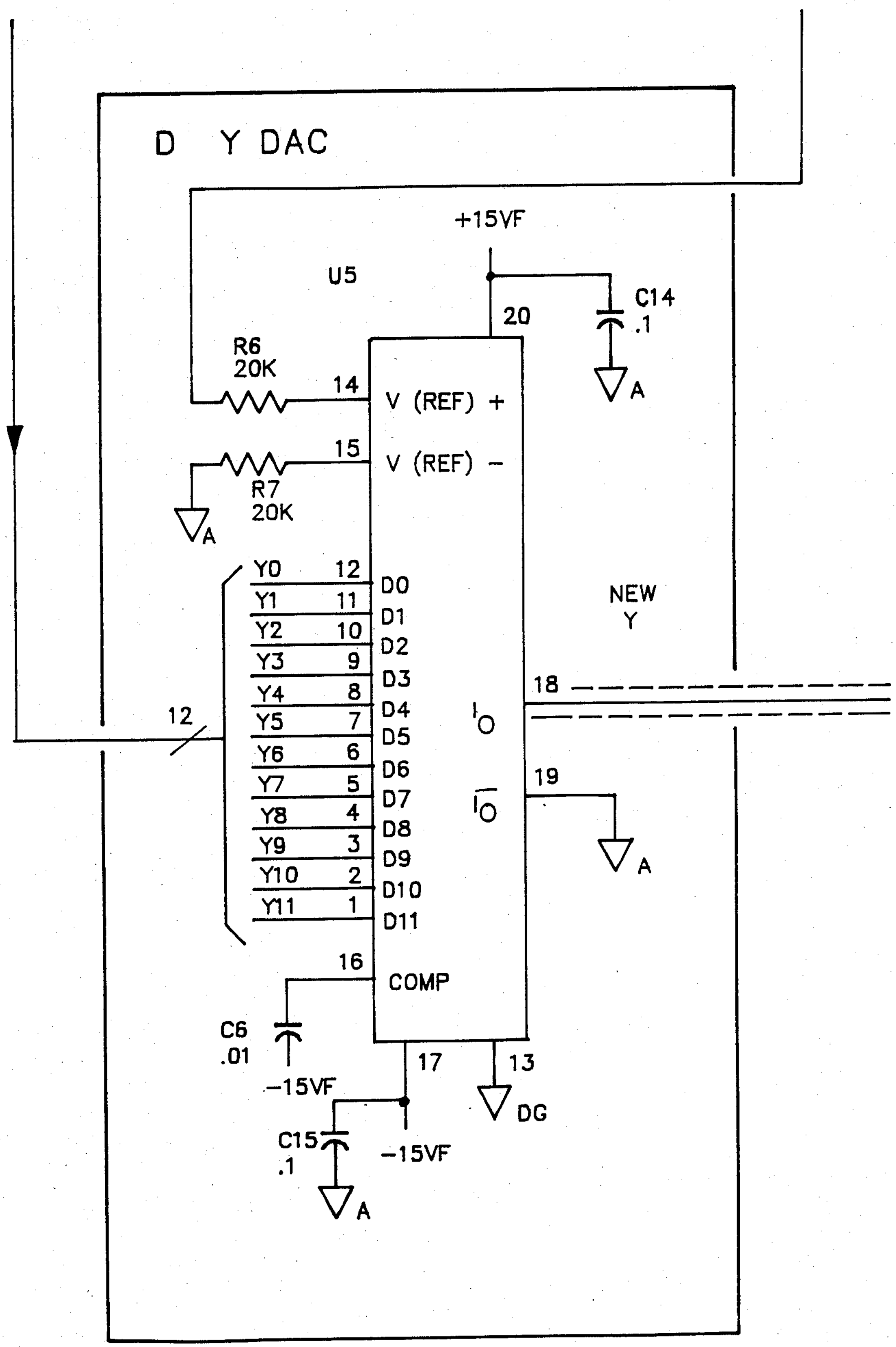
FIG 3.80D

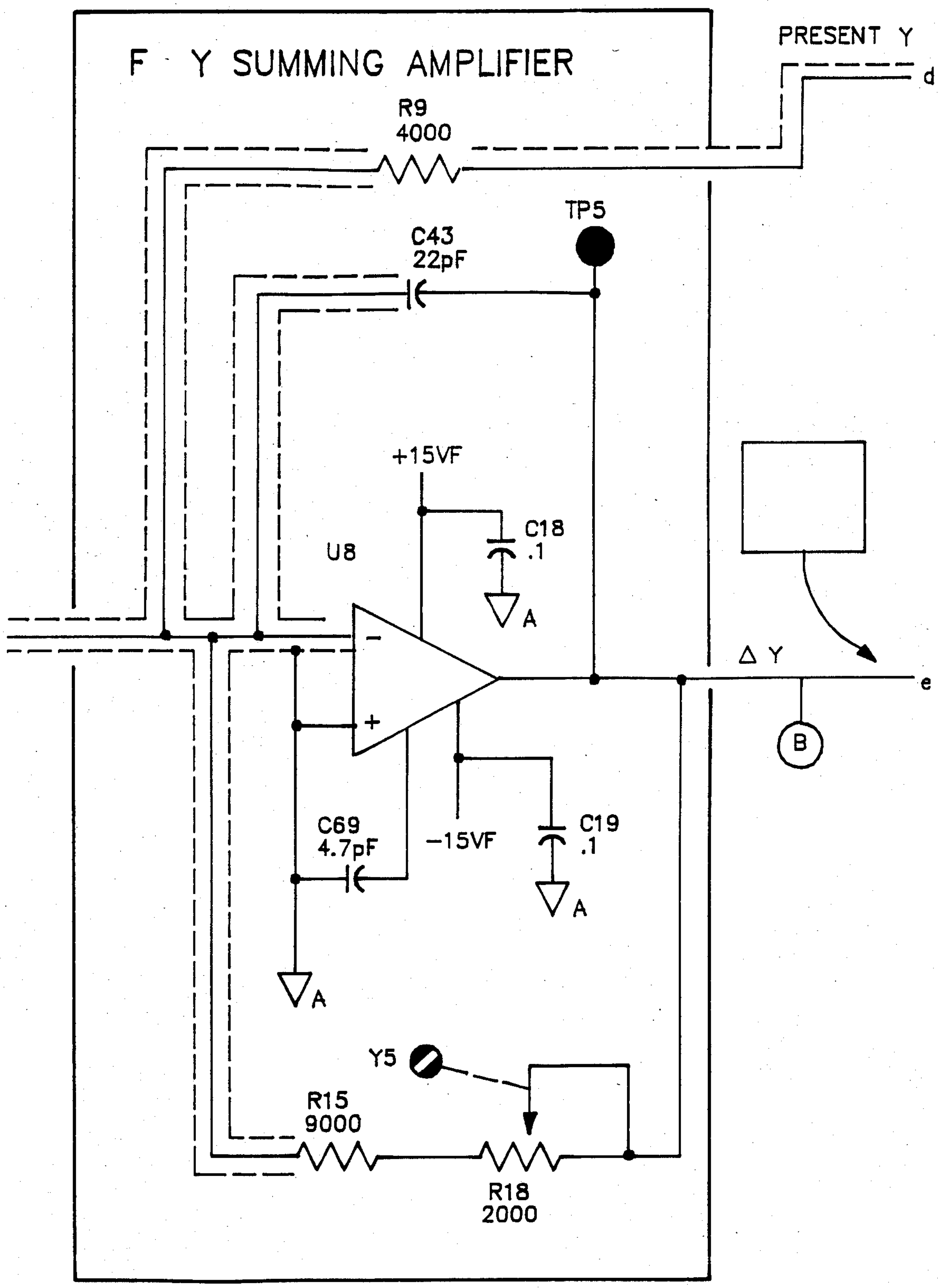
FIG 3.80E

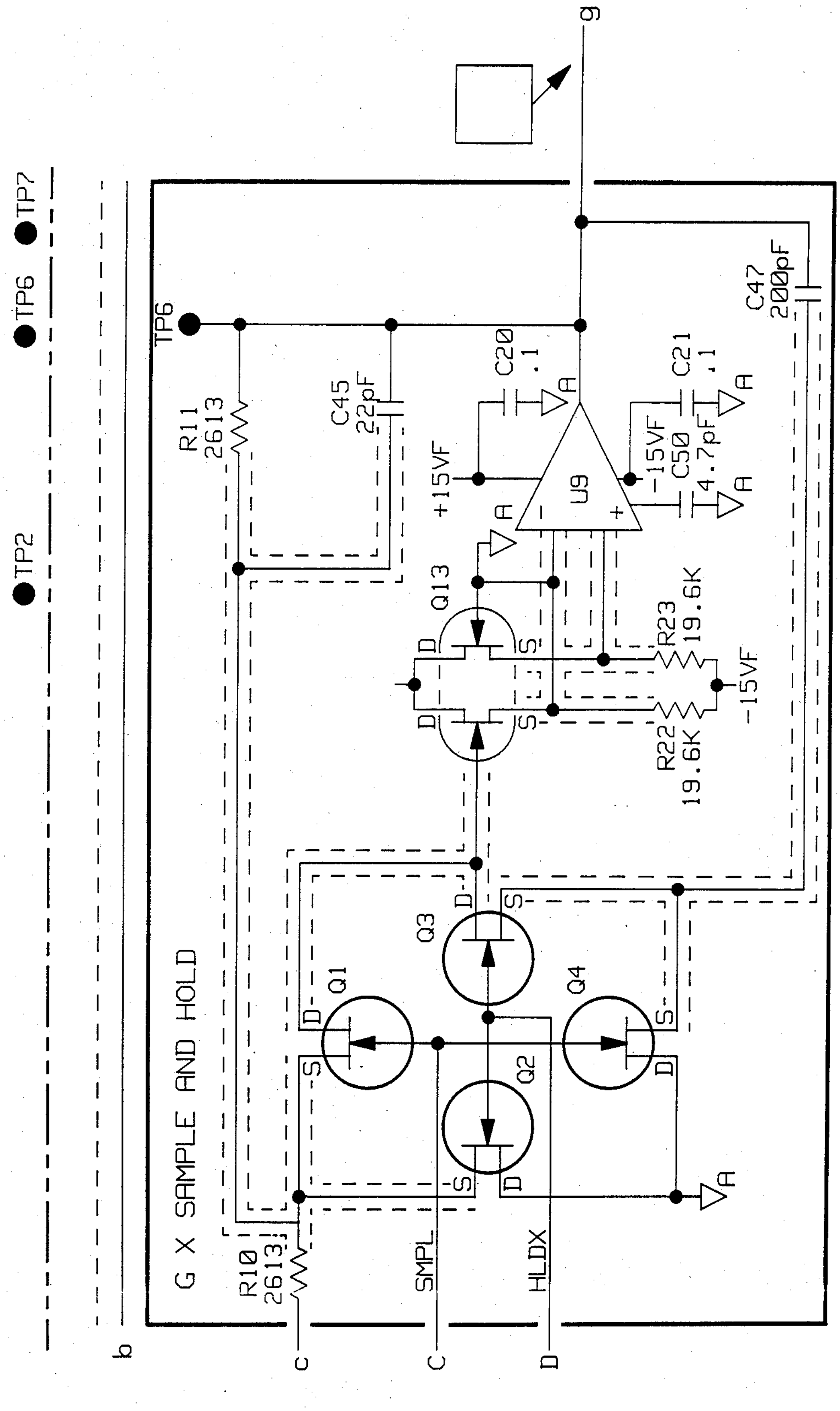
FIG 3.81A

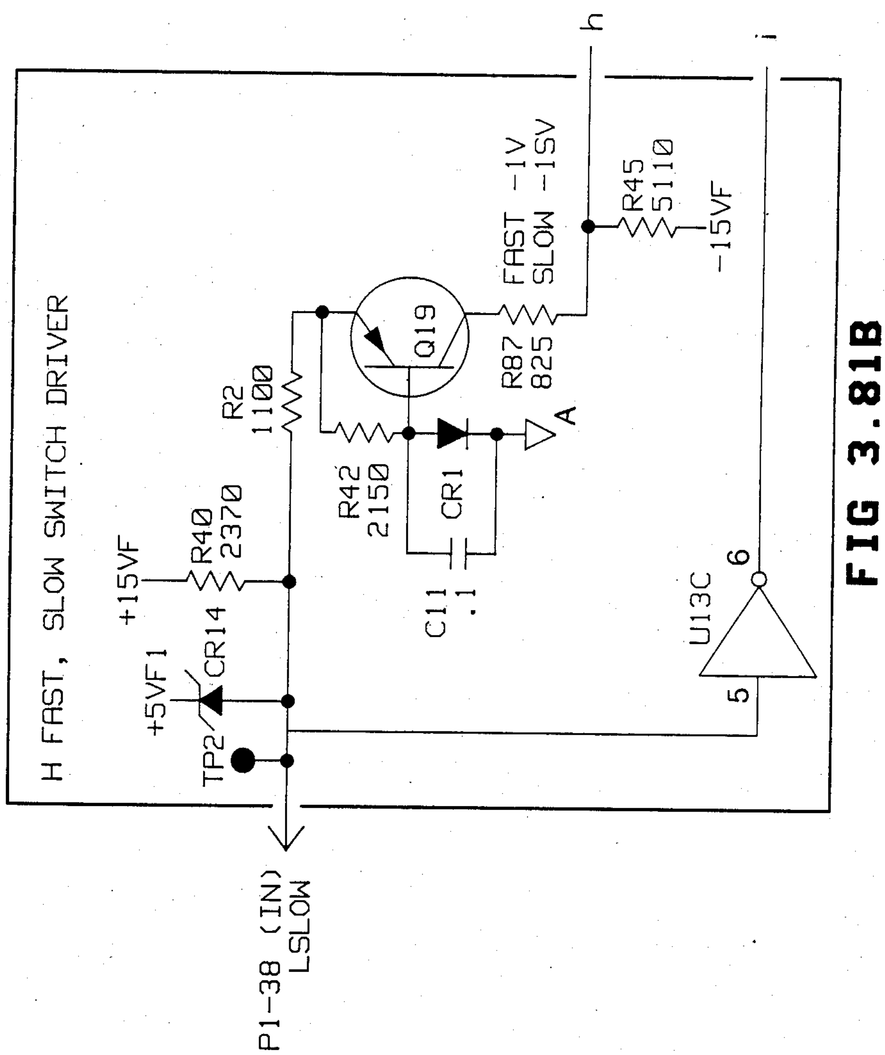
FIG 3.81B

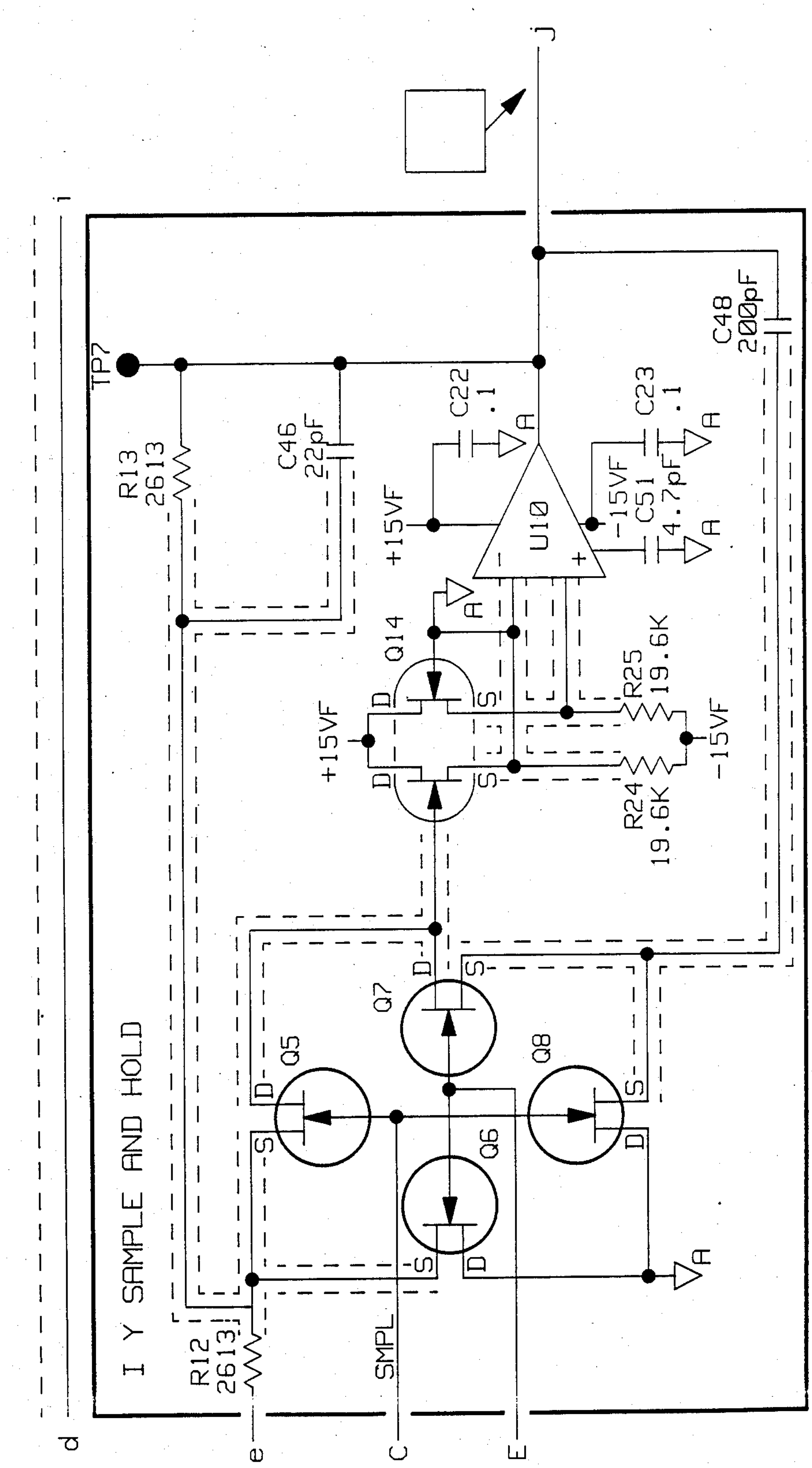
FIG 3.81C

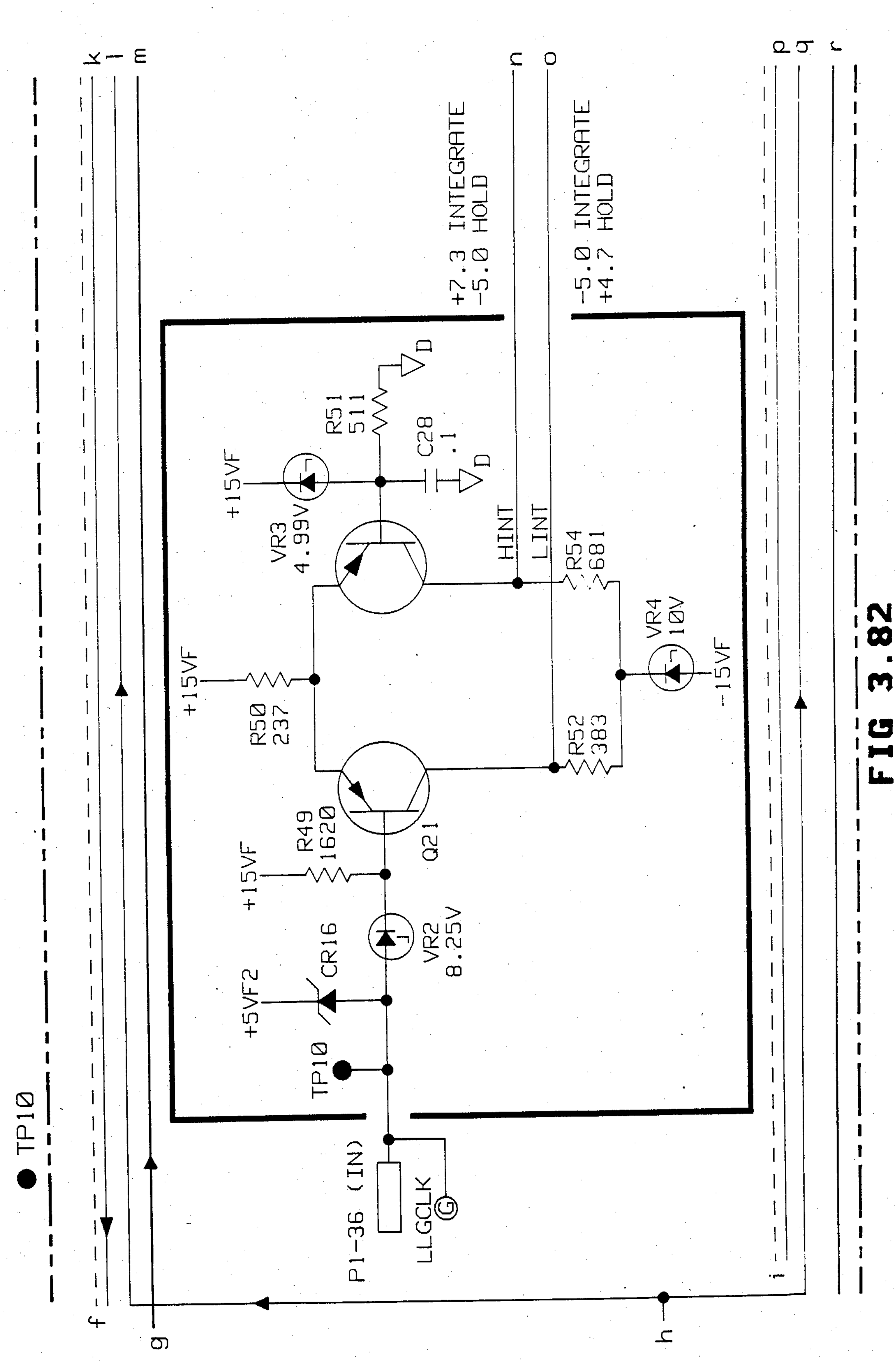
FIG 3.82

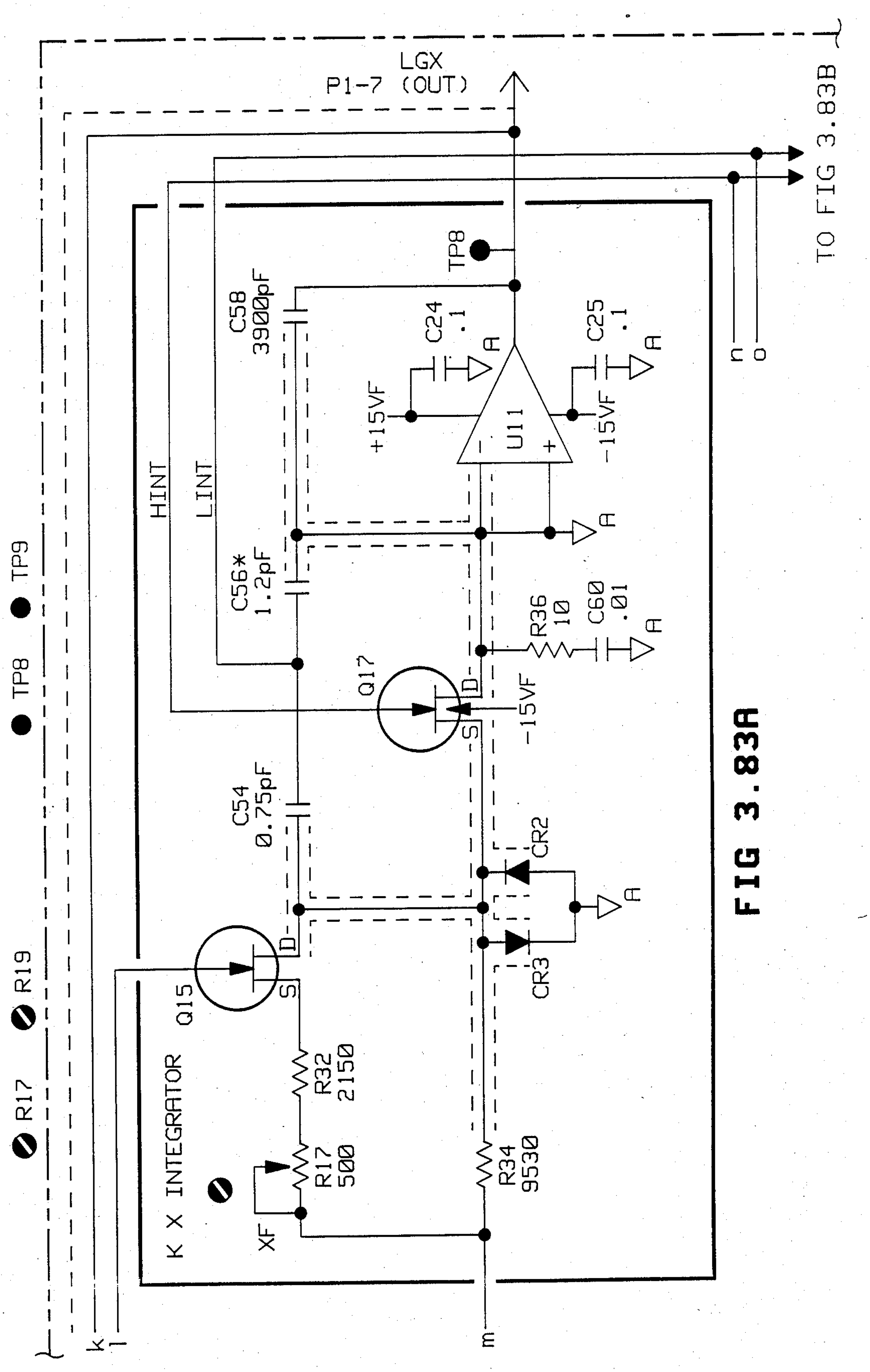
FIG 3.83A

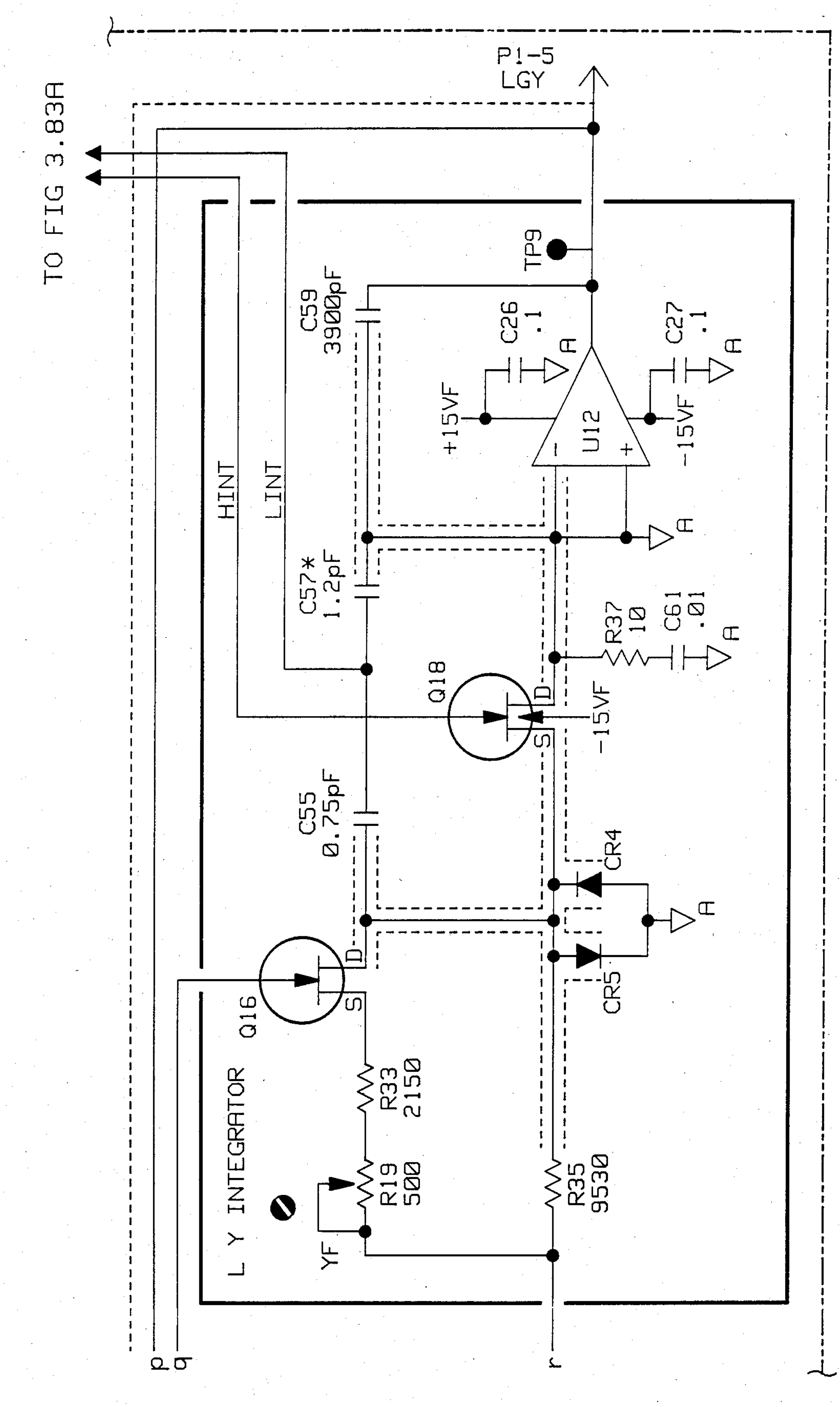
FIG 3.83B

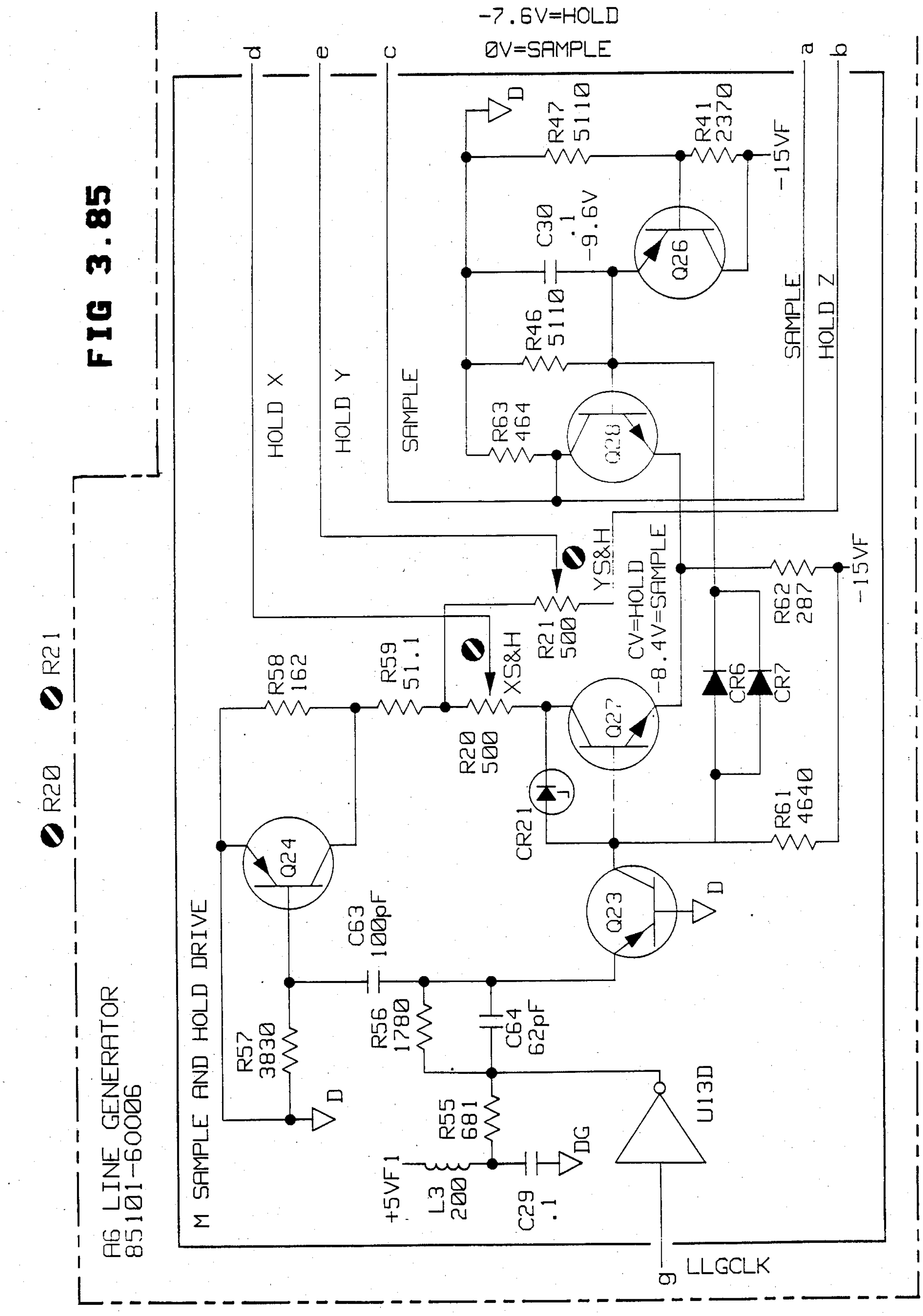
FIG 3.85

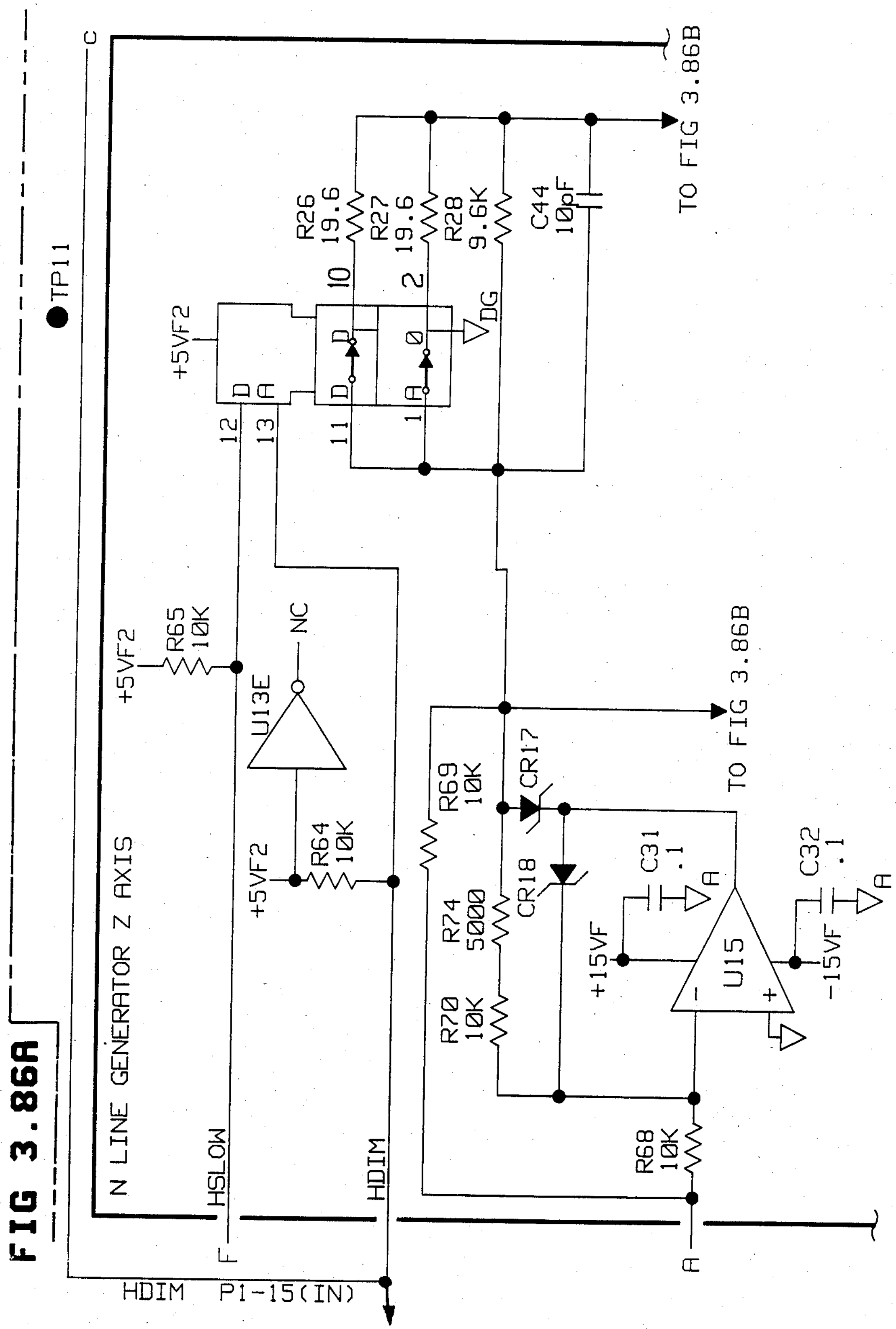
FIG 3.86A

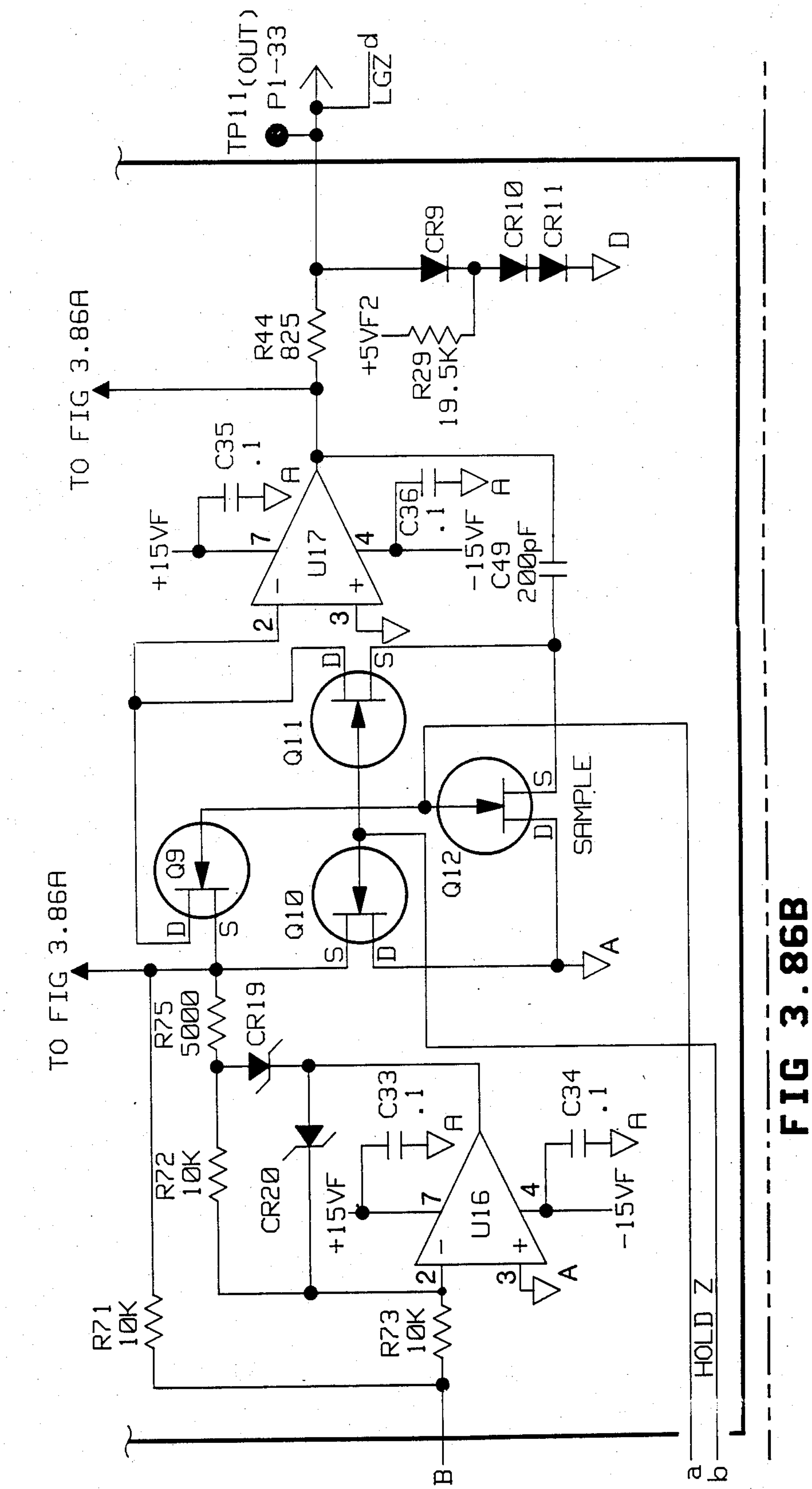
FIG 3.86B

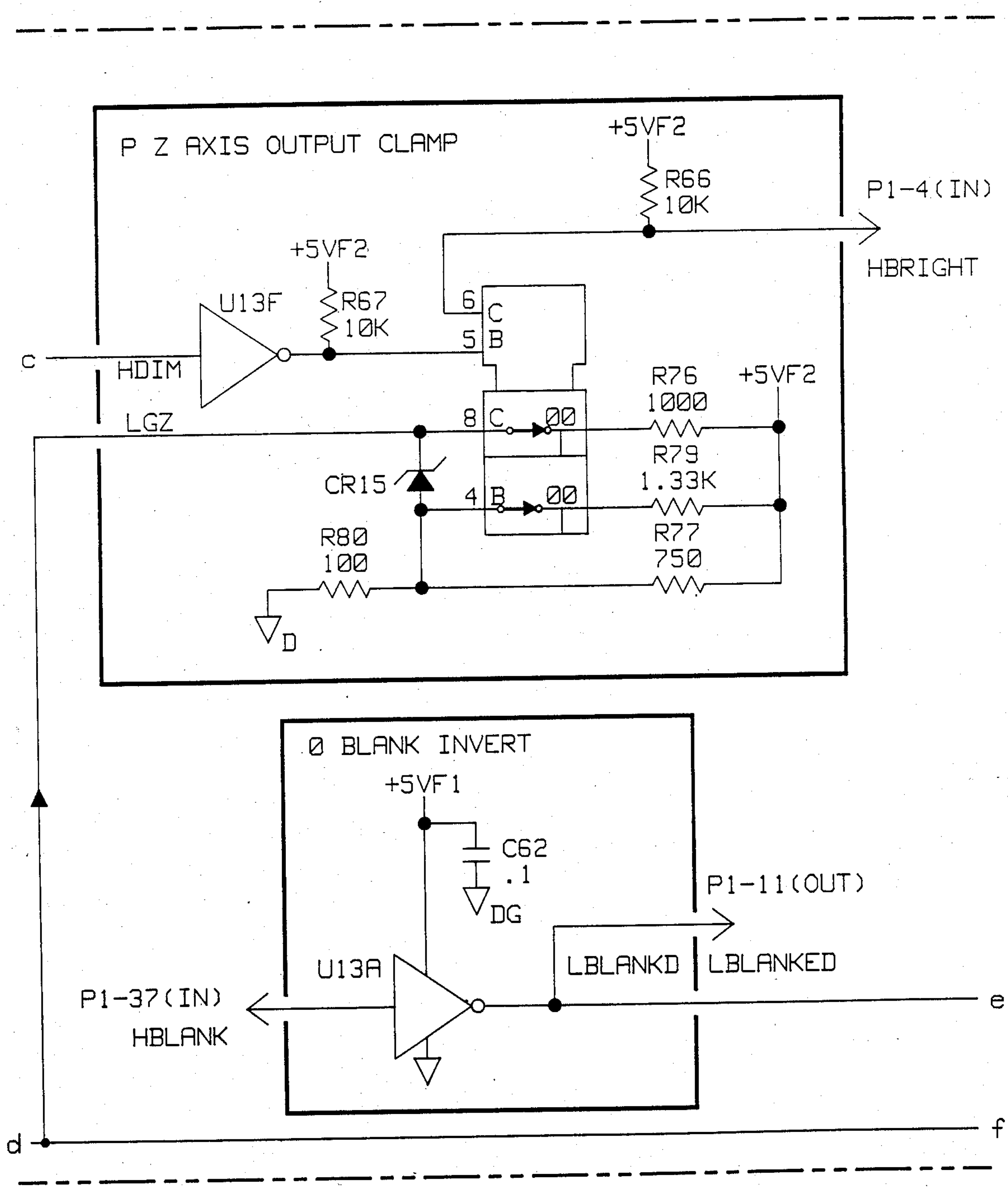
FIG 3.87

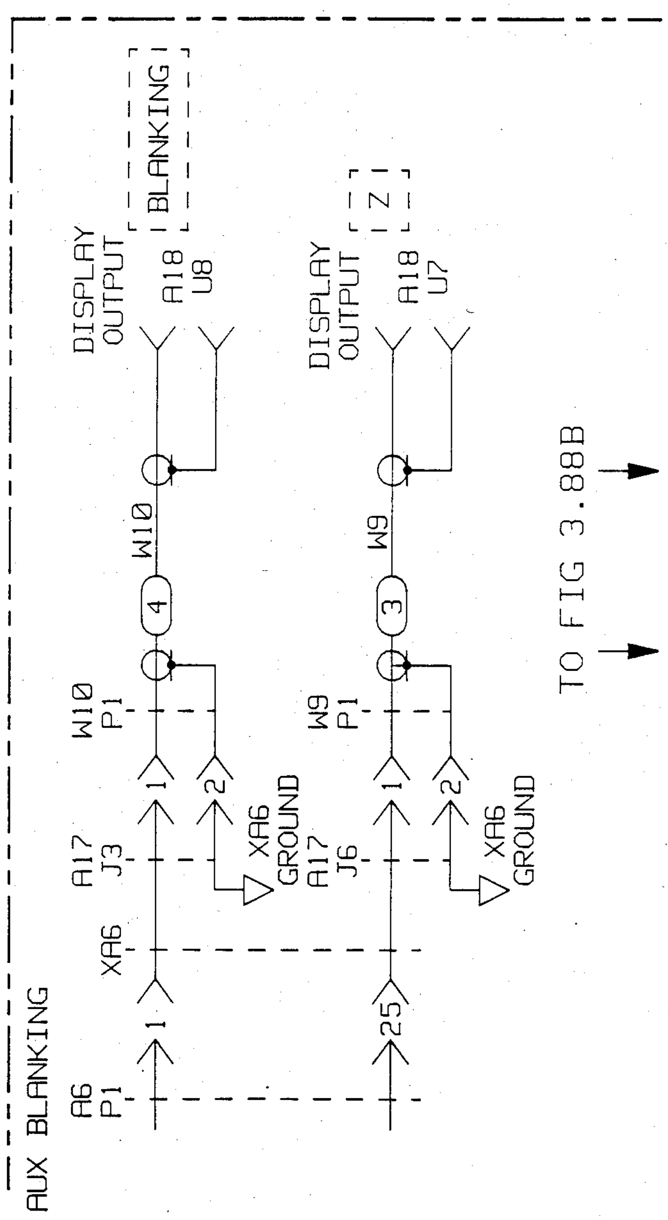
FIG 3.88A

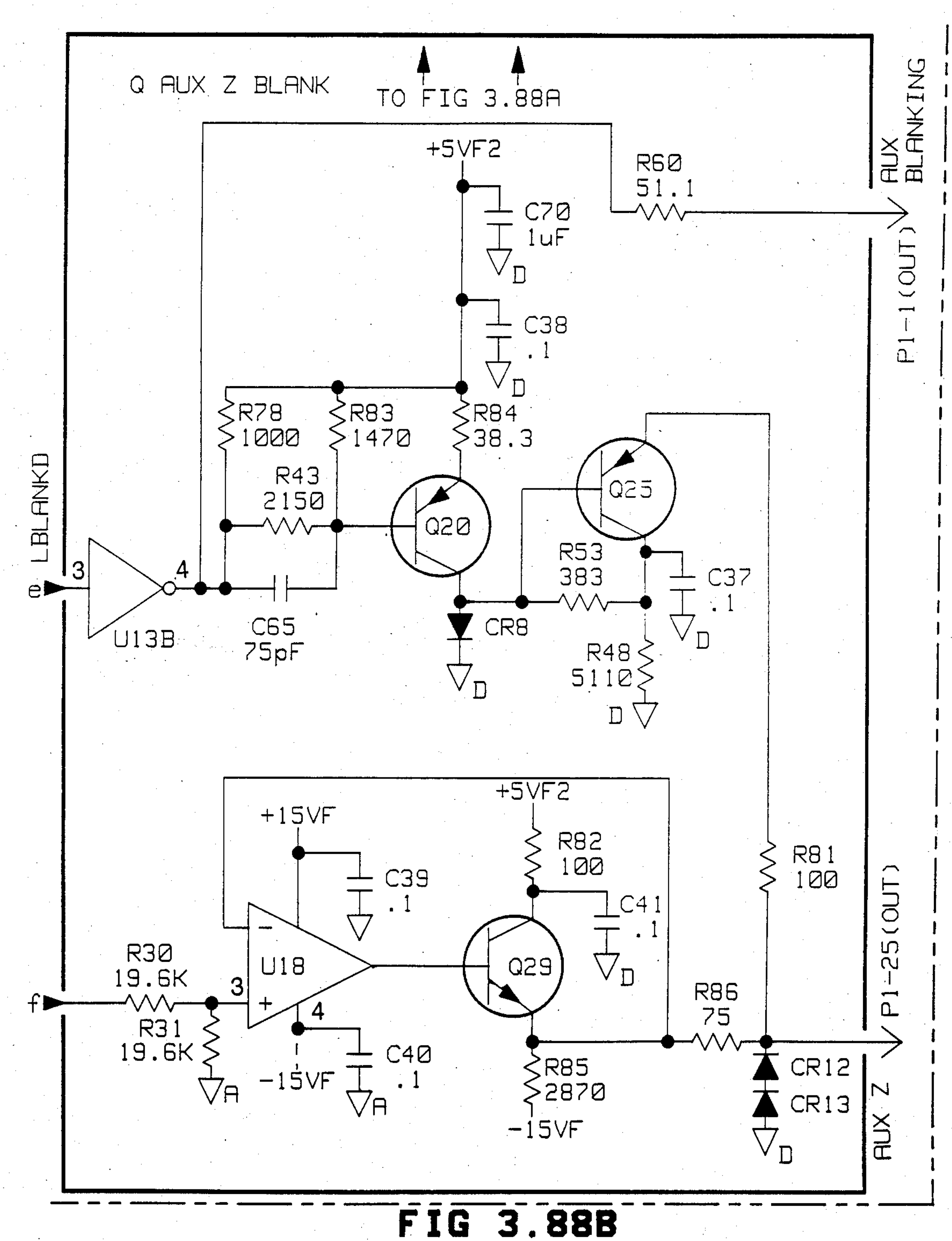
FIG 3.88B

FAST LINES ARE DRAWN IN 3μS
SLOW LINES ARE DRAWN IN 15μS
SETUP TIME IS 1μS

ACTIVE COMPONENTS PARTS LISTS (U's AND Q's)

| REFERENCE DESIGNATORS | PART NUMBER | MANUFACTURERS PART NUMBER |
|---|---|---|
| U1-U3 | 1820-2026 | 74LS396 |
| U4-U5 | 1826-0705 | DAC6012 |
| U6 | 1826-0371 | LF256 |
| U7,8,11,12 | 1826-0079 | HA-2625 |
| U9,U10 | 1826-0089 | HA-2525 |
| U13 | 1826-1199 | 74LS04 |
| U14 | 1826-1548 | MC14066 |
| U15-U18 | 1826-0081 | LM318 |
| Q1-12 | 1855-0081 | 2N5245 |
| Q13,Q14 | 1855-0050 | |
| Q15,Q16 | 1855-0020 | |
| Q17,Q18 | 1855-0241 | |
| Q19,Q20 | 1853-0034 | 2N3251 |
| Q21-Q26 | 1853-0007 | 2N3251 |
| Q27-Q29 | 1854-0404 | NPN |
| | | |
| | | |
| | | |
| | | |
| | | |
| | | |
| | | |

FIG 3.89

FIG 3.90
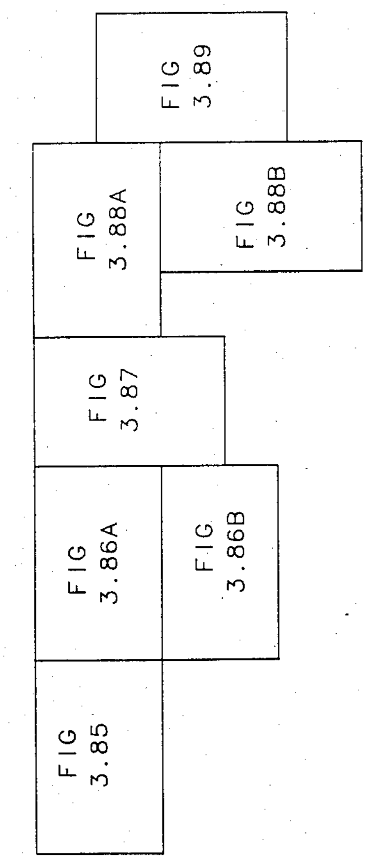
FIG 3.96
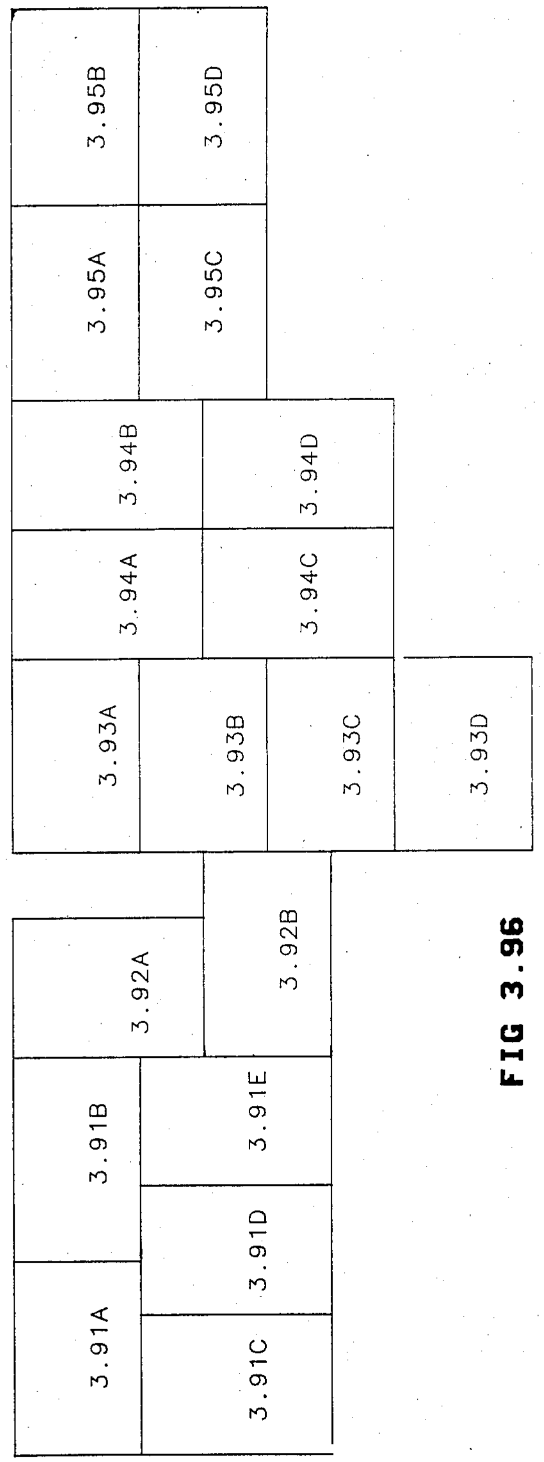

A7 SWITCHING REGULATOR
85101-60007

| P/O A18 | P/O A17 | P/O A9 |
|---|---|---|
| S1, S2 | R1, R2, R6, R3, R4 | T1 |
| J4, J1 | K1 | P21-26 |
| F1 | C5, 18, 19, 2, 28, 1, 14 | TB1-4 |
| FL 1 | L 1 | P1 |
| | CR1, 2, 3 | |

FIG 3.91A

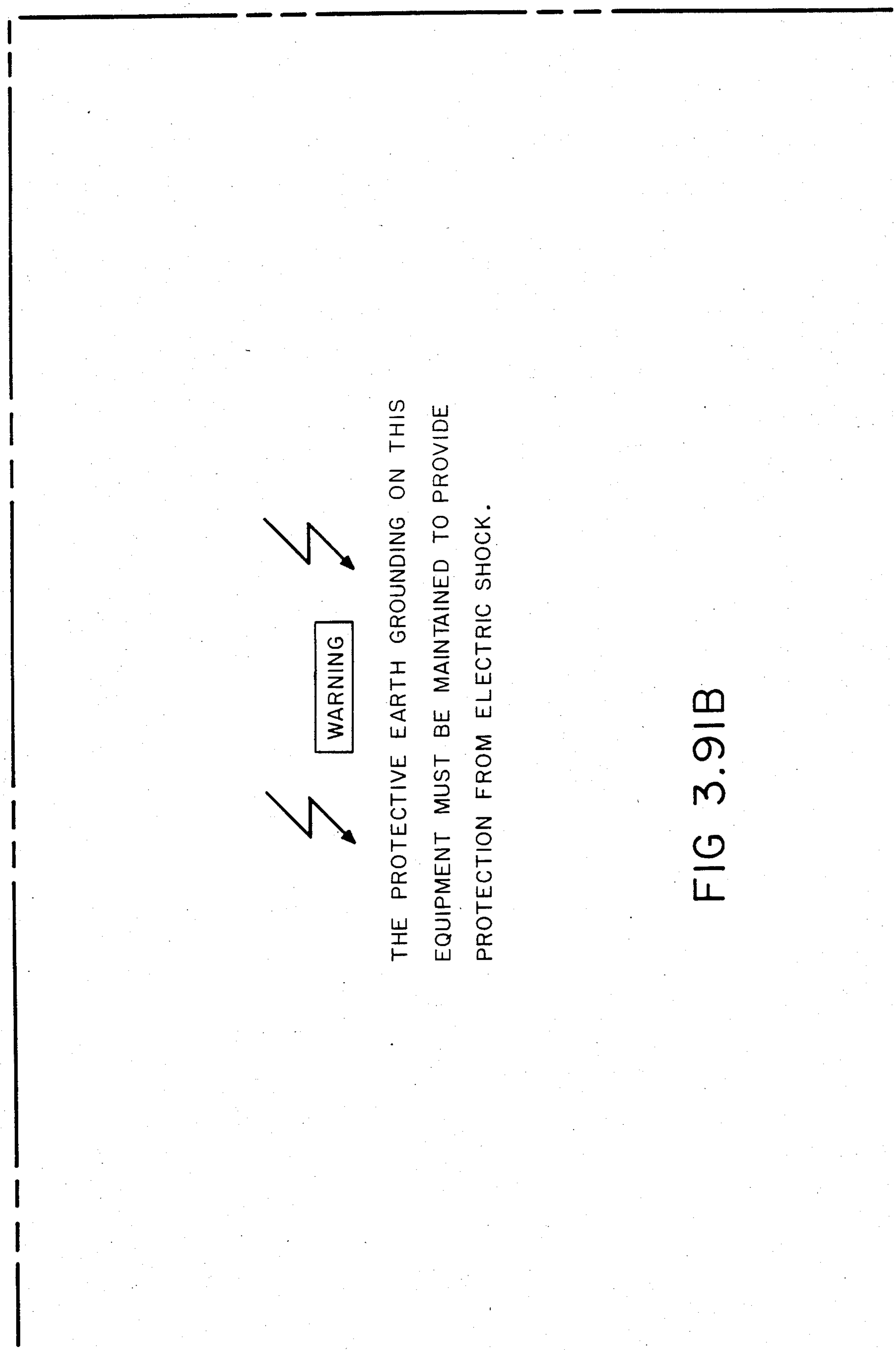
FIG 3.91B

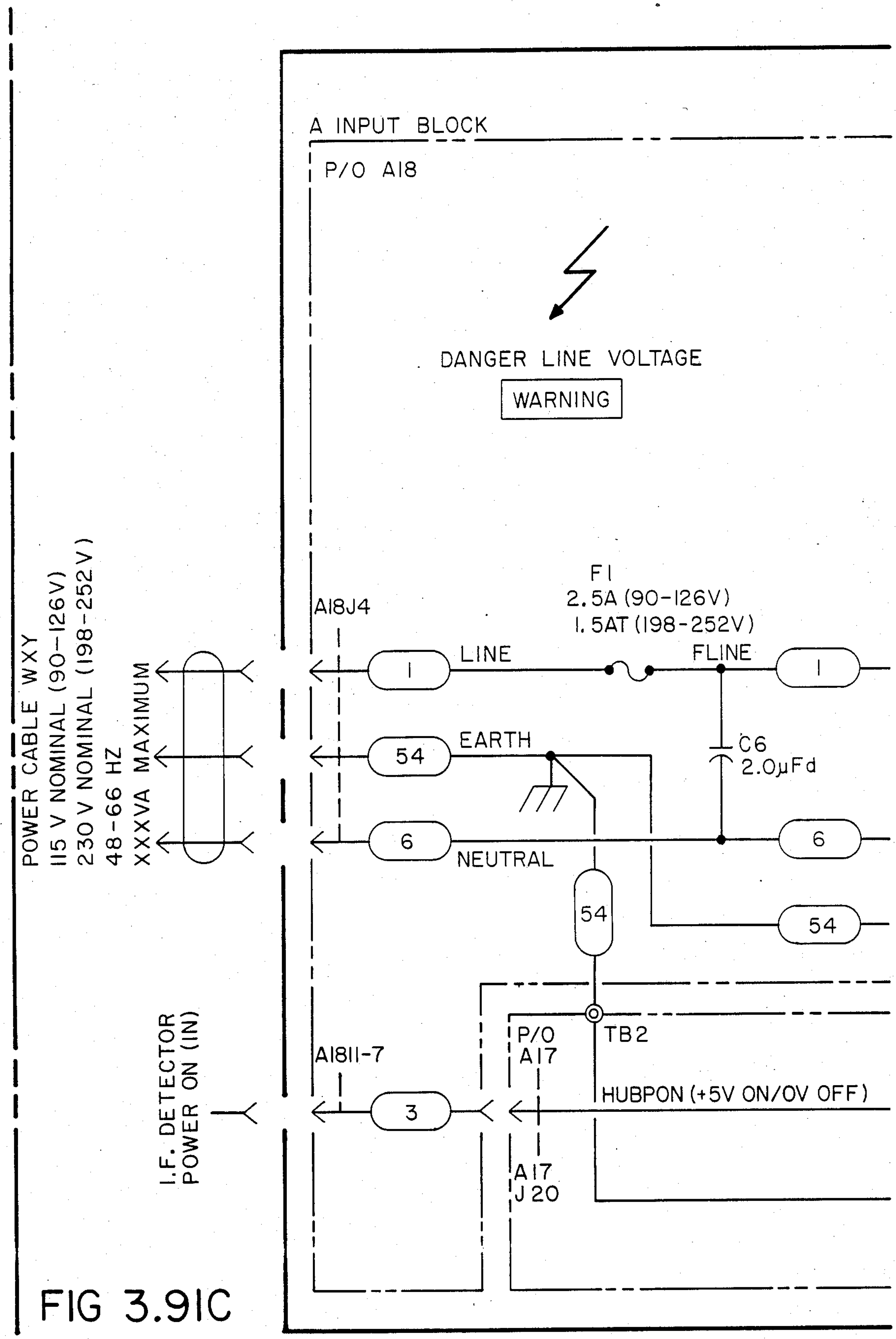
FIG 3.91C

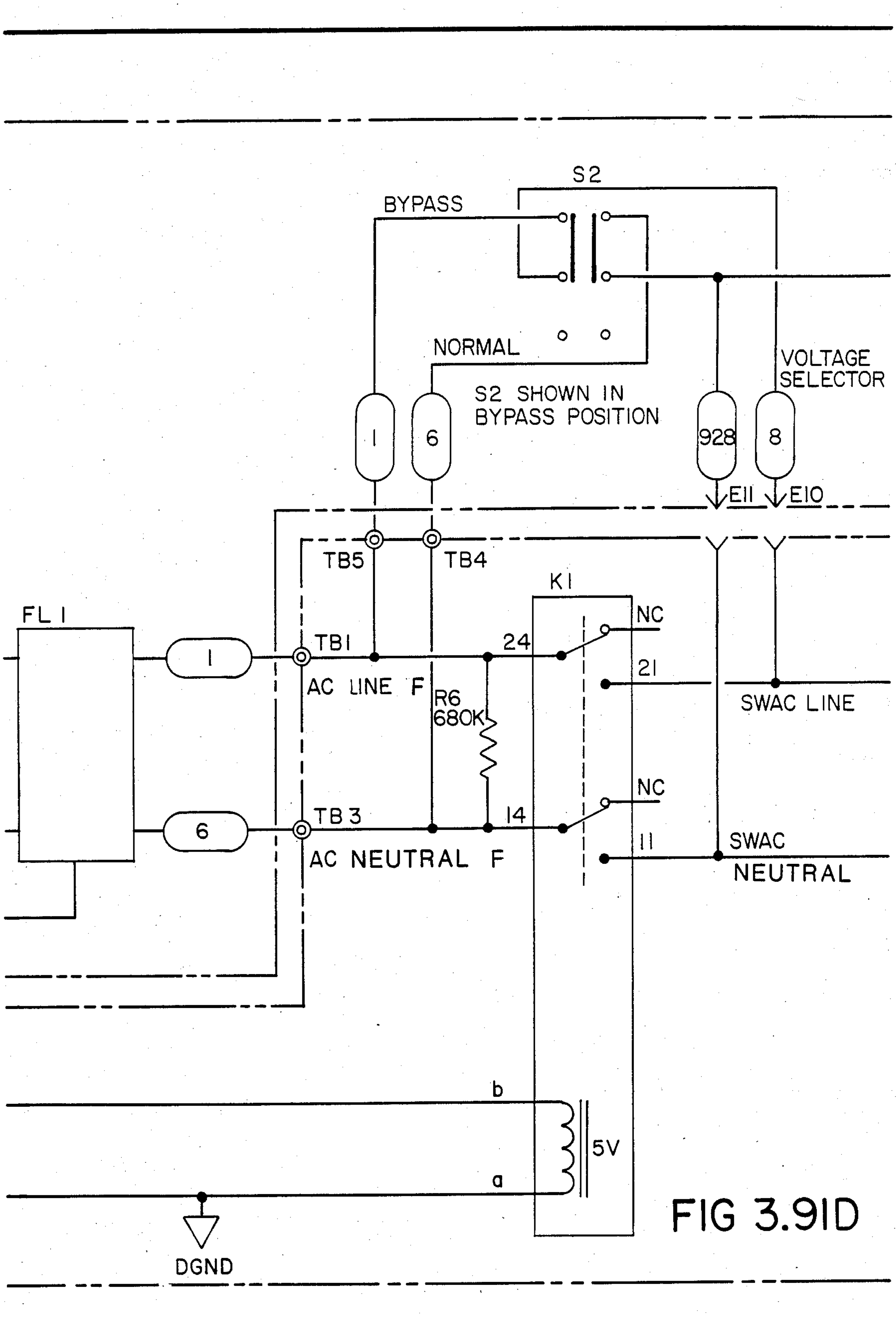
FIG 3.91D

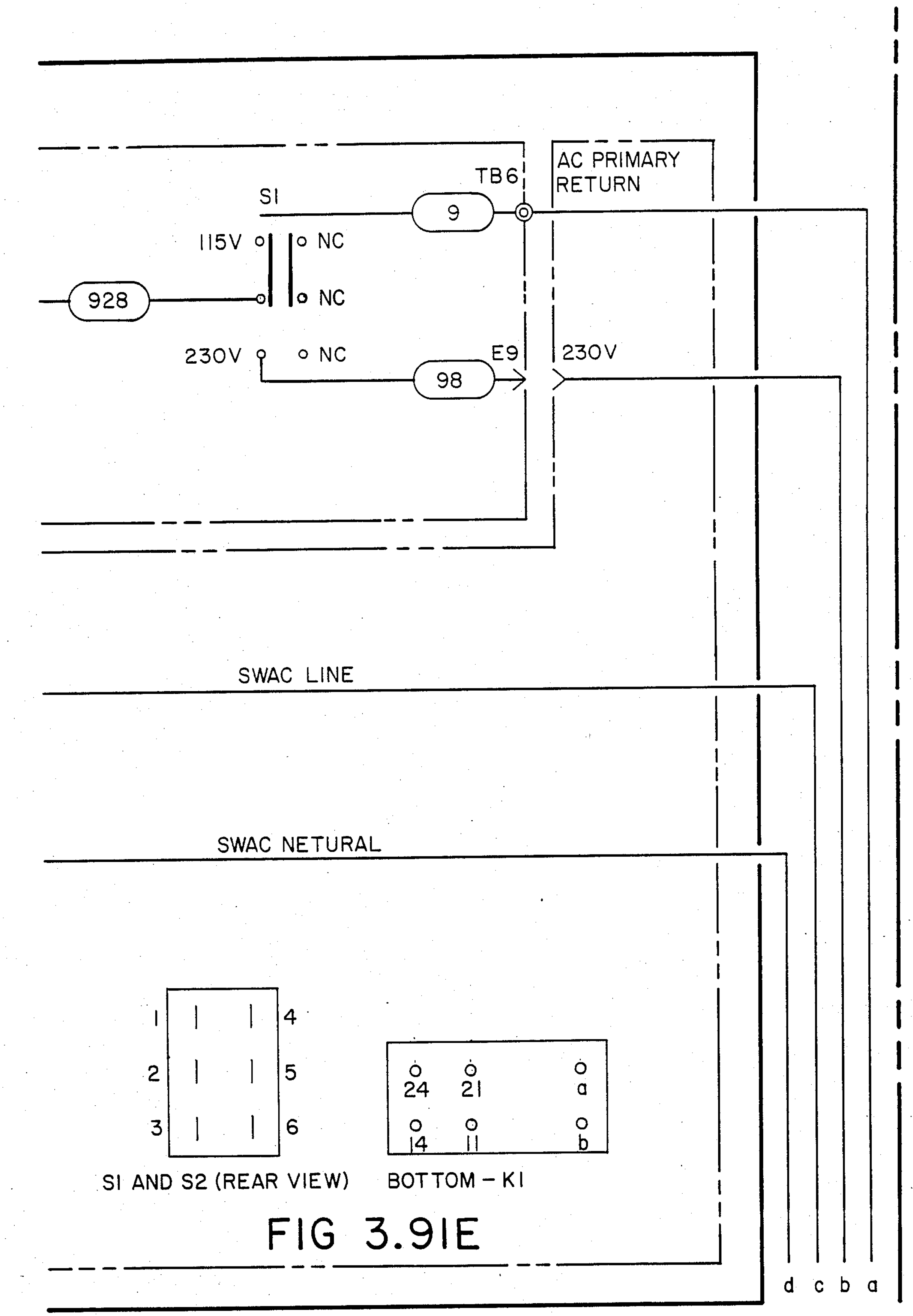
FIG 3.91E

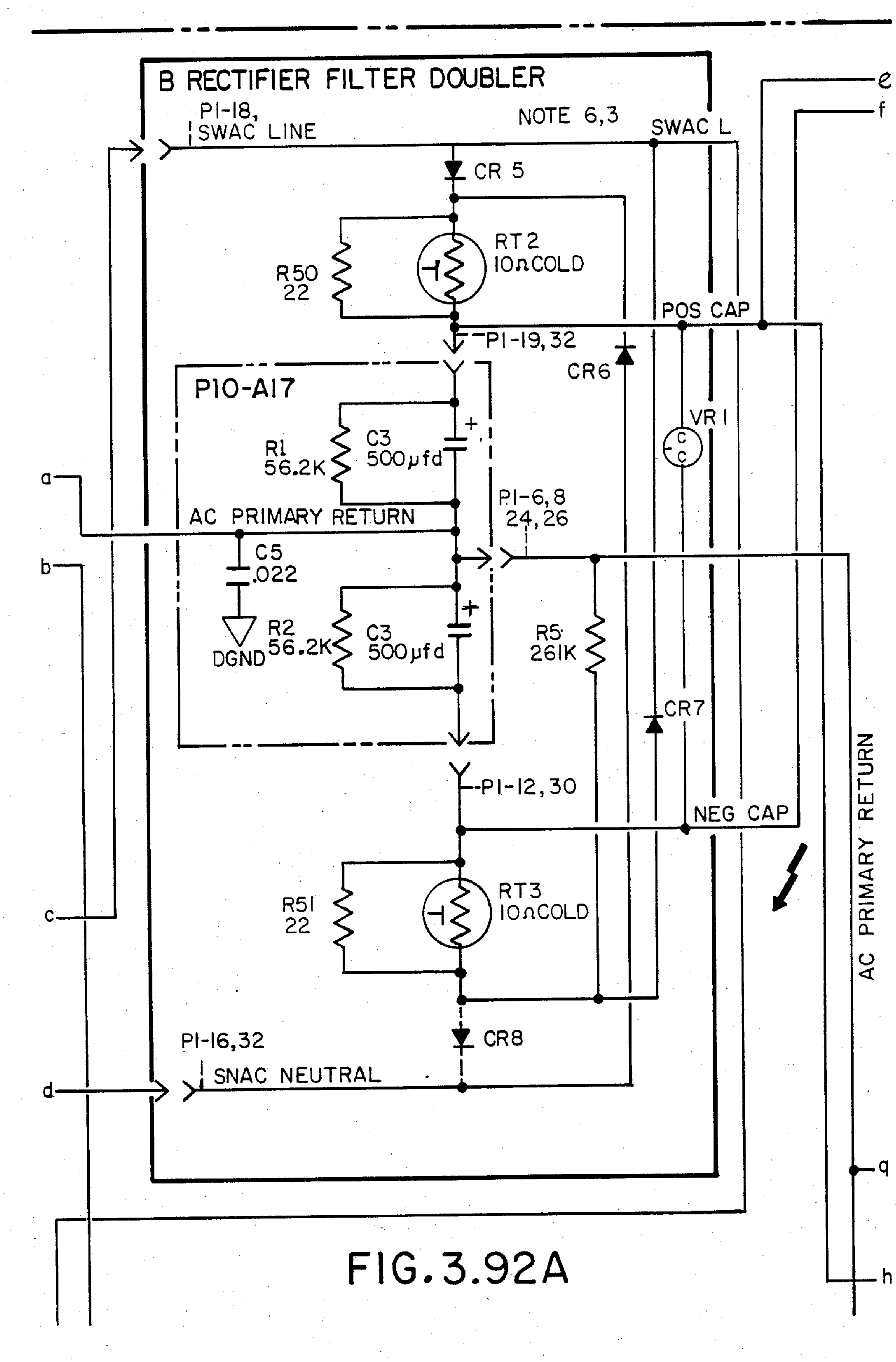
FIG. 3.92A

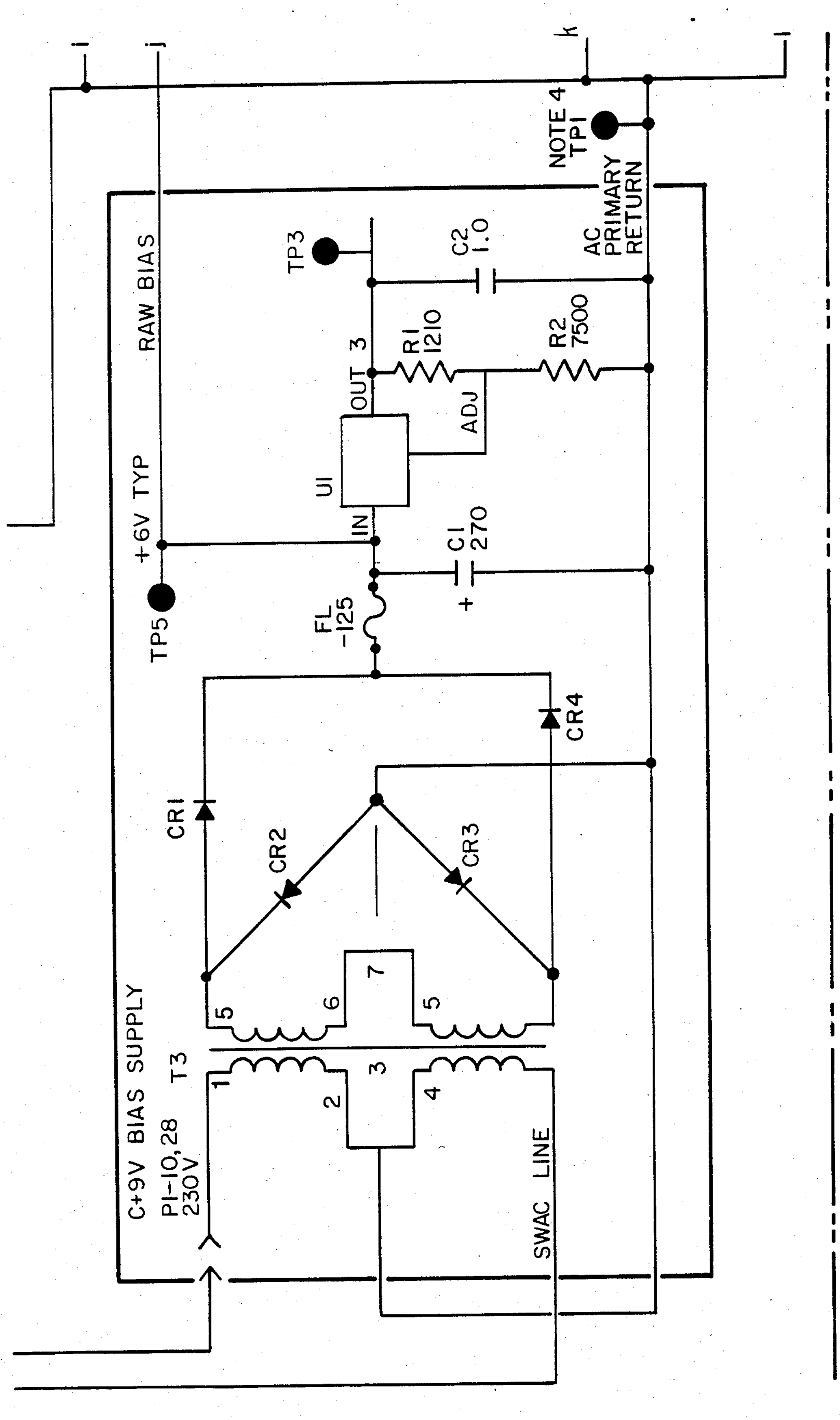
FIG 3.92B

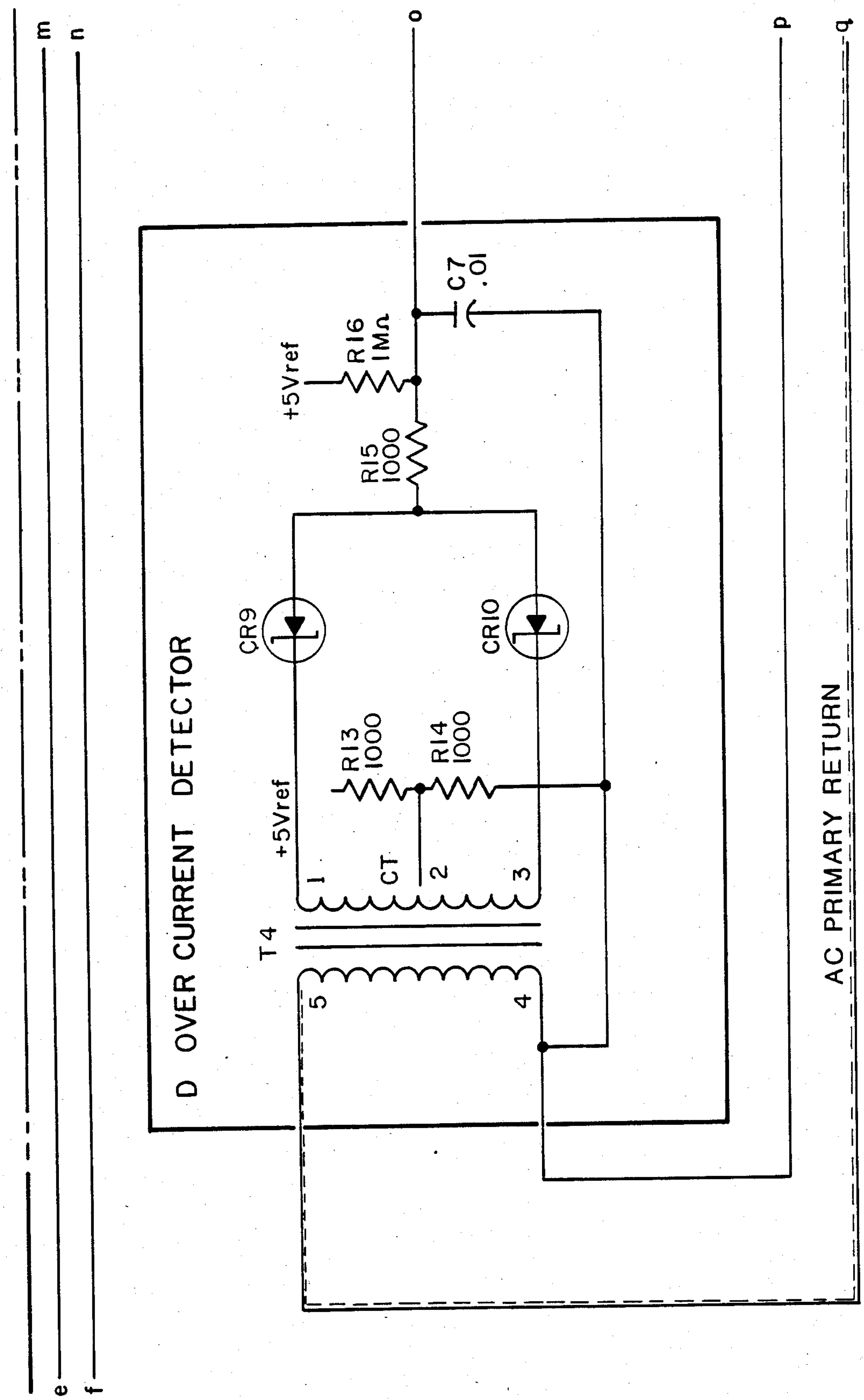
FIG 3.93A

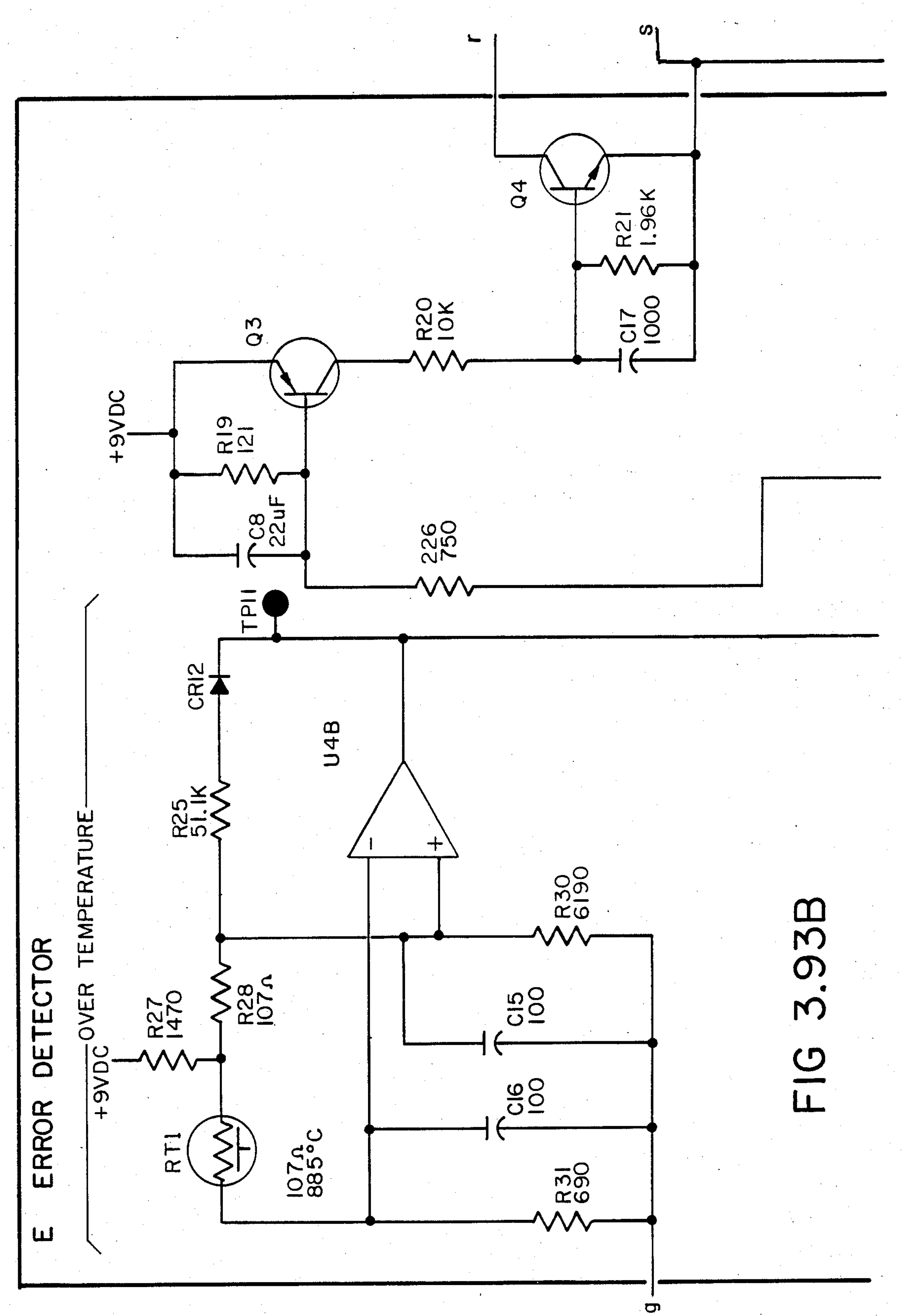
FIG 3.93B

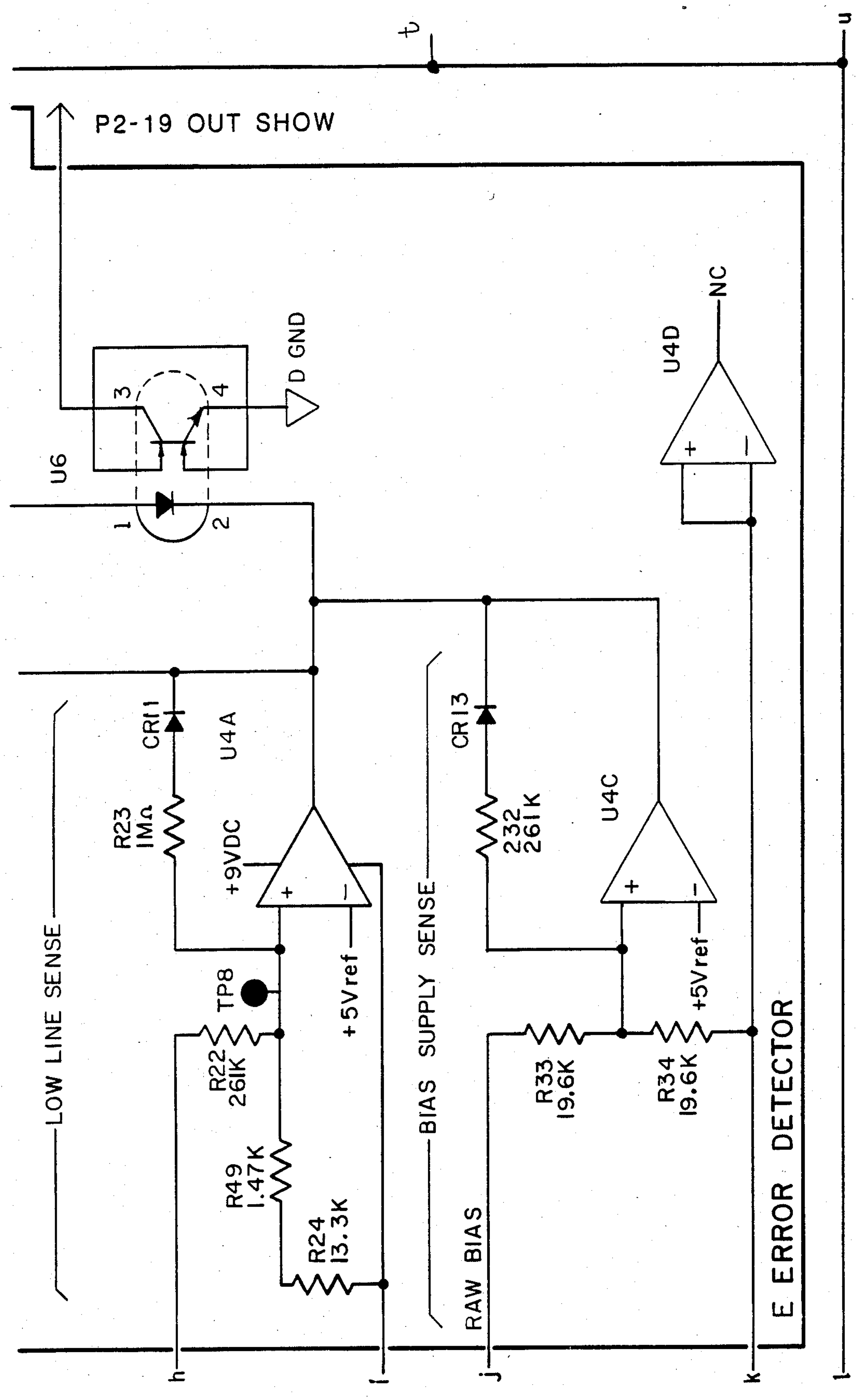
FIG 3.93C

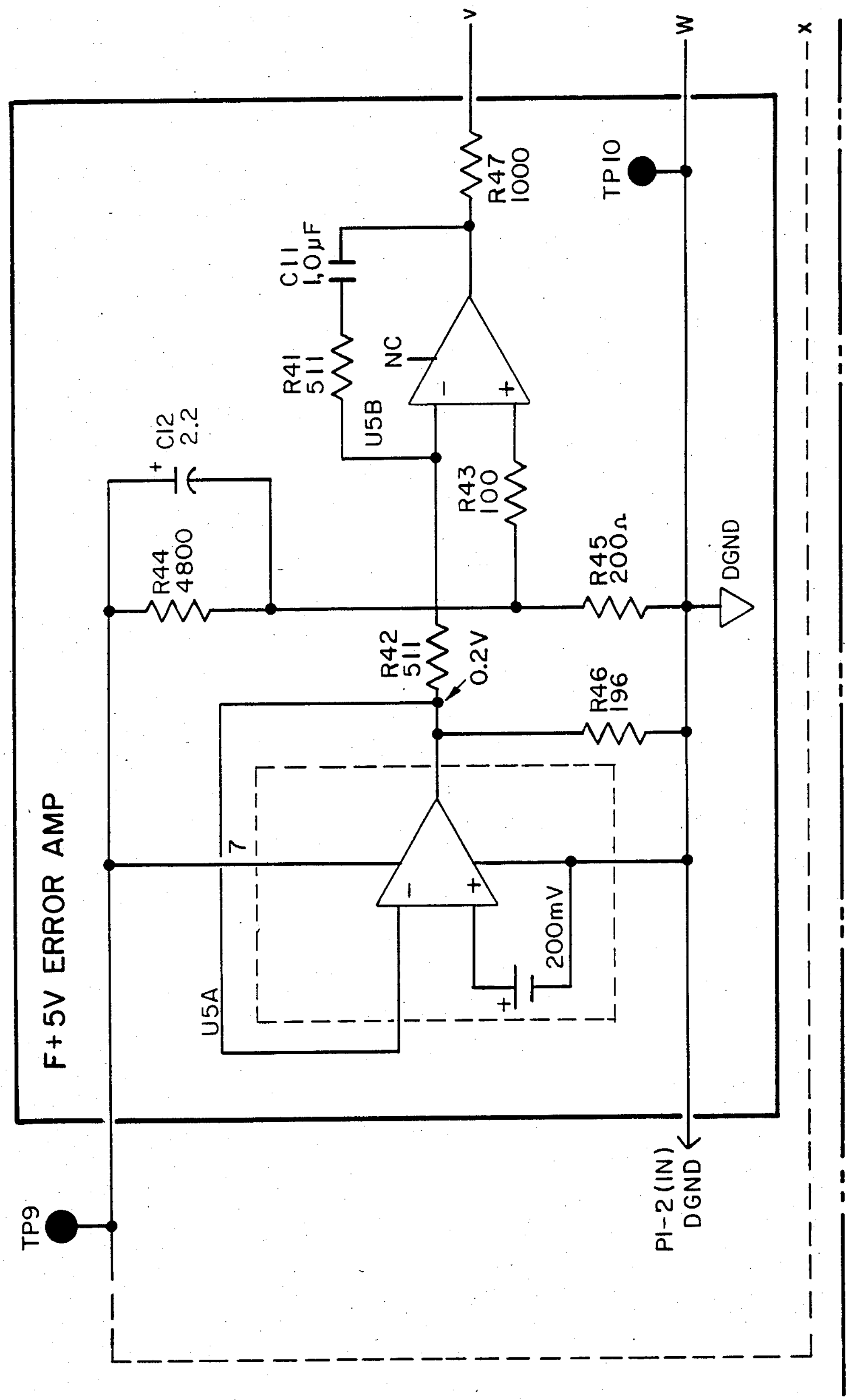
FIG 3.93D

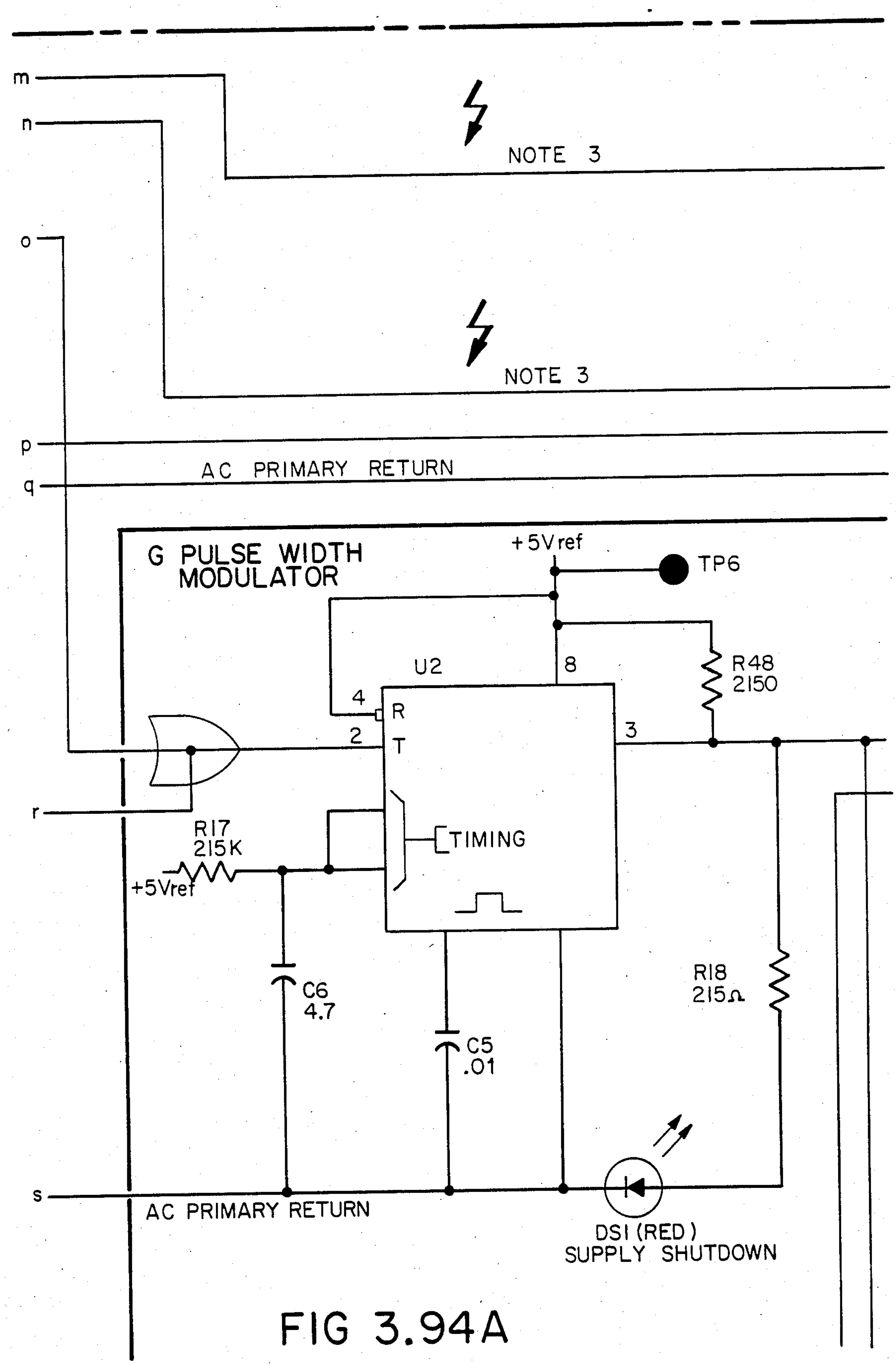
FIG 3.94A

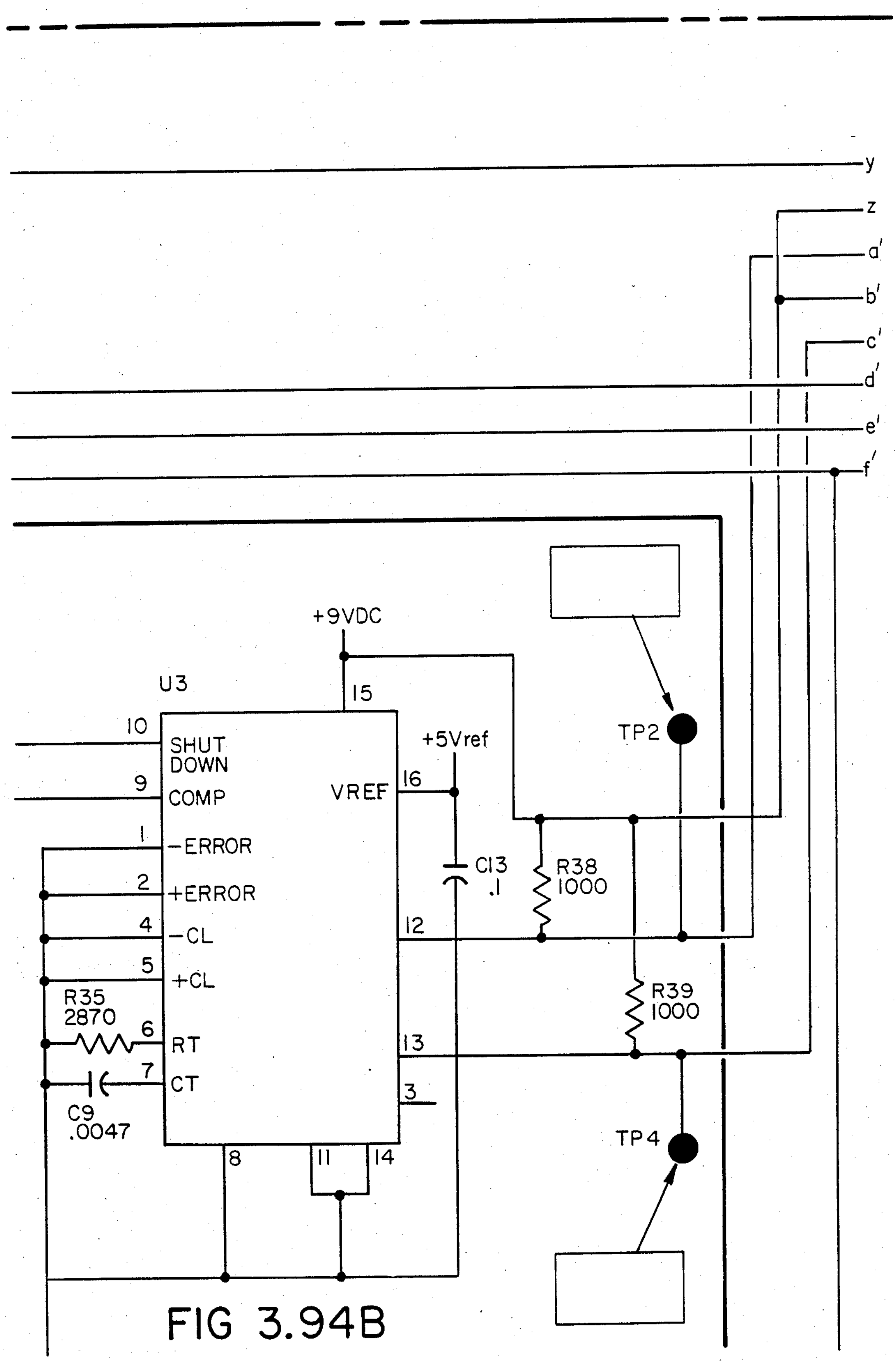
FIG 3.94B

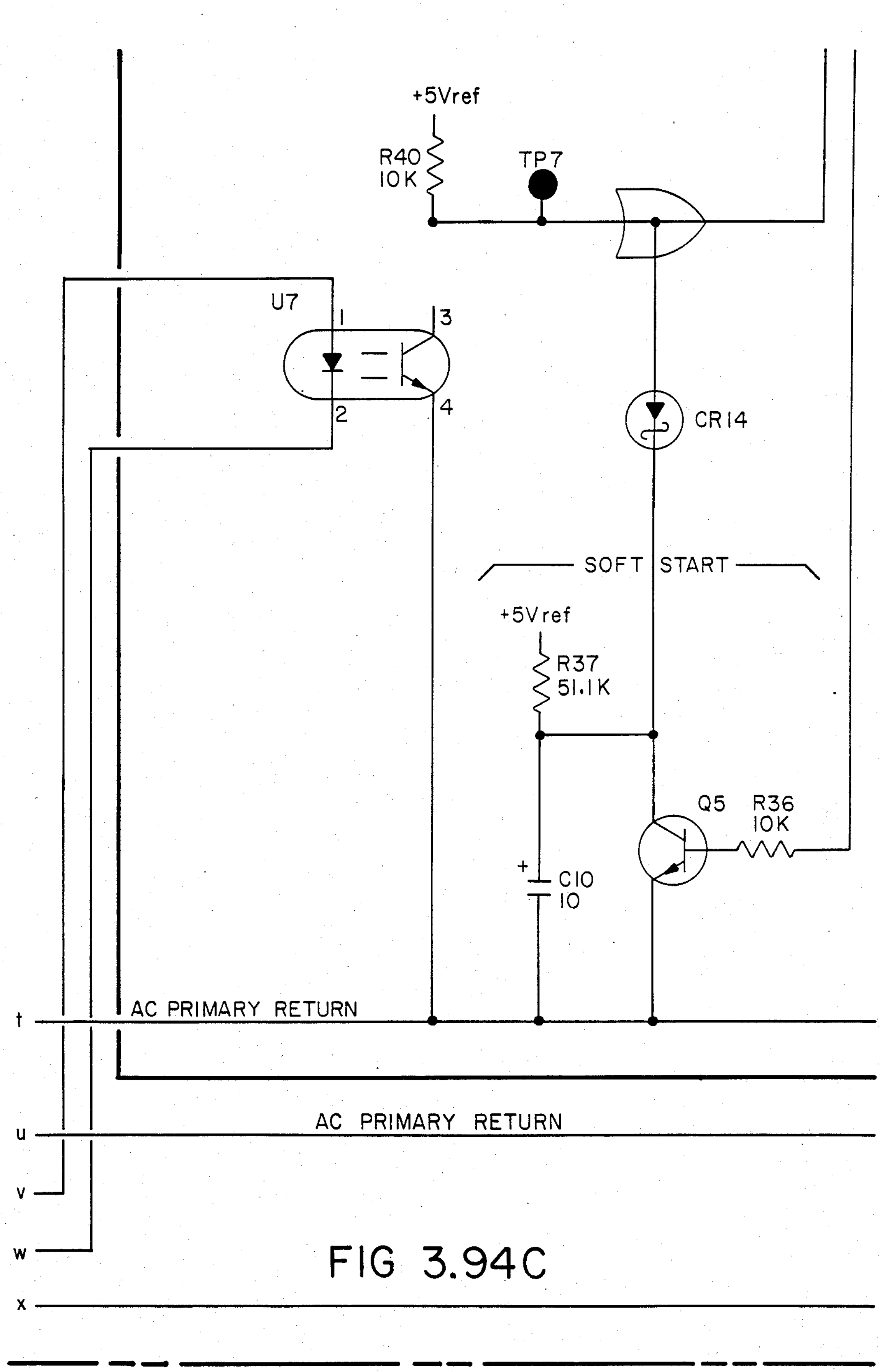
FIG 3.94C

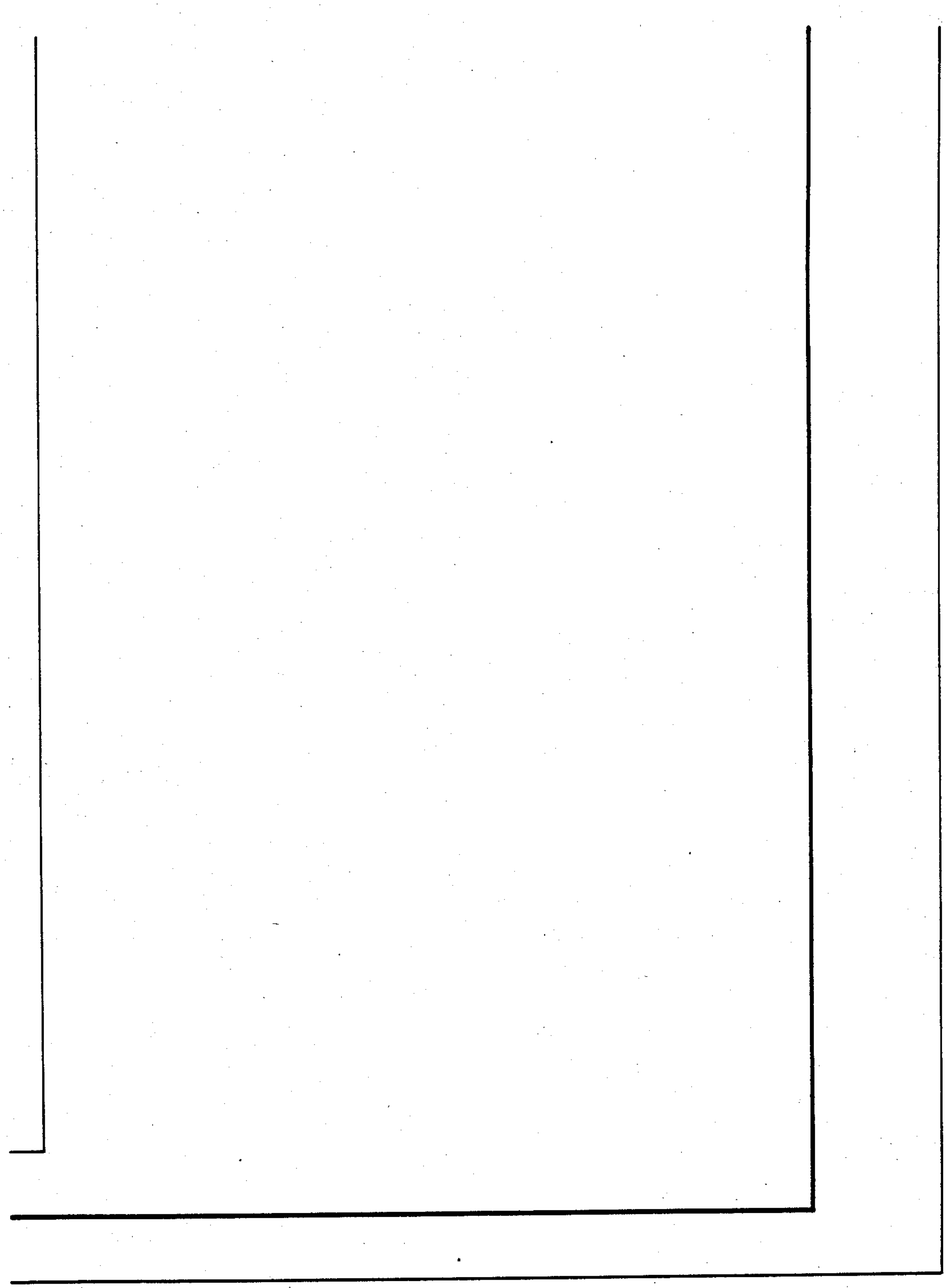
FIG 3.94D
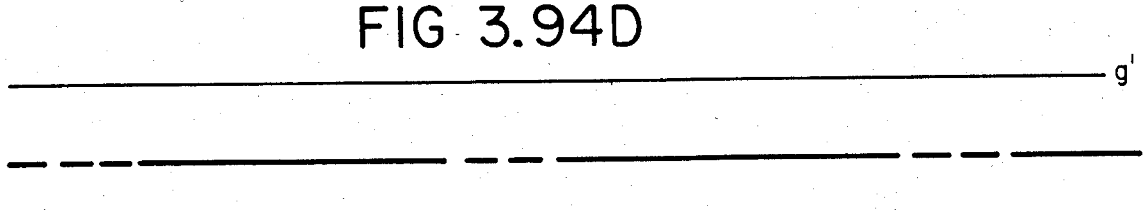

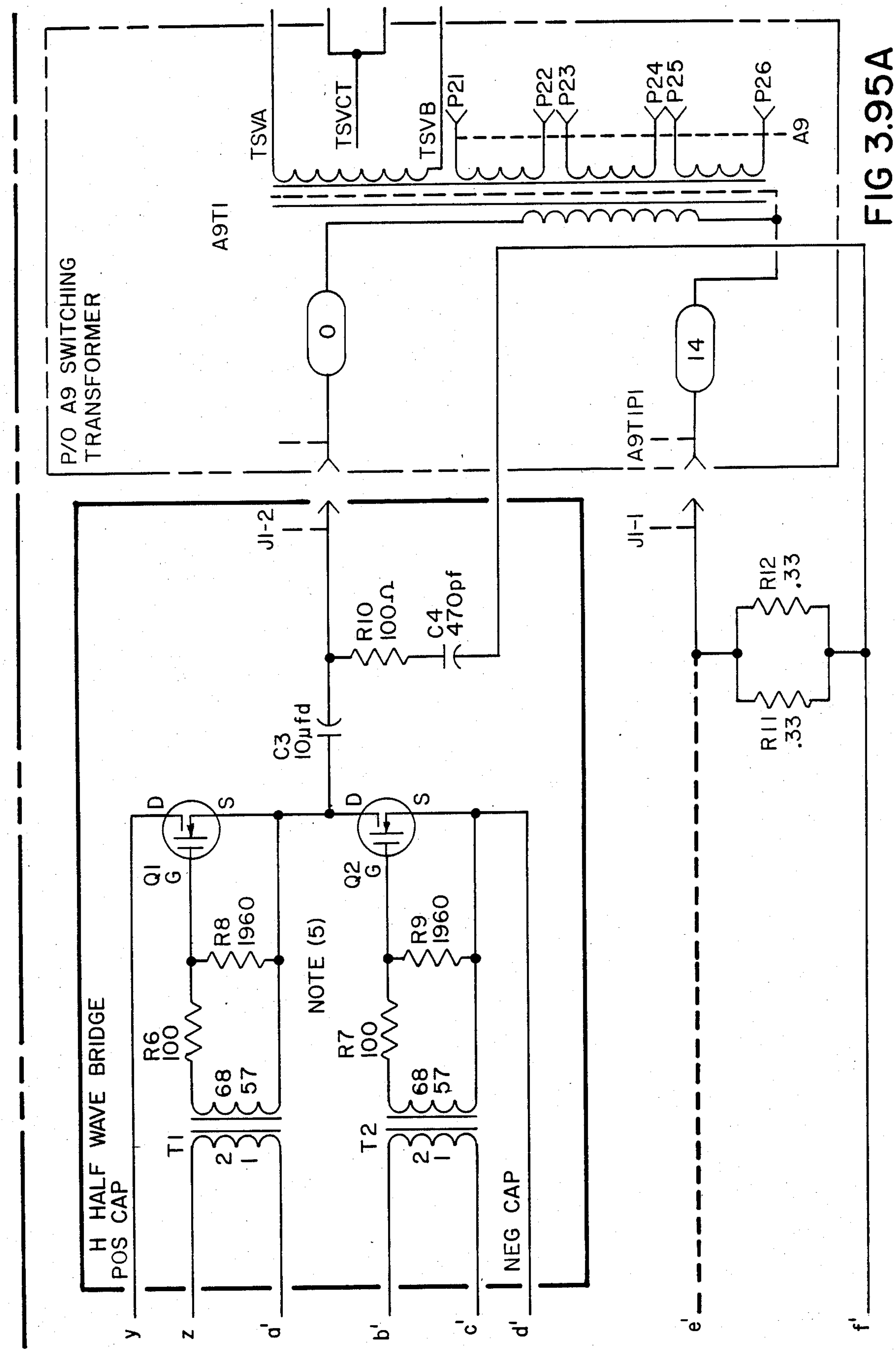
FIG 3.95A

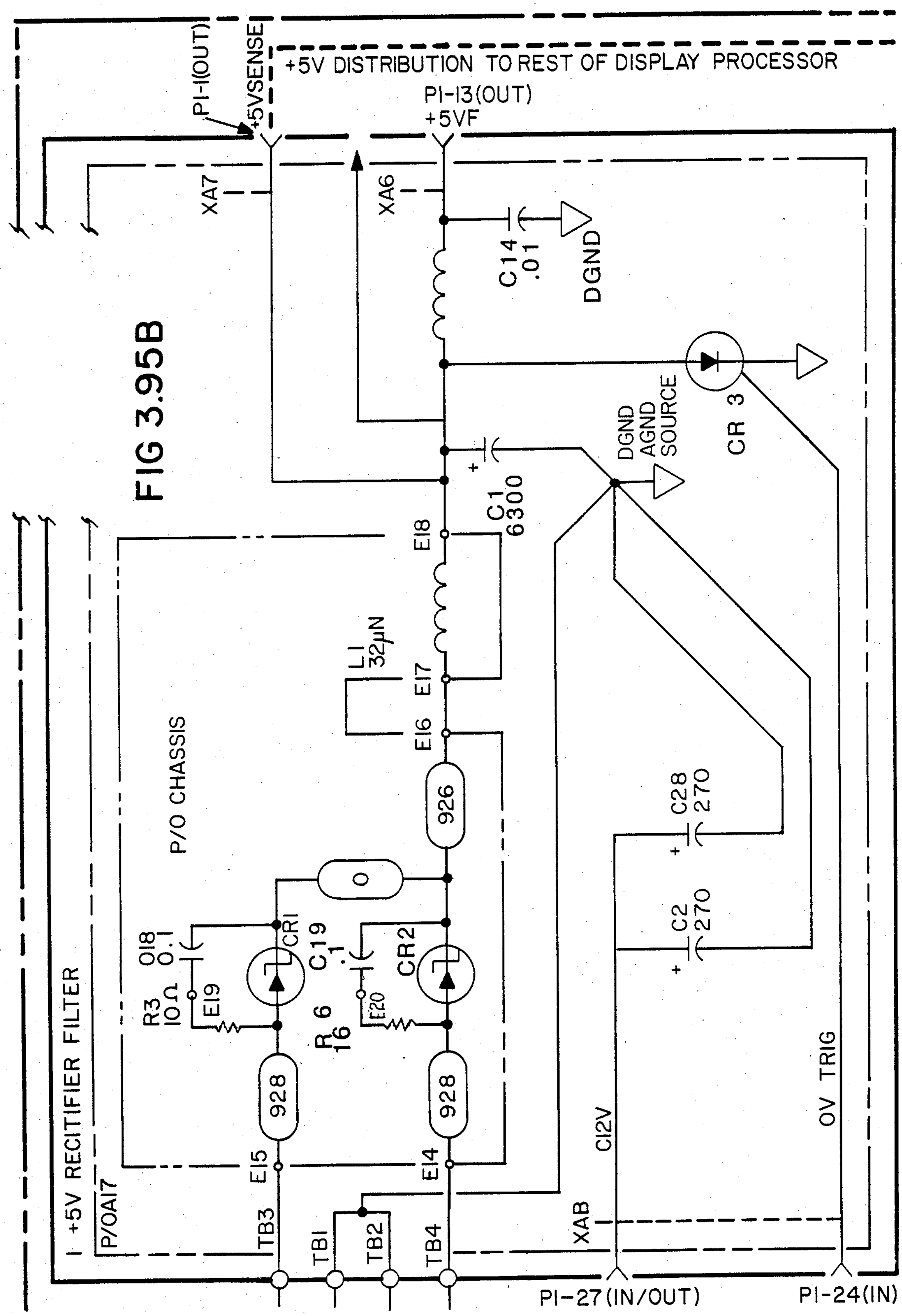
FIG 3.95B

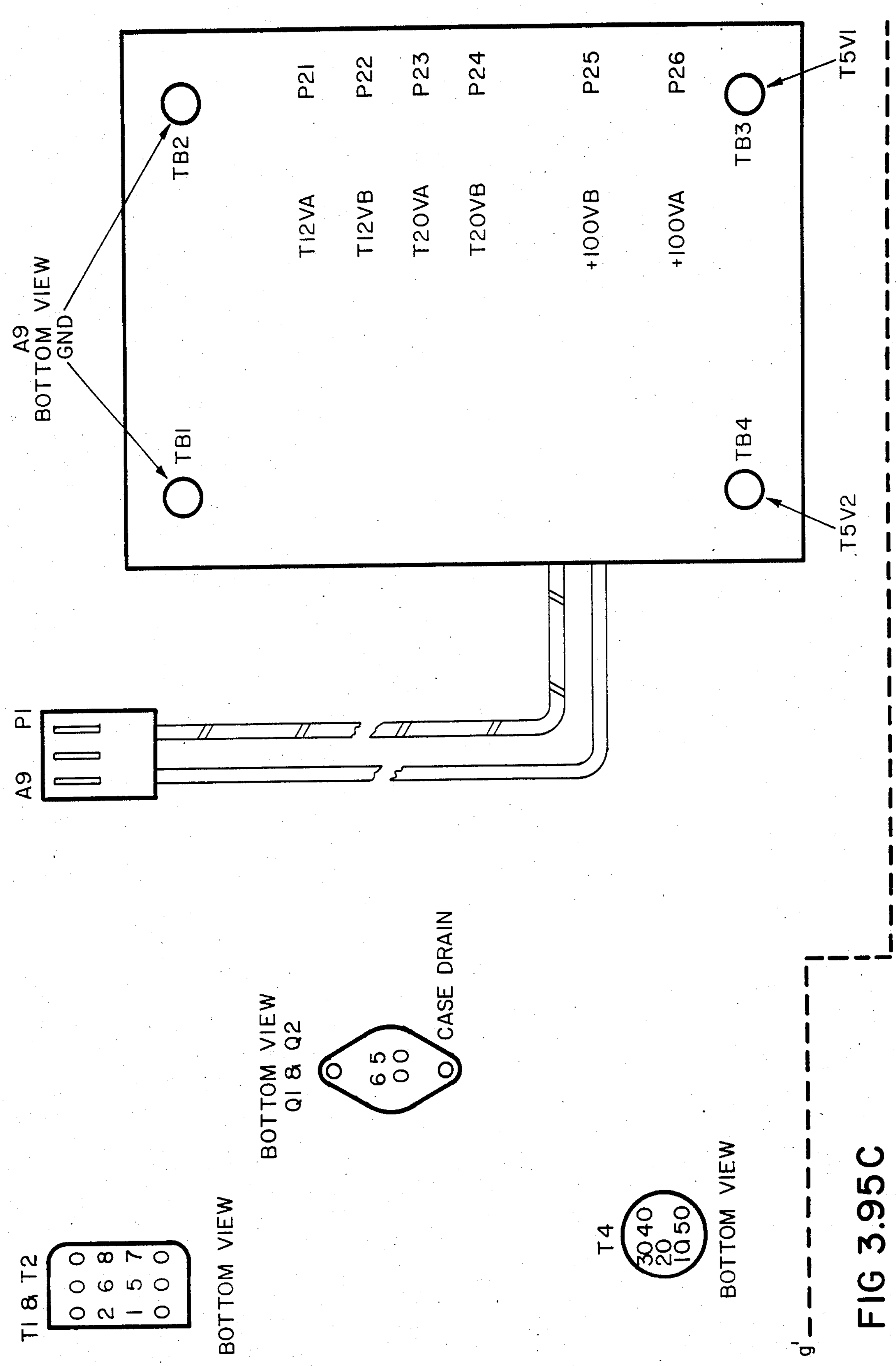
FIG 3.95C

RESISTANCE VALUES SHOWN ARE IN OHMS, CAPACITANCE IN MICROFARADS, AND INDUCTANCE IN MICROHENRIES UNLESS OTHERWISE NOTED.

PLUS AND MINUS 165 VOLTS DC AND LINE VOLTAGE ARE PRESENT WHENEVER THE POWER CABLE IS PLUGGED IN AND TURNED ON .

THERE IS NO GROUND TEST POINT ON THIS BOARD. OSCILLOSCOPE MEASUREMENT SHOULD BE MADE USING "A–B" DIFFERENTIAL MEASUREMENTS, "A" CHANNEL IS THE INPUT AND "B" CHANNEL IS CONNECTED TO TP1 ( AC PRIMARY RETURN ).

THE GATES OF Q1 AND Q2 CANNOUT BE MEASURED WITH AN OSCILLOSCOPE PROBE. MEASURE GATE DRIVE AT TP2 AND TP4. REPLACE Q1 AND Q2 AT THE SAME TIME .

FOR 115V LINE OPERATION CR5–CR7 ACT AS A VOLTAGE DOUBLER.
FOR 230V LINE OPERATION CR4–CR7 ACT AS A FULL WAVE RECTIFIER.

FIG 3.95D

FIG 3.97A
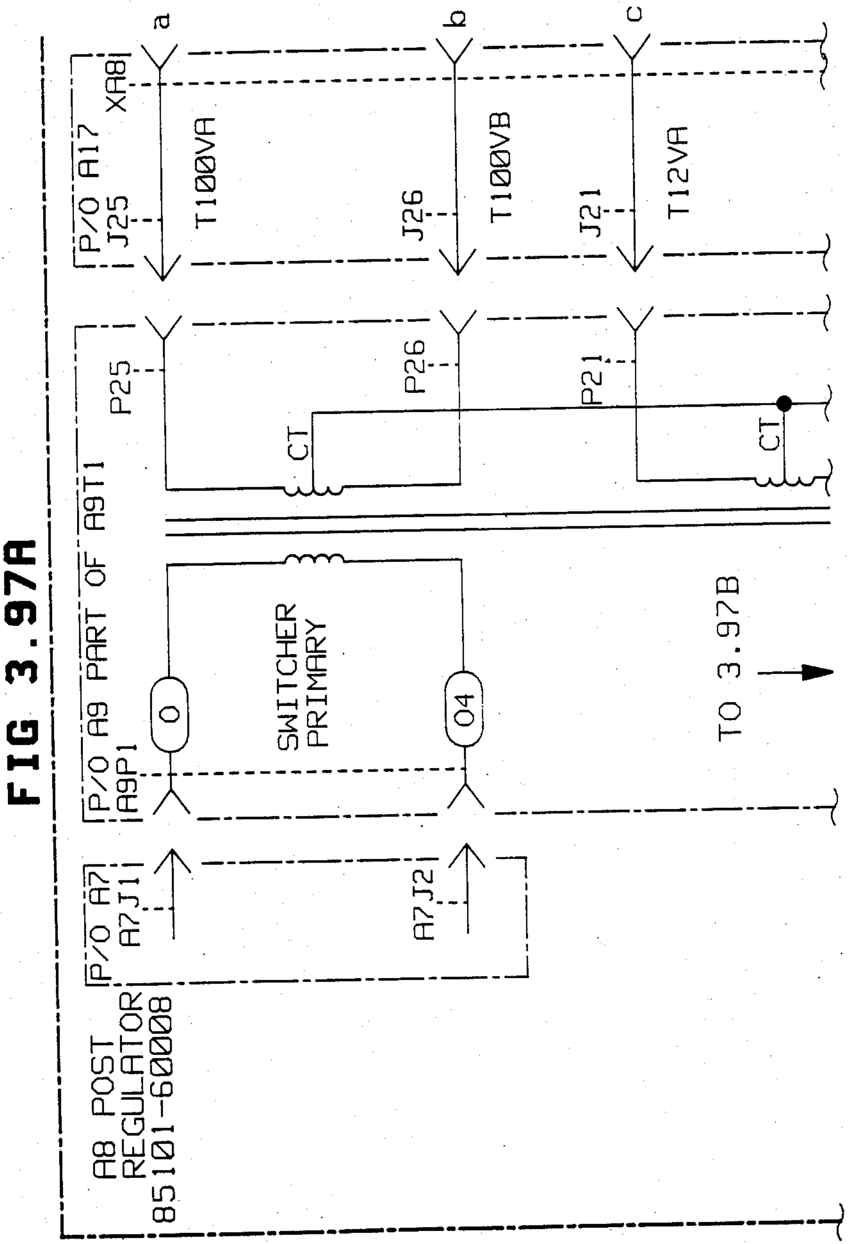

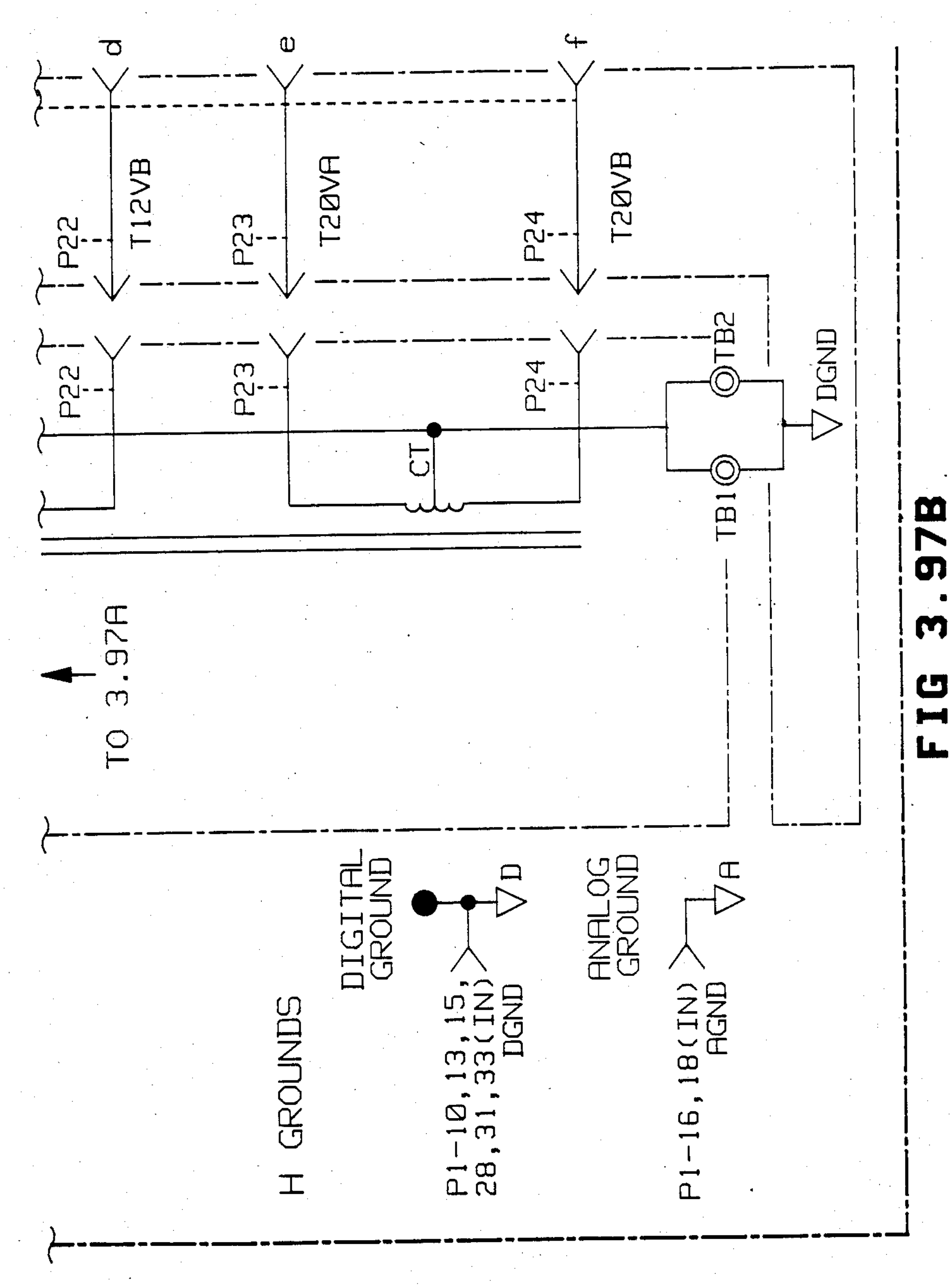
FIG 3.97B

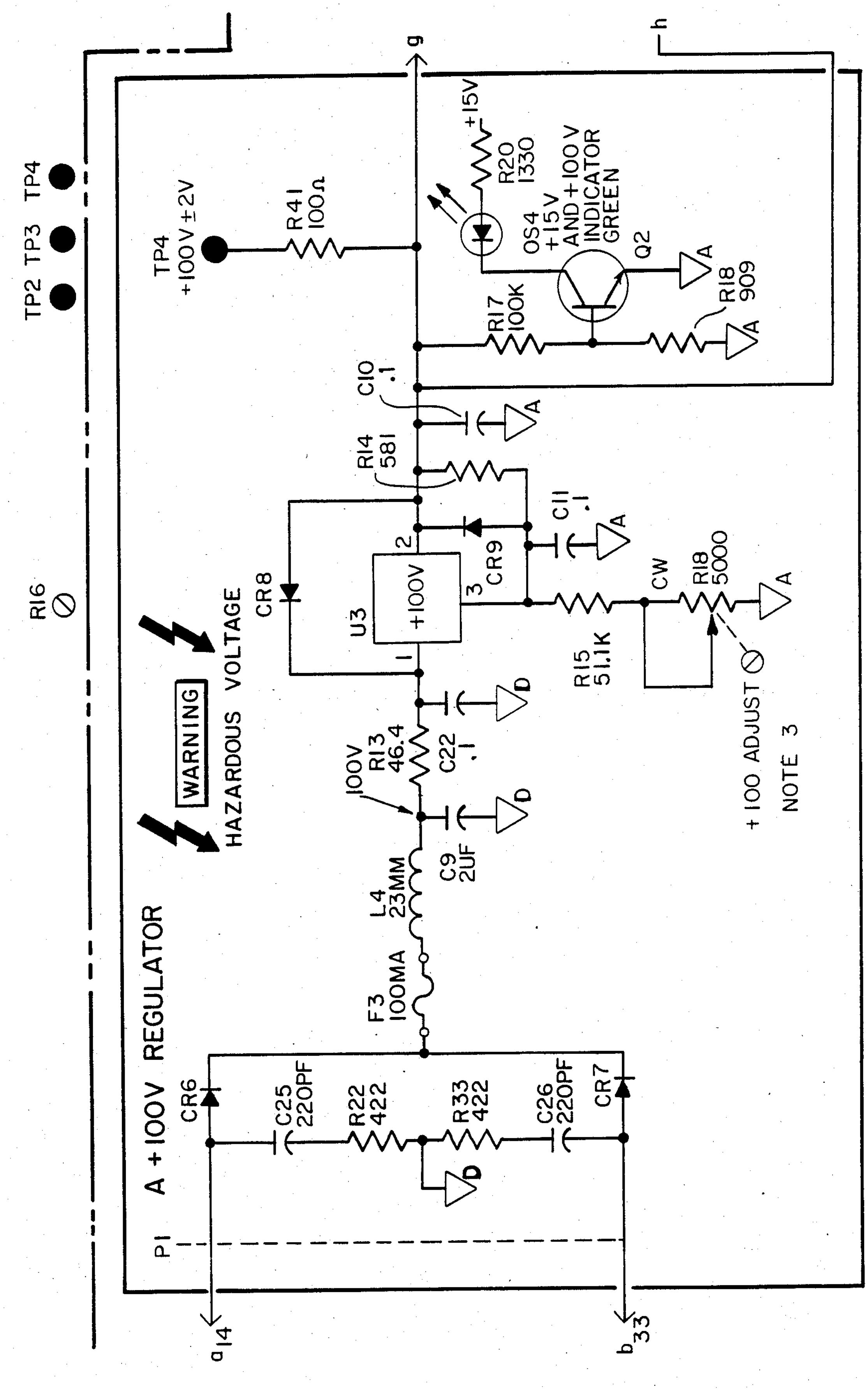
FIG 3.98A

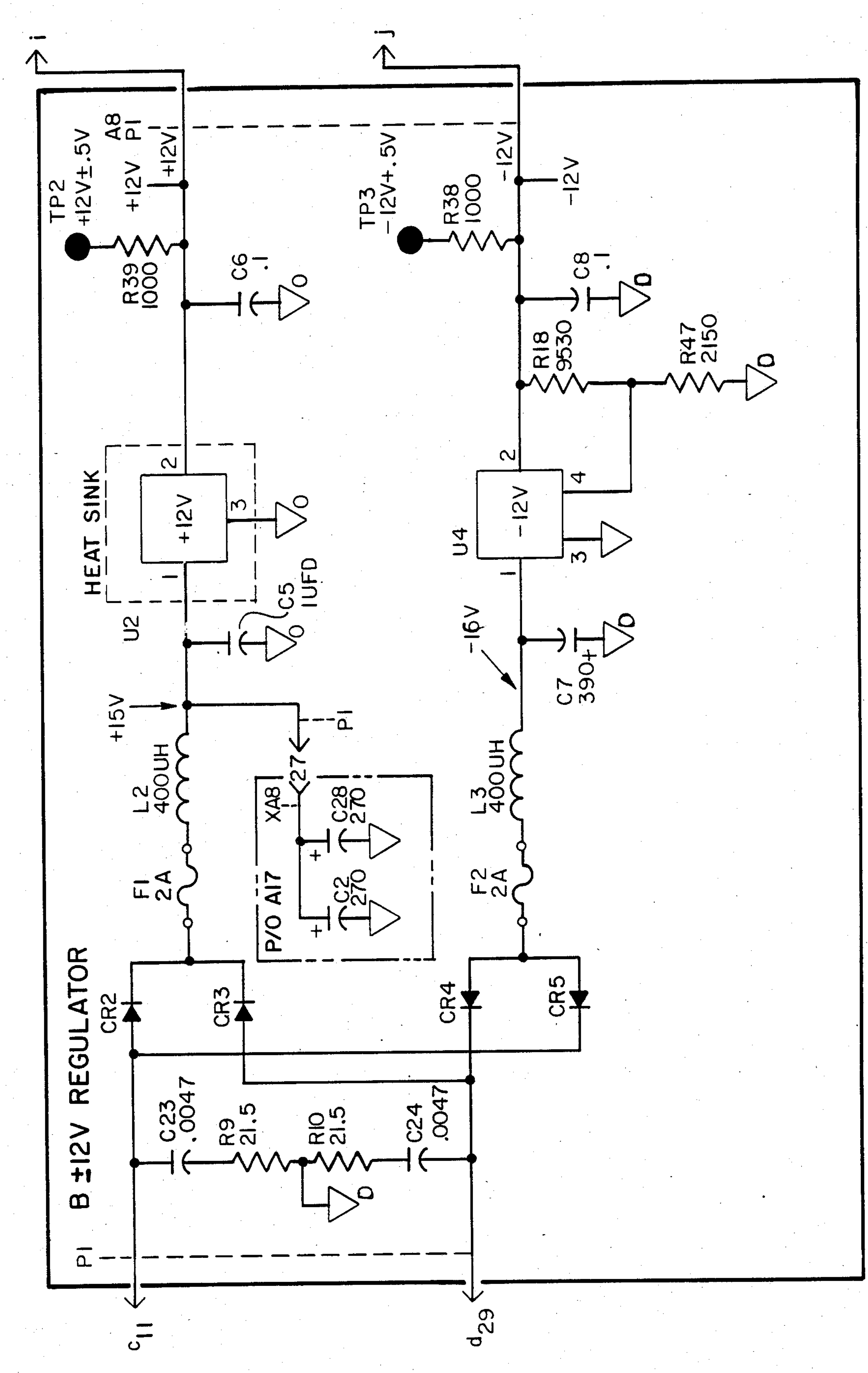
FIG 3.98B

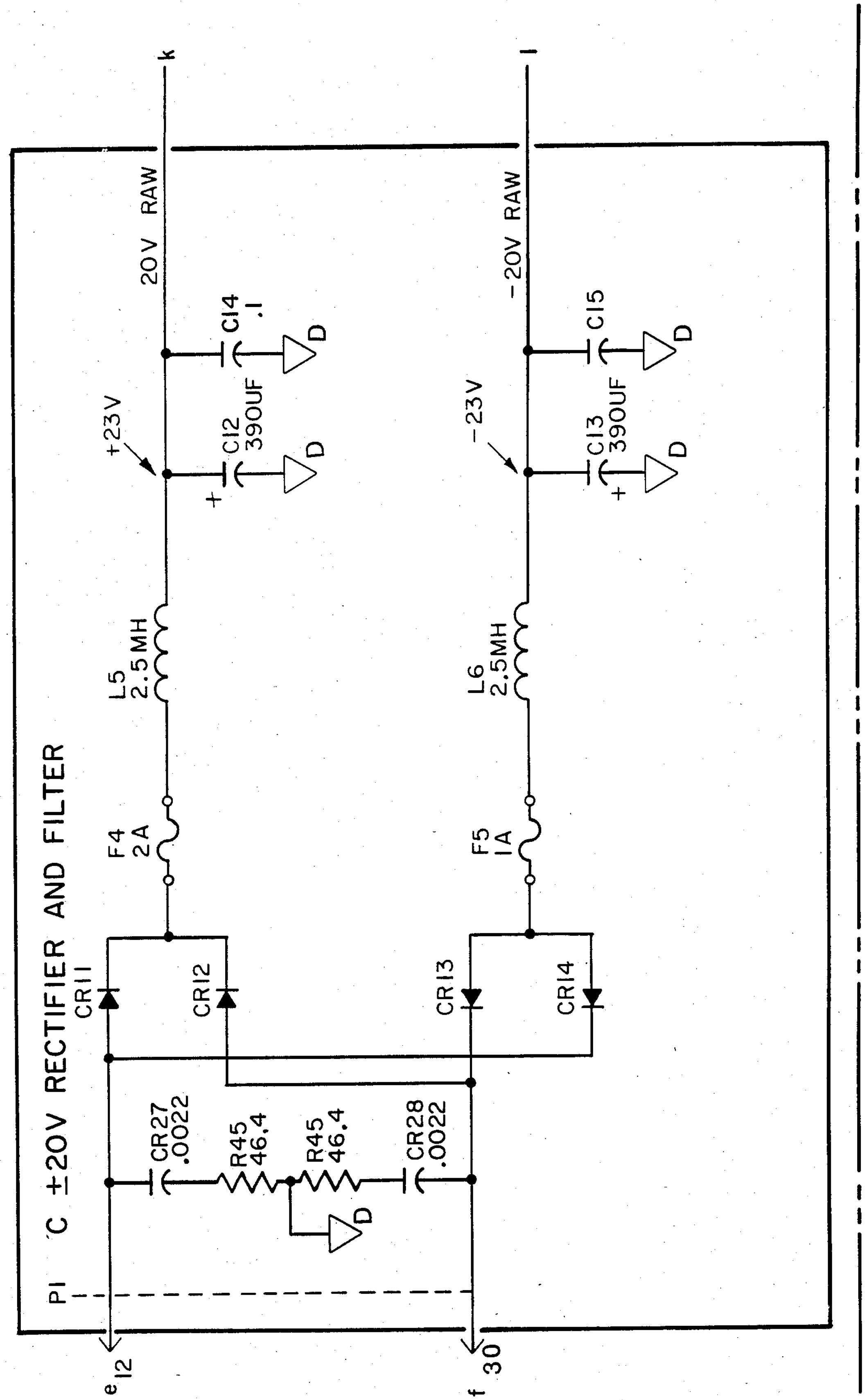
FIG 3.98C

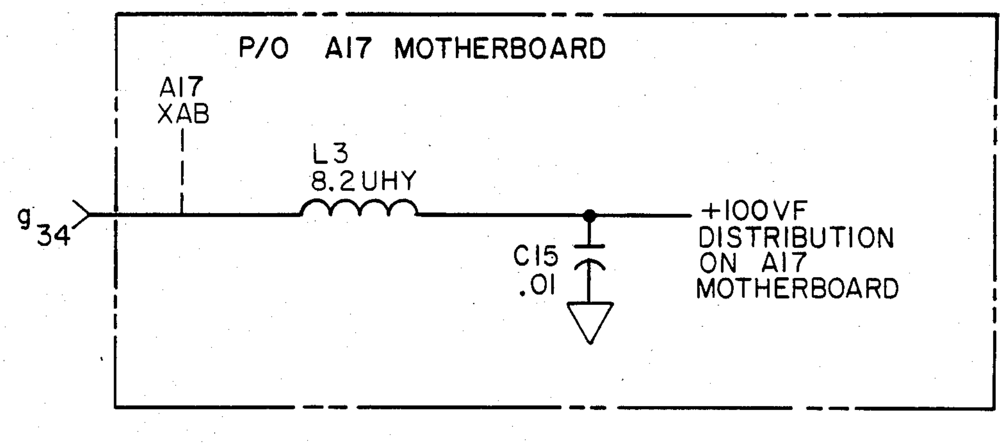
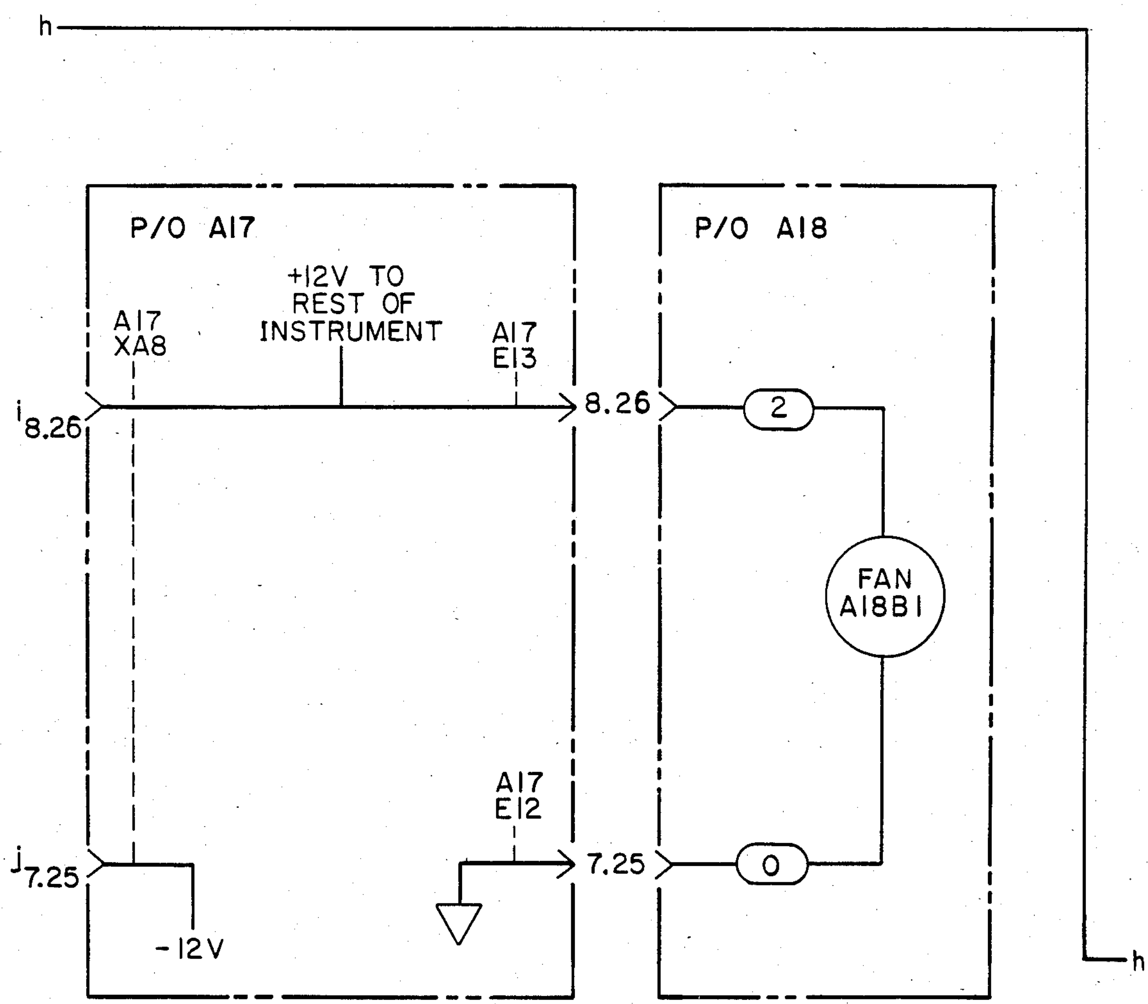
FIG 3.99A

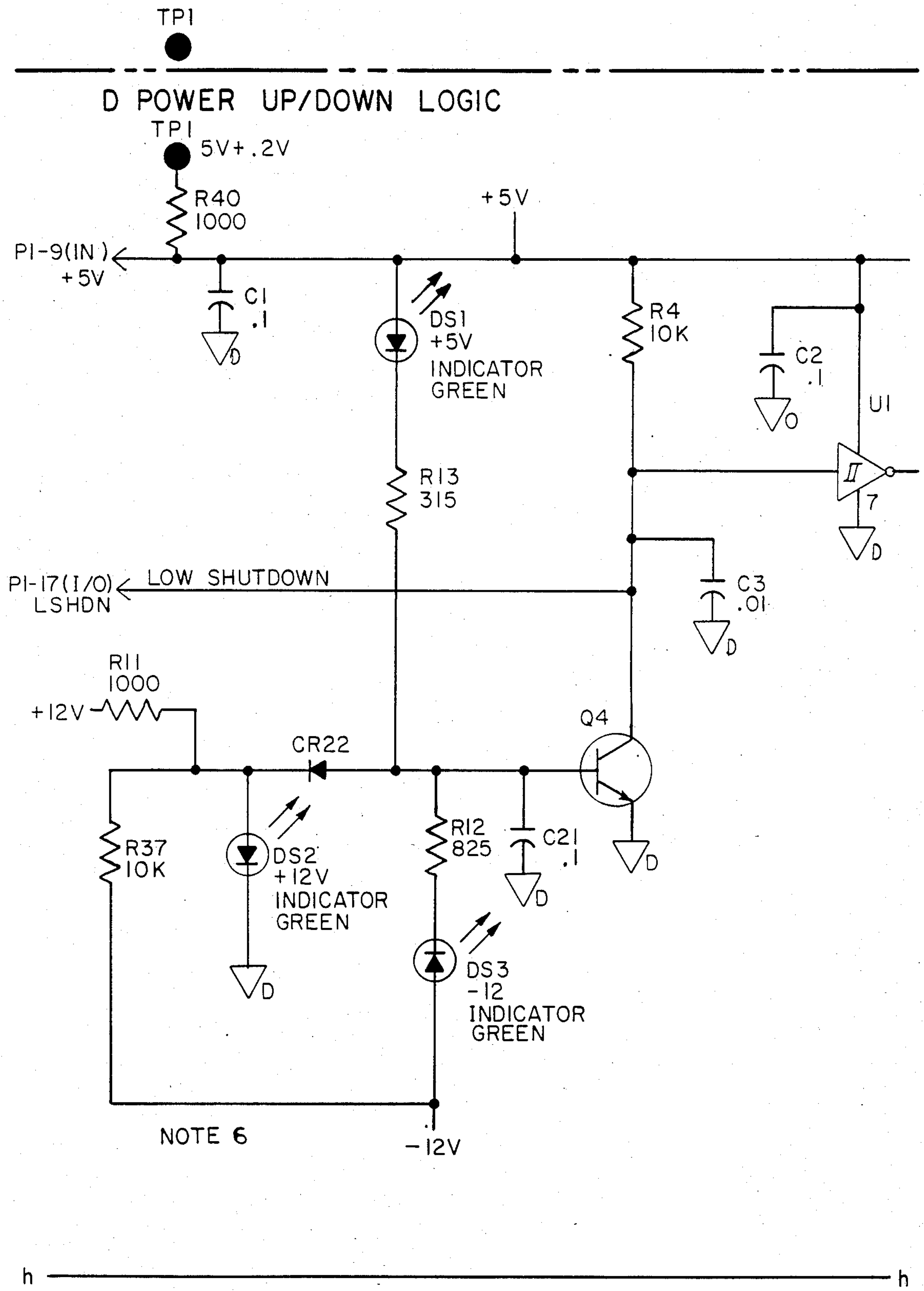
FIG 3.99B

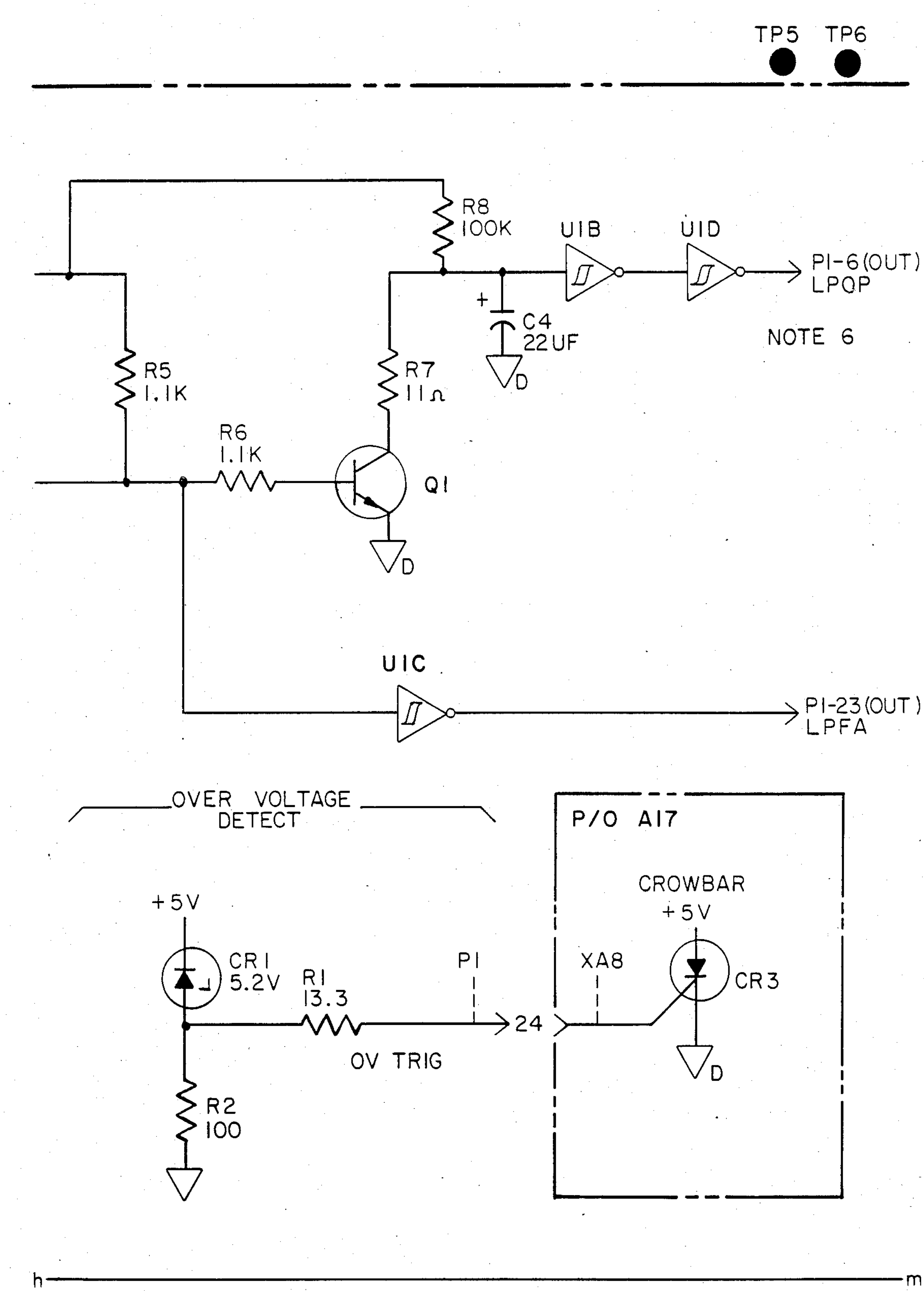
FIG 3.99C

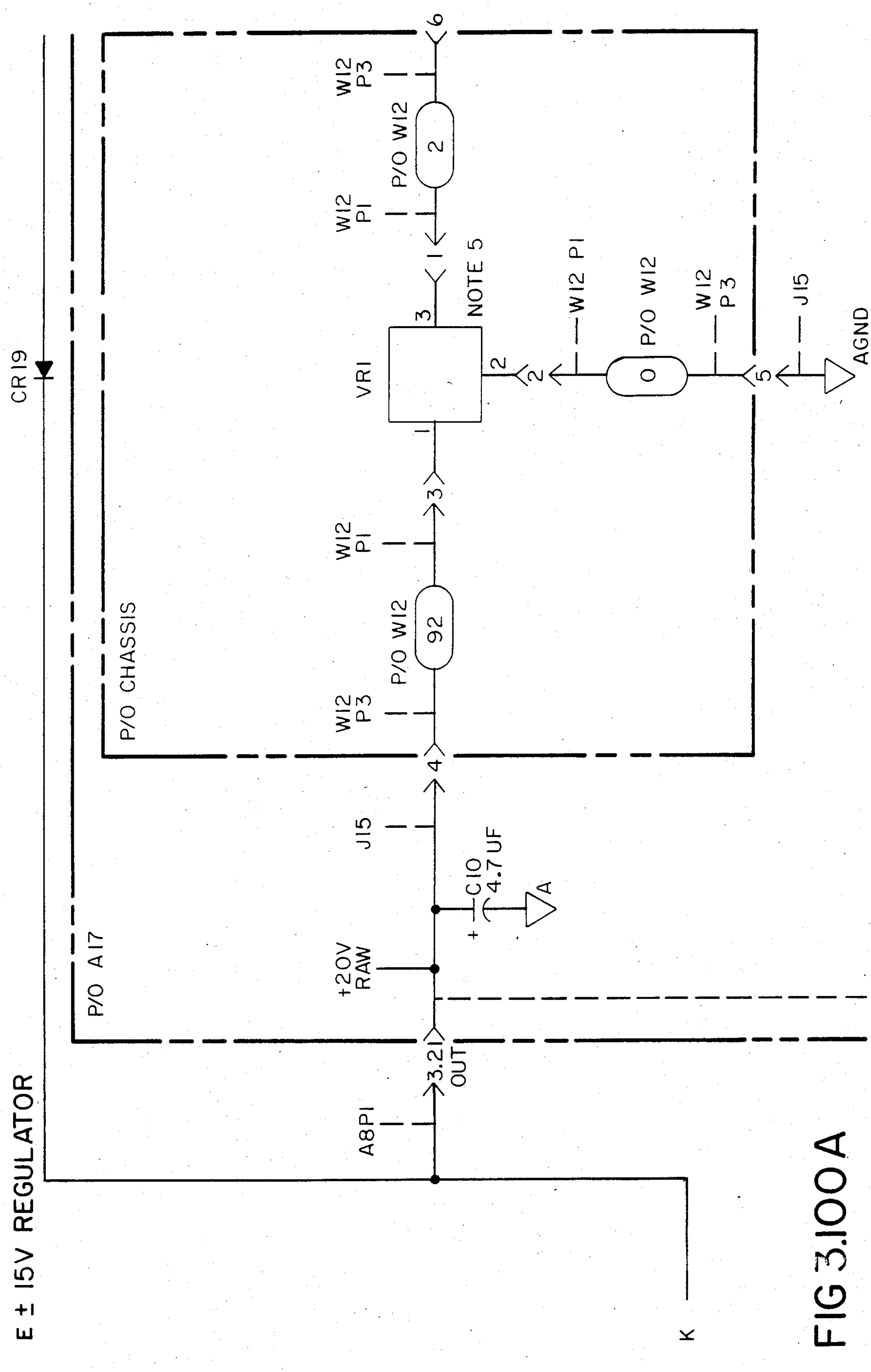
FIG 3.100A

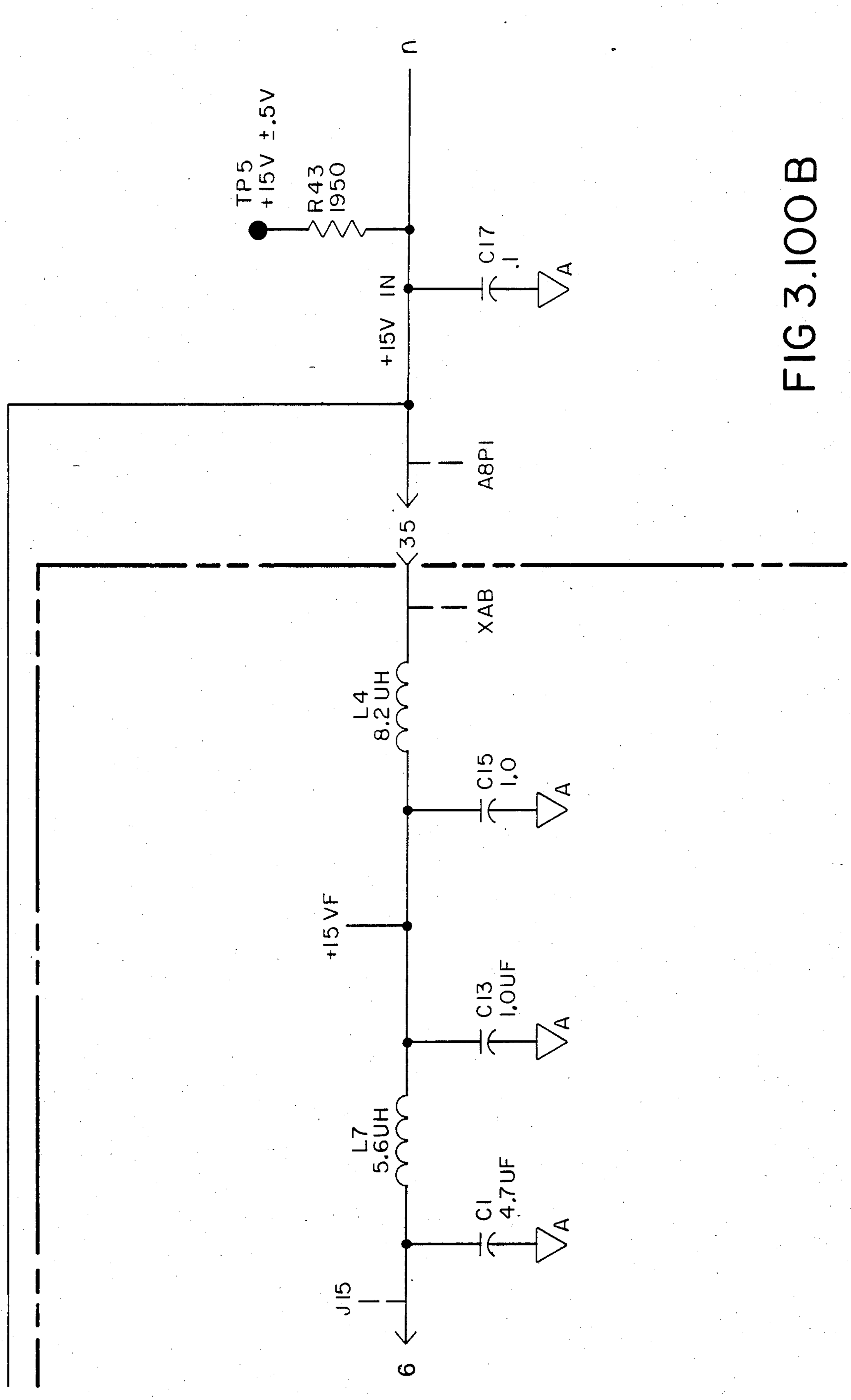
FIG 3.100B

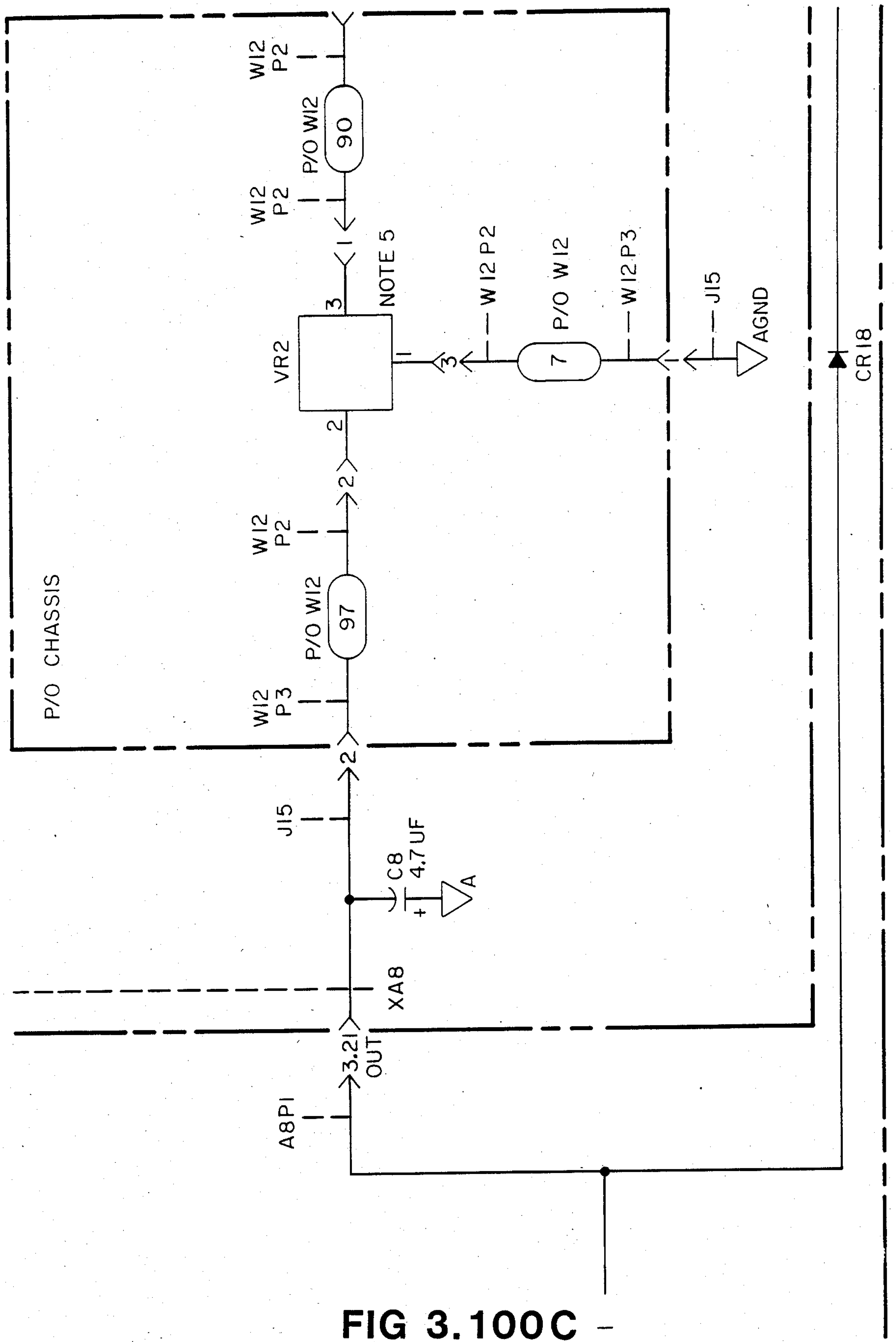
FIG 3.100C -

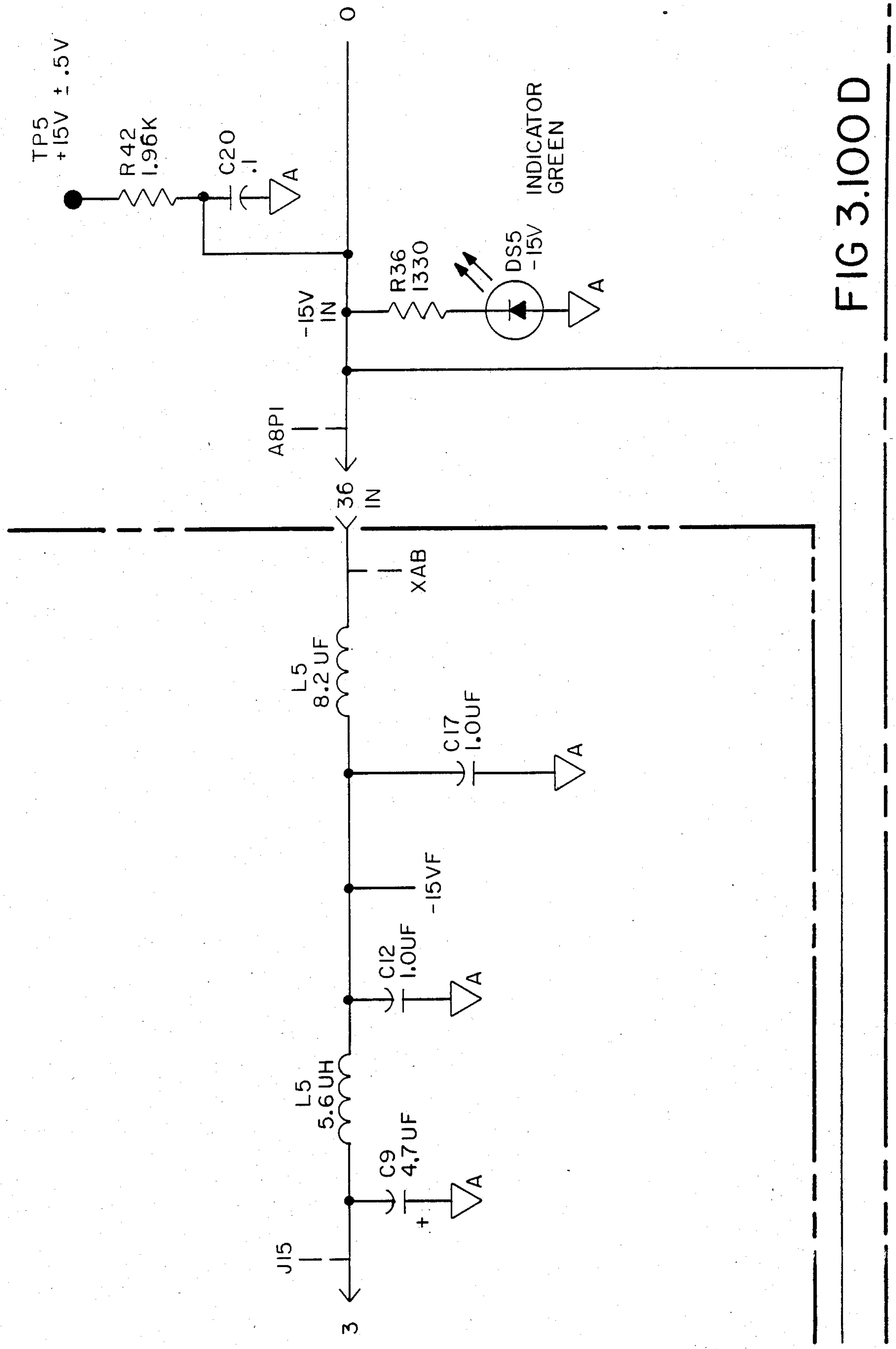
FIG 3.100D

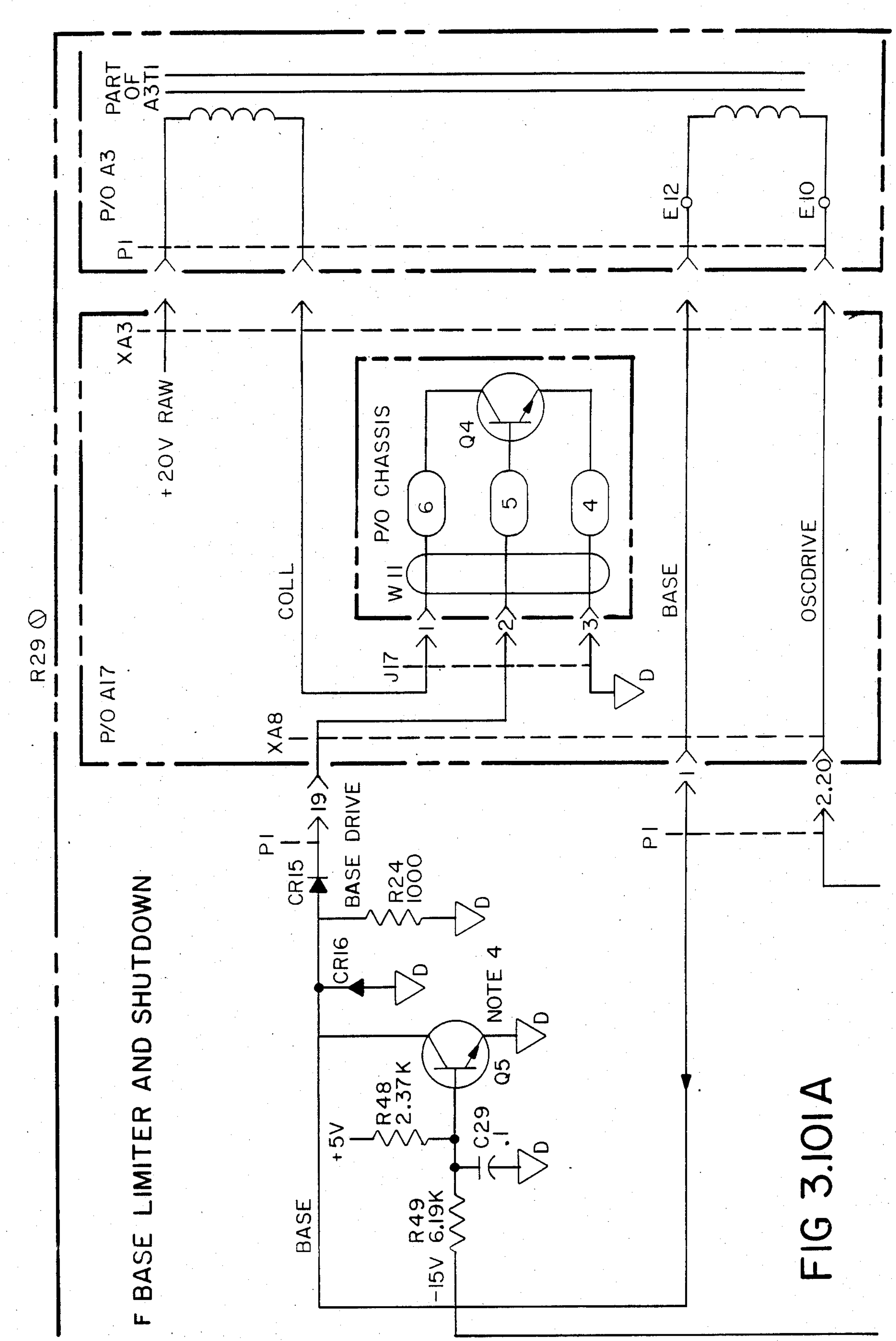
FIG 3.101A

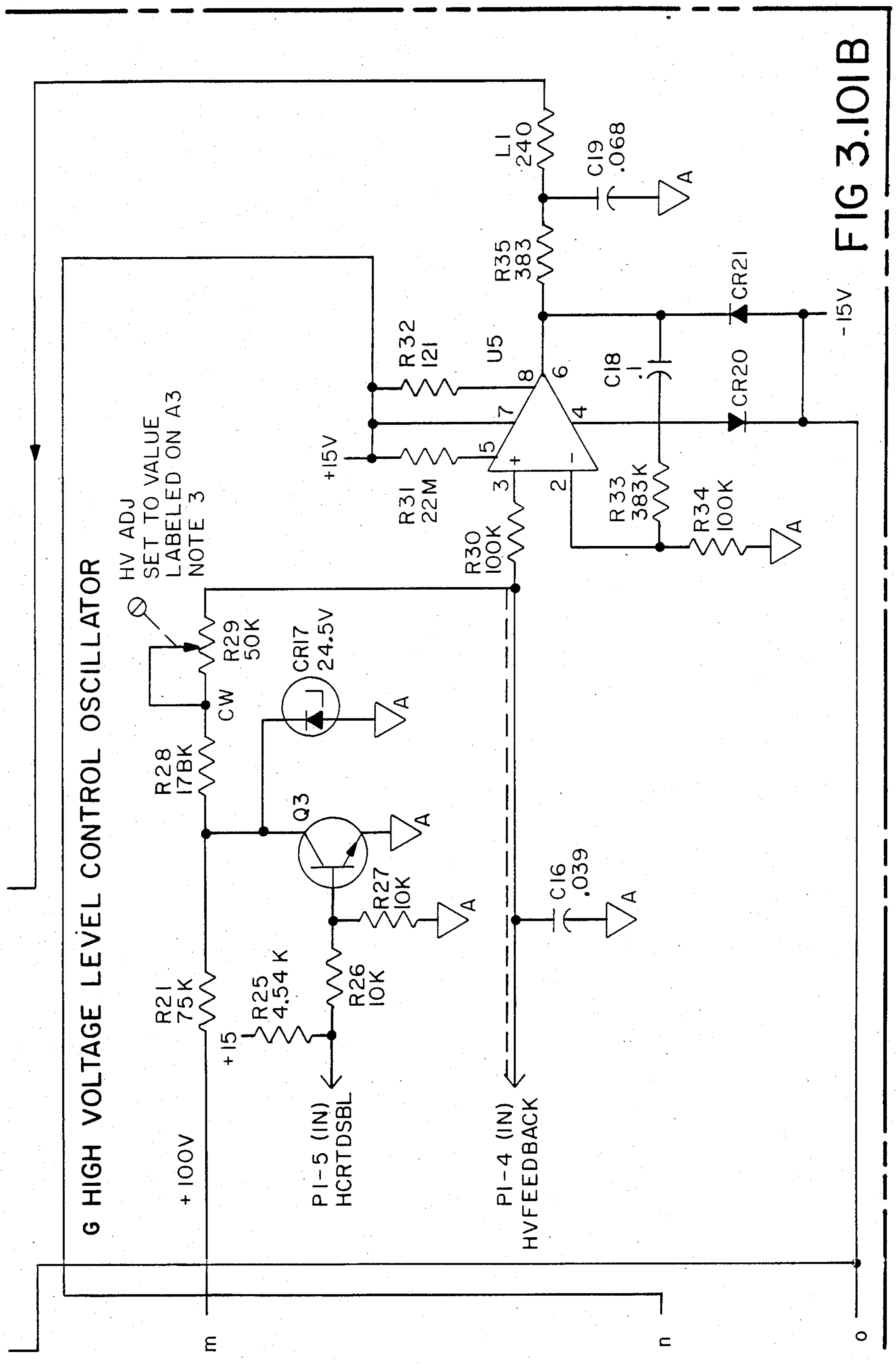
FIG 3.101B

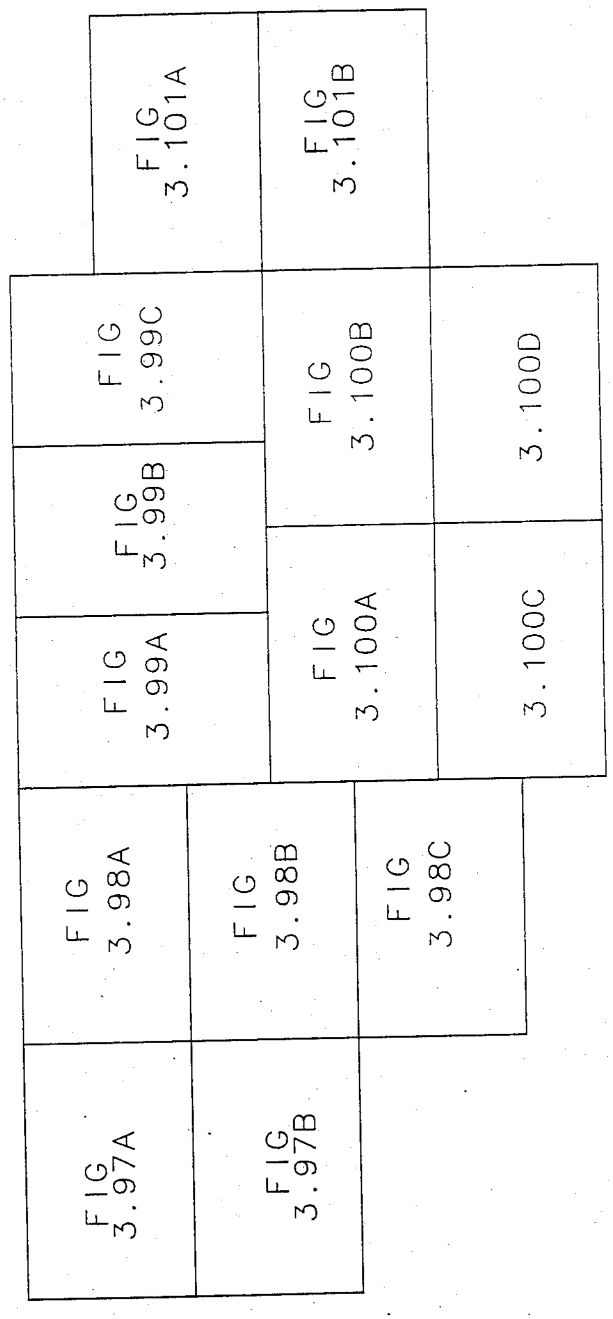
FIG 3.102

8511A/8512A/8513A INTERCONNECTION
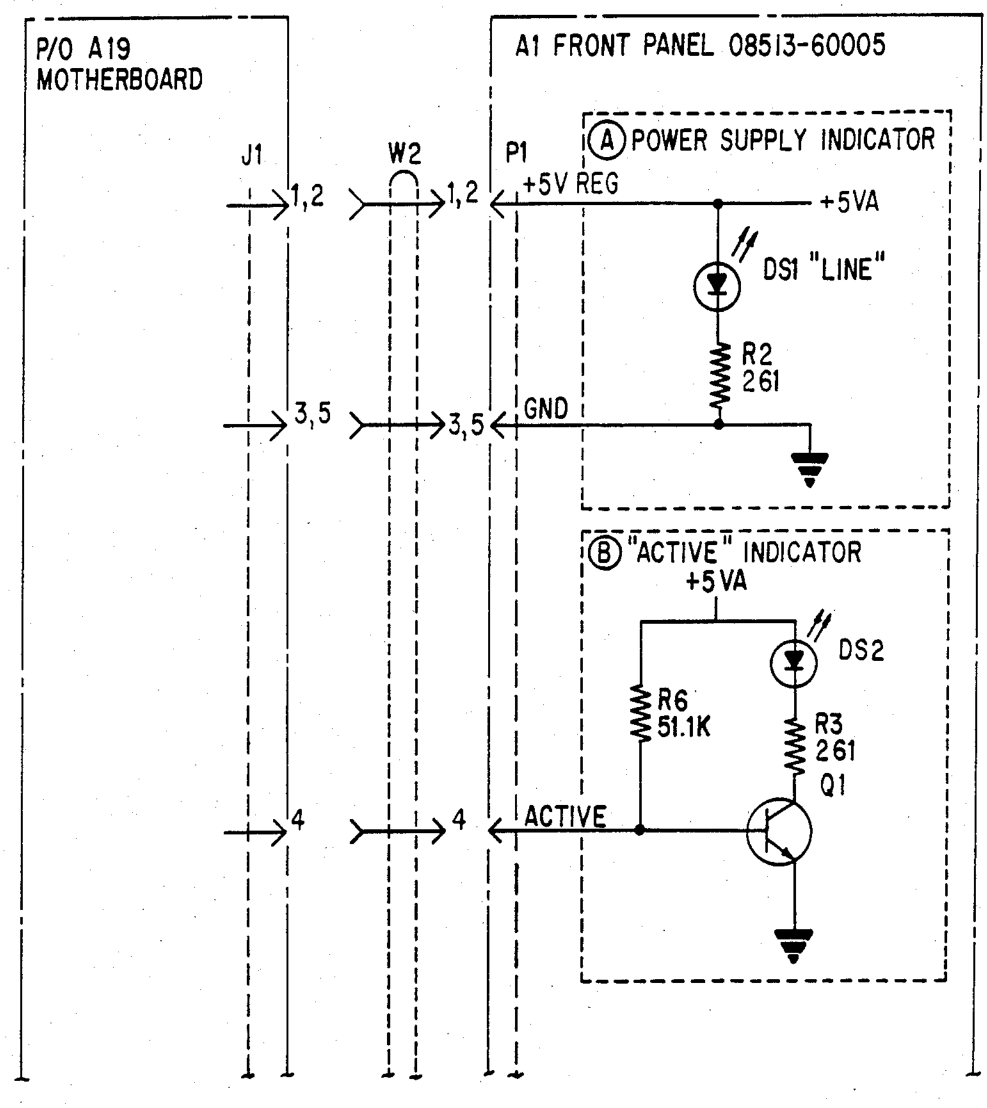
FIG. 24.1A

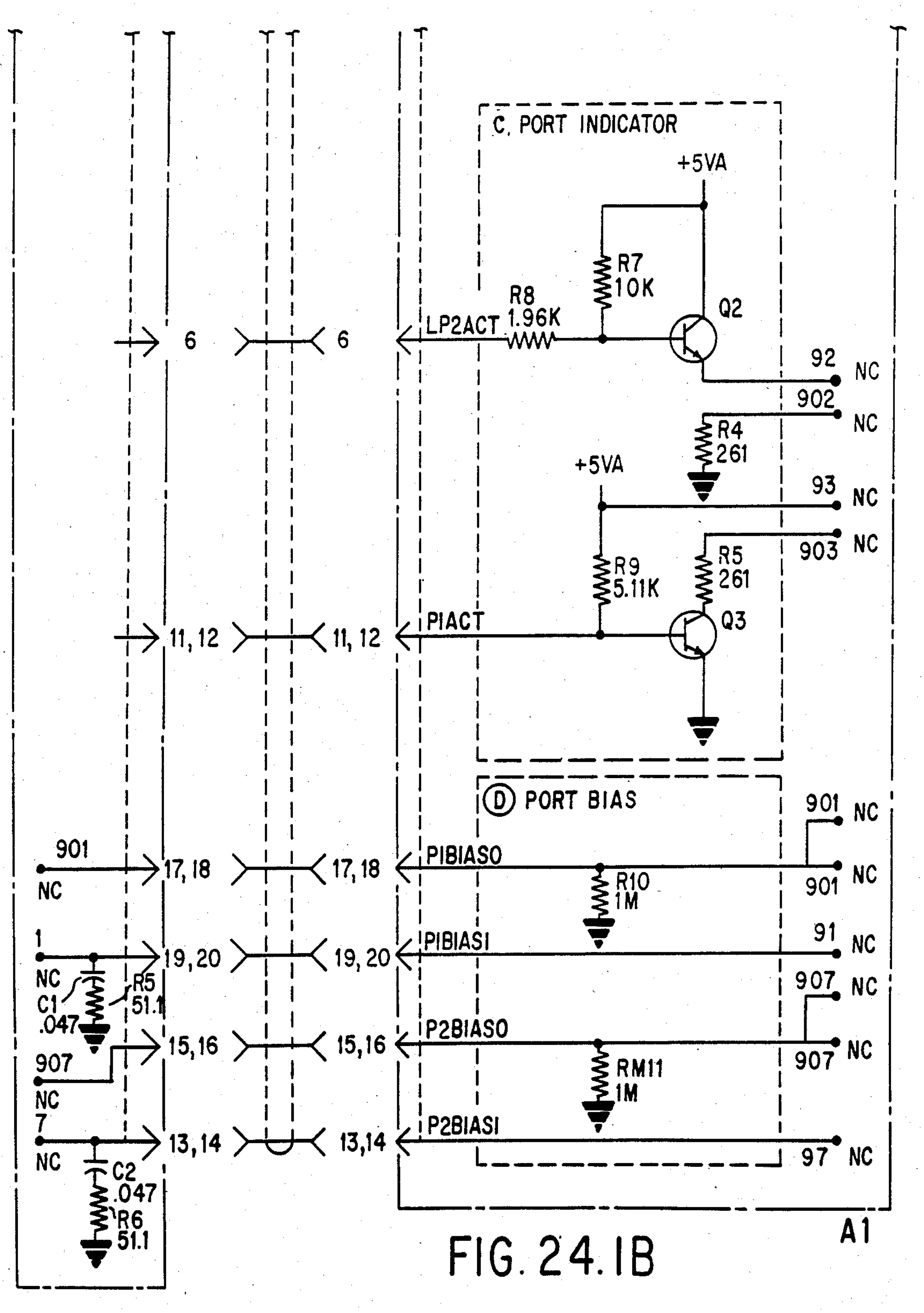
FIG. 24.1B

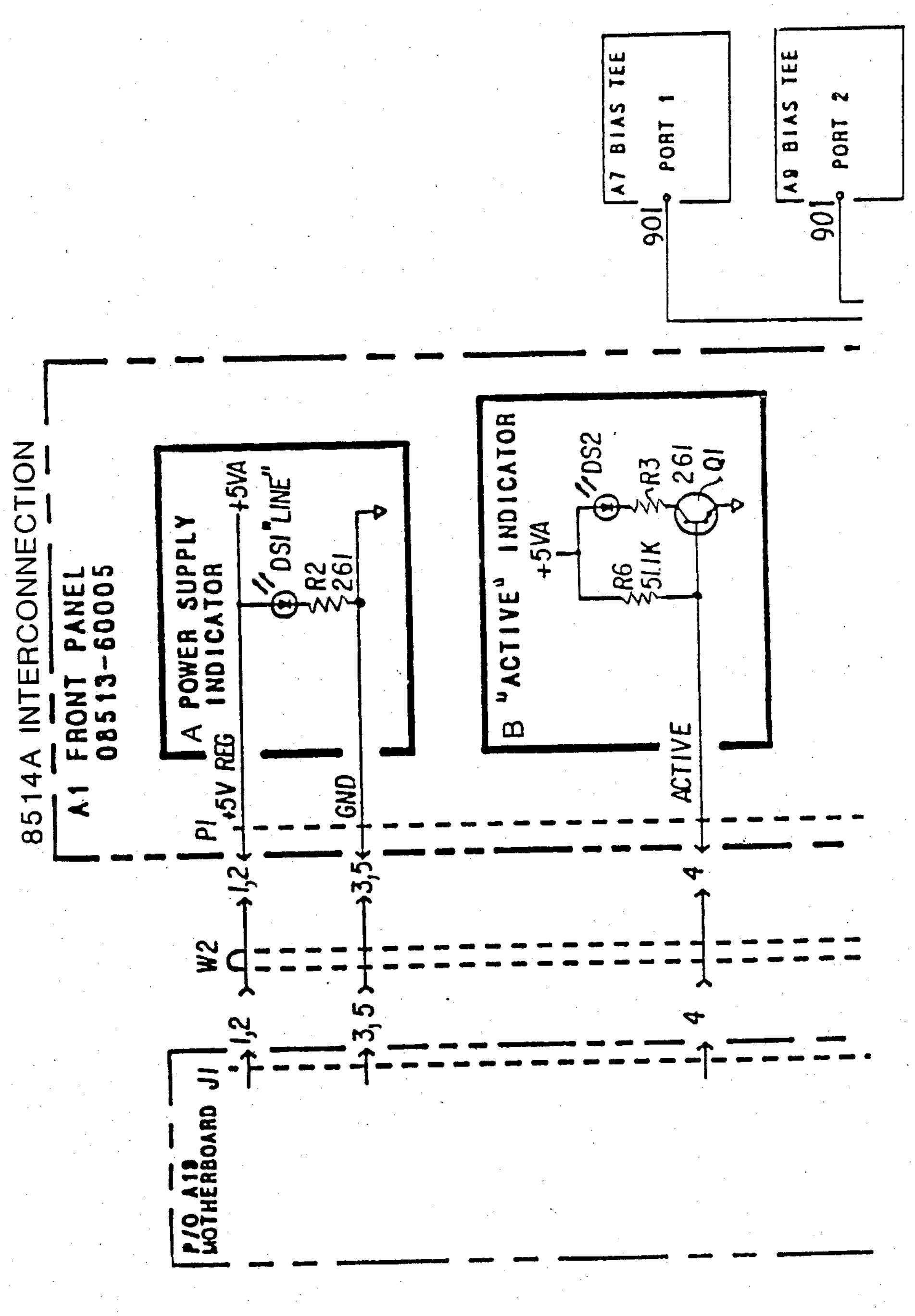
FIG 24.2A

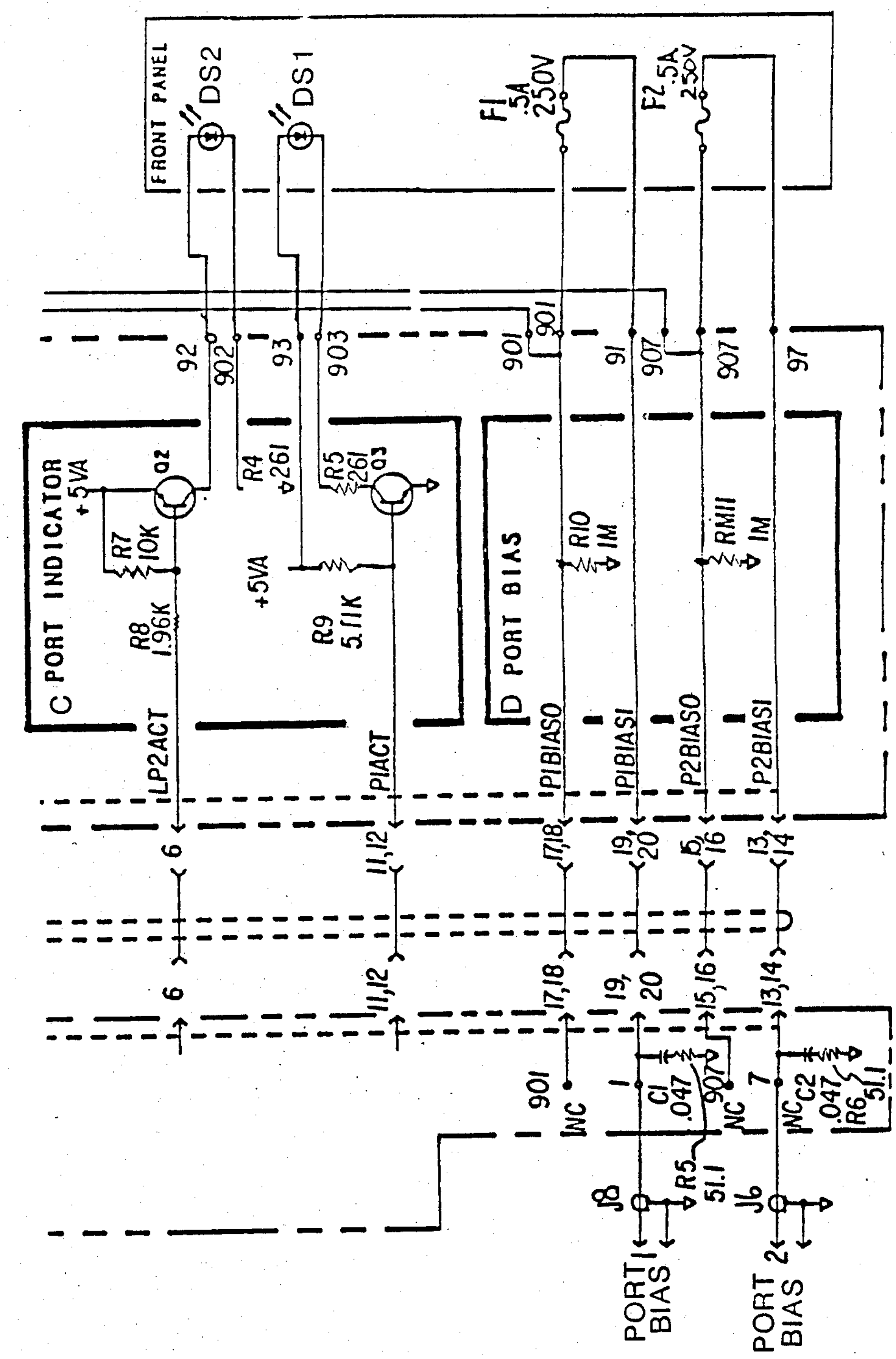
FIG 24.2B

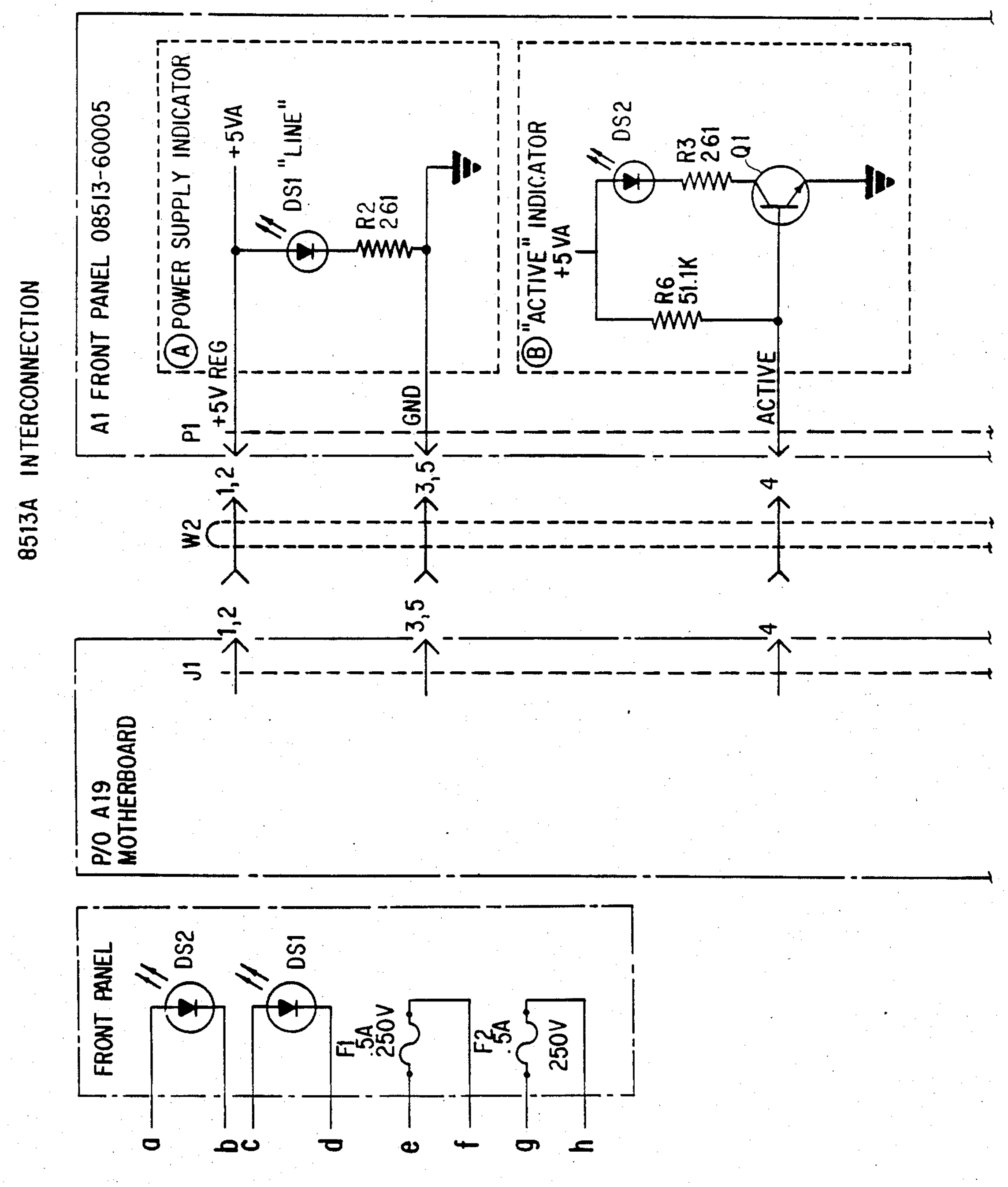
FIG. 24.3A

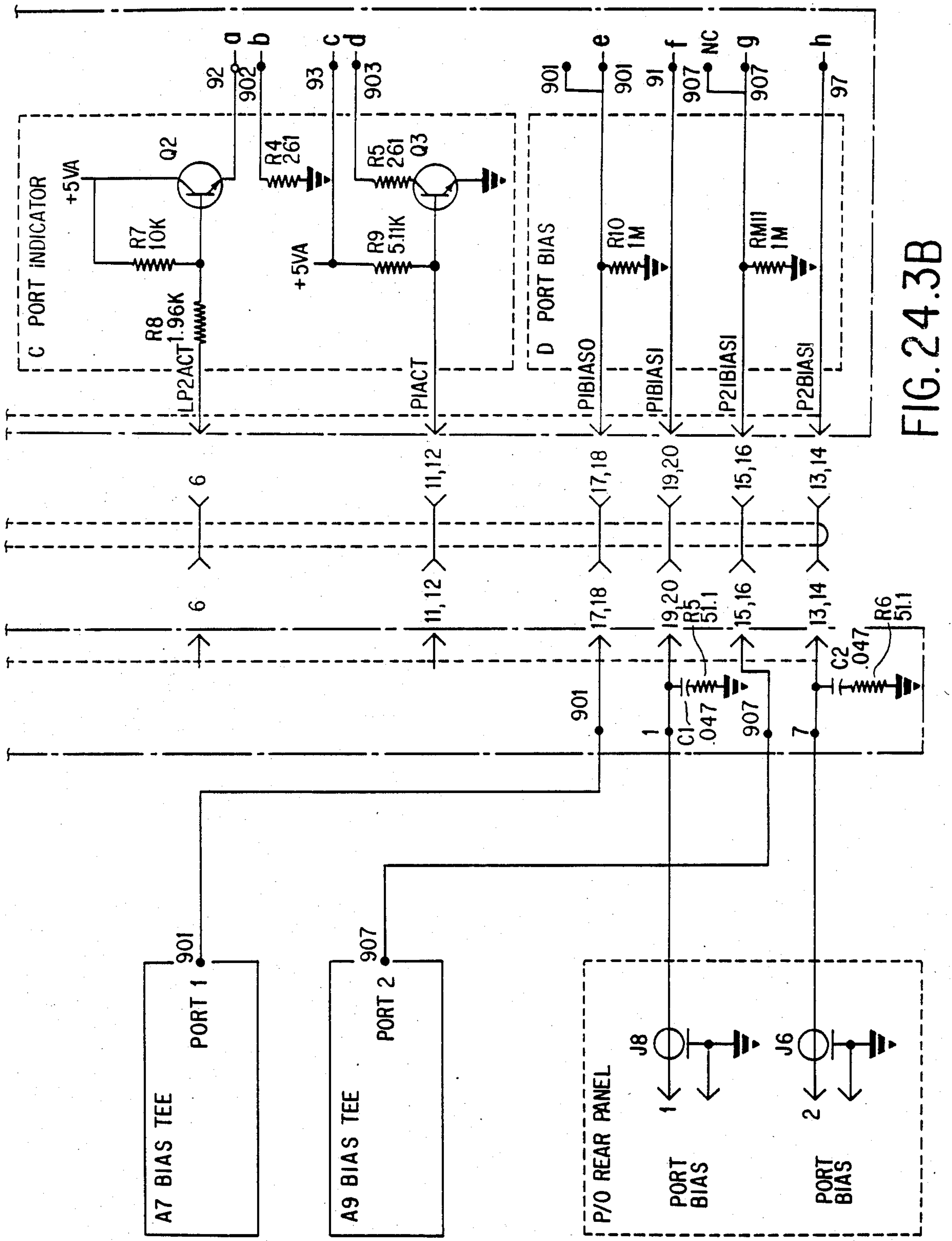
FIG. 24.3B

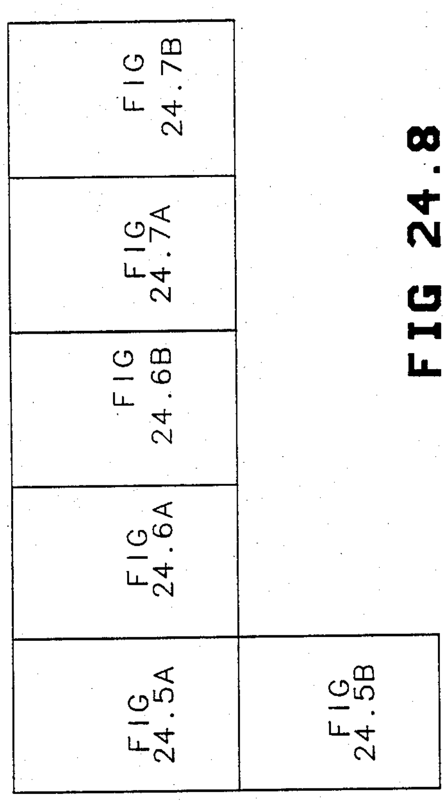
FIG 24.8
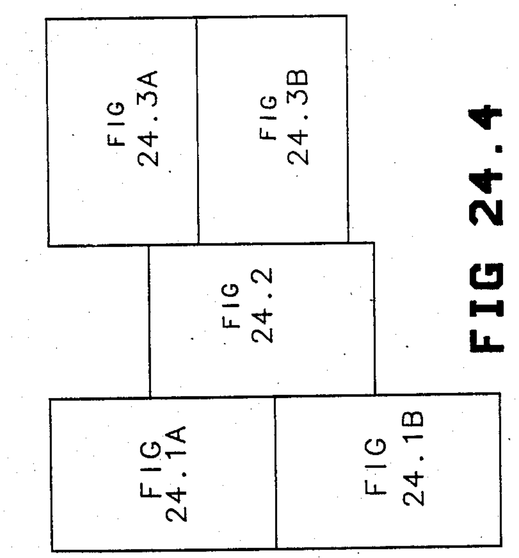
FIG 24.4
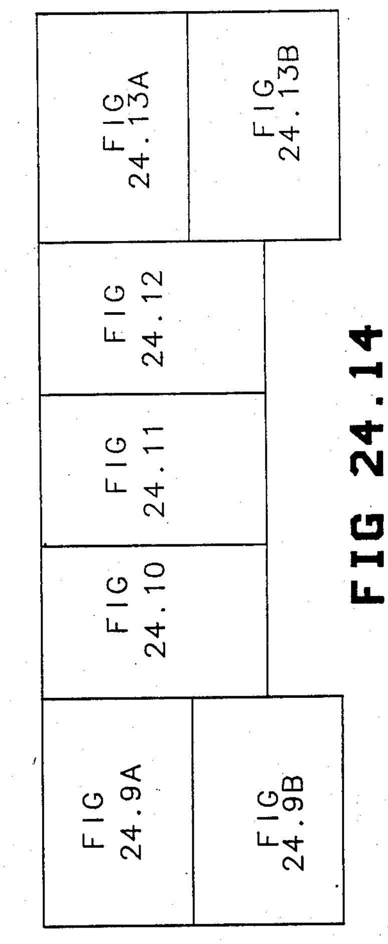
FIG 24.14

FIG. 24.5A

| PIN | SIGNAL | TO/FROM | FUNCTION BLOCK |
|---|---|---|---|
| 1<br>23 | | | |
| 2<br>24 | IF1<br>IF2 | NC<br>NC | B |
| 3<br>25 | | | |
| 4<br>26 | | | |
| 5<br>27 | LBIOS | A4 | A |
| 6<br>28 | PNON | A15 | B |
| 7<br>29 | AB0 | A4 | A |
| 8<br>30 | AB1<br>AB2 | A4<br>A4 | A |
| 9<br>31 | AB3<br>AB4 | A4<br>A4 | A |
| 10<br>32 | +15V REG | A15 | G |
| 11<br>33 | GND | GND BUS | G |
| 12<br>34 | GND | GND BUS | G |
| 13<br>35 | -15V REG | A15 | G |
| 14<br>36 | +5V REG | A15 | G |
| 15<br>37 | DB0<br>DB1 | A4<br>A4 | B |
| 16<br>38 | DB2<br>DB3 | A4<br>A4 | B |
| 17<br>39 | | | |
| 18<br>40 | DB6<br>DB7 | A4<br>A4 | B |
| 19<br>41 | | | |
| 20<br>42 | IF NUX | A3 | A |
| 21<br>43 | | | |
| 22<br>44 | | | |

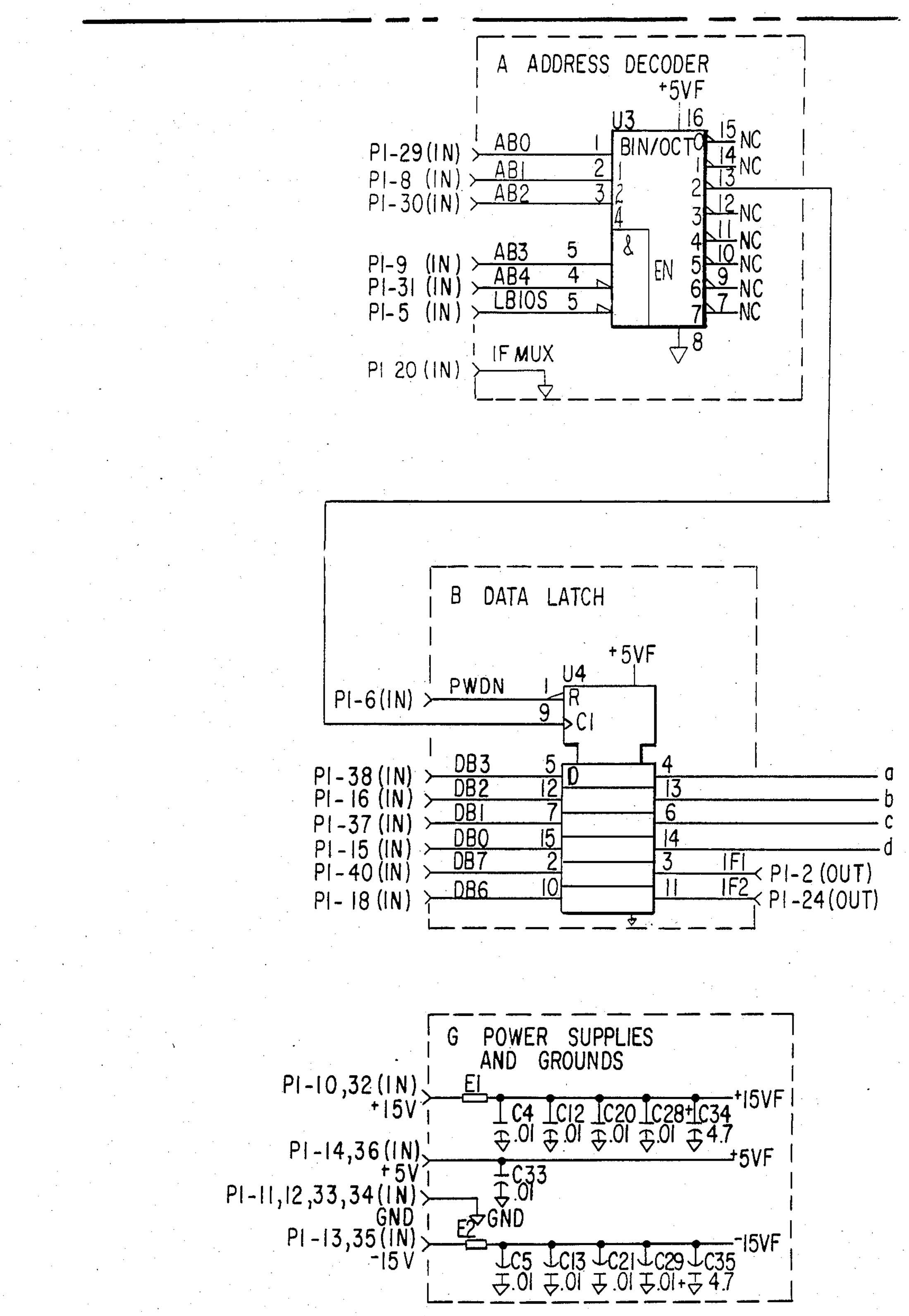
FIG 24.5B

FIG. 24.6A
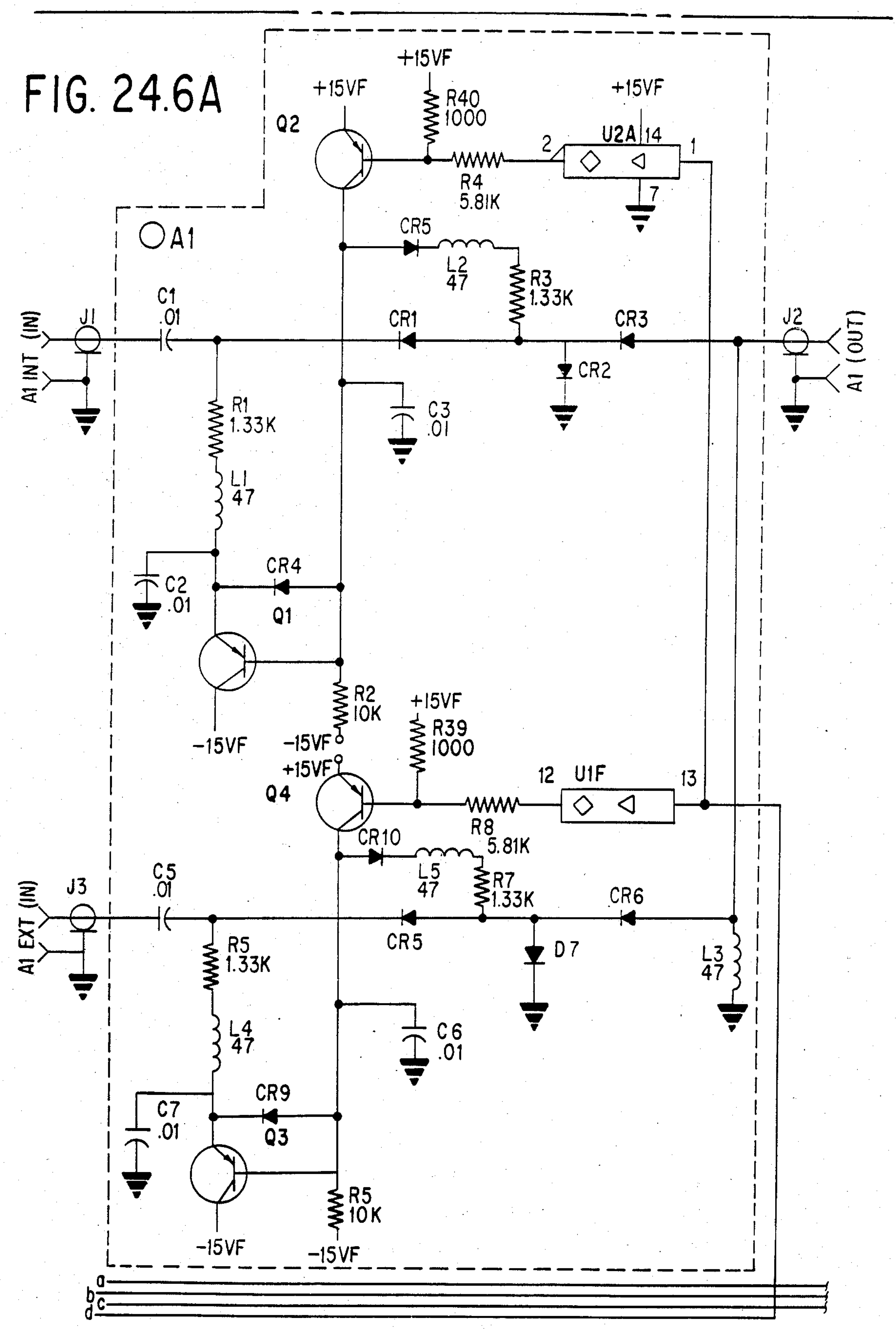

FIG. 24.6B
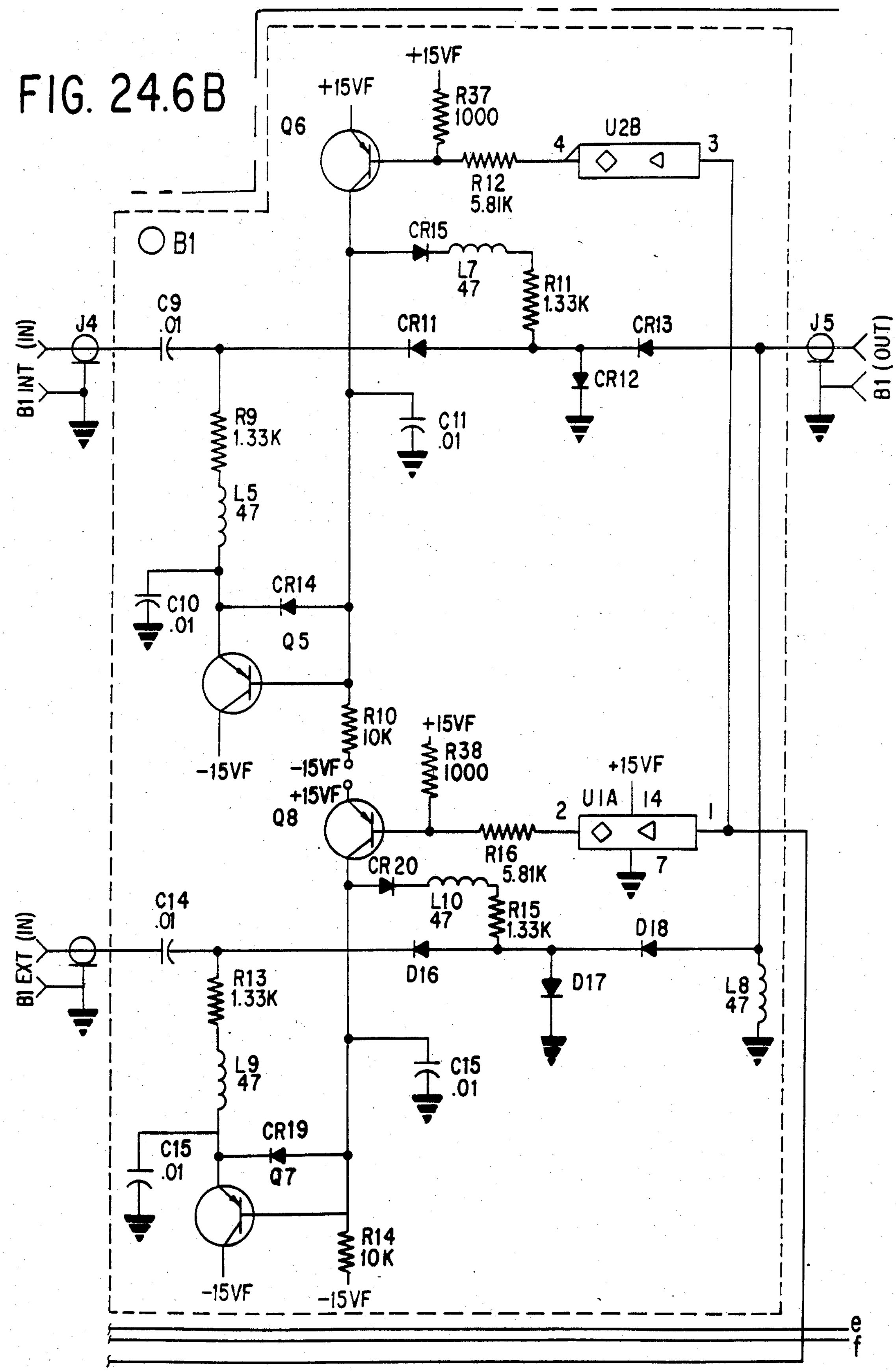

FIG. 24.7A
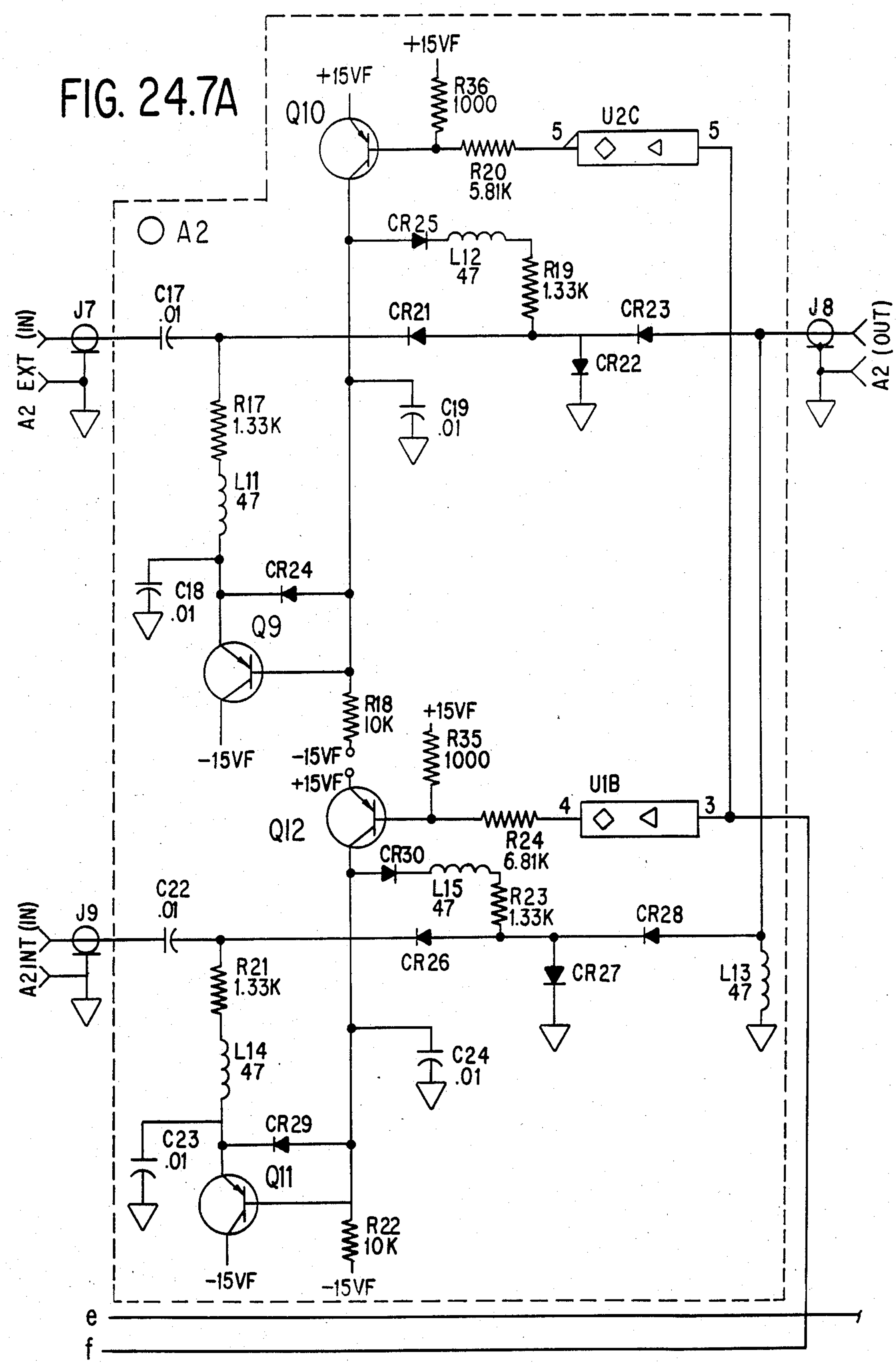

FIG. 24.7B
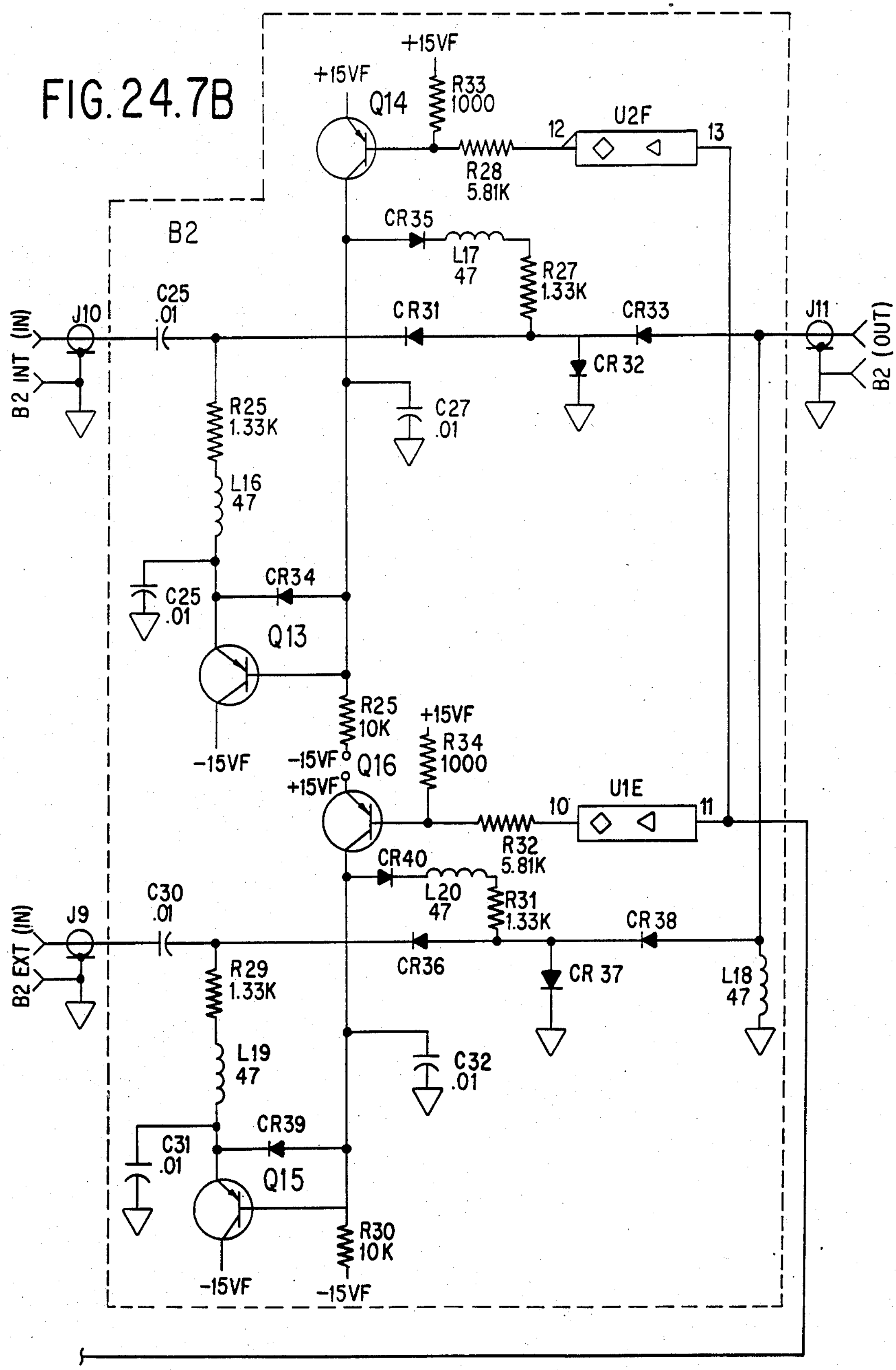

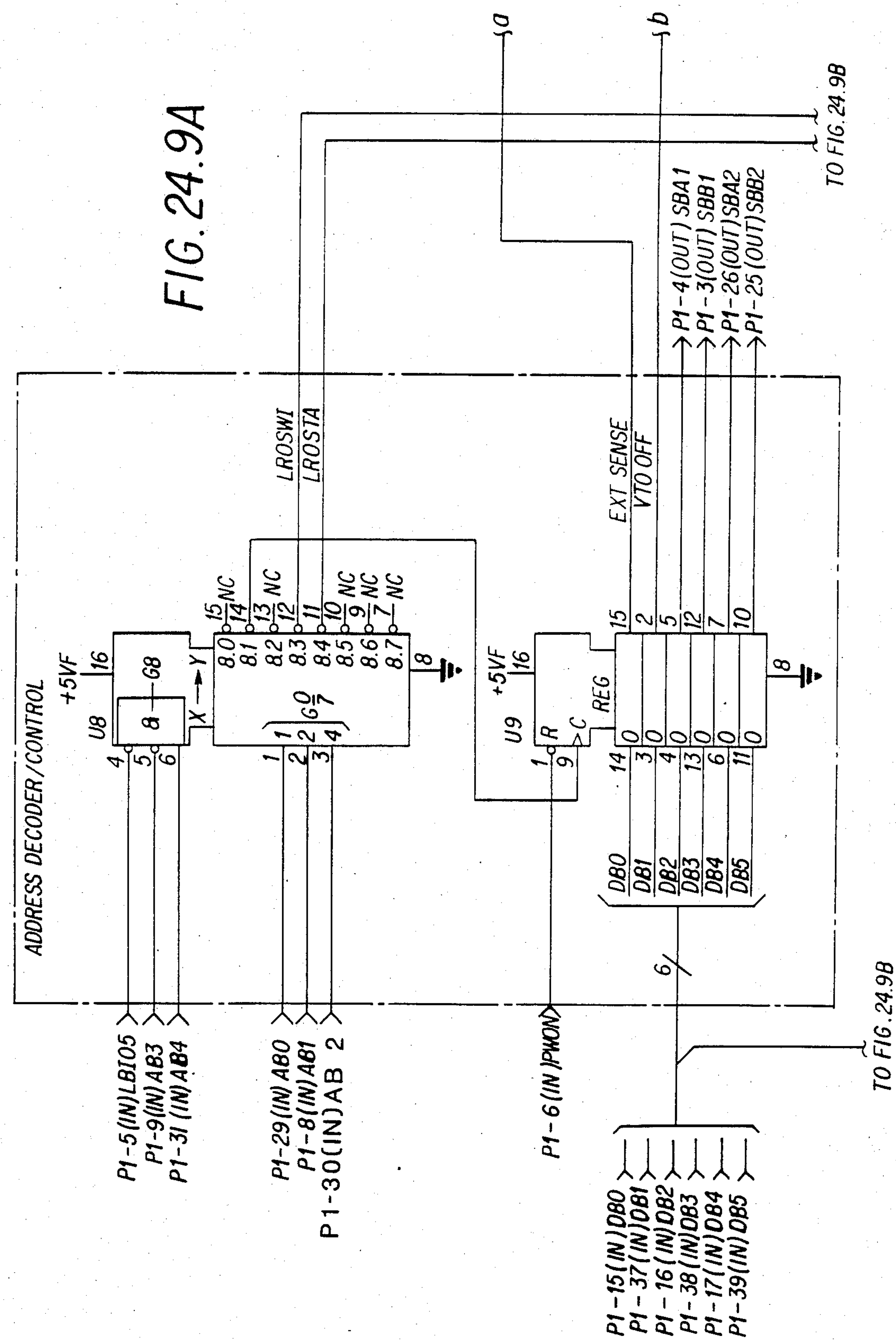
FIG. 24.9A
ADDRESS DECODER/CONTROL
U8
+5VF
U9
REG
LROSWI
LROSTA
EXT SENSE
VTO OFF
NC
a
b
TO FIG. 24.9B
P1-4(OUT) SBA1
P1-3(OUT) SBB1
P1-26(OUT) SBA2
P1-25(OUT) SBB2
DB0
DB1
DB2
DB3
DB4
DB5
P1-5(IN)LBIO5
P1-9(IN)AB3
P1-31(IN)AB4
P1-29(IN)AB0
P1-8(IN)AB1
P1-30(IN)AB 2
P1-6(IN)PWON
P1-15(IN)DB0
P1-37(IN)DB1
P1-16(IN)DB2
P1-38(IN)DB3
P1-17(IN)DB4
P1-39(IN)DB5

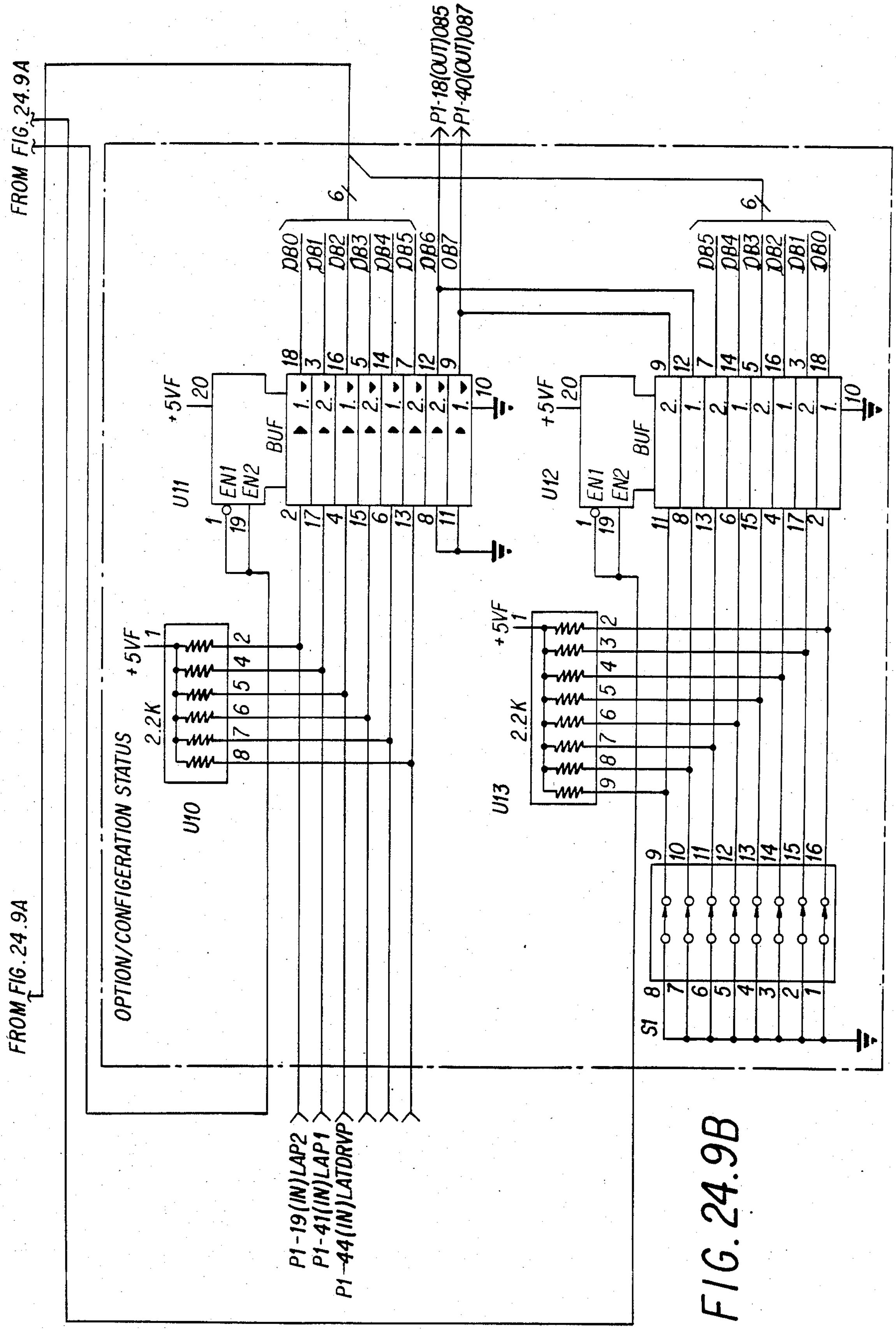
FIG. 24.9B

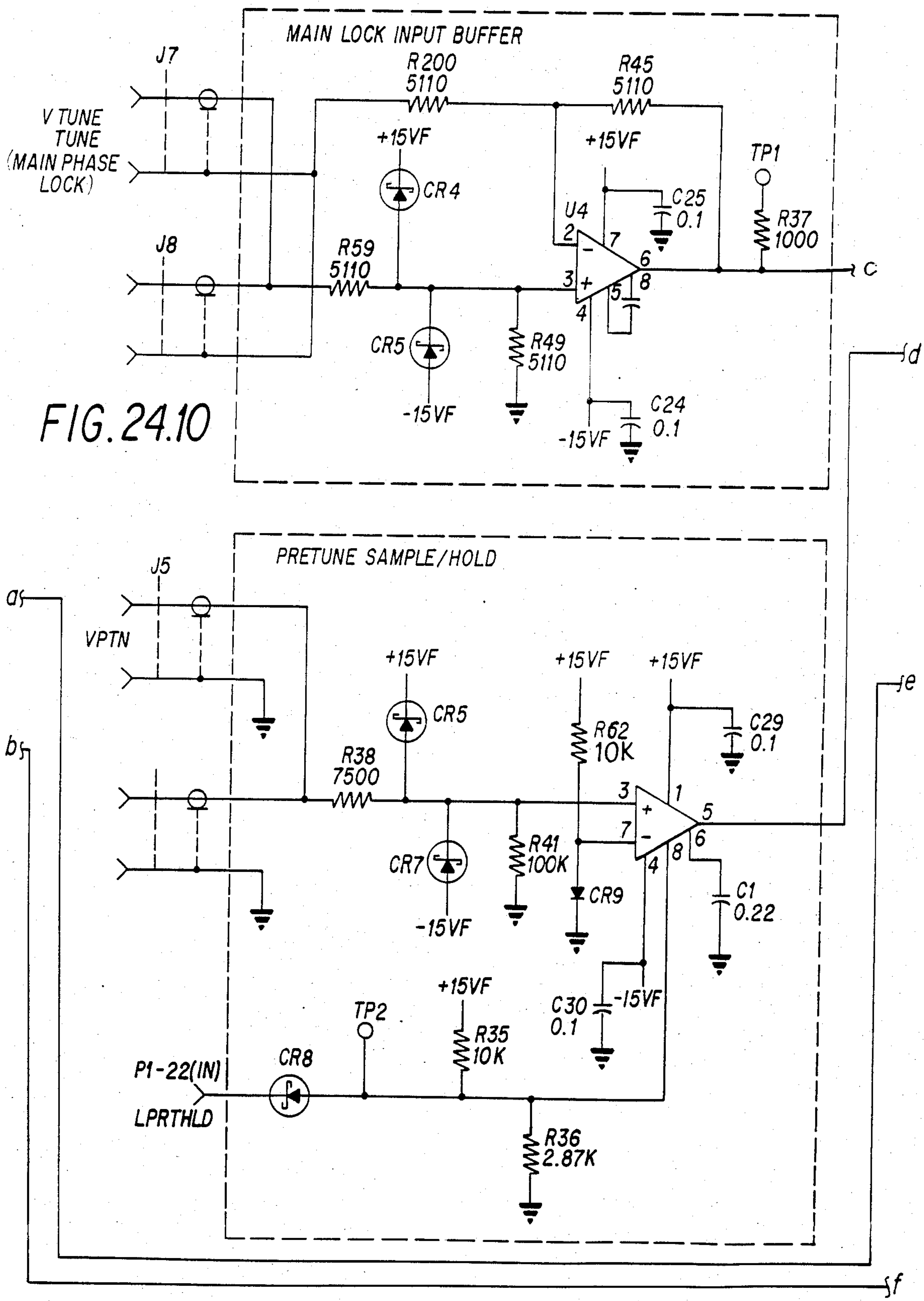
FIG. 24.10

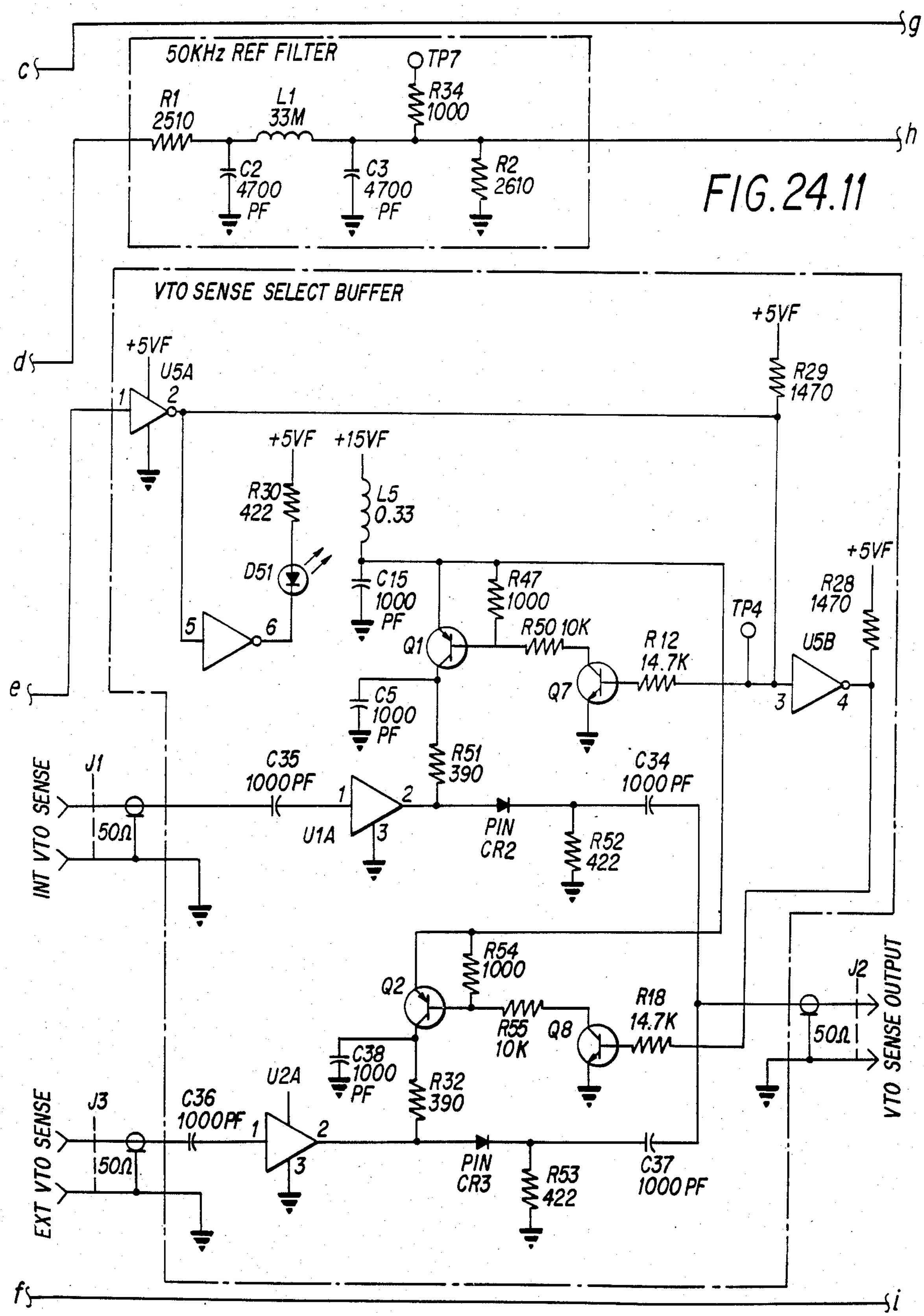
FIG. 24.11

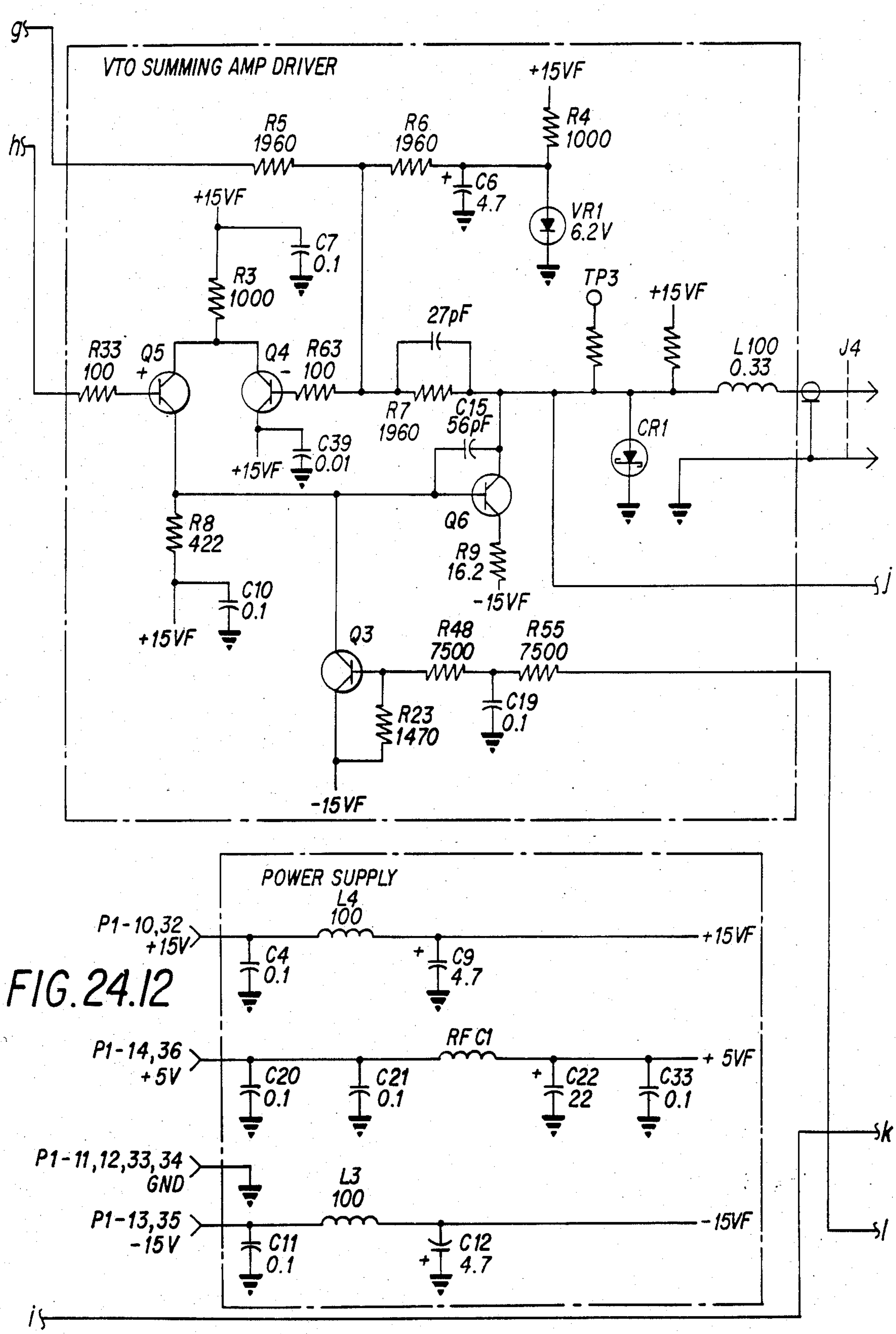
FIG. 24.12

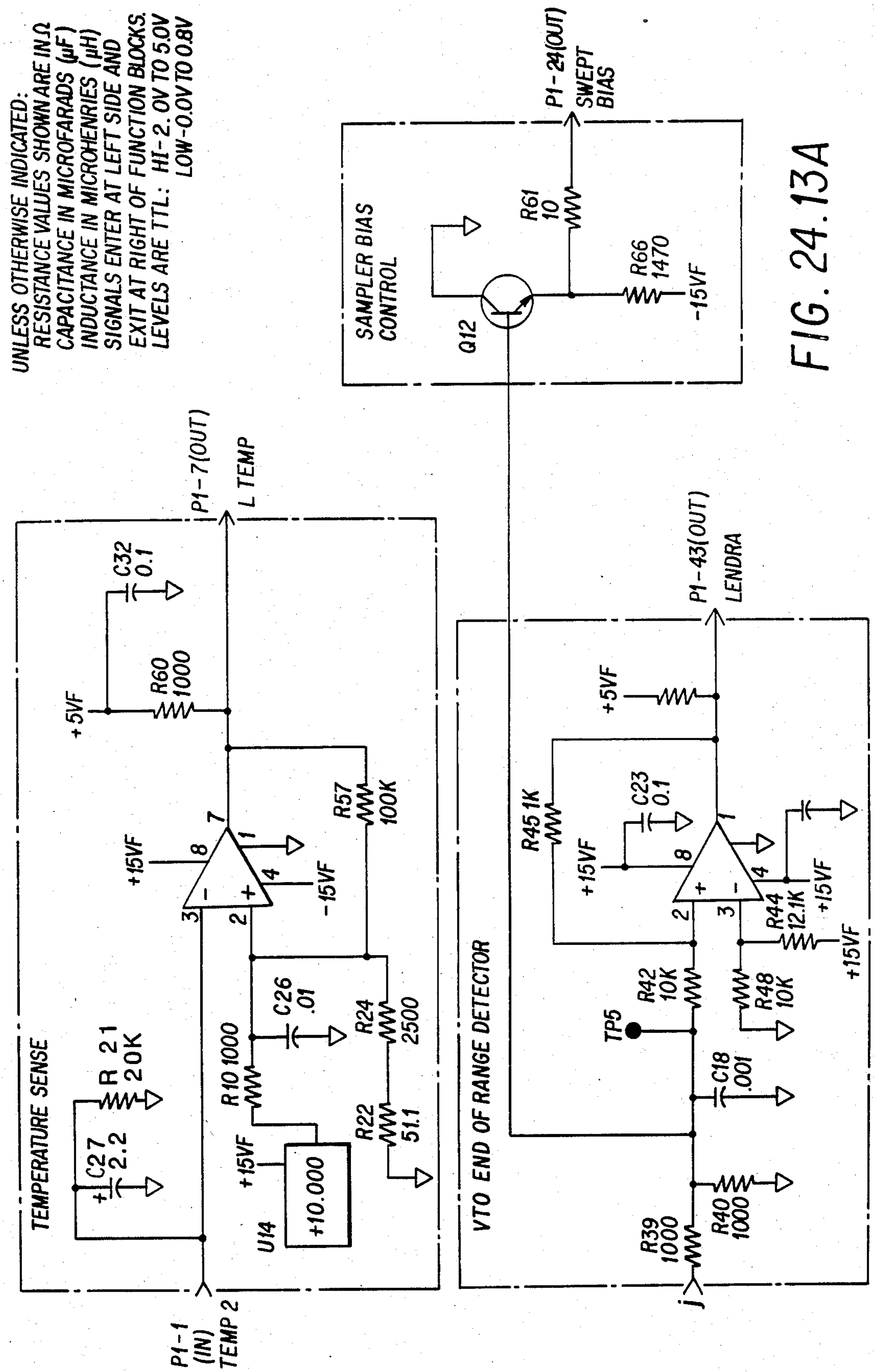
FIG. 24.13A

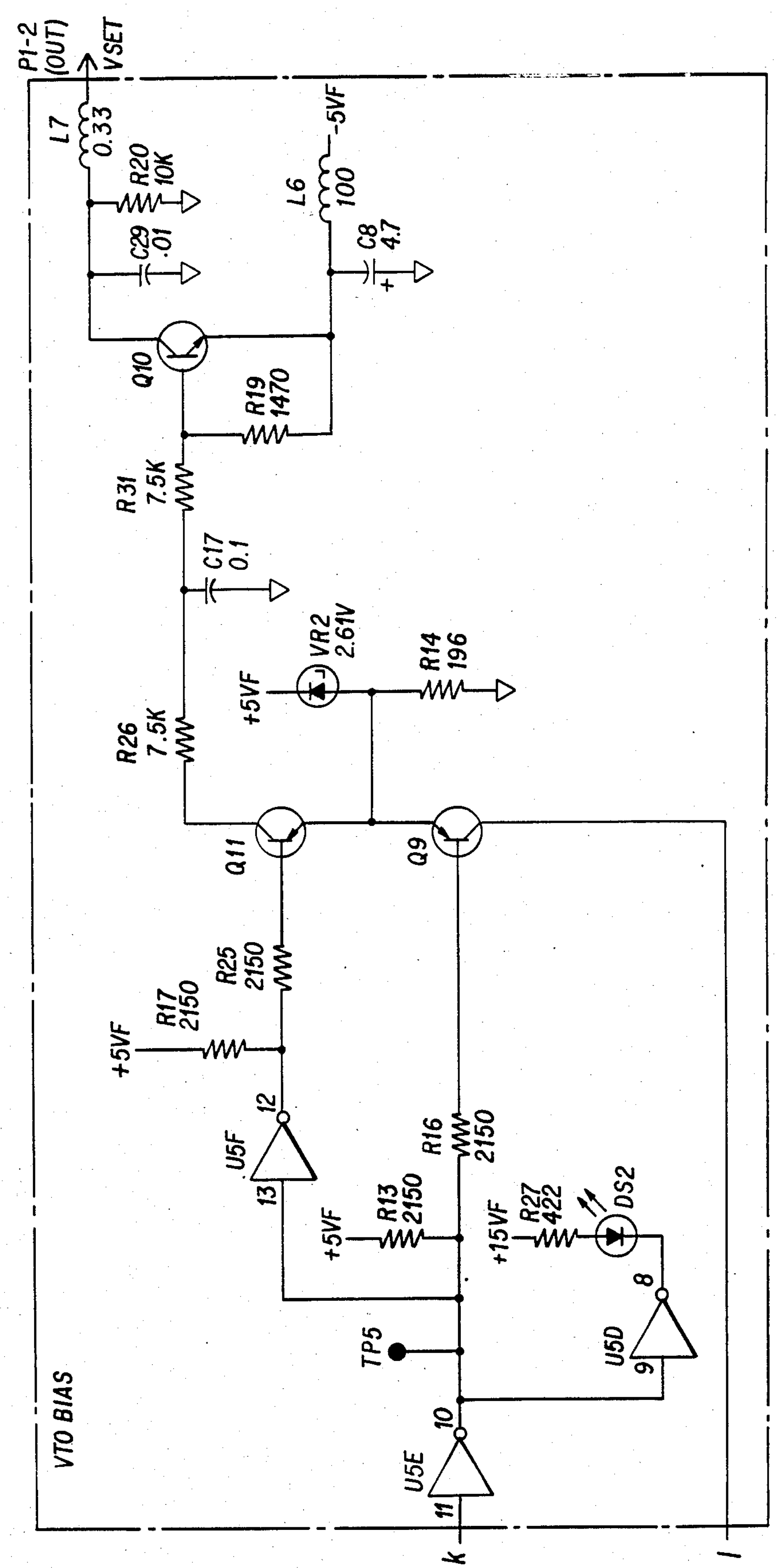
FIG. 24.13B

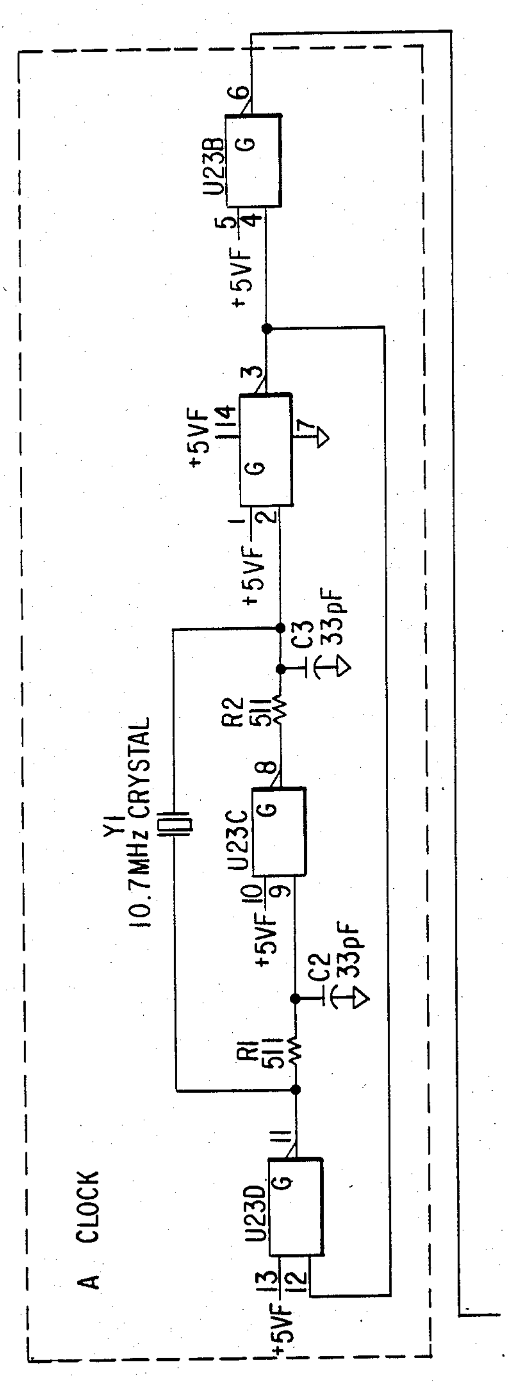
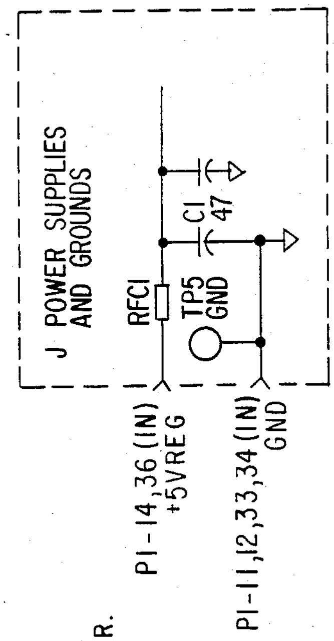
PIN'S 13, 14, 22 THRU 31 (A4P2): PIN'S
4 THRU 11, 13, 21, 22 (A20 J1): PIN'S 18
THRU 23 (A20J12) ARE ALL SHORTED TOGETHER.
PIN 24 IS GROUNDED.
FIG. 24.15A FIG. 24.15B
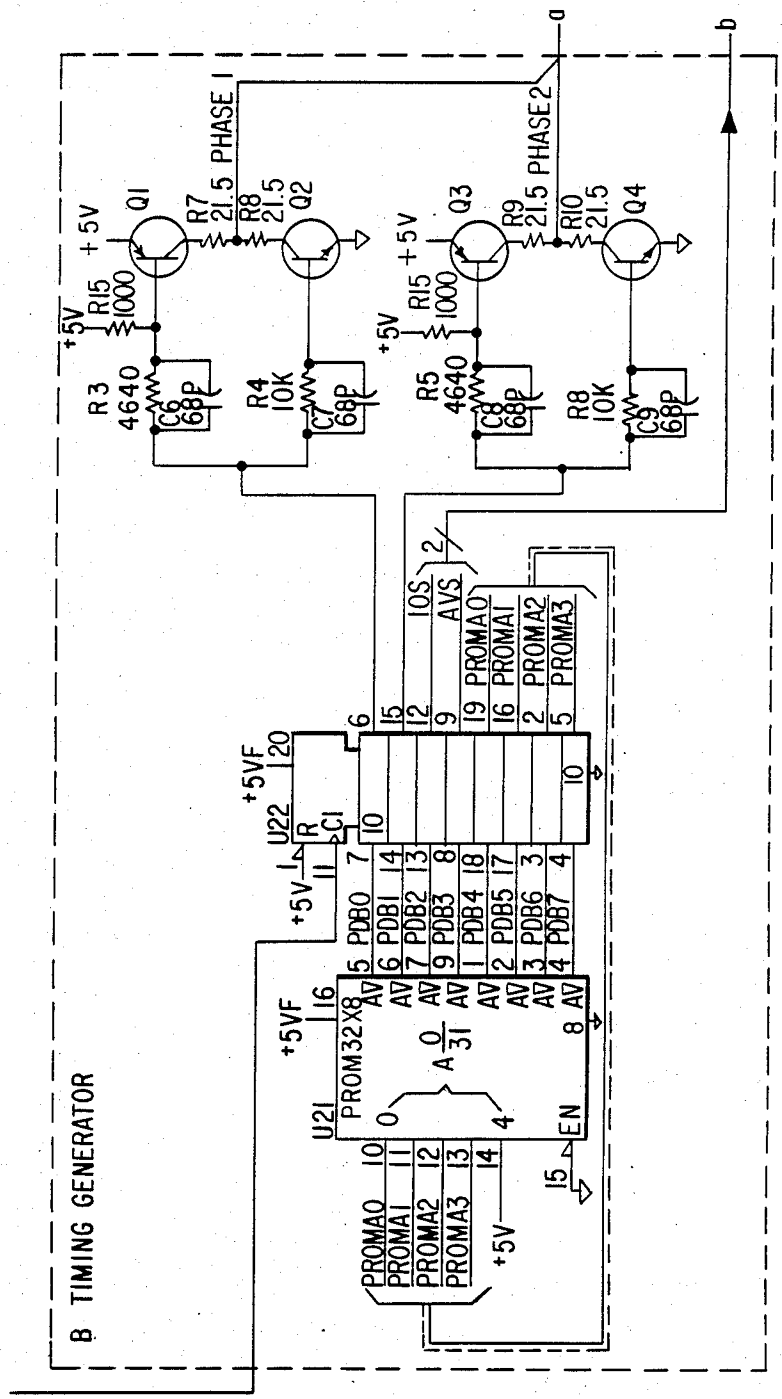

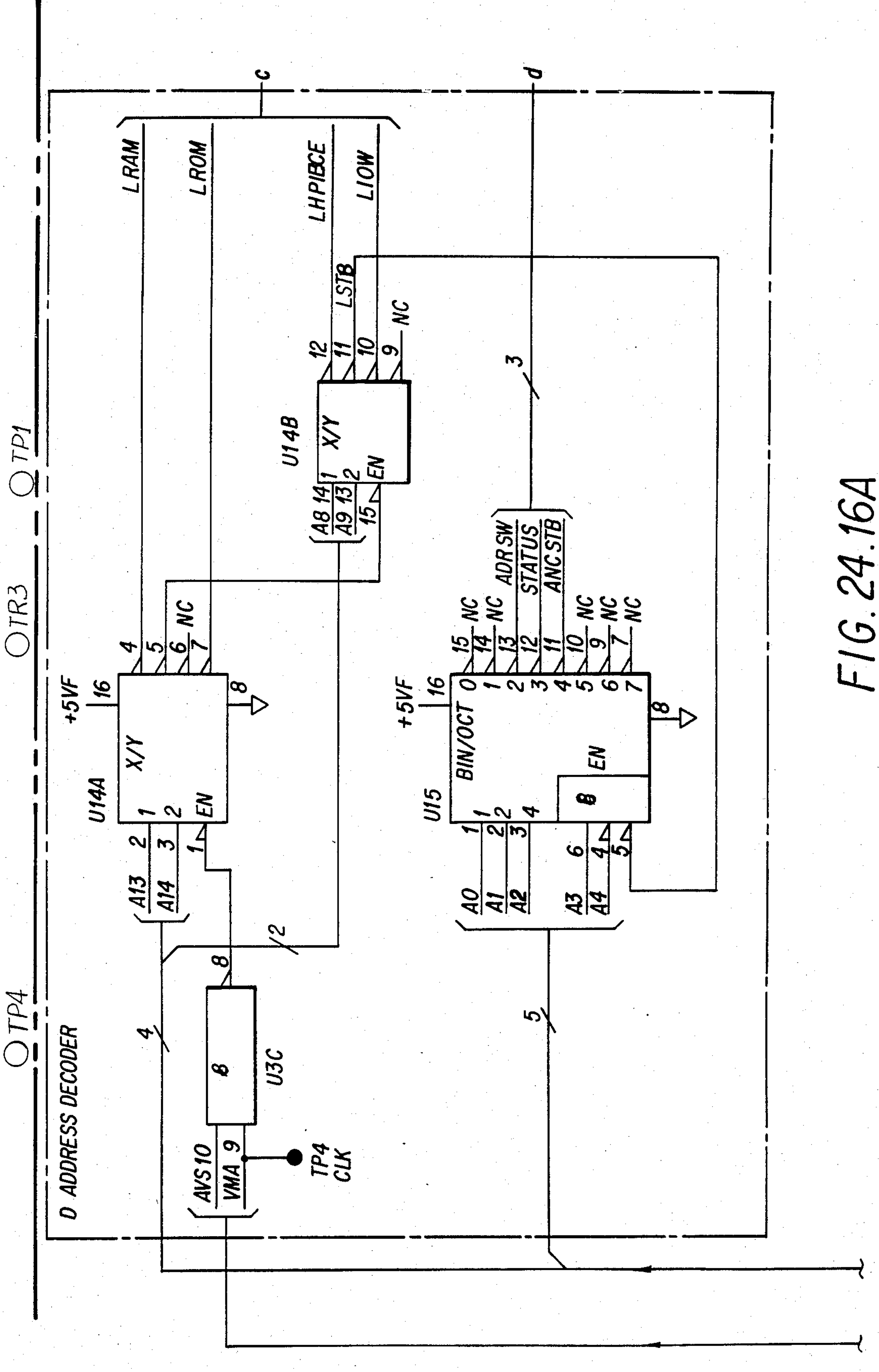
FIG. 24.16A

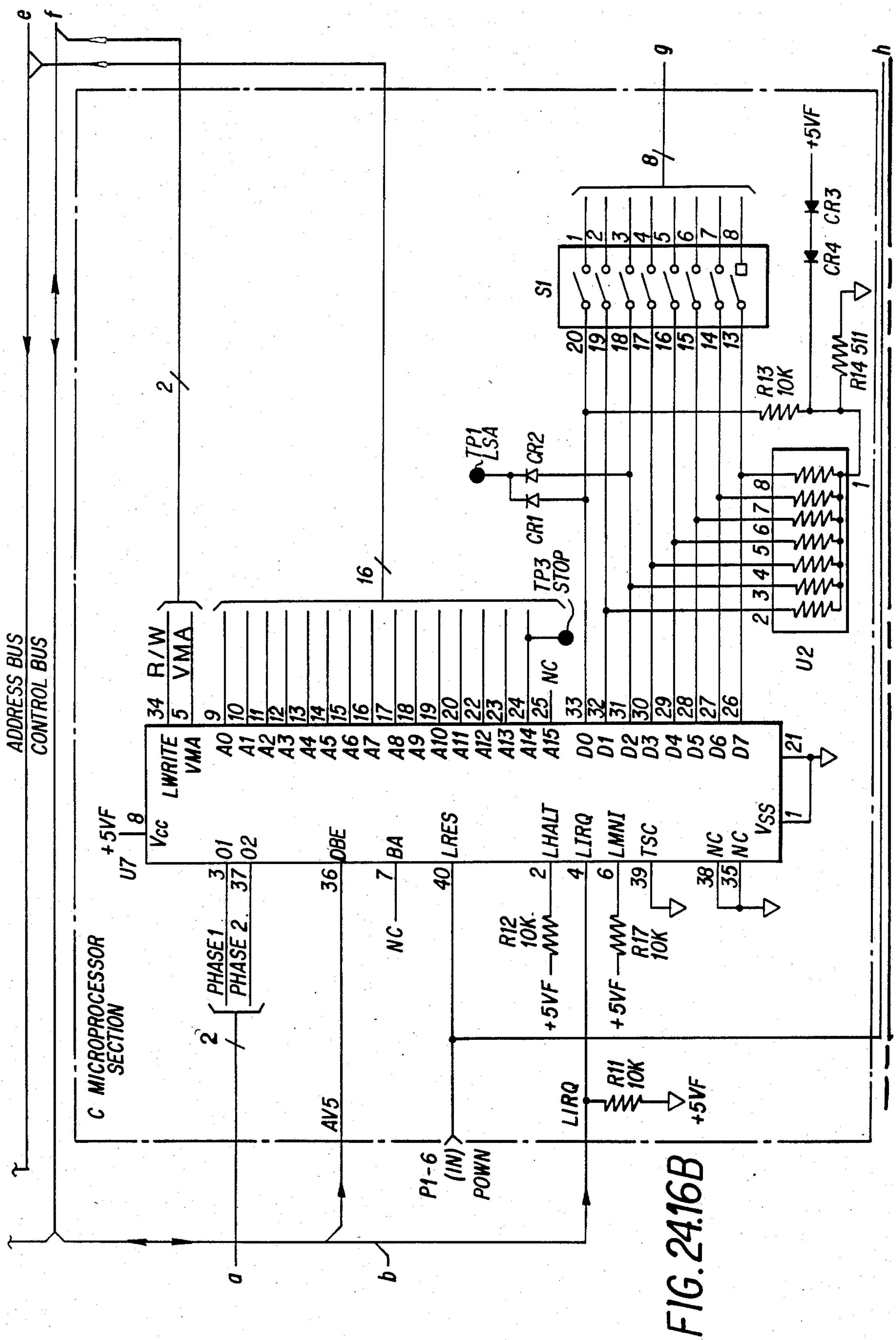
FIG. 24.16B

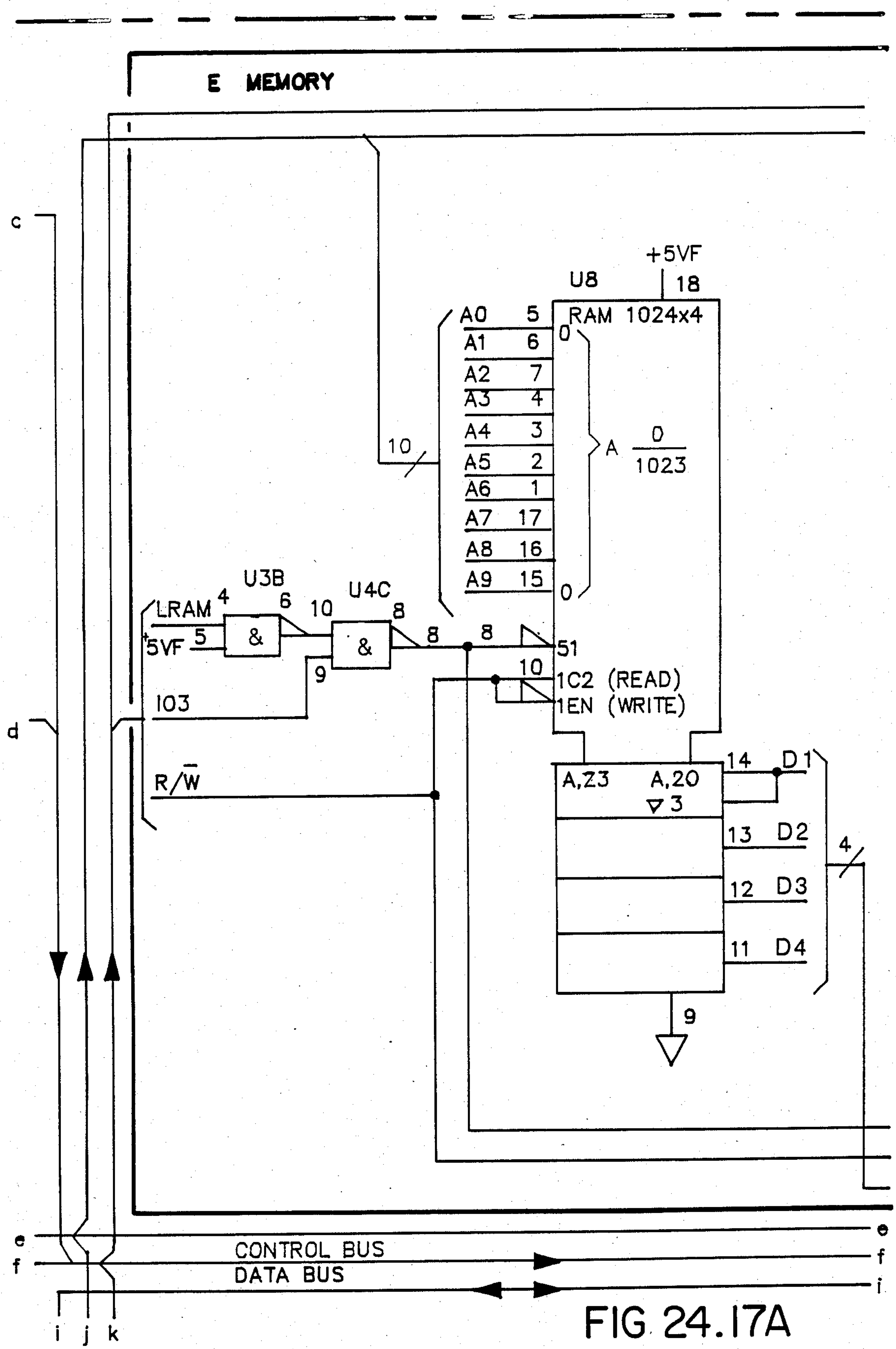
FIG 24.17A

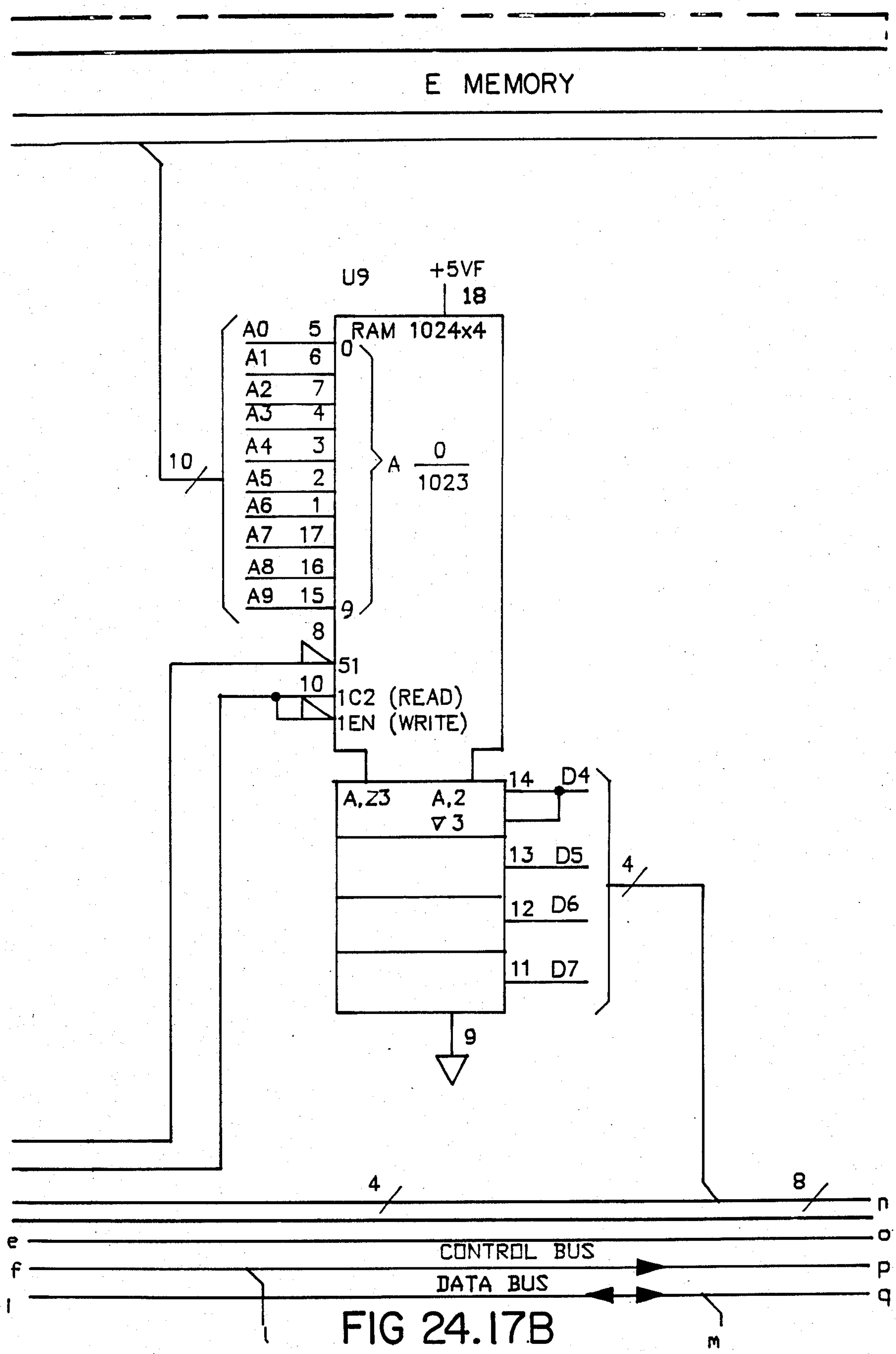
FIG 24.17B

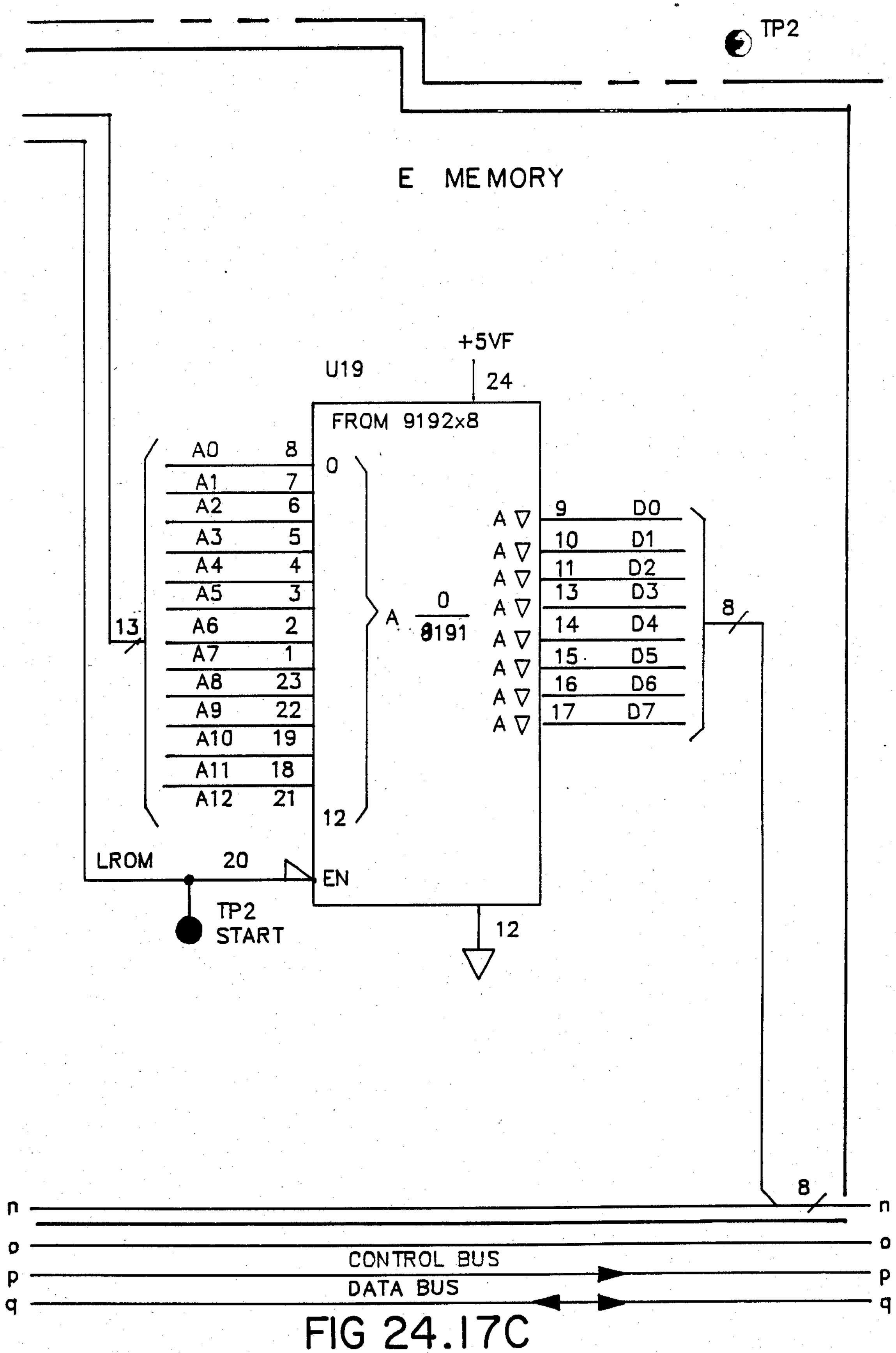
FIG 24.17C

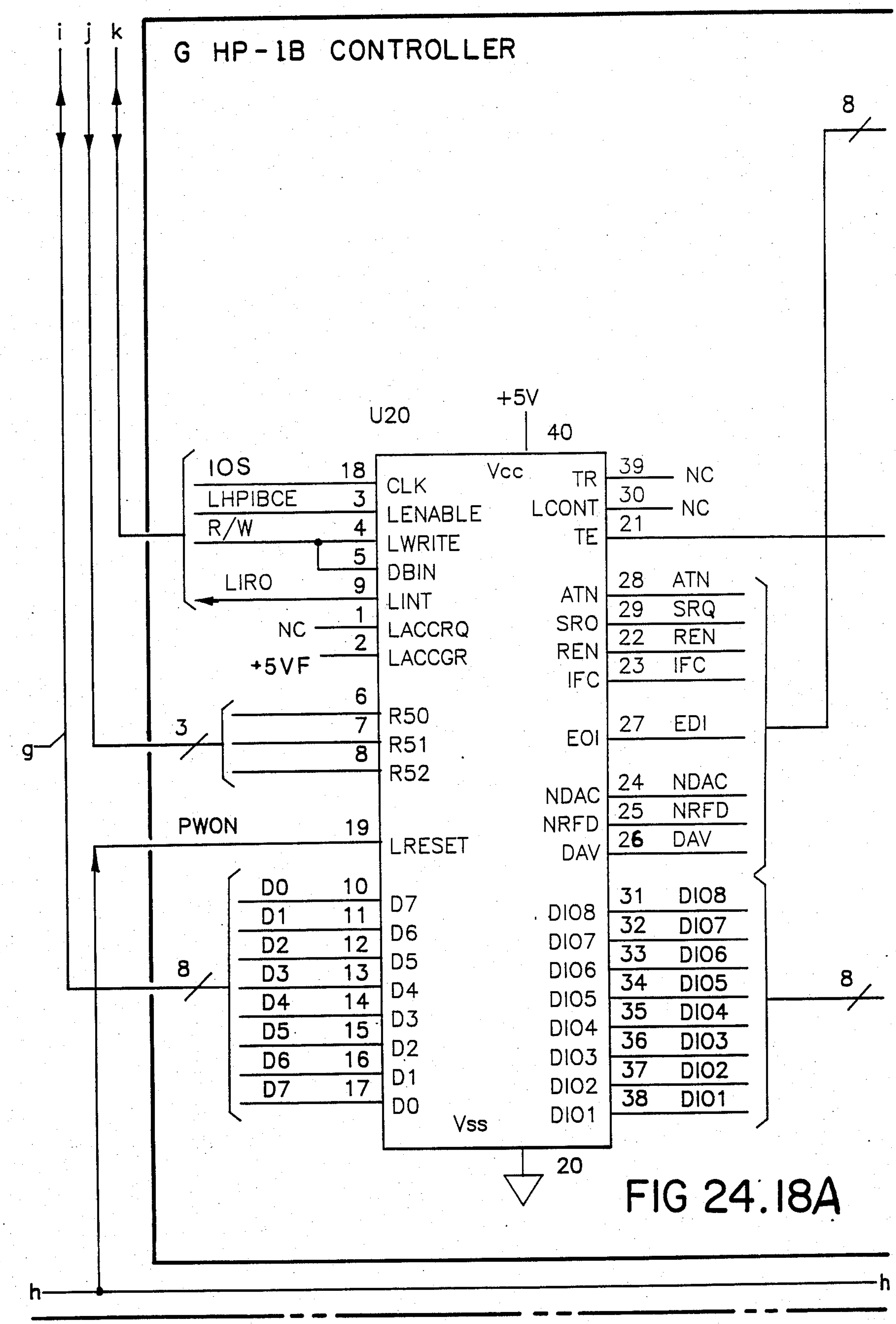
FIG 24.18A

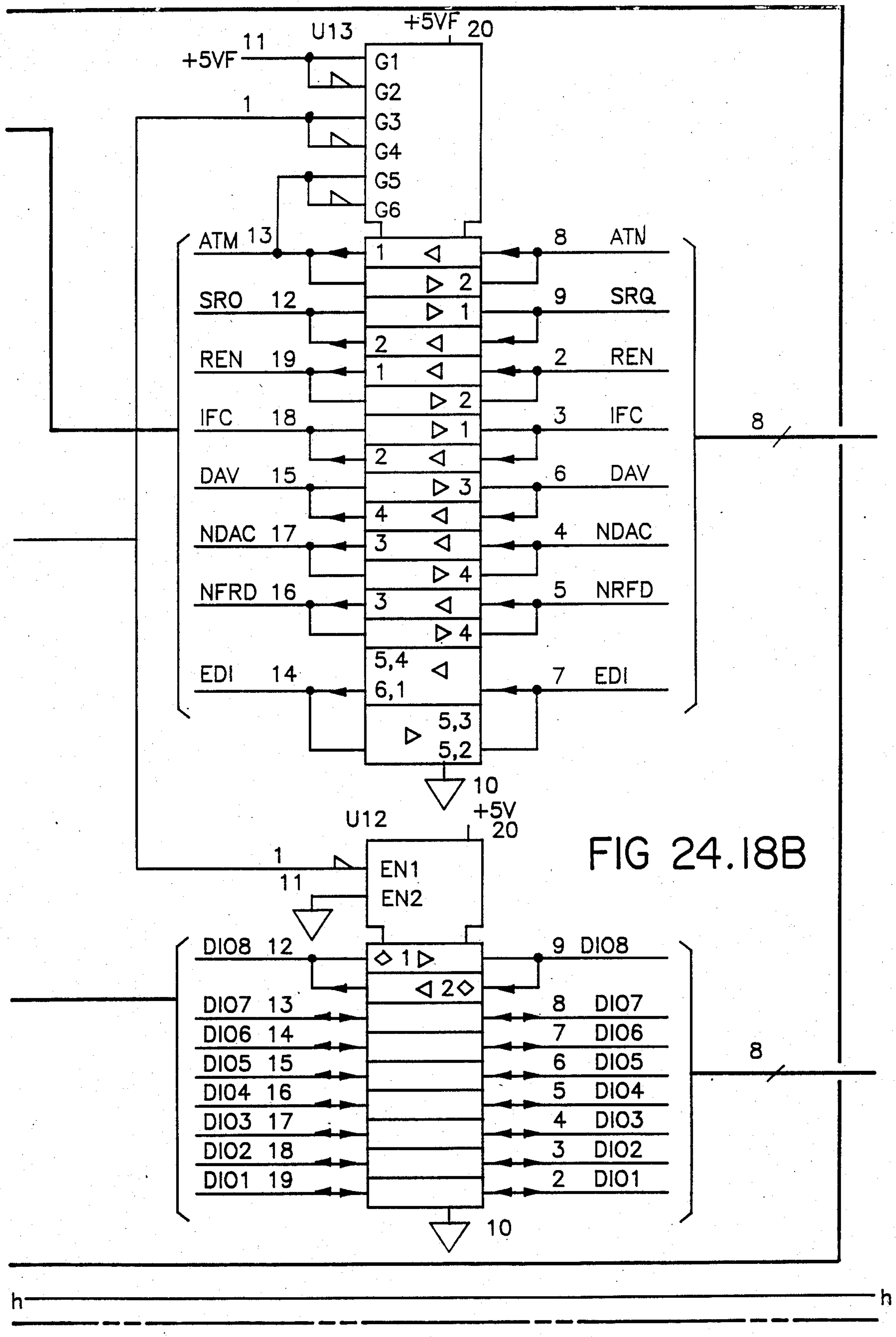
FIG 24.18B

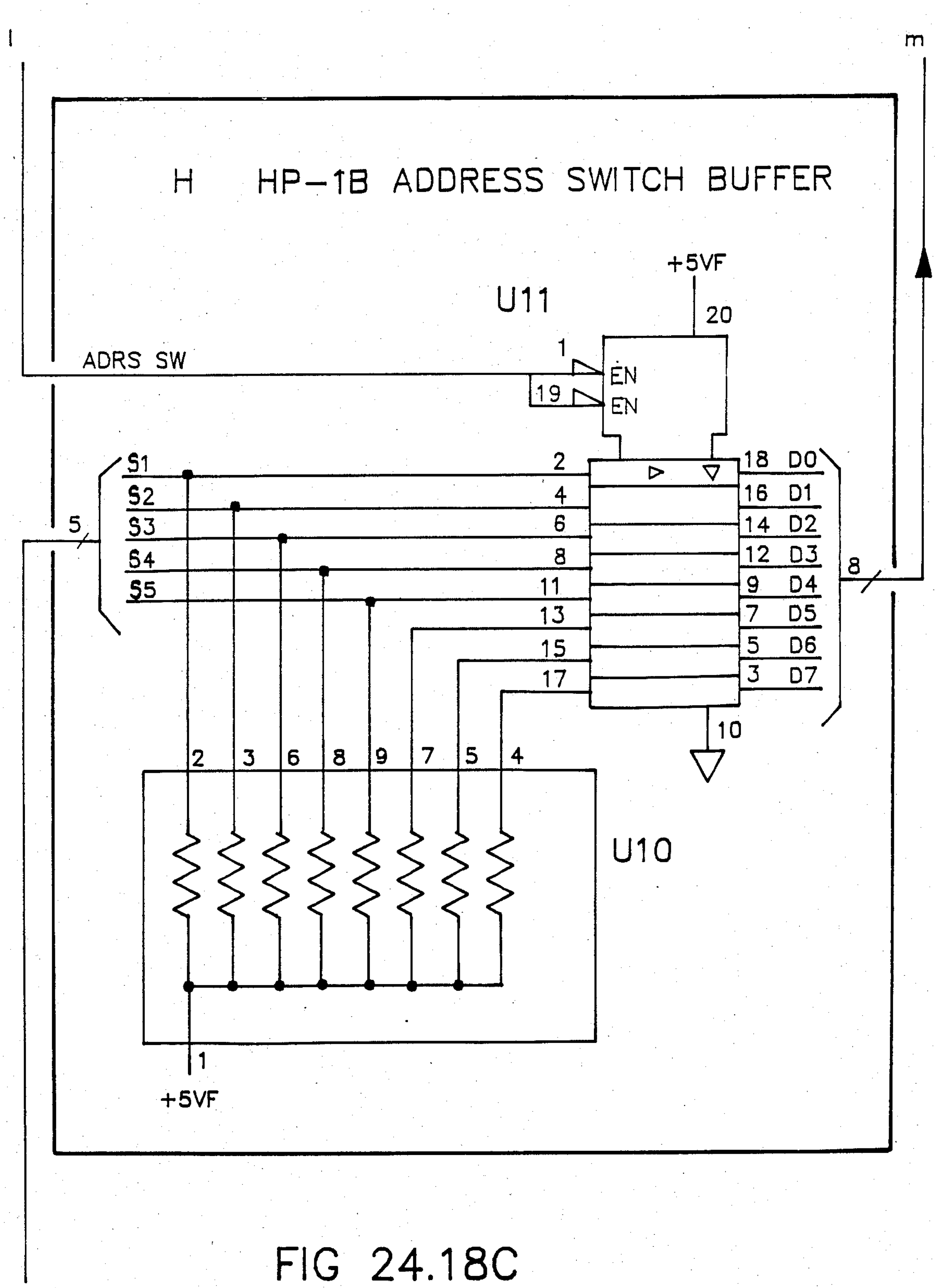
FIG 24.18C

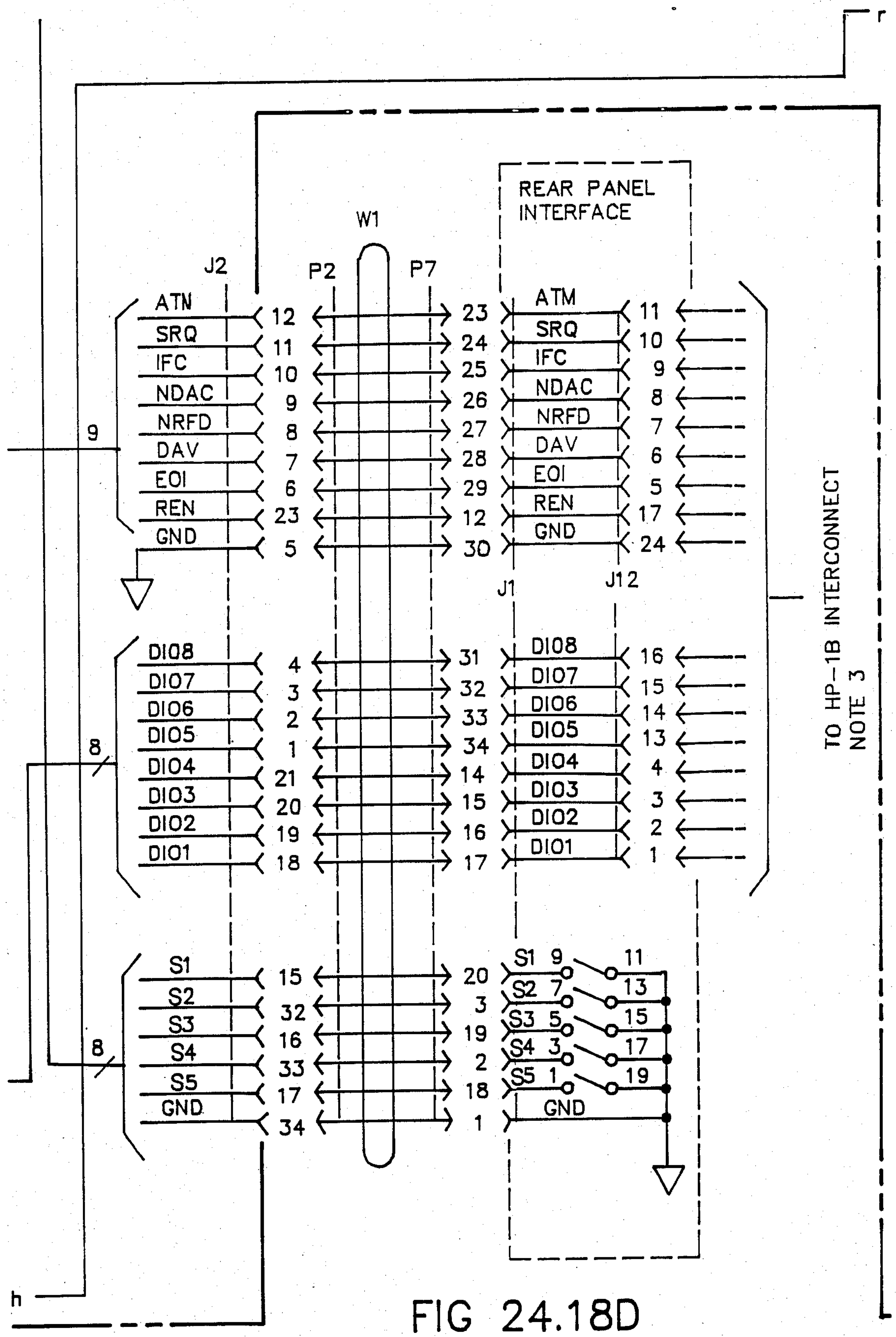
FIG 24.18D

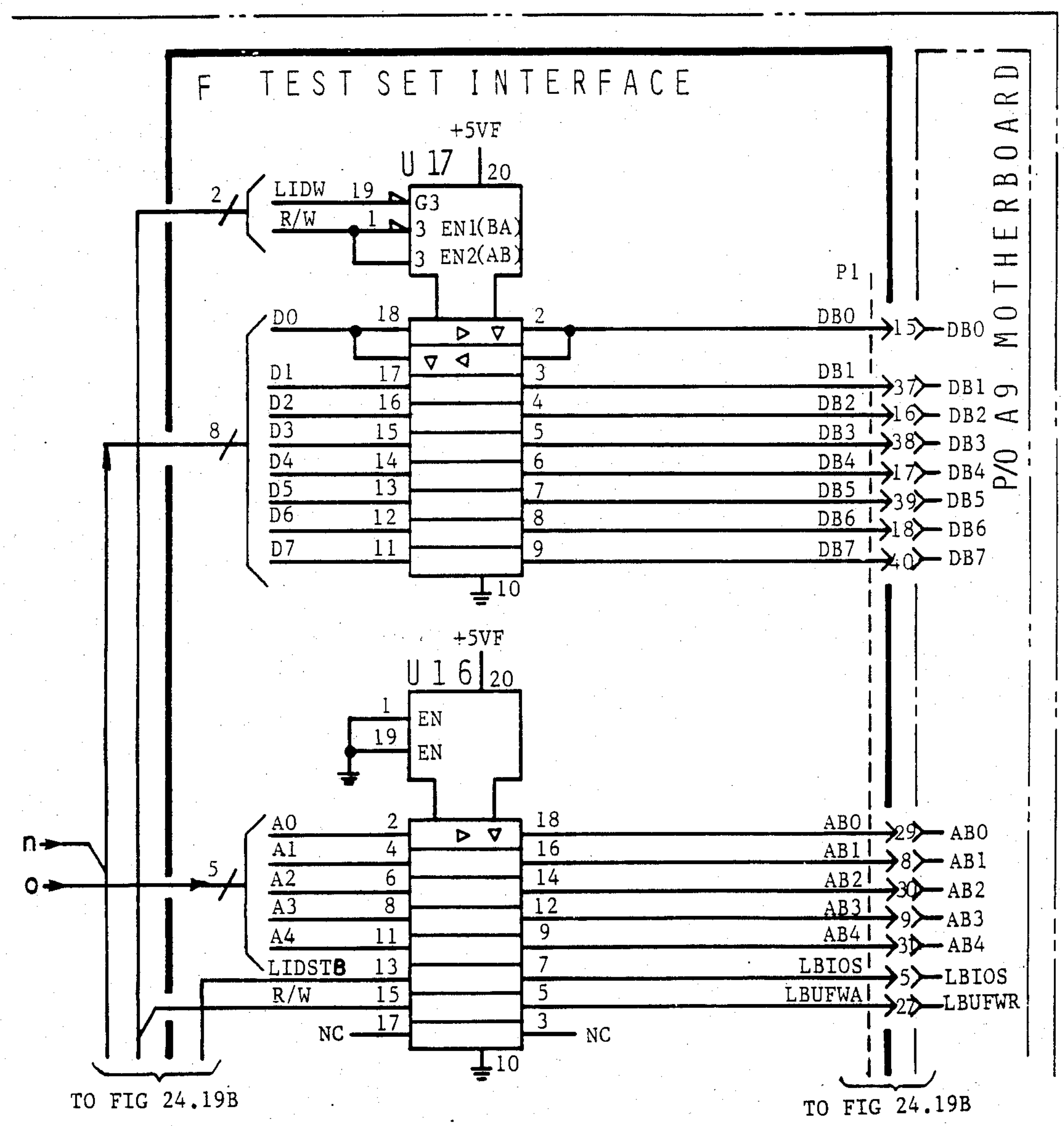
FIG 24.19A

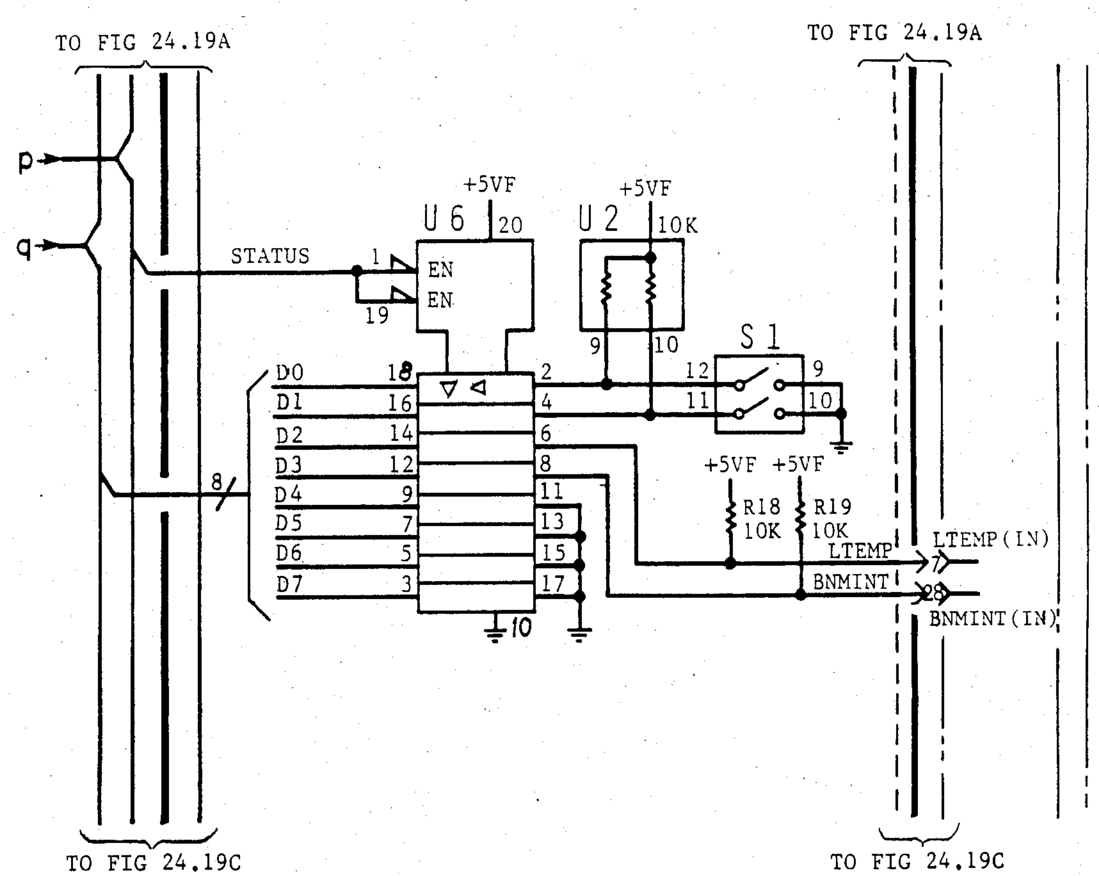
FIG 24.19 B

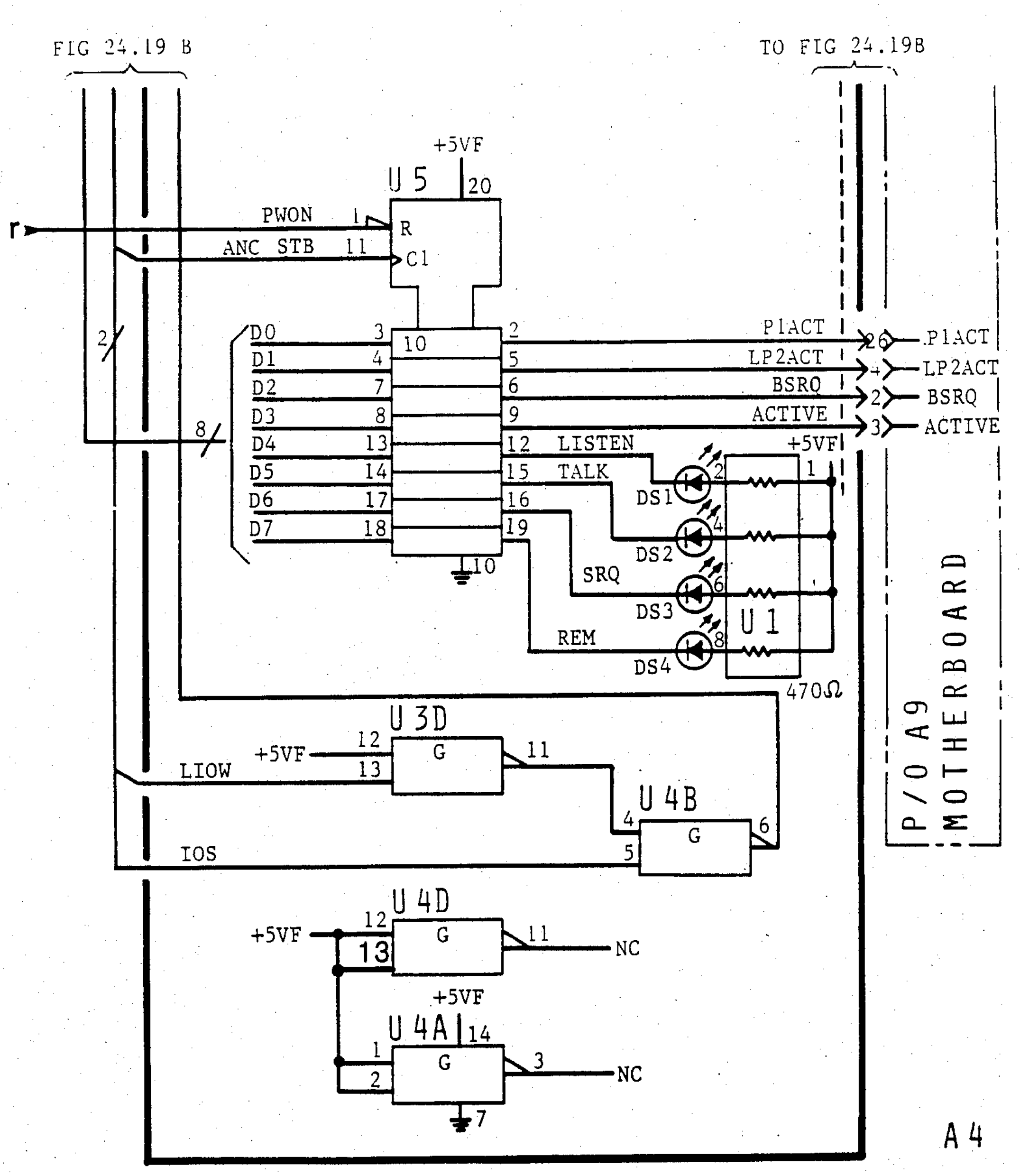
FIG 24.19C

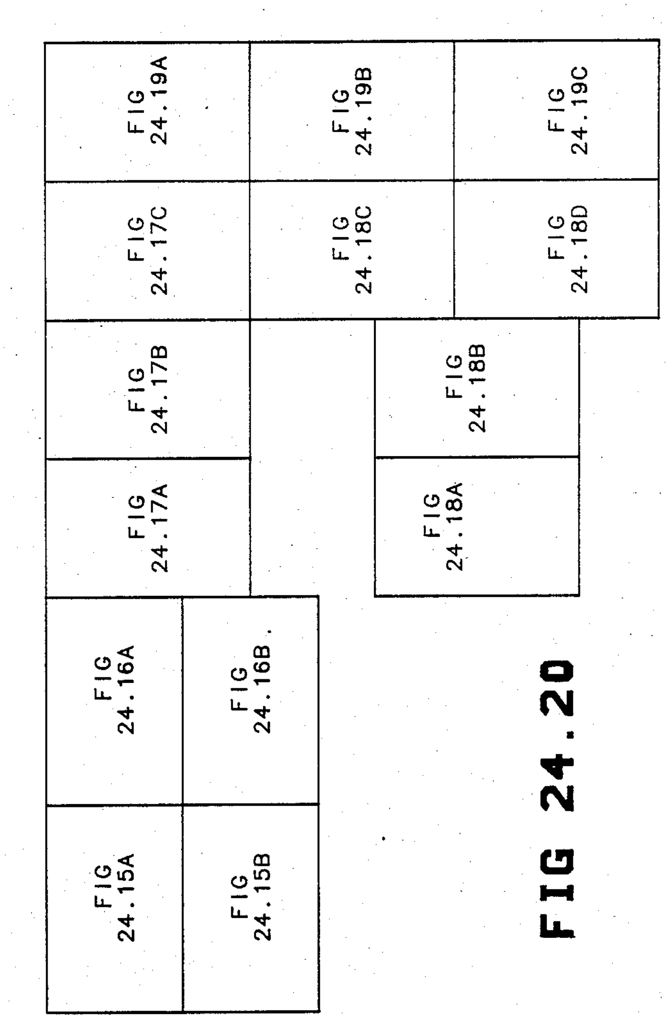
FIG 24.20
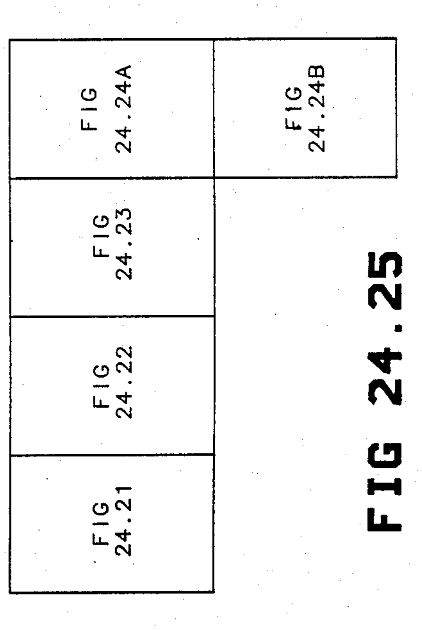
FIG 24.25

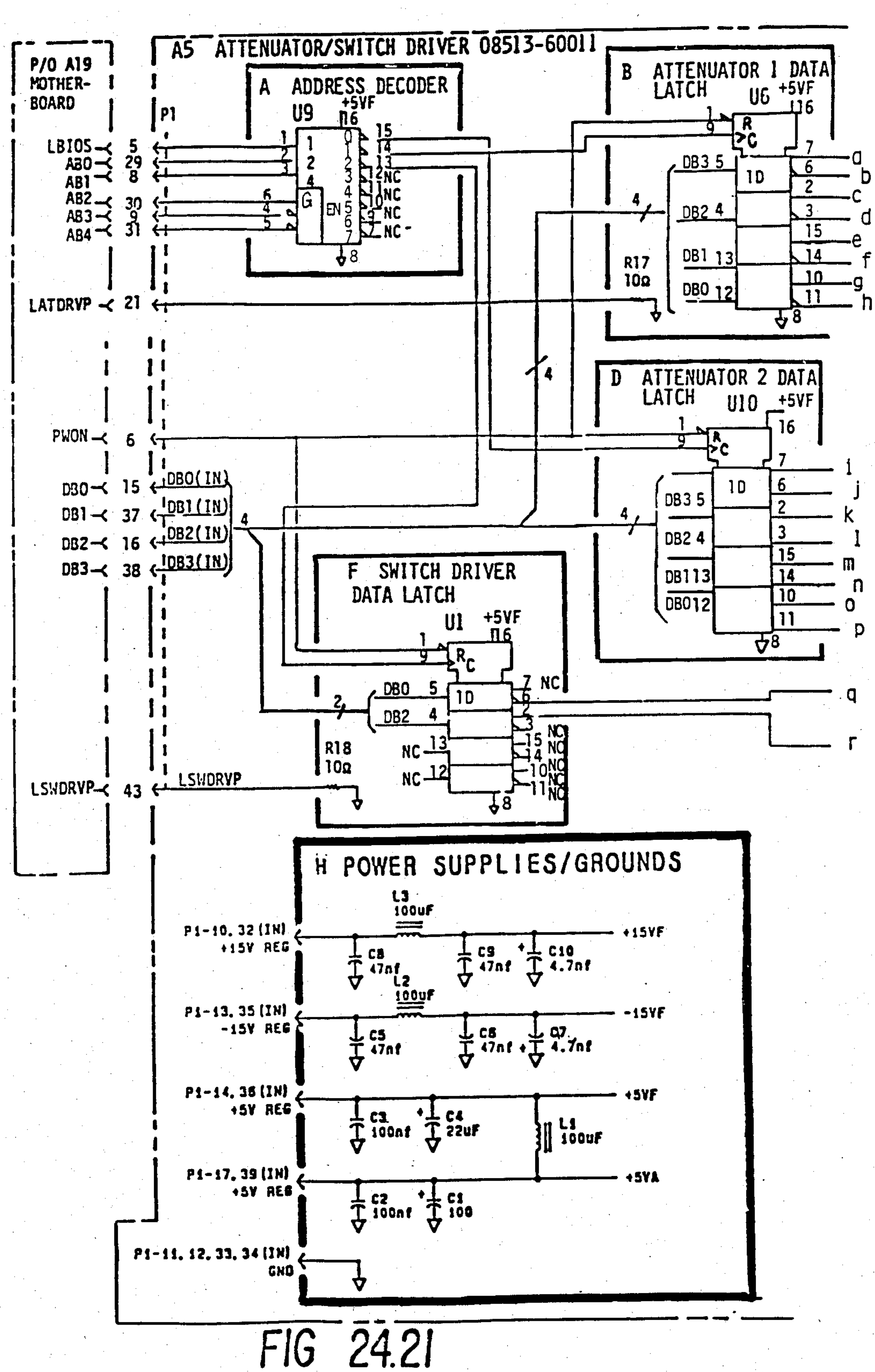
FIG 24.21

FIG 24.22
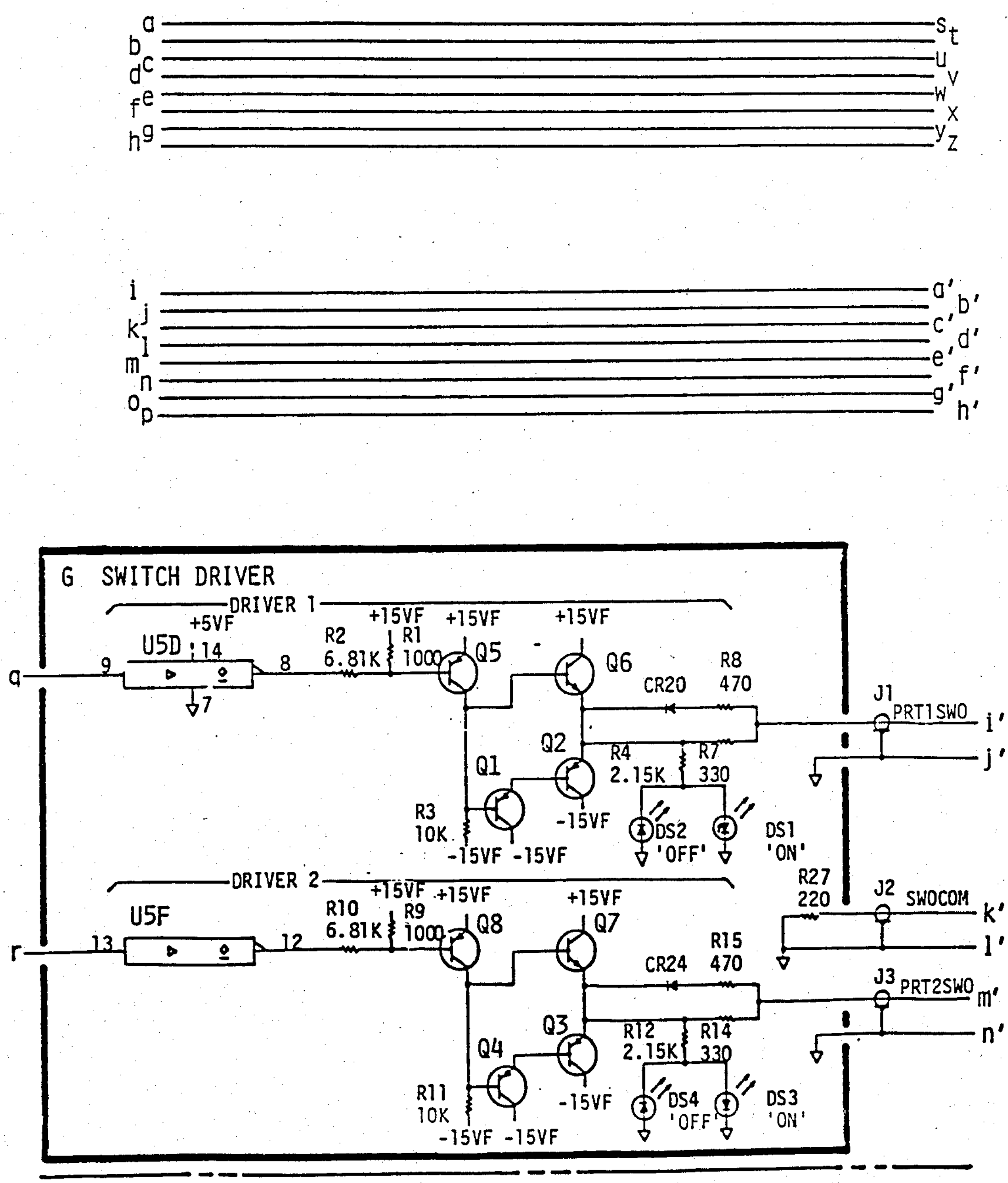

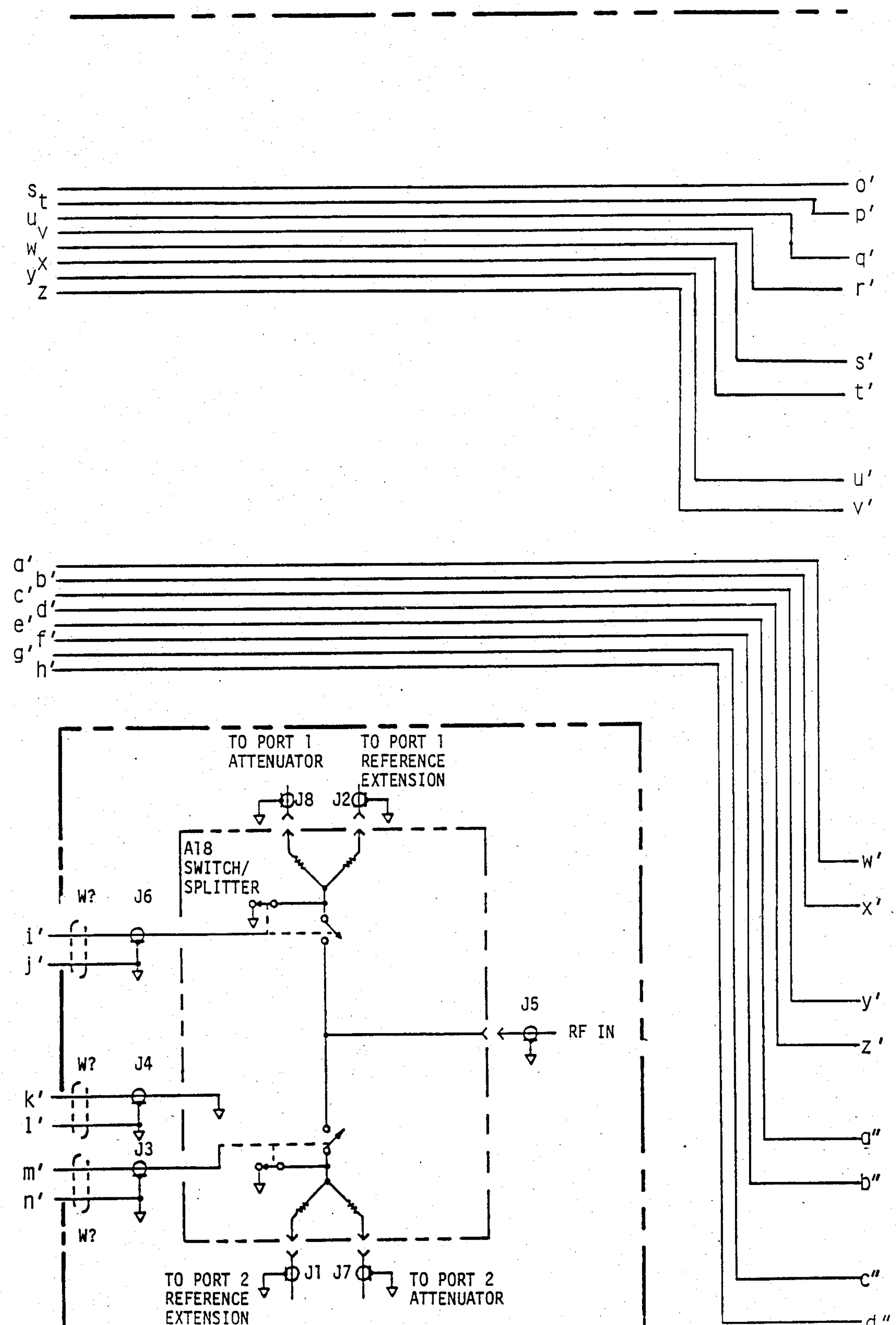
FIG 24.23

FIG. 24.24A
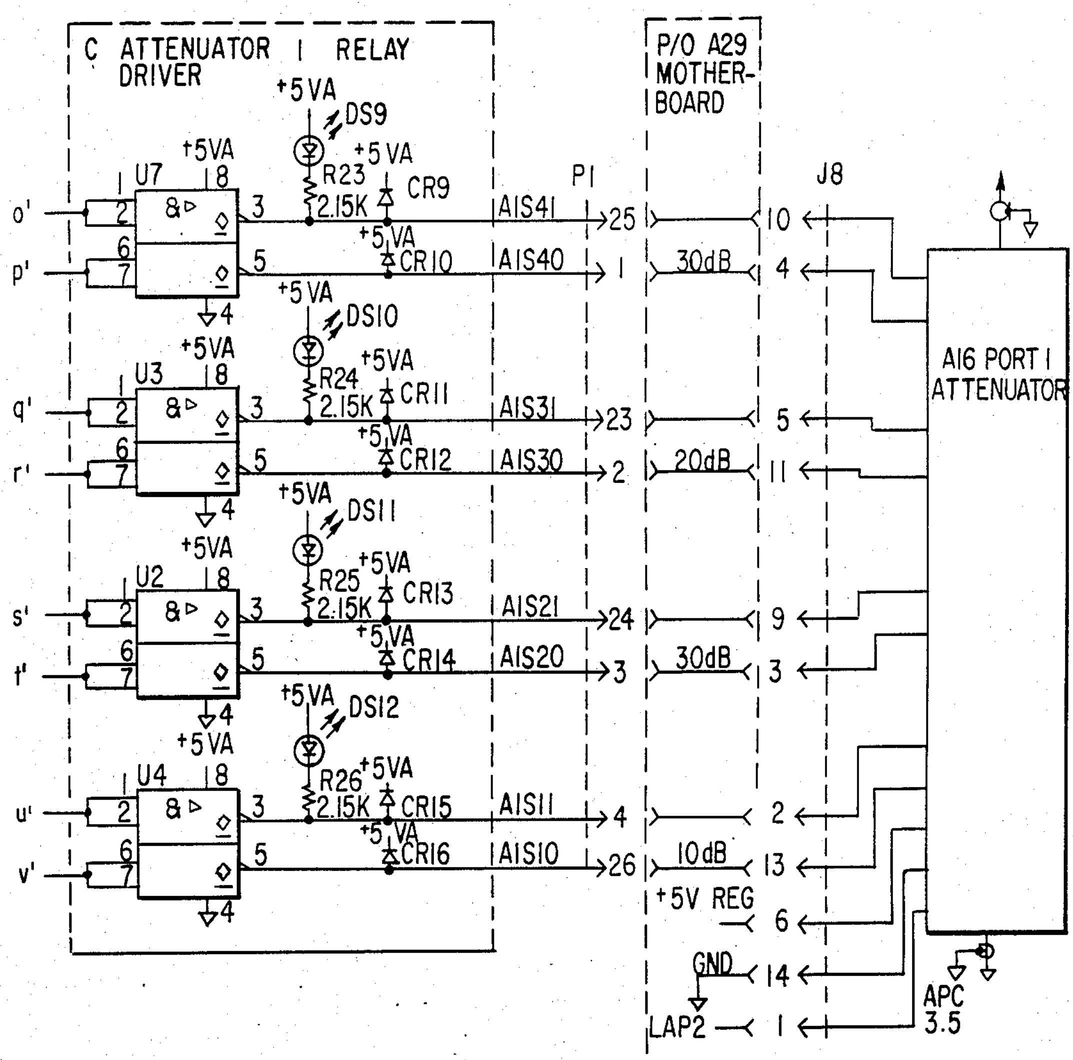

FIG. 24.24 B
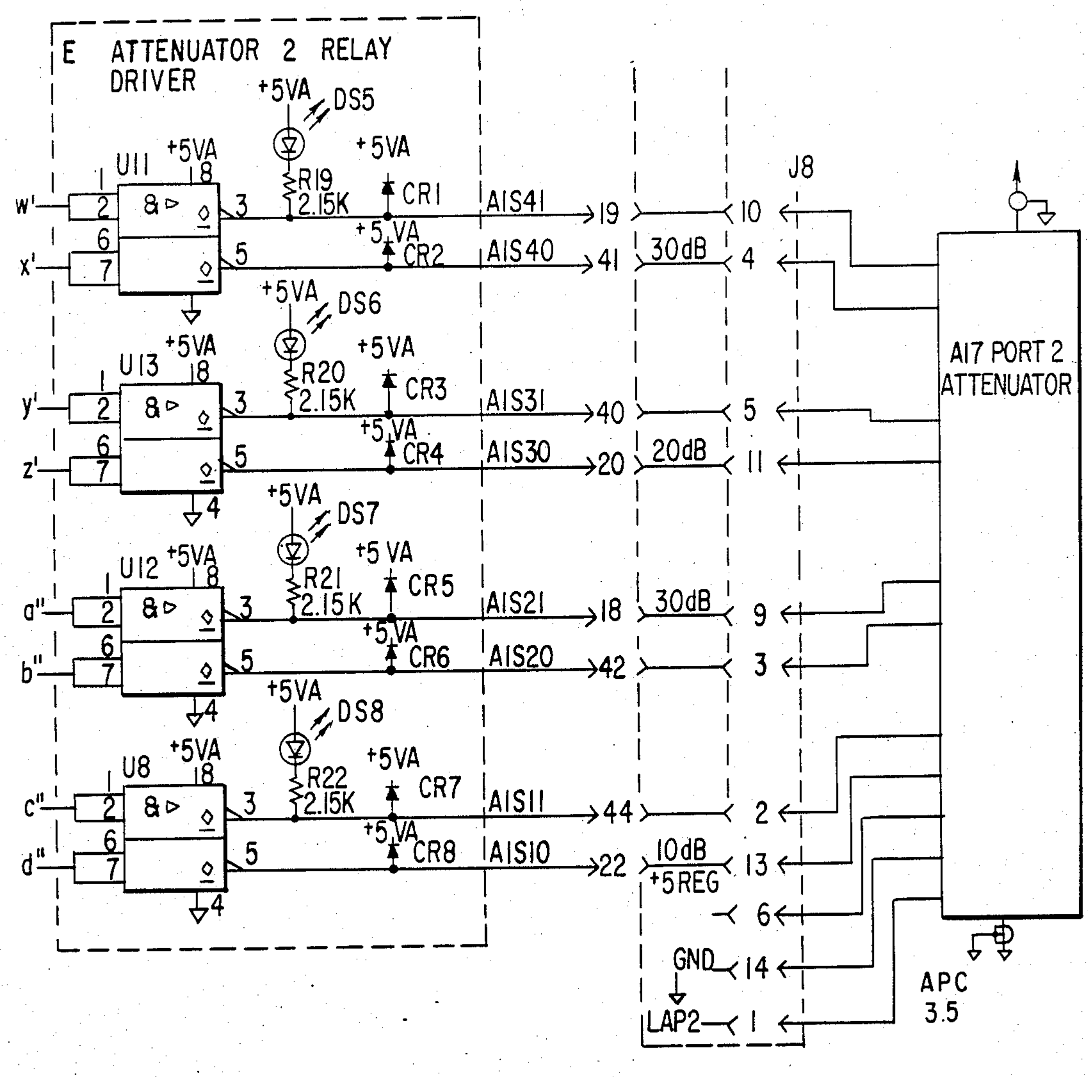

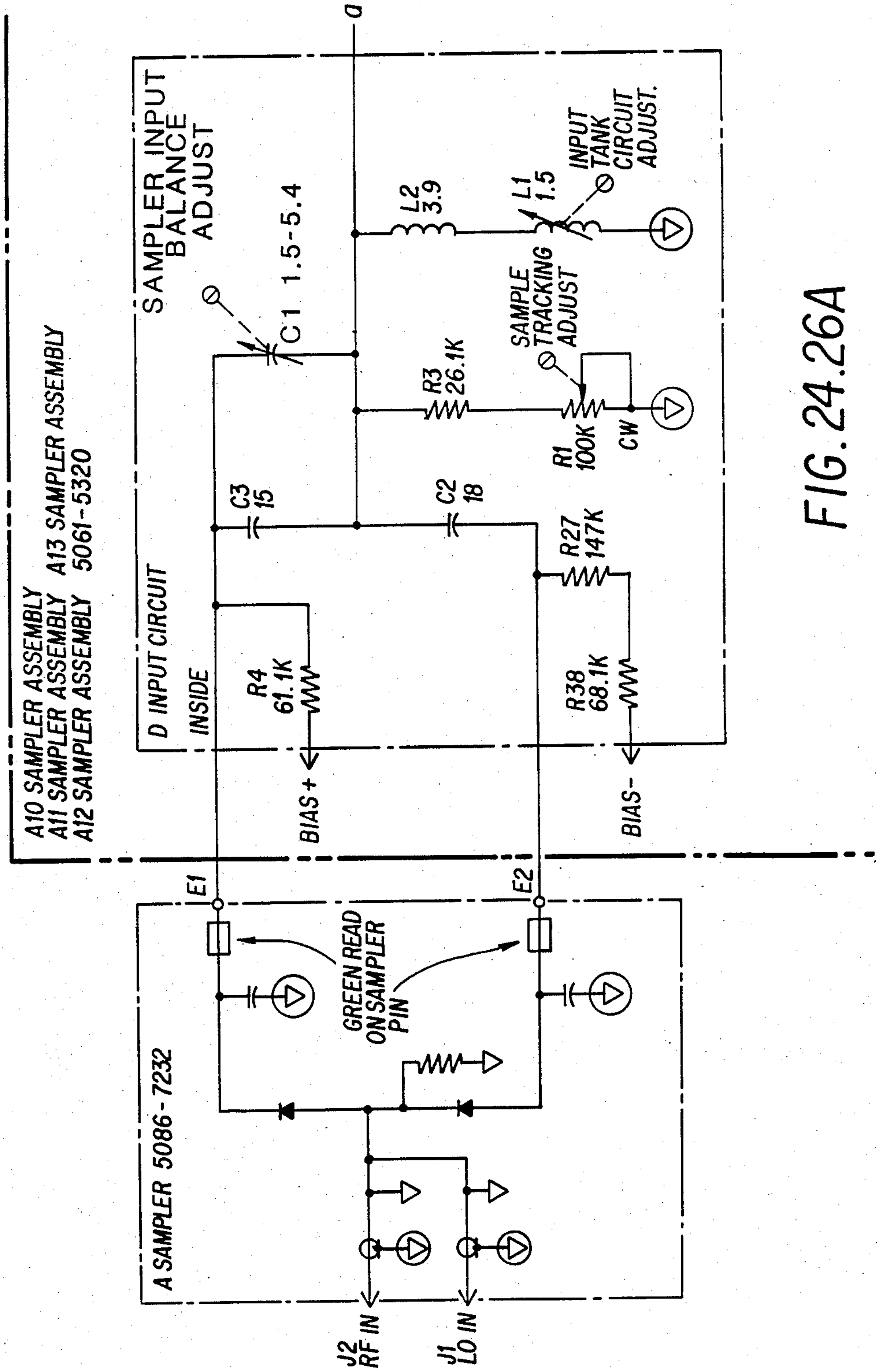
FIG. 24.26A

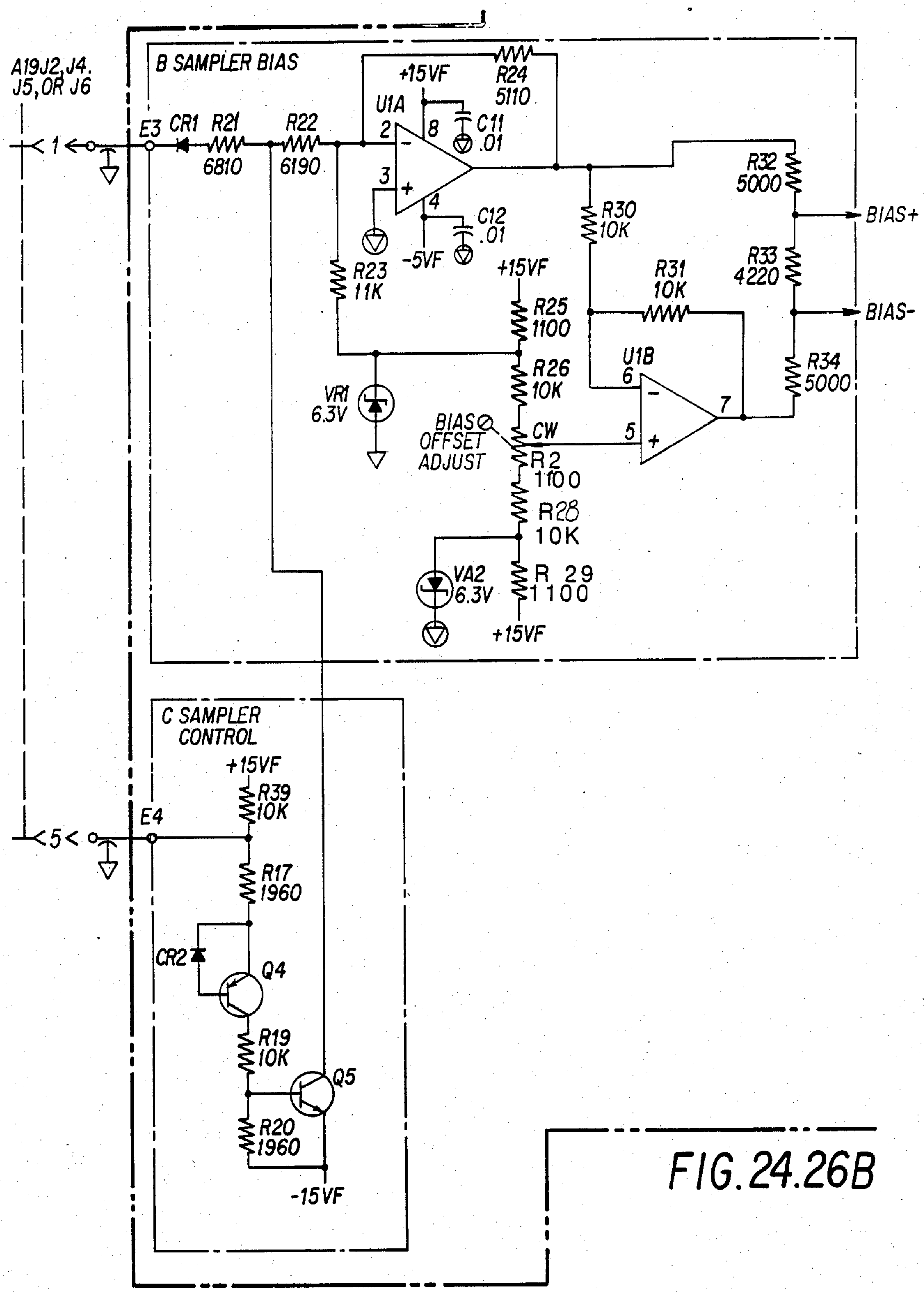
FIG. 24.26B

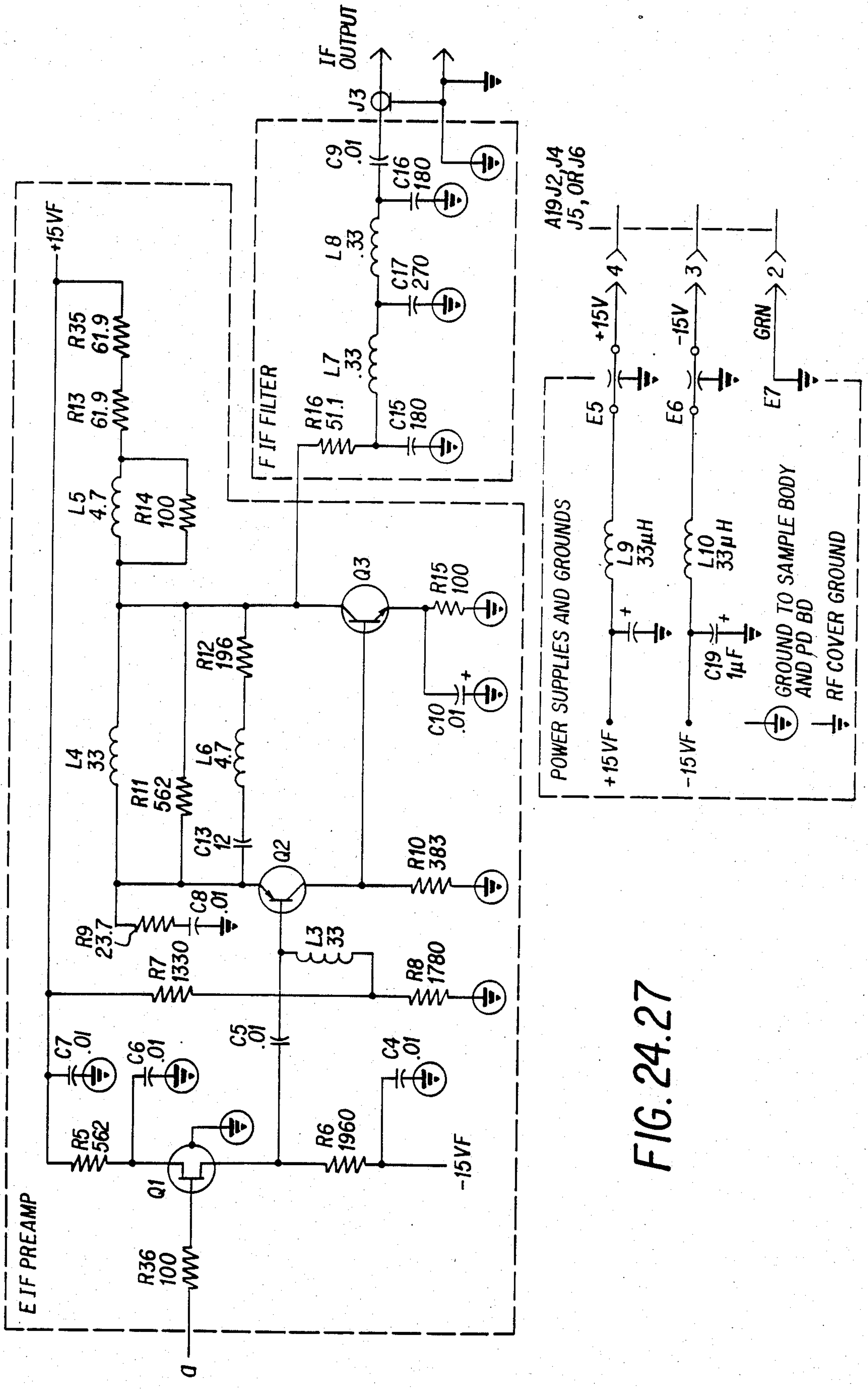
FIG. 24.27

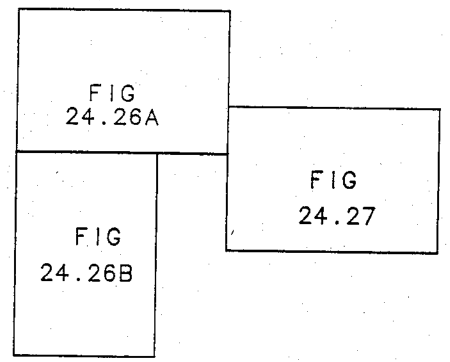
FIG 24.28
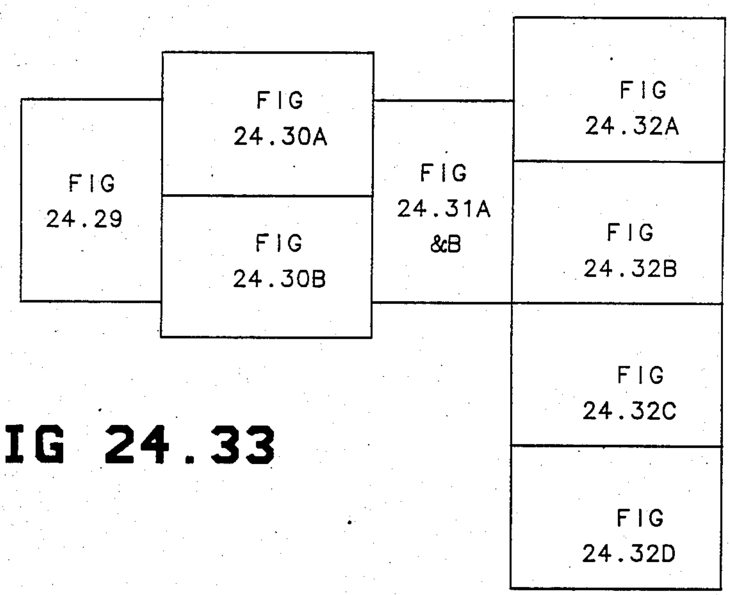
FIG 24.33

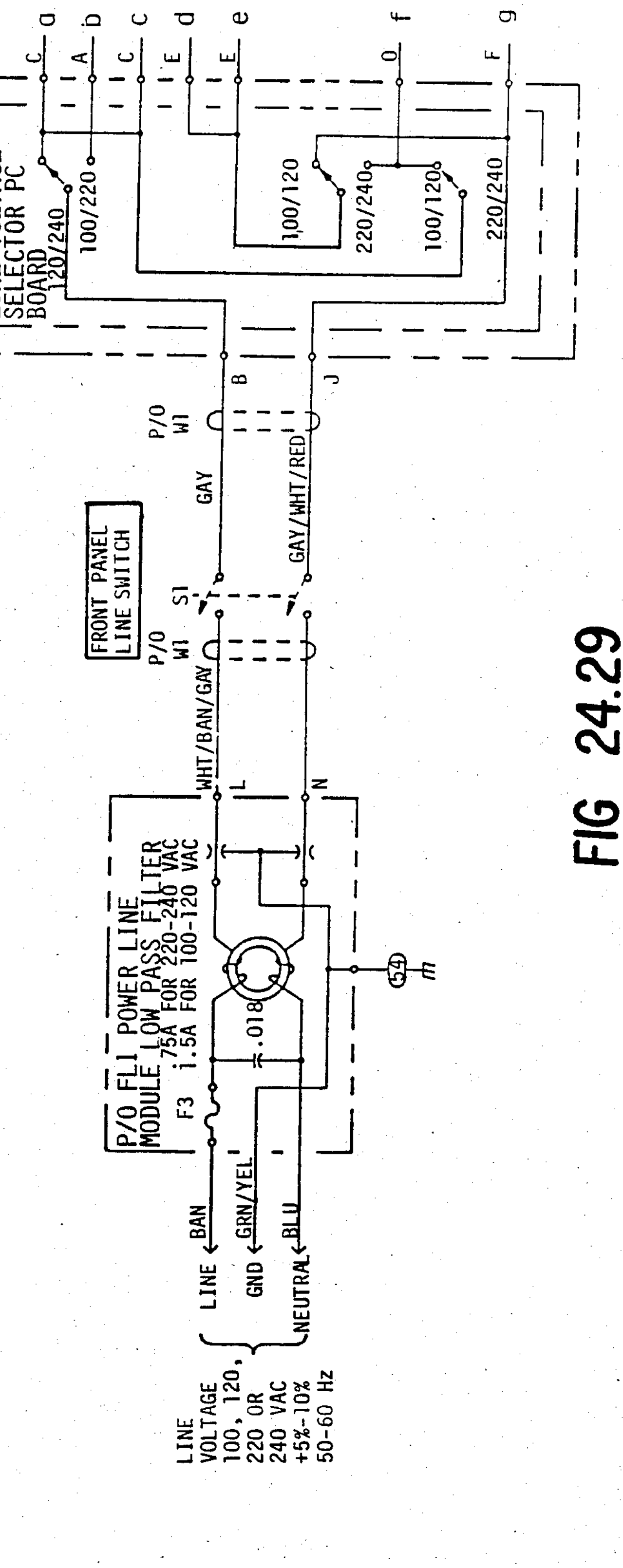
FIG 24.29

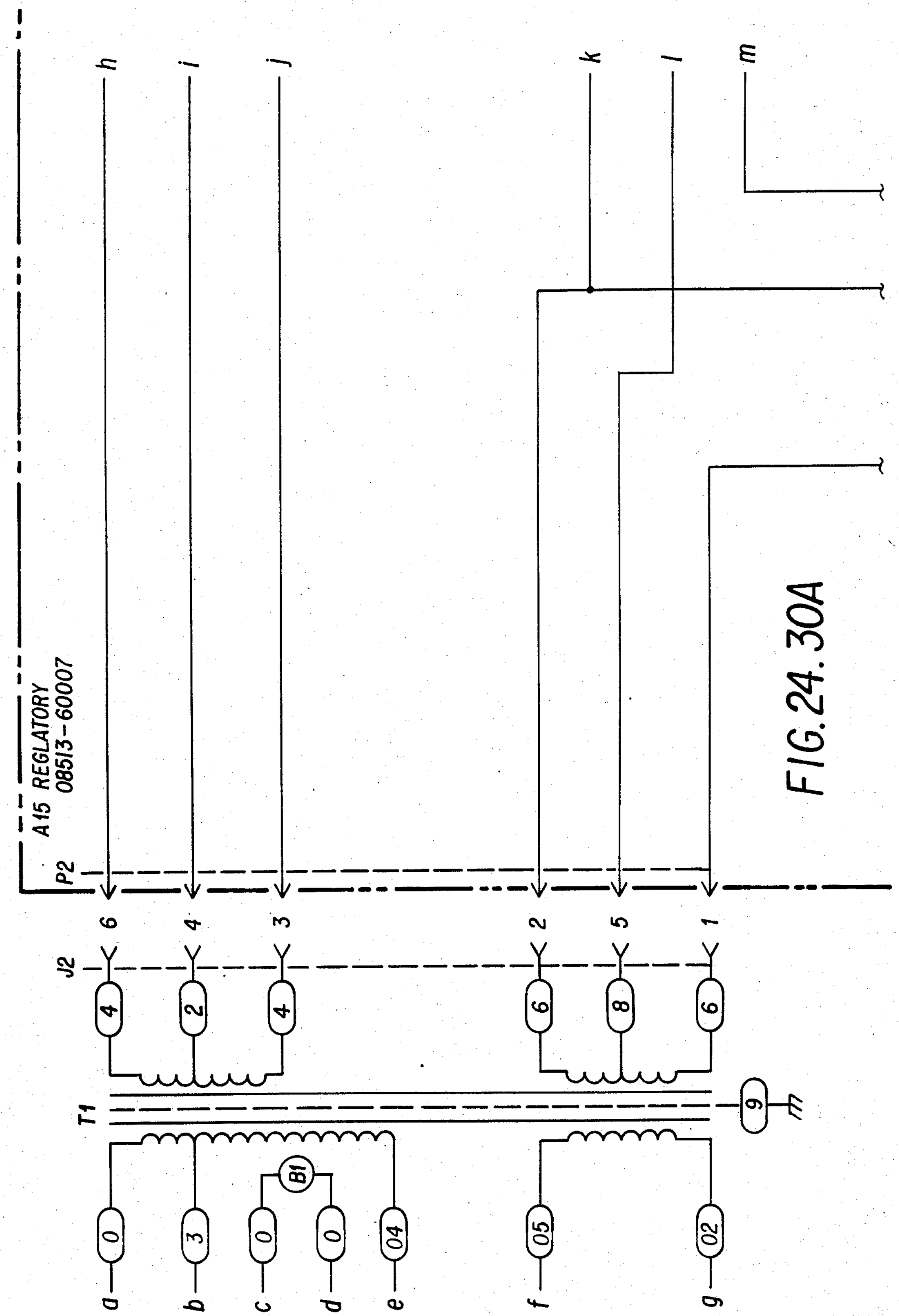
FIG. 24.30A

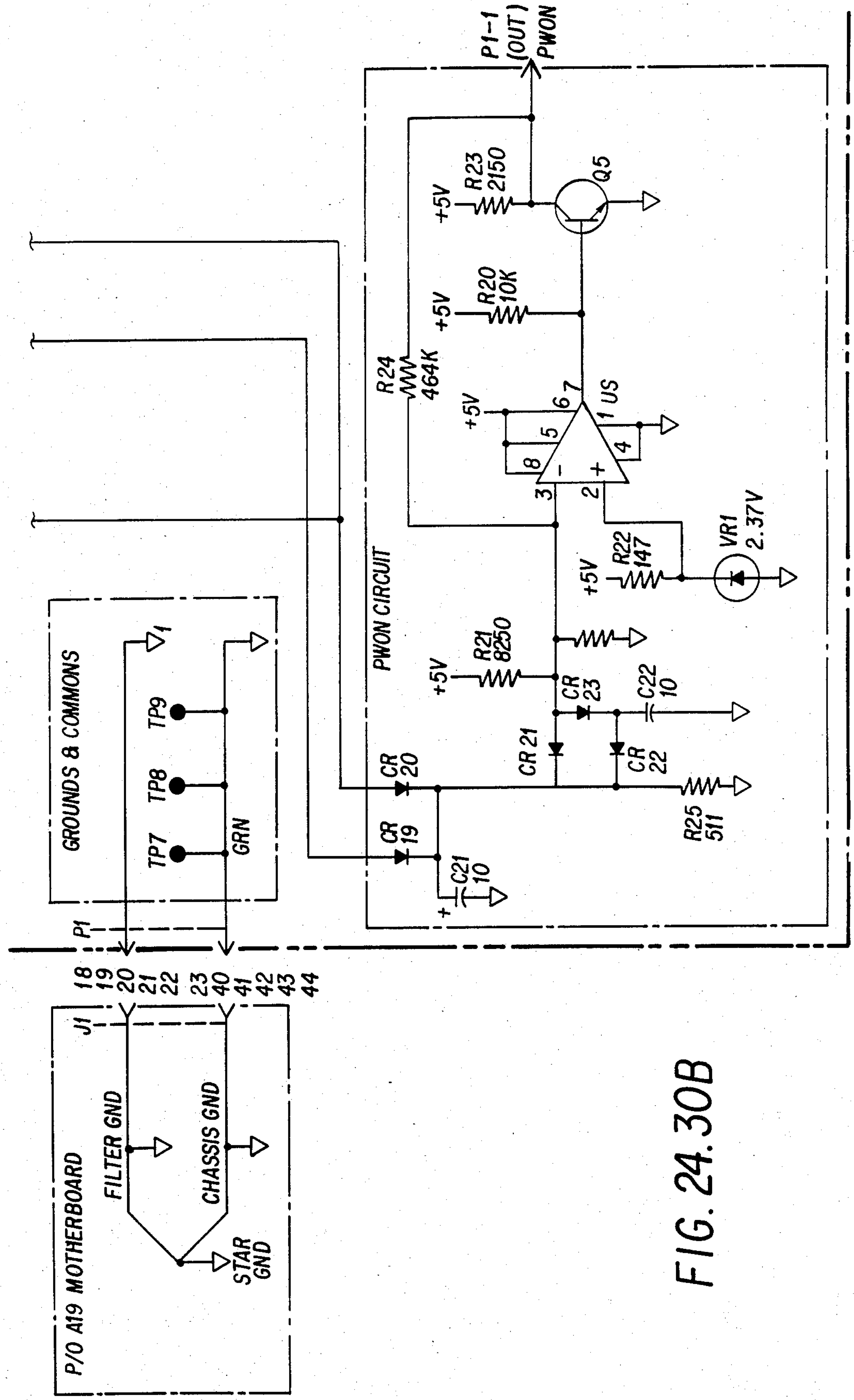
FIG. 24.30B

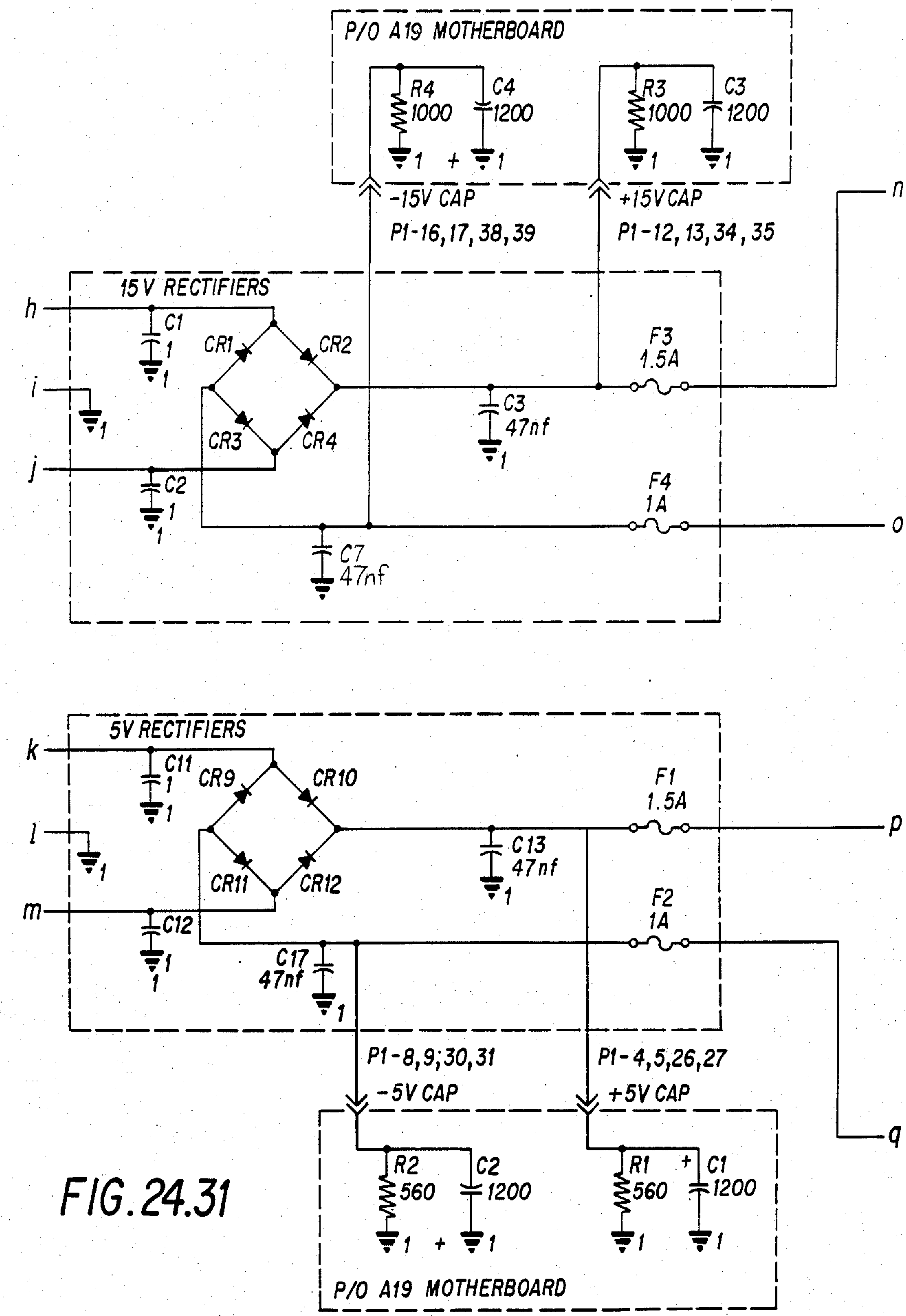
FIG. 24.31

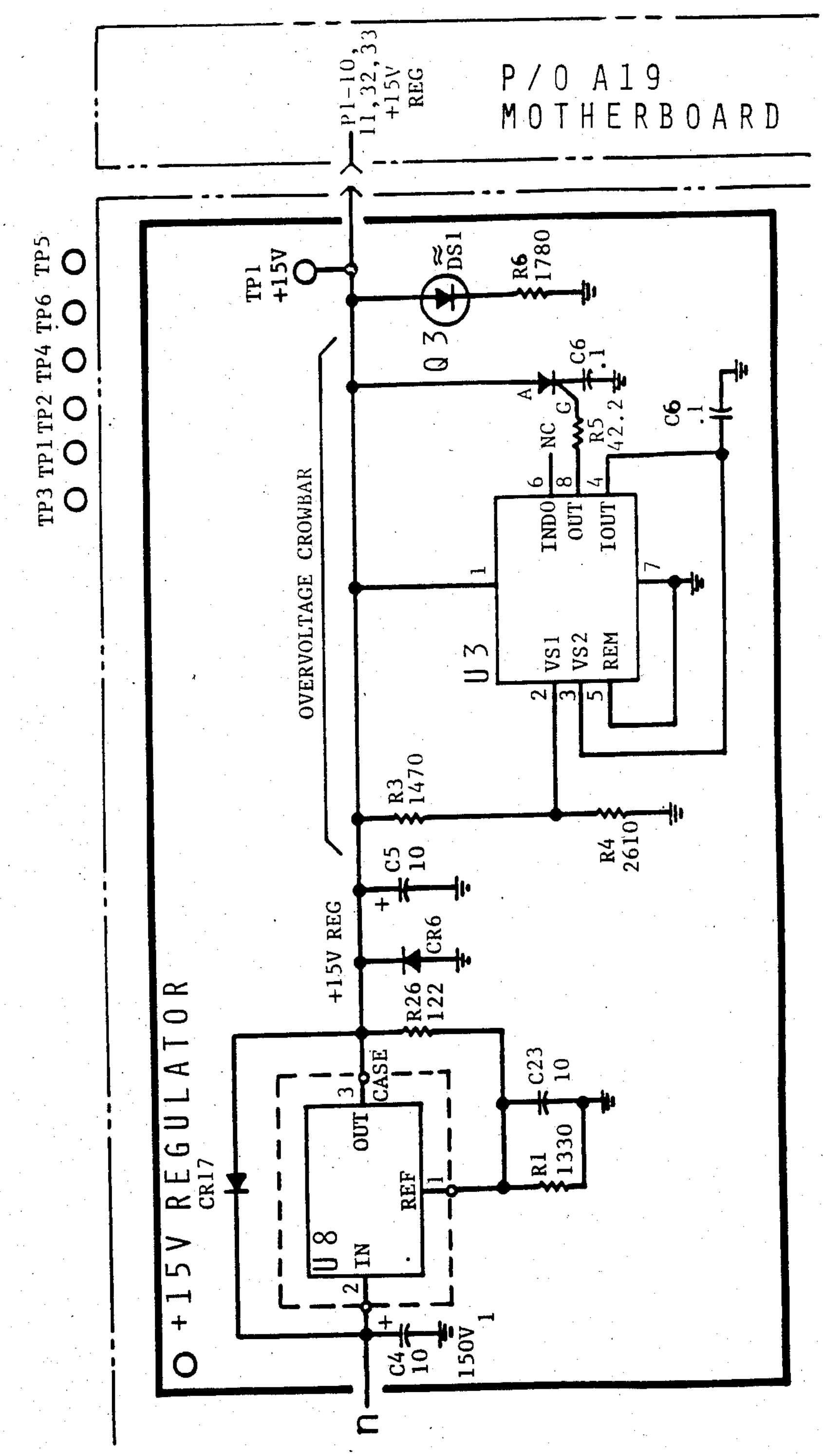
FIG 24.32A

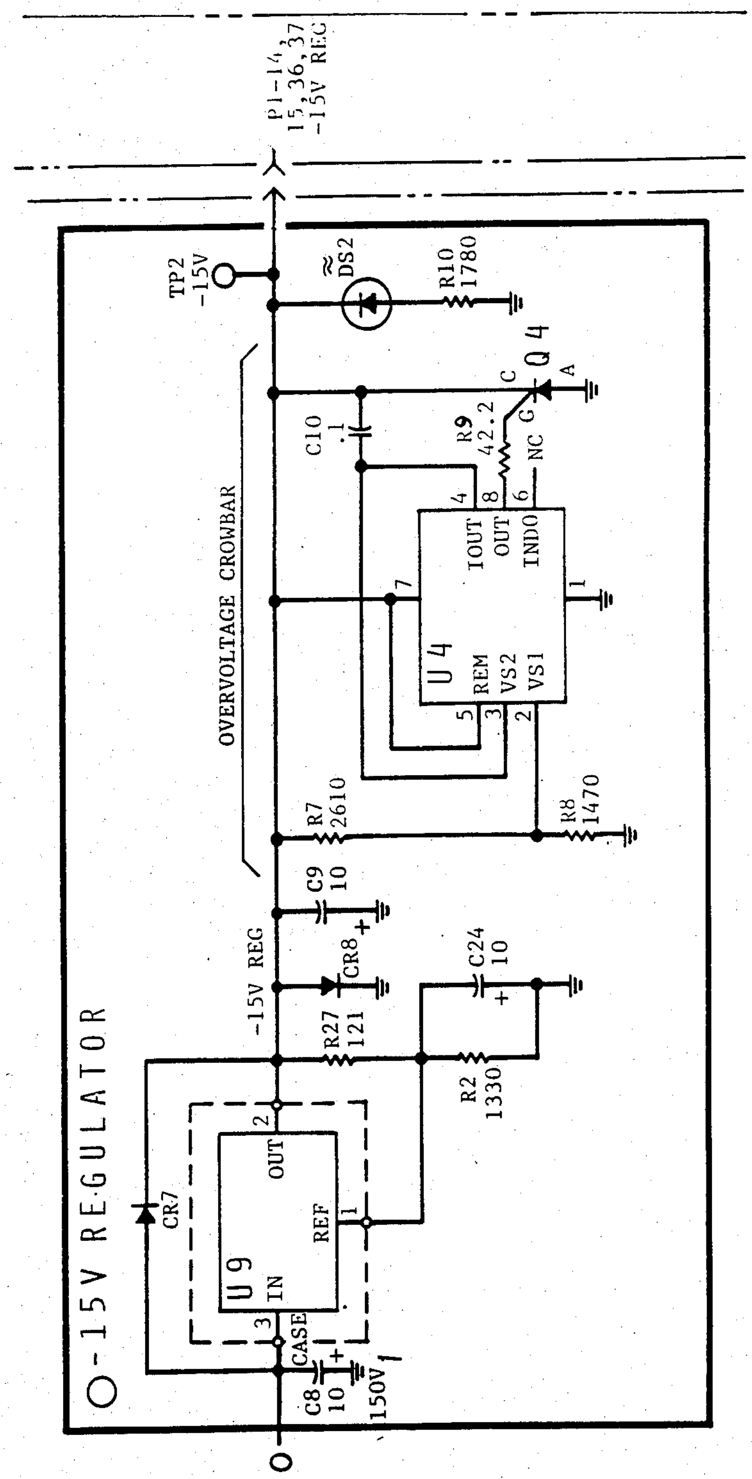
FIG 24.32B

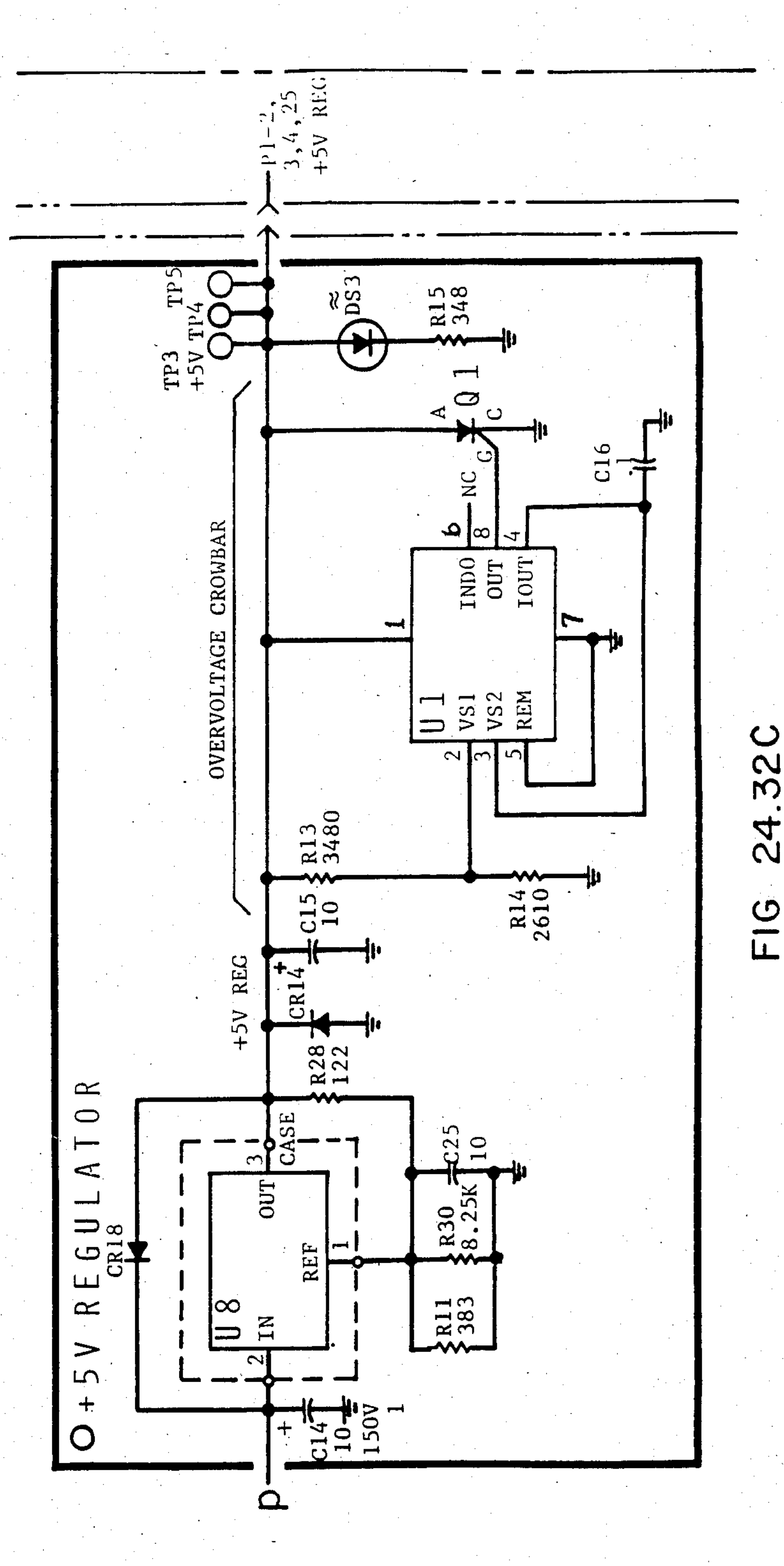
FIG 24.32C

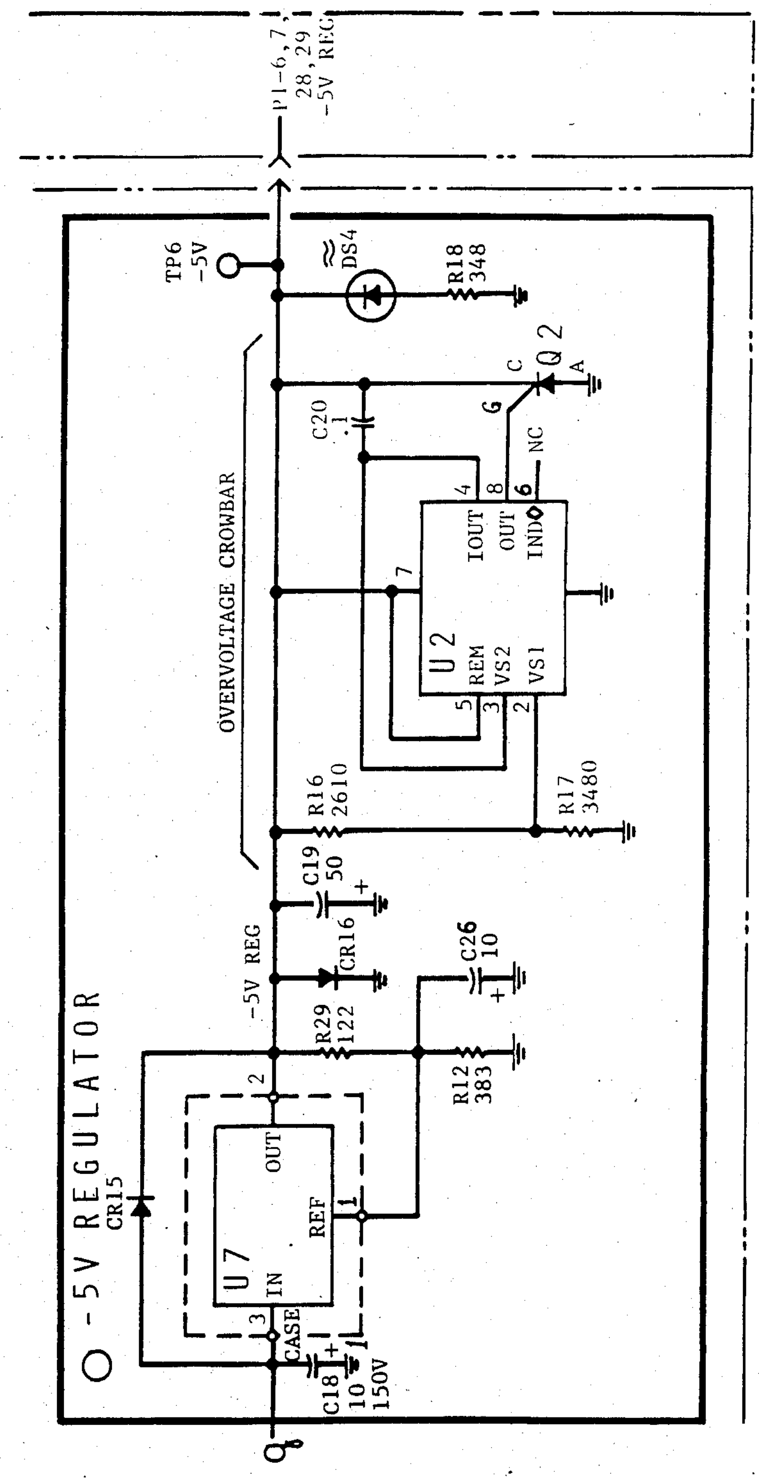
FIG 24.32 D

FIG. 25.1A
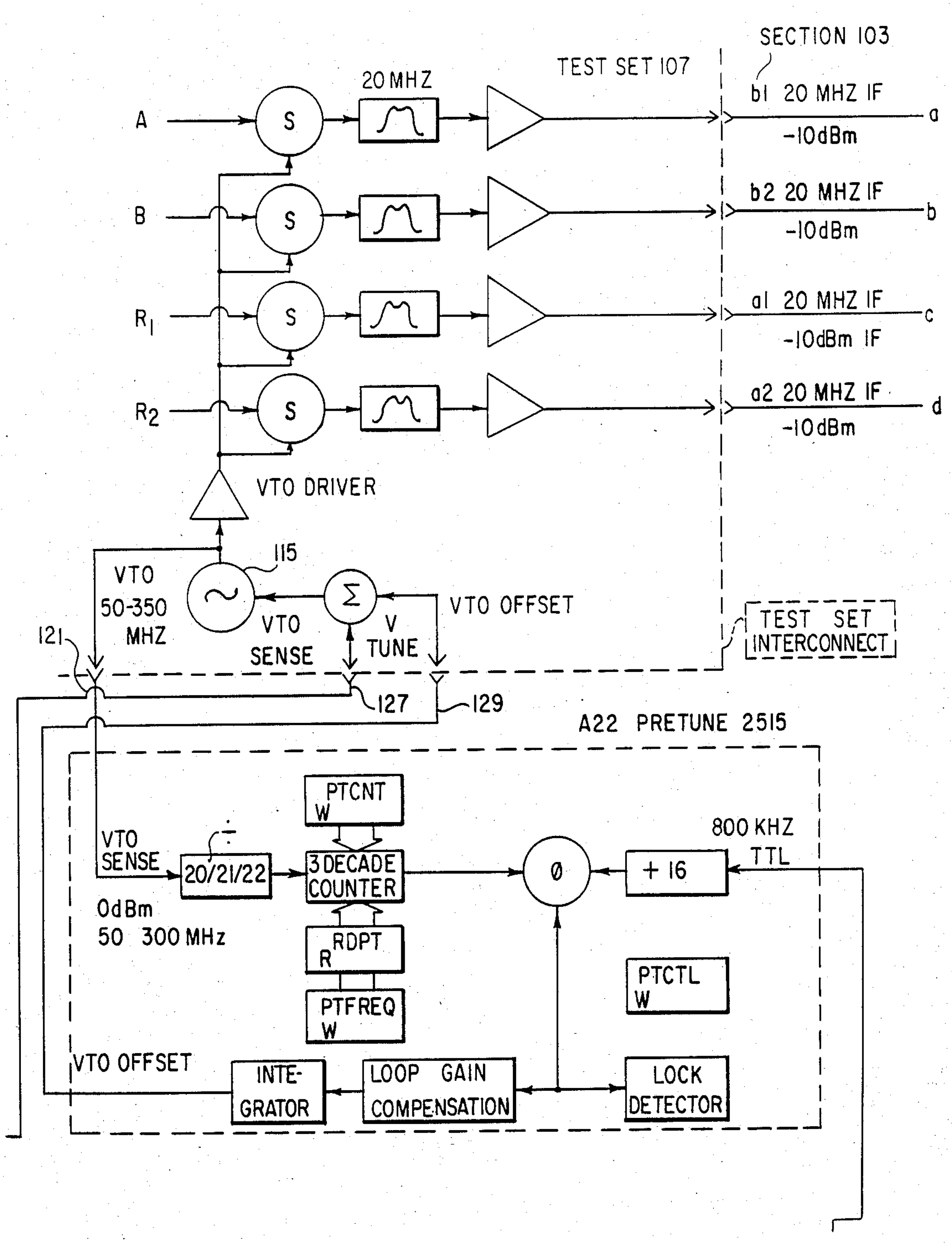

FIG. 25.1B
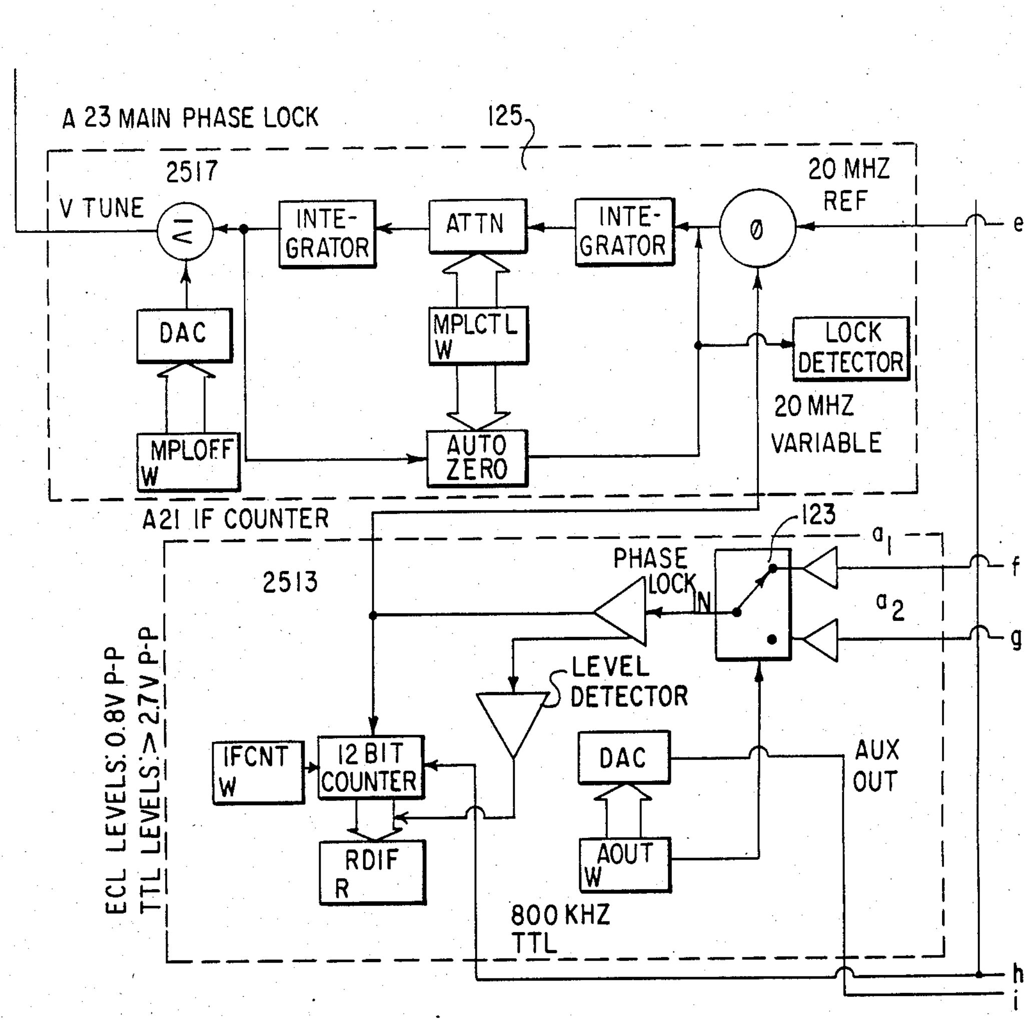

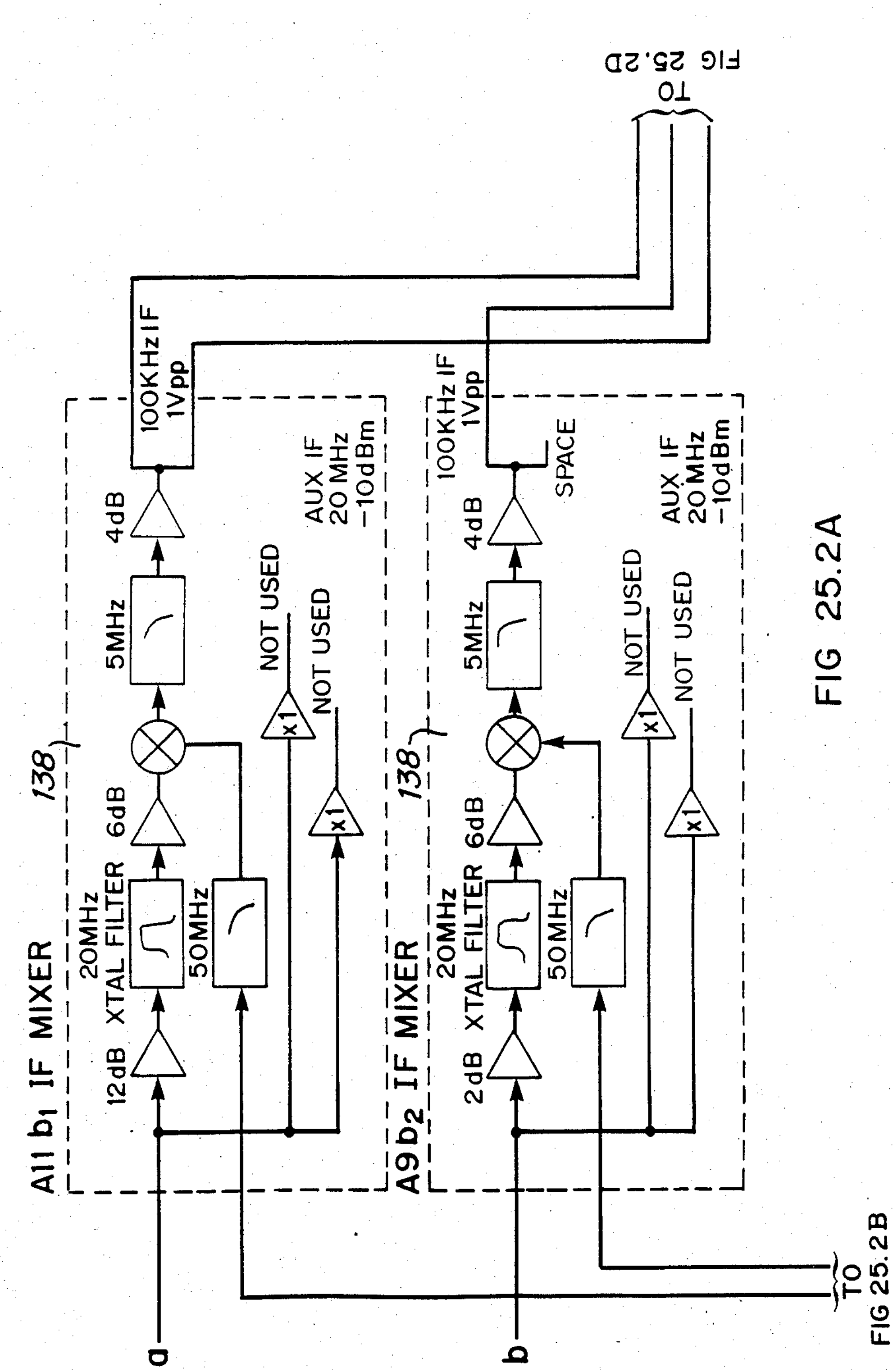
FIG 25.2A

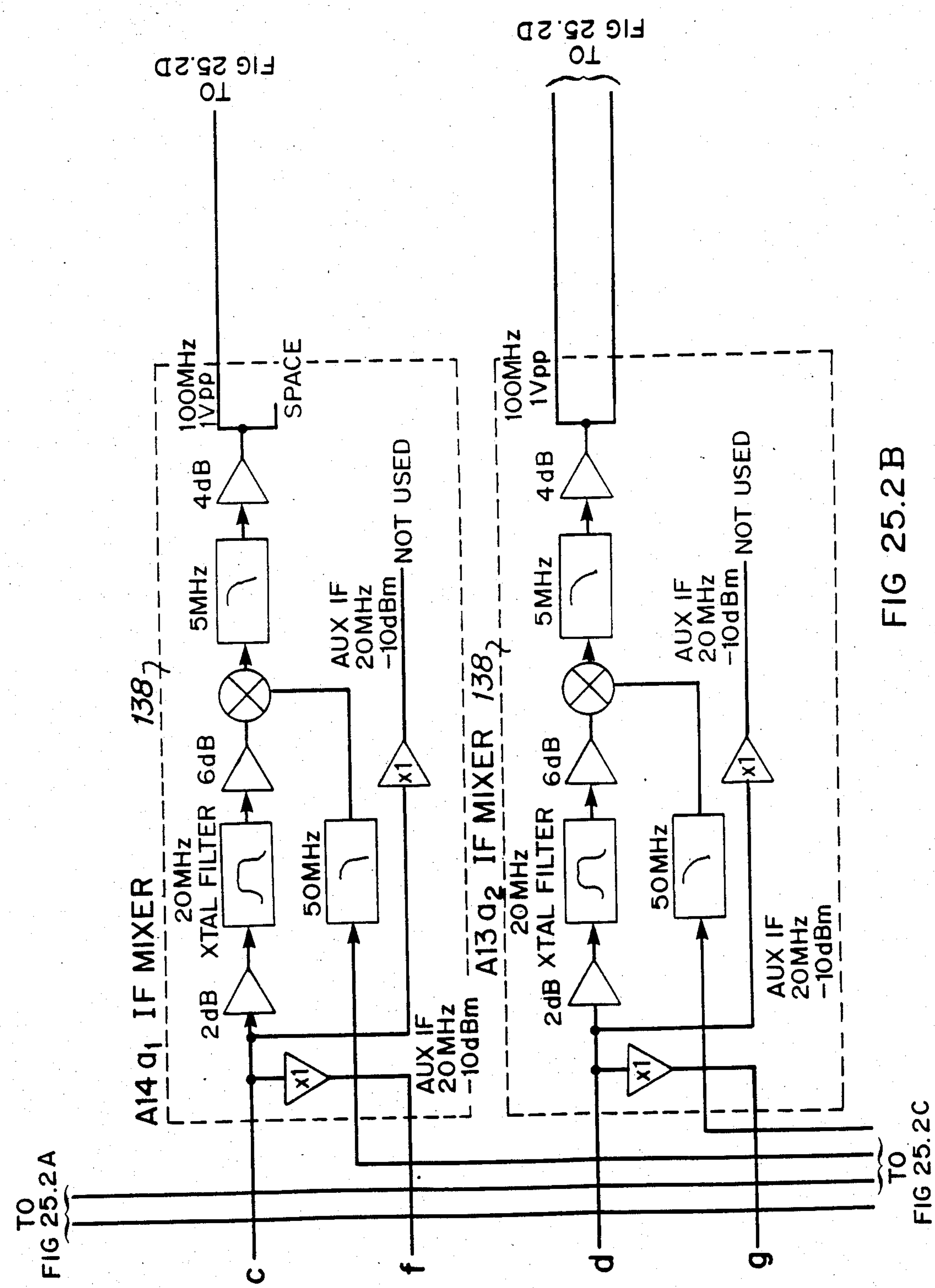
FIG 25.2B

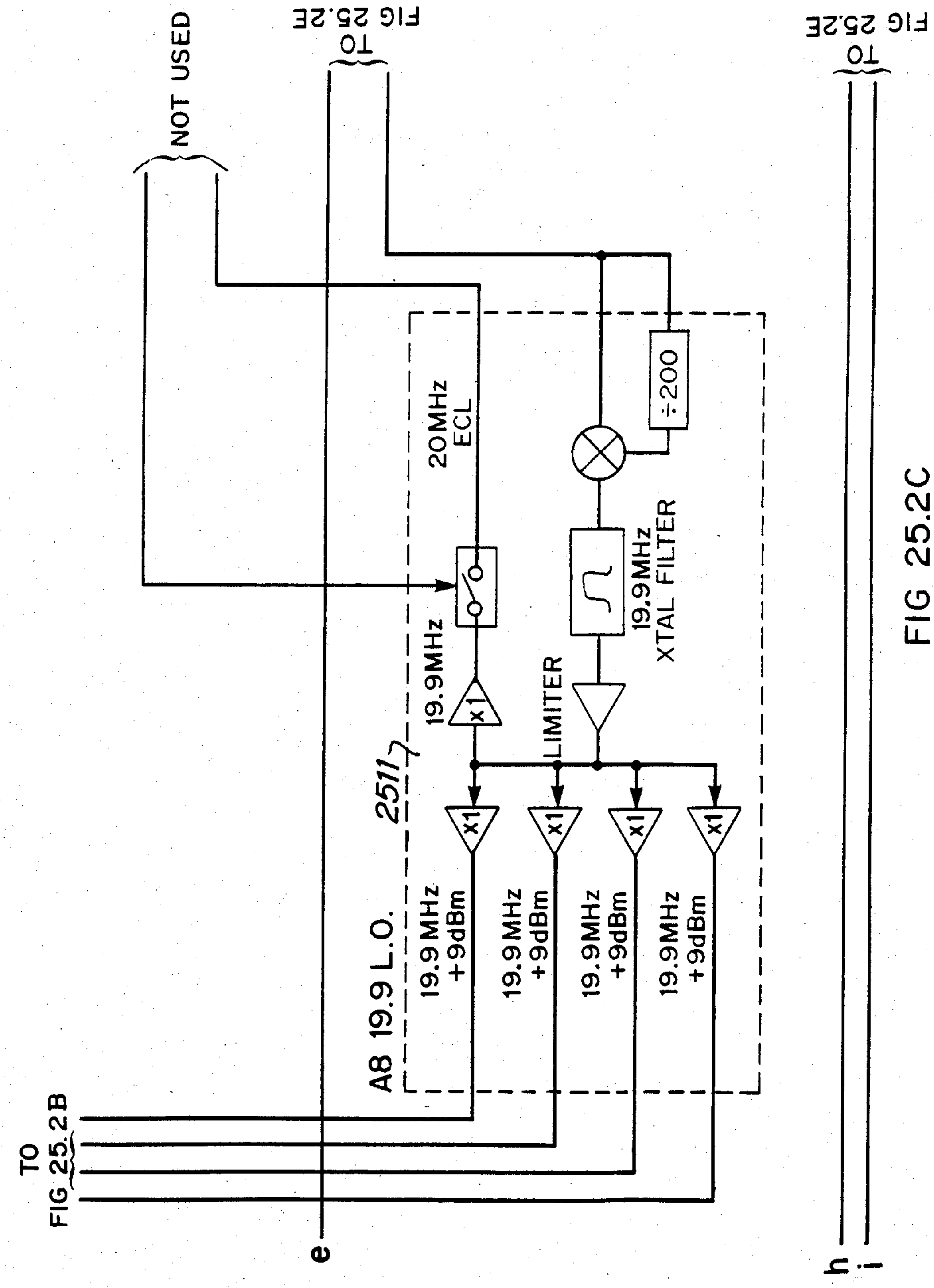
FIG 25.2C

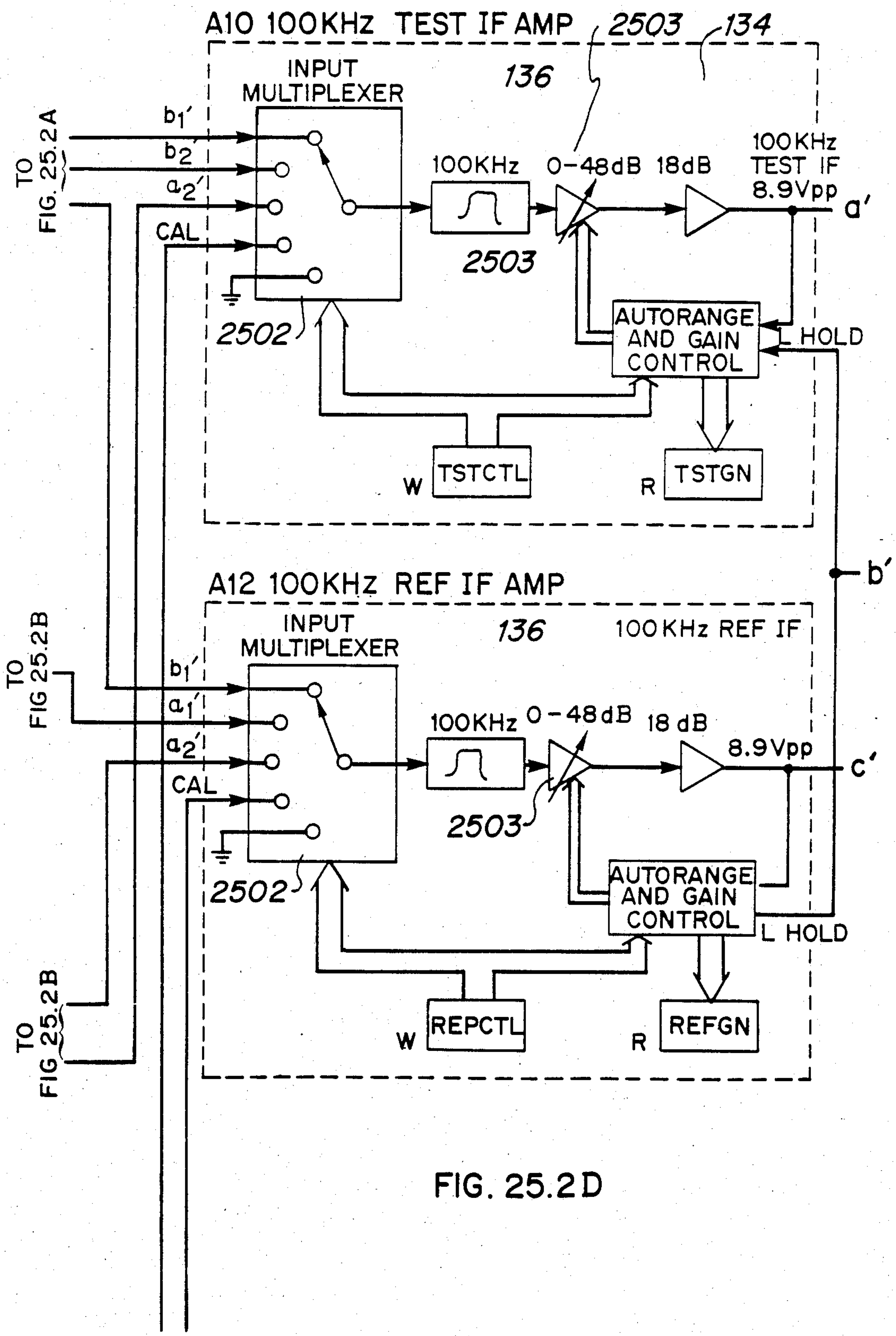
FIG. 25.2D

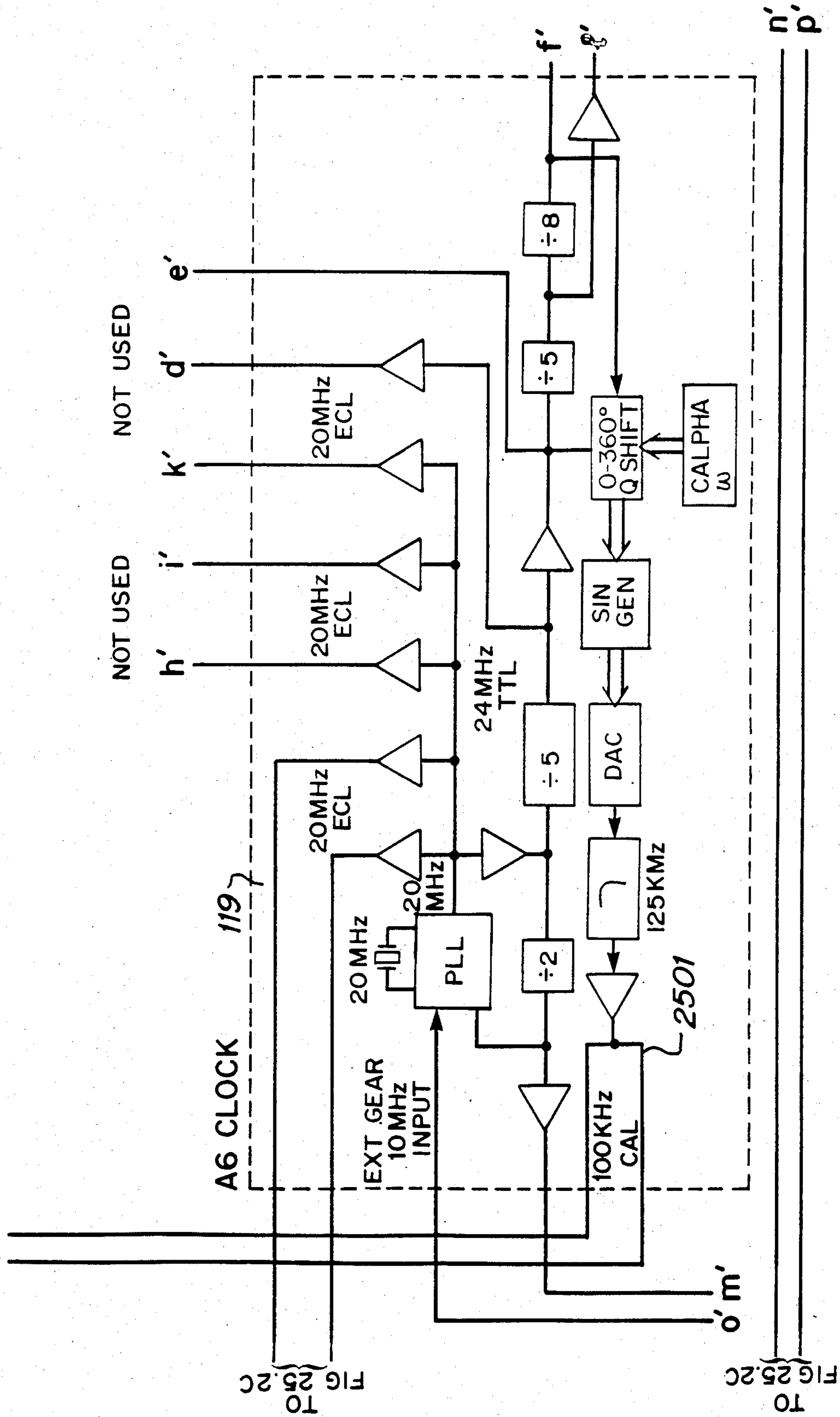
FIG 25.2E

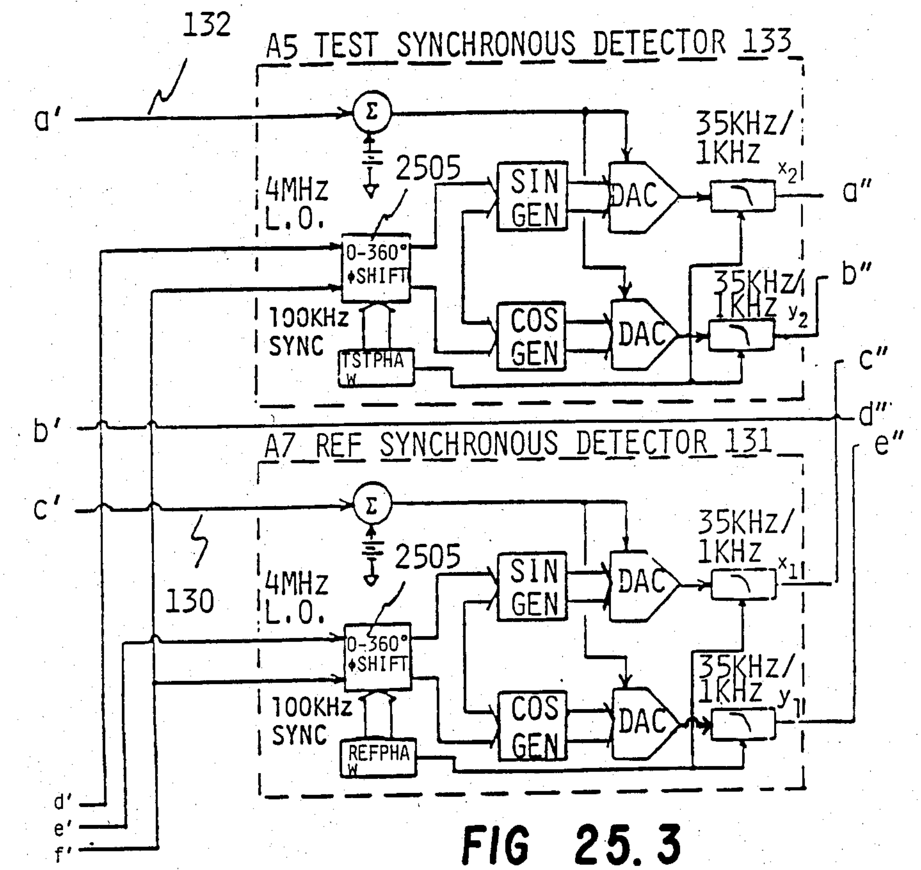
FIG 25.3
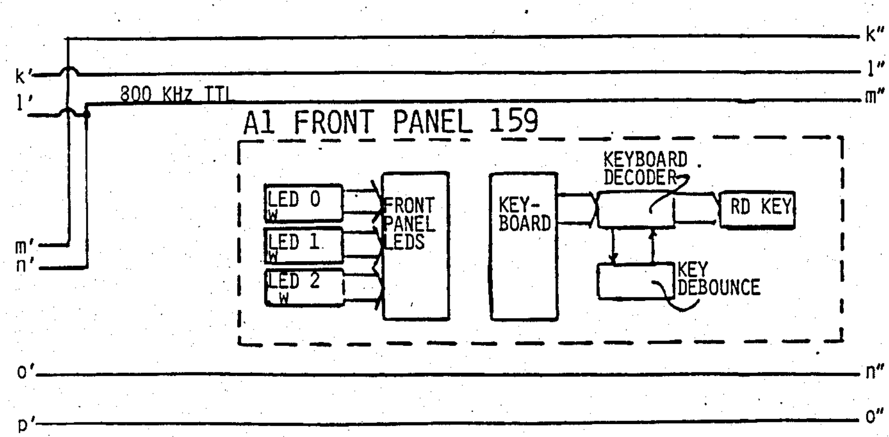
FIG 25.4

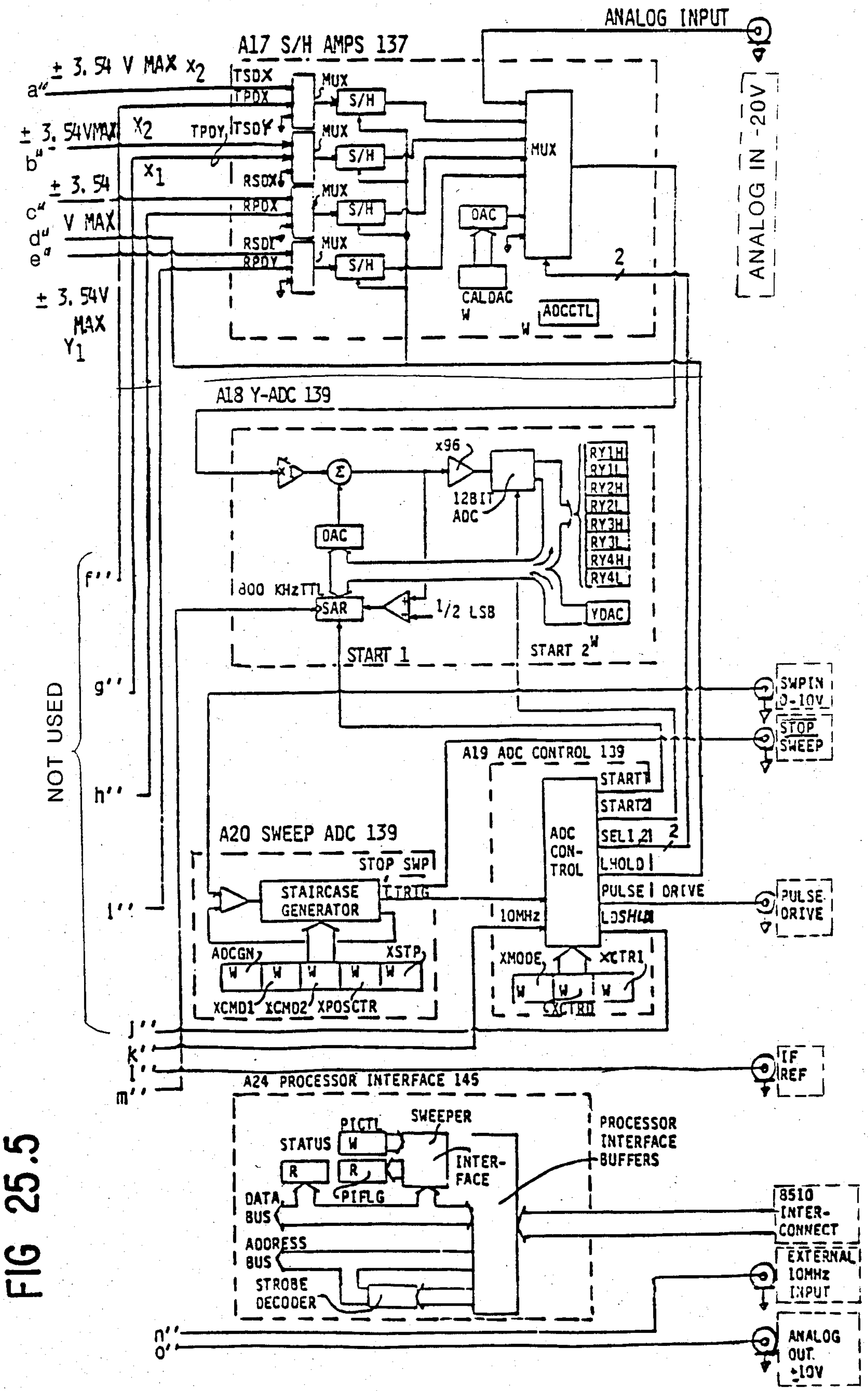
FIG 25.5

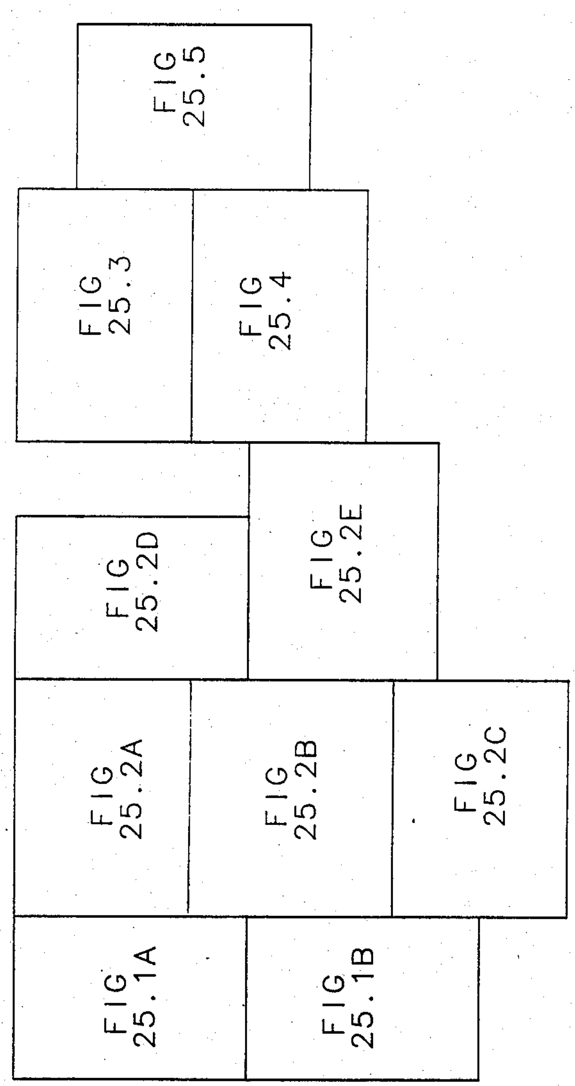
FIG 25.6

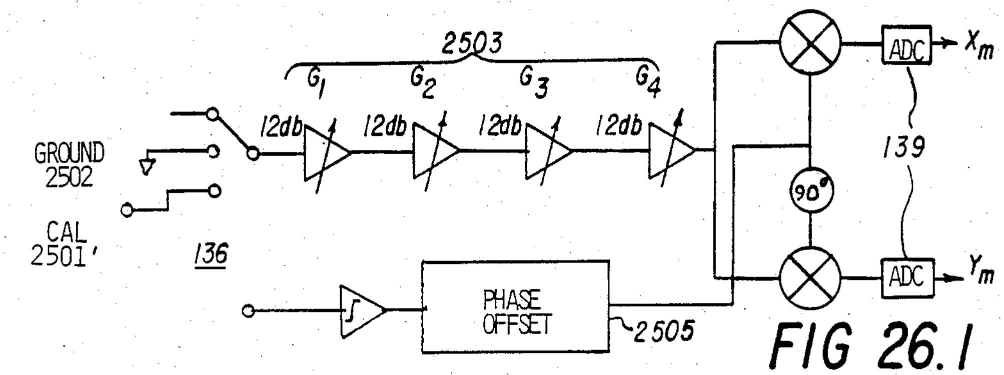

FIG 26.1

$$\begin{bmatrix} X \\ Y \end{bmatrix} = \underbrace{\begin{bmatrix} H_{11} & H_{12} \\ H_{21} & H_{22} \end{bmatrix}}_{[H]} \begin{bmatrix} X_m - X_0 \\ Y_m - Y_0 \end{bmatrix}$$

FIG 26.2

$$X_0 = \frac{1}{4} \Sigma X_m \quad ; \quad y_0 = \frac{1}{4} \Sigma Y_m$$

FIG 26.3

$$1)\ \begin{bmatrix} X \\ Y \end{bmatrix}_{0^\circ} = \begin{bmatrix} A \\ 0 \end{bmatrix};\ 2)\ \begin{bmatrix} X \\ Y \end{bmatrix}_{90^\circ} = \begin{bmatrix} 0 \\ A \end{bmatrix};\ 3)\ \begin{bmatrix} X \\ Y \end{bmatrix}_{180^\circ} = \begin{bmatrix} -A \\ 0 \end{bmatrix};\ 4)\ \begin{bmatrix} X \\ Y \end{bmatrix}_{270} = \begin{bmatrix} 0 \\ -A \end{bmatrix}$$

FIG 26.4

$$\underbrace{\begin{bmatrix} 1 \\ 0 \\ 0 \\ 1 \end{bmatrix}}_{A} \begin{bmatrix} H_{11} \\ H_{12} \\ H_{21} \\ H_{22} \end{bmatrix} = \frac{A}{\Sigma(x^2)\Sigma(y^2) - (\Sigma(xy))^2} \begin{bmatrix} 0 & -(Y_1-Y_3) & (X_1-X_3) \\ (Y_1-Y_3) & -(X_1-X_3) & 0 \\ 0 & -(Y_2-Y_4) & (X_2-X_4) \\ (Y_2-Y_4) & -(X_2-X_4) & 0 \end{bmatrix} \begin{bmatrix} \Sigma(x^2) \\ \Sigma(xy) \\ \Sigma(y^2) \end{bmatrix}$$

FIG 26.5

$$a_1 = A \cdot \left[ \frac{(X_1-X_3) + (Y_2-Y_4)}{\Sigma(X^2) + \Sigma(Y^2)} \right.$$
$$b_1 = A \cdot \left. \frac{(X_2-X_4) + (Y_3-Y_1)}{\Sigma(X^2) + \Sigma(Y^2)} \right]$$

FIG 26.6

PI A6 CLOCK

| PIN | SIGNAL | TO/FROM | FUCTION CLOCK |
|---|---|---|---|
| 1<br>23 | | | |
| 2 | LTSDS | A5 | A |
| 24 | LRSDS | A7 | A |
| 3 | LTIFWS | A10 | A |
| 25 | LRIFWS | A12 | A |
| 4 | LTIFRS | A10 | A |
| 26<br>5 | LRIFRS<br>LHOST | A12<br>ADR BUS | A<br>A |
| 27 | LIFSRQ | | |
| 6 | CLK | A2 – A5 A16-A21 | F |
| 28 | LRDS | | |
| 7 | GND | | |
| 29 | Aϕ | ADR BUS | A |
| 8 | A1 | ADR BUS | A |
| 30 | A2 | ACR BUS | A |
| 9 | A3 | ADR BUS | A |
| 31 | A4 | ADR BUS | A |
| 10<br>32 | +15V REG | POWER BUS | I |
| 11<br>33 | GND | | I |
| 12<br>34 | GND | | I |
| 13<br>35 | -15V REG | POWER BUS | I |
| 14<br>36 | +5V REG | POWER BUS | I |
| 15 | BUF D8ϕ | DATA BUS | C |
| 37 | BUF D81 | " | C |
| 16 | BUF D82 | " | C |
| 38 | BUF D83 | " | C |
| 17 | BUF D84 | " | C |
| 39 | BUF D85 | " | C |
| 18 | BUF D86 | " | C |
| 40 | BUF D87 | " | C |
| 19<br>41 | 100 KHz<br>RET | A5, A7 | F<br>F |
| 20 | 100K SA | A5 | F |
| 42 | 100K SB | A7 | F |
| 21<br>43 | 100KHz<br>RETA | A5, A7 | F<br>F |
| 22<br>44 | | | |

FIG. 27.1A

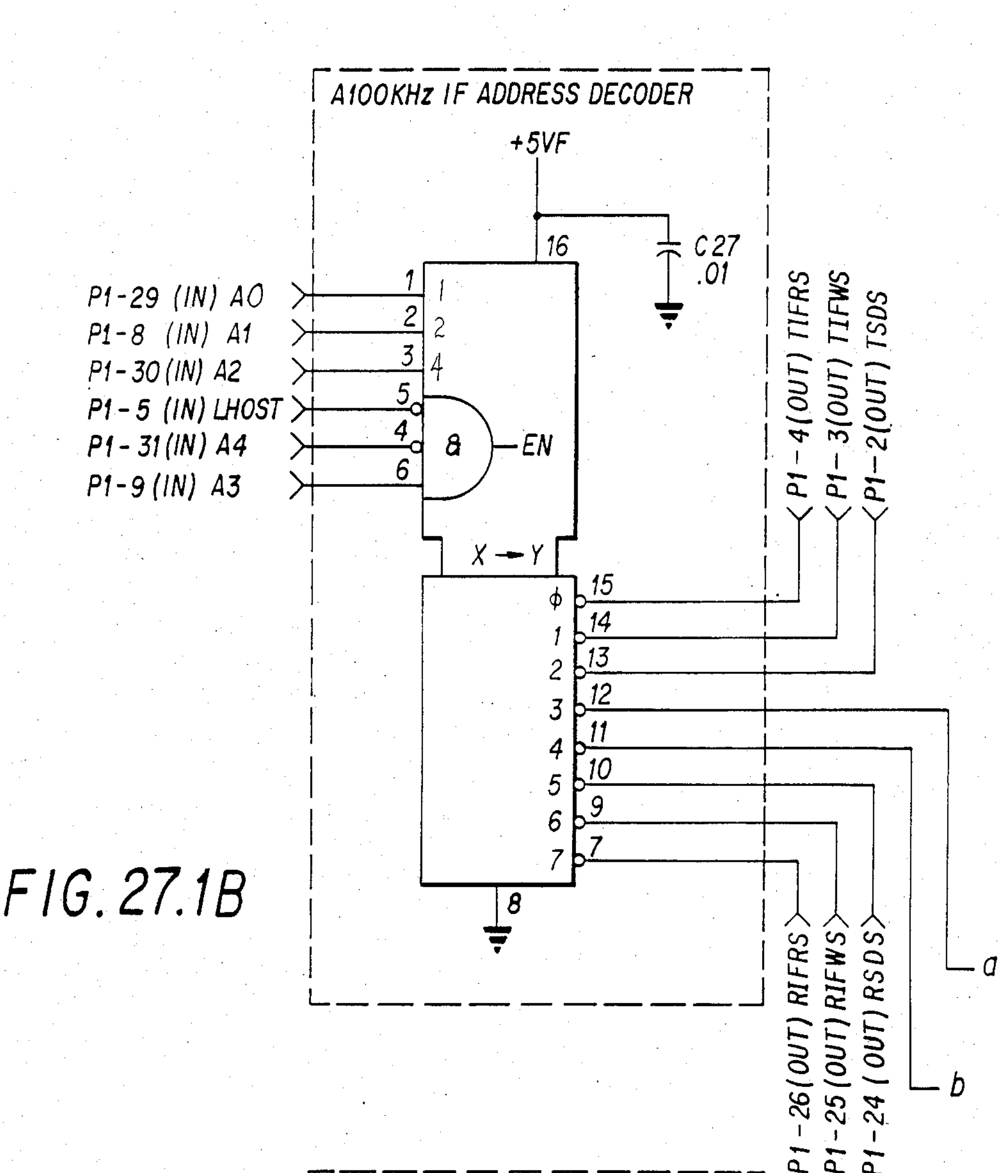
FIG. 27.1B
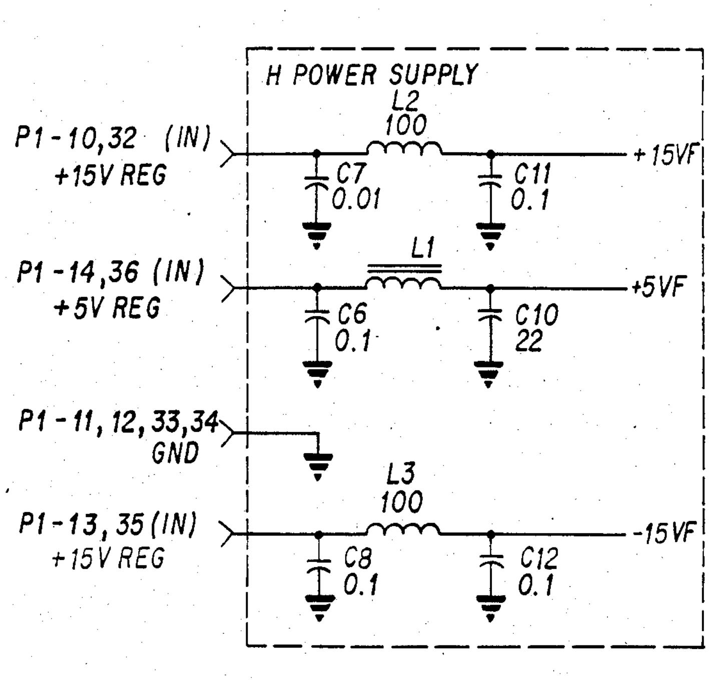
FIG. 27.1C

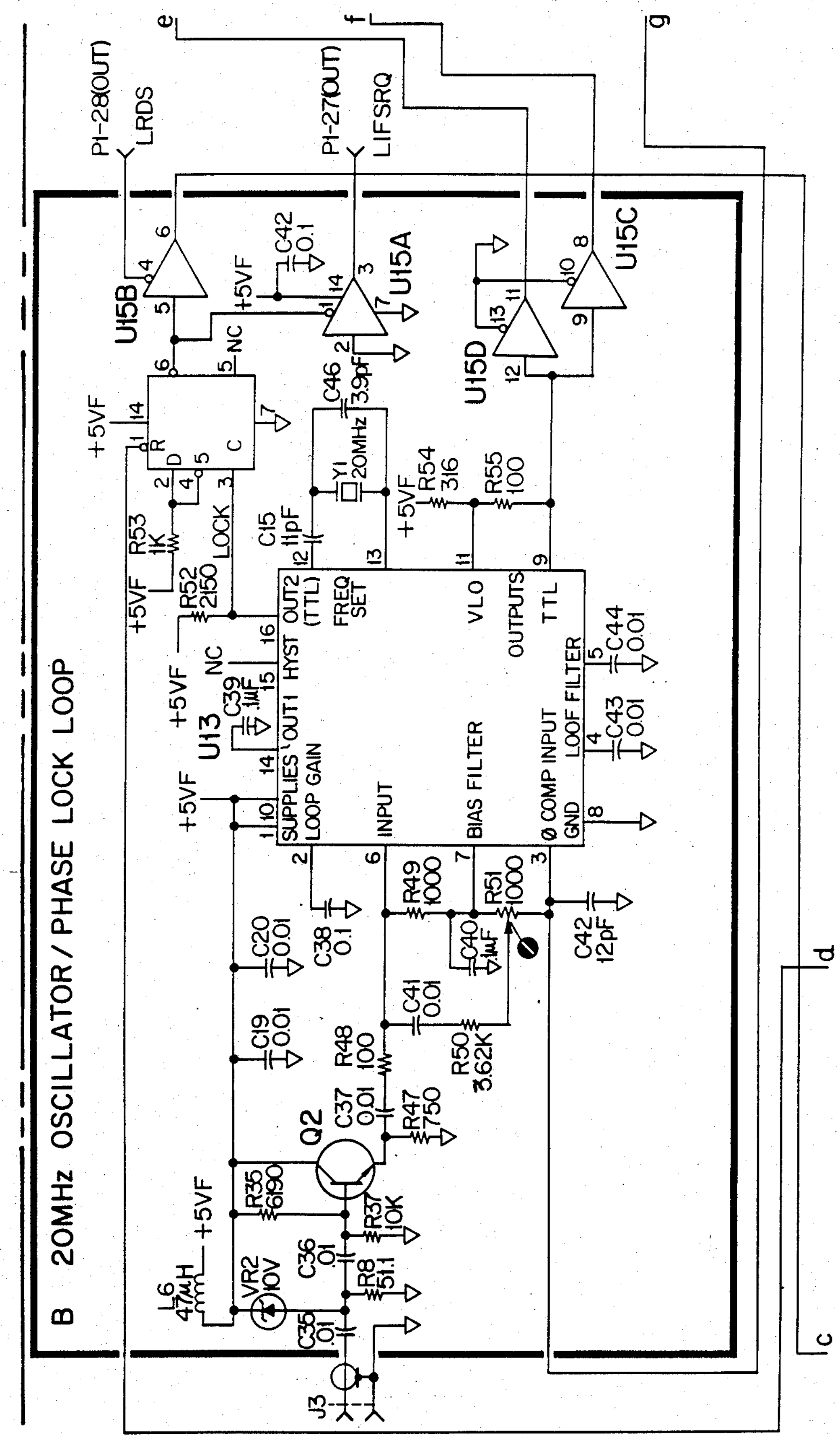
FIG 27.2

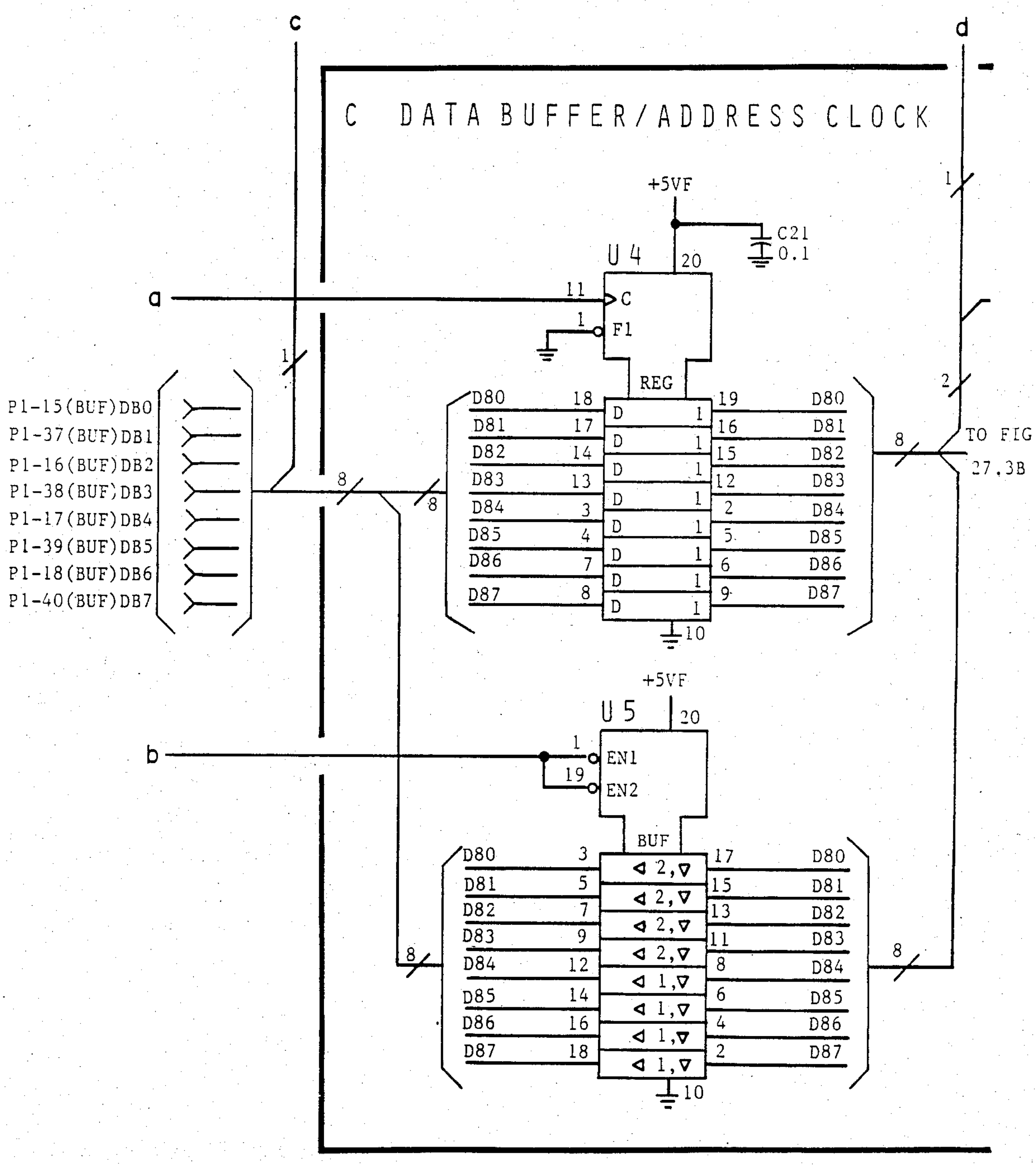
FIG 27.3A

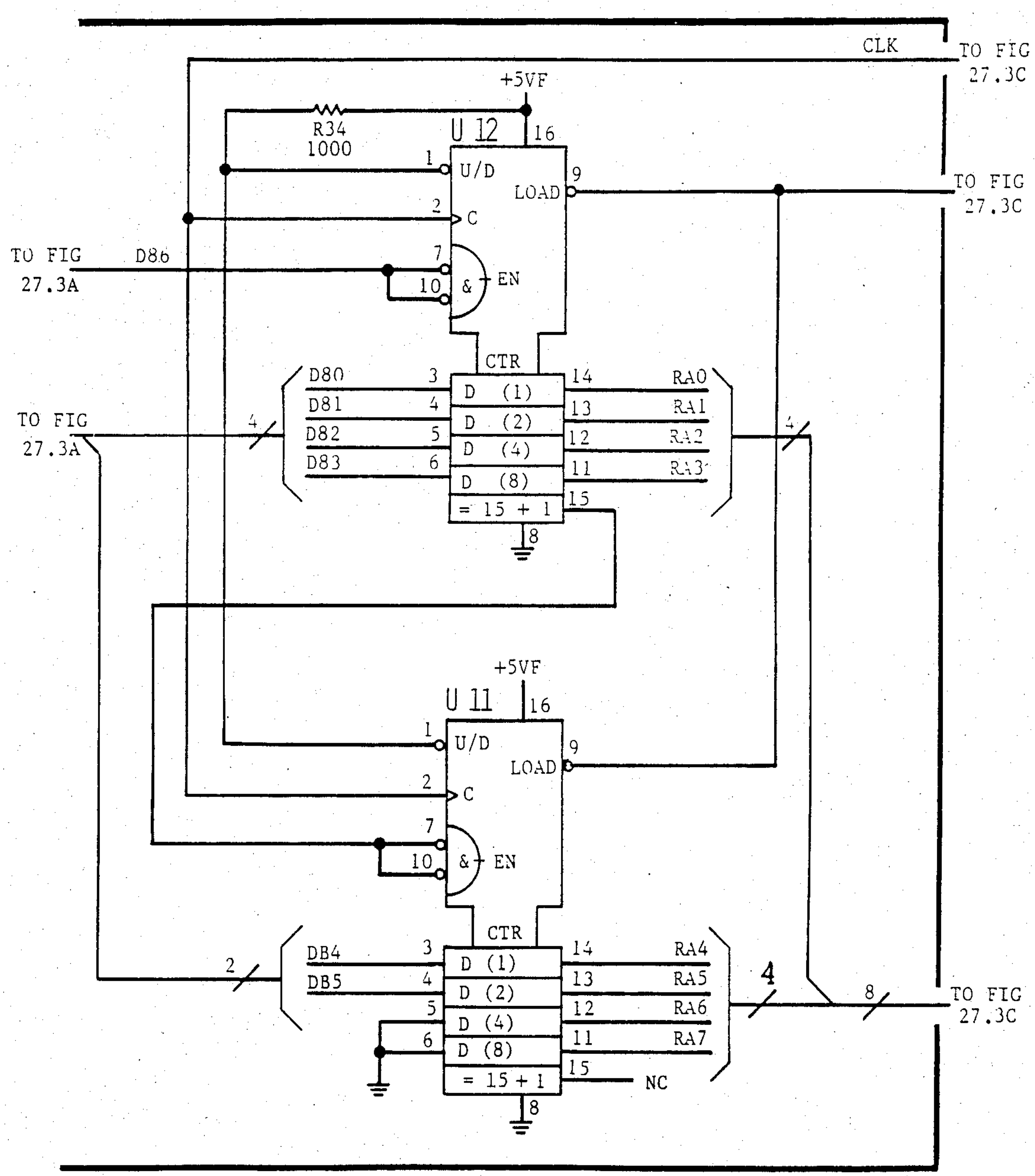
FIG 27.3B

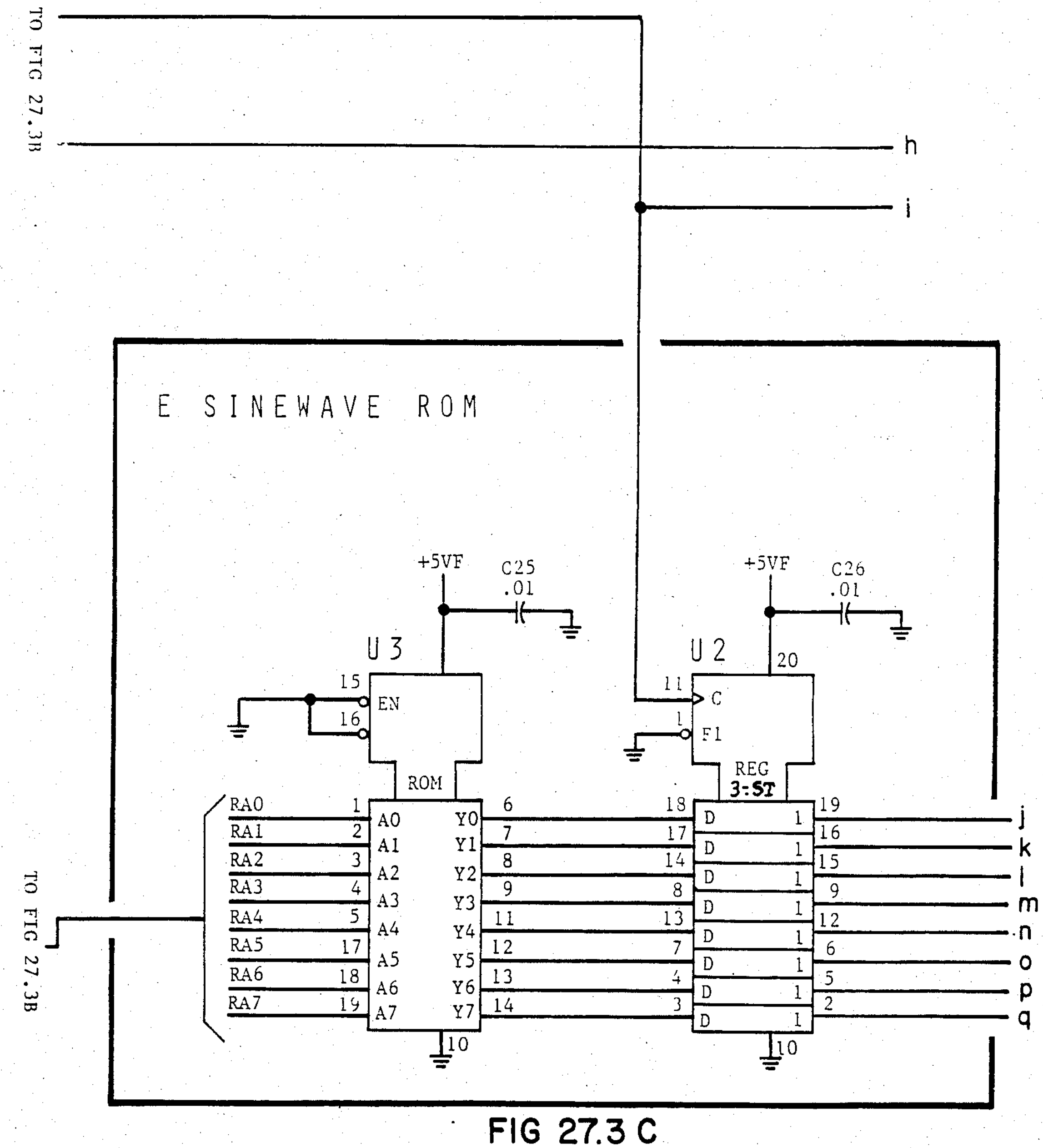
FIG 27.3 C

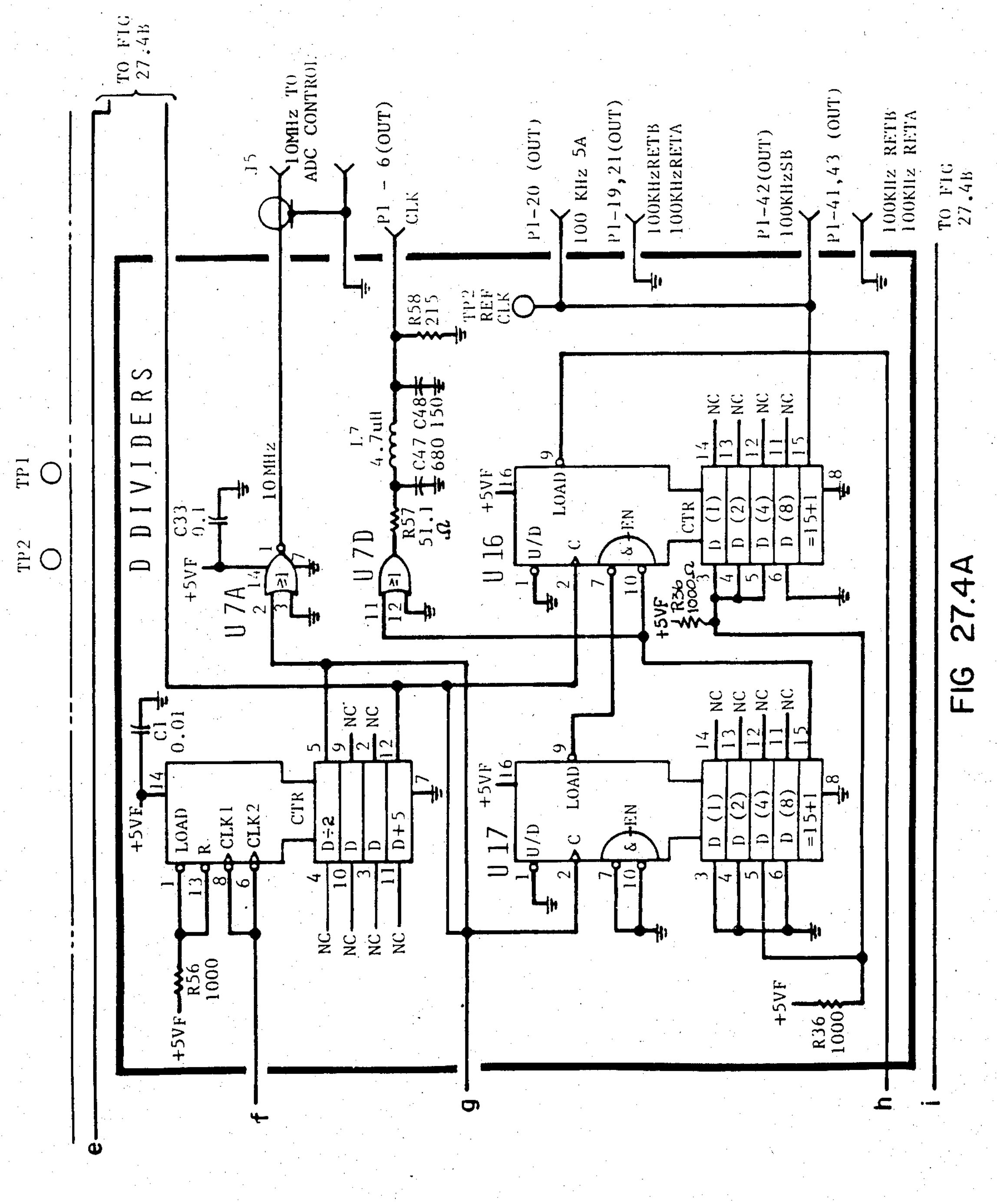
FIG 27.4A

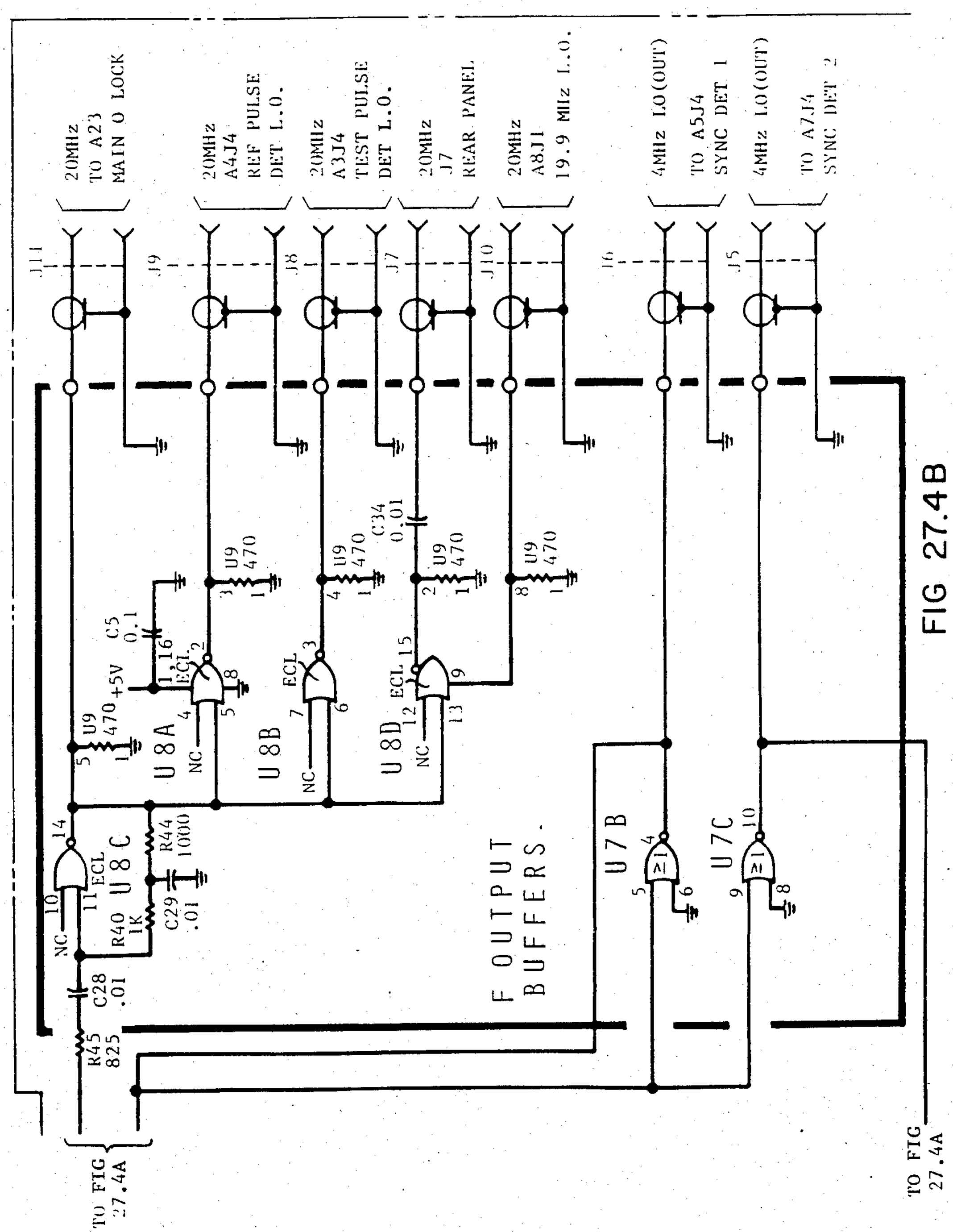
FIG 27.4B

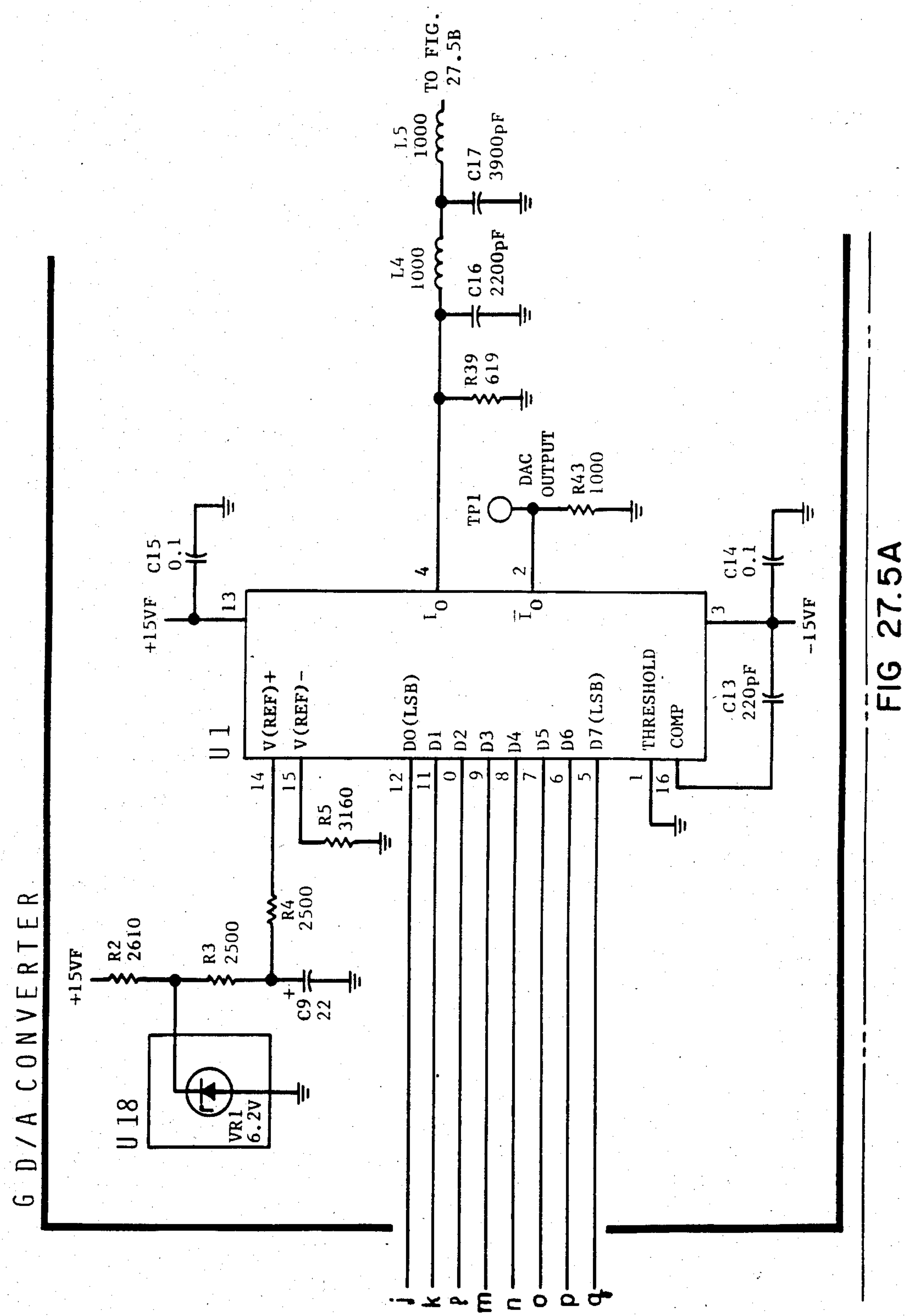
FIG 27.5A

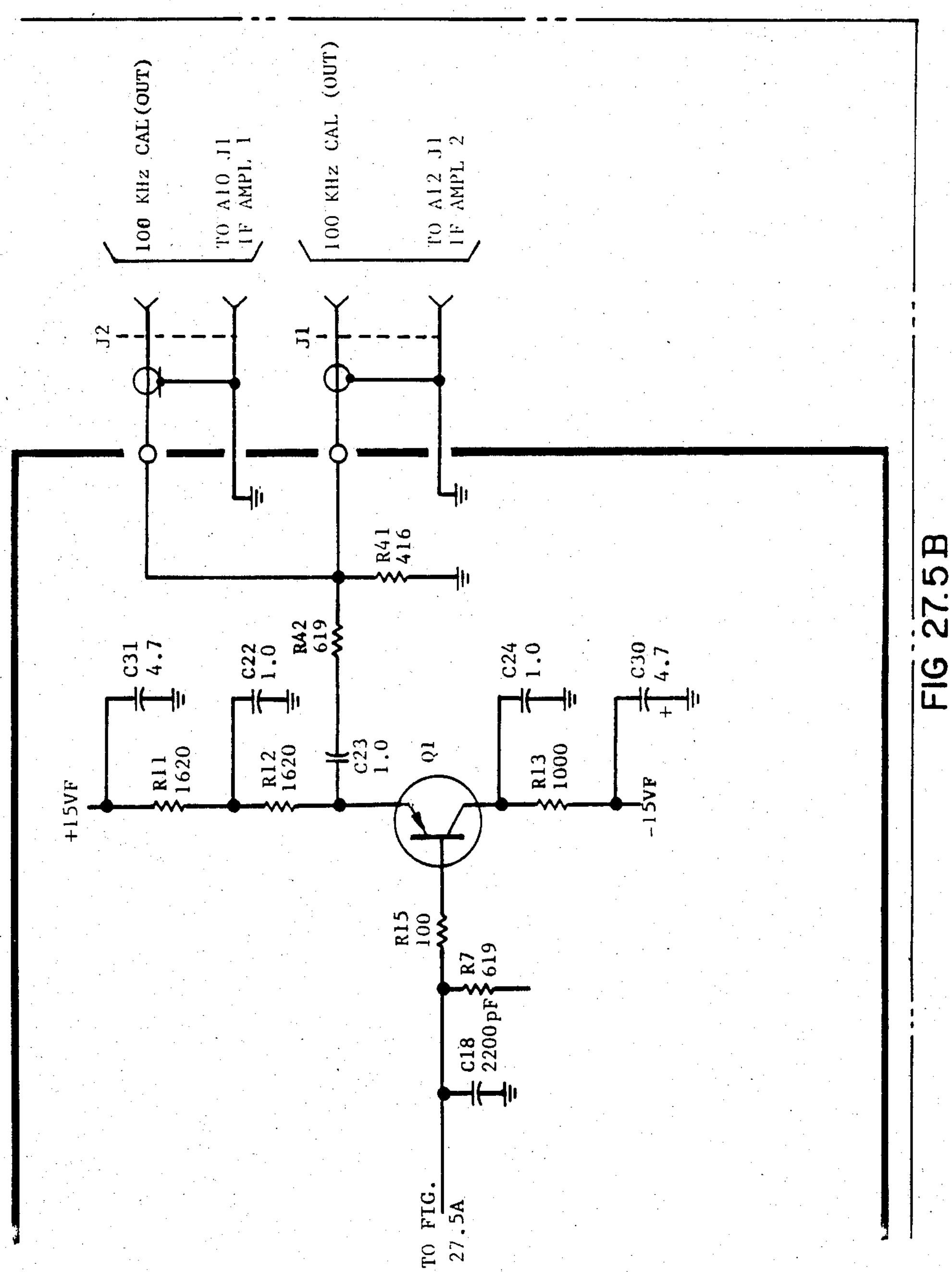
FIG 27.5 B

ACTIVE COMPONENTS PARTS LISTS (U's and Q's)

| REFERENCE DESIGNATORS | PART NUMBER | MANUFACTURER'S PART NUMBER |
|---|---|---|
| U1 | 1820-1934 | DAC-08 |
| U2 | 1820-1997 | 74 LS 374 |
| U4 | 1820-1997 | 74 LS 374 |
| U5 | 1820-2024 | 74 LS 244 |
| U6 | 1820-1869 | 74 S 196 |
| U7 | 1820-107 4 | 74 123 |
| U8 | 1820-0802 | MC10102 |
| U9 | | |
| U10 | 1820-1216 | 74 LS 138 |
| U11,12,16,17 | 1820-1435 | 74 LS 669 |
| U13 | | SE 564 |
| U14 | 1820-0693 | 74 S 74 |
| U15 | 1820-1568 | 74 LS 125 |
| | | |
| Q1 | 1853-0314 | 2N2905A |
| Q2 | 1854-0477 | 2N2222 |

FIG 27.6

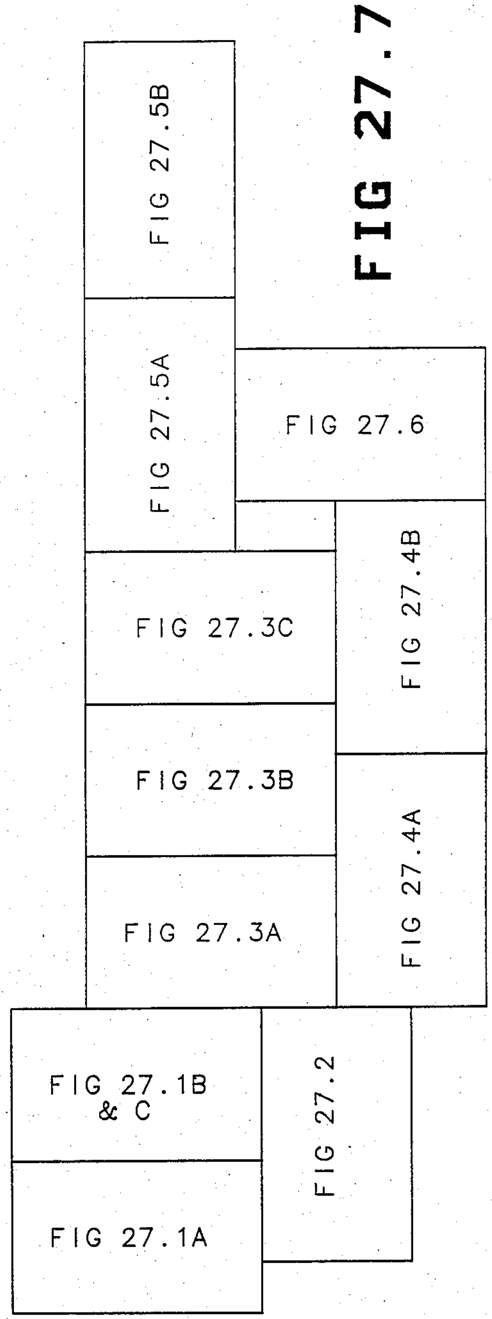
FIG 27.7
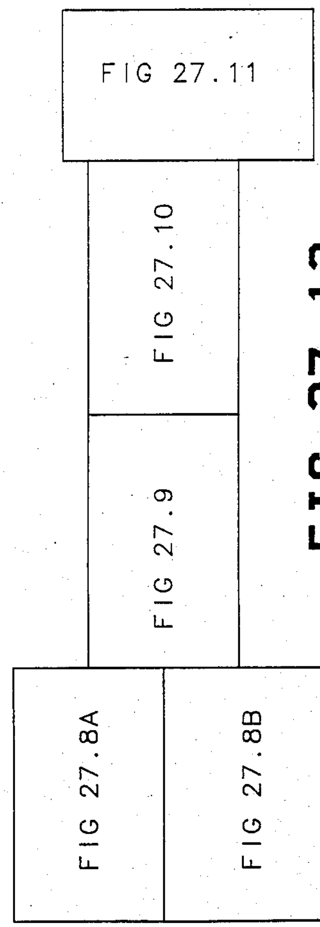
FIG 27.12

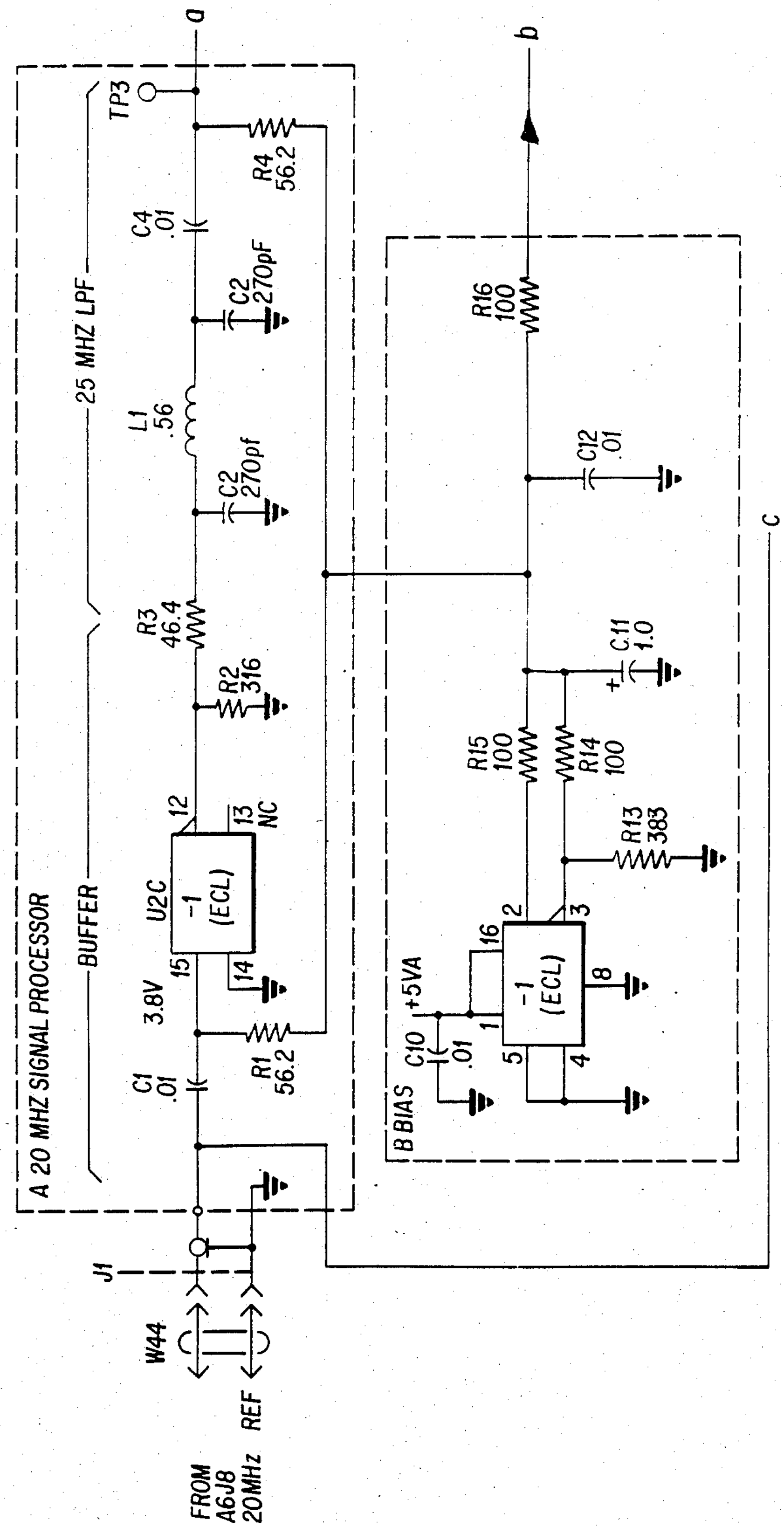
FIG. 27.8A

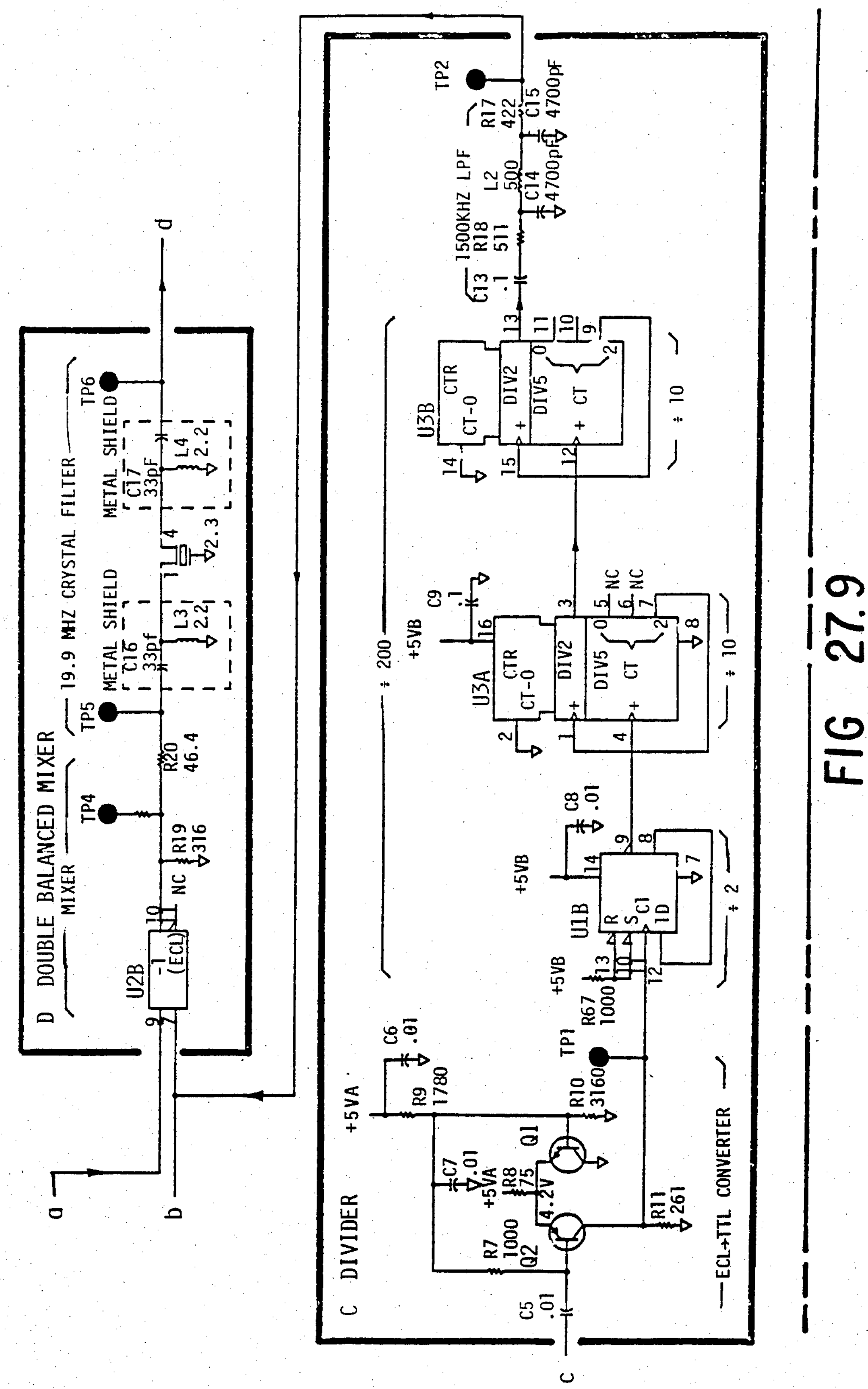
FIG 27.9

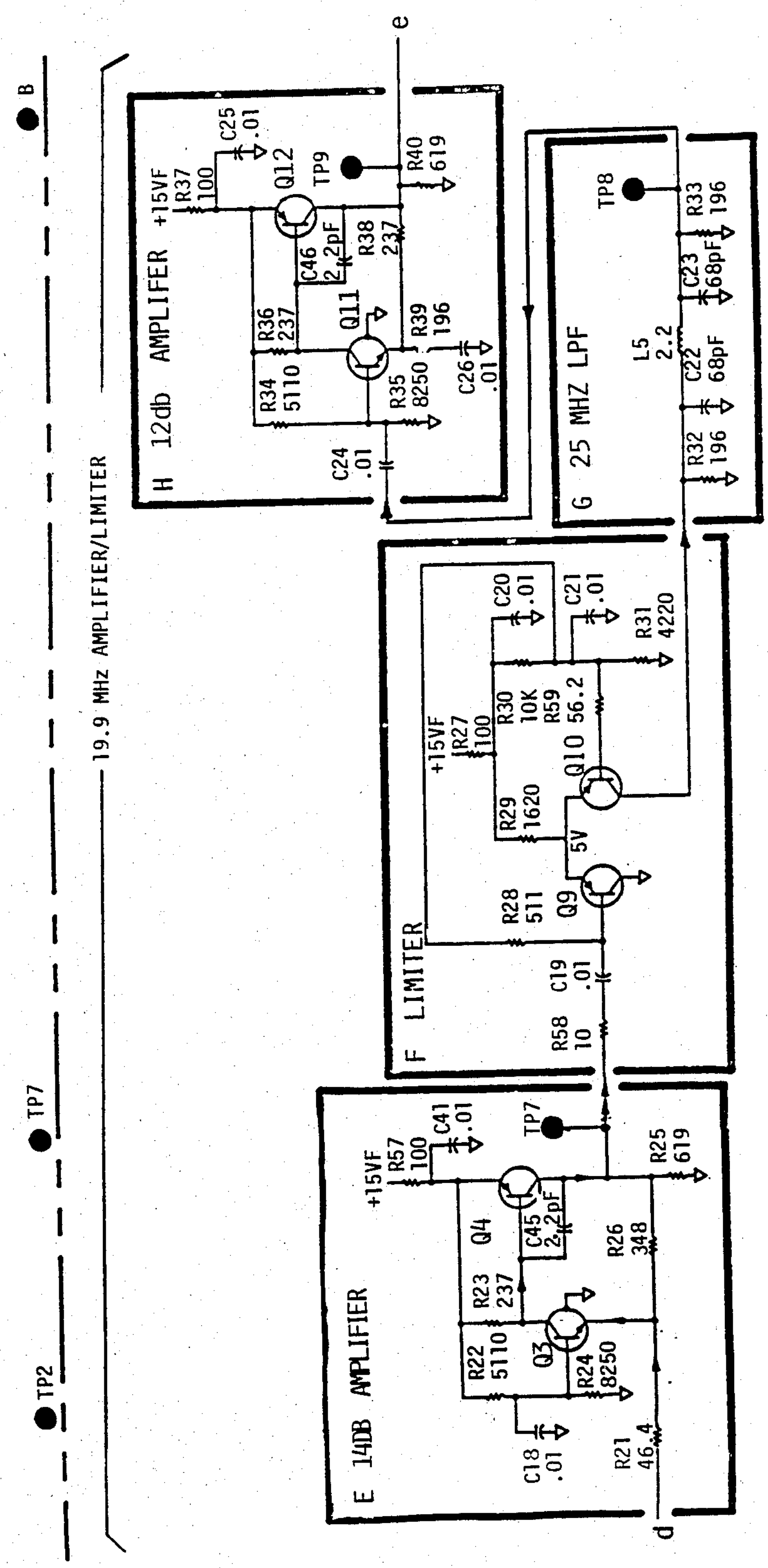
FIG 27.10

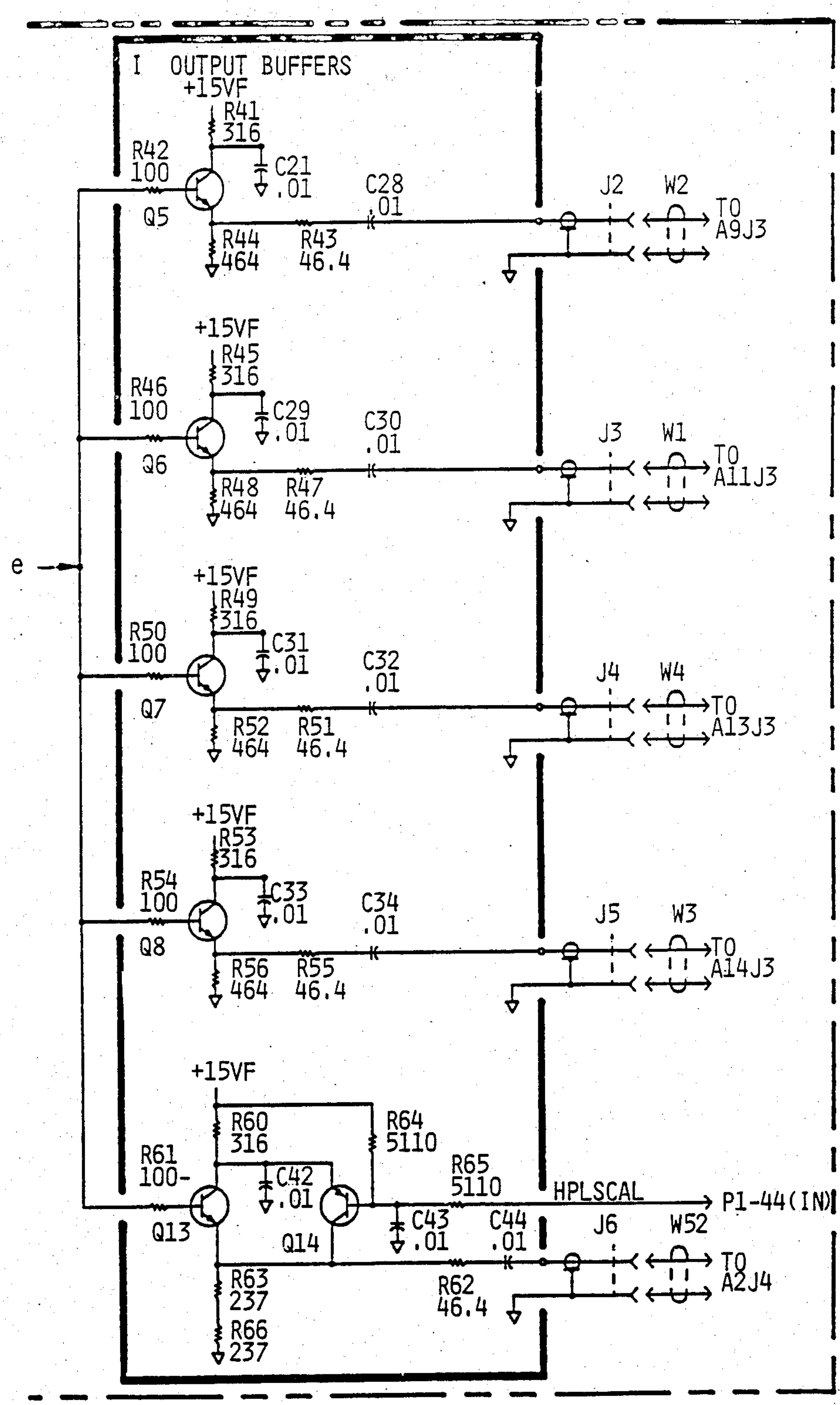
FIG 27.11

TP9 TP6 TP7 TP8 TP5
| ASSY | SIGNAL | FROM | CABLE DESIG | DESCRIPTION |
|---|---|---|---|---|
| A9 | B2IFIN | J1A3 | W31 | |
| A11 | B1IFIN | J1A2 | W30 | 1ST IF IN |
| A13 | A2IFIN | J1A4 | W32 | |
| A14 | A1IFIN | J1A1 | W36 | |
A9 B2 IF MIXER 85102-60009
A11 B1 IF MIXER 85102-60011
A13 A2 IF MIXER 85102-60013
A14 A1 IF MIXER 85102-60014
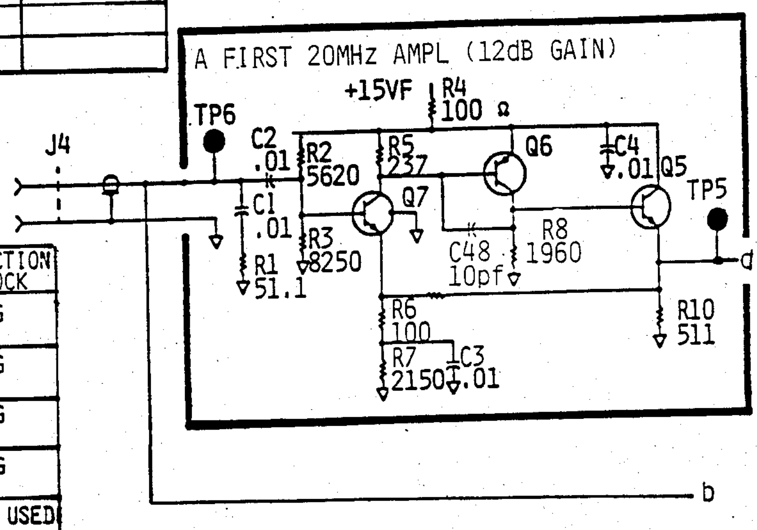
| PIN | SIGNAL | TO/FROM | FUNCTION BLOCK |
|---|---|---|---|
| 1 23 | GND | GND BUS | G |
| 2 24 | GND | GND BUS | G |
| 3 25 | GND | GND BUS | G |
| 4 26 | GND | GND BUS | G |
| 5 27 | | | NOT USED |
| 6 28 | | | NOT USED |
| 7 29 | | | |
| 8 30 | | | |
| 9 31 | | | |
| 10 32 | +15V REG | +15V BUS | G |
| 11 33 | GND | GND BUS | G |
| 12 34 | GND | GND BUS | G |
| 13 35 | -15V REG | -15V. BUS | G |
| 14 36 | | | |
| 15 37 | | | |
| 16 38 | | | |
| 17 39 | | | |
| 18 40 | | | |
| 19 41 | GND | GND BUS | G |
| 20 42 | GND | GND BUS | G |
| 21 43 | GND | GND BUS | G |
| 22 44 | GND | GND BUS | G |
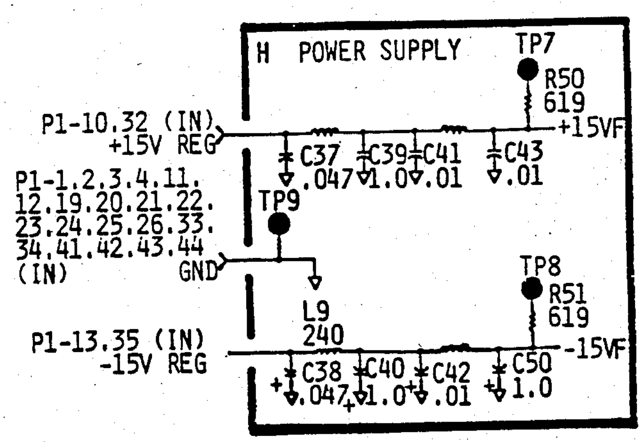
FIG 27.13

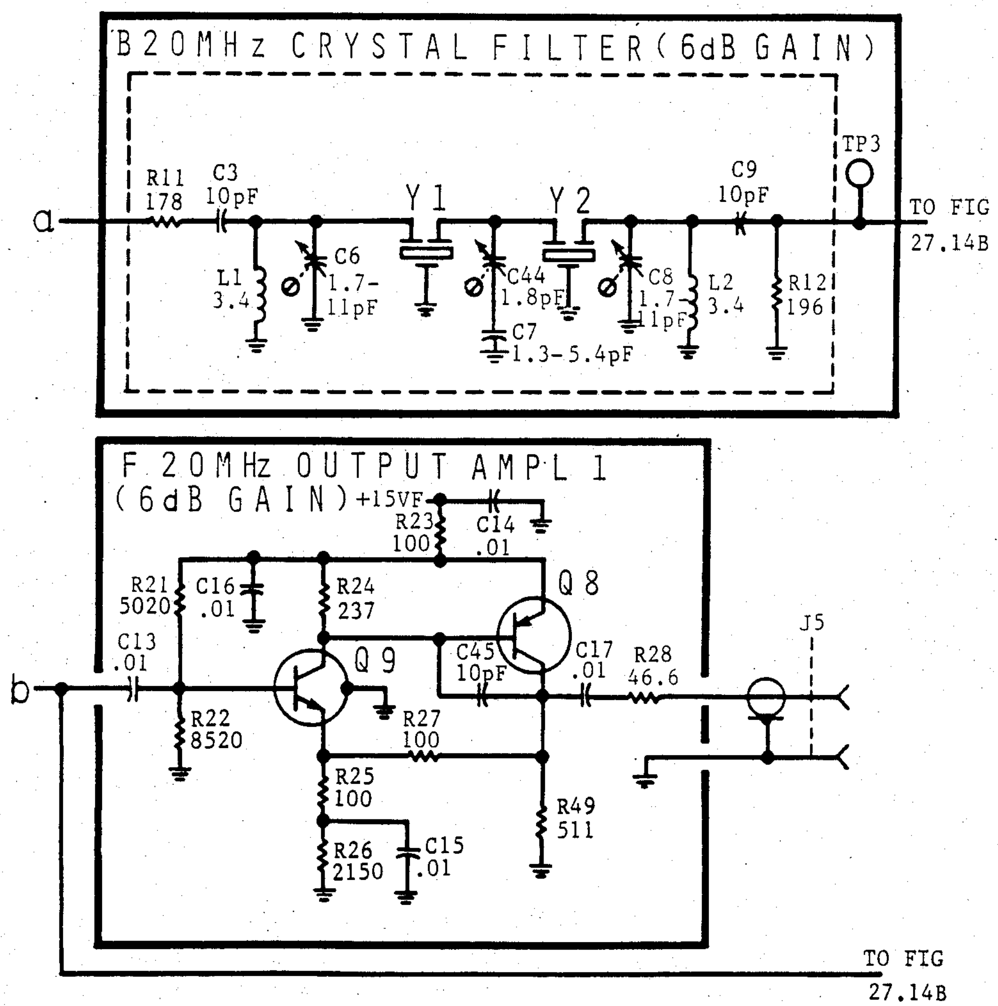
| ASSY. | SIGNAL | TO | CABLE DESIG | DESCRIPTION |
|---|---|---|---|---|
| A9 | PLIFB2 | A2J3 | W41 | 1ST IF OUT |
| A11 | PLIFB1 | A2J1 | W40 | |
| A13 | PLIFA2 | A2J5 | W45 | |
| A14 | PLIFA1 | A2J7 | W45 | |
FIG 27.14A

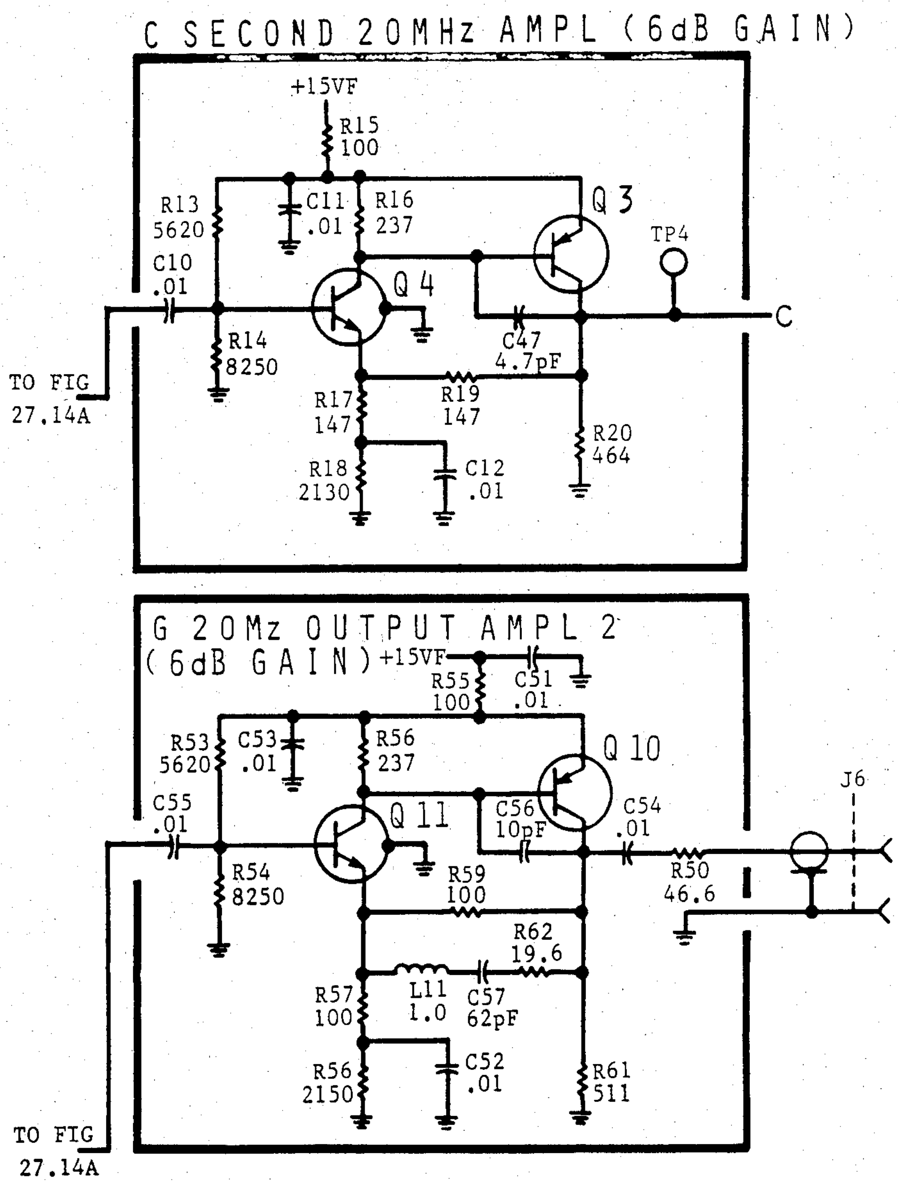
| ASSY | SIGNAL | TO | CABLE DESIG | DESCRIPTION |
|---|---|---|---|---|
| A9 | | N.C. | | 1ST IF OUT |
| A11 | | N.C. | | |
| A13 | IFCNTRA2 | A21J2 | W37 | |
| A14 | IFCNTRA1 | A21J1 | W18 | |
FIG 27.14 B

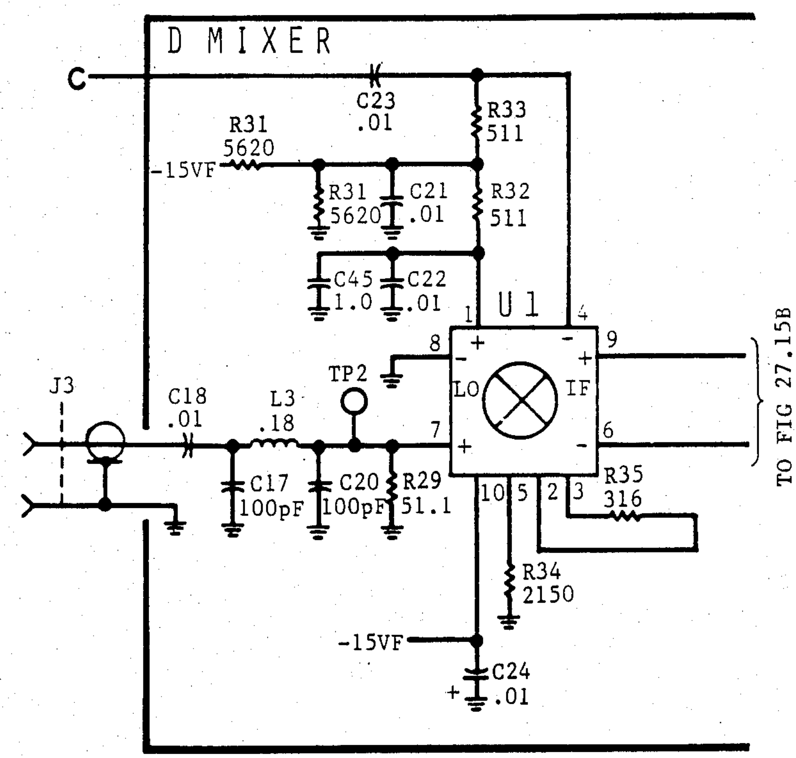
| ASSY | SIGNAL | FROM | CABLE DESIG | DESCRIPTION |
|---|---|---|---|---|
| A9 | B2LO | ABJ2 | W2 | LO IN |
| A11 | B1LO | ABJ3 | W1 | |
| A13 | A2LO | ABJ4 | W4 | |
| A14 | A1LO | ABJ5 | W3 | |
FIG 27.15A

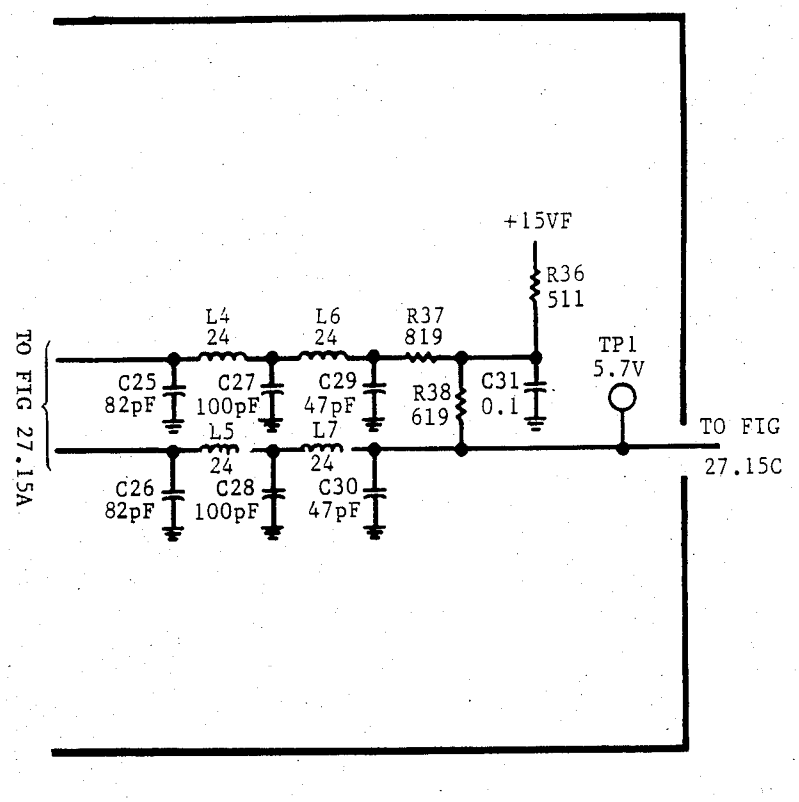
FIG 27.15B

| ASSY | SIGNAL | TO | CABLE DESIG | DESCRIPTION |
|---|---|---|---|---|
| A9 | B2IF | A10J3 | W9 | 100KHz IF OUT |
| A11 | B1IF | A12J4 | W12 | |
| A13 | A2IF | A10J2 | W10 | |
| A14 | A1IF | A12J3 | W13 | |
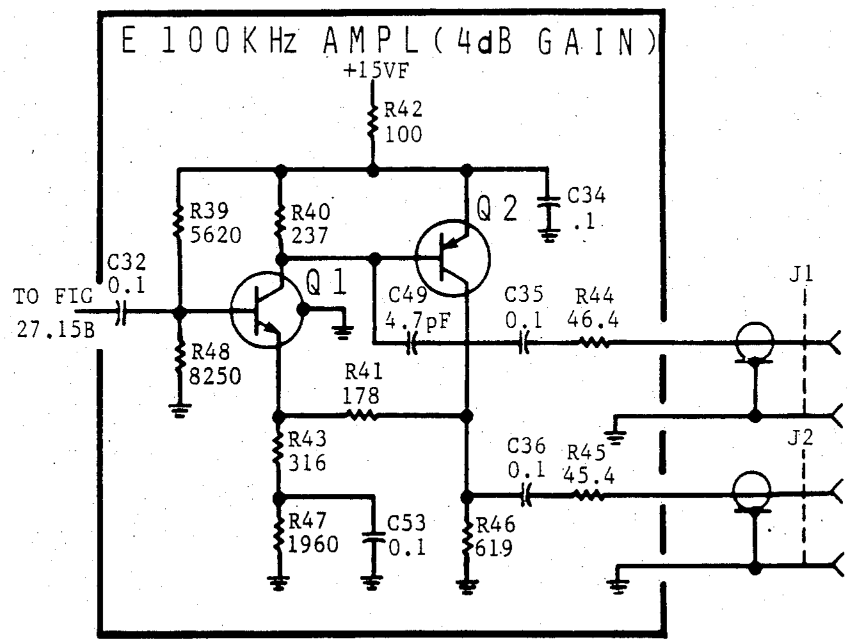
| ASSY | SIGNAL | TO | CABLE DESIG | DESCRIPTION |
|---|---|---|---|---|
| A9 | | N.C. | | 100KHz IF OUT |
| A11 | B1IF | A10J4 | W8 | |
| A13 | A2IF | A12J2 | W14 | |
| A14 | | N.C. | | |
FIG 27.15C FIG 27.16
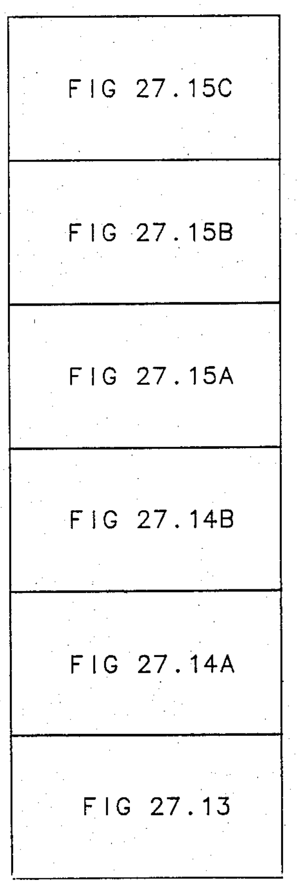
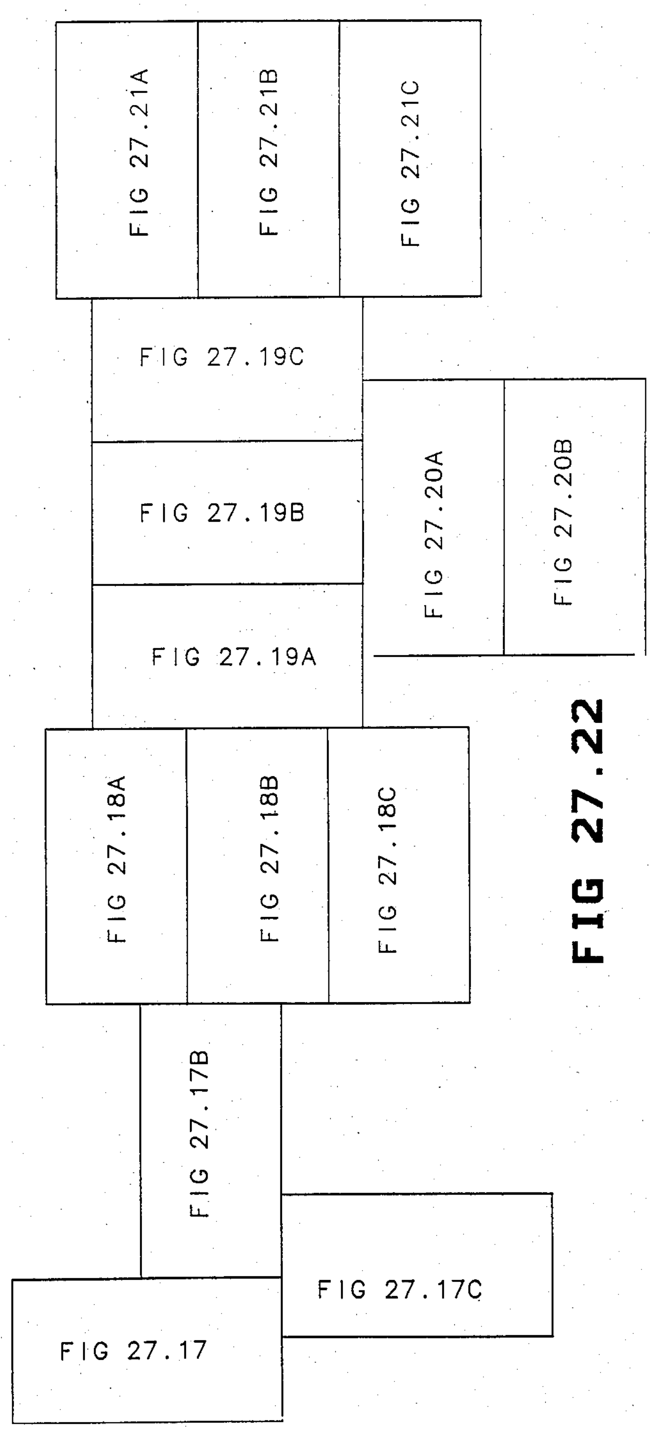
FIG 27.22

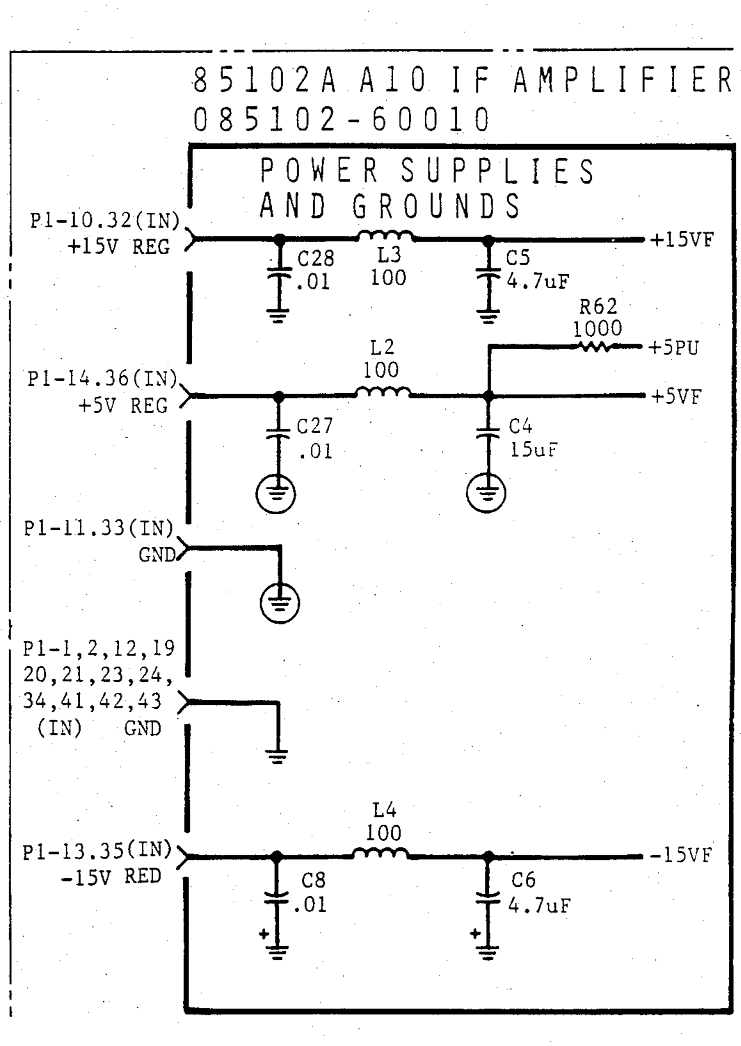
FIG 27.17A

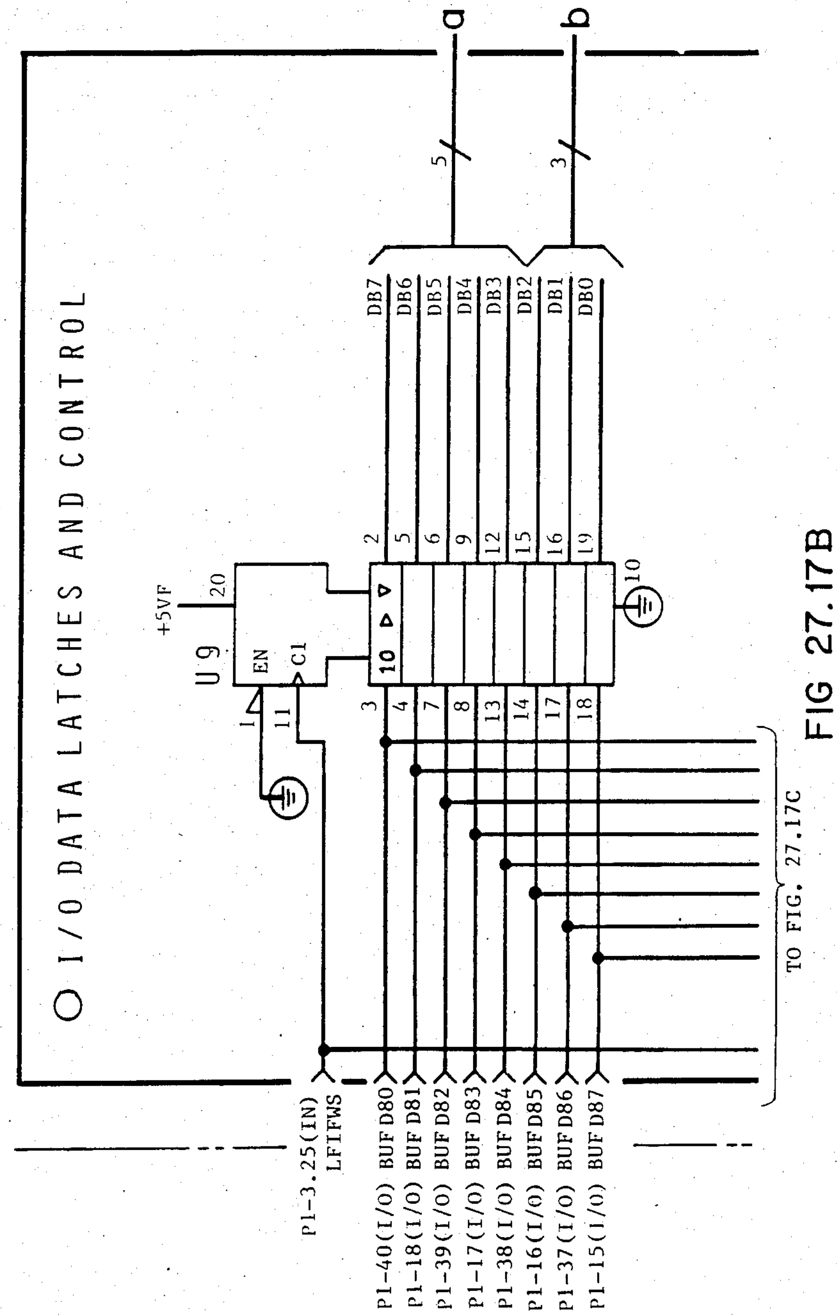
FIG 27.17B

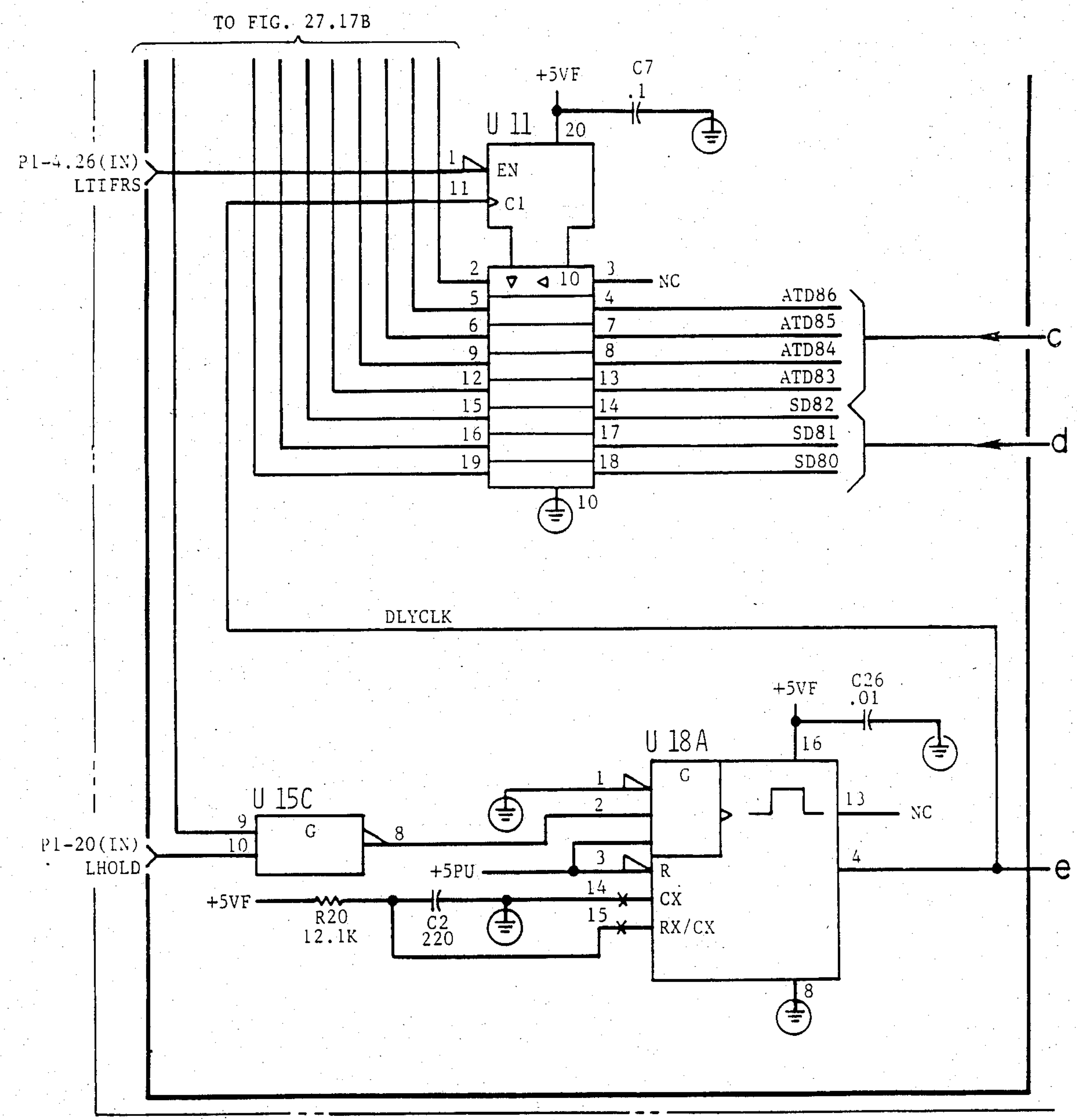
FIG 27.17C

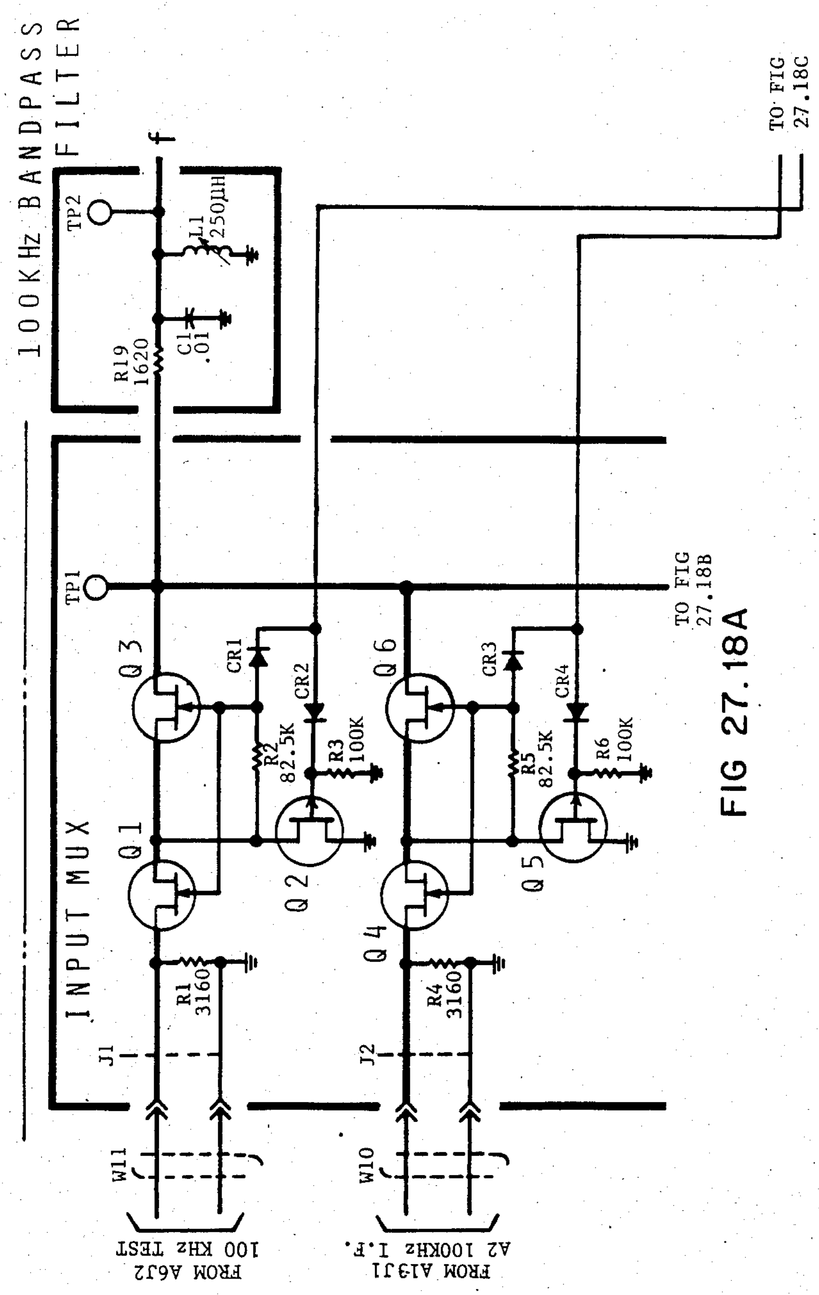
FIG 27.18A

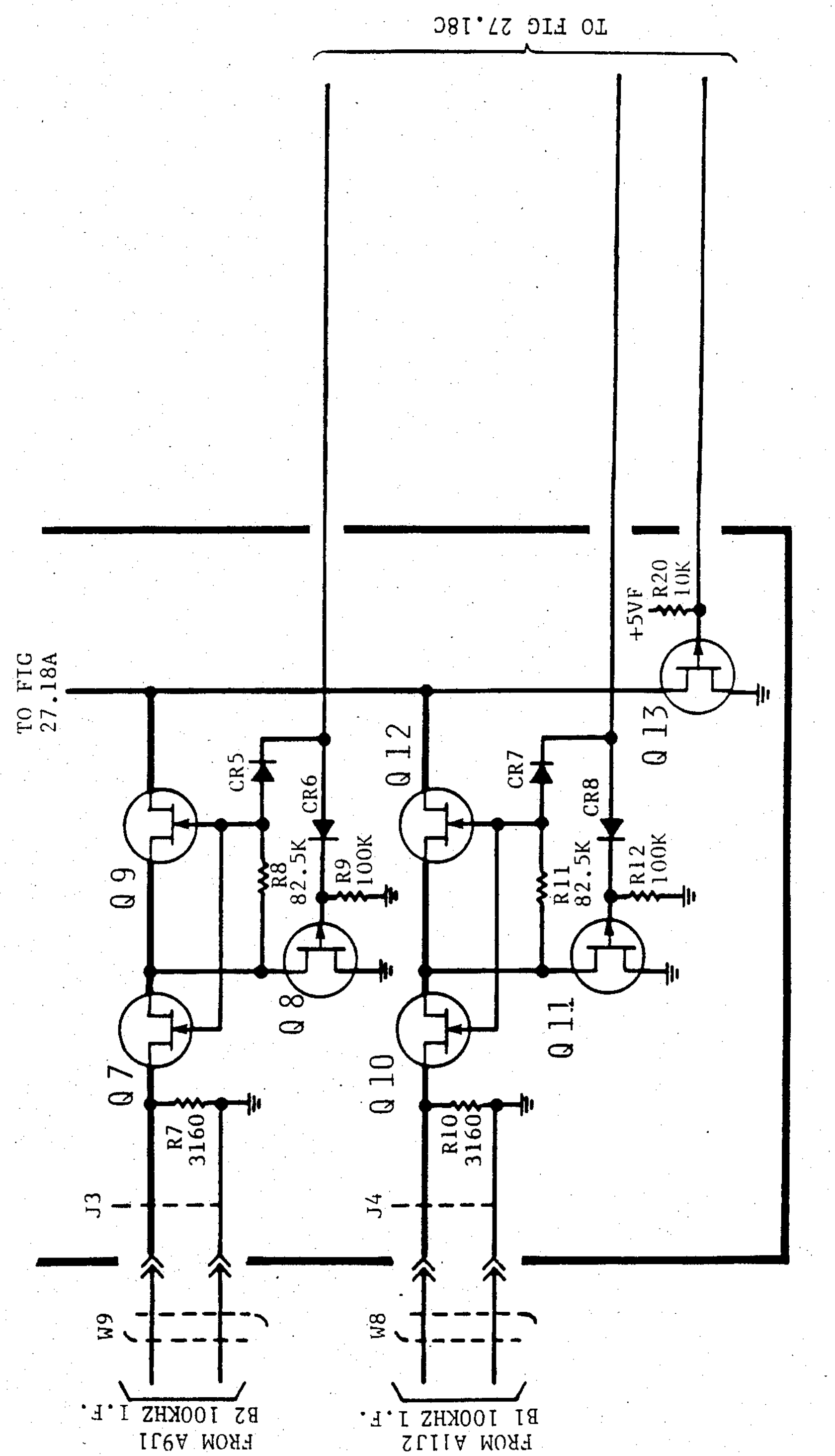
FIG 27.18B

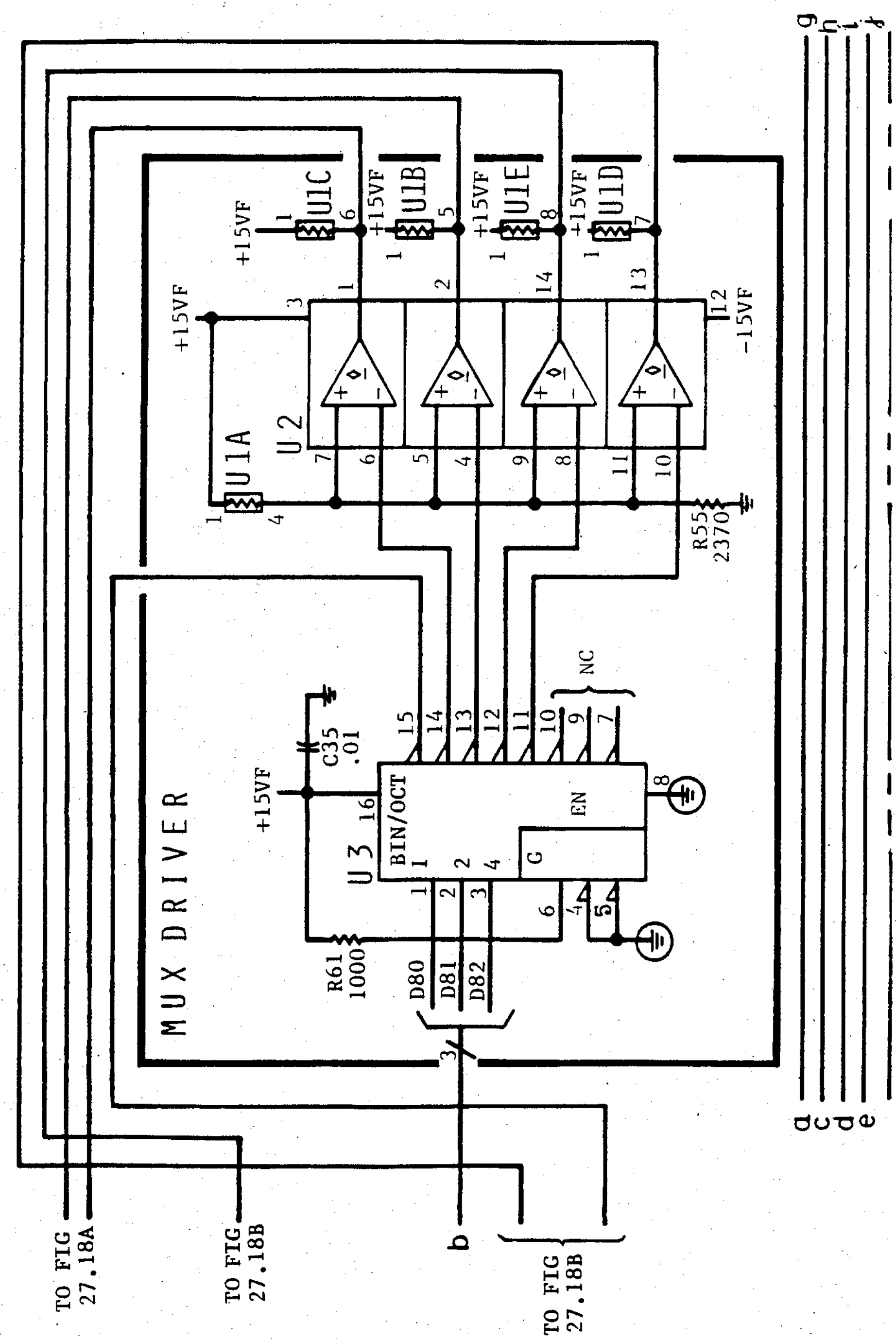
FIG 27.18C

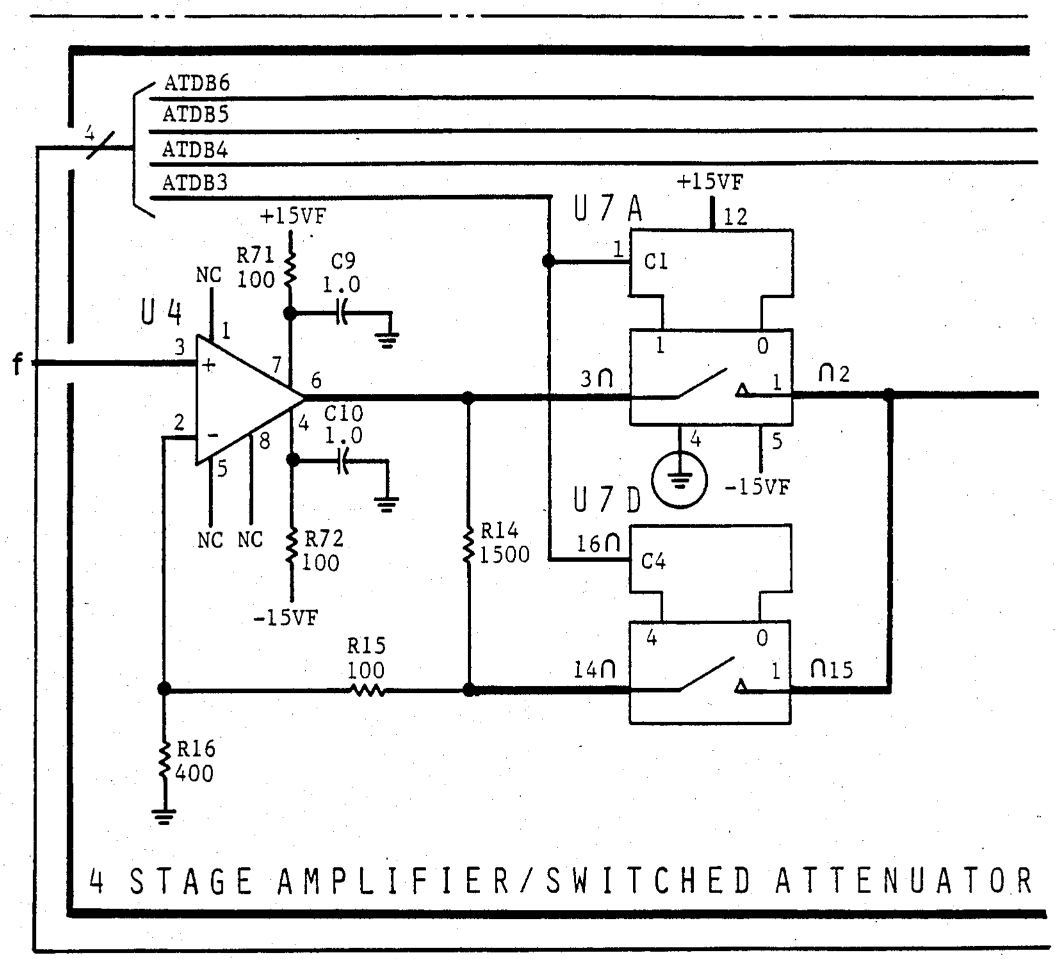
FIG 27.19A

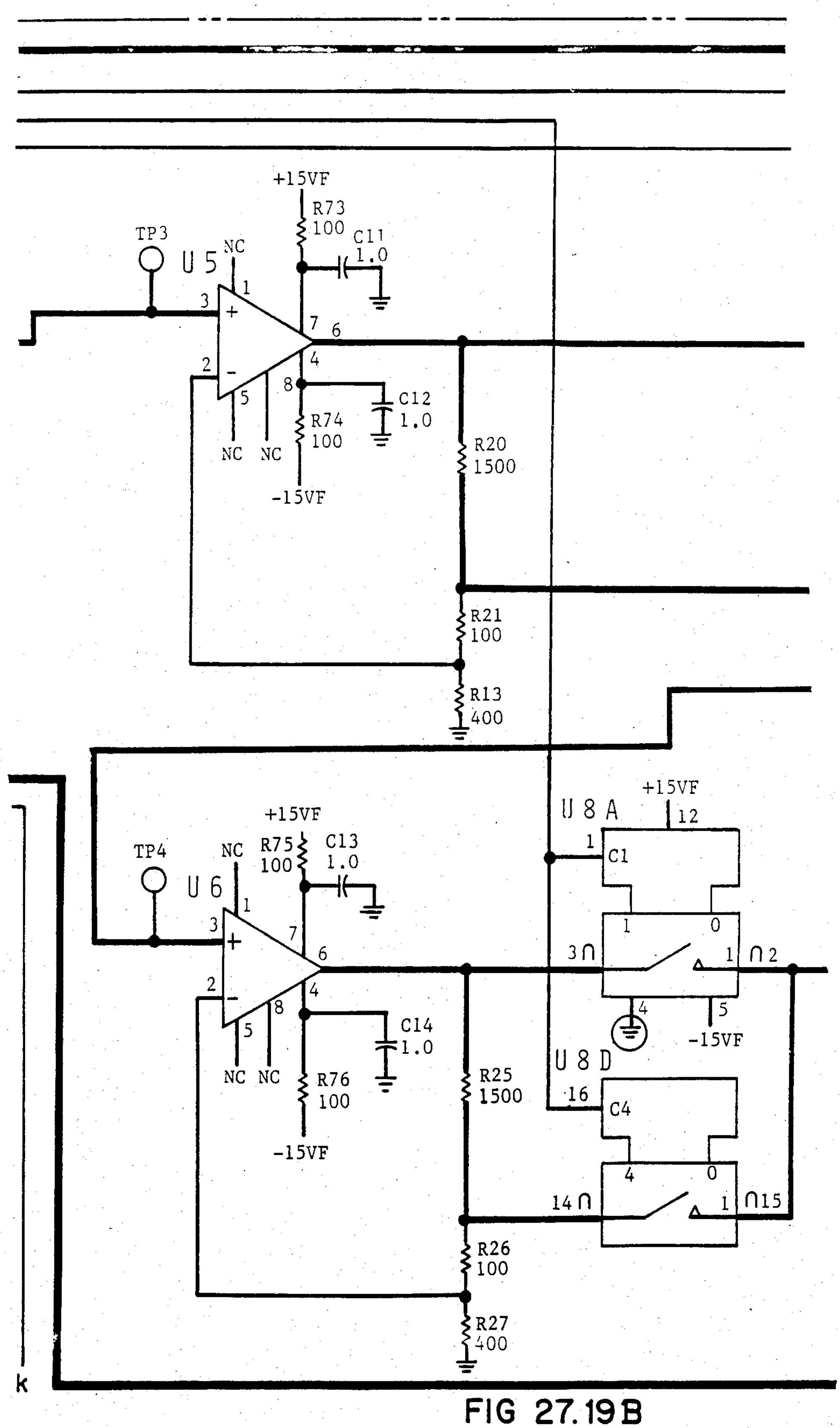
FIG 27.19B

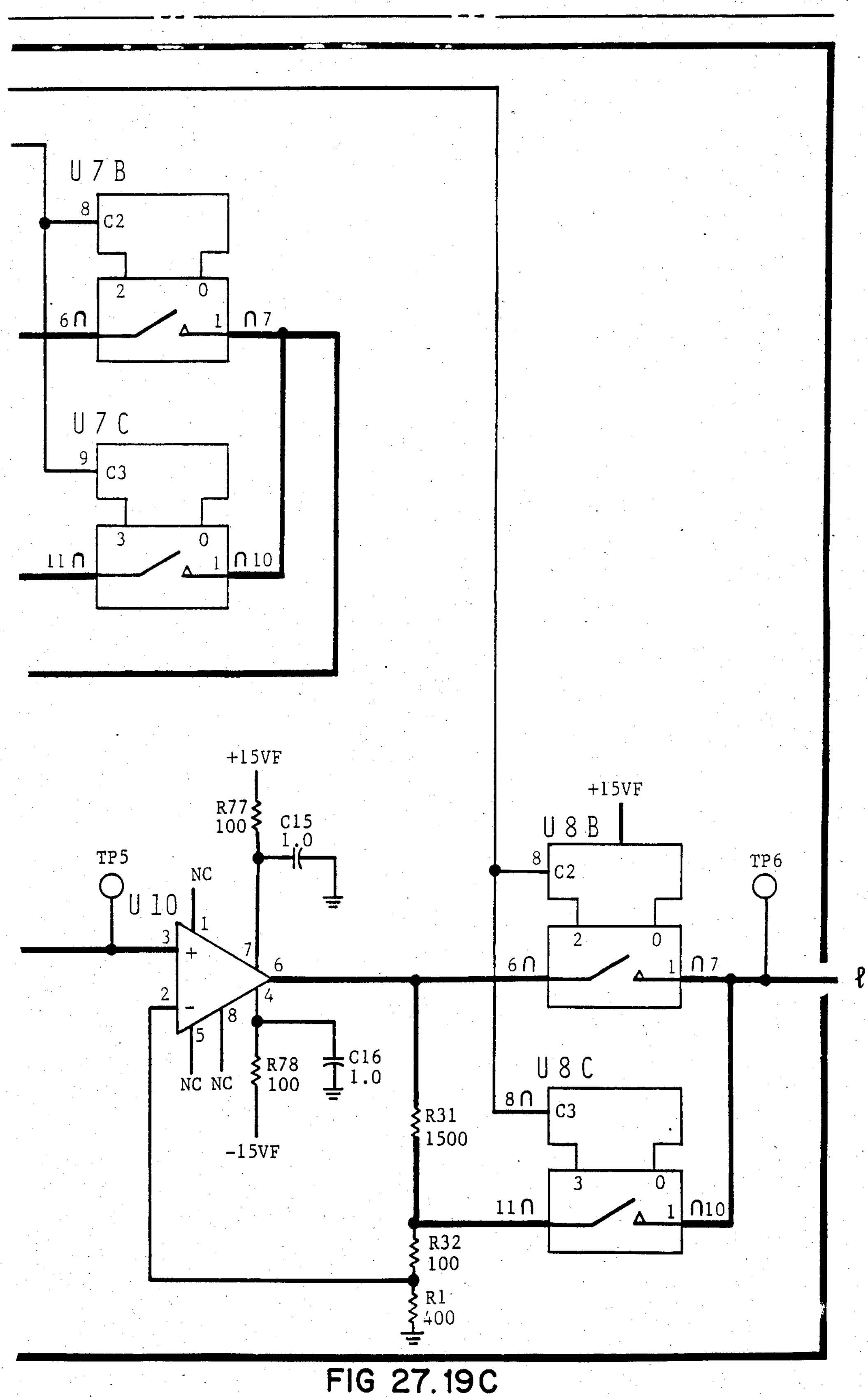
FIG 27.19C

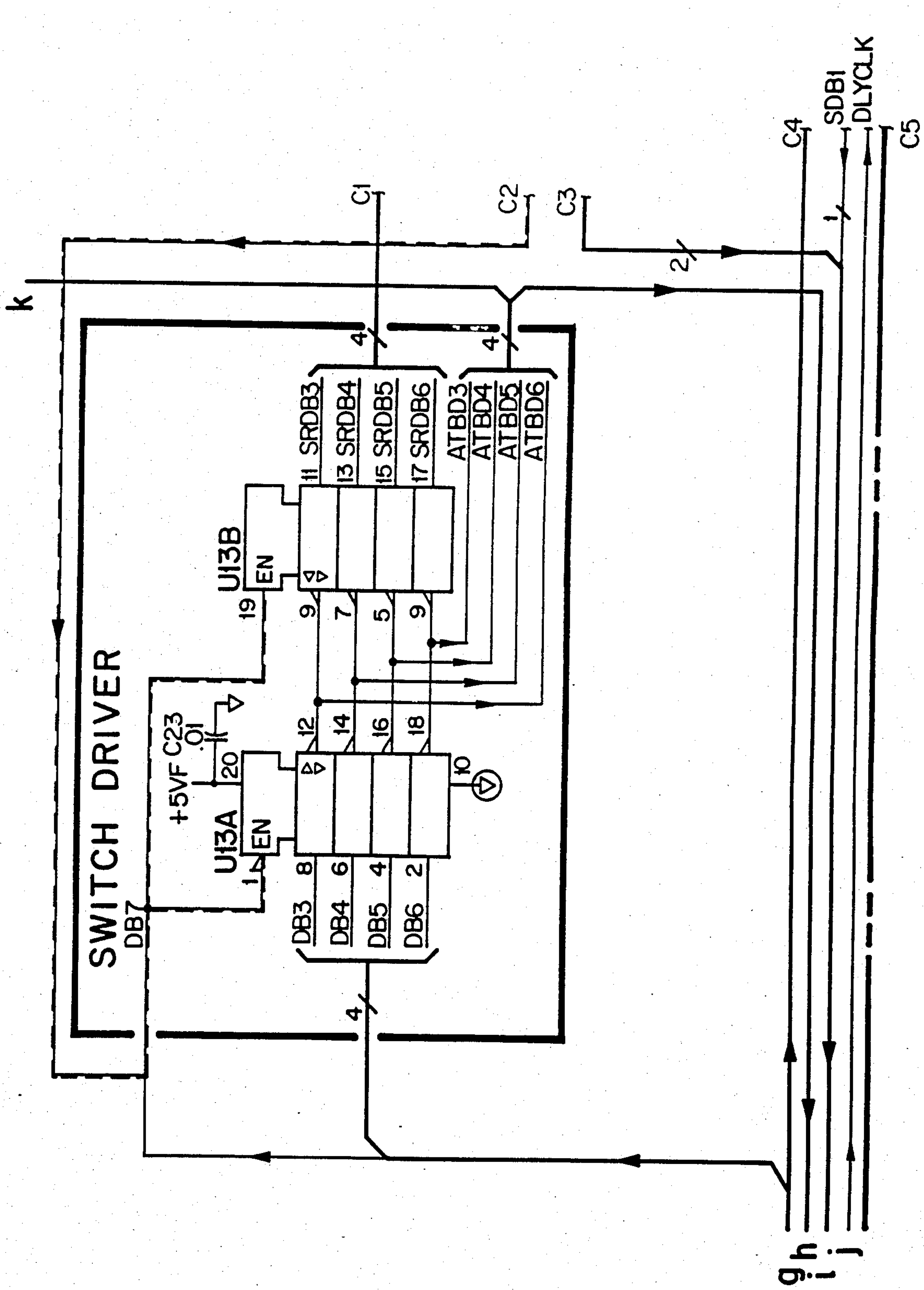
FIG 27.20A

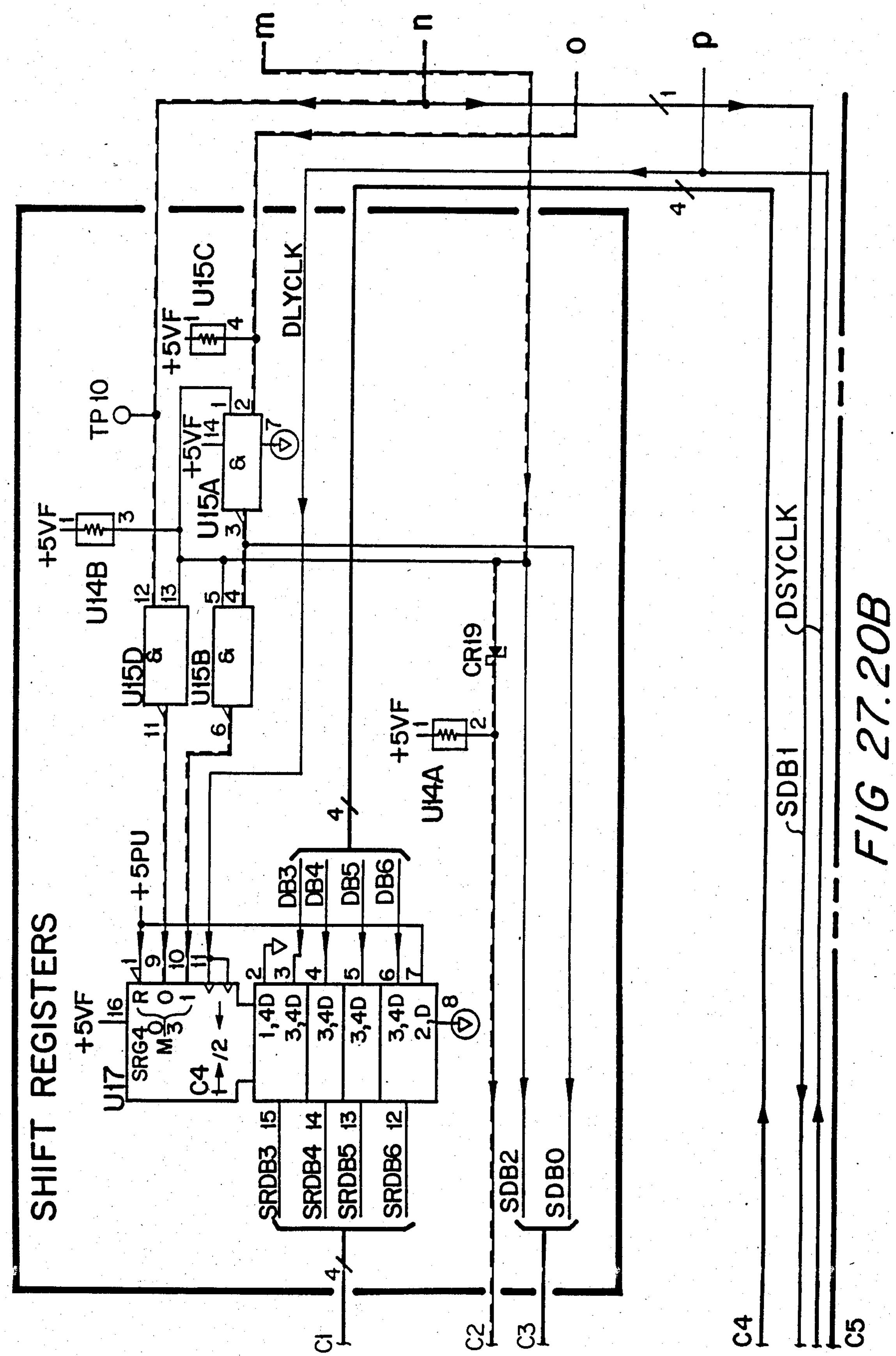
FIG 27.20B

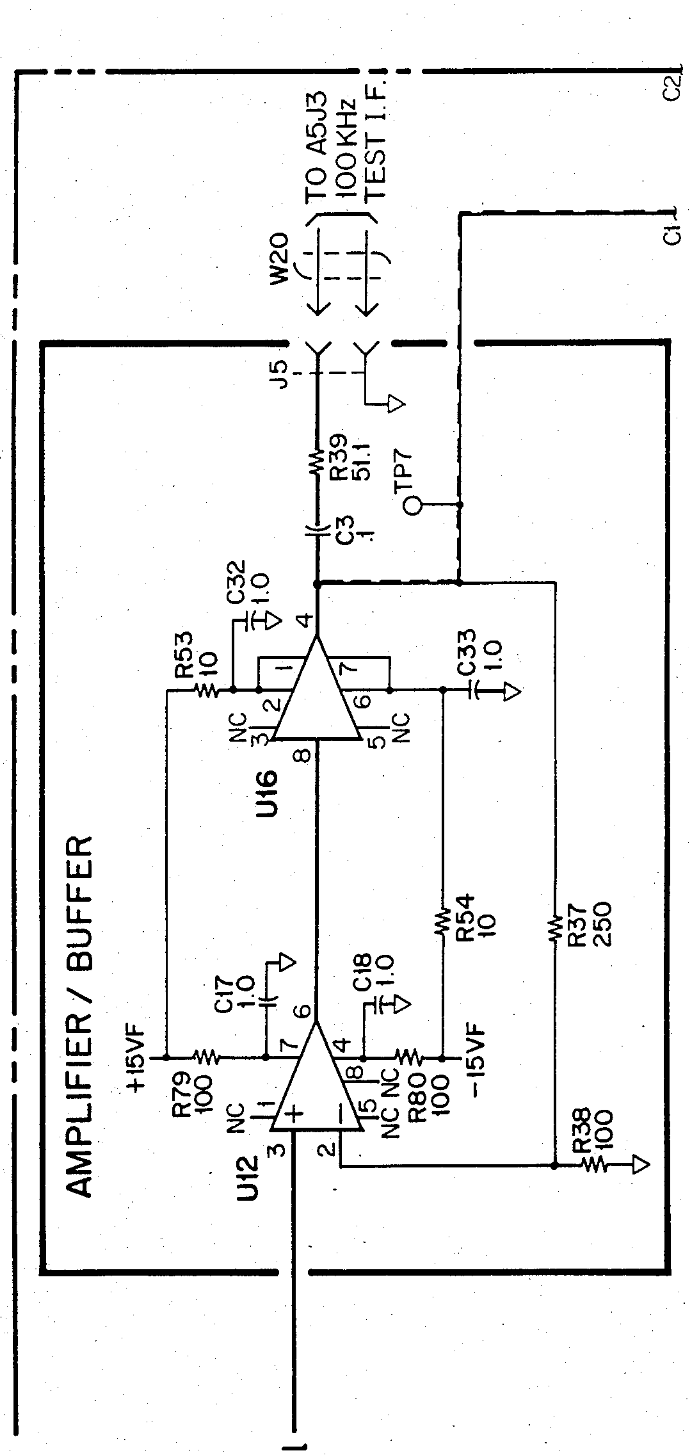
FIG 27.21A

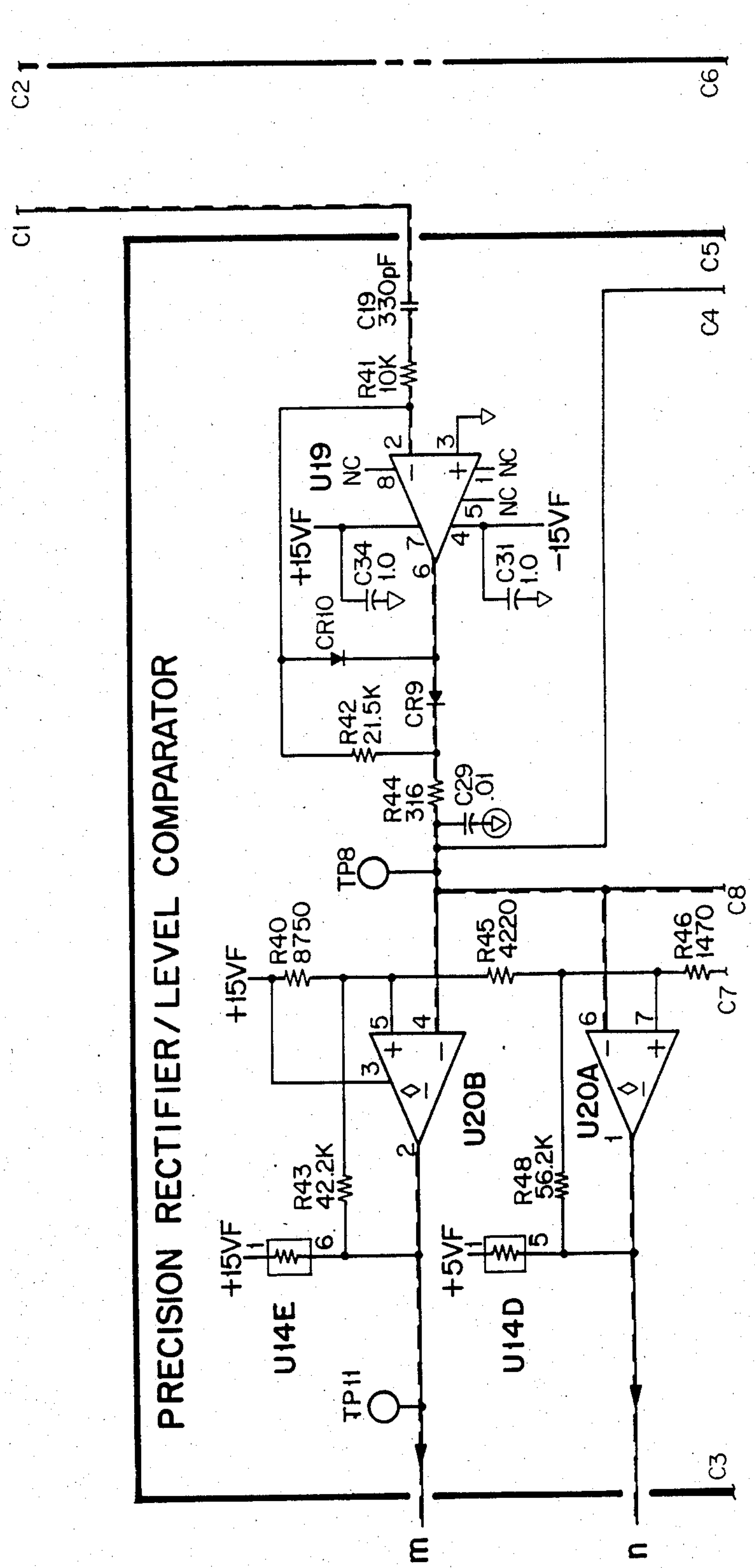
FIG 27.21B

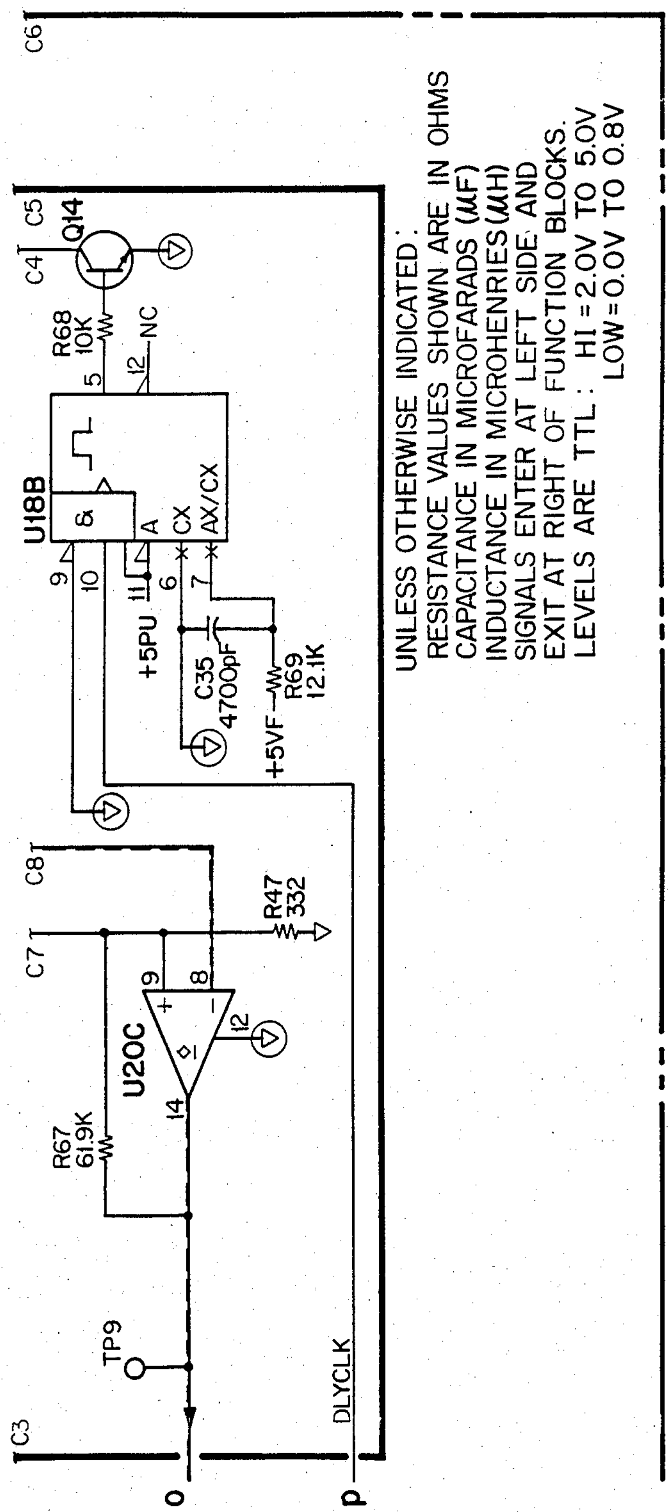
FIG 27.21C

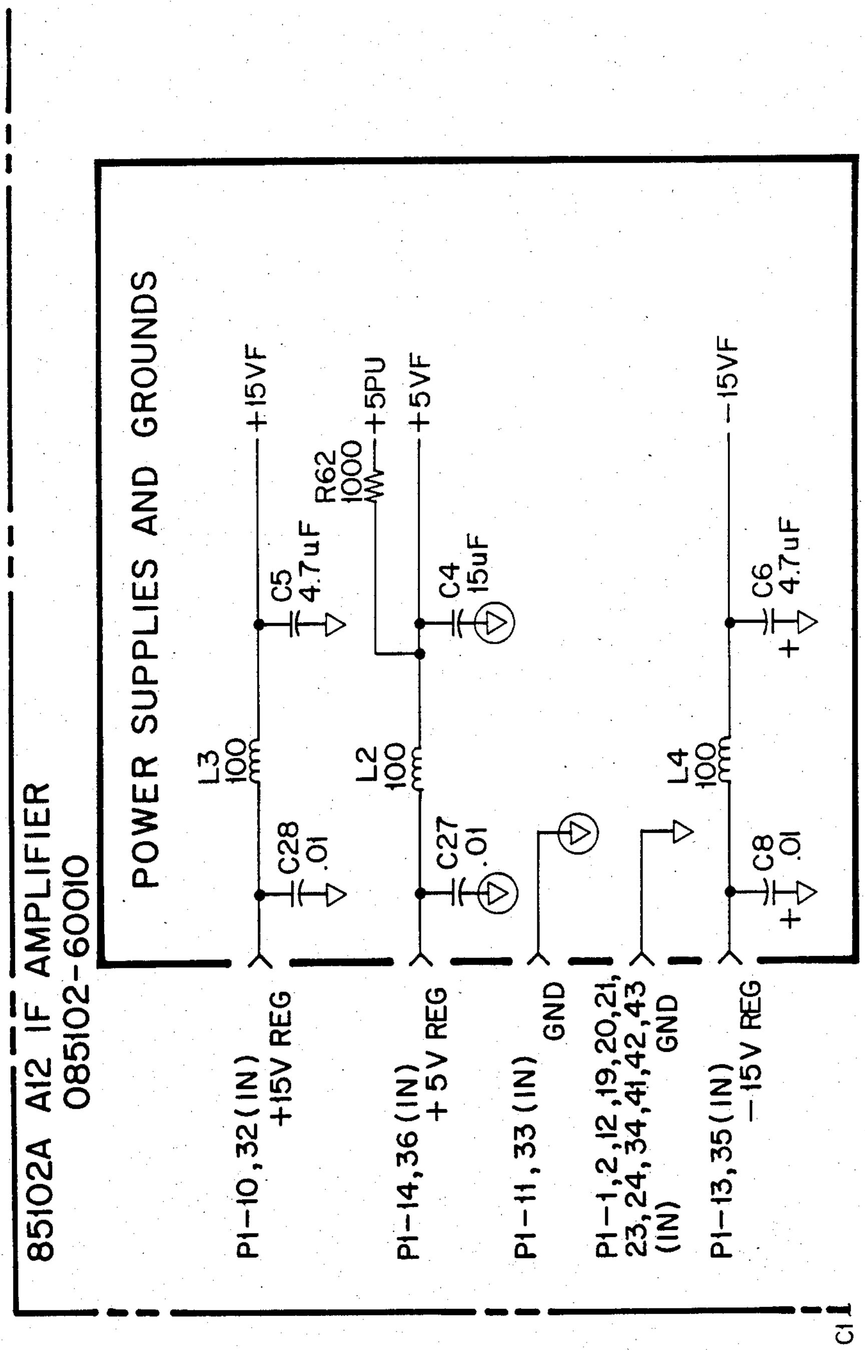
FIG 27.23A

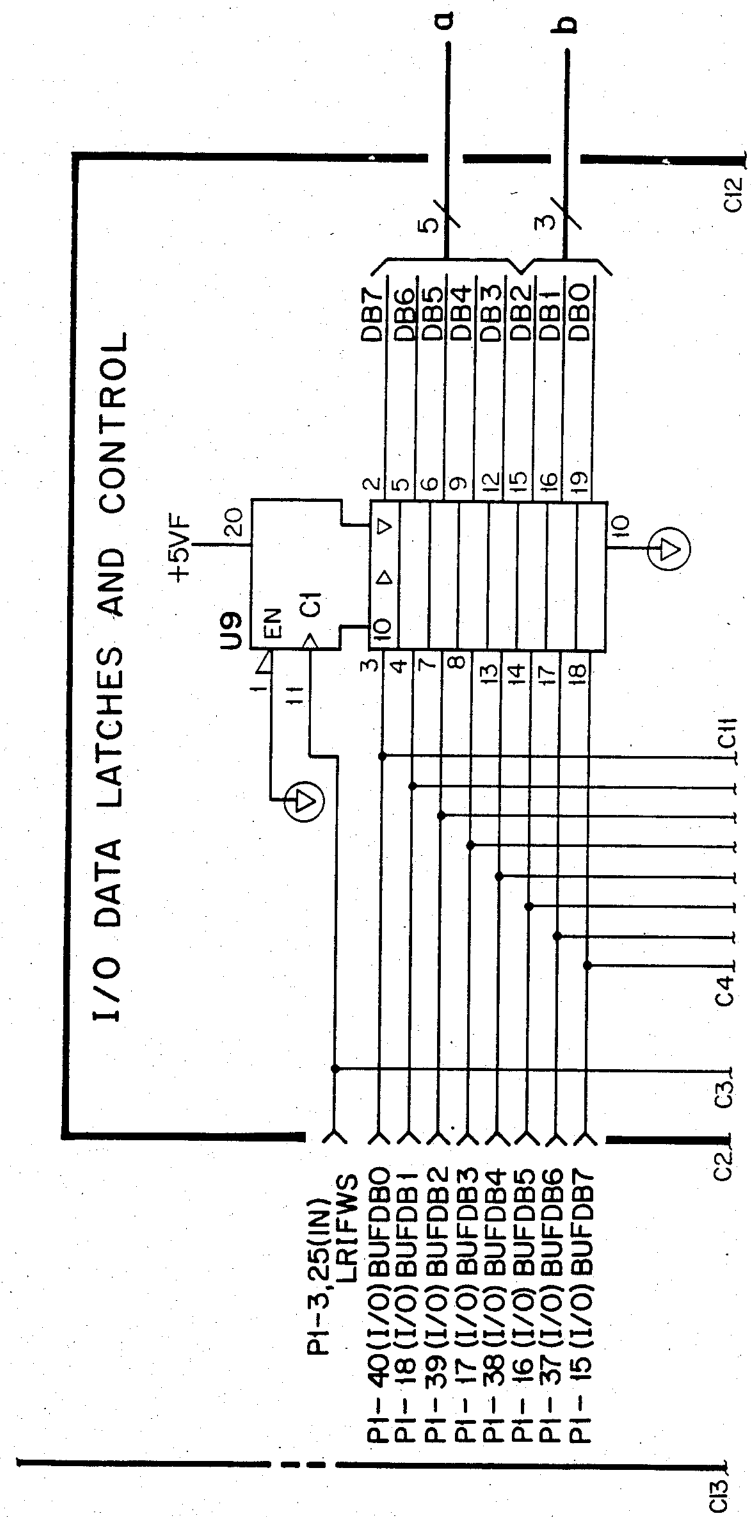
FIG 27.23B

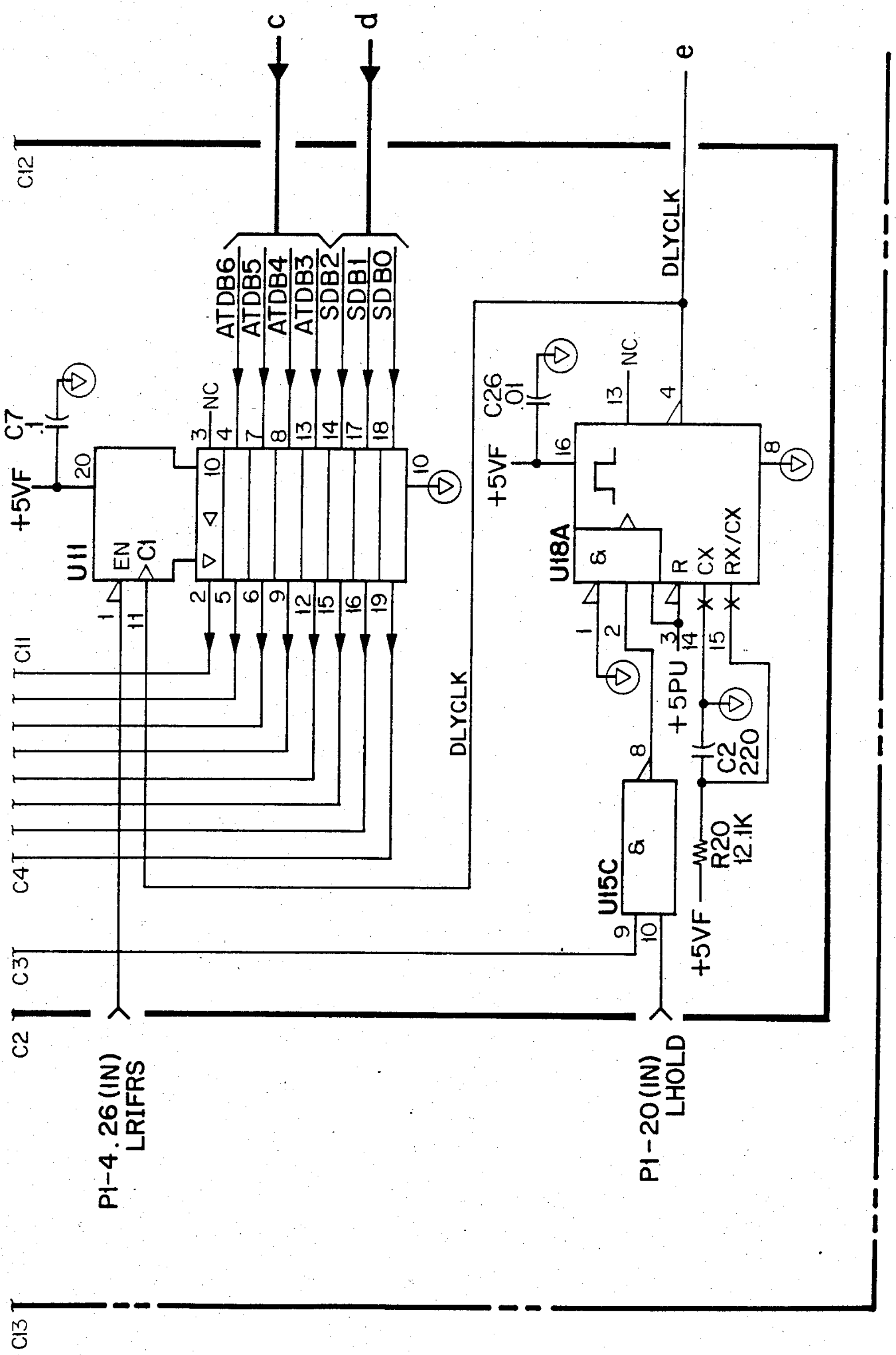
FIG 27.23C

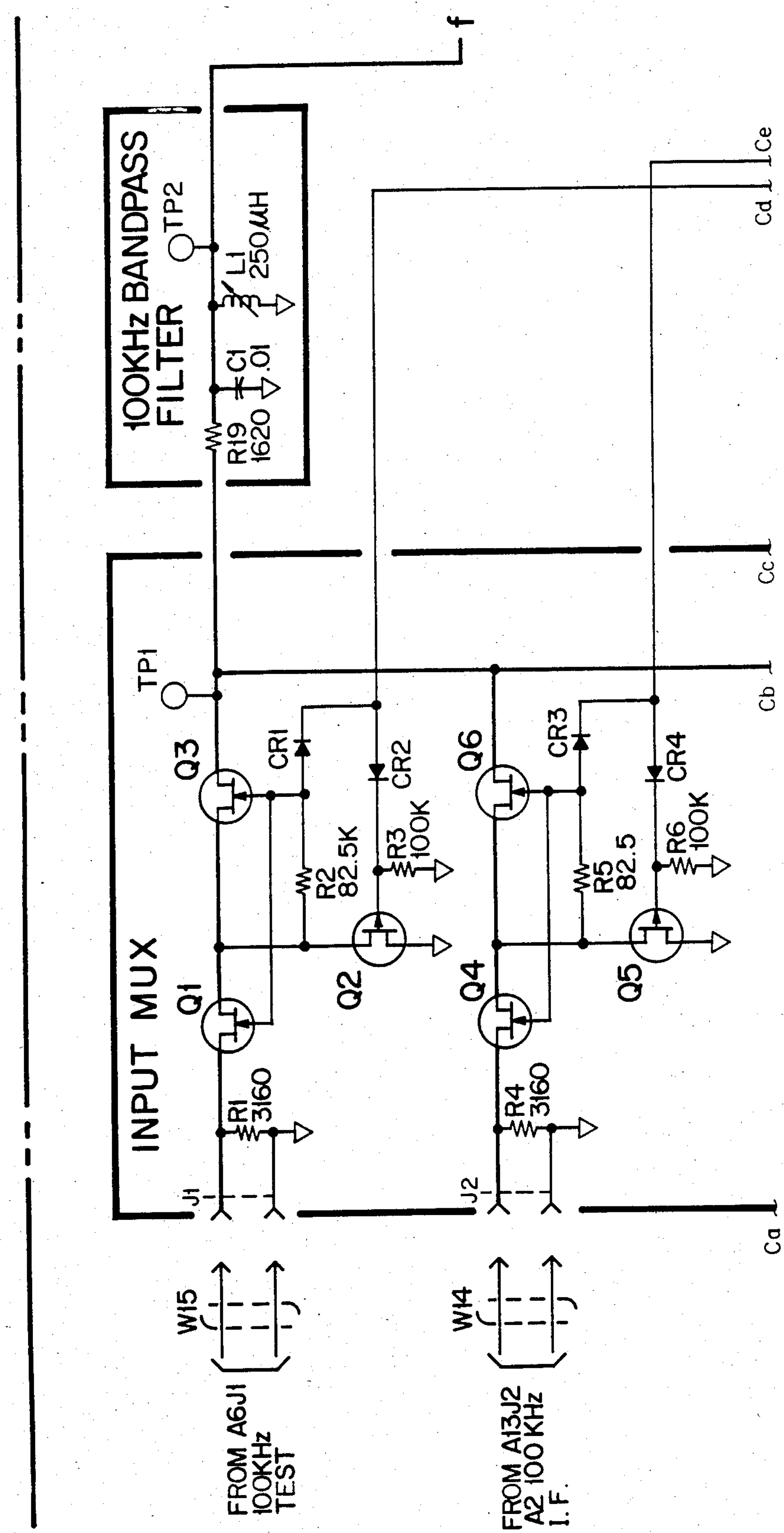
FIG 27.24A

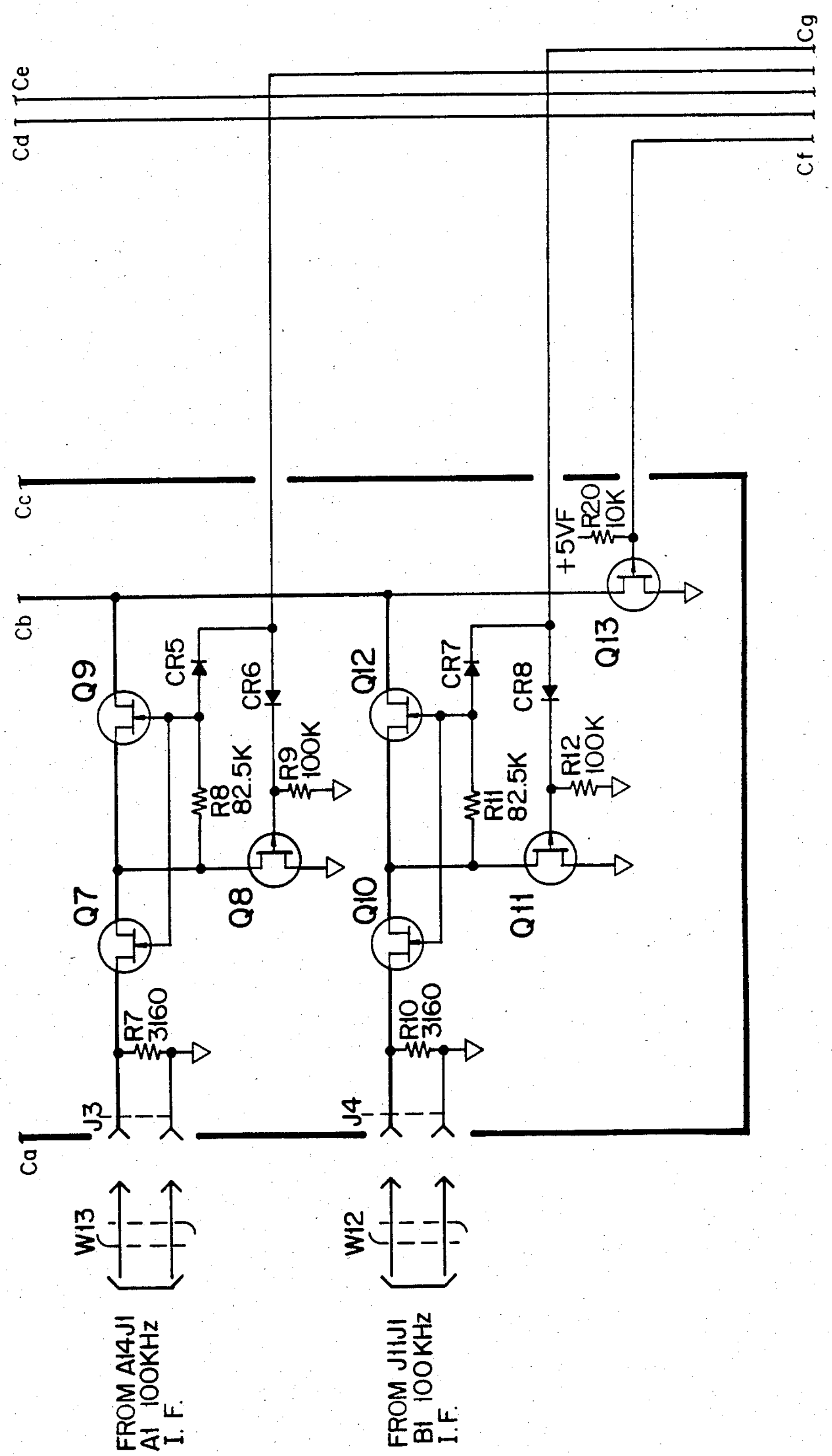
FIG 27.24B

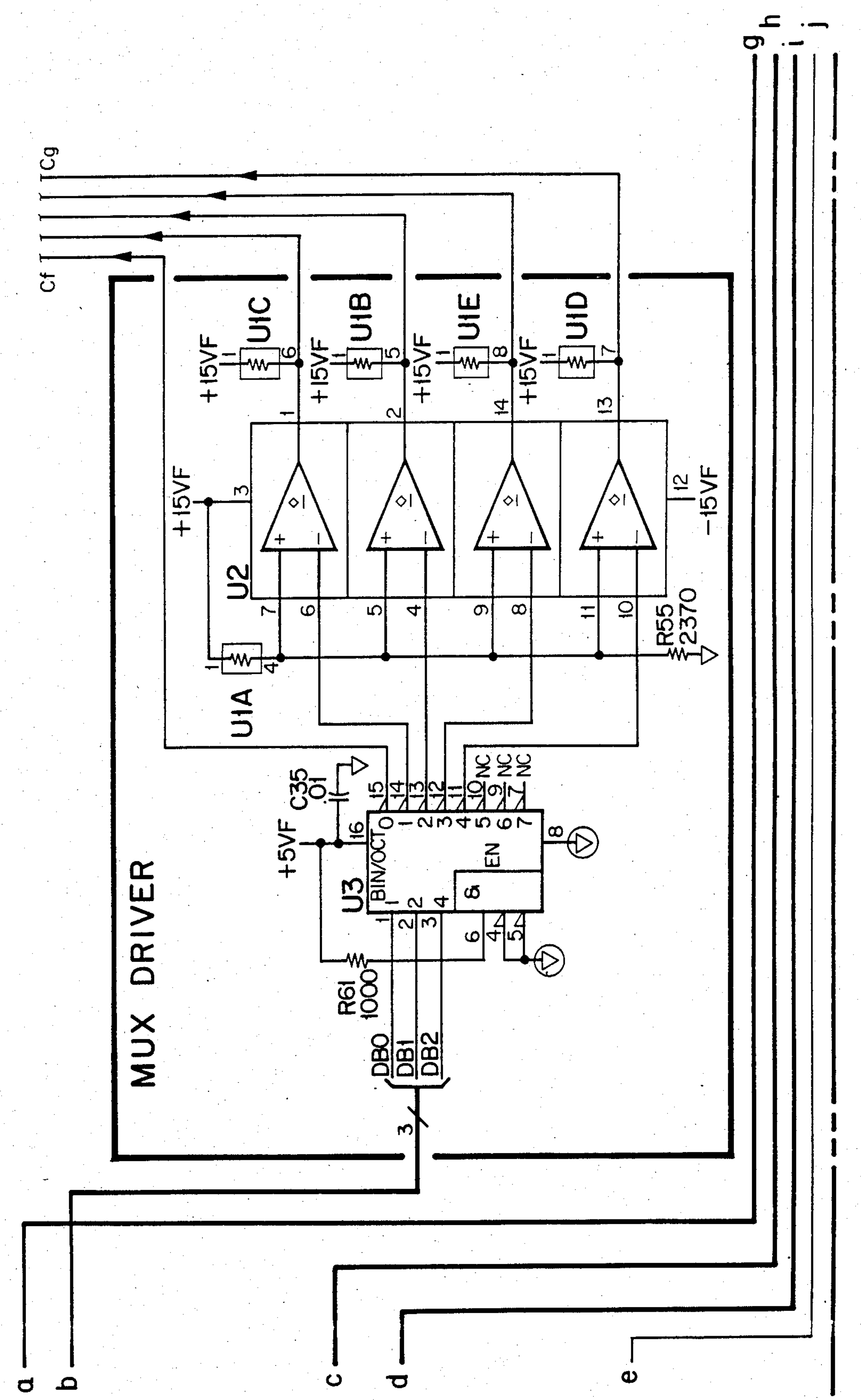
FIG 27.24C

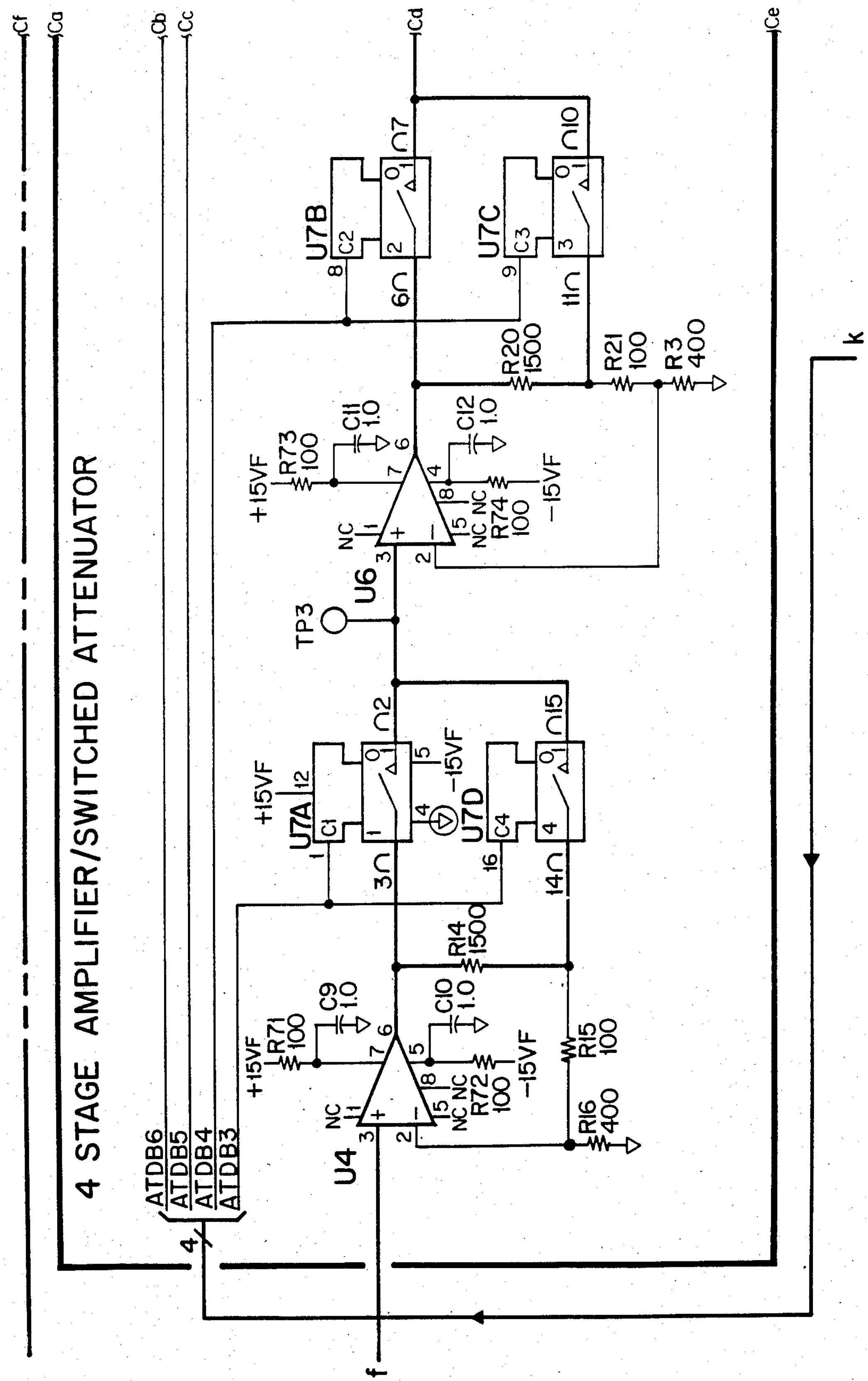
FIG 27.25A

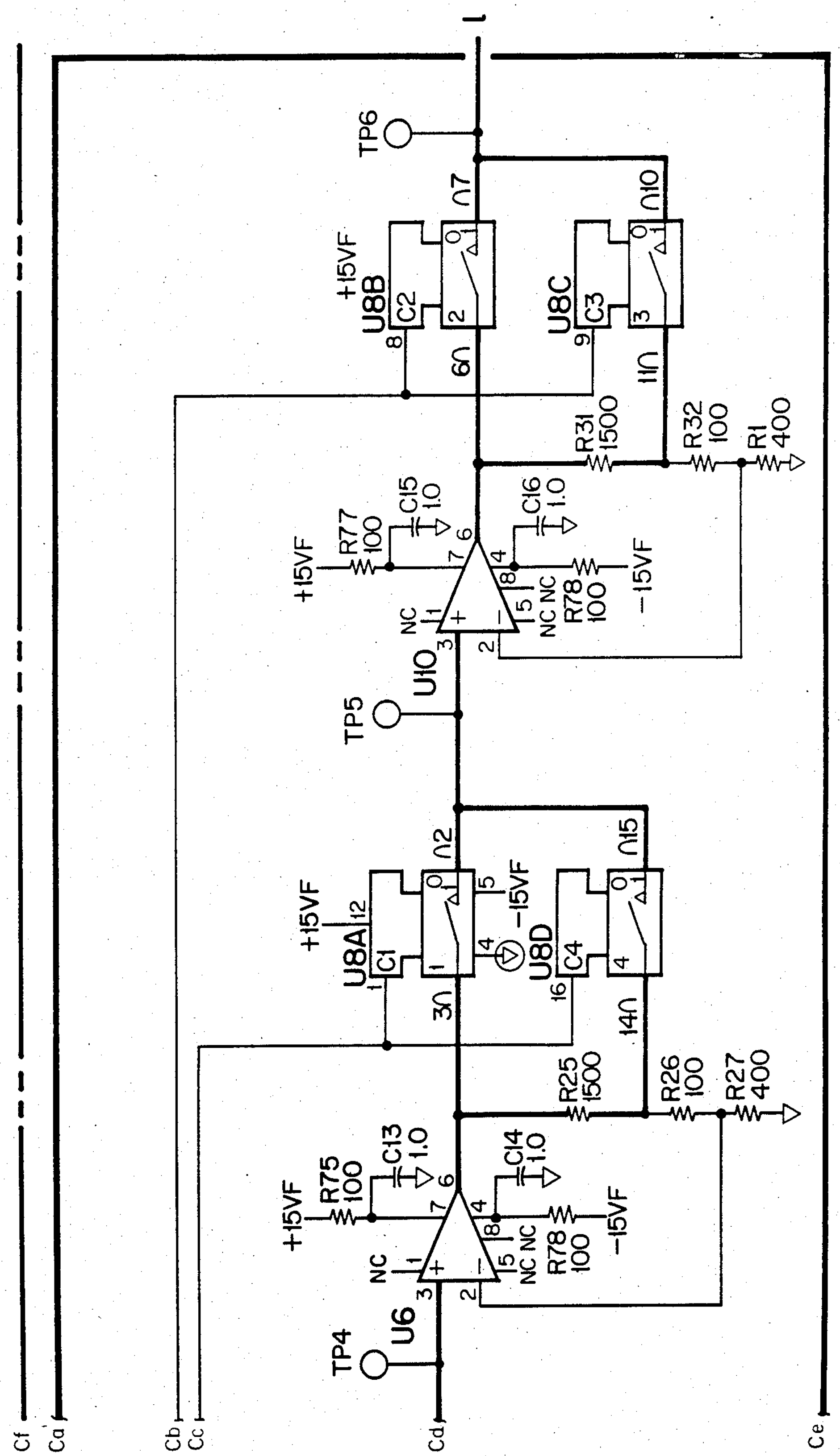
FIG 27.25B

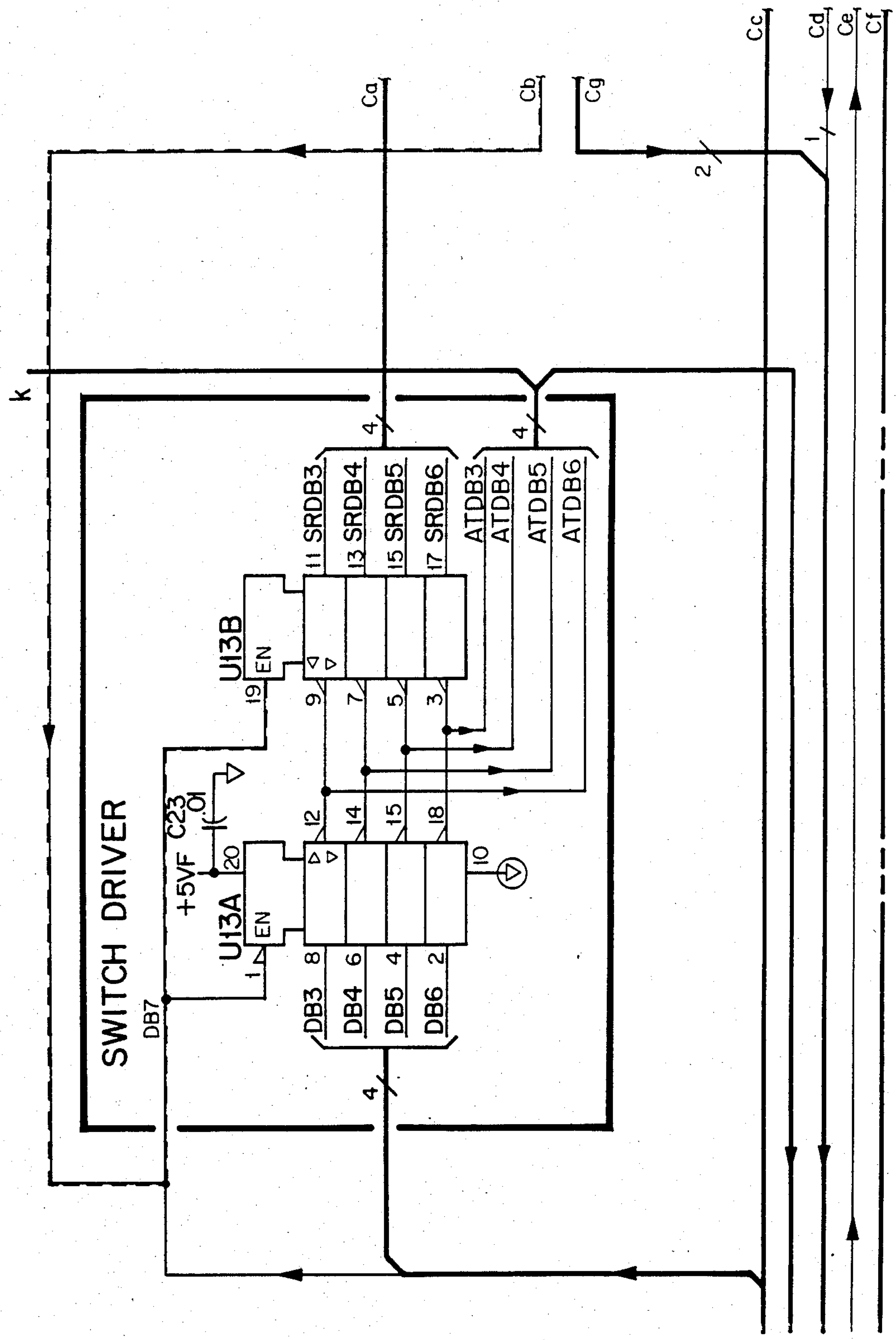
FIG 27.26A

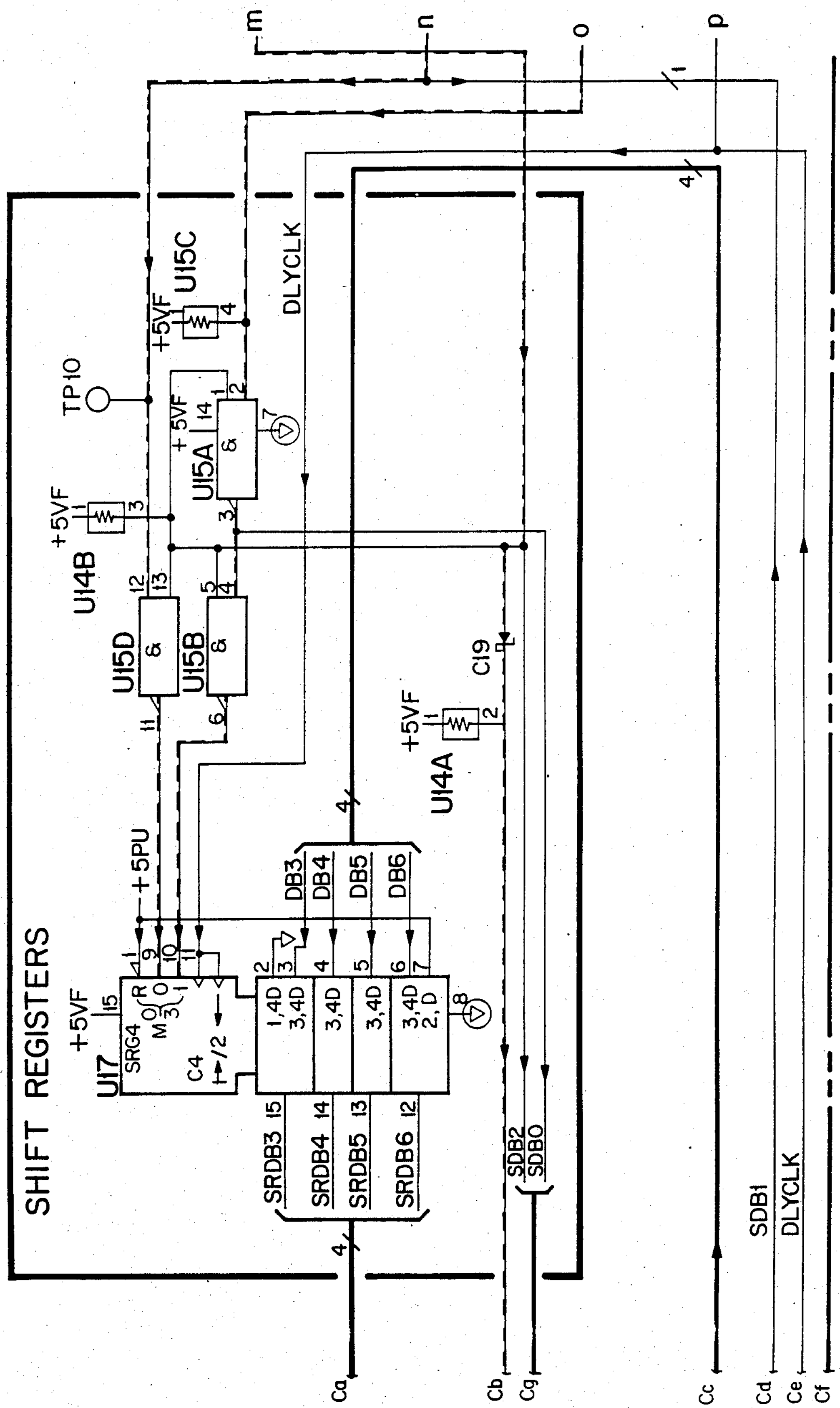
FIG 27.26B

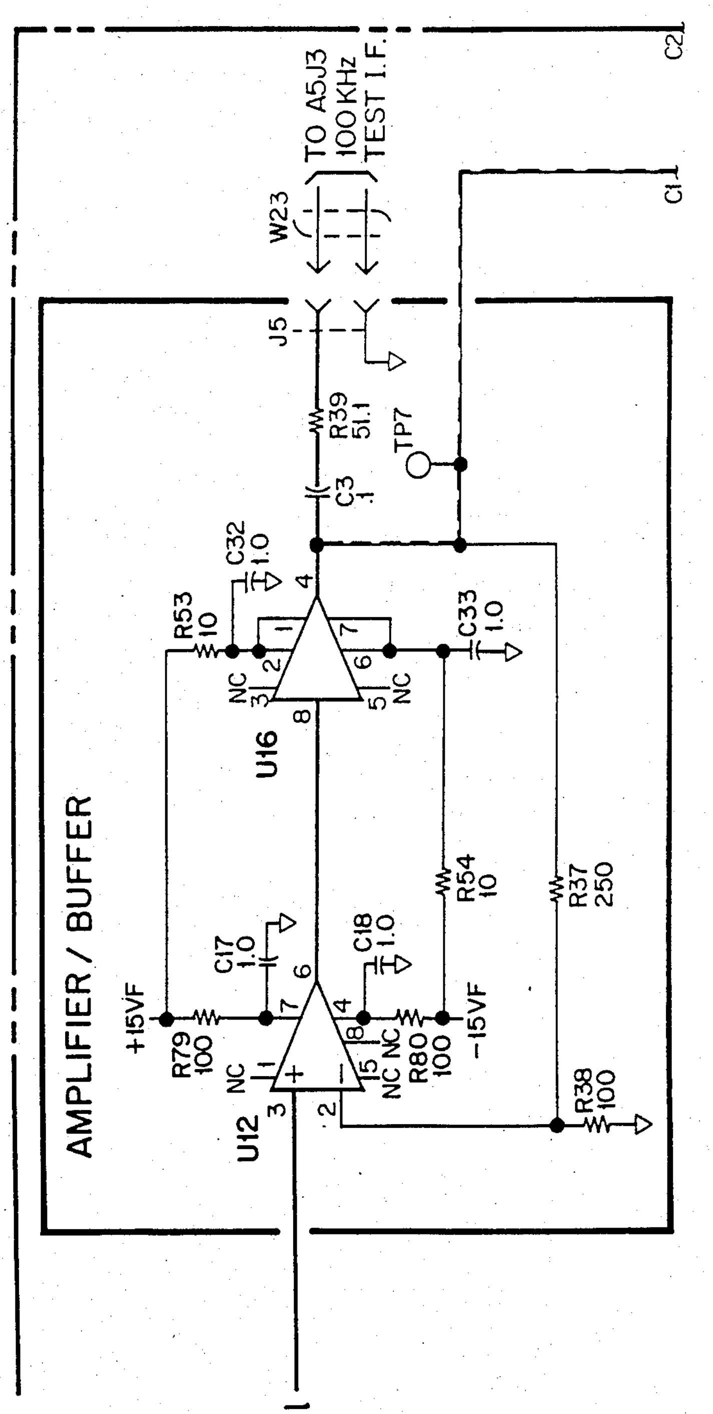
FIG 27.27A

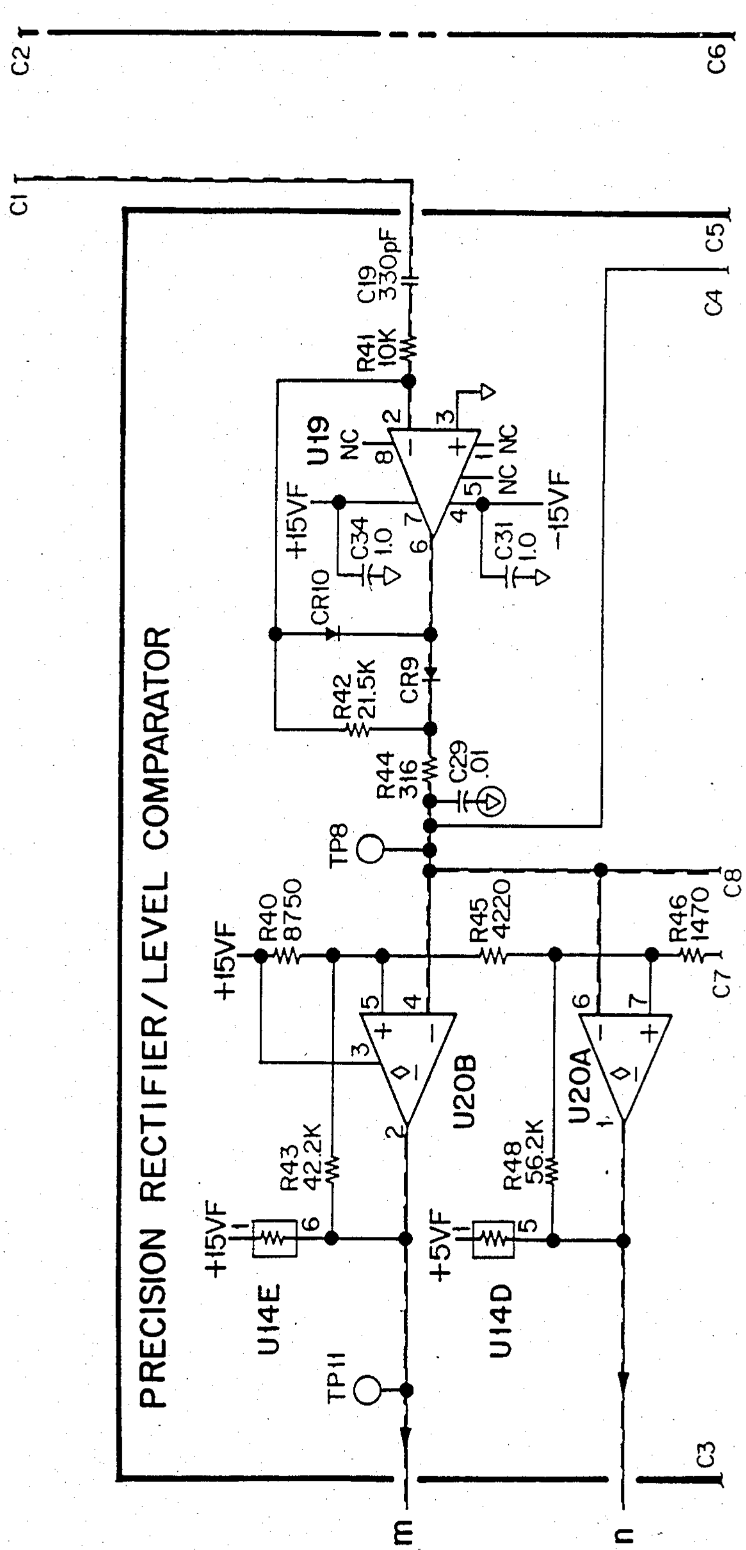
FIG 27.27B

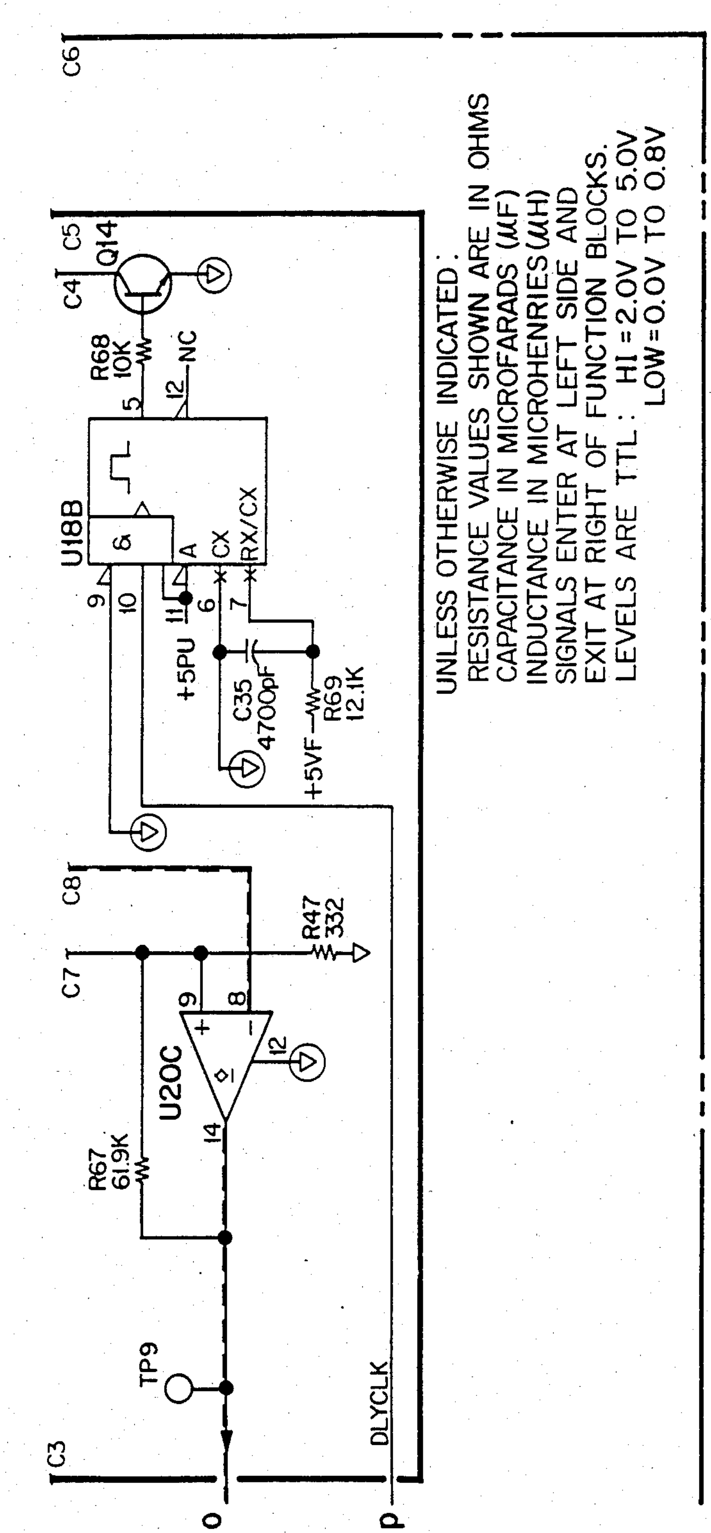
FIG 27.27C

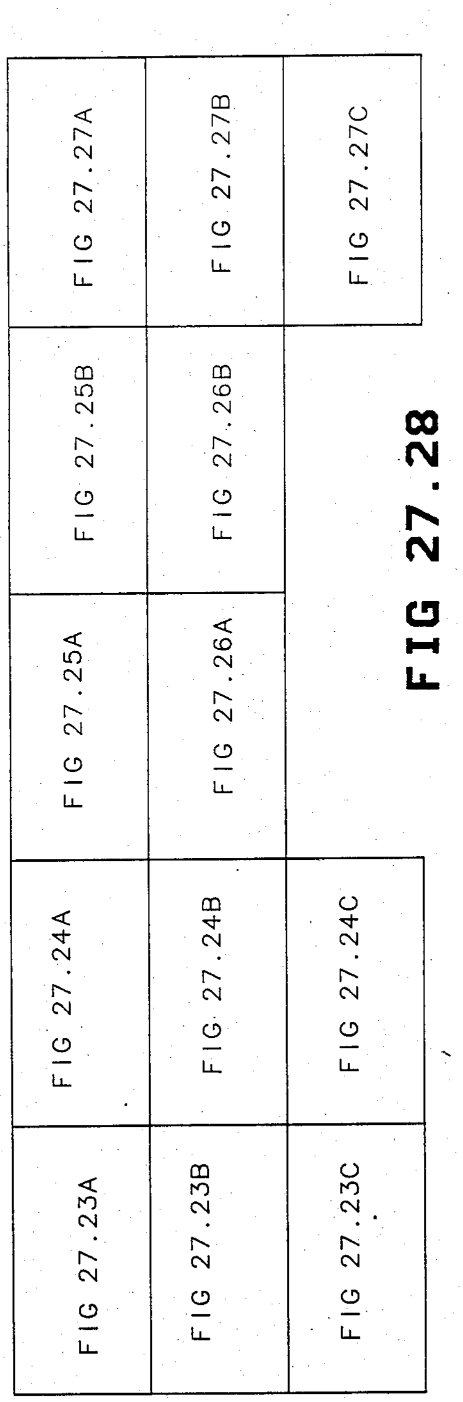
FIG 27.28
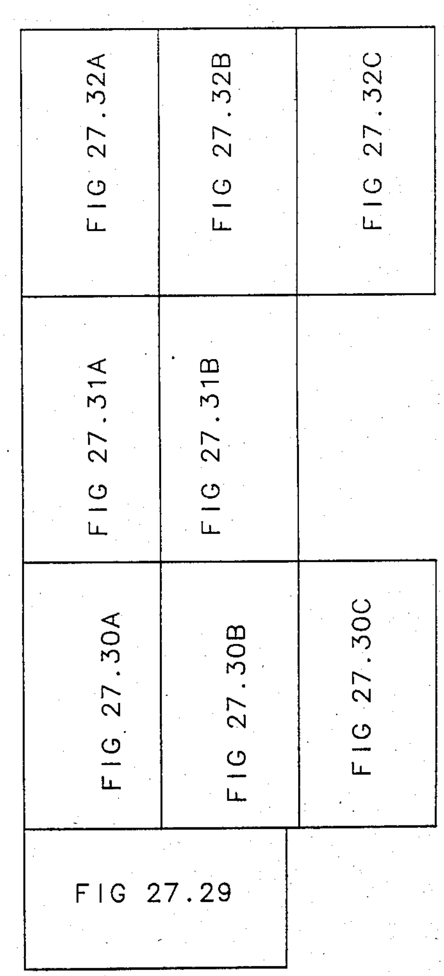
FIG 27.33

A15 REGULATOR
85102-60015

P1

| PIN | SIGNAL | TO/FROM | FUNCTION BLOCK |
|---|---|---|---|
| 1 | Q2B | A25Q2 BASE | J |
| 23 | | | |
| 2 24 | | | |
| 3 25 | -5V SENSE | -5V BUS | J |
| 4 26 | | | |
| 5 27 | | | |
| 6 28 | | | |
| 7 29 | | | |
| 8 30 | | | |
| 9 31 | | | |
| 10 32 | +15V REG | +15V BUS | E |
| 11 33 | GND | GND BUS | A |
| 12 34 | GND | GND BUS | A |
| 13 35 | -15V REG | -15V BUS | H |
| 14 36 | -5V REG | +5V BUS | I |
| 15 | | | |
| 37 | +5V SENSE | +5V BUS | I |
| 16 | | | |
| 38 | -15V SENSE | -15V BUS | H |
| 17 | -15VUNREG | A26 | C G |
| 39 | Q4B | A25Q+ BASE | G H |
| 18 | | | |
| 40 | +15VUNREG | A26 | B D |
| 19 | Q1B | A25Q1 BASE | I |
| 41 | Q3B | A25Q3 BASE | D E |
| 20 | Q5B | A25Q5 BASE | I |
| 42 | | | |
| 21 | SENSE GND | GND | E H I J |
| 43 | THER 1 | A25RT1 | F |
| 22 | +15 SENSE | +15V BUS | E H I J |
| 44 | THER 2 | A25RT1 | E |

ACTIVE COMPONENTS PARTS LISTS
(U's and Q's)

| REFERENCE DESIGNATORS | HP PART NUMBER | MANUFACTURER'S PART NUMBER |
|---|---|---|
| U8 | 1826-0458 | LF255 |
| U2 | 1826-0458 | LF255 |
| U9 | 1826-0458 | LF255 |
| U6 | 1826-0458 | LF255 |
| U10 | 1826-0261 | 741 |
| | | |
| | | |
| U5 | 1826-0316 | LH0070 |
| U4 | 1826-0468 | MC3423 |
| U3 | 1826-0468 | MC3423 |
| U1 | 1826-0468 | MC3423 |
| U7 | 1826-0468 | MC3423 |
| | | |
| Q18 | 1853-0281 | 2N2907 |
| Q3 | 1854-0477 | 2N222 |
| Q13 | 1854-0477 | 2N222A |
| Q12 | 1854-0022 | 2N2102 |
| Q11 | 1853-0281 | 2N2907 |
| Q15 | 1853-0281 | 2N2907A |
| Q9 | 1853-0281 | 2N2907A |
| Q8 | 1854-0404 | S59333 |
| Q7 | 1884-0244 | |
| Q2 | 1884-0293 | |
| Q4 | 1884-0244 | |
| Q9 | 1884-0244 | |
| Q17 | 1884-0073 | |
| Q10 | 1854-0404 | S59333 |
| Q14 | 1853-0314 | 2N2905A |
| Q16 | 1854-0637 | 2N2219A |
| Q1,Q6 | 1854-0477 | 2N222A |

| CHASSIS | MOUNTED | SEMICONDUCTORS |
|---|---|---|
| Q1 | 1854-0679 | 2N5885 |
| Q2 | 1853-0351 | 2N6053 |
| Q3 | 1854-0611 | 2N6055 |
| Q4 | 1853-0351 | 2N6053 |

| MOTHERBOARD | SEMICONDUCTORS |
|---|---|
| Q5 1854-0441 | 40372 |

FIG 27.29

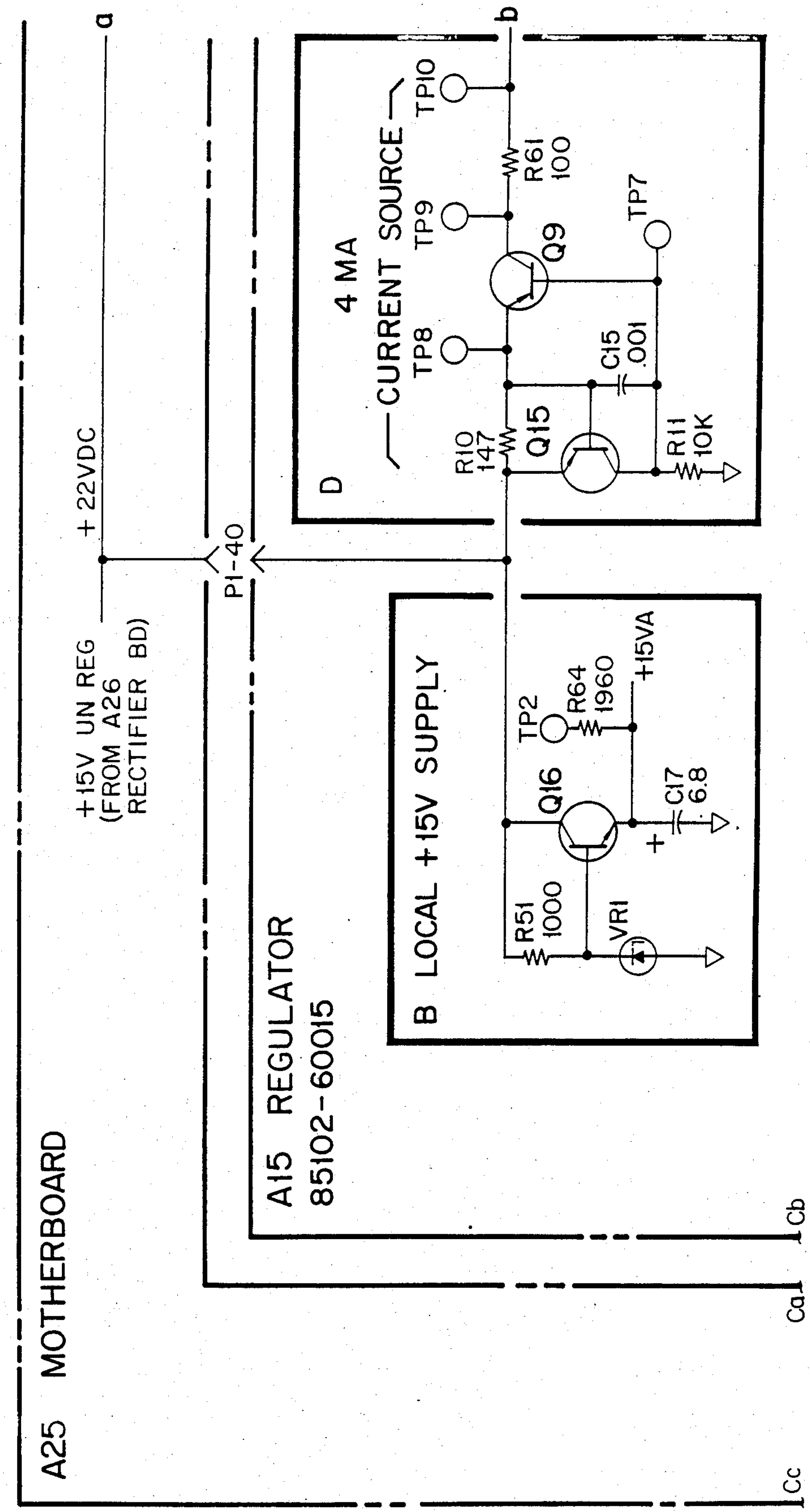
FIG 27.30A

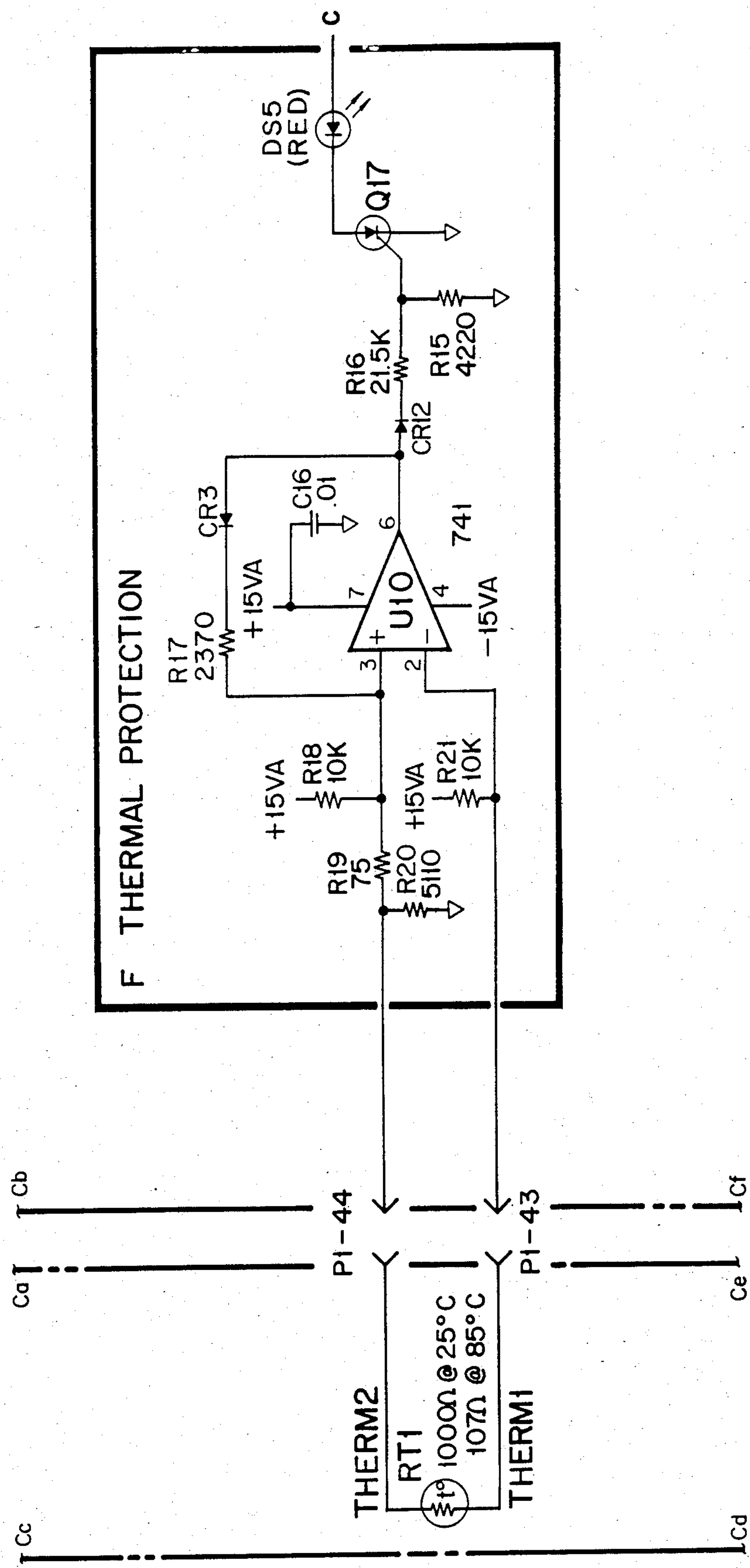
FIG 27.30B

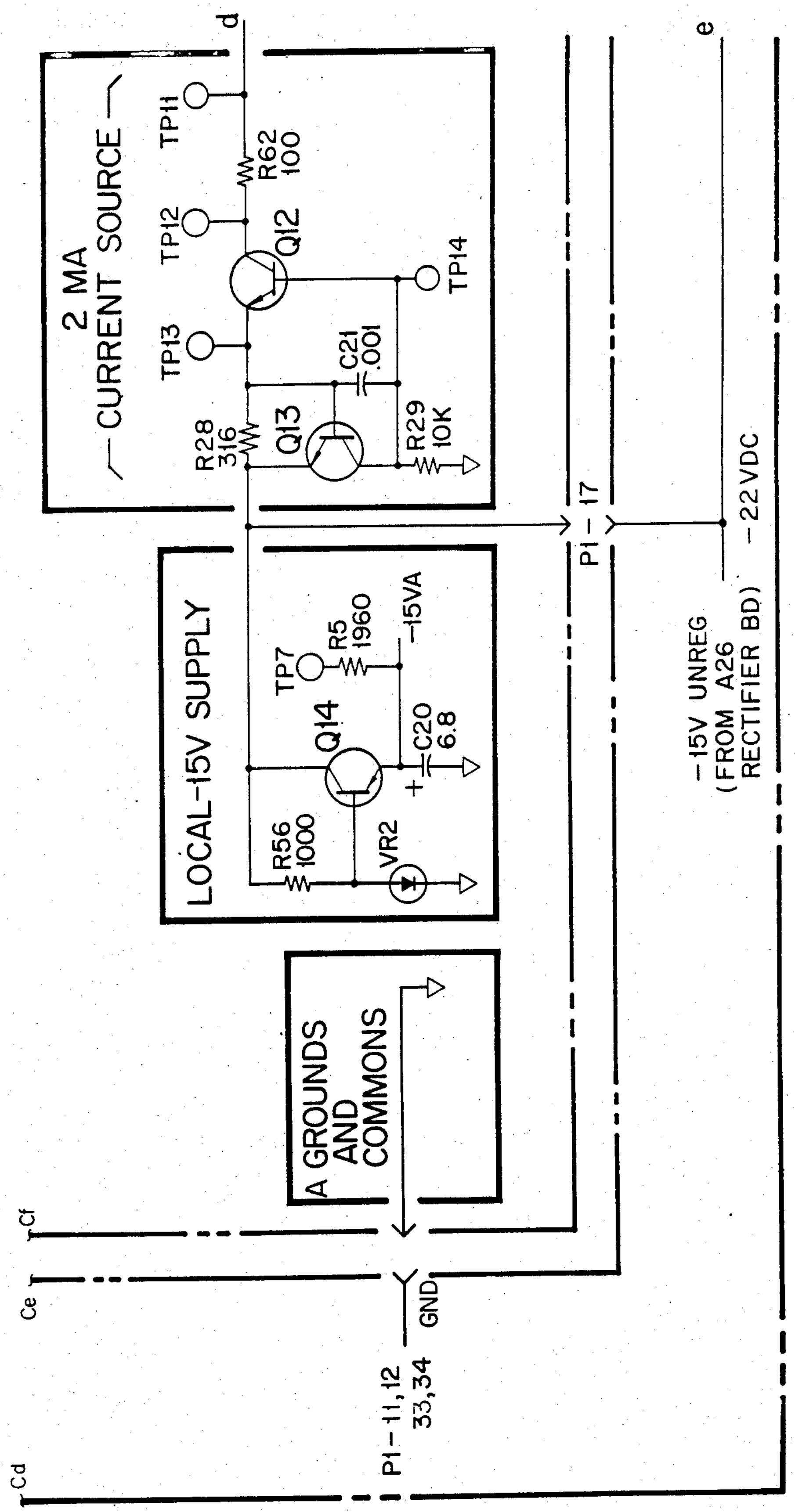
FIG 27.30C

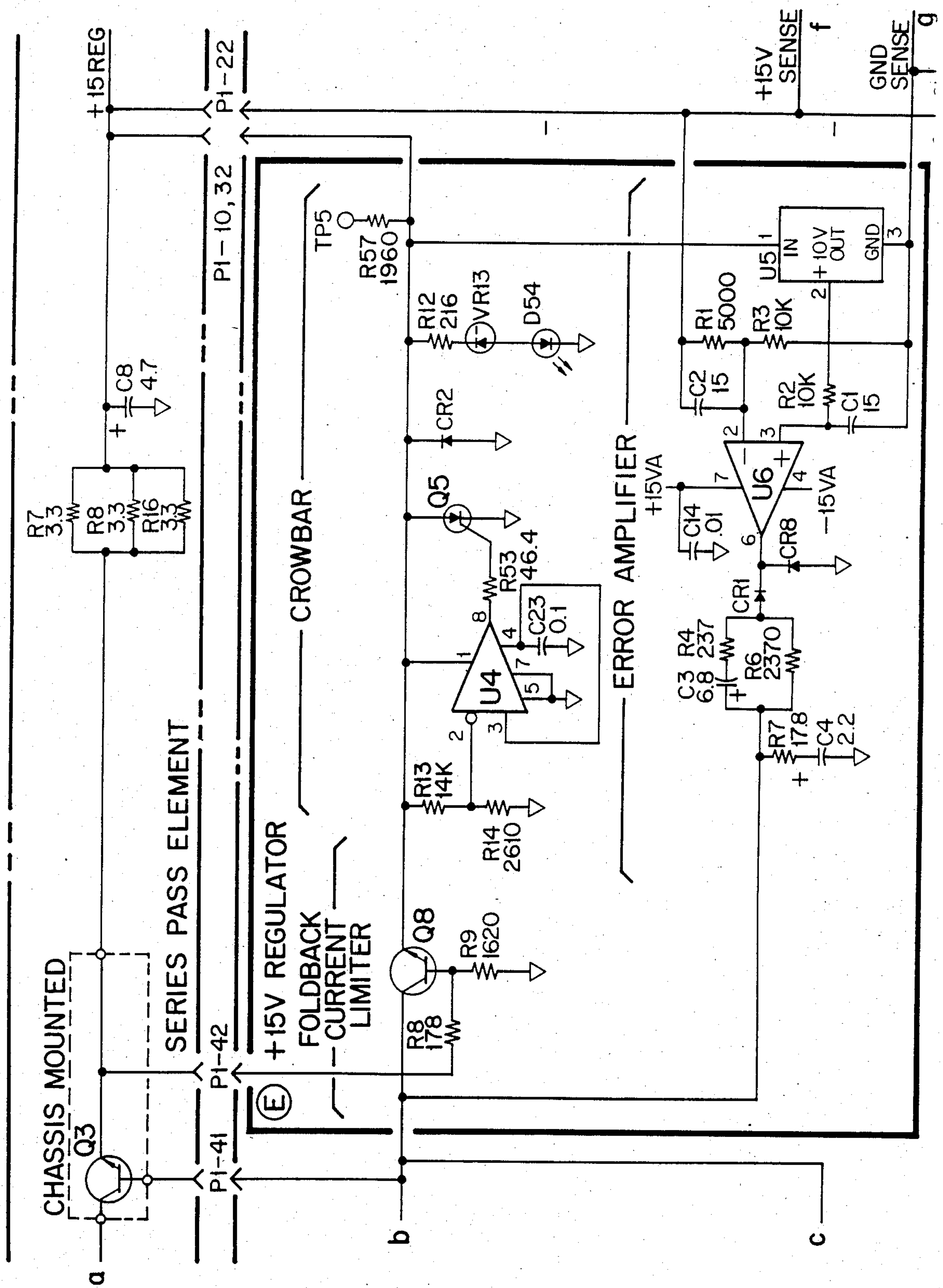
FIG 27.31A

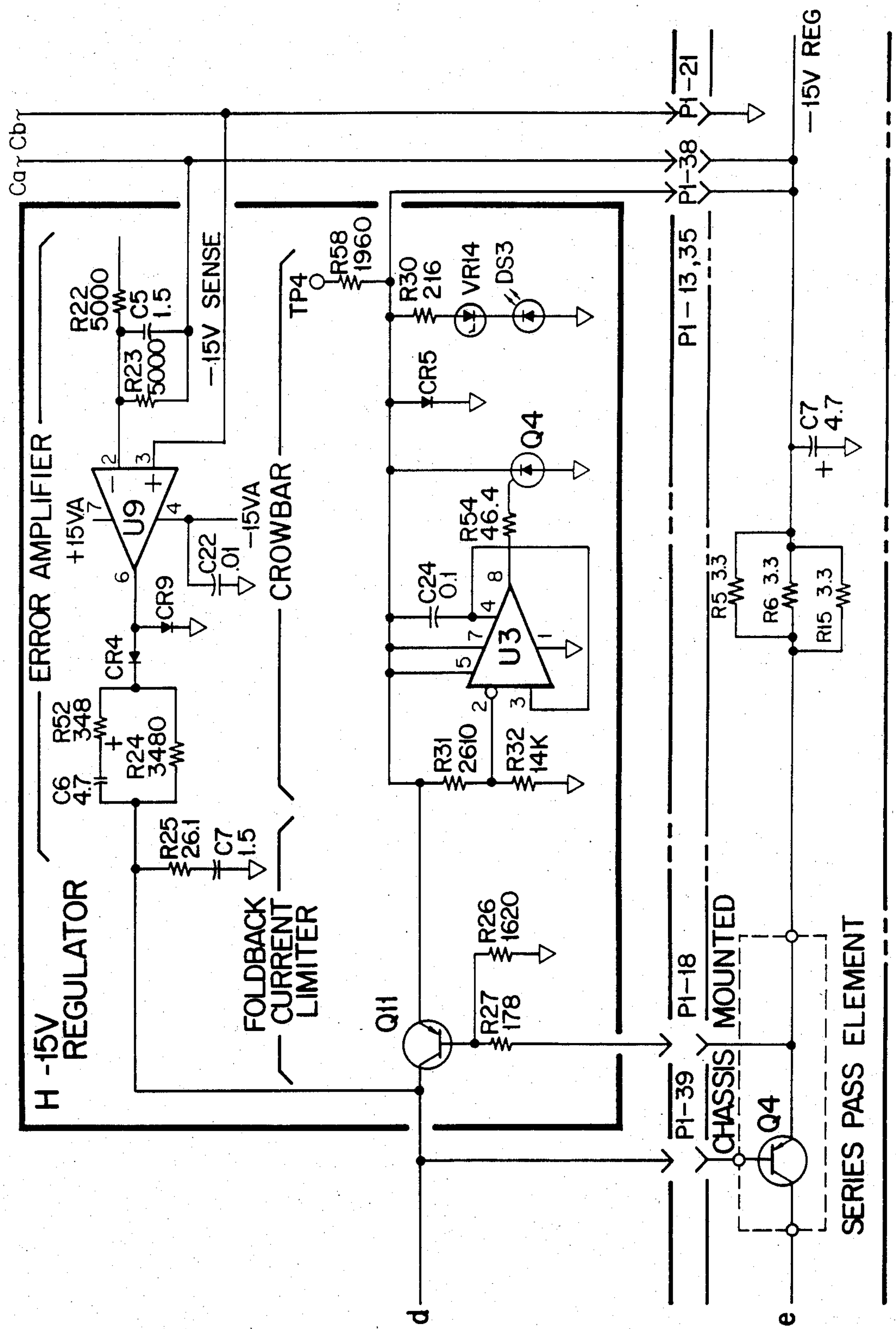
FIG 27.31B

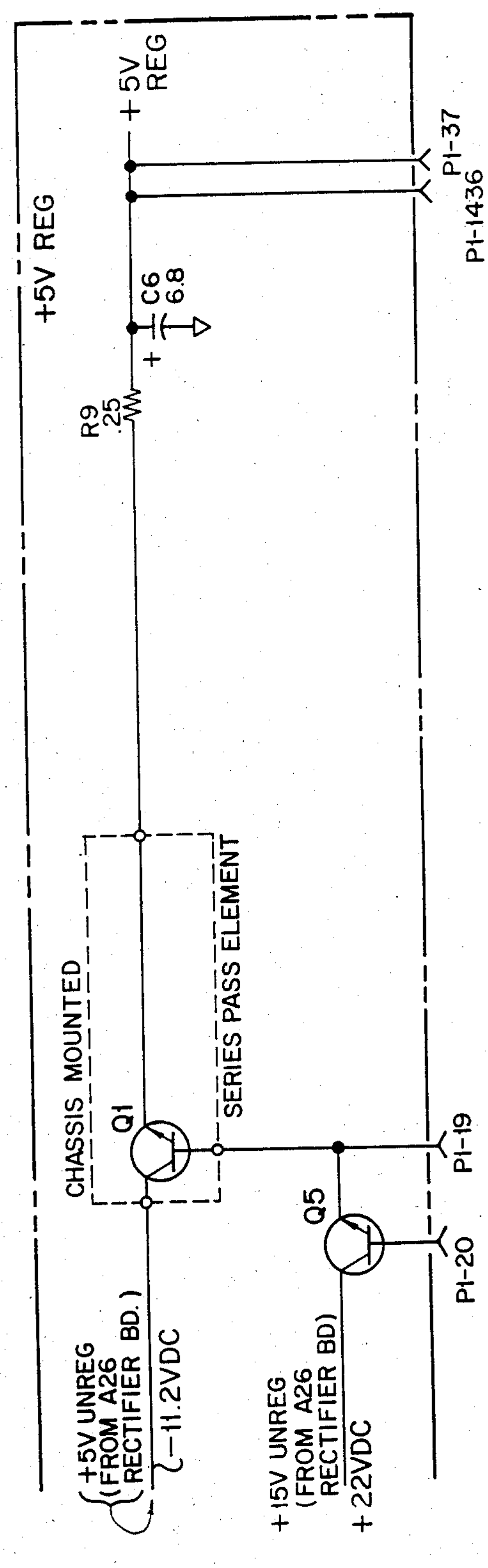
FIG 27.32A

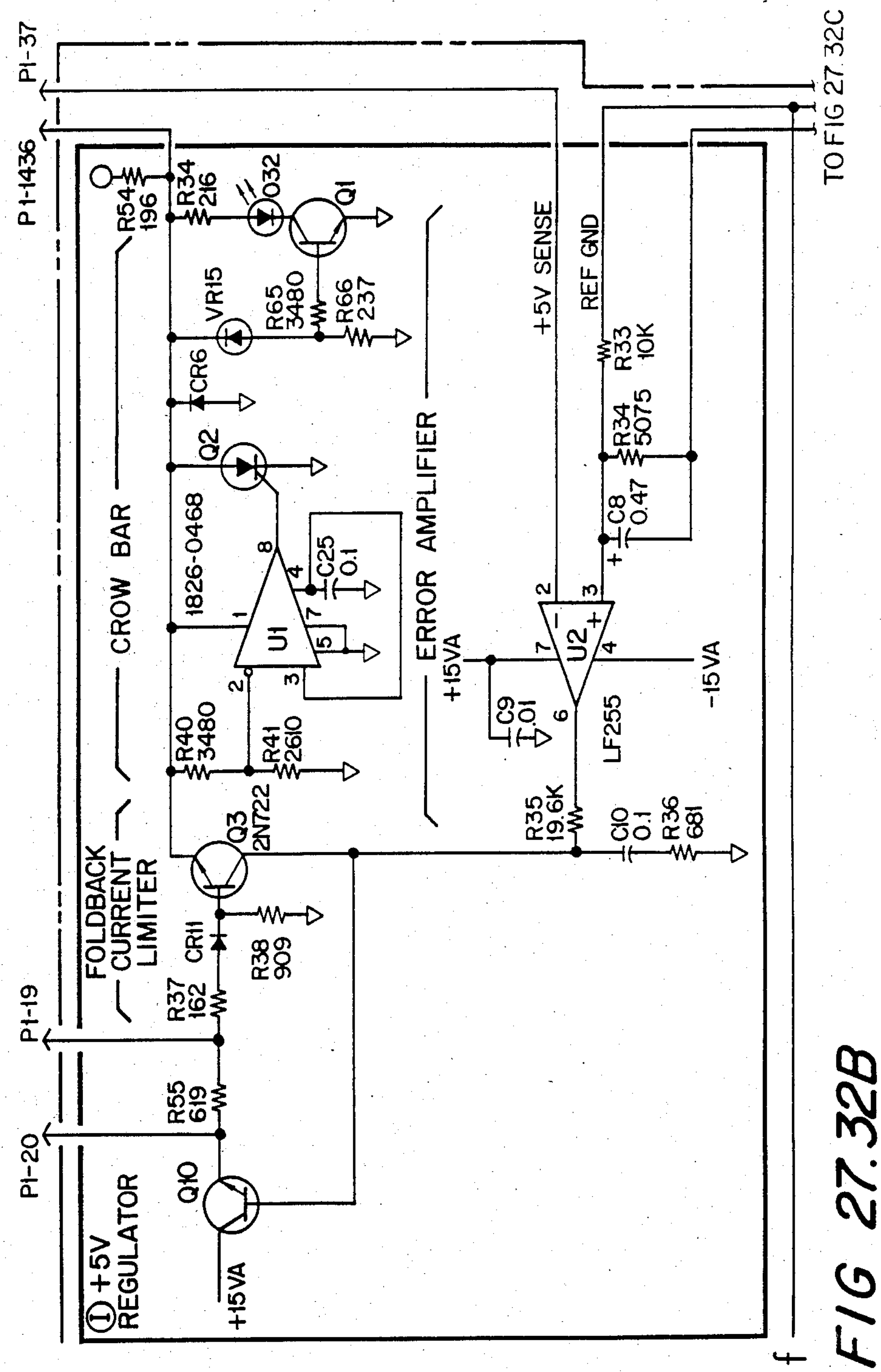
FIG 27.32B

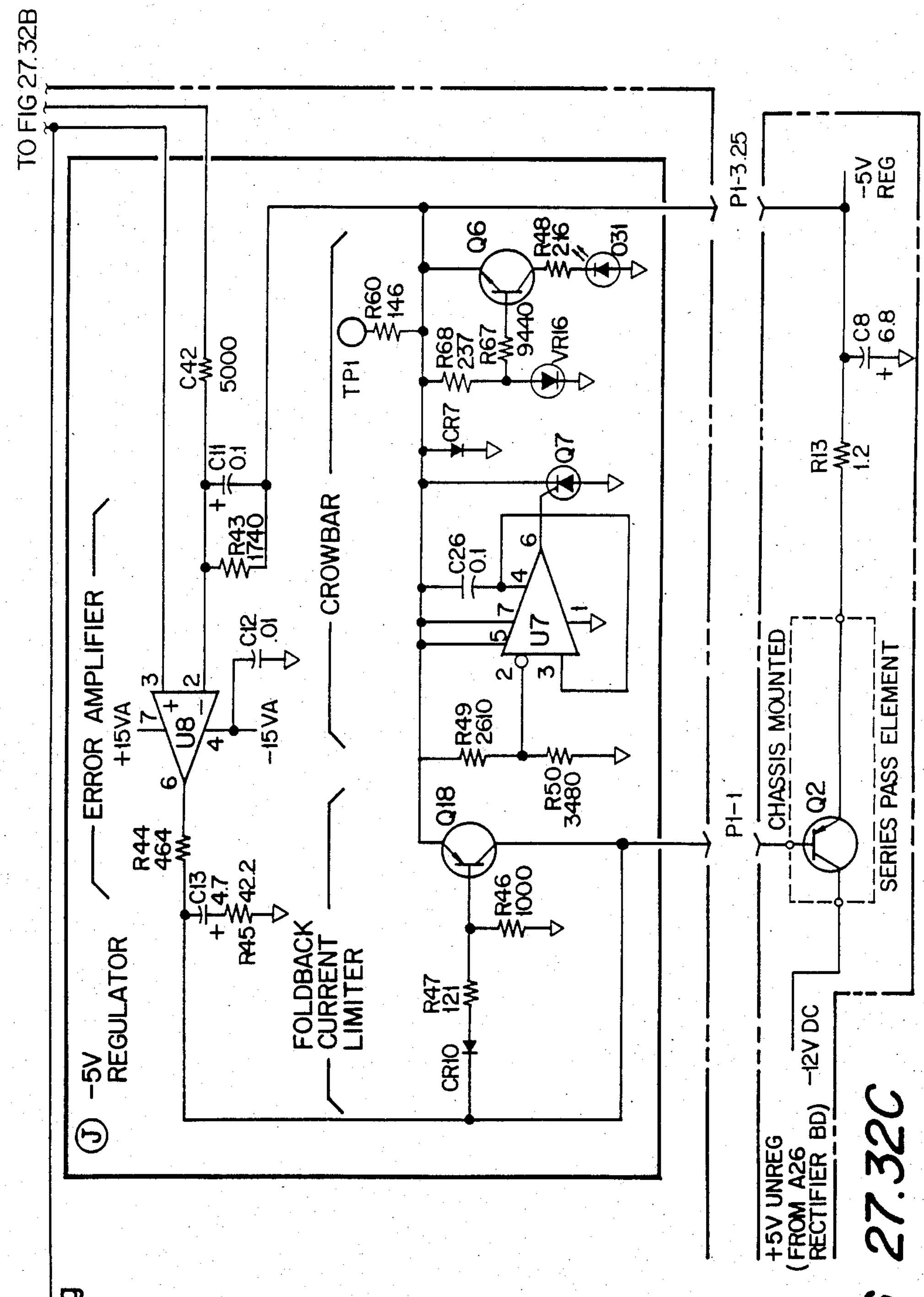
FIG 27.32C

A17

A17 SAMPLE AND HOLD
85102-60017

| PIN | SIGNAL | TO/FROM | FUNCTION BLOCK |
|---|---|---|---|
| 1 23 | PLSTSTX<br>TEMP | A16<br>A25 | |
| 2 24 | PLSTSTY<br>+10 VR | A16<br>A18 | |
| 3 25 | PLSREFX<br>LHOLD | A16<br>A19 | |
| 4 26 | PLSREFY<br>NOT USED | A16 | |
| 5 27 | LLOST<br>LIFSRQ | ADR BUS<br>A24 | NOT USED |
| 6 28 | CLK<br>LRDS | A6<br>A24 | NOT USED |
| 7 29 | LADCSRQ<br>AB0 | A24<br>ADR BUS | NOT USED |
| 8 30 | AB1<br>AB2 | ADR BUS<br>ADR BUS | |
| 9 31 | AB3<br>AB4 | ADR BUS<br>ADR BUS | |
| 10 32 | +15V REG<br>+15V REG | PWR BUS | |
| 11 33 | GND | | |
| 12 34 | GND | | |
| 13 35 | -15V REG<br>-15V REG | PWR BUS | |
| 14 36 | + 5V REG<br>+ 5V REG | PWR BUS | |
| 15 37 | DB0<br>DB1 | DATA BUS<br>DATA BUS | |
| 16 38 | DB2<br>DB3 | DATA BUS<br>DATA BUS | |
| 17 39 | DB4<br>DB5 | DATA BUS<br>DATA BUS | |
| 18 40 | DB6<br>DB7 | DATA BUS<br>DATA BUS | |
| 19 41 | DB8<br>DB9 | DATA BUS<br>DATA BUS | |
| 20 42 | DB10<br>DB11 | DATA BUS<br>DATA BUS | |
| 21 43 | SEL1<br>SEL2 | A19<br>A19 | |
| 22 44 | NOT USED<br>NOT USED | | |

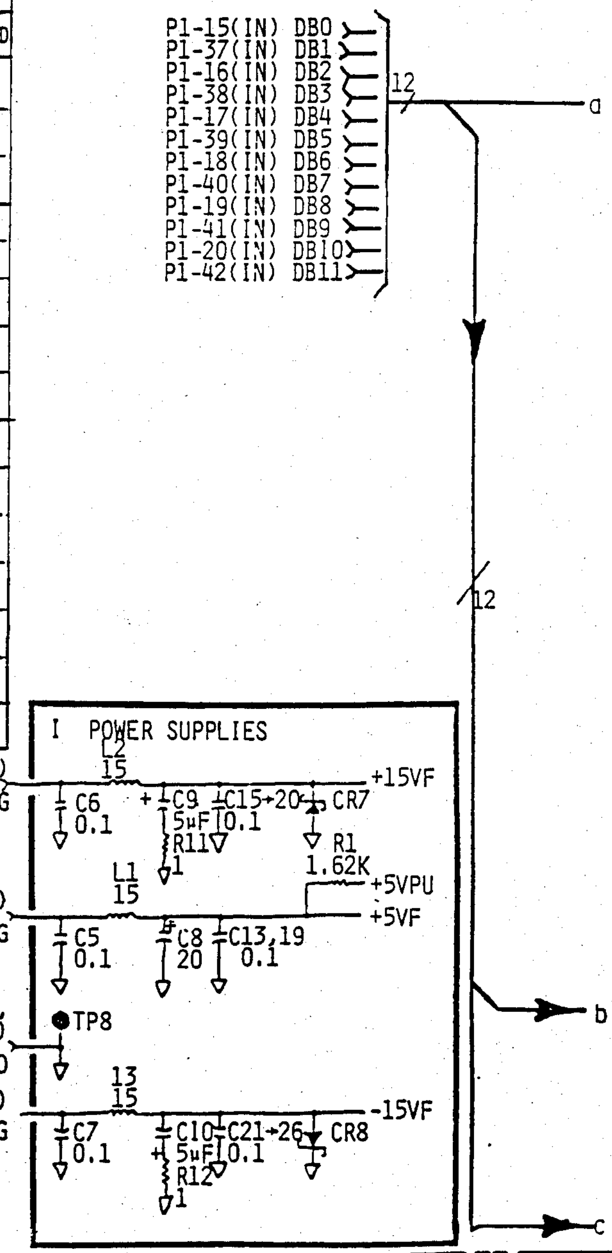

FIG 2734

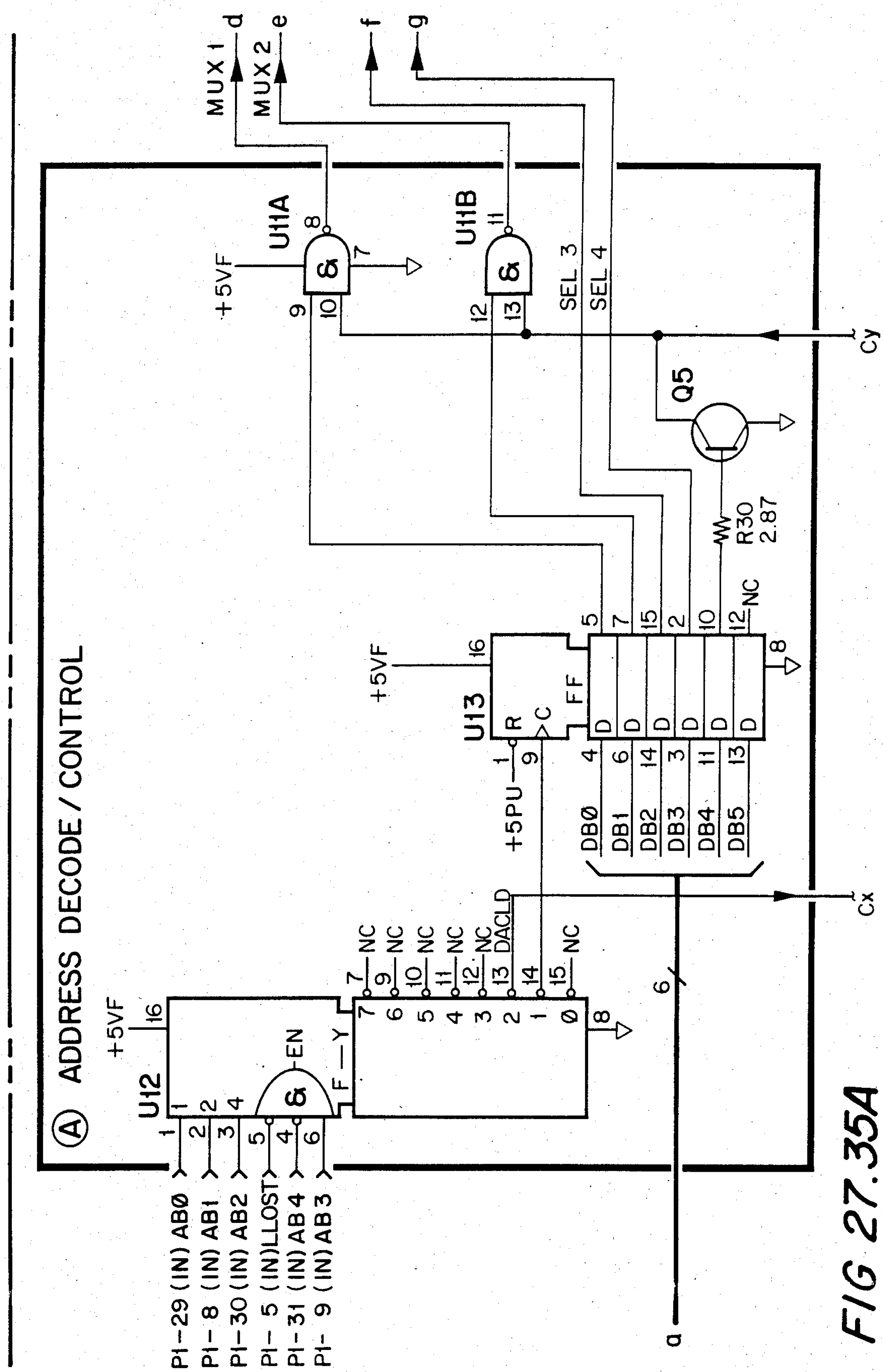
FIG 27.35A

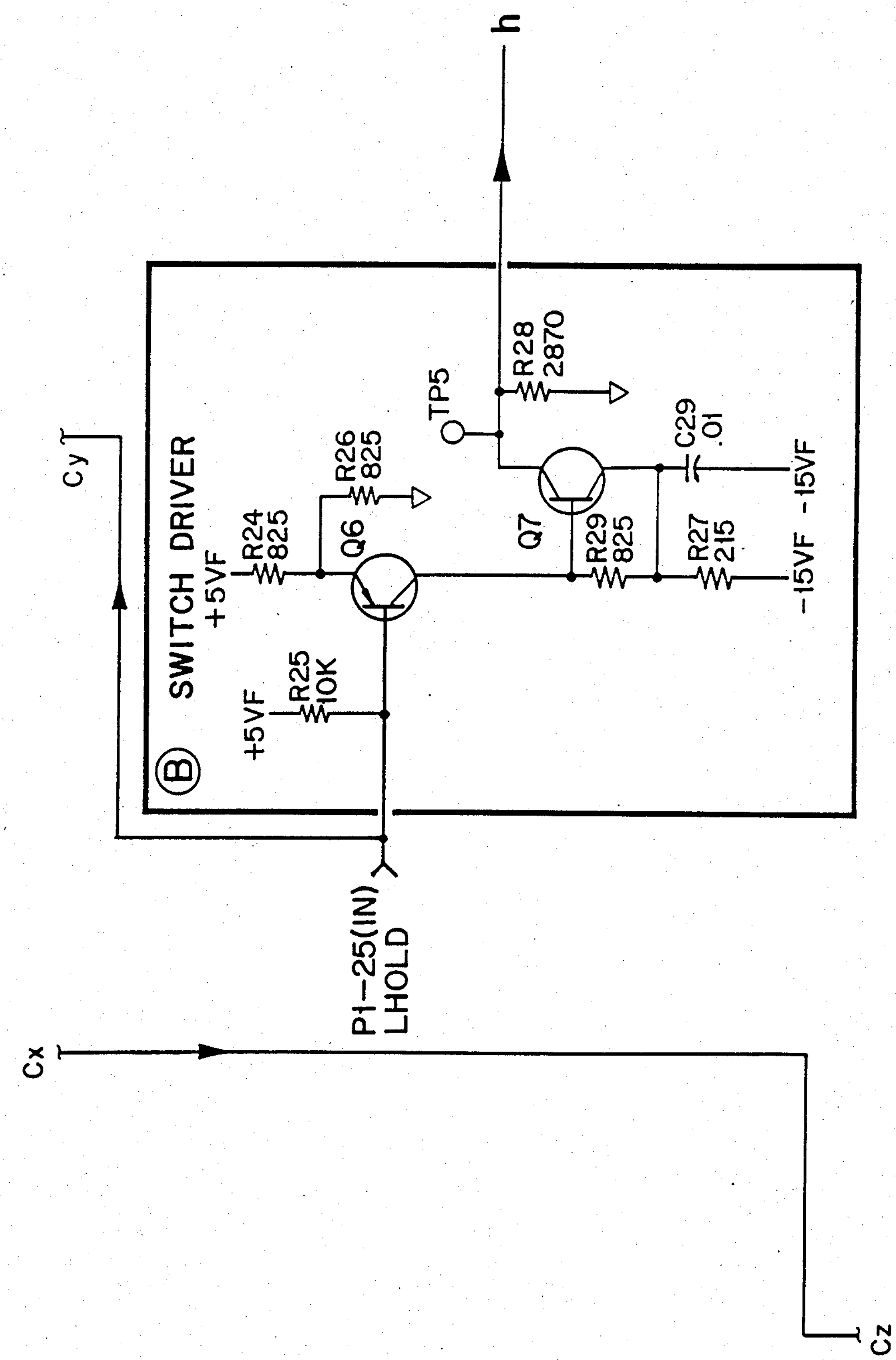
FIG 27.35B

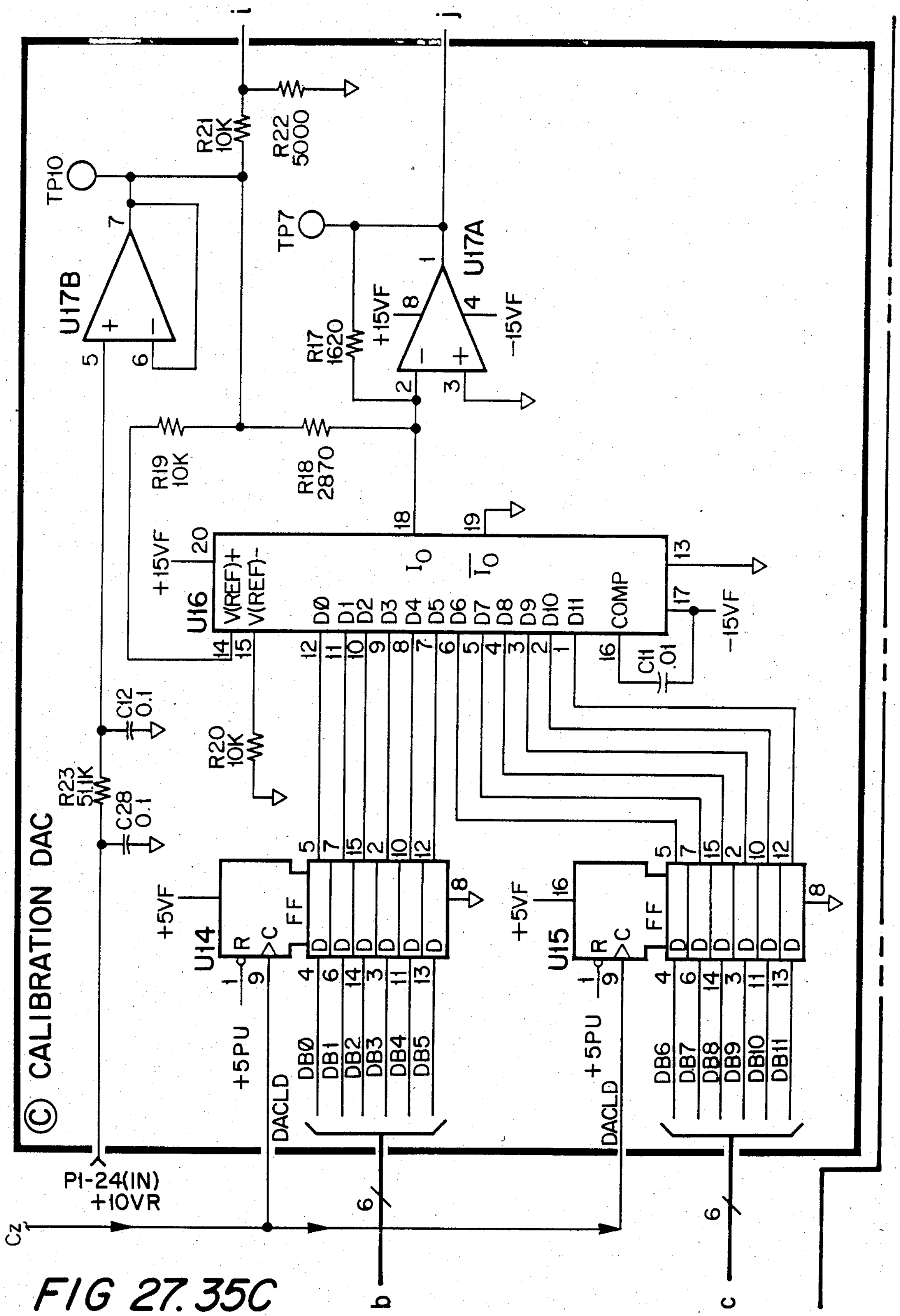
FIG 27.35C

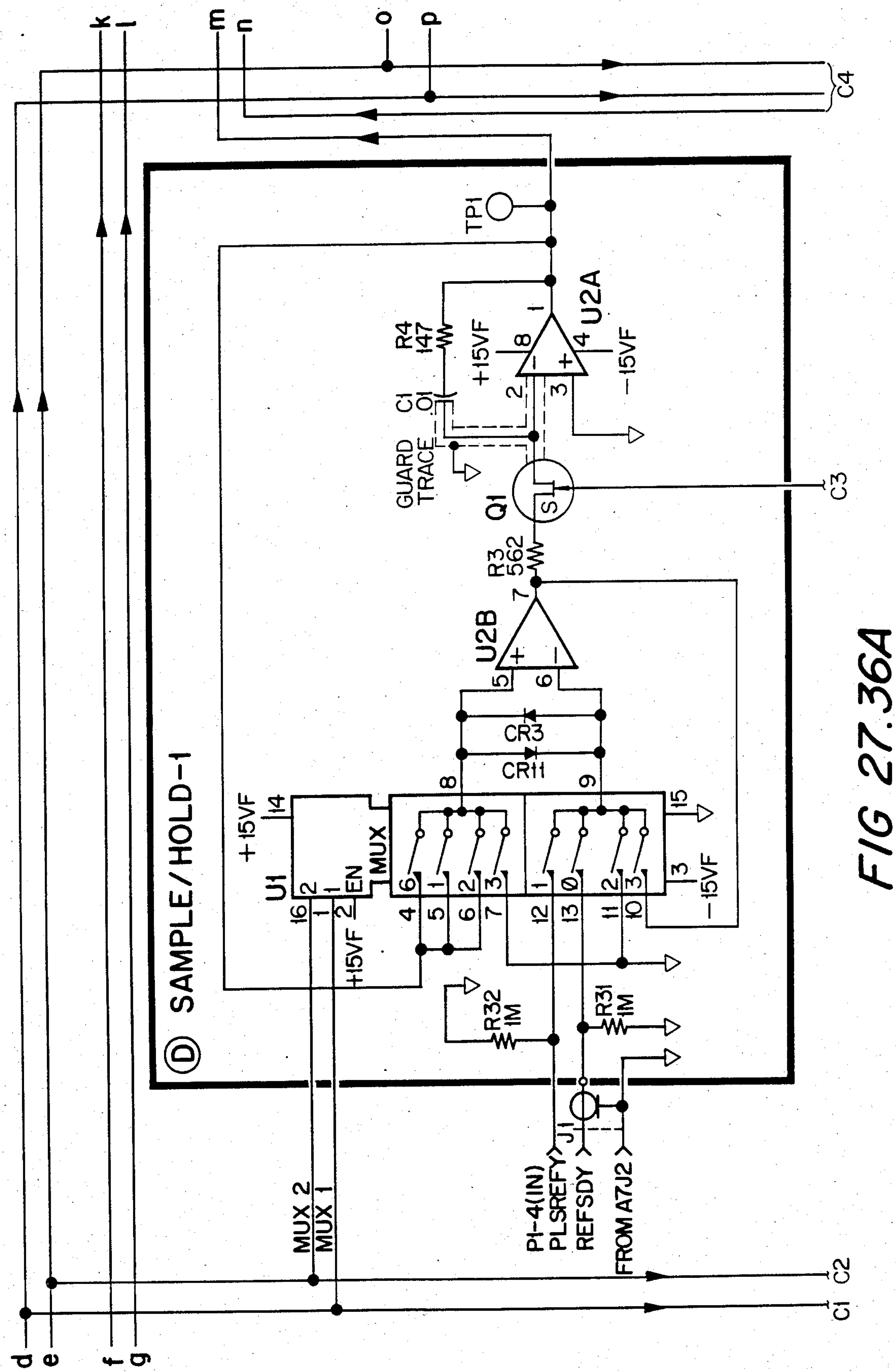
FIG 27.36A

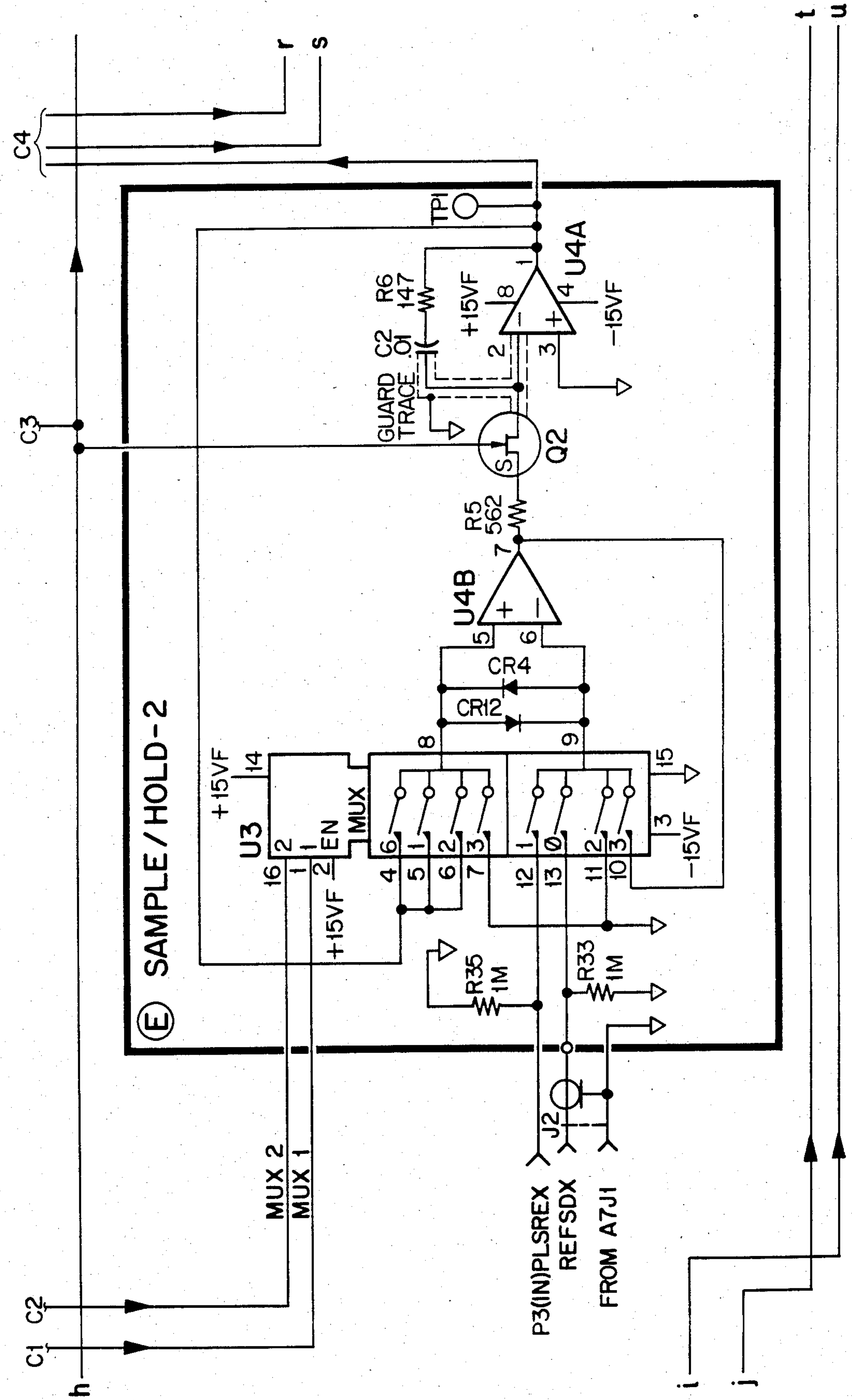
FIG 27.36B

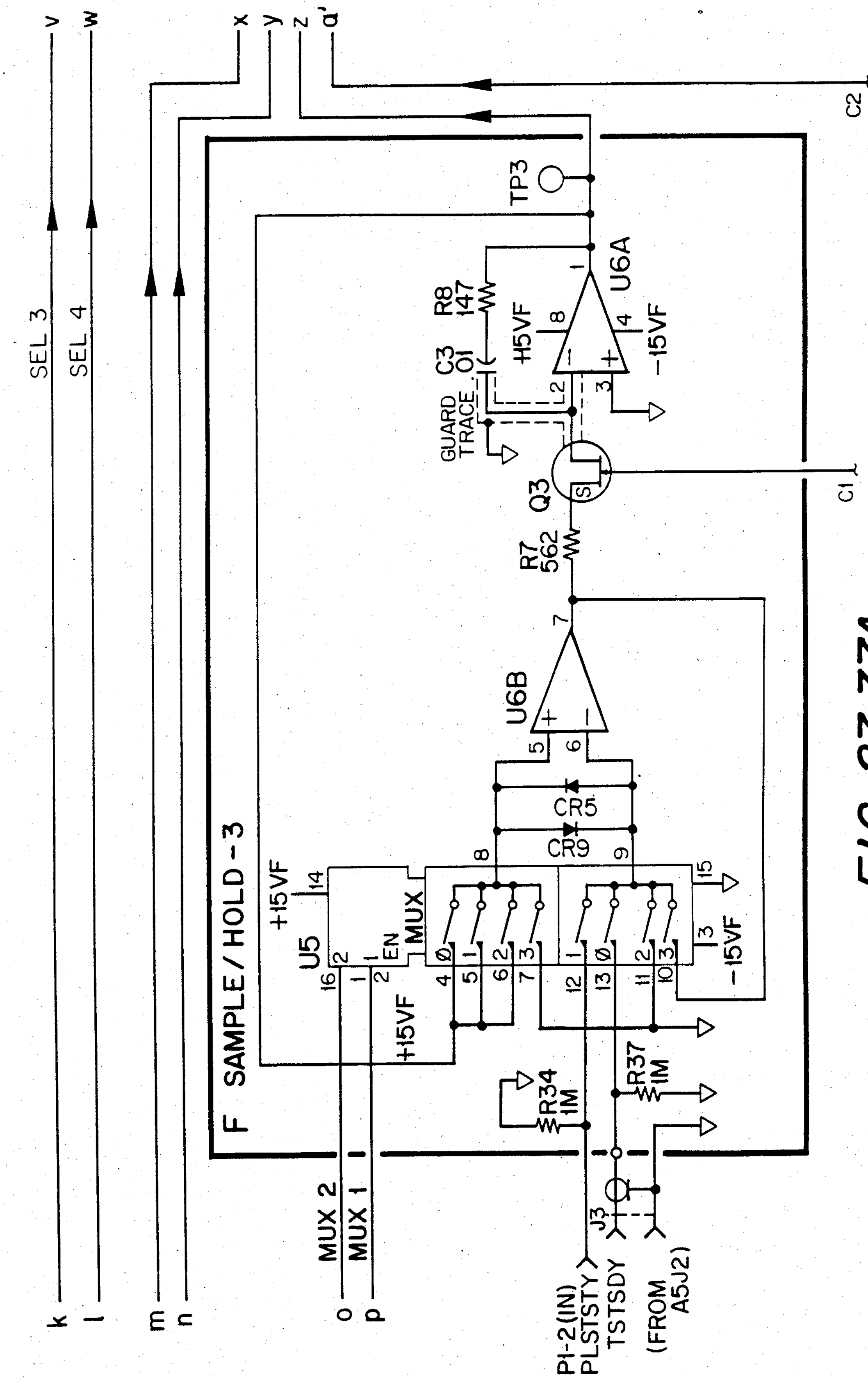
FIG 27.37A

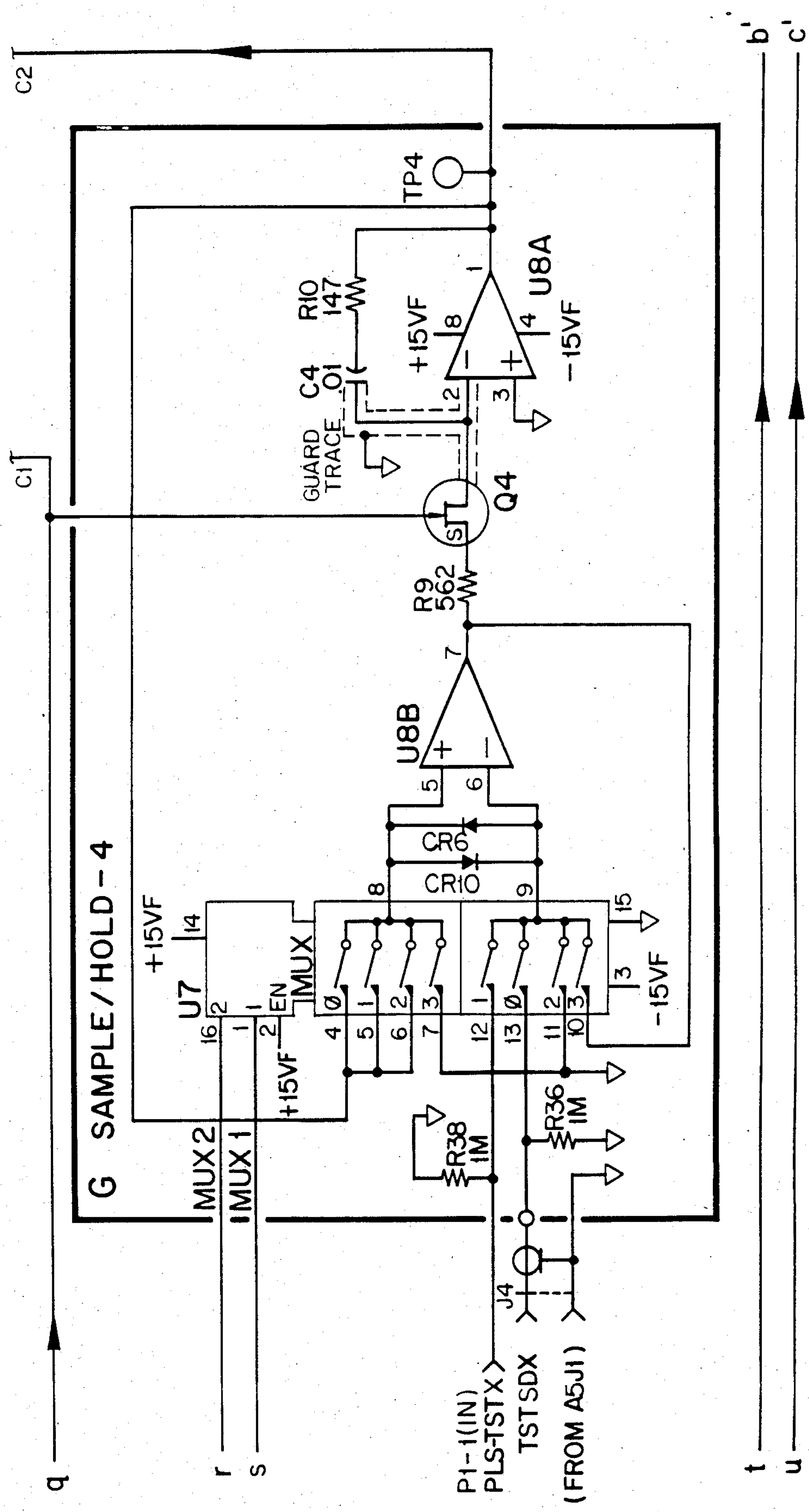
FIG 27.37B

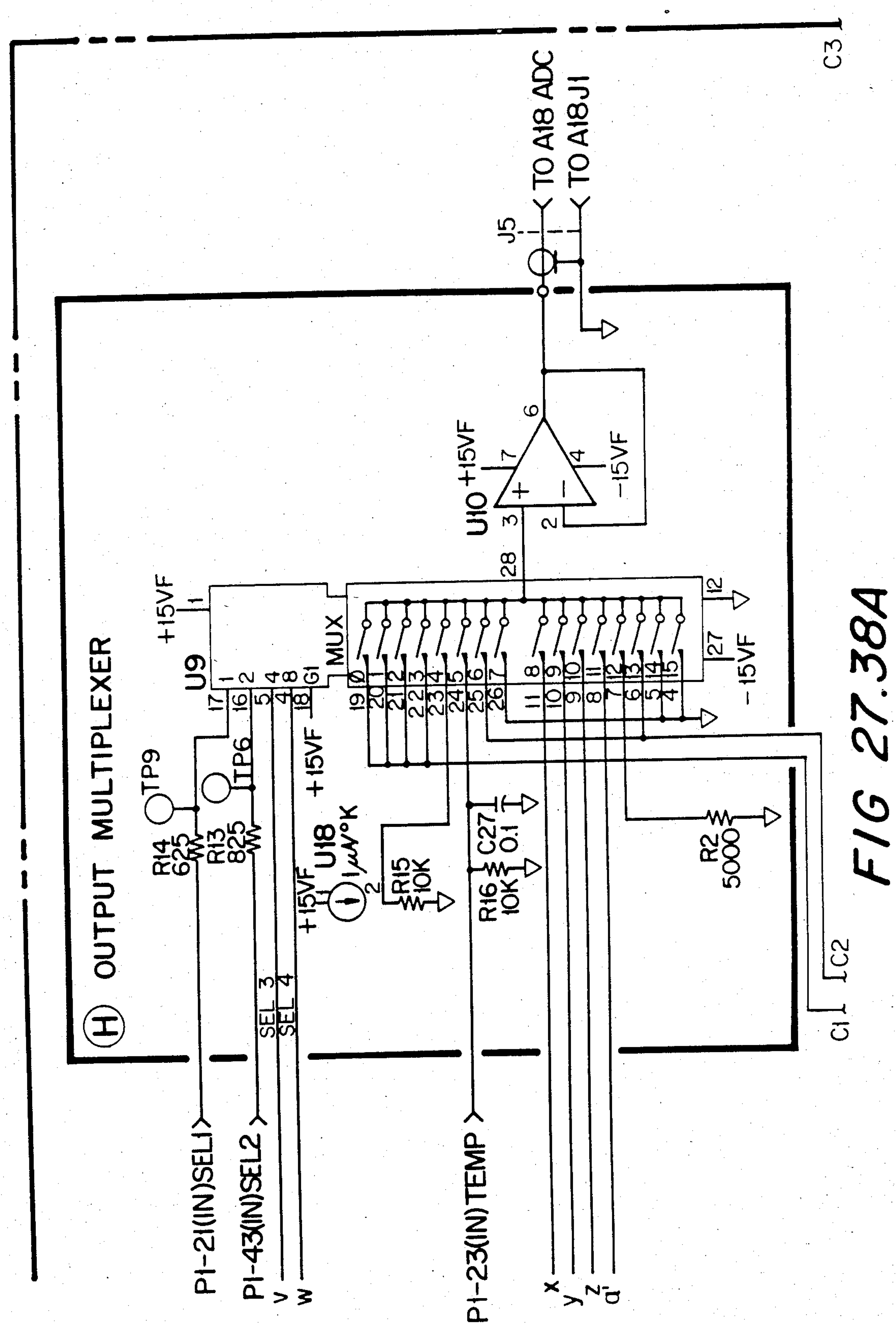
FIG 27.38A

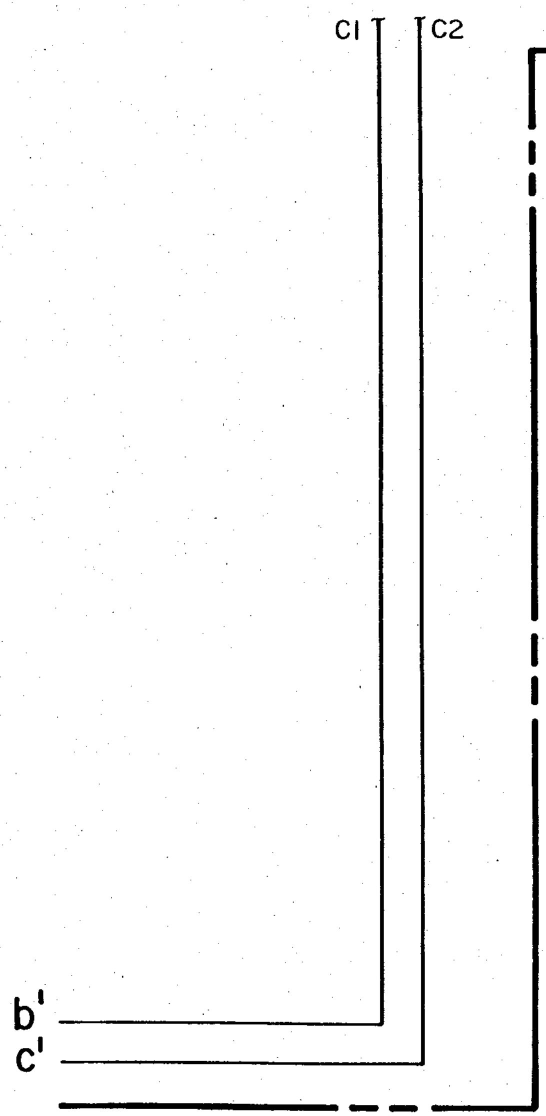
A17 ACTIVE COMPONENTS PARTS LISTS (U's and Q's)
| REFERENCE DESIGNATORS | PART NUMBER | MANUFACTURERS PART NUMBER |
|---|---|---|
| | | |
| Q1, 2, 3, 4 | 1855-0420 | 2N4391 |
| Q6 | 1853-0007 | 2N3251 |
| Q5, Q7 | 1854-0477 | 2N2222A |
| | | |
| | | |
| U1, 3, 5, 7 | 1826-0590 | LF13509 |
| U2, 4, 6, 8, 17 | 1826-0785 | LF353A |
| U9 | 1826-0998 | MUX-16E |
| U10 | 1826-0601 | OP-16F |
| U11 | 1820-1197 | 74LS00 |
| U13, 14, 15 | 1826-1196 | 74LS174 |
| U16 | 1826-0705 | Am6012 |
| U12 | 1820-1216 | 74LS138 |
| U18 | 1826-0661 | AD590K |
| | | |
| | | |
| CR1, 2, 7, 8 | 1901-0734 | 1N4004 |
| CR3, 4, 5, 6 | 1901-1098 | 1N4150 |
| | | |
| | | |
| | | |
FIG 27.38B

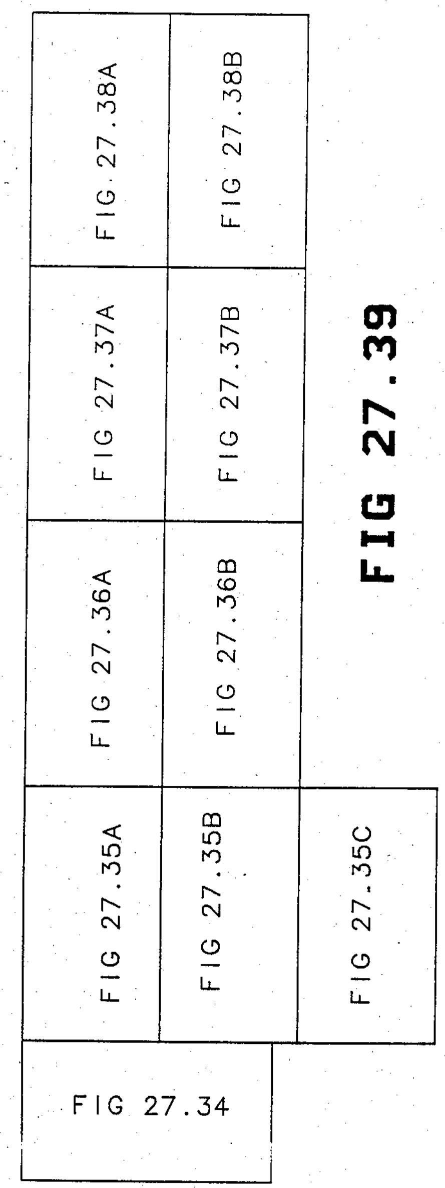
FIG 27.39
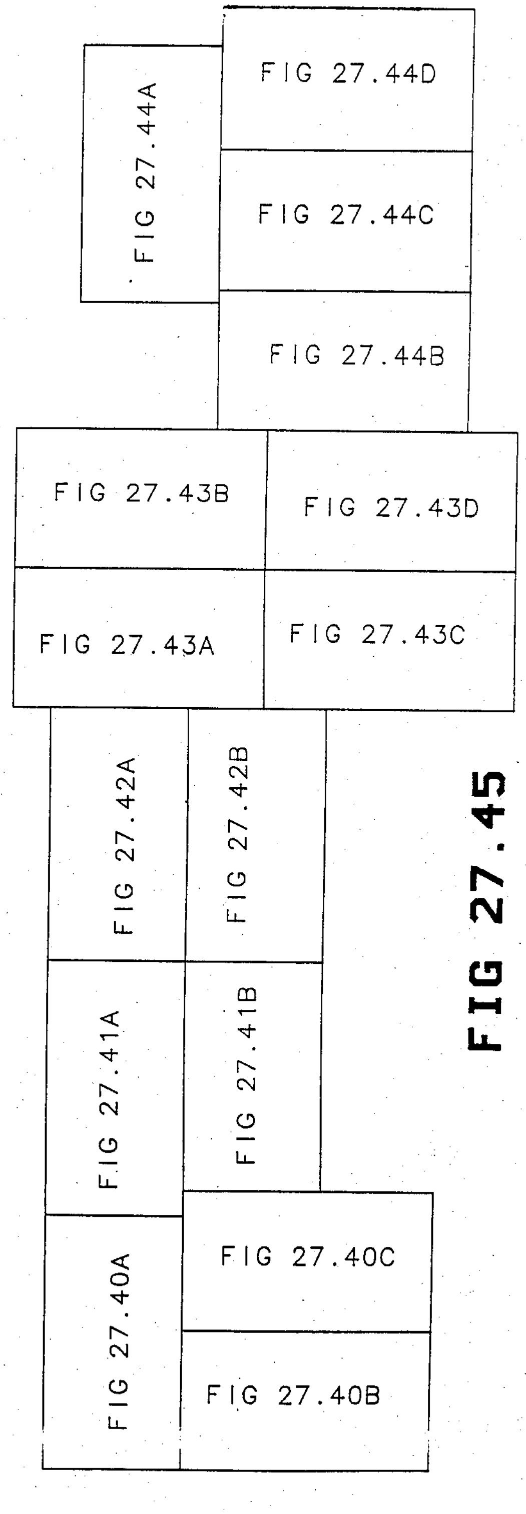
FIG 27.45

| PIN | SIGNAL | TO/FROM | FUNCTION BLOCK |
|---|---|---|---|
| 1<br>23 | | | |
| 2<br>24 | +10VR | A17 | G |
| 3<br>25 | L HOLD<br>H START 2 | A19<br>A19 | NOT USED<br>B E |
| 4<br>26 | L START 1 | A 19 | B |
| 5<br>27 | L LOST<br>LIFSRQ | ADR BUS<br>A24 | A<br>NOT USED |
| 6<br>28 | CLK<br>LRDS | A 6<br>A 24 | B<br>NOT USED |
| 7<br>29 | LADCSRQ<br>A BØ | A 24<br>ADR BUS | F<br>A F |
A18 ADC
85102-60011
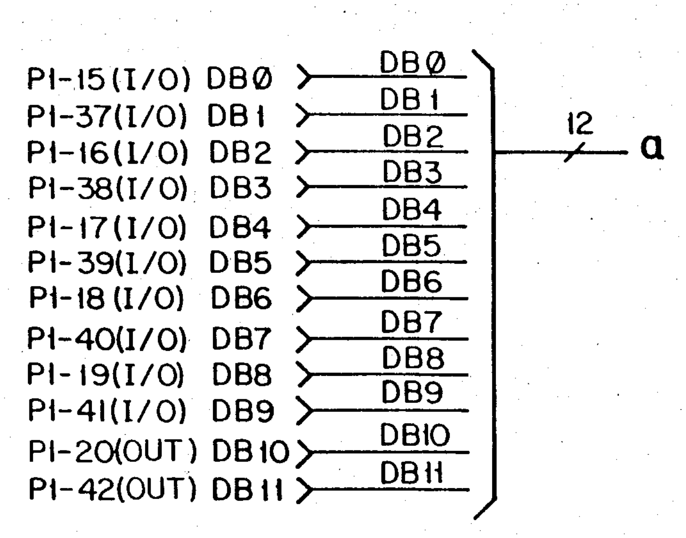
FIG 27.40A

| | | | |
|---|---|---|---|
| 8<br>30 | AB 1<br>AB 2 | ADR BUS<br>" " | A<br>A F |
| 9<br>31 | AB 3<br>AB 4 | " "<br>" " | A<br>A |
| 10<br>32 | +15V REG | POWER BUS | G |
| 11<br>33 | GND | | G |
| 12<br>34 | GND | | G |
| 13<br>35 | -15V REG | POWER BUS | G |
| 14<br>36 | +5V REG | " | G |
| 15<br>37 | DB Ø<br>DB 1 | DATA BUS | F<br>F |
| 16<br>38 | DB 2<br>DB 3 | " | B F<br>B F |
| 17<br>39 | DB 4<br>DB 5 | " | B F<br>B F |
| 18<br>40 | DB 6<br>DB 7 | " | B F<br>B F |
| 19<br>41 | DB 8<br>DB 9 | " | F B<br>F B |
| 20<br>42 | DB 10<br>DB 11 | " | F<br>F |
| 21<br>43 | SEL 1<br>SEL 2 | A19<br>A19 | F<br>F |
| 22<br>44 | | | |

FIG 27.40B

FIG 27.41A
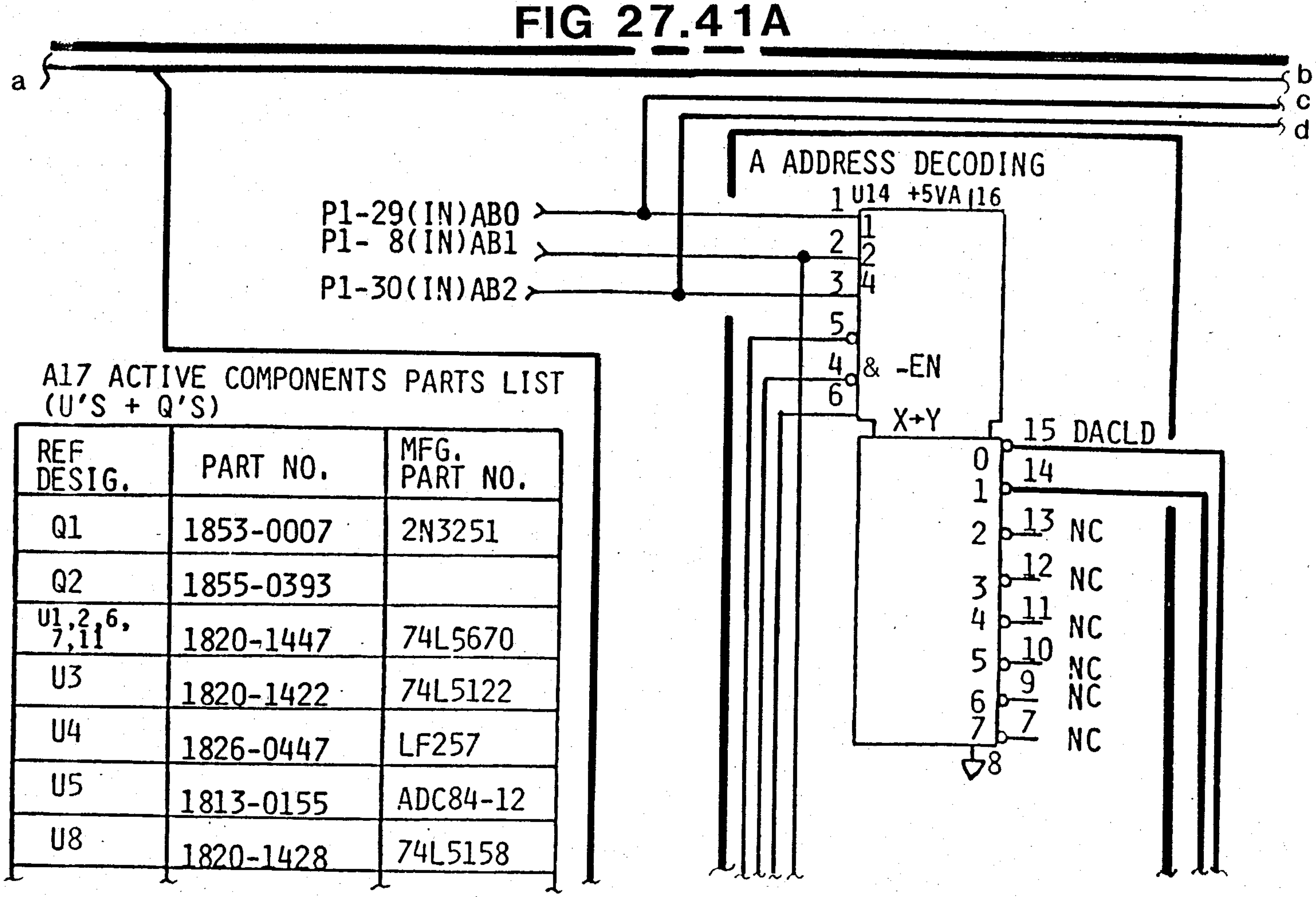
A17 ACTIVE COMPONENTS PARTS LIST
(U'S + Q'S)
| REF DESIG. | PART NO. | MFG. PART NO. |
|---|---|---|
| Q1 | 1853-0007 | 2N3251 |
| Q2 | 1855-0393 | |
| U1,2,6, 7,11 | 1820-1447 | 74LS670 |
| U3 | 1820-1422 | 74LS122 |
| U4 | 1826-0447 | LF257 |
| U5 | 1813-0155 | ADC84-12 |
| U8 | 1820-1428 | 74LS158 |

| | | |
|---|---|---|
| U9 | 1826-0116 | CMP-01 |
| U12 | 1820-2990 | 25L02 |
| U13 | 1820-1975 | 74L5165 |
| U14,16 | 1820-1216 | 74L5138 |
| U17 | 1820-1197 | 74L500 |
| U18 | 1826-0785 | LF353A |
| U19 | 1826-0742 | AD581d |
| U20 | 1820-1112 | 74L574 |
| U15 | 1826-1091 | DAC-08H |
| | | |
| CR1,CR2 | 1901-0539 | |
| CR3 | 1901-1098 | 1N4150 |
| U10 | 1826-0516 | 17F |
| U21 | 1820-2024 | 74L5244 |
| | | |
| | | |
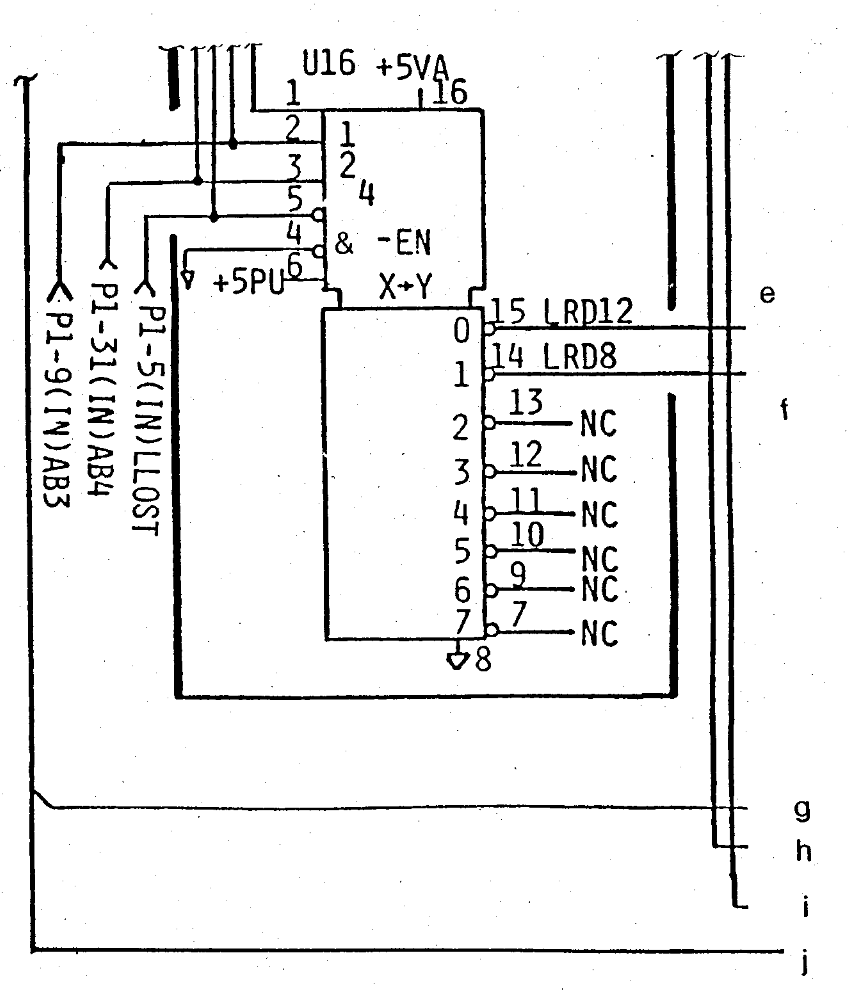
FIG 27.41B

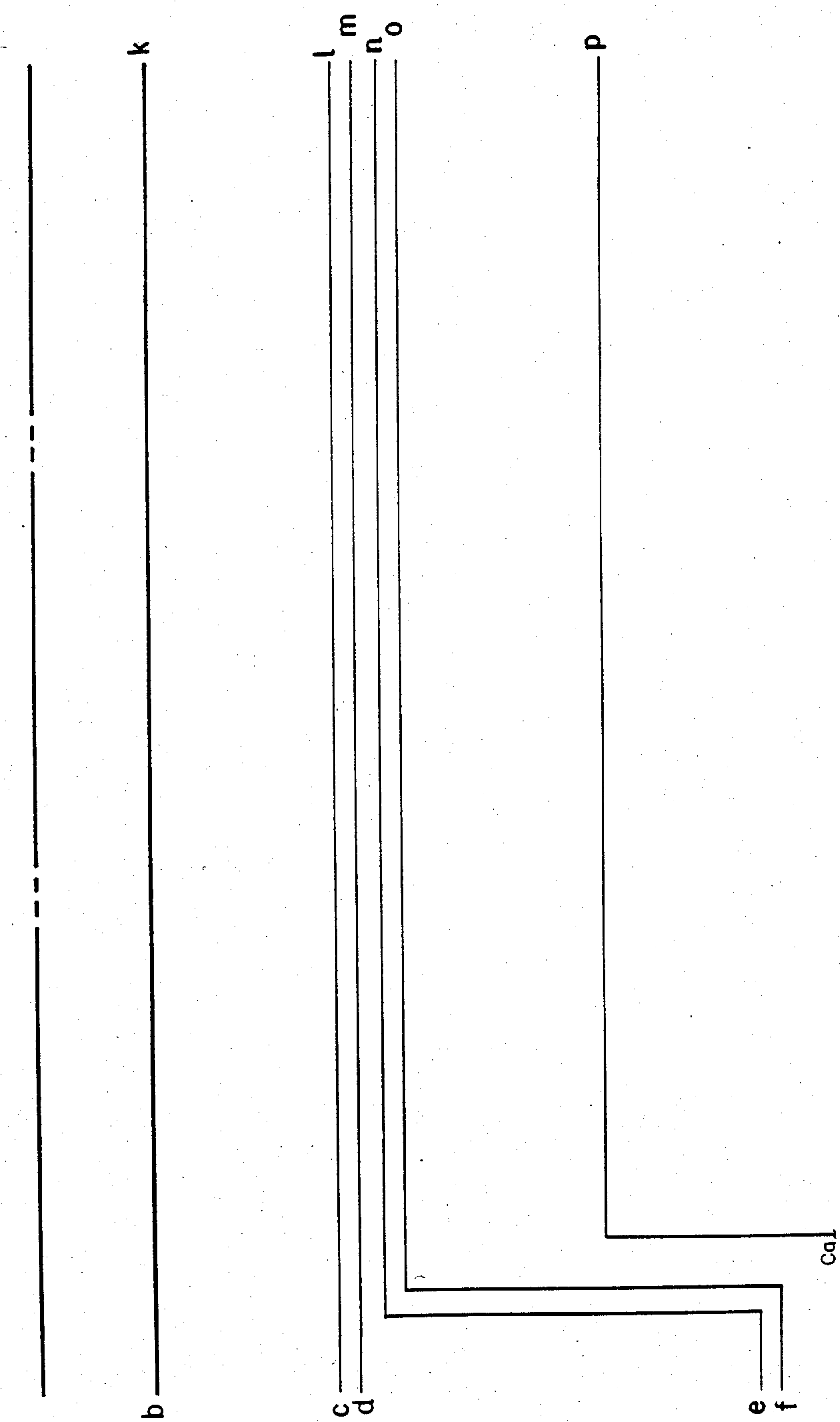
FIG 27.42A

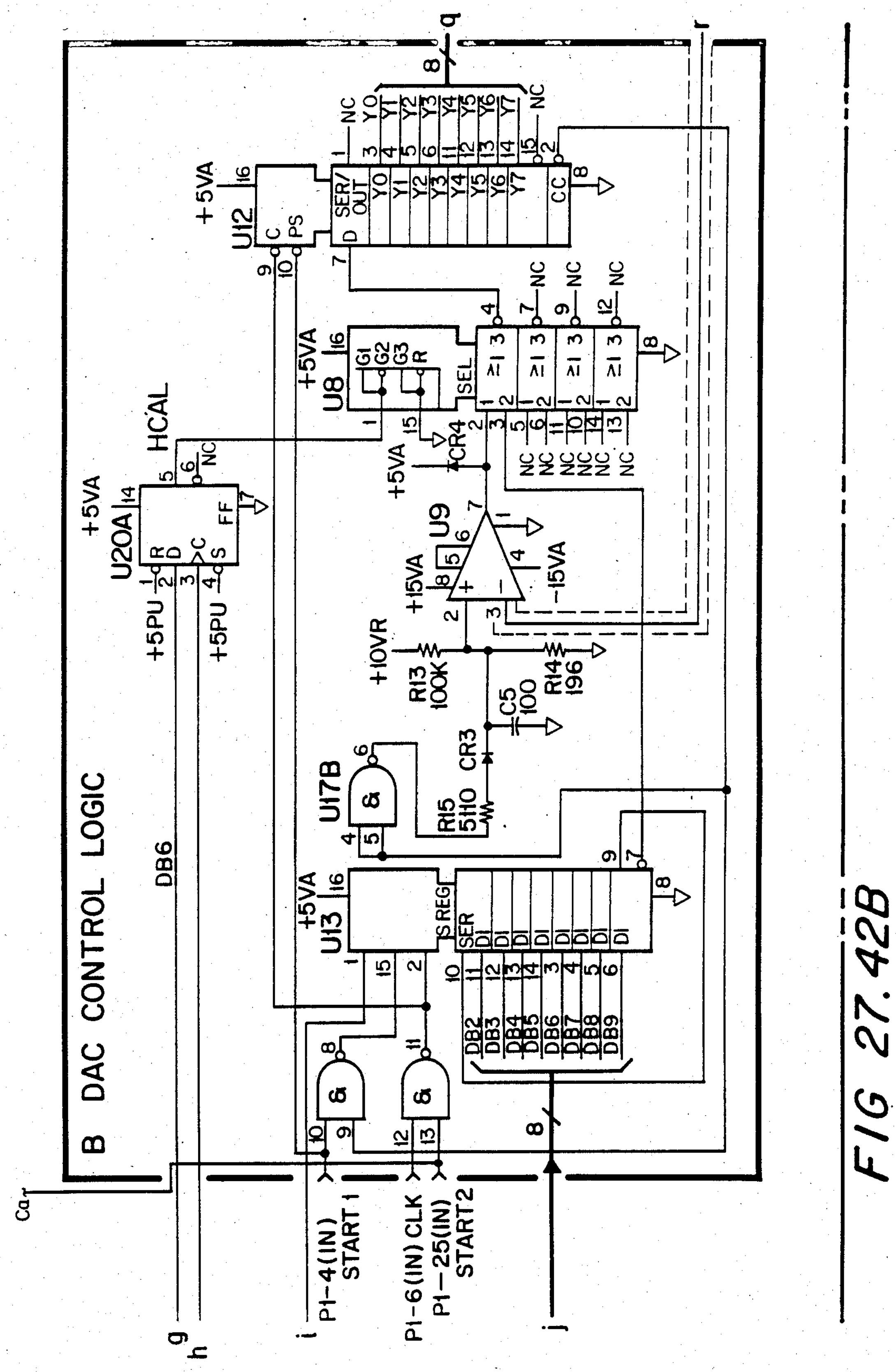
FIG 27.42B

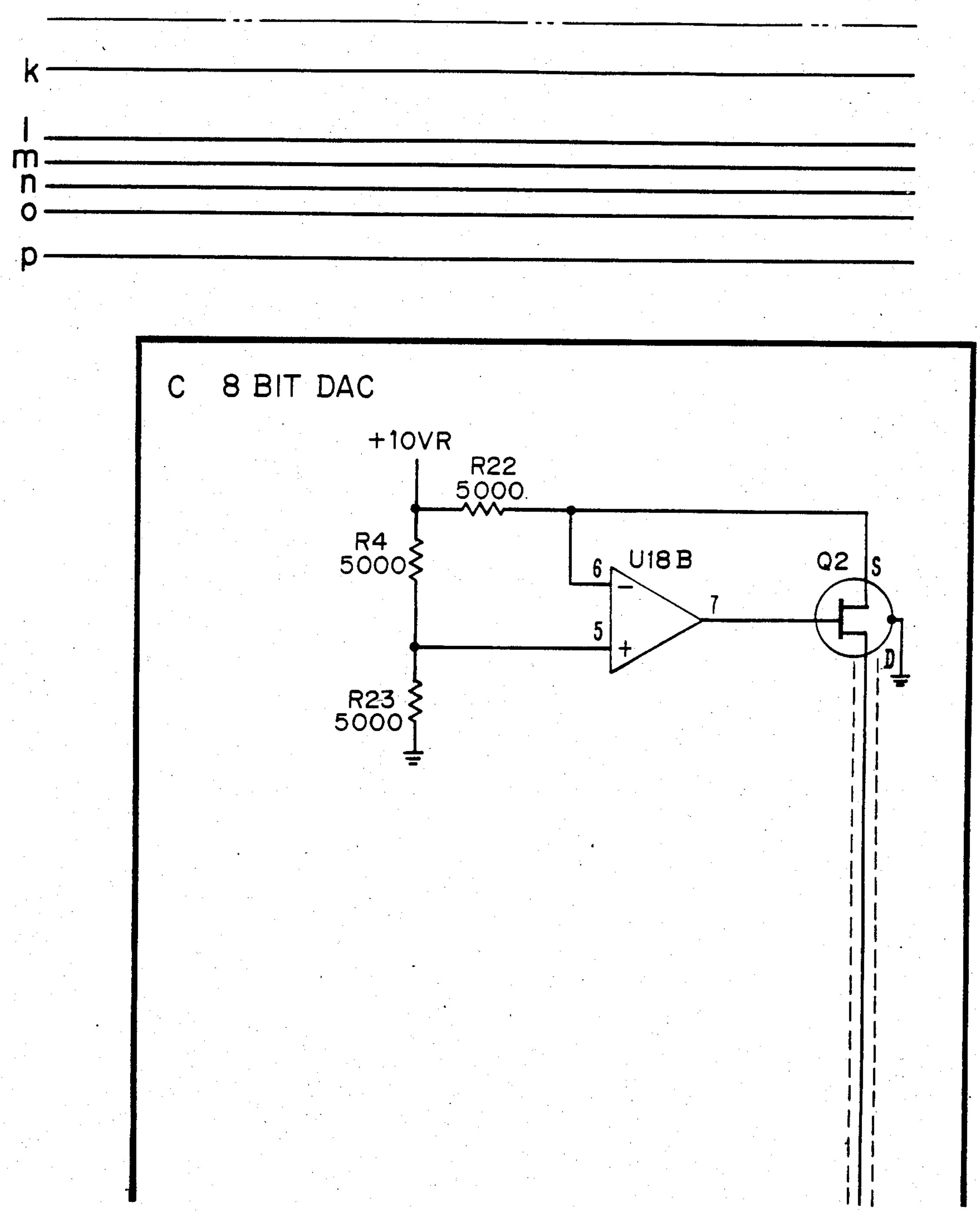
FIG 27.43A

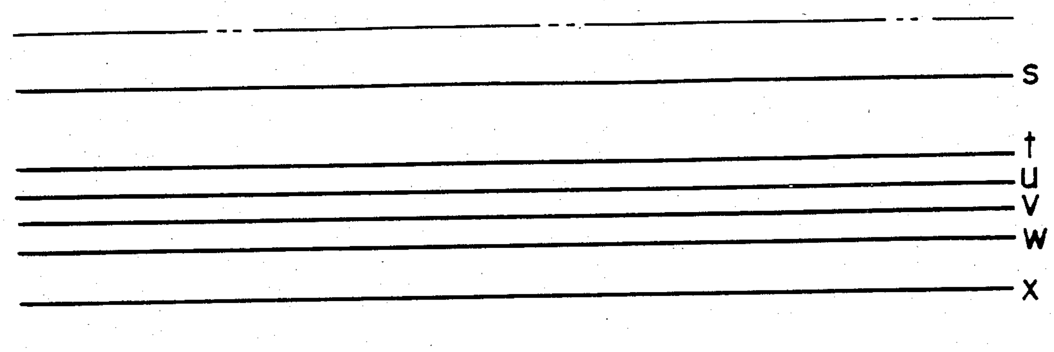
FIG. 27.43B

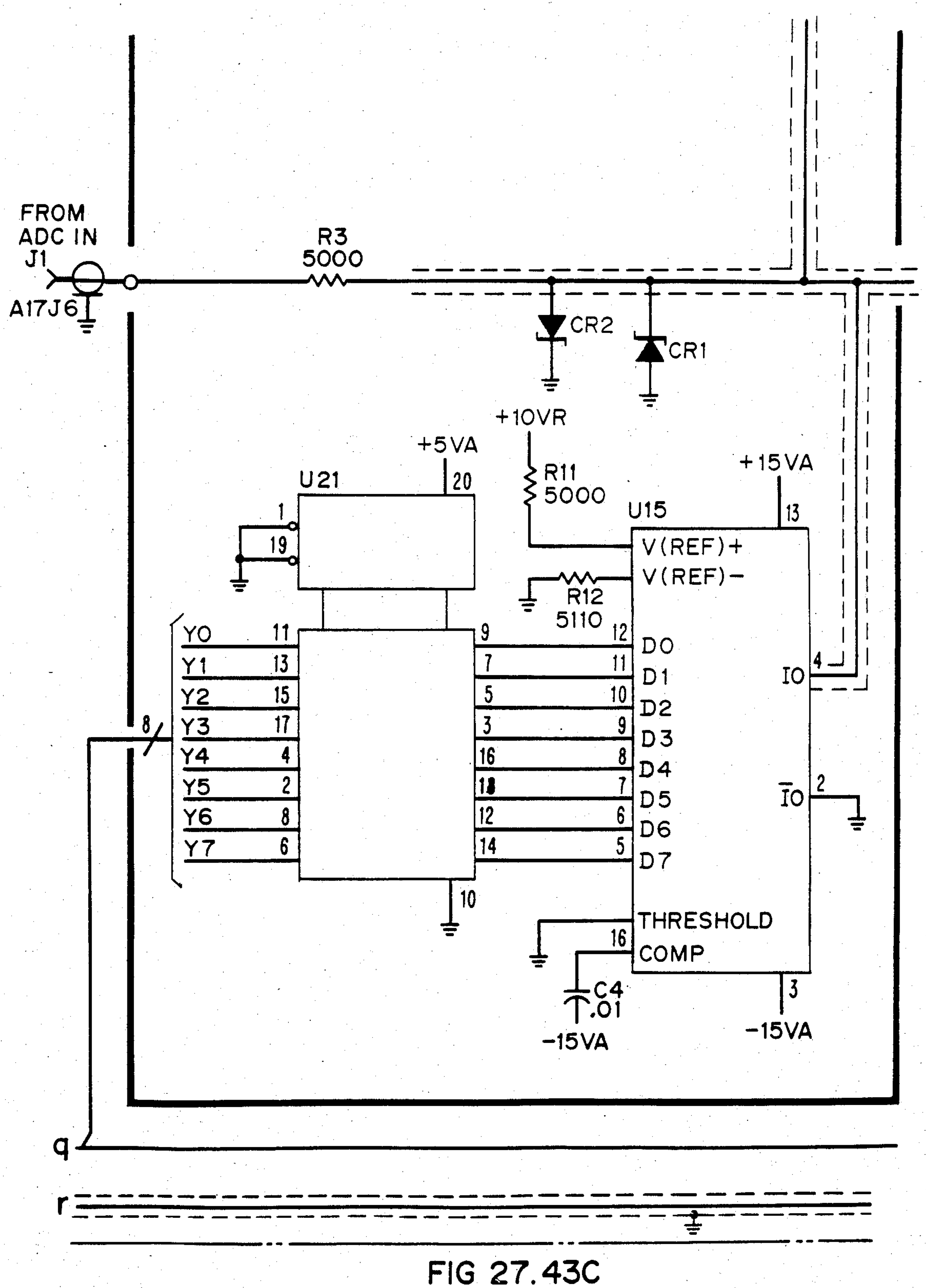
FIG 27.43C

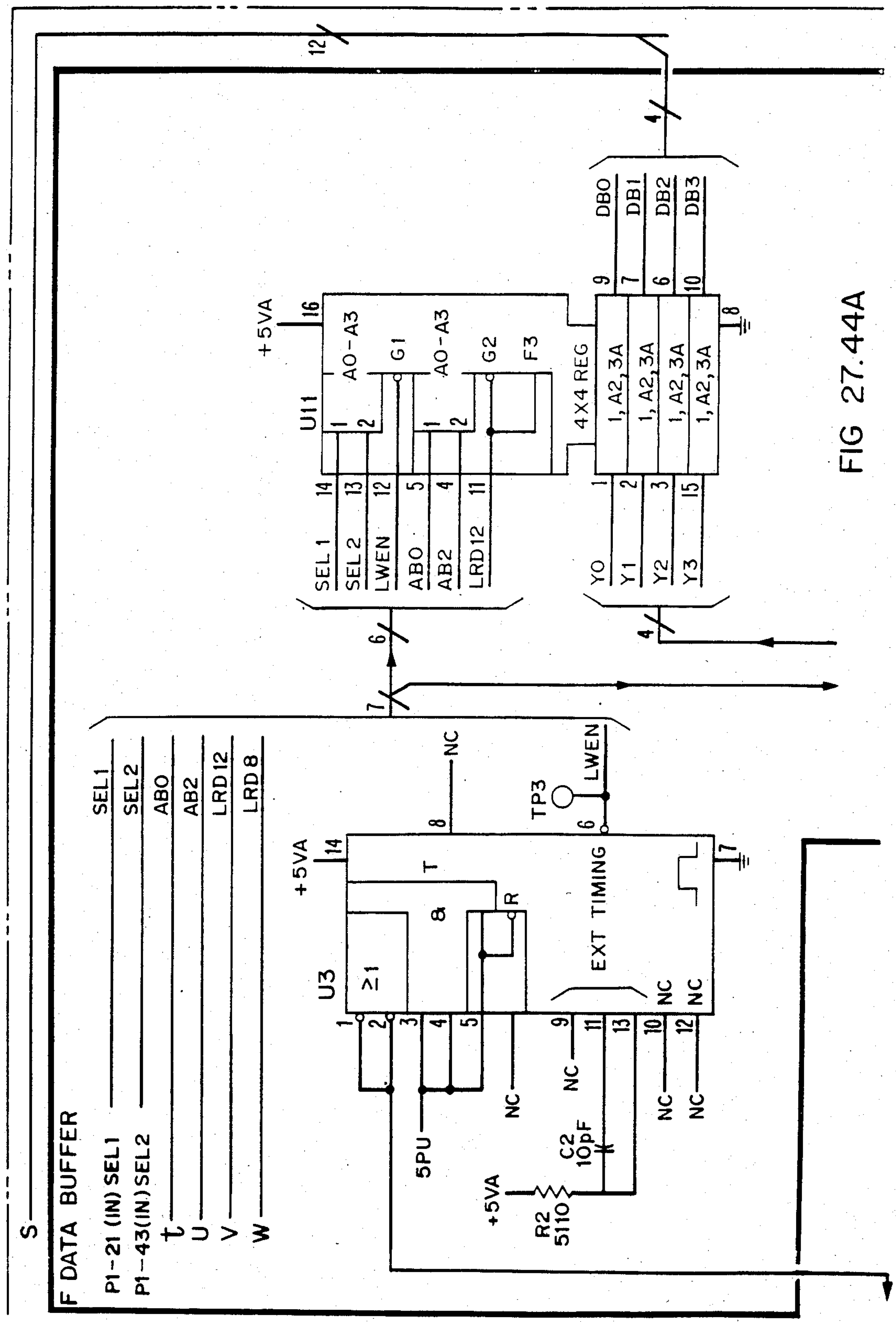
FIG 27.44A

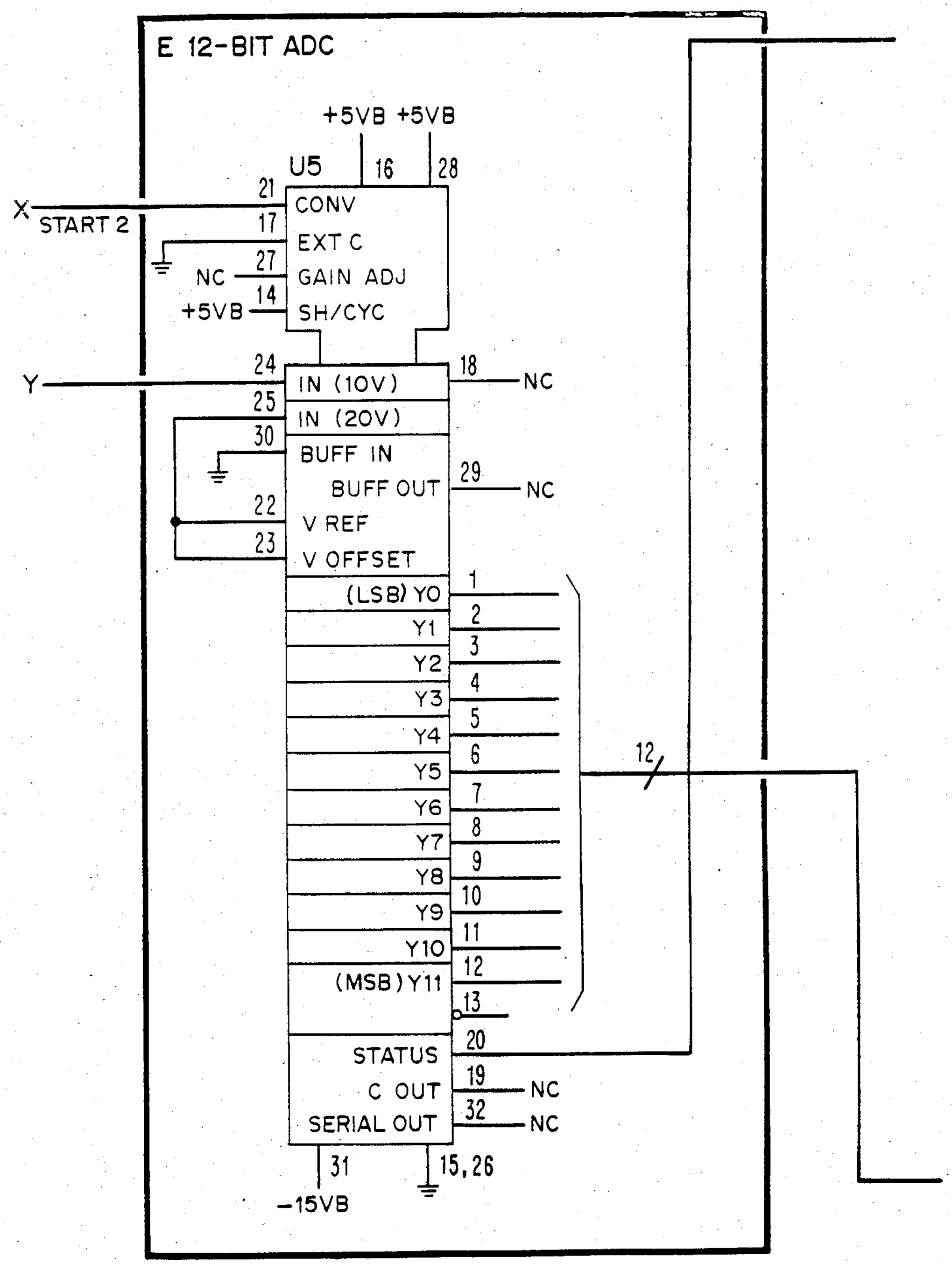
FIG 27.44B

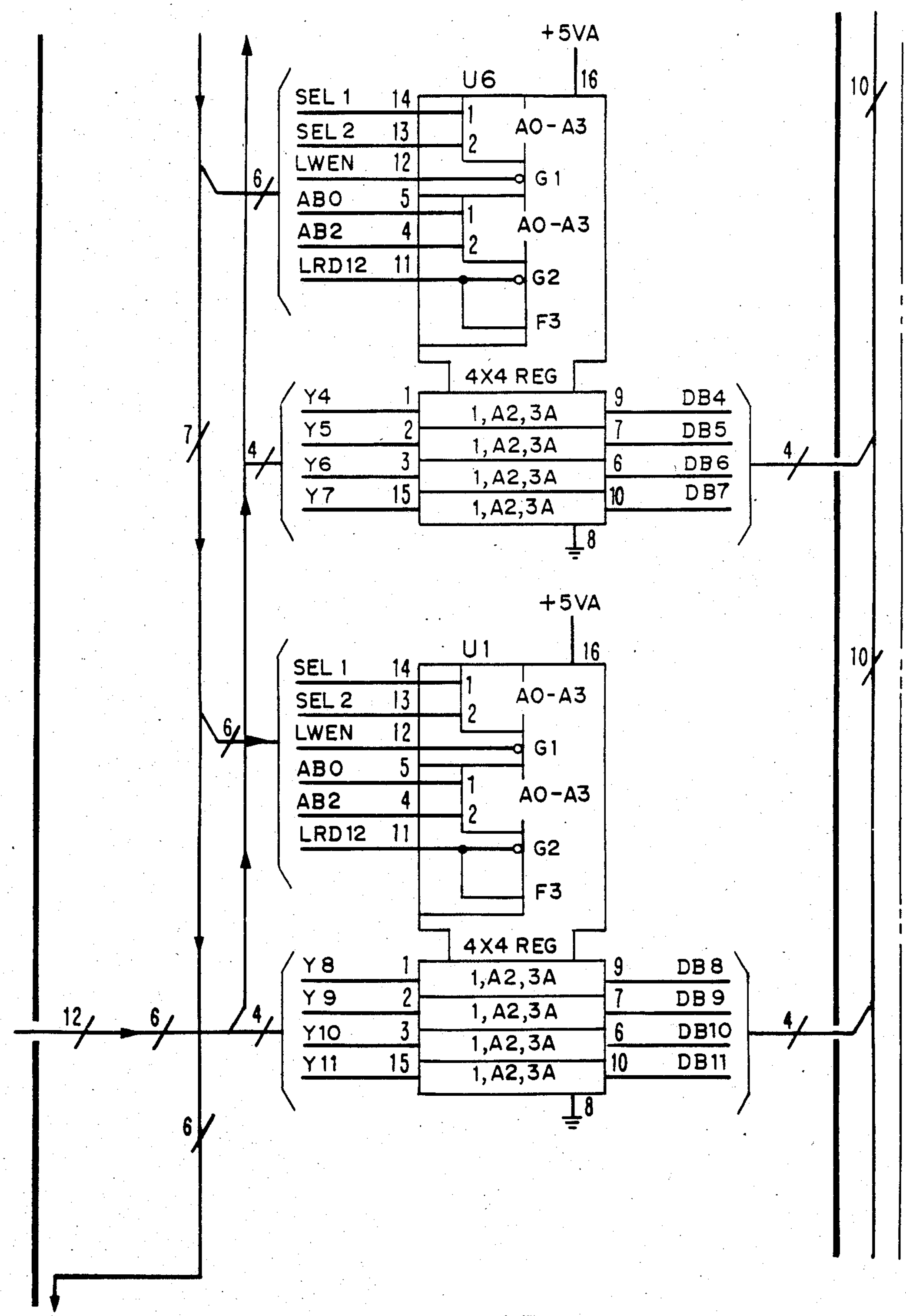
FIG 27.44C

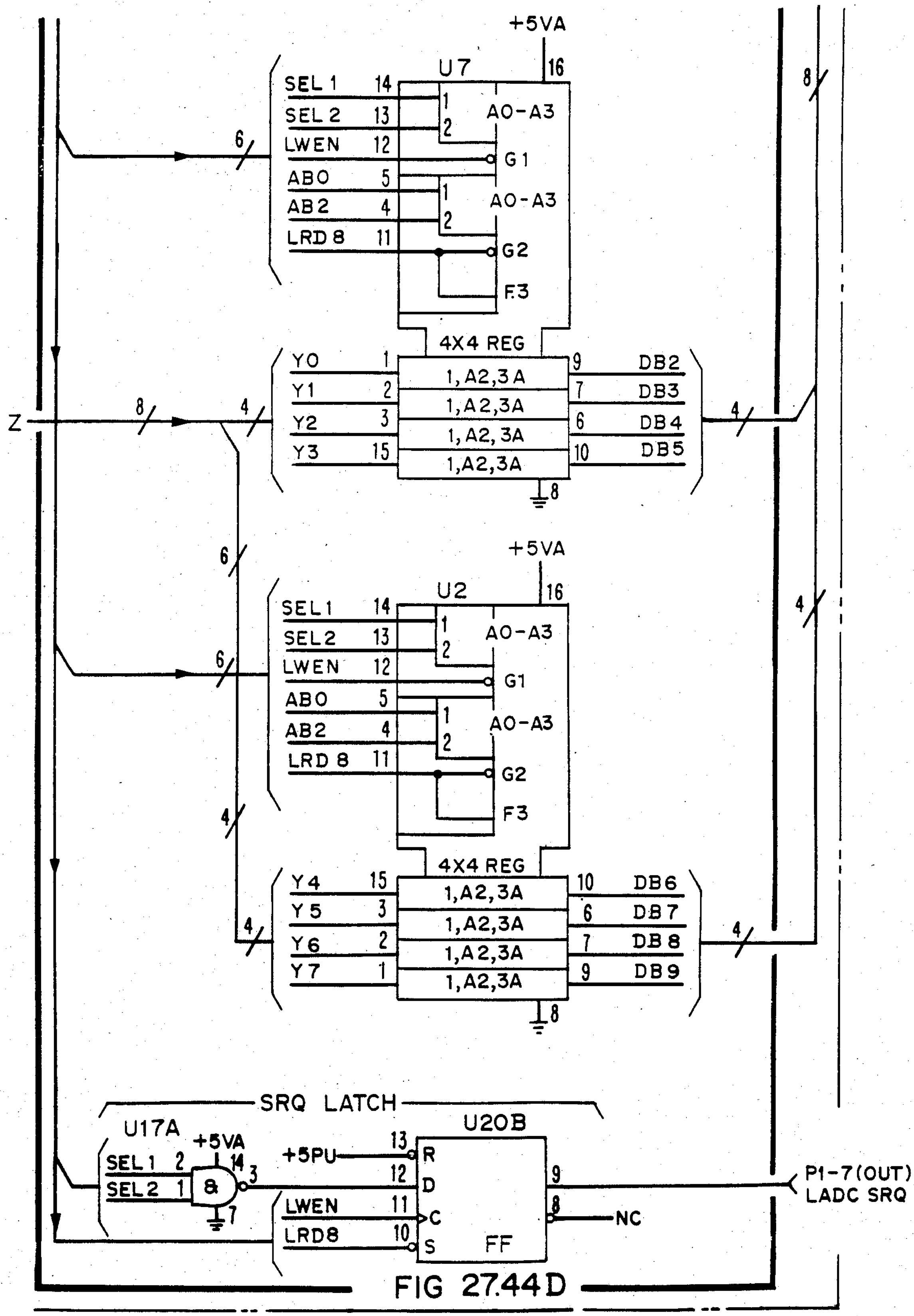
FIG 27.44D

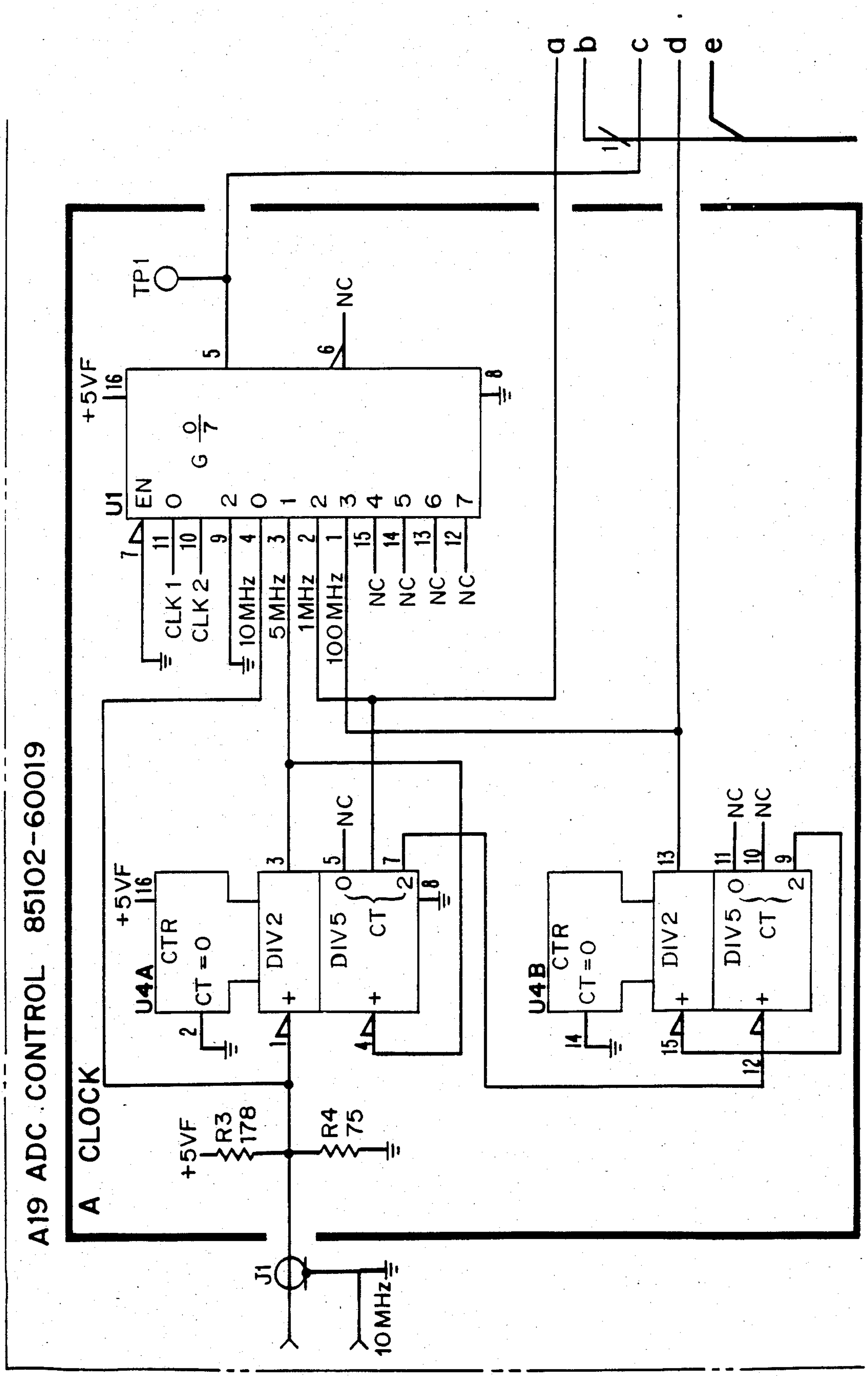
FIG 27.46A

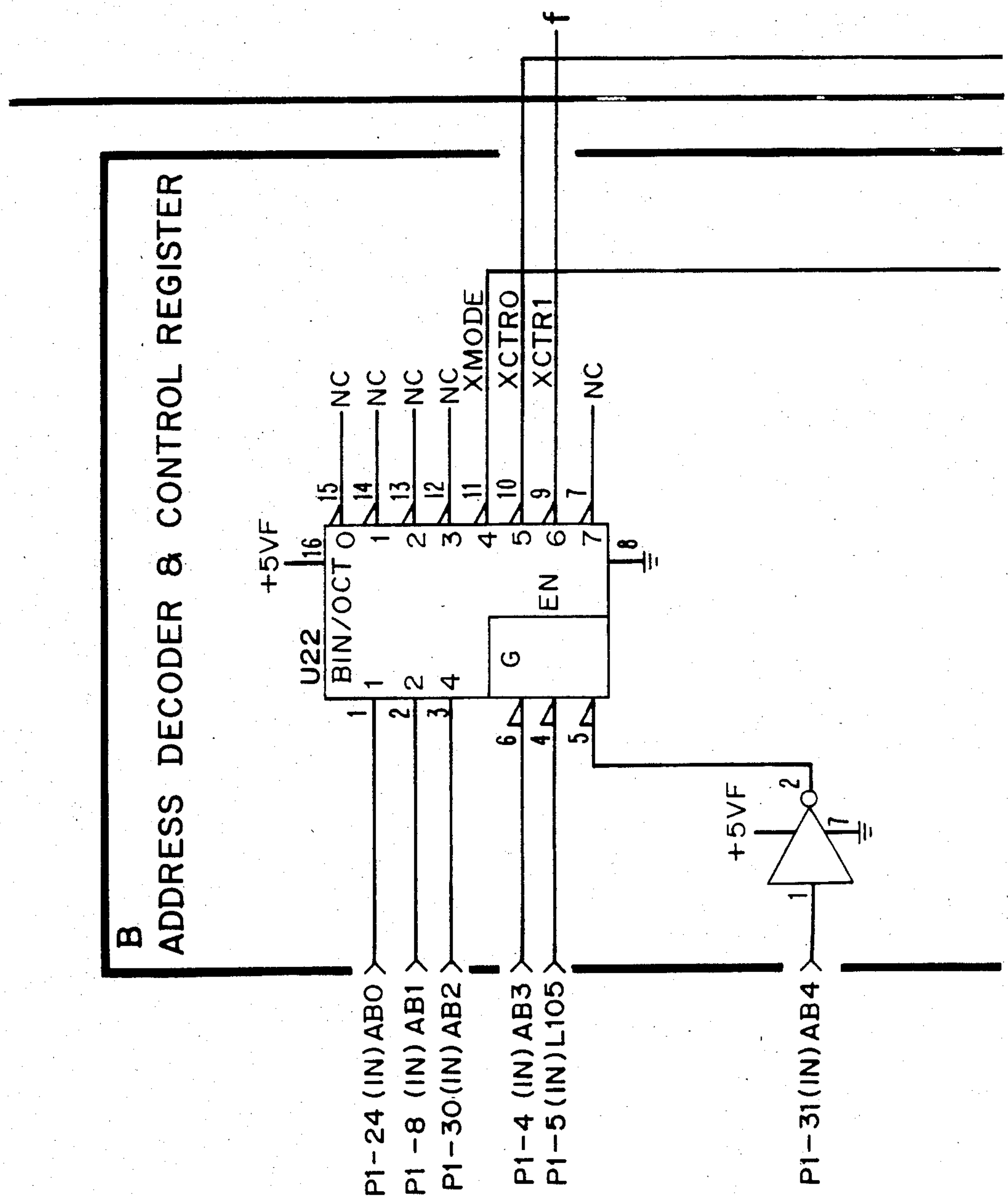
FIG 27.46B

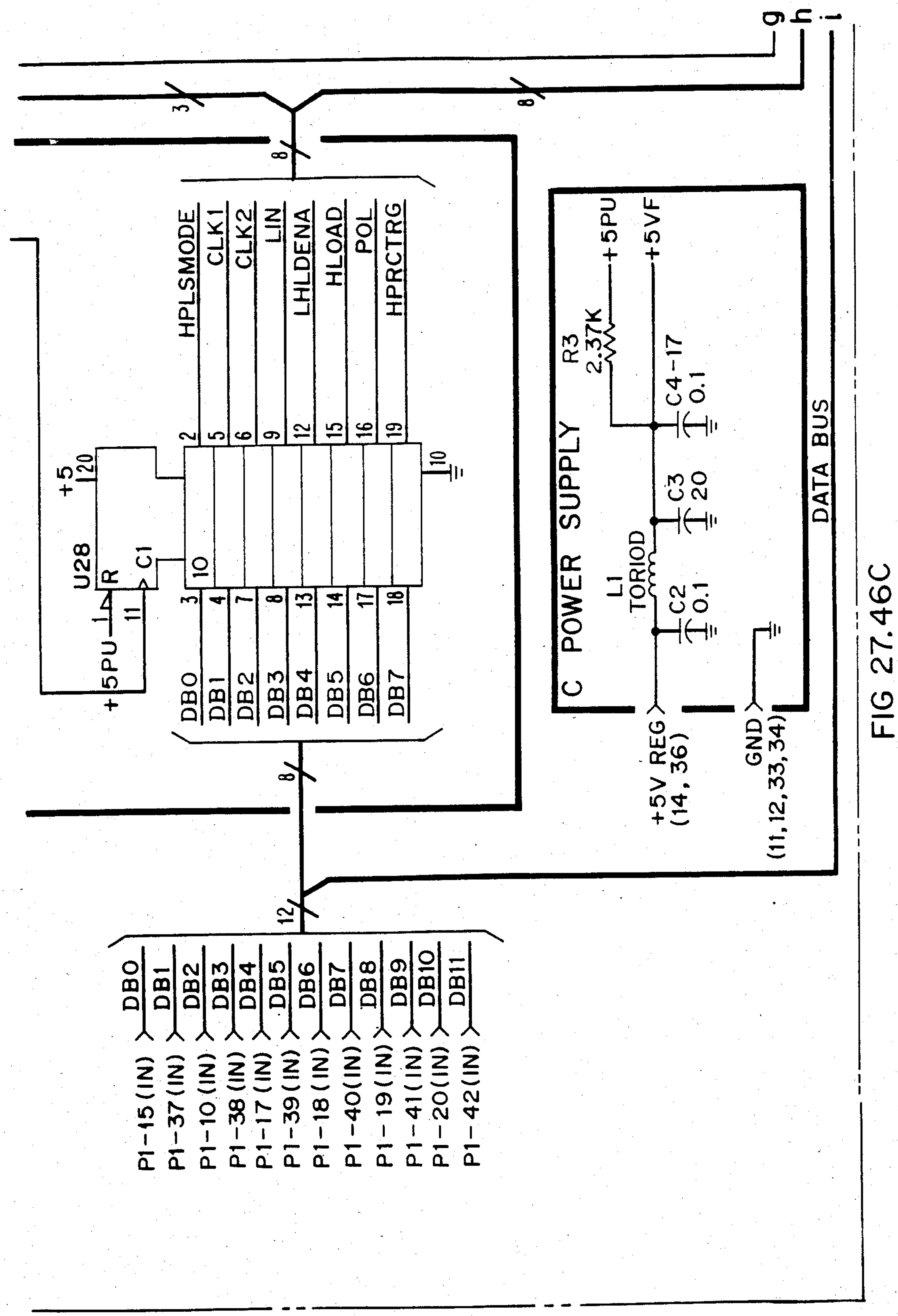
FIG 27.46C

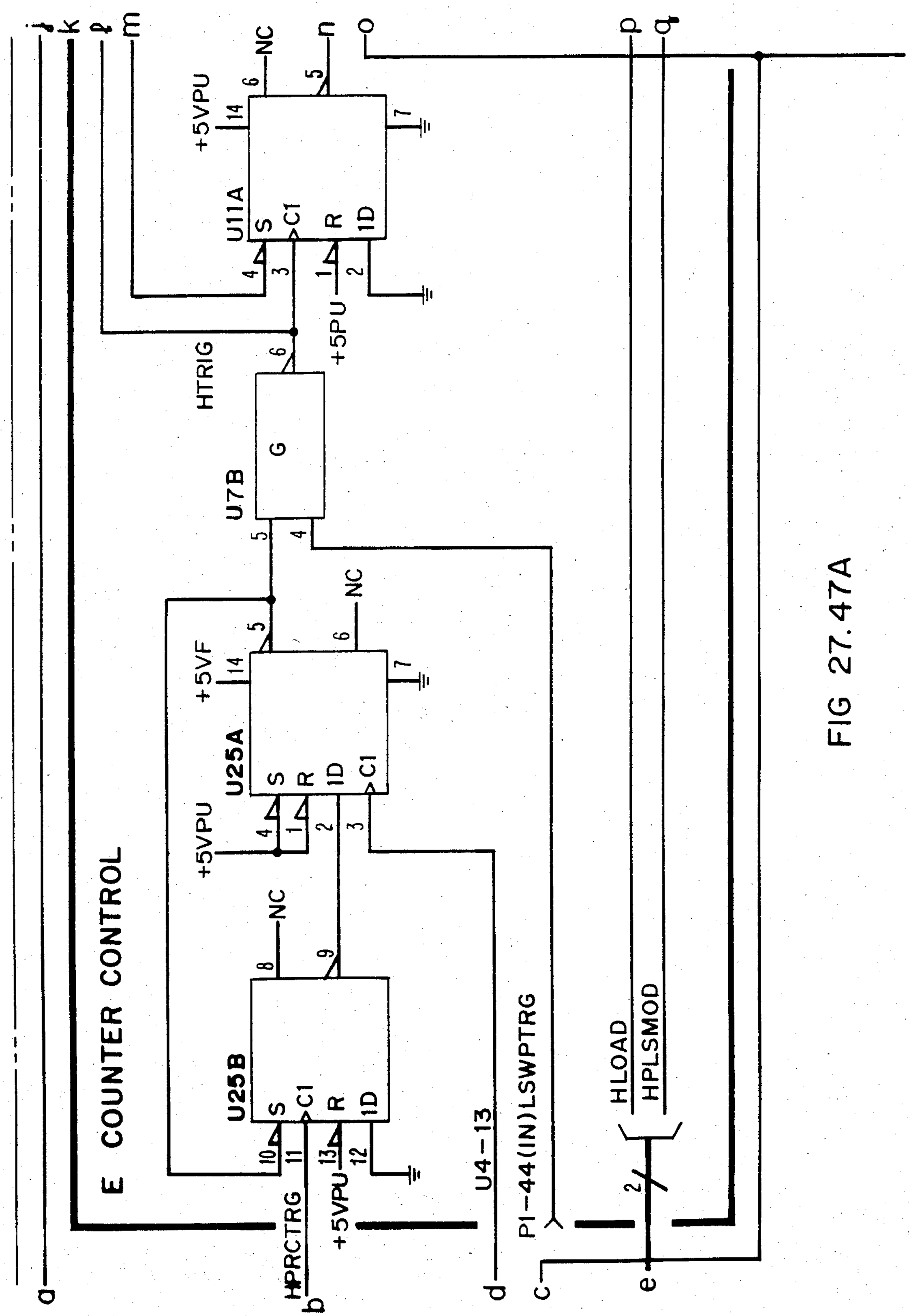
FIG 27.47A

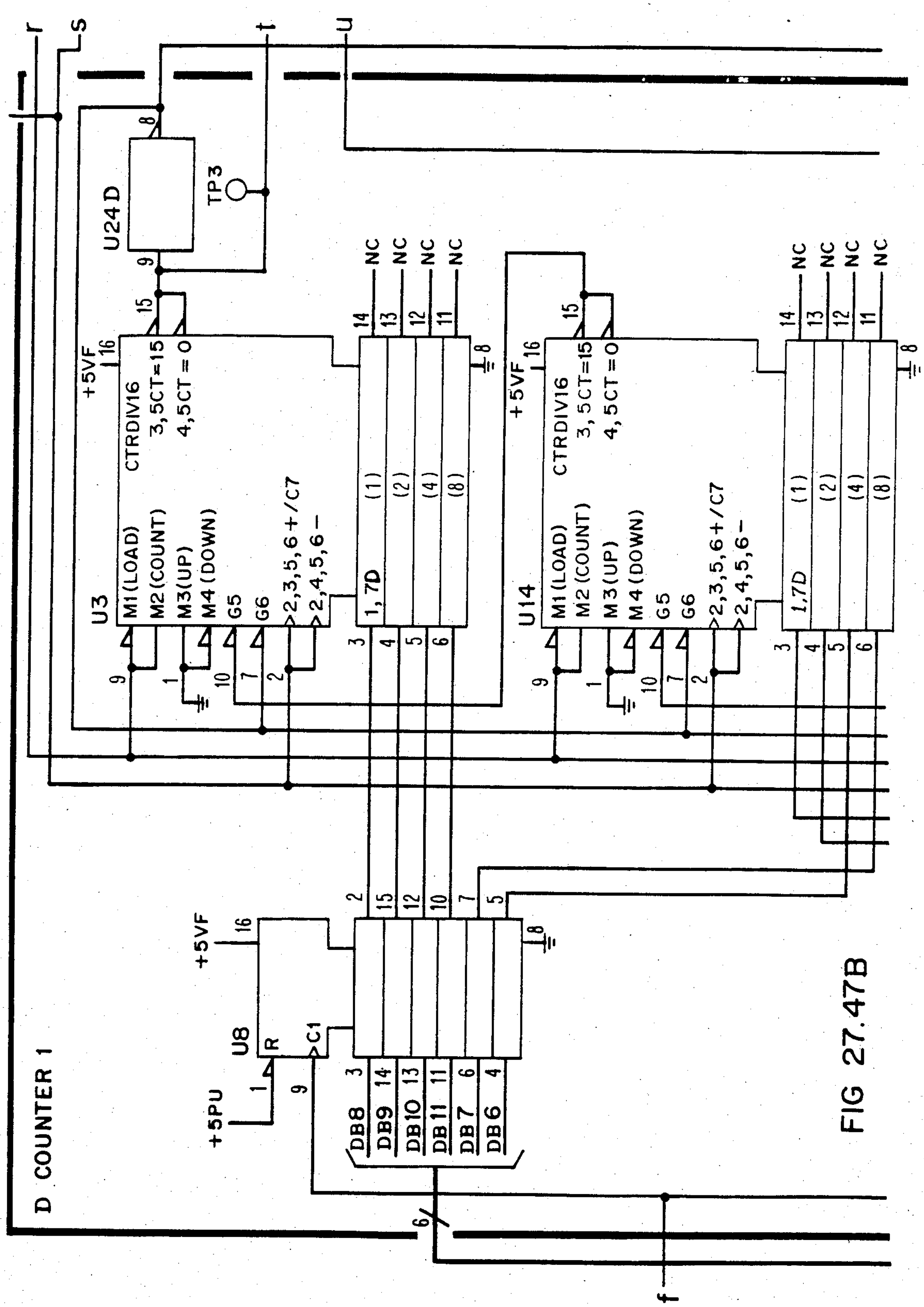
FIG 27.47B

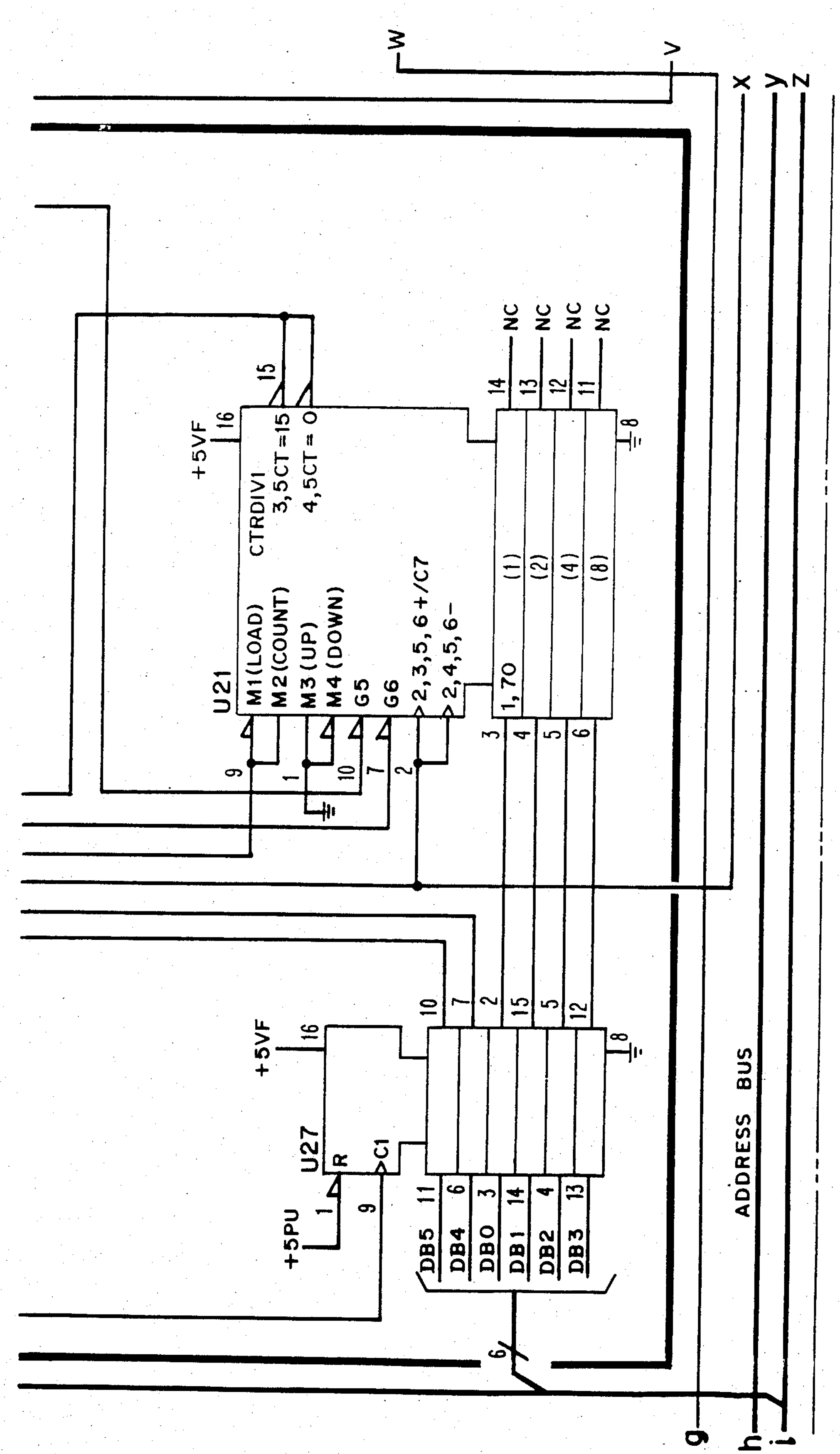
FIG 27.47C

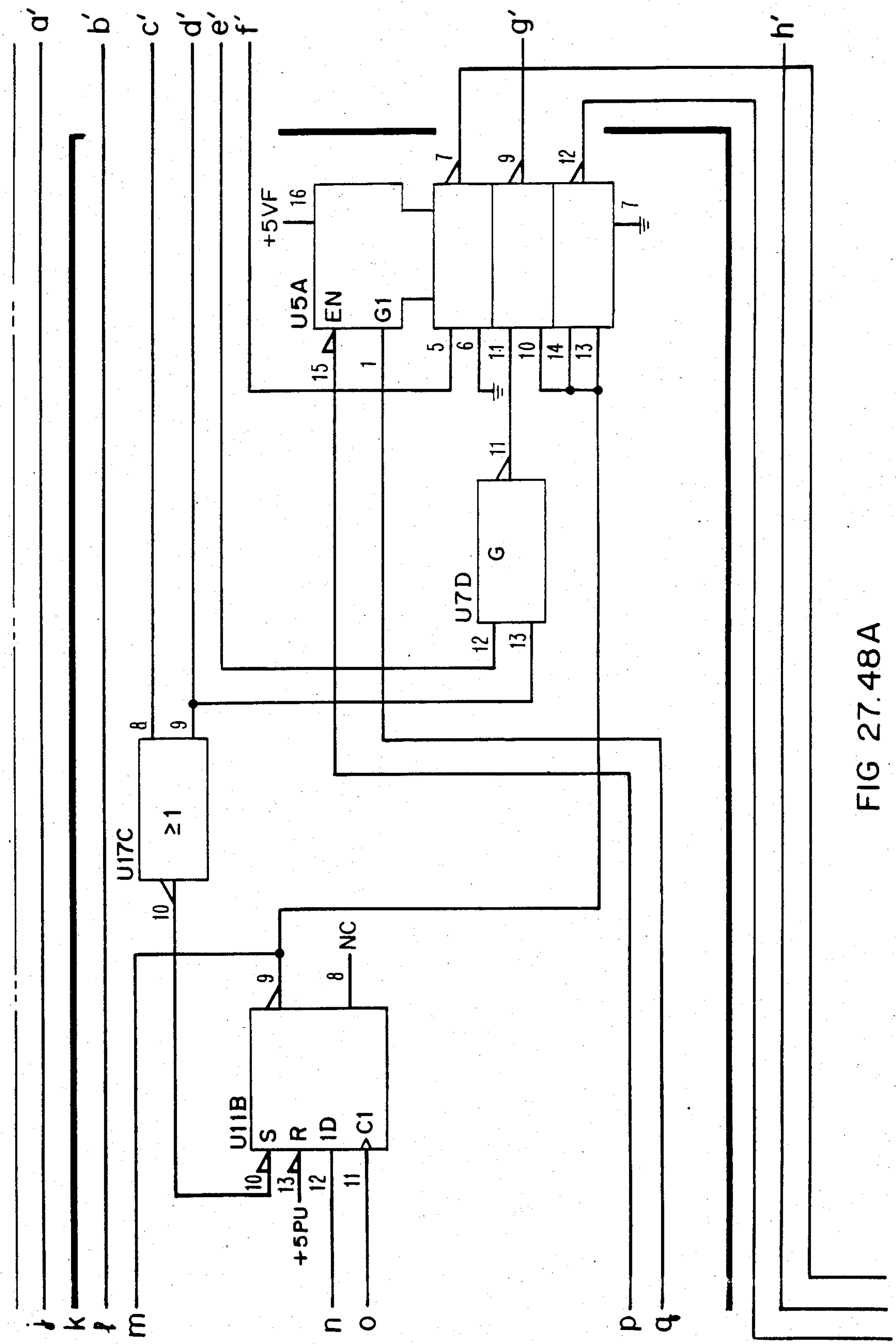
FIG 27.48A

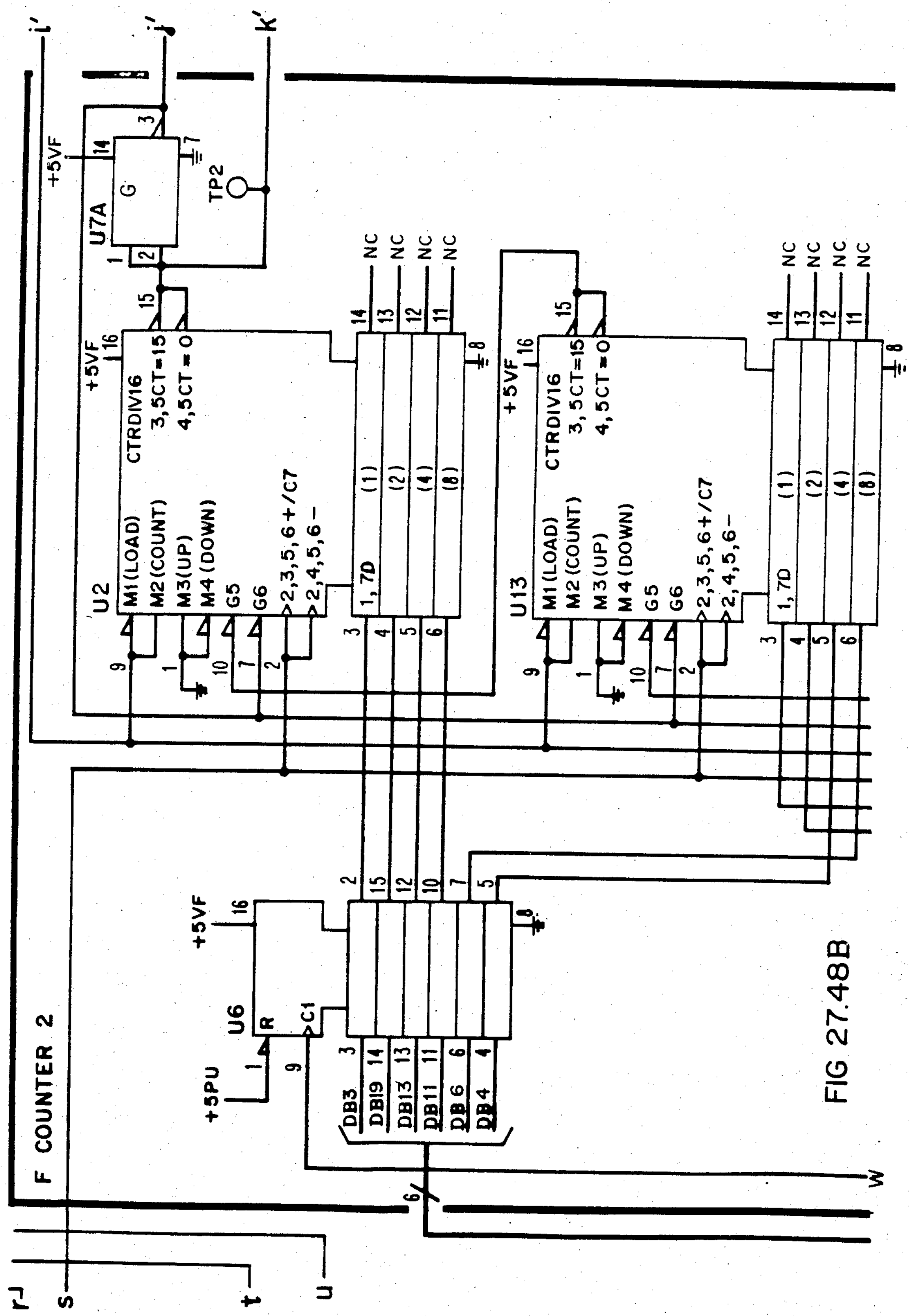
FIG 27.48B

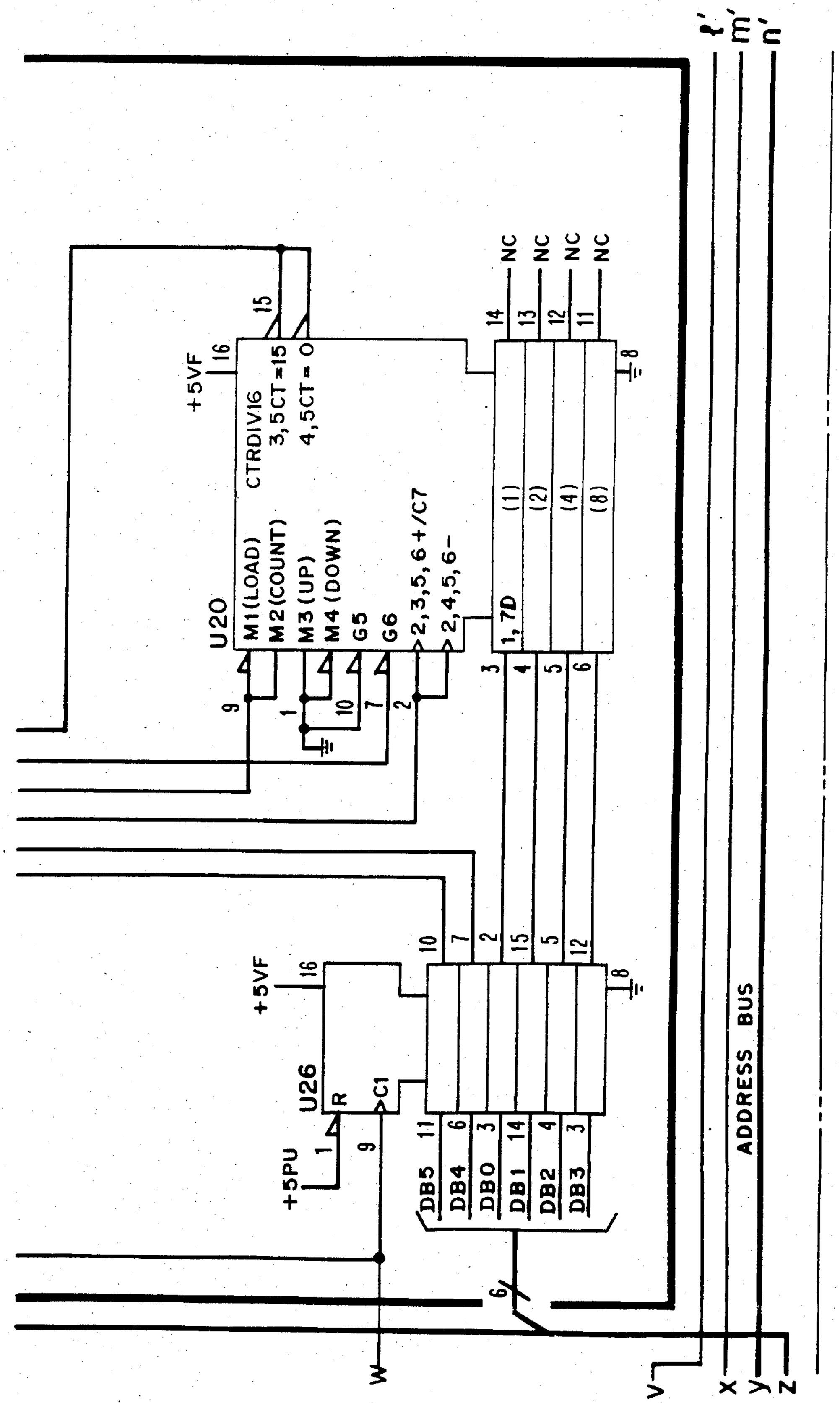
FIG 27.48C

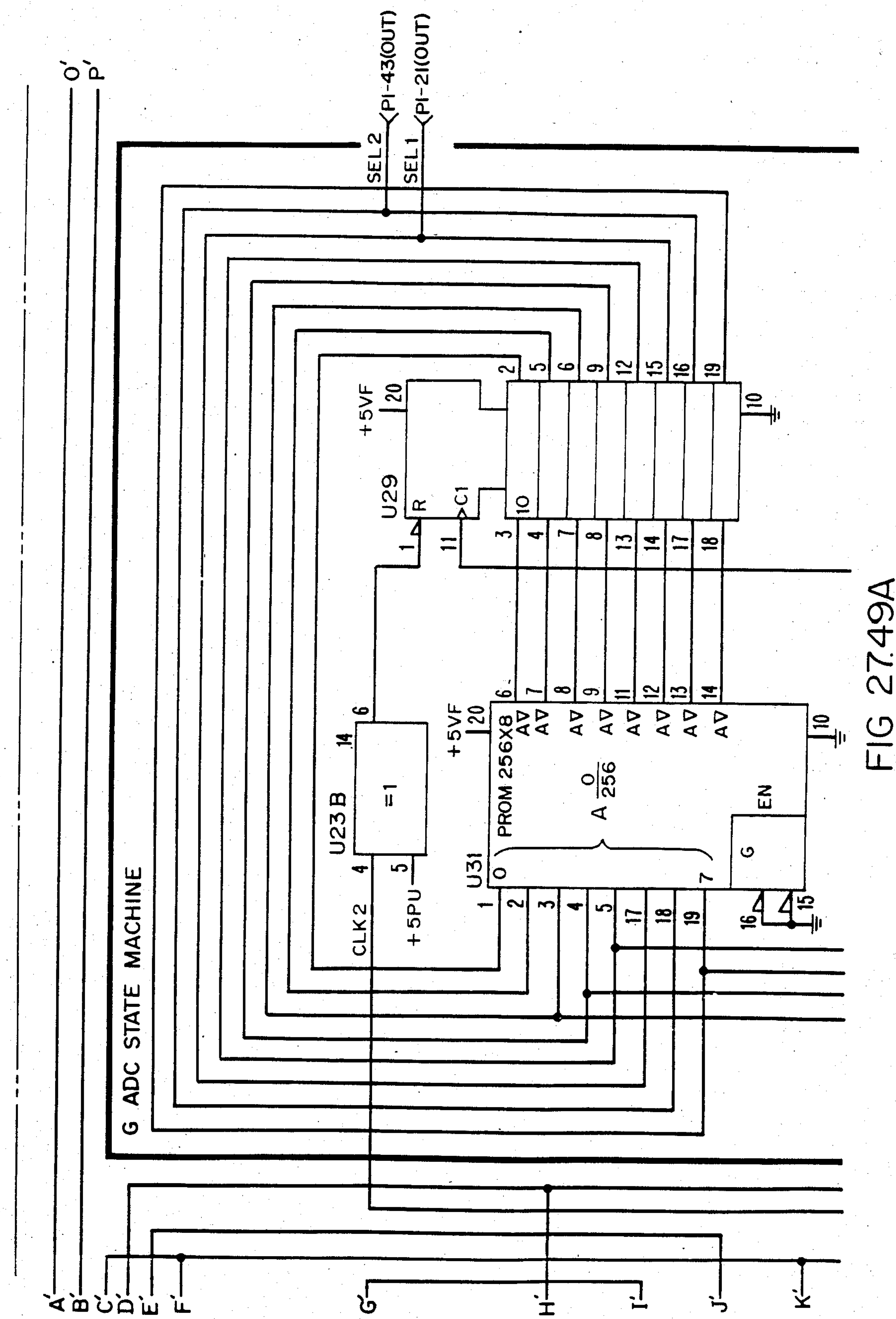
FIG 27.49A

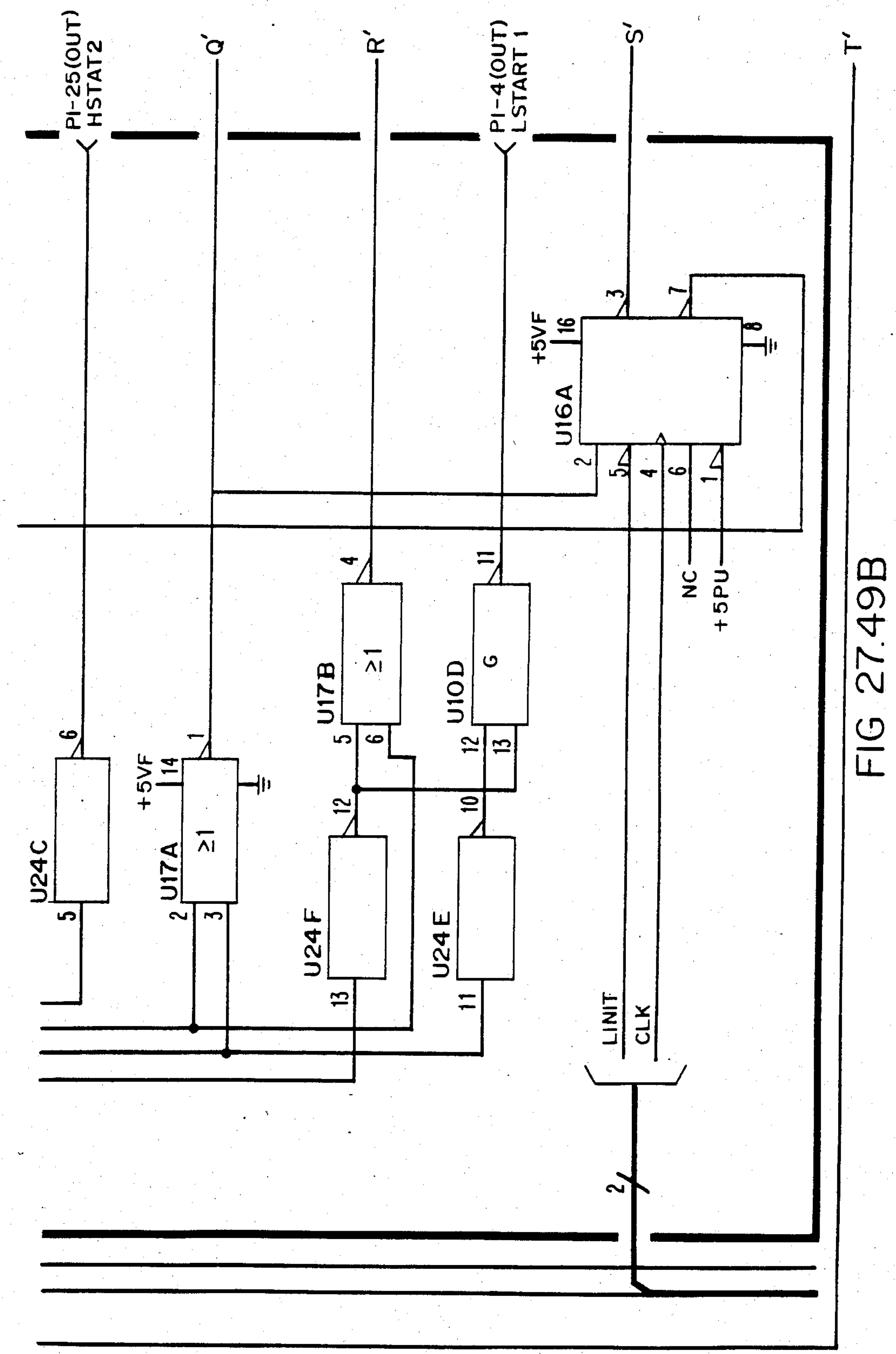
FIG 27.49B

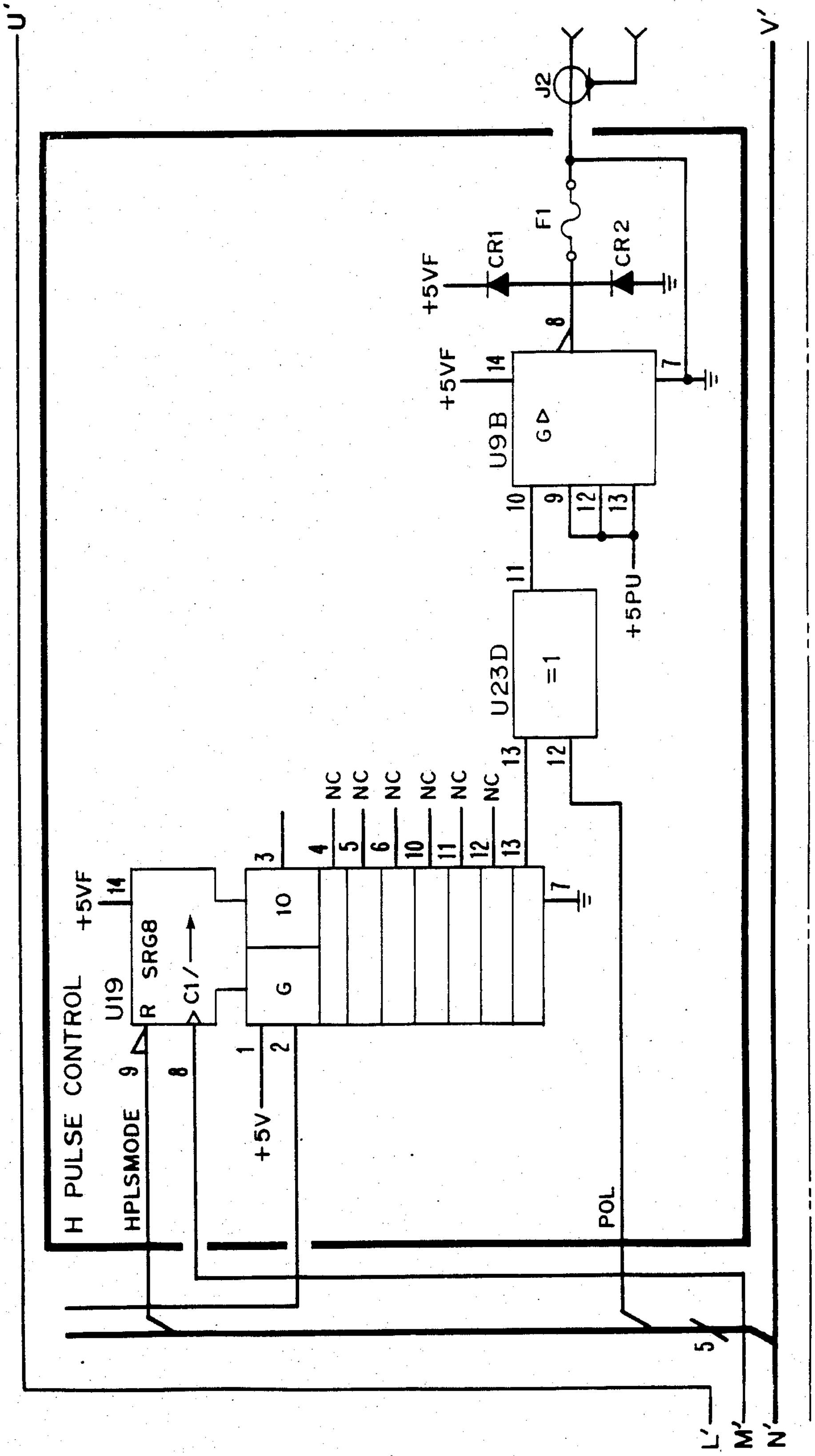
FIG 27.49C

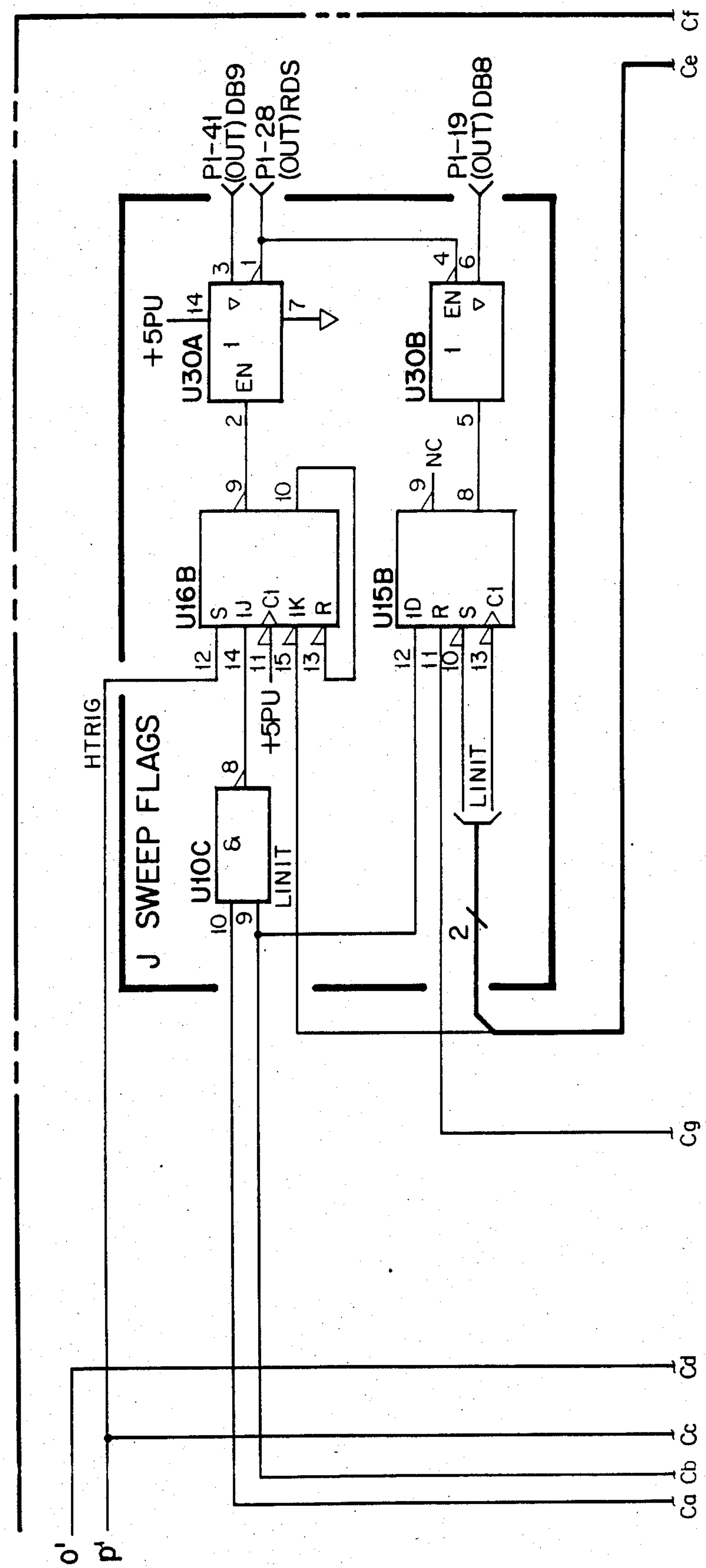
FIG 27.50A

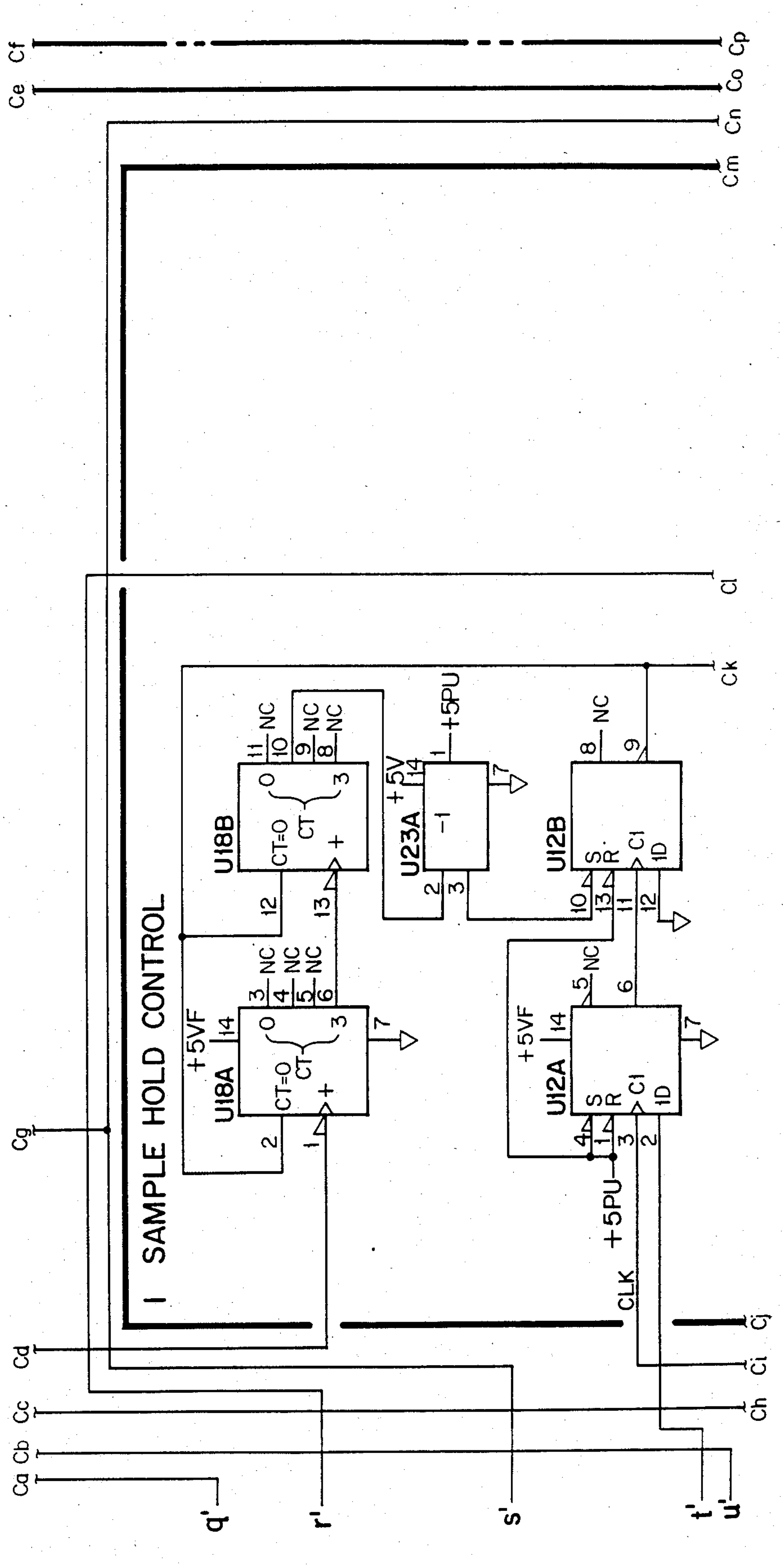
FIG 27.50B

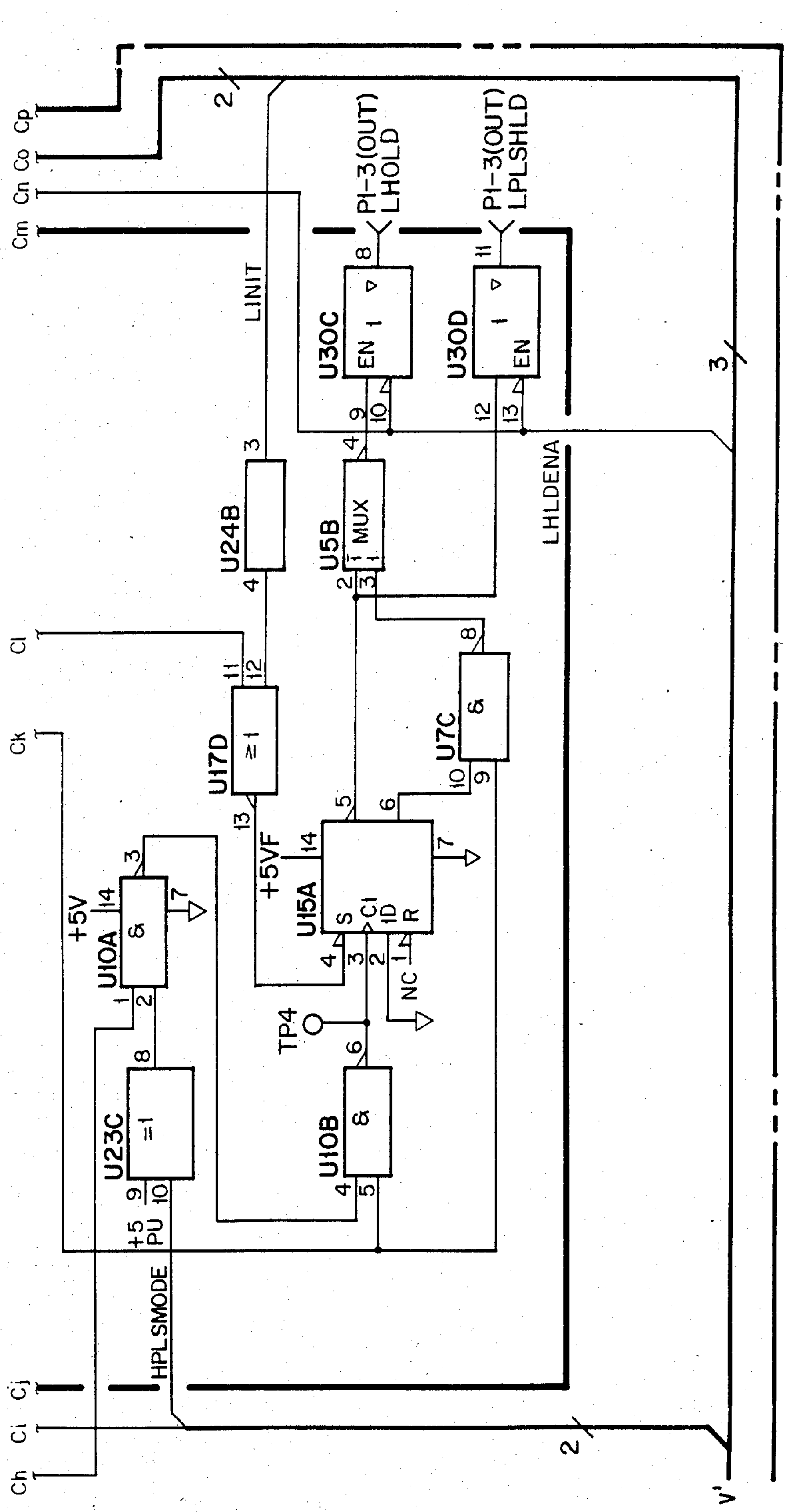
FIG 27.50C

FIG 27.51
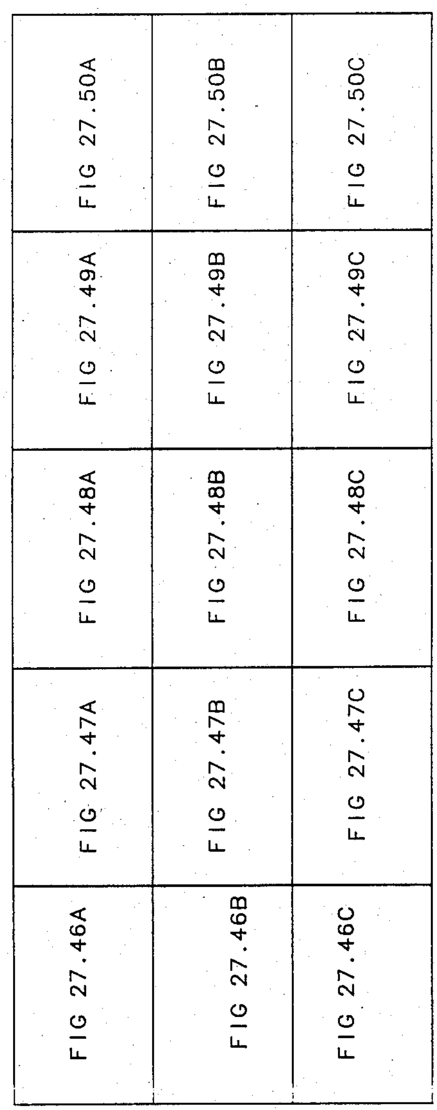
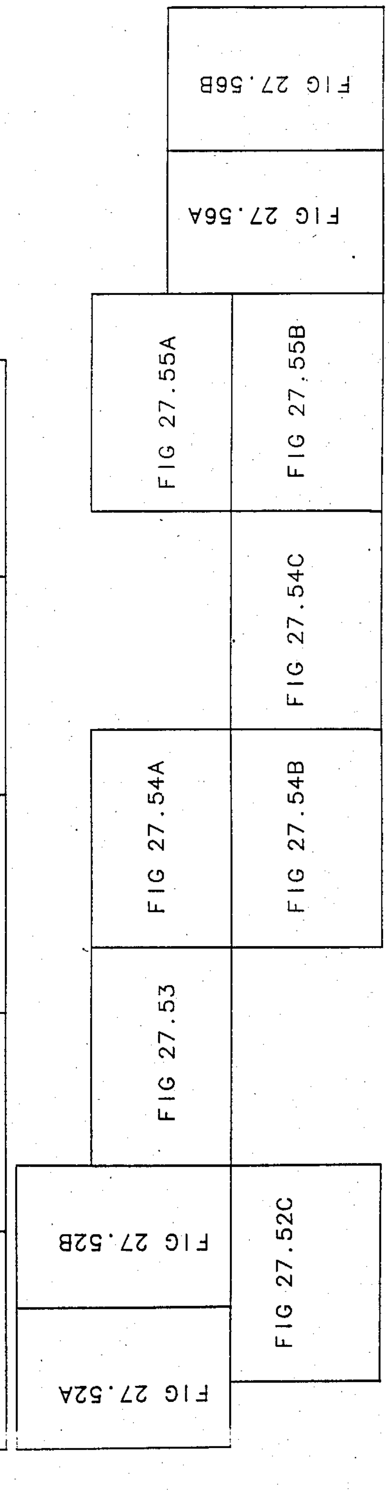
FIG 27.57

Cc

A20 SWEEP ADC
85102-60020

| PIN | SIGNAL | TO/FROM | FUNCTION BLOCK |
|---|---|---|---|
| 1<br>23 | | | |
| 2<br>24 | +10VR<br>LSS | A18<br>A24 | NOT USED |
| 3<br>25 | | | |
| 4<br>26 | | | |
| 5<br>27 | LLOST<br>LIFSRQ | ADR BUSS<br>A24 | |
| 6<br>28 | CLK<br>LRDS | A6<br>A24 | |
| 7<br>29 | LADCSRQ<br>ABO | A24<br>ADR BUSS | NOT USED |
| 8<br>30 | AB1<br>AB2 | "<br>" | |
| 9<br>31 | AB3<br>AB4 | "<br>" | |
| 10<br>32 | +15V REG<br>+15V REG | POWER<br>BUSS | |
| 11<br>33 | GND<br>GND | | |
| 12<br>34 | GND<br>GND | | |
| 13<br>35 | -15V REG<br>-15V REG | POWER<br>BUSS | |
| 14<br>36 | +5V REG<br>+5V REG | "<br>" | |
| 15<br>37 | DBO<br>DB1 | DATA<br>BUSS | |
| 16<br>38 | DB2<br>DB3 | "<br>" | |
| 17<br>39 | DB4<br>DB5 | "<br>" | |
| 18<br>40 | DB6<br>DB7 | "<br>" | |
| 19<br>41 | DB8<br>DB9 | "<br>" | |
| 20<br>42 | DB10<br>DB11 | "<br>" | |
| 21<br>43 | | | |
| 22<br>44 | LSWPTRG | A19 | |

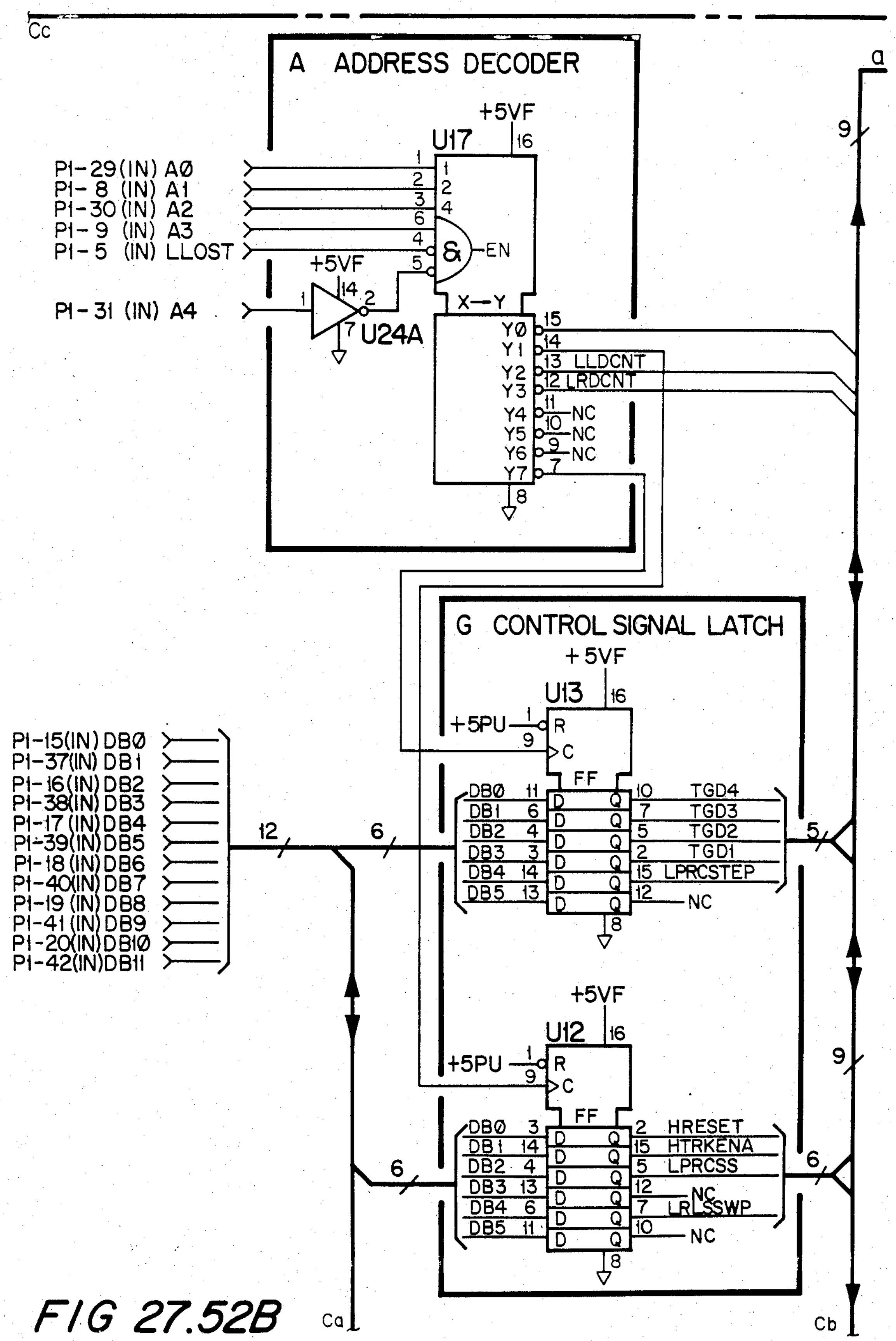
FIG 27.52B

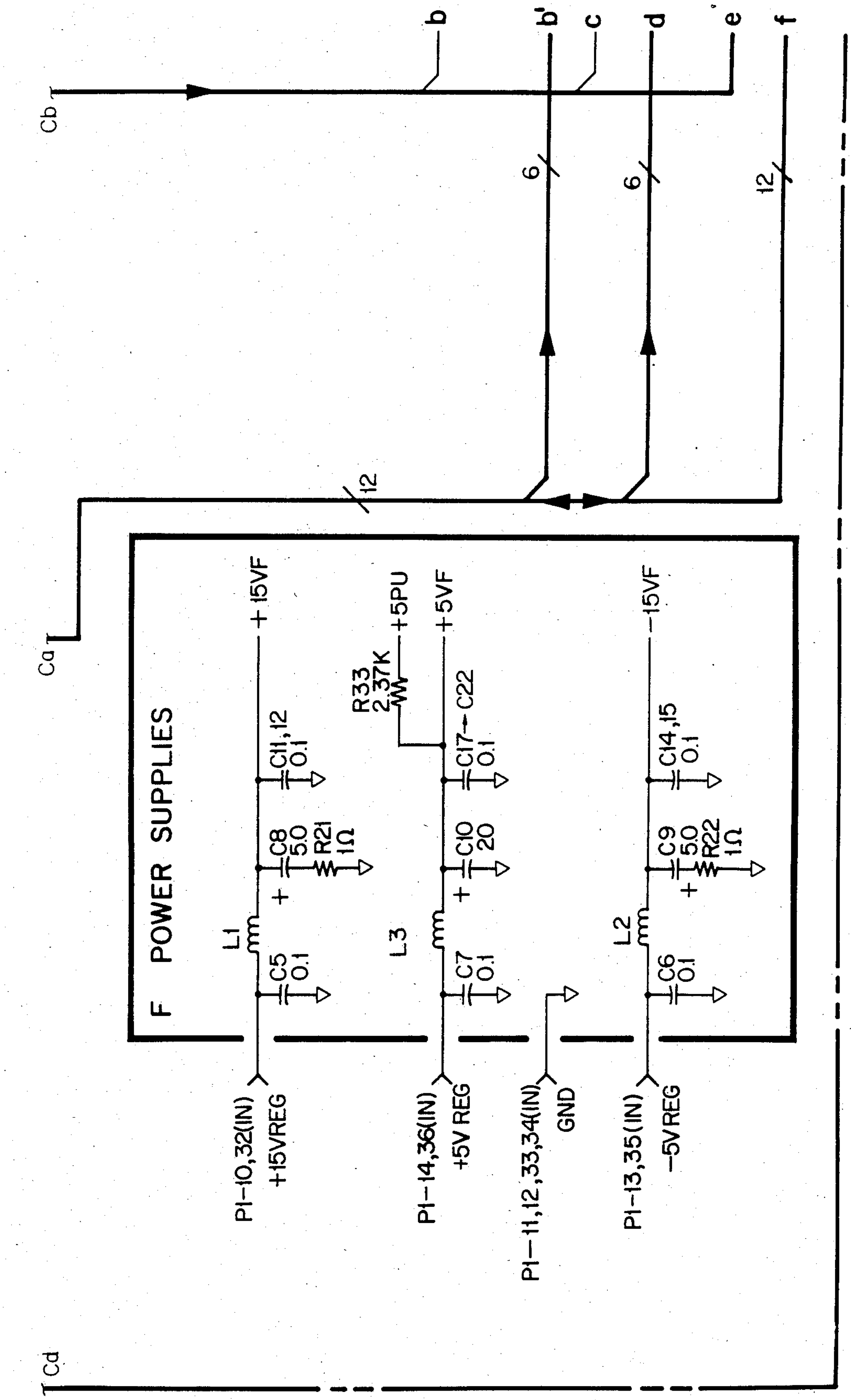
FIG 27.52C

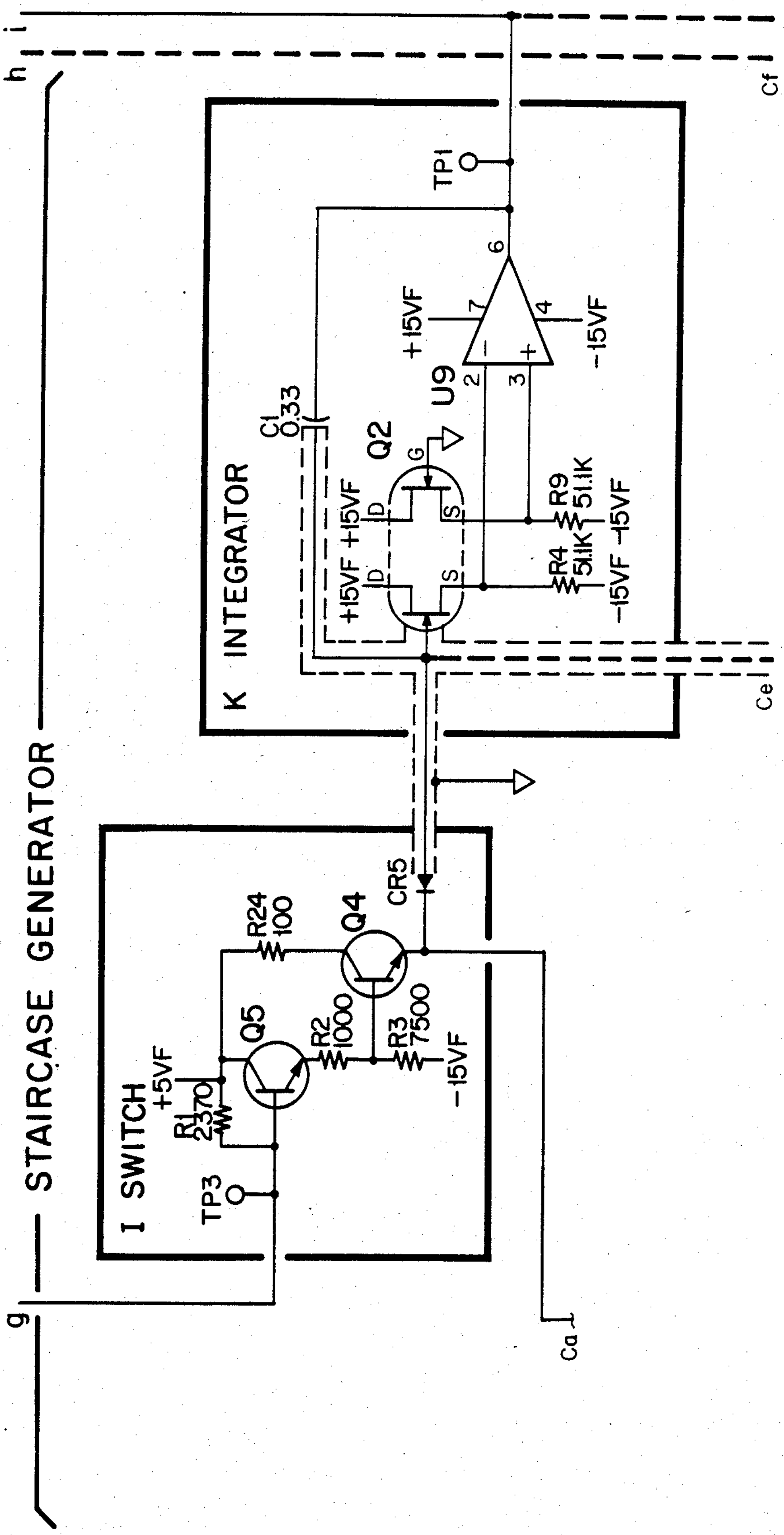
FIG 27.54A

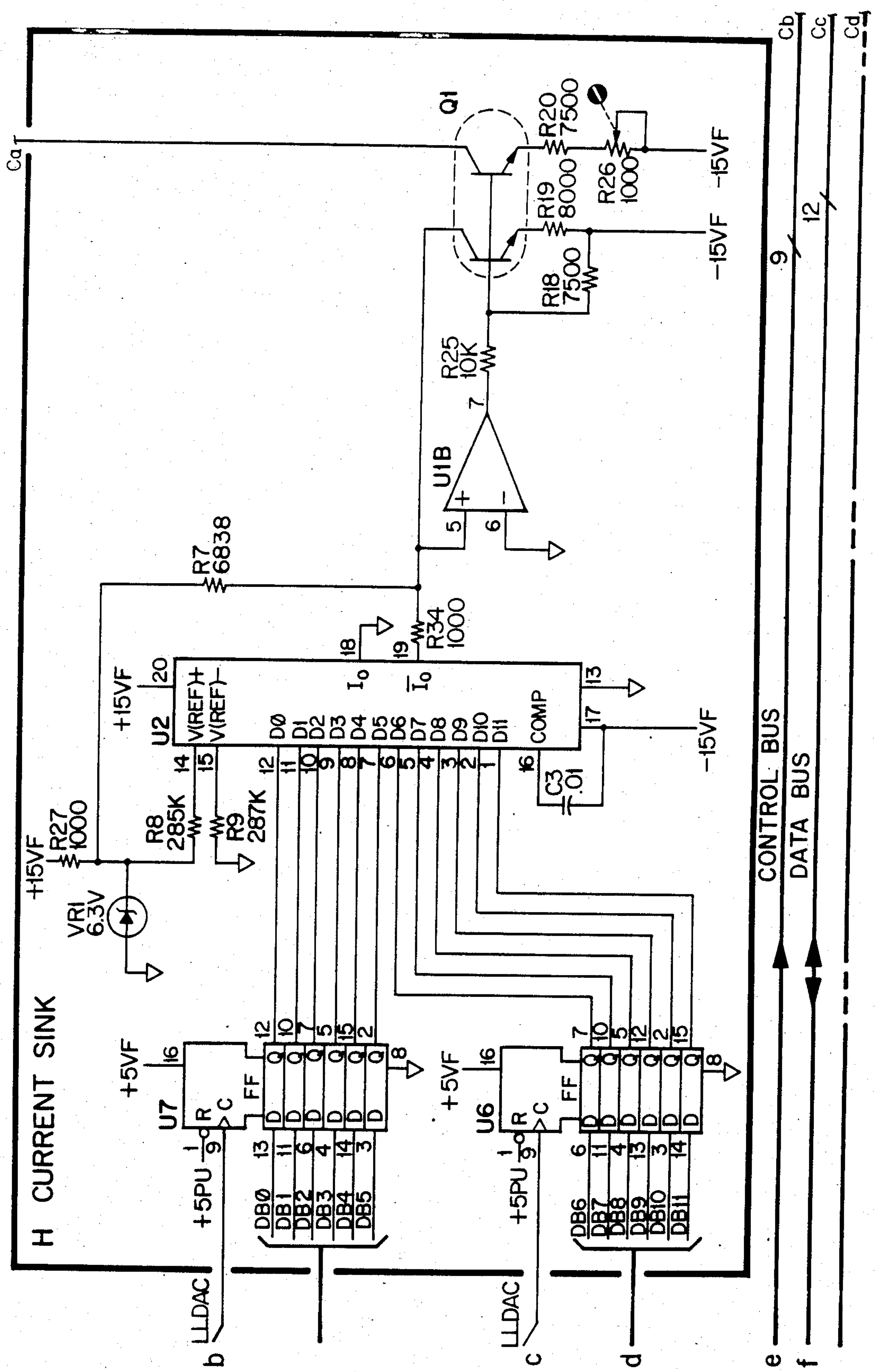
FIG 27.54B

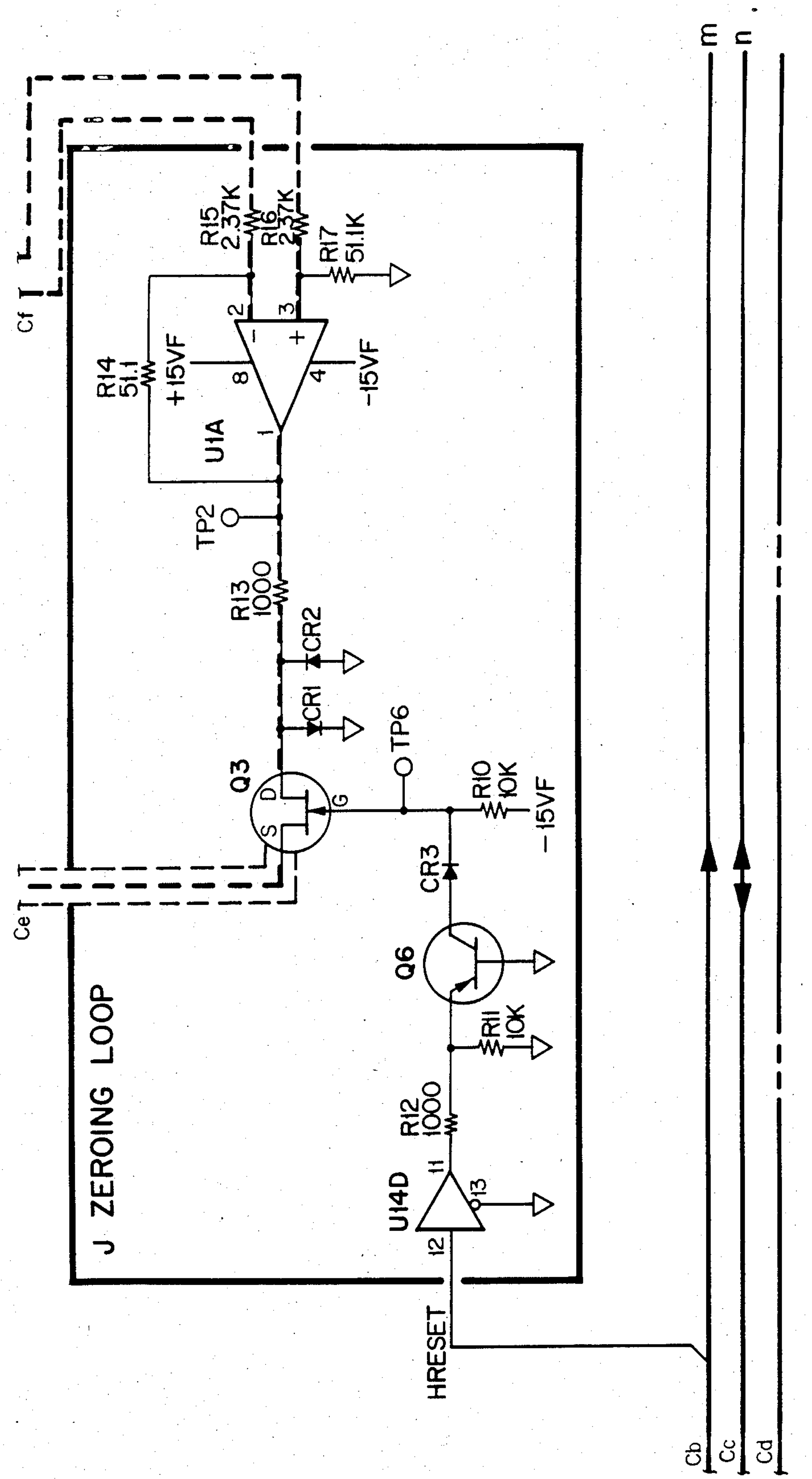
FIG 27.54C

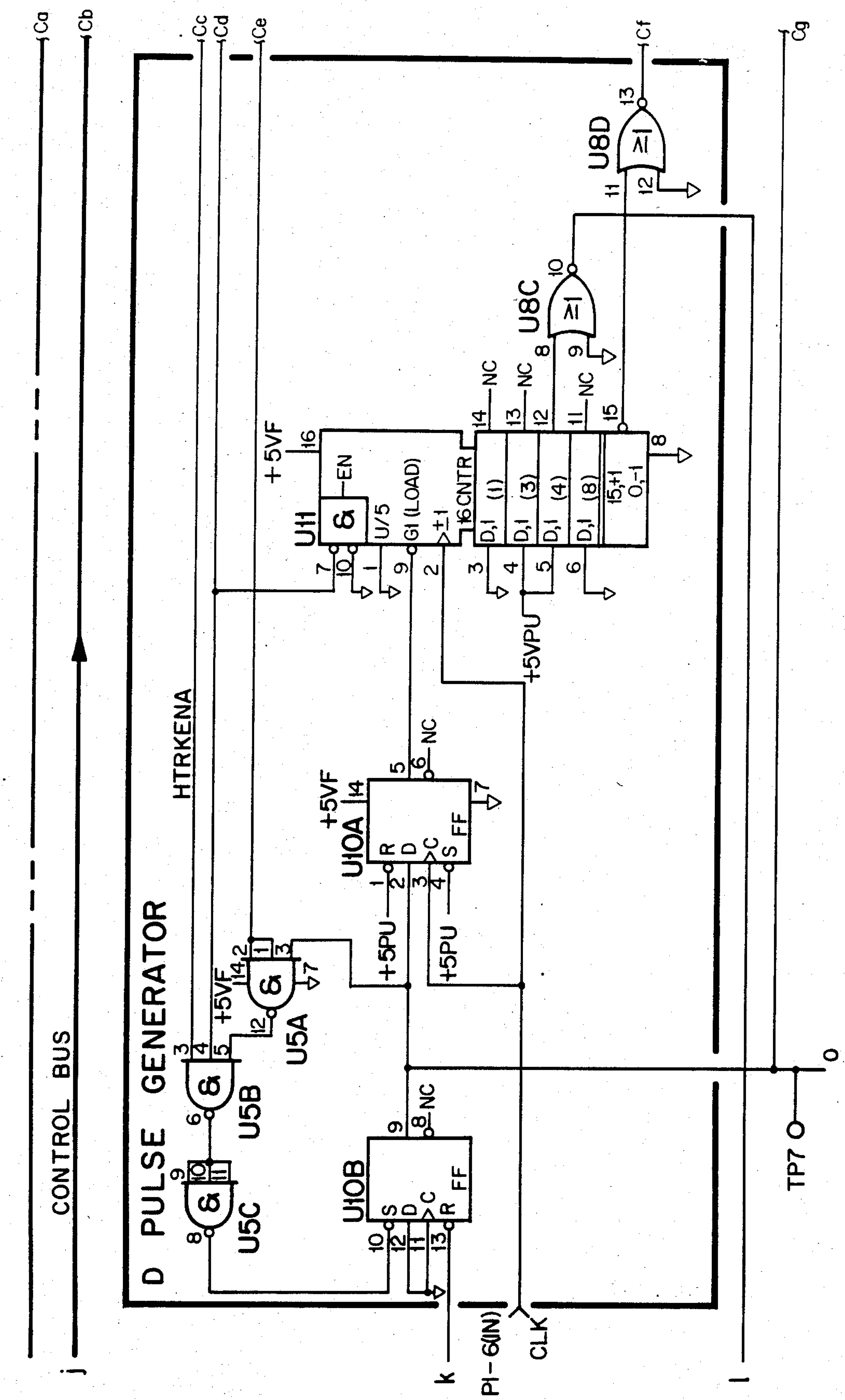
FIG 27.55A

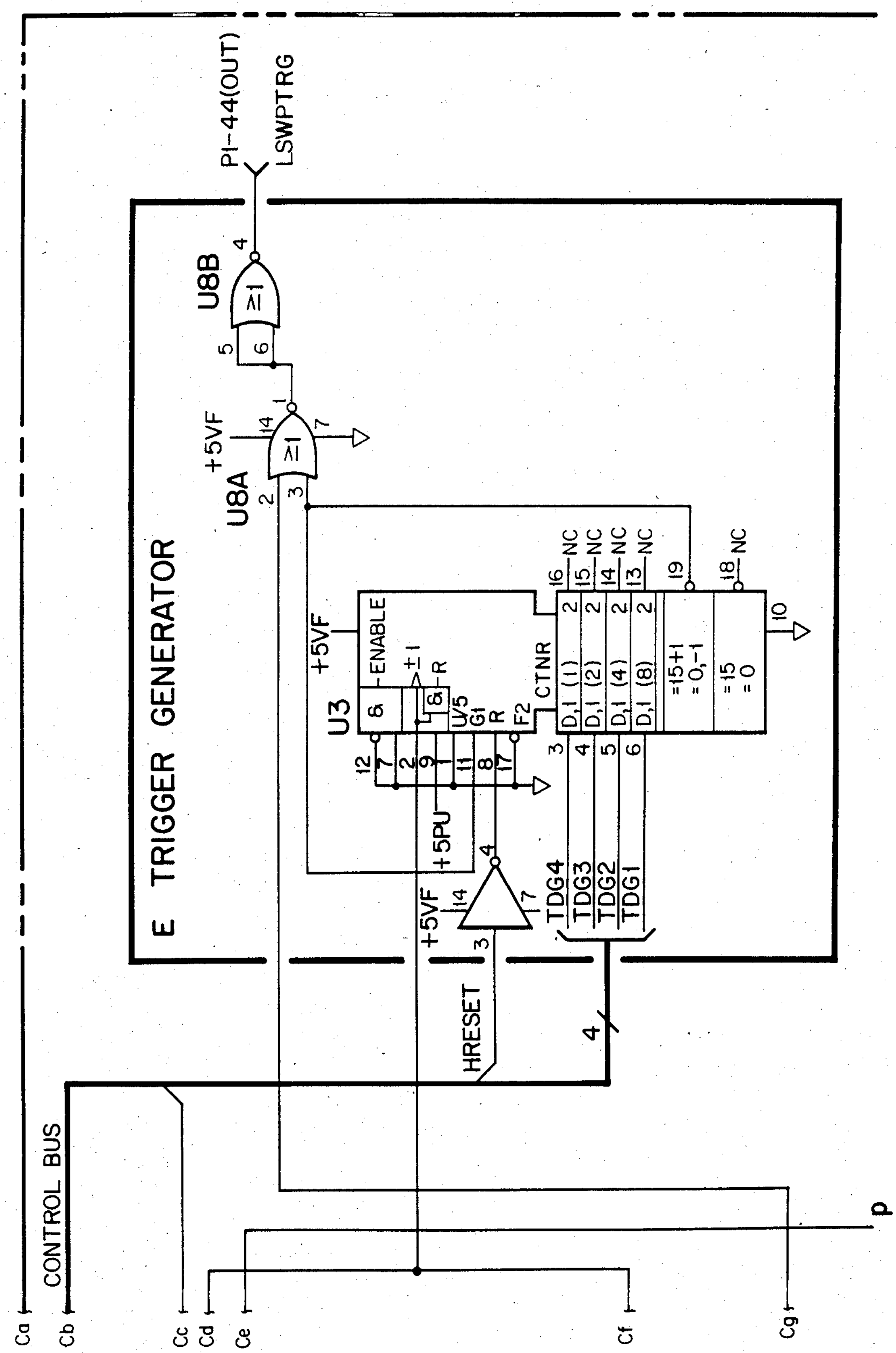
FIG 27.55B

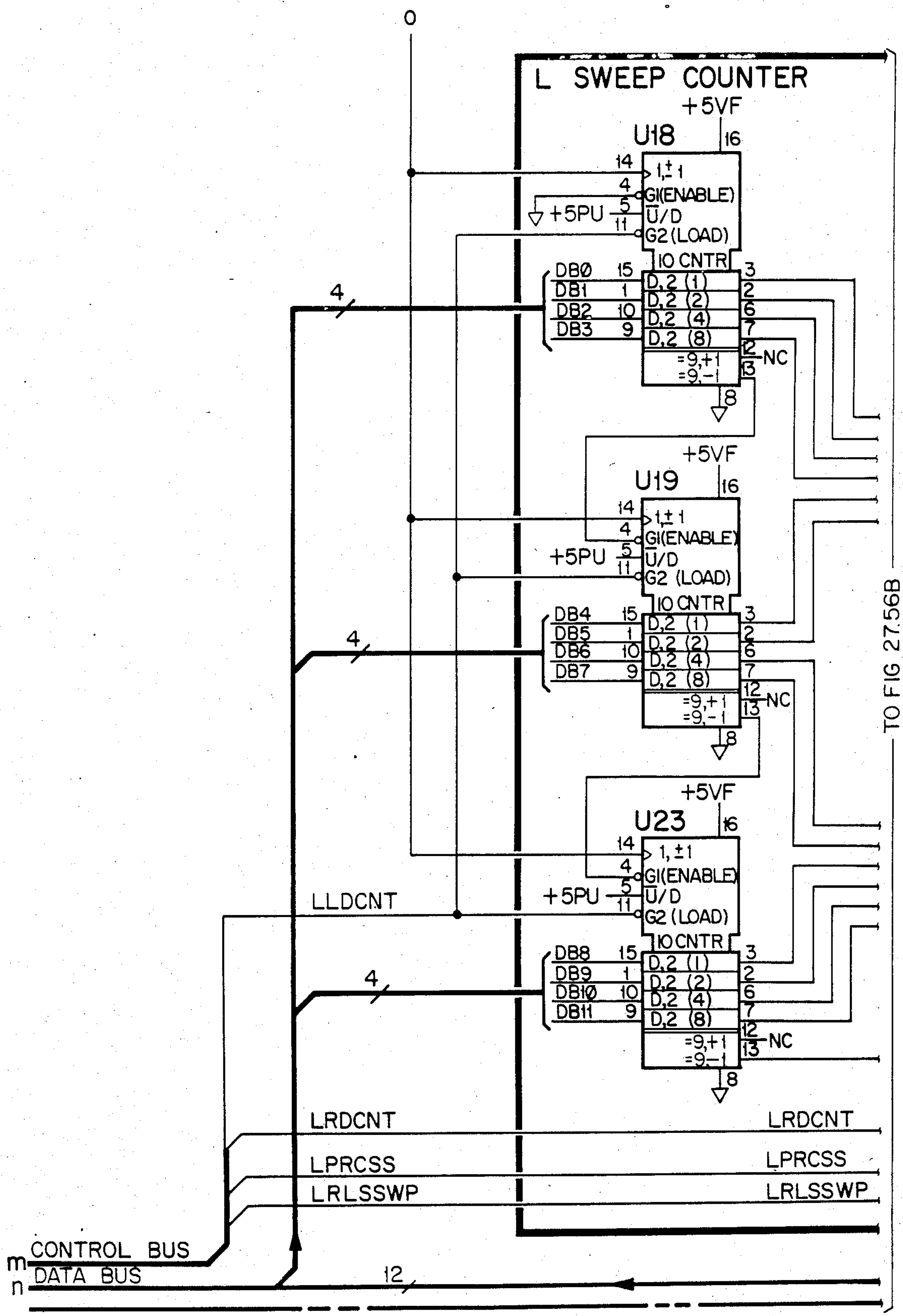
FIG 27.56A

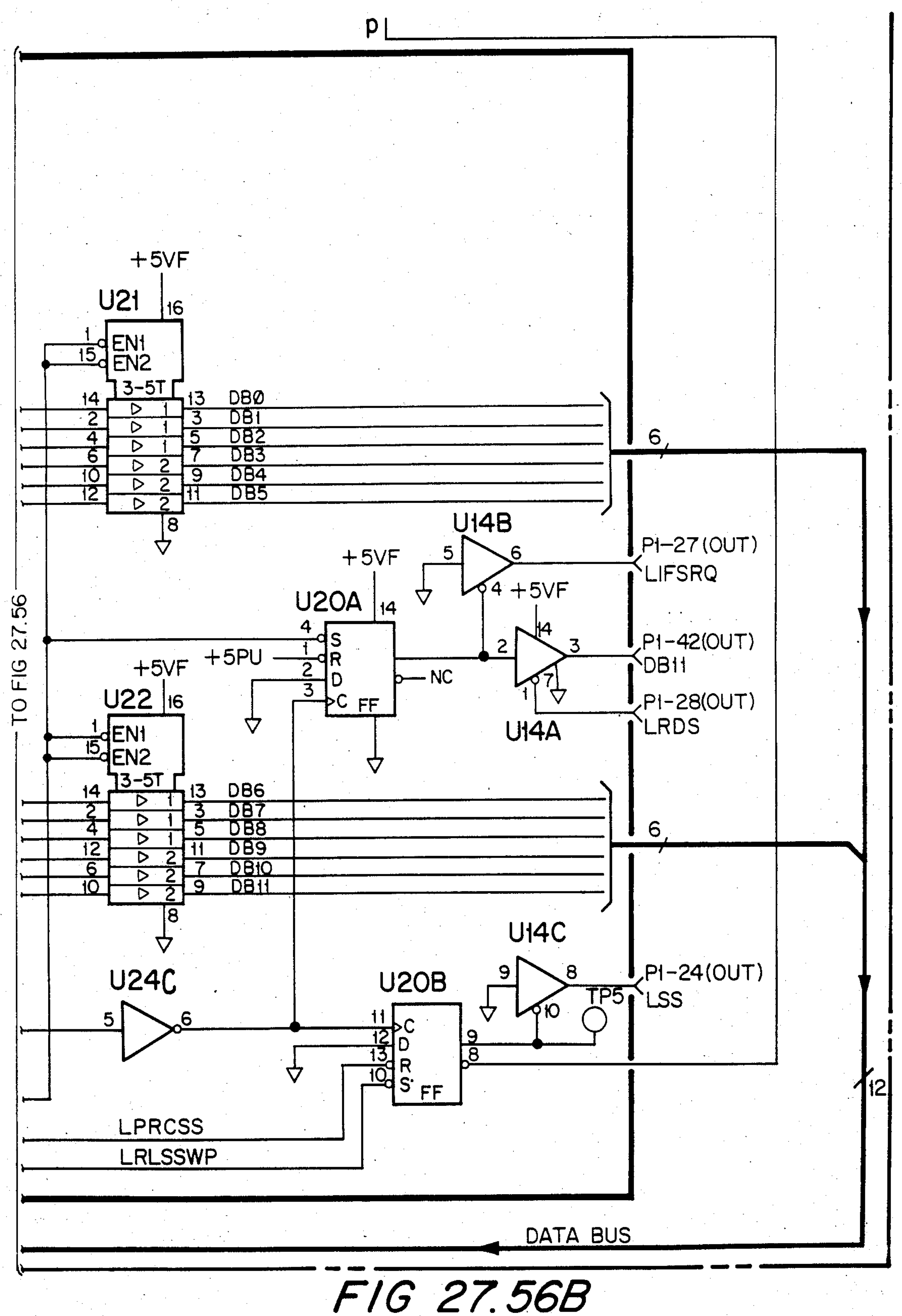
FIG 27.56B

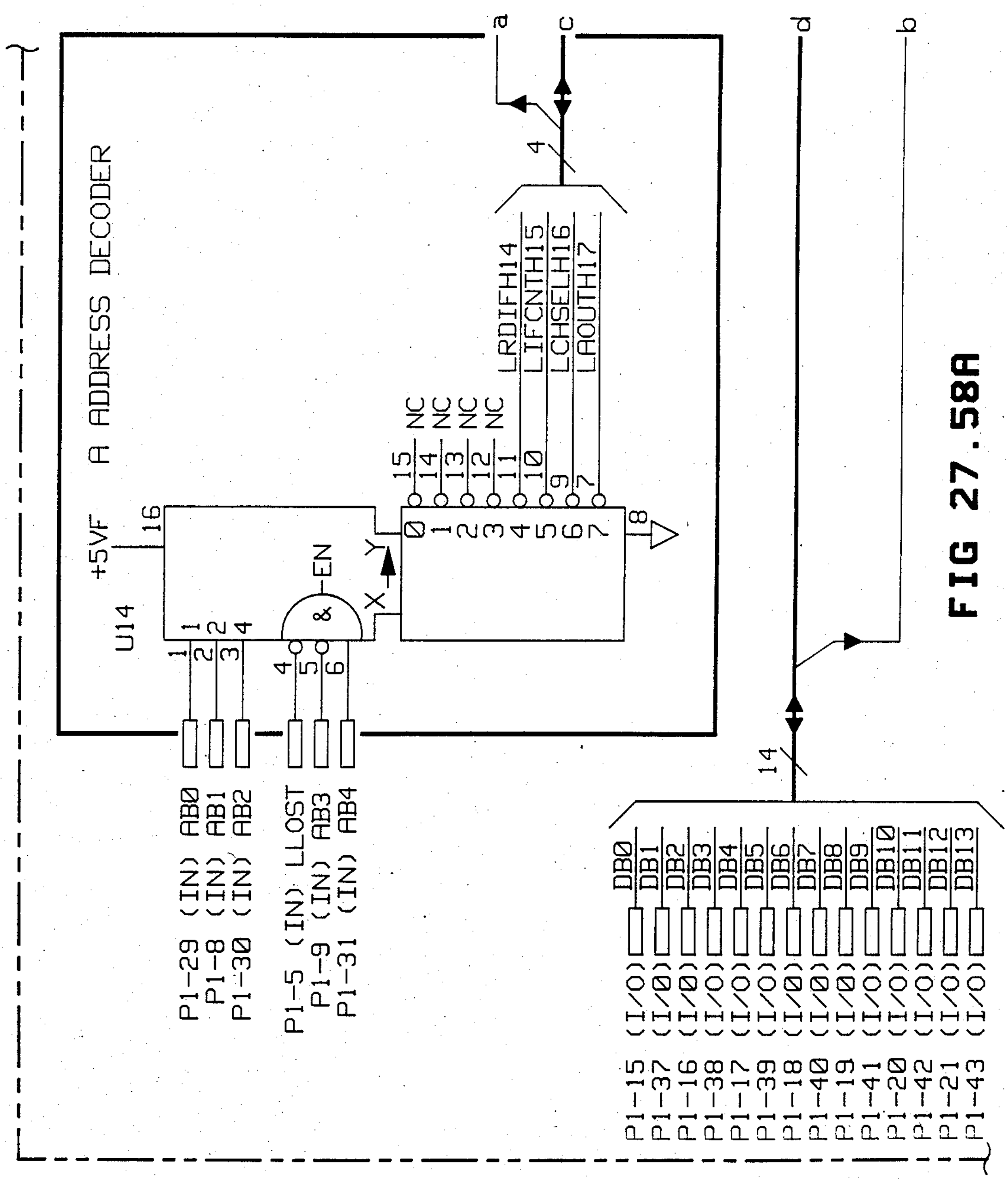
FIG 27.58A

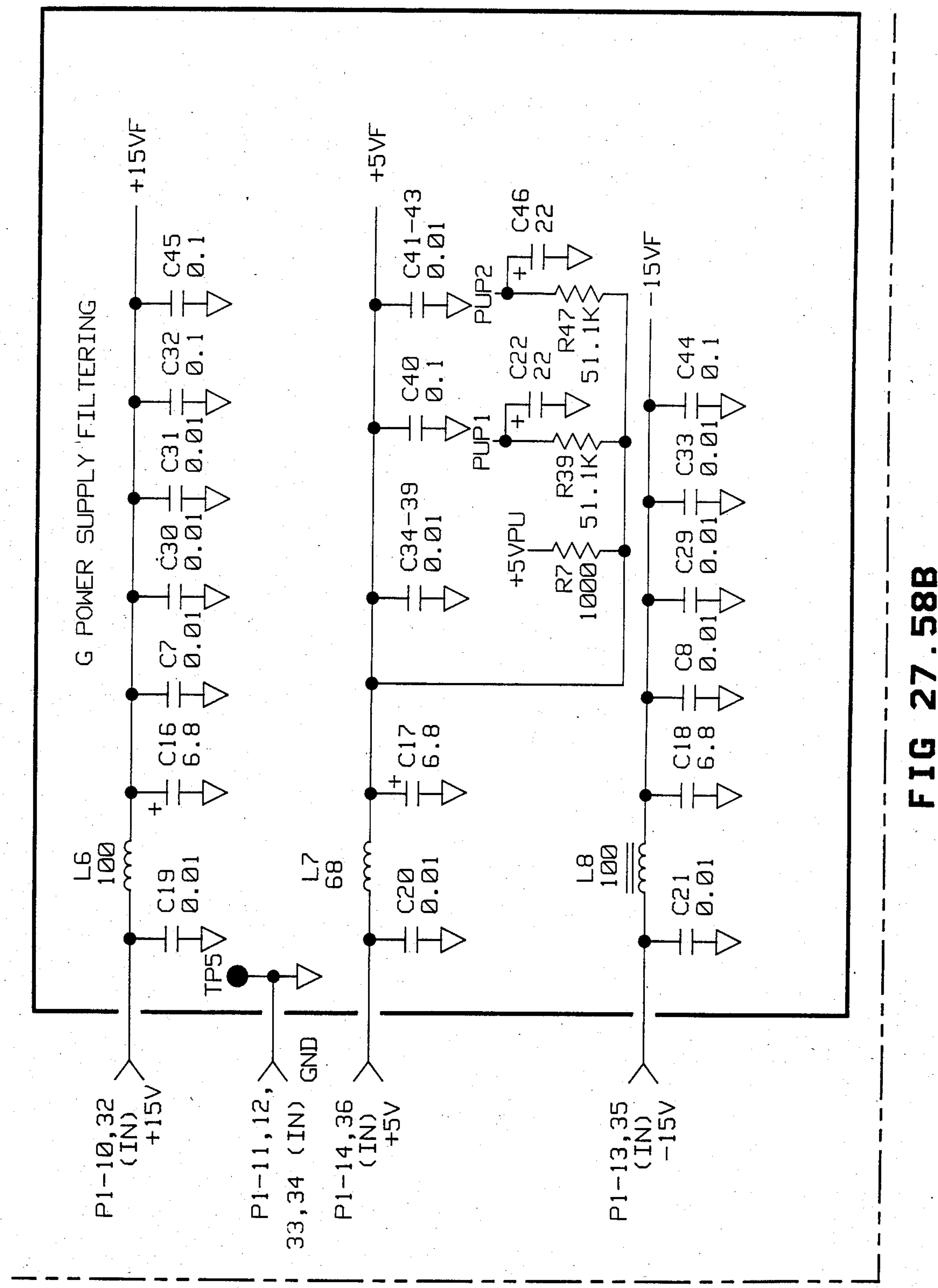
FIG 27.58B

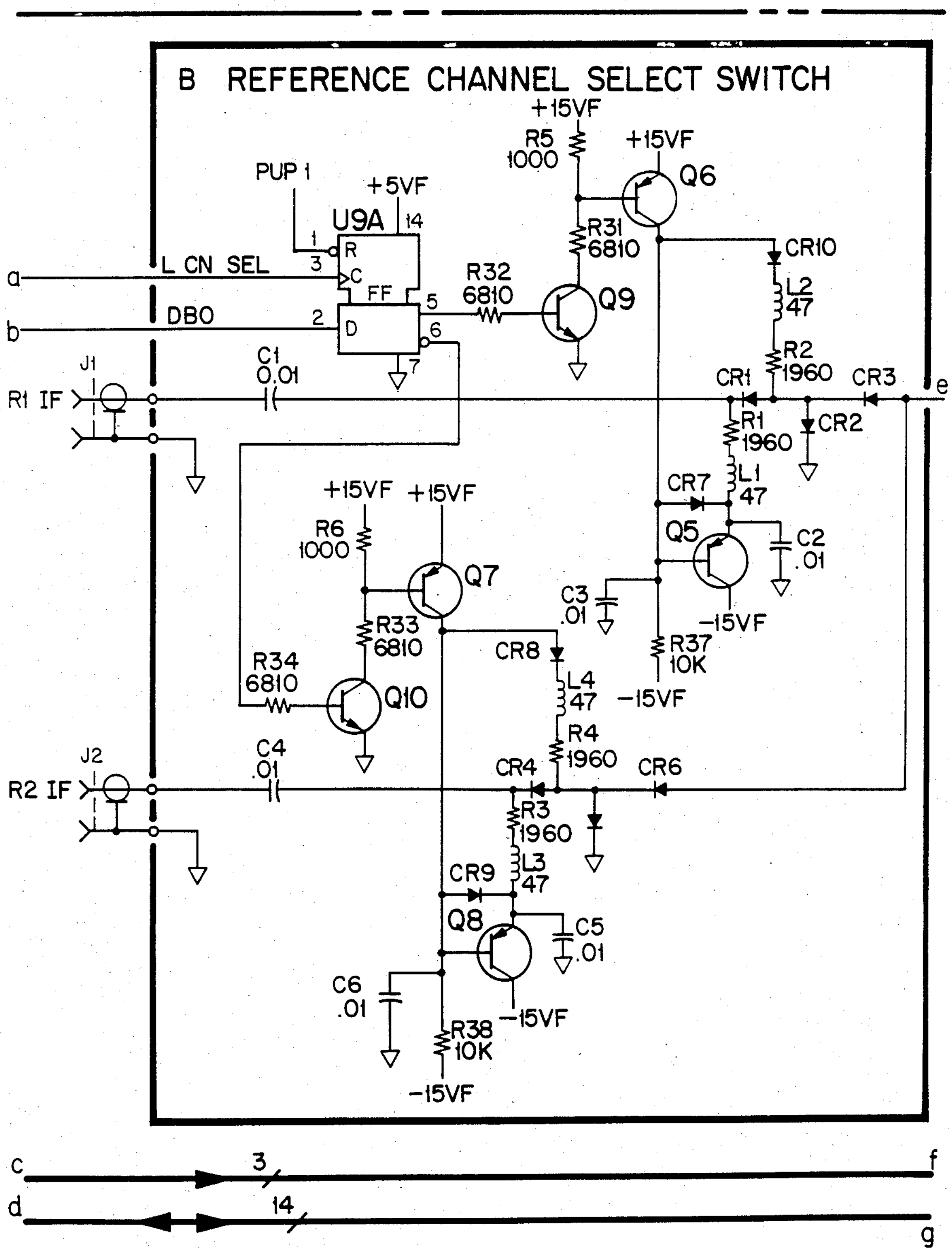
FIG 27.60A

ACTIVE COMPONENTS PARTS LISTS (U's and Q's)

| REFERENCE DESIGNATORS | PART NUMBER | MANUFACTURER'S PART NUMBER |
|---|---|---|
| U1 | 1820 – 1308 | MECL 10116 |
| U2 | 1820 – 0026 | LM 311 |
| U3 | 1820 – 1197 | LS 00 (NAND) |
| U4 | 1820 – 1442 | LS 290 (CNTR) |
| U5 | 1826 – 0521 | TL 072 |
| U6 | 1820 – 0693 | S74 (FF) |
| U7 | 1826 – 0316 | LH 0070 (+10V) |
| U8 | 1826 – 0684 | DAC 7541B (DAC) |
| U9 | 1820 – 1195 | LS7A |
| U10 | 1820 – 1112 | LS74 (FF) |
| U11, U15 | 1820 – 1989 | LS393 (CNTR) |
| U12, U13 | 1820 – 1196 | LS174 |
| U14 | 1820 – 1216 | LS138 (DEC) |
| U16 | 1820 – 2024 | LS244 |
| U17 | 1820 – 1491 | LS367 |
| U18 | | LS02 |
| Q1 | 1854 – 0457 | |
| Q2 | 1854 – 0477 | 2N2222A |
| Q3, Q4 | 1853 – 0405 | P 2N4209 |
| Q5 → Q8 | 1853 – 0451 | P 2N3799 |
| Q9, Q10 | 1854 – 0477 | P 2N2222A |
| | | |
| | | |

FIG 27.60B

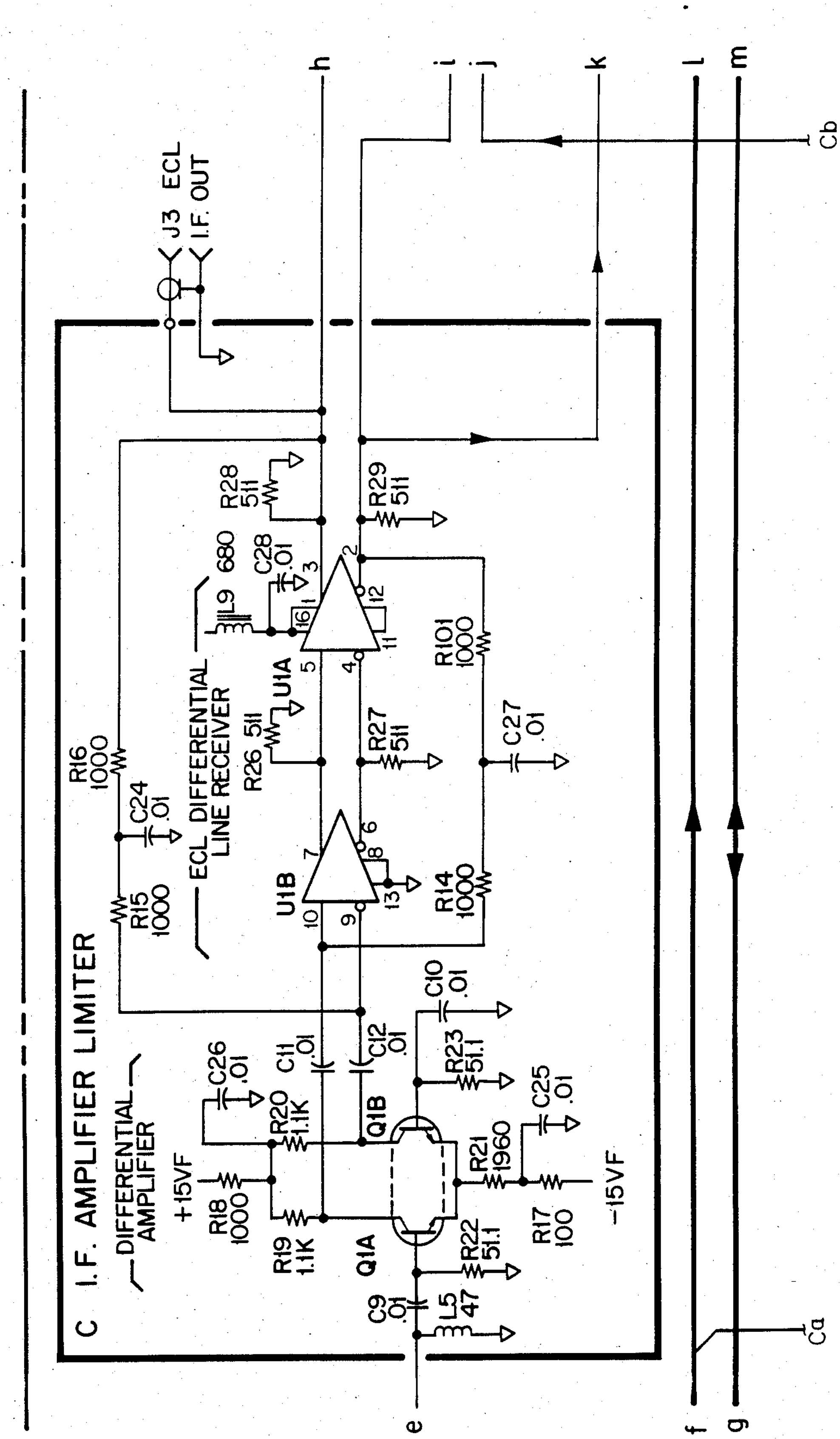
FIG 27.61A

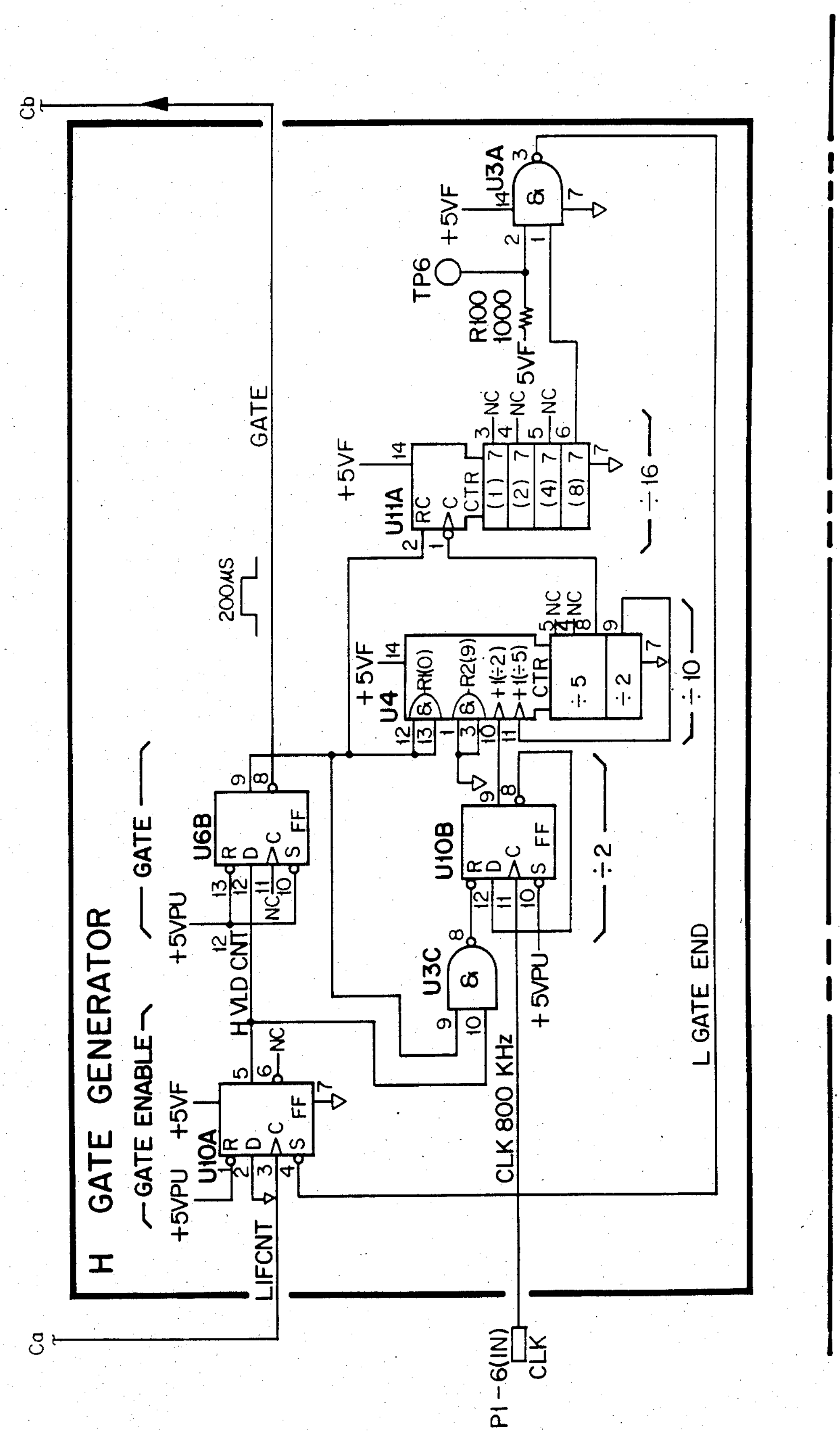
FIG 27.61B

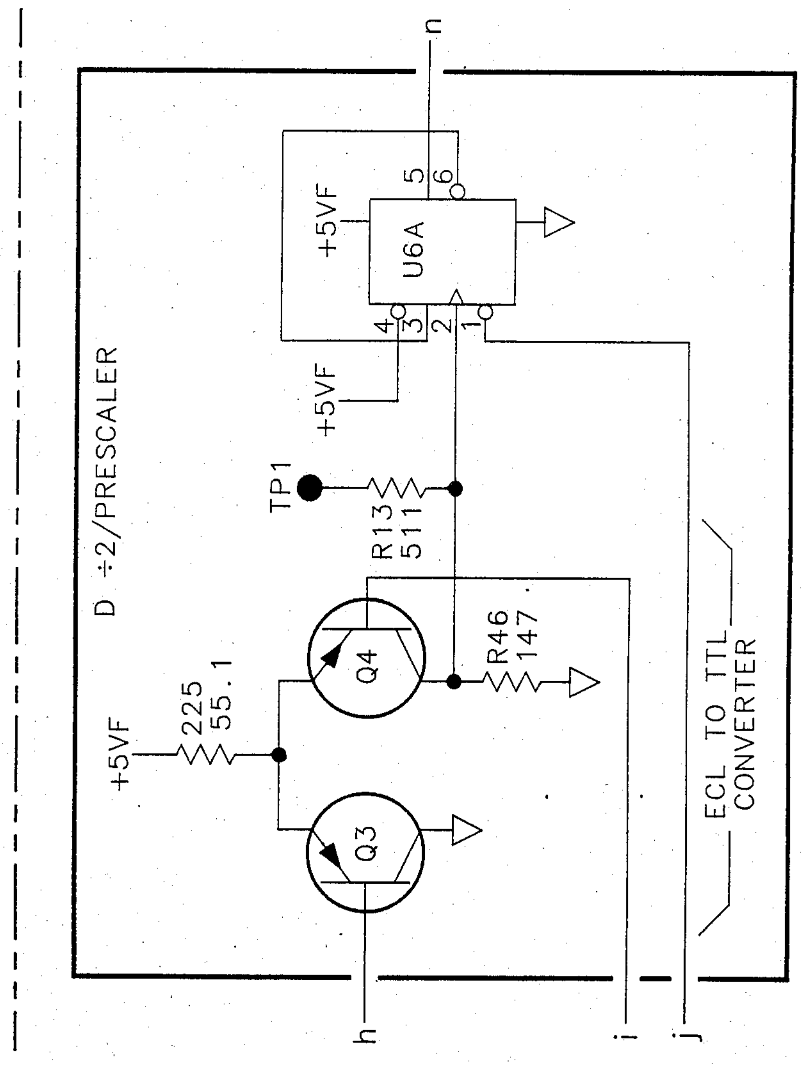
FIG 27.62A

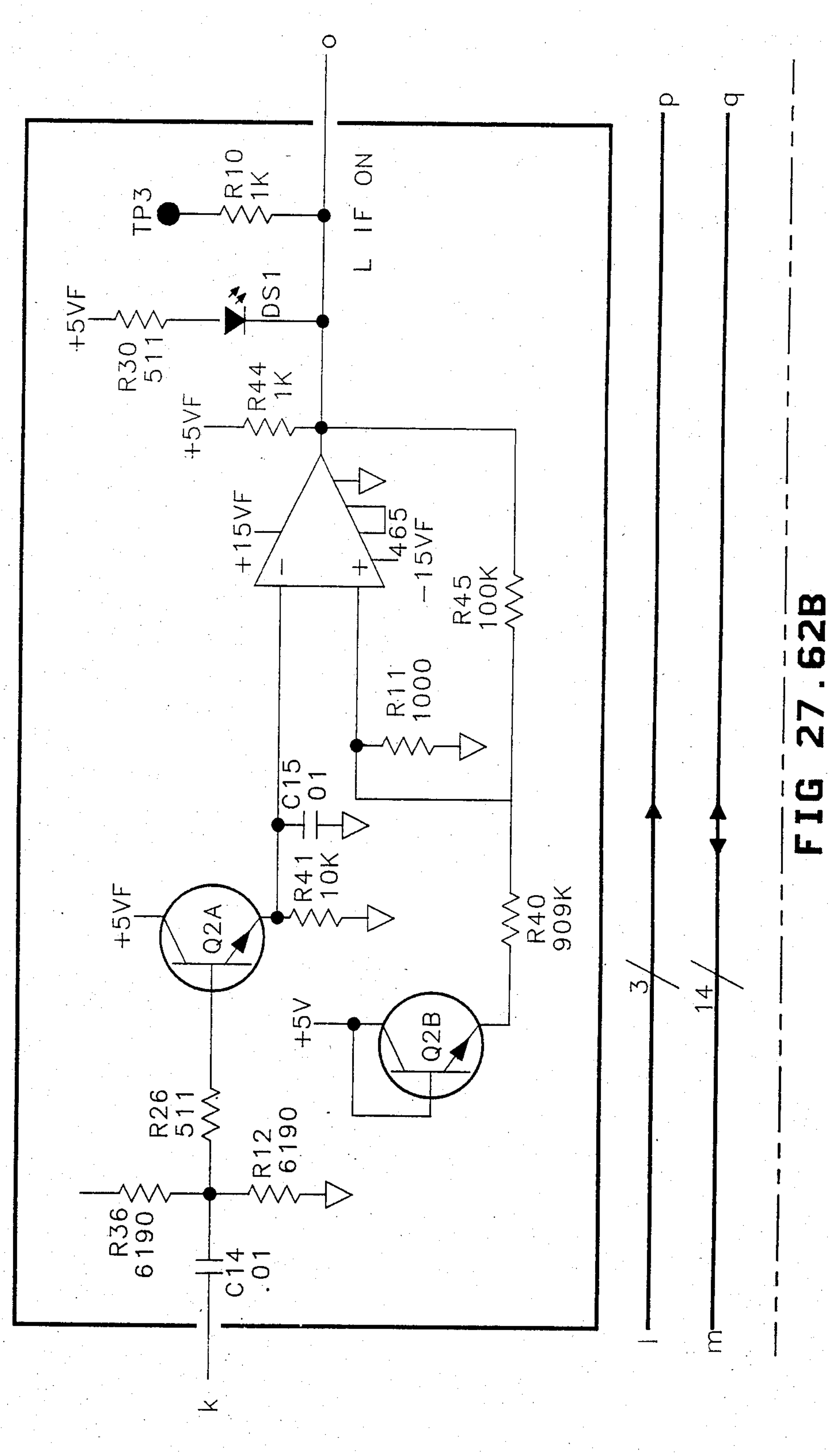
FIG 27.62B

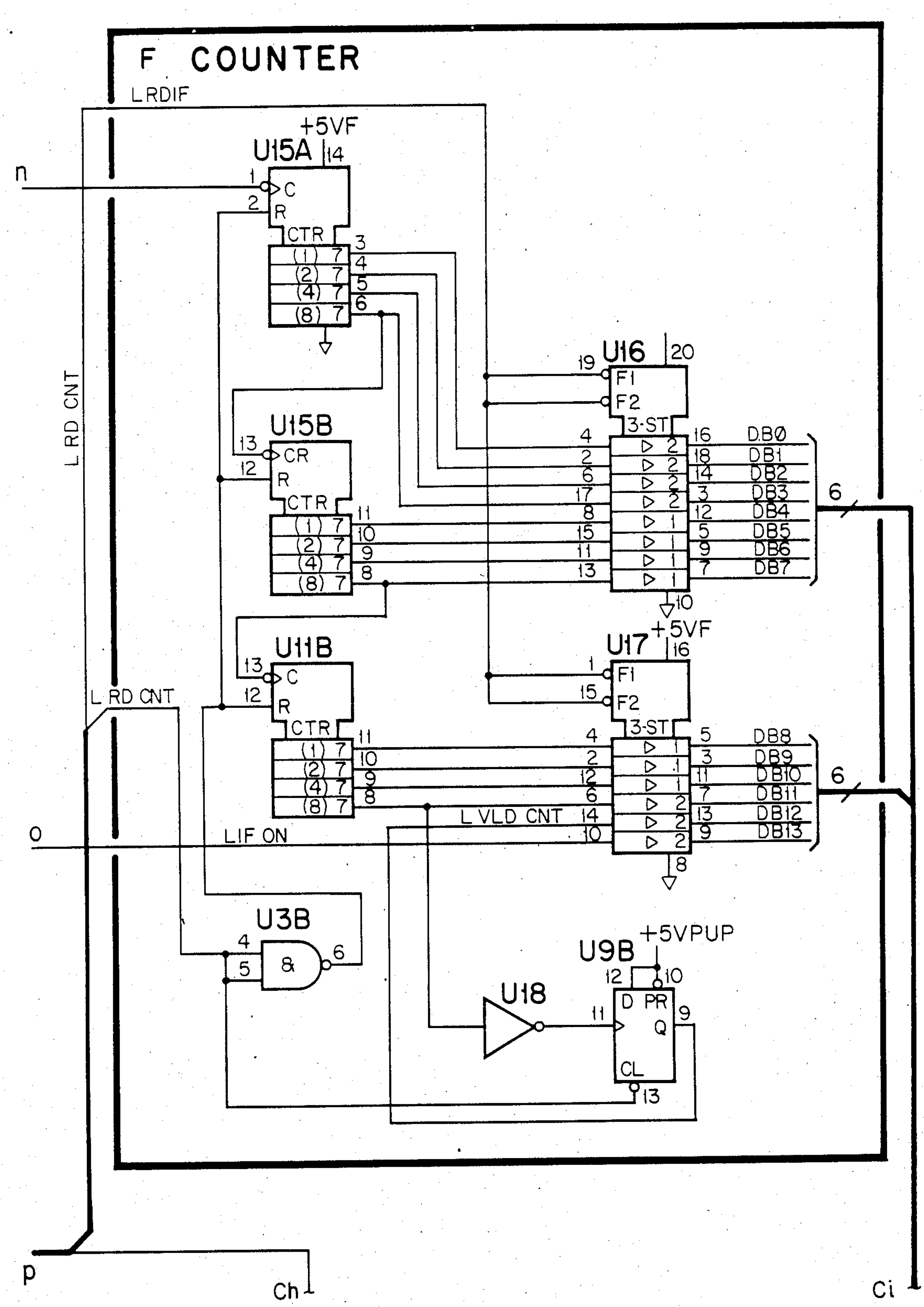
FIG 27.63A

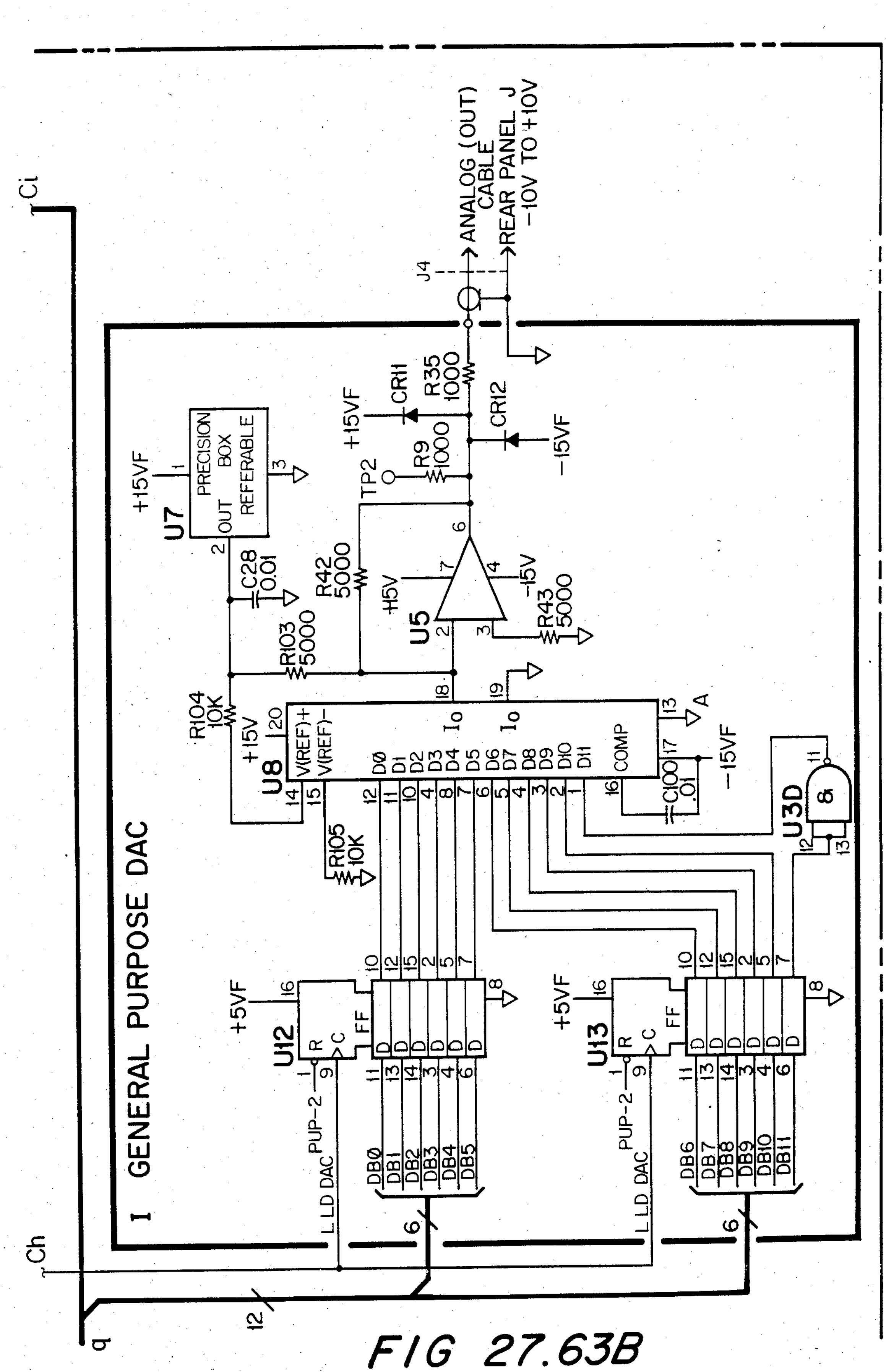
FIG 27.63B

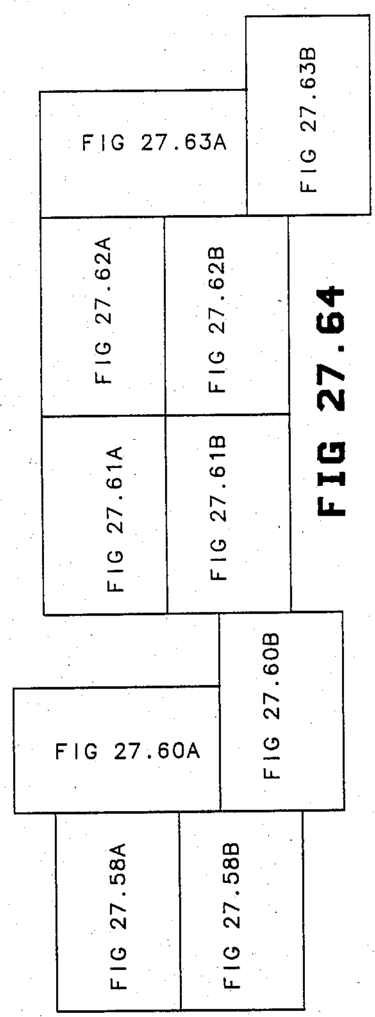
FIG 27.64
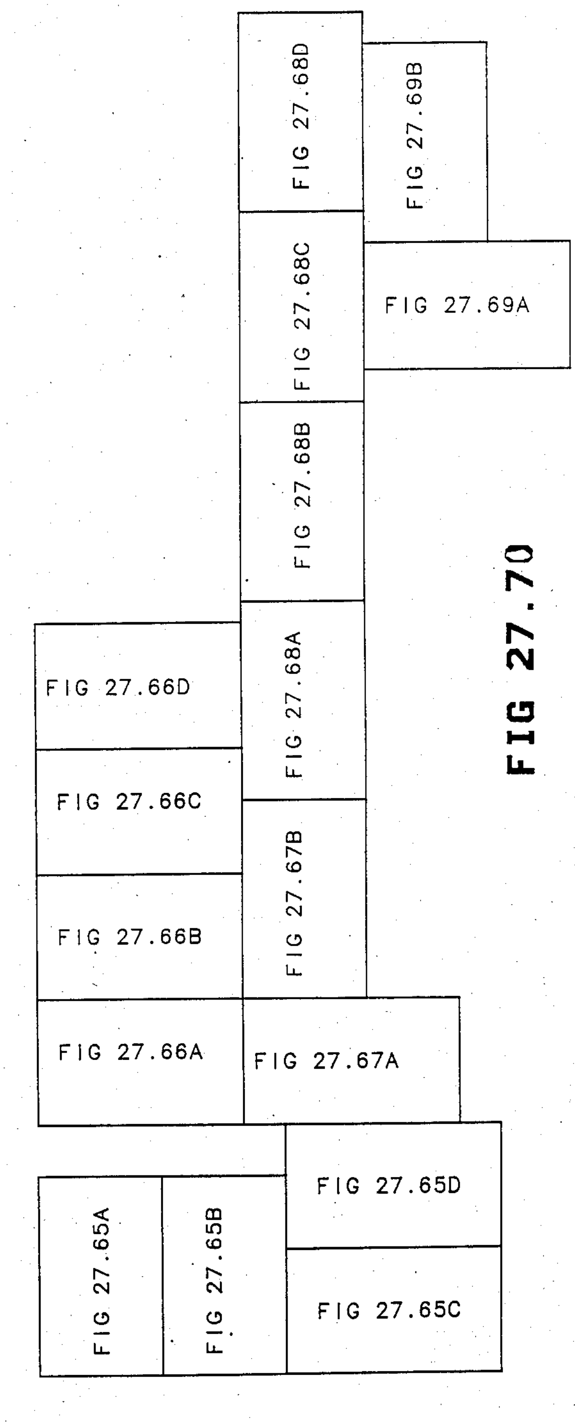
FIG 27.70

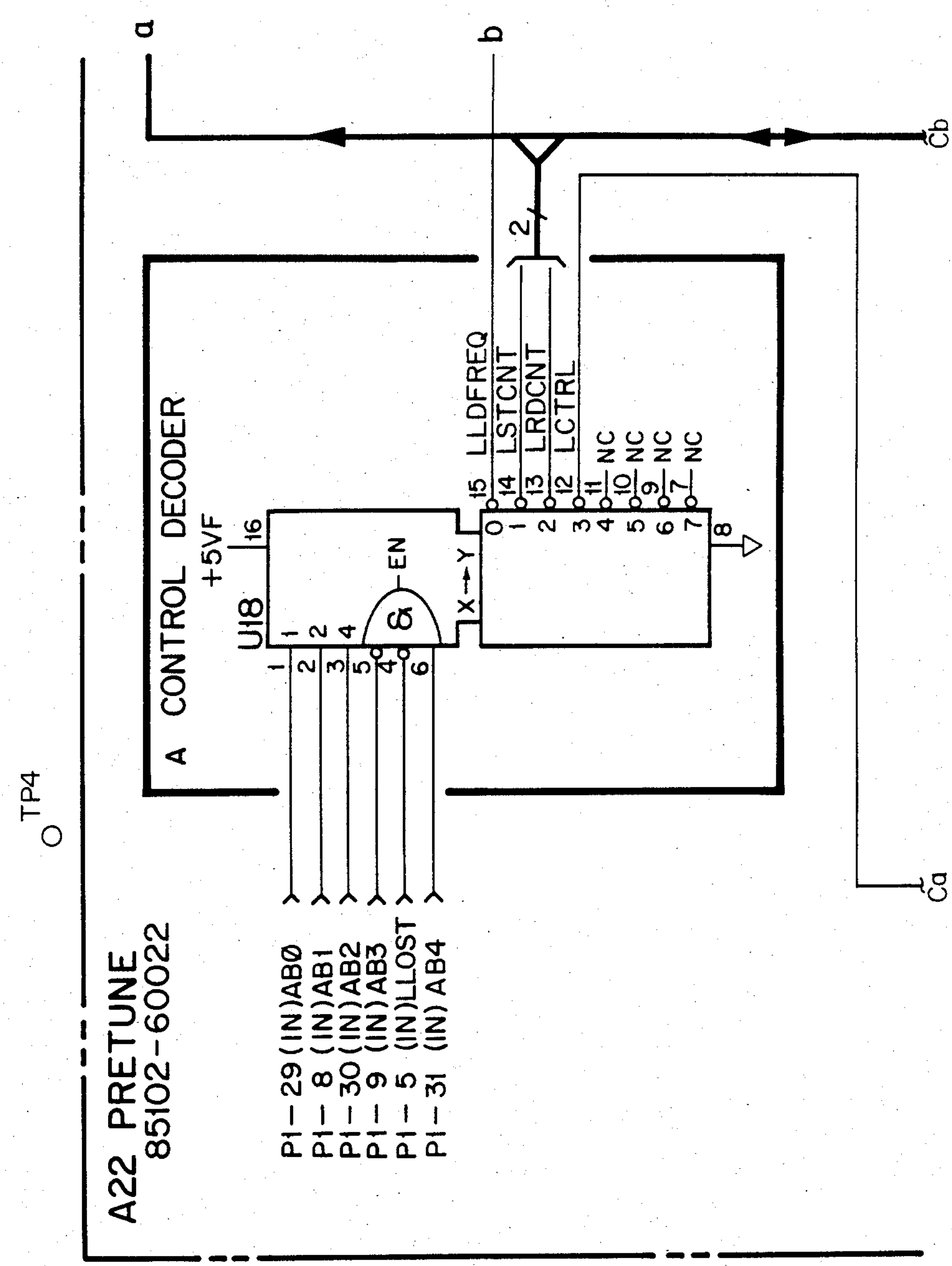
FIG 27.65A

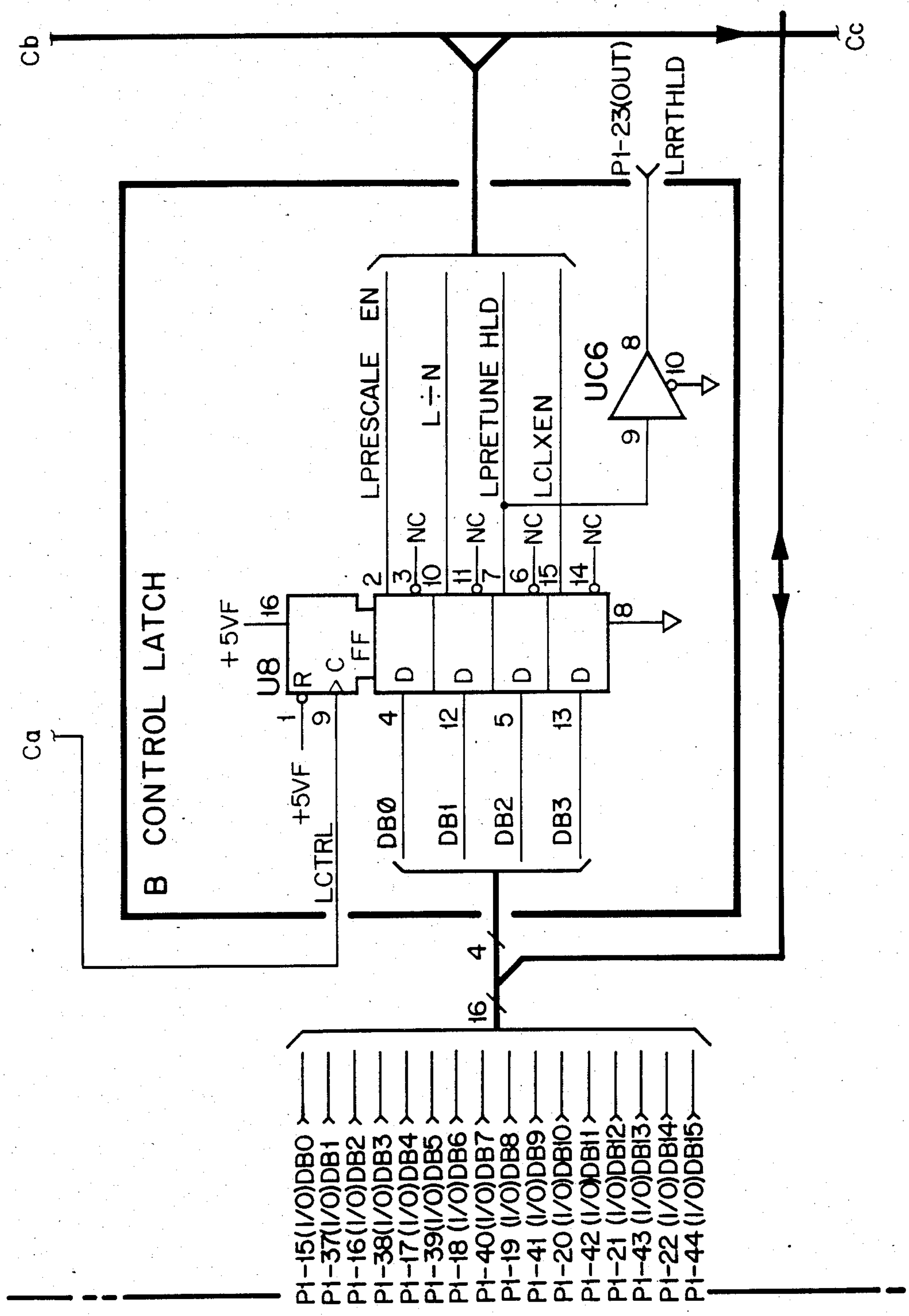
FIG 27.65B

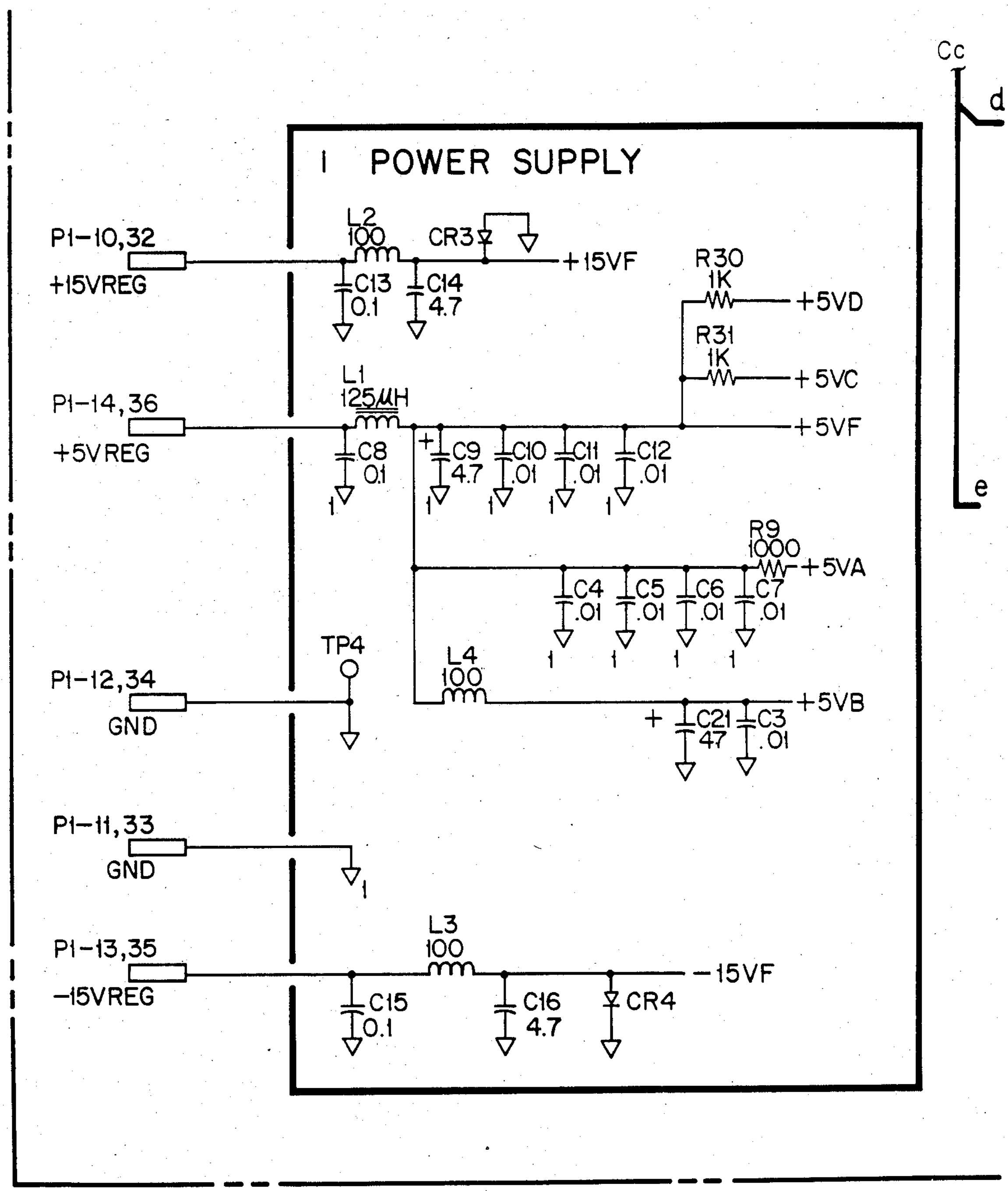
FIG 27.65C

P1

| PIN | SIGNAL | TO/FROM | FUNCTION BLOCK |
|---|---|---|---|
| 1<br>23 | NC<br>LPRTHLD | | <br>B+ |
| 2<br>24 | NC<br>NC | | |
| 3<br>25 | NC<br>NC | | |
| 4<br>26 | NC<br>NC | | |
| 5<br>27 | LLOST<br>LIFSRQ | | |
| 6<br>28 | CLK<br>LRDS | | F<br>G |
| 7<br>29 | LLOST<br>ABO | | +<br>+ |
| 8<br>30 | AB1<br>AB2 | | +<br>+ |
| 9<br>31 | AB3<br>AB4 | | +<br>+ |
| 10<br>32 | +15V REG<br>+15V REG | | B |
| 11<br>33 | GRD<br>GND | | B |
| 12<br>34 | GND<br>GND | | B |
| 13<br>35 | −15V REG<br>−15V REG | | B |
| 14<br>36 | +5V REG<br>+5V REG | | B |
| 15<br>37 | DB0<br>DB1 | | B C<br>B C |
| 16<br>38 | DB2<br>DB3 | | B C<br>B C |
| 17<br>39 | DB4<br>DB5 | | C B<br>C B |
| 18<br>40 | DB6<br>DB7 | | C B<br>C B |
| 19<br>41 | DB8<br>DB9 | | C B<br>C B |
| 20<br>42 | DB10<br>DB11 | | C B<br>C B |
| 21<br>43 | DB12<br>DB13 | | B<br>B |
| 22<br>44 | DB14<br>DB15 | | C B<br>B |
| | | | |

FIG 27.65D

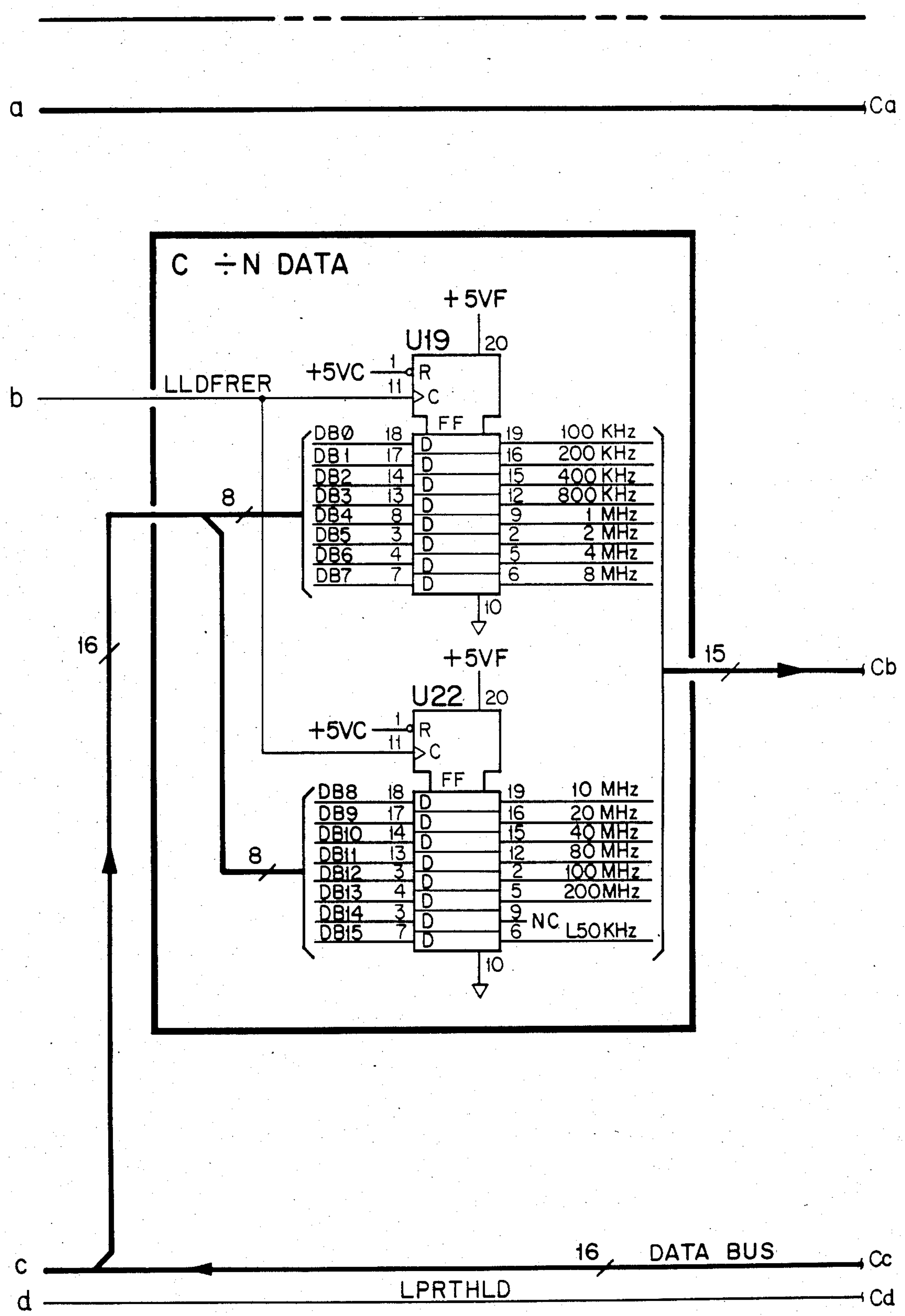
FIG 27.66A

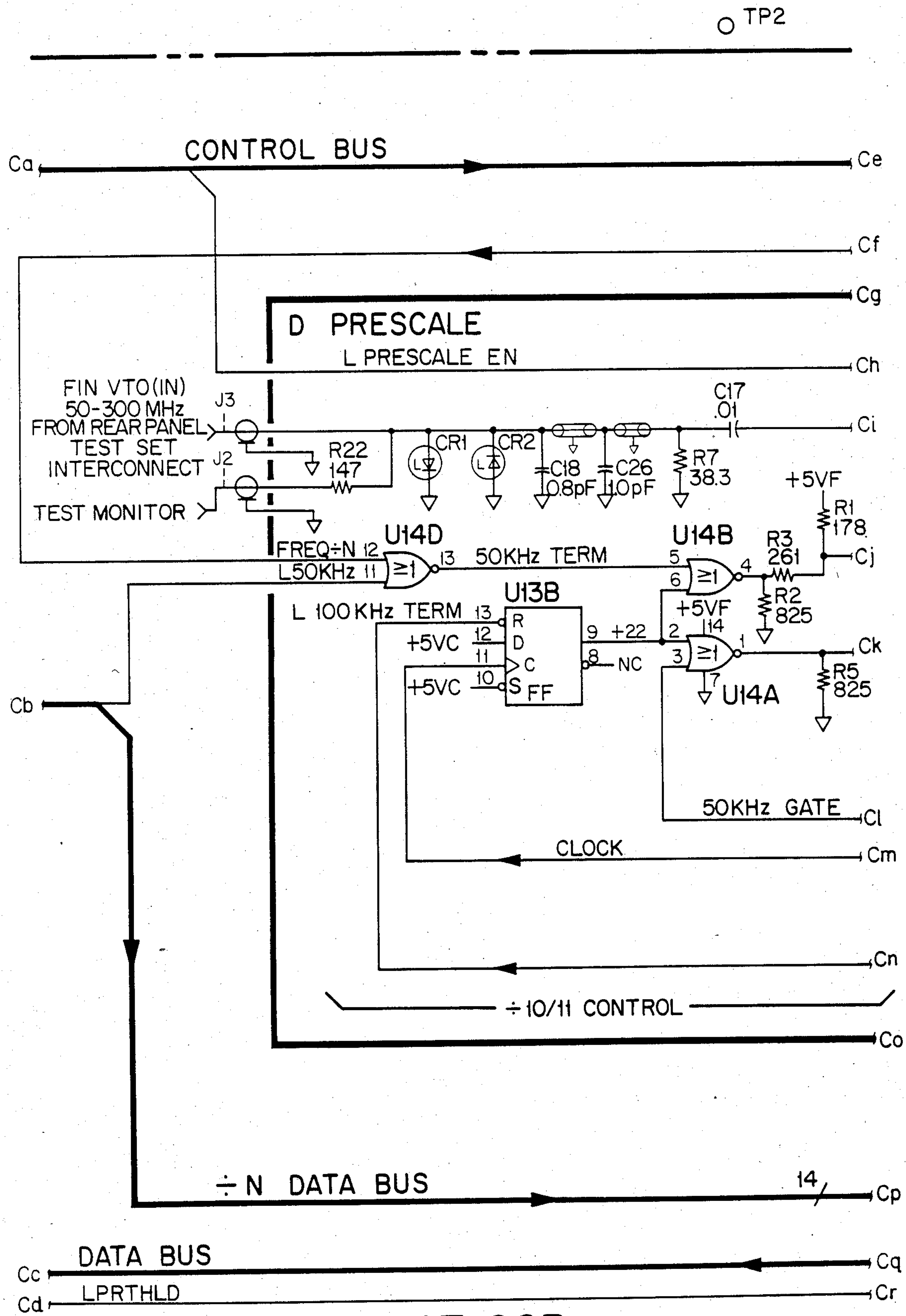
FIG 27.66B

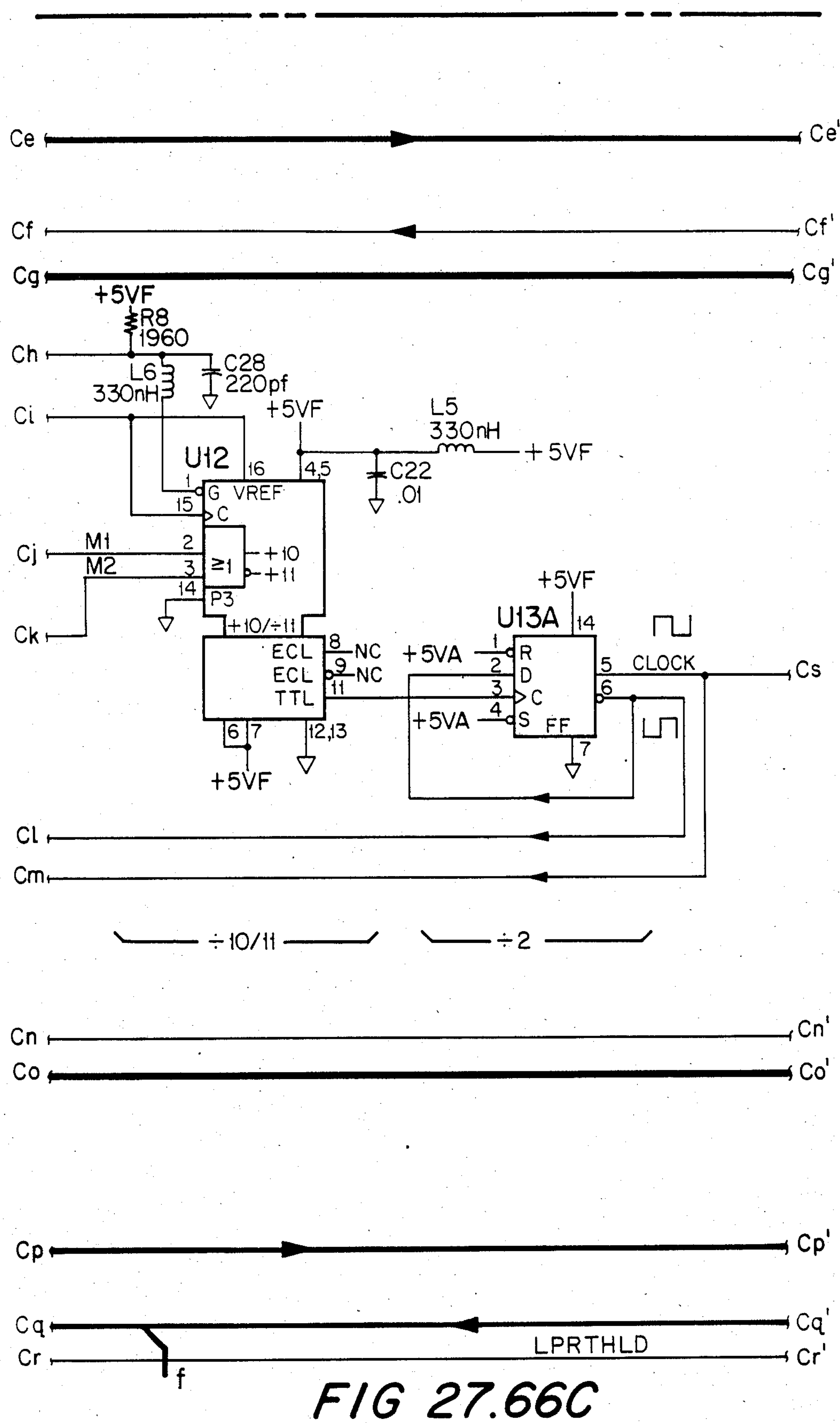
FIG 27.66C

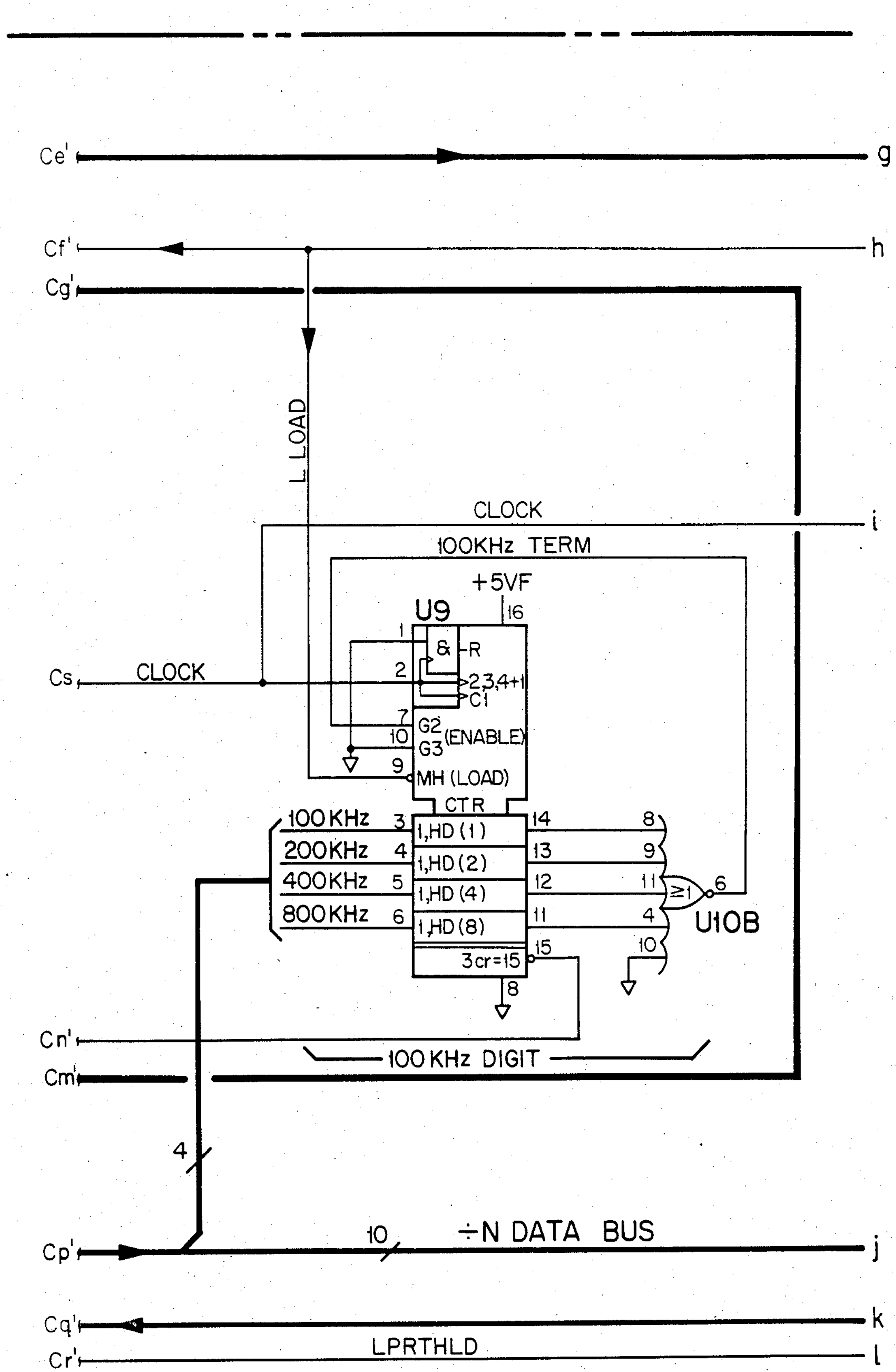
FIG 27.66D

ACTIVE COMPONENTS PARTS LISTS
(U'S AND Q'S)

| REFERENCE DESIGNATORS | PART NUMBER | MANUFACTURERS PART NUMBER |
|---|---|---|
| U1 | 1826–0319 | M10PAMP |
| U2 | 1826–0026 | M1COAMP |
| U3 | 1810–0203 | N–R470 |
| U4 | 1820–1272 | 74LS33 |
| U5 | 1826–0417 | C4–ASW |
| U6 | 1820–1568 | 74LS125 |
| U7,16 | 1820–1112 | 74LS74 |
| U8 | 1820–1195 | 74LS175 |
| U9 | 1820–1434 | 74LS668 |
| U10 | 1820–1275 | 74S260 |
| U11,13 | 1820–0693 | 74S74 |
| U12 | 1820–1780 | 1C11090 |
| U14 | 1820–1322 | 74S020 |
| U15 | 1820–1147 | 74LS00 |
| U17 | 1820–1443 | 74LS293 |
| U18 | 1820–1216 | 74LS138 |
| U19 | 1820–1730 | 74LS273 |
| U20,21,23 | 1820–1013 | 25LS2568 |

FIG 27.67A

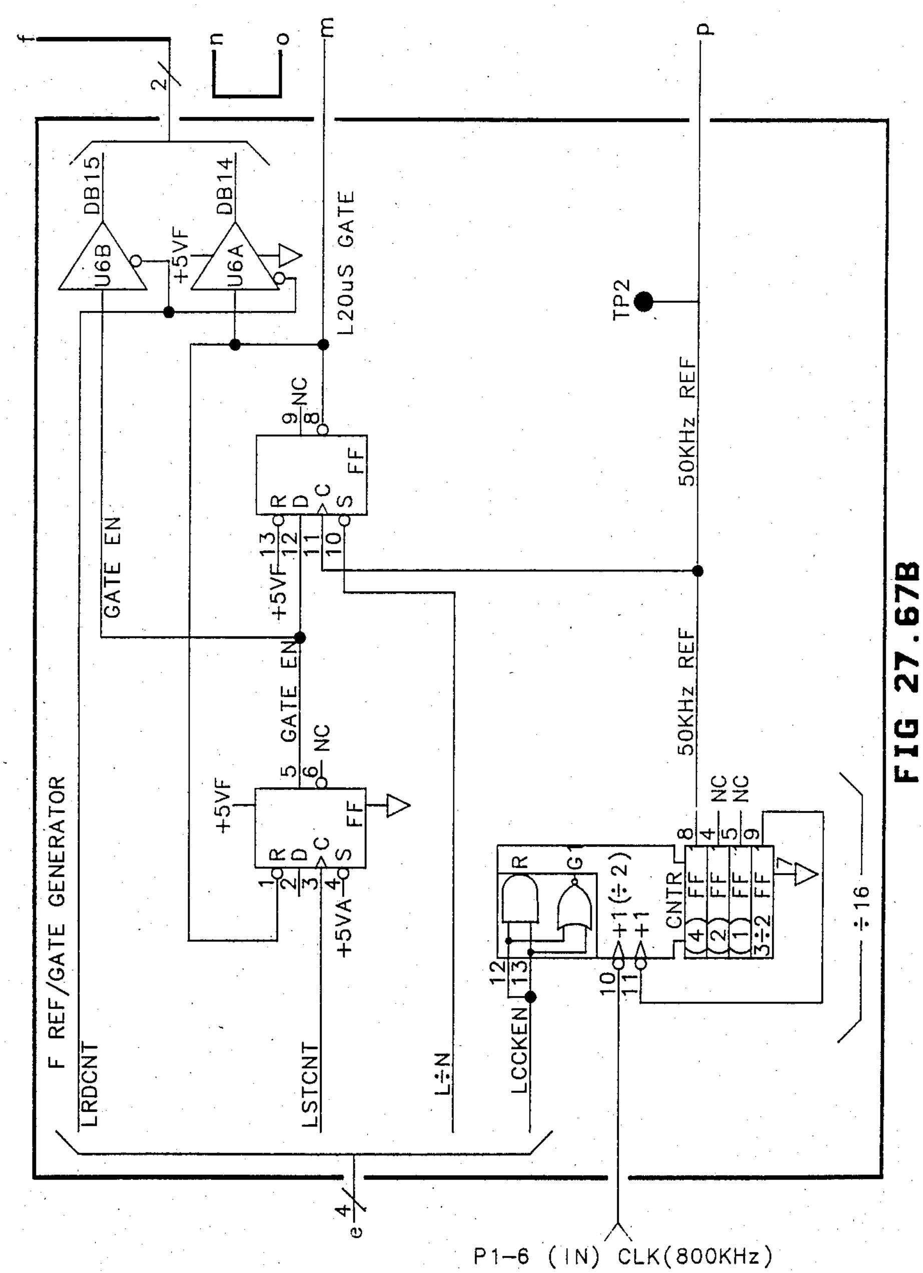
FIG 27.67B

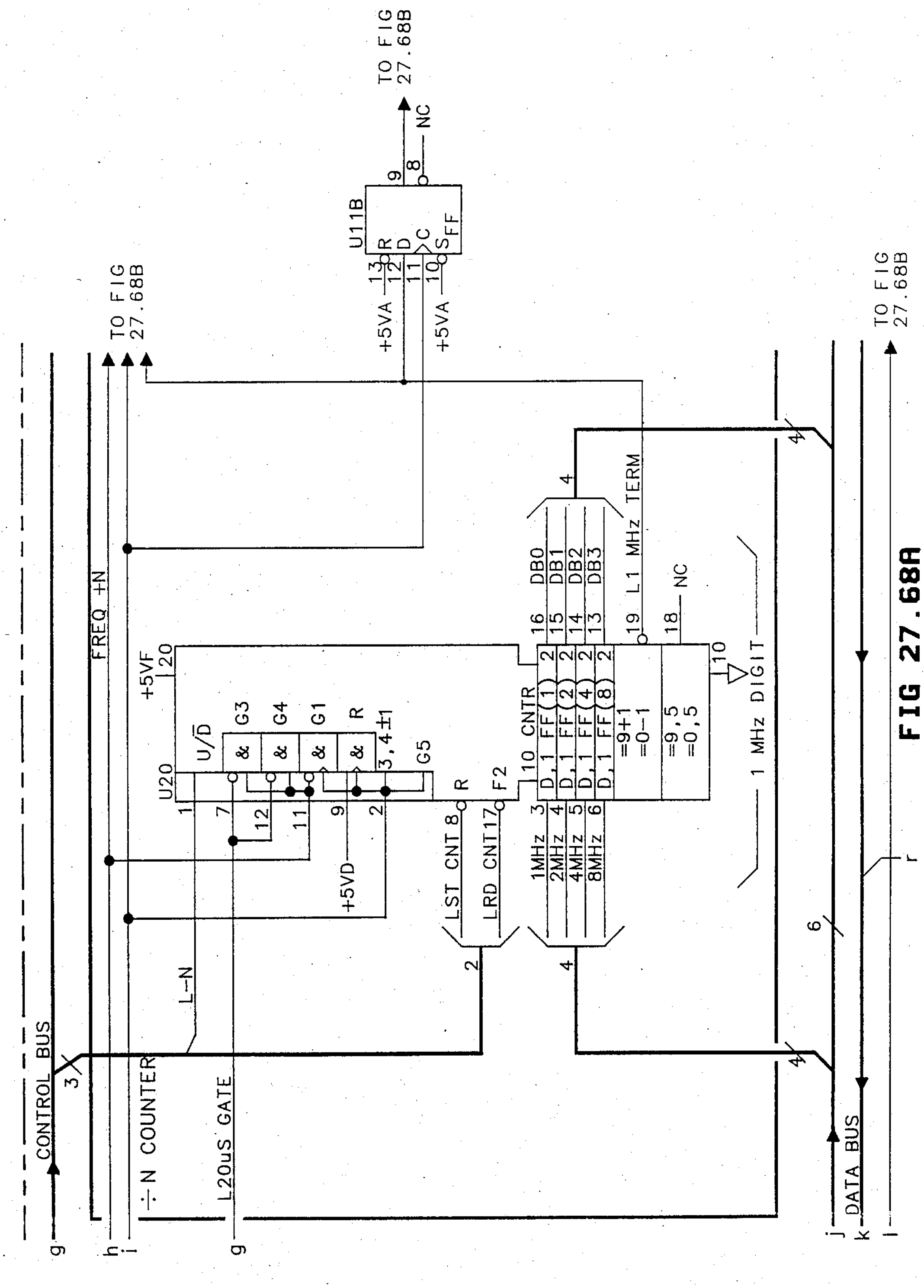
FIG 27.68A

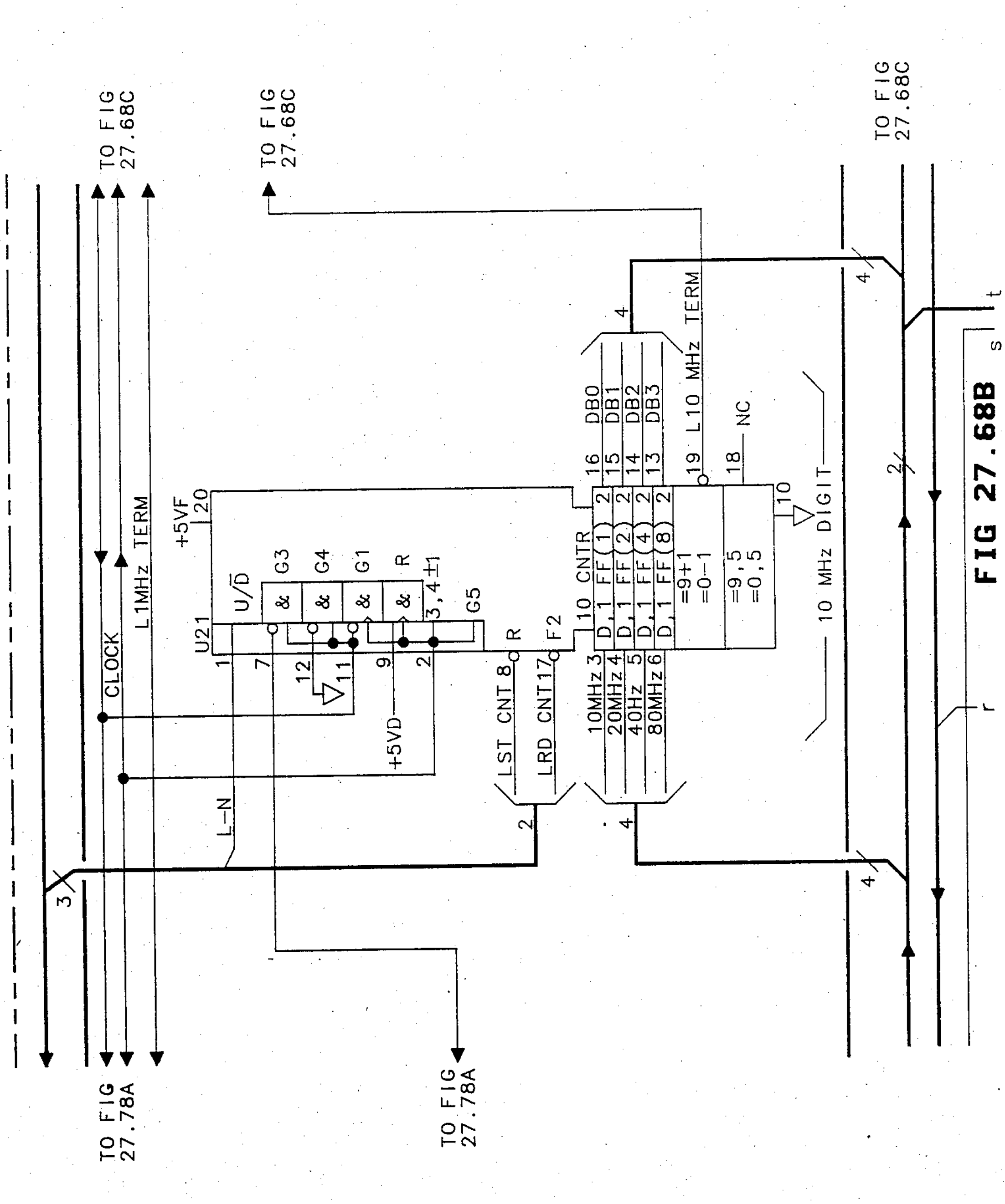
FIG 27.68B

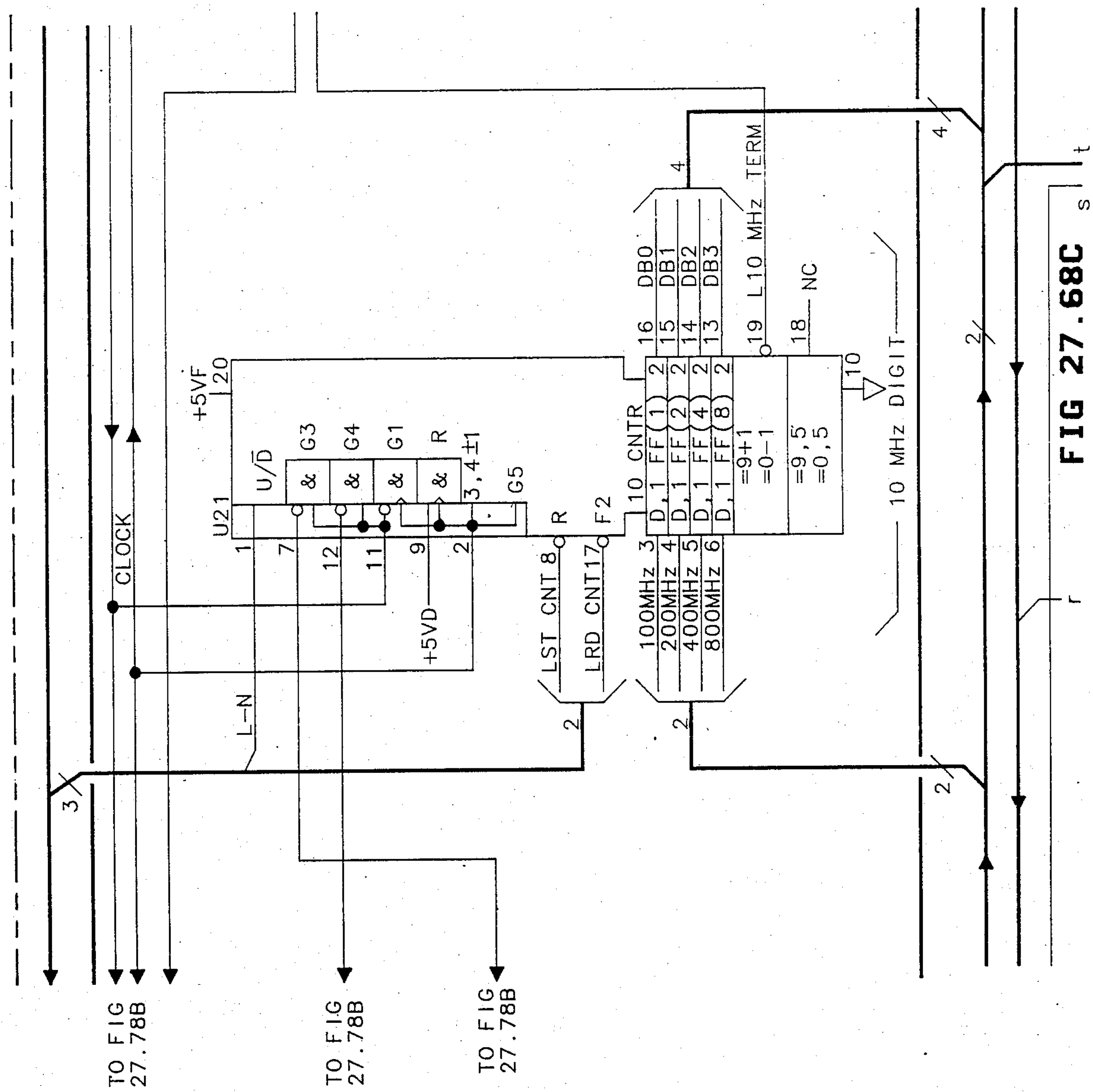
FIG 27.68C

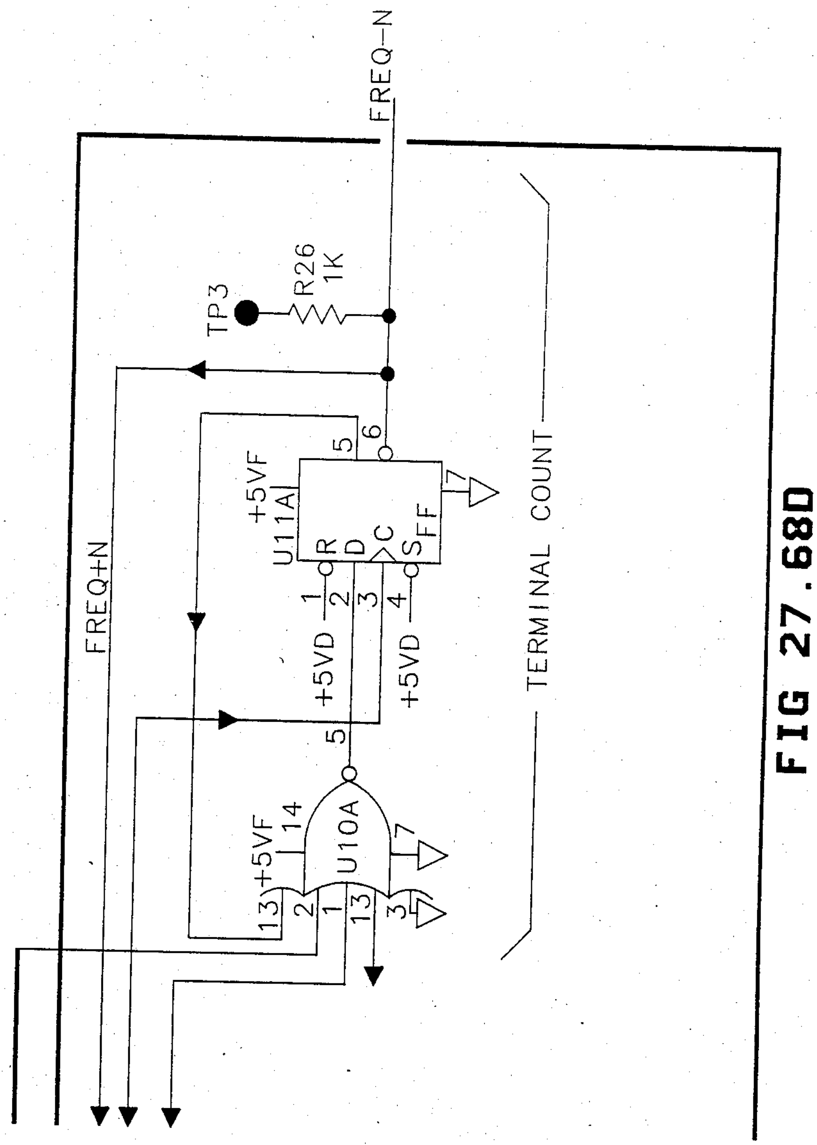
FIG 27.68D

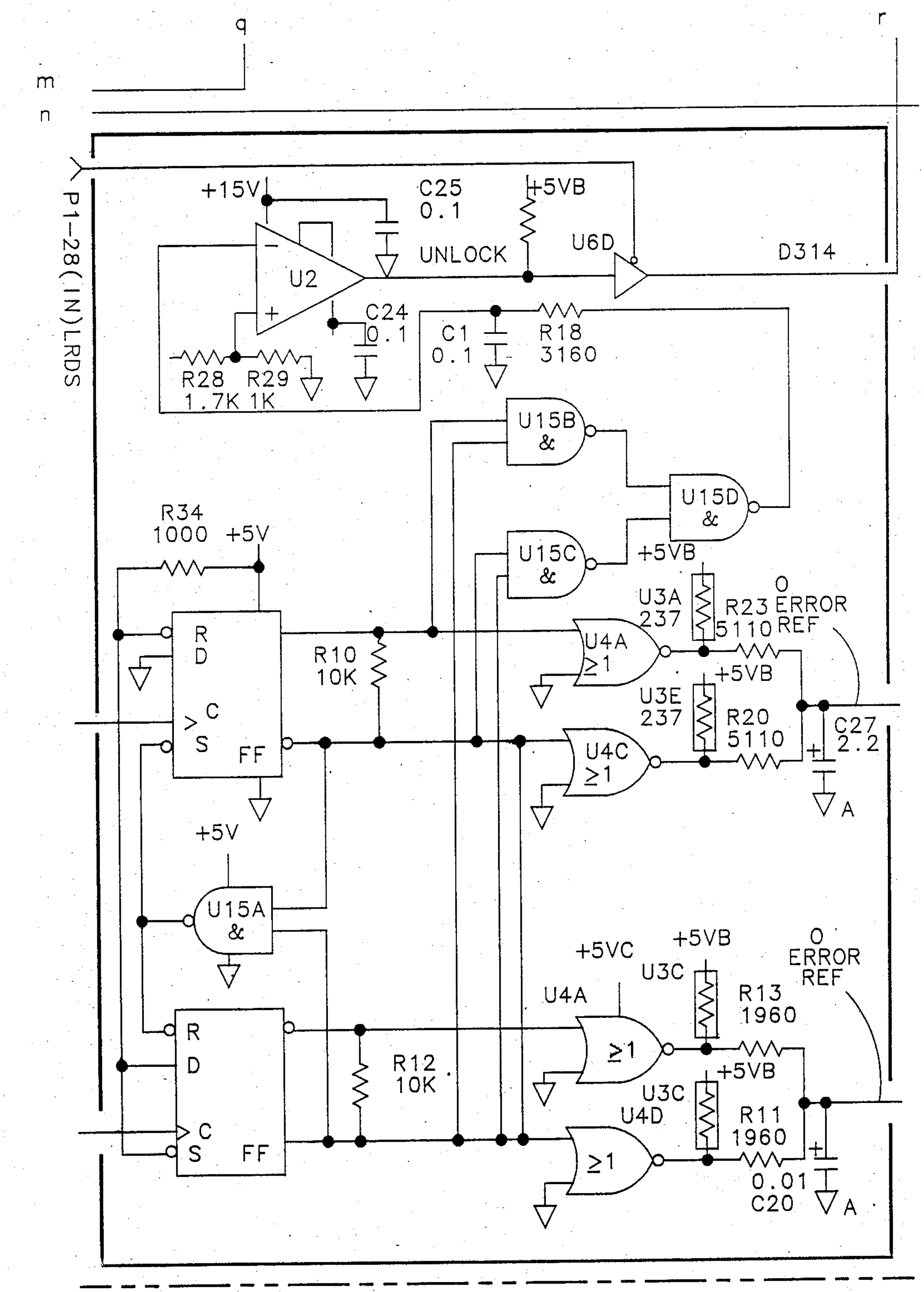
FIG 27.69A

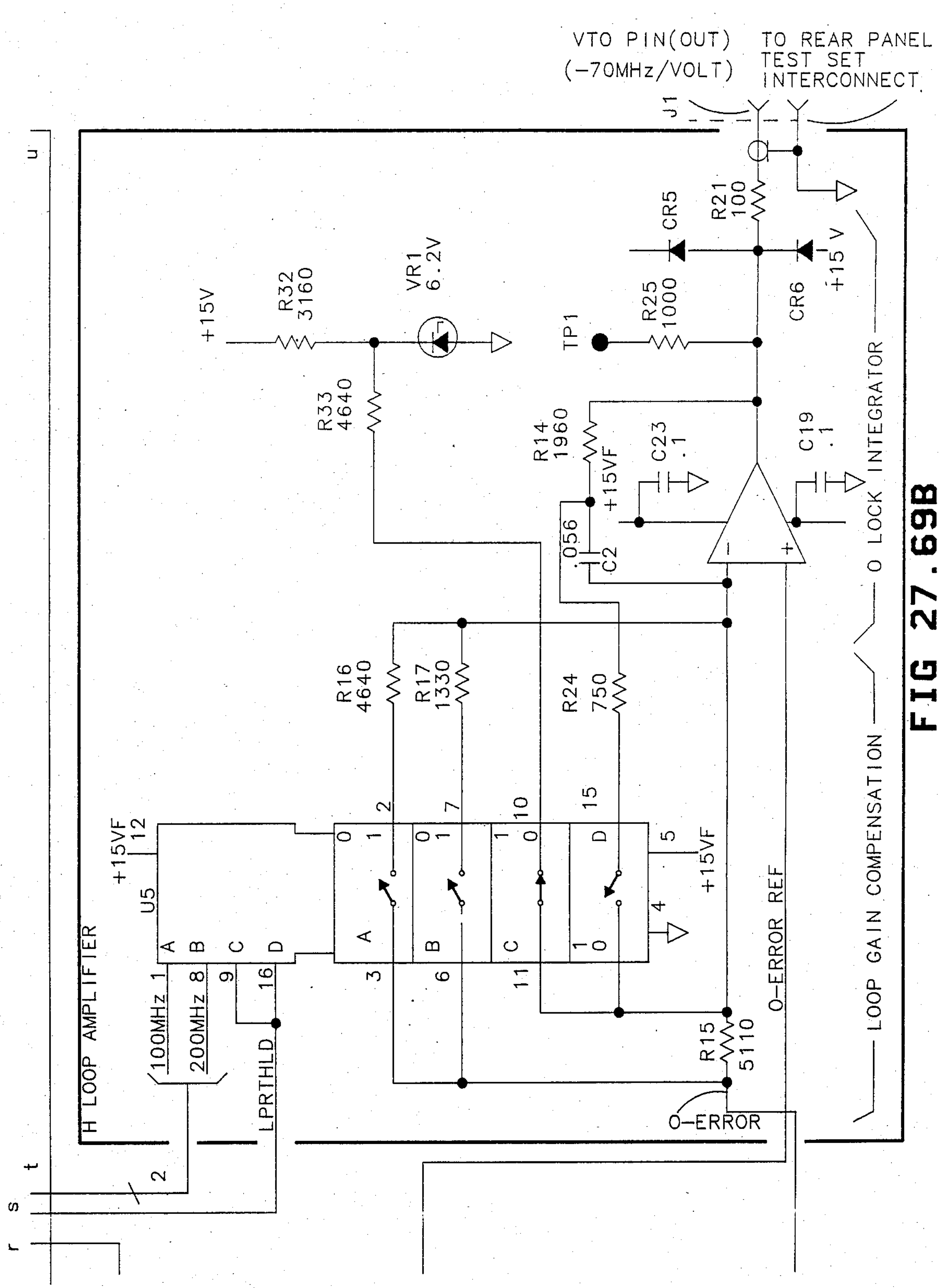
FIG 27.69B

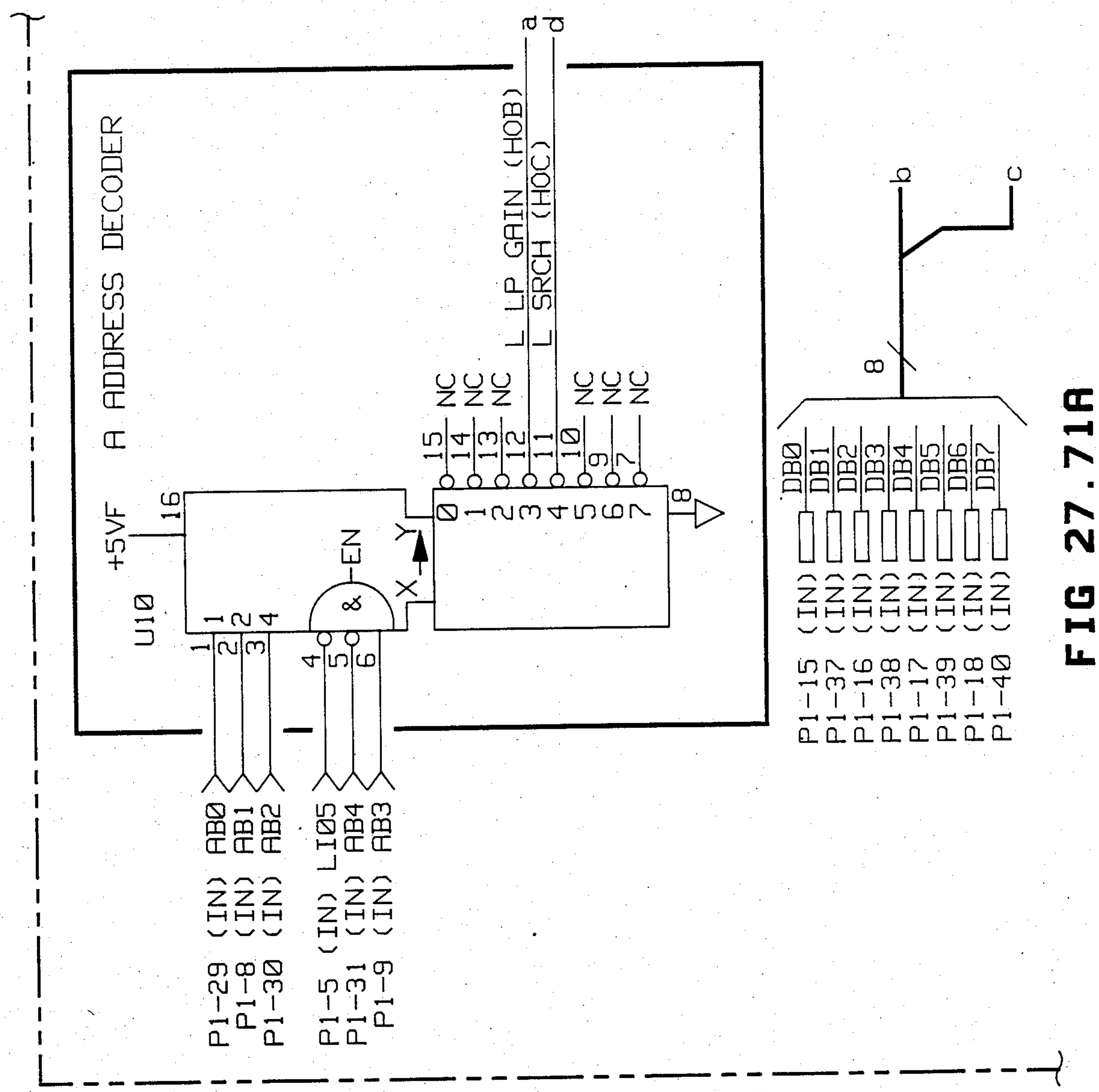
FIG 27.71A

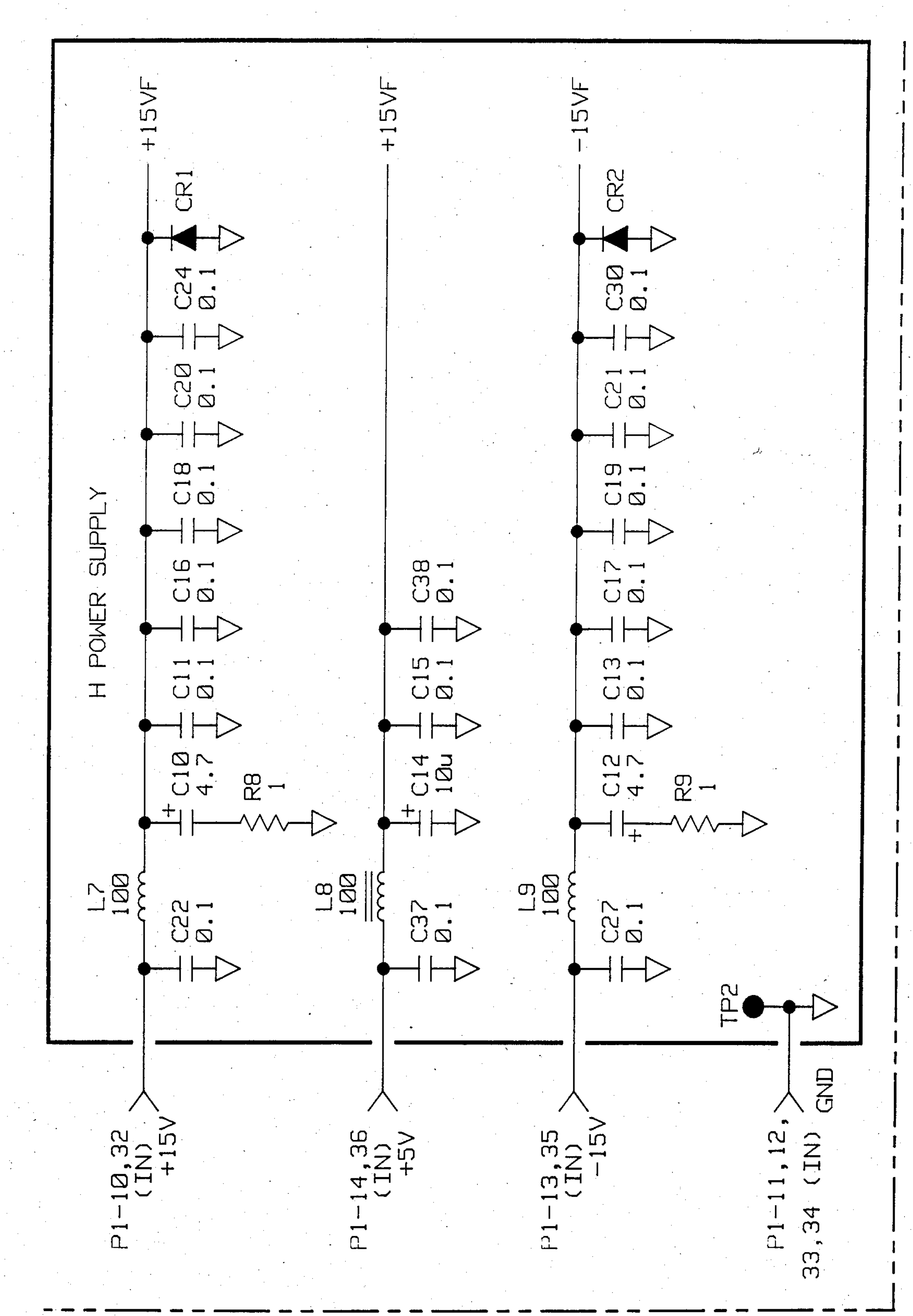
FIG 27.71B

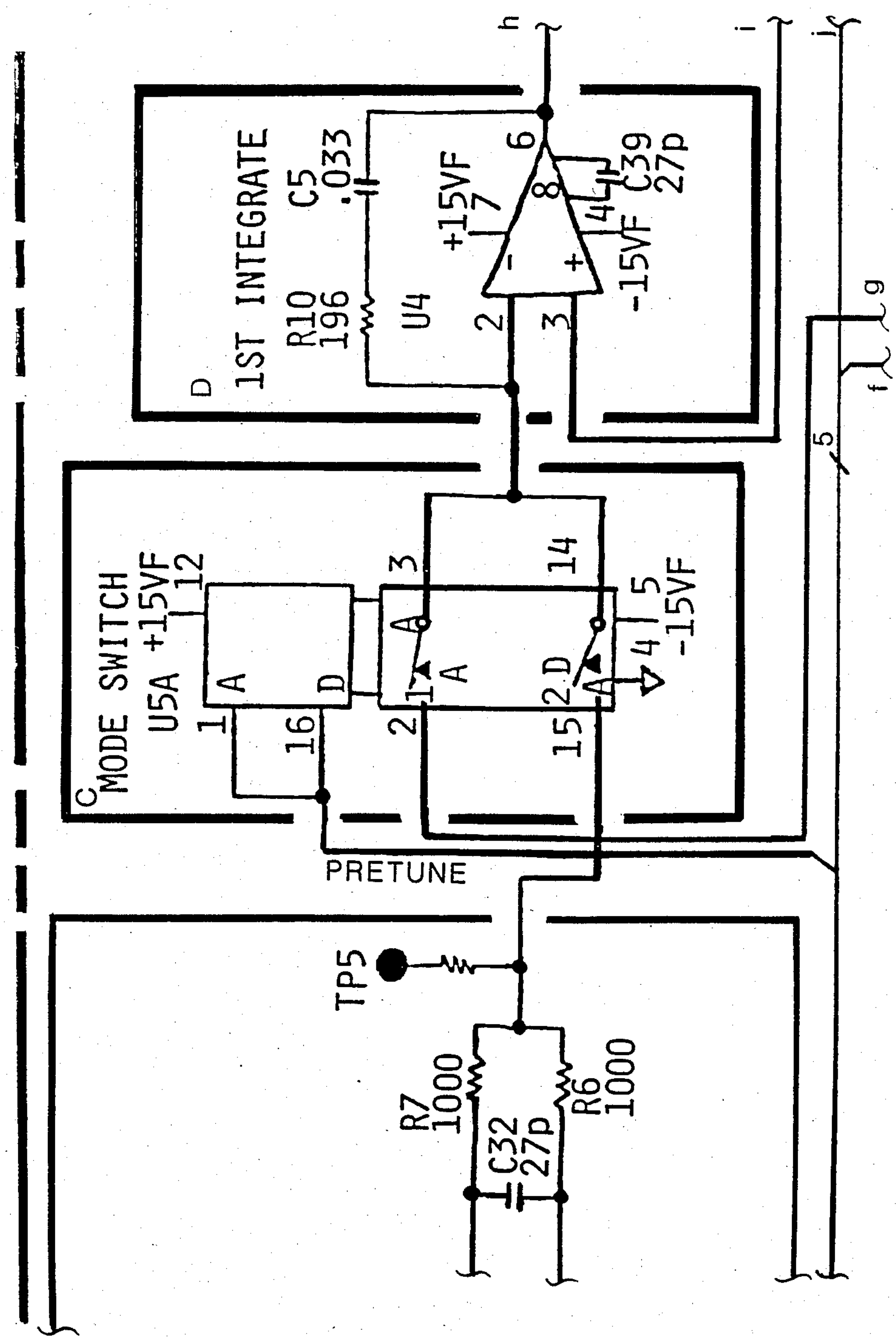
FIG 27.72B

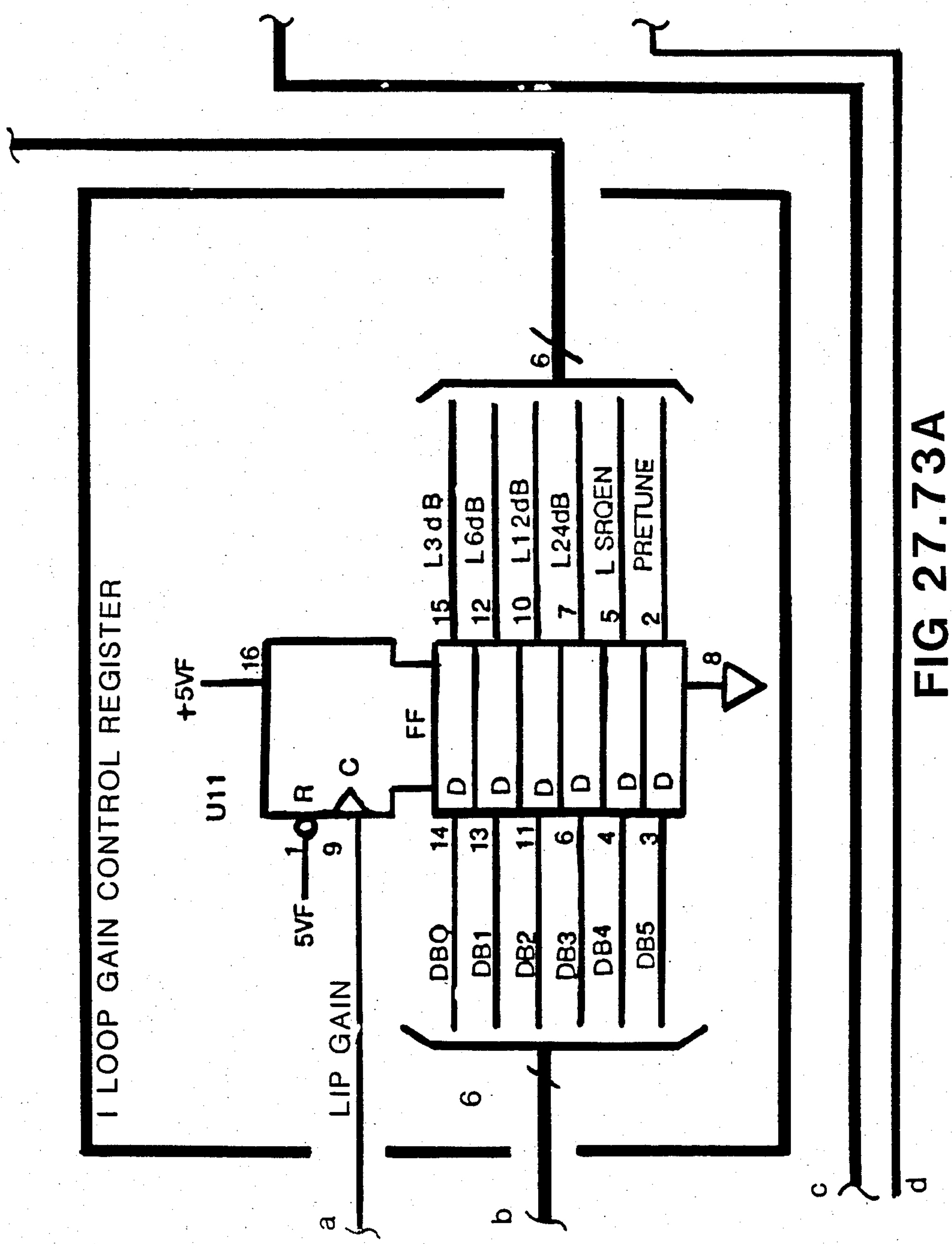
FIG 27.73A

FIG 27.73B
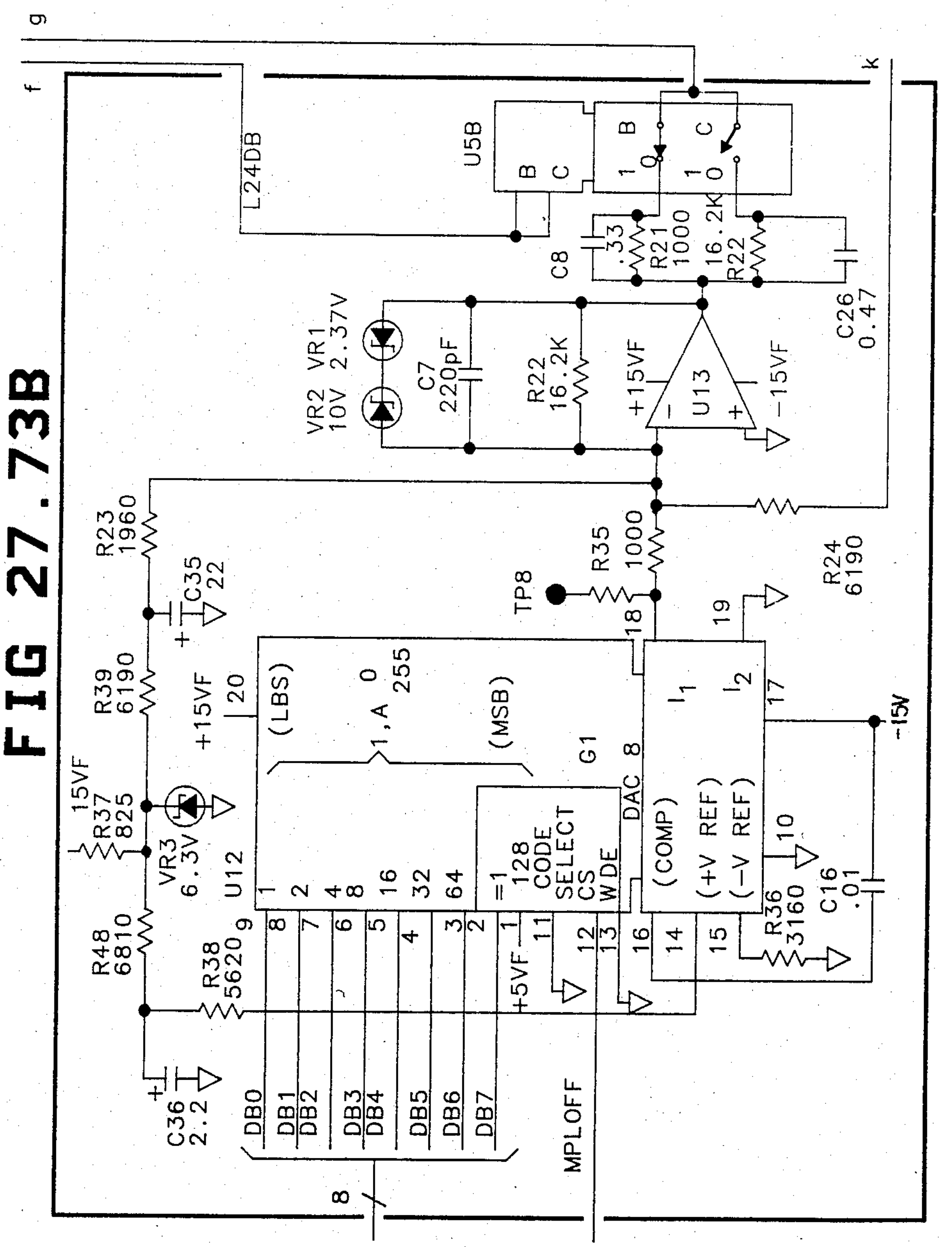

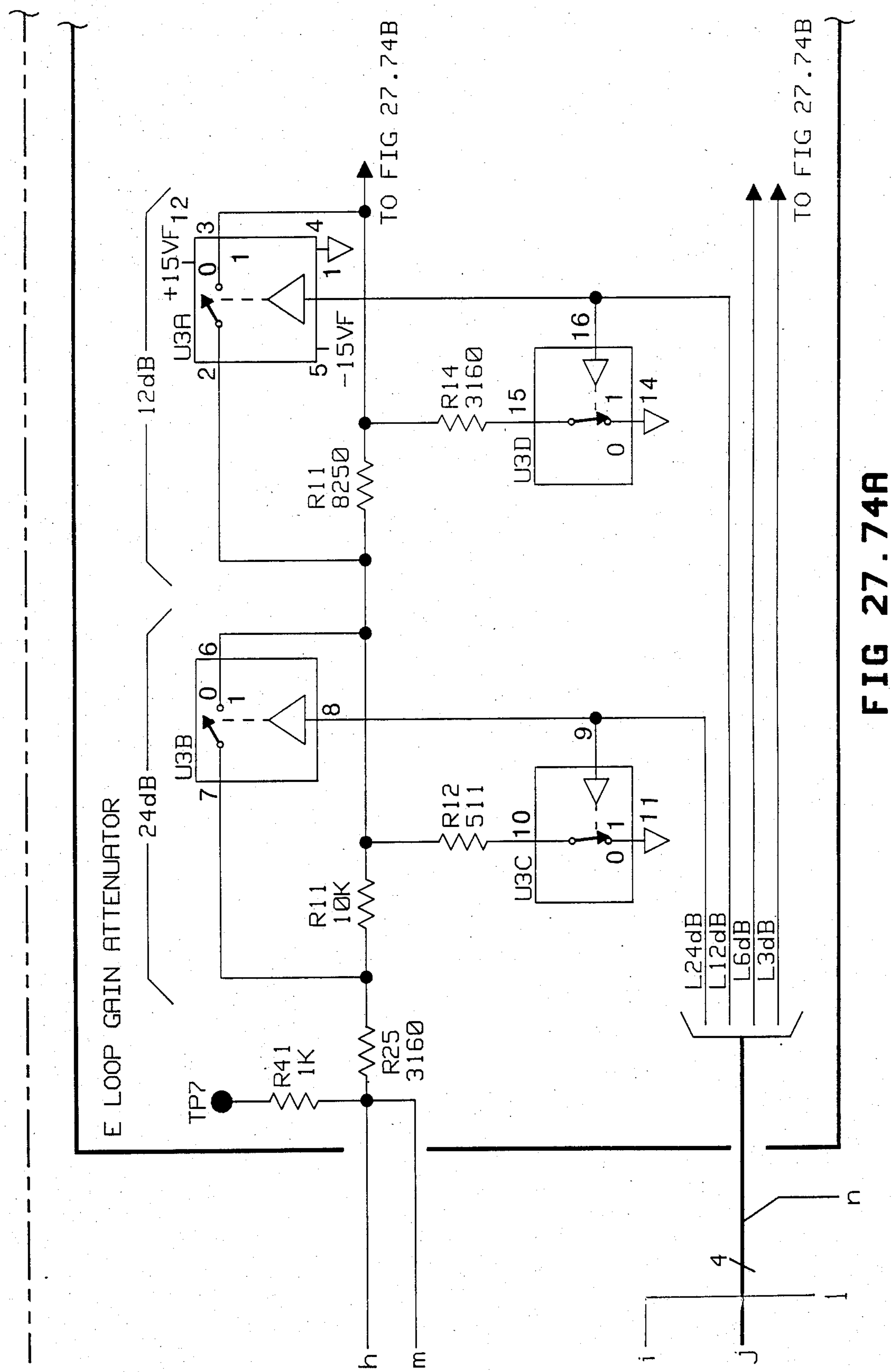
FIG 27.74A

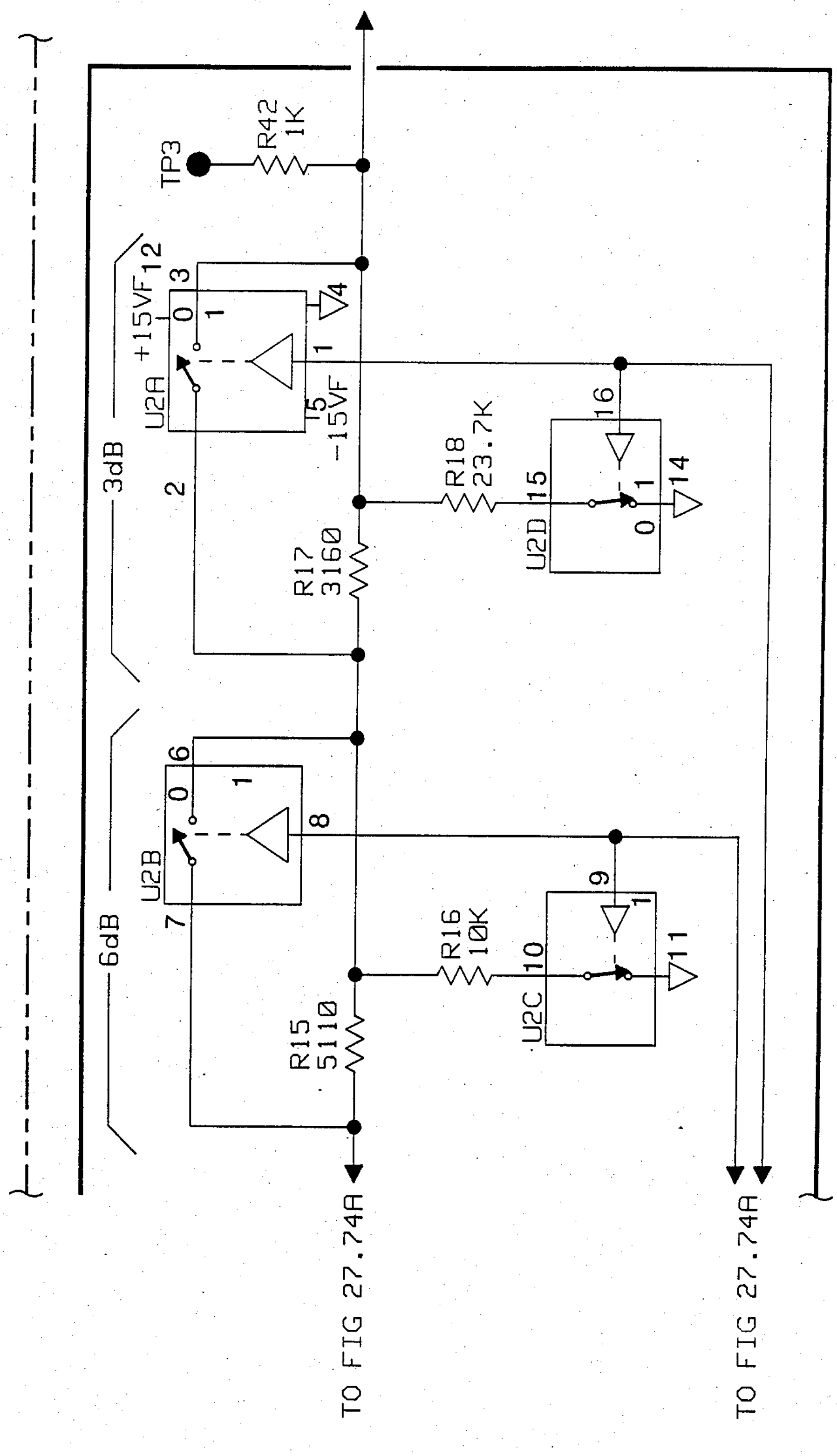
FIG 27.74B

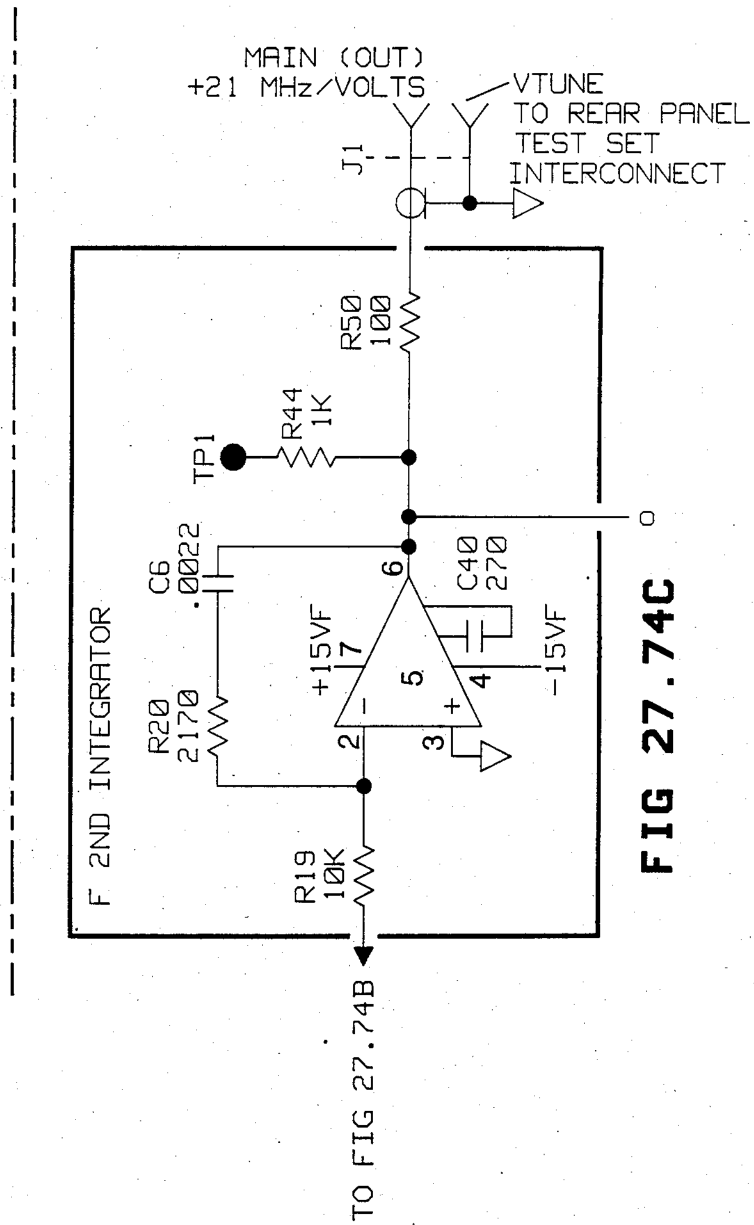
FIG 27.74C

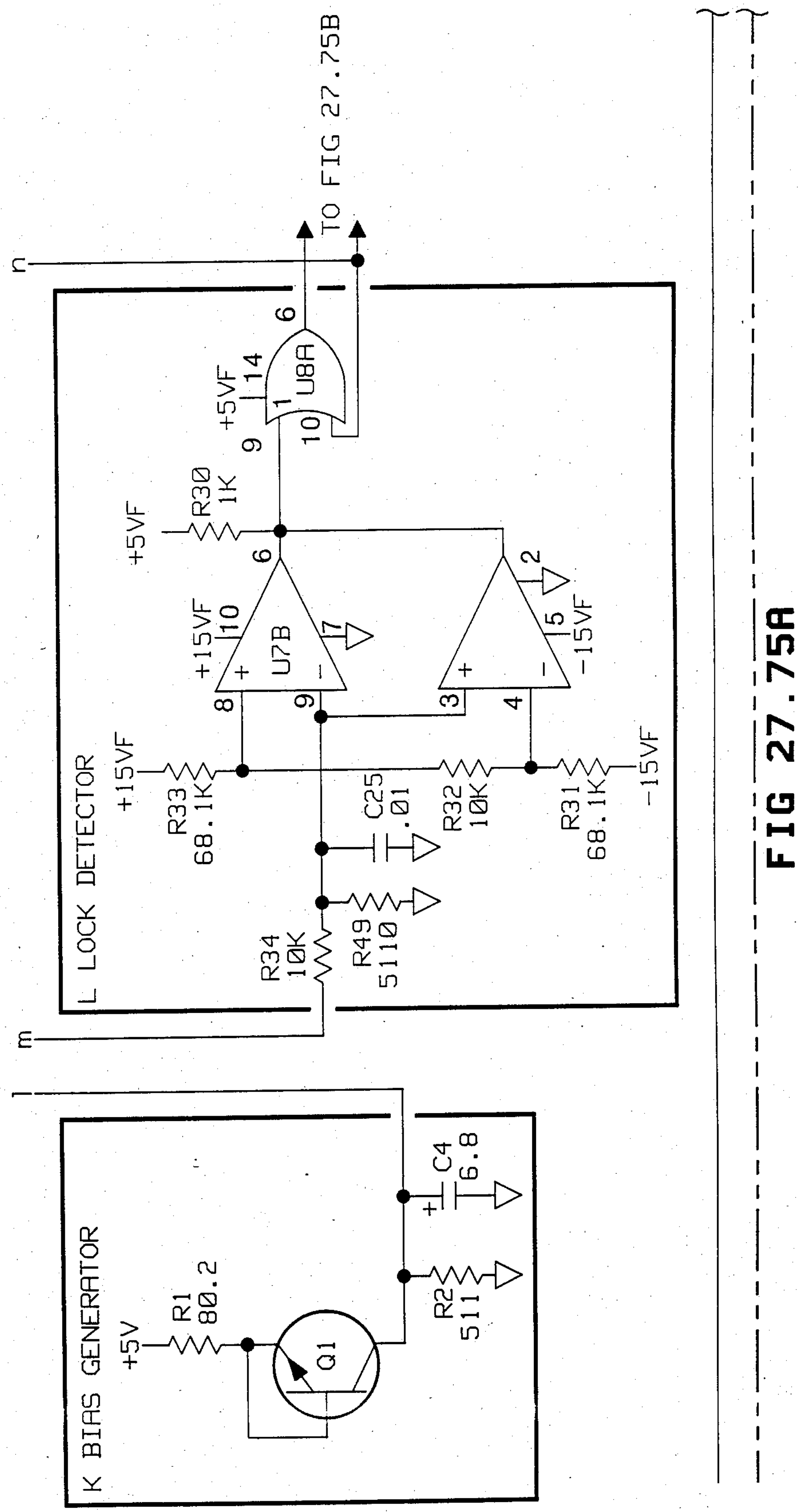
FIG 27.75A

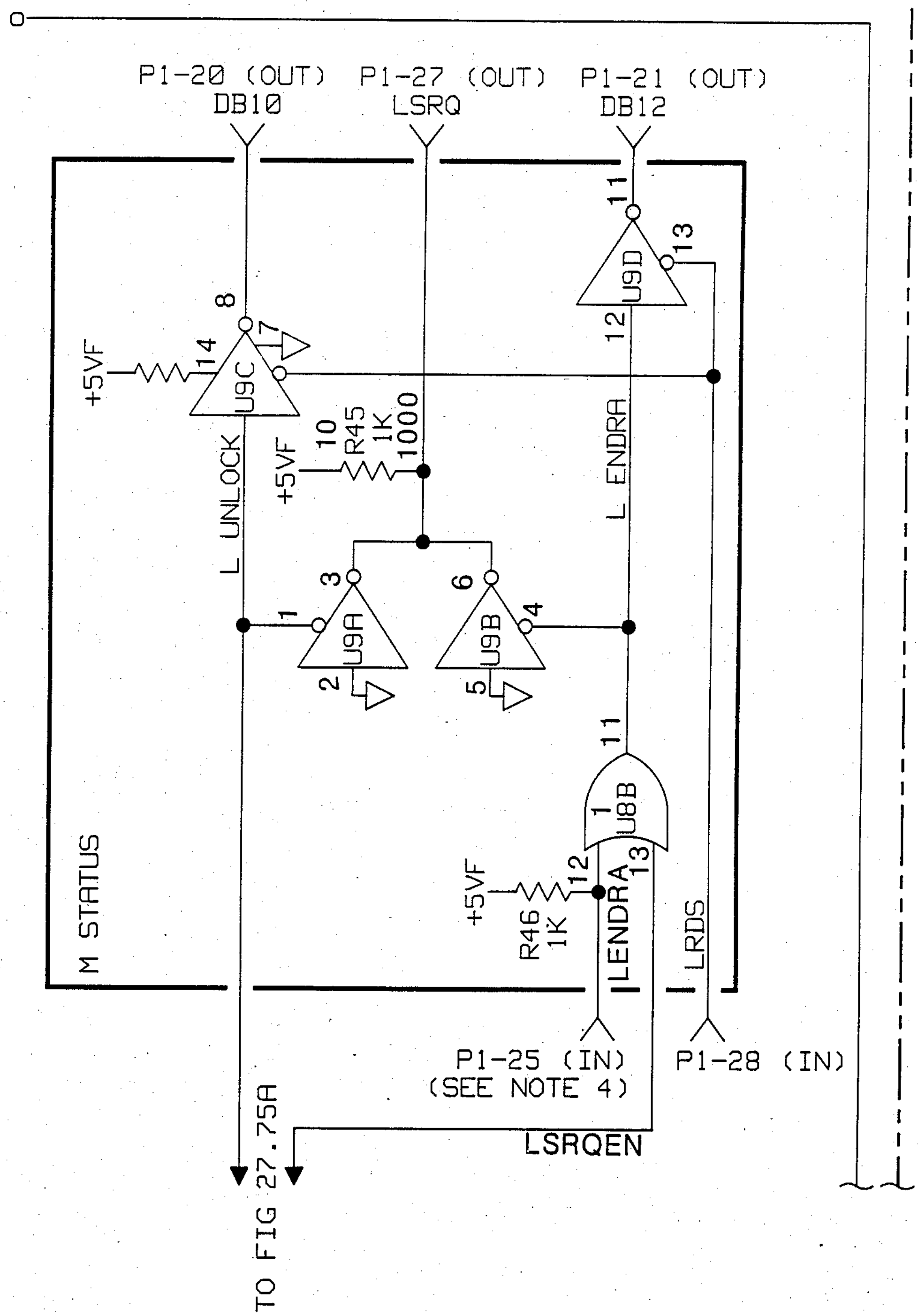
FIG 27.75B

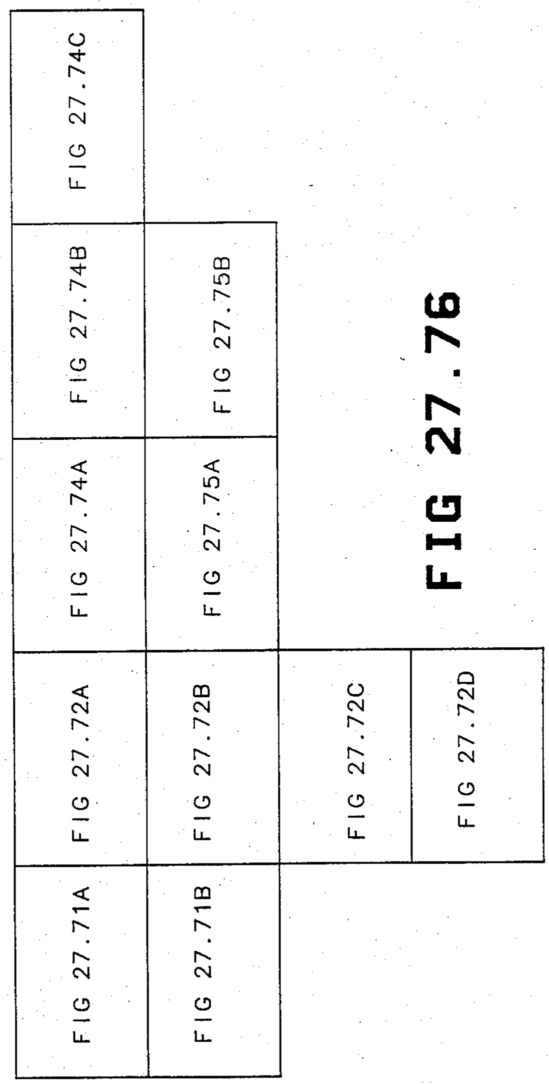
FIG 27.76
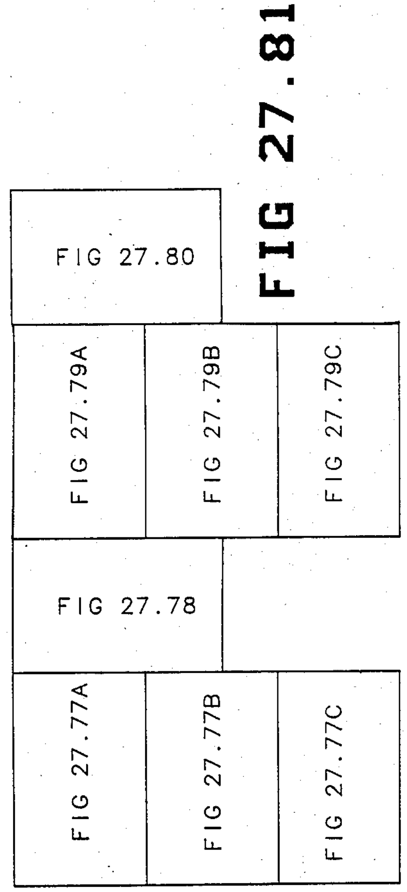
FIG 27.81

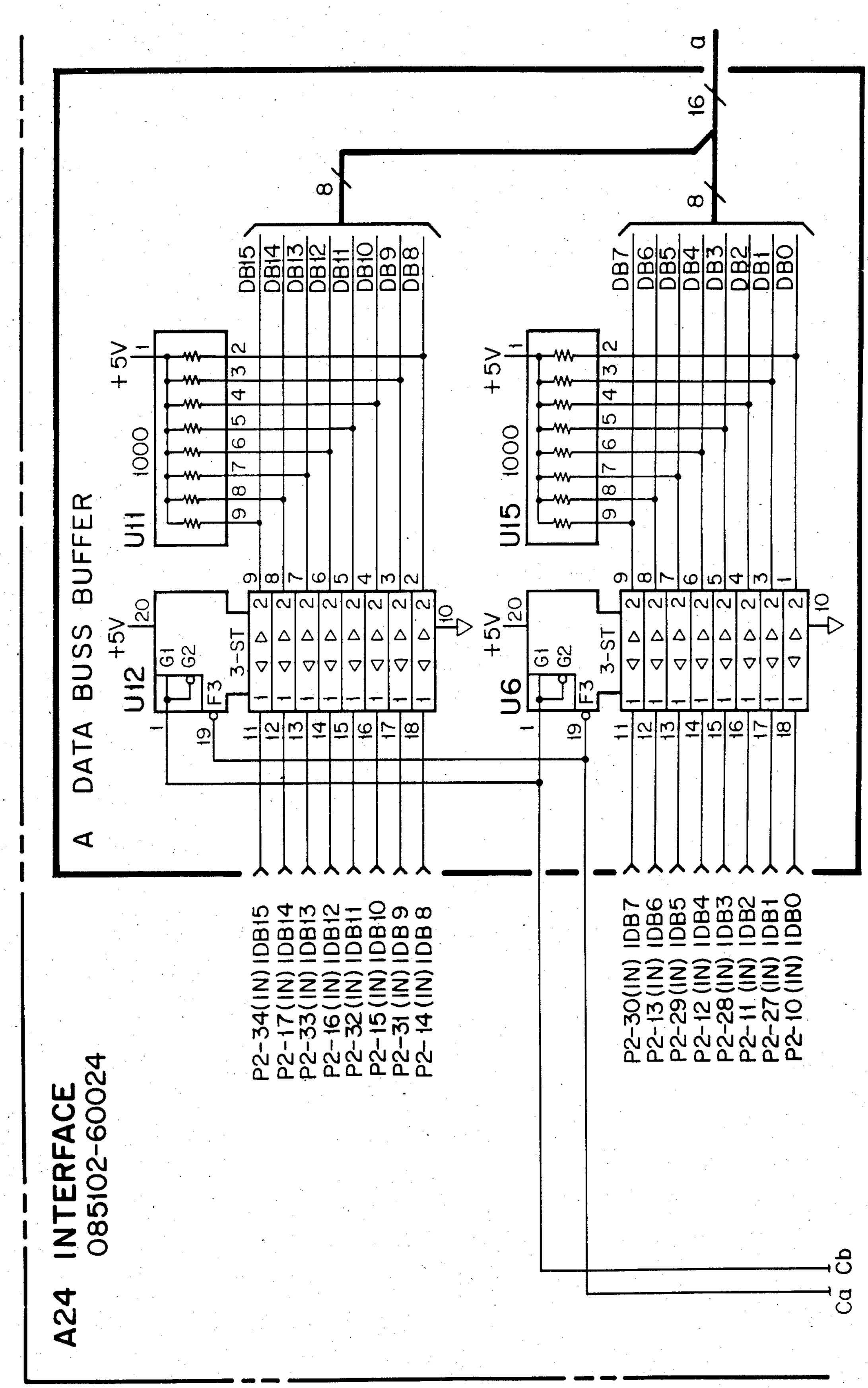
FIG 27.77A

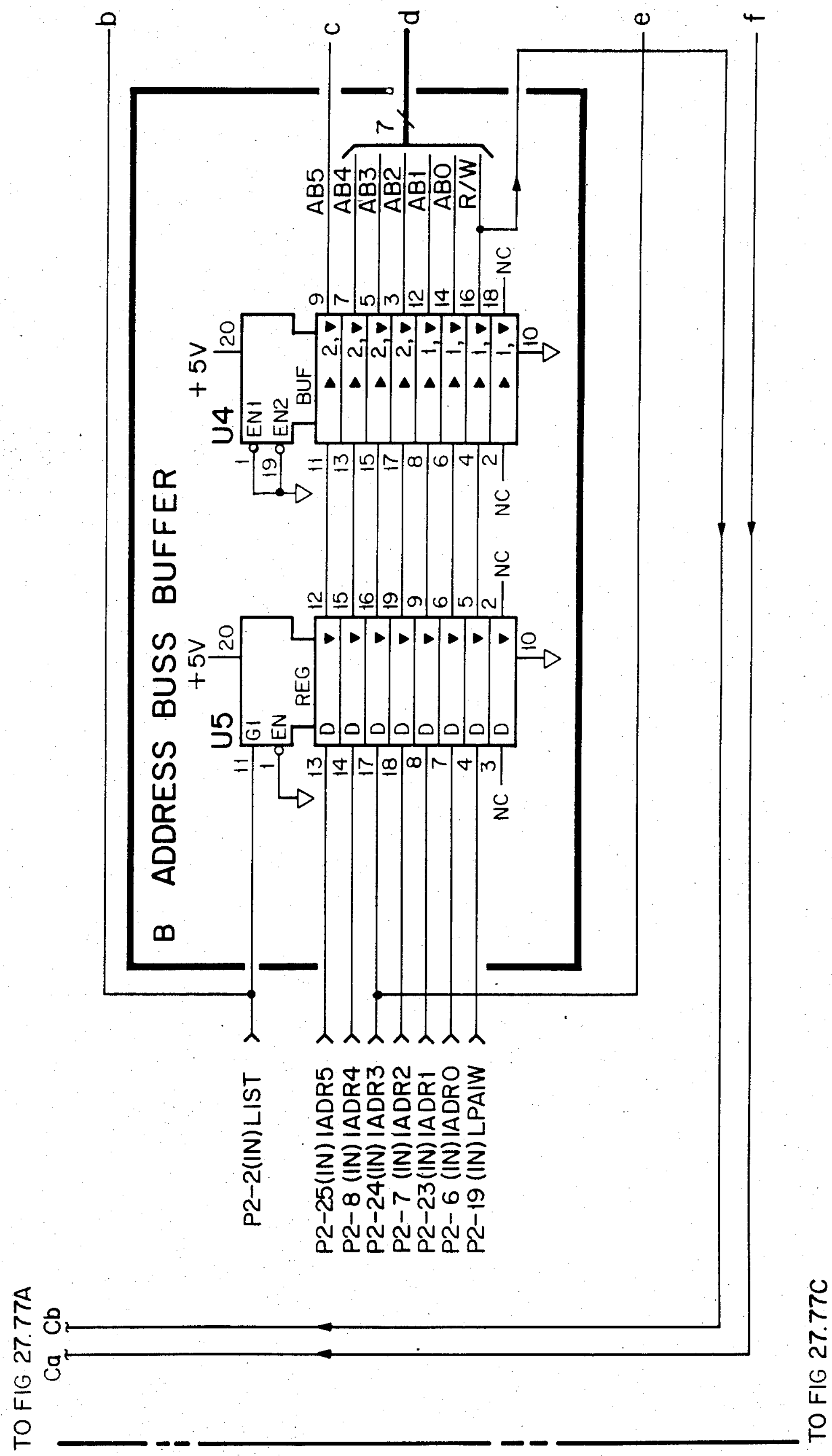
FIG 27.77B

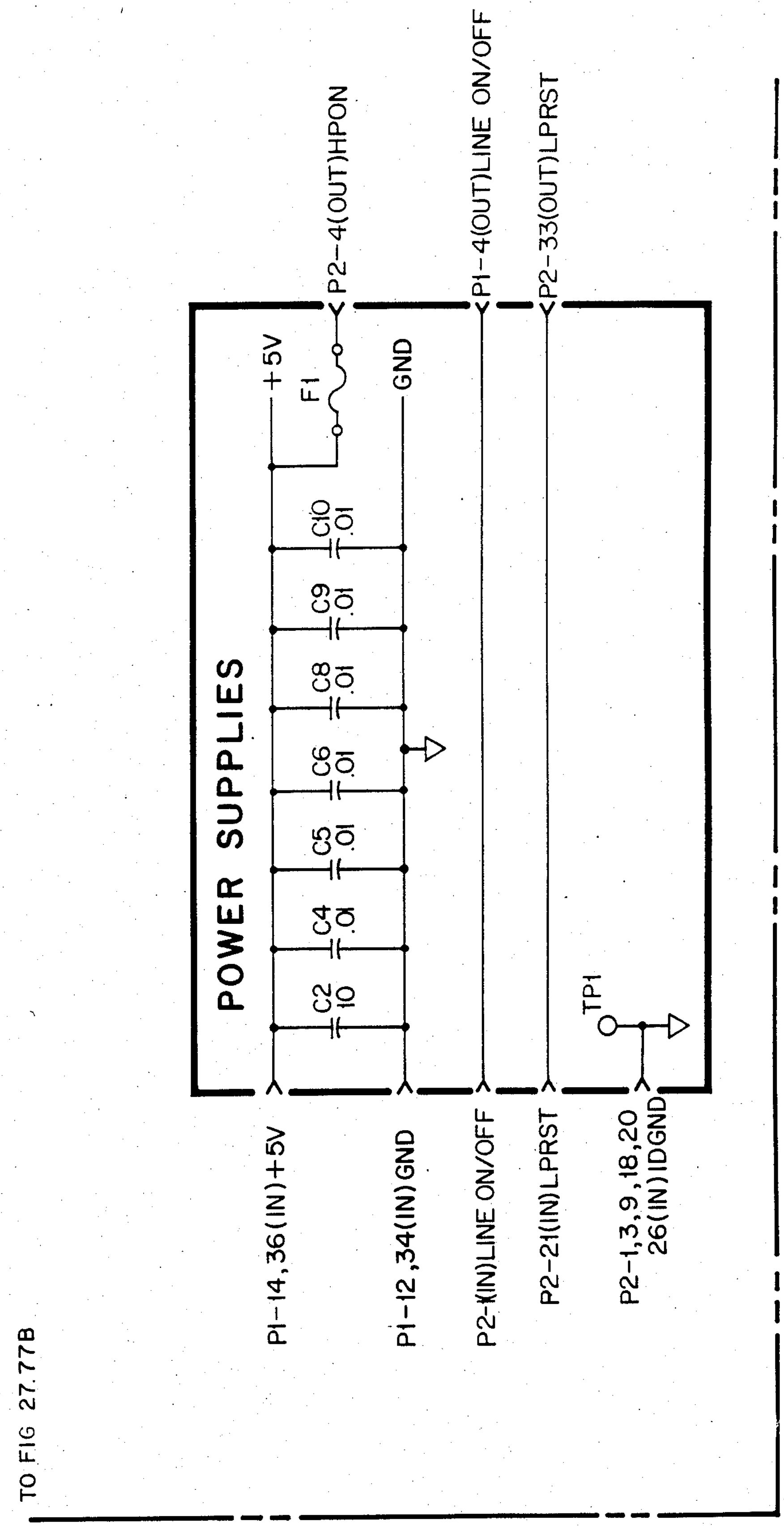
FIG 27.77C

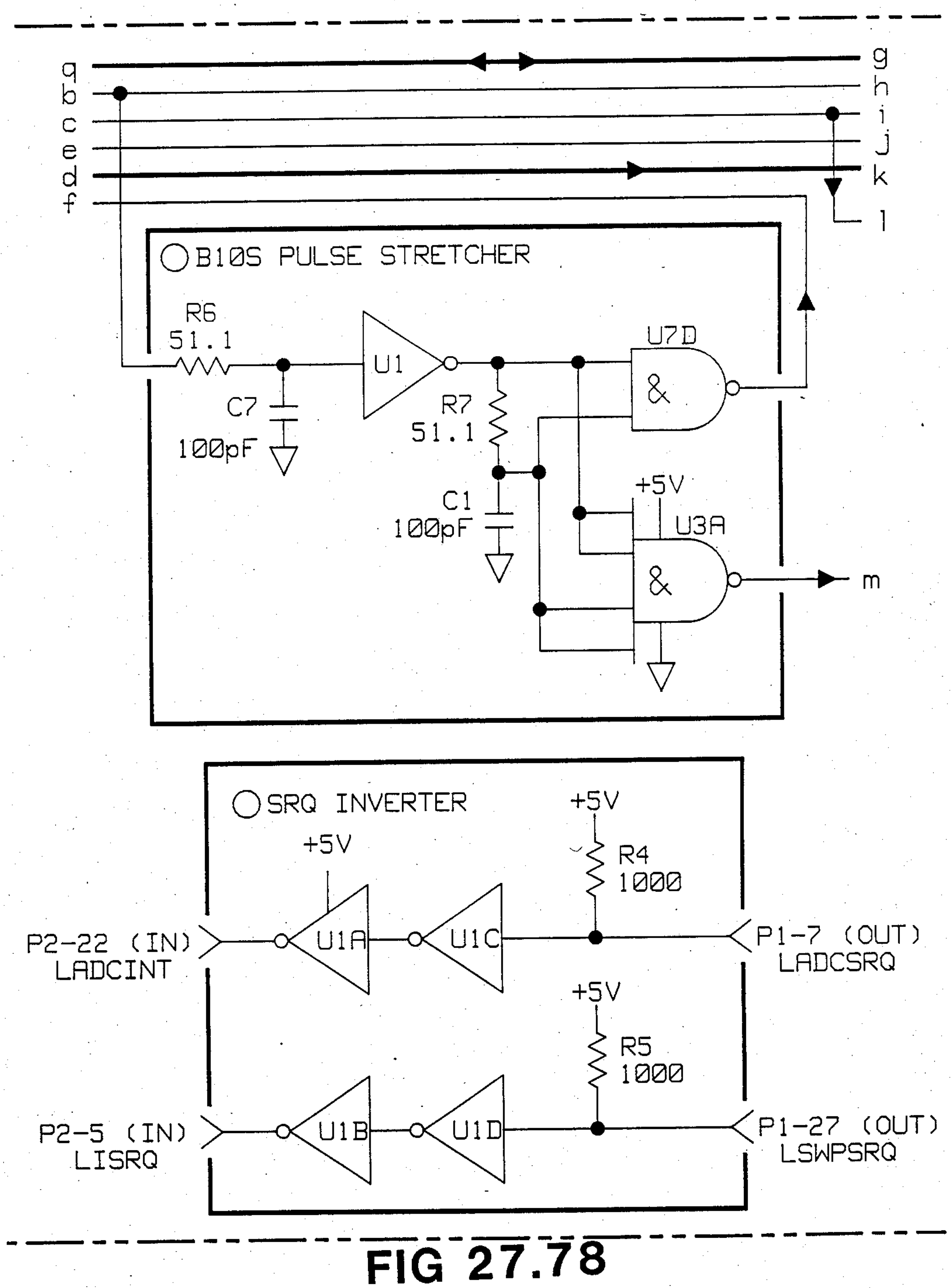
FIG 27.78

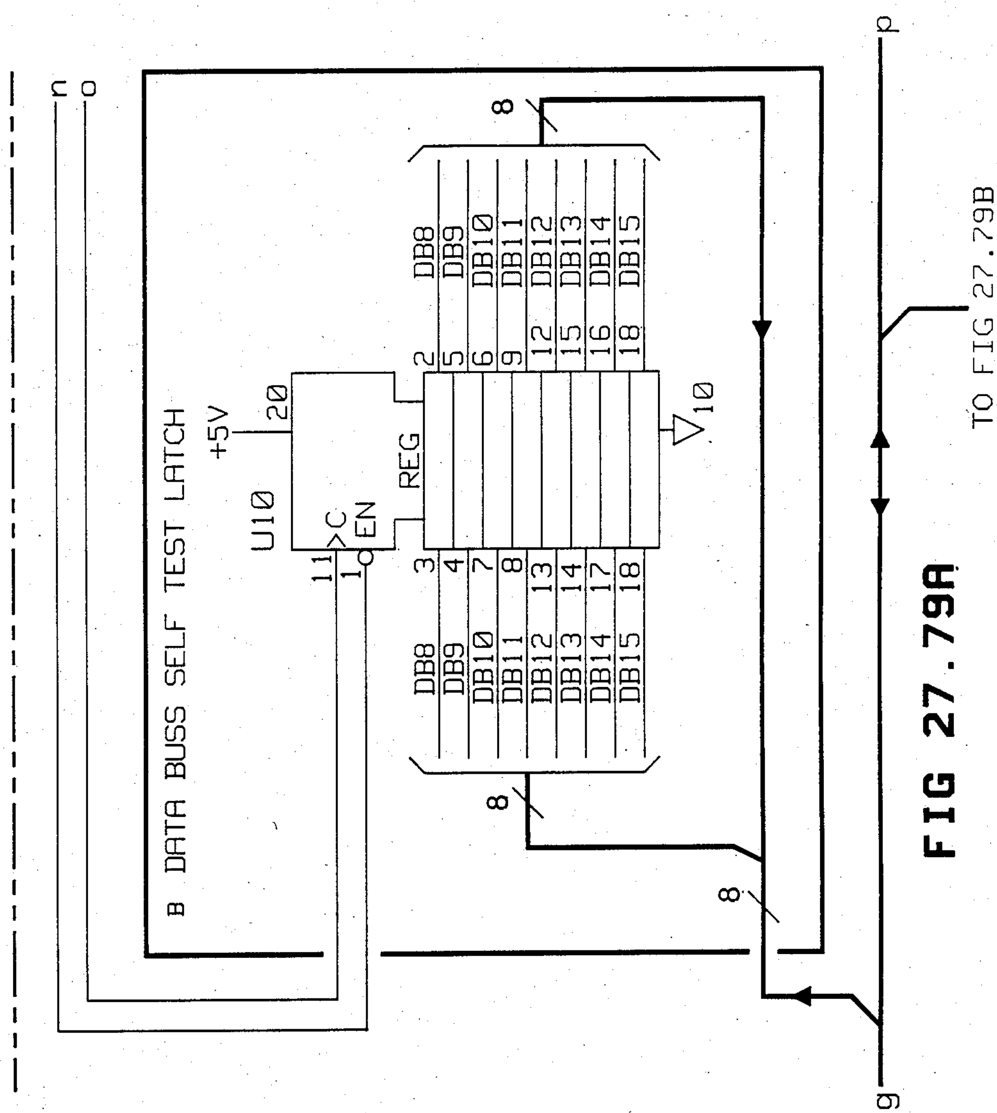
FIG 27.79A

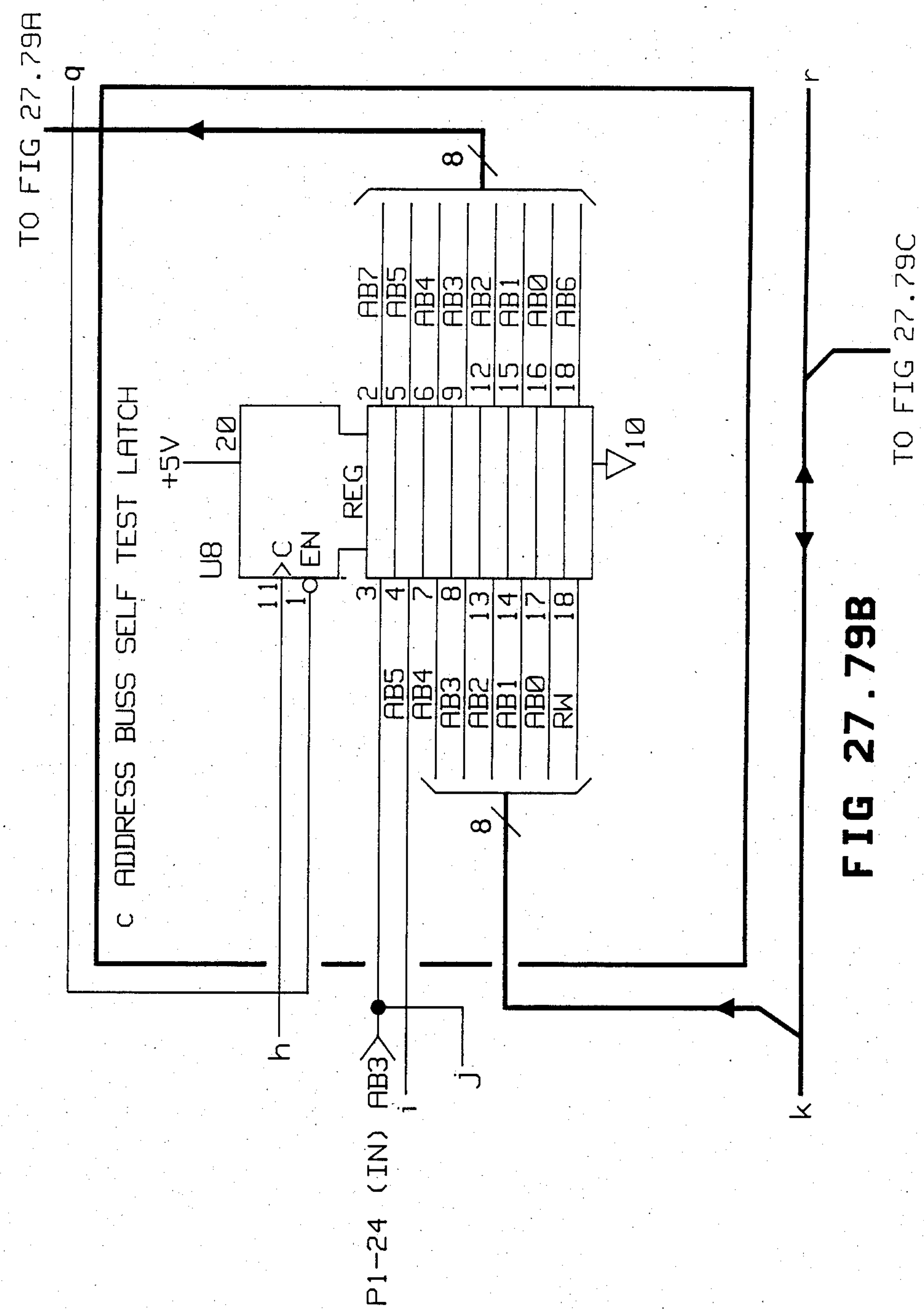
FIG 27.79B

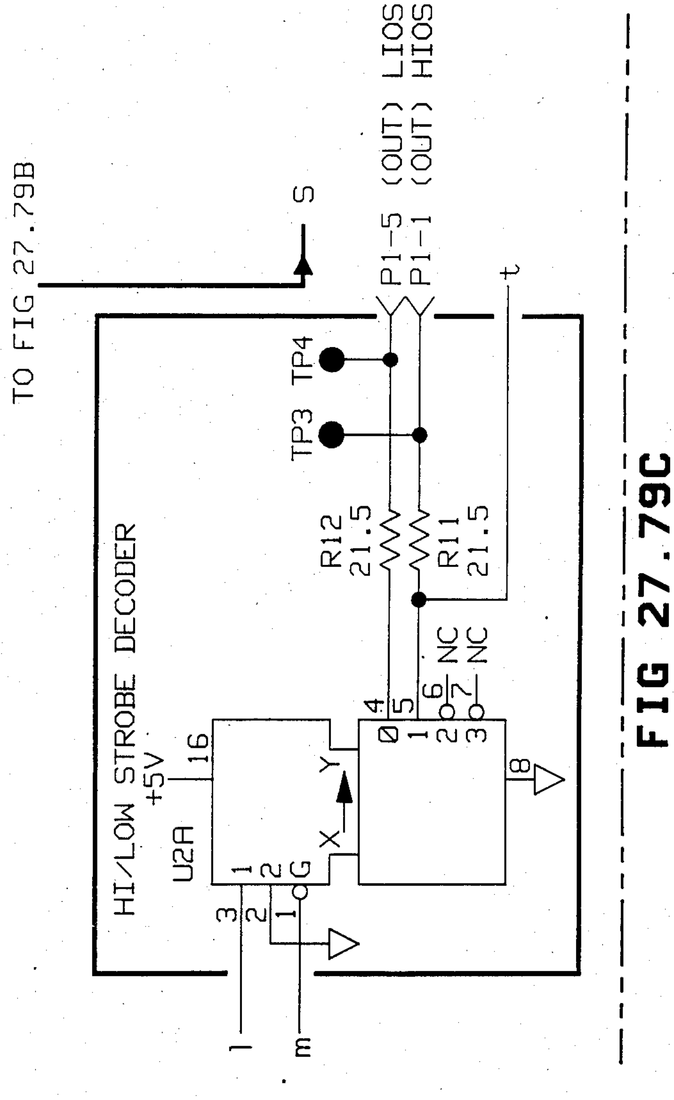
FIG 27.79C

FIG 27.80
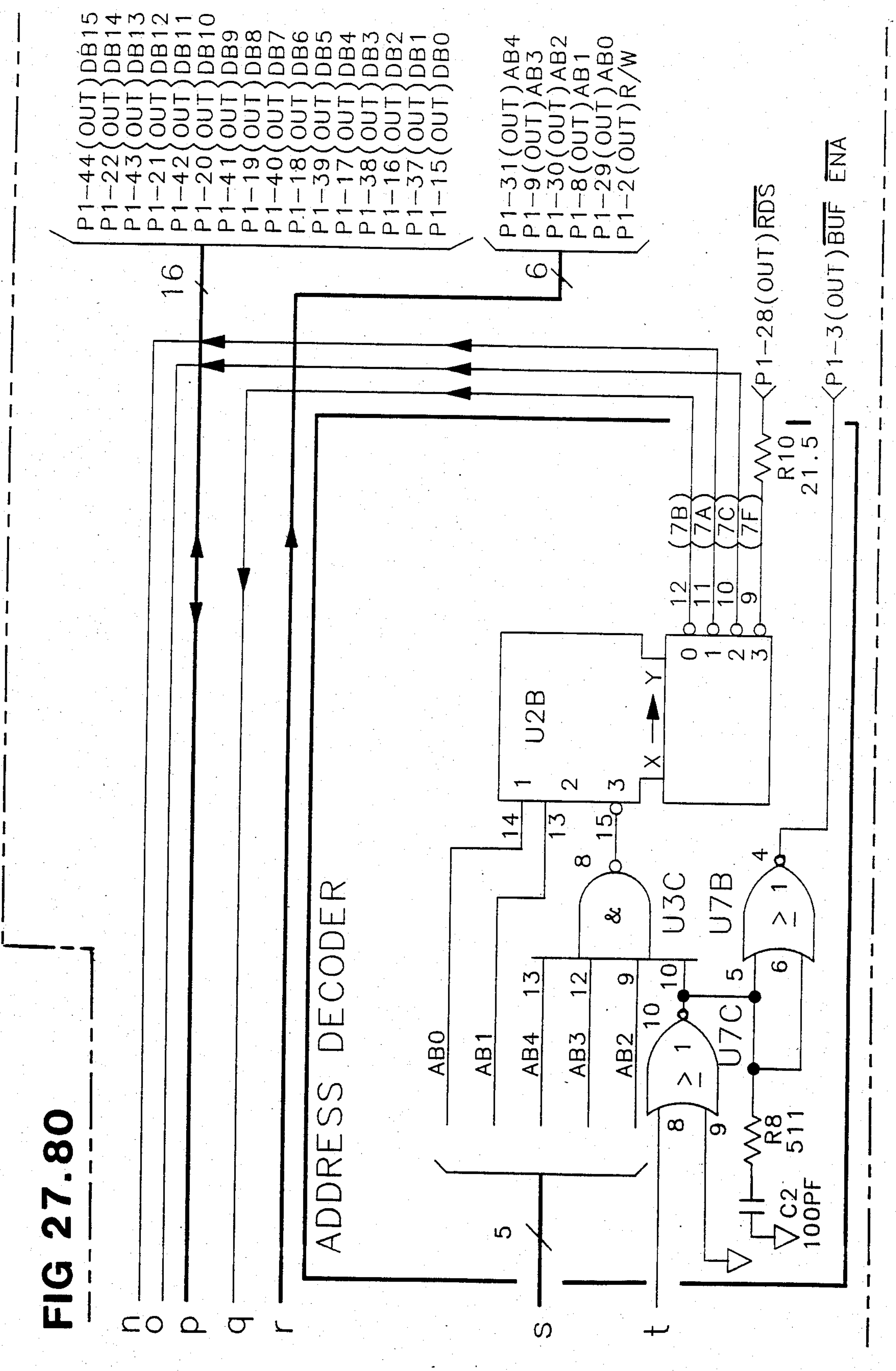

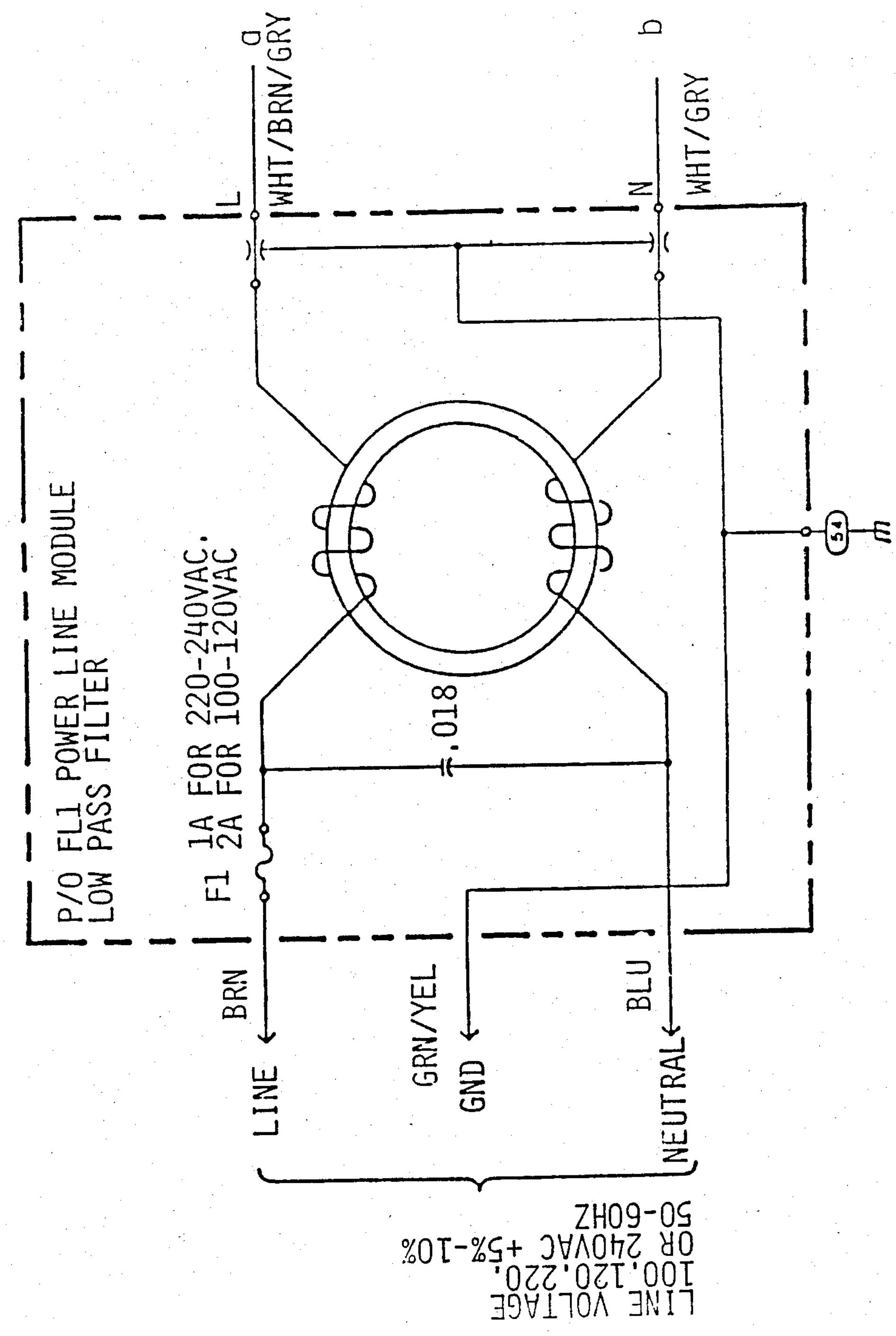
FIG 27.82A

| PIN | SIGNAL | TO/FROM | FUNCTION BLOCK |
|---|---|---|---|
| 1 | 18VAC | T1 | A |
| 2 | 18VAC | T1 | A |
| 3 | 9.7VAC | T1 | B |
| 4 | 18VAC CENTER TAP | T1 | A |
| 5 | 9.7VAC CENTER TAP | T1 | B |
| 6 | 9.7VAC | T1 | B |

| PIN | SIGNAL | TO/FROM | FUNCTION BLOCK |
|---|---|---|---|
| E1 | +5V RAM | A25R1: A25C1 | B |
| E2 | +5V UNREG | A25Q1 | B |
| E3 | -5V RAM | A25R2. A25C2 | B |
| E4 | GND | GND BUS | A |
| E5 | -5V UNREG | A25Q2 | B |
| E6 | +15V UNREG | A15P1-40 A25Q3 | A |
| E7 | +15V RAM | A25R3 A25C3 | A |
| E8 | -15V UNREG | A15P1-17. A25Q4 | A |
| E9 | -15V RAM | A25R4 A25C4 | A |

SEMICONDUCTOR COMPONENTS
PARTS LIST (U'S AND Q'S)

| REF. DESIG. | PART NO. | MFR. PART NO. |
|---|---|---|
| CR1-CR8 | 1901-0662 | MR-751 |
| DS1-DS4 | 1990-0485 | 5082-4984 |
| VR1-VR2 | 1902-0025 | |
| VR3-VR4 | 1902-0049 | |

FIG 27.82B

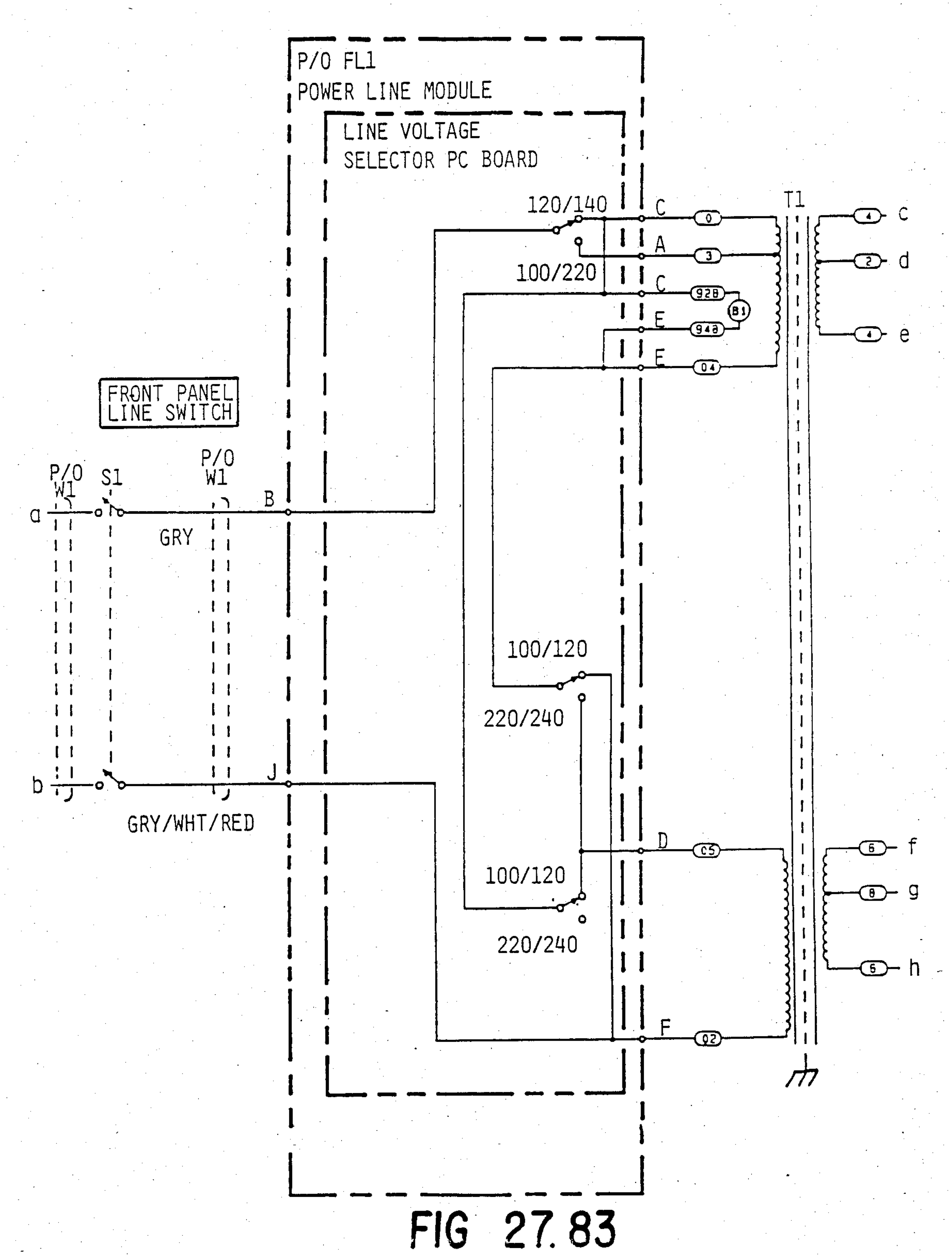
FIG 27.83

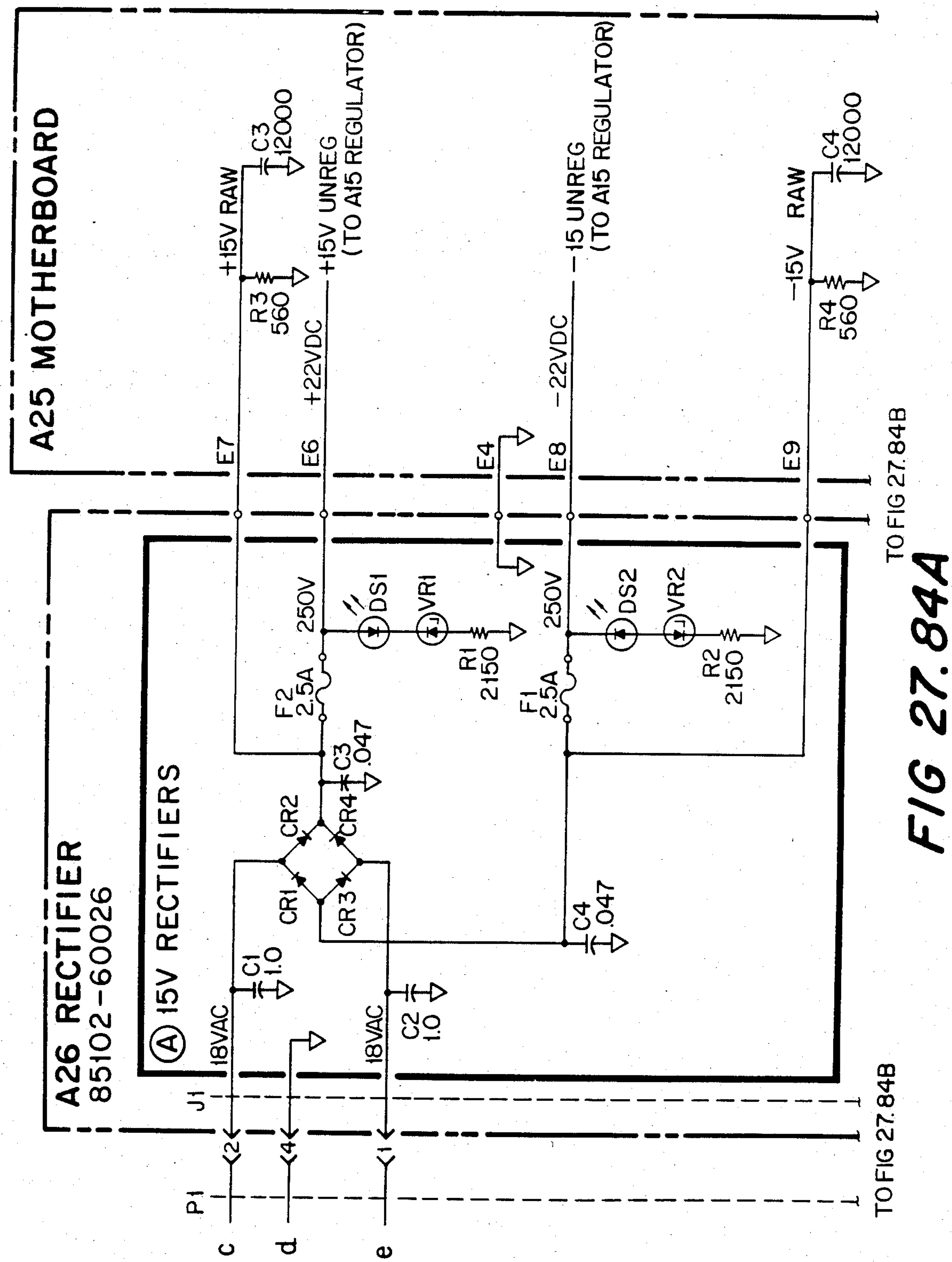
FIG 27.84A

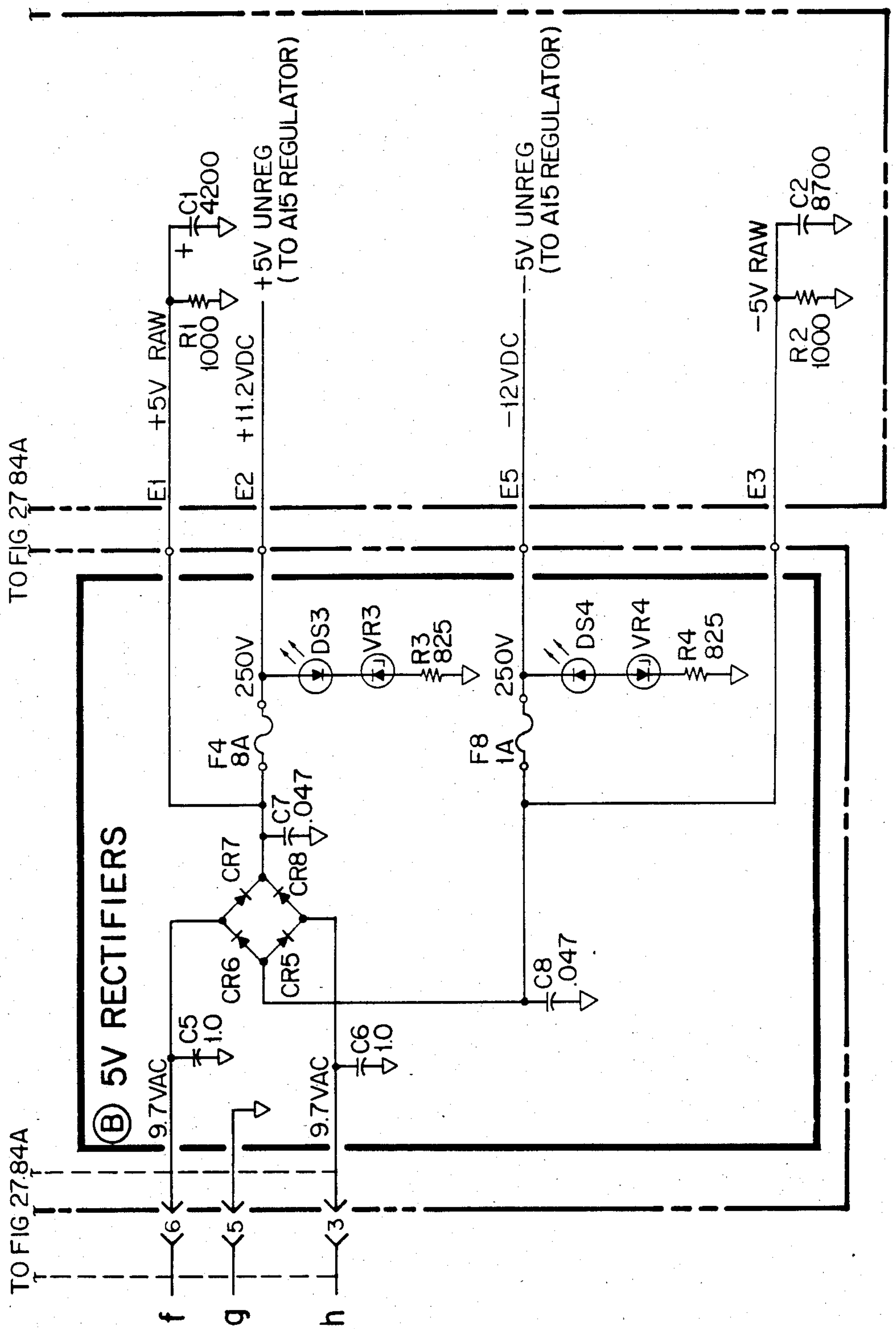
FIG 27.84B

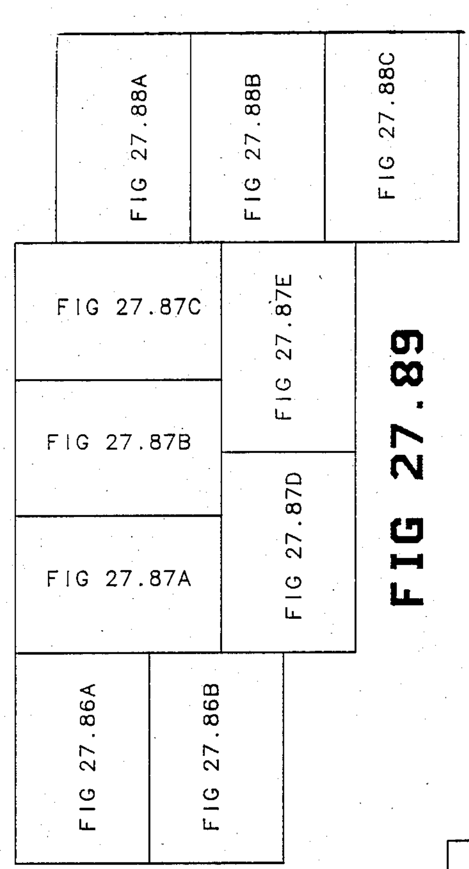
FIG 27.89
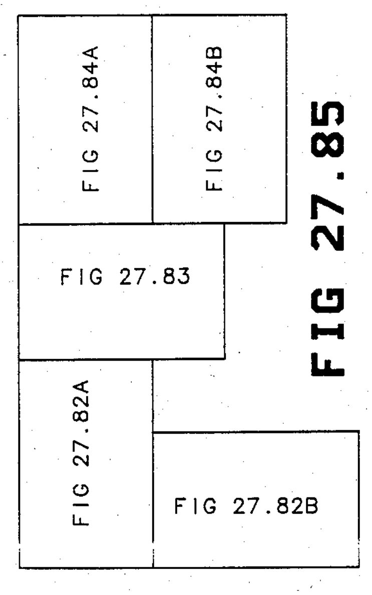
FIG 27.85
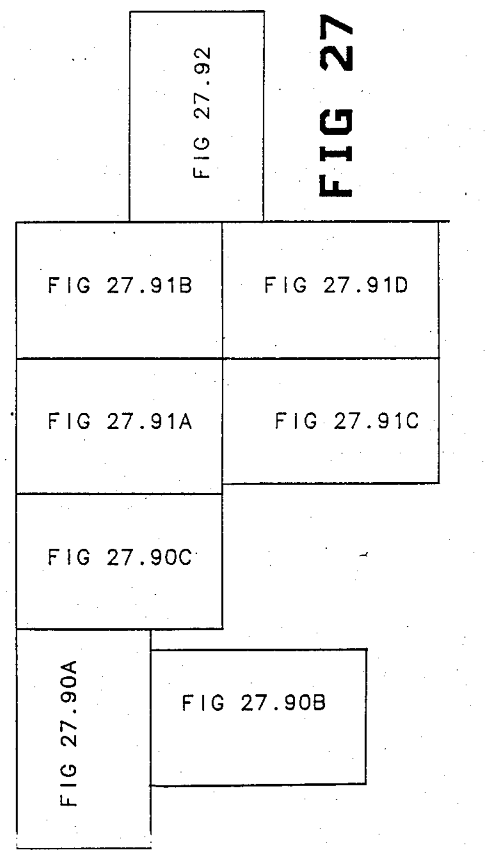
FIG 27.93

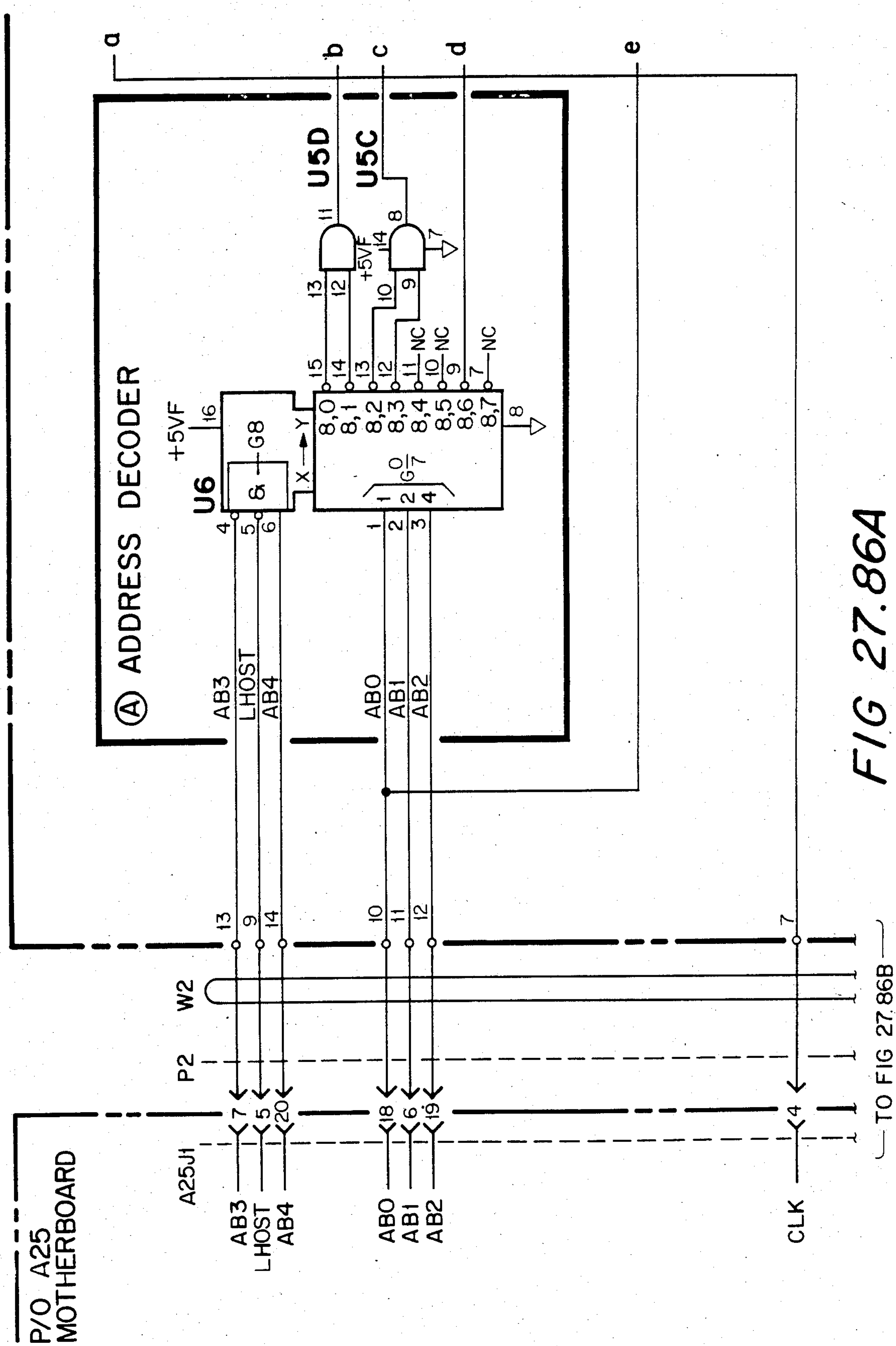
FIG 27.86A

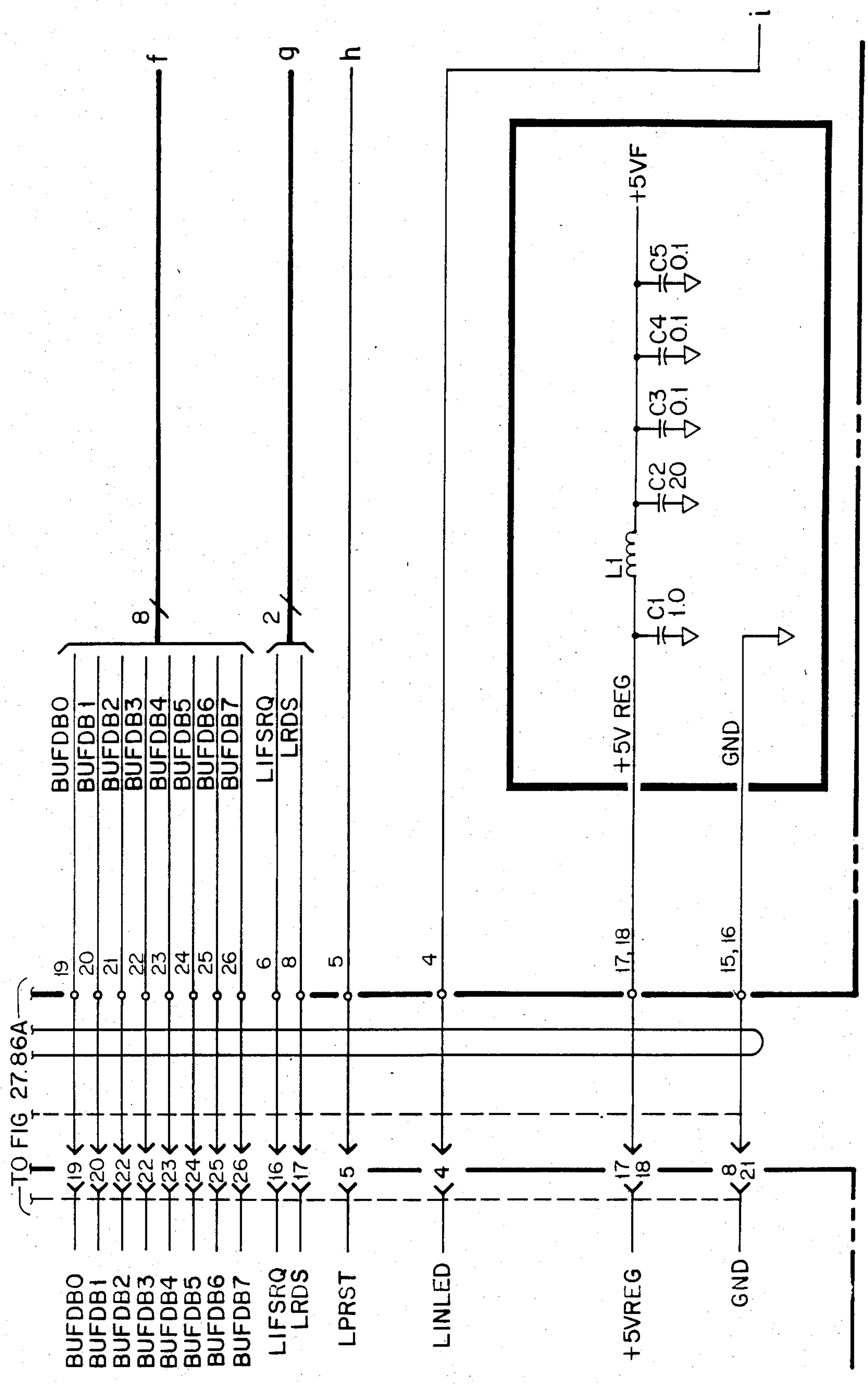
FIG 27.86B

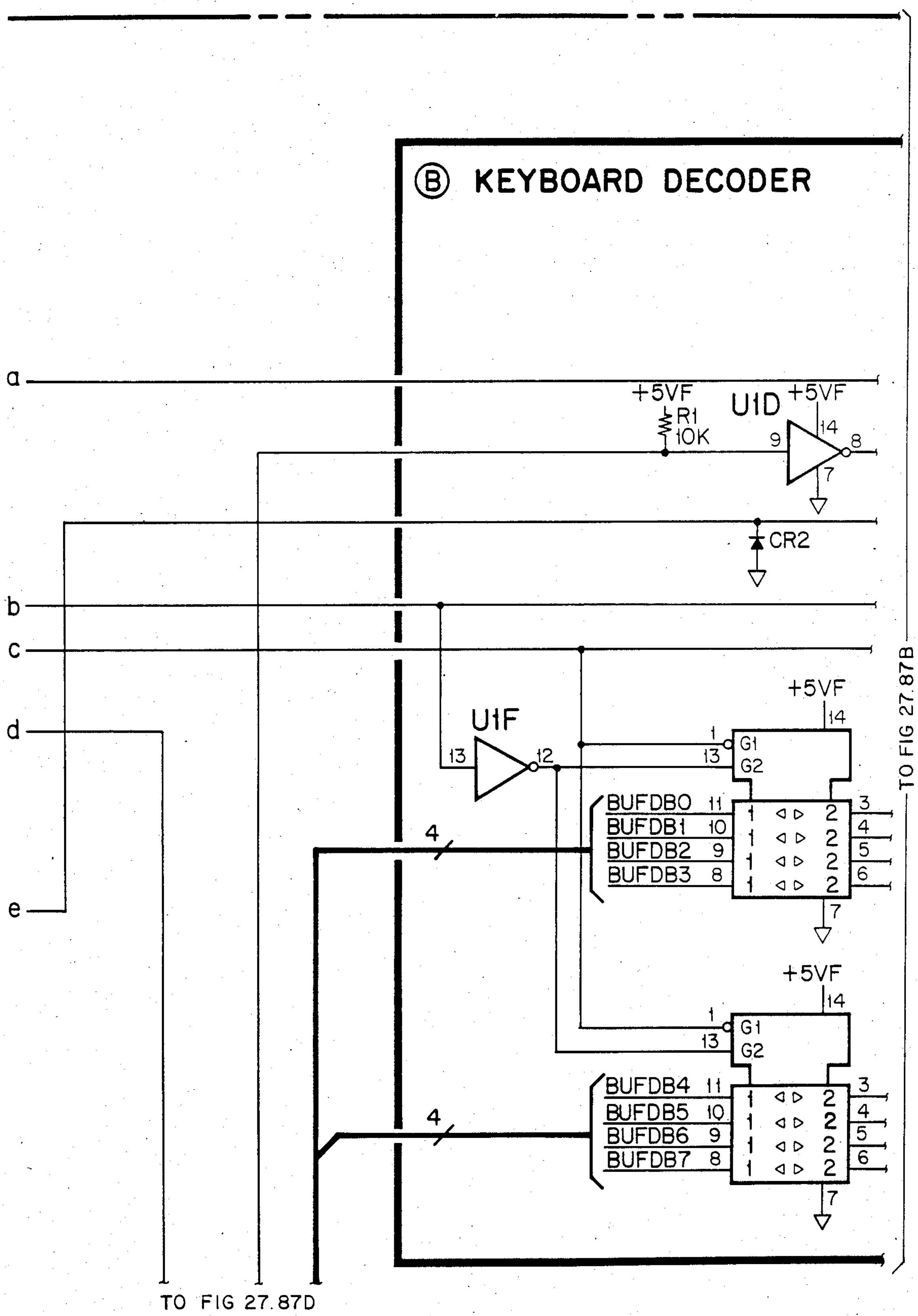
FIG 27.87A

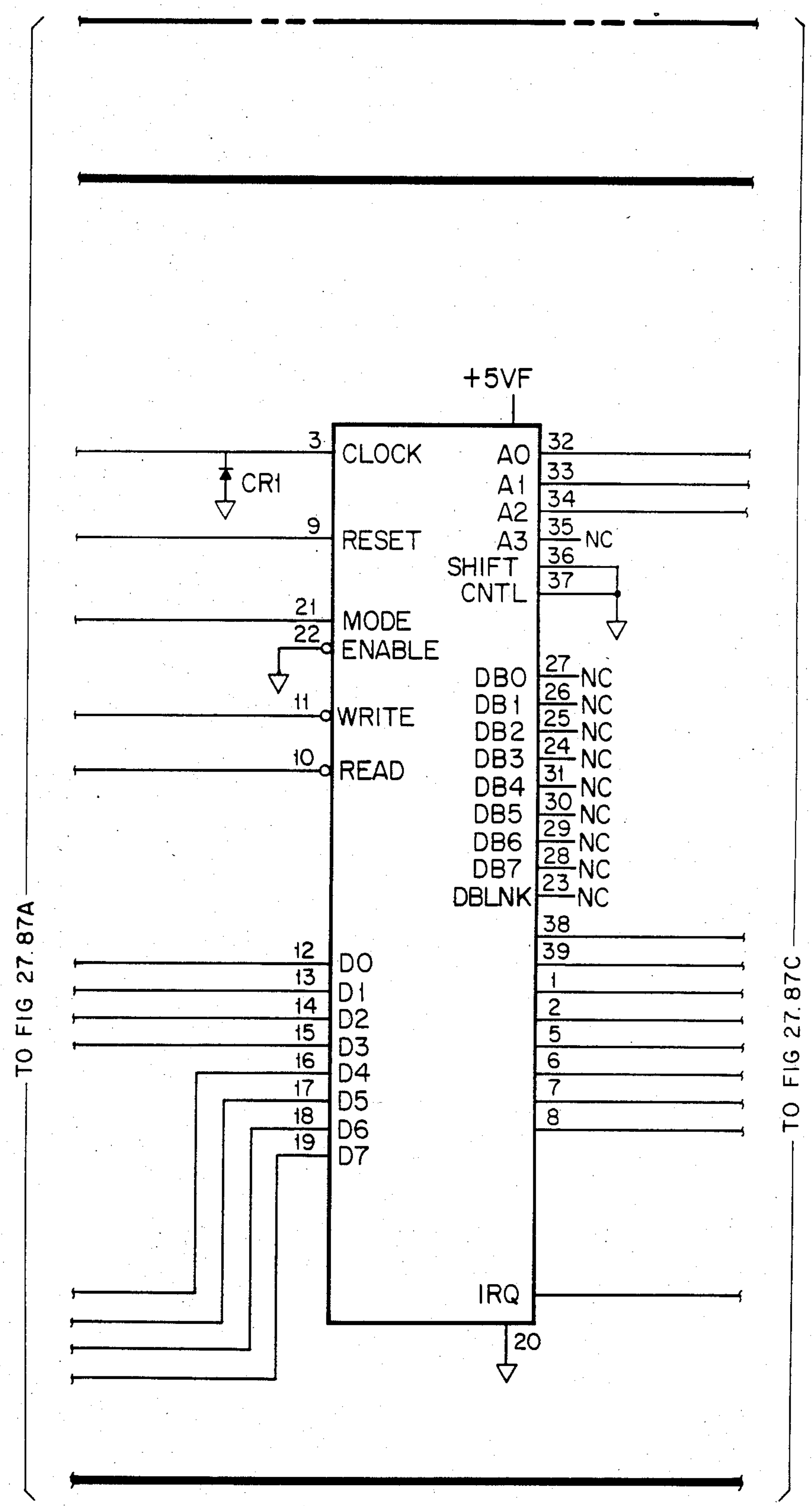
FIG 27.87B

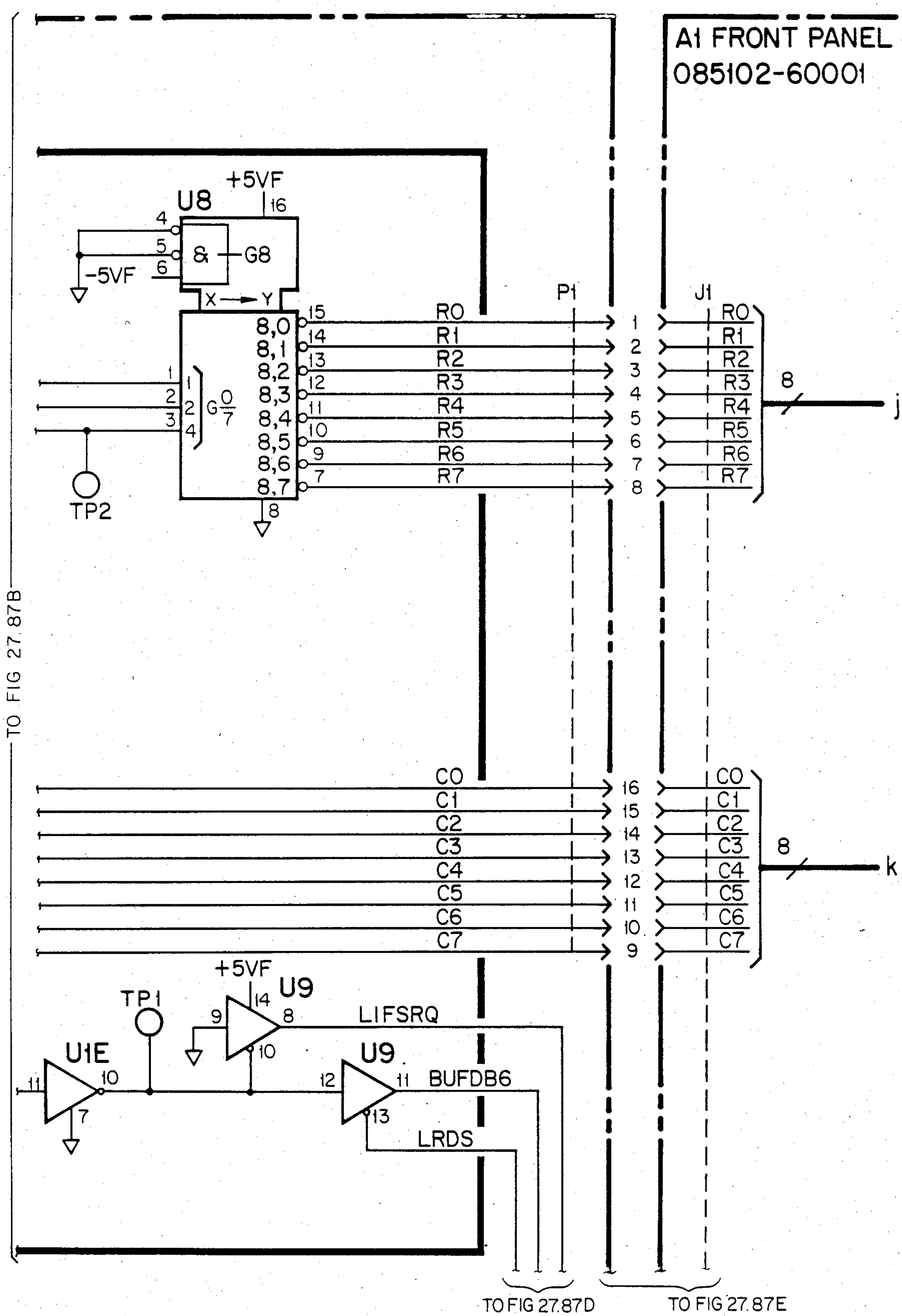
FIG 27.87C

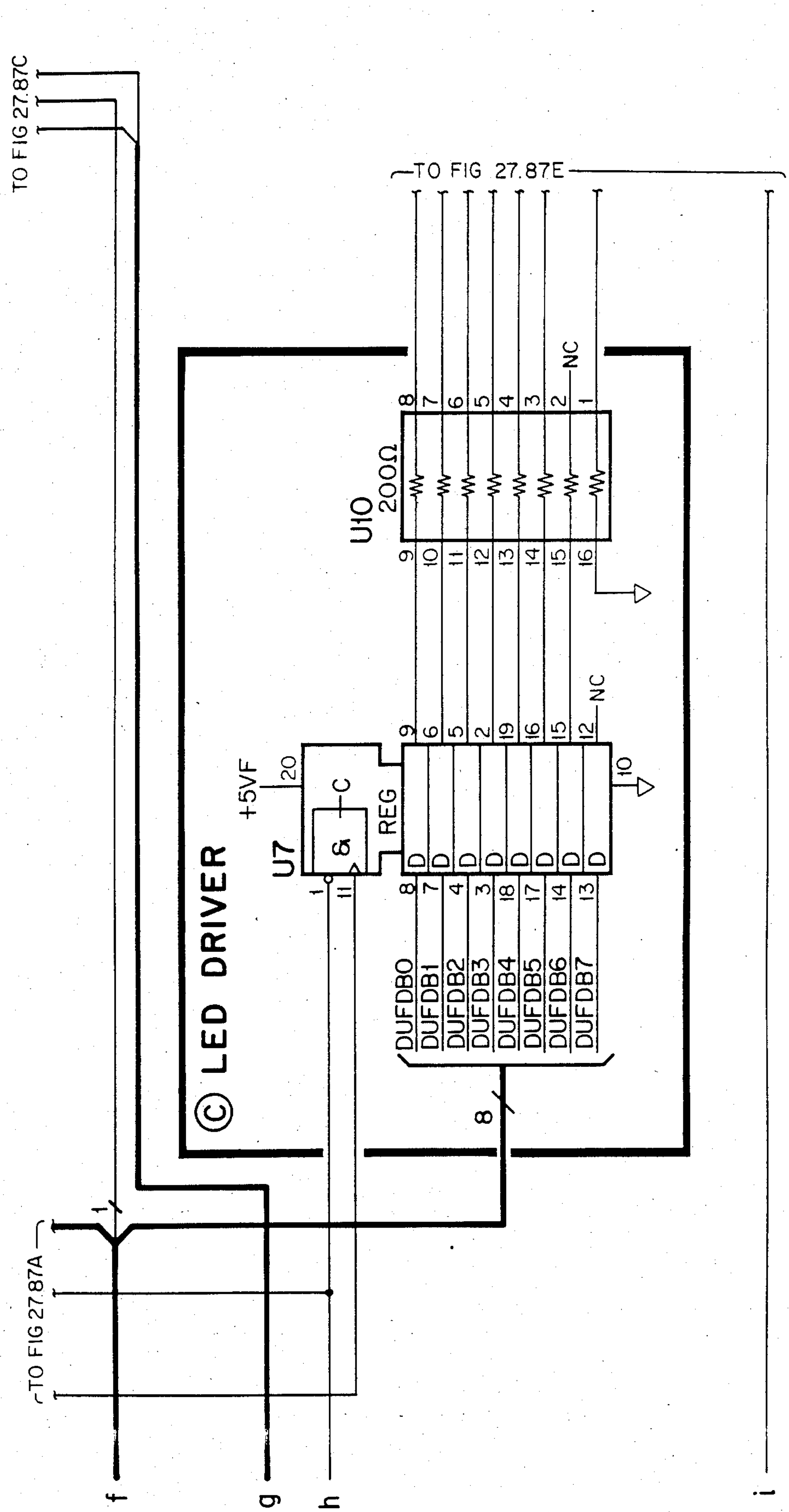
FIG 27.87D

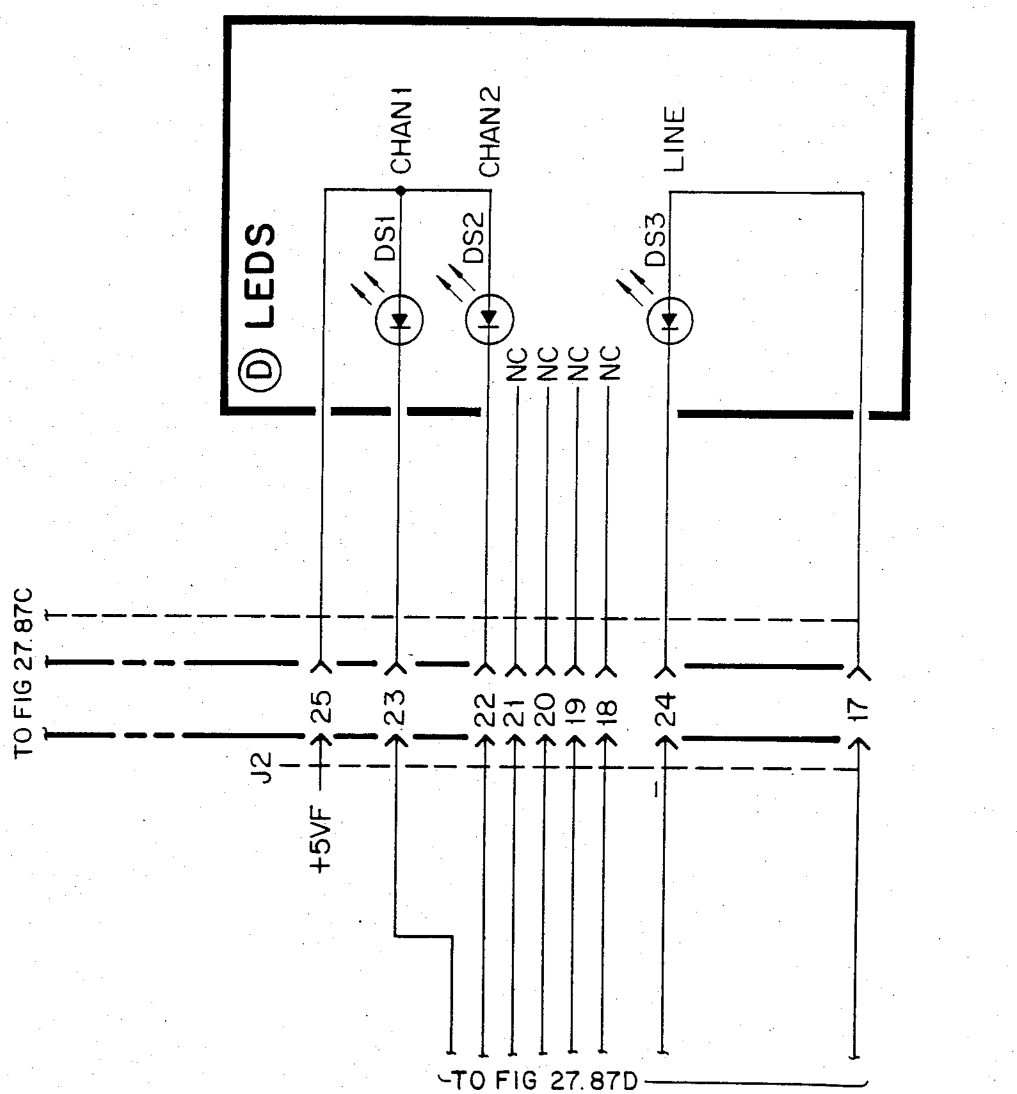
FIG 27.87E

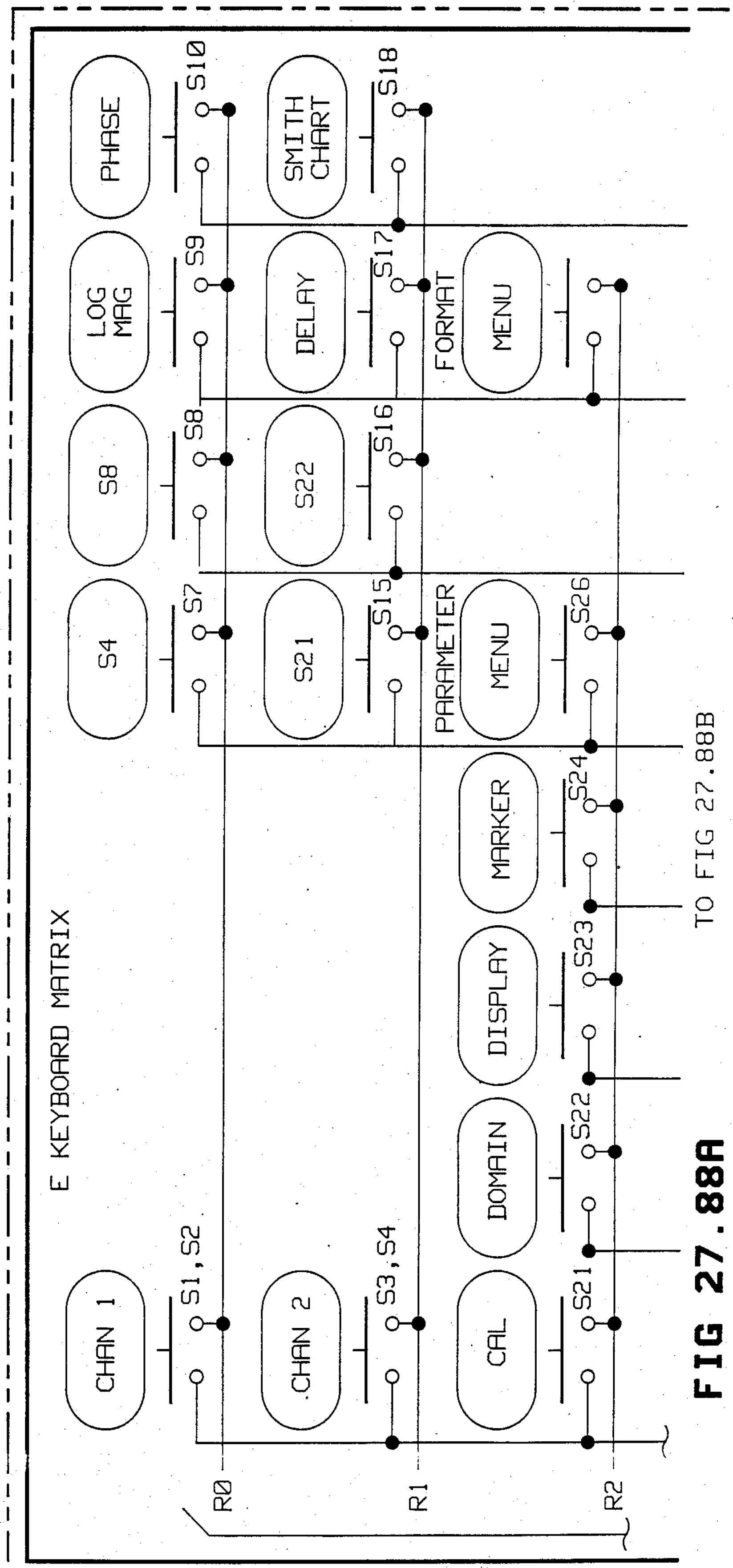
FIG 27.88A

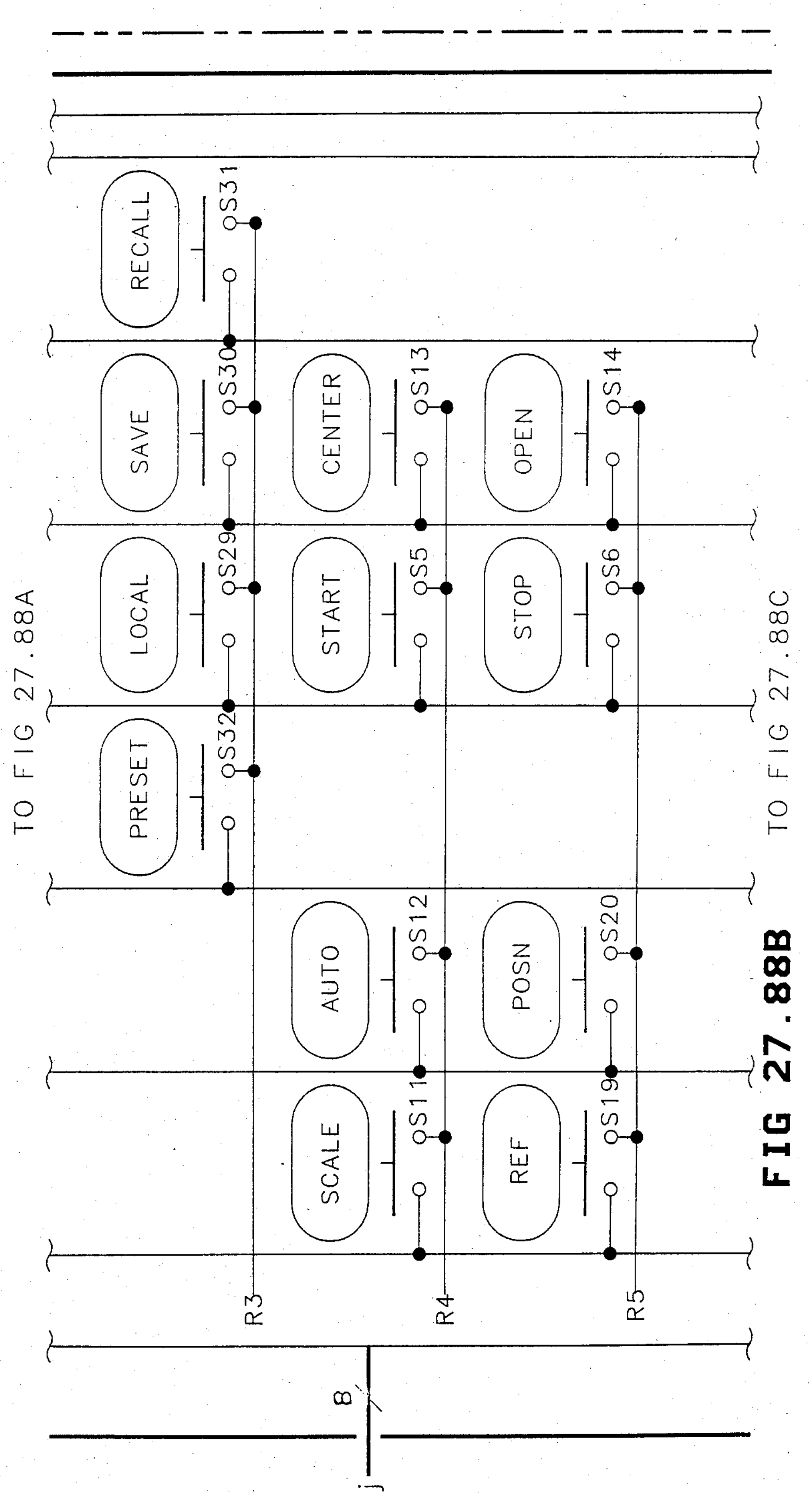
FIG 27.88B

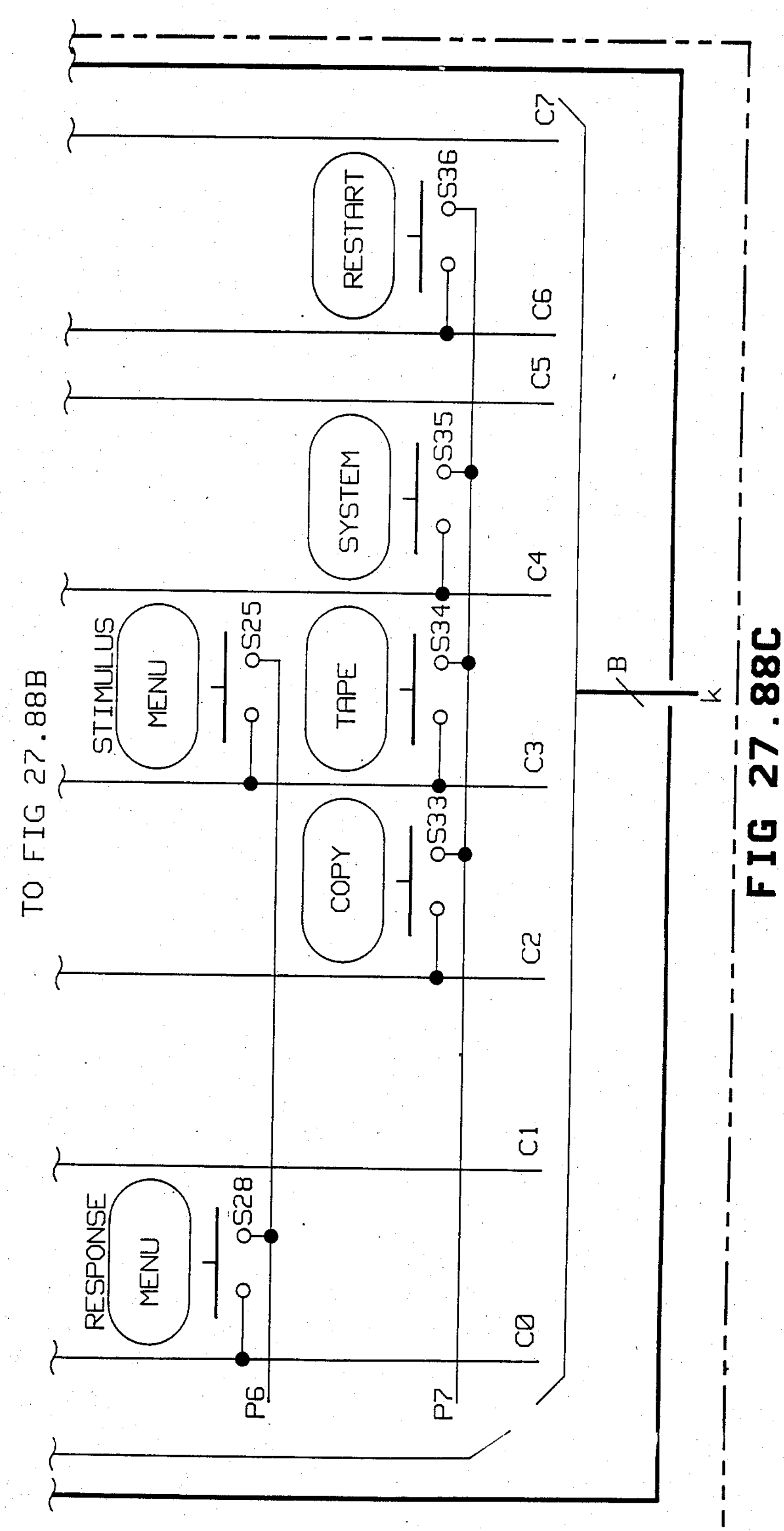
FIG 27.88C

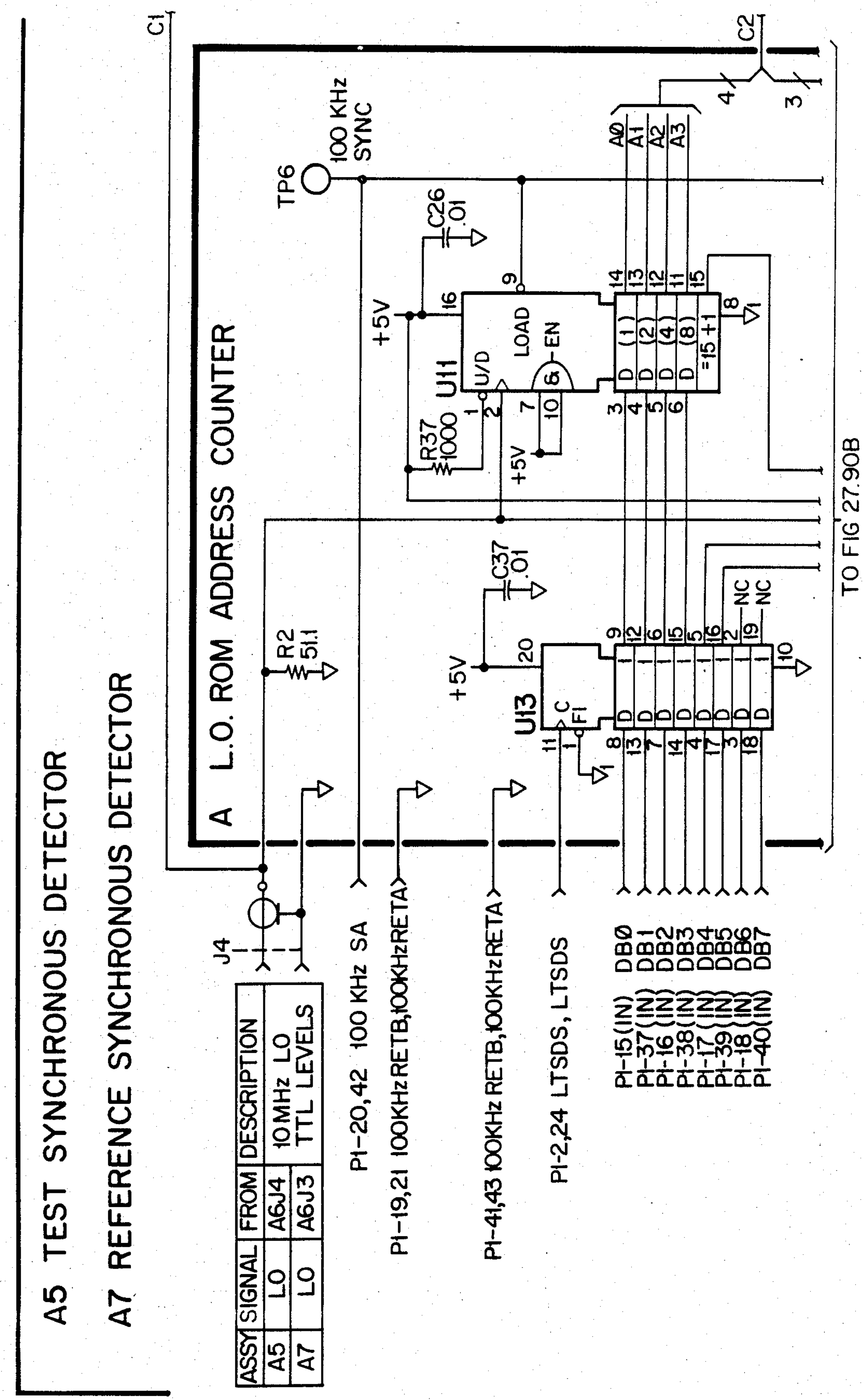
FIG 27.90A

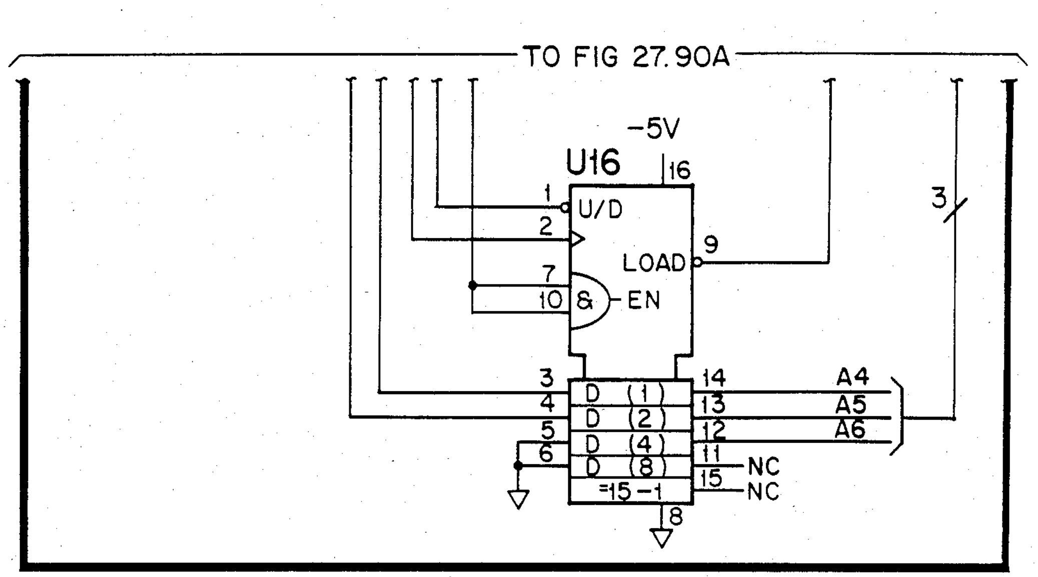
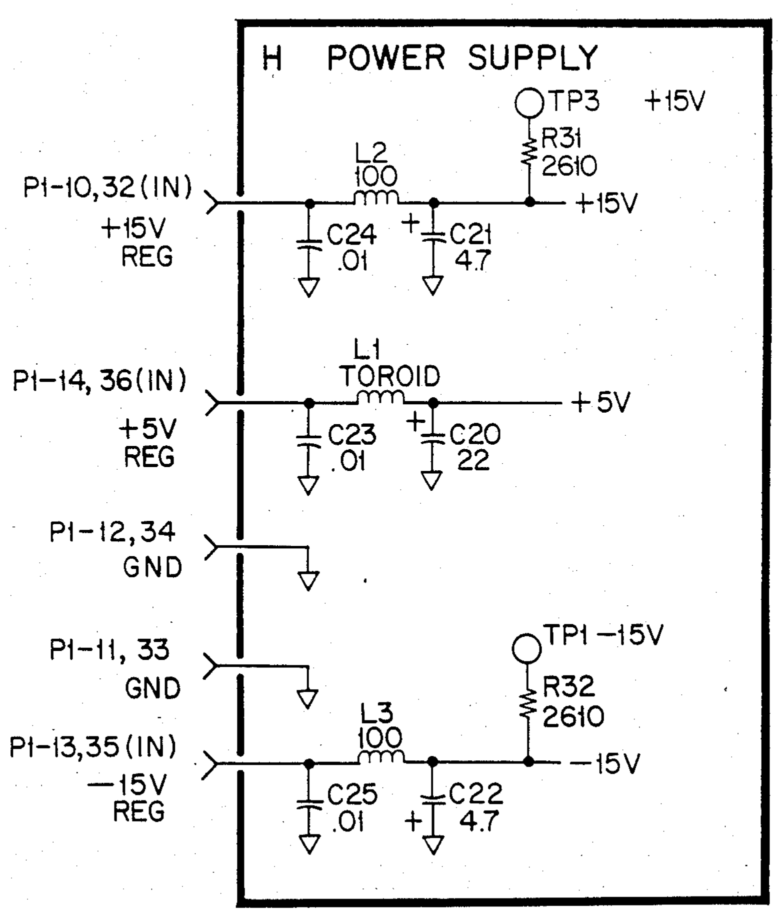
FIG 27.90B

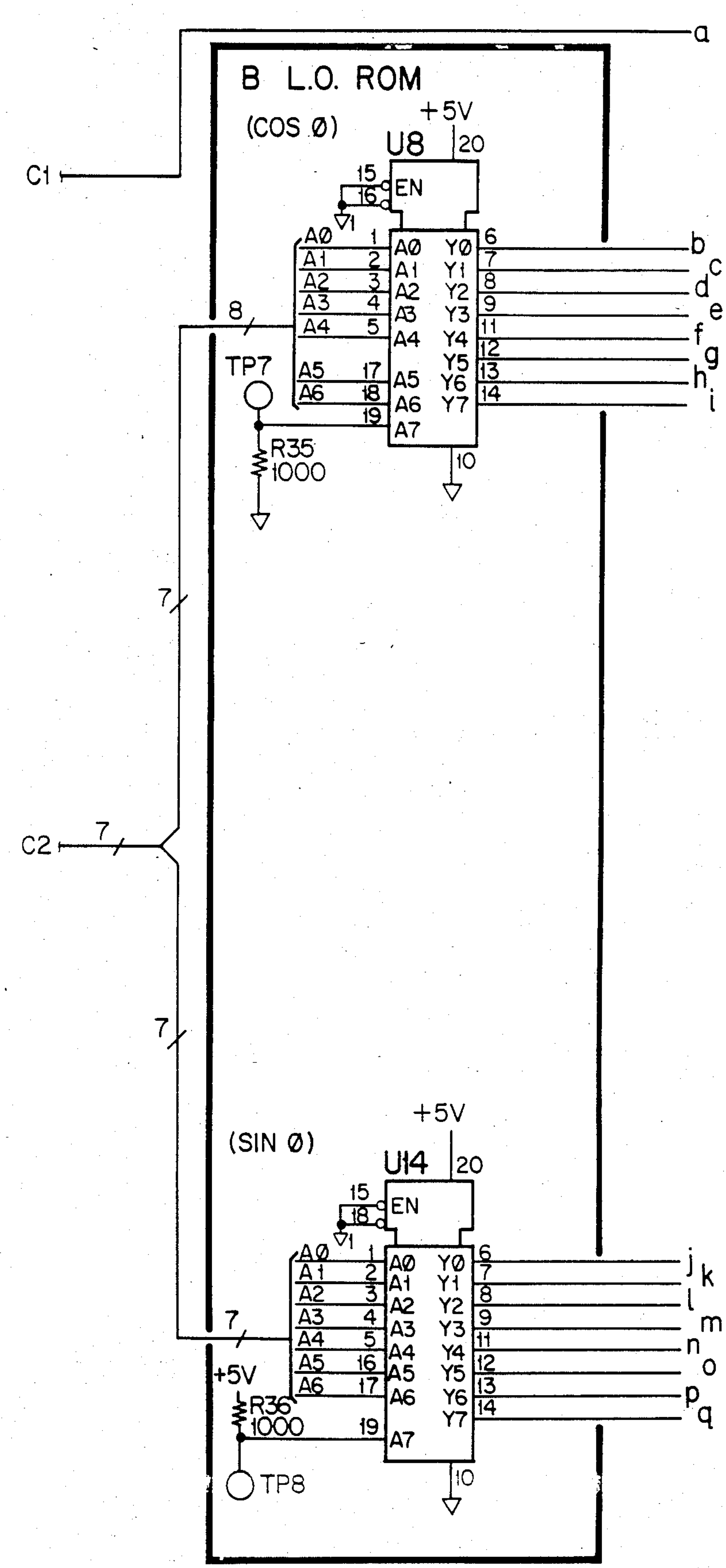
FIG 27.90C

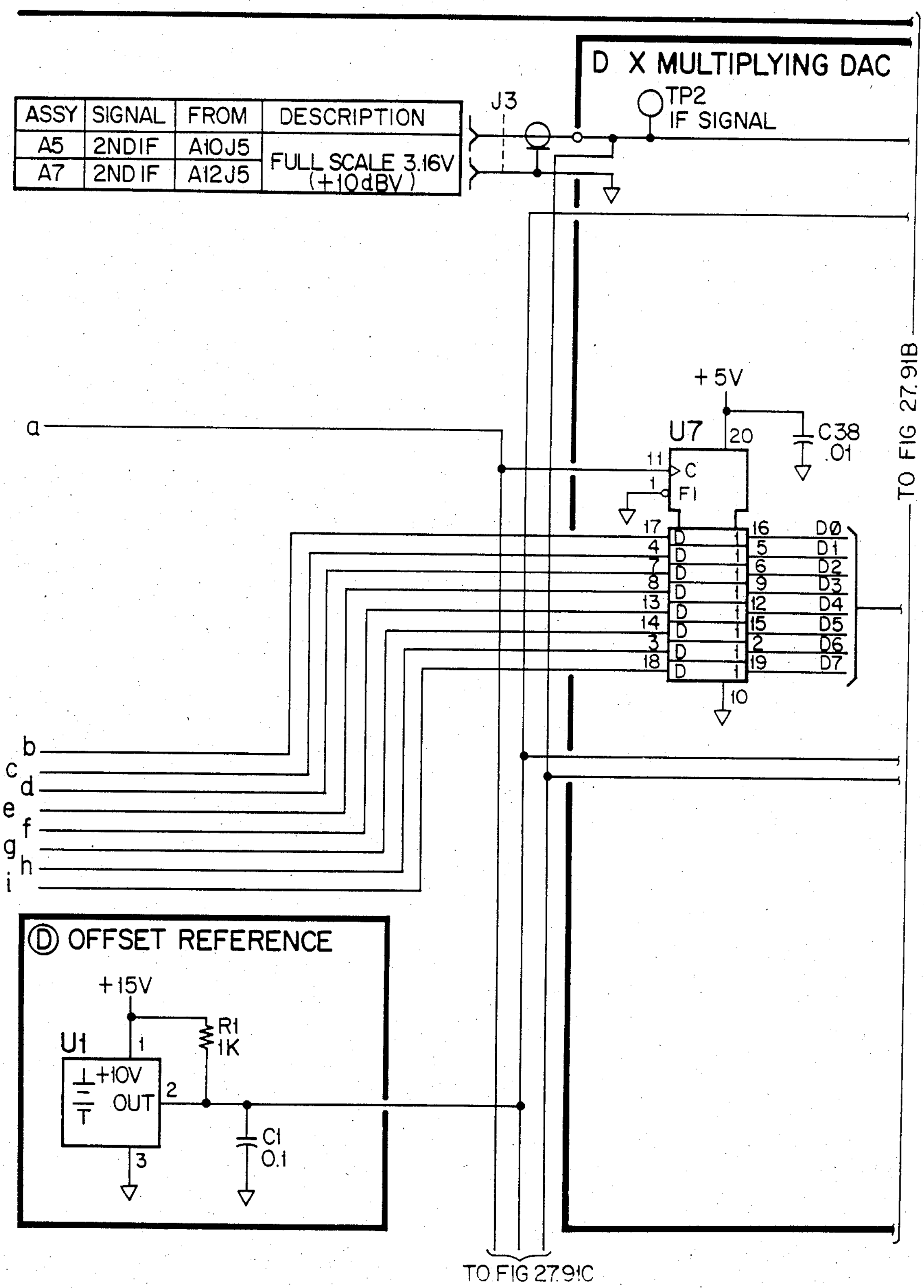
FIG 27.91A

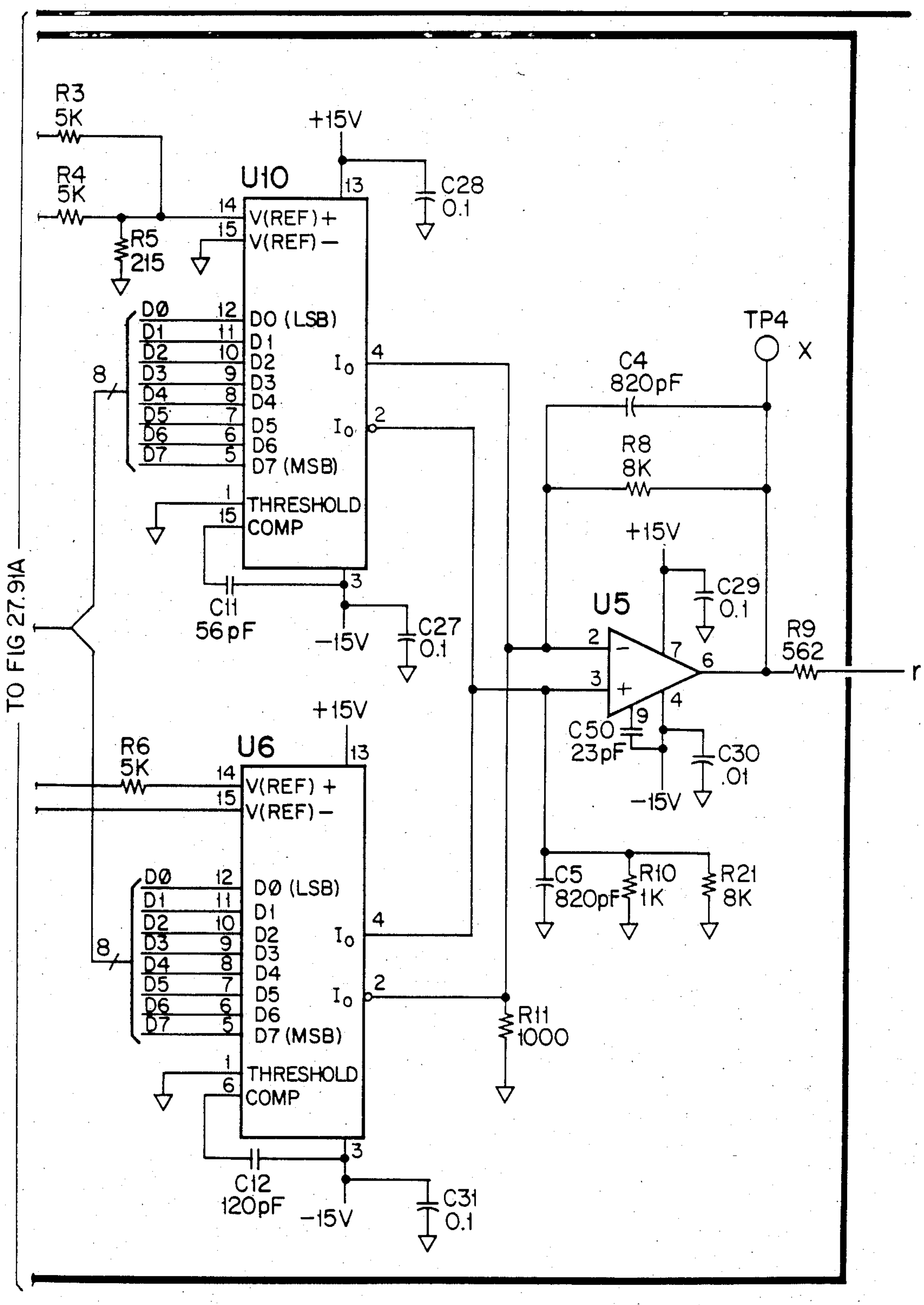
FIG 27.91B

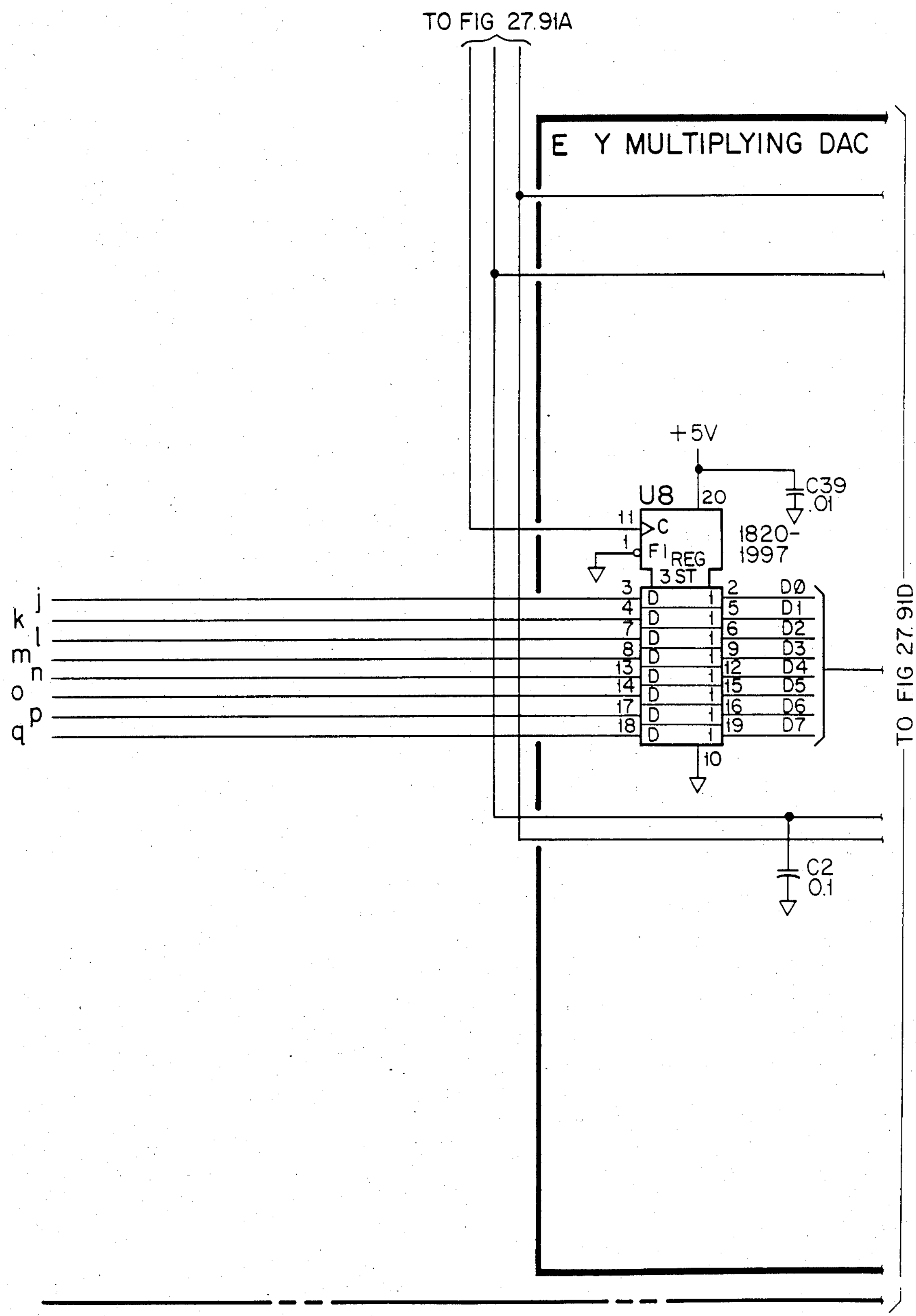
FIG 27.91C

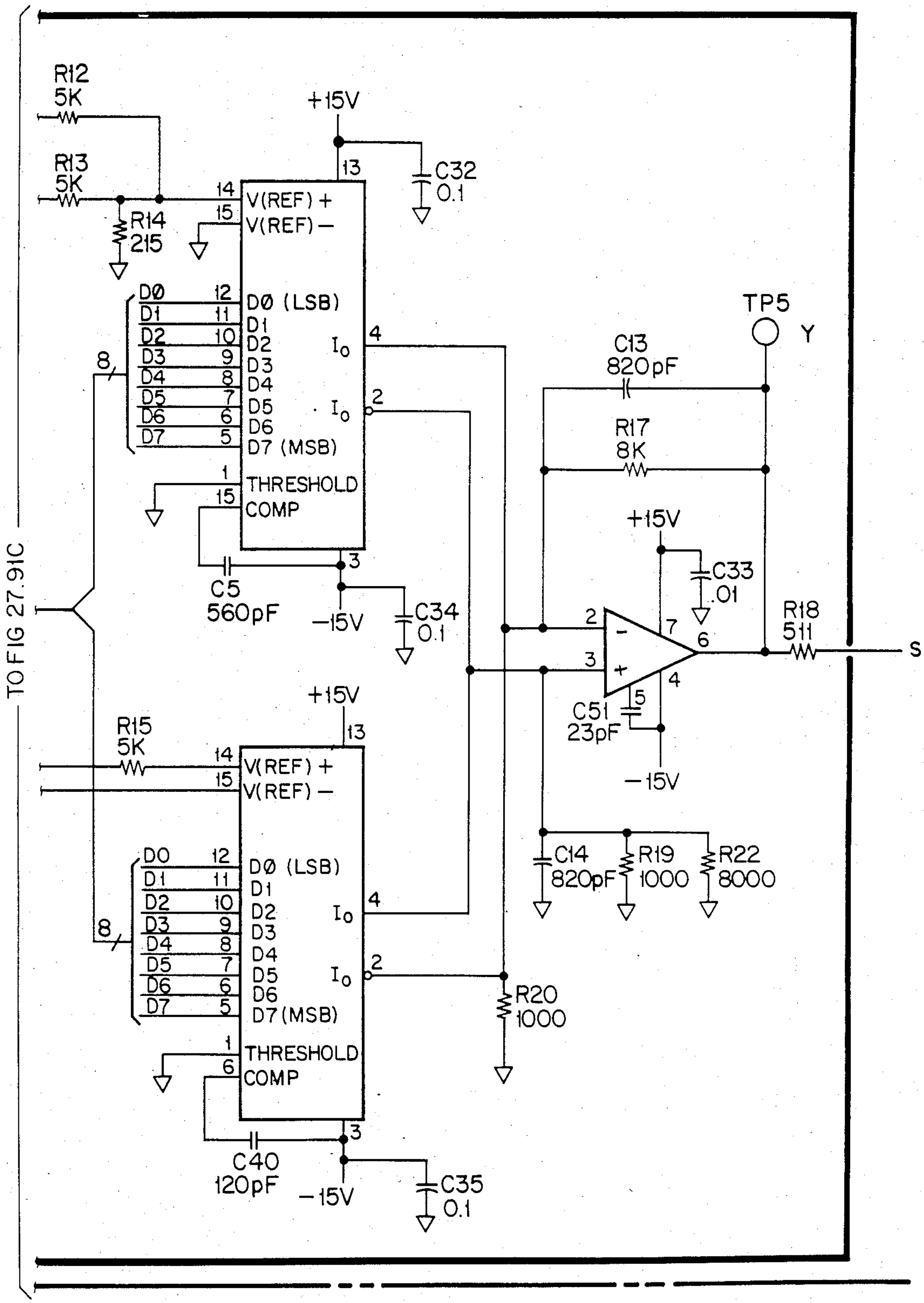
FIG 27.91D

FIG 27.92
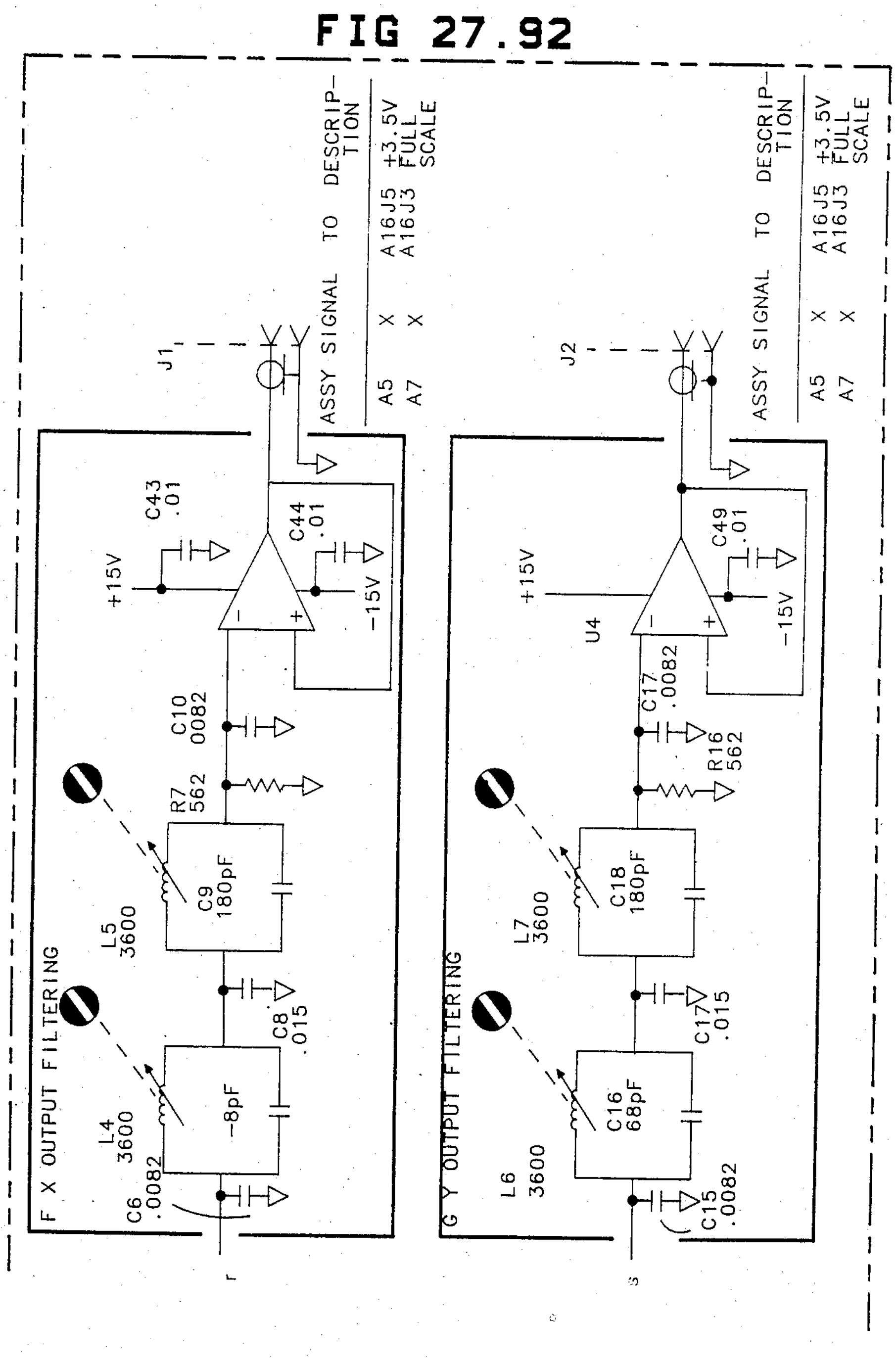

VECTOR NETWORK ANALYZER WITH INTEGRAL PROCESSOR

BACKGROUND OF THE INVENTION

Formerly, most magnitude and phase vector measurements at microwave frequencies have been performed by network analyzers using techniques such as those described in "Automatic Network Analyzer 8542A, Section IV Network Analyzer Fundamentals", Hewlett-Packard Co. 1969 and in U.S. Pat. No. 4,244,024 issued Jan. 6, 1981 by Marzalek et al. Such vector network analyzers characterize networks, including devices, components, and systems by measuring the magnitude and phase of the network's transmission and reflection coefficients versus frequency. The capability to measure group delay, a special form of transmission and also usable in reflection, is also often incorporated in a vector network analyzer.

In general, a vector network analysis measurement system contains several separate modules. First is an RF source to provide the stimulus to the device under test (DUT). The stimulus normally covers a limited range of frequencies, either in a continuous analog sweep, referred to as the swept mode, in discrete steps, referred to as the step mode, or a single point mode. Second is a signal separation network to route the stimulus to the DUT and provide a means for sampling the energy that is reflected from, or transmitted through, the DUT. Also, energy is sampled from the signal that is incident upon the DUT in order to provide a reference for all relative measurements. Third is a tuned receiver to convert the resulting signals to an intermediate frequency (IF) for further processing. The magnitude and phase relationships of the original signals must be maintained through the frequency conversion to IF to provide usable measurements. Fourth is a detector to detect the magnitude and phase characteristics of the IF signals, and fifth is a display on which to present the measurement results.

To improve measurement accuracy, a set of "standard" devices with known characteristics can be measured by a computer controlled system. From this data, a set of complex equations can be solved to determine a model representing many of the errors associated with the network analyzer process. This model is then stored in the computer and later when unknown devices are measured, the model can be used to separate the actual data from the "raw" measured data to provide enhanced accuracy in the microwave measurement by a process known as vector error correction.

Accuracy enhancement is very important in microwave measurements because even with the best signal generating and separating devices manufactured to state of the art tolerances, relatively large errors still occur as compared to low frequency measurements. For example, without vector error correction, a typical vector measuring system will yield errors of 30 percent. If one is willing to forego either the phase or impedance measurement of the unknown device, a modern scalar network analyzer is still only able to reduce the errors to 10 percent. On the other hand with prior implementations of vector error correction, errors can be reduced to about one percent.

Unfortunately, several significant problems remain with prior "automatic" network analyzers: they are very slow in the error correction mode; the systems are often quite awkward to use; they are unable to automatically perform a fully error-corrected measurement of forward and reverse reflection and transmission parameters (e.g., $S_{11}$, $S_{12}$, $S_{21}$, and $S_{22}$); and, broadband vector testing from RF to millimeter bands (e.g., 45 MHz to 26.5 GHz) cannot be performed with high accuracy and resolution without multiple manual reconnections.

Finally, in prior systems the data is usually displayed and analyzed only in the frequency domain, requiring either the use of a separate instrument such as a time domain reflectometer (TDR) in order to directly measure the response of the DUT as a function of time, or a powerful external computer coupled to the network analyzer to take data in the frequency domain and then perform an inverse Fourier conversion using either a truncated Fourier series or the faster Cooley-Tukey algorithm or others. Although the traditional TDR approach is fairly fast, the signal to noise ratio is low and the method is susceptible to both jitter and baseline drift. Conversely, although former computer coupled network analyzers exhibit significant improvements over the TDR method in signal to noise ratio, jitter, and drift, these systems are very slow, requiring several minutes to provide a time domain analysis and display of a DUT.

SUMMARY OF THE INVENTION

The present invention overcomes many of the limitations of the prior art by permitting automatic, high speed, and accurate measurement of the device characteristics of a DUT across a broadband of microwave frequencies. A fully error corrected measurement of four vector transmission and reflection parameters is accomplished in "real time" with the ability to analyze and display over 400 frequency points in less than one second. This speed permits the operator for the first time to view the effects of adjustments on the network under test while performing measurements with high precision. At the same time, measurement accuracies are achieved that are more than ten times as precise than have previously been attainable with commercially available instrumentation. In addition, vector testing using a single set up of a DUT can for the first time be performed across a broadband frequency range from RF to millimeter bands. Although many factors affect overall measurement accuracy, including operator technique, dynamic accuracies of 0.05 dB in magnitude of 0.3 degrees in phase can be accomplished for a device with 50 dB of insertion loss. An overall dynamic range of 100 dB, resolutions of 0.001 dB in magnitude, 0.01 degrees in phase, and 10 picoseconds in group delay, and corresponding measurement stabilities are attained depending on the particular frequency range and test set used. Further, error corrected data can be transformed between the frequency and time domains in real time without sacrificing accuracy or resolution, and can be displayed on a single cathode ray tube (CRT), plotter or other display either in the frequency domain, the time domain, or in both domains at the same time.

The time domain Fourier transforms in the present invention permit the operator to see the response of the DUT as a function of time from the application of the stimulus. While the frequency domain response of the DUT is the integrated response over the test frequency range, the time domain response presents the individual responses as a function of distance, permitting identification of specific discontinuities within the DUT and/or the test set. Responses can then be isolated within settable "gates", making it possible to virtually ignore responses outside of the gates. A response within the gate can then be transformed back into the frequency domain if so desired. It thus is possible to "gate out" measurement system responses from cables, connectors, and fixtures to measure the DUT alone. In addition, time domain data are computed at speeds similar to those of frequency domain measurements, providing the same "real time" capability, flexibility, and convenience. Also, since the time domain data are computed from the error corrected S-parameter measurements, the result is that both time and frequency data have similar accuracies.

Major elements of the present invention are the main analyzer containing the IF, signal processing, internal computing, and display circuitry, plus the operating panel used to select functions and control the entire measurement system; an RF test set and microwave to IF frequency conversion unit; and a source for test signals, such as a synthesized or swept oscillator with the desired frequency coverage. A dedicated interface between the main analyzer and the source is provided to facilitate the necessary control functions and data exchanges (handshakes) so that all source controls and monitoring can be performed from the main analyzer. Several test sets which incorporate broadband signal separation devices, balanced broadband power splitters, and high conversion efficiency samplers with flat frequency response and low crosstalk, are provided for optimized performance for different frequency ranges and connector types. A dedicated interface provides control from the main analyzer.

The main analyzer is a microprocessor based instrument that performs the signal processing and all computation associated with error correction, data formatting, and transformations. A variety of display modes are provided including log and linear magnitude versus either frequency or time, linear phase, deviation from linear phase, group delay versus frequency, standard Smith Chart, compressed Smith Chart, expanded Smith Chart, inverted Smith Charts, and "Bull's Eye" polar chart. A variety of marker read out formats are also provided. Examples of the display flexibility provided include a split screen CRT with two independent formats or two responses overlaid on a common format. In addition, any or all of the CRT displays can be directly transferred to a digital printer or plotter without need of an external computer.

The main analyzer's control panel uses a number of buttons arranged in a unique hierarchal structure to specify the complete measurement process. Several control buttons are dedicated for functions most commonly used in typical measurement applications, while less common functions are available through a series of logical menus which are accessed via several "softkeys" under control of internal firmware. Altogether, over 70 menus with over 320 functions can be reached by means of the softkeys to provide a wide range of microwave network measurements.

FIGS. **19*a* and 19*b*** show a schematic and a cross sectional view respectively of a wideband RF directional bridge for use in a preferred embodiment of the present invention.

FIGS. 20 through 23 show detailed block diagrams of four test sets as shown in FIG. 1.

FIGS. 24.1A through 24.33 show detailed schematics for the block diagrams shown in FIGS. 20 through 23.

FIGS. 25.1A through 25.6 show a detailed block diagram a section of the present invention as shown in FIG. 1.

FIGS. 26.1 through 26.6 show a block diagram and the related equations used for adjusting offset and gain errors in the IF section of the present invention.

Figure 27:
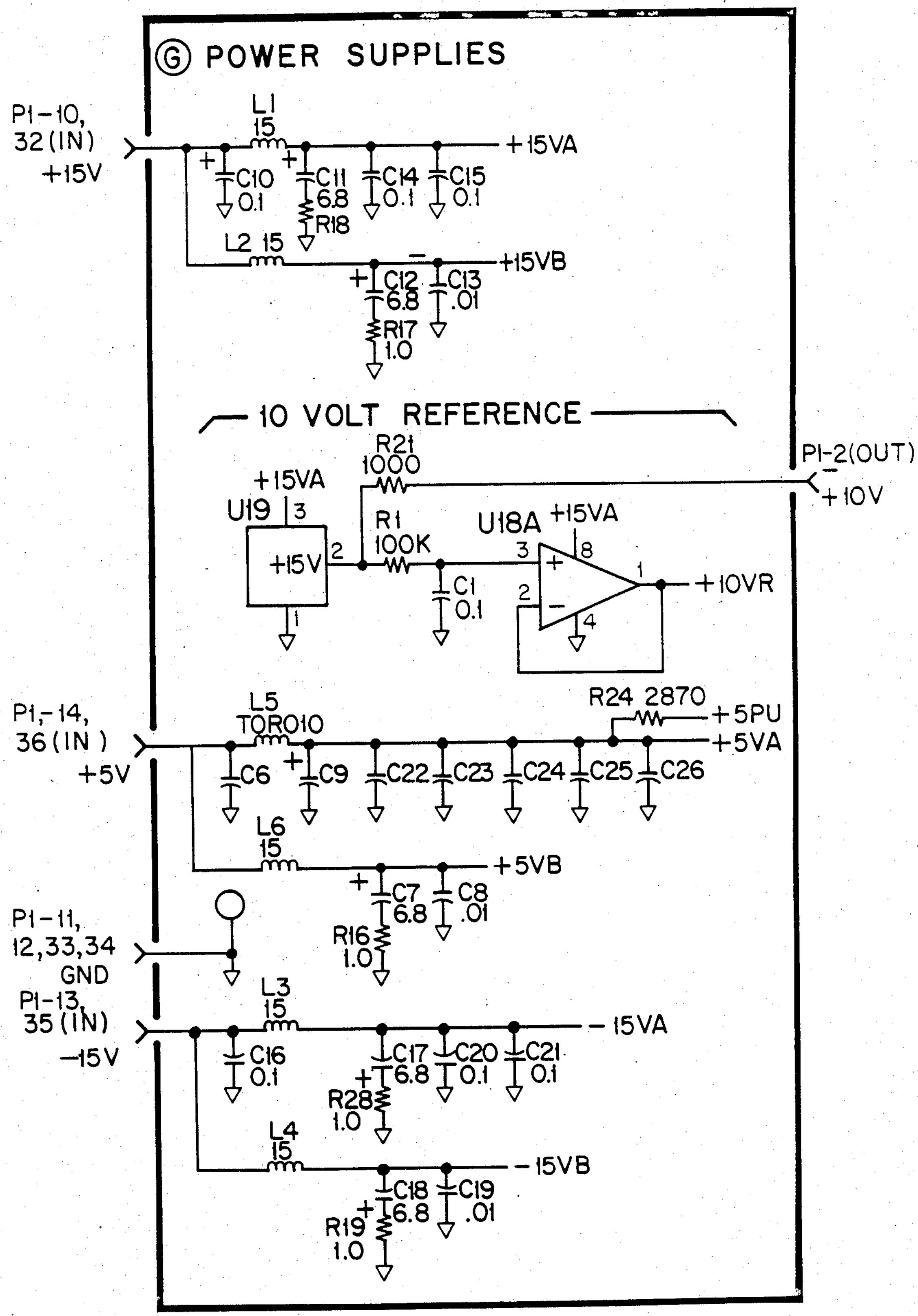
Figure 27:
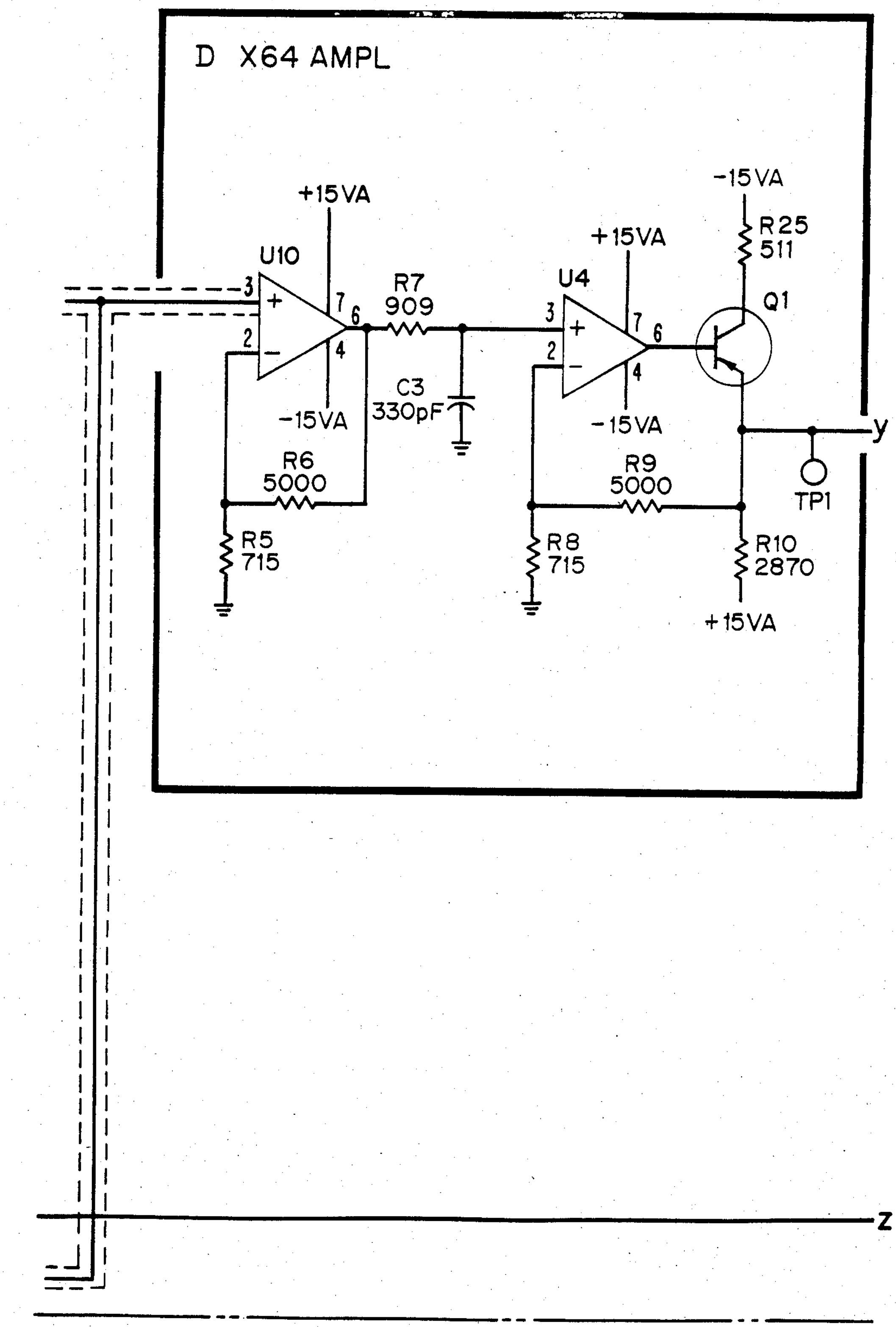

FIGS. 27.1A through 27.58B and 27.60A through 27.93 show the detailed schematics for FIGS. 25.1 through 25.6.

Figure 28:
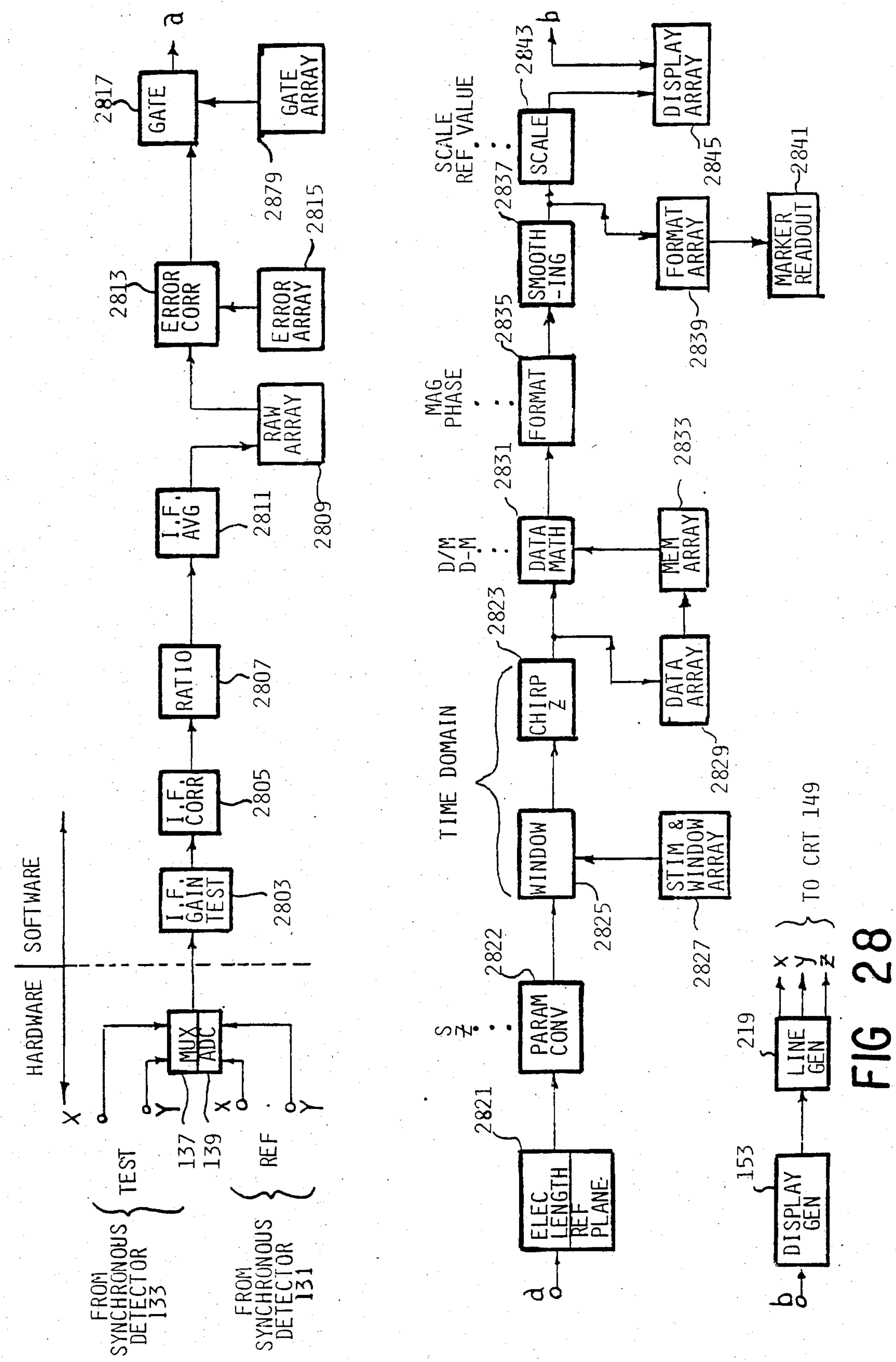

FIG. 28 shows the software signal processing flow used in the present invention.

Figure 29:
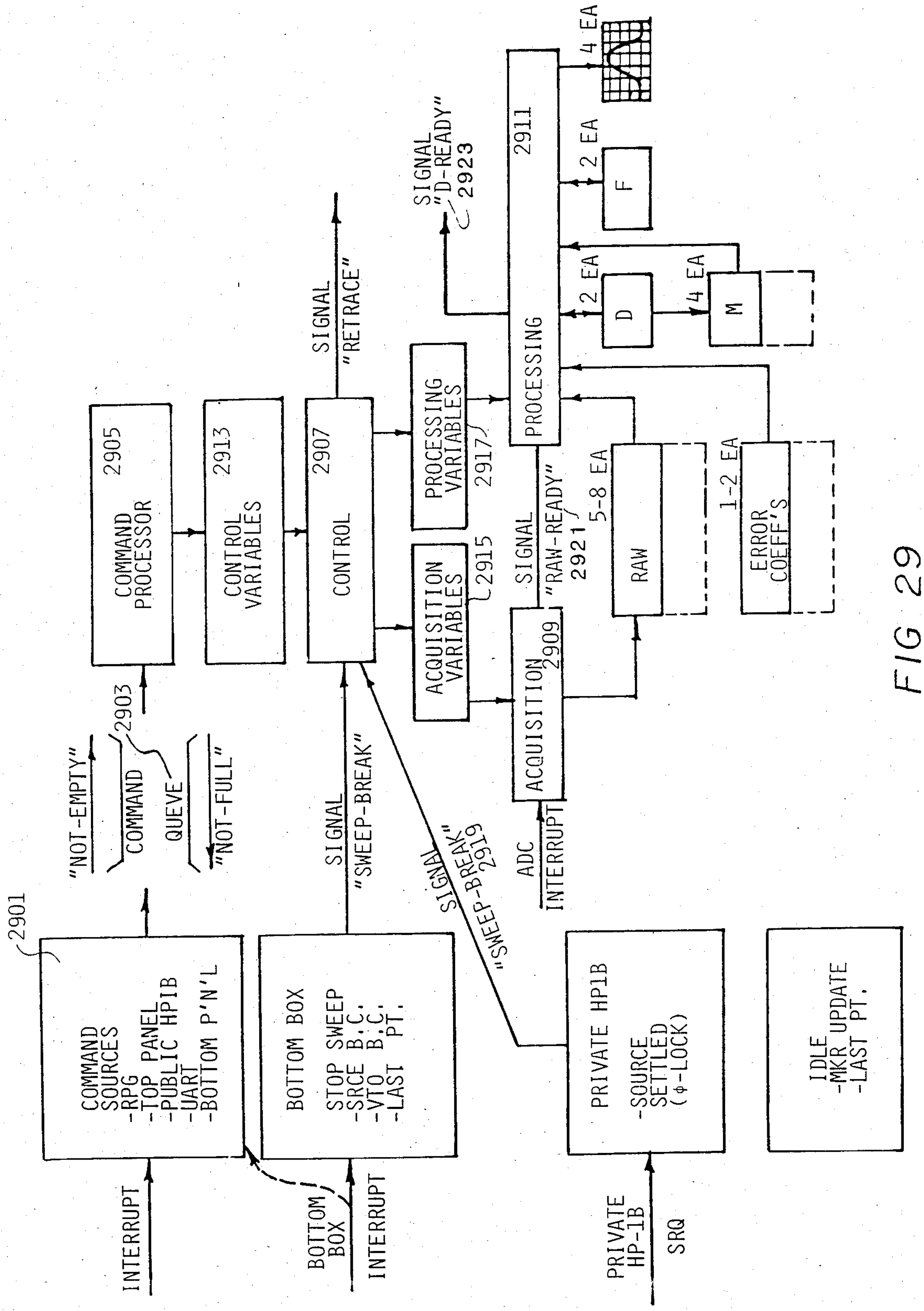

FIG. 29 shows the software process controller for use in the preferred embodiment of the present invention.

FIGS. **30*a* through 30*e*** show the time domain modes used in the present invention.

FIGS. **31*a* through 31*d*** show the effect of windowing on time domain data.

FIGS. **32*a* and 32*b*** show a time domain response without and with vector error correction.

FIGS. **33*a* through 33*d*** show the effect of gating on time domain data in the present invention.

DETAILED DESCRIPTION OF THE INVENTION

DESCRIPTION OF THE BLOCK DIAGRAM

Figure 1A:
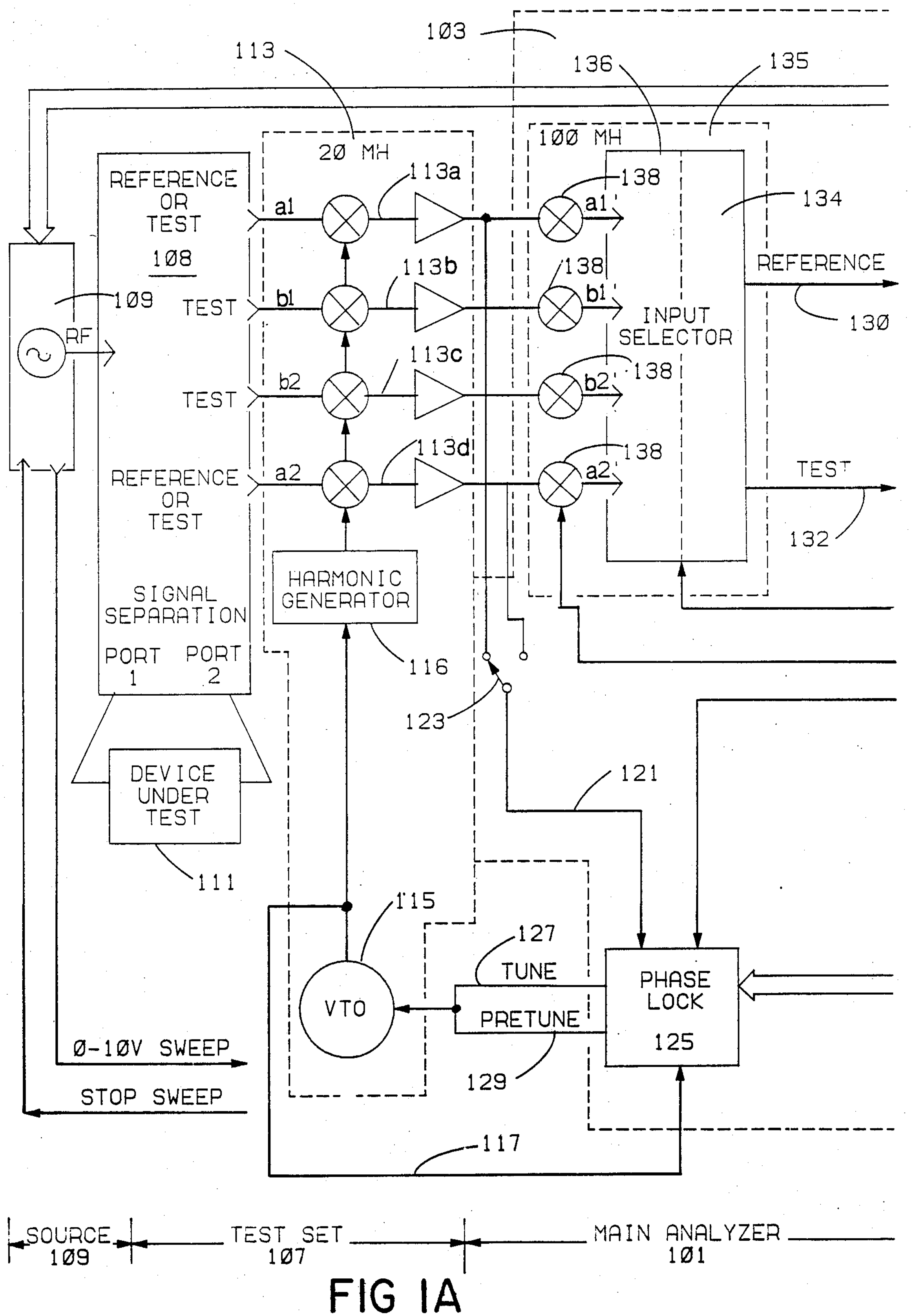
FIGS. 1A and 1B show a simplified block diagram of the preferred embodiment of the present invention.
Figure 1B:
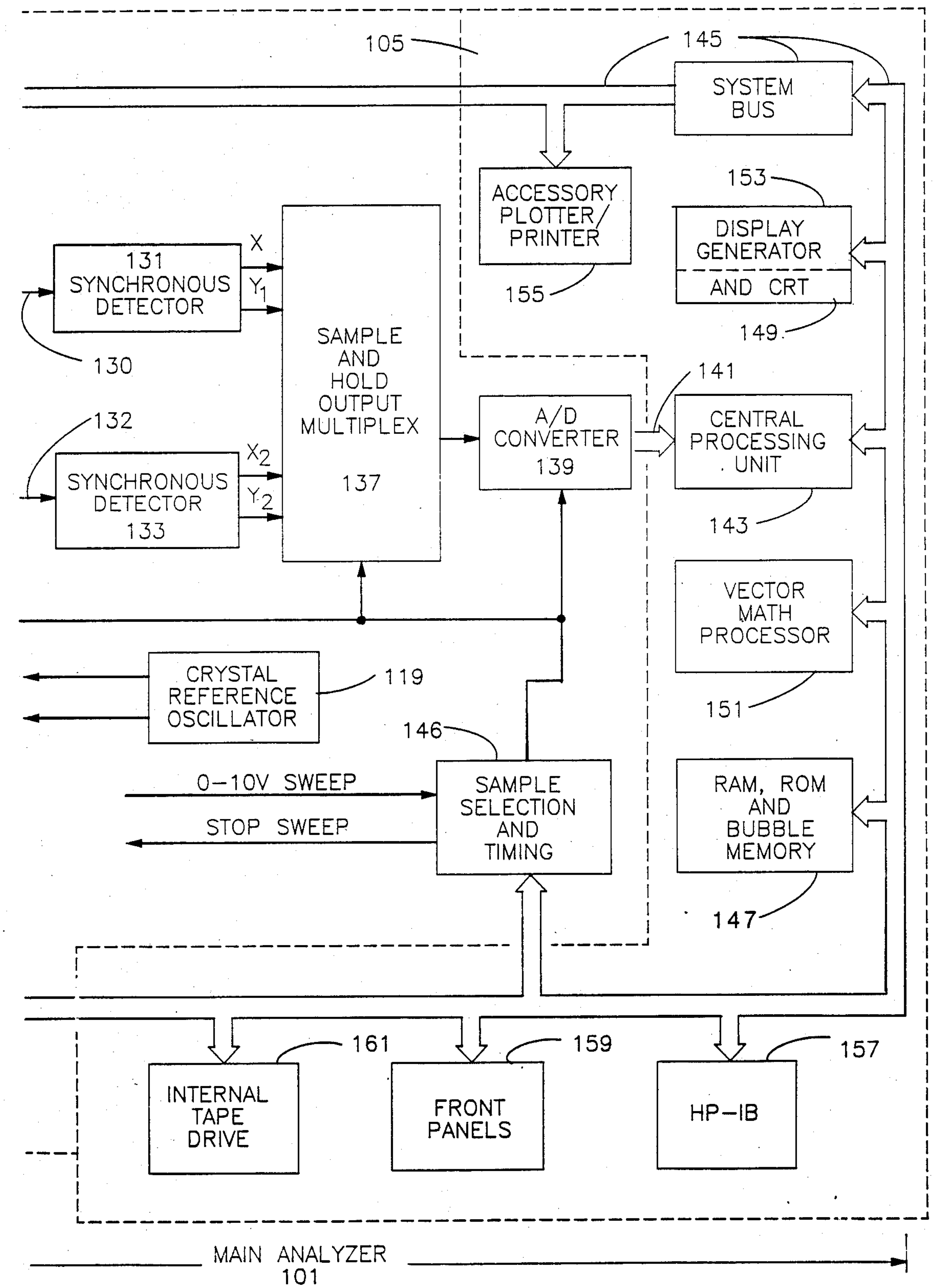

Referring to FIGS. 1A and 1B, there is shown a block diagram of the preferred embodiment. The measurement system consists first of a main network analyzer 101 with a second IF/detector section 103 and a data processor/display section 105. The main network analyzer 101 is fed by one of four configured test sets 107 which provide the signal separation circuitry 108 and first IF frequency conversion circuitry 113 for reflection/transmission (one incident signal) or S-parameter (two incident signals) measurements up to either 18 or 26.5 GHz. The frequency converter 113 alone is also available to permit the addition of user supplied signal separation devices 108 for specially configured test needs. The third main component of the measurement system is a compatible RF source 109 such as an HP 8340A synthesized sweeper, available from the Hewlett-Packard Co., Palo Alto, Calif., which can be used in either a stepped frequency mode, in which synthesizer class frequency accuracy and repeatability can be obtained by phase locking the source 109 at each of the over 400 frequency steps over the frequency range selected by the main analyzer 101 or the swept frequency mode for applications where extreme frequency range, high stability, and spectral purity are important such as in narrow band measurements over sweeps of less than 5 MHz. An HP 8350B sweeper with HP 83500 series RF plug-ins covering the entire desired frequency range or with lesser spans can also be used in applications where a more economical source is sufficient. Both the HP 8340A and the HP 8350B include the necessary analog interface signals as well as full digital handshake compatibility with the main analyzer 101. This digital handshake compatibility allows the main analyzer 101 to act as the controller for the entire system by directly managing the source 109 to provide all of the inputs such as start frequency, stop frequency, centering, span, and modulation, as well as constraints that the source 109 normally places on itself internally. For example, if a user by means of the main analyzer 101 requests the source 109 to sweep to an incompatible frequency such as 50 GHz, the source 109 will respond to the main analyzer 101 that such a frequency cannot be accommodated and the main analyzer 101 in turn informs the user of the situation. Therefore, the user need only be concerned with his interface to the main analyzer 101 and can use any source 109 that has implemented the required handshake protocols. Because the main analyzer 101 is in control of the source 109, it is also possible to automatically select a different frequency range or mode (stepped or swept) to be applied to each of the ports 1 and 2.

Integrated within each test set 107 is the first IF frequency converter 113 with three channels 113*a*, 113*b*, and 113*c* for reflection/transmission measurements and four channels 113*a*, 113*b*, 113*c*, and 113*d* for S-parameter measurements. RF to IF conversion is achieved through a sampling technique equivalent to harmonic mixing. An harmonic of a tunable local oscillator 115 is produced by an harmonic generator 116 to mix with the incoming RF signal to provide the first IF signal at 20 MHz for the incident signal a1 on the input port 1, the incident signal a2 on the output port 2, the reflected or transmitted signal b1 on the input port 1, and the reflected or transmitted signal b2 on the output port 2. Frequency tuning for the local oscillator 115 is controlled by a phase lock loop 117 that compares the signal a1 or a2 in the reference channel first IF to an IF reference oscillator 119 in the IF/detector section 103. Any difference between the frequency of the signal a1 or a2 in the reference channel first IF and the IF reference oscillator 119 results in an error voltage on the error voltage signal line 121 via switch 123 that tunes the local oscillator 115 to the frequency that produces the desired first IF. Switch 123 is toggled to select the most appropriate signal a1 or a2 to lock on to based either on internal criteria within the system or as defined by the user. When using the internal criteria, if the incident signal port is port 1, a1 is selected by switch 123, and if the incident signal port is port 2, a2 is selected by switch 123. This scheme allows the local oscillator 115 to track the incoming RF when the RF frequency is changing with time as in the swept mode. The integrated test set 107 permits high RF to first IF conversion efficiency even at 26.5 GHz, making possible both high sensitivity and wide dynamic range measurements. The test set architecture eliminates the extensive RF switching needed in previous test sets, removing the significant uncertainties caused by the lack of repeatability of mechanical switches. The reflection/transmission test sets 107 require no internal switching since the fourth channel 113*d* is not required, and the S-parameter test sets 107 use only one electronic PIN diode switch located inside of the test set 108 such that it cannot contribute to uncertainties as it is switched prior to the ratio node of the power splitter.

Several new concepts have been incorporated in the IF/detector section 103 of the main analyzer 101 to increase the precision of IF processing and signal detection. Most of the phase lock hardware 125 in the phase lock loop resides in this section 103. Harmonic mixing number and local oscillator pretuning are controlled digitally via lines 127 and 129 and offer phase lock and tracking performance that is precisely repeatable from sweep to sweep. Before the first IF signals proportional to a1, a2, b1, and b2 are sent to the synchronous detectors 131 and 133, they are down converted to a second IF at 100 KHz by mixers 138 and go through a pair of multiplexers 136 and variable gain amplifiers 134 in the second IF section 135. Amplifier gain is controlled and calibrated digitally and is varied by autoranging to optimize the second IF signal levels 130 and 132 available to the synchronous detectors 131 and 133 resulting in an order of magnitude improvement in signal to noise performance and dynamic accuracy for the detector output signals x1, y1, x2, and y2. Likewise, the synchronous detectors 131 and 133 employ a digital architecture that allows for precise control of their 90 degree phase shift function which results in improved accuracy as well as common mode rejection of local oscillator phase noise effects. Finally, the detected signals x1, y1, x2, and y2 are multiplexed with a sample-and-hold/multiplexer (MUX) 137 and then digitized by an analog-to-digital converter (ADC) 139 with 19 bits of resolution. Each ADC conversion takes approximately 40 microseconds and four readings are made for each RF frequency data point to provide the real and imaginary data for both the reference signal 130 and test signal 132.

The output of the ADC 139 is then passed on a 16 bit bus 141 to a high speed central processor (CPU) 143 which includes a microprocessor such as a Motorola 68000 as well as the associated microprocessor system interrupt and I/O control circuitry. Because the CPU 143 is integrated into the main network analyzer 101 it is possible to utilize a multi-tasking architecture to make more efficient use of time than has previously been possible. This architectural integration also permits substantial increases in data processing flexibility and system control performance. Via a dedicated system interface 144 and bus 145, the CPU 143 controls the RF source 109, the test set 107, and, along with the sample selection and timing circuitry 146, all of the IF processing functions including the phase lock hardware 125, autoranging in the IF amplifiers 134, detection by the synchronous detectors 131 and 133, and digitization by the ADC 139. The CPU 143 periodically initiates a self calibration sequence for the IF amplifiers 134, synchronous detectors 131 and 133, and the ADC 139 and the resulting gain, offset, and circularity changes are stored in memory 147, so that the changes in the IF amplifiers 134 can be subtracted from measured results. The CPU 143 also performs all data processing functions for the system. The signals in the IF section 103 are detected as linear real and imaginary components of a vector quantity and the CPU 143 processes the detected data into a variety of formats for presentation of the CRT display 149. By digitally computing the various measurement formats, improvements in dynamic range and meaningful resolution are gained over traditional analog circuit processing techniques.

With past network analyzer systems, an external computer was required in order to characterize and remove systematic errors. With the present invention, this capability exists internally with enough storage capacity (i.e., 256K bytes of random access memory (RAM) and 256K bytes of bubble memory) in the memory 147 to retain up to two 401 point 12-term error corrected traces of data. (Note: each byte of memory consists of eight bits of data storage.) In addition, the measured data can be converted to show the response of the DUT 111 as a function of time (time domain) using an internal Fourier transform process. All data processing takes place virtually in real time by means of parallel data processing in the CPU 143 aided by the incorporation of a dedicated, floating point, complex number, vector math processor 151 designed specifically for fast vector computations. The multiplication of two complex numbers by the vector math processor 151 requires only one operation with the product available within 20 microseconds, so that error corrected measurement results are available 1000 times faster than in the prior art. By means of an internal vector graphics generator 153, the real time processed data is then immediately presented on the CRT 149, on a digital printer/plotter 155, or via an IEEE-488 (HP-IB) interface and bus 157 to external devices. Present as well as past states of front panel controls 159, past and present traces of data, and entire system calibrations can also be stored in and recalled from the memory 147 or loaded and read from a built-in tape drive 161 by means of the system interface and bus 157 under control of the CPU 143.

Integrated Processor

As explained previously and shown in more detail in FIG. 2, the built-in CPU 143 with its 16-bit multi-tasking microprocessor 201, I/O interface circuitry 203, and interrupt system and I/O control circuitry 205, and the vector math processor 151 with its math processor circuitry 207 and math controller 209 are key to the high speed performance of the present invention. The variable precision and variable function architecture of the vector math processor 151 make it adaptable to perform both floating point and complex number math operations. The vector math processor 151 operates on a 16 MHz clock 208 generated within microprocessor 201 and is controlled by a state machine 210 (not shown) with 1K byte of read only memory (ROM) for storage of microcode as shown in Appendix C.

To insure maximum processing speed, processing power is distributed among several internal controllers in addition to the microprocessor 201 and the math processor 207. An additional state machine with 1K byte of microcode is used by the display generator 153 to create the display of both data and display formats from a list in the display RAM 217 which drives the CRT 149 in the display section 218 from a line generator 219 which positions a new X-Y point pair approximately every four microseconds. Likewise both the system bus 145 and the external HP-IB bus 157 have their own internal processors 221 and 223. Finally, controllers 225, 227, and 229 are dedicated to the tape drive 161, the bubble memory 231 within memory 147, and the front panel 159 respectively.

Memory is also distributed according to functional need. 16K bytes of ROM 233 within memory 147 are used for internal test software and boot-up of the system. The main system software is taken from a first 128K bytes of non-volatile bubble memory 235 within memory 147 and placed into 128K bytes of main RAM 237 also within memory 147. 8K bytes of ROM 239 are dedicated to the bubble memory 231 for use in test and boot-up. 60K bytes from the second 128K bytes of bubble memory 235 are used to store equation coefficients used in vector error correction. The remaining 68K bytes of bubble memory 235 contain recallable instruments states, measurement memory data and additional system software. The contents of the CRT display are stored in 32K bytes of display RAM 217. The remaining 96K bytes of display RAM 217 are used for data, coefficients, and control tables. Personal back-up storage, test software, additional system software, and data can be stored and accessed as desired on cartridges in the tape drive 241.

Figure 2:
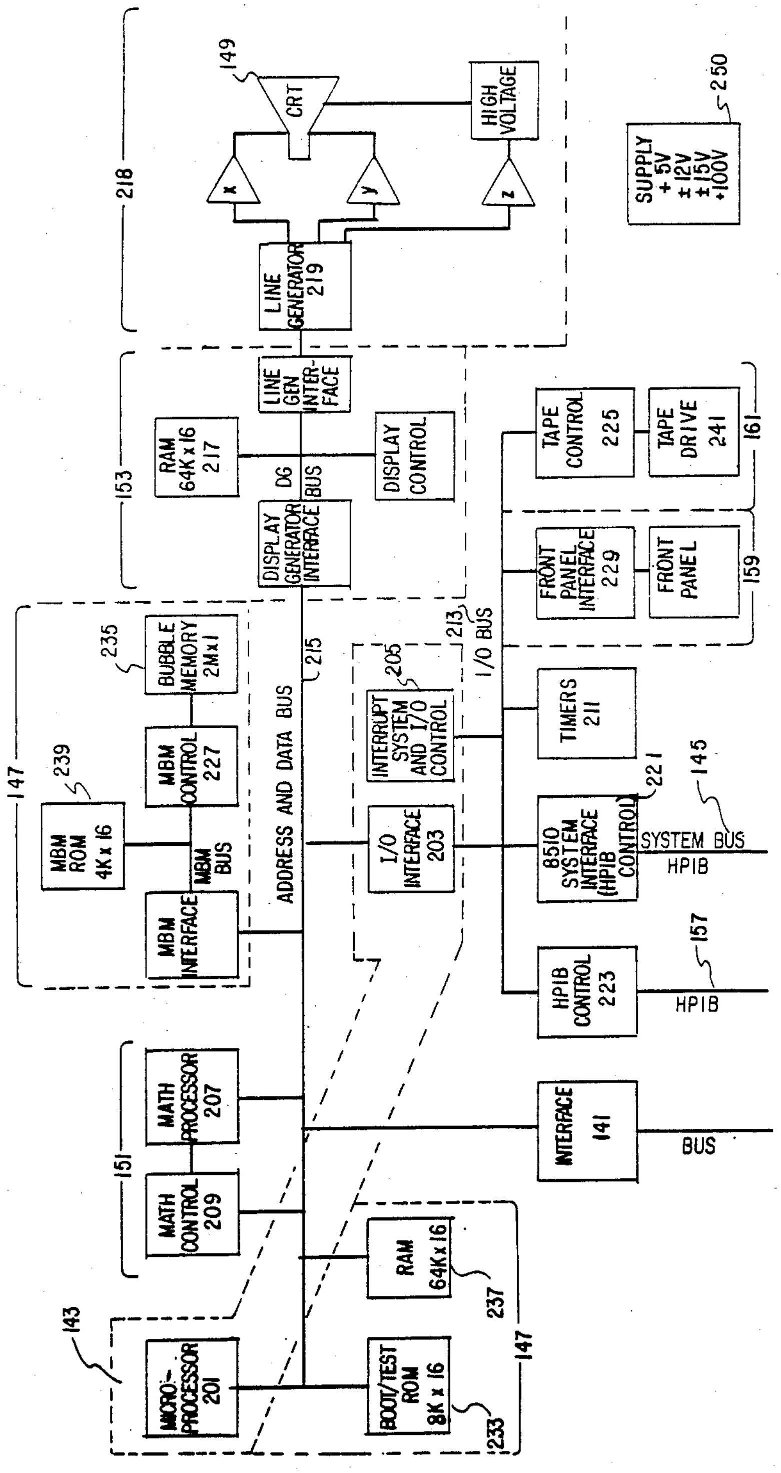
FIG. 2 shows a detailed block diagram of a portion of the preferred embodiment shown in FIG. 1.
Figure 356B:
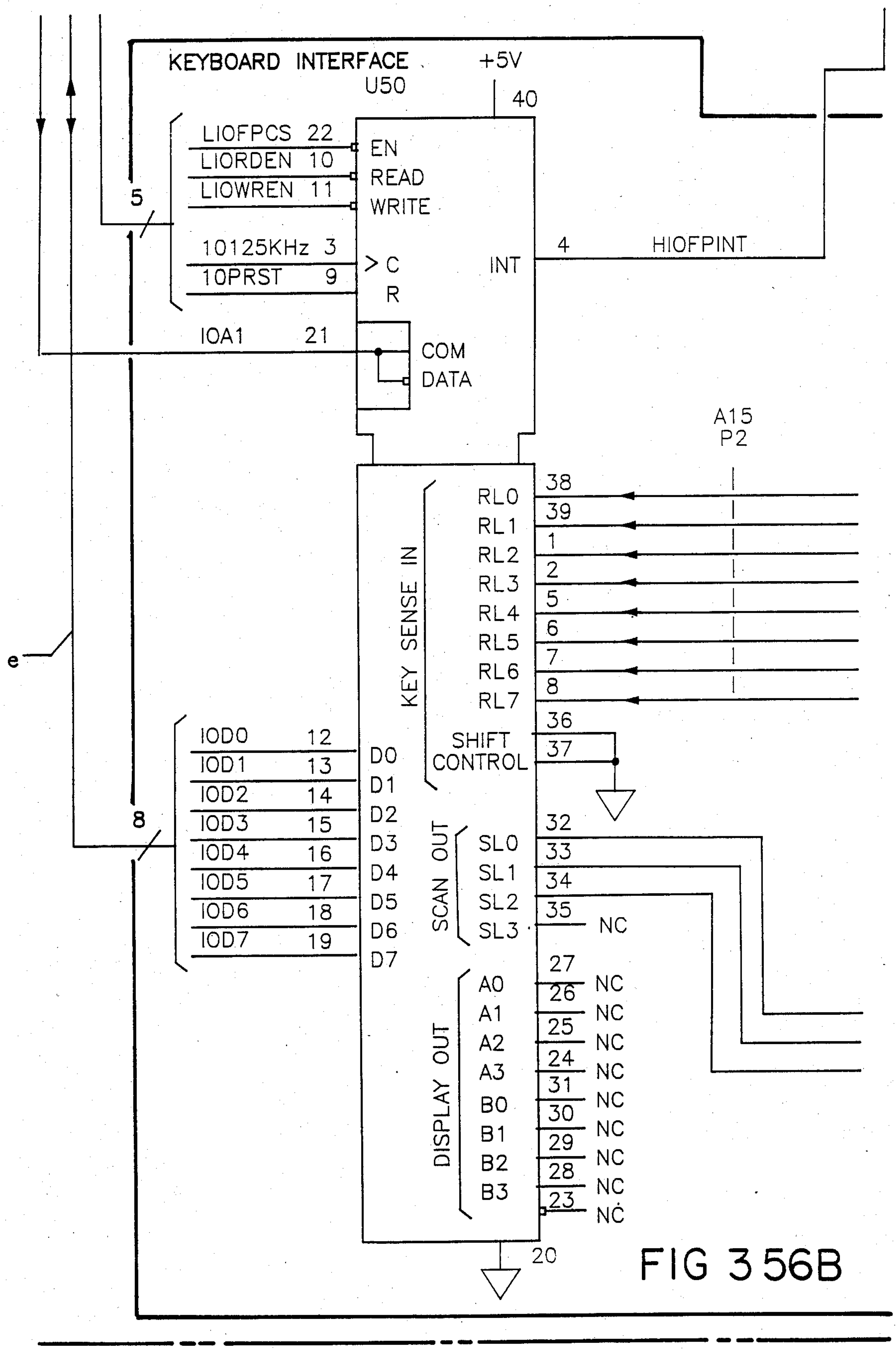
Figure 3:
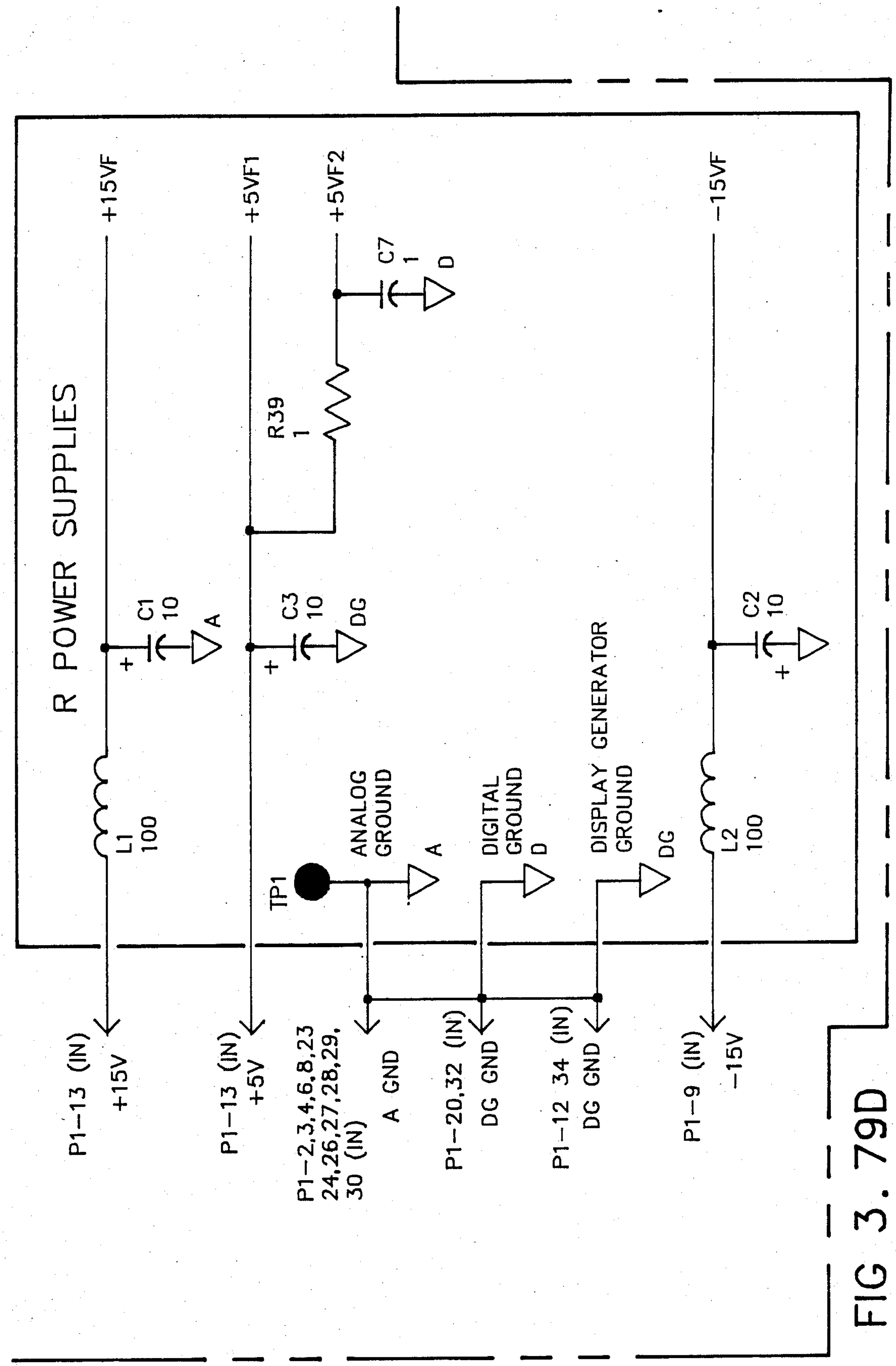
FIGS. 3.1A through 3.102 show the schematics for the detailed block diagram as shown in FIG. 2.

FIGS. 3.1A through 3.102 show the detailed schematics of the block diagram shown in FIG. 2. The CPU 143 is shown in FIGS. 3.1A–3.12 and 3.49–3.54, with the microprocessor 201 at FIG. 3.2 and the I/O interface and Interrupt 203 and 205 at FIGS. 3.49–3.54. The ROM 233 is shown at FIG. 3.5, RAM 237 is at FIGS. 3.19A–3.11, and bubble memory 147 is at FIGS. 3.24–3.32. The display generator 153 is shown on FIGS. 3.33–3.48, the display section 218 is shown on FIGS. 3.64A–3.90 with the line generator 219 at FIGS. 3.79A–3.90. Interface 144 is shown on FIG. 3.51 and the external HP-IB interface 233 and the system interface 221 are shown on FIGS. 3.58A through 3.58D. The timers 211 are shown on FIG. 3.52. The front panel interface 229 is shown on FIGS. 3.55A–3.56D and the remainder of the front panel 159 is shown on FIG. 3.60A–3.63. The tape drive 161 is shown on FIGS. 3.57A through 3.57D. Finally, the various low voltage power supplies 250 for the data processor/display section 105 are shown in FIGS. 3.91A–3.102.

The vector math processor 151 as shown in FIG. 3.13–3.22B is constructed from a series of commercially available medium scale integrated circuits as follows: U56, U74, and U97 are 74S153 multiplexers, U37 is a 74S175 D-type flip flop, U91 is a 74LS385 adder, U65–68 and U82–85 are 25Ls14 multipliers, and U69–72 and U86–89 are 25LS299 shift registers. The 16 MHz clock 208 is shown in detail in FIGS. 3.1A and 3.1B and the state machine 210 is shown in detail in FIGS. 3.13–3.14B.

Description of the Front Panel, Menus, and Displays

Figure 4A:
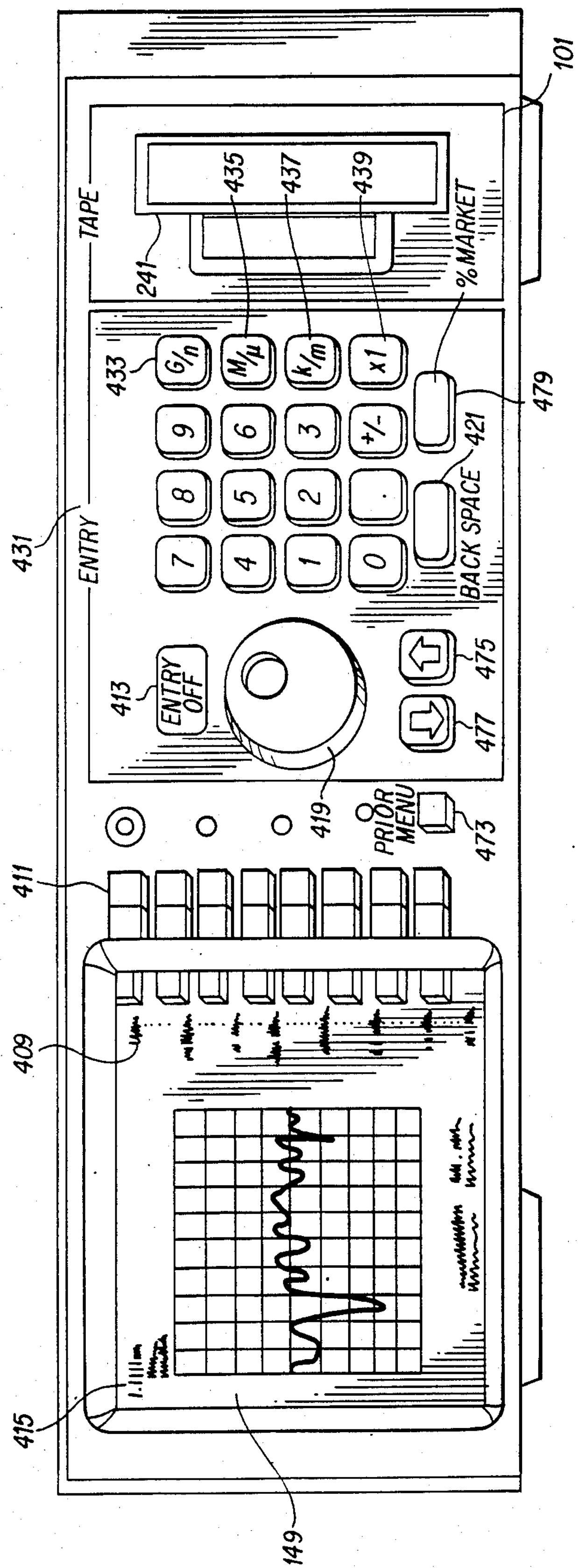
FIGS. 4A through 4C show the front panel controls of the preferred embodiment of the present invention.
Figure 4B:
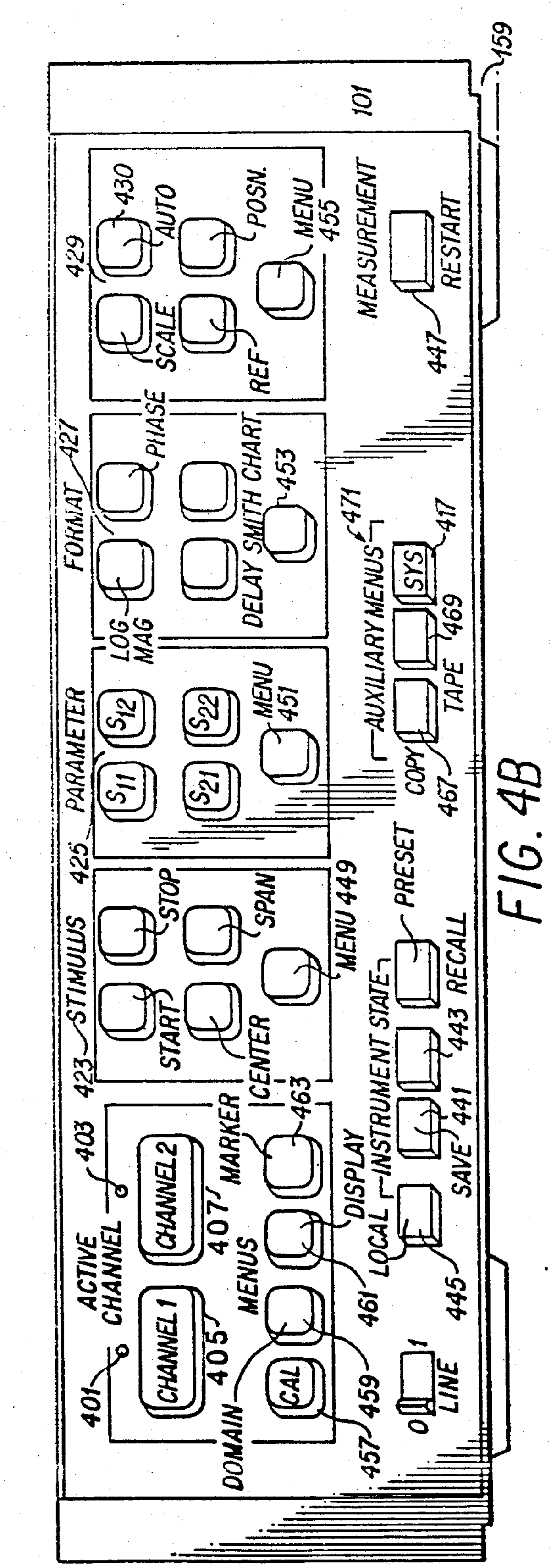
Figure 4C:
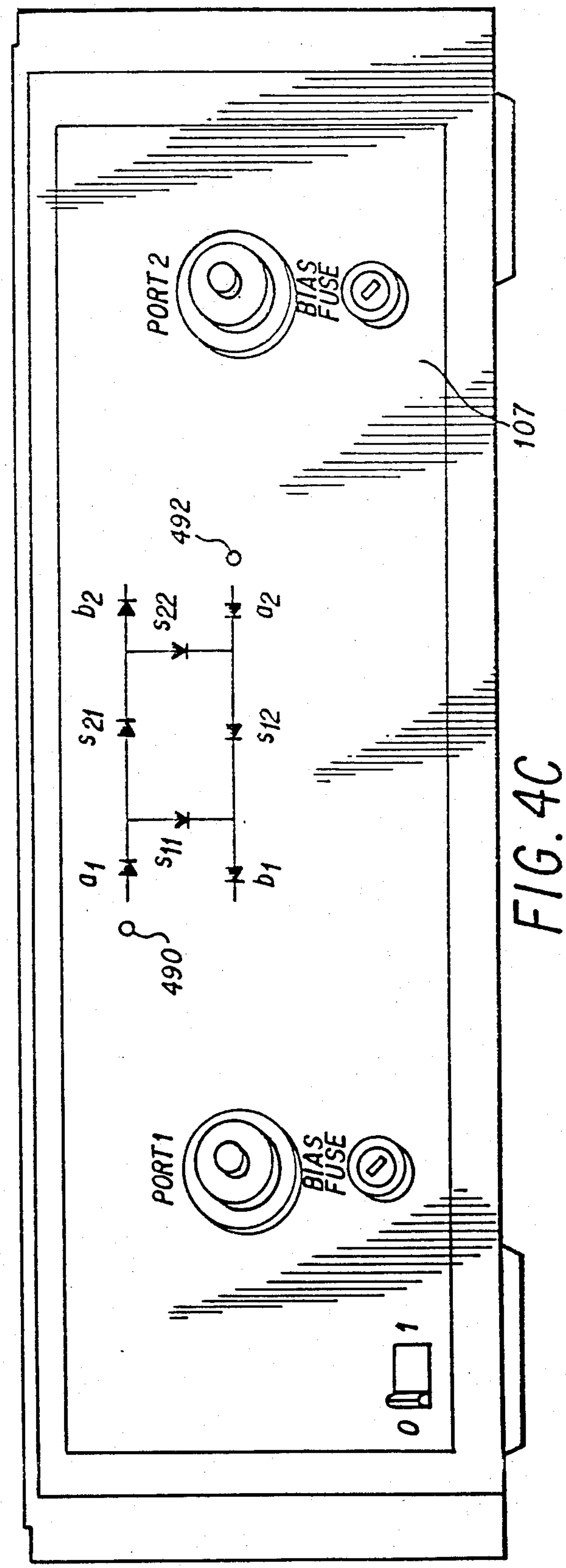

FIGS. 4A through 4C show the front panel 159 of the present invention with capability to set up and control two independent measurements with two measurement channels selected by channel buttons 405 and 407. When the indicator 401 or 403 above the channel buttons 405 and 407 is lit, the respective channel is selected as the channel controlled by the front panel 159. The CRT 149 is also available for viewing on the front panel 159. Annotation on the CRT 149 includes graticules if desired, labels for one or two data side by side or overlaid data traces, reference line position symbols, and channel labels for the parameter being shown, the format of the display, reference line value, horizontal and vertical scales, and the value of any markers being used. Source frequency or other stimulus information is shown on the CRT 149. An active entry menu area 409 in which no data traces are displayed is also provided on the CRT 149 for identification of the current active functions which may be selected via the CRT softkeys 411. The softkeys 411 therefore extend the accessible instrument capabilities by adding selectable functions without adding to front panel complexity. An Entry Off key 413 clears the active entry state. Prompts, indications of instrument functions, procedural instructions, error messages, and procedural advisories also appear on the CRT 149. If a message is important to the measurement, a beep sound signals the operator to look at the message. A title area 415 is also provided for up to 50 characters of information about the measurement being viewed. To use the title function, the Auxiliary Menus System button 417 is pressed, followed by one of the softkeys 411 which will be labeled Title. The RPG knob 419 is then rotated to position an arrow symbol below the first letter desired and displayed on the CRT 149. The user then presses a Select Letter softkey 411 and the selected letter will appear in the title area 415. This process is repeated as desired along with desired Space softkeys 411 and Backspace keys 411, terminated with the Done softkey 411 and cleared with the Clear Softkey 411.

All basic measurement functions are controlled by the four groups of keys (SPFR) labeled Stimulus 423, Parameter 425, Format 427, and Response 429 which respectively are used to set the stimulus, select the parameter, select the format, and adjust the response for the desired measurement. The Stimulus keys 423 provide direct control of the source 109 to set the frequencies, source power, sweep time, and other related functions. The Parameter keys 425 select the parameter to be measured. With the source 109 applied to port 1, $S_{11}$ is selected for reflection (return loss) and $S_{21}$ is selected for transmission (insertion loss or gain). Likewise, with the source 109 applied to port 2, $S_{22}$ is selected for reflection and $S_{12}$ is selected for transmission. Appropriate control of the test set 107 is enabled automatically depending on the parameter selected. The Format keys 427 place measured parameter data in the desired format: logarithmic (dB), phase, group delay, and Smith Chart, or, alternatively, SWR, linear magnitude, R+jX impedance, and others. The Response keys 429 set the scale per division, reference value, or reference position, or let the AUTO function via the Auto key 430 automatically place all the measured data on the entire display 149 with pleasing values for a reference value and scale. Additional Response functions include averaging, smoothing, and an electronic line stretcher.

Figure 5:
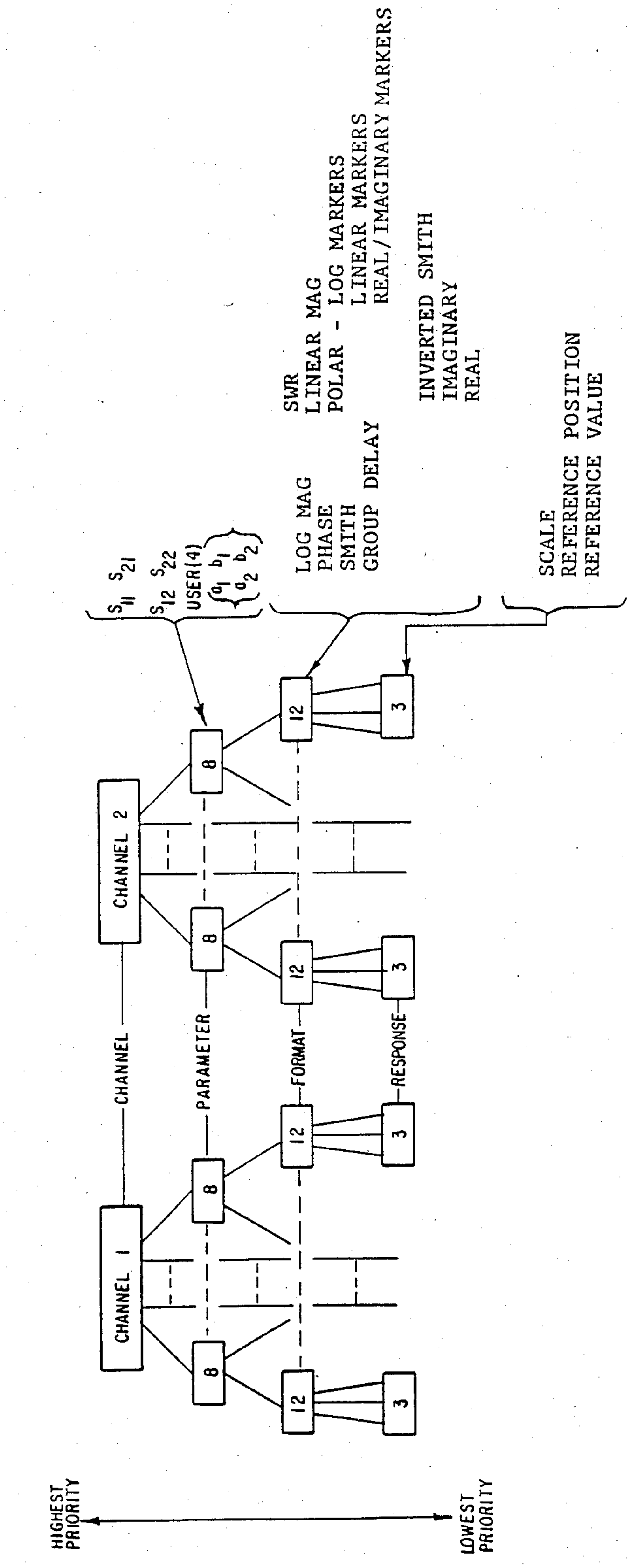
FIG. 5 shows a hierarchal SPFR structure used in the preferred embodiment of the present invention.

The hierarchal Channel-Parameter-Format-Response (CPFR) structure used in the present invention is shown in FIG. 5. Once a particular path through the CPFR structure has been chosen, this path is stored in the memory 147 for latter reference. Then, when one of the CPFR structure items is changed, such as changing the Parameter from $S_{11}$ to $S_{22}$, the entire path previously associated with the new item is automatically reestablished for use by the entire system. Thus, for example, if Channel 1 is presently being used to measure the Parameter $S_{11}$ with the display in log magnitude Format and a 0.2 dB/division vertical Scale, and if Channel 1 was previously used to measure the Parameter $S_{22}$ with the display in linear magnitude Format and a 5 milliunits/division vertical Scale, then when the Parameter is changed from $S_{11}$ to $S_{22}$ the Format automatically changes from log magnitude to linear magnitude and the Scale automatically changes from 0.2 dB/division to 5 milliunits/division. In addition, since the CPFR structure is an hierarchal tree and since Parameters are lower in the hierarchy than Channels, the Channel number will not be changed when the Parameter is changed as in the present example. Similarly, if the Channel is changed, the Parameter, Format, and Response are all subject to automatic reestablishment, and if only the Format is changed, only the Response is subject to automatic reestablishment. Naturally, any of the SPFR values may be altered from the front panel 159 as desired by the user. The result of this hierarchal SPFR structure is a substantial added degree of speed and convenience for the user.

The numeric Entry keys 431 are used when a numeric value is to be entered, which entered value is terminated by one of the four terminator keys G/n 433, M/u 435, k/m 437, and xl 439. The four terminator keys 433–439 are used when the entered value being terminated has the order of magnitude respectively of either Giga ($10^{+9}$) or nano ($10^{-9}$), Mega ($10^{+6}$) or micro ($10^{-6}$), kilo ($10^{+3}$) or milli ($10^{-3}$), or a basic unit ($10^{0}$) such as dB, degree, second or hertz. The four terminator keys 433–439 are therefore unique in that no particular set of measurement units is permanently assigned to any of the keys, so that substantially fewer terminator keys are required than in the prior art.

Pressing the Save key 441 followed by one of the CRT softkeys 411 saves the current complete state of the network analyzer 101, and the controlled functions of the source 109 and the test set 107. The Recall key 443 followed by a CRT softkey 411 is used to recall the previously stored instrument state. The hierarchal SPFR structure is an integral part of the instrument state.

The Tape key 469 in the Auxiliary Menu Block 471 displays soft keys 411 for controlling the internal tape drive 241. The tape functions allow initialization of cassette tapes, storing data to tape, loading data from tape, deleting data on tape, erasing the last deletion of data, and display of a directory of tape contents on the CRT 149. Tape data can be a combination of any of the following:

1. Measurement data after second IF and detector correction (raw data), after error correction and/or time domain conversion (data), or after formatting (formatted data) for either or both measurement channel.
2. Memory data stored after time domain conversion and before formatting from an earlier measurement, individually or all at once.
3. Graphics that the user has created on the CRT 149 FIG. 4.
4. One or all sets of machine states stored by pressing the Save key 441 FIG. 4B.
5. One or all sets of error coefficients measured and stored by pressing the CAL key 457, and the subsequent Calibrate soft keys 411 labeled in the area 409.
6. One or all sets of calibration standard descriptions (Cal Kits).
7. A complete machine dump consisting of all sets of all data described in 1 through 6.
8. System, service, or demo software, including options, revised versions, and new software.

When measurement data is loaded from tape to any point in the Data Processing path, the display on the CRT 149 is updated to show the oaded data with subsequent data processing.

If an external device has control of the system using the HP-IB interface 157, pressing the Local key 445 returns control of the system to the front panel 159.

The Restart key 447 is used to restart any previously started measurement or data handling operation such as sweeping or averaging.

Three blocks of the front panel keys along with the softkeys 411 provide an additional feature called MENUS for functions which are used less frequently than the functions to which dedicated keys are assigned. The four Menu keys 449, 451, 453, and 455 provide extensions of the SPFR keys 423, 425, 247 and 429; the keys labeled Cal 457, Domain 459, Display 461, and Marker 463 in the Menus block 465 allow selection of various measurement and display modes; and the keys labeled Copy 467, Tape 469, and System 417 under the Auxiliary Menus block 471 provide measurement related input and output operations. Shown in Appendix A is a list of the various MENUS along with the softkey labels, shown in quotation marks, as displayed in the menu area 409 of the CRT 149 opposite the related softkeys 411. Also shown for the softkey labels in Appendix A are the names of the constants assigned to the softkey labels as found in the system source code in Appendix B.

When a MENU is displayed on the CRT 149 any current choices are indicated by a line under the labels and mutually exclusive and/or closely related choices are connected by dots. Pressing the softkey 411 beside any label in area 409 either executes the function or presents another set of MENU labels. If the selected function requests an input, the RPG knob 419 and Entry keys 431 are used to respond. Additional functions are selected by pressing another key. A Prior Menu key 473 is used to return to the previously displayed MENU in a series of menus. If the previously displayed MENU was the first in a series of MENUS, the MENU is cleared from the CRT 149.

Figure 6:
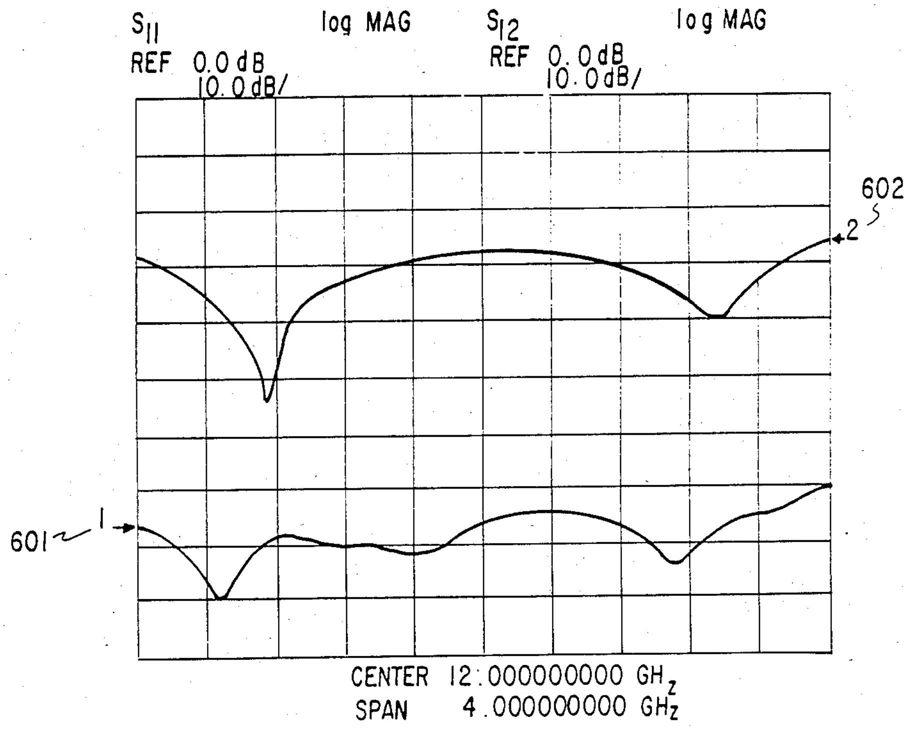
FIGS. 6 through 15, 17, and 18 show several of the measurements which can be performed with the preferred embodiment of the present invention.
Figure 7:
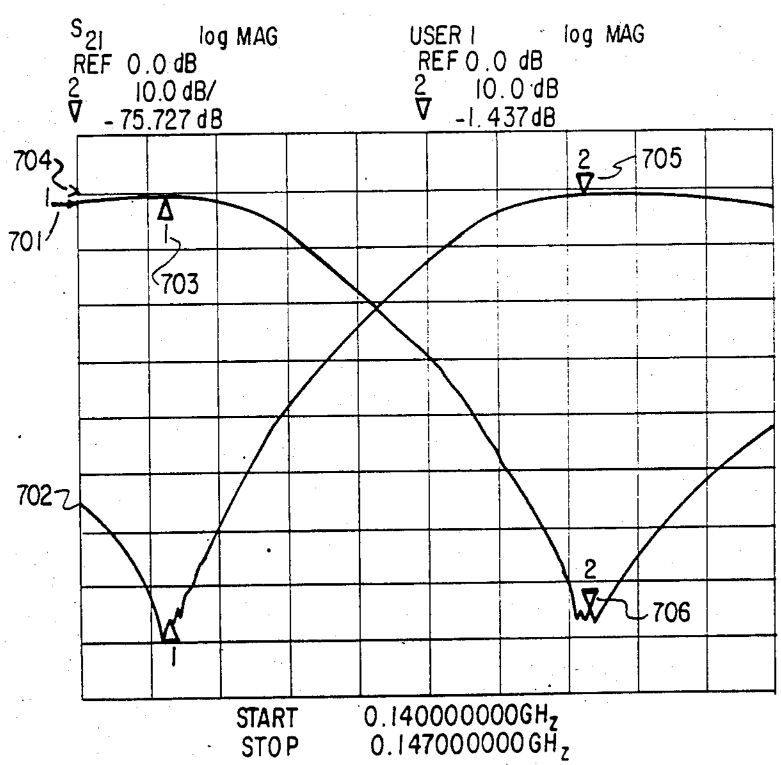
Figure 8:
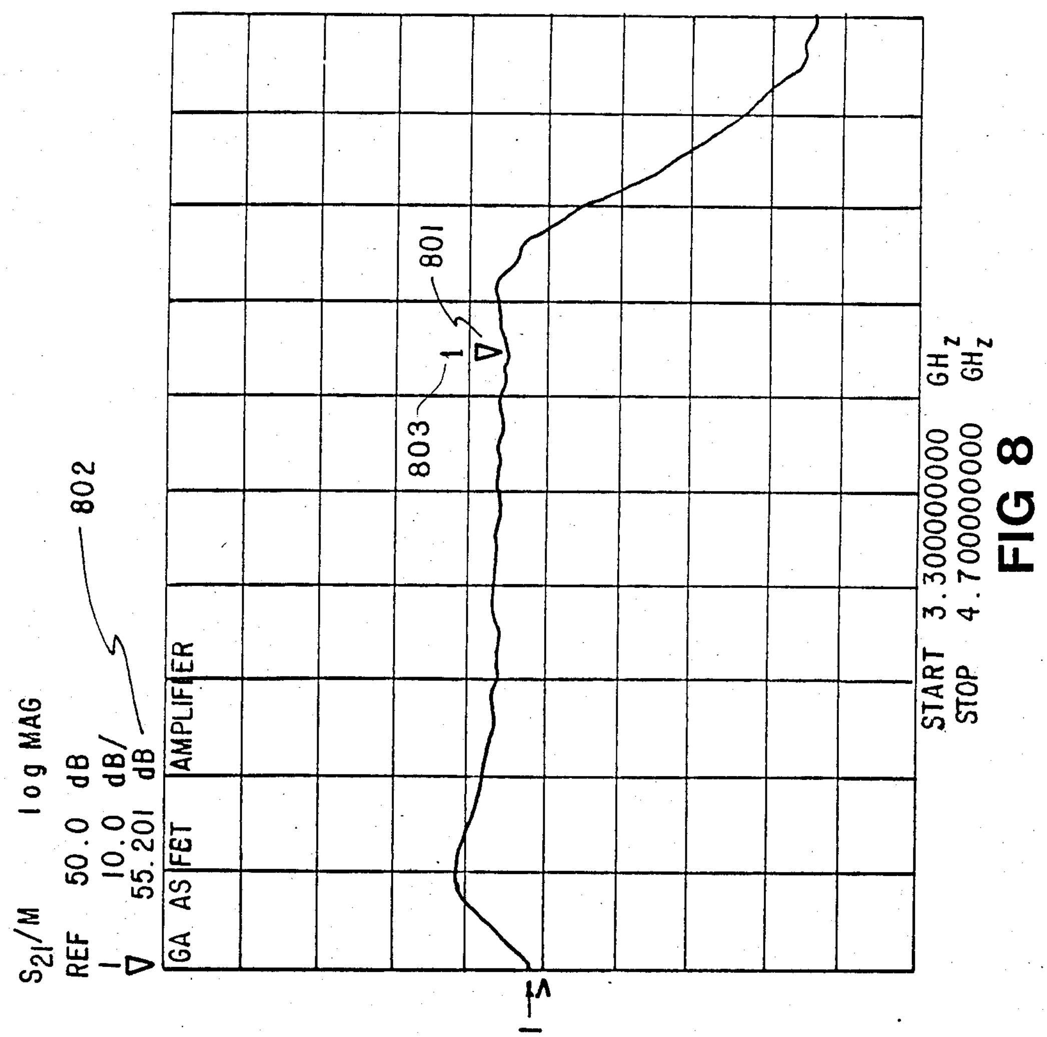
Figure 9:
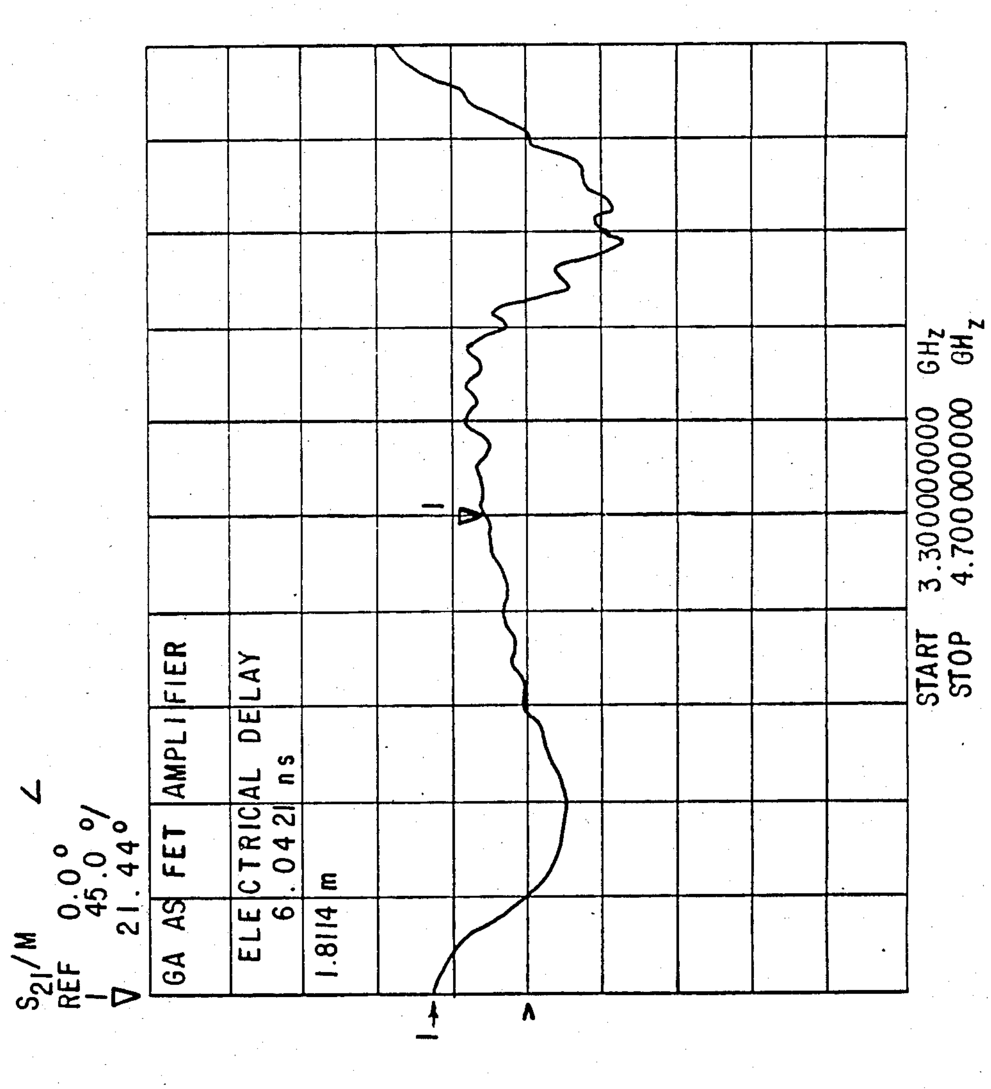
Figure 10:
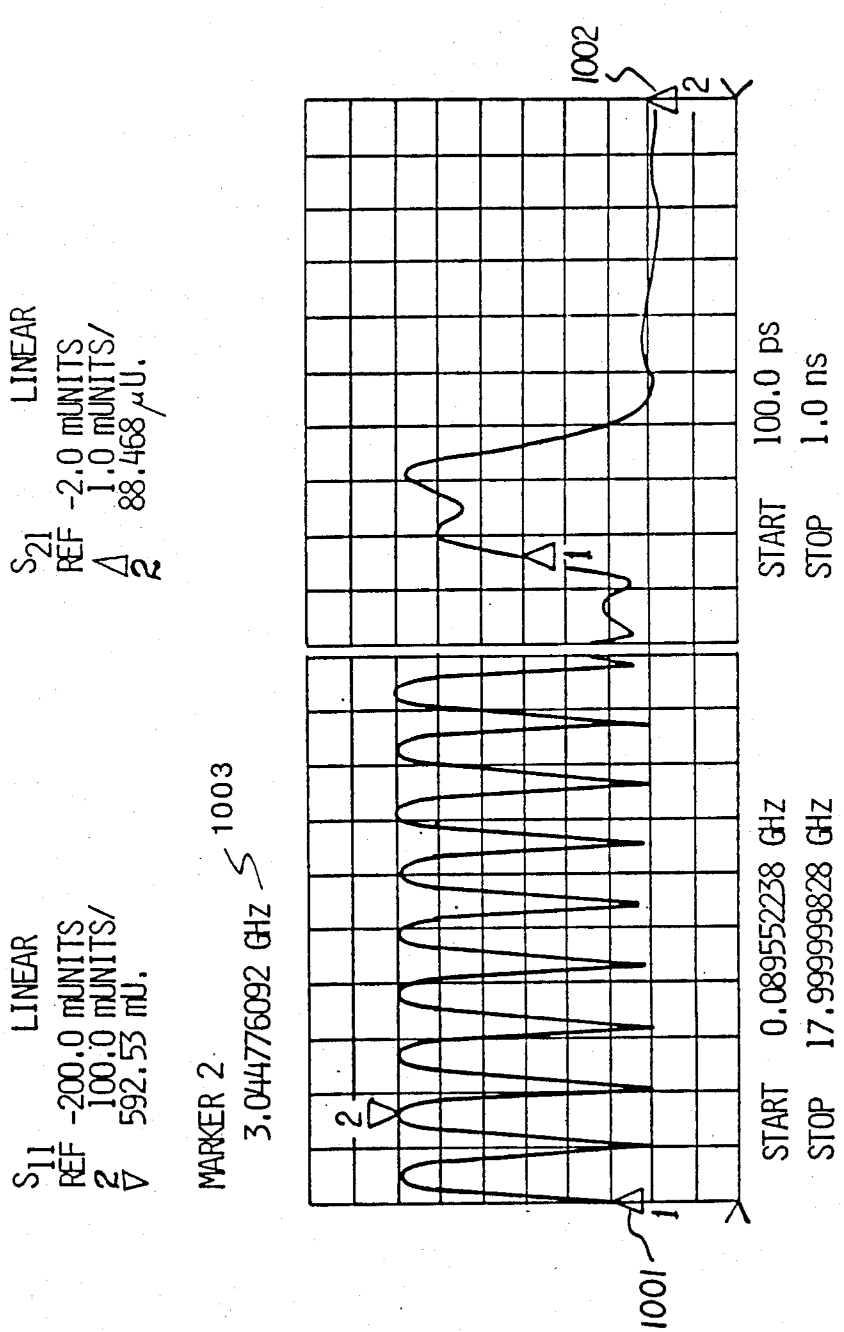
Figure 11:
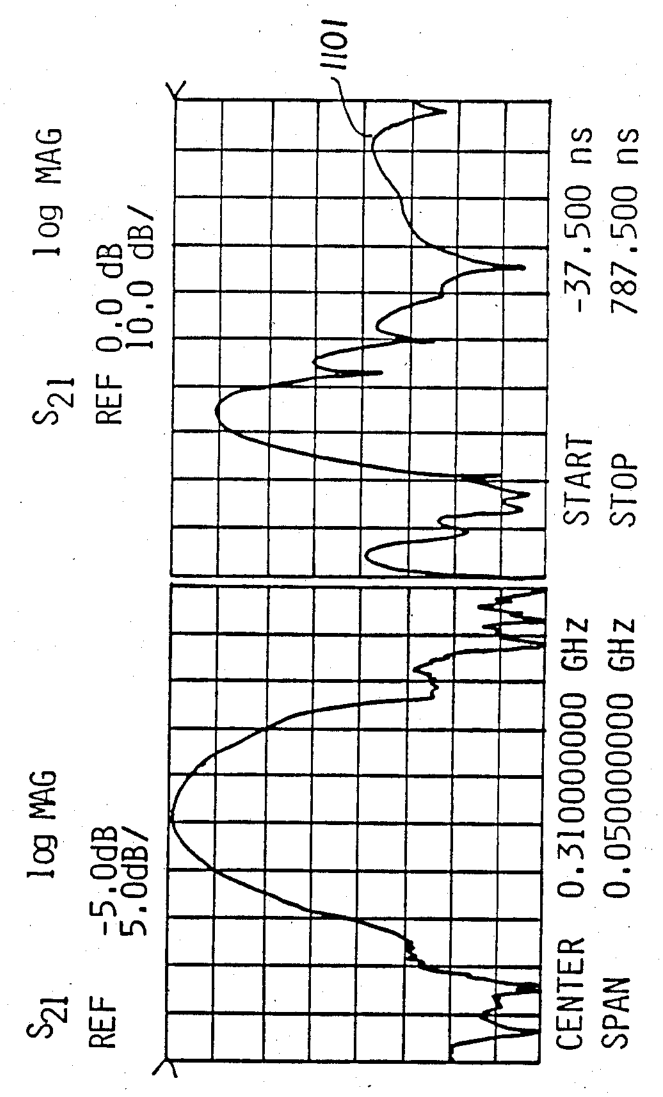
Figure 12:
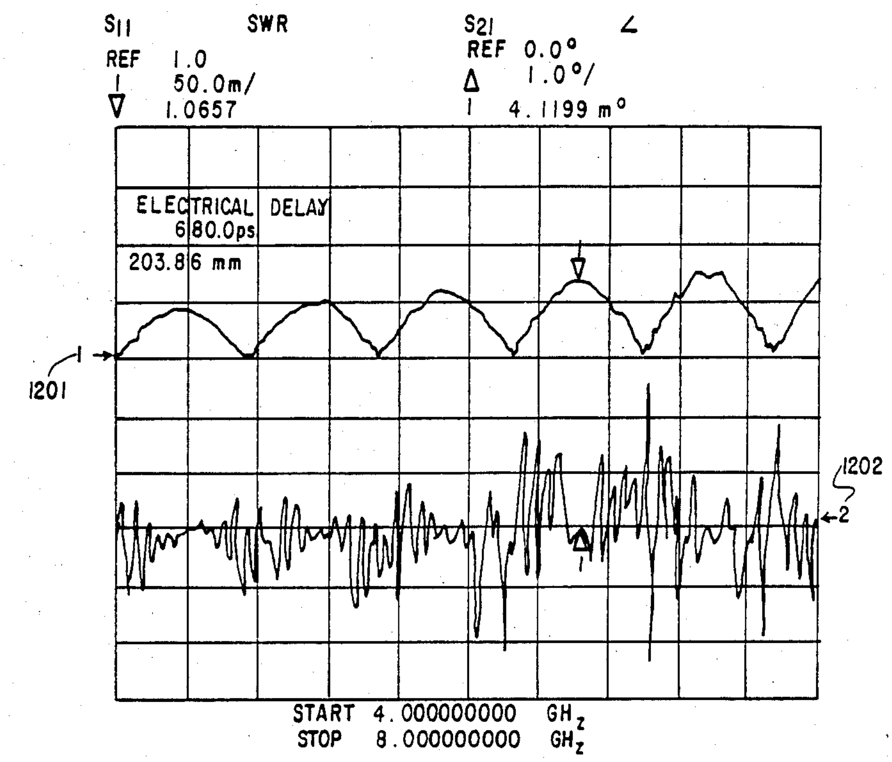
Figure 13:
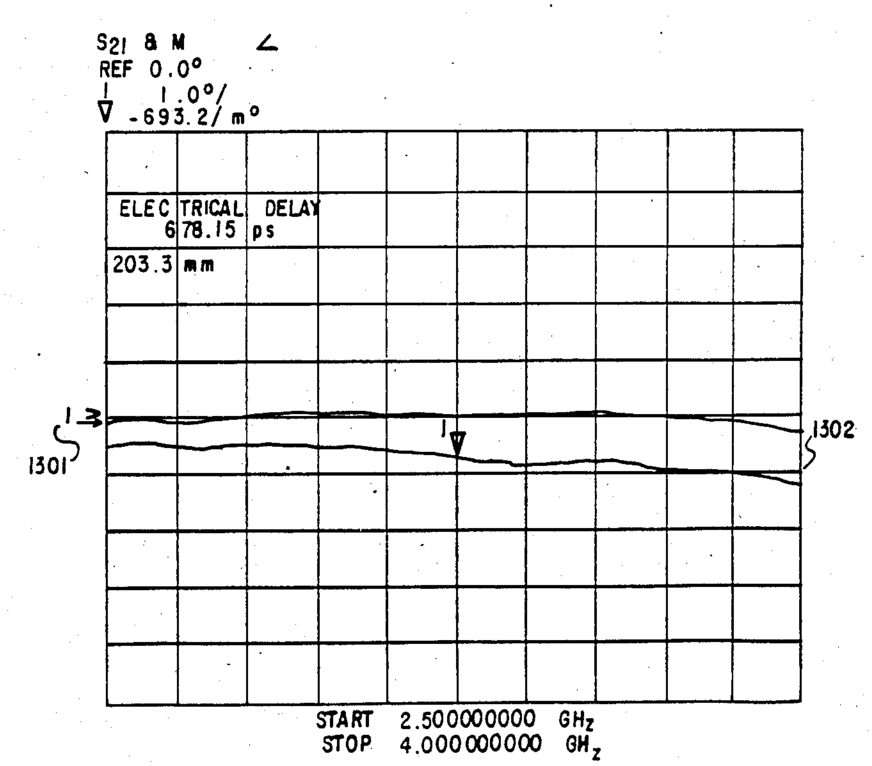
Figure 14:
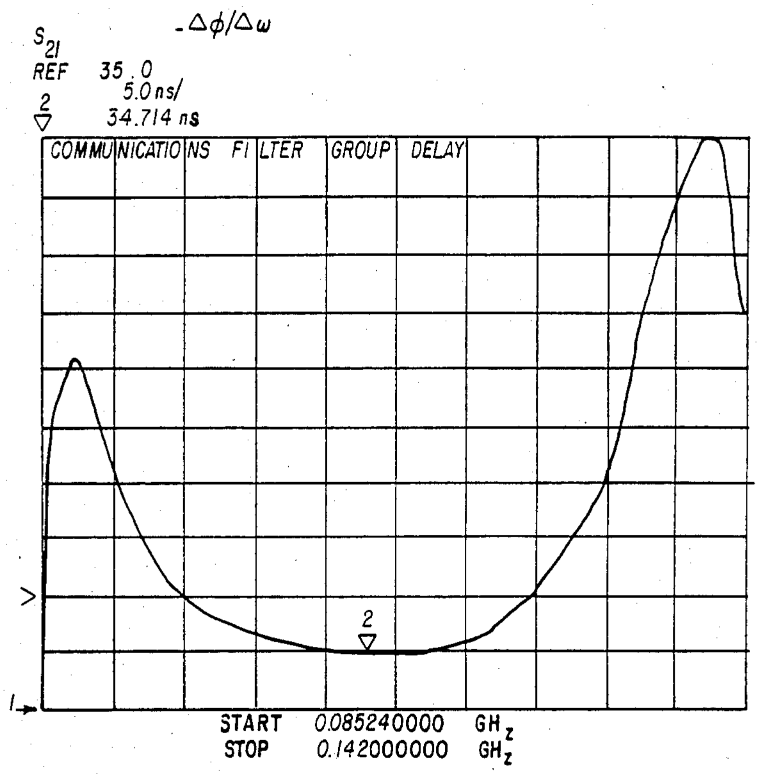
Figure 16:
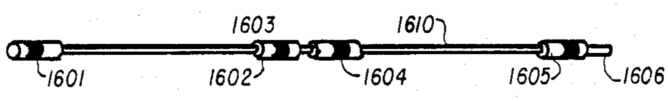
FIG. 16 shows a coaxial line as measured and displayed in FIG. 15.
Figure 15:
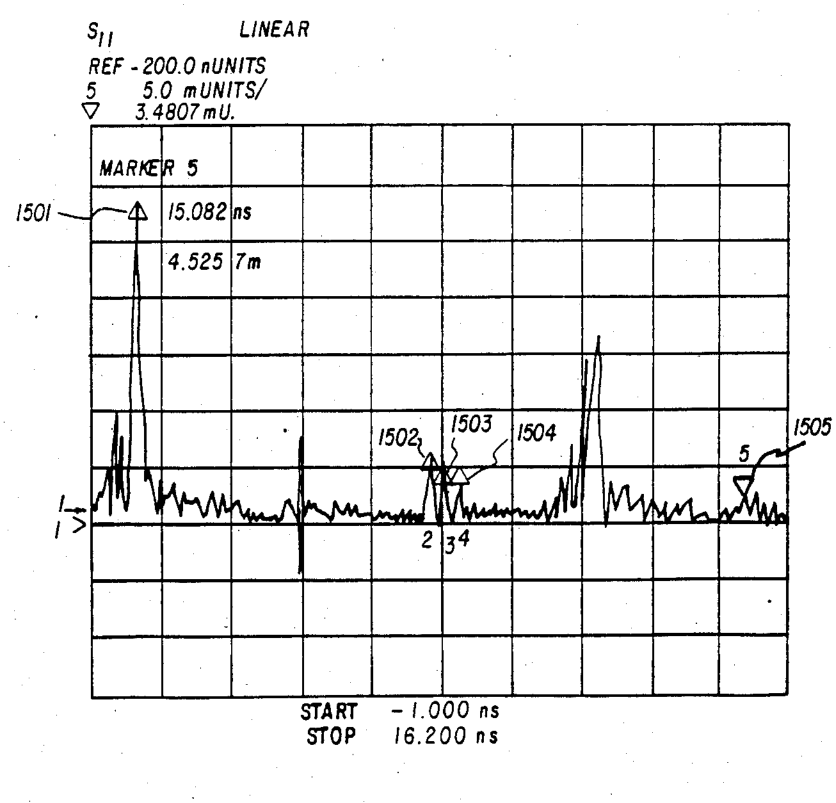
Figure 17:
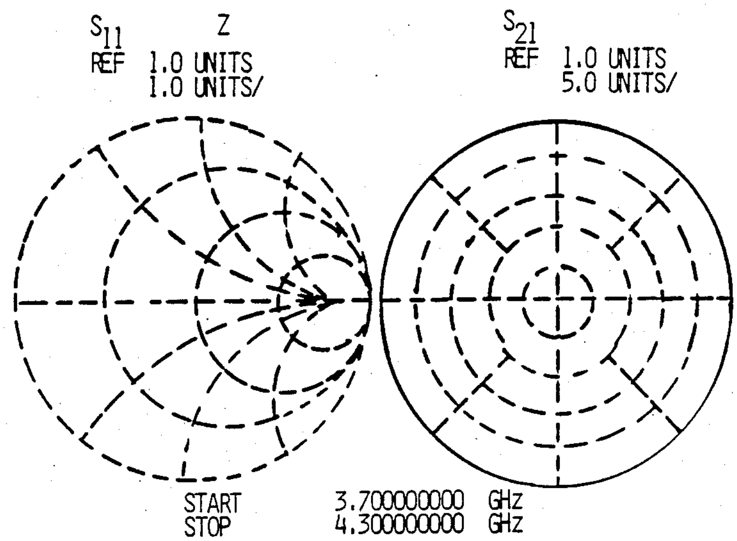
Figure 18:
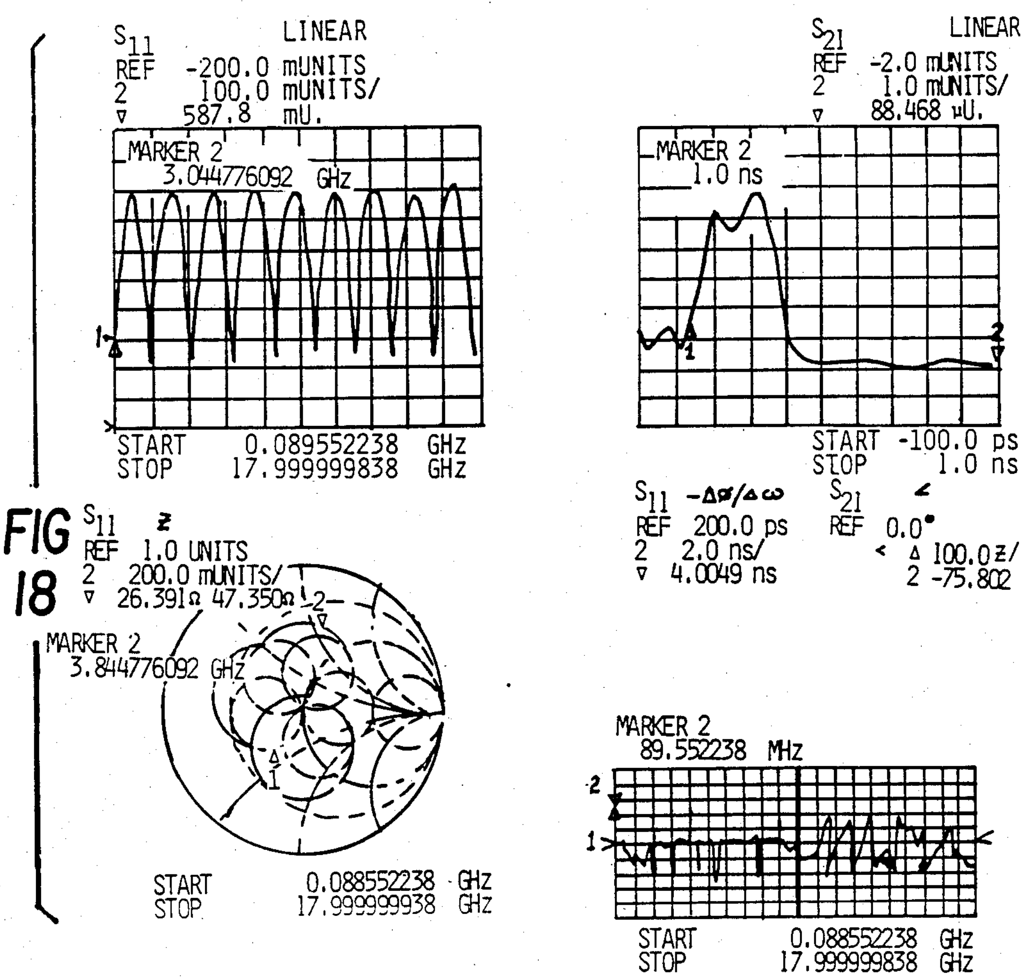

Several of the wide variety of displays available either on the CRT 149 or on the printer/plotter 155 are shown in FIGS. 6 through 15, 17 and 18. FIG. 6 shows a typical dual trace measurement of two different parameter $S_{11}$ and $S_{12}$ signified by trace number 601 and 602 respectively with the same log magnitude format used for example to adjust a circulator's impedance and isolation simultaneously in real time. FIG. 7 shows two overlaid traces 701 and 702 for ports 2 and 3 respectively of a three port multiphase filter. FIG. 8 shows a single trace of an amplifier and an attenuator combined to show the total closed loop response of the active circuit. FIG. 9 shows a measurement trace of the same active amplifier as in FIG. 8 calibrated in a user defined reference plane with an electrical delay of 6.0421 nanoseconds making use of the electronic line stretcher. FIG. 10 shows a unique split screen of two simultaneous measurements of two different parameters $S_{11}$ and $S_{21}$ as displayed on the CRT 149. FIG. 11 shows another version of the split screen display, split to simultaneously show the response of a surface acoustical wave filter (SAW device) in both the frquency and time domains. Note the appearance of the triple travel peak 1101 on the time domain response. FIG. 12 shows two different parameters displayed with two different formats (i.e., SWR and deviation from linear phase) for traces 1201 and 1202. FIG. 13 shows a previous measured trace 1301 from "memory" and the current measurement trace 1302 of the same parameter $S_{21}$ which can be used for matching transmission lines to within 0.01 degrees. FIG. 14 shows the display of group delay for a typical RF communications filter which with the present invention can be viewed and adjusted for optimum group delay flatness in real time. FIG. 15 shows a linear display of an RF circuit in the transformed time domain along with a series of five markers 1501–1505 to mark the five different corresponding discontinuities respectively (i.e., connector 1601, connector 1602, adapter 1603, connector 1604, and termination 1606) of a coaxial line 1610 as shown in FIG. 16. FIG. 17 shows a split screen of two polar plots as displayed simultaneously on the CRT 149. Each of the FIGS. 6 through 15 and 17 are displays of actual RF devices as shown in real time on the CRT 149. These same displays can also be printed on the printer/plotter 155 as they are shown on the CRT 149 with whatever size change is desired and in a variety of colors. If desired, various of the CRT displays can also be combined on the printer/plotter 155 as a four quadrant plot as shown in FIG. 18.

Up to five different markers for the traces on the CRT 149 are accessed via the Marker key 463 along with the softkeys 411 as shown in FIG. 15 by markers 1501–1505. The markers are controlled in a number of different ways. The numeric entry keys 431 are used to set the markers to an exact numeric position, the RPG knob 419 is used to move the markers along the traces on the CRT 149, the Up Step key 475 and the Down Step key 477 move the markers right and left one horizontal division. The precise value of the marker position is also immediately displayed on the CRT 149 as shown in FIG. 8 by marker 801 and the displayed value 802. The marker annotation 803 is displayed adjacent to the marker 801. In addition, as the markers are moved along the traces, the marker annotation moves with the markers so that the user can always immediately identify which marker and related annotation is which. A further function available through the softkeys 411 is Delta Markers for reading the difference in the trace value between an Reference Marker and a Delta Marker as shown by markers 703 and 706 in FIG. 7. The RPG knob 419 is used to sequentially position the Reference Marker and the Delta Marker and the difference in trace value is immediately displayed on the CRT 149. Also available with the aid of the softkeys 411 are Marker to Minimum and Marker to Maximum functions to move a selected marker to the minimum or maximum value of the displayed trace as shown by markers 1001 and 1002 in FIG. 10. A further function is the display of marker frequency, as shown by 1003 in FIG. 10, or other stimulus value, as shown by 1505 and the corresponding interface due to connector 1605. in FIG. 15 and FIG. 16.

The equal marker key 479 enters the current stimulus or amplitude value, as appropriate, of the most recently active marker for the current active function. For example, selecting the reference value key (429 FIG. 4B) followed by the equal marker key 479 causes the amplitude of the marker to be entered for the reference value. Similarly, selecting the stimulus start key (423 FIG. 4B) followed by the equal marker key 479 causes the frequency, or other stimulus value, of the marker to be entered for the start function.

Description of the Test Sets

Figure 19B:
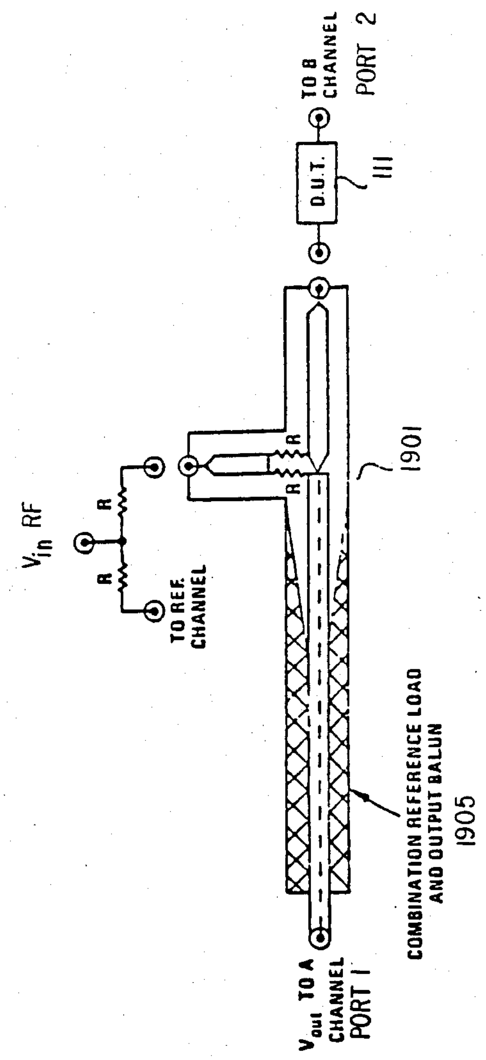
Figure 19A:
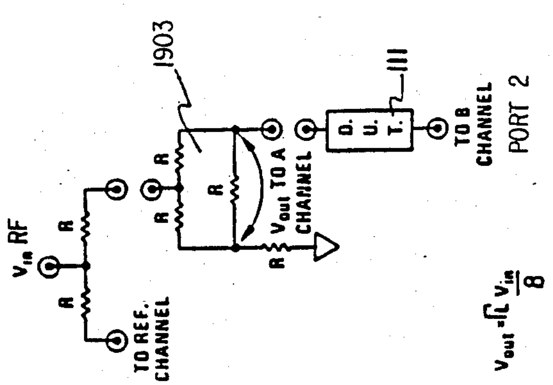
Figure 20:
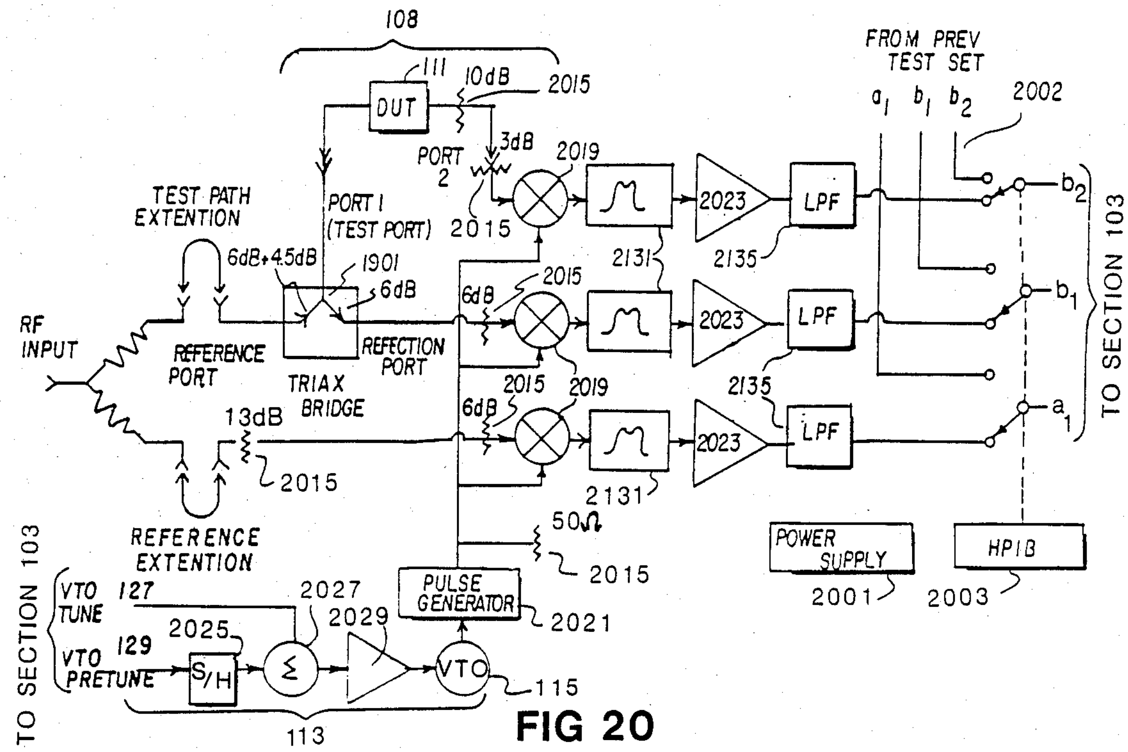
Figure 22:
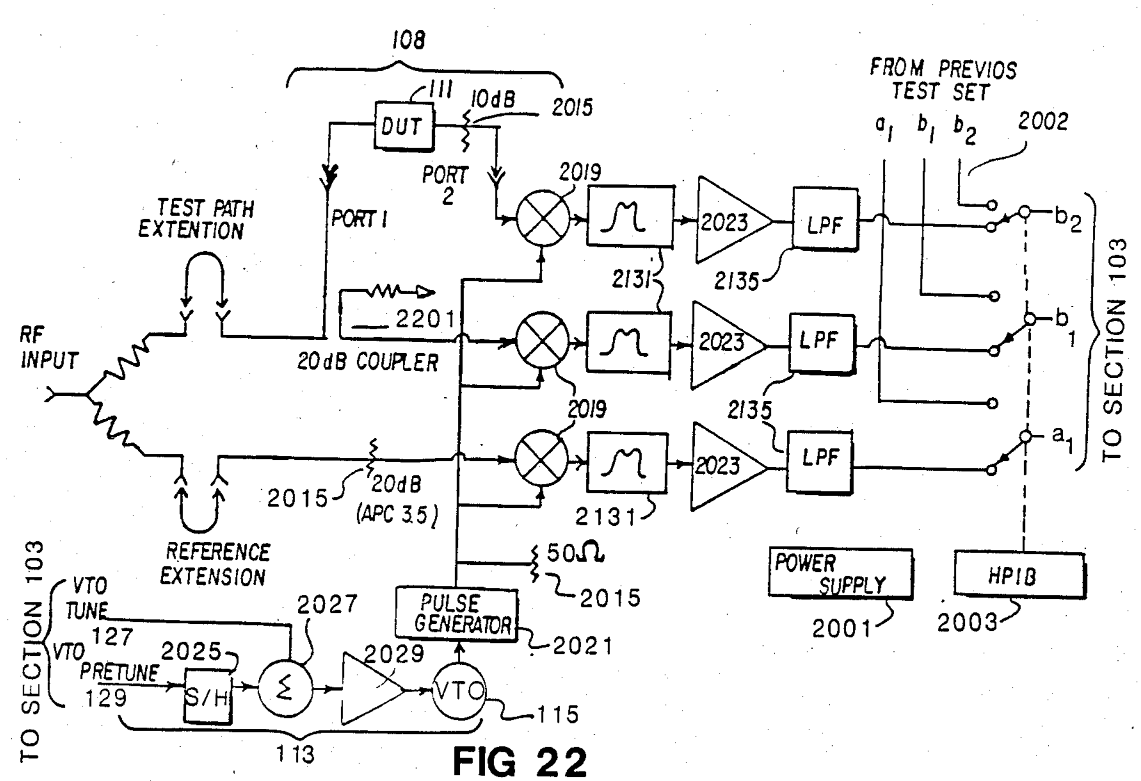
Figure 21:
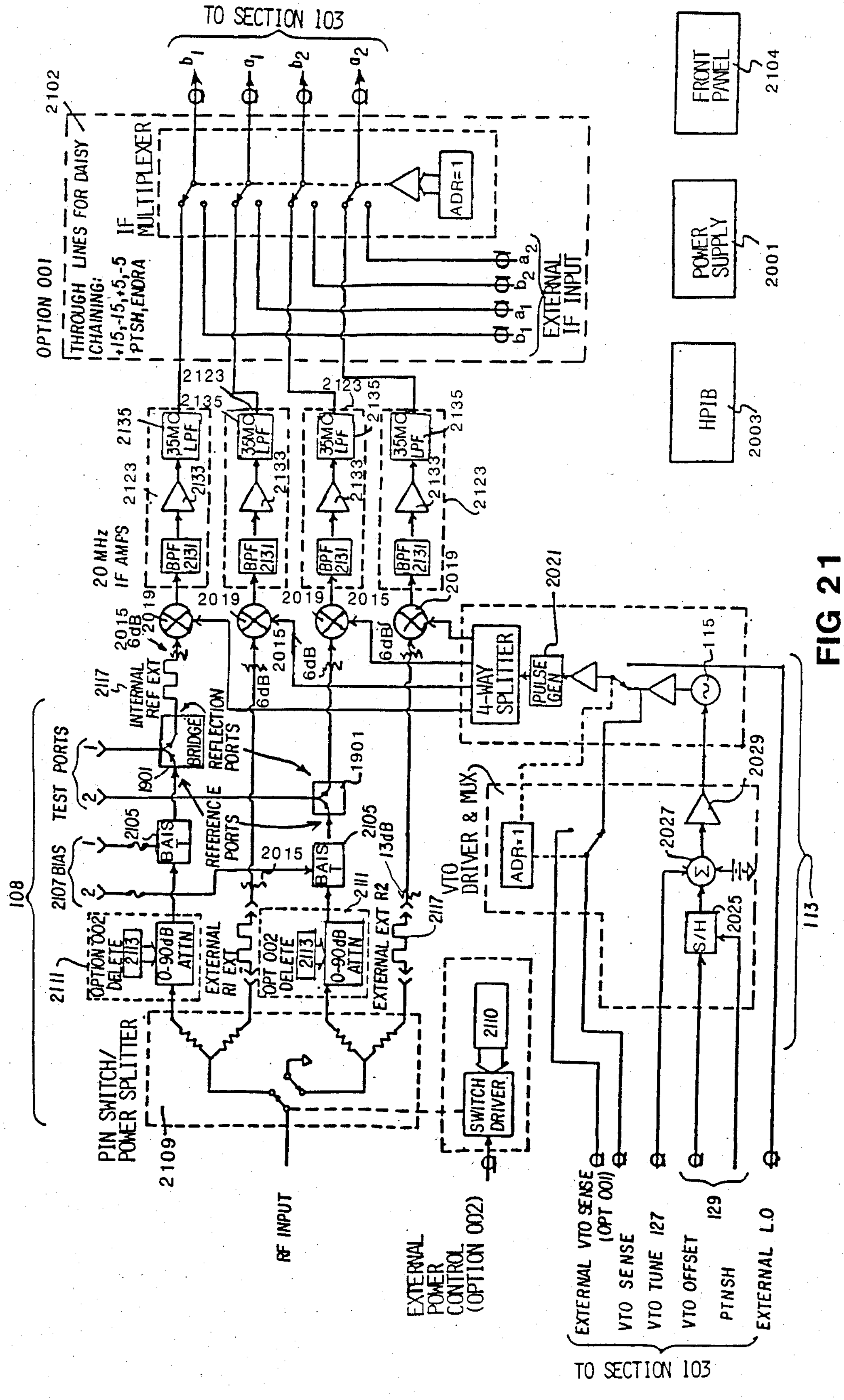
Figure 23:
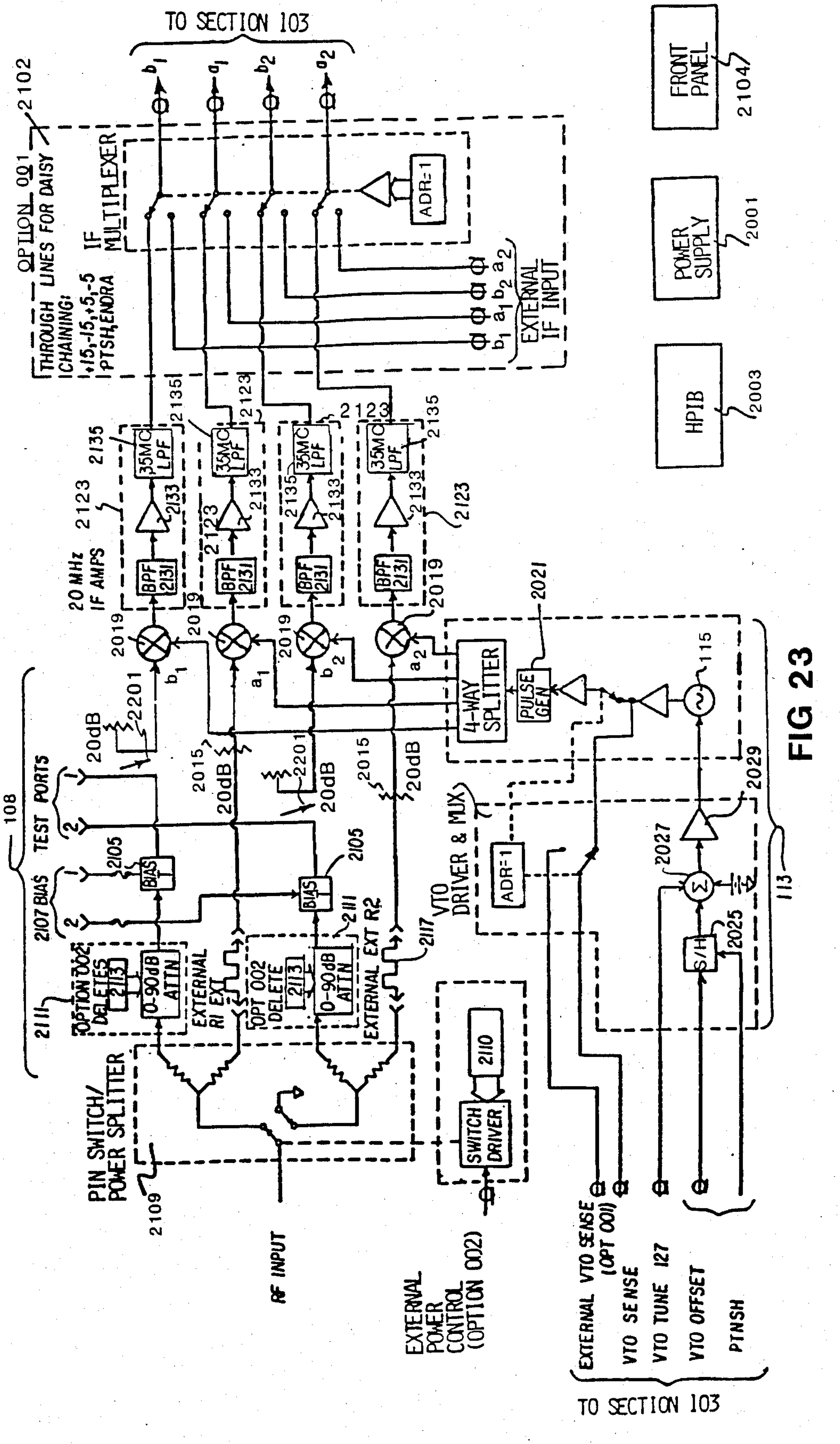

The wideband test sets 107 include a high performance RF triaxial directional bridge 1901 as described in U.S. patent Ser. No. 06/568,986 U.S. Pat. No. 4,588,970 issued May 13, 1986, and assigned to Hewlett-Packard Co. entitled "Three Section Termination For an R.F. Triaxial Directional Bridge," by Botka et al. and shown in FIGS. 19_a_ and 19_b_ coupled to each of the DUT ports 1 and 2 as shown in FIGS. 20 and 21. The directional bridge 1901 is a balanced Wheatstone bridge 1903 that extracts a floating vector signal for measurement in a single-ended detector system without disturbing the balanced configuration. Included in this high performance RF directional bridge 1901 is a combination reference load and balun 1905 which provides signal separation over the entire frequency range from 45 MHz to 26.5 GHz, and also permits the application of a DC bias as part the RF input $V_{in}$ to the DUT 111 via a conventional RF bias tee 2105. In contrast, the narrower band test sets 107 as shown in FIGS. 22 and 23 utilize a conventional directional coupler 2201 for each port to cover the frequency range of 0.5 to 18 GHz. By incorporating the signal separation devices 108 in the test sets 107, broadband vector measurements are made possible with just one connection of the DUT 111 between port 1 and port 2.

Each of the test sets 107 contains its own built in power supplies 2001, to simplify various system configurations and each of the test sets 107 has its own HP-IB interface 2003, coupled to the system bus 145 in order to provide control and identification to the main analyzer 101. Each of the test sets 107 is connected respectively to section 103 via a first IF multiplexer 2002 or 2102 to provide daisy chaining of several test sets. The first IF multiplexer 2002 and 2102 are in turn connected respectively to the a1, b1, and b2 connections for the reflection/transmission test sets in FIGS. 20 and 22, and the a1, a2, b1, and b2 connections for the S-parameter test sts in FIGS. 21 and 23. The S-parameter test sets also include: front panel indicators 2104 (i.e., lights 490 and 492 in FIG. 4) to signal the active test port, a conventional bias tee 2105 on each of the test channels to provide voltage bias 2107 needed in the testing of active devices, PIN diode transfer switches 2109 under control of the main analyzer 101 via the system bus 145 and a switch interface 2110 for switching the RF input between the ports 1 and 2, and variable attenuators 2111 under control of the main analyzer 101 via the system bus 145 and an attenuator interface 2113. Various RF pads 2015 and test and reference extensions 2117 are provided to adjust and balance the RF power levels.

Each of the test sets has a frequency converter 113 to provide the first IF conversion of the RF signals in immediate proximity to the RF input and the test ports. Within the frequency converters 113 are the VTOs 115, the first IF samplers 2019, pulse generators 2021 to drive the first IF samplers 2019, and first IF amplifiers 2023 and 2123. The first IF amplifiers 2123 also include an input band pass filter 2131, a filter amplifier 2133, and an output low pass filter 2135 to provide additional signal shaping. Each of the VTOs 115 is driven by a sample/hold circuit 2025, a summing node 2027, and a buffer amplifier 2029 coupled to the phase lock circuitry 125 in section 103.

FIGS. 24.1A through 24.33 show the detailed schematics for the circuitry associated with the test sets 107 as shown in FIGS. 20 through 23. FIGS. 24.1A through 24.4 show the front panel indicators 2104, FIGS. 24.5A through 24.8 show the first IF multiplexers 2002 and 2102, FIGS. 24.9A through 24.14 show the VTO 115 and related drivers, FIGS. 24.15A through 24.20 show the HP-IB interface 2003, FIGS. 24.21 through 24.25 show the attenuators 2111 and the PIN diode switch 2109, FIGS. 24.26A through 24.28 show the first IF samplers 2019 and the first IF amplifiers 2023 and 2123, and FIGS. 24.29 through 24.33 show the test set power supplies 2001.

Second IF

A detailed block diagram of the second IF/detector section 103 as shown in FIG. 1 is illustrated in FIGS. 25.1A through 25.6. After the signals $a_1$, $a_2$, $b_1$, and $b_2$ have been converted to the second IF frequency by the second IF mixers 138, the resulting signals $a_1'$, $a_2'$, $b_1'$, and $b_2'$ are sent to the second IF MUXs 136 as shown in FIG. 25.2. A 100 KHz calibration frequency 2501 produced by clock 119 and a ground input 2502 are also sent to the second IF MUXs 136 so that the second IF channels can be automatically calibrated for both gain and offset errors. This automatic calibration is performed by individually measuring the vector gains of the four cascaded 12 dB amplifiers that make up the amplifiers 2503 each to within .001 dB with the help of the ADC 139. Offset errors are removed by applying the ground input 2502 to the MUXs 136, turning off all gain in the amplifiers 2503, and measuring the resulting signal with the ADC 139 for each of four phase offsets (i.e., 0, 90, 180, and 270 degrees) of the synchronous detectors 131 and 133, thus rotating the measurement plane used in the synchronous detectors 131 and 133. This change in phase offset and rotation of the measurement plane in the synchronous detectors 131 and 133 is accomplished by adjusting the phase angle of the demodulating signal used for synchronous detection by means of the adjustable phase shifters 2505 as shown in FIG. 25.3.

Referring to FIGS. 26.1 through 26.6 it can be seen that the true values of X and Y can be determined from the measured values of $X_m$ and $Y_m$ from the equation shown in FIG. 26.2. First, the offsets $X_0$ and $Y_0$ are determined by grounding the input of MUX 136 as shown in FIG. 26.1, turning off all gains $G_1$, $G_2$, $G_3$, and $G_4$, and measuring $X_m$ and $Y_m$ for each of four phase offsets 0, 90, 180, and 270 degrees. $X_0$ and $Y_0$ are then calculated by the relationship shown in FIG. 26.3. H is determined by selecting the calibration signal 2501 and turning on the gain $G_4$. $X_m$ and $Y_m$ are then measured for each of the four phase offsets and the offsets $X_0$ and $Y_0$ are subtracted. H can then be calculated using the four quadrature relationships shown in FIG. 26.4 and performing a least squares error fit to each of the four measured data points as shown in FIG. 26.5, where A is the level of the calibration signal 2501, the X and Y terms correspond to $X_m - X_0$ and $Y_m - Y_0$, and Sigma is the summation of the four quadrature measurements. Determining the gain and phase of the four amplifiers $G_1$ through $G_4$ requires that each be independent of one another since $H = G_1 * G_2 * G_3 * G_4$. First with only $G_1$ on, $X_m$ and $Y_m$ are measured for each of the four phase offsets and a corrected X' and Y' are calculated using the correction coefficients previously determined during the offset correction. Using the equations shown in FIG. 26.6 the complex gain $(a+jb)$ can be calculated that will best translate the four X' and Y' data points into the quadrature relationships shown in FIG. 26.4. The measurement of $X_m$ and $Y_m$ and calculation of $a_1$ and $b_1$ as above is repeated sequentially with each of the amplifiers $G_2$, $G_3$, and $G_4$ on one at a time.

FIGS. 27.1A through 27.93 show the detailed schematics for the block diagrams shown in FIGS. 25.1A through 25.6. FIGS. 27.1A through 27.7 show the clock 119, FIGS. 27.8A through 27.12 show the 19.9 MHz local oscillator 2511, FIGS. 27.13 through 27.16 show the second IF mixer 138, FIG. 27.17A through FIG. 27.27C show the second IF amplifiers 134, FIGS. 27.29 through 27.33 and FIGS. 27.82A through 27.85 show the regulators used in section 103, FIGS. 27.34 through 27.39 show the sample/hold amplifiers 137, FIGS. 27.40A through 27.57 show the ADC 139, FIGS. 27.58A through 27.64 show the IF counter 2513, FIGS.

27.65A through 27.70 show the VTO pretune circuitry 2515, FIGS. 27.71A through 27.76 show the main phase lock circuitry 2517, FIGS. 27.77A through 27.81 show the processor interface 145 to section 103, FIGS. 27.86A through 27.89 show the front panel circuitry 159 for section 103, and FIGS. 27.90A through 27.93 show the synchronous detectors 131 and 133.

Software Signal Processing

As shown in the software listing in Appendix B and in FIG. 28, signal processing in the present invention begins at the output of the synchronous detector pair 131 and 133 which provide the real (X) and imaginary (Y) parts of the test and reference signals. As explained previously, offset, gain, and quadrature errors are corrected for both of the IF/detector chains via software which is arranged as blocks IF gain test 2803 and IF Correction 2805. The resulting test and reference data is then ratioed in block 2807 to produce the appropriate S-parameters and stored in the Raw Array 2809. If requested by the user, subsequent data taken at the same frequency are averaged together in the IF Averaging block 2811 to lower system noise and thus enhance dynamic range.

While the Raw Array 2809 is continually filled under control of the data acquisition software which will be discussed shortly, the data processing software concurrently removes data from the Raw Array 2809 and performs additional signal processing. Using a one term model (vector frequency response normalization), a three term model (one port model), and up to a twelve term error correction model (comprehensive two port) of the microwave measurement hardware, the Vector Error Correction software 2813 in conjunction with the Vector Math Processor 151 provides corrected data through application of the Error Array 2815 to the Raw Array. Further data manipulation are provided as desired by the user through Gating 2817 along with the separate Gate Array 2879, Electrical Length/Reference Plane Extension 2821, and Parameter Conversion 2822. The corrected data may also be converted from the frequency domain to the time domain using Chirp Z transforms. Windows 2825 and Window Array 2827 are used to remove the ringing in time domain due to band limited frequency domain input signals and then using the Chirp Z transforms 2823 to transform into the time domain. The data in the Data Array 2829 may be stored into memory in the Memory Array 2833 and used in vector computations with data from a second device. Comparisons of present data (D) and memory data (M) is accomplished through vector computations to provide all four mathematical functions of D*M, D/M, D+M, and D−M. Storage of the corrected and processed data D in the Data Array 2829 and the trace math data M in the Memory Array 2833 allows rapid response to the user when making format or trace math changes.

The vector data is then formatted in the Format block 2835 into magnitude, phase, group delay, or other formats as desired. Adjacent formatted points can then be combined if desired in the Smoothing block 2837. The resulting formatted data is stored into the Format Array 2839 which provides convenient access for scale and offset changes provided by the Scale block 2843. Markers are also applied as desired to the formatted data via the Marker Readout block 2841. Scaled data is stored in a Display Array 2845 in the Display Ram 217 from which the display generator 153 hardware repetitively creates a plot on the CRT 149 for a flicker-free display.

Input and output access is provided to and from all of the arrays via the HP-IB interface 157 and via tape 161 with S-parameters available from the Data Array 2829 in addition to other applicable arrays. Direct printer output for the printer 155 is made from the Format Array 2839. Direct plotter output for plotter 155 is made from the Display Array 2845. The user may also trade off the data update rate against the number of data points used by selecting resolutions from 51 to 401 points.

The software is structured as a multi-tasking system to provide a rapid data update rate by allowing data processing to take place when the data acquisition software is not busy. Overlying command and control tasks interleave data processing with data acquisition cycles to provide both two port error correction and dual channel display modes.

The software signal process discussed previously is controlled by a process structure as shown in FIG. 29. This process structure is one of the reasons the present invention can process RF data essentially in real time. For example, low priority processes such as controlling the source 109, controlling the test set 107, and formatting the display 149 are only performed when the data acquisition process is not busy. Previous systems would take data, process it completely through to the display and when the end of each sweep is reached, the processor had to wait for the hardware to reset. Instead, the present invention actually performs processing while the control functions such as resetting for a subsequent sweep or while switching S-parameter are proceeding. The Command Sources 2901 accept user commands via the front panels 159 and the HP-IB interface 157, parses and converts the commands to a common internal command token regardless of source and puts the commands into a command queue 2903. The Command Processor 2905 takes the commands from the command queue 2903 and implements them. Any one time precomputation that will later improve run time efficiency is done at this time. The Command Processor 2905 modifies the instrument state and performs one time operations, such as updating a trace after a scale change, outputting an array of data, and copying the Data Array into the Memory Array. Based on the instrument state, Control 2907 is responsible for insuring that the desired data is acquired in the specified manner and conditions. This includes control of source 109, test set 107, phase lock 125, IF multiplexers 136, ADC 139, and set up of the data acquisition and processing. Swept and stepped, alternate and chopped, single and continuous signal sweeps are implemented within Control 2907. Sweep maintenance is also managed in the Control 2907 to keep track of bandcrossings and frequency stepping. Acquisition 2909 services the ADC 139 interrupt, IF gain autoranging, ratioing, averaging and storing data into the Raw Array 2809. Processing 2911 processes data from the Raw Array 2809 until the data is displayed on the CRT 149 including vector error correction of external errors, parameter conversion, time domain processing (gating, windowing, and transformation), trace math (D*M, D/M, D+M, D−M), formatting (log, linear, and delay), and response (scale, reference value, and split screen).

The machine state variables that are used to derive control variables 2913 include: parameter descriptions such as test set set-up, receiver set-up, and ratio/non-ratio; user selections for frequency, power, sweep time, formats, scale per division, averaging information, number of points to be taken, error correction type, and time domain factors; and, internal housekeeping pointers to the data, raw, error coefficients, corrected data, formatted data, memory data, and display data arrays. Acquisition variables 2915 provide data reduced from the control variables 2913 for efficiency that are related to controlling the ADC 139 until the data is stored in the raw array. The Acquisition variables 2915 include: IF gain, receiver error, ratioing, averaging, and current pointer position in the raw array. The Processing variables 2917 provide data reduced from the group control variables for efficiency that are related to controlling the processing of data from the raw array through the display. The Processing variables 2917 include: current position pointers for the arrays, error correction type, time domain information, trace math, format, and response. The Signals 2919 provide synchronization between programs that otherwise function independently of one another.

Several of the software functions previously mentioned will now be discussed. In stepped sweep, Averaging 2811 computes the linear average of a block of data points taken while the frequency is held fixed. This is repeated for each frequency in the stepped sweep. In swept frequency sweeps Averaging 2811 computes the weighted exponential running average of the synchronous incoming data, and therefore decreases the input noise bandwidth, thereby reducing noise and extending dynamic range. Each time Averaging is restarted the averaging starts with a small averaging factor, increasing it every one to eight sweeps to the selected averaging factor, thus allowing fast convergence to the final value. Smoothing 2837 on the other hand operates on processed data by providing a linear moving average of adjacent data points as a percentage of the display. The result is like a video filter, reducing peak to peak noise such as on a baseline trace, but not improving the dynamic range of the signal. In addition, smoothing in the present invention has a novel use for group delay measurements. Group delay (i.e. $t_g$=change in phase in degrees/(360 degrees * change in frequency in Hertz) is a differential measurement and unfortunately noise is therefore emphasized. Classically the frequency over which the group delay measurement is made, called aperture, is therefore increased to provide a more useful group delay measurement. In the present invention, this same result is achieved by smoothing the processed group delay data. Thus, smoothing (i.e., averaging of adjacent data points) of group delay data achieves the same effect as is achieved by utilizing a classical variable group delay aperture. This also allows a phase change greater than 180 degrees across the aperture when smoothing is applied to 3 or more adjacent data points.

The RF vector error correction in the present invention also is adapted to speed and facilitate calibration. Measurements are made on a series of calibration standards and then the Raw Array data 2809 is stored in the Error Array 2815. Many different types of calibration standards can be used including the open-load-short approach as used in coaxial connectors, offset-short-load approach as used in waveguide technologies, and multiple offset shorts as used in microstrip devices. The calibration standards need not be used in any particular order since all data is stored digitally, and the display format which is updated in real time even during calibration, can be changed at any time without effecting the calibration itself. IF Averaging can also be used during calibration since Averaging operates on the Raw Array 2809. Multiple fixed and sliding loads as desired can also be utilized. Since the correction data sets themselves are stored in memory, several correction data sets can be stored in the machine at one time (e.g., different correction data sets can be stored for different S-parameters and correction data sets over different frequency ranges can be stored for the same S-parameter). Because of the trace math 2831 and the memory array 2833, both corrected and uncorrected traces can be viewed and used at the same time.

Gating 2817 is used to look at certain portions of the display as specified by the user. Gating can be used either in the time or frequency domains and provides a gate through which the data can be viewed. This gate is selected by setting a center time and a span (or a start time and a stop time) about which to view the displayed data. When gates are desired, rather than removing time domain data outside of the gate from the data being used to calculate the displayed data, in the present invention the frequency domain shape of the gate is calculated and convolved directly with the incoming frequency data as a frequency operation. The result is that no data is eliminated from within the gated region, and when the frequency to time transformation is performed there is no problem with undersampling of the bandlimited time data. The result is that the gated time domain data maintains its full spectrum of information and can be transformed back into the frequency domain if so desired, without loss of information. Thus, even though the user can perform the setting of gates while viewing the time domain data, the actual gating is performed in the frequency domain by means of convolution.

Electrical delay and reference plane extension 2821 are used, respectively, to change the electrical delay, for example in order to measure the electrical delay of an air line or to move the measurement plane used in S-parameter measurements to other than the physical plane of the test set ports 1 or 2. Although both electrical delay and reference plane extension are both defined in units of time (i.e., plus or minus up to 100 seconds) and both use the same mathematical formula, electrical delay varies per parameter while reference plane extension varies per port. An equivalent readout in distance is made along with the electrical delay.

Time Domain Processing

The usual microwave DUT 111 consists of multiple elements with transmission line sections in between. When tested using conventional frequency domain techniques, a composite response is generated. The specific discontinuities cannot be examined individually. In the time domain, the present invention takes its normal frequency domain data and applies for the first time the little known Chirp Z transform, as described by Rabiner and Gold in "Theory and Application of Digital Signal Processing", pages 393–398, 1975, to convert from the frequency to the time domain. Prior time transform methods have usually used a conventional fast Fourier technique which required the application of harmonically related frequency inputs and in which the entire frequency window is transformed into the entire time window. For example, when a 10 nanosecond wide time window is viewed with 101 data points, each data point is separated by only 0.1 nanoseconds and any attempt to view only a portion of the data in the 10 nanosecond wide time window suffers from the availability of only a few data points. This can be overcome by taking more data points, but at a drastic reduction in speed. Other workers have instead used the classical complete Fourier series expansion of the frequency data to achieve an arbitrary number of viewable data points, but such a method is extremely slow, requiring several minutes to do the necessary calculations. As with the complete Fourier series expansion, the Chirp Z transform also provides an arbitrary number of data points for viewing in any given time window, but this transform can be calculated in less than one second.

The present system provides two time domain operating modes. The first is called low pass and is used to simulate the traditional time domain reflectometer (TDR) but using the Chirp Z transform. Like the traditional TDR, low pass requires harmonically related frequency data from DC, which is extrapolated from the lowest available frequency data point to the maximum frequency available. Low pass provides the fastest rise time and best time domain resolution and may be used with either step or impulse excitation. By taking the integral of the low pass impulse response, the response of stimulating the DUT with a step is generated. The second time domain operating mode is called band pass and may be used in any frequency span without the need to include DC. Because of the use of the Chirp Z transform, band pass mode does not require harmonically related frequency data, but only requires excitation frequency steps of equal size (e.g., 10 MHz steps across a span of 1 to 2 GHz). Band pass mode is used for either reflection or transmission measurements, typically on bandlimited devices and only impulse excitation may be used.

Figure 30A:
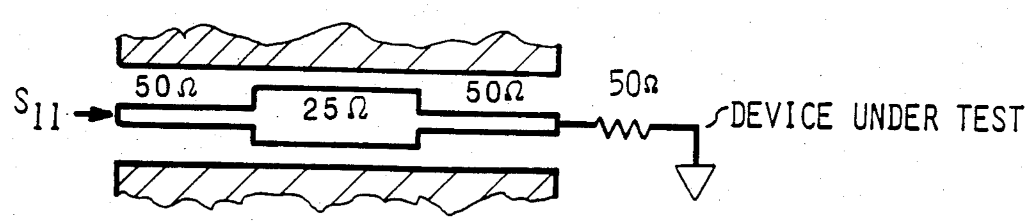
Figure 30B:
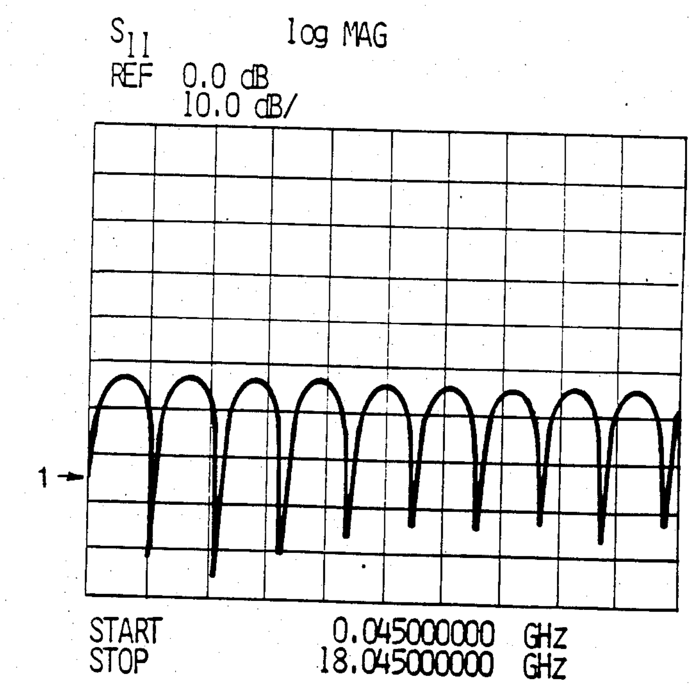
Figure 30C:
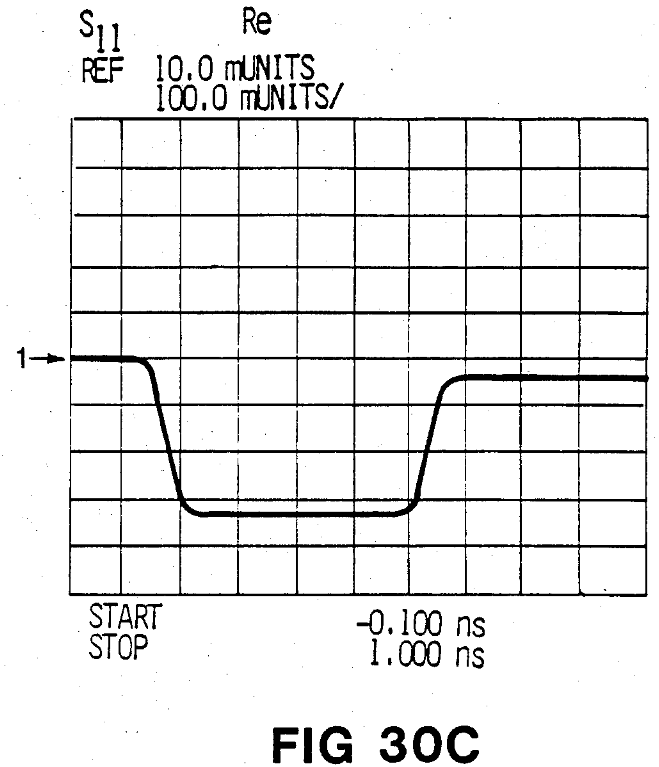
Figure 30D:
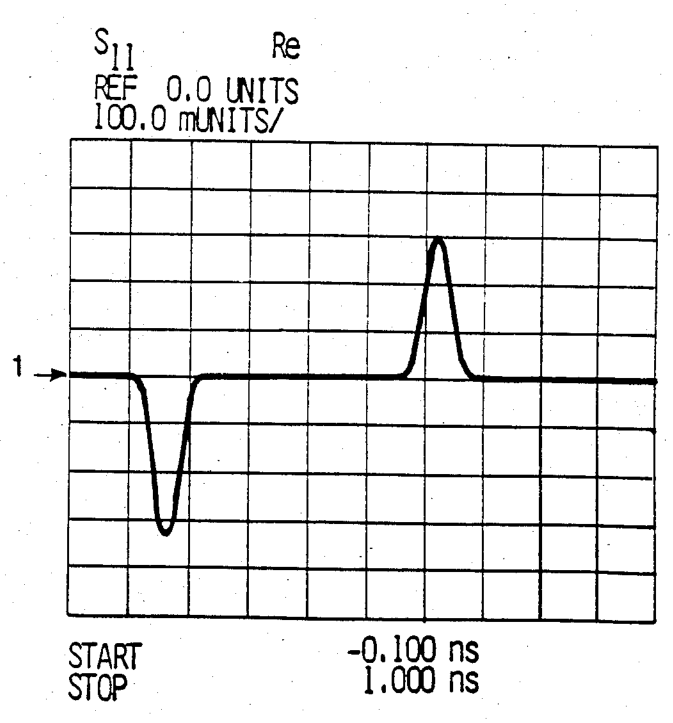
Figure 30E:
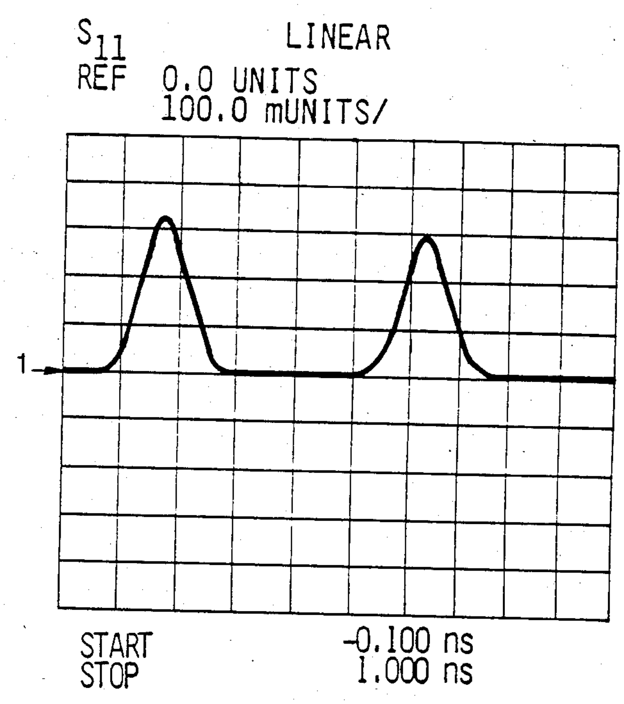

An illustration of the low pass and band pass modes and the excitations used is shown in FIGS. 30*a*–30*e*. The frequency domain response for the DUT as shown in FIG. 30*a* is shown in FIG. 30*b*, while a time domain low pass mode step excitation is shown in FIG. 30*c*, a time domain low pass mode impulse excitation is shown in FIG. 30*d*, and a time domain band pass mode impulse excitation is shown in FIG. 30*e*. Since there is an upper frequency limit to the data, and at that limit, an abrupt transition occurs from data to no data, time domain responses are subject to ringing and overshoot called the Gibbs phenomena. Ringing interferes with a user's ability to distinguish between two closely spaced real device responses and also creates confusion in separating actual and data reduction produced responses. The present invention provides a window capability (not to be confused with gating) to modify and filter the frequency domain data to reduce this ringing in a controlled way as shown in FIGS. 31*a*–31*d*. A Kaiser-Bessel window with three different levels of windowing, for three levels 0, 6, and 13 of the Kaiser-Bessel parameter, may be used to attenuate and roll off the higher frequency data, thereby trading resolution for ringing reduction, since the best rise time occurs at minimum (i.e., zero) windowing and the best sidelobe suppression occurs at maximum windowing. The minimum windowing provides sidelobes of −14 dB for minimum inpulse stimulus width, the normal amount of windowing provides side lobes of −50 dB with an increase of a factor of two in the width of the primary response, while the maximum windowing provides side lobes of −90 dB with an increase of a factor of four in the width of the primary response.

Figure 32A:
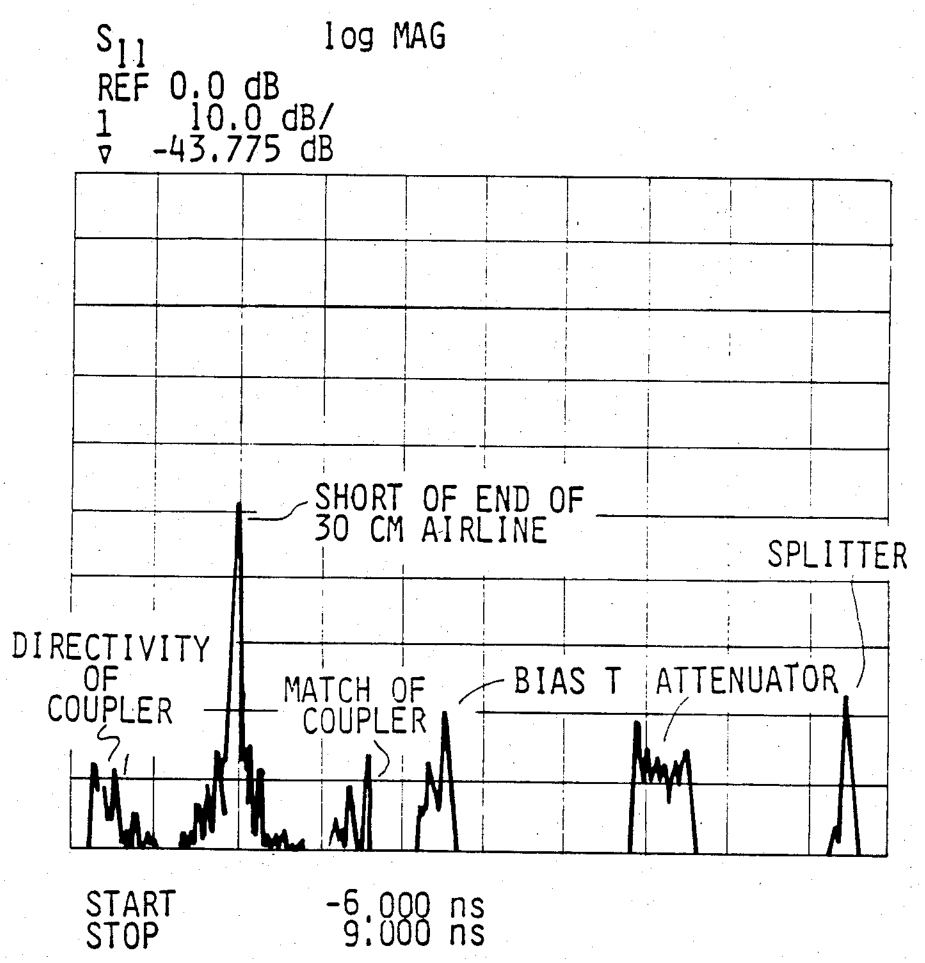
Figure 32B:
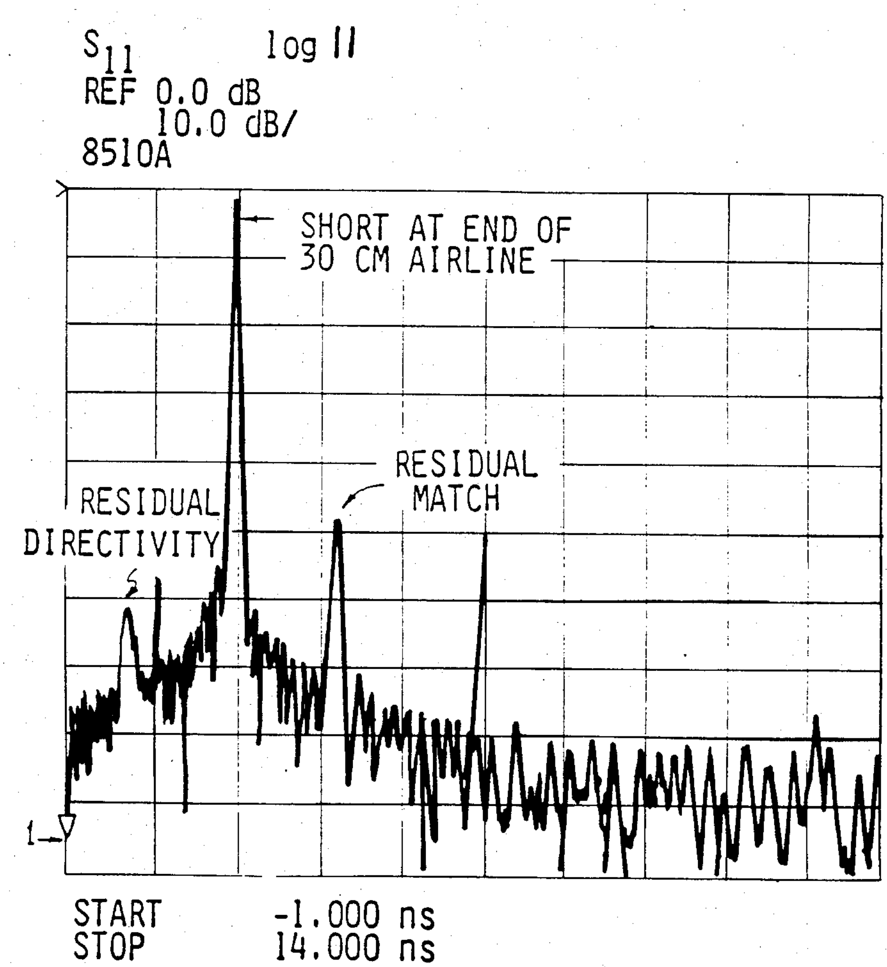

The ability to make vector error corrected measurements has a significant effect on the quality of the time domain presentation. An example of this is shown in FIGS. 32*a* and 32*b*, contrasting time domain measurements of a short at the end of thirty centimeters of airline without and with correction, respectively. Equivalent source match of the coupler is increased to 40 dB and equivalent coupler directivity is raised to well over 50 dB.

Figure 33A:
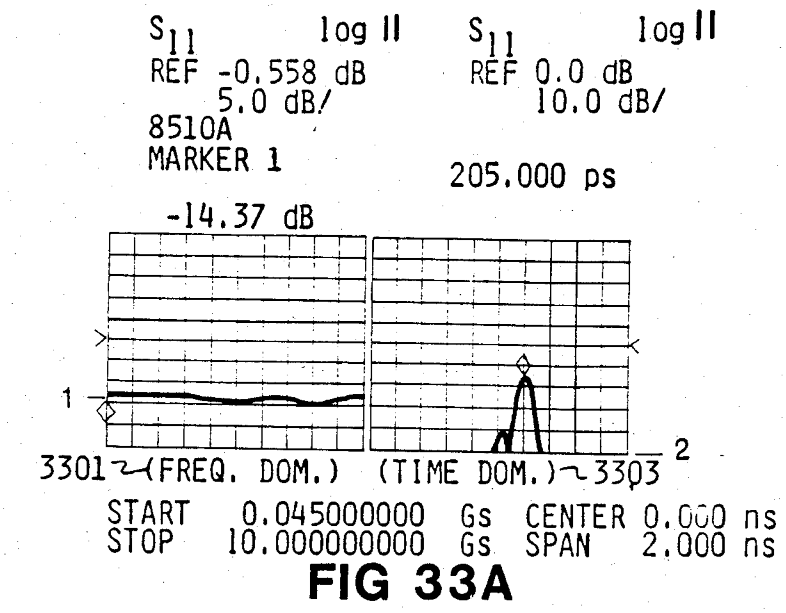
Figure 33C:
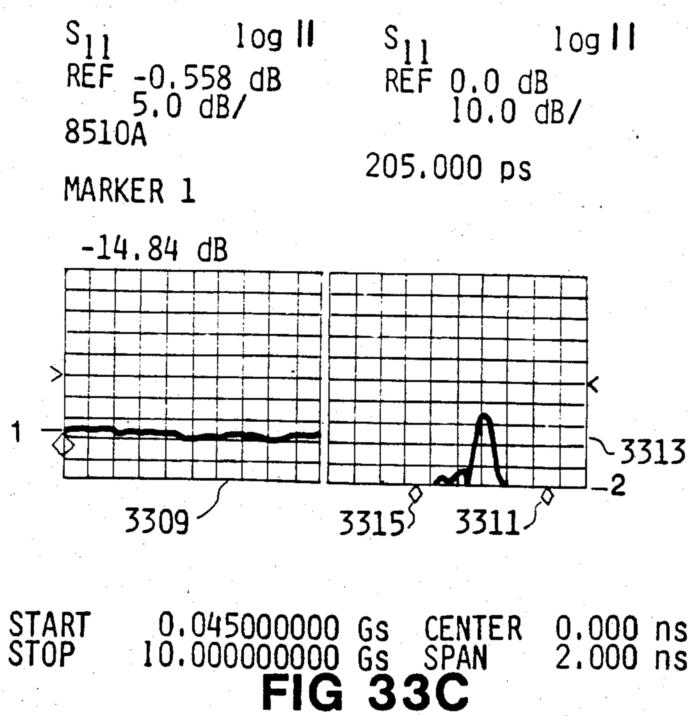
Figure 33B:
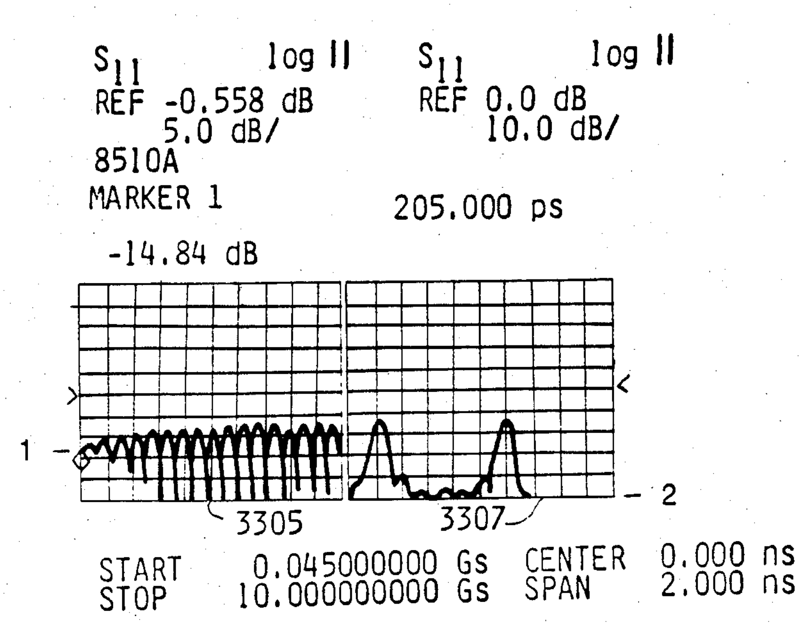
Figure 33D:
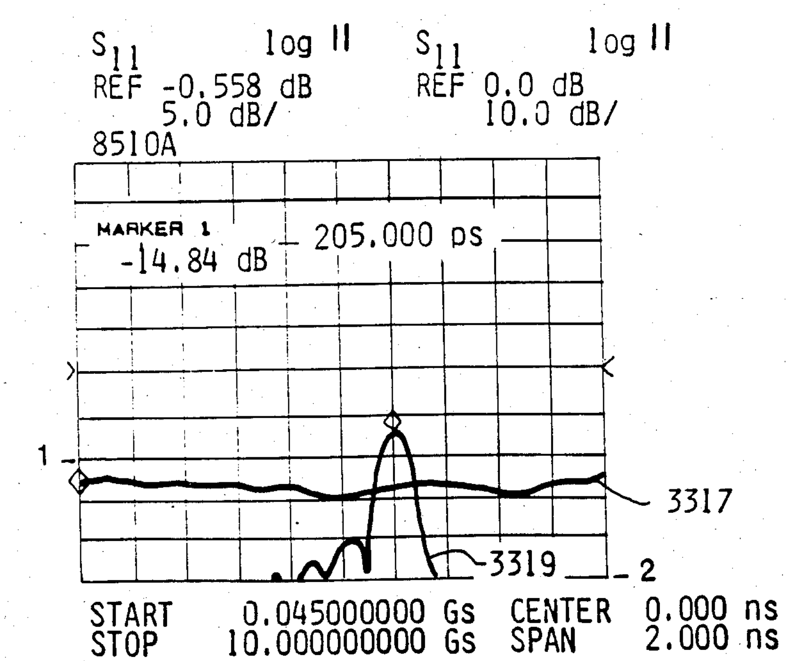

As mentioned previously, gating is a further powerful feature of the time domain capability in the present invention and is illustrated in FIGS. 33*a*–33*d*. FIG. 33*a* shows a split screen view of the frequency and time display 3301 and 3303 with gating for a 1.5 standing wave ratio (SWR) load. FIG. 33*b* shows the effect of adding in a reactive mismatch of 12 dB creating a large ripple effect in the frequency domain 3305. FIG. 33*c* shows the effect of gating around the load, highlighted with markers 3311 and 3315. Note the high degree of comparison between the frequency domain data 3309 in FIG. 33*c* with the data 3301 in FIG. 33*a*. FIG. 33*d* shows this same data from FIG. 33*c* with the traces 3309 and 3313 overlaid as traces 3317 and 3319 respectively.

APPENDIX A

SOFTKEY MENUS
AND
RELATED SOFTWARE CONSTANTS

```
>>>  TAPE_MENU  <<<

     ==========

     "DIRECTORY"

     cmd_directory

     ==========

     "RECORD"

     ==========

     "RESTORE"

     ==========
```

```
"DELETE"

==========

"UN-DELETE"

==========

==========

==========

"INITIALIZE"
"TAPE"

==========

>>>  INIT_TAPE_MENU  <<<

==========

"INIT TAPE?"
"YES"

==========

"NO"

==========

==========

==========

==========

==========

==========

==========

>>>  DIRECTORY_MENU  <<<

==========

"RESTORE"
"DISPLAY"

cmd_directory_off

==========

==========

==========

"NEXT"
"PAGE"

cmd_next_page

==========

"PREVIOUS"
"PAGE"

cmd_prev_page

==========

==========

"FIRST"
"PAGE"

cmd_first_page

==========

"LAST"
"PAGE"

cmd_last_page

==========
```

```
>>> DATA2_MENU <<<

==========

"DATA"

==========

"FORMATTED"
"DATA"

==========

"RAW"
"DATA"

==========

==========

"USER"
"DISPLAY"

==========

==========

==========

"MACHINE"
"DUMP"

cmd_machine_dump

==========

>>> DATA1_MENU <<<

==========

"INSTRUMENT"
"STATE"

==========

"INSTRUMENT"
"STATES 1-5"

==========
```

```
"MEMORY"
"TRACE"

==========

"MEMORY"
"TRACES 1-4"

==========

"CAL SET"

==========

"CAL SETS"
"1-6"

==========

"CAL KIT"

==========

"MORE"

cmd_more

==========

>>> FILE_MENU <<<

==========

"DATA TYPE "
"* FILE 1"

cmd_file_1

==========

" "
"* FILE 2"

cmd_file_2

==========

" "
"* FILE 3"

==========

" "
"* FILE 4"

==========
```

```
" "
"* FILE 5"
==========
" "
"* FILE 6"
==========
" "
"* FILE 7"
==========
" "
"* FILE 8"
cmd_file8
==========
>>>  REG_MENU  <<<

==========
"DATA TYPE "
"* 1 "
cmd_reg_1
==========
" "
"* 2 "
cmd_reg_2
==========
" "
"* 3 "
cmd_reg_3
==========
" "
"* 4 "
cmd_reg_4
==========
"(POWER UP)"
"* 5 "
cmd_reg_5
==========
" "
"* 6 "
cmd_reg_6
==========
" "
"* 7 "
cmd_reg_7
==========
" "
"LAST STATE"
cmd_reg_8
==========
>>>  RESPONSE_MENU  <<<

==========
"ELECTRICAL"+sk_bracket_2
"DELAY"
cmd_elect_delay
==========
"AUTO DELAY"
cmd_auto_delay
==========
"PHASE"
"OFFSET"
cmd_phase_offset
==========
"MAGNITUDE"
"OFFSET"
==========
"AVERAGING"+sk_bracket_2
"ON/RESTART"
```

```
cmd_if_avg_on

==========

"OFF"

cmd_if_avg_off

==========

"SMOOTHING"+sk_bracket_2
"ON "

cmd_smoothing_on

==========

"OFF"

cmd_smoothing_off

==========

>>>  IF_GAIN_MENU  <<<


==========

"TEST"+sk_bracket_2
"AMP. GAIN"

cmd_if_test_port

==========

"REFERENCE"
"AMP. GAIN"

cmd_if_ref_port

==========



==========



==========



==========



==========
```

```
==========



==========

>>>  IF_GAIN_MENU2  <<<

==========

"GAIN"+sk_bracket_6
"0 (MIN.)"

cmd_if_no_gain

==========

" 1 "

cmd_if_12db_gain

==========

" 2 "

cmd_if_24db_gain

==========

" 3 "

cmd_if_36db_gain

==========

"4 (MAX.)"

cmd_if_48db_gain

==========

"AUTO"

cmd_if_gain_auto

==========



==========



==========
```

```
>>>  STIMULUS_MENU  <<<

==========

"POWER"
"MENU"

cmd_power_menu

==========

"SWEEP"
"TIME"

cmd_sweep_time

==========

"NUMBER of"
"POINTS"

cmd_n_points_menu

==========


==========

"SINGLE"+sk_bracket_3
"POINT"

cmd_cw

==========

"RAMP"

cmd_swept

==========

"STEP"

cmd_stepped

==========

"MORE"

cmd_more

==========
```

```
>>>  N_POINTS_MENU  <<<

==========

"POINTS:"+sk_bracket_4
"51 "

cmd_51_points

==========

"101"

cmd_101_points

==========

"201"

cmd_201_points

==========

"401"

cmd_401_points

==========


==========


==========


==========


==========
>>>  POWER_MENU  <<<

==========

"POWER"

cmd_source_power
```

```
==========

==========

"SLOPE"+sk_bracket_2
"ON "

cmd_power_slope

==========

"OFF"

cmd_power_slope_off

==========

==========

"ATTENUATOR"+sk_bracket_2
"PORT 1"

cmd_atten_port1

==========

"PORT 2"

cmd_atten_port2

==========

==========

>>>  STIMULUS2_MENU  <<<

==========

sk_bracket_4
half_vt+"HOLD"

cmd_hold

==========

"SINGLE"

cmd_single

==========

"NUMBER of"
"GROUPS"

cmd_n_groups_kpd

==========

"CONTINUAL"

cmd_continuous

==========

"STIMULUS"
"OFFSET"

==========

==========

sk_bracket_2
half_vt+"Ch1 = Ch2"

cmd_couple_stimulus

==========

"Ch1 "+163+" Ch2"

cmd_uncouple_stimulus

==========

>>>  DEVICE_READY_MENU  <<<

==========

==========

"PRESS TO"
"CONTINUE"

==========

==========

==========
```

```
==========

==========

==========

==========

>>>  PARAM_MENU  <<<

==========

"a"+177+sk_bracket_4

cmd_user1

==========

"b"+178

cmd_user2

==========

"a"+178

cmd_user3

==========

"b"+177

cmd_user4

==========

==========

==========

"REDEFINE"
"PARAMETER"

cmd_redefine_param

==========
```

```
==========

>>>  REDEF_MENU  <<<

==========

"REDEFINE"+sk_bracket_6
"DRIVE"

==========

"PHASE LOCK"

==========

"NUMERATOR"

==========

"DENOMI-"
"NATOR"

==========

"CONVERSION"

==========

"PARAMETER"
"LABEL"

cmd_label_parameter

==========

==========

"REDEFINE"
"DONE"

cmd_redefine_done

==========

>>>  REDEF_DRIVE_MENU  <<<

==========

"DRIVE"+sk_bracket_3
"PORT 1"

==========

"PORT 2"
```

```
==========

"NONE"

==========

==========

==========

==========

==========

==========

>>>   RELEF_NUM_MENU   <<<

==========

"NUMERATOR"+sk_bracket_5
"b1  "

==========

"b2  "

==========

"a1  "

==========

"a2  "

==========

"SERVICE"
"SELECTIONS"

==========

==========
```

```
==========

==========

>>>   RELEF_NUM2_MENU   <<<

==========

"100 KHZ"+sk_bracket_8
"TEST CAL"

==========

"100 KHZ"
"REF CAL"

==========

"DETECTOR"
"GROUND"

==========

"ADC GROUND"

==========

"VCAL"

==========

"VREF"

==========

"TEMP. 1"

==========

"TEMP. 2"

==========

>>>   RELEF_DENOM_MENU   <<<

==========

"DENOM."+sk_bracket_4
"a1  "

==========
```

```
"a2 "

==========

"b1 "

==========

"NC RATIO"

==========

==========

==========

==========

==========

>>> REDEF_CONV_MENU <<<

==========

"CONVERT"+sk_bracket_4
"to   S"

==========

"to 1/S"

==========

"to   Z"

==========

"to   Y"

==========

==========

==========
```

```
==========

==========

>>> FORMAT_MENU <<<

==========

sk_bracket_8
half_vt+"SWR"

cmd_swr

==========

"LINEAR"
"MAGNITUDE"

cmd_linear_mag

==========

"POLAR w/"
"LIN MKR"

cmd_linear_polar

==========

"POLAR w/"
"LOG MKR"

cmd_log_polar

==========

"POLAR w/"
"Re/Im MKR"

cmd_imag_vs_real

==========

"INVERTED"
"SMITH"

cmd_y_smith

==========

"IMAGINARY"

cmd_imaginary
```

```
==========

"REAL"

cmd_real

==========

>>>   DOMAIN_MENU   <<<

==========

sk_bracket_4
half_vt+"FREQUENCY"

cmd_freq_domain

==========

"TIME"
"LOW PASS"

cmd_low_pass_request

==========

"TIME"
"BAND PASS"

cmd_time_domain

==========

"AUX. VOLT"
"OUTPUT"

cmd_aux_domain

==========

==========

"SPECIFY"+sk_bracket_2
"TIME"

cmd_setup_time_domain

==========

"GATE"

cmd_setup_gate_domain

==========
```

```
==========

>>>   LOW_PASS_FREQ   <<<

==========

==========

"SET FREQ."
"(LOW PASS)"

cmd_tdr_domain

==========

==========

==========

==========

==========

==========

==========

>>>   TIME_SETUP_MENU   <<<

==========

"LOW PASS:"+sk_bracket_2
"STEP"

cmd_tdr_step

==========

"IMPULSE"

cmd_tdr_impulse
```

```
==========

==========

==========
"WINDOW:"+sk_bracket_3
"MINIMUM"
cmd_min_time_window
==========
"NORMAL"
cmd_normal_time_window
==========
"MAXIMUM"
cmd_max_time_window
==========

==========
>>>  GATE_SETUP_MENU  <<<

==========
"GATE"+sk_bracket_2
"ON"
cmd_gate_on
==========
"OFF"
cmd_gate_off
==========
"GATE"+sk_bracket_4
"START"
cmd_gate_start
==========
"STOP"
cmd_gate_stop
==========
"CENTER"
cmd_gate_center
==========
"SPAN"
cmd_gate_span
==========
"GATE SHAPE"
==========

==========
>>>  GATE_SHAPE_MENU  <<<

==========

==========

==========

==========

==========

==========
"GATE SHAPE"+sk_bracket_3
"MINIMUM"
cmd_min_gate_window
==========
```

```
"NORMAL"

cmd_normal_gate_window

==========

"MAXIMUM"

cmd_max_gate_window

==========

>>>  CAL_MENU  <<<


==========

"CORRECTION"+sk_bracket_3
"ON"

cmd_correction_on

==========

"OFF"

cmd_correction_off

==========

"SELECT"
"CAL SET"

cmd_correction_default

==========

"CALIBRATE"+sk_bracket_3
"( KIT #1 )"

cmd_cal_kit_1

==========

"CALIBRATE"
"( KIT #2 )"

cmd_cal_kit_2

==========

"RESUME CAL"
"SEQUENCE"

==========
```

```
==========

"MORE"

cmd_more

==========

>>>  MORE_CAL  <<<


==========

"REFERENCE"
"PLANES"

cmd_ref_plane_menu

==========

"SET Z"+176

==========

"CAL SWEEP"
"VOLTAGE"

==========



==========

"MODIFY KIT"
"( KIT #1 )"

cmd_modify_cal_kit_1

==========

"MODIFY KIT"
"( KIT #2 )"

cmd_modify_cal_kit_2

==========



==========

"DELETE A"
"CAL SET"

cmd_delete_cal

==========
```

```
>>>   REF_PLANE_MENU   <<<

==========

==========

==========

sk_bracket_2
half_vt+"PLANE 1"

cmd_ref_plane_1

==========

"PLANE 2"

cmd_ref_plane_2

==========

==========

==========

==========

==========

>>>   CAL_TYPE_MENU   <<<

==========

==========

"SET FREQ."
"(LOW PASS)"

cmd_freq_setup

==========

==========

"FREQUENCY"+sk_bracket_5
"RESPONSE"

cmd_response_type

==========

"S"+177+177+"   "
"1-PORT"

cmd_1_port_1_type

==========

"S"+178+178+"   "
"1-PORT"

cmd_1_port_2_type

==========

"SIMPLE"
"2-PORT"

cmd_simple_2_port_type

==========

"FULL"
"2-PORT"

cmd_2_port_type

==========

>>>   PORT_ONE_REFL   <<<

==========

"S"+177+177+"   "+sk_bracket_3
"PORT1 STD1"

cmd_port1_std1

==========

"PORT1 STD2"

cmd_port1_std2

==========

"PORT1 STD3"

cmd_port1_std3
```

```
==========

==========

==========

==========

==========

"SAVE"
"S"+177+177+" CAL"

cmd_done_1_port_on_1

==========
>>>  PORT_TWO_REFL  <<<

==========

"S"+178+178+"  "+sk_bracket_3
"PORT2 STD1"

cmd_port2_std1

==========

"PORT2 STD2"

cmd_port2_std2

==========

"PORT2 STD3"

cmd_port2_std3

==========

==========

==========
```

```
==========

==========

"SAVE"
"S"+178+178+" CAL"

cmd_done_1_port_on_2

==========
>>>  CAL_MENU2  <<<

==========

sk_bracket_3
half_vt+"REFLECT'N"

cmd_cal_reflection

==========

"TRANS-"
"MISSION"

cmd_cal_thru

==========

"ISOLATION"

cmd_cal_isolation

==========

==========

==========

==========

==========

"SAVE"
"2-PORT CAL"

cmd_done_2_port

==========
```

```
>>>   REFLECTION_MENU   <<<

==========

"S"+177+177+"
   "+SK_bracket_3
"PORT1 STD1"

cmd_port1_std1

==========

"PORT1 STD2"

cmd_port1_std2

==========

"PORT1 STD3"

cmd_port1_std3

==========

"S"+178+178+"
   "+SK_bracket_3
"PORT2 STD1"

cmd_port2_std1

==========

"PORT2 STD2"

cmd_port2_std2

==========

"PORT2 STD3"

cmd_port2_std3

==========



==========

"REFLECT'N"
"DONE"

cmd_done_reflection

==========
```

```
>>>   TRANSMISSION_MENU   <<<

==========



==========

"FWD.TRANS."
"FWD_TRANS_"

cmd_fwd_transmission

==========

"FWD.MATCH"
"FWD_MATCH_"

cmd_fwd_match

==========

"REV.TRANS."
"REV_TRANS_"

cmd_rev_transmission

==========

"REV.MATCH"
"REV_MATCH_"

cmd_rev_match

==========



==========



==========

"TRANS."
"DONE"

cmd_done_trans

==========
```

```
>>>  ISOLATION_MENU  <<<

==========

==========

==========

"OMIT"
"ISOLATION"

cmd_omit_isolation

==========

==========

"FWD ISOL'N"
"FWD_ISOLN_"

cmd_fwd_isolation

==========

"REV ISOL'N"
"REV_ISOLN_"

cmd_rev_isolation

==========

==========

"ISOLATION"
"DONE"

cmd_done_isolation

==========
```

```
>>>  CAL_MENU3  <<<

==========

sk_bracket_3
half_vt+"REFLECT'N"

cmd_cal_simple_reflection

==========

"TRANS-"
"MISSION"

cmd_cal_simple_thru

==========

"ISOLATION"

cmd_cal_simple_isolation

==========

==========

==========

==========

==========

"SAVE"
"2-PORT CAL"

cmd_done_2_port

==========
```

```
>>>   SIMPLE_REFLECTION_MENU  <<<

==========

"S"+177+177+sk_bracket_3
"PORT1 STD1"

cmd_port1_std1

==========

"PORT1 STD2"

cmd_port1_std2

==========

"PORT1 STD3"

cmd_port1_std3

==========

==========

==========

==========

==========

"REFLECT'N"
"DONE"

cmd_done_simple_reflection

==========
```

```
>>> SIMPLE_TRANSMISSION_MENU<<<

==========

==========

"FWD.TRANS."
"FWD_TRANS_"

cmd_fwd_transmission

==========

"FWD.MATCH"
"FWD_MATCH_"

cmd_fwd_match

==========

==========

==========

==========

==========

"TRANS."
"DONE"

cmd_done_trans

==========
```

```
>>>  SIMPLE_ISOLATION_MENU  <<<

==========

==========

==========

"OMIT"
"ISOLATION"

cmd_omit_isolation

==========

==========

"FWD ISOL'N"
"FWD_ISOLN_"

cmd_fwd_isolation

==========

==========

==========

"ISOLATION"
"DONE"

cmd_done_isolation

==========
>>>  STD_CLASS_MENU  <<<

==========

"STANDARD 1"

cmd_class_std1

==========

"STANDARD 2"

cmd_class_std2

==========

"STANDARD 3"

cmd_class_std3

==========

"STANDARD 4"

cmd_class_std4

==========

"STANDARD 5"

cmd_class_std5

==========

"STANDARD 6"

cmd_class_std6

==========

"STANDARD 7"

cmd_class_std7

==========

"STANDARDS "
"DONE"

cmd_class_done

==========
>>>  SLIDING_LOAD_MENU  <<<

==========

"SLIDE IS"
"SET"

==========

==========

==========
```

```
==========


==========


==========


==========

"SLIDING"
"LOAD DONE"

==========

>>>   MODIFY_CAL_KIT_MENU   <<<


==========

"SELECT"
"STANDARD"

cmd_select_std

==========


==========

"SPECIFY"
"STD CLASS"

cmd_specify_classes

==========

"LABEL"
"STD CLASS"

cmd_label_classes

==========


==========

"LABEL"
"CAL KIT"

cmd_label_cal_kit
```

```
==========


==========

"DONE"
"(DEFINED)"

cmd_cal_kit_defined

==========

>>>   MODIFY_STDS_MENU   <<<


==========

"STD TYPE"+sk_bracket_5
"OPEN"

cmd_define_open

==========

"SHORT"

cmd_define_short

==========

"LOAD"

cmd_define_load

==========

"DELAY/"
"THRU"

cmd_define_air_line

==========

"ARBITRARY"
"IMPEDANCE"

cmd_define_z

==========


==========


==========


==========
```

```
>>>   DEFINE_OPEN_MENU   <<<

==========
" C"+176+" "
cmd_open_c0
==========
" C"+177+" "
cmd_open_c1
==========
" C"+178+" "
cmd_open_c2
==========

==========

==========
"SPECIFY"
"OFFSET"
cmd_specify_offset
==========
"LABEL STD"
cmd_label_cal_std
==========
"DONE"
"(DEFINED)"
cmd_cal_std_defined
==========
>>>   DEFINE_SHORT_MENU   <<<

==========
==========

==========

==========

==========

==========
"SPECIFY"
"OFFSET"
cmd_specify_offset
==========
"LABEL STD"
cmd_label_cal_std
==========
"DONE"
"(DEFINED)"
cmd_cal_std_defined
==========
>>>   DEFINE_LOAD_MENU   <<<

==========

==========

==========

==========
sk_bracket_2
half_vt+"FIXED"
```

```
cmd_fixed_load

==========

"SLIDING"

cmd_sliding_load

==========

"SPECIFY"
"OFFSET"

cmd_specify_offset

==========

"LABEL STD"

cmd_label_cal_std

==========

"DONE"
"(DEFINED)"

cmd_cal_std_defined

==========

>>>  SPECIFY_Z_MENU  <<<


==========

" C"+176+" "

cmd_open_c0

==========

" C"+177+" "

cmd_open_c1

==========

" C"+178+" "

cmd_open_c2

==========

sk_bracket_2
half_vt+"FIXED"

cmd_fixed_load

==========

"SLIDING"

cmd_sliding_load

==========

"SPECIFY"
"OFFSET"

cmd_specify_offset

==========

"LABEL STD"

cmd_label_cal_std

==========

"DONE"
"(DEFINED)"

cmd_cal_std_defined

==========

>>>  SPECIFY_OFFSET_MENU  <<<


==========

"OFFSET"
"DELAY"

cmd_offset_delay

==========

"OFFSET"
"LOSS"

cmd_offset_loss

==========

"OFFSET"
" Z"+176+" "

cmd_offset_z0

==========

"LOWER"
"FREQUENCY"
```

```
cmd_offset_min_f

==========

"UPPER"
"FREQUENCY"

cmd_offset_max_f

==========

sk_bracket_2
half_vt+"COAX"

cmd_coax

==========

"WAVEGUIDE"

cmd_waveguide

==========

"DONE"
"(DEFINED)"

==========

>>>  SPECIFY_CLASS_MENU  <<<


==========

"S"+177+177+":  "
"1st STD"

cmd_port1_1st_std

==========

"2nd STD"

cmd_port1_2nd_std

==========

"3rd STD"

cmd_port1_3rd_std

==========

"S"+178+178+":  "
"1st STD"

cmd_port2_1st_std

==========

"2nd STD"

cmd_port2_2nd_std

==========

"3rd STD"

cmd_port2_3rd_std

==========

"MORE"

==========

"DONE"
"(SPEC'D)"

cmd_std_class_specified

==========
>>>  SPECIFY_CLASS_MENU2  <<<


==========

"TRANS.:"
"FWD STD"

cmd_trans_fwd_std

==========

"REV STD"

cmd_trans_rev_std

==========



==========

"FREQUENCY"
"RESP. STD"

cmd_freq_resp_std

==========



==========
```

```
==========



==========

"DONE"
"(SPEC'D)"

cmd_std_class_specified

==========

>>> DISPLAY_MENU <<<


==========

"SINGLE "+sk_bracket_2
"CHANNEL"

cmd_single_ch

==========

"DUAL    "
"CHANNEL"

cmd_dual_ch

==========

sk_bracket_4
half_vt+"DATA"

cmd_data

==========

"MEMORY"

cmd_mem

==========

"DATA "+38
"MEMORY"

cmd_d_and_m

==========

"MATH"
"(...)"

cmd_math
```

```
==========

"SELECT"
"DEFAULTS"

==========

"DATA "+169
"MEMORY"

cmd_d_into_m

==========

>>> DUAL_CH_MENU <<<


==========

"2 CHANNEL"+sk_bracket_2
"OVERLAY"

cmd_overlay

==========

"2 CHANNEL"
"SPLIT"

cmd_split

==========


==========


==========


==========


==========


==========


==========
```

```
>>>  DISPLAY_DEFAULT_MENU  <<<


     ==========
     "MEMORY"+sk_bracket_5
     " 1 "
     cmd_memory1
     ==========
     " 2 "
     cmd_memory2
     ==========
     " 3 "
     cmd_memory3
     ==========
     " 4 "
     cmd_memory4
     ==========
     "MORE"
     ==========


     ==========
     "MATH"
     "OPERATIONS"
     ==========


     ==========
>>>  MEMORY_MENU  <<<

     ==========


     ==========
     ==========


     ==========


     ==========
     "DATA from"+sk_bracket_3
     "CHANNEL 1"
     cmd_memory_ch1
     ==========
     "DATA from"
     "CHANNEL 2"
     cmd_memory_ch2
     ==========
     "JOHN'S"
     "PLAYGROUND"
     ==========


     ==========
>>>  MEMORY2_MENU  <<<

     ==========
     "CAL DATA"+sk_bracket_7
     " 0 "
     cmd_cal0
     ==========
     "CAL DATA"
     " 1 "
     cmd_cal1
     ==========
     "CAL DATA"
     " 2 "
     cmd_cal2
```

```
==========

"CAL DATA"
" 3 "

cmd_cal3

==========

"CAL DATA"
" 4 "

cmd_cal4

==========

"CAL DATA"
" 5 "

cmd_cal5

==========

"CAL DATA"
" 6 "

cmd_cal6

==========

"CAL DATA"
" 7 "
cmd_cal7

==========
>>>  MAIN_MENU  <<<

==========

==========

==========

==========

"DATA"+sk_bracket_4
"+ MEMORY"

cmd_d_plus_m

==========

"DATA"
"- MEMORY"

cmd_d_minus_m

==========

"DATA"
mpy_char+" MEMORY"

cmd_d_mpy_m

==========

"DATA"
"/ MEMORY"

cmd_d_div_m

==========

==========

>>>  COPY_MENU  <<<

==========

"PLOT"+sk_bracket_5
"ALL"

cmd_plot_all

==========

"TRACE"

cmd_plot_trace

==========

"GRATICULE"

cmd_plot_graticule

==========

"MARKER(S)"

cmd_plot_marker

==========
```

```
"TEXT"

cmd_plot_text

==========

"SELECT"
"QUADRANT"

==========

"SELECT"
"PEN COLOR"

cmd_chl_pen

==========

"MODE"

==========
>>> PLOTPARM_MENU <<<

==========

"LIST TRACE"
"VALUES"

cmd_list_trace

==========


==========


==========


==========


==========


==========

"SYSTEM"+sk_bracket_2
"PARAMETERS"

cmd_system_params

==========

"OPERATING"
"PARAMETERS"

cmd_op_params

==========
>>> PLOT_SETUP_MENU <<<


==========


==========

"X -   LEFT"
"- -  UPPER"

cmd_quadrant_11

==========

"- -   LEFT"
"X -  LOWER"

cmd_quadrant_21

==========

"- X  RIGHT"
"- -  UPPER"

cmd_quadrant_12

==========

"- -  RIGHT"
"- X  LOWER"

cmd_quadrant_22

==========

"X X   FULL"+sk_bracket_5
"X X   PAGE"

cmd_quadrant_full

==========

==========

==========
```

```
>>>   PEN_MENU   <<<

      ==========

      "PEN"+sk_bracket_8
      " 1 "

      cmd_pen1

      ==========

      " 2 "

      cmd_pen2

      ==========

      " 3 "

      cmd_pen3

      ==========

      " 4 "

      cmd_pen4

      ==========

      " 5 "

      cmd_pen5

      ==========

      " 6 "

      cmd_pen6

      ==========

      " 7 "

      cmd_pen7

      ==========

      " 8 "

      cmd_pen8

      ==========
>>>   COPY2_MENU   <<<

      ==========
      "RESTORE"
      "DISPLAY"

      cmd_directory_off

      ==========

      sk_bracket_2
      half_vt+"PRINT"

      cmd_print_params

      ==========

      "PLOT"

      cmd_plot_params

      ==========


      ==========


      ==========


      ==========


      ==========

      "NEXT PAGE"

      cmd_next_op_param

      ==========
>>>   MARKER_MENU   <<<

      ==========

      "MARKER"+sk_bracket_6
      "         1 "

      cmd_marker_1

      ==========

      "         2 "

      cmd_marker_2
```

```
==========

"          3  "

cmd_marker_3

==========

"          4  "

cmd_marker_4

==========

"          5  "

cmd_marker_5

==========

"ALL"
"OFF"

cmd_marker_off

==========

delta_char+" MODE"
"MENU"

cmd_delta_marker

==========

"MORE"

cmd_more

==========
>>>  DELTA_MARKER_MENU  <<<

==========

sk_bracket_6
half_vt+delta_char+" REF =1"

cmd_ret_mkr1

==========

delta_char+" REF = 2"

cmd_ret_mkr2

==========
```

```
delta_char+" REF = 3"

cmd_ret_mkr3

==========

delta_char+" REF = 4"

cmd_ret_mkr4

==========

delta_char+" REF = 5"

cmd_ret_mkr5

==========

delta_char+" MODE"
"OFF"

cmd_no_ref_mkr

==========

==========

==========
>>>  MARKER2_MENU  <<<

==========

==========

==========

==========

==========

==========
```

```
==========

"MARKER to"+sk_bracket_2
"MINIMUM"

cmd_mkr_to_min

==========

"MAXIMUM"

cmd_mkr_to_max

==========

>>>  SYSTEM_MENU  <<<


==========

"TITLE"

cmd_title

==========

"HP-IB"
"ADDRESSES"

cmd_hpib_info

==========

"CRT"
"OFF"

cmd_crt_off

==========


==========


==========


==========


==========
```

```
"SERVICE"
"FUNCTIONS"

cmd_service_menu

==========

>>>  TITLE_MENU  <<<


==========

"SELECT"
"LETTER"

==========


==========

"SPACE"

==========

"BACKSPACE"

==========


==========


==========


==========

"DONE"

cmd_title_done

==========

>>>  HPIB_MENU  <<<


==========

"8510 HP-IB"+sk_bracket_6
"ADDRESS"

cmd_8510_addr
```

```
==========

"SYSTEM BUS"

cmd_system_bus_addr

==========

"SOURCE"

cmd_source_addr

==========

"TEST SET"

cmd_test_set_addr

==========

"PLOTTER"

cmd_plotter_addr

==========

"PRINTER"

cmd_printer_addr

==========

"AUTO CMD"

cmd_auto_cmd_addr

==========

"PASS THRU"

cmd_pass_thru_addr

==========

>>> SERVICE_MENU <<<

==========

"SOFTWARE"
"REVISION"

cmd_revision

==========

"SYSTEM BUS"+sk_bracket_2
"'LOCAL'"

cmd_privib_local

==========

"'REMOTE'"

cmd_privib_remote

==========

"IF GAIN"

cmd_if_gain_menu

==========

sk_bracket_3
half_vt+"LOCATION"

cmd_peek_poke_addr

==========

"PEEK"

cmd_peek

==========

"POKE"

cmd_poke

==========

"TEST MENU"

cmd_test_menu

==========
```

APPENDIX B

SOURCE CODE LISTING WRITTEN IN ALGOL AND ASSEMBLY LANGUAGE

```
F68.WORK.PD8510              THU, DEC 22, 1983, 10:21 AM    PAGE  1

kp active
kp actibl
kp actv0
kp actv2
kp alabel,,21
kp alphas,,21
kp annot
kp array
kp atables,,21
kp average
kp break
kp cal
kp cal0
kp chdata,,21
kp chtable
kp circle
kp cmds
ap compute
kp command
kp control
kp contvar
ap correct
kp couple
kp cpltbl,,21
kp datap
kp delay
kp dgtop
kp dowser
kp display
kp disptbl
kp domain
kp dmngr
ap fft
kp fifo
kp format
ap fstmath
kp gratic
kp ibtree,,21
kp ifgain
kp junk
kp kernel
kp keys,,21
kp lunplus,,21
kp main
kp mark0
kp mark1
kp mark3
kp markdg
kp marker
kp marks
kp marknen
kp mbmgr
kp mbnload
kp menmgr
kp menu
```

```
F68.WORK.PD8510              THU, DEC 22, 1983, 10:21 AM    PAGE  2

kp outib
kp output
kp param
kp parmtbl
kp parser
kp pfr
kp plut
kp privib
kp pubib
kp recall
kp respons
kp retrace
kp screen,,21
kp screen2
kp size
kp skey,,21
kp skpos,,21
kp stack
kp stddata
kp stds
kp stimuli
kp stimul2
kp stimul3
kp system
kp testset
kp time
kp timemnu
kp title
kp tpmgr
kp trace
kp trace2
kp trigtbl
kp util
kp xadc
kp xrbm
kp xtaco
kp yadc
```

```
J68.WORK.PD8510              THU, DEC 22, 1983, 10:21 AM    PAGE  1

!job j68prep,librn.pd8510,work;outclass=,1;pri=cs
!purge j68temp.work
!ed
)p off
)f off
e f68.work
)u u68.work
w j68temp.work
e j68model.work
/substitute here/ka
'ar j68temp.work
'ad
w j68temp.work
q
!stream j68temp.work
!eoj
```

```
U68.WORK.PD8510              THU, DEC 22, 1983, 10:21 AM    PAGE  1

1,$s/^.*$/\U&/
1,$s/\([^ ]* *\)\([^.^,^ ]*\)\(.*\)$/!setjcw jcw,0\n!message "\2"\n!continue\n!\1 \2.work
n!  setjcw \2,9999\n!  endif/
1,$g/\.work\./s/\.work//
1,$g/setjcw.*\.[^.]*./s/\.[^.]*./,/
```

```
J68MODEL.WORK.PD8510            THU, DEC 22, 1983, 10:21 AM     PAGE  1

!job j68,librn.pd8510,work;pri=CS;outclass=,1
!showtime
!continue
!purgespook
!setjcw j68error,0
!
!continue
!setjcw jcw,0
!message "GENSK"
!continue
!run gensk.lani.pd8510
!continue
!if jcw<>0 then
!  setjcw j68error,1
!  setjcw gensk,9999
!  endif
!continue
!comment Using files declared in skinfo.work, build ccmddecl.work
!ed
)u wsk.work
!
!continue
!setjcw jcw,0
!message "GENSTR"
!continue
!run genstr.lani.pd8510
!continue
!if jcw<>0 then
!  setjcw j68error,1
!  setjcw genstr,9999
!  endif
!
!COMMENT this following job's output will be used later by COMPUTE
!stream jcompute.work
!COMMENT this job recompiles the library routines.
!stream jlibrary.work
!COMMENT this job recompiles the io library routines.
!stream jiolib.work
!
!setjcw jcw,0
!message "CHARSET"
!continue
!charset
!if jcw<>0 then
!  setjcw j68error,1
!  setjcw charset,9999
!  endif
!
!setjcw jcw,0
!message "IBGEN"
!continue
!ibgen
!if jcw<>0 then
!  setjcw j68error,1
!  setjcw ibgen,9999
```

```
J68MODEL.WORK.PD8510            THU, DEC 22, 1983, 10:21 AM     PAGE  2

!  endif
!
!message "substitute here"
!
!purge j68temp.work
!if j68error=0 then
!  stream jlink.work
!  message "================================ done ======================"
!  tell librn.pd8510; ================== j68 done ======================
!  tell wcc.pd8510; ==================== j68 done ======================
!  tell jtb.pd8510; ==================== j68 done ======================
!  tell lani.pd8510; =================== j68 done ======================
!else
!  message "============================== failed ======================"
!  tell librn.pd8510; ================== j68 failed ===================
!  tell wcc.pd8510; ==================== j68 failed ===================
!  tell jtb.pd8510; ==================== j68 failed ===================
!  tell lani.pd8510; =================== j68 failed ===================
!  run hpmail.hpmail.sys;lib=g;stdin=hpmail1.work.pd8510
!  message "compile failures have JCWs with value = 9999"
!  showjcw
!  endif
!
!COMMENT this job creates dscreen, a list of the screen constant values.
!stream jscreen.work
!COMMENT this creates dchtable, a list of the chtable constant values.
!stream jchtable.work
!COMMENT this job creates dcmddecl, a list of the command token values.
!stream jcmddecl.work
!
!showtime
!eoj
```

```
CACTIVE.WORK.PD8510             THU, DEC 22, 1983, 10:21 AM     PAGE  1

COMMENT  These constants must correspond with the active function
         display annotation in SACTIVE.
;
INTEGER CONSTANT  active_off                  :=  0,    & * see below &
                  active_start                :=  1,
                  active_stop                 :=  2,
                  active_center               :=  3,
                  active_span                 :=  4,    & * see below &
                  active_cw                   :=  5,
                  active_sweep_time           :=  6,
                  active_source_power         :=  7,
                  active_power_slope          :=  8,
                  active_atten_port1          :=  9,
                  active_atten_port2          := 10,
                                            & end of source functions &
                  last_source_function        := 10,

                  active_ref_pos              := 11,
                  active_scale                := 12,    & * see below &
                  active_ref_value            := 13,    & * see below &
                  active_unused_2             := 14,
                  active_title                := 15,    & * see below &
                  active_n_groups_hpib        := 16,
                  active_if_avg_factor        := 17,
                  active_smoothing_aperture   := 18,    & * see below &
                  active_srq_mask_primary     := 19,
                  active_srq_mask_secondary   := 20,
                  active_revision             := 21,    & * see below &
                  active_aux_out              := 22,
                  active_keycode              := 23,
                  active_electrical_length    := 24,
                  active_phase_offset         := 25,
                  active_marker1              := 26,
                  active_marker2              := 27,
                  active_marker3              := 28,
                  active_marker4              := 29,
                  active_marker5              := 30,
                  active_address              := 31,
                  active_peek                 := 32,
                  active_poke                 := 33,
                  active_open_c0              := 34,
                  active_open_c1              := 35,
                  active_open_c2              := 36,
                  active_gate_start           := 37,
                  active_gate_stop            := 38,
                  active_gate_center          := 39,
                  active_gate_span            := 40,
                  active_magnitude_slope      := 41,
                  active_magnitude_offset     := 42,
                  active_stimulus_slope       := 43,
                  active_stimulus_offset      := 44,
                  active_ref_plane_1          := 45,
                  active_ref_plane_2          := 46,
                  active_system_z0            := 47,
                  active_8510_hpib_addr       := 48,
```

```
CACTIVE.WORK.PD8510             THU, DEC 22, 1983, 10:21 AM     PAGE  2

                  active_system_bus_hpib_addr := 49,
                  active_pass_thru_hpib_addr  := 50,
                  active_source_hpib_addr     := 51,
                  active_testset_hpib_addr    := 52,
                  active_plotter_hpib_addr    := 53,
                  active_printer_hpib_addr    := 54,
                  active_ch_cmd_hpib_addr     := 55,
                  active_offset_delay         := 56,
                  active_offset_loss          := 57,
                  active_offset_z0            := 58,
                  active_offset_min_freq      := 59,
                  active_offset_max_freq      := 60,
                  active_std_id                  61,
                  active_std_class            := 62,
                  active_n_groups_kbd         := 63,
                  active_previous             := -1;    & * see below &

& * These constants also appear in cactv1.work and should be changed   &
&   there if they are changed here. &
```

```
FACTIVE.WORK.PD8510              THU, DEC 22, 1983, 10:21 AM     PAGE   1

#FILE cactive.work;
#FILE factv1.work;
```

```
SACTIVE.WORK.PD8510              THU, DEC 22, 1983, 10:21 AM     PAGE   1

M68KL,P,"active"
BEGIN

#FILE cchtable.work;                                  & for ch_... constants &
#FILE fchtable.work;                              & for set_entry_ch_... etc. &
#FILE fannot.work;               & for annotate_ref_value and update scale &
#FILE fmarker.work;                                          & for mkr_... &
#FILE fkernel.work;                            & for acquire and release &
#FILE crins.work;                               & for active_function_rin &
#FILE futil.work;                                               & for tell &
#FILE fprivib.work;             & for wrt_priv_ib and wrt_priv_ib_source &
#FILE foutib.work;                                & for wrt_pubib_string &
#FILE ffmt.work;                                       & for format_quad &
#FILE ccontvar.work;                                 & for max_parameter &
#FILE fdatap.work;                                         & for min_max &
#FILE fchdata.work;                                      & for step_size &
#FILE fchpfr.work;                                   & for scale[], etc. &
#FILE cactive2.work;          & for step_up, _down, e0, ..., mkr_to_min &
#FILE factv0.work;
#FILE cactv1.work;           & for active_scale, _ref_value, _revision &
#FILE factv1.work;
#FILE factv2.work;                                           & for entry &
#FILE facttbl.work;                   & for get_active {make_positive} &
#FILE fstring.work;                         & for append_string and _ch &
#FILE fstimuli.work;                     & for entry_stimulus_at_point &
#FILE fcnv9x.work;                                           & for CNV9A &
#FILE cnewline.work;                                       & for newline &
#FILE fgratic.work;                & for graticule_type and type_of_grat &
#FILE fdispram.work;                                 & for wrt_disp_real &
```

```
SACTIVE.WORK.PD8510              THU, DEC 22, 1983, 10:21 AM     PAGE   2

#EJECT;
BYTE    TABLE    revision_array := 22,'R,'E,'V,' ,'R,'.,'x,':,' ,
                                     'J,'A,'N,' ,'9,'9,'.,' ,'1,'9,'9,'9,
                                     ' ;           & to look like an ALPHA &
                            & 2nd line is $DATE$ and is filled by linker &
SUBROUTINE dummy;    & to allow assemble statement in declaration area &
   BEGIN
      ASSEMBLE( "$DATE$  EQU    10+$revision_array";  & offset must be &
                         ENT    $DATE$                &    an even no. &
              );
   END;
```

```
SACTIVE.WORK.PD8510              THU, DEC 22, 1983, 10:21 AM     PAGE   3

#EJECT;
ALPHA TABLE keypad_suffix :=             & used by keypad_entry routine &
   & 0 &   "E-9",
   & 1 &   "E-6",
   & 2 &   "E-3",
   & 3 &   "",     & same as "E0" but faster to process &
   & 4 &   "E3",
   & 5 &   "E6",
   & 6 &   "E9",
   & 7 &   "E12",
   & 8 &   "E15",
   & 9 &   "E18",
   &10 &   "E21";

INTEGER TABLE    ch_active_marker :=
                 0,
                 ch_marker1,
                 ch_marker2,
                 ch_marker3,
                 ch_marker4,
                 ch_marker5;

BYTE    CONSTANT hpib_function := 1,
                 step_function := 2;

DOUBLE  CONSTANT initial_peek_n_poke_addr := %00000100;
```

```
SACTIVE.WORK.PD8510            THU, DEC 22, 1983, 10:21 AM    PAGE   4

#EJECT;
COMMENT                                                            rpg_entry
*************************************************************************
*
* RPG ALGORITHMS:
*   0 - rpg disabled
*   1 - hpib source update protocol
*   2 - .1% of stimulus span      value + rpg_count*span/1000
*   3 - count                     value + rpg_count
*   4 - 1                         value + 1*(sign of rpg_count)
*   5 - count/20       [scaled]   value + rpg_count/20
*   6 - .1% scale/div  [scaled]   value + rpg_count*scale/1000
*   7 - .1% value      [scaled]   value + rpg_count*value/1000
*   8 - count/10                  value + rpg_count/10
*   9 - count/100      [scaled]   value + rpg_count/100
*   A - count*count*count         value + rpg_count*rpg_count*rpg_count
*   B-F undefined
*
* [scaled] algorithms apply to active functions that are scaled (see
*     "scale_factor").
*
*************************************************************************
;
PROCEDURE  rpg_entry( rpg_word );
   VALUE   rpg_word;
   INTEGER rpg_word;                                              ENTRY;
   BEGIN & rpg_entry &
      ALPHA           rpg_cmd;
      INTEGER         rpg_count;
      DOUBLE          temp_double;
      QUAD            quad_rpg_count,
                      active_increment;
      BYTE  POINTER   rpg_ptr = rpg_cmd;

      acquire( active_function_rin );

      IF rpg_algorithm <> 0 THEN
         BEGIN & if &

           & mask off rpg count and sign extend &
           rpg_word := INTEGER( BYTE(rpg_word AND %00FF) );

           IF rpg_algorithm <> hpib_function THEN     & rate multiply &
              BEGIN & if not hpib_function &
                 rpg_count := rpg_word * (1 + RIGHT(ABS(rpg_word), 2));
                 quad_rpg_count := QUAD(rpg_count);
              END   & if not hpib_function &
           ELSE & hp-ib function &
              BEGIN & else &
                 rpg_cmd := "RBx";            & the x is a placeholder &
                 rpg_ptr[3] := rpg_word;      &        for the.rpg word &
              END;  & else &

           CASE (rpg_algorithm - 1) OF
              BEGIN & case &
& 1 HP-IB     &  CASE (active_function - 1) OF
```

```
SACTIVE.WORK.PD8510            THU, DEC 22, 1983, 10:21 AM    PAGE   5

                      BEGIN & case &
   & 1 start          &  wrt_priv_ib_source( fa, rpg_cmd );
   & 2 stop           &  wrt_priv_ib_source( fb, rpg_cmd );
   & 3 center         &  wrt_priv_ib_source( cf, rpg_cmd );
   & 4 span           &  wrt_priv_ib_source( df, rpg_cmd );
   & 5 cw             &  wrt_priv_ib_source( cw, rpg_cmd );
   & 6 sweep time     &  wrt_priv_ib_source( st, rpg_cmd );
   & 7 source power &  ; & not used (plug-in RPG requires GET) &
   & 8 power slope  &  ; & not used (plug_in RPG requires GET) &
   & 9 atten port 1 &  ; & not used (not RPG compatible) &
   & 10 atten port 2 & ; & not used (not RPG compatible) &
                      END;  & case &
& 2 .1% span      &  active_increment :=
                                 ( quad_rpg_count *
                                   entry_ch_quad(ch_span_stimulus) /
                                   quad_thousand
                                 );
& 3 direct        &  active_increment := quad_rpg_count;
& 4 +/- 1         &  active_increment := SIGN( 1, rpg_count );
& 5 +/- count/20 &  active_increment :=
&         scaled  &          ( quad_rpg_count * quad_scaled_twentieth );
& 6 .1% scale     &  active_increment := ( quad_rpg_count *
                                        QUAD( ABS( entry_ch_real(
                                                           ch_scale
                                                              )
                                               ) *
                                            scaled_thousandth
                                          )
                                       );
& 7 .1% value     &  active_increment := ( quad_rpg_count *
                                          ABS(active_fcn_value)
                                       ) / quad_thousand;
& 8 +/- count/10 &  active_increment := QUAD(
                                     SIGN(1,rpg_count) + rpg_count/10
                                          );
& 9 +/- count/100&  active_increment :=
&         scaled  &          ( quad_rpg_count * quad_scaled_hundreth );
& A for time      &  BEGIN
                        rpg_word := rpg_word + rpg_word;      & times 2 &
                        IF rpg_word > 30 THEN
                           rpg_word := 30;
                        temp_double := SBIT( 0, rpg_word );
                        active_increment := active_fcn_value     *
                                           QUAD( temp_double ) /
                                           %0A000000;
                     END;
                  END;  & case &

            IF rpg_algorithm <> hpib_function THEN
               BEGIN & if &
                  IF active_increment = 0 THEN
                     active_increment := quad_rpg_count;
                  active_fcn_value := active_fcn_value +
                                                    active_increment;
                  enter_active_function;
               END;  & if &
```

```
SACTIVE.WORK.PD8510            THU, DEC 22, 1983, 10:21 AM    PAGE   6

         END;  & if &

      release( active_function_rin );

   END;  & rpg_entry &
```

```
SACTIVE.WORK.PD8510            THU, DEC 22, 1983, 10:21 AM    PAGE   7

#EJECT;
COMMENT                                                             step_125
*************************************************************************
*
*************************************************************************
*
* INITIAL REFINEMENT:
*
*    take absolute value -- save sign.
*
*    { find power of ten -- actually 4*10^n to ease later computations }
*    find "floor" (4*10^n immediately <= number).
*    { note that table fails for values of +1, 0, and -1, so a special
*      case handles those situations. }
*
*    { determine whether one, two, or five is nearest ordinal value }
*    IF number < 2*floor THEN   { number < 8*10^n }
*       one_two_five := five
*    ELSE IF number < 4*floor THEN   { number < 16*10^n }
*       one_two_five := one
*    ELSE {number < floor*10}          { number < 40*10^n }
*       one_two_five := two.
*
*    { do step-up and step-down stuff }
*    IF direction = up THEN
*       CASE one_two_five OF
* five:     one_two_five := one.
* one:      one_two_five := two.
* two:      BEGIN
*              one_two_five := five.
*              floor := floor * 10.
*           END
*    ELSE IF direction = down THEN
*       CASE one_two_five OF
* five:     BEGIN
*              one_two_five := two.
*              floor := floor / 10.
*           END.
* one:      one_two_five := five.
* two:      one_two_five := one
*    ELSE {no direction -- just find nearest one-two-five value}
*       do nothing here.
*
*    { compute actual one-two-five values from the table }
*    IF one_two_five = two THEN
*       number := (floor*10)/2
*    ELSE IF one_two_five = one THEN
*       number := (floor*10)/4
*    ELSE {one_two_five = five}
*       number := (floor*10)/8.
*
*    restore sign of number.
*
*************************************************************************
;
      INTEGER CONSTANT  small_offset := 10,     & 1st entry <= 32-bits &
```

```
SACTIVE.WORK.PD8510              THU, DEC 22, 1983, 10:21 AM     PAGE   8

                         half_quad    :=  4,
                         quad_size    :=  8;

        QUAD TABLE fours_table :=
 & 9.22E18 & X7FFFFFFFFFFFFFFF,                         & top end buffer entry &
 & 4E18 &     4000000000000000000,
 & 4E17 &     400000000000000000,
 & 4E16 &     40000000000000000,
 & 4E15 &     4000000000000000,
 & 4E14 &     400000000000000,
 & 4E13 &     40000000000000,
 & 4E12 &     4000000000000,
 & 4E11 &     400000000000,
 & 4E10 &     40000000000,
 & 4E9  &     4000000000,
 & 4E8  &     400000000,
 & 4E7  &     40000000,
 & 4E6  &     4000000,
 & 4E5  &     400000,
 & 4E4  &     40000,
 & 4E3  &     4000,
 & 4E2  &     400,
 & 4E1  &     40,
 & 4E0  &     4,
 & 0    &     0;                                         & botton end buffer entry &
      QUAD small_table = fours_table +
                          small_offset*quad_size + half_quad;

QUAD PROCEDURE step_125(number, direction);
   VALUE   number,direction;
   QUAD    number;
   INTEGER direction;
   BEGIN & step_125 &
      LABEL end_abs,
            large_loop,
            small_num,
            bigger_than_1,
            small_loop,
            floor_found,
            f1,
            f2,
            found_125,
            up_step,
            down_step,
            up_dn_done,
            div_8,
            div_4,
            div_2,
            restore_sign,
            sign_restored;

 & rearrange things -- should have planned ahead &
      ASSEMBLE(
            MOVE        direction, R5          step direction
           );
```

```
SACTIVE.WORK.PD8510              THU, DEC 22, 1983, 10:21 AM     PAGE   9

& take absolute value and save sign &
     ASSEMBLE(
               CLR       R6                          R6 remembers sign, O=+ ;
               TST.L     R0                          ;
               BGE       end_abs                     ;
               NOT       R6                          remember sign -- -1=minus ;
               NEG       R5                          reverse direction for neg.;
               NEG.L     R1                          negate number ;
               NEGX.L    R0
              );
end_abs:

& find "floor" (number >= table entry) &
     ASSEMBLE(
               TST.L     R0                          is most sig. half = 0? ;
               BEQ       small_num                   ;
               LEA       fours_table, R8             ;
large_loop:    ADDQ.W    =D8,      R8                quad_size ;
               CMP.L     (R8),     R0                compare most sig. halves ;
               BCS       large_loop                  BCS = BLO = logical BLT ;
               BRA       floor_found                 ;
small_num:     CMPI.L    =D1,      R1                is least sig. half > 1? ;
               BHI       bigger_than_1               ;
               ADD       R5,       R1                handles 0 and 1 values ;
               BGE       restore_sign                quick if result is 0 or 1 ;
               MOVEQ     =D-1,     R1                crossed 0 to become -1 ;
               MOVEQ     =D-1,     R0                ;
               BRA       restore_sign                ;
bigger_than_1: LEA       small_table, R8             ;
small_loop:    ADDQ.W    =D8,      R8                quad_size ;
               CMP.L     (R8),     R1                compare least sig. half ;
               BCS       small_loop                  BCS = BLO = unsigned BLT ;
               SUBQ.W    =D4,      R8                back up to most sig. half
              );
floor_found:

& find 1-2-5 &
     ASSEMBLE(
               MOVEM.L   (R8)+;    R2-R3             get "floor" ;
               SUB.W     =D16,     R8                twice_quad, now "ceiling" ;
               MOVEQ     =D-1,     R7                five = returned result ;
               ASL.L     #1,       R3                2 x floor ;
               ROXL.L    #1,       R2                ;
               CMP.L     R2,       R0                ;
               BCS       found_125                   BCS = BLO = logical BLT ;
               BHI       f1                          BHI = logical BGT ;
               CMP.L     R3,       R1                ;
               BCS       found_125                   BCS = BLO = logical BLT ;
f1:            MOVEQ     =D0,      R7                one = returned result ;
               ASL.L     #1,       R3                4 x floor ;
               ROXL.L    #1,       R2                ;
               CMP.L     R2,       R0                ;
               BCS       found_125                   BCS = BLO = logical BLT ;
               BHI       f2                          BHI = logical BGT ;
               CMP.L     R3,       R1                ;
               BCS       found_125                   BCS = BLO = logical BLT ;
```

```
SACTIVE.WORK.PD8510              THU, DEC 22, 1983, 10:21 AM     PAGE  10

f2:            MOVEQ     =D1,      R7          two = returned result
              );
found_125:

& implement step-up and step-down &
     ASSEMBLE(
               TST       R5                    1=up, -1=down, 0=same ;
               BEQ       up_dn_done            ;
               BLT       down_step             ;
up_step:       ADDQ      #1,       R7          ;
               CMP       =D1,      R7          two ;
               BLE       up_dn_done            ;
               MOVEQ     =D-1,     R7          five,crossed 10^n boundary ;
               SUBQ.W    =D8,      R8          quad_size ;
               BRA       up_dn_done            ;
down_step:     SUBQ      #1,       R7          ;
               CMP       =D-1,     R7          five ;
               BGE       up_dn_done            ;
               MOVEQ     =D1,      R7          two, crossed 10^n boundary ;
               ADDQ.W    =D8,      R8          quad_size
              );
up_dn_done:

& calculate 1-2-5 value &
     ASSEMBLE(
               MOVEM.L   (R8)+,    R0-R1       get "ceiling" ;
               TST       R7                    -1=five, 0=one, 1=two ;
               BGT       div_2                 compute "two" ;
               BEQ       div_4                 compute "one" ;
div_8:         ASR.L     #1,       R0          compute "five" ;
               ROXR.L    #1,       R1          ;
div_4:         ASR.L     #1,       R0          ;
               ROXR.L    #1,       R1          ;
div_2:         ASR.L     #1,       R0          ;
               ROXR.L    #1,       R1
              );

restore_sign:
     ASSEMBLE(
               TST       R6                    ;
               BPL       sign_restored         ;
               NEG.L     R1                    ;
               NEGX.L    R0
              );
sign_restored:

& return -- result is in R0-R1 &

   END;  & step_125 &
```

```
SACTIVE.WORK.PD8510              THU, DEC 22, 1983, 10:21 AM     PAGE  11

#EJECT;
COMMENT                                                               step_entry
*************************************************************************
*
* STEP KEY ALGORITHMS:
*   0 - step keys disabled
*   1 - hpib source update protocol
*   2 - 1-2-5 sequence  [scaled or unscaled]
*   3 - 10% of span                      value + step_sign*span/10
*   4 - 1                [scaled]        value + 1*step_sign
*   5 - 1 division       [scaled]        value + step_sign*scale/div
*   6 - undefined
*   7 - 1 division                       value + step_sign*scale/div
*   8 - 10% of value     [scaled]        value + step_sign*value/10
*   9 - 1                                value + 1*step_sign
*   A - 10               [scaled]        value + 10*step_sign
*   B-F undefined
*
* [scaled] algorithms apply to active functions that are scaled (see
*    "scale_factor").
*
*************************************************************************
;
PROCEDURE  step_entry( direction );
   VALUE   direction;
   INTEGER direction;                                                 ENTRY;
   BEGIN & step_entry &
      INTEGER index;
      ALPHA   step_cmd;
      QUAD    active_increment;

      acquire( active_function_rin );

      IF step_algorithm <> 0 THEN
         BEGIN & if &

            CASE (step_algorithm - 1) OF
               BEGIN & case &
&  1 HP-IB          &  BEGIN & hpib &
                           step_cmd := IF direction = step_down THEN
                                          "DN"
                                       ELSE
                                          "UP";
                           CASE (active_function - 1) OF
                              BEGIN & case &
      &  1 start         &       wrt_priv_ib_source( fa, step_cmd );
      &  2 stop          &       wrt_priv_ib_source( fb, step_cmd );
      &  3 center        &       wrt_priv_ib_source( cf, step_cmd );
      &  4 span          &       wrt_priv_ib_source( df, step_cmd );
      &  5 cw            &       wrt_priv_ib_source( cw, step_cmd );
      &  6 sweep time    &       wrt_priv_ib_source( st, step_cmd );
      &  7 source power  &       ; & not used &
      &  8 power slope   &       wrt_priv_ib_source( sl1, step_cmd );
      &  9 atten port 1  &       BEGIN & atten port 1 &
                                    wrt_priv_ib(test_set,atten1,step_cmd);
                                    enter_active_function;
```

```
SACTIVE.WORK.PD8510          THU, DEC 22, 1983, 10:21 AM     PAGE  12

                             END;  & atten port 1 &
      & 10 atten port 2 &    BEGIN & atten port 2 &
                                urt_priv_ib(test_set,atten2,step_cmd);
                                enter_active_function;
                             END;  & atten port 2 &
                          END;  & case &
                       END;  & hpib &
& 2 1-2-5  &           active_fcn_value := step_125( active_fcn_value,
                                                      direction
                                                    );
& 3 10% of span &      active_increment :=
                          SIGN( ( entry_ch_quad(ch_span_stimulus) /
                                  quad_ten
                                ),
                                direction
                              );
& 4 +/- 1  &           active_increment :=
& scaled   &              SIGN( quad_scaled_one, direction );
& 5 +/1 scale/div & BEGIN
& scaled   &             index := get_active( get_log_scale_div_3,
                                              active_scale
                                            );
                         active_increment :=
                             SIGN( QUAD( entry_ch_real(ch_scale) *
                                         scale_factors[ index ]
                                       ),
                                   direction
                                 );
                       END;
& 6 undefined      & ;
& 7 +/- scale/div & active_increment :=
&       unscaled  &       SIGN( QUAD( entry_ch_real(ch_scale) ),
                                direction
                              );
& 8   10% of value& active_increment :=
&         scaled  &       SIGN( ( active_fcn_value / quad_ten ),
                                direction
                              );
& 9      +/- 1  & active_increment :=
&       unscaled  &       SIGN( 1, direction );
& 10     +/- 10  & active_increment :=
&        scaled  &        SIGN( quad_ten_scaled, direction );
                    END;  & case &


                 IF step_algorithm <> hpib_function THEN
                    BEGIN & if <> hpib_function &
                       IF step_algorithm <> step_function THEN
                          BEGIN & if &
                             IF active_increment = 0 THEN
                                active_increment := SIGN( 1, direction );
                             active_fcn_value := active_fcn_value +
                                                 active_increment;
                          END;  & if &
                       enter_active_function;
                    END;  & if <> hpib_function &
```

```
SACTIVE.WORK.PD8510          THU, DEC 22, 1983, 10:21 AM     PAGE  13

         END;  & if &

      release( active_function_rin );

   END;  & step_entry &
```

```
SACTIVE.WORK.PD8510          THU, DEC 22, 1983, 10:21 AM     PAGE  14

#EJECT;
COMMENT                                                       keypad_entry
**************************************************************************
*
* KEYPAD ALGORITHMS:
*   0 - keypad disabled
*   1 - terminator keys represent positive exponents
*   2 - terminator keys represent negative exponents
*   3-7 undefined
*
**************************************************************************
;
PROCEDURE  keypad_entry( terminator );
   VALUE   terminator;
   INTEGER terminator;                                         ENTRY;
   BEGIN & keypad_entry &
      INTEGER position;

      IF keypad_algorithm <> 0 THEN               & 0 = keypad disabled &
         BEGIN & if &
            acquire( active_function_rin );

            & 0 <= terminator <= 3 &

            CASE keypad_algorithm OF
               BEGIN & case &
& 0 keypad disabled    &   ;
& 1 positive exponent  &   terminator := 3 + terminator; & 3 <= t <= 6 &
& 2 negative exponent  &   terminator := 3 - terminator; & -3<= t <= 0 &
               END;  & case &

                               & log_scale_factor_div_3 = 4 for 1@12 &
            terminator := terminator + log_scale_factor_div_3;
                                                & 0 <= terminator <= 10 &

            entry_array[-1] := entry_array[-1] + keypad_suffix_size;
            append_string( entry, keypad_suffix[terminator] );
            position := 1;
            active_fcn_value := CNV9A( entry, position );
            entry_array[-1] := entry_array[-1] - keypad_suffix_size;

            enter_active_function;

            release( active_function_rin );
         END;  & if &

      send( entry_string_ready );              & finished with string &
                                     & comes after enter_active_function &
                                     & to hold off parser for "TSn" cmd. &
                                     & Prefer placing it before.         &

   END;  & keypad_entry &
```

```
SACTIVE.WORK.PD8510          THU, DEC 22, 1983, 10:21 AM     PAGE  15

#EJECT;
COMMENT                                                 marker_value_entry
**************************************************************************
*
* "=MARKER" ALGORITHMS:
*   0 - "=MARKER" is inconsistent for current active function
*   1 - use marker stimulus value (e.g. for center frequency)
*   2 - use marker amplitude (e.g. for reference value)
*   3 - use marker magnitude (e.g. for magnitude offset)
*   4 - use marker phase     (e.g. for phase offset)
*   5-F undefined
*
**************************************************************************
;
QUAD PROCEDURE quad_mkr_amplitude;
   BEGIN & quad_mkr_amplitude &
      USER3 temp_user3;
      REAL  temp_real = temp_user3 + 2;

      temp_user3 := marker_value( active_marker );
      IF scaled THEN
         BEGIN & if scaled &
            temp_real := temp_real * scale_factor;
            IF log_scale_factor_div_3 <> 4 THEN
               temp_real := temp_real *
                            1000.0 ^ REAL(log_scale_factor_div_3 - 4);
         END;  & if scaled &
      quad_mkr_amplitude := QUAD( temp_real + 0.5 );
   END;  & quad_mkr_amplitude &


SUBROUTINE marker_value_entry;                                 ENTRY;
   BEGIN & marker_value_entry &

      COMMENT   amplitude, magnitude, and phase are always scaled reals,
                stimulus value is always a quad.

      ;
      acquire( active_function_rin );

      CASE mkr_algorithm OF
         BEGIN & case &
& 0 &       tell( inconsistent_operation );
& 1 stim &  active_fcn_value := mkr_stimulus_at_pt(active_marker);
& 2 ampl &  active_fcn_value := quad_mkr_amplitude;
& 3 mag  &  active_fcn_value := quad_mkr_amplitude;
& 4 phase&  active_fcn_value := quad_mkr_amplitude;
         END;  & case &

      IF get_active(get_must_be_positive, active_function) =
            make_positive THEN
         active_fcn_value := ABS(active_fcn_value);

      enter_active_function;

      release( active_function_rin );
```

```
   END;  & marker_value_entry &
```

```
#EJECT;
COMMENT                                                          marker_to
****************************************************************************
*
****************************************************************************
;
PROCEDURE  marker_to( to_min_max );
   VALUE   to_min_max;
   INTEGER to_min_max;                                              ENTRY;
   BEGIN & marker_to &
      INTEGER min_pt,
              max_pt,
              point_number;
      REAL    min,
              max;

      min_max( entry_ch_double(ch_f_base),
               step_size,
               graticule_type(current_entry_ch) <> rectangular,
               min,
               min_pt,
               max,
               max_pt
             );

      point_number := IF to_min_max = mkr_to_min THEN min_pt
                                                 ELSE max_pt;
      set_entry_ch_quad( entry_stimulus_at_point( point_number ),
                         ch_active_marker( active_marker )
                       );
      select_marker( active_marker );

   END;  & marker_to &
```

```
EJECT;
COMMENT                                                         auto_scale
****************************************************************************
*
****************************************************************************
;
PROCEDURE  auto_scale;                                              ENTRY;
   BEGIN & auto_scale &
      BOOLEAN grat_type;
      INTEGER min_pt,
              max_pt,
              param_index,
              format_index;
      REAL    min,
              max,
              reference_value,
              reference_offset,
              center_value,
              scale_value,
              temp_real;
      QUAD    temp_quad;
      INTEGER POINTER src,
                      dst;

SUBROUTINE compute_scale; `     & centralized multiple-usage code &
         BEGIN & compute_scale &
            scale_value  := max - center_value;             & scale * 5 &
            temp_real    := center_value - min;             & scale * 5 &
            IF temp_real > scale_value  THEN
               scale_value := temp_real/5
            ELSE
               scale_value := scale_value/5;
            temp_quad   := QUAD( scale_factor * scale_value );
            temp_quad   := step_125( temp_quad, step_up );
            temp_quad   := limit_quad( temp_quad, active_scale );
            scale_value := REAL( temp_quad ) * unscale;
         END;  & compute_scale & grat_type := graticule_type(current_entry_ch);

min_max( entry_ch_double(ch_f_base),
               step_size,
               grat_type <> rectangular,
               min,
               min_pt,
               max,
               max_pt
             );

IF grat_type = rectangular THEN
         BEGIN & if rectangular &

& find a nice number near the center-line of the data & center_value := (max + min) / 2;
            temp_quad := QUAD( scale_factor * center_value );
```

```
            temp_quad := step_125( temp_quad, 0 );  & 0 = no direction &
            center_value := REAL(temp_quad) * unscale;

compute_scale; & best guess before knowing actual ref.val. &

& center_value was the initial guess, reference position   &
            & can cause limiting or a non-nice value, so fix things up.& reference_offset := scale_value *
                                (entry_ch_real(ch_ref_position) - 5.0);
            reference_value := center_value + reference_offset;
            temp_quad := QUAD( scale_factor * reference_value );
            temp_quad := step_125( temp_quad, 0 );  & 0 = no direction &
            temp_quad := limit_quad( temp_quad, active_ref_value );
            reference_value := REAL(temp_quad) * unscale;

& Limiting and/or 1-2-5 roundoff can move reference value  &
            & significantly, so recompute scale for the new ref value. & center_value := reference_value - reference_offset;
            compute_scale;

END   & if rectangular &
      ELSE
         BEGIN & else polar &
            temp_quad := QUAD( scale_factor * max );
            temp_quad := step_125( temp_quad, step_up );
            reference_value := REAL( limit_quad( temp_quad,
                                                 active_ref_value
                                               )
                                   ) * unscale;
            scale_value := 0.2 * reference_value;
         END;  & else polar & param_index  := entry_ch_integer(ch_param);
      format_index := entry_ch_integer(ch_format);
      IF type_of_grat[ format_index ] <> rectangular THEN
         format_index := fmt_log_polar;   & all polars use same values & set_entry_ch_real( reference_value, ch_ref_value );
      wrt_disp_real( ADRS( ref_value[ format_index,
                                      entry_ch_integer(ch_param),
                                      current_entry_ch
                                    ]
                         ),
                     reference_value
                   );
      annotate_ref_value;

set_entry_ch_real( scale_value, ch_scale );
      wrt_disp_real( ADRS( scale[ format_index,
                                  entry_ch_integer(ch_param),
                                  current_entry_ch
                                ]
                         ),
                     scale_value
```

```
SACTIVE.WORK.PD8510            THU, DEC 22, 1983, 10:21 AM      PAGE  20

              );
      update_scale;                        & includes partial( update_f ) &

      select_active_function( active_previous );

   END;  & auto_scale &
```

```
SACTIVE.WORK.PD8510            THU, DEC 22, 1983, 10:21 AM      PAGE  21

#EJECT;
COMMENT                                                          output_active
****************************************************************************
*
****************************************************************************
;
PROCEDURE  output_active;                                                ENTRY;
   BEGIN & output_active &
      BYTE ARRAY output_array[-1:string_size];
      ALPHA      output_string;
      DOUBLE     fnt;

      acquire( active_function_rin );

      & initialize string &
      output_string := ADRS( output_array );
      output_string := init_string( output_string, string_size );

      IF display_format <> 0 THEN
         BEGIN & if &
            fnt := format_table[ output_format ];
            & enter format bias (scale factor) &
            fnt := fnt + (log_scale_factor_div_3 * 48);    & 48 <= 3*16 &
            output_string := format_quad( active_fcn_value,
                                          output_string,
                                          fnt
                                        );
         END;  & if &

      wrt_pubib_string( append_ch(output_string, newline) );

      release( active_function_rin );

   END;  & output_active &
```

```
SACTIVE.WORK.PD8510            THU, DEC 22, 1983, 10:21 AM      PAGE  22

#EJECT;
COMMENT                                                      output_identifier
****************************************************************************
*
****************************************************************************
;
PROCEDURE  output_identifier;                                            ENTRY;
   BEGIN & output_identifier &
      BYTE ARRAY output_array[-1:string_size];
      ALPHA      output_string;

      & initialize string &
      output_string := ADRS( output_array );
      output_string := init_string( output_string, string_size );

      append_string( output_string, "HP8510A, " );
      append_string( output_string,
                     active_function_label[ active_revision ]
                   );

      wrt_pubib_string( append_ch(output_string, newline) );

   END;  & output_identifier &
```

```
SACTIVE.WORK.PD8510            THU, DEC 22, 1983, 10:21 AM      PAGE  23

#EJECT;
COMMENT                                                            init_active
****************************************************************************
*
****************************************************************************
;
PROCEDURE  init_active;                                                  ENTRY;
   BEGIN & init_active &
      INTEGER POINTER int_ptr;
      DOUBLE  temp_dbl;
      INTEGER temp_dbl_upper = temp_dbl,
              temp_dbl_lower = temp_dbl+2;

      & use INTEGERs -- label may be in display &
      STPNTR( int_ptr, ADRS( active_function_label[active_revision] ) );
      temp_dbl := ADRS(revision_array);
      int_ptr := temp_dbl_upper;
      STPNTR( int_ptr, ADRS(int_ptr)+2 );
      int_ptr := temp_dbl_lower;

      STPNTR( peek_n_poke, initial_peek_n_poke_addr );

   END;  & init_active &

END$
```

```
FACTIVE2.WORK.PD8510          THU, DEC 22, 1983, 10:21 AM     PAGE   1

INTEGER CONSTANT  step_up          :=  1,            & cannot change &
                  step_down        := -1;            & built into fcn&
INTEGER CONSTANT  e0               :=  0,
                  e3               :=  1,
                  e6               :=  2,
                  e9               :=  3;
INTEGER CONSTANT  mkr_to_min       :=  0,
                  mkr_to_max       :=  1;
INTEGER CONSTANT  keypad_suffix_size := 5;     & max keypad suffix + 1 &
```

```
FACTIVE2.WORK.PD8510          THU, DEC 22, 1983, 10:21 AM     PAGE   1

#FILE cactive2.work;

EXTERNAL INTEGER active_function;

PROCEDURE  select_active_off( which_function );
  VALUE    which_function;
  INTEGER which_function;                                  EXTERNAL;
PROCEDURE  rpg_entry( rpg_value );
  VALUE    rpg_value;
  INTEGER rpg_value;                                       EXTERNAL;
PROCEDURE  step_entry( direction );
  VALUE    direction;
  INTEGER direction;                                       EXTERNAL;
PROCEDURE  keypad_entry(terminator);
  VALUE    terminator;
  INTEGER terminator;                                      EXTERNAL;
SUBROUTINE marker_value_entry;                             EXTERNAL;
PROCEDURE  marker_to( min_max );
  VALUE    min_max;
  INTEGER min_max;                                         EXTERNAL;
PROCEDURE  auto_scale;                                     EXTERNAL;
PROCEDURE  output_active;                                  EXTERNAL;
PROCEDURE  output_identifier;                              EXTERNAL;
PROCEDURE  init_active;                                    EXTERNAL;
```

```
FACTTBL.WORK.PD8510           THU, DEC 22, 1983, 10:21 AM     PAGE   1

#FILE catable2.work;
#FILE fatables.work;
#FILE falabel.work;                      & for active_function_label &

INTEGER PROCEDURE get_active( source, function );
   VALUE   source, function;
   INTEGER source, function;                               EXTERNAL;
ALPHA PROCEDURE ch_active_suffix( function, ch );
   VALUE   function, ch;
   INTEGER function, ch;                                   EXTERNAL;
ALPHA PROCEDURE active_suffix( function );
   VALUE   function;
   INTEGER function;                                       EXTERNAL;
DOUBLE PROCEDURE active_format( function );
   VALUE   function;
   INTEGER function;                                       EXTERNAL;
DOUBLE PROCEDURE ch_active_format( function, ch );
   VALUE   function, ch;
   INTEGER function, ch;                                   EXTERNAL;
BOOLEAN PROCEDURE active_limits( min, max, function );
   VALUE   function;
   QUAD    min, max;
   INTEGER function;                                       EXTERNAL;
PROCEDURE  ch_set_active_limits( min, max, function, ch );
   VALUE   min, max, function, ch;
   QUAD    min, max;
   INTEGER function, ch;                                   EXTERNAL;
PROCEDURE  set_active_limits( min, max, function );
   VALUE   min, max, function;
   QUAD    min, max;
   INTEGER function;                                       EXTERNAL;
```

```
SACTTBL.WORK.PD8510           THU, DEC 22, 1983, 10:21 AM     PAGE   1

M68KL,P,"acttbl"
BEGIN

#FILE catable2.work;
#FILE fatables.work;
#FILE cchtable.work;
#FILE fchtable.work;
#FILE fchtab2.work;
#FILE cdatap.work;                       & for max_format &
```

```
SACTTBL.WORK.PD8510              THU, DEC 22, 1983, 10:21 AM      PAGE   2

#EJECT;
COMMENT                                                            ch_get_active
*****************************************************************************
*
*****************************************************************************
;
INTEGER PROCEDURE ch_get_active( source, function, ch );
   VALUE   source, function, ch;
   INTEGER source, function, ch;
   BEGIN & ch_get_active &
      INTEGER POINTER integer_table;
      BYTE    POINTER byte_table = integer_table;
      INTEGER         index,
                      dependency;
      BYTE            type;

      STPNTR( integer_table, active_tables[source] );
      type := active_table_type[source];

      IF type = byte_type THEN
         BEGIN
            index := byte_table[ function ];
            IF index < 0 THEN
               dependency := byte_table[index];
         END
      ELSE & type = integer_type &
         BEGIN
            index := integer_table[ function ];
            IF index < 0 THEN
               dependency := integer_table[index];
         END;

      IF index < 0 THEN
         BEGIN & if &
            IF dependency = format_dependent THEN
               index := index + ch_integer( ch_format, ch )
            ELSE IF dependency = domain_dependent THEN
               index := index + ch_integer( ch_domain, ch ) + 1
            ELSE
               index := index + ch_integer( ch_format, ch ) +
                        ch_integer( ch_domain, ch ) * max_format;

            IF type = byte_type THEN
               index := byte_table[index]
            ELSE & type = integer_type &
               index := integer_table[index];
         END;  & if &

      ch_get_active := index;

   END;  & ch_get_active &
```

```
SACTTBL.WORK.PD8510              THU, DEC 22, 1983, 10:21 AM      PAGE   3

#EJECT;
COMMENT                                                               get_active
*****************************************************************************
*
*****************************************************************************
;
INTEGER PROCEDURE get_active( source, function );
   VALUE   source, function;
   INTEGER source, function;                                          ENTRY;
   BEGIN & get_active &

      get_active := ch_get_active( source, function, current_entry_ch );

   END;  & get_active &
```

```
SACTTBL.WORK.PD8510              THU, DEC 22, 1983, 10:21 AM      PAGE   4

#EJECT;
COMMENT                                                        ch_active_suffix
*****************************************************************************
*
*****************************************************************************
;
ALPHA PROCEDURE ch_active_suffix( function, ch );
   VALUE   function, ch;
   INTEGER function, ch;                                              ENTRY;
   BEGIN & ch_active_suffix &
      ch_active_suffix := suffix[ ch_get_active( get_suffix_index,
                                                  function,
                                                  ch
                                                )
                                ];
   END;  & ch_active_suffix &
```

```
SACTTBL.WORK.PD8510              THU, DEC 22, 1983, 10:21 AM      PAGE   5

#EJECT;
COMMENT                                                           active_suffix
*****************************************************************************
*
*****************************************************************************
;
ALPHA PROCEDURE active_suffix( function );
   VALUE   function;
   INTEGER function;                                                  ENTRY;
   BEGIN & active_suffix &
      active_suffix := ch_active_suffix( function, current_entry_ch );
   END;  & active_suffix &
```

```
#EJECT;
COMMENT                                                    ch_active_format
*************************************************************************
*
*************************************************************************
;
DOUBLE PROCEDURE ch_active_format( function, ch );
   VALUE   function, ch;
   INTEGER function, ch;                                           ENTRY;
   BEGIN & ch_active_format &
      INTEGER index;
      DOUBLE  fmt;

      index := ch_get_active( get_format_index, function, ch );
      fmt := format_table[ index ];
      IF index = 2 THEN              & value is stored in scaled form &
         BEGIN & if stored scaled &
            index := ch_get_active( get_log_scale_div_3, function, ch );
            fmt := fmt OR (index * 48);                     & 48 = 3*16 &
         END;  & if stored scaled &
      ch_active_format := fmt;

   END;  & ch_active_format &
```

```
#EJECT;
COMMENT                                                        active_format
*************************************************************************
*
*************************************************************************
;
DOUBLE PROCEDURE active_format( function );
   VALUE   function;
   INTEGER function;                                               ENTRY;
   BEGIN & active_format &
      active_format := ch_active_format( function, current_entry_ch );
   END;  & active_format &
```

```
#EJECT;
COMMENT                                                        active_limits
*************************************************************************
*
*************************************************************************
;
BOOLEAN PROCEDURE active_limits( min, max, function );
   VALUE   function;
   QUAD    min, max;
   INTEGER function;                                               ENTRY;
   BEGIN & active_limits &
      INTEGER index;

      index := get_active(get_min_limit_index, function);

      IF index <> 0 THEN
         BEGIN & if &
            min := limit[ index ];
            max := limit[ get_active( get_max_limit_index, function ) ];
         END;  & if &

      active_limits := (index <> 0);

   END;  & active_limits &
```

```
#EJECT;
COMMENT                                                   ch_set_active_limits
*************************************************************************
*
*************************************************************************
;
PROCEDURE  ch_set_active_limits( min, max, function, ch );
   VALUE   min, max, function, ch;
   QUAD    min, max;
   INTEGER function, ch;                                           ENTRY;
   BEGIN & ch_set_active_limits &
      INTEGER index;
      INTEGER POINTER source,
                      dest;
      DOUBLE  address;

      index := ch_get_active( get_min_limit_index, function, ch );

      IF index <> 0 THEN
         BEGIN & if &
            address := ADRS(limit) + ALEFT(index,3);
            STPNTR( source, ADRS(min) );
            STPNTR( dest,   address );
            MOVE dest := source, +(4);

            index := ch_get_active( get_max_limit_index, function, ch );
            address := ADRS(limit) + ALEFT(index,3);
            STPNTR( source, ADRS(max) );
            STPNTR( dest,   address );
            MOVE dest := source, +(4);
         END;  & if &

   END;  & ch_set_active_limits &
```

```
SACTTBL.WORK.PD8510              THU, DEC 22, 1983, 10:22 AM      PAGE  10

REJECT;
COMMENT                                                         set_active_limits
******************************************************************************
*
******************************************************************************
;
PROCEDURE  set_active_limits( min, max, function );
   VALUE   min, max, function;
   QUAD    min, max;
   INTEGER function;                                               ENTRY;
   BEGIN & set_active_limits &

      ch_set_active_limits( min, max, function, current_entry_ch );

   END;  & set_active_limits &

END$
```

```
CACTVO.WORK.PD8510              THU, DEC 22, 1983, 10:22 AM      PAGE   1

REAL    CONSTANT scale_factor             := 1.0@12,
                 elec_delay_factor        := 1.0@15,
                 unscale                  := 1.0@-12,    & 1/scale      &
                 unscale_elec_delay       := 1.0@-15,
                 scaled_hundredth         := 1.0@10,     & scale/100    &
                 scaled_thousandth        := 1.0@9;      & scale/1000   &
QUAD    CONSTANT quad_scaled_one          := 1000000000000,
                 quad_aux_out_scaled      := 4882812500, &scaled 10/2048&
                 quad_ten                 := 10,
                 quad_ten_scaled          := 10000000000000,
                 quad_hundred             := 100,
                 quad_thousand            := 1000,
                 quad_scaled_hundreth     := 10000000000,
                 quad_scaled_twentieth    := 50000000000;
INTEGER CONSTANT string_size              := 64;
```

```
FACTVO.WORK.PD8510              THU, DEC 22, 1983, 10:22 AM      PAGE   1

#FILE cactv0.work;

EXTERNAL INTEGER log_scale_factor_div_3;
EXTERNAL INTEGER POINTER peek_n_poke;
EXTERNAL INTEGER active_function;
EXTERNAL QUAD    active_fcn_value;
EXTERNAL BYTE    rpg_algorithm;
EXTERNAL BYTE    step_algorithm;
EXTERNAL BYTE    mkr_algorithm;
EXTERNAL BYTE    keypad_algorithm;
EXTERNAL BOOLEAN scaled;
EXTERNAL BYTE    display_format;

PROCEDURE  enter_active_function;                              EXTERNAL;
QUAD PROCEDURE limit_quad(number, function);
   VALUE   number, function;
   QUAD    number;
   INTEGER function;                                           EXTERNAL;
```

```
SACTVO.WORK.PD8510              THU, DEC 22, 1983, 10:22 AM      PAGE   1

M68KL,P,"actv0"
BEGIN

#FILE fchtable.work;
#FILE fchtab2.work;                                   & for ch_integer &
#FILE cchtable.work;
#FILE fmarker.work;
#FILE fkernel.work;                          & for acquire and release &
#FILE crins.work;                          & for active_function_rin &
#FILE fcontrol.work;                                     & for n_sweep &
#FILE fpubib.work;               & for request_mask and set_..._address &
#FILE cactv0.work;                                 & for scale constants &
#FILE cactv1.work;                                     & for active_... &
#FILE factv2.work;
#FILE ffmt.work;                     & for format_quad and format_real &
#FILE ccontvar.work;                               & for max_parameter &
#FILE fcontv2.work;                                      & for rebuild &
#FILE fdatap1.work;                        & for control_data_proc_freq &
#FILE fchpfr.work;                      & for elec_delay, scale, ref_... &
#FILE facttbl.work;                              & for get_active, etc. &
#FILE fstring.work;
#FILE fcommand.work;
#FILE fstimuli.work;          & for set_stimulus_mode and set_aux_out &
#FILE fcnv9x.work;                                         & for CNV92 &
#FILE cnewline.work;                                     & for newline &
#FILE fdomain.work;                            & for update_domain_vars &
#FILE fannot.work;           & for update_scale and annotate_rev_value &
#FILE ftrace.work;                         & for annotate_ref_position &
#FILE fstds2.work;   & for cal_std_addr, std_id, and std_class_element &
#FILE fprivib.work;         & for wrt_priv_ib and wrt_priv_ib_source &
#FILE fprivib2.work;                  & for get_ and set_priv_ib_lun &
#FILE ftitle.work;                             & for select_title_char &
#FILE futil.work;                                  & for tell and warn &
#FILE fchdata2.work;                              & for srq_mask, etc. &
#FILE fdispram.work;                                 & for wrt_disp_... &
#FILE fmathfun.work;                               & for speed_of_light &
#FILE ftestset.work;                               & for build_test_set &
#FILE fgratic.work;                                  & for type_of_grat &

QUAD PROCEDURE CNV2A(number);
   VALUE   number;
   REAL    number;                                               EXTERNAL;
REAL PROCEDURE CNVA2(number);
   VALUE   number;
   QUAD    number;                                               EXTERNAL;
PROCEDURE signal_init(signal,count);
   VALUE   signal,count;
   INTEGER signal,count;                                         EXTERNAL;


INTEGER CONSTANT copyright := 215;
ALPHA   CONSTANT copyright_notice :=
               " Copyright "+copyright+" HEWLETT-PACKARD COMPANY 1983";
```

SACTVO.WORK.PD8510 THU, DEC 22, 1983, 10:22 AM PAGE 2

```
INTEGER CONSTANT max_marker := 5;               & borrowed from smarker &

GLOBAL BOOLEAN scaled;                          & active_fcn_value is scaled &
GLOBAL INTEGER log_scale_factor_div_3;          & indicates scale factor size &
GLOBAL INTEGER active_function;
GLOBAL QUAD active_fcn_value;                   & an "own" variable for this module &
QUAD    active_fcn_alt_value;                   & an alternate value for display.  &

GLOBAL INTEGER POINTER peek_n_poke;             & peek and poke address &
GLOBAL BYTE    rpg_algorithm;
GLOBAL BYTE    step_algorithm;
GLOBAL BYTE    mkr_algorithm;
GLOBAL BYTE    keypad_algorithm;
GLOBAL BYTE    display_format;
INTEGER units;
REAL   scale_multiplier,
       unscale_multiplier;
```

SACTVO.WORK.PD8510 THU, DEC 22, 1983, 10:22 AM PAGE 3

```
#EJECT;
COMMENT                                                             limit_quad
**************************************************************************
*
**************************************************************************
;
QUAD PROCEDURE limit_quad(number, function);
   VALUE  number, function;
   QUAD   number;
   INTEGER function;                                                   ENTRY;
   BEGIN & limit_quad &
      QUAD min,
           max;

      IF active_limits( min, max, function ) THEN
         IF number <= min THEN
            limit_quad := min
         ELSE IF number >= max THEN
            limit_quad := max
         ELSE & min <= number <= max &
            limit_quad := number
      ELSE & do not limit &
         limit_quad := number;

   END;  & limit_quad &
```

SACTVO.WORK.PD8510 THU, DEC 22, 1983, 10:22 AM PAGE 4

```
#EJECT;
COMMENT                                              display_active_fcn_value
**************************************************************************
*
**************************************************************************
;
PROCEDURE  display_active_fcn_value;
   BEGIN & display_active_fcn_value &
      REAL      active_fcn_real;
      DOUBLE    fmt;
      BYTE ARRAY display_array[-1:string_size];
      ALPHA     display_string;
      QUAD POINTER value_ptr;

      & initialize string &
      display_string := ADRS( display_array );
      display_string := init_string( display_string, string_size );

      & get format     see "suffix" table for constant declarations.   &
      IF ( (units=2) OR (units=5) OR (units=15) ) THEN  & suffix is dB &
         display_format := db_format                  & avoid mdB,etc&
      ELSE  & normal (non-dB) suffix &
         display_format := get_active(get_format_index,active_function);

      IF display_format <> 0 THEN
         BEGIN & if &
            fmt := format_table[ display_format ];
            & enter format bias (scale factor) &
            fmt := fmt OR (log_scale_factor_div_3 * 48);  & 48 <= 3*16 &

            append_string( format_quad(
                  IF get_active(get_display_alt_value, active_function)
                        = display_alt THEN
                     active_fcn_alt_value
                  ELSE
                     active_fcn_value,
                  display_string,
                  fmt              ),
                        suffix[ units ]
                      );
            IF active_function = active_scale THEN
               append_string( display_string, "/div" );
         END;  & if &

      & fill new string &
      print_big_string( display_string,
                        entry_size2,
                        IF entry_flip_flop THEN entry_display2
                                          ELSE entry2_display2
                      );
      entry_flip_flop := NOT entry_flip_flop;
      & turn off old string &
      print_string( "",
                    entry_size2,
                    IF entry_flip_flop THEN entry_display2
                                      ELSE entry2_display2
```

SACTVO.WORK.PD8510 THU, DEC 22, 1983, 10:22 AM PAGE 5

```
                  );

      & print the auxiliary string -- may be blank &
      & active_title does some special formatting itself &
      IF active_function <> active_title THEN
         BEGIN & if &
            IF units = 6 THEN        & seconds -- add distance readout &
               BEGIN & if &
                  active_fcn_real := REAL(active_fcn_value) *
                                     speed_of_light;
                  active_fcn_real := active_fcn_real*unscale_multiplier;
                  append_string( format_real( active_fcn_real,
                                              entry_aux,
                                              format_table[
                                                      distance_format
                                                          ]
                                            ),
                                 suffix[ distance_suffix ]
                               );
                  IF active_function = active_scale THEN
                     append_string( entry_aux, "/div" );
               END;  & if &
            print_string(entry_aux,entry_aux_size2,entry_aux_display2);
         END;  & if &

   END;  & display_active_fcn_value &
```

```
SACTVO.WORK.PD8510            THU, DEC 22, 1983, 10:22 AM      PAGE   6

#EJECT;
COMMENT                                                    activate_marker
**************************************************************************
*
**************************************************************************
;
SUBROUTINE activate_marker;
   BEGIN & activate_marker &
      & limit here for both select_ and enter_ to assure that no         &
      & marker is activated outside of the current stimulus range.       &
      active_fcn_value := limit_quad(active_fcn_value, active_function);
      set_entry_ch_quad( active_fcn_value,
                        get_active(get_chtable_index, active_function)
                       );
      active_fcn_alt_value := mkr_stimulus_value;   & align on a point &
      put_marker( active_marker );
      annotate_mkr_value;
   END;  & activate_marker &
```

```
SACTVO.WORK.PD8510            THU, DEC 22, 1983, 10:22 AM      PAGE   7

#EJECT;
COMMENT                                                check_update_domain
**************************************************************************
*
**************************************************************************
;
SUBROUTINE check_update_domain;
   BEGIN & check_update_domain &
      INTEGER mkr;

      IF ( (ch_integer(ch_gating,1) = gate_on) OR
           (ch_integer(ch_gating,2) = gate_on)
         ) THEN
         update_domain_vars;

      FOR mkr := max_marker TO (max_marker + 3) DO
         put_marker( mkr );

   END;  & check_update_domain &
```

```
SACTVO.WORK.PD8510            THU, DEC 22, 1983, 10:22 AM      PAGE   8

#EJECT;
COMMENT                                            select_active_function
**************************************************************************
*
**************************************************************************
;
PROCEDURE  select_active_function( which_function );
   VALUE   which_function;
   INTEGER which_function;                                          ENTRY;
   BEGIN & select_active_function &
      INTEGER algorithm,
              index,
              addr;
      REAL    active_fcn_real;
      INTEGER POINTER src,
                      dst;
      REAL POINTER    real_ptr = dst;

      acquire( active_function_rin );
      clear_string( entry_aux );

      IF which_function <> active_previous THEN
         active_function := which_function;

      & label the display &
      print_big_string( active_function_label[ active_function ],
                        function_size2,
                        function_display2
                      );

      index     := get_active( get_chtable_index, active_function );
      units     := get_active( get_suffix_index,  active_function );
      algorithm := get_active( get_algorithms,    active_function );

      step_algorithm   := algorithm AND %000F;
      algorithm        := RIGHT( algorithm, 4 );
      rpg_algorithm    := algorithm AND %000F;
      algorithm        := RIGHT( algorithm, 4 );
      mkr_algorithm    := algorithm AND %000F;
      algorithm        := RIGHT( algorithm, 4 );
      keypad_algorithm := algorithm AND %0007;


      log_scale_factor_div_3 := get_active( get_log_scale_div_3,
                                            active_function
                                          );
      scaled := (log_scale_factor_div_3 <> 0);
      scale_multiplier   := scale_factors[log_scale_factor_div_3];
      unscale_multiplier := unscale_factors[log_scale_factor_div_3];

      CASE get_active(get_chtable_type, active_function) OF
         BEGIN & case &
& none      &  ;
& byte      &  ; & bytes are no longer used in the chtable &
& integer   &  active_fcn_value := entry_ch_integer( index );
& user3     &  ; & not currently used &
```

```
SACTVO.WORK.PD8510            THU, DEC 22, 1983, 10:22 AM      PAGE   9

& real         & active_fcn_value := entry_ch_real( index ) *
                                                      scale_multiplier;
& double       & ; & not currently used &
& quad         & active_fcn_value := entry_ch_quad( index );
         END;  & case &


      & do the unique stuff &
      CASE active_function OF
         BEGIN & case &
& 0 off             &  ;
& 1 start           &  set_stimulus_mode( start_stop );
& 2 stop            &  set_stimulus_mode( start_stop );
& 3 center          &  set_stimulus_mode( center_span );
& 4 span            &  set_stimulus_mode( center_span );
& 5 cw              &  ;
& 6 sweep time      &  ;
& 7 source power    &  ;
& 8 power slope     &  ;
& 9 port 1 atten    &  ;
& 10 port 2 atten   &  ;
& 11 ref pos'n      &  ;
& 12 scale/div      &  ;
& 13 ref value      &  ;
& 14 unused         &  warn( command_not_implemented );
& 15 title          &  BEGIN & title &
                          tell( titling_instructions );
                          active_fcn_value := 48;  & 2 x initial char &
                          select_title_char( 13 );          & 1 + n/4 &
                       END;  & title &
                                      & must be same as # groups kbd  &
& 16 # groups hpib  &  ;
& 17 if avg factor  &  ;
& 18 smoothing aper.&  BEGIN & smoothing aperture &
                          active_fcn_real :=
                             REAL( entry_ch_quad(ch_span_stimulus) ) *
                             entry_ch_real(ch_smoothing_aperture)    /
                             100.0;
                          append_string(
                                format_real( active_fcn_real,
                                             entry_aux,
                                             format_table[
                                                   aperture_format
                                                   ]
                                           ),
                                active_suffix( active_span )
                                     );
                       END;  & smoothing aperture &
& 19 srq mask prim. &  active_fcn_value :=
                             srq_mask_primary;
& 20 srq mask secon.&  active_fcn_value :=
                             srq_mask_secondary;
& 21 revision       &  entry_aux := append_string( entry_aux,
                                                 copyright_notice
                                               );
& 22 aux out        &  BEGIN & auxiliary output voltage &
                          active fcn value := quad aux_out_scaled *
```

```
SRCTVO.WORK.PD8510              THU, DEC 22, 1983, 10:22 AM     PAGE  10


                                 entry_ch_quad( ch_center_aux_out );
                             END;  & auxiliary output voltage &
& 23 keycode          &      ;
& 24 elec delay       &      ;
& 25 phase offset     &      ;
& 26 marker1          &      activate_marker;
& 27 marker2          &      activate_marker;
& 28 marker3          &      activate_marker;
& 29 marker4          &      activate_marker;
& 30 marker5          &      activate_marker;
& 31 address          &      active_fcn_value := ADRS( peek_n_poke );
& 32 peek             &      active_fcn_value := peek_n_poke;
& 33 poke             &      active_fcn_value := 0;
& 34 open c0          &      BEGIN
                                STPNTR( real_ptr,
                                        cal_std_addr + c0_offset
                                      );
                                active_fcn_value := QUAD( scale_multiplier *
                                                          real_ptr
                                                        );
                             END;
& 35 open c1          &      BEGIN
                                STPNTR( real_ptr,
                                        cal_std_addr + c1_offset
                                      );
                                active_fcn_value := QUAD( scale_multiplier *
                                                          real_ptr
                                                        );
                             END;
& 36 open c2          &      BEGIN
                                STPNTR( real_ptr,
                                        cal_std_addr + c2_offset
                                      );
                                active_fcn_value := QUAD( scale_multiplier *
                                                          real_ptr
                                                        );
                             END;
& 37 gate start       &      ;
& 38 gate stop        &      BEGIN
                                active_fcn_value :=
                                          entry_ch_quad(ch_gate_center);
                                active_fcn_value :=
                                          active_fcn_value +
                                          active_fcn_value -
                                          entry_ch_quad(ch_gate_start);
                             END;
& 39 gate center      &      ;
& 40 gate span        &      BEGIN
                                active_fcn_value :=
                                          entry_ch_quad(ch_gate_center) -
                                          entry_ch_quad(ch_gate_start);
                                active_fcn_value := active_fcn_value +
                                                    active_fcn_value;
                             END;
& 41 mag slope        &      ;
& 42 mag offset       &      ;
```

```
SRCTVO.WORK.PD8510              THU, DEC 22, 1983, 10:22 AM     PAGE  11


& 43 stimulus slope &        ;
& 44 stimulus offset&        ;
& 45 ref plane 1      &      ;
& 46 ref plane 2      &      ;
& 47 system z0        &      ;
& 48 major addr       &      active_fcn_value := get_priv_ib_lun(major);
& 49 minor addr       &      active_fcn_value := get_priv_ib_lun(minor);
& 50 pass thru addr &        active_fcn_value :=
                                         get_priv_ib_lun(priv_ib_pass);
& 51 source addr      &      active_fcn_value := get_priv_ib_lun(source);
& 52 test-set addr    &      active_fcn_value := get_priv_ib_lun(test_set);
& 53 plotter addr     &      active_fcn_value := get_priv_ib_lun(plotter);
& 54 printer addr     &      active_fcn_value := get_priv_ib_lun(printer);
& 55 ch cmd addr      &      active_fcn_value :=
                                        get_priv_ib_lun(user_device_1);
& 56 offset delay     &      BEGIN
                                STPNTR( real_ptr,
                                        cal_std_addr + delay_offset
                                      );
                                active_fcn_value := QUAD( scale_multiplier *
                                                          real_ptr
                                                        );
                             END;
& 57 offset loss      &      BEGIN
                                STPNTR( real_ptr,
                                        cal_std_addr + loss_offset
                                      );
                                active_fcn_value := QUAD( scale_multiplier *
                                                          real_ptr
                                                        );
                             END;
& 58 offset z0        &      BEGIN
                                STPNTR( real_ptr,
                                        cal_std_addr + z0_offset
                                      );
                                active_fcn_value := QUAD( scale_multiplier *
                                                          real_ptr
                                                        );
                             END;
& 59 offset min f     &      BEGIN
                                STPNTR( real_ptr,
                                        cal_std_addr + f_min_offset
                                      );
                                active_fcn_value := real_ptr;
                             END;
& 60 offset max f     &      BEGIN
                                STPNTR( real_ptr,
                                        cal_std_addr + f_max_offset
                                      );
                                active_fcn_value := real_ptr;
                             END;
& 61 std id           &      BEGIN
                                active_fcn_value := current_std_id;
                             END;
& 62 std class        &      BEGIN
                                active_fcn_value := 1;
```

```
SRCTVO.WORK.PD8510              THU, DEC 22, 1983, 10:22 AM     PAGE  12


                             END;
& 63 # groups kbd   &        ;           & must be same as # groups hpib &
         END;  & case &

      display_active_fcn_value;

      release( active_function_rin );

   END;  & select_active_function &
```

```
SRCTVO.WORK.PD8510              THU, DEC 22, 1983, 10:22 AM     PAGE  13

#EJECT;
COMMENT                                                     select_active_off
*************************************************************************
*
*  Turns off the active function if and only if the specified function
*  (which_function) is the current active function.
*
*************************************************************************
;
PROCEDURE  select_active_off( which_function );
   VALUE    which_function;
   INTEGER which_function;                                          ENTRY;
   BEGIN & select_active_off &
      IF which_function = active_function THEN
         select_active_function( active_off );
   END;  & select_active_off &
```

```
$EJECT;
COMMENT                                          enter_active_function
************************************************************************
*
************************************************************************
;
PROCEDURE  enter_active_function;                                 ENTRY;
   BEGIN & enter_active_function &
      BYTE   ARRAY   enter_array[-1:string_size];
      ALPHA      enter_string;
      QUAD       min,
                 temp_quad;
      REAL       active_fcn_real,
                 temp_real;
      INTEGER    position,
                 atten_nmbr,
                 ch_atten_port,
                 index;
      BYTE   POINTER  ch;

      SUBROUTINE set_atten;
         BEGIN & set_atten &
            abort_sweep;
            read_priv_ib( test_set,
                          atten_nmbr,
                          append_string( format_quad( active_fcn_value,
                                                      enter_string,
                                                      format_table[
                                                    test_set_atten_format
                                                            ] OR
                                                       %000000C0
                                                    ),
                                         newline+"OR"
                                       ),
                          enter_string
                        );
            position := 1;
            active_fcn_real := CNV92( enter_string, position );
            set_entry_ch_real( active_fcn_real, ch_atten_port );
            active_fcn_value := active_fcn_real * scale_multiplier;
            build_test_set;
            restart_sweep;                           & also resets averaging &
         END;  & set_atten &

      & initialize string &
      enter_string := ADRS(enter_array);
      enter_string := init_string(enter_string,
                                  string_size
                                 );
      clear_string( entry_aux );

      active_fcn_value := limit_quad(active_fcn_value, active_function);


      & store value -- done here so chtable values can be used later &
      IF get_active(get_chtable_store, active_function) = store THEN
```

```
         BEGIN & if &
            index := get_active( get_chtable_index, active_function );
            CASE get_active(get_chtable_type, active_function) OF
               BEGIN & case &
& none         &  ;
& byte         &  ; & bytes are no longer used in the chtable &
& integer      &  set_entry_ch_integer( active_fcn_value, index );
& user3        &  ; & not currently used &
& real         &  BEGIN & real &
                     active_fcn_real := REAL(active_fcn_value) *
                                                    unscale_multiplier;
                     set_entry_ch_real( active_fcn_real, index );
                  END;  & real &
& double       &  ; & not currently used &
& quad         &  set_entry_ch_quad( active_fcn_value, index );
               END;  & case &
         END;  & if &


      CASE active_function OF
         BEGIN & case &
&  0 off          &  ;
&  1 start        &  IF entry_ch_integer( ch_domain ) =
                           freq_domain THEN
                        wrt_priv_ib_source(
                                 fa,
                                 append_ch(
                                    format_quad(
                                       active_fcn_value,
                                       enter_string,
                                       format_table[
                                                frequency_format
                                                  ]
                                               ),
                                    newline
                                          )
                                    )
                     ELSE
                        BEGIN & else &
                           set_entry_ch_quad( active_fcn_value,
                                              ch_start_stimulus
                                            );
                           update_center;
                           check_update_domain;
                        END;  & else &
&  2 stop         &  IF entry_ch_integer( ch_domain ) =
                           freq_domain THEN
                        wrt_priv_ib_source(
                                 fb,
                                 append_ch(
                                    format_quad(
                                       active_fcn_value,
                                       enter_string,
                                       format_table[
                                                frequency_format
                                                  ]
```

```
                                               ),
                                    newline
                                          )
                                    )
                     ELSE
                        BEGIN & else &
                           set_entry_ch_quad( active_fcn_value,
                                              ch_stop_stimulus
                                            );
                           update_center;
                           check_update_domain;
                        END;  & else &
&  3 center       &  IF entry_ch_integer( ch_domain ) =
                           freq_domain THEN
                        wrt_priv_ib_source(
                                 cf,
                                 append_ch(
                                    format_quad(
                                       active_fcn_value,
                                       enter_string,
                                       format_table[
                                                frequency_format
                                                  ]
                                               ),
                                    newline
                                          )
                                    )
                     ELSE
                        BEGIN & else &
                           set_entry_ch_quad( active_fcn_value,
                                              ch_center_stimulus
                                            );
                           update_start;
                           check_update_domain;
                        END;  & else &
&  4 span         &  IF entry_ch_integer( ch_domain ) =
                           freq_domain THEN
                        wrt_priv_ib_source(
                                 df,
                                 append_ch(
                                    format_quad(
                                       active_fcn_value,
                                       enter_string,
                                       format_table[
                                                frequency_format
                                                  ]
                                               ),
                                    newline
                                          )
                                    )
                     ELSE
                        BEGIN & else &
                           set_entry_ch_quad( active_fcn_value,
                                              ch_span_stimulus
                                            );
                           update_start;
```

```
                           check_update_domain;
                        END;  & else &
&  5 cw           &  IF entry_ch_integer( ch_domain ) =
                           freq_domain THEN
                        wrt_priv_ib_source(
                                 cw,
                                 append_ch(
                                    format_quad(
                                       active_fcn_value,
                                       enter_string,
                                       format_table[
                                                frequency_format
                                                  ]
                                               ),
                                    newline
                                          )
                                    )
                     ELSE
                        BEGIN & else &
                           set_entry_ch_quad( active_fcn_value,
                                              ch_center_stimulus
                                            );
                           update_start;
                           check_update_domain;
                        END;  & else &
&  6 sweep time   &  BEGIN & sweep time &
                        wrt_priv_ib_source(
                                 st,
                                 append_ch(
                                    format_quad(
                                       active_fcn_value,
                                       enter_string,
                                       format_table[
                                               sweep_time_format
                                                  ] OR
                                               %000000C0
                                               ),
                                    newline
                                          )
                                    );
                     END;  & sweep time &
&  7 source power &  BEGIN & source power &
                        read_priv_ib( source,
                                 pl,
                                 append_string(
                                    format_quad(
                                       active_fcn_value,
                                       enter_string,
                                       format_table[
                                               source_pwr_format
                                                  ] OR
                                               %000000C0
                                               ),
                                    newline+"OR"
                                          ),
                                 enter_string
```

```
SRCTVO.WORK.PD8510          THU, DEC 22, 1983, 10:22 AM      PAGE  18

                            );
                  position := 1;
                  active_fcn_real := CNV92( enter_string,
                                             position
                                          );
                  set_entry_ch_real( active_fcn_real,
                                      ch_source_power
                                   );
                  active_fcn_value := active_fcn_real *
                                             scale_multiplier;
               END;  & source power &
&  8 power slope    &  BEGIN & power slope &
                  read_priv_ib( source,
                                sl1,
                                append_string(
                                   format_quad(
                                      active_fcn_value,
                                      enter_string,
                                      format_table[
                                            source_pwr_format
                                                ] OR
                                         %000000C0
                                            ),
                                   newline+"OR"
                                          ),
                                enter_string
                              );
                  position := 1;
                  active_fcn_real := CNV92( enter_string,
                                             position
                                          );
                  set_entry_ch_real( active_fcn_real,
                                      ch_power_slope
                                   );
                  active_fcn_value := active_fcn_real *
                                             scale_multiplier;
               END;  & power slope &
&  9 port 1 atten   &  BEGIN & port 1 atten &
                  atten_nmbr := atten1;
                  ch_atten_port := ch_atten_port1;
                  set_atten;
               END;  & port 1 atten &
& 10 port 2 atten   &  BEGIN & port 2 atten &
                  atten_nmbr := atten2;
                  ch_atten_port := ch_atten_port2;
                  set_atten;
               END;  & port 2 atten &
& 11 ref pos'n      &  BEGIN & ref pos'n &
                  index := entry_ch_integer(ch_format);
                  IF type_of_grat[ index ] <> rectangular THEN
                     index := fnt_log_polar;
                  wrt_disp_real( ADRS(
                     ref_position[ index,
                                   entry_ch_integer(ch_param),
                                   current_entry_ch
                                 ]
```

```
SRCTVO.WORK.PD8510          THU, DEC 22, 1983, 10:22 AM      PAGE  19

                                 ),
                              active_fcn_real
                            );
                  annotate_ref_position;
                  partial( update_f );
               END;  & ref pos'n &
& 12 scale/div      &  BEGIN & scale/div &
                  index := entry_ch_integer(ch_format);
                  IF type_of_grat[ index ] <> rectangular THEN
                     BEGIN & if polar &
                        index := fnt_log_polar;
                        temp_real := active_fcn_real * 5.0;
                        set_entry_ch_real( temp_real,
                                            ch_ref_value
                                         );
                        wrt_disp_real( ADRS( ref_value[
                                 index,
                                 entry_ch_integer(ch_param),
                                 current_entry_ch
                                                ]
                                           ),
                                 temp_real
                              );
                        annotate_ref_value;
                     END;  & if polar &
                  wrt_disp_real( ADRS(
                           scale[ index,
                                  entry_ch_integer(ch_param),
                                  current_entry_ch
                                ]
                                 ),
                              active_fcn_real
                            );
                  update_scale;
               END;  & scale/div &
& 13 ref value      &  BEGIN & ref value &
                  index := entry_ch_integer(ch_format);
                  IF type_of_grat[ index ] <> rectangular THEN
                     BEGIN & if polar &
                        index := fnt_log_polar;
                        temp_real := active_fcn_real * 0.2;
                        set_entry_ch_real(temp_real, ch_scale);
                        wrt_disp_real( ADRS( scale[
                                 index,
                                 entry_ch_integer(ch_param),
                                 current_entry_ch
                                              ]
                                           ),
                                 temp_real
                              );
                        annotate_scale;
                     END;  & if polar &
                  wrt_disp_real( ADRS(
                        ref_value[ index,
                                   entry_ch_integer(ch_param),
                                   current_entry_ch
```

```
SRCTVO.WORK.PD8510          THU, DEC 22, 1983, 10:22 AM      PAGE  20

                                 ]
                                    ),
                                 active_fcn_real
                              );
                  update_ref_value;
               END;  & ref value &
& 14 unused         &  ;
& 15 title          &  select_title_char(
                         1 + ARIGHT( INTEGER(active_fcn_value), 2 )
                                 );
& 16 # groups hpib  &  BEGIN            & must be same as # groups kbd  &
                                        & except for hold-off.          &
                  n_sweep( active_fcn_value );  & initializes &
                                               & take_sweep_done &
                  release( active_function_rin );
                  wait( take_sweep_done );
                  acquire( active_function_rin );
               END;  & # groups &
& 17 if avg factor  &  BEGIN & if averaging factor &
                  rebuild := TRUE;
                  group_number := 0; & reset averaging number &
               END;  & if averaging factor &
& 18 smoothing aper.&  BEGIN & smoothing aperture &
                  active_fcn_real :=
                     REAL( entry_ch_quad(ch_span_stimulus) ) *
                     entry_ch_real(ch_smoothing_aperture)    /
                     100.0;
                  append_string(
                        format_real( active_fcn_real,
                                     entry_aux,
                                     format_table[
                                              aperture_format
                                                 ]
                                   ),
                        active_suffix( active_span )
                                 );
                  partial( update_d );
               END;  & smoothing aperture &
& 19 srq mask prim. &  BEGIN & srq mask prim. &
                  srq_mask_primary := active_fcn_value;
                  request_mask( srq_mask_primary );   & DEBUG &
                  COMMENT                             & DEBUG &
                - request_mask( LEFT(srq_mask_primary,8) OR
                           (srq_mask_secondary AND %00FF)
                              );
               END;  & srq mask prim. &
& 20 srq mask secon.&  BEGIN & srq mask secon.&
                  srq_mask_secondary := active_fcn_value;
                  request_mask( LEFT(srq_mask_primary,8) OR
                           (srq_mask_secondary AND %00FF)
                              );
               END;  & srq mask secon.&
& 21 revision       &  ;
& 22 aux out        &  BEGIN & auxiliary output voltage &
                  set_entry_ch_quad( active_fcn_value /
                                          quad_aux_out_scaled,
```

```
SRCTVO.WORK.PD8510          THU, DEC 22, 1983, 10:22 AM      PAGE  21

                                  ch_center_aux_out
                                );
                  set_aux_out;
               END;  & auxiliary output voltage &
& 23 keycode        &  BEGIN & keycode &
                  & pass value back as next command &
                  command_token := active_fcn_value;
                  command_pending := TRUE;
               END;  & keycode &
& 24 elec delay     &  BEGIN & electrical delay &
                  wrt_disp_real( ADRS(
                        elec_delay[ entry_ch_integer(ch_param),
                                    current_entry_ch
                                  ]
                                    ),
                              active_fcn_real
                            );
                  control_data_proc_freq(1);         & delay is &
                  control_data_proc_freq(2);         & coupled. &
               END;  & electrical delay &
& 25 phase offset   &  BEGIN & phase offset &
                  control_data_proc_freq(1);
                  control_data_proc_freq(2);
               END;  & phase offset &
& 26 marker1        &  activate_marker;
& 27 marker2        &  activate_marker;
& 28 marker3        &  activate_marker;
& 29 marker4        &  activate_marker;
& 30 marker5        &  activate_marker;
& 31 address        &  STPNTR( peek_n_poke,
                            DOUBLE( active_fcn_value ) AND %FFFFFFFE
                          );
& 32 peek           &  active_fcn_value := peek_n_poke;
& 33 poke           &  peek_n_poke := INTEGER(active_fcn_value);
& 34 open c0        &  BEGIN
                  active_fcn_real := unscale_multiplier *
                                     REAL(active_fcn_value);
                  wrt_disp_real( cal_std_addr + c0_offset,
                                 active_fcn_real
                               );
               END;
& 35 open c1        &  BEGIN
                  active_fcn_real := unscale_multiplier *
                                     REAL(active_fcn_value);
                  wrt_disp_real( cal_std_addr + c1_offset,
                                 active_fcn_real
                               );
               END;
& 36 open c2        &  BEGIN
                  active_fcn_real := unscale_multiplier *
                                     REAL(active_fcn_value);
                  wrt_disp_real( cal_std_addr + c2_offset,
                                 active_fcn_real
                               );
               END;
& 37 gate start     &  BEGIN
```

```
SACTVO.WORK.PD8510          THU, DEC 22, 1983, 10:22 AM     PAGE  22

                    set_entry_ch_quad(
                              entry_ch_quad(ch_gate_center) +
                              ( active_fcn_value -
                                entry_ch_quad(ch_gate_start)
                              ) /2,
                              ch_gate_center
                              );
                    set_entry_ch_quad( active_fcn_value,
                                       ch_gate_start
                                     );
                    check_update_domain;
                  END;
& 38 gate stop    &  BEGIN
                    set_entry_ch_quad(
                              ( entry_ch_quad(ch_gate_start) +
                                active_fcn_value
                              ) / 2,
                              ch_gate_center
                              );
                    set_entry_ch_quad( active_fcn_value,
                                       ch_gate_stop
                                     ); & only for gate markers &
                    check_update_domain;
                  END;
& 39 gate center  &  BEGIN
                    set_entry_ch_quad(
                              entry_ch_quad(ch_gate_start) +
                              active_fcn_value -
                              entry_ch_quad(ch_gate_center),
                              ch_gate_start
                              );
                    set_entry_ch_quad( active_fcn_value,
                                       ch_gate_center
                                     );
                    temp_quad := active_fcn_value -
                                 entry_ch_quad( ch_gate_start );
                    set_entry_ch_quad(
                              entry_ch_quad(ch_gate_start) +
                                  temp_quad + temp_quad,
                              ch_gate_stop
                                     ); & only for gate markers &
                    check_update_domain;
                  END;
& 40 gate span    &  BEGIN
                    temp_quad := active_fcn_value / 2;
                    set_entry_ch_quad(
                              entry_ch_quad(ch_gate_center) -
                                  temp_quad,
                              ch_gate_start
                                     );
                    set_entry_ch_quad(
                              entry_ch_quad(ch_gate_center) +
                                  temp_quad,
                              ch_gate_stop
                                     ); & only for gate markers &
                    check_update_domain;
```

```
SACTVO.WORK.PD8510          THU, DEC 22, 1983, 10:22 AM     PAGE  23

                  END;
& 41 mag slope    &  warn( command_not_implemented );
& 42 mag offset   &  warn( command_not_implemented );
& 43 stimulus slope & warn( command_not_implemented );
& 44 stimulus offset& warn( command_not_implemented );
& 45 ref plane 1  &  BEGIN
                      control_data_proc_freq(1);      & plane is &
                      control_data_proc_freq(2);      & coupled. &
                  END;
& 46 ref plane 2  &  BEGIN
                      control_data_proc_freq(1);      & plane is &
                      control_data_proc_freq(2);      & coupled. &
                  END;
& 47 system z0    &  ;
& 48 major addr   &  BEGIN
                      set_priv_ib_lun(major,     active_fcn_value);
                      set_major_address(active_fcn_value);
                  END;
& 49 minor addr   &  BEGIN
                      set_priv_ib_lun(minor,     active_fcn_value);
                      set_minor_address(active_fcn_value);
                  END;
& 50 pass thru addr & set_priv_ib_lun(priv_ib_pass, active_fcn_value);
& 51 source addr  &  set_priv_ib_lun(source,    active_fcn_value);
& 52 test-set addr & set_priv_ib_lun(test_set,  active_fcn_value);
& 53 plotter addr &  set_priv_ib_lun(plotter,   active_fcn_value);
& 54 printer addr &  set_priv_ib_lun(printer,   active_fcn_value);
& 55 ch cmd addr  &  set_priv_ib_lun(user_device_1,active_fcn_value);
& 56 offset delay &  BEGIN
                      active_fcn_real := REAL(active_fcn_value) *
                                         unscale_multiplier;
                      wrt_disp_real( cal_std_addr + delay_offset,
                                     active_fcn_real
                                   );
                  END;
& 57 offset loss  &  BEGIN
                      active_fcn_real := REAL(active_fcn_value) *
                                         unscale_multiplier;
                      wrt_disp_real( cal_std_addr + loss_offset,
                                     active_fcn_real
                                   );
                  END;
& 58 offset z0    &  BEGIN
                      active_fcn_real := REAL(active_fcn_value) *
                                         unscale_multiplier;
                      wrt_disp_real( cal_std_addr + z0_offset,
                                     active_fcn_real
                                   );
                  END;
& 59 offset min f &  BEGIN
                      active_fcn_real := REAL( active_fcn_value );
                      wrt_disp_real( cal_std_addr + f_min_offset,
                                     active_fcn_real
                                   );
                  END;
& 60 offset max f &  BEGIN
```

```
SACTVO.WORK.PD8510          THU, DEC 22, 1983, 10:22 AM     PAGE  24

                    active_fcn_real := REAL( active_fcn_value );
                    wrt_disp_real( cal_std_addr + f_max_offset,
                                   active_fcn_real
                                 );
                  END;
& 61 std id       &  BEGIN
                      std_id(INTEGER(active_fcn_value));
                  END;
& 62 std class    &  BEGIN
                      std_class_element(INTEGER(active_fcn_value));
                  END;
& 63 # groups kbd &  n_sweep( active_fcn_value ); & must be same as &
                                & # groups hpib except for hold-off &
        END;  & case &

     display_active_fcn_value;

   END;  & enter_active_function &

END$
```

```
CACTV1.WORK.PD8510          THU, DEC 22, 1983, 10:22 AM     PAGE   1

COMMENT    These constants are duplicated from cactive.work.
;
INTEGER CONSTANT  active_off                 :=  0,
                  active_span                :=  4,
                  active_scale               := 12,
                  active_ref_value           := 13,
                  active_title               := 15,
                  active_smoothing_aperture  := 18,
                  active_revision            := 21,
                  active_previous            := -1;
```

```
FACTV1.WORK.PD8510              THU, DEC 22, 1983, 10:22 AM      PAGE   1

PROCEDURE select_active_function(which_function);
   VALUE   which_function;
   INTEGER which_function;                                      EXTERNAL;
```

```
FACTV2.WORK.PD8510              THU, DEC 22, 1983, 10:22 AM      PAGE   1

EXTERNAL INTEGER CONSTANT
      title_size2        ,
      entry_size2        ,
      function_size2     ,
      entry_aux_size2    ,
      title_display2     ,
      entry_display2     ,
      entry2_display2    ,
      function_display2  ,
      entry_aux_display2;

EXTERNAL ALPHA function;
EXTERNAL BYTE ARRAY entry_array[-1:1];                    & dummy size &
EXTERNAL ALPHA entry;
EXTERNAL BYTE ARRAY title_array[-1:1];                    & dummy size &
EXTERNAL ALPHA title;
EXTERNAL BOOLEAN entry_flip_flop;
EXTERNAL ALPHA entry_aux;

PROCEDURE print_string(string,blocklength,block);
   VALUE string,blocklength,block;
   INTEGER blocklength,block;
   ALPHA string;                                             EXTERNAL.L;
PROCEDURE print_big_string(string,blocklength,block);
   VALUE string,blocklength,block;
   INTEGER blocklength,block;
   ALPHA string;                                             EXTERNAL.L;
```

```
SACTV2.WORK.PD8510              THU, DEC 22, 1983, 10:22 AM      PAGE   1

M68KL,P,"actv2"
BEGIN

#FILE cscreen.work;

GLOBAL INTEGER CONSTANT
      title_size2        := title_size,
      entry_size2        := entry_size,
      function_size2     := function_size,
      entry_aux_size2    := entry_aux_size,
      title_display2     := title_display,
      entry_display2     := entry_display,
      entry2_display2    := entry2_display,
      function_display2  := function_display,
      entry_aux_display2 := entry_aux_display;

END$
```

```
FALABEL.WORK.PD8510             THU, DEC 22, 1983, 10:22 AM      PAGE   1

EXTERNAL ALPHA TABLE active_function_label.L;
```

```
SALABEL.WORK.PD8510               THU, DEC 22, 1983, 10:22 AM      PAGE   1

M6XL,P,"alabel"
BEGIN

#FILE cchars.work;

GLOBAL ALPHA TABLE active_function_label := & update CACTIVE file also &
                                             & no active function (off) &
   & 0 &  "",
   & 1 &  "START",
   & 2 &  "STOP",
   & 3 &  "CENTER",
   & 4 &  "SPAN",
   & 5 &  "C.W.",
   & 6 &  "SWEEP TIME",
   & 7 &  "SOURCE POWER",
   & 8 &  "POWER SLOPE",                   & end of source functions &
   & 9 &  "PORT 1 ATTEN.",
   & 10 & "PORT 2 ATTEN.",
   & 11 & "REFERENCE LINE POSITION",
   & 12 & "SCALE",
   & 13 & "REFERENCE VALUE",
   & 14 & "",                                        & unused    &
   & 15 & "TITLE",
   & 16 & "NUMBER OF GROUPS",
   & 17 & "IF AVERAGING FACTOR",
   & 18 & "SMOOTHING APERTURE",
   & 19 & "SRQ MASK (PRIMARY)",
   & 20 & "SRQ MASK (SECONDARY)",
   & 21 & "",          & place holder for revision string address &
   & 22 & "AUX. OUTPUT",
   & 23 & "KEYCODE",
   & 24 & "ELECTRICAL DELAY",
   & 25 & "PHASE OFFSET",
   & 26 & "MARKER 1    ",
   & 27 & "MARKER 2    ",
   & 28 & "MARKER 3    ",
   & 29 & "MARKER 4    ",
   & 30 & "MARKER 5    ",
   & 31 & "PEEK/POKE ADDRESS",
   & 32 & "PEEK",
   & 33 & "POKE",
   & 34 & half_vt+"C"+176+" (x10"+139+"-15"+138+" F)",
   & 35 & half_vt+"C"+177+" (x10"+139+"-27"+138+" F/Hz)",
   & 36 & half_vt+"C"+178+" (x10"+139+"-36"+138+" F/Hz"+181+")",
   & 37 & "GATE START",
   & 38 & "GATE STOP",
   & 39 & "GATE CENTER",
   & 40 & "GATE SPAN",
   & 41 & "MAGNITUDE SLOPE",
   & 42 & "MAGNITUDE OFFSET",
   & 43 & "STIMULUS SLOPE",
   & 44 & "STIMULUS OFFSET",
   & 45 & "PORT 1 REF. PLANE",
   & 46 & "PORT 2 REF. PLANE",
   & 47 & "Z"+176,
   & 48 & "8510 HP-IB ADDRESS",
```

```
SALABEL.WORK.PD8510               THU, DEC 22, 1983, 10:22 AM      PAGE   2

   & 49 & "8510 HP-IB MINOR ADDRESS",
   & 50 & "PASS-THRU HP-IB ADDRESS",
   & 51 & "SOURCE HP-IB ADDRESS",
   & 52 & "TEST-SET HP-IB ADDRESS",
   & 53 & "PLOTTER HP-IB ADDRESS",
   & 54 & "PRINTER HP-IB ADDRESS",
   & 55 & "AUTO COMMAND HP-IB ADDRESS",
   & 56 & "OFFSET DELAY",
   & 57 & "OFFSET LOSS",
   & 58 & "OFFSET Z"+176,
   & 59 & "MIN. USABLE FREQUENCY",
   & 60 & "MAX. USABLE FREQUENCY",
   & 61 & "CALIBRATION STANDARD #",
   & 62 & "CALIBRATION STANDARD #",
   & 63 & "NUMBER OF GROUPS",
   & 99 & "";                                   & simply a place holder &

END$
```

```
CALPHAS.WORK.PD8510               THU, DEC 22, 1983, 10:22 AM      PAGE   1

#FILE cmessag0.work;
#FILE cmsgpriv.work;
#FILE cmsgtape.work;
#FILE cmsgmbm.work;
#FILE cmsgplot.work;
#FILE cmsgib.work;
#FILE cmessag1.work;
#FILE cmsgcal.work;
#FILE cmsgtime.work;
#FILE cprtdata.work;
```

```
DALPHAS.WORK.PD8510               THU, DEC 22, 1983, 10:22 AM      PAGE   1

null_message = 0
" "

command_not_implemented = 2
"COMMAND NOT IMPLEMENTED"

option_omitted = 26
"SOFTWARE OPTION NOT INCLUDED"

invalid_command = 55
"INVALID COMMAND"

exceeded_available_memory = 71
"UNABLE TO ALLOCATE REQUESTED MEMORY"

source_ib_err = 107
"SOURCE SYNTAX ERROR"

test_set_ib_err = 127
"TEST-SET SYNTAX ERROR"

priv_ib_add_err = 149
"SYSTEM BUS ADDRESS ERROR"

priv_ib_srq_err = 174
"SYSTEM BUS SRQ ERROR"

no_tape = 195
"NO TAPE IN DRIVE"

loading_tape = 212
"LOADING TAPE"

no_file_found = 225
"FILE NOT FOUND"

initializing_tape = 240
"INITIALIZING TAPE"

tape_init = 258
"TAPE INITIALIZED"

init_aborted = 275
"TAPE INIT ABORTED"

using_backup = 293
"USING BACKUP DIRECTORY"

load_aborted = 316
"TAPE LOAD ABORTED"

select_tape_data = 334
"SELECT DATA TO ?"

file_error = 351
```

DALPHAS.WORK.PD8510 THU, DEC 22, 1983, 10:22 AM PAGE 2

"FILE ? ERROR"

file_aborted = 364
"FILE ? ABORTED"

record_macro = 379
"RECORD"

restore_macro = 386
"RESTORE"

delete_macro = 394
"DELETE"

undelete_macro = 401
"UNDELETE"

select_record = 410
"SELECT ? TO BE RECORDED"

select_restore = 434
"SELECT ? TO BE RESTORED"

select_file_record = 458
"SELECT ? FILE TO RECORD"

select_file_restore = 482
"SELECT ? FILE TO RESTORE"

select_file_delete = 507
"SELECT ? FILE TO DELETE"

abort_restore = 531
"RESTORE ABORTED. ? MAY BE BAD."

recording_file = 562
"RECORDING FILE"

file_recorded = 577
"FILE RECORDED"

no_tape_room = 591
"NOT ENOUGH ROOM ON TAPE"

deleting_file = 615
"DELETING FILE"

file_deleted = 629
"FILE DELETED"

file_undeleted = 642
"FILE UNDELETED"

undeleting_file = 657
"UNDELETING FILE"

DALPHAS.WORK.PD8510 THU, DEC 22, 1983, 10:22 AM PAGE 3 restoring_file = 673
"RESTORING FILE"

file_restored = 688
"FILE RESTORED"

restore_pts_error = 702
"UNABLE TO RESTORE ? POINTS"

restore_401_macro = 729
"401"

restore_201_macro = 733
"201"

restore_101_macro = 737
"101"

restore_51_macro = 741
"51"

tape_errors = 744
"? ERROR"

format_macro = 752
"TAPE FORMAT"

tape_drive_macro = 764
"TAPE DRIVE"

write_protect_macro = 775
"WRITE PROTECT"

checksum_macro = 789
"CHECKSUM"

parity_macro = 798
"PARITY"

unknown_macro = 805
"UNKNOWN"

save_prompt = 813
"SELECT ? TO SAVE"

saving_data = 830
"SAVING ?"

data_saved = 839
"? SAVED"

save_error = 847
"ERROR IN SAVING ?"

recall_prompt = 865
"SELECT ? TO RECALL"

DALPHAS.WORK.PD8510 THU, DEC 22, 1983, 10:22 AM PAGE 4 recalling_data = 884
"RECALLING ?"

data_recalled = 896
"? RECALLED"

recall_error = 907
"ERROR IN RECALLING ?"

no_req_data = 928
"NO ? FOUND"

preset_macro = 939
"PRESET STATE"

last_state_macro = 952
"LAST STATE"

data_overflow = 963
"DATA OVERFLOW"

no_last_state = 977
"NO LAST STATE"

delete_prompt = 991
"SELECT ? TO DELETE"

deleting_data = 1010
"DELETING ?"

cal_req_cleared = 1021
"CAL DELETED"

cal_clear_error = 1033
"ERROR IN DELETING CAL"

un_init_mbm = 1055
""

bubble_init_error = 1056
""

loading_data = 1057
"LOADING DATA"

invalid_mbm_data = 1070
"INVALID MBM DATA"

no_printer = 1087
"NO PRINTER CONNECTED"

plot_aborted = 1108
"PLOT ABORTED"

no_plotter = 1121

DALPHAS.WORK.PD8510 THU, DEC 22, 1983, 10:22 AM PAGE 5

"NO PLOTTER CONNECTED"

no_output_selection = 1142
"READ ATTEMPTED WITHOUT SELECTING OUTPUT TYPE"

illegal_output_selection = 1187
"READ ATTEMPTED WITH ILLEGAL OUTPUT TYPE"

no_input_selection = 1227
"WRITE ATTEMPTED WITHOUT SELECTING INPUT TYPE"

pass_thru_disabled = 1272
"PASS THRU ADDRESS NOT SET"

pass_thru_invalid = 1298
"PASS THRU ADDRESS INVALID"

block_input_error = 1324
"BLOCK INPUT ERROR"

block_input_length_error = 1342
"BLOCK INPUT LENGTH ERROR"

array_unavailable = 1367
"REQUESTED DATA NOT CURRENTLY AVAILABLE"

too_many_characters = 1406
"TOO MANY CHARACTERS IN NUMBER"

syntax_error = 1436
"SYNTAX ERROR"

deadlock = 1449
"RESOURCE DEADLOCK"

process_creation_error = 1467
"PROCESS CREATION ERROR"

no_pretune_lock = 1490
"VTO FAILURE"

pretune_fail = 1502
"NO IF FOUND"

phase_lock_fail = 1514
"PHASE LOCK FAILURE"

phase_lock_lost = 1533
"PHASE LOCK LOST"

vto_over_range = 1549
"VTO OVER-RANGE"

swp_sync_err = 1564
"SOURCE SWEEP SYNC ERROR"

```
if_overload = 1588
"IF OVERLOAD"

bad_bc_value = 1600
"PRES > BC OF SOURCE"

no_active_marker = 1620
"NO MARKER CURRENTLY ACTIVE"

inconsistent_operation = 1647
"INCONSISTENT WITH CURRENT ACTIVE FUNCTION"

titling_instructions = 1689
"POINT WITH KNOB; THEN PRESS 'SELECT LETTER'"

title_function_not_active = 1733
"'TITLE' FUNCTION IS INACTIVE"

test_set_overtemp = 1762
"TEST SET IS TOO HOT!!"

forward_device = 1784
"CONNECT DEVICE FOR "+blink_on+"FORWARD"+blink_off+" MEASUREMENT"

reverse_device = 1825
"CONNECT DEVICE FOR "+blink_on+"REVERSE"+blink_off+" MEASUREMENT"

illegal_test_set_operation = 1866
"ATTEMPTED ILLEGAL TEST SET OPERATION"

adc_cal_failed = 1903
"ADC CAL FAILED"

if_cal_failed = 1918
"IF CAL FAILED"

adc_not_responding = 1932
"ADC NOT RESPONDING"

autorange_cal_failed = 1951
"AUTORANGE CAL FAILED"

swp_too_fast = 1972
"SWEEP TIME TOO FAST"

ext_ref_unlocked = 1992
"UNABLE TO LOCK TO EXT 10Mhz REF"

no_e_coeffs = 2024
"'NEW CAL' OR 'STORED CAL' REQUIRED"

cal_not_for_param = 2059
"THIS PARAMETER NOT IN COEFFICIENT SET"

not_finished_caling = 2097
"ADDITIONAL STANDARDS NEEDED"
```

```
turn_correct_off = 2125
"TURN CORRECTION OFF TO CALIBRATE"

no_cal_in_progress = 2158
"NO CALIBRATION CURRENTLY IN PROGRESS"

connect_std = 2195
blink_on+"CONNECT STD THEN PRESS KEY TO MEASURE"+blink_off

slide_load = 2235
blink_on+"POSITION SLIDE THEN PRESS KEY TO MEASURE"+blink_off

connect_thru = 2278
blink_on+"CONNECT THRU THEN PRESS EACH KEY TO MEASURE"+blink_off

isolate_ports = 2324
blink_on+"ISOLATE PORTS THEN PRESS EACH KEY TO MEASURE"+blink_off

press_done = 2371
blink_on+"PRESS 'DONE' IF FINISHED WITH STD(s)"+blink_off

press_save = 2410
blink_on+"PRESS 'SAVE' IF FINISHED WITH CAL"+blink_off

cal_aborted = 2446
"CALIBRATION/CORRECTION ABORTED"

comp_cal_coeff = 2477
"COMPUTING CAL COEFFICIENTS"

measuring_std = 2504
blink_on+"WAIT--MEASURING CAL STANDARD"+blink_off

select_cal_set = 2535
blink_on+"SELECT CALIBRATION SET"+blink_off

select_delete_cal_set = 2560
"NO SPACE FOR NEW CAL;  DELETE A CAL SET."

more_slides_needed = 2601
"MORE SLIDES NEEDED"

specify_std = 2620
"SPECIFY CAL STANDARD TYPE"

exceeded_std_class_limit = 2646
"EXCEEDED 7 STANDARDS PER CLASS"

specify_std_class = 2677
"SPECIFY STDS FOR THIS CLASS, SEPARATED BY 'x1'"

select_std_class = 2724
"SELECT STANDARDS CLASS TO MODIFY"

comp_time_coeff = 2757
```

```
"COMPUTING TIME COEFFICIENTS"

comp_gate_coeff = 2785
"COMPUTING GATE COEFFICIENTS"

tdr_freq_change = 2813
"LOW-PASS TIME DOMAIN MAY CHANGE FREQ LIMITS"

print_freq = 2857
"  FREQUENCY ("

print_time = 2871
"  TIME ("

print_aux = 2880
"  AUX ("
```

```
EXTERNAL ALPHA TABLE byte_list.L;
```

```
;;;;;;;;;;;;;;;;;;;;;;;;;;;;;;;;;;;;;;;;;;;;;;;;;;;;;;;;;;;;;;;;;;;;;;;
;                                                                     ;
; This is the input file for generating a single byte table and      ;
; offsets into the corresponding tables which points to an alpha     ;
; string.  This eliminates the intermediate double (alpha address)   ;
; generated for an alpha table.  All strings will be in this byte    ;
; table, byte_list, and offset files (C<filename>) will be created   ;
; as dictated by the input file.                                     ;
;                                                                     ;
; The input file is configured as follows according to the first    ;
; character of each line:                                            ;
;                                                                     ;
;   @ - the names of include files (#FILES) that are generated       ;
;       with then prefix of 'C' for offsets into the byte table.     ;
;   . - is the name for the offset constant into a string entry of the;
;       byte table.  An offset constant without a string entry will  ;
;       generate a null string entry.                                ;
;   ; - or a space will be ignored and reagrded as a comment.        ;
;                                                                     ;
;   All other characters will be considered as part of a string entry.;
;   This means that all string literals are to be enclosed in quotes ;
;   and the syntax +"<string>" or "<string>"+ or +<constant> or      ;
;   <constant>+ will also be accepted (with no space before and after ;
;   "+" character.  String entries can also be on more than one line ;
;   provided that the "+" character is not the first character.     ;
;                                                                     ;
;   NOTE: single characters should also be enclosed in quotes " ".   ;
;                                                                     ;
;;;;;;;;;;;;;;;;;;;;;;;;;;;;;;;;;;;;;;;;;;;;;;;;;;;;;;;;;;;;;;;;;;;;;;;

; The following files contains error and informational messages
; that are displayed on the message line.

@message0.work

.null_message
" "

.command_not_implemented
"COMMAND NOT IMPLEMENTED"
.option_omitted
"SOFTWARE OPTION NOT INCLUDED"
.invalid_command
"INVALID COMMAND"
.exceeded_available_memory
"UNABLE TO ALLOCATE REQUESTED MEMORY"

@msgpriv.work
; private HP-IB messages

.source_ib_err
"SOURCE SYNTAX ERROR"
.test_set_ib_err
"TEST-SET SYNTAX ERROR"
.priv_ib_add_err
"SYSTEM BUS ADDRESS ERROR"
```

```
.priv_ib_srq_err
"SYSTEM BUS SRQ ERROR"

@msgtape.work
; tape errors/messages

.no_tape
"NO TAPE IN DRIVE"
.loading_tape
"LOADING TAPE"
.no_file_found
"FILE NOT FOUND"
.initializing_tape
"INITIALIZING TAPE"
.tape_init
"TAPE INITIALIZED"
.init_aborted
"TAPE INIT ABORTED"
.using_backup
"USING BACKUP DIRECTORY"
.load_aborted
"TAPE LOAD ABORTED"

.select_tape_data
"SELECT DATA TO ?"
.file_error
"FILE ? ERROR"
.file_aborted
"FILE ? ABORTED"
.record_macro
"RECORD"
.restore_macro
"RESTORE"
.delete_macro
"DELETE"
.undelete_macro
"UNDELETE"
;
; The following messages will be filled with appropriate data types
; to be recorded, restored, or deleted
;
.select_record
"SELECT ? TO BE RECORDED"
.select_restore
"SELECT ? TO BE RESTORED"
.select_file_record
"SELECT ? FILE TO RECORD"
.select_file_restore
"SELECT ? FILE TO RESTORE"
.select_file_delete
"SELECT ? FILE TO DELETE"
.abort_restore
"RESTORE ABORTED. ? MAY BE BAD."

.recording_file
"RECORDING FILE"
```

```
.file_recorded
"FILE RECORDED"
.no_tape_room
"NOT ENOUGH ROOM ON TAPE"

.deleting_file
"DELETING FILE"
.file_deleted
"FILE DELETED"

.file_undeleted
"FILE UNDELETED"
.undeleting_file
"UNDELETING FILE"

.restoring_file
"RESTORING FILE"
.file_restored
"FILE RESTORED"

.restore_pts_error
"UNABLE TO RESTORE ? POINTS"
.restore_401_macro
"401"
.restore_201_macro
"201"
.restore_101_macro
"101"
.restore_51_macro
"51"

.tape_errors
"? ERROR"
.format_macro
"TAPE FORMAT"
.tape_drive_macro
"TAPE DRIVE"
.write_protect_macro
"WRITE PROTECT"
.checksum_macro
"CHECKSUM"
.parity_macro
"PARITY"
.unknown_macro
"UNKNOWN"

@msgmbm.work
; bubble errors/messages

.save_prompt
"SELECT ? TO SAVE"
.saving_data
"SAVING ?"
.data_saved
"? SAVED"
.save_error
```

```
"ERROR IN SAVING ?"

.recall_prompt
"SELECT ? TO RECALL"
.recalling_data
"RECALLING ?"
.data_recalled
"? RECALLED"
.recall_error
"ERROR IN RECALLING ?"
.no_reg_data
"NO ? FOUND"
.preset_macro
"PRESET STATE"
.last_state_macro
"LAST STATE"
.data_overflow
"DATA OVERFLOW"
.no_last_state
"NO LAST STATE"

.delete_prompt
"SELECT ? TO DELETE"
.deleting_data
"DELETING ?"
.cal_reg_cleared
"CAL DELETED"
.cal_clear_error
"ERROR IN DELETING CAL"

.un_init_mbm
""
.bubble_init_error
""
.loading_data
"LOADING DATA"
;
; software debug trap
;
.invalid_mbm_data
"INVALID MBM DATA"

@msgplot.work
; plotter error messages

.no_printer
"NO PRINTER CONNECTED"
.plot_aborted
"PLOT ABORTED"
.no_plotter
"NO PLOTTER CONNECTED"

@msgib.work
; public HP-IB I/O messages

.no_output_selection
```

```
IALPHAS.WORK.PD8510          THU, DEC 22, 1983, 10:22 AM     PAGE   5

"READ ATTEMPTED WITHOUT SELECTING OUTPUT TYPE"
.illegal_output_selection
"READ ATTEMPTED WITH ILLEGAL OUTPUT TYPE"
.no_input_selection
"WRITE ATTEMPTED WITHOUT SELECTING INPUT TYPE"
.pass_thru_disabled
"PASS THRU ADDRESS NOT SET"
.pass_thru_invalid
"PASS THRU ADDRESS INVALID"
.block_input_error
"BLOCK INPUT ERROR"
.block_input_length_error
"BLOCK INPUT LENGTH ERROR"
.array_unavailable
"REQUESTED DATA NOT CURRENTLY AVAILABLE"

@messag1.work

;  syntax errors

.too_many_characters
"TOO MANY CHARACTERS IN NUMBER"
.syntax_error
"SYNTAX ERROR"

;  kernel

.deadlock
"RESOURCE DEADLOCK"
.process_creation_error
"PROCESS CREATION ERROR"

;  break messages

.no_pretune_lock
"VTO FAILURE"
.pretune_fail
"NO IF FOUND"
.phase_lock_fail
"PHASE LOCK FAILURE"
.phase_lock_lost
"PHASE LOCK LOST"
.vto_over_range
"VTO OVER-RANGE"
.swp_sync_err
"SOURCE SWEEP SYNC ERROR"
.if_overload
"IF OVERLOAD"
;  temporary
.bad_bc_value
"PRES > BC OF SOURCE"

;  active function messages

.no_active_marker
"NO MARKER CURRENTLY ACTIVE"
```

```
IALPHAS.WORK.PD8510          THU, DEC 22, 1983, 10:22 AM     PAGE   6

.inconsistent_operation
"INCONSISTENT WITH CURRENT ACTIVE FUNCTION"
.titling_instructions
"POINT WITH KNOB; THEN PRESS 'SELECT LETTER'"
.title_function_not_active
"'TITLE' FUNCTION IS INACTIVE"

;  test set  .

.test_set_overtemp
"TEST SET IS TOO HOT!!"
.forward_device
"CONNECT DEVICE FOR "+blink_on+"FORWARD"+blink_off+" MEASUREMENT"
.reverse_device
"CONNECT DEVICE FOR "+blink_on+"REVERSE"+blink_off+" MEASUREMENT"
.illegal_test_set_operation
"ATTEMPTED ILLEGAL TEST SET OPERATION"

; caibration error messages (yadc)

.adc_cal_failed
"ADC CAL FAILED"
.if_cal_failed
"IF CAL FAILED"
.adc_not_responding
"ADC NOT RESPONDING"
.autorange_cal_failed
"AUTORANGE CAL FAILED"

;  botton box

.swp_too_fast
"SWEEP TIME TOO FAST"
.ext_ref_unlocked
"UNABLE TO LOCK TO EXT 10Mhz REF"

; calibration and correction messages

@msgcal.work
.no_e_coeffs
"'NEW CAL' OR 'STORED CAL' REQUIRED"
.cal_not_for_param
"THIS PARAMETER NOT IN COEFFICIENT SET"
.not_finished_caling
"ADDITIONAL STANDARDS NEEDED"
.turn_correct_off
"TURN CORRECTION OFF TO CALIBRATE"
.no_cal_in_progress
"NO CALIBRATION CURRENTLY IN PROGRESS"
.connect_std
blink_on+"CONNECT STD THEN PRESS KEY TO MEASURE"+blink_off
.slide_load
blink_on+"POSITION SLIDE THEN PRESS KEY TO MEASURE"+blink_off
.connect_thru
blink_on+"CONNECT THRU THEN PRESS EACH KEY TO MEASURE"+blink_off
.isolate_ports
```

```
IALPHAS.WORK.PD8510          THU, DEC 22, 1983, 10:22 AM     PAGE   7

blink_on+"ISOLATE PORTS THEN PRESS EACH KEY TO MEASURE"+blink_off
.press_done
blink_on+"PRESS 'DONE' IF FINISHED WITH STD(s)"+blink_off
.press_save
blink_on+"PRESS 'SAVE' IF FINISHED WITH CAL"+blink_off
.cal_aborted
"CALIBRATION/CORRECTION ABORTED"
.comp_cal_coeff
"COMPUTING CAL COEFFICIENTS"
.measuring_std
blink_on+"WAIT--MEASURING CAL STANDARD"+blink_off
.select_cal_set
blink_on+"SELECT CALIBRATION SET"+blink_off
.select_delete_cal_set
"NO SPACE FOR NEW CAL;  DELETE A CAL SET."
.more_slides_needed
"MORE SLIDES NEEDED"
.specify_std
"SPECIFY CAL STANDARD TYPE"
.exceeded_std_class_limit
"EXCEEDED 7 STANDARDS PER CLASS"
.specify_std_class
"SPECIFY STDS FOR THIS CLASS, SEPARATED BY 'x1'"
.select_std_class
"SELECT STANDARDS CLASS TO MODIFY"

;  domain messages -- time, TDR, gate, aux

@msgtime.work
.comp_time_coeff
"COMPUTING TIME COEFFICIENTS"
.comp_gate_coeff
"COMPUTING GATE COEFFICIENTS"
.tdr_freq_change
"LOW-PASS TIME DOMAIN MAY CHANGE FREQ LIMITS"

@prtdata.work

;  headers for listing data trace info.

.print_freq
"  FREQUENCY ("
.print_time
"  TIME ("
.print_aux
"  AUX ("
```

```
SALPHAS.WORK.PD8510          THU, DEC 22, 1983, 10:22 AM     PAGE   1

M68KL,P,"alphas" BEGIN

#FILE cchars.work;

GLOBAL BYTE TABLE byte_list :=
  1,    & length byte &
  & " " &
  ' ',
  23,    & length byte &
  & "COMMAND NOT IMPLEMENTED" &
  'C,'O,'M,'M,'A,'N,'D,' ,'N,'O,'T,' ,'I,'M,'P,'L,'E,'M,'E,'N,'T,'E,'D,

  28,    & length byte &
  & "SOFTWARE OPTION NOT INCLUDED" &
  'S,'O,'F,'T,'W,'A,'R,'E,' ,'O,'P,'T,'I,'O,'N,' ,'N,'O,'T,' ,'I,'N,'C,
  'L,'U,'D,'E,'D,
  15,    & length byte &
  & "INVALID COMMAND" &
  'I,'N,'V,'A,'L,'I,'D,' ,'C,'O,'M,'M,'A,'N,'D,
  35,    & length byte &
  & "UNABLE TO ALLOCATE REQUESTED MEMORY" &
  'U,'N,'A,'B,'L,'E,' ,'T,'O,' ,'A,'L,'L,'O,'C,'A,'T,'E,' ,'R,'E,'Q,'U,
  'E,'S,'T,'E,'D,' ,'M,'E,'M,'O,'R,'Y,
  19,    & length byte &
  & "SOURCE SYNTAX ERROR" &
  'S,'O,'U,'R,'C,'E,' ,'S,'Y,'N,'T,'A,'X,' ,'E,'R,'R,'O,'R,
  21,    & length byte &
  & "TEST-SET SYNTAX ERROR" &
  'T,'E,'S,'T,'-,'S,'E,'T,' ,'S,'Y,'N,'T,'A,'X,' ,'E,'R,'R,'O,'R,
  24,    & length byte &
  & "SYSTEM BUS ADDRESS ERROR" &
  'S,'Y,'S,'T,'E,'M,' ,'B,'U,'S,' ,'A,'D,'D,'R,'E,'S,'S,' ,'E,'R,'R,'O,
  'R,
  20,    & length byte &
  & "SYSTEM BUS SRQ ERROR" &
  'S,'Y,'S,'T,'E,'M,' ,'B,'U,'S,' ,'S,'R,'Q,' ,'E,'R,'R,'O,'R,
  16,    & length byte &
  & "NO TAPE IN DRIVE" &
  'N,'O,' ,'T,'A,'P,'E,' ,'I,'N,' ,'D,'R,'I,'V,'E,
  12,    & length byte &
  & "LOADING TAPE" &
  'L,'O,'A,'D,'I,'N,'G,' ,'T,'A,'P,'E,
  14,    & length byte &
  & "FILE NOT FOUND" &
  'F,'I,'L,'E,' ,'N,'O,'T,' ,'F,'O,'U,'N,'D,
  17,    & length byte &
  & "INITIALIZING TAPE" &
  'I,'N,'I,'T,'I,'A,'L,'I,'Z,'I,'N,'G,' ,'T,'A,'P,'E,
  16,    & length byte &
  & "TAPE INITIALIZED" &
  'T,'A,'P,'E,' ,'I,'N,'I,'T,'I,'A,'L,'I,'Z,'E,'D,
  17,    & length byte &
  & "TAPE INIT ABORTED" &
  'T,'A,'P,'E,' ,'I,'N,'I,'T,' ,'A,'B,'O,'R,'T,'E,'D,
  22.    & length byte &
```

```
SALPHAS.WORK.PD8510          THU, DEC 22, 1983, 10:22 AM     PAGE  2

  & "USING BACKUP DIRECTORY" &
  'U,'S,'I,'N,'G,' ,'B,'A,'C,'K,'U,'P,' ,'D,'I,'R,'E,'C,'T,'O,'R,'Y,
  17,    & length byte &
  & "TAPE LOAD ABORTED" &
  'T,'A,'P,'E,' ,'L,'O,'A,'D,' ,'A,'B,'O,'R,'T,'E,'D,
  16,    & length byte &
  & "SELECT DATA TO ?" &
  'S,'E,'L,'E,'C,'T,' ,'D,'A,'T,'A,' ,'T,'O,' ,'?,
  12,    & length byte &
  & "FILE ? ERROR" &
  'F,'I,'L,'E,' ,'?,' ,'E,'R,'R,'O,'R,
  14,    & length byte &
  & "FILE ? ABORTED" &
  'F,'I,'L,'E,' ,'?,' ,'A,'B,'O,'R,'T,'E,'D,
  6,    & length byte &
  & "RECORD" &
  'R,'E,'C,'O,'R,'D,
  7,    & length byte &
  & "RESTORE" &
  'R,'E,'S,'T,'O,'R,'E,
  6,    & length byte &
  & "DELETE" &
  'D,'E,'L,'E,'T,'E,
  8,    & length byte &
  & "UNDELETE" &
  'U,'N,'D,'E,'L,'E,'T,'E,
  23,    & length byte &
  & "SELECT ? TO BE RECORDED" &
  'S,'E,'L,'E,'C,'T,' ,'?,' ,'T,'O,' ,'B,'E,' ,'R,'E,'C,'O,'R,'D,'E,'D,

  23,    & length byte &
  & "SELECT ? TO BE RESTORED" &
  'S,'E,'L,'E,'C,'T,' ,'?,' ,'T,'O,' ,'B,'E,' ,'R,'E,'S,'T,'O,'R,'E,'D,

  23,    & length byte &
  & "SELECT ? FILE TO RECORD" &
  'S,'E,'L,'E,'C,'T,' ,'?,' ,'F,'I,'L,'E,' ,'T,'O,' ,'R,'E,'C,'O,'R,'D,

  24,    & length byte &
  & "SELECT ? FILE TO RESTORE" &
  'S,'E,'L,'E,'C,'T,' ,'?,' ,'F,'I,'L,'E,' ,'T,'O,' ,'R,'E,'S,'T,'O,'R,
  'E,
  23,    & length byte &
  & "SELECT ? FILE TO DELETE" &
  'S,'E,'L,'E,'C,'T,' ,'?,' ,'F,'I,'L,'E,' ,'T,'O,' ,'D,'E,'L,'E,'T,'E,

  30,    & length byte &
  & "RESTORE ABORTED. ? MAY BE BAD." &
  'R,'E,'S,'T,'O,'R,'E,' ,'A,'B,'O,'R,'T,'E,'D,'.,' ,'?,' ,'M,'A,'Y,' ,
  'B,'E,' ,'B,'A,'D,'.,
  14,    & length byte &
  & "RECORDING FILE" &
  'R,'E,'C,'O,'R,'D,'I,'N,'G,' ,'F,'I,'L,'E,
  13,    & length byte &
  & "FILE RECORDED" &
  'F,'I,'L,'E,' ,'R,'E,'C,'O,'R,'D,'E,'D,
```

```
SALPHAS.WORK.PD8510          THU, DEC 22, 1983, 10:22 AM     PAGE  3

  23,    & length byte &
  & "NOT ENOUGH ROOM ON TAPE" &
  'N,'O,'T,' ,'E,'N,'O,'U,'G,'H,' ,'R,'O,'O,'M,' ,'O,'N,' ,'T,'A,'P,'E,

  13,    & length byte &
  & "DELETING FILE" &
  'D,'E,'L,'E,'T,'I,'N,'G,' ,'F,'I,'L,'E,
  12,    & length byte &
  & "FILE DELETED" &
  'F,'I,'L,'E,' ,'D,'E,'L,'E,'T,'E,'D,
  14,    & length byte &
  & "FILE UNDELETED" &
  'F,'I,'L,'E,' ,'U,'N,'D,'E,'L,'E,'T,'E,'D,
  15,    & length byte &
  & "UNDELETING FILE" &
  'U,'N,'D,'E,'L,'E,'T,'I,'N,'G,' ,'F,'I,'L,'E,
  14,    & length byte &
  & "RESTORING FILE" &
  'R,'E,'S,'T,'O,'R,'I,'N,'G,' ,'F,'I,'L,'E,
  13,    & length byte &
  & "FILE RESTORED" &
  'F,'I,'L,'E,' ,'R,'E,'S,'T,'O,'R,'E,'D,
  26,    & length byte &
  & "UNABLE TO RESTORE ? POINTS" &
  'U,'N,'A,'B,'L,'E,' ,'T,'O,' ,'R,'E,'S,'T,'O,'R,'E,' ,'?,' ,'P,'O,'I,
  'N,'T,'S,
  3,    & length byte &
  & "401" &
  '4,'0,'1,
  3,    & length byte &
  & "201" &
  '2,'0,'1,
  3,    & length byte &
  & "101" &
  '1,'0,'1,
  2,    & length byte &
  & "51" &
  '5,'1,
  7,    & length byte &
  & "? ERROR" &
  '?,' ,'E,'R,'R,'O,'R,
  11,    & length byte &
  & "TAPE FORMAT" &
  'T,'A,'P,'E,' ,'F,'O,'R,'M,'A,'T,
  10,    & length byte &
  & "TAPE DRIVE" &
  'T,'A,'P,'E,' ,'D,'R,'I,'V,'E,
  13,    & length byte &
  & "WRITE PROTECT" &
  'W,'R,'I,'T,'E,' ,'P,'R,'O,'T,'E,'C,'T,
  8,    & length byte &
  & "CHECKSUM" &
  'C,'H,'E,'C,'K,'S,'U,'M,
  6,    & length byte &
  & "PARITY" &
  'P,'A,'R,'I,'T,'Y,
```

```
SALPHAS.WORK.PD8510          THU, DEC 22, 1983, 10:22 AM     PAGE  4

  7,    & length byte &
  & "UNKNOWN" &
  'U,'N,'K,'N,'O,'W,'N,
  16,    & length byte &
  & "SELECT ? TO SAVE" &
  'S,'E,'L,'E,'C,'T,' ,'?,' ,'T,'O,' ,'S,'A,'V,'E,
  8,    & length byte &
  & "SAVING ?" &
  'S,'A,'V,'I,'N,'G,' ,'?,
  7,    & length byte &
  & "? SAVED" &
  '?,' ,'S,'A,'V,'E,'D,
  17,    & length byte &
  & "ERROR IN SAVING ?" &
  'E,'R,'R,'O,'R,' ,'I,'N,' ,'S,'A,'V,'I,'N,'G,' ,'?,
  18,    & length byte &
  & "SELECT ? TO RECALL" &
  'S,'E,'L,'E,'C,'T,' ,'?,' ,'T,'O,' ,'R,'E,'C,'A,'L,'L,
  11,    & length byte &
  & "RECALLING ?" &
  'R,'E,'C,'A,'L,'L,'I,'N,'G,' ,'?,
  10,    & length byte &
  & "? RECALLED" &
  '?,' ,'R,'E,'C,'A,'L,'L,'E,'D,
  20,    & length byte &
  & "ERROR IN RECALLING ?" &
  'E,'R,'R,'O,'R,' ,'I,'N,' ,'R,'E,'C,'A,'L,'L,'I,'N,'G,' ,'?,
  10,    & length byte &
  & "NO ? FOUND" &
  'N,'O,' ,'?,' ,'F,'O,'U,'N,'D,
  12,    & length byte &
  & "PRESET STATE" &
  'P,'R,'E,'S,'E,'T,' ,'S,'T,'A,'T,'E,
  10,    & length byte &
  & "LAST STATE" &
  'L,'A,'S,'T,' ,'S,'T,'A,'T,'E,
  13,    & length byte &
  & "DATA OVERFLOW" &
  'D,'A,'T,'A,' ,'O,'V,'E,'R,'F,'L,'O,'W,
  13,    & length byte &
  & "NO LAST STATE" &
  'N,'O,' ,'L,'A,'S,'T,' ,'S,'T,'A,'T,'E,
  18,    & length byte &
  & "SELECT ? TO DELETE" &
  'S,'E,'L,'E,'C,'T,' ,'?,' ,'T,'O,' ,'D,'E,'L,'E,'T,'E,
  10,    & length byte &
  & "DELETING ?" &
  'D,'E,'L,'E,'T,'I,'N,'G,' ,'?,
  11,    & length byte &
  & "CAL DELETED" &
  'C,'A,'L,' ,'D,'E,'L,'E,'T,'E,'D,
  21,    & length byte &
  & "ERROR IN DELETING CAL" &
  'E,'R,'R,'O,'R,' ,'I,'N,' ,'D,'E,'L,'E,'T,'I,'N,'G,' ,'C,'A,'L,
  0,    & length byte &
  & "" &
```

```
SALPHAS.WORK.PD8510          THU, DEC 22, 1983, 10:22 AM     PAGE  5

  0,    & length byte &
  & "" &
  12,    & length byte &
  & "LOADING DATA" &
  'L,'O,'A,'D,'I,'N,'G,' ,'D,'A,'T,'A,
  16,    & length byte &
  & "INVALID MBM DATA" &
  'I,'N,'V,'A,'L,'I,'D,' ,'M,'B,'M,' ,'D,'A,'T,'A,
  20,    & length byte &
  & "NO PRINTER CONNECTED" &
  'N,'O,' ,'P,'R,'I,'N,'T,'E,'R,' ,'C,'O,'N,'N,'E,'C,'T,'E,'D,
  12,    & length byte &
  & "PLOT ABORTED" &
  'P,'L,'O,'T,' ,'A,'B,'O,'R,'T,'E,'D,
  20,    & length byte &
  & "NO PLOTTER CONNECTED" &
  'N,'O,' ,'P,'L,'O,'T,'T,'E,'R,' ,'C,'O,'N,'N,'E,'C,'T,'E,'D,
  44,    & length byte &
  & "READ ATTEMPTED WITHOUT SELECTING OUTPUT TYPE" &
  'R,'E,'A,'D,' ,'A,'T,'T,'E,'M,'P,'T,'E,'D,' ,'W,'I,'T,'H,'O,'U,'T,' ,
  'S,'E,'L,'E,'C,'T,'I,'N,'G,' ,'O,'U,'T,'P,'U,'T,' ,'T,'Y,'P,'E,
  39,    & length byte &
  & "READ ATTEMPTED WITH ILLEGAL OUTPUT TYPE" &
  'R,'E,'A,'D,' ,'A,'T,'T,'E,'M,'P,'T,'E,'D,' ,'W,'I,'T,'H,' ,'I,'L,'L,
  'E,'G,'A,'L,' ,'O,'U,'T,'P,'U,'T,' ,'T,'Y,'P,'E,
  44,    & length byte &
  & "WRITE ATTEMPTED WITHOUT SELECTING INPUT TYPE" &
  'W,'R,'I,'T,'E,' ,'A,'T,'T,'E,'M,'P,'T,'E,'D,' ,'W,'I,'T,'H,'O,'U,'T,
  ' ,'S,'E,'L,'E,'C,'T,'I,'N,'G,' ,'I,'N,'P,'U,'T,' ,'T,'Y,'P,'E,
  25,    & length byte &
  & "PASS THRU ADDRESS NOT SET" &
  'P,'A,'S,'S,' ,'T,'H,'R,'U,' ,'A,'D,'D,'R,'E,'S,'S,' ,'N,'O,'T,' ,'S,
  'E,'T,
  25,    & length byte &
  & "PASS THRU ADDRESS INVALID" &
  'P,'A,'S,'S,' ,'T,'H,'R,'U,' ,'A,'D,'D,'R,'E,'S,'S,' ,'I,'N,'V,'A,'L,
  'I,'D,
  17,    & length byte &
  & "BLOCK INPUT ERROR" &
  'B,'L,'O,'C,'K,' ,'I,'N,'P,'U,'T,' ,'E,'R,'R,'O,'R,
  24,    & length byte &
  & "BLOCK INPUT LENGTH ERROR" &
  'B,'L,'O,'C,'K,' ,'I,'N,'P,'U,'T,' ,'L,'E,'N,'G,'T,'H,' ,'E,'R,'R,'O,
  'R,
  38,    & length byte &
  & "REQUESTED DATA NOT CURRENTLY AVAILABLE" &
  'R,'E,'Q,'U,'E,'S,'T,'E,'D,' ,'D,'A,'T,'A,' ,'N,'O,'T,' ,'C,'U,'R,'R,
  'E,'N,'T,'L,'Y,' ,'A,'V,'A,'I,'L,'A,'B,'L,'E,
  29,    & length byte &
  & "TOO MANY CHARACTERS IN NUMBER" &
  'T,'O,'O,' ,'M,'A,'N,'Y,' ,'C,'H,'A,'R,'A,'C,'T,'E,'R,'S,' ,'I,'N,' ,
  'N,'U,'M,'B,'E,'R,
  12,    & length byte &
  & "SYNTAX ERROR" &
  'S,'Y,'N,'T,'A,'X,' ,'E,'R,'R,'O,'R,
  17,    & length byte &
```

```
SALPHAS.WORK.PD8510           THU, DEC 22, 1983, 10:22 AM     PAGE   6

& "RESOURCE DEADLOCK" &
'R,'E,'S,'O,'U,'R,'C,'E,' ,'D,'E,'A,'D,'L,'O,'C,'K,
22,    & length byte &
& "PROCESS CREATION ERROR" &
'P,'R,'O,'C,'E,'S,'S,' ,'C,'R,'E,'A,'T,'I,'O,'N,' ,'E,'R,'R,'O,'R,
11,    & length byte &
& "VTO FAILURE" &
'V,'T,'O,' ,'F,'A,'I,'L,'U,'R,'E,
11,    & length byte &
& "NO IF FOUND" &
'N,'O,' ,'I,'F,' ,'F,'O,'U,'N,'D,
18,    & length byte &
& "PHASE LOCK FAILURE" &
'P,'H,'A,'S,'E,' ,'L,'O,'C,'K,' ,'F,'A,'I,'L,'U,'R,'E,
15,    & length byte &
& "PHASE LOCK LOST" &
'P,'H,'A,'S,'E,' ,'L,'O,'C,'K,' ,'L,'O,'S,'T,
14,    & length byte &
& "VTO OVER-RANGE" &
'V,'T,'O,' ,'O,'V,'E,'R,'-,'R,'A,'N,'G,'E,
23,    & length byte &
& "SOURCE SWEEP SYNC ERROR" &
'S,'O,'U,'R,'C,'E,' ,'S,'W,'E,'E,'P,' ,'S,'Y,'N,'C,' ,'E,'R,'R,'O,'R,

11,    & length byte &
& "IF OVERLOAD" &
'I,'F,' ,'O,'V,'E,'R,'L,'O,'A,'D,
19,    & length byte &
& "PRES > BC OF SOURCE" &
'P,'R,'E,'S,' ,'>,' ,'B,'C,' ,'O,'F,' ,'S,'O,'U,'R,'C,'E,
26,    & length byte &
& "NO MARKER CURRENTLY ACTIVE" &
'N,'O,' ,'M,'A,'R,'K,'E,'R,' ,'C,'U,'R,'R,'E,'N,'T,'L,'Y,' ,'A,'C,'T,
'I,'V,'E,
41,    & length byte &
& "INCONSISTENT WITH CURRENT ACTIVE FUNCTION" &
'I,'N,'C,'O,'N,'S,'I,'S,'T,'E,'N,'T,' ,'W,'I,'T,'H,' ,'C,'U,'R,'R,'E,
'N,'T,' ,'A,'C,'T,'I,'V,'E,' ,'F,'U,'N,'C,'T,'I,'O,'N,
43,    & length byte &
& "POINT WITH KNOB; THEN PRESS 'SELECT LETTER'" &
'P,'O,'I,'N,'T,' ,'W,'I,'T,'H,' ,'K,'N,'O,'B,';,' ,'T,'H,'E,'N,' ,'P,
'R,'E,'S,'S,' ,'','S,'E,'L,'E,'C,'T,' ,'L,'E,'T,'T,'E,'R,'',
28,    & length byte &
& "'TITLE' FUNCTION IS INACTIVE" &
'','T,'I,'T,'L,'E,'',' ,'F,'U,'N,'C,'T,'I,'O,'N,' ,'I,'S,' ,'I,'N,'A,
'C,'T,'I,'V,'E,
21,    & length byte &
& "TEST SET IS TOO HOT!!" &
'T,'E,'S,'T,' ,'S,'E,'T,' ,'I,'S,' ,'T,'O,'O,' ,'H,'O,'T,'!,'!,
40,    & length byte &
& "CONNECT DEVICE FOR "+blink_on+"FORWARD"+blink_off+" MEASUREMENT" &
'C,'O,'N,'N,'E,'C,'T,' ,'D,'E,'V,'I,'C,'E,' ,'F,'O,'R,' ,
blink_on,
'F,'O,'R,'W,'A,'R,'D,
blink_off,
' ,'M,'E,'A,'S,'U,'R,'E,'M,'E,'N,'T,
```

```
SALPHAS.WORK.PD8510           THU, DEC 22, 1983, 10:22 AM     PAGE   7

40,    & length byte &
& "CONNECT DEVICE FOR "+blink_on+"REVERSE"+blink_off+" MEASUREMENT" &
'C,'O,'N,'N,'E,'C,'T,' ,'D,'E,'V,'I,'C,'E,' ,'F,'O,'R,' ,
blink_on,
'R,'E,'V,'E,'R,'S,'E,
blink_off,
' ,'M,'E,'A,'S,'U,'R,'E,'M,'E,'N,'T,
36,    & length byte &
& "ATTEMPTED ILLEGAL TEST SET OPERATION" &
'A,'T,'T,'E,'M,'P,'T,'E,'D,' ,'I,'L,'L,'E,'G,'A,'L,' ,'T,'E,'S,'T,' ,
'S,'E,'T,' ,'O,'P,'E,'R,'A,'T,'I,'O,'N,
14,    & length byte &
& "ADC CAL FAILED" &
'A,'D,'C,' ,'C,'A,'L,' ,'F,'A,'I,'L,'E,'D,
13,    & length byte &
& "IF CAL FAILED" &
'I,'F,' ,'C,'A,'L,' ,'F,'A,'I,'L,'E,'D,
18,    & length byte &
& "ADC NOT RESPONDING" &
'A,'D,'C,' ,'N,'O,'T,' ,'R,'E,'S,'P,'O,'N,'D,'I,'N,'G,
20,    & length byte &
& "AUTORANGE CAL FAILED" &
'A,'U,'T,'O,'R,'A,'N,'G,'E,' ,'C,'A,'L,' ,'F,'A,'I,'L,'E,'D,
19,    & length byte &
& "SWEEP TIME TOO FAST" &
'S,'W,'E,'E,'P,' ,'T,'I,'M,'E,' ,'T,'O,'O,' ,'F,'A,'S,'T,
31,    & length byte &
& "UNABLE TO LOCK TO EXT 10Mhz REF" &
'U,'N,'A,'B,'L,'E,' ,'T,'O,' ,'L,'O,'C,'K,' ,'T,'O,' ,'E,'X,'T,' ,'1,
'0,'M,'h,'z,' ,'R,'E,'F,
34,    & length byte &
& "'NEW CAL' OR 'STORED CAL' REQUIRED" &
'','N,'E,'W,' ,'C,'A,'L,'',' ,'O,'R,' ,'','S,'T,'O,'R,'E,'D,' ,'C,'A,
'L,'',' ,'R,'E,'Q,'U,'I,'R,'E,'D,
37,    & length byte &
& "THIS PARAMETER NOT IN COEFFICIENT SET" &
'T,'H,'I,'S,' ,'P,'A,'R,'A,'M,'E,'T,'E,'R,' ,'N,'O,'T,' ,'I,'N,' ,'C,
'O,'E,'F,'F,'I,'C,'I,'E,'N,'T,' ,'S,'E,'T,
27,    & length byte &
& "ADDITIONAL STANDARDS NEEDED" &
'A,'D,'D,'I,'T,'I,'O,'N,'A,'L,' ,'S,'T,'A,'N,'D,'A,'R,'D,'S,' ,'N,'E,
'E,'D,'E,'D,
32,    & length byte &
& "TURN CORRECTION OFF TO CALIBRATE" &
'T,'U,'R,'N,' ,'C,'O,'R,'R,'E,'C,'T,'I,'O,'N,' ,'O,'F,'F,' ,'T,'O,' ,
'C,'A,'L,'I,'B,'R,'A,'T,'E,
36,    & length byte &
& "NO CALIBRATION CURRENTLY IN PROGRESS" &
'N,'O,' ,'C,'A,'L,'I,'B,'R,'A,'T,'I,'O,'N,' ,'C,'U,'R,'R,'E,'N,'T,'L,
'Y,' ,'I,'N,' ,'P,'R,'O,'G,'R,'E,'S,'S,
39,    & length byte &
& blink_on+"CONNECT STD THEN PRESS KEY TO MEASURE"+blink_off &
blink_on,
'C,'O,'N,'N,'E,'C,'T,' ,'S,'T,'D,' ,'T,'H,'E,'N,' ,'P,'R,'E,'S,'S,' ,
'K,'E,'Y,' ,'T,'O,' ,'M,'E,'A,'S,'U,'R,'E,
blink_off,
```

```
SALPHAS.WORK.PD8510           THU, DEC 22, 1983, 10:22 AM     PAGE   8

42,    & length byte &
& blink_on+"POSITION SLIDE THEN PRESS KEY TO MEASURE"+blink_off &
blink_on,
'P,'O,'S,'I,'T,'I,'O,'N,' ,'S,'L,'I,'D,'E,' ,'T,'H,'E,'N,' ,'P,'R,'E,
'S,'S,' ,'K,'E,'Y,' ,'T,'O,' ,'M,'E,'A,'S,'U,'R,'E,
blink_off,
45,    & length byte &
& blink_on+"CONNECT THRU THEN PRESS EACH KEY TO MEASURE"+blink_off &
blink_on,
'C,'O,'N,'N,'E,'C,'T,' ,'T,'H,'R,'U,' ,'T,'H,'E,'N,' ,'P,'R,'E,'S,'S,
' ,'E,'A,'C,'H,' ,'K,'E,'Y,' ,'T,'O,' ,'M,'E,'A,'S,'U,'R,'E,
blink_off,
46,    & length byte &
& blink_on+"ISOLATE PORTS THEN PRESS EACH KEY TO MEASURE"+blink_off &
blink_on,
'I,'S,'O,'L,'A,'T,'E,' ,'P,'O,'R,'T,'S,' ,'T,'H,'E,'N,' ,'P,'R,'E,'S,
'S,' ,'E,'A,'C,'H,' ,'K,'E,'Y,' ,'T,'O,' ,'M,'E,'A,'S,'U,'R,'E,
blink_off,
38,    & length byte &
& blink_on+"PRESS 'DONE' IF FINISHED WITH STD(s)"+blink_off &
blink_on,
'P,'R,'E,'S,'S,' ,'','D,'O,'N,'E,'',' ,'I,'F,' ,'F,'I,'N,'I,'S,'H,'E,
'D,' ,'W,'I,'T,'H,' ,'S,'T,'D,'(,'s,'),
blink_off,
35,    & length byte &
& blink_on+"PRESS 'SAVE' IF FINISHED WITH CAL"+blink_off &
blink_on,
'P,'R,'E,'S,'S,' ,'','S,'A,'V,'E,'',' ,'I,'F,' ,'F,'I,'N,'I,'S,'H,'E,
'D,' ,'W,'I,'T,'H,' ,'C,'A,'L,
blink_off,
30,    & length byte &
& "CALIBRATION/CORRECTION ABORTED" &
'C,'A,'L,'I,'B,'R,'A,'T,'I,'O,'N,'/,'C,'O,'R,'R,'E,'C,'T,'I,'O,'N,' ,
'A,'B,'O,'R,'T,'E,'D,
26,    & length byte &
& "COMPUTING CAL COEFFICIENTS" &
'C,'O,'M,'P,'U,'T,'I,'N,'G,' ,'C,'A,'L,' ,'C,'O,'E,'F,'F,'I,'C,'I,'E,
'N,'T,'S,
30,    & length byte &
& blink_on+"WAIT--MEASURING CAL STANDARD"+blink_off &
blink_on,
'W,'A,'I,'T,'-,'-,'M,'E,'A,'S,'U,'R,'I,'N,'G,' ,'C,'A,'L,' ,'S,'T,'A,
'N,'D,'A,'R,'D,
blink_off,
24,    & length byte &
& blink_on+"SELECT CALIBRATION SET"+blink_off &
blink_on,
'S,'E,'L,'E,'C,'T,' ,'C,'A,'L,'I,'B,'R,'A,'T,'I,'O,'N,' ,'S,'E,'T,
blink_off,
40,    & length byte &
& "NO SPACE FOR NEW CAL;  DELETE A CAL SET." &
'N,'O,' ,'S,'P,'A,'C,'E,' ,'F,'O,'R,' ,'N,'E,'W,' ,'C,'A,'L,';,' ,' ,
'D,'E,'L,'E,'T,'E,' ,'A,' ,'C,'A,'L,' ,'S,'E,'T,'.,
18,    & length byte &
& "MORE SLIDES NEEDED" &
'M,'O,'R,'E,' ,'S,'L,'I,'D,'E,'S,' ,'N,'E,'E,'D,'E,'D,
```

```
SALPHAS.WORK.PD8510           THU, DEC 22, 1983, 10:22 AM     PAGE   9

25,    & length byte &
& "SPECIFY CAL STANDARD TYPE" &
'S,'P,'E,'C,'I,'F,'Y,' ,'C,'A,'L,' ,'S,'T,'A,'N,'D,'A,'R,'D,' ,'T,'Y,
'P,'E,
30,    & length byte &
& "EXCEEDED 7 STANDARDS PER CLASS" &
'E,'X,'C,'E,'E,'D,'E,'D,' ,'7,' ,'S,'T,'A,'N,'D,'A,'R,'D,'S,' ,'P,'E,
'R,' ,'C,'L,'A,'S,'S,
46,    & length byte &
& "SPECIFY STDS FOR THIS CLASS, SEPARATED BY 'x1'" &
'S,'P,'E,'C,'I,'F,'Y,' ,'S,'T,'D,'S,' ,'F,'O,'R,' ,'T,'H,'I,'S,' ,'C,
'L,'A,'S,'S,',,' ,'S,'E,'P,'A,'R,'A,'T,'E,'D,' ,'B,'Y,' ,'','x,'1,'',

32,    & length byte &
& "SELECT STANDARDS CLASS TO MODIFY" &
'S,'E,'L,'E,'C,'T,' ,'S,'T,'A,'N,'D,'A,'R,'D,'S,' ,'C,'L,'A,'S,'S,' ,
'T,'O,' ,'M,'O,'D,'I,'F,'Y,
27,    & length byte &
& "COMPUTING TIME COEFFICIENTS" &
'C,'O,'M,'P,'U,'T,'I,'N,'G,' ,'T,'I,'M,'E,' ,'C,'O,'E,'F,'F,'I,'C,'I,
'E,'N,'T,'S,
27,    & length byte &
& "COMPUTING GATE COEFFICIENTS" &
'C,'O,'M,'P,'U,'T,'I,'N,'G,' ,'G,'A,'T,'E,' ,'C,'O,'E,'F,'F,'I,'C,'I,
'E,'N,'T,'S,
43,    & length byte &
& "LOW-PASS TIME DOMAIN MAY CHANGE FREQ LIMITS" &
'L,'O,'W,'-,'P,'A,'S,'S,' ,'T,'I,'M,'E,' ,'D,'O,'M,'A,'I,'N,' ,'M,'A,
'Y,' ,'C,'H,'A,'N,'G,'E,' ,'F,'R,'E,'Q,' ,'L,'I,'M,'I,'T,'S,
13,    & length byte &
& "  FREQUENCY (" &
' ,' ,'F,'R,'E,'Q,'U,'E,'N,'C,'Y,' ,'(,
8,     & length byte &
& "  TIME (" &
' ,' ,'T,'I,'M,'E,' ,'(,
7,     & length byte &
& "  AUX (" &
' ,' ,'A,'U,'X,' ,'(,
0;

END$
```

```
CANNOT.WORK.PD8510                THU, DEC 22, 1983, 10:22 AM      PAGE  1

INTEGER CONSTANT
   scalar_mkr  := 0,
   log_ang_mkr := 1,
   lin_ang_mkr := 2,
   lin_lin_mkr := 3,
   z_mkr       := 4,
   y_mkr       := 5;
```

```
FANNOT.WORK.PD8510                THU, DEC 22, 1983, 10:22 AM      PAGE  1

PROCEDURE  annotate_parameter;                                    EXTERNAL.L;
PROCEDURE  annotate_mkr_value;                                    EXTERNAL.L;
PROCEDURE  output_marker_value;                                   EXTERNAL.L;
PROCEDURE  annotate_ref_value;                                    EXTERNAL.L;
PROCEDURE  annotate_scale;                                        EXTERNAL.L;
SUBROUTINE update_scale;                                          EXTERNAL.L;
SUBROUTINE update_ref_value;                                      EXTERNAL.L;
SUBROUTINE annotate_enhancements;                                 EXTERNAL.L;
```

```
SANNOT.WORK.PD8510                THU, DEC 22, 1983, 10:22 AM      PAGE  1

M68KL,P,"annotation"
BEGIN

TYPELENGTH USER3 : 6;

#FILE fterm.work;                                          & DEBUG &
#FILE fterm3.work;                                         & DEBUG &
#FILE cannot.work;
#FILE fscreen.work;
#FILE fstring.work;
#FILE cactive.work;
#FILE factive2.work;
#FILE facttbl.work;
#FILE cchtable.work;                              & for ch_ constants &
#FILE fchtable.work;
#FILE fchtab2.work;                 & for ch_integer and ch_double &
#FILE fchdata.work;                              & for marker_state &
#FILE ffmt.work;
#FILE fmarker.work;
#FILE ftrace.work;                          & for partial and d_on &
#FILE fgratic.work;      & for graticule_type and trace_and_graticule &
#FILE fdisplay.work;                          & for jmp and printch &
#FILE fcompute.work;                      & for conv_to_z and _to_y &
#FILE ccal.work;                                  & for correct_off &
#FILE caverage.work;                                  & for avg_off &
#FILE fdatap.work;          & for gate_, smoothing_, and log_lin_ang &
                            & and contains ctrace0.work for update_f &
```

```
SANNOT.WORK.PD8510                THU, DEC 22, 1983, 10:22 AM      PAGE  2

#EJECT;
DOUBLE CONSTANT  db_annot_mask          := %01000000,
                 ref_annot_format       := %06040A03;
DOUBLE           mkr_annot_format       = ref_annot_format,
                 scale_annot_format     = ref_annot_format;

ALPHA TABLE param_annotation :=             & Must agree with ccontvar &
      "",             & unused  &           & Maximum size is          &
      'S+177+177,     & s11     &           & param_size from cscreen. &
      'S+178+177,     & s21     &
      'S+177+178,     & s12     &
      'S+178+178,     & s22     &
      'Z+177,         & z1      &
      'Z+178,         & z2      &
      'Y+177,         & y1      &
      'Y+178,         & y2      &
      "User1",        & user1   &
      "User2",        & user2   &
      "User3",        & user3   &
      "User4";        & user4   &
```

```
SANNOT.WORK.PD8510              THU, DEC 22, 1983, 10:22 AM     PAGE  3

#EJECT;
ALPHA TABLE mkr_label :=
      half_vt+primary_marker+"1",
      half_vt+primary_marker+"2",
      half_vt+primary_marker+"3",
      half_vt+primary_marker+"4",
      half_vt+primary_marker+"5",
               vt+vt+marker+"1",
               vt+vt+marker+"2",
               vt+vt+marker+"3",
               vt+vt+marker+"4",
               vt+vt+marker+"5";

INTEGER TABLE mkr_label_display :=                  & indexed by ch &
      0,
      mkr1_label_display,
      mkr2_label_display;

INTEGER TABLE mkr_real_display :=
      0,
      mkr1_real_display,
      mkr2_real_display;

INTEGER TABLE mkr_imag_display :=
      0,
      mkr1_imag_display,
      mkr2_imag_display;

INTEGER TABLE mkr_display_algorithm :=              & indexed by format &
      0,
      scalar_mkr,  &  1 log mag       &
      scalar_mkr,  &  2 lin mag       &
      scalar_mkr,  &  3 phase         &
      scalar_mkr,  &  4 delay         &
      scalar_mkr,  &  5 real          &
      scalar_mkr,  &  6 imaginary     &
      log_ang_mkr, &  7 log polar     &
      lin_ang_mkr, &  8 lin_polar     &
      lin_lin_mkr, &  9 imag vs real  &
      z_mkr,       & 10 z-Smith       &
      y_mkr,       & 11 y-Smith       &
      scalar_mkr;  & 12 swr           &
```

```
SANNOT.WORK.PD8510              THU, DEC 22, 1983, 10:22 AM     PAGE  4

#EJECT;
COMMENT                                                annotate_parameter
**************************************************************************
*
**************************************************************************
;
PROCEDURE  annotate_parameter;                                     ENTRY;
   BEGIN & annotate_parameter &
      INTEGER param_display;
      INTEGER annot_index;

      IF entry_ch_integer(ch_d_state) = d_on THEN
         annot_index := entry_ch_integer(ch_param)
      ELSE
         annot_index := 0;

      IF current_entry_ch = 1 THEN
         param_display := param1_display
      ELSE & current_entry_ch = 2 &
         param_display := param2_display;

      print_string( param_annotation[ annot_index ],
                    param_size, param_display);

   END;  & annotate_parameter &
```

```
SANNOT.WORK.PD8510              THU, DEC 22, 1983, 10:22 AM     PAGE  5

#EJECT;
COMMENT                                                 annotate_mkr_value
**************************************************************************
*
**************************************************************************
;
PROCEDURE  annotate_mkr_value;                                     ENTRY;
   BEGIN & annotate_mkr_value &
      INTEGER d_state,
              m_state,
              index,
              ch,
              fmt,
              dg_addr;
      USER3   mkr_user3;                                        & DESUG &
      COMPLEX mkr_complex;                                      & DEBUG &
      REAL    mkr_real,
              mkr_imag,
              temp_real;
      BYTE ARRAY annot_array[-1:mkr_display_size];
      ALPHA      annot_string;

      & initialize string &
      annot_string := ADRS( annot_array );
      annot_string := init_string( annot_string, mkr_display_size );


      FOR ch := 1 UNTIL max_ch DO
         BEGIN & for &
            d_state := ch_integer( ch_d_state, ch );
            m_state := ch_integer( ch_m_state, ch );
            IF ( ((marker_state AND Z003F) <> 0) AND
                 ((d_state=d_on) OR (m_state=m_on))
               ) THEN
               BEGIN & if &
                  fmt := ch_integer( ch_format, ch );
                  mkr_user3 := ch_mkr_value(ch);                & DEBUG &
                  CASE mkr_display_algorithm[fmt] OF
                     BEGIN & case &
& 0 scalar_mkr  &       BEGIN & scalar &
                           mkr_complex := mkr_user3;
                           mkr_real := REAL( mkr_complex );
                           mkr_imag := IMAG( mkr_complex );
                        END;  & scalar &
& 1 log_ang_mkr &       BEGIN & log_ang_mkr &
                           mkr_real := log_lin_ang(             & log &
                                          ch_double(ch_f_base,ch),
                                          marker_point(
                                                 active_marker,
                                                 ch
                                                 ) * step_size,
                                          TRUE,               & polar &
                                          temp_real,            & lin &
                                          mkr_imag              & ang &
                                             );
                        END;  & log_ang_mkr &
```

```
SANNOT.WORK.PD8510              THU, DEC 22, 1983, 10:22 AM     PAGE  6

& 2 lin_ang_mkr &       BEGIN & lin_ang_mkr &
                           temp_real := log_lin_ang(            & log &
                                          ch_double(ch_f_base,ch),
                                          marker_point(
                                                 active_marker,
                                                 ch
                                                 ) * step_size,
                                          TRUE,               & polar &
                                          mkr_real,,            & lin &
                                          mkr_imag              & ang &
                                             );
                        END;  & lin_lin_mkr &
& 3 lin_lin_mkr &       BEGIN & lin_lin_mkr &
                           mkr_complex := mkr_user3;
                           mkr_real := REAL( mkr_complex );
                           mkr_imag := IMAG( mkr_complex );
                        END;  & lin_lin_mkr &
& 4 z_mkr       &       BEGIN & z_mkr &
                           ASSEMBLE( MOVEM.L mkr_user3, RO/R1; SWAP R1;
                                     JSR     conv_to_z.L;      SWAP R1;
                                     MOVEM.L RO/R1, mkr_user3         );
                           mkr_complex := mkr_user3;
                           mkr_real := REAL( mkr_complex );
                           mkr_imag := IMAG( mkr_complex );
                        END;  & z_mkr &
& 5 y_mkr       &       BEGIN & y_mkr &
                           ASSEMBLE( MOVEM.L mkr_user3, RO/R1; SWAP R1;
                                     JSR     conv_to_y.L;      SWAP R1;
                                     MOVEM.L RO/R1, mkr_user3         );
                           mkr_complex := mkr_user3;
                           mkr_real := REAL( mkr_complex );
                           mkr_imag := IMAG( mkr_complex );
                        END;  & y_mkr &
                     END;  & case &

                  IF ch = current_entry_ch THEN
                     index := active_marker - 1
                  ELSE
                     index := active_marker + 4;
                  print_string( mkr_label[index],
                                mkr_label_size,
                                mkr_label_display[ch]
                              );
                  print_string( append_string(
                                   format_real(
                                      mkr_real,
                                      annot_string,
                                      format_table[
                                         mkr_real_format[fmt]
                                                  ]
                                              ),
                                   suffix[mkr_real_suffix[fmt]]
                                              ),
                                mkr_display_size,
                                mkr_real_display[ch]
                              );
```

```
SANNOT.WORK.PD8510              THU, DEC 22, 1983, 10:22 AM     PAGE  7

            IF format_table[mkr_imag_format[fmt]] <> 0 THEN
               BEGIN & if &
                  print_string( append_string(
                                    format_real(
                                          mkr_imag,
                                          annot_string,
                                          format_table[
                                             mkr_imag_format[fmt]
                                                      ]
                                             ),
                                    suffix[mkr_imag_suffix[fmt]]
                                             ),
                                mkr_display_size,
                                mkr_imag_display[ch]
                              );
               END  & if &
            ELSE
               dg_addr := jmp( mkr_imag_display[ch],
                               mkr_imag_display[ch] +
                                  mkr_display_size
                             );
         END  & if &
      ELSE
         dg_addr := jmp( mkr_label_display[ch],
                         mkr_imag_display[ch] + mkr_display_size
                       );
   END;  & for &

END;  & annotate_mkr_value &
```

```
SANNOT.WORK.PD8510              THU, DEC 22, 1983, 10:22 AM     PAGE  8

#EJECT;
COMMENT                                              annotate_ref_value
**********************************************************************
*
**********************************************************************
;
PROCEDURE  annotate_ref_value;                                  ENTRY;
   BEGIN & annotate_ref_value &
      INTEGER ref_display,
              annot_units;
      DOUBLE  annot_format;
      BYTE ARRAY annot_array[-1:ref_size];
      ALPHA      annot_string;

      & initialize string &
      annot_string := ADRS( annot_array );
      annot_string := init_string( annot_string, ref_size );

      IF current_entry_ch = 1 THEN
         ref_display := ref1_display
      ELSE & current_entry_ch = 2 &
         ref_display := ref2_display;
      annot_format := ref_annot_format;
      annot_units := get_active( get_suffix_index, active_ref_value );
      IF ( (annot_units=2) OR (annot_units=5) ) THEN
         annot_format := annot_format OR db_annot_mask;
      print_string( format_real( entry_ch_real( ch_ref_value ),
                                 annot_string,
                                 annot_format
                               ),
                    ref_size,
                    ref_display
                  );

      IF current_entry_ch = 1 THEN
         ref_display := ref1_suffix_display
      ELSE & current_entry_ch = 2 &
         ref_display := ref2_suffix_display;
      print_string( active_suffix( active_ref_value ),
                    ref_suffix_size,
                    ref_display
                  );

   END;  & annotate_ref_value &
```

```
SANNOT.WORK.PD8510              THU, DEC 22, 1983, 10:22 AM     PAGE  9

#EJECT;
COMMENT                                                  annotate_scale
**********************************************************************
*
**********************************************************************
;
PROCEDURE  annotate_scale;                                      ENTRY;
   BEGIN & annotate_scale &
      INTEGER scale_display,
              annot_units;
      DOUBLE  annot_format;
      BYTE ARRAY annot_array[-1:scale_size];
      ALPHA      annot_string;

      & initialize string &
      annot_string := ADRS( annot_array );
      annot_string := init_string( annot_string, scale_size );

      IF current_entry_ch = 1 THEN
         scale_display := scale1_display
      ELSE & current_entry_ch = 2 &
         scale_display := scale2_display;
      annot_format := scale_annot_format;
      annot_units := get_active( get_suffix_index, active_scale );
      IF ( (annot_units=2) OR (annot_units=5) ) THEN
         annot_format := annot_format OR db_annot_mask;
      print_string( format_real( entry_ch_real( ch_scale ),
                                 annot_string,
                                 annot_format
                               ),
                    scale_size,
                    scale_display
                  );

      IF current_entry_ch = 1 THEN
         scale_display := scale1_suffix_display
      ELSE & current_entry_ch = 2 &
         scale_display := scale2_suffix_display;
      clear_string( annot_string );
      append_string( annot_string, active_suffix( active_scale ) );
      print_string( append_ch( annot_string, '/ ),
                    scale_suffix_size,
                    scale_display
                  );

   END;  & annotate_scale &
```

```
SANNOT.WORK.PD8510              THU, DEC 22, 1983, 10:22 AM     PAGE  10

#EJECT;
COMMENT                                                    update_scale
**********************************************************************
*
**********************************************************************
;
SUBROUTINE update_scale;                                        ENTRY;
   BEGIN & update_scale &

      annotate_scale;
      IF graticule_type(current_entry_ch) = smith THEN
         trace_and_graticule;
      partial( update_f );

   END;  & update_scale &
```

```
SANNOT.WORK.PD8510              THU, DEC 22, 1983, 10:22 AM      PAGE  11

#EJECT;
COMMENT                                                        update_ref_value
*******************************************************************************
*
*******************************************************************************
;                                          N
SUBROUTINE update_ref_value;                                          ENTRY;
   BEGIN & update_ref_value &

      annotate_ref_value;
      IF graticule_type(current_entry_ch) = smith THEN
         trace_and_graticule;
      partial( update_f );

   END;  & update_ref_value &
```

```
SANNOT.WORK.PD8510              THU, DEC 22, 1983, 10:22 AM      PAGE  12

#EJECT;
COMMENT                                                   annotate_enhancements
*******************************************************************************
*
*******************************************************************************
;
SUBROUTINE annotate_enhancements;                                     ENTRY;
   BEGIN & annotate_enhancements &
      LABEL exit;                                                   & DEBUG &
                                                                    & DEBUG &
      GO TO exit;                                                   & DEBUG &

      & display enhancement flags &
      IF ( (ch_integer(ch_average_mode, 1) = avg_off) AND
           (ch_integer(ch_average_mode, 2) = avg_off)
         ) THEN
         printch( averaging_display, ' ' )
      ELSE
         printch( averaging_display, 'A' );

      IF ( (ch_integer(ch_correction_mode, 1) = correct_off) AND
           (ch_integer(ch_correction_mode, 2) = correct_off)
         ) THEN
         printch( correction_display, ' ' )
      ELSE
         printch( correction_display, 'C' );

      IF ( (ch_integer(ch_gating, 1) = gate_off) AND
           (ch_integer(ch_gating, 2) = gate_off)
         ) THEN
         printch( gating_display, ' ' )
      ELSE
         printch( gating_display, 'G' );

      IF ( (ch_integer(ch_smoothing_mode, 1) = smoothing_off) AND
           (ch_integer(ch_smoothing_mode, 2) = smoothing_off)
         ) THEN
         printch( smoothing_display, ' ' )
      ELSE
         printch( smoothing_display, 'S' );
                                                                    & DEBUG &
exit:                                                               & DEBUG &

   END;  & annotate_enhancements &

END$
```

```
ZAPPM8M.WORK.PD8510             THU, DEC 22, 1983, 10:23 AM      PAGE   1

#
# Modified for 8510 monitor ROM.
#
#-----------------------------------------------------------------------
# This a software tools script file that will allow
# adding check-sums to data that is to be zapped.
# You will have to create your own copy of this file containing
# addresses, etc. to match your specific setup.
# Note that the shell allows passing parameters in if desired (using
# the notation $1 for first parameter, $2 for second, etc.)
# Also, you may use the "?" option of ZAPP to pick up answers.
#
# This basic script file will work with both "cksum8" and "cksum16"
# and may be edited to use whichever is desired.
# With either, specify <MSBits-addr> the same as <LSBits-addr>
# to get it's respective lower resolution check-sum generation.
#
#                               Lewis Newton
#-----------------------------------------------------------------------
#
# Check-sum generation.
#
# First we run ZAPP to load data in the 64K buffer address space file
# that ZAPP will leave behind when we issue a file equation to
# cause it to be saved.  Here we specify only how data is
# to be read by ZAPP.  We ask for no output at this point by asking
# that 0 locations be output.
#
cat - <<Z >tempcmd:temp
*OBJ ;data file name?
1 ;data type?
N ;disable buffering? (buffering on)
  ;start address?
  ;offset?
0 ;locations? (want no output)
  ;width?
1 ;unprogrammed state?
4 ;option? (hex dump,no output)
N ;more?
Z
@purge zappscxx,temp
@file zappscxx;temp
@file zappcmd=tempcmd,oldtemp
zapp.pub.upsoft
@reset zappcmd
#
# Now we run the check-sum generation program that will add check-sums
# at the appropriate locations in the 64K buffer address space file.
#
@file zappscxx,oldtemp
cksum16.pub.upsoft:mpeio <<Z
2048,4093,4094,4095
Z
@reset zappscxx
#
```

```
ZAPPM8M.WORK.PD8510             THU, DEC 22, 1983, 10:23 AM      PAGE   2

# Now we run zapp and pick up the buffer address space data file
# that now has check-sums in place.  We add no new data, but here
# only specify how data is to be output.
#
cat - <<Z >tempcmd:temp
\$null;data file? (no new data)
      ;data type? (no new data)
OLD   ;disable buffering? (get buffer file)
0     ;start address?
0     ;offset?
4096  ;locations?
      ;width?
1     ;unprogrammed state?
1     ;option?
      ;aux zapper cmds?
N     ;more?
Z
@file zappscxx,oldtemp
@file zappcmd=tempcmd,oldtemp
zapp.pub.upsoft
@reset zappscxx
@reset zappcmd
```

```
ZAPPMON.WORK.PD8510          THU, DEC 22, 1983, 10:23 AM     PAGE   1

#
# Modified for 8510 monitor ROM.
#
#---------------------------------------------------------------------
# This a software tools script file that will allow
# adding check-sums to data that is to be mapped.
# You will have to create your own copy of this file containing
# addresses, etc. to match your specific setup.
# Note that the shell allows passing parameters in if desired (using
# the notation $1 for first parameter, $2 for second, etc.)
# Also, you may use the "?" option of ZAPP to pick up answers.
#
# This basic script file will work with both "cksum8" and "cksum16"
# and may be edited to use whichever is desired.
# With either, specify <MSBits-addr> the same as <LSBits-addr>
# to get it's respective lower resolution check-sum generation.
#
#                              Lewis Newton
#---------------  -   -----------------------------------------------
#
# Check-sum generation.
#
# First we run ZAPP to load data in the 64K buffer address space file
# that ZAPP will leave behind when we issue a file equation to
# cause it to be saved.  Here we specify only how data is
# to be read by ZAPP.  We ask for no output at this point by asking
# that 0 locations be output.
#
cat - <<Z >tempcmd:temp
*OBJ ;data file name?
1 ;data type?
N ;disable buffering? (buffering on)
  ;start address?
  ;offset?
0 ;locations? (want no output)
  ;width?
1 ;unprogrammed state?
4 ;option? (hex dump,no output)
N ;more?
Z
@purge zappscxx,temp
@file zappscxx;temp
@file zappcmd=tempcmd,oldtemp
zapp.pub.upsoft
@reset zappcmd
#
# Now we run the check-sum generation program that will add check-sums
# at the appropriate locations in the 64K buffer address space file.
#
@file zappscxx,oldtemp
cksum16.pub.upsoft:mpeio <<Z
6,8191,4,5
Z
@reset zappscxx
#
```

```
ZAPPMON.WORK.PD8510          THU, DEC 22, 1983, 10:23 AM     PAGE   2

# Now we run zapp and pick up the buffer address space data file
# that now has check-sums in place.  We add no new data, but here
# only specify how data is to be output.
#
cat - <<Z >tempcmd:temp
\$null;data file? (no new data)
      ;data type? (no new data)
OLD   ;disable buffering? (get buffer file)
0     ;start address?
0     ;offset?
8192  ;locations?
      ;width?
1     ;unprogrammed state?
1     ;option?
M31   ;aux zapper cmds?
N     ;more?
Z
@file zappscxx,oldtemp
@file zappcmd=tempcmd,oldtemp
zapp.pub.upsoft
@reset zappscxx
@reset zappcmd
```

```
CARRAY.WORK.PD8510           THU, DEC 22, 1983, 10:23 AM     PAGE   1

BYTE CONSTANT array_ch_mask     := %03,
              time_update_mask  := %20,
              array_update_mask := %40,
              array_abort_mask  := %80;
```

```
FARRAY.WORK.PD8510           THU, DEC 22, 1983, 10:23 AM     PAGE   1

PROCEDURE  array_update;      & a process &              EXTERNAL.L;
```

```
SARRAY.WORK.PD8510              THU, DEC 22, 1983, 10:23 AM      PAGE   1

M68KL,P,"array"
BEGIN

#FILE ftrace.work;
#FILE ffifo.work;
#FILE ffifos.work;
#FILE crins.work;              & for processing_variables and fifo "rins" &
#FILE fkernel.work;                          & for acquire and release &
#FILE fdatap.work;         & for control_data_proc and update_data_proc &
#FILE cchtable.work;
#FILE fchtable.work;
#FILE carray.work;
#FILE ftime.work;                          & for control_data_proc_time &

BYTE time_update_pending;    & pending time-variables update, 1 bit/ch &
```

```
SARRAY.WORK.PD8510              THU, DEC 22, 1983, 10:23 AM      PAGE   2

#EJECT;
COMMENT                                                        array_update
***************************************************************************
a
***************************************************************************
;
PROCEDURE  array_update;        & a process &                       ENTRY;
   BEGIN & array_update &
      LABEL   loop;
      INTEGER fifo_word;
      BYTE    channel,
              fifo_word_upper = fifo_word,
              fifo_word_lower = fifo_word+1,
              ch1_accum,
              ch2_accum;

      time_update_pending := 3;        & first time: update ch1 and ch2 &
      ch1_accum := 0;
      ch2_accum := 0;

loop:

         BEGIN & do &

            fifo_word := read_fifo( array_update_fifo );

            channel := fifo_word_upper AND array_ch_mask;

            IF (channel AND %0001) <> 0 THEN
               ch1_accum := ch1_accum OR fifo_word_lower;
            IF (channel AND %0002) <> 0 THEN
               ch2_accum := ch2_accum OR fifo_word_lower;

            IF (fifo_word_upper AND time_update_mask) <> 0 THEN
               time_update_pending := SBIT(time_update_pending,channel);

            IF (fifo_word_upper AND array_update_mask) <> 0 THEN
               BEGIN & if &
                  acquire( processing_variables );
                  control_data_proc( channel );
                  release( processing_variables );
               END;  & if &

         END;  & do &
            & eventually make this a DO...UNTIL no fifo data pending &


      WHILE (ch1_accum <> 0) DO
         BEGIN & while &
            IF TBIT( time_update_pending, 1 ) THEN
               BEGIN & if &
                  control_data_proc_time( 1 );
                  time_update_pending := RBIT( time_update_pending, 1 );
               END;  & if &

            acquire( processing_variables );
```

```
SARRAY.WORK.PD8510              THU, DEC 22, 1983, 10:23 AM      PAGE   3

            update_data_proc( 1, ch1_accum );
            release( processing_variables );
                                                            & DEBUG &
            ch1_accum := 0;                                 & DEBUG &

         END;  & while &


      WHILE (ch2_accum <> 0) DO
         BEGIN & while &
            IF TBIT( time_update_pending, 2 ) THEN
               BEGIN & if &
                  control_data_proc_time( 2 );
                  time_update_pending := RBIT( time_update_pending, 2 );
               END;  & if &

            acquire( processing_variables );
            update_data_proc( 2, ch2_accum );
            release( processing_variables );
                                                            & DEBUG &
            ch2_accum := 0;                                 & DEBUG &

         END;  & while &

      GO TO loop;

   END;  & array_update &
```

```
SARRAY.WORK.PD8510              THU, DEC 22, 1983, 10:23 AM      PAGE   4

#EJECT;
COMMENT                                               init_array_update_fifo
***************************************************************************
*
***************************************************************************
;
PROCEDURE  init_array_update_fifo;                                  ENTRY;
   BEGIN & init_array_update_fifo &
      init_fifo( array_update_fifo,
                 array_update_fifo_size,
                 array_fifo,
                 array_fifo_not_full,
                 array_fifo_not_empty );
   END;  & init_array_update_fifo &

END$
```

```
CATABLE2.WORK.PD8510          THU, DEC 22, 1983, 10:23 AM     PAGE   1

BYTE CONSTANT     domain_dependent        := 1, & for "active" tables   &
                  format_dependent        := 2,
                  byte_type               := 1, & for active_table_type &
                  integer_type            := 2,
                  domain_n_format_depend  := 3;

BYTE CONSTANT     display_alt             := 0, & for display_alt'_value&
                  dont_display_alt        := 1,
                  make_positive           := 0, & for must_be_positive  &
                  dont_make_positive      := 1,
                  store                   := 0, & for chtable_store     &
                  dont_store              := 1;

INTEGER CONSTANT ch_byte_type     := 1,
                 ch_integer_type  := 2,
                 ch_user3_type    := 3,
                 ch_real_type     := 4,
                 ch_double_type   := 5,
                 ch_quad_type     := 6,
                 ch_none          := 0;
```

```
CATABLES.WORK.PD8510          THU, DEC 22, 1983, 10:23 AM     PAGE   1

INTEGER CONSTANT get_suffix_index        := 0,       & indices into   &
                 get_format_index        := 1,       & "active_tables"&
                 get_min_limit_index     := 2,
                 get_max_limit_index     := 3,
                 get_chtable_index       := 4,
                 get_chtable_type        := 5,
                 get_chtable_store       := 6,
                 get_algorithms          := 7,
                 get_display_alt_value   := 8,
                 get_must_be_positive    := 9,
                 get_log_scale_div_3     := 10;

INTEGER CONSTANT aperture_format       := 3, & index into format_table &
                 distance_format       := 3,
                 frequency_format      := 5,
                 sweep_time_format     := 6,
                 source_pwr_format     := 6,
                 output_format         := 7,
                 output_integer_format:= 8,
                 db_format             := 10,
                 test_set_atten_format:= 11;

INTEGER CONSTANT distance_suffix       := 17; & index into suffix table &
```

```
FATABLES.WORK.PD8510          THU, DEC 22, 1983, 10:23 AM     PAGE   1

#FILE catables.work;

EXTERNAL ALPHA  TABLE suffix.L;
EXTERNAL BYTE   TABLE mkr_real_suffix.L;
EXTERNAL BYTE   TABLE mkr_imag_suffix.L;
EXTERNAL DOUBLE TABLE format_table.L;
EXTERNAL BYTE   TABLE mkr_real_format.L;
EXTERNAL BYTE   TABLE mkr_imag_format.L;
EXTERNAL QUAD   TABLE limit.L;
EXTERNAL DOUBLE TABLE active_tables.L;
EXTERNAL BYTE   TABLE active_table_type.L;
EXTERNAL REAL   TABLE scale_factors.L;
EXTERNAL REAL   TABLE unscale_factors.L;
```

```
SATABLES.WORK.PD8510          THU, DEC 22, 1983, 10:23 AM     PAGE   1

M68KL,P,"atables"
BEGIN

#FILE catable2.work;
#FILE catables.work;
#FILE cchtable.work;
#FILE cchars.work;
```

```
SATABLES.WORK.PD8510          THU, DEC 22, 1983, 10:23 AM     PAGE  2


#EJECT;
GLOBAL ALPHA TABLE suffix :=                         & indexed by suffix_index &
   & 0 &   "",
   & 1 &   "Hz",
   & 2 &   "dB",             & change display_active_... if this changes &
   & 3 &   "Div",
   & 4 &   "s",                          & seconds without distance readout &
   & 5 &   "dBm",            & change display_active_... if this changes &
   & 6 &   "s",                             & seconds with distance readout &
   & 7 &   "V",
   & 8 &   degree,
   & 9 &   omega,
   & 10 &  "S",                                                    & Siemen &
   & 11 &  "U.",            & Units for space critical marker annotation &
   & 12 &  "W",
   & 13 &  "Units",
   & 14 &  "% SPAN",
   & 15 &  "dB/GHz",
   & 16 &  omega+"/s",
   & 17 &  "m",                                                    & meters &
   & XX &  "";

BYTE TABLE suffix_index_neg :=      & MUST BE EVEN LENGTH - PAD AT TOP &
   &-18                 &  format_dependent,
   &-17 log mag         &  2,
   &-16 lin mag         & 13,
   &-15 phase           &  8,
   &-14 delay           &  6,
   &-13 real            & 13,
   &-12 imag            & 13,
   &-11 log polar       & 13,
   &-10 lin polar       & 13,
   & -9 imag vs real    & 13,
   & -8 z smith         & 13,
   & -7 y smith         & 13,
   & -6 vswr            &  0,
   & -5                 &  domain_dependent,
   & -4 freq domain     &  1,
   & -3 time band-pass  &  6,
   & -2 time low-pass   &  6,
   & -1 aux  domain     &  7;
BYTE TABLE suffix_index :=                     & indexed by active function &
   &  0 off             &  0,
   &  1 start           & -5,
   &  2 stop            & -5,
   &  3 center          & -5,
   &  4 span            & -5,
   &  5 cw              & -5,
   &  6 sweep time      &  4,                   & end of source functions &
   &  7 source power    &  5,
   &  8 power slope     & 15,
   &  9 port 1 atten    &  2,
   & 10 port 2 atten    &  2,
   & 11 ref pos'n       &  3,
   & 12 scale/div       & -18,
   & 13 ref value       & -18,
```

```
SATABLES.WORK.PD8510          THU, DEC 22, 1983, 10:23 AM     PAGE  3

   & 14 unused          &  0,
   & 15 title           &  0,
   & 16 # groups hpib   &  0,
   & 17 if avg factor   &  0,
   & 18 smoothing aper.& 14,
   & 19 srq mask prim.  &  0,
   & 20 srq mask secon.&  0,
   & 21 revision        &  0,
   & 22 aux out         &  7,
   & 23 keycode         &  0,
   & 24 electr delay    &  6,
   & 25 phase offset    &  8,
   & 26 marker 1        & -5,
   & 27 marker 2        & -5,
   & 28 marker 3        & -5,
   & 29 marker 4        & -5,
   & 30 marker 5        & -5,
   & 31 address         &  0,
   & 32 peek            &  0,
   & 33 poke            &  0,
   & 34 open c0         &  0,
   & 35 open c1         &  0,
   & 36 open c2         &  0,
   & 37 gate start      &  6,
   & 38 gate stop       &  6,
   & 39 gate center     &  6,
   & 40 gate span       &  6,
   & 41 mag slope       &  0,
   & 42 mag offset      & 13,
   & 43 stimulus slope &  0,
   & 44 stimulus offset& -5,
   & 45 ref plane 1     &  6,
   & 46 ref plane 2     &  6,
   & 47 system z0       &  9,
   & 48 major addr      &  0,
   & 49 minor addr      &  0,
   & 50 pass thru addr &  0,
   & 51 source addr     &  0,
   & 52 test-set addr   &  0,
   & 53 plotter addr    &  0,
   & 54 printer addr    &  0,
   & 55 ch cmd addr     &  0,
   & 56 offset delay    &  6,
   & 57 offset loss     & 16,
   & 58 offset z0       &  9,
   & 59 offset min f    &  1,
   & 60 offset max f    &  1,
   & 61 std id          &  0,
   & 62 std class       &  0,
   & 63 # groups kbd    &  0,
   & 99 place holder    &  0;
GLOBAL BYTE TABLE mkr_real_suffix :=                   & indexed by format &
                           0,
   &    log mag         &  2,
   &    lin mag         & 11, & temporary "U." for "Units" &   & DEBUG &
   &    phase           &  8,
```

```
SATABLES.WORK.PD8510          THU, DEC 22, 1983, 10:23 AM     PAGE  4

   &    delay           &  6,
   &    real            & 11, & temporary "U." for "Units" &   & DEBUG &
   &    imag            & 11, & temporary "U." for "Units" &   & DEBUG &
   &    log polar       &  2,
   &    lin polar       & 11, & temporary "U." for "Units" &   & DEBUG &
   &    imag vs real    & 11, & temporary "U." for "Units" &   & DEBUG &
   &    z smith         &  9,
   &    y smith         & 10,
   &    vswr            &  0;
GLOBAL BYTE TABLE mkr_imag_suffix :=                   & indexed by format &
                           0,
   &    log mag         &  0,
   &    lin mag         &  0,
   &    phase           &  0,
   &    delay           &  0,
   &    real            &  0,
   &    imag            &  0,
   &    log polar       &  8,
   &    lin polar       &  8,
   &    imag vs real    & 11, & temporary "U." for "Units" &   & DEBUG &
   &    z smith         &  9,
   &    y smith         & 10,
   &    vswr            &  0;
```

```
SATABLES.WORK.PD8510          THU, DEC 22, 1983, 10:23 AM     PAGE  5

#EJECT;
& display formats &
GLOBAL DOUBLE TABLE format_table :=   & indexed by active_format_index &
   & 0 &          0,
   & 1 &  %1600140C,  & fixed exponent w/12 decimal digits &
   & 2 &  %1600140C,  & for values stored scaled -- tested by acttbl &
   & 3 &  %16051404,  & general_purpose floating point &
   & 4 &  %17001400,  & fixed integer &
   & 5 &  %1000000F,  & frequency format for private HP-IB &
   & 6 &  %1005000F,  & time and power to source &
   & 7 &  %3000180F,  & for HP-IB output &
   & 8 &  %37000800,  & for HP-IB integer output &
   & 9 &          0,  & unused &
   & 10 & %17051404,  & forced 0 exponent &
   & 11 & %17051400,  & fixed integer scaled &
   & 12 & %1700140F;  & unused ? &

BYTE TABLE active_format_neg :=     & MUST BE EVEN LENGTH - PAD AT TOP &
   &-18 <min scale>     & format_dependent,
   &-17 log mag         &  3,
   &-16 lin mag         &  3,
   &-15 phase           &  3,
   &-14 delay           &  3,
   &-13 real            &  3,
   &-12 imag            &  3,
   &-11 log polar       &  3,
   &-10 lin polar       &  3,
   & -9 imag vs real    &  3,
   & -8 z smith         &  3,
   & -7 y smith         &  3,
   & -6 vswr            & 10,
   & -5 <start...>      & domain_dependent,
   & -4 freq domain     &  1,
   & -3 time band-pass  &  2,
   & -2 time low-pass   &  2,
   & -1 aux  domain     &  2;
BYTE    TABLE active_format_index :=            & index into format_table &
   &  0 off             &  0,
   &  1 start           & -5,
   &  2 stop            & -5,
   &  3 center          & -5,
   &  4 span            & -5,
   &  5 cw              & -5,
   &  6 sweep time      &  3,
   &  7 source power    &  3,
   &  8 power slope     &  3,
   &  9 port 1 atten    &  3,
   & 10 port 2 atten    &  3,
   & 11 ref pos'n       &  3,
   & 12 scale/div       & -18,
   & 13 ref value       & -18,
   & 14 unused          &  0,
   & 15 title           &  0,
   & 16 # groups hpib   &  0,
   & 17 if avg factor   &  3,
   & 18 smoothing aper.& 10,
```

```
SATABLES.WORK.PD8510          THU, DEC 22, 1983, 10:23 AM     PAGE   6

   & 19 srq mask prim.  &   4,
   & 20 srq mask secon.&   4,
   & 21 revision        &   0,
   & 22 aux out         &   3,
   & 23 keycode         &   0,
   & 24 electr delay    &   1,
   & 25 phase offset    &   3,
   & 26 marker 1        &  -5,
   & 27 marker 2        &  -5,
   & 28 marker 3        &  -5,
   & 29 marker 4        &  -5,
   & 30 marker 5        &  -5,
   & 31 address         &   4,
   & 32 peek            &   4,
   & 33 poke            &   4,
   & 34 open c0         &   3,
   & 35 open c1         &   3,
   & 36 open c2         &   3,
   & 37 gate start      &   2,
   & 38 gate stop       &   2,
   & 39 gate center     &   2,
   & 40 gate span       &   2,
   & 41 mag slope       & -18,
   & 42 mag offset      & -18,
   & 43 stimulus slope &   3,
   & 44 stimulus offset&  -5,
   & 45 ref plane 1     &   1,
   & 46 ref plane 2     &   1,
   & 47 system z0       &   3,
   & 48 major addr      &   4,
   & 49 minor addr      &   4,
   & 50 pass thru addr &   4,
   & 51 source addr     &   4,
   & 52 test-set addr  &   4,
   & 53 plotter addr    &   4,
   & 54 printer addr    &   4,
   & 55 ch cmd addr     &   4,
   & 56 offset delay    &   1,
   & 57 offset loss     &   3,
   & 58 offset z0       &   3,
   & 59 offset min f    &   3,
   & 60 offset max f    &   3,
   & 61 std id          &   0,
   & 62 std class       &   0,
   & 63 # groups kbd    &   0,
   & 99 place holder    &   0;
GLOBAL BYTE TABLE mkr_real_format :=                 & indexed by format &
                                 0,
   &    log mag         &  10,
   &    lin mag         &   3,
   &    phase           &   3,
   &    delay           &   3,
   &    real            &   3,
   &    imag            &   3,
   &    log polar       &  10,
   &    lin polar       &   3,
```

```
SATABLES.WORK.PD8510          THU, DEC 22, 1983, 10:23 AM     PAGE   7

   &    imag vs real   &   3,
   &    z smith        &   3,
   &    y smith        &   3,
   &    vswr           &  10;
GLOBAL BYTE TABLE mkr_imag_format :=                 & indexed by format &
                                0,
   &    log mag        &   0,
   &    lin mag        &   0,
   &    phase          &   0,
   &    delay          &   0,
   &    real           &   0,
   &    imag           &   0,
   &    log polar      &   3,
   &    lin polar      &   3,
   &    imag vs real   &   3,
   &    z smith        &   3,
   &    y smith        &   3,
   &    vswr           &   0;
```

```
SATABLES.WORK.PD8510          THU, DEC 22, 1983, 10:23 AM     PAGE   8

#EJECT;
GLOBAL QUAD TABLE limit := & indexed by min_limit_ and max_limit_index &
&   / . / / / /  --  / = 10**3   . = 10**12  &
                  0, &  0 no limit operation &
                  0, &  1 zero &
                  1, &  2 &
                 10, &  3 &
                 22, &  4 max number of cal standards &
                 31, &  5 maximum HP-IB address (31=off) &
                199, &  6 (4 times max title set index) - 1 &
               4096, &  7 &
              65535, &  8 max integer      = X000000000000FFFF &
             -32768, &  9 min integer      = XFFFFFFFFFFFF8000 &
          -25000000, & 10 min time (time domain) scaled &
         2000000000, & 11 max time (time domain) scaled &
                  0, & 12 min frequency (modified by test-set limits) &
                  0, & 13 min marker -- set by update_start_stop_... &
         1000000000, & 14 scaled 0.001 &
        -2147483648, & 15 min double       = XFFFFFFFF80000000 &
         4294967295, & 16 max double       = X00000000FFFFFFFF &
        10000000000, & 17 scaled 0.01 &
       100000000000, & 18 scaled 0.1 (min smoothing aperture only) &
       999000000000, & 19 max marker -- set by update_start_stop_... &
       999000000000, & 20 max frequency (modified by test-set limits) &
       999000000000, & 21 max frequency (unlimited by source/testset) &
      2000000000000, & 22 scaled 2 &
      9995117190000, & 23 scale_factor*10/2048 -- max aux out &
    -10000000000000, & 24 scaled  -10 &
     10000000000000, & 25 scaled   10 &
     20000000000000, & 26 scaled 20        = 000001D1A94A2000 &
-100000000000000000, & 27 scaled -100@15 &
 100000000000000000, & 28 scaled  100@15 &
    127000000000000, & 29 max byte scaled = X000008BCF2FD1800 &
   -360000000000000, & 30 scaled -360 &
    360000000000000, & 31 scaled  360 &
   -500000000000000, & 32 scaled -500 &
    500000000000000, & 33 scaled  500 &
       200000000000, & 34 scaled 0.2 temporary Smith ref_value&& DEBUG &
        40000000000; & 34 scaled 0.04 temporary Smith scale &  & DEBUG &
&   \ . \ \ \ \  --  \ = 10**3   . = 10**12  &

BYTE TABLE min_limit_index_neg :=   & MUST BE EVEN LENGTH - PAD AT TOP &
   &-32 filler          &  0,
   &-31 <min ref_value>& format_dependent,
   &-30 log mag         &  32,
   &-29 lin mag         &  32,
   &-28 phase           &  32,
   &-27 delay           &  32,
   &-26 real            &  32,
   &-25 imag            &  32,
   &-24 log polar       &  32,
   &-23 lin polar       &  32,
   &-22 imag vs real    &  32,
   &-21 z smith         &  34,
   &-20 y smith         &  34,
   &-19 vswr            &  32,
```

```
SATABLES.WORK.PD8510          THU, DEC 22, 1983, 10:23 AM     PAGE   9

   &-18 <min scale>     & format_dependent,
   &-17 log mag         &  14,
   &-16 lin mag         &   3,
   &-15 phase           &   3,
   &-14 delay           &   3,
   &-13 real            &   3,
   &-12 imag            &   3,
   &-11 log polar       &  14,
   &-10 lin polar       &   3,
   & -9 imag vs real    &   3,
   & -8 z smith         &  35,
   & -7 y smith         &  35,
   & -6 vswr            &   3,
   & -5 <start...>      & domain_dependent,
   & -4 freq domain     &  12,
   & -3 time band-pass &  10,
   & -2 time low-pass  &  10,
   & -1 aux domain      &  24;
BYTE TABLE min_limit_index :=                    & index into limit table &
   &  0 off             &   0,                   &  0 means no limit      &
   &  1 start           &  -5,
   &  2 stop            &  -5,
   &  3 center          &  -5,
   &  4 span            &   0,
   &  5 cw              &  -5,
   &  6 sweep time      &  17,
   &  7 source power    &   0,
   &  8 power slope     &   0,
   &  9 port 1 atten    &   1,
   & 10 port 2 atten    &   1,
   & 11 ref pos'n       &   1,
   & 12 scale/div       & -18,
   & 13 ref value       & -31,
   & 14 unused          &   0,
   & 15 title           &   1,
   & 16 # groups hpib   &   2,
   & 17 if avg factor   &   1,
   & 18 smoothing aper.&  18,
   & 19 srq mask prim. &   1,
   & 20 srq mask secon.&   1,
   & 21 revision        &   0,
   & 22 aux out         &  24,
   & 23 keycode         &   1,
   & 24 electr delay    &  27,
   & 25 phase offset    &  30,
   & 26 marker 1        &  13,    & domain dependence handled by dynamic &
   & 27 marker 2        &  13,    & limit changes with start_stop_...    &
   & 28 marker 3        &  13,
   & 29 marker 4        &  13,
   & 30 marker 5        &  13,
   & 31 address         &  15,
   & 32 peek            &   0,
   & 33 poke            &   9,
   & 34 open c0         &   0,
   & 35 open c1         &   0,
   & 36 open c2         &   0,
```

```
SATABLES.WORK.PD8510            THU, DEC 22, 1983, 10:23 AM     PAGE  10

   & 37 gate start     &  10,
   & 38 gate stop      &  10,
   & 39 gate center    &  10,
   & 40 gate span      &  10,
   & 41 mag slope      &   0,
   & 42 mag offset     &   0,
   & 43 stimulus slope &   0,
   & 44 stimulus offset&   0,
   & 45 ref plane 1    &  27,
   & 46 ref plane 2    &  27,
   & 47 system z0      &  22,
   & 48 major addr     &   1,
   & 49 minor addr     &   1,
   & 50 pass thru addr &   1,
   & 51 source addr    &   1,
   & 52 test-set addr  &   1,
   & 53 plotter addr   &   1,
   & 54 printer addr   &   1,
   & 55 ch cmd addr    &   1,
   & 56 offset delay   &  27,
   & 57 offset loss    &   0,
   & 58 offset z0      &   0,
   & 59 offset min f   &   1,
   & 60 offset max f   &   1,
   & 61 std id         &   2,
   & 62 std class      &   2,
   & 63 # groups kbd   &   2,
   & 99 place holder   &   0;

BYTE TABLE max_limit_index_neg :=   & MUST BE EVEN LENGTH - PAD AT TOP &
   &-18 <max_scale>    & format_dependent,
   &-17 log mag        &  33,
   &-16 lin mag        &  33,
   &-15 phase          &  33,
   &-14 delay          &  28,
   &-13 real           &  33,
   &-12 imag           &  33,
   &-11 log polar      &  33,
   &-10 lin polar      &  33,
   & -9 imag vs real   &  33,
   & -8 z smith        &  33,
   & -7 y smith        &  33,
   & -6 vswr           &  33,
   & -5                & domain_dependent,
   & -4 freq domain    &  20,
   & -3 time band-pass &  11,
   & -2 time low-pass  &  11,
   & -1 aux  domain    &  23;
BYTE TABLE max_limit_index :=                      & index into limit table &
   &  0 off            &   0,                      &  0 means no limit      &
   &  1 start          &  -5,
   &  2 stop           &  -5,
   &  3 center         &  -5,
   &  4 span           &   0,
   &  5 cw             &  -5,
   &  6 sweep time     &  33,
```

```
SATABLES.WORK.PD8510            THU, DEC 22, 1983, 10:23 AM     PAGE  11

   &  7 source power   &   0,
   &  8 power slope    &   0,
   &  9 port 1 atten   &  29,
   & 10 port 2 atten   &  29,
   & 11 ref pos'n      &  25,
   & 12 scale/div      & -18,
   & 13 ref value      &  33,
   & 14 unused         &   0,
   & 15 title          &   6,
   & 16 # groups hpib  &   7,
   & 17 if avg factor  &   7,
   & 18 smoothing aper.&  26,
   & 19 srq mask prim. &   8,
   & 20 srq mask secon.&   8,
   & 21 revision       &   0,
   & 22 aux out        &  23,
   & 23 keycode        &   8,
   & 24 electr delay   &  28,
   & 25 phase offset   &  31,
   & 26 marker 1       &  19,       & domain dependence handled by dynamic &
   & 27 marker 2       &  19,       & limit changes with start_stop_...    &
   & 28 marker 3       &  19,
   & 29 marker 4       &  19,
   & 30 marker 5       &  19,
   & 31 address        &  16,
   & 32 peek           &   0,
   & 33 poke           &   8,
   & 34 open c0        &   0,
   & 35 open c1        &   0,
   & 36 open c2        &   0,
   & 37 gate start     &  11,
   & 38 gate stop      &  11,
   & 39 gate center    &  11,
   & 40 gate span      &  11,
   & 41 mag slope      &   0,
   & 42 mag offset     &  33,
   & 43 stimulus slope &   0,
   & 44 stimulus offset&  -5,
   & 45 ref plane 1    &  28,
   & 46 ref plane 2    &  28,
   & 47 system z0      &  33,
   & 48 major addr     &   5,
   & 49 minor addr     &   5,
   & 50 pass thru addr &   5,
   & 51 source addr    &   5,
   & 52 test-set addr  &   5,
   & 53 plotter addr   &   5,
   & 54 printer addr   &   5,
   & 55 ch cmd addr    &   5,
   & 56 offset delay   &  28,
   & 57 offset loss    &   0,
   & 58 offset z0      &   0,
   & 59 offset min f   &  21,
   & 60 offset max f   &  21,
   & 61 std id         &   4,
   & 62 std class      &   4,
```

```
SATABLES.WORK.PD8510            THU, DEC 22, 1983, 10:23 AM     PAGE  12

   & 63 # groups kbd   &   7,
   & 99 place holder   &   0;
```

```
SATABLES.WORK.PD8510            THU, DEC 22, 1983, 10:23 AM     PAGE  13

#EJECT;
INTEGER TABLE chtable_index_neg :=  & MUST BE EVEN LENGTH - PAD AT TOP &
   &-10                & domain_dependent,
   & -9 freq domain    & ch_center_stimulus,          & freq via HP-IB &
   & -8 time band-pass & ch_center_time,
   & -7 time low-pass  & ch_center_time,
   & -6 aux  domain    & ch_center_aux_out,
   & -5                & domain_dependent,
   & -4 freq domain    & ch_start_stimulus,           & freq via HP-IB &
   & -3 time band-pass & ch_start_time,
   & -2 time low-pass  & ch_start_time,
   & -1 aux  domain    & ch_start_aux_out;
INTEGER TABLE chtable_index :=              & indexed by active_function &
   &  0 off            &  0,
   &  1 start          &  -5,
   &  2 stop           & ch_stop_stimulus, & must also be "dont_store"&
   &  3 center         & -10,
   &  4 span           & ch_span_stimulus, & must also be "dont_store"&
   &  5 cw             & -10,
   &  6 sweep time     & ch_sweep_time,
   &  7 source power   & ch_source_power,
   &  8 power slope    & ch_power_slope,
   &  9 port 1 atten   & ch_atten_port1,   & must also be "dont_store"&
   & 10 port 2 atten   & ch_atten_port2,   & must also be "dont_store"&
   & 11 ref pos'n      & ch_ref_position,
   & 12 scale/div      & ch_scale,
   & 13 ref value      & ch_ref_value,
   & 14 unused         &  0,
   & 15 title          &  0,
   & 16 # groups hpib  &  0,
   & 17 if avg factor  & ch_average_factor,
   & 18 smoothing aper.& ch_smoothing_aperture,
   & 19 srq mask prim. &  0,
   & 20 srq mask secon.&  0,
   & 21 revision       &  0,
   & 22 aux out        & ch_center_aux_out,
   & 23 keycode        &  0,
   & 24 electr delay   & ch_elec_delay,
   & 25 phase offset   & ch_phase_offset,
   & 26 marker 1       & ch_marker1,
   & 27 marker 2       & ch_marker2,
   & 28 marker 3       & ch_marker3,
   & 29 marker 4       & ch_marker4,
   & 30 marker 5       & ch_marker5,
   & 31 address        &  0,
   & 32 peek           &  0,
   & 33 poke           &  0,
   & 34 open c0        &  0,
   & 35 open c1        &  0,
   & 36 open c2        &  0,
   & 37 gate start     & ch_gate_start,
   & 38 gate stop      & ch_gate_stop,
   & 39 gate center    & ch_gate_center,
   & 40 gate span      &  0,
   & 41 mag slope      & ch_magnitude_slope,
   & 42 mag offset     & ch_magnitude_offset,
```

```
  & 43 stimulus slope &  ch_stimulus_slope,
  & 44 stimulus offset&  ch_stimulus_offset,
  & 45 ref plane 1    &  ch_ref_plane_1,
  & 46 ref plane 2    &  ch_ref_plane_2,
  & 47 system z0      &  ch_system_z0,
  & 48 major addr     &   0,
  & 49 minor addr     &   0,
  & 50 pass thru addr &   0,
  & 51 source addr    &   0,
  & 52 test-set addr  &   0,
  & 53 plotter addr   &   0,
  & 54 printer addr   &   0,
  & 55 ch cmd addr    &   0,
  & 56 offset delay   &   0,
  & 57 offset loss    &   0,
  & 58 offset z0      &   0,
  & 59 offset min f   &   0,
  & 60 offset max f   &   0,
  & 61 std id         &   0,
  & 62 std class      &   0,
  & 63 # groups kbd   &   0,
  & 99 place holder   &   0;


BYTE TABLE chtable_type :=                        & indexed by active_function &
  &  0 off             &          ch_none,       & select_active_function uses&
  &  1 start           &  ch_quad_type,          & chtable_type to determine  &
  &  2 stop            &  ch_quad_type,          & whether to perform an auto-&
  &  3 center          &  ch_quad_type,          & value load.   ch_none == no.&
  &  4 span            &  ch_quad_type,
  &  5 cw              &  ch_quad_type,
  &  6 sweep time      &  ch_real_type,
  &  7 source power    &  ch_real_type,
  &  8 power slope     &  ch_real_type,
  &  9 port 1 atten    &  ch_real_type,
  & 10 port 2 atten    &  ch_real_type,
  & 11 ref pos'n       &  ch_real_type,
  & 12 scale/div       &  ch_real_type,
  & 13 ref value       &  ch_real_type,
  & 14 unused          &       ch_none,
  & 15 title           &       ch_none,
  & 16 # groups hpib   &       ch_none,
  & 17 if avg factor   &  ch_integer_type,
  & 18 smoothing aper. &  ch_real_type,
  & 19 srq mask prim.  &       ch_none,
  & 20 srq mask secon. &       ch_none,
  & 21 revision        &       ch_none,
  & 22 aux out         &  ch_quad_type,
  & 23 keycode         &       ch_none,
  & 24 electr delay    &  ch_real_type,
  & 25 phase offset    &  ch_real_type,
  & 26 marker 1        &  ch_quad_type,
  & 27 marker 2        &  ch_quad_type,
  & 28 marker 3        &  ch_quad_type,
  & 29 marker 4        &  ch_quad_type,
```

```
  & 30 marker 5       &  ch_quad_type,
  & 31 address        &       ch_none,
  & 32 peek           &       ch_none,
  & 33 poke           &       ch_none,
  & 34 open c0        &       ch_none,
  & 35 open c1        &       ch_none,
  & 36 open c2        &       ch_none,
  & 37 gate start     &  ch_quad_type,
  & 38 gate stop      &  ch_quad_type,
  & 39 gate center    &  ch_quad_type,
  & 40 gate span      &  ch_quad_type,
  & 41 mag slope      &  ch_real_type,
  & 42 mag offset     &  ch_real_type,
  & 43 stimulus slope &  ch_real_type,
  & 44 stimulus offset&  ch_quad_type,
  & 45 ref plane 1    &  ch_real_type,
  & 46 ref plane 2    &  ch_real_type,
  & 47 system z0      &  ch_real_type,
  & 48 major addr     &       ch_none,
  & 49 minor addr     &       ch_none,
  & 50 pass thru addr &       ch_none,
  & 51 source addr    &       ch_none,
  & 52 test-set addr  &       ch_none,
  & 53 plotter addr   &       ch_none,
  & 54 printer addr   &       ch_none,
  & 55 ch cmd addr    &       ch_none,
  & 56 offset delay   &       ch_none,
  & 57 offset loss    &       ch_none,
  & 58 offset z0      &       ch_none,
  & 59 offset min f   &       ch_none,
  & 60 offset max f   &       ch_none,
  & 61 std id         &       ch_none,
  & 62 std class      &       ch_none,
  & 63 # groups kbd   &       ch_none,
  & 99 place holder   &       ch_none;


GLOBAL REAL TABLE scale_factors :=
   1.0,         & 0 &
   1.0@3,       & 1 &
   1.0@6,       & 2 &
   1.0@9,       & 3 &
   1.0@12,      & 4 &
   1.0@15;      & 5 &
GLOBAL REAL TABLE unscale_factors :=
   1.0,         & 0 &
   1.0@-3,      & 1 &
   1.0@-6,      & 2 &
   1.0@-9,      & 3 &
   1.0@-12,     & 4 &
   1.0@-15;     & 5 &

BYTE TABLE log_scale_div_3_neg :=   & MUST BE EVEN LENGTH - PAD AT TOP &
  &-18 scale/ref value&   format_dependent,
  &-17 log mag        &             4,
```

```
  &-16 lin mag         &             4,
  &-15 phase           &             4,
  &-14 delay           &             5,
  &-13 real            &             4,
  &-12 imag            &             4,
  &-11 log polar       &             4,
  &-10 lin polar       &             4,
  & -9 imag vs real    &             4,
  & -8 z smith         &             4,
  & -7 y smith         &             4,
  & -6 vswr            &             4,
  & -5 stimulus/mkrs   & domain_dependent,
  & -4 freq domain     &             0,
  & -3 time band-pass  &             5,
  & -2 time low-pass   &             5,
  & -1 aux  domain     &             4;
GLOBAL BYTE TABLE log_scale_div_3 :=            & indexed by active_function &
  &  0 off             &             0,                 & limited to 0 to 5 &
  &  1 start           &            -5,
  &  2 stop            &            -5,
  &  3 center          &            -5,
  &  4 span            &            -5,
  &  5 cw              &            -5,
  &  6 sweep time      &             4,
  &  7 source power    &             4,
  &  8 power slope     &             4,
  &  9 port 1 atten    &             4,
  & 10 port 2 atten    &             4,
  & 11 ref pos'n       &             4,
  & 12 scale/div       &           -18,
  & 13 ref value       &           -18,
  & 14 unused          &             0,
  & 15 title           &             0,
  & 16 # groups hpib   &             0,
  & 17 if avg factor   &             0,
  & 18 smoothing aper. &             4,
  & 19 srq mask prim.  &             0,
  & 20 srq mask secon. &             0,
  & 21 revision        &             0,
  & 22 aux out         &             4,
  & 23 keycode         &             0,
  & 24 electr delay    &             5,
  & 25 phase offset    &             4,
  & 26 marker 1        &            -5,
  & 27 marker 2        &            -5,
  & 28 marker 3        &            -5,
  & 29 marker 4        &            -5,
  & 30 marker 5        &            -5,
  & 31 address         &             0,
  & 32 peek            &             0,
  & 33 poke            &             0,
  & 34 open c0         &             4,
  & 35 open c1         &             4,
  & 36 open c2         &             4,
  & 37 gate start      &             5,
  & 38 gate stop       &             5,
```

```
  & 39 gate center    &             5,
  & 40 gate span      &             5,
  & 41 mag slope      &             4,
  & 42 mag offset     &             4,
  & 43 stimulus slope &             4,
  & 44 stimulus offset&            -5,
  & 45 ref plane 1    &             5,
  & 46 ref plane 2    &             5,
  & 47 system z0      &             4,
  & 48 major addr     &             0,
  & 49 minor addr     &             0,
  & 50 pass thru addr &             0,
  & 51 source addr    &             0,
  & 52 test-set addr  &             0,
  & 53 plotter addr   &             0,
  & 54 printer addr   &             0,
  & 55 ch cmd addr    &             0,
  & 56 offset delay   &             5,
  & 57 offset loss    &             4,
  & 58 offset z0      &             4,
  & 59 offset min f   &             0,
  & 60 offset max f   &             0,
  & 61 std id         &             0,
  & 62 std class      &             0,
  & 63 # groups kbd   &             0,
  & 99 place holder   &             0;


BYTE TABLE chtable_store_neg :=      & MUST BE EVEN LENGTH - PAD AT TOP &
  & -6 filler         &             0,
  & -5                & domain_dependent,
  & -4 freq domain    &    dont_store,
  & -3 time band-pass &         store,
  & -2 time low-pass  &         store,
  & -1 aux  domain    &         store;
BYTE TABLE chtable_store :=                     & indexed by active_function &
  &  0 off            &    dont_store,
  &  1 start          &            -5,
  &  2 stop           &    dont_store,
  &  3 center         &            -5,
  &  4 span           &    dont_store,
  &  5 cw             &            -5,
  &  6 sweep time     &    dont_store,
  &  7 source power   &    dont_store,
  &  8 power slope    &    dont_store,
  &  9 port 1 atten   &    dont_store,
  & 10 port 2 atten   &    dont_store,
  & 11 ref pos'n      &         store,
  & 12 scale/div      &         store,
  & 13 ref value      &         store,
  & 14 unused         &         store,
  & 15 title          &    dont_store,
  & 16 # groups hpib  &         store,
  & 17 if avg factor  &         store,
  & 18 smoothing aper.&         store,
```

SATABLES.WORK.PD8510 THU, DEC 22, 1983, 10:23 AM PAGE 18

```
   & 19 srq mask prim. &         store,
   & 20 srq mask secon.&         store,
   & 21 revision       &         store,
   & 22 aux out        &         store,
   & 23 keycode        &         store,
   & 24 electr delay   &         store,
   & 25 phase offset   &         store,
   & 26 marker 1       &    dont_store,
   & 27 marker 2       &    dont_store,
   & 28 marker 3       &    dont_store,
   & 29 marker 4       &    dont_store,
   & 30 marker 5       &    dont_store,
   & 31 address        &    dont_store,
   & 32 peek           &    dont_store,
   & 33 poke           &    dont_store,
   & 34 open c0        &    dont_store,
   & 35 open c1        &    dont_store,
   & 36 open c2        &    dont_store,
   & 37 gate start     &    dont_store,
   & 38 gate stop      &    dont_store,
   & 39 gate center    &    dont_store,
   & 40 gate span      &    dont_store,
   & 41 mag slope      &         store,
   & 42 mag offset     &         store,
   & 43 stimulus slope &         store,
   & 44 stimulus offset&         store,
   & 45 ref plane 1    &         store,
   & 46 ref plane 2    &         store,
   & 47 system z0      &         store,
   & 48 major addr     &    dont_store,
   & 49 minor addr     &    dont_store,
   & 50 pass thru addr &    dont_store,
   & 51 source addr    &    dont_store,
   & 52 test-set addr  &    dont_store,
   & 53 plotter addr   &    dont_store,
   & 54 printer addr   &    dont_store,
   & 55 ch cmd addr    &    dont_store,
   & 56 offset delay   &    dont_store,
   & 57 offset loss    &    dont_store,
   & 58 offset z0      &    dont_store,
   & 59 offset min f   &    dont_store,
   & 60 offset max f   &    dont_store,
   & 61 std id         &    dont_store,
   & 62 std class      &    dont_store,
   & 63 # groups kbd   &         store,
   & 99 place holder   &             0;
```

SATABLES.WORK.PD8510 THU, DEC 22, 1983, 10:23 AM PAGE 19

```
$EJECT;
COMMENT                                                              algorithms
*************************************************************************
*
* Algorithms are from routines in SACTIVE.WORK
*
* bit  15    = sign
* bits 14-12 = keypad
* bits 11- 8 = marker
* bits  7- 4 = rpg
* bits  3- 0 = step
*
* KEYPAD ALGORITHMS:
*   0 - keypad disabled
*   1 - terminator keys represent positive exponents
*   2 - terminator keys represent negative exponents
*   3-7 undefined
* "=MARKER" ALGORITHMS:
*   0 - "=MARKER" is inconsistent for current active function
*   1 - use marker stimulus value (e.g. for center frequency)
*   2 - use marker amplitude (e.g. for reference value)
*   3 - use marker magnitude (e.g. for magnitude offset)
*   4 - use marker phase     (e.g. for phase offset)
*   5-F undefined
* RPG ALGORITHMS:
*   0 - rpg disabled
*   1 - hpib source update protocol
*   2 - .1% of stimulus span        value + rpg_count*span/1000
*   3 - count                       value + rpg_count
*   4 - 1                           value + 1*(sign of rpg_count)
*   5 - count/20       [scaled]     value + rpg_count/20
*   6 - .1% scale/div  [scaled]     value + rpg_count*scale/1000
*   7 - .1% value      [scaled]     value + rpg_count*value/1000
*   8 - count/10                    value + rpg_count/10
*   9 - count/100      [scaled]     value + rpg_count/100
*   A - count*count*count           value + rpg_count*rpg_count*rpg_count
*   B-F undefined
* STEP KEY ALGORITHMS:
*   0 - step keys disabled
*   1 - hpib source update protocol
*   2 - 1-2-5 sequence  [scaled or unscaled]
*   3 - 10% of stimulus span            value + step_sign*span/10
*   4 - 1                [scaled]       value + 1*step_sign
*   5 - 1 division       [scaled]       value + step_sign*scale/div
*   6 - undefined
*   7 - 1 division                      value + step_sign*scale/div
*   8 - 10% of value     [scaled]       value + step_sign*value/10
*   9 - 1                               value + 1*step_sign
*   A - 10               [scaled]       value + 10*step_sign
*   B-F undefined
*
* [scaled] algorithms apply to active functions that are scaled (see
*    "scale_factor").
*
*************************************************************************
;
```

SATABLES.WORK.PD8510 THU, DEC 22, 1983, 10:23 AM PAGE 20

```
INTEGER TABLE algorithms_neg :=      & MUST BE EVEN LENGTH - PAD AT TOP &
   &-20 gate markers   & domain_dependent,
   &-19 freq domain    &  %2072,
   &-18 time band-pass &  %2123,
   &-17 time low-pass  &  %2123,
   &-16 aux  domain    &  %2072,
   &-15 delays         & domain_dependent,
   &-14 freq domain    &  %2232,
   &-13 time band-pass &  %21A2,
   &-12 time low-pass  &  %21A2,
   &-11 aux  domain    &  %20A2,
   &-10 markers        & domain_dependent,
   & -9 freq domain    &  %1123,
   & -8 time band-pass &  %2123,
   & -7 time low-pass  &  %2123,
   & -6 aux  domain    &  %2123,
   & -5 stimuli        & domain_dependent,
   & -4 freq domain    &  %1111,
   & -3 time band-pass &  %2123,
   & -2 time low-pass  &  %2123,
   & -1 aux  domain    &  %2123;
INTEGER TABLE algorithms :=
   &  0 off            &  %0000,
   &  1 start          &     -5,
   &  2 stop           &     -5,
   &  3 center         &     -5,
   &  4 span           &     -5,
   &  5 cw             &     -5,
   &  6 sweep time     &  %2011,          & end of source functions &
   &  7 source power   &  %2054,
   &  8 power slope    &  %2054,
   &  9 port 1 atten   &  %100A,
   & 10 port 2 atten   &  %100A,
   & 11 ref pos'n      &  %2054,
   & 12 scale/div      &  %2062,
   & 13 ref value      &  %2265,
   & 14 unused         &  %0000,
   & 15 title          &  %1089,
   & 16 # groups hpib  &  %1000,
   & 17 if avg factor  &  %1082,
   & 18 smoothing aper.&  %1052,
   & 19 srq mask prim. &  %1000,
   & 20 srq mask secon.&  %1000,
   & 21 revision       &  %0000,
   & 22 aux out        &  %2054,
   & 23 keycode        &  %1000,
   & 24 electr delay   &    -15,
   & 25 phase offset   &  %1492,
   & 26 marker 1       &    -10,
   & 27 marker 2       &    -10,
   & 28 marker 3       &    -10,
   & 29 marker 4       &    -10,
   & 30 marker 5       &    -10,
   & 31 address        &  %1039,
   & 32 peek           &  %1000,
   & 33 poke           &  %1039,
```

SATABLES.WORK.PD8510 THU, DEC 22, 1983, 10:23 AM PAGE 21

```
   & 34 open c0        &  %1000,
   & 35 open c1        &  %1000,
   & 36 open c2        &  %1000,
   & 37 gate start     &    -20,
   & 38 gate stop      &    -20,
   & 39 gate center    &    -20,
   & 40 gate span      &    -20,
   & 41 mag slope      &  %2072,
   & 42 mag offset     &  %2272,
   & 43 stimulus slope &  %2072,
   & 44 stimulus offset&     -5,
   & 45 ref plane 1    &    -15,
   & 46 ref plane 2    &    -15,
   & 47 system z0      &  %2072,
   & 48 major addr     &  %1049,
   & 49 minor addr     &  %1049,
   & 50 pass thru addr &  %1049,
   & 51 source addr    &  %1049,
   & 52 test-set addr  &  %1049,
   & 53 plotter addr   &  %1049,
   & 54 printer addr   &  %1049,
   & 55 ch cmd addr    &  %1049,
   & 56 offset delay   &  %21A2,
   & 57 offset loss    &  %2172,
   & 58 offset z0      &  %2072,
   & 59 offset min f   &  %1111,
   & 60 offset max f   &  %1111,
   & 61 std id         &  %1000,
   & 62 std class      &  %1000,
   & 63 # groups kbd   &  %1000,
   & 99 place holder   &  %0000;
```

```
SATABLES.WORK.PD8510          THU, DEC 22, 1983, 10:23 AM     PAGE  22

#EJECT;
GLOBAL                                                  & DEBUG &
BYTE TABLE display_alternate_value :=
   &  0 off              &    dont_display_alt,
   &  1 start            &    dont_display_alt,
   &  2 stop             &    dont_display_alt,
   &  3 center           &    dont_display_alt,
   &  4 span             &    dont_display_alt,
   &  5 cw               &    dont_display_alt,
   &  6 sweep time       &    dont_display_alt,
   &  7 source power     &    dont_display_alt,
   &  8 power slope      &    dont_display_alt,
   &  9 port 1 atten     &    dont_display_alt,
   & 10 port 2 atten     &    dont_display_alt,
   & 11 ref pos'n        &    dont_display_alt,
   & 12 scale/div        &    dont_display_alt,
   & 13 ref value        &    dont_display_alt,
   & 14 unused           &    dont_display_alt,
   & 15 title            &    dont_display_alt,
   & 16 # groups hpib    &    dont_display_alt,
   & 17 if avg factor    &    dont_display_alt,
   & 18 smoothing aper.  &    dont_display_alt,
   & 19 srq mask prim.   &    dont_display_alt,
   & 20 srq mask secon.  &    dont_display_alt,
   & 21 revision         &    dont_display_alt,
   & 22 aux out          &    dont_display_alt,
   & 23 keycode          &    dont_display_alt,
   & 24 electr delay     &    dont_display_alt,
   & 25 phase offset     &    dont_display_alt,
   & 26 marker 1         &         display_alt,
   & 27 marker 2         &         display_alt,
   & 28 marker 3         &         display_alt,
   & 29 marker 4         &         display_alt,
   & 30 marker 5         &         display_alt,
   & 31 address          &    dont_display_alt,
   & 32 peek             &    dont_display_alt,
   & 33 poke             &    dont_display_alt,
   & 34 open c0          &    dont_display_alt,
   & 35 open c1          &    dont_display_alt,
   & 36 open c2          &    dont_display_alt,
   & 37 gate start       &    dont_display_alt,
   & 38 gate stop        &    dont_display_alt,
   & 39 gate center      &    dont_display_alt,
   & 40 gate span        &    dont_display_alt,
   & 41 mag slope        &    dont_display_alt,
   & 42 mag offset       &    dont_display_alt,
   & 43 stimulus slope   &    dont_display_alt,
   & 44 stimulus offset  &    dont_display_alt,
   & 45 ref plane 1      &    dont_display_alt,
   & 46 ref plane 2      &    dont_display_alt,
   & 47 system z0        &    dont_display_alt,
   & 48 major addr       &    dont_display_alt,
   & 49 minor addr       &    dont_display_alt,
   & 50 pass thru addr   &    dont_display_alt,
   & 51 source addr      &    dont_display_alt,
   & 52 test-set addr    &    dont_display_alt,
```

```
SATABLES.WORK.PD8510          THU, DEC 22, 1983, 10:23 AM     PAGE  23

   & 53 plotter addr     &    dont_display_alt,
   & 54 printer addr     &    dont_display_alt,
   & 55 ch cmd addr      &    dont_display_alt,
   & 56 offset delay     &    dont_display_alt,
   & 57 offset loss      &    dont_display_alt,
   & 58 offset z0        &    dont_display_alt,
   & 59 offset min f     &    dont_display_alt,
   & 60 offset max f     &    dont_display_alt,
   & 61 std id           &    dont_display_alt,
   & 62 std class        &    dont_display_alt,
   & 63 # groups kbd     &    dont_display_alt,
   & 99 place holder     &    dont_display_alt;


BYTE TABLE must_be_positive_neg :=  & MUST BE EVEN LENGTH - PAD AT TOP &
   & -6 filler           &         0,
   & -5                  & domain_dependent,
   & -4 freq domain      &         make_positive,
   & -3 time band-pass   &    dont_make_positive,
   & -2 time low-pass    &    dont_make_positive,
   & -1 aux  domain      &    dont_make_positive;
BYTE TABLE must_be_positive :=              & for =marker in delta mode &
   &  0 off              &    dont_make_positive,
   &  1 start            &         -5,
   &  2 stop             &         -5,
   &  3 center           &         -5,
   &  4 span             &         make_positive,
   &  5 cw               &         -5,
   &  6 sweep time       &         make_positive,
   &  7 source power     &    dont_make_positive,
   &  8 power slope      &    dont_make_positive,
   &  9 port 1 atten     &         make_positive,
   & 10 port 2 atten     &         make_positive,
   & 11 ref pos'n        &    dont_make_positive,
   & 12 scale/div        &         make_positive,
   & 13 ref value        &    dont_make_positive,
   & 14 unused           &    dont_make_positive,
   & 15 title            &         make_positive,
   & 16 # groups hpib    &         make_positive,
   & 17 if avg factor    &         make_positive,
   & 18 smoothing aper.  &         make_positive,
   & 19 srq mask prim.   &         make_positive,
   & 20 srq mask secon.  &         make_positive,
   & 21 revision         &    dont_make_positive,
   & 22 aux out          &         make_positive,
   & 23 keycode          &         make_positive,
   & 24 electr delay     &    dont_make_positive,
   & 25 phase offset     &    dont_make_positive,
   & 26 marker 1         &         make_positive,
   & 27 marker 2         &         make_positive,
   & 28 marker 3         &         make_positive,
   & 29 marker 4         &         make_positive,
   & 30 marker 5         &         make_positive,
   & 31 address          &    dont_make_positive,
   & 32 peek             &    dont_make_positive,
```

```
SATABLES.WORK.PD8510          THU, DEC 22, 1983, 10:23 AM     PAGE  24

   & 33 poke             &    dont_make_positive,
   & 34 open c0          &         make_positive,
   & 35 open c1          &         make_positive,
   & 36 open c2          &         make_positive,
   & 37 gate start       &    dont_make_positive,
   & 38 gate stop        &    dont_make_positive,
   & 39 gate center      &    dont_make_positive,
   & 40 gate span        &         make_positive,
   & 41 mag slope        &    dont_make_positive,
   & 42 mag offset       &    dont_make_positive,
   & 43 stimulus slope   &    dont_make_positive,
   & 44 stimulus offset  &    dont_make_positive,
   & 45 ref plane 1      &    dont_make_positive,
   & 46 ref plane 2      &    dont_make_positive,
   & 47 system z0        &         make_positive,
   & 48 major addr       &         make_positive,
   & 49 minor addr       &         make_positive,
   & 50 pass thru addr   &         make_positive,
   & 51 source addr      &         make_positive,
   & 52 test-set addr    &         make_positive,
   & 53 plotter addr     &         make_positive,
   & 54 printer addr     &         make_positive,
   & 55 ch cmd addr      &         make_positive,
   & 56 offset delay     &    dont_make_positive,
   & 57 offset loss      &    dont_make_positive,
   & 58 offset z0        &         make_positive,
   & 59 offset min f     &         make_positive,
   & 60 offset max f     &         make_positive,
   & 61 std id           &         make_positive,
   & 62 std class        &         make_positive,
   & 63 # groups kbd     &         make_positive,
   & 99 place holder     &    dont_make_positive;
```

```
SATABLES.WORK.PD8510          THU, DEC 22, 1983, 10:23 AM     PAGE  25

#EJECT;
GLOBAL DOUBLE TABLE active_tables :=     & indexed by "get_" constants &
   & get_suffix_index       & ADRS( suffix_index ),
   & get_format_index       & ADRS( active_format_index ),
   & get_min_limit_index    & ADRS( min_limit_index ),
   & get_max_limit_index    & ADRS( max_limit_index ),
   & get_chtable_index      & ADRS( chtable_index ),
   & get_chtable_type       & ADRS( chtable_type ),
   & get_chtable_store      & ADRS( chtable_store ),
   & get_algorithms         & ADRS( algorithms ),
   & get_display_alt_value  & ADRS( display_alternate_value ),
   & get_must_be_positive   & ADRS( must_be_positive ),
   & get_log_scale_div_3    & ADRS( log_scale_div_3 );


GLOBAL BYTE TABLE active_table_type :=  & indexed by "get_" constants &
   & get_suffix_index       & byte_type,
   & get_format_index       & byte_type,
   & get_min_limit_index    & byte_type,
   & get_max_limit_index    & byte_type,
   & get_chtable_index      & integer_type,
   & get_chtable_type       & byte_type,
   & get_chtable_store      & byte_type,
   & get_algorithms         & integer_type,
   & get_display_alt_value  & byte_type,
   & get_must_be_positive   & byte_type,
   & get_log_scale_div_3    & byte_type;

EMD$
```

```
CAVERAGE.WORK.PD8510          THU, DEC 22, 1983, 10:23 AM     PAGE   1

& averaging - [ch_avg_type] &
INTEGER CONSTANT avg_off             := 0,
                 avg_on              := 1,
                 avg_sweep_to_sweep  := 1,
                 avg_point_to_point  := 2;
```

```
FAVERAGE.WORK.PD8510          THU, DEC 22, 1983, 10:24 AM     PAGE   1

SUBROUTINE if_average_on;                                   EXTERNAL.L;
SUBROUTINE if_average_off;                                  EXTERNAL.L;
SUBROUTINE display_smoothing_on;                            EXTERNAL.L;
SUBROUTINE display_smoothing_off;                           EXTERNAL.L;
```

```
SAVERAGE.WORK.PD8510          THU, DEC 22, 1983, 10:24 AM     PAGE   1

M68KL,P,"average"
BEGIN

#FILE ftrace.work;
#FILE fcontv2.work;                                  & rebuild &
#FILE fcontrol.work;
#FILE factive.work;
#FILE factive2.work;
#FILE fchtable.work;
#FILE cchtable.work;
#FILE caverage.work;
#FILE cdatap.work;                   & for avg_ smoothing_  _on _off &
#FILE cresp.work;                & soft key constants for highlighting &
#FILE fmenu.work;                                 & for hilight_on &


SUBROUTINE if_average_on;                                ENTRY;
   BEGIN & if_average_on &
      rebuild := TRUE;
      group_number := 0;                & resets averaging number &
      set_entry_ch_integer( avg_on, ch_average_mode );
      hilight_on( cmd_if_avg_on, cmd_if_avg_off );
      select_active_function( active_if_avg_factor );
   END;  & if_average_on &


SUBROUTINE if_average_off;                               ENTRY;
   BEGIN & if_average_off &
      rebuild := TRUE;
      set_entry_ch_integer( avg_off, ch_average_mode );
      hilight_on( cmd_if_avg_on, cmd_if_avg_off );
      select_active_off( active_if_avg_factor );
   END;  & if_average_off &


SUBROUTINE display_smoothing_on;                         ENTRY;
   BEGIN & display_smoothing_on &
      set_entry_ch_integer( smoothing_on, ch_smoothing_mode );
      hilight_on( cmd_smoothing_on, cmd_smoothing_off );
      select_active_function( active_smoothing_aperture );
      partial( update_d );
   END;  & display_smoothing_on &


SUBROUTINE display_smoothing_off;                        ENTRY;
   BEGIN & display_smoothing_off &
      set_entry_ch_integer( smoothing_off, ch_smoothing_mode );
      hilight_on( cmd_smoothing_on, cmd_smoothing_off );
      partial( update_d );
      select_active_off( active_smoothing_aperture );
   END;  & display_smoothing_off &
```

```
SAVERAGE.WORK.PD8510          THU, DEC 22, 1983, 10:24 AM     PAGE   2

END$
```

```
MBNMAP.WORK.PD8510              THU, DEC 22, 1983, 10:24 AM     PAGE  1

M68KLDR(9.6.83)      TUE, NOV 22, 1983,  4:23 PM
 NAME   MAIN LIMITS          BASE PAGE            RAM

 IMBM0 000FFE 00101C        000808 000808        000800 000800
       TUE, NOV 22, 1983,  4:21 PM  LIBRN   PD8510

 IMBM2 0011FC 0012C2        000808 000808        000800 000800
       TUE, NOV 22, 1983,  4:21 PM  LIBRN   PD8510

 IMBM3 0012FC 00138C        000808 000808        000800 000800
       TUE, NOV 22, 1983,  4:22 PM  LIBRN   PD8510

 IMBM4 0013FC 001408        000808 000808        000800 000800
       TUE, NOV 22, 1983,  4:22 PM  LIBRN   PD8510

 IMBM5 0014FE 001516        000808 000808        000800 000800
       TUE, NOV 22, 1983,  4:22 PM  LIBRN   PD8510

 IMBM6 0015FC 00168C        000808 000808        000800 000800
       TUE, NOV 22, 1983,  4:22 PM  LIBRN   PD8510

 IMBM8 0017FE 00187A        000808 000808        000800 000800
       TUE, NOV 22, 1983,  4:22 PM  LIBRN   PD8510

 IMBMA 0019FC 001AAC        000808 000808        000800 000800
       TUE, NOV 22, 1983,  4:23 PM  LIBRN   PD8510

 IMBMC 001BFC 001CCC        000808 000808        000800 000800
       TUE, NOV 22, 1983,  4:23 PM  LIBRN   PD8510


       LATEST DATE: TUE, NOV 22, 1983,  4:23 PM

       INITIAL STACK POINTER / GLOBAL REG = 000800


 init_mbm    001200  parms_mbm   001300  read_boot_mb001A00  read_mbm    001600
 set_add_mbm 001400  status_mbm  001500  test_mbm    001000  wrt_boot_mbm001C00
 wrt_mbm     001800

 KSPMAX=2 NSPMAX=4 SSPMAX=499 BSPMAX=53 ESPMAX=19 FSPMAX=10
 LSPMAX=70 XSPMAX=0
ELAPSED TIME 0:07
CPU TIME 0:01
```

```
SBOT.WORK.PD8510              THU, DEC 22, 1983, 10:24 AM     PAGE  1

M68KL,P,"bot"
BEGIN

#FILE crins.work;
#FILE cids.work;
#FILE fiocnfig.work;
#FILE fkernel2.work;
#FILE fkernel3.work;
#FILE fintrpt.work;
#FILE fbotkbd.work;
#FILE ffifo.work;
#FILE ffifos.work;
#FILE fbreak.work;
#FILE futil.work;
```

```
SBOT.WORK.PD8510              THU, DEC 22, 1983, 10:24 AM     PAGE  2

#EJECT;
COMMENT
*************************************************************************
* This is the module for the botton box process which services and
*    sents appropiate information to the others process depending on
*    the type of botton  box interrupt.
*
* A special case is a botton box interrupt with no status word reason
*   This is an interrupt caused by the yadc saying that a system
*     trigger adc conversion is done ( in step mode ) ( in sweep mode
*     the hardware generates a stop_sweep irq when sweep is done ).
*************************************************************************
;
INTEGER CONSTANT vto_end_of_range := 12,
                 xadc_stop_sweep  := 11,
                 phase_lock_unlock:= 10,
                 ext_ref_unlock   :=  7,
                 kbd              :=  6,
                 status_mask      := %1CC0;   & composite of bits above&
BYTE CONSTANT byte_zero := 0,            disable_ext_ref_error := 0,
              enable_ext_ref_error :=%80, cal_sig_off := %40;

INTEGER CONSTANT zero        := 0,
                 high_sweep :=15,
                 pause_250mS:= 2;

INTEGER botton_status = botton + %7E,
        adr_check_high_sweep = botton + %78,
        xposctr        = botton + %36;
BYTE    calpha         = botton + %57;
```

```
SBOT.WORK.PD8510              THU, DEC 22, 1983, 10:24 AM     PAGE  3

#EJECT;
PROCEDURE botton_box;          & a process &                     ENTRY;
   BEGIN
      INTEGER status;

      init_botton_kbd;
      iradr( ADRS(intrpt_botton), botton_vctr );

loop: waitio(botton_vctr);
      status := ( NOT botton_status )  AND status_mask ;
      DO
         BEGIN

            IF TBIT( status, xadc_stop_sweep) THEN
               BEGIN
                  write_fifo( fifo_swp_brk, xadc_brk );
                  ASSEMBLE( MOVE xposctr,R0 );
               END;  & if xadc_stop_sweep &

            IF last_trigger THEN      & see note &
               BEGIN
                  last_trigger := 0;
                  write_fifo( fifo_swp_brk, xadc_brk );
               END;  & if trig_flag &

            IF TBIT(status, kbd) THEN
               botton_key;


            IF  TBIT(status, ext_ref_unlock )  THEN
               BEGIN
               & this may cuase problems with viewing the 100khz signal&
               calpha :=  cal_sig_off + disable_ext_ref_error;
               calpha :=  cal_sig_off + enable_ext_ref_error;
               warn( ext_ref_unlocked );
               END    ext_ref_unlock;

            IF  TBIT(status, vto_end_of_range) OR
                TBIT(status, phase_lock_unlock ) THEN
               BEGIN
               IF trigger_mode  OR
                  TBIT( adr_check_high_sweep, high_sweep ) THEN
                  IF  TBIT(status, vto_end_of_range)   THEN
                        write_fifo( fifo_swp_brk, lost_vto  )
                   ELSE  write_fifo( fifo_swp_brk, lost_lock );
               disable_phase_lock_lost;
               END    vto_end_of_range ;

         END do
       UNTIL ( status := ( NOT botton_status )  AND status_mask ) = 0;

      GO TO loop;

   END botton_box;

END$ bot
```

```
FBOTKBD.WORK.PD8510            THU, DEC 22, 1983, 10:24 AM     PAGE   1


   SUBROUTINE init_bottom_kbd;                                   EXTERNAL.L;
   SUBROUTINE bottom_key;                                        EXTERNAL.L;
```

```
SBOTKBD.WORK.PD8510            THU, DEC 22, 1983, 10:24 AM     PAGE   1


M68KL,P,"botkbd"
BEGIN

#FILE fiocnfig.work;
#FILE crins.work;
#FILE ffifo.work;
#FILE ffifos.work;
#FILE fpubib.work;
#FILE cpubib.work;
#FILE fcommand.work;
#FILE fkeys.work;
#FILE ftopkbd.work;

   BYTE CONSTANT key_clk  := %2C,       & clock prescaler := 12         &
                 key_mode := %02,       & n-key rollover, encoded scan &
                 key_err  := %E0,       & clear error clag              &
                 key_out  := %40,       & set output fifo mode          &
                 key_clr  := %C1;       & clear key fifo                &
   BYTE CONSTANT key_stat_mask := %0F;
   INTEGER CONSTANT key_max := %3F;

   BYTE key_cmd  = bottom + %63,
        key_data = bottom + %65,
        key_stat = bottom + %67;
   INTEGER key_code;

   SUBROUTINE init_bottom_kbd;                                      ENTRY;
      BEGIN
         key_cmd := key_mode;
         key_cmd := key_clk;
         key_cmd := key_err;
         key_cmd := key_out;
         key_cmd := key_clr;
      END init_bottom_kbd;


   PROCEDURE  bottom_key;                                           ENTRY;
   BEGIN

      WHILE (key_stat AND key_stat_mask) <> 0 DO
         BEGIN  & while key_stat <> 0 &
            abort_command := TRUE;
            IF TBIT(key_stat,6) THEN
               BEGIN
                  key_cmd := key_clr;
                  IF NOT remote THEN
                     write_fifo( keyboard_fifo, cmd_illegal );
               END if tbit
            ELSE
               BEGIN
                  key_code := INTEGER(key_data) AND %003F;
                  IF key_code > key_max THEN
                     BEGIN & if &
                        IF NOT remote THEN
```

```
SBOTKBD.WORK.PD8510            THU, DEC 22, 1983, 10:24 AM     PAGE   2


                           write_fifo( keyboard_fifo, cmd_illegal );
                     END   & if &
                  ELSE
                     BEGIN & else &
                        key_token := bot_key_table[key_code];
                        set_serial_poll( key_pressed_srq );
                        IF key_token = cmd_local THEN
                           local_key;
                        IF NOT remote THEN
                           write_fifo( keyboard_fifo, key_token );
                     END;  & else &
               END else not tbit;
         END while key_stat <> 0;

   END bottom_key;

END$
```

```
FBOTKEYS.WORK.PD8510           THU, DEC 22, 1983, 10:24 AM     PAGE   1


#FILE ccmddecl.work;

INTEGER TABLE key_table:=
         cmd_ch1,                  & 00 &
         cmd_illegal,              & 01 &
         cmd_illegal,              & 02 &
         cmd_illegal,              & 03 &
         cmd_s11,                  & 04 &
         cmd_s12,                  & 05 &
         cmd_mag,                  & 06 &
         cmd_phase,                & 07 &
         cmd_ch2,                  & 08 &
         cmd_illegal,              & 09 &
         cmd_illegal,              & 10 &
         cmd_illegal,              & 11 &
         cmd_s21,                  & 12 &
         cmd_s22,                  & 13 &
         cmd_delay,                & 14 &
         cmd_polar,                & 15 &
         cmd_correction_menu,      & 16 &
         cmd_domain_menu,          & 17 &
         cmd_display_menu,         & 18 &
         cmd_marker_menu,          & 19 &
         cmd_param_menu,           & 20 &
         cmd_illegal,              & 21 &
         cmd_format_menu,          & 22 &
         cmd_illegal,              & 23 &
         cmd_illegal,              & 24 &
         cmd_illegal,              & 25 &
         cmd_preset,  & lab pilot 1  26 &
         cmd_local,                & 27 &
         cmd_save,                 & 28 &
         cmd_recall,               & 29 &
         cmd_preset,  & proto M      30 &
         cmd_illegal,              & 31 &
         cmd_scale,                & 32 &
         cmd_auto_scale,           & 33 &
         cmd_illegal,              & 34 &
         cmd_start,                & 35 &
         cmd_center,               & 36 &
         cmd_illegal,              & 37 &
         cmd_illegal,              & 38 &
         cmd_illegal,              & 39 &
         cmd_ref_value,            & 40 &
         cmd_ref_position,         & 41 &
         cmd_illegal,              & 42 &
         cmd_stop,                 & 43 &
         cmd_span,                 & 44 &
         cmd_illegal,              & 45 &
         cmd_illegal,              & 46 &
         cmd_illegal,              & 47 &
         cmd_response_menu,        & 48 &
         cmd_illegal,              & 49 &
         cmd_illegal,              & 50 &
         cmd_stimulus_menu,        & 51 &
```

```
F00TKEYS.WORK.PD8510            THU, DEC 22, 1983, 10:24 AM     PAGE   2

        cmd_illegal,              & 52 &
        cmd_illegal,              & 53 &
        cmd_illegal,              & 54 &
        cmd_illegal,              & 55 &
        cmd_illegal,              & 56 &
        cmd_illegal,              & 57 &
        cmd_copy,                 & 58 &
        cmd_tape_menu,            & 59 &
        cmd_system_menu,          & 60 &
        cmd_illegal,              & 61 &
        cmd_measurement_restart,  & 62 &
        cmd_illegal;              & 63 &
```

```
FBREAK.WORK.PD8510              THU, DEC 22, 1983, 10:25 AM     PAGE   1

EXTERNAL BYTE trig_flag.L, mpl_flg.L;

#FILE cbreak.work;

SUBROUTINE check_abort;                                     EXTERNAL.L;
SUBROUTINE  disable_phase_lock_lost;                        EXTERNAL.L;
PROCEDURE get_frequency( effective_now );  VALUE effective_now;
                                   BOOLEAN effective_now;   EXTERNAL.L;
PROCEDURE  break_entry_control(ch); VALUE ch; INTEGER ch;   EXTERNAL.L;
SUBROUTINE break_acq_control;                               EXTERNAL.L;
PROCEDURE coupled_break(state);
   VALUE  state;
   BOOLEAN state;                                           EXTERNAL.L;
BOOLEAN PROCEDURE  maintain_sweep;                          EXTERNAL.L;
BOOLEAN PROCEDURE  step_source(stimulus_value);
   VALUE   stimulus_value;
   INTEGER stimulus_value;                                  EXTERNAL.L;
BOOLEAN PROCEDURE  phase_lock;                              EXTERNAL.L;
SUBROUTINE trigger_yadc;                                    EXTERNAL.L;
SUBROUTINE break_idle;                                      EXTERNAL.L;
BOOLEAN SUBROUTINE break_paused;                            EXTERNAL.L;
```

```
CBREAK.WORK.PD8510              THU, DEC 22, 1983, 10:25 AM     PAGE   1

COMMENT                                              sweep-break reasons
   This block of constant declarations is for both
   SBREAK and FBREAK.
;
INTEGER CONSTANT xadc_brk := 0,abort_sup := %100,exit_break_idle:=%200,
              lost_lock := %400, lost_vto := %C00;

& bits of trig_flag &
BYTE trig_flag_dummy = trig_flag;
BYTE BITFIELD trig_flag_bit = trig_flag_dummy:
                           abort_flg,      sync_flg,
                           trigger_mode,
                           last_trigger,   first_trigger;
& bit in bottom status word &
INTEGER CONSTANT end_of_trigger := 8, mpl_srq_disable := 4;
```

```
SBREAK.WORK.PD8510              THU, DEC 22, 1983, 10:25 AM     PAGE   1

M68KL,P,"break"
BEGIN
COMMENT
************************************************************************
*
* This is the sup_break or break module. It is use to control the source
*  and x_adc during measurement taking .
*
* In the sup_break module are
*    0) init_break
*    1) check_abort
*    2) break_entry_control
*    3) break_acq_control
*    4) coupled_break
*    5) maintain_sweep
*    6) step_source
*    7) phase_lock
*    8) trigger_yadc
*    9) break_idle
*
*   active sup_too fast  and main_phase_lost flags  ( no work proto )
************************************************************************
end of comments;

INTEGER PROCEDURE bcd_of_int(val); VALUE val; INTEGER val;      EXTERNAL;
#FILE fterm.work;                                               & DEBUG &
#FILE fterm2.work;                                              & DEBUG &
#FILE fterm3.work;                                              & DEBUG &
#FILE cdebug.work;                                              & DEBUG &
#FILE fchtable.work;
#FILE fchtab3.work;
#FILE fiocnfig.work;
#FILE crins.work;
#FILE ffifo.work;
#FILE ffifos.work;
#FILE fprivib.work;
#FILE fprivib2.work;
#FILE fkernel.work;
#FILE fkernel3.work;
#FILE futil.work;
#FILE fyadc.work;
#FILE fxadc.work;
#FILE fsize.work;
#FILE fstimuli.work;
#FILE fcnv9x.work;

GLOBAL BYTE trig_flag, mpl_flg ;
EXTERNAL INTEGER  ref_overload,  tst_overload,  xctrl_save;
#FILE cbreak.work;
SUBROUTINE reset_xadc;                                        EXTERNAL.L;

PROCEDURE init_break_sub(base);    VALUE base;  DOUBLE base;    FORWARD;
```

```
#EJECT;
BYTE    botton_byte = botton + 1;
BYTE    mplctl = botton_byte + %16, mploff  =botton_byte + %18,
        ptctl  = botton_byte + %26;
INTEGER ptfreq = botton + %20, rdif = botton + %28, ifcnt =botton + %2A,
        xcmd1 = botton + %32, xstp =botton + %34, xposctr =botton + %36,
        xctr1 = botton + %3C,  bbstatus=botton + %7E;

BITFIELD swp_status:vto_problem, lock_problem, idle_bit, abort_bit ,
                    new_swp_params_effective, rsv, xxx, mid_swp_update,
                     source_settled, yyy, entry_complete, param_bumped;
BYTE CONSTANT max_source_data := 50; & OC (worse) needs 8350=40,8340=48&
BYTE ARRAY source_data[-1:max_source_data];

INTEGER CONSTANT zero := 0,
                 normal := 0, alt_1 := 1, alt_2 := 2,
                 pretune_unlock := 14,  conversion_miss := 9,
                 min_delay :=   0,  delay_200uS := 6,
                 delay_1mS :=  31,  delay_2_0mS := 62,
                 delay_3mS :=  93,
                 delay_6mS := 186,  delay_10mS  := 313,
                 delay_50mS:=1560,
                 if_overload_threshold := 100,
                 invalid := -1, nearly_valid := 0, valid := 1,
                 vto_100Mhz := 1960,          vto_49Mhz := 940,
                 vto_310Mhz := 6160,
                 mpl_gain   := ( (vto_310Mhz - vto_49Mhz)/255 ) + 1;
BYTE CONSTANT hold_main_loop := %20,  disable_lock_error := %10,
              lock_main_loop := %00,   enable_lock_error := %00,
              lock_pretune   := %04,   hold_pretune      := %09;
INTEGER ARRAY debug_data[0:7];                                &debug&
```

```
#EJECT;
COMMENT
***********************************************************************
* The following is declarations for the sweep break vto tables.
* There are two tables one for channel 1 and another for channel 2,
* if alternating. These tables contain the needed information for phase
* locking the VTO without having extra HP-IB bus overhead for "OB"s
* and "OC"s. Of course these tables are only valid if there have been
* no changes in sweep parameters. If a change occur a full valid sweep
* must be taken to learn the needed values ( this will neccessary be
* slower sweep -- longer pauses at bandcross,etc ).
*
* The sweep table consists of sweep_table condition flag and max_bands
* + 1 records fo band info. The band info consists of enough info to
* phase_lock and set up the XADC each sweep ( as explained above ).
***********************************************************************
end of comment;

INTEGER CONSTANT   max_bands      :=   7;

INTEGER CONSTANT   integer_base   :=   0;
INTEGER CONSTANT   next_x_stp     :=   integer_base + 1;
INTEGER CONSTANT   table_index    :=   integer_base + 2;
INTEGER CONSTANT   vto_freq       :=   integer_base + 3;
INTEGER CONSTANT   next_flag      :=   integer_base + 4;
INTEGER CONSTANT   integer_end    :=   next_flag;

INTEGER CONSTANT   band_size      :=   integer_end;
INTEGER CONSTANT   next_band      :=   band_size;
INTEGER CONSTANT   last_band      :=   band_size;
INTEGER CONSTANT   table_size     :=   band_size * ( max_bands + 1);
INTEGER CONSTANT   array_length   :=   table_size + 1;

INTEGER CONSTANT   swp_table_condition:= 0;

INTEGER ARRAY   ch1_swp_table[0:table_size],
                ch2_swp_table[0:table_size];
DOUBLE TABLE table_base := 0,
                         ADRS( ch1_swp_table ),
                         ADRS( ch2_swp_table );
DOUBLE          entry_table_base;
INTEGER POINTER entry_table_ptr = entry_table_base ;
DOUBLE          swp_table_base;
INTEGER POINTER swp_table_ptr = swp_table_base ;
INTEGER POINTER swp_table;
BOOLEAN coupled_tables;
INTEGER bandnum;
BYTE    sw0_ch;
```

```
#EJECT;
COMMENT
***********************************************************************
* The following are tables for computing vto control settings
*     The intent is the for a given RF frequency no matter how reached
*     that the same VTO settings will be reach.
*
* The bandcross values should be derived from the Source, but for
*     now they are fixed. The limitation of the 8510 vto must aslo be
*     accounted for -- 4:1 freq sweep -- vto 70 - 300 Mhz.
*
* harmonic values are computed from end of bandcross values, such that
*     end of band vto max is about 300Mhz. Becuase of sweep voltage and
*     freq inaccuarcies allow bandcrosses to be in error 25Mhz,
*     and a max VTO of 295 Mhz
*      harm = INT {[( BC + 25 Mhz ) + 20 Mhz (IF)]/ 295 Mhz } + 1
*                         (note: in low bands this is fudged a bit)
*
* Loopgain = 15 - 2 * Log base2 ( harmonic )
*                                         log base 2 = 1.44 log base e
*
* The vto_check_step , vto_search_step, and vto_sideband_shift
*  (aka 5, 15, 40 Mhz) tables are the changes of vto needed to cause an
*       IF shift of those amounts
*       NOTE: VTO moves in 50Khz increments
*                   and IF moves in harmonic * VTO shift * 50 Khz
*          5Mhz_shift = INT { [ 5Mhz / (harmonic*50Khz) ] + .5 }
*                       always >= 1
*
***********************************************************************
end of comment;
QUAD TABLE  bandcross_table:= 250000000,  840000000, &8510 VTO bx&
                2400000000, 7000000000,13500000000,  &Source BC&
                20000000000,26500000000,99999999999; &Source BC&
BYTE TABLE harmonic_table  :=   1,  3,
                             9, 25, 47,
                            68, 90,133;
BYTE TABLE loopgain_table  := 15 , 12,
                             9,  6,  4,
                             3,  2,  1;
BYTE TABLE vto_check_step  := 100, 33,
                            11,  4,  2,
                             1,  1,  1;
BYTE TABLE vto_search_step := 200,  67,    &max 255&  & 10 Mhz search&
                           22,  8,   4,
                            3,  2,   1;
INTEGER TABLE vto_sideband_shift := 800, 267,
                            93, 32,  17,
                            12,  9,   6;
```

```
#EJECT;
COMMENT
***********************************************************************
* set_bandnum sets up swp_table to point to the correct band entry
*     ( while checking for maxband ).
***********************************************************************
end of comment;
PROCEDURE set_bandnum(band);     VALUE band;      INTEGER band;
BEGIN
  IF band > max_bands THEN bandnum := max_bands
     ELSE bandnum := band;
  STPNTR( swp_table, ADRS( swp_table_ptr[ bandnum * band_size ] ) );
END set_bandnum;

SUBROUTINE reset_bandnum;
             set_bandnum( 0 );

COMMENT
***********************************************************************
* update_frequency_data reads source to update frequency limits, in
*           responds to a new_swp_params_effective source interrupt.
*        It also handles the "dirtying" of the swp tables
*
***********************************************************************
end of comment;
PROCEDURE get_frequency( effective_now );  VALUE effective_now;
                                        BOOLEAN effective_now;   ENTRY;
BEGIN
    source_data[-1] := max_source_data;
    IF enter_frequency_n_time(
              read_priv_ib(source,no_fun,"OC",ADRS(source_data)) ,
              effective_now  )
        THEN  init_break_sub( table_base[ 3 - current_entry_ch ] );
END get_frequency;

SUBROUTINE update_frequency_data;
BEGIN
          get_frequency( TRUE );
          init_break_sub( entry_table_base );
          IF mid_swp_update THEN  reset_bandnum;
END update_frequency_data;
```

```
SBREAK.WORK.PD8510              THU, DEC 22, 1983, 10:25 AM     PAGE   6

#EJECT;
COMMENT
**************************************************************************
**************************************************************************
end of comment;
SUBROUTINE  disable_phase_lock_lost;                             ENTRY;
BEGIN
   mpl_flg := SBIT( mpl_flg , mpl_srq_disable );
   mplctl  := mpl_flg;
END disable_phase_lock_lost;


SUBROUTINE warn_lock_problem;
BEGIN
   IF vto_problem THEN   warn( vto_over_range  )
                 ELSE   warn( phase_lock_lost );
END check_lost_lock;
```

```
SBREAK.WORK.PD8510              THU, DEC 22, 1983, 10:25 AM     PAGE   7

#EJECT;
COMMENT
**************************************************************************
*  check_fifo_sup_brk
*
**************************************************************************
end of comment;
SUBROUTINE  check_fifo_sup_brk;
   BEGIN

   sup_status := read_fifo(fifo_sup_brk);

   IF new_sup_params_effective THEN
      BEGIN & if &
         update_frequency_data;
         trig_priv_ib(source);
      END   & if &
   ELSE IF mid_sup_update THEN
      BEGIN
         sync_flg := 1;
         warn( sup_sync_err );
      END
   ELSE IF lock_problem THEN
      warn_lock_problem;

   IF sup_status = abort_sup THEN
      abort_flg := 1;

   END check_fifo_sup_brk;

COMMENT
**************************************************************************
*   check_abort
*
**************************************************************************
end of comment;
SUBROUTINE check_abort;                                          ENTRY;
BEGIN
    IF abort_flg THEN
       BEGIN
       abort_flg := 0;
       send( aborted );
       END;
END check_abort;
```

```
SBREAK.WORK.PD8510              THU, DEC 22, 1983, 10:25 AM     PAGE   8

#EJECT;
COMMENT
**************************************************************************
*  find_index finds the index to the vto harmonic number and gain tables
*     for a given RF freq.
*     See comments about bandcross tables.
**************************************************************************
end of comment;
INTEGER PROCEDURE find_index(freq); VALUE freq; QUAD freq;
BEGIN
   INTEGER index;

   index:=0;
   WHILE ( freq > bandcross_table[ index ] ) AND ( index < max_bands )
         DO index := index + 1;
   find_index := index;
END find_index;
```

```
SBREAK.WORK.PD8510              THU, DEC 22, 1983, 10:25 AM     PAGE   9

#EJECT;
COMMENT
**************************************************************************
* pretune_vto set and locks the the vto to a selected freq
*     it then will wait for the selected delay ( to allow settling )
*
* The order of operations is very important !!
*
* The selected vto is in 50Khz steps and is 2Mhz lower than desired.
*
* Generally the delay is 2nS for small steps and 8nS for large steps.
**************************************************************************
end of comment;
PROCEDURE pretune_vto( freq , time_delay ); VALUE freq, time_delay;
                                          INTEGER freq, time_delay;
BEGIN
INTEGER bcd_freq;

   IF freq < vto_49Mhz  THEN freq := vto_49Mhz;
   IF freq > vto_310Mhz THEN freq := vto_310Mhz;
   bcd_freq := bcd_of_int( RIGHT( freq , 1 ) );
   IF NOT TBIT( freq, 0 ) THEN bcd_freq := SBIT( bcd_freq , 15 );

   mploff := ( (freq - vto_49Mhz) / mpl_gain )  ;
   mpl_flg  :=
   mplctl   := hold_main_loop  +  disable_lock_error
                       +  loopgain_table[ sup_table[table_index] ];

   ptfreq := bcd_freq;

   ptctl  := lock_pretune;

   delay( time_delay );

END pretune_vto;
```

```
SBREAK.WORK.PD8510                THU, DEC 22, 1983, 10:25 AM      PAGE  10

#EJECT;
COMMENT
***************************************************************************
* compute_vto_and_pretune  computes and pretunes the vto to the inputted
*   frequency and other previous set sup_table values --i.e. table_index
***************************************************************************
end of comment;
PROCEDURE compute_vto_and_pretune( freq);     VALUE freq;
                                               QUAD freq;
BEGIN
   pretune_vto(
       ( sup_table[ vto_freq ] := -40 +
         INTEGER ( (2.0@-5 * (2.0@7 + REAL( freq ))/
                 REAL( harmonic_table[sup_table[table_index]] )) +.5)
       ), delay_6mS    );

END compute_vto_and_pretune;

COMMENT
***************************************************************************
* if_count counts the i.f. and returns it with 10Khz resolution.
***************************************************************************
end of comment;
        INTEGER CONSTANT low_signal_level := 13,trigger_if_counter := 1,
                                     sig_lvl_OK_no_overflow := %3000;
INTEGER SUBROUTINE if_count;
BEGIN
   if_count := 0;
   IF NOT TBIT(rdif,low_signal_level)  THEN
      BEGIN
      ifcnt := trigger_if_counter;
      delay( delay_200uS);
      IF ( rdif AND sig_lvl_OK_no_overflow ) = 0  THEN
            if_count := rdif AND %FFF;
      END;
END if_count;
```

```
SBREAK.WORK.PD8510                THU, DEC 22, 1983, 10:25 AM      PAGE  11

#EJECT;
COMMENT
***************************************************************************
* verify_pretune checks if i.f. is present and on the right sideband,
*    if not it will move ( search) the vto till it is .
*    After a number of tries it will declare a "pretune failure".
*
* NOTE: The vto step sizes for checking, searching, etc and the accept-
*       able if freq windows need to checked -- deadlocks, gaps, ?????
***************************************************************************
end of comment;
BOOLEAN PROCEDURE verify_pretune;
BEGIN
BITFIELD search_sts: check_step_pos, if_found, wrong_side, drifting;
INTEGER freq, index,
        count, delay,
        vto_search, search_count,
   cnt, first_cnt, sec_cnt, delta;


  index := sup_table[ table_index ];
  freq  := sup_table[ vto_freq ];
  debug_data[3] := freq ;  &                                          debug&
 &debug_data[7] := 0;                                                 debug&
  sec_cnt := -1;              &shows if a sec_cnt was ever attempted debug&

  count        := 0;
  search_count:= 0;
  search_sts   := 0;     &clr check_step_pos,if_found,wrong_side,drifting&

 & prior to this point a pretune has been called to the sup_table freq
 with a delay of 6mSecs if there was no source delay(invalid sup_table)&

   DO
      BEGIN
      delay  := delay_3mS ;
      IF NOT drifting THEN
         IF wrong_side THEN
            BEGIN
            freq := freq + vto_sideband_shift[ index ] ;
            search_count := 0;
            delay   := delay_6mS ;
            END
          ELSE
           BEGIN  & normal search &
           vto_search := search_count ^
                         ( INTEGER(vto_search_step[index]) AND %OFF ) ;
           IF TBIT(search_count,0) &i.e. odd&
              THEN freq :=  freq + vto_search
            ELSE   freq :=  freq - vto_search    ;
           search_count := search_count + 1;
           END   normal search ;

      pretune_vto( freq , delay );
      search_sts := 0; &clr check_step_pos,if_found,wrong_side,drifting&
```

```
SBREAK.WORK.PD8510                THU, DEC 22, 1983, 10:25 AM      PAGE  12

      IF TBIT(bbstatus, pretune_unlock) THEN
         count := 99                              & terminate search &
       ELSE
         IF ABS( ( first_cnt := if_count) - 2000 ) < 1100 THEN
            BEGIN
            IF first_cnt < 2000 THEN check_step_pos := 1;
 cnt := if_count;                                              & debug&
           pretune_vto ( freq +
                       ( IF check_step_pos THEN vto_check_step[index]
                            ELSE -vto_check_step[index] ) ,
                     delay_3mS );            &!!!changed from 5 mS!&

           IF ( sec_cnt := if_count ) > 0 THEN
             BEGIN & signal present &
             delta :=  ABS( first_cnt - sec_cnt ) ;
             IF delta < 125 THEN
                drifting  := 1
              ELSE
             IF delta < 800 THEN
                BEGIN  & OK check step &
                IF  check_step_pos  XOR  ( first_cnt < sec_cnt ) THEN
                   wrong_side :=  1
                 ELSE
                   BEGIN & no sec_cnt problems &
                   if_found := 1;
                   sup_table[ vto_freq ] := freq;
                   END  ;
                END  OK check step ;
             END  sec_cnt signal present ;
        END check vto loop;

    &debug_data[7] := debug_data[7] OR search_sts;                   debug&
     count := count + 1 ;
     END search loop
   UNTIL if_found OR ( count > 25 ) ;

                debug_data[0] := first_cnt;                        &debug&
                debug_data[1] := sec_cnt;                          &debug&
                debug_data[2] := if_count;                         &debug&
                debug_data[4] := freq ;                            &debug&
                debug_data[5] := index;                            &debug&
                debug_data[6] := count;                            &debug&
   IF NOT if_found THEN
      BEGIN
        IF TBIT(bbstatus, pretune_unlock) THEN warn( no_pretune_lock )
         ELSE warn( pretune_fail );
      END;

   verify_pretune := if_found;

 END verify_pretune;
```

```
SBREAK.WORK.PD8510                THU, DEC 22, 1983, 10:25 AM      PAGE  13

#EJECT;
COMMENT
***************************************************************************
* lock_vto_at_pretune verifies the the pretune ( i.f. present and
*   correct sideband) and locks the main phase lock loop. It will delay
*   long enough for main loop to settle.
***************************************************************************
end of comment;
BOOLEAN PROCEDURE lock_vto_at_pretune;
BEGIN
INTEGER temp,ctn;
  lock_vto_at_pretune := FALSE;
  IF verify_pretune THEN
     BEGIN
     ptctl   := hold_pretune;
     mpl_flg   :=
     mplctl    := lock_main_loop  +  disable_lock_error
                           +  loopgain_table[ sup_table[table_index] ];

     delay( delay_2_0mS );
     IF ( ( (ctn:=if_count) + 4 ) AND %FFF8 ) # 2000 THEN
                              warn(phase_lock_fail)
      ELSE BEGIN
           mpl_flg  := RBIT( mpl_flg , mpl_srq_disable );
           mplctl   := mpl_flg ;
           lock_vto_at_pretune := TRUE;
           END;
     END;

    IF lock_debug THEN BEGIN                                        &debug&
                  FOR temp:=0 TO 6 DO WNUM(debug_data[temp]);       &debug&
               & WHEX(debug_data[7]);                                debug&
                  WNUM(ctn);                                        &debug&
                  CRLF;                                             &debug&
                  END;                                              &debug&
END lock_vto_at_pretune;
```

```
#EJECT;

ALPHA PROCEDURE retrace_type;
BEGIN
ALPHA sup_command;
   IF coupled_tables THEN
      sup_command := "RS"
   ELSE
      IF current_acquisition_ch = current_entry_ch THEN
         sup_command := "RS0"
      ELSE
         sup_command := "RS1";

   retrace_type := sup_command;

END retrace_type;
```

```
#EJECT;
COMMENT                                                      break_entry_control
*****************************************************************************
*                                                                           *
* EXTERNAL SPECIFICATION FOR break_entry_control                            *
*                                                                           *
* FUNCTION: Inform the sup_break routines of which channel is the           *
*           active entry channel. This is so that the                       *
*           new_sup_param_effective dirtys the correct sup table.
*                                                                           *
*           Called only if entry channel has change.
*
* DECLARATION INFORMATION:                                                  *
*                                                                           *
*   INPUT:   none
*                                                                           *
*   OUTPUT:  none                                                           *
*                                                                           *
* EXTERNAL EFFECTS:                                                         *
*                                                                           *
*****************************************************************************
*                                                                           *
* LOGIC INFORMATION FOR break_entry_control                                 *
*                                                                           *
* MODULES CALLED:                                                           *
*                                                                           *
* INITIAL REFINEMENT: If sup tables are not coupled THEN change             *
*       the entry pointer to point to the apporiate table.                  *
*                                                                           *
*****************************************************************************
end of comment;
PROCEDURE break_entry_control(ch); VALUE ch; INTEGER ch;          ENTRY;
BEGIN
ALPHA sup_command;

   IF NOT coupled_tables THEN
      BEGIN
         entry_table_base := table_base[ current_entry_ch ];

         IF ch = sw0_ch THEN
            wrt_priv_ib_source( sw0, "" )
         ELSE
            wrt_priv_ib_source( sw1, "" );
      END;

END break_entry_control;
```

```
#EJECT;
COMMENT                                                      break_acq_control
*****************************************************************************
*                                                                           *
* EXTERNAL SPECIFICATION FOR break_acq_control                              *
*                                                                           *
* FUNCTION: Informs the sup_break routines of the channel for which         *
*           data is being accquired, and therefore the sup_table            *
*           holds the x_adc and vto information.
*                                                                           *
* DECLARATION INFORMATION:                                                  *
*                                                                           *
*   INPUT:   none
*                                                                           *
*   OUTPUT:  none                                                           *
*                                                                           *
* EXTERNAL EFFECTS:                                                         *
*                                                                           *
*****************************************************************************
*                                                                           *
* LOGIC INFORMATION FOR break_acq_control                                   *
*                                                                           *
* MODULES CALLED:                                                           *
*                                                                           *
* INITIAL REFINEMENT: If sup tables are not coupled THEN change             *
*       the sweep pointer to point to the apporiate table.                  *
*                                                                           *
*****************************************************************************
end of comment;
SUBROUTINE break_acq_control;                                      ENTRY;
BEGIN

   IF NOT coupled_tables THEN
         sup_table_base := table_base[ current_acquisition_ch ];

END break_acq_control;
```

```
#EJECT;
COMMENT                                                      coupled_break
*****************************************************************************
*                                                                           *
* EXTERNAL SPECIFICATION FOR coupled_break                                  *
*                                                                           *
* FUNCTION: To set break into a two or one source state of operation        *
*                                                                           *
*                                                                           *
* DECLARATION INFORMATION:                                                  *
*                                                                           *
*   INPUT:   state    BOOLEAN  true = channels are coupled in source        *
*                                         operation                         *
*                              false= two seperate source states exist*
*                                                                           *
* EXTERNAL EFFECTS:                                                         *
*                When coupling is set FALSE, the sweep table                *
*           of the selected channel is copied into the other channels       *
*           sweep table. It is assumed that when coupling is set TRUE       *
*           that the sweep will be aborted.                                 *
*                                                                           *
* COMMENTS: The first call must be with coupled state TRUE and              *
*           someone else ( init_break ) must have initailized the           *
*           coupled table flag (FALSE).                                     *
*           Also only calls that change the coupled table flag will         *
*           have any effect.                                                *
*****************************************************************************
*                                                                           *
* LOGIC INFORMATION FOR coupled_break                                       *
*                                                                           *
* MODULES CALLED:                                                           *
*                                                                           *
* INITIAL REFINEMENT:                                                       *
*                                                                           *
*                                                                           *
*****************************************************************************
end of comment;
```

```
#EJECT;
PROCEDURE coupled_break(state);                     VALUE state;
                                                    BOOLEAN state;    ENTRY;

BEGIN
INTEGER POINTER other_table;
ALPHA swp_command;

IF coupled_tables # state THEN
   BEGIN
   coupled_tables := state;

   IF coupled_tables THEN
      BEGIN
      swp_command :="ALO";
      END
    ELSE
      BEGIN & uncoupled &
      IF current_entry_ch = 1 THEN
         BEGIN
            STPNTR( other_table, table_base[ 2 ] );
            swp_command := "SV2RL12";
            sw0_ch := 1;                            & current_entry_ch &
         END
       ELSE
         BEGIN
            STPNTR( other_table, table_base[ 1 ] );
            swp_command := "SV1RL11";
            sw0_ch := 2;                            & current_entry_ch &
         END;

      MOVE other_table := swp_table_ptr,+( array_length );
      END;

   wrt_priv_ib_source( clr_fun, swp_command );
   entry_table_base := table_base[ current_entry_ch ];
   swp_table_base := entry_table_base;
   END coupled state changed ;
  &ELSE do nothing&

END coupled_break;
```

```
SUBROUTINE reset_swp_table;
BEGIN
      swp_table_ptr[ swp_table_condition] := invalid;
      reset_bandnum;
END reset_swp_table;
```

```
#EJECT;
COMMENT                                                              init_break
*************************************************************************
*
* EXTERNAL SPECIFICATION FOR init_break
*
* FUNCTION: Initializes the sweep tables and set the couple flag TRUE.
*
*
* DECLARATION INFORMATION:
*
*    INPUT:   none
*
*    OUTPUT:  none
*
* EXTERNAL EFFECTS:
*
*************************************************************************
*
* LOGIC INFORMATION FOR init_break
*
* MODULES CALLED:
*
* INITIAL REFINEMENT:  Initialize channel 1 and 2 sweep tables, and
*       set the coupling true ( with channel 1 as the master ).
*
*************************************************************************
end of comment;
        PROCEDURE init_break_sub(base);    VALUE base;  DOUBLE base;
        BEGIN
        INTEGER POINTER ptr = base;
        INTEGER POINTER ptr_band;
        INTEGER index;

        ptr[ swp_table_condition ] := invalid;
        FOR index := 0 TO max_bands DO
          BEGIN
          STPNTR( ptr_band , ADRS( ptr[ index * band_size ] ) );
          ptr_band[ next_x_stp   ] := 0;
          ptr_band[ table_index  ] := 0;
          ptr_band[ vto_freq     ] := vto_100Mhz;
          ptr_band[ next_flag    ] := 0;
          END;
        END init_break_sub;

SUBROUTINE init_break;                                            ENTRY;
BEGIN
  init_break_sub( table_base[ 2 ] );
  init_break_sub( table_base[ 1 ] );
  coupled_tables   := TRUE ;
  entry_table_base := table_base[ 1 ];
  swp_table_base   := entry_table_base;
  abort_flg :=   0;
  mpl_flg   := XFO;
  disable_phase_lock_lost;
END init_break;
```

```
#EJECT;
COMMENT                                                          maintain_sweep
*************************************************************************
*
* EXTERNAL SPECIFICATION FOR maintain_sweep
*
* FUNCTION: initiate a sweep and handle everything necessary to carry
*           the sweep to completion (e.g. reset sweep,,phase-lock,
*           source and VTO bandcrossings, stop-sweep LSRQ, and
*           mid-sweep frequency updates of the source).  Returns
*           to the calling routine when the sweep is complete -- last
*           YADC trigger at the last frequency point -- or when an
*           error condition results in an abnormal termination or
*           irrecoverable situation.  Will attempt to recover from any
*           situation that does not affect the rest of the measurement
*           and control sections.  For example, it may retry VTO pretune
*           and phase-lock, but should not reset a sweep.
*
* PARAMETER DESCRIPTION:
*
*    INPUT:  none
*
*    OUTPUT: maintain_sweep    true  = successful sweep completion.
*                              false = aborted sweep or irrecoverable
*                                         situation.
*
* USAGE:
*    DO
*       set up for another sweep
*    UNTIL maintain_sweep = false.
*    recover_gracefully.
*
* EXTERNAL EFFECTS:
*    Mid-sweep updates of source functions will result in a call to the
* appropriate value updating procedure(s), passing an ALPHA string.
* For mid-sweep updates and normal bandcrossings, the frequency values
* can be obtained in QUAD format by a call to the appropriate
* procedures, passing the current point number (from the XADC).
*
* COMMENTS:
*    The calling process may be suspended awaiting bandcrossings and/or
* the end of the sweep.
*
*************************************************************************
*
* LOGIC INFORMATION FOR maintain_sweep
*
* INTIAL REFINEMENT: At the start of a sweep the vto is pretuned accord-
*          ing to the sweep tables,and the source retraced ( in alternate
*          sweep use AS else RS ).
*          Normally the loop will wait for a source settled from the
*          source, set a xadc stop point, phase lock, and wait till the
*          swp/xadc reaches the proper point. From the sweep table it is
*          determined if this is an end of sweep , and the routine exits,
*          or if a bandcross of the source or 8510 vto, and if so do what
*          is needed and restart the loop.
```

```
SBREAK.WORK.PD8510              THU, DEC 22, 1983, 10:25 AM    PAGE  22

*       The sweep is always stop till it is determined that everything
*       is ready -- phase lock, no source changes have occured, and
*       nothing is pending in the fifo_swp_brk.
*
*       If a source change has occur it will be read and the sweep
*       tables dirtied. A learning process will then begin with the
*       8510 building a sweep tables of bandcross points ( source/8510)
*       and their xadc and vto settings till a complete sweep of no
*       changes has occur. During this "dirty / slow " sweep the 8510
*       will have to compute where it is , and where it is going.
*       It will check to see if a source bandcross occurs first via
*       the "OB" request or if a 8510 vto bandcross occurs first (from
*       8510 bandcross tables) or end of sweep.
*
*       Certain error conditions will be checked for
*         1) A sweep abort passed to mantain sweep from the Control
*              process.
*         2) A Source , 8510 sweep sycn error -- the Source has reached
*              end of sweep and beyond before the 8510.
*         3) A phase lock of the vto to Source failed.
*         4) Commands or data in fifo_swp_brk invalid.
*
***********************************************************************
;
BOOLEAN PROCEDURE maintain_sweep;                            ENTRY;
  BEGIN & maintain_sweep &

  INTEGER CONSTANT normal_swp := %16,stop_swp := %10,clr_stop_swp := 6,
                   stop_swp_reset_xadc := %11,end_xadc_auto_zero :=%16;
  INTEGER CONSTANT start_freq_point := 0;
  BYTE CONSTANT retrace_pending := 0,end_of_swp_pending := 1,
                source_bc_pending := 2,vto_bx_pending := 3;

  INTEGER string_index;
  INTEGER swp_flags,next_stp;
  INTEGER present_pos,present_index,next_index;
  QUAD present_freq,next_stop_freq;
  LABEL maintain_loop,maintain_exit_true,maintain_exit_false;
  INTEGER BITFIELD flg: trigger_source;
  BOOLEAN bool_temp;


      SUBROUTINE print_debug_data;                           &debug&
      BEGIN WHEX(bandnum); WHEX(swp_status);                 &debug&
            WNUM(present_pos); WNUM(next_stp);               &debug&
            WHEX(swp_flags);                                 &debug&
            WQUAD(present_freq); WQUAD(next_stop_freq);      &debug&
            CRLF;                                            &debug&
      END print_debug_data;                                  &debug&
```

```
SBREAK.WORK.PD8510              THU, DEC 22, 1983, 10:25 AM    PAGE  23

#EJECT;
    & clear out FIFO ??? check for abort_sweep???&
    reset_bandnum;
    ref_overload :=
    tst_overload := 0;&-2-(number_of_points / if_overload_threshold)&
    pretune_vto( swp_table[ vto_freq ], min_delay );
    xcmd1 := stop_swp_reset_xadc;
    reset_xadc;

    wrt_priv_ib_source( no_fun, retrace_type );
    swp_flags := retrace_pending;


  maintain_loop:
            swp_status := read_fifo(fifo_swp_brk);
                          &do not check source status til later &


    disable_phase_lock_lost;

    IF (swp_status = abort_swp) OR abort_flg  THEN
       BEGIN
       abort_flg := 1;
       xcmd1 := stop_swp;
       delay( delay_1mS );    & allow stop sweep to take effect &
       GO TO maintain_exit_false;
       END;

    IF swp_status = xadc_brk THEN      & end, BC, or vto_bx decision &
       BEGIN
       IF swp_flags = end_of_swp_pending THEN
          BEGIN
          IF swp_table_ptr[ swp_table_condition] = nearly_valid
           THEN swp_table_ptr[ swp_table_condition] := valid ;
          GO TO maintain_exit_true;
          END;
       set_bandnum ( bandnum + 1 );
       pretune_vto( swp_table[ vto_freq ], min_delay );
       IF swp_flags = source_bc_pending AND empty_fifo(fifo_swp_brk)
          THEN
          BEGIN
          wrt_priv_ib_source(no_fun,"BC");
          GO TO maintain_loop;
          END;
       &ELSE must be swp_flag=vto_bx_pending BUT not retrace_pending&
       END
     ELSE IF lock_problem THEN
       BEGIN
       warn_lock_problem;
       xcmd1 := stop_swp;
       reset_swp_table;
       END lost_lock
     ELSE IF  NOT source_settled  THEN    &fifo_swp_brk invalid code&
                                          GO TO maintain_exit_false;
```

```
SBREAK.WORK.PD8510              THU, DEC 22, 1983, 10:25 AM    PAGE  24

#EJECT;         &Must be Source settled or 8510 BX &

      present_pos  := next_stp ;
      present_freq := next_stop_freq;


      trigger_source := 0;
      IF new_swp_params_effective THEN
        BEGIN
          update_frequency_data;
          trigger_source := 1;
        END
       ELSE IF mid_swp_update THEN
        BEGIN
          reset_swp_table;
          warn(swp_sync_err);
          GO TO maintain_exit_false;
        END lost of swp sync;


      IF swp_flags = retrace_pending AND NOT mid_swp_update THEN
                        &need to verify this is a source_settled?&
        BEGIN
        swp_flags := end_of_swp_pending;
        reset_bandnum;    &probably not needed ??&
        present_pos := -1;
        present_freq := frequency_at_point( start_freq_point );
        IF swp_table_ptr[ swp_table_condition] = invalid
          THEN swp_table_ptr[ swp_table_condition] := nearly_valid ;
        xcmd1 := end_xadc_auto_zero;
        END auto zero xadc;
```

```
SBREAK.WORK.PD8510              THU, DEC 22, 1983, 10:25 AM    PAGE  25

#EJECT;
   IF swp_flags # retrace_pending AND empty_fifo( fifo_swp_brk ) THEN
      BEGIN

        IF swp_table_ptr[ swp_table_condition] # valid THEN
          BEGIN
          IF  mid_swp_update OR lock_problem THEN
            BEGIN
            present_pos := present_pos - 1 -
                     (IF xposctr=-1 THEN -1 ELSE xposctr AND %FFF);
                                   &will clear xadc irq if pending??&
           present_freq := frequency_at_point(present_pos);&use OK?&
            END;

          source_data[-1] := max_source_data;
          string_index := 1;
          next_stop_freq := CNV9R(read_priv_ib
                     (source,no_fun,"OB",ADRS(source_data)),
                          string_index
                        );
      &**&IF next_stop_freq < present_freq THEN
            BEGIN warn(bad_bc_value);                         &debug&
            WSTR("*bad bc* ");                                &debug&
            print_debug_data;                                 &debug&
            GO TO maintain_exit_false;END;                    &debug&


          present_index := find_index( present_freq + 1 );
          next_index    := find_index( next_stop_freq );
          IF   ( present_index < next_index ) &a vto_bx in between?&
           OR ( present_freq  = next_stop_freq ) THEN
            BEGIN
            swp_flags := vto_bx_pending;
            next_stop_freq := bandcross_table[ present_index ];
            swp_table[table_index] := present_index;
            END
           ELSE
            BEGIN
            swp_flags := source_bc_pending;
            swp_table[table_index] := next_index;
            END;


          next_stp := point_at_frequency(next_stop_freq);
          IF next_stp <= present_pos THEN next_stp := present_pos+1;
          IF next_stp >= 800 THEN swp_flags := end_of_swp_pending;

          swp_table[ next_x_stp ] := next_stp;
          swp_table[ next_flag ]   := swp_flags;

          compute_vto_and_pretune( present_freq );

          IF position_debug THEN  print_debug_data;          &debug&

          END invalid_swp_table;
```

SBREAK.WORK.PD8510 THU, DEC 22, 1983, 10:25 AM PAGE 26

```
#EJECT;
        next_stp := swp_table[ next_x_stp ];
        swp_flags  := swp_table[ next_flag ];
        xstp     := next_stp - present_pos - 1;

        lock_vto_at_pretune;
        set_if_gain;
        check_overload;

        xcmd1 := clr_stop_swp;
        xcmd1 := normal_swp;

        END emptyfifo and no retrace pending
      ELSE
        BEGIN
        next_stp := present_pos ;
        next_stop_freq := present_freq ;
        END else;

    IF trigger_source THEN
      trig_priv_ib(source);

  GO TO maintain_loop;

  maintain_exit_false: bool_temp     :=FALSE;
        GO TO maintain_sweep_exit;
  maintain_exit_true:  bool_temp     :=TRUE;

  maintain_sweep_exit:
      xcmd1 := stop_swp;
      IF (tst_overload>0) OR (ref_overload>0) THEN warn(if_overload);
      IF NOT TBIT(bbstatus,conversion_miss) THEN warn( swp_too_fast );
      maintain_sweep := bool_temp;

  END;  & maintain_sweep &
```

SBREAK.WORK.PD8510 THU, DEC 22, 1983, 10:25 AM PAGE 27

```
#EJECT;
COMMENT                                                        step_source
******************************************************************************
******************************************************************************
end of comment;
BOOLEAN PROCEDURE step_source( frequency_value );
   VALUE   frequency_value;
   INTEGER frequency_value;                                          ENTRY;
BEGIN
BOOLEAN rtr_flg;
ALPHA swp_command;
QUAD present_freq;

   sync_flg := 0;        & used by check_swp_brk_fifo &

   WHILE NOT empty_fifo( fifo_swp_brk )
      DO check_fifo_swp_brk;
      & clear out any pending fifo items &

   IF frequency_value <= 0 THEN
      BEGIN
      reset_swp_table;
      swp_command := retrace_type ;
      END
    ELSE      swp_command := "IF";


   IF NOT forced_step THEN
      BEGIN

      present_freq := frequency_at_point( frequency_value );
      swp_table[table_index] := find_index( present_freq );
      compute_vto_and_pretune( present_freq );

      IF frequency_value >= 0 THEN
         BEGIN
         wrt_priv_ib_source( no_fun, swp_command );
         DO
            check_fifo_swp_brk
          UNTIL  source_settled  OR abort_flg   ;
         END;
       & ELSE was a true CW request in non-alternate sweep &
      END normal step;

   IF  ( sync_flg OR abort_flg ) THEN
      BEGIN
      rtr_flg := FALSE;
      delay(delay_50mS);
      END
    ELSE rtr_flg := TRUE;

   step_source := rtr_flg;

END step_source;
```

SBREAK.WORK.PD8510 THU, DEC 22, 1983, 10:25 AM PAGE 28

```
#EJECT;
COMMENT                                                           phase_lock
******************************************************************************
*
* EXTERNAL SPECIFICATION FOR phase_lock
*
* FUNCTION: Pretunes the VTO to the specified frequency value,
*           phase-locks the VTO to the already selected phase-lock
*           signal, and returns to the calling procedure when the
*           phase-locking is complete, including any required settling,
*           or when an error condition results in an irrecoverable
*           situation.  Will attempt to recover from any situation
*           that does not affect the rest of the measurement
*           and control sections.  For example, it may retry VTO pretune
*           and phase-lock, but should not reset the source or phase-
*           lock channel multiplexer.
*
* PARAMETER DESCRIPTION:
*
*    INPUT:   none
*
*    OUTPUT: phase_lock         true  = successful completion.
*                               false = aborted phase_lock or
*                                       irrecoverable situation.
*
* COMMENTS:
*    The calling process may be suspended awaiting settling times.
* Should there be provision for this routine to return more information
* about the reason for an abnormal termination, or is a simple boolean
* sufficient?
*
******************************************************************************
*
* LOGIC INFORMATION FOR phase_lock
*
* INITIAL REFINEMENT:
*
*
*
******************************************************************************
;
BOOLEAN PROCEDURE  phase_lock;                                       ENTRY;
   BEGIN & phase_lock &

      phase_lock := lock_vto_at_pretune;

   END;  & phase_lock &
```

SBREAK.WORK.PD8510 THU, DEC 22, 1983, 10:25 AM PAGE 29

```
#EJECT;
COMMENT                                                        trigger_yadc
******************************************************************************
*
* EXTERNAL SPECIFICATION FOR trigger_yadc
*
* FUNCTION: Triggers the YADC, and returns to the calling procedure
*           when the YADC conversion is complete (including multiple
*           conversions in the case of point-to-point averaging) or
*           when an irrecoverable situation is detected.
*
* PARAMETER DESCRIPTION:
*
*    INPUT:  none
*
*    OUTPUT: none
*
* USAGE:
*    INTEGER CONSTANT start := 0,
*                     stop  := 800.
*    step_size := 4.
*    FOR frequency_value := start UNTIL stop BY step_size DO
*       IF phase_lock(frequency_value) = true THEN
*          trigger_yadc
*       ELSE
*          figure out how to recover gracefully.
*
* COMMENTS:
*    The calling process may be suspended awaiting completion.
* The YADC is assumed to already be in the trigger mode.  There is no
* provision for abnormal abort since such a condition will not be
* detectable at this level.
*
******************************************************************************
*
* LOGIC INFORMATION FOR trigger_yadc
*
* INITIAL REFINEMENT:
*
*
******************************************************************************
;
```

```
SBREAK.WORK.PD8510              THU, DEC 22, 1983, 10:25 AM     PAGE  30

#EJECT;
SUBROUTINE trigger_yadc;                                         ENTRY;
   BEGIN & trigger_yadc &

   xctrl        := xctrl_save;

   force_trig_yadc;

   DO
      check_fifo_swp_brk
   UNTIL swp_status = xadc_brk;

   disable_phase_lock_lost;
   trigger_mode := 0;
   xctrl        := zero;     & fear sweep mode starting with non-zero&

   END;  & trigger_yadc &
```

```
SBREAK.WORK.PD8510              THU, DEC 22, 1983, 10:25 AM     PAGE  31

#EJECT;
COMMENT                                                        break_idle
***********************************************************************
*
* EXTERNAL SPECIFICATION FOR break_idle
*
* FUNCTION: Service all legal inputs from the sweep-break fifo and
*           report all illegal inputs as errors.  Return when the input
*           is a exit_break_idle.
*
* PARAMETER DESCRIPTION:
*
*    INPUT:  none
*
*    OUTPUT: none
*
* USAGE:
*    break_idle.
*
* COMMENTS: The purpose of this routine is to assure that there is
*           never an extended period when there is not some routine
*           running to check the sweep_break_fifo in order to provide
*           reasonable response time to the user for such items as
*           start frequency entries.  Such entries would otherwise have
*           to wait until the next sweep, which could be indefinite in
*           the case of a "held" sweep.  This routine provides service
*           for those interrupts that occur when the
*           control routine is not expecting sweep-breaks as a
*           direct result of an active sweep.  The control routine
*           causes this routine to terminate by sending it a
*           exit_break_idle via the sweep-break-fifo prior to beginning
*           any sweep operations.  This routine is called when there
*           will be a lull in such operations, so that interrupts will
*           still be serviced in reasonable time, specifically feedback
*           from the source for user inputs such as start frequency.
*
***********************************************************************
*
* LOGIC INFORMATION FOR break_idle
*
* INITIAL REFINEMENT:
*
*
*
***********************************************************************
;
SUBROUTINE break_idle;                                           ENTRY;
   BEGIN & break_idle &
   DO
      BEGIN
      check_abort;
      check_fifo_swp_brk;
      END
   UNTIL swp_status = exit_break_idle;
   END;  & break_idle &
```

```
SBREAK.WORK.PD8510              THU, DEC 22, 1983, 10:25 AM     PAGE  32

BOOLEAN SUBROUTINE break_paused;                                 ENTRY;
   BEGIN & break_paused &

   DO check_fifo_swp_brk
    UNTIL (swp_status = exit_break_idle ) OR ( swp_status = abort_swp);

   break_paused := NOT( swp_status = abort_swp );
   END;  & break_paused &

END$

      SUBROUTINE print_debug_data;                               &debug&
      BEGIN WHex(bandnum,1); WHex(swp_status,3);                 &debug&
            WNUM(present_pos); WNUM(next_stp);                   &debug&
            WHex(swp_flags,2);                                   &debug&
            WQUAD(present_freq); WQUAD(next_stop_freq);          &debug&
            CRLF;                                                &debug&
      END print_debug_data;                                      &debug&


PROCEDURE alt_debug_sub(str); VALUE str; ALPHA str;              &debug&
BEGIN                                                            &debug&
   IF alt_debug THEN                                             &debug&
      BEGIN WSTR(str);           WNUM(coupled_tables);           &debug&
      WNUM(current_entry_ch); WNUM(current_acquisition_ch);      &debug&
      CRLF; END;                                                 &debug&
END alt_debug_sub;                                               &debug&
```

```
CCAL.WORK.PD8510                THU, DEC 22, 1983, 10:26 AM     PAGE   1

INTEGER CONSTANT
   correct_off       := 0,         & fixed by datap &  & cal_mode &
   correct_on        := 1,

   response          := 1,         & fixed by datap &  & cal_type &
   one_port_on_1     := 2,
   one_port_on_2     := 3,
   two_port          := 4,
   simple_two_port   := 5,
   undefined_cal     := -1,

   std_open          := 0,                          & cal_std_type &
   std_short         := 1,     & also used by arrays in sstds.work &
   std_load          := 2,
   std_thru          := 3,
   std_z             := 4,     & arbitrary z &
   std_undefined     := -1,

   done_1_port_on_1     := 0,                       & cal_done_type &
   done_1_port_on_2     := 1,
   done_reflection      := 2,
   done_trans           := 3,
   done_isol            := 4,
   done_2_port          := 5,
   done_class           := 6;
```

```
FCAL.WORK.PD8510               THU, DEC 22, 1983, 10:26 AM     PAGE   1

EXTERNAL INTEGER cal_type;
EXTERNAL BOOLEAN cal_in_progress,
                 cal_coeffs_allocated,
                 measuring_std_data;

DOUBLE PROCEDURE  cal_array_addr( array_number );
   VALUE   array_number;
   INTEGER array_number;                                      EXTERNAL.L;
INTEGER PROCEDURE cal_size;                                   EXTERNAL.L;
SUBROUTINE restore_param;                                     EXTERNAL.L;
SUBROUTINE deallocate_cal_array;                              EXTERNAL.L;
BOOLEAN PROCEDURE  partial_allocate_cal( type );
   VALUE   type;
   INTEGER type;                                              EXTERNAL.L;
SUBROUTINE cal_acquisition_done;                              EXTERNAL.L;
SUBROUTINE acquire_data;                                      EXTERNAL.L;
```

```
SCAL.WORK.PD8510               THU, DEC 22, 1983, 10:26 AM     PAGE   1

M68KL,P,"cal"
BEGIN

@FILE cdebugc2.work;                                          & DEBUG &
@FILE fterm.work;                                             & DEBUG &
@FILE fterm3.work;                                            & DEBUG &
@FILE factive.work;                        & for select_active_fcn &
@FILE ftime.work;                                & for tdr_check    &
@FILE ftime2.work;                               & user3_zero       &
@FILE ftopmisc.work;                       & for beep and done_tone &
@FILE futil.work;                               & for tell and warn &
@FILE futil2.work;                             & for clear_message &
@FILE fcal0.work;                    & correction_off and recall_cal &
@FILE ccal.work;
@FILE fcommand.work;                          & for command_token &
@FILE fcontrol.work;                 & for single_sweep and n_sweep &
@FILE cmenu.work;
@FILE fmenu.work;
@FILE fstimuli.work; & enter_frequency_at point and point_at_frequency &
@FILE fchdata.work;
@FILE cchtable.work;
@FILE fchtable.work;
@FILE fcontvar.work;                                 & for dp_raw_base &
@FILE fsize.work;
@FILE fmemmgr.work;            & for request_ and release_array &
@FILE cmbmgr.work;                                    & for save_op &
@FILE fdatamgr.work;                             & for gen_cal_info &
@FILE fmbmcal.work;
@FILE ccalmenu.work;                      & for cmd_... for hilights &
@FILE fstds.work;                 & for annotate_std_classes, etc. &
@FILE caverage.work;                                   & for avg_on &
@FILE fparam.work;                              & for new_parameter &

PROCEDURE copy_user3( from_addr, to_addr, size );
   VALUE from_addr, to_addr, size;
   DOUBLE from_addr, to_addr;
   INTEGER size;                                            EXTERNAL;
SUBROUTINE CMV1E_save;                                      EXTERNAL;
SUBROUTINE fetch_CMVE1;                                     EXTERNAL;
COMPLEX PROCEDURE exp_cmplx(val); VALUE val; COMPLEX val;   EXTERNAL;

EXTERNAL REAL  TwoPi, system_z0;
```

```
SCAL.WORK.PD8510               THU, DEC 22, 1983, 10:26 AM     PAGE   2

#EJECT;
INTEGER CONSTANT user3_length      := 6,
                 min_num_of_slides := 4,
                 real_size         := 4,
                 slide_data_blk    := 7 * real_size;

REAL    CONSTANT unscale_c0 := 1.0@-15,
                 unscale_c1 := 1.0@-27,
                 unscale_c2 := 1.0@-36;

COMPLEX CONSTANT complex_1  := (1.0,0.0);


GLOBAL INTEGER cal_type;
GLOBAL BOOLEAN cal_in_progress,
               cal_coeffs_allocated,
               measuring_std_data;

INTEGER cal_stds_remaining,
        num_slides,
        old_param,
        temp_number_of_groups,
        pt_count,
        last_class;
BOOLEAN refl_computed;
DOUBLE  cal_coeff_addr,
        slide_data_ptr,
        data_source,
        data_destination;

BYTE    TABLE       check_done  :=
                    done_reflection, done_reflection, done_reflection,
                    done_isol,
                    done_trans,  done_trans,
                    done_reflection, done_reflection, done_reflection,
                    done_isol,
                    done_trans,  done_trans;
INTEGER TABLE       needed_mask  :=           & indexed by cal_done type &
          %7,       &done_1_port_on_1        &              & bit patterns &
          %7,       &done_1_port_on_2        &
        %1C7,       &done_reflection         &
         %C30,      &done_trans              &
        %208,       &done_isol               &
        %FFF,       &done_2_port             &
          %1;       &done_response           &
INTEGER TABLE  cal_stds_needed :=                & indexed by cal_type &
         0,     & place holder   &                          & bit patterns &
         1,     & response       &
        %7,     & one-port port 1 &
        %7,     & one-port port 2 &
      %FFF,     & two-port        &
       %03F;    & simple_two_port &
BYTE TABLE cal_arrays :=                         & indexed by cal_type &
         0,     & place holder   &                     & number of arrays &
         1,     & response       &
         3,     & one-port port 1 &
```

```
SCAL.WORK.PD8510               THU, DEC 22, 1983, 10:26 AM     PAGE   3

         3,     & one-port port 2 &
        12,     & two-port        &
        12;     & simple_two_port &

INTEGER TABLE  cal_menus :=                      & indexed by cal_type &
        0,               & place holder    &
        STD_CLASS_MENU,  & response        &
        PORT_ONE_REFL,   & one-port port   &
        PORT_TWO_REFL,   & one-port port   &
        CAL_MENU2,       & two-port        &
        CAL_MENU3;       & simple_two_port &
```

```
#EJECT; COMMENT                                                    cal_size
*************************************************************************
*
*   array size required for error coefficient arrays and array header
*   for current cal_type.
*
*************************************************************************
;
INTEGER PROCEDURE cal_size;                                        ENTRY;
   BEGIN & cal_size &
   cal_size := ( ( INTEGER(cal_arrays[cal_type]) * array_size +
                   header_size
                 ) OR %003F
               ) + 1;              & bump up to even 64-byte boundary &
   END;  & cal_size &
```

```
#EJECT;
COMMENT                                                      cal_array_addr
*************************************************************************
*
*************************************************************************
;
DOUBLE PROCEDURE  cal_array_addr( array_number );
   VALUE   array_number;
   INTEGER array_number;                                           ENTRY;
   BEGIN & cal_array_addr  &

   IF ( (cal_coeffs_allocated )           AND
        (array_number <= cal_arrays[cal_type])
      ) THEN
      cal_array_addr := cal_coeff_addr + DOUBLE(array_number*array_size)
   ELSE
      cal_array_addr := 0;

   END;  & cal_array_addr  &
```

```
#EJECT; COMMENT
*************************************************************************
*************************************************************************;
SUBROUTINE tell_comp_cal_coeff;    tell( comp_cal_coeff );

SUBROUTINE tell_connect_std;       tell( connect_std );

SUBROUTINE tell_press_done;        tell( press_done  );
```

```
#EJECT; COMMENT                                               restore_param
*************************************************************************
*
*************************************************************************
;
SUBROUTINE restore_param;                                          ENTRY;
   BEGIN & restore_param &
      new_parameter( old_param );
   END;  & restore_param &
```

```
#EJECT; COMMENT                                          deallocate_cal_array
*******************************************************************************
*
*******************************************************************************
;
SUBROUTINE deallocate_cal_array;                                    ENTRY;
  BEGIN & deallocate_cal_array &
    IF cal_coeffs_allocated THEN
      release_array( cal_coeff_addr );
    cal_coeffs_allocated := FALSE;
  END;  & deallocate_cal_array &


COMMENT                                                        abort_cal
*******************************************************************************
*
*******************************************************************************
;
SUBROUTINE abort_cal;
  BEGIN & abort_cal &
    restore_param;
    deallocate_cal_array;
    cal_type := undefined_cal;
    cal_in_progress := FALSE;
    pop_menu( CAL_MENU );
  END;  & abort_cal &
```

```
#EJECT; COMMENT                                          allocate_cal_array
*******************************************************************************
*
*******************************************************************************
;
BOOLEAN PROCEDURE allocate_cal_array;
  BEGIN & allocate_cal_array &
    BOOLEAN result;

    IF cal_coeffs_allocated THEN
      release_array(cal_coeff_addr );
    cal_coeffs_allocated := TRUE;
    cal_in_progress := TRUE;
    cal_coeff_addr := request_array( cal_size );
    IF cal_coeff_addr <> 0 THEN
      BEGIN
        set_entry_ch_double(cal_coeff_addr, ch_e_coeff_base);
        hilight_off( cnd_response_type, cnd_class_done );
        result := TRUE;
      END
    ELSE & allocation error &
      BEGIN
        warn( exceeded_available_memory );
        abort_cal;
        result := FALSE;
      END;

    allocate_cal_array := result;

  END;  & allocate_cal_array &
```

```
#EJECT; COMMENT                                        partial_allocate_cal
*******************************************************************************
*
*******************************************************************************
;
BOOLEAN PROCEDURE  partial_allocate_cal( type );
  VALUE   type;
  INTEGER type;                                                     ENTRY;
  BEGIN & partial_allocate_cal &
    BOOLEAN result;

    cal_type := type;
    cal_in_progress := FALSE;
    result := allocate_cal_array;
    set_entry_ch_integer( cal_type, ch_correction_type );

    partial_allocate_cal := result;
  END;  & partial_allocate_cal &
```

```
#EJECT; COMMENT                                               allocate_cal
*******************************************************************************
*
*******************************************************************************
;
BOOLEAN PROCEDURE allocate_cal( type );
  VALUE   type;
  INTEGER type;
  BEGIN & allocate_cal &
    BOOLEAN  result;
    INTEGER  required,
             avail;

    cal_type := type;
    cal_in_progress := FALSE;

    required := cal_seg_size( cal_size );      & bubble blocks req'd &
    avail := cal_seg_avail;

    IF avail >= required THEN    & there will be enough ram space.   &
      BEGIN & if &
        num_slides := 0;
        refl_computed := FALSE;
        result := allocate_cal_array;
        set_entry_ch_integer( cal_type, ch_correction_type );
      END  & if &
    ELSE                         & there will not be enough space in &
      BEGIN & else &             & bubble to store the completed cal &
        warn( select_delete_cal_set );
        abort_cal;                   & performs a pop_menu(CAL_MENU) &
        result := FALSE
      END;  & else &

    allocate_cal := result;

  END;  & allocate_cal &
```

SCAL.WORK.PD8510 THU, DEC 22, 1983, 10:26 AM PAGE 12

```
#EJECT; COMMENT                                                  init_correction
*************************************************************************
*
*************************************************************************
;
SUBROUTINE init_correction;                                            ENTRY;
   BEGIN & init_correction &
      measuring_std_data := FALSE;
      cal_coeffs_allocated := FALSE;
      cal_type := undefined_cal;
      cal_in_progress := FALSE;
      init_cal0;
   END;  & init_correction &
```

SCAL.WORK.PD8510 THU, DEC 22, 1983, 10:26 AM PAGE 13

```
#EJECT; COMMENT                                                     set_cal_type
*************************************************************************
*
*************************************************************************
;
PROCEDURE  set_cal_type( type );
   VALUE   type;
   INTEGER type;
   BEGIN & set_cal_type &

      IF allocate_cal( type ) THEN
         BEGIN & if &
            old_param := entry_ch_integer( ch_param );
            cal_stds_remaining   := cal_stds_needed[ type ];

            IF ( (cal_type <> two_port) AND
                 (cal_type <> simple_two_port)
               ) THEN
               tell_connect_std ;

            IF cal_type = response THEN
               set_std_class( freq_resp_std )        & before gen_menu &
            ELSE
               BEGIN & else &
                  annotate_std_classes;
                  gen_menu( cal_menus[type], 1 );    & after annot ... &
               END;  & else &
         END;  & if &

   END;  & set_cal_type &
```

SCAL.WORK.PD8510 THU, DEC 22, 1983, 10:26 AM PAGE 14

```
#EJECT; COMMENT                                                       resume_cal
*************************************************************************
*
*************************************************************************
;
SUBROUTINE resume_cal;
   BEGIN & resume_cal &
      IF cal_in_progress THEN
         gen_menu( cal_menus[cal_type], 1 )
      ELSE
         warn( no_cal_in_progress );
   END;  & resume_cal &


SUBROUTINE clear_message_and_in_progress;
   BEGIN
   clear_message( comp_cal_coeff );
   cal_in_progress := FALSE;      & needs to be false after a "compute" &
   END;
```

SCAL.WORK.PD8510 THU, DEC 22, 1983, 10:26 AM PAGE 15

```
#EJECT; COMMENT                                                  move_slide_val
*************************************************************************
* move_slide_val is used to move data to/from local stack to more
*   long term memory
* IT IS VERY DEPENDENTED ON THE ALLOCATION ORDER OF THE LOCAL STACK
*************************************************************************
;
PROCEDURE move_slide_val( from_adr, to_adr );  VALUE from_adr, to_adr;
                                               DOUBLE from_adr, to_adr;
   BEGIN
      INTEGER POINTER from = from_adr,
                      to   = to_adr;

      MOVE to := from,+(slide_data_blk/2);

   END move_slide_val;
```

```
SCAL.WORK.PD8510                THU, DEC 22, 1983, 10:26 AM    PAGE 16

#EJECT; COMMENT                                              load_slided
************************************************************************
*
************************************************************************
;
PROCEDURE load_slided;
BEGIN
REAL ARRAY    values[ 0 : ( slide_data_blk / real_size )  - 1 ];
REAL           x,  y,  x2,  y2,  x2_y2,
              sx = values[ 0 ]      ,sy = values[ 1 ],
              sx2= values[ 2 ]      ,sy2= values[ 3 ], sxy = values[ 4 ],
              sx3_y2x = values[ 5 ],sy3_x2y = values[ 6 ];
DOUBLE add_src, add_dst;

add_src := data_source;
IF memory_stolen( slide_data_ptr, slide_load_arrays_id,
                                 slide_data_blk * pt_count )
    THEN num_slides := 0 ;

IF slide_data_ptr # 0 THEN
   BEGIN
   add_dst := slide_data_ptr ;

   REPEAT pt_count DO
      BEGIN
      IF  num_slides = 0 THEN
           sx := sy := sx2 := sy2 := sxy := sx3_y2x := sy3_x2y := 0.0
       ELSE  move_slide_val( add_dst ,  ADRS( values )  );

      ASSEMBLE(               MOVE.L add_src,R8;     JSR    fetch_CMVE1;
           MOVE.L   R0, x;   MOVE.L  R1, y;         ADD.L  #6, add_src);

      x2     := x * x;
      y2     := y * y;
      x2_y2 := x2 + y2;
      sx      := sx  +  x;               sy      := sy   + y;
      sxy     := sxy + (x*y);
      sx2     := sx2 + x2;               sy2     := sy2  + y2;
      sx3_y2x:= sx3_y2x + (x * x2_y2);  sy3_x2y:= sy3_x2y + (y * x2_y2);

      move_slide_val( ADRS( values ),  add_dst );
      add_dst  := add_dst  + slide_data_blk;
      END loop;

   num_slides := num_slides + 1 ;
   release_auxiliary_memory( slide_data_ptr, slide_load_arrays_id );

   END & array space available &
    ELSE warn( exceeded_available_memory );
END load_slided;
```

```
SCAL.WORK.PD8510                THU, DEC 22, 1983, 10:26 AM    PAGE 17

#EJECT; COMMENT                                             compute_load
************************************************************************
*
* PROBLEMS: Due to the limited numerical resolution a potential problem
*           may occur. The input values are points on a circle, and
*           terms to the third power occur, this means the input
*           resoulution is approx 8 bits. So the circle finding routine
*           will find the center of the circle to -48db of the data.
*           i.e. -- Do NOT expect more than approx -48db accuracy on the
*           circle compaired to the worst case data value.
*           NOTE:Also num of slides have some effect on the resolution.
************************************************************************
;
PROCEDURE compute_load;
BEGIN
REAL          tx, ty, tx2, ty2, txy, tx3_y2x, ty3_x2y;
REAL          x, y, det, sx_tx, sy_ty;
REAL ARRAY    values[ 0 : ( slide_data_blk / real_size )  - 1 ];
REAL          sx = values[ 0 ]      ,sy = values[ 1 ],
              sx2= values[ 2 ]      ,sy2= values[ 3 ], sxy = values[ 4 ],
              sx3_y2x = values[ 5 ],sy3_x2y = values[ 6 ];
DOUBLE  add_dst, add_src;

IF memory_stolen(  slide_data_ptr, slide_load_arrays_id,
                                  slide_data_blk * pt_count )
    THEN num_slides := 0 ;

add_src  := slide_data_ptr    ;
add_dst  := data_destination  ;
```

```
SCAL.WORK.PD8510                THU, DEC 22, 1983, 10:26 AM    PAGE 18

#EJECT;
IF num_slides <= min_num_of_slides THEN
   warn( more_slides_needed )
 ELSE
   BEGIN
   tell_comp_cal_coeff ;
   REPEAT pt_count DO
      BEGIN
      move_slide_val( add_src ,  ADRS( values )  );

      tx  :=  sx / num_slides ;                ty  := sy / num_slides  ;
      tx2 :=  sx2 - ( sx_tx := sx * tx );
      ty2 :=  sy2 - ( sy_ty := sy * ty );
      txy :=  sxy -   sx * ty ;

      tx3_y2x := sx3_y2x + ( tx * ( 2.0 * sx_tx - 3.0*sx2 - sy2 ) )
                         - ( 2.0 * ty *  txy  ) ;
      ty3_x2y := sy3_x2y + ( ty * ( 2.0 * sy_ty - 3.0*sy2 - sx2 ) )
                         - ( 2.0 * tx *  txy ) ;
      det     := .5 / ( ( tx2 * ty2 ) - ( txy * txy ) ) ;

      x       := tx + det * ( ( ty2 * tx3_y2x ) - ( txy * ty3_x2y ) ) ;
      y       := ty + det * ( ( tx2 * ty3_x2y ) - ( txy * tx3_y2x ) ) ;

      ASSEMBLE(   MOVE.L  add_dst, R8;     MOVE.L  x, R0;  MOVE.L y,  R1;
                  JSR    CMV1E_save;       MOVE.L  R8, add_dst );

      add_src  := add_src  + slide_data_blk;
      END;
   num_slides  := 0;
   IF frequency_covered THEN  tell_press_done
       ELSE tell_connect_std;
   previous_menu;
   END else enought slides;

release_auxiliary_memory( slide_data_ptr, slide_load_arrays_id );

END compute_load;
```

```
SCAL.WORK.PD8510                THU, DEC 22, 1983, 10:26 AM    PAGE 19

#EJECT; COMMENT                                                take_data
************************************************************************
*
************************************************************************
;
PROCEDURE take_data;
   BEGIN & take_data &
   BOOLEAN is_sliding, std_in_band;
   REAL    fmin,  fmax;
   INTEGER class, pt_start, pt_stop ;

      is_sliding := TBIT( std_measured( fmin, fmax, class ) , 1);

      IF cal_type = one_port_on_2 THEN class := class - port_offset;
      IF cal_type = response       THEN class := 0;

      std_in_band   :=  TRUE;
      pt_start  :=  point_at_frequency( QUAD( fmin ) ) / step_size;
      pt_stop   :=  point_at_frequency( QUAD( fmax ) ) / step_size;
&WNUM( pt_start ); WNUM(pt_stop);  &
                       & the following is to make sure take_data banding
                           agrees  with standard_specs in std_act
                           problems when buckets step < 1 Hz       &

&WREAL( REAL( entry_frequency_at_point( pt_start*step_size) ) ); &
      IF NOT(fmin <= REAL(entry_frequency_at_point(pt_start*step_size)))
         THEN IF pt_start<number_of_points THEN pt_start := pt_start + 1
                                      ELSE std_in_band := FALSE;

&WREAL( REAL( entry_frequency_at_point( pt_stop *step_size) ) );  CRLF;&
      IF NOT(fmax >= REAL(entry_frequency_at_point(pt_stop *step_size)))
         THEN    IF pt_stop  >   0    THEN      pt_stop  := pt_stop  - 1
                                      ELSE std_in_band := FALSE;

      pt_count  := pt_stop - pt_start + 1;

      IF ( pt_count >  0 )  AND  std_in_band  THEN
         BEGIN
         data_source :=dp_raw_base[current_entry_ch,generic_param]
                     + DOUBLE(   pt_start * user3_length );
         data_destination := cal_coeff_addr
                     + DOUBLE( ( class * array_size )
                            + (pt_start * user3_length ) );

         IF is_sliding THEN
             load_slided
          ELSE
             copy_user3( data_source, data_destination, pt_count );
         END pt_count > 0;

      hilight_last_element;
      IF frequency_covered OR is_sliding THEN
         BEGIN
            IF is_sliding AND num_slides <= min_num_of_slides
               THEN tell( slide_load)
             ELSE   tell_press_done;
```

```
SCAL.WORK.PD8510              THU, DEC 22, 1983, 10:26 AM     PAGE  20

          cal_stds_remaining := RBIT( cal_stds_remaining, class );
          last_class := class;
        END
      ELSE tell_connect_std;

  END;  & take_data &
```

```
SCAL.WORK.PD8510              THU, DEC 22, 1983, 10:26 AM     PAGE  21

#EJECT;
PROCEDURE zero_std( std );
                                          VALUE std;  INTEGER std;
BEGIN

  cal_stds_remaining := RBIT( cal_stds_remaining, std );
  user3_zero( (cal_coeff_addr + DOUBLE( std * array_size ) ),
                                                number_of_points  );
END zero_std;


SUBROUTINE omit_isolation;
BEGIN
  zero_std( isoln_fwd_std );
  zero_std( isoln_rev_std );
  hilight_command(cmd_omit_isolation);
  beep(done_tone);
  tell_press_done ;
END omit_isolation;
```

```
SCAL.WORK.PD8510              THU, DEC 22, 1983, 10:26 AM     PAGE  22

#EJECT; COMMENT                                                    std_act
**************************************************************************
*
**************************************************************************
;
COMPLEX PROCEDURE std_act( freq,  class );
                                    VALUE  freq,  class;
                                      REAL freq; INTEGER class;
BEGIN
INTEGER type, type2;
REAL    freq_radians, loss, delay, z_line;
COMPLEX result, ZO;
REAL POINTER std_coeff;
BYTE POINTER std_type = std_coeff;
REAL real_result = result, imag_result = result + 4;
DOUBLE d= std_coeff;                                             & DEBUG &

SUBROUTINE rotate;
  result := result * exp_cmplx( COMPLEX( 0.0 , delay * freq_radians ) );

STPNTR( std_coeff, standard_specs( freq, class ) );

freq_radians := TwoPi * freq;
type   := std_type[ type_index  ];
type2  := std_type[ type2_index ];

&IF cal_debug THEN BEGIN
WSTR("std_act");WREAL(freq);WNUM(class);WHex(d,7);WNUM(type);
                                                  WNUM(type2);CRLF;END;&

delay  := std_coeff[ delay_index ];
loss   := std_coeff[  loss_index ];
z_line := std_coeff[    z0_index ];
ZO     := COMPLEX( system_z0, 0.0 );
result := 0.0;

IF type = std_thru THEN
       &thru& BEGIN
              result := complex_1;
              END
 ELSE
    BEGIN
    IF type = std_open  THEN
       &open&BEGIN
             imag_result := (std_coeff[c0_index] * unscale_c0)
                  + freq * ( (std_coeff[c1_index] * unscale_c1)
                                 + freq * ( std_coeff[c2_index]
                                      * unscale_c2 )        );
                             & order inportmant -- overflow prob&
              imag_result := -1.0 / ( imag_result * freq_radians );
             END
    ELSE IF type = std_load  THEN
       &load& result := ZO
    ELSE IF type = std_z     THEN
       & z  & real_result := std_coeff[ z0_index ]
    : COMMENT unneeded
```

```
SCAL.WORK.PD8510              THU, DEC 22, 1983, 10:26 AM     PAGE  23

     ELSE IF type = std_short THEN
        &short&       &default value are correct &   ;

  result := ( result - ZO ) / ( result + ZO );
  delay  := -2.0 * delay;
  rotate;

  END not a thru;

&IF cal_debug THEN BEGIN
WSTR("    ");WCPX(result);WREAL(delay);WREAL(loss);WREAL(z_line);CRLF;
END;&
   std_act := result;
END std_act;
```

```
SCAL.WORK.PD8510                THU, DEC 22, 1983, 10:26 AM     PAGE  24

#EJECT; COMMENT                                     compute_freq_resp_coeff
************************************************************************
*
* BE CAREFUL OF ACCESSING THE ARRAYS ( ONLY WORD WRITE ACESSES )
************************************************************************
;
PROCEDURE compute_freq_resp_coeff;
BEGIN
DOUBLE add;
INTEGER index;
REAL    freq;
COMPLEX coeff, meas ;
   add := cal_coeff_addr;
   FOR index := 0 STEP step_size UNTIL 800 DO
        BEGIN
        freq  :=  REAL( entry_frequency_at_point( index ) );

        ASSEMBLE(MOVE.L add   ,R8; JSR fetch_CMVE1; MOVEM.L R0-R1,meas);

        coeff:=meas/ std_act( freq, freq_resp_std );

        ASSEMBLE(MOVE.L  add,       R8;
                 MOVEM.L coeff,  R0-R1;    JSR CMV1E_save );

        add := add + user3_length;

        END loop;
   clear_message_and_in_progress;
END;
```

```
SCAL.WORK.PD8510                THU, DEC 22, 1983, 10:26 AM     PAGE  25

#EJECT; COMMENT                                        compute_1_port_coeff
************************************************************************
*
* BE CAREFUL OF ACCESSING THE ARRAYS ( ONLY WORD WRITE ACESSES )
************************************************************************
;
PROCEDURE compute_1_port_coeff( first_std_class );
                     VALUE first_std_class; INTEGER first_std_class;
BEGIN
DOUBLE add;
INTEGER offset, index;
REAL    freq;
COMPLEX meas1     , meas2    , meas3    ,
        act_1     , act_2    , act_3    ,
        term21_21, term32_32, term13_13,
        term21_3 , term32_1 , term13_2 ,
        coeff1   ,  coeff2 ,  coeff3 ,
        det,
        term21=coeff1,term32=coeff2,term13=coeff3;

   add := cal_coeff_addr;
   offset := array_size;
   IF NOT cal_in_progress  & only occurs on port2 of 2port reflection&
     THEN add := cal_coeff_addr + ( port_offset * offset ) ;
   tell_comp_cal_coeff ;
```

```
SCAL.WORK.PD8510                THU, DEC 22, 1983, 10:26 AM     PAGE  26

#EJECT;
   FOR index := 0 STEP step_size UNTIL 800 DO
        BEGIN
        freq  :=  REAL( entry_frequency_at_point( index ) );

        act_1 := std_act(  freq, first_std_class );
        act_2 := std_act(  freq, first_std_class + 1 );
        act_3 := std_act(  freq, first_std_class + 2 );

        ASSEMBLE(MOVE.L add   ,R8;JSR fetch_CMVE1;MOVEM.L R0-R1,meas1;
                 ADD.W  offset,R8;JSR fetch_CMVE1;MOVEM.L R0-R1,meas2;
                 ADD.W  offset,R8;JSR fetch_CMVE1;MOVEM.L R0-R1,meas3 );

        term21 := meas2 - meas1;
        term32 := meas3 - meas2;
        term13 := meas1 - meas3;

        term21_3  := term21 * act_3;
        term32_1  := term32 * act_1;
        term13_2  := term13 * act_2;

        term21_21 := term21 * act_2 * act_1;
        term32_32 := term32 * act_3 * act_2;
        term13_13 := term13 * act_1 * act_3;

        det   := term21_21      +  term32_32       +  term13_13;

        coeff1:=(term21_21*meas3 +  term32_32*meas1  +  term13_13*meas2)
                / det;                                     &directivity&

        coeff2:=-(term21_3      +  term32_1        +  term13_2)
                / det;                                    &source match&

        coeff3:= coeff1 * coeff2 +
             ( (term21_3* meas3 +  term32_1 *meas1  +  term13_2 *meas2)
                / det  );                                    &tracking&

        ASSEMBLE(MOVE.L  add,    R8;
                 MOVEM.L coeff1,R0-R1; JSR CMV1E_save ;
                 MOVE.L  add,    R8;    ADD.W offset,R8;
                 MOVEM.L coeff2,R0-R1; JSR CMV1E_save ;
                 MOVE.L  add,    R8:    ADD.W offset,R8; ADD.W offset,R8;
                 MOVEM.L coeff3,R0-R1; JSR CMV1E_save );

        add := add + user3_length;

     END loop;

   clear_message_and_in_progress;
   refl_computed := TRUE;

END compute_1_port_coeff;
```

```
SCAL.WORK.PD8510                THU, DEC 22, 1983, 10:26 AM     PAGE  27

#EJECT; COMMENT                                        compute_2_port_coeff
************************************************************************
* Order (structure) of error coeffs is VERY important  ( see acorrect )
*  e     e     e     e     e     e     e     e     e     e     e     e
*   DF    SF    RF    XF    LF    TF    DR    SR    RR    XR    LR    TR
*
* BE CAREFUL OF ACCESSING THE ARRAYS ( ONLY WORD WRITE ACESSES )
************************************************************************
end of comment;
PROCEDURE compute_2_port_coeff;
BEGIN
DOUBLE  add,  add2;
INTEGER offset, coeff_offset, index, port;
REAL    freq;
COMPLEX coeff1   ,   coeff2 ,   coeff3 ,
        coeff4   ,   coeff5 ,   coeff6 ,
        meas4    ,    meas5 ,    meas6 ;

   add := cal_coeff_addr;
   tell_comp_cal_coeff ;
   offset := array_size;

   FOR port := 1 TO 2 DO
     BEGIN
     IF port = 2 THEN add := cal_coeff_addr + (port_offset * offset);

     IF ( (cal_type = simple_two_port) AND (port = 2) ) THEN
      copy_user3( cal_coeff_addr, add, port_size * number_of_points )
     ELSE
      FOR index := 0 STEP step_size UNTIL 800 DO
        BEGIN
        ASSEMBLE(MOVE.L add   ,R8;JSR fetch_CMVE1;MOVEM.L R0-R1,coeff1;
                 ADD.W  offset,R8;JSR fetch_CMVE1;MOVEM.L R0-R1,coeff2;
                 ADD.W  offset,R8;JSR fetch_CMVE1;MOVEM.L R0-R1,coeff3;
                 ADD.W  offset,R8;JSR fetch_CMVE1;MOVEM.L R0-R1,meas4;
                 ADD.W  offset,R8;JSR fetch_CMVE1;MOVEM.L R0-R1,meas5;
                 ADD.W  offset,R8;JSR fetch_CMVE1;MOVEM.L R0-R1,meas6 );

        coeff5 :=  meas5 - coeff1;
        coeff5 :=  coeff5 / ( coeff3  + ( coeff2 * coeff5 ) );
                                         & load match &

        coeff6 :=  ( meas6 - meas4) * ( complex_1 - (coeff2 * coeff5) );
                                         & transmission tracking &
                                         & nothing needed for xtalk &

        add2   := add + ALEFT( DOUBLE( offset ) , 2 );   &4*offset&
        ASSEMBLE(MOVE.L  add2,   R8;
                 MOVEM.L coeff5,R0-R1; JSR CMV1E_save  ;
                 MOVE.L  add2,   R8;    ADD.W offset,R8;
                 MOVEM.L coeff6,R0-R1; JSR CMV1E_save );

        add := add + user3_length;

        END add index loop;
```

```
SCAL.WORK.PD8510              THU, DEC 22, 1983, 10:26 AM      PAGE  28

    END port loop;

   clear_message_and_in_progress;

END compute_2_port_coeff;
```

```
SCAL.WORK.PD8510              THU, DEC 22, 1983, 10:26 AM      PAGE  29

#EJECT; COMMENT                                                     cal_done
*************************************************************************
*
*************************************************************************
;
PROCEDURE  cal_done( type );
   VALUE   type;
   INTEGER type;
   BEGIN & cal_done &

   IF (type = done_class ) AND NOT frequency_covered THEN
        warn( not_finished_caling )
   ELSE
       IF (type = done_class ) AND ( cal_type # response ) THEN
          BEGIN
          hilight_last_class; .
          IF last_class_element > 1 THEN
             previous_menu;
          IF ( (cal_stds_remaining AND  cal_stds_needed[ cal_type ] AND -
                   needed_mask[ check_done[ last_class ] ] ) = 0 ) THEN
             BEGIN
             IF cal_type >= two_port THEN tell_press_done
                ELSE tell( press_save ) ;
             END
           ELSE tell_connect_std ;
          END
       ELSE IF ( (cal_stds_remaining AND needed_mask[type]) # 0) THEN
          warn( not_finished_caling )
       ELSE
          BEGIN & enough standards done and not a done_class &
          CASE type  OF
             BEGIN & case &
                BEGIN                                   & done_1_port_on_1 &
                   compute_1_port_coeff( port1_1st_std );
                   IF cal_type = simple_two_port THEN
                      BEGIN & if &
                         cal_in_progress := TRUE;      & not yet FALSE &
                         hilight_command(cmd_cal_simple_reflection);
                      END;  & if &
                END;
                BEGIN                                   & done_1_port_on_2 &
                   compute_1_port_coeff( port2_1st_std );
                END;
                BEGIN                                     & done_reflection &
                   compute_1_port_coeff( port1_1st_std );
                                                       & special port2 call &
                   compute_1_port_coeff( port2_1st_std );
                   cal_in_progress := TRUE;            & not yet FALSE &
                   hilight_command(cmd_cal_reflection);
                END;
                BEGIN                                          & done_trans &
                   IF cal_type = simple_two_port THEN
                      hilight_command(cmd_cal_simple_thru)
                   ELSE
                      hilight_command(cmd_cal_thru);
                END;
```

```
SCAL.WORK.PD8510              THU, DEC 22, 1983, 10:26 AM      PAGE  30

                BEGIN                                         & done_isol &
                   IF cal_type = simple_two_port THEN
                      hilight_command(cmd_cal_simple_isolation)
                   ELSE
                      hilight_command(cmd_cal_isolation);
                END;
                BEGIN                                       & done_2_port &
                   compute_2_port_coeff;
                   cal_type := two_port;  & in case of simple_two_port &
                END;
                BEGIN                     & done_class ( done_response ) &
                   compute_freq_resp_coeff;
                END;
             END;  & case &

             IF NOT cal_in_progress THEN
               BEGIN & if &
               tell( select_cal_set );
               gen_cal_info( save_op );
               END   & if &
             ELSE
               BEGIN
               previous_menu;
               IF ((cal_stds_remaining AND cal_stds_needed[cal_type])=0)
                THEN tell( press_save );
               END;

          END;  & not a done_class and enough standards done &

   END   & cal_done & ;
```

```
SCAL.WORK.PD8510              THU, DEC 22, 1983, 10:26 AM      PAGE  31

#EJECT;
COMMENT                                                cal_acquisiton_done
*************************************************************************
*
*   Called by control, in the control process.
*
*************************************************************************
;
SUBROUTINE cal_acquisition_done;                                   ENTRY;
   BEGIN & cal_acquisition_done &

      take_data;
      IF last_class_element <= 1 THEN
         cal_done(done_class);
      beep(done_tone);
      clear_message( measuring_std );
      number_of_groups := temp_number_of_groups;
      measuring_std_data := FALSE;

   END;  & cal_acquisition_done &
```

```
SCAL.WORK.PD8510            THU, DEC 22, 1983, 10:26 AM     PAGE  32

#EJECT;
COMMENT                                                        acquire_data
*************************************************************************
*
*  Begin data acquisition for obtaining calibration data.  If swept,
*  take one additional sweep to allow for settling.  If averaging is
*  turned on, take enough sweeps for the averaging factor plus 1.
*
*  Called from the command process, as with most other cal operations.
*
*************************************************************************
;
SUBROUTINE acquire_data;                                         ENTRY;
   BEGIN & acquire_data &
      IF NOT measuring_std_data THEN
         BEGIN & if &
            temp_number_of_groups := number_of_groups;
            measuring_std_data := TRUE;
         END;  & if &
      tell( measuring_std );

      IF sweep_mode = swept THEN
         IF entry_ch_integer(ch_average_mode) = avg_on THEN
            n_sweep( entry_ch_integer(ch_average_factor) + 1 )
         ELSE
            n_sweep(2)
      ELSE
         single_sweep;
   END;  & acquire_data &
```

```
SCAL.WORK.PD8510            THU, DEC 22, 1983, 10:26 AM     PAGE  33

#EJECT;
SUBROUTINE check_refl_status;
BEGIN
   tell_connect_std ;
   IF refl_computed THEN
      BEGIN  & must redo all of relection&
      cal_stds_remaining := cal_stds_remaining  OR
         ( needed_mask[done_reflection] AND cal_stds_needed[cal_type] );
      hilight_off( cmd_port1_std1, cmd_port2_std3 );
      hilight_off(cmd_cal_reflection,cmd_cal_reflection);
      hilight_off(cmd_cal_simple_reflection,cmd_cal_simple_reflection);
      refl_computed := FALSE;
      END      must redo all of relection;
END check_refl_status;

PROCEDURE if_correct_off_select_cal_kit( kit ); VALUE kit; INTEGER kit;
BEGIN
   IF entry_ch_integer( ch_correction_mode ) = correct_off THEN
      BEGIN & if &
         select_cal_kit( kit );
         gen_menu(CAL_TYPE_MENU, 1 )
      END   & if &
   ELSE
      warn( turn_correct_off );
END if_correct_off_select_cal_kit;

#FILE fcalmenu.work;

END$
```

```
FCAL0.WORK.PD8510           THU, DEC 22, 1983, 10:26 AM     PAGE   1

EXTERNAL INTEGER default_cal_set;

PROCEDURE  clear_param_cal( cal_set );
   VALUE   cal_set;
   INTEGER cal_set;                                       EXTERNAL.L;
SUBROUTINE correction_off;                                EXTERNAL.L;
PROCEDURE  correction_on( new_cal_set );
   VALUE   new_cal_set;
   INTEGER new_cal_set;                                   EXTERNAL.L;
PROCEDURE  param_correction_change( param );
   VALUE   param;
   INTEGER param;                                         EXTERNAL.L;
PROCEDURE  save_cal;                                      EXTERNAL.L;
PROCEDURE  init_cal0;                                     EXTERNAL.L;
```

```
SCAL0.WORK.PD8510           THU, DEC 22, 1983, 10:26 AM     PAGE   1

M68KL,P,"cal0"
BEGIN

#FILE fcal.work;
#FILE fmenu.work;
#FILE futil.work;                                     & for tell and warn &
#FILE ccal.work;                                   & cal_type constants &
#FILE ccalmenu.work;                                     & cmd_ constants &
#FILE crims.work;                                   & control_variables &
#FILE fkernel.work;                               & acquire and release &
#FILE fcontrol.work;                                      & abort sweep &
#FILE fcontv2.work;                                       & for rebuild &
#FILE fchtable.work;                    & set_entry_ch_.... entry_ch_.... &
#FILE cchtable.work;                     & ch_correction_type ...._mode &
#FILE ctrace0.work;                             & for update_proc_vars &
#FILE ftrace0.work;                                       & for partial &
#FILE fcontvar.work;          & max_parameter, partial_new_step_size &
#FILE fmbmgr.work;        & for save_data, recall_data, read_data_header &
#FILE fdispram.work;                           & for wrt_disp_quad, etc &
#FILE ctpmgr.work;                                       & for cal_file &
#FILE fchdata.work;                                     & for step_size &
#FILE fstimuli.work;      & for init_source and update_start_stop_.... &
#FILE fgratic.work;                         & for trace_and_graticule &


GLOBAL INTEGER default_cal_set;

INTEGER current_cal_set;
BYTE ARRAY param_cal_set[1:max_parameter];      & cal set for each param &
```

```
SCALO.WORK.PD8510                THU, DEC 22, 1983, 10:26 AM     PAGE  2

#EJECT; COMMENT                                           clear_param_cal
*************************************************************************
*
*  Eliminates any parameter links to the specified cal_set.  Used when
*  the cal_set is being deleted or overwritten by a new cal_set.
*
*************************************************************************
;
PROCEDURE  clear_param_cal( cal_set );
   VALUE   cal_set;
   INTEGER cal_set;                                              ENTRY;
   BEGIN & clear_param_cal &
      INTEGER param;

      IF cal_set = current_cal_set THEN
         current_cal_set := 0;

      FOR param := 1 UNTIL max_parameter DO
         IF param_cal_set[param] = cal_set THEN
            param_cal_set[param] := 0;          & 0 = correction off &

   END;  & clear_param_cal &
```

```
SCALO.WORK.PD8510                THU, DEC 22, 1983, 10:26 AM     PAGE  3

#EJECT; COMMENT                                      partial_correction_off
*************************************************************************
*
*************************************************************************
;
SUBROUTINE partial_correction_off;
   BEGIN & partial_correction_off &

      hilight_key( cmd_correction_off,
                   cmd_correction_on,
                   cmd_correction_off
                 );
      current_cal_set := 0;
      set_entry_ch_integer( correct_off, ch_correction_mode );
      deallocate_cal_array;

   END;  & partial_correction_off &
```

```
SCALO.WORK.PD8510                THU, DEC 22, 1983, 10:26 AM     PAGE  4

#EJECT; COMMENT                                            correction_off
*************************************************************************
*
*************************************************************************
;
SUBROUTINE correction_off;                                       ENTRY;
   BEGIN & correction_off &

      abort_sweep;
      acquire( control_variables );

      partial_correction_off;
      clear_param_cal( param_cal_set[entry_ch_integer(ch_param)] );

      IF entry_ch_integer(ch_correction_type) = two_port THEN
         rebuild := TRUE;             & reduced amount of data needed &
      partial(update_proc_vars);
      release( control_variables );        & and processing variables &
      restart_sweep;

   END;  & correction_off &
```

```
SCALO.WORK.PD8510                THU, DEC 22, 1983, 10:26 AM     PAGE  5

#EJECT; COMMENT                                                recall_cal
*************************************************************************
*
*************************************************************************
;
INTEGER PROCEDURE recall_cal(new_cal_set);
   VALUE   new_cal_set;
   INTEGER new_cal_set;
   BEGIN & recall_cal &
      INTEGER          param_bitmap,
                       new_step;
      BYTE    ARRAY    header[0:header_size+63];
      INTEGER POINTER iptr;
      REAL    POINTER rptr;
      QUAD    POINTER qptr = rptr;
      LABEL   exit_recall;

      param_bitmap := 0;

      abort_sweep;
      acquire( control_variables );

      IF ( (new_cal_set > 0) AND (new_cal_set <= 8) ) THEN
         BEGIN & if new_cal_set within range &
            STPNTR( iptr, ADRS(header) );
            IF read_data_header( ADRS(header),
                                 cal_file,
                                 new_cal_set
                               ) THEN
               BEGIN & if header read successful &
                  partial_correction_off;

                  new_step := iptr[hd_step_size];
                  IF new_step <> step_size THEN
                     partial_new_step_size( new_step );
                  STPNTR( qptr, ADRS(iptr[hd_start_frequency]) );
                  set_entry_ch_quad( qptr, ch_start_frequency );
                  STPNTR( qptr, ADRS(iptr[hd_center_frequency]) );
                  set_entry_ch_quad( qptr, ch_center_frequency );
                  STPNTR( rptr, ADRS(iptr[hd_sweep_time]) );
                  set_entry_ch_real( rptr, ch_sweep_time );
                  STPNTR( rptr, ADRS(iptr[hd_source_power]) );
                  set_entry_ch_real( rptr, ch_source_power );
                  set_entry_ch_integer( iptr[hd_power_slope_mode],
                                        ch_power_slope_mode
                                      );
                  param_bitmap := iptr[hd_param_bitmap];
                  IF iptr[hd_power_slope_mode] = power_slope_on THEN
                     BEGIN & power slope on &
                        STPNTR( rptr, ADRS(iptr[hd_power_slope]) );
                        set_entry_ch_real( rptr, ch_power_slope );
                     END;  & power slope on &

                  partial_allocate_cal( iptr[hd_array_type] );
                  cal_in_progress := FALSE;           & set TRUE above &
                  IF NOT cal_coeffs_allocated THEN
```

```
              BEGIN & allocation failure &
                 partial_correction_off;
                 GO TO exit_recall;
              END;  & allocation_failure &

            update_start_stop_center_span;
            init_source;

            IF NOT TBIT( param_bitmap,
                         entry_ch_integer( ch_param )
                       ) THEN
              BEGIN & if &
                 warn( cal_not_for_param );
                 partial_correction_off;
              END   & if &
            ELSE IF recall_data( entry_ch_double(ch_e_coeff_base)
                                 - header_size,
                                 cal_file,
                                 new_cal_set
                               ) THEN
              BEGIN & else if array read is successful &
                 hilight_key( cmd_correction_on,
                              cmd_correction_on,
                              cmd_correction_off
                            );
                 current_cal_set := new_cal_set;
                 set_entry_ch_integer( correct_on,
                                       ch_correction_mode
                                     );
              END   & else if array read successful &
            ELSE & array read unsuccessful &
              BEGIN & else unsuccessful &
                 warn( no_e_coeffs );
                 partial_correction_off;
              END;  & else unsuccessful &
          END   & if header read successful &
        ELSE & header read unsuccessful &
           partial_correction_off;
      END   & if new_cal_set within range &
    ELSE & new_cal_set outside of range (including 0) &
      partial_correction_off;

exit_recall:

    rebuild := TRUE;                               & can be smarter &
    partial( update_proc_vars );
    release( control_variables );
    restart_sweep;

    recall_cal := param_bitmap;

  END;  & recall_cal &
```

```
$EJECT; COMMENT                                            correction_on
**********************************************************************
*
**********************************************************************
;
PROCEDURE  correction_on( new_cal_set );
  VALUE   new_cal_set;
  INTEGER new_cal_set;                                         ENTRY;
  BEGIN & correction_on &
    INTEGER param;
    INTEGER param_bitmap;

    param_bitmap := recall_cal( new_cal_set );

    FOR param := 1 UNTIL max_parameter DO
      IF TBIT( param_bitmap, param ) THEN
        param_cal_set[param] := new_cal_set;

  END;  & correction_on &
```

```
$EJECT; COMMENT                                   param_correction_change
**********************************************************************
*
**********************************************************************
;
PROCEDURE  param_correction_change( param );
  VALUE   param;
  INTEGER param;                                               ENTRY;
  BEGIN & param_correction_change &
    INTEGER new_cal_set;

    IF NOT cal_in_progress THEN
      BEGIN & if &
        new_cal_set := param_cal_set( param );
        IF new_cal_set <> current_cal_set THEN
          recall_cal( new_cal_set );
      END;  & if &

  END;  & param_correction_change &
```

```
$EJECT; COMMENT                                                 save_cal
**********************************************************************
*  This routine is called by gen_cal_info(save_op).
*  It postpones providing the save routines with address and size until
*  until the last moment, simplifying HP-IB operation.
**********************************************************************
;
PROCEDURE  save_cal;                                           ENTRY;
  BEGIN & save_cal &
    INTEGER param_bitmap;
    INTEGER POINTER iptr;

    clear_param_cal( default_cal_set );

    STPNTR(iptr, entry_ch_double(ch_e_coeff_base) - header_size );

    wrt_disp_quad( ADRS(iptr[hd_start_frequency]),
                           entry_ch_quad( ch_start_frequency ) );
    wrt_disp_quad( ADRS(iptr[hd_center_frequency]),
                          entry_ch_quad( ch_center_frequency ) );
    wrt_disp_real( ADRS(iptr[hd_sweep_time]),
                               entry_ch_real( ch_sweep_time ) );
    wrt_disp_real( ADRS(iptr[hd_source_power]),
                             entry_ch_real( ch_source_power ) );
    wrt_disp_real( ADRS(iptr[hd_power_slope]),
                              entry_ch_real( ch_power_slope ) );
    wrt_disp_int(  ADRS(iptr[hd_power_slope_mode]),
                      entry_ch_integer( ch_power_slope_mode ) );
    wrt_disp_int(  ADRS(iptr[hd_step_size]), step_size );
    iptr[hd_array_type]          := cal_type;

    & bits set correspond to applicable parameters based on the      &
    & constants declared for ch_param in ccontvar.                   &
    IF ( (cal_type = two_port) OR (cal_type = simple_two_port) ) THEN
      param_bitmap := %01FE           & s-parameter derived params &
                              & see parameter constants in ccontvar &
    ELSE
      param_bitmap := SBIT(%0000, entry_ch_integer(ch_param));
    wrt_disp_int(  ADRS(iptr[hd_param_bitmap]), param_bitmap );

    save_data( ADRS(iptr),
               cal_size,
               cal_file,
               default_cal_set
             );

    IF cal_type = two_port THEN
      restore_param;

    correction_on( default_cal_set );

  END;  & save_cal &
```

```
SCALO.WORK.PD8510              THU, DEC 22, 1983, 10:26 AM      PAGE  10

#EJECT; COMMENT                                                   init_cal0
***************************************************************************
*
***************************************************************************
;
PROCEDURE  init_cal0;                                              ENTRY;
   BEGIN & init_cal0 &
      INTEGER param;

      default_cal_set := 1;
      current_cal_set := 0;
      FOR param := 1 UNTIL max_parameter DO
         param_cal_set[param] := 0;                   & 0 = correction off &

   END;  & init_cal0 &

END$
```

```
FCALMENU.WORK.PD8510           THU, DEC 22, 1983, 10:26 AM      PAGE   1

COMMENT
  This is a software generated file !!!
  Changes must be made in SKINFO.WORK
  Run GENSK.LANI to re-generate file;

SUBROUTINE proc7;  ENTRY;
BEGIN

CASE command_token-153 OF
BEGIN
& 153 &
correction_on(default_cal_set);
& 154 &
correction_off;
& 155 &
BEGIN
   tell( select_cal_set );
   gen_cal_info( no_op );
END;
& 156 &
if_correct_off_select_cal_kit( 1 );
& 157 &
if_correct_off_select_cal_kit( 2 );
& 158 &
resume_cal;
& 159 &
BEGIN END;
& 160 &
select_active_function( active_system_z0 );
& 161 &
warn(command_not_implemented);
& 162 &
select_cal_kit( 1 );
& 163 &
select_cal_kit( 2 );
& 164 &
BEGIN
   tell( select_delete_cal_set );
   gen_cal_info( clear_op );
END;
& 165 &
select_active_function( active_ref_plane_1 );
& 166 &
select_active_function( active_ref_plane_2 );
& 167 &
tdr_check;
& 168 &
set_cal_type( response );
& 169 &
set_cal_type( one_port_on_1 );
& 170 &
set_cal_type( one_port_on_2 );
& 171 &
set_cal_type( simple_two_port );
& 172 &
```

```
CCALMENU.WORK.PD8510           THU, DEC 22, 1983, 10:26 AM      PAGE   1

INTEGER CONSTANT

cmd_correction_on := 153,
cmd_correction_off := 154,
cmd_correction_default := 155,
cmd_cal_kit_1 := 156,
cmd_cal_kit_2 := 157,
cmd_ref_plane_menu := 159,
cmd_modify_cal_kit_1 := 162,
cmd_modify_cal_kit_2 := 163,
cmd_delete_cal := 164,
cmd_ref_plane_1 := 165,
cmd_ref_plane_2 := 166,
cmd_freq_setup := 167,
cmd_response_type := 168,
cmd_1_port_1_type := 169,
cmd_1_port_2_type := 170,
cmd_simple_2_port_type := 171,
cmd_2_port_type := 172,
cmd_port1_std1 := 173,
cmd_port1_std2 := 174,
cmd_port1_std3 := 175,
cmd_done_1_port_on_1 := 176,
cmd_port2_std1 := 177,
cmd_port2_std2 := 178,
cmd_port2_std3 := 179,
cmd_done_1_port_on_2 := 180,
cmd_cal_reflection := 181,
cmd_cal_thru := 182,
cmd_cal_isolation := 183,
cmd_done_2_port := 184,
cmd_done_reflection := 185,
cmd_fwd_transmission := 186,
cmd_fwd_match := 187,
cmd_rev_transmission := 188,
cmd_rev_match := 189,
cmd_done_trans := 190,
cmd_omit_isolation := 191,
cmd_fwd_isolation := 192,
cmd_rev_isolation := 193,
cmd_done_isolation := 194,
cmd_cal_simple_reflection := 195,
cmd_cal_simple_thru := 196,
cmd_cal_simple_isolation := 197,
cmd_done_simple_reflection := 198,
cmd_class_std1 := 199,
cmd_class_std2 := 200,
cmd_class_std3 := 201,
cmd_class_std4 := 202,
cmd_class_std5 := 203,
cmd_class_std6 := 204,
cmd_class_std7 := 205,
cmd_class_done := 206,
cmd_group7 := 0;
```

```
FCALMENU.WORK.PD8510           THU, DEC 22, 1983, 10:26 AM      PAGE   2

set_cal_type( two_port );
& 173 &
set_std_class( port1_1st_std );
& 174 &
set_std_class( port1_2nd_std );
& 175 &
set_std_class( port1_3rd_std );
& 176 &
cal_done( done_1_port_on_1 );
& 177 &
set_std_class( port2_1st_std );
& 178 &
set_std_class( port2_2nd_std );
& 179 &
set_std_class( port2_3rd_std );
& 180 &
cal_done( done_1_port_on_2 );
& 181 &
check_refl_status;
& 182 &
tell( connect_thru );
& 183 &
tell( isolate_ports );
& 184 &
cal_done( done_2_port );
& 185 &
cal_done( done_reflection );
& 186 &
   set_std_class( trans_fwd_std );
& 187 &
   set_std_class( match_fwd_std  );
& 188 &
   set_std_class( trans_rev_std );
& 189 &
   set_std_class( match_rev_std );
& 190 &
cal_done( done_trans );
& 191 &
omit_isolation;
& 192 &
set_std_class( isoln_fwd_std );
& 193 &
set_std_class( isoln_rev_std );
& 194 &
cal_done(done_isol);
& 195 &
check_refl_status;
& 196 &
tell( connect_thru );
& 197 &
tell( isolate_ports );
& 198 &
cal_done( done_1_port_on_1 );
& 199 &
set_element( 1 );
& 200 &
```

FCALMENU.WORK.PD8510 THU, DEC 22, 1983, 10:26 AM PAGE 3

```
set_element( 2 );
& 201 &
set_element( 3 );
& 202 &
set_element( 4 );
& 203 &
set_element( 5 );
& 204 &
set_element( 6 );
& 205 &
set_element( 7 );
& 206 &
cal_done(done_class);
& 207 &
acquire_data;
& 208 &
compute_load;
END;
END proc7;
```

ACASEBIG.WORK.PD8510 THU, DEC 22, 1983, 10:26 AM PAGE 1

```
ASM8,L
      HED M68K CASE STATEMENT
      NAM bigcase,7," MAKE CALL REL and LONG"
      ENT  CASE
*
R0    REG  0
R8    REG  8
S     REG  15
*
CASE TST R0
      BLT  XIT
      MOVE.L (S)+,R8
      CMP  -8(R8),R0
      BGE  CASEI
      ADD  R0,R0
      NEG  R0
      ADD  -10(R8,R0),R8
CASEI JMP  (R8)
XIT   RTS
      END
```

ACASE.WORK.PD8510 THU, DEC 22, 1983, 10:26 AM PAGE 1

```
ASM8,L
      HED M68K CASE STATEMENT
      NAM CASE,7,"FIX 1.5.80: MAKE CALL RELATIVE"
      ENT  CASE
*
R0    REG  0
R8    REG  8
S     REG  15
*
CASE TST R0
      BLT  XIT
      MOVE.L (S)+,R8
      CMP  -6(R8),R0
      BGE  CASEI
      ADD  R0,R0
      NEG  R0
      ADD  -8(R8,R0),R8
CASEI JMP  (R8)
XIT   RTS
      END
```

CCHCONST.WORK.PD8510 THU, DEC 22, 1983, 10:26 AM PAGE 1

```
INTEGER CONSTANT  ch1        := 1,
                  ch2        := 2,
                  no_ch      := -1;
```

```
FCHDATA.WORK.PD8510          THU, DEC 22, 1983, 10:26 AM     PAGE   1

EXTERNAL INTEGER   marker_state.L;
EXTERNAL INTEGER   number_of_groups.L;
EXTERNAL INTEGER   sweep_mode.L;
EXTERNAL INTEGER   trace_mode.L;
EXTERNAL INTEGER   step_size.L;
EXTERNAL INTEGER   if_test_gain.L;
EXTERNAL INTEGER   if_ref_gain.L;
EXTERNAL INTEGER   ch_table.L;
```

```
SCHDATA.WORK.PD8510          THU, DEC 22, 1983, 10:27 AM     PAGE   1

M68KL,P,"chdata"
BEGIN

#FILE cdatap.work;
#FILE cstimuli.work;
#FILE ctrace.work;
#FILE cyadc.work;
#FILE ccontvar.work;
#FILE ccal.work;
#FILE cchars.work;              & for cr, newline, hp_logo_h, hp_logo_p &

COMMENT
   The following tables are 3-dimensional:
     format    = maximum value of 11
     parameter = maximum value of 12
     channel   = maximum value of 2
   They are later equated to an assembly language entry point
   in order to simulate arrays with indices starting at 1 instead of 0.
;

REAL TABLE scale_tbl :=
  10.0, 10.0,      & format 1 -- log magnitude &
  10.0, 10.0,
  10.0, 10.0,
  10.0, 10.0,
  10.0, 10.0,
  10.0, 10.0,
  10.0, 10.0,
  10.0, 10.0,
  10.0, 10.0,
  10.0, 10.0,
  10.0, 10.0,
  10.0, 10.0,
  1.00, 1.00,      & format 2 -- linear magnitude &
  1.00, 1.00,
  1.00, 1.00,
  1.00, 1.00,
  1.00, 1.00,
  1.00, 1.00,
  1.00, 1.00,
  1.00, 1.00,
  1.00, 1.00,
  1.00, 1.00,
  1.00, 1.00,
  1.00, 1.00,
  100.0, 100.0,    & format 3 -- phase &
  100.0, 100.0,
  100.0, 100.0,
  100.0, 100.0,
  100.0, 100.0,
  100.0, 100.0,
  100.0, 100.0,
  100.0, 100.0,
  100.0, 100.0,
  100.0, 100.0,
```

```
SCHDATA.WORK.PD8510          THU, DEC 22, 1983, 10:27 AM     PAGE   2

  100.0, 100.0,
  100.0, 100.0,
  1.0e-8, 1.0e-8,  & format 4 -- group delay &
  1.0e-8, 1.0e-8,
  1.0e-8, 1.0e-8,
  1.0e-8, 1.0e-8,
  1.0e-8, 1.0e-8,
  1.0e-8, 1.0e-8,
  1.0e-8, 1.0e-8,
  1.0e-8, 1.0e-8,
  1.0e-8, 1.0e-8,
  1.0e-8, 1.0e-8,
  1.0e-8, 1.0e-8,
  1.0e-8, 1.0e-8,
  10.0, 10.0,      & format 5 -- real &
  10.0, 10.0,
  10.0, 10.0,
  10.0, 10.0,
  10.0, 10.0,
  10.0, 10.0,
  10.0, 10.0,
  10.0, 10.0,
  10.0, 10.0,
  10.0, 10.0,
  10.0, 10.0,
  10.0, 10.0,
  10.0, 10.0,      & format 6 -- imaginary &
  10.0, 10.0,
  10.0, 10.0,
  10.0, 10.0,
  10.0, 10.0,
  10.0, 10.0,
  10.0, 10.0,
  10.0, 10.0,
  10.0, 10.0,
  10.0, 10.0,
  10.0, 10.0,
  10.0, 10.0,
  0.20, 0.20,      & format 7 -- bullseye polar w/log marker readout &
  0.20, 0.20,
  0.20, 0.20,
  0.20, 0.20,
  0.20, 0.20,
  0.20, 0.20,
  0.20, 0.20,
  0.20, 0.20,
  0.20, 0.20,
  0.20, 0.20,
  0.20, 0.20,
  0.20, 0.20,
  0.20, 0.20,      & format 8 -- bullseye polar w/linear marker readout &
  0.20, 0.20,
  0.20, 0.20,
  0.20, 0.20,
  0.20, 0.20,
  0.20, 0.20,
```

```
SCHDATA.WORK.PD8510          THU, DEC 22, 1983, 10:27 AM     PAGE   3

  0.20, 0.20,
  0.20, 0.20,
  0.20, 0.20,
  0.20, 0.20,
  0.20, 0.20,
  0.20, 0.20,
  0.20, 0.20,      & format 9 -- imaginary vs real &
  0.20, 0.20,
  0.20, 0.20,
  0.20, 0.20,
  0.20, 0.20,
  0.20, 0.20,
  0.20, 0.20,
  0.20, 0.20,
  0.20, 0.20,
  0.20, 0.20,
  0.20, 0.20,
  0.20, 0.20,
  0.20, 0.20,      & format 10 -- impedance Smith chart &
  0.20, 0.20,
  0.20, 0.20,
  0.20, 0.20,
  0.20, 0.20,
  0.20, 0.20,
  0.20, 0.20,
  0.20, 0.20,
  0.20, 0.20,
  0.20, 0.20,
  0.20, 0.20,
  0.20, 0.20,
  0.20, 0.20,      & format 11 -- admittance Smith chart &
  0.20, 0.20,
  0.20, 0.20,
  0.20, 0.20,
  0.20, 0.20,
  0.20, 0.20,
  0.20, 0.20,
  0.20, 0.20,
  0.20, 0.20,
  0.20, 0.20,
  0.20, 0.20,
  0.20, 0.20,
  1.00, 1.00,      & format 12 -- SWR &
  1.00, 1.00,
  1.00, 1.00,
  1.00, 1.00,
  1.00, 1.00,
  1.00, 1.00,
  1.00, 1.00,
  1.00, 1.00,
  1.00, 1.00,
  1.00, 1.00,
  1.00, 1.00,
  1.00, 1.00;

REAL TABLE ref_position_tbl :=
```

```
  5.0, 5.0,       & format 1 -- log magnitude &
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  0.0, 0.0,       & format 2 -- linear magnitude &
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  5.0, 5.0,       & format 3 -- phase &
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,       & format 4 -- group delay &
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,       & format 5 -- real &
  5.0, 5.0,
  5.0, 5.0,
  5.0, 5.0,
  5.0, 5.0,
  5.0, 5.0,
  5.0, 5.0,
  5.0, 5.0,
```

```
  5.0, 5.0,
  5.0, 5.0,
  5.0, 5.0,
  5.0, 5.0,
  5.0, 5.0,       & format 6 -- imaginary &
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,       & format 7 -- bullseye polar w/log marker readout &
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,       & format 8 -- bullseye polar w/linear marker readout &
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,       & format 9 -- imaginary vs real &
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,       & format 10 -- impedance Smith chart &
  5.0, 5.0,
  5.0, 5.0,
  5.0, 5.0,
```

```
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,       & format 11 -- admittance Smith chart &
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  5.0, 5.0,
  1.0, 1.0,       & format 12 -- SWR &
  1.0, 1.0,
  1.0, 1.0,
  1.0, 1.0,
  1.0, 1.0,
  1.0, 1.0,
  1.0, 1.0,
  1.0, 1.0,
  1.0, 1.0,
  1.0, 1.0,
  1.0, 1.0,
  1.0, 1.0;

REAL TABLE ref_value_tbl :=
  0.0, 0.0,       & format 1 -- log magnitude &
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,       & format 2 -- linear magnitude &
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,
```

```
  0.0, 0.0,
  0.0, 0.0,
  0.0, 0.0,       & format 3 -- phase &
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,       & format 4 -- group delay &
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,       & format 5 -- real &
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,       & format 6 -- imaginary &
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  0.0, 0.0,
  1.0, 1.0,       & format 7 -- bullseye polar w/log marker readout &
  1.0, 1.0,
  1.0, 1.0,
  1.0, 1.0,
  1.0, 1.0,
  1.0, 1.0,
```

```
SCHDATA.WORK.PD8510            THU, DEC 22, 1983, 10:27 AM     PAGE  8

  1.0, 1.0,
  1.0, 1.0,
  1.0, 1.0,
  1.0, 1.0,
  1.0, 1.0,
  1.0, 1.0,
  1.0, 1.0,        & format 8 -- bullseye polar w/linear marker readout &
  1.0, 1.0,
  1.0, 1.0,
  1.0, 1.0,
  1.0, 1.0,
  1.0, 1.0,
  1.0, 1.0,
  1.0, 1.0,
  1.0, 1.0,
  1.0, 1.0,
  1.0, 1.0,
  1.0, 1.0,
  1.0, 1.0,        & format 9 -- imaginary vs real &
  1.0, 1.0,
  1.0, 1.0,
  1.0, 1.0,
  1.0, 1.0,
  1.0, 1.0,
  1.0, 1.0,
  1.0, 1.0,
  1.0, 1.0,
  1.0, 1.0,
  1.0, 1.0,
  1.0, 1.0,
  1.0, 1.0,        & format 10 -- impedance Smith chart &
  1.0, 1.0,
  1.0, 1.0,
  1.0, 1.0,
  1.0, 1.0,
  1.0, 1.0,
  1.0, 1.0,
  1.0, 1.0,
  1.0, 1.0,
  1.0, 1.0,
  1.0, 1.0,
  1.0, 1.0,
  1.0, 1.0,        & format 11 -- admittance Smith chart &
  1.0, 1.0,
  1.0, 1.0,
  1.0, 1.0,
  1.0, 1.0,
  1.0, 1.0,
  1.0, 1.0,
  1.0, 1.0,
  1.0, 1.0,
  1.0, 1.0,
  1.0, 1.0,
  1.0, 1.0,
  1.0, 1.0,        & format 12 -- SWR &
  1.0, 1.0,
```

```
SCHDATA.WORK.PD8510            THU, DEC 22, 1983, 10:27 AM     PAGE  9

  1.0, 1.0,
  1.0, 1.0,
  1.0, 1.0,
  1.0, 1.0,
  1.0, 1.0,
  1.0, 1.0,
  1.0, 1.0,
  1.0, 1.0,
  1.0, 1.0,
  1.0, 1.0;

INTEGER TABLE format_tbl :=
  fmt_log_mag,    fmt_log_mag,      & s11     frequency domain &
  fmt_log_mag,    fmt_log_mag,      & s21   &
  fmt_log_mag,    fmt_log_mag,      & s12   &
  fmt_log_mag,    fmt_log_mag,      & s22   &
  fmt_linear_mag,fmt_linear_mag,    & z1    &
  fmt_linear_mag,fmt_linear_mag,    & z2    &
  fmt_linear_mag,fmt_linear_mag,    & y1    &
  fmt_linear_mag,fmt_linear_mag,    & y2    &
  fmt_log_mag,    fmt_log_mag,      & user1 &
  fmt_log_mag,    fmt_log_mag,      & user2 &
  fmt_log_mag,    fmt_log_mag,      & user3 &
  fmt_log_mag,    fmt_log_mag,      & user4 &
  fmt_linear_mag,fmt_linear_mag,    & s11     band-pass time-domain &
  fmt_linear_mag,fmt_linear_mag,    & s21   &
  fmt_linear_mag,fmt_linear_mag,    & s12   &
  fmt_linear_mag,fmt_linear_mag,    & s22   &
  fmt_linear_mag,fmt_linear_mag,    & z1    &
  fmt_linear_mag,fmt_linear_mag,    & z2    &
  fmt_linear_mag,fmt_linear_mag,    & y1    &
  fmt_linear_mag,fmt_linear_mag,    & y2    &
  fmt_linear_mag,fmt_linear_mag,    & user1 &
  fmt_linear_mag,fmt_linear_mag,    & user2 &
  fmt_linear_mag,fmt_linear_mag,    & user3 &
  fmt_linear_mag,fmt_linear_mag,    & user4 &
  fmt_real,       fmt_real,         & s11     low_pass time-domain &
  fmt_real,       fmt_real,         & s21   &
  fmt_real,       fmt_real,         & s12   &
  fmt_real,       fmt_real,         & s22   &
  fmt_real,       fmt_real,         & z1    &
  fmt_real,       fmt_real,         & z2    &
  fmt_real,       fmt_real,         & y1    &
  fmt_real,       fmt_real,         & y2    &
  fmt_real,       fmt_real,         & user1 &
  fmt_real,       fmt_real,         & user2 &
  fmt_real,       fmt_real,         & user3 &
  fmt_real,       fmt_real,         & user4 &
  fmt_log_mag,    fmt_log_mag,      & s11     aux voltage domain &
  fmt_log_mag,    fmt_log_mag,      & s21   &
  fmt_log_mag,    fmt_log_mag,      & s12   &
  fmt_log_mag,    fmt_log_mag,      & s22   &
  fmt_linear_mag,fmt_linear_mag,    & z1    &
  fmt_linear_mag,fmt_linear_mag,    & z2    &
  fmt_linear_mag,fmt_linear_mag,    & y1    &
  fmt_linear_mag,fmt_linear_mag,    & y2    &
```

```
SCHDATA.WORK.PD8510            THU, DEC 22, 1983, 10:27 AM     PAGE  10

  fmt_log_mag,    fmt_log_mag,      & user1 &
  fmt_log_mag,    fmt_log_mag,      & user2 &
  fmt_log_mag,    fmt_log_mag,      & user3 &
  fmt_log_mag,    fmt_log_mag;      & user4 &

REAL TABLE delay_tbl :=                          & electrical delay &
  0.0,   0.0,     & s11   &
  0.0,   0.0,     & s21   &
  0.0,   0.0,     & s12   &
  0.0,   0.0,     & s22   &
  0.0,   0.0,     & z1    &
  0.0,   0.0,     & z2    &
  0.0,   0.0,     & y1    &
  0.0,   0.0,     & y2    &
  0.0,   0.0,     & user1 &
  0.0,   0.0,     & user2 &
  0.0,   0.0,     & user3 &
  0.0,   0.0;     & user4 &

INTEGER TABLE parm_desc_tbl :=
  num_b1,                     & s11, numerator_port            &
  denom_a1,                   & s11, denominator_port          &
  driven_a1,                  & s11, driven_port               &
  lock_to_a1,                 & s11, phase_lock_port           &
  conv_off,                   & s11, parameter_conversion      &

  num_b2,                     & s21, numerator_port            &
  denom_a1,                   & s21, denominator_port          &
  driven_a1,                  & s21, driven_port               &
  lock_to_a1,                 & s21, phase_lock_port           &
  conv_off,                   & s21, parameter_conversion      &

  num_b2,                     & s12, numerator_port            &
  denom_a1,                   & s12, denominator_port          &
  driven_a1,                  & s12, driven_port               &
  lock_to_a1,                 & s12, phase_lock_port           &
  conv_off,                   & s12, parameter_conversion      &

  num_b1,                     & s22, numerator_port            &
  denom_a1,                   & s22, denominator_port          &
  driven_a1,                  & s22, driven_port               &
  lock_to_a1,                 & s22, phase_lock_port           &
  conv_off,                   & s22, parameter_conversion      &

  num_b1,                     & z1, numerator_port             &
  denom_a1,                   & z1, denominator_port           &
  driven_a1,                  & z1, driven_port                &
  lock_to_a1,                 & z1, phase_lock_port            &
  conv_s_to_z,                & z1, parameter_conversion       &

  num_b2,                     & z2, numerator_port             &
  denom_a2,                   & z2, denominator_port           &
  driven_a1,                  & z2, driven_port                &
  lock_to_a1,                 & z2, phase_lock_port            &
  conv_s_to_z,                & z2, parameter_conversion       &
```

```
SCHDATA.WORK.PD8510            THU, DEC 22, 1983, 10:27 AM     PAGE  11

  num_b1,                     & y1, numerator_port             &
  denom_a1,                   & y1, denominator_port           &
  driven_a1,                  & y1, driven_port                &
  lock_to_a1,                 & y1, phase_lock_port            &
  conv_s_to_y,                & y1, parameter_conversion       &

  num_b2,                     & y2, numerator_port             &
  denom_a2,                   & y2, denominator_port '         &
  driven_a1,                  & y2, driven_port                &
  lock_to_a1,                 & y2, phase_lock_port            &
  conv_s_to_y,                & y2, parameter_conversion       &

  num_a1,                     & user1, numerator_port          &
  denom_no_ratio,             & user1, denominator_port        &
  driven_a1,                  & user1, driven_port             &
  lock_to_a1,                 & user1, phase_lock_port         &
  conv_off,                   & user1, parameter_conversion    &

  num_b2,                     & user2, numerator_port          &
  denom_no_ratio,             & user2, denominator_port        &
  driven_a1,                  & user2, driven_port             &
  lock_to_a1,                 & user2, phase_lock_port         &
  conv_off,                   & user2, parameter_conversion    &

  num_a2,                     & user3, numerator_port          &
  denom_no_ratio,             & user3, denominator_port        &
  driven_a1,                  & user3, driven_port             &
  lock_to_a1,                 & user3, phase_lock_port         &
  conv_off,                   & user3, parameter_conversion    &

  num_b1,                     & user4, numerator_port          &
  denom_no_ratio,             & user4, denominator_port        &
  driven_a1,                  & user4, driven_port             &
  lock_to_a1,                 & user4, phase_lock_port         &
  conv_off;                   & user4, parameter_conversion    &

BYTE TABLE old_id_bytes :=          & EACH TOTAL BYTE COUNT MUST BE EVEN &
  0, 0, 0, 0, 0, 0, 0, 0, 0, 0,       & old_id[1:old_id_size] = [1:20]) &
  0, 0, 0, 0, 0, 0, 0, 0, 0, 0;                                & 11 - 20 &
                                          & old_id_size from atestset &

COMMENT
  Any miscellaneous instrument state variables are grouped into
  integer tables below and global variables of the appropriate
  type are equated to their corresponding table entry.
;

INTEGER TABLE integer_vars :=
  continuous,          & number_of_groups &
  swept,               & sweep_mode &
  single_ch,           & trace_mode &
  4,                   & step_size &
  auto_range,          & if_test_gain &
  auto_range,          & if_ref_gain &
  0,                   & srq_mask_primary &
  0,                   & srq_mark_secondary &
```

```
SCHDATA.WORK.PD8510           THU, DEC 22, 1983, 10:27 AM     PAGE  12

  0,                   & plot_quadrant &
  0;                   & marker_state &

BYTE TABLE title_bytes :=          & EACH TOTAL BYTE COUNT MUST BE EVEN &
  50,02,               & title_line[-1:title_size] (17May83 = [-1:50]) &
  hp_logo_h,hp_logo_p,  0,0,0,0,0,0,0,0,0,                    & 1 - 11 &
                        0,0,0,0,0,0,0,0,0,0,0,0,0,0,          & 12 - 25 &
  0,0,0,0,0,0,0,0,0,0,0,0,0,0,0,0,0,0,0,0,0,0,0,0,0,          & 26 - 50 &
  0,0; & two additional for buffering during word moves due to dg ram. &
                                              & title_size from cscreen &

BYTE TABLE ch_cnd1_bytes :=        & EACH TOTAL BYTE COUNT MUST BE EVEN &
  50, 0,               & ch_cnd1_line[-1:title_size] (17May83 = [-1:50]) &
  0,0,0,0,0,0,0,0,0,0,0,0,0,0,0,0,0,0,0,0,0,0,0,0,0,          & 1 - 25 &
  0,0,0,0,0,0,0,0,0,0,0,0,0,0,0,0,0,0,0,0,0,0,0,0,0,          & 26 - 50 &
  0,0; & two additional for buffering during word moves due to dg ram. &
                                              & title_size from cscreen &

BYTE TABLE ch_cnd2_bytes :=        & EACH TOTAL BYTE COUNT MUST BE EVEN &
  50, 0,               & ch_cnd2_line[-1:title_size] (17May83 = [-1:50]) &
  0,0,0,0,0,0,0,0,0,0,0,0,0,0,0,0,0,0,0,0,0,0,0,0,0,          & 1 - 25 &
  0,0,0,0,0,0,0,0,0,0,0,0,0,0,0,0,0,0,0,0,0,0,0,0,0,          & 26 - 50 &
  0,0; & two additional for buffering during word moves due to dg ram. &
                                              & title_size from cscreen &

INTEGER TABLE    plot_pen_tbl := 1,1,2;       & pen colors for ch1, ch2 &

GLOBAL BYTE      old_id          = old_id_bytes[-1];   & 1 through 20 &

GLOBAL INTEGER   number_of_groups = integer_vars[0];
GLOBAL INTEGER   sweep_mode       = integer_vars[1];
GLOBAL INTEGER   trace_mode       = integer_vars[2];
GLOBAL INTEGER   step_size        = integer_vars[3];
GLOBAL INTEGER   if_test_gain     = integer_vars[4];
GLOBAL INTEGER   if_ref_gain      = integer_vars[5];
GLOBAL INTEGER   srq_mask_primary = integer_vars[6];
GLOBAL INTEGER   srq_mask_secondary=integer_vars[7];
GLOBAL INTEGER   plot_quadrant    = integer_vars[8];
GLOBAL INTEGER   marker_state     = integer_vars[9];

GLOBAL BYTE      title_line       = title_bytes[1];     & 0 through 50 &
GLOBAL BYTE      ch_cnd1_line     = ch_cnd1_bytes[1];   & 0 through 50 &
GLOBAL BYTE      ch_cnd2_line     = ch_cnd2_bytes[1];   & 0 through 50 &

COMMENT
  Softkey hilighting bitmap: 24 entries ^ 16 bits = 384 command codes
  When adding or deleting entries, subtract or add the number of entries
  * 16 - 1 to the CONSTANT hilite_max in SMENU.WORK and re-compile it
  along with this module.
;
GLOBAL INTEGER TABLE  hilite_bitmap :=
  & may have to fix up by hand (later) &
  0,0,0,0,0,0,0,0,0,0,0,0,0,0,0,0,0,0,0,0,0,0,0,0,  &0..23&
  0,0,0,0,0,0,0,0,0,0,0,0,0,0,0,0,0,0,0,0,0,0,0,0;  &24..47&

GLOBAL INTEGER TABLE coupled_bitmap :=
```

```
SCHDATA.WORK.PD8510           THU, DEC 22, 1983, 10:27 AM     PAGE  13

  -1,-1,-1,-1,-1,-1,-1,-1,-1,-1,-1,-1,
  -1,-1,-1,-1,-1,-1,-1,-1,-1,-1,-1,-1;   &0..23 set to %FFFF = coupled &

COMMENT
  The following tables contains channel values of different
  data types (quad,integer,double,real) on both channels.
  Table entries are preceded by BOOLEAN values indicating whether or
  not the table elements are coupled.

  Table naming conventions are as follows:
    b<n> for BOOLEAN TABLEs
    t<n> for data TABLEs
  Tables b1 and t1 must occur first,
  The variable max_save must be equated to the first label following the
        save/recall group.
  For any additional data tables, just add to the last n value used.
  Last n value used is found at the end of all the data tables.

NOTE !!!
  The comment, ch_<element>, included with each table correspond to the
  ch_<element> constants declared in CCHTABLE.WORK.  Therefore, any
  additions/deletions to those constants must also be made to this group
  of tables in order for the information to track each other.
;

BOOLEAN CONSTANT
  coupled   := TRUE,
  uncoupled := FALSE;

  & ch_start_frequency &
BOOLEAN TABLE b01 := coupled;
QUAD    TABLE t01 :=  2000000000, 2000000000;

  & ch_center_frequency &
BOOLEAN TABLE b02 := coupled;
QUAD    TABLE t02 := 10000000000,10000000000;

  & ch_start_aux_out &
BOOLEAN TABLE b03 := coupled;
QUAD    TABLE t03 := 0,0;

  & ch_center_aux_out &
BOOLEAN TABLE b04 := coupled;
QUAD    TABLE t04 := 0,0;

  & ch_start_time &
BOOLEAN TABLE b05 := coupled;
QUAD    TABLE t05 := -1000000,-1000000; & scaled to femtoseconds &

  & ch_center_time &
BOOLEAN TABLE b06 := coupled;
QUAD    TABLE t06 :=  1500000, 1500000; & scaled to femtoseconds &

  & ch_start_gate &
BOOLEAN TABLE b07 := coupled;
QUAD    TABLE t07 :=  -500000, -500000; & scaled to femtoseconds &
```

```
SCHDATA.WORK.PD8510           THU, DEC 22, 1983, 10:27 AM     PAGE  14

  & ch_center_gate &
BOOLEAN TABLE b08 := coupled;
QUAD    TABLE t08 :=        0,        0; & scaled to femtoseconds &

  & ch_sweep_time &
BOOLEAN TABLE b09 := coupled;
REAL    TABLE t09 := .1, .1;

  & ch_source_power &
BOOLEAN TABLE b10 := coupled;
REAL    TABLE t10 := 10.0, 10.0;

  & ch_power_slope &
BOOLEAN TABLE b11 := coupled;
REAL    TABLE t11 := 0.0, 0.0;

  & ch_power_slope_mode &
BOOLEAN TABLE b12 := coupled;
INTEGER TABLE t12 := power_slope_off, power_slope_off;

  & ch_domain &
BOOLEAN TABLE b13 := uncoupled;
INTEGER TABLE t13 := freq_domain, freq_domain;

  & ch_gating &
BOOLEAN TABLE b14 := coupled;
INTEGER TABLE t14 := gate_off, gate_off;

  & ch_gate_window &
BOOLEAN TABLE b15 := coupled;
INTEGER TABLE t15 := normal_window, normal_window;

  & ch_time_window &
BOOLEAN TABLE b17 := coupled;
INTEGER TABLE t17 := normal_window, normal_window;

  & ch_tdr_stimulus_type &
BOOLEAN TABLE b18 := coupled;
INTEGER TABLE t18 := step_tdr, step_tdr;

  & ch_param &
BOOLEAN TABLE b20 := uncoupled;
INTEGER TABLE t20 := 1,2;

  & ch_marker1 &
BOOLEAN TABLE b21 := coupled;
QUAD    TABLE t21 := 4000000000,4000000000;

  & ch_marker2 &
BOOLEAN TABLE b22 := coupled;
QUAD    TABLE t22 := 4000000000,4000000000;

  & ch_marker3 &
BOOLEAN TABLE b23 := coupled;
QUAD    TABLE t23 := 4000000000,4000000000;
```

```
SCHDATA.WORK.PD8510           THU, DEC 22, 1983, 10:27 AM     PAGE  15

  & ch_marker4 &
BOOLEAN TABLE b24 := coupled;
QUAD    TABLE t24 := 4000000000,4000000000;

  & ch_marker5 &
BOOLEAN TABLE b25 := coupled;
QUAD    TABLE t25 := 4000000000,4000000000;

  & ch_average_factor &
BOOLEAN TABLE b26 := uncoupled;
INTEGER TABLE t26 := 1,1;

  & ch_average_mode &
BOOLEAN TABLE b27 := uncoupled;
INTEGER TABLE t27 := avg_off, avg_off;

  & ch_correction_type &
BOOLEAN TABLE b28 := coupled;
INTEGER TABLE t28 := undefined_cal, undefined_cal;

  & ch_correction_mode &
BOOLEAN TABLE b29 := coupled;
INTEGER TABLE t29 := correct_off, correct_off;

  & ch_math_op &
BOOLEAN TABLE b30 := uncoupled;
INTEGER TABLE t30 := trace_data_div_mem, trace_data_div_mem;

  & ch_mem_nmbr &
BOOLEAN TABLE b63 := uncoupled;
INTEGER TABLE t63 := mem1, mem2;

  & ch_smoothing_aperture &
BOOLEAN TABLE b31 := uncoupled;
REAL    TABLE t31 := 0.0,0.0;

  & ch_smoothing_mode &
BOOLEAN TABLE b32 := uncoupled;
INTEGER TABLE t32 := smoothing_off, smoothing_off;

  & ch_m_state &
BOOLEAN TABLE b33 := uncoupled;
INTEGER TABLE t33 := m_off, m_off;

  & ch_d_state &
BOOLEAN TABLE b34 := uncoupled;
INTEGER TABLE t34 := d_on, d_on;

  & ch_trace_math &
BOOLEAN TABLE b64 := uncoupled;
INTEGER TABLE t64 := math_off, math_off;

  & ch_stimulus_mode &
BOOLEAN TABLE b35 := uncoupled;
INTEGER TABLE t35 := start_stop, start_stop;
```

```
  & ch_atten_port1 &
BOOLEAN TABLE b36 := coupled;
REAL    TABLE t36 := 0.0, 0.0;

  & ch_atten_port2 &
BOOLEAN TABLE b37 := coupled;
REAL    TABLE t37 := 0.0, 0.0;

  & ch_xadc_gain &
BOOLEAN TABLE b38 := coupled;
INTEGER TABLE t38 := 0, 0;

  & ch_phase_offset &
BOOLEAN TABLE b39 := uncoupled;
REAL    TABLE t39 := 0.0, 0.0;

  & ch_magnitude_slope &
BOOLEAN TABLE b71 := uncoupled;
REAL    TABLE t71 := 0.0, 0.0;

  & ch_magnitude_offset &
BOOLEAN TABLE b72 := uncoupled;
REAL    TABLE t72 := 0.0, 0.0;

  & ch_stimulus_slope &
BOOLEAN TABLE b73 := uncoupled;
REAL    TABLE t73 := 0.0, 0.0;

  & ch_stimulus_offset &
BOOLEAN TABLE b74 := uncoupled;
QUAD    TABLE t74 := 0, 0;

  & ch_ref_plane_1 &
BOOLEAN TABLE b75 := coupled;
REAL    TABLE t75 := 0.0, 0.0;

  & ch_ref_plane_2 &
BOOLEAN TABLE b76 := coupled;
REAL    TABLE t76 := 0.0, 0.0;

  & ch_system_z0 &
BOOLEAN TABLE b77 := coupled;
REAL    TABLE t77 := 50.0, 50.0;

COMMENT --------------- end of save/recall state --------------------;

  & ch_basis_s_param &
BOOLEAN TABLE b40 := uncoupled;
INTEGER TABLE t40 := %AAAA, %AAAA;

  & ch_refl_trans &
BOOLEAN TABLE b41 := uncoupled;
INTEGER TABLE t41 := %AAAA, %AAAA;

  & ch_param_conversion &
```

```
BOOLEAN TABLE b42 := uncoupled;
INTEGER TABLE t42 := %AAAA, %AAAA;

  & ch_format &
BOOLEAN TABLE b43 := uncoupled;
INTEGER TABLE t43 := %AAAA, %AAAA;

  & ch_scale &
BOOLEAN TABLE b44 := uncoupled;
REAL    TABLE t44 := %AAAAAAAA, %AAAAAAAA;

  & ch_ref_value &
BOOLEAN TABLE b45 := uncoupled;
REAL    TABLE t45 := %AAAAAAAA, %AAAAAAAA;

  & ch_ref_position &
BOOLEAN TABLE b46 := uncoupled;
REAL    TABLE t46 := %AAAAAAAA, %AAAAAAAA;

  & ch_elec_delay &
BOOLEAN TABLE b47 := uncoupled;
REAL    TABLE t47 := %AAAAAAAA, %AAAAAAAA;

  & ch_start_stimulus &
BOOLEAN TABLE b48 := coupled;
QUAD    TABLE t48 := %AAAAAAAAAAAAAAAA, %AAAAAAAAAAAAAAAA;

  & ch_stop_stimulus &
BOOLEAN TABLE b49 := coupled;
QUAD    TABLE t49 := %AAAAAAAAAAAAAAAA, %AAAAAAAAAAAAAAAA;

  & ch_center_stimulus &
BOOLEAN TABLE b50 := coupled;
QUAD    TABLE t50 := %AAAAAAAAAAAAAAAA, %AAAAAAAAAAAAAAAA;

  & ch_span_stimulus &
BOOLEAN TABLE b51 := coupled;
QUAD    TABLE t51 := %AAAAAAAAAAAAAAAA, %AAAAAAAAAAAAAAAA;

  & ch_raw11_base &
BOOLEAN TABLE b52 := uncoupled;
DOUBLE  TABLE t52 := %AAAAAAAA, %AAAAAAAA;

  & ch_raw21_base &
BOOLEAN TABLE b53 := uncoupled;
DOUBLE  TABLE t53 := %AAAAAAAA, %AAAAAAAA;

  & ch_raw12_base &
BOOLEAN TABLE b54 := uncoupled;
DOUBLE  TABLE t54 := %AAAAAAAA, %AAAAAAAA;

  & ch_raw22_base &
BOOLEAN TABLE b55 := uncoupled;
DOUBLE  TABLE t55 := %AAAAAAAA, %AAAAAAAA;

  & ch_d_base &
```

```
BOOLEAN TABLE b56 := uncoupled;
DOUBLE  TABLE t56 := %AAAAAAAA, %AAAAAAAA;

  & ch_f_base &
BOOLEAN TABLE b57 := uncoupled;
DOUBLE  TABLE t57 := %AAAAAAAA, %AAAAAAAA;

  & ch_m_base &
BOOLEAN TABLE b58 := uncoupled;
DOUBLE  TABLE t58 := %AAAAAAAA, %AAAAAAAA;

  & ch_trace_base &
BOOLEAN TABLE b59 := uncoupled;
DOUBLE  TABLE t59 := %AAAAAAAA, %AAAAAAAA;

  & ch_m_trace_base &
BOOLEAN TABLE b60 := uncoupled;
DOUBLE  TABLE t60 := %AAAAAAAA, %AAAAAAAA;

  & ch_e_coeff_base &
BOOLEAN TABLE b61 := coupled;
DOUBLE  TABLE t61 := %AAAAAAAA, %AAAAAAAA;

  & ch_finished_signal &
BOOLEAN TABLE b62 := uncoupled;
INTEGER TABLE t62 := %AAAA, %AAAA;

  & ch_stop_gate &
BOOLEAN TABLE b65 := coupled;
QUAD    TABLE t65 := %AAAAAAAAAAAAAAAA, %AAAAAAAAAAAAAAAA;

  & ch_channel_no &
BOOLEAN TABLE b66 := uncoupled;
INTEGER TABLE t66 := 1, 2;

& last used = 77 (11 Aug 83, WCC) -- 16,19,67,68,69,70 are also free &

INTEGER TABLE filler := 0,0,0,0,0,0,0,0,0,0,0,0,0,0,0,0,0,0,0,0,0,0,0,0,0,0;

COMMENT -------------- end of instrument state set up ---------------;

GLOBAL INTEGER ch_table = b01;            & start of channel table  &
GLOBAL INTEGER min_save = scale_tbl;      & start of save/recall    &
GLOBAL INTEGER max_save = b40;            & start of non-save/recall&
GLOBAL INTEGER last_state = integer_vars; & start of last state     &
GLOBAL INTEGER max_dump = filler;         & end of entire mach state&

COMMENT ------------------ equating PFR tables ----------------------;

ASSEMBLE(
      "               ENT scale               ";
      "               ENT ref_position        ";
      "               ENT ref_value           ";
      "               ENT format              ";
      "               ENT elec_delay          ";
```

```
      "               ENT parameter_descriptor  ";
  "scale              EQU $scale_tbl-108        ";
  "ref_position       EQU $ref_position_tbl-108 ";
  "ref_value          EQU $ref_value_tbl-108    ";
  "format             EQU $format_tbl-6         ";
  "elec_delay         EQU $delay_tbl-12         ";
  "parameter_descriptor EQU $parm_desc_tbl-12   "
      );                        & these arrays are declared in FCHPFR &

COMMENT --------- equating plotter pen setup tables ------------------
        --------- and softkey hilite bitmap info.   ------------------;

ASSEMBLE(
      "               ENT plotter_pen         ";
      "               ENT hilite_info         ";
  "plotter_pen        EQU $plot_pen_tbl       ";
  "hilite_info        EQU $hilite_bitmap      "
      );        & these arrays are declared in FCHDATA2 &

END$
```

```
FCHDATA2.WORK.PD8510          THU, DEC 22, 1983, 10:27 AM     PAGE  1

EXTERNAL INTEGER TABLE  coupled_bitmap.L;
EXTERNAL BYTE ARRAY old_id.L[1:20];
EXTERNAL INTEGER
   min_save.L,
   max_save.L,
   max_dump.L,
   plot_quadrant.L,
   srq_mask_primary.L,
   srq_mask_secondary.L,
   last_state.L;
EXTERNAL BYTE ARRAY title_line.L[-1:50];
EXTERNAL INTEGER ARRAY plotter_pen.L [0:2];
EXTERNAL INTEGER ARRAY hilite_info.L [0:1,0:24];
   COMMENT
   upper limit of 24 should change as number of entries in 1st row of
   hilite_bitmap table (found in schdata) increases or decreases;
```

```
FCHPFR.WORK.PD8510          THU, DEC 22, 1983, 10:27 AM     PAGE  1

COMMENT requires max_... constants from cdatap, ccontvar, and cchtable;
& These arrays are defined in file fchdata &
EXTERNAL INTEGER ARRAY format.L[ 0:max_domain,
                                 1:max_parameter,
                                 1:max_ch
                               ];
EXTERNAL REAL ARRAY elec_delay.L[ 1:max_parameter,
                                  1:max_ch
                                ];
EXTERNAL REAL ARRAY scale.L[ 1:max_format,
                             1:max_parameter,
                             1:max_ch
                           ];
EXTERNAL REAL ARRAY ref_position.L[ 1:max_format,
                                    1:max_parameter,
                                    1:max_ch
                                  ];
EXTERNAL REAL ARRAY ref_value.L[ 1:max_format,
                                 1:max_parameter,
                                 1:max_ch
                               ];
EXTERNAL INTEGER ARRAY parameter_descriptor.L[ 1:max_parameter,
                                               1:max_parameter_entry
                                             ];
```

```
DCHQUICK.WORK.PD8510          THU, DEC 22, 1983, 10:27 AM     PAGE  1

1280
20480
20352
9216
1024
20480
1280
16384
9216
1280
20544
16384
9216
1280
20496
16440
16392
20472
20480
16392
20472
20472
20528
20432
9216
1280
20480
16432
16424
16448
20440
20416
20544
20432
9216
1280
20488
16440
16408
16432
20488
20472
16384
20448
20472
20464
20456
16384
20472
16400
16384
16416
16392
16400
16408
```

```
DCHQUICK.WORK.PD8510          THU, DEC 22, 1983, 10:27 AM     PAGE  2

16384
16392
20464
20504
20384
9216
1280
20488
16488
16400
16392
16384
20416
16384
16448
24560
20416
16416
16384
20504
20432
9216
1280
20480
16432
16424
16384
20440
16384
16392
16408
16408
16392
16392
16400
20472
16400
20464
16384
20464
20472
20544
20376
9216
1280
20480
16440
16400
20472
16400
16384
16392
16400
20472
16400
20464
```

DCHQUICK.WORK.PD8510 THU, DEC 22, 1983, 10:27 AM PAGE 3

16384
20496
16384
16392
16400
20472
16400
20464
16384
20464
20472
20544
20376
9216
1280
20512
16432
16384
16448
20448
20432
16432
16384
20432
16384
16416
16432
16384
20416
20512
20432
9216
1280
20480
16496
16424
16384
20440
16384
16384
20456
16408
16384
16400
20472
16384
20464
20472
20464
20464
16384
20464
16392
20544
20424
9216

DCHQUICK.WORK.PD8510 THU, DEC 22, 1983, 10:27 AM PAGE 4

1280
20480
16464
16416
16384
16392
20464
20472
20464
20456
16384
20472
16400
16384
16416
16392
16400
16400
16384
16400
20472
20504
20376
9216
1280
20488
16432
16416
16448
20440
16384
16424
16384
20448
20416
20536
20432
9216
1280
20488
16464
16408
16384
16392
20464
20472
20464
20456
16384
20472
16400
16392
16400
20472
16400
16392

DCHQUICK.WORK.PD8510 THU, DEC 22, 1983, 10:27 AM PAGE 5

16400
16408
16384
16392
20464
20472
20464
20512
20400
9216
1280
20520
16464
20448
16384
20472
16400
16392
16400
16408
16384
16392
20464
16384
20448
20472
20464
20464
16384
20464
16392
20544
20424
9216
1280
20480
16448
16432
16384
20432
16384
20480
16408
16432
16384
20432
16384
20544
20392
9216
1280
20504
16432
16384
16384
20480

DCHQUICK.WORK.PD8510 THU, DEC 22, 1983, 10:27 AM PAGE 6

16400
16384
16400
16408
16392
16384
16400
20456
16392
20456
20472
20544
20376
9216
1280
20512
16432
20464
16384
20464
16400
16384
16416
16400
16400
16400
16384
16400
20464
16384
20456
20472
20464
20472
16424
20464
20472
16384
20456
16400
16384
20512
20416
9216
1280
20488
16448
16416
16384
20448
16384
24568
20464
16408
16448
16408

DCHQUICK.WORK.PD8510 THU, DEC 22, 1983, 10:27 AM PAGE 7

20416
20456
16448
20456
20416
20544
20432
9216
1280
20512
16432
20448
16384
16384
16448
16416
16384
16400
20464
20464
20464
20448
16384
16416
16384
16400
20464
20464
20464
20448
16384
16384
16448
16416
16384
20512
20368
9216
1280
20480
16440
16384
16432
16384
20432
16408
20472
16408
16392
20480
16432
20456
16392
20456
20472
20544

DCHQUICK.WORK.PD8510 THU, DEC 22, 1983, 10:27 AM PAGE 8

20376
9215
1280
20480
16496
16384
20416
16416
16384
16400
16400
16384
16416
20464
16400
20448
16384
16384
20416
20544
20432
9216
1280
20480
16464
16424
16384
20440
16384
20480
20448
16384
16448
16432
15384
20432
16384
16384
20416
16432
16384
20432
16384
20544
20432
9216
1280
20480
16464
16424
16384
20440
16384
20480
20448
16384

DCHQUICK.WORK.PD8510 THU, DEC 22, 1983, 10:27 AM PAGE 9

16448
16432
16384
20432
16384
16384
20416
20544
20432
9216
1280
20512
16464
16400
16384
16384
20456
20456
20472
20456
16392
16384
16432
16384
20432
20480
16432
16408
16392
16408
20472
20496
20376
9216
1280
20528
16432
16384
16448
16384
20416
20480
16416
20432
16384
16432
16384
24528
16416
16384
20416
16384
16448
20544
20368
9216

DCHQUICK.WORK.PD8510 THU, DEC 22, 1983, 10:27 AM PAGE 10

1280
20488
16432
16416
16384
24560
16384
16384
16448
16384
20416
24560
16448
16416
16384
20504
20368
9216
1280
20480
16448
16392
20464
16408
16384
16392
16400
16384
16432
16384
20432
20504
20416
9216
1280
20528
16432
20448
16416
16416
20448
24568
16448
20440
20440
16424
16424
24536
16384
16384
20416
16384
16448
20544
20368
9216

DCHQUICK.WORK.PD8510 THU, DEC 22, 1983, 10:27 AM PAGE 11

```
1280
20480
16432
16384
16448
16384
20416
16424
16384
20440
16384
20544
20432
9216
1280
20480
16496
16408
20432
16408
16432
16384
20416
16384
16448
20456
20432
20456
16432
16384
20416
16384
16448
20544
20368
9216
1280
20480
16432
16384
16448
16432
20416
16384
16448
16384
20416
20432
16448
16384
20416
20544
20432
9216
1280
20528
```

DCHQUICK.WORK.PD8510 THU, DEC 22, 1983, 10:27 AM PAGE 12

```
16440
16384
16432
16384
20432
20456
20472
20456
16392
16384
16432
16384
20432
20480
16432
16408
16392
16408
20472
20496
20376
9216
1280
20480
16496
16384
20416
16384
16448
16424
16384
16392
20464
20472
20464
20440
16384
20544
20400
9216
1280
20480
16440
16384
16432
16384
20432
16408
20472
16408
16392
16384
16432
20456
16392
20456
```

DCHQUICK.WORK.PD8510 THU, DEC 22, 1983, 10:27 AM PAGE 13

```
20472
20528
20432
16384
16432
24552
20448
16408
20448
20496
20440
9216
1280
20520
16496
20440
16384
16384
20416
16384
16448
16424
16384
16392
20464
20472
20464
20440
16384
16416
16384
16400
20448
20496
20432
9216
1280
20528
16488
20456
16392
20456
20472
16384
20464
16416
20472
16400
20472
16384
20464
20456
20472
20456
16392
20544
```

DCHQUICK.WORK.PD8510 THU, DEC 22, 1983, 10:27 AM PAGE 14

```
20424
9216
1280
20480
16496
16432
16384
20432
16384
20504
16384
16384
20416
16384
16448
20520
20368
9216
1280
20480
16440
16384
16440
16384
20424
16408
20472
16408
16392
16384
16440
16384
20424
20496
20424
9216
1280
20504
16432
20456
16448
16408
20416
16408
16448
20456
20416
20520
20432
9216
1280
20480
16496
16392
20416
16400
```

```
DCHQUICK.WORK.PD8510            THU, DEC 22, 1983, 10:27 AM     PAGE  15

16432
16400
20432
16392
16448
20472
20416
20464
16432
20464
20432
20472
16448
20544
20368
9216
1280
20480
16432
16432
16448
20432
20416
20480
16448
16432
20416
20432
16448
20544
20368
9216
1280
20480
16496
16408
20448
16408
16416
20456
20448
16384
20448
16384
16416
20456
16416
20544
20368
9216
1280
20480
16496
16432
16384
20432
```

```
DCHQUICK.WORK.PD8510            THU, DEC 22, 1983, 10:27 AM     PAGE  16

20416
16432
16384
20432
16384
16432
16448
20432
16384
20544
20368
9216
```

```
FCHQUICK.WORK.PD8510            THU, DEC 22, 1983, 10:27 AM     PAGE   1

   80,  5,-124, 66,
   64,  5, 80,  4, 66,
   80, 69,  4, 66,
   80, 21, 60, 12, -4,  5, 12, -4, -4, 53,-44, 66,
   80,  5, 52, 44, 68,-36,-60, 69,-44, 66,
   80, 13, 60, 28, 52, 13, -4,  4,-28, -4,-12,-20,  4, -4, 20,  4, 36,
 12, 20, 28,  4, 12,-12, 29,-92, 66,
   80, 13,108, 20, 12,  4,-60,  4, 68,-11,-60, 36,  4, 29,-44, 66,
   80,  5, 52, 44,  4,-36,  4, 12, 28, 28, 12, 12, 20, -4, 20,-12,  4,
-12, -4, 69,-100, 66,
   80,  5, 60, 20, -4, 20,  4, 12, 20, -4, 20,-12,  4, 21,  4, 12, 20,
 -4, 20,-12,  4,-12, -4, 69,-100, 66,
   80, 37, 52,  4, 68,-28,-44, 52,  4,-44,  4, 36, 52,  4,-60, 37,-44,
 66,
   80,  5,116, 44,  4,-36,  4,  4,-20, 28,  4, 20, -4,  4,-12, -4,-12,
-12,  4,-12, 12, 69,-52, 66,
   80,  5, 84, 36,  4, 12,-12, -4,-12,-20,  4, -4, 20,  4, 36, 12, 20,
 20,  4, 20, -4, 29,-100, 66,
   80, 13, 52, 36, 68,-36,  4, 44,  4,-28,-60, 61,-44, 66,
   80, 13, 84, 28,  4, 12,-12, -4,-12,-20,  4, -4, 20, 12, 20, -4, 20,
 12, 20, 28,  4, 12,-12, -4,-12, 37,-76, 66,
   80, 45, 84,-28,  4, -4, 20, 12, 20, 28,  4, 12,-12,  4,-28, -4,-12,
-12,  4,-12, 12, 69,-52, 66,
   80,  5, 68, 52,  4,-44,  4,  5, 28, 52,  4,-44,  4, 69,-84, 66,
   80, 29, 52,  4,  4,  5, 20,  4, 20, 28, 12,  4, 20,-20, 12,-20, -4,
 69,-100, 66,
   80, 37, 52,-12,  4,-12, 20,  4, 36, 20, 20, 20,  4, 20,-12,  4,-20,
 -4,-12, -4, 44,-12, -4,  4,-20, 20,  4, 37,-60, 66,
   80, 13, 68, 36,  4,-28,  4, -3,-12, 28, 68, 28,-60,-20, 68,-20,-60,
 69,-44, 66,
   80, 37, 52,-28,  4,  4, 68, 36,  4, 20,-12,-12,-12,-28,  4, 36,  4,
 20,-12,-12,-12,-28,  4,  4, 68, 36,  4, 37,-108, 66,
   80,  5, 60,  4, 52,  4,-44, 28, -4, 28, 12,  5, 52,-20, 12,-20, -4,
 69,-100, 66,
   80,  5,116,  4,-60, 36,  4, 20, 20,  4, 36,-12, 20,-28,  4,  4,-60,
 69,-44, 66,
   80,  5, 84, 44,  4,-36,  4,  5,-28,  4, 68, 52,  4,-44,  4,  4,-60,
 52,  4,-44,  4, 69,-44, 66,
   80,  5, 84, 44,  4,-36,  4,  5,-28,  4, 68, 52,  4,-44,  4,  4,-60,
 69,-44, 66,
   80, 37, 84, 20,  4,  4,-20,-20, -4,-20, 12,  4, 52,  4,-44,  5, 52,
 28, 12, 28, -4, 21,-100, 66,
   80, 53, 52,  4, 68,  4,-60,  5, 36,-44,  4, 52,  4,-43, 36,  4,-60,
  4, 68, 69,-108, 66,
   80, 13, 52, 36,  4,-11,  4,  4, 68,  4,-60,-11, 68, 36,  4, 29,-108,
 66,
   80,  5, 68, 12,-12, 28,  4, 12, 20,  4, 52,  4,-44, 29,-60, 66,
   80, 53, 52,-28, 36, 36,-28, -3, 68,-36,-36, 44, 44,-35,  4,  4,-60,
  4, 68, 69,-108, 66,
   80,  5, 52,  4, 68,  4,-60, 44,  4,-36,  4, 69,-44, 66,
   80,  5,116, 28,-44, 28, 52,  4,-60,  4, 68,-20,-44,-20, 52,  4,-60,
  4, 68, 69,-108, 66,
   80,  5, 52,  4, 68, 52,-60,  4, 68,  4,-60,-44, 68,  4,-60, 69,-44,
 66,
   80, 53, 60,  4, 52,  4,-44,-20, -4,-20, 12,  4, 52,  4,-44,  5, 52,
```

```
FCHQUICK.WORK.PD8510            THU, DEC 22, 1983, 10:27 AM     PAGE   2

 28, 12, 28, -4, 21,-100, 66,
   80,  5,116,  4,-60,  4, 68, 44,  4, 12,-12, -4,-12,-36,  4, 69,-76,
 66,
   80,  5, 60,  4, 52,  4,-44, 28, -4, 28, 12,  4, 52,-20, 12,-20, -4,
 53,-44,  4, 52,-19,-28, 28,-28, 21,-36, 66,
   80, 45,116,-36,  4,  4,-60,  4, 68, 44,  4, 12,-12, -4,-12,-36,  4,
 36,  4, 20,-28, 21,-44, 66,
   80, 53,108,-20, 12,-20, -4, .4,-12, 36, -4, 20, -4,  4,-12,-20, -4,
-20, 12, 69,-52, 66,
   80,  5,116, 52,  4,-44,  4, 29,  4,  4,-60,  4, 68, 45,-108, 66,
   80,  5, 60,  4, 60,  4,-52, 28, -4, 28, 12,  4, 60,  4,-52, 21,-52,
 66,
   80, 29, 52,-20, 68, 28,-60, 28, 68,-20,-60, 45,-44, 66,
   80,  5,116, 12,-60, 20, 52, 20,-44, 12, 68, -4,-60,-12, 52,-12,-44,
 -4, 68, 69,-108, 66,
   80,  5, 52, 52, 68,-44,-60,  5, 68, 52,-60,-44, 68, 69,-108, 66,
   80,  5,116, 28,-28, 28, 36,-20,-28,  4,-28,  4, 36,-20, 36, 69,-108,
 66,
   80,  5,116, 52,  4,-44,-60, 52,  4,-44,  4, 52, 68,-44,  4, 69,-108,
 66,
```

```
SCHQUICK.WORK.PD8510           THU, DEC 22, 1983, 10:27 AM      PAGE   1

{$L-}
PROGRAM chquick(input,output);

{ The 'quick' format is a compact and abbreviated character set for
  use in the monitor. }

{
DOCUMENTATION FOR THE 'quick' CHARACTER FORMAT


Display Generator Data:

a3 a2 a1 a0    b3 b2 b1 b0    c3 c2 c1 c0    d3 d2 d1 d0

    for characters, a3 = 0
                     d2 = d1 = d0 = 0
    IF a2=1 {LDXY -- char's only}
                     b3 = b2 = b1 = b0 = sign of least-significant byte
    IF a2=0 {LDA or RTS}
                     c3 = c2 = c1 = c0 = d3 = d2 = d1 = d0 = 0

'quick' Format:

IF a2=1 THEN
      {LDXY}                c3 c2 c1 c0    d3 a2 a1 a0
IF a2=0 THEN
      {LDA or RTS}          b3 b2 b1 b0    d3 d2 d1 d0

TO UNPACK FROM 'quick' FORMAT TO DISPLAY GENERATOR DATA,

      temp := packed[i];                           & sign extend &
      unpacked[i] := LEFT( (temp AND 7), 12) +
                       ( IF TBIT(temp,2) THEN (temp AND %OFF8 )
                         ELSE  LEFT( (temp AND %FO), 4) );

   NOTE:  The initial assignement to 'temp' performs a sign extension
          of the byte data in addition to setting up an intermediate
          variable.

   packed[ ]    is a byte array containing the packed 'quick' data.
   unpacked[ ]  is an integer destination array for the unpacked data.
}

VAR
   i,command,data,j,cnt : integer;
   input : FILE OF integer;

BEGIN {chargen}
   cnt := 2;
   writeln;
   write('  ');
   read(j);
   WHILE NOT eof(input) DO
      BEGIN {while}
```

```
FCHTAB2.WORK.PD8510           THU, DEC 22, 1983, 10:27 AM      PAGE   1


INTEGER PROCEDURE  ch_integer(element, ch);
   VALUE    element, ch;
   INTEGER element, ch;                                        EXTERNAL;
REAL PROCEDURE  ch_real(element, ch);
   VALUE    element, ch;
   INTEGER element, ch;                                        EXTERNAL;
QUAD PROCEDURE  ch_quad(element, ch);
   VALUE    element, ch;
   INTEGER element, ch;                                        EXTERNAL;
DOUBLE PROCEDURE  ch_double(element, ch);
   VALUE    element, ch;
   INTEGER element, ch;                                        EXTERNAL;
```

```
SCHQUICK.WORK.PD8510           THU, DEC 22, 1983, 10:27 AM      PAGE   2

         i := j;
         IF i < 0 THEN
            writeln('*** Illegal character set value ***');
         IF (i MOD 8) <> 0 THEN
            writeln('*** (i MOD 16) <> 0 ***');
         command := i DIV 4096;
         i := i MOD 4096;
         IF commaod < 4 THEN
            i := i DIV 16;
         IF command > 7 THEN
            writeln('ERROR');
         data := i + command;
         data := data MOD 256;
         IF data > 127 THEN
            data := data - 256;
         write(data:3,',');
         cnt := cnt+4;
         IF ((j=9216) OR (cnt > 68)) THEN
            BEGIN {if}
            writeln;
            cnt := 0;
            END; {if}
         IF j = 9216 THEN
            BEGIN {if}
            write('  ');
            cnt := 2;
            END; {if}
         read(j);
      END; {while}
END. {chargen}
```

```
FCHTAB3.WORK.PD8510           THU, DEC 22, 1983, 10:27 AM      PAGE   1

EXTERNAL INTEGER current_acquisition_ch;

INTEGER PROCEDURE  acquisition_ch_integer(element);
   VALUE    element;
   INTEGER element;                                            EXTERNAL;
REAL PROCEDURE  acquisition_ch_real(element);
   VALUE    element;
   INTEGER element;                                            EXTERNAL;
QUAD PROCEDURE  acquisition_ch_quad(element);
   VALUE    element;
   INTEGER element;                                            EXTERNAL;
DOUBLE PROCEDURE  acquisition_ch_double(element);
   VALUE    element;
   INTEGER element;                                            EXTERNAL;
PROCEDURE partial_select_entry_ch(new_channel);
   VALUE    new_channel;
   INTEGER new_channel;                                        EXTERNAL;
PROCEDURE select_entry_ch(new_channel);
   VALUE    new_channel;
   INTEGER new_channel;                                        EXTERNAL;
PROCEDURE select_acquisition_ch(new_channel);
   VALUE    new_channel;
   INTEGER new_channel;                                        EXTERNAL;
PROCEDURE  select_coupled(coupled, element, element_size);
   VALUE    coupled, element, element_size;
   INTEGER element, element_size;
   BOOLEAN coupled;                                            EXTERNAL;
BOOLEAN PROCEDURE coupled_ch (element);
  VALUE element; INTEGER element;                              EXTERNAL;
SUBROUTINE init_ch_table;                                      EXTERNAL;
```

```
CCHTABLE.WORK.PD8510          THU, DEC 22, 1983, 10:27 AM     PAGE   1

COMMENT
****************************************************************************
*
* CHANNEL DESCRIPTOR
*
****************************************************************************
;
#FILE cchconst.work;        & constant values for Ch 1, Ch 2, and no Ch &

COMMENT
These integer constants are the byte offsets for each channel parameter
into the ch_table.

When adding a new element to the channel table, insert the element where
appropriate (i.e. calibration saves, save/recall) as indicated by the
comments seperating groups of constants.  Assign the value of the
element with the preceding element constant plus the preceding element's
byte size (use constants qsz,dsz,rsz,etc.), then change the value of the
following element to that of the new element plus the new element's byte
size:
'
                  :
                  :
           element_n  := element_m0 + qsz,   { element_m0 = qsz bytes }
           element_new:= element_n + isz,    { element_n = isz bytes }
           element_nn := element_new + bsz,  { element_new= bsz bytes }
              etc.
The byte size of each element will be commented to the left of it.
The insertion of a new element constant must correspond to the byte
offset of its new entry into the ch_table.

The byte size constants, qsz..bsz, represent 2 sets of each element
data type (1 for each channel) and an boolean to indicate whether the
element is coupled or uncoupled.
This boolean occurs before each set of elements in the ch_table.

Constant declarations used to specify data acquisition control are
contained in the file FYADC.  Those for data processing control are
contained in the file FDATAP.
;
INTEGER CONSTANT  qsz := 18,                  & 2 quads + 1 boolean    &
                  dsz := 10,                  & 2 doubles + 1 boolean  &
                  rsz := 10,                  & 2 reals + 1 boolean    &
                  u3sz:= 14,                  & 2 user3s + 1 boolean   &
                  isz := 6,                   & 2 integers + 1 boolean &
& taboo &       & bsz := 4,  &                & 2 bytes + 1 boolean    &
                  quadsz := 8,                              & 8 bytes &
                  realsz := 4,                              & 4 bytes &
                  intsz  := 2;                              & 2 bytes &
```

```
CCHTABLE.WORK.PD8510          THU, DEC 22, 1983, 10:27 AM     PAGE   3

 & integer &    ch_trace_math          := ch_d_state + isz,
 & integer &    ch_stimulus_mode       := ch_trace_math + isz,
 & real    &    ch_atten_port1         := ch_stimulus_mode + isz,
 & real    &    ch_atten_port2         := ch_atten_port1 + rsz,
 & integer &    ch_xadc_gain           := ch_atten_port2 + rsz,
 & real    &    ch_phase_offset        := ch_xadc_gain + isz,
 & real    &    ch_magnitude_slope     := ch_phase_offset + rsz,
 & real    &    ch_magnitude_offset    := ch_magnitude_slope + rsz,
 & real    &    ch_stimulus_slope      := ch_magnitude_offset + rsz,
 & quad    &    ch_stimulus_offset     := ch_stimulus_slope + rsz,
 & real    &    ch_ref_plane_1         := ch_stimulus_offset + qsz,
 & real    &    ch_ref_plane_2         := ch_ref_plane_1 + rsz,
 & real    &    ch_system_z0           := ch_ref_plane_2 + rsz,

                & non-save/recall indices &

 & integer &    ch_basis_s_param       := ch_system_z0 + rsz,
 & integer &    ch_refl_trans          := ch_basis_s_param + isz,
 & integer &    ch_param_conversion    := ch_refl_trans + isz,
 & integer &    ch_format              := ch_param_conversion + isz,
 & real    &    ch_scale               := ch_format + isz,
 & real    &    ch_ref_value           := ch_scale + rsz,
 & real    &    ch_ref_position        := ch_ref_value + rsz,
 & real    &    ch_elec_delay          := ch_ref_position + rsz,
 & quad    &    ch_start_stimulus      := ch_elec_delay + rsz,
 & quad    &    ch_stop_stimulus       := ch_start_stimulus + qsz,
 & quad    &    ch_center_stimulus     := ch_stop_stimulus + qsz,
 & quad    &    ch_span_stimulus       := ch_center_stimulus + qsz,
 & double  &    ch_raw11_base          := ch_span_stimulus + qsz,
 & double  &    ch_raw21_base          := ch_raw11_base + dsz,
 & double  &    ch_raw12_base          := ch_raw21_base + dsz,
 & double  &    ch_raw22_base          := ch_raw12_base + dsz,
 & double  &    ch_d_base              := ch_raw22_base + dsz,
 & double  &    ch_f_base              := ch_d_base + dsz,
 & double  &    ch_m_base              := ch_f_base + dsz,
 & double  &    ch_trace_base          := ch_m_base + dsz,
 & double  &    ch_m_trace_base        := ch_trace_base + dsz,
 & double  &    ch_e_coeff_base        := ch_m_trace_base + dsz,
 & integer &    ch_finished_signal     := ch_e_coeff_base + dsz,
 & quad    &    ch_gate_stop           := ch_finished_signal + isz,
 & integer &    ch_channel_no          := ch_gate_stop + qsz,

                & table size &

                max_ch                 := 2,   & CHANGE ALSO IN fpfr &
                                               & AND schds           &
                ch_save_size           := ch_system_z0 + rsz,
                ch_table_size          := ch_channel_no + isz;
```

```
CCHTABLE.WORK.PD8510          THU, DEC 22, 1983, 10:27 AM     PAGE   2

#EJECT;
INTEGER CONSTANT  ch_table_base          := 0,

                  & array header integer indices &

 & quad    &      hd_start_frequency     := 0,
 & quad    &      hd_center_frequency    := 4,
 & real    &      hd_sweep_time          := 8,
 & real    &      hd_source_power        := 10,
 & integer &      hd_param_bitmap        := 12,
 & integer &      hd_step_size           := 13,
 & integer &      hd_array_type          := 14,
 & real    &      hd_power_slope         := 15,
 & integer &      hd_power_slope_mode    := 17,
                  hd_header_size         := 32,  & words rounded up to &
                                                 & a 32-word multiple. &

                  & save/recall chtable indices &

 & beginning of coupled stimulus group &
 &  changes affect select_coupled, couple_stimulus, uncouple_stimulus &
 & quad    &      ch_start_frequency     := ch_table_base,
 & quad    &      ch_center_frequency    := ch_start_frequency + qsz,
 & quad    &      ch_start_aux_out       := ch_center_frequency + qsz,
 & quad    &      ch_center_aux_out      := ch_start_aux_out + qsz,
 & quad    &      ch_start_time          := ch_center_aux_out + qsz,
 & quad    &      ch_center_time         := ch_start_time + qsz,
 & quad    &      ch_gate_start          := ch_center_time + qsz,
 & quad    &      ch_gate_center         := ch_gate_start + qsz,
 & real    &      ch_sweep_time          := ch_gate_center + qsz,
 & real    &      ch_source_power        := ch_sweep_time + rsz,
 & real    &      ch_power_slope         := ch_source_power + rsz,
 & integer &      ch_power_slope_mode    := ch_power_slope + rsz,
 & end of coupled stimulus group &

 & integer &      ch_domain              := ch_power_slope_mode + isz,
 & integer &      ch_gating              := ch_domain + isz,
 & integer &      ch_gate_window         := ch_gating + isz,
 & integer &      ch_time_window         := ch_gate_window + isz,
 & integer &      ch_tdr_stimulus_type   := ch_time_window + isz,
 & integer &      ch_param               := ch_tdr_stimulus_type + isz,
 & quad    &      ch_marker1             := ch_param + isz,
 & quad    &      ch_marker2             := ch_marker1 + qsz,
 & quad    &      ch_marker3             := ch_marker2 + qsz,
 & quad    &      ch_marker4             := ch_marker3 + qsz,
 & quad    &      ch_marker5             := ch_marker4 + qsz,
 & integer &      ch_average_factor      := ch_marker5 + qsz,
 & integer &      ch_average_mode        := ch_average_factor + isz,
 & integer &      ch_correction_type     := ch_average_mode + isz,
 & integer &      ch_correction_mode     := ch_correction_type + isz,
 & integer &      ch_math_op             := ch_correction_mode + isz,
 & integer &      ch_mem_nmbr            := ch_math_op + isz,
 & real    &      ch_smoothing_aperture  := ch_mem_nmbr + isz,
 & integer &      ch_smoothing_mode      := ch_smoothing_aperture + rsz,
 & integer &      ch_m_state             := ch_smoothing_mode + isz,
 & integer &      ch_d_state             := ch_m_state + isz,
```

```
DCHTABLE.WORK.PD8510          THU, DEC 22, 1983, 10:27 AM     PAGE   1

   n   nH   description

   0 0000 = hd_start_frequency
   4 0004 = hd_center_frequency
   8 0008 = hd_sweep_time
  10 000A = hd_source_power
  12 000C = hd_param_bitmap
  13 000D = hd_step_size
  14 000E = hd_array_type
  15 000F = hd_power_slope
  17 0011 = hd_power_slope_mode
  32 0020 = hd_header_size
   0 0000 = ch_start_frequency
  18 0012 = ch_center_frequency
  36 0024 = ch_start_aux_out
  54 0036 = ch_center_aux_out
  72 0048 = ch_start_time
  90 005A = ch_center_time
 108 006C = ch_gate_start
 126 007E = ch_gate_center
 144 0090 = ch_sweep_time
 154 009A = ch_source_power
 164 00A4 = ch_power_slope
 174 00AE = ch_power_slope_mode
 180 00B4 = ch_domain
 186 00BA = ch_gating
 192 00C0 = ch_gate_window
 198 00C6 = ch_time_window
 204 00CC = ch_tdr_stimulus_type
 210 00D2 = ch_param
 216 00D8 = ch_marker1
 234 00EA = ch_marker2
 252 00FC = ch_marker3
 270 010E = ch_marker4
 288 0120 = ch_marker5
 306 0132 = ch_average_factor
 312 0138 = ch_average_mode
 318 013E = ch_correction_type
 324 0144 = ch_correction_mode
 330 014A = ch_math_op
 336 0150 = ch_mem_nmbr
 342 0156 = ch_smoothing_aperture
 352 0160 = ch_smoothing_mode
 358 0166 = ch_m_state
 364 016C = ch_d_state
 370 0172 = ch_trace_math
 376 0178 = ch_stimulus_mode
 382 017E = ch_atten_port1
 392 0188 = ch_atten_port2
 402 0192 = ch_xadc_gain
 408 0198 = ch_phase_offset
 418 01A2 = ch_magnitude_slope
 428 01AC = ch_magnitude_offset
 438 01B6 = ch_stimulus_slope
 448 01C0 = ch_stimulus_offset
```

```
DCHTABLE.WORK.PD8510          THU, DEC 22, 1983, 10:27 AM     PAGE  2

  466 01D2 = ch_ref_plane_1
  476 01DC = ch_ref_plane_2
  486 01E6 = ch_system_z0
  496 01F0 = ch_basis_s_param
  502 01F6 = ch_refl_trans
  508 01FC = ch_param_conversion
  514 0202 = ch_format
  520 0208 = ch_scale
  530 0212 = ch_ref_value
  540 021C = ch_ref_position
  550 0226 = ch_elec_delay
  560 0230 = ch_start_stimulus
  578 0242 = ch_stop_stimulus
  596 0254 = ch_center_stimulus
  614 0266 = ch_span_stimulus
  632 0278 = ch_raw11_base
  642 0282 = ch_raw21_base
  652 028C = ch_raw12_base
  662 0296 = ch_raw22_base
  672 02A0 = ch_d_base
  682 02AA = ch_f_base
  692 02B4 = ch_m_base
  702 02BE = ch_trace_base
  712 02C8 = ch_m_trace_base
  722 02D2 = ch_e_coeff_base
  732 02DC = ch_finished_signal
  738 02E2 = ch_gate_stop
  756 02F4 = ch_channel_no
    2 0002 = max_ch
  496 01F0 = ch_save_size
  762 02FA = ch_table_size
```

```
JCHTABLE.WORK.PD8510          THU, DEC 22, 1983, 10:28 AM     PAGE  1

!job chtable,librn.pd8510,work;outclass=,1
!continue
!purge ychtable
!build ychtable;rec=-1276,,v,ascii
!ed
e cchtable.work
f xchtable
1,/ch_table_base/d
v/:=/d
1,$s/\&[^\&]*\& *//
1,$s/^  *//
g/^ *$/d
1,$s/[^A-Z^a-z^0-9^_].*$//
1,$s/$/,/
$s/,/;/
0a
M68KL,P BEGIN
#FILE cchtable.work;
#LIST;
INTEGER TABLE ychtable :=
.
$a
END$
.
wq xchtable
!com68k xchtable,,ychtable
!ed
e ychtable
)u uchtable.work
wq xchtable
!purge dchtable
!build dchtable;rec=-1276,,v,ascii;nocctl
!file input=xchtable
!file output=dchtable,old
!run pchtablp.work
!purge xchtable
!purge ychtable
!ed
e dchtable
wq
!tell librn.pd8510; ============== jchtable done ===================
!tell ucc.pd8510; =============== jchtable done ===================
!eoj
```

```
FCHTABLE.WORK.PD8510          THU, DEC 22, 1983, 10:28 AM     PAGE  1

EXTERNAL INTEGER current_entry_ch;
EXTERNAL INTEGER save_size;
EXTERNAL INTEGER last_state_size;
EXTERNAL INTEGER dump_size;

INTEGER PROCEDURE  entry_ch_integer(element);
   VALUE   element;
   INTEGER element;                                              EXTERNAL;
PROCEDURE  set_entry_ch_integer(element_value, element);
   VALUE   element_value, element;
   INTEGER element_value;
   INTEGER element;                                              EXTERNAL;
PROCEDURE  set_ch_integer(element_value, element, channel_no);
   VALUE   element_value, element, channel_no;
   INTEGER element_value;
   INTEGER element, channel_no;                                  EXTERNAL;
PROCEDURE  set_ch_double(element_value, element, channel_no);
   VALUE   element_value, element, channel_no;
   DOUBLE  element_value;
   INTEGER element, channel_no;                                  EXTERNAL;
PROCEDURE  set_ch_real(element_value, element, channel_no);
   VALUE   element_value, element, channel_no;
   REAL    element_value;
   INTEGER element, channel_no;                                  EXTERNAL;
PROCEDURE  set_ch_quad(element_value, element, channel_no);
   VALUE   element_value, element, channel_no;
   QUAD    element_value;
   INTEGER element, channel_no;                                  EXTERNAL;
REAL PROCEDURE  entry_ch_real(element);
   VALUE   element;
   INTEGER element;                                              EXTERNAL;
PROCEDURE  set_entry_ch_real(element_value, element);
   VALUE   element_value, element;
   REAL    element_value;
   INTEGER element;                                              EXTERNAL;
QUAD PROCEDURE  entry_ch_quad(element);
   VALUE   element;
   INTEGER element;                                              EXTERNAL;
PROCEDURE  set_entry_ch_quad(element_value, element);
   VALUE   element_value, element;
   QUAD    element_value;
   INTEGER element;                                              EXTERNAL;
DOUBLE PROCEDURE  entry_ch_double(element);
   VALUE   element;
   INTEGER element;                                              EXTERNAL;
PROCEDURE  set_entry_ch_double(element_value, element);
   VALUE   element_value, element;
   DOUBLE  element_value;
   INTEGER element;                                              EXTERNAL;
```

```
SCHTABLE.WORK.PD8510          THU, DEC 22, 1983, 10:28 AM     PAGE  1

M68KL,P,"chtable"
BEGIN

#FILE ftrace.work;                                            & for partial &
#FILE ftrace2.work;             & for repaint_traces and annotate_math_op &
#FILE cdebug.work;                                                  & DEBUG &
#FILE fterm.work;                                                   & DEBUG &
#FILE fterm2.work;                                                  & DEBUG &
#FILE ccontvar.work;                                    & for max_parameter &
#FILE fcontv2.work;                                           & for rebuild &
#FILE fiocnfig.work;
#FILE cchtable.work;
#FILE fbreak.work;
#FILE factive.work;
#FILE fchdata.work;   & must come after cchtable, fdatap, and fcontvar &
#FILE fchdata2.work;
#FILE fstimuli.work;
#FILE fstimul3.work;                               & for annotate_stimulus &
#FILE fcontrol.work;                       & for abort_sweep, restart_sweep &
#FILE fgratic.work;                               & for trace_and_graticule &
#FILE fkernel.work;
#FILE crins.work;
#FILE ffifo.work;                                          & for write_fifo &
#FILE ffifos.work;                                  & for array_update_fifo &
#FILE carray.work;              & for array_ch_mask and array_update_mask &
#FILE cdatap.work;                                          & for single_ch &
#FILE fdispram.work;
#FILE fmenu.work;


INTEGER CONSTANT  leds_for_ch1_active := %FFFE,
                  leds_for_ch2_active := %FFFD;
BYTE leds = bottom + %6C;

BOOLEAN POINTER coupled;
DOUBLE element_addr;          & offset into specific ch_table record     &

DOUBLE ch_address,            & base address of channel table, ch_table &
       coupled_address,       & base address of channel coupling info.  &
       dump_size_dbl,         & length of instrument state information  &
       save_size_dbl,         & length of save/recall state (bytes)     &
       last_state_dbl;        & length of last save/recall state        &

GLOBAL INTEGER save_size = save_size_dbl+2;
GLOBAL INTEGER last_state_size = last_state_dbl+2;
GLOBAL INTEGER dump_size = dump_size_dbl+2;
GLOBAL INTEGER current_acquisition_ch;
GLOBAL INTEGER current_entry_ch;
```

```
#EJECT;
COMMENT                                              channel descriptor operators
*************************************************************************
*
*************************************************************************
;
INTEGER PROCEDURE  ch_integer(element, ch);
   VALUE   element, ch;
   INTEGER element, ch;                                            ENTRY;
   BEGIN & ch_integer &
      INTEGER POINTER element_ptr;

      STPNTR( element_ptr, ch_address+element);
      ch_integer := element_ptr [ch-1];

   IF ch_debug THEN
   BEGIN
      WSTR("rI");WHEX(element); WHEX(ch); WHEX(element_ptr[ch-1]);
      CRLF;
   END;

   END;  & ch_integer &


REAL PROCEDURE  ch_real(element, ch);
   VALUE   element, ch;
   INTEGER element, ch;                                            ENTRY;
   BEGIN & ch_real &
      REAL POINTER element_ptr;

      STPNTR( element_ptr, ch_address+element);
      ch_real := element_ptr [ch-1];

   IF ch_debug THEN
   BEGIN
      DOUBLE POINTER d:
      STPNTR(d,ch_address+element);
      WSTR("rR"); WHEX(element); WHEX(ch); WHex(d[ch-1],8);
      CRLF;
   END;

   END;  & ch_real &


QUAD PROCEDURE  ch_quad(element, ch);
   VALUE   element, ch;
   INTEGER element, ch;                                            ENTRY;
   BEGIN & ch_quad &
      QUAD POINTER element_ptr;

      STPNTR( element_ptr, ch_address+element);
      ch_quad := element_ptr [ch-1];

   IF ch_debug THEN
```

```
   BEGIN
      QUAD q;
      q := element_ptr[ch-1];
      WSTR("rQ"); WHEX(element); WHEX(ch); WQUAD(q);
      CRLF;
   END;

   END;  & ch_quad &


DOUBLE PROCEDURE  ch_double(element, ch);
   VALUE   element, ch;
   INTEGER element, ch;                                            ENTRY;
   BEGIN & ch_double &
      DOUBLE POINTER element_ptr;

      STPNTR( element_ptr, ch_address+element);
      ch_double := element_ptr [ch-1];

   IF ch_debug THEN
   BEGIN
      WSTR("rD"); WHEX(element); WHEX(ch); WHex(element_ptr[ch-1],8);
      CRLF;
   END;

   END;  & ch_double &
```

```
#EJECT;
COMMENT
*************************************************************************
*
*************************************************************************
;
INTEGER PROCEDURE  acquisition_ch_integer(element);
   VALUE   element;
   INTEGER element;                                                ENTRY;
   BEGIN & acquisition_ch_integer &

      acquisition_ch_integer :=
        ch_integer (element, current_acquisition_ch);

   END;  & acquisition_ch_integer &


REAL PROCEDURE  acquisition_ch_real(element);
   VALUE   element;
   INTEGER element;                                                ENTRY;
   BEGIN & acquisition_ch_real &

      acquisition_ch_real :=
        ch_real (element, current_acquisition_ch);

   END;  & acquisition_ch_real &


QUAD PROCEDURE  acquisition_ch_quad(element);
   VALUE   element;
   INTEGER element;                                                ENTRY;
   BEGIN & acquisition_ch_quad &

      acquisition_ch_quad :=
        ch_quad (element, current_acquisition_ch);

   END;  & acquisition_ch_quad &


DOUBLE PROCEDURE  acquisition_ch_double(element);
   VALUE   element;
   INTEGER element;                                                ENTRY;
   BEGIN & acquisition_ch_double &

      acquisition_ch_double :=
        ch_double (element, current_acquisition_ch);

   END;  & acquisition_ch_double &
```

```
#EJECT;
COMMENT
*************************************************************************
*
*************************************************************************
;
INTEGER PROCEDURE  entry_ch_integer(element);
   VALUE   element;
   INTEGER element;                                                ENTRY;
   BEGIN & entry_ch_integer &

      entry_ch_integer :=
        ch_integer (element, current_entry_ch);

   END;  & entry_ch_integer &


REAL PROCEDURE  entry_ch_real(element);
   VALUE   element;
   INTEGER element;                                                ENTRY;
   BEGIN & entry_ch_real &

      entry_ch_real :=
        ch_real (element, current_entry_ch);

   END;  & entry_ch_real &


QUAD PROCEDURE  entry_ch_quad(element);
   VALUE   element;
   INTEGER element;                                                ENTRY;
   BEGIN & entry_ch_quad &

      entry_ch_quad :=
        ch_quad (element, current_entry_ch);

   END;  & entry_ch_quad &


DOUBLE PROCEDURE  entry_ch_double(element);
   VALUE   element;
   INTEGER element;                                                ENTRY;
   BEGIN & entry_ch_double &

      entry_ch_double :=
        ch_double (element, current_entry_ch);

   END;  & entry_ch_double &
```

```
#EJECT;
COMMENT
************************************************************************
*
************************************************************************
;
PROCEDURE set_ch_ptrs (element);
  VALUE element;  INTEGER element;
BEGIN
  element_addr := ch_address+element;
  STPNTR (coupled, coupled_address+element);
  IF ch_debug THEN
    BEGIN
      WHEX(element); WHex(element_addr,8);
      IF coupled THEN WSTR(" c") ELSE WSTR(" u"); CRLF;
    END;
END set_ch_ptrs;
```

```
#EJECT;
PROCEDURE  set_ch_integer (element_value, element, channel_no);
   VALUE   element_value, element, channel_no;
   INTEGER element_value, element, channel_no;                          ENTRY;
   BEGIN & set_entry_ch_integer &

      SUBROUTINE set_value;
        element_addr := wrt_disp_int (element_addr,element_value);

      IF ch_debug THEN
      BEGIN
        WSTR("I"); WHEX(channel_no); WHEX(element_value);
      END;

      set_ch_ptrs (element);

      IF coupled THEN
        BEGIN
          set_value;
          set_value;
        END
      ELSE
      IF channel_no = ch1 THEN
        set_value
      ELSE
        wrt_disp_int (element_addr+2, element_value);
   END;  & set_ch_integer &


PROCEDURE  set_ch_double (element_value, element, channel_no);
   VALUE   element_value, element, channel_no;
   DOUBLE  element_value;
   INTEGER element, channel_no;                                         ENTRY;
   BEGIN

      SUBROUTINE set_value;
        element_addr := wrt_disp_dbl (element_addr, element_value);

      IF ch_debug THEN
      BEGIN
        WSTR("D/R"); WHEX(channel_no); WHex(element_value,8);
      END;

      set_ch_ptrs (element);

      IF coupled THEN
        BEGIN
          set_value;
          set_value;
        END
      ELSE
        IF channel_no = ch1 THEN
          set_value
        ELSE
          wrt_disp_dbl (element_addr+4, element_value);
   END; & set_ch_double &
```

```
PROCEDURE set_ch_real (element_value, element, channel_no);
   VALUE element_value, element, channel_no;
   REAL element_value;
   INTEGER element, channel_no;                                         ENTRY;
BEGIN
   DOUBLE double_ch_value = element_value;
   set_ch_double (double_ch_value, element, channel_no);
END set_ch_real;

PROCEDURE  set_entry_ch_integer (element_value, element);
   VALUE   element_value, element;
   INTEGER element_value, element;                                      ENTRY;
BEGIN
  set_ch_integer (element_value, element, current_entry_ch);
END set_entry_ch_integer;


PROCEDURE  set_entry_ch_double(element_value, element);
   VALUE   element_value, element;
   DOUBLE  element_value;
   INTEGER element;                                                     ENTRY;
BEGIN & set_entry_ch_double &
   set_ch_double (element_value, element, current_entry_ch);
END;  & set_entry_ch_double &


PROCEDURE  set_ch_quad(element_value, element, channel_no);
   VALUE   element_value, element, channel_no;
   QUAD    element_value;
   INTEGER element, channel_no;                                         ENTRY;
   BEGIN & set_entry_ch_quad &

      SUBROUTINE set_value;
        element_addr := wrt_disp_quad (element_addr, element_value);

      IF ch_debug THEN
      BEGIN
        WSTR("Q"); WHEX(channel_no); WQUAD(element_value);
      END;

      set_ch_ptrs (element);

      IF coupled THEN
        BEGIN
          set_value;
          set_value;
        END
      ELSE
        IF channel_no = ch1 THEN
          set_value
        ELSE
```

```
          wrt_disp_quad (element_addr+8, element_value);
   END;  & set_ch_quad &


PROCEDURE  set_entry_ch_quad(element_value, element);
   VALUE   element_value, element;
   QUAD    element_value;
   INTEGER element;                                                     ENTRY;
   BEGIN & set_entry_ch_quad &
     set_ch_quad (element_value, element, current_entry_ch);
   END;  & set_entry_ch_quad &


PROCEDURE  set_entry_ch_real(element_value, element);
   VALUE   element_value, element;
   REAL    element_value;
   INTEGER element;                                                     ENTRY;
   BEGIN & set_entry_ch_real &
      DOUBLE double_ch_value = element_value;
      set_ch_double (double_ch_value, element, current_entry_ch);
   END;  & set_entry_ch_real &
```

```
$EJECT;
COMMENT                                                           select_coupled
************************************************************************
*
* EXTERNAL SPECIFICATION FOR select_coupled
*
* FUNCTION
*    To perform all of the operations involved in selecting
* functions to be coupled or uncoupled between channels.
*
* PARAMETER DESCRIPTION:
*
*    INPUT:  none
*
*    OUTPUT: none
*
* EXTERNAL EFFECTS:
*
* COMMENTS:
*
************************************************************************
*
* LOGIC INFORMATION FOR select_coupled
*
* INITIAL REFINEMENT:
*
************************************************************************
;
PROCEDURE  select_coupled(coupled, element, element_size);
   VALUE   coupled, element, element_size;
   BOOLEAN coupled;
   INTEGER element, element_size;                              ENTRY;
   BEGIN & select_coupled &
      BOOLEAN POINTER coupled_info;
      INTEGER current_ch;

      current_ch := current_entry_ch;
      STPNTR (coupled_info, coupled_address+element);
      IF (coupled_info := coupled) THEN
        IF element_size = qsz THEN
          set_entry_ch_quad
          (ch_quad(element,current_ch), element)
        ELSE
        IF element_size = dsz THEN
          set_entry_ch_double
          (ch_double(element,current_ch), element)
        ELSE
        IF element_size = isz THEN
          set_entry_ch_integer
          (ch_integer(element,current_ch), element);

   IF ch_debug THEN
   BEGIN
      WSTR("select_coupled:");
      IF coupled THEN WHEX(current_ch) ELSE WSTR(" uncoupled ");
      WHEX(element); CRLF;
```

```
   END;

   END; & select_coupled &
```

```
$EJECT;
BOOLEAN PROCEDURE coupled_ch (element);
  VALUE element; INTEGER element;                              ENTRY;
BEGIN
  BOOLEAN POINTER coupled;
  STPNTR (coupled, coupled_address+element);
  coupled_ch := coupled;
END coupled_ch;
```

```
$EJECT;
COMMENT                                                         select_entry_ch
************************************************************************
*
************************************************************************
;
PROCEDURE partial_select_entry_ch(new_channel);
   VALUE   new_channel;
   INTEGER new_channel;                                        ENTRY;
   BEGIN & partial_select_entry_ch & current_entry_ch := new_channel;

update_start_stop_center_span;

END;  & partial_select_entry_ch &

PROCEDURE select_entry_ch(new_channel);
   VALUE   new_channel;
   INTEGER new_channel;                                        ENTRY;
   BEGIN & select_entry_ch &

IF new_channel <> current_entry_ch THEN
         BEGIN & if &

IF NOT coupled_ch(ch_start_frequency) THEN
            get_frequency(FALSE);        & before changing entry ch & partial_select_entry_ch( new_channel );
         highlight_menu;

IF new_channel = 1 THEN
            leds := leds_for_ch1_active
         ELSE
            leds := leds_for_ch2_active;

annotate_stimulus;
         annotate_math_op;

select_active_function(active_previous);
               & update active function entry display and clear any &
               & partial entry.                                      &
         IF trace_mode = single_ch THEN
            BEGIN & if &
               abort_sweep;
               acquire( control_variables );
               rebuild := TRUE;
               trace_and_graticule;
               release( control_variables );
               repaint_traces;              & also restarts sweep &
            END; & if & break_entry_control( current_entry_ch );
                     & tell break which is the current_entry_ch &
```

```
SCHTABLE.WORK.PD8510          THU, DEC 22, 1983, 10:28 AM     PAGE  14

      END;  & if &

   IF ch_debug THEN
   BEGIN
      WSTR("entry ch"); WHEX(new_channel); CRLF;
   END;

   END select_entry_ch;
```

```
SCHTABLE.WORK.PD8510          THU, DEC 22, 1983, 10:28 AM     PAGE  15

EJECT;
COMMENT                                                    select_acquisition_ch
*****************************************************************************
*
*****************************************************************************
;
PROCEDURE select_acquisition_ch(new_channel);
   VALUE   new_channel;
   INTEGER new_channel;                                               ENTRY;
   BEGIN & select_acquisition_ch &

IF new_channel <> current_acquisition_ch THEN
         BEGIN & if & current_acquisition_ch := new_channel;
            break_acq_control;    & uses current_acquisition_ch global &

COMMENT also change all other channel-related functions;

END if;

IF ch_debug THEN
   BEGIN
      WSTR("acquis ch"); WHEX(new_channel); CRLF;
   END;

END select_acquisition_ch;
```

```
SCHTABLE.WORK.PD8510          THU, DEC 22, 1983, 10:28 AM     PAGE  16

#EJECT;
COMMENT                                                    init_ch_table
*****************************************************************************
*
*****************************************************************************
;
SUBROUTINE init_ch_table;                                            ENTRY;
   BEGIN & init_ch_table &

      coupled_address := ADRS(ch_table);
      ch_address := coupled_address+2;
      dump_size_dbl := ADRS(max_dump)-ADRS(min_save);
      save_size_dbl := ADRS(max_save)-ADRS(min_save);
      last_state_dbl := ADRS(max_save)-ADRS(last_state);

      current_acquisition_ch := no_ch; & precede select_acquisition_ch &
      current_entry_ch := no_ch;       & precede select_entry_ch       &

   IF ch_debug THEN
   BEGIN
      WSTR("INIT_CH_TABLE: size ="); WHEX(ch_table_size); CRLF;
      WSTR("coupled"); WHex(coupled_address,8); CRLF;
      WSTR("channel"); WHex(ch_address,8); CRLF;
   END;

   END;  & init_ch_table &


END$
```

```
UCHTABLE.WORK.PD8510          THU, DEC 22, 1983, 10:28 AM     PAGE   1

1
1,/ DEC /-2d
$
? DEC ?
+
.,$d
1,$s/^ *[0-9]* *//
1,$s/^.* DEC /DEC /
1,$s/^ *//
1,$s/[,:]//
g/DEC /.-1,.j
1,$s/ *DEC */ =    /
1,$s/ *$//
1,$s/^\([^ ]*\).*\([ 0-9]{5,5}\)$/\2 = \1/
```

```
SCHTABLP.WORK.PD8510                THU, DEC 22, 1983, 10:28 AM     PAGE   1

$LIST OFF$
$USLINIT$
PROGRAM chtable_constants( input, output );

{ converts a number (including leading blanks) in the first 5 characters
  of a line to four numbers -- n, 2*n, hex(n), hex(2*n) -- and outputs
  the expanded line.
}

CONST
   hex_chars  = '0123456789ABCDEF';
   line_max   = 80;  {maximum length of an input line}
   hex_max    = 4;    {maximum length of a hex string}

TYPE
   line_index = 0..line_max;
   line_type  = STRING[line_max];
   hex_index  = 0..hex_max;
   hex_type   = STRING[hex_max];

VAR
   line_in,
   line_out   : line_type;
   number     : integer;
   dummy      : line_index;

FUNCTION  hex( number:integer ):hex_type;
   VAR
      position : hex_index;
      temp_string : hex_type;
   BEGIN {hex}
      position := hex_max;
      temp_string := strrpt( '0', hex_max );
      WHILE ( (number > 0) AND (position > 0) ) DO
         BEGIN {while}
            temp_string[position] := hex_chars[ 1 + (number MOD 16) ];
            number := number DIV 16;
            position := position - 1;
         END;  {while}
      hex := temp_string;
   END;  {hex}

BEGIN {chtable_constants}

writeln( output, 'n':6, 'nH':5, 'description':14 );
writeln( output );

WHILE NOT eof( input ) DO
   BEGIN {while}

      readln( input, line_in );
      line_in := strrtrim( line_in );

      strread( line_in, 1, dummy, number );
      strdelete( line_in, 1, dummy-1 );
```

```
SCHTABLP.WORK.PD8510                THU, DEC 22, 1983, 10:28 AM     PAGE   2

      write(output, number:6) ;
      write(output, hex(number):5 );
      writeln( output, line_in );

   END;  {while}

END.  {chtable_constants}
```

```
FCIRCLE.WORK.PD8510                 THU, DEC 22, 1983, 10:28 AM     PAGE   1

COMPLEX PROCEDURE packed_sin_cos(angle);
   VALUE   angle;
   REAL    angle;                                           EXTERNAL.L;
REAL PROCEDURE intersect_angle( d, r1, r2 );
   VALUE d, r1, r2;
   REAL  d, r1, r2;                                         EXTERNAL.L;
INTEGER PROCEDURE arc(dg_addr,x0,y0,radius,start,angle,max_r,enhanced);
   VALUE   dg_addr, x0, y0, radius, start, angle, max_r, enhanced;
   BOOLEAN enhanced;
   INTEGER dg_addr;
   DOUBLE  x0, y0;
   REAL    radius, start, angle, max_r;                     EXTERNAL.L;
INTEGER PROCEDURE r_circle( addr, x0, y0, r, max_r, scale );
   VALUE   addr, x0, y0, r, max_r, scale;
   INTEGER addr, x0, y0;
   REAL    r, max_r, scale;                                 EXTERNAL.L;
INTEGER PROCEDURE x_circle( addr, x0, y0, x, max_r, scale );
   VALUE   addr, x0, y0, x, max_r, scale;
   INTEGER addr, x0, y0;
   REAL    x, max_r, scale;                                 EXTERNAL.L;
```

```
SCIRCLE.WORK.PD8510                 THU, DEC 22, 1983, 10:28 AM     PAGE   1

M68KL,P,"circle"
BEGIN

%FILE cdisplay.work;
%FILE fdisplay.work;

REAL PROCEDURE ATAN( x );
   VALUE x;
   REAL  x;                                                 EXTERNAL;
REAL PROCEDURE SIN( x );
   VALUE x;
   REAL  x;                                                 EXTERNAL;
REAL PROCEDURE SQRT( x );
   VALUE x;
   REAL  x;                                                 EXTERNAL;
COMPLEX PROCEDURE fst_trig( angle );
   VALUE   angle;
   DOUBLE  angle;                                           EXTERNAL.L;

EXTERNAL REAL TwoPi,
              Pi,
              Pi2;


REAL CONSTANT aspect_ratio    := 0.8,
              segment_density := 0.013; & 64 segments/800 pixel radius &
```

```
SCIRCLE.WORK.PD8510            THU, DEC 22, 1983, 10:28 AM     PAGE  2

#EJECT;
COMMENT                                                         packed_sin_cos
***********************************************************************
*
* converts angle into a table index, calls table look up and
* interpolation routine, and converts scaled integer result into
* a real cosine in register 0 and sine in register 1.
*
***********************************************************************
;
COMPLEX PROCEDURE packed_sin_cos(angle);
   VALUE  angle;
   REAL   angle;                                              ENTRY;
   BEGIN & packed_sin_cos &
      fst_trig( DOUBLE( angle*4.1721513484 ) );
      ASSEMBLE(
               MOVE.L   R0,  R1;
               SWAP     R0;
               CLR      R0;
               CLR      R1
              );
   END;  & packed_sin_cos &

REAL PROCEDURE acos( x );
   VALUE x;
   REAL  x;
   BEGIN & acos &
      acos := Pi2 - ATAN( x / SQRT(1 - x*x) );
   END;  & acos &
```

```
SCIRCLE.WORK.PD8510            THU, DEC 22, 1983, 10:28 AM     PAGE  3

#EJECT;
COMMENT                                                        intersect_angle
***********************************************************************
*
*  Returns the angle between the line connecting the centers of two
*  circles of radii r1 and r2 and the intersection point of the two
*  circles measured at the center of the circle with radius r1.
*
*  "d" is the distance between the centers of the two circles, and
*  must be positive.
*
***********************************************************************
;
REAL PROCEDURE intersect_angle( d, r1, r2 );
   VALUE d, r1, r2;
   REAL  d, r1, r2;                                            ENTRY;
   BEGIN & intersect_angle &
      d := ABS(d);
      IF (r1 + d) <= r2 THEN
         intersect_angle := Pi  & r1 circles is on or inside r2 circle &
      ELSE
         intersect_angle := acos( (r1*r1 + d*d - r2*r2) / (2.0*r1*d) );
   END;  & intersect_angle &


COMMENT                                                      circles_intersect
***********************************************************************
*
*  Returns TRUE if two circles with radii r1 and r2 with centers
*  spaced d apart intersect, or if the circle with radius r1 is fully
*  contained within the circle with radius r2.
*  Returns FALSE if the circle with radius r1 lies on or totally
*  outside the circle with radius r2.
*
*  "d" is the distance between the centers of the two circles, and
*  must be positive.
*
***********************************************************************
;
BOOLEAN PROCEDURE circles_intersect( d, r1, r2 );
   VALUE d, r1, r2;
   REAL  d, r1, r2;
   BEGIN & circles_intersect &
      d := ABS(d);
      circles_intersect := ( (r2+r1) > d ) AND
                           ( (r2+d) > r1 );
   END;  & circles_intersect &
```

```
SCIRCLE.WORK.PD8510            THU, DEC 22, 1983, 10:28 AM     PAGE  4

#EJECT;
COMMENT                                                                    arc
***********************************************************************
*
*  Enhanced arcs are drawn solid, others are dashed.
*
***********************************************************************
;
INTEGER PROCEDURE arc(addr,x0,y0,radius,start,angle,max_r,enhanced);
   VALUE   addr, x0, y0, radius, start, angle, max_r, enhanced;
   BOOLEAN enhanced;
   INTEGER addr;      & display address &
   DOUBLE  x0,        & x-coordinate of center &
           y0;        & y-coordinate of center &
   REAL    radius,    & radius 0.0 to 1.0 &
           start,     & angle to start the arc (radians) &
           angle,     & angle of arc (radians) &
           max_r;     & display units for 1.0 radius &           ENTRY;
   BEGIN & arc &
      BOOLEAN blank_segment,
              odd;
      INTEGER number_of_segments;
      REAL x, temp_x, y, a, b;

      radius := radius * max_r;

      COMMENT
      & constant error (between arc and chord) algorithm &
      number_of_segments := INTEGER( angle / SQRT( 8.0 / radius ) );

      & constant length (and intensity) segment algorithm &
      number_of_segments := INTEGER( angle * radius * segment_density );

      & adjust number_of_segments to odd/even number &
      IF angle < (0.98*TwoPi) THEN
         odd := TRUE                         & arc:    odd  # segments &
      ELSE
         odd := FALSE;                       & circle: even # segments &
      number_of_segments := ALEFT( ARIGHT(number_of_segments,1), 1 )
                            + (IF odd THEN 1
                                      ELSE 2);

      & packed_sin_cos loads R0 and R1 &
      packed_sin_cos( start );
      ASSEMBLE(
              MOVE.L  R0, a;                          & a = cos()   &
              MOVE.L  R1, b                           & b = sin()   &
              );
      x := radius*a;
      y := radius*b;

      & packed_sin_cos loads R0 and R1 &
      packed_sin_cos( angle/REAL(number_of_segments) );  & chord angle &
      ASSEMBLE(
              MOVE.L  R0, a;                          & a = cos()   &
              MOVE.L  R1, b                           & b = sin()   &
```

```
SCIRCLE.WORK.PD8510            THU, DEC 22, 1983, 10:28 AM     PAGE  5

              );

      addr := move2( addr, x0+DOUBLE(x*aspect_ratio), y0+DOUBLE(y) );
      blank_segment := FALSE;             & first segment is not blanked &
      REPEAT number_of_segments DO
         BEGIN & repeat &
            temp_x := a*x - b*y;            & old x has to be used still &
            y := a*y + b*x;
            x := temp_x;
            IF (blank_segment AND (NOT enhanced)) THEN
               addr := move( addr,
                             x0+DOUBLE(x*aspect_ratio),
                             y0+DOUBLE(y)
                           )
            ELSE & not blank_segment or enhanced &
               addr := draw( addr,
                             x0+DOUBLE(x*aspect_ratio),
                             y0+DOUBLE(y)
                           );
            blank_segment := NOT blank_segment;
         END;  & repeat &

      arc := addr;

   END;  & arc &
```

```
#EJECT;
COMMENT                                                          r_circle
*************************************************************************
*
*************************************************************************
;
INTEGER PROCEDURE r_circle( addr, x0, y0, r, max_r, scale );
   VALUE   addr, x0, y0, r, max_r, scale;
   INTEGER addr, x0, y0;
   REAL    r, max_r, scale;                                   ENTRY;
   BEGIN & r_circle &
      BOOLEAN enhance;
      INTEGER i,
              j;
      REAL    a,
              d,
              start,
              angle,
              radius;

      radius := 1.0/(1.0 + r);
      d      := 1.0 - radius;

      IF scale > 1.01 THEN
         j := 2
      ELSE
         j := 1;

      FOR i := 1 UNTIL j DO
         BEGIN & for &

            IF circles_intersect( d, radius, scale ) THEN
               BEGIN & if &
                  a := intersect_angle( d, radius, scale );
                  start := Pi - a;
                  angle := 2 * a;
                  IF ( (r = 0.0) AND (i = 1) ) THEN
                     enhance := TRUE
                  ELSE
                     enhance := FALSE;
                  addr := arc( addr,
                               ( DOUBLE(x0) +
                                 DOUBLE( d *
                                         aspect_ratio *
                                         max_r /
                                         scale
                                       )
                               ),
                               DOUBLE(y0),
                               radius / scale,
                               start,
                               angle,
                               max_r,
                               enhance
                             );
               END;  & if &
```

```
            d := 1.0 + radius;          & for right-half plane circles &
         END;  & for &

      r_circle := addr;

   END;  & r_circle &
```

```
#EJECT;
COMMENT                                                          x_circle
*************************************************************************
*
*************************************************************************
;
INTEGER PROCEDURE x_circle( addr, x0, y0, x, max_r, scale );
   VALUE   addr, x0, y0, x, max_r, scale;
   INTEGER addr, x0, y0;
   REAL    x, max_r, scale;                                   ENTRY;
   BEGIN & x_circle &
      INTEGER temp_integer;
      DOUBLE  x_center,
              y_center;
      REAL    a,
              d,
              start,
              angle,
              phi,
              theta,
              radius,
              scaled_radius,
              y_offset;

      x := ABS(x);
      IF x = 0.0 THEN
         BEGIN & if &
            & horizontal line &
            temp_integer := INTEGER( max_r * aspect_ratio );
            addr := move2( addr, x0-temp_integer, y0 );
            addr := plot( addr, x0+temp_integer, y0, normal, slow );
         END   & if &
      ELSE
         BEGIN & else &
            radius := 1.0 / x;
            scaled_radius := radius / scale;
            phi := Pi2 - ATAN( radius );
            d := 1.0 / SIN(phi);
            x_center := DOUBLE(x0);
            y_center := DOUBLE(y0);

            IF circles_intersect( d, radius, scale ) THEN
               BEGIN & if &
                  a := intersect_angle( d, radius, scale );
                  start := 3.0*Pi2 - phi - a;
                  angle := 2.0 * a;
                  x_center := x_center +
                              DOUBLE( aspect_ratio * max_r / scale );
                  y_offset := DOUBLE( max_r * scaled_radius );
                  addr := arc( addr,
                               x_center,
                               y_center + y_offset,
                               scaled_radius,
                               start,
                               angle,
                               max_r,
```

```
                               FALSE
                             );
                  start := Pi2 + phi - a;
                  addr := arc( addr,
                               x_center,
                               y_center - y_offset,
                               scaled_radius,
                               start,
                               angle,
                               max_r,
                               FALSE
                             );
               END;  & if &
         END;  & else &

      x_circle := addr;

   END;  & x_circle &

END$
```

```
INTEGER CONSTANT

cmd_illegal := 335,
cmd_enter := 336,
cmd_u1 := 337,
cmd_u2 := 338,
cmd_u3 := 339,
cmd_u4 := 340,
cmd_mkrval := 341,
cmd_up := 342,
cmd_down := 343,
cmd_entry_off := 344,
cmd_save := 345,
cmd_save_1 := 346,
cmd_save_2 := 347,
cmd_save_3 := 348,
cmd_save_4 := 349,
cmd_save_5 := 350,
cmd_recall := 351,
cmd_recall_1 := 352,
cmd_recall_2 := 353,
cmd_recall_3 := 354,
cmd_recall_4 := 355,
cmd_recall_5 := 356,
cmd_recall_last := 357,
cmd_tape_menu := 358,
cmd_copy := 359,
cmd_doc := 360,
cmd_quote := 361,
cmd_label := 362,
cmd_key_1 := 363,
cmd_key_2 := 364,
cmd_key_3 := 365,
cmd_key_4 := 366,
cmd_key_5 := 367,
cmd_key_6 := 368,
cmd_key_7 := 369,
cmd_key_8 := 370,
cmd_ch1 := 371,
cmd_s11 := 372,
cmd_s12 := 373,
cmd_s21 := 374,
cmd_s22 := 375,
cmd_mag := 376,
cmd_phase := 377,
cmd_ch2 := 378,
cmd_delay := 379,
cmd_polar := 380,
cmd_param_menu := 381,
cmd_format_menu := 382,
cmd_preset := 383,
cmd_local := 384,
cmd_scale := 385,
cmd_ref_value := 386,
cmd_start := 387,
```

```
cmd_stop := 388,
cmd_ref_position := 389,
cmd_auto_scale := 390,
cmd_center := 391,
cmd_span := 392,
cmd_response_menu := 393,
cmd_stimulus_menu := 394,
cmd_cal_menu := 395,
cmd_display_menu := 396,
cmd_marker_menu := 397,
cmd_system_menu := 398,
cmd_prior_menu := 399,
cmd_measurement_restart := 400,
cmd_domain_menu := 401,
cmd_abort_command := 402,
cmd_input_data := 403,
cmd_input_formatted := 404,
cmd_input_raw1 := 405,
cmd_input_raw2 := 406,
cmd_input_raw3 := 407,
cmd_input_raw4 := 408,
cmd_input_cal_coeff1 := 409,
cmd_input_cal_coeff2 := 410,
cmd_input_cal_coeff3 := 411,
cmd_input_cal_coeff4 := 412,
cmd_input_cal_coeff5 := 413,
cmd_input_cal_coeff6 := 414,
cmd_input_cal_coeff7 := 415,
cmd_input_cal_coeff8 := 416,
cmd_input_cal_coeff9 := 417,
cmd_input_cal_coeff10 := 418,
cmd_input_cal_coeff11 := 419,
cmd_input_cal_coeff12 := 420,
cmd_block_a := 421,
cmd_output_formatted := 422,
cmd_output_active := 423,
cmd_output_marker := 424,
cmd_output_status := 425,
cmd_output_id := 426,
cmd_output_data := 427,
cmd_output_raw1 := 428,
cmd_output_raw2 := 429,
cmd_output_raw3 := 430,
cmd_output_raw4 := 431,
cmd_output_cal_coeff1 := 432,
cmd_output_cal_coeff2 := 433,
cmd_output_cal_coeff3 := 434,
cmd_output_cal_coeff4 := 435,
cmd_output_cal_coeff5 := 436,
cmd_output_cal_coeff6 := 437,
cmd_output_cal_coeff7 := 438,
cmd_output_cal_coeff8 := 439,
cmd_output_cal_coeff9 := 440,
cmd_output_cal_coeff10 := 441,
cmd_output_cal_coeff11 := 442,
cmd_output_cal_coeff12 := 443,
```

```
cmd_output_memory := 444,
cmd_output_error := 445,
cmd_hpib_talk := 446,
cmd_srq_mask := 447,
cmd_clear_status := 448,
cmd_xfer_binary := 449,
cmd_xfer_ascii := 450,
cmd_xfer_ieee2 := 451,
cmd_xfer_ieee1 := 452,
cmd_keycode := 453,
cmd_output_plot := 454,
cmd_monitor := 455,
cmd_n_groups_hpib := 456,
cmd_output_key := 457,
cmd_cal_set_1 := 458,
cmd_cal_set_2 := 459,
cmd_cal_set_3 := 460,
cmd_cal_set_4 := 461,
cmd_cal_set_5 := 462,
cmd_cal_set_6 := 463,
cmd_cal_set_7 := 464,
cmd_cal_set_8 := 465,
cmd_group0 := 0;
```

```
COMMENT
  This is a software generated file !!!
  Changes must be made in SKINFO.WORK
  Run GENSK.LANI to re-generate file;

SUBROUTINE proc0;  ENTRY;
BEGIN

CASE command_token-335 OF
BEGIN
& 335 &
warn(invalid_command);
& 336 &
keypad_entry(e0);
& 337 &
keypad_entry(e0);
& 338 &
keypad_entry(e3);
& 339 &
keypad_entry(e6);
& 340 &
keypad_entry(e9);
& 341 &
marker_value_entry;
& 342 &
step_entry(step_up);
& 343 &
step_entry(step_down);
& 344 &
select_active_function(active_off);
& 345 &
gen_save_menu(5);
& 346 &
save( 1 );
& 347 &
save( 2 );
& 348 &
save( 3 );
& 349 &
save( 4 );
& 350 &
save( 5 );
& 351 &
gen_save_menu(6);
& 352 &
recall( 1 );
& 353 &
recall( 2 );
& 354 &
recall( 3 );
& 355 &
recall( 4 );
& 356 &
recall( 5 );
& 357 &
```

FCMDCASE.WORK.PD8510 THU, DEC 22, 1983, 10:28 AM PAGE 2

```
recall( 8 );
& 358 &
gen_menu(TAPE_MENU, 0);
& 359 &
gen_menu(COPY_MENU, 0);
& 360 &
warn(command_not_implemented);
& 361 &
select_active_function(active_off);
& 362 &
select_active_function(active_off);
& 363 &
process_softkey(1);
& 364 &
process_softkey(2);
& 365 &
process_softkey(3);
& 366 &
process_softkey(4);
& 367 &
process_softkey(5);
& 368 &
process_softkey(6);
& 369 &
process_softkey(7);
& 370 &
process_softkey(8);
& 371 &
select_entry_ch(1);
& 372 &
BEGIN & s11 &
   hilight_off( cmd_user1, cmd_user4);
   new_parameter(s11);
END;  & s11 &
& 373 &
BEGIN & s12 &
   hilight_off( cmd_user1, cmd_user4);
   new_parameter(s12);
END;  & s12 &
& 374 &
BEGIN & s21 &
   hilight_off( cmd_user1, cmd_user4);
   new_parameter(s21);
END;  & s21 &
& 375 &
BEGIN & s22 &
   hilight_off( cmd_user1, cmd_user4);
   new_parameter(s22);
END;  & s22 &
& 376 &
new_format( fmt_log_mag );
& 377 &
new_format( fmt_phase );
& 378 &
select_entry_ch(2);
& 379 &
```

FCMDCASE.WORK.PD8510 THU, DEC 22, 1983, 10:28 AM PAGE 3

```
new_format( fmt_delay );
& 380 &
new_format( fmt_z_smith );
& 381 &
gen_menu(PARAM_MENU, 0);
& 382 &
gen_menu(FORMAT_MENU, 0);
& 383 &
recall_preset_state;
& 384 &
gen_menu(HPIB_MENU, 1);
& 385 &
select_active_function(active_scale);
& 386 &
select_active_function(active_ref_value);
& 387 &
select_active_stimulus(active_start);
& 388 &
select_active_stimulus(active_stop);
& 389 &
select_active_function(active_ref_pos);
& 390 &
auto_scale;
& 391 &
select_active_stimulus(active_center);
& 392 &
select_active_stimulus(active_span);
& 393 &
gen_menu(RESPONSE_MENU, 0);
& 394 &
gen_menu(STIMULUS_MENU, 0);
& 395 &
gen_menu(CAL_MENU, 0);
& 396 &
gen_menu(DISPLAY_MENU, 0);
& 397 &
BEGIN
   select_marker( active_marker );
   gen_menu(MARKER_MENU, 0);
END;
& 398 &
gen_menu(SYSTEM_MENU, 0);
& 399 &
previous_menu;
& 400 &
measurement_restart;
& 401 &
gen_menu(DOMAIN_MENU, 0);
& 402 &
abort_command := TRUE;
& 403 &
pub_ib_input_select( data_input );
& 404 &
pub_ib_input_select( formatted_input );
& 405 &
pub_ib_input_select( raw1_input );
```

FCMDCASE.WORK.PD8510 THU, DEC 22, 1983, 10:28 AM PAGE 4

```
& 406 &
pub_ib_input_select( raw2_input );
& 407 &
pub_ib_input_select( raw3_input );
& 408 &
pub_ib_input_select( raw4_input );
& 409 &
pub_ib_input_select( cal_coeff1_input );
& 410 &
pub_ib_input_select( cal_coeff2_input );
& 411 &
pub_ib_input_select( cal_coeff3_input );
& 412 &
pub_ib_input_select( cal_coeff4_input );
& 413 &
pub_ib_input_select( cal_coeff5_input );
& 414 &
pub_ib_input_select( cal_coeff6_input );
& 415 &
pub_ib_input_select( cal_coeff7_input );
& 416 &
pub_ib_input_select( cal_coeff8_input );
& 417 &
pub_ib_input_select( cal_coeff9_input );
& 418 &
pub_ib_input_select( cal_coeff10_input );
& 419 &
pub_ib_input_select( cal_coeff11_input );
& 420 &
pub_ib_input_select( cal_coeff12_input );
& 421 &
pub_ib_input;
& 422 &
pub_ib_output_select( formatted_output );
& 423 &
pub_ib_output_select( active_output );
& 424 &
pub_ib_output_select( marker_output );
& 425 &
pub_ib_output_select( status_output );
& 426 &
pub_ib_output_select( id_output );
& 427 &
pub_ib_output_select( data_output );
& 428 &
pub_ib_output_select( raw1_output );
& 429 &
pub_ib_output_select( raw2_output );
& 430 &
pub_ib_output_select( raw3_output );
& 431 &
pub_ib_output_select( raw4_output );
& 432 &
pub_ib_output_select( cal_coeff1_output );
& 433 &
pub_ib_output_select( cal_coeff2_output );
```

FCMDCASE.WORK.PD8510 THU, DEC 22, 1983, 10:28 AM PAGE 5

```
& 434 &
pub_ib_output_select( cal_coeff3_output );
& 435 &
pub_ib_output_select( cal_coeff4_output );
& 436 &
pub_ib_output_select( cal_coeff5_output );
& 437 &
pub_ib_output_select( cal_coeff6_output );
& 438 &
pub_ib_output_select( cal_coeff7_output );
& 439 &
pub_ib_output_select( cal_coeff8_output );
& 440 &
pub_ib_output_select( cal_coeff9_output );
& 441 &
pub_ib_output_select( cal_coeff10_output );
& 442 &
pub_ib_output_select( cal_coeff11_output );
& 443 &
pub_ib_output_select( cal_coeff12_output );
& 444 &
pub_ib_output_select( memory_output );
& 445 &
pub_ib_output_select( error_output );
& 446 &
pub_ib_output;
& 447 &
select_active_function( active_srq_mask_primary );
& 448 &
clear_serial_poll;
& 449 &
pub_ib_format_select( output_binary);
& 450 &
pub_ib_format_select( output_ascii);
& 451 &
pub_ib_format_select( output_ieee_double);
& 452 &
pub_ib_format_select( output_ieee_single);
& 453 &
select_active_function( active_keycode );
& 454 &
pub_ib_output_select(plot_output);
& 455 &
BEGIN
   trap_15_type := normal_trap_15;
   TRAP(15);
END;
& 456 &
select_active_function(active_n_groups_hpib);
& 457 &
pub_ib_output_select( key_output );
& 458 &
select_default_set( 1 );
& 459 &
select_default_set( 2 );
& 460 &
```

FCMDCASE.WORK.PD8510 THU, DEC 22, 1983, 10:28 AM PAGE 6

```
select_default_set( 3 );
& 461 &
select_default_set( 4 );
& 462 &
select_default_set( 5 );
& 463 &
select_default_set( 6 );
& 464 &
select_default_set( 7 );
& 465 &
select_default_set( 8 );
END;
END proc0;
```

CCMDDECL.WORK.PD8510 THU, DEC 22, 1983, 10:28 AM PAGE 1

```
#FILE cdtmgr.work;
#FILE cresp.work;
#FILE cstim.work;
#FILE cparams.work;
#FILE cformat.work;
#FILE cdommenu.work;
#FILE ccalmenu.work;
#FILE cstdmenu.work;
#FILE cdisp.work;
#FILE cplot.work;
#FILE cmkr.work;
#FILE csystem.work;
#FILE ccmdcase.work;
```

DCMDDECL.WORK.PD8510 THU, DEC 22, 1983, 10:28 AM PAGE 1

```
  1 = cmd_directory
  9 = cmd_directory_off
 10 = cmd_next_page
 11 = cmd_prev_page
 12 = cmd_first_page
 13 = cmd_last_page
 18 = cmd_machine_dump
 26 = cmd_more
 28 = cmd_file_1
 29 = cmd_file_2
 35 = cmd_file8
 36 = cmd_reg_1
 37 = cmd_reg_2
 38 = cmd_reg_3
 39 = cmd_reg_4
 40 = cmd_reg_5
 41 = cmd_reg_6
 42 = cmd_reg_7
 43 = cmd_reg_8
 44 = cmd_elect_delay
 45 = cmd_auto_delay
 46 = cmd_phase_offset
 48 = cmd_if_avg_on
 49 = cmd_if_avg_off
 50 = cmd_smoothing_on
 51 = cmd_smoothing_off
 52 = cmd_if_test_port
 53 = cmd_if_ref_port
 54 = cmd_if_no_gain
 55 = cmd_if_12db_gain
 56 = cmd_if_24db_gain
 57 = cmd_if_36db_gain
 58 = cmd_if_48db_gain
 59 = cmd_if_gain_auto
 60 = cmd_power_menu
 61 = cmd_sweep_time
 62 = cmd_n_points_menu
 63 = cmd_cw
 64 = cmd_swept
 65 = cmd_stepped
 66 = cmd_51_points
 67 = cmd_101_points
 68 = cmd_201_points
 69 = cmd_401_points
 70 = cmd_source_power
 71 = cmd_power_slope
 72 = cmd_power_slope_off
 73 = cmd_atten_port1
 74 = cmd_atten_port2
 75 = cmd_hold
 76 = cmd_single
 77 = cmd_n_groups_kbd
 78 = cmd_continuous
 80 = cmd_couple_stimulus
 81 = cmd_uncouple_stimulus
```

DCMDDECL.WORK.PD8510 THU, DEC 22, 1983, 10:28 AM PAGE 2

```
 83 = cmd_user1
 84 = cmd_user2
 85 = cmd_user3
 86 = cmd_user4
 87 = cmd_redefine_param
 93 = cmd_label_parameter
 94 = cmd_redefine_done
118 = cmd_convert_off
119 = cmd_convert_recip
120 = cmd_convert_to_z
121 = cmd_convert_to_y
122 = cmd_swr
123 = cmd_linear_mag
124 = cmd_linear_polar
125 = cmd_log_polar
126 = cmd_imag_vs_real
127 = cmd_y_smith
128 = cmd_imaginary
129 = cmd_real
130 = cmd_freq_domain
131 = cmd_low_pass_request
132 = cmd_time_domain
133 = cmd_aux_domain
134 = cmd_setup_time_domain
135 = cmd_setup_gate_domain
136 = cmd_tdr_domain
137 = cmd_tdr_step
138 = cmd_tdr_impulse
139 = cmd_max_time_window
140 = cmd_normal_time_window
141 = cmd_min_time_window
142 = cmd_gate_on
143 = cmd_gate_off
144 = cmd_gate_start
145 = cmd_gate_stop
146 = cmd_gate_center
147 = cmd_gate_span
149 = cmd_max_gate_window
150 = cmd_wide_gate_window
151 = cmd_normal_gate_window
152 = cmd_min_gate_window
153 = cmd_correction_on
154 = cmd_correction_off
155 = cmd_correction_default
156 = cmd_cal_kit_1
157 = cmd_cal_kit_2
159 = cmd_ref_plane_menu
162 = cmd_modify_cal_kit_1
163 = cmd_modify_cal_kit_2
164 = cmd_delete_cal
165 = cmd_ref_plane_1
166 = cmd_ref_plane_2
167 = cmd_freq_setup
168 = cmd_response_type
169 = cmd_1_port_1_type
170 = cmd_1_port_2_type
```

```
171 = cmd_simple_2_port_type
172 = cmd_2_port_type
173 = cmd_port1_std1
174 = cmd_port1_std2
175 = cmd_port1_std3
176 = cmd_done_1_port_on_1
177 = cmd_port2_std1
178 = cmd_port2_std2
179 = cmd_port2_std3
180 = cmd_done_1_port_on_2
181 = cmd_cal_reflection
182 = cmd_cal_thru
183 = cmd_cal_isolation
184 = cmd_done_2_port
185 = cmd_done_reflection
186 = cmd_fwd_transmission
187 = cmd_fwd_match
188 = cmd_rev_transmission
189 = cmd_rev_match
190 = cmd_done_trans
191 = cmd_omit_isolation
192 = cmd_fwd_isolation
193 = cmd_rev_isolation
194 = cmd_done_isolation
195 = cmd_cal_simple_reflection
196 = cmd_cal_simple_thru
197 = cmd_cal_simple_isolation
198 = cmd_done_simple_reflection
199 = cmd_class_std1
200 = cmd_class_std2
201 = cmd_class_std3
202 = cmd_class_std4
203 = cmd_class_std5
204 = cmd_class_std6
205 = cmd_class_std7
206 = cmd_class_done
209 = cmd_select_std
210 = cmd_specify_classes
211 = cmd_label_classes
212 = cmd_label_cal_kit
213 = cmd_cal_kit_defined
214 = cmd_define_open
215 = cmd_define_short
216 = cmd_define_load
217 = cmd_define_air_line
218 = cmd_define_z
219 = cmd_open_c0
220 = cmd_open_c1
221 = cmd_open_c2
222 = cmd_specify_offset
223 = cmd_label_cal_std
224 = cmd_cal_std_defined
225 = cmd_fixed_load
226 = cmd_sliding_load
227 = cmd_offset_delay
228 = cmd_offset_loss
```

```
229 = cmd_offset_z0
230 = cmd_offset_min_f
231 = cmd_offset_max_f
232 = cmd_coax
233 = cmd_waveguide
235 = cmd_port1_1st_std
236 = cmd_port1_2nd_std
237 = cmd_port1_3rd_std
238 = cmd_port2_1st_std
239 = cmd_port2_2nd_std
240 = cmd_port2_3rd_std
242 = cmd_std_class_specified
243 = cmd_trans_fwd_std
244 = cmd_trans_rev_std
245 = cmd_freq_resp_std
246 = cmd_single_ch
247 = cmd_dual_ch
248 = cmd_data
249 = cmd_mem
250 = cmd_d_and_m
251 = cmd_math
253 = cmd_d_into_m
254 = cmd_overlay
255 = cmd_split
256 = cmd_memory1
257 = cmd_memory2
258 = cmd_memory3
259 = cmd_memory4
262 = cmd_memory_ch1
263 = cmd_memory_ch2
264 = cmd_d_plus_m
265 = cmd_d_minus_m
266 = cmd_d_mpy_m
267 = cmd_d_div_m
268 = cmd_plot_all
269 = cmd_plot_trace
270 = cmd_plot_graticule
271 = cmd_plot_marker
272 = cmd_plot_text
274 = cmd_ch1_pen
276 = cmd_list_trace
277 = cmd_system_params
278 = cmd_op_params
279 = cmd_quadrant_11
280 = cmd_quadrant_21
281 = cmd_quadrant_12
282 = cmd_quadrant_22
283 = cmd_quadrant_full
284 = cmd_pen1
285 = cmd_pen2
286 = cmd_pen3
287 = cmd_pen4
288 = cmd_pen5
289 = cmd_pen6
290 = cmd_pen7
291 = cmd_pen8
```

```
292 = cmd_print_params
293 = cmd_plot_params
294 = cmd_next_op_param
295 = cmd_marker_1
296 = cmd_marker_2
297 = cmd_marker_3
298 = cmd_marker_4
299 = cmd_marker_5
300 = cmd_marker_off
301 = cmd_delta_marker
302 = cmd_ref_mkr1
303 = cmd_ref_mkr2
304 = cmd_ref_mkr3
305 = cmd_ref_mkr4
306 = cmd_ref_mkr5
307 = cmd_no_ref_mkr
308 = cmd_mkr_to_min
309 = cmd_mkr_to_max
310 = cmd_title
311 = cmd_hpib_info
312 = cmd_crt_off
313 = cmd_service_menu
317 = cmd_erase_title
318 = cmd_title_done
319 = cmd_8510_addr
320 = cmd_system_bus_addr
321 = cmd_source_addr
322 = cmd_test_set_addr
323 = cmd_plotter_addr
324 = cmd_printer_addr
325 = cmd_auto_cmd_addr
326 = cmd_pass_thru_addr
327 = cmd_revision
328 = cmd_privib_local
329 = cmd_privib_remote
330 = cmd_if_gain_menu
331 = cmd_peek_poke_addr
332 = cmd_peek
333 = cmd_poke
334 = cmd_test_menu
335 = cmd_illegal
336 = cmd_enter
337 = cmd_u1
338 = cmd_u2
339 = cmd_u3
340 = cmd_u4
341 = cmd_mkrval
342 = cmd_up
343 = cmd_down
344 = cmd_entry_off
345 = cmd_save
346 = cmd_save_1
347 = cmd_save_2
348 = cmd_save_3
349 = cmd_save_4
350 = cmd_save_5
```

```
351 = cmd_recall
352 = cmd_recall_1
353 = cmd_recall_2
354 = cmd_recall_3
355 = cmd_recall_4
356 = cmd_recall_5
357 = cmd_recall_last
358 = cmd_tape_menu
359 = cmd_copy
360 = cmd_doc
361 = cmd_quote
362 = cmd_label
363 = cmd_key_1
364 = cmd_key_2
365 = cmd_key_3
366 = cmd_key_4
367 = cmd_key_5
368 = cmd_key_6
369 = cmd_key_7
370 = cmd_key_8
371 = cmd_ch1
372 = cmd_s11
373 = cmd_s12
374 = cmd_s21
375 = cmd_s22
376 = cmd_mag
377 = cmd_phase
378 = cmd_ch2
379 = cmd_delay
380 = cmd_polar
381 = cmd_param_menu
382 = cmd_format_menu
383 = cmd_preset
384 = cmd_local
385 = cmd_scale
386 = cmd_ref_value
387 = cmd_start
388 = cmd_stop
389 = cmd_ref_position
390 = cmd_auto_scale
391 = cmd_center
392 = cmd_span
393 = cmd_response_menu
394 = cmd_stimulus_menu
395 = cmd_cal_menu
396 = cmd_display_menu
397 = cmd_marker_menu
398 = cmd_system_menu
399 = cmd_prior_menu
400 = cmd_measurement_restart
401 = cmd_domain_menu
402 = cmd_abort_command
403 = cmd_input_data
404 = cmd_input_formatted
405 = cmd_input_raw1
406 = cmd_input_raw2
```

DCMDDECL.WORK.PD8510 THU, DEC 22, 1983, 10:29 AM PAGE 7

```
407 = cmd_input_raw3
408 = cmd_input_raw4
409 = cmd_input_cal_coeff1
410 = cmd_input_cal_coeff2
411 = cmd_input_cal_coeff3
412 = cmd_input_cal_coeff4
413 = cmd_input_cal_coeff5
414 = cmd_input_cal_coeff6
415 = cmd_input_cal_coeff7
416 = cmd_input_cal_coeff8
417 = cmd_input_cal_coeff9
418 = cmd_input_cal_coeff10
419 = cmd_input_cal_coeff11
420 = cmd_input_cal_coeff12
421 = cmd_block_a
422 = cmd_output_formatted
423 = cmd_output_active
424 = cmd_output_marker
425 = cmd_output_status
426 = cmd_output_id
427 = cmd_output_data
428 = cmd_output_raw1
429 = cmd_output_raw2
430 = cmd_output_raw3
431 = cmd_output_raw4
432 = cmd_output_cal_coeff1
433 = cmd_output_cal_coeff2
434 = cmd_output_cal_coeff3
435 = cmd_output_cal_coeff4
436 = cmd_output_cal_coeff5
437 = cmd_output_cal_coeff6
438 = cmd_output_cal_coeff7
439 = cmd_output_cal_coeff8
440 = cmd_output_cal_coeff9
441 = cmd_output_cal_coeff10
442 = cmd_output_cal_coeff11
443 = cmd_output_cal_coeff12
444 = cmd_output_memory
445 = cmd_output_error
446 = cmd_hpib_talk
447 = cmd_srq_mask
448 = cmd_clear_status
449 = cmd_xfer_binary
450 = cmd_xfer_ascii
451 = cmd_xfer_ieee2
452 = cmd_xfer_ieee1
453 = cmd_keycode
454 = cmd_output_plot
455 = cmd_monitor
456 = cmd_n_groups_hpib
457 = cmd_output_key
458 = cmd_cal_set_1
459 = cmd_cal_set_2
460 = cmd_cal_set_3
461 = cmd_cal_set_4
462 = cmd_cal_set_5
```

DCMDDECL.WORK.PD8510 THU, DEC 22, 1983, 10:29 AM PAGE 8

```
463 = cmd_cal_set_6
464 = cmd_cal_set_7
465 = cmd_cal_set_8
```

JCMDDECL.WORK.PD8510 THU, DEC 22, 1983, 10:29 AM PAGE 1

```
!job cmddecl,librn.pd8510,work;outclass=,1
!continue
!ed
e skinfo.work
f xcmddecl
v/^ *\[/d
1,$s/^ *\[//
1,$s/\&[^\&]*\& *//
1,$s/^  *//
g/^ *$/d
1,$s/[^A-Z^a-z^0-9^_].*$//
1,$s/$/,/
$s/,/;/
0a
A68KL,P BEGIN
#FILE ccmddecl.work;
#LIST;
INTEGER TABLE ycmddecl :=
.
$a
END$
.
wq xcmddecl
!purge ycmddecl
!build ycmddecl;rec=-1276,,v,ascii;disc=500
!con68k xcmddecl,,ycmddecl
!ed
e ycmddecl
)w ucmddecl.work
wq dcmddecl.work
!purge xcmddecl
!purge ycmddecl
!tell librn.pd8510; ============== jcmddecl done ===================
!tell ucc.pd8510; =============== jcmddecl done ===================
!eoj
```

UCMDDECL.WORK.PD8510 THU, DEC 22, 1983, 10:29 AM PAGE 1

```
1
1,/ DEC /-2d
$
? DEC ?
+
.,$d
1,$s/^ *[0-9]* *//
1,$s/^.* DEC /DEC /
1,$s/^ *//
1,$s/[,;]//
g/DEC /.-1,.j
1,$s/ *DEC */ =    /
1,$s/ *$//
1,$s/^\([^ ]*\).*\([ 0-9]\{5,5\}\)$/\2 = \1/
```

```
SCMDS.WORK.PD8510            THU, DEC 22, 1983, 10:29 AM     PAGE   1

M68KL,P,"cmds"
BEGIN

#FILE ccmdcase.work;
#FILE cparams.work;
#FILE cformat.work;
#FILE cprivib.work;
#FILE cdguser.work;
#FILE fparam.work;
#FILE cchtable.work;   & use before fcontvar & & for max_ch, ch_domain &
#FILE fcontvar.work;
#FILE fchtable.work;                            & for entry_ch_integer &
#FILE fchtab3.work;
#FILE fchdata.work;                                  & for sweep_mode &
#FILE fcontrol.work;
#FILE fiocnfig.work;
#FILE fbreak.work;
#FILE cmessag2.work;    & for command_not_implemented and out_of_range &
#FILE futil3.work;                                         & for warn &
#FILE factive.work;
#FILE factive2.work;
#FILE cmenu.work;
#FILE faverage.work;
#FILE cdatap.work;
#FILE foutput.work;
#FILE fpubib.work;                                    & for local_key &
#FILE ffifo.work;
#FILE ffifos.work;
#FILE cdebugxx.work;                          & for trap_15_type, etc. &
#FILE fdatangr.work;
#FILE fcommand.work;            & for abort_command and command_token &
#FILE fmenu.work;
#FILE fstimuli.work;
#FILE fmarker2.work;
#FILE fplotter.work;            & for plotting display areas via HPIB &

PROCEDURE  new_format( format_type );
   VALUE   format_type;
   INTEGER format_type;                                       EXTERNAL;



PROCEDURE  select_active_stimulus( which_function );
   VALUE   which_function;
   INTEGER which_function;
   BEGIN & select_active_stimulus &
      INTEGER domain;

      domain := entry_ch_integer( ch_domain );

      IF ( (sweep_mode = single_pt) AND
           (domain <> time_domain) AND
           (domain <> tdr_domain)
         ) THEN
         select_active_function( active_cw )
```

```
SCMDS.WORK.PD8510            THU, DEC 22, 1983, 10:29 AM     PAGE   2

      ELSE
         select_active_function( which_function );

   END;  & select_active_stimulus &


#FILE fcmdcase.work;

END$
```

```
FCMV9X.WORK.PD8510           THU, DEC 22, 1983, 10:29 AM     PAGE   1


REAL PROCEDURE CMV92(string, index);
   VALUE   string;
   ALPHA   string;
   INTEGER index;                                             EXTERNAL;
QUAD PROCEDURE CMV9A(string, index);
   VALUE   string;
   ALPHA   string;
   INTEGER index;                                             EXTERNAL;
```

```
SCMV9X.WORK.PD8510           THU, DEC 22, 1983, 10:29 AM     PAGE   1

M68KL,P,"CMV9X"
BEGIN

EXTERNAL DOUBLE AYNRM;      & multiplier normalize address = ZFFFFF922 &
EXTERNAL DOUBLE LLDAO;      & multiplier mantissa  address = ZFFFFF977 &
EXTERNAL BYTE   RDEXP;      & multiplier exponent  address = ZFFFFF912 &
REAL PROCEDURE CMV32(d);
   VALUE d;                                                   EXTERNAL;
   DOUBLE d;

INTEGER CONSTANT length := 0,                    & string indices      &
                 size   := -1;

                                                        & line-feed &
BYTE CONSTANT    end_of_line := ZOR;            & 999999999999999999 or &
BYTE CONSTANT    max_chars   := 18;             & +9.99999999999E+11    &
                                                          & 1E18 - 1&
INTEGER CONSTANT max_digits  := 18;
QUAD CONSTANT    max_integer := 1000000000000000000;
                                                & 1E+18 = max_digits + 1 &

DOUBLE  CONSTANT max_mantissa:= Z7FFFFFFF;      & 2147483647           &
DOUBLE  CONSTANT max_mantissa_div_10
                             := ZCCCCCCC;       & 214748364            &
```

```
SCNV9X.WORK.PD8510              THU, DEC 22, 1983, 10:29 AM      PAGE   2

$EJECT;
COMMENT                                                                  CNV92
**************************************************************************
*
*  EXTERNAL SPECIFICATION FOR: CNV92        *
*
*  FUNCTION:
*     To convert an ASCII character string number representation into
*  a REAL number representation.  Acceptable strings are a super-
*  set of the NR1, NR2, and NR3 representations of ANSI X3.42-1975,
*  "American National Standard for the Representation of Numeric Values
*  in Character Strings for Information Interchange".  These are the
*  number representations recommended by the IEEE P728/draft 11,
*  "Draft Code and Format Conventions for Use with IEEE Standard
*  488-1978 Digital Interface for Programmable Instrumentation".
*
*  The strings accepted are defined by:
*
*  string ::= ' '* {'+'|'-'} digit* {'.' digit}
*                                   { {'E'|'e'} {'+'|'-'|' '} digit* }
*
*  Where:  digit ::= '0'|'1'|'2'|'3'|'4'|'5'|'6'|'7'|'8'|'9'
*          {   } ==> 0 or 1 occurrence
*                + ==> 1 or more occurrence
*                * ==> 0 or more occurrence
*                | ==> alternation (one choice from the alternates)
*
* CAUTION:
*    All calling routines must assure that the string passed to CNV92
* is syntactically correct and does not exceed the specified limits.
* Since such numbers should never occur within the machine (they
* originate from the source via private HP-IB, or are checked by the
* input parser when they originate from the front panel or public
* HP-IB), there is no checking for some error conditions and others
* are less than general.  CNV92 will not accept an input string longer
* than 18 characters, including signs, decimal point, and exponent.
* The total number of digits (not including signs, decimal point, or
* exponent part) cannot exceed 12.  These limitations are primarily for
* implementation convenience to make limit checking easier since there
* is no real need for very large numbers and since some of the math
* library does not support larger numbers. The only allowable blanks are
* leading blanks and a blank in place of the exponent sign character.
* The string may be empty, in which case CNV92 returns a value of zero.
* The only allowable characters are the digits 0-9, +, -, E, space,
* comma, carriage return, and line feed (note: semicolon is not
* allowed).  Runs of digits are delimited by any of the above
* non-digits.
*
* CNV92 requires a string array that has room for one
* additional character (CNV92 appends a marker character to the end of
* the string for internal use).  It will return a zero value if there
* is not sufficient space for appending one character.  This is o.k. for
* the applications where this is used most often, but should be changed
* eventually for more general applications.
*
**************************************************************************
```

```
SCNV9X.WORK.PD8510              THU, DEC 22, 1983, 10:29 AM      PAGE   3

;
REAL PROCEDURE CNV92(string, index);
   VALUE   string;
   ALPHA   string;
   INTEGER index;                                                    ENTRY;
   BEGIN & CNV92 &

      BYTE POINTER str = string;
      BYTE         result_exponent;
      BOOLEAN      negative;
      BOOLEAN      negative_exponent;
      INTEGER      exponent;
      INTEGER      exponent_adjust;
      INTEGER      string_length;
      DOUBLE       mantissa;
      REAL         real_result;

      mantissa := 0;
      negative := FALSE;
      string_length := str[length] - index + 1;
      IF string_length = 0 THEN
         GO TO abort;
      IF string_length >= str[size] THEN
         BEGIN & if &
            mantissa := max_mantissa;
            GO TO abort;
         END; & if &
      exponent := 0;
      exponent_adjust := 0;
      negative_exponent := FALSE;
      str[ string_length+index ] := end_of_line;

& skip leading blanks &
      WHILE str[index] = '  DO
         index := index + 1;

& sign &
      IF str[index] = '- THEN
         BEGIN & if &
            negative := TRUE;
            index := index + 1;
         END & if &
      ELSE IF str[index] = '+ THEN
         index := index + 1;

& integer part &
      WHILE ( ('0 <= str[index]) AND (str[index] <= '9) ) DO
         BEGIN & while &
            IF mantissa <= max_mantissa_div_10 THEN
               mantissa := 10*mantissa + (str[index] AND %0F)
            ELSE
               exponent_adjust := exponent_adjust + 1;
            index := index + 1;
         END while;

& fractional part &
```

```
SCNV9X.WORK.PD8510              THU, DEC 22, 1983, 10:29 AM      PAGE   4

      IF str[index] = '. THEN
         BEGIN & if &
            index := index + 1;
            WHILE ( ('0 <= str[index]) AND (str[index] <= '9) ) DO
               BEGIN & while &
                  IF mantissa <= max_mantissa_div_10 THEN
                     BEGIN & if &
                        mantissa := 10*mantissa + (str[index] AND %0F);
                        exponent_adjust := exponent_adjust - 1;
                     END;  & if &
                  index := index + 1;
               END while;
         END if;

      IF negative THEN
         mantissa := - mantissa;

& exponent &
      IF mantissa <> 0 THEN
         IF (str[index] AND %5F) = 'E THEN
            BEGIN & if &
               index := index + 1;
         & sign &
               IF str[index] = '- THEN
                  BEGIN & if &
                     negative_exponent := TRUE;
                     index := index + 1;
                  END & if &
               ELSE IF ( (str[index] = '+) OR (str[index] = ' ) ) THEN
                  index := index + 1;

               WHILE ( ('0 <= str[index]) AND (str[index] <= '9) ) DO
                  BEGIN & while &
                     exponent := 10*exponent + (str[index] AND %0F);
                           & no test for |exponent| > 32767 &
                     index := index + 1;
                  END while;
               IF negative_exponent THEN
                  exponent := -exponent;
            END if;

& combine exponent and fractional digits, then shift to make integer &

abort:
      exponent := exponent + exponent_adjust;

      real_result := CNV32( mantissa );

      IF exponent > 0 THEN
         REPEAT exponent DO
            real_result := real_result * 10.0
      ELSE IF exponent < 0 THEN
         REPEAT (-exponent) DO
            real_result := real_result * 0.1;
&     ELSE exponent = 0 and real_result need not be modified          &
```

```
SCNV9X.WORK.PD8510              THU, DEC 22, 1983, 10:29 AM      PAGE   5

COMMENT  no test for overflow or underflow ;

      index := index + 1;
      CNV92 := real_result;

   END;  & CNV92 &
```

```
$EJECT;                                                          CNV9A
COMMENT
*************************************************************************
*
*  EXTERNAL SPECIFICATION FOR: CNV9A
*
*  FUNCTION:
*     To convert an ASCII character string number representation into
*  a type QUAD INTEGER representation.  Acceptable strings are a super-
*  set of the NR1, NR2, and NR3 representations of ANSI X3.42-1975,
*  "American National Standard for the Representation of Numeric Values
*  in Character Strings for Information Interchange".  These are the
*  number representations recommended by the IEEE P728/draft 11,
*  "Draft Code and Format Conventions for Use with IEEE Standard
*  488-1978 Digital Interface for Programmable Instrumentation".
*
*  The strings accepted are defined by:
*
*  string ::= ' '* {'+'|'-'} digit* {'.' digit}
*                                   { {'E'|'e'} {'+'|'-'|' '} digit* }
*
*
*  Where:  digit ::= '0'|'1'|'2'|'3'|'4'|'5'|'6'|'7'|'8'|'9'
*          {   } ==> 0 or 1 occurrence
*              + ==> 1 or more occurrence
*              * ==> 0 or more occurrence
*              | ==> alternation (one choice from the alternates)
*
*  CAUTION:
*     All calling routines must assure that the string passed to CNV9A
*  is syntactically correct and does not exceed the specified limits.
*  Since such numbers should never occur within the machine (they
*  originate from the source via private HP-IB, or are checked by the
*  input parser when they originate from the front panel or public
*  HP-IB), there is no checking for some error conditions and others
*  are less than general.  CNV9A will not accept an input string longer
*  than 18 characters, including signs, decimal point, and exponent.
*  The total number of digits (not including signs, decimal point, or
*  exponent part) cannot exceed 12.  These limitations are primarily for
*  implementation convenience to make limit checking easier since
*  there is no real need for very large numbers and since some of the
*  math library does not support larger numbers.  The maximum number
*  representable as a quad integer is about +/- 9.22337204 E+18.
*  The absolute value of the number (including exponent) must
*  be >= 0 and < 1.0E+12.  This is the same restriction as the number
*  of digits mentioned above.  The only allowable blanks are
*  leading blanks and a blank in place of the exponent sign character.
*  The string may be empty, in which case CNV9A returns a value of zero.
*  The only allowable characters are the digits 0-9, +, -, E, space,
*  comma, carriage return, and line feed (note: semicolon is not
*  allowed).  Runs of digits are delimited by any of the above
*  non-digits.
*
*  CNV9A requires a string array that has room for one
*  additional character (CNV9A appends a marker character to the end of
*  the string for internal use).  It will return a zero value if there
*  is not sufficient space for appending one character.
```

```
*
*************************************************************************
;
QUAD PROCEDURE CNV9A(string, index);
  VALUE   string;
  ALPHA   string;                                               ENTRY;
  INTEGER index;
  BEGIN & CNV9A &
     BYTE POINTER str = string;
     BOOLEAN      negative;
     BOOLEAN      negative_exponent;
     INTEGER      integer_digits;
     INTEGER      fractional_digits;
     INTEGER      string_length;
     INTEGER      partial_exponent;
     INTEGER      exponent;
     QUAD         integer_part;
     LABEL        exit;

     integer_part := 0;
     negative := FALSE;
     integer_digits := 0;
     string_length := str[length] - index + 1;
     IF string_length <= 0 THEN
        GO TO exit;
     IF string_length >= str[size] THEN
        BEGIN & if &
           integer_part := max_integer;
           GO TO exit;
        END; & if &
     exponent := 0;
     fractional_digits := 0;
     negative_exponent := FALSE;
     str[ string_length+index ] := end_of_line;

& skip leading blanks &
     WHILE str[index] = '  DO
        index := index + 1;

& sign &
     IF str[index] = '- THEN
        BEGIN & if &
           negative := TRUE;
           index := index + 1;
        END & if &
     ELSE IF str[index] = '+ THEN
        index := index + 1;

& integer part &
     WHILE ( ('0 <= str[index]) AND (str[index] <= '9) ) DO
        BEGIN & while &
           integer_part := 10*integer_part + (str[index] AND %0F);
           integer_digits := integer_digits + 1;
           index := index + 1;
        END while;
```

```
& fractional part &
     IF str[index] = '. THEN
        BEGIN & if &
           index := index + 1;
           WHILE ( ('0 <= str[index]) AND (str[index] <= '9) ) DO
              BEGIN & while &
                 integer_part := 10*integer_part
                    + (str[index] AND %0F);
                 fractional_digits := fractional_digits + 1;
                 index := index + 1;
              END while;
        END if;

& exponent(s) -- handles multiple exponents &
     IF integer_part <> 0 THEN
     WHILE (str[index] AND %5F) = 'E DO
        BEGIN & while &
           partial_exponent := 0;
           index := index + 1;
     & sign &
           IF str[index] = '- THEN
              BEGIN & if &
                 negative_exponent := TRUE;
                 index := index + 1;
              END & if &
           ELSE IF ( (str[index] = '+) OR (str[index] = ' ) ) THEN
              BEGIN & else if &
                 negative_exponent := FALSE;
                 index := index + 1;
              END   & else if &
           ELSE
              negative_exponent := FALSE;
           WHILE ( ('0 <= str[index]) AND (str[index] <= '9) ) DO
              BEGIN & while &
                 partial_exponent := 10*partial_exponent +
                                     (str[index] AND %0F);

                 index := index + 1;
              END while;
           IF negative_exponent THEN
              exponent := exponent - partial_exponent
           ELSE
              exponent := exponent + partial_exponent;
        END;  & while &

& combine exponent and fractional digits, then shift to make integer &

     IF (integer_digits + exponent) > max_digits THEN
        BEGIN & if &
           integer_part := max_integer;
           GO TO exit;
        END; & if &

     exponent := exponent - fractional_digits;

     IF exponent <> 0 THEN
```

```
        IF exponent < 0 THEN
           DO
              BEGIN & do &
                 integer_part := integer_part / 10;
                 exponent := exponent + 1;
              END & do &
           UNTIL exponent = 0
        ELSE & exponent > 0 &
           DO
              BEGIN & do &
                 integer_part := integer_part * 10;
                 exponent := exponent - 1;
              END & do &
           UNTIL exponent = 0;


  exit:
     index := index + 1;
     CNV9A := IF negative THEN -integer_part ELSE integer_part;

  END; & CNV9A &

END$
```

```
FCOMMAND.WORK.PD8510          THU, DEC 22, 1983, 10:29 AM     PAGE   1

EXTERNAL INTEGER command_token;
EXTERNAL BOOLEAN command_pending;
EXTERNAL BOOLEAN abort_command;

PROCEDURE command;                                          EXTERNAL.L;
                                  M
```

```
SCOMMAND.WORK.PD8510          THU, DEC 22, 1983, 10:29 AM     PAGE   1

M68KL,P,"command"
BEGIN

#FILE ffifo.work;
#FILE ffifos.work;
#FILE fkernel.work;
#FILE fkernel4.work;
#FILE factive.work;
#FILE factive2.work;
#FILE fstimuli.work;
#FILE fcontrol.work;
#FILE cchtable.work;                                  & for max_ch &
#FILE fcontvar.work;
#FILE fpubib.work;
#FILE cparser.work;
#FILE crins.work;
#FILE cids.work;
#FILE fintrpt.work;
#FILE cdebugc0.work;                                        & DEBUG &
#FILE fterm.work;                                           & DEBUG &
#FILE ccmdcase.work;                      & solely for cmd_initialize &
#FILE ftpmgr2.work;                       & turning off tape directory&
#FILE fdatamgr.work;
#FILE fmenu.work;
#FILE futil.work;
#FILE fprivib.work;                       & for wrt_priv_ib & & DEBUG &
#FILE fprivib2.work;        & for set_ren_priv_ib and intrpt_priv_ib &

GLOBAL INTEGER command_token;       & the current command.            &
GLOBAL BOOLEAN command_pending;     & flag indicating that there is   &
                                    & a command token to be processed&
                                    & allowing current function to    &
                                    & return a second function to be  &
                                    & processed before fetching a new&
                                    & command token from the fifo.    &
GLOBAL BOOLEAN abort_command;       & flag to abort command function  &
                                    & at earliest convenient time.    &
```

```
SCOMMAND.WORK.PD8510          THU, DEC 22, 1983, 10:29 AM     PAGE   2

#EJECT;
COMMENT                                                          command
**************************************************************************
*                                                                        *
* EXTERNAL SPECIFICATION FOR command                                     *
*                                                                        *
* FUNCTION: to execute user commands from the command fifo buffer.       *
*                                                                        *
* PARAMETER INFORMATION:                                                 *
*    INPUT:   none                                                       *
*                                                                        *
*    OUTPUT:  none                                                       *
*                                                                        *
* EXTERNAL EFFECTS: none                                                 *
**************************************************************************
*                                                                        *
* LOGIC INFORMATION FOR command                                          *
*                                                                        *
* MODULES CALLED: none                                                   *
*                                                                        *
* INITIAL REFINEMENT:                                                    *
*                                                                        *
* get_command:                                                           *
*    command := next token from command fifo buffer                      *
*                                                                        *
*    WHILE command <> done DO                                            *
*                                                                        *
*       IF command = rpg_count THEN                                      *
*          process_rpg_count                                             *
*       ELSE                                                             *
*          CASE command OF                                               *
*             execute individual commands here.                          *
*                                                                        *
*    go to get_command.                                                  *
*                                                                        *
**************************************************************************
;
```

```
SCOMMAND.WORK.PD8510          THU, DEC 22, 1983, 10:29 AM     PAGE   3

#EJECT;
SUBROUTINE init_token_fifo;                                       ENTRY;
   BEGIN
      init_fifo( token_fifo,
                 token_fifo_size,
                 token_buffer,
                 token_buffer_not_full,
                 token_buffer_not_empty );
   END;


SUBROUTINE init_command;
   BEGIN & init_command &

      iradr(ADRS(intrpt_priv_ib),private_ib_vctr);
      set_ren_priv_ib;

      COMMENT These are in case an SRQ has been asserted since power-up,
      not allowing the edge required to detect an interrupt. ;
      wrt_priv_ib( source,   clr_fun, "CS");                  & DEBUG &
      wrt_priv_ib( test_set, clr_fun, "CS");                  & DEBUG &

      recall_power_on_state;

   END; & init_command &
```

```
SCOMMAND.WORK.PD8510          THU, DEC 22, 1983, 10:29 AM     PAGE   4


#EJECT;
PROCEDURE command;                                            ENTRY;
   BEGIN

      init_command;
      restart_sweep;                       M               & starts sweep &

loop: preempt;                                       & don't hold off inputs &
      command_token := read_fifo( token_fifo );
      abort_command := FALSE;
      command_pending := TRUE;

      WHILE command_pending DO
         BEGIN & while &
            COMMENT loops if a function returns command_pending = TRUE
                     to allow one function to invoke another function
                     -- e.g. a soft key maps a to another function by
                     setting the value of t for the new function and
                     setting command_pending to TRUE.;

            command_pending := FALSE;
                                                               & DEBUG &
            IF command_debug THEN                              & DEBUG &
               BEGIN & if &                                    & DEBUG &
                  WHEX(command_token); CRLF;                   & DEBUG &
               END;  & if &                                    & DEBUG &

            IF directory_on THEN         & display over tape directory &
              IF ((command_token > cmd_key_8) OR
                 (command_token < cmd_key_1))      AND
                 (command_token <> cmd_hpib_talk) AND
                 (command_token <> cmd_output_plot)
              THEN
                directory_off;

            IF (command_token OR %00FF) = %FFFF THEN
               rpg_entry(command_token)                          & RPG &
            ELSE
            IF (command_token AND %FF00) = hpib_pass_thru THEN
               pass_thru_command (command_token)       & pass-thru byte &
            ELSE
               BEGIN                                         & not RPG &
                  #FILE fprocs.work;
               END;

         END;  & while &

      GO TO loop;

   END command;


END$
```

```
ACOMPUTE.WORK.PD8510          THU, DEC 22, 1983, 10:29 AM     PAGE   1


 ASMB,R,L
   HED data processing compute routines
   NAM compute,7,"JTB      PD8510"
   UNL
*
*
*   ITEMS TO WORK ON !!
*     1) Need a log mag that returns a flt pt result scaled correctly
*     2) Speed up offset       a) better code ?
*                              b) do scale first to a double and
*                                   offset as a double
*                                  mirco routines exists ??
*              allow for 20 bit scaling vs 16 bit
*     4)ONLY fetch and store pointers on acquire/Release
*     5) add quick WAIT
*     6) computed goto's
*        ALSO fix first point
*
 ENT compute_datap
 ENT logE,magE,angE
 ENT dec_smoothing
 ENT fmt_table,correct_table,conv_table,math_table,update_table
 ENT update_d_loop
 ENT array_correct,array_elec_length
 ENT conv_to_z,conv_to_y,conv_to_recip
*    external software
 EXT MPYE_ptr,DIVE_ptr,DVRE_ptr,SUBE_ptr,ADDE_ptr
 EXT DVRE,ADDE,SUBE,MPYE,DIVE
 EXT MPY2,DVR2
 EXT exp_overflow,fst_trig,fst_sqrt
 EXT one_port_correct,two_port_correct
*    external hardware
 EXT MPLOG,MRLOG,MINTP
 EXT MYNRM,LLDAO,RDEXP
 EXT MPYLF,MCPMP
 EXT IFCAM,MSHFT
*    external data
 EXT system_z0,cpx_1
 EXT step_size,log_table,atn_table          in long address space
*
*
R0  REG 0
R1  REG 1
R2  REG 2
R3  REG 3
R4  REG 4
R5  REG 5
R6  REG 6
R7  REG 7
R8  REG 8
R9  REG 9
R10 REG 10
R11 REG 11
R12 REG 12
R13 REG 13
```

```
ACOMPUTE.WORK.PD8510          THU, DEC 22, 1983, 10:29 AM     PAGE   2


G   REG 13
M   REG 14
S   REG 15
*
```

```
ACOMPUTE.WORK.PD8510          THU, DEC 22, 1983, 10:29 AM     PAGE   3


*EJECT
************* chtable_start *********
dp_m_ptr            EQU  0
dp_d_ptr            EQU  4
dp_f_ptr            EQU  8
dp_trace_ptr        EQU  12
dp_raw_get          EQU  16
dp_raw11_get        EQU  16
dp_raw21_get        EQU  20
dp_raw12_get        EQU  24
dp_raw22_get        EQU  28
dp_correct_ptr      EQU  32
dp_format_switch    EQU  0
dp_correct_switch   EQU  4
dp_trace_math_switch     EQU 8
dp_param_conv_switch     EQU 12
dp_length_inc       EQU  20
dp_length_shift     EQU  24
dp_scr_base         EQU  28
dp_scr_head         EQU  32
dp_scr_tail         EQU  36
dp_scr_end          EQU  40
dp_grp_delay_mem    EQU  44
dp_correct_select   EQU  48
dp_x_offset         EQU  52
dp_polar_gain       EQU  56
dp_y_gain           EQU  56
dp_y_offset         EQU  60
dp_smoothing_scale  EQU  64
dp_smoothing_sum    EQU  68
dp_grp_dly_scale    EQU  72
dp_x_min            EQU  76
dp_x_max            EQU  78
dp_y_min            EQU  80
dp_y_max            EQU  82
dp_polar_exp        EQU  84
dp_pos              EQU  88
dp_flg              EQU  90
dp_smoothing_aper   EQU  92
dp_smoothing_delay  EQU  94
dp_smoothing_correct     EQU 96
dp_correct_offset   EQU  98
************** chtable_end ***************
```

```
*EJECT;
correct_table DEF.L null_rtr correction off
          DEF.L freq_resp response
          DEF.L one_port  one_port
          DEF.L one_port  one_port  on port 2
          DEF.L two_port  two_port  12_term
conv_table DEF.L null_rtr  no conversion
          DEF.L conv_to_z
          DEF.L conv_to_y
          DEF.L conv_to_recip
math_table DEF.L math_off
          DEF.L MPYE_ptr  math_times
          DEF.L DIVE_ptr  math_div
          DEF.L ADDE_ptr  math_plus
          DEF.L SUBE_ptr  math_minus
fmt_table  DEF.L log_mag
          DEF.L lin_mag
          DEF.L phase
          DEF.L delay
          DEF.L real
          DEF.L imag
          DEF.L polar     log_polar
          DEF.L polar     lin_polar
          DEF.L polar     imag_real
          DEF.L polar     z_smith
          DEF.L polar     y_smith
          DEF.L swr
update_table DEF.L update_raw_loop      array processing
          DEF.L update_raw_loop
          DEF.L update_d_loop
          DEF.L update_m_loop
          DEF.L update_f_rect_loop
          DEF.L update_f_polar_loop
```

```
*EJECT
freq_resp EQU *
 MOVE.L     dp_correct_ptr(R11),R13
 MOVE.L     R13,  R8
 ADD.W      #6,   R13
 MOVE.L     R13,dp_correct_ptr(R11)
 JMP        DIVE_ptr
*
*
one_port EQU *
 MOVE.L     dp_correct_ptr(R11),R13
 MOVE.L     R13,  R8
 ADD.W      #6,   R13
 MOVE.L     R13,dp_correct_ptr(R11)
 MOVE       dp_correct_offset(R12),R10
 JMP        one_port_correct.L
*
```

```
*EJECT
*
*
two_port EQU *
 MOVE.L     dp_correct_ptr(R11),R13
 MOVE.L     R13,  R8
 ADD.W      #6,   R13
 MOVE.L     R13,dp_correct_ptr(R11)
 MOVE.L     dp_raw21_get(R11),R10
 MOVE.L     (R10)+,R2
 MOVE.W     (R10)+,R3
 MOVE.L     R10,dp_raw21_get(R11)          restore ptr
 MOVE.L     dp_raw12_get(R11),R10
 MOVE.L     (R10)+,R4
 MOVE.W     (R10)+,R5
 MOVE.L     R10,dp_raw12_get(R11)          restore ptr
 MOVE.L     dp_raw22_get(R11),R10
 MOVE.L     (R10)+,R6
 MOVE.W     (R10)+,R7
 MOVE.L     R10,dp_raw22_get(R11)          restore ptr
*
 MOVE.L     dp_correct_select(R12),R13
 MOVE.W     dp_correct_offset(R12),R10
 JMP        two_port_correct.L
*
```

```
*EJECT
*
conv_to_z EQU *
*  z = z0 * ( 1 - Sii )/( 1 + Sii )
 MOVEM.L  R0/R1, -(S)     save Sii
 MOVEM.L  cpx_1,R2/R3
 JSR      ADDE            1 + Sii
 MOVEM.L  (S)+,R2/R3
 MOVEM.L  R0/R1,-(S)      save 1 + Sii
 MOVEM.L  cpx_1,R0/R1
 JSR      SUBE            1 - Sii
 MOVEM.L  (S)+,R2/R3
 JSR      DVRE                         **** screwed up order fixed here
 CLR.L    R2              fast real to user3 conversion
 MOVE.W   system_z0,R2
 MOVE.W   system_z0+2,R3
 JMP      MPYE
*RTS   implied in above
*
*
conv_to_y EQU *
*  y =  ( 1 + Sii )/( z0 * ( 1 - Sii ) ) = 1/z
 BSR conv_to_z
*RTS   drop into conv_to_recip
*
*
conv_to_recip EQU *
* 1/s   = 1 / Sii
 MOVEM.L cpx_1,R2/R3                   see ucode for CPINV
 JMP     DVRE
*RTS   implied in above
*
```

```
ACOMPUTE.WORK.PD8510          THU, DEC 22, 1983, 10:29 AM      PAGE  8

*EJECT
* Log base 10 of Magnitude of a complex in R0,R1
*
*  Appears to be only 14 bit precision !!!!
log_mag       EQU  *
 BSR          logE
 BRA          smoothing
*
logE          EQU *
 LEA          MPLOG,          R9
 MOVE.L       R0,             (R9)+        load real/imag to find mag
 EXTS.W       R1
 ADD.W        R1,             R1           "square" exp
 MOVE.W       (R9)+,          R0           get mantissa of mag
 MOVE.W       (R9)+,          R2           get exp of mag
 ROR.W        #8,             R0           swap msh and lsh of mantissa
 MOVE.W       R0,             R3
 AND.W        =H3E,           R3           mask 5 msb ( segment number )
 ROR.W        #2,             R0           more scaling of lsh of mantissa
 AND.W        =H7FC0,         R0           mask to get segment delta
 LEA          log_table.L,    R10          address of segment value
 ADD.W        R3,             R10          save for index
 MOVE.L       (R10),          (R9)+        segment, next seg value to multi
 MOVE.W       R0,             (R9)+        segment delta to multi
 NEG.W        R0
 ADD.W        =H8000,         R0
 MOVE.W       R0,             (R9)+        inverted ? segment delta to multi
 EXTS.W       R2                           exp of mag
 ADD.W        R2,             R1           add exp of mag and exp of input
 SWAP         R1
 CLR.W        R1                           scale up exp
 ASR.L        #1,             R1           ?
 TST.W        R0                           ???
 BPL          log_mag_1
 MOVE.W       (R10),          R0           ?????? use table value
 MOVE.W       (R9)+,          R2           read result of multi, ignore
 BRA          log_mag_2
log_mag_1: MOVE (R9),         R0           get interpolated result
log_mag_2: EXTS.L   R0
 ADD.L        R1,             R0           add log parts
*    JSR          CNV32
 MOVE.L       R0,             AYNRM
*MOVE.L       LLDA0,          R0           leave there
 MOVEQ.L      =D31,           R2
 ADD.B        IFCAM+5,        R2           RDEXP w/o TERM
 MOVE.L       =H60548800,     MPYLF        1/10885.224 -- scaling of LOG
 ADD.B        =HF3,           R2           exp of scaling
 MOVE.L       LLDA0,          R0
 ADD.B        RDEXP+1,        R2
 MOVE.B       R2,             R0
 RTS
```

```
ACOMPUTE.WORK.PD8510          THU, DEC 22, 1983, 10:29 AM      PAGE  9

*EJECT;
* straight use of DAVE'S  code for atn (ATNCP)
*  need to improve to give REAL result and better scaling
*
phase         EQU  *
 BSR          angE
 BRA          smoothing
*
angE          EQU *
 BSR          ATNCP
 ADD.L        =H20000,        R0
 AND.L        =H3FFFF,        R0
 SUB.L        =H20000,        R0
*    JSR          CNV32
 MOVE.L       R0,             AYNRM
*MOVE.L       LLDA0,          R0           leave there
 MOVEQ.L      =D31,           R2
 ADD.B        IFCAM+5,        R2           RDEXP w/o TERM
 MOVE.L       =H5A000000,     MPYLF        1/728.17777 -- scaling of PHASE
 ADD.B        =HF7,           R2           exp of scaling
 MOVE.L       LLDA0,          R0
 ADD.B        RDEXP+1,        R2
 MOVE.B       R2,             R0
 RTS
*
* group delay
*
delay EQU *
*
 JSR          ATNCP
 MOVE.L       dp_grp_delay_mem(R12),R1
 MOVE.L       R0,dp_grp_delay_mem(R12)
 SUB.L        R0,             R1
 AND.L        =H3FFFF,        R1
 BTST         #17,            R1           sign extend
 BEQ          del1
 OR.L         =HFFFC0000,     R1
del1 EQU *
*    JSR          CNV32
 MOVE.L       R1,             AYNRM
 MOVE.L       dp_grp_dly_scale(R12),R1
 MOVE.L       LLDA0,          R0
 MOVE.B       RDEXP+1,        R0
 ADD.B        #31,            R0
* scale for number of points
 JSR          MPY2
 BRA          smoothing
```

```
ACOMPUTE.WORK.PD8510          THU, DEC 22, 1983, 10:29 AM      PAGE  10

*EJECT;
*
ATNCP         EQU  *
 CLR.L        R2
 MOVE.W       R0,             R1
 SWAP         R0
 TST.W        R0
*                                  imag in R0 and real in R1, donot need exp
 BMI          YNEG
 NEG.W        R0
 TST.W        R1
 BPL          YPXP
 MOVEQ.W      #1,             R2
 EXG          R0,             R1
XYCMP CMP.W   R0,             R1
 BLT          ATN1
 EXG          R0,             R1
 NEG          R0                      OVERFLOW CASE OK
 BNE          ATN1
 ADDQ.W       #1,             R2
XYAXIS SWAP   R2
 MOVE.L       R2,             R0
 BRA          ATN5                    EXIT FOR 0,90,180,270
YPXP NEG.W    R1
 TST.W        R0
 BNE          XYCMP
 BRA          XYAXIS
YNEG TST.W    R1
 BMI          YNXN
 MOVEQ.W      #3,             R2
 NEG.W        R1
 EXG          R0,             R1
 BNE          XYCMP
 BRA          XYAXIS
YNXN MOVE     #2,             R2
 BRA          XYCMP
*
ATN1 CLR.L    R3
 SWAP         R2
 SWAP         R0
 CLR          R0
 ASR.L        #1,             R0
 DIVS         R1,             R0
 BMI          ATN2
 NEG          R0
 SUBQ.W       #1,             R2
 MOVEQ.W      #1,             R3
ATN2 ROL      #7,             R0
 MOVE.W       R0,             R1
 AND.W        =H3E,           R1
 LEA          atn_table.L,    R10
 ADD.W        R1,             R10
 ROR.W        #2,             R0
 AND.W        =H7FE0,         R0
 LEA          MINTP,          R9
 MOVE.L       (R10),          (R9)+
```

```
ACOMPUTE.WORK.PD8510          THU, DEC 22, 1983, 10:29 AM      PAGE  11

 MOVE.W       R0,             (R9)+
 NEG          R0
 ADD.W        =H8000,         R0
 MOVE.W       R0,             (R9)+
 BPL          ATN3
 MOVE.W       (R10),          R1
 MOVE.W       (R9),           R0      DUMMY READ OF MULTIPLIER
 BRA          ATN4
ATN3 MOVE.W   (R9),           R1
ATN4 EOR.W    R1,             R2
 ADD.W        R3,             R2
 MOVE.L       R2,             R0
ATN5          RTS
*
math_off      ADD.W    #6,   R8
null_rtr      RTS            for computted JSBs
```

```
ACOMPUTE.WORK.PD8510        THU, DEC 22, 1983, 10:29 AM     PAGE  12

*EJECT;
*
*
lin_mag     EQU *
 BSR        magE
 BRA        smoothing
*
magE        EQU *
 LEA        MPLOG,          R9
 MOVE.L     R0,             (R9)+       load real/imag to find mag
 ADD.B      R1,             R1
 BVS        mag1                        check underflow
 MOVE.L     (R9),           R0          get result
 ADD.B      R1,             R0          add in double orginal exp
 BVS        mag2
 JMP        fst_sqrt.L                   use faster sqrt !!!!
*RTS inplied
mag1 MOVE.L (R9),           R0          finish multipler
mag2 MOVE.L #H7FFFFF3F,     R0          MAX value
 RTS
*
*
imag        EQU *
 MOVE.W     R1,R0
 BRA        smoothing
*
*
real EQU *
 SWAP       R0
 MOVE.W     R1,R0
 BRA        smoothing
*
```

```
ACOMPUTE.WORK.PD8510        THU, DEC 22, 1983, 10:29 AM     PAGE  13

*EJECT
sur         EQU *
 BSR        magE
 MOVE.L     R0,     R1
 NEG.B      R0
 BMI        inf_sur
 CMP.B      #D22,   R0
 BGT        min_sur
*CLR.W      R1
 ASR.L      R0,     R1          denormalize mag
 CLR.B      R1                   set exp to zero
*
 MOVE.L     R1,     R0          copy denormalized mag
 NEG.L      R0
 BCLR       #31,    R0          R0 = 1 - mag
 ASR.L      #1,     R1
 MOVE.B     #1,     R1
 BSET       #30,    R1          R1 = 1 + mag
 JSR        DVR2                R0 = R1 / R0
 BRA        smoothing
min_sur  EQU *
 MOVE.L     #H40000001, R0
 BRA        smoothing
inf_sur  EQU *
 MOVE.L     #H7A120014, R0      1,000,000     4E20000D  5000  10*MAX_SCALE
 BRA        smoothing
```

```
ACOMPUTE.WORK.PD8510        THU, DEC 22, 1983, 10:29 AM     PAGE  14

*EJECT;
* entrys for array driven data processing
*
*  R11 must be preloaded with a ch ptr base
*  R12 must be preloaded with a ch var base
*  R13 must be preloaded with the adr to store the result
*  R7  is   number of points to process
*
*
array_correct EQU *
 BRA        array_test
array_loop EQU *
 MOVEM.L    R7/R13,  -(S)
 MOVE.L     dp_raw_get(R11),R10
 MOVE.L     (R10)+,R0
 MOVE.W     (R10)+,R1
 AND.W      #HFF,   R1
 MOVE.L     R10,dp_raw_get(R11)             restore ptr
*
 MOVE.L     dp_correct_switch(R12),R10
 JSR        (R10)
 MOVEM.L    (S)+,   R7/R13
 SWAP       R0
 MOVE.W     R0,     (R13)+
 SWAP       R0
 MOVE.W     R0,     (R13)+
 NOP
 MOVE.W     R1,     (R13)+
array_test EQU *
 DBRA        R7, array_loop
 RTS
*
```

```
ACOMPUTE.WORK.PD8510        THU, DEC 22, 1983, 10:29 AM     PAGE  15

*EJECT;
* entrys for array driven data processing
*
*  R11 must be preloaded with a ch ptr base
*  R12 must be preloaded with a ch var base
*  R13 must be preloaded with the adr to store the result
*  R7  is   number of points to process
*
*
array_elec_length EQU *
 BRA        array_test_el
array_loop_el EQU *
 MOVEM.L    R7/R13,  -(S)
 MOVE.L     (R13)+,R2
 MOVE.W     (R13)+,R3
*
 MOVE.L     dp_length_shift(R12), R0      keep in a register ???
 JSR        fst_trig.L                    uses R0,R1,R9,R10
 CLR.W      R1
 JSR        MPYE
 MOVE.L     dp_length_inc(R12), R2        update for next bucket
 ADD.L      R2, dp_length_shift(R12)
*
*
 MOVE.L     dp_param_conv_switch(R12),R10
 JSR        (R10)
*
 MOVEM.L    (S)+,   R7/R13
 SWAP       R0
 MOVE.W     R0,     (R13)+
 SWAP       R0
 MOVE.W     R0,     (R13)+
 NOP
 MOVE.W     R1,     (R13)+
array_test_el EQU *
 DBRA        R7, array_loop_el
 RTS
*
```

```
ACOMPUTE.WORK.PD8510            THU, DEC 22, 1983, 10:29 AM     PAGE  16

*EJECT
*
*
```

```
ACOMPUTE.WORK.PD8510            THU, DEC 22, 1983, 10:29 AM     PAGE  17

*EJECT;
*
* compute_datap
*
*  R11 must be preloaded with a ch ptr base
*  R12 must be preloaded with a ch var base
*
*       Data in memory  | Imag  |  16 bits
*                       | Real  |  16 bits
*                       |xxx|Exp|  8  bits -- first 8 bits donot care
*                       ---------
update_raw_loop EQU *
compute_datap EQU *
 MOVE.L     dp_raw_get(R11),R10
 MOVE.L     (R10)+,R0
 MOVE.W     (R10)+,R1
 AND.W      =HFF,  R1
 MOVE.L     R10,dp_raw_get(R11)                 restore ptr
*
correct_math EQU *
 MOVE.L     dp_correct_switch(R12),R10
 JSR        (R10)
*
 MOVE.L     R0,  R2
 MOVE.L     dp_length_shift(R12), R0
 BNE        do_rotate
 MOVE.L     dp_length_inc(R12), R0        update for next bucket
 ADD.L      R0, dp_length_shift(R12)
 MOVE.L     R2,  R0
 BRA        param_conv
*
do_rotate EQU *
 MOVE.W     R1,  R3
 JSR        fst_trig.L
 LEA        MCPMP,    R9                  complex math multiply
 MOVE.L     R2,   (R9)+
 MOVE.L     R0,   (R9)+
 MOVE.L     dp_length_inc(R12), R0        update for next bucket
 ADD.L      R0, dp_length_shift(R12)
 MOVE.W     (R9)+,     R1
 ADD.B      R3,        R1                 total exp
 BVC        exit_rotate                   exp overflow ?
 JSR        exp_overflow
exit_rotate EQU *
 MOVE.L     (R9),    R0
*
*
param_conv EQU *
 MOVE.L     dp_param_conv_switch(R12),R10
 JSR        (R10)
*
```

```
ACOMPUTE.WORK.PD8510            THU, DEC 22, 1983, 10:29 AM     PAGE  18

*EJECT
store_in_d EQU *
 MOVE.L     dp_d_ptr(R11),R10             stash into d (by words only)
 SWAP       R0
 MOVE.W     R0,(R10)+
 SWAP       R0
 MOVE.W     R0,(R10)+
 NOP                                      don't write to display too fast
 MOVE.W     R1,(R10)+
 MOVE.L     R10,dp_d_ptr(R11)
*
*
trace_math EQU *
 MOVE.L     dp_m_ptr(R11),R8
 MOVE.L     dp_trace_math_switch(R12),R10
 JSR        (R10)
 MOVE.L     R8,dp_m_ptr(R11)
*
*
format_sel EQU *
 MOVE.L     dp_format_switch(R12),R10
 JMP        (R10)
*
*
```

```
ACOMPUTE.WORK.PD8510            THU, DEC 22, 1983, 10:29 AM     PAGE  19

*EJECT
*
* update entry points
*  fetch date from store intermediate storage arrays and pick up
*  processing at the proper point
*
*
update_d_loop EQU *
 MOVE.L     dp_d_ptr(R11),R10
 MOVE.L     (R10)+,  R0
 MOVE.W     (R10)+,  R1
 MOVE.L     R10,dp_d_ptr(R11)
 BRA        trace_math
*
*
update_m_loop EQU *
 MOVE.L     dp_m_ptr(R11),R10
 MOVE.L     (R10)+,  R0
 MOVE.W     (R10)+,  R1
 MOVE.L     R10,dp_m_ptr(R11)
 BRA        format_sel
*
*
update_f_polar_loop EQU *
 MOVE.L     dp_f_ptr(R11),R10
 MOVE.L     (R10)+,  R0              pick up complex value from F
 MOVE.W     (R10)+,  R1
 MOVE.L     R10,dp_f_ptr(R11)
 BRA        polar_scaling
update_f_rect_loop EQU *
 MOVE.L     dp_f_ptr(R11),R10
 MOVE.W     (R10)+,  R1              skip over imag part should be zero
 MOVE.L     (R10)+,  R0              pick up scalar from F
 MOVE.L     R10,dp_f_ptr(R11)
 BRA        rect_scaling
*
```

```
ACOMPUTE.WORK.PD8510           THU, DEC 22, 1983, 10:29 AM     PAGE  20

*EJECT;
inc_smoothing EQU *
* head points to that last item place ( old top of scr )in the scr array
 MOVE.L      dp_scr_head(R12),  R10
 ADD.W       =D6,  R10
 CMP.L       dp_scr_end(R12), R10
 BLT         is1
 MOVE.L      dp_scr_base(R12), R10
is1 EQU *
 MOVE.L      R0, (R10)
 MOVE.L      dp_smoothing_sum(R12), R1
 MOVE.L      R10,     dp_scr_head(R12)
 JSRX        ADD2
 MOVE.L      R0, dp_smoothing_sum(R12)
 RTS
*
dec_smoothing EQU *
* tail points to the last item in the scr array
 MOVE.L      dp_scr_tail(R12),   R10
 MOVE.L      (R10),       R0
 ADD.W       =D6,  R10
 CMP.L       dp_scr_end(R12), R10
 BLT         ds1
 MOVE.L      dp_scr_base(R12), R10
ds1 EQU *
 MOVE.L      R10, dp_scr_tail(R12)
 MOVE.L      dp_smoothing_sum(R12), R1
 JSRX        SBR2
 MOVE.L      R0, dp_smoothing_sum(R12)
 RTS
*  print EQU  *
*   EXG R0,R5
*   JSRX         WSTR
*   JSRX   CRLF
*   EXG R5,R0
*   RTS
*  print_r0 EQU *
*   MOVE.L       R0,-(S)
*   MOVE.W       =D8,-(S)
*   MOVE.L       R10, R0
*   JSRX         WHex
*   MOVE.L       (S), R0
*   JSRX         WREAL
*   MOVE.L       dp_smoothing_sum(R12), R0
*   JSRX         WREAL
*   JSRX         CRLF
*   MOVE.L       (S)+,R0
*   RTS
```

```
ACOMPUTE.WORK.PD8510           THU, DEC 22, 1983, 10:29 AM     PAGE  21

*EJECT;
smoothing  EQU *
*  CMPI.W      =D801,   dp_pos(R12)      & debug&
*   BLT         sm                        & debug&
*   LEA         too_many_points,R8 &screwy  debug &
*   MOVE        R8,R0                     & debug &
*   JSRX        warn                      & debug &
*   RTS                                   & debug &
sm EQU *
 MOVE.W      step_size.L,  R2
 ADD.W       R2,      dp_pos(R12)
 TST.W       dp_smoothing_aper(R12)
 BEQ         no_smoothing
 TST.W       dp_flg(R12)
 BMI         sm1
*# intial setup
 MOVE.L      R0,-(S)
 MOVE.W      dp_smoothing_correct(R12),R7
 TST.W       dp_flg(R12)
 BNE         sm02
 MOVE.W      dp_smoothing_aper(R12), R7
 MOVE.W      R7, dp_smoothing_delay(R12)
 CLR.L       dp_smoothing_sum(R12)
 MOVE.L      dp_scr_end(R12),  dp_scr_head(R12)
 MOVE.L      dp_scr_base(R12), dp_scr_tail(R12)
*
sm01 EQU *
 MOVE.L      (S),  R0
 BSR         inc_smoothing
sm02 EQU *
 DBRA        R7, sm01
 MOVE.L      (S)+,  R0
 MOVE.W      =D-1,dp_flg(R12)
*#
sm1  EQU *
 TST.W       dp_smoothing_delay(R12)
 BLE         sm2
 SUB.W       =D1,dp_smoothing_delay(R12)
*#  delay path
 BSR         inc_smoothing
 RTS
sm2 EQU *
 MOVE.L      R0,-(S)
 CLR.W       R7
 CMPI.W      =D801,   dp_pos(R12)
 BLT         sm31
 MOVE.W      dp_smoothing_aper(R12),R7
sm3 EQU *
 MOVE.L      (S),R0
sm31 EQU *
*#
*#     block average
 BSR         inc_smoothing
 BSR         dec_smoothing
 MOVE.L      dp_smoothing_scale(R12),R1
 JSRX        DIV2
```

```
ACOMPUTE.WORK.PD8510           THU, DEC 22, 1983, 10:29 AM     PAGE  22

 BSR         store_real_in_f
 DBRA        R7, sm3
 MOVE.L      (S)+, R0
 RTS
no_smoothing EQU *
 BSR         store_real_in_f
 RTS
*
```

```
ACOMPUTE.WORK.PD8510           THU, DEC 22, 1983, 10:29 AM     PAGE  23

*EJECT
store_real_in_f EQU *
 MOVE.L      dp_f_ptr(R11),R10       stash into f  (WORDS ONLY)
 CLR.W       (R10)+                  imag part of storage is zero
 SWAP        R0
 MOVE.W      R0,(R10)+
 SWAP        R0
 MOVE.W      R0,(R10)+
 MOVE.L      R10,dp_f_ptr(R11)
*
*
*
*    RECTANGULAR SCALING EQUATION            offset first,scale 2nd
*            input is real in R0, and result is in display units
*            with limiting on Y axis values
*
rect_scaling: MOVE.L  dp_y_offset(R12),R2    expect real y in R0
*    JSR         ADD2
*    see ADD2 documentation
 SUB.B       R2,          R0             get exp difference for normalize
 BVC         rs2
 BPL         rs1
 ADD.B       R0,          R2
 MOVE.B      =H7F,        R0
 SUB.B       R0,          R2
 BRA         rs2
rs1: MOVE.B =H80,         R0
rs2: LEA     MRLDG,       R9             set ADD address
 MOVE.L      R0,          (R9)+
 SWAP        R2
 MOVE.W      R2,          (R9)+          start ADD with offset's 16 MSBs
 SWAP        R2
 TST.B       R0
 BMI         rs3
 ADD.B       R0,          R2
rs3: MOVE.L     dp_y_gain(R12),R1
*   JSR         MPY2    modified so result is a double
*
 EXG         R1,          R2             cover up of screw up
 ADD.B       R2,          R1
 BVC         rs4
 JSR          exp_overflow
rs4: MOVE.W (R9)+,        R2             offseted value in LSH of R2
 ADD.L       #1,          R9
 ADD.B       (R9)+,       R1              add in exp
 BVC         rs5
 JSR          exp_overflow
rs5: MOVE.L R2,          (R9)+           move scale and value
 MOVE.W      R1,         (R9)+           move exp for unnormalize
 NOP                                     do WAIT test here ??
 MOVE        (R9)+,       R0             result
*
 CMP.W       dp_y_min(R12),R0            limit testing
 BGT         rs8
 MOVE.W      dp_y_min(R12),R0
rs8: CMP.W  dp_y_max(R12),R0
```

ACOMPUTE.WORK.PD8510 THU, DEC 22, 1983, 10:29 AM PAGE 24

```
 BLT       rs9
 MOVE.W    dp_y_max(R12),R0
*
rs9: MOVE.L dp_trace_ptr(R11),R10
 ADD.L     #2,R10                          *inc past x-point
 MOVE.W    R0,(R10)+                       place on screen
 MOVE.L    R10,dp_trace_ptr(R11)
rect_scaling_exit EQU *
 RTS
```

ACOMPUTE.WORK.PD8510 THU, DEC 22, 1983, 10:29 AM PAGE 25

```
*EJECT
*
*     POLAR SCALING EQUATION            scales first, then offsets
*                                     ( why different ?? available ucode )
*            input is complex in R0/R1, result is in display units
*            with limiting on X and Y axis values
*
polar     EQU *
store_polar_in_f EQU *
 MOVE.L dp_f_ptr(R11),R10            stash into f (by words only)
 SWAP      R0
 MOVE.W    R0,(R10)+
 SWAP      R0
 MOVE.W    R0,(R10)+
 NOP                                 don't write to display too fast
 MOVE.W    R1,(R10)+
 MOVE.L    R10,dp_f_ptr(R11)
*
polar_scaling EQU *
 MOVE.L    R0,IFCRM                              LDRO; LDR2;
 LEA       MSHFT-4, R9
 MOVE.L    dp_polar_gain(R12),(R9)+              LDMO,SHIFT; LDM2,MPYFRC
 MOVE.L    dp_trace_ptr(R11) , R10
 ADD.B     dp_polar_exp+1(R12) , R1
 BVC       ps01
 JSR       exp_overflow
ps01 BLE   ps02
 CLR.W     R1                                    limit exp to <= 0
ps02 MOVE.W R1, (R9)+                            LDEXP,USHIFT
 MOVE.L    dp_x_offset(R12), R0
 MOVE.L    dp_y_offset(R12), R1
 ADD.W     (R9)+, R1
 ADD.W     (R9)+, R0
* limit test
 CMP.W     dp_x_min(R12),  R0
 BGT       ps03
 MOVE.W    dp_x_min(R12),  R0
 BRA       ps04
ps03 CMP.W dp_x_max(R12),  R0
 BLT       ps04
 MOVE.W    dp_x_max(R12),  R0
ps04 CMP.W dp_y_min(R12),  R1
 BGT       ps05
 MOVE.W    dp_y_min(R12),  R1
 BRA       ps06
ps05 CMP.W dp_y_max(R12),  R1
 BLT       ps06
 MOVE.W    dp_y_max(R12),  R1
*
ps06 MOVE.W R0,(R10)+
 NOP
 MOVE.W    R1,(R10)+
 MOVE.L    R10,dp_trace_ptr(R11)
 RTS
 END
```

CCOMPUTE.WORK.PD8510 THU, DEC 22, 1983, 10:30 AM PAGE 1

```
COMMENT
*************************************************************************
*************************************************************************
end of comment;

INTEGER CONSTANT dp_double_base         := 0 ,
                 dp_format_switch       := dp_double_base + 0,
                 dp_correct_switch      := dp_double_base + 1,
                 dp_trace_math_switch   := dp_double_base + 2,
                 dp_param_conv_switch   := dp_double_base + 3,
                 dp_length_initial      := dp_double_base + 4,
                 dp_length_inc          := dp_double_base + 5,
                 dp_length_shift        := dp_double_base + 6,
                   & composite of elec. length, etc. &
                 dp_scr_base            := dp_double_base + 7,
                 dp_scr_head            := dp_double_base + 8,
                 dp_scr_tail            := dp_double_base + 9,
                 dp_scr_end             := dp_double_base +10,
                 dp_grp_delay_mem       := dp_double_base +11,
                 dp_correct_select      := dp_double_base +12,
                 dp_last_double         :=(dp_double_base +13) *dsize;
INTEGER CONSTANT dp_real_base           := dp_last_double / rsize,
                 dp_x_offset            := dp_real_base + 0,
                 dp_y_gain              := dp_real_base + 1,
                 dp_polar_gain          := dp_y_gain,
                 dp_y_offset            := dp_real_base + 2,
                 dp_smoothing_scale     := dp_real_base + 3,
                 dp_smoothing_sum       := dp_real_base + 4,
                 dp_grp_dly_scale       := dp_real_base + 5,
                 dp_last_real           :=(dp_real_base + 6)  * rsize;
INTEGER CONSTANT dp_integer_base        := dp_last_real / isize,
                 dp_x_min               := dp_integer_base + 0,
                 dp_x_max               := dp_integer_base + 1,
                 dp_y_min               := dp_integer_base + 2,
                 dp_y_max               := dp_integer_base + 3,
                 dp_polar_exp           := dp_integer_base + 4,
                 dp_finished_signal     := dp_integer_base + 5,
                 dp_pos                 := dp_integer_base + 6,
                 dp_flg                 := dp_integer_base + 7,
                 dp_smoothing_aper      := dp_integer_base + 8,
                 dp_smoothing_delay     := dp_integer_base + 9,
                 dp_smoothing_correct   := dp_integer_base +10,
                 dp_correct_offset      := dp_integer_base +11,
                 dp_last_integer        :=(dp_integer_base +12) *isize;
INTEGER CONSTANT last_dp_vars           := dp_last_integer;
```

FCOMPUTE.WORK.PD8510 THU, DEC 22, 1983, 10:30 AM PAGE 1

```
USER3 PROCEDURE conv_to_z( real_imag );
   VALUE real_imag;                                     EXTERNAL.L;
   USER3 real_imag;
USER3 PROCEDURE conv_to_y( real_imag );
   VALUE real_imag;                                     EXTERNAL.L;
   USER3 real_imag;
```

```
JCOMPUTE.WORK.PD8510          THU, DEC 22, 1983, 10:30 AM      PAGE   1

!JOB jcompute,librn.pd8510,work;pri=cs;outclass=,1
!CONTINUE
!PURGE aequxxx
!CONTINUE
!BUILD aequxxx;REC=-1276,,v,ASCII
!com68k ,,aequxxx
M68KL,P BEGIN
#FILE cdatap.work;
#FILE cmessage.work;
#FILE ccompute.work;

INTEGER i;
#LIST;

i:= dsize * dp_m_ptr ;
i:= dsize * dp_d_ptr ;
i:= dsize * dp_f_ptr ;
i:= dsize * dp_trace_ptr ;
i:= dsize * dp_raw_get ;
i:= dsize * dp_raw11_get ;
i:= dsize * dp_raw21_get ;
i:= dsize * dp_raw12_get ;
i:= dsize * dp_raw22_get ;
i:= dsize * dp_correct_ptr ;
i:= dsize * dp_format_switch ;
i:= dsize * dp_correct_switch ;
i:= dsize * dp_trace_math_switch ;
i:= dsize * dp_param_conv_switch ;
i:= dsize * dp_length_inc ;
i:= dsize * dp_length_shift ;
i:= dsize * dp_scr_base ;
i:= dsize * dp_scr_head ;
i:= dsize * dp_scr_tail ;
i:= dsize * dp_scr_end ;
i:= dsize * dp_grp_delay_mem ;
i:= dsize * dp_correct_select ;

i:= rsize * dp_x_offset ;
i:= rsize * dp_polar_gain ;
i:= rsize * dp_y_gain ;
i:= rsize * dp_y_offset ;
i:= rsize * dp_smoothing_scale ;
i:= rsize * dp_smoothing_sum ;
i:= rsize * dp_grp_dly_scale ;

i:= isize * dp_x_min ;
i:= isize * dp_x_max ;
i:= isize * dp_y_min ;
i:= isize * dp_y_max ;
i:= isize * dp_polar_exp ;
i:= isize * dp_pos   ;
i:= isize * dp_flg   ;
i:= isize * dp_smoothing_aper ;
i:= isize * dp_smoothing_delay ;
i:= isize * dp_smoothing_correct ;
```

```
JCOMPUTE.WORK.PD8510          THU, DEC 22, 1983, 10:30 AM      PAGE   2

i:= isize * dp_correct_offset ;

END$
!ed
e aequxxx
v/{{ i:= | MOVE }}/d
g/:=/.,.+1j
1,$s/^[^*]*\* //
1,$s/;.*MOVE =D/EQU /
1,$s/,\$i//
)ts 20,25
1,$s/  */ /g
w
e acompute.work
/chtable_start/+1,/chtable_end/-1d
.-1r aequxxx
w
q
!CONTINUE
!PURGE aequxxx
!TELL jtb.pd8510  *******   jcompute done    *******
!EOJ
```

```
FCONTROL.WORK.PD8510          THU, DEC 22, 1983, 10:30 AM      PAGE   1

EXTERNAL INTEGER group_number.L;

SUBROUTINE abort_sweep;                                  EXTERNAL.L;
SUBROUTINE restart_sweep;                                EXTERNAL.L;
SUBROUTINE measurement_restart;                          EXTERNAL.L;
SUBROUTINE hold_sweep;                                   EXTERNAL.L;
SUBROUTINE single_sweep;                                 EXTERNAL.L;
SUBROUTINE continuous_sweep;                             EXTERNAL.L;
PROCEDURE  n_sweep(n);
   VALUE   n;
   INTEGER n;                                            EXTERNAL.L;
PROCEDURE  control;                                      EXTERNAL.L;
```

```
SCONTROL.WORK.PD8510          THU, DEC 22, 1983, 10:30 AM      PAGE   1

M68KL,P,"control"
BEGIN

#FILE finit.work;
#FILE fkernel.work;
#FILE fkernel4.work;
#FILE crins.work;                                                  & DEBUG &
#FILE cdebug.work;                                                 & DEBUG &
#FILE fterm.work;
#FILE fbreak.work;
#FILE ffifo.work;
#FILE ffifos.work;
#FILE cchtable.work;                                           & for max_ch &
#FILE fchdata.work;
#FILE fcontvar.work;
#FILE fcontv2.work;                        & for rebuild and array_processed &
#FILE fstimuli.work;
#FILE fyadc.work;
#FILE fintrpt.work;
#FILE cstin.work;
#FILE fpubib.work;
#FILE cpubib.work;
#FILE ftrace.work;
#FILE fmenu.work;
#FILE cdatap.work;                                   & for update_raw_array &
#FILE fcal.work;     & for cal_acquisition_done and measuring_std_data &
#FILE futil.work;                    & for warn and measuring_std_aborted &


INTEGER CONSTANT normal_sweep := 0;                                & DEBUG &
INTEGER CONSTANT cw := -1;
BOOLEAN abort;              & abort current sweep (incl. stepped) if true &
                            & set TRUE by abort_sweep and sweep,          &
                            & set FALSE by control                        &
DOUBLE  CONSTANT complex_size := 6,                    & # bytes/complex &
                 word_size    := 2;                    & # bytes/word    &
INTEGER CONSTANT max_group_number := %7FFF;
GLOBAL  INTEGER  group_number;     & used for starting averaging factor &
```

```
SCONTROL.WORK.PD8510          THU, DEC 22, 1983, 10:30 AM     PAGE  2

%EJECT;
COMMENT                                                           sync
************************************************************************
*
*  wait for data processing to finish any unprocessed data points.
*
************************************************************************
;
SUBROUTINE sync;
   BEGIN & sync &
      acquire(group_ready_rin);        & since two processes can't wait  &
                                       &    on the same signal.           &
      send(enable_group_ready);        & wait for any pending processing &
      wait(group_ready);               &    to be completed.              &
      release(group_ready_rin);
   END;  & sync &
```

```
SCONTROL.WORK.PD8510          THU, DEC 22, 1983, 10:30 AM     PAGE  3

%EJECT;
COMMENT                                                     abort_sweep
************************************************************************
*
* EXTERNAL SPECIFICATION FOR abort_sweep
*
* FUNCTION: Aborts any active sweep, including stepped.
*           Sets a boolean flag, abort, used to terminate repititive
*           operations.
*
* PARAMETER DESCRIPTION:
*
*    INPUT:  none
*
*    OUTPUT: none
*
************************************************************************
*
* LOGIC INFORMATION FOR abort_sweep
*
* INTIAL REFINEMENT:
*
*    abort source's sweep.
*    abort := TRUE.
*    allow pending processing to complete.
*
************************************************************************
;
SUBROUTINE abort_sweep;                                          ENTRY;
   BEGIN & abort_sweep &
      IF sweep_debug THEN                                      & DEBUG &
         BEGIN & if &                                          & DEBUG &
            WSTR("abort_swp+"); CRLF;                          & DEBUG &
         END;  & if &                                          & DEBUG &
      abort := TRUE;
      write_fifo(fifo_swp_brk, abort_swp);
      wait(aborted);            & until pending conversion stuff is done &
                                       & now that abort is verified &
      abort := FALSE;                                          & DEBUG &
                                                               & DEBUG &
      IF sweep_debug THEN                                      & DEBUG &
         BEGIN & if &                                          & DEBUG &
            WSTR("abort_swp|"); CRLF;                          & DEBUG &
         END;  & if &                                          & DEBUG &

      sync;

      disable_phase_lock_lost;

      IF sweep_debug THEN                                      & DEBUG &
         BEGIN & if &                                          & DEBUG &
            WSTR("abort_swp-"); CRLF;                          & DEBUG &
         END;  & if &                                          & DEBUG &
   END;  & abort_sweep &
```

```
SCONTROL.WORK.PD8510          THU, DEC 22, 1983, 10:30 AM     PAGE  4

%EJECT;
COMMENT                                                   restart_sweep
************************************************************************
*
* EXTERNAL SPECIFICATION FOR restart_sweep
*
* FUNCTION: Restarts sweep, beginning a new group.
*
* PARAMETER DESCRIPTION:
*
*    INPUT:  none
*
*    OUTPUT: none
*
************************************************************************
*
* LOGIC INFORMATION FOR restart_sweep
*
* INTIAL REFINEMENT:
*
*    restart sweep by exiting break_idle and resuming the control loop
*
************************************************************************
;
SUBROUTINE restart_sweep;                                        ENTRY;
   BEGIN & restart_sweep &
      write_fifo(fifo_swp_brk, exit_break_idle);
   END;  & restart_sweep &
```

```
SCONTROL.WORK.PD8510          THU, DEC 22, 1983, 10:30 AM     PAGE  5

%EJECT;
COMMENT                                             measurement_restart
************************************************************************
*
* EXTERNAL SPECIFICATION FOR measurement_restart
*
* FUNCTION: Aborts any active sweep, then restarts sweep.
*
* PARAMETER DESCRIPTION:
*
*    INPUT:  none
*
*    OUTPUT: none
*
************************************************************************
*
* LOGIC INFORMATION FOR measurement_restart
*
* INTIAL REFINEMENT:
*
*    abort_sweep.
*    restart_sweep.
*
************************************************************************
;
SUBROUTINE measurement_restart;                                  ENTRY;
   BEGIN & measurement_restart &
      abort_sweep;
      restart_sweep;
   END;  & measurement_restart &
```

```
SCONTROL.WORK.PD8510            THU, DEC 22, 1983, 10:30 AM     PAGE   6

#EJECT;
COMMENT                                                          hold_sweep
**************************************************************************
*
* EXTERNAL SPECIFICATION FOR hold_sweep
*
* FUNCTION: Aborts any active sweep, and sets sweep mode to hold.
*
* PARAMETER DESCRIPTION:
*
*    INPUT:  none
*
*    OUTPUT: none
*
**************************************************************************
*
* LOGIC INFORMATION FOR hold_sweep
*
* INTIAL REFINEMENT:
*
*    abort_sweep
*    number_of_groups := hold
*
**************************************************************************
;
SUBROUTINE hold_sweep;                                             ENTRY;
   BEGIN & hold_sweep &
      abort_sweep;
      number_of_groups := hold;    & needn't acquire control variables &
                                   &    since value is a single word.  &
   END;  & hold_sweep &
```

```
SCONTROL.WORK.PD8510            THU, DEC 22, 1983, 10:30 AM     PAGE   7

#EJECT;
COMMENT                                                        single_sweep
**************************************************************************
*
* EXTERNAL SPECIFICATION FOR single_sweep
*
* FUNCTION: Aborts any active sweep, sets sweep mode to single, and
*           resumes sweep activity.
*
* PARAMETER DESCRIPTION:
*
*    INPUT:  none
*
*    OUTPUT: none
*
**************************************************************************
*
* LOGIC INFORMATION FOR single_sweep
*
* INTIAL REFINEMENT:
*
*    abort_sweep
*    number_of_groups := single
*    resume sweep
*
**************************************************************************
;
SUBROUTINE single_sweep;                                           ENTRY;
   BEGIN & single_sweep &
      abort_sweep;
      number_of_groups := single;  & needn't acquire control variables &
                                   &    since value is a single word.  &
      signal_init( take_sweep_done, 0 );
      restart_sweep;
   END;  & single_sweep &
```

```
SCONTROL.WORK.PD8510            THU, DEC 22, 1983, 10:30 AM     PAGE   8

#EJECT;
COMMENT                                                    continuous_sweep
**************************************************************************
*
* EXTERNAL SPECIFICATION FOR continuous_sweep
*
* FUNCTION: Aborts any active sweep, sets sweep mode to continuous, and
*           resumes sweep activity.
*
* PARAMETER DESCRIPTION:
*
*    INPUT:  none
*
*    OUTPUT: none
*
**************************************************************************
*
* LOGIC INFORMATION FOR continuous_sweep
*
* INTIAL REFINEMENT:
*
*    abort_sweep
*    number_of_groups := continuous
*    resume_sweep
*
**************************************************************************
;
SUBROUTINE continuous_sweep;                                       ENTRY;
   BEGIN & continuous_sweep &
      abort_sweep;
      number_of_groups := continuous;
                                   & needn't acquire control variables &
                                   &    since value is a single word.  &
      restart_sweep;
   END;  & continuous_sweep &
```

```
SCONTROL.WORK.PD8510            THU, DEC 22, 1983, 10:30 AM     PAGE   9

#EJECT;
COMMENT                                                             n_sweep
**************************************************************************
*
* EXTERNAL SPECIFICATION FOR n_sweep
*
* FUNCTION: Aborts any active sweep, sets sweep mode to n-sweeps, and.
*           resumes sweep activity.
*
* PARAMETER DESCRIPTION:
*
*    INPUT:  none
*
*    OUTPUT: none
*
**************************************************************************
*
* LOGIC INFORMATION FOR n_sweep
*
* INTIAL REFINEMENT:
*
*    abort_sweep
*    number_of_groups := n
*    restart_sweep
*
**************************************************************************
;
PROCEDURE  n_sweep(n);
   VALUE   n;                                                      ENTRY;
   INTEGER n;
   BEGIN & n_sweep &
      IF n > 1 THEN
         BEGIN & if &
            abort_sweep;
            number_of_groups := n; & needn't acquire control variables &
                                   &    since value is a single word.  &
            signal_init( take_sweep_done, 0 );
            restart_sweep;
         END   & if &
      ELSE IF n = 1 THEN
         single_sweep;
&     ELSE
         no action       &
   END;  & n_sweep &
```

```
SCONTROL.WORK.PD8510          THU, DEC 22, 1983, 10:30 AM     PAGE  10

$EJECT;
COMMENT                                                                   sweep
**************************************************************************
*
* EXTERNAL SPECIFICATION FOR sweep
*
* FUNCTION: Sets up parameters (source, test-set, receiver, phase-lock).
*           Initiates as many sweeps as required to acquire all of the
*           acquisition parameters.
*
* PARAMETER DESCRIPTION:
*
*    INPUT:  none
*
*    OUTPUT: none
*
* COMMENTS:
*    The concept of multiple channels is implemented at this level.
* Above this level, everything pertains to the instrument as a whole
* (both channels).
*
**************************************************************************
*
* LOGIC INFORMATION FOR sweep
*
* INTIAL REFINEMENT:
*
*   FOR acquisition_param := first TO last DO
*      BEGIN
*         acquire( control_variables )
*         set up parameter
*         release( control_variables )
*         sweep source
*      END
*
**************************************************************************
;
PROCEDURE  sweep;
   BEGIN & sweep &
      INTEGER acquisition_param;
      BOOLEAN success;

      success := TRUE;
      FOR acquisition_param := first_acquisition_param WHILE
         ((acquisition_param <= last_acquisition_param) AND success) DO
         BEGIN & for &
            acquire(control_variables);
            success := set_up_param( acquisition_param, inhibit_lock );
            release(control_variables);
            IF success AND (NOT abort) THEN
               BEGIN & if &
                  success := maintain_sweep;
                  success := success AND (NOT abort);
               END   & if &
            ELSE
               preempt;
```

```
SCONTROL.WORK.PD8510          THU, DEC 22, 1983, 10:30 AM     PAGE  11

         END;  & for &

   END;  & sweep &
```

```
SCONTROL.WORK.PD8510          THU, DEC 22, 1983, 10:30 AM     PAGE  12

$EJECT;
COMMENT                                                                   step
**************************************************************************
*
* EXTERNAL SPECIFICATION FOR step
*
* FUNCTION: Sets up parameters (source, test-set, receiver, phase-lock).
*           Controls the stimulus to measure the required number of
*           points.  Makes as many stepped sweeps as required to
*           acquire all of the acquisition parameters.
*
* PARAMETER DESCRIPTION:
*
*    INPUT:  none
*
*    OUTPUT: none
*
* COMMENTS:
*    The concept of multiple channels is implemented at this level.
* Above this level, everything pertains to the instrument as a whole
* (both channels).
*
**************************************************************************
*
* LOGIC INFORMATION FOR step
*
* INTIAL REFINEMENT:
*
*       prev_set := 0.
*       FOR param_set := first_param_set UNTIL last_param_set DO
*          BEGIN   for param_set
*
*             FOR stimulus_value := start STEP step_size UNTIL stop DO
*                BEGIN   for stimulus_value
*
*                   acquire(control_variables).
*                            don't allow updates except between steps
*                   step_stimulus(stimulus_value).
*
*                   FOR acquisition_param := 1 +
*                               last_param_of_set[prev_set]
*                         UNTIL last_param_of_set[param_set] DO
*                      BEGIN   for acquisition_param
*                         set up parameter.
*                         trigger_yadc.
*                      END.    for acquisition_param
*                   release(control_variables).      allow updates now
*                   preempt.
*
*                END.    for stimulus_value
*             prev_set := param_set.
*
*          END.    for param_set
*
**************************************************************************
;
```

```
SCONTROL.WORK.PD8510          THU, DEC 22, 1983, 10:30 AM     PAGE  13

PROCEDURE  step;
   BEGIN & step &
      BOOLEAN success;
      INTEGER param_set,
              prev_set,
              acquisition_param,
              stimulus_value,
              lock_type;

      prev_set := 0;
      success := TRUE;
      FOR param_set := first_param_set WHILE
                    ( (param_set <= last_param_set) AND success ) DO
         BEGIN & for param_set &
            LABEL level1_exit;

            & round-about way to tell "break" before "step" &  & DEBUG &
            acquire(control_variables);                        & DEBUG &
            success := set_up_param( 1+last_param_of_set[prev_set],
                                     inhibit_lock
                                   );                          & DEBUG &
            release(control_variables);                        & DEBUG &
            IF (NOT success) OR abort THEN
               BEGIN & if &
                  preempt;
                  GO TO level1_exit;
               END;  & if &
            init_auto_range;

            FOR stimulus_value := start STEP step_size WHILE
                           ((stimulus_value <= stop) AND success) DO
               BEGIN & for stimulus_value &
                  LABEL level2_exit;

                  lock_type := force_lock;    & due to freq. change &
                  acquire(control_variables);
                           & don't allow updates except between steps &
                  success := step_stimulus(stimulus_value);
                  IF (NOT success) OR abort THEN
                     BEGIN & if &
                        release( control_variables );
                        preempt;
                        GO TO level2_exit;
                     END;  & if &

                  FOR acquisition_param := 1+last_param_of_set[prev_set]
                        WHILE (
                     (acquisition_param <= last_param_of_set[param_set])
                     AND success
                           ) DO
                     BEGIN & for acquisition_param &
                        success := set_up_param( acquisition_param,
                                                 lock_type
                                               );
                        IF success AND (NOT abort) THEN
                           BEGIN & if &
```

```
                        lock_type := normal_lock;
                        auto_ranging( acquisition_param );
                        trigger_yadc;
                     END   & if &
                  ELSE
                     preempt;
                  success := success AND (NOT abort);
               END;  & for acquisition_param &
            release(control_variables);   & allow updates now &
            preempt;
level2_exit:
            success := success AND (NOT abort);
         END;  & for stimulus_value &
         prev_set := param_set;
level1_exit:
         success := success AND (NOT abort);
      END;  & for param_set &
   END;  & step &
```

```
#EJECT;
COMMENT                                                          do_cw
*************************************************************************
*
* EXTERNAL SPECIFICATION FOR do_cw
*
* FUNCTION: Sets up parameters (source, test-set, receiver, phase-lock).
*           Measures the specified point for each acquisition parameter.
*
* PARAMETER DESCRIPTION:
*
*    INPUT:  none
*
*    OUTPUT: none
*
* COMMENTS:
*    The concept of multiple channels is implemented at this level.
* Above this level, everything pertains to the instrument as a whole
* (both channels).
*
*************************************************************************
*
* LOGIC INFORMATION FOR do_cw
*
* INTIAL REFINEMENT:
*
*        set_stimulus(stimulus_value).
*
*        acquire(control_variables).
*        FOR acquisition_param := first_acquisition_param UNTIL
*                                   last_acquisition_param DO
*           BEGIN   for
*              set up parameter.
*              trigger_yadc.
*           END.    for
*        release(control_variables).                  allow updates now
*        preempt.
*
*************************************************************************
;
PROCEDURE  do_cw;
   BEGIN & do_cw &
      BOOLEAN success;
      INTEGER acquisition_param,
              stimulus_value,
              lock_type,
              point,
              word,
              data = REGISTER 5;
      INTEGER POINTER first_point = REGISTER 10,
                      destination = REGISTER 11;
      LABEL   cw_exit;

      SUBROUTINE replicate;
         BEGIN & replicate &
```

```
            STPNTR( first_point, raw_base[acquisition_param] );
            FOR word := 1 UNTIL 3 DO
               BEGIN & for word &
                  data := first_point;
                  ASSEMBLE( MOVE.L first_point, destination;
                            ADDQ.L =D6,       destination
                          );
                  FOR point := step_size STEP step_size UNTIL stop DO
                     BEGIN & for point &
                        destination := data;
                        ASSEMBLE( ADDQ.L =D6, destination );
                     END;  & for point &
                  ASSEMBLE( ADDQ.L =D2, first_point );
               END;  & for word &
         END;  & replicate &

      & round-about way to tell "break" before frequency change &
      acquire( control_variables );
      IF NOT set_up_param( first_acquisition_param, inhibit_lock ) THEN
         GO TO cw_exit;
      release( control_variables );
      init_auto_range;

      lock_type := force_lock;   & due to possible acq'n param. change &
      acquire( control_variables );    & don't allow update until done &
      IF NOT step_stimulus( cw ) THEN
         GO TO cw_exit;

      success := TRUE;
      FOR acquisition_param := first_acquisition_param WHILE
          ((acquisition_param <= last_acquisition_param) AND success) DO
         BEGIN & for acquisition_param &
            success := set_up_param( acquisition_param, lock_type );
            IF success AND (NOT abort) THEN
               BEGIN & if &
                  lock_type := normal_lock;
                  auto_ranging( acquisition_param );
                  trigger_yadc;
                  replicate;
               END   & if &
            ELSE
               preempt;
            success := success AND (NOT abort);
         END;  & for acquisition_param &
cw_exit:
      release(control_variables);                   & allow updates now &
      preempt;

   END;  & do_cw &
```

```
#EJECT;
COMMENT                                                          group
*************************************************************************
*
* EXTERNAL SPECIFICATION FOR group
*
* FUNCTION:
*    Controls the stimulus and data acquisition for one group of
* measurements.  Implements swept, stepped, and cw.
*
* PARAMETER DESCRIPTION:
*
*    INPUT:  none
*
*    OUTPUT: none
*
* COMMENTS:
*    Everything at this level applies to the instrument as a whole
* (both channels).
*
*************************************************************************
*
* LOGIC INFORMATION FOR group
*
* INTIAL REFINEMENT:
*
*        init_group.                          initialize group parameters.
*
*
*        CASE sweep_mode OF
*           BEGIN   case
*  swept       sweep.
*  stepped     step.
*  cw          do_cw.
*           END.    case
*
*************************************************************************
;
SUBROUTINE init_group;
   BEGIN & init_group &

      acquire(group_ready_rin);        & since two processes can't wait  &
                                       &    on the same signal.          &
      send(enable_group_ready);        & wait for any pending processing &
      wait(group_ready);               &    to be completed.             &
      release(group_ready_rin);

      calib_yadc( full_if_cal );       & yadc will decide if necessary   &

      acquire(control_variables);
      init_group_control_vars;         & resets pointers and signals.    &
      release(control_variables);

      IF group_number < max_group_number THEN
         group_number := group_number + 1;

   END;  & init_group &
```

```
SCONTROL.WORK.PD8510          THU, DEC 22, 1983, 10:30 AM      PAGE  18


PROCEDURE  group;
   BEGIN & group &
      INTEGER fifo_word;
      BYTE    fifo_word_upper = fifo_word,
              fifo_word_lower = fifo_word+1;

      init_group;

      IF last_acquisition_param < first_acquisition_param THEN
         abort := TRUE
      ELSE IF (NOT abort) THEN
         CASE sweep_mode OF
            BEGIN & case &
& swept &       sweep;
& stepped &     step;
& cw &          do_cw;
            END;  & case &

      & do any required array processing now &

      IF (NOT abort) THEN
         BEGIN & if &
            fifo_word_lower := update_raw_array;
            fifo_word_upper := array_processed AND %01;        & ch1 ? &
            IF fifo_word_upper <> 0 THEN
               write_fifo( array_update_fifo, fifo_word );
            fifo_word_upper := array_processed AND %02;        & ch2 ? &
            IF fifo_word_upper <> 0 THEN
               write_fifo( array_update_fifo, fifo_word );
         END;  & if &

   END;  & group &
```

```
SCONTROL.WORK.PD8510          THU, DEC 22, 1983, 10:30 AM      PAGE  19

$EJECT;
COMMENT                                                                control
************************************************************************
*
* EXTERNAL SPECIFICATION FOR control
*
* FUNCTION:
*    Controls the stimulus and data acquisition for repeated identical
* groups of measurements.  Implements single sweep, n sweep, and
* continuous sweep.  See ADEF.WCC for definition of "group".
*
* PARAMETER DESCRIPTION:
*
*    INPUT:  none
*
*    OUTPUT: none
*
* COMMENTS:
*    Everything at this level applies to the instrument as a whole
* (both channels).
*
************************************************************************
*
* LOGIC INFORMATION FOR control
*
* INITIAL REFINEMENT:
*
*    initialize control parameters.
*
*    DO forever
*       BEGIN   do
*
*          break_idle.    wait for measurements to be resumed
*
*          reset control parameters.
*
*          IF number_of_goups > 0 THEN
*             REPEAT number_of_groups DO
*                group
*          ELSE
*             WHILE number_of_groups = continuous AND (NOT abort) DO
*                group.
*
*       END.    do
*
************************************************************************
;
SUBROUTINE init_control;
   BEGIN & init_control &

      init_break;
      init_xadc;                 & must come after variables are init'd  &
      init_yadc;                 &    and all is ready for interrupts.   &
      signal_init( take_sweep_done, 0 );

COMMENT     load ch1 and ch2 data (freq, pwr, speed) into source
```

```
SCONTROL.WORK.PD8510          THU, DEC 22, 1983, 10:30 AM      PAGE  20

      set up control variables (switch labels, which get/put
            pointers to use, etc.)
      crank up data processing process(es).
      reset # averages to zero.
      ;
   END;  & init_control &


PROCEDURE  reset_control;
   BEGIN & reset_control &
      INTEGER latest_cmd;

      calib_yadc(force_cal); & it may have been a while since last cal.&
      group_number := -1;          & assures one group without averaging &

      & take care of the highlights &
      IF number_of_groups = continuous THEN
         latest_cmd := cmd_continuous
      ELSE IF number_of_groups = hold THEN
         latest_cmd := cmd_hold
      ELSE IF number_of_groups = single THEN
         latest_cmd := cmd_single
      ELSE
         latest_cmd := cmd_n_groups_kbd;
      hilight_key(latest_cmd, cmd_hold, cmd_continuous);

   END;  & reset_control &


PROCEDURE  control;     & a process &                          ENTRY;
   BEGIN & control &
      LABEL again,
            control_abort;

      init_control;

again:
      DO
         BEGIN & do &
            IF awaited( take_sweep_done ) THEN          & "TS" waiting&
               send( take_sweep_done );
            abort := FALSE;
            break_idle;
               COMMENT  this idle routine provides for HP-IB and
               bottom box interrupts while there is no active
               measurement taking place.  It will return when
               measurements are resumed.
               ;
            IF control_debug THEN                          & DEBUG &
               BEGIN                                       & DEBUG &
                  WSTR("control: number_of_groups = ");    & DEBUG &
                  WHEX(number_of_groups);                  & DEBUG &
                  CRLF;                                    & DEBUG &
               END;                                        & DEBUG &
```

```
SCONTROL.WORK.PD8510          THU, DEC 22, 1983, 10:30 AM      PAGE  21

         END  & do &
      UNTIL rebuild OR
            ( ( number_of_groups <> hold )                          AND
              ( NOT abort )                                         AND
              ( last_acquisition_param >= first_acquisition_param )
            );

      IF NOT abort THEN
         reset_control;

      IF number_of_groups > 0 THEN
         REPEAT number_of_groups DO
            IF abort THEN
               GO TO control_abort
            ELSE
               group
      ELSE
         WHILE (number_of_groups = continuous) AND (NOT abort) DO
            group;

      IF (NOT abort) THEN
         BEGIN & if not abort &
            IF measuring_std_data THEN
               BEGIN & if &
                  cal_acquisition_done;
                  restart_sweep;
               END   & if &
            ELSE
               number_of_groups := hold;

            set_serial_poll( op_complete_srq );
         END;  & if not abort &

control_abort:
      hilight_key (cmd_hold, cmd_hold, cmd_continuous);

      GO TO again;

   END;  & control &


END$
```

```
FCONTV2.WORK.PD8510            THU, DEC 22, 1983, 10:30 AM     PAGE   1

EXTERNAL BOOLEAN rebuild;
EXTERNAL BYTE    array_processed;
```

```
FCONTVAR.WORK.PD8510           THU, DEC 22, 1983, 10:30 AM     PAGE   1

#FILE ccontvar.work;

EXTERNAL INTEGER        last_param_set;
EXTERNAL BYTE    ARRAY last_param_of_set[0:max_param_set];
EXTERNAL INTEGER        last_acquisition_param;
EXTERNAL INTEGER        current_acquisition_param;
EXTERNAL BYTE    ARRAY param    [1:max_acquisition_param];
EXTERNAL BYTE    ARRAY ch       [1:max_acquisition_param];
EXTERNAL DOUBLE  ARRAY raw_base [1:max_acquisition_param];
EXTERNAL DOUBLE  ARRAY raw_put  [1:max_acquisition_param];
EXTERNAL DOUBLE  ARRAY dp_raw_base[ 1:max_ch, s11:s22 ];

PROCEDURE  reset_acquisition_descriptor;                    EXTERNAL;
PROCEDURE  partial_new_step_size( new_size );
   VALUE   new_size;
   INTEGER new_size;                                        EXTERNAL;
PROCEDURE  new_step_size( new_size );
   VALUE   new_size;
   INTEGER new_size;                                        EXTERNAL;
BOOLEAN PROCEDURE set_up_param( new_acquisition_param, lock_type );
   VALUE   new_acquisition_param, lock_type;
   INTEGER new_acquisition_param;
   BOOLEAN lock_type;                                       EXTERNAL;
PROCEDURE set_dp_ptrs( chnl, table, ch_trace );
   VALUE   chnl, table, ch_trace;
   INTEGER chnl, table, ch_trace;                           EXTERNAL;
```

```
CCONTVAR.WORK.PD8510           THU, DEC 22, 1983, 10:30 AM     PAGE   1

INTEGER CONSTANT  swept      := 0,                     & sweep modes &
                  stepped    := 1,
                  single_pt  := 2;

INTEGER CONSTANT  continuous := -1, & number of groups per sweep mode. &
                  hold       := 0,
                  single     := 1;

INTEGER CONSTANT  start      := 0,                   & stimulus values &
                  stop       := 800,
                  center     := 400,
                  span       := 800;

INTEGER CONSTANT  inhibit_lock := 0,      & set_up_param lock parameter &
                  normal_lock  := 1,
                  force_lock   := 2;

& PARAMETER SET CONSTANTS &

INTEGER CONSTANT  max_param_set             := 8,
                  first_param_set           := 1;

& ACQUISITION PARAMETER CONSTANTS &

INTEGER CONSTANT  max_acquisition_param   := 8,
                  first_acquisition_param := 1;

& PARAMETER DESCRIPTOR CONSTANTS &

INTEGER CONSTANT  s11            := 1,   & values correspond to "annot" &
                  s21            := 2,   &  tables in "pfr", bitmap in &
                  s12            := 3,   &  "scal0", format_map in     &
                  s22            := 4,   &  "datap", fnt_table in      &
                  z1             := 5,   &  "acompute", constants in   &
                  z2             := 6,   &  "cdatap" and "ccompute".   &
                  y1             := 7,
                  y2             := 8,
                  user1          := 9,
                  user2          := 10,
                  user3          := 11,
                  user4          := 12,
                  max_parameter  := 12,           & CHANGE ALSO IN fpfr &
                  null_param     := -1;
INTEGER CONSTANT  generic_param := s11; & must have same relationship  &
                                        &    to s-params as dp_raw_get &
                                        &    of cdatap.                &
INTEGER CONSTANT  numerator_port         := 1,     & relative order used &
                  denominator_port       := 2,     & by testset file and &
                  driven_port            := 3,     & test-set ID string. &
                  phase_lock_port        := 4,
                  parameter_conversion   := 5,     &\_ not used together &
                  attenuator             := 5,     &/                    &
                  max_parameter_entry    := 5;     & CHANGE ALSO IN fpfr &
```

```
SCONTVAR.WORK.PD8510           THU, DEC 22, 1983, 10:30 AM     PAGE   1

M68KL,P,"contvar"
BEGIN

#FILE facttbl.work;
#FILE fgratic.work;
#FILE fcontrol.work;
#FILE fstring.work;
#FILE fprivib.work;
#FILE fxadc.work;
#FILE fyadc.work;
#FILE ccontvar.work;
#FILE fsize.work;
#FILE fkernel.work;
#FILE fkernel4.work;
#FILE fstimuli.work;
#FILE fstimul2.work;
#FILE ftestset.work;
#FILE fdatap.work;
#FILE cchtable.work;
#FILE fchtable.work;
#FILE fchtab2.work;
#FILE fchtab3.work;
#FILE fchdata.work;
#FILE fmemmgr.work;
#FILE crins.work;
#FILE cids.work;
#FILE fchpfr.work;
#FILE ffnt.work;
#FILE cresp.work;
#FILE fmenu.work;
#FILE cmessag2.work;                      & for exceeded_avilable_memory &
#FILE futil2.work;                                         & for fatal &
#FILE ccal.work;
#FILE fbreak.work;
#FILE ctrace.work;
#FILE catin.work;                & for cmd_51_points and cmd_401_points &
#FILE cdebugc2.work;                                 & for forced_step &
#FILE ftrace2.work;                & for release_mem and repaint_traces &
#FILE fscreen2.work;                            & for trace1_base, etc. &
#FILE fannot.work;                         & for annotate_enhancements &
#FILE ftime2.work;                                    & for user3_zero &

EXTERNAL INTEGER ARRAY counter[0:1];      & Semaphore counters from     &
                                          &    kernel, only for yadc    &
                                          &    and data processing via  &
                                          &    chtable.                 &
EXTERNAL BYTE ARRAY link[0:1];            & Links for queues, and       &
                                          & pointers to head of queues  &
                                          & from kernel, only for yadc  &
                                          & and data processing via     &
                                          & chtable.                    &
```

```
SCONTVAR.WORK.PD8510            THU, DEC 22, 1983, 10:30 AM     PAGE   2

#EJECT;

INTEGER TABLE cmd :=                                & indexed by step size &
      & 0 &   0,
      & 1 &   0, & cmd_801_points when/if implemented &
      & 2 &   cmd_401_points,
      & 3 &   0,
      & 4 &   cmd_201_points,
      & 5 &   0,
      & 6 &   0,
      & 7 &   0,
      & 8 &   cmd_101_points,
      & 9 &   0,
      & 10 &  0,
      & 11 &  0,
      & 12 &  0,
      & 13 &  0,
      & 14 &  0,
      & 15 &  0,
      & 16 &  cmd_51_points;

BYTE    CONSTANT newline :=   10;                     & ASCII line feed   &
INTEGER CONSTANT none := -1;        & for initialization of current param &
BYTE    CONSTANT all_chs := %03;              & bit set for each channel &
DOUBLE CONSTANT dp_f_bit_bucket := %80000;                 & address of ROM &

GLOBAL INTEGER current_acquisition_param;
```

```
SCONTVAR.WORK.PD8510            THU, DEC 22, 1983, 10:30 AM     PAGE   3

#EJECT;
COMMENT
.......................................................................
.
.  ACQUISITION DESCRIPTOR
.
.  Variables for control of the sequencing of acquisition parameters.
.  Indexed by acquisition parameter.
.
.......................................................................
;
GLOBAL INTEGER       last_param_set;
GLOBAL BYTE ARRAY    last_param_of_set[0:max_param_set];
GLOBAL INTEGER       last_acquisition_param;
GLOBAL BYTE ARRAY    param     [1:max_acquisition_param];
                               & index into parameter descriptor table. &
GLOBAL BYTE ARRAY    ch        [1:max_acquisition_param];
                     & bit map of channels that use/need this parmeter &
                     & if more than one ch is set, only the first      &
                     & one's descriptor will be used.                  &
GLOBAL DOUBLE  ARRAY raw_base [1:max_acquisition_param];
                                   & address of raw_data arrays. &
GLOBAL DOUBLE  ARRAY raw_put  [1:max_acquisition_param];
                                   & temp storage during chopped &
INTEGER ARRAY        raw_ready[1:max_acquisition_param];
GLOBAL DOUBLE  ARRAY dp_raw_base[ 1:max_ch, #11:#22 ];

GLOBAL BYTE          array_processed;                 & bit/ch boolean &

GLOBAL BOOLEAN rebuild;       & rebuild acquisition descriptor if TRUE &
INTEGER param_map;     & bit map of allocated raw arrays, by parameter &
```

```
SCONTVAR.WORK.PD8510            THU, DEC 22, 1983, 10:30 AM     PAGE   4

#EJECT;
COMMENT                                                      chs_are_same
***********************************************************************
*
***********************************************************************
;
BOOLEAN PROCEDURE  chs_are_same;
   BEGIN & chs_are_same &
      INTEGER avg_mode_1,
              avg_mode_2;

      avg_mode_1 := ch_integer(ch_average_mode,1);
      avg_mode_2 := ch_integer(ch_average_mode,2);
      chs_are_same := ( avg_mode_1 = avg_mode_2 )               AND
                      ( coupled_ch(ch_start_frequency) )        AND
                      ( ( avg_mode_1 = avg_off )             OR
                        ( ch_integer(ch_average_factor,1) =
                          ch_integer(ch_average_factor,2)
                        )
                      );

   END;  & chs_are_same &
```

```
SCONTVAR.WORK.PD8510            THU, DEC 22, 1983, 10:30 AM     PAGE   5

EJECT;
COMMENT                                    reset_acquisition_descriptor
***********************************************************************
*
***********************************************************************
;
PROCEDURE  reset_acquisition_descriptor;                           ENTRY;
   BEGIN & reset_acquisition_descriptor &
      INTEGER  parameter,
               chnl;

acquire(control_variables);

& initialize acquisition parameter descriptor & current_acquisition_param := none;
      current_acquisition_ch := no_ch;

FOR parameter := 1 UNTIL max_acquisition_param DO
         BEGIN & for &
            ch[parameter] := 0;
            raw_base[parameter] := 0;
         END;  & for &
      last_acquisition_param := 0;
      last_param_set := 0;            & last_param_of_set[0] = 0 always &
      last_param_of_set[0] := 0;
      param_map := 0;
      rebuild := FALSE;

FOR chnl := 1 TO max_ch DO
         BEGIN & for &
            set_ch_double( 0, ch_d_base, chnl );
            set_ch_double( 0, ch_f_base, chnl );
            set_ch_double( 0, ch_m_base, chnl );
         END;  & for & set_ch_double( ADRS(trace1_base),   ch_trace_base,   1 );
      set_ch_double( ADRS(trace1_m_base), ch_m_trace_base, 1 );
      set_ch_double( ADRS(trace2_base),   ch_trace_base,   2 );
      set_ch_double( ADRS(trace2_m_base), ch_m_trace_base, 2 );

release(control_variables);

END;  & reset_acquisition_descriptor &
```

```
SCONTVAR.WORK.PD8510            THU, DEC 22, 1983, 10:30 AM     PAGE   6

#EJECT;
COMMENT                                       clear_acquisition_descriptor
**************************************************************************
*
**************************************************************************
;
PROCEDURE  clear_acquisition_descriptor;
   BEGIN & clear_acquisition_descriptor &
      INTEGER  parameter;

      IF last_acquisition_param > 0 THEN
         FOR parameter := 1 UNTIL last_acquisition_param DO
            BEGIN & for &
               IF raw_base[parameter] <> 0 THEN
                  release_array( raw_base[parameter] );
               ch[parameter] := 0;
               raw_ready[parameter] := raw_ready_bit_bucket;
            END;  & for &
      last_acquisition_param := 0;
      last_param_set := 0;              & last_param_of_set[0] = 0 always &
      param_map := 0;
      array_processed := 0;

   END;  & clear_acquisition_descriptor &
```

```
SCONTVAR.WORK.PD8510            THU, DEC 22, 1983, 10:30 AM     PAGE   7

#EJECT;
COMMENT                                                        enter_param
**************************************************************************
*
*  Makes all of the entries in the acquisition parameter descriptor
*  table, except for the raw_ready signal value, which must be the last
*  acquisition parameter for a channel after sorting.
*
*  Returns the address of the raw_base array.
*
**************************************************************************
;
DOUBLE PROCEDURE enter_param( parameter, channel );
   VALUE   parameter, channel;
   INTEGER parameter, channel;
   BEGIN & enter_param &
      INTEGER old_param_map,
              param_index;

      old_param_map := param_map;
      param_map := SBIT(param_map, parameter);

      IF chs_are_same AND (old_param_map = param_map) THEN
         & chs are same and raw was already allocated that may be used &
         BEGIN & if &
            param_index := 0;
            DO
               param_index := param_index + 1
            UNTIL param[param_index] = parameter;
         END   & if &
      ELSE & must allocate a new raw array &
         BEGIN & else &
            param_index :=
                  last_acquisition_param := last_acquisition_param + 1;
            param[param_index] := parameter;
            IF ( raw_base[param_index] := request_array(block_size)
               ) = 0 THEN
               fatal( exceeded_available_memory );
            raw_ready[param_index] := raw_ready_bit_bucket;
         END;  & else &

      ch[param_index] := SBIT( ch[param_index], channel-1 );
      enter_param := raw_base[param_index];

   END;  & enter_param &
```

```
SCONTVAR.WORK.PD8510            THU, DEC 22, 1983, 10:30 AM     PAGE   8

#EJECT;
COMMENT                                                              build
**************************************************************************
*
*  Trace must be aborted (abort_sweep) prior to calling this routine
*  since the pointers are modified herein.
*
*  Check -- may need to acquire(control_variables).
*
**************************************************************************
;
PROCEDURE  build;
   BEGIN & build &
      BYTE      done_mask,
                old_driven_port,
                new_driven_port,
                domain;
      INTEGER  channel,
                first_ch,
                last_ch,
                parameter,
                these_params;

      rebuild := FALSE;
      clear_acquisition_descriptor;

      IF trace_mode = single_ch THEN
         first_ch := last_ch := current_entry_ch
      ELSE
         BEGIN & else &
            first_ch := 1;
            last_ch  := 2;
         END;  & else &

      FOR channel := first_ch UNTIL last_ch DO
         IF ch_integer(ch_d_state, channel) = d_on THEN
            BEGIN & if &
               IF ( (ch_integer(ch_correction_mode, channel) =
                                                 correct_on) AND
                  (ch_integer(ch_correction_type, channel) = two_port)
                  ) THEN
                  BEGIN & if &
                     dp_raw_base[channel,s11] :=
                                       enter_param(s11, channel);
                     dp_raw_base[channel,s21] :=
                                       enter_param(s21, channel);
                     dp_raw_base[channel,s12] :=
                                       enter_param(s12, channel);
                     dp_raw_base[channel,s22] :=
                                       enter_param(s22, channel);
                  END   & if &
               ELSE
                  dp_raw_base[channel,generic_param] :=
                     enter_param(ch_integer(ch_param,channel),channel);

               domain := ch_integer(ch_domain, channel);
```

```
SCONTVAR.WORK.PD8510            THU, DEC 22, 1983, 10:30 AM     PAGE   9

               IF ( (domain = tdr_domain ) OR (domain = time_domain) OR
                  (ch_integer(ch_gating, channel) = gate_on)       OR
                  (sweep_mode = single_pt)
                  ) THEN
                  array_processed := SBIT(array_processed, (channel-1));
            END;  & if &
                                                              & DEBUG &
      & sort either here or below &                           & DEBUG &

      & NOTE: one ch_finished_signal will always remain as _bit_bucket.&
      set_ch_integer( raw_ready_bit_bucket, ch_finished_signal, 1 );
      set_ch_integer( raw_ready_bit_bucket, ch_finished_signal, 2 );
      IF last_acquisition_param > 0 THEN
         BEGIN & if &
            parameter := last_acquisition_param;
            done_mask := all_chs AND (NOT array_processed );
                                  & all point processed channels &
            WHILE ( (done_mask <> 0) AND
                  (parameter >= first_acquisition_param) `
                  ) DO
               BEGIN & while &
                  these_params := ch[parameter] AND done_mask;
                  IF these_params <> 0 THEN
                     BEGIN & if &
                        IF these_params = 1 THEN
                           raw_ready[parameter] := ch1_raw_ready
                        ELSE IF these_params = 2 THEN
                           raw_ready[parameter] := ch2_raw_ready
                        ELSE & both 1 and 2 &
                           BEGIN & else &
                              raw_ready[parameter] := ch1_raw_ready;
                              set_ch_integer( ch2_raw_ready,
                                              ch_finished_signal,
                                              1
                                            );
                              & NOTE: ch1's ch_finished_signal will    &
                              &      always remain ..._bit_bucket.     &
                           END;  & else &
                        done_mask := done_mask - these_params;
                     END;  & if &
                  parameter := parameter - 1;
               END;  & while &
         END;  & if &
                                                              & DEBUG &
      & sort either here or above &                           & DEBUG &

      last_param_set := first_param_set;
      old_driven_port := parameter_descriptor[
                                 param[ first_acquisition_param ],
                                 driven_port
                                     ];
      IF ( (last_acquisition_param > 1) AND
         (slow_test_set)    & until it handles sets better & & DEBUG &
         ) THEN
         FOR parameter := first_acquisition_param + 1 UNTIL
               last_acquisition_param DO
```

```
        BEGIN & for &
           new_driven_port := parameter_descriptor[
                                        param[ parameter ],
                                        driven_port
                                        ];
           IF new_driven_port <> old_driven_port THEN
              BEGIN & if &
                 last_param_of_set[last_param_set] := parameter - 1;
                 last_param_set := last_param_set + 1;
                 old_driven_port := new_driven_port;
              END;  & if &
        END;  & for &
     last_param_of_set[last_param_set] := last_acquisition_param;

     build_test_set;

     acquire( processing_variables );
     control_data_proc( 1 );
     control_data_proc( 2 );
     release( processing_variables );

  END;  & build &
```

```
#EJECT;
COMMENT                                                   partial_new_step_size
***********************************************************************
*
***********************************************************************
;
PROCEDURE  partial_new_step_size( new_size );
   VALUE  new_size;
   INTEGER new_size;                                                 ENTRY;
   BEGIN & partial_new_step_size &
      INTEGER            chnl,
                         points;
      DOUBLE             array;
      REAL               min_sweep_time;
      INTEGER CONSTANT string_size := 24;
      BYTE ARRAY         temp_array[-1:string_size];
      ALPHA              temp_string;

      & initialize string &
      temp_string := ADRS(temp_array);
      temp_string := init_string( temp_string, string_size );

      step_size := new_size;
      points := number_of_points;
      rebuild := TRUE;
      hilight_key( cmd[step_size], cmd_51_points, cmd_401_points);

      min_sweep_time := 0.000200 * REAL(points-1);
      wrt_priv_ib_source(
               tl,
               append_ch(  format_real(   min_sweep_time,
                                          temp_string,
                                          format_table[
                                                sweep_time_format
                                                ]
                                             AND %FFFFFF0F
                                        ),
                           newline
                         )
             );            & mask to set no format scale factor &

      set_xadc_step_size( step_size );

      & RELEASE ALL ARRAYS &
      FOR chnl := 1 TO max_ch DO
         BEGIN & for &
            array := ch_double( ch_d_base, chnl );
            release_array( array );
            set_ch_double( 0, ch_d_base, chnl );

            array := ch_double( ch_f_base, chnl );
            release_array( array );
            set_ch_double( 0, ch_f_base, chnl );

            array := ch_double( ch_m_base, chnl );
            release_array( array );
```

```
            set_ch_double( 0, ch_m_base, chnl );

            release_mem;
         END;  & for &

      FOR chnl := 1 TO max_ch DO
         BEGIN & for &
            IF ( array := request_array(block_size) ) <> 0 THEN
               BEGIN & if &
                  set_ch_double( array, ch_d_base, chnl );
                  user3_zero( array, points );
               END;  & if &

            IF array <> 0 THEN
               IF ( array := request_array(block_size) ) <> 0 THEN
                  BEGIN & if &
                     set_ch_double( array, ch_f_base, chnl );
                     user3_zero( array, points );
                  END;  & if &

            IF array = 0 THEN
               fatal( exceeded_available_memory );
         END;  & for &

      repaint_traces;    & reallocates memory array and updates traces &

      IF sweep_mode = stepped THEN
         update_stimulus_step_size;

   END;  & partial_new_step_size &
```

```
#EJECT;
COMMENT                                                       new_step_size
***********************************************************************
*
***********************************************************************
;
PROCEDURE  new_step_size( new_size );
   VALUE  new_size;
   INTEGER new_size;                                                 ENTRY;
   BEGIN & new_step_size &

      abort_sweep;
      partial_new_step_size( new_size );
      trace_and_graticule;
      restart_sweep;

   END;  & new_step_size &
```

```
SCONTVAR.WORK.PD8510          THU, DEC 22, 1983, 10:30 AM     PAGE  14

#EJECT;
COMMENT                                                        set_up_param
***********************************************************************
*
***********************************************************************
;                                              %
BOOLEAN PROCEDURE set_up_param( new_acquisition_param, lock_type );
  VALUE   new_acquisition_param, lock_type;
  INTEGER new_acquisition_param, lock_type;                        ENTRY;
  BEGIN & set_up_param &
    INTEGER parameter,
            average_factor,
            average_mode;
    BOOLEAN do_lock,
            success;
    LABEL   exit;

    current_acquisition_param := new_acquisition_param;
    IF ( ch[current_acquisition_param] AND %0001 ) = 0 THEN
       select_acquisition_ch( 2 )
    ELSE
       select_acquisition_ch( 1 );

    & change any required parameter-related factors here &

    success := set_test_set( current_acquisition_param, do_lock );
    IF NOT success THEN
       GO TO exit;

    IF acquisition_ch_integer(ch_average_mode) = avg_off THEN
       average_mode := avg_off
    ELSE & averaging on &
       BEGIN & else &
          average_factor := acquisition_ch_integer(ch_average_factor);
          IF sweep_mode = swept THEN
             BEGIN & else if &
                average_mode := avg_sweep_to_sweep;
                IF group_number < average_factor THEN
                   average_factor := group_number;
             END  & else if &
          ELSE & sweep_mode = stepped &
             average_mode := avg_point_to_point;
       END;  & else &

    control_yadc(
                 ADRS( raw_put[current_acquisition_param] ),
                 average_mode,
                 average_factor,
                 ADRS( counter[
                        raw_ready[current_acquisition_param]
                          ]
                     ),
                 SBIT(0,link[
                        raw_ready[current_acquisition_param]
                          ]
                     )
```

```
SCONTVAR.WORK.PD8510          THU, DEC 22, 1983, 10:30 AM     PAGE  15

                );

    parameter := param[ current_acquisition_param ];
    control_receiver( parameter_descriptor[ parameter AND %003F,
                                            numerator_port
                                          ],
                      parameter_descriptor[ parameter AND %003F,
                                            denominator_port
                                          ],
                      parameter_descriptor[ parameter AND %003F,
                                            phase_lock_port
                                          ],
                      if_test_gain,
                      if_ref_gain
                    );

    IF ( (NOT forced_step) AND
         ( (lock_type = force_lock) OR
           ( (lock_type = normal_lock) AND do_lock )
         )
       ) THEN
       phase_lock;

exit: set_up_param := success;

  END; & set_up_param &
```

```
SCONTVAR.WORK.PD8510          THU, DEC 22, 1983, 10:30 AM     PAGE  16

#EJECT;
COMMENT                                                         set_dp_ptrs
***********************************************************************
*
*  Sets up the pointers for data processing (datap).
*  Parameters:
*     chnl  -- the channel being updated.  Determines the processing
*              variables to be used (e.g. scale/division, etc.).
*              "chnl" is 1, or 2.
*     table -- the dp pointer table to use.  For point-wise data
*              processing, table = chnl. For array processing and
*              updates, table = 0.
*              "table" is 0, 1, or 2.
*     ch_trace -- the channel table index for the trace to be displayed.
*              "ch_trace" is ch_trace_base, or ch_m_trace_base.
*
***********************************************************************
;
PROCEDURE set_dp_ptrs( chnl, table, ch_trace );
  VALUE   chnl, table, ch_trace;
  INTEGER chnl, table, ch_trace;                                  ENTRY;
  BEGIN & set_dp_ptrs &
    DOUBLE POINTER dp_double;

    STPNTR(dp_double, ch_dp_ptrs[table]);

    dp_double[dp_raw11_get]    := dp_raw_base[chnl, s11];
    dp_double[dp_raw21_get]    := dp_raw_base[chnl, s21];
    dp_double[dp_raw12_get]    := dp_raw_base[chnl, s12];
    dp_double[dp_raw22_get]    := dp_raw_base[chnl, s22];

    dp_double[dp_correct_ptr] := ch_double(ch_e_coeff_base, chnl);
    dp_double[dp_d_ptr]       := ch_double(ch_d_base, chnl);
    dp_double[dp_m_ptr]       := ch_double(ch_m_base, chnl);
    dp_double[dp_trace_ptr]   := ch_double(ch_trace,  chnl);

    IF ( (ch_trace = ch_m_trace_base) AND
         (ch_integer(ch_d_state, chnl) = d_on)
       ) THEN
       dp_double[dp_f_ptr] := dp_f_bit_bucket  & m cannot wipe out d &
    ELSE
       dp_double[dp_f_ptr] := ch_double(ch_f_base, chnl);

  END;  & set_dp_ptrs &
```

```
SCONTVAR.WORK.PD8510          THU, DEC 22, 1983, 10:31 AM     PAGE  17

#EJECT;
COMMENT                                            init_group_control_vars
***********************************************************************
*
* EXTERNAL SPECIFICATION FOR init_group_control_vars
*
* FUNCTION
*    To initialize the variables at the beginning of each group.
*
* PARAMETER DESCRIPTION:
*
*    INPUT:  none
*
*    OUTPUT: none
*
* EXTERNAL EFFECTS:
*
* COMMENTS:
*
***********************************************************************
*
* LOGIC INFORMATION FOR init_group_control_vars
*
* INITIAL REFINEMENT:
*
***********************************************************************
;
PROCEDURE  init_group_control_vars;                               ENTRY;
  BEGIN & init_group_control_vars &
    INTEGER i,
            last;

    annotate_enhancements;

    IF rebuild THEN
       build;

    set_dp_ptrs( 1, 1, ch_trace_base );
    set_dp_ptrs( 2, 2, ch_trace_base );

    IF last_acquisition_param >= first_acquisition_param THEN
       FOR i := first_acquisition_param TO last_acquisition_param DO
          raw_put[i] := raw_base[i];          & reset raw_put pointers &

COMMENT  These signal_init steps are only required the first time a
         measurement begins after power on, recall, preset, or an
         aborted sweep.  Normally, the data processing is simply waiting
         for the next point and only the data pointers need to be reset.
         ;
    signal_init(ch1_raw_ready,-1);
    link[ ch1_raw_ready ] := ch1_id;
    signal_init(ch2_raw_ready,-1);
    link[ ch2_raw_ready ] := ch2_id;
    signal_init(raw_ready_bit_bucket,-1);
    link[ raw_ready_bit_bucket ] := idle_process;            & a dummy &
```

```
SCONTVAR.WORK.PD8510            THU, DEC 22, 1983, 10:31 AM     PAGE  18

COMMENT
     reset signals to go with the d, f, n, trace, and raw arrays.
;
     reset_data_proc;      & tell data proc. that a group is starting &

  END;  & init_group_control_vars &
```

```
SCONTVAR.WORK.PD8510            THU, DEC 22, 1983, 10:31 AM     PAGE  19

#EJECT;
COMMENT                                                    init_control_variables
*********************************************************************************
*
*********************************************************************************
;
PROCEDURE  init_control_variables;                                        ENTRY;
   BEGIN & init_control_variables &
      INTEGER parameter;

      resource_init(processing_variables);
      resource_init(control_variables);

      reset_acquisition_descriptor;

   END;  & init_control_variables &


END$
                                                                        & DEBUG &
                                                                        & DEBUG &
                                                                        & DEBUG &
```

```
SCONTVAR.WORK.PD8510            THU, DEC 22, 1983, 10:31 AM     PAGE  20

#EJECT;                                                             & DEBUG &
PROCEDURE dump_acquisition_descriptor;                              & DEBUG &
   BEGIN & dump_acquisition_descriptor &                            & DEBUG &
      INTEGER i;                                                    & DEBUG &
         CRLF; WSTR("acquisition descriptor: "); CRLF;              & DEBUG &
         WSTR("   last_param_of_set[]"); CRLF;                      & DEBUG &
         WSTR("        last_param_set:"); WHex(last_param_set,2);& DEBUG &
         CRLF;                                                      & DEBUG &
         FOR i := 0 UNTIL last_param_set DO                         & DEBUG &
            BEGIN & for &                                           & DEBUG &
               WSTR("          ");                                  & DEBUG &
               WHex(i,2);                                           & DEBUG &
               WSTR("   ");                                         & DEBUG &
               WHex(last_param_of_set[i],2);                        & DEBUG &
               CRLF;                                                & DEBUG &
            END;  & for &                                           & DEBUG &
         WSTR("   acquisition_param_descriptor: ");                 & DEBUG &
         WSTR("(param, ch, raw, signal)"); CRLF;                    & DEBUG &
         WSTR("        last_acquisition_param:");                   & DEBUG &
         WHex(last_acquisition_param,2); CRLF;                      & DEBUG &
         IF last_acquisition_param <> 0 THEN                        & DEBUG &
            FOR i := 1 UNTIL last_acquisition_param DO              & DEBUG &
               BEGIN & for &                                        & DEBUG &
                  WSTR("          ");                               & DEBUG &
                  WHex(i,2);                                        & DEBUG &
                  WSTR("   ");                                      & DEBUG &
                  WHex(param[i],2);                                 & DEBUG &
                  WHex(ch[i],2);                                    & DEBUG &
                  WHex(raw_base[i],8);                              & DEBUG &
                  WHex(raw_ready[i],2);                             & DEBUG &
                  CRLF;                                             & DEBUG &
               END;  & for &                                        & DEBUG &
         WSTR("        ch1 finished signal = ");                    & DEBUG &
         WHex(ch_integer(ch_finished_signal,1),2); CRLF;            & DEBUG &
         WSTR("        ch2 finished signal = ");                    & DEBUG &
         WHex(ch_integer(ch_finished_signal,2),2); CRLF;            & DEBUG &
   END;  & dump_acquisition_descriptor &                            & DEBUG &
```

```
ACORRECT.WORK.PD8510            THU, DEC 22, 1983, 10:31 AM     PAGE   1

 ASMB,R,L
   HED error correction routines
   NAM correct,7,"JTB      PD8510"
 UNL
*
 ENT one_port_correct,two_port_correct
 ENT s_coeff
*
 EXT ADDE_ptr,SUBE_ptr,MPYE_ptr,DIVE_ptr
 EXT ADDE,SUBE,MPYE,DIVE,DVRE
*
*
R0  REG 0
R1  REG 1
R2  REG 2
R3  REG 3
R4  REG 4
R5  REG 5
R6  REG 6
R7  REG 7
R8  REG 8
R9  REG 9
R10 REG 10
R11 REG 11
R12 REG 12
R13 REG 13
G   REG 13
M   REG 14
S   REG 15
*
 RAM det(8)
 RAM coeff(64)   b11 a11 b21 a21 b22 a22 b12 a12
*                 0   8   10  18  20  28  30  38   HEX byte offset
 ORB
*                    take off base page ???
det_coeff HEX 0008,0028,0018,0038               a11*a22 - a21*a12
a11_coeff HEX 0000,0028,0018,0030               b11*a22 - a21*b12
a21_coeff HEX 0010,0028,0018,0020               b21*a22 - a21*b22
a12_coeff HEX 0008,0030,0000,0038               a11*b12 - b11*a12
a22_coeff HEX 0008,0020,0010,0038               a11*b22 - b21*a21
s_coeff EQU det_coeff
*
cpx_1 HEX 0000,4000     imag part = 0  real part = 1/2
      HEX 0000,0001      exp part = 1
 ENT cpx_1
 ORR
```

```
ACORRECT.WORK.PD8510            THU, DEC 22, 1983, 10:31 AM     PAGE   2

*EJECT
***********************************************************************
* one_port correction  assumes R8 constains a ptr to the first error
*          coeff and R10 has the offset needed to get each of the others
*          R0/R1 has the measured value and this will exit with the
*          corrected value in R0/R1
*
*                                     ( meas - directivity )
*   s11 actual   =   ------------------------------------------------
*                         tracking  +  source match * ( meas - directivity )
***********************************************************************
one_port_correct EQU *
 JSR      SUBE_ptr          directivity
 MOVE.L   R0,   R5
 MOVE.W   R1,   R6         save a copy of measured-directivity for later
*
 ADD.W    R10,   R8
 JSR      MPYE_ptr         source match
*
 ADD.W    R10,   R8
 JSR      ADDE_ptr         tracking
*
*
 MOVE.L   R5,   R2
 MOVE.L   R6,   R3
*
 JMP      DVRE
*RTS      rts is implied in DVRE
*
```

```
ACORRECT.WORK.PD8510            THU, DEC 22, 1983, 10:31 AM     PAGE   3

*EJECT
***********************************************************************
*two_port_correct                                 run time 1 mS/pt
*                              5 cpx div,8 cpx mult,6 cmp sub,2 real add
* R0/R1 = S11,   R2/R3 = S21,   R4/R5 = S12,   R6/R7 = S22
* R8 has ptr to error terms,  R10 has offset between error terms
* R11/R12 have data that must be saved
* R8/R9 is used by math routines  (data in R0/R3)
* R12 will used as ptr to processed error terms
* R13 contains the index descirbing the S parameter to output
* and R0/R1 on exit has result
* Order (structure) of error coeffs is VERY important  ( see scal )
*  e     e     e     e     e     e     e     e     e     e     e     e
*   DF    SF    RF    XF    LF    TF    DR    SR    RR    XR    LR    TR
***********************************************************************
* MOVEM of a's / b's and the cpx_1  would be faster with MOVE.L/MOVE.W
***********************************************************************
two_port_correct EQU *
 MOVEM.L  R2/R3/R11/R12,-(S)             save for later
 LEA      coeff, R12
*
 BSR      comp_coeff                     b11
 MOVEM.L  cpx_1 ,R2/R3
 JSR      ADDE
 MOVE.L   R0,(R12)+                      a11
 MOVE.L   R1,(R12)+
*
 MOVEM.L  (S)+,R0/R1
 BSR      comp_coeff                     b21
 MOVE.L   R0,(R12)+                      a21
 MOVE.L   R1,(R12)+
*
 MOVE.L   R6,  R0
 MOVE.W   R7,  R1
 BSR      comp_coeff                     b22
 MOVEM.L  cpx_1 ,R2/R3
 JSR      ADDE
 MOVE.L   R0,(R12)+                      a22
 MOVE.L   R1,(R12)+
*
 MOVE.L   R4,  R0
 MOVE.W   R5,  R1
 BSR      comp_coeff                     b12
 MOVE.L   R0,(R12)+                      a12
 MOVE.L   R1,(R12)+
*
 MOVEM.L  det_coeff,R6/R7
 BSR      use_coeff                      det
 MOVEM.L  R0/R1,det
 MOVEM.L  (R13),R6/R7                  R13 has addr of item in s_coeff
 BSR      use_coeff                      selected parameter
 MOVEM.L  det,R2/R3
 MOVEM.L  (S)+,R11/R12
 JMP      DIVE                            result
*RTS  is implied in DIVE
```

```
ACORRECT.WORK.PD8510            THU, DEC 22, 1983, 10:31 AM     PAGE   4

*EJECT
*
*                    compute the interdeneniate terms ie a's and b's
*
*                                   Measured  -  Leakage
*                      b term  =  ----------------------
*                                        Tracking
*
*                      a term  =  b term   *   Match
*                                 NOTE: In a term 11,22 a +1 is added
comp_coeff EQU *
 AND.W    #HFF, R1
 JSR      SUBE_ptr
 ADD.W    R10 , R8
 MOVE.L   R8,   R11
 ADD.W    #6,   R8
 ADD.W    R10 , R8
 JSR      DIVE_ptr
 MOVE.L   R0,(R12)+                save b term
 MOVE.L   R1,(R12)+
 ADD.W    R10 , R8
 MOVE.L   (R11)+,R2
 MOVE.W   (R11), R3
 JMP      MPYE                     compute a term
*RTS      rts is inpilied in mpye
*
*
*                    compute a product difference (w*x)-(y*z)
*                    where the terms are the a's and b's terms
*                    R6 and R7 hold indexes to which term to use
*                    R6  upper half is w index, R7 lower half is x index
*                    R7  upper half is y index, R7 lower half is z index
*                    R12 holds the pointer to first coeff
use_coeff EQU *
 LEA      coeff, R12
 MOVEM.L  0(R12,R7.W),R0/R1
 SWAP     R7
 MOVEM.L  0(R12,R7.W),R2/R3
 JSR      MPYE                      y*z term
 MOVE.L   R0,   R4                  save
 MOVE.W   R1,   R5
 MOVEM.L  0(R12,R6.W),R0/R1
 SWAP     R6
 MOVEM.L  0(R12,R6.W),R2/R3
 JSR      MPYE                      w*x term
 MOVE.L   R4,   R2                  restore y*z
 MOVE.W   R5,   R3
 JMP      SUBE                      result
*RTS      rts is inplied in sube
*
*
 END
```

```
FCOUPLE.WORK.PD8510             THU, DEC 22, 1983, 10:31 AM     PAGE   1

#FILE ccpltbl.work;

PROCEDURE  set_coupled_status( status, index );
  VALUE   status, index;
   BOOLEAN status;
   INTEGER index;                                        EXTERNAL.L;
SUBROUTINE init_coupled_status;                          EXTERNAL.L;
```

```
SCOUPLE.WORK.PD8510          THU, DEC 22, 1983, 10:31 AM     PAGE  1

M68KL,P,"couple"
BEGIN

                                                  & for tables &
#FILE fcpltbl.work;                       & for select_coupled &
#FILE fchtab3.work;                        & for coupled_break &
#FILE fbreak.work;
#FILE cchtable.work;             & for ch_... and chtable entry sizes &
```

```
SCOUPLE.WORK.PD8510          THU, DEC 22, 1983, 10:31 AM     PAGE  2

#EJECT;
COMMENT                                              set_coupled_status
*************************************************************************
*
*************************************************************************
;
PROCEDURE  set_coupled_status( status, index );
   VALUE   status, index;
   BOOLEAN status;                                                ENTRY;
   INTEGER index;
   BEGIN & set_coupled_status &

      IF index = couple_source THEN
         coupled_break( status );

      WHILE coupled_chtable_size[index] <> 0 DO
         BEGIN & while &
            select_coupled( status,
                            coupled_chtable_index[index],
                            coupled_chtable_size[index]
                          );
            index := index + 1;
         END;  & while &

   END;  & set_coupled_status &
```

```
SCOUPLE.WORK.PD8510          THU, DEC 22, 1983, 10:31 AM     PAGE  3

#EJECT;
COMMENT                                              init_coupled_status
*************************************************************************
*
*************************************************************************
;                                                                 ENTRY;
SUBROUTINE init_coupled_status;
   BEGIN & init_coupled_status &
      set_coupled_status( FALSE, couple_init );
      set_coupled_status( TRUE,  couple_stimulus );
      select_coupled( TRUE, ch_gate_stop, gsz );
   END;  & init_coupled_status &

ENDS
```

```
CCPLTBL.WORK.PD8510          THU, DEC 22, 1983, 10:31 AM     PAGE  1

COMMENT starting indices into scouple's coupled_ch_table_index and
        coupled_chtable_size tables.
        ;
INTEGER CONSTANT  couple_source   :=  0,
                  couple_init     := 15,
                  couple_markers  := 34,
                  couple_stimulus := 40;
```

```
FCPLTBL.WORK.PD8510              THU, DEC 22, 1983, 10:31 AM     PAGE   1

#FILE ccpltbl.work;

EXTERNAL INTEGER TABLE coupled_chtable_index.L;
EXTERNAL BYTE    TABLE coupled_chtable_size.L;
```

```
SCPLTBL.WORK.PD8510              THU, DEC 22, 1983, 10:31 AM     PAGE   1

M68KL,P,"cpltbl"
BEGIN

#FILE cchtable.work;                        & for ch_... and chtable entry sizes &

GLOBAL INTEGER TABLE coupled_chtable_index :=   & 0 size = end of list &
& 0 &       ch_start_frequency,                         & couple_source &
& 1 &       ch_center_frequency,
& 2 &       ch_start_aux_out,
& 3 &       ch_center_aux_out,
& 4 &       ch_start_time,
& 5 &       ch_center_time,
& 6 &       ch_gate_start,
& 7 &       ch_gate_center,
& 8 &       ch_gate_stop,
& 9 &       ch_sweep_time,
& 10 &      ch_source_power,
& 11 &      ch_power_slope,
& 12 &      ch_power_slope_mode,
& 13 &      ch_e_coeff_base,
& 14 &      0,
& 15 &      ch_basis_s_param,                           & couple_init &
& 16 &      ch_refl_trans,
& 17 &      ch_param_conversion,
& 18 &      ch_format,
& 19 &      ch_scale,
& 20 &      ch_ref_value,
& 21 &      ch_ref_position,
& 22 &      ch_raw11_base,
& 23 &      ch_raw21_base,
& 24 &      ch_raw12_base,
& 25 &      ch_raw22_base,
& 25 &      ch_d_base,
& 27 &      ch_f_base,
& 28 &      ch_m_base,
& 29 &      ch_trace_base,
& 30 &      ch_m_trace_base,
& 31 &      ch_finished_signal,
& 32 &      ch_channel_no,
& 33 &      0,
& 34 &      ch_marker1,                                 & couple_markers &
& 35 &      ch_marker2,
& 36 &      ch_marker3,
& 37 &      ch_marker4,
& 38 &      ch_marker5,
& 39 &      0,
& 40 &      ch_e_coeff_base,                            & couple_stimulus &
& 41 &      ch_start_stimulus,
& 42 &      ch_stop_stimulus,
& 43 &      ch_center_stimulus,
& 43 &      ch_span_stimulus,
& 44 &      0;

GLOBAL BYTE TABLE coupled_chtable_size :=       & use 0 for end of list &
& 0 &       qsz,                                        & couple_source &
```

```
SCPLTBL.WORK.PD8510              THU, DEC 22, 1983, 10:31 AM     PAGE   2

& 1 &       qsz,
& 2 &       qsz,
& 3 &       qsz,
& 4 &       qsz,
& 5 &       qsz,
& 6 &       qsz,
& 7 &       qsz,
& 8 &       qsz,
& 9 &       rsz,
& 10 &      rsz,
& 11 &      rsz,
& 12 &      isz,
& 13 &      dsz,
& 14 &        0, & end marker &
& 15 &      isz, & couple_init &
& 16 &      isz,
& 17 &      isz,
& 18 &      isz,
& 19 &      rsz,
& 20 &      rsz,
& 21 &      rsz,
& 22 &      dsz,
& 23 &      dsz,
& 24 &      dsz,
& 25 &      dsz,
& 26 &      dsz,
& 27 &      dsz,
& 28 &      dsz,
& 29 &      dsz,
& 30 &      dsz,
& 31 &      isz,
& 32 &      isz,
& 32 &        0, & end marker &
& 34 &      qsz, & couple_markers &
& 35 &      qsz,
& 36 &      qsz,
& 37 &      qsz,
& 38 &      qsz,
& 39 &        0, & end marker &
& 40 &      dsz, & couple_stimulus &
& 41 &      qsz,
& 42 &      qsz,
& 43 &      qsz,
& 44 &      qsz,
& 45 &      0;    & end marker &

END$
```

```
ACPX.WORK.PD8510                 THU, DEC 22, 1983, 10:31 AM     PAGE   1

ASMB,R
      HED COMPLEX FOR M68000
      NAM CPX,7,"MOD JTB 12/22/82"
      ENT ADD1,ADD1A,ADD1M,ADD1T
      ENT SUB1,SUB1A,SUB1M,SUB1T
      ENT SBR1,SBR1A,SBR1M,SBR1T
      ENT MPY1,MPY1A,MPY1M,MPY1T
      ENT DIV1,DIV1A,DIV1M,DIV1T
      ENT DVR1,DVR1A,DVR1M,DVR1T
      ENT NEG1,RNEG1
      ENT ADD1G,SUB1G,SBR1G,MPY1G
      ENT DIV1G,DVR1G
      ENT MPYE,ADDE,SUBE,SBRE,DIVE,DVRE
      ENT MPYE_ptr,ADDE_ptr,SUBE_ptr,SBRE_ptr,DIVE_ptr,DVRE_ptr
      ENT MPYE_ptrs
      ENT CNV1E,CNVE1,CNVe1,CNVE20_1
      ENT CNV1E_save,fetch_CNVE1
      ENT CNV2E
      ENT copy_user3
      ENT exp_overflow
*
*
      EXT ADDCP,SUBCP,MCPMP,MCPDIV
      EXT LDRAA,LDRAG,LDRAM,LDRAT,NEG2,RNEG2
      EXT ADD2,SUB2,SBR2,MPY2,DVR2
*
R0 REG 0
R1 REG 1
R2 REG 2
R3 REG 3
R4 REG 4
R8 REG 8              R5,R6,R7  are assumed to be unused
R9 REG 9
G  REG 13
R10 REG 10
M REG 14
S REG 15
```

```
*EJECT
*
*  The TYPE 1 routines are 24 bit real and imag mantissas and
*   seperate 8 bit exponents
*
NEG1  JSR    NEG2    NEGATE REAL
      JSR    RNEG2   NEGATE IMAGINARY
      RTS
*
RNEG1 EXG    R0,R2
      JSR    NEG2
      EXG    R0,R2
      EXG    R0,R3
      JSR    NEG2
      EXG    R0,R3
      RTS
```

```
*EJECT
*
ADD1A JSR    LDRAA
      BRA    ADD1
ADD1G JSR    LDRAG
      BRA    ADD1
ADD1M JSR    LDRAM
      BRA    ADD1
ADD1T JSR    LDRAT
ADD1  EXG    R0,R3
      JSR    ADD2
      EXG    R0,R2
      MOVE.L R3,R1
      JSR    ADD2
      MOVE.L R2,R1
      RTS
*
SUB1A JSR    LDRAA
      BRA    SUB1
SUB1G JSR    LDRAG
      BRA    SUB1
SUB1M JSR    LDRAM
      BRA    SUB1
SUB1T JSR    LDRAT
      BRA    SUB1
SBR1A JSR    LDRAA
      BRA    SBR1
SBR1G JSR    LDRAG
      BRA    SBR1
SBR1M JSR    LDRAM
      BRA    SBR1
SBR1T JSR    LDRAT
      BRA    SBR1
SBR1  EXG    R0,R2
      EXG    R1,R3
SUB1  EXG    R0,R3
      JSR    SBR2
      EXG    R0,R3
      MOVE.L R2,R1
      JSR    SUB2
      MOVE.L R3,R1
      RTS
```

```
*EJECT
*
MPY1A JSR    LDRAA
      BRA    MPY1
MPY1G JSR    LDRAG
      BRA    MPY1
MPY1M JSR    LDRAM
      BRA    MPY1
MPY1T JSR    LDRAT
MPY1  MOVEM.L R0-R1/R4,-(S)  SAVE REGISTERS
      MOVE.L R2,R0
      JSR    MPY2    B*C
      MOVE.L R0,R4
      MOVE.L R3,R0
      MOVE.L (S),R1
      JSR    MPY2    A*D
      MOVE.L R4,R1
      JSR    ADD2    AD+BC
      MOVE.L R0,R4
      MOVE.L R2,R0
      MOVE.L (S)+,R1
      JSR    MPY2    A*C
      EXG    R0,R3
      MOVE.L (S)+,R1
      JSR    MPY2    B*D
      MOVE.L R3,R1
      JSR    SBR2    AC-BD
      MOVE.L R4,R1   RETRIEVE IMAGINARY PART
      MOVE.L (S)+,R4 RESTORE R4
      RTS
*
exp_overflow EQU *
EXPOVF BPL   EXPOVF1
      MOVE.B =H7F, R1
      RTS
EXPOVF1 MOVE.B =H80, R1
      RTS
```

```
*EJECT
*
DIV1A JSR    LDRAA
      BRA    DIV1
DIV1G JSR    LDRAG
      BRA    DIV1
DIV1M JSR    LDRAM
      BRA    DIV1
DIV1T JSR    LDRAT
      BRA    DIV1
DVR1A JSR    LDRAA
      BRA    DVR1
DVR1G JSR    LDRAG
      BRA    DVR1
DVR1M JSR    LDRAM
      BRA    DVR1
DVR1T JSR    LDRAT
DVR1  EXG    R0,R2
      EXG    R1,R3
*
*     A+jB/C+jD = (A+jB)(C-jD)/(C*C+D*D)
*
DIV1  MOVEM.L R0-R4,-(S)
      MOVE.L R2,R0
      MOVE.L R2,R1
      JSR    MPY2
      EXG    R0,R3
      MOVE.L R0,R1
      JSR    MPY2    D*D
      MOVE.L R3,R1
      JSR    ADD2    C*C+D*D
      MOVE.L R0,R4
      MOVEM.L (S)+,R0-R3
      EXG    R0,R3
      JSR    NEG2
      EXG    R0,R3
      BSR    MPY1
      MOVE.L R0,R2
      MOVE.L R4,R0
      JSR    DVR2
      EXG    R0,R4
      MOVE.L R2,R1
      JSR    DVR2
      MOVE.L R4,R1
      MOVE.L (S)+,R4   RESTORE R4
      RTS
```

```
ACPX.WORK.PD8510              THU, DEC 22, 1983, 10:31 AM     PAGE   6

*EJECT
* Convert a real to USER3 with rounding
*PROCEDURE CNV2E( r ) ;   VALUE r;      REAL r;
*BEGIN
* DOUBLE d_r = r, d = REGISTER 1;;
*   d  :=  d_r + %08000;
*   IF OVERFLOW THEN
*     d:=((d+1) AND %FF) OR (IF  d<0  THEN  %40000000  ELSE %C0000000 );
*   ASSEMBLE( MOVE.L d, R0;   MOVE.W   R0, R1;   CLR.W  R0;  SWAP   R0 )
*END CNV2E;
CNV2E EQU *
  ADD.L   =H00008000,R0
  BVC     A3
  MOVE.B  R0, R1
  ADD.B   #1, R1
  TST.L   R0
  BGE     A4
  MOVE.L  =H40000000,R0
  BRA     A5
A4 MOVE.L =HC0000000,R0
A5 OR.B   R1, R0
A3 MOVE.W R0, R1
  CLR.W   R0
  SWAP    R0
  RTS
```

```
ACPX.WORK.PD8510              THU, DEC 22, 1983, 10:31 AM     PAGE   7

*EJECT
*
CNV1E_save EQU *
      BSR CNV1E
      SWAP R0
      MOVE.W  R0, (R8)+
      SWAP R0
      MOVE.W  R0, (R8)+
      AND.W  =H00FF,R1
      MOVE.W  R1, (R8)+
      RTS
*
* converts 4 word 24 bit complex to 3-word 16 bit complex ( USER3 )
* rounding is done                                 ( exp lower half R1 )
* during rounding exp overflows may occur and was not corrected
CNV1E EQU *
FIXUP TST.L R0
      BNE FU1                      zero check real part
      MOVE =HC0, R0
FU1   TST.L R1
      BNE FU2                      zero check imag part
      MOVE =HC0, R1
FU2   CMP.B R0,R1
      BEQ FUP1                     branch if exps are equal
      MOVE R4,-(S)                 else adjust the smaller part
      MOVE.B R1, R4
      SUB.B  R0, R4                exp difference is in R4
      BVC FUP2
      BPL FUP3
      MOVE.B =H7F, R4              positive exp difference overflow
      BRA FUP2
FUP3  MOVE.B =H80, R4              negative exp difference overflow
FUP2  BPL FUP4
      CMP.B #-16, R4               Imag exp is smaller
      BGE FUP5                     more than 16 bits ??
      CLR.L R1                     yes  -- imag part is zero
      BRA FUP8
FUP5  NEG.B R4                     no   -- shift imag part
      ASR.L R4, R1
      BRA FUP8
FUP4  CMP.B #16, R4                Real exp is smaller
      BLE FUP7                     more than 16 bits ??
      CLR.L R0                     yes  -- real part is zero
      BRA FUP71
FUP7  ASR.L R4, R0                 no  -- shift real part
FUP71 MOVE.B R1, R0                more exp into R0
FUP8  MOVE (S)+, R4
FUP1  ADD.L =H08000,R0             Real/Imag normalized -- Round each
      BVC FUV1                     start on real part
      AND =H0FF,R0                 rounding caused overflow
      ADD.L =HC0000001,R0          set real part = 1/2
      ASR.L #1, R1                 fix exp
FUV1  ADD.L =H08000,R1             Round imag
      BVC FUV2
      MOVE.L =H40000000,R1         rounding caused overflow
      ADD #1, R0                   set imag part = 1/2
```

```
ACPX.WORK.PD8510              THU, DEC 22, 1983, 10:31 AM     PAGE   8

      ADD R0, R0                   fix exp
      ASR.L #1, R0
FUV2  SWAP R0                      Rearrange into proper order
      MOVE R0, R1
      EXG R0, R1
      SWAP R1
      RTS
```

```
ACPX.WORK.PD8510              THU, DEC 22, 1983, 10:31 AM     PAGE   9

*EJECT
*
fetch_CMVE1 EQU *
      MOVEM.L (R8), R0-R1
CMVE1 EQU *                        exp is upper half of R1/complier format
      SWAP   R1
CMVe1 EQU *                        exp is in lower word of R1
      CLR R2
      MOVE.B R1,R2
      MOVE.L R0, R1
      SWAP   R0
      MOVE.W R2, R0
      MOVE.W R2, R1
      RTS
*
CMVE20_1 EQU *
      SWAP   R1
      MOVE.W R1,R2
      MOVE.L R0,R1
      SWAP   R0
      MOVE.W R2,R1
      AND.W  =HF0FF,R1
      ASL.W  #4,R2
      MOVE.W R2,R0
      MOVE.B R1,R0
      AND.W  =HF0FF,R0
      RTS
***
```

```
RCPX.WORK.PD8510                THU, DEC 22, 1983, 10:31 AM     PAGE 10

*EJECT
*
* copy user3 arrays to new part of memory
*  PROCEDURE copy_user3( from_addr,  to_addr,  size  );
*                        VALUE from_addr, to_addr,  size;
*                       DOUBLE from_addr, to_addr;  INTEGER size;
*
*  note size is the number of point steps to move.
*  note R0,R1,R2,R8,R9 are used and not restored
copy_user3 EQU *
      LINK  M, #-4
      MOVE.L  R0,    R8
      MOVE.L  8(M), R9
      MOVE.W  12(M),R2
      BRA     cu2
*
cu1   EQU *
      MOVEM.L  (R8), R0-R1    accquire data in a non_interruptable way
      SWAP     R0
      MOVE.W   R0,    (R9)+
      SWAP     R0
      MOVE.W   R0,    (R9)+
      ADD.W    #6,     R8                 inc R8 by user 3 size
      SWAP     R1
      MOVE.W   R1,    (R9)+
cu2   DBRA     R2,    cu1
*
      UNLK     M
      MOVE.L  (S)+,    R8
      ADDQ.L  =D6,    S
      JMP    (R8)
***
```

```
RCPX.WORK.PD8510                THU, DEC 22, 1983, 10:31 AM     PAGE 11

*EJECT
*
*
* This series of math routines for the three word (16 bit) complex type
*  assume a pointer to the second operator is in R8 if a _ptr entry
*  or in R2 and exp in R3.B and the first operator is
*  in R0 and exp in R1.B. These routines will destory R0/R3 and R9.
*
* entry point ptrs assume the R8 is ptr to first operataand and
*   R10 is ptr to second
*
MPYE_ptrs MOVE =LMCPMP,R9
 MOVE.L     (R8)+, (R9)+           LDM1,LDM3; LDM0,LDM2;
 MOVE.L     (R10)+, (R9)+          LDA1; LDA3, DUAL, SUMPR, GO UMPYFP;
 MOVE.W     (R8)+, R0
 MOVE.W     (R10)+, R1
 ADD.B      R0, R1
 BVC        M9A01
 BRA        M9A03
*
MPYE MOVE =LMCPMP, R9
 MOVE.L     R2   , (R9)+           LDM1,LDM3; LDM0,LDM2;
 MOVE.L     R0, (R9)+              LDA1; LDA3, DUAL, SUMPR, GO UMPYFP;
 ADD.B      R3, R1
 BVC        M9A01
 BRA        M9A03
*
MPYE_ptr MOVE =LMCPMP, R9
 MOVE.L     (R8)+, (R9)+           LDM1,LDM3; LDM0,LDM2;
 MOVE.L     R0, (R9)+              LDA1; LDA3, DUAL, SUMPR, GO UMPYFP;
 MOVE.W     (R8)+, R0
 ADD.B      R0, R1
 BVC        M9A01
M9A03 BSR EXPOVF
M9A01 ADDQ #1, R9
 ADD.B      (R9)+, R1               RDEXP
 BVC        M9A02
 BSR        EXPOVF
M9A02 MOVE.L (R9),  R0               RDA0;RDA2
 RTS
```

```
RCPX.WORK.PD8510                THU, DEC 22, 1983, 10:31 AM     PAGE 12

*EJECT
*
ADDE MOVE =LADDCP, R9
A9A04 MOVE.L R0, (R9)+
 MOVE.L      R2  , (R9)+
 MOVE.W      R3  , R2
A9A05 SUB.B R1, R2
 BVC         A9A1
 BRA         A9A03
*
ADDE_ptr MOVE =LADDCP, R9
A9A01 MOVE.L R0, (R9)+
 MOVE.L    (R8)+, (R9)+
 MOVE.W    (R8)+, R2
A9A02 SUB.B R1, R2
 BVC        A9A1
A9A03  BPL A9A2
 ADD.B      R2, R1
 MOVE.W     =H7F, R2
 SUB.B      R2, R1
 BRA        A9A1
A9A2 MOVEQ =H80, R2
A9A1 MOVE R2, (R9)+
 TST.B      R2
 BMI        A9A3
 ADD.B      R2, R1
A9A3 MOVE.L (R9)+, R0
 MOVE.W     (R9)+, R2
 ADD.B      R2, R1
 BVS        EXPOVF
 RTS
```

```
RCPX.WORK.PD8510                THU, DEC 22, 1983, 10:31 AM     PAGE 13

*EJECT
*
*    (R8)-R0
SBRE MOVE =LSUBCP, R9
 BRA        A9A04
*
SBRE_ptr MOVE =LSUBCP, R9
 BRA        A9A01
*
*                      R0-(R8)
SUBE MOVE   =LSUBCP, R9
 MOVE.L     R2    , (R9)+
 MOVE.L     R0, (R9)+
 MOVE.W     R1, R2
 MOVE.W     R3    , R1
 BRA        A9A05
*
SUBE_ptr MOVE  =LSUBCP, R9
 MOVE.L     (R8)+, (R9)+
 MOVE.L     R0, (R9)+
 MOVE.W     R1, R2
 MOVE.W     (R8)+, R1
 BRA        A9A02
*
*                    (R8)/R0
DVRE MOVE =LMCPDIV, R9
 MOVE.L      R0, (R9)+
 EXG         R1, R3
 BRA         D9A01
*
DVRE_ptr MOVE =LMCPDIV, R9
 MOVE.L      R0, (R9)+
 MOVE.L      (R8)+, R2
 MOVE.W      R1, R3
 MOVE.W      (R8)+, R1
D9A01 SUB.B R3, R1
 ADD.B       #1, R1
 MOVE.L      R0, (R9)+
 MOVE.W     (R9)+, R0
 SUB        (R9)+, R1
 MOVE.L     =H20000000, R3
 MOVE.W     R0, R3
 BNE        D9A10
 MOVE.W    =H4000, R0
D9A10 ASR #1, R3
 MOVE.L    R2, (R9)+
 DIVS      R0, R3
 BVC       D9A20
 MOVE.W    =H4000, R3
 ADD.B     #1, R1
D9A20 MOVE R3, (R9)+
 MOVE.L   (R9)+, R0
 ADD      (R9)+, R1
 RTS
*
*                  R0/(R8)
```

```
ACPX.WORK.PD8510                THU, DEC 22, 1983, 10:31 AM     PAGE  14

DIVE MOVE =LMCPDIV, R9
 EXG      R0,   R2
 MOVE.L   R0, (R9)+
 BRA      D9A01
DIVE_ptr MOVE =LMCPDIV, R9
 MOVE.L   R0, R2
 MOVE.L   (R8)+, R0
 MOVE.W   (R8)+, R3
 MOVE.L   R0, (R9)+
 BRA      D9A01
*
*
      END


      IF ever needed

ABS1  MOVE.L R1,-(S)  SAVE IMAGINARY
      MOVE.L R0,R1
      JSRX   MPY2
      MOVE.L (S),R1   GET IMAGINARY
      MOVE.L R0,(S)
      MOVE.L R1,R0
      JSRX   MPY2
      JSRX   ADD2T
      CLR.L  R1
      JMPX   SQRT
RABS1 EXG    R0,R2
      EXG    R1,R3
      BSR    ABS1
      EXG    R0,R2
      EXG    R1,R3
      RTS
```

```
FDATAMGR.WORK.PD8510            THU, DEC 22, 1983, 10:31 AM     PAGE   1

PROCEDURE gen_save_menu(fn);
  VALUE fn;  INTEGER fn;                                          EXTERNAL.L;
PROCEDURE gen_cal_info (op);
 VALUE op;  INTEGER op;                                           EXTERNAL.L;
PROCEDURE save (reg); VALUE reg;  INTEGER reg;                    EXTERNAL.L;
PROCEDURE recall (reg); VALUE reg;  INTEGER reg;                  EXTERNAL.L;
PROCEDURE select_default_set (reg); VALUE reg; INTEGER reg;       EXTERNAL.L;
SUBROUTINE gen_last_reg_menu;                                     EXTERNAL.L;
SUBROUTINE save_last_state;                                       EXTERNAL.L;
SUBROUTINE recall_preset_state;                                   EXTERNAL.L;
SUBROUTINE recall_power_on_state;                                 EXTERNAL.L;
PROCEDURE new_data(type); VALUE type; INTEGER type;               EXTERNAL.L;

EXTERNAL ALPHA data_type_str.L;
```

```
CDATAP.WORK.PD8510              THU, DEC 22, 1983, 10:31 AM     PAGE   1

#FILE ctrace0.work;                                       & for update_... &
#FILE cdomain.work;                                       & for ..._domain &

COMMENT These are the values for the data processing control variables.
        The name in brackets is the channel table index value.
;
& format - [ch_format] &                         & marker readout/graticule&
& ------ changes in these values should also be made in "ACTIVE" ----- &
& ------ and in "FORMAT"and "DATAP"  --- &
INTEGER CONSTANT  fmt_log_mag          := 1,
                  fmt_linear_mag       := 2,
                  fmt_phase            := 3,
                  fmt_delay            := 4,
                  fmt_real             := 5,
                  fmt_imaginary        := 6,
                  fmt_log_polar        := 7, & log magnitude, phase    &
                  fmt_linear_polar     := 8, & linear magnitude, phase &
                  fmt_imag_vs_real     := 9, & polar graticule         &
                  fmt_z_smith          := 10,& Z:  real, imaginary     &
                  fmt_y_smith          := 11,& Y:  real, imaginary     &
                  fmt_swr              := 12,& SWR:  (1+mag)/(1-mag)   &
                  max_format           := 12;

& trace math - [ch_trace_math and ch_math_op] &
& ------ changes in these values should also be made in "TRACE2" ----- &
INTEGER CONSTANT  math_off             := 0,
                  math_d_times_m       := 1,
                  math_d_divided_by_m  := 2,
                  math_d_plus_m        := 3,
                  math_d_minus_m       := 4,
                  max_math             := 4;& equal to preceeding math &

& parameter conversion - [ch_param_conversion] &
INTEGER CONSTANT  conv_off             := 0,
                  conv_s_to_z          := 1,
                  conv_s_to_y          := 2,
                  conv_reciprocal      := 3;

& reflection/transmission - [ch_refl_trans] &
INTEGER CONSTANT  refl                 := 1,
                  trans                := 2;

& electrical length &
INTEGER CONSTANT  elec_length_off      := 0,
                  elec_length_on       := 1;

& smoothing - [ch_smoothing_mode], [ch_smoothing_aperture] has #&
INTEGER CONSTANT  smoothing_off        := 0,
                  smoothing_on         := 1;

& trace_mode &
INTEGER CONSTANT  overlay              := 0,
                  split                := 1,
                  single_ch            := 2;  & change also in srecall &
```

```
CDATAP.WORK.PD8510              THU, DEC 22, 1983, 10:31 AM     PAGE   2

& gating - [ch_gating] &
INTEGER CONSTANT  gate_off             := 0,
                  gate_on              := 1;

& windows - [ch_tdr_window, ch_gate_window, ch_time_window] &
INTEGER CONSTANT  min_window           := 0,
                  normal_window        := 1,
                  max_window           := 2,
                  min_gate             := 0,
                  normal_gate          := 1,
                  wide_gate            := 2,
                  max_gate             := 3;

& time domain mode - [ch_time_mode] &
INTEGER CONSTANT  envelope_time        := 0,
                  rf_time              := 1;

& tdr stimulus type - [ch_tdr_stimulus_type] &
INTEGER CONSTANT  step_tdr             := 0,
                  impulse_tdr          := 1;


&*********************************************************************&
INTEGER CONSTANT           dsize        := 4,
                           psize        := dsize,
                           rsize        := 4,
                           isize        := 2,
                           bsize        := 1;
INTEGER CONSTANT    dp_ptr_base       := 0,
                    dp_m_ptr          := dp_ptr_base + 0,
                    dp_d_ptr          := dp_ptr_base + 1,
                    dp_f_ptr          := dp_ptr_base + 2,
                    dp_trace_ptr      := dp_ptr_base + 3,
                    dp_raw11_get      := dp_ptr_base + 4,
                    dp_raw_get        := dp_raw11_get,
                    dp_raw21_get      := dp_ptr_base + 5,
                    dp_raw12_get      := dp_ptr_base + 6,
                    dp_raw22_get      := dp_ptr_base + 7,
                    dp_correct_ptr    := dp_ptr_base + 8,
                last_dp_ptr           :=(dp_ptr_base + 9) * psize;

& IMPORTANT: dp_raw_get must have same relationship to s-params as the &
&            "generic_param" constant in ccontvar.                     &
```

```
FDATAP.WORK.PD8510              THU, DEC 22, 1983, 10:31 AM     PAGE    1

#FILE cdatap.work;

EXTERNAL DOUBLE TABLE ch_dp_ptrs;

REAL PROCEDURE frequency_step( ch ); VALUE ch;  INTEGER ch;   EXTERNAL.L;
PROCEDURE data_proc_ch1;                                      EXTERNAL.L;
PROCEDURE data_proc_ch2;                                      EXTERNAL.L;
SUBROUTINE reset_data_proc;                                   EXTERNAL.L;
PROCEDURE set_vars_ptrs_base( ch );   VALUE ch;  INTEGER ch;  EXTERNAL.L;
INTEGER PROCEDURE control_data_proc(ch);
   VALUE ch; INTEGER ch;                                      EXTERNAL.L;
PROCEDURE update_data_proc(update_ch,update_block);
   VALUE   update_ch, update_block;
   INTEGER update_ch, update_block;                           EXTERNAL.L;
REAL PROCEDURE log_lin_ang( adr, pt, flg, lin, ang);
   VALUE   adr, pt, flg;
   DOUBLE  adr;
   INTEGER pt;
   BOOLEAN flg;
   REAL    lin, ang;                                          EXTERNAL.L;
PROCEDURE min_max( adr, step, flg, min, min_pt, max, max_pt );
   VALUE adr, step, flg;
   BOOLEAN flg;
   INTEGER step, min_pt, max_pt;
   DOUBLE  adr;
   REAL    min, max;                                          EXTERNAL.L;
```

```
SDATAP.WORK.PD8510              THU, DEC 22, 1983, 10:31 AM     PAGE    2

GLOBAL BYTE ARRAY ch_dp_scr__0,
                  ch_dp_scr__1,
                  ch_dp_scr__2[0:dp_scr__array_size];
GLOBAL BYTE ARRAY ch_dp_ptrs_0,
                  ch_dp_ptrs_1,
                  ch_dp_ptrs_2[0:dp_ptrs_array_size];
GLOBAL BYTE ARRAY ch_dp_vars_0,
                  ch_dp_vars_1,
                  ch_dp_vars_2[0:dp_vars_array_size];
GLOBAL REAL       system_z0;

DOUBLE TABLE  ch_dp_scr  := ADRS(ch_dp_scr__0),
                            ADRS(ch_dp_scr__1),
                            ADRS(ch_dp_scr__2);
GLOBAL
DOUBLE TABLE  ch_dp_ptrs := ADRS(ch_dp_ptrs_0),
                            ADRS(ch_dp_ptrs_1),
                            ADRS(ch_dp_ptrs_2);

DOUBLE TABLE  ch_dp_vars := ADRS(ch_dp_vars_0),
                            ADRS(ch_dp_vars_1),
                            ADRS(ch_dp_vars_2);

BYTE CONSTANT polar_bit :=0,   polar_code     := 1,    rect_code  := 0,
              delay_bit :=1,   delay_code     := 2,
              parm_bit  :=2,   parm_conv_code := 4;
BYTE TABLE    format_map  :=                             &  log_mag&
              rect_code,                                 &linear_mag&
              rect_code,                                 &  phase  &
              rect_code,                                 &  delay  &
              rect_code + delay_code,                    &    real &
              rect_code,                                 &    imag &
              rect_code,                                 & log_polar&
              polar_code,                                & lin_polar&
              polar_code,                                & imag_real&
              polar_code,                                &  z_smith &
              polar_code + parm_conv_code,               &  y_smith &
              polar_code + parm_conv_code,               &   swr    &
              rect_code;
```

```
SDATAP.WORK.PD8510              THU, DEC 22, 1983, 10:31 AM     PAGE    1

M68KL,P,"datap"
BEGIN
COMMENT
*************************************************************************
* This the source module for the "datap" (data processing process)
*     Inculdes
*      1) control_data_proc
*      2) update_data_proc
*      3) reset_data_proc
*         control_data_proc_freq
*      4) data_proc_ch1  -- the actual process
*      5) data_proc_ch2  -- the actual process
*      6) min_max        -- min,max of internal data arrays
*      7) log_lin_ang    -- log_mag, lin_mag, ang of a data point
*
*************************************************************************
end of comment;
TYPELENGTH USER3 : 6;

                                                              &DEBUG&
#FILE fterm.work;                                             &DEBUG&
#FILE fterm3.work; & for WREAL &                              &DEBUG&
#FILE cdebug.work;
#FILE fkernel.work;
#FILE crins.work;
#FILE cchtable.work;
#FILE fchtab2.work;
#FILE fchdata.work;
#FILE fcontvar.work;
#FILE fgratic.work;
#FILE fsize.work;
#FILE ftime.work;
#FILE cdatap.work;
#FILE ccompute.work;
#FILE ccal.work;
#FILE fmarker.work;                                 & for update_marks &
#FILE fdelay.work;                                   & for total_delay &

DOUBLE ptrs_base = REGISTER 11;
DOUBLE vars_base = REGISTER 12;

                                                            EXTERNAL.L;
SUBROUTINE  compute_datap;                                  EXTERNAL.L;
SUBROUTINE  magE;                                           EXTERNAL.L;
SUBROUTINE  logE;                                           EXTERNAL.L;
SUBROUTINE  angE;
EXTERNAL DOUBLE TABLE correct_table.L;
EXTERNAL DOUBLE TABLE conv_table.L;
EXTERNAL DOUBLE TABLE math_table.L;
EXTERNAL DOUBLE TABLE fmt_table.L;
EXTERNAL DOUBLE TABLE update_table.L;
EXTERNAL QUAD   TABLE s_coeff;

INTEGER CONSTANT  dp_scr__array_size       := 6*81 + 1 ,
                  dp_ptrs_array_size       := last_dp_ptr - 1,
                  dp_vars_array_size       := last_dp_vars - 1;
```

```
SDATAP.WORK.PD8510              THU, DEC 22, 1983, 10:31 AM     PAGE    3

#EJECT;
PROCEDURE init_scr( ch );  VALUE ch;   INTEGER ch;
BEGIN
DOUBLE  scr;
BYTE    POINTER scr_ptr  = scr ;
DOUBLE          vars;
DOUBLE  POINTER double_ptr=vars;
vars := ch_dp_vars[ ch ];
scr  := ch_dp_scr[  ch ];
double_ptr[ dp_scr_base ] :=  ADRS( scr_ptr[ 0 ] ) ;
double_ptr[ dp_scr_end  ] :=  ADRS( scr_ptr[ dp_scr__array_size ] ) ;

END init_scr;


DOUBLE PROCEDURE init_data_proc( ch );  VALUE ch;   INTEGER ch;
BEGIN
DOUBLE          vars;
BYTE    POINTER byte_ptr = vars;
INTEGER index = REGISTER 6;

vars := ch_dp_vars[ ch ];
FOR index := 0 TO dp_vars_array_size DO
      byte_ptr[ index ] := 0;
init_scr( ch );

init_data_proc := vars;
END init_data_proc;


PROCEDURE set_vars_ptrs_base( ch );   VALUE ch;  INTEGER ch;        ENTRY;
BEGIN
    vars_base := ch_dp_vars[ ch ];
    ptrs_base := ch_dp_ptrs[ ch ];
END set_vars_ptrs_base;


REAL PROCEDURE frequency_step( ch ); VALUE ch;  INTEGER ch;         ENTRY;
     frequency_step := REAL(  ch_quad(ch_center_frequency, ch)  -
                              ch_quad(ch_start_frequency, ch) ) * 2.0
                                    / REAL( number_of_points - 1 ) ;
```

```
SDATAP.WORK.PD8510            THU, DEC 22, 1983, 10:31 AM     PAGE  4

#EJECT;
COMMENT                                                   data_proc_ch1
*************************************************************************
*                                                                       *
* EXTERNAL SPECIFICATION FOR data_proc_ch1                              *
*                                                                       *
* FUNCTION:                                                             *
*                                                                       *
*                                                                       *
* DECLARATION INFORMATION:                                              *
*                                                                       *
*    INPUT:                                                             *
*                                                                       *
*    OUTPUT:                                                            *
*                                                                       *
* EXTERNAL EFFECTS:                                                     *
*                                                                       *
*************************************************************************
*                                                                       *
* LOGIC INFORMATION FOR data_proc_ch1                                   *
*                                                                       *
* MODULES CALLED:                                                       *
*                                                                       *
* INITIAL REFINEMENT:                                                   *
*                                                                       *
*                                                                       *
*************************************************************************
end of comment;
PROCEDURE data_proc_ch1;
                                                                 ENTRY;
BEGIN
DOUBLE  vars ;
INTEGER POINTER int_ptr  = vars;

    vars := init_data_proc( 1 );

    forever_loop:
      BEGIN
        wait(ch1_raw_ready);

        acquire( processing_variables );     & replace with asmb code &

        set_vars_ptrs_base( 1  );

        compute_datap;

        release( processing_variables );     & replace with asmb code &

        send( int_ptr[ dp_finished_signal ] );

      END data_proc_loop;
    GO TO forever_loop;

END data_proc_ch1;
```

```
SDATAP.WORK.PD8510            THU, DEC 22, 1983, 10:31 AM     PAGE  5

#EJECT;
COMMENT                                                   data_proc_ch2
*************************************************************************
*                                                                       *
* EXTERNAL SPECIFICATION FOR data_proc_ch2                              *
*                                                                       *
* FUNCTION:                                                             *
*                                                                       *
*                                                                       *
* DECLARATION INFORMATION:                                              *
*                                                                       *
*    INPUT:                                                             *
*                                                                       *
*    OUTPUT:                                                            *
*                                                                       *
* EXTERNAL EFFECTS:                                                     *
*                                                                       *
*************************************************************************
*                                                                       *
* LOGIC INFORMATION FOR data_proc_ch2                                   *
*                                                                       *
* MODULES CALLED:                                                       *
*                                                                       *
* INITIAL REFINEMENT:                                                   *
*                                                                       *
*                                                                       *
*************************************************************************
end of comment;
PROCEDURE data_proc_ch2;
                                                                 ENTRY;
BEGIN
DOUBLE  vars ;
INTEGER POINTER int_ptr  = vars;

    vars := init_data_proc( 2 );

    forever_loop:
      BEGIN
        wait(ch2_raw_ready);

        acquire( processing_variables );     & replace with asmb code &

        set_vars_ptrs_base( 2  );

        compute_datap;

        release( processing_variables );     & replace with asmb code &

        send( int_ptr[ dp_finished_signal ] );

      END data_proc_loop;
    GO TO forever_loop;

END data_proc_ch2;
```

```
SDATAP.WORK.PD8510            THU, DEC 22, 1983, 10:31 AM     PAGE  6

#EJECT;
COMMENT                                                reset_data_proc
*************************************************************************
*                                                                       *
* EXTERNAL SPECIFICATION FOR reset_data_proc                            *
*                                                                       *
* FUNCTION:                                                             *
*                                                                       *
*                                                                       *
* DECLARATION INFORMATION:                                              *
*                                                                       *
*    INPUT:                                                             *
*                                                                       *
*    OUTPUT:                                                            *
*                                                                       *
* EXTERNAL EFFECTS:                                                     *
*                                                                       *
*************************************************************************
*                                                                       *
* LOGIC INFORMATION FOR reset_data_proc                                 *
*                                                                       *
* MODULES CALLED:                                                       *
*                                                                       *
* INITIAL REFINEMENT:                                                   *
*                                                                       *
*                                                                       *
*************************************************************************
```

```
SDATAP.WORK.PD8510            THU, DEC 22, 1983, 10:31 AM     PAGE  7

#EJECT end of comment;

PROCEDURE reset_dp_vars(ch);
                                      VALUE ch; INTEGER ch;
BEGIN
DOUBLE data_ptr;
INTEGER POINTER int_ptr  = data_ptr;
REAL    POINTER real_ptr = data_ptr;
DOUBLE  POINTER double_ptr=data_ptr;

 data_ptr := ch_dp_vars[ ch ];
 double_ptr[dp_length_shift] := double_ptr[dp_length_initial];

 int_ptr[dp_pos ] := 0;
 int_ptr[dp_flg ] := 0;

END reset_dp_vars;

SUBROUTINE reset_data_proc;                                      ENTRY;
BEGIN

   reset_dp_vars(  1  );
   reset_dp_vars(  2  );

END reset_data_proc;
```

```
SDATAP.WORK.PD8510                THU, DEC 22, 1983, 10:31 AM     PAGE   8

#EJECT;

PROCEDURE control_data_proc_freq(ch);
                          VALUE ch; INTEGER ch;
                                                                ENTRY;
BEGIN
DOUBLE          dp_vars_adrs;
DOUBLE POINTER  dp_dbl_ptr  = dp_vars_adrs;
INTEGER POINTER dp_int_ptr = dp_vars_adrs;
REAL POINTER    dp_real_ptr    = dp_vars_adrs;
REAL            elec_delay     ,  freq_step;

   dp_vars_adrs := ch_dp_vars[ ch ];

   freq_step    := frequency_step( ch );

                & group delay &
   dp_real_ptr[dp_grp_dly_scale] :=
                          &1.0 / ( freq_step * phase_scaling * 360.0 ) &
            3.814697E-6  / ( freq_step );


   elec_delay   :=  total_delay( ch )  ;

   dp_dbl_ptr[dp_length_initial] :=  DOUBLE (  262144. &2**18&  * (
                ( elec_delay   * REAL(ch_quad(ch_start_frequency, ch)) )
                - (  ch_real( ch_phase_offset , ch ) / 360.  )      ) ) ;

   dp_dbl_ptr[dp_length_inc ]    :=  DOUBLE ( 262144.  &2**18&   *
                                         elec_delay * freq_step );

   dp_dbl_ptr[dp_length_shift ]  :=   dp_dbl_ptr[dp_length_initial]
                                   + ( dp_dbl_ptr[dp_length_inc ]
                                 * ( dp_int_ptr[ dp_pos] / step_size ) );
END control_data_proc_freq ;
```

```
SDATAP.WORK.PD8510                THU, DEC 22, 1983, 10:31 AM     PAGE   9

#EJECT;
PROCEDURE control_data_proc_smoothing( ch );
                                          VALUE ch;  INTEGER ch;
BEGIN
DOUBLE   dp_vars_adrs,
         dp_ptrs_adrs;
DOUBLE  POINTER dp_ptr      = dp_ptrs_adrs;
INTEGER POINTER dp_int_ptr  = dp_vars_adrs;
REAL    POINTER dp_real_ptr = dp_vars_adrs;
INTEGER         aper_old, aper_new, aper_change, pos_adj, sum_adj;

   dp_vars_adrs := ch_dp_vars[ ch ];
   dp_ptrs_adrs := ch_dp_ptrs[ ch ];
   IF ch_integer( ch_smoothing_mode, ch ) = smoothing_on THEN
      BEGIN
      aper_new := RIGHT(  (
      INTEGER( ( ch_real( ch_smoothing_aperture, ch ) * 8. ) + .5 )
                                 /step_size), 1);
      END
    ELSE
      aper_new := 0;

    aper_old    :=   dp_int_ptr[dp_smoothing_aper] ;
    aper_change := aper_new  -  aper_old ;
    dp_int_ptr[ dp_smoothing_aper ]  := aper_new;

    IF aper_change # 0  THEN
      BEGIN
      dp_real_ptr[dp_smoothing_scale]:= REAL( aper_new + aper_new + 1 );
      IF dp_int_ptr[dp_pos] = 0 OR aper_old = 0 THEN
         dp_int_ptr[ dp_flg ] :=   0   & init smoothing &
       ELSE
         BEGIN  &midsreen resumption &
         pos_adj := aper_change  +  dp_int_ptr[dp_smoothing_delay];

         IF pos_adj >= 0 THEN  & ahead of screen position &
            dp_int_ptr[dp_smoothing_delay] :=  pos_adj
          ELSE & pos_adj < 0 &
            BEGIN
            dp_int_ptr[dp_smoothing_delay] :=  0;
            dp_ptr[dp_f_ptr] := dp_ptr[dp_f_ptr] - 6 * pos_adj ;
            dp_ptr[dp_trace_ptr]:=dp_ptr[dp_trace_ptr] - 4* pos_adj;
            END behind of screen position ;

         sum_adj := pos_adj + aper_change
                               - dp_int_ptr[ dp_smoothing_delay ];
         IF sum_adj >= 0  THEN  & Increment SUM &
            BEGIN
            dp_int_ptr[ dp_flg ] := 1;        & increments sum &
            dp_int_ptr[dp_smoothing_correct] :=  sum_adj ;
            END
         ELSE & sum_adj < 0 &
            REPEAT -(sum_adj) DO
              ASSEMBLE(
                        MOVE.L dp_vars_adrs, R12 ;
                        JSRX   dec_smoothing.L );
```

```
SDATAP.WORK.PD8510                THU, DEC 22, 1983, 10:31 AM     PAGE  10


        END in midsreen;
      END smoothing change ;
END control_data_proc_smoothing;
```

```
SDATAP.WORK.PD8510                THU, DEC 22, 1983, 10:31 AM     PAGE  11

#EJECT;
COMMENT                                                   control_data_proc
***************************************************************************
*                                                                         *
* EXTERNAL SPECIFICATION FOR control_data_proc                            *
*                                                                         *
* FUNCTION:                                                               *
*         This routine will convert user variables into internal          *
*         variables needed for data processing.                           *
*         This routine will not distrub any of the data pointers.         *
*                                                                         *
*                                                                         *
* DECLARATION INFORMATION:                                                *
*                                                                         *
*    INPUT:  ch         Channel (1/2) to be effected                      *
*                                                                         *
*    OUTPUT:                                                              *
*                                                                         *
* EXTERNAL EFFECTS:                                                       *
*                                                                         *
***************************************************************************
*                                                                         *
* LOGIC INFORMATION FOR control_data_proc                                 *
*                                                                         *
* MODULES CALLED:                                                         *
*                                                                         *
* INITIAL REFINEMENT:                                                     *
*                                                                         *
*                                                                         *
***************************************************************************
```

SDATAP.WORK.PD8510 THU, DEC 22, 1983, 10:31 AM PAGE 12

```
#EJECT end of comment;
INTEGER PROCEDURE control_data_proc(ch);
                              VALUE ch; INTEGER ch;
                                                                ENTRY;
BEGIN
DOUBLE  dp_vars_adrs;
BYTE    POINTER dp_byte_ptr = dp_vars_adrs;
INTEGER POINTER dp_int_ptr  = dp_vars_adrs;
REAL    POINTER dp_real_ptr = dp_vars_adrs;
DOUBLE  POINTER dp_double_ptr=dp_vars_adrs;
INTEGER POINTER grat_specs;

DOUBLE   gain_l ;
REAL     gain_real = gain_l ;
INTEGER  gain_y = gain_l,     gain_x = gain_l + 2 ;
BYTE     gain_b = gain_l + 3 ;
REAL    x_div_size  ,    x_grad_ref ,
        y_div_size  ,    y_grad_ref ;
INTEGER format_code , format_type;

   dp_vars_adrs := ch_dp_vars[ ch ];
   IF ch = 1 THEN
       STPNTR( grat_specs, ADRS( grat1_specs ) )
   ELSE
       STPNTR( grat_specs, ADRS( grat2_specs ) );


   format_type := ch_integer( ch_format , ch ) - 1;
   format_code := format_map[ format_type ];
```

SDATAP.WORK.PD8510 THU, DEC 22, 1983, 10:31 AM PAGE 13

```
#EJECT;
   dp_int_ptr[dp_y_min] := grat_specs[ min_y ];
   dp_int_ptr[dp_y_max] := grat_specs[ max_y ];
   y_div_size     := REAL( grat_specs[ div_y ] );
   dp_real_ptr[dp_y_gain] := y_div_size / ch_real(ch_scale,ch);

   IF TBIT( format_code , polar_bit ) THEN
      BEGIN
      dp_int_ptr[dp_x_min] := grat_specs[ min_x ];
      dp_int_ptr[dp_x_max] := grat_specs[ max_x ];
      dp_double_ptr[dp_x_offset] :=DOUBLE( grat_specs[ grat_x ] );
      dp_double_ptr[dp_y_offset] :=DOUBLE( grat_specs[ grat_y ] );
      gain_real                  :=dp_real_ptr[dp_y_gain] / 32768.;

      dp_int_ptr[dp_polar_exp]   := INTEGER( gain_b );
      gain_x                  :=INTEGER(
                                ALEFT( DOUBLE( gain_y ) , 2) / 5 );
      dp_double_ptr[dp_polar_gain]:= gain_l ;
      END  &polar&
    ELSE
      BEGIN&rect&
      y_grad_ref     := (ch_real(ch_ref_position,ch) * y_div_size)
                      + REAL( grat_specs[ grat_y ]);
      dp_real_ptr[dp_y_offset]:=
                                ( ( y_grad_ref / dp_real_ptr[ dp_y_gain ] )
                                - ch_real(ch_ref_value,ch) );
      dp_real_ptr[dp_y_gain] :=
                                dp_real_ptr[dp_y_gain] /(32768. );
      END  &rect& ;


   control_data_proc_freq( ch );

   control_data_proc_smoothing( ch );

   system_z0 := ch_real( ch_system_z0, ch );
      & assumes that z0 is always coulped -- what if test set different&

   IF ch_integer( ch_correction_mode , ch ) = correct_on THEN
      BEGIN
      dp_double_ptr[dp_correct_switch]    := correct_table[
                                ch_integer( ch_correction_type , ch)];
      dp_int_ptr[dp_correct_offset]       := array_size - 6;
      dp_double_ptr[dp_correct_select]    := ADRS( s_coeff[
                                ch_integer( ch_basis_s_param , ch)] );
      END
    ELSE
      dp_double_ptr[dp_correct_switch]    := correct_table[ 0 ];
   dp_double_ptr[dp_param_conv_switch] := conv_table[
                               ch_integer( ch_param_conversion , ch)];
   dp_double_ptr[dp_trace_math_switch] := math_table[
                                    ch_integer( ch_trace_math , ch)];
   dp_double_ptr[dp_format_switch]     := fmt_table[ format_type ];

   dp_int_ptr[dp_finished_signal] := ch_integer(ch_finished_signal,ch);
```

SDATAP.WORK.PD8510 THU, DEC 22, 1983, 10:31 AM PAGE 14

```
control_data_proc := 0;

END control_data_proc;
```

SDATAP.WORK.PD8510 THU, DEC 22, 1983, 10:31 AM PAGE 15

```
#EJECT;
COMMENT                                                       update_data_proc
******************************************************************************
*                                                                            *
* EXTERNAL SPECIFICATION FOR update_data_proc                                *
*                                                                            *
* FUNCTION:                                                                  *
*         Starting from a specificed intermediate storage array              *
*         (ie D or M or F), this routine will place on the display           *
*         a complete trace. All pointers to data, and conditions of          *
*         the processing will be setup elsewhere.                            *
*                                                                            *
*                                                                            *
* DECLARATION INFORMATION:                                                   *
*                                                                            *
*    INPUT:  update_ch    The channel ( 1/2 ) to be updated                  *
*            update_block The degree of update ( start at  D, M or F )       *
*                                                                            *
*    OUTPUT: none                                                            *
*                                                                            *
* EXTERNAL EFFECTS:                                                          *
*        The display and various intermediate arrays are update.             *
******************************************************************************
*                                                                            *
* LOGIC INFORMATION FOR update_data_proc                                     *
*                                                                            *
* MODULES CALLED:                                                            *
*                                                                            *
* INITIAL REFINEMENT:                                                        *
*        The address of the start the of the needed update routine is        *
*     found, with the twist that update from F is different if the           *
*     display is in polar or rectangluar. The pointers to memory             *
*     pointers and variables are setup in registers for 'compute'.           *
*     The trace math switch needs to store if updating M in case             *
*     group delay is selected ( normally trace math is skipped ).            *
*     A loop for the correct number of points is than done.                  *
*                                                                            *
******************************************************************************
```

```
SDATAP.WORK.PD8510              THU, DEC 22, 1983, 10:32 AM     PAGE  16

#EJECT end of comment;
PROCEDURE update_data_proc(update_ch,update_block);
                          VALUE   update_ch, update_block ;
                          INTEGER update_ch, update_block ;       ENTRY;
BEGIN
DOUBLE      ch_byte_dbl,
            update_switch;
INTEGER     point,
           ch_trace;

DOUBLE  POINTER dp_dbl_ptr = vars_base;
INTEGER POINTER dp_int_ptr = vars_base;
BYTE POINTER   dp_byte_ptr = vars_base,
               ch_byte_ptr = ch_byte_dbl;

   IF update_block = update_f   AND
     TBIT(format_map[ch_integer(ch_format ,update_ch) - 1], polar_bit)
    THEN update_block := update_f_polar;

   set_vars_ptrs_base( 0  );
   ch_byte_dbl    :=        ch_dp_vars[ update_ch ] ;


   MOVE dp_byte_ptr := ch_byte_ptr ,+( last_dp_vars );

   init_scr( 0 );                    & only needs to done at power up &
   reset_dp_vars( 0 );

   IF update_block = update_m THEN
     BEGIN
       ch_trace := ch_m_trace_base;
       dp_dbl_ptr[dp_trace_math_switch] := math_table; &math off&
     END
    ELSE ch_trace := ch_trace_base;

   set_dp_ptrs( update_ch, 0, ch_trace);

 IF update_block = update_raw_array THEN
      array_datap( update_ch )
  ELSE
    BEGIN  & normal update &
      update_switch  :=  update_table[ update_block - 1 ];
      set_vars_ptrs_base( 0 );                              &restore&
      FOR point := 0  STEP step_size UNTIL 800  DO
             ASSEMBLE(  MOVE.L  update_switch, R8;
                        JSR     (R8)                  );
    END normal update ;

   update_marks;    & move markers, update-mark, 1st point, ch mark &

END update_data_proc;
```

```
SDATAP.WORK.PD8510              THU, DEC 22, 1983, 10:32 AM     PAGE  17

#EJECT;
COMMENT                                                           log_lin_ang
*************************************************************************
*                                                                       *
* EXTERNAL SPECIFICATION FOR log_lin_ang                                *
*                                                                       *
* FUNCTION:                                                             *
*                                                                       *
*                                                                       *
* DECLARATION INFORMATION:                                              *
*                                                                       *
*    INPUT:                                                             *
*                                                                       *
*    OUTPUT:                                                            *
*                                                                       *
* EXTERNAL EFFECTS:                                                     *
*************************************************************************
*                                                                       *
* LOGIC INFORMATION FOR log_lin_ang                                     *
*                                                                       *
* MODULES CALLED:                                                       *
*                                                                       *
* INITIAL REFINEMENT:                                                   *
*                                                                       *
*************************************************************************
```

```
SDATAP.WORK.PD8510              THU, DEC 22, 1983, 10:32 AM     PAGE  18

#EJECT end of comment;
REAL PROCEDURE log_lin_ang( adr, pt, flg, lin, ang);
                    VALUE  adr, pt, flg;      BOOLEAN flg;
                    DOUBLE adr;   INTEGER pt; REAL lin, ang;    ENTRY;
  BEGIN
  LABEL    rect,save;

  ASSEMBLE( MOVE.L adr, R8;   MOVE.W  pt,    R0;        MPY #6,R0;
            DIV     step_size,R0;
            ADD.W  R0,  R8;   MOVEM.L (R8),  R0-R1;     SWAP R1;
            MOVEM.L R0/R1, -(S);                       & save for reuse&
            JSR     angE;      MOVE.L  ang, R9;  MOVE.L R0, (R9);
            MOVEM.L (S),  R0/R1;
            TST.W   flg;       BEQ   rect;
            JSR     magE;      BRA save;
      rect: SWAP R0;           MOVE.W R1,  R0;
      save: MOVE.L  lin, R9;   MOVE.L R0,  (R9);
            MOVEM.L (S)+, R0/R1;
            JSR     logE                              );

  END log_lin_ang;
```

```
SDATAP.WORK.PD8510              THU, DEC 22, 1983, 10:32 AM     PAGE  19

#EJECT;
COMMENT                                                               min_max
*************************************************************************
*                                                                       *
* EXTERNAL SPECIFICATION FOR  min_max                                   *
*                                                                       *
* FUNCTION:                                                             *
*                                                                       *
*                                                                       *
* DECLARATION INFORMATION:                                              *
*                                                                       *
*    INPUT:                                                             *
*                                                                       *
*    OUTPUT:                                                            *
*                                                                       *
* EXTERNAL EFFECTS:                                                     *
*************************************************************************
*                                                                       *
* LOGIC INFORMATION FOR min_max                                         *
*                                                                       *
* MODULES CALLED:                                                       *
*                                                                       *
* INITIAL REFINEMENT:                                                   *
*                                                                       *
*************************************************************************
* HISTORY
*    8/31/73 -- Max was checked only if Min failed, failed on a sloping
*                  line, therefore Min and Max checked on all points.
*************************************************************************
```

```
SDATAP.WORK.PD8510              THU, DEC 22, 1983, 10:32 AM     PAGE  20

#EJECT end of comment;
PROCEDURE min_max( adr, step, flg, min, min_pt, max, max_pt );
                             VALUE adr, step, flg;
               DOUBLE adr; INTEGER step, min_pt, max_pt;
              BOOLEAN flg; REAL    min, max;                      ENTRY;
BEGIN
INTEGER pt;
REAL  val;
 ABEL  rect, save;
  min := 1@37;
  max := -min;

  FOR pt:= 0 STEP step TO 800  DO
     BEGIN
     ASSEMBLE(
              MOVE.L  adr,   R8;
              TST.W    flg;          BEQ rect;      & check imag part&
              MOVE.L  (R8)+, R0;    MOVE.W  (R8)+,  R1;
              MOVE.L  R8,    adr;
              JSR     magE;
              BRA     save;
        rect: ADDQ    #2,    R8;    MOVE.L  (R8)+,  R0;
              MOVE.L  R8,    adr;
        save: MOVE.L  R0, val          );

     IF val < min THEN BEGIN   min:=val;   min_pt:= pt; END;
     IF val > max THEN BEGIN   max:=val;   max_pt:= pt; END;

     END loop;
END min_max;
END$
```

```
FDATAP1.WORK.PD8510             THU, DEC 22, 1983, 10:32 AM     PAGE   1

#FILE cdatap.work;

PROCEDURE control_data_proc_freq(ch);
   VALUE ch; INTEGER ch;                                     EXTERNAL.L;
```

```
CDEBUG.WORK.PD8510              THU, DEC 22, 1983, 10:32 AM     PAGE   1
```

```
CDEBUGCO.WORK.PD8510            THU, DEC 22, 1983, 10:32 AM     PAGE   1

INTEGER BITFIELD debug = %00000000.
```

```
CDEBUGC2.WORK.PD8510          THU, DEC 22, 1983, 10:32 AM     PAGE  1

INTEGER BITFIELD debug2 = Z000000C2:
```

```
CDEBUGC4.WORK.PD8510          THU, DEC 22, 1983, 10:32 AM     PAGE  1

INTEGER BITFIELD debug3 = Z000000C4:
```

```
CDEBUGXX.WORK.PD8510          THU, DEC 22, 1983, 10:32 AM     PAGE  1
```

```
FDELAY.WORK.PD8510            THU, DEC 22, 1983, 10:32 AM     PAGE  1

REAL PROCEDURE total_delay( ch );
   VALUE   ch;
   INTEGER ch;                                        EXTERNAL.L;
```

```
SDELAY.WORK.PD8510              THU, DEC 22, 1983, 10:32 AM     PAGE  1

M68KL,P,"delay"
BEGIN

#FILE cdatap.work;                                   & for max_format &
#FILE ccontvar.work;                               & for max_parameter &
#FILE cchtable.work;
#FILE fchtab2.work;                             & for ch_integer and _real &
#FILE fchpfr.work;                  & for elec_delay and parameter_descriptor &

INTEGER CONSTANT no_delay := -1;

INTEGER TABLE driven_index :=           & indexed by driven port number  &
      no_delay,          & driven_none    MUST coincide with constants   &
      ch_ref_plane_1,    & driven_a1      from cyadc.work.               &
      ch_ref_plane_2;    & driven_a2   &
INTEGER TABLE numerator_index :=        & indexed by numerator port type &
      ch_ref_plane_1,    & num_b1 &     & MUST coincide with constants   &
      ch_ref_plane_2,    & num_b2 &     & from cyadc.work.               &
      no_delay,          & num_a2 &
      no_delay,          & num_a1 &
      no_delay,          & num_100kHz_cal and num_no_ratio &
      no_delay,          & num_detector_gnd   &
      no_delay,          & num_ref_100kHz_cal &
      no_delay,          & num_adc_gnd        &
      no_delay,          & num_vcal           &
      no_delay,          & num_vref           &
      no_delay,          & num_temp1          &
      no_delay,          & num_temp2          &
      no_delay;          & num_analog_in      &
INTEGER TABLE denominator_index :=      & indexed by denom'tor port type &
      ch_ref_plane_1,    & denom_b1 &
      no_delay,          & denom_a1 &
      no_delay,          & denom_a2 &
      no_delay,          & not used &
      no_delay,          & denom_100khz_cal &
      no_delay;          & denom_detector_gnd and denom_no_ratio &

REAL PROCEDURE total_delay( ch );
   VALUE   ch;
   INTEGER ch;                                                      ENTRY;
   BEGIN & total_delay &
      INTEGER parameter,
              index;
      REAL accumulated_delay,
           driven_port_delay;

      parameter := ch_integer( ch_param, ch );
      accumulated_delay := elec_delay[ parameter , ch ];
      index := parameter_descriptor[ parameter, driven_port ] AND %003F;
      index := driven_index[ index ];
      IF index <> no_delay THEN
         driven_port_delay := ch_real( index, ch );

      index := parameter_descriptor[ parameter, numerator_port ] AND
                    %003F;
```

```
SDELAY.WORK.PD8510              THU, DEC 22, 1983, 10:32 AM     PAGE  2

      index := numerator_index[ index ];
      IF index <> no_delay THEN
         accumulated_delay := accumulated_delay +
                              driven_port_delay +
                              ch_real( index, ch );

      index := parameter_descriptor[ parameter, denominator_port ] AND
                     %003F;
      index := denominator_index[ index ];
      IF index <> no_delay THEN
         accumulated_delay := accumulated_delay -
                              driven_port_delay -
                              ch_real( index, ch );

      total_delay := accumulated_delay;

   END;  & total_delay &

END$
```

```
SDGTOP.WORK.PD8510              THU, DEC 22, 1983, 10:32 AM     PAGE  1

M68KL,P,"dgtop"
BEGIN

COMMENT  This is to mark the top of dg ram storage. ;

GLOBAL LABEL mark_dg_top;

mark_dg_top:

END$
```

```
CDGUSER.WORK.PD8510             THU, DEC 22, 1983, 10:32 AM     PAGE  1

INTEGER CONSTANT

  user_display_graphics:= 31,   &index to priv_ib_lun table of addresses&
  user_display_address := 31;
```

FDGUSER.WORK.PD8510 THU, DEC 22, 1983, 10:32 AM PAGE 1

```
SUBROUTINE init_user_graphics;                          EXTERNAL.L;
SUBROUTINE restore_8510_display;                        EXTERNAL.L;
PROCEDURE parse_user_graphics (cmd);
  VALUE cmd;  BYTE cmd;                                 EXTERNAL.L;
EXTERNAL BOOLEAN display_8510_on;
```

SDGUSER.WORK.PD8510 THU, DEC 22, 1983, 10:32 AM PAGE 1

```
M68KL,P,"dguser"

BEGIN

#FILE fterm.work;
#FILE fterm2.work;
#FILE cdebug.work;
#FILE cscreen.work;
#FILE cdisplay.work;
#FILE fdisplay.work;
#FILE foutput.work;
#FILE fstring.work;
#FILE foutib.work;

BYTE CONSTANT
  LF  := 10,
  ETX := 3;

INTEGER CONSTANT
  PA := %5041,
  PR := %5052,
  PU := %5055,
  PD := %5044,
  LB := %4C42,
  PG := %5047,          & "clear display" = user display &
  KP := %4B50,          & save and clear user graphics pg&
  RP := %5250,          & recall user graphics page     &
  CS := %4353,          & "clear screen"  = 8510 display &
  RS := %5253,          & "restore screen"= 8510 display &
  OP := %4F50,
  DF := %4446,
  max_cmd_char := 80;

DOUBLE CONSTANT
  fmt_code := %01000000;

INTEGER TABLE HPGL_cmd :=
  PA, PR, PU, PD, LB, PG, KP, RP, CS, RS, OP, DF, 0;

GLOBAL BOOLEAN
  display_8510_on;

BOOLEAN
  parsing_x,            & flag to determine x value for x,y pair &
  label_mode,           & LB command has been issued &
  number_mode,          & PA,PR command has been issued &
  pen_up,
  plot_abs;

BYTE ARRAY
  cmd_code [0:1],
  cmd_char [-1:max_cmd_char];                     & command string &

ALPHA
  cmd_string;
```

SDGUSER.WORK.PD8510 THU, DEC 22, 1983, 10:32 AM PAGE 2

```
INTEGER
  cmd_code_ptr,
  cmd_value = cmd_code,              & value of 2-letter HPGL command &
  x_vector, y_vector,        & current absolute x,y display vector values &
  x_cmd, y_cmd,                    & x,y plot values for PA/PR commands &
  DG_ptr;                      & pointer to next available word in DG RAM &
```

SDGUSER.WORK.PD8510 THU, DEC 22, 1983, 10:32 AM PAGE 3

```
#EJECT;
COMMENT
$DOC+

NAME--
  default_mode
*************************************************************************
*
* SHORT DESCRIPTION--
*   executes a DF command which sets all graphics default modes
*
* EXTENDED DESCRIPTION--
*   This routine resets all flags, pointers, and counters to their
*   default values.  The following attributes are set:
*     - plot absolute
*     - pen up
*   The command input string and command code value are also reset.
*
* INPUTS--
*   none
*
* OUTPUTS--
*   none
*
* ROUTINES CALLED--
*   none
*
* ERROR CONDITIONS AND RECOVERY--
*   none
*
* NOTES--
*
* AUTHOR--
*
*************************************************************************
*
* INITIAL REFINEMENT--
*   set plot absolute, pen up, flags
*   set x,y coordinate values to 0
*   reset command string/code pointers
*   clear flags indicating label mode, plot mode, and parsing
*
*************************************************************************
*
* REVISION LOG--
*
*************************************************************************
$DOC-;
SUBROUTINE default_mode;
BEGIN
  cmd_char[0] := x_vector := y_vector := 0;
  cmd_code_ptr := x_cmd := y_cmd := -1;
  plot_abs := pen_up := parsing_x := TRUE;
  number_mode := label_mode := FALSE;
END default_mode;
```

```
SDGUSER.WORK.PD8510            THU, DEC 22, 1983, 10:32 AM     PAGE   4

REJECT;
COMMENT
$DOC+

NAME--
  new_page
**********************************************************************
*
* SHORT DESCRIPTION--
*   executes a PG command which clears the user graphics display area
*
* EXTENDED DESCRIPTION--
*   This routine simulates the HP-GL command, PG, which is suppose to
*   perform a page eject or new page function.  It is used in the user
*   graphics display context as a "clear display" command which in
*   effect generates a new or blank page of display memory for the user.
*
*   This will reset the display pointer to the beginning of user display
*   memory, which is where the display starts interpreting th graphics
*   display commands.  This means that any commands currently in the
*   display area will be erased (written over).
*
* INPUTS--
*   none
*
* OUTPUTS--
*   none
*
* ROUTINES CALLED--
*   setattribute
*   jmp
*
* ERROR CONDITIONS AND RECOVERY--
*   none
*
* NOTES--
*
* AUTHOR--
*
**********************************************************************
*
* INITIAL REFINEMENT--
*   clear user graphics display area
*   reset x,y coordinate display values to 0
*
**********************************************************************
*
* REVISION LOG--
*
**********************************************************************
$DOC-;
SUBROUTINE new_page;
BEGIN
  DG_ptr := setattribute (user_display, nop);
  jmp (DG_ptr, end_position);
  x_vector := y_vector := 0;
```

```
SDGUSER.WORK.PD8510            THU, DEC 22, 1983, 10:32 AM     PAGE   5

  IF plot_debug THEN
    BEGIN WSTR("new pg"); WHEX(DG_ptr); CRLF; END;
END new_page;
```

```
SDGUSER.WORK.PD8510            THU, DEC 22, 1983, 10:32 AM     PAGE   6

REJECT;
COMMENT
$DOC+

NAME--
  init_user_graphics
**********************************************************************
*
* SHORT DESCRIPTION--
*   initializes use of user accessible graphic display
*
* EXTENDED DESCRIPTION--
*   This routine is invoked upon setting the public HP-IB command
*   pass-thru address to the display (for user graphics purposes).
*   It initializes all user graphic display variables and sets the
*   default modes for plotting.
*
* INPUTS--
*   none
*
* OUTPUTS--
*   none
*
* ROUTINES CALLED--
*   default_mode
*
* ERROR CONDITIONS AND RECOVERY--
*   none
*
* NOTES--
*
* AUTHOR--
*
**********************************************************************
*
* INITIAL REFINEMENT--
*   set default plotting modes
*   set up plot command string to collect and parse commands
*   set display pointer for plotting to display
*
**********************************************************************
*
* REVISION LOG--
*
**********************************************************************
$DOC-;
SUBROUTINE init_user_graphics;                               ENTRY;
BEGIN
  default_mode;
  new_page;
  display_8510_on := TRUE;
  cmd_char[-1] := max_cmd_char;
  cmd_string := ADRS(cmd_char);
END init_user_graphics;
```

```
SDGUSER.WORK.PD8510            THU, DEC 22, 1983, 10:32 AM     PAGE   7

REJECT;
COMMENT
$DOC+

NAME--
  clear_8510_display
**********************************************************************
*
* SHORT DESCRIPTION--
*   clears display generated by 8510
*
* EXTENDED DESCRIPTION--
*   This routine responds to the command, CS, which clears the display
*   generated and used by the 8510 as an instrument.  Anything that
*   shows up on the display after this command is generated by HP-GL
*   type commands sent to the 8510 by command pass-thru on public HP-IB.
*
* INPUTS--
*   none
*
* OUTPUTS--
*   none
*
* ROUTINES CALLED--
*   jmp
*
* ERROR CONDITIONS AND RECOVERY--
*   none
*
* NOTES--
*
* AUTHOR--
*
**********************************************************************
*
* INITIAL REFINEMENT--
*   clear flag indicating that 8510 display is on
*   clear 8510 display
*
**********************************************************************
*
* REVISION LOG--
*
**********************************************************************
$DOC-;
SUBROUTINE clear_8510_display;
BEGIN
  display_8510_on := FALSE;
  jmp (start_display+1, user_display);
END clear_8510_display;

SUBROUTINE restore_8510_display;                             ENTRY;
BEGIN
  display_8510_on := TRUE;
  setattribute (start_display+1,nop);
END restore_8510_display;
```

SDGUSER.WORK.PDB510 THU, DEC 22, 1983, 10:32 AM PAGE 8

SDGUSER.WORK.PDB510 THU, DEC 22, 1983, 10:32 AM PAGE 9

```
#EJECT;
COMMENT
$DOC+

NAME--
  range_check_vector
**********************************************************************
*
* SHORT DESCRIPTION--
*   range check and correct x,y coordinate display values
*
* EXTENDED DESCRIPTION--
*   This routine checks the values of incoming x,y display coordinates
*   to see if they fall between 0 and 4095 (display vector resolution).
*   Any value outside this range is set to 0 if it is less than 0 or to
*   4095 if it is greater than 4095.
*
* INPUTS--
*   value - value of the x or y coordinate to range check
*           (passed by reference)
*
* OUTPUTS--
*   0 if value < 0
*   4095 if value > 4095
*
* ROUTINES CALLED--
*   none
*
* ERROR CONDITIONS AND RECOVERY--
*   none
*
* NOTES--
*
* AUTHOR--
*
**********************************************************************
*
* INITIAL REFINEMENT--
*   IF value > 4095 THEN set value to 4095
*   IF value < 0    THEN set value to 0
*
**********************************************************************
*
* REVISION LOG--
*
**********************************************************************
$DOC-;
PROCEDURE range_check_vector (vector_value);
  INTEGER vector_value;
BEGIN
  IF vector_value > 4095 THEN
    vector_value := 4095
  ELSE
  IF vector_value < 0 THEN
    vector_value := 0;
END range_check_vector;
```

SDGUSER.WORK.PDB510 THU, DEC 22, 1983, 10:32 AM PAGE 10

SDGUSER.WORK.PDB510 THU, DEC 22, 1983, 10:32 AM PAGE 11

```
#EJECT;
COMMENT
$DOC+

NAME--
  dg_plot_xy
**********************************************************************
*
* SHORT DESCRIPTION--
*   plots the vector x,y on the display
*
* EXTENDED DESCRIPTION--
*   This routine plots the x,y vector on the display based on a relative
*   or absolute plot command (PR,PA) which preceded it.  The values are
*   added to current absolute plotting values of x and y on a relative
*   plot or become the current absolute plotting values on an absolute
*   plot command.
*
*   This routine is invoked after both x and y points have been parsed
*   and converted into numerical values.  Range checking is also done
*   after the current absolute plotting values of x and y have been
*   established.
*
* INPUTS--
*   x_cmd = x value of plot command
*   y_cmd = y value of plot command
*   (These are global variables which are not passed as parameters)
*
* OUTPUTS--
*   x_vector = current absolute x plotting value
*   y_vector = current absolute y plotting value
*   (These are global variables which are not passed as parameters)
*
* ROUTINES CALLED--
*   range_check_vector
*   move
*   draw
*   jmp
*
* ERROR CONDITIONS AND RECOVERY--
*   A check is included to prevent x,y values to be written beyond
*   available user display memory.
*
* NOTES--
*
* AUTHOR--
*
**********************************************************************
*
* INITIAL REFINEMENT--
*   IF plot absolute command THEN
*     assign x,y values to current absolute x,y values
*   ELSE
*     add x,y values to current absolute x,y values
*   range check new absolute x,y values
    IF there is enough room in display memory for x,y values (2 words)
```

```
*    THEN
*      IF pen is up THEN
*        plot vector with display beam off
*      ELSE
*        plot vector with display beam on
*      update pointer to next available word in user display memory
*      reset ready flag for parsing new x,y vectors
*    ELSE
*      set pointer to next available display word to last display word
*
**************************************************************************
*
* REVISION LOG--
*
**************************************************************************
$DOC-;
SUBROUTINE DG_plot_xy;
BEGIN
  IF plot_abs THEN
    BEGIN
      x_vector := x_cmd;
      y_vector := y_cmd;
    END
  ELSE
    BEGIN
      x_vector := x_vector + x_cmd;
      y_vector := y_vector + y_cmd;
    END;
  range_check_vector (x_vector);
  range_check_vector (y_vector);
  IF (DG_ptr < end_position-2) THEN
    BEGIN
      DG_ptr := (IF pen_up THEN
                   move (DG_ptr, x_vector, y_vector)
                 ELSE
                   draw (DG_ptr, x_vector, y_vector));
      jmp (DG_ptr, end_position);
      IF plot_debug THEN
        BEGIN
          WCHAR(' ');
          IF pen_up THEN WCHAR('-) ELSE WCHAR('+');
          IF plot_abs THEN WCHAR('a) ELSE WCHAR('r');
          WCHAR('='); WHEX(x_vector); WHEX(y_vector); WSTR(" @");
          WHEX(DG_ptr); CRLF;
        END;
    END
  ELSE
    DG_ptr := end_position;
END DG_plot_xy;
```

```
#EJECT;
COMMENT
$DOC+

NAME--
  get_cmd
**************************************************************************
*
* SHORT DESCRIPTION--
*   returns the command value of command mnemonic
*
* EXTENDED DESCRIPTION--
*   This routine does a linear search for the 2-letter command mnemonic
*   just parsed in a command table (HPGL_command) and returns the
*   corresponding command value.  The end of the command table contains
*   a zero value which is used to end the linear search.  This zero
*   value is returned if a command mnemonic is not found.
*
* INPUTS--
*   none
*
* OUTPUTS--
*   command value of corresponding to index of mnemonic in command table
*   (0 if not found)
*
* ROUTINES CALLED--
*   none
*
* ERROR CONDITIONS AND RECOVERY--
*   none
*
* NOTES--
*
* AUTHOR--
*
**************************************************************************
*
* INITIAL REFINEMENT--
*   linearly search for a match between parsed mnemonic and table
*     mnemonic until found or end of table (0) is found
*
**************************************************************************
*
* REVISION LOG--
*
**************************************************************************
$DOC-;
INTEGER PROCEDURE get_cmd;
BEGIN
  INTEGER i=REGISTER 6, cmd_entry;
  i := -1;
  DO UNTIL
    ((cmd_entry := HPGL_cmd[i:=i+1]) = cmd_value) OR
     (cmd_entry = 0);                    & last command in HPGL_cmd table &
  get_cmd := i;
END get_cmd;
```

```
#EJECT;
COMMENT
$DOC+

NAME--
  call_cmd
**************************************************************************
*
* SHORT DESCRIPTION--
*   execute plot command corresponding to command value
*
* EXTENDED DESCRIPTION--
*   This routine executes the plot command just parsed.  These commands
*   consist of a small subset of HP-GL commands and a few 8510 user
*   display commands.  These commands are sent to the 8510 over the
*   public bus with a controller via pass-thru.  They allow the user
*   to use the user accessible display area as a plotter and provide
*   some limited control over the general display area.
*
*   The following are a subset of HP-GL commands that are implemented:
*
*     PA = plot absolute
*     PR = plot relative
*     PU = pen up
*     PD = pen down
*     LB = label
*     PG = page eject (acts as a clear screen or user display memory)
*     OP = output P1,P2
*     DF = default plot modes
*
*   The following are a set of 8510 user display commands to provide the
*   user some control over the general display:
*
*     KP = keep page
*          clears the user display area, but saves the user display
*          memory (with all the plot commands) until a PG command or
*          it is written over with other plot commands
*     RP = restore page
*          recalls the display area cleared but saved by a KP command
*     CS = clear screen
*          clears the 8510 display area
*     RS = restore screen
*          restores the 8510 display area
*
* INPUTS--
*   none
*
* OUTPUTS--
*   none
*
* ROUTINES CALLED--
*   get_cmd
*   new_page
*   jmp
*   setattribute
*   clear_8510_display
```

```
*   restore_8510_display
*   pub_ib_output_select
*
* ERROR CONDITIONS AND RECOVERY--
*   none
*
* NOTES--
*
* AUTHOR--
*
*************************************************************************
*
* INITIAL REFINEMENT--
*   get command value corresponding to command mnenonic just parsed
*   and execute corresponding commands/routines accordingly:
*     PA = set plot absolute flag and number parsing mode
*     PR = clear plot absolute flag and set number parsing mode
*     PU = set pen up flag
*     PD = clear pen up flage
*     LB = set label (string printing) mode
*     PG = call routine to clear user display area
*     KP = call routine to save and clear user display area
*     RP = call routine to recall user display area save with KP
*     CS = call routine to clear 8510 display
*     RS = call routine to restore 8510 display
*     OP = call routine to output the P1,P2 plot limits
*     DF = call routine to set defualt plotting modes
*
*************************************************************************
*
* REVISION LOG--
*
*************************************************************************
$DOC-;
SUBROUTINE call_cmd;
BEGIN
  IF plot_debug THEN
    BEGIN
      WCHAR(cmd_code[0]); WCHAR(cmd_code[1]);
      CRLF;
    END;
  cmd_code_ptr := x_cmd := y_cmd := -1;
  CASE get_cmd OF
    BEGIN
      & PA &
      plot_abs := parsing_x := number_mode := TRUE;
      & PR &
      BEGIN
        parsing_x := number_mode := TRUE;
        plot_abs := FALSE;
      END;
      & PU &
      pen_up := TRUE;
      & PD &
      pen_up := FALSE;
      & LB &
```

```
      BEGIN
        number_mode := FALSE;
        label_mode := TRUE;
      END;
      & PG &
      new_page;
      & KP &
      jmp (user_display, end_position);          & save page and clear &
      & RP &
      setattribute (user_display, nop);          & recall page on disp.&
      & CS &
      clear_8510_display;
      & RS &
      restore_8510_display;
      & OP&
      pub_ib_output_select (DG_p1p2_output);
      & DF &
      default_mode;
    END case;
END call_cmd;
```

```
#EJECT;
COMMENT
$DOC+

NAME--
  convert_vector
*************************************************************************
*
* SHORT DESCRIPTION--
*   converts numerical input string to integer value
*
* EXTENDED DESCRIPTION--
*
* INPUTS--
*   cmd_string or cmd_char - contains numerical input string
*                            (declared globally)
*
* OUTPUTS--
*   integer value for cmd_string input
*
* ROUTINES CALLED--
*
* ERROR CONDITIONS AND RECOVERY--
*
* NOTES--
*
* AUTHOR--
*
*************************************************************************
*
* INITIAL REFINEMENT--
*
*************************************************************************
*
* REVISION LOG--
*
*************************************************************************
$DOC-;
INTEGER PROCEDURE convert_vector;
BEGIN
  BYTE char;
  INTEGER i=REGISTER 6, start, vector_value, lgth;
  vector_value := 0;
  IF (lgth:=cmd_char[0]) > 0 THEN
    BEGIN
      start := (IF cmd_char[1] <> '- THEN
                  1 ELSE 2);
      IF lgth >= start THEN
        FOR i := start TO lgth DO
          IF ((char:=cmd_char[i]) >= '0) AND (char <= '9) THEN
            vector_value := vector_value*10 + (char-48);
      IF start = 2 THEN                          & negative number &
        vector_value := -vector_value;
    END;
  IF plot_debug THEN
    BEGIN
```

```
      IF parsing_x THEN WCHAR('x) ELSE WCHAR('y);
      WSTR(cmd_string);
    END;
  cmd_char [0] := 0;                             & reset string length to 0 &
  convert_vector := vector_value;
END convert_vector;
```

```
SDGUSER.WORK.PD8510          THU, DEC 22, 1983, 10:32 AM     PAGE  20

#EJECT;
COMMENT
$DOC+

NAME--
  parse_xy
************************************************************************
*
* SHORT DESCRIPTION--
*
* EXTENDED DESCRIPTION--
*
* INPUTS--
*
* OUTPUTS--
*
* ROUTINES CALLED--
*
* ERROR CONDITIONS AND RECOVERY--
*
* NOTES--
*
* AUTHOR--
*
************************************************************************
*
* INITIAL REFINEMENT--
*
************************************************************************
*
* REVISION LOG--
*
************************************************************************
$DOC-;
SUBROUTINE parse_xy;
BEGIN
  IF parsing_x THEN
    BEGIN
      x_cmd := convert_vector;
      parsing_x := FALSE;
    END
  ELSE
    BEGIN
      y_cmd := convert_vector;
      DG_plot_xy;
      parsing_x := TRUE;
    END;
END parse_xy;
```

```
SDGUSER.WORK.PD8510          THU, DEC 22, 1983, 10:32 AM     PAGE  21

#EJECT;
COMMENT
$DOC+

NAME--
  parse_user_graphics
************************************************************************
*
* SHORT DESCRIPTION--
*
* EXTENDED DESCRIPTION--
*
* INPUTS--
*
* OUTPUTS--
*
* ROUTINES CALLED--
*
* ERROR CONDITIONS AND RECOVERY--
*
* NOTES--
*
* AUTHOR--
*
************************************************************************
*
* INITIAL REFINEMENT--
*
************************************************************************
*
* REVISION LOG--
*
************************************************************************
$DOC-;
COMMENT
  Takes 2 character command mnemonics ONLY !!!
;
PROCEDURE parse_user_graphics (cmd);
  VALUE cmd;  BYTE cmd;                                           ENTRY;
BEGIN
  IF (cmd <= 'z) AND (cmd >= 'a) THEN               & upshift character &
    cmd := cmd - 32;
  IF label_mode THEN
    BEGIN
      IF DG_ptr < end_position THEN
      IF cmd <> ETX THEN
        append_ch (cmd_string,cmd)                  & collect label str &
      ELSE
        BEGIN
          INTEGER DG_avail;
          label_mode := FALSE;                      & end of string     &
          IF (DG_avail:=end_position-DG_ptr-1) < cmd_char[0] THEN
            cmd_char[0] := DG_avail;                & truncate lb string&
          IF DG_avail > 0 THEN
            BEGIN
              DG_ptr := lb (DG_ptr, cmd_string);    & send to display   &
```

```
SDGUSER.WORK.PD8510          THU, DEC 22, 1983, 10:32 AM     PAGE  22

              jmp (DG_ptr, end_position);
            END
          ELSE
            DG_ptr := end_position;
          IF plot_debug THEN
            BEGIN
              WSTR(cmd_string); WSTR(" @");
              WHEX(DG_ptr); CRLF;
            END;
          cmd_char[0] := 0;                         & reset lb,x,y str  &
        END;
    END
  ELSE

  IF (cmd >= 'A) AND (cmd <= 'Z) THEN               & regular commands  &
    BEGIN
      IF number_mode THEN                           & plot last x,y pts &
        BEGIN
          number_mode := FALSE;                     & terminate x,y inp.&
          parse_xy;
        END;
      cmd_code [cmd_code_ptr:=cmd_code_ptr+1] := cmd;
      IF cmd_code_ptr = 1 THEN                      & get 2 chars/cmd   &
        call_cmd;
    END
  ELSE

  IF number_mode THEN
    BEGIN                                           & parse x,y vectors &
      IF DG_ptr < end_position THEN
        IF (cmd = ',) OR (cmd = ';) OR (cmd = LF) THEN
          parse_xy
        ELSE
          append_ch (cmd_string, cmd);
    END
  ELSE
    IF plot_debug THEN BEGIN WSTR("? "); WHEX(cmd); CRLF; END;
END parse_user_graphics;


END$
```

```
SDISMON.WORK.PD8510          THU, DEC 22, 1983, 10:33 AM     PAGE   1

M68KL,L,I,A,P,"display"
BEGIN
USE REGISTER 0-11;

#FILE cdisplay.work;
#FILE fiocnfig.work;

COMMENT                                                  ,       display
************************************************************************
*                                                                      *
* EXTERNAL SPECIFICATION FOR display                                   *
*                                                                      *
* FUNCTION: to encapsulate a set of utility procedures for using the   *
*           display.                                                   *
*                                                                      *
* COMMENTS:  The routine "init_display" must be called once prior      *
*            to using any of the following routines to initialize      *
*            pointers used by the following routines.                  *
*                                                                      *
*            All of the following routines use an "a" parameter to    *
*            specify the location in the display memory where the      *
*            display instruction will be stored.  "A"=000              *
*            corresponds to the first location in the display memory   *
*            (MC68000 address %FF0000), and "a"=%3FFF corresponds      *
*            to the last location (MC68000 address %FF7FFE).  "a"      *
*            are "word" or "integer" addresses starting from the base  *
*            of the display memory -- successive locations differ by   *
*            one, as opposed to two for byte addresses used by the     *
*            MC68000.                                                  *
*                                                                      *
*            Caution should be exercised in using display locations    *
*            "a"=%3000 through %3FFF to avoid damaging the             *
*            character set vectors that are stored in those locations. *
*                                                                      *
************************************************************************
;
INTEGER CONSTANT  blanked := %1000,   & blank - x-coordinate attribute &
                  char    := %3000;   & character set block address    &
INTEGER POINTER   ldxy,
                  lda,
                  jump,
                  jumpsub,
                  rtnsub;
INTEGER POINTER   dg = lda;

COMMENT
 It is faster to use an integer procedure (function) returning the
incremented display address than to pass the display address by
reference, primarily due to the time required to increment the
display address when passed by reference.
 It is also faster to index using the address and the address+1
and then return the address+2 than it is to increment the address
between the two coordinates.
;
```

SDISMON.WORK.PD8510 THU, DEC 22, 1983, 10:33 AM PAGE 2

SDISMON.WORK.PD8510 THU, DEC 22, 1983, 10:33 AM PAGE 3

```
%EJECT;
COMMENT                                                            draw
************************************************************************
*                                                                      *
* EXTERNAL SPECIFICATION FOR draw                                      *
*                                                                      *
* FUNCTION: Draw a line from the present "pen" position to the         *
*           coordinate (x,y).  Begin at location "a" in the display    *
*           memory and return the next available display memory       *
*           location.                                                  *
*                                                                      *
* DECLARATION INFORMATION:                                             *
*    INTEGER PROCEDURE draw(a,x,y)                                     *
*       VALUE   a,x,y                                                  *
*       INTEGER a,x,y                                                  *
*                                                                      *
*    INPUT:  a          integer   display location                     *
*                                    (0 to 16383).                     *
*            x          integer   x-coordinate (-4096 to +4095).       *
*            y          integer   y-coordinate (-4096 to +4095).       *
*                                                                      *
*    OUTPUT: draw       integer   next available display location.     *
*                                                                      *
* EXTERNAL EFFECTS: none.                                              *
*                                                                      *
************************************************************************
*                                                                      *
* LOGIC INFORMATION FOR draw                                           *
*                                                                      *
* MODULES CALLED: none                                                 *
*                                                                      *
* INITIAL REFINEMENT:                                                  *
*    display_memory[a]   := x                                          *
*    display_memory[a+1] := y                                          *
*    a := a + 2                                                        *
*                                                                      *
************************************************************************
;
INTEGER PROCEDURE draw(a,x,y);
   VALUE   a,x,y;                                                ENTRY;
   INTEGER a,x,y;
   BEGIN  & draw &
      ldxy[a]   := x AND %FFF;
      ldxy[a+1] := y AND %FFF;
      draw := a + 2;
   END draw;
```

SDISMON.WORK.PD8510 THU, DEC 22, 1983, 10:33 AM PAGE 4

```
%EJECT;
COMMENT                                                           xdraw
************************************************************************
*                                                                      *
* EXTERNAL SPECIFICATION FOR xdraw                                     *
*                                                                      *
* FUNCTION: Draw a line from the present "pen" position to the         *
*           coordinate (x,y).  Begin at location "a" in the display    *
*           memory and return the next available display memory       *
*           location.  Use the current display memory y-coordinate and *
*           the supplied x-coordinate.                                 *
*                                                                      *
* DECLARATION INFORMATION:                                             *
*    INTEGER PROCEDURE xdraw(a,x)                                      *
*       VALUE   a,x                                                    *
*       INTEGER a,x                                                    *
*                                                                      *
*    INPUT:  a          integer   display location                     *
*                                    (0 to 16383).                     *
*            y          integer   y-coordinate (-4096 to +4095).       *
*                                                                      *
*    OUTPUT: xdraw      integer   next available display location.     *
*                                                                      *
* EXTERNAL EFFECTS: none.                                              *
*                                                                      *
************************************************************************
*                                                                      *
* LOGIC INFORMATION FOR xdraw                                          *
*                                                                      *
* MODULES CALLED: none                                                 *
*                                                                      *
* INITIAL REFINEMENT:                                                  *
*    display_memory[a] := x                                            *
*    a := a + 2                                                        *
*                                                                      *
************************************************************************
;
INTEGER PROCEDURE xdraw(a,x);
   VALUE   a,x;                                                  ENTRY;
   INTEGER a,x;
   BEGIN  & xdraw &
      ldxy[a]   := x AND %FFF;
      xdraw := a + 2;
   END xdraw;
```

SDISMON.WORK.PD8510 THU, DEC 22, 1983, 10:33 AM PAGE 5

```
%EJECT;
COMMENT                                                           ydraw
************************************************************************
*                                                                      *
* EXTERNAL SPECIFICATION FOR ydraw                                     *
*                                                                      *
* FUNCTION: Draw a line from the present "pen" position to the         *
*           coordinate (x,y).  Begin at location "a" in the display    *
*           memory and return the next available display memory       *
*           location.  Use the current display memory x-coordinate and *
*           the supplied y-coordinate.                                 *
*                                                                      *
* DECLARATION INFORMATION:                                             *
*    INTEGER PROCEDURE ydraw(a,y)                                      *
*       VALUE   a,y                                                    *
*       INTEGER a,y                                                    *
*                                                                      *
*    INPUT:  a          integer   display location                     *
*                                    (0 to 16383).                     *
*            y          integer   y-coordinate (-4096 to +4095).       *
*                                                                      *
*    OUTPUT: ydraw      integer   next available display location.     *
*                                                                      *
* EXTERNAL EFFECTS: none.                                              *
*                                                                      *
************************************************************************
*                                                                      *
* LOGIC INFORMATION FOR ydraw                                          *
*                                                                      *
* MODULES CALLED: none                                                 *
*                                                                      *
* INITIAL REFINEMENT:                                                  *
*    display_memory[a+1] := y                                          *
*    a := a + 2                                                        *
*                                                                      *
************************************************************************
;
INTEGER PROCEDURE ydraw(a,y);
   VALUE   a,y;                                                  ENTRY;
   INTEGER a,y;
   BEGIN  & ydraw &
      ldxy[a+1] := y AND %FFF;
      ydraw := a + 2;
   END ydraw;
```

```
%EJECT;
COMMENT                                                                 move
*************************************************************************
*                                                                       *
* EXTERNAL SPECIFICATION FOR move                                       *
*                                                                       *
* FUNCTION: Draw a blank line from the present "pen" position to the    *
*           coordinate (x,y).  Begin at location "a" in the display     *
*           memory and return the next available display memory         *
*           location.                                                   *
*                                                                       *
* DECLARATION INFORMATION:                                              *
*    INTEGER PROCEDURE move(a,x,y)                                      *
*       VALUE   a,x,y                                                   *
*       INTEGER a,x,y                                                   *
*                                                                       *
*    INPUT:  a          integer    display location                     *
*                                     (0 to 16383).                     *
*            x          integer    x-coordinate (-4096 to +4095).       *
*            y          integer    y-coordinate (-4096 to +4095).       *
*                                                                       *
*    OUTPUT: move       integer    next available display location.     *
*                                                                       *
* EXTERNAL EFFECTS: none.                                               *
*                                                                       *
*************************************************************************
*                                                                       *
* LOGIC INFORMATION FOR move                                            *
*                                                                       *
* MODULES CALLED: none                                                  *
*                                                                       *
* INITIAL REFINEMENT:                                                   *
*    display_memory[a]   := x  (blanked)                                *
*    display_memory[a+1] := y                                           *
*    a := a + 2                                                         *
*                                                                       *
*************************************************************************
;
INTEGER PROCEDURE move(a,x,y);
   VALUE   a,x,y;
   INTEGER a,x,y;                                               ENTRY;
   BEGIN  & move &
      ldxy[a]   := blanked + (x AND %FFF);
      ldxy[a+1] := y AND %FFF;
      move := a + 2;
   END move;


INTEGER PROCEDURE movech(a,row,col);
   VALUE   a,row,col;
   INTEGER a,row,col;                                           ENTRY;
   & row 1, col 1 is upper left character position &
   & movech(a,r,c) == move(a, -128*r, 64*(c-1) )   &
   BEGIN  & move &
      ldxy[a]   := blanked + LEFT((col-1 AND %3F), 6);
```

```
      ldxy[a+1] := LEFT((-row  AND %1F), 7);
      movech := a + 2;
   END move;


INTEGER PROCEDURE plot(a,x,y,penctl,linectl);
   VALUE   a,x,y,penctl,linectl;
   INTEGER a,x,y,penctl,linectl;                                ENTRY;
   BEGIN  & plot &
      ldxy[a]   := (x AND %FFF) + LEFT((penctl AND %3),12);
      ldxy[a+1] := (y AND %FFF) + LEFT((linectl AND %3),12);
      plot := a + 2;
   END plot;


INTEGER PROCEDURE printch(a,ch);
   VALUE a,ch;
   INTEGER a;
   BYTE ch;                                                     ENTRY;
   BEGIN  & printch &
      jumpsub[a] := char + (INTEGER(ch) AND %00FF);
      printch := a + 1;
   END printch;


INTEGER PROCEDURE crlf(a);
   VALUE a;
   INTEGER a;                                                   ENTRY;
   BEGIN & crlf &
      INTEGER CONSTANT  cr          := %000D,
                        lf          := %000A;
      jumpsub[a]   := char + cr;
      jumpsub[a+1] := char + lf;
      crlf := a+2;
   END crlf;


INTEGER PROCEDURE lb(a,string);
   VALUE a,string;
   INTEGER a;
   ALPHA string;                                                ENTRY;
   BEGIN  & lb &
      INTEGER i;
      BYTE POINTER ptr = string;

      FOR i := 1 UNTIL ptr[0] DO
         BEGIN & for &
            jumpsub[a] := char + (INTEGER(ptr[i]) AND %00FF);
            a := a + 1;
         END for;
      lb := a;
   END lb;
```

```
INTEGER PROCEDURE setattribute(a, attribute);
   VALUE a,attribute;
   INTEGER a;
   BYTE attribute;                                              ENTRY;
   BEGIN  & setattribute &
      lda[a] := LEFT( INTEGER(attribute AND %0F), 8);
      setattribute := a + 1;
   END setattribute;


INTEGER PROCEDURE jmp(a, address);
   VALUE a, address;
   INTEGER a, address;                                          ENTRY;
   BEGIN  & jmp &
      jump[a] := address AND %3FFF;
      jmp := a + 1;
   END jmp;


INTEGER PROCEDURE jsr(a, address);
   VALUE a, address;
   INTEGER a, address;                                          ENTRY;
   BEGIN  & jsr &
      jumpsub[a] := address AND %3FFF;
      jsr := a + 1;
   END jsr;


INTEGER PROCEDURE rts(a, attribute);
   VALUE a,attribute;
   INTEGER a;
   BYTE attribute;                                              ENTRY;
   BEGIN  & rts &
      rtnsub[a] := LEFT( INTEGER(attribute AND %0F), 8);
      rts := a + 1;
   END rts;


INTEGER PROCEDURE dg_write(a, data);
   VALUE a,data;
   INTEGER a,data;                                              ENTRY;
   BEGIN & dg_write &
      dg[a] := data;
      dg_write := a + 1;
   END dg_write;
```

```
%EJECT;
COMMENT                                                            print_hex
*************************************************************************
*                                                                       *
* EXTERNAL SPECIFICATION FOR print_hex                                  *
*                                                                       *
* FUNCTION: Display least significant byte of a number as a             *
*           hexadecimal digit.                                          *
*                                                                       *
* DECLARATION INFORMATION:                                              *
*    INTEGER PROCEDURE print_hex(a,num)                                 *
*       VALUE   a,num                                                   *
*       INTEGER a,num                                                   *
*                                                                       *
*    INPUT:   a           integer    display location                   *
*                                       (0 to 16383).                   *
*             num         integer    integer number to be displayed.    *
*                                                                       *
*    OUTPUT:  print_hex   integer    next available display location.   *
*                                                                       *
* EXTERNAL EFFECTS: none.                                               *
*                                                                       *
* COMMENT:                                                              *
*    -------------------- WARNING ------------------------              *
*    This routine is not planned for inclusion in production software.  *
* It is provided at this time for convenience until a complete i/o      *
* formatting and driver package is completed.                           *
*                                                                       *
*************************************************************************
*                                                                       *
* LOGIC INFORMATION FOR print_hex                                       *
*                                                                       *
* MODULES CALLED: none                                                  *
*                                                                       *
* INITIAL REFINEMENT:                                                   *
*    mask off least significant byte.                                   *
*    convert to hexadecimal.                                            *
*    output the resulting character.                                    *
*                                                                       *
*************************************************************************
;
INTEGER PROCEDURE print_hex(a,num);
   VALUE   a,num;
   INTEGER a,num;                                               ENTRY;
   BEGIN  & print_hex &
      num := num AND %F;
      print_hex := printch(a, num + (IF num<10 THEN 48 ELSE 55) );
   END print_hex;
```

```
SDISMON.WORK.PD8510                THU, DEC 22, 1983, 10:33 AM      PAGE  10

#EJECT;
COMMENT                                                                   dg_hex
**************************************************************************
*                                                                        *
* EXTERNAL SPECIFICATION FOR dg_hex                                      *
*                                                                        *
* FUNCTION: Display a specified number of least significant digits       *
*           of a number.                                                 *
*                                                                        *
* DECLARATION INFORMATION:                                               *
*    INTEGER PROCEDURE dg_hex(a,num,digits)                              *
*       VALUE   a,num,digits                                             *
*       DOUBLE  digits
*       INTEGER a,num                                                    *
*                                                                        *
*    INPUT:  a          integer    display location                      *
*                                     (0 to 16383).                      *
*            num        double     number to be displayed.               *
*            digits     integer    number of digits to be displayed      *
*                                                                        *
*    OUTPUT: dg_hex     integer    next available display location.      *
*                                                                        *
* EXTERNAL EFFECTS: none.                                                *
*                                                                        *
* COMMENT:                                                               *
*    -------------------- WARNING -------------------------              *
*    This routine is not planned for inclusion in production software.   *
* It is provided at this time for convenience until a complete i/o       *
* formatting and driver package is completed.                            *
*                                                                        *
**************************************************************************
*                                                                        *
* LOGIC INFORMATION FOR dg_hex                                           *
*                                                                        *
* MODULES CALLED: none                                                   *
*                                                                        *
* INITIAL REFINEMENT:                                                    *
*    move most significant byte to the least significant position.       *
*    REPEAT digits DO                                                    *
*       convert least significant byte to hex.                           *
*       output hex byte.                                                 *
*       rotate most significant byte to the least significant position.  *
*                                                                        *
**************************************************************************
;
INTEGER PROCEDURE dg_hex(a,num,digits);
   VALUE   a,num,digits;
   DOUBLE  num;
   INTEGER a,digits;                                              ENTRY;
   BEGIN  & dg_hex &
      num := RLEFT(num, 4*(9-digits));
      REPEAT digits DO
         BEGIN & repeat &
            a := print_hex(a,num);
            num := RLEFT(num,4);
         END repeat;
```

```
SDISMON.WORK.PD8510                THU, DEC 22, 1983, 10:33 AM      PAGE  11

      dg_hex := a;
   END dg_hex;


INTEGER PROCEDURE init_display;                                   ENTRY;
   BEGIN & init_display &
      INTEGER addr;
      INTEGER POINTER dg_ptr;


      & initialize pointers &
      STPNTR(lda,     ADRS(dgran) );
      STPNTR(rtnsub, ADRS(dgran) + %10000);
      STPNTR(ldxy,    ADRS(dg_ldxy) );     & offset included in fiocnfig &
      STPNTR(jumpsub,ADRS(dgran) + %40000);
      STPNTR(jump,    ADRS(dgran) + %60000);

      & initialize display &

      addr := 0;
      addr := setattribute(addr, eod);
      init_display := setattribute(addr,clear);

   END init_display;


INTEGER PROCEDURE clear_display;                                  ENTRY;
   BEGIN & clear_display &
      INTEGER addr,
              eod_attribute;
      INTEGER POINTER dg_ptr;

      eod_attribute := LEFT( INTEGER(eod AND %0F), 8 );

      STPNTR(dg_ptr, ADRS(dgran));

      REPEAT %2E7F DO         & %2E7F = 16384 - charset - monitor_display &
         BEGIN & repeat &
            dg_ptr := eod_attribute;
            STPNTR(dg_ptr, ADRS(dg_ptr[1]) );
         END;  & repeat &

      clear_display := init_display;

   END;  & clear_display &

END$
```

```
CDISP.WORK.PD8510                  THU, DEC 22, 1983, 10:33 AM      PAGE   1

INTEGER CONSTANT

cmd_single_ch := 246,
cmd_dual_ch := 247,
cmd_data := 248,
cmd_mem := 249,
cmd_d_and_m := 250,
cmd_math := 251,
cmd_d_into_m := 253,
cmd_overlay := 254,
cmd_split := 255,
cmd_memory1 := 256,
cmd_memory2 := 257,
cmd_memory3 := 258,
cmd_memory4 := 259,
cmd_memory_ch1 := 262,
cmd_memory_ch2 := 263,
cmd_d_plus_m := 264,
cmd_d_minus_m := 265,
cmd_d_mpy_m := 266,
cmd_d_div_m := 267,
cmd_group8 := 0;
```

```
FDISP.WORK.PD8510                  THU, DEC 22, 1983, 10:33 AM      PAGE   1

COMMENT
  This is a software generated file !!!
  Changes must be made in SKINFO.WORK
  Run GENSK.LRNI to re-generate file;

SUBROUTINE proc8;  ENTRY;
BEGIN

CASE command_token-246 OF
BEGIN
& 246 &
select_trace_mode( single_ch );
& 247 &
BEGIN END;
& 248 &
set_trace_type( trace_data );
& 249 &
set_trace_type( trace_mem );
& 250 &
set_trace_type( trace_data_and_mem );
& 251 &
set_trace_type( entry_ch_integer(ch_math_op) );
& 252 &
BEGIN END;
& 253 &
set_trace_type( trace_data_into_mem );
& 254 &
select_trace_mode( overlay );
& 255 &
select_trace_mode( split );
& 256 &
select_memory( mem1 );
& 257 &
select_memory( mem2 );
& 258 &
select_memory( mem3 );
& 259 &
select_memory( mem4 );
& 260 &
BEGIN END;
& 261 &
BEGIN END;
& 262 &
select_memory( data1 );
& 263 &
select_memory( data2 );
& 264 &
select_math_op( trace_data_plus_mem );
& 265 &
select_math_op( trace_data_minus_mem );
& 266 &
select_math_op( trace_data_times_mem );
& 267 &
select_math_op( trace_data_div_mem );
END;
```

FDISP.WORK.PD8510 THU, DEC 22, 1983, 10:33 AM PAGE 2

```
END proc8;
```

CDISPLAY.WORK.PD8510 THU, DEC 22, 1983, 10:33 AM PAGE 1

```
& attributes &
BYTE CONSTANT  nop          := 0,
               clear        := 1,
               incroff      := 2,
               incr         := 3,
               charincroff  := 4,
               charincr     := 5,
               brightoff    := 6,
               bright       := 7,
               dimoff       := 8,
               dim          := 9,
               eodoff       := 10,
               eod          := 11,
               blinkoff     := 12,
               blink        := 13,
               testdgoff    := 14,
               testdg       := 15;
INTEGER CONSTANT
               normal       := 0,  & x-coordinate attributes &
               blank        := 1,  & "penctl"                &
               dotted       := 2,
               dotted_blank:= 3,
               slow         := 1,  & y-coordinate attributes &
               dimchr       := 2,  & "linectl"               &
               dimchr_slow  := 3;
```

FDISPLAY.WORK.PD8510 THU, DEC 22, 1983, 10:33 AM PAGE 1

```
INTEGER PROCEDURE draw(a,x,y);
   VALUE   a,x,y;
   INTEGER a,x,y;                                        EXTERNAL;
INTEGER PROCEDURE move(a,x,y);
   VALUE   a,x,y;
   INTEGER a,x,y;                                        EXTERNAL;
INTEGER PROCEDURE move2(a,x,y);
   VALUE   a,x,y;
   INTEGER a,x,y;                                        EXTERNAL;
INTEGER PROCEDURE movech(a,row,col);
   VALUE   a,row,col;
   INTEGER a,row,col;                                    EXTERNAL;
INTEGER PROCEDURE movech2(a,row,col);
   VALUE   a,row,col;
   INTEGER a,row,col;                                    EXTERNAL;
INTEGER PROCEDURE plot(a,x,y,penctl,linectl);
   VALUE   a,x,y,penctl,linectl;
   INTEGER a,x,y,penctl,linectl;                         EXTERNAL;
INTEGER PROCEDURE printch(a,ch);
   VALUE a,ch;
   INTEGER a;
   BYTE ch;                                              EXTERNAL;
INTEGER PROCEDURE crlf(a);
   VALUE a;
   INTEGER a;                                            EXTERNAL;
INTEGER PROCEDURE lb(a,string);
   VALUE a,string;
   INTEGER a;
   ALPHA string;                                         EXTERNAL;
INTEGER PROCEDURE setattribute(a, attribute);
   VALUE a,attribute;
   INTEGER a;
   BYTE attribute;                                       EXTERNAL;
INTEGER PROCEDURE jmp(a, address);
   VALUE a, address;
   INTEGER a, address;                                   EXTERNAL;
INTEGER PROCEDURE jsr(a, address);
   VALUE a, address;
   INTEGER a, address;                                   EXTERNAL;
INTEGER PROCEDURE rts(a, attribute);
   VALUE a,attribute;
   INTEGER a;
   BYTE attribute;                                       EXTERNAL;
```

SDISPLAY.WORK.PD8510 THU, DEC 22, 1983, 10:33 AM PAGE 1

```
M68KL,P,"display"
BEGIN

#FILE cdisplay.work;
#FILE fiocnfig.work;

COMMENT                                                          display
**********************************************************************
*                                                                    *
* EXTERNAL SPECIFICATION FOR display                                 *
*                                                                    *
* FUNCTION: to encapsulate a set of utility procedures for using the *
*           display.                                                 *
*                                                                    *
* COMMENTS:  The routine "init_display" must be called once prior    *
*            to using any of the following routines to initialize    *
*            pointers used by the following routines.                *
*                                                                    *
*            All of the following routines use an "a" parameter to   *
*            specify the location in the display memory where the    *
*            display instruction will be stored.  "A"=000            *
*            corresponds to the first location in the display memory *
*            (MC68000 address %FF0000), and "a"=%3FFF corresponds    *
*            to the last location (MC68000 address %FF7FFE).  "a"    *
*            are "word" or "integer" addresses starting from the base *
*            of the display memory -- successive locations differ by *
*            one, as opposed to two for byte addresses used by the   *
*            MC68000.                                                *
*                                                                    *
*            Caution should be exercised in using display locations  *
*            "a"=%3000 through %3FFF to avoid damaging the           *
*            character set vectors that are stored in those locations. *
*                                                                    *
**********************************************************************
;
INTEGER CONSTANT  blanked := %1000,   & blank - x-coordinate attribute &
                  char    := %3000,   & character set block address    &
                  rtnsub  := %2000,   & opcode bits for RTS instruction&
                  coord_mask := %0FFF;
INTEGER POINTER   ldxy,
                  lda,
                  jump,
                  jumpsub;
INTEGER POINTER   dg = lda;

COMMENT
 It is faster to use an integer procedure (function) returning the
incremented display address than to pass the display address by
reference, primarily due to the time required to increment the
display address when passed by reference.
 It is also faster to index using the address and the address+1
and then return the address+2 than it is to increment the address
between the two coordinates.
;
```

```
#EJECT;
COMMENT                                                          draw
*********************************************************************
*                                                                   *
* EXTERNAL SPECIFICATION FOR draw                                   *
*                                                                   *
* FUNCTION: Draw a line from the present "pen" position to the      *
*           coordinate (x,y).  Begin at location "a" in the display *
*           memory and return the next available display memory    *
*           location.                                               *
*                                                                   *
* DECLARATION INFORMATION:                                          *
*    INTEGER PROCEDURE draw(a,x,y)                                  *
*       VALUE   a,x,y                                               *
*       INTEGER a,x,y                                               *
*                                                                   *
*    INPUT:   a          integer    display location                *
*                                      (0 to 16383).                *
*             x          integer    x-coordinate (-4096 to +4095).  *
*             y          integer    y-coordinate (-4096 to +4095).  *
*                                                                   *
*    OUTPUT:  draw       integer    next available display location.*
*                                                                   *
* EXTERNAL EFFECTS: none.                                           *
*                                                                   *
*********************************************************************
*                                                                   *
* LOGIC INFORMATION FOR draw                                        *
*                                                                   *
* MODULES CALLED: none                                              *
*                                                                   *
* INITIAL REFINEMENT:                                               *
*    display_memory[a]   := x                                       *
*    display_memory[a+1] := y                                       *
*    a := a + 2                                                     *
*                                                                   *
*********************************************************************
;
INTEGER PROCEDURE draw(a,x,y);
   VALUE   a,x,y;
   INTEGER a,x,y;                                            ENTRY;
   BEGIN  & draw &
      ldxy[a]   := x AND coord_mask;
      ldxy[a+1] := y AND coord_mask;
      draw := a + 2;
   END draw;
```

```
#EJECT;
COMMENT                                                         xdraw
*********************************************************************
*                                                                   *
* EXTERNAL SPECIFICATION FOR xdraw                                  *
*                                                                   *
* FUNCTION: Draw a line from the present "pen" position to the      *
*           coordinate (x,y).  Begin at location "a" in the display *
*           memory and return the next available display memory    *
*           location.  Use the current display memory y-coordinate and *
*           the supplied x-coordinate.                              *
*                                                                   *
* DECLARATION INFORMATION:                                          *
*    INTEGER PROCEDURE xdraw(a,x)                                   *
*       VALUE   a,x                                                 *
*       INTEGER a,x                                                 *
*                                                                   *
*    INPUT:   a          integer    display location                *
*                                      (0 to 16383).                *
*             y          integer    y-coordinate (-4096 to +4095).  *
*                                                                   *
*    OUTPUT:  xdraw      integer    next available display location.*
*                                                                   *
* EXTERNAL EFFECTS: none.                                           *
*                                                                   *
*********************************************************************
*                                                                   *
* LOGIC INFORMATION FOR xdraw                                       *
*                                                                   *
* MODULES CALLED: none                                              *
*                                                                   *
* INITIAL REFINEMENT:                                               *
*    display_memory[a] := x                                         *
*    a := a + 2                                                     *
*                                                                   *
*********************************************************************
;
INTEGER PROCEDURE xdraw(a,x);
   VALUE   a,x;
   INTEGER a,x;                                              ENTRY;
   BEGIN  & xdraw &
      ldxy[a]   := x AND coord_mask;
      xdraw := a + 2;
   END xdraw;
```

```
#EJECT;
COMMENT                                                         ydraw
*********************************************************************
*                                                                   *
* EXTERNAL SPECIFICATION FOR ydraw                                  *
*                                                                   *
* FUNCTION: Draw a line from the present "pen" position to the      *
*           coordinate (x,y).  Begin at location "a" in the display *
*           memory and return the next available display memory    *
*           location.  Use the current display memory x-coordinate and *
*           the supplied y-coordinate.                              *
*                                                                   *
* DECLARATION INFORMATION:                                          *
*    INTEGER PROCEDURE ydraw(a,y)                                   *
*       VALUE   a,y                                                 *
*       INTEGER a,y                                                 *
*                                                                   *
*    INPUT:   a          integer    display location                *
*                                      (0 to 16383).                *
*             y          integer    y-coordinate (-4096 to +4095).  *
*                                                                   *
*    OUTPUT:  ydraw      integer    next available display location.*
*                                                                   *
* EXTERNAL EFFECTS: none.                                           *
*                                                                   *
*********************************************************************
*                                                                   *
* LOGIC INFORMATION FOR ydraw                                       *
*                                                                   *
* MODULES CALLED: none                                              *
*                                                                   *
* INITIAL REFINEMENT:                                               *
*    display_memory[a+1] := y                                       *
*    a := a + 2                                                     *
*                                                                   *
*********************************************************************
;
INTEGER PROCEDURE ydraw(a,y);
   VALUE   a,y;
   INTEGER a,y;                                              ENTRY;
   BEGIN  & ydraw &
      ldxy[a+1] := y AND coord_mask;
      ydraw := a + 2;
   END ydraw;
```

```
$EJECT;
COMMENT                                                                  move
***************************************************************************
*                                                                         *
* EXTERNAL SPECIFICATION FOR move                                         *
*                                                                         *
* FUNCTION: Draw a blank line from the present "pen" position to the      *
*           coordinate (x,y).  Begin at location "a" in the display       *
*           memory and return the next available display memory          *
*           location.                                                     *
*                                                                         *
* DECLARATION INFORMATION:                                                *
*    INTEGER PROCEDURE move(a,x,y)                                        *
*      VALUE   a,x,y                                                      *
*      INTEGER a,x,y                                                      *
*                                                                         *
*   INPUT:  a          integer    display location                        *
*                                    (0 to 16383).                        *
*           x          integer    x-coordinate (-4096 to +4095).          *
*           y          integer    y-coordinate (-4096 to +4095).          *
*                                                                         *
*   OUTPUT: move       integer    next available display location.        *
*                                                                         *
* EXTERNAL EFFECTS: none.                                                 *
*                                                                         *
***************************************************************************
*                                                                         *
* LOGIC INFORMATION FOR move                                              *
*                                                                         *
* MODULES CALLED: none                                                    *
*                                                                         *
* INITIAL REFINEMENT:                                                     *
*    display_memory[a]   := x  (blanked)                                  *
*    display_memory[a+1] := y                                             *
*    a := a + 2                                                           *
*                                                                         *
***************************************************************************
;
INTEGER PROCEDURE move(a,x,y);
  VALUE   a,x,y;
  INTEGER a,x,y;                                              ENTRY;
  BEGIN & move &
    ldxy[a]   := blanked + (x AND coord_mask);
    ldxy[a+1] := y AND coord_mask;
    move := a + 2;
  END;  & move &

INTEGER PROCEDURE move2(a,x,y);
  VALUE   a,x,y;
  INTEGER a,x,y;                                              ENTRY;
  BEGIN & move2 &
    a     := move(a,x,y);
    move2 := move(a,x,y);
  END;  & move2 &
```

```
INTEGER PROCEDURE movech(a,row,col);
  VALUE   a,row,col;
  INTEGER a,row,col;                                          ENTRY;
  & row 1, col 1 is upper left character position &
  & movech(a,r,c) == move(a, -128*r, 64*(c-1) )  &
  BEGIN & movech &
    ldxy[a]   := blanked + LEFT((col-1 AND %003F), 6);
    ldxy[a+1] := LEFT((-row  AND %001F), 7);
    movech := a + 2;
  END;  & movech &

INTEGER PROCEDURE movech2(a,row,col);
  VALUE   a,row,col;
  INTEGER a,row,col;                                          ENTRY;
  BEGIN & movech2 &
    a       := movech(a,row,col);
    movech2 := movech(a,row,col);
  END;  & movech2 &


INTEGER PROCEDURE plot(a,x,y,penctl,linectl);
  VALUE   a,x,y,penctl,linectl;
  INTEGER a,x,y,penctl,linectl;                               ENTRY;
  BEGIN  & plot &
    ldxy[a]   := (x AND coord_mask) + LEFT((penctl AND %0003),12);
    ldxy[a+1] := (y AND coord_mask) + LEFT((linectl AND %0003),12);
    plot := a + 2;
  END plot;


INTEGER PROCEDURE printch(a,ch);
  VALUE a,ch;
  INTEGER a;
  BYTE ch;                                                    ENTRY;
  BEGIN  & printch &
    jumpsub[a] := char + (INTEGER(ch) AND %00FF);
    printch := a + 1;
  END printch;


INTEGER PROCEDURE crlf(a);
  VALUE a;
  INTEGER a;                                                  ENTRY;
  BEGIN & crlf &
    INTEGER CONSTANT  cr          := %000D,
                      lf          := %000A;
    jumpsub[a]   := char + cr;
    jumpsub[a+1] := char + lf;
    crlf := a+2;
  END crlf;
```

```
INTEGER PROCEDURE lb(a,string);
  VALUE a,string;
  INTEGER a;
  ALPHA string;                                               ENTRY;
  BEGIN  & lb &
    INTEGER i;
    BYTE POINTER ptr = string;

    FOR i := 1 UNTIL ptr[0] DO
      BEGIN & for &
        jumpsub[a] := char + (INTEGER(ptr[i]) AND %00FF);
        a := a + 1;
      END for;
    lb := a;
  END lb;


INTEGER PROCEDURE setattribute(a, attribute);
  VALUE a,attribute;
  INTEGER a;
  BYTE attribute;                                             ENTRY;
  BEGIN  & setattribute &
    lda[a] := LEFT( INTEGER(attribute AND %000F), 8);
    setattribute := a + 1;
  END setattribute;


INTEGER PROCEDURE jmp(a, address);
  VALUE a, address;
  INTEGER a, address;                                         ENTRY;
  BEGIN  & jmp &
    jump[a] := address AND %3FFF;
    jmp := a + 1;
  END jmp;


INTEGER PROCEDURE jsr(a, address);
  VALUE a, address;
  INTEGER a, address;                                         ENTRY;
  BEGIN  & jsr &
    jumpsub[a] := address AND %3FFF;
    jsr := a + 1;
  END jsr;


INTEGER PROCEDURE rts(a, attribute);
  VALUE a,attribute;
  INTEGER a;
  BYTE attribute;                                             ENTRY;
  BEGIN  & rts &
    dg[a] := rtnsub OR LEFT( INTEGER(attribute AND %000F), 8);
```

```
    rts := a + 1;
  END rts;


INTEGER PROCEDURE dg_write(a, data);
  VALUE a,data;
  INTEGER a,data;                                             ENTRY;
  BEGIN & dg_write &
    dg[a] := data;
    dg_write := a + 1;
  END dg_write;


INTEGER PROCEDURE dg_read(a, data);
  VALUE a;
  INTEGER a,data;                                             ENTRY;
  BEGIN & dg_read &
    data := dg[a];
    dg_read := a + 1;
  END;  & dg_read &


INTEGER PROCEDURE dg_read_xy(a, x, y);
  VALUE a;
  INTEGER a,x,y;                                              ENTRY;
  BEGIN & dg_read_xy &
    x := dg[a];
    y := dg[a+1];
    dg_read_xy := a + 2;
  END;  & dg_read_xy &
```

```
SDISPLAY.WORK.PD8510            THU, DEC 22, 1983, 10:33 AM     PAGE  10

#EJECT;
COMMENT                                                          print_hex
**************************************************************************
*                                                                        *
* EXTERNAL SPECIFICATION FOR print_hex                                   *
*                                                                        *
* FUNCTION: Display least significant byte of a number as a              *
*           hexadecimal digit.                                           *
*                                                                        *
* DECLARATION INFORMATION:                                               *
*    INTEGER PROCEDURE print_hex(a,num)                                  *
*       VALUE   a,num                                                    *
*       INTEGER a,num                                                    *
*                                                                        *
*    INPUT:   a            integer   display location                    *
*                                       (0 to 16383).                    *
*             num          integer   integer number to be displayed.     *
*                                                                        *
*    OUTPUT:  print_hex    integer   next available display location.    *
*                                                                        *
* EXTERNAL EFFECTS: none.                                                *
*                                                                        *
* COMMENT:                                                               *
*    ------------------- WARNING -----------------------                 *
*    This routine is not planned for inclusion in production software.   *
* It is provided at this time for convenience until a complete i/o       *
* formatting and driver package is completed.                            *
*                                                                        *
**************************************************************************
*                                                                        *
* LOGIC INFORMATION FOR print_hex                                        *
*                                                                        *
* MODULES CALLED: none                                                   *
*                                                                        *
* INITIAL REFINEMENT:                                                    *
*    mask off least significant byte.                                    *
*    convert to hexadecimal.                                             *
*    output the resulting character.                                     *
*                                                                        *
**************************************************************************
;
INTEGER PROCEDURE print_hex(a,num);
   VALUE   a,num;
   INTEGER a,num;                                                   ENTRY;
   BEGIN  & print_hex &
      num := num AND Z000F;
      print_hex := printch(a, num + (IF num<10 THEN 48 ELSE 55) );
   END print_hex;
```

```
SDISPLAY.WORK.PD8510            THU, DEC 22, 1983, 10:33 AM     PAGE  11

#EJECT;
COMMENT                                                             dg_hex
**************************************************************************
*                                                                        *
* EXTERNAL SPECIFICATION FOR dg_hex                                      *
*                                                                        *
* FUNCTION: Display a specified number of least significant digits       *
*           of a number.                                                 *
*                                                                        *
* DECLARATION INFORMATION:                                               *
*    INTEGER PROCEDURE dg_hex(a,num,digits)                              *
*       VALUE   a,num,digits                                             *
*       DOUBLE  digits                                                   *
*       INTEGER a,num                                                    *
*                                                                        *
*    INPUT:   a            integer   display location                    *
*                                       (0 to 16383).                    *
*             num          double    number to be displayed.             *
*             digits       integer   number of digits to be displayed    *
*                                                                        *
*    OUTPUT:  dg_hex       integer   next available display location.    *
*                                                                        *
* EXTERNAL EFFECTS: none.                                                *
*                                                                        *
* COMMENT:                                                               *
*    ------------------- WARNING -----------------------                 *
*    This routine is not planned for inclusion in production software.   *
* It is provided at this time for convenience until a complete i/o       *
* formatting and driver package is completed.                            *
*                                                                        *
**************************************************************************
*                                                                        *
* LOGIC INFORMATION FOR dg_hex                                           *
*                                                                        *
* MODULES CALLED: none                                                   *
*                                                                        *
* INITIAL REFINEMENT:                                                    *
*    move most significant byte to the least significant position.       *
*    REPEAT digits DO                                                    *
*       convert least significant byte to hex.                           *
*       output hex byte.                                                 *
*       rotate most significant byte to the least significant position.*
*                                                                        *
**************************************************************************
;
INTEGER PROCEDURE dg_hex(a,num,digits);
   VALUE   a,num,digits;
   DOUBLE  num;
   INTEGER a,digits;                                                ENTRY;
   BEGIN  & dg_hex &
      num := RLEFT(num, 4*(9-digits));
      REPEAT digits DO
         BEGIN & repeat &
            a := print_hex(a,num);
            num := RLEFT(num,4);
         END repeat;
```

```
SDISPLAY.WORK.PD8510            THU, DEC 22, 1983, 10:33 AM     PAGE  12

      dg_hex := a;
   END dg_hex;


INTEGER PROCEDURE init_display;                                     ENTRY;
   BEGIN & init_display &
      INTEGER addr,
              eod_attribute;
      INTEGER POINTER dg_ptr;

      eod_attribute := LEFT( INTEGER(eod AND Z000F), 8 );

      STPNTR(dg_ptr, ADRS(dgram));

      REPEAT Z2E7F DO       & Z2E7F = 16384 - charset - monitor_display &
         BEGIN & repeat &
            dg_ptr := eod_attribute;
            STPNTR(dg_ptr, ADRS(dg_ptr[1]) );
         END;  & repeat &

      & initialize pointers &
      STPNTR(lda,     ADRS(dgram) );
      STPNTR(ldxy,    ADRS(dg_ldxy) );     & offset included in fiocnfig &
      STPNTR(jumpsub,ADRS(dgram) + Z040000);
      STPNTR(jump,    ADRS(dgram) + Z060000);

      & initialize display &

      COMMENT display memory is currently full of eod's.  Location 0
            will retain its eod.  Location 1 will be replaced later by
            an attribute clear.
            ;
      init_display := 2; & 0=eod, 1=eod, return 2 -- see clear_display &

   END init_display;


INTEGER PROCEDURE clear_display;                                    ENTRY;
   BEGIN & clear_display &

      init_display;                      & returned variable not used &
      setattribute( 1, clear );          &            ditto           &
      clear_display := 2;          & 0=eod, 1=clear attributes, return 2 &

   END;  & clear_display &

END$
```

```
FDISPLY2.WORK.PD8510            THU, DEC 22, 1983, 10:33 AM     PAGE   1

INTEGER PROCEDURE xdraw(a,x);
   VALUE   a,x;
   INTEGER a,x;                                                  EXTERNAL;
INTEGER PROCEDURE ydraw(a,y);
   VALUE   a,y;
   INTEGER a,y;                                                  EXTERNAL;
INTEGER PROCEDURE dg_write(a, data);
   VALUE a,data;
   INTEGER a,data;                                               EXTERNAL;
INTEGER PROCEDURE dg_read(a, data);
   VALUE a;
   INTEGER a,data;                                               EXTERNAL;
INTEGER PROCEDURE dg_read_xy(a, x, y);
   VALUE a;
   INTEGER a,x,y;                                                EXTERNAL;
INTEGER PROCEDURE print_hex(a,num);
   VALUE   a,num;
   INTEGER a,num;                                                EXTERNAL;
INTEGER PROCEDURE dg_hex(a,num,digits);
   VALUE   a,num,digits;
   DOUBLE  num;
   INTEGER a,digits;                                             EXTERNAL;
INTEGER PROCEDURE init_display;                                  EXTERNAL;
INTEGER PROCEDURE clear_display;                                 EXTERNAL;
```

```
ADISPRAM.WORK.PD8510            THU, DEC 22, 1983, 10:33 AM     PAGE   1

ASMB,R
 NAM dispram,7,"JTB.PD8510    7/2/83"
*
R0  REG 0
R1  REG 1
R2  REG 2
R3  REG 3
R8  REG 8
R9  REG 9
S   REG 15
*
 ENT  wrt_disp_quad
 ENT  wrt_disp_dbl
 ENT  wrt_disp_real
 ENT  wrt_disp_int
 ENT  wrt_disp_byte
 ENT  wrt_disp_str
************************************************************************
* wrt_disp_quad( add, val ); VALUE add, val; DOUBLE add; QUAD val;
* wrt_disp_dbl(  add, val ); VALUE add, val; DOUBLE add; DOUBLE val;
* wrt_disp_real( add, val ); VALUE add, val; DOUBLE add; REAL val;
* wrt_disp_int(  add, val ); VALUE add, val; DOUBLE add; INTEGER val;
* wrt_disp_byte( add, val ); VALUE add, val; DOUBLE add; BYTE val;
* wrt_disp_str(  add, str_add ); VALUE add, str_add; DOUBLE add;
*                                                    ALPHA str_add;
*
* These routines handle the transfer of data from main memory to display
*  ( expanded ) memory. The destination address is aways the first
*  param with the item to move ( or its address in the case of strings )
*  is the second. The string item may be in display memory.
*
* The routines are DOUBLE PROCEDUREs, returning the incremented display
*  ram address in R0.
*
* The stack cannot be in display memory.
*
* The present display memory cannot accept byte writes and if multiword
*  write are too close to each other ( approx 1.5 uSecS ) problems occur
* However the hardware will support byte and multi word reads.
************************************************************************
*
```

```
ADISPRAM.WORK.PD8510            THU, DEC 22, 1983, 10:33 AM     PAGE   2

*EJECT
wrt_disp_quad EQU *
   MOVE.L R0,     R8              disp address ptr
   MOVE.L (S)+,   R9              save rtr address
   MOVE.W (S)+,   (R8)+           start moving first word of item from stack
   MOVE.W (S)+,   (R8)+
wrt_disp_2word EQU *
   MOVE.W (S)+,   (R8)+
wrt_disp_1word EQU *
   MOVE.W (S)+,   (R8)+
   MOVE.L R8,     R0               rtr incremented disp address
   JMP    (R9)                     RTS
*
wrt_disp_dbl  EQU *
wrt_disp_real EQU *
   MOVE.L R0,     R8              disp address ptr
   MOVE.L (S)+,   R9              save rtr address
   BRA wrt_disp_2word
*
wrt_disp_int  EQU *
   MOVE.L R0,     R8              disp address ptr
   MOVE.L (S)+,   R9              save rtr address
   BRA wrt_disp_1word
```

```
ADISPRAM.WORK.PD8510            THU, DEC 22, 1983, 10:33 AM     PAGE   3

*EJECT
*
* wrt_disp_byte first creates the  memory contents on the stack and then
*  writes a full word . This requires to first read the unmodified byte
*  portion and ORing with the modified portion
*
* is used by disp_wrt_str
*
wrt_disp_byte EQU *
   MOVE.L R0,     R1              copy disp ptr
   BCLR   #0,     R1              clear and test for even/odd address
   MOVE.L R1,     R8              move word ptr - does not effect status CC
   BEQ    even
*        odd destination address
   MOVE.B (R8),  4(S)
   BRA    wrt
even EQU * even destination address
   MOVE.B 5(S),  4(S)             swap stack bytes
   MOVE.B 1(R8), 5(S)
wrt  EQU *
   MOVE.W 4(S),  (R8)
   ADD.L  #1,     R0
   MOVE.L (S),    R8
   ADD.W  #6,     S               reset stack pointer
   JMP    (R8)
*
*
wrt_disp_str EQU *
   MOVE.L 4(S),   R9              R0 has disp add, now R9 str add
   MOVE.B  (R9), R2               get string length
   EXTS.W  R2
loop EQU *
   MOVE.B  (R9)+,R3               get byte -- starting with length byte
   MOVE.W  R3,  -(S)              stash on stak -- donot care about MSB half
   BSR     wrt_disp_byte
   DBRA    R2,   loop
*
   MOVE.L  (S),   R8
   ADD.W   #8,    S               clear off stack
   JMP     (R8)
*
   END
```

```
FDISPRAM.WORK.PD8510            THU, DEC 22, 1983, 10:34 AM     PAGE   1

DOUBLE PROCEDURE  wrt_disp_quad( add, val );
       VALUE add, val; DOUBLE add; QUAD val;                     EXTERNAL;
DOUBLE PROCEDURE  wrt_disp_dbl(  add, val );
      VALUE add, val; DOUBLE add; DOUBLE val;                    EXTERNAL;
DOUBLE PROCEDURE  wrt_disp_real( add, val );
      VALUE add, val; DOUBLE add; REAL   val;                    EXTERNAL;
DOUBLE PROCEDURE  wrt_disp_int(  add, val );
      VALUE add, val; DOUBLE add; INTEGER val;                   EXTERNAL;
DOUBLE PROCEDURE  wrt_disp_byte( add, val );
      VALUE add, val; DOUBLE add; BYTE   val;                    EXTERNAL;
DOUBLE PROCEDURE  wrt_disp_str(  add, str_add );
      VALUE add, str_add; DOUBLE add; ALPHA  str_add;            EXTERNAL;
```

```
CDISPTBL.WORK.PD8510            THU, DEC 22, 1983, 10:34 AM     PAGE   1

INTEGER CONSTANT                                    & case indexes &
   dg_stop                   :=  0,
   dg_jmp                    :=  1,
   dg_jmp_new_adr            :=  2,
   dg_move                   :=  3,
   dg_move_new_adr           :=  4,
   dg_movech                 :=  5,
   dg_movech_new_adr         :=  6,
   dg_printch                :=  7,
   dg_setattribute_new_adr   :=  8,
   dg_move2_new_adr          :=  9,
   dg_movech2_new_adr        := 10;
```

```
FDISPTBL.WORK.PD8510            THU, DEC 22, 1983, 10:34 AM     PAGE   1

#FILE cdisptbl.work;

INTEGER PROCEDURE display_from_table( addr, table_addr );
   VALUE   addr, table_addr;
   INTEGER addr;
   DOUBLE  table_addr;                                          EXTERNAL.L;
```

```
SDISPTBL.WORK.PD8510            THU, DEC 22, 1983, 10:34 AM     PAGE   1

M68KL,P,"disptbl"
BEGIN

#FILE fdisplay.work;
#FILE cdisptbl.work;
```

```
SDISPTBL.WORK.PD8510            THU, DEC 22, 1983, 10:34 AM     PAGE   2

#EJECT;
COMMENT                                                  display_from_table
*************************************************************************
*
;
INTEGER PROCEDURE display_from_table( addr, table_addr );
   VALUE   addr, table_addr;
   INTEGER addr;
   DOUBLE  table_addr;                                          ENTRY;
   BEGIN & display_from_table &
      INTEGER size;
      INTEGER POINTER line;

      STPNTR( line, table_addr );

      WHILE line <> dg_stop DO
         BEGIN & while &
            CASE line OF
               BEGIN & case &
& dg_stop                 & ;
& dg_jmp                  & BEGIN
                               addr := jmp(addr, line[1]);
                               size := 2;
                            END;
& dg_jmp_new_adr          & BEGIN
                               addr := jmp(line[1], line[2]);
                               size := 3;
                            END;
& dg_move                 & BEGIN
                               addr := move(addr, line[1], line[2]);
                               size := 3;
                            END;
& dg_move_new_adr         & BEGIN
                               addr := move(line[1], line[2], line[3]);
                               size := 4;
                            END;
& dg_movech               & BEGIN
                               addr := movech(addr, line[1], line[2]);
                               size := 3;
                            END;
& dg_movech_new_adr       & BEGIN
                               addr := movech(line[1],line[2],line[3]);
                               size := 4;
                            END;
& dg_printch              & BEGIN
                               addr := printch(addr,line[1]);
                               size := 2;
                            END;
& dg_setattrivute_new_adr & BEGIN
                               addr := setattribute(line[1], line[2]);
                               size := 3;
                            END;
& dg_move2_new_adr        & BEGIN
                               addr := move2(line[1], line[2], line[3]);
                               size := 4;
                            END;
```

```
SDISPTBL.WORK.PD8510            THU, DEC 22, 1983, 10:34 AM     PAGE   3

& dg_movech2_new_adr        & BEGIN
                                addr := movech2(line[1],line[2],line[3]);
                                size := 4;
                              END;
          END;  & case &
        STPNTR( line, ADRS(line[size]) );
      END;  & while &

    display_from_table := addr;

  END;  & display_from_table &

ENDS
```

```
ADIV3.WORK.PD8510               THU, DEC 22, 1983, 10:34 AM     PAGE   2

      MOVE.L 4(S),R8
      MOVE   (R8),R8
      MOVE.L (R8),R8         ** modified to dave's 1-word absolute G mode
      EXG    R1,R8
      ADDQ.L #2,4(S)
      RTS
*
LDR2A EXG    R1,R8
      MOVE.L 4(S),R8
      ADD    (R8),R8         COMPUTE ADDRESS RELATIVE TO CALL
      MOVE.L (R8),R8         FETCH OPERAND
      EXG    R1,R8
      ADDQ.L #2,4(S)
      RTS
*
DIV3T BSR    LDR2T
      BRA    DIV3
DIV3M BSR    LDR2M
      BRA    DIV3
DIV3G BSR    LDR2G
      BRA    DIV3
DIV3A BSR    LDR2A
      BRA    DIV3
DVR3T BSR    LDR2T
      BRA    DVR3
DVR3M BSR    LDR2M
      BRA    DVR3
DVR3G BSR    LDR2G
      BRA    DVR3
DVR3A BSR    LDR2A
DVR3  EXG    R1,R0   EXCHANGE REGISTERS
DIV3  TST.L  R1
      BEQ    DVZRO   DIVIDE BY ZERO?
      BGE    DV301   PLUS?
      CMP.L  =D-32768,R1   CHECK FOR 16 BIT DIVISOR
      BLT    DV305   NOPE
      BRA    DV302   YES
DV301 CMP.L  =D32767,R1    CHECK FOR POSITIVE 16 BIT DIVISOR
      BGT    DV305   NOPE
DV302 MOVE.L R0,-(S) SAVE R0 IN CASE OF OVERFLOW
      DIVS   R1,R0.  TRY DIVIDING
      BVS    DV304   DO LONG WAY IF OVERFLOW
      ADDQ.L #4,S    DIVIDE OK, DUMP SAVED R0
      MOVE.L R0,R1   SEPARATE QUOTIENT AND REMAINDER
      SWAP   R1
      EXTS.L R1
      EXTS.L R0      CONVERT RESULTS TO 32 BITS
      RTS            RETURN TO CALLER
*
DV304 MOVE.L (S)+,R0 RESTORE R0 FROM STACK
DV305 MOVEM.L R2/R3,-(S)   SAVE REGISTERS
      MOVEQ  #32,R3  LOOP COUNTER
      CLR.L  R2
      CLR    -(S)    RESULT AND REMAINDER SIGN
      BSR    DIV3R   INITIALIZE REGISTERS
      BRA    DV330
```

```
ADIV3.WORK.PD8510               THU, DEC 22, 1983, 10:34 AM     PAGE   1

ASMB,R
     HED TYPE 3 DIVIDE
     NAM DIV3,7,"jtb 3/83"
     ENT DVR3,DVR3A,DVR3M,DVR3T,DIV3,DIV3A,DIV3M,DIV3T
     ENT MOD3,MOD3A,MOD3G
     ENT DIV3G,DVR3G
     ENT DIV3R,DIV3L
     ENT LDR2A,LDR2G,LDR2M,LDR2T
*
R0   REG 0
R1   REG 1
R2   REG 2
R3   REG 3
R8   REG 8
G    REG 13
M    REG 14
S    REG 15
*
*MDR3T BSR   LDR2T
*      BRA   MDR3
*MDR3M BSR   LDR2M
*      BRA   MDR3
*MDR3G BSR   LDR2G
*      BRA   MDR3
*MDR3A BSR   LDR2A
*MDR3  BSR   DVR3
*      EXG   R0,R1
*      RTS
*MOD3T BSR   LDR2T
*      BRA   MOD3
*MOD3M BSR   LDR2M
*      BRA   MOD3
MOD3G BSR    LDR2G
      BRA    MOD3
MOD3A BSR    LDR2A
MOD3  BSR    DIV3
      EXG    R0,R1
      TST.L  R0
      RTS
*
LDR2T MOVE.L 8(S),R1
      MOVE.L 4(S),8(S)
      MOVE.L (S),4(S)
      ADDQ.L #4,S
      RTS
*
LDR2M EXG    R1,R8
      MOVE.L 4(S),R8
      MOVE   (R8),R8
      MOVE.L 0(M,R8),R8
      EXG    R1,R8
      ADDQ.L #2,4(S)
      RTS
*
LDR2G EXG    R1,R8
```

```
ADIV3.WORK.PD8510               THU, DEC 22, 1983, 10:34 AM     PAGE   3

DV320 LSL.L  #1,R0   GET DIVIDEND BIT
      ROXL.L #1,R2   INSERT IN REMAINDER
DIV3L:DV330 CMP.L  R1,R2   CAN WE SUBTRACT?
      BMI    DV340   SKIP IF NO
      SUB.L  R1,R2
      ADDQ.L #1,R0   SET QUOTIENT BIT
DV340 SUBQ   #1,R3   DECREMENT LOOP COUNTER
      BGE    DV320   GO DO NEXT BIT
      MOVE.L R2,R1   POSITION REMAINDER
DV345 MOVE   (S)+,R2 GET SIGN INFO
      BGE    DV350   QUOTIENT POSITIVE
      NEG.L  R0
DV350 TST.B  R2
      BGE    DV360   REMAINDER POSITIVE
      NEG.L  R1
DV360 MOVEM.L (S)+,R2/R3
      RTS
*
DVZRO MOVE.L =H7FFFFFFF,R0
      CLR.L  R1
      BRA    DV345
*
DIV3R TST.L  R0    POSITIVE?
      BGE    DV310
      NOT    4(S)
      NEG.L  R0
DV310 TST.L  R1     POSITIVE?
      BGE    DV315
      NOT.B  4(S)
      NEG.L  R1
DV315 RTS
      END
```

```
CDDMAIN.WORK.PD8510              THU, DEC 22, 1983, 10:34 AM      PAGE   1

& time domain - [ch_domain] &
INTEGER CONSTANT  freq_domain         := 0,
                  time_domain         := 1,
                  tdr_domain          := 2,
                  aux_domain          := 3,

                  max_domain          := 3;
```

```
FDOMAIN.WORK.PD8510              THU, DEC 22, 1983, 10:34 AM      PAGE   1

PROCEDURE  update_domain_vars;                              EXTERNAL.L;
PROCEDURE  partial_set_domain;                              EXTERNAL.L;
```

```
SDOMAIN.WORK.PD8510              THU, DEC 22, 1983, 10:34 AM      PAGE   1

M68KL,P,"domain"
BEGIN

$FILE futil3.work;                          & for warn & & DEBUG &
$FILE cmessag0.work;       & for command_not_implemented & & DEBUG &
$FILE cdommenu.work;
$FILE factive.work;
$FILE factive2.work;
$FILE facttbl.work;
$FILE cchtable.work;
$FILE fchtable.work;
$FILE fchtab2.work;                              & for ch_integer &
$FILE fchtab3.work;                              & for coupled_ch &
$FILE fchdata.work;                            & for marker_state &
$FILE cdatap.work;                & for update_raw_array, and ... &
$FILE fcommand.work;
$FILE fmenu.work;
$FILE fcontv2.work;                                 & for rebuild &
$FILE fcontrol.work;         & for abort_sweep and restart_sweep &
$FILE fscreen.work;        & for print_string and screen addresses &
$FILE fstimuli.work;         & for update_start_stop_center_span &
$FILE fstimul3.work;                       & for annotate_stimulus &
$FILE ffifo.work;                                & for write_fifo &
$FILE ffifos.work;                        & for array_update_fifo &
$FILE carray.work;       & for time_update_mask and array_ch_mask &
$FILE fcouple.work;                      & for set_coupled_status &
$FILE ftime.work;                                 & for tdr_check &
$FILE fpfr.work;                                 & for recall_pfr &
$FILE ftrace0.work;                                 & for partial &

PROCEDURE  new_format_partial;                            EXTERNAL;


INTEGER CONSTANT gate_markers_on  := %01C0,
                 gate_markers_off := %FE3F;
```

```
SDOMAIN.WORK.PD8510              THU, DEC 22, 1983, 10:34 AM      PAGE   2

$EJECT;
COMMENT                                              update_domain_vars
***********************************************************************
&
***********************************************************************
;
PROCEDURE  update_domain_vars;                                   ENTRY;
   BEGIN & update_domain_vars &
      INTEGER fifo_word;
      BYTE    fifo_word_upper = fifo_word,
              fifo_word_lower = fifo_word+1;

      fifo_word_lower := 0;
      fifo_word_upper := time_update_mask OR (current_entry_ch AND
                                               array_ch_mask
                                             );
      write_fifo( array_update_fifo, fifo_word );
   END;  & update_domain_vars &
```

```
SDOMAIN.WORK.PD8510          THU, DEC 22, 1983, 10:34 AM     PAGE   3

#EJECT;
COMMENT                                                        set_domain
*************************************************************************
*
*************************************************************************
;                                        &
PROCEDURE  partial_set_domain;                                    ENTRY;
   BEGIN & partial_set_domain &
      INTEGER start_suffix_display,
              stop_suffix_display;
      ALPHA suffix_str;
      BOOLEAN markers_coupled,
              stimulus_coupled;

      stimulus_coupled := FALSE;
      markers_coupled  := FALSE;
      IF ( ch_integer(ch_domain,1) = ch_integer(ch_domain,2) ) THEN
         BEGIN & if &
            markers_coupled := TRUE;
            IF coupled_ch(ch_start_frequency) THEN
               stimulus_coupled := TRUE;
         END;  & if &
      set_coupled_status( markers_coupled,  couple_markers );
      set_coupled_status( stimulus_coupled, couple_stimulus );

      rebuild := TRUE;              & for array vs point mode change &
      suffix_str := active_suffix( active_start );
      recall_pfr;
      new_format_partial;

      IF current_entry_ch = 1 THEN
         BEGIN & if &
            start_suffix_display := start1_suffix_display;
            stop_suffix_display  := stop1_suffix_display;
         END   & if &
      ELSE
         BEGIN & else ch 2 &
            start_suffix_display := start2_suffix_display;
            stop_suffix_display  := stop2_suffix_display;
         END;  & else ch 2 &

      print_string( suffix_str,
                    stim_suffix_size,
                    start_suffix_display
                  );
      print_string( suffix_str,
                    stim_suffix_size,
                    stop_suffix_display
                  );
   END;  & partial_set_domain &

PROCEDURE  set_domain( domain );
   VALUE   domain;
   INTEGER domain;
   BEGIN & set_domain &
```

```
SDOMAIN.WORK.PD8510          THU, DEC 22, 1983, 10:34 AM     PAGE   4

      set_entry_ch_integer( domain, ch_domain );
      abort_sweep;

      IF domain = aux_domain THEN                               & DEBUG &
         select_active_function( active_aux_out )               & DEBUG &
      ELSE                                                      & DEBUG &
         select_active_function( active_previous );

      partial_set_domain;

      update_domain_vars;

      update_start_stop_center_span;    & also calls annotate_stimulus &
      partial( update_raw_array );
      restart_sweep;
   END;  & set_domain &
```

```
SDOMAIN.WORK.PD8510          THU, DEC 22, 1983, 10:34 AM     PAGE   5

#EJECT;
COMMENT                                                select_active_gate
*************************************************************************
*
*************************************************************************
;
PROCEDURE  select_active_gate( active_gate );
   VALUE   active_gate;
   INTEGER active_gate;
   BEGIN & select_active_gate &
      INTEGER domain;

      IF active_gate > 0 THEN
         select_active_function( active_gate );

      marker_state := marker_state OR gate_markers_on;

   END;  & select_active_gate &
```

```
SDOMAIN.WORK.PD8510          THU, DEC 22, 1983, 10:34 AM     PAGE   6

#EJECT;
PROCEDURE set_time_window( window);      VALUE window;  INTEGER window;
BEGIN
   hilight_on( cmd_max_time_window, cmd_min_time_window);
   set_entry_ch_integer( window, ch_time_window );
   update_domain_vars;
END set_time_window ;

PROCEDURE set_gate_window( window );  VALUE window;   INTEGER window;
BEGIN
   hilight_on( cmd_max_gate_window, cmd_min_gate_window);
   set_entry_ch_integer( window, ch_gate_window );
   update_domain_vars;
END;

SUBROUTINE set_gate_status;
BEGIN
   hilight_on( cmd_gate_on, cmd_gate_off);
   abort_sweep;
   update_domain_vars;
   rebuild := TRUE;                          & updates  array mode &
   restart_sweep;
END;

#FILE fdommenu.work;

END$
```

```
CDOMMENU.WORK.PD8510          THU, DEC 22, 1983, 10:34 AM      PAGE   1

INTEGER CONSTANT

cmd_freq_domain := 130,
cmd_low_pass_request := 131,
cmd_time_domain := 132,
cmd_aux_domain := 133,
cmd_setup_time_domain := 134,
cmd_setup_gate_domain := 135,
cmd_tdr_domain := 136,
cmd_tdr_step := 137,
cmd_tdr_impulse := 138,
cmd_max_time_window := 139,
cmd_normal_time_window := 140,
cmd_min_time_window := 141,
cmd_gate_on := 142,
cmd_gate_off := 143,
cmd_gate_start := 144,
cmd_gate_stop := 145,
cmd_gate_center := 146,
cmd_gate_span := 147,
cmd_max_gate_window := 149,
cmd_wide_gate_window := 150,
cmd_normal_gate_window := 151,
cmd_min_gate_window := 152,
cmd_group11 := 0;
```

```
FDOMMENU.WORK.PD8510          THU, DEC 22, 1983, 10:34 AM      PAGE   1

COMMENT
  This is a software generated file !!!
  Changes must be made in SKINFO.WORK
  Run GENSK.LANI to re-generate file;

SUBROUTINE proc11;  ENTRY;
BEGIN

CASE command_token-130 OF
BEGIN
& 130 &
BEGIN
   hilight_on( cmd_freq_domain, cmd_aux_domain);
   set_domain( freq_domain );
END;
& 131 &
BEGIN END;
& 132 &
BEGIN
   hilight_on( cmd_freq_domain, cmd_aux_domain);
   set_domain( time_domain );
END;
& 133 &
BEGIN
   warn( command_not_implemented );                         & DEBUG &
   hilight_on( cmd_freq_domain, cmd_aux_domain);
   set_domain( aux_domain );
END;
& 134 &
BEGIN END;
& 135 &
select_active_gate( 0 );                         & turn on gate markers &
& 136 &
BEGIN
   tdr_check;
   hilight_key( cmd_low_pass_request, cmd_freq_domain, cmd_aux_domain);
   set_domain( tdr_domain );
   previous_menu;
END;
& 137 &
BEGIN
   hilight_on( cmd_tdr_step, cmd_tdr_impulse);
   set_entry_ch_integer( step_tdr, ch_tdr_stimulus_type );
   update_domain_vars;
END;
& 138 &
BEGIN
   hilight_on( cmd_tdr_step, cmd_tdr_impulse);
   set_entry_ch_integer( impulse_tdr, ch_tdr_stimulus_type );
   update_domain_vars;
END;
& 139 &
set_time_window( max_window);
& 140 &
set_time_window( normal_window);
```

```
FDOMMENU.WORK.PD8510          THU, DEC 22, 1983, 10:34 AM      PAGE   2

& 141 &
set_time_window( min_window);
& 142 &
BEGIN
   set_entry_ch_integer( gate_on, ch_gating );
   set_gate_status;
END;
& 143 &
BEGIN
   set_entry_ch_integer( gate_off, ch_gating );
   marker_state := marker_state AND gate_markers_off;
   set_gate_status;
END;
& 144 &
select_active_gate( active_gate_start );
& 145 &
select_active_gate( active_gate_stop );
& 146 &
select_active_gate( active_gate_center );
& 147 &
select_active_gate( active_gate_span );
& 148 &
BEGIN END;
& 149 &
set_gate_window( max_gate );
& 150 &
set_gate_window( wide_gate );
& 151 &
set_gate_window( normal_gate );
& 152 &
set_gate_window( min_gate );
END;
END proc11;
```

```
CDTMGR.WORK.PD8510          THU, DEC 22, 1983, 10:34 AM      PAGE   1

INTEGER CONSTANT

cmd_directory := 1,
cmd_directory_off := 9,
cmd_next_page := 10,
cmd_prev_page := 11,
cmd_first_page := 12,
cmd_last_page := 13,
cmd_machine_dump := 18,
cmd_more := 26,
cmd_file_1 := 28,
cmd_file_2 := 29,
cmd_file8 := 35,
cmd_reg_1 := 36,
cmd_reg_2 := 37,
cmd_reg_3 := 38,
cmd_reg_4 := 39,
cmd_reg_5 := 40,
cmd_reg_6 := 41,
cmd_reg_7 := 42,
cmd_reg_8 := 43,
cmd_group1 := 0;
```

```
FDTMGR.WORK.PD8510              THU, DEC 22, 1983, 10:34 AM      PAGE   1

COMMENT
  This is a software generated file !!!
  Changes must be made in SKINFO.WORK
  Run GENSK.LANI to re-generate file;

SUBROUTINE proc1;  ENTRY;
BEGIN

CASE command_token-1 OF
BEGIN
& 1 &
IF valid_directory THEN
  BEGIN
    gen_menu(DIRECTORY_MENU, 1);
    list_directory;
  END;
& 2 &
setup_tape_op(record_op);
& 3 &
setup_tape_op(restore_op);
& 4 &
setup_tape_op(delete_op);
& 5 &
undelete_file;
& 6 &
BEGIN END;
& 7 &
init;
& 8 &
previous_menu;
& 9 &
BEGIN END;
& 10 &
list_directory;
& 11 &
list_directory;
& 12 &
list_directory;
& 13 &
list_directory;
& 14 &
gen_file_menu(s_param_file);
& 15 &
gen_file_menu(data_file);
& 16 &
gen_file_menu(format_file);
& 17 &
gen_file_menu (display_file);
& 18 &
gen_file_menu(machine_file);
& 19 &
gen_reg_menu(state_file);
& 20 &
gen_file_menu(state_set);
& 21 &
```

```
FDTMGR.WORK.PD8510              THU, DEC 22, 1983, 10:34 AM      PAGE   2

gen_reg_menu(memory_file);
& 22 &
gen_file_menu(memory_set);
& 23 &
gen_reg_menu(cal_file);
& 24 &
gen_file_menu(cal_set);
& 25 &
gen_reg_menu(cal_std_file);
& 26 &
& dummy statement &;
& 27 &
BEGIN END;
& 28 &
file_chosen;
& 29 &
file_chosen;
& 30 &
file_chosen;
& 31 &
file_chosen;
& 32 &
file_chosen;
& 33 &
file_chosen;
& 34 &
file_chosen;
& 35 &
file_chosen;
& 36 &
reg_chosen;
& 37 &
reg_chosen;
& 38 &
reg_chosen;
& 39 &
reg_chosen;
& 40 &
reg_chosen;
& 41 &
reg_chosen;
& 42 &
reg_chosen;
& 43 &
reg_chosen;
END;
END proc1;
```

```
SDTMGR.WORK.PD8510              THU, DEC 22, 1983, 10:34 AM      PAGE   1

M68KL,P,"DTMGR"

BEGIN

COMMENT
$DOC+

NAME--
  DTMGR
***********************************************************************
*
* SHORT DESCRIPTION--
*   Processes softkey commands corresponding to TAPE, SAVE, RECALL menus
*   and register menus brought up by CAL.
*
* EXTENDED DESCRIPTION--
*   This module processes tape/bubble data functions corresponding to
*   softkeys found in the following sequence of menus (brought up from
*   left to right):
*
*   Tape Menu   Data Type Menu       Register Menu    File Menu
*   ---------   --------------       -------------    ---------
*
*   [RECORD]    [INSTRUMENT STATES]  [ REG 1 ]        [FILE 1]
*
*   [RESTORE]   [CAL DATA]           [ REG 2 ]        [FILE 2]
*
*   [DELETE]    [MEMORY TRACE]       [ REG 3 ]        [FILE 3]
*                                        .                .
*               other data types do      .                .
*               not bring up register    .                .
*               menu:                [ REG 8 ]        [FILE 8]
*
*               [FORMATTED DATA]
*
*               [RAW DATA]
*
*                  .
*                  .
*                  etc.
*
*  Date type menu provides a selection of a data type to store on or
*  restore from or delete from tape.
*
*  Register menu provides a selection of bubble registers to record data
*  from or restore data to tape.  These registers contain only certain
*  data types (cal data, instrument state, memory trace), thus this menu
*  is generated only upon selection of those data types.
*
*  File menu provides a selection of tape files of the selected data
*  type from which to store, restore, or delete a file.
*
*  NOTES: Other tape function softkeys (INIT, DIRECTORY, UN-DELETE) do
*         not bring up the subsequent menus.
*
*         [DELETE] softkey function does not cause the register menu
```

```
SDTMGR.WORK.PD8510              THU, DEC 22, 1983, 10:34 AM      PAGE   2

*         to be brought up.
*
*         Register menu contains 1-4 for [MEMORY TRACE] data type only
*
*
*  This module also handles data being saved and recalled to and from
*  bubble memory.  A standard softkey menu containing numbered registers
*  headed by a data type is used to provide a choice from which data can
*  be saved to and recalled from:
*
*  <data type>    <--- CAL DATA, MEMORY TRACE, or INSTRUMENT STATES
*  [ REG 1 ]
*
*  [ REG 2 ]
*
*  [ REG 3 ]
*      .
*      .
*      .
*
*  [ REG 2 ]
*
*  An asterisk occuring immediately to the left of a "reg" softkey label
*  indicates that a register currently contains useful data, otherwise
*  that register essentially has no valid data.
*
*  CAL DATA registers are the only ones which can be deleted (and the
*  same register menu is used to provide a selection of cal registers
*  to be deleted).
*
***********************************************************************
$DOC-;
```

```
SDTMGR.WORK.PD8510          THU, DEC 22, 1983, 10:34 AM     PAGE  3

#EJECT;
#FILE fcommand.work;  & command_token &
#FILE cscreen.work;   & user display address &
#FILE fskpos.work;    & softkey display positioning info. and routines &
#FILE cmenu.work;     & softkey menu number constants to index tables  &
#FILE fmenu.work;
#FILE cdtmgr.work;    & command token values for DMTGR &

#FILE futil2.work;    & for CLEAR_MESSAGE &
#FILE futil3.work;    & for TELL, WARN &
#FILE futil4.work;    & for MACRO-TELL,WARN &
#FILE cmsgnbm.work;   & message numbers &
#FILE cmsgtape.work;

#FILE ftpmgr.work;    & tape routines &
#FILE ftpmgr2.work;
#FILE fmbmgr.work;    & bubble routines &
#FILE fcal0.work;     & save_cal routine and default_cal_set &
#FILE fdisplay.work;  & register/file menu modifications &

#FILE cchtable.work;  & this group of externals are for machine dumps &
#FILE fcontvar.work;
#FILE fsize.work;     & for array_size &
#FILE fchtable.work;
#FILE fchdata.work;
#FILE fchdata2.work;

#FILE frecall.work;   & for recalling instrument states &
#FILE fcontrol.work;
#FILE ftopmisc.work;  & for beep (done_tone) &

GLOBAL INTEGER tape_mbn_fn;

INTEGER CONSTANT
  record_op  := 1,
  restore_op := 2,
  delete_op  := 3,
  undelete_op := 4;
  & other <xxx>_op's (0,5,6,7) are in cmbmgr.work &

BOOLEAN data_in_bubble,
        prior_reg_menu,
        fix_reg_menu;
GLOBAL  & for debug purposes &
INTEGER file_num, reg_num,
        data_type;
GLOBAL  & for debug purposes &
DOUBLE  data_addr,
        data_byte_cnt;
GLOBAL  ALPHA data_type_str;

& table of messages corresponding to current tape/bubble operation &
INTEGER TABLE tape_prompt :=
  0,
  record_macro,
  restore_macro,
```

```
SDTMGR.WORK.PD8510          THU, DEC 22, 1983, 10:34 AM     PAGE  4

  delete_macro;

INTEGER TABLE prompt1 :=
  0,
  select_record,
  select_restore,
  0,
  0,
  save_prompt,
  recall_prompt,
  delete_prompt;

INTEGER TABLE prompt2 :=
  0,
  select_file_record,
  select_file_restore,
  select_file_delete,
  0,
  saving_data,
  recalling_data,
  deleting_data;
```

```
SDTMGR.WORK.PD8510          THU, DEC 22, 1983, 10:34 AM     PAGE  5

#EJECT;
COMMENT
$DOC+

NAME--
  file_size
*************************************************************************
*
* SHORT DESCRIPTION--
*   computes number of bytes to the nearest factor of 256
*
* EXTENDED DESCRIPTION--
*   This routine rounds up to a 256 byte boundary given a number of
*   bytes.  This is used to determine the number of tape records
*   (256 bytes/record) will be required to save/recall data to/from
*   tape.
*
* INPUTS--
*   bytes = a number of bytes
*
* OUTPUTS--
*   number of bytes rounded up to nearest 256 byte boundary (double)
*
* ROUTINES CALLED--
*   none
*
* ERROR CONDITIONS AND RECOVERY--
*   none
*
* NOTES--
*
* AUTHOR--
*
*************************************************************************
*
* INITIAL REFINEMENT--
*   add to the given number of bytes the difference between 256 and
*      the remainder of the number bytes into 256
*
*************************************************************************
*
* REVISION LOG--
*
*************************************************************************
DECLARATION--
;
DOUBLE PROCEDURE file_size (bytes);  VALUE bytes; DOUBLE bytes;
  file_size := bytes + (256 - (bytes AND %OFF));
```

```
SDTMGR.WORK.PD8510          THU, DEC 22, 1983, 10:34 AM     PAGE  6

#EJECT;
COMMENT
$DOC+

NAME--
  raw_data_info
*************************************************************************
*
* SHORT DESCRIPTION--
*   supplies address and byte length information for raw data arrays
*
* EXTENDED DESCRIPTION--
*   This routine provides tape file information for source and
*   and destination addresses along with their corresponding byte
*   lengths for recording or restoring a tape file of raw data or
*   a machine dump (which includes raw data).
*
*   Multiple tape file information (file containing more than one
*   contiguous block of data) is stored in a table of current appending
*   data addresses (file_address) and corresponding byte lengths
*   (file_byte_cnt).
*
* INPUTS--
*   n = first available index in appending tape file information
*
* OUTPUTS--
*   n = (variable parameter) next available index in appending tape
*       file information.
*
* ROUTINES CALLED--
*   file_size
*
* ERROR CONDITIONS AND RECOVERY--
*   Range checking is done on file append indices which prevents any
*   additional address and byte length information from being processed
*   upon exceeding these bounds.
*
* NOTES--
*
* AUTHOR--
*
*************************************************************************
*
* INITIAL REFINEMENT--
*
*************************************************************************
*
* REVISION LOG--
*
*************************************************************************
DECLARATION--
;
PROCEDURE raw_data_info (n); VALUE n; INTEGER n;
BEGIN
  INTEGER raws, i=REGISTER 6;
  raws := file_size (block_size);
```

SDTMGR.WORK.PD8510 THU, DEC 22, 1983, 10:34 AM PAGE 7

```
  FOR i := first_acquisition_param TO last_acquisition_param DO
  IF n < max_file_appends THEN
    BEGIN                               & append all of raw data arrays &
      file_byte_cnt [n] := block_size;
      file_address [n]  := raw_base[i] - header_size;
      data_byte_cnt := data_byte_cnt + raws;
      n := n + 1;
    END;
END raw_data_info;
```

SDTMGR.WORK.PD8510 THU, DEC 22, 1983, 10:34 AM PAGE 8

```
#EJECT;
COMMENT
$DOC+

NAME--
  machine_dump_info
**************************************************************************
*
* SHORT DESCRIPTION--
*   supplies information about the machine dump state
*
* EXTENDED DESCRIPTION--
*    +data bubble (module 1)
*    +current instrument state
*     formatted data
*     data (uncorrected, unformatted)
*     raw data
*     user graphics display
*
*    + = must be in this order on recording as well as restoring
*
* INPUTS--
*
* OUTPUTS--
*
* ROUTINES CALLED--
*
* ERROR CONDITIONS AND RECOVERY--
*
* NOTES--
*
* AUTHOR--
*
**************************************************************************
*
* INITIAL REFINEMENT--
*
**************************************************************************
*
* REVISION LOG--
*
**************************************************************************
DECLARATION--
;
SUBROUTINE machine_dump_info;                                     ENTRY;
                                              & delete entry point !!! &
BEGIN
  file_address &0& := data_addr := ADRS(min_save);
  file_byte_cnt&0& := dump_size;
  file_address [1] := entry_ch_double (ch_f_base) - header_size;
  file_byte_cnt[1] := file_byte_cnt[2] := data_byte_cnt;
  file_address [2] := entry_ch_double (ch_d_base) -header_size;
  file_address [3] := %100000+(2*user_display);
  file_byte_cnt[3] := 2*(character_set-user_display);
  data_byte_cnt := 2 * (file_size (data_byte_cnt)) +
                   file_size (dump_size) + file_size (file_byte_cnt[3]);
```

SDTMGR.WORK.PD8510 THU, DEC 22, 1983, 10:34 AM PAGE 9

```
  raw_data_info(4);                        & append raw data info &
  data_byte_cnt := data_byte_cnt+131072;   & bubble 1 contents    &
END machine_dump_info;
```

SDTMGR.WORK.PD8510 THU, DEC 22, 1983, 10:34 AM PAGE 10

```
#EJECT;
PROCEDURE set_data_type (type);
  VALUE type; INTEGER type;
BEGIN
  data_type_str := file_type[data_type:=type];
  change_softkey (data_type_str, cmd_file_1, 1);
END set_data_type;
```

```
SDTMGR.WORK.PD8510            THU, DEC 22, 1983, 10:34 AM      PAGE  11

$EJECT;
COMMENT
$DOC+

NAME--
  new_data
**********************************************************************
*
* SHORT DESCRIPTION--
*   sets up file information for new data type
*
* EXTENDED DESCRIPTION--
*   This routine sets up information needed for saving and recalling
*   the different data types to and from tape, bubble, and RAM.
*   Such information includes destination or source addresses of data
*   being saved or recalled, number of bytes of data being saved or
*   recalled, and any "appending" data information (their addresses and
*   lengths) located non-contiguously with selected data type.
*
*   "Appended" data information applies only to data being saved and
*   recalled to or from tape.  It is stored in or read from the first
*   record (256 bytes) of each tape file.  A copy of this information
*   is resident in RAM (whenever a tape file is recorded or restored)
*   in the following data structures:
*     - file_address  = table of "appending" data addresses
*     - file_byte_cnt = table of "appending" data byte lengths
*                       corresponding to "appending" data addresses
*
*   Softkey labels heading bubble register and tape file menus
*   corresponding to the selected data type are also updated.
*
* INPUTS--
*   type = data type selected for saving, recalling, deleting, etc.
*
* OUTPUTS--
*   none
*
* ROUTINES CALLED--
*   set_data_type
*   machine_dump_info
*   raw_data_info
*   entry_ch_double
*
* ERROR CONDITIONS AND RECOVERY--
*
* NOTES--
*
* AUTHOR--
*
**********************************************************************
*
* INITIAL REFINEMENT--
*
**********************************************************************
*
* REVISION LOG--
```

```
SDTMGR.WORK.PD8510            THU, DEC 22, 1983, 10:34 AM      PAGE  12

*
**********************************************************************
DECLARATION--
;
PROCEDURE new_data(type); VALUE type; INTEGER type;              ENTRY;
&
$DOC-&

BEGIN
  INTEGER i=REGISTER 6;
  set_data_type (type);
  IF tape_mbn_fn > 0 THEN
  IF tape_mbn_fn <> delete_op THEN
    BEGIN
      FOR i := 0 TO max_file_appends DO
        file_address[i] := file_byte_cnt[i] := 0;
      data_addr := 0;
      data_byte_cnt := file_byte_cnt&0& :=
        (IF type=state_file THEN save_size ELSE block_size);
      IF type = state_file THEN
        data_addr := ADRS(min_save)
      ELSE
      IF type = format_file THEN
        data_addr := entry_ch_double (ch_f_base)-header_size
      ELSE
      IF type = data_file THEN
        data_addr := entry_ch_double (ch_d_base)-header_size
      ELSE
      IF type = display_file THEN
        BEGIN
          data_addr := %100000+(2*user_display);
          data_byte_cnt := 2*(character_set-user_display);
        END
      ELSE
      IF type = s_param_file THEN
        BEGIN
          & should instrument state be saved too ? &
          raw_data_info(0);
          data_addr := raw_base[first_acquisition_param]-header_size;
        END
      ELSE
      IF type = machine_file THEN
        machine_dump_info;
      file_address&0& := data_addr;
    END;
END new_data;
```

```
SDTMGR.WORK.PD8510            THU, DEC 22, 1983, 10:34 AM      PAGE  13

$EJECT;
COMMENT
$DOC+

NAME--
  prompt_for_data
**********************************************************************
*
* SHORT DESCRIPTION--
*   display message prompting for data selection
*
* EXTENDED DESCRIPTION--
*   This routine displays a message which prompts the user to select
*   a data type to be recorded on, restored from, or deleted from tape.
*   The tape operation selected (tape_mbn_fn) indexes into a table of
*   message prompts (tape_prompt) which displays the corresponding
*   acknowledging the operation selected.
*
* INPUTS--
*   none
*
* OUTPUTS--
*   message prompt on display
*
* ROUTINES CALLED--
*   macro_tell
*
* ERROR CONDITIONS AND RECOVERY--
*   No range checking is done on the value of tape_mbn_fn (tape funtion
*   selected) which indexes into a fixed size table, tape_prompt.
*
* NOTES--
*
* AUTHOR--
*
**********************************************************************
*
* INITIAL REFINEMENT--
*   call routine to display message to select data
*
**********************************************************************
*
* REVISION LOG--
*
**********************************************************************
$DOC-;
SUBROUTINE prompt_for_data;
  macro_tell (select_tape_data, tape_prompt[tape_mbn_fn]);
```

```
SDTMGR.WORK.PD8510            THU, DEC 22, 1983, 10:34 AM      PAGE  14

$EJECT;
COMMENT
$DOC+

NAME--
  setup_tape_op
**********************************************************************
*
* SHORT DESCRIPTION--
*   sets current tape function
*
* EXTENDED DESCRIPTION--
*   This routine sets a global variable containing the current tape
*   operation to the selected tape operation.  It is invoked by pressing
*   one the [DELETE], [RECORD], or [RESTORE] softkeys from the tape
*   menu.  A softkey menu of data types is then generated to provide a
*   selection of data types the user wishes to delete, record, or
*   restore.  A message or prompt is also displayed to indicate the
*   tape function selected.
*
*   An error message is displayed if no tape or an uninitialized tape is
*   in the tape drive (and no new menu is brought up).
*
* INPUTS--
*   op = tape operation selected from tape menu
*
* OUTPUTS--
*   none
*
* ROUTINES CALLED--
*   valid_directory
*   gen_menu
*
* ERROR CONDITIONS AND RECOVERY--
*
* NOTES--
*
* AUTHOR--
*
**********************************************************************
*
* INITIAL REFINEMENT--
*   IF a valid tape is in the tape drive THEN
*     set tape operation variable
*     display tape operation prompt
*     generate menu of data types
*
**********************************************************************
*
* REVISION LOG--
*
**********************************************************************
DECLARATION--
;
PROCEDURE setup_tape_op (op);
VALUE op;  INTEGER op;
```

```
SDTMGR.WORK.PD8510              THU, DEC 22, 1983, 10:34 AM      PAGE  15

&
$DOC-&

BEGIN
  IF valid_directory THEN
  BEGIN
    tape_mbm_fn := op;
    prompt_for_data;
    gen_menu (DATA1_MENU,1);
  END;
END setup_tape_op;
```

```
SDTMGR.WORK.PD8510              THU, DEC 22, 1983, 10:34 AM      PAGE  16

#EJECT;
COMMENT
$DOC+

NAME--
  gen_file_menu
*************************************************************************
*
* SHORT DESCRIPTION--
*   generates a tape file menu
*
* EXTENDED DESCRIPTION--
*   This routine generates the tape file menu corresponding to the
*   data type selected from a previous menu.  The softkey label heading
*   the file menu is updated to correspond to the selected data type
*   and an asterisk (*) is placed to the right of any file label with
*   a tape file containing that data type found in the tape directory.
*
*   A check is also made for data types which represent all registers
*   of a single data type (ie: CAL DATA 1-8, MEMORY 1-4).  For these
*   cases, a global variable containing the current register number
*   selected from a register menu is set to 1.  This will ensure that
*   all registers of these data types are recorded and restored starting
*   from register 1 to the maximum allowed register.
*
*   An error message is displayed if no tape or an uninitialized tape is
*   in the tape drive (and the file menu is not brought up).
*
* INPUTS--
*   type = data type selected from previous menu
*
* OUTPUTS--
*   none
*
* ROUTINES CALLED--
*   valid_directory
*   scan_directory
*   new_data
*   gen_menu
*   printch
*
* ERROR CONDITIONS AND RECOVERY--
*   No range checking done on the value of the data type selected.
*   It is assumed that the calling routine passes a value corresponding
*   to the softkey that is pressed.
*
* NOTES--
*   This routine is also invoked upon selecting a register to record
*   from or restore to for individual register data types (such as
*   instrument states, cal data, memory traces).
*
* AUTHOR--
*
*************************************************************************
*
* INITIAL REFINEMENT--
```

```
SDTMGR.WORK.PD8510              THU, DEC 22, 1983, 10:34 AM      PAGE  17

*   IF a valid tape is NOT in the tape drive THEN
*     generate outer level tape menu
*   ELSE
*     set up new data type information for tape files and file menu
*     generate file menu
*     scan directory for tape file containing selected data type and
*       place asterisk to left of corresponding file label
*
*************************************************************************
*
* REVISION LOG--
*
*************************************************************************
DECLARATION--
;
PROCEDURE gen_file_menu (type);
VALUE type;  INTEGER type;
&
$DOC-&

BEGIN
  IF NOT valid_directory THEN
    gen_menu(TAPE_MENU,0)
  ELSE
  BEGIN
    INTEGER i,length;
    ALPHA annot;
    BYTE POINTER string=annot;
    new_data (type);
    compute_tell (data_type_str, prompt2[tape_mbm_fn]);
    IF (data_in_bubble := (data_type <= cal_set)) THEN
      IF data_type >= state_set THEN
        reg_num := 1;
    gen_menu (FILE_MENU,1);
    FOR i := 0 TO 7 DO
      IF scan_directory (0,LEFT(data_type,4) OR (i+1)) < 0 THEN
        & indicate empty file: *FILE n --> FILE n &
        printch (field[i+8],' ');
  END;
END gen_file_menu;
```

```
SDTMGR.WORK.PD8510              THU, DEC 22, 1983, 10:34 AM      PAGE  18

#EJECT;
COMMENT
$DOC+

NAME--
  file_chosen
*************************************************************************
*
* SHORT DESCRIPTION--
*   performs tape operation on selected tape file
*
* EXTENDED DESCRIPTION--
*   This routine does the required tape operation on the tape file
*   number which has just been selected.  Appropriate tape operation
*   routines are called corresponding to the current tape operation:
*     - record
*     - restore
*     - delete
*   Upon return from the performed tape operations, the tape menu is
*   regenerated (outer level menu).
*
*   An error message is displayed if no tape or an uninitialized tape is
*   in the tape drive.
*
* INPUTS--
*   num = tape file number selected
*
* OUTPUTS--
*   none
*
* ROUTINES CALLED--
*   valid_directory
*   record_data
*   record_file
*   restore_data
*   restore_file
*   delete_file
*   tell
*
* ERROR CONDITIONS AND RECOVERY--
*   No range checking is done on the value of the file number selected.
*   It is assumed that the calling routine passes a value corresponding
*   to the softkey that is pressed.
*
* NOTES--
*
* AUTHOR--
*
*************************************************************************
*
* INITIAL REFINEMENT--
*   IF a valid tape is not loaded THEN
*     re-display tape menu and error message
*   ELSE
*     IF tape operation = record THEN
*       IF current data type resides in bubble THEN
```

SDTMGR.WORK.PD8510 THU, DEC 22, 1983, 10:34 AM PAGE 19

```
*        copy bubble data into tape file
*       ELSE
*         copy data from RAM into tape file
*     IF tape operation = restore THEN
*       IF current data type resides in bubble THEN
*         copy tape file into bubble
*       ELSE
*         copy tape file into RAM
*     IF tape operation = delete THEN
*       delete tape file from tape
*   re-display tape menu
************************************************************************
*
* REVISION LOG--
*
************************************************************************
DECLARATION--
;
SUBROUTINE file_chosen;
&
$DOC-&

BEGIN
  file_num := command_token+1-cmd_file_1;
  IF NOT valid_directory THEN
    gen_menu(TAPE_MENU,0)
  ELSE
  CASE tape_mbm_fn OF
  BEGIN
    & nothing &   BEGIN END;
    & record &    BEGIN
                    tell (recording_file);
                    IF data_in_bubble THEN
                      record_data (data_type,file_num,reg_num)
                    ELSE
                      record_file (data_addr, data_byte_cnt,
                                   LEFT(data_type,4) OR file_num, -1);
                  END;
    & restore  &  BEGIN
                    tell (restoring_file);
                    IF data_in_bubble THEN
                      restore_data (data_type, file_num, reg_num)
                    ELSE
                      restore_file (data_addr,
                                    LEFT(data_type,4) OR file_num, -1);
                  END;
    & delete   &  delete_file (data_type, file_num);
  END;
  data_in_bubble := FALSE;
  pop_menu (TAPE_MENU);
END file_chosen;
```

SDTMGR.WORK.PD8510 THU, DEC 22, 1983, 10:34 AM PAGE 20

```
REJECT;
COMMENT
$DOC+

NAME--
  reg_data
************************************************************************
*
* SHORT DESCRIPTION--
*   processes register chosen to record from or restore to
*
* EXTENDED DESCRIPTION--
*   This processes the register number which has been selected to record
*   data from or restore data to a tape file.  The register number is
*   saved in a global variable which is used to inform the recording or
*   restoring routine of the chosen register once a tape file has been
*   selected.  The tape file is selected from a menu which is brought up
*   from this routine.
*
*   If a data register contains no valid data, the tape menu is re-
*   generated and an error message is displayed indicating this.
*
* INPUTS--
*   num = register number selected
*
* OUTPUTS--
*   none
*
* ROUTINES CALLED--
*   warn
*   gen_file_menu
*
* ERROR CONDITIONS AND RECOVERY--
*   No range checking is done on value of register number selected.
*   It is assumed that the calling routine passes a value corresponding
*   to the softkey that is pressed.
*
* NOTES--
*
* AUTHOR--
*
************************************************************************
*
* INITIAL REFINEMENT--
*   IF the current data type selected = memory trace or cal data THEN
*     get corresponding offset into bubble directory
*     IF directory entry contains no data THEN
*       display error message indicating this
*   IF data type = instrument state OR directory entry contains data
*     THEN
*       assign global variable containing register to record from or
*         recall to with register selected
*       generate tape file menu headed by selected data type
*
************************************************************************
*
```

SDTMGR.WORK.PD8510 THU, DEC 22, 1983, 10:34 AM PAGE 21

```
* REVISION LOG--
*   12-21-83  -- check if tape function selected is LOAD or STORE
*
************************************************************************
DECLARATION--
;
PROCEDURE reg_data;
&
$DOC-&

BEGIN
  INTEGER n=REGISTER 6;
  & find index offset to memory/cal data that contains data lgth &
  IF (data_type = memory_file) THEN
    n := mem_dir_offset+reg_num
  ELSE
  IF (data_type = cal_file) THEN
    n := cal_dir_offset+reg_num
  ELSE                        & other bubble data has no directory entry  &
    n := 31;                  & contains Z8510 via mbnload initialization &
  IF (tape_mbm_fn = record_op) OR (tape_mbm_fn = restore_op) THEN
  IF (mbm_dir[n] = 0) AND (tape_mbm_fn = record_op) THEN
    compute_warn (data_type_str, no_reg_data)
  ELSE
    gen_file_menu (data_type);
END reg_data;
```

SDTMGR.WORK.PD8510 THU, DEC 22, 1983, 10:34 AM PAGE 22

```
REJECT;
COMMENT
$DOC+

NAME--
  reg_chosen
************************************************************************
*
* SHORT DESCRIPTION--
*   performs bubble operation on selected data register
*
* EXTENDED DESCRIPTION--
*   This routine does the required bubble operation on the register
*   number which has just been selected.  Appropriate bubble operation
*   routines are called corresponding to the current bubble operation:
*     - save
*     - recall
*     - delete  (cal data only)
*
*   An error message is displayed when trying to recall or delete data
*   from an empty register.
*
* INPUTS--
*   num = register number selected
*
* OUTPUTS--
*   none
*
* ROUTINES CALLED--
*   tell
*   save_data
*   recall_data
*   save_cal
*   clear_cal
*   gen_menu
*   abort_sweep
*   restart_sweep
*
* ERROR CONDITIONS AND RECOVERY--
*   No range checking is done on the value of the register selected.
*   It is assumed that the calling routine passes a value corresponding
*   to the softkey that is pressed.
*
* NOTES--
*   This routine applies only to instrument states and cal data which
*   have corresponding data register menus to select from.
*
* AUTHOR--
*
************************************************************************
*
* INITIAL REFINEMENT--
*   display message indicating current bubble function being done
*   update current register number to value of register selected
*   abort the sweep
*   IF current data type selected = instrument state THEN
```

```
*     save or recall instrument state depending on bubble function
*   ELSE
*     save, recall, or delete cal data depending on bubble function
*
*************************************************************************
*
* REVISION LOG--
*
*************************************************************************
DECLARATION--
;
SUBROUTINE reg_chosen;
&
$DOC-&

BEGIN
  reg_num := (IF reg_num < 0 THEN    &HP-IB call&
               -reg_num
             ELSE
               command_token + 1 - cmd_reg_1);
  IF (tape_mbm_fn = record_op) OR (tape_mbm_fn = restore_op) THEN
    reg_data
  ELSE
    BEGIN
      compute_tell (data_type_str, prompt2[tape_mbm_fn]);
      abort_sweep;
      IF data_type = state_file THEN
        IF tape_mbm_fn = save_op THEN
          save_data(data_addr, data_byte_cnt, data_type, reg_num)
        ELSE          & recall_op &
        BEGIN
          recall_type := normal_recall;
          IF (reg_num = 8) THEN
            recall_data (ADRS(last_state), data_type, prior_state)
          ELSE
            recall_data (data_addr,data_type,reg_num);
        END
      ELSE
      IF data_type = cal_file THEN
        BEGIN
          IF tape_mbm_fn = clear_op THEN
            BEGIN
              IF clear_cal (reg_num) THEN
                beep (done_tone);
              clear_param_cal (reg_num);
            END
          ELSE
            BEGIN
              default_cal_set := reg_num;
              hilight_on (cmd_reg_1, cmd_reg_8);
              IF tape_mbm_fn = save_op THEN
                save_cal;
            END;
          pop_menu (CAL_MENU);
        END;
      restart_sweep;
```

```
    END;
END reg_chosen;
```

```
#EJECT;
COMMENT
$DOC+

NAME--
  reg_prompt
*************************************************************************
*
* SHORT DESCRIPTION--
*   prompt user to select a save/recall register
*
* EXTENDED DESCRIPTION--
*   This routine displays a message prompting the user to select a
*   data register from which to record or restore data on tape, or
*   from which to delete data from (specifically cal coefficients).
*   The prompt is constructed based on the current tape or bubble
*   operation selected (tape_mbm_fn) and the data type selected
*   (data_type).  These variables index tables containing the message
*   numbers and strings to create the prompt.
*
* INPUTS--
*   none
*
* OUTPUTS--
*   message prompt on display
*
* ROUTINES CALLED--
*   compute_tell
*
* ERROR CONDITIONS AND RECOVERY--
*   No range checking is done on the value of tape_mbm_fn (tape funtion
*   selected) into fixed size table, tape_prompt.
*
* NOTES--
*
* AUTHOR--
*
*************************************************************************
*
* INITIAL REFINEMENT--
*   display prompt to select data register
*
*************************************************************************
*
* REVISION LOG--
*
*************************************************************************
$DOC-;
SUBROUTINE reg_prompt;
  compute_tell (data_type_str, prompt1[tape_mbm_fn]);
```

```
#EJECT;
COMMENT
$DOC+

NAME--
  menu_incr
*************************************************************************
*
* SHORT DESCRIPTION--
*   determines whether to increase or decrease a menu level
*
* EXTENDED DESCRIPTION--
*   This routine returns an increment value (1 or -1) which indicates
*   whether to increase or decrease a menu level.  It is invoked by
*   routines which generate the commonly used save/recall register menu
*   depending on whether it is generated as a result of the [PRIOR MENU]
*   key or other keys/softkeys.
*
*   A global variable, prior_menu, determines whether or not the [PRIOR
*   MENU] was pressed, and consequently returns an increment of -1.
*
* INPUTS--
*   none
*
* OUTPUTS--
*    1 = increase to next menu level for generating data register menu
*   -1 = decrease to prior menu level for generating data register menu
*
* ROUTINES CALLED--
*   none
*
* ERROR CONDITIONS AND RECOVERY--
*   none
*
* NOTES--
*
* AUTHOR--
*
*************************************************************************
*
* INITIAL REFINEMENT--
*   IF [PRIOR MENU] key was NOT pressed THEN
*     return +1
*   ELSE
*     return -1
*     reset prior menu flag
*
*************************************************************************
*
* REVISION LOG--
*
*************************************************************************
$DOC-;
INTEGER SUBROUTINE menu_incr;
BEGIN
  IF NOT prior_reg_menu THEN
```

```
    menu_incr := 1
  ELSE
    BEGIN
      menu_incr := -1;
      prior_reg_menu := FALSE;
    END;
END menu_incr;
```

```
$EJECT;
COMMENT
$DOC+

NAME--
  gen_cal_info
*************************************************************************
*
* SHORT DESCRIPTION--
*   displays softkey menu of cal data save/recall registers
*
* EXTENDED DESCRIPTION--
*   This routine sets up the current cal data storage operation and
*   displays the register menu from which to select a register to save,
*   recall, or delete data.  An asterisk is placed to the left of any
*   register containing data after the menu is displayed.
*
* INPUTS--
*   op = value indicating a save, recall, or delete cal data.
*
* OUTPUTS--
*   none
*
* ROUTINES CALLED--
*   set_data_type
*   gen_menu
*   printch
*
* ERROR CONDITIONS AND RECOVERY--
*   No range checking is done on the value of the cal data operation.
*   It is assumed that the calling routine passes a value corresponding
*   to the softkey that is pressed.
*
* NOTES--
*
* AUTHOR--
*
*************************************************************************
*
* INITIAL REFINEMENT--
*   update current data type selected as cal data
*   update data type annotation for register menu
*   update current bubble function selected based on parameter, OP
*   display message prompting user to save or recall data
*   display softkey menu of registers
*   scan bubble directory for cal data and place an asterisk to the left
*     of any register containing data
*
*************************************************************************
*
* REVISION LOG--
*   10/7/83  -- eliminated save/recall function of menu,
*               used to give a choice of which register to save to or
*               recall from by default (via DONE (cal) and CORRECTION
*               ON keys, respectively).
*   10/10/83 -- hilight default cal save/recall registers
```

```
*
*************************************************************************
DECLARATION--
;
PROCEDURE gen_cal_info (op);                                    ENTRY;
  VALUE op;  INTEGER op;
&
$DOC-&

BEGIN
  INTEGER i;
  set_data_type (cal_file);
  IF (tape_mbn_fn := op) = clear_op THEN
    reg_prompt;
  hilight_command (cmd_reg_1-1+default_cal_set);  & default register &
  IF NOT fix_reg_menu THEN
    BEGIN
      change_softkey (" ", cmd_reg_5, 1);          & delete "power up" &
      change_softkey ("* 8 ", cmd_reg_8, 2);       & delete "last state"&
      fix_reg_menu := TRUE;
    END;
  gen_menu (REG_MENU, menu_incr);
  FOR i := 0 TO 7 DO
    IF mbm_dir[i+1] = 0 THEN
      & indicate empty reg: * n --> n &
      printch (field[i+8],' ');
END gen_cal_info;
```

```
$EJECT;
COMMENT
$DOC+

NAME--
  gen_save_menu
*************************************************************************
*
* SHORT DESCRIPTION--
*   displays save/recall menu for instrument states
*
* EXTENDED DESCRIPTION--
*   This routine generates the softkey menu for saving or recalling
*   data.  This menu is a modification of the "register menu" after it
*   has been displayed.  For saving instrument states, only 7 registers
*   are displayed to choose from.  For recalling instrument states,
*   the 8th register softkey is annotated as [LAST STATE] for the
*   purpose of recalling the "last" known state that the instrument was
*   in.
*
* INPUTS--
*   fn = value indicating a save or recall data operation
*
* OUTPUTS--
*   none
*
* ROUTINES CALLED--
*   new_data
*   gen_menu
*   blank_softkey
*   change_softkey
*
* ERROR CONDITIONS AND RECOVERY--
*   No range checking is done on save/recall operation value (fn).
*   It is assumed that the calling routine passes a value corresponding
*   to the (save/recall) key that is pressed.
*
* NOTES--
*
* AUTHOR--
*
*************************************************************************
*
* INITIAL REFINEMENT--
*   update current data type selected as instrument state data
*   update current bubble function selected based on parameter, FN
*   display message prompting user to save or recall data
*   display softkey menu of registers
*   IF bubble function is saving data THEN
*     delete last softkey (reg 8)
*   ELSE
*     modify last softkey's annotation to read "LAST STATE"
*
*************************************************************************
*
* REVISION LOG--
```

```
*   10/10/83  -- turn off hilights that may have been on due to the
*              CAL use of the menu
*
************************************************************************
DECLARATION--                        %
;
PROCEDURE gen_save_menu(fn);
VALUE fn;  INTEGER fn;                                        ENTRY;
&
$DOC-&

BEGIN
  INTEGER i;
  new_data (state_file);
  hilight_off (cmd_reg_1, cmd_reg_8);
  tape_mbm_fn := fn;
  reg_prompt;
  IF fix_reg_menu THEN
    BEGIN
      change_softkey ("(POWER UP)", cmd_reg_5, 1);
      change_softkey ("LAST STATE", cmd_reg_8, 2);
      fix_reg_menu := FALSE;
    END;
  i := (IF fn > delete_op THEN 0 ELSE menu_incr);
  prior_reg_menu := FALSE;
  gen_menu (REG_MENU, i);
  blank_softkey (5);
  blank_softkey (6);
  IF fn <> recall_op THEN          & delete LAST STATE for non-RECALL &
    blank_softkey (7);
END gen_save_menu;
```

```
#EJECT;
COMMENT
$DOC+

NAME--
  gen_mbm_menu
************************************************************************
*
* SHORT DESCRIPTION--
*   generates cal kit or memory register menu
*
* EXTENDED DESCRIPTION--
*   This routine generates and modifies the general purpose data reg
*   menu (REG_MENU) for cal kit or memory depending on the currently
*   selected data type to be recorded or restored via tape.
*
*   For cal kits, only 2 registers are displayed.  For memory traces,
*   the first 4 registers are displayed.  Each softkey in these menus
*   will contain an "*" to the left of the label to indicate whether
*   the corresponding register contains data.
*
*   These menus are displayed as part of the recording or restoring
*   sequence of individual data registers from bubble.
*
* INPUTS--
*   none
*
* OUTPUTS--
*   none
*
* ROUTINES CALLED--
*   hilight_off
*   gen_menu
*   blank_softkey
*   printch
*
* ERROR CONDITIONS AND RECOVERY--
*
* NOTES--
*   Cal kit data menu generates only the first 2 data registers.
*   Memory trace data menu generates only the first 4 data registers.
*   Any cosmetic changes to the position and number of registers must
*   be made at this level.
*
* AUTHOR--
*
************************************************************************
*
* INITIAL REFINEMENT--
*   display prompt to select data register
*   turn off any hilights (possibly generated by use of menu by cal)
*   generate data register menu
*   IF currently selected data = memory trace THEN
*     blank out last 4 softkeys
*     check memory trace directory and display "*" by data registers
*       that contain memory
```

```
*   ELSE
*   IF currently selected data = cal kit THEN
*     blank out all but first 2 softkeys
*
************************************************************************
*
* REVISION LOG--
*
************************************************************************
$DOC-;
PROCEDURE gen_mbm_menu;
BEGIN
  INTEGER i;
  reg_prompt;
  hilight_off (cmd_reg_1, cmd_reg_8);
  gen_menu (REG_MENU, menu_incr);
  IF data_type = memory_file THEN         & display only 4 registers for mem &
    FOR i := 1 TO 4 DO
      BEGIN
        IF mbm_dir[mem_dir_offset+i] = 0 THEN
          & indicate empty reg: * n --> n &
          printch (field[i+7],' ');
        blank_softkey (i+3);
      END
  ELSE
  IF data_type = cal_std_file THEN  & display only 2 registers for std &
    FOR i := 2 TO 7 DO
      blank_softkey (i);
END gen_mbm_menu;
```

```
#EJECT;
COMMENT
$DOC+

NAME--
  select_mbm_menu
************************************************************************
*
* SHORT DESCRIPTION--
*   determine which data register menu to generate
*
* EXTENDED DESCRIPTION--
*   This routine determines which routine to call that modifies the data
*   register menu based on the data type selected.
*
* INPUTS--
*   none
*
* OUTPUTS--
*   none
*
* ROUTINES CALLED--
*   gen_save_menu
*   gen_cal_info
*   gen_mbm_menu
*
* ERROR CONDITIONS AND RECOVERY--
*   The last ELSE statement assumes that the data type is that of
*   MEMORY TRACE or CAL KIT.  Other data types (non- instrument state,
*   cal) are not range checked and will generate a full data register
*   menu even if that data type is not stored in bubble.
*
* NOTES--
*
* AUTHOR--
*
************************************************************************
*
* INITIAL REFINEMENT--
*   IF data type = instrument state THEN
*     call routine which generates instrument state register menu
*   ELSE
*   IF data type = cal coefficients THEN
*     call routine which generates the cal coeff register menu
*   ELSE
*     call routine which generates cal kit and memory trace menus
*
************************************************************************
*
* REVISION LOG--
*
************************************************************************
$DOC-;
SUBROUTINE select_mbm_menu;
BEGIN
  IF data_type=state_file THEN
```

```
    gen_save_menu(tape_mbm_fn)
  ELSE
  IF data_type=cal_file THEN
    gen_cal_info (tape_mbm_fn)
  ELSE
    gen_mbm_menu;
END select_mbm_menu;
```

```
#EJECT;
COMMENT
$DOC+

NAME--
  gen_reg_menu
***********************************************************************
*
* SHORT DESCRIPTION--
*   generate appropriate menu based on tape/bubble operation selected
*
* EXTENDED DESCRIPTION--
*   This routine is called upon selecting a data type softkey to
*   record, restore, or delete from tape.  It generates the data
*   resgister menu for data types found in bubble or the data file menu
*   for data types found only in RAM.
*
* INPUTS--
*   type = data type selected
*
* OUTPUTS--
*   none
*
* ROUTINES CALLED--
*   select_mbm_menu
*   gen_file_menu
*
* ERROR CONDITIONS AND RECOVERY--
*   none
*
* NOTES--
*   On deleting tape files, the data registers menu is not generated
*   for data types found in bubble memory.
*
* AUTHOR--
*
***********************************************************************
*
* INITIAL REFINEMENT--
*   set new data type selected
*   IF tape operation <> delete THEN
*     generate data register menu
*   ELSE
*     generate data file menu
*
***********************************************************************
*
* REVISION LOG--
*
***********************************************************************
$DOC-;
PROCEDURE gen_reg_menu (type);  VALUE type; INTEGER type;
BEGIN
  new_data (type);
  IF tape_mbm_fn <> delete_op THEN
    select_mbm_menu
```

```
  ELSE
    gen_file_menu (type);
END gen_reg_menu;
```

```
#EJECT;
COMMENT
$DOC+

NAME--
  gen_last_reg_menu
***********************************************************************
*
* SHORT DESCRIPTION--
*   generates prior data register menu
*
* EXTENDED DESCRIPTION--
*   This routine generates the data register menu which is modified
*   after it is displayed according to the data type represented.
*   This routine is invoked by the procedure previous_menu which is
*   called upon pressing the [PRIOR MENU] key.
*
*   A prior menu flag is set to indicate to the routines which actually
*   generate and modify the menu that the menu level is to decrease.
*
* INPUTS--
*   none
*
* OUTPUTS--
*   modified data register menu
*
* ROUTINES CALLED--
*   select_mbm_menu
*
* ERROR CONDITIONS AND RECOVERY--
*
* NOTES--
*
* AUTHOR--
*
***********************************************************************
*
* INITIAL REFINEMENT--
*   set prior menu flag
*   call routine to determine menu modification
*
***********************************************************************
*
* REVISION LOG--
*
***********************************************************************
$DOC-;
SUBROUTINE gen_last_reg_menu;                                    ENTRY;
BEGIN
  prior_reg_menu := TRUE;
  select_mbm_menu;
END gen_last_reg_menu;
```

```
#EJECT;
PROCEDURE hpib_call (type, fn, reg);
  VALUE type, fn, reg;  INTEGER type, fn, reg;
BEGIN
  new_data (type);
  tape_nbm_fn := fn;
  reg_num := -reg;
  reg_chosen;
END hpib_call;
```

```
#EJECT;
PROCEDURE select_default_set (reg);
  VALUE reg; INTEGER reg;                                          ENTRY;
  hpib_call (cal_file, no_op, reg);

PROCEDURE save_cal_set (reg);
  VALUE reg; INTEGER reg;                                          ENTRY;
  hpib_call (cal_file, save_op, reg);

PROCEDURE delete_cal_set (reg);
  VALUE reg; INTEGER reg;                                          ENTRY;
  hpib_call (cal_file, clear_op, reg);
```

```
#EJECT;
COMMENT
$DOC+

NAME--
  save_last_state
*******************************************************************
*
* SHORT DESCRIPTION--
*   saves "last instrument state" information
*
* EXTENDED DESCRIPTION--
*   This routine saves a partial instrument state containing enough
*   information to reconstruct entire instrument state.  A "last state"
*   is saved between changes to major instrument state variables, so
*   that a state prior to these changes can easily be recalled without
*   the user explicitly saving it away in a register.
*
* INPUTS--  none
*
* OUTPUTS-- none
*
* ROUTINES CALLED--
*   save_data
*   clear_message
*
* ERROR CONDITIONS AND RECOVERY--
*
* NOTES--
*
* AUTHOR--
*
*******************************************************************
*
* INITIAL REFINEMENT--
*   save last instrument state in bubble
*   clear message displaying acknowledgment of data that was saved
*
*******************************************************************
*
* REVISION LOG--
*
*******************************************************************
DECLARATION--
;
SUBROUTINE save_last_state;                                        ENTRY;
&
$DOC-&
  save_data (ADRS(last_state),last_state_size,state_file,prior_state);
```

```
#EJECT;
COMMENT
$DOC+

NAME--
  save
*******************************************************************
*
* SHORT DESCRIPTION--
*   saves an instrument state over public HP-IB
*
* EXTENDED DESCRIPTION--
*   This routine saves an instrument state in response to a public
*   HP-IB mnemonic.  This by-passes bringing up the save/recall menu
*   followed by selecting a register to save the data into.
*
* INPUTS--
*   reg = number to save instrument state in
*
* OUTPUTS--
*   none
*
* ROUTINES CALLED--
*   abort_sweep
*   save_data
*   restart_sweep
*
* ERROR CONDITIONS AND RECOVERY--
*   none
*
* NOTES--
*
* AUTHOR--
*
*******************************************************************
*
* INITIAL REFINEMENT--
*   abort any sweep in progress
*   call routine to save an instrument state in register
*   restart any sweep that was aborted
*
*******************************************************************
*
* REVISION LOG--
*
*******************************************************************
DECLARATION--
;
PROCEDURE save (reg); VALUE reg;  INTEGER reg;                     ENTRY;
&
$DOC-&

  hpib_call (state_file, save_op, reg);
```

```
#EJECT;
COMMENT
$DOC+

NAME--
  recall
***********************************************************************
*
* SHORT DESCRIPTION--
*   recalls an instrument state over public HP-IB
*
* EXTENDED DESCRIPTION--
*   This routine recalls an instrument state in response to a public
*   HP-IB mnemonic.  This by-passes bringing up the save/recall menu
*   followed by selecting a register to recall the data from.
*
* INPUTS--
*   reg = number to save instrument state in
*
* OUTPUTS--
*   none
*
* ROUTINES CALLED--
*   abort_sweep
*   recall_data
*   restart_sweep
*
* ERROR CONDITIONS AND RECOVERY--
*   none
*
* NOTES--
*
* AUTHOR--
*
***********************************************************************
*
* INITIAL REFINEMENT--
*   abort any sweep in progress
*   call routine to recall an instrument state from a register
*   restart any sweep that was aborted
*
***********************************************************************
*
* REVISION LOG--
*
***********************************************************************
DECLARATION--
;
PROCEDURE recall (reg); VALUE reg;  INTEGER reg;                ENTRY;
&
$DOC-&

  hpib_call (state_file, recall_op, reg);
```

```
BEGIN
  tell (loading_data);
  abort_sweep;
  recall_type := preset_recall;
  init_softkeys;
  IF NOT recall_data (ADRS(min_save), state_file, preset_state) THEN
    BEGIN
      clear_message (recall_error);
      macro_warn (recall_error, preset_macro);
    END;
  restart_sweep;
END recall_preset_state;
```

```
#EJECT;
COMMENT
$DOC+

NAME--
  recall_preset_state
***********************************************************************
*
* SHORT DESCRIPTION--
*   recalls instrument preset state
*
* EXTENDED DESCRIPTION--
*   This routine recalls the instrument preset state in response to
*   pressing the "preset" key on the front panel.  The sweep is aborted
*   prior to recalling data and restarted after data is recalled from
*   bubble.
*
* INPUTS--
*
* OUTPUTS--
*
* ROUTINES CALLED--
*   tell
*   warn
*   clear_message
*   abort_sweep
*   restart_sweep
*   recall_data
*
* ERROR CONDITIONS AND RECOVERY--
*   none
*
* NOTES--
*
* AUTHOR--
*
***********************************************************************
*
* INITIAL REFINEMENT--
*   display message indicating data being loaded
*   abort sweep
*   recall data (instrument preset state) from bubble
*   IF error in recalling THEN
*     display error message
*   restart sweep
*
***********************************************************************
*
* REVISION LOG--
*
***********************************************************************
DECLARATION--
;
SUBROUTINE recall_preset_state;                                 ENTRY;
&
$DOC-&
```

```
#EJECT;
COMMENT
$DOC+

NAME--
  recall_power_on_state
***********************************************************************
*
* SHORT DESCRIPTION--
*   recalls "power up" instrument state register
*
* EXTENDED DESCRIPTION--
*   This routine is called only on "power up" and recalls the instrument
*   state contained in a designated "power up" register (1).
*   Bubble function variables are initialized at this point as well as
*   tape function variables (done through an externally declared
*   routine.  After the data has been recalled from bubble into RAM,
*   the "last state" information of the current instrument state is
*   saved.
*
* INPUTS--
*
* OUTPUTS--
*
* ROUTINES CALLED--
*   init_tape_mgr
*   bubble_ok
*   recall_data
*   save_last_state
*   tell
*   clear_message
*
* ERROR CONDITIONS AND RECOVERY--
*   A bubble failure (i.e. no 2nd bubble, broken or uninitialized 2nd
*   bubble) prior to recalling data will cause a fatal message to be
*   displayed which consequently hangs the system (via external routine
*   bubble_ok).
*
* NOTES--
*
* AUTHOR--
*
***********************************************************************
*
* INITIAL REFINEMENT--
*   initialize tape and bubble variables
*   IF data bubble is initialized and working THEN
*     recall data from bubble
*     clear recall acknowledgment message from display
*     save "last state"
*   ELSE
*     hang system
*
***********************************************************************
*
* REVISION LOG--
```

```
*
************************************************************************
DECLARATION--
;
SUBROUTINE recall_power_on_state;                              ENTRY;
&
$DOC-&

BEGIN
  init_tape_mgr;
  init_softkeys;
  tell (loading_data);
  tape_mbn_fn := 0;
  reg_num := 1;
  prior_reg_menu := fix_reg_menu := data_in_bubble := FALSE;
  set_data_type (state_file);
  IF bubble_ok THEN
    BEGIN
      recall_data (ADRS(min_save), state_file, pwr_on_state);
      clear_message (data_recalled);
      save_last_state;
    END;
END recall_power_on_state;

#FILE fdtmgr.work;

END$
```

```
 ASMB,L
   HED fft routines jtb ( from dds ) feb,1982
   NAM fft,7
   UNL
*               WARNING uses all registers ( or most )
R0  REG 0           usually  A (first ) data value ( mantissa )
R1  REG 1           usually  B (second) data value ( mantissa )
R2  REG 2           usually  A (first ) data value ( exp )
R3  REG 3           usually  C (second) data value ( exp )
R4  REG 4           used for exp arithmetic
R5  REG 5           Angle delta for sin/cos table
R6  REG 6           Inner loop counter    master value in  2(S)
R7  REG 7           Outer loop counter    master value in  8(S)
R8  REG 8           ptr to mircocode mapper ( hardware math )
R9  REG 9           ptr to  A (first ) data value
R10 REG 10          ptr to  B (second) data value
R11 REG 11          ptr to  sin_cos table for B data value
R12 REG 12          not used ( used to be )
R13 REG 13          constant 12         not really needed
S   REG 15
*                   STACK
*               0    seperation between A,B data in outer loop ( bytes )
*               2    seperation between A,B data in outer loop(data pts)
*               4    Intial data array address  -- 32 bit
*               8    Inner loop counter
*               10   Intial sin_cos array address -- 32 bit
*
* Uses the In-place decimation in freq with natural order twiddles.
*    see BRIGHAM (1974) fig 11-4c or OPPENHEIM/SCHAFFER (1975) fig 6.15
* An outer loop starts at 1 increasing to 1/2 FFT size, with
*    an inner loop starting at 1/2 FFT size decreasing to 1
* Basic buuterfly is  A,B inputs
*                     A+B, (A-B)*W  outputs      ( W is the twiddle )
*
* Uses a full 360 deg sin_cos table, and attempts to avoid mpys if
* not needed.
* Older verision use 90 deg table
*  was slower 270 vs 220 nS  -- took less space 250 vs 350 bytes
*
*  Major changes from Dave's verision were
*         Word writes only to Ram  --- maybe display ram
*         Not fixed to just 1024 pt transforms
*
 ENT fft
 ENT ifft
 EXT XFM2P              REGULAR 2 PT XFM
 EXT XFM2Q              2 PT XFM W/O sin/cos MPY
 EXT sine_cos
 EXT preempt
```

```
*EJECT                                     these set the FFT size
hftsz   EQU 3072          HALF FFT SIZE *6    only used just below
fftsz   EQU 512           HALF FFT SIZE       can be set by a parameter
fftang  EQU 4
ifftang EQU -4
cpxsz   EQU 6
ifft  MOVE.W  #ifftang,   R5
      LEA     sine_cos.L, R11
      ADD.L   =H1000,     R11
      BRA     FFTS
fft   MOVE.W  #fftang,    R5       ANGLE ADRDELTA
      LEA     sine_cos.L, R11
FFTS: MOVE.L  R11, -(S)            STORE INIT ANGLE PTR
   MOVE.W  #1,      -(S)           OUTER LOOP INIT VALUE
   MOVE.L  R0,      -(S)           ADR OF DATA ARRAY
   MOVE.W  #fftsz, -(S)            INNER LOOP INIT VALUE
   MOVE.W  #hftsz, -(S)            DATA ADRDELTA
   MOVE.W  #12,     R13            CONSTANT 12
*
```

```
*EJECT        start new inner/outer loop pass
*
FFT0 MOVE.L 4(S),  R9              INIT LOWER ADRPTR
   MOVE.L R9,    R10
   ADD.W  (S),   R10               INIT UPPER ADRPTR
   MOVE.W 8(S), R7         INIT OUTER LOOP   progress from 1 to 1/2 size
*
* NOTE: ROUTINE ASSUMES ADDRESS ARRAY DOES NOT CROSS
*       THE 64Kbyte ADDRESS TRANSITION.
*
   MOVE.L (R9)+, R0                get A (first) point
   MOVE.W (R9)+, R2
*
*      outer loop
*
FFT01: MOVE.L 10(S), R11           INIT ANGLE PTR
   MOVE.W 2(S),  R6        INIT INNER LOOP CTR  progress 1/2 size to 1
   LEA    XFM2Q, R8
*
   MOVE.L (R10)+, R1               get B (second) data point
   MOVE.W (R10)+, R3
*
   SUB.B  R3,     R2                        * find exp difference
   BVC    FFT3                              * check for over/underflow
   BSR    ovf_R2R3
*
FFT3: MOVE.L R0, (R8)+
   MOVE.L R1, (R8)+
   MOVE.W R2, (R8)+                ADD    A + B    first half of butterfly
*
   TST.B  R2
   BMI    FFT31
   ADD.B  R2,  R3
FFT31: SUBQ   #cpxsz, R9           set back A (first) data ptr
*
   MOVE.W (R8)+, R4
   MOVE.W (R8)+, (R9)+       STORE RESULT    over orginal A (first) data
   MOVE.W (R8)+, (R9)+             word writes for display ram
   MOVE.L R0,    (R8)+
   MOVE.L R1,    (R8)+
   MOVE.W R2,    (R8)+             SUB     A - B  second half of butterfly
*                                                 note: no sin/cos
   ADD.B  R3,     R4
   BVC    FFT41
   BSR    ovf_R4
FFT41 MOVE.W R4, (R9)+         STORE EXP      over orginal A (first) data
*
   MOVE.W R3,     R4
   MOVE.L (R10)+, R1                          get next B (second) data
   MOVE.W (R10)+, R3
   SUB.W  R13,    R10                         reset B (second) data ptr
   MOVE.W (R8)+, (R10)+       STORE RESULT over orginal B (second) data
   MOVE.W (R8)+, (R10)+                      word writes to display ram
   ADD.W  #1,      R2
   ADD.B  (R8)+,   R4
   BVC    FFT51                               over/underflow check
```

```
AFFT.WORK.PD8510              THU, DEC 22, 1983, 10:35 AM     PAGE  4

   BSR    ovf_R4
FFT51 SUB.W  #1,   R6      DECR INNER LOOP    if zero finished with inner
   BGT    FFT6                                if postive do more inner
*
*              finished with inner loop
*
   MOVE.W R4,     (R10)+        STORE EXP   over orginal B (second) data
   ADD.W  R13,     R9                       inc A (first) data ptr
   ADD.W  #cpxsz, R10                       inc B (second) data ptr
   MOVE.L R1,      R0                       move what was B to A data
   MOVE.W R3,      R2
   SUB.W  #1,      R7           DECR OUTER LOOP
   BGT    FFT01
*
*              finished with outer loop and inner loop=1 therefore done!
*
   ADD.W  #14, S
   RTS
*
```

```
AFFT.WORK.PD8510              THU, DEC 22, 1983, 10:35 AM     PAGE  5

*EJECT    inner loop   enter
*                note B (second) data is in R1/3
*
FFT6 MOVE.L (R9)+,R0                 get next A (first) data point
   MOVE.W (R9)+,  R2
   SUB.B  R3,     R2                 find exp difference
   BVC    FFT7                       over/under flow check
   BSR    ovf_R2R3
*
* main inner loop loop point
FFT7 LEA  XFM2P,  R8                 full butterfly mpy ptr
   MOVE.L R0,     (R8)+
   MOVE.L R1,     (R8)+
   MOVE.W R2,     (R8)+              ADD  A + B   first half of  butterfly
*
   TST.B  R2
   BMI    FFT71
   ADD.B  R2,      R3
FFT71 ADD.W R5,    R11               INCR ANGLE  of sin_cos table
   MOVE.W R4,     (R10)+             STORE OLD EXPONENT  ( bogus first pass
   SUB.W  #cpxsz, R9           reset to point back to present A (first) data
   ADD.W  #cpxsz, R10                point to next B (second) data
*
   MOVE.W (R8)+,  R4
   MOVE.W (R8)+, (R9)+               STORE RESULT   over old A (first) data
   MOVE.W (R8)+, (R9)+               word writes to display  ram
   MOVE.L R0,     (R8)+
   MOVE.L R1,     (R8)+
   MOVE.W R2,     (R8)+              SUBTRACT     A - B
*
   ADD.B  R3,      R4
   BVC    FFT73                      more over/underflow
   BSR    ovf_R4
FFT73 MOVE.W R4, (R9)+               STORE EXPONENT -- A (first) data
*
   MOVE.W R3,      R4
   MOVE.L (R9)+,   R0                load in new A (first) data
   MOVE.W (R9)+,   R2
*
   MOVE.L (R11), (R8)+               LOAD SIN/COS VALUE
*
   MOVE.L (R10)+, R1                 load in new B (second) data
   MOVE.W (R10)+, R3                 while mpy working
   SUB.W  R13,     R10         reset b (second) data ptr back to old point
   SUB.B  R3,      R2
   BVC    FFT81                      under/overflow   check
   BSR    ovf_R2R3
*
FFT81: MOVE.W (R8)+, (R10)+          STORE RESULT over old B (second) data
       MOVE.W (R8)+, (R10)+              word writes to display ram
   ADD.W  #1,      R8
   ADD.B  (R8)+,   R4
   BVC    FFT85                       under/overflow
   BSR    ovf_R4
*
FFT85 SUB.W #1,    R6                DECR INNER LOOP
```

```
AFFT.WORK.PD8510              THU, DEC 22, 1983, 10:35 AM     PAGE  6

   BGT    FFT7                       loop back if more
   MOVE.W R4,     (R10)+             STORE EXPONENT   -- inner loop finish
   SUB.W  #1,      R7                DECR OUTER LOOP
   BLE    FFT9                       or both inner and outer loop finished?
   MOVE.L R10,     R9                INIT ADR PTRS  -- more to do on outer
   ADD.W  #cpxsz, R9
   ADD.W  (S),     R10
   MOVE.L R1,      R0                B (second) prefetch will be new A data
   MOVE.W R3,      R2
   BRA    FFT01
*
* inner loop and outer loop finished __ set up new loop conditions
*
FFT9 LSL.W 8(S)                      OUTER LOOP DOUBLED
   ASR.W   2(S)                      INNER LOOP HALVED
   ASR.W   (S)                       ADR DELTA HALVED
   ADD.W   R5,     R5                ANGLE DELTA DOUBLED
   BRA     FFT0
*
*
*
*
*
ovf_R2R3 EQU *
   BPL    ovf_23
   ADD.B  R2,      R3
   MOVE.W =H7F,    R2
   SUB.B  R2,      R3
   RTS
ovf_23 MOVEQ =H80, R2
   RTS
*
*
*
*
*
*
ovf_R4    EQU *
   BPL    ovf_4
   MOVE.W =H7F,  R4
   RTS
ovf_4 MOVE.W =H80,R4
   RTS
*
*
*
*
```

```
AFFT.WORK.PD8510              THU, DEC 22, 1983, 10:35 AM     PAGE  7

*EJECT        unpack bit-reversing routine see Rabiner/Gold(1975)  p365
 ENT fftun                                   or Oppenheim/Schafer(1975) p316
untbl DEF un128-un1024
      DEF un256-un1024
      DEF un512-un1024
      DEF un1024-un1024          unused, but needed to simplify indexing
      DEF un1024-un1024
fftun EQU *
 MOVE.L R0,          R8          R8  has start adr  for data array
*MOVE.W #fftsz,      R0          actual 1/2 fft size
*ASR.W  #6,R0                convert to an index   * (fft size / 256) * 2
*LEA    untbl.L,     R9          maybe .L not needed look at obj code
*LEA    un1024.L,    R13
*ADD.W  0(R9,R0.W),R13         R13 has branch adr dependent on array size
 MOVE.L R8,          R10         R10 has destination adr for data array
 MOVE.L R8,          R9          R9  has source adr for data array
 CLR.W  R0                       R0  will be item index
*
loop EQU *
 CMP.L R9,       R10
 BGT   swap
no_swap EQU *
 ADD.W  #cpxsz, R9
 BRA    un1024
*JMP    (R13)                       conditional on fft size
swap EQU *                          display ram word writes only
 MOVE.L (R9),    R1               Need faster algorithm
 MOVE.L (R10),   R2
 SWAP    R2
 MOVE.W  R2,     (R9)+
 SWAP    R2
 MOVE.W  R2,     (R9)+
 SWAP    R1
 MOVE.W  R1,     (R10)+
 SWAP    R1
 MOVE.W  R1,     (R10)+
 NOP
 MOVE.W (R9),    R1
 MOVE.W (R10), (R9)+
 NOP
 MOVE.W  R1   , (R10)+
*JMP    (R13)                      conditional on fft size
*
bit_test EQU *
un1024: BCHG #10, R0               note: R0 is actually 2*index
 BEQ bit_rev
un512:  BCHG #9, R0
 BEQ bit_rev
un256:  BCHG #8, R0
 BEQ bit_rev
un128:  BCHG #7, R0
 BEQ  bit_rev
 BCHG #6, R0
 BEQ  bit_rev
 BCHG #5, R0
 BEQ  bit_rev
```

```
 BCHG #4, R0
 BEQ  bit_rev
 BCHG #3, R0
 BEQ  bit_rev
 BCHG #2, R0
 BEQ  bit_rev
 BCHG #1, R0
 BEQ  bit_rev
 JSR  preempt.L          release the processor for higher priotority use
 RTS
bit_rev MOVE.W R0, R1
 ADD.W R1, R1
 ADD.W R0, R1              mpy by 3 the doubled R0  -- to get byte index
 LEA   0(R8,R1.W), R10
 BRA   loop
*
 END
```

```
INTEGER CONSTANT sup_brk_fifo_size:=5,
                 token_fifo_size := 8,
                 keyboard_fifo_size := 8,
                 public_ib_fifo_size := 8,
                 array_update_fifo_size := 8;
```

```
PROCEDURE init_fifo(fifo, size, resource, not_full, not_empty);
   VALUE size, resource, not_full, not_empty;
   INTEGER ARRAY fifo[*];
   INTEGER size, resource, not_full, not_empty;               EXTERNAL;
PROCEDURE write_fifo(fifo, number);
   VALUE number;
   INTEGER ARRAY fifo[*];
   INTEGER number;                                            EXTERNAL;
INTEGER PROCEDURE read_fifo(fifo);
   INTEGER ARRAY fifo[*];                                     EXTERNAL;
BOOLEAN PROCEDURE empty_fifo(fifo);
   INTEGER ARRAY fifo[*];                                     EXTERNAL;
```

```
M68KL,P,"fifo"
BEGIN

#FILE cdebug.work;                                  & debug &
#FILE fterm.work;                                   & debug &
#FILE fkernel.work;
#FILE fkernel4.work;
#FILE crins.work;
#FILE cfifo.work;
```

```
#EJECT;
COMMENT                                                          fifo
*********************************************************************
*
* MODULE fifo
*
* ENTRY POINTS:
*
*    init_fifo(fifo, size, resource, not_full, not_empty)
*    write_fifo(fifo, value)
*    read_fifo(fifo)
*
* NOTE:
*    Routines in this module use a fifo which must be defined as
*    follows:
*
*    INTEGER CONSTANT size := your fifo's size
*    INTEGER ARRAY fifo[-6:size]
*
*    Three resource identification numbers (rins) must be allocated in
*    the file FRINS -- one for your fifo's resource number, and two for
*    the "not_empty" and "not_full" signals.
*
*    The fifo must be initialized before use by the call:
*       init_fifo( fifo, size, resource, not_full, not_empty )
*    Once initialized, you need not ever use any of the parameters
*    except "fifo" again.
*
* The purpose of this module is to define a fifo data-type and operators
* for it. The desire was to hide as much knowledge of the structure
* of the fifo as possible. The fifo is currently (16 Oct 81)
* implemented as a circular buffer in the array.
*
*********************************************************************
;
GLOBAL INTEGER ARRAY token_fifo[-6:token_fifo_size];
GLOBAL INTEGER ARRAY keyboard_fifo[-6:keyboard_fifo_size];
GLOBAL INTEGER ARRAY public_ib_fifo[-6:public_ib_fifo_size];
GLOBAL INTEGER ARRAY array_update_fifo[-6:array_update_fifo_size];

INTEGER CONSTANT  head_index      := -6,   & offsets from fifo origin. &
                  tail_index      := -5,
                  not_empty_index := -4,
                  not_full_index  := -3,
                  resource_index  := -2,
                  size_index      := -1;
```

```
#EJECT;
COMMENT                                                     init_fifo
*********************************************************************
*
* EXTERNAL SPECIFICATION FOR init_fifo
*
* FUNCTION: To initialize a fifo data type -- includes the fifo array
*           and the associated resource number and signal variables.
*
* DECLARATION INFORMATION:
*    PROCEDURE init_fifo( fifo, size, resource, not_full, not_empty )
*       VALUE size, resource, not_full, not_empty
*       INTEGER ARRAY fifo[*]
*       INTEGER size, resource, not_full, not_empty
*
*    INPUT:  fifo       the array in which the fifo will be built
*            size       the size (maximum index) of the fifo array
*            resource   a resource identification number for the fifo
*            not_full   a resource identification number for signalling
*            not_empty  a resource identification number for signalling
*
*    OUTPUT: none
*
* EXTERNAL EFFECTS: none
*
*********************************************************************
*
* LOGIC INFORMATION FOR init_fifo
*
* PROCEDURES CALLED: none
*
* INITIAL REFINEMENT:
*
*    initialize the fifo resource number.
*    initialize the fifo signal variables.
*    initialize the variables in the fifo prefix (locations -6 to -1).
*
*********************************************************************
;

PROCEDURE init_fifo(fifo, size, resource, not_full, not_empty);
   VALUE size, resource, not_full, not_empty;
   INTEGER ARRAY fifo[*];
   INTEGER size, resource, not_full, not_empty;                ENTRY;
   BEGIN & init_fifo &
     resource_init ( resource );
     signal_init   ( not_full,  size );
     signal_init   ( not_empty, 0 );

     fifo[size_index]      := size;
     fifo[resource_index]  := resource;
     fifo[not_full_index]  := not_full;
     fifo[not_empty_index] := not_empty;
     fifo[head_index]      := 0;
     fifo[tail_index]      := 0;
   END init_fifo;
```

```
#EJECT;
COMMENT                                                    write_fifo
*********************************************************************
*
* EXTERNAL SPECIFICATION FOR write_fifo
*
* FUNCTION: To insert a value into the fifo.
*
* DECLARATION INFORMATION:
*    PROCEDURE write_fifo( fifo, number )
*       VALUE         number
*       INTEGER ARRAY fifo[*]
*       INTEGER       number
*
*    INPUT:  fifo       the fifo array
*            number     the integer value to be inserted into the fifo
*
*    OUTPUT: none
*
* EXTERNAL EFFECTS: If the fifo is full, the calling routine will be
*                   suspended until there is room in the fifo to insert
*                   the value.
*
*********************************************************************
*
* LOGIC INFORMATION FOR write_fifo
*
* PROCEDURES CALLED: none
*
* INITIAL REFINEMENT:
*
*    acquire the fifo.
*    IF fifo is full then wait until not full.
*    insert the number in the fifo and update the index.
*    send the not empty signal to any process that may be waiting.
*    release the fifo.
*
* COMMENT: Since there can be multiple fifo writers and only one process
*    is allowed to wait for a signal at a time, the "acquire" serves to
*    both protect the "wait" and to keep two processes from interrupting
*    each other during the tail index increment.
*
*********************************************************************
;
PROCEDURE write_fifo(fifo, number);
   VALUE number;
   INTEGER ARRAY fifo[*];                                       ENTRY;
   INTEGER number;
   BEGIN & write_fifo &
     acquire( fifo[resource_index] );
     wait( fifo[not_full_index] );

     IF fifo_debug THEN                                     & DEBUG &
        BEGIN & if &                                        & DEBUG &
          WSTR("write_fifo: #"); WHex(ADRS(fifo),8);        & DEBUG &
          WHEX(number);                                     & DEBUG &
```

```
        CRLF;                                              & DEBUG &
      END;  & if &                                         & DEBUG &
    fifo[ fifo[tail_index] ] := number;
    fifo[tail_index] := IF fifo[tail_index] >= fifo[size_index] THEN 0
                 ELSE fifo[tail_index] + 1;
                                           & increment modulo fifo size &
    send( fifo[not_empty_index] );
    release( fifo[resource_index] );
  END write_fifo;
```

```
#EJECT;
COMMENT                                                          read_fifo
**********************************************************************
*
* EXTERNAL SPECIFICATION FOR read_fifo
*
* FUNCTION: To read a value from the fifo.
*
* DECLARATION INFORMATION:
*    PROCEDURE read_fifo( fifo )
*       INTEGER ARRAY fifo[*]
*
*    INPUT:  fifo        the fifo array
*
*    OUTPUT: read_fifo   the integer value from the fifo
*
* EXTERNAL EFFECTS: If the fifo is empty, the calling routine will be
*                   suspended until the fifo is not empty.
*
* COMMENT: There can be only one fifo reader.
*
**********************************************************************
*
* LOGIC INFORMATION FOR read_fifo
*
* PROCEDURES CALLED: none
*
* INTIAL REFINEMENT:
*
*    IF fifo is empty then wait until not empty.
*    remove the number from the fifo and update the index.
*    send the not full signal to any process that may be waiting.
*
**********************************************************************
;
INTEGER PROCEDURE read_fifo(fifo);
   INTEGER ARRAY fifo[*];                                       ENTRY;
   BEGIN & read_fifo &
      wait( fifo[not_empty_index] );

      read_fifo := fifo[ fifo[head_index] ];
      IF fifo_debug THEN                                    & DEBUG &
         BEGIN & if &                                       & DEBUG &
            WSTR("read_fifo:  #"); WHex(ADRS(fifo),8);      & DEBUG &
            WHEX( fifo[fifo[head_index]] );                 & DEBUG &
            CRLF;                                           & DEBUG &
         END;  & if &                                       & DEBUG &
      fifo[head_index] := IF fifo[head_index] >= fifo[size_index] THEN 0
                  ELSE fifo[head_index] + 1;
                                           & increment modulo fifo size &
      send( fifo[not_full_index] );
   END read_fifo;
```

```
#EJECT;
COMMENT                                                         empty_fifo
**********************************************************************
*
* EXTERNAL SPECIFICATION FOR empty_fifo
*
* FUNCTION: To return true if the fifo is empty.  This enables a routine
*           the check for an entry in a fifo without being suspended
*           until the fifo is not empty.
*
* DECLARATION INFORMATION:
*    BOOLEAN PROCEDURE empty_fifo( fifo )
*       INTEGER ARRAY fifo[*]
*
*    INPUT:  fifo        the fifo array
*
*    OUTPUT: empty_fifo  true if the fifo is empty
*
* EXTERNAL EFFECTS:
*    none
*
**********************************************************************
*
* LOGIC INFORMATION FOR empty_fifo
*
* PROCEDURES CALLED: none
*
* INTIAL REFINEMENT:
*
*    acquire the fifo.
*    return TRUE if fifo is empty, False otherwise.
*    release the fifo.
*
**********************************************************************
;
BOOLEAN PROCEDURE empty_fifo(fifo);
   INTEGER ARRAY fifo[*];                                       ENTRY;
   BEGIN & empty_fifo &
      empty_fifo := NOT pending( fifo[not_empty_index] );
   END empty_fifo;

END$
```

```
#FILE cfifo.work;

EXTERNAL INTEGER ARRAY fifo_sup_brk[-6:sup_brk_fifo_size];
EXTERNAL INTEGER ARRAY token_fifo[-6:token_fifo_size];
EXTERNAL INTEGER ARRAY keyboard_fifo[-6:keyboard_fifo_size];
EXTERNAL INTEGER ARRAY public_ib_fifo[-6:public_ib_fifo_size];
EXTERNAL INTEGER ARRAY array_update_fifo[-6:array_update_fifo_size];
```

```
AFLT.WORK.PD8510              THU, DEC 22, 1983, 10:35 AM     PAGE  1


ASMB,R
      NED TYPE 2 ARITHMETIC - APR 25 84
      NAM FLTPT,7,"DDS/jtb APR 83"
      ENT ADD2,ADD2A,ADD2M,ADD2T,MPY2,MPY2A,MPY2M,MPY2T
      ENT SUB2,SUB2A,SUB2M,SUB2T,SBR2,SBR2A,SBR2M,SBR2T
      ENT CMP2,CMP2A,CMP2M,CMP2T,CPR2,CPR2A,CPR2M,CPR2T
      ENT ADD2G,SUB2G,SBR2G,CMP2G,CPR2G
      ENT MPY2G,DIV2G,DVR2G
      ENT DVR2,DVR2A,DVR2M,DVR2T,DIV2,DIV2A,DIV2M,DIV2T
      ENT MOD2,MOD2A,MOD2G
      ENT CNV24,CNV25,CNV31,CNV32,CNV41,CNV42,CNV51,CNV52
      ENT CNV13,CNV23,CNV14,CNV15
      ENT ABS2,RABS2,NEG2,RNEG2
      ENT MPY3,MPY3A,MPY3M,MPY3T,MPY3G
*
      EXT LDR2A,LDR2M,LDR2T,LDR2G
      EXT ADDLF,SUBLF,LLDMY,ADEXP,MPYLF
      EXT LLDAO,LLDA2,DIVFP,MYNRM,MPYDI
*
R0    REG 0
R1    REG 1
R2    REG 2
R3    REG 3
R8    REG 8
G     REG 13
M     REG 14
S     REG 15
*
* AS MUCH AS REASONABLE THESE ROUTINES ATTEMPT TO DUPLICATE
* LYNN'S PRESENT 68000 FLOATING POINT ROUTINES, BUT USING
* THE 85101 MATH HARDWARE WHERE POSSIBLE. THE BASIC KNOWN
* DIFFERENCES ARE
* 1. REPRESENTATION OF 0:  LYNN SOMETIMES USES 0*2^0, I PREFER 0*2^-256
*    THESE ROUTINES PRESENTLY HAVE CHECKS ADDED SO THEY CAN
*    GRACEFULLY ACCEPT LYNN'S "0" BUT THEY WILL OUTPUT 0*2^N
*    WHERE N IS AT LEAST 32 SMALLER THAN INPUT EXPONENT.
* 2. THESE ROUNTINES ASSUME NORMALIZED INPUTS. SOME WILL REACT
*    DIFFERENTLY THAN LYNN'S TO UNNORMALIZED INPUTS. HOWEVER,
*    ALL OUTPUTS SHOULD BE FULLY NORMALIZED EXCEPT 0. DIVIDE
*    MAY NOT OUTPUT NORMALIZED RESULTS FOR UNNORMALIZED DIVIDENDS.
* 3. THESE ROUTINES ATTEMPT TO RIGOROUSLY CHECK FOR ANY POSSIBLE
*    EXPONENT UNDER OR OVERFLOW. NO PRESENT ATTEMPT IS MADE TO
*    IMPLEMENT GRADUAL, OR EVEN ACCURATE, UNDERFLOW. IT JUST
*    FORCES THE EXPONENT TO THE LIMIT (+255 OR -256).
* 4. NO ATTEMPT WAS MADE TO APPROACH LYNN'S LEVEL OF CODE COMPACTION.
* 5. THE BCD ROUTINES WERE NOT ADDRESSED AT ALL SINCE THE BCD
*    MATH TYPES SHOULD BE DROPPED, IN MY OPINION.
*
* NO PRETENSES ARE MADE REGARDING THE APPLICABILITY, LEGITIMACY,
*  CORRECTNESS, OR PERFORMANCE OF THE FOLLOWING ROUTINES.  THEY
*  WERE DONE SOLEY TO GAIN EXPERIENCE WITH THE HARDWARE MULTIPLIER
*  AND TO PROVIDE A TEMPORARY SOLUTION TO THE LACK OF THE PROJECT'S
*  DEFINITION AND IMPLEMENTATION OF ITS OWN SOFTWARE PACK.
*
ABS2  TST.L  R0
```

```
AFLT.WORK.PD8510              THU, DEC 22, 1983, 10:35 AM     PAGE  2


      BGE    ABSX
NEG2  MOVE.L R2,-(S)    SAVE R2
      MOVE.B R0,R2
      CLR.B  R0
      NEG.L  R0
      BVC NEG20
      LSR.L #1, R0
      ADDQ.B #1, R2
      BVC NEG20
      MOVEQ =H7F, R2
NEG20 MOVE.B R2, R0
      MOVE.L (S)+, R2
      RTS
RABS2 TST.L  R1
      BGE    ABSX
RNEG2 EXG    R0,R1
      BSR    NEG2
      EXG    R0,R1
ABSX  RTS
*
MPY2T JSRX   LDR2T
      BRA    MPY2
MPY2M JSRX   LDR2M
      BRA    MPY2
MPY2G JSRX   LDR2G
      BRA    MPY2
MPY2A JSRX   LDR2A
MPY2  MOVE.L R1, LLDA0
      ADD.B R0, R1
      BVC MPY20
      BPL MPY21
      MOVEQ =H7F, R1
      BRA MPY20
MPY21 MOVEQ =H80, R1
MPY20 CLR.B R0
      MOVE.L R0, MPYLF
      MOVE.L LLDA0, R0
*      CLR.B R0
*      TST.L R0
*      BEQ MPYRT
      ADD.B  ADEXP+1, R1
      BVC MPY22
      BPL MPY23
      MOVEQ =H7F, R1
      BRA MPY22
MPY23 MOVEQ =H80, R1
MPY22 MOVE.B R1, R0
MPYRT RTS
*
*
*
* POSSIBLE PROBLEM WITH THIS ADD (SUB, CMP) ROUTINE MAY RESULT
* WHEN X*2^A IS ADDED TO 0*2^B WHERE B > A.  IT WILL LOSE (B-A)
* BITS OF X IN THE ALIGNMENT OPERATION.  THIS PRESENTLY DOESN'T SEEM
* SIGNIFICANT ENOUGH TO WORRY ABOUT IN PRACTICAL SITUATIONS.
*
```

```
AFLT.WORK.PD8510              THU, DEC 22, 1983, 10:35 AM     PAGE  3


ADD2T JSRX   LDR2T
      BRA    ADD2
ADD2M JSRX   LDR2M
      BRA    ADD2
ADD2G JSRX   LDR2G
      BRA    ADD2
ADD2A JSRX   LDR2A
ADD2  MOVE.L R1, LLDMY
ADD2B BNE ADD201
      MOVE.B =H80, R1
ADD201 MOVE.L R0, LLDA0
      BNE ADD202
      MOVE.B =H80, R0
ADD202 SUB.B R1, R0
      BVC ADD20
      BPL ADD21
      ADD.B R0, R1
      MOVE =H7F, R0
      SUB.B R0, R1
      BRA ADD20
ADD21 MOVEQ =H80, R0
ADD20 MOVE.B R0, ADDLF+1
      BMI ADD22
      ADD.B R0, R1            R1 MAX EXPONENT
ADD22 MOVE.L LLDA0, R0
*      CLR.B R0
*      TST.L R0
*      BEQ ADDRT
      ADD.B ADEXP+1, R1
      BVC ADD23
      BPL ADD24
      MOVEQ =H7F, R1
      BRA ADD23
ADD24 MOVEQ =H80, R1
ADD23 MOVE.B R1, R0
ADDRT RTS
*
SUB2T JSRX   LDR2T
      BRA    SUB2
SUB2M JSRX   LDR2M
      BRA    SUB2
SUB2G JSRX   LDR2G
      BRA    SUB2
SUB2A JSRX   LDR2A
      BRA    SUB2
SBR2T JSRX   LDR2T
      BRA    SBR2
SBR2M JSRX   LDR2M
      BRA    SBR2
SBR2G JSRX   LDR2G
      BRA    SBR2
SBR2A JSRX   LDR2A
SBR2  EXG    R0,R1
SUB2  MOVE.L R1, SUBLF
      BRA ADD2B
*
```

```
AFLT.WORK.PD8510              THU, DEC 22, 1983, 10:35 AM     PAGE  4


CMP2T JSRX   LDR2T
      BRA    CMP2
CMP2M JSRX   LDR2M
      BRA    CMP2
CMP2G JSRX   LDR2G
      BRA    CMP2
CMP2A JSRX   LDR2A
      BRA    CMP2
CPR2T JSRX   LDR2T
      BRA    CPR2
CPR2M JSRX   LDR2M
      BRA    CPR2
CPR2G JSRX   LDR2G
      BRA    CPR2
CPR2A JSRX   LDR2A
CPR2  EXG    R1,R0
CMP2  BSR SUB2
      CLR.B R0
      TST.L R0
      RTS
*
*MOD2T JSRX   LDR2T
*      BRA    MOD2
*MOD2M JSRX   LDR2M
*      BRA    MOD2
MOD2G JSRX   LDR2G
      BRA    MOD2
MOD2A JSRX   LDR2A
      BRA    MOD2
*MDR2T JSRX   LDR2T
*      BRA    MDR2
*MDR2M JSRX   LDR2M
*      BRA    MDR2
*MDR2G JSRX   LDR2G
*      BRA    MDR2
*MDR2A JSRX   LDR2A
*MDR2  EXG    R0,R1
MOD2  MOVE.L R0,-(S)
      MOVE.L R1,-(S)
      BSR    DIV2           NOT TOO SURE          jtb  * MOD y acts like
      BSR    CNV23          ABOUT THIS ACCURACY        * MOD y/2
      BSR    CNV32          FOR A MOD FUNCTION
      BSR    MPY2T
      BSR    SBR2T
      RTS
*
DIV2T JSRX   LDR2T
      BRA    DIV2
DIV2M JSRX   LDR2M
      BRA    DIV2
DIV2G JSRX   LDR2G
      BRA    DIV2
DIV2A JSRX   LDR2A
      BRA    DIV2
DVR2T JSRX   LDR2T
      BRA    DVR2
```

```
AFLT.WORK.PD8510              THU, DEC 22, 1983, 10:35 AM     PAGE   5

DVR2M JSRX   LDR2M
      BRA    DVR2
DVR2G JSRX   LDR2G
      BRA    DVR2
DVR2A JSRX   LDR2A
DVR2  EXG    R0,R1
DIV2  MOVE.L R2,-(S)             contents of R0 is divide by R1 -- rtred R0
      MOVE.B R0,R2
      SUB.B  R1,R2
      BVS FIXDOV
      CLR.B R0
      CLR.B R1
      SWAP R2
      CLR R2
      TST.L R1
      BEQ DVZR0
      BPL DIV21
      NEG.L R1
      BVS DIVMI
      NOT R2
DIV21 TST.L R0
      BPL DIV22
      NOT R2
      NEG.L R0
      BVC DIV22
      SWAP R2
      BSR FIXP1
      BRA DIV23
DIV22 SWAP R2
DIV23 BTST #30, R1
      BNE DIV24
      ASL.L #1, R1
      ADD.B #1, R2                              jtb fix
      BVC DIV23
      BRA FIXDOV
DIV24 CMP.L R1, R0
      BLT DIV25
      ASR.L #1, R0
      ADD.B #1, R2                              jtb fix
      BVC DIV24
      BRA FIXDOV
DIV25 MOVE.L R0, LLDA0
      MOVE.L R1, LLDA2
      MOVEQ #5, R0
      NEG.L R1
      BRA DIV26
DIV261 SUB.L LLDA2, R1
DIV26 LSR.L #1, R1
      MOVE.L R1, DIVFP
      SUBQ #1, R0
      BLE DIV27
      CLR.L R1
      BRA DIV261
DIV27 MOVE.L LLDA0, R0
*       CLR.B R0
*       TST.L R0
```

```
AFLT.WORK.PD8510              THU, DEC 22, 1983, 10:35 AM     PAGE   6

*       BEQ DIV29
      TST.L R2
      BPL DIV28
      NEG.L R0
DIV28 MOVE.B R2, R0
DIV29 CLR.L R1
      MOVE RDEXP,  R2      DUMMY READ
      MOVE.L (S)+, R2
      RTS
DVZR0 MOVE.L =H7FFFFF7F,R0   MAX POS NUM
      BRA DIV29
FIXDOV: TST.B R2
      BMI DVZR0
      MOVE.L =H80, R0
      BRA DIV29
DIVMI SWAP R2
      NEG.L R0
      BVC DIV28
      BSR FIXP1
      BRA DIV28
FIXP1 LSR.L #1, R0
      ADDQ #1, R2
      BVC DIV30
      ADDQ #4, S      CLOBBER SUBROUTINE CALL
      BRA FIXDOV
DIV30 RTS
*
CNV13:CNV23:CNV15:CNV25 TST.B  R0     CONVERT TO DOUBLE
      BGE   FIX01
      CLR.L R0
      RTS
FIX01 CMP.B =D32,R0
      BGE   FIXOV
      MOVE.L R2,-(S)
      MOVEQ  #31,R2
      SUB.B  R0,R2
      CLR.B  R0
      ASR.L  R2,R0
*  ROUNDING **** extend and carry bit has last bit shifted out
      BCC    FIX03
      ADD.L  #1,R0
FIX03 MOVE.L (S)+,R2     RESTORE REG
      RTS
*
FIXOV TST.L  R0
      BLT    FXOVN
      MOVE.L =H7FFFFFFF,R0
      RTS
FXOVN MOVE.L =H80000000,R0
      RTS
*
CNV52 EXTS   R0
CNV42 EXTS.L R0
      BRA    CNV32
CNV51 EXTS   R0
CNV41 EXTS.L R0
```

```
AFLT.WORK.PD8510              THU, DEC 22, 1983, 10:35 AM     PAGE   7

CNV31 CLR.L  R1
CNV32 MOVE.L R0, AYNRM
      MOVE.L LLDA0, R0
      MOVE.B RDEXP+1, R0
      ADD.B #31, R0
      RTS
*
CNV14:CNV24 BSR    CNV23
      CMP.L  =D32767,R0
      BGT    C2410
      CMP.L  =D-32768,R0
      BLT    C2420
      RTS
C2410 MOVE   =D32767,R0
      RTS
C2420 MOVE   =H8000,R0
      RTS
*
*       HED TYPE 3 MULTIPLY
*       NAM MPY3,7
*
MPY3T JSRX    LDR2T
      BRA    MPY3
MPY3M JSRX    LDR2M
      BRA    MPY3
MPY3G JSRX    LDR2G
      BRA    MPY3
MPY3A JSRX    LDR2A
MPY3  MOVE.L R0, MPYDI
      MOVE.L R1, MPYDI+4
      MOVE.L MPYDI+8, R0
      RTS
*                        67.13-73.13 uS
* ADDED TEMP TILL 8510 LIBRARY AND LYNN'S LIBRARY BECOME MORE IN SYCH
* BELIEVE THIS IS A 32*32=64 BIT
      ENT MPY3L
MPY3L SUBQ.L #4,S        MAKE ROOM IN STACK
      CLR.L  -(S)        INITIALIZE PRODUCT AREA
      MOVE.L R0,-(S)     SAVE MULTIPLICAND
*
      MULU   R1,R0       LOW ORDER PROD
      MOVE.L R0,8(S)
*
      MOVE   (S),R0      MID PROD
      MULU   R1,R0
      ADD.L  R0,6(S)
      BCC    MY215
      ADDQ   #1,4(S)
*
MY215 SWAP   R1          USE MSH OF MULTIPLIER
      MOVE   2(S),R0
      MULU   R1,R0       MID PROD
      ADD.L  R0,6(S)     ADD TO OTHER MID PROD
      BCC    MY220       CARRY INTO HIGH PROD
      ADDQ   #1,4(S)
MY220 MOVE   (S),R0
```

```
AFLT.WORK.PD8510              THU, DEC 22, 1983, 10:35 AM     PAGE   8

      MULU   R1,R0       HIGH PROD
      ADD.L  4(S),R0     GET MID PROD
*
*     FIXUP UP SIGN
*
      SWAP   R1
      BGE    MY230
      SUB.L  (S),R0
MY230 TST.L  (S)+
      BGE    MY240
      SUB.L  R1,R0
MY240 ADDQ.L #4,S        CLEAN UP STACK
      MOVE.L (S)+,R1
      RTS                RETURN TO CALLER
      END
```

```
AFMT.WORK.PD8510                THU, DEC 22, 1983, 10:36 AM     PAGE   1


ASMB,R
     HED
     NAM FMT,3,"JTB JULY 28,1982"
*
*                                          *
*
     EXT format_integer,format_double,format_quad,format_real
     EXT format_3_cmpx,bcd_of_int
*
*
*
      EXT DIV3L,NEG2,TENI,MPY2,MPY3L,CMP2,CMVE1
*
msh REG 0
lsh REG 1
exp REG 2
*
R0 REG 0   REGISTERS: M68KL - 4 FEB 1980
R1 REG 1
R2 REG 2
R3 REG 3
R4 REG 4
R5 REG 5
R6 REG 6
R7 REG 7
R8 REG 8
R9 REG 9
R10 REG 10
R11 REG 11
R12 REG 12
R13 REG 13
R14 REG 14
R15 REG 15
G REG 13
M REG 14
S REG 15
*
*
 ORB
exp_letter: HEX 6670    f,p
            HEX 6EED    n,u
            HEX 6D20    m.
            HEX 6B4D    k,M
            HEX 4754    G,T
 ORR
```

```
AFMT.WORK.PD8510                THU, DEC 22, 1983, 10:36 AM     PAGE   2

*EJECT
**************************************************************************
* format_TYPE
*
* Converts a data value into an ASCII string for output to display,
*       HP-IB or whatever.
*
* A large number of formats are available -- fixed, floating, powers of
*       see examples                          3,fixed or free field,etc
*
* All fixed formats are right justified.
*
* Timing  approx 600 - 900 uSec   depending on input values and options
*
* calling protocol:
*    ALPHA PROCEDURE format_integer(value,str,fmtcode);
*                         VALUE value,str,fmtcode;
*                       INTEGER value; ALPHA str; DOUBLE fmtcode;EXTERNAL;
*    ALPHA PROCEDURE format_double(value,str,fmtcode);
*                         VALUE value,str,fmtcode;
*                       DOUBLE value; ALPHA str; DOUBLE fmtcode; EXTERNAL;
*    ALPHA PROCEDURE format_quad(value,str,fmtcode);
*                         VALUE value,str,fmtcode;
*                         QUAD value; ALPHA str; DOUBLE fmtcode; EXTERNAL;
*    ALPHA PROCEDURE format_real(value,str,fmtcode);
*                         VALUE value,str,fmtcode;
*                         REAL value; ALPHA str; DOUBLE fmtcode; EXTERNAL;
*    ALPHA PROCEDURE format_3_cmpx(value,str,fmtcode);
*                         VALUE value,str,fmtcode;
*                         USER3 value; ALPHA str; DOUBLE fmtcode;EXTERNAL;
* ........ str:=format(X,str,Z3000A05);
* ........ WSTR(format(y,string,fmtcode1);
*
* value: A INTEGER, DOUBLE, QUAD, REAL, or USER3
* str:   An ALPHA (32 adrs value) where the string is be created
*          [-1] location must be setup
* fmtcode:A DOUBLE containing the formatting instructions
*         An alternative calling sequence that is valid is fmtcode as
*            two integers or four bytes
*
**************************************************************************
**************************************************************************
*
*       Variable allocation
*                           stack
*                       * 2sb lsb *
*                  12(M)* msb 3sb *  fmtcode
*                       * 2sb lsb *
*                   8(M)* msb 3sb *  str adrress
*                       *   lsw   *
*                   4(M)*   msw   *   rtr address
*                       *   lsw   *
*                    (M)*   msw   *   old M
*                       * -2b -1b *  flags    | leading_digits
*                  -4(M)* -4b -3b *  exponent | exponent/3
*
```

```
AFMT.WORK.PD8510                THU, DEC 22, 1983, 10:36 AM     PAGE   3

*          flags: 0:No exponent
*                 1:trailing zero delete ( if in decimal part,Not fixed
*                 2:mantissa value zero
*                 7:Neg input value                               width)
*
*          R0  MSW of value     R8   next char pointer
*          R1  LSW (if needed)
*          R2  exp -- power of ten
*
*          R7  width
*
**************************************************************************
* TO BE DONE
*    improve speed of internal format to ASCII conversions
**************************************************************************
*
*
*                      fmtcode CODING
*    12(M)
*   bit 31  N/U
*   bit 30  output code 0=decimal 1=hex
*   bit 29  fixed width 0=off     1=on (leading spaces,trailing zeros)
*   bit 28  fixed sign  0=Off     1=on (force "+" always)
*
*   bit 27  N/U
*   bit 26  exponent type1          0 normal 0 n/u  1 sci(3's) 1 letter
*   bit 25  exponent type2          0        1      0          1
*   bit 24  forced exp  0=off     1=on
*
*    13(M)
*   bit 23-20 (7-4 of 13(M)):Forced exp in powers of three
*                                      (range +-7 * 3 = +-21 )
*   bit 19-16 (3-0 of 13(M)): Round digit   0= no rounding
*                                           1= round 2ndMSD
*                                       to 15= round LSD
*    14(M)
*   bit 15-8 width: max string width   (range 1-Z7F -- 1 to 127 decimal)
*                                    if 0 use inputted string's [-1] val
*    15(M)
*   bit  7-4 exp offset: the decimal exp is offseted ( range 0 - ZF )
*                          estenially a power of ten scaling
*   bit  3-0 dec_digits: max # of digits to right of decimal point
*                          if fixed width not set and trailing digits
*                             zero, then do not output zero digits
*                          if 0, no decimal point  (range 0-ZF, 0 to 15)
*                                and if forced exp=0 then integer format
*                        in hex/bin modes, number of significant digits
*****
```

```
AFMT.WORK.PD8510                THU, DEC 22, 1983, 10:36 AM     PAGE   4

*EJECT
* FORMAT EXAMPLES
*   fmtcode
*  30000a03         fix width of 10 chars-floating point out
*                            3 decimal digits
*  30050a03         fix width of 10 chars-floating point out
*                            3 decimal digits -- round 6thMSD
*  30000a00         fix width of 10 chars-floating point out
*                            NO decimal digits
*  00000a00         max width of 10 chars-floating point out
*                            NO decimal digits
*  21100a02         fix width of 10 chars- forced exp +3
*                            DDDD.DDE03
*  01100a02         max width of 10 chars- forced exp +3
*                            DDDD.DDE03 -- trailing zeros delete
*  01000A00         MAx width of 10 chars-integer format- no exp
*                            NO decimal digits
*  26000F08         fix width of 15 chars-letter exp (power of 3)
*                            8 decimal digits
*  04000F08         max width of 15 chars- power of 3 exp
*                            8 decimal digits
*  40000908         8 hex digits plus leading space
**************************************************************************
```

```
*EJECT
format_integer EQU *
      EXTS.L R0
format_double EQU *
      LINK   M,#-4
      BTST   #6,12(M)    check output code bit( 0=decimal 1=hex)
      BEQ    fd001
      BSR    check_str_width
      BSR    output_leading_spaces
      BSR    output_hex_chars
      BRA    fdex
*
fd001 JSR    CNV3a       convert double to bcd  -- destorys reg R0-R4?
*
fdecimal EQU *
      BSR    rounding
      BSR    compute_exp_value
      BSR    check_str_width      need to do here to init pointers
      BSR    check_needed_width   will also output leading spaces
      BSR    output_ascii_data
*
fdex  EQU *
fexit MOVE.L 8(M),R9     compute #chars outputted(sub start from finish)
      SUB.L  R9,R8
      MOVE   R8,R0
      SUB.B  #1,R0
      MOVE.B R0,(R9)     move # chars to string length
exit  MOVE.L R9,R0       leave in R0 string address
*
      UNLK   M           unwind procedure call
      MOVE.L (S)+,R8
      ADDQ   =D8,S       remove parameters
      JMP    (R8)
*
*
*
format_quad EQU *
      LINK   M,#-4
      BTST   #6,12(M)    check output code bit( 0=decimal 1=hex)
      BEQ    fq001
      BSR    check_str_width
      BSR    output_leading_spaces
      CMP.B  =D8,R7        if more than 8 digits output MSH digits first
      BLE    fq101
      SUB.B  #8,R7
      BSR    output_hex_chars
      MOVE.B #8,R7
fq101 EXG    R0,R1       move LSH in R0 to outputted
      BSR    output_hex_chars
      BRA    fqex
*
fq001 JSR    CNVRa       convert quad to bcd -- destory reg R0-R4 ?
      BRA    fdecimal
fqex  BRA    fexit
*
*
```

```
format_real EQU *
      LINK   M,#-4
      BTST   #6,12(M)    check output code bit( 0=decimal 1=hex)
      BEQ    fr001
      BSR    check_str_width
      BSR    output_leading_spaces
      BSR    output_hex_chars
      BRA    frex
*
fr001 JSR    CNV2a       convert real to bcd -- destory reg R0-R4,R8?
      BRA    fdecimal
frex  BRA    fexit
*
*
```

```
*EJECT;
* format_3_cnpx converts a USER3 number into a string the consists
* of the REAL,IMAG value. Each of the values are formatted accord to
* the fmt_code inputted. Both results are returned in the single string
* provided and are seperated by a ",".
format_3_cnpx EQU *
      LINK   M,#-4
      BTST   #6,12(M)    check output code bit( 0=decimal 1=hex)
      BEQ    fc001
      BSR    check_str_width
      BSR    output_leading_spaces
      CMP.B  =D4,R7        if more than 4 digits output MSH digits first
      BLE    fq101
      SUB.B  #4,R7
      BSR    output_hex_chars
      MOVE.B #4,R7
      BRA    fq101       move LSH in R0 to outputted.
*
fc001 MOVE.L 8(M),   R8
      MOVE.B -1(R8), R6     max string length
      MOVE.W R6,    -(S)
      SUB.B  #2,     R6     make room for seperator ", "
      ASR.B  #1,     R6     divide by 2 -- two equal substrings
      MOVE.B R6, -1(R8)
      JSR    CNVE1
*     EXG    R0,    R1       it use to do imag then real
      MOVE.L R1,    -(S)    save imag part
*
      MOVE.L 12(M), -(S)    fmt code
      MOVE.L 8(M),  -(S)    alpha ptr
      BSR    format_real    conv real part
*
      MOVE.L (S)+,   R0      get imag part
      MOVE.L 8(M),   R8
      MOVE.B -1(R8), R5      get modified length
      MOVE.B (R8),   R6      # chars so far
      EXTS.W R6
      ADD.W  R6,     R8      adjust ptr to free space
      MOVE.B (R8),   R6
      MOVE.W R6,    -(S)     save last char of first substring
      MOVE.B R5,    (R8)+    set substring max length
*
      MOVE.L 12(M), -(S)     fmt code
      MOVE.L R8   , -(S)    alpha ptr
      BSR    format_real    conv imag part
*
      MOVE.L R0   ,  R8     restore modified ptr
      MOVE.W (S)+,   R6
      MOVE.B R6, -1(R8)     reinsert first substring's last char
      MOVE.B (R8),   R0     save second substring's length
      MOVE.B =',,   (R8)    insert ","
      ADD.B  #1,     R0     add to length for seperator
      MOVE.L 8(M),   R9     retsore orginal alpha ptr
      ADD.B  R0   , (R9)    compute total string length
      MOVE.W (S)+,   R6
      MOVE.B R6, -1(R9)     restore orginal max length
```

```
      BRA    exit
```

```
AFMT.WORK.PD8510             THU, DEC 22, 1983, 10:36 AM     PAGE  9

*EJECT
check_str_width EQU *    limit fmt_code values consistent with str value
      MOVE.L 8(M),R8
      MOVE.B -1(R8),R6   get max string length
      BGT    csw1
      MOVE.B =D1,  R6    limit max string length to a min of 1
csw1  MOVE.B 14(M),R7    move width to R7
      BLE    csw2        if actual length 0 or neg use max string value
      CMP.B  R6,R7       compaire to requested max
      BLE    csw3
csw2  MOVE.B R6,14(M)    set requested value to max
      MOVE.B R6,R7
csw3  CLR.B  (R8)+       clr string length
      AND.B  =HF,15(M)   mask away exp offset ( aready saved if needed )
      MOVE.B 15(M),R6    move digit count into R6 for later use
      RTS
*
*
output_leading_spaces EQU *   output spaces till requested width<=
      BTST   #5,12(M)            R6 which is width of output
      BEQ    ols02       not fixed width format
ols01 CMP.B  R6,R7
      BLE    ols02
      MOVE.B =' ,(R8)+   output a space
      SUB.B  #1,R7       decrement width value
      BRA    ols01
ols02 MOVE.B R6,R7
      RTS
*
*
output_hex_chars EQU *   output hex ascii chars -- data in R0.L
*                        R7 has digit count
och01 CMP.B  =D8,R7
      BLE    och02
      SUB.B  #1,R7        only 8 chars possible therefore padd with '0
      MOVE.B ='0,(R8)+
      BRA    och01
och02 MOVE   =D9,R6
      SUB.B  R7,R6        move first used bits to bits 0-3
      ADD.B  R6,R6
      ADD.B  R6,R6        convert digit shift to bit shift
      ROL.L  R6,R0        shift count is MOD 64
ohc03 MOVE.B R0,R2
      ANDI.B =HF,R2        get 4 bits to convert to ascii
      CMP.B  =D9,R2        0-9 or A-F ?
      BLE    ohc04
      ADD.B  =H7,R2        A-F
ohc04 ADD.B  =H30,R2
      MOVE.B R2,(R8)+
      ROL.L  #4,R0         rotate around next 4 bits
      SUB.B  #1,R7         dec digit count by one
      TST.B   R7           zero? (ie finished)
      BGT     ohc03
      RTS
```

```
AFMT.WORK.PD8510             THU, DEC 22, 1983, 10:36 AM     PAGE  10

*EJECT
*
* rounding will take the 16 bcd digits in R0(MSH)/R1(LSH) and round
* at the specified digit LSD=15,2MSB=1 and 0 means no rounding.
* All the less singficant digits are set to zero, and 5 is added to the
* digit to be round, any carry is then propagated. If the MSD has a
* carry then all the digits are shifted down one digits and MSD=1.
rounding EQU *
     MOVE.B  13(M),R3      get digit placement to round
     AND.W   =HF,  R3
     BEQ     rnd_exit      EQ (0) no rounding
     CLR.L   R4            NE (>0)   round
     CLR.L   R5
     MOVEM.L R0/R1/R4/R5,-(S) move bcd digits and dummy value onto stack
     LEA     8(S), R9      R9  pointer for R0/R1 -- actual value
     LEA     16(S),R10     R10 pointer for R4/R5 -- dummy value
     MOVE.W  =D15, R1
     SUB.W    R3,  R1
     ASR.W   #1,   R1      R1 is byte to be rounded
     MOVE.W  =D7,  R0
     SUB.W    R1,  R0      R0 is bytes to be rounded
     BRA      rnd02
*
rnd01 CLR.B  -(R9)         clear low bytes ( pre rounding)
rnd02 DBRA   R1,rnd01
*
     MOVE    =H00,CCR      clear extend bit
     BTST    #0,   R3
     BNE     rnd04         NE(1) round lower digit of byte
     MOVE.B  =H50,-1(R10)  EQ(0) round upper digit of byte
     ABCD    -(R10),-(R9)  add BCD digits to obtain extend bit
     CLR.B   (R9)          clr upper/lower digit
     BRA     rnd06
rnd04 MOVE.B =H05,-1(R10)  rounding lower digit
     ABCD    -(R10),-(R9)
     AND.B   =HF0,  (R9)   clear lower digit
     BRA     rnd06
*
rnd05 ABCD   -(R10),-(R9)  add BCD digits to zero to propagate carry
     BCC     rnd07         CC(0) progration finished exit
rnd06 DBRA   R0,rnd05      CS(1) continue till no more digits
*
rnd07 MOVEM.L (S)+,R0/R1/R4/R5
     BCC     rnd_exit      CC(0) no carry then exit
     ROXR.L  #1,R0         CS(1) rotate into MSH
     ROXR.L  #1,R1          now rotated 4 bits from R0 into R1
     LSR.L   #1,R0
     ROXR.L  #1,R1
     LSR.L   #1,R0
     ROXR.L  #1,R1
     LSR.L   #1,R0
     ROXR.L  #1,R1
     ADD.B   #1,R2          correct exp for digit rotate
rnd_exit     RTS
```

```
AFMT.WORK.PD8510             THU, DEC 22, 1983, 10:36 AM     PAGE  11

*EJECT
*
* compute_exp_value computes the actual exponent and form to be used
*   uses the exponent of the converted value (in R2.B) and the fmt_code
compute_exp_value EQU *
      MOVE.B 15(M),R3
      AND.B  =HF,15(M)     save only dec digit part
      LSR.B  #4,R3         rotate down exp offset part
      SUB.B  R3,R2         adjust exp by offset
      TST.L  R0
      BNE    cev00         NE(1) input value not zero
      TST.L  R1            continue testing
      BNE    cev00         NE(1) input value not zero
      CLR.B  R2            input zero ==> adjusted exp = 0
      BSET   #10, R2       set mantissa zero flag
*
cev00 MOVE.W R2,-2(M)      save converted value sign/exp
      BTST   #0,12(M)      forced exp ?
      BEQ    cev01         EQ(0) NO
      MOVE.B 13(M),R2      NE(1) yes, use it
      ASR.B  #4,R2         rotate down the force value
      MOVE.B R2,R3
      ASL.B  #1,R3         R3=2*R2
      ADD.B  R3,R2         R2=R2+2*R2  -- quick times 3
      BTST   #2,-2(M)      was mantissa zero --
      BEQ    cev0          NO
      MOVE.B R2,-1(M)      YES -- replace computed exp with forced
cev0  TST.B  R2            is it zero
      BNE    cev01
      BSET   #0,-2(M)      yes -- so no exp part in output
*
cev01 BTST   #2,12(M)      power of three exp?
      BEQ    cev03
      TST.B  R2            yes comp power of 3*SIGN(exp)*MOD(ABS(exp)/3
      BGE    cev02         actually 3*(exp -  (IF exp<0 THEN 2 ELSE 0) )
      SUB.B  #2,R2
cev02 EXTS   R2
      EXTS.L R2
      DIV    =D3,R2
      BTST   #1,12(M)      letter exp ?
      BEQ  . cev23         0=NO
      CMP.W  =D-5,R2       min limit
      BGE    cev21
      MOVE.W =D-5,R2       NO - limit value
      BRA    cev22
cev21 CMP.W  =D4,R2        max limit
      BLE    cev22
      MOVE.W =D4,R2        NO - limit value
cev22 MOVE.B R2,-3(M)      save power of 3 exp for indexing of exp lette
cev23 MOVE.B R2,R3
      ASL.B  #1,R3         R3=2*R2
      ADD.B  R3,R2         R2=R2+2*R2  -- quick times 3
*
cev03 MOVE.B R2,-4(M)      save actual exp
      SUB.B  -1(M),R2      -(leading digits)=new exp - old exp - 1
      SUB.B  #1,R2         NOTE: leading digits>0 digits to left of "."
```

```
AFMT.WORK.PD8510             THU, DEC 22, 1983, 10:36 AM     PAGE  12

      CMP.B  15(M),R2          leading digits<=0 digits to right of"."
      BLT    cev04         limit neg value to fmt_code limit
      MOVE.B 15(M),R2
cev04 NEG.B  R2
      MOVE.B R2,-1(M)      save leading_digit count
      RTS
```

```
*EJECT
*
* check_needed_width computes needed width for ascii output and checks
*    that versus max available (from fmt_code). If OK outputs leadings
*    spaces and continues -- IF NOT OK outputs "????" and exits format
check_needed_width EQU *
      CLR    R6              R6 will hold needed width
      BTST   #4,12(M)        fixed sign space?
      BNE    cnw01
      BTST   #7,-2(M)        OR inputted value neg
      BEQ    cnw02
cnw01 ADD.B  #1,R6
*
cnw02 TST.B  -1(M)           positive leading digits
      BGT    cnw03
      ADD.B  #1,R6           NO
      BRA    cnw04
cnw03 ADD.B  -1(M),R6        Yes
*
cnw04 TST.B  15(M)           positive decimal digits?
      BLE    cnw05
      ADD.B  #1,R6           Yes, and donot forget decimal point
      ADD.B  15(M),R6
*
cnw05 BTST   #0,-2(M)        test no_exp_flag
      BNE    cnw08
      BTST   #1,12(M)        letter exp?
      BEQ    cnw06
      ADD.B  #2,R6           yes
      BRA    cnw08
cnw06 ADD.B  =03,R6          no- normal exp
      BTST   #4,12(M)        fixed sign (for exp)
      BNE    cnw07
      TST.B  -4(M)           OR neg value exp
      BGE    cnw08
cnw07 ADD.B  #1,R6           yes - inc counter
*
cnw08 MOVE.B 14(M),R7        get max available space from fmt_code
      CMP.B  R6,R7           R6 too big?
      BGE    output_leading_spaces  NO
*
      SUB.B  #1,R7
      EXTS   R7
cnw09 MOVE.B ='?,(R8)+       fill output with "?"
      DBRA   R7,cnw09
      ADD.L  =04,S           delete subroutine return address
      BRA    fexit
```

```
*EJECT
*
*  output_ascii_data outputs the converted value as speced in fmt_code
output_ascii_data EQU *
      BCLR   #1,-2(M)        clr trailing zero flag
      BTST   #7,-2(M)        input value neg?
      BEQ    oad01
      MOVE.B ='-,(R8)+       yes
      BRA    oad02
oad01 BTST   #4,12(M)        fixed sign format
      BEQ    oad02
      MOVE.B =' ,(R8)+       output space
*
oad02 MOVE.B -1(M),R6
      EXTS   R6
      BGT    oad06           leading_digits neg?
      MOVE.B ='0,(R8)+       YES
      NEG    R6              negate leading_digit
      MOVE.B 15(M),R7
      EXTS   R7
      BLE    exp_out         decimal_digits count>0
      MOVE.B ='.,(R8)+       yes - output decimal point
      BRA    oad04
oad03 MOVE.B ='0,(R8)+       zero fill loop
      SUB    #1,R7           dec decimal_digits counter
oad04 DBRA   R6,oad03
      BTST   #5,12(M)
      BNE    oad05           NE(1) fixed width, leave trail zero clear
      BSET   #1,-2(M)        EQ(0) not fixed width, set trail zero flag
oad05 BSR    output_number   output R7 numbers
      BRA    exp_out
*
oad06 MOVE   R6,R7
      BSR    output_number   output R7 (leading_digit) numbers
      MOVE.B 15(M),R7
      EXTS   R7
      BLE    exp_out         decimal_digits count > 0
      MOVE.B ='.,(R8)+       yes  -- decimal point
      BTST   #5,12(M)
      BNE    oad07           NE(1) fixed width, leave trail zero clear
      BSET.  #1,-2(M)        EQ(0) not fixed width, set trail zero flag
oad07 BSR    output_number   output R7 (decimal_digits) numbers
*
exp_out EQU *
      BTST   #1,12(M)        letter exp?
      BEQ    eo001
      MOVE.B =' ,(R8)+       yes output space
      BTST   #0,-2(M)        no_exp_flag
      BNE    exp_ex
      MOVE.B -3(M),R2        get exp value  -- range check done earlier
      BEQ    exp_ex          if zero no letter
      EXTS   R2
      LEA    exp_letter,R9
      MOVE.B 5(R9,R2),(R8)+  get letter
      BRA    exp_ex
*
```

```
eo001 BTST   #0,-2(M)        no_exp_flag
      BNE    exp_ex
      MOVE.B ='E,(R8)+       output "E"
      MOVE.B -4(M),R0        get exp value
      EXTS   R0
      BGE    eo002
      MOVE.B ='-,(R8)+       output minus
      NEG    R0
      BRA    eo003
eo002 BTST   #4,12(M)        fixed output sign for exp?
      BEQ    eo003
      MOVE.B ='+,(R8)+       output plus sign
*
eo003 JSR    bcd_of_int      convert exp to bcd    ???? save R8 ?????
      MOVE.B R0,R1           copy exp digits
      ASR    #4,R0           get 1st digit
      AND    =HF,R0
      BNE    eo004           first exp zero  ?
      BTST   #5,12(M)        fixed width output?
      BEQ    eo005           no - skip first zero exp
eo004 OR     =H30,R0
      MOVE.B R0,(R8)+        output 1st exp digit
eo005 AND    =HF,R1
      OR     =H30,R1
      MOVE.B R1,(R8)+        output 2nd exp digit
exp_ex EQU *
      RTS
*
*
*
*output_number outputs to string R7 ascii chars from R0/R1 (a BCD number
*    It does a multi reg 4 bits shift, shifting out desire number,
*       shifting in zeros.  Terminates if only zeros to output and
*        trailing zeros flag is set.
output_number BRA on002
on001 ROL.L  #4,R1
      ROL.L  #4,R0           shift r0,r1
      MOVE   R0,R2           get value to output
      AND    =HF,R2          mask four bits needed
      OR     =H30,R2         convert ascii
      MOVE.B R2,(R8)+        output
      MOVE   R1,R2           get value to be carried up to R0
      AND    =HF,R2          again mask four bits needed
      AND.L  =HFFFFFFF0,R0
      AND.L  =HFFFFFFF0,R1
      OR.B   R2,R0           move bit shift out of R1 into R0
      BTST   #1,-2(M)
      BEQ    on002           EQ(0) trailing zero flag false
      TST.L  R0              NE(1) exit if R0,R1 all zeros
      BNE    on002           NE(1) R0≠0, continue outputing
      TST.L  R1              EQ(0) R0=0, test R1
      BEQ    on003           EQ(0) both R0/R1 zero exit
on002 DBRA   R7,on001        NE(1) more sinficant data, loop
on003 RTS
```

```
*EJECT
*
*   PROCEDURE CNV3a(x); VALUE x; DOUBLE x;
*
*  Converts a Double (32 bit)  number (internal representation) to
*       -- a positive bcd (ready for ascii) integer value in R0.L
*       -- a mant sign bit (R2 bit 15)
*          A 2's comp binary code power of ten exp value in R2 (Bits 0-7)
*  The converted value is left justified  in R0 and there are
*     Max 8  significant digits
*         If Double is too large for 8 than Quad routine is used
*
*
*  IF input < 0 THEN set mant flag
* check if greater than 8 digits -- if so use QUAD routine
* convert input to BCD
* shift BCD value TILL MSD(most sign digit) is nonzero
*        and adjust exponent value so that decimal point is after MSD
* Return sign flag and exp in R2
* Return converted value in R0, R1 not used
*
CNV3a CLR    -(S)    allocate space for sign/exp temp
      TST.L  R0
      BGE    CNV3     neg input ?
      NEG.L  R0
      BSET   #7,(S)  set neg mant flag
CNV3  CMP.L DIG8,R0
      BGE cnv3A     too big for 8 digits
      BSR    CNV37
      MOVEQ  #7,exp   initialize exp counter
      MOVE.L =HF0000000,R4    mask for testing msd
      TST.L  R0       zero input ?
      BNE    C3001       nonzero
      CLR    exp
      BRA    CNV3ex
C3002 SUBQ   #1,exp     decrement loop counter
      ASL.L  #4,R0   shift legt one bcd digit
C3001 MOVE.L R4,R3 reset MSD mask
      AND.L  R0,R3     mask MSD
      BEQ    C3002    Is MSD ZERO?
CNV3ex OR    (S)+,exp   Or in mant neg flag in exp word
      CLR.L  R1      double result does not require R1
      RTS
*
*
*    BINARY TO BCD (LATER ASCII) CONVERTOR
*       CONVERT BINARY TO 8 DIGITS
*    INPUT/OUTPUT R0     positive values only
*
*
*
bcd_of_int:CNV46:CNV47  EXTS.L  R0
CNV37 TST.L  R0   CHECK SIGN               ***TRY TO LIMIT TO POSTIVE?
      BNE    C3710        convert if not zero
      RTS              exit if zero
```

```
AFMT.WORK.PD8510               THU, DEC 22, 1983, 10:36 AM    PAGE  17

*EJECT
*
*   PROCEDURE CNVRa(x); VALUE x;  QUAD x;
*
*  Converts a Quad (64 bit)  number (internal representation) to
*       -- a positive bcd (ready for ascii) integer value in RO/R1.L
*       -- a mant sign bit (R2 bit 15)
*       A 2's comp binary code power of ten exp value in R2 (Bits 0-7)
*  The converted value is left justified  in RO and there are
*     Max 16 significant digits
*
*
CNVRa CLR    -(S)       Allocate sign flag
      TST.L  msh
      BGE    testA      Is input value negate
      NEG.L  lsh        NEGATE QUAD VALUE
      NEGX.L msh
      BSET   #7,(S)     set neg flag
testA TST.L  msh        test if upper half is zero
      BNE    CNVA       No
      TST.L  lsh
      BLT    CNVA       will not fit in a double
      EXG    lsh,msh    move lower half to msh
      BRA    CNV3       use simpler double conversion routine
*
cnv3A CLR.L R1          entry point for when double to bcd >8 digits
      EXG    RO,R1
*
CNVA  BSR    CNVA8
      MOVE   =D15,exp  initialize exp counter
      MOVE.L =HF0000000,R4  MASk for testing MSD
      CLR.L  R3         CLR digit mask -- used in multi reg block shifit
      BRA    CA001
CA002 SUBQ   #1,exp     decrement exp counter
      ASL.L  #4,R3
      OR     =HF,R3     create Digit mask for multi reg rotate later
      ASL.L  #4,msh     rotate MSH
      ROL.L  #4,lsh     ROTATE LSH
CA001 MOVE.L R4,R5      load msd test mask
      AND.L  msh,R5     mask MSD
      BEQ    CA002      Zero continue shift
      MOVE.L R3,R4      Copy digit mask
      AND.L  lsh,R4     RO=RO+r1*mask
      OR.L   R4,RO
      NOT.L  R3         not mask
      AND.L  R3,R1      R1=R1* NOT mask
*
      OR     (S)+,exp
      RTS
```

```
AFMT.WORK.PD8510               THU, DEC 22, 1983, 10:36 AM    PAGE  18

*EJECT
*
*
*
*    QUAD TO BCDL VERSION
*       16 DIGITS
*      INPUT/OUTPUT RO/R1         positive values only
*
*
*
CNVA8 MOVE.L RO,R2
      MOVE.L R1,R3
      CMP.L  DIG16,R2
      BHI    MY825
      BNE    MY850     NO DIVIDE NECESSARY
      CMP.L  DIG16+4,R3
      BCS    MY850     SKIP ON LOGICAL LESS THAN
MY825 MOVE.L =H99999999,RO
      MOVE.L RO,R1
      BRA    CNVAex
MY836 MOVEM.L R2-R3,-(S) SAVE REGS
      CLR    -(S)          SIGN FOR DIV3L
      MOVEQ  #32,R3        BIT COUNT FOR DIV3L
      MOVE.L R1,R2
      EXG    RO,R2
      MOVE.L DIG8,R1
      JMP    DIV3L
MY837 BSR    C3710      CONVERT TO BCD
MY840 EXG    RO,R1
      BSR    C3710      CONVERT TO BCD
      EXG    RO,R1
MY850 EXG    RO,R2
      EXG    R1,R3      NOW DO LSH OF PRODUCT
      TST.L  RO         SEE IF DIVIDE NECESSARY
      BNE    MY855
      CMP.L  DIG8,R1
      BCS    MY860      SKIP IF NO DIVIDE NECESSARY
MY855 BSR    MY836        GO DIVIDE BY 10^8
MY857 BSR    C3710      CONVERT TO BCD
MY860 EXG    RO,R1
      BSR    C3710
      EXG    RO,R1
CNVAex RTS
DIG16 HEX    23,86F2,6FC1,0     10^16 IN QUAD BINARY
DIG8  DEF.L  100000000
```

```
AFMT.WORK.PD8510               THU, DEC 22, 1983, 10:36 AM    PAGE  19

*EJECT
*
*   PROCEDURE CNV2a(R); VALUE R; REAL R;
*
*  Converts a real number (internal representation) to
*       -- a positive bcd (ready for ascii) integer value in RO.L
*       -- a mant sign bit (R2 bit 15)
*       A 2's comp binary code power of ten exp value in R2 (Bits 0-7)
*  The converted value is left justified  in RO and there are
*     7 significant digits
*
*
* IF input value<O THEN set mant flag, and negate input
* Convert exp to nearest power of ten,
*    and normalize mantissa to a value between 1.0 to 10.0
*THEN convert to a double between 1,000,000 to 9,999,999
*Convert double to BCD
*If exp <O THEN set exp flag and negate exp
*Combine exp and sign flags
*
CNV2a CLR    -(S)  allocate space for sign info
      TST.L  RO
      BGE    SGN
      BSET   #7,(S) set mant neg
      JSR    NEG2
SGN   MOVE.L RO,-(S)     SAVE R
      EXTS   RO
      SUBQ   #1,RO
      MPY    =D1000,RO      try simpler appoarch
      DIV    =D3322,RO      ?(RO+RO+RO)/10  -- exact not needed?
      MOVE   RO,-(S)
      NEG    RO
      JSR    TENI
      MOVE.L 2(S),R1      FETCH R
      JSR    MPY2
      MOVE.L RO,2(S)      SAVE  R
      MOVE.L =D1000000,R2
      MOVE.L =F10,R1
      JSR    CMP2
      BLT    DIG
      ADDQ   #1,(S)
      MOVE.L =D100000,R2
      BRA    DIG01
DIG:  MOVE.L 2(S),RO
      MOVE.L =F1,R1
      JSR    CMP2
      BGE    DIG01
      SUBQ   #1,(S)
      MOVE.L =D10000000,R2
DIG01 MOVE.L R2,R1
      MOVE.L 2(S),RO
      MOVE.B RO,R2
      CLR.B  RO
      JSR    MPY3L
      EXTS   R2
      BPL    DIG02
```

```
AFMT.WORK.PD8510               THU, DEC 22, 1983, 10:36 AM    PAGE  20

      NOT    R2
      BEQ    DIG12
      ASR.L  R2,RO
      BCS    DIG03
      BRA    DIG04
DIG02 LSL.L  #1,R1
      ROXL.L #1,RO
      SUBQ   #1,R2
      BGE    DIG02
DIG12 TST.L  R1
      BPL    DIG04
DIG03 ADDQ.L #1,RO
DIG04 BSR    CNV37
      ROL.L  #4,RO
      MOVE   (S),R2 place exp in R2
      TST.L  RO           test if zero
      BNE    dx1
      CLR    R2
      BRA    dx2
dx1   AND    =HOFF,R2   cnv exp to byte item
dx2   OR     6(S),R2    add binary exp value with sign flag
      CLR.L  R1         clr R1 to zero
DIGX: ADDQ.L #8,S     DELETE EXPONENT/temp copy of real/sign flags
      MOVE.L (S)+,R8 FETCH RETURN ADDRESS
      JMP    (R8)     RETURN TO CALLER
```

```
AFNT.WORK.PD8510                    THU, DEC 22, 1983, 10:36 AM     PAGE  21

*EJECT
*
*       BASIC BINARY TO BCD CONVERTER
*          YIELDS A 8 DIGIT RESULT FOR A POSTIVE INTEGER INPUT
*            INPUT RANGE 0-99999999 (0 - Hex5F5E0FF)
*       INPUT/OUTPUT VIA R0  -- NO LIMIT CHECKING
*
*       A TWO PASS OPERATION CONVERING 4 DIGITS AT TIME
*       WILL SKIP THE FIRST PASS IF NOT NEEDED
*
*
*      4 DIGITS = 15.25-45.5 uS
*      8 DIGITS = 48.5-109 uS
*
C3710 CMP.L  =D10000,R0    MSH=0?
      BMI    C3750        YES
      DIVU   =D10000,R0    SPLIT INTO WORDS
      BSR    C3750
      SWAP   R0           GET LEAST SIGNIFICANT HALF
C3750 CMP   =D1000,R0      1000   CONVERT WORD TO BCD
      BLT   HDIG
      CMP   =D6000,R0      6000
      BLT   C3780
      CMP   =D8000,R0      8000
      BLT   C3760
      CMP   =D9000,R0      9000
      BLT   C3770
      ADD   =D27864,R0
      BRA   HDIG
C3760 CMP   =D7000,R0      7000
      BLT   C3765
      ADD   =D21672,R0
      BRA   HDIG
C3765 ADD   =D18576,R0
      BRA   HDIG
C3770 ADD   =D24768,R0
      BRA   HDIG
C3780 CMP   =D3000,R0      3000
      BLT   C3790
      CMP   =D4000,R0      4000
      BLT   C3785
      CMP   =D5000,R0      5000
      BLT   C3788
      ADD   =D15480,R0
      BRA   HDIG
C3785 ADD   =D9288,R0
      BRA   HDIG
C3788 ADD   =D12384,R0
      BRA   HDIG
C3790 CMP   =D2000,R0      2000
      BLT   HDIGP
      ADD   =D3096,R0
HDIGP ADD   =D3096,R0
HDIG  ROL   #4,R0
      CMP   =D1600,R0       100
      BLT   TDIG
```

```
AFNT.WORK.PD8510                    THU, DEC 22, 1983, 10:36 AM     PAGE  22

      CMP   =D9600,R0      600
      BLT   D3780
      CMP   =D12800,R0     800
      BLT   D3760
      CMP   =D14400,R0     900
      BLT   D3770
      ADD   =D22464,R0
      BRA   TDIG
D3760 CMP   =D11200,R0     700
      BLT   D3765
      ADD   =D17472,R0
      BRA   TDIG
D3765 ADD   =D14976,R0
      BRA   TDIG
D3770 ADD   =D19968,R0
      BRA   TDIG
D3780 CMP   =D4800,R0      300
      BLT   D3790
      CMP   =D6400,R0      400
      BLT   D3785
      CMP   =D8000,R0      500
      BLT   D3788
      ADD   =D12480,R0
      BRA   TDIG
D3785 ADD   =D7488,R0
      BRA   TDIG
D3788 ADD   =D9984,R0
      BRA   TDIG
D3790 CMP   =D3200,R0      200
      BLT   TDIGP
      ADD   =D2496,R0
TDIGP ADD   =D2496,R0
TDIG  ROR   #4,R0
TDIGA CMP.B =D10,R0      10
      BLT   LDIG
      CMP.B =D60,R0      60
      BLT   E3780
      CMP.B =D80,R0      80
      BLT   E3760
      CMP.B =D90,R0      90
      BLT   E3770
      ADD   =D54,R0
      RTS
E3770 ADD   =D48,R0
      RTS
E3760 CMP.B =D70,R0      70
      BLT   E3765
      ADD   =D42,R0
      RTS
E3765 ADD   =D36,R0
      RTS
E3780 CMP.B =D30,R0      30
      BLT   E3790
      CMP.B =D40,R0      40
      BLT   E3785
      CMP.B =D50,R0      50
```

```
AFNT.WORK.PD8510                    THU, DEC 22, 1983, 10:36 AM     PAGE  23

      BLT   E3788
      ADD   =D30,R0
      RTS
E3785 ADD   =D18,R0
      RTS
E3788 ADD   =D24,R0
      RTS
E3790 CMP.B =D20,R0      20
      BLT   LDIGP
      ADD   =D6,R0
LDIGP ADD   =D6,R0
LDIG  RTS
*
```

```
AFNT.WORK.PD8510                    THU, DEC 22, 1983, 10:36 AM     PAGE  24

*EJECT
***********************************************************************
* int_of_bcd
*
* Converts a postive 4 digit BCD value ( 0-9999 ) to binary integer
*
* NO ERROR or LIMIT CHECKING !!!!!!!
*
* calling protocol:
*      INTEGER PROCEDURE int_of_bcd(I): VALUE I: INTEGER I: EXTERNAL:
*     ........... j:=int_of_bcd(k):
*
*
* method: The passing parameter is a integer type but with BCD coding
*           of 4 digits.  |D3|D2|D1|D0|
*         result is D0+10*(D1+10*(D2+10*D3)) (starting with D3)
*
***********************************************************************
*int_of_bcd: CLR.L  R1
*       EXG    R0,R1
*       SWAP   R1
*       BSR    X10
*       BSR    X10
*       BSR    X10
*       BSR    X10
* .     RTS
*
*X10:   MPY    =D10            MPY *10 the present binary result and add
*       ROL.L  #4,R1           in next BCD digit
*       ADD    R1,R0
*       CLR.B  R1
*       RTS
       END
```

```
FFMT.WORK.PD8510              THU, DEC 22, 1983, 10:36 AM     PAGE   1

     ALPHA PROCEDURE format_integer(value,str,fmtcode);
                         VALUE value,str,fmtcode;
                         INTEGER value; ALPHA str; DOUBLE fmtcode;EXTERNAL;
     ALPHA PROCEDURE format_double(value,str,fmtcode);
                         VALUE value,str,fmtcode;
                         DOUBLE value; ALPHA str; DOUBLE fmtcode; EXTERNAL;
     ALPHA PROCEDURE format_quad(value,str,fmtcode);
                         VALUE value,str,fmtcode;
                         QUAD value; ALPHA str; DOUBLE fmtcode; EXTERNAL;
     ALPHA PROCEDURE format_real(value,str,fmtcode);
                         VALUE value,str,fmtcode;
                         REAL value; ALPHA str; DOUBLE fmtcode; EXTERNAL;
     ALPHA PROCEDURE format_3_cmpx(value,str,fmtcode);
                         VALUE value,str,fmtcode;
                         USER3 value; ALPHA str; DOUBLE fmtcode;EXTERNAL;
```

```
FFORMAT.WORK.PD8510           THU, DEC 22, 1983, 10:36 AM     PAGE   1

COMMENT
  This is a software generated file !!!
  Changes must be made in SKINFO.WORK
  Run GENSK.LANI to re-generate file;

SUBROUTINE proc6;  ENTRY;
BEGIN

CASE command_token-122 OF
BEGIN
& 122 &
new_format( fmt_swr );
& 123 &
new_format( fmt_linear_mag );
& 124 &
new_format( fmt_linear_polar );
& 125 &
new_format( fmt_log_polar );
& 126 &
new_format( fmt_imag_vs_real );
& 127 &
new_format( fmt_y_smith );
& 128 &
new_format( fmt_imaginary );
& 129 &
new_format( fmt_real );
END;
END proc6;
```

```
CFORMAT.WORK.PD8510           THU, DEC 22, 1983, 10:36 AM     PAGE   1

INTEGER CONSTANT

cmd_swr := 122,
cmd_linear_mag := 123,
cmd_linear_polar := 124,
cmd_log_polar := 125,
cmd_imag_vs_real := 126,
cmd_y_smith := 127,
cmd_imaginary := 128,
cmd_real := 129,
cmd_group6 := 0;
```

```
SFORMAT.WORK.PD8510           THU, DEC 22, 1983, 10:36 AM     PAGE   1

M68KL,P,"format"
BEGIN

@FILE futil3.work;                               & for warn & & DEBUG &
#FILE cmessag0.work;         & for command_not_implemented & & DEBUG &
#FILE cformat.work;
#FILE factive.work;
@FILE fannot.work;
#FILE ccontvar.work;                             & for max_parameter &
#FILE ftrace.work;
#FILE fgratic.work;
@FILE fdatap.work;
#FILE cchtable.work;
#FILE fchtable.work;
#FILE fpfr.work;
#FILE fchpfr.work;
#FILE fscreen.work;
#FILE fmenu.work;
#FILE fcommand.work;                                 & command_token &
#FILE crins.work;                      & for processing_variables &
#FILE fkernel.work;                         & for acquire_release &

ALPHA TABLE format_annotation :=    & must correspond to cdatap values &
   "",                 & not used              &
   "log MAG",          & fmt_log_mag           &
   "LINEAR",           & fmt_linear_mag        &
   angle_char,         & fmt_phase             &
   "-"+delta_char+phi_char+'/'+delta_char+omega_char,
                       & fmt_delay             &
   "Re",               & fmt_real              &
   "Im",               & fmt_imaginary         &
   "",                 & fmt_log_polar         &
   "",                 & fmt_linear_polar      &
   "",                 & fmt_imag_vs_real      &
   "Z",                & fmt_z_smith           &
   "Y",                & fmt_y_smith           &
   "SWR";              & fmt_swr               &

INTEGER TABLE format_hilight :=
      0,                  & 0  not used          &
      0,                  & 1  fmt_log_mag - a "hard" key &
      cmd_linear_mag,     & 2  fmt_linear_mag    &
      0,                  & 3  fmt_phase   - a "hard" key &
      0,                  & 4  fmt_delay   - a "hard" key &
      cmd_real,           & 5  fmt_real          &
      cmd_imaginary,      & 6  fmt_imaginary     &
      cmd_log_polar,      & 7  fmt_log_polar     &
      cmd_linear_polar,   & 8  fmt_linear_polar  &
      cmd_imag_vs_real,   & 9  fmt_imag_vs_real  &
      0,                  & 10 fmt_z_smith - a "hard" key &
      cmd_y_smith,        & 11 fmt_y_smith       &
      cmd_swr;            & 12 fmt_swr           &
```

```
SFORMAT.WORK.PD8510              THU, DEC 22, 1983, 10:36 AM      PAGE   2

#EJECT;
COMMENT                                                      annotate_format
*******************************************************************************
*
*******************************************************************************
;
PROCEDURE  annotate_format;                        W                  ENTRY;
   BEGIN & annotate_format &
      INTEGER format_display,
              format;

      IF current_entry_ch = 1 THEN
         format_display := format1_display
      ELSE & current_entry_ch = 2 &
         format_display := format2_display;
      format := entry_ch_integer(ch_format);
      print_string( format_annotation[format],
                    format_size,
                    format_display
                  );
      hilight_key( format_hilight[format], cmd_sur, cmd_real );

   END;  & annotate_format &
```

```
SFORMAT.WORK.PD8510              THU, DEC 22, 1983, 10:36 AM      PAGE   3

#EJECT;
COMMENT                                                   new_format_partial
*******************************************************************************
*
*******************************************************************************
;
PROCEDURE  new_format_partial;                                        ENTRY;
   BEGIN & new_format_partial &

      & update any active function annotation &
      select_active_function( active_previous );
      annotate_format;
      annotate_ref_value;
      annotate_scale;

      & update the display &
      partial_trace_and_graticule;
      partial( update_d );

   END;  & new_format_partial &


PROCEDURE  new_format( format_type );
   VALUE   format_type;
   INTEGER format_type;                                               ENTRY;
   BEGIN & new_format &
      INTEGER d,
              p;

      acquire( processing_variables );   & to assure no datap conflict &
      d := entry_ch_integer(ch_domain);
      p := entry_ch_integer(ch_param);
      format[ d, p, current_entry_ch ] := format_type;
      recall_pfr;                & also stores format_type into ch_table &

      new_format_partial;

      release( processing_variables );

   END;  & new_format &

#FILE fformat.work;

END$
```

```
AFSTMATH.WORK.PD8510             THU, DEC 22, 1983, 10:36 AM      PAGE   1

ASMB,R
 NAM fstmath,7,"JTB,LANI. PD8510    9/2/82"
*
R0  REG 0
R1  REG 1
R2  REG 2
R3  REG 3
R4  REG 4
R8  REG 8
R9  REG 9
R10 REG 10
S   REG 15
*
 ENT fst_trig,fst_trig_long,fst_sqrt
 EXT sine_cos,sqrt_tbl     & look up tables &
 EXT MOSFR
*
fst_trig_long EQU *            ENTRY FOR 32 BITS/CYCLE
   SWAP R0
   ROL.L #2, R0
fst_trig EQU *
   MOVE =LMOSFR, R9    ENTRY FOR 18 BITS/CYCLE
   MOVE.L R0, R1
   ROR.L #6, R1
   AND =H0FFC, R1          index for 1024pt table
   LEA sine_cos.L, R10
   ADD R1, R10
   LSL #7, R0
   AND =H7F80, R0
   MOVE.L (R10)+, (R9)+    start interpolation  -- first table value
   MOVE.L (R10),  (R9)+                            second table value
   MOVE R0, (R9)+                                  delta
   NEG R0
   ADD =H8000, R0
   MOVE R0, (R9)+                                  1-delta
   BMI FSC1                input value exact at first table value
   MOVE.L (R9)+, R0
   RTS
FSC1: MOVE.L -4(R10), R0
   MOVE.L (R9)+, R9    DUMMY READ
   RTS
*
* REAL PROCEDURE fst_sqrt(N) --- 16-bit precision using table look-up
*           occupies 153 words: 56-word program, 97-word table
*           execution time = 52 usec (worst case)
*
fst_sqrt EQU *
      MOVEM.L R1-R4/R8,-(S)  SAVE REGISTERS
      MOVE.B R0,R2          Put exponent in R2
      CLR    R0             Use 16-bit mantissa and
      SWAP   R0             put it in lower word of register
      TST    R0             Do not compute SQRT(n) where N <= 0
      BLE    ERR
      EXTS   R2             Make exp. word size for possible byte overflow
      BTST   #0,R2
```

```
AFSTMATH.WORK.PD8510             THU, DEC 22, 1983, 10:36 AM      PAGE   2

      BEQ    SQEXP         If exponent is odd then
      ADDQ   #1,R0           round up bit about to be shifted, if any
      BVC    SQOK            if it overflows on rounding then
      MOVE   =H7FFF,R0       set value back to highest positive value
SQOK  ASR    #1,R0           mantissa/2
      ADDQ   #1,R2           increment exponent to make it even
SQEXP ASR    #1,R2         SQRT(exponent) = exponent/2
*
* Take square root of mantissa
*
      LEA      sqrt_tbl.L,R8    Address of lookup table (offset by 64)
*                                Table from 0.25 to 1, 0.25 = bit 7 = 62
      MOVE     R0,R1        Copy mantissa
      ANDI     =HFF00,R1    Xi in MSByte
      SUB      R1,R0        X-Xi = dX in LSBs, ie: 00XX
      ASR      #7,R1        Get even word addressing
      MOVE     0(R8,R1),R3 Yi
      MOVE     2(R8,R1),R4 Y(i+1)
      CMPI     =HFE,R1      Y(i+1) = 1 ?
      BEQ      NOSUB
      SUB      R3,R4        Y(i+1)-Y(i) <= 10 bits
NOSUB MULU     R4,R0        (Y(i+1)-Y(i))dX <= 18 bits
      ASL.L    #8,R0        SQRT(Y)*128
      SWAP     R0           dY
      ADD      R3,R0        Y := Y(i) + dY (fraction part)
      ADDQ     #2,R0        Round bit about to be shifted out, if any
      LSR      #2,R0        Shift in positive sign bit
      BSET     #14,R0       Set assumed significant bit
      SWAP     R0           Put 16-bit mantissa in upper word
      CLR      R0
ANS   MOVE.B   R2,R0        Combine mantissa & exponent
      MOVEM.L  (S)+,R1-R4/R8  RESTORE REGISTERS
      RTS
*
ERR   CLR.L    R0           Set result to 0 for N<=0
      MOVEQ.B  =H80,R2      Exp for 0 (or very small number) = -128
      BRA      ANS
*
*******************************************************************************
*  ( external )
* LOOKUP TABLE --- contains 17-bit square root values from .25 to 1     *
* which have been rounded up from a 24-bit value.  There is an assumed *
* positive sign bit (0) and a significant bit (1) which accounts for   *
* the 17th bit per 16-bit entry.                                       *
* Asterisks indicate values which have been rounded up by 1 bit.       *
*******************************************************************************
*
   END
```

```
CGRATIC.WORK.PD8510              THU, DEC 22, 1983, 10:36 AM      PAGE   1

INTEGER CONSTANT  min_x          :=  0,           & grat_specs indices &
                  max_x          :=  1,
                  min_y          :=  2,
                  max_y          :=  3,
                  grat_x         :=  4,
                  grat_y         :=  5,
                  div_x          :=  6,
                  div_y          :=  7,
                  grat_type      :=  8,
                  max_grat_index :=  8,           & value of last entry &
                  grat_specs_size:=  max_grat_index + 1;

INTEGER CONSTANT  rectangular    :=  0, & for graticule_type,grat_specs&
                  polar          :=  1,           & for graticule_type &
                  bullseye       :=  1,              & for grat_specs &
                  smith          :=  2,              & for grat_specs &
                  no_graticule   :=  -1;          & for graticule_type &
```

```
SGRATIC.WORK.PD8510              THU, DEC 22, 1983, 10:36 AM      PAGE   1

M68KL,P,"graticule"
BEGIN

#FILE cchtable.work;
#FILE fchtable.work;
#FILE fchtab2.work;
#FILE fchdata.work;
#FILE fscreen.work;
#FILE cdisplay.work;
#FILE fdisplay.work;
#FILE fcircle.work;
#FILE cgratic.work;
#FILE cgratic2.work;                    & constants for grat_specs_table &
#FILE fcontvar.work;
#FILE ftrace.work;
#FILE fmarker.work;
#FILE ffifo.work;
#FILE ffifos.work;
#FILE cdatap.work;                           & for acquire and release &
#FILE fkernel.work;                        & for processing_variables &
#FILE crins.work;

EXTERNAL REAL CONSTANT TwoPi;


GLOBAL BYTE TABLE type_of_grat :=                    & indexed by format &
   & not used            0 & no_graticule,
   & fmt_log_mag         1 &  rectangular,
   & fmt_linear_mag      2 &  rectangular,
   & fmt_phase           3 &  rectangular,
   & fmt_delay           4 &  rectangular,
   & fmt_real            5 &  rectangular,
   & fmt_imaginary       6 &  rectangular,
   & fmt_log_polar       7 &     bullseye,
   & fmt_linear_polar    8 &     bullseye,
   & fmt_imag_vs_real    9 &     bullseye,
   & fmt_z_smith        10 &        smith,
   & fmt_y_smith        11 &        smith,
   & fmt_vswr           12 &  rectangular;

INTEGER TABLE grat_specs_table :=
   & rect_normal  min_x   &                 x0_min,  & 0 &
   &              max_x   &                 x0_max,
   &              min_y   &                 y0_min,
   &              max_y   &                 y0_max,
   &              grat_x  &                  xgrat,
   &              grat_y  &                  ygrat,
   &              div_x   &                    div,
   &              div_y   &                    div,
   &            grat_type &            rectangular,
   & rect/split_1 min_x   &                 x1_min,  & 18 &
   &              max_x   &                 x1_max,
   &              min_y   &                 y1_min,
   &              max_y   &                 y1_max,
```

```
FGRATIC.WORK.PD8510              THU, DEC 22, 1983, 10:36 AM      PAGE   1

#FILE cgratic.work;

EXTERNAL INTEGER POINTER
   grat1_specs,
   grat2_specs;
EXTERNAL BYTE TABLE type_of_grat;

INTEGER PROCEDURE graticule_type( ch );
   VALUE   ch;
   INTEGER ch;                                                 EXTERNAL.L;
PROCEDURE  partial_trace_and_graticule;                        EXTERNAL.L;
SUBROUTINE trace_and_graticule;                                EXTERNAL.L;
```

```
SGRATIC.WORK.PD8510              THU, DEC 22, 1983, 10:36 AM      PAGE   2

   &              grat_x    &                x1_grat,
   &              grat_y    &                y1_grat,
   &              div_x     &               half_div,
   &              div_y     &               half_div,
   &            grat_type   &            rectangular,
   & rect/split_2 min_x     &                 x2_min,  & 36 &
   &              max_x     &                 x2_max,
   &              min_y     &                 y2_min,
   &              max_y     &                 y2_max,
   &              grat_x    &                x2_grat,
   &              grat_y    &                y2_grat,
   &              div_x     &               half_div,
   &              div_y     &               half_div,
   &            grat_type   &            rectangular,
   &    polar/    min_x     & x0_min + max_grat/10,  & 54 &
   &    normal    max_x     & x0_max - max_grat/10,
   &              min_y     &                 y0_min,
   &              max_y     &                 y0_max,
   &              grat_x    &    xgrat + half_grat,
   &              grat_y    &    ygrat + half_grat,
   &              div_x     &                    div,
   &              div_y     &                    div,
   &            grat_type   &                  polar,
   &    polar/    min_x     &                 x1_min,  & 72 &
   &    split_1   max_x     &                 x1_max,
   &              min_y     & y1_min - half_grat/8,
   &              max_y     & y1_max + half_grat/8,
   &              grat_x    &  x1_grat + qtr_grat,
   &              grat_y    &  y1_grat + qtr_grat,
   &              div_x     &  (5 * half_div) / 4,
   &              div_y     &  (5 * half_div) / 4,
   &            grat_type   &                  polar,
   &    polar/    min_x     &                 x2_min,  & 90 &
   &    split_2   max_x     &                 x2_max,
   &              min_y     & y2_min - half_grat/8,
   &              max_y     & y2_max + half_grat/8,
   &              grat_x    &  x2_grat + qtr_grat,
   &              grat_y    &  y2_grat + qtr_grat,
   &              div_x     &  (5 * half_div) / 4,
   &              div_y     &  (5 * half_div) / 4,
   &            grat_type   &                  polar;

BYTE TABLE grat_specs_grat_offset :=         & indexed by type_of_grat &
   & 0       rectangular &      0,
   & 1          bullseye &     54, & 2 bytes/integer x 9 entries &
   & 2             smith &     54; &      x 3 tables = 54         &

BYTE TABLE grat_specs_mode_offset :=      & indexed by channel if split &
   & 0            normal &      0,
   & 1   split channel 1 &     18,
   & 2   split channel 2 &     36;

DOUBLE                                & addresses into grat_specs_table &
   grat1_specs_double,
   grat2_specs_double;
DOUBLE  TABLE grat_specs :=                         & indexed by channel &
```

SGRATIC.WORK.PD8510 THU, DEC 22, 1983, 10:36 AM PAGE 3

```
   0,
   ADRS( grat1_specs_double ),
   ADRS( grat2_specs_double );
GLOBAL INTEGER POINTER              & provide pointers for outside world &
   grat1_specs = grat1_specs_double,
   grat2_specs = grat2_specs_double;

INTEGER POINTER specs;                   & pointer into grat_specs_table &

INTEGER TABLE jump_channel :=
   0,
   jump_channel1,
   jump_channel2;
INTEGER TABLE end_ch_position :=
   0,
   end_ch1_position,
   end_ch2_position;
INTEGER TABLE graticule_display :=
   0,
   graticule1_display,
   graticule2_display;
INTEGER TABLE graticule_position :=
   0,
   graticule1_position,
   graticule2_position;
INTEGER TABLE trace_display :=
   0,
   trace1_display,
   trace2_display;
INTEGER TABLE tracem_display :=
   0,
   trace1m_display,
   trace2m_display;
INTEGER TABLE trace_mark_display :=
   0,
   trace_mark1_display,
   trace_mark2_display;

INTEGER addr;                        & display generator ram address  &
```

SGRATIC.WORK.PD8510 THU, DEC 22, 1983, 10:36 AM PAGE 4

```
%EJECT;
COMMENT                                                       graticule_type
*************************************************************************
*
*************************************************************************
;
INTEGER PROCEDURE graticule_type( ch );
   VALUE   ch;
   INTEGER ch;                                                    ENTRY;
   BEGIN & graticule_type &
      graticule_type := type_of_grat[ ch_integer( ch_format, ch ) ];
   END;  & graticule_type &
```

SGRATIC.WORK.PD8510 THU, DEC 22, 1983, 10:37 AM PAGE 5

```
%EJECT;
COMMENT                                                       rect_graticule
*************************************************************************
*
*************************************************************************
;
PROCEDURE  rect_graticule;
   BEGIN & rect_graticule &
      INTEGER i,
              grat_size,              & graticule width in pixels &
              div_size;               & pixels per division       &

      div_size  := specs[div_x];                      & div_x = div_y &
      grat_size := 10 * div_size;

      addr := move2( addr, specs[grat_x], specs[grat_y] );
      addr := setattribute( addr, incr );
      FOR i := 1 UNTIL 10 DO
         BEGIN & for &
            addr := move( addr, 0, 0 );               & to settle &
            addr := plot( addr, grat_size, 0, normal, slow );
            addr := plot( addr, -grat_size, div_size, blank, slow );
         END for;
      addr := move( addr, 0, 0 );                     & to settle &
      addr := plot( addr, grat_size, 0, normal, slow );
      FOR i := 1 TO 10 DO
         BEGIN & for &
            addr := move( addr, 0, 0 );               & to settle &
            addr := plot( addr, 0, -grat_size, normal, slow );
            addr := plot( addr, -div_size, grat_size, blank, slow );
         END for;
      addr := move( addr, 0, 0 );                     & to settle &
      addr := plot( addr, 0, -grat_size, normal, slow );
      addr := setattribute( addr, incroff );
   END;  & rect_graticule &
```

SGRATIC.WORK.PD8510 THU, DEC 22, 1983, 10:37 AM PAGE 6

```
%EJECT;
COMMENT                                                   bullseye_graticule
*************************************************************************
*
*************************************************************************
;
PROCEDURE  bullseye_graticule;
   BEGIN & bullseye_graticule &
      INTEGER radius,
              half_size,
              x_min,
              x_max,
              y_min,
              y_max,
              x0,
              y0;
      REAL    max_r;

      half_size := 5 * specs[div_x];                  & div_x = div_y &
      max_r     := REAL( half_size  );
      x0        := specs[grat_x];
      y0        := specs[grat_y];
      x_min     := x0 - INTEGER(max_r*0.8);
      x_max     := x0 + INTEGER(max_r*0.8);
      y_min     := y0 - INTEGER(max_r);
      y_max     := y0 + INTEGER(max_r);

      FOR radius := 1 TO 5 DO
         BEGIN & for &
            addr := arc( addr,
                         x0,
                         y0,
                         radius*0.2,
                         0.0,                         & start angle &
                         TwoPi,                       & arc angle   &
                         max_r,                       & max_radius  &
                         IF radius=5 THEN TRUE
                                     ELSE FALSE       & enhanced?   &
                       );
         END;  & for &
      & horizontal line &
      addr := plot( addr, x_min, y0, normal, slow );
      & vertical line &
      addr := move2( addr, x0, y_max );
      addr := plot( addr, x0, y_min, normal, slow );
      & diagonal lines &
      & redefine _min and _max &
      y_min := INTEGER(.28284271 * max_r);            & 0.4 cos(pi/4) &
      y_max := INTEGER(.70710678 * max_r);            & 1.0 cos(pi/4) &
      x_min := INTEGER(.22627417 * max_r);            & 0.8 y_min     &
      x_max := INTEGER(.56568543 * max_r);            & 0.8 y_max     &
      & up and to the right &
      addr := move( addr,
                    x0 - x_max,
                    y0 - y_max
                  );
```

SCRATIC.WORK.PD8510 THU, DEC 22, 1983, 10:37 AM PAGE 7

```
    addr := draw( addr,
                  x0 - x_min,
                  y0 - y_min
                );
    addr := move( addr,
                  x0 + x_min,
                  y0 + y_min
                );
    addr := draw( addr,
                  x0 + x_max,
                  y0 + y_max
                );
    & down and to the right &
    addr := move( addr,
                  x0 - x_max,
                  y0 + y_max
                );
    addr := draw( addr,
                  x0 - x_min,
                  y0 + y_min
                );
    addr := move( addr,
                  x0 + x_min,
                  y0 - y_min
                );
    addr := draw( addr,
                  x0 + x_max,
                  y0 - y_max
                );
  END;  & bullseye_graticule &
```

SCRATIC.WORK.PD8510 THU, DEC 22, 1983, 10:37 AM PAGE 8

```
#EJECT;
COMMENT                                                         smith_chart_graticule
**************************************************************************************
*
**************************************************************************************
;
PROCEDURE  smith_chart_graticule( scale );
  VALUE   scale;
  REAL    scale;               & (outer circle radius) / (r=0 radius) &
  BEGIN & smith_chart_graticule &
    INTEGER i, j,
            radius,
            half_size,
            x0,
            y0;
     REAL   max_r,
            one_over_scale,
            angle,              & intersection of r=1 and outer circle &
            u, v,                                        & real and imag.   &
            r,                                             & resistance &
            x;                                             & reactance  &

    one_over_scale := 1.0 / scale;

    half_size := 5 * specs[div_x];                       & div_x = div_y &
    max_r := REAL( half_size  );
    x0 := specs[grat_x];
    y0 := specs[grat_y];

    & outer circle &
    addr := arc( addr,
                 x0,
                 y0,
                 1.0,
                 0.0,                                      & start angle &
                 TwoPi,                                    & arc angle   &
                 max_r,                                    & max_radius  &
                 TRUE
               );
    addr := r_circle( addr, x0, y0,                            & R = 1 &
                      1.00, max_r, scale
                    );
    IF ABS(scale - 1.0) > 0.001 THEN                     & scale <> 1.0 &
       addr := r_circle( addr, x0, y0,                         & R = 0 &
                         0.00, max_r, scale
                       );
    addr := x_circle( addr, x0, y0,                            & X = 0 &
                      0.00, max_r, scale                  & horiz. line &
                    );

    & scale = max_gamma &
    r := (2-scale) / (2+scale);                        & for max gamma / 2 &

    addr := r_circle( addr, x0, y0,
                      r, max_r, scale
                    );
```

SCRATIC.WORK.PD8510 THU, DEC 22, 1983, 10:37 AM PAGE 9

```
    IF scale < 1.4 THEN
       addr := r_circle( addr, x0, y0,
                         1.0/r, max_r, scale
                       )
    ELSE
       addr := x_circle( addr, x0, y0,
                         4.0*one_over_scale, max_r, scale
                       );

    IF scale < 0.999 THEN
       BEGIN & if &
          addr := r_circle( addr, x0, y0,
                            1.0/r, max_r, scale
                          );

          angle := intersect_angle( 0.5, 0.5, scale );
          IF angle > 1.83 THEN
             angle := 1.83;        & helps meet 1.0 circle at scale=1&

          & quarter point &
          packed_sin_cos(0.25*angle);            & rtns cos/sin in R0/R1 &
          ASSEMBLE( MOVE.L R0, u;                         & u = cos(angle) &
                    MOVE.L R1, v                          & v = sin(angle) &
                  );
          u := 0.5 + 0.5*u;                               & 1 - real part &
          v := 0.5*v;
          x := (2*v) / ( u*u + v*v );
          addr := x_circle( addr, x0, y0,
                            x, max_r, scale
                          );
          & half point &
          packed_sin_cos(0.50*angle);            & rtns cos/sin in R0/R1 &
          ASSEMBLE( MOVE.L R0, u;                         & u = cos(angle) &
                    MOVE.L R1, v                          & v = sin(angle) &
                  );
          u := 0.5 + 0.5*u;                               & 1 - real part &
          v := 0.5*v;
          x := (2*v) / ( u*u + v*v );
          addr := x_circle( addr, x0, y0,
                            x, max_r, scale
                          );
          & three-quarter point &
          packed_sin_cos(0.75*angle);            & rtns cos/sin in R0/R1 &
          ASSEMBLE( MOVE.L R0, u;                         & u = cos(angle) &
                    MOVE.L R1, v                          & v = sin(angle) &
                  );
          u := 0.5 + 0.5*u;                               & 1 - real part &
          v := 0.5*v;
          x := (2*v) / ( u*u + v*v );
          addr := x_circle( addr, x0, y0,
                            x, max_r, scale
                          );
       END   & if &
    ELSE & scale >= 0.999 &
       BEGIN & else &
```

SCRATIC.WORK.PD8510 THU, DEC 22, 1983, 10:37 AM PAGE 10

```
          addr := x_circle( addr, x0, y0,
                            one_over_scale, max_r, scale
                          );
          addr := x_circle( addr, x0, y0,
                            2.0*one_over_scale, max_r, scale
                          );
          IF scale <= 1.999 THEN
             addr := x_circle( addr, x0, y0,
                               0.5*one_over_scale, max_r, scale
                             )
          ELSE & scale > 1.999 &
             BEGIN & else &
                r := (1-scale) / (1+scale);
                addr := r_circle( addr, x0, y0,
                                  r, max_r, scale
                                );
             END;  & else &
       END;  & else &

  END;  & smith_chart_graticule &
```

```
#EJECT;
COMMENT                                                     initialize_trace
****************************************************************************
*
****************************************************************************
;
PROCEDURE  initialize_trace( grat_type );
  VALUE   grat_type;
  INTEGER grat_type;
  BEGIN & initialize_trace &
    INTEGER pixels_per_point,
            grat_size,
            half_size,
            x,
            y,
            i;

    grat_size := 10 * specs[div_x];                       & div_x = div_y &
    half_size := ARIGHT( grat_size, 1 );                   & grat_size/2 &
    x         := specs[grat_x];
    y         := specs[grat_y];

    IF grat_type = rectangular THEN
      BEGIN & rectangular &
        pixels_per_point := grat_size / (stop-start);
        y := y + half_size;
        & should be done in the reverse direction &           & DEBUG &
        addr := move(addr,                                 & first point &
                x,
                y
               );

        FOR i := step_size STEP step_size UNTIL stop DO
          addr := draw(addr,                        & remaining points &
                  x + (i*pixels_per_point),
                  y
                 );
      END  & rectangular &
    ELSE & polar &
      FOR i := start STEP step_size UNTIL stop DO
        addr := move(  addr,
                       x,
                       y
                    );
  END;  & initialize_trace &
```

```
#EJECT;
COMMENT                                          partial_trace_and_graticule
****************************************************************************
*
****************************************************************************
;
PROCEDURE  partial_trace_and_graticule;                               ENTRY;
  BEGIN & partial_trace_and_graticule &
    INTEGER ch,
            specs_offset,
            graticule,
            previous_graticule;
    DOUBLE POINTER grat_specs_adr;

    previous_graticule := no_graticule; & assure no match &

    FOR ch := 1 UNTIL max_ch DO
      BEGIN & for channel &

        IF ( (trace_mode = single_ch) AND
             (current_entry_ch <> ch)
           ) THEN & don't draw graticule &
          BEGIN & if &
            addr := jmp(jump_channel[ch], end_ch_position[ch]);
            graticule := no_graticule;
          END  & if &
        ELSE
          BEGIN & else draw graticule &
            & -- graticule(s) -- &

            graticule := graticule_type( ch );

            specs_offset := IF trace_mode = split THEN
                              grat_specs_mode_offset[ch]
                            ELSE
                              0;
            specs_offset := specs_offset +
                            grat_specs_grat_offset[ graticule ];
            STPNTR( grat_specs_adr, grat_specs[ch] );
            grat_specs_adr := ADRS( grat_specs_table ) +
                              specs_offset;
            STPNTR( specs, grat_specs_adr );

            & DRAW GRATICULE &
            addr := graticule_position[ch];

            IF graticule <> previous_graticule THEN & guaranteed &
              BEGIN & if &                          & <> for ch1 &
                IF graticule = rectangular THEN
                  rect_graticule
                ELSE IF graticule = bullseye THEN
                  bullseye_graticule
                ELSE
                  smith_chart_graticule( ch_real( ch_ref_value,
                                                  ch
                                                )
```

```
                                       );
              END  & if &
            ELSE IF ( ( graticule = smith ) AND
                      ( ch_real( ch_ref_value, 1 ) <>
                        ch_real( ch_ref_value, 2 )
                      )
                    ) THEN     & Smith chart scales are not same &
              smith_chart_graticule( ch_real(ch_ref_value, ch) );

            previous_graticule := graticule;
            addr := jmp( addr,
                         graticule_display[ch] + graticule_size
                       );

            & -- trace(s) -- &

            addr := trace_display[ch];
            initialize_trace( graticule );
            addr := jmp(addr, trace_display[ch]+trace_size);

            & trace mark &
            addr := trace_mark_display[ch];
            IF ( (trace_mode <> split) AND
                 (graticule = rectangular)
               ) THEN
              BEGIN & if &
                addr := setattribute( addr, incr );
                IF ch=1 THEN
                  BEGIN & if ch = 1 &
                    addr := move(addr, -112, -80);
                    addr := printch(addr, '1);
                    addr := move(addr, -16, 0); & align mark &
                    addr := printch(addr, ch1_trace_mark);
                  END  & if ch = 1 &
                ELSE
                  BEGIN & else ch = 2 &
                    addr := move(addr, 0, -80);
                    addr := printch(addr, ch2_trace_mark);
                    addr := move(addr, -16, 0);
                    addr := printch(addr, '2);
                  END; & else ch = 2 &
                addr := setattribute(addr, incroff);
              END; & if &
            addr := jmp( addr,
                         trace_mark_display[ch]+trace_mark_size
                       );

            & memory trace &                                 & DEBUG &
            addr := tracem_display[ch];                      & DEBUG &
            initialize_trace( graticule );                   & DEBUG &
            addr := jmp( addr,                               & DEBUG &
                         tracem_display[ch]+trace_size       & DEBUG &
                       );
            addr := setattribute(jump_channel[ch], nop);
          END; & else draw graticule &
```

```
        IF trace_mode = split THEN
          previous_graticule := no_graticule
        ELSE & not split &
          previous_graticule := graticule;

      END;  & for channel &

    annotate_ref_position;

    update_marks;

  END;  & partial_trace_and_graticule &


SUBROUTINE trace_and_graticule;                                       ENTRY;
  BEGIN & trace_and_graticule &
    acquire( processing_variables );

    partial_trace_and_graticule;

    release( processing_variables ); COMMENT  must release before the
                                     write_fifo, else if fifo is full
                                     the fifo reader cannot get the
                                     processing vars in order to empty
                                     the fifo.;
    & TELL DATA PROCESSING ABOUT THE CHANGE &
    write_fifo( array_update_fifo, %4100 );      & update ch1 dp vars &
    write_fifo( array_update_fifo, %4200 );      & update ch1 dp vars &
  END;  & trace_and_graticule &
```

```
SGRATIC.WORK.PD8510          THU, DEC 22, 1983, 10:37 AM     PAGE  15

#EJECT;
COMMENT                                                    init_gratic
**********************************************************************
*
*   Only initializes the gratx_specs pointers.
*
**********************************************************************
;
SUBROUTINE init_gratic;                                         ENTRY;
   BEGIN & init_gratic &
      STPNTR( grat1_specs, ADRS(grat_specs_table) );
      STPNTR( grat2_specs, ADRS(grat_specs_table) );
   END;  & init_gratic &

ENDS
```

```
CGRATIC2.WORK.PD8510          THU, DEC 22, 1983, 10:37 AM     PAGE  1

COMMENT                              Constants for grat_specs_table
   xgrat, ygrat, and max_grat are defined in cscreen.work;
INTEGER CONSTANT
   half_grat := max_grat/2,
   qtr_grat  := max_grat/4,
   div       := max_grat/10,
   half_div  := half_grat/10,
   x1_grat   := xgrat,
   y1_grat   := ygrat + qtr_grat,
   x2_grat   := xgrat + half_grat + 32,
   y2_grat   := ygrat + qtr_grat,
   x0_min    := xgrat - 8,
   y0_min    := ygrat - 8,
   x1_min    := x1_grat - 8,
   y1_min    := y1_grat - 8,
   x2_min    := x2_grat - 8,
   y2_min    := y2_grat - 8,
   x0_max    := xgrat + max_grat + 16,
   y0_max    := ygrat + max_grat + 16,
   x1_max    := x1_grat + half_grat + 16,
   y1_max    := y1_grat + half_grat + 16,
   x2_max    := x2_grat + half_grat + 16,
   y2_max    := y2_grat + half_grat + 16;
```

```
CH2QUICK.WORK.PD8510          THU, DEC 22, 1983, 10:37 AM     PAGE  1

BYTE TABLE johnsfun :=
   80,  5,-124, 66,
   64,  5, 80,  4, 66,
   80, 69,  4, 66,
   80, 13, 60, 28, 52, 13, -4,  4,-28, -4,-12,-20,  4, -4, 20,  4, 36,
 12, 20, 28,  4, 12,-12, 29,-92, 66,
   80, 13,108, 20, 12,  4,-60,  4, 68,-11,-60, 36,  4, 29,-44, 66,
   80,  5, 52, 44,  4,-36,  4, 12, 28, 28, 12, 12, 20, -4, 20,-12,  4,
-12, -4, 69,-100, 66,
   80,  5, 60, 20, -4, 20,  4, 12, 20, -4, 20,-12,  4, 21,  4, 12, 20,
 -4, 20,-12,  4,-12, -4, 69,-100, 66,
   80, 37, 52,  4, 68,-28,-44, 52,  4,-44,  4, 36, 52,  4,-60, 37,-44,
 66,
   80,  5,116, 44,  4,-36,  4,  4,-20, 28,  4, 20, -4,  4,-12, -4,-12,
-12,  4,-12, 12, 69,-52, 66,
   80,  5, 84, 36,  4, 12,-12, -4,-12,-20,  4, -4, 20,  4, 36, 12, 20,
 20,  4, 20, -4, 29,-100, 66,
   80, 13, 52, 36, 68,-36,  4, 44,  4,-28,-60, 61,-44, 66,
   80, 13, 84, 28,  4, 12,-12, -4,-12,-20,  4, -4, 20, 12, 20, -4, 20,
 12, 20, 28,  4, 12,-12, -4,-12, 37,-76, 66,
   80, 45, 84,-28,  4, -4, 20, 12, 20, 28,  4, 12,-12,  4,-28, -4,-12,
-12,  4,-12, 12, 69,-52, 66,
   80,  5, 68, 52,  4,-44,  4,  5, 28, 52,  4,-44,  4, 69,-84, 66,
   80, 29, 52,  4,  4,  5, 20,  4, 20, 28, 12,  4, 20,-20, 12,-20, -4,
 69,-100, 66,
   80, 37, 52,-12,  4,-12, 20,  4, 36, 20, 20, 20,  4, 20,-12,  4,-20,
 -4,-12, -4, 44,-12, -4,  4,-20, 20,  4, 37,-60, 66,
   80, 13, 68, 36,  4,-28,  4, -3,-12, 28, 68, 28,-60,-20, 68,-20,-60,
 69,-44, 66,
   80, 37, 52,-28,  4,  4, 68, 36,  4, 20,-12,-12,-12,-28,  4, 36,  4,
 20,-12,-12,-12,-28,  4,  4, 68, 36,  4, 37,-108, 66,
   80,  5, 60,  4, 52,  4,-44, 28, -4, 28, 12,  5, 52,-20, 12,-20, -4,
 69,-100, 66,
   80,  5,116,  4,-60, 36,  4, 20, 20,  4, 36,-12, 20,-28,  4,  4,-60,
 69,-44, 66,
   80,  5, 84, 44,  4,-36,  4,  5,-28,  4, 68, 52,  4,-44,  4,  4,-60,
 52,  4,-44,  4, 69,-44, 66,
   80,  5, 84, 44,  4,-36,  4,  5,-28,  4, 68, 52,  4,-44,  4,  4,-60,
 69,-44, 66,
   80, 37, 84, 20,  4,  4,-20,-20, -4,-20, 12,  4, 52,  4,-44,  5, 52,
 28, 12, 28, -4, 21,-100, 66,
   80, 53, 52,  4, 68,  4,-60,  5, 36,-44,  4, 52,  4,-43, 36,  4,-60,
  4, 68, 69,-108, 66,
   80, 13, 52, 36,  4,-11,  4,  4, 68,  4,-60,-11, 68, 36,  4, 29,-108,
 66,
   80,  5, 68, 12,-12, 28,  4, 12, 20,  4, 52,  4,-44, 29,-60, 66,
   80, 53, 52,-28, 36, 36,-28, -3, 68,-36,-36, 44, 44,-35,  4,  4,-60,
  4, 68, 69,-108, 66,
   80,  5, 52,  4, 68,  4,-60, 44,  4,-36,  4, 69,-44, 66,
   80,  5,116, 28,-44, 28, 52,  4,-60,  4, 68,-20,-44,-20, 52,  4,-60,
  4, 68, 69,-108, 66,
   80,  5, 52,  4, 68,-52,-60,  4, 68,  4,-60,-44, 68,  4,-60, 69,-44,
 66,
   80, 53, 60,  4, 52,  4,-44,-20, -4,-20, 12,  4, 52,  4,-44,  5, 52,
 28, 12, 28, -4, 21,-100, 66,
```

```
CH2QUICK.WORK.PD8510          THU, DEC 22, 1983, 10:37 AM     PAGE  2

   80,  5,116,  4,-60,  4, 68, 44,  4, 12,-12, -4,-12,-36,  4, 69,-76,
 66,
   80,  5, 60,  4, 52,  4,-44, 28, -4, 28, 12,  4, 52,-20, 12,-20, -4,
 53,-44,  4, 52,-19,-28, 28,-28, 21,-36, 66,
   80, 45,116,-36,  4,  4,-60,  4, 68, 44,  4, 12,-12, -4,-12,-36,  4,
 36,  4, 20,-28, 21,-44, 66,
   80, 53,108,-20, 12,-20, -4,  4,-12, 36, -4, 20, -4,  4,-12,-20, -4,
-20, 12, 69,-52, 66,
   80,  5,116, 52,  4,-44,  4, 29,  4,  4,-60,  4, 68, 45,-108, 66,
   80,  5, 60,  4, 60,  4,-52, 28, -4, 28, 12,  4, 60,  4,-52, 21,-52,
 66,
   80, 29, 52,-20, 68, 28,-60, 28, 68,-20,-60, 45,-44, 66,
   80,  5,116, 12,-60, 20, 52, 20,-44, 12, 68, -4,-60,-12, 52,-12,-44,
 -4, 68, 69,-108, 66,
   80,  5, 52, 52, 68,-44,-60,  5, 68, 52,-60,-44, 68, 69,-108, 66,
   80,  5,116, 28,-28, 28, 36,-20,-28,  4,-28,  4, 36,-20, 36, 69,-108,
 66,
   80,  5,116, 52,  4,-44,-60, 52,  4,-44,  4, 52, 68,-44,  4, 69,-108,
 66;
```

```
CHDOC.WORK.PD8510               THU, DEC 22, 1983, 10:37 AM     PAGE   1


FILE DESCRIPTIONS FOR 'CH' FILES

DCHBASIS - input data file desribing the 8510 character set used by the
           program PCHBASIS.
DCHQUICK - input data file describing the 8510 monitor character set
           used by the program PCHQUICK.  Creates a compacted set.
           The elements (character strokes) in this file are the same as
           those in DCHBASIS with the character number (first number)
           removed and the commas replaced with newlines.  Double
           stroking has been removed from most of these, and the set is
           a very limited subset of the characters in DCHBASIS.
FCHQUICK - a WFILE containing the ALGOL source for the compact character
           set for the monitor.  Created by PCHQUICK from DCHQUICK.
LCHARSET - a linker command file for loading the character set.
PCHBASIS - the program file that takes DCHBASIS as input and creates
           the ASM68000 source file SCHARSET for the 8510 character set.
PCHQUICK - the program file that takes DCHQUICK as input and creates
           the ALGOL include file FCHQUICK for the 8510 monitor's
           compacted character set.
RCHARMOV - the relocatable code for the character move program.
RCHARSET - the relocatable code for the character set.
SCHARMOV - the ALGOL source for the character move program.  Moves the
           character set from main memory into display memory.
SCHARSET - the ASM68000 source file of the 8510 character set.  Created
           from DCHBASIS by the program PCHBASIS.
SCHBASIS - the PASCAL source file for the program PCHBASIS.  Takes
           DCHBASIS as input and created the ASM68000 source file
           SCHARSET for the 8510 character set.
SCHQUICK - the PASCAL source file for the program PCHQUICK.  See
           PCHQUICK above.
```

```
FHWDEBUG.WORK.PD8510            THU, DEC 22, 1983, 10:37 AM     PAGE   1


COMMENT
hard_flags are hardware flags on the processor board for realtime
signaling -- either input or output.
    A READ of the specific flag will cause a set or clear of a testpoint
      bit on processor board multi-point testpoint near U79.

   PIN       1      2      3      4      5      6      7      8
   FLAG      1      2     n/u     4     n/u     6      7      8

 These flags can be used as output signaling or input signaling.
     However reading the hard_flags will set flag 7.

end of comment;
INTEGER hard_flag = Z90000,
     clr_flg_1 = hard_flag +Z10, set_flg_1 = hard_flag +Z12,
     clr_flg_2 = hard_flag + ZC, set_flg_2 = hard_flag + ZE,
     clr_flg_4 = hard_flag + Z0, set_flg_4 = hard_flag + Z2,
     clr_flg_6 = hard_flag + Z4, set_flg_6 = hard_flag + Z6,
     clr_flg_8 = hard_flag + Z8, set_flg_8 = hard_flag + ZA;
BITFIELD test_flg = hard_flag + Z16:
          lrfint,   hmintin,   flg_7,  flg_1,
          flg_2,    flg_8,     flg_6,  flg_4;
```

```
DIBDOC.WORK.PD8510              THU, DEC 22, 1983, 10:37 AM     PAGE   1


FILES USED IN CREATING THE HP-IB PARSE TABLE:

SIBTBL -- source list of HP-IB commands and values.

IBTREE -- source for program that reads SIBTBL and creates M68ALGOL
            parse tables in SIBTREE.
CIBTREE -- a constant declaration for the parse table length.
FIBTREE -- the table name declarations for the parse tables of SIBTREE.
PIBTREE -- the program object file from IBTREE.

SIBTREE -- the M68ALGOL parse table definitions as a separately
            compilable program.
DIBTREE1 -- numeric and string data for merging into SIBTREE (chars)
DIBTREE2 -- numeric and string data for merging into SIBTREE (numbers)

UIBTREE -- an ED (.PUB.CRD) command (")u") file that merges DIBTREE1 and
            DIBTREE2 into SIBTREE.
```

```
SIBGEN.WORK.PD8510              THU, DEC 22, 1983, 10:37 AM     PAGE   1


$USLINIT$
$LIST OFF$

PROGRAM ibgen(input, list, output, err);

{ ibgen:  reads an "input" file of the form
      FA 3;
      FB 4;
      $include FILE2       must begin in column 1.
      OUT 7;
      DP 15 comments here;
      !
                  <mnem> <value> <comments> ;
                        ...
                  !

 [ Blanks are delimeters; Everything after the value is skipped until
   the semicolon (comments); Lower case characters are all upshifted. ]

   and "output"s a file (SIBTREE) for use by "parser".  "list" is
   for diagnostic listing.  "err" is used for error messages.}

CONST
   endsy         = '!';
   symbol_end    = '$';
   illegal       = 1;
   value_illegal= 'cmd_illegal';
   size_illegal = 11;   { number of chars in value_illegal }
   maxtable      = 2000;
   delim         = '@';
   blank         = '^';  { Blank substitution character }
   linewidth     = 72;   { Source line width. }
   linemax       = 110;  { Max characters per input line. }
   reserved      = 46;   { space reserved for manual tree entries }
   syntab_max    = 10000;

TYPE
   syntab_index = 1..syntab_max;
   line_type     = string [linemax];
   cursor        = 1..maxtable;
   ptrtype       = ^cell;
   cell          = RECORD
                   labl          : char;
                   value         : integer;
                   lnc, rs       : ptrtype;
                   END;
   err_word_type= -32768..32767;

VAR
   syntab        : string [syntab_max];
   root          : ptrtype;
   cellptr, ptr : ptrtype;
   index, symbol: syntab_index;
   labels        : ARRAY [cursor] OF char;
   lncs          : ARRAY [cursor] OF integer;
```

```
SIBGEN.WORK.PD8510              THU, DEC 22, 1983, 10:37 AM    PAGE  2

   i, j          : integer;
   nextlabel     : cursor;
   eol           : boolean;  { End of line flag. }
   altfile       : boolean;  { Using alternate file. }
   err,
   list,
   output2,
   input2        : text;
   instr         : line_type;
   linecount     : integer;  { Input line count. }
   chcnt         : integer;  { Character counter. }
   ch            : char;  { Last character. }
   mnemonic      : PACKED ARRAY [1..linemax] OF char;
   mnen_index    : 0..linemax;
   err_occurred : boolean;


PROCEDURE setjcw(err_word:err_word_type);                    INTRINSIC;

FUNCTION mnen_valid_ident:boolean;
   VAR
      i : 0..linemax;
   BEGIN {mnen_valid_ident}
      mnen_valid_ident := true;
      IF mnen_index <= 0 THEN
         mnen_valid_ident := false
      ELSE
         FOR i := 1 TO mnen_index DO
            BEGIN {for}
               { downshift }
               IF ( (mnemonic[i]>='A') AND (mnemonic[i]<='Z') ) THEN
                  mnemonic[i] := chr(     ord(mnemonic[i]) +
                        ( ord('a') - ord('A') )      );
               { valid character for an identifier? }
               IF ( ( (mnemonic[i]<'a') OR (mnemonic[i]>'z') ) AND
                    ( (mnemonic[i]<'0') OR (mnemonic[i]>'9') ) AND
                    (  mnemonic[i]<>'_')     ) THEN
                  mnen_valid_ident := false;
            END; {for}
         { start with an alpha? }
         IF ( (mnemonic[1]<'a') OR (mnemonic[1]>'z') ) THEN
            mnen_valid_ident := false;
   END; {mnen_valid_ident}

PROCEDURE nextch;

   LABEL 1;

   VAR
      i, j, minlen  : integer;

   BEGIN  {nextch}
      IF eol THEN
         BEGIN  {if eol}
```

```
SIBGEN.WORK.PD8510              THU, DEC 22, 1983, 10:37 AM    PAGE  3

         1: IF altfile THEN
               BEGIN  {if altfile}
                  readln(input2, instr);
                  IF eof(input2) THEN
                     BEGIN  {if eof}
                        altfile := false;
                        GOTO 1
                     END;  {if eof}
               END  {if altfile}
            ELSE
               BEGIN  {else not altfile}
                  readln(input, instr);
                  IF strlen(instr) > 10 THEN
                     IF (str(instr,1,9)='$INCLUDE ') OR (str(instr,1,9)
                           = '$include ') THEN
                        BEGIN  {if $include}
                           reset(input2, str(instr,10,strlen(instr)),
                                 'NOCCTL,SHARED');
                           altfile := NOT eof(input2);
                           IF NOT altfile THEN
                              GOTO 1;
                           readln(input2, instr);
                        END;  {if $include}
               END;  {else not altfile}
            linecount := linecount + 1;
            IF strlen(instr) > linewidth THEN
               setstrlen(instr, linewidth);
            chcnt := 0;
            eol := false;
            writeln(list, instr);
         END;  {if eol}
      IF eof(input) THEN
         BEGIN  {if eof}
            writeln (err,' **** EOF ENCOUNTERED');
            err_occurred := true;
            ch := chr(0)
         END  {if eof}
      ELSE  IF chcnt >= strlen(instr) THEN
         BEGIN  {if chcnt}
            eol := true;
            ch := ' '
         END  {if chcnt}
      ELSE
         BEGIN  {else}
            chcnt := chcnt + 1;
            ch := instr[chcnt];
         END;  {else}
   END {nextch};

PROCEDURE next_upshifted_ch;
   BEGIN {next_upshifted_ch}
      nextch;
      IF ((ch >= 'a') AND (ch <= 'z')) THEN {shift to upper case }
         ch := chr( ord(ch) - ord('a') + ord('A') );
   END;  {next_upshifted_ch}
```

```
SIBGEN.WORK.PD8510              THU, DEC 22, 1983, 10:37 AM    PAGE  4

FUNCTION unravel(node:ptrtype):integer;

   VAR
      ptr           : ptrtype;

   BEGIN  {unravel}
      ptr := node;
      WHILE ptr <> NIL DO
         BEGIN  {while}
            IF ptr^.lnc <> NIL THEN
               ptr^.value := unravel(ptr^.lnc);
            ptr := ptr^.rs;
         END;  {while}
      ptr := node;
      unravel := nextlabel;
      WHILE ptr <> NIL DO
         BEGIN  {while}
            labels[nextlabel] := ptr^.labl;
            lncs[nextlabel] := ptr^.value;
            nextlabel := nextlabel + 1;
            ptr := ptr^.rs;
         END;  {while}
      nextlabel := nextlabel + 1;
   END;  {unravel}

PROCEDURE preorder(node:ptrtype; level:integer);
   VAR
      i : integer;
   BEGIN {preorder}
      IF node<>nil THEN
         BEGIN {if}
            FOR i := 1 TO level DO
               write(list,'   ');
            write(list,node^.labl:1,' ',node^.value:6);
            IF node^.value < 0 THEN
               BEGIN { if }
                  write(list,'  ');
                  index := -node^.value;
                  WHILE syntab[index] <> symbol_end DO
                     BEGIN { while }
                        write(list,syntab[index]);
                        index := index + 1;
                     END;  { while }
               END;  { if }
            writeln(list);
            preorder(node^.lnc, level+1);
            preorder(node^.rs, level);
         END; {if}
   END; {preorder}

BEGIN  {ibgen}
   rewrite(output,'OUTPUT','NOCCTL');
   rewrite(output2,'OUTPUT2','NOCCTL');
   rewrite(list,'LIST','NOCCTL');
   rewrite(err,'$STDLIST','NOCCTL');
   reset(input,'INPUT','NOCCTL,SHARED');
```

```
SIBGEN.WORK.PD8510              THU, DEC 22, 1983, 10:37 AM    PAGE  5

   strinsert(value_illegal, syntab, illegal);
   err_occurred := false;
   symbol := illegal + size_illegal;
   strappend(syntab, symbol_end);
   eol := true;
   altfile := false;
   new(root);
   root^.labl := ' ';
   root^.value := 0;
   root^.lnc := NIL;
   root^.rs := NIL;
   mnen_index := 0;
   next_upshifted_ch;
   WHILE ch=' ' DO  { Skip leading blanks. }
      next_upshifted_ch;
   WHILE ch<>endsy DO  { Repeat until end marker. }
      BEGIN  {while ch<>endsy}
         cellptr := root;

         WHILE ch<>' ' DO  { Get mnemonic. }
            BEGIN  {while ch<>' '}
               mnen_index := mnen_index + 1;
               mnemonic[mnen_index] := ch;
               IF ch = blank THEN
                  ch := ' ';
               IF cellptr^.lnc = NIL THEN { ch is first child }
                  BEGIN  {if cellptr}
                     IF cellptr^.value <> 0 THEN
                        BEGIN {if}
                           writeln(err, instr);
writeln(err,'An earlier mnemonic is a prefix of this mnemonic.');
                           err_occurred := true;
                        END;  {if}
                     new(ptr);
                     ptr^.labl := ch;
                     ptr^.value := 0;
                     ptr^.lnc := NIL;
                     ptr^.rs := NIL;
                     cellptr^.lnc := ptr;
                     cellptr := ptr;
                  END  {if cellptr}
               ELSE { ch is not the first child, make it last sibling }
                  BEGIN  {else cellptr}
                     cellptr := cellptr^.lnc;
                     WHILE ((cellptr^.labl<>ch) AND (cellptr^.rs<> NIL))
                           DO
                        cellptr := cellptr^.rs;
                     IF cellptr^.labl <> ch THEN
                        BEGIN  {if}
                           new(ptr);
                           ptr^.labl := ch;
                           ptr^.value := 0;
                           ptr^.lnc := NIL;
                           ptr^.rs := NIL;
                           cellptr^.rs := ptr;
                           cellptr := ptr;
```

```
SIBGEN.WORK.PD8510            THU, DEC 22, 1983, 10:37 AM     PAGE   6

                  END;  {if}
               END;  {else cellptr}
            next_upshifted_ch;
         END;  {while ch<>' '}

      { now get value }
      WHILE ch=' ' DO  { Skip delimiting blanks. }
         nextch;
      IF cellptr^.lnc <> NIL THEN
         BEGIN { if }
            writeln(err, instr);
writeln(err,'This mnemonic is a prefix of an earlier mnemonic');
            err_occurred := true;
         END;  { if }
      WHILE ch='-' DO  { '-' is illegal. }
         BEGIN {while}
            writeln(err, instr);
            writeln(err,'Negative values are illegal.');
            err_occurred := true;
            nextch;
         END; {while}
      index := symbol;
      WHILE (
               ( (ord(ch) >= ord('0')) AND (ord(ch) <= ord('9')) ) OR
               ( (ord(ch) >= ord('A')) AND (ord(ch) <= ord('Z')) ) OR
               ( (ord(ch) >= ord('a')) AND (ord(ch) <= ord('z')) ) OR
               ( ch = '_' )
               ) DO
         BEGIN  {while}
            index := index + 1;
            setstrlen(syntab, 1+strlen(syntab) );  {increment length}
            syntab[ strlen(syntab) ] := ch;
            nextch;
         END;  {while}
      cellptr^.value := -(symbol+1);
      symbol := index + 1;
      strappend(syntab, symbol_end);

      mnem_index := 0;

      { now skip comments, if any }
      WHILE ch <> ';' DO  { Find end of line marker. }
         nextch;
      nextch;  { Skip over semicolon. }
      WHILE ch = ' ' DO  { Skip leading blanks. }
         nextch;
   END;  {while ch<>endsy}

writeln(list,'---');
preorder(root,0);

{ transfer tree information to tables }
FOR i := 1 TO maxtable DO
   BEGIN  {for}
      labels[i] := delim;
      lncs[i] := -illegal;
```

```
SIBGEN.WORK.PD8510            THU, DEC 22, 1983, 10:37 AM     PAGE   7

   END;  {for}
FOR i := 1 TO 128 DO
   labels[i] := chr(i-1);
nextlabel := 130 + reserved; { skip one to leave a delimiter }
cellptr := root^.lnc;
WHILE cellptr <> NIL DO
   BEGIN  {while}
      IF cellptr^.lnc <> NIL THEN
         lncs[1+ord(cellptr^.labl)] := unravel(cellptr^.lnc)
      ELSE
         lncs[1+ord(cellptr^.labl)] := cellptr^.value;
      cellptr := cellptr^.rs;
   END;  {while}


writeln(list,'---');
FOR i := 1 TO nextlabel-1 DO
   BEGIN { for }
      write(list,i:4,' ',labels[i]:1,' ',lncs[i]:7);
      IF lncs[i] < 0 THEN
         BEGIN { if }
            write(list,'  ');
            index := -lncs[i];
            WHILE syntab[index] <> symbol_end DO
               BEGIN { while }
                  write(list,syntab[index]);
                  index := index + 1;
               END;  { while }
         END;  { if }
      writeln(list);
   END;  { for }

writeln(output2,'INTEGER CONSTANT tablesize := ',nextlabel-1:8,';');

writeln(output,'M68KL,P,"ibtree"');
writeln(output,'BEGIN & ibtree &');
writeln(output);
writeln(output,'MFILE ccnddecl.work;');
writeln(output);


write(output,'GLOBAL BYTE TABLE mnem :=  ');    { 1 extra blank for }
j := 27;                                        { nice appearance.  }
FOR i := 1 TO nextlabel-1 DO
   BEGIN {for}
      IF ((i=130) OR (i=130+reserved)) THEN
         BEGIN {if}
            writeln(output);
            j := 99;
         END; {if}
      j := j + 4;
      IF j > 72 THEN
         BEGIN {if}
            writeln(output);
            write(output,'& ',(i-1):4,' &   ');
            j := 11;                                          { header }
```

```
SIBGEN.WORK.PD8510            THU, DEC 22, 1983, 10:37 AM     PAGE   8

            j := j + 4;                                       { entry  }
         END; {if}
      IF ((i-1 < 33) OR (i-1 = 127)) THEN
         write(output,ord(labels[i]):3)
      ELSE
         write(output,' ''',labels[i]:1);
      IF i < nextlabel-1 THEN
         write(output,',')
      ELSE
         writeln(output,';');
   END; {for}

writeln(output);
write(output,'GLOBAL INTEGER TABLE ih_link := ');
j := 32;
FOR i := 1 TO nextlabel-1 DO
   BEGIN {for}
      IF ((i=130) OR (i=130+reserved)) THEN
         BEGIN {if}
            writeln(output);
            j := 99;
         END; {if}
      IF lncs[i] > 0 THEN
         BEGIN { if }
            j := j + 7;
            IF j > 72 THEN                      { start a new line }
               BEGIN {if}
                  writeln(output);
                  write(output,'& ',(i-1):4,' &   ');
                  j := 11;                                    { header }
                  j := j + 7;                                 { entry  }
               END; {if}
            write(output,(lncs[i]-1):6);{ -1 to convert to origin 0 }
         END   { if }
      ELSE
         BEGIN { else }
            { find symbol length }
            index := -lncs[i];
            WHILE syntab[index] <> symbol_end DO
               index := index + 1;
            index := index + lncs[i];  {symbol length (lncs < 0)}
            j := j + index + 2;      { "2" for comma and minus sign }
            IF j > 72 THEN                      { start a new line }
               BEGIN {if}
                  writeln(output);
                  write(output,'& ',(i-1):4,' &   ');
                  j := 11;                                    { header }
                  j := j + index + 2;                         { entry  }
               END; {if}
            index := -lncs[i];
            write(output,'-');
            WHILE syntab[index] <> symbol_end DO
               BEGIN { while }
                  write(output,syntab[index]);
                  index := index + 1;
               END; { while }
```

```
SIBGEN.WORK.PD8510            THU, DEC 22, 1983, 10:37 AM     PAGE   9

         END;  { else }
      IF i < nextlabel-1 THEN
         write(output,',')
      ELSE
         writeln(output,';');
   END; {for}
writeln(output);
writeln(output,'END$ & ibtree &');
IF err_occurred THEN
   setjcw( -1 );

END.  {ibgen}
```

```
UIBGEN.WORK.PD8510              THU, DEC 22, 1983, 10:37 AM     PAGE   1

)p off
1
1,$s/-cmd_0,/ 12417,/g
1,$s/-cmd_[1-9],/ 12417,/g
1,$s/-cmd_decimal_pt,/ 12425,/g
1,$s/-cmd_minus,/ 12417,/g
1,$s/-cmd_plus,/ 12417,/g
1,$s/-cmd_quote,/ 4261,/g
1,$s/-cmd_label,/ 4267,/g
1,$s/-cmd_block_a,/  173,/g
/\&  129 \&.*@/ka
/\&  174 \&.*@/kb
/\&  129 \&.*cmd_illegal/kc
/\&  173 \&.*cmd_illegal/kd
'br dibtree1.work
'a,'bd
'dr dibtree2.work
'c,'dd
w
q
```

```
SIBTBL.WORK.PD8510              THU, DEC 22, 1983, 10:37 AM     PAGE   1

           cmd_enter;
"          cmd_enter line-feed;
;          cmd_enter;
0          cmd_0 these values (0-9, +, -, .) are for auto-replacement;
1          cmd_1;
2          cmd_2;
3          cmd_3;
4          cmd_4;
5          cmd_5;
6          cmd_6;
7          cmd_7;
8          cmd_8;
9          cmd_9;
.          cmd_decimal_pt;
-          cmd_minus;
+          cmd_plus;
"          cmd_quote   (the value here is for later replacement);
#A         cmd_block_a (the value here is for later replacement);
ADDRAUTC   cmd_auto_cmd_addr;
ADDRMINO   cmd_system_bus_addr;
ADDRPASS   cmd_pass_thru_addr;
ADDRPLOT   cmd_plotter_addr;
ADDRPRIN   cmd_printer_addr;
ADDRSOUR   cmd_source_addr;
ADDRTEST   cmd_test_set_addr;
ATTE1      cmd_atten_port1;
ATTE2      cmd_atten_port2;
AUTO       cmd_auto_scale;
AUXV       cmd_aux_domain;
AVERO      cmd_if_avg_off;
AVER1      cmd_if_avg_on;
AVEROFF    cmd_if_avg_off;
AVERON     cmd_if_avg_on;
CENT       cmd_center;
CF         cmd_center  For backward compatibility;
CHAN1      cmd_ch1;
CHAN2      cmd_ch2;
CHEQ       cmd_couple_stimulus;
CHNE       cmd_uncouple_stimulus;
CLES       cmd_clear_status;
CONT       cmd_continuous;
CONVOFF    cmd_convert_off;
CONVO      cmd_convert_off;
CONVRECI   cmd_convert_recip;
CONVY      cmd_convert_to_y;
CONVZ      cmd_convert_to_z;
CORRO      cmd_correction_off;
CORR1      cmd_correction_on;
CORROFF    cmd_correction_off;
CORRON     cmd_correction_on;
CRTO       cmd_crt_off;
CRTOFF     cmd_crt_off;
CS         cmd_clear_status  For backward compatibility;
CW         cmd_cw;
DATAMEMO   cmd_d_and_m;
```

```
SIBTBL.WORK.PD8510              THU, DEC 22, 1983, 10:37 AM     PAGE   2

DATAPLUS   cmd_d_plus_m;
DATAINTO   cmd_d_into_m;
DATAMINU   cmd_d_minus_m;
DATATIME   cmd_d_mpy_m;
DATADIVI   cmd_d_div_m;
DATA1      cmd_memory_ch1;
DATA2      cmd_memory_ch2;
DATAONLY   cmd_data;
DELA       cmd_delay;
DENOO      cmd_illegal;
DENOR1     cmd_illegal;
DENOR2     cmd_illegal;
DENOB1     cmd_illegal;
DENOSER1   cmd_illegal;
DENOSER2   cmd_illegal;
DF         cmd_span    For backward compatibility;
DN         cmd_down    For backward compatibility;
DOWN       cmd_down;
ELED       cmd_elect_delay;
ENTRO      cmd_entry_off;
ENTROFF    cmd_entry_off;
EQUA       cmd_mkrval;
EXCIO      cmd_illegal;
EXCI1      cmd_illegal;
EXCI2      cmd_illegal;
EXCIOFF    cmd_illegal;
EXCINONE   cmd_illegal;
FA         cmd_start   For backward compatibility;
FB         cmd_stop    For backward compatibility;
FORM1      cmd_xfer_binary;
FORM2      cmd_xfer_ieee1;
FORM3      cmd_xfer_ieee2;
FORM4      cmd_xfer_ascii;
FREQ       cmd_freq_domain;
FULL       cmd_quadrant_full;
GAINO      cmd_if_no_gain;
GAIN1      cmd_if_12db_gain;
GAIN2      cmd_if_24db_gain;
GAIN3      cmd_if_36db_gain;
GAIN4      cmd_if_48db_gain;
GAINAUTO   cmd_if_gain_auto;
GAINOFF    cmd_if_no_gain;
GAINREFE   cmd_if_ref_port;
GAINTEST   cmd_if_test_port;
GATEO      cmd_gate_off;
GATE1      cmd_gate_on;
GATECENT   cmd_gate_center;
GATEMAXI   cmd_max_gate_window;
GATEMINI   cmd_min_gate_window;
GATENORM   cmd_normal_gate_window;
GATEOFF    cmd_gate_off;
GATEON     cmd_gate_on;
GATESPAN   cmd_gate_span;
GATESTAR   cmd_gate_start;
GATESTOP   cmd_gate_stop;
HOLD       cmd_hold;
```

```
SIBTBL.WORK.PD8510              THU, DEC 22, 1983, 10:37 AM     PAGE   3

IMAG       cmd_imaginary;
INPUCALC01 cmd_input_cal_coeff1;
INPUCALC02 cmd_input_cal_coeff2;
INPUCALC03 cmd_input_cal_coeff3;
INPUCALC04 cmd_input_cal_coeff4;
INPUCALC05 cmd_input_cal_coeff5;
INPUCALC06 cmd_input_cal_coeff6;
INPUCALC07 cmd_input_cal_coeff7;
INPUCALC08 cmd_input_cal_coeff8;
INPUCALC09 cmd_input_cal_coeff9;
INPUCALC10 cmd_input_cal_coeff10;
INPUCALC11 cmd_input_cal_coeff11;
INPUCALC12 cmd_input_cal_coeff12;
INPUDATA   cmd_input_data;
INPUFORM   cmd_input_formatted;
INPURAW1   cmd_input_raw1;
INPURAW2   cmd_input_raw2;
INPURAW3   cmd_input_raw3;
INPURAW4   cmd_input_raw4;
INVS       cmd_y_smith;
IP         cmd_preset  For backward compatibility;
KEYC       cmd_keycode;
LB         cmd_label (the value here is for later replacement);
LEFL       cmd_quadrant_21;
LEFU       cmd_quadrant_11;
LINM       cmd_linear_mag;
LOCA       cmd_peek_poke_addr;
LOCKO      cmd_illegal;
LOCKA1     cmd_illegal;
LOCKA2     cmd_illegal;
LOCKOFF    cmd_illegal;
LOCKNONE   cmd_illegal;
LOGM       cmd_mag;
MAGO       cmd_illegal;
MARKO      cmd_marker_off;
MARK1      cmd_marker_1;
MARK2      cmd_marker_2;
MARK3      cmd_marker_3;
MARK4      cmd_marker_4;
MARK5      cmd_marker_5;
MARKMAXI   cmd_mkr_to_max;
MARKMINI   cmd_mkr_to_min;
MARKOFF    cmd_marker_off;
MARRO      cmd_no_ref_mkr  This entire set needs work (incl legends);
MARR1      cmd_ref_mkr1;
MARR2      cmd_ref_mkr2;
MARR3      cmd_ref_mkr3;
MARR4      cmd_ref_mkr4;
MARR5      cmd_ref_mkr5;
MARROFF    cmd_no_ref_mkr;
MATH       cmd_math;
MEAS       cmd_measurement_restart;
MEMO1      cmd_memory1;
MEMO2      cmd_memory2;
MEMO3      cmd_memory3;
MEMO4      cmd_memory4;
```

```
SIBTBL.WORK.PD8510          THU, DEC 22, 1983, 10:37 AM     PAGE   4

MEMOONLY    cmd_mem;
MEMUCOPY    cmd_copy;
MENUCALI    cmd_cal_menu;
MENUDELM    cmd_delta_marker;
MENUDISP    cmd_display_menu;
MENUDOMA    cmd_domain_menu;
MENUDUAL    cmd_dual_ch;
MENUFORM    cmd_format_menu;
MENUGAIN    cmd_if_gain_menu;
MENUHPIB    cmd_hpib_info;
MENUMARK    cmd_marker_menu;
MENUNUMP    cmd_n_points_menu;
MENUPARA    cmd_param_menu;
MENUPOIN    cmd_n_points_menu;
MENUPOWE    cmd_power_menu;
MENURECA    cmd_recall;
MENUREDE    cmd_redefine_param;
MENUREFP    cmd_ref_plane_menu;
MENURESP    cmd_response_menu;
MENUSAVE    cmd_save;
MENUSERV    cmd_service_menu;
MENUSTIM    cmd_stimulus_menu;
MENUSYST    cmd_system_menu;
MENUTAPE    cmd_tape_menu;
MENUTEST    cmd_test_menu;
MONI        cmd_monitor;
NUMERA1     cmd_illegal;
NUMERA2     cmd_illegal;
NUMEB1      cmd_illegal;
NUMEB2      cmd_illegal;
NUMESERV1   cmd_illegal;
NUMESERV2   cmd_illegal;
NUMESERV3   cmd_illegal;
NUMESERV4   cmd_illegal;
NUMESERV5   cmd_illegal;
NUMESERV6   cmd_illegal;
NUMESERV7   cmd_illegal;
NUMESERV8   cmd_illegal;
NUMG        cmd_n_groups_hpib;
OA          cmd_output_active  For backward compatibility;
OI          cmd_output_id  For backward compatibility;
OPERO       cmd_illegal;
OPERNEXT    cmd_illegal;
OPEROFF     cmd_illegal;
OPERPARA    cmd_op_params;
OPERPLOT    cmd_illegal;
OPERPRIN    cmd_illegal;
OS          cmd_output_status  For backward compatibility;
OUTPACTI    cmd_output_active;
OUTPCALC01  cmd_output_cal_coeff1;
OUTPCALC02  cmd_output_cal_coeff2;
OUTPCALC03  cmd_output_cal_coeff3;
OUTPCALC04  cmd_output_cal_coeff4;
OUTPCALC05  cmd_output_cal_coeff5;
OUTPCALC06  cmd_output_cal_coeff6;
OUTPCALC07  cmd_output_cal_coeff7;
```

```
SIBTBL.WORK.PD8510          THU, DEC 22, 1983, 10:37 AM     PAGE   5

OUTPCALC08  cmd_output_cal_coeff8;
OUTPCALC09  cmd_output_cal_coeff9;
OUTPCALC10  cmd_output_cal_coeff10;
OUTPCALC11  cmd_output_cal_coeff11;
OUTPCALC12  cmd_output_cal_coeff12;
OUTPDATA    cmd_output_data;
OUTPERRO    cmd_output_error;
OUTPFORM    cmd_output_formatted;
OUTPIDEN    cmd_output_id;
OUTPKEY     cmd_output_key;
OUTPMARK    cmd_output_marker;
OUTPMEMO    cmd_output_memory;
OUTPPLOT    cmd_output_plot;
OUTPRAW1    cmd_output_raw1;
OUTPRAW2    cmd_output_raw2;
OUTPRAW3    cmd_output_raw3;
OUTPRAW4    cmd_output_raw4;
OUTPSTAT    cmd_output_status;
OVER        cmd_overlay;
PEEK        cmd_peek;
PEN1        cmd_pen1;
PEN2        cmd_pen2;
PEN3        cmd_pen3;
PEN4        cmd_pen4;
PEN5        cmd_pen5;
PEN6        cmd_pen6;
PEN7        cmd_pen7;
PEN8        cmd_pen8;
PHAO        cmd_phase_offset;
PHAS        cmd_phase;
PLAN1       cmd_ref_plane_1;
PLAN2       cmd_ref_plane_2;
PLOTALL     cmd_plot_all;
PLOTGRAT    cmd_plot_graticule;
PLOTMARK    cmd_plot_marker;
PLOTTEXT    cmd_plot_text;
PLOTTRAC    cmd_plot_trace;
POIN101     cmd_101_points;
POIN201     cmd_201_points;
POIN401     cmd_401_points;
POIN51      cmd_51_points;
POKE        cmd_poke;
POLALINM    cmd_linear_polar;
POLALOGM    cmd_log_polar;
POLAREIM    cmd_imag_vs_real;
POWE        cmd_source_power;
PRES        cmd_preset;
PRIO        cmd_prior_menu;
RAMP        cmd_swept;
RC0         cmd_recall_last  For backward compatibility;
RC1         cmd_recall_1  For backward compatibility;
RC2         cmd_recall_2  For backward compatibility;
RC3         cmd_recall_3  For backward compatibility;
RC4         cmd_recall_4  For backward compatibility;
RC5         cmd_recall_5  For backward compatibility;
REAL        cmd_real;
```

```
SIBTBL.WORK.PD8510          THU, DEC 22, 1983, 10:37 AM     PAGE   6

RECA1       cmd_recall_1;
RECA2       cmd_recall_2;
RECA3       cmd_recall_3;
RECA4       cmd_recall_4;
RECA5       cmd_recall_5;
RECALAST    cmd_recall_last;
REDES11     cmd_illegal;
REDES12     cmd_illegal;
REDES21     cmd_illegal;
REDES22     cmd_illegal;
REDEUSER1   cmd_illegal;
REDEUSER2   cmd_illegal;
REDEUSER3   cmd_illegal;
REDEUSER4   cmd_illegal;
REFP        cmd_ref_position;
REFV        cmd_ref_value;
REVI        cmd_revision;
RIGL        cmd_quadrant_22;
RIGU        cmd_quadrant_12;
RM          cmd_srq_mask  For backward compatibility;
S11         cmd_s11;
S12         cmd_s12;
S21         cmd_s21;
S22         cmd_s22;
SAVE1       cmd_save_1;
SAVE2       cmd_save_2;
SAVE3       cmd_save_3;
SAVE4       cmd_save_4;
SAVE5       cmd_save_5;
SCAL        cmd_scale;
SELC1       cmd_cal_set_1;
SELC2       cmd_cal_set_2;
SELC3       cmd_cal_set_3;
SELC4       cmd_cal_set_4;
SELC5       cmd_cal_set_5;
SELC6       cmd_cal_set_6;
SELC7       cmd_cal_set_7;
SELC8       cmd_cal_set_8;
SING        cmd_single_ch;
SL0         cmd_power_slope_off  For backward compatibility;
SL1         cmd_power_slope  For backward compatibility;
SLOPO       cmd_power_slope_off;
SLOP1       cmd_power_slope;
SLOPOFF     cmd_power_slope_off;
SLOPON      cmd_power_slope;
SMIC        cmd_polar;
SMOO0       cmd_smoothing_off;
SMOO1       cmd_smoothing_on;
SMOOOF      cmd_smoothing_off;
SMOOON      cmd_smoothing_on;
SOFT1       cmd_key_1;
SOFT2       cmd_key_2;
SOFT3       cmd_key_3;
SOFT4       cmd_key_4;
SOFT5       cmd_key_5;
SOFT6       cmd_key_6;
```

```
SIBTBL.WORK.PD8510          THU, DEC 22, 1983, 10:37 AM     PAGE   7

SOFT7       cmd_key_7;
SOFT8       cmd_key_8;
SPAN        cmd_span;
SPLI        cmd_split;
SRQM        cmd_srq_mask;
STAR        cmd_start;
STEP        cmd_stepped;
STIO        cmd_illegal;
STOP        cmd_stop;
SV1         cmd_save_1  For backward compatibility;
SV2         cmd_save_2  For backward compatibility;
SV3         cmd_save_3  For backward compatibility;
SV4         cmd_save_4  For backward compatibility;
SV5         cmd_save_5  For backward compatibility;
SWET        cmd_sweep_time;
SYSL        cmd_privib_local;
SYSR        cmd_privib_remote;
SYSTO       cmd_illegal;
SYSTOFF     cmd_illegal;
SYSTPARA    cmd_system_params;
SYSTPLOT    cmd_illegal;
SYSTPRIN    cmd_illegal;
TAPEDELE    cmd_illegal;
TAPEDIRE    cmd_illegal;
TAPEINIT    cmd_illegal;
TAPERECO    cmd_illegal;
TAPEREST    cmd_illegal;
TAPEUNDE    cmd_illegal;
TIMB        cmd_time_domain;
TIMEIMPU    cmd_tdr_impulse;
TIMEMAXI    cmd_max_time_window;
TIMEMINI    cmd_min_time_window;
TIMENORM    cmd_normal_time_window;
TIMESTEP    cmd_tdr_step;
TIML        cmd_tdr_domain;
TITL        cmd_label (the value here is for later replacement);
UP          cmd_up;
USER1       cmd_user1;
USER2       cmd_user2;
USER3       cmd_user3;
USER4       cmd_user4;
SWR         cmd_swr;
!
NOTE:       labels used here must be from the command case label values.
```

```
CIBTREE.WORK.PD8510             THU, DEC 22, 1983, 10:37 AM     PAGE   1

INTEGER CONSTANT tablesize :=     1548;
```

```
FIBTREE.WORK.PD8510             THU, DEC 22, 1983, 10:37 AM     PAGE   1

#FILE cibtree.work;

EXTERNAL BYTE TABLE mnem.L;
EXTERNAL INTEGER TABLE ib_link.L;
```

```
SIBTREE.WORK.PD8510             THU, DEC 22, 1983, 10:37 AM     PAGE   1

M68KL,P,"ibtree"
BEGIN & ibtree &

#FILE ccmddecl.work;

GLOBAL BYTE TABLE mnem :=    0,  1,  2,  3,  4,  5,  6,  7,  8,  9, 10,
&   11 &      11, 12, 13, 14, 15, 16, 17, 18, 19, 20, 21, 22, 23, 24, 25,
&   26 &      26, 27, 28, 29, 30, 31, 32, '!, '", '#, '$, '%, '&, '', '(,
&   41 &      '), '*, '+, ',, '-, '., '/, '0, '1, '2, '3, '4, '5, '6, '7,
&   56 &      '8, '9, ':, ';, '<, '=, '>, '?, '@, 'A, 'B, 'C, 'D, 'E, 'F,
&   71 &      'G, 'H, 'I, 'J, 'K, 'L, 'M, 'N, 'O, 'P, 'Q, 'R, 'S, 'T, 'U,
&   86 &      'V, 'W, 'X, 'Y, 'Z, '[, '\, '], '^, '_, '`, 'a, 'b, 'c, 'd,
&  101 &      'e, 'f, 'g, 'h, 'i, 'j, 'k, 'l, 'm, 'n, 'o, 'p, 'q, 'r, 's,
&  116 &      't, 'u, 'v, 'w, 'x, 'y, 'z, '{, '|, '}, '~,127, '@,

&  129 &  & numeric & ' , '", '., 'E, 'U, 'C, '$, '@, ' , '", 'E, 'U,
&  141 &                'C, '$, '@, ' , '+, '-, '", 'U, 'C, '$, '@, ' ,
&  153 &                '", 'U, 'C, '$, '@, '1, '2, '3, '4, '@, 'N, '@,
&  165 &  & string  & '", '@, '$, '", ' , '@, '], '@,
&  173 &  & block_a & '@, '@,

&  175 &      'A, '@, 'C, '@, 'T, '@, 'U, '@, 'D, '@, 'N, '@, 'I, '@, 'S,
&  190 &      '@, 'S, '@, 'T, '@, 'D, '@, 'N, '@, 'I, '@, 'A, 'L, 'R, '@,
&  205 &      'R, '@, 'U, '@, 'O, '@, 'T, '@, 'S, '@, 'E, '@, 'A, 'M, 'P,
&  220 &      'S, 'T, '@, 'R, '@, 'D, '@, '1, '2, '@, 'E, '@, 'T, '@, 'D,
&  235 &      '@, 'V, '@, 'T, 'X, '@, 'F, '@, 'F, 'N, '@, 'O, '1, 'D, '@,
&  250 &      'R, '@, 'E, '@, 'D, 'T, 'U, 'V, '@, 'T, '@, 'N, '@, '1, '2,
&  265 &      '@, 'N, '@, 'Q, '@, 'E, '@, 'A, 'E, 'N, '@, 'S, '@, 'E, '@,
&  280 &      'F, '@, 'F, '@, 'I, '@, 'C, '@, 'E, '@, 'D, 'O, 'R, 'Y, 'Z,
&  295 &      '@, 'T, 'V, '@, 'F, '@, 'F, 'N, '@, 'O, '1, 'D, '@, 'R, '@,
&  310 &      'N, 'R, '@, 'F, '@, 'F, '@, 'O, 'D, '@, 'T, '@, 'E, 'F, 'H,
&  325 &      'L, 'D, 'R, 'S, 'W, '@, 'Q, '@, 'M, '@, 'U, '@, 'N, '@, 'E,
&  340 &      'I, '@, 'S, '@, 'U, '@, 'L, '@, 'D, '@, 'T, '@, 'N, '@, 'E,
&  355 &      '@, 'M, '@, 'I, '@, 'I, '@, 'V, '@, 'I, '@, 'Y, '@, 'L, '@,
&  370 &      'N, '@, 'M, 'P, 'I, 'T, 'D, '1, '2, 'D, '@, 'A, '@, 'T, '@,
&  385 &      'A, '@, '1, '2, '@, '1, '@, '1, '2, '@, 'R, '@, 'E, '@, 'O,
&  400 &      'A, 'B, 'S, '@, 'O, '@, 'L, 'X, '@, 'N, '@, 'W, '@, 'A, 'E,
&  415 &      'F, 'N, 'O, '@, 'D, '@, 'E, '@, 'F, '@, 'F, '@, 'O, 'D, '@,
&  430 &      'R, '@, 'T, '@, 'A, '@, 'U, '@, 'F, '@, 'F, '@, 'E, '@, 'H,
&  445 &      '@, 'D, '@, 'O, '1, '2, 'D, 'N, '@, 'I, '@, 'C, '@, 'L, 'N,
&  460 &      'Q, 'X, '@, '1, '2, '3, '4, '@, 'M, '@, 'R, '@, 'B, '@, 'E,
&  475 &      '@, 'L, '@, 'L, '@, 'A, 'B, 'D, 'R, 'U, '@, 'O, '@, 'T, '@,
&  490 &      'U, '@, 'F, '@, 'F, '@, 'E, '@, 'F, '@, 'E, '@, 'T, '@, 'S,
&  505 &      '@, 'E, '@, 'O, '1, '2, '3, '4, 'R, 'D, 'R, 'T, '@, 'N, '@,
&  520 &      'T, '@, 'N, '@, 'E, '@, 'I, '@, 'X, '@, 'I, '@, 'N, '@, 'A,
&  535 &      'I, '@, 'M, '@, 'R, '@, 'D, '@, 'F, '@, 'F, 'N, '@, 'N, '@,
&  550 &      'A, '@, 'R, '@, 'P, '@, 'A, 'D, '@, 'P, 'T, '@, 'O, '1, 'C,
&  565 &      'M, 'N, 'O, 'S, '@, 'E, '@, 'I, 'T, '@, 'A, '@, 'D, '@, 'L,
&  580 &      '@, 'O, '@, 'G, '@, 'A, '@, '1, '2, '3, '4, '5, '6, '7, '8,
&  595 &      '9, '@, 'O, '1, '2, '@, 'O, '1, '@, 'C, '@, 'L, '@, 'A, '@,
&  610 &      'A, '@, 'T, '@, 'A, '@, 'M, '@, 'R, '@, 'D, '@, '1, '2, '3,
&  625 &      '4, '@, 'W, '@, 'A, '@, 'C, 'D, 'F, 'R, '@, 'U, '@, 'S, '@,
&  640 &      'P, 'V, '@, 'M, 'N, 'P, '@, 'C, '@, 'Y, '@, 'E, '@, 'L, 'U,
&  655 &      '@, 'F, '@, 'M, '@, 'N, '@, '1, '2, '@, 'F, '@, 'F, '@, 'E,
&  670 &      '@, 'N, '@, 'D, '@, 'O, 'A, 'D, 'N, '@, 'A, 'K, '@, 'M, '@,
```

```
SIBTREE.WORK.PD8510             THU, DEC 22, 1983, 10:37 AM     PAGE   2

&  685 &      'C, 'G, '@, 'B, 'E, 'I, 'D, '@, 'D, '@, 'I, '@, 'X, '@, 'I,
&  700 &      '@, 'N, '@, 'A, 'I, '@, 'F, '@, 'F, '@, 'O, '1, '2, '3, '4,
&  715 &      '5, 'M, 'O, '@, 'F, '@, 'F, '@, 'O, '1, '2, '3, '4, '5, 'O,
&  730 &      '@, 'K, 'R, '@, 'H, '@, 'G, 'R, 'T, '@, 'S, '@, 'Y, '@, 'L,
&  745 &      '@, 'H, '@, '1, '2, '3, '4, 'O, '@, 'O, '@, 'Y, '@, 'P, '@,
&  760 &      'I, '@, 'L, '@, 'D, 'A, '@, 'M, '@, 'L, '@, 'P, '@, 'S, '@,
&  775 &      'A, '@, 'M, '@, 'L, '@, 'A, '@, 'E, 'I, 'D, 'U, '@, 'M, '@,
&  790 &      'R, '@, 'O, '@, 'N, '@, 'I, '@, 'A, '@, 'B, '@, 'I, '@, 'P,
&  805 &      '@, 'K, '@, 'R, '@, 'A, '@, 'P, '@, 'M, '@, 'U, '@, 'A, '@,
&  820 &      'R, '@, 'N, '@, 'E, '@, 'I, 'W, '@, 'A, 'D, '@, 'A, '@, 'E,
&  835 &      '@, 'P, '@, 'P, '@, 'C, 'D, 'F, 'S, '@, 'E, '@, 'E, '@, 'V,
&  850 &      '@, 'V, '@, 'R, '@, 'M, '@, 'I, '@, 'T, '@, 'S, '@, 'A, 'E,
&  865 &      'T, 'Y, '@, 'E, '@, 'P, '@, 'T, '@, 'S, '@, 'A, 'E, '@, 'C,
&  880 &      'D, 'F, 'G, 'H, 'M, 'N, 'P, 'R, 'S, 'T, '@, 'U, '@, 'A, 'M,
&  895 &      'N, '@, 'I, '@, 'N, '@, 'A, 'E, 'O, '@, '1, '2, '@, '1, '2,
&  910 &      '@, '1, '2, '3, '4, '5, '6, '7, '8, '@, 'V, '@, 'R, '@, 'E,
&  925 &      '@, 'A, 'B, 'S, '@, 'E, 'G, '@, 'M, '@, 'U, '@, 'T, '@, 'X,
&  940 &      '@, 'E, '@, 'F, '@, 'F, '@, 'R, '@, 'R, '@, 'T, '@, 'O, '@,
&  955 &      'N, '@, 'I, '@, 'A, 'L, 'R, '@, 'O, 'N, 'O, 'P, '@, 'R, '@,
&  970 &      'E, '@, 'I, '@, 'T, '@, 'C, '@, '1, '2, '3, '4, '5, '6, '7,
&  985 &      '8, '9, '@, 'O, '1, '2, '@, 'O, '1, '@, 'C, '@, 'L, '@, 'A,
& 1000 &      '@, 'A, '@, 'T, '@, 'A, '@, 'D, '@, 'R, '@, 'R, '@, 'M, '@,
& 1015 &      'R, '@, 'O, '@, 'N, '@, 'E, '@, 'D, '@, 'Y, '@, 'E, '@, 'K,
& 1030 &      '@, 'R, '@, 'D, '@, 'M, '@, 'A, 'E, '@, 'T, '@, 'O, '@, 'L,
& 1045 &      '@, '1, '2, '3, '4, '@, 'W, '@, 'A, '@, 'T, '@, 'A, '@, 'T,
& 1060 &      '@, 'A, 'C, 'D, 'E, 'F, 'I, 'K, 'M, 'P, 'R, 'S, '@, 'P, '@,
& 1075 &      'T, '@, 'R, '@, 'E, '@, 'A, 'I, 'P, 'S, 'U, 'V, '@, 'K, '@,
& 1090 &      '1, '2, '3, '4, '5, '6, '7, '8, '@, 'E, 'N, '@, 'D, 'S, '@,
& 1105 &      'A, '@, '1, '2, '@, 'N, '@, 'L, '@, 'L, '@, 'T, '@, 'A, '@,
& 1120 &      'R, '@, 'K, '@, 'R, '@, 'A, '@, 'T, '@, 'X, '@, 'C, '@, 'A,
& 1135 &      '@, 'E, 'R, '@, 'A, 'G, 'M, 'T, '@, 'T, '@, 'A, 'O, '@, '1,
& 1150 &      '@, 'O, '@, '1, '@, 'O, '@, '1, '@, 'O, '@, '1, '@, '1, '2,
& 1165 &      '4, '5, '@, 'N, '@, 'E, '@, 'M, '@, 'N, '@, 'A, '@, 'G, 'Q,
& 1180 &      'I, 'O, '@, 'M, '@, 'I, '@, 'E, '@, 'L, 'R, '@, 'A, '@, 'E,
& 1195 &      '@, 'I, 'K, 'L, 'W, '@, 'S, '@, 'O, '@, 'E, 'I, '@, 'E, 'N,
& 1210 &      'L, 'O, 'R, '@, 'P, '@, 'M, '@, 'O, '1, '2, '3, '4, '5, '@,
& 1225 &      'L, '@, 'T, '@, 'S, '@, 'A, '@, '1, '2, '3, '4, '5, 'L, '@,
& 1240 &      'A, '@, '1, '2, '@, '1, '2, '@, '1, '2, '@, '1, '2, '3, '4,
& 1255 &      '@, 'R, '@, 'E, '@, 'S, '@, 'S, 'U, '@, 'E, '@, 'P, 'V, '@,
& 1270 &      'I, '@, 'A, 'C, 'D, 'F, 'V, '@, 'L, 'U, '@, 'G, '@, 'A, 'C,
& 1285 &      'E, 'I, 'M, '@, '1, '2, '@, '1, '2, '@, '1, '2, '3, '4, '5,
& 1300 &      '@, 'E, '@, 'V, '@, 'L, '@, 'A, '@, '1, '2, '3, '4, '5, '6,
& 1315 &      '7, '8, '@, 'C, '@, 'L, '@, 'G, '@, 'N, '@, 'F, '@, 'F, 'N,
& 1330 &      '@, 'O, '1, 'D, '@, 'P, '@, 'O, '1, 'D, '@, 'C, '@, 'F, 'N,
& 1345 &      '@, 'O, '1, 'D, '@, 'O, '@, 'I, 'D, '@, '1, '2, '3, '4, '5,
& 1360 &      '6, '7, '8, '@, 'T, '@, 'F, '@, 'N, '@, 'I, '@, 'A, 'L, '@,
& 1375 &      'M, '@, 'Q, '@, 'R, '@, 'P, '@, 'O, '@, 'P, '@, 'A, 'E, 'I,
& 1390 &      'D, '@, '1, '2, '3, '4, '5, '@, 'T, '@, 'E, 'R, '@, 'F, '@,
& 1405 &      'F, '@, 'A, '@, 'R, '@, 'T, '@, 'O, '@, 'N, '@, 'I, '@, 'A,
& 1420 &      'L, 'R, '@, 'O, 'O, 'P, '@, 'L, 'R, 'T, '@, 'S, '@, '1, '2,
& 1435 &      'R, 'C, 'E, 'I, 'L, 'M, 'O, 'P, 'R, 'T, 'V, 'W, 'Y, '@, 'E,
& 1450 &      '@, 'L, '@, 'E, '@, 'R, '@, 'E, 'I, '@, 'T, '@, 'I, '@, 'N,
& 1465 &      '@, 'O, '@, 'T, '@, 'C, 'S, '@, 'E, '@, 'E, '@, 'D, '@, 'N,
& 1480 &      '@, 'D, 'I, 'R, 'U, '@, 'E, '@, 'P, '@, 'U, '@, 'P, '@, 'M,
& 1495 &      '@, 'I, '@, 'X, '@, 'I, '@, 'N, '@, 'R, 'I, '@, 'M, '@, 'R,
& 1510 &      '@, 'O, '@, 'P, '@, 'E, '@, 'T, '@, 'I, 'M, 'N, 'S, '@, 'B,
```

```
SIBTREE.WORK.PD8510            THU, DEC 22, 1983, 10:37 AM     PAGE   3

& 1525 &    'E, 'L, '@, 'L, '@, 'M, 'T, '@, 'A, 'I, '@, '1, '2, '3, '4,
& 1540 &    '@, 'R, '@, 'E, '@, 'P, 'S, '@;

GLOBAL INTEGER TABLE ib_link := -cmd_illegal,-cmd_illegal,-cmd_illegal,
&    3 &   -cmd_illegal,-cmd_illegal,-cmd_illegal,-cmd_illegal,
&    7 &   -cmd_illegal,-cmd_illegal,-cmd_illegal,-cmd_enter,
&   11 &   -cmd_illegal,-cmd_illegal,-cmd_illegal,-cmd_illegal,
&   15 &   -cmd_illegal,-cmd_illegal,-cmd_illegal,-cmd_illegal,
&   19 &   -cmd_illegal,-cmd_illegal,-cmd_illegal,-cmd_illegal,
&   23 &   -cmd_illegal,-cmd_illegal,-cmd_illegal,-cmd_illegal,
&   27 &   -cmd_illegal,-cmd_illegal,-cmd_illegal,-cmd_illegal,
&   31 &   -cmd_illegal,-cmd_illegal,-cmd_illegal, 4261,   175,
&   36 &   -cmd_illegal,-cmd_illegal,-cmd_illegal,-cmd_illegal,
&   40 &   -cmd_illegal,-cmd_illegal,-cmd_illegal, 12417,-cmd_enter,
&   45 &    12417, 12425,-cmd_illegal, 12417, 12417, 12417,
&   51 &    12417, 12417, 12417, 12417, 12417, 12417, 12417,
&   58 &   -cmd_illegal,-cmd_enter,-cmd_illegal,-cmd_illegal,
&   62 &   -cmd_illegal,-cmd_illegal,-cmd_illegal,   254,-cmd_illegal,
&   67 &      322,   413,   458,   480,   575,   581,   643,
&   74 &   -cmd_illegal,   651,   688,   901,   935,  1081,  1208,
&   81 &   -cmd_illegal,  1283,  1433,  1533,  1545,-cmd_illegal,
&   87 &   -cmd_illegal,-cmd_illegal,-cmd_illegal,-cmd_illegal,
&   91 &   -cmd_illegal,-cmd_illegal,-cmd_illegal,-cmd_illegal,
&   95 &   -cmd_illegal,-cmd_illegal,-cmd_illegal,-cmd_illegal,
&   99 &   -cmd_illegal,-cmd_illegal,-cmd_illegal,-cmd_illegal,
&  103 &   -cmd_illegal,-cmd_illegal,-cmd_illegal,-cmd_illegal,
&  107 &   -cmd_illegal,-cmd_illegal,-cmd_illegal,-cmd_illegal,
&  111 &   -cmd_illegal,-cmd_illegal,-cmd_illegal,-cmd_illegal,
&  115 &   -cmd_illegal,-cmd_illegal,-cmd_illegal,-cmd_illegal,
&  119 &   -cmd_illegal,-cmd_illegal,-cmd_illegal,-cmd_illegal,
&  123 &   -cmd_illegal,-cmd_illegal,-cmd_illegal,-cmd_illegal,
&  127 &   -cmd_illegal,-cmd_illegal,

&  129 & & numeric & 129,16513,16521,16528,158,163,-cmd_enter,
&  136 &             -cmd_illegal,137,16521,16528,158,163,-cmd_enter,
&  143 &             -cmd_illegal,144,16536,16536,16536,158,163,
&  150 &             -cmd_enter,-cmd_illegal,152,16536,158,163,
&  156 &             -cmd_enter,-cmd_illegal,-cmd_u1,-cmd_u2,-cmd_u3,
&  161 &             -cmd_u4,-cmd_illegal,-cmd_enter,
&  164 & & string  & -cmd_illegal,167,8357,-cmd_quote,8357,167,
&  170 &             -cmd_illegal,-cmd_label,8363,
&  173 & & block_a & 20654,-cmd_block_a-24576,

&  175 &      173,-cmd_illegal,-cmd_auto_cmd_addr,-cmd_illegal,
&  179 &      177,-cmd_illegal,   179,-cmd_illegal,-cmd_system_bus_addr,
&  184 &   -cmd_illegal,   183,-cmd_illegal,   185,-cmd_illegal,
&  189 &   -cmd_pass_thru_addr,-cmd_illegal,   189,-cmd_illegal,
&  193 &   -cmd_plotter_addr,-cmd_illegal,   193,-cmd_illegal,
&  197 &   -cmd_printer_addr,-cmd_illegal,   197,-cmd_illegal,   191,
&  202 &      195,   199,-cmd_illegal,-cmd_source_addr,-cmd_illegal,
&  207 &      205,-cmd_illegal,   207,-cmd_illegal,-cmd_test_set_addr,
&  212 &   -cmd_illegal,   211,-cmd_illegal,   213,-cmd_illegal,   181,
&  218 &      187,   201,   209,   215,-cmd_illegal,   217,-cmd_illegal,
&  225 &      223,-cmd_illegal,-cmd_atten_port1,-cmd_atten_port2,
&  229 &   -cmd_illegal,   227,-cmd_illegal,   230,-cmd_illegal,
&  234 &   -cmd_auto_scale,-cmd_illegal,-cmd_aux_domain,-cmd_illegal,
```

```
SIBTREE.WORK.PD8510            THU, DEC 22, 1983, 10:37 AM     PAGE   4

&  238 &      234,   236,-cmd_illegal,-cmd_if_avg_off,-cmd_illegal,
&  243 &      241,-cmd_if_avg_on,-cmd_illegal,-cmd_if_avg_off,
&  247 &   -cmd_if_avg_on,   243,-cmd_illegal,   246,-cmd_illegal,
&  252 &      250,-cmd_illegal,   225,   232,   238,   252,-cmd_illegal,
&  259 &   -cmd_center,-cmd_illegal,   259,-cmd_illegal,-cmd_ch1,
&  264 &   -cmd_ch2,-cmd_illegal,   263,-cmd_illegal,
&  268 &   -cmd_couple_stimulus,-cmd_illegal,-cmd_uncouple_stimulus,
&  271 &   -cmd_illegal,   266,   268,   270,-cmd_illegal,
&  276 &   -cmd_clear_status,-cmd_illegal,   276,-cmd_illegal,
&  280 &   -cmd_convert_off,-cmd_illegal,   280,-cmd_illegal,
&  284 &   -cmd_convert_recip,-cmd_illegal,   284,-cmd_illegal,   286,
&  289 &   -cmd_illegal,   282,-cmd_convert_off,   288,
&  293 &   -cmd_convert_to_y,-cmd_convert_to_z,-cmd_illegal,
&  296 &   -cmd_continuous,   290,-cmd_illegal,-cmd_correction_off,
&  300 &   -cmd_illegal,   299,-cmd_correction_on,-cmd_illegal,
&  304 &   -cmd_correction_off,-cmd_correction_on,   301,-cmd_illegal,
&  308 &      304,-cmd_illegal,   296,   308,-cmd_illegal,-cmd_crt_off,
&  314 &   -cmd_illegal,   313,-cmd_illegal,-cmd_crt_off,   315,
&  319 &   -cmd_illegal,   317,-cmd_illegal,   261,-cmd_center,   272,
&  325 &      278,   310,   320,-cmd_clear_status,-cmd_cw,-cmd_illegal,
&  331 &   -cmd_d_and_m,-cmd_illegal,   331,-cmd_illegal,-cmd_d_minus_m,
&  336 &   -cmd_illegal,   335,-cmd_illegal,   333,   337,-cmd_illegal,
&  342 &   -cmd_d_plus_m,-cmd_illegal,   342,-cmd_illegal,   344,
&  347 &   -cmd_illegal,-cmd_d_into_m,-cmd_illegal,   348,-cmd_illegal,
&  352 &      350,-cmd_illegal,-cmd_d_mpy_m,-cmd_illegal,   354,
&  357 &   -cmd_illegal,   356,-cmd_illegal,-cmd_d_div_m,-cmd_illegal,
&  362 &      360,-cmd_illegal,   362,-cmd_illegal,-cmd_data,
&  367 &   -cmd_illegal,   366,-cmd_illegal,   368,-cmd_illegal,   339,
&  373 &      346,   352,   358,   364,-cmd_memory_ch1,-cmd_memory_ch2,
&  379 &      370,-cmd_illegal,   372,-cmd_illegal,   381,-cmd_illegal,
&  385 &   -cmd_delay,-cmd_illegal,-cmd_illegal,-cmd_illegal,
&  389 &   -cmd_illegal,-cmd_illegal,-cmd_illegal,-cmd_illegal,
&  393 &   -cmd_illegal,-cmd_illegal,   392,-cmd_illegal,   395,
&  398 &   -cmd_illegal,-cmd_illegal,   387,   390,   397,-cmd_illegal,
&  404 &      399,-cmd_illegal,   385,   404,-cmd_illegal,-cmd_down,
&  410 &   -cmd_illegal,   409,-cmd_illegal,   383,   406,-cmd_span,
&  416 &   -cmd_down,   411,-cmd_illegal,-cmd_elect_delay,-cmd_illegal,
&  421 &      419,-cmd_illegal,-cmd_entry_off,-cmd_illegal,   423,
&  426 &   -cmd_illegal,-cmd_entry_off,   425,-cmd_illegal,   427,
&  431 &   -cmd_illegal,   430,-cmd_illegal,-cmd_mkrval,-cmd_illegal,
&  436 &      434,-cmd_illegal,-cmd_illegal,-cmd_illegal,   438,
&  441 &   -cmd_illegal,-cmd_illegal,-cmd_illegal,   442,-cmd_illegal,
&  446 &      444,-cmd_illegal,-cmd_illegal,-cmd_illegal,-cmd_illegal,
&  451 &      440,   446,-cmd_illegal,   448,-cmd_illegal,   454,
&  457 &   -cmd_illegal,   421,   432,   436,   456,-cmd_illegal,
&  463 &   -cmd_xfer_binary,-cmd_xfer_ieee1,-cmd_xfer_ieee2,
&  466 &   -cmd_xfer_ascii,-cmd_illegal,   463,-cmd_illegal,   468,
&  471 &   -cmd_illegal,-cmd_freq_domain,-cmd_illegal,   472,
&  475 &   -cmd_illegal,-cmd_quadrant_full,-cmd_illegal,   476,
&  479 &   -cmd_illegal,-cmd_start,-cmd_stop,   470,   474,   478,
&  485 &   -cmd_illegal,-cmd_if_gain_auto,-cmd_illegal,   486,
&  489 &   -cmd_illegal,   488,-cmd_illegal,-cmd_if_no_gain,
&  493 &   -cmd_illegal,   492,-cmd_illegal,-cmd_if_ref_port,
&  497 &   -cmd_illegal,   496,-cmd_illegal,   498,-cmd_illegal,
&  502 &   -cmd_if_test_port,-cmd_illegal,   502,-cmd_illegal,   504,
&  507 &   -cmd_illegal,-cmd_if_no_gain,-cmd_if_12db_gain,
```

```
SIBTREE.WORK.PD8510            THU, DEC 22, 1983, 10:38 AM     PAGE   5

&  510 &   -cmd_if_24db_gain,-cmd_if_36db_gain,-cmd_if_48db_gain,   490,
&  514 &      494,   500,   506,-cmd_illegal,   508,-cmd_illegal,
&  520 &   -cmd_gate_center,-cmd_illegal,   520,-cmd_illegal,   522,
&  525 &   -cmd_illegal,-cmd_max_gate_window,-cmd_illegal,   526,
&  529 &   -cmd_illegal,-cmd_min_gate_window,-cmd_illegal,   530,
&  533 &   -cmd_illegal,   528,   532,-cmd_illegal,
&  537 &   -cmd_normal_gate_window,-cmd_illegal,   537,-cmd_illegal,
&  541 &      539,-cmd_illegal,-cmd_gate_off,-cmd_illegal,   543,
&  546 &   -cmd_gate_on,-cmd_illegal,-cmd_gate_span,-cmd_illegal,   548,
&  551 &   -cmd_illegal,-cmd_gate_start,-cmd_illegal,-cmd_gate_stop,
&  555 &   -cmd_illegal,   552,   554,-cmd_illegal,   550,   556,
&  561 &   -cmd_illegal,-cmd_gate_off,-cmd_gate_on,   524,   534,   541,
&  567 &      545,   559,-cmd_illegal,   562,-cmd_illegal,   518,   570,
&  574 &   -cmd_illegal,   572,-cmd_illegal,-cmd_hold,-cmd_illegal,
&  579 &      577,-cmd_illegal,   579,-cmd_illegal,-cmd_imaginary,
&  584 &   -cmd_illegal,   583,-cmd_illegal,-cmd_input_cal_coeff1,
&  588 &   -cmd_input_cal_coeff2,-cmd_input_cal_coeff3,
&  590 &   -cmd_input_cal_coeff4,-cmd_input_cal_coeff5,
&  592 &   -cmd_input_cal_coeff6,-cmd_input_cal_coeff7,
&  594 &   -cmd_input_cal_coeff8,-cmd_input_cal_coeff9,-cmd_illegal,
&  597 &   -cmd_input_cal_coeff10,-cmd_input_cal_coeff11,
&  599 &   -cmd_input_cal_coeff12,-cmd_illegal,   587,   597,
&  603 &   -cmd_illegal,   601,-cmd_illegal,   604,-cmd_illegal,   606,
&  609 &   -cmd_illegal,-cmd_input_data,-cmd_illegal,   610,
&  613 &   -cmd_illegal,   612,-cmd_illegal,-cmd_input_formatted,
&  617 &   -cmd_illegal,   616,-cmd_illegal,   618,-cmd_illegal,
&  622 &   -cmd_input_raw1,-cmd_input_raw2,-cmd_input_raw3,
&  625 &   -cmd_input_raw4,-cmd_illegal,   622,-cmd_illegal,   627,
&  630 &   -cmd_illegal,   608,   614,   620,   629,-cmd_illegal,   631,
&  637 &   -cmd_illegal,-cmd_y_smith,-cmd_illegal,   636,   638,
&  642 &   -cmd_illegal,   585,   640,-cmd_preset,-cmd_illegal,
&  647 &   -cmd_keycode,-cmd_illegal,   647,-cmd_illegal,   649,
&  652 &   -cmd_illegal,-cmd_quadrant_21,-cmd_quadrant_11,-cmd_illegal,
&  656 &      653,-cmd_illegal,-cmd_linear_mag,-cmd_illegal,   658,
&  661 &   -cmd_illegal,-cmd_illegal,-cmd_illegal,-cmd_illegal,
&  665 &   -cmd_illegal,-cmd_illegal,   665,-cmd_illegal,-cmd_illegal,
&  670 &   -cmd_illegal,   669,-cmd_illegal,   671,-cmd_illegal,
&  675 &   -cmd_illegal,   662,   667,   673,-cmd_illegal,
&  680 &   -cmd_peek_poke_addr,   675,-cmd_illegal,-cmd_mag,
&  684 &   -cmd_illegal,   680,   683,-cmd_illegal, 4267,   656,
&  690 &      660,   685,-cmd_illegal,-cmd_illegal,-cmd_illegal,
&  695 &   -cmd_mkr_to_max,-cmd_illegal,   695,-cmd_illegal,
&  699 &   -cmd_mkr_to_min,-cmd_illegal,   699,-cmd_illegal,   697,
&  704 &      701,-cmd_illegal,-cmd_marker_off,-cmd_illegal,   706,
&  709 &   -cmd_illegal,-cmd_marker_off,-cmd_marker_1,-cmd_marker_2,
&  713 &   -cmd_marker_3,-cmd_marker_4,-cmd_marker_5,   703,   708,
&  718 &   -cmd_illegal,-cmd_no_ref_mkr,-cmd_illegal,   719,
&  722 &   -cmd_illegal,-cmd_no_ref_mkr,-cmd_ref_mkr1,-cmd_ref_mkr2,
&  726 &   -cmd_ref_mkr3,-cmd_ref_mkr4,-cmd_ref_mkr5,   721,
&  730 &   -cmd_illegal,   710,   723,-cmd_illegal,-cmd_math,
&  735 &   -cmd_illegal,   693,   731,   734,-cmd_illegal,
&  740 &   -cmd_measurement_restart,-cmd_illegal,-cmd_mem,-cmd_illegal,
&  744 &      742,-cmd_illegal,   744,-cmd_illegal,-cmd_memory1,
&  749 &   -cmd_memory2,-cmd_memory3,-cmd_memory4,   746,-cmd_illegal,
&  754 &      748,-cmd_illegal,-cmd_copy,-cmd_illegal,   756,
&  759 &   -cmd_illegal,-cmd_cal_menu,-cmd_illegal,   760,-cmd_illegal,
```

```
SIBTREE.WORK.PD8510            THU, DEC 22, 1983, 10:38 AM     PAGE   6

&  764 &      758,   762,-cmd_illegal,-cmd_delta_marker,-cmd_illegal,
&  769 &      767,-cmd_illegal,-cmd_display_menu,-cmd_illegal,   771,
&  774 &   -cmd_illegal,-cmd_domain_menu,-cmd_illegal,   775,
&  778 &   -cmd_illegal,-cmd_dual_ch,-cmd_illegal,   779,-cmd_illegal,
&  783 &      769,   773,   777,   781,-cmd_illegal,-cmd_format_menu,
&  789 &   -cmd_illegal,   788,-cmd_illegal,   790,-cmd_illegal,
&  794 &   -cmd_if_gain_menu,-cmd_illegal,   794,-cmd_illegal,   796,
&  799 &   -cmd_illegal,-cmd_hpib_info,-cmd_illegal,   800,-cmd_illegal,
&  804 &      802,-cmd_illegal,-cmd_marker_menu,-cmd_illegal,   806,
&  809 &   -cmd_illegal,   808,-cmd_illegal,-cmd_n_points_menu,
&  813 &   -cmd_illegal,   812,-cmd_illegal,   814,-cmd_illegal,
&  818 &   -cmd_param_menu,-cmd_illegal,   818,-cmd_illegal,
&  822 &   -cmd_n_points_menu,-cmd_illegal,-cmd_power_menu,-cmd_illegal,
&  826 &      822,   824,-cmd_illegal,   820,   826,-cmd_illegal,
&  832 &   -cmd_recall,-cmd_illegal,-cmd_redefine_param,-cmd_illegal,
&  836 &   -cmd_ref_plane_menu,-cmd_illegal,-cmd_response_menu,
&  839 &   -cmd_illegal,   832,   834,   836,   838,-cmd_illegal,   840,
&  846 &   -cmd_illegal,-cmd_save,-cmd_illegal,   847,-cmd_illegal,
&  851 &   -cmd_service_menu,-cmd_illegal,   851,-cmd_illegal,
&  855 &   -cmd_stimulus_menu,-cmd_illegal,   855,-cmd_illegal,
&  859 &   -cmd_system_menu,-cmd_illegal,   859,-cmd_illegal,   849,
&  864 &      853,   857,   861,-cmd_illegal,-cmd_tape_menu,
&  869 &   -cmd_illegal,   868,-cmd_illegal,-cmd_test_menu,-cmd_illegal,
&  874 &      872,-cmd_illegal,   870,   874,-cmd_illegal,   764,   783,
&  881 &      792,   798,   804,   810,   816,   829,   845,   863,
&  889 &      876,-cmd_illegal,   879,-cmd_illegal,   740,   754,   891,
&  896 &   -cmd_illegal,-cmd_monitor,-cmd_illegal,   897,-cmd_illegal,
&  901 &      736,   893,   899,-cmd_illegal,-cmd_illegal,-cmd_illegal,
&  907 &   -cmd_illegal,-cmd_illegal,-cmd_illegal,-cmd_illegal,
&  911 &   -cmd_illegal,-cmd_illegal,-cmd_illegal,-cmd_illegal,
&  915 &   -cmd_illegal,-cmd_illegal,-cmd_illegal,-cmd_illegal,
&  919 &   -cmd_illegal,   911,-cmd_illegal,   920,-cmd_illegal,   922,
&  925 &   -cmd_illegal,   905,   908,   924,-cmd_illegal,   926,
&  931 &   -cmd_n_groups_hpib,-cmd_illegal,   930,-cmd_illegal,   933,
&  936 &   -cmd_illegal,-cmd_illegal,-cmd_illegal,   937,-cmd_illegal,
&  941 &      939,-cmd_illegal,-cmd_illegal,-cmd_illegal,   943,
&  946 &   -cmd_illegal,-cmd_op_params,-cmd_illegal,   947,-cmd_illegal,
&  951 &   -cmd_illegal,-cmd_illegal,   951,-cmd_illegal,-cmd_illegal,
&  956 &   -cmd_illegal,   955,-cmd_illegal,   949,   953,   957,
&  962 &   -cmd_illegal,-cmd_illegal,   941,   945,   959,-cmd_illegal,
&  968 &      963,-cmd_illegal,   968,-cmd_illegal,-cmd_output_active,
&  973 &   -cmd_illegal,   972,-cmd_illegal,   974,-cmd_illegal,
&  978 &   -cmd_output_cal_coeff1,-cmd_output_cal_coeff2,
&  980 &   -cmd_output_cal_coeff3,-cmd_output_cal_coeff4,
&  982 &   -cmd_output_cal_coeff5,-cmd_output_cal_coeff6,
&  984 &   -cmd_output_cal_coeff7,-cmd_output_cal_coeff8,
&  986 &   -cmd_output_cal_coeff9,-cmd_illegal,-cmd_output_cal_coeff10,
&  989 &   -cmd_output_cal_coeff11,-cmd_output_cal_coeff12,-cmd_illegal,
&  992 &      978,   988,-cmd_illegal,   992,-cmd_illegal,   995,
&  998 &   -cmd_illegal,   997,-cmd_illegal,-cmd_output_data,
& 1002 &   -cmd_illegal,  1001,-cmd_illegal,  1003,-cmd_illegal,
& 1007 &   -cmd_output_error,-cmd_illegal,  1007,-cmd_illegal,  1009,
& 1012 &   -cmd_illegal,-cmd_output_formatted,-cmd_illegal,  1013,
& 1016 &   -cmd_illegal,  1015,-cmd_illegal,-cmd_output_id,-cmd_illegal,
& 1021 &     1019,-cmd_illegal,  1021,-cmd_illegal,-cmd_output_key,
& 1026 &   -cmd_illegal,  1025,-cmd_illegal,-cmd_output_marker,
```

```
SIBTREE.WORK.PD8510          THU, DEC 22, 1983, 10:38 AM     PAGE  7

& 1030 &   -cmd_illegal,  1029,-cmd_illegal,-cmd_output_memory,
& 1034 &   -cmd_illegal,  1033,-cmd_illegal,  1031,  1035,-cmd_illegal,
& 1040 &   -cmd_output_plot,-cmd_illegal,  1040,-cmd_illegal,  1042,
& 1045 &   -cmd_illegal,-cmd_output_raw1,-cmd_output_raw2,
& 1048 &   -cmd_output_raw3,-cmd_output_raw4,-cmd_illegal,  1046,
& 1052 &   -cmd_illegal,  1051,-cmd_illegal,-cmd_output_status,
& 1056 &   -cmd_illegal,  1055,-cmd_illegal,  1057,-cmd_illegal,   976,
& 1062 &      999,  1005,  1011,  1017,  1023,  1027,  1037,  1044,
& 1070 &     1053,  1059,-cmd_illegal,  1061,-cmd_illegal,  1073,
& 1076 &   -cmd_illegal,-cmd_overlay,-cmd_illegal,  1077,-cmd_illegal,
& 1081 &   -cmd_output_active,-cmd_output_id,   970,-cmd_output_status,
& 1085 &     1075,  1079,-cmd_illegal,-cmd_peek,-cmd_illegal,-cmd_pen1,
& 1091 &   -cmd_pen2,-cmd_pen3,-cmd_pen4,-cmd_pen5,-cmd_pen6,-cmd_pen7,
& 1097 &   -cmd_pen8,-cmd_illegal,  1088,  1090,-cmd_illegal,
& 1102 &   -cmd_phase_offset,-cmd_phase,-cmd_illegal,  1102,
& 1106 &   -cmd_illegal,-cmd_ref_plane_1,-cmd_ref_plane_2,-cmd_illegal,
& 1110 &     1107,-cmd_illegal,-cmd_plot_all,-cmd_illegal,  1112,
& 1115 &   -cmd_illegal,-cmd_plot_graticule,-cmd_illegal,  1116,
& 1119 &   -cmd_illegal,  1118,-cmd_illegal,-cmd_plot_marker,
& 1123 &   -cmd_illegal,  1122,-cmd_illegal,  1124,-cmd_illegal,
& 1128 &   -cmd_plot_text,-cmd_illegal,  1128,-cmd_illegal,
& 1132 &   -cmd_plot_trace,-cmd_illegal,  1132,-cmd_illegal,  1130,
& 1137 &     1134,-cmd_illegal,  1114,  1120,  1126,  1136,-cmd_illegal,
& 1144 &     1139,-cmd_illegal,  1110,  1144,-cmd_illegal,
& 1149 &   -cmd_101_points,-cmd_illegal,  1149,-cmd_illegal,
& 1153 &   -cmd_201_points,-cmd_illegal,  1153,-cmd_illegal,
& 1157 &   -cmd_401_points,-cmd_illegal,  1157,-cmd_illegal,
& 1161 &   -cmd_51_points,-cmd_illegal,  1151,  1155,  1159,  1161,
& 1167 &   -cmd_illegal,  1163,-cmd_illegal,-cmd_poke,-cmd_illegal,
& 1172 &   -cmd_linear_polar,-cmd_illegal,  1172,-cmd_illegal,
& 1176 &   -cmd_log_polar,-cmd_illegal,  1176,-cmd_illegal,  1174,
& 1181 &     1178,-cmd_illegal,-cmd_imag_vs_real,-cmd_illegal,  1183,
& 1186 &   -cmd_illegal,  1185,-cmd_illegal,  1180,  1187,-cmd_illegal,
& 1192 &     1189,-cmd_illegal,-cmd_source_power,-cmd_illegal,  1168,
& 1197 &     1170,  1192,  1194,-cmd_illegal,-cmd_preset,-cmd_illegal,
& 1203 &   -cmd_prior_menu,-cmd_illegal,  1201,  1203,-cmd_illegal,
& 1208 &     1099,  1105,  1146,  1196,  1205,-cmd_illegal,-cmd_swept,
& 1215 &   -cmd_illegal,  1214,-cmd_illegal,-cmd_recall_last,
& 1219 &   -cmd_recall_1,-cmd_recall_2,-cmd_recall_3,-cmd_recall_4,
& 1223 &   -cmd_recall_5,-cmd_illegal,-cmd_real,-cmd_illegal,
& 1227 &   -cmd_recall_last,-cmd_illegal,  1227,-cmd_illegal,  1229,
& 1232 &   -cmd_illegal,-cmd_recall_1,-cmd_recall_2,-cmd_recall_3,
& 1236 &   -cmd_recall_4,-cmd_recall_5,  1231,-cmd_illegal,  1233,
& 1241 &   -cmd_illegal,-cmd_illegal,-cmd_illegal,-cmd_illegal,
& 1245 &   -cmd_illegal,-cmd_illegal,-cmd_illegal,  1242,  1245,
& 1250 &   -cmd_illegal,-cmd_illegal,-cmd_illegal,-cmd_illegal,
& 1254 &   -cmd_illegal,-cmd_illegal,  1251,-cmd_illegal,  1256,
& 1259 &   -cmd_illegal,  1258,-cmd_illegal,  1248,  1260,-cmd_illegal,
& 1265 &     1262,-cmd_illegal,-cmd_ref_position,-cmd_ref_value,
& 1269 &   -cmd_illegal,-cmd_revision,-cmd_illegal,  1225,  1240,  1265,
& 1275 &     1267,  1270,-cmd_illegal,-cmd_quadrant_22,-cmd_quadrant_12,
& 1280 &   -cmd_illegal,  1278,-cmd_illegal,  1216,  1218,  1272,  1281,
& 1287 &   -cmd_srq_mask,-cmd_illegal,-cmd_s11,-cmd_s12,-cmd_illegal,
& 1292 &   -cmd_s21,-cmd_s22,-cmd_illegal,-cmd_save_1,-cmd_save_2,
& 1297 &   -cmd_save_3,-cmd_save_4,-cmd_save_5,-cmd_illegal,  1295,
& 1302 &   -cmd_illegal,  1301,-cmd_illegal,-cmd_scale,-cmd_illegal,
```

```
SIBTREE.WORK.PD8510          THU, DEC 22, 1983, 10:38 AM     PAGE  8

& 1307 &     1305,-cmd_illegal,-cmd_cal_set_1,-cmd_cal_set_2,
& 1311 &   -cmd_cal_set_3,-cmd_cal_set_4,-cmd_cal_set_5,-cmd_cal_set_6,
& 1315 &   -cmd_cal_set_7,-cmd_cal_set_8,-cmd_illegal,  1309,
& 1319 &   -cmd_illegal,  1318,-cmd_illegal,-cmd_single_ch,-cmd_illegal,
& 1324 &     1322,-cmd_illegal,-cmd_power_slope_off,-cmd_illegal,  1326,
& 1329 &   -cmd_power_slope,-cmd_illegal,-cmd_power_slope_off,
& 1332 &   -cmd_power_slope,  1328,-cmd_illegal,  1331,-cmd_illegal,
& 1337 &   -cmd_power_slope_off,-cmd_power_slope,  1335,-cmd_illegal,
& 1341 &   -cmd_polar,-cmd_illegal,-cmd_smoothing_off,-cmd_smoothing_on,
& 1345 &   -cmd_illegal,-cmd_smoothing_off,-cmd_smoothing_on,  1343,
& 1349 &   -cmd_illegal,  1346,-cmd_illegal,  1341,  1350,-cmd_illegal,
& 1355 &   -cmd_key_1,-cmd_key_2,-cmd_key_3,-cmd_key_4,-cmd_key_5,
& 1360 &   -cmd_key_6,-cmd_key_7,-cmd_key_8,-cmd_illegal,  1355,
& 1365 &   -cmd_illegal,  1364,-cmd_illegal,-cmd_span,-cmd_illegal,
& 1370 &   -cmd_split,-cmd_illegal,  1368,  1370,-cmd_illegal,
& 1375 &   -cmd_srq_mask,-cmd_illegal,  1375,-cmd_illegal,-cmd_start,
& 1380 &   -cmd_illegal,-cmd_stepped,-cmd_illegal,-cmd_illegal,
& 1384 &   -cmd_illegal,-cmd_stop,-cmd_illegal,  1379,  1381,  1383,
& 1390 &     1385,-cmd_illegal,-cmd_save_1,-cmd_save_2,-cmd_save_3,
& 1395 &   -cmd_save_4,-cmd_save_5,-cmd_illegal,-cmd_sweep_time,
& 1399 &   -cmd_illegal,  1398,-cmd_swr,-cmd_illegal,-cmd_illegal,
& 1404 &   -cmd_illegal,  1403,-cmd_illegal,-cmd_system_params,
& 1408 &   -cmd_illegal,  1407,-cmd_illegal,-cmd_illegal,-cmd_illegal,
& 1413 &     1411,-cmd_illegal,-cmd_illegal,-cmd_illegal,  1415,
& 1418 &   -cmd_illegal,  1409,  1413,  1417,-cmd_illegal,-cmd_illegal,
& 1424 &     1405,  1419,-cmd_illegal,-cmd_privib_local,
& 1428 &   -cmd_privib_remote,  1423,-cmd_illegal,  1427,-cmd_illegal,
& 1433 &     1289,  1292,  1303,  1307,  1320,  1324,  1337,  1352,
& 1441 &     1366,  1372,  1377,  1387,  1392,  1400,  1431,
& 1448 &   -cmd_illegal,-cmd_illegal,-cmd_illegal,  1449,-cmd_illegal,
& 1453 &   -cmd_illegal,-cmd_illegal,  1453,-cmd_illegal,  1451,  1455,
& 1459 &   -cmd_illegal,-cmd_illegal,-cmd_illegal,  1460,-cmd_illegal,
& 1464 &     1462,-cmd_illegal,-cmd_illegal,-cmd_illegal,-cmd_illegal,
& 1469 &   -cmd_illegal,  1466,  1468,-cmd_illegal,  1470,-cmd_illegal,
& 1475 &   -cmd_illegal,-cmd_illegal,  1475,-cmd_illegal,  1477,
& 1480 &   -cmd_illegal,  1457,  1464,  1473,  1479,-cmd_illegal,  1481,
& 1487 &   -cmd_illegal,  1486,-cmd_illegal,-cmd_tdr_impulse,
& 1491 &   -cmd_illegal,  1490,-cmd_illegal,  1492,-cmd_illegal,
& 1496 &   -cmd_max_time_window,-cmd_illegal,  1496,-cmd_illegal,
& 1500 &   -cmd_min_time_window,-cmd_illegal,  1500,-cmd_illegal,  1498,
& 1505 &     1502,-cmd_illegal,-cmd_normal_time_window,-cmd_illegal,
& 1509 &     1507,-cmd_illegal,  1509,-cmd_illegal,-cmd_tdr_step,
& 1514 &   -cmd_illegal,  1513,-cmd_illegal,  1515,-cmd_illegal,  1494,
& 1520 &     1504,  1511,  1517,-cmd_illegal,-cmd_time_domain,  1519,
& 1526 &   -cmd_tdr_domain,-cmd_illegal, 4267,-cmd_illegal,  1524,
& 1531 &     1528,-cmd_illegal,  1488,  1530,-cmd_illegal,-cmd_user1,
& 1537 &   -cmd_user2,-cmd_user3,-cmd_user4,-cmd_illegal,  1536,
& 1542 &   -cmd_illegal,  1541,-cmd_illegal,-cmd_up,  1543,-cmd_illegal;

ENDS & ibtree &
```

```
DIBTREE1.WORK.PD8510          THU, DEC 22, 1983, 10:38 AM     PAGE  1

&  129 &  & numeric & ' , '~, '., 'E, 'U, 'C, '$, '@, ' , '~; 'E, 'U,
&  141 &              'C, '$, '@, ' , '+, '-, '~, 'U, 'C, '$, '@, ' ,
&  153 &              '~, 'U, 'C, '$, '@, '1, '2, '3, '4, '@, 'N, '@,
&  165 &  & string  & '", '@, '$, '", ' , '@, '], '@,
&  173 &  & block_a & '@, '@,
```

```
DIBTREE2.WORK.PD8510          THU, DEC 22, 1983, 10:38 AM     PAGE  1

&  129 & & numeric & 129,16513,16521,16528,158,163,-cmd_enter,
&  136 &             -cmd_illegal,137,16521,16528,158,163,-cmd_enter,
&  143 &             -cmd_illegal,144,16536,16536,16536,158,163,
&  150 &             -cmd_enter,-cmd_illegal,152,16536,158,163,
&  156 &             -cmd_enter,-cmd_illegal,-cmd_u1,-cmd_u2,-cmd_u3,
&  161 &             -cmd_u4,-cmd_illegal,-cmd_enter,
&  164 & & string  & -cmd_illegal,167,8357,-cmd_quote,8357,167,
&  170 &             -cmd_illegal,-cmd_label,8363,
&  173 & & block_a & 20654,-cmd_block_a-24576,
```

```
MICROMPY.WORK.PD8510            THU, DEC 22, 1983, 10:38 AM     PAGE   1


.META MICROMPY (K=200,N=200,S=2000) .LIST OFF
.SPL
  INTEGER CODEUNIT , MPYTBL;
  LOGICAL LDUM;
  INTEGER ARRAY LENCODE(1:16):=                 %
    2,2,2,2,2,2,1,2,1,0,  3,3,1,1,1,1;
  INTEGER ARRAY POSCODE(1:16):=
    14,12,10,8,6,4,3,1,0,0,  8,11,7,6,5,15;
  LOGICAL ARRAY CODE(0:15);
  LOGICAL ARRAY DEFCODE(0:31):=
    0, 1,1, 0, 1,1, 0,0, 1,0, 0,0, 0,0, 0,0,
    0,0,0,0,0,0,0,0,  1,1,1,1,1,1,0,0;
  BYTE ARRAY MPYTBLN(0:7):="MPYTBL ";
  INTRINSIC QUIT;
.ENDSPL;
.TABLE DECLIST:="MUXC", "MUXB", "MUXA", "EXP",
    "ACC", "CC", "CTREN", "UDECODE", "MPYEN", "REPEAT",
    "ADECODE", "BDECODE", "NEXT", "SUMPR", "DUAL", "UGO";
.TABLE ERRORS:="BIT ALREADY DEFINED","EXPECTED SEMICOLON",
 "EXPECTED COLON","EXPECTED PARENTHESIS","EXPECTED EQUAL SIGN",
 "ILLEGAL STATEMENT","INVALID PARAMETER","NAME ALREADY DEFINED",
 "RECOVERY ERROR","ILLEGAL BUS SOURCE","ILLEGAL OPERAND",
 "MISSING END","EXPECTED NUMBER","EXPECTED COMMA";
.PREAMBLE TREEDEFS.META.UPSOFT;
.PREAMBLE TRMLIB.META.UPSOFT;
.PREAMBLE OUTREE.META.UPSOFT;
.PREAMBLE ABSIO.META.UPSOFT;
   & CODE TEST AND SET PROCEDURE   &
   & MDE -2=SET CODE, -1=SET BOTH, 0=TEST/SET BOTH, 1=TEST ONLY &
.SPL
 PROCEDURE SC (START,LEN,VAL,MDE);
 VALUE START,LEN,VAL,MDE;
 INTEGER START,LEN,VAL,MDE;
 BEGIN LOGICAL IBIT;INTEGER TVAL,I;
  MFLAG:=1;
  IF MDE>-1 THEN BEGIN
   TVAL:=IF VAL>=0 THEN VAL ELSE 32768 + VAL;
   FOR I:=START UNTIL START+LEN-1  DO
   BEGIN IBIT:=(TVAL MOD 2)=1;TVAL:=TVAL&ASR(1);
    IF (CODE(I).(15:1) XOR IBIT)LAND CODE(I).(14:1) THEN MFLAG:=0;
    END;
   END;
  IF MDE<1 AND MFLAG=1 THEN BEGIN
   TVAL:=IF VAL>=0 THEN VAL ELSE 32768 + VAL;
   FOR I:=START UNTIL START+LEN-1 DO
    BEGIN IBIT:=(TVAL MOD 2)=1; TVAL:=TVAL&ASR(1);
    IF LEN=16 AND I=START + 15 THEN IBIT:=(VAL<0);
    CODE(I).(15:1):=IBIT;
    IF MDE>-2 THEN CODE(I).(14:1):=1;
    END;
   END;
  END;
 INTEGER PROCEDURE CVAL(START,LEN);
 VALUE START,LEN; INTEGER START,LEN;
 BEGIN INTEGER TVAL,I; TVAL:=0;
```

```
MICROMPY.WORK.PD8510            THU, DEC 22, 1983, 10:38 AM     PAGE   2


  FOR I:=START+LEN-1 STEP -1 UNTIL START  DO BEGIN
   TVAL:=TVAL&LSL(1);
   IF CODE(I).(15:1)=1 THEN TVAL:=TVAL+1; END;
  CVAL:=TVAL;END;
 PROCEDURE OUTHEX(VAL,LEN);
 VALUE VAL,LEN; INTEGER VAL,LEN;
 BEGIN INTEGER I,TVAL,TINIT; TINIT:=VAL;IF VAL<0 THEN LEN:=4;
  FOR I:=4 STEP -1 UNTIL 1 DO BEGIN
   TVAL:=TINIT.(0:4); TINIT:=TINIT&LSL(4);
   IF I<= LEN THEN BEGIN
    IF TVAL>9 THEN TVAL:=TVAL+55 ELSE TVAL:=TVAL+48;
    CIO(TVAL); END; END; END;
 PROCEDURE OUTLINE; BEGIN
 FOR INDX:=0 UNTIL IXV-4 DO CIO(NV(INDX)); END;
  LISTSRCE:=0;NCLASS(33):=NCLASS(34):=NCLASS(62):=NCLASS(63):=%100;
  NCLASS(37):=NCLASS(38):=NCLASS(39):=NCLASS(46):=NCLASS(47):=%100;
  NCLASS(47):=NCLASS(47):=NCLASS(60):=NCLASS(42):=%100;
 <<  ! " # $ % ' * . / < > ? AND AMPERSAND ARE LABEL CHARACTERS >>
.ENDSPL;
 &     &
MICROMPY=SETUP PASS;
PASS=$(DECLARE/MAP/END/EOFILE/PROCEDURE/'\ TL1) -(.EMPTY) ?6E;
END="$END" .OUTLINE [\] EXIT;
EOFILE="#EOF#" <"MISSING $END">LISTUNIT EXIT;
MAP="$MAP" TL1 OREC !"PCNTR:=512; ACNTR:=16;" PASSM;
SETUP= LUN [^P^A] .ABSAD(@PCNTR)
  !"INCNT:=0; NVW(-3):=NVW(-2):=NVW(-1):=8224;"
  <"MPY MICROASSEMBLER.1(4.28.80)" !"IU:=40;"
   .DATELINE(NU(IU)) !"IU:=IU+27;" \,\>LISTUNIT NXTL;
LUN  =!"INUNIT:=FOPEN(TREETEXT,%147); PROMPT;"
      !"CODEUNIT:=FOPEN(TREEOUT,%20,1,60);"
      !"IF < THEN BEGIN PRINT'FILE'INFO(0); QUIT(2); END;"
      !"LISTUNIT:=OUTUNIT:=FOPEN(TREELIST,%517,1,-80);"
      !"IF < THEN BEGIN PRINT'FILE'INFO(0); QUIT(3); END;"
      !"MPYTBL:=FOPEN(MPYTBLN,%114,1);"
      !"IF < THEN BEGIN PRINT'FILE'INFO(0); QUIT(4); END;";
DECLARE="DECLARE" .RESWD(DECLIST) ?7E +': ?3E
   EQU ?7E $(', ('\ TL1/.EMPTY) EQU ?7E) '; ?2E TL1;
EQU=.LBL '= ?5E .DNM ?13E !"NCNTR:=NVALUE;" RMVNUM .KPOP() [*T]
  (!"MFLAG:=SFLAG=0 LOR (SVALUE=NCNTR LAND SFLAG=TCNTR+32);")
   ?8E .SETV(NCNTR) .SETF(TCNTR+32) .KPOP();
RMVNUM=.TEST(0,0) .REMOVE(ISTARVAL)/.EMPTY;
PROCEDURE="BEGIN" PNAME ?7E TL1 PBODY;
PBODY=INIT $(STATE TS INIT) "END" ?12E OREC TL1;
PNAME=.LBL (!"MFLAG:=SVALUE=0;")  ?8E
    !"PCNTR:=((PCNTR+15)/16)*16;" .SETF(1) .SETV(PCNTR);
OREC=!"OUTUNIT:=CODEUNIT; ABSX(PCNTR); OUTUNIT:=LISTUNIT;";
INIT=.EMPTY [^X !"DO CODE(XCNTR):=DEFCODE(XCNTR+ACNTR)
     UNTIL (XCNTR:=XCNTR+1)>15;"];
STATE=SUBSTAT $(', SUBSTAT ?6E) '; ?2E;
SUBSTAT=(CHRPT/DITEM .SC(POSCODE(SFLAG-32),LENCODE(SFLAG-32),SVALUE,0)
        ?1E (CHDEC/.EMPTY));
CHDEC=!"MFLAG:=(SFLAG=40 LAND SVALUE<4);" .SC(8,2,3,0) ?1E;
CHRPT=(<- .LBL.TEST(42,0)) .DNM ?13E .SC(10,4,16-(NVALUE+1)/2,0) ?1E
      RMVNUM;
DITEM= <- .LBL (!"MFLAG:=SFLAG>32 LAND SFLAG<43;");
```

```
MICROMPY.WORK.PD8510            THU, DEC 22, 1983, 10:38 AM     PAGE   3


NXTL=[.RLINE() !"NV(IXV):=%134;NV(IXV:=IXV+1):=%32;IXV:=IXV+1;"
  !"IBCK:=0;MCCP:=NCCP:=0D;"];
TL1=.EMPTY ["          "] .OUTLINE [\]  NXTL;
TS=.EMPTY OUTCODE .OUTLINE NXTL
  [\ !"KSP:=NSP:=0;"] OUTROMC;
OUTCODE=.OUTHEX(PCNTR,3) [" "]
     .OUTHEX(CVAL(8,8),2) .OUTHEX(CVAL(0,8),2) [" "];
OUTROMC=[!"OUTUNIT:=CODEUNIT; ABSRC(CVAL(0,16)); OUTUNIT:=LISTUNIT;"];
E=.EMPTY [+E] <.OUTSRTB(ERRNUM,ERRORS)>LISTUNIT
  !"KSP:=NSP:=0;TOS:=TOS:=QINIT;PUSH(Q,S);"
  => '\ NXTL (!"MFLAG:=ACNTR=0;"
   ("END" OREC TL1 PASS/--(DITEM) PBODY PASS/.EMPTY PASS)/.EMPTY PASSM);
EXIT=.EMPTY OREC <,\:E " ERRORS" \,\>LISTUNIT
      !"FCLOSE(CODEUNIT,%11,0);"
      !"IF < THEN BEGIN PRINT'FILE'INFu(0); QUIT(6); END;"
      !"FCLOSE(MPYTBL,%11,0);"
      !"IF < THEN BEGIN PRINT'FILE'INFO(0); QUIT(7); END;"
      !"LIMITS;TERMINATE;";
PASSM=INIT $(ORG/ '\ TL1/ END/ EOFILE/ MSTATE);
ORG="ORG" ('$ .HEX !"PCNTR:=HVALUE;"/ .DNM !"PCNTR:=NVALUE;")
    ?13E RMVNUM OREC TL1 !"PCNTR:=(PCNTR/2)*2 + 512;";
MSTATE=INIT ((<-.LBL +':) .TEST(0,0) ?8E .SETF(2)
      .SETV(PCNTR-2560) OMTBL/.EMPTY) SUBMSTAT ?4E $(', SUBMSTAT ?11E)
      '; ?2E TMS;
SUBMSTAT=MITEM .SC(POSCODE(SFLAG-32),LENCODE(SFLAG-32),SVALUE,0) ?1E
        (CHGO/.EMPTY);
MITEM=<- .LBL (!"MFLAG:=SFLAG>42 LAND SFLAG<50;");
CHGO=.TEST(48,0) .LBL ?7E .TEST(1,0) ?7E
    .SC(0,5,SVALUE/16,0) ?1E;
OMTBL=.EMPTY !"OUTUNIT:=MPYTBL;"
      ["GLOBAL INTEGER " * "=%FFFF" .OUTHEX(SVALUE,4) ";" \]
      !"OUTUNIT:=LISTUNIT;";
TMS=.EMPTY .OUTHEX(PCNTR-512,3) [" "] .OUTHEX(CVAL(8,8),2)
    .OUTHEX(CVAL(0,8),2) [" "] .OUTLINE NXTL [\ !"KSP:=NSP:=0;"]
     [!"OUTUNIT:=CODEUNIT; ABSRC(CVAL(0,8)); ABSRC(CVAL(8,8));"]
     [!"OUTUNIT:=LISTUNIT;"];
.END MICROMPY
```

```
CIDS.WORK.PD8510                THU, DEC 22, 1983, 10:38 AM     PAGE   1


COMMENT                                              process identifiers
   Process identifier assignments determine the relative priority for
scheduling processes that are ready to run, except for preemptive
scheduling due to interrupts.  The ready process with the highest
process id will be scheduled before processes with lower identifiers.
The main process becomes the idle process after initialization is
completed, therefore process id 0 (lowest priority) is reserved for the
main process.  Preemptive scheduling due to interrupts has higher
priority than normally scheduled processes, regardless of the process
id of the interrupt service process.  The interrupt vector number
determines relative priorities for interrupts -- the process with the
lowest interrupt vector number has the most priority and will preempt
interrupt service processes with higher interrupt vector numbers.
;

& interrupt vector numbers &
BYTE CONSTANT y_adc_vctr            := %0;   & highest priority &
                                             & coordinate with "irint" in
                                               file SINTRPT for autoclear&

BYTE CONSTANT refresh_vctr          := %1;
BYTE CONSTANT public_ib_vctr        := %2;
BYTE CONSTANT private_ib_vctr       := %3;
BYTE CONSTANT bottom_vctr           := %4;
BYTE CONSTANT rpg_vctr              := %5;
BYTE CONSTANT top_key_vctr          := %6;
BYTE CONSTANT uart_vctr             := %7;
BYTE CONSTANT tape_vctr             := %8;
BYTE CONSTANT private_ib_srq_vctr := %9;
BYTE CONSTANT tick_vctr             := %A;   & coordinate with "irint" in
                                               file SINTRPT for autoclear&
BYTE CONSTANT delay_timer_vctr      := %B;   & coordinate with "inint" in
                                               file SINTRPT for autoclear&

BYTE CONSTANT bubble_vctr           := %C;
BYTE CONSTANT vctr_d                := %D;
BYTE CONSTANT power_fail_vctr       := %E;
BYTE CONSTANT test_point_vctr       := %F;   & lowest priority &

& process ids &
INTEGER CONSTANT parser_id          := %F;   & highest priority &
INTEGER CONSTANT priv_ib_srq_id     := %E;
INTEGER CONSTANT bottom_id          := %D;
INTEGER CONSTANT rpg_id             := %C;
INTEGER CONSTANT top_key_id         := %B;
INTEGER CONSTANT keyboard_id        := %A;
INTEGER CONSTANT uart_id            := %9;
INTEGER CONSTANT command_id         := %8;
INTEGER CONSTANT control_id         := %7;
INTEGER CONSTANT pub_ib_in_id       := %6;
INTEGER CONSTANT pub_ib_out_id      := %5;
INTEGER CONSTANT array_update_id    := %4;
INTEGER CONSTANT ch1_id             := %3;
INTEGER CONSTANT ch2_id             := %2;
INTEGER CONSTANT retrace_id         := %1;
INTEGER CONSTANT idle_process       := %0;   & lowest priority &
```

```
FIFGAIN.WORK.PD8510          THU, DEC 22, 1983, 10:38 AM     PAGE   1

PROCEDURE  new_if_gain( gain );
   VALUE   gain;
   INTEGER gain;                                         EXTERNAL.L;
PROCEDURE  new_if_gain_port( port );
   VALUE   port;                     %
   INTEGER port;                                         EXTERNAL.L;
```

```
SIFGAIN.WORK.PD8510          THU, DEC 22, 1983, 10:38 AM     PAGE   1

M68KL,P,"ifgain"
BEGIN

#FILE fcontrol.work;
#FILE cyadc.work;
#FILE fchdata.work;
#FILE fmenu.work;
```

```
SIFGAIN.WORK.PD8510          THU, DEC 22, 1983, 10:38 AM     PAGE   2

#EJECT;
COMMENT
****************************************************************************
*
*  IF GAIN DATA
*
****************************************************************************
;
& IF GAIN &
INTEGER  if_gain_port;                          & new if gain port    &
EXTERNAL BYTE TABLE cmd_if_gain;                & from RESPONS        &
EXTERNAL BYTE TABLE cmd_if_port;                & from RESPONS        &
```

```
SIFGAIN.WORK.PD8510          THU, DEC 22, 1983, 10:38 AM     PAGE   3

#EJECT;
COMMENT                                                          new_if_gain
****************************************************************************
*
****************************************************************************
;
PROCEDURE  new_if_gain( gain );
   VALUE   gain;                                                     ENTRY;
   INTEGER gain;
   BEGIN & new_if_gain &

      abort_sweep;

      IF if_gain_port = test_port THEN
         BEGIN & if &
            hilight_key( cmd_if_gain[ gain ],
                         cmd_if_gain[ if_test_gain ],
                         cmd_if_gain[ if_test_gain ]
                       );
            if_test_gain := gain;
         END   & if &
      ELSE & if_gain_port = ref_port &
         BEGIN & else &
            hilight_key( cmd_if_gain[ gain ],
                         cmd_if_gain[ if_ref_gain ],
                         cmd_if_gain[ if_ref_gain ]
                       );
            if_ref_gain := gain;
         END;  & else &

      restart_sweep;

   END;  & new_if_gain &
```

```
SIFGAIN.WORK.PD8510              THU, DEC 22, 1983, 10:38 AM     PAGE  4

#EJECT;
COMMENT                                                      new_if_gain_port
*************************************************************************
*
*************************************************************************
;                                            %
PROCEDURE  new_if_gain_port( port );
   VALUE   port;
   INTEGER port;                                            ENTRY;
   BEGIN & new_if_gain_port &

      if_gain_port := port;

      & highlight soft-keys &
      IF port = test_port THEN
         BEGIN & if &
            hilight_key( cmd_if_port[ test_port ],
                         cmd_if_port[ ref_port ],
                         cmd_if_port[ ref_port ]
                       );
            hilight_key( cmd_if_gain[ if_test_gain ],
                         cmd_if_gain[ if_ref_gain ],
                         cmd_if_gain[ if_ref_gain ]
                       );
         END  & if &
      ELSE & port = ref_port &
         BEGIN & else &
            hilight_key( cmd_if_port[ ref_port ],
                         cmd_if_port[ test_port ],
                         cmd_if_port[ test_port ]
                       );
            hilight_key( cmd_if_gain[ if_ref_gain ],
                         cmd_if_gain[ if_test_gain ],
                         cmd_if_gain[ if_test_gain ]
                       );
         END;  & else &

   END;  & new_if_gain_port &

 END$
```

```
CIMBM.WORK.PD8510               THU, DEC 22, 1983, 10:38 AM     PAGE  1

BYTE CONSTANT ByteZERO:=0;
INTEGER CONSTANT null := 0,          op_comp := %40,
                 op_fail := %20,     tin_err := %10,
                 un_corr := %4,      busy    := %80,
                 FIFOReady:=0,       UncorErr:=2,
                 CorErr:=3,          TinErr:=4,
                 OPComp:=6,          Busy:=7;
BYTE CONSTANT MBMSelFIFO := %0,
              MBMSelRegB:=%B,   -  MBMSelRegE:=%E,
              MBMSelRegF:=%F,
              one_block := %1,     two_fsa := %10,
              enable_wrt_boot :=%18,low_freq_RCD:=%20, &changed from 28&
              MBMInit:=%11,        MBMRead:=%12,
              MBMWrite:=%13,       MBMWrtBootReg := %16,
              MBMWrtBootLoop:=%17, MBMReadFSA := %18,
              MBMabort  :=%19,     MBMReadBootLoop:=%1B,
              MBMReadRCD:=%1C,     FIFCReset := %1D,
              MBMpurge :=%1E,      MBMReset:=%1F;
BYTE mbm = %FFFFFC01,
     misc_reg   = mbm + 0,   mbm_data = mbm + %C0,
     mbm_status = mbm + %C2, mbm_cmd  = mbm + %C2;

SUBROUTINE wait_while_MBM_busy; FORWARD;
```

```
SIMBM.WORK.PD8510               THU, DEC 22, 1983, 10:38 AM     PAGE  1

M68KL,"IMBM" BEGIN USE REGISTER 0-11;
COMMENT $DOC_ON
NAME--                                                      procedure_name
*************************************************************************
*
* SHORT DESCRIPTION--
* Dummy block for the linking of the MBM code
*
* EXTENDED DESCRIPTION--
*
* INPUTS--
*
* OUTPUTS--
*
* ROUTINES CALLED--
*            init_mbm,       test_mbm,      parms_mbm,
*            set_add_mbm,    read_mbm,      wrt_mbm
*            status_mbm,     read_boot_mbm,wrt_boot_mbm
*
* ERROR CONDITIONS AND RECOVERY--
*
* NOTES--
*     Each for the external procedures are stand alone. The MBM code is
*   located on the MBM board itself and is a block of 255 bytes of code.
*   Each of the procedures is selected by a block switch that selects
*   one of 16 256 bytes ROM sections and enables the MBC chipselect.
*   Each code section must be <= 256 bytes and the entry point on a
*   XXXXXX00 boundary ( note the link command needs to be adjusted so
*   that this will happen because the compilier overhead adds some
*   unneeded branchs at begining and end of a code module ).
*
* AUTHOR HISTORY--
*         JTB
*
*************************************************************************
*
* INTIAL REFINEMENT--
*
*************************************************************************
*
* REVISION LOG--
*         May 5 1982  moved into Pass1 work
*
*************************************************************************
```

```
SIMBM.WORK.PD8510               THU, DEC 22, 1983, 10:38 AM     PAGE  2

#EJECT
DECLARATION--  ;

&$DOC_OFF&

EXTERNAL LABEL init_mbm,test_mbm,parms_mbm;
EXTERNAL LABEL set_add_mbm,read_mbm,wrt_mbm;
EXTERNAL LABEL status_mbm,read_boot_mbm,wrt_boot_mbm;
     GO TO init_mbm;
     GO TO test_mbm;
     GO TO parms_mbm;
     GO TO set_add_mbm;
     GO TO read_mbm;
     GO TO wrt_mbm;
     GO TO status_mbm;
     GO TO read_boot_mbm;
     GO TO wrt_boot_mbm;

END$
```

```
SIMBMO.WORK.PD8510            THU, DEC 22, 1983, 10:38 AM     PAGE  1

M68KL,P,"IMBMO"
BEGIN USE REGISTER 0-11;

#FILE cimbm.work;

COMMENT $DOC_ON
NAME--                                                           test_mbm
***************************************************************************
*
* SHORT DESCRIPTION--
*    Verification of MBM hardware.
*
* EXTENDED DESCRIPTION--
*
* INPUTS--
*
* OUTPUTS--
*        test_mbm    Flag on success of test -- TRUE = successful
*                                               FALSE= failed
*
* ROUTINES CALLED--
*
* ERROR CONDITIONS AND RECOVERY--
*
* NOTES--
*
* AUTHOR HISTORY--   JTB
*
***************************************************************************
*
* INTIAL REFINEMENT--
*
*
***************************************************************************
*
* REVISION LOG--
*         Documented and Move in to Pass 1  MAY 7 1982
*
***************************************************************************
DECLARATION--
```

```
SIMBMO.WORK.PD8510            THU, DEC 22, 1983, 10:38 AM     PAGE  2

#EJECT;

BOOLEAN SUBROUTINE test_mbm;                                     ENTRY;
&$DOC_OFF&
BEGIN
        misc_reg:=Z80;
        test_mbm:=TRUE;
        misc_reg:=ByteZERO;
 END test_mbm;

SUBROUTINE wait_while_MBM_busy;
    WHILE TBIT(mbm_status,Busy) DO;

END$
```

```
SIMBM2.WORK.PD8510            THU, DEC 22, 1983, 10:38 AM     PAGE  1

M68KL,P,"IMBM2"
BEGIN USE REGISTER 0-11;

#FILE cimbm.work;
SUBROUTINE wait_while_MBM_busy_or_error;                         FORWARD;

COMMENT $DOC_ON
NAME--                                                           init_mbm
***************************************************************************
*
* SHORT DESCRIPTION--
*   Resets and inializes the MBC and bootloop for selected MBM
*
* EXTENDED DESCRIPTION--
*   Cause any on going operation to be ceased, and all MBC registers
*   are reset. The MBC is then set up for one MBM operation with
*   RCD error correction ( the data will be corrected on the fly, but
*   an uncorrectable error will not be flagged till after the transfer
*   is finished -- this is the fastest mode ).
*
* INPUTS--
*        mod       module number of MBM   range is 0,1
*
* OUTPUTS--
*        init_mbm  BOOLEAN on the success of initialization (see below)
*                       TRUE = successful  FALSE = failed
*
* ROUTINES CALLED--  none
*
* ERROR CONDITIONS AND RECOVERY--
*    A bad boot loop or hardware failure will cause test to fail, and
*    this will require a service call to fix
*    Init will initialize the boot loop map on all MBMs, however it
*    appears that this routine will return true if MBMWO is good, and
*    MBMW1 is bad, However if MBMWO is bad, Init(1) will be false(sorry)
*
*
* AUTHOR HISTORY--   JTB
*
***************************************************************************
*
* INTIAL REFINEMENT--
*   Abort MBC , if still busy repeative hit with abort ( small delay
*   between ). Once not busy do a hard reset and then set up MBC regs
*   with the RCD mode , one MBM with two channels, etc. Issue the
*   initilaize command and wait till completed and report if sucessful.
*
***************************************************************************
*
* REVISION LOG--
*         Documented and Move into Pass 1  MAY 7 1982
*         Delete the wait till op_comp before aborting as req in
*                early controllers
*    4/83  Added bailout in busy loop if MBMWO good but MBMW1 bad
*
```

```
SIMBM2.WORK.PD8510            THU, DEC 22, 1983, 10:38 AM     PAGE  2

***************************************************************************
```

```
SIMBM2.WORK.PD8510            THU, DEC 22, 1983, 10:38 AM     PAGE   3

#EJECT
DECLARATION-- ;

BOOLEAN PROCEDURE init_mbm(mod); VALUE mod; INTEGER mod;          ENTRY;
&$DOC_OFF&

BEGIN
BYTE Dummy;

  misc_reg:=%82;

  IF TBIT(mbm_status,Busy) THEN
     BEGIN

        REPEAT 3  DO BEGIN mbm_cmd:=MBMabort;
                 REPEAT 255 DO Dummy:=mbm_status; Dummy:=mbm_data; END;
                 & Time Delay -- do not understand&
      END;
  &Should be not busy and ready for init now&

  IF NOT TBIT(mbm_status,Busy) THEN
     BEGIN
     mbm_cmd:=(MBMReset);

     wait_while_MBM_busy; mbm_cmd:=(MBMSelRegB);
     WRITE(ADRS(mbm_data),  one_block, two_fsa,
                      low_freq_RCD , ByteZERO, LEFT( BYTE(mod), 3));
     wait_while_MBM_busy; mbm_cmd:=(MBMInit);
     DO UNTIL TBIT( mbm_status, Busy );
     wait_while_MBM_busy_or_error;
     END no busy error;
     &else is a busy error which the following will flag&

  init_mbm:=TBIT(mbm_status,OPComp) AND NOT TBIT(mbm_status, TimErr);

  misc_reg:=2;
 END init_mbm;


SUBROUTINE wait_while_MBM_busy;
   WHILE TBIT( mbm_status,Busy ) DO;

SUBROUTINE wait_while_MBM_busy_or_error;
BEGIN
BYTE sts=REGISTER 1;    & must be a register &
   DO     sts := mbm_status
    UNTIL NOT TBIT( sts, Busy       )      OR
          ( TBIT( sts, FIFOReady )     AND  TBIT( sts, TimErr  )  );
                & this seems to catch MBMWO good but MBMW1 bad &
END;

END$
```

```
SIMBM3.WORK.PD8510            THU, DEC 22, 1983, 10:38 AM     PAGE   2

#EJECT
DECLARATION--;

ALPHA  PROCEDURE parms_mbm(mod,pos,pageSize,pagemax,modules);
       INTEGER mod,pos,pageSize,pagemax,modules;                ENTRY;

&$DOC_OFF&

BEGIN
INTEGER mod_ctr,temp;
   misc_reg:=%83;

   pageSize:=32;

   mbm_cmd:=MBMSelRegE;
   pos:=( ( INTEGER(mbm_data) AND %FF) +
                 LEFT( temp:=INTEGER(mbm_data) , 8)
                        AND (pagemax:=%7FF) );
   mod:=RIGHT(temp,3) AND %F;

   mod_ctr:=0;

   IF NOT TBIT( mbm_status, Busy ) THEN
   BEGIN
       mbm_cmd:=FIFOReset;
       DO UNTIL TBIT(mbm_status,OPComp);
       mbm_cmd:=MBMReadFSA;
       DO UNTIL TBIT(mbm_status,OPComp);
       DO BEGIN
          mod_ctr:=mod_ctr+1;
          temp:=mbm_data
          END UNTIL NOT TBIT(mbm_status,FIFOReady);
   END no busy error;

   modules:=RIGHT(mod_ctr,1);
   ASSEMBLE(  LEA   ="I1 -- A.0", R8 ;   MOVE.L R8, R0 ); &PC relative&

   misc_reg:=%3;
END parms_mbm;

END$
```

```
SIMBM3.WORK.PD8510            THU, DEC 22, 1983, 10:38 AM     PAGE   1

M68KL,P,"IMBM3"
BEGIN USE REGISTER 0-11;

#FILE cimbm.work;

COMMENT $DOC_ON
NAME--                                                              parms_mbm
*************************************************************************
*
* SHORT DESCRIPTION--
*   Returns description of MBM hardware -- ie memory organization.
*
* EXTENDED DESCRIPTION--
*   Returns a dscription of the MBM memory organization so that the
*   rest of the software could adapt to hardware changes in MBM hardware
*   i.e. -- a different vendor or larger memorys.
*
* INPUTS--
*
* OUTPUTS--
*   parms_mbm      two packed ascii chars with vendor and memory size
*                       "I1" = INTEL 1 MEGABIT
*   mod            The number of the presently selected memory module
*   pos            The next page number to be used if unchanged
*   pageSize       The number of words per memory page
*   pagemax        The largest addressable page
*                     1+pagemax is the number of pages of storage/module
*   modules        The number of memory modules on the MBM board
*
* ROUTINES CALLED--  none
*
* ERROR CONDITIONS AND RECOVERY--
*         If MBC is busy on entry the routine will not check MBM number
*            and will instead return with a zero count on modules.
*
* NOTES--
*
* AUTHOR HISTORY--   JTB
*
*************************************************************************
*
* INTIAL REFINEMENT--
*  Set the known constant for the Intel 1 meagBit memory ( other
*  software will be done for other MBMs ). Read from the MBC the
*  present page and module settings. Then force the MBC to read the
*  status of FSA chips , and count the number of FSAs responding.
*
*************************************************************************
*
* REVISION LOG--
*          Documented and Move into Pass 1  MAY 7 1982
*  4/83    Added busy error check
*
*************************************************************************
```

```
SIMBM4.WORK.PD8510            THU, DEC 22, 1983, 10:38 AM     PAGE   1

M68KL,P,"IMBM4"
BEGIN USE REGISTER 0-11;
#FILE cimbm.work;

COMMENT $DOC_ON
NAME--                                                             set_add_mbm
*************************************************************************
*
* SHORT DESCRIPTION--
*  Sets up the MBC regs and returns the word count and next MBM page.
*
* EXTENDED DESCRIPTION--
*  The read and write MBM data routines need to specific the starting
*  page address and the number of pages. This routine given the RAM
*  memory address and the starting page will compute the needed number
*  of pages, and also the next available page after the operation.
*
*
* INPUTS--
*     Address   The starting page number ( 0 - 2047 )
*     StartMem  The starting byte address of the RAM block
*     EndMem    The ending byte address of RAM block
*
* OUTPUTS--
*     Address   The next page  available
*     set_add_mem The actual number of number of words that will be
*               transfered -- the block is always rounded up to integer
*               page sizes.
*
* ROUTINES CALLED--  none
*
* ERROR CONDITIONS AND RECOVERY--
*        If the conditions requested would cause the last page > 2047
*        then the block transfer would be limited to the start page
*        to 2047 page, and the word length would reflect this.
*
* NOTES--
*
* AUTHOR HISTORY--   JTB
*
*************************************************************************
*
* INTIAL REFINEMENT--
*        The lenght in number of MBM pages of RAM block is computed.
*     This is then added to the starting page to finding the ending
*     pasge, if this exceedes 2048 then then length is adjusted down.
*     The length in pages is then converted to words for the return
*     value. The length in pages to broken into two bytes and sent to
*     the MBC, as is the the starting address. The selected module, as
*     as set in the init_MBM routine is read back from the MBC, and ORed
*     into the address msbs.
*
*************************************************************************
*
* REVISION LOG--
```

```
SIMBM4.WORK.PD8510              THU, DEC 22, 1983, 10:38 AM     PAGE   2

*          Documented and Move into Pass 1  MAY 7 1982
* may 7 82
*  added fifo_reset
*  checked for page start + length > 3048
* 4/83  check for busy on entry -- if so error exit
*
**************************************************************************
```

```
SIMBM4.WORK.PD8510              THU, DEC 22, 1983, 10:38 AM     PAGE   3

#EJECT
DECLARATION--;

DOUBLE PROCEDURE set_add_mbm(Address,StartMem,EndMem);
  VALUE StartMem,EndMem; INTEGER Address;DOUBLE StartMem,EndMem;
                                                                   ENTRY;
&$DOC_OFF&

BEGIN
  INTEGER Length,                  & number of MBM pages needed &
          Add;                     & staring page address &
  BYTE    module_sel_bits;         & selected MBM module code &
     misc_reg:=Z84;

     Length:= 1 + RIGHT( (EndMem-StartMem),6);
     Add:=( Address AND Z7FF ) ;
     IF (Address:= Add+Length) > 2048 THEN
        BEGIN &error too many pages requested &
        Address:=2048;
        Length :=Address - Add;
        END; &page address error&

     IF NOT TBIT( mbm_status, Busy ) THEN
        BEGIN
        mbm_cmd:=MBMSelRegB;
        Length:=( Length   AND Z7FF );
        mbm_data:=Length;      mbm_data:= two_fsa OR RIGHT(Length,8);

        wait_while_MBM_busy;
        mbm_cmd:=MBMSelRegF;  module_sel_bits:=mbm_data AND ZF8 ;
        wait_while_MBM_busy;
        mbm_cmd:=MBMSelRegE;
        mbm_data:=Add;        mbm_data:= module_sel_bits OR RIGHT(Add,8);

        wait_while_MBM_busy;  mbm_cmd:=FIFOReset;
        END no busy error;

     set_add_mbm:=LEFT( DOUBLE(Length),5 );

     misc_reg:=Z4;
END set_add_mbm;


SUBROUTINE wait_while_MBM_busy;
  DO UNTIL NOT TEST( mbm_status, busy, busy + tim_err );

END$
```

```
SIMBM5.WORK.PD8510              THU, DEC 22, 1983, 10:38 AM     PAGE   1

M68KL,P,"IMBM5"
BEGIN USE REGISTER 0-11;

#FILE cimbm.work;

COMMENT $DOC_ON
NAME--                                                         status_mbm
**************************************************************************
*
* SHORT DESCRIPTION--
*    Accquires the the MBC status.
*
* EXTENDED DESCRIPTION--
*
* INPUTS--
*
*
* OUTPUTS--
*    status_mbm    The status of the MBC
*
* ROUTINES CALLED--  none
*
* ERROR CONDITIONS AND RECOVERY--
*
* NOTES--
*
* AUTHOR HISTORY--   JTB
*
**************************************************************************
*
* INTIAL REFINEMENT--
*    Read the MBC status and return it
*
**************************************************************************
*
* REVISION LOG--
*          Documented and Move into Pass 1  MAY 7 1982
*
**************************************************************************
```

```
SIMBM5.WORK.PD8510              THU, DEC 22, 1983, 10:38 AM     PAGE   2

#EJECT
DECLARATION-- ;

INTEGER SUBROUTINE status_mbm;                                     ENTRY;
&$DOC_OFF&
BEGIN
         misc_reg := Z85;
         status_mbm:=mbm_status;
         misc_reg := Z5;
 END status_mbm;


END$
```

SIMBM6.WORK.PD8510 THU, DEC 22, 1983, 10:38 AM PAGE 1

```
M68KL,P,"IMBM6"
BEGIN USE REGISTER 0-11;

#FILE cimbm.work;

COMMENT $DOC_ON
NAME--                                                         read_mbm
***********************************************************************
*
* SHORT DESCRIPTION--
*    Reads from the selected MBM a block data to store in the RAM.
*
* EXTENDED DESCRIPTION--
*    Reads from the MBM into the RAM the numbers of words (16 bit)
*    specified (computed by set-MBM_add) from the MBM page (also set
*    by set_MBM_add). The data is transfer a word(!) at at time ( not
*    interrupt driven) and will continue till all words are read or
*    an error occurs.
*    NOTE: Set_MBM_add must be clled just prior to this procedure.
*
* INPUTS--
*    Add    Address of the starting RAM location
*    WordLength  The number of words to be transfer ( from set_MBM_add )
*
* OUTPUTS--
*    read_mbm   Boolean returning success ( TRUE ) or failed ( FALSE )
*
* ROUTINES CALLED-- none
*
* ERROR CONDITIONS AND RECOVERY--
*      No recover from an error is done ( the most likely is an data
*    error found during error correction that could not be corrected )
*    It is reported and a complete set_MBM_add / read_mbm cycle must be
*    done.
*
* NOTES--
*       Is there a FIFO overflow problem due to external interrupts ??
*     Write may have this problem  never seen for READ.
*
* AUTHOR HISTORY--  JTB
*
***********************************************************************
*
* INITIAL REFINEMENT--
*    The read command is issued and as data occurs in the FIFO it is
*    moved into RAM. This continues till all the data is transfered or
*    an error occurs. Success or failure is then reported.
*
***********************************************************************
*
* REVISION LOG--
*          Documented and Move into Pass 1  MAY 7 1982
*   4/83   Added busy error check
*
***********************************************************************
```

SIMBM6.WORK.PD8510 THU, DEC 22, 1983, 10:38 AM PAGE 2

```
#EJECT
DECLARATION-- ;

BOOLEAN PROCEDURE read_mbm(Add,WordLength); VALUE Add,WordLength;
                                           DOUBLE Add,WordLength;  ENTRY;
&$DOC_OFF&
BEGIN
DOUBLE  Index = REGISTER 2;
DOUBLE  HiByte  = REGISTER 4;
INTEGER DataInteger = REGISTER 3;
BYTE    DataByte = REGISTER 3;
INTEGER POINTER IntPtr = REGISTER 9;

      misc_reg:=%86;

   IF NOT TBIT( mbm_status , Busy ) THEN
      BEGIN
      mbm_cmd:=MBMRead;
      Index:=0;
      HiByte:=0;
      STPNTR(IntPtr,Add);

      DO IF TBIT(mbm_status,FIFOReady) THEN
         BEGIN
           DataByte:=mbm_data;
           IF NOT TBIT(HiByte,0) THEN
              DataInteger:=LEFT(DataInteger,8)
            ELSE
              BEGIN
              IntPtr[Index]:=DataInteger;
              Index:=Index+1;
              END;
           HiByte:=HiByte+1;
          END
       UNTIL Index>=WordLength OR
            NOT TEST(mbm_status,null, op_fail + tim_err);

      wait_while_MBM_busy;
      END not busy error;

     read_mbm:=TEST(mbm_status,op_comp,
                         op_comp + op_fail + tim_err + un_corr );

     misc_reg:=%6;
END read_mbm ;

SUBROUTINE wait_while_MBM_busy;
  DO UNTIL NOT TEST( mbm_status, busy, busy + tim_err );

END$
```

SIMBM8.WORK.PD8510 THU, DEC 22, 1983, 10:39 AM PAGE 1

```
M68KL,P,"IMBM8"
BEGIN USE REGISTER 0-11;

#FILE cimbm.work;

COMMENT $DOC_ON
NAME--                                                          wrt_mbm
***********************************************************************
*
* SHORT DESCRIPTION--
*   Multipage write of data from RAM to selected MBM.
*
* EXTENDED DESCRIPTION--
*   Writes into MBM from the RAM the numbers of words (16 bit) specified
*   (computed by set_MBM_add) from a MBM page (also set by set_MBM_add)
*   The data is transfered a word(!) at a time ( not interrupt driven )
*   and will continue till all words are transfer or an error (?) occurs
*   NOTE: Set_MBM_add must also be called just prior to this procedure.
*
* INPUTS--
*   Add      Address of the starting RAM address
*   WordLength  The number of words to be transfer ( from set_MBM_add )
*
* OUTPUTS--
*   wrt_mbm  Boolean returning sucess (TRUE) or failure (FALSE)
*
* ROUTINES CALLED-- none
*
* ERROR CONDITIONS AND RECOVERY--
*       No recover from an error is done other than to report it,
*   a complete new set_MBM_add / wrt_mbm cycle must be done.
*
* NOTES--
*      The actual transfer to bubble starts after the write command and
*      atleast two bytes are in the FIFO.
*     -Potential problem -- due to the poll nature of this procedure and
*      the requirement that the FIFO never underflows (=> timing error),
*     . there is a problem if external interrupts could happen. Turning
*      off the interrupts will cause other system problem ( maybe just
*      till the FIFO is has 20-30 bytes or Prefill FIFO (best)  ? ).
*      Spec sheet does not allow pre filling FIFO.
*      Calling routines will need to retry writes
*
* AUTHOR HISTORY--  JTB
*
***********************************************************************
*
* INITIAL REFINEMENT--
*   The write command is issued and as room is available in the FIFO
*   data is fetched from RAM and placed into the FIFO. This continues
*   till all the data is transfer or an error occurs. Wait now till the
*   transfer from FIFO to MBM is finished and report on the sucess.
*
***********************************************************************
*
```

SIMBM8.WORK.PD8510 THU, DEC 22, 1983, 10:39 AM PAGE 2

```
* REVISION LOG--
*          Documented and Move into Pass 1  MAY 7 1982
*   4/83   Added busy error check
*   11/83  Speed up write loop
*
***********************************************************************
```

```
SIMBMB.WORK.PD8510              THU, DEC 22, 1983, 10:39 AM     PAGE  3

#EJECT
DECLARATION-- ;

BOOLEAN PROCEDURE  wrt_mbm(Add,WordLength); VALUE Add,WordLength;
                                            DOUBLE Add,WordLength;  ENTRY;
&&DOC_OFF&                                   %

BEGIN
DOUBLE Index = REGISTER 2;
DOUBLE ByteLength = REGISTER 3;
BYTE    POINTER BytePtr = REGISTER 9;

       misc_reg:=X88;

   IF NOT TBIT( mbm_status, Busy ) THEN
       BEGIN
       Index:=0;
       ByteLength := 2 * WordLength;
       STPNTR(BytePtr,Add);
       mbm_cmd:=MBMWrite;

       DO
          IF TBIT(mbm_status,FIFOReady) THEN
          BEGIN
          mbm_data:=BytePtr[ Index ];
          Index :=Index + 1;
          END
       UNTIL Index>=ByteLength OR
             NOT TEST(mbm_status,null, op_fail + tim_err);

       wait_while_MBM_busy;
       END not busy error;

    wrt_mbm:=TEST(mbm_status,op_comp,
                             op_comp + op_fail + tim_err);
    misc_reg:=X8;
END wrt_mbm;


SUBROUTINE wait_while_MBM_busy;
  DO UNTIL NOT TEST( mbm_status, busy, busy + tim_err );

END$
```

```
SIMBMA.WORK.PD8510              THU, DEC 22, 1983, 10:39 AM     PAGE  1
```

```
SIMBMA.WORK.PD8510              THU, DEC 22, 1983, 10:39 AM     PAGE  2
```

```
SIMBMC.WORK.PD8510              THU, DEC 22, 1983, 10:39 AM     PAGE  1

M68KL,P,"IMBMC"
BEGIN USE REGISTER 0-11;

#FILE cimbm.work;

COMMENT $DOC_ON
NAME--                                                      wrt_boot_mbm
************************************************************************
*
* SHORT DESCRIPTION--
*  This for restoring a damaged bootloop map of one MBM
*
* EXTENDED DESCRIPTION--
*  The boot loop is restored ( modified ) according to the supplied
*  map. The module needs to be initialized before using again.
*
* INPUTS--
*    buf      A 40 Byte array containing the bootloop map
*
* OUTPUTS--
*    wrt_boot_mbm  Successful always  = only if no busy error
*
* ROUTINES CALLED--  none
*
* ERROR CONDITIONS AND RECOVERY--
*      An busy error on entry will skip wrt
*
* NOTES--
*     An init_mbm should occur after the wrt_boot_mbm
*
* AUTHOR HISTORY--   JTB
*
************************************************************************
*
* INTIAL REFINEMENT--
*     The MBC controllor and all its registers all cleared. The enable
*     register is enabled for writing boot loop of a single two channel
*     MBM. The boot loop register is filled with all ones (FF), nad the
*     the FIFO is filled ( all 40 bytes ) with the new boot map. The
*     write boot loop command is given, and when done the registers are
*     returned to previous state, However an initialize is not done
*     (But should be).
*
************************************************************************
*
* REVISION LOG--
*          Documented and Move into Pass 1  MAY 7 1982
*   4/83   Added busy error check
*
************************************************************************
```

```
SIMBMC.WORK.PD8510              THU, DEC 22, 1983, 10:39 AM     PAGE   2


#EJECT
DECLARATION-- ;

BOOLEAN PROCEDURE wrt_boot_mbm(buf); VALUE buf; DOUBLE buf;        ENTRY;
&$DOC_OFF&
BEGIN
BYTE POINTER ptr = buf;
INTEGER index;
   misc_reg:=%8C;

IF NOT TBIT( mbm_status, Busy ) THEN
   BEGIN
   mbm_cmd := MBMabort;     wait_while_MBM_busy;
   mbm_cmd := MBMpurge;     wait_while_MBM_busy;
   mbm_cmd := FIFOReset;    wait_while_MBM_busy;
   mbm_cmd := MBMSelRegB;
   WRITE( ADRS(mbm_data), one_block, two_fsa, enable_wrt_boot);

   mbm_cmd := MBMSelFIFO;
   REPEAT 40 DO mbm_data := %FF;
   mbm_cmd := MBMWrtBootReg;   wait_while_MBM_busy;

   FOR index := 0 TO 39 DO mbm_data := ptr[ index ];
   mbm_cmd := MBMWrtBootLoop;  wait_while_MBM_busy;

   mbm_cmd := MBMabort;     wait_while_MBM_busy;

  mbm_cmd:=(MBMSelRegB);
  WRITE(ADRS(mbm_data),  one_block, two_fsa,
                         low_freq_RCD );
  wait_while_MBM_busy;
  mbm_cmd := MBMSelFIFO;

  wrt_boot_mbm :=   TRUE;
  END
  ELSE
  wrt_boot_mbm := FALSE;

   misc_reg:=%C;
 END wrt_boot_mbm;


SUBROUTINE wait_while_MBM_busy;
    WHILE TBIT(mbm_status,Busy) DO;

END$
```

```
JIMBMLST.WORK.PD8510            THU, DEC 22, 1983, 10:39 AM     PAGE   1


!JOB jimbmlst,LIBRN.PD8510,work;PRI=CS
!LIST SxMBM.work
!LIST SIMBM.work
!LIST FMBM.work
!LIST CIMBM.work
!LIST SIMBM0.work
!LIST SIMBM2.work
!LIST SIMBM3.work
!LIST SIMBM4.work
!LIST SIMBM5.work
!LIST SIMBM6.work
!LIST SIMBM8.work
!LIST SIMBMA.work
!LIST SIMBMC.work
!TELL LIBRN.PD8510 --- MBM list job done
!TELL JTB.PD8510 --- MBM list job done
```

```
LIMBMTST.WORK.PD8510            THU, DEC 22, 1983, 10:39 AM     PAGE   1


RIMBMTST.work,
rlibrary.work,
rxmbm.work,
&
RIMBM0.work,
RIMBM2.work,
RIMBM3.work,
RIMBM4.work,
RIMBM5.work,
RIMBM6.work,
RIMBM8.work,
RIMBMA.work,
RIMBMC.work,
&
/E
ROM=100H,RAM=7FFEH;
```

```
SIMBMTST.WORK.PD8510            THU, DEC 22, 1983, 10:39 AM     PAGE   1


M68KL,"imbmtst" BEGIN USE REGISTER 0-11;
COMMENT INTEL MBM TEST ROUTINE;

#FILE fmbm.work;
#FILE fterm.work;                                                & DEBUG &
#FILE fterm2.work;                                               & DEBUG &
#FILE fterm3.work;                                               & DEBUG &
BYTE SUBROUTINE RCHAR;                                           EXTERNAL;

ALPHA TABLE STS:="*FIFO RDY",
                 "",
                 "*UNCOR ERR",
                 "*COR ERR",
                 "*TIME ERR",
                 "*OP FAIL",
                 "*OP COMP",
                 "*BUSY"   ;
ALPHA TABLE MES:=
      ""+27+"m"+27+"H"+27+"J"+"0 -- DISABLE MBC",
      "1 -- READ  STATUS       21 -- WRT MASK INC PATTERN",
      "2 -- WRITE CMD          22 -- WRT MASK  FF PATTERN",
      "3 -- READ  DATA         23 -- READ MASK PATTERN",
      "4 -- WRITE DATA         24 -- READ BOOT PATTERN",
      "5 -- READ  FIFO         25 -- WRT FIFO INC PATTERN",
      "6 -- WRITE FIFO         26 -- WRT FIFO  FF PATTERN",
      "7 -- WRITEREG2",
      "8 -- WRITEREG1",
      "A -- MBM INTIALIZE      2A -- MBM VOLTAGE TEST",
      "B -- READ MBM BLOCK     2B -- RESTORE SEED",
      "C -- WRT  MBM BLOCK     2C -- CHECK SEED",
      "D -- MBM Parms          2D -- RESTORE BOOT LOOP",
      "E -- Module Sel         10-1F  WRT BMC CMD",
      ""+27+"l";  & memory lock &

BYTE ARRAY buf[0:39];
INTEGER I,J,K,p0,p1,p2,p3,p4,Module;
DOUBLE StartAdd,EndAdd,Words;

INTEGER ERR;

BYTE CONSTANT ByteZERO:=0;
INTEGER CONSTANT FIFOReady:=0,UncorErr:=2,CorErr:=3,TimErr:=4,
                 OPComp:=6,Busy:=7;
BYTE CONSTANT MBMSelRegB:=%B,MBMSelRegE:=%E,LowFreqRCD:=%28,
              MBMInit:=%11,MBMRead:=%12,MBMWrite:=%13,MBMReadRCD:=%1C,
              MBMReadFSA:=%18,MBMabort:=%19,MBMpurge:=%1E,MBMReset:=%1F,
              MBMfifoReset:=%1D;
BYTE MISCREG=%FFFFFC01,MBMDATA=%FFFFFCC1,
        MBMSTATUS=%FFFFFCC3,MBMCMD=%FFFFFCC3;

BYTE CONSTANT wrt_mask:=%16,read_mask:=%15,read_boot_loop:=%1B;


SUBROUTINE delay;
    REPEAT 62 DO WCHAR(0);  &4 mSec per char&
```

```
SIMBMTST.WORK.PD8510          THU, DEC 22, 1983, 10:39 AM     PAGE  2


INTEGER PROCEDURE RHEX; ENTRY;
  BEGIN
  BYTE Char;
  INTEGER Temp;

  Temp:=0;
  WCHAR('?);
  WHILE ( (Char:=RCHAR) # 13 AND Char # %20 AND Char # ', ) DO
    BEGIN
       IF Char=8 THEN Temp:=RIGHT(Temp,4)
       ELSE IF Char>='0 AND Char<='9 THEN
                      Temp:=LEFT(Temp,4)+( Char AND %F)
       ELSE IF Char>='A AND Char<='F THEN
                      Temp:=LEFT(Temp,4)+(Char AND %7)+9
       ELSE IF Char>='a AND Char<='f THEN
                      Temp:=LEFT(Temp,4)+(Char AND %7)+9
       ELSE BEGIN Temp:=0; WCHAR(7); END;
    END;
   RHEX:=Temp;  CRLF;
   END;

SUBROUTINE wait_till_not_busy;
BEGIN
    DO &null& UNTIL  (status_mbm AND %70) # 0; &op comp or fail,timing&
       MISCREG:=%80;
END;


SUBROUTINE wrt_reg_1;
BEGIN
   MBMCMD:=%B;  MBMDATA:=1;
   MBMDATA:=ByteZERO;MBMDATA:=%8;                   & YES! &
   MBMDATA:=ByteZERO;MBMDATA:=ByteZERO+ALEFT(Module,4);
END;


SUBROUTINE wrt_reg_2;
BEGIN

   MBMCMD:=%B;          MBMDATA:=1;
   MBMDATA:=%10;        MBMDATA:=%8;
   MBMDATA:=ByteZERO;   MBMDATA:=ByteZERO+ALEFT(Module,3);
END wrt_reg_2;


SUBROUTINE command_init;
BEGIN
         MBMCMD:=MBMabort;       delay;
         MBMCMD:=MBMpurge;       delay;
         MBMCMD:=MBMfifoReset;
 END;
```

```
SIMBMTST.WORK.PD8510          THU, DEC 22, 1983, 10:39 AM     PAGE  3


PROCEDURE fill_fifo_ff;
BEGIN
   INTEGER J;

   FOR J:=1 TO 40 DO MBMDATA:=%FF;
END fill_fifo_ff;


PROCEDURE fill_fifo_inc;
BEGIN
INTEGER J,K;

   K:=0;
   FOR J:=1 TO 40 DO BEGIN MBMDATA:=K; K:=LEFT(K,1);
                           IF J=1 THEN K:=1;
                           IF J=9 THEN K:=3;
                           IF J=16 THEN K:=-1;
                           IF J>=25 THEN K:=J;
                     END;
END fill_fifo_inc;

PROCEDURE  dump_fifo;
BEGIN
INTEGER J,K;

   delay;
   WSTR("Data Read"); CRLF;&delay needed till previous operation finish&
   J:=0; WHILE TBIT(MBMSTATUS,0) DO BEGIN
      WHex(MBMDATA,2);
      IF (J:=J+1)>=8 THEN BEGIN J:=0; CRLF; END; END;
   CRLF;
END dump_fifo;


PROCEDURE  dump_buf;
BEGIN
INTEGER J,K;

   J:=0;
   FOR K:=0 TO 39 DO
      BEGIN
      WHex( buf[ K ],2);
      IF (J:=J+1)>=8 THEN BEGIN J:=0; CRLF; END;
      END;
   CRLF;
END dump_fifo;


SUBROUTINE input_fifo_data;
BEGIN
   J:=0;
   WHILE ( J<40 AND ( (K:=RHEX)>-1) )
        DO BEGIN J:=J+1; MBMDATA:=K;  END;
```

```
SIMBMTST.WORK.PD8510          THU, DEC 22, 1983, 10:39 AM     PAGE  4

END;


SUBROUTINE enter_buf;
BEGIN
   J:=0;
   WHILE ( J<40 AND ( (K:=RHEX)>-1) )  DO
         BEGIN
         buf[ J ]:=K;
         J:=J+1;
         END;
END;


PROCEDURE prt_status;
BEGIN
INTEGER J,K;

    delay;
  WSTR(" MBC status=");&time delay so to let previous operation finish&
    WHex(K:=status_mbm,2); CRLF;  WSTR("   ");
    FOR J:=0 TO 7 DO IF TBIT(K,J) THEN WSTR(STS[J]);
    CRLF;
END prt_status;


INTEGER SUBROUTINE mod_request;
     BEGIN WSTR("Module #");
           mod_request:=RHEX AND %3;
END mod_request;


DOUBLE SUBROUTINE GETADD;
BEGIN
   WSTR("Memory Add (4 Digits max)"); GETADD:=RHEX;
END;

PROCEDURE MBMSETUP;
BEGIN
INTEGER Temp;
   WSTR("MBM Add"); Temp:=RHEX ;
   WSTR("Start "); StartAdd:=GETADD;
   WSTR("  End "); EndAdd:=GETADD;
   Words:=set_add_mbm(Temp,StartAdd,EndAdd);
END;


PROCEDURE operator_check(str); VALUE str; ALPHA str;
BEGIN
   WSTR("Are you sure that you want to "); WSTR(str); CRLF;
   WSTR("  Selected Module is "); WNUM(Module);        CRLF;
   WSTR("       Hit RETURN to CONTINUE "); J:=RHEX;
END;
```

```
SIMBMTST.WORK.PD8510          THU, DEC 22, 1983, 10:39 AM     PAGE  5


COMMENT @@@@@@@@@@@@@@@@@@@@@@;
WSTR("INTEL MBM TEST"); CRLF;
FOR I:=0 TO 14 DO BEGIN WSTR(MES[I]); CRLF; delay: END;
     Module:=0;

LOOP: WSTR("INPUT TEST"); I:=RHEX;

    IF I=0 THEN MISCREG:=ByteZERO ELSE MISCREG:=%80;

    IF I=1 THEN prt_status

    ELSE IF I=2 THEN MBMCMD:=RHEX

    ELSE IF I=3 THEN BEGIN WHex(MBMDATA,2); CRLF; END

    ELSE IF I=4 THEN MBMDATA:=RHEX

    ELSE IF I=5 THEN dump_fifo

    ELSE IF I=6 THEN input_fifo_data

    ELSE IF I=7 THEN wrt_reg_2

    ELSE IF I=8 THEN wrt_reg_1

    ELSE IF I=%A THEN
           BEGIN IF init_mbm(Module:=mod_request)
                 THEN WSTR("PASSED") ELSE WSTR("FAILED");
                MISCREG:=%80;
                 prt_status; END
    ELSE IF I=%B THEN
           BEGIN WSTR("READ MBM"); CRLF;MBMSETUP;
          IF read_mbm(StartAdd,Words) THEN WSTR("PASSED")
                               ELSE WSTR("FAILED");
                  prt_status; END

    ELSE IF I=%C THEN
           BEGIN WSTR("WRITE MBM"); CRLF;MBMSETUP;
          IF wrt_mbm(StartAdd,Words) THEN WSTR("PASSED")
                              ELSE WSTR("FAILED");
                  prt_status; END

    ELSE IF I=%D THEN
           BEGIN   WSTR("Manufacture ");
                   WSTR( parms_mbm(p0,p1,p2,p3,p4) );
                   WSTR("  Present Module  "); WNUM(p0);
                   WSTR("  Present Pos  "); WNUM(p1);
                 CRLF;
                   WSTR("  Page Size "); WNUM(p2);
                   WSTR("   # of Pages "); WNUM(p3);
```

```
                USTR("   # of MBM "); WNUM(p4);
                CRLF;
            END

    ELSE IF I=%E THEN Module:=mod_request;

    ELSE IF (I>=%10 AND I<=%1F) THEN BEGIN MBMCMD:=I; prt_status; END

    ELSE IF I=%21 THEN BEGIN  urt_reg_2; fill_fifo_inc;
                              MBMCMD:=urt_mask;
                              prt_status;   END
    ELSE IF I=%22 THEN BEGIN  urt_reg_2; fill_fifo_ff;
                              MBMCMD:=urt_mask;
                              prt_status;   END
    ELSE IF I=%23 THEN BEGIN  urt_reg_2; delay; MBMCMD:=read_mask;
                              dump_fifo;    END
    ELSE IF I=%24 THEN BEGIN  urt_reg_2; delay;
                              IF (J := read_boot_mbm( ADRS( buf ) )) # 0
                                THEN
                                BEGIN
                                WHEX( J ); CRLF;
                                dump_buf;
                                END
                               ELSE
                                USTR( "FAILED" );
                              CRLF;         END
    ELSE IF I=%25 THEN BEGIN  fill_fifo_inc;
                              prt_status; END
    ELSE IF I=%26 THEN BEGIN  fill_fifo_ff;
                              prt_status; END

    ELSE IF I=%2A THEN
         BEGIN
         USTR(" Dummy module must be in. NOT normal bubble"); CRLF;
         operator_check("Continue");
         command_init;
         fill_fifo_ff;    MBMCMD:=urt_mask;     delay;
         WHILE TRUE DO
              BEGIN
              MBMCMD:=MBMabort;   urt_reg_2;  MBMCMD:=MBMRead;
              wait_till_not_busy;        MBMCMD:=MBMfifoReset;
              MBMCMD:=MBMabort;   urt_reg_2;
              fill_fifo_ff;       MBMCMD:=MBMWrite;
              wait_till_not_busy;
              END infinite loop;
         END

    ELSE IF I=%2B THEN
         BEGIN
         USTR(" Seed generating module must be in."); CRLF;
         operator_check("Regenerate Seed");
         command_init;
         urt_reg_1;            delay;
         MBMDATA:=%FF;  MBMDATA:=%FF;
         MBMCMD:=MBMWrite;
         END
```

```
    ELSE IF I=%2C THEN
         BEGIN
         USTR(" Seed check will erase some of bubble's contents");CRLF;
         operator_check("Continue");
         command_init;
         fill_fifo_ff;     MBMCMD:=urt_mask;  delay;
         urt_reg_2;
         fill_fifo_ff;
         MBMCMD:=MBMWrite;    delay;
         MBMCMD:=MBMabort;
         urt_reg_2;           delay;
         MBMCMD:=MBMRead;     delay;
         dump_fifo;
         END

    ELSE IF I=%2D THEN
         BEGIN
         operator_check("Modify Boot Loop");
         command_init;
         USTR("Input New Boot Loop Map");    CRLF;
         enter_buf;
         operator_check("Continue");
         IF urt_boot_mbm( ADRS( buf ) ) THEN USTR( " OK " )
                                 ELSE USTR( "FAILED");
         CRLF;
         prt_status;
         END

    ELSE BEGIN USTR( "BAD COMMAND"); CRLF; END

    ;
GO TO LOOP;
END$
```

```
PROCEDURE  init_array_update_fifo;                      EXTERNAL.L;
SUBROUTINE init_break;                                  EXTERNAL.L;
SUBROUTINE init_ch_stimuli;                               EXTERNAL;
SUBROUTINE init_stimuli;                                  EXTERNAL;
PROCEDURE  init_correction;                             EXTERNAL.L;
PROCEDURE  init_stds;                                   EXTERNAL.L;
PROCEDURE  init_group_control_vars;                       EXTERNAL;
PROCEDURE  init_control_variables;                        EXTERNAL;
PROCEDURE  init_kernel;                                   EXTERNAL;
SUBROUTINE init_keyboard_fifo;                          EXTERNAL.L;
PROCEDURE  init_retrace;                                EXTERNAL.L;
SUBROUTINE init_trig;                                   EXTERNAL.L;
SUBROUTINE init_markers;                                EXTERNAL.L;
SUBROUTINE init_message;                                  EXTERNAL;
SUBROUTINE init_output;                                 EXTERNAL.L;
SUBROUTINE init_sup_brk_fifo;                             EXTERNAL;
PROCEDURE  init_priv_ib;                                  EXTERNAL;
PROCEDURE  init_screen;                                 EXTERNAL.L;
SUBROUTINE init_token_fifo;                             EXTERNAL.L;
SUBROUTINE init_top_misc;                               EXTERNAL.L;
PROCEDURE  init_trace;                                  EXTERNAL.L;
PROCEDURE  init_xadc;                                   EXTERNAL.L;
PROCEDURE  init_yadc;                                   EXTERNAL.L;
SUBROUTINE init_gratic;                                 EXTERNAL.L;
```

```
PROCEDURE irint;                                          EXTERNAL;
PROCEDURE iren(bit);  VALUE bit; BYTE bit;                EXTERNAL;
PROCEDURE irack(bit); VALUE bit; BYTE bit;                EXTERNAL;
PROCEDURE irdis(bit); VALUE bit; BYTE bit;                EXTERNAL;
PROCEDURE irset(bit); VALUE bit; BYTE bit;                EXTERNAL;
PROCEDURE irclr(bit); VALUE bit; BYTE bit;                EXTERNAL;
INTEGER SUBROUTINE irirr;                                 EXTERNAL;
PROCEDURE iradr(Adrs,Bit);
   VALUE Adrs, Bit;
   DOUBLE Adrs;
   BYTE Bit;                                              EXTERNAL;
```

```
SINTRPT.WORK.PD8510            THU, DEC 22, 1983, 10:39 AM     PAGE   1

M68KL,P,"intrpt"
BEGIN

#FILE cids.work;
#FILE fiocnfig.work;
USE REGISTER 0-11;              & called by monitor which reverses R12 &

COMMENT
********************* FILE: sintrpt.work.pd8510 ***********************
*
*                INTERRUPT CONTROL MODULE
*                      MC68000 Processor
*
*               For the 85101 and M68k Hardware
***********************************************************************
*
*     JULY 10 1980                         version A01.02.01
*     John Barr
*
*     modified 29 Jan 1981
*        initialize autoclear register to non-autoclear mode
*        Wayne Cannon
*     Oct 17 1983
*     Rewrote parts in assemble for space reason  JTB
*
***********************************************************************
*
*  ENTRY POINTS
*     irint    is the interrupt system intialize routine.
*     iradr    is the interrupt service routine address set.
*     irrdy    is the interrupt mask enable and clear pending bit routin
*     iren     is the interrupt mask bit enable routine.
*     irdis    is the Interrupt mask bit disable routine.
*     irclr    is the interrupt request bit clear.
*     irset    is the interrupt request bit set.
*     irack    is the interrupt acknoudge bit clear (if nonautoclear).
*     irist    reads the Interrupt Service (masked) register
*     irimr    reads the Interrupt Mask register
*     irirr    reads the Interrupt Request register
*     iracr    reads the Autoclear reg..
*
*     IS ??? a stack and restore IMR needed
***********************************************************************
*
*     The interrupt system will upon an interrupt determining the
*         interrupting device and via a branch table branch  to
*         external service routines. This module also includes the
*         ulitities for mask setting, and saving and initialization.
*
*     As presently configured the high priority interrupts always
*         (0-high,15 - low) has the highest priority but any device can
*         interrupt (if enabled) at any time ( ie no fencing).
*
***********************************************************************
*
```

```
SINTRPT.WORK.PD8510            THU, DEC 22, 1983, 10:39 AM     PAGE   2

*     The interrupt system is based on a pair of AMD 9519 interrupt
*         controllers. There is maximum of 16 interrupts (Note:
*         the  ADC ir do not presently go here ).
*         The IRQ inputs are edge sensitive and can be either
*         negative or postive edge. There is a unique mask bit for
*         each input plus a autoclear bit for each input. The Auto
*         clear bit will cause the input to be re-activited
*         automatically with the interrupt acknowledge read ( if
*         autoclear is not used the re-activation must be done
*         manually before that interrupt can be used again ).
*         Autoclear is not used, therefore, the interrupt must be
*         cleared after processing is complete in order to allow
*         additional interrupts of the same or lower priority to be
*         recognized.
*
***********************************************************************
*                                 I\O ADDRESSES
*
*    I/O ADDRESS
*    A23 --> A10 = 1
*    DEC   HEX    BINARY
*
*  -368  FE90  1001 0X0*  R/W: DATA                       ** INTERRUPT
*  -366  FE92  1001 0X1*  R: STATUS        W: COMMAND     ** CONTROL #1
*
*  -360  FE98  1001 1X0*  R/W: DATA                       ** INTERRUPT
*  -358  FE9A  1001 1X1*  R: STATUS        W: COMMAND     ** CONTROL #2
*
*
*                    * = > 0 if Word acess, 1 if Byte accessc
*
*
*                           REGISTER BIT ASSIGNMENTS
*
*               7     6     5     4     3     2     1     0
*
* STATUS REG, COMMANDS ETC CAN BE DOCUMENTED HERE
*
***********************************************************************
;
BYTE   irdata1   = io + Z91,
       ircmd1    = io + Z93,
       irstatus1 = io + Z93,
       irdata2   = io + Z99,
       ircmd2    = io + Z9B,
       irstatus2 = io + Z9B;
BYTE CONSTANT firstirvector := 32;

COMMENT
***********************************************************************
*
* irint is the interrupt system intialiaze routine.
*
***********************************************************************
*
*     The intialiazation process will reset the chips to their poweron
```

```
SINTRPT.WORK.PD8510            THU, DEC 22, 1983, 10:39 AM     PAGE   3

*         state and modified that state to the need modes. It then will
*         prepare the chips to accept interrupts by setting the mask
*         ,intial to all false , and setup up the
*         interrupt acknowledge response map to provide the index to
*         interrupt service routine branch table. Any interrupt re-
*         quest (IRR) are cleared.
*
*         The master arming bit of both chips is true.
*         The interrupt system is disabled.
*         The modes are:Fixed proirity, individual response vectors,
*                  Non-polled mode, Interrupt out (low true),
*                  Interrupt In - neg edge (high chip), pos edge (low
*
***********************************************************************
*     SET PROCESSOR INTERRUPT MASK TO LEVEL 7
*     FOR CHIP#1: RESET,SET DEFAULT MODES,ENABLE MASTER MASK (ARM),
*                 MASK OFF ALL INPUTS, CLEAR ALL INPUTS,
*                 POSITIVE EDGE ON INPUTS
*     FOR CHIP#2: THE SAME BUT LATCH NEGATIVE EDGE OF INPUTS (vs POS)
*     LOAD THE RESPOND MEMORIES WITH THE CORRESPONDING INTERRUPT
*                 VECTOR 0-15 WITH 0 AS HIGHEST AND 15 AS LOWEST
***********************************************************************
;
PROCEDURE irint;            ENTRY;
BEGIN
BYTE CONSTANT irreset    := 0,
              irmode2    := Z80, & Default mode &
              irmode1    := Z90, & Default Mode + Pos Edge &
              irarm      := ZA1, & Arm ( enable chip)  &
             -irimrfalse := Z30, & Mask (Disable) all inputs &
              iracr_yadc := Z01, & Auto-clear "yadc"  interrupt &
              iracr_time := Z0C, & Auto-clear "tick" and "delay" int's &
                                 & CAUTION: coordinate with assignments
                                   in file FIDS &
              irirrclr   := Z40, & Clear all Input requests &
              irselacr   := ZC0, & Presselect Autoclear for write &
              irselmem   := ZE0; & Presselect Response Memory for write,
                                   Byte count = 1 &
BYTE  Vector=REGISTER 5,   &Used as index to set ir response memory&
      cmd   =REGISTER 6;

   ASSEMBLE(    ORI = H0700,SR );

   WRITE( ADRS( ircmd1), irreset, irmode1, irarm, irimrfalse,
                         irirrclr, irselacr);
   irdata1 := iracr_yadc;

   WRITE( ADRS( ircmd2), irreset, irmode2, irarm, irimrfalse,
                         irirrclr, irselacr);
   irdata2 := iracr_time;

    FOR Vector := 0 UNTIL 15 DO
          BEGIN
          cmd := (irselmem OR (Vector AND Z7) );
          IF Vector <= 7 THEN
                BEGIN
```

```
SINTRPT.WORK.PD8510            THU, DEC 22, 1983, 10:39 AM     PAGE   4

                ircmd1  := cmd;
                irdata1 := Vector + firstirvector;
                END
           ELSE BEGIN
                ircmd2  := cmd;
                irdata2 := Vector + firstirvector;
                END;
         END;

END irint;
COMMENT
***********************************************************************
*
*     iradr is the interrupt service routine address setting routine.
*
***********************************************************************
*     iradr set the service routine address for a particular interrupt.
*       In addition it will call irrdy for the selected interrupt
***********************************************************************
end of comment;
PROCEDURE iradr(adrs,bit);  VALUE adrs,bit;  DOUBLE adrs; BYTE bit;
                                                    ENTRY;
BEGIN
 DOUBLE POINTER irvector = REGISTER 11;
     STPNTR(irvector,LEFT(INTEGER(bit+firstirvector),2));
     irvector := adrs;
     ASSEMBLE( MOVE.B  bit, R0;   BSR irrdy );
END iradr;

COMMENT
***********************************************************************
*
*     irrdy is the interrupt mask enable and clear pending bit routinue.
*     iren  is the interrupt mask bit enable routine.
*     irdis is the Interrupt mask bit disable routine.
*     irclr is the interrupt request bit clear.
*     irset is the interrupt request bit set.
*     irack is the interrupt acknoudge bit clear (if nonautoclear).
*
*      The Interrupt number(0-15) is passed as the parameter.
*      There is no output parameter
*
*  irbit is called by all the above routines.
***********************************************************************
*      irbit first decide which chip to effect
*      (if N<8 - Chip#1 else Chip #2) and then use the approiate
*      9519 command to set or clear the IMR bit. Only one bit can
*      be changed at a time. (Total reg commands could exist)
*
*      Note on IMR: The IMR is a mask reg therefore a ONE (set) masks
*      (prevents) an interrupt. This I have called DISABLED. Likewise
*      a ZERO (clear) ENABLES interrupts.
***********************************************************************
;
PROCEDURE  irbit(reg,bit); VALUE reg,bit; BYTE reg,bit;
   BEGIN & irbit &
```

SINTRPT.WORK.PD8510 THU, DEC 22, 1983, 10:39 AM PAGE 5

```
     ASSEMBLE( MOVE  SR,-(S) );              & Push Status word.    &
     ASSEMBLE( ORI   =H0700,SR);             & Disable interrupts.  &
     IF bit <=7 THEN ircmd1 := ((bit AND 7) OR reg)
              ELSE ircmd2 := ((bit AND 7) OR reg);
     ASSEMBLE( MOVE  (S)+,SR );              & Restore Status word.  &
   END;  & irbit &

SUBROUTINE irrdy;   & a parameter 'bit' is being passed &       ENTRY;
BEGIN
BYTE CONSTANT irinrclrirrclr := %18; &Clear both an INR and IRR bit&
    & irbit(irinrclrirrclr,bit) &
    ASSEMBLE( MOVE.W R0,-(S);  MOVE.W =H18, R0; BSR  irbit );
END irrdy;

SUBROUTINE iren;  & a parameter 'bit' is being passed &        ENTRY;
BEGIN
BYTE     CONSTANT irinrclr := %28; &Clear (enable) single bit of INR&
    & irbit(irinrclr,bit) &
    ASSEMBLE( MOVE.W R0,-(S);  MOVE.W =H28, R0; BSR  irbit );
END iren ;

SUBROUTINE irdis;     & a parameter 'bit' is being passed &      ENTRY;
BEGIN
BYTE     CONSTANT irinrset := %38; &Set (mask) single bit of INR&
    & irbit(irinrset,bit) &
    ASSEMBLE( MOVE.W R0,-(S);  MOVE.W =H38, R0; BSR  irbit );
END irdis ;

SUBROUTINE irclr;   & a parameter 'bit' is being passed &       ENTRY;
BEGIN
BYTE     CONSTANT irirrclr := %48; &Clear (remove) a bit in the IRR&
    & irbit(irirrclr,bit) &
    ASSEMBLE( MOVE.W R0,-(S);  MOVE.W =H48, R0; BSR  irbit );
END irclr;

SUBROUTINE irset;     & a parameter 'bit' is being passed     & ENTRY;
BEGIN
BYTE     CONSTANT irirrset := %58; & Set a bit in the IRR&
     &  irbit(irirrset,bit)  &
    ASSEMBLE( MOVE.W R0,-(S);  MOVE.W =H58, R0; BSR  irbit );
END irset;

SUBROUTINE irack;   &  a parameter 'bit' is being passed &      ENTRY;
BEGIN
BYTE     CONSTANT irisrclr := %78; & Clear (remove) a bit in the ISR&
     & irbit(irisrclr,bit) &
    ASSEMBLE( MOVE.W R0,-(S);  MOVE.W =H78, R0; BSR  irbit );
END irack;

COMMENT
**************************************************************************
*  irisr
*  irinr
*  irirr
*  iracr are a series of routines to read Interrupt system reg.
*
```

SINTRPT.WORK.PD8510 THU, DEC 22, 1983, 10:39 AM PAGE 6

```
*   They are integer typed subroutines.
*
************
*   The entry point select the reg to read and it is preselected
*       and then branches to irread to conbined the two 8-bit itens.
*
*   irread reads the selected register and returns the
*      full 16 bit result. It first loads the upper 8 bits from
*      the low priority chip .
*      It then loads the lower 8 and ORs in the Upper bits.
***************************************************************************
;
BYTE     CONSTANT irrdisr := %A0, &Preselect ISR for Read &
                  irrdinr := %A4, &Preselect INR for Read &
                  irrdirr := %A8, &Preselect IRR for Read &
                  irrdacr := %AC; &Preselect ACR for Read &

INTEGER SUBROUTINE irread;
      ASSEMBLE( MOVE.B $irdata2, R0;  LSL.W #8,  R0;
                MOVE.B $irdata1, R0   );

INTEGER SUBROUTINE irirr;    ENTRY;
        BEGIN ircmd1 := irrdirr; ircmd2 := irrdirr;
              irirr := irread; END;
END$


INTEGER SUBROUTINE irisr;    ENTRY;
        BEGIN ircmd1 := irrdisr; ircmd2 := irrdisr;
              irisr := irread; END;
INTEGER SUBROUTINE irinr;    ENTRY;
        BEGIN ircmd1 := irrdinr; ircmd2 := irrdinr;
              irinr := irread; END;
INTEGER SUBROUTINE iracr;   ENTRY;
        BEGIN ircmd1 := irrdacr; ircmd2 := irrdacr;
              iracr := irread; END;
```

FIOCNFIG.WORK.PD8510 THU, DEC 22, 1983, 10:39 AM PAGE 1

```
BYTE    io       = %FFFFFE00;
INTEGER botton   = %FFFFFD00;
INTEGER dgran    = %FFF00000;
INTEGER dg_ldxy  = dgran + %020000;       & ORs in the ldxy opcode bits &
```

JIOLIB.WORK.PD8510 THU, DEC 22, 1983, 10:39 AM PAGE 1

```
!JOB Jiolib,LIBRN.PD8510,WORK;PRI=CS;OUTCLASS=,1
!COMMENT  COMPILE AND ASSEMBLY JOB FOR 8510 MC68000 io LIBRARY
!BUILD Atopmisc;DISC=31,32,1;REC=-1276,,V,ASCII;TEMP
!BUILD Auart   ;DISC=31,32,1;REC=-1276,,V,ASCII;TEMP
!BUILD Atopkbd ;DISC=31,32,1;REC=-1276,,V,ASCII;TEMP
!BUILD Anumber ;DISC=31,32,1;REC=-1276,,V,ASCII;TEMP
!BUILD Abotkbd ;DISC=31,32,1;REC=-1276,,V,ASCII;TEMP
!BUILD Arpg    ;DISC=31,32,1;REC=-1276,,V,ASCII;TEMP
!BUILD Abot    ;DISC=31,32,1;REC=-1276,,V,ASCII;TEMP
!FILE M68DLLR=M68KDLLR.M68K.UPSOFT
!COM68K Stopmisc           ,Atopmisc,$NULL,17
!COM68K Suart              ,Auart   ,$NULL,17
!COM68K Stopkbd            ,Atopkbd ,$NULL,17
!COM68K Snumber            ,Anumber ,$NULL,17
!COM68K Sbotkbd            ,Abotkbd ,$NULL,17
!COM68K Srpg               ,Arpg    ,$NULL,17
!COM68K Sbot               ,Abot    ,$NULL,17
!COMMENT ******   io library compile section finished   ************
!FILE rtemp=$NEWPASS;DISC=31,32,1
!FILE TREETEXT=*rtemp
!FILE TREELIST=$NULL
!RUN ASM68K.M68K.UPSOFT;PARM=0
Atopmisc
Auart
Atopkbd
Anumber
Abotkbd
Arpg
Abot
/E
!PURGE riolib.work
!SAVE $OLDPASS,riolib.work
!TELL LIBRN.PD8510;   io library  UPDATE COMPLETE
!TELL LANI.PD8510;    io library  UPDATE COMPLETE
!TELL JTB.PD8510;     io library  UPDATE COMPLETE
!TELL WCC.PD8510;     io library  UPDATE COMPLETE
!EOJ
```

```
FKERNEL.WORK.PD8510              THU, DEC 22, 1983, 10:39 AM      PAGE   1

PROCEDURE send(signal);
   VALUE signal; INTEGER signal;                              EXTERNAL;
PROCEDURE wait(signal);
   VALUE signal; INTEGER signal;                              EXTERNAL;
PROCEDURE acquire(resource);
   VALUE resource; INTEGER resource;                          EXTERNAL;
PROCEDURE release(resource);
   VALUE resource; INTEGER resource;                          EXTERNAL;
```

```
SKERNEL.WORK.PD8510              THU, DEC 22, 1983, 10:39 AM      PAGE   1

M68KL,P,"kernel"
BEGIN                                       & update/status log at end of file &

#FILE cmessage.work;             & for deadlock and process_creation_error &
#FILE futil2.work;                                               & for fatal &
#FILE cdebug.work;                                  & for stack_fill & & DEBUG &
#FILE fterm.work;                                                    & DEBUG &
#FILE fintrpt.work;
#FILE fiocnfig.work;
#FILE crime.work;
#FILE cids.work;
#FILE fpubib.work;                        & for updating hp-ib leds during ticks &
#FILE fmarkmem.work;          & contains memory limits for stack allocation &

BYTE SUBROUTINE RCHAR;   EXTERNAL.L;                                   & DEBUG &

EXTERNAL DOUBLE MYNRM;        & multiplier normalize address = %FFFFF922 &
EXTERNAL BYTE   RDEXP;        & multiplier exponent  address = %FFFFF912 &
```

```
SKERNEL.WORK.PD8510              THU, DEC 22, 1983, 10:39 AM      PAGE   2

#EJECT;
COMMENT
**********************************************************************
*
* MODULE kernel
*
* ENTRY POINT(S):
*
*    send: Send a signal to an awaiting process.
*    wait: Wait for a signal from another process.
*    waitio: Wait for a device interrupt.
*    awaited: Is a process waiting for a signal.
*    acquire: Acquire access to a resource.
*    release: Release access to a resource.
*    delay: Delay the calling process (<= 2 seconds, non-sharable)
*    pause: Delay the calling process (>= .5 second, sharable)
*
*    run: Starts (or restarts) a process at the beginning.
*    create: Initializes process record for a new process, and starts
*            the process.
*    init_kernel: Initialization routine.
*    signal_init: Initialize a signal variable.
*    resource_init: Initialize a resource variable.
*    terminate: Terminates the calling process.
*    abort: Terminates the designated process.
*    snapshot: Dumps key variables and stacks.
*
* NOTE:
*    The "main" process must not terminate.  After initializing the
*    modules and creating the processes, the "main" process should
*    end in a continuous loop which is the "idle" process.  The main
*    process has the lowest urgency (priority) of all processes.
*    The "main" or "idle" process must always remain ready, that is,
*    it may never call "acquire", "wait", or any procedure that may
*    eventually cause suspension (such as i/o) or termination (such as
*    "terminate".  The existence of the "idle" process as an always
*    ready process allows the scheduling algorithm to avoid time-
*    consuming testing.
*
* The design objective of this module is to hide all knowledge of
* processes and their synchronization (i.e. this is an informational
* strength module).  Although signal and resource identification
* numbers are inputs of this module, no other modules have any
* knowledge of their structure or operations upon them.  Hence this
* is at worst data coupled to any other module.
*
* STRUCTURE NOTES: Each of the functions are separate procedures
*                  Module-wide data definitions are
*                  global to the functions, as are supporting
*                  routines used by the functions.
*
* TIMING:  (as of 1 April 1982, for an 8 MHz MC68000.)
*    A single process swap requires about 69 microseconds (a call to
* "wait", suspension, scheduling of the next process, restoration of
* the process, and return from it's call to "wait") plus 125 nano-
* seconds for each level of process priority of the newly scheduled
```

```
SKERNEL.WORK.PD8510              THU, DEC 22, 1983, 10:39 AM      PAGE   3

* process below the highest priority.
*    A process swap due to an interrupt requires about 46
* microseconds (interrupt service, suspension, restoration of the
* interrupt service routine, and return from it's call to
* waitio).  There is no time requirement based on process priority
* level since there is no search for the highest priority process
* -- scheduling is determined by interrupt hardware.
*    A routine that was running when an interrupt occurs has all of
* its registers pushed onto the stack.  When that process finally is
* scheduled for resumption, that process swap will require 78 micro-
* seconds (instead of the 69 for a normal swap).  Basically an
*
*    For purposes of evaluating whether or not to "wait" versus
* "spin", one should count two process swaps in order to swap to do
* useful work and to swap back.
*    Basically an interrupt caused process swap will cost a
* process swap on entry and exit totalling 150 microseconds.  The
* actual exit swap may be 69 microseconds, but a process swap
* sometime will be extended from 69 to 78 microseconds, so
* count them both for the interrupt.
* -- 124 microseconds for two process swaps as a result of an
*    interrupt.  (46 + 78 = 119)
* -- 138 microseconds for two process swaps as a result of a "wait"
*    request.
*
* See Wayne Cannon's notes of 23 Sept 1981 for the assembly listing
* with it's associated timing breakdown for an 8 MHz MC68000.  1 April
* 1982 added code to use the multiplier's normalize to find the highest
* priority ready process, rather than a bit test and loop.
*
**********************************************************************
;
```

```
SKERNEL.WORK.PD8510            THU, DEC 22, 1983, 10:39 AM     PAGE   4

#EJECT;
COMMENT                                                          DATA
.....................................................................
. MODULE-WIDE DATA DEFINITIONS
.
.   Note:  Queues are used to link processes awaiting access to a
.          resource instead of dequeues
.          (double-ended queues) since they are always faster for
.          removing items and faster for inserting items if
.          no items are already in the queue.  They are slower if
.          more than one item is in the queue, but this occasion
.          of multiple processes awaiting a resource occurs much less
.          often than a single process being added to an empty queue.
.
.
.....................................................................
;
  BYTE CONSTANT false := 0;
  BYTE CONSTANT true := 1;
  INTEGER CONSTANT nil := 0;
  INTEGER CONSTANT min_registers := 0;   & These values are fixed due &
  INTEGER CONSTANT all_registers := -1;  &   to assembly bit tests.   &
  INTEGER CONSTANT max_process := 15;     & Max_process+1 incl. idle  &
                                         COMMENT
                                           (If larger than 15, than
                                           'ready' must be a double.)
                                           If max_process is changed,
                                           then "min_rin" in "frins"
                                           must be changed to be equal
                                           to max_process + 1.
                                           Update preempt_mask also.  ;
  GLOBAL                                 & global "only" for yadc!!!  &
                                         &    and kernel macros.      &
  INTEGER running;                       & "ID" of running process.   &
                                         & ID of most urgent process  &
                                         & is "max_process", least    &
                                         & urgent is 1, and the idle  &
                                         & process is 0.              &
  INTEGER delay_timer_id;                & ID of process awaiting a   &
                                         &    delay timer interrupt.  &
  GLOBAL                                 & global "only" for yadc!!!  &
                                         &    and kernel macros.      &
  INTEGER ready;                         & 16 boolean "Ready" flags.  &
                                         & (If max_process>15 then    &
                                         & ready must be double and   &
                                         & EXTS in 'schedule' must    &
                                         & be removed!                &
  INTEGER TABLE preempt_mask := ZFFFE, ZFFFC, ZFFF8, ZFFF0,
                                ZFFE0, ZFFC0, ZFF80, ZFF00,
                                ZFE00, ZFC00, ZF800, ZF000,
                                ZE000, ZC000, Z8000, Z0000;
                                         & Mask for higher priorities.&
  GLOBAL                                 & global "only" for "contvar"&
                                         &    passed to yadc/data-    &
                                         &    processing via chtable. &
                                         &    and for kernel macros.  &
  BYTE ARRAY link[0:max_rin];            & Links for queues, and      &
```

```
SKERNEL.WORK.PD8510            THU, DEC 22, 1983, 10:39 AM     PAGE   5

                                         & Pointers to head of queues.&
  BYTE ARRAY owner[min_rin:max_rin];     & Owners of busy resources.  &
  BYTE ARRAY urgency[0:max_process];     & Urgency for scheduling.    &
                                         &    Used to initially enter &
                                         &    process information     &
                                         &    into the tables.        &
  GLOBAL                                 & global "only" for "contvar"&
                                         &    passed to yadc/data-    &
                                         &    processing via chtable. &
                                         &    and for kernel macros.  &
  INTEGER ARRAY counter[0:max_rin];      & Semaphore counters and     &
                                         &    delay_list delay times. &
  INTEGER ARRAY datasize[0:max_process]; & Stack space required.      &
  DOUBLE  ARRAY initialsp[0:max_process];&    S before any execution. &
  DOUBLE  ARRAY initialpc[0:max_process];&    P before any execution. &
  DOUBLE  ARRAY spsave[0:max_process];   & S while not running. &
  DOUBLE  ARRAY max_sp[0:max_process];                        & DEBUG &
  DOUBLE  ARRAY stack_limit[0:max_process];                   & DEBUG &

  GLOBAL DOUBLE stack_top;               & Next avail. stack location.&
```

```
SKERNEL.WORK.PD8510            THU, DEC 22, 1983, 10:39 AM     PAGE   6

#EJECT;
COMMENT                                                      schedule
.....................................................................
.
. EXTERNAL SPECIFICATION FOR schedule
.
. FUNCTION: To save the state of the running process, determine the
.           next process from the list of ready processes according
.           to priority, restore the state of the selected process,
.           and resume execution of the new process.
.
. DECLARATION INFORMATION:
.    SUBROUTINE schedule
.
.    INPUT: none
.
.    OUTPUT: none
.
. EXTERNAL EFFECTS: none
.
. COMMENTS:  The call to the scheduler is the
.            singular point at which processes are suspended and
.            from which they are resumed.
.
.....................................................................
.
. LOGIC INFORMATION FOR schedule
.
. MODULES CALLED: none
.
. INITIAL REFINEMENT:
.
.   Enter mutual exclusion state (done by the calling procedure).
.   Save state of current process.
.   Save stack pointer of current process.
.   Select new process (highest priority ready process).
.   Restore stack pointer of new process.
.   Restore state (registers) of new process.
.   Release mutual exclusion state (done by the procedure returned to)
.
.....................................................................
;
SUBROUTINE schedule;
  BEGIN & schedule &
    LABEL pop_min,
          pop_done;
    INTEGER cursor = REGISTER 6;
    INTEGER temp = REGISTER 9;
    ASSEMBLE( MOVE    SR,-(S) );               & Save status.         &
                                               & Status required only &
                                               & to match interrupts. &

    ASSEMBLE(
            MOVEM.L R13-R14,-(S);              & Push registers.      &
          & MOVE    min_registers,-(S) &       & Mark size of push.   &
            MOVE    =D0,          -(S)
            );
```

```
SKERNEL.WORK.PD8510            THU, DEC 22, 1983, 10:39 AM     PAGE   7

                                               & spsave[running] := S &
                                               & assemble required to &
                                               & get access to stack  &
                                               & pointer              &
    ASSEMBLE(
            MOVE    running,temp;
            ADD.L   temp,temp;
            ADD.L   temp,temp;
            MOVE.L S,spsave(temp)
            );
    IF spsave[running] < max_sp[running] THEN                 & DEBUG &
       max_sp[running] := spsave[running];                    & DEBUG &
    IF spsave[running] <= stack_limit[running] THEN           & DEBUG &
       BEGIN & if &                                           & DEBUG &
          WSTR("STACK SIZE ERROR for process ");              & DEBUG &
          WHex(running,2); CRLF;                              & DEBUG &
          TRAP(15);                                           & DEBUG &
       END if;                                                & DEBUG &

    ASSEMBLE(                                & Find highest priority &
            CLR.L   cursor;                  & ready process by using&
            MOVE.W ready,   cursor;          & normalize function to &
            MOVE.L cursor,  MYNRM;           & find most significant &
            MOVE.B RDEXP+1, cursor;          & bit.  Read back the   &
            EXTS.W cursor;                   & normalized exponent.  &
            ADD.W  #30,     cursor
            );
    running := cursor;
                                              & Restore Stack Pointer&
                                              & S := spsave[running] &
                                              & temp holds (running).&

    ASSEMBLE(
            MOVE.L cursor,temp;
            ADD.L   temp,temp;
            ADD.L   temp,temp;
            MOVE.L spsave(temp),S
            );
    ASSEMBLE( TST     (S)+;                   & Test type of block.  &
              BGE     pop_min;
              MOVEM.L (S)+,R0-R14;            & Pop full set.        &
              BRA     pop_done );
pop_min: ASSEMBLE( MOVEM.L (S)+,R13-R14 );     & Pop minimum set.     &
pop_done:ASSEMBLE( RTE );                     & Restore status and PC&
                                              & Status required only &
                                              & to match interrupts. &

  END;  & schedule &
```

```
SKERNEL.WORK.PD8510          THU, DEC 22, 1983, 10:40 AM      PAGE   8

#EJECT;
COMMENT                                                          preempt
***************************************************************************
*
* EXTERNAL SPECIFICATION FOR preempt
*
* FUNCTION: To save the state of the running process, determine the
*           next process from the list of ready processes according
*           to priority, restore the state of the selected process,
*           and resume execution of the new process.
*
* DECLARATION INFORMATION:
*    SUBROUTINE preempt
*
*    INPUT: none
*
*    OUTPUT: none
*
* EXTERNAL EFFECTS: preempt leaves the calling process in the ready
*                   state.  Only a higher priority ready process will
*                   cause the calling process to be suspended.
*
***************************************************************************
*
* LOGIC INFORMATION FOR preempt
*
* MODULES CALLED: none
*
* INITIAL REFINEMENT:
*
*   Save status word.
*   Enter mutual exclusion state.
*   IF a higher urgency process is ready THEN
*      schedule the highest priority process.
*   Release mutual exclusion state and restore status word.
*
***************************************************************************
;
SUBROUTINE preempt;                                           ENTRY;
  BEGIN & preempt &
    ASSEMBLE( MOVE   SR,-(S) );            & Push Status word.     &
    ASSEMBLE( ORI    #H0700,SR);           & Disable interrupts.   &

    IF (ready AND preempt_mask[running]) <> 0 THEN
       schedule;

    ASSEMBLE( MOVE   (S)+,SR );            & Restore Status word.  &
  END;  & preempt &
```

```
SKERNEL.WORK.PD8510          THU, DEC 22, 1983, 10:40 AM      PAGE   9

#EJECT;
COMMENT                                                             send
***************************************************************************
*
* EXTERNAL SPECIFICATION FOR send
*
* FUNCTION: Send "signal" to a process awaiting the "signal".
*
* DECLARATION INFORMATION:
*    PROCEDURE  send(signal)
*      VALUE    signal
*      INTEGER signal
*
*    INPUT:  signal        integer       resource identification number
*
*    OUTPUT: none
*
* EXTERNAL EFFECTS: If a process is awaiting the signal, it is made
*           ready.
*           The calling process remains running.
*
* CAUTION:  This algorithm has better run-time efficiency, but
*           requires that 1) the calling process releases the resource
*           as its next step, 2) the calling process "wait" for a
*           signal as its next step, or 3) that the condition that
*           is being signalled to the waiting process is in no way
*           invalidated before the calling process releases the
*           resource of code or waits for a signal.
*           It is also important that no other process (despite a
*           possible higher urgency) invalidate the signalled
*           condition before the waiting process resumes execution.
*           If the above conditions cannot be guaranteed, then
*           another algorithm (replacement or in addition) must
*           to be implemented to guarantee that the process sending
*           the signal yields the processor to the signallee
*           and that the signallee be given priority over other
*           processes.  Obviously, this would mean more run-time
*           overhead, and would be unsatisfactory for interrupts.
*           Additionally, the above algorithm can result in a
*           significant delay before the signalled process is
*           scheduled if the signalling process, or higher priority
*           process does not wait for some condition soon after
*           calling this "send" procedure.  This is not likely to
*           cause a problem, but should be considered.  The
*           references below treat this subject succinctly.
*
* COMMENTS: For now, only one process may be waiting for a single
*           signal.  See comment for "wait" function.
*
*           The sending of the raw_ready signals is implemented in-line
*           in the yadc data acquisition process for execution-time
*           efficiency.  In this instance, there is no schedule
*           operation.  Rather, it only sets the ready bit of the
*           waiting process and depends upon the preempt in the idle
*           loop to do the scheduling.  This is workable only because
*           the waiting processes are the data processing processes and
```

```
SKERNEL.WORK.PD8510          THU, DEC 22, 1983, 10:40 AM      PAGE  10

*           are among the lowest priority processes (near idle).
*
*           References:  Hoare, "Monitors: An Operating System
*           structuring Concept", Comm of the ACM, Vol 17, No. 10,
*           Oct 1974. Howard, "Signalling in Monitors", Proc. of
*           2nd Int'l Conf on Software Engineering, San Francisco,
*           1974, p47-52. [The term "resource" used here is synonamous
*           with Hoare's "monitor".
*
***************************************************************************
*
* LOGIC INFORMATION FOR send
*
* MODULES CALLED: none
*
* INITIAL REFINEMENT:
*
*    IF a process is awaiting the signal THEN
*       Enter mutual exclusion state.
*       Ready the signalled process.
*       Unlink the signalled process.
*       Exit mutual exclusion state.
*    ELSE nop.
*
*       NOTE:  The calling process does not relinquish the processor.
*              The signalled process will not obtain the processor
*                 until some process "waits" for a signal or
*                 interrupt.
*
***************************************************************************
;
PROCEDURE  send(signal);                      & See CAUTION above!    &
  VALUE    signal;
  INTEGER signal;                                               ENTRY;
  BEGIN & send &

    IF (counter[signal] := counter[signal] + 1) <= 0 THEN
                                            & If a process is       &
      BEGIN & if &                          & awaiting the signal...&
        ASSEMBLE( MOVE   SR,-(S) );         & Save Status word.     &
        ASSEMBLE( ORI    #H0700,SR);        & Disable interrupts.   &
        ready := SBIT(ready,link[signal]);     & Make it ready and  &
        ASSEMBLE( MOVE   (S)+,SR );         & Restore Status word.  &
      END if;

  END;  & send &
```

```
SKERNEL.WORK.PD8510          THU, DEC 22, 1983, 10:40 AM      PAGE  11

#EJECT;
COMMENT                                                             wait
***************************************************************************
*
* EXTERNAL SPECIFICATION FOR wait
*
* FUNCTION: suspend the calling process awaiting "signal", and
*           schedule another process.
*
* DECLARATION INFORMATION:
*    PROCEDURE  wait(signal)
*      VALUE    signal
*      INTEGER signal
*
*    INPUT:  signal        integer      resource identification number.
*
*    OUTPUT: none
*
* EXTERNAL EFFECTS: The calling process is suspended, and another
*                   process is scheduled.
*
* COMMENTS: Initially, only one process will be allowed to wait on
*           a single signal variable, although there is no programmed
*           enforcement of this.  If it later proves to be
*           desirable to allow multiple processes to be queued
*           awaiting signal to be sent, it may be implemented by
*           a separate procedure using a single process signal
*           variable or by establishing a queue for the primitive
*           signal variable.
*
*           The wait on the raw_ready signal by the data processing
*           processes in implemented in-line in the data processing
*           processes for execution-time efficiency.  Since there is
*           only one process waiting for these signals, the link is
*           entered only during initialization.  This is no problem
*           since the link is only consulted after the signal count is
*           tested to assure that there is a process waiting.
*
***************************************************************************
*
* LOGIC INFORMATION FOR wait
*
* MODULES CALLED: kernel (schedule)
*
* INITIAL REFINEMENT:
*
*    IF signal has not already been sent
*       THEN
*          Enter mutual exclusion state.
*          IF an interrupt didn't send the signal after the test
*             THEN
*                Add the running process to the queue of process(es)
*                    awaiting the signal.
*                Block the running process and schedule a new process.
*          ELSE an interrupt did send the signal and suspension is not
*             necessary.
```

```
SKERNEL.WORK.PD8510            THU, DEC 22, 1983, 10:40 AM     PAGE  12

*          Exit mutual exclusion state.
*       ELSE
*         continue
*
* COMMENT:  It is possible for an interrupt to occur after the signal
*           counter is decremented but before interrupts are disabled.
*           If the interrupt sends the signal (increments the counter)
*           the test after the interrupts are disabled will catch the
*           fact.  An alternative would be to disable interrupts prior
*           to decrementing the counter, but this would require two
*           time-consuming status register modifications on every call.
*           The approach implemented only penalizes when a suspension
*           is imminent.
*
*************************************************************************
;
PROCEDURE  wait(signal);
   VALUE   signal;
   INTEGER signal;                                          ENTRY;
   BEGIN & wait &

      IF (counter[signal] := counter[signal] - 1) < 0 THEN
                  & interrupt can occur here --^; so test later.    &
         BEGIN & if &                       & If signal not already &
                                            & sent, wait for one.   &
            ASSEMBLE( MOVE   SR,-(S) );     & Push Status word.     &
            ASSEMBLE( ORI   =H0700,SR);     & Disable interrupts.   &
            IF counter[signal] < 0 THEN
               BEGIN & if &            & There was no interim send. &
                  ready := RBIT(ready,running);      & Make not ready  &
                  link[signal] := running;           & Link caller.    &
                  schedule;
               END;  & if &
            ASSEMBLE( MOVE   (S)+,SR );     & Restore Status word.  &
                                            & (restores interrupts).&
         END if;

   END;  & wait &
```

```
SKERNEL.WORK.PD8510            THU, DEC 22, 1983, 10:40 AM     PAGE  13

#EJECT;
COMMENT                                                          awaited
*************************************************************************
*
* EXTERNAL SPECIFICATION FOR awaited
*
* FUNCTION: test whether any process is waiting for the signal.
*
* DECLARATION INFORMATION:
*    BOOLEAN PROCEDURE awaited(signal)
*       VALUE   signal
*       INTEGER signal
*
*    INPUT:  signal       integer    resource identification number.
*
*    OUTPUT: awaited      boolean    true if a process is awaiting the
*                                    signal, flase otherwise.
*
* EXTERNAL EFFECTS: None.
*
*************************************************************************
*
* LOGIC INFORMATION FOR awaited
*
* MODULES CALLED: none
*
* INITIAL REFINEMENT:
*
*    IF a process is waiting for the signal
*       THEN
*          Return true.
*       ELSE
*          Return false.
*
*************************************************************************
;
BOOLEAN PROCEDURE awaited(signal);
   VALUE   signal;
   INTEGER signal;                                          ENTRY;
   BEGIN & awaited &
      awaited := counter[signal] < 0;
   END;  & awaited &
```

```
SKERNEL.WORK.PD8510            THU, DEC 22, 1983, 10:40 AM     PAGE  14

#EJECT;
COMMENT                                                          pending
*************************************************************************
*
* EXTERNAL SPECIFICATION FOR pending
*
* FUNCTION: test whether a signal is pending.
*
* DECLARATION INFORMATION:
*    BOOLEAN PROCEDURE pending(signal)
*       VALUE   signal
*       INTEGER signal
*
*    INPUT:  signal       integer    resource identification number.
*
*    OUTPUT: pending      boolean    true if a signal is pending.
*                                    false otherwise.
*
* EXTERNAL EFFECTS: None.
*
*************************************************************************
*
* LOGIC INFORMATION FOR pending
*
* MODULES CALLED: none
*
* INITIAL REFINEMENT:
*
*    IF a signal is pending
*       THEN
*          Return true.
*       ELSE
*          Return false.
*
*************************************************************************
;
BOOLEAN PROCEDURE pending(signal);
   VALUE   signal;
   INTEGER signal;                                          ENTRY;
   BEGIN & pending &
      pending := counter[signal] > 0;
   END;  & pending &
```

```
SKERNEL.WORK.PD8510            THU, DEC 22, 1983, 10:40 AM     PAGE  15

#EJECT;
COMMENT                                                           waitio
*************************************************************************
*
* EXTERNAL SPECIFICATION FOR waitio
*
* FUNCTION: suspend the calling process awaiting an interrupt from the
*           "device", and schedule another process.
*
* DECLARATION INFORMATION:
*    PROCEDURE  waitio(device)
*
*    INPUT:  device      byte     device number for the device awaited.
*
*    OUTPUT: none
*
* EXTERNAL EFFECTS: The calling process is suspended, and another
*                   process is scheduled.
*                   The interrupt request register in the interrupt
*                   controller is cleared for the designated device
*                   to allow another interrupt or a lower priority
*                   pending interrupt to be recognized.
*
* COMMENTS: Only one process may wait for an interrupt from a device
*           at any given time.  In order to simplify and speed the
*           processing of interrupts, the device-process relationship
*           is fixed at compile time.
*
*************************************************************************
*
* LOGIC INFORMATION FOR waitio
*
* MODULES CALLED: kernel (schedule)
*
* INITIAL REFINEMENT:
*
*    Enter mutual exclusion state.
*    Clear the interrupt request bit in the interrupt controller.
*    Block the running process and schedule a new process.
*    Exit mutual exclusion state.
*
*************************************************************************
;
PROCEDURE waitio(device);
   VALUE device;
   BYTE  device;                                            ENTRY;
   BEGIN & waitio &

      ASSEMBLE( MOVE   SR,-(S) );             & Push Status word.     &
      ASSEMBLE( ORI   =H0700,SR);             & Disable interrupts.   &
      irack(device);                          & Clears priority mask. &
      iren(device);                           & Enable interrupt.     &
      ready := RBIT(ready,running);
      schedule;
      ASSEMBLE( MOVE   (S)+,SR );             & Restore Status word.  &
                                              & (restores interrupts).&
```

```
END; & waitio &
```

```
REJECT;
COMMENT                                                              acquire
**********************************************************************
*
* EXTERNAL SPECIFICATION FOR acquire
*
* FUNCTION: to obtain exclusive access to a resource,
*           and to suspend the calling process if the section is
*           already busy, waiting until it is released.
*
* DECLARATION INFORMATION:
*    PROCEDURE  acquire(resource)
*       VALUE   resource
*       INTEGER resource
*
*    INPUT:  resource   integer  resource identification number (rin).
*
*    OUTPUT: none
*
* EXTERNAL EFFECTS:  If the calling process is suspended due to the
*                    resource being busy, a new process is scheduled.
*
**********************************************************************
*
* LOGIC INFORMATION FOR acquire
*
* MODULES CALLED: kernel (schedule)
*
* INTIAL REFINEMENT:
*
*    IF the resource is busy,
*       THEN enter mutual exclusion state,
*          IF an interrupt didn't release the resource after the test
*             THEN
*                Add the calling process to the queue of processes
*                      awaiting access to the resource,
*                Block the running process and schedule a new process.
*             ELSE an interrupt did release the resource and suspension
*                      is not necessary.
*          Exit mutual exclusion state.
*
* COMMENT:  It is possible for an interrupt to occur after the resource
*           counter is decremented but before interrupts are disabled.
*           If the interrupt releases the resource (increments the
*           counter the test after the interrupts are disabled will
*           catch the fact.  This is only pertinent when there
*           were no processes previously awaiting the resource.
*           If this occurs, the acquiring process will not have
*           been linked yet and release will simply ready the
*           An alternative would be to disable interrupts
*           prior to decrementing the counter, but this would
*           require two time-consuming status register modifications on
*           every call.  The approach implemented only penalizes when a
*           suspension is imminent.
*
**********************************************************************
```

```
;
PROCEDURE  acquire(resource);
   VALUE   resource;
   INTEGER resource;                                          ENTRY;
   BEGIN & acquire &
      INTEGER cursor = REGISTER 9;

      ASSEMBLE( MOVE SR,-(S) );                    & Save Status word.  &
      ASSEMBLE( ORI  =H0700,SR);                   & Disable interrupts.&
      IF (counter[resource] := counter[resource] - 1) < 0 THEN
         BEGIN & if &                              & Resource is busy.  &
            link[running] := nil;
            ready := RBIT(ready,running);          & Make not ready.    &
            cursor := resource;
            WHILE link[cursor]<>nil DO             & Find tail of list. &
               cursor := link[cursor];
            link[cursor] := running;             & Link calling process  &
                                                 & to the tail of queue  &
                                                 & of processes awaiting &
                                                 & access to the resource&
            IF running = owner[resource] THEN                  & DEBUG &
               fatal(deadlock);                                & DEBUG &
            schedule;
            & "owner" updated upon unlink during "release" &
         END  & if &
      ELSE                                                     & DEBUG &
         owner[resource] := running;                           & DEBUG &
      ASSEMBLE( MOVE (S)+,SR );                  & Restore Status word. &

   END; & acquire &
```

```
REJECT;
COMMENT                                                conditional_acquire
**********************************************************************
*
* EXTERNAL SPECIFICATION FOR conditional_acquire
*
* FUNCTION: to obtain exclusive access to a resource only if not already
*           busy.  Returns TRUE if the resource was successfully
*           acquired, FALSE if not.
*
* DECLARATION INFORMATION:
*    PROCEDURE  conditional_acquire(resource)
*       VALUE   resource
*       INTEGER resource
*
*    INPUT:  resource   integer  resource identification number (rin).
*
*    OUTPUT: none
*
* EXTERNAL EFFECTS:  none.
*
**********************************************************************
*
* LOGIC INFORMATION FOR conditional_acquire
*
* MODULES CALLED: none
*
* INTIAL REFINEMENT:
*
*    IF the resource is busy THEN
*       return FALSE,
*    ELSE
*       make the resource busy and return TRUE.
*
**********************************************************************
;
BOOLEAN PROCEDURE conditional_acquire(resource);
   VALUE   resource;
   INTEGER resource;                                          ENTRY;
   BEGIN & conditional_acquire &

      ASSEMBLE( MOVE   SR,-(S) );                & Save Status word.    &
      ASSEMBLE( ORI   =H0700,SR);                & Disable interrupts.  &
      IF (counter[resource] := counter[resource] - 1) < 0 THEN
         BEGIN & if &
            counter[resource] := counter[resource] + 1;   & restore it &
            ASSEMBLE( MOVE   (S)+,SR );          & restore status word &
            conditional_acquire := FALSE;
         END  & if &
      ELSE
         BEGIN & else &
            owner[resource] := running;                        & DEBUG &
            ASSEMBLE( MOVE   (S)+,SR );          & restore status word &
            conditional_acquire := TRUE;
         END;  & else &
```

```
   END; & conditional_acquire &
```

```
#EJECT;
COMMENT                                                              release
**********************************************************************
*
* EXTERNAL SPECIFICATION FOR release
*
* FUNCTION: to release exclusive access to a resource,
*           and to make ready any processes awaiting access.
*
* DECLARATION INFORMATION:
*    PROCEDURE release(resource)
*       VALUE resource
*       INTEGER resource
*
*    INPUT:   resource    integer    resource identification number.
*
*    OUTPUT:  none
*
* EXTERNAL EFFECTS: makes ready the first process awaiting access, if
*                   any.
*
**********************************************************************
*
* LOGIC INFORMATION FOR release
*
* MODULES CALLED: none
*
* INITIAL REFINEMENT:
*
*    IF no process is awaiting resource access,
*       THEN resource becomes non-busy,
*    ELSE
*       enter mutual exclusion state
*       make the waiting process ready
*       unlink the first waiting process and make it the resource's
*            owner.
*       exit mutual exclusion state
*
*    NOTE:  release does not relinquish the processor to the waiting
*           process.  The waiting process will not have an opportunity
*           to be scheduled until a running process waits, or is
*           blocked attempting to acquire a busy resource.
*
* COMMENT:  There is no test to prevent releasing a non-acquired
*           resource.  If that were to occur, release would be a non-
*           operation, simply making the idle process ready which is
*           always ready anyway.
*
* COMMENT:  It is possible for an interrupt to occur after the resource
*           counter is decremented but before interrupts are disabled
*           during an acquire.  If the interrupt releases the resource
*           (increments the counter) the test in acquire after
*           interrupts are disabled will catch the fact.  This is only
*           pertinent when there were no processes previously awaiting
*           the resource.  If this occurs, the acquiring process will
*           not have been linked yet and release will simply ready the
```

```
*           idle (0) process as above for releasing a non-acquired
*           resource.  See comments under acquire for alternatives and
*           reasons for the current approach.
*
**********************************************************************
;
PROCEDURE  release(resource);
   VALUE   resource;
   INTEGER resource;                                          ENTRY;
   BEGIN & release &
      INTEGER cursor = REGISTER 9;

      ASSEMBLE( MOVE   SR,-(S) );                  & Save Status word.  &
      ASSEMBLE( ORI    =H0700,SR);                 & Disable interrupts.&
      IF (counter[resource] := counter[resource]+1) <= 0 THEN
         BEGIN
            cursor := link[resource];
            owner[resource] := cursor;                        & DEBUG &
            link[resource] := link[cursor];        & Unlink process.    &
            ready := SBIT(ready,cursor);           & Make process ready &
         END;  & if &
      ASSEMBLE( MOVE   (S)+,SR );                  & Restore Status word &

   END;  & release &
```

```
#EJECT;
COMMENT                                                                delay
**********************************************************************
*
* EXTERNAL SPECIFICATION FOR delay
*
* FUNCTION: to suspend a process for the duration of the specified
*           delay_time.
*
* DECLARATION INFORMATION:
*    PROCEDURE  delay(delay_time)
*       VALUE   delay_time
*       INTEGER delay_time
*
*    INPUT:  delay_time   integer   time in multiples of 32 usec.
*                         [ full 65535 -- not 2's complement ]
*                         minimum = 32 usec = 1      = %0001
*                                   50 usec = 2      = %0002
*                                   100 usec= 3      = %0003
*                                   200 usec= 6      = %0006
*                                   500 usec= 16     = %0010
*                                   1 msec  = 31     = %001F
*                                   2 msec  = 62     = %003E
*                                   5 msec  = 156    = %009C
*                                   10 msec = 313    = %0139
*                                   20 msec = 625    = %0271
*                                   50 msec = 1563   = %061B
*                                   100 msec= 3125   = %0C35
*                                   200 msec= 6250   = %186A
*                                   500 msec= 15625  = %3D09
*                                   1 sec   = 31250  = %7A12
*                                   2 sec   = 62500  = %F424
*                         maximum = 2.1 sec = 65535  = %FFFF
*    OUTPUT: none
*
* EXTERNAL EFFECTS:
*    Upon completion of the delay time interval, the process will be
* made ready, but will only be scheduled if it is the highest priority
* process ready at that time [applies to delay_time >= 16 (500 usec)].
*
* COMMENTS:
*    "delay" is intended to be used by only a single caller at one
* time.  Any subsequent caller will be suspended attempting to
* acquire the time (resource) and its requested delay will then be
* performed upon resumption.  For this reason, unbridled use of
* "delay" will only guarantee a delay of at least the specified time
* and possibly more.
*    The intended use of "delay" is for providing delays for VCO
* settling, settling time after an external analog out step before
* making measurements, etc, which are mutually exclusive.
*    Consider using the general purpose "pause" routine whenever
* possible.
*
* BUGS:
*    The interrupt routine that reschedules the suspended process
* should implement the "preempt" to eliminate an unnecessary pair of
```

```
SKERNEL.WORK.PD8510            THU, DEC 22, 1983, 10:40 AM      PAGE  24

* process swaps should the interrupted process have higher priority than
* the "delayed" process.
*
*************************************************************************
*
* LOGIC INFORMATION FOR delay
*
* MODULES CALLED: kernel (preempt)
*
* INITIAL REFINEMENT:
*    acquire delay timer.
*    IF delay > 500 microseconds THEN
*       save running process's id in delay_timer_id.
*       start timer.
*       waitio(delay_timer).
*       preempt upon return in case interrupted process has priority.
*       release delay timer.
*    ELSE
*       wait in a programmed loop.
*
*************************************************************************
;
  PROCEDURE  delay(delay_time);
    VALUE   delay_time;
    INTEGER delay_time;                                          ENTRY;
    BEGIN & delay &
      BYTE CONSTANT latch_time := 0;
      BYTE    delay_timer    = io + %61;
      BYTE    timer_command  = io + %67;
      BYTE    delay_time_lsb = delay_time + 1;
      BYTE    delay_time_msb = delay_time;

      IF (delay_time AND %FFF0) <> 0 THEN
        BEGIN & if &                        & delay > 500 microseconds &

          acquire(delay_timer_resource);

          delay_timer_id := running;             & save process id &
                                                 &     for return. &

      & 8253 does not allow timer loading to be interrupted per      &
      & Intel Information Sheet 1-2-79 "How the 8253 Really Works".  &
          ASSEMBLE( MOVE SR,     -(S) );      & Push status word    &
          ASSEMBLE( ORI  =H0700, SR   );      & Disable interrupts  &
          delay_timer := delay_time_lsb;            & start timer   &
          delay_timer := delay_time_msb;
          ASSEMBLE( MOVE (S)+,   SR   );      & Restore status word&

          waitio(delay_timer_vctr);              & suspend thyself &
          irdis(delay_timer_vctr);

          delay_timer_id := idle_process;
          release(delay_timer_resource);

          preempt;                               & any higher pri- &
                                                 & ority processes &
```

```
SKERNEL.WORK.PD8510            THU, DEC 22, 1983, 10:40 AM      PAGE  25

                                                  & (like the one we&
                                                  & just intrrptd)? &
                                                  & See BUG above.  &

        END  & if &
      ELSE                                 & delay < 500 microseconds &
        BEGIN & else &
          TRAP(refresh_vctr);&refr mem for even straight thru time&
          delay_time := delay_time - 1;           & for set-up time &
            WHILE delay_time > 0 DO
              BEGIN & while &
                TRAP(refresh_vctr);               & refresh memory &
                TRAP(refresh_vctr);               & [ 15 usec/TRAP &
                delay_time := delay_time - 1; &     at 8 MHz]      &
              END;  & while &
        END;  & else &

    END;  & delay &
```

```
SKERNEL.WORK.PD8510            THU, DEC 22, 1983, 10:40 AM      PAGE  26

$EJECT;
COMMENT                                                           pause
*************************************************************************
*
* EXTERNAL SPECIFICATION FOR pause
*
* FUNCTION: to suspend a process for the duration of the specified
*           interval.
*
* DECLARATION INFORMATION:
*    PROCEDURE  pause(interval)
*      VALUE   interval
*      INTEGER interval
*
*    INPUT:  interval   integer   time in multiples of 125 msec.
*                                 maximum value = 32767 (68.3 minutes)
*
*
*    OUTPUT: none
*
* EXTERNAL EFFECTS:
*    Upon completion of the pause interval, the process will be
* made ready, but will only be scheduled if it is the highest priority
* process ready at that time.
*
* COMMENTS:
*    The pause interval is counted on the basis of 125 millisecond
* "ticks" from the hardware clock. The actual pause will be
* the requested interval plus zero/minus one tick.  For example,
* pause(9) could result in a delay of from 1 to 1.125 seconds.
* Similarly, pause(1) could result in a delay of 125 milliseconds,
* or no delay at all.
*    There is a companion routine called "delay" for shorter delays, but
* it is restricted to use by mutually exclusive routines -- it is not
* reentrant.
*
*************************************************************************
*
* LOGIC INFORMATION FOR pause
*
* MODULES CALLED: schedule
*
* INITIAL REFINEMENT:
*    disable interrupts.
*    check validity of requested interval.
*    save running process's id in linked-list of waiting processes.
*    schedule
*    enable interrupts.
*
*************************************************************************
;
  PROCEDURE  pause(interval);
    VALUE   interval;
    INTEGER interval;                                            ENTRY;
    BEGIN & pause &
      INTEGER ptr;
      INTEGER prev_ptr;
```

```
SKERNEL.WORK.PD8510            THU, DEC 22, 1983, 10:40 AM      PAGE  27

      IF interval >= 0 THEN
        BEGIN & if &

          ASSEMBLE( MOVE   SR,-(S) );        & Push Status word.     &
          ASSEMBLE( ORI   =H0700,SR);        & Disable interrupts.   &

          prev_ptr := pause_list;
          ptr := link[ pause_list ];

          WHILE ( (ptr <> nil) AND (counter[ptr] < interval) ) DO
            BEGIN & while &                  & Find place in list.   &
              interval := interval - counter[ptr];
              prev_ptr := ptr;
              ptr := link[ptr];
            END;  & while &

          link[running] := ptr;              & Add caller to list.   &
          counter[running] := interval;
          link[prev_ptr] := running;

          IF ptr <> nil THEN                 & Update next counter.  &
            counter[ptr] := counter[ptr] - interval;

          ready := RBIT(ready,running);      & Make not ready.       &
          schedule;

          ASSEMBLE( MOVE  (S)+,SR  );        & Restore Status word.  &
                                             & (restores interrupts).&

        END;  & if &

    END;  & pause &
```

```
#EJECT;
COMMENT                                                          terminate
**********************************************************************
*
* EXTERNAL SPECIFICATION FOR terminate
*
* FUNCTION: To terminate the running process.
*
* DECLARATION INFORMATION:
*    SUBROUTINE terminate
*
*    INPUT:  none
*
*    OUTPUT: none
*
**********************************************************************
*
* LOGIC INFORMATION FOR terminate
*
* MODULES CALLED:  none
*
* INITIAL REFINEMENT:
*
*    Make the process not ready.
*    Schedule the highest priority ready process.
*
**********************************************************************
;
   SUBROUTINE terminate;                                       ENTRY;
     BEGIN
       ready := RBIT(ready,running);
       ASSEMBLE( MOVE   SR,-(S)  );                  & Push status word.&
       ASSEMBLE( ORI   #H0700,SR );                  & Disable interrupt&
       schedule;
       ASSEMBLE( MOVE   (S)+,SR  );                  & Restore status.  &
     END terminate;
```

```
#EJECT;
COMMENT                                                              abort
**********************************************************************
*
* EXTERNAL SPECIFICATION FOR abort
*
* FUNCTION: To terminate the designated process.
*
* DECLARATION INFORMATION:
*    PROCEDURE abort(id)
*
*    INPUT:  id    integer     process id.
*
*    OUTPUT: none
*
* COMMENT:  In order to abort a process, one must be careful not to
*    leave the process on any wait list where it might be rescheduled
*    at a later time.  Similarly, the process may own some resources
*    as a result of being interrupted, or -- heaven forbid -- as the
*    result of the code not releasing a resource prior to suspending
*    itself while waiting for a signal or interrupt.
*
**********************************************************************
*
* LOGIC INFORMATION FOR abort
*
* MODULES CALLED:  none
*
* INITIAL REFINEMENT:
*
*    Make the process not ready.
*    Schedule the highest priority ready process.
*
**********************************************************************
;
   PROCEDURE  abort(id);
      VALUE   id;
      INTEGER id;                                                ENTRY;
      BEGIN & abort &
         ready := RBIT(ready,id);
         ASSEMBLE( MOVE   SR,-(S)  );                 & Save status.     &
         ASSEMBLE( ORI   #H0700,SR );                 & Disable interrupt&
         schedule;
         ASSEMBLE( MOVE   (S)+,SR  );                 & Restore status.  &
      END abort;
```

```
#EJECT;
COMMENT                                                                run
**********************************************************************
*
* EXTERNAL SPECIFICATION FOR run
*
* FUNCTION: To begin execution of a new (or dormant) process.
*
* DECLARATION INFORMATION:
*    PROCEDURE run(processid)
*       VALUE processid
*       INTEGER processid
*
*    INPUT:  processid   integer  process id of the process to run.
*
*    OUTPUT: none
*
* COMMENTS:  can be used in conjunction with create as follows:
*            run( create(process,stacksize,urgency) )
*
**********************************************************************
*
* LOGIC INFORMATION FOR run
*
* MODULES CALLED:  none
*
* INITIAL REFINEMENT:
*
*    Initialize stack and saved process state information.
*    Make the process ready.
*    Schedule the highest priority ready process, including the new
*       process.
*
**********************************************************************
;
   PROCEDURE  run(processid);
     VALUE   processid;
     INTEGER processid;                                        ENTRY;
     BEGIN
       INTEGER CONSTANT activation_size := 18;
       DOUBLE process;
       DOUBLE term;
       DOUBLE marker;
       DOUBLE stack = REGISTER 9;
       term := ADRS(terminate);
       stack := initialsp[processid];
       marker := stack + 2;
       spsave[processid] := stack - activation_size;
       max_sp[processid] := spsave[processid];               & DEBUG &
       process := initialpc[processid];

       ASSEMBLE(
              MOVE.L term,-2(stack);           & Terminate routine.  &
              MOVE.L process,-6(stack);        & Initial p.c.        &
              MOVE   #H2000,-8(stack);         & Processor status wd. &
              MOVE.L marker,-12(stack);        & Stack Marker (M=R14) &
```

```
              MOVE.L #H12345678,-16(stack); & R13                     &
            & MOVE   min_registers,-activation_size(stack)  &
              MOVE   #D0,           -activation_size(stack)
              );                                & Mark size of push.  &
       ready := SBIT(ready,processid);
       ASSEMBLE( MOVE.L SR,-(S)  );             & Save status.        &
       ASSEMBLE( ORI   #H0700,SR );             & Disable interrupts. &
       schedule;
       ASSEMBLE( MOVE.L (S)+,SR  );             & Restore status.     &
     END run;
```

```
SKERNEL.WORK.PD8510             THU, DEC 22, 1983, 10:40 AM      PAGE  32

#EJECT;
COMMENT                                                           create
*************************************************************************
*
* EXTERNAL SPECIFICATION FOR create
*
* FUNCTION: Initialize the process record for a new process.
*
* DECLARATION INFORMATION:
*    INTEGER PROCEDURE create(process,stacksize,urgent)
*       VALUE process, stack, urgent
*       DOUBLE process
*       INTEGER stacksize, urgent
*
*    INPUT:   process      double       address of the outer procedure
*                                       that defines the process,
*                                       e.g. ADRS(procname).
*
*             stacksize    integer      stack space to allocate for
*                                       the process (in words).
*             urgent       integer      the urgency (priority) to be
*                                       assigned to the process.
*
*
*    OUTPUT:  create       integer      returns process id of created
*                                       process.
*
* COMMENTS: Create currently assumes unique values of urgency (which
*           also should be contiguous to avoid wasting space and time).
*
*************************************************************************
*
* LOGIC INFORMATION FOR create
*
* MODULES CALLED: none
*
* INITIAL REFINEMENT:
*
*    Set process's urgency.
*    Decrement available stack marker by process's stack size.
*    Set process's initial stack address.
*    Set process's initial program counter value (begin execution
*       address).
*    Assign and return a process id number.
*
*************************************************************************
;
   INTEGER PROCEDURE create(process, stacksize, urgent);
      VALUE process, stacksize, urgent;
      DOUBLE process;
      INTEGER stacksize, urgent;                              ENTRY;
      BEGIN
         INTEGER POINTER ptr;                             & DEBUG &
         INTEGER id = urgent;                    & May later compute a  &
                                                 & different id.        &

         urgency[id] := urgent;
         datasize[id] := stacksize;
         stack_top := stack_top - stacksize;     & Order of execution    &
```

```
SKERNEL.WORK.PD8510             THU, DEC 22, 1983, 10:40 AM      PAGE  33

         initialsp[id] := stack_top + stacksize;& is important for        &
                                                & reentrancy.             &

         initialpc[id] := process;
         IF ( (stack_top   AND %0001FFFF) <                         & DEBUG &
              (ADRS(mark1) AND %0001FFFF)                           & DEBUG &
            ) THEN                                                  & DEBUG &
            fatal(process_creation_error);                          & DEBUG &
         create := id;

         max_sp[id] := initialsp[id];                               & DEBUG &
         stack_limit[id] := stack_top;                              & DEBUG &
         IF id <> 0 THEN                      & init stack space &  & DEBUG &
            STPNTR(ptr,initialsp[id])                               & DEBUG &
         ELSE                                                       & DEBUG &
            STPNTR(ptr,initialsp[0]-256);                           & DEBUG &
         REPEAT ARIGHT(stacksize,1) DO                              & DEBUG &
            BEGIN                                                   & DEBUG &
               ptr := stack_fill;                                   & DEBUG &
               STPNTR(ptr,ADRS(ptr[-1]) );                          & DEBUG &
            END;                                                    & DEBUG &
      END create;
```

```
SKERNEL.WORK.PD8510             THU, DEC 22, 1983, 10:40 AM      PAGE  34

#EJECT;
COMMENT                                                      signal_init
*************************************************************************
*
*************************************************************************
;
   PROCEDURE signal_init(signal,count);
      VALUE signal,count;                                     ENTRY;
      INTEGER signal,count;
                                             & Count normally = 0.      &
      BEGIN & signal_init &
         counter[signal] := count;           & +n = |n| signals pending.&
                                             &  0 = no signals pending  &
                                             & -n = |n| proc's waiting. &

         link[signal] := nil;
      END signal_init;


   PROCEDURE resource_init(resource);
      VALUE resource;                                         ENTRY;
      INTEGER resource;
      BEGIN & resource_init &
         counter[resource] := 1;             & 1 = notbusy.             &
                                             & 0 = busy, no one waiting.&
                                             & -n = |n| proc's waiting. &

         link[resource] := nil;
      END resource_init;
```

```
SKERNEL.WORK.PD8510             THU, DEC 22, 1983, 10:40 AM      PAGE  35

#EJECT;
COMMENT                                                 IO DRIVER MODULES
*************************************************************************
*
* IO DRIVER modules merged here.
*
*************************************************************************
;
```

```
#EJECT;
COMMENT                                 botton box interrupt service routine;

   SUBROUTINE intrpt_botton;                                     ENTRY;
         & Must be SUBROUTINE.      INTERRUPT's LINK/UNLK kills it. &
     BEGIN
        LABEL pop_min,
              pop_done;
      & INTEGER CONSTANT min_registers := 0;      declared in skernel &
      & INTEGER CONSTANT all_registers := -1;     declared in skernel &
        INTEGER id = REGISTER 9;
        DOUBLE spsave_botton_id = spsave + 4*botton_id;

        ASSEMBLE(
                 MOVEM.L R0-R14,-(S);          & Push registers.      &
               & MOVE    all_registers,-(S) & & Mark size of push.   &
                 MOVE    =D-1,-(S)
                 );

        id := running;
        ASSEMBLE(
                ADD.L  id,id;
                ADD.L  id,id;
                MOVE.L S,spsave(id);
                MOVE.L spsave_botton_id, S
                );
        running := botton_id;
        ready := SBIT(ready,botton_id);
        ASSEMBLE(
                TST.W   (S)+;                  & Test type of block.  &
                BGE     pop_min;
                MOVEM.L (S)+,R0-R14;           & Pop full set.        &
                BRA     pop_done
                );
pop_min: ASSEMBLE(MOVEM.L (S)+,R13-R14 );      & Pop mininum set.     &
pop_done:ASSEMBLE(RTE);
      END intrpt_botton;
```

```
#EJECT;
COMMENT                                 rpg interrupt service routine;

   SUBROUTINE intrpt_rpg;                                        ENTRY;
         & Must be SUBROUTINE.      INTERRUPT's LINK/UNLK kills it. &
     BEGIN
        LABEL pop_min,
              pop_done;
      & INTEGER CONSTANT min_registers := 0;      declared in skernel &
      & INTEGER CONSTANT all_registers := -1;     declared in skernel &
        INTEGER id = REGISTER 9;
        DOUBLE spsave_rpg_id = spsave + 4*rpg_id;

        ASSEMBLE(
                 MOVEM.L R0-R14,-(S);          & Push registers.      &
               & MOVE    all_registers,-(S) & & Mark size of push.   &
                 MOVE    =D-1,-(S)
                 );

        id := running;
        ASSEMBLE(
                ADD.L  id,id;
                ADD.L  id,id;
                MOVE.L S,spsave(id);
                MOVE.L spsave_rpg_id, S
                );
        running := rpg_id;
        ready := SBIT(ready,rpg_id);
        ASSEMBLE(
                TST.W   (S)+;                  & Test type of block.  &
                BGE     pop_min;
                MOVEM.L (S)+,R0-R14;           & Pop full set.        &
                BRA     pop_done
                );
pop_min: ASSEMBLE(MOVEM.L (S)+,R13-R14 );      & Pop mininum set.     &
pop_done:ASSEMBLE(RTE);
      END intrpt_rpg;
```

```
#EJECT;
COMMENT                                 top keyboard interrupt service routine;

   SUBROUTINE intrpt_top_key;                                    ENTRY;
         & Must be SUBROUTINE.      INTERRUPT's LINK/UNLK kills it. &
     BEGIN
        LABEL pop_min,
              pop_done;
      & INTEGER CONSTANT min_registers := 0;      declared in skernel &
      & INTEGER CONSTANT all_registers := -1;     declared in skernel &
        INTEGER id = REGISTER 9;
        DOUBLE spsave_top_key_id = spsave + 4*top_key_id;

        ASSEMBLE(
                 MOVEM.L R0-R14,-(S);          & Push registers.      &
               & MOVE    all_registers,-(S) & & Mark size of push.   &
                 MOVE    =D-1,-(S)
                 );

        id := running;
        ASSEMBLE(
                ADD.L  id,id;
                ADD.L  id,id;
                MOVE.L S,spsave(id);
                MOVE.L spsave_top_key_id, S
                );
        running := top_key_id;
        ready := SBIT(ready,top_key_id);
        ASSEMBLE(
                TST.W   (S)+;                  & Test type of block.  &
                BGE     pop_min;
                MOVEM.L (S)+,R0-R14;           & Pop full set.        &
                BRA     pop_done
                );
pop_min: ASSEMBLE(MOVEM.L (S)+,R13-R14 );      & Pop mininum set.     &
pop_done:ASSEMBLE(RTE);
      END intrpt_top_key;
```

```
#EJECT;
COMMENT                                 uart interrupt service routine;

   SUBROUTINE intrpt_uart;                                       ENTRY;
         & Must be SUBROUTINE.      INTERRUPT's LINK/UNLK kills it. &
     BEGIN
        LABEL pop_min,
              pop_done;
      & INTEGER CONSTANT min_registers := 0;      declared in skernel &
      & INTEGER CONSTANT all_registers := -1;     declared in skernel &
        INTEGER id = REGISTER 9;
        DOUBLE spsave_uart_id = spsave + 4*uart_id;

        ASSEMBLE(
                 MOVEM.L R0-R14,-(S);          & Push registers.      &
               & MOVE    all_registers,-(S) & & Mark size of push.   &
                 MOVE    =D-1,-(S)
                 );

        id := running;
        ASSEMBLE(
                ADD.L  id,id;
                ADD.L  id,id;
                MOVE.L S,spsave(id);
                MOVE.L spsave_uart_id, S
                );
        running := uart_id;
        ready := SBIT(ready,uart_id);
        ASSEMBLE(
                TST.W   (S)+;                  & Test type of block.  &
                BGE     pop_min;
                MOVEM.L (S)+,R0-R14;           & Pop full set.        &
                BRA     pop_done
                );
pop_min: ASSEMBLE(MOVEM.L (S)+,R13-R14 );      & Pop mininum set.     &
pop_done:ASSEMBLE(RTE);
      END intrpt_uart;
```

```
SKERNEL.WORK.PD8510            THU, DEC 22, 1983, 10:40 AM    PAGE 40

#EJECT;
COMMENT                        priv_ib_srq     interrupt service routine;

   SUBROUTINE intrpt_priv_ib_srq;                                  ENTRY;
         & Must be SUBROUTINE.       INTERRUPT's LINK/UNLK kills it. &
                                          #
      BEGIN
         LABEL pop_min,
               pop_done;
      &  INTEGER CONSTANT min_registers := 0;       declared in skernel &
      &  INTEGER CONSTANT all_registers := -1;      declared in skernel &
         INTEGER id = REGISTER 9;
         DOUBLE spsave_priv_ib_srq_id = spsave + 4*priv_ib_srq_id;

         ASSEMBLE(
                  MOVEM.L RO-R14,-(S);            & Push registers.      &
                & MOVE    all_registers,-(S) & & Mark size of push.   &
                  MOVE    #D-1,-(S)
                  );

         id := running;
         ASSEMBLE(
                  ADD.L  id,id;
                  ADD.L  id,id;
                  MOVE.L S,spsave(id);
                  MOVE.L spsave_priv_ib_srq_id, S
                  );
         running := priv_ib_srq_id;
         ready := SBIT(ready,priv_ib_srq_id);
         ASSEMBLE(
                  TST.W . (S)+;                  & Test type of block.  &
                  BGE     pop_min;
                  MOVEM.L (S)+,RO-R14;           & Pop full set.        &
                  BRA     pop_done
                  );
pop_min: ASSEMBLE(MOVEM.L (S)+,R13-R14 );        & Pop minimum set.     &
pop_done:ASSEMBLE(RTE);
      END intrpt_priv_ib_srq ;
```

```
SKERNEL.WORK.PD8510            THU, DEC 22, 1983, 10:40 AM    PAGE 41

#EJECT;
COMMENT                        delay_timer     interrupt service routine;

   SUBROUTINE intrpt_delay_timer;                                  ENTRY;
         & Must be SUBROUTINE.       INTERRUPT's LINK/UNLK kills it. &
      BEGIN
         LABEL pop_min,
               pop_done;
      &  INTEGER CONSTANT min_registers := 0;       declared in skernel &
      &  INTEGER CONSTANT all_registers := -1;      declared in skernel &
         INTEGER id = REGISTER 9;
         INTEGER id2 = REGISTER 6;

         ASSEMBLE(
                  MOVEM.L RO-R14,-(S);            & Push registers.      &
                & MOVE    all_registers,-(S) & & Mark size of push.   &
                  MOVE    #D-1,-(S)
                  );

         ASSEMBLE(
                  MOVE    running,id;

                  ADD.L   id,id;                  & stash away interrupted &
                  ADD.L   id,id;                  &    process's SP.      &
                  MOVE.L S,spsave(id);

                  MOVE    delay_timer_id,id2;   & 'cause will need both  &
                  MOVE    id2,id;               &    addr and data reg's &
                  MOVE    id2,running;
                  ADD.L   id,id;                & get delayed process's  &
                  ADD.L   id,id;                &    SP.                 &
                  MOVE.L spsave(id), S
                  );

         ready := SBIT(ready,id2);
         ASSEMBLE(
                  TST.W   (S)+;                  & Test type of block.  &
                  BGE     pop_min;
                  MOVEM.L (S)+,RO-R14;           & Pop full set.        &
                  BRA     pop_done
                  );
pop_min: ASSEMBLE(MOVEM.L (S)+,R13-R14 );        & Pop minimum set.     &
pop_done:ASSEMBLE(RTE);
      END intrpt_delay_timer ;
```

```
SKERNEL.WORK.PD8510            THU, DEC 22, 1983, 10:40 AM    PAGE 42

#EJECT;
COMMENT                                      tick interrupt service routine
*****************************************************************************
*
* LOGIC INFORMATION FOR tick
*
* MODULES CALLED kernel (schedule)
*
* INITIAL REFINEMENT:
*    save working register set
*    restore working register set
*    RTE (to restore status word)
*
*****************************************************************************
;
SUBROUTINE intrpt_tick;                                            ENTRY;
   BEGIN & intrpt_tick &
      INTEGER CONSTANT delta := 1;         & count increments per tick  &
      INTEGER          ptr    = REGISTER 6;

      ASSEMBLE( MOVEM.L RO-R14,-(S) );

      ptr := link[pause_list];

      IF (ptr <> nil) AND ((counter[ptr] := counter[ptr] - 1) <= 0)
            THEN
         BEGIN & if &

            DO                                        & Unlink and start &
             _ BEGIN & do &                           &    processes that &
                  ready := SBIT(ready,ptr);           &    are timed-out. &
                  link[pause_list] := link[ptr];
                  ptr := link[pause_list];
               END   & do &
            UNTIL ( (ptr = nil) OR (counter[ptr] > 0) );

            IF (ready AND preempt_mask[running]) <> 0 THEN
               schedule;                              & Same as preempt  &
                                                      &    without JSR.  &
         END;  & if &

      update_hpib_leds;

      ASSEMBLE( MOVEM.L (S)+,RO-R14 );
      ASSEMBLE( RTE );

   END;  & intrpt_tick &
```

```
SKERNEL.WORK.PD8510            THU, DEC 22, 1983, 10:40 AM    PAGE 43

#EJECT;
COMMENT                                                         init_kernel
*****************************************************************************
*
* EXTERNAL SPECIFICATION FOR init_kernel
*
* FUNCTION: To initialize the kernel data structures for no processes
*           except the idle process.
*
* DECLARATION INFORMATION:
*    PROCEDURE init_kernel
*
*    INPUT:  none
*
*    OUTPUT: none
*
* EXTERNAL EFFECTS: none
*
*****************************************************************************
*
* LOGIC INFORMATION FOR init_kernel
*
* MODULES CALLED: none
*
* INITIAL REFINEMENT:
*
*    Initialize kernel data (link,ready,counter,stack_top).
*    Initialize data for this main/idle process (id=0).
*               (running,ready,stack_top,initialsp,initialpc,urgency).
*    Initialize delay timer.
*    Initialize tick.
*
*****************************************************************************
;                                                                  ENTRY;
  PROCEDURE init_kernel;
     BEGIN
        BYTE    CONSTANT delay_timer_mode := X38; & mode 4, binary,   &
                                                  & lsb first, timer0 &
        BYTE    CONSTANT idleurgency      := 0;
        INTEGER CONSTANT idlesize         := X200;
        BYTE    timer_command = io + X67;
        INTEGER index;
        INTEGER idleid;

        DOUBLE  SUBROUTINE stackbase;
           BEGIN
              ASSEMBLE( EXT $RAM$ );
              ASSEMBLE( MOVE.L $RAM$,RO );
              ASSEMBLE( SUB    #D2,RO );
           END;

        DOUBLE  SUBROUTINE beginexecutionaddress;
           BEGIN
              ASSEMBLE( EXT $RAM$ );
              ASSEMBLE( MOVE.L $RAM$+4,RO );
           END;
```

SKERNEL.WORK.PD8510 THU, DEC 22, 1983, 10:40 AM PAGE 44

```
        ASSEMBLE( MOVE   SR,-(S)  );         & Save status word.         &
        ASSEMBLE( ORI   =H0700,SR );         & Disable Interrupts.       &

        stack_top := ADRS(mark0); & dummy for loadmap marks && DEBUG &
        stack_top := ADRS(mark1);                              & DEBUG &
        stack_top := ADRS(mark3);                              & DEBUG &
        stack_top := ADRS(mark_dg_base);                       & DEBUG &
        stack_top := ADRS(mark_dg_top);                        & DEBUG &

        stack_top := ADRS(mark_stack); & this dummy is req'd to force &
             & the linker to load a module for resetting the initial &
             & stack pointer $RAM$ value (returned by stackbase)      &

        stack_top := stackbase;
        FOR index := 0 UNTIL max_process DO                    & DEBUG &
           BEGIN & for &                                       & DEBUG &
              spsave[index] := 0;                              & DEBUG &
              initialsp[index] := 0;                           & DEBUG &
              initialpc[index] := 0;                           & DEBUG &
              datasize[index] := 0;                            & DEBUG &
              urgency[index] := -1;                            & DEBUG &
              max_sp[index] := 0;                              & DEBUG &
              stack_limit[index] := 0;                         & DEBUG &
           END for;                                            & DEBUG &
        FOR index := 0 UNTIL max_rin DO
           BEGIN & for &
              link[index]    := nil;
              counter[index] := 0;             & necessary for "pause" &
           END for;
        FOR index := min_rin UNTIL max_rin DO                  & DEBUG &
           owner[index] := -1;                                 & DEBUG &
        ready := 0;                          & All bits = false.       &
        idleid := create(beginexecutionaddress,idlesize,idleurgency);
        ready := SBIT(ready,idleid);
        running := idleid;

        delay_timer_id := idle_process;
        resource_init(delay_timer_resource);
        timer_command := delay_timer_mode; & Initialize delay timer.  &
        iradr( ADRS(intrpt_delay_timer), delay_timer_vctr );
        irdis( delay_timer_vctr );           & disable until "delay" is &
                                             & called.  If interrupted  &
                                             & between iradr and irdis, &
                                             & it will only enable idle.&
        link[pause_list] := nil;
        iradr( ADRS(intrpt_tick), tick_vctr );

        ASSEMBLE( MOVE   (S)+,SR  );         & Restore status word.     &
     END init_kernel;
                                                               & DEBUG &
                                                               & DEBUG &
                                                               & DEBUG &
```

SKERNEL.WORK.PD8510 THU, DEC 22, 1983, 10:40 AM PAGE 45

```
#EJECT;                                                         & DEBUG &
COMMENT                                               snapshot  & DEBUG &
*************************************************************** & DEBUG &
*                                                               & DEBUG &
* FUNCTION: To dump the kernel data in a meaningful manner.     & DEBUG &
*                                                               & DEBUG &
*************************************************************** & DEBUG &
;                                                               & DEBUG &
PROCEDURE  snapshot;                                    ENTRY;  & DEBUG &
BEGIN & snapshot &                                              & DEBUG &
   INTEGER i;                                                   & DEBUG &
   INTEGER POINTER stack_data;                                  & DEBUG &
                                                                & DEBUG &
   CRLF;                                                        & DEBUG &
   WSTR("run="); WHEX(running);                                 & DEBUG &
   WSTR(" rdy="); WHEX(ready);                                  & DEBUG &
   WSTR(" stktop="); WHex(stack_top,8); CRLF;                   & DEBUG &
   WSTR("  #   link  ctr  spsave"); CRLF;                       & DEBUG &
   FOR i := 0 TO max_process DO                                 & DEBUG &
      BEGIN & for &                                             & DEBUG &
         WHEX(i);                                               & DEBUG &
         WHEX(link[i]);                                         & DEBUG &
         WHEX(counter[i]);                                      & DEBUG &
         WHex(spsave[i],8);                                     & DEBUG &
         CRLF;                                                  & DEBUG &
      END for;                                                  & DEBUG &
   WSTR("  #   link  ctr  owner "); CRLF;                       & DEBUG &
   FOR i := min_rin TO max_rin DO                               & DEBUG &
      BEGIN & for &                                             & DEBUG &
         WHEX(i);                                               & DEBUG &
         WHEX(link[i]);                                         & DEBUG &
         WHEX(counter[i]);                                      & DEBUG &
         WHEX(owner[i]);                                        & DEBUG &
         CRLF;                                                  & DEBUG &
      END for;                                                  & DEBUG &
   TRAP(15);                                                    & DEBUG &
END snapshot;                                                   & DEBUG &

END$ module "kernel"

                                                                & DEBUG &
                                                                & DEBUG &
                                                                & DEBUG &
```

SKERNEL.WORK.PD8510 THU, DEC 22, 1983, 10:40 AM PAGE 46

```
#EJECT;                                                         & DEBUG &
COMMENT                                       MINIMUM snapshot  & DEBUG &
*************************************************************** & DEBUG &
*                                                               & DEBUG &
* FUNCTION: To dump the kernel data in a meaningful manner.     & DEBUG &
*                                                               & DEBUG &
*************************************************************** & DEBUG &
;                                                               & DEBUG &
PROCEDURE  snapshot;                                    ENTRY;  & DEBUG &
BEGIN & snapshot &                                              & DEBUG &
   INTEGER i;                                                   & DEBUG &
   INTEGER POINTER stack_data;                                  & DEBUG &
                                                                & DEBUG &
   CRLF;                                                        & DEBUG &
   WSTR("run   = "); WHEX(running); CRLF;                       & DEBUG &
   WSTR("rdy   = "); WHEX(ready);   CRLF;                       & DEBUG &
   WSTR("stktop= "); WHex(stack_top,8); CRLF;                   & DEBUG &
   WSTR("  #   link  ctr  spsave"); CRLF;                       & DEBUG &
   FOR i := 0 TO max_process DO                                 & DEBUG &
      BEGIN & for &                                             & DEBUG &
         WHEX(i);                                               & DEBUG &
         WHEX(link[i]);                                         & DEBUG &
         WHEX(counter[i]);                                      & DEBUG &
         WHex(spsave[i],8);                                     & DEBUG &
         CRLF;                                                  & DEBUG &
      END for;                                                  & DEBUG &
   WSTR("  #   link  ctr  owner "); CRLF;                       & DEBUG &
   FOR i := min_rin TO max_rin DO                               & DEBUG &
      BEGIN & for &                                             & DEBUG &
         WHEX(i);                                               & DEBUG &
         WHEX(link[i]);                                         & DEBUG &
         WHEX(counter[i]);                                      & DEBUG &
         WHex(owner[i]);                                        & DEBUG &
         CRLF;                                                  & DEBUG &
      END for;                                                  & DEBUG &
   TRAP(15);                                                    & DEBUG &
END snapshot;                                                   & DEBUG &

                                                                & DEBUG &
                                                                & DEBUG &
                                                                & DEBUG &
```

SKERNEL.WORK.PD8510 THU, DEC 22, 1983, 10:40 AM PAGE 47

```
#EJECT;                                                         & DEBUG &
COMMENT                                               snapshot  & DEBUG &
*************************************************************** & DEBUG &
*                                                               & DEBUG &
* FUNCTION: To dump the kernel data in a meaningful manner.     & DEBUG &
*                                                               & DEBUG &
*************************************************************** & DEBUG &
;                                                               & DEBUG &
PROCEDURE  snapshot;                                    ENTRY;  & DEBUG &
BEGIN & snapshot &                                              & DEBUG &
   INTEGER i;                                                   & DEBUG &
   INTEGER POINTER stack_data;                                  & DEBUG &
                                                                & DEBUG &
   CRLF;                                                        & DEBUG &
   WSTR("running   = "); WHEX(running); CRLF;                   & DEBUG &
   WSTR("ready     = "); WHEX(ready);   CRLF;                   & DEBUG &
   WSTR("stack_top = "); WHex(stack_top,8); CRLF;               & DEBUG &
   CRLF;                                                        & DEBUG &
WSTR(" # link ctr  spsave");
   CRLF;                                                        & DEBUG &
   FOR i := 0 TO max_process DO                                 & DEBUG &
      BEGIN & for &                                             & DEBUG &
         WHex(i,2);                                             & DEBUG &
         WHex(link[i],2);                                       & DEBUG &
         WHex(counter[i],4);                                    & DEBUG &
         WHex(spsave[i],8);                                     & DEBUG &
         CRLF;                                                  & DEBUG &
      END for;                                                  & DEBUG &
   CRLF;                                                        & DEBUG &
   WSTR(" # link ctr owner");                                   & DEBUG &
   CRLF;                                                        & DEBUG &
   FOR i := min_rin TO max_rin DO                               & DEBUG &
      BEGIN & for &                                             & DEBUG &
         WHex(i,2);                                             & DEBUG &
         WHex(link[i],2);                                       & DEBUG &
         WHex(counter[i],4);                                    & DEBUG &
         WHex(owner[i],2);                                      & DEBUG &
         CRLF;                                                  & DEBUG &
      END for;                                                  & DEBUG &
   CRLF;                                                        & DEBUG &
   WSTR("Stack for running process "); CRLF;                    & DEBUG &
   STPNTR(stack_data, ((initialsp[running]-datasize[running])   & DEBUG &
         AND %FFFFFFF0) );                                      & DEBUG &
   REPEAT ( 1 + ARIGHT(datasize[running],4) ) DO                & DEBUG &
      BEGIN & repeat &                                          & DEBUG &
         WHex(ADRS(stack_data),8);                              & DEBUG &
         REPEAT 8 DO                                            & DEBUG &
            BEGIN & repeat &                                    & DEBUG &
               WHex(stack_data,4);                              & DEBUG &
               STPNTR(stack_data,                               & DEBUG &
                     ADRS(stack_data[1]) );                     & DEBUG &
            END repeat;                                         & DEBUG &
         CRLF;                                                  & DEBUG &
      END repeat;                                               & DEBUG &
   CRLF;                                                        & DEBUG &
   WSTR("<return> for more");                                   & DEBUG &
```

SKERNEL.WORK.PD8510 THU, DEC 22, 1983, 10:40 AM PAGE 48

```
   CRLF;                                                & DEBUG &
   WHILE RCHAR <> %0D DO : & wait for carriage return & & DEBUG &
   FOR i := 0 TO max_process DO                         & DEBUG &
      BEGIN & for &                                     & DEBUG &
         IF urgency[i] <> %FF THEN                      & DEBUG &
            BEGIN & if &                                & DEBUG &
               CRLF;                                    & DEBUG &
               WSTR("Process "); WHex(i,2); CRLF;       & DEBUG &
               STPNTR(stack_data, ((initialsp[i]-datasize[i]) & DEBUG &
                     AND %FFFFFFF0) );                  & DEBUG &
               REPEAT ( 1 + ARIGHT(datasize[i],4) ) DO  & DEBUG &
                  BEGIN & repeat &                      & DEBUG &
                     WHex(ADRS(stack_data),8);          & DEBUG &
                     REPEAT 8 DO                        & DEBUG &
                        BEGIN & repeat &                & DEBUG &
                           WHex(stack_data,4);          & DEBUG &
                           STPNTR(stack_data,           & DEBUG &
                                 ADRS(stack_data[1]) ); & DEBUG &
                        END repeat;                     & DEBUG &
                     CRLF;                              & DEBUG &
                  END repeat;                           & DEBUG &
            END if;                                     & DEBUG &
      END for;                                          & DEBUG &
   TRAP(15);                                            & DEBUG &
END snapshot;                                           & DEBUG &
```

SKERNEL.WORK.PD8510 THU, DEC 22, 1983, 10:40 AM PAGE 49

```
$EJECT;
COMMENT                                                     update/status log
*************************************************************************
* CHANGES:
*   18 Mar  83: Corrected "send" to set the link to nil (assumes that
*               there is never more than one process awaiting a signal
*               -- linked).  Also removed the linking that was present
*               in "wait".
*   12 Nov  82: Corrected "intrpt_tick" to save all registers before
*               suspending the process.
*   09 Nov  82: Corrected interrupt initialization for "delay", and
*               initialization/reset of delay_timer_id variable to
*               point to the idle process when not in use.
*   14 Apr  82: Deleted the interrupt routine for the public hp-ib.
*   01 Apr  82: Changed "schedule" to utilize the multiplier's normalize
*               function rather than the previous bit test and loop to
*               determine the highest priority ready process.
*   26 Mar  82: Added programmed delay for times under 500 microseconds
*               in "delay".
*   08 Jan  82: Added "pending" procedure.
*   06 Jan  82: Added "pause" and "tick" procedures.
*   11 Nov  81: Added timing information to the header.
*   28 Sept 81: Added "delay" procedure, including interrupt service
*               and initialization.  Modified init_kernel to
*               initialize the delay timer counter.
*   25 Sept 81: Corrected the ready vs running compare in preempt.
*   23 Sept 81: Changed schedule, run, and driver routines to minimize
*               the number of registers pushed during each process
*               swap
*   04 Oct  82: Added test for memory overflow not caught at link time,
*               including room for stack allocation.
*
*************************************************************************
;
```

FKERNEL2.WORK.PD8510 THU, DEC 22, 1983, 10:40 AM PAGE 1

```
EXTERNAL DOUBLE stack_top;

PROCEDURE  snapshot;                                        EXTERNAL;
INTEGER PROCEDURE create(process,stacksize,urgency);
   VALUE process, stacksize, urgency;
   DOUBLE process; INTEGER stacksize, urgency;              EXTERNAL;
PROCEDURE run(processid); VALUE processid; INTEGER processid; EXTERNAL;
SUBROUTINE terminate;                                       EXTERNAL;
SUBROUTINE intrpt_tick;                                     EXTERNAL;
SUBROUTINE intrpt_delay_timer;                              EXTERNAL;
SUBROUTINE intrpt_rpg;                                      EXTERNAL;
SUBROUTINE intrpt_top_key;                                  EXTERNAL;
SUBROUTINE intrpt_botton;                                   EXTERNAL;
SUBROUTINE intrpt_uart;                                     EXTERNAL;
SUBROUTINE intrpt_priv_ib_srq;                              EXTERNAL;
```

FKERNEL3.WORK.PD8510 THU, DEC 22, 1983, 10:40 AM PAGE 1

```
PROCEDURE waitio(device); VALUE device; BYTE device;        EXTERNAL;
PROCEDURE delay(delay_time);
   VALUE delay_time; INTEGER delay_time;                    EXTERNAL;
PROCEDURE pause(interval);
   VALUE interval; INTEGER interval;                        EXTERNAL;
```

```
FKERNEL4.WORK.PD8510            THU, DEC 22, 1983, 10:40 AM     PAGE   1


SUBROUTINE preempt;                                          EXTERNAL;
PROCEDURE signal_init(signal,count);
   VALUE signal,count; INTEGER signal,count;                 EXTERNAL;
PROCEDURE resource_init(resource);
   VALUE resource;
   INTEGER resource;                                         EXTERNAL;
BOOLEAN PROCEDURE awaited(signal);
   VALUE signal; INTEGER signal;                             EXTERNAL;
BOOLEAN PROCEDURE pending(signal);
   VALUE signal; INTEGER signal;                             EXTERNAL;
BOOLEAN PROCEDURE conditional_acquire(resource);
   VALUE resource; INTEGER resource;                         EXTERNAL;
```

```
FKEYS.WORK.PD8510               THU, DEC 22, 1983, 10:40 AM     PAGE   1


#FILE ckeys.work;
#FILE cmdcase.work;        & for cmd_illegal, _local, _enter, and _u4 &

EXTERNAL INTEGER TABLE top_key_table.L;
EXTERNAL INTEGER TABLE bot_key_table.L;
```

```
CKEYS.WORK.PD8510               THU, DEC 22, 1983, 10:40 AM     PAGE   1


INTEGER CONSTANT offset         := -64,          & negative values &
                 zero_token     := offset + 0,   & keep these      &
                 one_token      := offset + 1,   & separate from   &
                 two_token      := offset + 2,   & command token   &
                 three_token    := offset + 3,   & values.         &
                 four_token     := offset + 4,
                 five_token     := offset + 5,
                 six_token      := offset + 6,
                 seven_token    := offset + 7,
                 eight_token    := offset + 8,
                 nine_token     := offset + 9,
                 decimal_token  := offset + 10,
                 minus_token    := offset + 11,
                 backspace_token := offset + 13;
```

```
SKEYS.WORK.PD8510               THU, DEC 22, 1983, 10:40 AM     PAGE   1


M68KL,P,"keys"
BEGIN

#FILE ckeys.work;
#FILE cmddecl.work;

GLOBAL INTEGER TABLE top_key_table:=
         cmd_u4,                & 0 &
         nine_token,            & 1 &
         eight_token,           & 2 &
         seven_token,           & 3 &
         cmd_illegal,           & 4 &
         cmd_illegal,           & 5 &
         cmd_key_1,             & 6 &
         cmd_key_5,             & 7 &
         cmd_u3,                & 8 &
         six_token,             & 9 &
         five_token,            & 10 &
         four_token,            & 11 &
         cmd_entry_off,         & 12 &
         cmd_illegal,           & 13 &
         cmd_key_2,             & 14 &
         cmd_key_6,             & 15 &
         cmd_u2,                & 16 &
         three_token,           & 17 &
         two_token,             & 18 &
         one_token,             & 19 &
         cmd_down,              & 20 &
         cmd_illegal,           & 21 &
         cmd_key_3,             & 22 &
         cmd_key_7,             & 23 &
         cmd_enter,             & 24 &
         minus_token,           & 25 &
         decimal_token,         & 26 &
         zero_token,            & 27 &
         cmd_up,                & 28 &
         cmd_prior_menu,        & 29 &
         cmd_key_4,             & 30 &
         cmd_key_8,             & 31 &
         cmd_illegal,           & 32 &
         cmd_mkrval,            & 33 &
         backspace_token,       & 34 &
         cmd_illegal;           & 35 &

GLOBAL INTEGER TABLE bot_key_table:=
         cmd_ch1,                  & 00 &
         cmd_illegal,              & 01 &
         cmd_illegal,              & 02 &
         cmd_illegal,              & 03 &
         cmd_s11,                  & 04 &
         cmd_s12,                  & 05 &
         cmd_mag,                  & 06 &
         cmd_phase,                & 07 &
         cmd_ch2,                  & 08 &
         cmd_illegal,              & 09 &
```

```
SKEYS.WORK.PD8510          THU, DEC 22, 1983, 10:40 AM     PAGE   2

        cnd_illegal,            & 10 &
        cnd_illegal,            & 11 &
        cnd_s21,                & 12 &
        cnd_s22,                & 13 &
        cnd_delay,              & 14 &
        cnd_polar,              & 15 &
        cnd_cal_menu,           & 16 &
        cnd_domain_menu,        & 17 &
        cnd_display_menu,       & 18 &
        cnd_marker_menu,        & 19 &
        cnd_param_menu,         & 20 &
        cnd_illegal,            & 21 &
        cnd_format_menu,        & 22 &
        cnd_illegal,            & 23 &
        cnd_illegal,            & 24 &
        cnd_illegal,            & 25 &
        cnd_preset,  & lab pilot 1  26 &
        cnd_local,              & 27 &
        cnd_save,               & 28 &
        cnd_recall,             & 29 &
        cnd_preset,  & proto H     30 &
        cnd_illegal,            & 31 &
        cnd_scale,              & 32 &
        cnd_auto_scale,         & 33 &
        cnd_illegal,            & 34 &
        cnd_start,              & 35 &
        cnd_center,             & 36 &
        cnd_illegal,            & 37 &
        cnd_illegal,            & 38 &
        cnd_illegal,            & 39 &
        cnd_ref_value,          & 40 &
        cnd_ref_position,       & 41 &
        cnd_illegal,            & 42 &
        cnd_stop,               & 43 &
        cnd_span,               & 44 &
        cnd_illegal,            & 45 &
        cnd_illegal,            & 46 &
        cnd_illegal,            & 47 &
        cnd_response_menu,      & 48 &
        cnd_illegal,            & 49 &
        cnd_illegal,            & 50 &
        cnd_stimulus_menu,      & 51 &
        cnd_illegal,            & 52 &
        cnd_illegal,            & 53 &
        cnd_illegal,            & 54 &
        cnd_illegal,            & 55 &
        cnd_illegal,            & 56 &
        cnd_illegal,            & 57 &
        cnd_copy,               & 58 &
        cnd_tape_menu,          & 59 &
        cnd_system_menu,        & 60 &
        cnd_illegal,            & 61 &
        cnd_measurement_restart, & 62 &
        cnd_illegal;            & 63 &

END$
```

```
SKINFO.WORK.PD8510         THU, DEC 22, 1983, 10:40 AM     PAGE   1

COMMENT
  Configures bit pairs to correspond to softkeys that are used.
  SKnm = softkey position n contains m lines.
  BSKn = softkey position n that brings up another menu
  n    = 1..8
  m    = 0..2
;

INTEGER CONSTANT

  SK11 := 1,
  SK12 := 2,
  SK13 := 3,
  SK21 := 4,
  SK22 := 8,
  SK23 := %C,
  SK31 := %10,
  SK32 := %20,
  SK33 := %30,
  SK41 := %40,
  SK42 := %80,
  SK43 := %C0,
  SK51 := %100,
  SK52 := %200,
  SK53 := %300,
  SK61 := %400,
  SK62 := %800,
  SK63 := %C00,
  SK71 := %1000,
  SK72 := %2000,
  SK73 := %3000,
  SK81 := %4000,
  SK82 := %8000,
  SK83 := %C000,

  BSK1 := %100
  BSK2 := %200,
  BSK3 := %400,
  BSK4 := %800,
  BSK5 := %1000,
  BSK6 := %2000,
  BSK7 := %4000,
  BSK8 := %8000;

COMMENT
      The rest of this file is software generated by GENSK.LAHI.
      Any changes must be made to the input file, SKINFO.WORK.
      ********************************************************
      The following are softkey menu tables configured as follows:
        word 1 = MSByte: corresponding keys that bring up new menus
                 LSByte: menu's highlight bitmap
        word 2 = menu configuration using constants SKnm
        word 3 = keycode number corresponding to softkeys used
         etc.
        word N = up to 10 keycode values
```

```
SKINFO.WORK.PD8510         THU, DEC 22, 1983, 10:40 AM     PAGE   2

;

$ END OF DIRECT COPY OF FILE

;         DOCUMENTATION FOR FRONT PANEL/COMMAND INPUT FILE
;
; "$"  Everything before is copied as is into the output file.
;      Anything desired in the output file without being processed
;      by the "BIG TABLE GENERERATOR" (GENSK) must occur before the "$"
;      provided that it does not reference anything generated after
;      the "$".
;
; ";"  Just for comments.  Will be ignored on input and not copied to
;      any of the output files.
;
; "*"  Starts/seperates softkey menus.  Must occur after "$" and before
;      "#" in the input file.  An error message will be displayed
;      otherwise. Formatted softkey/command information tables are out-
;      put to #FILE FSKEY.
;
; "."  Indicates and prefixes a softkey menu constant name that will be
;      put in #FILE FMENU.WORK which contains these constants and their
;      values.  The values are ordered sequentially as softkey menus are
;      read in and processed.  Must occur immediately after menu
;      menu indicator (.) otherwise an error/warning message will be
;      displayed and the constant identifier MENUn will be used.
;      (n = computed constant value)
;
; "-"  Starts/seperates individual softkeys and/or softkey positions.
;      Must occur between menu indicaters (*).  Only up to 8 softkey
;      entries will be recognized (everything else afterwards until the
;      next menu indicator (*) will be ignored).  Empty or unused
;      softkey positions which occur between occupied softkeys or keys
;      which create unused positions at the top of the menu must have a
;      blank entry between softkey seperators (-).  However, it is not
;      necessary to do this for unused softkeys which create contiguous
;      gaps at the botton of the menu.
;
;      SOFTKEY ANNOTATION FORMAT:
;        <l1> :: "alpha" | byte | "alpha"+<l1> | byte+<l1>
;        <l2> :: same as above
;      where <l1> = 1st line of softkey
;            <l2> = 2nd line of softkey
;      Input lines are direct copies to output file.
;      There is no error checking for the following restrictions:
;        - ALPHA types must be enclosed in algol delimiters (")
;        - Start in column 1, no blanks between ALPHA/BYTE combinations
;          (i.e.  "line 1" + 122  should be  "line 1"+122).
;        - Each line should not exceed 10 characters/bytes.
;
;      BRACKET CHARACTERS:
;      sk_bracket_n (n=2..7) is a byte constant that will generate a
;      character bracketing off n softkey annotations from the first
;      line of a softkey entry position.  It should be the last
;      character of the first line of a softkey position heading off
;      a bracketed group of softkeys.  If the softkey annotatic-
```

```
SKINFO.WORK.PD8510         THU, DEC 22, 1983, 10:41 AM     PAGE   3

;      heading off the bracketed group consists of a single line, then
;      a two line entry should be created.  See the following examples:
;      e.g.  two-line annotation:               one-line annotation:
;        "LINE ONE"+sk_bracket_4              sk_bracket_4
;        "LINE TWO"                           half_vt+"LINE ONE"
;
;      NOTE:  Softkey annotations should be the FIRST piece of info.
;      within softkey entries !!!
;
; "["  Prefixes and indicates a command token constant for a softkey
;      entry or front panel/HP-IB command code.  An error message
;      will be displayed if more than one command value indicator occurs
;      in a single softkey entry.  Constant values are determined
;      sequentially and correspond to the occurrence of each softkey
;      entry (whether or not it has a command value indicator).
;      These constants and their and values can be found in
;      #FILEs corresponding to the most recent filename read via
;      "0".."9","A".."O" prefixes.
;
; "]"  Indicates and prefixes duplicate command token constants which
;      have been previously declared to correspond to an identical
;      function AND refer to the same annotation (for softkeys).
;      This eliminates more than one command code per identical
;      function.  In this case, case statement entries (',') should be
;      omitted since they are taken care of by the previously declared
;      command code.
;      NOTE:  Must occur within softkey entries ('-') or after '#'.
;      Any case statement entries (',') following it will be ignored.
;      Any case statement entries before it will cause this entry to
;      be unrecognized (only within softkey entry information).
;
; ","  Indicate and prefix Algol statements to be executed corresponding
;      to the current command token (softkey entry/HP-IB printive) being
;      processed.  They may occur only within softkey entries or after
;      command token constants.  They should not proceed ']' prefixes.
;      NOTE:  Syntax errors will not be checked.
;
; "^"  Indicates that a softkey brings up another menu.  "^" is followed
;      by the menu number (immediate or constant) of the menu that
;      softkey is to generate.  Only one "^" per softkey entry allowed.
;
; "A".."O" and
; "0".."9"
;      Marks the start of a group of case statements enclosed in a
;      PROCn procedure (n = 0..25, {A=10,B=11..O=25}) and its
;      corresponding command token constants.  A filename MUST proceed
;      each character entry (which can only be used ONCE):
;            <char><filename>
;      There will be two seperate files produced using the given file
;      name: 1) C<filename>  for command token constants
;            2) F<filename>  for corresponding case statements
;      All command token constants (indicated by '[') and corresponding
;      segments of code (indicated by ',') will be read into these
;      files.
;      These character prefixes may occur after the '$', before or after
;      menu entries, at the beginning or end of softkey entries, or
```

```
SKINFO.WORK.PD8510             THU, DEC 22, 1983, 10:41 AM     PAGE  4

;       before command token entries '[' occuring after '#'.
;
;       NOTE:  The module which includes F<filename> must also include
;       #FILE FCOMMAND.WORK or an external declaration of the integer
;       variable command_token.
;
; "#"   Indicates the end of menu entries and ignores any entries found
;       after the occurrence of "#".  Only command value indicators, ([)
;       or (]), immediately followed by statement indicators (,) are
;       processed.  This segment of the input file is for HPIB primitives
;       which do not have corresponding softkeys, and for front panel
;       keys which need command values in order to be processed.
;       Error messages are displayed for any input other than that just
;       described.
;
; "@"   Indicates that a command token entry is a software option.
;       It should be followed by a number 0..9  which identifies the
;       which software option that particular command is under (i.e.
;       time domain commands = 1, error correction commands = 2, etc.).
;       The INFO parameter (string) passed upon running GENSK contains
;       a string of software option numbers (0..9).  Each digit will
;       correspond to a software option family that will generate the
;       Algol statements (via ",") for a command token entry.  These
;       program statements are omitted, otherwise.
;       Command token entries without the "@" directive are not options
;       and will not omit program statements in their entries.

1dtmgr.work.L
```

```
SKINFO.WORK.PD8510             THU, DEC 22, 1983, 10:41 AM     PAGE  5

*EJECT**********
.TAPE_MENU
--------
"DIRECTORY"
[cmd_directory
,IF valid_directory THEN
,  BEGIN
,    gen_menu(DIRECTORY_MENU, 1);
,    list_directory;
,  END;
--------
"STORE"
,setup_tape_op(record_op);
--------
"LOAD"
,setup_tape_op(restore_op);
--------
"DELETE"
,setup_tape_op(delete_op);
--------
"UN-DELETE"
,undelete_file;
--------

--------
--------
"INITIALIZE"
"TAPE"
^INIT_TAPE_MENU
--------
```

```
SKINFO.WORK.PD8510             THU, DEC 22, 1983, 10:41 AM     PAGE  6

*EJECT**********
.INIT_TAPE_MENU
--------
"INIT TAPE?"
"YES"
,init;
--------
"NO"
,previous_menu;
--------
```

```
SKINFO.WORK.PD8510             THU, DEC 22, 1983, 10:41 AM     PAGE  7

*EJECT**********
.DIRECTORY_MENU
--------
"RESTORE"
"DISPLAY"
[cmd_directory_off
--------

--------

--------
"NEXT"
"PAGE"
[cmd_next_page
,list_directory;
--------
"PREVIOUS"
"PAGE"
[cmd_prev_page
,list_directory;
--------

--------
"FIRST"
"PAGE"
[cmd_first_page
,list_directory;
--------
"LAST"
"PAGE"
[cmd_last_page
,list_directory;
--------
```

SKINFO.WORK.PD8510 THU, DEC 22, 1983, 10:41 AM PAGE 8

```
*EJECT**********
.DATA2_MENU
--------
"RAW"
"DATA"
,gen_file_menu(s_param_file);
--------
"DATA"
,gen_file_menu(data_file);
--------
"FORMATTED"
"DATA"
,gen_file_menu(format_file);
--------

--------
"USER"
"DISPLAY"
,gen_file_menu (display_file);
--------

--------

--------
"MACHINE"
"DUMP"
[cmd_machine_dump
,gen_file_menu(machine_file);
--------
```

SKINFO.WORK.PD8510 THU, DEC 22, 1983, 10:41 AM PAGE 9

```
*EJECT**********
.DATA1_MENU
--------
"INSTRUMENT"
"STATE"
,gen_reg_menu(state_file);
--------
"INSTRUMENT"
"STATES 1-5"
,gen_file_menu(state_set);
--------
"MEMORY"
"TRACE"
,gen_reg_menu(memory_file);
--------
"MEMORY"
"TRACES 1-4"
,gen_file_menu(memory_set);
--------
"CAL SET"
,gen_reg_menu(cal_file);
--------
"CAL SETS"
"1-8"
,gen_file_menu(cal_set);
--------
"CAL KIT"
,gen_reg_menu(cal_std_file);
--------
"MORE"
[cmd_more
,& dummy statement &;
^DATA2_MENU
--------
```

SKINFO.WORK.PD8510 THU, DEC 22, 1983, 10:41 AM PAGE 10

```
*EJECT**********
.ABORT_MENU
--------
"ABORT"
--------
```

SKINFO.WORK.PD8510 THU, DEC 22, 1983, 10:41 AM PAGE 11

```
*EJECT************
.FILE_MENU
--------
"DATA TYPE "
"* FILE 1"
[cmd_file_1
,file_chosen;
--------
" "
"* FILE 2"
[cmd_file_2
,file_chosen;
--------
" "
"* FILE 3"
,file_chosen;
--------
" "
"* FILE 4"
,file_chosen;
--------
" "
"* FILE 5"
,file_chosen;
--------
" "
"* FILE 6"
,file_chosen;
--------
" "
"* FILE 7"
,file_chosen;
--------
" "
"* FILE 8"
[cmd_file8
,file_chosen;
--------
```

```
SKINFO.WORK.PD8510          THU, DEC 22, 1983, 10:41 AM     PAGE  12

*EJECT***********
.REG_MENU
--------
"DATA TYPE "
"* 1 "
[cmd_reg_1
,reg_chosen;
--------
" "
"* 2 "
[cmd_reg_2
,reg_chosen;
--------
" "
"* 3 "
[cmd_reg_3
,reg_chosen;
--------
" "
"* 4 "
[cmd_reg_4
,reg_chosen;
--------
"(POWER UP)"
"* 5 "
[cmd_reg_5
,reg_chosen;
--------
" "
"* 6 "
[cmd_reg_6
,reg_chosen;
--------
" "
"* 7 "
[cmd_reg_7
,reg_chosen;
--------
" "
"LAST STATE"
[cmd_reg_8
,reg_chosen;
--------

3resp.work.L
```

```
SKINFO.WORK.PD8510          THU, DEC 22, 1983, 10:41 AM     PAGE  13

*EJECT******
.RESPONSE_MENU
--------
"ELECTRICAL"+sk_bracket_2
"DELAY"
[cmd_elect_delay
,select_active_function( active_electrical_length );
--------
"AUTO DELAY"
[cmd_auto_delay
,warn( command_not_implemented );
--------
"PHASE"
"OFFSET"
[cmd_phase_offset
,select_active_function( active_phase_offset );
--------
"MAGNITUDE"
"OFFSET"
,warn( command_not_implemented );
,& select_active_function( active_magnitude_offset ); &
--------
"AVERAGING"+sk_bracket_2
"ON/RESTART"
[cmd_if_avg_on
,if_average_on;
--------
"OFF"
[cmd_if_avg_off
,if_average_off;
--------
"SMOOTHING"+sk_bracket_2
"ON "
[cmd_smoothing_on
,display_smoothing_on;
--------
"OFF"
[cmd_smoothing_off
,display_smoothing_off;
--------
```

```
SKINFO.WORK.PD8510          THU, DEC 22, 1983, 10:41 AM     PAGE  14

*EJECT********
.IF_GAIN_MENU
--------
"TEST"+sk_bracket_2
"AMP. GAIN"
[cmd_if_test_port
^IF_GAIN_MENU2
,new_if_gain_port( test_port );
--------
"REFERENCE"
"AMP. GAIN"
[cmd_if_ref_port
^IF_GAIN_MENU2
,new_if_gain_port( ref_port );
--------

--------

--------

--------

--------

--------

--------
```

```
SKINFO.WORK.PD8510          THU, DEC 22, 1983, 10:41 AM     PAGE  15

*EJECT*******
.IF_GAIN_MENU2
--------
"GAIN"+sk_bracket_6
"0 (MIN.)"
[cmd_if_no_gain
,new_if_gain( if_no_gain );
--------
" 1 "
[cmd_if_12db_gain
,new_if_gain( if_12db_gain );
--------
" 2 "
[cmd_if_24db_gain
,new_if_gain( if_24db_gain );
--------
" 3 "
[cmd_if_36db_gain
,new_if_gain( if_36db_gain );
--------
"4 (MAX.)"
[cmd_if_48db_gain
,new_if_gain( if_48db_gain );
--------
"AUTO"
[cmd_if_gain_auto
,new_if_gain( auto_range );
--------

--------

--------

4stin.work.L
```

```
SKINFO.WORK.PD8510              THU, DEC 22, 1983, 10:41 AM     PAGE  16

*EJECT*******
.STIMULUS_MENU
--------
"POWER"
"MENU"
[cmd_power_menu
^POWER_MENU
--------
"SWEEP"
"TIME"
[cmd_sweep_time
,select_active_function(active_sweep_time);
--------
"NUMBER of"
"POINTS"
^N_POINTS_MENU
[cmd_n_points_menu
--------

--------
"SINGLE"+sk_bracket_3
"POINT"
[cmd_cw
,BEGIN
,  hilight_on( cmd_cw, cmd_stepped);
,  cw_mode;
,END;
--------
"RAMP"
[cmd_swept
,BEGIN
,  hilight_on( cmd_cw, cmd_stepped);
,  swept_mode;
,END;
--------
"STEP"
[cmd_stepped
,BEGIN
,  hilight_on( cmd_cw, cmd_stepped);
,  stepped_mode;
,END;
--------
"MORE"
^STIMULUS2_MENU
]cmd_more
--------
```

```
SKINFO.WORK.PD8510              THU, DEC 22, 1983, 10:41 AM     PAGE  17

*EJECT********
.N_POINTS_MENU
--------
"POINTS:"+sk_bracket_4
"51 "
[cmd_51_points
,new_step_size( 16 );
--------
"101"
[cmd_101_points
,new_step_size( 8 );
--------
"201"
[cmd_201_points
,new_step_size( 4 );
--------
"401"
[cmd_401_points
,new_step_size( 2 );
--------

--------

--------

--------

--------
```

```
SKINFO.WORK.PD8510              THU, DEC 22, 1983, 10:41 AM     PAGE  18

*EJECT*******
.POWER_MENU
--------
"POWER"
[cmd_source_power
,select_active_function(active_source_power);
--------

--------
"SLOPE"+sk_bracket_2
"ON "
[cmd_power_slope
,BEGIN
,   hilight_on( cmd_power_slope, cmd_power_slope_off );
,   set_entry_ch_integer( power_slope_on, ch_power_slope_mode );
,   wrt_priv_ib_source( sl1, newline);
,   select_active_function( active_power_slope );
,END;
--------
"OFF"
[cmd_power_slope_off
,BEGIN
,   hilight_on( cmd_power_slope, cmd_power_slope_off );
,   set_entry_ch_integer( power_slope_off, ch_power_slope_mode );
,   select_active_off( active_power_slope );
,   wrt_priv_ib_source( sl0, "");
,END;
--------

--------
"ATTENUATOR"+sk_bracket_2
"PORT 1"
[cmd_atten_port1
,select_active_function(active_atten_port1);
--------
"PORT 2"
[cmd_atten_port2
,select_active_function(active_atten_port2);
--------

--------
```

```
SKINFO.WORK.PD8510              THU, DEC 22, 1983, 10:41 AM     PAGE  19

*EJECT*******
.STIMULUS2_MENU
--------
sk_bracket_4
half_vt+"HOLD"
[cmd_hold
,hold_sweep;
--------
"SINGLE"
[cmd_single
,single_sweep;
--------
"NUMBER of"
"GROUPS"
[cmd_n_groups_kbd
,select_active_function(active_n_groups_kbd);
--------
"CONTINUAL"
[cmd_continuous
,continuous_sweep;
--------
"STIMULUS"
"OFFSET"
,BEGIN                                                          & DEBUG &
,warn(command_not_implemented );                                & DEBUG &
,& select_active_function( active_stimulus_offset ); &
,END;                                                           & DEBUG &
--------

--------
sk_bracket_2
half_vt+"Ch1 = Ch2"
[cmd_couple_stimulus
,BEGIN
,  hilight_on( cmd_couple_stimulus, cmd_uncouple_stimulus );
,  set_coupled_stimulus_status( TRUE );
,END;
--------
"Ch1 "+163+" Ch2"
[cmd_uncouple_stimulus
,BEGIN
,  hilight_on( cmd_couple_stimulus, cmd_uncouple_stimulus );
,  set_coupled_stimulus_status( FALSE );
,END;
--------
```

```
SKINFO.WORK.PD8510            THU, DEC 22, 1983, 10:41 AM     PAGE  20

*EJECT*******
.DEVICE_READY_MENU
--------

--------
"PRESS TO"
"CONTINUE"
,BEGIN
,    previous_menu;
,    device_reversed;
,END;
--------

--------

--------

--------

--------

--------

--------

$params.work.L
```

```
SKINFO.WORK.PD8510            THU, DEC 22, 1983, 10:41 AM     PAGE  21

*EJECT*******
.PARAM_MENU
--------
"a"+177+sk_bracket_4
[cmd_user1
,new_parameter( user1 );
--------
"b"+178
[cmd_user2
,new_parameter( user2 );
--------
"a"+178
[cmd_user3
,new_parameter( user3 );
--------
"b"+177
[cmd_user4
,new_parameter( user4 );
--------

--------

--------
"REDEFINE"
"PARAMETER"
^REDEF_MENU
[cmd_redefine_param
--------

--------
```

```
SKINFO.WORK.PD8510            THU, DEC 22, 1983, 10:41 AM     PAGE  22

*EJECT*******
.REDEF_MENU
--------
"REDEFINE"+sk_bracket_6
"DRIVE"
^REDEF_DRIVE_MENU
--------
"PHASE LOCK"
^REDEF_LOCK_MENU
--------
"NUMERATOR"
^REDEF_NUM_MENU
--------
"DENOMI-"
"NATOR"
^REDEF_DENOM_MENU
--------
"CONVERSION"
^REDEF_CONV_MENU
--------
"PARAMETER"
"LABEL"
[cmd_label_parameter
,warn( command_not_implemented );
--------

--------
"REDEFINE"
"DONE"
[cmd_redefine_done
,pop_menu( PARAM_MENU );
--------
```

```
SKINFO.WORK.PD8510            THU, DEC 22, 1983, 10:41 AM     PAGE  23

*EJECT*******
.REDEF_DRIVE_MENU
--------
"DRIVE"+sk_bracket_3
"PORT 1"
,redefine_param( driven_port, driven_a1 );
--------
"PORT 2"
,redefine_param( driven_port, driven_a2 );
--------
"NONE"
,redefine_param( driven_port, driven_none );
--------

--------

--------

--------

--------

--------
```

```
SKINFO.WORK.PD8510          THU, DEC 22, 1983, 10:41 AM     PAGE  24

*EJECT*******
.REDEF_LOCK_MENU
--------
"LOCK to"+sk_bracket_3
"a1 "
,redefine_param( phase_lock_port, lock_to_a1 );
--------
"a2 "
,redefine_param( phase_lock_port, lock_to_a2 );
--------
"NONE"
,redefine_param( phase_lock_port, lock_donot_care );
--------

--------

--------

--------

--------

--------
```

```
SKINFO.WORK.PD8510          THU, DEC 22, 1983, 10:41 AM     PAGE  25

*EJECT*******
.REDEF_NUM_MENU
--------
"NUMERATOR"+sk_bracket_5
"b1 "
,redefine_param( numerator_port, num_b1 );
--------
"b2 "
,redefine_param( numerator_port, num_b2 );
--------
"a1 "
,redefine_param( numerator_port, num_a1 );
--------
"a2 "
,redefine_param( numerator_port, num_a2 );
--------
"SERVICE"
"SELECTIONS"
^REDEF_NUM2_MENU
--------

--------

--------

--------
```

```
SKINFO.WORK.PD8510          THU, DEC 22, 1983, 10:41 AM     PAGE  26

*EJECT*******
.REDEF_NUM2_MENU
--------
"100 kHz"+sk_bracket_8
"TEST CAL"
,redefine_param( numerator_port, num_100khz_cal );
--------
"100 kHz"
"REF CAL"
,redefine_param( numerator_port, num_ref_100khz_cal );
--------
"DETECTOR"
"GROUND"
,redefine_param( numerator_port, num_detector_gnd );
--------
"ADC GROUND"
,redefine_param( numerator_port, num_adc_gnd );
--------
"VCAL"
,redefine_param( numerator_port, num_vcal );
--------
"VREF"
,redefine_param( numerator_port, num_vref );
--------
"TEMP. 1"
,redefine_param( numerator_port, num_temp1 );
--------
"TEMP. 2"
,redefine_param( numerator_port, num_temp2 );
--------
```

```
SKINFO.WORK.PD8510          THU, DEC 22, 1983, 10:41 AM     PAGE  27

*EJECT*******
.REDEF_DENOM_MENU
--------
"DENOM."+sk_bracket_4
"a1 "
,redefine_param( denominator_port, denom_a1 );
--------
"a2 "
,redefine_param( denominator_port, denom_a2 );
--------
"b1 "
,redefine_param( denominator_port, denom_b1 );
--------
"NO RATIO"
,redefine_param( denominator_port, denom_no_ratio );
--------

--------

--------

--------
```

SKINFO.WORK.PD8510 THU, DEC 22, 1983, 10:41 AM PAGE 28

```
*EJECT*******
.REDEF_CONV_MENU
--------
"CONVERT"+sk_bracket_4
"to   S"
[cmd_convert_off
,redefine_param( parameter_conversion, conv_off );
--------
"to 1/S"
[cmd_convert_recip
,redefine_param( parameter_conversion, conv_reciprocal );
--------
"to   Z"
[cmd_convert_to_z
,redefine_param( parameter_conversion, conv_s_to_z );
--------
"to   Y"
[cmd_convert_to_y
,redefine_param( parameter_conversion, conv_s_to_y );
--------

--------

--------

--------

--------

6format.work.L
```

SKINFO.WORK.PD8510 THU, DEC 22, 1983, 10:41 AM PAGE 29

```
*EJECT*******
.FORMAT_MENU
--------
sk_bracket_8
half_vt+"SWR"
[cmd_swr
,new_format( fmt_swr );
--------
"LINEAR"
"MAGNITUDE"
[cmd_linear_mag
,new_format( fmt_linear_mag );
--------
"POLAR w/"
"LIN MKR"
[cmd_linear_polar
,new_format( fmt_linear_polar );
--------
"POLAR w/"
"LOG MKR"
[cmd_log_polar
,new_format( fmt_log_polar );
--------
"POLAR w/"
"Re/Im MKR"
[cmd_imag_vs_real
,new_format( fmt_imag_vs_real );
--------
"INVERTED"
"SMITH"
[cmd_y_smith
,new_format( fmt_y_smith );
--------
"IMAGINARY"
[cmd_imaginary
,new_format( fmt_imaginary );
--------
"REAL"
[cmd_real
,new_format( fmt_real );
--------

Bdomenu.work.L
```

SKINFO.WORK.PD8510 THU, DEC 22, 1983, 10:41 AM PAGE 30

```
*EJECT********
.DOMAIN_MENU
--------
sk_bracket_4
half_vt+"FREQUENCY"
[cmd_freq_domain
,BEGIN
,   hilight_on( cmd_freq_domain, cmd_aux_domain);
,   set_domain( freq_domain );
,END;
--------
"TIME"
"LOW PASS"
^LOW_PASS_FREQ
[cmd_low_pass_request
--------
"TIME"
"BAND PASS"
[cmd_time_domain
,BEGIN
,   hilight_on( cmd_freq_domain, cmd_aux_domain);
,   set_domain( time_domain );
,END;
--------
"AUX. VOLT"
"OUTPUT"
[cmd_aux_domain
,BEGIN
,   warn( command_not_implemented );                    & DEBUG &
,   hilight_on( cmd_freq_domain, cmd_aux_domain);
,   set_domain( aux_domain );
,END;
--------

--------
"SPECIFY"+sk_bracket_2
"TIME"
[cmd_setup_time_domain
^TIME_SETUP_MENU
--------
"GATE"
[cmd_setup_gate_domain
^GATE_SETUP_MENU
,select_active_gate( 0 );                    & turn on gate markers &
--------

--------
```

SKINFO.WORK.PD8510 THU, DEC 22, 1983, 10:41 AM PAGE 31

```
*EJECT*******
.LOW_PASS_FREQ
--------

--------
"SET FREQ."
"(LOW PASS)"
[cmd_tdr_domain
,BEGIN
,   tdr_check;
,   hilight_key( cmd_low_pass_request, cmd_freq_domain, cmd_aux_domain);
,   set_domain( tdr_domain );
,   previous_menu;
,END;
--------

--------

--------

--------

--------

--------

--------
```

```
*EJECT*******
.TIME_SETUP_MENU
---------
"LOW PASS:"+sk_bracket_2
"STEP"
[cmd_tdr_step
,BEGIN
,   hilight_on( cmd_tdr_step, cmd_tdr_impulse);
,   set_entry_ch_integer( step_tdr, ch_tdr_stimulus_type );
,   update_domain_vars;
,END;
---------
"IMPULSE"
[cmd_tdr_impulse
,BEGIN
,   hilight_on( cmd_tdr_step, cmd_tdr_impulse);
,   set_entry_ch_integer( impulse_tdr, ch_tdr_stimulus_type );
,   update_domain_vars;
,END;
---------

---------

---------
"WINDOW:"+sk_bracket_3
"MAXIMUM"
[cmd_max_time_window
,set_time_window( max_window);
---------
"NORMAL"
[cmd_normal_time_window
,set_time_window( normal_window);
---------
"MINIMUM"
[cmd_min_time_window
,set_time_window( min_window);
---------

---------
```

```
*EJECT*******
.GATE_SETUP_MENU
---------
"GATE"+sk_bracket_2
"ON"
[cmd_gate_on
,BEGIN
,   set_entry_ch_integer( gate_on, ch_gating );
,   set_gate_status;
,END;
---------
"OFF"
[cmd_gate_off
,BEGIN
,   set_entry_ch_integer( gate_off, ch_gating );
,   marker_state := marker_state AND gate_markers_off;
,   set_gate_status;
,END;
---------
"GATE"+sk_bracket_4
"START"
[cmd_gate_start
,select_active_gate( active_gate_start );
---------
"STOP"
[cmd_gate_stop
,select_active_gate( active_gate_stop );
---------
"CENTER"
[cmd_gate_center
,select_active_gate( active_gate_center );
---------
"SPAN"
[cmd_gate_span
,select_active_gate( active_gate_span );
---------
"GATE SHAPE"
^GATE_SHAPE_MENU
---------

---------
```

```
*EJECT*******
.GATE_SHAPE_MENU
---------

---------

---------

---------

---------
"GATE SHAPE"+sk_bracket_4
"MAXIMUM"
[cmd_max_gate_window
,set_gate_window( max_gate );
---------
"WIDE"
[cmd_wide_gate_window
,set_gate_window( wide_gate );
---------
"NORMAL"
[cmd_normal_gate_window
,set_gate_window( normal_gate );
---------
"MINIMUM"
[cmd_min_gate_window
,set_gate_window( min_gate );
---------

?calmenu.work.L
```

```
*EJECT*******
.CAL_MENU
---------
"CORRECTION"+sk_bracket_3
"ON"
[cmd_correction_on
,correction_on(default_cal_set);
---------
"OFF"
[cmd_correction_off
,correction_off;
---------
"SELECT"
"CAL SET"
[cmd_correction_default
,BEGIN
,   tell( select_cal_set );
,   gen_cal_info( no_op );
,END;
---------

---------
"CALIBRATE"+sk_bracket_3
"( KIT #1 )"
[cmd_cal_kit_1
,if_correct_off_select_cal_kit( 1 );
---------
"CALIBRATE"
"( KIT #2 )"
[cmd_cal_kit_2
,if_correct_off_select_cal_kit( 2 );
---------
"RESUME CAL"
"SEQUENCE"
,resume_cal;
---------
"MORE"
]cmd_more
^MORE_CAL
---------
```

```
*EJECT******
.MORE_CAL
--------
"REFERENCE"
"PLANES"
^REF_PLANE_MENU
[cmd_ref_plane_menu
--------
"SET Z"+176
,select_active_function( active_system_z0 );
--------
"CAL SWEEP"
"VOLTAGE"
,warn(command_not_implemented);
--------

--------
"MODIFY KIT"+sk_bracket_2
"( KIT #1 )"
[cmd_modify_cal_kit_1
^MODIFY_CAL_KIT_MENU
,select_cal_kit( 1 );
--------
"MODIFY KIT"
"( KIT #2 )"
[cmd_modify_cal_kit_2
^MODIFY_CAL_KIT_MENU
,select_cal_kit( 2 );
--------

--------
"DELETE A"
"CAL SET"
[cmd_delete_cal
,BEGIN
,   tell( select_delete_cal_set );
,   gen_cal_info( clear_op );
,END;
--------
```

```
*EJECT*******
.REF_PLANE_MENU
--------

--------

--------
sk_bracket_2
half_vt+"PLANE 1"
[cmd_ref_plane_1
,select_active_function( active_ref_plane_1 );
--------
"PLANE 2"
[cmd_ref_plane_2
,select_active_function( active_ref_plane_2 );
--------

--------

--------

--------

--------
```

```
*EJECT******
.CAL_TYPE_MENU
--------

--------
"SET FREQ."
"(LOW PASS)"
[cmd_freq_setup
,tdr_check;
--------

--------
"FREQUENCY"+sk_bracket_5
"RESPONSE"
[cmd_response_type
,set_cal_type( response );
--------
"S"+177+177+"  "
"1-PORT"
[cmd_1_port_1_type
,set_cal_type( one_port_on_1 );
--------
"S"+178+178+"  "
"1-PORT"
[cmd_1_port_2_type
,set_cal_type( one_port_on_2 );
--------
"ONE-PATH"
"2-PORT"
[cmd_simple_2_port_type
,set_cal_type( simple_two_port );
--------
"FULL"
"2-PORT"
[cmd_2_port_type
,set_cal_type( two_port );
--------
```

```
*EJECT*******
.PORT_ONE_REFL
--------
"S"+177+177+"  "+sk_bracket_3
"PORT1. STD1"
[cmd_port1_std1
,set_std_class( port1_1st_std );
--------
"PORT1 STD2"
[cmd_port1_std2
,set_std_class( port1_2nd_std );
--------
"PORT1 STD3"
[cmd_port1_std3
,set_std_class( port1_3rd_std );
--------

--------

--------

--------

--------
"SAVE"
"S"+177+177+" CAL"
[cmd_done_1_port_on_1
,cal_done( done_1_port_on_1 );
--------
```

```
SKINFO.WORK.PD8510            THU, DEC 22, 1983, 10:41 AM     PAGE  40

*EJECT*******
.PORT_TWO_REFL
--------
"S"+178+178+"  "+sk_bracket_3
"PORT2 STD1"
[cmd_port2_std1
,set_std_class( port2_1st_std );
--------
"PORT2 STD2"
[cmd_port2_std2
,set_std_class( port2_2nd_std );
--------
"PORT2 STD3"
[cmd_port2_std3
,set_std_class( port2_3rd_std );
--------

--------

--------

--------

--------
"SAVE"
"S"+178+178+" CAL"
[cmd_done_1_port_on_2
,cal_done( done_1_port_on_2 );
--------
```

```
SKINFO.WORK.PD8510            THU, DEC 22, 1983, 10:41 AM     PAGE  41

*EJECT*******
.CAL_MENU2
--------
sk_bracket_3
half_vt+"REFLECT'N"
[cmd_cal_reflection
^REFLECTION_MENU
,check_refl_status;
--------
"TRANS-"
"MISSION"
[cmd_cal_thru
^TRANSMISSION_MENU
,tell( connect_thru );
--------
"ISOLATION"
[cmd_cal_isolation
^ISOLATION_MENU
,tell( isolate_ports );
--------

--------

--------

--------

--------
"SAVE"
"2-PORT CAL"
[cmd_done_2_port
,cal_done( done_2_port );
--------
```

```
SKINFO.WORK.PD8510            THU, DEC 22, 1983, 10:41 AM     PAGE  42

*EJECT*******
.REFLECTION_MENU
--------
"S"+177+177+"  "+sk_bracket_3
"PORT1 STD1"
]cmd_port1_std1
--------
"PORT1 STD2"
]cmd_port1_std2
--------
"PORT1 STD3"
]cmd_port1_std3
--------
"S"+178+178+"  "+sk_bracket_3
"PORT2 STD1"
]cmd_port2_std1
--------
"PORT2 STD2"
]cmd_port2_std2
--------
"PORT2 STD3"
]cmd_port2_std3
--------

--------
"REFLECT'N"
"DONE"
[cmd_done_reflection
,cal_done( done_reflection );
--------
```

```
SKINFO.WORK.PD8510            THU, DEC 22, 1983, 10:41 AM     PAGE  43

*EJECT*******
.TRANSMISSION_MENU
--------

--------
"FWD.TRANS."
"FWD_TRANS_"
[cmd_fwd_transmission
,   set_std_class( trans_fwd_std );
--------
"FWD.MATCH"
"FWD_MATCH_"
[cmd_fwd_match
,   set_std_class( match_fwd_std  );
--------
"REV.TRANS."
"REV_TRANS_"
[cmd_rev_transmission
,   set_std_class( trans_rev_std );
--------
"REV.MATCH"
"REV_MATCH_"
[cmd_rev_match
,   set_std_class( match_rev_std );
--------

--------

--------
"TRANS."
"DONE"
[cmd_done_trans
,cal_done( done_trans );
--------
```

```
SKINFO.WORK.PD8510          THU, DEC 22, 1983, 10:41 AM     PAGE 44

*EJECT*******
.ISOLATION_MENU
--------

--------

--------
"OMIT"
"ISOLATION"
[cmd_omit_isolation
,omit_isolation;
--------

--------
"FWD ISOL'N"
"FWD_ISOLN_"
[cmd_fwd_isolation
,set_std_class( isoln_fwd_std );
--------
"REV ISOL'N"
"REV_ISOLN_"
[cmd_rev_isolation
,set_std_class( isoln_rev_std );
--------

--------
"ISOLATION"
"DONE"
[cmd_done_isolation
,cal_done(done_isol);
--------
```

```
SKINFO.WORK.PD8510          THU, DEC 22, 1983, 10:41 AM     PAGE 45

*EJECT*******
.CAL_MENU3
--------
sk_bracket_3
half_vt+"REFLECT'N"
[cmd_cal_simple_reflection
^SIMPLE_REFLECTION_MENU
,check_refl_status;
--------
"TRANS-"
"MISSION"
[cmd_cal_simple_thru
^SIMPLE_TRANSMISSION_MENU
,tell( connect_thru );
--------
"ISOLATION"
[cmd_cal_simple_isolation
^SIMPLE_ISOLATION_MENU
,tell( isolate_ports );
--------

--------

--------

--------

--------
"SAVE"
"2-PORT CAL"
]cmd_done_2_port
--------
```

```
SKINFO.WORK.PD8510          THU, DEC 22, 1983, 10:41 AM     PAGE 46

*EJECT*******
.SIMPLE_REFLECTION_MENU
--------
"S"+177+177+sk_bracket_3
"PORT1 STD1"
]cmd_port1_std1
--------
"PORT1 STD2"
]cmd_port1_std2
--------
"PORT1 STD3"
]cmd_port1_std3
--------

--------

--------

--------

--------
"REFLECT'N"
"DONE"
[cmd_done_simple_reflection
,cal_done( done_1_port_on_1 );
--------
```

```
SKINFO.WORK.PD8510          THU, DEC 22, 1983, 10:41 AM     PAGE 47

*EJECT*******
.SIMPLE_TRANSMISSION_MENU
--------

--------
"FWD.TRANS."
"FWD_TRANS_"
]cmd_fwd_transmission
--------
"FWD.MATCH"
"FWD_MATCH_"
]cmd_fwd_match
--------

--------

--------

--------

--------
"TRANS."
"DONE"
]cmd_done_trans
--------
```

```
SKINFO.WORK.PD8510            THU, DEC 22, 1983, 10:41 AM     PAGE  48

*EJECT*******
.SIMPLE_ISOLATION_MENU
--------

--------

--------
"OMIT"
"ISOLATION"
]cmd_omit_isolation
--------

--------
"FWD ISOL'N"
"FWD_ISOLN_"
]cmd_fwd_isolation
--------

--------

--------
"ISOLATION"
"DONE"
]cmd_done_isolation
--------
```

```
SKINFO.WORK.PD8510            THU, DEC 22, 1983, 10:41 AM     PAGE  49

*EJECT*******
.STD_CLASS_MENU
--------
"STANDARD 1"
[cmd_class_std1
,set_element( 1 );
--------
"STANDARD 2"
[cmd_class_std2
,set_element( 2 );
--------
"STANDARD 3"
[cmd_class_std3
,set_element( 3 );
--------
"STANDARD 4"
[cmd_class_std4
,set_element( 4 );
--------
"STANDARD 5"
[cmd_class_std5
,set_element( 5 );
--------
"STANDARD 6"
[cmd_class_std6
,set_element( 6 );
--------
"STANDARD 7"
[cmd_class_std7
,set_element( 7 );
--------
"STANDARDS "
"DONE"
[cmd_class_done
,cal_done(done_class);
--------
```

```
SKINFO.WORK.PD8510            THU, DEC 22, 1983, 10:41 AM     PAGE  50

*EJECT*******
.SLIDING_LOAD_MENU
--------
"SLIDE IS"
"SET"
,acquire_data;
--------

--------

--------

--------

--------

--------

--------
"SLIDING"
"LOAD DONE"
,compute_load;
--------

Cstdmenu.work.L
```

```
SKINFO.WORK.PD8510            THU, DEC 22, 1983, 10:41 AM     PAGE  51

*EJECT*******
.MODIFY_CAL_KIT_MENU
--------
"SELECT"
"STANDARD"
[cmd_select_std
,select_active_function( active_std_id );
--------

--------
"SPECIFY"
"STD CLASS"
[cmd_specify_classes
^SPECIFY_CLASS_MENU
,tell( select_std_class );
--------
"LABEL"
"STD CLASS"
[cmd_label_classes
,warn( command_not_implemented );
--------

--------
"LABEL"
"CAL KIT"
[cmd_label_cal_kit
,warn( command_not_implemented );
--------

--------
"DONE"
"(DEFINED)"
[cmd_cal_kit_defined
,cal_kit_defined;
--------
```

```
*EJECT*******
.MODIFY_STDS_MENU
--------
"STD TYPE"+sk_bracket_5
"OPEN"
[cmd_define_open
^DEFINE_OPEN_MENU
,define_std( std_open );
--------
"SHORT"
[cmd_define_short
^DEFINE_SHORT_MENU
,define_std( std_short );
--------
"LOAD"
[cmd_define_load
^DEFINE_LOAD_MENU
,BEGIN
,   hilight_load_type;
,   define_std( std_load );
,END;
--------
"DELAY/"
"THRU"
[cmd_define_air_line
^SPECIFY_OFFSET_MENU
,BEGIN
,   hilight_offset_type;
,   define_std( std_thru );
,END;
--------
"ARBITRARY"
"IMPEDANCE"
[cmd_define_z
^SPECIFY_Z_MENU
,BEGIN
,   hilight_load_type;
,   define_std( std_z );
,END;
--------

--------

--------

--------
```

```
*EJECT*******
.DEFINE_OPEN_MENU
--------
" C"+176+" "
[cmd_open_c0
,select_active_function( active_open_c0 );
--------
" C"+177+" "
[cmd_open_c1
,select_active_function( active_open_c1 );
--------
" C"+178+" "
[cmd_open_c2
,select_active_function( active_open_c2 );
--------

--------

--------
"SPECIFY"
"OFFSET"
[cmd_specify_offset
^SPECIFY_OFFSET_MENU
,hilight_offset_type;
--------
"LABEL STD"
[cmd_label_cal_std
,warn( command_not_implemented );
--------
"DONE"
"(DEFINED)"
[cmd_cal_std_defined
,pop_menu( MODIFY_CAL_KIT_MENU );
--------
```

```
*EJECT*******
.DEFINE_SHORT_MENU
--------

--------

--------

--------

--------

--------
"SPECIFY"
"OFFSET"
]cmd_specify_offset
^SPECIFY_OFFSET_MENU
--------
"LABEL STD"
]cmd_label_cal_std
--------
"DONE"
"(DEFINED)"
]cmd_cal_std_defined
--------
```

```
*EJECT*******
.DEFINE_LOAD_MENU
--------

--------

--------

--------
sk_bracket_2
half_vt+"FIXED"
[cmd_fixed_load
,define_type2( fixed );
--------
"SLIDING"
[cmd_sliding_load
,define_type2( sliding );
--------
"SPECIFY"
"OFFSET"
]cmd_specify_offset
^SPECIFY_OFFSET_MENU
--------
"LABEL STD"
]cmd_label_cal_std
--------
"DONE"
"(DEFINED)"
]cmd_cal_std_defined
--------
```

```
*EJECT*******
.SPECIFY_Z_MENU
--------
" C"+176+" "
]cmd_open_c0
--------
" C"+177+" "
]cmd_open_c1
--------
" C"+178+" "
]cmd_open_c2
--------
sk_bracket_2
half_vt+"FIXED"
]cmd_fixed_load
--------
"SLIDING"
]cmd_sliding_load
--------
"SPECIFY"
"OFFSET"
]cmd_specify_offset
^SPECIFY_OFFSET_MENU
--------
"LABEL STD"
]cmd_label_cal_std
--------
"DONE"
"(DEFINED)"
]cmd_cal_std_defined
--------
```

```
*EJECT*******
.SPECIFY_OFFSET_MENU
--------
"OFFSET"
"DELAY"
[cmd_offset_delay
,select_active_function( active_offset_delay );
--------
"OFFSET"
"LOSS"
[cmd_offset_loss
,select_active_function( active_offset_loss );
--------
"OFFSET"
" Z"+176+" "
[cmd_offset_z0
,select_active_function( active_offset_z0 );
--------
"LOWER"
"FREQUENCY"
[cmd_offset_min_f
,select_active_function( active_offset_min_freq );
--------
"UPPER"
"FREQUENCY"
[cmd_offset_max_f
,select_active_function( active_offset_max_freq );
--------
sk_bracket_2
half_vt+"COAX"
[cmd_coax
,define_type2( coax );
--------
"WAVEGUIDE"
[cmd_waveguide
,define_type2( waveguide );
--------
"DONE"
"(DEFINED)"
,previous_menu;
--------
```

```
*EJECT*******
.SPECIFY_CLASS_MENU
--------
"S"+177+177+": "
"1st STD"
[cmd_port1_1st_std
,std_class( port1_1st_std );
--------
"2nd STD"
[cmd_port1_2nd_std
,std_class( port1_2nd_std );
--------
"3rd STD"
[cmd_port1_3rd_std
,std_class( port1_3rd_std );
--------
"S"+178+178+": "
"1st STD"
[cmd_port2_1st_std
,std_class( port2_1st_std );
--------
"2nd STD"
[cmd_port2_2nd_std
,std_class( port2_2nd_std );
--------
"3rd STD"
[cmd_port2_3rd_std
,std_class( port2_3rd_std );
--------
"MORE"
^SPECIFY_CLASS_MENU2
--------
"DONE"
"(SPEC'D)"
[cmd_std_class_specified
,pop_menu(MODIFY_CAL_KIT_MENU);
--------
```

```
*EJECT*******
.SPECIFY_CLASS_MENU2
--------
"TRANS.:"
"FWD STD"
[cmd_trans_fwd_std
,std_class( trans_fwd_std );
--------
"REV STD"
[cmd_trans_rev_std
,std_class( trans_rev_std );
--------

--------
"FREQUENCY"
"RESP. STD"
[cmd_freq_resp_std
,std_class( freq_resp_std );
--------

--------

--------

--------
"DONE"
"(SPEC'D)"
]cmd_std_class_specified
--------

&disp.work.1
```

SKINFO.WORK.PD8510 THU, DEC 22, 1983, 10:41 AM PAGE 60

```
*EJECT*******
.DISPLAY_MENU
--------
"SINGLE "+sk_bracket_2
"CHANNEL"
[cmd_single_ch
,select_trace_mode( single_ch );
--------
"DUAL   "
"CHANNEL"
[cmd_dual_ch
^DUAL_CH_MENU
--------
sk_bracket_4
half_vt+"DATA"
[cmd_data
,set_trace_type( trace_data );
--------
"MEMORY"
[cmd_mem
,set_trace_type( trace_mem );
--------
"DATA "+38
"MEMORY"
[cmd_d_and_m
,set_trace_type( trace_data_and_mem );
--------
"MATH"
"(...)"
[cmd_math
,set_trace_type( entry_ch_integer(ch_math_op) );
--------
"SELECT"
"DEFAULTS"
^DISPLAY_DEFAULT_MENU
--------
"DATA "+169
"MEMORY"
[cmd_d_into_m
,set_trace_type( trace_data_into_mem );
--------
```

SKINFO.WORK.PD8510 THU, DEC 22, 1983, 10:41 AM PAGE 61

```
*EJECT*******
.DUAL_CH_MENU
--------
"2 CHANNEL"+sk_bracket_2
"OVERLAY"
[cmd_overlay
,select_trace_mode( overlay );
--------
"2 CHANNEL"
"SPLIT"
[cmd_split
,select_trace_mode( split );
--------

--------

--------

--------

--------

--------

--------
```

SKINFO.WORK.PD8510 THU, DEC 22, 1983, 10:41 AM PAGE 62

```
*EJECT*******
.DISPLAY_DEFAULT_MENU
--------
"MEMORY"+sk_bracket_5
" 1 "
[cmd_memory1
,select_memory( mem1 );
--------
" 2 "
[cmd_memory2
,select_memory( mem2 );
--------
" 3 "
[cmd_memory3
,select_memory( mem3 );
--------
" 4 "
[cmd_memory4
,select_memory( mem4 );
--------
"MORE"
^MEMORY_MENU
--------

--------
"MATH"
"OPERATIONS"
^MATH_MENU
--------

--------
```

SKINFO.WORK.PD8510 THU, DEC 22, 1983, 10:41 AM PAGE 63

```
*EJECT*******
.MEMORY_MENU
--------

--------

--------

--------

--------
"DATA from"+sk_bracket_2
"CHANNEL 1"
[cmd_memory_ch1
,select_memory( data1 );
--------
"DATA from"
"CHANNEL 2"
[cmd_memory_ch2
,select_memory( data2 );
--------

--------

--------
```

SKINFO.WORK.PD8510 THU, DEC 22, 1983, 10:41 AM PAGE 64

```
*EJECT*******
.MATH_MENU
--------

--------

--------

--------
"DATA"+sk_bracket_4
"+ MEMORY"
[cmd_d_plus_m
,select_math_op( trace_data_plus_mem );
--------
"DATA"
"- MEMORY"
[cmd_d_minus_m
,select_math_op( trace_data_minus_mem );
--------
"DATA"
mpy_char+" MEMORY"
[cmd_d_mpy_m
,select_math_op( trace_data_times_mem );
--------
"DATA"
"/ MEMORY"
[cmd_d_div_m
,select_math_op( trace_data_div_mem );
--------

--------

2plot.work.L
```

SKINFO.WORK.PD8510 THU, DEC 22, 1983, 10:41 AM PAGE 65

```
*EJECT*******
.COPY_MENU
--------
"PLOT"+sk_bracket_5
"ALL"
[cmd_plot_all
,select_plot_buffer (all);
--------
"TRACE"
[cmd_plot_trace
,select_plot_buffer (trace);
--------
"GRATICULE"
[cmd_plot_graticule
,select_plot_buffer (grid);
--------
"MARKER(S)"
[cmd_plot_marker
,select_plot_buffer (markers);
--------
"TEXT"
[cmd_plot_text
,select_plot_buffer (annotations);
--------
"SELECT"
"QUADRANT"
^PLOT_SETUP_MENU
--------
"SELECT"
"PEN COLOR"
[cmd_ch1_pen
^PEN_MENU
--------
"MORE"
^PLOTPARM_MENU
--------
```

SKINFO.WORK.PD8510 THU, DEC 22, 1983, 10:41 AM PAGE 66

```
*EJECT*******
.PLOTPARM_MENU
--------
"LIST TRACE"
"VALUES"
[cmd_list_trace
,IF printer_connected THEN
,  BEGIN
,    abort_sweep;
,    list_trace_values;
,    restart_sweep;
,  END;
--------

--------

--------

--------

--------

--------
"SYSTEM"+sk_bracket_2
"PARAMETERS"
^COPY2_MENU
[cmd_system_params
,select_plot_param (sys_params);
--------
"OPERATING"
"PARAMETERS"
^COPY2_MENU
[cmd_op_params
,select_plot_param (op_params);
--------
```

SKINFO.WORK.PD8510 THU, DEC 22, 1983, 10:41 AM PAGE 67

```
*EJECT*******
.PLOT_SETUP_MENU
--------

--------
"X -   LEFT"+sk_bracket_5
"- -  UPPER"
[cmd_quadrant_11
,select_plot_quadrant (upper_left);
--------
"- -   LEFT"
"X -  LOWER"
[cmd_quadrant_21
,select_plot_quadrant (lower_left);
--------
"- X  RIGHT"
"- -  UPPER"
[cmd_quadrant_12
,select_plot_quadrant (upper_right);
--------
"- -  RIGHT"
"- X  LOWER"
[cmd_quadrant_22
,select_plot_quadrant (lower_right);
--------
"X X   FULL"
"X X   PAGE"
[cmd_quadrant_full
,select_plot_quadrant (full_page);
--------

--------

--------
```

```
*EJECT*******
.PEN_MENU
--------
"PEN"+sk_bracket_8
" 1 "
[cmd_pen1
,select_pen(1);
--------
" 2 "
[cmd_pen2
,select_pen (2);
--------
" 3 "
[cmd_pen3
,select_pen (3);
--------
" 4 "
[cmd_pen4
,select_pen (4);
--------
" 5 "
[cmd_pen5
,select_pen (5);
--------
" 6 "
[cmd_pen6
,select_pen (6);
--------
" 7 "
[cmd_pen7
,select_pen (7);
--------
" 8 "
[cmd_pen8
,select_pen (8);
--------
```

```
*EJECT*******
.COPY2_MENU
--------
"RESTORE"
"DISPLAY"
]cmd_directory_off
--------
sk_bracket_2
half_vt+"PRINT"
[cmd_print_params
,IF printer_connected THEN
,  output_parameters;
--------
"PLOT"
[cmd_plot_params
,dump_to_plotter;
--------

--------

--------

--------

--------
"NEXT PAGE"
[cmd_next_op_param
,next_op_param;
--------

9mkr.work.L
```

```
*EJECT*******
.MARKER_MENU
--------
"MARKER"+sk_bracket_6
"       1 "
[cmd_marker_1
,select_marker(1);
--------
"       2 "
[cmd_marker_2
,select_marker(2);
--------
"       3 "
[cmd_marker_3
,select_marker(3);
--------
"       4 "
[cmd_marker_4
,select_marker(4);
--------
"       5 "
[cmd_marker_5
,select_marker(5);
--------
"ALL"
"OFF"
[cmd_marker_off
,select_marker(0);
--------
delta_char+" MODE"
"MENU"
^DELTA_MARKER_MENU
[cmd_delta_marker
--------
"MORE"
^MARKER2_MENU
]cmd_more
--------
```

```
*EJECT*******
.DELTA_MARKER_MENU
--------
sk_bracket_6
half_vt+delta_char+" REF = 1"
[cmd_ref_mkr1
,select_ref_marker( 1 );
--------
delta_char+" REF = 2"
[cmd_ref_mkr2
,select_ref_marker( 2 );
--------
delta_char+" REF = 3"
[cmd_ref_mkr3
,select_ref_marker( 3 );
--------
delta_char+" REF = 4"
[cmd_ref_mkr4
,select_ref_marker( 4 );
--------
delta_char+" REF = 5"
[cmd_ref_mkr5
,select_ref_marker( 5 );
--------
delta_char+" MODE"
"OFF"
[cmd_no_ref_mkr
,select_ref_marker( 0 );
--------

--------

--------
```

```
*EJECT*******
.MARKER2_MENU
--------

--------

--------

--------

--------

--------

--------
"MARKER to"+sk_bracket_2
"MINIMUM"
[cmd_mkr_to_min
,marker_to( mkr_to_min );
--------
"MAXIMUM"
[cmd_mkr_to_max
,marker_to( mkr_to_max );
--------

@system.work.L
```

```
*EJECT*******
.SYSTEM_MENU
--------
"TITLE"
[cmd_title
^TITLE_MENU
,select_active_function( active_title );
--------
"HP-IB"
"ADDRESSES"
[cmd_hpib_info
^HPIB_MENU
--------
"CRT"
"OFF"
[cmd_crt_off
,warn(command_not_implemented);
--------

--------

--------

--------

--------
"SERVICE"
"FUNCTIONS"
[cmd_service_menu
^SERVICE_MENU
--------
```

```
*EJECT*******
.TITLE_MENU
--------
"SELECT"
"LETTER"
,enter_title_char( char_index );
--------

--------
"SPACE"
,enter_title_char( space_index );
--------
"BACKSPACE"
,enter_title_char( backspace_index );
--------

--------
"ERASE"
"TITLE"
[cmd_erase_title
,erase_title;
--------

--------
"DONE"
[cmd_title_done
,BEGIN
,   select_active_off( active_title );
,   previous_menu;
,END;
--------
```

```
*EJECT*******
.HPIB_MENU
--------
"8510 HP-IB"+sk_bracket_8
"ADDRESS"
[cmd_8510_addr
,select_active_function( active_8510_hpib_addr );
--------
"SYSTEM BUS"
[cmd_system_bus_addr
,select_active_function( active_system_bus_hpib_addr );
--------
"SOURCE"
[cmd_source_addr
,select_active_function( active_source_hpib_addr );
--------
"TEST SET"
[cmd_test_set_addr
,select_active_function( active_testset_hpib_addr );
--------
"PLOTTER"
[cmd_plotter_addr
,select_active_function( active_plotter_hpib_addr );
--------
"PRINTER"
[cmd_printer_addr
,select_active_function( active_printer_hpib_addr );
--------
"AUTO CMD"
[cmd_auto_cmd_addr
,select_active_function( active_ch_cmd_hpib_addr );
--------
"PASS THRU"
[cmd_pass_thru_addr
,select_active_function( active_pass_thru_hpib_addr );
--------
```

```
SKINFO.WORK.PD8510            THU, DEC 22, 1983, 10:41 AM     PAGE  76

*EJECT*******
.SERVICE_MENU
--------
"SOFTWARE"
"REVISION"
[cmd_revision
,select_active_function( active_revision );
--------
"SYSTEM BUS"+sk_bracket_2
"'LOCAL'"
[cmd_privib_local
,BEGIN
,   hilight_on( cmd_privib_local, cmd_privib_remote );
,   abort_sweep;
,   clr_ren_priv_ib;
,   wrt_priv_ib_source(  display_on, " " );
,END;
--------
"'REMOTE'"
[cmd_privib_remote
,BEGIN
,   hilight_on( cmd_privib_local, cmd_privib_remote );
,   abort_sweep;
,COMMENT
,   set_ren_priv_ib;
,COMMENT
,   wrt_priv_ib_source(  display_off, " " );
,   reset_priv_ib_act_funs;
,   restart_sweep;
,END;
--------
"IF GAIN"
^IF_GAIN_MENU
[cmd_if_gain_menu
--------
sk_bracket_3
half_vt+"LOCATION"
[cmd_peek_poke_addr
,select_active_function( active_address );
--------
"PEEK"
[cmd_peek
,select_active_function( active_peek );
--------
"POKE"
[cmd_poke
,select_active_function( active_poke );
--------
"TEST MENU"
[cmd_test_menu
,BEGIN
,   trap_15_type := service_trap;
,   TRAP(15);
,END;
--------
```

```
SKINFO.WORK.PD8510            THU, DEC 22, 1983, 10:41 AM     PAGE  77

#

Ocmdcase.work.L

[cmd_illegal
,warn(invalid_command);
;
; The following commands MUST be contiguous!
; Do NOT insert commands in between (for the parser's sake)
;
[cmd_enter
,keypad_entry(e0);
[cmd_u1
,keypad_entry(e0);
[cmd_u2
,keypad_entry(e3);
[cmd_u3
,keypad_entry(e6);
[cmd_u4
,keypad_entry(e9);
;
; END of contiguous command entries
;
[cmd_mkrval
,marker_value_entry;
[cmd_up
,step_entry(step_up);
[cmd_down
,step_entry(step_down);
[cmd_entry_off
,select_active_function(active_off);
[cmd_save
,gen_save_menu(5);
[cmd_save_1
,save( 1 );
[cmd_save_2
,save( 2 );
[cmd_save_3
,save( 3 );
[cmd_save_4
,save( 4 );
[cmd_save_5
,save( 5 );
[cmd_recall
,gen_save_menu(6);
[cmd_recall_1
,recall( 1 );
[cmd_recall_2
,recall( 2 );
[cmd_recall_3
,recall( 3 );
[cmd_recall_4
,recall( 4 );
[cmd_recall_5
,recall( 5 );
[cmd_recall_last
```

```
SKINFO.WORK.PD8510            THU, DEC 22, 1983, 10:41 AM     PAGE  78

,recall( 8 );
[cmd_tape_menu
,gen_menu(TAPE_MENU, 0);
[cmd_copy
,gen_menu(COPY_MENU, 0);
[cmd_doc
,warn(command_not_implemented);
[cmd_quote
,select_active_function(active_off);
[cmd_label
,select_active_function(active_off);
[cmd_key_1
,process_softkey(1);
[cmd_key_2
,process_softkey(2);
[cmd_key_3
,process_softkey(3);
[cmd_key_4
,process_softkey(4);
[cmd_key_5
,process_softkey(5);
[cmd_key_6
,process_softkey(6);
[cmd_key_7
,process_softkey(7);
[cmd_key_8
,process_softkey(8);
[cmd_ch1
,select_entry_ch(1);
[cmd_s11
,BEGIN & s11 &
,    hilight_off( cmd_user1, cmd_user4);
,    new_parameter(s11);
,END;  & s11 &
[cmd_s12
,BEGIN & s12 &
,    hilight_off( cmd_user1, cmd_user4);
,    new_parameter(s12);
,END;  & s12 &
[cmd_s21
,BEGIN & s21 &
,    hilight_off( cmd_user1, cmd_user4);
,    new_parameter(s21);
,END;  & s21 &
[cmd_s22
,BEGIN & s22 &
,    hilight_off( cmd_user1, cmd_user4);
,    new_parameter(s22);
,END;  & s22 &
[cmd_mag
,new_format( fmt_log_mag );
[cmd_phase
,new_format( fmt_phase );
[cmd_ch2
,select_entry_ch(2);
[cmd_delay
```

```
SKINFO.WORK.PD8510            THU, DEC 22, 1983, 10:41 AM     PAGE  79

,new_format( fmt_delay );
[cmd_polar
,new_format( fmt_z_smith );
[cmd_param_menu
,gen_menu(PARAM_MENU, 0);
[cmd_format_menu
,gen_menu(FORMAT_MENU, 0);
[cmd_preset
,recall_preset_state;
[cmd_local
,gen_menu(HPIB_MENU, 1);
[cmd_scale
,select_active_function(active_scale);
[cmd_ref_value
,select_active_function(active_ref_value);
[cmd_start
,select_active_stimulus(active_start);
[cmd_stop
,select_active_stimulus(active_stop);
[cmd_ref_position
,select_active_function(active_ref_pos);
[cmd_auto_scale
,auto_scale;
[cmd_center
,select_active_stimulus(active_center);
[cmd_span
,select_active_stimulus(active_span);
[cmd_response_menu
,gen_menu(RESPONSE_MENU, 0);
[cmd_stimulus_menu
,gen_menu(STIMULUS_MENU, 0);
[cmd_cal_menu
,gen_menu(CAL_MENU, 0);
[cmd_display_menu
,gen_menu(DISPLAY_MENU, 0);
[cmd_marker_menu
,BEGIN
,    select_marker( active_marker );
,    gen_menu(MARKER_MENU, 0);
,END;
[cmd_system_menu
,gen_menu(SYSTEM_MENU, 0);
[cmd_prior_menu
,previous_menu;
[cmd_measurement_restart
,measurement_restart;
[cmd_domain_menu
,gen_menu(DOMAIN_MENU, 0);
[cmd_abort_command
,abort_command := TRUE;
[cmd_input_data
,pub_ib_input_select( data_input );
[cmd_input_formatted
,pub_ib_input_select( formatted_input );
[cmd_input_raw1
,pub_ib_input_select( raw1_input );
```

```
[cmd_input_raw2
,pub_ib_input_select( raw2_input );
[cmd_input_raw3
,pub_ib_input_select( raw3_input );
[cmd_input_raw4
,pub_ib_input_select( raw4_input );
[cmd_input_cal_coeff1
,pub_ib_input_select( cal_coeff1_input );
[cmd_input_cal_coeff2
,pub_ib_input_select( cal_coeff2_input );
[cmd_input_cal_coeff3
,pub_ib_input_select( cal_coeff3_input );
[cmd_input_cal_coeff4
,pub_ib_input_select( cal_coeff4_input );
[cmd_input_cal_coeff5
,pub_ib_input_select( cal_coeff5_input );
[cmd_input_cal_coeff6
,pub_ib_input_select( cal_coeff6_input );
[cmd_input_cal_coeff7
,pub_ib_input_select( cal_coeff7_input );
[cmd_input_cal_coeff8
,pub_ib_input_select( cal_coeff8_input );
[cmd_input_cal_coeff9
,pub_ib_input_select( cal_coeff9_input );
[cmd_input_cal_coeff10
,pub_ib_input_select( cal_coeff10_input );
[cmd_input_cal_coeff11
,pub_ib_input_select( cal_coeff11_input );
[cmd_input_cal_coeff12
,pub_ib_input_select( cal_coeff12_input );
[cmd_block_a
,pub_ib_input;
[cmd_output_formatted
,pub_ib_output_select( formatted_output );
[cmd_output_active
,pub_ib_output_select( active_output );
[cmd_output_marker
,pub_ib_output_select( marker_output );
[cmd_output_status
,pub_ib_output_select( status_output );
[cmd_output_id
,pub_ib_output_select( id_output );
[cmd_output_data
,pub_ib_output_select( data_output );
[cmd_output_raw1
,pub_ib_output_select( raw1_output );
[cmd_output_raw2
,pub_ib_output_select( raw2_output );
[cmd_output_raw3
,pub_ib_output_select( raw3_output );
[cmd_output_raw4
,pub_ib_output_select( raw4_output );
[cmd_output_cal_coeff1
,pub_ib_output_select( cal_coeff1_output );
[cmd_output_cal_coeff2
,pub_ib_output_select( cal_coeff2_output );
```

```
[cmd_output_cal_coeff3
,pub_ib_output_select( cal_coeff3_output );
[cmd_output_cal_coeff4
,pub_ib_output_select( cal_coeff4_output );
[cmd_output_cal_coeff5
,pub_ib_output_select( cal_coeff5_output );
[cmd_output_cal_coeff6
,pub_ib_output_select( cal_coeff6_output );
[cmd_output_cal_coeff7
,pub_ib_output_select( cal_coeff7_output );
[cmd_output_cal_coeff8
,pub_ib_output_select( cal_coeff8_output );
[cmd_output_cal_coeff9
,pub_ib_output_select( cal_coeff9_output );
[cmd_output_cal_coeff10
,pub_ib_output_select( cal_coeff10_output );
[cmd_output_cal_coeff11
,pub_ib_output_select( cal_coeff11_output );
[cmd_output_cal_coeff12
,pub_ib_output_select( cal_coeff12_output );
[cmd_output_memory
,pub_ib_output_select( memory_output );
[cmd_output_error
,pub_ib_output_select( error_output );
[cmd_hpib_talk
,pub_ib_output;
[cmd_srq_mask
,select_active_function( active_srq_mask_primary );
[cmd_clear_status
,clear_serial_poll;
[cmd_xfer_binary
,pub_ib_format_select( output_binary);
[cmd_xfer_ascii
,pub_ib_format_select( output_ascii);
[cmd_xfer_ieee2
,pub_ib_format_select( output_ieee_double);
[cmd_xfer_ieee1
,pub_ib_format_select( output_ieee_single);
[cmd_keycode
,select_active_function( active_keycode );
[cmd_output_plot
,pub_ib_output_select(plot_output);
[cmd_monitor
,BEGIN
,   trap_15_type := normal_trap_15;
,   TRAP(15);
,END;
[cmd_n_groups_hpib
,select_active_function(active_n_groups_hpib);
[cmd_output_key
,pub_ib_output_select( key_output );
[cmd_cal_set_1
,select_default_set( 1 );
[cmd_cal_set_2
,select_default_set( 2 );
[cmd_cal_set_3
```

```
,select_default_set( 3 );
[cmd_cal_set_4
,select_default_set( 4 );
[cmd_cal_set_5
,select_default_set( 5 );
[cmd_cal_set_6
,select_default_set( 6 );
[cmd_cal_set_7
,select_default_set( 7 );
[cmd_cal_set_8
,select_default_set( 8 );
```

```
COMMENT
  Configures bit pairs to correspond to softkeys that are used.
  SKnm = softkey position n contains m lines.
  BSKn = softkey position n that brings up another menu
  n    = 1..8
  m    = 0..2
;
INTEGER CONSTANT

  SK11 := 1,
  SK12 := 2,
  SK13 := 3,
  SK21 := 4,
  SK22 := 8,
  SK23 := %C,
  SK31 := %10,
  SK32 := %20,
  SK33 := %30,
  SK41 := %40,
  SK42 := %80,
  SK43 := %C0,
  SK51 := %100,
  SK52 := %200,
  SK53 := %300,
  SK61 := %400,
  SK62 := %800,
  SK63 := %C00,
  SK71 := %1000,
  SK72 := %2000,
  SK73 := %3000,
  SK81 := %4000,
  SK82 := %8000,
  SK83 := %C000,

  BSK1 := %100,
  BSK2 := %200,
  BSK3 := %400,
  BSK4 := %800,
  BSK5 := %1000,
  BSK6 := %2000,
  BSK7 := %4000,
  BSK8 := %8000;

COMMENT
      The rest of this file is software generated by GENSK.LANI,
      Any changes must be made to the input file, SKINFO.WORK.
      ***********************************************************
      The following are softkey menu tables configured as follows:
        word 1 = MSByte: corresponding keys that bring up new menus
                 LSByte: menu's highlight bitmap
        word 2 = menu configuration using constants SKnm
        word 3 = keycode number corresponding to softkeys used
          etc.
        word N = up to 10 keycode values
```

```
SKINFO2.WORK.PD8510          THU, DEC 22, 1983, 10:41 AM      PAGE  2

;
$ END OF DIRECT COPY OF FILE
;          DOCUMENTATION FOR FRONT PANEL/COMMAND INPUT FILE
;
; "$"  Everything before is copied as is into the output file.
;      Anything desired in the output file without being processed
;      by the "BIG TABLE GENERERATOR" (GENSK) must occur before the "$"
;      provided that it does not reference anything generated after
;      the "$".
;
; ";"  Just for comments.  Will be ignored on input and not copied to
;      any of the output files.
;
; "*"  Starts/seperates softkey menus.  Must occur after "$" and before
;      "#" in the input file.  An error message will be displayed
;      otherwise. Formatted softkey/command information tables are out-
;      put to #FILE FSKEY.
;
; "."  Indicates and prefixes a softkey menu constant name that will be
;      put in #FILE FMENU.WORK which contains these constants and their
;      values.  The values are ordered sequentially as softkey menus are
;      read in and processed.  Must occur immediately after menu
;      menu indicator (.) otherwise an error/warning message will be
;      displayed and the constant identifier MENUn will be used.
;      (n = computed constant value)
;
; "-"  Starts/seperates individual softkeys and/or softkey positions.
;      Must occur between menu indicators (*).  Only up to 8 softkey
;      entries will be recognized (everything else afterwards until the
;      next menu indicator (*) will be ignored).  Empty or unused
;      softkey positions which occur between occupied softkeys or keys
;      which create unused positions at the top of the menu must have a
;      blank entry between softkey seperators (-).  However, it is not
;      necessary to do this for unused softkeys which create contiguous
;      gaps at the bottom of the menu.
;
;      SOFTKEY ANNOTATION FORMAT:
;        <l1> :: "alpha" | byte | "alpha"+<l1> | byte+<l1>
;        <l2> :: same as above
;      where <l1> = 1st line of softkey
;            <l2> = 2nd line of softkey
;      Input lines are direct copies to output file.
;      There is no error checking for the following restrictions:
;        - ALPHA types must be enclosed in algol deliniters (")
;        - Start in column 1, no blanks between ALPHA/BYTE combinations
;          (i.e.  "line 1" + 122  should be  "line 1"+122).
;        - Each line should not exceed 10 characters/bytes.
;
;      BRACKET CHARACTERS:
;      sk_bracket_n (n=2..7) is a byte constant that will generate a
;      character bracketing off n softkey annotations from the first
;      line of a softkey entry position.  It should be the last
;      character of the first line of a softkey position heading off
;      a bracketed group of softkeys.  If the softkey annotation
```

```
SKINFO2.WORK.PD8510          THU, DEC 22, 1983, 10:41 AM      PAGE  3

;      heading off the bracketed group consists of a single line, then
;      a two line entry should be created.  See the following examples:
;      e.g.  two-line annotation:              one-line annotation:
;          "LINE ONE"+sk_bracket_4             sk_bracket_4
;          "LINE TWO"                          half_vt+"LINE ONE"
;
;      NOTE:  Softkey annotations should be the FIRST piece of info.
;      within softkey entries !!!
;
; "["  Prefixes and indicates a command token constant for a softkey
;      entry or front panel/HP-IB command code.  An error message
;      will be displayed if more than one command value indicator occurs
;      in a single softkey entry.  Constant values are determined
;      sequentially and correspond to the occurrence of each softkey
;      entry (whether or not it has a command value indicator).
;      These constants and their and values can be found in
;      #FILEs corresponding to the most recent filename read via
;      "0".."9","A"..0" prefixes.
;
; "]"  Indicates and prefixes duplicate command token constants which
;      have been previously declared to correspond to an identical
;      function AND refer to the same annotation (for softkeys).
;      This eliminates more than one command code per identical
;      function.  In this case, case statement entries (',') should be
;      omitted since they are taken care of by the previously declared
;      command code.
;      NOTE:  Must occur within softkey entries ('-') or after '#'.
;      Any case statement entries (',') following it will be ignored.
;      Any case statement entries before it will cause this entry to
;      be unrecognized (only within softkey entry information).
;
; ","  Indicate and prefix Algol statements to be executed corresponding
;      to the current command token (softkey entry/HP-IB printive) being
;      processed.  They may occur only within softkey entries or after
;      command token constants.  They should not proceed ']' prefixes.
;      NOTE:  Syntax errors will not be checked.
;
; "^"  Indicates that a softkey brings up another menu.  "^" is followed
;      by the menu number (immediate or constant) of the menu that
;      softkey is to generate.  Only one "^" per softkey entry allowed.
;
; "A".."0" and
; "0".."9"
;      Marks the start of a group of case statements enclosed in a
;      PROCn procedure (n = 0..25, (A=10,B=11..0=25)) and its
;      corresponding command token constants.  A filename MUST proceed
;      each character entry (which can only be used ONCE):
;           <char><filename>
;      There will be two seperate files produced using the given file
;      name: 1) C<filename>  for command token constants
;            2) F<filename>  for corresponding case statements
;      All command token constants (indicated by '[') and corresponding
;      segments of code (indicated by ',') will be read into these
;      files.
;      These character prefixes may occur after the '$', before or after
;      menu entries, at the beginning or end of softkey entries, or
```

```
SKINFO2.WORK.PD8510          THU, DEC 22, 1983, 10:41 AM      PAGE  4

;      before command token entries '[' occuring after '#'.
;
;      NOTE:  The module which includes F<filename> must also include
;      #FILE FCOMMAND.WORK or an external declaration of the integer
;      variable command_token.
;
; "#"  Indicates the end of menu entries and ignores any entries found
;      after the occurrence of "#".  Only command value indicators, ([)
;      or (]), immediately followed by statement indicators (,) are
;      processed.  This segment of the input file is for HPIB primitives
;      which do not have corresponding softkeys, and for front panel
;      keys which need command values in order to be processed.
;      Error messages are displayed for any input other than that just
;      described.
;
; "@"  Indicates that a command token entry is a software option.
;      It should be followed by a number 0..9  which identifies the
;      which software option that particular command is under (i.e.
;      time domain commands = 1, error correction commands = 2, etc.).
;      The INFO parameter (string) passed upon running GENSK contains
;      a string of software option numbers (0..9).  Each digit will
;      correspond to a software option family that will generate the
;      Algol statements (via ",") for a command token entry.  These
;      program statements are omitted, otherwise.
;      Command token entries without the "@" directive are not options
;      and will not omit program statements in their entries.

1dtmgr.work.L
```

```
SKINFO2.WORK.PD8510          THU, DEC 22, 1983, 10:41 AM      PAGE  5

*EJECT**********
.TAPE_MENU
--------
"DIRECTORY"
[cmd_directory
,IF valid_directory THEN
,  BEGIN
,    gen_menu(DIRECTORY_MENU, 1);
,    list_directory;
,  END;
--------
"RECORD"
,setup_tape_op(record_op);
--------
"RESTORE"
,setup_tape_op(restore_op);
--------
"DELETE"
,setup_tape_op(delete_op);
--------
"UN-DELETE"
,undelete_file;
--------

--------

--------
"INITIALIZE"
"TAPE"
^INIT_TAPE_MENU
--------
```

```
SKINF02.WORK.PD8510          THU, DEC 22, 1983, 10:41 AM     PAGE   6

*EJECT**********
.INIT_TAPE_MENU
--------
"INIT TAPE?"
"YES"
,init;
--------
"NO"
,previous_menu;
--------
```

```
SKINF02.WORK.PD8510          THU, DEC 22, 1983, 10:41 AM     PAGE   7

*EJECT**********
.DIRECTORY_MENU
--------
"RESTORE"
"DISPLAY"
[cmd_directory_off
--------

--------

--------
"NEXT"
"PAGE"
[cmd_next_page
,list_directory;
--------
"PREVIOUS"
"PAGE"
[cmd_prev_page
,list_directory;
--------

--------
"FIRST"
"PAGE"
[cmd_first_page
,list_directory;
--------
"LAST"
"PAGE"
[cmd_last_page
,list_directory;
--------
```

```
SKINF02.WORK.PD8510          THU, DEC 22, 1983, 10:41 AM     PAGE   8

*EJECT**********
.DATA2_MENU
--------
"DATA"
,gen_file_menu(data_file);
--------
"FORMATTED"
"DATA"
,gen_file_menu(format_file);
--------
"RAW"
"DATA"
,gen_file_menu(s_param_file);
--------

--------
"USER"
"DISPLAY"
,gen_file_menu (display_file);
--------

--------

--------
"MACHINE"
"DUMP"
[cmd_machine_dump
,gen_file_menu(machine_file);
--------
```

```
SKINF02.WORK.PD8510          THU, DEC 22, 1983, 10:41 AM     PAGE   9

*EJECT**********
.DATA1_MENU
--------
"INSTRUMENT"
"STATE"
,gen_reg_menu(state_file);
--------
"INSTRUMENT"
"STATES 1-5"
,gen_file_menu(state_set);
--------
"MEMORY"
"TRACE"
,gen_reg_menu(memory_file);
--------
"MEMORY"
"TRACES 1-4"
,gen_file_menu(memory_set);
--------
"CAL SET"
,gen_reg_menu(cal_file);
--------
"CAL SETS"
"1-8"
,gen_file_menu(cal_set);
--------
"CAL KIT"
,gen_reg_menu(cal_std_file);
--------
"MORE"
[cmd_more
,& dummy statement &;
^DATA2_MENU
--------
```

SKINF02.WORK.PD8510 THU, DEC 22, 1983, 10:41 AM PAGE 10

```
*EJECT***********
.FILE_MENU
--------
"DATA TYPE "
"* FILE 1"
[cmd_file_1
,file_chosen;
--------
" "
"* FILE 2"
[cmd_file_2
,file_chosen;
--------
" "
"* FILE 3"
,file_chosen;
--------
" "
"* FILE 4"
,file_chosen;
--------
" "
"* FILE 5"
,file_chosen;
--------
" "
"* FILE 6"
,file_chosen;
--------
" "
"* FILE 7"
,file_chosen;
--------
" "
"* FILE 8"
[cmd_file8
,file_chosen;
--------
```

SKINF02.WORK.PD8510 THU, DEC 22, 1983, 10:41 AM PAGE 11

```
*EJECT***********
.REG_MENU
--------
"DATA TYPE "
"* 1 "
[cmd_reg_1
,reg_chosen;
--------
" "
"* 2 "
[cmd_reg_2
,reg_chosen;
--------
" "
"* 3 "
[cmd_reg_3
,reg_chosen;
--------
" "
"* 4 "
[cmd_reg_4
,reg_chosen;
--------
"(POWER UP)"
"* 5 "
[cmd_reg_5
,reg_chosen;
--------
" "
"* 6 "
[cmd_reg_6
,reg_chosen;
--------
" "
"* 7 "
[cmd_reg_7
,reg_chosen;
--------
" "
"LAST STATE"
[cmd_reg_8
,reg_chosen;
--------

3resp.work.L
```

SKINF02.WORK.PD8510 THU, DEC 22, 1983, 10:41 AM PAGE 12

```
*EJECT******
.RESPONSE_MENU
--------
"ELECTRICAL"+sk_bracket_2
"DELAY"
[cmd_elect_delay
,select_active_function( active_electrical_length );
--------
"AUTO DELAY"
[cmd_auto_delay
,warn( command_not_implemented );
--------
"PHASE"
"OFFSET"
[cmd_phase_offset
,select_active_function( active_phase_offset );
--------
"MAGNITUDE"
"OFFSET"
,select_active_function( active_magnitude_offset );
--------
"AVERAGING"+sk_bracket_2
"ON/RESTART"
[cmd_if_avg_on
,if_average_on;
--------
"OFF"
[cmd_if_avg_off
,if_average_off;
--------
"SMOOTHING"+sk_bracket_2
"ON "
[cmd_smoothing_on
,display_smoothing_on;
--------
"OFF"
[cmd_smoothing_off
,display_smoothing_off;
--------
```

SKINF02.WORK.PD8510 THU, DEC 22, 1983, 10:41 AM PAGE 13

```
*EJECT*********
.IF_GAIN_MENU
--------

--------
"TEST"+sk_bracket_2
"AMP. GAIN"
[cmd_if_test_port
^IF_GAIN_MENU2
,new_if_gain_port( test_port );
--------
"REFERENCE"
"AMP. GAIN"
[cmd_if_ref_port
^IF_GAIN_MENU2
,new_if_gain_port( ref_port );
--------

--------

--------

--------

--------

--------
```

SKINF02.WORK.PD8510 THU, DEC 22, 1983, 10:41 AM PAGE 14

```
*EJECT*******
.IF_GAIN_MENU2
--------

--------
"GAIN"+sk_bracket_6
"0 (MIN.)"
[cmd_if_no_gain
,new_if_gain( if_no_gain );
--------
" 1 "
[cmd_if_12db_gain
,new_if_gain( if_12db_gain );
--------
" 2 "
[cmd_if_24db_gain
,new_if_gain( if_24db_gain );
--------
" 3 "
[cmd_if_36db_gain
,new_if_gain( if_36db_gain );
--------
"4 (MAX.)"
[cmd_if_48db_gain
,new_if_gain( if_48db_gain );
--------
"AUTO"
[cmd_if_gain_auto
,new_if_gain( auto_range );
--------

--------

4stin.work.L
```

SKINF02.WORK.PD8510 THU, DEC 22, 1983, 10:41 AM PAGE 15

```
*EJECT*******
.STIMULUS_MENU
--------
"NUMBER of"
"POINTS"
^N_POINTS_MENU
[cmd_n_points_menu
--------
"POWER"
"MENU"
[cmd_power_menu
^POWER_MENU
--------
"SWEEP"
"TIME"
[cmd_sweep_time
,select_active_function(active_sweep_time);
--------

--------
"SINGLE"+sk_bracket_3
"POINT"
[cmd_cw
,BEGIN
,  hilight_on( cmd_cw, cmd_stepped);
,  cw_mode;
,END;
--------
"RAMP"
[cmd_swept
,BEGIN
,  hilight_on( cmd_cw, cmd_stepped);
,  swept_mode;
,END;
--------
"STEP"
[cmd_stepped
,BEGIN
,  hilight_on( cmd_cw, cmd_stepped);
,  stepped_mode;
,END;
--------
"MORE"
^STIMULUS2_MENU
]cmd_more
--------
```

SKINF02.WORK.PD8510 THU, DEC 22, 1983, 10:42 AM PAGE 16

```
*EJECT********
.N_POINTS_MENU
--------

--------
"POINTS:"+sk_bracket_4
"51 "
[cmd_51_points
,new_step_size( 16 );
--------
"101"
[cmd_101_points
,new_step_size( 8 );
--------
"201"
[cmd_201_points
,new_step_size( 4 );
--------
"401"
[cmd_401_points
,new_step_size( 2 );
--------

--------

--------

--------
```

SKINF02.WORK.PD8510 THU, DEC 22, 1983, 10:42 AM PAGE 17

```
*EJECT*******
.POWER_MENU
--------

--------
"POWER"
[cmd_source_power
,select_active_function(active_source_power);
--------
"SLOPE"+sk_bracket_2
"ON "
[cmd_power_slope
,BEGIN
,   hilight_on( cmd_power_slope, cmd_power_slope_off );
,   set_entry_ch_integer( power_slope_on, ch_power_slope_mode );
,   wrt_priv_ib_source( sl1, newline);
,   select_active_function( active_power_slope );
,END;
--------
"OFF"
[cmd_power_slope_off
,BEGIN
,   hilight_on( cmd_power_slope, cmd_power_slope_off );
,   set_entry_ch_integer( power_slope_off, ch_power_slope_mode );
,   select_active_off( active_power_slope );
,   wrt_priv_ib_source( sl0, "");
,END;
--------
"ATTENUATOR"+sk_bracket_2
"PORT 1"
[cmd_atten_port1
,select_active_function(active_atten_port1);
--------
"PORT 2"
[cmd_atten_port2
,select_active_function(active_atten_port2);
--------

--------

--------
```

SKINF02.WORK.PD8510 THU, DEC 22, 1983, 10:42 AM PAGE 18

```
*EJECT*******
.STIMULUS2_MENU
--------
sk_bracket_4
half_vt+"HOLD"
[cmd_hold
,hold_sweep;
--------
"SINGLE"
[cmd_single
,single_sweep;
--------
"NUMBER of"
"GROUPS"
[cmd_n_sweeps
,select_active_function(active_n_sweeps);
--------
"CONTINUAL"
[cmd_continuous
,continuous_sweep;
--------
"STIMULUS"
"OFFSET"
,select_active_function( active_stimulus_offset );
--------

--------
sk_bracket_2
half_vt+"Ch1 = Ch2"
[cmd_couple_stimulus
,BEGIN
,  hilight_on( cmd_couple_stimulus, cmd_uncouple_stimulus );
,  set_coupled_stimulus_status( TRUE );
,END;
--------
"Ch1 "+163+" Ch2"
[cmd_uncouple_stimulus
,BEGIN
,  hilight_on( cmd_couple_stimulus, cmd_uncouple_stimulus );
,  set_coupled_stimulus_status( FALSE );
,END;
--------

Sparams.work.L
```

SKINF02.WORK.PD8510 THU, DEC 22, 1983, 10:42 AM PAGE 19

```
*EJECT*******
.PARAM_MENU
--------

--------
sk_bracket_4
half_vt+" Z"+177+" "
[cmd_z1
,new_parameter( z1 );
--------
" Z"+178+" "
[cmd_z2
,new_parameter( z2 );
--------
" Y"+177+" "
[cmd_y1
,new_parameter( y1 );
--------
" Y"+178+" "
[cmd_y2
,new_parameter( y2 );
--------

--------

--------
"MORE"
^PARAM2_MENU
]cmd_more
--------
```

SKINF02.WORK.PD8510 THU, DEC 22, 1983, 10:42 AM PAGE 20

```
*EJECT*******
.PARAM2_MENU
--------

--------
"User 1"+sk_bracket_4
"(a"+177+")"
[cmd_user1
,new_parameter( user1 );
--------
"User 2"
"(b"+178+")"
[cmd_user2
,new_parameter( user2 );
--------
"User 3"
"(a"+178+")"
[cmd_user3
,new_parameter( user3 );
--------
"User 4"
"(b"+177+")"
[cmd_user4
,new_parameter( user4 );
--------

--------
"REDEFINE"
"PARAMETERS" -
^REDEF_MENU
[cmd_redefine_param
--------

--------
```

SKINF02.WORK.PD8510 THU, DEC 22, 1983, 10:42 AM PAGE 21

```
*EJECT*******
.REDEF_MENU
--------
"REDEFINE"+sk_bracket_8
"User 1"
^REDEF2_MENU
,redef_parameter := user1;
--------
"User 2"
^REDEF2_MENU
,redef_parameter := user2;
--------
"User 3"
^REDEF2_MENU
,redef_parameter := user3;
--------
"User 4"
^REDEF2_MENU
,redef_parameter := user4;
--------
"S"+177+177+" "
^REDEF2_MENU
,redef_parameter := s11;
--------
"S"+178+177+" "
^REDEF2_MENU
,redef_parameter := s21;
--------
"S"+177+178+" "
^REDEF2_MENU
,redef_parameter := s12;
--------
"S"+178+178+" "
^REDEF2_MENU
,redef_parameter := s22;
--------
```

```
*EJECT*******
.REDEF2_MENU
--------

--------
"EXCITE"+sk_bracket_3
"port 1"
^REDEF3_MENU
,redef_excite := driven_a1;
--------
"port 2"
^REDEF3_MENU
,redef_excite := driven_a2;
--------
"NONE"
^REDEF3_MENU
,redef_excite := driven_none;
--------

--------

--------

--------

--------
```

```
*EJECT*******
.REDEF3_MENU
--------

--------
"LOCK to"+sk_bracket_3
"a1 "
^REDEF4_MENU
,redef_lock := lock_to_a1;
--------
"a2 "
^REDEF4_MENU
,redef_lock := lock_to_a2;
--------
"NONE"
^REDEF4_MENU
,redef_lock := lock_donot_care;
--------

--------

--------

--------

--------
```

```
*EJECT*******
.REDEF4_MENU
--------

--------
"NUMERATOR"+sk_bracket_5
"b1 "
^REDEF6_MENU
,redef_numerator := num_b1;
--------
"b2 "
^REDEF6_MENU
,redef_numerator := num_b2;
--------
"a1 "
^REDEF7_MENU
,redef_numerator := num_a1;
--------
"a2 "
^REDEF6_MENU
,redef_numerator := num_a2;
--------
"SERVICE"
"SELECTIONS"
^REDEF5_MENU
--------

--------

--------
```

```
*EJECT*******
.REDEF5_MENU
--------
"100 kHz"+sk_bracket_8
"TEST CAL"
^REDEF7_MENU
,redef_numerator := num_100khz_cal;
--------
"100 kHz"
"REF CAL"
^REDEF7_MENU
,redef_numerator := num_ref_100khz_cal;
--------
"DETECTOR"
"GROUND"
^REDEF7_MENU
,redef_numerator := num_detector_gnd;
--------
"ADC GROUND"
^REDEF7_MENU
,redef_numerator := num_adc_gnd;
--------
"VCAL"
^REDEF7_MENU
,redef_numerator := num_vcal;
--------
"VREF"
^REDEF7_MENU
,redef_numerator := num_vref;
--------
"TEMP. 1"
^REDEF7_MENU
,redef_numerator := num_temp1;
--------
"TEMP. 2"
^REDEF7_MENU
,redef_numerator := num_temp2;
--------
```

```
*EJECT*******
.REDEF6_MENU
--------

--------
"DENOM."+sk_bracket_4
"a1 "
^REDEF7_MENU
,redef_denominator := denom_a1;
--------
"a2 "
^REDEF7_MENU
,redef_denominator := denom_a2;
--------
"b1 "
^REDEF7_MENU
,redef_denominator := denom_b1;
--------
"NO RATIO"
^REDEF7_MENU
,redef_denominator := denom_no_ratio;
--------

--------

--------
```

```
*EJECT*******
.REDEF7_MENU
--------

--------
"CONVERSION"+sk_bracket_4
"NONE"
,redef_convert := conv_off;
--------
"to Z"
,redef_convert := conv_s_to_z;
--------
"to Y"
,redef_convert := conv_s_to_y;
--------
"to  "
"RECIPROCAL"
,redef_convert := conv_reciprocal;
--------

--------
"LABEL"
"PARAMETER"
[cmd_label_parameter
,warn( command_not_implemented );
--------
"REDEFINE"
"DONE"
[cmd_redefine_done
,BEGIN
,   redefine_param;
,   pop_menu( PARAM2_MENU );
,END;
--------

6format.work.L
```

```
*EJECT*******
.FORMAT_MENU
--------
sk_bracket_8
half_vt+"SWR"
[cmd_swr
,new_format( fmt_swr );
--------
"LINEAR"
"MAGNITUDE"
[cmd_linear_mag
,new_format( fmt_linear_mag );
--------
"POLAR w/"
"LIN MKR"
[cmd_linear_polar
,new_format( fmt_linear_polar );
--------
"POLAR w/"
"LOG MKR"
[cmd_log_polar
,new_format( fmt_log_polar );
--------
"POLAR w/"
"Re/Im MKR"
[cmd_imag_vs_real
,new_format( fmt_imag_vs_real );
--------
"INVERTED"
"SMITH"
[cmd_y_smith
,new_format( fmt_y_smith );
--------
"IMAGINARY"
[cmd_imaginary
,new_format( fmt_imaginary );
--------
"REAL"
[cmd_real
,new_format( fmt_real );
--------

8donmenu.work.L
```

```
*EJECT********
.DOMAIN_MENU
--------
sk_bracket_4
half_vt+"FREQUENCY"
[cmd_freq_domain
,BEGIN
,   hilight_on( cmd_freq_domain, cmd_aux_domain);
,   set_domain( freq_domain );
,END;
--------
"TIME"
"LOW PASS"
^LOW_PASS_FREQ
[cmd_low_pass_request
--------
"TIME"
"BAND PASS"
[cmd_time_domain
,BEGIN
,   hilight_on( cmd_freq_domain, cmd_aux_domain);
,   set_domain( time_domain );
,END;
--------
"AUX. VOLT"
"OUTPUT"
[cmd_aux_domain
,BEGIN
,   hilight_on( cmd_freq_domain, cmd_aux_domain);
,   set_domain( aux_domain );
,END;
--------

--------
"SPECIFY"+sk_bracket_2
"TIME"
[cmd_setup_time_domain
^TIME_SETUP_MENU
--------
"GATE"
[cmd_setup_gate_domain
^GATE_SETUP_MENU
,select_active_gate( 0 );                    & turn on gate markers &
--------

--------
```

```
*EJECT*******
.LOW_PASS_FREQ
--------

--------
"SET FREQ."
"(LOW PASS)"
[cmd_tdr_domain
,BEGIN
,   tdr_check;
,   hilight_key( cmd_low_pass_request, cmd_freq_domain, cmd_aux_domain);
,   set_domain( tdr_domain );
,   previous_menu;
,END;
--------

--------

--------

--------

--------

--------

--------
```

```
*EJECT*******
.TIME_SETUP_MENU
--------

--------
"LOW PASS:"+sk_bracket_2
"STEP"
[cmd_tdr_step
,BEGIN
,   hilight_on( cmd_tdr_step, cmd_tdr_impulse);
,   set_entry_ch_integer( step_tdr, ch_tdr_stimulus_type );
,   update_domain_vars;
,END;
--------
"IMPULSE"
[cmd_tdr_impulse
,BEGIN
,   hilight_on( cmd_tdr_step, cmd_tdr_impulse);
,   set_entry_ch_integer( impulse_tdr, ch_tdr_stimulus_type );
,   update_domain_vars;
,END;
--------

--------
"WINDOW:"+sk_bracket_3
"MINIMUM"
[cmd_min_time_window
,BEGIN
,   hilight_on( cmd_min_time_window, cmd_max_time_window);
,   set_entry_ch_integer( min_window, ch_time_window );
,   update_domain_vars;
,END;
--------
"NORMAL"
[cmd_normal_time_window
,BEGIN
,   hilight_on( cmd_min_time_window, cmd_max_time_window);
,   set_entry_ch_integer( normal_window, ch_time_window );
;   update_domain_vars;
,END;
--------
"MAXIMUM"
[cmd_max_time_window
,BEGIN
,   hilight_on( cmd_min_time_window, cmd_max_time_window);
,   set_entry_ch_integer( max_window, ch_time_window );
,   update_domain_vars;
,END;
--------

--------
```

```
*EJECT*******
.GATE_SETUP_MENU
--------
"GATE"+sk_bracket_2
"ON"
[cmd_gate_on
,BEGIN
,   hilight_on( cmd_gate_on, cmd_gate_off);
,   set_entry_ch_integer( gate_on, ch_gating );
,   abort_sweep;
,   update_domain_vars;
,   rebuild := TRUE;                        & turns on array mode &
,   restart_sweep;
,END;
--------
"OFF"
[cmd_gate_off
,BEGIN
,   hilight_on( cmd_gate_on, cmd_gate_off);
,   set_entry_ch_integer( gate_off, ch_gating );
,   marker_state := marker_state AND gate_markers_off;
,   abort_sweep;
,   update_domain_vars;
,   rebuild := TRUE;                        & turns off array mode &
,   restart_sweep;
,END;
--------
"GATE"+sk_bracket_4
"START"
[cmd_gate_start
,select_active_gate( active_gate_start );
--------
"STOP"
[cmd_gate_stop
,select_active_gate( active_gate_stop );
--------
"CENTER"
[cmd_gate_center
,select_active_gate( active_gate_center );
--------
"SPAN"
[cmd_gate_span
,select_active_gate( active_gate_span );
--------

--------
"GATE SHAPE"
~GATE_SHAPE_MENU
--------
```

```
*EJECT*******
.GATE_SHAPE_MENU
--------

--------

--------

--------

--------
"GATE SHAPE"+sk_bracket_3
"MINIMUM"
[cmd_min_gate_window
,BEGIN
,   hilight_on( cmd_min_gate_window, cmd_max_gate_window);
,   set_entry_ch_integer( min_window, ch_gate_window );
,   update_domain_vars;
,END;
--------
"NORMAL"
[cmd_normal_gate_window
,BEGIN
,   hilight_on( cmd_min_gate_window, cmd_max_gate_window);
,   set_entry_ch_integer( normal_window, ch_gate_window );
,   update_domain_vars;
,END;
--------
"MAXIMUM"
[cmd_max_gate_window
,BEGIN
;   hilight_on( cmd_min_gate_window, cmd_max_gate_window);
,   set_entry_ch_integer( max_window, ch_gate_window );
,   update_domain_vars;
,END;
--------

--------

?calmenu.work.L
```

```
*EJECT*******
.CAL_MENU
--------
"CORRECTION"+sk_bracket_3
"ON"
[cmd_correction_on
,recall_cal(default_cal_set);
--------
"OFF"
[cmd_correction_off
,correction_off;
--------
"SELECT"
"CAL SET"
[cmd_correction_default
,gen_cal_info( no_op );
--------
"CALIBRATE"+sk_bracket_2
"( NO KIT )"
[cmd_cal_type_menu
,BEGIN
,   IF entry_ch_integer( ch_correction_mode ) = correct_off THEN
,      gen_menu(CAL_TYPE_MENU, 1 )
,   ELSE
,      warn( turn_correct_off );
,END;
--------
"RESUME CAL"
"SEQUENCE"
,resume_cal;
--------
"SPECIFY"
"CAL KIT"
^STDS_KIT_MENU
--------

--------
"MORE"
]cmd_more
^MORE_CAL
--------
```

```
*EJECT******
.MORE_CAL
--------

--------
"SET Z"+176
,select_active_function( active_system_z0 );
--------
"REFERENCE"
"PLANES"
^REF_PLANE_MENU
[cmd_ref_plane_menu
--------

--------
"CAL SWEEP"
"VOLTAGE"
,warn(command_not_implemented);
--------

--------
"DELETE A"
"CAL SET"
[cmd_delete_cal
,gen_cal_info( clear_op );
--------

--------
```

```
*EJECT*******
.REF_PLANE_MENU
--------

--------
sk_bracket_2
half_vt+"PLANE 1"
[cmd_ref_plane_1
,select_active_function( active_ref_plane_1 );
--------
"PLANE 2"
[cmd_ref_plane_2
,select_active_function( active_ref_plane_2 );
--------

--------

--------

--------

--------

--------
```

```
*EJECT******
.CAL_TYPE_MENU
--------

--------
"FREQUENCY"+sk_bracket_4
"RESPONSE"
[cmd_response_type
,set_cal_type( response );
--------
"1-PORT on"
"PORT 1"
[cmd_1_port_1_type
,set_cal_type( one_port_on_1 );
--------
"1-PORT on"
"PORT 2"
[cmd_1_port_2_type
,set_cal_type( one_port_on_2 );
--------
"2-PORT"
[cmd_2_port_type
,set_cal_type( two_port );
--------

--------
"SET FREQ."
"(LOW PASS)"
[cmd_freq_setup
,tdr_check;
--------

--------
```

```
*EJECT*******
.PORT_ONE_REFL
--------

--------
"PORT 1"+sk_bracket_3
"PORT1 STD1"
[cmd_port1_std1
,set_std_class( port1_1st_std );
--------
"PORT1 STD2"
[cmd_port1_std2
,set_std_class( port1_2nd_std );
--------
"PORT1 STD3"
[cmd_port1_std3
,set_std_class( port1_3rd_std );
--------

--------

--------
"SELECT"
"CAL SET"
]cmd_correction_default
--------
"1-PORT"
"DONE"
[cmd_done_1_port_on_1
,cal_done( done_1_port_on_1 );
--------
```

```
*EJECT*******
.PORT_TWO_REFL
--------

--------
"PORT 2"+sk_bracket_3
"PORT2 STD1"
[cmd_port2_std1
,set_std_class( port2_1st_std );
--------
"PORT2 STD2"
[cmd_port2_std2
,set_std_class( port2_2nd_std );
--------
"PORT2 STD3"
[cmd_port2_std3
,set_std_class( port2_3rd_std );
--------

--------

--------
"SELECT"
"CAL SET"
]cmd_correction_default
--------
"1-PORT"
"DONE"
[cmd_done_1_port_on_2
,cal_done( done_1_port_on_2 );
--------
```

```
*EJECT*******
.CAL_MENU2
--------

--------
"REFLECTION"+sk_bracket_3
[cmd_cal_reflection
^REFLECTION_MENU
--------
"TRANS-"
"MISSION"
[cmd_cal_thru
^TRANSMISSION_MENU
,BEGIN
,   tell( connect_thru );
,END;
--------
"ISOLATION"
[cmd_cal_isolation
^ISOLATION_MENU
,BEGIN
,   tell( isolate_ports );
,END;
--------

--------

--------
"SELECT"
"CAL SET"
]cmd_correction_default
--------
"2-PORT"
"DONE"
[cmd_done_2_port
,cal_done( done_2_port );
--------
```

```
*EJECT*******
.REFLECTION_MENU
--------

--------
"PORT 1"+sk_bracket_3
"PORT1 STD1"
]cmd_port1_std1
--------
"PORT1 STD2"
]cmd_port1_std2
--------
"PORT1 STD3"
]cmd_port1_std3
--------
"PORT 2"+sk_bracket_3
"PORT2 STD1"
]cmd_port2_std1
--------
"PORT2 STD2"
]cmd_port2_std2
--------
"PORT2 STD3"
]cmd_port2_std3
--------
"REFLECTION"
"DONE"
[cmd_done_reflection
,cal_done( done_reflection );
--------
```

```
*EJECT*******
.TRANSMISSION_MENU
--------
"SIMPLE"
"TRANS."
[cmd_simple_trans
,warn( command_not_implemented );
--------

--------
"FWD.TRANS."
"FWD_TRANS_"
[cmd_fwd_transmission
,   set_std_class( trans_fwd_std );
--------
"FWD.MATCH"
"FWD_MATCH_"
[cmd_fwd_match
,   set_std_class( match_fwd_std  );
--------
"REV.TRANS."
"REV_TRANS_"
[cmd_rev_transmission
,   set_std_class( trans_rev_std );
--------
"REV.MATCH"
"REV_MATCH_"
[cmd_rev_match
,   set_std_class( match_rev_std );
--------
--------
"TRANS."
"DONE"
[cmd_done_trans
,cal_done( done_trans );
--------
```

```
*EJECT*******
.ISOLATION_MENU
--------

--------
"FWD ISOL'N"
"FWD_ISOLN_"
[cmd_fwd_isolation
,   set_std_class( isoln_fwd_std );
--------
"REV ISOL'N"
"REV_ISOLN_"
[cmd_rev_isolation
,   set_std_class( isoln_rev_std );
--------

--------
"OMIT"
"ISOLATION"
[cmd_omit_isolation
,omit_isolation;
--------

--------

--------
"ISOLATION"
"DONE"
[cmd_done_isolation
,cal_done(done_isol);
--------
```

```
*EJECT*******
.STD_CLASS_MENU
--------
"STANDARD 1"
[cmd_class_std1
^TAKE_DATA_MENU
,set_element( 1 );
--------
"STANDARD 2"
[cmd_class_std2
^TAKE_DATA_MENU
,set_element( 2 );
--------
"STANDARD 3"
[cmd_class_std3
^TAKE_DATA_MENU
,set_element( 3 );
--------
"STANDARD 4"
[cmd_class_std4
^TAKE_DATA_MENU
,set_element( 4 );
--------
"STANDARD 5"
[cmd_class_std5
^TAKE_DATA_MENU
,set_element( 5 );
--------
"STANDARD 6"
[cmd_class_std6
^TAKE_DATA_MENU
,set_element( 6 );
--------
"STANDARD 7"
[cmd_class_std7
^TAKE_DATA_MENU
,set_element( 7 );
--------
"STANDARDS "
"DONE"
[cmd_class_done
,cal_done(done_class);
--------
```

```
*EJECT*******
.SLIDING_LOAD_MENU
--------

--------
"SLIDE IS"
"SET"
^TAKE_DATA_MENU
,measurement_restart;
--------

--------

--------

--------

--------

--------
"SLIDING"
"LOAD DONE"
,BEGIN
,   previous_menu;
,   previous_menu;
,   compute_load;
,END;
--------
```

SKINF02.WORK.PD8510 THU, DEC 22, 1983, 10:42 AM PAGE 46

```
*EJECT*******
.TAKE_DATA_MENU
--------

--------

--------

--------

--------

--------

--------

--------
"TAKE DATA"
[cmd_take_data
,take_data;
--------

Cstdmenu.work.L
```

SKINF02.WORK.PD8510 THU, DEC 22, 1983, 10:42 AM PAGE 47

```
*EJECT******
.STDS_KIT_MENU
--------

--------
"SELECT"+sk_bracket_2
"( KIT #1 )"
[cmd_cal_kit_1
,select_cal_kit( 1 );
--------
"SELECT"
"( KIT #2 )"
[cmd_cal_kit_2
,select_cal_kit( 2 );
--------

--------
"MODIFY"
"CAL KIT"
[cmd_modify_cal_kit
^MODIFY_CAL_KIT_MENU
--------

--------

--------

--------
```

SKINF02.WORK.PD8510 THU, DEC 22, 1983, 10:42 AM PAGE 48

```
*EJECT*******
.MODIFY_CAL_KIT_MENU
--------

--------
"SELECT"
"STANDARD"
[cmd_select_std
,select_active_function( active_std_id );
--------
"SPECIFY"
"STD CLASS"
[cmd_specify_classes
^SPECIFY_CLASS_MENU
--------
"LABEL"
"STD CLASS"
[cmd_label_classes
,warn( command_not_implemented );
--------
"LABEL"
"CAL KIT"
[cmd_label_cal_kit
,warn( command_not_implemented );
--------

--------

--------
"DONE"
"(DEFINED)"
[cmd_cal_kit_defined
,cal_kit_defined;
--------
```

SKINF02.WORK.PD8510 THU, DEC 22, 1983, 10:42 AM PAGE 49

```
*EJECT*******
.MODIFY_STDS_MENU
--------
"STD TYPE"+sk_bracket_5
"OPEN"
[cmd_define_open
^DEFINE_OPEN_MENU
,define_std( std_open );
--------
"SHORT"
[cmd_define_short
^DEFINE_SHORT_MENU
,define_std( std_short );
--------
"LOAD"
[cmd_define_load
^DEFINE_LOAD_MENU
,define_std( std_load );
--------
"DELAY/"
"THRU"
[cmd_define_air_line
^SPECIFY_OFFSET_MENU
,define_std( std_thru );
--------
"ARBITRARY"
"IMPEDANCE"
[cmd_define_z
^SPECIFY_Z_MENU
,define_std( std_z );
--------

--------

--------

--------
```

```
*EJECT*******
.DEFINE_OPEN_MENU
--------
" C"+176+" "
[cmd_open_c0
,select_active_function( active_open_c0 );
--------
" C"+177+" "
[cmd_open_c1
,select_active_function( active_open_c1 );
--------
" C"+178+" "
[cmd_open_c2
,select_active_function( active_open_c2 );
--------

--------

--------
"SPECIFY"
"OFFSET"
[cmd_specify_offset
^SPECIFY_OFFSET_MENU
--------
"LABEL STD"
[cmd_label_cal_std
,warn( command_not_implemented );
--------
"DONE"
"(DEFINED)"
[cmd_cal_std_defined
,pop_menu( MODIFY_CAL_KIT_MENU );
--------
```

```
*EJECT*******
.DEFINE_SHORT_MENU
--------

--------

--------

--------

--------

--------
"SPECIFY"
"OFFSET"
]cmd_specify_offset
^SPECIFY_OFFSET_MENU
--------
"LABEL STD"
]cmd_label_cal_std
--------
"DONE"
"(DEFINED)"
]cmd_cal_std_defined
--------
```

```
*EJECT*******
.DEFINE_LOAD_MENU
--------

--------

--------

--------
sk_bracket_2
half_vt+"FIXED"
[cmd_fixed_load
,define_type2( fixed );
--------
"SLIDING"
[cmd_sliding_load
,define_type2( sliding );
--------
"SPECIFY"
"OFFSET"
]cmd_specify_offset
^SPECIFY_OFFSET_MENU
--------
"LABEL STD"
]cmd_label_cal_std
--------
"DONE"
"(DEFINED)"
]cmd_cal_std_defined
--------
```

```
*EJECT*******
.SPECIFY_Z_MENU
--------
" C"+176+" "
]cmd_open_c0
--------
" C"+177+" "
]cmd_open_c1
--------
" C"+178+" "
]cmd_open_c2
--------
sk_bracket_2
half_vt+"FIXED"
]cmd_fixed_load
--------
"SLIDING"
]cmd_sliding_load
--------
"SPECIFY"
"OFFSET"
]cmd_specify_offset
^SPECIFY_OFFSET_MENU
--------
"LABEL STD"
]cmd_label_cal_std
--------
"DONE"
"(DEFINED)"
]cmd_cal_std_defined
--------
```

```
*EJECT*******
.SPECIFY_OFFSET_MENU
--------
"OFFSET"
"DELAY"
[cmd_offset_delay
,select_active_function( active_offset_delay );
--------
"OFFSET"
"LOSS"
[cmd_offset_loss
,select_active_function( active_offset_loss );
--------
"OFFSET"
" Z"+176+" "
[cmd_offset_z0
,select_active_function( active_offset_z0 );
--------
"LOWER"
"FREQUENCY"
[cmd_offset_min_f
,select_active_function( active_offset_min_freq );
--------
"UPPER"
"FREQUENCY"
[cmd_offset_max_f
,select_active_function( active_offset_max_freq );
--------
sk_bracket_2
half_vt+"COAX"
[cmd_coax
,define_type2( coax );
--------
"WAVEGUIDE"
[cmd_waveguide
,define_type2( waveguide );
--------

--------
```

```
*EJECT*******
.SPECIFY_CLASS_MENU
--------
"PORT 1:  "
"1st STD"
[cmd_port1_1st_std
,std_class( port1_1st_std );
--------
"2nd STD"
[cmd_port1_2nd_std
,std_class( port1_2nd_std );
--------
"3rd STD"
[cmd_port1_3rd_std
,std_class( port1_3rd_std );
--------
"PORT 2:  "
"1st STD"
[cmd_port2_1st_std
,std_class( port2_1st_std );
--------
"2nd STD"
[cmd_port2_2nd_std
,std_class( port2_2nd_std );
--------
"3rd STD"
[cmd_port2_3rd_std
,std_class( port2_3rd_std );
--------

--------
"MORE"
^SPECIFY_CLASS_MENU2
--------
```

```
*EJECT*******
.SPECIFY_CLASS_MENU2
--------
"TRANS.:"
"FWD STD"
[cmd_trans_fwd_std
,std_class( trans_fwd_std );
--------
"REV STD"
[cmd_trans_rev_std
,std_class( trans_rev_std );
--------

--------
"FREQUENCY"
"RESP. STD"
[cmd_freq_resp_std
,std_class( freq_resp_std );
--------

--------

--------

--------

--------

$disp.work.L
```

```
*EJECT*******
.DISPLAY_MENU
--------
"SINGLE "+sk_bracket_2
"CHANNEL"
[cmd_single_ch
,select_trace_mode( single_ch );
--------
"DUAL  "
"CHANNEL"
[cmd_dual_ch
^DUAL_CH_MENU
--------
sk_bracket_4
half_vt+"DATA"
[cmd_data
,set_trace_type( trace_data );
--------
"MEMORY"
[cmd_mem
,set_trace_type( trace_mem );
--------
"DATA "+38
"MEMORY"
[cmd_d_and_m
,set_trace_type( trace_data_and_mem );
--------
"MATH"
"(...)"
[cmd_math
,set_trace_type( entry_ch_integer(ch_math_op) );
--------
"SELECT"
"DEFAULTS"
^DISPLAY_DEFAULT_MENU
--------
"DATA "+169
"MEMORY"
[cmd_d_into_m
,set_trace_type( trace_data_into_mem );
--------
```

```
*EJECT*******
.DUAL_CH_MENU
--------

--------
"2 CHANNEL"+sk_bracket_2
"OVERLAY"
[cmd_overlay
,select_trace_mode( overlay );
--------
"2 CHANNEL"
"SPLIT"
[cmd_split
,select_trace_mode( split );
--------

--------

--------

--------

--------

--------
```

```
*EJECT*******
.DISPLAY_DEFAULT_MENU
--------
"MEMORY"+sk_bracket_5
" 1 "
[cmd_memory1
,select_memory( mem1 );
--------
" 2 "
[cmd_memory2
,select_memory( mem2 );
--------
" 3 "
[cmd_memory3
,select_memory( mem3 );
--------
" 4 "
[cmd_memory4
,select_memory( mem4 );
--------
"MORE"
^MEMORY_MENU
--------

--------
"MATH"
"OPERATIONS"
^MATH_MENU
--------

--------
```

```
*EJECT*******
.MEMORY_MENU
--------

--------
"DATA from"+sk_bracket_3
"CHANNEL 1"
[cmd_memory_ch1
,select_memory( data1 );
--------
"DATA from"
"CHANNEL 2"
[cmd_memory_ch2
,select_memory( data2 );
--------
"JOHN'S"
"PLAYGROUND"
^MEMORY2_MENU
--------

--------

--------

--------

--------
```

```
*EJECT********
.MEMORY2_MENU
--------
"CAL DATA"+sk_bracket_7
" 0 "
[cmd_cal0
,select_memory( cal1 );
--------
"CAL DATA"
" 1 "
[cmd_cal1
,select_memory( cal2 );
--------
"CAL DATA"
" 2 "
[cmd_cal2
,select_memory( cal3 );
--------
"CAL DATA"
" 3 "
[cmd_cal3
,select_memory( cal4 );
--------
"CAL DATA"
" 4 "
[cmd_cal4
,select_memory( cal5 );
--------
"CAL DATA"
" 5 "
[cmd_cal5
,select_memory( cal6 );
--------
"CAL DATA"
" 6 "
[cmd_cal6
,select_memory( cal7 );
--------
"CAL DATA"
" 7 "
[cmd_cal7
,select_memory( cal8 );
--------
```

```
*EJECT*******
.MATH_MENU
--------

--------

--------


--------
"DATA"+sk_bracket_4
"+ MEMORY"
[cmd_d_plus_m
,select_math_op( trace_data_plus_mem );
--------
"DATA"
"- MEMORY"
[cmd_d_minus_m
,select_math_op( trace_data_minus_mem );
--------
"DATA"
mpy_char+" MEMORY"
[cmd_d_mpy_m
,select_math_op( trace_data_times_mem );
--------
"DATA"
"/ MEMORY"
[cmd_d_div_m
,select_math_op( trace_data_div_mem );
--------

--------

2plot.work.L
```

```
*EJECT********
.COPY_MENU
--------
"PLOT"+sk_bracket_5
"ALL"
[cmd_plot_all
,select_plot_buffer (all);
--------
"TRACE"
[cmd_plot_trace
,select_plot_buffer (trace);
--------
"GRATICULE"
[cmd_plot_graticule
,select_plot_buffer (grid);
--------
"MARKER(S)"
[cmd_plot_marker
,select_plot_buffer (markers);
--------
"TEXT"
[cmd_plot_text
,select_plot_buffer (annotations);
--------
"SELECT"
"QUADRANT"
^PLOT_SETUP_MENU
--------
"SELECT"
"PEN COLOR"
[cmd_chl_pen
^PEN_MENU
--------
"PARAMETERS"
"AND DATA"
^PLOTPARM_MENU
--------
```

```
*EJECT*******
.PLOTPARM_MENU
--------
"OPERATING"+sk_bracket_2
"PARAMETERS"
^COPY2_MENU
[cmd_op_params
,select_plot_param (op_params);
--------
"SYSTEM"
"PARAMETERS"
^COPY2_MENU
[cmd_system_params
,select_plot_param (sys_params);
--------

--------
"LIST TRACE"
"VALUES"
[cmd_list_trace
,IF printer_connected THEN
,  BEGIN
,    abort_sweep;
,    list_trace_values;
,    restart_sweep;
,  END;
--------
```

```
*EJECT*******
.PLOT_SETUP_MENU
--------
"X X   FULL"+sk_bracket_5
"X X   PAGE"
[cmd_quadrant_full
,select_plot_quadrant (full_page);
--------
"X -   LEFT"
"- -   UPPER"
[cmd_quadrant_11
,select_plot_quadrant (upper_left);
--------
"- -   LEFT"
"X -   LOWER"
[cmd_quadrant_21
,select_plot_quadrant (lower_left);
--------
"- X  RIGHT"
"- -  UPPER"
[cmd_quadrant_12
,select_plot_quadrant (upper_right);
--------
"- -  RIGHT"
"- X  LOWER"
[cmd_quadrant_22
,select_plot_quadrant (lower_right);
--------
```

```
*EJECT*******
.PEN_MENU
--------
"PEN"+sk_bracket_8
" 1 "
[cmd_pen1
,select_pen(1);
--------
" 2 "
[cmd_pen2
,select_pen (2);
--------
" 3 "
[cmd_pen3
,select_pen (3);
--------
" 4 "
[cmd_pen4
,select_pen (4);
--------
" 5 "
[cmd_pen5
,select_pen (5);
--------
" 6 "
[cmd_pen6
,select_pen (6);
--------
" 7 "
[cmd_pen7
,select_pen (7);
--------
" 8 "
[cmd_pen8
,select_pen (8);
--------
```

```
*EJECT*******
.COPY2_MENU
--------
"RESTORE"
"DISPLAY"
]cmd_directory_off
--------
sk_bracket_2
half_vt+"PRINT"
[cmd_print_params
,IF printer_connected THEN
,  output_parameters;
--------
"PLOT"
[cmd_plot_params
,dump_to_plotter;
--------

--------

--------

--------

--------
"NEXT PAGE"
[cmd_next_op_param
,next_op_param;
--------

9mkr.work.L
```

```
*EJECT*******
.MARKER_MENU
--------
"MARKER"+sk_bracket_6
"       1 "
[cmd_marker_1
,select_marker(1);
--------
"       2 "
[cmd_marker_2
,select_marker(2);
--------
"       3 "
[cmd_marker_3
,select_marker(3);
--------
"       4 "
[cmd_marker_4
,select_marker(4);
--------
"       5 "
[cmd_marker_5
,select_marker(5);
--------
"ALL"
"OFF"
[cmd_marker_off
,select_marker(0);
--------
delta_char+" MODE"
"MENU"
^DELTA_MARKER_MENU
[cmd_delta_marker
--------
"MORE"
^MARKER2_MENU
]cmd_more
--------
```

```
*EJECT*******
.DELTA_MARKER_MENU
--------
sk_bracket_6
half_vt+delta_char+" REF = 1"
[cmd_ref_mkr1
,select_ref_marker( 1 );
--------
delta_char+" REF = 2"
[cmd_ref_mkr2
,select_ref_marker( 2 );
--------
delta_char+" REF = 3"
[cmd_ref_mkr3
,select_ref_marker( 3 );
--------
delta_char+" REF = 4"
[cmd_ref_mkr4
,select_ref_marker( 4 );
--------
delta_char+" REF = 5"
[cmd_ref_mkr5
,select_ref_marker( 5 );
--------
delta_char+" MODE"
"OFF"
[cmd_no_ref_mkr
,select_ref_marker( 0 );
--------

--------

--------
```

```
SKINF02.WORK.PD8510            THU, DEC 22, 1983, 10:42 AM     PAGE  70

*EJECT*******
.MARKER2_MENU
--------

--------

--------

--------

--------

--------

--------
"MARKER to"+sk_bracket_2
"MINIMUM"
[cmd_mkr_to_min
,marker_to( mkr_to_min );
--------
"MAXIMUM"
[cmd_mkr_to_max
,marker_to( mkr_to_max );
--------

@system.work.L
```

```
SKINF02.WORK.PD8510            THU, DEC 22, 1983, 10:42 AM     PAGE  71

*EJECT*******
.SYSTEM_MENU
--------

--------
"TITLE"
[cmd_title
^TITLE_MENU
,select_active_function( active_title );
--------
"HP-IB"
"FUNCTIONS"
[cmd_hpib_info
^HPIB_MENU
--------
"CRT"
"OFF"
[cmd_crt_off
,warn(command_not_implemented);
--------

--------

--------

--------
"SERVICE"
"FUNCTIONS"
[cmd_service_menu
^SERVICE_MENU
--------
```

```
SKINF02.WORK.PD8510            THU, DEC 22, 1983, 10:42 AM     PAGE  72

*EJECT*******
.TITLE_MENU
--------

--------
"SELECT"
"LETTER"
,enter_title_char( char_index );
--------

--------
"SPACE"
,enter_title_char( space_index );
--------
"BACKSPACE"
,enter_title_char( backspace_index );
--------

--------

--------
"DONE"
[cmd_title_done
,BEGIN
,   select_active_off( active_title );
,   previous_menu;
,END;
--------
```

```
SKINF02.WORK.PD8510            THU, DEC 22, 1983, 10:42 AM     PAGE  73

*EJECT*******
.HPIB_MENU
--------

--------
"8510 HP-IB"+sk_bracket_2
"ADDRESS"
[cmd_8510_addr
,select_active_function( active_major_hpib_addr );
--------
"ADDITIONAL"
"ADDRESSES"
^HPIB_ADDRESS_MENU
--------

--------

--------
"SYSTEM"+sk_bracket_2
"'LOCAL'"
[cmd_privib_local
,BEGIN
,   hilight_on( cmd_privib_local, cmd_privib_remote );
,   abort_sweep;
,   clr_ren_priv_ib;
,   wrt_priv_ib_source(  display_on, " " );
,END;
--------
"'REMOTE'"
[cmd_privib_remote
,BEGIN
,   hilight_on( cmd_privib_local, cmd_privib_remote );
,   abort_sweep;
,COMMENT
,   set_ren_priv_ib;
,COMMENT
,   wrt_priv_ib_source(  display_off, " " );
,   reset_priv_ib_act_funs;
,   restart_sweep;
,END;
--------

--------
```

```
*EJECT*******
.HPIB_ADDRESS_MENU
--------

--------
"8510 MINOR"+sk_bracket_7
"ADDRESS"
[cmd_minor_addr
,select_active_function( active_minor_hpib_addr );
--------
"SOURCE"
[cmd_source_addr
,select_active_function( active_source_hpib_addr );
--------
"TEST SET"
[cmd_test_set_addr
,select_active_function( active_testset_hpib_addr );
--------
"PLOTTER"
[cmd_plotter_addr
,select_active_function( active_plotter_hpib_addr );
--------
"PRINTER"
[cmd_printer_addr
,select_active_function( active_printer_hpib_addr );
--------
"AUTO CMD"
[cmd_auto_cmd_addr
,select_active_function( active_ch_cmd_hpib_addr );
--------
"PASS-THRU"
[cmd_pass_thru_addr
,select_active_function( active_pass_thru_hpib_addr );
--------
```

```
*EJECT*******
.SERVICE_MENU
--------

--------
sk_bracket_3
half_vt+"PEEK"
[cmd_peek
,select_active_function( active_peek );
--------
"POKE"
[cmd_poke
,select_active_function( active_poke );
--------
"LOCATION"
[cmd_peek_poke_addr
,select_active_function( active_address );
--------
"IF GAIN"
^IF_GAIN_MENU
[cmd_if_gain_menu
--------
"SOFTWARE"
"REVISION"
[cmd_revision
,select_active_function( active_revision );
--------

--------
"TEST MENU"
[cmd_test_menu
,BEGIN
,   trap_15_type := service_trap;
,   TRAP(15);
,END;
--------

#

Ocndcase.work.L

[cmd_illegal
,warn(invalid_command);
;
; The following commands MUST be contiguous!
; Do NOT insert commands in between (for the parser's sake)
;
[cmd_enter
,keypad_entry(e0);
[cmd_u1
,keypad_entry(e0);
[cmd_u2
,keypad_entry(e3);
[cmd_u3
,keypad_entry(e6);
[cmd_u4
```

```
,keypad_entry(e9);
;
; END of contiguous command entries
;
[cmd_mkrval
,marker_value_entry;
[cmd_up
,step_entry(step_up);
[cmd_down
,step_entry(step_down);
[cmd_entry_off
,select_active_function(active_off);
[cmd_save
,gen_save_menu(5);
[cmd_save_1
,save( 1 );
[cmd_save_2
,save( 2 );
[cmd_save_3
,save( 3 );
[cmd_save_4
,save( 4 );
[cmd_save_5
,save( 5 );
[cmd_recall
,gen_save_menu(6);
[cmd_recall_1
,recall( 1 );
[cmd_recall_2
,recall( 2 );
[cmd_recall_3
,recall( 3 );
[cmd_recall_4
,recall( 4 );
[cmd_recall_5
,recall( 5 );
[cmd_recall_last
,recall( 8 );
[cmd_tape_menu
,gen_menu(TAPE_MENU, 0);
[cmd_copy
,gen_menu(COPY_MENU, 0);
[cmd_doc
,warn(command_not_implemented);
[cmd_quote
,select_active_function(active_off);
[cmd_label
,select_active_function(active_off);
[cmd_key_1
,process_softkey(1);
[cmd_key_2
,process_softkey(2);
[cmd_key_3
,process_softkey(3);
[cmd_key_4
,process_softkey(4);
```

```
[cmd_key_5
,process_softkey(5);
[cmd_key_6
,process_softkey(6);
[cmd_key_7
,process_softkey(7);
[cmd_key_8
,process_softkey(8);
[cmd_ch1
,select_entry_ch(1);
[cmd_s11
,BEGIN & s11 &
,   hilight_off( cmd_z1, cmd_user4);
,   new_parameter(s11);
,END;  & s11 &
[cmd_s12
,BEGIN & s12 &
,   hilight_off( cmd_z1, cmd_user4);
,   new_parameter(s12);
,END;  & s12 &
[cmd_s21
,BEGIN & s21 &
,   hilight_off( cmd_z1, cmd_user4);
,   new_parameter(s21);
,END;  & s21 &
[cmd_s22
,BEGIN & s22 &
,   hilight_off( cmd_z1, cmd_user4);
,   new_parameter(s22);
,END;  & s22 &
[cmd_mag
,new_format( fmt_log_mag );
[cmd_phase
,new_format( fmt_phase );
[cmd_ch2
,select_entry_ch(2);
[cmd_delay
,new_format( fmt_delay );
[cmd_polar
,new_format( fmt_z_smith );
[cmd_param_menu
,gen_menu(PARAM_MENU, 0);
[cmd_format_menu
,gen_menu(FORMAT_MENU, 0);
[cmd_preset
,recall_preset_state;
[cmd_local
,gen_menu(HPIB_MENU, 1);
[cmd_scale
,select_active_function(active_scale);
[cmd_ref_value
,select_active_function(active_ref_value);
[cmd_start
,select_active_stimulus(active_start);
[cmd_stop
,select_active_stimulus(active_stop);
```

SKINFO2.WORK.PD8510 THU, DEC 22, 1983, 10:42 AM PAGE 78

```
[cmd_ref_position
,select_active_function(active_ref_pos);
[cmd_auto_scale
,auto_scale;
[cmd_center
,select_active_stimulus(active_center);
[cmd_span
,select_active_stimulus(active_span);
[cmd_response_menu
,gen_menu(RESPONSE_MENU, 0);
[cmd_stimulus_menu
,gen_menu(STIMULUS_MENU, 0);
[cmd_cal_menu
,gen_menu(CAL_MENU, 0);
[cmd_display_menu
,gen_menu(DISPLAY_MENU, 0);
[cmd_marker_menu
,BEGIN
,   select_marker( active_marker );
,   gen_menu(MARKER_MENU, 0);
,END;
[cmd_system_menu
,gen_menu(SYSTEM_MENU, 0);
[cmd_prior_menu
,previous_menu;
[cmd_measurement_restart
,measurement_restart;
[cmd_domain_menu
,gen_menu(DOMAIN_MENU, 0);
[cmd_abort_command
,abort_command := TRUE;
[cmd_input_data
,pub_ib_input_select( data_input );
[cmd_input_formatted
,pub_ib_input_select( formatted_input );
[cmd_input_raw1
,pub_ib_input_select( raw1_input );
[cmd_input_raw2
,pub_ib_input_select( raw2_input );
[cmd_input_raw3
,pub_ib_input_select( raw3_input );
[cmd_input_raw4
,pub_ib_input_select( raw4_input );
[cmd_input_cal_coeff1
,pub_ib_input_select( cal_coeff1_input );
[cmd_input_cal_coeff2
,pub_ib_input_select( cal_coeff2_input );
[cmd_input_cal_coeff3
,pub_ib_input_select( cal_coeff3_input );
[cmd_input_cal_coeff4
,pub_ib_input_select( cal_coeff4_input );
[cmd_input_cal_coeff5
,pub_ib_input_select( cal_coeff5_input );
[cmd_input_cal_coeff6
,pub_ib_input_select( cal_coeff6_input );
[cmd_input_cal_coeff7
```

SKINFO2.WORK.PD8510 THU, DEC 22, 1983, 10:42 AM PAGE 79

```
,pub_ib_input_select( cal_coeff7_input );
[cmd_input_cal_coeff8
,pub_ib_input_select( cal_coeff8_input );
[cmd_input_cal_coeff9
,pub_ib_input_select( cal_coeff9_input );
[cmd_input_cal_coeff10
,pub_ib_input_select( cal_coeff10_input );
[cmd_input_cal_coeff11
,pub_ib_input_select( cal_coeff11_input );
[cmd_input_cal_coeff12
,pub_ib_input_select( cal_coeff12_input );
[cmd_block_a
,pub_ib_input;
[cmd_output_formatted
,pub_ib_output_select( formatted_output );
[cmd_output_active
,pub_ib_output_select( active_output );
[cmd_output_marker
,pub_ib_output_select( marker_output );
[cmd_output_status
,pub_ib_output_select( status_output );
[cmd_output_id
,pub_ib_output_select( id_output );
[cmd_output_data
,pub_ib_output_select( data_output );
[cmd_output_raw1
,pub_ib_output_select( raw1_output );
[cmd_output_raw2
,pub_ib_output_select( raw2_output );
[cmd_output_raw3
,pub_ib_output_select( raw3_output );
[cmd_output_raw4
,pub_ib_output_select( raw4_output );
[cmd_output_cal_coeff1
,pub_ib_output_select( cal_coeff1_output );
[cmd_output_cal_coeff2
,pub_ib_output_select( cal_coeff2_output );
[cmd_output_cal_coeff3
,pub_ib_output_select( cal_coeff3_output );
[cmd_output_cal_coeff4
,pub_ib_output_select( cal_coeff4_output );
[cmd_output_cal_coeff5
,pub_ib_output_select( cal_coeff5_output );
[cmd_output_cal_coeff6
,pub_ib_output_select( cal_coeff6_output );
[cmd_output_cal_coeff7
,pub_ib_output_select( cal_coeff7_output );
[cmd_output_cal_coeff8
,pub_ib_output_select( cal_coeff8_output );
[cmd_output_cal_coeff9
,pub_ib_output_select( cal_coeff9_output );
[cmd_output_cal_coeff10
,pub_ib_output_select( cal_coeff10_output );
[cmd_output_cal_coeff11
,pub_ib_output_select( cal_coeff11_output );
[cmd_output_cal_coeff12
```

SKINFO2.WORK.PD8510 THU, DEC 22, 1983, 10:42 AM PAGE 80

```
,pub_ib_output_select( cal_coeff12_output );
[cmd_output_memory
,pub_ib_output_select( memory_output );
[cmd_output_error
,pub_ib_output_select( error_output );
[cmd_hpib_talk
,pub_ib_output;
[cmd_srq_mask
,select_active_function( active_srq_mask_primary );
[cmd_clear_status
,clear_serial_poll;
[cmd_xfer_binary
,pub_ib_format_select( output_binary);
[cmd_xfer_ascii
,pub_ib_format_select( output_ascii);
[cmd_xfer_ieee2
,pub_ib_format_select( output_ieee_double);
[cmd_xfer_ieee1
,pub_ib_format_select( output_ieee_single);
[cmd_keycode
,select_active_function( active_keycode );
[cmd_pass_source
,pass_thru_option (source);
[cmd_pass_testset
,pass_thru_option (test_set);
[cmd_pass_plotter
,pass_thru_option (plotter);
[cmd_pass_display
,pass_thru_option (user_display_graphics);
[cmd_output_plot
,pub_ib_output_select (plot_output);
[cmd_monitor
,BEGIN
,   trap_15_type := normal_trap_15;
,   TRAP(15);
,END;
```

JLIBRARY.WORK.PD8510 THU, DEC 22, 1983, 10:42 AM PAGE 1

```
!JOB JLIBRARY,LIBRN.PD8510,WORK;PRI=CS;OUTCLASS=,1
!COMMENT  COMPILE AND ASSEMBLY JOB FOR 8510 MC68000 LIBRARY
!COMMENT     IT DIFFERS FROM LYNN WHEELWRIGHT'S LIBRARAY
!COMMENT     BECAUSE OF HARDWARE MULTIPLER AND REDUCE BCD TYPES (NO 6,7)
!COMMENT     ALSO THE G MODE ADDRESS IS CHANGED
!COMMENT
!COMMENT
!COMMENT ************ CHANGES *********************
!COMMENT
!COMMENT
!COMMENT ALL OF TYPE 6,7 AND  8 REMOVED --ALL BCDS,BCD, BCDL
!COMMENT  REMOVED MBCD6,MBCD7,MBCDXN,MCNV46,MCNV78,MCNV82,MDIGIT7,MOSFT8
!COMMENT           MBCD8
!COMMENT
!COMMENT REPLACED LYNN'S MCMPLX -- BECAUSE OF HARDWARE MULT
!COMMENT
!COMMENT QUAD INTEGER DATA TYPE INCLUDE
!COMMENT
!COMMENT ALSO CHANGED ARE MFLPT ,MPY3  -- BOTH IN AFLPT
!COMMENT              AGAIN FOR THE CHANGED BECAUSE OF HARDWARE MULT
!COMMENT
!COMMENT  ENTRY POINT LDR2G (IN DIV3)
!COMMENT     CHANGED BECAUSE 8510 G MODE IS DIFFERENT FROM LYNN'S
!COMMENT     THIS SHOULD BE THE ONLY G MODE ENTRY POINTS LEFT
!COMMENT
!COMMENT
!COMMENT   USED WITH NO CHANGE MCASE,MSORT
!COMMENT
!COMMENT
!BUILD AMATHFUN;DISC=31,32,1;REC=-1276,,V,ASCII;TEMP
!BUILD ATERMtmp;DISC=31,32,1;REC=-1276,,V,ASCII;TEMP
!BUILD ASTRtemp;DISC=31,32,1;REC=-1276,,V,ASCII;TEMP
!BUILD ACNV9Xtp;DISC=31,32,1;REC=-1276,,V,ASCII;TEMP
!BUILD AKERNELt;DISC=31,32,1;REC=-1276,,V,ASCII;TEMP
!BUILD AFIFOtmp;DISC=31,32,1;REC=-1276,,V,ASCII;TEMP
!BUILD ADISPLAY;DISC=31,32,1;REC=-1276,,V,ASCII;TEMP
!BUILD AINTRPTt;DISC=31,32,1;REC=-1276,,V,ASCII;TEMP
!FILE M68DLLR=M68KDLLR.M68K.UPSOFT
!COM68K smathfun.work     ,AMATHFUN,$NULL,17
!COM68K sterm.work        ,ATERMtmp,$NULL,17
!COM68K scnv9x.work       ,ACNV9Xtp,$NULL,17
!COM68K skernel.work      ,AKERNELt,$NULL,17
!COM68K sfifo.work        ,AFIFOtmp,$NULL,17
!COM68K sdisplay.work     ,ADISPLAY,$NULL,17
!COM68K sintrpt.work      ,AINTRPTt,$NULL,17
!COMMENT *********** compile section finished ***************************
!TELL LIBRN .PD8510; 1/2 M68LIB UPDATE COMPLETE
!TELL JTB.PD8510;    1/2 M68LIB UPDATE COMPLETE
!FILE rtemp=$NEWPASS;DISC=31,32,1
!FILE TREETEXT=*rtemp
!FILE TREELIST=$NULL
!RUN ASM68K.M68K.UPSOFT;PARM=O
AMATHFUN
ACPX.work
AFLT.work
```

```
JLIBRARY.WORK.PD8510              THU, DEC 22, 1983, 10:42 AM     PAGE  2

AQUAD.work
ADIV3.work
ASQRT.work
ACASE.work
ADISPRAM.work
AKERNELt
AFIFOtmp
ADISPLAY
AINTRPTt
ASTRING.work
ACMV9Xtp
AFMT.work
ATERMtmp
/E
!PURGE rlibrary.work
!SAVE $OLDPASS,rlibrary.work
!TELL LIBRN .PD8510; M68LIB UPDATE COMPLETE
!TELL LANI.PD8510;   M68LIB UPDATE COMPLETE
!TELL JTB.PD8510;    M68LIB UPDATE COMPLETE
!TELL WCC.PD8510;    M68LIB UPDATE COMPLETE
!EOJ
```

```
JLINK.WORK.PD8510              THU, DEC 22, 1983, 10:42 AM     PAGE  2

!file edsufile=loadmap
!file edprfile=uloadsrt.work.pd8510
!continue
!ed
!continue
!sort
input loadsort
output j68sort2
key 13,6
end
!eod
!purge loadsort
!rename j68sort2,loadsort
!
!message "============================== done ======================"
!tell librn.pd8510; ============ link sort done ======================
!tell wcc.pd8510; ============== link sort done ======================
!tell jtb.pd8510; ============== link sort done ======================
!tell lani.pd8510; ============= link sort done ======================
!showtime
!continue
!eoj
```

```
JLINK.WORK.PD8510              THU, DEC 22, 1983, 10:42 AM     PAGE  1

!job link,librn.pd8510,work;pri=CS;outclass=,1
!showtime
!setjcw j68error,0
!
!purge j68temp.work
!continue
!purge ombmold
!continue
!copy ombmload,ombmold,new
!setjcw jcw,0
!message "MBMLOAD"
!continue
!link68k ombmload,lmbmload.work,mmbmload,45
!if jcw<>0 then
!  setjcw j68error,1
!  endif
!continue
!protect ombmload.work
!continue
!protect mmbmload.work
!
!continue
!purge objold
!continue
!copy obj,objold,new
!continue
!setjcw jcw,0
!message "MAIN "
!continue
!link68k obj,lmain.work,loadmap,45
!if jcw<>0 then
!  setjcw j68error,1
!  endif
!continue
!protect obj
!continue
!protect loadmap
!
!if j68error=0 then
!  message "========================== link done ===================="
!  tell librn.pd8510; ================= link done ====================
!  tell wcc.pd8510; =================== link done ====================
!  tell jtb.pd8510; =================== link done ====================
!  tell lani.pd8510; ================== link done ====================
!else
!  message "========================== link failed =================="
!  tell librn.pd8510; ================= link failed ==================
!  tell wcc.pd8510; =================== link failed ==================
!  tell jtb.pd8510; =================== link failed ==================
!  tell lani.pd8510; ================== link failed ==================
!  run hpmail.hpmail.sys;lib=g;stdin=hpmail2.work.pd8510
!  showjcw
!  endif
!
!purge j68sort2
```

```
ULOADSRT.WORK.PD8510              THU, DEC 22, 1983, 10:42 AM     PAGE  1

1,/\$DATE\$/-1,d
/^ *$/,$d
1,$s/^ *//
1,$s/............[0-9A-F]{6,6}../&\n/g
g/^ *$/d
1,$s/^ *//
w loadsort
"SORT
"
"INPUT loadsort
"OUTPUT loadsort
"KEY 13,6
"END
"
q
```

```
SLOADSUM.WORK.PD8510          THU, DEC 22, 1983, 10:42 AM      PAGE   1

$LIST OFF$
$USLINIT$
$STANDARD_LEVEL 'HP3000'$

PROGRAM loadmap_summary(input,output);

CONST
   ff = ' ';                                          {ASCII form-feed}

VAR
   line : STRING[132];
   hex_line : STRING[10];
   done,break1,break2 : boolean;
   mark,number1,number2,number3,number4,number5,number6 : integer;
   number0 : integer;

BEGIN {loadmap_summary}
   reset(input, 'INPUT', 'SHARED');
   rewrite(output, 'OUTPUT', 'NOCCTL');

   number0 := 0;
   number1 := 0;
   number2 := 0;
   number3 := 0;
   number4 := 0;
   number5 := 0;
   number6 := 0;

   WHILE NOT eof(input) DO
      BEGIN {while}
         break1 := false;
         break2 := false;

         readln(input,line);
         WHILE ( eoln(input) AND NOT eof(input) ) DO
                                      { readln gobbles up empty lines }
            BEGIN {while}             { so handle them here.          }
               writeln(output);
               readln(input);
            END;  {while}
         line := strrtrim(line);
         IF ( (strlen(line) > 8) AND
              (str(line,1,1)=' ') AND
              (str(line,2,1)<>' ') AND
              (str(line,7,1)=' ') AND
              ( (str(line,8,1)='0') OR
                (str(line,8,1)='1') OR
                (str(line,8,1)='F')
              )
            ) THEN
            BEGIN {if}
               writeln(output,line);                   {file name}
               write(output, '     ' );
               strdelete(line,1,7);
```

```
SLOADSUM.WORK.PD8510          THU, DEC 22, 1983, 10:42 AM      PAGE   2

               line := strltrim(line);                       {1st number}
               mark := strpos(line,' ');
               hex_line := strltrim(strrtrim( str(line,1,mark-1) ));
               number1 := hex(hex_line);
               strdelete(line,1,mark);

               IF (number1 <> number2) THEN
                  break1 := true;

               line := strltrim(line);                       {2nd number}
               mark := strpos(line,' ');
               hex_line := strltrim(strrtrim( str(line,1,mark-1) ));
               number2 := hex(hex_line);
               write(output, (number2-number1):10 );
               IF break1 THEN
                  write(output, '***new***  ')
               ELSE
                  write(output, '           ');
               strdelete(line,1,mark);

               line := strltrim(line);                       {3rd number}
               mark := strpos(line,' ');
               hex_line := strltrim(strrtrim( str(line,1,mark-1) ));
               number3 := hex(hex_line);
               strdelete(line,1,mark);

               IF (number3 <> number4) THEN
                  break2 := true;

               line := strltrim(line);                       {4th number}
               mark := strpos(line,' ');
               hex_line := strltrim(strrtrim( str(line,1,mark-1) ));
               number4 := hex(hex_line);
               write(output, (number4-number3):10 );
               IF break2 THEN
                  write(output, '***new***  ')
               ELSE
                  write(output, '           ');
               strdelete(line,1,mark);

               number0 := number5;
               line := strltrim(line);                       {5th number}
               mark := strpos(line,' ');
               hex_line := strltrim(strrtrim( str(line,1,mark-1) ));
               number5 := hex(hex_line);
               strdelete(line,1,mark);

               hex_line := strltrim(strrtrim( line ));       {6th number}
               number6 := hex(hex_line);
               write(output, (number6-number5):10 );
               IF (number0 <> number6) THEN
                  write(output, '***new***');

               writeln(output);
            END   {if}
         ELSE IF ( (strlen(line) > 7) AND
```

```
SLOADSUM.WORK.PD8510          THU, DEC 22, 1983, 10:42 AM      PAGE   3

                   (str(line,2,6) = '$DATE$')
                 ) THEN
            BEGIN {else if}
               REPEAT
                  readln(input,line)
               UNTIL ( (strlen(line) > 7) AND
                       (str(line,2,6) = 'KSPMAX')
                     );
               writeln(output,line);
            END   {else if}
         ELSE
            writeln(output,line);
      END;  {while}

END.  {loadmap_summary}
```

```
FLOWPLUS.WORK.PD8510          THU, DEC 22, 1983, 10:42 AM      PAGE   1

EXTERNAL INTEGER TABLE priv_ib_lun_table.L;
```

```
SLUNPLUS.WORK.PD8510              THU, DEC 22, 1983, 10:42 AM      PAGE   1

M68KL,P,"lunplus"
BEGIN

#FILE cdguser.work;                    & for user display address constant &

COMMENT  This table contains the private hpib addresses by logical
         unit, and several additional items that pertain to the entire
         instrument, not to any save/recall or instrument preset state.
         ;
GLOBAL INTEGER TABLE priv_ib_lun_table :=        & indexed by priv_ib lun &
   &  0 not used       &  31,                    & declared in CPRIVIB,   &
   &  1 source         &  19,
   &  2 test_set       &  20,
   &  3 plotter        &   5,
   &  4 printer        &   1,
   &  5 priv_ib_pass   &  31,
   &  6 source_2       &  19,
   &  7 test_set_2     &  20,
   &  8 lo_source      &  31,
   &  9 lo_source_2    &  31,
   & 10 user_device_1  &  31,
   & 11 user_device_2  &  31,

   & 12 - 15 fill      &  31, 31, 31, 31,

   & all actual private hp-ib addresses must have lun's <= 15 &

   & 16 major address  &  16,
   & 17 minor address  &  24,

   & 18 - 31 fill      &  31,31,31,31,31,31,31,31,31,31,31,31,31,

   & 31 user display   &  user_display_address;

   & MUST be 32 words (64 bytes) long -- one bubble block &

END$
```

```
LMAIN.WORK.PD8510                 THU, DEC 22, 1983, 10:43 AM      PAGE   1

&  page 0 code begins here -- 000000/FE0000 to 007FFF/FE7FFF  &
&   ( 16-bit addressable )                                     &
rmain.work,
rlibrary.work,
ractive.work,
ractv0.work,
ractv2.work,      & has long declarations -- EXTERNAL.L &
rchtable.work,
rstimuli.work,
rcontvar.work,
rxmbn.work,
rxtaco.work,
rsize.work,
rformat.work,
rdomain.work,     & has long declarations -- EXTERNAL.L &
rretrace.work,    & has long declarations -- EXTERNAL.L &
rmark0.work, & MUST BE LAST ITEM IN PAGE 0 &
&   page 1 code begins here -- 008000/FE8000 to 00FFFF/FEFFFF  &
&   ( requires long address )             ( runs up to stack )  &
rdatap.work,
riolib.work,      &       topmisc, uart, topkbd, botkbd, rpg, bot       &
routput.work,
rcmds.work,
rcontrol.work,
rparser.work,
rscreen.work,
rscreen2.work,
rpubib.work,
rparmtbl.work,
routib.work,
rtrace2.work,
rgratic.work,
rbreak.work,
ryadc.work,
rcompute.work,
rcorrect.work,
rdtmgr.work,
rcal.work,
rcal0.work,
rpfr.work,
rtestset.work,
rtime.work,
rcouple.work,
rdguser.work,
rannot.work,
rxadc.work,
rarray.work,
rcircle.work,
rrecall.work,
rstds.work,
rrespons.work,
rcommand.work,
rifgain.work,
rparam.work,
rdelay.work,
```

```
LMAIN.WORK.PD8510                 THU, DEC 22, 1983, 10:43 AM      PAGE   2

rmark1.work,         & MUST BE LAST ITEM IN PAGE 1 &
&   page 3 code begins here -- 018000/FF8000 to 01FFFF/FFFFFF  &
&   ( 16-bit addressable )     ( runs into RAM -- global data ) &
rtpmgr.work,
rmenmgr.work,
rmbmgr.work,
rmenu.work,
rprivib.work,
rstimul2.work,
rstimul3.work,
rutil.work,
rfft.work,
racttbl.work,
rtrigtbl.work,
raverage.work,   & has long declarations -- EXTERNAL.L &
rfstmath.work,   & has long declarations -- EXTERNAL.L &
rmarker.work,    & has long declarations -- EXTERNAL.L &
rmark3.work, & MUST BE LAST ITEM IN PAGE 3 &
&   d.g. page begins here ---- 108000/F08000 to 120000/F20000  &
&   BEWARE of modules here using fchdata, fchdata2, or fchpfr. &
&          Reading is o.k., but writing is prohibited from d.g.&
rtitle.work,
rsystem.work,
rmarks.work,
rplot.work,
rdisptbl.work,
rtrace.work,
rmarkdg.work,    &---\  Nothing before this should exceed %109800     &
ralphas.work,    &   |                                                &
ralabel.work,    &   |                                                &
ratables.work,   &   |                                                &
rmathtbl.work,   &   |                                                &
rskey.work,      &   \  These must all be grouped identically with    &
rskpos.work,     &   /  lmbnload.                                     &
rkeys.work,      &   |                                                &
ribtree.work,    &   |                                                &
rcpltbl.work,    &   |                                                &
rdgtop.work,     &*  |                                                &
rchdata.work,    &   |    must be NOLOAD below                        &
rlunplus.work,   &   |    must be NOLOAD below                        &
rmarkmen.work,   &   |                                                &
rstack.work,     & --/                                                &
/E
ROM=100H RAM=FFFFF800H;  & system 0 to 100, I/0 FFF800 to FFFFFF  &
datap:  MAIN=00008000H;  & bottom of page 1 (needs long address)  &
TPMGR:  MAIN=FFFF8000H;  & page 3 &
title:  MAIN=FFF08000H;  & dg (long addr) &
markd:  MAIN=FFF09800H;
alpha:  NOLOAD;
alabe:  NOLOAD;
atabl:  NOLOAD;
matht:  NOLOAD;
skey:   NOLOAD;
skpos:  NOLOAD;
keys:   NOLOAD;
ibtre:  NOLOAD;
```

```
LMAIN.WORK.PD8510                 THU, DEC 22, 1983, 10:43 AM      PAGE   3

cpltb:  NOLOAD;
chdat:  NOLOAD;
lunpl:  NOLOAD;
markm:  RAM=FFF20000H;     & just RAM reservation. display address &
stack:  RAM=FFFF8000H;
```

```
SMAIN.WORK.PD8510              THU, DEC 22, 1983, 10:43 AM      PAGE   1

M68KL,"main"
BEGIN

GLOBAL INTEGER TABLE sup_gn := %800;  &non is %800       JTB        DEBUG&
                                       %

#FILE finit.work;
#FILE cids.work;
#FILE fintrpt.work;
#FILE fkernel.work;
#FILE fkernel2.work;
#FILE fkernel4.work;
#FILE fparser.work;
#FILE crins.work;
#FILE ffifo.work;
#FILE fdatap.work;
#FILE cchtable.work;                                          & for max_ch &
#FILE fcontvar.work;
#FILE fcontrol.work;
#FILE fpubib.work;
#FILE foutib.work;
#FILE fmarker.work;
#FILE fmemmgr.work;
#FILE fmbmgr.work;
#FILE cmessage.work;
#FILE farray.work;
#FILE fprivib2.work;
#FILE fcommand.work;
#FILE factive2.work;
#FILE fchtab3.work;
#FILE frecall.work;                                      & for recall_type &

   PROCEDURE  bottom_box;                                      EXTERNAL.L;
   PROCEDURE  top_key;                                         EXTERNAL.L;
   PROCEDURE  uart_process;                                    EXTERNAL.L;
   PROCEDURE  keyboard;                                        EXTERNAL.L;
   PROCEDURE  rpg;                                             EXTERNAL.L;
   PROCEDURE  retrace;                                         EXTERNAL.L;

   ASSEMBLE( ORI.W =H0700,SR );                     & Disable interrupts. &

   recall_type := power_on_recall;
   init_screen;                          & init_screen calls init_display &
   init_ch_table;
   init_save_recall;                      & loads DG RAM data from bubble &
   irint;
   iren( refresh_vctr);                 & enable memory refresh interrupts &
                                      & monitor set refresh vector TRAP 1&

COMMENT                  *** WARNING ***
          The following initialization routines should not do any
          more that initialize own and global variables.  They should
          not, repeat, not do anything to cause any i/o or interrupts.
          Such initialization should be postponed and performed during
          the initialization of a process.
;
```

```
SMAIN.WORK.PD8510              THU, DEC 22, 1983, 10:43 AM      PAGE   2

   init_kernel;

   signal_init( entry_string_ready, 0 );
   resource_init( entry_string );
   resource_init( active_function_rin );
   signal_init( aborted, 0 );
   resource_init( group_ready_rin );
   resource_init( memory_src);                & memory allocation resource   &
   resource_init( trace_marks );
   init_control_variables;              & control_ and processing_variables &

   init_message;
   init_array_update_fifo;
   init_keyboard_fifo;
   init_token_fifo;
   init_sup_brk_fifo;
   init_public_ib_fifo;
   init_top_misc;
   init_sup_brk_fifo;
   init_priv_ib;
   init_retrace;
   init_trig;
   init_active;
   init_gratic;
   reset_memory;                              & initialize memory allocation &

   ASSEMBLE( ANDI.W =HF8FF,SR );                     & Enable interrupts.   &

   run( create( ADRS(parser           ), %100, parser_id        ) );
   run( create( ADRS(bottom_box       ), %100, bottom_id        ) );
   run( create( ADRS(rpg              ),  %80, rpg_id           ) );
   run( create( ADRS(keyboard         ), %100, keyboard_id      ) );
   run( create( ADRS(top_key          ),  %80, top_key_id       ) );
   run( create( ADRS(uart_process     ),  %80, uart_id          ) );
   run( create( ADRS(priv_ib_srq      ), %180, priv_ib_srq_id   ) );
   run( create( ADRS(retrace          ),  %80, retrace_id       ) );
   run( create( ADRS(array_update     ), %200, array_update_id  ) );
   run( create( ADRS(control          ), %300, control_id       ) );
   run( create( ADRS(data_proc_ch1    ), %100, ch1_id           ) );
   run( create( ADRS(data_proc_ch2    ), %100, ch2_id           ) );
   run( create( ADRS(hpib_listener    ), %100, pub_ib_in_id     ) );
   run( create( ADRS(hpib_talker      ), %100, pub_ib_out_id    ) );
   run( create( ADRS(command          ), %200, command_id       ) );

idle:
      IF conditional_acquire( trace_marks ) THEN
         BEGIN & if &
            partial_update_marks;
            release( trace_marks );
         END;  & if &
      preempt;        & this preempt is necessary to schedule the data  &
                      &   processing in order to speed up and simplify  &
                      &   the sending of the raw_ready signal by the    &
                      &   yadc.                                         &
      GO TO idle;
```

```
SMAIN.WORK.PD8510              THU, DEC 22, 1983, 10:43 AM      PAGE   3

END$
```

```
SMARK0.WORK.PD8510             THU, DEC 22, 1983, 10:43 AM      PAGE   1

M68KL,P,"mark0"
BEGIN

COMMENT  This is to mark the end of page 0 program code. ;

GLOBAL LABEL mark0;

mark0:

END$
```

```
SMARK1.WORK.PD8510            THU, DEC 22, 1983, 10:43 AM     PAGE   1

M68KL,P,"mark1"
BEGIN

COMMENT  This is to mark the end of page 1 program code. ;

GLOBAL LABEL mark1;

mark1:

END$
```

```
SMARKDG.WORK.PD8510           THU, DEC 22, 1983, 10:43 AM     PAGE   1

M68KL,P,"markdg"
BEGIN

COMMENT  This is to mark the base of dg ram storage. ;

GLOBAL LABEL mark_dg_base;

mark_dg_base:

END$
```

```
SMARK3.WORK.PD8510            THU, DEC 22, 1983, 10:43 AM     PAGE   1

M68KL,P,"mark3"
BEGIN

COMMENT  This is to mark the end of page 3 program code. ;

GLOBAL LABEL mark3;

mark3:

END$
```

```
FMARKER.WORK.PD8510           THU, DEC 22, 1983, 10:43 AM     PAGE   1

#FILE fmarker2.work;

PROCEDURE  select_ref_marker( mkr );
   VALUE   mkr;
   INTEGER mkr;                                                   EXTERNAL.L;
INTEGER PROCEDURE marker_point( mkr, ch );
   VALUE   mkr, ch;
   INTEGER mkr, ch;                                               EXTERNAL.L;
USER3 PROCEDURE ch_marker_value( mkr, ch );
   VALUE   mkr, ch;
   INTEGER mkr, ch;                                               EXTERNAL.L;
USER3 PROCEDURE marker_value( mkr );
   VALUE   mkr;
   INTEGER mkr;                                                   EXTERNAL.L;
USER3 PROCEDURE ch_mkr_value(ch);
   VALUE   ch;
   INTEGER ch;                                                    EXTERNAL.L;
USER3 PROCEDURE mkr_value;                                        EXTERNAL.L;
QUAD PROCEDURE mkr_stimulus_at_pt( mkr );
   VALUE   mkr;
   INTEGER mkr;                                                   EXTERNAL.L;
QUAD PROCEDURE mkr_stimulus_value;                                EXTERNAL.L;
PROCEDURE  put_marker( mkr );
   VALUE   mkr;
   INTEGER mkr;                                                   EXTERNAL.L;
PROCEDURE  partial_update_marks;                                  EXTERNAL.L;
SUBROUTINE update_marks;                                          EXTERNAL.L;
```

```
SMARKER.WORK.PD8510            THU, DEC 22, 1983, 10:43 AM     PAGE  1

M68KL,P,"marker"
BEGIN

#FILE fannot.work;                                & for annotate_mkr_value &
#FILE cmkr.work;
#FILE factive.work;
#FILE factive2.work;
#FILE facttbl.work;
#FILE cchtable.work;
#FILE fchtable.work;
#FILE fchtab2.work;
#FILE fchdata.work;
#FILE fstimuli.work;
#FILE cdisplay.work;
#FILE fdisplay.work;
#FILE cscreen.work;
#FILE ctrace.work;
#FILE fmenu.work;
#FILE crime.work;
#FILE fkernel.work;
#FILE fmarks.work;
#FILE fcommand.work;                                   & for command_token &
#FILE cdomain.work;                           & for time_ and tdr_domain &
#FILE fdispram.work;                                   & for wrt_disp_byte &


TYPELENGTH USER3 : 6;

INTEGER CONSTANT  max_marker  := 5;
INTEGER CONSTANT  coord_mask  := %OFFF;

GLOBAL INTEGER active_marker;
INTEGER ref_marker;

INTEGER TABLE cmd_mkr :=
      cmd_marker_off,
      cmd_marker_1,
      cmd_marker_2,
      cmd_marker_3,
      cmd_marker_4,
      cmd_marker_5;

INTEGER TABLE cmd_ref_mkr :=
      cmd_no_ref_mkr,
      cmd_ref_mkr1,
      cmd_ref_mkr2,
      cmd_ref_mkr3,
      cmd_ref_mkr4,
      cmd_ref_mkr5;

ALPHA TABLE mkr_ref_off :=
      "",
      " 1 ",
      " 2 ",
```

```
SMARKER.WORK.PD8510            THU, DEC 22, 1983, 10:43 AM     PAGE  2

      " 3 ",
      " 4 ",
      " 5 ";

ALPHA TABLE mkr_ref_on :=
      "",
      delta_char+" REF = 1 ",
      delta_char+" REF = 2 ",
      delta_char+" REF = 3 ",
      delta_char+" REF = 4 ",
      delta_char+" REF = 5 ";

BYTE TABLE mkr_ref_suffix :=
      ' , ' , ' , ' ,                    & 0  no ref marker &
      blink_on, '-, '1, blink_off,       & 4  ref marker 1 &
      blink_on, '-, '2, blink_off,       & 8  ref marker 2 &
      blink_on, '-, '3, blink_off,       & 12 ref marker 3 &
      blink_on, '-, '4, blink_off,       & 16 ref marker 4 &
      blink_on, '-, '5, blink_off;       & 20 ref marker 5 &

INTEGER TABLE active_mkr :=
      0, & unused &
      active_marker1,
      active_marker2,
      active_marker3,
      active_marker4,
      active_marker5;
INTEGER TABLE ch_marker :=
      0, & unused &
      ch_marker1,
      ch_marker2,
      ch_marker3,
      ch_marker4,
      ch_marker5,
      ch_gate_start,
      ch_gate_center,
      ch_gate_stop;
INTEGER TABLE mkr_position :=
      mkr11_position,
      mkr21_position,
      mkr12_position,
      mkr22_position,
      mkr13_position,
      mkr23_position,
      mkr14_position,
      mkr24_position,
      mkr15_position,
      mkr25_position,
      mkr16_position,  & gate start &
      mkr26_position,
      mkr17_position,  & gate center &
      mkr27_position,
      mkr18_position,  & gate stop &
      mkr28_position;
INTEGER TABLE mkr_display :=
      mkr11_display,
```

```
SMARKER.WORK.PD8510            THU, DEC 22, 1983, 10:43 AM     PAGE  3

      mkr21_display,
      mkr12_display,
      mkr22_display,
      mkr13_display,
      mkr23_display,
      mkr14_display,
      mkr24_display,
      mkr15_display,
      mkr25_display,
      mkr16_display,  & gate start &
      mkr26_display,
      mkr17_display,  & gate center &
      mkr27_display,
      mkr18_display,  & gate stop &
      mkr28_display;
```

```
SMARKER.WORK.PD8510            THU, DEC 22, 1983, 10:43 AM     PAGE  4

#EJECT;
COMMENT                                                    marker_on_if_not
*****************************************************************************
*
*****************************************************************************
;
SUBROUTINE marker_on_if_not;
   BEGIN & marker_on_if_not &
      IF (marker_state AND %003E) = 0 THEN         & no markers were on &
         BEGIN & if &              & keep same as select_marker sequence &
            hilight_key( cmd_mkr[active_marker],
                         cmd_marker_1,
                         cmd_marker_off
                       );
            marker_state := SBIT( marker_state, active_marker );
            IF ref_marker <> 0 THEN      & display reference marker too &
               marker_state := SBIT( marker_state, ref_marker );
         END;  & if &
   END;  & marker_on_if_not &
```

```
SMARKER.WORK.PD8510          THU, DEC 22, 1983, 10:43 AM     PAGE   5

#EJECT;
COMMENT                                                         select_marker
*****************************************************************************
*
*****************************************************************************
;
PROCEDURE  select_marker( mkr );
   VALUE   mkr;
   INTEGER mkr;                                                        ENTRY;
   BEGIN & select_marker &
      hilight_key( cmd_mkr[mkr], cmd_marker_1, cmd_marker_off );
      IF mkr = 0 THEN
         BEGIN & if &
            marker_state := marker_state AND %FFC1; & turn off markers &
            IF (  (active_function >= active_marker1) AND
                  (active_function <= active_marker5)
               ) THEN           & turn off active function annotations &
               select_active_function( active_off );
         END   & if &
      ELSE & marker <> 0 &
         BEGIN & else &                       & also in marker_on_if_not &
            active_marker := mkr;
            marker_state := SBIT( marker_state, mkr );
            IF ref_marker <> 0 THEN     & display reference marker too &
               marker_state := SBIT( marker_state, ref_marker );
            select_active_function( active_mkr[mkr] );
         END;  & else &
   END;  & select_marker &
```

```
SMARKER.WORK.PD8510          THU, DEC 22, 1983, 10:43 AM     PAGE   6

#EJECT;
COMMENT                                                     select_ref_marker
*****************************************************************************
*
*****************************************************************************
;
PROCEDURE  select_ref_marker( mkr );
   VALUE   mkr;
   INTEGER mkr;                                                        ENTRY;
   BEGIN & select_ref_marker &
      INTEGER i,
              j;
      ALPHA   active_label;
      BYTE POINTER active_array = active_label;
      BYTE POINTER ref_label;

      IF ref_marker <> 0 THEN      & erase delta_char from old ref mkr &
         change_softkey( mkr_ref_off[ref_marker],
                         cmd_mkr[ref_marker],
                         IF ref_marker=1 THEN 2 ELSE 1
                       );
      IF mkr <> 0 THEN                   & add delta_char to new ref mkr &
         change_softkey( mkr_ref_on[mkr],
                         cmd_mkr[mkr],
                         IF mkr=1 THEN 2 ELSE 1
                       );

      & add "-M" suffix to the active function annotation &
      STPNTR( ref_label, ADRS( mkr_ref_suffix[ ALEFT(mkr,2) ] ) );
      FOR i := active_marker1 UNTIL active_marker5 DO
         BEGIN & for &
            active_label := active_function_label[i];
            FOR j := 0 UNTIL 3 DO
               wrt_disp_byte( ADRS(active_array[j+9]), ref_label[j] );
         END;  & for &
      ref_marker := mkr;

      hilight_key( cmd_ref_mkr[mkr], cmd_ref_mkr1, cmd_no_ref_mkr );

      IF mkr = 0 THEN                     & turn off delta marker mode &
         select_active_function( active_previous )       & new status &
      ELSE IF (marker_state AND %003E) = 0 THEN       & no marker is on &
         select_marker( mkr )
      ELSE
         BEGIN & else &
            select_active_function( active_mkr[active_marker] );
            marker_state := SBIT( marker_state, mkr );
         END;  & else &

      previous_menu;

   END;  & select_ref_marker &
```

```
SMARKER.WORK.PD8510          THU, DEC 22, 1983, 10:43 AM     PAGE   7

#EJECT;
COMMENT                                                          marker_point
*****************************************************************************
*
* The point number of the marker on the specified channel.
* 0 to number of points (not 0 to 800).
*
*****************************************************************************
;
INTEGER PROCEDURE marker_point( mkr, ch );
   VALUE   mkr, ch;
   INTEGER mkr, ch;                                                    ENTRY;
   BEGIN & marker_point &
      INTEGER point,
              i;

      & get point -- 0 to 800 &
      point := point_at_ch_stimulus( ch_quad(ch_marker[mkr],ch), ch );

      i := ARIGHT( step_size, 1 );                          & divide by 2 &
      point := point + i;                            & round, not truncate &
      WHILE i > 0 DO
         BEGIN & while &
            point := ARIGHT( point, 1 );                    & divide by 2 &
            i := ARIGHT(i,1);
         END;  & while &
         & faster way to do point := point_at_stimulus/step_size &
         &    since step_size is always a power of two. &

      marker_point := point;

   END;  & marker_point &
```

```
SMARKER.WORK.PD8510          THU, DEC 22, 1983, 10:43 AM     PAGE   8

#EJECT;
COMMENT                                                       ch_marker_value
*****************************************************************************
*
* value of the specified marker on the specified channel.
*
*****************************************************************************
;
USER3 PROCEDURE ch_marker_value( mkr, ch );
   VALUE   mkr, ch;
   INTEGER mkr, ch;                                                    ENTRY;
   BEGIN & ch_marker_value &
      INTEGER  index;                   & index into formatted data array &
      USER3 POINTER data_ptr;         & pointer to formatted data array &

      index := marker_point( mkr, ch );
      STPNTR( data_ptr, ch_double(ch_f_base, ch) );
COMMENT the compiler does not properly index USER3 pointers yet
      ch_marker_value := data_ptr[index];                         & DEBUG &
      STPNTR( data_ptr, ADRS(data_ptr) + 6*index );               & DEBUG &
      ch_marker_value := data_ptr;                                & DEBUG &

   END;  & ch_marker_value &
```

```
SMARKER.WORK.PD8510          THU, DEC 22, 1983, 10:43 AM     PAGE   9

#EJECT;
COMMENT                                                    marker_value
*************************************************************************
*
* value of the specified marker for the current_entry_channel
*
*************************************************************************
;
USER3 PROCEDURE marker_value( mkr );
   VALUE   mkr;
   INTEGER mkr;                                                  ENTRY;
   BEGIN & marker_value &
      marker_value := ch_marker_value( mkr, current_entry_ch );
   END;  & marker_value &
```

```
SMARKER.WORK.PD8510          THU, DEC 22, 1983, 10:43 AM     PAGE  10

#EJECT;
COMMENT                                                    ch_mkr_value
*************************************************************************
*
* value of the active marker for the specified channel.
*
*************************************************************************
;
USER3 PROCEDURE ch_mkr_value(ch);
   VALUE   ch;
   INTEGER ch;                                                   ENTRY;
   BEGIN & ch_mkr_value &
      USER3   mkr_value,
              ref_mkr_value;

      marker_on_if_not;
      mkr_value := ch_marker_value( active_marker, ch );

      IF ref_marker <> 0 THEN
         BEGIN & if &
            ref_mkr_value := ch_marker_value( ref_marker, ch );
            ASSEMBLE( MOVEM.L mkr_value,      RO-R1          ;
                      SWAP    R1                             ;
                      MOVEM.L ref_mkr_value,  R2-R3          ;
                      SWAP    R3                             ;
                      JSRX    SUBE                           ;
                      SWAP    R1                             ;
                      MOVEM.L RO-R1,          mkr_value
                    );
         END;  & if &
      ch_mkr_value := mkr_value;

   END;  & ch_mkr_value &
```

```
SMARKER.WORK.PD8510          THU, DEC 22, 1983, 10:43 AM     PAGE  11

#EJECT;
COMMENT                                                       mkr_value
*************************************************************************
*
* value of the active marker for the current_entry_ch.
*
*************************************************************************
;
USER3 PROCEDURE mkr_value;                                       ENTRY;
   BEGIN & mkr_value &
      mkr_value := ch_mkr_value( current_entry_ch );
   END;  & mkr_value &
```

```
SMARKER.WORK.PD8510          THU, DEC 22, 1983, 10:43 AM     PAGE  12

#EJECT;
COMMENT                                              mkr_stimulus_at_pt
*************************************************************************
*
* Returns stimulus value for the point nearest the marker.
*
*************************************************************************
;
QUAD PROCEDURE mkr_stimulus_at_pt( mkr );
   VALUE   mkr;
   INTEGER mkr;                                                  ENTRY;
   BEGIN & mkr_stimulus_at_pt &
      INTEGER     i,
                  point;

      point := marker_point( mkr, current_entry_ch );
      i := step_size;
      WHILE ( i := ARIGHT(i,1) ) <> 0 DO
         point := ALEFT(point,1);                 & multiply by step_size &
      mkr_stimulus_at_pt := entry_stimulus_at_point( point );

   END;  & mkr_stimulus_at_pt &
```

```
$EJECT;
COMMENT                                                 mkr_stimulus_value
**************************************************************************
*
* stimulus value of the active marker.
*
**************************************************************************
;
QUAD PROCEDURE mkr_stimulus_value;                                  ENTRY;
   BEGIN & mkr_stimulus_value &

      marker_on_if_not;

      IF ref_marker <> 0 THEN
         mkr_stimulus_value := mkr_stimulus_at_pt( active_marker )
                               - mkr_stimulus_at_pt( ref_marker )
      ELSE & ref_marker = 0 &
         mkr_stimulus_value := mkr_stimulus_at_pt( active_marker );

   END;  & mkr_stimulus_value &
```

```
$EJECT;
COMMENT                                                         put_marker
**************************************************************************
*
**************************************************************************
;
PROCEDURE put_marker( mkr );
   VALUE  mkr;                                                      ENTRY;
   INTEGER mkr;
   BEGIN & put_marker &
      INTEGER  ch,
               d_state,
               m_state,
               x_point,
               mkr_index,        & a precomputed index of [ ch, mkr ] &
               mkr_end,                               & the jump target &
               dg_x,                   & x_coordinate display contents &
               dg_y,                   & y_coordinate    "       "     &
               dg_addr,
               temp_domain;
      INTEGER POINTER dg_ptr;

      FOR ch := 1 TO max_ch DO                  & change to "1 TO 2" &
         BEGIN & for &
            d_state := ch_integer( ch_d_state, ch );
            m_state := ch_integer( ch_m_state, ch );
            mkr_index := (mkr-1)*max_ch + (ch-1);
            dg_addr := mkr_position[mkr_index];
            mkr_end := mkr_display[mkr_index] + mkr_size;

            IF ( TBIT( marker_state, mkr ) AND
                 ( (d_state = d_on) OR (m_state = m_on) )
               ) THEN
               BEGIN & if &
                  x_point := ALEFT( marker_point(mkr,ch), 1 );
                          & times two -- two coordinates / point &

                  & which trace gets the marker &
                  IF d_state = d_on THEN
                     STPNTR( dg_ptr, ch_double(ch_trace_base,ch) )
                  ELSE & memory trace only &
                     STPNTR( dg_ptr, ch_double(ch_m_trace_base,ch) );

                  dg_x := dg_ptr[ x_point ] AND coord_mask;
                  dg_y := dg_ptr[ x_point + 1 ] AND coord_mask;
                  dg_addr := move2( dg_addr, dg_x, dg_y );

                  IF ( (mkr = active_marker) AND
                       (ch = current_entry_ch)
                     ) THEN
                     dg_addr := printch(dg_addr, primary_marker)
                  ELSE IF mkr <= max_marker THEN        & normal marker &
                     dg_addr := printch( dg_addr, marker )
                  ELSE                                    & gate marker &
                     BEGIN & else &
                        temp_domain := ch_integer(ch_domain, ch);
```

```
                        IF ( (temp_domain = time_domain) OR
                             (temp_domain = tdr_domain)
                           ) THEN
                           dg_addr := printch( dg_addr, gate_marker );
                     END;  & else &

                  IF mkr <= max_marker THEN
                     BEGIN & if &
                        dg_addr := printch( dg_addr, (mkr + '0) );
                        IF ( (mkr = ref_marker) AND
                             (ch  = current_entry_ch)
                           ) THEN
                           BEGIN & if &
                              dg_addr := setattribute(dg_addr, blink);
                              dg_addr := printch(dg_addr, delta_char);
                              dg_addr := setattribute(dg_addr,blinkoff);
                           END;  & if &
                     END;  & if &

               END;  & if &
            dg_addr := jmp( dg_addr, mkr_end );
         END;  & for &

   END;  & put_marker &
```

```
$EJECT;
COMMENT                                                       update_marks
**************************************************************************
*
* update markers, sweep update mark, and first point so that they
* follow changes in the data.
*
* "partial_update_marks" has no acquire/release so that it can be called
* by process 0, the idle process.  It must call the routine only on the
* condition that no one else has acquired the resource.
*
**************************************************************************
;
PROCEDURE  partial_update_marks;                                    ENTRY;
   BEGIN & partial_update_marks &
      INTEGER mkr;

      FOR mkr := 1 TO (max_marker + 3) DO
         put_marker( mkr );
      annotate_mkr_value;
      put_update_mark;
      reset_first_point;

   END;  & partial_update_marks &


SUBROUTINE update_marks;                                            ENTRY;
   BEGIN & update_marks &
      acquire( trace_marks );
      partial_update_marks;
      release( trace_marks );
   END;  & update_marks &
```

```
SMARKER.WORK.PD8510            THU, DEC 22, 1983, 10:43 AM     PAGE  17


$EJECT;
COMMENT                                                          init_markers
*****************************************************************************
*
*****************************************************************************
;
PROCEDURE  init_markers;                                              ENTRY;
   BEGIN & init_markers &
      INTEGER mkr;

      ref_marker        := 0;
      hilight_off( cmd_delta_marker, cmd_delta_marker );
      active_marker     := 1;
      FOR mkr := 1 UNTIL 5 DO
         change_softkey( mkr_ref_off[mkr],
                         cmd_mkr[mkr],
                         IF mkr=1 THEN 2 ELSE 1
                       );
      select_marker( 0 );
   END;  & init_markers &


$FILE fmkr.work;

END$
```

```
FMARKER2.WORK.PD8510           THU, DEC 22, 1983, 10:43 AM     PAGE   1

EXTERNAL INTEGER active_marker;

PROCEDURE  select_marker( mkr );
   VALUE   mkr;
   INTEGER mkr;                                                  EXTERNAL.L;
```

```
FMARKMEM.WORK.PD8510           THU, DEC 22, 1983, 10:43 AM     PAGE   1


EXTERNAL LABEL   mark0;
EXTERNAL LABEL   mark1.L;
EXTERNAL LABEL   mark3;
EXTERNAL LABEL   memtop.L;
EXTERNAL LABEL   mark_stack.L;
EXTERNAL INTEGER membottom.L;
EXTERNAL LABEL   mark_dg_base.L;
EXTERNAL LABEL   mark_dg_top.L;
```

```
SMARKMEM.WORK.PD8510           THU, DEC 22, 1983, 10:43 AM     PAGE   1


M68KL,P,"markmem"
BEGIN
                                                                 & DEBUG &
$FILE cstds2.work;  & for cal_kit_array_size &                   & DEBUG &

COMMENT  This is to mark the space for data array allocation. ;

GLOBAL LABEL   memtop;                       & smallest available address &
GLOBAL INTEGER membottom;                    & largest  available address &
GLOBAL DOUBLE ARRAY   sine_cos[0:1024];      & sine cosine math tables &
GLOBAL BYTE ARRAY cal_kit_array[0:cal_kit_array_size-1];         & DEBUG &

memtop:

END$
```

FMARKS.WORK.PD8510 THU, DEC 22, 1983, 10:43 AM PAGE 1

```
PROCEDURE  reset_first_point;                          EXTERNAL.L;
PROCEDURE  put_update_mark;                            EXTERNAL.L;
```

SMARKS.WORK.PD8510 THU, DEC 22, 1983, 10:44 AM PAGE 1

```
M68KL,P,"marks"
BEGIN

#FILE cchtable.work;
#FILE fchtab2.work;                                  & for ch_integer &
#FILE fchtab3.work;                      & for current_acquisition_ch &
#FILE cdisplay.work;                                 & for dotted_blank &
#FILE fdisplay.work;
#FILE fdisply2.work;
#FILE fscreen.work;
#FILE fcontvar.work;               & for stepped, raw_base and raw_put &
#FILE fdatap.work;      & for "ch_dp_ptrs", time_domain, and tdr_domain &
#FILE fchdata.work;                       & for sweep_mode and step_size &
#FILE ctrace.work;                                         & for d_on &
#FILE ccal.work;                         & for correct_on and two_port &

BYTE    CONSTANT update_mark     := '^';
INTEGER CONSTANT user3_size      :=  6;

INTEGER TABLE update_mark_position :=
      update_mark1_position,
      update_mark2_position;
INTEGER TABLE update_mark_display :=
      update_mark1_display,
      update_mark2_display;
INTEGER CONSTANT  coord_mask       := %OFFF;
```

SMARKS.WORK.PD8510 THU, DEC 22, 1983, 10:44 AM PAGE 2

```
#EJECT;
COMMENT                                                  reset_first_point
**************************************************************************
*
* moves trace positioning vectors to correspond with the first point
* of the trace.  needs only be done once per trace.
* also moves channel 1 trace id mark.
*
**************************************************************************
;
PROCEDURE  reset_first_point;                                   ENTRY;
   BEGIN & reset_first_point &
      INTEGER ch,
              dg_addr,
              x,
              y,
              trace_display,
              trace_position;

      FOR ch := max_ch STEP -1 UNTIL 1 DO
         BEGIN & for &
           IF ch_integer( ch_d_state, ch ) = d_on THEN
              BEGIN & if &
                 IF ch = 1 THEN
                    BEGIN & if &
                       trace_display  := trace1_display;
                       trace_position := trace1_position;
                    END   & if &
                 ELSE & ch = 2 &
                    BEGIN & else &
                       trace_display  := trace2_display;
                       trace_position := trace2_position;
                    END;  & else &

                 dg_addr := dg_read_xy( trace_display, x, y );
                 dg_addr := move2( trace_position, x, y );
              END;  & if &

           IF ch_integer( ch_m_state, ch ) = m_on THEN
              BEGIN & if &
                 IF ch = 1 THEN
                    BEGIN & if &
                       trace_display  := trace1m_display;
                       trace_position := trace1m_position;
                    END   & if &
                 ELSE & ch = 2 &
                    BEGIN & else &
                       trace_display  := trace2m_display;
                       trace_position := trace2m_position;
                    END;  & else &

                 dg_addr := dg_read_xy( trace_display, x, y );
                 dg_addr := move2( trace_position, x, y );
              END;  & if &
         END;  & for &
```

SMARKS.WORK.PD8510 THU, DEC 22, 1983, 10:44 AM PAGE 3

```
      IF ch_integer( ch_d_state, 1 ) = d_on THEN
         BEGIN & if &
            & update channel 1 trace id mark &
            & x and y are still set from channel 1 first point reset &
            dg_addr := move2( trace_mark1_position, x, y );
         END;  & if &

   END;  & reset_first_point &
```

```
SMARKS.WORK.PD8510             THU, DEC 22, 1983, 10:44 AM      PAGE  4

#EJECT;
COMMENT                                                    put_update_mark
**************************************************************************
*
* places trace update marker on the screen during slow sweeps.
*
**************************************************************************
;
PROCEDURE  put_update_mark;                                         ENTRY;
   BEGIN & put_update_mark &
      INTEGER ch,
              param,
              domain,
              point_nmbr,
              dg_x,
              dg_y,
              dg_addr;
      DOUBLE  first_point;
      INTEGER POINTER trace_ptr;
      DOUBLE  POINTER double_ptr;

      FOR ch := 1 TO max_ch DO
         BEGIN & for &
            dg_addr := update_mark_position[ch-1];
            IF ( ( ch_integer( ch_d_state, ch ) = d_on ) AND
                 ( ( ch_real( ch_sweep_time, ch ) >= 0.5 ) OR
                   ( sweep_mode = stepped )
                 )
               ) THEN
               BEGIN & if &
                  STPNTR( double_ptr, ch_dp_ptrs[ch] );
                  first_point := ch_double( ch_d_base, ch );

                  & trace_ptr is the next point to be entered &
                  STPNTR( trace_ptr,
                          (double_ptr[dp_trace_ptr] AND ZFFF07FFE)
                        );
                  dg_x := (trace_ptr[-2] AND coord_mask) - Z0010;
                  dg_y := (trace_ptr[-1] AND coord_mask) - Z0070;
                  dg_addr := move2(dg_addr, dg_x, dg_y);
                  dg_addr := printch(dg_addr, update_mark);
               END;  & if &
            & will turn off the update mark if the sweep is fast &
            dg_addr := jmp( dg_addr,
                            update_mark_display[ch-1] + update_mark_size
                          );
         END;  & for &

      dg_addr := update_raw_position;
      ch := current_acquisition_ch;
      param := current_acquisition_param;
      domain := ch_integer(ch_domain, ch);
      IF ( ( (ch_integer(ch_correction_mode, ch) = correct_on) AND
             (ch_integer(ch_correction_type, ch) = two_port)
           )                                                         OR
           (ch_integer(ch_gating, ch) = gate_on)                     OR
```

```
SMARKS.WORK.PD8510             THU, DEC 22, 1983, 10:44 AM      PAGE  5

              (domain = tdr_domain )                                 OR
              (domain = time_domain)
           )                                                           AND
           ( ( ch_real( ch_sweep_time, ch ) >= 0.5 )                 OR
             ( sweep_mode = stepped )
           ) THEN
           BEGIN & if &
              point_nmbr := (raw_put[param] - raw_base[param])/user3_size;
              dg_x := xgrat + point_nmbr*step_size*(max_grat/800);
              dg_addr := move2(dg_addr, dg_x, ygrat);
              dg_addr := plot(dg_addr, dg_x, ygrat, dotted_blank, normal);
           END  & if &
        ELSE
           dg_addr := jmp( dg_addr,
                           update_raw_display + update_raw_size
                         );

   END;  & put_update_mark &

END$
```

```
FMATHFUN.WORK.PD8510           THU, DEC 22, 1983, 10:44 AM      PAGE  1

EXTERNAL REAL
    TwoPi,
    Pi,
    Pi2,
    Pi4,
    Pi8,
    Sqrt2,
    speed_of_light_air,
    speed_of_light;
```

```
SMATHFUN.WORK.PD8510           THU, DEC 22, 1983, 10:44 AM      PAGE  1

M68KL,P,"mathfun" BEGIN

USE REGISTER 0-6,8-11;   & becuase of use in td_window&

#FILE mpytable.work;

REAL CONSTANT
    SQ2P1:=Z4D413002,SQ2M1:=Z6A09E6FF;

                          & value ( .5 to 1 ) * 2**23  plus exponent&
GLOBAL REAL CONSTANT TwoPi:=Z6487ED03,Pi:=Z6487ED02,Pi2:=Z6487ED01,
    Pi4:=Z6487ED00,Pi8:=Z6487EDFF,Sqrt2:=Z5A827A01,
    deg_to_radians     := 1.745329252-2,
    speed_of_light_air := 2.99697@8 , & barr paper #294&
    speed_of_light     := 2.997925@8;


REAL PROCEDURE SQRT(X); VALUE X; REAL X;                        EXTERNAL;

REAL PROCEDURE COS(X); VALUE X; REAL X;                         FORWARD;
```

```
SMATHFUN.WORK.PD8510            THU, DEC 22, 1983, 10:44 AM     PAGE  2

#EJECT;
REAL PROCEDURE TENI(I); VALUE I; INTEGER I; ENTRY;
    BEGIN REAL TABLE PWR10:=1@10,1@5,1@2,10;
    INTEGER TABLE EXPN:=10,5,2,1;
    REAL POINTER PTR=REGISTER 9;
    INTEGER POINTER PTI=REGISTER 10; REAL X=REGISTER 5;
    INTEGER K=REGISTER 6;
    K:=ABS(I);
    STPNTR(PTR,ADRS(PWR10));
    STPNTR(PTI,ADRS(EXPN));
    X:=1;
    REPEAT 4 DO BEGIN
      WHILE K>=PTI DO BEGIN X:=X*PTR; K:=K-PTI; END;
      STPNTR(PTR,ADRS(PTR)+4);
      STPNTR(PTI,ADRS(PTI)+2); END;
    TENI:=IF I<0 THEN 1/X ELSE X;
    END TENI;
```

```
SMATHFUN.WORK.PD8510            THU, DEC 22, 1983, 10:44 AM     PAGE  3

#EJECT;
REAL PROCEDURE CHEBY(X,A,N,T); VALUE X,N,T;
  REAL A,X; INTEGER N,T;
  BEGIN REAL POINTER PC=REGISTER 9;
    REAL TN=REGISTER 10,TN1=REGISTER 5,TN2=REGISTER 6,TVAL=REGISTER 4;
    STPNTR(PC,ADRS(A)); TVAL:=0;
    CASE T OF BEGIN
      BEGIN TN1:=1.0; TN2:=X; X:=2*X; END;
      BEGIN TN1:=TN2:=X; X:=X*X*2*2-2; END ODD;
      BEGIN TN1:=1.0; X:=TN2:=X*X*2; X:=2*X-2; TN2:=TN2-1; END EVEN;
    END CASE;
    REPEAT N-1 DO BEGIN
      TVAL:=PC*TN2+TVAL;
      TN:=TN1; TN1:=TN2; TN2:=X*TN1-TN;
      STPNTR(PC,ADRS(PC)+4); END;
    CHEBY:=PC*TN2+TVAL;
  END CHEBY;
```

```
SMATHFUN.WORK.PD8510            THU, DEC 22, 1983, 10:44 AM     PAGE  4

#EJECT;
REAL PROCEDURE TWOX(X); VALUE X; REAL X; ENTRY;
    BEGIN BYTE XP=X+3,XPSV; REAL PX=REGISTER 5,QX=REGISTER 6;
    BOOLEAN J;
COMMENT

     x       2       2        2      2
    2  = (Q(x )+xP(x ))/(Q(x )-xP(x ))

    see COMPUTER APPROXIMATIONS by JOHN F. HART (JOHN WILEY)
    pg 102 approx 1060;

    SAVE(X); X:=ABS(X);
    XPSV:=X; X:=X-XPSV; J:=X>.5; IF J THEN X:=X-.5;
    QX:=X*X+25.03911;
    PX:=8.677839*X;
    X:=(QX+PX)/(QX-PX);
    XP:=XP+XPSV; ASSEMBLE(SPC);
    IF J THEN X:=X*Sqrt2; RESTORE(PX);
    TWOX:=IF PX<0 THEN 1/X ELSE X;
    END TWOX;


REAL PROCEDURE EXP(X); VALUE X; REAL X; ENTRY;
    EXP:=TWOX(X*1.442695);
```

```
SMATHFUN.WORK.PD8510            THU, DEC 22, 1983, 10:44 AM     PAGE  5

#EJECT;
REAL PROCEDURE SIN(X); VALUE X; REAL X; ENTRY;
  BEGIN REAL TABLE
    SINE:=.44005058,-1.95633540-2,2.49757730-4,-1.50232580-6,5.249250-9;
COMMENT
                                      k
        SIN(aX) = 2 SUMMATION (-1) J      (a)T     (X)
                                     2k+1     2k+1

   a=1 for this approximation   see HART pg113;

    IF ABS(X)>TwoPi THEN X:=X MOD TwoPi;
    IF X<0 THEN SIN:=-SIN(-X) ELSE
      IF X>Pi THEN SIN:=-SIN(X-Pi) ELSE BEGIN
        IF X>Pi2 THEN X:=Pi-X;
        SIN:=IF X>Pi4 THEN COS(Pi2-X) ELSE 2*CHEBY(X,SINE,4,1);
  END; END OF SIN;

REAL PROCEDURE COS(X); VALUE X; REAL X; ENTRY;
  BEGIN REAL TABLE COSINE:=
    .76519768,-.11490348,2.47663 90-3,-2.09383390-5,9.42234 40-8;
COMMENT
                                     k
       COS(aX) = 2 SUMMATION (-1) J   (a)T  (X)
                                   2k    2k

    a=1 for this approximation   see HART pg113;

    X:=ABS(X);
    IF X>TwoPi THEN X:=X MOD TwoPi;
    IF X>Pi THEN COS:=-COS(X-Pi) ELSE
    IF X>Pi2 THEN COS:=-COS(Pi-X) ELSE
      COS:=IF X>Pi4 THEN SIN(Pi2-X) ELSE 2*CHEBY(X,COSINE[1],3,2)+
        COSINE;
  END COSINE;
```

```
SMATHFUN.WORK.PD8510          THU, DEC 22, 1983, 10:44 AM     PAGE   6

#EJECT;
REAL PROCEDURE ATAN(X); VALUE X; REAL X; ENTRY;
  BEGIN REAL TABLE ARCTAN:=.
    0.39782473,-5.2467950-3,1.2455722@-4,-3.5201766@-6,
    1.0832870@@-7,-3.5068481@-9;

COMMENT

    ATAN(t) = pi/8 + SUM A T     (x)
                           k 2k+1

           2k+1
    A  = 2 r    /(2k+1)
     k

    r = TAN(pi/16)    x = (sqrt(2)+1)t-1 / (sqrt(2)-1)t+1

    see CHEBYSHEV METHODS IN NUMERICAL APPROXIMATION by
        MARTIN AVERY SNYDER  (PRENTICE HALL) pg 52;

    IF X<0 THEN ATAN:=-ATAN(-X) ELSE
    IF X>1 THEN ATAN:=Pi2-ATAN(1/X) ELSE
        ATAN:=Pi8+CHEBY((SQ2P1*X-1)/(SQ2M1*X+1),ARCTAN,6,1);
    END ARCTANGENT;
```

```
SMATHFUN.WORK.PD8510          THU, DEC 22, 1983, 10:44 AM     PAGE   7

#EJECT;
REAL PROCEDURE BESI(X); VALUE X; REAL X; ENTRY;
    BEGIN
      REAL TABLE BESI1:=127.73343,190.49432,82.48903,22.274819,4.0116738,
           .509493365,.047718749,3.416332@-3,1.924694@-4,8.73832@-6,
           3.26091@-7;
      REAL TABLE BESI2:=.39916585,6.278240-3,2.2511@-4,1.527878@-5,
           1.578178@-6,2.270838@-7;
      X:=ABS(X);
      BESI:=IF X<=8. THEN BESI1+CHEBY(.125*X,BESI1[1],9,2) ELSE
           (BESI2+CHEBY(8./X,BESI2[1],5,0))*EXP(X)/SQRT(X);
      END;
```

```
SMATHFUN.WORK.PD8510          THU, DEC 22, 1983, 10:44 AM     PAGE   8

#EJECT;
COMPLEX PROCEDURE exp_cmplx( val ); VALUE val; COMPLEX val; ENTRY;
   BEGIN
   COMPLEX result;
   REAL real_val    = val,     imag_val    = val    + 4;
   REAL real_result = result,  imag_result = result + 4;
   REAL temp;

   result := COMPLEX( COS( imag_val ) , SIN( imag_val ) );

   IF real_val # 0.0 &bad test ??& THEN
        BEGIN  & real part of input zero &
        temp := TWOX( 1.442695 * real_val );
        real_result := temp * real_result;
        imag_result := temp * imag_result;
        END if;
   exp_cmplx := result;
   END exp_cmplx;
```

```
SMATHFUN.WORK.PD8510          THU, DEC 22, 1983, 10:44 AM     PAGE   9

#EJECT;
REAL PROCEDURE LOG2(X); VALUE X; REAL X; ENTRY;
  BEGIN REAL TABLE LOGA:=.49875,1.2418@-3,5.5657@-6,2.9696@-8;
    REAL TABLE SCALE:=2.5,2.0,1.75,1.5;
    REAL TABLE LOGSCL:=1.321928,1.0,0.8073549,0.5849625;
    BYTE XP=X+3,XPSV; INTEGER XM=X,N;
COMMENT

    log2(t) = .5 + SUM A T     (x)
                         k 2k+1

    x = (t-sqrt(2))/(t+sqrt(2)) * (sqrt(2)+1)/(sqrt(2)-1)

    r = (2^.25 -1)/(2^.25 +1)  = 8.642723372@-2

         2k+1
    A  = r    /(2k+1)
     k

    see CHEBYSHEV METHODS IN NUMERICAL APPROXIMATION by
        MARTIN AVERY SNYDER  (PRENTICE HALL)  pg 52;

    N:=RLEFT(XM,4) AND 3;
    XPSV:=XP; XP:=0; ASSEMBLE(SPC);
    X:=X*SCALE[N];
    X:=(X-Sqrt2)/(X+Sqrt2)*5.828427;
    LOG2:=XPSV+.5-LOGSCL[N]+CHEBY(X,LOGA,4,1);
  END LOG2;

END$
```

```
SMATHFUN.WORK.PD8510            THU, DEC 22, 1983, 10:44 AM     PAGE  10

NEJECT
          save for reference or later use

REAL PROCEDURE LOG(X); VALUE X; REAL X; ENTRY;
    LOG:=LOG2(X)*.3010299;

REAL PROCEDURE LN(X); VALUE X; REAL X; ENTRY;
    LN:=LOG2(X)*.69314718;

REAL PROCEDURE TAN(X); VALUE X; REAL X; ENTRY; TAN:=SIN(X)/COS(X);

REAL PROCEDURE TENX(X); VALUE X; REAL X; ENTRY;
    TENX:=TWOX(X*3.321928);
```

```
AMATHTBL.WORK.PD8510            THU, DEC 22, 1983, 10:44 AM     PAGE   1

ASMB,R
 NAM mathtbl,7,"JTB,LANI.PD8510   9/3/82"
*******
* 33 point log_2 table -- mantissa part only
*    0 - 3 db
* Created by a PASCAL program -- smathtbl
*******
 ENT log_table
log_table    DEC  -32765
   DEC  -31311
   DEC  -29900
   DEC  -28529
   DEC  -27198
   DEC  -25903
   DEC  -24642
   DEC  -23414
   DEC  -22217
   DEC  -21050
   DEC  -19911
   DEC  -18799
   DEC  -17712
   DEC  -16650
   DEC  -15611
   DEC  -14594
   DEC  -13599
   DEC  -12624
   DEC  -11669
   DEC  -10733
   DEC   -9815
   DEC   -8914
   DEC   -8031
   DEC   -7163
   DEC   -6312
   DEC   -5475
   DEC   -4653
   DEC   -3845
   DEC   -3050
   DEC   -2269
   DEC   -1500
   DEC    -744
   DEC       1
*******
* 33 point arctan table ( 0 - 45 degs )
* Created by a PASCAL program -- smathtbl
*******
 ENT atn_table
atn_table    DEC  -32768
   DEC  -32107
   DEC  -31424
   DEC  -30719
   DEC  -29992
   DEC  -29242
   DEC  -28469
   DEC  -27671
   DEC  -26849
```

```
AMATHTBL.WORK.PD8510            THU, DEC 22, 1983, 10:44 AM     PAGE   2

   DEC  -26002
   DEC  -25130
   DEC  -24232
   DEC  -23307
   DEC  -22356
   DEC  -21379
   DEC  -20376
   DEC  -19346
   DEC  -18290
   DEC  -17208
   DEC  -16101
   DEC  -14970
   DEC  -13815
   DEC  -12638
   DEC  -11440
   DEC  -10222
   DEC   -8986
   DEC   -7734
   DEC   -6467
   DEC   -5189
   DEC   -3900
   DEC   -2605
   DEC   -1304
   DEC       0
*
***********************************
* LOOKUP TABLE --- contains 17-bit square root values from .25 to 1
* which have been rounded up from a 24-bit value.There is an assumed
* positive sign bit (0) and a significant bit (1) which accounts for
* the 17th bit per 16-bit entry.
* Asterisks indicate values which have been rounded up by 1 bit.
************************
     ENT sqrt_tbl
sqrt_tbl EQU *-64
     HEX 0000
     HEX 03FB
     HEX 07E1  *
     HEX 0BBB
     HEX 0F87
     HEX 1346
     HEX 16F8
     HEX 1A9E  *
     HEX 1E37
     HEX 21C6  *
     HEX 2549  *
     HEX 28C1
     HEX 2C30  *
     HEX 2F94
     HEX 32EF  *
     HEX 3640
     HEX 3989  *
     HEX 3CC9  *
     HEX 4000
     HEX 432F
     HEX 4656
     HEX 4976  *
```

```
AMATHTBL.WORK.PD8510            THU, DEC 22, 1983, 10:44 AM     PAGE   3

     HEX 4C8E  *
     HEX 4F9E
     HEX 52A8  *
     HEX 55AB  *
     HEX 58A7  *
     HEX 5B9C  *
     HEX 5E8B  *
     HEX 6174  *
     HEX 6456
     HEX 6733  *
     HEX 6A0A  *
     HEX 6CDB
     HEX 6FA7  *
     HEX 726D
     HEX 752E
     HEX 77EA
     HEX 7AA1
     HEX 7D53  *
     HEX 8000
     HEX 82A8
     HEX 854C  *
     HEX 87EB
     HEX 8A86  *
     HEX 8D1C
     HEX 8FAE
     HEX 923C  *
     HEX 94C6  *
     HEX 974B
     HEX 99CD  *
     HEX 9C4B  *
     HEX 9EC4
     HEX A13B  *
     HEX A3AD
     HEX A61C  *
     HEX A887
     HEX AAEF  *
     HEX AD53
     HEX AFB4
     HEX B212  *
     HEX B46C  *
     HEX B6C3
     HEX B917  *
     HEX BB68  *
     HEX BDB5
     HEX C000
     HEX C248  *
     HEX C48C
     HEX C6CE
     HEX C90D
     HEX CB49
     HEX CD83  *
     HEX CFB9
     HEX D1ED
     HEX D41F  *
     HEX D64D
     HEX D879
```

```
MMATHTBL.WORK.PD8510            THU, DEC 22, 1983, 10:44 AM     PAGE   4

      HEX DAA3  *
      HEX DCCA
      HEX DEEF  *
      HEX E111  *
      HEX E330
      HEX E54E  *
      HEX E769  *
      HEX E982  *
      HEX EB98  *
      HEX EDAC
      HEX EFBE  *
      HEX F1CE  *
      HEX F3D8
      HEX F5E6
      HEX F7F0  *
      HEX F9F7  *
      HEX FBFC  *
      HEX FDFF
      HEX 0201  difference between SQRT(1) and last table entry
*
* NOTE:  Precision errors are bound to occur using this method of
* computing square roots due to linear interpolation between table
* entries and rounding/truncation errors.
*
* Based on an exhaustive search of all possible normalized 16-bit
* mantissa values with odd & even exponents, there is at most, a
* 1 LSB precision error which occurs in 29.8% of the results where:
*
*        16% are 1 LSB under the actual value from which
*            9% are computed from the upper 1/3 of the table
*            7% are computed from the lower 2/3 of the table
*
*        13.25% are 1 LSB over the actual value from which
*            12.75% are computed from the upper 1/3 of the table
*            0.50% are computed from the lower 2/3 of the table
*
* The upper part of the table contains smaller values and the lower
* part of the table contains larger values (approaching 1).
*
 END
```

```
SMATHTBL.WORK.PD8510            THU, DEC 22, 1983, 10:44 AM     PAGE   2

      { limit max value to 2^15 - 1 }
     IF sine   > 32767.499 THEN sine   := 32767.0;
     IF cosine > 32767.499 THEN cosine := 32767.0;

     WRITELN(f1,'   DEC ',  sine:7:0,ang:12:6);
     WRITELN(f1,'   DEC ',cosine:7:0);
   END {index loop};
END {sine_cosine};

(**********************************************************************)
(**********************************************************************)
PROCEDURE log_table;
VAR index:INTEGER;

BEGIN

   WRITELN(f1,'*******');
   WRITELN(f1,'* 33 point log_2 table -- mantissa part only');
   WRITELN(f1,'*     0 - 3 db  ');
   WRITELN(f1,'* Created by a PASCAL program -- smathtbl');
   WRITELN(f1,'*******');
   WRITELN(f1,' ENT log_table');
   WRITE(f1,'log_table ');

   FOR index := 0 TO 32 DO
   BEGIN
      val   := 0.5 + (index/64.0 );
      log_2 := ln_scaling * ln( val );
      log_2 := log_2 +
            integer_scaling * 0.4 * log_10_e / ( val * val * 8192.0 );

     WRITELN(f1,'   DEC ',log_2:7:0);
   END(index_loop)

END(log_table);

(**********************************************************************)
(**********************************************************************)
PROCEDURE atn_table;
VAR index:INTEGER;

BEGIN

   WRITELN(f1,'*******');
   WRITELN(f1,'* 33 point arctan table ( 0 - 45 degs )');
   WRITELN(f1,'* Created by a PASCAL program -- smathtbl');
   WRITELN(f1,'*******');
   WRITELN(f1,' ENT atn_table');
   WRITE(f1,'atn_table ');

   FOR index := 0 TO 32 DO
   BEGIN
      val := ( 32.0 - index ) / 32.0;
      atan := -integer_scaling * arctan( val ) / radians_of_45_deg;
      val  := -2*val / (1 + 2*val*val + val*val*val*val );
      atan := atan +
```

```
SMATHTBL.WORK.PD8510            THU, DEC 22, 1983, 10:44 AM     PAGE   1

$LIST OFF$
$USLINIT$

PROGRAM mathtbl(INPUT,OUTPUT);

CONST
    radians_to_degs     = 5.72957795131E1;     {360/2*pi}
    two_radians_scaling = 6.13592315154E-03;  {2*pi/1024}
    integer_scaling     = 3.27680000000E4 ;
    ln_scaling          = 4.7274231E4;          {32768/(log(2)*ln(10))}
    radians_of_45_deg   = 0.785398;
    log_10_e            = 0.4343945;

TYPE INTEGER =-32768..32768;

VAR
    f1:TEXT;
    val,
    atan,
    log_2,
    cosine,
    sine,
    ang:LONGREAL;

(**********************************************************************)
(*                                                                    *)
(*    Creates an 1025 point sine/cosine table. The output is a        *)
(*  ASM68K file. There are 1025 entries. The first entry is           *)
(*  sin( 0 ) ( 16 bits integer ) and then cosine( 0 ) ( again 16 bits)*)
(*  then angle is increment by 2*Pi/1024 radians. The values are      *)
(*  scaled by 32768, but since +32768 is not a valid representation   *)
(*  it is limited to +32767.                                          *)
(*                                                                    *)
(**********************************************************************)
PROCEDURE sine_cosine;
VAR index:INTEGER;

BEGIN

   WRITELN(f1,'*******');
   WRITELN(f1,'* 1025 pt (2 Pi radians) sin/cos table (sine first) ');
   WRITELN(f1,'* Each result 16 bit Integer scaled by 32767 ');
   WRITELN(f1,'* Created by a PASCAL program -- smathtbl');
   WRITELN(f1,'*******');
   WRITELN(f1,' ENT sine_cos');
   WRITE(f1,'sine_cos ');


   FOR index := 0 TO 1024 DO
   BEGIN
     ang      := index * two_radians_scaling;
     sine     := integer_scaling * SIN( ang );
     cosine   := integer_scaling * COS( ang );
     ang      := ang * radians_to_degs;
```

```
SMATHTBL.WORK.PD8510            THU, DEC 22, 1983, 10:44 AM     PAGE   3

              0.6 * integer_scaling * val / 8192.0;
      IF atan < -32768.0 THEN atan := -32768.0;

     WRITELN(f1,'   DEC ',atan:7:0);
   END(index_loop)

END(atn_table);
(**********************************************************************)
(**********************************************************************)
PROCEDURE sqrt_table;
BEGIN
      WRITELN(f1, '*');
      WRITELN(f1, '*************************************');
      WRITELN(f1,
'* LOOKUP TABLE --- contains 17-bit square root values from .25 to 1 ');
      WRITELN(f1,
'* which have been rounded up from a 24-bit value.There is an assumed');
      WRITELN(f1,
'* positive sign bit (0) and a significant bit (1) which accounts for');
      WRITELN(f1,
'* the 17th bit per 16-bit entry.                                    ');
      WRITELN(f1,
'* Asterisks indicate values which have been rounded up by 1 bit.    ');
      WRITELN(f1,'************************');
      WRITELN(f1,'        ENT sqrt_tbl');
      WRITELN(f1,'sqrt_tbl EQU *-64');
      WRITELN(f1,'         HEX 0000');
      WRITELN(f1,'         HEX 03FB');
      WRITELN(f1,'         HEX 07E1  *');
      WRITELN(f1,'         HEX 0BBB');
      WRITELN(f1,'         HEX 0F87');
      WRITELN(f1,'         HEX 1346');
      WRITELN(f1,'         HEX 16F8');
      WRITELN(f1,'         HEX 1A9E  *');
      WRITELN(f1,'         HEX 1E37');
      WRITELN(f1,'         HEX 21C6  *');
      WRITELN(f1,'         HEX 2549  *');
      WRITELN(f1,'         HEX 28C1');
      WRITELN(f1,'         HEX 2C30  *');
      WRITELN(f1,'         HEX 2F94');
      WRITELN(f1,'         HEX 32EF  *');
      WRITELN(f1,'         HEX 3640');
      WRITELN(f1,'         HEX 3989  *');
      WRITELN(f1,'         HEX 3CC9  *');
      WRITELN(f1,'         HEX 4000');
      WRITELN(f1,'         HEX 432F');
      WRITELN(f1,'         HEX 4656');
      WRITELN(f1,'         HEX 4976  *');
      WRITELN(f1,'         HEX 4C8E  *');
      WRITELN(f1,'         HEX 4F9E');
      WRITELN(f1,'         HEX 52A8  *');
      WRITELN(f1,'         HEX 55AB  *');
      WRITELN(f1,'         HEX 58A7  *');
      WRITELN(f1,'         HEX 5B9C  *');
      WRITELN(f1,'         HEX 5E8B  *');
      WRITELN(f1,'         HEX 6174  *');
```

```
SMATHTBL.WORK.PD8510          THU, DEC 22, 1983, 10:44 AM     PAGE  4

      WRITELN(f1,'        HEX 6456 ');
      WRITELN(f1,'        HEX 6733  *');
      WRITELN(f1,'        HEX 6A0A  *');
      WRITELN(f1,'        HEX 6C08');
      WRITELN(f1,'        HEX 6FA7  *');
      WRITELN(f1,'        HEX 726D');
      WRITELN(f1,'        HEX 752E');
      WRITELN(f1,'        HEX 77EA');
      WRITELN(f1,'        HEX 7AA1');
      WRITELN(f1,'        HEX 7D53  *');
      WRITELN(f1,'        HEX 8000');
      WRITELN(f1,'        HEX 82A8');
      WRITELN(f1,'        HEX 854C  *');
      WRITELN(f1,'        HEX 87E8');
      WRITELN(f1,'        HEX 8A86  *');
      WRITELN(f1,'        HEX 8D1C');
      WRITELN(f1,'        HEX 8FAE');
      WRITELN(f1,'        HEX 923C  *');
      WRITELN(f1,'        HEX 94C6  *');
      WRITELN(f1,'        HEX 9748');
      WRITELN(f1,'        HEX 99CD  *');
      WRITELN(f1,'        HEX 9C48  *');
      WRITELN(f1,'        HEX 9EC4');
      WRITELN(f1,'        HEX A138  *');
      WRITELN(f1,'        HEX A3AD');
      WRITELN(f1,'        HEX A61C  *');
      WRITELN(f1,'        HEX A887');
      WRITELN(f1,'        HEX AAEF  *');
      WRITELN(f1,'        HEX AD53');
      WRITELN(f1,'        HEX AFB4');
      WRITELN(f1,'        HEX B212  *');
      WRITELN(f1,'        HEX B46C  *');
      WRITELN(f1,'        HEX B6C3');
      WRITELN(f1,'        HEX B917  *');
      WRITELN(f1,'        HEX BB68  *');
      WRITELN(f1,'        HEX BD85');
      WRITELN(f1,'        HEX C000');
      WRITELN(f1,'        HEX C248  *');
      WRITELN(f1,'        HEX C48C');
      WRITELN(f1,'        HEX C6CE');
      WRITELN(f1,'        HEX C90D');
      WRITELN(f1,'        HEX CB49');
      WRITELN(f1,'        HEX CD83  *');
      WRITELN(f1,'        HEX CFB9');
      WRITELN(f1,'        HEX D1ED');
      WRITELN(f1,'        HEX D41F  *');
      WRITELN(f1,'        HEX D64D');
      WRITELN(f1,'        HEX D879');
      WRITELN(f1,'        HEX DAA3  *');
      WRITELN(f1,'        HEX DCCA');
      WRITELN(f1,'        HEX DEEF  *');
      WRITELN(f1,'        HEX E111  *');
      WRITELN(f1,'        HEX E330');
      WRITELN(f1,'        HEX E54E  *');
      WRITELN(f1,'        HEX E769  *');
      WRITELN(f1,'        HEX E982  *');
```

```
SMATHTBL.WORK.PD8510          THU, DEC 22, 1983, 10:44 AM     PAGE  5

      WRITELN(f1,'        HEX EB98  *');
      WRITELN(f1,'        HEX EDAC');
      WRITELN(f1,'        HEX EFBE  *');
      WRITELN(f1,'        HEX F1CE  *');
      WRITELN(f1,'        HEX F3D8');
      WRITELN(f1,'        HEX F5E6');
      WRITELN(f1,'        HEX F7F0  *');
      WRITELN(f1,'        HEX F9F7  *');
      WRITELN(f1,'        HEX FBFC  *');
      WRITELN(f1,'        HEX FDFF');
      WRITELN(f1,
'      HEX 0201  difference between SQRT(1) and last table entry');
      WRITELN(f1, '*');
      WRITELN(f1,
'* NOTE:  Precision errors are bound to occur using this method of');
      WRITELN(f1,
'* computing square roots due to linear interpolation between table');
      WRITELN(f1,
'* entries and rounding/truncation errors.');
      WRITELN(f1, '*');
      WRITELN(f1,
'* Based on an exhaustive search of all possible normalized 16-bit');
      WRITELN(f1,
'* mantissa values with odd & even exponents, there is at most, a ');
      WRITELN(f1,
'* 1 LSB precision error which occurs in 29.8% of the results where:');
      WRITELN(f1, '*');
      WRITELN(f1,
'*      16% are 1 LSB under the actual value from which');
      WRITELN(f1,
'*          9% are computed from the upper 1/3 of the table');
      WRITELN(f1,
'*          7% are computed from the lower 2/3 of the table');
      WRITELN(f1, '*');
      WRITELN(f1,
'*      13.25% are 1 LSB over the actual value from which');
      WRITELN(f1,
'*          12.75% are computed from the upper 1/3 of the table');
      WRITELN(f1,
'*          0.50% are computed from the lower 2/3 of the table');
      WRITELN(f1, '*');
      WRITELN(f1,
'* The upper part of the table contains smaller values and the lower');
      WRITELN(f1,
'* part of the table contains larger values (approaching 1).');
      WRITELN(f1, '*');
END {sqrt_table};

(*******************************************************************)
(*******************************************************************)
BEGIN {main}
   REWRITE(f1,'amathtbl.work','nocctl');

   WRITELN(f1,'ASMB,R');
   WRITELN(f1,' NAM mathtbl,7,"JTB,LANI.PD8510   9/3/82"');
```

```
SMATHTBL.WORK.PD8510          THU, DEC 22, 1983, 10:44 AM     PAGE  6

   { sine_cosine;   no longer done here -- run time generated }
   log_table;
   atn_table;
   sqrt_table;

   WRITELN(f1,' END');
   CLOSE(f1,'SAVE');
END. {main}
```

```
FMBM.WORK.PD8510              THU, DEC 22, 1983, 10:44 AM     PAGE  1

COMMENT
***********************************************************************
*    The magnectic bubble memory (MBM) is a non-volatile mass memory.
*  The minimal memory is 1 megabits( during development) and 2 megabits
*  (during production), however the actual amount may be greater. MBM is
*  a mass memory with finite time random page access (bit serial).
*     MBM is intended to store internal program, calibration data, save/
*  recall states, trace and memory data storage and other internal
*  information. It is intended that
*  most MBM operations will be transparent it the user ( unlike tape
*  which the user specify states - use tape --) (in other words , MBM
*  is an extention of the main memory -- just slower and non-volatile)
*
*     In relative preformance terms, the MBM is slower then main memory
*  ( by 100:1 ) but faster than tape (100 or 1000:1). The main memory
*  and MBM are full Class B but tape has a limited temp range (10-35 C).
*  MBM power while operation is half that of the tape and since it is
*  much faster, the total power consumtion is atleast 100:1 less. MBM
*  having no mechanical parts is quiet, has no mechanical orientation
*  or vibration problems. MBM should also have much better error rate
*  (Intel 1 Mega with internal correction 10^-11 vs Tape checksum only
*  10^-8).
*     MBM problems are supply availablity and price -- end of 81 approx
*  65 millicents/bit -- hopefully 25 millicents/bit end of 83 vs
*  15 mc/bit UVEPROM,5-10 mc/bit ROM, 10 mc/bit RAM, 120(now), 50(83)
*  mc/bit for CMOS with battery.
*     The present vendor is INTEL (who should announce a second source
*  soon) but the Japanesse and Motorola are other future sources (TI,
*  National, and Rockwell have dropped out). By late 82 4 mega devices
*  should also be available. Given this vendor problem and changing
*  technology, the system design should allow for a change of vendor or
*  MBM size.
*
*
*  HARDWARE DETAIL-- The hardware is such that a power fail will cause
*     the controller chip to become disabled. This will cause the status
*     bits to be all set ( all ones ) and the code such not hang because
*     of this ( in the Intel 1M code -- the delay loops will always
*     have a bail out on a bit ( ie Timing Error ) high.

*
*  DETAIL HARDWARE SPECS
*      Memory Size -- using 1,2,or 3 Intel 1 Megabit MBM **2 most likely
*      Organization -- Each MBM is logical and physical seperate
*                           512 bits by 2048 pages
*      Transfer Rate -- 10K Bytes/sec
*                          MBM can be operated in parallel to improve
*      Access Rate   --
*                           Pages can be prefetched and therefore access
*                             is 1 ms
*      Error Rate    --  10^-12 with internal error correction
*                           Soft error - Hard errors 10^-14
*      Redundancy    --  Transparent and stored on MBM chip
*                           320 loops, 240 useds, 14 for error correction
*      Envoirment    -- Class B - 0-70 C, 0-95% RH, 20G shock,>10G Mag
```

```
FMBM.WORK.PO8510              THU, DEC 22, 1983, 10:44 AM     PAGE  2

*                    Non-operation is -40-100C,200G shock,>40G flag
*      Interface    -- 40 byte FIFO
*      Power        -- Operating 6.5 W , Standby 1 W
*                    Fully power fail protected -- power down 20uSec
*
*
*      STATUS BITS
*      Bit 0  Fifo Ready
*      Bit 1  Parity Error  -- Ignore
*      Bit 2  Uncorrectable Error   -- fatal retry
*      Bit 3  Correctable Error -- Ignore
*      Bit 4  Timing Error -- FIFO over/under ran -- fatal
*      Bit 5  Op fail
*      Bit 6  Operation complete successfully
*      Bit 7  Busy  rotating bubbles
*************************************************************************
end of comment;
BOOLEAN SUBROUTINE test_mbm;                                     EXTERNAL;
        &For Hardware/power-on verify&
BOOLEAN PROCEDURE  init_mbm(mod); VALUE mod; INTEGER mod;        EXTERNAL;
        &select which hardware module to be used * mod=0,1,...&
ALPHA   PROCEDURE parms_mbm(mod,pos,pagesize,pagemax,modules);
        INTEGER mod,pos,pagesize,pagemax,modules;                EXTERNAL;
        &returns basic bubble parmeters -- to allow software flexiable
          to future changes
        mod=present active module, pos=last page read/write
        pagesize=# of words per page,pagemax=# of pages (0=first)
        modules=# of available MBM modules&
DOUBLE PROCEDURE set_add_mbm(address,buf_start,buf_end);
  VALUE buf_start,buf_end; INTEGER address;
                             DOUBLE buf_start,buf_end;           EXTERNAL;
        &returns the # of pages need to transfer the buffer to/from
         the MBM page (address)
         MUST BE CALLED BEFORE A READ OR WRITE&
INTEGER SUBROUTINE status_mbm;                                   EXTERNAL;
        &returns the present status of MBC -- useful after errors&
BOOLEAN PROCEDURE  read_mbm(buf,buf_length); VALUE buf,buf_length;
                                      DOUBLE buf,buf_length;     EXTERNAL;
        &reads from the MBM into the address of buf, the number
          of pages in the buf -- found from set-add_mbm&
BOOLEAN PROCEDURE  wrt_mbm(buf,buf_length); VALUE buf,buf_length;
                                      DOUBLE buf,buf_length;     EXTERNAL;
        &writes from the MBM into the address of buf, the number
          of pages in the buf -- found from set-add_mbm&
INTEGER PROCEDURE  read_boot_mbm(buf); VALUE buf; DOUBLE buf;    EXTERNAL;
        &reads the boot loop into the buf -- 40 bytes&
        & and returns coded result of boot loop &
BOOLEAN PROCEDURE  wrt_boot_mbm(buf); VALUE buf; DOUBLE buf;     EXTERNAL;
        &writes the boot loop inti the buf -- 40 bytes
         may require a hardware jumper&
```

```
FMBMCAL.WORK.PO8510           THU, DEC 22, 1983, 10:44 AM     PAGE  1

INTEGER PROCEDURE cal_seg_size (lgth);                           EXTERNAL;
  VALUE lgth; DOUBLE lgth;                                       EXTERNAL;
INTEGER PROCEDURE cal_seg_avail;
```

```
CMBMGR.WORK.PO8510            THU, DEC 22, 1983, 10:44 AM     PAGE  1

INTEGER CONSTANT
  no_op       := 0,
  save_op := 5,
  recall_op := 6,
  clear_op := 7,
  page_size := 31,          & no. of words for mbm directory info. &
  mem_dir_offset := 20,     & start-1 indices to mem. trace lgths  &
  cal_dir_offset := 10,
  seg_size  := 115,         & no. of pages per cal. data segment   &
  seg_start := 965,         & starting page of cal bubble segments &
  header_size := 48,        & bytes of trace header info.          &
  header_buffer_size := (header_size + 63) AND %FFC0;
```

```
FMBMGR.WORK.PO8510            THU, DEC 22, 1983, 10:44 AM     PAGE  1

#FILE cmbmgr.work;

BOOLEAN PROCEDURE read_data_header (addr, type, reg);
  VALUE addr, type, reg;  DOUBLE addr;  INTEGER type, reg;       EXTERNAL;

& Recalls a bubble register to a RAM data block &
BOOLEAN PROCEDURE recall_data (addr, type, reg);
  VALUE   addr, type, reg;
  DOUBLE  addr;
  INTEGER type, reg;                                             EXTERNAL;

& Saves RAM data block in bubble register &
BOOLEAN PROCEDURE save_data (addr, lgth, type, reg);
  VALUE addr,lgth,type,reg;
  DOUBLE addr;
  INTEGER lgth, type, reg;                                       EXTERNAL;

& Saves all bubble register of a type in tape file &
PROCEDURE record_data (type, id, reg);
  VALUE type, id, reg; INTEGER type, id, reg;                    EXTERNAL;

& Restores data from tape to bubble register &
PROCEDURE restore_data (type, id, reg);
  VALUE type, id, reg;  INTEGER type, id, reg;                   EXTERNAL;

& Clears a cal data register in bubble &
BOOLEAN PROCEDURE clear_cal (reg_num);
  VALUE reg_num;  INTEGER reg_num;                               EXTERNAL;

BOOLEAN PROCEDURE ok_to_save_cal (reg,lgth);
  VALUE reg,lgth; INTEGER reg,lgth;                              EXTERNAL;

INTEGER PROCEDURE get_start_pg (type, reg);
VALUE type,reg;  INTEGER type,reg;                               EXTERNAL;

& Initializes lgth info tables for save/recall states &
PROCEDURE init_save_recall;                                      EXTERNAL;

& Checks if bubbles are present and valid &
BOOLEAN SUBROUTINE bubble_ok;                                    EXTERNAL;

& Updates bubble directory for cal and memory traces &
BOOLEAN SUBROUTINE update_mbm_dir;                               EXTERNAL;

BOOLEAN PROCEDURE wrt_mbm_ok (ram_addr, mbm_pg, byte_cnt);
  VALUE   ram_addr, byte_cnt;
  DOUBLE  ram_addr;
  INTEGER mbm_pg, byte_cnt;                                      EXTERNAL;

EXTERNAL INTEGER ARRAY
  mbm_dir [0:page_size];                   & bubble directory in page 0 &

BOOLEAN SUBROUTINE recall_lunplus;                               EXTERNAL;
BOOLEAN SUBROUTINE save_lunplus;                                 EXTERNAL;
```

SMBMGR.WORK.PD8510 THU, DEC 22, 1983, 10:44 AM PAGE 1

```
M68KL,P,"MBMGR"
BEGIN

COMMENT ******* BUBBLE MANAGER MODULE ********* --------------------+
|                                                                    |
| This module contains the basic I/O routines needed to transfer     |
| files to and from bubble memory:                                   |
|                                                                    |
| Transfers data from ram to bubble ---                              |
|   save_data (ram_address, byte_lgth, data_type, data_reg)          |
|                                                                    |
| Transfers data from bubble to ram ---                              |
|   recall_data (ram_address, data_type, data_reg)                   |
|                                                                    |
| Transfers data from bubble to tape ---                             |
|   record_data (data_type, tape_file_no)                            |
|                                                                    |
| Transfers data from tape to bubble --                              |
|   restore_data (data_type, tape_file_no)                           |
|                                                                    |
+--------------------------------------------------------------------;

#FILE fterm.work;     & debug &
#FILE cdebugc4.work;  & debug &
#FILE frecall.work;
#FILE fmbm.work;
#FILE ftpmgr.work;
#FILE futil2.work;
#FILE futil3.work;
#FILE futil4.work;
#FILE cmsgmbm.work;
#FILE cmsgtape.work;      & for file_error message when recording data  &
#FILE cmsgcal.work;       & for no cal space message                    &
#FILE cmessag0.work;      & for exceeded_available_memory message       &
#FILE fmemmgr.work;
#FILE fmarkmem.work;
#FILE fchtable.work;
#FILE flunplus.work;      & for priv_ib_lun_table (HPIB addresses, etc) &
#FILE cmbmgr.work;
#FILE fstds.work;
#FILE fstds2.work;        & for cal_kit_array_size and update_kit_label &
#FILE fdatamgr.work;      & for data_type_str (for messages)            &
#FILE fdguser.work;       & for init_user_graphics                      &
#FILE ftopmisc.work;      & for beep (done_tone)                        &
#FILE cpubib.work;        & for setting SRQ bits indicating complete or &
#FILE fpubib.work;        &      failed operation occured               &
```

SMBMGR.WORK.PD8510 THU, DEC 22, 1983, 10:44 AM PAGE 2

```
#EJECT;

INTEGER CONSTANT
  state_page_start:= 1,

  small_cal := 1,               & no. of segments in SMALL cal. model  &
  med_cal   := 2,               & no. of segments in MEDIUM cal. model &
  big_cal   := 4,               & no. of segments in BIG cal. model    &
  cstd_size := cal_kit_array_size/64,  & # pages per cal std data      &
  mem_start := seg_start + 8*seg_size;
                                & starting page of cal std bubble data &

INTEGER ARRAY  & starting pages of 5 regs + last state + preset state &
  state_mbm [1:prior_state];

INTEGER ARRAY            & starting pages of 4 memory data registers &
  memory_mbm [1:4];

INTEGER ARRAY                   & starting pages of 2  cal standards &
  cal_std_mbm [1:2];

INTEGER TABLE               & start pages of cal segments 0 thru 7 &
  cal_mbm :=   seg_start,
               seg_start + seg_size,
               seg_start + 2*seg_size,
               seg_start + 3*seg_size,
               seg_start + 4*seg_size,
               seg_start + 5*seg_size,
               seg_start + 6*seg_size,
               seg_start + 7*seg_size;

INTEGER ARRAY  & max. byte size for each register type&
  mbm_reg_sz [state_file:cal_file];

DOUBLE ARRAY  & max. number of bytes per data set    &
  mbm_max_reg [state_set:cal_set];

INTEGER pg_check,
        hpib_addr_pg,
        dg_mem_base_pg;        & starting page of display RAM in bubble &

BOOLEAN bubble_alive,
        restoring_from_tape;

GLOBAL INTEGER ARRAY
  mbm_dir [0:page_size];                 & bubble directory in page 0 &
```

SMBMGR.WORK.PD8510 THU, DEC 22, 1983, 10:44 AM PAGE 3

```
#EJECT;
BOOLEAN PROCEDURE wrt_mbm_ok (ram_addr, mbm_pg, byte_cnt);
  VALUE   ram_addr, byte_cnt;
  DOUBLE  ram_addr;
  INTEGER mbm_pg, byte_cnt;                                     ENTRY;
BEGIN
  INTEGER CONSTANT
          max_try := 3;
  INTEGER start_pg, try;
  BOOLEAN passed;
  try := 0;
  start_pg := mbm_pg;
  DO    mbm_pg := start_pg             & reset mbm page to write to &
  UNTIL (passed := wrt_mbm (ram_addr, set_add_mbm (mbm_pg,0,byte_cnt)))
     OR ((try:=try+1) = max_try);
  wrt_mbm_ok := passed;
END wrt_mbm_ok;
```

SMBMGR.WORK.PD8510 THU, DEC 22, 1983, 10:44 AM PAGE 4

```
#EJECT;
COMMENT
$DOC+

NAME--
  bubble_ok
*********************************************************************
*
* SHORT DESCRIPTION--
*   initialize bubble module which saves/recalls data
*
* EXTENDED DESCRIPTION--
*   This routine acknowledges and initializes the bubble module to
*   transfer data to/from and returns TRUE if the initialization was
*   successful, FALSE if otherwise and displays an error message to
*   indicate this.  A global variable, bubble_alive, is set initially
*   by this routine and is referred to before re-initializing and
*   re-reading the first page of data information.  "Bubble_alive" is
*   reset after every bubble operation (read/writes) throughout the
*   code to determine a successful (TRUE) or unsuccessful (FALSE)
*   operation.  Therefore, module initialization and reading the first
*   page of bubble data information is done only on "power up" and
*   prior to any bubble operation occuring after a read/write failure.
*
* INPUTS--   implied bubble module (integer constant, module)
*
* OUTPUTS--  TRUE if module initializes successfully,
*            FALSE if module does not get initialized
*
* ROUTINES CALLED--
*   init_mbm
*   fatal
*
* ERROR CONDITIONS AND RECOVERY--  none
*
* NOTES--
*   Any problems/failures in initializing the bubble module will prevent
*   any data transferring to/from bubble and tape or RAM to occur.
*
* AUTHOR--
*
*********************************************************************
*
* INITIAL REFINEMENT--
*   if bubble module did not initialize successfully on power-up
*   (bubble_alive) then
*   if bubble module initializes successfully then
*     set return value of subroutine to TRUE
*   else
*     set return value of subroutine to FALSE and display error message
*
*********************************************************************
*
* REVISION LOG--
*   1/10/83  -  added check for global variable "bubble_alive"
*               before re-initializing module and re-reading 1st page
```

```
*               of information (helps speed up saves/recalls to/from
*               bubble when by-passed).
*  10/11/83  -  generate FATAL error message (hang 8510) if data bubble
*               does not check out.
*
*************************************************************************
DECLARATION--
;
BOOLEAN SUBROUTINE bubble_ok;                                     ENTRY;
&
$DOC-&

BEGIN
  pg_check := 0;
  IF NOT (bubble_ok := bubble_alive) THEN
  IF init_mbm (module) THEN
  BEGIN
    IF dump_debug THEN
      BEGIN
        WSTR("after init_mbm    = "); WHEX(status_mbm); CRLF;
      END;
    IF read_mbm (ADRS(mbm_dir),set_add_mbm(pg_check,0,2*page_size+1))
    THEN
      IF (mbm_dir[31]=%8510) THEN
        bubble_ok := bubble_alive := TRUE
      ELSE
        fatal (un_init_mbm)
    ELSE
      fatal (bubble_init_error)
  END
  ELSE
    fatal (bubble_init_error);
  IF dump_debug THEN
    BEGIN WSTR("bubble 1 status = "); WHEX(status_mbm); CRLF; END;
END bubble_ok;
```

```
*

@EJECT;
COMMENT
$DOC+

NAME--
  get_start_pg
*************************************************************************
*
* SHORT DESCRIPTION--
*   returns the starting page of a requested data register type
*
* EXTENDED DESCRIPTION--
*   This function returns the starting page of a data register in
*   bubble.  These starting pages are stored in tables whose indices
*   correspond to register numbers:
*
*     state_mbm  = table of 8 starting pages for 8 save/recall registers
*     cal_mbm    = table of 8 starting pages for 8 possible registers
*
*   In the case of calibration data, since there are 8 possible register
*   slots from which 2 or 4 registers can be occupied with larger data
*   blocks (in effect decreasing register availability), starting pages
*   corresponding to available segments (8 register boundaries) are
*   returned.
*
*   A return value of 0 indicates a possible invalid data type which can
*   not be transferred to/from bubble memory.
*
* INPUTS--  type = data type of register to get starting page from
*           reg  = register number (also page table index)
*
* OUTPUTS-- starting page of requested data type and register number
*
* ROUTINES CALLED--
*   warn
*
* ERROR CONDITIONS AND RECOVERY--
*
* NOTES--
*
* AUTHOR--
*
*************************************************************************
*
* INITIAL REFINEMENT--
*   set page return value to 0
*   If given data type is valid and bubble module is initializes then
*     According to data type, use given register number to index
*       appropriate data type table for first page of that register
*     If data type is calibration and register cannot be accessed then
*       display error message
*   If final page number = 0  and  data type is not calibration then
*     display error message indicating invalid bubble data
*
*************************************************************************
*
```

```
* REVISION LOG--
*
*************************************************************************
DECLARATION--
;
INTEGER PROCEDURE get_start_pg (type, reg);
VALUE type,reg;  INTEGER type,reg;                                ENTRY;
&
$DOC-&

BEGIN
  INTEGER pg, i;
  pg := 0;
  data_type_str := file_type[type];
  IF bubble_ok THEN
    IF (type = state_file) OR (type = state_set) THEN
      pg := state_mbm[reg]   ELSE
    IF (type = memory_file) OR (type = memory_set) THEN
      pg := memory_mbm[reg]  ELSE
    IF (type = cal_std_file) OR (type = cal_std_set) THEN
      pg := cal_std_mbm[reg] ELSE
    IF (type = cal_set) THEN
      pg := cal_mbm&O&        ELSE
    IF (type = cal_file) THEN
      IF (i:=mbm_dir[reg])=0 AND NOT restoring_from_tape THEN
        compute_warn (data_type_str, no_reg_data)
      ELSE
        pg := cal_mbm[RIGHT(i,8)];
  get_start_pg := pg;
END get_start_pg;
```

```
@EJECT;
PROCEDURE cal_dump;     & DEBUG ROUTINE ONLY !!! &
BEGIN
  INTEGER i;
  WSTR("Cal seg bitmap:"); WHEX(mbm_dir&O&); CRLF;
  WSTR("Cal dir/status:");
  FOR i := 1 TO 8 DO WHEX(mbm_dir[i]); CRLF;
  WSTR("Cal reg lgths: ");
  FOR i := cal_dir_offset+1 TO cal_dir_offset+8 DO WHEX(mbm_dir[i]);
  CRLF;
  WSTR("Mem directory: ");
  FOR i := mem_dir_offset+1 TO mem_dir_offset+4 DO
    WHEX(mbm_dir[i]);  CRLF;
END cal_dump;
```

```
#EJECT;
COMMENT
$DOC+

NAME--
  update_mbm_dir
*************************************************************************
*
* SHORT DESCRIPTION--
*   updates changes made to data bubble information directory
*
* EXTENDED DESCRIPTION--
*   This routine updates the data bubble directory found in page 0.
*   A copy of the directory in RAM is changed as data is saved or
*   changed or deleted.  This copy is then written over the non-volatile
*   copy in the data bubble.  The information in the directory consists
*   of the following:
*
*   - cal data bitmap corresponding to 8 possible cal data registers
*   - cal data allocation map made of 8 words where each word contains:
*     MSByte = segment number (1..8) of memory cal data is stored at
*     LSByte = # segments (1,2,4) needed to store cal data
*   - cal data length information (# bytes) made of 8 words for each
*     register
*   - memory trace data length information (# bytes) made of 4 words
*     for each memory trace
*
* INPUTS--  none
*
* OUTPUTS--
*   TRUE = if write to data bubble succeeds
*   FALSE= if write to data bubble fails
*
* ROUTINES CALLED--
*   wrt_mbm
*   set_add_mbm
*
* ERROR CONDITIONS AND RECOVERY--
*   none
*
* NOTES--
*
* AUTHOR--
*
*************************************************************************
*
* INITIAL REFINEMENT--
*   copy bubble directory to bubble
*   (using low level bubble I/O routine which return TRUE if the
*    opertion succeeds, FALSE otherwise)
*
*************************************************************************
*
* REVISION LOG--
*
*************************************************************************
```

```
DECLARATION--
;
BOOLEAN SUBROUTINE update_mbm_dir;                                ENTRY;
&
$DOC-&

BEGIN
  pg_check := 0;
  COMMENT
  update_mbm_dir := wrt_mbm (ADRS(mbm_dir),set_add_mbm(pg_check,0,63));
  update_mbm_dir := wrt_mbm_ok (ADRS(mbm_dir), pg_check, 63);
  IF dump_debug THEN
    BEGIN
      WSTR("updating mbm dir"); CRLF;
      cal_dump;
    END;
END update_mbm_dir;
```

```
#EJECT;
COMMENT
$DOC+

NAME--
  move_segment
*************************************************************************
*
* SHORT DESCRIPTION--
*   "garbage collects" physical cal data blocks in bubble
*
* EXTENDED DESCRIPTION--
*   This routine moves physical blocks of cal data from one designated
*   bubble segment boundary to another.  These segments are pre-defined
*   in a table, cal_mbm.  There are 8 segment boundaries for 8 possible
*   cal data information which can be stored in 1,2, or 4 segments at a
*   time.  This routine "closes" up any segment gaps so that available
*   segments are contiguous and can be allocated as such.  Segments are
*   moved in even segment boundaries only.  Therefore, there can be only
*   one available segment between consecutively occupied segments at any
*   time.
*   An intermiediate buffer in RAM is temporarily allocated to transfer
*   from one area of bubble to another.
*
* INPUTS--
*   src_seg  = segment boundary of bubble information to be moved
*   dest_seg = segment boundary of bubble information to be moved to
*   pg_cnt   = number of pages of bubble information to be moved
*
* OUTPUTS--
*   successful/unsuccessful bubble segment re-allocation
*   (TRUE)/(FALSE)
*
* ROUTINES CALLED--
*   warn
*   wrt_mbm
*   read_mbm
*   request_memory
*   release_memory
*
* ERROR CONDITIONS AND RECOVERY--
*   none
*
* NOTES--
*
* AUTHOR--
*
*************************************************************************
*
* INITIAL REFINEMENT--
*
*************************************************************************
*
* REVISION LOG--
*
*************************************************************************
```

```
DECLARATION--
;
BOOLEAN PROCEDURE move_segment (src_seg, dest_seg, cal_size);
VALUE src_seg, dest_seg, cal_size;  INTEGER src_seg, dest_seg, cal_size;
&
$DOC-&

BEGIN
  INTEGER src_pg, dest_pg, pg_cnt, register, reg=REGISTER 6;
  INTEGER POINTER bitmap;
  DOUBLE buffer;
  BOOLEAN move_ok;

  & get corresponding register info &
  reg := 0;
  move_ok := FALSE;
  DO UNTIL (RIGHT(mbm_dir[(reg:=reg+1)],8)=src_seg) OR (reg=9);
  IF ((register:=reg) = 9) THEN
    warn (invalid_mbm_data)
  ELSE
  IF (buffer:=request_memory(2560)) = 0 THEN
    warn (exceeded_available_memory)
  ELSE
    BEGIN
      src_pg := cal_mbm[src_seg];
      dest_pg:= cal_mbm[dest_seg];
      pg_cnt := cal_size * seg_size;
      IF dump_debug THEN
        BEGIN
          WSTR("CRUNCHING CAL DATA:"); WHEX(pg_cnt); WSTR(" pgs from");
          WHEX(src_pg); WSTR(" to"); WHEX(dest_pg);
          CRLF;
        END;
      DO IF
        (move_ok:=read_mbm(buffer,set_add_mbm(src_pg,0,2559)))
         THEN
        &
        move_ok :=wrt_mbm(buffer,set_add_mbm(dest_pg,0,
                 (IF pg_cnt>=40 THEN 2559 ELSE pg_cnt*64-1)))
        &
        move_ok :=wrt_mbm_ok (buffer, dest_pg,
                             (IF pg_cnt>=40 THEN 2559 ELSE pg_cnt*64-1))
      UNTIL NOT move_ok OR ((pg_cnt:=pg_cnt-40)<=0);   &40 pgs/tape blk&
      IF dump_debug THEN
        BEGIN
          WSTR("From"); WHEX(src_pg); WSTR(" to"); WHEX(dest_pg); CRLF;
        END;
      IF (bubble_alive:=move_ok)  THEN              & update reg info. &
        BEGIN
          mbm_dir[register] := cal_size OR LEFT(dest_seg,8);
          STPNTR (bitmap, ADRS(mbm_dir&0&));
          FOR reg := 0 TO cal_size-1 DO         & update segment bitmap &
            bitmap := SBIT (RBIT(bitmap,src_seg+reg),dest_seg+reg);
        END;
      release_memory (buffer);
    END;
```

```
SMBMGR.WORK.PD8510              THU, DEC 22, 1983, 10:44 AM     PAGE 13

  move_segment := move_ok;
END move_segment;
```

```
SMBMGR.WORK.PD8510              THU, DEC 22, 1983, 10:44 AM     PAGE 14

#EJECT;
COMMENT
$DOC+

NAME--
  scan_seg
**********************************************************************
*
* SHORT DESCRIPTION--
*   returns starting bubble segment for cal data register, if any
*
* EXTENDED DESCRIPTION--
*   This routine returns the starting segment (0..7) of a saved cal
*   register of a given segment size (1,2,4).  A value of 0 is returned
*   if a register of the given segment size cannot be found.
*   The first page of the data bubble contains cal data and memory trace
*   information.  8 words from this page correspond to the 8 possible
*   cal data registers.  Each word contains a page number for the
*   starting cal data bubble segment (upper byte) and the number of
*   segments occupied by the saved cal data (lower byte).
*   This is a general purpose routine used when "garbage collecting"
*   saved cal data blocks.
*
* INPUTS--
*   i  = register to start scanning from
*   sz = number of segments occupied by that register (i)
*
* OUTPUTS--
*   starting segment of first register found occupying a given number of
*   segments
*
* ROUTINES CALLED--
*   none
*
* ERROR CONDITIONS AND RECOVERY--
*   none
*
* NOTES--
*
* AUTHOR--
*
**********************************************************************
*
* INITIAL REFINEMENT--
*
**********************************************************************
*
* REVISION LOG--
*
**********************************************************************
DECLARATION--
;
INTEGER PROCEDURE scan_seg (i,sz);  VALUE i,sz;  INTEGER i,sz;
&
$DOC-&
```

```
SMBMGR.WORK.PD8510              THU, DEC 22, 1983, 10:44 AM     PAGE 15

BEGIN
  INTEGER n=REGISTER 6;                              &register counter&
  n := 0;
  DO BEGIN
    WHILE RIGHT(mbm_dir[n:=n+1],8)<=i AND (n<8) DO;  &get reg w/ seg>i &
    IF (mbm_dir[n] AND %OF)=sz THEN
      i := 10;                                 & indicates segment found &
  END UNTIL (i=10) OR (n=8);
  scan_seg := (IF i=10 THEN RIGHT(mbm_dir[n],8) ELSE 0);
END scan_seg;
```

```
SMBMGR.WORK.PD8510              THU, DEC 22, 1983, 10:44 AM     PAGE 16

#EJECT;
COMMENT
$DOC+

NAME--
  crunch_segments
**********************************************************************
*
* SHORT DESCRIPTION--
*   updates bookkeeping for cal data "garbage collection"
*
* EXTENDED DESCRIPTION--
*   This routine checks for non-contiguous occupied cal data segments,
*   calls the "move_segment" routine to re-allocate available segments,
*   and updates the corresponding segment bitmap.
*   Cal data segments are reconfigured to occur as paired "small"
*   segments, and "medium" segments so that they lie on even segment
*   boundaries, XXOOXXOO.  Segment sizes are currently defined as
*      "small"  = 1 segment
*      "medium" = 2 segments
*      "large"  = 4 segments
*   This routine is called whenever a saved cal is deleted.
*
* INPUTS--  none
*
* OUTPUTS-- successful/unsuccessful bubble segment re-allocation
*           (TRUE)/(FALSE)
*
* ROUTINES CALLED--
*   move_segment
*
* ERROR CONDITIONS AND RECOVERY--
*   none
*
* NOTES--
*
* AUTHOR--
*
**********************************************************************
*
* INITIAL REFINEMENT--
*
**********************************************************************
*
* REVISION LOG--
*
**********************************************************************
DECLARATION--
;
BOOLEAN PROCEDURE crunch_segments;
&
$DOC-&

BEGIN
  INTEGER i, seg, segmap;
  BOOLEAN crunch_ok;
```

```
SMBMGR.WORK.PD8510              THU, DEC 22, 1983, 10:45 AM     PAGE  17

  i := 0;
  segmap := mbm_dir&0&;
  crunch_ok := TRUE;
  WHILE (i<8) AND TBIT(segmap,i) DO i:=i+1;  &get 1st avail segment&
  WHILE NOT TBIT(segmap,i) AND ((seg:=scan_seg(i,small_cal))>i) DO
    IF (crunch_ok:=move_segment(seg,i,small_cal)) THEN
      i := i+small_cal;                      &fill w/ small cal. first &
  IF TBIT(i,0) THEN i:=i+1;                  &get even segment boundary&
  WHILE NOT TBIT(segmap,i) AND ((seg:=scan_seg(i,med_cal))>i) DO
    IF (crunch_ok:=move_segment (seg,i,med_cal)) THEN
      i := i+med_cal;                        &fill w/ med. cal. next   &
  IF NOT TBIT(segmap,0) AND (scan_seg(i,big_cal)=4) THEN
    crunch_ok := move_segment (4,0,big_cal);
  crunch_segments := crunch_ok;
END crunch_segments;
```

```
SMBMGR.WORK.PD8510              THU, DEC 22, 1983, 10:45 AM     PAGE  18

#EJECT;
COMMENT
$DOC+

NAME--
  clear_cal
************************************************************************
*
* SHORT DESCRIPTION--
*   deletes a saved cal data
*
* EXTENDED DESCRIPTION--
*   This routine will delete a cal data that has been stored in the
*   data bubble by clearing directory entries and bits corresponding to
*   the cal data register that is to be deleted.  A message is displayed
*   indicating that a cal data is being deleted once a cal data register
*   has been selected.  Any cal data bubble segments that are freed up
*   as a result of a deleted cal will be subsequently garbage collected
*   so that all available segments are contiguous.
*
* INPUTS--
*   reg = cal data register number (1..8) to be deleted
*
* OUTPUTS-- none
*
* ROUTINES CALLED--
*   get_start_pg
*   crunch_segments
*   update_mbm_dir
*   tell
*   warn
*
* ERROR CONDITIONS AND RECOVERY--
*   none
*
* NOTES--
*
* AUTHOR--
*
************************************************************************
*
* INITIAL REFINEMENT--
*   get starting page of cal data corresponding to register to delete
*   IF starting > 0 (register contains data) THEN
*     display message indicating cal data is being deleted
*     clear bits in bubble segment bitmap correspoding to segments
*       occupied by cal data being deleted
*     clear out information words corresponding to deleted register
*     call routine to compact free bubble segment space
*     call routine to update new bubble information/directory
*     IF compacting and updating succeeds THEN
*       display message indicating cal data has been deleted
*     ELSE
*       display message indicating an error in deleting cal data
************************************************************************
```

```
SMBMGR.WORK.PD8510              THU, DEC 22, 1983, 10:45 AM     PAGE  19

*
* REVISION LOG--
*
************************************************************************
DECLARATION--
;
BOOLEAN PROCEDURE clear_cal (reg); VALUE reg; INTEGER reg;        ENTRY;
&
$DOC-&

BEGIN
  BOOLEAN clear_ok;
  INTEGER POINTER segmap,regmap;
  INTEGER i, seg;
  clear_ok := FALSE;
  IF get_start_pg (cal_file,reg) > 0 THEN
    BEGIN
      compute_tell (data_type_str, deleting_data);
      STPNTR (segmap, ADRS(mbm_dir&0&));
      STPNTR (regmap, ADRS(mbm_dir[reg]));
      seg := RIGHT(regmap,8);                     & starting segment &
      FOR i := 0 TO (regmap AND %0F)-1 DO
        segmap := RBIT(segmap, seg+i);            & clear out segment bits &
      mbm_dir[cal_dir_offset+reg] :=
      regmap := 0;                                & clear out register info&
      IF crunch_segments THEN                     & "garbage collect"      &
        clear_ok := update_mbm_dir;               & update cal. dir. info. &
      IF (bubble_alive:=clear_ok) THEN
        BEGIN
          tell (cal_reg_cleared);
          set_serial_poll (op_complete_srq);
        END
      ELSE
        BEGIN
          warn (cal_clear_error);
          set_serial_poll (op_failed_srq);
        END;
      IF dump_debug THEN
        BEGIN
          WSTR("Deleting Cal"); CRLF;
          cal_dump;
        END;
    END;
  clear_cal := clear_ok;
END clear_cal;
```

```
SMBMGR.WORK.PD8510              THU, DEC 22, 1983, 10:45 AM     PAGE  20

#EJECT;
COMMENT
$DOC+

NAME--
  cal_seg_size
************************************************************************
*
* SHORT DESCRIPTION--
*   indicates number of bubble segments needed to save a calibration
*
* EXTENDED DESCRIPTION--
*   This routine determines how many bubble segments  (1,2,4) are
*   required to store a cal given the number of bytes of the cal data
*   to be stored.
*
* INPUTS--
*   lgth = number of bytes of cal data to be stored
*
* OUTPUTS--
*   number of bubbles segments needed to save cal data
*   (0 indicates a 0 or >32K bytes was passed in lgth)
*
* ROUTINES CALLED-- none
*
* ERROR CONDITIONS AND RECOVERY--
*   Cal data lengths that are greater that 32K or less than 0 return
*   a value of 0.
*
* NOTES--
*   The integer constant "seg_size" defines the number of bubble pages
*   in each bubble segment (1 bubble page = 64 bytes).
*
* AUTHOR--
*
************************************************************************
*
* INITIAL REFINEMENT--
*   set default value to 0
*   IF number of bytes fits in 1 segment THEN assign a value of 1 ELSE
*   IF number of bytes fits in 2 segemnts THEN assign a value of 2 ELSE
*   IF number of bytes fits in 4 segments THEN assign a value of 4
*
************************************************************************
*
* REVISION LOG--
*
************************************************************************
DECLARATION--
;
INTEGER PROCEDURE cal_seg_size (lgth);                              ENTRY;
  VALUE lgth; DOUBLE lgth;
&
$DOC-&

BEGIN
```

SMBMGR.WORK.PD8510 THU, DEC 22, 1983, 10:45 AM PAGE 21

```
  cal_seg_size := 0;
  IF lgth > 0 THEN
  IF lgth <= LEFT(seg_size,6) THEN cal_seg_size := small_cal  ELSE
  IF lgth <= LEFT(seg_size,7) THEN cal_seg_size := med_cal    ELSE
  IF lgth <= LEFT(seg_size,8) THEN cal_seg_size := big_cal;
END cal_seg_size;                                  &
```

SMBMGR.WORK.PD8510 THU, DEC 22, 1983, 10:45 AM PAGE 22

```
%EJECT;
COMMENT
$DOC+

NAME--
  cal_seg_avail
*************************************************************************
*
* SHORT DESCRIPTION--
*   indicates the number of bubble segments available for cal data
*
* EXTENDED DESCRIPTION--
*   This routine determines the number of available bubble segments
*   for storing a cal by checking the bubble segment bitmap and counting
*   all bits that are clear.  Each clear bit corresponds to an available
*   bubble sengent.
*
* INPUTS--  none
*
* OUTPUTS--
*   available bubble segments for storing cal data (0..8)
*
* ROUTINES CALLED--  none
*
* ERROR CONDITIONS AND RECOVERY-- none
*
* NOTES--
*   The integer constant "seg_size" defines the number of bubble pages
*   in each bubble segment (1 bubble page = 64 bytes).
*
* AUTHOR--
*
*************************************************************************
*
* INITIAL REFINEMENT--
*   count clear (available segments) bits in bubble segment bitmap
*
*************************************************************************
*
* REVISION LOG--
*
*************************************************************************
DECLARATION--
;
INTEGER PROCEDURE cal_seg_avail;                                 ENTRY;
&
$DOC-&

BEGIN
  INTEGER segmap, seg=REGISTER 5, i=REGISTER 6;
  seg := 0;
  segmap := mbm_dir&O&;
  FOR i := 0 TO 7 DO
    IF NOT TBIT (segmap, i) THEN
      seg := seg+1;
  cal_seg_avail := seg;
```

SMBMGR.WORK.PD8510 THU, DEC 22, 1983, 10:45 AM PAGE 23

```
END cal_seg_avail;
```

SMBMGR.WORK.PD8510 THU, DEC 22, 1983, 10:45 AM PAGE 24

```
%EJECT;
COMMENT
$DOC+

NAME--
  ok_to_save_cal
*************************************************************************
*
* SHORT DESCRIPTION--
*   checks if cal data can stored
*
* EXTENDED DESCRIPTION--
*
* INPUTS--
*   reg  = cal data register that is to be stored
*   lgth = number of bytes of cal data to store
*
* OUTPUTS--
*   TRUE  = enough bubble segments available to store cal data
*   FALSE = no/not enough bubble segments available or too many bytes
*           to store (ie. over 32K).
*
* ROUTINES CALLED--
*
* ERROR CONDITIONS AND RECOVERY--
*
* NOTES--
*
* AUTHOR--
*
*************************************************************************
*
* INITIAL REFINEMENT--
*
*************************************************************************
*
* REVISION LOG--
*
*************************************************************************
DECLARATION--
;
BOOLEAN PROCEDURE ok_to_save_cal (reg,lgth);                     ENTRY;
  VALUE reg,lgth; INTEGER reg,lgth;
&
$DOC-&

BEGIN
  INTEGER cal_size, seg;
  INTEGER POINTER segmap;
  BOOLEAN no_problem;
  cal_size := seg := 0;
  no_problem := FALSE;
  & check for enough cal segments (include segments to be overwritten) &
  IF ((cal_size:=cal_seg_size(lgth)) > 0) AND
     ((cal_seg_avail+(mbm_dir[reg] AND %0F)-cal_size) >= 0) THEN
    BEGIN
```

```
SMBM..K.WORK.PD8510              THU, DEC 22, 1983, 10:45 AM     PAGE  25

      no_problem := TRUE;
      IF mbn_dir[reg+cal_dir_offset] > 0 THEN   & if cal reg full then &
        no_problem := clear_cal (reg);    & delete cal in reg selected &
      STPNTR (segmap, ADRS(mbn_dir&D&));  & segment bitmap to update   &
      WHILE TBIT(segmap,seg) AND (seg<8) DO
        seg := seg + cal_size;            & find 1st available segment &
      IF no_problem THEN
      IF seg >= 8 THEN                    & no segments left to save to&
        BEGIN
          warn (select_delete_cal_set);
          no_problem := FALSE;
        END
      ELSE
        BEGIN
          mbn_dir[reg+cal_dir_offset] := lgth;       & # bytes of cal  &
          mbn_dir[reg] := LEFT(seg,8) OR cal_size;   & update reg info &
          seg := seg-1;
          REPEAT cal_size DO  segmap:=SBIT(segmap,(seg:=seg+1));
        END;
      IF dump_debug THEN
        BEGIN
          WSTR("Saving Cal"); CRLF;
          cal_dump;
        END;
    END
  ELSE  & call wayne's stuff that tells user to delete a cal &
    warn (select_delete_cal_set);
  ok_to_save_cal := no_problem;
END save_cal;
```

```
SMBMGR.WORK.PD8510              THU, DEC 22, 1983, 10:45 AM     PAGE  26

#EJECT;
COMMENT
$DOC+

NAME--
  save_data
***********************************************************************
*
* SHORT DESCRIPTION--
*   saves data from RAM to bubble
*
* EXTENDED DESCRIPTION--
*   This routine will save save/recall and calibration data currently
*   in RAM to a register in bubble memory.  There are 7 save/recall
*   registers and from 2 to 8 calibration data registers (depending on
*   number of points).
*
*   These registers are fixed locations in bubble memory which are
*   accessed through initialized arrays of starting page numbers in
*   bubble corresponding to register numbers (segments in the case  of
*   calibration data which is stored somewhat variably).  The register
*   is determined through a softkey selection.
*
* INPUTS--
*   addr = starting RAM address of data to save
*   lgth = number of bytes from addr to save
*   type = instrument state (state_file) or calibration data (cal_file)
*          or memory trace (memory_file)
*   reg  = register number to store data into
*          1-7 for instrument states
*          1-8 for cal data
*          1-4 for memory traces
*
* OUTPUTS--  none
*
* ROUTINES CALLED--
*   wrt_mbn
*   tell
*   warn
*
* ERROR CONDITIONS AND RECOVERY--
*   With the possibility of bubble memory write failure, an error
*   message (warning) is displayed in the event of this occurence,
*   otherwise a message acknowledging the completion of the bubble
*   write is displayed.
*   Does NOT range check data types or register numbers for data types!
*
* NOTES--
*
* AUTHOR--
*
***********************************************************************
*
* INITIAL REFINEMENT--
*
***********************************************************************
```

```
SMBMGR.WORK.PD8510              THU, DEC 22, 1983, 10:45 AM     PAGE  27

*
* REVISION LOG--
*   1/28/83  -- made procedure return boolean value indicating failure
*               (write fail, data overflow) or success.
*
***********************************************************************
DECLARATION--

;
BOOLEAN PROCEDURE save_data (addr, lgth, type, reg);
VALUE addr,lgth,type,reg;
DOUBLE addr;
INTEGER lgth, type, reg;                                   ENTRY;
&
$DOC-&

BEGIN
  INTEGER POINTER ptr=addr;
  INTEGER i, pg_ptr, save_lgth;
  BOOLEAN omit_msg, save_ok;

  SUBROUTINE write_to_bubble;
  BEGIN
    i:=-1024;
    DO
      &
      save_ok:=wrt_mbn(ADRS(ptr[i:=i+1024]),set_add_mbn(pg_ptr,0,
                   (IF lgth>2048 THEN 2047 ELSE lgth-1)))
      &
      save_ok := wrt_mbn_ok (ADRS(ptr[i:=i+1024]), pg_ptr,
                            (IF lgth>2048 THEN 2047 ELSE lgth-1))
    UNTIL NOT save_ok OR ((lgth:=lgth-2048) <= 0);
    IF dump_debug THEN
      BEGIN WHEX(pg_ptr-1); CRLF; END;
  END write_to_bubble;

  save_ok := FALSE;
  IF NOT bubble_ok THEN
    warn (bubble_init_error)
  ELSE
    BEGIN
      omit_msg := (type=state_file) AND (reg=prior_state);
      IF type <> state_file THEN      & round down to nearest 64 bytes &
        lgth := save_lgth := lgth AND %FFC0;
      save_ok := (IF (type = cal_file) THEN
                    ok_to_save_cal (reg,lgth)
                  ELSE
                    (lgth <= mbn_reg_sz[type]));
      IF NOT save_ok THEN
        warn (data_overflow)
      ELSE
      IF (pg_ptr := get_start_pg(type,reg)) > 0 THEN
        BEGIN
          IF dump_debug THEN
            BEGIN
              WSTR("Saving data "); WHEX(type); WHEX(reg); CRLF;
              WSTR(" addr"); WHex(addr,8);
```

```
SMBMGR.WORK.PD8510              THU, DEC 22, 1983, 10:45 AM     PAGE  28

              WSTR(" lgth"); WHEX(lgth);
              WSTR(" pg"); WHEX(pg_ptr);
            END;
          write_to_bubble;
          IF save_ok THEN
          IF type = memory_file THEN  & lgth of mem. trace being saved &
            BEGIN
              mbn_dir [mem_dir_offset+reg] := save_lgth;
              save_ok := update_mbn_dir;
            END
          ELSE
          IF type = cal_file THEN
            BEGIN
              COMMENT write partial intstrument to bubble for cal data
                      set up partial save/recall addr. and lgths;
              save_ok := update_mbn_dir;
            END;
          IF NOT (bubble_alive := save_ok) THEN
            BEGIN
              compute_warn (data_type_str, save_error);
              set_serial_poll (op_failed_srq);
            END
          ELSE
          IF NOT omit_msg THEN
            BEGIN
              compute_tell (data_type_str, data_saved);
              set_serial_poll (op_complete_srq);
            END;
        END;
    END;
  save_data := save_ok;
END save_data;
```

```
#EJECT;
COMMENT
$DOC+

NAME--
  record_data
***********************************************************************
*
* SHORT DESCRIPTION--
*   saves data from bubble to tape
*
* EXTENDED DESCRIPTION--
*   This routines will record on tape all registers of a single data
*   type (save/recall or calibration) from bubble.  Specifically, either
*   ALL the save/recall registers or ALL the calibration data registers.
*   A buffer equivalent to the size of a single tape block (10 records
*   or 2560 bytes) is used to tranfer data from bubble to tape.
*   Registers of the same data type are located contiguously in bubble
*   memory to simplify data transfers.
*
*   The data buffer (big_buf) is loaded with bubble data (to capacity)
*   and exported to an external tape loading routine which contunues to
*   buffer any remaining bubble data starting from the last bubble page
*   buffered from this end.
*
* INPUTS--
*   type = data type found in bubble memory
*   id   = file number of data type to record to
*
* OUTPUTS--
*   none
*
* ROUTINES CALLED--
*   get_start_pg
*   read_mbm
*   record_file
*   warn
*
* ERROR CONDITIONS AND RECOVERY--
*   Any problems with reading bubble memory will display an error
*   message indicating this.  However, no further attempts will be
*   made to remedy the read failure and the data does not get saved
*   on tape.
*
* NOTES--
*   Individual or groups of registers cannot be recorded.
*
* AUTHOR--
*
***********************************************************************
*
* INITIAL REFINEMENT--
*   get the length (number of bytes) of data to go on tape
*   get the first page of the group of data registers
*   buffer up data from bubble
*   IF buffering succeeds THEN
```

```
*     call tape routine (record_file) to record data
*   ELSE
*     display error message
*
***********************************************************************
*
* REVISION LOG--
*
***********************************************************************
DECLARATION--
;
PROCEDURE record_data (type, id, reg);  VALUE type,id,reg;
INTEGER type,id,reg;                                              ENTRY;
&
$DOC-&

BEGIN
  DOUBLE lgth,big_buf;        & buffer 2560 bytes (1 tape block of data &
  INTEGER pg;
  IF (big_buf:=request_memory(2560))=0 THEN
    fatal (exceeded_available_memory)
  ELSE
  BEGIN
    IF type >= state_set THEN
      lgth := mbm_max_reg [type]
    ELSE
    CASE type-state_file OF
      BEGIN
        & state_file &   lgth := save_size;
        & memory_file &  lgth := mbm_dir [mem_dir_offset+reg];
        & cal_std_file & lgth := cal_kit_array_size;
        & cal_file &     lgth := mbm_dir [cal_dir_offset+reg]
      END;
    WHex(lgth,8); CRLF;
    IF (pg := get_start_pg (type,reg)) > 0 THEN
    IF read_mbm (big_buf, set_add_mbm(pg,0,(IF lgth>2304 THEN
    &2560 byte mbm buffer = 1 tape block&     2303 ELSE lgth-1)))
    &2304=2560-256 bytes of file header &
    THEN
      record_file (big_buf,             & mbm buffer address    &
                   lgth,                & number of bytes       &
                   (LEFT(type,4) OR id), & file no. and type    &
                   pg)                  & mbm page to read from &
    ELSE
      BEGIN
        bubble_alive := FALSE;
        macro_warn (file_error, record_macro);
      END;
    release_memory (big_buf);
  END;
END record_data;
```

```
#EJECT;
BOOLEAN PROCEDURE read_from_bubble (addr, lgth, pg);
  VALUE addr, lgth;  DOUBLE addr;  INTEGER lgth, pg;
BEGIN
  INTEGER POINTER ptr=addr;
  INTEGER i;
  BOOLEAN recall_ok;
  IF dump_debug THEN
    BEGIN
      WSTR(" addr "); WHex(addr,8); CRLF;
      WSTR(" lgth"); WHEX(lgth); CRLF;
      WSTR(" pages"); WHEX(pg);
    END;
  recall_ok := FALSE;
  i := -1024;
  DO & transfer 1K words at a time &
    recall_ok:=read_mbm(ADRS(ptr[i:=i+1024]),set_add_mbm(pg,0,
    (IF lgth>2048 THEN 2047 ELSE lgth-1)))
  UNTIL NOT recall_ok OR ((lgth:=lgth-2048) <= 0);
  read_from_bubble := bubble_alive := recall_ok;
  IF dump_debug THEN
    BEGIN
      WHEX(pg-1); CRLF;
    END;
END read_from_bubble;
```

```
#EJECT;
BOOLEAN PROCEDURE read_data_header (addr, type, reg);
  VALUE addr, type, reg;  DOUBLE addr;  INTEGER type, reg;        ENTRY;
BEGIN
  INTEGER pg;
  read_data_header := IF (pg := get_start_pg (type,reg)) > 0 THEN
                          read_from_bubble (addr,header_buffer_size,pg)
                      ELSE
                          FALSE;
END read_data_header;
```

```
#EJECT;
COMMENT
$DOC+

NAME--
  recall_data
***********************************************************************
*
* SHORT DESCRIPTION--
*   transfer data from bubble to RAM
*
* EXTENDED DESCRIPTION--
*   This routine will transfer data from a bubble register to an area
*   in RAM which uses and corresponds to that data.  Any on-going sweep
*   is abort prior to recalling data.  An external routine is then
*   called to update the data traces and display annotations to reflect
*   the newly recalled data, and the sweep is restarted.
*
* INPUTS--
*   addr = RAM address to start transferring data to
*   type = type of data being transferred from bubble to RAM
*          (cal_file, state_file, memory_file ONLY !!!)
*   reg  = bubble register selected containing data to go to RAM
*
* OUTPUTS--  none
*
* ROUTINES CALLED--
*   do_recall
*   read_mbn
*   tell
*   warn
*
* ERROR CONDITIONS AND RECOVERY--
*   Any failures in reading bubble will display an error message that
*   indicates this and the data may or may not be partially recalled.
*   There is currently no recovery from partial data transfers due to
*   a bubble read failure.  A recall from tape, instrument preset, or
*   power-up will fix any partial data problem that occurs as a result
*   of this possible failure.
*   Only individual cal data, instrument states, and memory traces are
*   recalled in this routine.  Other data types are not checked and
*   cause the routine to be aborted.
*
* NOTES--
*   This routine is also used to recall power-up or instrument preset
*   states for units with secondary and readable bubbles.
*
* AUTHOR--
*
***********************************************************************
*
* INITIAL REFINEMENT--
*   IF bubble exists and is readable THEN
*      get starting page of data register requested
*      get length (number of bytes) of data to transfer
*      abort the sweep
```

```
*      transfer data from register to RAM
*      call routine to update display traces and annotations
*      restart the sweep
*      IF data transfers successfully THEN
*        display acknowledging message
*      ELSE
*        display error message
*
***********************************************************************
*
* REVISION LOG--
*   1/28/83  --  made procedure return boolean value indicating failure
*                (read fail, empty register) or success.
*
***********************************************************************
DECLARATION--
;
BOOLEAN PROCEDURE recall_data (addr, type, reg);
  VALUE addr, type, reg;
  DOUBLE addr;  INTEGER type, reg;                                ENTRY;
&
$DOC-&

BEGIN
  #FILE fmenu.work;
  INTEGER pg, lgth;
  ALPHA type_str;
  BOOLEAN recall_ok;              & flag determining recall success  &

  IF dump_debug THEN
    BEGIN  WSTR("Recalling data "); WHEX(type); WHEX(reg); CRLF; END;
  type_str := file_type[type];
  IF type <> cal_std_file THEN
    compute_tell (type_str, recalling_data);
  IF (pg := get_start_pg (type,reg)) > 0 THEN
  BEGIN
    IF (type = state_file) THEN
      lgth := (IF (reg=prior_state) THEN
                 last_state_size
               ELSE
                 save_size)
    ELSE
    IF (type = cal_std_file) THEN
      lgth := cal_kit_array_size
    ELSE
      BEGIN
        INTEGER n;
        n := (IF type=cal_file THEN cal_dir_offset ELSE mem_dir_offset);
        lgth := mbn_dir [n+reg] AND %FFC0;
      END;
    recall_data := FALSE;
    IF lgth <= 0 THEN
      compute_warn (data_type_str, no_reg_data)
    ELSE
    IF read_from_bubble (addr, lgth, pg) THEN
      BEGIN
```

```
        IF type = state_file THEN
          BEGIN
            do_recall;
            init_user_graphics;
            restore_8510_display;
            highlight_menu;
          END;
        IF type <> cal_std_file THEN  &don't acknowledge cal kit recall&
          BEGIN
            compute_tell (type_str, data_recalled);
            IF type = cal_file THEN
              beep (done_tone);
          END;
        recall_data := TRUE;
        set_serial_poll (op_complete_srq);
      END
    ELSE
      BEGIN
        WHEX(status_mbn); CRLF;
        compute_warn (type_str, recall_error);
        set_serial_poll (op_failed_srq);
      END;

  END;
END recall_data;
```

```
#EJECT;
COMMENT
$DOC+

NAME--
  restore_data
***********************************************************************
*
* SHORT DESCRIPTION--
*
* EXTENDED DESCRIPTION--
*
* INPUTS--
*
* OUTPUTS--
*
* ROUTINES CALLED--
*
* ERROR CONDITIONS AND RECOVERY--
*
* NOTES--
*
* AUTHOR--
*
***********************************************************************
*
* INITIAL REFINEMENT--
*
***********************************************************************
*
* REVISION LOG--
*
***********************************************************************
DECLARATION--
;
PROCEDURE restore_data (type,id,reg);  VALUE type,id,reg;
INTEGER type,id,reg;                                              ENTRY;
&
$DOC-&

BEGIN
  INTEGER pg;
  DOUBLE buffer;
  restoring_from_tape := TRUE;
  IF valid_directory THEN
    IF (pg := get_start_pg (type,reg)) > 0 THEN
      IF (buffer := request_memory (2560)) = 0 THEN
        fatal (exceeded_available_memory)
      ELSE
        BEGIN
          BOOLEAN continue;
          continue := TRUE;
          IF type = memory_file THEN        & export reg to restore to &
            mbn_dir[mem_dir_offset] := reg
          ELSE
          IF type = cal_file THEN
```

```
SMBMGR.WORK.PD8510                THU, DEC 22, 1983, 10:45 AM      PAGE  37

          mbm_dir[cal_dir_offset] := reg;
        restore_file (buffer, LEFT(type,4) OR id, pg);
        release_memory (buffer);
        IF type = cal_std_file THEN                  & new softkey label &
          select_cal_kit (reg);
      END;
  restoring_from_tape := FALSE;
END restore_data;
```

```
SMBMGR.WORK.PD8510                THU, DEC 22, 1983, 10:45 AM      PAGE  38

#EJECT;
BOOLEAN PROCEDURE load_dg_data;                                    ENTRY;
BEGIN
  DOUBLE lgth;
  INTEGER POINTER dg_RAM;
  INTEGER i;
  INTEGER pg;
  BOOLEAN load_ok;
  lgth := ADRS(mark_dg_top) - ADRS(mark_dg_base);
  SIPNTR (dg_RAM, ADRS(mark_dg_base));
  pg := dg_mem_base_pg;
  IF dump_debug THEN
    BEGIN
      WSTR("loading  DG RAM: "); WHex(ADRS(mark_dg_base),8);
      WHex(ADRS(mark_dg_top),8); WSTR(" from pages");
      WHEX(pg);
    END;
  i := -1024;
  DO & transfer 1K words at a time &
    load_ok :=read_mbm(ADRS(dg_RAM[i:=i+1024]),set_add_mbm(pg,0,
    (IF lgth>2048 THEN 2047 ELSE lgth-1)))
  UNTIL NOT load_ok OR ((lgth:=lgth-2048) <= 0);
  IF dump_debug THEN
    BEGIN WHEX(pg-1); CRLF; WHEX(status_mbm); CRLF; END;
  IF NOT load_ok THEN
    fatal (bubble_init_error);
  load_dg_data := load_ok;
END load_dg_data;
```

```
SMBMGR.WORK.PD8510                THU, DEC 22, 1983, 10:45 AM      PAGE  39

#EJECT;
BOOLEAN SUBROUTINE recall_lunplus;                                 ENTRY;
BEGIN
  pg_check := hpib_addr_pg;
  recall_lunplus := read_mbm (ADRS(priv_ib_lun_table),
                              set_add_mbm (pg_check,0,63));
  IF dump_debug THEN
    BEGIN
      WSTR("Loading 'lunplus' stuff"); WHex(ADRS(priv_ib_lun_table),8);
      WHEX(hpib_addr_pg); CRLF;
    END;
END recall_hpib_address;

BOOLEAN SUBROUTINE save_lunplus;                                   ENTRY;
BEGIN
  pg_check := hpib_addr_pg;
  COMMENT
  save_lunplus := wrt_mbm (ADRS(priv_ib_lun_table),
                           set_add_mbm (pg_check,0,63));
  save_lunplus := wrt_mbm_ok (ADRS(priv_ib_lun_table), pg_check, 63);
END save_hpib_address;
```

```
SMBMGR.WORK.PD8510                THU, DEC 22, 1983, 10:45 AM      PAGE  40

#EJECT;
COMMENT
$DOC+

NAME--
  init_save_recall
*************************************************************************
*
* SHORT DESCRIPTION--
*   initialize arrays and variables for saving/recalling data
*
* EXTENDED DESCRIPTION--
*
* INPUTS--   none
*
* OUTPUTS--  none
*
* ROUTINES CALLED--
*
* ERROR CONDITIONS AND RECOVERY--
*   none
*
* NOTES--
*
* AUTHOR--
*
*************************************************************************
*
* INITIAL REFINEMENT--
*
*************************************************************************
*
* REVISION LOG--
*
*************************************************************************
DECLARATION--
;
PROCEDURE init_save_recall;                                        ENTRY;
&
$DOC-&

BEGIN
  INTEGER i=REGISTER 6;
  INTEGER page_start,page_cnt;

  & save/recall information &
  page_cnt := ARIGHT(save_size,6);          & byte cnt DIV 64 byte-page &
  IF (save_size AND Z3F) > 0 THEN
    page_cnt := page_cnt + 1;
  FOR i := 0 TO preset_state DO
    state_mbm[i+1] := state_page_start + page_cnt*i;
  mbm_reg_sz[state_file] := save_size;
  mbm_max_reg[state_set] := page_cnt*64*(prior_state);
  page_start := state_mbm [prior_state] +   & compute start of next pg &
                ARIGHT(last_state_size,6);        & last_state_size/64 &
  IF (last_state_size AND Z3F) <> 0 THEN
```

SNBMGR.WORK.PD8510 THU, DEC 22, 1983, 10:45 AM PAGE 41

```
   page_start := page_start + 1;

  & cal stds table information &
  mbm_reg_sz [cal_std_file] := cal_kit_array_size;
  mbm_max_reg [cal_std_set] := 2*cal_kit_array_size;
  cal_std_mbm[1] := page_start;
  cal_std_mbm[2] := page_start + cstd_size;

  hpib_addr_pg := page_start + 2*cstd_size;

  & display RAM to be downloaded on "power up" &
  dg_mem_base_pg  := hpib_addr_pg + 1;

  & cal. data information &
  mbm_reg_sz [cal_file] := 128;
  mbm_max_reg [cal_set] := 58368;    & 114 pgs * 8 segments * 64 bytes &

  & memory data information &
  page_cnt := ((2406+header_size)/64 + 1);
  FOR i := 1 TO 4 DO
    memory_mbm[i] := mem_start + page_cnt*(i-1);
  mbm_reg_sz [memory_file] := page_cnt * 64;
  mbm_max_reg [memory_set] := page_cnt*64*4;

  & initialization calls &
  bubble_alive := restoring_from_tape := FALSE;
  bubble_alive := bubble_ok;
  load_dg_data;
END init_save_recall;

END$
```

LMBMLOAD.WORK.PD8510 THU, DEC 22, 1983, 10:45 AM PAGE 1

```
rmbmload.work,
rxmbm.work,
rlibrary.work,
rstddata.work,
rtitle.work,
rmarkdg.work,   &---\  Nothing before this should exceed %109800     &
ralphas.work,   &   |                                                 &
ralabel.work,   &   |                                                 &
ratables.work,  &   |                                                 &
rmathtbl.work,  &   |                                                 &
rskey.work,     &   \  These must all be grouped identically with     &
rskpos.work,    &   /  lmain.work.                                    &
rkeys.work,     &   |                                                 &
ribtree.work,   &   |                                                 &
rcpltbl.work,   &   |                                                 &
rdgtop.work,    &*  |                                                 &
rchdata.work,   &   |                                                 &
rlunplus.work,  &   |                                                 &
rmarkmem.work,  &   |                                                 &
rstack.work,    & --/      MUST BE LAST RELOCATABLE                   &
/E
ROM=100H RAM=FFF800H;
title:  MAIN=FFF08000H  NOLOAD;   & dg (long addr) &
markd:  MAIN=FFF09800H;
lunpl:
markm:  RAM=FFF20000H;      & just RAM reservation. display address &
stack:  RAM=FFFF8000H;
```

MMBMLOAD.WORK.PD8510 THU, DEC 22, 1983, 10:45 AM PAGE 1

```
M68KLDR(9.6.83)     THU, DEC 22, 1983,  6:01 AM
 NAME   MAIN LIMITS          BASE PAGE            RAM

 mbmlo 000D42 00190A         000100 000108        FFF7A6 FFF800
       THU, DEC 22, 1983,  5:37 AM  LIBRN   PD8510

 xmbm  00190A 00196E         000108 000108        FFF7A6 FFF7A6
       THU, DEC 22, 1983,  5:59 AM  LIBRN   PD8510

 mathf 00196E 001EE4         000108 000200        FFF7A6 FFF7A6
       THU, DEC 22, 1983,  5:06 AM  LIBRN   PD8510

 CPX   001EE4 002254         000200 000200        FFF7A6 FFF7A6
       THU, DEC 22, 1983,  5:07 AM  MOD JTB 12/22/82

 FLTPT 002254 00255E         000200 000200        FFF7A6 FFF7A6
       THU, DEC 22, 1983,  5:07 AM  DDS/jtb APR 83

 QUAD  00255E 0028EE         000200 000200        FFF7A6 FFF7A6
       THU, DEC 22, 1983,  5:07 AM  JTB 23.10.81

 DIV3  0028EE 0029E4         000200 000200        FFF7A6 FFF7A6
       THU, DEC 22, 1983,  5:07 AM  jtb 3/83

 SQRT  0029E4 002A44         000200 000200        FFF7A6 FFF7A6
       THU, DEC 22, 1983,  5:07 AM  FIX 27.8.80

 CASE  002A44 002A5C         000200 000200        FFF7A6 FFF7A6
       THU, DEC 22, 1983,  5:07 AM  FIX 1.5.80: MAKE CALL RELATIVE

 FMT   002A5C 003194         000200 00020A        FFF7A6 FFF7A6
       THU, DEC 22, 1983,  5:08 AM  JTB JULY 28,1982

 TERM  003194 0032F2         00020A 00020A        FFF794 FFF7A6
       THU, DEC 22, 1983,  5:08 AM  LIBRN   PD8510

 stdda 0032F2 0032F2         00020A 000D42        FFF794 FFF794
       THU, DEC 22, 1983,  5:49 AM  LIBRN   PD8510

 markd F09800 F09800         000D42 000D42        FFF794 FFF794
       THU, DEC 22, 1983,  5:33 AM  LIBRN   PD8510

 alpha F09800 F0A34E         000D42 000D42        FFF794 FFF794
       THU, DEC 22, 1983,  5:12 AM  LIBRN   PD8510

 alabe F0A34E F0A7E0         000D42 000D42        FFF794 FFF794
       THU, DEC 22, 1983,  5:12 AM  LIBRN   PD8510

 atabl F0A7E0 F0AE68         000D42 000D42        FFF794 FFF794
       THU, DEC 22, 1983,  5:14 AM  LIBRN   PD8510

 matht F0AE68 F0AFAE         000D42 000D42        FFF794 FFF794
       FRI, FEB  4, 1983,  3:26 PM  JTB,LANI.PD8510   9/3/82

 skey  F0AFAE F0CD4C         000D42 000D42        FFF794 FFF794
```

MMBMLOAD.WORK.PD8510 THU, DEC 22, 1983, 10:45 AM PAGE 2

```
       THU, DEC 22, 1983,  5:48 AM  LIBRN   PD8510

 skpos F0CD4C F0CDA4         000D42 000D42        FFF794 FFF794
       THU, DEC 22, 1983,  5:48 AM  LIBRN   PD8510

 keys  F0CDA4 F0CE70         000D42 000D42        FFF794 FFF794
       THU, DEC 22, 1983,  5:32 AM  LIBRN   PD8510

 ibtre F0CE70 F0E098         000D42 000D42        FFF794 FFF794
       THU, DEC 22, 1983,  5:30 AM  LIBRN   PD8510

 cpltb F0E098 F0E126         000D42 000D42        FFF794 FFF794
       THU, DEC 22, 1983,  5:23 AM  LIBRN   PD8510

 dgtop F0E126 F0E126         000D42 000D42        FFF794 FFF794
       THU, DEC 22, 1983,  5:24 AM  LIBRN   PD8510

 chdat F0E126 F0F4CC         000D42 000D42        FFF794 FFF794
       THU, DEC 22, 1983,  5:18 AM  LIBRN   PD8510

 lunpl F0F4CC F0F50E         000D42 000D42        FFF794 FFF794
       THU, DEC 22, 1983,  5:32 AM  LIBRN   PD8510

 stack F0F50E F0F50E         000D42 000D42        FF8000 FF8000
       THU, DEC 22, 1983,  5:48 AM  LIBRN   PD8510

       LATEST DATE: THU, DEC 22, 1983,  5:59 AM

       INITIAL STACK POINTER / GLOBAL REG = FF8000
```

| | | | | | | | |
|---|---|---|---|---|---|---|---|
| $RAM$ | 000100 | ABS2 | 002254 | ABSA | 00255E | ADD1 | 001F16 |
| ADD1A | 001F00 | ADD1G | 001F06 | ADD1M | 001F0C | ADD1T | 001F12 |
| ADD2 | 002204 | ADD2A | 0022D0 | ADD2G | 0022CA | ADD2M | 0022C4 |
| ADD2T | 00228E | ADDCP | FFF80E | ADDE | 002192 | ADDE_ptr | 0021A2 |
| ADDFP | FFF836 | ADDLF | FFF918 | ATAN | 001CCE | BESI | 001D50 |
| CASE | 002A44 | CMP2 | 00237C | CMP2A | 00235E | CMP2G | 002358 |
| CMP2M | 002352 | CMP2T | 00234C | CMPR | 00258A | CMPAA | 002568 |
| CMPAG | 00256C | CMPAM | 002570 | CMPAT | 002574 | CNV13 | 002482 |
| CNV14 | 0024D4 | CNV15 | 002482 | CNV1E | 00207A | CNV1E_save | 002068 |
| CNV23 | 002482 | CNV24 | 0024D4 | CNV25 | 002482 | CNV2A | 002870 |
| CNV2E | 002040 | CNV31 | 0024C0 | CNV32 | 0024C2 | CNV3A | 002864 |
| CNV41 | 0024BE | CNV42 | 002488 | CNV4A | 002862 | CNV51 | 0024BC |
| CNV52 | 0024B6 | CNV5A | 002860 | CNVA2 | 0028C4 | CNVA3 | 00286C |
| CNVA4 | 00286C | CNVA5 | 00286C | CNVE1 | 0020FA | CNVE20_1 | 00210A |
| CNVe1 | 0020FC | COS | 001C32 | CPINV | FFF9CC | CPR2 | 00237A |
| CPR2A | 002376 | CPR2G | 002370 | CPR2M | 00236A | CPR2T | 002364 |
| CPRA | 002586 | CPRAA | 002578 | CPRAG | 00257C | CPRAM | 002580 |
| CPRAT | 002584 | CPXMR | FFF9BA | CRLF | 0031D8 | DADLF | FFF9E0 |
| DIV1 | 001FFE | DIV1A | 001FCC | DIV1G | 001FD2 | DIV1M | 001FD8 |
| DIV1T | 001FDE | DIV2 | 0023D8 | DIV2A | 0023BA | DIV2G | 0023B4 |
| DIV2M | 0023AE | DIV2T | 0023A8 | DIV3 | 002966 | DIV3A | 002952 |
| DIV3G | 00294E | DIV3L | 0029A4 | DIV3M | 00294A | DIV3R | 0029CE |
| DIV3T | 002946 | DIV9 | 00267C | DIVA | 00283E | DIVAA | 002828 |
| DIVAG | 00282E | DIVAM | 002834 | DIVAT | 00283A | DIVE | 00223C |

```
MMBMLOAD.WORK.PD8510          THU, DEC 22, 1983, 10:45 AM     PAGE   3

DIVE_ptr    002246  DIVFP        FFF91E  DVR1         001FFA  DVR1A        001FE4
DVR1G       001FEA  DVR1M        001FF0  DVR1T        001FF6  DVR2         0023D6
DVR2A       002302  DVR2G        0023CC  DVR2M        0023C6  DVR2T        0023C0
DVR3        002964  DVR3A        002962  DVR3G        00295E  DVR3M        00295A
DVR3T       002956  DVRA         002858  DVRAA        002842  DVRAG        002848
DVRAM       00284E  DVRAT        002854  DVRE         0021F8  DVRE_ptr     002202
EXP         001B76  IFCAM        FFF976  LBL_INDEX    F0B848  LDR2A        002934
LDR2G       002922  LDR2M        00290E  LDR2T        0028FC  LDRAA        002584
LDRAG       0025C8  LDRAM        0025DC  LDRAT        0025A0  LLDA0        FFF906
LLDA2       FFF90A  LLDMY        FFF90E  LOG2         001E30  MCPDIV       FFF992
MCPMP       FFF9BE  MD8DG        FFF926  MODFR        FFF86C  MOFR         FFF84A
MDSFR       FFF894  MINTP        FFF8D0  MOD2         002392  MOD2A        00238A
MOD2G       002384  MOD3         0028F4  MOD3A        0028F2  MOD3G        0028EE
MPLDG       FFF942  MPLOG        FFF8C8  MPY1         001F86  MPY1A        001F70
MPY1G       001F76  MPY1M        001F7C  MPY1T        001F82  MPY2         002292
MPY2A       00228E  MPY2G        002288  MPY2M        002282  MPY2T        00227C
MPY3        00250A  MPY3A        002506  MPY3G        002500  MPY3L        002518
MPY3M       0024FA  MPY3T        0024F4  MPY9         0025F2  MPYA         00281E
MPYAA       002808  MPYAG        00280E  MPYAM        002814  MPYAT        00281A
MPYAV       FFF9A4  MPYDI        FFF8FA  MPYE         002164  MPYE_ptr     002172
MPYE_ptrs   002152  MPYFP        FFF82E  MPYLF        FFF914  MRLDG        FFF930
MSHFT       FFF950  MYNRM        FFF922  MultInit1    FFF816  MultInit2    FFF81C
NEG1        001EE4  NEG2         002258  NEGA         002562  Pi           000114
Pi2         000118  Pi4          00011C  Pi8          000120  RABS2        002270
RCHAR       0032DE  RDEXP        FFF912  RNEG1        001EEE  RNEG2        002274
SBR1        001F5A  SBR1A        001F40  SBR1G        001F46  SBR1M        001F4C
SBR1T       001F52  SBR2         002344  SBR2A        002340  SBR2G        00233A
SBR2M       002334  SBR2T        00232E  SBRE         0021D0  SBRE_ptr     0021D6
SIN         00188A  SK_LABEL     F0B544  SK_MENU      F0B420  SQRT         0029E4
SUB1        001F5E  SUB1A        001F28  SUB1G        001F2E  SUB1M        001F34
SUB1T       001F3A  SUB2         002346  SUB2A        002328  SUB2G        002322
SUB2M       00231C  SUB2T        002316  SUBCP        FFF81E  SUBE         0021DC
SUBE_ptr    0021EA  SUBFP        FFF840  SUBLF        FFF91A  Sqrt2        000124
TENI        001972  TWOX         001AAA  TwoPi        000110  WCHAR        003198
WCPX        00325E  WHEX         0032C2  WHex         003280  WNUM         0031F0
WQUAD       003212  WREAL        003238  WSTR         0031BE  XFM2P        FFF8A4
XFM2Q       FFF8DA  active_functF0A352b  active_tableF0AE1E  active_tableF0ADF2
atn_table   F0AEAA  bcd_of_int   002EE0  blanks       F0CD6E  bot_key_tablF0CDF0
byte_list   F09804  ch_cmd1_lineF0F0A1   ch_cmd2_lineF0F0D7  ch_table     F0F1A2
copy_user3  002124  coupled_bitmF0F172   coupled_chtaF0E09Cd coupled_chtaF0E0F8
deg_to_radia000128  display_alteF0AD68v  elec_delay   F0EF5E exp_cmplx    001DCA
exp_overflow001FBE  fetch_CNVE1  0020F6  field        F0CD4E format       F0EEA4
format_3_cmp002AFC  format_doubl002A5E   format_integ002A5C  format_quad  002AA6
format_real 002ADA  format_tableF0A8A0   hilite_bitmaF0F112  hilite_info  F0F112
ib_link     F0D480  if_ref_gain  F0F060  if_test_gainF0F05E  init_mbm     00190C
kit_base    00020A  kit_base2    0007A6  last_state   F0F056 limit        F0A944
log_scale_diF0AC34  log_table    F0AE68  mark_dg_baseF09800  mark_dg_top  F0E126
mark_stack  F0F50E  marker_stateF0F068   max_dump     F0F49C max_save     F0F392
mbm_misc_staFFFC00g mbm_prgm_staF9FC00   mbm_sub_prgmFFFC00  min_save     F0E12A
mkr_imag_forF0A936  mkr_imag_sufF0A892   mkr_real_forF0A928  mkr_real_sufF0A884
mnem        F0CE74  number_of_grF0F056   old_id       F0F041 parameter_deF0EF8E
parms_mbm   001932  plot_quadranF0F066   plotter_pen  F0F10C priv_ib_lun_F0F4CE
read_boot_mb00195A  read_mbm     00194A  ref_positionF0E53E  ref_value    F0E98E
scale       F0E0BE  scale_factorF0A8F2   set_add_mbm  00193A sk_line1     F0CD84
sk_line2    F0CD94  speed_of_lig000130   speed_of_lig00012C  sqrt_tbl     F0AEAC
srq_mask_priF0F062  srq_mask_secF0F064   status_mbm   001942 step_size    F0F05C
```

```
MMBMLOAD.WORK.PD8510          THU, DEC 22, 1983, 10:45 AM     PAGE   4

suffix      F0A7E4  sweep_mode  F0F058  test_mbm    00192A  title_line  F0F06B
top_key_tablF0CDA8  trace_mode  F0F05A  unscale_factF0AC0A  urt_boot_mbm001962
urt_mbm     001952

HIERARCHY LIST

CASE:
    entry pts:      CASE
    referenced by:  mathf
CNV9X:
    entry pts:      CNV92     CNV9A
    externals:      CMPAA     CNV32     DIVAA     MPY2M     MPY3A
          MPYAA     MPYAM
    modules needed: FLTPT     QUAD
CPX:
    entry pts:      ADD1      ADD1A     ADD1G     ADD1M     ADD1T
          ADDE      ADDE_ptr  CNV1E     CNV1E_save          CNV2E
          CNVE1     CNVE20_1  CNVe1     DIV1      DIV1A     DIV1G
          DIV1M     DIV1T     DIVE      DIVE_ptr  DVR1      DVR1A
          DVR1G     DVR1M     DVR1T     DVRE      DVRE_ptr  MPY1
          MPY1A     MPY1G     MPY1M     MPY1T     MPYE      MPYE_ptr
          MPYE_ptrs NEG1      RNEG1     SBR1      SBR1A     SBR1G
          SBR1M     SBR1T     SBRE      SBRE_ptr  SUB1      SUB1A
          SUB1G     SUB1M     SUB1T     SUBE      SUBE_ptr  copy_user3
          exp_overflow        fetch_CNVE1
    externals:      ADD2      ADDCP     DVR2      LDRAA     LDRAG
          LDRAM     LDRAT     MCPDIV    MCPMP     MPY2      NEG2
          RNEG2     SBR2      SUB2      SUBCP
    referenced by:  FMT
    modules needed: FLTPT     QUAD      mathf
DIV3:
    entry pts:      DIV3      DIV3A     DIV3G     DIV3L     DIV3M
          DIV3R     DIV3T     DVR3      DVR3A     DVR3G     DVR3M
          DVR3T     LDR2A     LDR2G     LDR2M     LDR2T     MOD3
          MOD3A     MOD3G
    referenced by:  FLTPT     FMT       QUAD      mbmlo
FLTPT:
    entry pts:      ABS2      ADD2      ADD2A     ADD2G     ADD2M
          ADD2T     CMP2      CMP2A     CMP2G     CMP2M     CMP2T
          CNV13     CNV14     CNV15     CNV23     CNV24     CNV25
          CNV31     CNV32     CNV41     CNV42     CNV51     CNV52
          CPR2      CPR2A     CPR2G     CPR2M     CPR2T     DIV2
          DIV2A     DIV2G     DIV2M     DIV2T     DVR2      DVR2A
          DVR2G     DVR2M     DVR2T     MOD2      MOD2A     MOD2G
          MPY2      MPY2A     MPY2G     MPY2M     MPY2T     MPY3
          MPY3A     MPY3G     MPY3L     MPY3M     MPY3T     NEG2
          RABS2     RNEG2     SBR2      SBR2A     SBR2G     SBR2M
          SBR2T     SUB2      SUB2A     SUB2G     SUB2M     SUB2T
    externals:      ADDLF     DIVFP     LDR2A     LDR2G     LDR2M
          LDR2T     LLDA0     LLDA2     LLDMY     MPYDI     MPYLF
          MYNRM     RDEXP     SUBLF
    referenced by:  CNV9X     CPX       FMT       QUAD      SQRT
          mathf
    modules needed: DIV3      mathf
```

```
MMBMLOAD.WORK.PD8510          THU, DEC 22, 1983, 10:45 AM     PAGE   5

FMT:
    entry pts:      bcd_of_int          format_3_cmpx       format_double
          format_integer      format_quad         format_real
    externals:      CMP2      CNVE1     DIV3L     MPY2      MPY3L
          NEG2      TENI
    referenced by:  TERM
    modules needed: CPX       DIV3      FLTPT     mathf
QUAD:
    entry pts:      ABSA      CMPA      CMPAA     CMPAG     CMPAM
          CMPAT     CNV2A     CNV3A     CNV4A     CNV5A     CNVA2
          CNVA3     CNVA4     CNVA5     CPRA      CPRAA     CPRAG
          CPRAM     CPRAT     DIV9      DIVA      DIVAA     DIVAG
          DIVAM     DIVAT     DVRA      DVRAA     DVRAG     DVRAM
          DVRAT     LDRAA     LDRAG     LDRAM     LDRAT     MPY9
          MPYA      MPYAA     MPYAG     MPYAM     MPYAT     NEGA
    externals:      CNV23     CNV32     DIV3L
    referenced by:  CNV9X     CPX
    modules needed: DIV3      FLTPT
SQRT:
    entry pts:      SQRT
    externals:      NEG2
    referenced by:  mathf
    modules needed: FLTPT
TERM:
    entry pts:      CRLF      RCHAR     WCHAR     WCPX      WHEX
          WHex      WNUM      WQUAD     WREAL     WSTR
    externals:      format_double       format_quad         format_real
    referenced by:  fifo      kerne     mbmlo
    modules needed: FMT
alabe:
    entry pts:      active_function_label
    referenced by:  mbmlo
alpha:
    entry pts:      byte_list
    referenced by:  mbmlo
atabl:
    entry pts:      active_table_type   active_tables       display_alternate_value
          format_table        limit     log_scale_div_3     mkr_imag_format
          mkr_imag_suffix     mkr_real_format     mkr_real_suffix
          scale_factors       suffix    unscale_factors
    referenced by:  mbmlo
chdat:
    entry pts:      ch_cmd1_line        ch_cmd2_line        ch_table
          coupled_bitmap      elec_delay          format    hilite_bitmap
          hilite_info         if_ref_gain         if_test_gain
          last_state          marker_state        max_dump  max_save
          min_save  number_of_groups    old_id    parameter_descriptor
          plot_quadrant       plotter_pen         ref_position
          ref_value scale     srq_mask_primary    srq_mask_secondary
          step_size sweep_mode          title_line          trace_mode
    referenced by:  mbmlo     title
cpltb:
    entry pts:      coupled_chtable_index         coupled_chtable_size
    referenced by:  mbmlo
dgtop:
    entry pts:      mark_dg_top
```

```
MMBMLOAD.WORK.PD8510          THU, DEC 22, 1983, 10:45 AM     PAGE   6

    referenced by:  kerne     mbmlo
displ:
    entry pts:      clear_display       crlf      dg_hex    dg_read
          dg_read_xy          dg_write  draw      init_display
          jmp       jsr       lb        move      move2     movech
          movech2   plot      print_hex printch   rts       setattribute
          xdraw     ydraw
    referenced by:  title
dispr:
    entry pts:      wrt_disp_byte       wrt_disp_dbl        wrt_disp_int
          wrt_disp_quad       wrt_disp_real       wrt_disp_str
    referenced by:  title
fifo:
    entry pts:      array_update_fifo   empty_fifo          init_fifo
          keyboard_fifo       public_ib_fifo      read_fifo token_fifo
          write_fifo
    externals:      CRLF      WHEX      WHex      WSTR      acquire
          pending   release   resource_init       send      signal_init
          wait
    modules needed: TERM      kerne
ibtre:
    entry pts:      ib_link   mnem
    referenced by:  mbmlo
intrp:
    entry pts:      irack     iradr     irclr     irdis     iren
          irint     irirr     irrdy     irset
    referenced by:  kerne
kerne:
    entry pts:      abort     acquire   awaited   conditional_acquire
          counter   create    delay     init_kernel         intrpt_bottom
          intrpt_delay_timer  intrpt_priv_ib_srq  intrpt_rpg          intrpt_tick
          intrpt_top_key      intrpt_uart         link      pause
          pending   preempt   ready     release   resource_init
          run       running   send      signal_init         snapshot
          stack_top terminate wait      waitio
    externals:      $RAM$     CRLF      MYNRM     RDEXP     WHEX
          WHex      WSTR      fatal     irack     iradr     irdis
          iren      mark0     mark1     mark3     mark_dg_base
          mark_dg_top         mark_stack          update_hpib_leds
    referenced by:  fifo
    modules needed: TERM      dgtop     intrp     markd     mathf
          mbmlo     stack
keys:
    entry pts:      bot_key_table       top_key_table
    referenced by:  mbmlo
lunpl:
    entry pts:      priv_ib_lun_table
    referenced by:  mbmlo
markd:
    entry pts:      mark_dg_base
    referenced by:  kerne     mbmlo
markm:
    entry pts:      cal_kit_array       membottom memtop    sine_cos
mathf:
    entry pts:      ADDCP     ADDFP     ADDLF     ATAN      BESI
          COS       CPINV     CPXMR     DADLF     DIVFP     EXP
```

```
MMBMLOAD.WORK.PD8510            THU, DEC 22, 1983, 10:45 AM     PAGE   7

          IFCAM      LLDAO     LLDA2     LLDAY     LOG2      MCPDIV
          MCPMP      MDBDG     MDDFR     MDFR      MDSFR     MINTP
          MPLDG      MPLDG     MPYAV     MPYDI     MPYFP     MPYLF
          MRLDG      MSHFT     MYNRM     MultInit1 MultInit2 Pi
          Pi2        Pi4       Pi8       RDEXP     SIN       SUBCP
          SUBFP      SUBLF     Sqrt2     TENI      TWOX      TwoPi
          XFM2P      XFM2Q     deg_to_radians      exp_cmplx speed_of_light
          speed_of_light_air
     externals:     ABS2      ADD2      ADD2A     ADD2G     ADD2T
          CASE       CMP2A     CMP2G     CNV25     CNV52     DIV2
          DIV2M      DVR2T     MOD2G     MPY2      MPY2A     MPY2G
          MPY2M      MPY2T     NEG2      SBR2      SBR2G     SBR2M
          SQRT       SUB2      SUB2A     SUB2G     SUB2M
     referenced by:  CPX       FLTPT     FMT       kerne
     modules needed: CASE      FLTPT     SQRT
matht:
     entry pts:     atn_table log_table sqrt_tbl
     referenced by:  mbnlo
mbnlo:
     entry pts:     $RAM$
     externals:     CRLF      DIV3A     SK_LABEL  WHEX      WHex
          WSTR       active_function_label          active_tables
          atn_table  byte_list coupled_bitmap       coupled_chtable_index
          field      hilite_info         ib_link   init_mbn  kit_base
          kit_base2  last_state          mark_dg_base        mark_dg_top
          mark_stack           max_save  min_save  priv_ib_lun_table
          set_add_mbn          top_key_table       wrt_mbn
     referenced by:  kerne
     modules needed: DIV3      TERM      alabe     alpha     atabl
          chdat      cpltb     dgtop     ibtre     keys      lunpl
          markd      matht     skey      skpos     stack     stdda
          xmbn
skey:
     entry pts:     LBL_INDEX SK_LABEL  SK_MENU
     referenced by:  mbnlo
skpos:
     entry pts:     blanks    field     sk_line1  sk_line2
     referenced by:  mbnlo
stack:
     entry pts:     mark_stack
     referenced by:  kerne     mbnlo
stdda:
     entry pts:     kit_base  kit_base2
     referenced by:  mbnlo
strin:
     entry pts:     append_ch append_string       clear_string
          init_string
     referenced by:  title
title:
     entry pts:     char_index          enter_title_char    erase_title
          select_title_char    write_title
     externals:     active_function     append_ch clear_string
          jmp        lb        movech    print_string        printch
          tell       title     title_line          wrt_disp_str
     modules needed: chdat     displ     dispr     strin
xmbn:
```

```
MMBMLOAD.WORK.PD8510            THU, DEC 22, 1983, 10:45 AM     PAGE   8

     entry pts:     init_mbn  mbn_misc_status_reg mbn_prgm_start_add
          mbn_sub_prgm_sel      parms_mbn read_boot_mbn      read_mbn
          set_add_mbn           status_mbn          test_mbn  wrt_boot_mbn
          wrt_mbn
     referenced by:  mbnlo

ENTRY POINTS <module name>:

$RAM$ <mbnlo>              ABS2 <FLTPT>               ABSA <QUAD>
ADD1 <CPX>                 ADD1A <CPX>                ADD1G <CPX>
ADD1M <CPX>                ADD1T <CPX>                ADD2 <FLTPT>
ADD2A <FLTPT>              ADD2G <FLTPT>              ADD2M <FLTPT>
ADD2T <FLTPT>              ADDCP <mathf>              ADDE <CPX>
ADDE_ptr <CPX>             ADDFP <mathf>              ADDLF <mathf>
ATAN <mathf>               BESI <mathf>               CASE <CASE>
CMP2 <FLTPT>               CMP2A <FLTPT>              CMP2G <FLTPT>
CMP2M <FLTPT>              CMP2T <FLTPT>              CMPA <QUAD>
CMPAA <QUAD>               CMPAG <QUAD>               CMPAM <QUAD>
CMPAT <QUAD>               CNV13 <FLTPT>              CNV14 <FLTPT>
CNV15 <FLTPT>              CNV1E <CPX>                CNV1E_save <CPX>
CNV23 <FLTPT>              CNV24 <FLTPT>              CNV25 <FLTPT>
CNV2A <QUAD>               CNV2E <CPX>                CNV31 <FLTPT>
CNV32 <FLTPT>              CNV3A <QUAD>               CNV41 <FLTPT>
CNV42 <FLTPT>              CNV4A <QUAD>               CNV51 <FLTPT>
CNV52 <FLTPT>              CNV5A <QUAD>               CNV92 <CNV9X>
CNV9A <CNV9X>              CNVA2 <QUAD>               CNVA3 <QUAD>
CNVA4 <QUAD>               CNVA5 <QUAD>               CNVE1 <CPX>
CNVE20_1 <CPX>             CNVe1 <CPX>                COS <mathf>
CPINV <mathf>              CPR2 <FLTPT>               CPR2A <FLTPT>
CPR2G <FLTPT>              CPR2M <FLTPT>              CPR2T <FLTPT>
CPRA <QUAD>                CPRAA <QUAD>               CPRAG <QUAD>
CPRAM <QUAD>               CPRAT <QUAD>               CPXMR <mathf>
CRLF <TERM>                DADLF <mathf>              DIV1 <CPX>
DIV1A <CPX>                DIV1G <CPX>                DIV1M <CPX>
DIV1T <CPX>                DIV2 <FLTPT>               DIV2A <FLTPT>
DIV2G <FLTPT>              DIV2M <FLTPT>              DIV2T <FLTPT>
DIV3 <DIV3>                DIV3A <DIV3>               DIV3G <DIV3>
DIV3L <DIV3>               DIV3M <DIV3>               DIV3R <DIV3>
DIV3T <DIV3>               DIV9 <QUAD>                DIVA <QUAD>
DIVAA <QUAD>               DIVAG <QUAD>               DIVAM <QUAD>
DIVAT <QUAD>               DIVE <CPX>                 DIVE_ptr <CPX>
DIVFP <mathf>              DVR1 <CPX>                 DVR1A <CPX>
DVR1G <CPX>                DVR1M <CPX>                DVR1T <CPX>
DVR2 <FLTPT>               DVR2A <FLTPT>              DVR2G <FLTPT>
DVR2M <FLTPT>              DVR2T <FLTPT>              DVR3 <DIV3>
DVR3A <DIV3>               DVR3G <DIV3>               DVR3M <DIV3>
DVR3T <DIV3>               DVRA <QUAD>                DVRAA <QUAD>
DVRAG <QUAD>               DVRAM <QUAD>               DVRAT <QUAD>
DVRE <CPX>                 DVRE_ptr <CPX>             EXP <mathf>
IFCAM <mathf>              LBL_INDEX <skey>           LDR2A <DIV3>
LDR2G <DIV3>               LDR2M <DIV3>               LDR2T <DIV3>
LDRAA <QUAD>               LDRAG <QUAD>               LDRAM <QUAD>
LDRAT <QUAD>               LLDAO <mathf>              LLDA2 <mathf>
LLDAY <mathf>              LOG2 <mathf>               MCPDIV <mathf>
MCPMP <mathf>              MDBDG <mathf>              MDDFR <mathf>
MDFR <mathf>               MDSFR <mathf>              MINTP <mathf>
```

```
MMBMLOAD.WORK.PD8510            THU, DEC 22, 1983, 10:45 AM     PAGE   9

MOD2 <FLTPT>               MOD2A <FLTPT>              MOD2G <FLTPT>
MOD3 <DIV3>                MOD3A <DIV3>               MOD3G <DIV3>
MPLDG <mathf>              MPLDG <mathf>              MPY1 <CPX>
MPY1A <CPX>                MPY1G <CPX>                MPY1M <CPX>
MPY1T <CPX>                MPY2 <FLTPT>               MPY2A <FLTPT>
MPY2G <FLTPT>              MPY2M <FLTPT>              MPY2T <FLTPT>
MPY3 <FLTPT>               MPY3A <FLTPT>              MPY3G <FLTPT>
MPY3L <FLTPT>              MPY3M <FLTPT>              MPY3T <FLTPT>
MPY9 <QUAD>                MPYA <QUAD>                MPYAA <QUAD>
MPYAG <QUAD>               MPYAM <QUAD>               MPYAT <QUAD>
MPYAV <mathf>              MPYDI <mathf>              MPYE <CPX>
MPYE_ptr <CPX>             MPYE_ptrs <CPX>            MPYFP <mathf>
MPYLF <mathf>              MRLDG <mathf>              MSHFT <mathf>
MYNRM <mathf>              MultInit1 <mathf>          MultInit2 <mathf>
NEG1 <CPX>                 NEG2 <FLTPT>               NEGA <QUAD>
Pi <mathf>                 Pi2 <mathf>                Pi4 <mathf>
Pi8 <mathf>                RABS2 <FLTPT>              RCHAR <TERM>
RDEXP <mathf>              RNEG1 <CPX>                RNEG2 <FLTPT>
SBR1 <CPX>                 SBR1A <CPX>                SBR1G <CPX>
SBR1M <CPX>                SBR1T <CPX>                SBR2 <FLTPT>
SBR2A <FLTPT>              SBR2G <FLTPT>              SBR2M <FLTPT>
SBR2T <FLTPT>              SBRE <CPX>                 SBRE_ptr <CPX>
SIN <mathf>                SK_LABEL <skey>            SK_MENU <skey>
SQRT <SQRT>                SUB1 <CPX>                 SUB1A <CPX>
SUB1G <CPX>                SUB1M <CPX>                SUB1T <CPX>
SUB2 <FLTPT>               SUB2A <FLTPT>              SUB2G <FLTPT>
SUB2M <FLTPT>              SUB2T <FLTPT>              SUBCP <mathf>
SUBE <CPX>                 SUBE_ptr <CPX>             SUBFP <mathf>
SUBLF <mathf>              Sqrt2 <mathf>              TENI <mathf>
TWOX <mathf>               TwoPi <mathf>              WCHAR <TERM>
WCPX <TERM>                WHEX <TERM>                WHex <TERM>
WNUM <TERM>                WQUAD <TERM>               WREAL <TERM>
WSTR <TERM>                XFM2P <mathf>              XFM2Q <mathf>
abort <kerne>              acquire <kerne>            active_function_label <alabe>
active_table_type <atabl>                             active_tables <atabl>
append_ch <strin>          append_string <strin>      array_update_fifo <fifo>
atn_table <matht>          awaited <kerne>            bcd_of_int <FMT>
blanks <skpos>             bot_key_table <keys>       byte_list <alpha>
cal_kit_array <markm>      ch_cmd1_line <chdat>       ch_cmd2_line <chdat>
ch_table <chdat>           char_index <title>         clear_display <displ>
clear_string <strin>       conditional_acquire <kerne>
copy_user3 <CPX>           counter <kerne>            coupled_bitmap <chdat>
coupled_chtable_index <cpltb>                         coupled_chtable_size <cpltb>
create <kerne>             crlf <displ>               deg_to_radians <mathf>
delay <kerne>              dg_hex <displ>             dg_read <displ>
dg_read_xy <displ>         dg_write <displ>           display_alternate_value <atabl>
draw <displ>               elec_delay <chdat>         empty_fifo <fifo>
enter_title_char <title>   erase_title <title>        exp_cmplx <mathf>
exp_overflow <CPX>         fetch_CNVE1 <CPX>          field <skpos>
format <chdat>             format_3_cmpx <FMT>        format_double <FMT>
format_integer <FMT>       format_quad <FMT>          format_real <FMT>
format_table <atabl>       hilite_bitmap <chdat>      hilite_info <chdat>
ib_link <ibtre>            if_ref_gain <chdat>        if_test_gain <chdat>
init_display <displ>       init_fifo <fifo>           init_kernel <kerne>
init_mbn <xmbn>            init_string <strin>        intrpt_botton <kerne>
intrpt_delay_timer <kerne>                            intrpt_priv_ib_srq <kerne>
```

```
MMBMLOAD.WORK.PD8510            THU, DEC 22, 1983, 10:45 AM     PAGE  10

intrpt_rpg <kerne>         intrpt_tick <kerne>        intrpt_top_key <kerne>
intrpt_uart <kerne>        irack <intrp>              iradr <intrp>
irclr <intrp>              irdis <intrp>              iren <intrp>
irint <intrp>              irirr <intrp>              irrdy <intrp>
irset <intrp>              jmp <displ>                jsr <displ>
keyboard_fifo <fifo>       kit_base <stdda>           kit_base2 <stdda>
last_state <chdat>         lb <displ>                 limit <atabl>
link <kerne>               log_scale_div_3 <atabl>    log_table <matht>
mark_dg_base <markd>       mark_dg_top <dgtop>        mark_stack <stack>
marker_state <chdat>       max_dump <chdat>           max_save <chdat>
mbn_misc_status_reg <xmbn>                            mbn_prgm_start_add <xmbn>
mbn_sub_prgm_sel <xmbn>    membotton <markm>          memtop <markm>
min_save <chdat>           mkr_imag_format <atabl>    mkr_imag_suffix <atabl>
mkr_real_format <atabl>    mkr_real_suffix <atabl>    mnem <ibtre>
move <displ>               move2 <displ>              movech <displ>
movech2 <displ>            number_of_groups <chdat>   old_id <chdat>
parameter_descriptor <chdat>                          parms_mbn <xmbn>
pause <kerne>              pending <kerne>            plot <displ>
plot_quadrant <chdat>      plotter_pen <chdat>        preempt <kerne>
print_hex <displ>          printch <displ>            priv_ib_lun_table <lunpl>
public_ib_fifo <fifo>      read_boot_mbn <xmbn>       read_fifo <fifo>
read_mbn <xmbn>            ready <kerne>              ref_position <chdat>
ref_value <chdat>          release <kerne>            resource_init <kerne>
rts <displ>                run <kerne>                running <kerne>
scale <chdat>              scale_factors <atabl>      select_title_char <title>
send <kerne>               set_add_mbn <xmbn>         setattribute <displ>
signal_init <kerne>        sine_cos <markm>           sk_line1 <skpos>
sk_line2 <skpos>           snapshot <kerne>           speed_of_light <mathf>
speed_of_light_air <mathf>                            sqrt_tbl <matht>
srq_mask_primary <chdat>   srq_mask_secondary <chdat>
stack_top <kerne>          status_mbn <xmbn>          step_size <chdat>
suffix <atabl>             sweep_mode <chdat>         terminate <kerne>
test_mbn <xmbn>            title_line <chdat>         token_fifo <fifo>
top_key_table <keys>       trace_mode <chdat>         unscale_factors <atabl>
wait <kerne>               waitio <kerne>             write_fifo <fifo>
write_title <title>        wrt_boot_mbn <xmbn>        wrt_disp_byte <dispr>
wrt_disp_dbl <dispr>       wrt_disp_int <dispr>       wrt_disp_quad <dispr>
wrt_disp_real <dispr>      wrt_disp_str <dispr>       wrt_mbn <xmbn>
xdraw <displ>              ydraw <displ>

 KSPMAX=2 NSPMAX=4 SSPMAX=5926 BSPMAX=420 ESPMAX=568 FSPMAX=20
 LSPMAX=245 XSPMAX=18
ELAPSED TIME 1:20
CPU TIME 0:10
```

```
SMBMLOAD.WORK.PD8510          THU, DEC 22, 1983, 10:45 AM     PAGE   1

M68KL,"mbmload"
BEGIN

#FILE cchtable.work;
#FILE ccontvar.work;
#FILE cmbmgr.work;
#FILE ctpmgr.work;
#FILE cdatap.work;
#FILE fterm.work;                                      & DEBUG &
#FILE fterm2.work;                                     & DEBUG &
#FILE fmbm.work;
#FILE fchdata2.work;
#FILE fcpltbl.work;
#FILE fmarkmen.work;
#FILE cstds2.work;                            & for cal_kit_array_size &
#FILE fstddata.work;
COMMENT
  These files are for uncoupling and initializing hilights
  ;
#FILE cresp.work;
#FILE cstim.work;
#FILE cparams.work;
#FILE cformat.work;
#FILE cdommenu.work;
#FILE ccalmenu.work;
#FILE cstdmenu.work;
#FILE cdisp.work;
#FILE cplot.work;
#FILE cmkr.work;
#FILE csystem.work;

BYTE LEDs = %FFFFFEB1;
INTEGER pg, reg, lgth, i;
INTEGER ARRAY page_0 [0:31];
INTEGER POINTER save_addr;
DOUBLE save_sz_dbl, last_sz_dbl, junk;
INTEGER save_sz = save_sz_dbl+2,
        last_sz = last_sz_dbl+2;
BOOLEAN save_ok;
```

```
SMBMLOAD.WORK.PD8510          THU, DEC 22, 1983, 10:45 AM     PAGE   2

#EJECT;
SUBROUTINE force_load;
BEGIN
  EXTERNAL INTEGER atn_table.L;
  #FILE falphas.work;
  #FILE fskey.work;
  #FILE fskpos.work;
  #FILE fkeys.work;
  #FILE falabel.work;
  #FILE fibtree.work;
  #FILE fatables.work;
  & force linker loading of display RAM data modules &
  junk := ADRS(atn_table);
  junk := ADRS(byte_list);
  junk := ADRS(SK_LABEL);
  junk := ADRS(field);
  junk := ADRS(top_key_table);
  junk := ADRS(active_function_label);
  junk := ADRS(mark_stack);
  junk := ADRS(ib_link);
  junk := ADRS(active_tables);
  junk := ADRS(coupled_chtable_index);
END force_load;

BOOLEAN SUBROUTINE init_bubble;
BEGIN
  LEDs := %FF;                                       & turn off LEDs &
  FOR i := 0 TO 31 DO page_0[i] := 0;
  page_0[31] := %8510;
  i := 0;
  IF init_mbm (1) THEN
    init_bubble := wrt_mbm (ADRS(page_0), set_add_mbm(i,0,63))
  ELSE
    init_bubble := FALSE;
END init_bubble;
```

```
SMBMLOAD.WORK.PD8510          THU, DEC 22, 1983, 10:45 AM     PAGE   3

#EJECT;
COMMENT
  uncouples softkey hilights
;
PROCEDURE uncouple_hilights (first,last);
  VALUE first,last;  INTEGER first,last;
BEGIN
  INTEGER map,index,x,key_cnt;
  index := RIGHT(first,4)-1;              & first/16 to get bitmap index &
  key_cnt := last-first;                  & number of keys in group &
  x := first AND %OF;                     & 1st softkey bit to clear &
  IF key_cnt >= 0 THEN                    & clear out hilights for group &
    DO BEGIN
      map := coupled_bitmap [index:=index+1];  & scratch pad bit map &
      DO map:=RBIT(map,x)                      & one word at a time  &
      UNTIL ((x:=x+1)=16) OR ((key_cnt:=key_cnt-1)<0);
      coupled_bitmap [index] := map;
      x := 0;
    END UNTIL (key_cnt < 0);
END uncouple_hilights;

SUBROUTINE init_uncoupled;
BEGIN
  uncouple_hilights (cmd_if_test_port,cmd_if_ref_port);
  uncouple_hilights (cmd_if_no_gain,cmd_if_gain_auto);
  uncouple_hilights (cmd_user1,cmd_user4);
  uncouple_hilights (cmd_swr,cmd_real);
  uncouple_hilights (cmd_freq_domain,cmd_aux_domain);
  uncouple_hilights (cmd_tdr_step,cmd_min_time_window);
  uncouple_hilights (cmd_max_gate_window,cmd_min_gate_window);
  uncouple_hilights (cmd_correction_on,cmd_correction_off);
  uncouple_hilights (cmd_data,cmd_math);
  uncouple_hilights (cmd_memory1,cmd_memory4);
  uncouple_hilights (cmd_memory_ch1,cmd_memory_ch2);
  uncouple_hilights (cmd_d_plus_m,cmd_d_div_m);
  uncouple_hilights (cmd_pen1,cmd_pen8);
  uncouple_hilights (cmd_data,cmd_math);
  uncouple_hilights (cmd_if_avg_on,cmd_if_avg_off);
  uncouple_hilights (cmd_smoothing_on,cmd_smoothing_off);
END init_uncoupled;
```

```
SMBMLOAD.WORK.PD8510          THU, DEC 22, 1983, 10:45 AM     PAGE   4

#EJECT;
COMMENT
  initializes initial sofktey menu highlights
;
PROCEDURE hilight (softkey1,softkey2);
  VALUE softkey1,softkey2; INTEGER softkey1,softkey2;
BEGIN
  INTEGER bit_pos;
  hilite_info [0,(i:=RIGHT(softkey1,4))] :=
    SBIT (hilite_info[0,i], softkey1 AND %OF);
  bit_pos := softkey2 AND %OF;
  hilite_info [1,(i:=RIGHT(softkey2,4))] :=
    SBIT (hilite_info[1,i], bit_pos);
END hilight;

SUBROUTINE init_highlights;
BEGIN
  hilight (cmd_if_avg_off,cmd_if_avg_off);
  hilight (cmd_smoothing_off,cmd_smoothing_off);
  hilight (cmd_201_points,cmd_201_points);
  hilight (cmd_if_gain_auto,cmd_if_gain_auto);
  hilight (cmd_if_test_port,cmd_if_test_port);
  hilight (cmd_swept,cmd_swept);
  hilight (cmd_continuous,cmd_continuous);
  hilight (cmd_couple_stimulus,cmd_couple_stimulus);
  hilight (cmd_power_slope_off,cmd_power_slope_off);
  hilight (cmd_freq_domain,cmd_freq_domain);
  hilight (cmd_tdr_step,cmd_tdr_step);
  hilight (cmd_normal_time_window,cmd_normal_time_window);
  hilight (cmd_gate_off,cmd_gate_off);
  hilight (cmd_normal_gate_window,cmd_normal_gate_window);
  hilight (cmd_correction_off,cmd_correction_off);
  hilight (cmd_cal_kit_1,cmd_cal_kit_1);
  hilight (cmd_single_ch,cmd_single_ch);
  hilight (cmd_data,cmd_data);
  hilight (cmd_marker_off,cmd_marker_off);
  hilight (cmd_no_ref_mkr,cmd_no_ref_mkr);
  hilight (cmd_quadrant_full,cmd_quadrant_full);
  hilight (cmd_pen1,cmd_pen2);
  hilight (cmd_privib_remote,cmd_privib_remote);
  hilight (cmd_d_div_m,cmd_d_div_m);
  hilight (cmd_memory1,cmd_memory2);
END init_highlights;
```

```
SMBMLOAD.WORK.PD8510              THU, DEC 22, 1983, 10:45 AM     PAGE   5

#EJECT;
SUBROUTINE init_counts;
BEGIN
  reg := 0;
  LEDs := %FF;
  CRLF;
END init_counts;
```

```
SMBMLOAD.WORK.PD8510              THU, DEC 22, 1983, 10:45 AM     PAGE   6

#EJECT;
PROCEDURE init_cal_regs;
BEGIN
  INTEGER pg_cnt;
  pg := seg_start;
  init_counts;
  WSTR("CAL SEGMENT:"); WHEX(seg_size*64); WSTR(" bytes"); CRLF;
  DO BEGIN
    reg := reg + 1;
    pg_cnt := 0;
    WSTR("Init pages"); WHEX(pg);
    DO UNTIL
      NOT (save_ok := wrt_mbm(ADRS(page_0),set_add_mbm(pg,0,31)))
      OR  ((pg_cnt:=pg_cnt+1)=seg_size) OR (pg=2048);
    WHEX(pg-1); WSTR(" = reg"); WHEX(reg); CRLF;
    LEDs := RBIT (LEDs, reg-1);
  END UNTIL NOT save_ok OR (reg=8) OR (pg=2048);
  IF (reg < 8) THEN
  IF save_ok THEN
    BEGIN
      save_ok := FALSE;
      CRLF;
      & error: cal segments are too large &
    END;
END init_cal_regs;
```

```
SMBMLOAD.WORK.PD8510              THU, DEC 22, 1983, 10:45 AM     PAGE   7

#EJECT;
PROCEDURE init_pages_left (page_bound);
  VALUE page_bound; INTEGER page_bound;
BEGIN
  INTEGER bytes_left;
  init_counts;
  IF (bytes_left := (page_bound-pg)*64) < 0 THEN
    bytes_left := 0;
  WSTR("BYTES REMAINING:"); WHEX(bytes_left); CRLF;
  IF bytes_left > 0 THEN
    BEGIN
      WSTR("Init pages"); WHEX(pg);
      DO BEGIN
        LEDs := NOT (ARIGHT(pg,3));
      END UNTIL
          NOT (save_ok := wrt_mbm(ADRS(page_0),set_add_mbm(pg,0,31)))
          OR    (pg=page_bound);
      WHEX(pg-1); CRLF;
    END;
END init_pages_left;
```

```
SMBMLOAD.WORK.PD8510              THU, DEC 22, 1983, 10:45 AM     PAGE   8

#EJECT;
PROCEDURE load_bubble_data (lgth);  VALUE lgth;  DOUBLE lgth;
BEGIN
  INTEGER i;
  i := -1024;
  DO UNTIL
    NOT (save_ok :=
          wrt_mbm(ADRS(save_addr[i:=i+1024]),
                set_add_mbm (pg,0,(IF lgth>2048 THEN 2047
                                                 ELSE lgth-1))))
    OR ((lgth:=lgth-2048) <= 0);
END load_bubble_data;
```

```
SMBALOAD.WORK.PD8510          THU, DEC 22, 1983, 10:45 AM     PAGE  9


#EJECT;
SUBROUTINE load_cal_stds;
BEGIN
  init_counts;
  WSTR("CAL STANDARDS:"); WHEX(cal_kit_array_size);
  WSTR(" bytes"); CRLF;
  STPNTR (save_addr, ADRS(kit_base));
  DO BEGIN
    WSTR("Loading pages "); WHEX(pg);
    load_bubble_data (cal_kit_array_size);
    STPNTR (save_addr, ADRS(kit_base2));
    WHEX(pg-1); WSTR(" = reg"); WHEX(reg+1); CRLF;
    LEDs := RBIT (LEDs, reg);
  END UNTIL NOT save_ok OR ((reg:=reg+1) = 2);
END load_cal_stds:
```

```
SMBALOAD.WORK.PD8510          THU, DEC 22, 1983, 10:45 AM     PAGE  10


#EJECT;
PROCEDURE load_hpib_addresses;
BEGIN
  #FILE flunplus.work;
  init_counts;
  WSTR("HPIB ADDRESSES: 40 bytes");  CRLF;          & fixed at 64 bytes &
  LEDs := RBIT (LEDs, reg);                         & enable 1st LED &
  save_ok := wrt_mbm (ADRS(priv_ib_lun_table),set_add_mbm(pg,0,31));
  WSTR("Init page"); WHEX(pg-1); CRLF; CRLF;
END load_hpib_addresses;
```

```
SMBALOAD.WORK.PD8510          THU, DEC 22, 1983, 10:45 AM     PAGE  11


#EJECT;
PROCEDURE load_memory_traces;
BEGIN
  INTEGER mem_size;
  mem_size := 2406+header_size-1;
  init_counts;
  WSTR("MEMORY TRACE:"); WHEX(mem_size); WSTR(" bytes"); CRLF;
  DO BEGIN
    WSTR("Loading pages "); WHEX(pg);
    save_ok := (pg < 2046) AND
               wrt_mbm (ADRS(page_0), set_add_mbm(pg,0,mem_size));
    WHEX(pg-1); WSTR(" = reg "); WHEX(reg+1); CRLF;
    LEDs := RBIT (LEDs, reg);
  END UNTIL NOT save_ok OR ((reg:=reg+1)=4);
END load_memory_traces;
```

```
SMBALOAD.WORK.PD8510          THU, DEC 22, 1983, 10:45 AM     PAGE  12


#EJECT;
PROCEDURE load_display_ram;
BEGIN
  DOUBLE  dg_data_sz, dg_data_cnt;
  INTEGER dg_pgs = dg_data_cnt + 2;
  dg_data_sz := ADRS(mark_dg_top) - ADRS(mark_dg_base);
  dg_data_cnt := dg_data_sz/64;
  IF (dg_data_sz AND %3F)<>0 THEN
    dg_pgs := dg_pgs + 1;
  init_counts;
  WSTR("DISPLAY RAM DATA: "); WHex(dg_data_sz,8);
  WSTR(" bytes"); CRLF;
  WSTR("Display RAM boundaries:"); WHex(ADRS(mark_dg_base),8);
  WHex(ADRS(mark_dg_top),8); CRLF;
  IF NOT (save_ok := (dg_pgs + pg) < seg_start) THEN
    BEGIN
      LEDs := 0;
      WSTR("ERROR:  DG RAM exceeds available ");
      WSTR("data bubble space by "); WHEX((seg_start-dg_pgs)*64);
      WSTR(" bytes.");
    END
  ELSE
    BEGIN
      STPNTR (save_addr, ADRS(mark_dg_base));
      WSTR("Loading pages "); WHEX(pg);
      load_bubble_data (dg_data_sz);
      WHEX(pg-1);
    END;
  CRLF;
END load_display_ram;
```

```
SMBMLOAD.WORK.PD8510            THU, DEC 22, 1983, 10:45 AM     PAGE  13


%EJECT;

  init_uncoupled;
  init_highlights;
  save_sz_dbl := ADRS(max_save)-ADRS(min_save);
  last_sz_dbl := ADRS(max_save)-ADRS(last_state);
  STPNTR (save_addr, ADRS(min_save));
  pg := 1;
  CRLF; WSTR("***** LOADING DATA BUBBLE (1) *****"); CRLF;
  init_counts;

  WSTR("INSTRUMENT STATE:"); WHEX(save_sz); WSTR(" bytes"); CRLF;
  IF (save_ok := init_bubble) THEN
  DO BEGIN               & init bubble module 1 w/ 8 save/recall states &
    reg := reg + 1;
    WSTR("Loading pages "); WHEX(pg);
    load_bubble_data (save_sz);
    WHEX(pg-1); WSTR(" = reg"); WHEX(reg); CRLF;
    LEDs := RBIT(LEDs,reg-1);          & indicate initialized register &
  END UNTIL NOT save_ok OR (reg=preset_state);
  IF save_ok THEN                              & init "last state" reg &
    BEGIN
      WSTR("Last state    "); WHEX(pg);
      STPNTR (save_addr, ADRS(last_state));
      load_bubble_data (last_sz);
      WHEX(pg-1); CRLF;
      IF save_ok THEN
        load_cal_stds;
      IF save_ok THEN
        load_hpib_addresses;
      IF save_ok THEN
        load_display_ram;
      IF save_ok THEN
        init_pages_left(seg_start);
      IF save_ok THEN
        init_cal_regs;
      IF save_ok THEN
        load_memory_traces;
      IF save_ok THEN                        & init 2nd half of bubble &
        init_pages_left (2046);
      IF save_ok THEN
        WSTR("done.")
      ELSE
        WSTR("bubble write error");
    END
  ELSE
    WSTR("Bubble Module 1 loading error.");
  IF save_ok THEN
    LEDs := %FF;
  CRLF; CRLF;
  TRAP(15);   & return to monitor &

END$
```

```
SMBTEST.WORK.PD8510             THU, DEC 22, 1983, 10:46 AM     PAGE   1


M68KL,"MBTEST"
BEGIN

%FILE fterm.work;
%FILE fmbm.work;


COMMENT
***********************************************************************
This program is for testing the error rate of MBM

It will save on the MBM a selected region of memory RefStart-RefEnd
It will also save a block of counters containing present results
          (this allows restarts after powerfail)
It will then repeatively read MBM and compair it to the orginal data in
   memory  -- this will continue for ReadLoopRate times and
   then the whole cycle will repeat -- including the re-writing of MBM
     (This will test writes and allow the program to continue on
       meanfully after a hardfailure of MBM or RAM!!!)

Occansionally a status message will be printed out.

If an error occur the program will dump information that should allow
   one to trace the type of error
***********************************************************************
end of comment;


DOUBLE ARRAY Counters[0:63];
GLOBAL DOUBLE MBLoops=Counters[0],PrintOutCount=Counters[1],
       MBReadErr=Counters[2],MBCompairErr=Counters[3],
       Restarts=Counters[4],C1=Counters[5],
       C2=Counters[6],C3=Counters[7];

DOUBLE CONSTANT  RefStart:=%100000, RefEnd:=%107CFF,
                TestStart:= %10000,TestEnd:= %17CFF;
INTEGER CONSTANT CountersSaveAdd:=1020,TestSaveAdd:=1021,
                 ReadLoopRate:=25,PrintOutRate:=100;
LABEL MajorLoop;
INTEGER MBMAdd;
BOOLEAN Flag;
REAL Rtemp;
BYTE    Coldstart=%F0;


SUBROUTINE PrintData;
BEGIN
 WSTR("# of Loops "); WNUM(MBLoops);
    Rtemp:=REAL(MBLoops)*REAL(TestEnd-TestStart)*8.0;
    WSTR("     # of Bits "); WREAL(Rtemp);
    WSTR("    Restarts");  WNUM(Restarts);
    CRLF;
 WSTR("  Errors (Read/Compair) ");
    WNUM(MBReadErr); WNUM(MBCompairErr);
    WSTR("       Error Rate ");
```

```
SMBTEST.WORK.PD8510             THU, DEC 22, 1983, 10:46 AM     PAGE   2


    WREAL( REAL(MBReadErr+MBCompairErr)/Rtemp );
    CRLF;
END PrintData;



&*********************************************************************&
IF NOT init_mbm(0) THEN BEGIN
            CRLF; WSTR("Init Failure"); CRLF; TRAP(15); END;

IF TBIT(Coldstart,0) THEN BEGIN
            Coldstart:=RBIT(Coldstart,0);
            CRLF; WSTR("Cold Start"); CRLF;
            MBLoops:=0;
            MBReadErr:=0;
            MBCompairErr:=0;
            Restarts:=0;
            C1:=C2:=C3:=0;
            PrintOutCount:=PrintOutRate;
     END ELSE BEGIN
            CRLF; WSTR("Warm Start"); CRLF;
            MBMAdd:=CountersSaveAdd;
            IF NOT read_mbm(ADRS(Counters),
                   set_add_mbm(MBMAdd,ADRS(Counters),ADRS(Counters)) )
              THEN &Counters invalid ????&;
            Restarts:=Restarts+1;
            END;
 PrintData;


MajorLoop:
  MBMAdd:=TestSaveAdd;
  Flag:=wrt_mbm(RefStart,
                 set_add_mbm(MBMAdd,RefStart,RefEnd)  );

  MBMAdd:=CountersSaveAdd;
  Flag:=wrt_mbm(ADRS(Counters),
                 set_add_mbm(MBMAdd,ADRS(Counters),ADRS(Counters)) );

  REPEAT ReadLoopRate DO BEGIN

          MBLoops:=MBLoops+1;

         MBMAdd:=TestSaveAdd;
         IF read_mbm(TestStart,
                 set_add_mbm(MBMAdd,TestStart,TestEnd)  ) THEN
            BEGIN
               LABEL CompairLoop,CompairExit;
                  ASSEMBLE( MOVE.L RefStart,R9; MOVE.L TestStart,R10;
                            MOVE.L TestEnd,R11 );
               CompairLoop:ASSEMBLE(
                            CMP.L  R10,R11;
                            BMI    CompairExit;
                            CMPM.W (R9)+,(R10)+;
                            BEQ    CompairLoop;
                            ADD.L =D1,MBCompairErr; &Compair Err&
```

```
SMBTEST.WORK.PD8510             THU, DEC 22, 1983, 10:46 AM     PAGE   3


                            MOVE.W -(R9),R0;        &Ref data first&
                            JSR    $WHEX;
                            MOVE.W -(R10),R0;       &MBM data second&
                            JSR    $WHEX;
                            MOVE.W  R10,R0;         &Address&
                            JSR    $WHEX           );
                            CRLF;
               CompairExit:ASSEMBLE( NOP );
            END ELSE
               BEGIN

                  MBReadErr:=MBReadErr+1;
                  PrintData;
                  IF NOT init_mbm(0) THEN BEGIN
                     CRLF; WSTR("Init Failure"); CRLF; TRAP(15); END;
               END;

        IF (PrintOutCount:=PrintOutCount-1) <=0 THEN BEGIN
                  PrintOutCount:=PrintOutRate;
                  PrintData;
                  END;
        END REPEAT ReadLoopRate;

 GO TO MajorLoop;

END$
```

```
CNEMMGR.WORK.PD8510          THU, DEC 22, 1983, 10:46 AM     PAGE   1

INTEGER CONSTANT
  td_scr_arrays_id      := 0,
  td_gate_arrays_id     := 1,  & and 2 -- ch dependent &
  td_chirp_arrays_id    := 3,  & and 4 -- ch dependent &
  slide_load_arrays_id  := 5,
  temp_id               := 10,
  max_memory_id         := 10;
```

```
FMEMMGR.WORK.PD8510          THU, DEC 22, 1983, 10:46 AM     PAGE   1

#FILE cmemmgr.work;                          & for max_memory_id &

& Clear memory &
SUBROUTINE reset_memory;                                EXTERNAL;

& Return memory address allocating byte_cnt bytes &
DOUBLE PROCEDURE request_memory (byte_cnt);
  VALUE byte_cnt; DOUBLE byte_cnt;                      EXTERNAL;
DOUBLE PROCEDURE request_array(byte_cnt);
   VALUE   byte_cnt;
   DOUBLE byte_cnt;                                     EXTERNAL;

& Release previously allocated memory address &
PROCEDURE release_memory (memory_address);
  DOUBLE memory_address;                                EXTERNAL;
PROCEDURE  release_array(array_address);
   DOUBLE  array_address;                               EXTERNAL;

& Auxiliary memory management &
BOOLEAN PROCEDURE memory_stolen (addr, memory_id, byte_cnt);
  VALUE memory_id, byte_cnt;
  DOUBLE addr; INTEGER memory_id; DOUBLE byte_cnt;      EXTERNAL;
PROCEDURE release_auxiliary_memory (addr, memory_id);
  VALUE addr, memory_id;
  DOUBLE addr;  INTEGER memory_id;                      EXTERNAL;
```

```
SMEMMGR.WORK.PD8510          THU, DEC 22, 1983, 10:46 AM     PAGE   1

M68KL,P,"memmgr"
BEGIN

#FILE fkernel.work;
#FILE crins.work;
#FILE fmarkmem.work;
#FILE cmessage.work;                    & for exceeded_available_memory &
#FILE futil2.work;                                       & for fatal &
#FILE cdebug.work;
#FILE fterm.work;                                            & DEBUG &
#FILE fterm2.work;                                           & DEBUG &
#FILE cmbmgr.work;                                 & for header_size &
#FILE cmemmgr.work;

INTEGER CONSTANT
  block_cnt := 511,                       & size of memory block map &
  block_size := 512;                        & must be a power of 2 &

INTEGER ARRAY
  memory_id_status [0:max_memory_id],     & list of memory on "loan" &
  memory_id_lgth   [0:max_memory_id];     & and #blocks occupied     &
BYTE ARRAY
  memory_map [0:block_cnt];

DOUBLE
  memory_base,
  memory_size, block_mask;

INTEGER
  block_max = block_mask + 2,     & number of memory blocks in memory &
  free_blk;                       & first available block in memory   &

BOOLEAN
  aux_mem_avail;
```

```
SMEMMGR.WORK.PD8510          THU, DEC 22, 1983, 10:46 AM     PAGE   2

#EJECT;
PROCEDURE dump_aux_status;                        & for DEUBG only &
BEGIN
  INTEGER i;
  WSTR("Aux Mem ");
  FOR i := 0 TO max_memory_id DO
    WHEX(memory_id_status[i]); CRLF;
  WSTR("Aux Lgth");
  FOR i := 0 TO max_memory_id DO
    WHEX(memory_id_lgth[i]); CRLF;
END dump_aux_status;
```

```
#EJECT;
PROCEDURE dump_memory_status;                          & for debug only &
BEGIN
  INTEGER i,blk_start,blk_size;
  WSTR("1st avail blk @"); WHEX(free_blk); CRLF;
  WSTR("Memory Status"); CRLF;
  blk_start := 0;
  DO BEGIN
    blk_size := memory_map[blk_start];
    IF blk_size > 0 THEN
      BEGIN
        WHEX(blk_size); WSTR(" full @"); WHEX(blk_start); CRLF;
      END
    ELSE
      BEGIN
        i := blk_start-1;
        WHILE (memory_map[i:=i+1]=0) AND (i<block_max) DO
          blk_size := blk_size + 1;
        WHEX(blk_size); WSTR(" EMPTY @"); WHEX(blk_start); CRLF;
      END;
    blk_start := blk_start + blk_size;
  END UNTIL (blk_start >= (block_max-1));
  CRLF;
END dump_memory_status;
```

```
#EJECT;
COMMENT
$DOC+

NAME--
  free_memory_id
************************************************************************
*
* SHORT DESCRIPTION--
*   removes auxiliary memory from auxiliary memory tables
*
* EXTENDED DESCRIPTION--
*   This routine removes auxiliary memory from auxiliary memory tables
*   by setting the table value corresponding to a given memory ID to
*     -1 for table containing starting block of auxiliary memory
*      0 for table containing number of auxiliary memory blocks
*   The given memory ID indexes the tables.
*
*
* INPUTS--  id = memory ID of auxiliary memory to be removed
*
* OUTPUTS-- none
*
* ROUTINES CALLED-- none
*
* ERROR CONDITIONS AND RECOVERY--
*   No range checking is done on the memory ID value that is passed.
*   Constant values found in CMEMMGR.WORK should be used.
*
* NOTES--
*   This is a local utility routine used by externally declared routines
*   found in this module.
*
* AUTHOR--
*
************************************************************************
*
* INITIAL REFINEMENT--
*   set starting memory block corresponding to memory ID to -1
*   set number of memory blocks corresponding to memory ID to 0
*
************************************************************************
*
* REVISION LOG--
*
************************************************************************
DECLARATION--
;
PROCEDURE free_memory_id (id);
  VALUE id;  INTEGER id;
&
$DOC-&

BEGIN
  memory_id_status [id] := -1;
  memory_id_lgth [id]   := 0;
```

```
END free_memory_id;
```

```
#EJECT;
COMMENT
$DOC+

NAME--
  reset_memory
************************************************************************
*
* SHORT DESCRIPTION--
*   initialize data memory, clear entire memory bitmap
*
* EXTENDED DESCRIPTION--
*   This routine initializes memory used for dynamic allocation and
*   its associated bitmaps and tables.  At the end of the routine, all
*   available memory has been de-allocated.
*
* INPUTS--  none
*
* OUTPUTS-- de-allocated dynamic memory
*
* ROUTINES CALLED--
*   acquire
*   release
*   free_memory_id
*
* ERROR CONDITIONS AND RECOVERY--
*   Any memory addresses acquired in previous memory allocation
*   requests cannot be invalidated and can therefore, be potentially
*   used again without warning.  That is, when memory is re-allocated
*   after a reset_memory, any routines using memory allocated before the
*   reset can still access that memory after the reset even if the
*   memory was not technically re-allocated to them.  This can cause
*   memory allocated to one routine to be overwritten or read by another
*   routine.  It is, therefore, the user's responsibility to re-allocate
*   memory after a memory_reset.
*
* NOTES--
*
* AUTHOR--
*
************************************************************************
*
* INITIAL REFINEMENT--
*   Determine the total number of available memory blocks
*   Clear memory block allocation bitmap
*   Reset first available memory block for allocation
*   Initialize auxiliary memory tables
*
************************************************************************
*
* REVISION LOG--
*
************************************************************************
DECLARATION--
;
SUBROUTINE reset_memory;                                           ENTRY;
```

```
SMEMMGR.WORK.PD8510            THU, DEC 22, 1983, 10:46 AM      PAGE   7

&
$DOC-&

BEGIN
  acquire (memory_src);
  COMMENT since we cannot allocate mapping space dynamically,
          the constant, block_cnt, will have to be changed as
          more/less memory becomes available;
  block_mask := (ADRS(membottom) -
                (memory_base:=ADRS(memtop))) / block_size;
  IF ((block_max) > block_cnt+1) OR (block_max < 0) THEN
    block_max := block_cnt+1;
  FOR free_blk := 0 TO block_max-1 DO              & init memory map &
    memory_map[free_blk] := 0;
  FOR free_blk := 0 TO max_memory_id DO            & init memory id info &
    free_memory_id (free_blk);
  free_blk := 0;                                   & first available block &
  aux_mem_avail := FALSE;

  IF mem_debug THEN
    BEGIN WSTR("MEMORY RESET @ "); WHex(memory_base,8);
          WHex(ADRS(membottom),8); CRLF;
          WHEX(block_max); WSTR(" blks avail"); CRLF;
          dump_memory_status;
    END;
  release (memory_src);
END reset_memory;
```

```
SMEMMGR.WORK.PD8510            THU, DEC 22, 1983, 10:46 AM      PAGE   8

#EJECT;
COMMENT
$DOC+

NAME--
  blocks_requested
*************************************************************************
*
* SHORT DESCRIPTION--
*   computes the number of memory blocks needed from a given byte count
*
* EXTENDED DESCRIPTION--
*   This routine returns the number of memory blocks that would be
*   occupied from a given number of bytes.  A "block" of memory contains
*   the number of bytes defined in the local CONSTANT block_size.
*
* INPUTS--  byte_cnt = number of bytes of memory needed
*
* OUTPUTS-- number of blocks of memory
*
* ROUTINES CALLED--
*   fatal
*
* ERROR CONDITIONS AND RECOVERY--
*   If the number blocks computed exceeds the total number of memory
*   blocks used for memory allocation then "we're in trouble..."
*   In other words, the system is killed (via fatal).
*
* NOTES--
*
* AUTHOR--
*************************************************************************
*
* INITIAL REFINEMENT--
*   Divide a memory block size into the number of bytes given
*   Add an extra memory block if it doesn't divide evenly
*   If the computed number of memory blocks exceeds the total amount
*     of memory blocks used for allocation THEN
*       display a "fatal" message and hang the system
*
*************************************************************************
*
* REVISION LOG--
*
*************************************************************************
DECLARATION--
;
INTEGER PROCEDURE blocks_requested (byte_cnt);
  VALUE byte_cnt; DOUBLE byte_cnt;
&
$DOC-&

BEGIN
  INTEGER blocks_needed;
  blocks_needed := (byte_cnt/block_size);
```

```
SMEMMGR.WORK.PD8510            THU, DEC 22, 1983, 10:46 AM      PAGE   9

  IF (byte_cnt AND (block_size-1)) > 0 THEN
    blocks_needed := blocks_needed + 1;
  IF mem_debug THEN
    BEGIN
      WSTR("REQUESTing"); WHex(byte_cnt,8); WSTR(" bytes");
      WHEX(blocks_needed); WSTR(" blks"); CRLF;
    END;
  IF blocks_needed > block_max THEN
    BEGIN
      fatal (exceeded_available_memory);
      blocks_needed := 0;
    END;
  blocks_requested := blocks_needed;
END blocks_requested;
```

```
SMEMMGR.WORK.PD8510            THU, DEC 22, 1983, 10:46 AM      PAGE  10

#EJECT;
COMMENT
$DOC+

NAME--
  first_fit
*************************************************************************
*
* SHORT DESCRIPTION--
*   searches for first available segment of memory large enough to
*   store a requested number of blocks
*
* EXTENDED DESCRIPTION--
*   This function returns the block number of the first block which
*   heads consecutive available memory blocks that will be able to
*   accomodate a requested number of blocks.  It does a "first fit"
*   type of search for a segment of memory that contains available
*   contiguous blocks.  A value of -1 is returned if a segment of memory
*   cannot be found containing the required number of blocks.
*
*   Allocated memory which has been designated as "auxiliary" by the
*   memory owner is released only when there is not enough continguous
*   memory blocks available to satisfy a current memory request.
*
* INPUTS--
*   blocks_needed = number of blocks of available memory needed
*
* OUTPUTS--
*   starting blocks of available segment of memory
*
* ROUTINES CALLED--
*   free_memory_id
*
* ERROR CONDITIONS AND RECOVERY--
*
* NOTES--
*   When "auxiliary" memory is needed due to a shortage of available
*   memory, ALL "auxiliary" memory is released and considered to be
*   re-allocated (even if it doesn't end up getting used).
*
* AUTHOR--
*************************************************************************
*
* INITIAL REFINEMENT--
*   Count the number of contiguous unused memory blocks until the number
*     of contiguous memory blocks = requested number of memory blocks
*   IF there are not enough contiguous blocks available THEN
*     check auxiliary memory tables and release all auxiliary memory
*     re-count contiguous blocks until there are enough available
*   IF there wasn't enough available memory blocks THEN
*     return a -1
*   ELSE
*     return the first available memory block from a set of contiguous
*       blocks that can accomodate the requested number of blocks
*     update the pointer to the first available memory block
```

```
*
***********************************************************************
*
* REVISION LOG--
*   3/15/83   -- Added capability of "borrowing" allocated memory which
*                has been conditionally released by memory owner and
*                marked as auxiliary memory.  This memory is used only
*                when there is not enough available memory to satisfy a
*                request for memory allocation.
*
***********************************************************************
DECLARATION--
;
INTEGER PROCEDURE first_fit (blocks_needed);
  VALUE blocks_needed; INTEGER blocks_needed;
&
$DOC-&

BEGIN
  INTEGER n,i;

  SUBROUTINE steal_memory;
  BEGIN
    INTEGER blk_cnt=REGISTER 5,
            stolen =REGISTER 6;
    blk_cnt := 0;
    FOR i := 0 TO max_memory_id DO
      IF (blk_cnt:=memory_id_status[i]) >= 0 THEN
        BEGIN
          free_memory_id (i);
          FOR stolen := blk_cnt TO (blk_cnt+memory_map[blk_cnt]-1) DO
            memory_map[stolen] := 0;
          IF blk_cnt < free_blk THEN      & adjust ptr to 1st blk avail &
            free_blk := blk_cnt;
        END;
    aux_mem_avail := FALSE;
    IF mem_debug THEN
      BEGIN
        WSTR("Steal memory"); CRLF;
        dump_aux_status;
      END;
  END steal_memory;

  SUBROUTINE count_blocks_avail;
  BEGIN
    n := 0;
    i := free_blk;
    WHILE (i < block_max ) AND (n < blocks_needed) DO
      IF memory_map[i] = 0 THEN
        BEGIN
          n := 0;
          WHILE (memory_map[i]=0) AND (i<block_max) AND
                (n<blocks_needed) DO
            BEGIN
              n := n+1;                       & count contiguous blocks &
              i := i+1;                   & update memory block pointer &
```

```
            END;
          END
        ELSE
          i := i+1;
  END count_blocks_avail;

  count_blocks_avail;              & variable n contains available blocks &
  IF n < blocks_needed THEN
  IF aux_mem_avail THEN
    BEGIN
      steal_memory;
      count_blocks_avail;
    END;
  first_fit := IF n >= blocks_needed THEN
                 i-n               & starting block of allocated memory &
               ELSE
                 -1;               & not enough blocks to allocate      &
  IF (i-n) = free_blk THEN         & update first available block       &
    BEGIN
      WHILE (i < block_max) AND (memory_map[i]<>0) DO
        i := i + 1;
      free_blk := i;
    END;
END first_fit;
```

```
$EJECT;
COMMENT
$DOC+

NAME--
  request_memory
***********************************************************************
*
* SHORT DESCRIPTION--
*   Dynamically allocates memory in block_size byte blocks
*
* EXTENDED DESCRIPTION--
*   This routine returns the address of an available segment of memory
*   which is based on the number of bytes requested that will "fit"
*   into the first available segment of memory.  An address of 0 is
*   returned if there is not sufficient memory available for allocation.
*   Blocks corresponding to and included in the memory segment that is
*   allocated will be marked as "occupied" in a memory allocation map.
*   (value of number of memory blocks occupied)
*
* INPUTS--
*   byte_cnt = number of bytes of memory needed
*
* OUTPUTS--
*   starting address of memory with byte_cnt available bytes
*
* ROUTINES CALLED--
*   acquire
*   release
*   blocks_requested
*   first_fit
*
* ERROR CONDITIONS AND RECOVERY--
*   Users of this function should check for a return value of address 0
*   before proceeding to read/write to the returned address value.
*   Disastrous results may occur when attempting to write into address
*   location 0.
*
* NOTES--
*   A memory "block" is currently defined in the CONSTANT block_size.
*
* AUTHOR--
*
***********************************************************************
*
* INITIAL REFINEMENT--
*   Compute the number of memory blocks needed from the number of bytes
*     requested
*   Find the first set of contiguous memory blocks that can accomodate
*     the number of memory blocks needed
*   IF there are enough memory blocks available for allocation THEN
*     compute the starting address of the allocated memory
*     mark the allocated memory blocks as "occupied" in the memory
*       allocation map
*   ELSE
*     return a value of 0
```

```
*
***********************************************************************
*
* REVISION LOG--
*
***********************************************************************
DECLARATION--
;
DOUBLE PROCEDURE request_memory (byte_cnt);                     ENTRY;
  VALUE byte_cnt; DOUBLE byte_cnt;
&
$DOC-&

BEGIN
  INTEGER next_avail_block,blocks_needed;
  acquire (memory_src);
  IF (blocks_needed:=blocks_requested(byte_cnt)) > 0 THEN
  IF (next_avail_block:=first_fit(blocks_needed)) >= 0 THEN
    BEGIN
      INTEGER i=REGISTER 6;
      request_memory := memory_base + (next_avail_block*block_size);
      FOR i := next_avail_block TO (next_avail_block+blocks_needed-1) DO
        memory_map [i] := blocks_needed;
      IF mem_debug THEN
        BEGIN
          WSTR("Granted @ ");
          WHex(memory_base+(next_avail_block*block_size),8); CRLF;
          dump_memory_status;
        END;
    END
  ELSE
    request_memory := 0;
  release (memory_src);
END request_memory;
```

```
#EJECT;
COMMENT
$DOC+
NAME--
  request_array
****************************************************************************
*
* SHORT DESCRIPTION--
*   request_array is identical to request_memory except that a
*   successful memory allocation returns the memory base address plus
*   header_size.
*
* EXTENDED DESCRIPTION--
*
* INPUTS--
*   byte_cnt = number of bytes of memory needed
*
* OUTPUTS--
*   starting address of (memory with byte_cnt available bytes) plus
*   header_size.
*
* ROUTINES CALLED--
*   request_memory
*
* ERROR CONDITIONS AND RECOVERY--
*   Users of this function should check for a return value of address 0
*   before proceeding to read/write to the returned address value.
*   Disastrous results may occur when attempting to write into address
*   location 0.
*
* AUTHOR--
*
****************************************************************************
*
* INITIAL REFINEMENT--
*
****************************************************************************
*
* REVISION LOG--
*
****************************************************************************
DECLARATION--
;
DOUBLE PROCEDURE request_array(byte_cnt);
  VALUE   byte_cnt;
  DOUBLE byte_cnt;                                          ENTRY;
&
$DOC-&

  BEGIN & request_array &
     DOUBLE addr;

     IF ( addr := request_memory(byte_cnt) ) = 0 THEN
        request_array := 0
     ELSE
        request_array := addr + header_size;
```

```
  END; & request_array &
```

```
#EJECT;
COMMENT
$DOC+

NAME--
  start_release_block
****************************************************************************
*
* SHORT DESCRIPTION--
*   returns the starting block of memory to be released
*
* EXTENDED DESCRIPTION--
*   This routine computes the starting block of memory to be released
*   from the given address.  The memory address passed is first checked
*   against the boundaries of memory that can be allocated.  Memory
*   addresses outside the memory allocation boundaries return a value
*   of -1 (indicating an invalid address).  Memory addresses within
*   bounds are divided by memory block size.  An even divide returns
*   the starting block otherwise the address is invalid since it is not
*   on a memory block boundary.
*
* INPUTS--
*   memory_address = address of allocated memory to be released
*
* OUTPUTS--
*   starting memory block to be released
*
* ROUTINES CALLED-- none
*
* ERROR CONDITIONS AND RECOVERY--
*   No checking is done (or can be done) to ensure that a memory address
*   that happens to fall on an even memory block boundary is in fact a
*   memory address that had been previously allocated.  It is therefore,
*   the user's responsibility to pass an address that was legitimately
*   allocated (via request_memory or stolen_memory).
*
* NOTES--
*
* AUTHOR--
*
****************************************************************************
*
* INITIAL REFINEMENT--
*   IF given address is within memory allocation boundaries THEN
*     compute starting memory block by dividing memory block size into
*       relative address
*     IF result of division is on an even memory block boundary THEN
*       return starting memory block
*     ELSE
*       return -1
*   ELSE
*     return -1
*
****************************************************************************
*
* REVISION LOG--
```

```
*
****************************************************************************
DECLARATION--
;
INTEGER PROCEDURE start_release_block (memory_address);
  DOUBLE memory_address;
&
$DOC-&

BEGIN
  DOUBLE address;
  INTEGER start_block=address+2;
  start_release_block := -1;
  IF (memory_address >= memory_base) AND
     (memory_address <= (memory_base+(block_size*block_max))) THEN
    BEGIN
      address := (memory_address-memory_base)/block_size;
      IF ((memory_address-memory_base) AND (block_size-1)) = 0  THEN
        start_release_block := start_block;
    END;
END start_release_block;
```

```
SMEMMGR.WORK.PD8510            THU, DEC 22, 1983, 10:46 AM     PAGE  19

#EJECT;
COMMENT
$DOC+

NAME--
  release_memory
************************************************************************
*
* SHORT DESCRIPTION--
*   release a set of allocated memory blocks
*
* EXTENDED DESCRIPTION--
*   This routine releases memory that has been allocated.  The memory
*   to be released is determined from the memory address from which a
*   starting memory block is computed.  The starting memory block is
*   mapped into the memory allocation map which contain the number of
*   memory blocks allocated for that particular address.  These blocks
*   of memory are then marked as "available" (0 value).
*   If the starting memory block to be released is also found in the
*   auxiliary memory tables, they are also removed from these tables.
*   The memory address (which is passed by reference) is then set to 0,
*   and the pointer to the first available memory block is updated.
*
* INPUTS--
*   memory_address = address of memory to "release"
*
* OUTPUTS--
*   memory_address = 0   (passed by reference)
*
* ROUTINES CALLED--
*   acquire
*   release
*   start_release_block
*   free_memory_id
*
* ERROR CONDITIONS AND RECOVERY--
*   Any invalid memory addresses are ignored and no attempt is made to
*   to release it.  Only certain invalid addresses can be detected:
*     - addresses outside the memory allocation boundaries
*     - addresses not on even memory block boundaries
*
* NOTES--
*
* AUTHOR--
*
************************************************************************
*
* INITIAL REFINEMENT--
*   Compute the starting memory block of memory to be released
*   IF memory address is valid THEN
*     get number of memory blocks to release (from allocation map)
*     mark those blocks as "available" in allocation map
*     IF memory is also in auxiliary tables THEN
*       remove it from the tables
*     update the pointer to the next available memory block
*
```

```
SMEMMGR.WORK.PD8510            THU, DEC 22, 1983, 10:46 AM     PAGE  20

************************************************************************
*
* REVISION LOG--
*
************************************************************************
DECLARATION--
;
PROCEDURE release_memory (memory_address);
  DOUBLE memory_address;                                          ENTRY;
&
$DOC-&

BEGIN
  INTEGER start_block;
  acquire (memory_src);
  IF (start_block:=start_release_block(memory_address)) >= 0 THEN
    BEGIN
      INTEGER total_blks, i=REGISTER 6;
      total_blks := memory_map[start_block] AND %OFF;
      FOR i := 0 TO max_memory_id DO       & clear any saved memory id &
        IF memory_id_status[i] = start_block THEN
          free_memory_id (i);
      IF total_blks > 0 THEN
        FOR i := start_block TO (total_blks+start_block-1) DO
          memory_map[i] := 0;
      IF mem_debug THEN
        BEGIN
          WSTR("RELEASED @ "); WHex(memory_address,8); CRLF;
          WHEX(total_blks); WSTR(" blks @");
          WHEX(start_block); CRLF;
        END;
      memory_address := 0;
      IF start_block < free_blk THEN
        free_blk := start_block;
      IF mem_debug THEN
        dump_memory_status;
    END
  ELSE
    BEGIN
      WSTR("Unable to release memory @ "); WHex(memory_address,8);
      CRLF;
    END;
  release (memory_src);
END release_memory;
```

```
SMEMMGR.WORK.PD8510            THU, DEC 22, 1983, 10:46 AM     PAGE  21

#EJECT;
COMMENT
$DOC+

NAME--
  release_array
************************************************************************
*
* SHORT DESCRIPTION--
*   identical to release_memory, except the address is the base address
*   of the allocated memory plus header_size.
*
* EXTENDED DESCRIPTION--
*
* INPUTS--
*   array_address
*
* OUTPUTS--
*
* ROUTINES CALLED--
*   release_memory
*
* ERROR CONDITIONS AND RECOVERY--
*
* NOTES--
*
* AUTHOR--
*
************************************************************************
*
* INITIAL REFINEMENT--
*
************************************************************************
*
* REVISION LOG--
*
************************************************************************
DECLARATION--
;
PROCEDURE  release_array(array_address);
  DOUBLE  array_address;                                   ENTRY;
&
$DOC-&

   BEGIN & release_array &
      DOUBLE array;

      IF array_address <> 0 THEN
         BEGIN & if &
            array := array_address - header_size;
            release_memory( array );
            IF array = 0 THEN                    & successful release &
               array_address := array;
         END;  & if &

   END;  & release_array &
```

```
SMEMMGR.WORK.PD8510            THU, DEC 22, 1983, 10:46 AM     PAGE  22
```

```
SMEMMGR.WORK.PD8510          THU, DEC 22, 1983, 10:46 AM     PAGE  23

#EJECT;
COMMENT
$DOC+

NAME--
  release_auxiliary_memory
*************************************************************************
*
* SHORT DESCRIPTION--
*   conditionally "releases" allocated memory
*
* EXTENDED DESCRIPTION--
*   This routine conditionally "releases" allocated memory by setting up
*   a list (table) of auxiliary memories identified and indexed by a
*   memory ID.  The memory does not get officially released until there
*   isn't enough blocks of memory available to satisfy an incomming
*   request.  This also allows a routine to re-use memory if it never
*   got released and re-allocated.
*   There are 2 auxiliary memory tables storing information about the
*   auxiliary memory:
*     1- memory_id_status = contains the starting memory block of
*                           auxiliary memory
*     2- memory_id_lgth   = contains the number of memory blocks of
*                           auxiliary memory
*
* INPUTS--
*   addr      = memory address to be identified as "auxiliary"
*   memory_id = index into "auxiliary" memory tables
*
* OUTPUTS-- none
*
* ROUTINES CALLED--
*   acquire
*   release
*
* ERROR CONDITIONS AND RECOVERY--
*   No range checking is done on the memory ID value that is passed.
*   Constant values found in CMEMMGR.WORK should be used.
*   Any invalid memory addresses are ignored and no attempt is made to
*   to "conditionally" release it.
*   Only certain invalid addresses can be detected:
*     - addresses outside the memory allocation boundaries
*     - addresses not on even memory block boundaries
*
* NOTES--
*
* AUTHOR--
*
*************************************************************************
*
* INITIAL REFINEMENT--
*   Compute starting memory block
*   IF memory address is valid THEN
*     store starting memory block and number of memory blocks in
*       auxiliary memory tables
*
```

```
SMEMMGR.WORK.PD8510          THU, DEC 22, 1983, 10:46 AM     PAGE  24

*************************************************************************
*
* REVISION LOG--
*
*************************************************************************
DECLARATION--
;
PROCEDURE release_auxiliary_memory (addr, memory_id);
  VALUE addr, memory_id;                                          ENTRY;
  DOUBLE addr;  INTEGER memory_id;
&
$DOC-&

BEGIN
  INTEGER start_block=REGISTER 6;
  acquire (memory_src);
  IF (start_block := start_release_block (addr)) >= 0 THEN
    BEGIN
      memory_id_status [memory_id] := start_block;
      memory_id_lgth [memory_id] := memory_map [start_block];
      aux_mem_avail := TRUE;
      IF mem_debug THEN
        BEGIN WSTR("RELEASE AUX:"); WHex(addr,8); CRLF;
              dump_aux_status;
        END;
    END;
  release (memory_src);
END release_auxiliary_memory;
```

```
SMEMMGR.WORK.PD8510          THU, DEC 22, 1983, 10:46 AM     PAGE  25

#EJECT;
COMMENT
$DOC+

NAME--
  memory_stolen
*************************************************************************
*
* SHORT DESCRIPTION--
*   checks if previously allocated memory has been re-allocated
*   (can also be used to allocate memory (via request_memory))
*
* EXTENDED DESCRIPTION--
*   This routine checks whether or not allocated memory which has been
*   "conditionally" released (marked as auxiliary memory in case of
*   memory allocation shortage) has been re-allocated.
*   The checking is determined from a table indexed by memory_id's
*   which contain the starting memory block of the each "auxiliary"
*   memory which has been conditionally released.  There is also a
*   corresponding table which contain the number of memory blocks per
*   "auxiliary" memory.
*
*   If the old memory address has not been re-allocated then it is
*   removed from the auxiliary memory list until it is released again as
*   auxiliary memory (release_auxiliary_memory).  The function returns
*   a FALSE value in this case.
*   However, if the requested number of memory blocks (computed from
*   byte_cnt) does not equal the original number of memory blocks
*   allocated then the corresponding memory blocks are "released",
*   the memory is re-allocated, and the function returns TRUE.
*   If the memory blocks have been re-allocated then a new memory
*   address is assigned and the function returns a TRUE value.
*
*   A value of -1 in the table of auxiliary memory indicates there is
*   no auxiliary memory corresponding to the memory ID.  A value of 0
*   in the corresponding table of memory blocks counts indicates there
*   that there are 0 auxiliary memory blocks for the corresponding ID.
*
* INPUTS--
*   addr      = previously allocated memory address (passed by reference)
*               could be changed if old address was re-allocated
*   memory_id= identifies owner of previously allocated memory, addr
*   byte_cnt = number of bytes of allocated memory needed
*
* OUTPUTS--
*   TRUE  = if allocated memory, "addr", has been re-allocated
*   addr  = new memory address allocated due to re-allocation
*
*   FALSE = if allocated memory, "addr", has not been re-allocated
*   addr  = same memory address originally allocated
*
* ROUTINES CALLED--
*   acquire
*   release
*   free_memory
*   release_memory
```

```
SMEMMGR.WORK.PD8510          THU, DEC 22, 1983, 10:46 AM     PAGE  26

*   request_memory
*
* ERROR CONDITIONS AND RECOVERY--
*   The parameter addr (passed by reference) and memory_id are not
*   linked together in any way.  That is, there is no checking done to
*   make sure that the memory_id identifies the original address, addr.
*
* NOTES--
*   This routine can also be used to do a "request_memory" using a
*   memory_id which has not yet released any auxiliary memory.
*
*   WARNING:  Any user of this routine must check for an return address
*   of 0 if a TRUE value is returned (indicating a new memory address
*   has been allocated).  Remember, an address value of 0 indicates that
*   that there is not enough memory available.
*
* AUTHOR--
*
*************************************************************************
*
* INITIAL REFINEMENT--
*   IF memory has not been re-allocated THEN
*     IF number of memory blocks needed = auxiliary number of blocks
*       THEN
*         remove corresponding information from auxiliary memory tables
*         return FALSE value
*       ELSE
*         release memory for re-allocation
*         return TRUE value
*   ELSE
*     return TRUE value
*
*************************************************************************
*
* REVISION LOG--
*
*************************************************************************
DECLARATION--
;
BOOLEAN PROCEDURE memory_stolen (addr, memory_id, byte_cnt);
  VALUE memory_id, byte_cnt;                                      ENTRY;
  DOUBLE addr; INTEGER memory_id; DOUBLE byte_cnt;
&
$DOC-&

BEGIN
  INTEGER mem_id;
  BOOLEAN stolen;
  acquire (memory_src);
  stolen := TRUE;
  IF (mem_id := memory_id_status [memory_id]) >= 0 THEN
  IF memory_id_lgth[memory_id] = blocks_requested(byte_cnt) THEN
    BEGIN
      free_memory_id (memory_id);
      stolen := FALSE;
    END;
```

SMEMMGR.WORK.PD8510 THU, DEC 22, 1983, 10:46 AM PAGE 27

```
  release (memory_src);
  IF stolen THEN
    BEGIN
      IF mem_id >= 0 THEN              & allocated but has wrong lgth &
        release_memory (addr);
      addr := request_memory (byte_cnt);
    END;
  memory_stolen := stolen;
END memory_stolen;

END$
```

CMENU.WORK.PD8510 THU, DEC 22, 1983, 10:46 AM PAGE 1

```
INTEGER CONSTANT

TAPE_MENU:= 0,
INIT_TAPE_MENU:= 1,
DIRECTORY_MENU:= 2,
DATA2_MENU:= 3,
DATA1_MENU:= 4,
ABORT_MENU:= 5,
FILE_MENU:= 6,
REG_MENU:= 7,
RESPONSE_MENU:= 8,
IF_GAIN_MENU:= 9,
IF_GAIN_MENU2:= 10,
STIMULUS_MENU:= 11,
N_POINTS_MENU:= 12,
POWER_MENU:= 13,
STIMULUS2_MENU:= 14,
DEVICE_READY_MENU:= 15,
PARAM_MENU:= 16,
REDEF_MENU:= 17,
REDEF_DRIVE_MENU:= 18,
REDEF_LOCK_MENU:= 19,
REDEF_NUM_MENU:= 20,
REDEF_NUM2_MENU:= 21,
REDEF_DENOM_MENU:= 22,
REDEF_CONV_MENU:= 23,
FORMAT_MENU:= 24,
DOMAIN_MENU:= 25,
LOW_PASS_FREQ:= 26,
TIME_SETUP_MENU:= 27,
GATE_SETUP_MENU:= 28,
GATE_SHAPE_MENU:= 29,
CAL_MENU:= 30,
MORE_CAL:= 31,
REF_PLANE_MENU:= 32,
CAL_TYPE_MENU:= 33,
PORT_ONE_REFL:= 34,
PORT_TWO_REFL:= 35,
CAL_MENU2:= 36,
REFLECTION_MENU:= 37,
TRANSMISSION_MENU:= 38,
ISOLATION_MENU:= 39,
CAL_MENU3:= 40,
SIMPLE_REFLECTION_MENU:= 41,
SIMPLE_TRANSMISSION_MENU:= 42,
SIMPLE_ISOLATION_MENU:= 43,
STD_CLASS_MENU:= 44,
SLIDING_LOAD_MENU:= 45,
MODIFY_CAL_KIT_MENU:= 46,
MODIFY_STDS_MENU:= 47,
DEFINE_OPEN_MENU:= 48,
DEFINE_SHORT_MENU:= 49,
DEFINE_LOAD_MENU:= 50,
SPECIFY_Z_MENU:= 51,
SPECIFY_OFFSET_MENU:= 52,
```

CMENU.WORK.PD8510 THU, DEC 22, 1983, 10:46 AM PAGE 2

```
SPECIFY_CLASS_MENU:= 53,
SPECIFY_CLASS_MENU2:= 54,
DISPLAY_MENU:= 55,
DUAL_CH_MENU:= 56,
DISPLAY_DEFAULT_MENU:= 57,
MEMORY_MENU:= 58,
MATH_MENU:= 59,
COPY_MENU:= 60,
PLOTPARM_MENU:= 61,
PLOT_SETUP_MENU:= 62,
PEN_MENU:= 63,
COPY2_MENU:= 64,
MARKER_MENU:= 65,
DELTA_MARKER_MENU:= 66,
MARKER2_MENU:= 67,
SYSTEM_MENU:= 68,
TITLE_MENU:= 69,
HPIB_MENU:= 70,
SERVICE_MENU:= 71,
LAST_MENU := 72;
```

FMENU.WORK.PD8510 THU, DEC 22, 1983, 10:46 AM PAGE 1

```
& fmenu3.work &
PROCEDURE process_softkey (num);  VALUE num;  INTEGER num;      EXTERNAL;
PROCEDURE blank_softkey (i);  VALUE i; INTEGER i;               EXTERNAL;
PROCEDURE change_softkey (new_line, cmd_token, line_no);
  VALUE new_line, cmd_token, line_no;
  ALPHA new_line; INTEGER cmd_token, line_no;                   EXTERNAL;
PROCEDURE highlight_menu;                                       EXTERNAL;
SUBROUTINE init_softkeys;                                       EXTERNAL;

& fmenu.work &
PROCEDURE previous_menu;                                        EXTERNAL;
PROCEDURE pop_menu (menu_num);
  VALUE menu_num;  INTEGER menu_num;                            EXTERNAL;
PROCEDURE gen_menu (num, level_incren);
  VALUE num, level_incren;  INTEGER num, level_incren;          EXTERNAL;

EXTERNAL INTEGER menu_level;       & current menu level being displayed &
EXTERNAL INTEGER ARRAY
  level_info [0:8];                &contains menu # at corr. menu levels&

& fmenu2.work &
PROCEDURE hilight_key (key_pos, first, last);
  VALUE key_pos, first, last;  INTEGER key_pos, first, last;    EXTERNAL;
PROCEDURE hilight_command (value);
  VALUE value;  INTEGER value;                                  EXTERNAL;
SUBROUTINE hilight_command_token;                               EXTERNAL;
PROCEDURE hilight_off (first, last);
  VALUE first, last;  INTEGER first, last;                      EXTERNAL;
PROCEDURE hilight_on (first, last);
  VALUE first,last;  INTEGER first,last;                        EXTERNAL;
```

```
M68KL,P,"menu"
BEGIN

#FILE fterm.work;
#FILE cdebug.work;
#FILE cmenu.work;
#FILE fdisplay.work;
#FILE fskey.work;               & tables of info. to generate softkeys  &
#FILE fscreen.work;             & general constant display vectors      &
#FILE fskpos.work;              & tables of softkey positioning vectors &
#FILE fcommand.work;            & command token/pending variables       &
#FILE fdispram.work;            & changing softkey strings in display   &
#FILE fchdata2.work;            & hilite bitmap information, hilite_info&
#FILE fchtable.work;            & current entry channel for hilighting  &
#FILE cchconst.work;            & ch 1 and ch 2 constant values         &

INTEGER CONSTANT
  hilite_max:= 367,          & determined from hilite_bitmap entries   &
  max_depth := 8;

GLOBAL
INTEGER
  menu_level;                   & current level of menu being displayed  &

GLOBAL                          & make max_depth change in fmenu.work&
INTEGER ARRAY                   & with actual constant              &
  level_info [0:max_depth];  &contains menu # at corr. menu levels&

INTEGER ARRAY
  char_cnt[0:7],        & max # chars to be highlighted in softkey  &
  keycode [0:7],        & contains keycode values of current menu   &
  next_menu [0:7];      & menu number corresponding to new menu key &

INTEGER POINTER
  menu_ptr;             & points to address of current menu         &

INTEGER
  menu_hilite,
  menu_config,          & 8 2-bit softkey menu config = # lines/key &
  menu_map;             & menu hilite and new menu softkey bitmap   &

BOOLEAN menu_on;        & menu on/off toggle flag for [PREVIOUS] key&
```

```
#EJECT;
COMMENT
$DOC+

NAME--
  highlight_menu
**********************************************************************
*
* SHORT DESCRIPTION--
*   Hilights certain softkeys of the current softkey menu
*
* EXTENDED DESCRIPTION--
*   This routine hilights softkey menus according to HILITE_BITMAP,
*   in which each bit corresponds to all softkey command token values.
*   The hilighting characters are up to 10 underscores (ie: "_________").
*   These variable length hilighting characters are indexed from a
*   local table in which the location of the character corresponds to
*   the length of the hilight.  The length of the hilight is determined
*   from another table (global) containing the length of the longest
*   softkey annotation for each softkey for the currently displayed
*   menu.
*   Display information starts at SK_HIGHLIGHT_DISPLAY and uses
*   FSCREEN.WORK constants as x,y vectors.
*   Softkey menu information which contains the number of lines per
*   softkey annotation indicates where the hilight character is to be
*   drawn.
*
* INPUTS--  none
*
* OUTPUTS--
*   display softkey highlighting
*
* ROUTINES CALLED--
*   move
*   printch
*   jmp
*
* ERROR CONDITIONS AND RECOVERY-- none
*
* NOTES--
*   This routine is also used for turning off hilights
*
* AUTHOR--
*
**********************************************************************
*
* INITIAL REFINEMENT--
*   Clear softkey hilight display
*   IF a menu is currently being displayed THEN
*     DO the following for each softkey:
*       IF a softkey is being displayed THEN
*         IF that softkey's bit is set in the hilight bitmap THEN
*           display a hilight char for that softkey
*
**********************************************************************
*
```

```
* REVISION LOG--
*
**********************************************************************
DECLARATION--
;
PROCEDURE highlight_menu;                                    ENTRY;
&
$DOC-&

BEGIN
  INTEGER i;
  INTEGER y,lgth,disp;
  BYTE underline;
  BYTE TABLE hilite_char := 0,
    hilight_1, hilight_2, hilight_3, hilight_4, hilight_5,
    hilight_6, hilight_7, hilight_8, hilight_9, hilight_10;

  disp := move (sk_highlight_display, sk_x, sk11_y);
  IF menu_on THEN
  FOR i:= 0 TO 7 DO
    IF (y:=keycode[i]) <> 0 THEN                    & valid softkey &
    IF (y > hilite_max) THEN                        & DEBUG &
      BEGIN WSTR("hilite bitmap overflow"); CRLF; END  & DEBUG &
    ELSE
      IF TBIT(hilite_info[current_entry_ch-1,RIGHT(y,4)],y AND %OF) THEN
        BEGIN
          underline := hilite_char[lgth:=char_cnt[i]]; & hilight key   &
          y := sk_line2[i];                   & double line y pos'n  &
          IF TBIT(menu_config,i+i) THEN
            y := y + 64;                      & single line y pos'n  &
          disp := move (disp, blanks[lgth], y);
          disp := printch( disp, underline);
        END;
  disp := jmp(disp,sk_highlight_display+sk_highlight_size);
END highlight_menu;
```

```
#EJECT;
COMMENT
$DOC+

NAME--
  blank_softkey
**********************************************************************
*
* SHORT DESCRIPTION--
*   blanks out softkey annotation on softkey menu display
*
* EXTENDED DESCRIPTION--
*   Disables command processing for softkey i and displays a blank
*   annotation for that softkey position (where i = 0..7
*
* INPUTS--
*   i = softkey position number (0..7)
*
* OUTPUTS--
*   blank softkey annotation for softkey position i.
*   non-functional command code value for softkey i
*
* ROUTINES CALLED--
*   print_string
*
* ERROR CONDITIONS AND RECOVERY--
*   The value of input i must be 1..8.
*   There is no range checking included to enforce this since the
*   routine is very local and invoked from controlled loops using
*   control variable values between 0 and 7 (inclusively).
*
* NOTES--
*   Used in blanking out/disabling entire softkey menu or certain
*   softkeys that are not used in a menu.
*
* AUTHOR--
*
**********************************************************************
*
* INITIAL REFINEMENT--
*   set command code value corresponding to softkey i to 0
*   print 2 blank lines in softkey position i
*
**********************************************************************
*
* REVISION LOG--
*
**********************************************************************
DECLARATION--
;
PROCEDURE blank_softkey (i);  VALUE i; INTEGER i;               ENTRY;
&
$DOC-&

BEGIN
  keycode[i] := 0;
```

SMENU.WORK.PD8510 THU, DEC 22, 1983, 10:46 AM PAGE 5

```
  print_string(" ", sk1_size,field[i]);
  print_string(" ", sk2_size,field[i+8]);
END;
```

SMENU.WORK.PD8510 THU, DEC 22, 1983, 10:46 AM PAGE 6

```
#EJECT;
COMMENT
$DOC+

NAME--
  kill_softkeys
*************************************************************************
*
* SHORT DESCRIPTION--
*   inactivates current softkey menu information
*
* EXTENDED DESCRIPTION--
*   Disables all softkey command processing by setting corresponding
*   command code values to non-functional (0) and blanking out softkey
*   annotations.  Also initializes current softkey menu highlighting
*   bitmap and that indicates which currently displayed softkey(s) are
*   to be highlighted.
*
* INPUTS--
*   none
*
* OUTPUTS--
*   non-functional softkey command codes
*   non-highlighting and menu bitmap
*
* ROUTINES CALLED--
*   blank_softkey
*
* ERROR CONDITIONS AND RECOVERY--
*   none
*
* NOTES--
*   Used for blanking out outer level menu with [PREVIOUS] hard key from
*   the front panel, and as part of power up or instrument preset.
*
* AUTHOR--
*
*************************************************************************
*
* INITIAL REFINEMENT--
*   set all softkey command codes to 0
*   blank out all softkey annotations
*   reset current menu level to 0 (first level)
*   initialize current menu highlighting bitmap
*   eliminate any displayed highlights
*
*************************************************************************
*
* REVISION LOG--
*
*************************************************************************
DECLARATION--
;
SUBROUTINE kill_softkeys;  ENTRY;
&
$DOC-&
```

SMENU.WORK.PD8510 THU, DEC 22, 1983, 10:46 AM PAGE 7

```
BEGIN
  menu_on := FALSE;
  FOR menu_map := 0 TO 7 DO
    blank_softkey (menu_map);
  menu_level := menu_map := 0;
  highlight_menu;
END kill_softkeys;
```

SMENU.WORK.PD8510 THU, DEC 22, 1983, 10:46 AM PAGE 8

```
#EJECT;
SUBROUTINE init_softkeys;                                       ENTRY;
BEGIN
  FOR menu_map := 0 TO max_depth DO
    level_info[menu_map] := -1;
  kill_softkeys;
END init_softkeys;
```

```
SMENU.WORK.PD8510                THU, DEC 22, 1983, 10:46 AM     PAGE  9

#EJECT;
COMMENT
$DOC+

NAME--
  change_softkey
************************************************************************
*
* SHORT DESCRIPTION--
*   changes a line in a softkey's annotation
*
* EXTENDED DESCRIPTION--
*   This routine replaces a softkey annotation line given the new
*   string, the corresponding softkey command code, and the line number
*   in which the string occurs.  Range checking and side effects are
*   described in ERROR CONDITIONS AND RECOVERY.
*   If the softkey annotation being modified is contained in a menu
*   being currently displayed, the modification will not be seen until
*   the menu is re-generated.
*
* INPUTS--
*   new_line = replacement string
*   cmd_code = command token value corresponding to softkey
*   line_no  = 1st or 2nd line of softkey to be changed
*
* OUTPUTS--  none
*
* ROUTINES CALLED--  none
*
* ERROR CONDITIONS AND RECOVERY--
*   Range checking and correction is done on softkey line number to
*   be changed and the maximum string length allowed per new line.
*   If not enough space was allocated for a softkey line to accomodate
*   the maximum string length then another softkey's annotation could
*   be potentially overwritten w/ new characters (one of which ends up
*   being the length byte of the overwritten string).  Fortunately,
*   this does not cause a software "crash" but one of the softkey menus
*   may contain unusually long strings.
*   No range checking is done on command token values that are passed
*   (which may cause unintentional modifications to parts of memory).
*   Therefore it behooves one to utilize the command token constants
*   created by GENSK in SKINFO!!!
*
* NOTES--
*   As a rule of thumb, softkey annotations that are apt to run-time
*   modifications, should be allocated the maximum number of characters
*   anticipated or allowed in a label.  This is pre-defined in the
*   SKINFO file which generates the softkey tables.  Currently, the
*   maximum string length allowed per softkey line is 10 characters.
*
* AUTHOR--
*
************************************************************************
*
* INITIAL REFINEMENT--
*
```

```
SMENU.WORK.PD8510                THU, DEC 22, 1983, 10:46 AM     PAGE  10

************************************************************************
*
* REVISION LOG--
*   8-2-83    -- used "wrt_disp_str" routine to change softkey labels
*                (general purpose routine for writing strings to display
*                 memory which is where the labels are located.)
*
************************************************************************
DECLARATION--
;
PROCEDURE change_softkey (new_line, cmd_token, line_no);
  VALUE new_line, cmd_token, line_no;                              ENTRY;
  ALPHA new_line; INTEGER cmd_token, line_no;
&
$DOC-&

BEGIN
  DOUBLE old_addr;
  ALPHA old_str=old_addr;
  BYTE POINTER new_str=new_line;
  INTEGER n;

  IF line_no >= 2 THEN          & restrict to only 1 to 2 lines/softkey &
    line_no := 1
  ELSE
  IF line_no <= 1 THEN
    line_no := 0;

  IF (n:=LBL_INDEX[2*(cmd_token-1)+line_no]) > 0 THEN
    BEGIN               & check for existing annotation in softkey line &
      IF new_str > sk2_size THEN                      & check string lgth &
        new_str := sk2_size;
    & old_str := ADRS(SK_LABEL)+n &
      old_str := SK_LABEL [n];
      wrt_disp_str (old_addr, new_line);
    END;
END change_softkey;
```

```
SMENU.WORK.PD8510                THU, DEC 22, 1983, 10:46 AM     PAGE  11

#EJECT;
COMMENT
$DOC+

NAME--
  hilight_off
************************************************************************
*
* SHORT DESCRIPTION--
*   turns off a all highlights in a set of softkey commands
*
* EXTENDED DESCRIPTION--
*   This routine will clear hilighting bits corresponding to a range of
*   given command token values from a set of softkey functions.
*   An integer array "hilite_bitmap" contain the softkey hilighting bits
*   to be cleared.  Integer divide by/modulo 16 is used to get the
*   correct bit in the array corresponding to a command token value.
*
* INPUTS--
*   first = lower limit of the command value set
*   last  = upper limit of the command value set
*
* OUTPUTS--  new hilight bitmap
*
* ROUTINES CALLED--  none
*
* ERROR CONDITIONS AND RECOVERY--
*   first > last --> no bits are read or cleared
*
* NOTES--
*   All hilighting bits corresponding to values from "first" to "last"
*   are all cleared.  Therefore, some thought should be given when
*   arranging softkey command functions in SKINFO.WORK so that sets of
*   particular functions occur contiguously.
*
* AUTHOR--
*
************************************************************************
*
* INITIAL REFINEMENT--
*   IF command values to be un-hilighted are within range THEN
*     clear corresponding bits in hilight bitmaps
*     update hilighting on display
*
************************************************************************
*
* REVISION LOG--
*   3/29/83   -- added limit checks to if command values exceed the
*                maximum number of bits available in the hilight bitmap.
*   8/18/83   -- changed hilite_bitmap to a 2 dimensional array,
*                hilite_info to accomodate 2-channel coupled and
*                uncoupled softkey functions that are hilighted.
*                Added a coupled hilighting bitmap (coupled_bitmap) to
*                indicate whether or not a softkey is coupled/uncoupled.
*                Check the coupled bitmap and unhilight softkeys under
*                current entry channel for uncoupled softkeys or
```

```
SMENU.WORK.PD8510                THU, DEC 22, 1983, 10:46 AM     PAGE  12

*                unhilight softkeys under both channels for coupled
*                softkeys.
*
************************************************************************
DECLARATION--
;
PROCEDURE hilight_off (first, last);                               ENTRY;
  VALUE first, last;  INTEGER first, last;
&
$DOC-&

BEGIN
  INTEGER index=REGISTER 6;
  INTEGER x,key_cnt,trash;
  INTEGER POINTER map1,map2;
  BOOLEAN all_coupled;
  IF first > hilite_max THEN
    first := hilite_max;
  IF last > hilite_max THEN
    last := hilite_max;
  index := RIGHT(first,4);                & first/16 to get bitmap index &
  key_cnt := last-first;                  & number of keys in group &
  x := first AND %OF;                     & 1st softkey bit to clear &
  all_coupled := TBIT (coupled_bitmap [index], x);
  IF key_cnt >= 0 THEN                    & clear out hilights for group &
    BEGIN
      DO BEGIN
        IF all_coupled THEN               & point to bitmaps to unhilight&
          BEGIN    & for coupled softkeys &
            STPNTR (map1, ADRS(hilite_info [0,index]));
            STPNTR (map2, ADRS(hilite_info [1,index]));
          END
        ELSE
          BEGIN    & for uncoupled softkeys &
            STPNTR (map1, ADRS(hilite_info[current_entry_ch-1,index]));
            STPNTR (map2, ADRS(trash));
          END;
        DO BEGIN                          & unhilight 1  word at a time  &
          map1 := RBIT (map1, x);
          map2 := RBIT (map2, x);
        END UNTIL ((key_cnt:=key_cnt-1)<0) OR ((x:=x+1)=16);
        x := 0;
        index := index+1;
      END UNTIL (key_cnt < 0);
      highlight_menu;
    END;
  IF menu_debug THEN
    BEGIN
      WSTR("hilite off:"); WHEX(first); WHEX(last); CRLF;
    END;
END hilight_off;
```

```
SMENU.WORK.PD8510            THU, DEC 22, 1983, 10:46 AM     PAGE  13

#EJECT;
COMMENT
$DOC+

NAME--
  hilight_command
*************************************************************************
*
* SHORT DESCRIPTION--
*   sets hilighting corresponding to current command token value
*
* EXTENDED DESCRIPTION--
*   This routine hilights the command value passed as a parameter by
*   setting the corresponding bit in the hilight bitmap and updating
*   the display hilight.
*
* INPUTS--
*   value = softkey function command value to be hilighted
*
* OUTPUTS--  none
*
* ROUTINES CALLED--
*   hilight_menu
*
* ERROR CONDITIONS AND RECOVERY--
*   none
*
* NOTES--
*
* AUTHOR--
*
*************************************************************************
*
* INITIAL REFINEMENT--
*   IF command value is within range THEN
*     set corresponding bit in hilight bitmap
*     update hilight display
*
*************************************************************************
*
* REVISION LOG--
*   3/29/83   -- added hilight bitmap limit check
*   8/18/83   -- changed hilite_bitmap to a 2 dimensional array,
*                hilite_info to accomodate 2-channel coupled and
*                uncoupled softkey functions that are hilighted.
*                Added a coupled hilighting bitmap (coupled_bitmap) to
*                indicate whether or not a softkey is coupled/uncoupled.
*                Check the coupled bitmap and hilight softkey under
*                current entry channel for uncoupled softkey or
*                hilight softkey under both channels for coupled
*                softkey.
*
*************************************************************************
DECLARATION--
;
PROCEDURE hilight_command (value);
```

```
SMENU.WORK.PD8510            THU, DEC 22, 1983, 10:47 AM     PAGE  14

  VALUE value;  INTEGER value;                                    ENTRY;
&
$DOC-&

BEGIN
  INTEGER bit_pos;
  INTEGER POINTER ch1_pos, ch2_pos;
  IF value <= hilite_max THEN
    BEGIN
      menu_hilite := RIGHT (value,4);                    & value DIV 16 &
      bit_pos := ZOF AND value;                          & value MOD 16 &
      IF menu_debug THEN
        BEGIN WSTR("hilite cmd:"); WHEX(value); WHEX(menu_hilite);
              WHEX(bit_pos); END;
      STPNTR (ch1_pos, ADRS(hilite_info [0,menu_hilite]));
      STPNTR (ch2_pos, ADRS(hilite_info [1,menu_hilite]));
      IF TBIT (coupled_bitmap[menu_hilite],bit_pos) THEN
        BEGIN             & softkeys are coupled, hilight both channels &
          ch1_pos := SBIT(ch1_pos,bit_pos);
          ch2_pos := SBIT(ch2_pos,bit_pos);
          IF menu_debug THEN WSTR(" coupled");
        END
      ELSE                & softkeys uncoupled, use current entry chan  &
        IF current_entry_ch = ch1 THEN
          ch1_pos := SBIT(ch1_pos, bit_pos)
        ELSE
          ch2_pos := SBIT(ch2_pos, bit_pos);
      highlight_menu;                & update current highlight display &
    END;
    IF menu_debug THEN CRLF;
END hilight_command;
```

```
SMENU.WORK.PD8510            THU, DEC 22, 1983, 10:47 AM     PAGE  15

#EJECT;
COMMENT
$DOC+

NAME--
  hilight_command_token
*************************************************************************
*
* SHORT DESCRIPTION--
*   similar to hilight_command
*
* EXTENDED DESCRIPTION--
*   This routine uses hilight_command to hilight a softkey cooresponding
*   to the current command_token value.

  INPUTS--   none

  OUTPUTS--  none

  ROUTINES CALLED--
    hilight_command

  ERROR CONDITIONS AND RECOVERY--
*   none
*
* NOTES--
*
* AUTHOR--
*
*************************************************************************
*
* INITIAL REFINEMENT--
*   calls hilight_command with command_token as a parameter
*
*************************************************************************
*
* REVISION LOG--
*
*************************************************************************
DECLARATION--
;
SUBROUTINE hilight_command_token;                                 ENTRY;
&
$DOC-&

BEGIN
  hilight_command (command_token);
END hilight_command_token;
```

```
SMENU.WORK.PD8510            THU, DEC 22, 1983, 10:47 AM     PAGE  16

#EJECT;
COMMENT
$DOC+

NAME--
  hilight_on
*************************************************************************
*
* SHORT DESCRIPTION--
*   hilights current command token softkey and unhilight a given set of
*   of command values
*
* EXTENDED DESCRIPTION--
*   This routines unhilights the range of given command values and
*   hilights the current command token value corresponding to a
*   softkey function. (In effect, the routines "hilight_off" and
*   "hilight_command_token" are called.)
*
* INPUTS--
*   first = lower limit of command values to unhilight
*   last  = upper limit of command values to unhilight
*
* OUTPUTS--  none
*
* ROUTINES CALLED--
*   hilight_off
*   hilight_command_token
*
* ERROR CONDITIONS AND RECOVERY--
*   none
*
* NOTES--
*
* AUTHOR--
*
*************************************************************************
*
* INITIAL REFINEMENT--
*   Calls hilight_off and hilight_command_token
*
*************************************************************************
*
* REVISION LOG--
*
*************************************************************************
DECLARATION--
;
PROCEDURE hilight_on (first, last);
  VALUE first,last;  INTEGER first,last;                          ENTRY;
&
$DOC-&

BEGIN
  hilight_off (first, last);
  hilight_command_token;
END higlight_on;
```

```
SMENU.WORK.PD8510               THU, DEC 22, 1983, 10:47 AM     PAGE  17
```

```
SMENU.WORK.PD8510               THU, DEC 22, 1983, 10:47 AM     PAGE  18

%EJECT;
COMMENT
$DOC+

NAME--
  hilight_key
*************************************************************************
*
* SHORT DESCRIPTION--
*   similar to routine "hilight_on"
*
* EXTENDED DESCRIPTION--
*   This routine is identical to "hilight_on" except that the
*   current command_token value is not used and another command value
*   that is passed as a parameter instead corresponds to the softkey
*   function to be hilighted.
*
* INPUTS--
*   key_pos = softkey command value to be hilighted
*   first   = lower limit of command values to unhilight
*   last    = upper limit of command values to unhilight
*
* OUTPUTS-- none
*
* ROUTINES CALLED--
*   hilight_off
*   hilight_command
*
* ERROR CONDITIONS AND RECOVERY--
*
* NOTES--
*
* AUTHOR--
*
*************************************************************************
*
* INITIAL REFINEMENT--
*   Calls hilight_off and hilight_command
*
*************************************************************************
*
* REVISION LOG--
*
*************************************************************************
DECLARATION--
;
PROCEDURE hilight_key (key_pos, first, last);
  VALUE key_pos, first, last;  INTEGER key_pos, first, last;      ENTRY;
&
$DOC-&

BEGIN
  hilight_off (first, last);
  hilight_command (key_pos);
END hilight_key;
```

```
SMENU.WORK.PD8510               THU, DEC 22, 1983, 10:47 AM     PAGE  19

%EJECT;
COMMENT
$DOC+

NAME--
  gen_menu
*************************************************************************
*
* SHORT DESCRIPTION--
*   displays softkey menu identified by MENU_NUM
*
* EXTENDED DESCRIPTION--
*   Generates a softkey menu, MENU_NUM, whose constant values are found
*   found in #FILE CMENU.WORK.  Updates current MENU_LEVEL (depth) and
*   its corresponding menu number in a menu depth table, INFO_LEVEL.
*   The softkey command code table, KEYCODE is updated with the new
*   menu's command codes found in that menu's information table.
*   When printing softkey label annotations on the display, single line
*   annotations are centered (via half LF char).  Unused softkeys are
*   annotated with a blank (this eliminates any previous menu annotation
*   in that position) and corresponding command codes are set to zero.
*   Menu hilight bitmap is updated using command code hilight bitmap.
*   Menu highlighting is invoked at the end to either eliminate previous
*   highlights or display highlights corresponding to the current menu.
*
* INPUTS--
*   menu_num     = number of softkey menu to be generated
*   level_incren = -n returning to a previous menu n levels up
*                   0 outermost level menu (hardkey generated)
*                   1 bringing up a new menu (softkey generated)
*
* OUTPUTS--
*   softkey menu annotations to dispaly gen.
*
* ROUTINES CALLED--
*   blank_softkey
*   highlight_menu
*   print_string (external)
*   print_ch     (external)
*
* ERROR CONDITIONS AND RECOVERY--
*   Range checking is done for "bogus" MENU_NUM values and attempts to
*   return to previous menus from the outermost level, or bring up new
*   menus exceeding maximum menu depth, MAX_DEPTH.  This can be removed
*   to gain speed when we're sure all calls have valid menu numbers.
*   Invalid menu numbers and trying to return from outer level menus
*   aborts the routine.  Attempts to bring up menus exceeding the
*   maximum depth will store menu information on top of the deepest
*   menu information in LEVEL_INFO.
*
* NOTES--
*   Softkey annotation positioning vectors and display addresses are
*   initialized in SDISPLAY.WORK
*
* AUTHOR--
*
```

```
SMENU.WORK.PD8510               THU, DEC 22, 1983, 10:47 AM     PAGE  20

*************************************************************************
*
* INITIAL REFINEMENT--
*   If invalid menu number values and menu depths then
*     Else
*   Update menu level
*   Make entry in menu depth table
*   Using the current menu information table,
*     store command code value in current softkey command code table
*     get number of lines per softkey
*     center annotation if single line softkey
*     print softkey annotations on display
*     update menu hilight bitmap using command code hilight bitmap
*   highlight menu
*
*************************************************************************
*
* REVISION LOG--
*  07-27-82:  Added code to right justify all softkey annotations
*  11-28-83:  Added check to prevent generating a menu identical to
*             the outermost menu on the stack.
*
*************************************************************************
DECLARATION--
;
PROCEDURE gen_menu (num, level_incren);                            ENTRY;
VALUE num, level_incren;  INTEGER num, level_incren;
&
$DOC-&

BEGIN

INTEGER CONSTANT max_lgth := 10;
ALPHA annot;
BYTE POINTER lgth=annot;
INTEGER i,                    & loop control variable to gen softkey menu &
  n1,n2,                      & label index to particular softkey line    &
  line2,                      & index to annotation table for 2nd line    &
  key;                        & softkey count (not 1 to 1 with position)  &
BYTE ch;                      & half_lf or null character &

  key := 1;
  IF NOT ((level_info[menu_level] = num)      & don't gen duplic. menu &
     AND (level_incren <> 0)) THEN
  IF (num >= 0) AND (num < LAST_MENU) THEN     & range check menu no.   &
  IF (menu_level:=menu_level+level_incren) < 0 THEN
    menu_level := 0
  ELSE
  BEGIN
    IF (level_incren = 0) OR NOT menu_on THEN
      menu_level := 0
                                               & menu depth range check &
    ELSE
    IF menu_level > max_depth THEN
      menu_level := max_depth;
    menu_on := TRUE;
    STPNTR (menu_ptr, SK_MENU[num]);                  & get menu address &
```

```
level_info[menu_level] := num;                          & current menu no. &
menu_map := menu_ptr&[0]&;                   & highlighting configuration  &
menu_config := menu_ptr[1];                  & number of lines per softkey &
FOR i := 0 TO 7 DO
IF (RIGHT(menu_config,2*i) AND %03)>0 THEN
  BEGIN     & fill in keycode table value and print softkey label &
    n1 := 2*((keycode[i]:=menu_ptr[key:=key+1])-1);
    IF (line2:=LBL_INDEX[n1+1])=0 THEN              & center single line &
      ch := half_lf                                 & softkey annotation &
    ELSE
      ch := 0;                          & indicates 2 lines in softkey &
    printch (field[i]-1,ch);
  & annot := ADRS(SK_LABEL)+LBL_INDEX[n1]  &
    annot := SK_LABEL[LBL_INDEX[n1]];  & right justify 1st sk line &
    n1 := n2 := 0;
    IF (n1:=lgth&[0]&)>max_lgth OR (n1<0) THEN n1 := max_lgth;
    IF ((lgth[n1] AND %6F) < 8) THEN   & bracket character fix      &
      n1 := n1-1;                      & 10010xxx mask &
    move(field[i]-4,blanks[n1],sk_line1[i]);
    print_string (annot,sk1_size,field[i]);
  & annot := SK_LABEL+line2 &
    annot := SK_LABEL[line2];
    IF ch = 0 THEN                          & right justify 2nd line &
      BEGIN
        IF (n2:=lgth&[0]&)>max_lgth OR (n2<0) THEN n2 := max_lgth;
        IF (lgth[1]=(ch:=half_vt)) THEN    & put half_vt in a byte &
          n2 := n2-1;
        move (field[i+8]-2,blanks[n2],sk_line2[i]);
      END;
    print_string (annot,sk2_size,field[i+8]);
    IF TBIT(menu_map,i+8) THEN
      next_menu[i] := menu_ptr[key:=key+1];
    char_cnt[i] := (IF n1 > n2 THEN n1 ELSE n2);    & longest line &
  END
 E
 lank_softkey(i);
 hlight_menu;

 _menu;
```

```
#EJECT;
COMMENT
$DOC+

NAME--
  process_softkey
***********************************************************************
*
* SHORT DESCRIPTION--
*   extracts command code corresponding to the current softkey function
*
* EXTENDED DESCRIPTION--
*   This routine is called only be command in response to a softkey
*   being pressed on the front panel.  It extracts the command code
*   value corresponding to that softkey position from the current menu,
*   sets the command_pending flag to continue to executing commands off
*   the current command code value, and brings up any menu that is to be
*   generated from that softkey.
*
* INPUTS--
*   softkey position
*
* OUTPUTS--
*   command code value
*   new menu, if any
*
* ROUTINES CALLED--
*   gen_menu
*
* ERROR CONDITIONS AND RECOVERY--
*   softkey position ranges from 1..8 (no range checking done)
*
* NOTES--
*
* AUTHOR--
*
***********************************************************************
*
* INITIAL REFINEMENT--
*   set new command token
*   set command_pending flag
*   if this softkey brings up a new menu then
*     generate it on the display
*
***********************************************************************
*
* REVISION LOG--
*
***********************************************************************
DECLARATION--
;
PROCEDURE process_softkey (num);                               ENTRY;
VALUE num;  INTEGER num;
&
$DOC-&
```

```
BEGIN
  command_token := keycode[num-1];
  command_pending := TRUE;
  IF TBIT(menu_map,num+7) THEN
    gen_menu(next_menu[num-1],1);
END process_softkey;
```

```
#EJECT;
COMMENT
$DOC+

NAME--
  previous_menu
***********************************************************************
*
* SHORT DESCRIPTION--
*   brings up menu previous to current one if one exists, or a blank
*   menu otherwise
*
* EXTENDED DESCRIPTION--
*   This routine is function of the [PREVIOUS] front panel key which
*   returns to the previously displayed menu which brought up the
*   current menu, or toggles (turn off/on) the outermost level menu
*   displays.  Once a menu display is off, the softkeys are no longer
*   activated (that is, they are functionless).
*
* INPUTS--   none
*
* OUTPUTS--  previous or no softkey menu
*
* ROUTINES CALLED--
*   gen_menu
*   kill_softkeys
*   print_string
*
* ERROR CONDITIONS AND RECOVERY--
*   none
*
* NOTES--
*   For outermost level menus with dynamic labels (ie. SAVE/RECALL menu)
*   a special check is thrown in to re-display the dynamic annotations.
*
* AUTHOR--
*
***********************************************************************
*
* INITIAL REFINEMENT--
*   If not outermost level menu then
*     generate previous softkey menu which brought it up
*   Else
*   If a menu is current up then
*     blank out current menu (should be outermost menu at this point)
*   Else
*     regenerate outermost level menu
*
***********************************************************************
*
* REVISION LOG--
*
***********************************************************************
DECLARATION--
;
PROCEDURE previous_menu;                                       ENTRY;
```

```
&
$DOC-&

BEGIN
  #FILE fdatamgr.work;                          & for gen_last_reg_menu &
  INTEGER prior_menu;
  IF (menu_level = 0) AND (menu_on) THEN
    kill_softkeys
  ELSE
  IF menu_level >= 0 THEN
    BEGIN
      prior_menu := level_info [IF menu_level > 0 THEN
                                  menu_level-1
                                ELSE
                                  menu_level];
      IF prior_menu = REG_MENU THEN
        gen_last_reg_menu
      ELSE
        gen_menu (prior_menu, (IF menu_level > 0 THEN -1 ELSE 0));
    END;
END previous_menu;
```

```
#EJECT;
COMMENT
$DOC+

NAME--
  pop_menu
*************************************************************************
*
* SHORT DESCRIPTION--
*   pop to given menu number within current softkey menu stack
*
* EXTENDED DESCRIPTION--
*   This routine gives the flexibility of popping to an arbitrary menu
*   from within the current menu stack w/o having to know how many
*   menu levels to back up to.  The current menu stack is scanned from
*   the most recent menu level to the outermost menu level until the
*   requested menu (MENU_NUM) is found.  A requested menu not found
*   within the menu stack becomes the outermost menu.  The menu stack
*   and related menu variables are automatically updated during the
*   menu search prior to displaying the requested menu.
*
* INPUTS--   menu_num = menu number to pop to
*
* OUTPUTS--  new softkey menu on display
*
* ROUTINES CALLED--
*   gen_menu
*
* ERROR CONDITIONS AND RECOVERY--
*   none
*
* NOTES--
*   This routine will only generate previous menus displayed before the
*   current one.
*
* AUTHOR--
*
*************************************************************************
*
* INITIAL REFINEMENT--
*   IF current menu level > 0 THEN
*     scan previous menus and update menu stack pointer until
*       the requested menu number is found in the stack
*       or menu stack pointer points to the outermost menu
*     generate requested menu
*
*************************************************************************
*
* REVISION LOG--
*
*************************************************************************
DECLARATION--
;
PROCEDURE pop_menu (menu_num);                                      ENTRY;
  VALUE menu_num;  INTEGER menu_num;
&
```

```
$DOC-&

BEGIN
  INTEGER pop_cnt,
          menu_position=REGISTER 6;
  IF menu_level > 0 THEN
    BEGIN
      pop_cnt := 0;
      menu_position := menu_level;
      DO  pop_cnt := pop_cnt-1
      UNTIL
        (menu_num = level_info [menu_position:=menu_position-1])  OR
        (menu_position = 0);
      IF (level_info[menu_position] = menu_num) THEN
        gen_menu (menu_num, pop_cnt);
    END;
END pop_menu;

END$
```

```
INTEGER CONSTANT
  null_message := 0,
  command_not_implemented := 2,
  option_omitted := 26,
  invalid_command := 55,
  exceeded_available_memory := 71,
  c_file_1 := -1;
```

CMESSAG1.WORK.PD8510 THU, DEC 22, 1983, 10:47 AM PAGE 1

```
INTEGER CONSTANT
  too_many_characters := 1406,
  syntax_error := 1436,
  deadlock := 1449,
  process_creation_error := 1467,
  no_pretune_lock := 1490,
  pretune_fail := 1502,
  phase_lock_fail := 1514,
  phase_lock_lost := 1533,
  vto_over_range := 1549,
  swp_sync_err := 1564,
  if_overload := 1588,
  bad_bc_value := 1600,
  no_active_marker := 1620,
  inconsistent_operation := 1647,
  titling_instructions := 1689,
  title_function_not_active := 1733,
  test_set_overtemp := 1762,
  forward_device := 1784,
  reverse_device := 1825,
  illegal_test_set_operation := 1866,
  adc_cal_failed := 1903,
  if_cal_failed := 1918,
  adc_not_responding := 1932,
  autorange_cal_failed := 1951,
  swp_too_fast := 1972,
  ext_ref_unlocked := 1992,
  c_file_7 := -1;
```

CMESSAG2.WORK.PD8510 THU, DEC 22, 1983, 10:47 AM PAGE 1

```
#FILE cmessag0.work;

INTEGER CONSTANT all_messages := -1;
```

CMESSAGE.WORK.PD8510 THU, DEC 22, 1983, 10:47 AM PAGE 1

```
#FILE calphas.work;        & contains all #FILES for warn/tell messages &
```

CMKR.WORK.PD8510 THU, DEC 22, 1983, 10:47 AM PAGE 1

```
INTEGER CONSTANT

cmd_marker_1 := 295,
cmd_marker_2 := 296,
cmd_marker_3 := 297,
cmd_marker_4 := 298,
cmd_marker_5 := 299,
cmd_marker_off := 300,
cmd_delta_marker := 301,
cmd_ref_mkr1 := 302,
cmd_ref_mkr2 := 303,
cmd_ref_mkr3 := 304,
cmd_ref_mkr4 := 305,
cmd_ref_mkr5 := 306,
cmd_no_ref_mkr := 307,
cmd_mkr_to_min := 308,
cmd_mkr_to_max := 309,
cmd_group9 := 0;
```

```
FRKR.WORK.PD8510              THU, DEC 22, 1983, 10:47 AM    PAGE  1

COMMENT
 This is a software generated file !!!
 Changes must be made in SKINFO.WORK
 Run GENSK.LANI to re-generate file;

SUBROUTINE proc9;  ENTRY;
BEGIN

CASE command_token-295 OF
BEGIN
& 295 &
select_marker(1);
& 296 &
select_marker(2);
& 297 &
select_marker(3);
& 298 &
select_marker(4);
& 299 &
select_marker(5);
& 300 &
select_marker(0);
& 301 &
BEGIN END;
& 302 &
select_ref_marker( 1 );
& 303 &
select_ref_marker( 2 );
& 304 &
select_ref_marker( 3 );
& 305 &
select_ref_marker( 4 );
& 306 &
select_ref_marker( 5 );
& 307 &
select_ref_marker( 0 );
& 308 &
marker_to( mkr_to_min );
& 309 &
marker_to( mkr_to_max );
END;
END proc9;
```

```
SMONITOR.WORK.PD8510          THU, DEC 22, 1983, 10:47 AM    PAGE  1

M68KL,A,"monitor"
BEGIN
USE REGISTER 0-11;
COMMENT
************************************************************************
*
*                            85101 MONITOR
*   FILE:SMONITOR.WORK.PD8510   Dec   8 1983        VERISION: x13
*
*                   FOR THE 85101 MC68000 PROCESSOR
************************************************************************
*   VERSION A.03  -- 7/20/80 -- Added DGInit
*                   - Added Terminal Abort via BREAK
*                   - Added Memory Refresh routine
*   VERSION A.04  -- 8/10/80 -- LOAD and GO on Power up
*   VERSION A.05  -- 9/3/80 -- Added better exception messages
*                   - Will output "*" even w/o memory
*                   - Direct tape record/load of display char set
*                   - Change Monitor Stack to 000FFFE from 7FFE
*                        and User Stack to 000FD80
*   VERSION A.06  -- 11/14/80 --Change Display Intialize from NOP to E00
*                   - Added Unimplemented Instruction Traps
*                   - Set  TermMode Flag so that ABORT doesnot latch up
*                   - Remove Assemble patch for ROM at High Memory %80000
*                   - Change Monitor Stack to FFFFF800 (Globals till
*                                                          FFFFF612
*
*                   - Set DM 100 as default next command after ZP
*   VERSION I      -- 12/1/80 -- Corrected Set DM 100 to work
*                   - Converted to final MC68000 instruction set
*                   - Added more delay in ACIA initializion
*                   - Fixed "CR" for PCTR=1 ie CR 10FE
*   VERSION A1     -- 12/18/80 -- Removed Tape buffer
*                   - Added Tape error codes
*                   - Changed use of TermMode Flag to IOdevice Flag
*                   - Change Records/Loads to use Three(3) blocks
*                   - PowerOn Zeroed 00C0-00FF for uses as debug flags
*                   - Added Bubble Memory RB/LB/LoadGo on power on
*                   - Added minmual CHAR Set 0-9,@,A-Z,CR,LF
*                   - Added Keyboard entry to Monitor
*   VERSION A2     - 1/4/81 -- Activated the bubble software (INTEL)
*                              to use on board software
*                   - Ignore Trap15 if first instruction after GO
*                   - Set SRsave:=%2700 if GO had parameters
*   VERSION A3     - 1/24/81 -- Added TAPEntry
*                     Fixed CR (again) so on return only A0 printed
*                   - Added Preset pulse a start of monitor
*                   - Moved a copy of $RAM$ down to Loc 0
*   VERSION A4     -- 2/20/81 -- Automatic DM100 on RM,LM,RB,LB
*                   - Modified ZP to accept 24 bit address
*                   - Increased KeyBuffer size
*   VERSION A5     -- 5/25/81
*                   - Moved RAM to 1FFFEH (overlapping IO space)
*   VERSION A6     -- 7/1/81
*                   - Change address tested for Refresh from %90000
*                   - Change coding so HI on CRT will appear w/o IO board
```

```
SMONITOR.WORK.PD8510          THU, DEC 22, 1983, 10:47 AM    PAGE  2

*                   - Change SXMBM to work w/o proto 3 hardware
*                   - Fixed TRACE to work with CR input,and not effect SR
*                   - Fixed a missing .L on the restore G reg in TAPEntry
*   VERSION A7      - Deleted use of reg 13 by monitor, monitor's G reg
*                        is change (by assemble edit) to reg 12
*                        (no conflict between user program and monitor)
*                   - Certain variable changed to absoulte adrress, not G
*                   - Restored moniter stack immediately after saving reg
*   VERSION A8      -- 9/20/81
*                   - Added TPseek
*                   - Deleted overhead to support physical multi-filetape
*   VERSION A9      -- 10/8/81
*                   -  Fixed A8 srewups
*   VERSION B1      -- 10/12/81
*                   -  Reset version number
*                   -  upgraded to new init_mbm and set_add_mbm
*   VERSION B2      -- 10/13/81
*                   -  Added Multiplier busy routine (Null exception)
*                   -  Changed TPready
*   VERSION B3      -- 12/16/81
*                   -  Read HPIB Status2 to clear interrupt if set
*                   -  Disable Interrupts immediately entering monitor
*                   -  Refresh clears its ISR bit
*                   -  Refresh changed to interrupt #1 from #13
*                   -  Change BOOLEANS to BITFIELDS
*                   -  Added Proto2 test
*                   -  Autoclear watchdog circuit if not proto2 hardware
*   VERSION B4      -- 2/4/82
*                   -  Properly initialize BRCount
*                   -  Buadrate hardware change--Buadcount number changed
*   VERSION B5      -- 2/10/82
*                   -  Set 64K words of display memory to E00
*                   -  Added null char to CRLF for 9600 Buad pad
*   VERSION B6      -- 2/25/82
*                   -  Refresh restores Status(IR level) while refreshing
*
*   VERSION B7      -- ADD SELF TEST LINK FROM RECALL KEY
*
*   VERSION C1      -- May 5 1982
*                   -  Changed Tape and bubble record limits
*                   -  Move monitor display Ram from %107D00 to %105D00
*   VERSION C2      -- May 16 1982
*                   -  Add tape marking function
*                   -  Improved tape seek
*                   -  Again new fix for 9600 buad
*   VERSION C3      -- July 8 1982
*                   -  Expanded default record params
*                   -  Move "RC" ( Selt Test link )software to bubble two
*   VERSION D1      -- JULY 28 1982
*                   -  Change to 9600 BAUD
*   VERSION X1      - Checksum added to zapp (zappmon) now in self test
*                   - Stuck key test added to self test
*   VERSION X2      - Revised for new keyboard,monitor menu shortened
*                   - all monitor functions are still available from
*                   - terminal except "RC" which has been deleted as
*                   - all self test sw is now in prom.
```

```
SMONITOR.WORK.PD8510          THU, DEC 22, 1983, 10:47 AM    PAGE  3

*   VERSION D3      - NOV  12 1982 -- HI BILL
*                   - Fix problem in setting track1 on tape
*                   - Changed record memory limits
*   VERSION D4      - CORRECTED READ STATEMENTS FOR NEW COMPILER
*                   - CHANGED STACK POINTER TO %FO SO MONITOR DOESN'T
*                   - CLOBBER USERS CODE
*
*    12-2-82 X2     -MOVED SOFTKEYS TO RESTOREMONVALUES AND MOVED
*                    RESTOREMONVALUES TO MONBAILOUT<0 TO GET RID OF
*                    PROBLEM USING GO AFTER BREAK.DON'T UNDERSTAND WHY
*                    THIS WAS NECESSARY BUT CALLING SOFTKEYS DURING
*                    EXCEPTION PROCESSING OF BREAK SCREWS UP THE STACK.
*   VERSION X3      - Dec 28 1982
*                   - Change StartUp user stack to %FO
*                   - Fixed read statements to work with new compiler
*   VERSION X4      - ADDED VTO PRETUNE TO BBTEST FOR FRONT END CHECKING
*                   - WITH MANUAL SOURCE
*                   - REPLACED RESTOREMONVALUES IN ENTERMONITOR AS THIS
*                   - WAS REMOVED FOR X2 REV IN ERROR . THIS ROUTINE IS
*                   - NEEDED FOR TRAP EXCEPTIONS WITH TRACE ON.
*                   - MAKING TWO TRIPS THRU EXITMONITOR WITHOUT RESTORING
*                   - THE BREAKPOINT INSTRUCTION LEAVES THE TRAP
*                   - IN BOTH BRINS AND AT BRADD.
*
*   VERSION X5      -CHANGED MBMLOAD MESSAGE FROM HI TO SYSTEM BEING
*                   -INITIALIZED.REMOVED RESTOREMONVALUES FROM MON
*                   -BAILOUT AS IT IS NOT NEEDED AFTER X4 REV.DID
*                   -GENERAL HOUSEKEEPING TO REDUCE CODE AS WE ARE
*                   -WITHOUT ROOM FOR MUCH BUG FIXING.
*
*   VERSION X6      -ADDED MONBAILOUT(10) FOR INIT_MBM FAILURE
*                   -CONDITIONS IN GETMAIN AND AT NORMAL LOAD AND GO
*                   -CHANGED DGINIT MESSAGE FROM 'HI' TO 'TESTING'.
*                   -CHANGED RECORD LIMITS TO AGREE WITH FEB 5.
*                   -VERSION OF PASS1 SW.
*   VERSION X7      -ADDED SERVICE MENU ENTRY FOR MAIN SW VIA TRAP15
*                   -CHANGED TO MAPPER MULTIPLY ROUTINE USED BY MAIN
*                   -SW FOR MULTIPLIER TEST.ALSO ADDED SYMBOLIC
*                   -ADDRESSING SO MAPPER CHANGES WILL NOT REQUIRE
*                   -REVISITING THIS SOURCE.
*                   -ECHOED TEST AND ERROR NUMBERS AT ADDRESSES %F2,%F4.
*                   -CHANGED DG DATA TEST ERROR NUMBERS TO AGREE WITH
*                   -TEST SEQUENCE.
*                   -TURNED OFF OPER SELECT FLAG PRIOR TO MBM LOAD.WHEN
*                   -ON AND MBM LOAD FAILED,EXIT WAS THRU MONBAILOUT
*                   -TO TEST MENU.
*                   -TP18 TEST SELECT WAS CHANGED FROM MBMTEST TO
*                   -KEYTEST FOR FRONT PANEL TROUBLESHOOTING.
*                   -CHANGED MONITOR MENU,DELETED DM,RG,BR,VM AND RB
*                   -ACCESS IS STILL AVAILABLE FROM TERMINAL.
*                   -RB IS AVAILABLE BY STORING 8510H IN LOCATION
*                   -OF6H,THEN PRESSING LM.THIS SHOULD PROVIDE ADAQUATE
*                   -PROTECTION OF MBM DATA FROM CASUAL KEYSTROKING.
*                   -A NEW MONITOR KEY "SM" (SHOW MEMORY) DOES A SINGLE
*                   -HEX READ FROM THE SELECTED LOCATION.
*                   -MOVED CONTINOUS HEX R/W FROM TEST MENU TO MONITOR
```

```
#EJECT;
                                    & NOTE: Some variables have fixed &
DOUBLE POINTER RGSave;              & address so that they can be used&
INTEGER  RG=%1FF72;                 & before the G reg (R12) is set up&
DOUBLE SPSave=RG+60,PCSave=RG+64,        %
       USPSave=RG+72,SSPSave=RG+76;
INTEGER SRSave=RG+70;
INTEGER ExceptionTYPE=RG+80;
        &12 more byte locations of fixed location RAM available&

DOUBLE BRADD,
       TraceLoLim,TraceHiLim;
INTEGER PCTR,CMD,OldCMD,DispAdd,OldFirstDisp,Temp1,Temp2,Temp3,
        BRINS,BRCount,BRCountSave,IB2STA,IB2Status;
BYTE IOdevice,CHR;
GLOBAL BITFIELD bitflags:ACIA_avail,TRACE,BufReady;
ALPHA POINTER ATable;
DOUBLE POINTER DP;
INTEGER POINTER IntPtr=DP,
                DispMem;
BYTE POINTER BytePtr;
INTEGER CONSTANT BufSize:=61,MaxParm:=6;
DOUBLE ARRAY Parm[0:MaxParm];
DOUBLE Parm0=Parm[0],
       Parm1=Parm[1],Parm2=Parm[2],Parm3=Parm[3],Parm4=Parm[4],
       Parm5=Parm[5],Parm6=Parm[6];
INTEGER BufPTR;
BYTE BufStr=BufPTR+1;
BYTE ARRAY BUF[0:BufSize];
BYTE ARRAY scr_array[0:41];                        & for mbm bootloop&
INTEGER ARRAY  MBM_buf[0:31],  Tape_buf[0:127];
INTEGER  MBM_0_boot_code = MBM_buf[1],  Tape_0_boot_code = Tape_buf[1],
         MBM_1_boot_code = MBM_buf[2],  Tape_1_boot_code = Tape_buf[2],
         MBM_pgm_type    = MBM_buf[3],  Tape_pgm_type    = Tape_buf[3],
         MBM_0_mbm_blks  = MBM_buf[4],  Tape_0_mbm_blks  = Tape_buf[4],
         MBM_1_mbm_pages = MBM_buf[5],  Tape_1_mbm_pages = Tape_buf[5] ;

INTEGER blk_ctr,record_blks, mbm_page;
INTEGER CONSTANT PASSWORD := %8510,
        demo_pgm   := 2,   IDed_pgm  := 1,    UNIDed_pgm  := 0,
        master_pgm := -1,  service_pgm := -3, invalid_pgm := 9;
```

```
#EJECT; COMMENT  fix memory and hardware locations;

EXTERNAL INTEGER  mbm_sub_prgm_sel.L, mbm_prgm_start_add.L;
DOUBLE TRACEVector=%24,ABORTVect1=%3C,ABORTVect2=%6C,TRAP15Vector=%BC,
       MULTIBUSYVector=%7C,
       REFRSHVctr1   =%84,
       REFRSHVector  =%84,StartAddress =%104,
       INSTR10Vector =%28,INSTR15Vector=%2C,TAPEVector=%64,
       INSTRVector   =%10,ADDRESSVector=%0C;
INTEGER FirstDispLoc=%100002,
        RelMemOffset= %9001E,  RelPreset =%9001A,
        SetPreset   = %90018,  proc_hwd_tp=%9001A,
        IO =%FFFFFE00,
        Bot=%FFFFFD00;

INTEGER IRCMD1= IO+%92,    LEDS     =  IO+%B0,
     Clr_Watchdog=IO+%A8, ir_test =  IO+%A8,
      mplctl  =Bot+%16, mploff     = Bot+%18, ptfreq    = Bot+%20,
      ptctl   =Bot+%26,                        adchk     = Bot+%78,
      BBWRITE =Bot+%7C, BBREAD     = Bot+%7A, BBWRITE1  = Bot+%56,
      BBREAD1 =Bot+%58, ifcnt      = Bot+%2A, tatpha    = Bot+%54;


BYTE IB2DATA  = IO+%21, IB2IR1    = IO+%23, IB2MASK1  = IO+%23,
     IB2MASK2 = IO+%25, IB2SP     = IO+%27, IB2ADDMD  = IO+%29,
     IB2CMD   = IO+%2B, IB2ADD    = IO+%2D,
     IB1CMD   = IO+%4B, IB1SP     = IO+%47,
     ACIACMD  = IO+%8B, ACIADATA  = IO+%89, ACIASC    = ACIACMD,
     CNTO     = IO+%61, CNT1      = IO+%63,
     BUADCLK  = IO+%65, TIMERCMD  = IO+%67,
     TopKeycmd= IO+%83, TopKeydata= IO+%81, TopKeystat=TopKeycmd,
     BotKeycmd=Bot+%63, BotKeydata=Bot+%65, BotKeystat=Bot+%67;
```

```
#EJECT; COMMENT Constants;

BYTE CONSTANT IB2bit      :=  4,  Keybit    :=  2,     Termbit:=1,
                 Space    := ' ,  ascii     := '0, ascii_hex := 55,
                    BS    :=%08,  Comma     := ',,  prompt   := '?,
                    CR    := 13,  LF        := 10,  byte_zero:=  0,
              BUADCLKMODE:=%86,ACIARESET   :=%40,  ACIAMODE :=%4E,
               ACIAENABLE:=%15,
               Keymod     :=%02, TopKeyclk :=%23, BotKeyclk :=%2C,
               Keyout     :=%40, Keyclr    :=%C1,
               Keyscan    :=%04, ReadSensor:=%50,
               LA         :=%55,  LB       :=%AA;
INTEGER CONSTANT TRAP15  :=%4E4F, zero     :=  0,
                 TRACEBit:=15,    BO       :=  1,    BI      :=  0,
                 IB2     := 2,  Key        :=  1,    Term    :=  0,
                 TRAP15Ex:= 1,  TRACEEx    :=  2,    ABORTEx :=  3,
                 BufEmpty:=0,   sensor_bit:=  6,
                 ACIATx  :=0,   ACIARx     :=  1,    Break   :=   6,
                 JMPCODE :=%F100, NULLChr :=%2400, EOD     :=%B00,
                 Xsoftkey:=%5E80,Ysoftkey:=%4F00,Ystepsoftkey:=%214,
                 MonDispSize:=750,
                 MaxMonDisp:=MonDispSize-60,
                 JmpMonDisp:=%C000+(%6000-2*MonDispSize)/2;
DOUBLE CONSTANT  MonDisp   :=(%106000-(2*MonDispSize));
                                                   & fix MonJmpDisp &
```

```
#EJECT; COMMENT     tables    ;

INTEGER TABLE MBMDATA.L := %5555, %AAAA, %6666, %9999, %1111,
                           %2222, %4444 ,%8888, %EEEE, %DDDD,
                           %BBBB, %7777 , 0000, %FFFF, %1248;
INTEGER TABLE DATT.L:=  EOD, %0100, %0F00, %0700, %4000, %4000,
                        %0E00, %5666, %5666, %5FFF, %5FFF,   EOD;
INTEGER TABLE KeyTable:='A,'9,'8,'7,0    ,0    ,"GO","CB",
                        'B,'6,'5,'4,%5800,0    ,0    ,"CW",
                        'C,'3,'2,'1, 0   ,0    ,"SM", 0  ,
                        'D,'E,'F,'0,%20  ,"PM","MM", 0  ,
                        0  ,%0D  &X+CR&,8,0  ;

ALPHA TABLE TTBL:=
"TEST   DESCRIPTION"+LF,           &0&
"A11 PROM",
"A11 RAM",
"A15 DATA BUS",
"A14 RAM",
"A14 DATA",                        &5&
"A15 TIMER",
"A15 PUBLIC HPIB",
"A15 SYSTEM BUS",
"INTERUPT SYSTEM",
"A11 MULTIPLIER",                  &10&
"A15 TAPE CONTROLLER",
"A13 MBM",
"IF DETECTOR DATA",
"KEYBOARD",
"RUN MAIN PROGRAM"+LF,             &15&
"MEMORY OPERATIONS",
"RERUN SELF",
"REPEAT TEST LOOP"+LF,
"LOAD PROGRAM TAPE",
"RECORD PROGRAM TAPE",             &20&
"INITIALIZE TAPE"+LF,
"ENTER SELECTION   THEN PRESS *MARKER";


ALPHA TABLE MES:=" ERROR","HEX","CMD","VAL",
                 "LOAD","REC","PROC","ADD","INSTR","ID",
                 "MB LOAD","MB REC","MB INIT","WRT PROTECT","NO TAPE";

ALPHA TABLE KeyLabel:="GO","  ","SHOW","WRITE","CSHOW","CWRITE";

ALPHA TABLE MES1:=" @ ","ABORT","TRACE","BREAK";

LABEL OTHERException,TRAP15Exception,TRACEException,ABORTException,
      ExceptionBailout,INSTRException,ADDRESSException,
      WaitCMD,ExitMonitorTRACE,ExitMonitor,EnterMonitor,RestoreREG,
      AutoExitMonitor,NullException;
LABEL MONITOR,GONOW;

COMMENT
    *DECLARATIONS FOR TEST SW;
```

```
SMONITOR.WORK.PD8510            THU, DEC 22, 1983, 10:47 AM     PAGE  12

INTEGER FLAG,TEST,EN;

INTEGER RPTCOUNT,GOODCOUNT,BADCOUNT,KEYSTUCK;

BYTE BA,BB;

INTEGER B,C,D,E,F,I,K,loop,TN,J,LOAD_IT;
INTEGER POINTER LOC,LOC1;

DOUBLE DA,DB,DC,DD;

LABEL AUTO,LA0,LA1,LA2;

DOUBLE RAMST,RAMED;

INTEGER MBMADD;

DOUBLE RAMSTART,RAMEND;
```

```
SMONITOR.WORK.PD8510            THU, DEC 22, 1983, 10:47 AM     PAGE  13

#EJECT;
COMMENT ******* START of Subroutines and Procedures ********;

#FILE fintrpt.work;                                  & irint, iradr, irack &

#FILE MPYTABLE.WORK;

#FILE CDEBUG.WORK;

#FILE STACO.work;

#FILE FMBM.work;
#FILE CMBMGR.work;                                    & seg_start  &

#FILE CH2QUICK.work;

COMMENT ***** FORWARD DECLARATIONS;
PROCEDURE WSTR(SR);VALUE SR;ALPHA SR;                                FORWARD;
PROCEDURE WHex(NUM,WIDTH); VALUE NUM,WIDTH; INTEGER WIDTH; DOUBLE NUM;
                                                                  FORWARD;
SUBROUTINE CRLF;                                                      FORWARD;
PROCEDURE TLBL(I);VALUE I;INTEGER I;                                  FORWARD;
PROCEDURE GET(J,K);INTEGER J,K;                                       FORWARD;
PROCEDURE BBTEST(J,L);INTEGER J,L;                                    FORWARD;
PROCEDURE INC(FLAG,TN,L);INTEGER FLAG,TN,L;                           FORWARD;
PROCEDURE FPANEL(J,L);INTEGER J,L;FORWARD;
PROCEDURE MonBailout(MESNUM); VALUE MESNUM; INTEGER MESNUM;           FORWARD;
SUBROUTINE GetUpshiftByte;                                            FORWARD;
```

```
SMONITOR.WORK.PD8510            THU, DEC 22, 1983, 10:47 AM     PAGE  14

#EJECT;COMMENT;
SUBROUTINE Refrsh;      ENTRY;
BEGIN
LABEL refresh_loop;
COMMENT This is the main memory
            refresh exception (interrupt) routine
     This routine is called both by TRAP and Interrupt --
       The status register is restore to allow higher interrupts - yadc.
       The clear ISR instruction will not cause a problem even when
       called by a trap becuause the ISR bit of the 9519 is not set
       except during the IACK cycle, and if set the interrupt would
       process and then the TRAP finish -- got that !!;

    ASSEMBLE(  MOVE (S),SR );
refresh_loop:ASSEMBLE( TST.W RelPreset; BPL refresh_loop );
    ASSEMBLE(  MOVE =H79,IRCMD1;  RTE );
END;


COMMENT
^Intialize of the 8251A ACIA and BUAD Clock divider (Timer#2 of 8253);
SUBROUTINE ACIAInit;
 BEGIN
    TIMERCMD:=BUADCLKMODE;&TIMER#2,MODE 3(SQ WAVE DIV),LSB THEN MSB,BIN&
    BUADCLK:=%0D;&LSB&      BUADCLK:=byte_zero;&MSB&
                &Clk=%34  ... 2400 baud&
                &   =%1A  ... 4800 baud&
                &   =%11  ??? 7200 baud&
                &   =%0D  ... 9600 baud&
    ASSEMBLE( MOVE.L =D20,R1); & LSL's ARE USED AS DELAYS &
    ACIACMD:=%83; ASSEMBLE( LSL.L  R1,R0);
    ACIACMD:=%83; ASSEMBLE( LSL.L  R1,R0);
    ACIACMD:=%83; ASSEMBLE( LSL.L  R1,R0);
    ACIACMD:=ACIARESET; ASSEMBLE( LSL.L  R1,R0);
    ACIACMD:=ACIAMODE; &1 STOP,NO PARITY,8 BIT DATA,X16 CLK&
                  ASSEMBLE( LSL.L R1,R0);
    ACIACMD:=ACIAENABLE; &ENABLE TX,RX, AND RESET ERROR&
    CHR:=ACIADATA; &CLEAR RECIEVER&
    ACIADATA:=%AA;        & '*' TO TERM   &
    IF ACIASC#%FF THEN
       BEGIN
       IOdevice:=Termbit;
       ACIA_avail := 1;
       END acia present
      ELSE
       BEGIN
       IOdevice:=Keybit;
       ACIA_avail := 0;
       END no acia present;
 END ACIAInit;


 SUBROUTINE delay;     REPEAT 100 DO TRAP(13);
```

```
SMONITOR.WORK.PD8510            THU, DEC 22, 1983, 10:47 AM     PAGE  15

#EJECT;COMMENT
Intializes keyboards to N-key rollover encoded scan 20ms debounce
end of comment;

SUBROUTINE topkey_init;
   WRITE( ADRS( TopKeycmd ) , Keymod, TopKeyclk, Keyout, Keyclr );

SUBROUTINE botkey_init;
   WRITE( ADRS( BotKeycmd ) , Keymod, BotKeyclk, Keyout, Keyclr );


PROCEDURE KEY_TEST;                                               ENTRY;
BEGIN
LABEL LL;

   topkey_init;

   J:=0;loop:=0;
   BBTEST(J,loop);   & VERIFY BOTTOM BOX DATA BEFORE TESTING KEYBOARD &
   IF J=0 THEN  botkey_init;

   loop:=1;           & return to single test mode &

   I:=23;TLBL(I); & ENTER DATA MESSAGE &
LL:
   IF(TopKeystat AND %OF)#0 THEN
      BEGIN
      TLBL(I);
      WHex( INTEGER( TopKeydata ) ,2);
      CRLF;
      END;

   IF J#0 THEN GO TO LL; & NO BOTTOM BOX &

   IF (BotKeystat AND %OF)#0 THEN
      BEGIN
      TLBL(I);
      WHex( INTEGER( BotKeydata ) ,2);
      CRLF;
      END;

GO TO LL;
END key_test;
```

```
SMONITOR.WORK.PD8510          THU, DEC 22, 1983, 10:47 AM      PAGE  4

*                   -MENU.MNEMONICS ARE CW AND CB FOR R/W CONTINOUS.
*                   -KEYSTROKE BAILOUT IS TOTAL REWIND FROM THESE
*                   -TWO OPERATIONS.
*                   -MONITOR SOFTKEY LABELS AND MNEMONICS FROM FRONT
*                   -PANEL ARE AS FOLLOWS,ORIGINAL COMMANDS ARE STILL
*                   -AVAILABLE FROM HPIB OR TERMINAL.
*                   -THE ONLY EXCEPTION IS (CR) CALL SUBROUTINE WHICH
*                   -HAS BEEN DELETED.
*                   -
*                   -           SOFTKEYS
*
*                   -   LABEL              MNEMONIC
*                   -     GO                  GO
*                   -   SHOW                  SM
*                   -   WRITE                 WR
*                   -  CSHOW                  CB
*                   - CWRITE                  CW
*                   -   LOAD                  LM
*                   -   RECD                  RM
*
*                   -NEW RECORD LIMITS FOR BUBBLE-
*                   - 100,16AFF,FFFF8000,FFFFDCFF,106000,1097FF
*
*                   - ADDED CHRS '?' AND '='  TO MONITOR
*
*                   -ADDED 'PM' (PRIOR MENU) KEY TO MONITOR-
*                   -THIS RETURNS TO TEST MENU SO THAT MAIN SW
*                   -CAN BE LOADED OR OTHER TEST ROUTINES RUN
*                   -WITHOUT PRESSING 'TEST' SWITCH ON FRONT
*                   -PANEL.
*
* VERSION X8        - FIXED HEX ERROR REWIND PROBLEM.MODIFIED
*                   - TEST MENU TO CLARIFY ENTRY KEYSTROKES.
*                   - IN 'DGINIT' CHANGED MESSAGE FROM USING
*                   - 'WSTR' TO USING LOADDISP OF CHARS.THIS
*                   - USES MORE RAM,BUT IS NOT DEPENDANT ON
*                   - THE CONDITION OF THE IO.
*
* VERSION X9        - ADDED 'EOD' TO SOFTKEYS TO ELIMINATE OLD
*                   - TEST MENU BEING DISPLAYED IF BREAK CAME
*                   - FROM TERMINAL.
*
*  ##### RELEASED TO PRODUCTION ##########################################
*
* VERSION X10       - REMOVED 'CLEARSCREEN FROM DG DATA TEST TO
*                   -ELIMINATE OCCASIONAL FLASH OF TEST MENU IN
*                   - REPEAT TEST MODE.
*
* VERSION X11       -- 10/19/83  -- JTB back at it
*                   -  Streamline code to pick up space and readablility
*                   -  "DN" eleinated, "LM" and "RM" removed from softkey
*                   -  Hidden "RM" via "LM" and password removed
*                   -  Removed proto2 and 8291a test
*                   -  DIV ERROR removed
*                   -  Added Detection of no ACIA and therefore no use of
*                   -  Created a new memory location with the value of
```

```
SMONITOR.WORK.PD8510          THU, DEC 22, 1983, 10:47 AM      PAGE  5

*                       last started  test. Therefore if a test causes a
*                       PROC, INSTR, ADD, etc error during the power up
*                       test before it has written to the error leds,
*                       one can determine what test failed ( %F8 )
*                   -  Removed status readout on MB errors
*                   -  Removed the Debug message from ACIA on turnon
*                   -  Added Bottom box address check
*                   -  Added MBM rom checksum
*
* VERSION X12       -- 11/28/83
*                   -  Added program load and record security
*                   -  Added program load and record from self test menu
*                   -  Deleted "WR" and replaced it with "MM"
*                   -  Changed parms of "RM" command, Added RI,RU,RD,RS
*                   -  Added MB INIT ERROR message
*                   -  Added WRT PROTECT ERROR message
*
* VERSION X13       -- 12/8/83
*                   -  Added NO TAPE ERROR message
*                   -  Changed the Self Test entry statement
*                   -  Added RAM Address checking
*                   -  Fixed some minor problems in X12
*
*  ##### RELEASED TO PRODUCTION ##########################################
*
**************************************************************************
```

```
SMONITOR.WORK.PD8510          THU, DEC 22, 1983, 10:47 AM      PAGE  6

$EJECT
**************************************************************************
*
*   The 85101 Monitor the power-on booter and system debug monitor.
* It contains the Tape, MBM, ACIA, and PUBLIC HP-IB (minimual) Ulitities
* It will reside in PROM on the processor board and will except inputs
* from the FP Keyboard, RS-232 Terminal and PUBLIC HP-IB.
*
*  MONITOR is presently at ROM location 80000Hex and uses
*         2E0Hex Ram Bytes plus run time stack (allow a total of380Hex)
*            for now 1FFFE to 1FE40 is MONITOR RAM and Stack
*         NOTE: Certain items have fixed address and others are
*            addressed via the G-mode approach
*         NOTE: At power on the Hardware locates the ROM @ 0 Hex
*            and the monitor itself moves its mapping to higher mem
*
*       See MONITOR INSTRUCTIONS for operating information.
*
*  Monitor Commands
*    GO (Add)               -- Exit monitor and GO to Add
*    BR (Add(,Count))       --Set Breakpoint
*    TR (Add(,LowAdd(,HiAdd))--Single Step Trace
*    CR (Add(,Parms(,...)))--Call Subroutine
*    RG (Reg#(,Value(,..)))--Display or change Processor Registers
*    VM (Add(,Value))       --Display and change Memory
*    SM (Add)               --Display Memory
*    CB (Add)               --Continous Display Memory
*    MM (Add(,Value))       --Modify Memory
*    CW (Add(,Value))       --Continous Modify Memory
*    DM (Add(,Add1))        --Display Memory
*    ZP (HP Absolute data) --Zapp (Load) Memory
*    LM                     --Load from Frontpanel Tape into memory
*    RM 0,(mbm0_blks,(mbm1_pages))--Record memory into Frontpanel Tape
*       also RS,RI,RU,RD
*    LB                     --Load from MBM into memory
*    RB                     --Record memory into MBM          (3 blks)
*    CS                     --Clear Status
*    PM                     --Bring up the self test menu
*    SO,DS                  --Dummy commands for use with ZAPP
*
*    UP or CRLF             --Repeat Operation at next Address
*    DN                     --Repeat Operation at next lower Address
*
*              All Address, Values, etc are in ASCII HEX
**************************************************************************
```

```
SMONITOR.WORK.PD8510          THU, DEC 22, 1983, 10:47 AM      PAGE  7

$EJECT
    out of date
**************************************************************************
*  Global Variables
*    BufPTR -- Pointer to the next Buffer(BUF) position
*    BUF    -- Buffer storage area for keyboard and terminal input
*    Parm[] -- Storage for inputted Parmeters (also called Parm1 or 2)
*              Note: Parm1 is usually a memory address '
*    PCTR   -- Number of actual parmeters entered
*    CMD    -- Two packed ASCII of Command entered
*    OldCMD -- Saved value of CMD for repeat operations
*    DispAdd-- Index to next available Display location
*    OldFirstDisp -- User program's value of Display %100002
*    Temp1,2,3,4 -- Temporary values
*    BRINS  -- Instruction at breakpoint location
*    BRCount - Breakpoint counter
*    BRCountSave - Breakpoint counter saved for reseting BRCount
*    BRADD  -- Breakpoint Address
*    ExceptionTYPE -- Flag to type of exception
*    IB2STR -- Public HP-IB status
*    IB2Status--Public HP-IB chip status
*    TRACE  -- Trace command flag -- determine exception respond
*    BufReady -Keyboard or RS-232 Buffered input complete and ready
*    IOdevice- I/O Flag - Set by Source of Command -- Use for Output
*                    Bit 0=Term, 1=Keyboard, 2=IB2
*    CHR    -- Temporary byte holding last input
*    RGSave -- Storage location for user programs registers
*              Specific regs are also named -- ie SPSave,PCSave
*                 USPSave,SSPSave, and SRSave
*    Parm   -- Input Command parameters
*    TraceLoLim -- Low Trace Adress limit
*    TraceHiLim -- High Trace Adress Limit
**************************************************************************
end of comment;
```

```
$MONITOR.WORK.PD8510              THU, DEC 22, 1983, 10:47 AM     PAGE  16

#EJECT;
PROCEDURE bailout_if_key_pressed;                               ENTRY;
BEGIN
INTEGER I;
IF (TopKeystat AND %F)#0 THEN
   BEGIN
   I:=0;

   DO BEGIN
        BB:=TopKeydata;I:=I+1;   & BAD STATUS BAILOUT &
        IF I=200 THEN BEGIN loop:=0;
           J:=%10;TN:=14;INC(J,TN,loop); &   REPORT FAILURE &
           loop:=1;FPANEL(J,loop);END;&GO TO IO DATA TEST/STAY THERE &
   END UNTIL ((TopKeystat AND %F)=0);

   IF (CMD="CW" OR CMD="CB") THEN loop:=0; & RETURN TO WAITCMD &

   IF loop#0 THEN GO TO MONITOR; & RESTART FROM BEGINING &

   END if;
END bailout_if_key_pressed ;

PROCEDURE DATA_TEST;ENTRY;
BEGIN
& DATA TEST FOR BUBBLE &
   MBMADD:=2047;
   RAMSTART:=%8500;RAMEND:=%851C;
   IF NOT read_mbm(RAMSTART,set_add_mbm(MBMADD,RAMSTART,RAMEND ) )
      THEN BEGIN IF I=0 THEN J:=%25
                 ELSE J:=%16 END
    ELSE BEGIN
        DA:=0;
        WHILE DA<=28  DO
           BEGIN
           STPNTR(LOC,RAMST+DA);STPNTR(LOC1,RAMSTART+DA);
           IF (J=0 AND (LOC#LOC1)) THEN
               BEGIN J:=(LOC XOR LOC1);  GET(J,J);  END;
           DA:=DA+2;
           END;
        END;
END DATA_TEST;
```

```
$MONITOR.WORK.PD8510              THU, DEC 22, 1983, 10:47 AM     PAGE  17

#EJECT;COMMENT;
BOOLEAN SUBROUTINE wrt_mbm_test;
 wrt_mbm_test := wrt_mbm(RAMST,set_add_mbm(MBMADD,RAMST,RAMED) );

PROCEDURE MBMTEST(J,loop);INTEGER J,loop;ENTRY;
BEGIN
DOUBLE POINTER  dp;
INTEGER POINTER ip;
DOUBLE  sum;
INTEGER block, adr;
LABEL STT;

STT:IF loop#0 THEN BEGIN I:=14;TLBL(I);END;

    J:=0;
    FLAG:=0;
    & MBM ROM checksum &
    sum := 0;
    FOR block := 0 TO 15 DO
       BEGIN
       mbm_sub_prgm_sel := block;  &block select/chip select not needed&
       FOR adr := 0 STEP 2 TO %FE DO
          BEGIN
          STPNTR( ip, ADRS( mbm_prgm_start_add ) + adr );
          IF ( block < 15 ) OR ( adr < %FC ) THEN
             sum  := sum + ( DOUBLE( ip ) AND %0FFFF );
          END adr loop;
       END  block loop;
    STPNTR( dp, ADRS( mbm_prgm_start_add ) + %FC );
    IF sum # dp THEN  J:= 9;
    mbm_sub_prgm_sel := zero ;

    FLAG:=J;

    IF FLAG = 0 THEN
       BEGIN                  & no rom errors , safe to do other tests &
       RAMST:=(ADRS(MBMDATA));RAMED:=RAMST+28;
       J:=0;
       I:=0;
       MBMADD:=2047;
       IF NOT init_mbm(0) THEN J:=%21

        ELSE IF NOT wrt_mbm_test
               THEN J:=%22
          ELSE  DATA_TEST;
       IF J#0 THEN J:=J+%10;
       FLAG := J;
    &  DO SECOND BUBBLE  &

       J:=0;
       I:=1;
       MBMADD:=2047;

       IF NOT init_mbm(1) THEN J:=%13
        ELSE IF NOT wrt_mbm_test
             THEN J:=%14
```

```
$MONITOR.WORK.PD8510              THU, DEC 22, 1983, 10:47 AM     PAGE  18

             ELSE DATA_TEST;
       IF J#0 THEN J:=J+%20;
       END rom was OK, and other test done;
   IF FLAG#0 THEN J:=FLAG;                     & RETURN FIRST ERROR in  J&
   bailout_if_key_pressed;
   IF loop#0 THEN GO TO STT;

END MBMTEST ;
```

```
$MONITOR.WORK.PD8510              THU, DEC 22, 1983, 10:47 AM     PAGE  19

#EJECT;COMMENT;
PROCEDURE BBTEST(J,loop);INTEGER J,loop;ENTRY;
BEGIN
LABEL BB;
INTEGER data, mask, result, error_offset;

   SUBROUTINE check;
   BEGIN
   IF(((J=0) AND ((result AND mask)# data)) OR (loop#0)) THEN BEGIN
     J:=((result XOR data) AND mask); GET(J,J); J := J+error_offset;END;
   END;

   J:=0;
   IF loop#0 THEN BEGIN I:=15;TLBL(I);END;

BB:error_offset := 0;
   BBWRITE1:=%55; data :=%55;  mask := %FF;     result := BBREAD1 ;
   check;
   BBWRITE1:=%AA; data :=%AA;                   result := BBREAD1 ;
   check;

  &  TEST UPPER BYTE  &
   BBWRITE:=%5500;data:=%5500;  mask := %FF00;  result := BBREAD ;
   check;
   BBWRITE:=%AA00;data:=%AA00;                  result := BBREAD ;
   check;

  & address lines check &
   error_offset := %10 ;
   data   := ifcnt; data :=%5500; mask :=%7F00;  result := adchk;
   check;
   tstpha := data;  data :=%2A00;                result := adchk;
   check;

&  PRETUNE VTO TO 120MHZ   &
&  THIS STIMULAS ALLOWS VERIFY OF FRONT END WITH SOURCE
   IN MANUAL 100MHZ SOURCE PRODUCES 20MHZ IF &

   mplctl:=%2F;  &  SET PRETUNE MODE  &
   mploff:=zero; &  MPLOFF$=0  &
   ptfreq:=%9180;  & VTOBCD FOR 120 MHZ #118 &
   ptctl :=4;    &  SAMPLE MODE &

   bailout_if_key_pressed;
   IF loop#0 THEN GO TO BB;
END BBTEST;
```

```
SMONITOR.WORK.PD8510            THU, DEC 22, 1983, 10:47 AM     PAGE  20

#EJECT;COMMENT  approx 50 bytes could be save combining HPIB and HPIB1;
PROCEDURE HPIB(FLAG,loop);INTEGER FLAG,loop;ENTRY;
BEGIN
LABEL PIG;

    IF loop#0 THEN BEGIN I:=9;TLBL(I);END;
PIG:FLAG:=0;
    IB2CMD:=2;IB2CMD:=byte_zero;
    IB2SP:=%55;
    FLAG:=INTEGER(IB2SP XOR %55);

   & DO CMD THING &
   & HPIB#2 PUBLIC   &

   & FLAG = BAD BITS &
   IB2SP:=%AA;

   IF FLAG=0 THEN                             & GET FIRST HPIB ERROR &
            FLAG:=INTEGER( IB2SP XOR %AA);     & FLAG = BAD BITS &
   FLAG := FLAG AND %OFF;
   IF FLAG#0 THEN GET(FLAG,FLAG);

   bailout_if_key_pressed;
   IF loop#0 THEN GO TO PIG;

END HPIB;

COMMENT  approx 50 bytes could be save combining HPIB and HPIB1;
PROCEDURE HPIB1(FLAG,loop);INTEGER FLAG,loop;ENTRY;
BEGIN
LABEL P1;

    IF loop#0 THEN BEGIN
                I:=10;TLBL(I);END;
P1: FLAG:=0;

    IB1CMD:=2;IB1CMD:=byte_zero;
    IB1SP:=%55;
    FLAG:=INTEGER(IB1SP XOR %55);
 & FLAG = BAD BITS &

    IB1SP:=%AA;
    IF FLAG=0 THEN                          & GET FIRST HPIB ERROR &
          FLAG:=INTEGER(IB1SP XOR %AA);       & FLAG = BAD BITS &
    FLAG := FLAG AND %OFF;
    IF FLAG#0 THEN GET(FLAG,FLAG);              & GET BIT NUMBER &

    bailout_if_key_pressed;
    IF loop#0 THEN GO TO P1;
END HPIB1;
```

```
SMONITOR.WORK.PD8510            THU, DEC 22, 1983, 10:47 AM     PAGE  21

#EJECT;
&    DG RAM TEST  &
PROCEDURE DG1(FLAG,loop);INTEGER FLAG,loop;                        ENTRY;
BEGIN
LABEL P3;

   IF loop#0 THEN BEGIN I:=6;TLBL(I);END;

P3:FLAG:=0;   &  CLEAR FLAG FOR TEST &
   FOR B:=%0 STEP 2 UNTIL %7FFE DO
      BEGIN
      STPNTR(LOC,(B+%100000));


      C:=LOC;  &  GET DATA  &
      LOC:=NOT C;   &  STORE COMPLEMENT  &
      IF FLAG=0 THEN BEGIN FLAG:=(C AND LOC);
                         IF FLAG#0 THEN GET(FLAG,FLAG); END;
      &  RESTORE IT  &
      LOC:=C;
      END LOOP;

   bailout_if_key_pressed;
   IF loop#0 THEN GO TO P3;
END DG1 ;
```

```
SMONITOR.WORK.PD8510            THU, DEC 22, 1983, 10:47 AM     PAGE  22

#EJECT;COMMENT
     DG DATA AND ATTRIBUTE TEST
     Note: No IN A14 DATA message because test overwrites;
PROCEDURE DG2(FLAG,loop);INTEGER FLAG,loop;                        ENTRY;
BEGIN
LABEL P4;

INTEGER ARRAY DAT[0:11];

   INTEGER SUBROUTINE DOIT;BEGIN
      STPNTR(LOC1,%140000);
      STPNTR(LOC,%100000);
      DAT[3]:=B;
      DAT[4]:=C;
      DAT[5]:=D;
      DAT[7]:=E;

      MOVE LOC := DAT,+(12);

      REPEAT 30 DO delay;     &DELAY FOR NEW PIC TIMER &
      DOIT:=LOC1;   &READ AND RETURN DATA &
      END DOIT;

&B=BRT ON/OFF# &
&C=X ATTRIBUTE&
&D=Y ATTRIBUTE &
&E=DATA&

   MOVE DAT:=DATT,+(12);
   FLAG:=0;

P4:DOIT;DOIT;DOIT;  & WRITE 3 VECTORS TO SYNC DG AND LINE GEN &
   B:=%0700;C:=%6000;D:=%6000;E:=%5555;
   IF DOIT#(%2555) THEN FLAG:=1;
                                  & X,Y ATTRIBUTES =0  &

   B:=0;C:=%7000;D:=%6000;E:=%5BBB;
   IF ((DOIT#%8BBB) AND (FLAG=0))  THEN FLAG:=2;

   B:=0;C:=%5000;D:=%5000;E:=%5AAA;
   IF ((DOIT#%FAAA) AND (FLAG=0))  THEN FLAG:=3;
   B:=0;C:=%6000;D:=%6000;E:=%5555;
   IF ((DOIT#%0555) AND (FLAG=0))  THEN FLAG:=4;
   B:=0;C:=%4000;D:=%4000; E:=%5555;
   IF ((DOIT#%4555) AND (FLAG=0))  THEN FLAG:=5;

bailout_if_key_pressed;
IF loop#0 THEN GO TO P4;
STPNTR(LOC,ADRS(FirstDispLoc));
LOC:=EOD;                         &stop display of dg test vectors&

END;
```

```
SMONITOR.WORK.PD8510            THU, DEC 22, 1983, 10:47 AM     PAGE  23

#EJECT;COMMENT;
PROCEDURE TIMER(FLAG,loop);INTEGER FLAG,loop;ENTRY;
BEGIN
LABEL P7;

  BYTE J,K;

   IF loop#0 THEN BEGIN I:=8;TLBL(I);END;
P7:FLAG:=zero;  &HELLO&
   B:=LEDS;  &  TRIGGER FOR SCOPE  &

   B:=200;
   &   SET MODES   &
   TIMERCMD:=%38;  & MODE4 2 BYTES CNTR 0  &

   &   DO CNTR 0 FIXED VALUES &
   CNT0:=LA;CNT0:=byte_zero;

   TIMERCMD:=byte_zero;  &  LATCHIT  &
   WHILE B#0 DO BEGIN
      BA:=CNT0; &  READ LSB &
      BB:=CNT0;  & READ MSB  &
      B:=B-1;          &  DECREMENT LOOP  &

      IF (BA = %55) THEN B:=0; & KILL LOOP &
      END;
   IF (BA#%55)OR(BB#byte_zero) THEN FLAG:=1;
   B:=200;
   TIMERCMD:=%38;  & MODE4 2 BYTES CNTR 0  &
   CNT0:=LB;CNT0:=byte_zero;

   TIMERCMD:=byte_zero;
   WHILE B#0 DO BEGIN
      BA:=CNT0;
      BB:=CNT0;
      B:=B-1;     & DECREMENT LOOP  &

      IF (BA = %AA) THEN B:=0;
      END;
   IF (FLAG=0 AND ((BA#%AA)OR(BB#byte_zero))) THEN FLAG:=2;

&  DO CNTR2 &
   TIMERCMD:=%B8;   & MODE4 2 BYTE CNTR2 &
   BURDCLK:=LA;BURDCLK:=byte_zero;
   TIMERCMD:=%80;
   BA:=BURDCLK;BB:=BURDCLK;

   IF FLAG=0 THEN BEGIN
         IF ((BA=%55) OR (BA<%50) OR (BB#byte_zero)) THEN FLAG:=3;END;
         &***** TIMER WILL DECREMENT DUE TO CLOCK RATE*** &

   TIMERCMD:=%B8;   & MODE4 2 BYTE CNTR2 &
   BURDCLK:=LB;BURDCLK:=byte_zero;
   TIMERCMD:=%80;
   BA:=BURDCLK;BB:=BURDCLK;
```

```
SMONITOR.WORK.PD8510          THU, DEC 22, 1983, 10:47 AM     PAGE  24

   IF FLAG=0 THEN BEGIN
         IF ((BA=%AA) OR (BA<%A5) OR (BB#byte_zero)) THEN FLAG:=4;END;
     &** TIMER WILL DECREMENT DUE TO CLOCK RATE **&

&RESTORE BAUDRATE &
   TIMERCMD:=%B6;BUADCLK:=%0D;BUADCLK:=byte_zero;
   B:=LEDS; & STOP PULSE FOR SCOPE TEST WAVEFORMS &

bailout_if_key_pressed;
IF loop#0 THEN GO TO P7;

END TIMER;
```

```
SMONITOR.WORK.PD8510          THU, DEC 22, 1983, 10:47 AM     PAGE  25

#EJECT;COMMENT;
PROCEDURE TACO(J,loop);INTEGER J,loop;ENTRY;
BEGIN

LABEL AA;
   I:=13;
   IF loop#0 THEN TLBL(I);
AA:J:=0;
   TPINT;    & INITIALIZE TACO &

   delay;
   TACOtach:=%5555;  &  SET PATTERN IN TACH REG  &
   delay;
   J:=(TACOtach XOR %5555);
   TACOtach:=%AAAA;  &  STORE COMPLEMENT  &
   delay;
   IF J=0 THEN J:=(TACOtach XOR %AAAA);
   GET(J,J); & IDENTIFY BAD BIT &

   IF J=0 THEN BEGIN
                      & DO DATA REG &
      TACOdata:=%5555;
      delay;
      J:=(TACOdata XOR %5555);
      TACOdata:=%AAAA;
      delay;
      IF J=0 THEN J:=(TACOdata XOR %AAAA);
      IF J#0 THEN BEGIN GET(J,J);J:=J+%10;END;
      END;


bailout_if_key_pressed;
IF loop#0 THEN GO TO AA;
END TACO;
```

```
SMONITOR.WORK.PD8510          THU, DEC 22, 1983, 10:47 AM     PAGE  26

#EJECT;COMMENT;
PROCEDURE GET(J,K);INTEGER J,K;ENTRY;
BEGIN
INTEGER index = REGISTER 7;
INTEGER bit = REGISTER 6;

    index:=J; &  GET INPUT DATA &
              &  J=DATA   &
    bit:=1;         &  K=BIT  NO.  &
    WHILE index#0 DO
      BEGIN
      IF TBIT(index,0) # 0 THEN  BEGIN index:=0; K:=bit; END;
      index:=RIGHT(index,1);
      bit:=bit+1;
      END;

END GET ;
```

```
SMONITOR.WORK.PD8510          THU, DEC 22, 1983, 10:47 AM     PAGE  27

#EJECT;COMMENT;
INTERRUPT SERV;ENTRY;BEGIN &  RESET IRQ &
irack(15);
LEDS:=%0055; & SET TEST PATTERN &
END;


PROCEDURE TINTER(FLAG,loop);INTEGER FLAG,loop;ENTRY;
BEGIN  LABEL T,TT;

   DA:=TRAP15Vector;
   I:=11;
   IF loop#0 THEN TLBL(I);

TT:FLAG:=0;
   LEDS:=%BB;  & SET TEST PATTERN FOR IRQ &
   irint;& INITIALIZE &
   iradr(ADRS(SERV),15);
   ASSEMBLE( ANDI =HF0FF,SR);&TURN 68000 IR ON&
T: WRITE( ADRS(ir_test), zero, %80, zero );
   ASSEMBLE( NOP;                  &  delay -- wait for IR &
             ORI =H0700,SR);       &   DISABLE   IRQ       &
   TRAP15Vector:=DA;               &   RESTORE CELL &
   IF (LEDS AND %FF)#%55 THEN FLAG:=1;
   LEDS:=%FF;  &  TURN OFF ERROR INDICATION  &

   bailout_if_key_pressed;
   IF loop#0 THEN GO TO TT;
END TINTER;
```

```
SMONITOR.WORK.PD8510          THU, DEC 22, 1983, 10:47 AM     PAGE  28

#EJECT;COMMENT;
                 &   ERROR REPORT ROUTINE  &
SUBROUTINE ERRS;
BEGIN
DOUBLE  RET=REGISTER9;  &RESERVE R9 FOR RETURN &
INTEGER B=REGISTER2;   &  ERROR NO. &
INTEGER C=REGISTER3;   & ADDRESS COUNTER &
INTEGER E=REGISTER5;    & TEST NO  &
INTEGER D=REGISTER4;    &  TEMP VARIABLE &
INTEGER POINTER LOC=REGISTER11;

   B:=(B AND %3F);
   C:=(B MOD 2);
   STPNTR(LOC,%90002-2*C);
   D:=LOC; &  ACCESS X1 &
   C:=(B MOD 4)/2;
   STPNTR(LOC,%90006-2*C);
   D:=LOC;  & ACCESS X2  &
   C:=(B MOD 8)/4;
   STPNTR(LOC,%9000A-2*C);
   D:=LOC;  & ACCESS X4  &
   C:=(B MOD 16)/8;
   STPNTR(LOC,%9000E-2*C);
   D:=LOC;  &  ACCESS X8  &
   C:=(B MOD 32)/16;
   STPNTR(LOC,%90012-2*C);
   D:=LOC;  &  ACCESS X16  &
   C:=B/32;
   STPNTR(LOC,%90016-2*C);
   D:=LOC;  &  ACCESS X32  &
&  DO FRONT PANEL BUISNESS  &

   E:=(E AND %F);
   LEDS:=NOT(E*%10);  & WRITE TEST NO TO FP LEDS &

   ASSEMBLE(JMP (R9) );

END ERRS;


PROCEDURE ERROR(SET,EN,loop);INTEGER SET,EN,loop;ENTRY;
BEGIN
INTEGER B=REGISTER2; & ERROR NO.  &
INTEGER E=REGISTER5;  &  TEST NO. &

   B:=EN;E:=SET;
   ASSEMBLE(LEA $P6.L,R9);   ERRS;
   ASSEMBLE( "$P6 EQU *" );
END ERROR ;
```

```
SMONITOR.WORK.PD8510          THU, DEC 22, 1983, 10:47 AM     PAGE  29

#EJECT;COMMENT;
PROCEDURE RAM(FLAG,loop);INTEGER FLAG,loop;ENTRY;
BEGIN
DOUBLE I=REGISTER9; & ADDRESS COUNTER &
INTEGER K=REGISTER4; & BIT DETECTOR &
INTEGER B=REGISTER2;  & ERROR NUMBER &
INTEGER J=REGISTER5;  &  TEST NUMBER  &
INTEGER POINTER I_ptr=I;
LABEL G01;

   IF loop#0 THEN BEGIN I:=4;TLBL(I);END;

    B:=0;
G01:I:=%0000;
    WHILE I#%17FFE DO
      BEGIN
      LABEL PP;

   PP:J:=I_ptr;      &  GET STORED DATA  &

      J:=(NOT J);    &COMPLEMENT DATA&
      I_ptr:=J;      &STORE COMPLEMENT &
      K:=I_ptr;      & READ MEMORY &
      B:= B OR  (K XOR J);

      J:=(NOT J);
      I_ptr:=J;      &  RESTORE DATA  &
      K:=I_ptr;      & READ MEMORY &
      B:= B OR  (K XOR J);

      I := I + 2;
      END;

   IF B=0 THEN               &RAM ADDRESSING CHECK -- OVERWRITES MEM &
        BEGIN    ASSEMBLE(
            MOVE.L =H100, I ;
        L0: MOVE.W  I , (I)+;
            CMP.L  =H17800, I;
            BLT     L0;
            CLR     K;
            MOVE.L =H100, I;
        L1: MOVE.L  I,  R0;
            CMP.W   (I)+,  R0;
            SNE     R0;
            OR.B    R0, K;
            CMP.L  =H17800, I;
            BLT     L1     );
        IF K#0 THEN B:= 33;
        END;

   I:=1;K:=0;
   WHILE B#0 DO  &  DO IF RAM FAILED  &
      BEGIN
      IF TBIT(B,0)#0 THEN BEGIN B:=I;      & STOP SEARCH &
         J:=2;
         ASSEMBLE (LEA $GO_ON.L,R9);   ERRS;  &R9=RETURN ADDRESS&
```

```
SMONITOR.WORK.PD8510          THU, DEC 22, 1983, 10:47 AM     PAGE  30

         ASSEMBLE("$GO_ON EQU *");K:=8;B:=0;
         END;
      B:=RIGHT(B,1);
      I:=I+1;
      END;

   IF (loop#0)  THEN  bailout_if_key_pressed;
   IF (K # 0) OR (loop#0)  THEN GO TO G01;
END RAM ;
```

```
SMONITOR.WORK.PD8510          THU, DEC 22, 1983, 10:47 AM     PAGE  31

#EJECT;COMMENT;
SUBROUTINE CHEK_SUM;
BEGIN
DOUBLE RET=REGISTER9; & RETURN ADDRESS &
DOUBLE DA=REGISTER3; & ACCUMULATOR &
INTEGER K=REGISTER5;  & TEST NO. &
INTEGER B=REGISTER2;  &  ERROR NO. &
INTEGER POINTER LOC=REGISTER11;  & ADDRESS POINTER &
DOUBLE RCCKSM=%80008; &   RECORDED CHECKSUM IN PROMS  & '
LABEL CKSM;
CKSM:
   STPNTR(LOC,%8000A);
   DA:=0;B:=0;
   WHILE ADRS(LOC)<%83FFE DO BEGIN
      STPNTR(LOC,ADRS(LOC)+2);
      DA:=DA+(DOUBLE(LOC)AND %0FFFF);
      END;
   IF DA#RCCKSM    THEN BEGIN
      B:=1;  &  SET ERROR FLAG &
      K:=1;
      ASSEMBLE(LEA $RET.L,R9);
      ERRS;          &  WRITE ERRORS TO LEDS &
    o ASSEMBLE("$RET EQU *");
      COMMENT  IF (TopKeystat AND%F)#0 THEN bailout_if_key_pressed;
      GO TO CKSM;          & *** SET REPEAT MODE **  &
      END;
   ASSEMBLE(JMP (R9) );

END chek_sum ;


PROCEDURE CHECKSUM(J,loop);INTEGER J,loop;ENTRY;
BEGIN
LABEL LOOP;
   C:=0;
LOOP:ASSEMBLE(LEA $RAT.L,R9);
   CHEK_SUM;
   ASSEMBLE("$RAT EQU *");
   IF C#0 THEN BEGIN bailout_if_key_pressed;GO TO LOOP;END;
   IF loop#0 THEN BEGIN I:=3;TLBL(I);C:=1;GO TO LOOP;END;
END checksum ;
```

```
#EJECT;COMMENT Intializes DG memory to all EOD's
        Then set up a character jump table and stroke table for
            selected chars
end of comment;
SUBROUTINE DGInit;        ENTRY;
BEGIN
 LABEL DGloop;
   ASSEMBLE( MOVE =HOB00,R0;  MOVE.L =H100000,R1;  MOVE.L =H120000,R8 );
  DGloop:ASSEMBLE( MOVE R0,-(R8); CMP.L R1,R8; BGT DGloop );

  STPNTR(DispMem,%106000);
   FOR Temp1:=0 TO 255 DO DispMem[Temp1]:=NULLChr;
   Temp2:=0;
   DispAdd:=0;
   Temp1:=10;MAKESTROKES;
   Temp1:=13;MAKESTROKES;
   Temp1:=32;MAKESTROKES;
   FOR Temp1:=48 TO 90 DO
      IF Temp1>=63 OR Temp1<=57 OR Temp1=61 THEN MAKESTROKES;
   DispAdd:=0;
  STPNTR(DispMem,ADRS(FirstDispLoc));
    LoadDisp(%100);
    LoadDisp(%5740);
    LoadDisp(%4800);
    IOdevice:=Keybit;
  & WSTR("TESTING");  see Version X8 message -- PERPHAS a table &
    LoadDisp(%8054);
    LoadDisp(%8045);
    LoadDisp(%8053);
    LoadDisp(%8054);
    LoadDisp(%8049);
    LoadDisp(%804E);
    LoadDisp(%8047);
END DGInit;
```

```
#EJECT;COMMENT Labels the softkeys with monitor commands and set up
        display pointers for monitor display
end of comment;
SUBROUTINE SoftKeys;
BEGIN
   FirstDispLoc:=JmpMonDisp;
   DispAdd:=0;
   reset_DispMem;
   Temp2:=Ysoftkey;
   FOR Temp1:=0 TO 5 DO
      BEGIN
         LoadDisp(Xsoftkey);
         LoadDisp(Temp2);
         Temp2:=Temp2-Ystepsoftkey;
         STPNTR(ATable,ADRS(KeyLabel));
         WSTR(ATable[Temp1]);
      END;
   LoadDisp(%5000);
   LoadDisp(%4F00);
   reset_DispMem;
   LoadDisp(EOD);DispAdd:=0;
END SoftKey;
```

```
#EJECT;COMMENT
*Intializion of the PUBLIC HP-IB -- 8291 @ HP-IB Adresses 16 and 24;
SUBROUTINE IB2Init;
 BEGIN
    IB2CMD:=%2;   &RESET&
    IB2MASK1:=byte_zero;
    IB2MASK2:=byte_zero;
    IB2SP:=byte_zero; IB2STA:=0; &CLEAR SERIAL POLL AND STA BYTE&
    IB2ADDMD:=%1;
    IB2ADD:=16; IB2ADD:=%98; &SET 16 AND 24 AS ADDRESS&
    IB2CMD:=%25; &SET CLOCK 5 MHZ&  IB2CMD:=byte_zero;  &CLEAR RESET&
 END IB2Init;

COMMENT
  ..s the IB2Status word ;
        .. ChkIB2status;

          REGISTER 2;
          2MASK2;
          .s:=(IB2Status AND %3) OR IB2IR1;
          status;
```

```
#EJECT;COMMENT
*Gets a single byte from IB2 -- assume BI True and resets it
*     also inhibits any further interaction with terminal;
BYTE SUBROUTINE GetIB2;
 BEGIN IOdevice:=IB2bit; IB2Status:=RBIT(IB2Status,BI);
       GetIB2:=IB2DATA;
 END GetIB2;


COMMENT
*Outputs a single byte to IB2 -- Assume BO true and resets it;
PROCEDURE PUTIB2(OUTBYTE);   VALUE OUTBYTE;  BYTE OUTBYTE;
 BEGIN
   IB2Status:=RBIT(IB2Status,BO);
   IB2DATA:=OUTBYTE;
 END PUTIB2;


COMMENT
*Sallows the BO signifing the last item has outputted
*Only called when there is no more output (till address to talk again);
SUBROUTINE WaitClrBO;
 BEGIN
 DO ChkIB2status UNTIL (TBIT(IB2Status,BO) OR NOT TBIT(IB2ADDMD,1))&TA&;
  IB2Status:=RBIT(IB2Status,BO);
 END WaitClrBO;


COMMENT
*Output IB2 status byte in response to Unexpected BO,
   Clear next BO, and then error out;
SUBROUTINE UnexpectedBO;
 BEGIN
   PUTIB2(IB2STA);  WaitClrBO;   MonBailout(0);
 END UnexpectedBO;
```

```
SMONITOR.WORK.PD8510            THU, DEC 22, 1983, 10:47 AM     PAGE  40

#EJECT;COMMENT
*Loops till byte outputted to selected IOdevice;
& deleted keystroke bailout &
PROCEDURE WCHAR(C);VALUE C;BYTE C;
 BEGIN
  WCHAR1:
    ChkIB2status;
                                             &termbit set only if acia_avail&
   IF TBIT(IOdevice,Term)  AND TBIT(ACIASC,ACIATx)
               THEN ACIADATA:=C
     ELSE IF TBIT(IOdevice,Key) THEN BEGIN
                LoadDisp(INTEGER(C)+Z8000);
                LoadDisp(EOD);
                DispAdd:=DispAdd +
                  (IF (C=BS OR DispAdd>=MaxMonDisp) THEN -2 ELSE -1);
                        END
     ELSE IF (TBIT(IOdevice,IB2) AND TBIT(IB2Status,BO)) THEN PUTIB2(C)
     ELSE GO TO WCHAR1;
 END WCHAR;


COMMENT
*Outputs a string;
PROCEDURE WSTR(SR);VALUE SR;ALPHA SR;
  BEGIN
   DOUBLE SRAdr=SR;
   BYTE POINTER BP;
   INTEGER CharCount;
     STPNTR(BP,SRAdr);
     IF NOT TBIT(IOdevice,IB2) THEN
              FOR CharCount:=1 TO BP[0] DO WCHAR(BP[CharCount]);
  END WSTR ;


PROCEDURE WNUM(n);  VALUE n; INTEGER n;
BEGIN
INTEGER tens;

IF ( tens := n/10 ) = 0 THEN WCHAR( Space ) ELSE WCHAR( tens + ascii );
WCHAR( n - ( 10 * tens ) + ascii );
WCHAR( Space );
END WNUM ;


SUBROUTINE CRLF;
 BEGIN
   WCHAR(CR);
   WCHAR(LF);
   IF TBIT(IOdevice,IB2) THEN WaitClrBO;
   IF TBIT(IOdevice,Term) THEN
      BEGIN REPEAT 2000 DO ASSEMBLE( ROL.L #32,R0); END;&9600 pad char&
 END CRLF;
```

```
SMONITOR.WORK.PD8510            THU, DEC 22, 1983, 10:47 AM     PAGE  41

#EJECT;COMMENT
*Output in ASCII HEX , #digits = Width, with a leading space the
  value supplied, and fill with leading zeros ;
PROCEDURE WHex(NUM,WIDTH); VALUE NUM,WIDTH; INTEGER WIDTH; DOUBLE NUM;
 BEGIN
  BYTE  HCHAR;
    WCHAR(Z20);
    NUM:=RLEFT(NUM,4*(9-WIDTH));
    REPEAT WIDTH DO BEGIN
      HCHAR:=NUM AND ZF;
      WCHAR(HCHAR+ (IF HCHAR<10 THEN ascii ELSE ascii_hex));
      NUM:=RLEFT(NUM,4);    END;
 END WHex ;


PROCEDURE IB2ERROR(NUM); VALUE NUM; INTEGER NUM;
BEGIN
IF (NUM<=3 AND NUM>=1) THEN DO GetUpshiftByte UNTIL CHR=LF;
END IB2ERROR;

SUBROUTINE RestoreMonValues;
BEGIN
INTEGER t=REGISTER 2;
   IF INTEGER(READ(BRADD)) = TRAP15 THEN WRITE(BRADD,BRINS);
   IF FirstDispLoc#JmpMonDisp THEN BEGIN
          OldFirstDisp:=FirstDispLoc; FirstDispLoc:=JmpMonDisp; END;
   t:=Clr_Watchdog;
   IF LOAD_IT=0 THEN BEGIN IOdevice:=Keybit;SoftKeys;
     END ELSE LOAD_IT:=0;

END RestoreMonValue;
```

```
SMONITOR.WORK.PD8510            THU, DEC 22, 1983, 10:47 AM     PAGE  42

#EJECT;COMMENT;
PROCEDURE MonBailout(MESNUM); VALUE MESNUM; INTEGER MESNUM;
BEGIN

  IF TBIT(IOdevice,IB2) THEN IB2ERROR(MESNUM)


  ELSE IF MESNUM <0 THEN  BEGIN
             STPNTR(ATable,ADRS(MES1)); WSTR(ATable[-MESNUM]);
                  WSTR(MES1);
                  WHex(PCSave,6); CRLF;
                  OldCMD:="TR";  Parm1:=PCSave;   END
  ELSE IF MESNUM>0 THEN
         BEGIN    STPNTR(ATable,ADRS(MES));  WSTR(ATable[MESNUM]);
                  WSTR(MES);
                  IF MESNUM=4 OR MESNUM=5 THEN WHex(TPstatus,4);
                  CRLF;
                  IF (loop=-1 AND MESNUM=1)THEN GO TO LA0;
                  END;

   IF loop # 0 THEN GO TO LA2  & occured in self test menu &
     ELSE           GO TO WaitCMD;
END;
```

```
SMONITOR.WORK.PD8510            THU, DEC 22, 1983, 10:47 AM     PAGE  43

#EJECT;COMMENT Takes inputted char  and adds to buffer
        Determines if char is a backspace and does approirate action
        Then determines if char has terminated entry or buffer full
        Else Echos char
end of comment;
PROCEDURE BuildBuf(NewChar); VALUE NewChar; BYTE NewChar;
BEGIN
  BUF[BufPTR]:=NewChar;
     IF NewChar#BS THEN BufPTR:=BufPTR+1
        ELSE IF  BufPTR>BufEmpty  THEN BEGIN
                    BufPTR:=BufPTR-1; DispAdd:=DispAdd-1; END;
     IF NewChar=CR OR BufPTR>=BufSize THEN
        BEGIN CRLF; BUF[BufPTR]:=LF;
              BufPTR:=0;  BufReady:=1; END
       ELSE WCHAR(NewChar);
END BuildBuf;

COMMENT
*Get a input byte from either HP-IB or Terminal Buffer or Keyboard
*Normally entered with Term selected
*Abort if HP-IB is requesting output
*If no HP-IB input and Buffer empty,
*          start building a buffer if ACIA has input, terminate on CR;
BYTE SUBROUTINE GetByte;
 BEGIN
  GetByteStart:
   ChkIB2status;
   IF TBIT(IB2Status,BI) THEN  GetByte:=GetIB2
   ELSE IF TBIT(IB2Status,BO) THEN  UnexpectedBO
   ELSE IF ( (NOT TBIT(IOdevice,IB2)) AND BufReady ) THEN
            BEGIN  IF ( GetByte:=BUF[BufPTR]) = LF
                        THEN BEGIN BufReady:=0;  BufPTR:=-1; END
                     ELSE  BufPTR:=BufPTR+1;   END
   ELSE BEGIN
        IF NOT TBIT(IOdevice,IB2) THEN
            BEGIN
            IF BufPTR<0 THEN BEGIN WCHAR(prompt); BufPTR:=0; END;
            IF ACIA_avail AND TBIT(ACIASC,ACIARx) THEN
                   BEGIN IOdevice:=Termbit; BuildBuf(ACIADATA); END;
            IF (TopKeystat AND ZF )#0 THEN
                   BEGIN IOdevice:=Keybit;
                              & decode 1/2 byte keys &
                         STPNTR(IntPtr,ADRS(KeyTable));
                         IF IntPtr[CHR:=TopKeydata]>ZFF THEN
                            BuildBuf(RIGHT( IntPtr[CHR], 8) );
                         BuildBuf(IntPtr[CHR]);
                   END;
            END;
         GO TO GetByteStart;
         END;

  END GetByte;
```

```
SMONITOR.WORK.PD8510          THU, DEC 22, 1983, 10:48 AM      PAGE  44

#EJECT;COMMENT
*Get a Byte --Clear parity, up shift any lowercase letters,
     and ignore all nonprinting except LF;
SUBROUTINE GetUpshiftByte;
  BEGIN
    DO BEGIN
        CHR:=GetByte;
        CHR:= %7F AND (IF TBIT(CHR,6) THEN RBIT(CHR,5) ELSE CHR );
      END  UNTIL (CHR=LF OR CHR>=Space);
  END;

COMMENT
*Convert a series of ASCII HEX chars to a Parm[], and if succesful
*  increment PCTR  also accept UP
*Will error out if invalid input
*If result is a 16bit result sign extend;
PROCEDURE GetHex;
 BEGIN
  INTEGER DIGITCTR;
  DOUBLE TempParm;

    DIGITCTR:=0;
    DO GetUpshiftByte UNTIL CHR#Space;

 GetHexLoop:
   IF (CHR=LF OR CHR=Space OR CHR=Comma ) THEN GO TO GetHexExit;
   IF CHR='U THEN BEGIN GetUpshiftByte; GetUpshiftByte;
                        GO TO GetHexExit; END;
   IF (CHR>=%30 AND CHR<=%39) OR (CHR>=%41 AND CHR<=%46)
        THEN BEGIN
              IF (DIGITCTR:=DIGITCTR+1)=1 THEN TempParm:=0;
              TempParm:= ALEFT(TempParm,4) + CHR
                        + (IF CHR<%40 THEN -%30 ELSE -%37);
              GetUpshiftByte;
              GO TO GetHexLoop;
              END;
   MonBailout(1); & Invalid input&

  GetHexExit:
   IF DIGITCTR # 0 THEN Parm[PCTR:=PCTR+1] :=
       (IF DIGITCTR = 4 THEN DOUBLE(INTEGER(TempParm)) ELSE TempParm);
                                    & SIGN EXTEND &
 END GetHex ;
```

```
SMONITOR.WORK.PD8510          THU, DEC 22, 1983, 10:48 AM      PAGE  45

#EJECT;COMMENT
*Fetch supplied Parm[] till none;
SUBROUTINE GetParms;
 BEGIN
   IF PCTR=0 THEN
      DO GetHex UNTIL ( (CHR#Space AND CHR#Comma) OR PCTR>=MaxParm );
   IF CMD#"RG" THEN Parm1:=RBIT(Parm1,0); &ONLY EVEN ADDRESSES&
 END GetParms;

COMMENT Special GetParms for GO/TR -- if PCTR>0 set PCsave and SRsave
          Else use values in user registers
        Prevents interrupts from becoming activated upon return to
          User program if Pctr>0
end of comment;
SUBROUTINE GetParmsGO;
 BEGIN
        GetParms;
        IF PCTR > 0 THEN BEGIN  PCSave:=Parm1;
                                IF CMD="GO" THEN  SRSave:=%2700; END;
 END GetParmsGO;

COMMENT Special GetParm for Record function -- sets defaults and
          some temps
       The Defaults are set and overridden if entry by GetParms
                              Record Lengths
              Block        Tape     IntelMBM
                0            1         1
                1          347      1448
                2           88       372
                3           76       226
              TEST                     1  ( LAST PAGE )
                          ----     ----
                           512      2048
              SPARE        330         0
end of comment;
SUBROUTINE GetParmsRecord;
BEGIN
   Parm2:=    %16AFF;
   Parm3:= %FFFF8000;
   Parm4:= %FFFFDCFF;
   Parm5:=   %106000;
   Parm6:=   %1097FF;
   GetParms;
   IF PCTR=0 THEN   Parm1 := %100;
   record_blks := 3;
END GetParmsRecord;
```

```
SMONITOR.WORK.PD8510          THU, DEC 22, 1983, 10:48 AM      PAGE  46

#EJECT;COMMENT
*Intialize input routines, then build a two char command code
*    will ignore non-letters
*if input is (CR)LF or UP , Restore OldCMD and modified Parm1;
SUBROUTINE GetCMD;
 BEGIN
    IF ACIA_avail THEN IOdevice := Termbit;
    loop:=0;
    TRACE:=0; BufReady:=0;
    IF DispAdd>200 THEN DispAdd:=0;
    BufPTR:=-1;
    DO BEGIN GetUpshiftByte; CMD:=CHR; END UNTIL CMD>'@ OR CMD=LF;
    IF CMD=LF THEN CMD:="UP"
      ELSE BEGIN GetUpshiftByte; CMD:=LEFT(CMD,8)+INTEGER(CHR); END;
    IF CMD="UP" THEN
       BEGIN
         PCTR:=1;
         CMD:=OldCMD;
       END ELSE PCTR:=0;
    OldCMD:=CMD;
 END GetCMD;


COMMENT
*Dump Parm1, and Contents of memory from Parm1 to Parm1+14;
SUBROUTINE DMSub;
 BEGIN
   WHex(Parm1,6);
   REPEAT 8 DO BEGIN WHex(INTEGER(READ(Parm1)),4);
                  Parm1:=Parm1+2;  END;
   CRLF;
 END DMSub;

COMMENT
Sets the Old Cmd to "DM 100 " ;
SUBROUTINE SetDM100oldcnd;
  BEGIN
   PCTR:=1; OldCMD:="DM";  Parm1:=%100;
  END;

COMMENT
Displays the DM100 contents;
SUBROUTINE DM100;
BEGIN
  SetDM100oldcnd;
  DMSub;
END;
```

```
SMONITOR.WORK.PD8510          THU, DEC 22, 1983, 10:48 AM      PAGE  47

#EJECT;COMMENT
*Staring at supplied adress --Display adress, read and display present
*       memory value if "VM", request new value, if supplied then
*   change memory else go to next memory location
*Loop till error out in GetHex
*
*LOOP CNTR DISABLED TO ELIMINATE NEED FOR ERROR OUT IN X7 MON ;

SUBROUTINE ModMEMSub;
 BEGIN
   GetParms;
ModMEMloop:
   IF NOT TBIT(IOdevice,IB2) THEN WHex(Parm1,6);
   IF CMD="VM" THEN BEGIN WHex(INTEGER(READ(Parm1)),4);
                          IF TBIT(IOdevice,IB2) THEN CRLF;  END;

   PCTR:=1;
   GetHex;
   I:=DispAdd;
   loop:=1;
rptloop:IF PCTR>1 THEN WRITE(Parm1,INTEGER(Parm2));
   IF (CMD="CW" AND loop#0) THEN BEGIN
       DispAdd:=I;bailout_if_key_pressed;GO TO rptloop; END;
   loop:=0;
   Parm1:=Parm1+2;
 END ModMEMSub;
```

```
@EJECT;COMMENT;
PROCEDURE SetParmTemp(adr);        VALUE adr;     DOUBLE adr;
BEGIN
INTEGER POINTER ptr = adr;
 MOVE Parm[1] := ptr[ ( blk_ctr + 1 ) * 4 ], 4(2);&move 2 doubles%
END SetParmTemp;

SUBROUTINE set_parms;
BEGIN  Parm1 := %100;
       Parm2 := Parm1 + ALEFT(DOUBLE(Tape_1_mbn_pages), 6 &64%) - 1;END;


SUBROUTINE check_cart_in;
BEGIN
   IF TBIT(TPstatus,Cartout) THEN MonBailout(14) ;
END check_cart_in;

SUBROUTINE wrt_tape_error;
 BEGIN
 check_cart_in;
 IF TBIT(TPstatus,WPR) THEN MonBailout(13) ELSE MonBailout(5);
 END;

SUBROUTINE wrt_tape_header;
 IF NOT TPWRT(ADRS(Tape_buf),64) THEN wrt_tape_error;


PROCEDURE read_tape( adr ); VALUE adr;    DOUBLE adr;
  IF NOT ( TPRED( adr, Temp3 ) AND (Temp3 # 0) ) THEN
                              BEGIN check_cart_in;  MonBailout(4);  END;

SUBROUTINE tape_blk_read;
BEGIN
   DO BEGIN
      read_tape( Parm1 );
      Parm1 := Parm1 + 256;
      END UNTIL Parm1 >= Parm2;
END tape_blk_read;


SUBROUTINE tape_blk_wrt;
BEGIN
   DO BEGIN
      IF NOT TPWRT( Parm1, 256 ) THEN wrt_tape_error;
      Parm1 := Parm1 + 256;
      END UNTIL Parm1 >= Parm2;
END tape_blk_wrt;
```

SMONITOR.WORK.PD8510 THU, DEC 22, 1983, 10:48 AM PAGE 52

SMONITOR.WORK.PD8510 THU, DEC 22, 1983, 10:48 AM PAGE 53

```
@EJECT;COMMENT;
PROCEDURE recordtape(type);            VALUE type;     INTEGER type;
BEGIN
INTEGER blks, pages;
   OldCMD := 0;
   blks := 6 &man&;      pages := seg_start;
   IF TBIT(IDdevice,Term)  THEN
      BEGIN
      GetParms;
      IF PCTR > 1 THEN blks := Parm2;
      IF PCTR > 2 THEN pages:= Parm3;
      END;

   read_mbn_header;
   MOVE Tape_buf := MBM_buf,ο(32);
   Tape_pgm_type := type;
   Tape_1_mbn_pages := pages;
   IF blks  < MBM_0_mbn_blks  THEN Tape_0_mbn_blks  := blks;

   IF NOT(( type = IDed_pgm ) AND ( MBM_pgm_type = IDed_pgm )) THEN
       IF ACIA_avail AND NOT TBIT(IDdevice,Key) THEN   & factory only &
           BEGIN
           IF type = service_pgm THEN Tape_1_mbn_pages := 0
            ELSE IF type = IDed_pgm THEN  & AND mbn is not &
                 compute_boot_codes;
            & Demo parameters  would be handled here &
           END
        ELSE MonBailout ( 9 );  & tape recording  not allowed &

   TPINT;
   REW;

   wrt_tape_header;
   init_mbn_0;
   mbn_page := 1;
   FOR blk_ctr:=1 WHILE (blk_ctr<=Tape_0_mbn_blks) DO
      BEGIN
      SetParmTemp(ADRS(MBM_buf));
      read_mbn_parm;
      tape_blk_wrt;
      END mbn_0 blk loop;
   IF Tape_1_mbn_pages # 0 THEN
      BEGIN
      set_parms;
      init_mbn_1;
      mbn_page := 1;
      read_mbn_parm;
      tape_blk_wrt;
      END mbn_1 blk;

    REW ;

END recordtape;
```

SMONITOR.WORK.PD8510 THU, DEC 22, 1983, 10:48 AM PAGE 54

```
@EJECT;COMMENT;
SUBROUTINE CLEAR_SCREEN;
     BEGIN
     FirstDisploc:=JmpMonDisp;
     DispAdd:=0;
     reset_DispMem;
     LoadDisp(%5000);LoadDisp(%4F00);
     reset_DispMem;
     END CLEAR_SCREEN;


PROCEDURE TLBL(I);VALUE I;INTEGER I;ENTRY;
BEGIN
   CLEAR_SCREEN;
   STPNTR(ATable,ADRS(TTBL));
   IF (I#23) THEN BEGIN
       WSTR("IN ");WSTR(ATable[I-2]);WSTR(" TEST");  .
      END
    ELSE WSTR("ENTER KEY");
   CRLF;
END;

PROCEDURE test( J, case, loop ); VALUE case; INTEGER case, J, loop;
BEGIN
   testing := case;  & set memory location for debug if problem occured&
   CASE case
      BEGIN
      ;
      CHECKSUM(J,loop);
      RAM(J,loop);
      FPANEL(J,loop);
      BG1(J,loop);
      DG2(J,loop);
      TIMER(J,loop);
      HPIB(J,loop);
      HPIB1(J,loop);
      TINTER(J,loop);
      ACPMPY(J,loop);
      TACO(J,loop);
      MBMTEST(J,loop);
      BBTEST(J,loop);
   END case;

END test;
```

SMONITOR.WORK.PD8510 THU, DEC 22, 1983, 10:48 AM PAGE 55

```
@EJECT; COMMENT
*Start OF MAIN
end of comment;
MONITOR:

ASSEMBLE(  CLR.L R0; MOVE R0,MultInit1;   MOVE MultInit2,R0;
           MOVE =D50,R0;
           ASR SetPreset;
ResetLoop: DBRA R0,ResetLoop; &DELAY&
           ASR RelMemOffset;     RSR RelPreset );

RPTCOUNT:=0;GOODCOUNT:=0;BADCOUNT:=0;
LOAD_IT:=0;


GONOW:   & ENTRY FOR REPEAT TEST MODE &

bitflags:=0;   &set ACIA_avail,TRACE,BufReady = 0/FALSE&

COMMENT
*   AT THIS POINT IT IS NECESSARY TO VERIFY RAM OPERATION
*   AND PROM CHECKSUM
end of comment;
J:=0;loop:=0; & IF THESE TWO CELLS ARE BAD THE RAM TEST
               WILL FIND THEM ANYWAY &
 ASSEMBLE( LEA @RBT.L,R9);
 CHEK_SUM;
 ASSEMBLE("@RBT EQU *");

TN:=2;RAM(J,loop);
```

SMONITOR.WORK.PD8510 THU, DEC 22, 1983, 10:48 AM PAGE 56

```
#EJECT;
ACIAInit;
IB2Init;
DGInit;
BRADD:=0; IB2Status:=0; OldCMD:=0; BRCount:=0; BRCountSave:=0;
TraceLoLim:=%80000000;      TraceHiLim:=%7FFFFFFF;


ASSEMBLE ( LEA    $RAM$.L,R8;
           MOVE.L (R8)+,0 ;
           MOVE.L (R8)+,4 );
STPNTR(DP,0);
FOR Temp1:=2  UNTIL 47 DO DP[Temp1]:=ADRS(OTHERException);
FOR Temp1:=48 UNTIL 63 DO DP[Temp1]:=0;   &Locations for DEBUG Flags&
  ADDRESSVector:=ADRS(ADDRESSException);
  INSTR15Vector:=INSTR10Vector:=
  INSTRVector  :=ADRS(INSTRException);
  TRACEVector  :=ADRS(TRACEException);
  ABORTVect1   :=ABORTVect2:=ADRS(ABORTException);
  TRAP15Vector :=ADRS(TRAP15Exception);
  REFRSHVctr1  :=
  REFRSHVector :=ADRS(Refrsh);
  MULTIBUSYVector:=ADRS(NullException);
  TAPEVector   :=ADRS(TAPEntry);

STPNTR(RGSave,ADRS(RG));
FOR Temp1:=0 TO 19 DO RGSave[Temp1]:=0;
SPSave:=USPSave:=%F0;      & Temp INTIALIZATION TO PREVENT USE OF ZERO&
SRSave:=%2700;
```

SMONITOR.WORK.PD8510 THU, DEC 22, 1983, 10:48 AM PAGE 57

```
#EJECT;
I:=0;J:=%40;TN:=0;
loop:=0;
ERROR(J,I,I);J:=0; &  CLEAR ERROR DISPLAY &
INC(J,J,J);    & INITIALIZE ERROR DETECT &

&   CHECK FOR STUCK KEY &

WRITE( ADRS(TopKeycmd),  Keyscan, TopKeyclk, ReadSensor, Keyclr );
                 &    SENSOR MATRIX MODE AUTO INC  &

REPEAT 50 DO delay; & SETUP DELAY  allow a full keyboard scan&


KEYSTUCK:=0;
IF TBIT(TopKeystat , sensor_bit) THEN BEGIN
   REPEAT 8 DO BEGIN
      K:=INTEGER(TopKeydata AND %OFF);
     & GET ROW  &
      IF J=0 THEN GET(K,J);END;
   KEYSTUCK:=J;
   END;
topkey_init;REPEAT 50 DO delay;

& CHECK FOR BAD IO DATA OR STUCK STATUS &

IF (LEDS AND %FF)#%FF THEN BEGIN
   J:=NOT(LEDS);
   J:=(J AND %FF); & MASK LOWER 8 BITS &
  GET(J,J);TN:=3;INC(J,TN,loop); & REPORT BAD BIT &
   loop:=1;FPANEL(J,loop);& STICK IN IO DATA TEST &
   END;
```

SMONITOR.WORK.PD8510 THU, DEC 22, 1983, 10:48 AM PAGE 58

```
#EJECT;
&   TEST FOR GROUNDED TP   &

J:=RIGHT(proc_hwd_tp,8);
J:=(NOT(J));J:=(J AND %3F);
GET(J,J);
IF(J AND %3F)#O THEN BEGIN
   loop:=1;J:=J-1;

   CASE J BEGIN
      KEY_TEST;       &  TP29 &
      FPANEL(J,loop);   &  TP30 &
      CHECKSUM(J,loop); &  TP32 &
      RAM(J,loop);      &  TP28  &
      TINTER(J,loop);   &  TP27  &
      ACPMPY(J,loop);   &  TP31  &
      END tp loop case;
   END;


J:=0;loop:=0;
```

SMONITOR.WORK.PD8510 THU, DEC 22, 1983, 10:48 AM PAGE 59

```
#EJECT;COMMENT ****ENTRY FOR AUTO TEST ****  ;
IOdevice:=Keybit;

DispAdd:=0;
reset_DispMem;


  &SET AUTO TEST MODE&
TN:=2;            & TEST NUMBER=2 &
INC(J,TN,loop);

DO BEGIN
   test( J, TN, loop );
   INC(  J, TN, loop);
   END UNTIL TN=14;


IF KEYSTUCK#O THEN INC(KEYSTUCK,TN,loop); & REPORT STUCK KEY &

loop:=6;INC(J,TN,loop);loop:=0; & RESTORE ANY ERROR DISPLAY &
WHILE RPTCOUNT#O DO BEGIN
   CLEAR_SCREEN;
   WSTR("REPEAT LOOP"+CR+LF);
   IF J#O THEN BEGIN BADCOUNT:=BADCOUNT+1; END
     ELSE BEGIN GOODCOUNT:=GOODCOUNT+1;END;
   WSTR("PASSED ");WHex(GOODCOUNT,4);CRLF;
   WSTR("FAILED ");WHex(BADCOUNT,4);CRLF;
   GO TO WaitCMD;
   END;
```

```
@EJECT;
IOdevice:=Keybit;

   & LOAD AND GO MAIN SW AFTER TESTING &
IF LOAD_IT=1 THEN BEGIN
      LOAD_IT:=%00;GO TO AUTO;END;

   JMO THEN BEGIN CLEAR_SCREEN;
   ?("SELF TEST FAILURE"+CR+LF);
   GO TO LA1;END;

AUTO:CLEAR_SCREEN;
STPNTR(DispMem,ADRS(FirstDispLoc));
LoadDisp(%0100);
LoadDisp(%5080);
LoadDisp(%4D80);
IOdevice:=Keybit;
WSTR("SYSTEM INITIALIZATION IN PROGRESS"+CR+LF);

 &******** AUTO LOAD AND GO *************** &

   loop:=0; & TURN OFF OPER. SELECT FLAG &

   IF init_mbm_0 THEN BEGIN PCTR:=1;Parm1:=%100;LoadMBM;
                                   GO TO AutoExitMonitor;   END;
```

```
@EJECT;COMMENT;
LA0:CLEAR_SCREEN;

LA1: loop:=0;bailout_if_key_pressed;  & CLEAR ANY PREVIOUS FIFO DATA &
loop:=-1;  & RETURN TO THIS MENU IF INPUT ERRORS &


STPNTR(ATable,ADRS(TTBL));
I:=0;
WHILE I<=22 DO BEGIN          & DISPLAY TEST MENU &
   IF (I>=1 AND I<=21)THEN BEGIN
       WNUM( I ); WSTR(ATable[I]);
       IF (I<=14 OR I=17) THEN WSTR(" TEST");
       IF  I =14 THEN CRLF;      END
    ELSE WSTR(ATable[I]);
   CRLF;
   I:=I+1;
   END;
C:=DispAdd;
LA2:
BufReady:=0;
BufPTR:=0;   & initialize input buffer &
PCTR:=0;
GetHex;
B:=INTEGER(Parm1);

 &  DEC/HEX CONVERT  &
B:= ( RIGHT( ( B AND %OFF ) , 4 ) * 10 )  + ( B AND %OF );
PCTR:=0;


IF ((B>21) OR B<=0)  THEN  GO TO LA0;
DispAdd:=C;
WNUM(B); CRLF;
loop:=1;
IF B  <= 13 THEN test( J, B, loop )
 ELSE BEGIN
      CASE ( B-14 )
         BEGIN
        &B=14 & KEY_TEST;
        &B=15 & BEGIN & fall thru & END;             &LOAD FROM BUBBLE &
        &B=16 & TRAP(15);
        &B=17 & GO TO MONITOR;
        &B=18 & BEGIN RPTCOUNT:=1;GO TO WaitCMD;END;
        &B=19 & BEGIN LoadTape;  END;
        &B=20 & BEGIN recordtape( IDed_pgm);  END;
        &B=21 & BEGIN IF NOT TPmark THEN wrt_tape_error; GO TO LA0; END;
         END case;
      LOAD_IT:=1;GO TO GONOW;   & LOAD FROM BUBBLE &
      END else;
```

```
@EJECT;COMMENT
**************************************************************************
Start OF MAIN MONITOR
end of comment;


WaitCMD:
  ASSEMBLE(
          MOVE.L @RAM$.L,S;
          MOVE.L S,M ;       ORI  =H2700,SR  );
       IF RPTCOUNT#0 THEN GO TO GONOW;
    IF trap_15_type=service_trap THEN BEGIN    & SERVICE MENU &
            trap_15_type:=0;GO TO LA0;END;


  :END;
```

```
#EJECT;
COMMENT
******************** MONITOR ENTRY AND EXIT ROUTINES *****************
;
COMMENT
*Return to Monitor --- saves the user registers
*Removes any break points
*IF a breakpoint (TRAP15) decrements counter and checks if <0
*          if not returns to user program
*If a trace exception but TRACE false then was a single step past
*          breakpoint, so return to user program
*IF no reason to return to user program then return to monitor
*IF break occur from Terminal - Initailize ACIA -- Send messages to Term
end of comment;
EnterMonitor:
 &Save REGS&
  ASSEMBLE(
        ORI    =H2700,SR;        &TURN OFF INTERRUPTS&
        MOVE.L S,SPSave;
        LEA    SPSave,S;
        MOVEM.L R0-R14,-(S);
        MOVE.L SPSave,R8;
        MOVE.W (R8)+,SRSave;
        MOVE.L (R8)+,PCSave;
        MOVE.L R8,SPSave;
        MOVE.L R8,SSPSave;
        MOVE.L USP,R8;
        MOVE.L R8,USPSave;
        MOVE.L $RAM$.L,S;
        MOVE.L S,G             );

RestoreMonValues;
              RPTCOUNT:=0; &  TURN OFF TEST REPEAT MODE &
              loop:=0;    & TURN OFF LOOP MODE &


  IF ExceptionTYPE = TRAP15Ex THEN BEGIN


          IF TBIT(SRSave,TRACEBit) THEN GO TO ExitMonitor;
          PCSave:=PCSave-2;
          IF (BRCount:=BRCount-1) > 0 THEN GO TO ExitMonitorTRACE
                ELSE MonBailout(-3);  END;
  IF ExceptionTYPE = TRACEEx THEN
            IF TRACE THEN BEGIN
                IF ( (PCSave<TraceLoLim) OR (PCSave>TraceHiLim))
                      THEN GO TO ExitMonitorTRACE
                      ELSE MonBailout(-2); END
              ELSE GO TO ExitMonitor;
                        &WAS AN 1 WORD TRACE AND CONTINUE&
  IF ACIA_avail AND TBIT(ACIASC,Break) THEN
    BEGIN DO UNTIL NOT TBIT(ACIASC,Break); ACIAInit; STOPNOW;&tape&END;
  CRLF;
  MonBailout(-1);  & ABORT &
```

```
&GO TO WaitCMD -- OCCURS IMPLICITLY IN MonBailout &


COMMENT
*Return to user program, set either TRACE or Breakpoints if any
* restore user regs;
ExitMonitorTRACE: SRSave:=SBIT(SRSave,TRACEBit);
                  GO TO RestoreREG;
AutoExitMonitor:  ASSEMBLE( MOVE.L StartAddress,PCSave );
                  SRSave:=Z2700;
                  SPSave:=ZF0;                    & Temp INTIALIZATION &
ExitMonitor:
                  SRSave:=RBIT(SRSave,TRACEBit);
                  IF BRADD # 0  THEN  BEGIN
                      BRINS:=READ(BRADD);
                      WRITE(BRADD,TRAP15); END;
RestoreREG:FirstDispLoc:=OldFirstDisp;
     ASSEMBLE(
         MOVE.L USPSave,R8;
         MOVE.L R8,USP;
         LEA    RG,S;
         MOVEM.L (S)+,R0-R14;
         MOVE.L SPSave,S;
         MOVE.L PCSave,-(S);
         MOVE.W SRSave,-(S);
NullException:RTE      );
```

```
SMONITOR.WORK.PD8510            THU, DEC 22, 1983, 10:48 AM     PAGE  68

#EJECT;
COMMENT ********************* EXCEPTION ROUTINES *******************
*
*If unexpected exception then dump stack and error out-- good luck
*
*if of expected type, save type, and go to EnterMonitor to determine
*   if to entermonitor or return to user;

INSTRException:   ExceptionTYPE:=8; GO TO ExceptionBailout;
ADDRESSException: ExceptionTYPE:=7; GO TO ExceptionBailout;
OTHERException:&ALL BUT TRAP15 AND TRACE AND ABORT&
                &STACKPOINTER AND REGS GARBAGE -- CORRECT??&
          ExceptionTYPE:=6;
ExceptionBailout:

          ASSEMBLE ( MOVE.L $RAM$.L,G; MOVE.L S,Parm1;   ORI =H2700,SR );
          RestoreMonValues;
          DMSub;
          MonBailout(ExceptionTYPE);

TRAP15Exception:
                  ExceptionTYPE:=TRAP15Ex;
                  GO TO EnterMonitor;

TRACEException:
                  ExceptionTYPE:=TRACEEx;
                  GO TO EnterMonitor;

ABORTException:
                  ExceptionTYPE:=ABORTEx;
                  GO TO EnterMonitor;

END$
```

```
CMSGCAL.WORK.PD8510             THU, DEC 22, 1983, 10:48 AM     PAGE   1

INTEGER CONSTANT
  no_e_coeffs := 2024,
  cal_not_for_param := 2059,
  not_finished_caling := 2097,
  turn_correct_off := 2125,
  no_cal_in_progress := 2158,
  connect_std := 2195,
  slide_load := 2235,
  connect_thru := 2278,
  isolate_ports := 2324,
  press_done := 2371,
  press_save := 2410,
  cal_aborted := 2446,
  comp_cal_coeff := 2477,
  measuring_std := 2504,
  select_cal_set := 2535,
  select_delete_cal_set := 2560,
  more_slides_needed := 2601,
  specify_std := 2620,
  exceeded_std_class_limit := 2646,
  specify_std_class := 2677,
  select_std_class := 2724,
  c_file_8 := -1;
```

```
CMSGIB.WORK.PD8510              THU, DEC 22, 1983, 10:48 AM     PAGE   1

INTEGER CONSTANT
  no_output_selection := 1142,
  illegal_output_selection := 1187,
  no_input_selection := 1227,
  pass_thru_disabled := 1272,
  pass_thru_invalid := 1298,
  block_input_error := 1324,
  block_input_length_error := 1342,
  array_unavailable := 1367,
  c_file_6 := -1;
```

```
CMSGMBM.WORK.PD8510             THU, DEC 22, 1983, 10:48 AM     PAGE   1

INTEGER CONSTANT
  save_prompt := 813,
  saving_data := 830,
  data_saved := 839,
  save_error := 847,
  recall_prompt := 865,
  recalling_data := 884,
  data_recalled := 896,
  recall_error := 907,
  no_reg_data := 928,
  preset_macro := 939,
  last_state_macro := 952,
  data_overflow := 963,
  no_last_state := 977,
  delete_prompt := 991,
  deleting_data := 1010,
  cal_reg_cleared := 1021,
  cal_clear_error := 1033,
  un_init_mbm := 1055,
  bubble_init_error := 1056,
  loading_data := 1057,
  invalid_mbm_data := 1070,
  c_file_4 := -1;
```

```
CMSGPLOT.WORK.PD8510          THU, DEC 22, 1983, 10:48 AM     PAGE   1

INTEGER CONSTANT
  no_printer := 1087,
  plot_aborted := 1108,
  no_plotter := 1121,
  c_file_5 := -1;
```

```
CMSGPRIV.WORK.PD8510          THU, DEC 22, 1983, 10:49 AM     PAGE   1

INTEGER CONSTANT
  source_ib_err := 107,
  test_set_ib_err := 127,
  priv_ib_add_err := 149,
  priv_ib_srq_err := 174,
  c_file_2 := -1;
```

```
CMSGTAPE.WORK.PD8510          THU, DEC 22, 1983, 10:49 AM     PAGE   1

INTEGER CONSTANT
  no_tape := 195,
  loading_tape := 212,
  no_file_found := 225,
  initializing_tape := 240,
  tape_init := 258,
  init_aborted := 275,
  using_backup := 293,
  load_aborted := 316,
  select_tape_data := 334,
  file_error := 351,
  file_aborted := 364,
  record_macro := 379,
  restore_macro := 386,
  delete_macro := 394,
  undelete_macro := 401,
  select_record := 410,
  select_restore := 434,
  select_file_record := 458,
  select_file_restore := 482,
  select_file_delete := 507,
  abort_restore := 531,
  recording_file := 562,
  file_recorded := 577,
  no_tape_room := 591,
  deleting_file := 615,
  file_deleted := 629,
  file_undeleted := 642,
  undeleting_file := 657,
  restoring_file := 673,
  file_restored := 688,
  restore_pts_error := 702,
  restore_401_macro := 729,
  restore_201_macro := 733,
  restore_101_macro := 737,
  restore_51_macro := 741,
  tape_errors := 744,
  format_macro := 752,
  tape_drive_macro := 764,
  write_protect_macro := 775,
  checksum_macro := 789,
  parity_macro := 798,
  unknown_macro := 805,
  c_file_3 := -1;
```

```
CMSGTEMP.WORK.PD8510          THU, DEC 22, 1983, 10:49 AM     PAGE   1

INTEGER CONSTANT
  invalid_mbn_data := 1116,
  plotter_stack_overflow := 1133,
  c_file_5 := -1;
```

CMSGTIME.WORK.PD8510 THU, DEC 22, 1983, 10:49 AM PAGE 1

```
INTEGER CONSTANT
  comp_time_coeff := 2757,
  comp_gate_coeff := 2785,
  tdr_freq_change := 2813,
  c_file_9 := -1;
```

CNEWLINE.WORK.PD8510 THU, DEC 22, 1983, 10:49 AM PAGE 1

```
INTEGER CONSTANT newline          := 10; & ASCII lf &
```

FNUMBER.WORK.PD8510 THU, DEC 22, 1983, 10:49 AM PAGE 1

```
INTEGER PROCEDURE get_number(token);
   VALUE token;                                        EXTERNAL.L;
   INTEGER token;
```

SNUMBER.WORK.PD8510 THU, DEC 22, 1983, 10:49 AM PAGE 1

```
M68KL,P,"number"
BEGIN

#FILE fscreen.work;
#FILE fstring.work;
#FILE ftopmisc.work;
#FILE ffifo.work;
#FILE ffifos.work;                         & for ..._token &
#FILE ckeys.work;                  & for cmd_enter and cmd_u4 &
#FILE ccmdcase.work;
```

SNUMBER.WORK.PD8510 THU, DEC 22, 1983, 10:49 AM PAGE 2

```
$EJECT;
BYTE    CONSTANT space        := ' ',
                 zero         := '0,
                 decpt        := '.,
                 minus        := '-,
                 backspace    := 8;
INTEGER CONSTANT sign_position := 1,
                 firstdigit   := 2;
```

SNUMBER.WORK.PD8510 THU, DEC 22, 1983, 10:49 AM PAGE 3

```
$EJECT;
INTEGER PROCEDURE get_number(token);
  VALUE token;
  INTEGER token;                                              ENTRY;
  BEGIN  & get_number &
    BOOLEAN decimal;          & TRUE if a decimal has been entered  &
    INTEGER lastch;           & location of last character in string &
    BYTE    ch;               & temporary character variable         &

    decimal  := FALSE;
    entry := clear_string(entry);
    entry := append_ch(entry, space);
    & fill new string &
    print_big_string( entry,
                      entry_size,
                      IF entry_flip_flop THEN entry_display
                                         ELSE entry2_display
                    );
    entry_flip_flop := NOT entry_flip_flop;
    & turn off old string &
    print_string( "",
                  entry_size,
                  IF entry_flip_flop THEN entry_display
                                     ELSE entry2_display
                );

    WHILE token < 0 DO    & these keys require parsing (0-9,., etc.) &
      BEGIN  & while &

        IF token <= nine_token THEN          & already know >= zero &
          BEGIN  & numeric digit &
            lastch := entry_array[0];
            IF ((entry_array[lastch] = zero) AND
                (lastch = firstdigit)) THEN
              & do not duplicate leading zeros &
              entry_array[0] := lastch - 1;
            ch := token + zero - zero_token;  & convert to ascii &
            entry := append_ch(entry, ch);
          END numeric digit

        ELSE IF ((token = decimal_token) AND (NOT decimal)) THEN
          BEGIN  & if decimal &
            decimal := TRUE;
            entry := append_ch(entry,decpt);
          END if decimal

        ELSE IF token = backspace_token THEN
          BEGIN  & if backspace &
            ch := entry_array[ entry_array[0] ];
            entry := append_ch(entry,backspace);
            IF ch = decpt THEN
              decimal := FALSE;
            IF entry_array[0] = 0 THEN
              & always leave room for sign &
              entry := append_ch(entry,space);
          END if backspace
```

SNUMBER.WORK.PD8510 THU, DEC 22, 1983, 10:49 AM PAGE 4

```
        ELSE IF token = minus_token THEN
          & accept a sign at any time (complement) &
          BEGIN  & if minus &
            IF entry_array[sign_position] = minus THEN
              entry_array[sign_position] := space
            ELSE
              entry_array[sign_position] := minus;
          END if minus

        ELSE
          & signal, but otherwise ignore multiple "."s              &
          beep(error_tone);

        & fill new string &
        print_big_string( entry,
                          entry_size,
                          IF entry_flip_flop THEN entry_display
                                             ELSE entry2_display
                        );
        entry_flip_flop := NOT entry_flip_flop;
        & turn off old string &
        print_string( "",
                      entry_size,
                      IF entry_flip_flop THEN entry_display
                                         ELSE entry2_display
                    );
        token := read_fifo( keyboard_fifo );
      END while;

    IF ((token <= cmd_u4) AND (token >= cmd_enter)) THEN
      get_number := token
    ELSE                        & abort number and return new token &
      BEGIN & else &
        & fill new string &
        print_big_string( clear_string(entry),
                          entry_size,
                          IF entry_flip_flop THEN entry_display
                                             ELSE entry2_display
                        );
        entry_flip_flop := NOT entry_flip_flop;
        & turn off old string &
        print_string( "",
                      entry_size,
                      IF entry_flip_flop THEN entry_display
                                         ELSE entry2_display
                    );
        get_number := token;
      END;  & else &

  END get_number;

END$
```

LOADMAP.WORK.PD8510 THU, DEC 22, 1983, 10:49 AM PAGE 1

LOADSORT.WORK.PD8510 THU, DEC 22, 1983, 10:51 AM PAGE

LOADSORT.WORK.PD8510 THU, DEC 22, 1983, 10:51 AM PAGE

LOADSORT.WORK.PD8510 THU, DEC 22, 1983, 10:51 AM PAGE

JOBIMBM.WORK.PD8510 THU, DEC 22, 1983, 10:51 AM PAGE 1

```
!JOB jobimbm,LIBRN.PD8510,work;PRI=CS;OUTCLASS=,1
!M68KP SxMBM.work  ,RxMBM.work  ,,15
!M68KP SIMBM.work  ,RIMBM.work  ,,15
!M68KP SIMBM0.work ,RIMBM0.work ,,15
!M68KP SIMBM2.work ,RIMBM2.work ,,15
!M68KP SIMBM3.work ,RIMBM3.work ,,15
!M68KP SIMBM4.work ,RIMBM4.work ,,15
!M68KP SIMBM5.work ,RIMBM5.work ,,15
!M68KP SIMBM6.work ,RIMBM6.work ,,15
!M68KP SIMBM8.work ,RIMBM8.work ,,15
!M68KP SIMBMA.work ,RIMBMA.work ,,15
!M68KP SIMBMC.work ,RIMBMC.work ,,15
!LINK68K OIMBM.work,,MBMMAP,13
RIMBM.work,
RIMBM0.work,
RIMBM2.work,
RIMBM3.work,
RIMBM4.work,
RIMBM5.work,
RIMBM6.work,
RIMBM8.work,
RIMBMA.work,
RIMBMC.work,
/E
ROM=8000H RAM=8000H;
IMBM:   NOLOAD;
IMBM0: MAIN=0FFEH;        &FE OR FC STARTING ADDRESS DEPEND ON IF   &
IMBM2: MAIN=11FCH;        &COMPLIER BRANCH A START OF CODE IS LONG  &
IMBM3: MAIN=12FCH;        &OR SHORT -- ENTRY POINTS SHOULD BE ON 00 &
IMBM4: MAIN=13FCH;
IMBM5: MAIN=14FEH;
IMBM6: MAIN=15FCH;
IMBM8: MAIN=17FEH;
IMBMA: MAIN=19FCH;
IMBMC: MAIN=18FCH;
!TELL JTB.PD8510 --- MBM job done
!TELL LIBRN.PD8510 --- MBM job done
```

```
JOBMON.WORK.PD8510              THU, DEC 22, 1983, 10:51 AM     PAGE   1

!JOB jobmon,LIBRN.PD8510,work ;OUTCLASS=,1;PRI=CS
!AP    casebig.work
!KP    intrpt.work
!M68KP SXTACO.work,RXTACO.work
!PURGE AMONTEMP
!BUILD AMONtemp.work;DISC=127,32,1;REC=-127,,V,ASCII
!FILE M68KDLLR=M68KDLLR.M68K.UPSOFT
!EXECUTE M68KL.M68K.UPSOFT,SMONITOR.work,amontemp.work,$NULL,15
!ED
E AMONtemp.work
/RSMB,L/
S/RSMB,L/RSMB/
/G REG 13/
S/G REG 13/G REG 12/
/BSS 8/
S/BSS 8/BSS 12/
/$RAM$,S/
S/$RAM$,S/$RAM$.L,S/
W AMONtemp.work
Q
!RSM68K AMONtemp.work,RMONITOR.work,$NULL
!LINK68K DMONITOR.work,,MONMAP,10
RMONITOR.work,
RXMBM.work,
RINTRPT.work,
RCASEBIG.work,
/E
ROM=80000H RAM=1FF70H;
!PURGE AMONtemp
!TELL jtb.PD8510       ****  MONITOR COMPLETED  *****
!TELL librn.PD8510       ****  MONITOR COMPLETED  *****
```

```
MONMAP.WORK.PD8510              THU, DEC 22, 1983, 10:51 AM     PAGE   1

M68KLDR(9.6.83)     FRI, DEC  9, 1983,  3:29 PM
 NAME   MAIN LIMITS          BASE PAGE             RAM

 monit 08000C 083E36          080000 08000C          000000 00027A
      FRI, DEC  9, 1983,  3:27 PM  LIBRN   PD8510

 xmbn  083E36 083E9A          08000C 08000C          00027A 00027A
      FRI, DEC  9, 1983,  7:13 AM  LIBRN   PD8510

 intrp 083E9A 083FD2          08000C 08000C          00027A 00027A
      FRI, DEC  9, 1983,  3:21 PM  LIBRN   PD8510

 bigca 083FD2 083FEA          08000C 08000C          00027A 00027A
      FRI, DEC  9, 1983,  3:21 PM  MAKE CALL REL and LONG

      LATEST DATE: FRI, DEC  9, 1983,  3:27 PM

      INITIAL STACK POINTER / GLOBAL REG = 01FCF6

 $RAM$       080000  ACPMPY      081D7E  ADDCP       FFF80E  ADDFP       FFF836
 ADDLF       FFF918  BBTEST      0812EE  CASE        083FD2  CHECKSUM    081CA4
 CPINV       FFF9CC  CPXMR       FFF98A  DADLF       FFF9E0  DATA_TEST   08108E
 DG1         081524  DG2         0815B0  DGInit      081F9E  DIVFP       FFF91E
 ERROR       081B6E  FPANEL      081CE8  GET         0819A8  HPIB        081424
 HPIB1       0814A4  IFCAM       FFF976  INC         081E08  KEY_TEST    080F7E
 LLDAO       FFF906  LLDA2       FFF90A  LLDMY       FFF90E  MBMTEST     08115C
 MCPDIV      FFF992  MCPMP       FFF98E  MOBDG       FFF926  MDDFR       FFF86C
 MDFR        FFF84A  MDSFR       FFF894  MINTP       FFF8D0  MPLDG       FFF942
 MPLOG       FFF8C8  MPYAV       FFF9A4  MPYDI       FFF8FA  MPYFP       FFF82E
 MPYLF       FFF914  MRLDG       FFF930  MSHFT       FFF950  MYNRM       FFF922
 MultInit1   FFF816  MultInit2   FFF81C  RAM         0818BE  RDEXP       FFF912
 REW         0806F4  Read_body   000264  Refrsh      080EC2  SERV        0819DA
 SUBCP       FFF81E  SUBFP       FFF840  SUBLF       FFF91A  TACO        0818D4
 TACObodyck  000278  TACOchecksumFFFE00  TACOcmd     FFFE04  TACOdata    FFFE06
 TACOheadck  000274  TACOstatus  FFFE04  TACOtach    FFFE02  TACOthres   FFFE00
 TIMER       081732  TINTER      0819FA  TLBL        082EB4  TPCmd       00025C
 TPError     000262  TPINT       08045A  TPIns       00025A  TPRED       0806C0
 TPWRT       080710  TPbodyck    000276  TPermun     00026A  TPfilewd    00026C
 TPheadck    000272  TPlenwd     000270  TPready     0804CA  TPrec       000268
 TPrecwd     00026E  TPstatus    000266  Tach        00025E  Wait        000260
 XFM2P       FFF8A4  XFM2Q       FFF8DA  bailout_if_k08100Cs bitflags    00002C
 init_mbm    083E38  irack       083FAE  iradr       083F2C  irclr       083F9E
 irdis       083F96  iren        083F8E  irint       083E9E  irirr       083FC2
 irrdy       083F86  irset       083FA6  mbm_misc_staFFFC00g mbm_prgm_staF9FC00
 mbm_sub_prgmFFFC00  parms_mbm   083E5E  read_boot_mb083E86  read_mbm    083E76
 set_add_mbm 083E66  status_mbm  083E6E  test_mbm    083E56  wrt_boot_mbm083E8E
 wrt_mbm     083E7E

 KSPMAX=2 NSPMAX=4 SSPMAX=1394 BSPMAX=109 ESPMAX=120 FSPMAX=4
 LSPMAX=28 XSPMAX=0
ELAPSED TIME 0:09
CPU TIME 0:01
```

```
FOUTIB.WORK.PD8510              THU, DEC 22, 1983, 10:51 AM     PAGE   1

PROCEDURE output_status;                                      EXTERNAL.L;
PROCEDURE output_block (src, src_format, dest_format);
  VALUE src,src_format,dest_format; DOUBLE src;
  INTEGER src_format, dest_format;                            EXTERNAL.L;
PROCEDURE wrt_pubib_string (string);
  VALUE string;  ALPHA string;                                EXTERNAL.L;
BOOLEAN SUBROUTINE next_xfer_ready;                           EXTERNAL.L;
BOOLEAN PROCEDURE string_out_ok (string);
  VALUE string;  ALPHA string;                                EXTERNAL.L;
PROCEDURE hpib_talker;                                        EXTERNAL.L;
```

```
SOUTIB.WORK.PD8510              THU, DEC 22, 1983, 10:51 AM  -- PAGE   1

M68KL,P,"outIB"

BEGIN

#FILE fterm.work;  & debug &
#FILE cdebug.work; & debug &
#FILE futil.work;  & remove when all output commands are implemented &
#FILE futil2.work; & will need cmessage.work if FUTIL.WORK is removed &
#FILE cids.work;
#FILE crins.work;
#FILE fcommand.work;
#FILE fkernel.work;
#FILE fkernel4.work;
#FILE ffifo.work;
#FILE ffifos.work;
#FILE fpubib.work;
#FILE fmemmgr.work;
#FILE fsize.work;
#FILE fdispran.work;
#FILE cparser.work;
#FILE coutput.work;

GLOBAL INTEGER
  outbuf_ptr,                    & output data block buffer pointer     &
  block_out_lgth;                & output data block length (# bytes)   &

GLOBAL BYTE POINTER
  outbuf;                        & output data block write srce. (talk) &

BYTE
  io_base           = %FFFFFE01,
  serial_poll_reg   = io_base+%26,
  data_out_reg      = io_base+%20;

GLOBAL BOOLEAN
  byte_avail,                    & flag to start blocking BO interrupts &
  device_clear;                  & flag indicating DVC interrupt sent   &
```

```
#EJECT;
COMMENT
$DOC+

NAME--
  string_out_ok
***********************************************************************
*
* SHORT DESCRIPTION--
*   outputs a string of ASCII bytes over public HPIB
*
* EXTENDED DESCRIPTION--
*   This routine outputs a string over public HPIB by setting the
*   byte count to be transferred (block_out_lgth) and the pointer to
*   each byte of the string to be written to the chip.  It writes the
*   first byte to the chip which, when read from the chip, enables
*   successive bytes (up to block_out_lgth bytes) to be written via the
*   interrupt routine (public_HPIB).  It then waits on the signal,
*   block_write_done, which indicates that either block_out_lgth bytes
*   were written (successful string output) or a device clear was done
*   (unsuccessful string output), and returns the status of the string
*   transfer accordingly.
*
* INPUTS--   string = output string
*
* OUTPUTS--  status of string transfer (TRUE=successful, FALSE=failed)
*
* ROUTINES CALLED--
*   wait
*   send
*
* ERROR CONDITIONS AND RECOVERY--
*
* NOTES--
*   This routine is used to output active function strings, learn
*   strings, and ASCII formatted data point values, etc.
*
* AUTHOR--
*
***********************************************************************
*
* INITIAL REFINEMENT--
*   set number of bytes to be output (block_out_lgth)
*   set byte pointer to first byte of string (outbuf_ptr)
*   write first byte of string to chip
*   if block_out_lgth > 1 then
*     wait for block_write_done signal
*     set return value of routine (successful/unsuccessful transfer)
*     if device clear then
*       send dvc_done signal to indicate string transfer aborted
*
***********************************************************************
*
* REVISION LOG--
*
***********************************************************************
```

```
DECLARATION--
;
BOOLEAN PROCEDURE string_out_ok (string);                          ENTRY;
  VALUE string;  ALPHA string;
&
$DOC-&

BEGIN
  DOUBLE str_addr=string;
  STPNTR (outbuf,str_addr);
  & get length byte of string and mask out sign extension &
  block_out_lgth := (block_out_lgth:=outbuf&0&) AND Z00FF;
  IF BO_debug THEN
  BEGIN
    WHEX(block_out_lgth); WSTR(" >"); WSTR(string); WSTR("<");
    CRLF;
  END;
  IF block_out_lgth > 0 THEN
    BEGIN
      outbuf_ptr := 1;
      IF byte_avail THEN
        data_out_reg := outbuf [1];               & write out 1st byte &
      IF block_out_lgth > 1 THEN
        BEGIN
          wait (block_write_done);
          IF device_clear THEN
            send (dvc_done);
        END;
    END;
  IF BO_debug THEN
    BEGIN WSTR("end string"); CRLF; END;
  string_out_ok := byte_avail AND NOT device_clear;
END string_out_ok;
```

```
#EJECT;
COMMENT
$DOC+

NAME--
  wrt_pubib_string
***********************************************************************
*
* SHORT DESCRIPTION-- outputs a string to HPIB
*
* EXTENDED DESCRIPTION--
*   This routine is invoked by command upon parsing a command which
*   requires a string to be written to a remote controller (via HPIB).
*   After acquiring the public HPIB resource an output flag, byte_avail,
*   is set prior to interrupts which allows successive output bytes to
*   be written to the chip.  The output string is then sent to a string
*   outputting routine which returns the status of the string transfer
*   over HPIB (TRUE = successful, FALSE = unsuccessful).
*
* INPUTS--
*   string = output string to be written to HPIB
*
* OUTPUTS--
*   output string to HPIB
*
* ROUTINES CALLED--
*   acquire
*   release
*   string_out_ok
*
* ERROR CONDITIONS AND RECOVERY--
*   The parameter, string, must include a line feed as the last
*   character, otherwise depending on the controller, the bus will
*   continually wait for the next byte to be sent.
*   An output string should not exceed ?? bytes in length.
*   A null string parameter will issue an SRQ ????
*
* NOTES--
*
* AUTHOR--
*
***********************************************************************
*
* INITIAL REFINEMENT--
*   acquire public HPIB resource
*   set flag to process byte out interrupts (byte_avail)
*   if string was output successfully then
*     reset byte_avail flag to stop processing byte out interrupts
*   release public HPIB resource
*
***********************************************************************
*
* REVISION LOG--
*
***********************************************************************
DECLARATION--
```

```
;
PROCEDURE wrt_pubib_string (string);                               ENTRY;
  VALUE string;  ALPHA string;
&
$DOC-&

BEGIN
  acquire (pubib_output);
  byte_avail := TRUE;
  string_out_ok(string);
  byte_avail := FALSE;
  release (pubib_output);
END wrt_pubib_string;
```

```
SOUTIB.WORK.PD8510          THU, DEC 22, 1983, 10:51 AM     PAGE   6

#EJECT;
COMMENT
$DOC+

NAME--
  output_ok
*************************************************************************
*
* SHORT DESCRIPTION--
*   outputs a buffer of data
*
* EXTENDED DESCRIPTION--
*   This function outputs a data buffer addressed by outbuf and
*   outbuf_ptr.  The buffer size is determined by block_out_lgth bytes.
*   It writes the first byte to the HPIB chip which initiates a series
*   of interrupts until block_out_lgth bytes from outbuf have been
*   written.  The function returns TRUE if all bytes are output success-
*   fully, and FALSE if otherwise (i.e. device clear).
*
* INPUTS--   none
*
* OUTPUTS--
*   TRUE  = all bytes transferred successfully
*   FALSE = incomplete data transfer
*
* ROUTINES CALLED--
*   wait
*   send
*
* ERROR CONDITIONS AND RECOVERY--
*
* NOTES--
*   This routine is used for high speed data transfers to HPIB.
*   The buffer (outbuf) can be an individual string, preamble data block
*   length word, postamble data block information, partial or entire
*   data blocks.
*
* AUTHOR--
*
*************************************************************************
*
* INITIAL REFINEMENT--
*   set buffer pointer (outbuf_ptr) to 0 (1st data byte)
*   write first data byte to HPIB
*   IF buffer size (block_out_lgth) > 0 THEN
*     wait until all bytes are transferred or
*     data transfer is aborted
*     IF devcie clear occured THEN
*       send signal to acknowledge the device clear
*   assign status of data buffer transfer to function result
*
*************************************************************************
*
* REVISION LOG--
*
*************************************************************************
```

```
SOUTIB.WORK.PD8510          THU, DEC 22, 1983, 10:51 AM     PAGE   7

DECLARATION--
;
BOOLEAN SUBROUTINE output_ok;
&
$DOC-&

BEGIN
  IF byte_avail THEN
  BEGIN
    outbuf_ptr := 0;                       & reset ptr for outputting buffer &
    data_out_reg := outbuf&0&;             & write 1st data byte to chip     &
    IF block_out_lgth > 0 THEN
    BEGIN
      wait (block_write_done);
      IF device_clear THEN
        send (dvc_done);
    END;
    IF BO_debug THEN
      BEGIN WHEX(block_out_lgth); WSTR(" bytes out"); CRLF; END;
  END;
  output_ok := byte_avail;
END output_ok;
```

```
SOUTIB.WORK.PD8510          THU, DEC 22, 1983, 10:51 AM     PAGE   8

#EJECT;
COMMENT
$DOC+

NAME--
  next_xfer_ready
*************************************************************************
*
* SHORT DESCRIPTION--
*
* EXTENDED DESCRIPTION--
*
* INPUTS--
*
* OUTPUTS--
*
* ROUTINES CALLED--
*
* ERROR CONDITIONS AND RECOVERY--
*
* NOTES--
*
* AUTHOR--
*
*************************************************************************
*
* INITIAL REFINEMENT--
*
*************************************************************************
*
* REVISION LOG--
*
*************************************************************************
DECLARATION--
;
BOOLEAN SUBROUTINE next_xfer_ready;                                ENTRY;
&
$DOC-&

BEGIN
  & wait for BO interrupt after last byte of last xfer &
  BO
  UNTIL (outbuf_ptr>block_out_lgth) OR
    NOT byte_avail OR device_clear;
  next_xfer_ready := byte_avail AND NOT device_clear;
  IF out_ib_debug THEN
    BEGIN
      IF NOT byte_avail OR device_clear THEN
        WSTR("abort block xfer")   ELSE
        WSTR("ready for block xfer");
      CRLF;
    END;
END next_xfer_ready;
```

```
SOUTIB.WORK.PD8510          THU, DEC 22, 1983, 10:51 AM     PAGE   9

#EJECT;
COMMENT
$DOC+

NAME--
  output_preamble
*************************************************************************
*
* SHORT DESCRIPTION--
*   Outputs data block preamble information
*
* EXTENDED DESCRIPTION--
*   This routine outputs preamble information indicating that a block of
*   data is to follow.  It contains "#A" followed by the number of bytes
*   the data block contains.  This follows the IEEE 728 standard for
*   outputting a block of data.
*
* INPUTS--
*   lgth = number of bytes of data to be output
*
* OUTPUTS--
*   TRUE  = if preamble information was successfully output over the
*           public bus and there are more than zero bytes to output
*   FALSE = if preamble information failed to be output or no bytes of
*           data are to be output
*
* ROUTINES CALLED--
*   output_ok
*   next_xfer_ready
*
* ERROR CONDITIONS AND RECOVERY--
*
* NOTES--
*   This routine should only be invoked by output routines which use the
*   IEEE 728 data block I/O protocol.  The routines which output 8510
*   internal binary format (3-word complex) or IEEE 32- or 64-bit
*   floating point format use this method of transferring data over the
*   public HP-IB.
*
* AUTHOR--
*
*************************************************************************
*
* INITIAL REFINEMENT--
*   setup 4 bytes for preamble information (preamble)
*   put "#A" in the upper 2 bytes
*   put number of data bytes in lower 4 bytes
*   set the number of bytes to be output to 4  (block_out_lgth)
*   set the data output pointer to the preamble information (outbuf_ptr)
*   set flag that indicates a block transfer   (byte_avail)
*   call routine to output preamble information
*   IF preamble information is output successully and number of data
*     data bytes to transfer > 0 THEN
*       return TRUE
*     ELSE
*       return FALSE
```

```
*
*************************************************************************
*
* REVISION LOG--
*
*************************************************************************
DECLARATION--
;
BOOLEAN PROCEDURE output_preamble(lgth); VALUE lgth; INTEGER lgth;
&
$DOC-&

BEGIN
  DOUBLE preamble;
  IF BO_debug THEN
    BEGIN
      WSTR("output lgth"); WHEX(lgth); CRLF;
    END;
  preamble := %23410000 OR lgth;          & MA (%2341) followed by lgth &
  block_out_lgth := 3;
  STPNTR (outbuf, ADRS(preamble));
  byte_avail := TRUE;
  output_preamble := IF output_ok AND (lgth > 0) THEN
                       next_xfer_ready
                     ELSE
                       FALSE;
END output_preamble;
```

```
#EJECT;
COMMENT
$DOC+

NAME--
  dump_binary
*************************************************************************
*
* SHORT DESCRIPTION--
*
* EXTENDED DESCRIPTION--
*
* INPUTS--
*
* OUTPUTS--
*
* ROUTINES CALLED--
*
* ERROR CONDITIONS AND RECOVERY--
*
* NOTES--
*
* AUTHOR--
*
*************************************************************************
*
* INITIAL REFINEMENT--
*
*************************************************************************
*
* REVISION LOG--
*
*************************************************************************
DECLARATION--
;
PROCEDURE dump_binary (src,lgth);
  VALUE src, lgth; DOUBLE src; INTEGER lgth;
&
$DOC-&

BEGIN
  STPNTR (outbuf,src);
  block_out_lgth := lgth-1;
  output_ok;
END dump_binary;
```

```
#EJECT;
COMMENT
$DOC+

NAME--
  dump_ieee
*************************************************************************
*
* SHORT DESCRIPTION--  output IEEE binary floating point format
*
* EXTENDED DESCRIPTION--
*   This routine will convert our internal binary floating point
*   representations to IEEE binary floating format, buffer the converted
*   values, and output each buffer until the requested data block has
*   been converted.  The 2 binary floating point representations that
*   can be converted to IEEE format are our 3-word complex (48 bits) and
*   our 32-bit reals.  Integer values are output as straight binary
*   2's complement format (via dump_binary).
*
*   The IEEE binary floating point format will be output in either
*   32 bits or 64 bits depending on the desired IEEE output format.
*
*   Removal of IEEE floating pt. buffer will slow the data transfer
*   rate by a factor of at least 3.
*
* INPUTS--
*   src       = address of data block to be output
*   lgth      = number of points in data block (src)
*   src_type  = internal data type of each point (i.e. 32/48-bit format)
*   dest_type= IEEE output width (i.e. 32-bit single, 64-bit double)
*
* OUTPUTS--
*   IEEE binary floating point representation of outputted data block
*
* ROUTINES CALLED--
*   dump_binary
*   output_ok
*
* ERROR CONDITIONS AND RECOVERY--
*
* NOTES--
*   IEEE (single precision) binary floating point format is as follows:
*
*        +-------------------------------------------+
*        | +/- |    exponent      |     mantissa     |
*        +-------------------------------------------+
*          31   30               23 22               0
*
*   32-bit format w/ 1-bit sign, 8-bit biased exponent, 23-bit fraction
*   whose complete value n is interpreted as follows:
*       (a) if exp=255 and mant<>0 then n=not a number
*       (b) if exp=255 and mant=0  then n=(-1)^s*(infinity)
*       (c) if 0<exp<255 then n=(-1)^s*2^(exp-127)*(1.mant)
*       (d) if exp=0 and mant<>0 then n=(-1)^s*2^(-126)*(0.mant)
*       (e) if exp=0 and f=0 then n=(-1)^s*0
*
```

```
*   IEEE (double precision) binary floating point format is as follows:
*
*        +-------------------------------------------+
*        | +/- |    exponent      |     mantissa     |
*        +-------------------------------------------+
*          63   62               52 51               0
*
*   64-bit format w/ 1-bit sign, 11-bit biased exponent, 52-bit fraction
*   whose complete value n is interpreted as follows:
*       (a) if exp=2047 and mant<>0 then n=not a number
*       (b) if exp=2047 and mant=0  then n=(-1)^s*(infinity)
*       (c) if 0<exp<2047 then n=(-1)^s*2^(exp-1023)*(1.mant)
*       (d) if exp=0 and mant<>0 then n=(-1)^s*2^(-1022)*(0.mant)
*       (e) if exp=0 and f=0 then n=(-1)^s*0
*
*   {re: COMPUTER, March 1981, pp 51-62 (IEEE journal)}
*
* AUTHOR--
*
*************************************************************************
*
* INITIAL REFINEMENT--
*
*************************************************************************
*
* REVISION LOG--
*
*************************************************************************
DECLARATION--
;
PROCEDURE dump_ieee (src,lgth,src_type,dest_type);
  VALUE src,lgth,src_type,dest_type;
  DOUBLE src; INTEGER lgth,src_type,dest_type;
&
$DOC-&

BEGIN

  INTEGER CONSTANT max_buf := 512;          & # bytes of buffer &
  INTEGER POINTER data_blk=src;
  DOUBLE data_base, data_buffer;
  DOUBLE hi_word, lo_word;
  INTEGER mantissa=lo_word+2,
          item_cnt,  & tracks the number of points converted  &
          i,         & pointer to current value in data block &
          x,         & pointer to current byte in data buffer &
          width,     & # bytes per IEEE value                 &
          i_debug,
          bias, shft, exp_copy, exponent = hi_word;
  BYTE sign_ext;
  BOOLEAN max_exp, neg_mant, buffer_ok;

  &-----------------------------------------------------------&

  SUBROUTINE decr_exp;
  BEGIN
```

```
  mantissa := LEFT (mantissa,1);
  exponent := exponent - 1;
 END decr_exp;

 &--------------------------------------------------------------&

 BOOLEAN SUBROUTINE new_format;
 BEGIN
   IF mantissa=0 THEN
     exponent := 0
   ELSE
     BEGIN
       IF (neg_mant:=(mantissa < 0)) THEN
         BEGIN
           IF mantissa = %8000 THEN      & max. neg. mantissa (-32768) &
             BEGIN                       & fix mantissa to be negated &
               mantissa := ARIGHT (mantissa,1);         & to pos. value &
               exponent := exponent + 1;             & adjust exponent &
             END;
           mantissa := -mantissa;     & negate to get positive number &
         END;
       mantissa := LEFT(mantissa,1);                  & shift out sign bit &
       IF max_exp THEN                 & fix sign/mag. mantissa format &
         mantissa := RIGHT(mantissa,1);       & for max. neg. exponent &
       WHILE NOT TBIT(mantissa,15) AND (exponent > 0) DO
         decr_exp;
       IF (exponent > 0) THEN
         decr_exp;                      & shift out implicit 1   &
       lo_word := LEFT (lo_word,shft);            & align mantissa &
       hi_word := LEFT (hi_word,shft);            & align exponent &
       IF neg_mant THEN                    & sign bit for mantissa  &
         hi_word := SBIT (hi_word, 31);
       hi_word := hi_word OR lo_word;  & combine exp. and mant. &
     END;
   data_buffer := wrt_disp_dbl (data_buffer, hi_word);
   x := x+4;
   IF dest_type = output_ieee_double THEN
     BEGIN                          & pad out precision w/ 0 &
       data_buffer := wrt_disp_dbl (data_buffer, 0);
       x := x+4;
     END;
   IF out_ib_debug THEN
     BEGIN
       FOR i_debug := i TO i+2 DO
         WHEX(data_blk[i_debug]);
       WHEX(item_cnt); WHex(hi_word,8); CRLF;
     END;
   hi_word := lo_word := 0;
   IF (item_cnt=lgth) OR (x=max_buf) THEN
     BEGIN                      & buffer full or end of data block &
       block_out_lgth := x-1;
       STPNTR (outbuf, data_base);
       new_format := output_ok;
       data_buffer := data_base;       & reset to beginning of buffer &
       x := 0;
     END
```

```
     ELSE
       new_format := TRUE;
   END new_format;

 &--------------------------------------------------------------&

 IF BO_debug THEN
   BEGIN WSTR("IEEE output"); CRLF; END;
 IF (data_base:=data_buffer:=request_memory(max_buf)) = 0 THEN
   fatal (exceeded_available_memory)
 ELSE
   BEGIN
     hi_word := lo_word :=0;
     i := x := item_cnt := 0;
     buffer_ok:=TRUE;
     IF dest_type = output_ieee_double THEN
       BEGIN
         bias := 1023;
         shft := 4;
         width:= 8;
       END
     ELSE  & output_ieee_single = 32-bit format &
       BEGIN
         bias := 127;
         shft := 7;
         width:= 4;
       END;
     IF src_type = output_from_integer THEN
       dump_binary (src,lgth)
     ELSE
     IF src_type = output_from_user3 THEN
       BEGIN
         WHILE (item_cnt < lgth) AND buffer_ok DO
         BEGIN
           exponent := (sign_ext:=data_blk[i+2]) + bias;
           IF (max_exp := (exponent < 0)) THEN
             exponent := exponent + 1;       & max ieee exponent value &
           exp_copy := exponent;
           mantissa := data_blk[i+1];   & get mantissa of real number &
           item_cnt := item_cnt + width;  & point to next real number &
           IF (buffer_ok:=new_format) THEN
             BEGIN
               exponent := exp_copy;
               mantissa := data_blk[i];       & get imag part of value &
               item_cnt := item_cnt + width;
               buffer_ok := new_format;
             END;
           i := i+3;                   & point to next 3-word complex   &
         END;
       END;
     release_memory (data_base);
   END memory request ok;

 END dump_ieee;
```

```
$EJECT;
COMMENT
$DOC+

NAME--
  dump_ascii
*****************************************************************
*
* SHORT DESCRIPTION--
*   output data block in ASCII format
*
* EXTENDED DESCRIPTION--
*   This routine will output a block of data in which each data point
*   will be output as an ASCII string (seperated by linefeeds).
*   Each data point will be individually converted to ASCII strings and
*   output to HPIB.  Complex data points will be output as a string of
*   real/imag pairs.
*
* INPUTS--
*   src      = address of data block to output
*   lgth     = number of ASCII strings being output
*   src_type = internal format of data block to convert to ASCII
*
* OUTPUTS--
*   ASCII bytes to HPIB
*
* ROUTINES CALLED--
*   next_xfer_ready
*   append_ch
*   format_3_cmpx
*   format_real
*   format_integer
*
* ERROR CONDITIONS AND RECOVERY--
*
* NOTES--
*   Strings output contain 18 characters (this includes decimal point,
*   sign, and exponent).
*
* AUTHOR--
*
*****************************************************************
*
* INITIAL REFINEMENT--
*
*****************************************************************
*
* REVISION LOG--
*
*****************************************************************
DECLARATION--
;
PROCEDURE dump_ascii (src,lgth,src_type);
  VALUE src,lgth,src_type;  DOUBLE src;  INTEGER lgth,src_type;
&
$DOC-&
```

```
BEGIN

  $FILE ffmt.work;
  $FILE fstring.work;
  INTEGER CONSTANT max_lgth := 40;
  DOUBLE CONSTANT fmt_code := %3000120A;              & str width = 18 &
  INTEGER data_ptr;
  BYTE ARRAY ascii [-1:max_lgth];
  ALPHA str_value;

  BOOLEAN SUBROUTINE string_sent;
  BEGIN
    append_ch (str_value,10);              & append LF &
    IF (byte_avail := next_xfer_ready) THEN
      string_sent := string_out_ok (str_value)
    ELSE
      string_sent := FALSE;
  END string_sent;

  IF BO_debug THEN
    BEGIN WSTR("ASCII output"); CRLF; END;
  ascii[-1] := max_lgth;
  str_value := ADRS(ascii);
  data_ptr := outbuf_ptr := 0;
  block_out_lgth := -1;
  byte_avail := TRUE;
  IF src_type = output_from_user3 THEN
  BEGIN
    USER3 POINTER data_blk = src;
    lgth := lgth*3;                           & # pts*6 = #pts*2(r/i)*3 &
    DO
      str_value:=format_3_cmpx(data_blk[data_ptr],str_value,fmt_code)
    UNTIL NOT string_sent OR ((data_ptr:=data_ptr+6) >= lgth);
  END
  ELSE
  IF src_type = output_from_integer THEN
  BEGIN
    INTEGER POINTER data_blk = src;
    DO
      str_value:=format_integer(data_blk[data_ptr],str_value,fmt_code)
    UNTIL NOT string_sent OR ((data_ptr:=data_ptr+1) >= lgth);
  END;
END dump_ascii;
```

```
#EJECT;
COMMENT
$DOC+

NAME--
  output_block
*************************************************************************
*
* SHORT DESCRIPTION--
*   outputs a block of data over HPIB to a system controller
*
* EXTENDED DESCRIPTION--
*   This routine will output a requested block of data from the 8510 to
*   a system controller over HPIB.  Data transfers will occur at a high
*   speed, approximately 100 usec/byte depending one of the following
*   output formats for each data point:
*
*     8510 internal binary data format
*       - 3-word complex (16-bit imag, 16-bit real, 16-bit exponent)
*       - 32-bit floating pointing point
*       - 16-bit integer
*     IEEE floating point binary (converted from 8510 internal format)
*       - 32-bit format (8-bit exponent, 15-bit mantissa sign/mag)
*       - 64-bit format (11-bit exponent, 52-bit mantissa sign/mag)
*     ASCII (converted from 8510 internal format)
*
*   The first word output will be a length containing the number of
*   bytes being output. For example, 1206 bytes for a 201-pt. complex
*   data block output in binary format, or 3216 bytes for a 210-pt.
*   complex data block output in IEEE 64-bit floating point format.
*
*   A postamble is output depending on the requested output block format
*   indicated by the user command (i.e. CRC, checksum at end of block).
*
* INPUTS--
*   src          = address of data block to output
*   lgth         = number of bytes in data block
*   src_format   = internal format of each data point
*   dest_format  = output format of each data point
*
* OUTPUTS--
*   causes data to be output to HPIB
*
* ROUTINES CALLED--
*   acquire
*   release
*   output_preamble
*   output_postamble
*   dump_binary
*   dump_ascii
*   dump_ieee
*
* ERROR CONDITIONS AND RECOVERY--
*
* NOTES--
*   ASCII block transfers contain 18 characters per data point (real,
```

```
*   integer, quad) and 37 characters per real/imag data point.
*
* AUTHOR--
*
*************************************************************************
*
* INITIAL REFINEMENT--
*   acquire public HPIB resource
*   compute length word depending on desired output format
*   output length word (sets HPIB "block mode" output flag, BYTE_AVAIL)
*   output data block depending on desired output format
*   IF output format specifies a postamble THEN
*     output postamble information at end of data transfer
*   clear HPIB "block mode" output flag, BYTE_AVAIL
*   release public HPIB resource
*
*************************************************************************
*
* REVISION LOG--
*
*************************************************************************
DECLARATION--
;
PROCEDURE output_block (src, src_format, dest_format);
  VALUE src,src_format,dest_format; DOUBLE src;
  INTEGER src_format, dest_format;                              ENTRY;
&
$DOC-&

BEGIN
  INTEGER item_cnt;
  acquire (pubib_output);
  IF dest_format = output_binary THEN
    item_cnt := array_size
  ELSE
    BEGIN
      item_cnt := number_of_points;
      IF src_format = output_from_user3 THEN
        item_cnt := 2*item_cnt;
    END;
  IF dest_format = output_ieee_single THEN
    item_cnt := ALEFT(item_cnt,2)    & #pts * 4 = IEEE 32-bit complex &
  ELSE
  IF dest_format = output_ieee_double THEN
    item_cnt := ALEFT(item_cnt,3);   & #pts * 8 = IEEE 64-bit complex &

  IF BO_debug THEN
    BEGIN WSTR("output addr = "); WHex(src,8); CRLF; END;

  IF dest_format = output_ascii THEN    & do not output block preamble &
    dump_ascii (src, item_cnt, src_format)
  ELSE
  IF output_preamble (item_cnt) THEN
  BEGIN
    IF dest_format = output_binary THEN
      dump_binary (src, item_cnt)
```

```
    ELSE   & IEEE format &
      dump_ieee (src, item_cnt, src_format, dest_format)
  END;
  byte_avail := FALSE;
  IF BO_debug THEN
  BEGIN
    WSTR("end output"); CRLF;
  END;
  release (pubib_output);
END output_block;
```

```
#EJECT;
COMMENT
$DOC+

NAME--
  output_status
*************************************************************************
*
* SHORT DESCRIPTION--
*   outputs status word over public HPIB
*
* EXTENDED DESCRIPTION--
*   This routine outputs the status word (primary status byte and
*   extended status byte) to the controller.  It then clears the status
*   word (serial_poll_status) and clears the chip's serial poll register
*   as if a serial poll had been done.  This allows the user to service
*   an SRQ either by a serial poll or outputting the status word.
*   However, a serial poll will only clear the primary status byte of
*   the status word (MSByte) and leave the extended status byte alone.
*
*   A reserve status word which may contain any current status after
*   an SRQ has been asserted but not serviced will be copied into the
*   actual status word and issue any pending SRQ's found in that
*   reserved status.
*
* INPUTS--    none
*
* OUTPUTS--   public HPIB status word
*
* ROUTINES CALLED--
*   acquire
*   release
*   output_ok
*   set_serial_poll
*
* ERROR CONDITIONS AND RECOVERY--
*
* NOTES--
*
* AUTHOR--
*
*************************************************************************
*
* INITIAL REFINEMENT--
*   acquire public HPIB resource
*   output status word
*   clear status word and HPIB status register
*   IF reserve status word has bits set THEN
*     copy reserve status word into actual status word
*     and issue any applicable SRQ's (via SET_SERIAL_POLL)
*
*************************************************************************
*
* REVISION LOG--
*   July 18/83 - Output status as 2 byte values in ASCII form seperated
*                by a comma:  EX --> 1457 (base 10) = "005,177"<LF>
```

```
*               Output status string in the following order:
*               "<status byte>,<extended status byte>"
*
**************************************************************************
DECLARATION--
;
PROCEDURE output_status;                                          ENTRY;
&
$DOC-&

BEGIN
  BYTE POINTER status_ptr;
  BYTE ARRAY   status_array [0:8];
  ALPHA        status_string;
  INTEGER      status_part;
  acquire (pubib_output);
  STPNTR  (status_ptr, ADRS(serial_poll_status));
  status_string := ADRS(status_array);
  status_array[0] := 8;     & length byte &
  status_array[4] := ',';   & seperator &
  status_array[8] := 10;    & line feed &
  status_part := INTEGER(status_ptr&0&) AND %00FF; & LSByte, mask extn &
  status_array[1] := (status_part/100) + 48;
  status_array[2] := ((status_part MOD 100)/10) + 48;
  status_array[3] := (status_part MOD 10) + 48;
  status_part := INTEGER(status_ptr[1]) AND %00FF; & MSByte, mask extn &
  status_array[5] := (status_part/100) + 48;
  status_array[6] := ((status_part MOD 100)/10) + 48;
  status_array[7] := (status_part MOD 10) + 48;
  IF spoll_debug THEN
    BEGIN
      WSTR("DS=");
      WSTR(status_string);
      WHEX(serial_poll_status);
      CRLF;
    END;
  byte_avail := TRUE;
  string_out_ok (status_string);
  serial_poll_status := serial_poll_reg := 0;       & clear status word &
  byte_avail := FALSE;
  release (pubib_output);
  IF serial_poll_ext <> 0 THEN
    set_serial_poll (0);                       & get new status, if any &
END output_status;
```

```
#EJECT;
COMMENT
$DOC+

NAME--
  output_tape
**************************************************************************
*
* SHORT DESCRIPTION--
*
* EXTENDED DESCRIPTION--
*
* INPUTS--
*
* OUTPUTS--
*
* ROUTINES CALLED--
*
* ERROR CONDITIONS AND RECOVERY--
*
* NOTES--
*
* AUTHOR--
*
**************************************************************************
*
* INITIAL REFINEMENT--
*
**************************************************************************
*
* REVISION LOG--
*
**************************************************************************
DECLARATION--
;
PROCEDURE output_tape (file_type, file_id);
  VALUE file_type, file_id;  INTEGER file_type, file_id;          ENTRY;
&
$DOC-&

BEGIN
  #FILE ftpngr.work;
  INTEGER CONSTANT record_sz := 256;
  acquire (pubib_output);
  release (pubib_output);
END output_tape;
```

```
#EJECT;
COMMENT
$DOC+

NAME--
  hpib_talker
**************************************************************************
*
* SHORT DESCRIPTION--
*
* EXTENDED DESCRIPTION--
*
* INPUTS--
*
* OUTPUTS--
*
* ROUTINES CALLED--
*
* ERROR CONDITIONS AND RECOVERY--
*
* NOTES--
*
* AUTHOR--
*
**************************************************************************
*
* INITIAL REFINEMENT--
*
**************************************************************************
*
* REVISION LOG--
*
**************************************************************************
DECLARATION--
;
PROCEDURE hpib_talker;                                            ENTRY;
&
$DOC-&

BEGIN
  byte_avail := FALSE;
  signal_init (block_read_done,0);
  signal_init (hpib_byte_out,0);
  signal_init (dvc_done,0);
  resource_init (pubib_output);

 loop:
    wait(hpib_byte_out);
    IF BO_debug THEN
      BEGIN WSTR("write FIFO hpib_tlk"); CRLF; END;
    write_fifo (public_ib_fifo, hpib_tlk);
  GO TO loop;

 END hpib_talker;
```

```
END$


* OLD VERSION OF OUTPUT_STATUS ---
*   output integer value in 2 bytes
*
*PROCEDURE output_status;                                          ENTRY;
*BEGIN
*  acquire (pubib_output);
*  IF spoll_debug THEN
*    BEGIN WSTR("output status"); WHEX(serial_poll_status); CRLF; END;
*  STPNTR (outbuf, ADRS(serial_poll_status));
*  block_out_lgth := 1;
*  byte_avail := TRUE;
*  output_ok;
*  serial_poll_status := serial_poll_reg := 0;      & clear status word &
*  byte_avail := FALSE;
*  release (pubib_output);
*  IF serial_poll_ext <> 0 THEN
*    set_serial_poll (0);                     & get new status, if any &
*END output_status;
```

```
FOUTIB2.WORK.PD8510          THU, DEC 22, 1983, 10:51 AM     PAGE   1

EXTERNAL INTEGER
  outbuf_ptr.L,                     & output data block buffer pointer    &
  block_out_lgth.L;                 & output data block length (# bytes)  &
EXTERNAL BYTE POINTER
  outbuf.L;                         & output data block write srce. (talk) &
EXTERNAL BOOLEAN
  byte_avail.L,
  device_clear.L;
```

```
COUTPUT.WORK.PD8510          THU, DEC 22, 1983, 10:52 AM     PAGE   1

COMMENT
  Constants must correspond to cases in SOUTPUT.
;
INTEGER CONSTANT  no_output              :=   0,    & output_selection &
                  active_output          :=   1,
                  status_output          :=   2,
                  formatted_output       :=   3,
                  data_output            :=   4,
                  raw1_output            :=   5,
                  raw2_output            :=   6,
                  raw3_output            :=   7,
                  raw4_output            :=   8,
                  memory_output          :=   9,
                  error_output           :=  10,
                  plot_output            :=  11,
                  id_output              :=  12,
                  DG_p1p2_output         :=  13,
                  marker_output          :=  14,
                  cal_coeff1_output      :=  15,
                  cal_coeff2_output      :=  16,
                  cal_coeff3_output      :=  17,
                  cal_coeff4_output      :=  18,
                  cal_coeff5_output      :=  19,
                  cal_coeff6_output      :=  20,
                  cal_coeff7_output      :=  21,
                  cal_coeff8_output      :=  22,
                  cal_coeff9_output      :=  23,
                  cal_coeff10_output     :=  24,
                  cal_coeff11_output     :=  25,
                  cal_coeff12_output     :=  26,
                  key_output             :=  27;

INTEGER CONSTANT  no_input               :=   0,    & input_selection  &
                  formatted_input        :=   1,
                  data_input             :=   2,
                  raw1_input             :=   3,
                  raw2_input             :=   4,
                  raw3_input             :=   5,
                  raw4_input             :=   6,
                  memory_input           :=   7,
                  plot_input             :=   8,
                  cal_coeff1_input       :=   9,
                  cal_coeff2_input       :=  10,
                  cal_coeff3_input       :=  11,
                  cal_coeff4_input       :=  12,
                  cal_coeff5_input       :=  13,
                  cal_coeff6_input       :=  14,
                  cal_coeff7_input       :=  15,
                  cal_coeff8_input       :=  16,
                  cal_coeff9_input       :=  17,
                  cal_coeff10_input      :=  18,
                  cal_coeff11_input      :=  19,
                  cal_coeff12_input      :=  20;

INTEGER CONSTANT  output_binary          :=   0,       & output_type &
```

```
COUTPUT.WORK.PD8510          THU, DEC 22, 1983, 10:52 AM     PAGE   2

                  output_ieee_single     :=   1,
                  output_ieee_double     :=   2,
                  output_ascii           :=   3;
INTEGER CONSTANT  output_from_integer    :=   1,    & source of data &
                  output_from_real       :=   2,
                  output_from_user3      :=   3,
                  output_from_quad       :=   4;
```

```
FOUTPUT.WORK.PD8510          THU, DEC 22, 1983, 10:52 AM     PAGE   1

#FILE coutput.work;

PROCEDURE  block_output( address );
  VALUE    address;
  DOUBLE   address;                                          EXTERNAL.L;
PROCEDURE  null_block_output;                                EXTERNAL.L;
PROCEDURE  pub_ib_output_select( selection );
  VALUE    selection;
  INTEGER  selection;                                        EXTERNAL.L;
PROCEDURE  pub_ib_format_select( type );
  VALUE    type;
  INTEGER  type;                                             EXTERNAL.L;
SUBROUTINE pub_ib_output;                                    EXTERNAL.L;
PROCEDURE  pub_ib_input_select( selection );
  VALUE    selection;
  INTEGER  selection;                                        EXTERNAL.L;
SUBROUTINE pub_ib_input;                                     EXTERNAL.L;
```

```
SOUTPUT.WORK.PD8510            THU, DEC 22, 1983, 10:52 AM     PAGE   1


M68KL,P,"output"
BEGIN

#FILE coutput.work;
#FILE factive2.work;
#FILE cmsgib.work;
#FILE futil3.work;
#FILE futil2.work;
#FILE cchtable.work;
#FILE fchtable.work;
#FILE fchdata.work;
#FILE fcontvar.work;
#FILE foutib.work;
#FILE fpubib.work;
#FILE fplotter.work;
#FILE fscreen.work;                              & for entry_array &
#FILE fkernel.work;                                     & for send &
#FILE crins.work;    & for entry_string_ready and block_input_complete &
#FILE fcontrol.work;                              & for abort_sweep &
#FILE ctrace0.work;                       & for update_f and update_d &
#FILE ftrace0.work;                                  & for partial &
#FILE fatables.work;                            & for format_table &
#FILE fmarker.work;                            & for mkr_amplitude &
#FILE fstring.work;
#FILE ffmt.work;                                 & for format_real &
#FILE ftopkbd.work;                                & for key_token &
#FILE fcal.work;                              & for cal_array_addr &


INTEGER CONSTANT string_size       := 64;

INTEGER CONSTANT bytes_per_complex :=  6,
                 bytes_per_display :=  4;

INTEGER  output_selection,
         prior_output_selection,
         input_selection,
         transfer_type;
```

```
SOUTPUT.WORK.PD8510            THU, DEC 22, 1983, 10:52 AM     PAGE   2

#EJECT;
COMMENT                                                        init_output
**************************************************************************
*
**************************************************************************
;
SUBROUTINE init_output;                                             ENTRY;
   BEGIN & init_output &
     prior_output_selection := output_selection := no_output;
     transfer_type     := output_binary;
     input_selection   := no_input;
   END;  & init_output &
```

```
SOUTPUT.WORK.PD8510            THU, DEC 22, 1983, 10:52 AM     PAGE   3

#EJECT;
COMMENT                                                       block_output
**************************************************************************
*
**************************************************************************
;
PROCEDURE  block_output( address );
   VALUE   address;
   DOUBLE  address;                                                 ENTRY;
   BEGIN & block_output  &

      output_block( address,
                    output_from_user3,
                    transfer_type
                  );

   END;  & block_output  &
```

```
SOUTPUT.WORK.PD8510            THU, DEC 22, 1983, 10:52 AM  -  PAGE   4

#EJECT;
COMMENT                                                  null_block_output
**************************************************************************
*
**************************************************************************
;
PROCEDURE  null_block_output;                                       ENTRY;
   BEGIN & null_block_output  &

   END;  & null_block_output  &
```

```
SOUTPUT.WORK.PD8510              THU, DEC 22, 1983, 10:52 AM      PAGE   5

#EJECT;
COMMENT                                                         array_output
****************************************************************************
*
****************************************************************************
;
PROCEDURE  array_output( source );
   VALUE   source;
   INTEGER source;
   BEGIN & array_output  &

      block_output( entry_ch_double( source ) );

   END;  & array_output  &
```

```
SOUTPUT.WORK.PD8510              THU, DEC 22, 1983, 10:52 AM      PAGE   6

#EJECT;
COMMENT                                                   output_marker_value
****************************************************************************
*
****************************************************************************
;
PROCEDURE  output_marker_value;
   BEGIN & output_marker_value &
      BYTE ARRAY output_array[-1:string_size];
      ALPHA      output_string;

      & initialize string &
      output_string := ADRS( output_array );
      output_string := init_string( output_string, string_size );

      wrt_pubib_string( append_string( format_3_cmpx( mkr_value,
                                                       output_string,
                                                       format_table[
                                                           output_format
                                                                   ]
                                                     ),
                                       newline
                                     )
                      );

   END;  & output_marker_value &
```

```
SOUTPUT.WORK.PD8510              THU, DEC 22, 1983, 10:52 AM      PAGE   7

#EJECT;
COMMENT                                                           output_key
****************************************************************************
*
****************************************************************************
;
PROCEDURE  output_key;
   BEGIN & output_key &
      BYTE ARRAY output_array[-1:string_size];
      ALPHA      output_string;

      & initialize string &
      output_string := ADRS( output_array );
      output_string := init_string( output_string, string_size );
      wrt_pubib_string( append_ch( format_integer(
                                       key_token,
                                       output_string,
                                       format_table[output_integer_format]
                                                 ),
                                   newline
                                 )
                      );
   END;  & output_key &
```

```
SOUTPUT.WORK.PD8510              THU, DEC 22, 1983, 10:52 AM      PAGE   8

#EJECT;
COMMENT                                                           output_raw
****************************************************************************
*
****************************************************************************
;
PROCEDURE  output_raw( array_number );
   VALUE   array_number;
   INTEGER array_number;
   BEGIN & output_raw  &
      INTEGER param_index,
              array_count;

      array_count := 0;
      param_index := first_acquisition_param;

      WHILE ( ( param_index <= last_acquisition_param ) AND
              ( array_count <> array_number )
            ) DO
         BEGIN & while &
            IF TBIT( ch[param_index], current_entry_ch - 1 ) THEN
               array_count := array_count + 1;
            param_index := param_index + 1;
         END;  & while &

      IF array_count = array_number THEN
         block_output( raw_base[param_index-1] )
      ELSE
         BEGIN & else &
            warn( array_unavailable );
            null_block_output;
         END;  & else &

   END;  & output_raw  &
```

```
SOUTPUT.WORK.PD8510              THU, DEC 22, 1983, 10:52 AM     PAGE   9

#EJECT;
COMMENT                                                      output_cal_coeff
*************************************************************************
*
*************************************************************************
;
PROCEDURE  output_cal_coeff( array_number );
   VALUE   array_number;
   INTEGER array_number;
   BEGIN & output_cal_coeff  &
      DOUBLE block_address;

      IF ( block_address := cal_array_addr(array_number - 1) ) <> 0 THEN
         block_output( block_address )
      ELSE
         BEGIN & else &
            warn( array_unavailable );
            null_block_output;
         END;  & else &

   END;  & output_cal_coeff  &
```

```
SOUTPUT.WORK.PD8510              THU, DEC 22, 1983, 10:52 AM     PAGE  10

#EJECT;
COMMENT                                                 pub_ib_output_select
*************************************************************************
*
*************************************************************************
;
PROCEDURE  pub_ib_output_select( selection );
   VALUE   selection;
   INTEGER selection;                                                ENTRY;
   BEGIN & pub_ib_output_select &
      prior_output_selection := output_selection;
      input_selection  := no_input;
      output_selection := selection;
   END;  & pub_ib_output_select &
```

```
SOUTPUT.WORK.PD8510              THU, DEC 22, 1983, 10:52 AM     PAGE  11

#EJECT;
COMMENT                                                 pub_ib_format_select
*************************************************************************
*
*************************************************************************
;
PROCEDURE  pub_ib_format_select( type );
   VALUE   type;
   INTEGER type;                                                     ENTRY;
   BEGIN & pub_ib_format_select &
      transfer_type := type;
   END;  & pub_ib_format_select &
```

```
SOUTPUT.WORK.PD8510              THU, DEC 22, 1983, 10:52 AM     PAGE  12

#EJECT;
COMMENT                                                        pub_ib_output
*************************************************************************
*
*************************************************************************
;                                                                    ENTRY;
SUBROUTINE pub_ib_output;
   BEGIN & pub_ib_output &
      COMMENT
         Cases must correspond to constants declared in COUTPUT.

      ;
      CASE output_selection OF
         BEGIN & case &
&  0 &         warn( no_output_selection );
&  1 &         output_active;
&  2 &         output_status;
&  3 &         array_output( ch_f_base );
&  4 &         array_output( ch_d_base );
&  5 &         output_raw(1);
&  6 &         output_raw(2);
&  7 &         output_raw(3);
&  8 &         output_raw(4);
&  9 &         array_output( ch_m_base );
& 10 &         output_error;
& 11 &         output_plot;
& 12 &         output_identifier;
& 13 &         BEGIN                         & OP for DG pass thru output    &
                 urt_pubib_string ("0,0,4095,4095 ");
                 output_selection := prior_output_selection;
               END;
& 14 &         output_marker_value;
& 15 &         output_cal_coeff( 1 );
& 16 &         output_cal_coeff( 2 );
& 17 &         output_cal_coeff( 3 );
& 18 &         output_cal_coeff( 4 );
& 19 &         output_cal_coeff( 5 );
& 20 &         output_cal_coeff( 6 );
& 21 &         output_cal_coeff( 7 );
& 22 &         output_cal_coeff( 8 );
& 23 &         output_cal_coeff( 9 );
& 24 &         output_cal_coeff( 10 );
& 25 &         output_cal_coeff( 11 );
& 26 &         output_cal_coeff( 12 );
& 27 &         output_key;
            END   & case &
      ELSE
            fatal( no_output_selection );

      output_selection := no_output;        & reset selection once done &

   END;  & pub_ib_output &
```

```
SOUTPUT.WORK.PD8510          THU, DEC 22, 1983, 10:52 AM     PAGE  13

#EJECT;
COMMENT                                                          block_input
**************************************************************************
*
**************************************************************************
;
PROCEDURE  block_input( address, update );
   VALUE   address, update;
   DOUBLE  address;
   INTEGER update;
   BEGIN & block_input &
      INTEGER hpib_size;
      BYTE    hpib_size_msb = hpib_size,
              hpib_size_lsb = hpib_size + 1;

& entry &
      & get block size sent from controller &
      hpib_size_msb := entry_array[1];
      hpib_size_lsb := entry_array[2];

      abort_sweep;
      IF NOT( input_block( address,
                           hpib_size,
                           output_from_user3,
                           transfer_type
                         )
            ) THEN
         warn( block_input_error )                  & transfer failure &
      ELSE
         partial( update );

   END;  & block_input &
```

```
SOUTPUT.WORK.PD8510          THU, DEC 22, 1983, 10:52 AM     PAGE  14

#EJECT;
COMMENT                                                          array_input
**************************************************************************
*
**************************************************************************
;
PROCEDURE  array_input( destination, update );
   VALUE   destination, update;
   INTEGER destination, update;
   BEGIN & array_input &

      block_input( entry_ch_double(destination), update );

   END;  & array_input &
```

```
SOUTPUT.WORK.PD8510          THU, DEC 22, 1983, 10:52 AM     PAGE  15

#EJECT;
COMMENT                                                            input_raw
**************************************************************************
*
**************************************************************************
;
PROCEDURE  input_raw( array_number );
   VALUE   array_number;
   INTEGER array_number;
   BEGIN & input_raw  &
      INTEGER param_index,
              array_count;

      array_count := 0;
      param_index := first_acquisition_param;

      WHILE ( ( param_index <= last_acquisition_param ) AND
              ( array_count <> array_number )
            ) DO
         BEGIN & while &
            IF TBIT( ch[param_index], current_entry_ch - 1 ) THEN
               array_count := array_count + 1;
            param_index := param_index + 1;
         END;  & while &

      IF array_count = array_number THEN
         block_input( raw_base[param_index-1], update_raw_array )
      ELSE
         warn( array_unavailable );

   END;  & input_raw  &
```

```
SOUTPUT.WORK.PD8510          THU, DEC 22, 1983, 10:52 AM     PAGE  16

#EJECT;
COMMENT                                                       input_cal_coeff
**************************************************************************
*
**************************************************************************
;
PROCEDURE  input_cal_coeff( array_number );
   VALUE   array_number;
   INTEGER array_number;
   BEGIN & input_cal_coeff  &
   END;  & input_cal_coeff  &
```

SOUTPUT.WORK.PD8510 THU, DEC 22, 1983, 10:52 AM PAGE 17

```
#EJECT;
COMMENT                                                  pub_ib_input_select
*****************************************************************************
*
*****************************************************************************
;
PROCEDURE  pub_ib_input_select( selection );
   VALUE   selection;
   INTEGER selection;                                                 ENTRY;
   BEGIN & pub_ib_input_select &
      output_selection := no_output;
      input_selection := selection;
   END;  & pub_ib_input_select &
```

SOUTPUT.WORK.PD8510 THU, DEC 22, 1983, 10:52 AM PAGE 18

```
#EJECT;
COMMENT                                                         pub_ib_input
*****************************************************************************
*
*****************************************************************************
;
SUBROUTINE pub_ib_input;                                              ENTRY;
   BEGIN & pub_ib_input &
      COMMENT
         Cases must correspond to constants declared in COUTPUT.
      ;
      CASE input_selection OF
         BEGIN & case &
&  0 &      warn( no_input_selection );
&  1 &      array_input( ch_f_base, update_f );
&  2 &      array_input( ch_d_base, update_d );
&  3 &      input_raw( 1 );
&  4 &      input_raw( 2 );
&  5 &      input_raw( 3 );
&  6 &      input_raw( 4 );
&  7 &      ; & input_memory; &
&  8 &      ; & input_plot; &
&  9 &      input_cal_coeff( 1 );
& 10 &      input_cal_coeff( 2 );
& 11 &      input_cal_coeff( 3 );
& 12 &      input_cal_coeff( 4 );
& 13 &      input_cal_coeff( 5 );
& 14 &      input_cal_coeff( 6 );
& 15 &      input_cal_coeff( 7 );
& 16 &      input_cal_coeff( 8 );
& 17 &      input_cal_coeff( 9 );
& 18 &      input_cal_coeff( 10 );
& 19 &      input_cal_coeff( 11 );
& 20 &      input_cal_coeff( 12 );
         END   & case &
      ELSE
         fatal( no_input_selection );

      input_selection := no_input;           & reset selection once done &
      send( entry_string_ready );            & so parser can resume      &

   END;  & pub_ib_input &

END$
```

FPARAM.WORK.PD8510 THU, DEC 22, 1983, 10:52 AM PAGE 1

```
PROCEDURE  new_parameter(new_param);
   VALUE   new_param;
   INTEGER new_param;                                            EXTERNAL.L;
```

SPARAM.WORK.PD8510 THU, DEC 22, 1983, 10:52 AM PAGE 1

```
M68KL,P,"param"
BEGIN

#FILE cmenu.work;
#FILE cparams.work;
#FILE ccndcase.work;
#FILE fcommand.work;                                 & for command_token &
#FILE fchtable.work;
#FILE cchtable.work;
#FILE fcontvar.work;                                       & for rebuild &
#FILE fcontv2.work;
#FILE fcontrol.work;
#FILE fannot.work;
#FILE fkernel.work;
#FILE crins.work;
#FILE cdatap.work;       & for max_format -- must come before fchpfr. &
#FILE ftrace0.work;
#FILE fpfr.work;
#FILE fchpfr.work;
#FILE fmenu.work;
#FILE cyadc.work;              & for parameter redefinition constants &
#FILE futil.work;              & for warn and command_not_inplimented &
#FILE fcal0.work;                        & for param_correction_change &
#FILE ftestset.work;                            & for redefine_test_set &

PROCEDURE  new_format_partial;                                 EXTERNAL;
```

```
SPARAM.WORK.PD8510            THU, DEC 22, 1983, 10:52 AM      PAGE   2

#EJECT;
COMMENT                                                       new_parameter
*************************************************************************
*
*************************************************************************
;
PROCEDURE  new_parameter(new_param);
   VALUE   new_param;
   INTEGER new_param;                                           ENTRY;
   BEGIN & new_parameter &
      IF new_param <> entry_ch_integer(ch_param) THEN
         BEGIN & if &
            & This test keeps cal from hilighting keys in the cal menu &
            IF new_param > s22 THEN
               hilight_on( cmd_user1, cmd_user4)
            ELSE
               hilight_off( cmd_user1, cmd_user4);
            abort_sweep;
            acquire( control_variables );
            set_entry_ch_integer( new_param, ch_param );
            annotate_parameter;
            recall_pfr;
            rebuild := TRUE;
            new_format_partial;                  & updates pfr values &
            release( control_variables );
            param_correction_change( new_param ); & correction change? &
            restart_sweep;
         END;  & if &
   END;  & new_parameter &
```

```
CPARAMS.WORK.PD8510            THU, DEC 22, 1983, 10:52 AM      PAGE   1

INTEGER CONSTANT

cmd_user1 := 83,
cmd_user2 := 84,
cmd_user3 := 85,
cmd_user4 := 86,
cmd_redefine_param := 87,
cmd_label_parameter := 93,
cmd_redefine_done := 94,
cmd_convert_off := 118,
cmd_convert_recip := 119,
cmd_convert_to_z := 120,
cmd_convert_to_y := 121,
cmd_group5 := 0;
```

```
SPARAM.WORK.PD8510            THU, DEC 22, 1983, 10:52 AM      PAGE   3

#EJECT;
COMMENT                                                     redefine_param
*************************************************************************
*
*  Redefines the currently selected parameter descriptor to the
*  specified value.
*
*************************************************************************
;
PROCEDURE  redefine_param( redef_descriptor, descriptor_value );
   VALUE   redef_descriptor, descriptor_value;
   INTEGER redef_descriptor, descriptor_value;
   BEGIN & redefine_param &

      abort_sweep;
      acquire( control_variables );

      parameter_descriptor[ entry_ch_integer( ch_param ),
                            redef_descriptor
                          ] := descriptor_value;

      IF redef_descriptor = parameter_conversion THEN
         set_entry_ch_integer( descriptor_value, ch_param_conversion );
      redefine_test_set;
      rebuild := TRUE;                            & port def's may change &
      partial(update_proc_vars);

      release( control_variables );
      restart_sweep;
      pop_menu( REDEF_MENU );

   END;  & redefine_param &


#FILE fparams.work;

END$
```

```
FPARAMS.WORK.PD8510            THU, DEC 22, 1983, 10:52 AM      PAGE   1

COMMENT
  This is a software generated file !!!
  Changes must be made in SKINFO.WORK
  Run GENSK.LAWI to re-generate file;

SUBROUTINE proc5;  ENTRY;
BEGIN

CASE command_token-83 OF
BEGIN
& 83 &
new_parameter( user1 );
& 84 &
new_parameter( user2 );
& 85 &
new_parameter( user3 );
& 86 &
new_parameter( user4 );
& 87 &
BEGIN END;
& 88 &
BEGIN END;
& 89 &
BEGIN END;
& 90 &
BEGIN END;
& 91 &
BEGIN END;
& 92 &
BEGIN END;
& 93 &
warn( command_not_implemented );
& 94 &
pop_menu( PARAM_MENU );
& 95 &
redefine_param( driven_port, driven_a1 );
& 96 &
redefine_param( driven_port, driven_a2 );
& 97 &
redefine_param( driven_port, driven_none );
& 98 &
redefine_param( phase_lock_port, lock_to_a1 );
& 99 &
redefine_param( phase_lock_port, lock_to_a2 );
& 100 &
redefine_param( phase_lock_port, lock_donot_care );
& 101 &
redefine_param( numerator_port, num_b1 );
& 102 &
redefine_param( numerator_port, num_b2 );
& 103 &
redefine_param( numerator_port, num_a1 );
& 104 &
redefine_param( numerator_port, num_a2 );
& 105 &
```

```
BEGIN END;
& 106 &
redefine_param( numerator_port, num_100khz_cal );
& 107 &
redefine_param( numerator_port, num_ref_100khz_cal );
& 108 &
redefine_param( numerator_port, num_detector_gnd );
& 109 &
redefine_param( numerator_port, num_adc_gnd );
& 110 &
redefine_param( numerator_port, num_vcal );
& 111 &
redefine_param( numerator_port, num_vref );
& 112 &
redefine_param( numerator_port, num_temp1 );
& 113 &
redefine_param( numerator_port, num_temp2 );
& 114 &
redefine_param( denominator_port, denom_a1 );
& 115 &
redefine_param( denominator_port, denom_a2 );
& 116 &
redefine_param( denominator_port, denom_b1 );
& 117 &
redefine_param( denominator_port, denom_no_ratio );
& 118 &
redefine_param( parameter_conversion, conv_off );
& 119 &
redefine_param( parameter_conversion, conv_reciprocal );
& 120 &
redefine_param( parameter_conversion, conv_s_to_z );
& 121 &
redefine_param( parameter_conversion, conv_s_to_y );
END;
END proc5;
```

```
SUBROUTINE list_op_params;                    EXTERNAL.L;
SUBROUTINE list_sys_params;                   EXTERNAL.L;
SUBROUTINE next_op_param;                     EXTERNAL.L;
SUBROUTINE list_op_param_page;                EXTERNAL.L;
PROCEDURE list_trace_values;                  EXTERNAL.L;
```

```
M68KL,P, "parmtbl"

BEGIN

#FILE fterm.work;  &DEBUG&
#FILE cdebug.work;
#FILE cmsgplot.work;
#FILE futil3.work;
#FILE factive.work;
#FILE factive2.work;
#FILE facttbl.work;
#FILE fstimuli.work;
#FILE fdisplay.work;
#FILE cscreen.work;
#FILE cchtable.work;
#FILE fchtable.work;
#FILE fchtab2.work;
#FILE fchdata.work;
#FILE fchdata2.work;
#FILE cdomain.work;
#FILE fstring.work;
#FILE ffmt.work;
#FILE fsize.work;
#FILE fcommand.work;       & for command_token value &
#FILE cplot.work;
#FILE fplotter.work;
#FILE fprivib.work;
#FILE fprivib2.work;       & for get_priv_ib_lun() &
#FILE ftpmgr2.work;        & for directory_on (alternate display) &
#FILE falphas.work;        & for printing data trace list header  &
#FILE cprtdata.work;       & "     "     "    "    "    "         &

INTEGER CONSTANT
  parm_display    := 0,
  parm_printer    := 1,
  x               := 2,
  x1              := 27,
  x2              := 42,
  string_size     := 25,
  short_string    := 8,
  long_string     := 50;

ALPHA param_line,                          & parameter description &
      ch1_line, ch2_line,                  & channel 1,2 values    &
      meas_unit1, meas_unit2,              & units of measurement  &
      col_string;

DOUBLE param_fmt1,                  & numerical display format for ch 1 &
       param_fmt2;                  & numerical display format for ch 2 &

BYTE ARRAY str0 [-1:string_size];
BYTE ARRAY str1 [-1:string_size];
BYTE ARRAY str2 [-1:long_string];
BYTE ARRAY mu1 [-1:short_string];
BYTE ARRAY mu2 [-1:short_string];
```

```
BYTE ARRAY col_info [-1:string_size];

INTEGER dg_parms,                   & display memory pointer &
        parm_output,           & parameter output destination &
        channel,               & index to channel table values &
        y_pos;              & y row position for listing params &

BOOLEAN op_param1;           & page switching for op. parameters &
```

```
SPARMTBL.WORK.PD8510            THU, DEC 22, 1983, 10:52 AM     PAGE  3

$EJECT;
COMMENT
$DOC+

NAME--                                              output_print_string
************************************************************************
*
* SHORT DESCRIPTION--
*   print a string to an HP-IB printer
*
* EXTENDED DESCRIPTION--
*   This routine is a utility function that prints a given string to
*   an HP-IB printer and tabs a computed number of spaces to the next
*   column (to achieve columnar format).  The number of spaces is based
*   on the difference between the length of the given string and the
*   given column width (which includes the string's characters).
*   Trailing blanks are printed from the last character of the given
*   string and the column width.
*
*   A column width with a value less the given string's length will not
*   print trailing blanks.
*
* INPUTS--
*   string = string to be printed
*   column = number of spaces to tab from the beginning of the string
*
* OUTPUTS--
*   printed string
*
* ROUTINES CALLED--
*   wrt_priv_ib
*   append_ch
*
* ERROR CONDITIONS AND RECOVERY--
*   none
*
* NOTES--
*
* AUTHOR--
*
************************************************************************
*
* INITIAL REFINEMENT--
*   send given string to be printed on the printer
*   replace ohm symbol with "ohms" and degree symbol with "deg."
*   compute number of trailing blanks to print after string
*   IF number of trailing blanks > 0 THEN
*     print number of trailing blanks computed
*
************************************************************************
*
* REVISION LOG--
*   Nov 14-83 -- Added a check for special symbolic characters used as
*                terminators, specifically ohms and degrees, and
*                replaced them with spelled out words for printing
*                purposes.
```

```
SPARMTBL.WORK.PD8510            THU, DEC 22, 1983, 10:52 AM     PAGE  4

*
************************************************************************
$DOC-;
PROCEDURE output_print_string (string, column);
  VALUE string, column; ALPHA string; INTEGER column;
BEGIN
  DOUBLE str_addr = string;
  BYTE POINTER str_ptr;
  BYTE special_ch;
  INTEGER i, blanks;
  STPNTR (str_ptr, str_addr);
  IF ((i := str_ptr[str_ptr]) AND %OFF) = omega THEN
    BEGIN
      str_ptr := str_ptr-1;
      append_string (string, "ohms");
    END
  ELSE
  IF (i AND %OFF) = degree THEN
    BEGIN
      str_ptr := str_ptr-1;
      append_string (string, "deg.");
    END;
  col_info[0] := 0;
  wrt_priv_ib (printer, no_fun, string);
  IF (blanks := column - str_ptr&0&) > 0 THEN
    BEGIN
      FOR i := 1 TO blanks DO
        append_ch (col_string, blank_char);
      wrt_priv_ib (printer,no_fun,col_string);  & space to next column &
    END;
END output_print_string;
```

```
SPARMTBL.WORK.PD8510            THU, DEC 22, 1983, 10:52 AM     PAGE  5

$EJECT;
COMMENT
$DOC+

NAME--
************************************************************************
*
* SHORT DESCRIPTION--
*
* EXTENDED DESCRIPTION--
*
* INPUTS--
*
* OUTPUTS--
*
* ROUTINES CALLED--
*
* ERROR CONDITIONS AND RECOVERY--
*
* NOTES--
*
* AUTHOR--
*
************************************************************************
*
* INITIAL REFINEMENT--
*
************************************************************************
*
* REVISION LOG--
*
************************************************************************
$DOC-;
SUBROUTINE print_CRLF;
  wrt_priv_ib (printer, no_fun, cr+" ");
```

```
SPARMTBL.WORK.PD8510            THU, DEC 22, 1983, 10:52 AM     PAGE  6

$EJECT;
COMMENT
$DOC+

NAME--
************************************************************************
*
* SHORT DESCRIPTION--
*
* EXTENDED DESCRIPTION--
*
* INPUTS--
*
* OUTPUTS--
*
* ROUTINES CALLED--
*
* ERROR CONDITIONS AND RECOVERY--
*
* NOTES--
*
* AUTHOR--
*
************************************************************************
*
* INITIAL REFINEMENT--
*
************************************************************************
*
* REVISION LOG--
*
************************************************************************
$DOC-;
SUBROUTINE formfeed;
BEGIN
  & assumes col_string is pointing to ADRS(col_info) &
  col_info [0] := 1;
  col_info [1] := 12;     & form feed &
  wrt_priv_ib (printer, no_fun, col_string);
END formfeed;
```

```
SPARMTBL.WORK.PD8510          THU, DEC 22, 1983, 10:52 AM      PAGE   7

#EJECT;
COMMENT
$DOC+

NAME--
**************************************************************************
*
* SHORT DESCRIPTION--
*
* EXTENDED DESCRIPTION--
*
* INPUTS--
*
* OUTPUTS--
*
* ROUTINES CALLED--
*
* ERROR CONDITIONS AND RECOVERY--
*
* NOTES--
*
* AUTHOR--
*
**************************************************************************
*
* INITIAL REFINEMENT--
*
**************************************************************************
*
* REVISION LOG--
*
**************************************************************************
DECLARATION--
;
SUBROUTINE skip_line;
&
$DOC-&

BEGIN
  IF parm_output = parm_printer THEN
    REPEAT 2 DO print_CRLF
  ELSE
    y_pos := y_pos + 1
END skip_line;
```

```
SPARMTBL.WORK.PD8510          THU, DEC 22, 1983, 10:52 AM      PAGE   8

#EJECT;
COMMENT
$DOC+.

NAME--
**************************************************************************
*
* SHORT DESCRIPTION--
*
* EXTENDED DESCRIPTION--
*
* INPUTS--
*
* OUTPUTS--
*
* ROUTINES CALLED--
*
* ERROR CONDITIONS AND RECOVERY--
*
* NOTES--
*
* AUTHOR--
*
**************************************************************************
*
* INITIAL REFINEMENT--
*
**************************************************************************
*
* REVISION LOG--
*
**************************************************************************
$DOC-;
SUBROUTINE print_params;
BEGIN
  output_print_string (" ", short_string);                & indentation &
  output_print_string (param_line, string_size);
  output_print_string (ch1_line, string_size-10);
  output_print_string (ch2_line, 0);
END print_params;
```

```
SPARMTBL.WORK.PD8510          THU, DEC 22, 1983, 10:52 AM      PAGE   9

#EJECT;
COMMENT
$DOC+

NAME--
  disp_param
**************************************************************************
*
* SHORT DESCRIPTION--
*   outputs parameter lines to display
*
* EXTENDED DESCRIPTION--
*   This routine puts the newly computed parameter line in display
*   memory.  A parameter line consists of a parameter description and
*   its channel 1 and channel 2 values.  This information is displayed
*   in 3 columns, therefore constant x vectors are used to position
*   each part of the parameter line.
*
* INPUTS--
*
* OUTPUTS--
*
* ROUTINES CALLED--
*
* ERROR CONDITIONS AND RECOVERY--
*
* NOTES--
*
* AUTHOR--
*
**************************************************************************
*
* INITIAL REFINEMENT--
*
**************************************************************************
*
* REVISION LOG--
*
**************************************************************************
DECLARATION--
;
SUBROUTINE disp_param;
&
$DOC-&

BEGIN
  dg_parms := movech (dg_parms, y_pos, x);
  dg_parms := lb (dg_parms, param_line);
  dg_parms := movech (dg_parms, y_pos, x1);
  dg_parms := lb (dg_parms, ch1_line);
  dg_parms := movech (dg_parms, y_pos, x2);
  dg_parms := lb (dg_parms, ch2_line);
END disp_param;
```

```
SPARMTBL.WORK.PD8510          THU, DEC 22, 1983, 10:52 AM      PAGE  10

#EJECT;
COMMENT
$DOC+

NAME--
  setup_param_lines
**************************************************************************
*
* SHORT DESCRIPTION--
*   get parameter description string and its measurement suffix
*
* EXTENDED DESCRIPTION--
*   This routine initializes the parameter description string and the
*   measurement suffix string.  The parameter description is indexed
*   from an externally defined table.  The measurement suffix is
*   returned from an externally defined function.
*   The channel table index for that parameter is also assigned to a
*   global variable to be used by proceeding routines that are called
*   to extract the channel 1 and 2 values from the channel table.
*
* INPUTS--
*   index = active function constant value used as:
*              1) parameter for external routine that returns measure-
*                 ment suffices
*              2) an index to an external table of parameter description
*                 strings
*              3) an index to an external table of channel table indices
*
* OUTPUTS-- none
*
* ROUTINES CALLED--
*   get_active
*   get_ch_table_index
*   append_string
*   append_term
*
* ERROR CONDITIONS AND RECOVERY--
*   none
*
* NOTES--
*   A plot string terminator is appended to the measurement suffix
*   for outputs to the plotter.
*
* AUTHOR--
*
**************************************************************************
*
* INITIAL REFINEMENT--
*   get parameter description string
*   get parameter measurment suffix string
*   get parameter channel table index
*
**************************************************************************
*
* REVISION LOG--
*
```

```
***********************************************************************
DECLARATION--
;
PROCEDURE setup_param_lines (index); VALUE index; INTEGER index;
&
$DOC-&

BEGIN
  str0[0] := str1[0] := str2[0] := mu1[0] := mu2[0] := 0;
  channel    := get_active( get_chtable_index, index );
  param_fmt1 := ch_active_format (index,ch1);
  param_fmt2 := ch_active_format (index,ch2);
  append_string (param_line, active_function_label[index]);
  append_string (meas_unit1, ch_active_suffix(index,ch1));
  append_string (meas_unit2, ch_active_suffix(index,ch2));
END setup_param_lines;
```

```
#EJECT;
COMMENT
$DOC+

NAME--
  output_param_lines
***********************************************************************
*
* SHORT DESCRIPTION--
*   output parameter line to appropriate output destination
*
* EXTENDED DESCRIPTION--
*   This routine appends the appropriate measurement unit (suffix) to
*   parameter string values for channel 1 and 2, and then outputs these
*   strings to the selected output destination (display, printer,
*   plotter).
*
* INPUTS--  none
*
* OUTPUTS-- none
*
* ROUTINES CALLED--
*   plot_params
*   disp_params
*
* ERROR CONDITIONS AND RECOVERY--
*   none
*
* NOTES--
*   Measurement suffices are extracted from an externally defined
*   table in which some suffices are nothing more than null strings.
*
* AUTHOR--
*
***********************************************************************
*
* INITIAL REFINEMENT--
*   append measurement suffix to channel 1 string value
*   append measurement suffix to channel 2 string value
*   output strings to selected destinaton
*
***********************************************************************
*
* REVISION LOG--
*
***********************************************************************
DECLARATION--
;
SUBROUTINE output_param_lines;
&
$DOC-&

BEGIN
  IF NOT abort_command THEN
    BEGIN
      append_string (ch1_line, meas_unit1);
```

```
      append_string (ch2_line, meas_unit2);
      IF parm_output = parm_printer THEN
        print_params
      ELSE
        disp_param;
      skip_line;
    END;
END output_param_lines;
```

```
#EJECT;
COMMENT
$DOC+

NAME--
***********************************************************************
*
* SHORT DESCRIPTION--
*
* EXTENDED DESCRIPTION--
*
* INPUTS--
*
* OUTPUTS--
*
* ROUTINES CALLED--
*
* ERROR CONDITIONS AND RECOVERY--
*
* NOTES--
*
* AUTHOR--
*
***********************************************************************
*
* INITIAL REFINEMENT--
*
***********************************************************************
*
* REVISION LOG--
*
***********************************************************************
$DOC-;
SUBROUTINE init_strings;
BEGIN
  str0[-1]:=str1[-1]:=col_info[-1]:=string_size;
  mu1[-1]:=mu2[-1]:=short_string;
  str2  [-1] := long_string;
  str0[0] := str1[0] := str2[0] := mu1[0] := mu2[0] := col_info[0] := 0;
  param_line := ADRS (str0);
  ch1_line   := ADRS (str1);
  ch2_line   := ADRS (str2);
  meas_unit1 := ADRS (mu1);
  meas_unit2 := ADRS (mu2);
  col_string := ADRS (col_info);
END init_strings;
```

```
#EJECT;
COMMENT
$DOC+

NAME--
  disp_header
*************************************************************************
*
* SHORT DESCRIPTION--
*   initializes parameter strings and header listing information
*
* EXTENDED DESCRIPTION--
*   This routine sets up the parameter strings used to output to the
*   display or plotter/printer and outputs the header information which
*   indicates the type of parameter listing (operating or system) and
*   headers for corresponding channel 1 and channel 2 information.
*   A flag indicating the output destination is set depending on the
*   last command token processed.  This identifies whether to output to
*   the plotter, printer, or display.
*   Y coordinate vectors are also initialized and will be modified for
*   each line that is output.  X coordinate vectors are constants since
*   the list is columnarized.
*
*   Set up for display output consists of turning off the regular
*   display and initializing the display memory buffer that is to be
*   filled with parameter strings and displayed.
*
*   Set up for plotting output consists of sending scaled absolute
*   plotting vectors 0,0 to the plotter followed by a command to plot
*   text.  Scaling and character size are set up in a routine that is
*   3 levels up.
*
*   Example of header:
*
*      OPERATING PARAMETERS          Channel 1          Channel 2
*
* INPUTS--
*   head_line  = a string containing the parameter list type:
*                "OPERATING" or "SYSTEM"
*
* OUTPUTS-- none
*
* ROUTINES CALLED--
*   append_string
*   append_term
*   jmp
*   lb
*   select_active_function
*   skip_line
*   output_param_lines
*
* ERROR CONDITIONS AND RECOVERY--
*   none
*
* NOTES--
*
```

```
* AUTHOR--
*
*************************************************************************
*
* INITIAL REFINEMENT--
*   initialize parameter output strings
*   determine output device and output appropriate header information
*
*************************************************************************
*
* REVISION LOG--
*
*************************************************************************
DECLARATION--
;
PROCEDURE disp_header (head_line); VALUE head_line; ALPHA head_line;
&
$DOC-&

BEGIN
  init_strings;
  param_line := append_string (param_line, head_line);
  ch1_line   := append_string (ch1_line, "Ch 1");
  ch2_line   := append_string (ch2_line, "Ch 2");
  IF command_token = cmd_print_params THEN
    BEGIN
      parm_output := parm_printer;
      REPEAT 4 DO skip_line;
    END
  ELSE
    BEGIN
      parm_output := parm_display;
      y_pos := 8;
      IF NOT directory_on THEN
        BEGIN
          directory_on := TRUE;
          select_active_function (active_off);
          jmp (jump_all, end_position);
        END;
      dg_parms := lb (text_display, " ");
      IF plot_debug THEN
        WHEX(dg_parms);
    END;
  output_param_lines;
  skip_line; skip_line;
END disp_header;
```

```
#EJECT;
COMMENT
$DOC+

NAME--
  end_param_list
*************************************************************************
*
* SHORT DESCRIPTION--
*   concludes parameter listing
*
* EXTENDED DESCRIPTION--
*   This routine is used to end a list of parameters being displayed or
*   plotted/printed.  A jump to the end of the display buffer is added
*   to end a display listing and plot commands to store the pen is sent
*   at the end of a plot.
*
* INPUTS--  none
*
* OUTPUTS-- none
*
* ROUTINES CALLED--
*   wrt_priv_ib
*   jmp
*
* ERROR CONDITIONS AND RECOVERY--
*   none
*
* NOTES--
*
* AUTHOR--
*
*************************************************************************
*
* INITIAL REFINEMENT--
*   IF ending a plot THEN send plot command to store pen
*   IF ending a display THEN insert a "jmp" to the end of display in
*     display memory
*   IF ending a print THEN ????
*
*************************************************************************
*
* REVISION LOG--
*
*************************************************************************
DECLARATION--
;
SUBROUTINE end_param_list;
&
$DOC-&

BEGIN
  IF parm_output = parm_display THEN
    BEGIN
      dg_parms := jmp (dg_parms, entry_aux_position);
      IF abort_command THEN
```

```
        COMMENT warn (print_aborted);
    END
  ELSE
    formfeed;
END end_param_list;
```

```
%EJECT;
COMMENT
$DOC+

NAME--
  real_param
*******************************************************************************
*
* SHORT DESCRIPTION--
*
* EXTENDED DESCRIPTION--
*
* INPUTS--
*
* OUTPUTS--
*
* ROUTINES CALLED--
*
* ERROR CONDITIONS AND RECOVERY--
*
* NOTES--
*
* AUTHOR--
*
*******************************************************************************
*
* INITIAL REFINEMENT--
*
*******************************************************************************
*
* REVISION LOG--
*
*******************************************************************************
DECLARATION--
;
PROCEDURE real_param (index); VALUE index; INTEGER index;
&
$DOC-&

BEGIN
  setup_param_lines (index);
  ch1_line := format_real (ch_real (channel,1), ch1_line, param_fmt1);
  ch2_line := format_real (ch_real (channel,2), ch2_line, param_fmt2);
  output_param_lines;
END real_param;
```

```
%EJECT;
COMMENT
$DOC+

NAME--
  quad_param
*******************************************************************************
*
* SHORT DESCRIPTION--
*
* EXTENDED DESCRIPTION--
*
* INPUTS--
*
* OUTPUTS--
*
* ROUTINES CALLED--
*
* ERROR CONDITIONS AND RECOVERY--
*
* NOTES--
*
* AUTHOR--
*
*******************************************************************************
*
* INITIAL REFINEMENT--
*
*******************************************************************************
*
* REVISION LOG--
*
*******************************************************************************
DECLARATION--
;
PROCEDURE quad_param (index); VALUE index; INTEGER index;
&
$DOC-&

BEGIN
  setup_param_lines (index);
  ch1_line := format_quad (ch_quad (channel,1), ch1_line, param_fmt1);
  ch2_line := format_quad (ch_quad (channel,2), ch2_line, param_fmt2);
  output_param_lines;
END quad_param;
```

```
%EJECT;
COMMENT
$DOC+

NAME--
  dual_param
*******************************************************************************
*
* SHORT DESCRIPTION--
*
* EXTENDED DESCRIPTION--
*
* INPUTS--
*
* OUTPUTS--
*
* ROUTINES CALLED--
*
* ERROR CONDITIONS AND RECOVERY--
*
* NOTES--
*
* AUTHOR--
*
*******************************************************************************
*
* INITIAL REFINEMENT--
*
*******************************************************************************
*
* REVISION LOG--
*
*******************************************************************************
DECLARATION--
;
PROCEDURE dual_param (active_index, ch_mode, ch_index);
  VALUE active_index, ch_mode, ch_index;
  INTEGER active_index, ch_mode, ch_index;
&
$DOC-&

BEGIN
  BOOLEAN real_param_value;

  SUBROUTINE no_meas_unit;
    mu1[0] := mu2[0] := 0;

  real_param_value := (ch_mode=ch_smoothing_mode) OR
                      (ch_mode=ch_power_slope_mode);
  setup_param_lines (active_index);
  IF ch_integer (ch_mode, 1) = 0 THEN
    BEGIN
      no_meas_unit;
      append_string (ch1_line, "OFF")
    END
  ELSE
```

```
    IF real_param_value THEN
      ch1_line := format_real (ch_real(ch_index,1),ch1_line,param_fmt1)
    ELSE
      ch1_line := format_integer (ch_integer(ch_index,1),
                                  ch1_line, param_fmt1);
  IF ch_integer (ch_mode, 2) = 0 THEN
    BEGIN
      no_meas_unit;
      append_string (ch2_line, "OFF")
    END
  ELSE
    IF real_param_value THEN
      ch2_line := format_real (ch_real(ch_index,2),ch2_line,param_fmt2)
    ELSE
      ch2_line := format_integer (ch_integer(ch_index,2),
                                  ch2_line, param_fmt2);
  output_param_lines;
END dual_param;
```

```
#EJECT;
COMMENT
$DOC+

NAME--
  indep_param
*************************************************************************
*
* SHORT DESCRIPTION--
*   handles parameters that are channel independent
*
* EXTENDED DESCRIPTION--
*
* INPUTS--
*
* OUTPUTS--
*
* ROUTINES CALLED--
*
* ERROR CONDITIONS AND RECOVERY--
*
* NOTES--
*
* AUTHOR--
*
*************************************************************************
*
* INITIAL REFINEMENT--
*
*************************************************************************
*
* REVISION LOG--
*
*************************************************************************
DECLARATION--
;
PROCEDURE indep_param (index, value);
  VALUE index, value;  INTEGER index, value;
&
$DOC-&

BEGIN
  setup_param_lines (index);
  ch1_line := format_integer (value, ch1_line, param_fmt1);
  MOVE str2 := str1, +(str1+1);
  output_param_lines;
END indep_param;
```

```
#EJECT;
COMMENT
$DOC+

NAME--
  addr_param
*************************************************************************
*
* SHORT DESCRIPTION--
*   handles HP-IB addresses
*
* EXTENDED DESCRIPTION--
*
* INPUTS--
*
* OUTPUTS--
*
* ROUTINES CALLED--
*
* ERROR CONDITIONS AND RECOVERY--
*
* NOTES--
*
* AUTHOR--
*
*************************************************************************
*
* INITIAL REFINEMENT--
*
*************************************************************************
*
* REVISION LOG--
*
*************************************************************************
DECLARATION--
;
PROCEDURE addr_param (index, addr, addr2);
  VALUE index, addr, addr2;  INTEGER index, addr, addr2;
&
$DOC-&

BEGIN
  setup_param_lines (index);
  ch1_line := format_integer (get_priv_ib_lun(addr),
                              ch1_line, param_fmt1);
  ch2_line := format_integer (get_priv_ib_lun(addr2),
                              ch2_line, param_fmt1);
  output_param_lines;
END addr_param;
```

```
#EJECT;
COMMENT
$DOC+

NAME--
*************************************************************************
*
* SHORT DESCRIPTION--
*
* EXTENDED DESCRIPTION--
*
* INPUTS--
*
* OUTPUTS--
*
* ROUTINES CALLED--
*
* ERROR CONDITIONS AND RECOVERY--
*
* NOTES--
*
* AUTHOR--
*
*************************************************************************
*
* INITIAL REFINEMENT--
*
*************************************************************************
*
* REVISION LOG--
*
*************************************************************************
$DOC-;
SUBROUTINE list_op_param2;
BEGIN
  disp_header ("OPERATING PARAM.");
  quad_param (active_gate_start);
  quad_param (active_gate_stop);
  skip_line;
  real_param (active_phase_offset);
  real_param (active_magnitude_slope);
  real_param (active_magnitude_offset);
  real_param (active_stimulus_slope);
  real_param (active_stimulus_offset);
  skip_line;
  real_param (active_ref_plane_1);
  real_param (active_ref_plane_2);
  skip_line;
  real_param (active_system_z0);
  end_param_list;
  IF plot_debug THEN
    BEGIN WHEX(dg_parms); WSTR(" <<< op parm 2"); CRLF; END;
END list_op_param2;
```

```
#EJECT;
COMMENT
$DOC+

NAME--
  list_op_params
*************************************************************************
*
* SHORT DESCRIPTION--
*   lists operating parameters to display, printer, or plotter
*
* EXTENDED DESCRIPTION--
*   This routine constists of a series of calls to format and list
*   the operating parameters on the display or to a plotter or printer.
*   It is invoked by either the softkey which corresponds to displaying
*   the operating parameters or the softkeys which correspond to
*   printing or plotting the operating parameters.
*
*   Operating parameters consist of meaurement information that is
*   not annotated on the display:
*        marker values 1-5
*        sweep time
*        power level
*        electrical length
*        averaging factor
*        smoothing aperture
*        ...and anthing else that will fit
*
* INPUTS-- none
*
* OUTPUTS-- none
*
* ROUTINES CALLED--
*   skip_line
*   real_param
*   quad_param
*   indep_param
*
* ERROR CONDITIONS AND RECOVERY--
*   none
*
* NOTES--
*
* AUTHOR--
*
*************************************************************************
*
* INITIAL REFINEMENT--
*   call routine to display header
*   call various routines to format and output parameters
*
*************************************************************************
*
* REVISION LOG--
*
*************************************************************************
```

```
DECLARATION--
;
SUBROUTINE list_op_params;                                    ENTRY;
&
$DOC-&

BEGIN
  op_param1 := TRUE;
  disp_header ("OPERATING PARAM.");
  real_param (active_sweep_time);
  real_param (active_source_power);
  real_param (active_electrical_length);
  dual_param (active_power_slope,ch_power_slope_mode,ch_power_slope);
  dual_param (active_if_avg_factor,ch_average_mode,ch_average_factor);
  dual_param (active_smoothing_aperture,ch_smoothing_mode,
              ch_smoothing_aperture);
  skip_line;
  real_param (active_atten_port1);
  real_param (active_atten_port2);
  skip_line;
  quad_param (active_marker1);
  quad_param (active_marker2);
  quad_param (active_marker3);
  quad_param (active_marker4);
  quad_param (active_marker5);
  end_param_list;
  IF plot_debug THEN
   BEGIN WHEX(dg_parms); WSTR(" <<<op parm 1"); CRLF; END;
END list_op_params;
```

```
#EJECT;
SUBROUTINE list_op_param_page;                                ENTRY;
BEGIN
  IF op_param1 THEN
    list_op_params
  ELSE
    list_op_param2;
END list_op_param_page;

SUBROUTINE next_op_param;                                     ENTRY;
BEGIN
  op_param1 := NOT op_param1;
  list_op_param_page;
END next_op_param;
```

```
#EJECT;
COMMENT
$DOC+

NAME--
  list_sys_params
************************************************************************
*
* SHORT DESCRIPTION--
*   lists system parameters to display, printer, or plotter
*
* EXTENDED DESCRIPTION--
*   This routine constists of a series of calls to format and list
*   the system parameters on the display or to a plotter or printer.
*   It is invoked by either the softkey which corresponds to displaying
*   the systems parameters or the softkeys which correspond to  printing
*   or plotting the system parameters.
*
*   System parameters consist of general 8510 system information:
*       major HPIB address
*       minor HPIB address
*       test set address
*       source address
*       plotter address
*       primary SRQ mask
*       secondary SRQ mask
*
* INPUTS-- none
*
* OUTPUTS-- none
*
* ROUTINES CALLED--
*   disp_header
*   skip_line
*   end_param_list
*   addr_param
*   indep_param
*
* ERROR CONDITIONS AND RECOVERY--
*   none
*
* NOTES--
*
* AUTHOR--
************************************************************************
*
* INITIAL REFINEMENT--
*   call routine to display header
*   call various routines to format and output parameters
*
************************************************************************
*
* REVISION LOG--
*
************************************************************************
```

```
DECLARATION--
;
SUBROUTINE list_sys_params;                                   ENTRY;
&
$DOC-&

BEGIN
  disp_header ("SYSTEM PARAM.");
  addr_param (active_8510_hpib_addr, major, major);
  addr_param (active_system_bus_hpib_addr, minor, minor);
  addr_param (active_source_hpib_addr, source, source_2);
  addr_param (active_testset_hpib_addr, test_set, test_set_2);
  addr_param (active_plotter_hpib_addr, plotter, plotter);
  addr_param (active_printer_hpib_addr, printer, printer);
  addr_param (active_ch_cmd_hpib_addr, user_device_1, user_device_2);
  addr_param (active_pass_thru_hpib_addr, priv_ib_pass, priv_ib_pass);
  skip_line;
  indep_param (active_srq_mask_primary, srq_mask_primary);
  indep_param (active_srq_mask_secondary, srq_mask_secondary);
  end_param_list;
  IF plot_debug THEN
   BEGIN WHEX(dg_parms); WSTR(" <<< sys parm"); CRLF; END;
END list_sys_params;
```

SPARMTBL.WORK.PD8510 THU, DEC 22, 1983, 10:52 AM PAGE 31

```
$EJECT;
COMMENT
$DOC+

NAME--                                               list_trace_values
*************************************************************************
*
* SHORT DESCRIPTION--
*   lists values and frequencies at each data-point of trace
*
* EXTENDED DESCRIPTION--
*   This routine lists the values and frequencies at each data point
*   of the trace in the currently active channel to an HP-IB printer.
*   The number of points listed corresponds to the current number of
*   points.  The listing is formatted as follows:
*
*   header line -->  NO.     FREQUENCY (units)       REAL,IMAG (units)
*
*   list of pts -->   n       f                       real, imag
*
*   The first column lists the number for each point 0..n (n=50,100,200)
*   The second column lists, depending on the domain, the frequency,
*   time, or auxiliary component.  The third column lists the value of
*   each point, seperated into its imaginary and real components.
*   Formats without imaginary values print a value of zero.
*
*   The format of each value printed is in a fixed floating point format
*   with a signed exponent and 2 significant digits to the left of the
*   decimal and 10 digits to the right.
*
*   The measurement units are defined at the header line in terms of
*   Hz, Units, dB, Sec, Volts, and other applicable standard units.
*
* INPUTS--
*   none
*
* OUTPUTS--
*   hardcopy list of trace values
*
* ROUTINES CALLED--
*   append_string
*   entry_ch_integer
*   entry_ch_double
*   active_suffix
*   format_integer
*   format_quad
*   format_3cmpx
*   print_CRLF
*   formfeed
*
* ERROR CONDITIONS AND RECOVERY--
*   The domain status of the trace is checked thru calling
*   entry_ch_integer.  No range checking is done to verify that the
*   domain status is within indexing range into the domain string table
*   which generates the appropriate header string.
*   The correct description must be added in the input file IALPHAS
```

SPARMTBL.WORK.PD8510 THU, DEC 22, 1983, 10:52 AM PAGE 32

```
*   under @prtdata and correspondingly in the domain string table in
*   order to accomodate another domain string.
*
* NOTES--
*
* AUTHOR--
*
*************************************************************************
*
* INITIAL REFINEMENT--
*   initialize strings and data trace pointers
*   get address of the data trace
*   get header information and measurement units for frequencies and
*     amplitudes
*   print header information
*   FOR the current number of points
*     format and print the frequency and amplitude (real,imag)
*
*************************************************************************
*
* REVISION LOG--
*
*************************************************************************
$DOC-;
PROCEDURE list_trace_values;                                     ENTRY;
BEGIN
  INTEGER data_pt, i;
  DOUBLE  data_addr;
  USER3 POINTER data_blk=data_addr;
  DOUBLE CONSTANT
    int_fmt  := %01000000,
    data_fmt := %3000120A;                & 18 char fixed sci. notat. &
  INTEGER TABLE domain_str :=              & correpsonds to cdomain.work &
    & freq_domain &  print_freq,
    & time_domain &  print_time,
    & TDR         &  print_time,
    & aux_domain  &  print_aux;

  SUBROUTINE print_line;
  BEGIN
    output_print_string (param_line, 8);
    output_print_string (ch1_line, 28);
    output_print_string (ch2_line, 0);
    print_CRLF;
  END print_line;

  init_strings;
  data_addr  := entry_ch_double (ch_f_base);
  data_pt    := 0;
  append_string (param_line, "NO.");
  append_string (ch1_line, ADRS(byte_list) +
                     domain_str [entry_ch_integer (ch_domain)]);
  append_string (ch1_line, active_suffix (active_start));
  append_ch     (ch1_line, ')');
  append_string (ch2_line, "  REAL, IMAG (");
  append_string (ch2_line, active_suffix (active_ref_value));
```

SPARMTBL.WORK.PD8510 THU, DEC 22, 1983, 10:52 AM PAGE 33

```
  append_ch     (ch2_line, ')');
  print_line;  print_CRLF;
  FOR i := 0 STEP step_size UNTIL 800 DO
    BEGIN
      param_line := format_integer (data_pt/6, str0, int_fmt);
      ch1_line := format_quad(entry_stimulus_at_point(i),str1,data_fmt);
      ch2_line := format_3_cmpx (data_blk[data_pt], str2, data_fmt);
      data_pt := data_pt + 6;             & next 3 word complex value &
      print_line;
    END;
  formfeed;
END list_trace_values;

END$
```

CPARSER.WORK.PD8510 THU, DEC 22, 1983, 10:52 AM PAGE 1

```
INTEGER CONSTANT  hpib_eoi := %0100,        & hpib end (eoi)          &
                  hpib_dcl := %0101,        & hpib device clear (dcl)&
                  hpib_tlk := %0102,        & hpib ready for output  &
                  hpib_pass_thru := %3F00;  & command pass thru      &
```

```
FPARSER.WORK.PD8510            THU, DEC 22, 1983, 10:53 AM     PAGE   1

SUBROUTINE init_public_ib_fifo;                                EXTERNAL.L;
PROCEDURE parser;                                              EXTERNAL.L;
```

```
SPARSER.WORK.PD8510            THU, DEC 22, 1983, 10:53 AM     PAGE   2

BOOLEAN    syntax_error;                                       & DEBUG &


SUBROUTINE init_public_ib_fifo;                                   ENTRY;
   BEGIN & init_public_ib_fifo &
      FOR debug_string_index := 0 UNTIL max_debug_string DO    & DEBUG &
         debug_string[ debug_string_index ] := ' ;             & DEBUG &
      debug_string_index := 0;                                 & DEBUG &
      debug_string_alpha := ADRS( debug_string_print );        & DEBUG &
      debug_string_print[0] := max_debug_string + 1;           & DEBUG &
      init_fifo( public_ib_fifo,
                 public_ib_fifo_size,
                 pub_ib_fifo,
                 pub_ib_fifo_not_full,
                 pub_ib_fifo_not_empty
               );
   END;  & init_public_ib_fifo &
                                                               & DEBUG &
                                                               & DEBUG &
                                                               & DEBUG &
PROCEDURE  enter_debug( char );                                & DEBUG &
   VALUE   char;                                               & DEBUG &
   BYTE    char;                                               & DEBUG &
   BEGIN & enter_debug &                                       & DEBUG &
      INTEGER i;                                               & DEBUG &
                                                               & DEBUG &
      IF NOT syntax_error THEN                                 & DEBUG &
         BEGIN & if not syntax error &                         & DEBUG &
            IF char < '  THEN                                  & DEBUG &
               char := ' ;                                     & DEBUG &
            debug_string[ debug_string_index ] := char;        & DEBUG &
            debug_string_index := (debug_string_index + 1) AND & DEBUG &
                                  max_debug_string;            & DEBUG &
            FOR i := 0 UNTIL max_debug_string DO               & DEBUG &
               debug_string_print[i+1] := debug_string[        & DEBUG &
                  (debug_string_index+i) AND max_debug_string  & DEBUG &
                                                         ];    & DEBUG &
            print_string( debug_string_alpha,                  & DEBUG &
                          title_size,                          & DEBUG &
                          title_display                        & DEBUG &
                        );                                     & DEBUG &
         END;  & if not syntax error &                         & DEBUG &
   END;  & enter_debug &                                       & DEBUG &


BYTE PROCEDURE next_char;
   BEGIN & next_char &
      LABEL   try_char;
      INTEGER ch;

      ch := read_fifo(public_ib_fifo);

try_char:
      IF ch > %00FF THEN
```

```
SPARSER.WORK.PD8510            THU, DEC 22, 1983, 10:53 AM     PAGE   1

M68KL,P,"parser"
BEGIN

$FILE cdebugc0.work;                                           & DEBUG &
$FILE fkernel.work;
$FILE factive.work;
$FILE cids.work;
$FILE crins.work;
$FILE fintrpt.work;
$FILE fscreen.work;
$FILE fchdata2.work;                               & for title_line &
$FILE fibtree.work;                            & for mnen and ib_link &
$FILE ccmdcase.work;                    & for a few cmd_... constants &
$FILE cstin.work;                                & for cmd_n_sweeps &
$FILE ffifo.work;
$FILE ffifos.work;
$FILE fpubib.work;
$FILE cparser.work;
$FILE fcommand.work;                           & for abort_command &
$FILE ftitle.work;                               & for write_title &

ALPHA PROCEDURE clear_string(string);
   VALUE string;
   ALPHA string;                                             EXTERNAL;
ALPHA PROCEDURE append_ch(string,ch);
   VALUE string,ch;
   ALPHA string;
   BYTE  ch;                                                 EXTERNAL;

INTEGER CONSTANT  max_block_length := 32;                     & DEBUG &
GLOBAL BYTE ARRAY block_buffer[0:max_block_length];           & DEBUG &


BYTE CONSTANT anychar      := '@,      & parser wild-card characters &
              anydigit     := '",            & any digit or space    &
              anysr        := '$,            & ,|;|lf|hpib end(eoi)  &
              dtchar       := '|;            & the "DT" string term'r &

BYTE CONSTANT zero         := '0,
              nine         := '9,
              comma        := ',,
              semicolon    := ';,
              space        := ' ,
              special      := %14;           & ASCII DC4             &

BYTE     dt;       & the terminator char specified by the "DT" command &
BOOLEAN  string_acquired,
         eoi,
         dcl;
                                                              & DEBUG &
INTEGER CONSTANT max_debug_string := 31; & must be 2^n - 1 &  & DEBUG &
BYTE ARRAY debug_string[0:max_debug_string];                  & DEBUG &
INTEGER    debug_string_index;                                & DEBUG &
BYTE ARRAY debug_string_print[0:max_debug_string+1];          & DEBUG &
ALPHA      debug_string_alpha;                                & DEBUG &
```

```
SPARSER.WORK.PD8510            THU, DEC 22, 1983, 10:53 AM     PAGE   3

         BEGIN & if ch > %00FF &
            IF parser_debug THEN                              & DEBUG &
               enter_debug('8);                               & DEBUG &
            IF ch = hpib_eoi THEN
               BEGIN & if eoi &
                  eoi := TRUE;
                  dcl := FALSE;
                  next_char := special;
               END   & if eoi &
            ELSE IF ch = hpib_dcl THEN
               BEGIN & else if dcl &
                  dcl := TRUE;
                  eoi := FALSE;
                  abort_command := TRUE;
                  next_char := special;
               END   & else if dcl &
            ELSE IF ch = hpib_tlk THEN
               BEGIN & else if tlk &
                  write_fifo( token_fifo, cmd_hpib_talk );
                  DO
                     ch := read_fifo(public_ib_fifo)
                  UNTIL ch <> hpib_tlk;
                  GO TO try_char;
               END   & else if tlk &
            ELSE IF (ch AND %FF00) = hpib_pass_thru  THEN
               BEGIN & else if pass thru &
                  DO
                     BEGIN
                        write_fifo(token_fifo, ch);
                        ch := read_fifo( public_ib_fifo );
                     END
                  UNTIL (ch AND %FF00) <> hpib_pass_thru;
                  GO TO try_char;
               END   & else if pass thru &
            ELSE
               BEGIN & else &                  & should never happen &
                  write_fifo( token_fifo, cmd_illegal );
                  dcl := TRUE;
                  eoi := FALSE;
                  next_char := special;
               END;  & else &
         END   & if ch > %00FF &
      ELSE & ch <= %00FF &
         BEGIN & else ch <= %00FF &
            IF parser_debug THEN                              & DEBUG &
               enter_debug(ch);                               & DEBUG &
            eoi := dcl := FALSE;
            next_char := ch;
         END;  & else ch <= %00FF &

   END;  & next_char &


BYTE PROCEDURE simple(ch);
   VALUE ch;
```

```
   BYTE  ch;
   BEGIN  & simple &
      ch := ch AND %7F;
      IF ((ch >= 'a) AND (ch <= 'z)) THEN                  & upshift &
         simple := ch AND %5F
      ELSE
         simple := ch;
   END simple;


INTEGER PROCEDURE op(next,ch);        & This procedure is a temp patch &
   VALUE   next,ch;
   INTEGER next;
   BYTE    ch;
   BEGIN & op &
      INTEGER CONSTANT print_none  := 0,
                       print_title := 1,
                       print_entry := 2;
      INTEGER print_cmd,
              opcode;
      INTEGER POINTER src,
                      dst;

      opcode := ib_link[next];

      IF opcode < 0 THEN
         BEGIN & if &
            op := opcode OR %F000;
            opcode := -opcode;
         END   & if &
      ELSE
         op := opcode AND %0FFF;

      print_cmd := print_none;
      CASE RIGHT(opcode,12) OF
         BEGIN  & case &
& 0 &       ;
& 1 &       BEGIN & 1 &
               title := clear_string(title);
               print_cmd := print_title;
            END;  & 1 &
& 2 &       BEGIN & 2 &
               title := append_ch(title,ch);
               print_cmd := print_title;
            END;  & 2 &
& 3 &       BEGIN & 3 &
               string_acquired := TRUE;
               acquire( entry_string );
               entry := clear_string(entry);
               entry := append_ch(entry,ch);
            END;  & 3 &
& 4 &       BEGIN & 4 &
               entry := append_ch(entry,ch);
            END;  & 4 &
& 5 &       BEGIN & 5 &
```

```
               string_acquired := TRUE;
               acquire( entry_string );
               entry := clear_string(entry);
               entry := append_ch(entry,ch);
            END;  & 5 &
& 6 &       BEGIN & 6 &
               entry := append_ch(entry,ch);
            END;  & 6 &
         END case;

      IF print_cmd <> print_none THEN
         BEGIN & if &
            print_string(title,title_size,title_display);
            write_title;  & move to instrument state in dg RAM &
         END;  & if &
         & use code located after end to display numbers as received &

   END;  & op &


PROCEDURE parser;  & a process &                                   ENTRY;
   BEGIN  & parser &
      BYTE char,
           simplechar,
           expect;
      INTEGER next;
      INTEGER block_length;

      dt := newline;
      string_acquired := FALSE;
      syntax_error := FALSE;

get_new_token:                          & after accepting previous token &
      char := simple( next_char );

      WHILE (  (char = space     ) OR
               (char = cr        ) OR
               (char = comma     ) OR
               (char = semicolon ) OR
               (char = newline   ) OR
               eoi                 OR
               dcl
            ) DO
         char := simple( next_char );
      next := op(char,char);;

      WHILE next > 0 DO
         BEGIN  & while next &
            expect := mnem[next];
            char :=  next_char;
            IF dcl THEN
               GO TO get_new_token;
            simplechar := simple(char);

            WHILE (
```

```
                  (expect <> simplechar) AND
                  (expect <> anychar   ) AND
                  (
                    (expect <> anydigit) OR NOT(
                      (
                        (simplechar <= nine) AND (simplechar >= zero)
                      ) OR
                      (simplechar = space)
                                                )
                  ) AND
                  (
                    (expect <> space) OR NOT(simplechar = cr)
                  ) AND
                  (
                    (expect <> anysr) OR NOT(
                      (simplechar = comma) OR
                      (simplechar = semicolon) OR
                      (simplechar = cr) OR
                      (simplechar = newline) OR
                      eoi
                                             )
                  ) AND
                  (
                    (expect <> dtchar) OR NOT(
                      (char = dt) OR
                      eoi
                                              )
                  )
                ) DO
               BEGIN  & while expect &
                  COMMENT
                     char doesn't match expected char so look farther
                     an illegal next character will match the wild card
                     at the end of the list of characters to test.;
                  next := next + 1;
                  expect := mnem[next];
               END while expect;

            next := op(next,char);

         END while next;
                                                              & DEBUG &
      IF parser_debug THEN                                    & DEBUG &
         enter_debug('|');                                    & DEBUG &

      write_fifo( token_fifo, -next );

      IF ( ((-next) >= cmd_enter) AND
           ((-next) <= cmd_u4    )
         ) OR
         ( ((-next) = cmd_block_a)
         ) THEN
         wait( entry_string_ready );            & wait until processed &

      IF string_acquired THEN
         BEGIN & if &
```

```
            string_acquired := FALSE;
            entry := clear_string( entry );
            release( entry_string );
         END;  & if &

      IF (-next) = cmd_illegal THEN
         BEGIN & if &                                         & DEBUG &
            syntax_error := TRUE;                             & DEBUG &
            WHILE NOT dcl DO          & eat up chars until device clear &
               char := next_char;
            syntax_error := FALSE;                            & DEBUG &
         END;  & if &                                         & DEBUG &

      GO TO get_new_token;

   END parser;

END$
```

```
JPASS1.WORK.PD8510              THU, DEC 22, 1983, 10:53 AM     PAGE   1

!job pass1,librn.pd8510,pass1;outclass=,1
!tell wcc.pd8510; "================ PASS1 release =================="
!tell wcc.pd8510; "Make sure a complete recompile has been made,"
!tell wcc.pd8510; "works, and is serialized with a 0 revision suffix."
!tell wcc.pd8510; "================================================="
!tell librn.pd8510; "=============== PASS1#release =================="
!tell librn.pd8510; "Make sure a complete recompile has been made,"
!tell librn.pd8510; "works, and is serialized with a 0 revision suffix."
!tell librn.pd8510; "================================================="
!tell jtb.pd8510; "=============== PASS1 release =================="
!tell jtb.pd8510; "Make sure a complete recompile has been made,"
!tell jtb.pd8510; "works, and is serialized with a 0 revision suffix."
!tell jtb.pd8510; "================================================="
!tell lani.pd8510; "=============== PASS1 release =================="
!tell lani.pd8510; "Make sure a complete recompile has been made,"
!tell lani.pd8510; "works, and is serialized with a 0 revision suffix."
!tell lani.pd8510; "================================================="
!file pdtape;dev=tape
!file syslist;dev=lp
!store @.pass1.pd8510,@.work.pd8510,@.m68k.upsoft;*pdtape;show
!purge dscreen
!purge loadmap
!purge loadsort
!purge mbnmap
!purge mnbnload
!purge obj
!purge lmain
!purge ocharset
!purge oimbm
!purge ombnload
!purge omonitor
!purge sibtbl
!purge skinfo
!purge frins
!purge fids
!purge fdebug
!purge cdtngr
!purge cresp
!purge cstin
!purge cparams
!purge cformat
!purge ccalmenu
!purge cdisp
!purge cplot
!purge cmkr
!purge csystem
!purge ccmdcase
!purge schanges
!purge dchtable
!purge dcmddecl
!purge dscreen
!purge dalphas
!fcopy
from=dscreen.work;to=dscreen;new
from=loadmap.work;to=loadmap;new
```

```
JPASS1.WORK.PD8510              THU, DEC 22, 1983, 10:53 AM     PAGE   2

from=loadsort.work;to=loadsort;new
from=mbnmap.work;to=mbnmap;new
from=mnbnload.work;to=mnbnload;new
from=obj.work;to=obj;new
from=lmain.work;to=lmain;new
from=ocharset.work;to=ocharset;new
from=oimbm.work;to=oimbm;new
from=ombnload.work;to=ombnload;new
from=omonitor.work;to=omonitor;new
from=sibtbl.work;to=sibtbl;new
from=skinfo.work;to=skinfo;new
from=crins.work;to=frins;new
from=cids.work;to=fids;new
from=cdebug.work;to=fdebug;new
from=cdtngr.work;to=cdtngr;new
from=cresp.work;to=cresp;new
from=cstin.work;to=cstin;new
from=cparams.work;to=cparams;new
from=cformat.work;to=cformat;new
from=ccalmenu.work;to=ccalmenu;new
from=cdisp.work;to=cdisp;new
from=cplot.work;to=cplot;new
from=cmkr.work;to=cmkr;new
from=csystem.work;to=csystem;new
from=ccmdcase.work;to=ccmdcase;new
from=schanges.work;to=schanges;new
from=dchtable.work;to=dchtable;new
from=dcmddecl.work;to=dcmddecl;new
from=dscreen.work;to=dscreen;new
from=dalphas.work;to=dalphas;new
exit
!eod
!eoj
```

```
FPFR.WORK.PD8510                THU, DEC 22, 1983, 10:53 AM     PAGE   1

PROCEDURE  recall_pfr;                                    EXTERNAL.L;
PROCEDURE  configure;                                     EXTERNAL.L;
```

```
SPFR.WORK.PD8510                THU, DEC 22, 1983, 10:53 AM     PAGE   1

M68KL,P,"pfr"
BEGIN

#FILE fgratic.work;                          & for trace_and_graticule &
#FILE cdatap.work;                                      & for max_format &
#FILE ccontvar.work;                             & includes max_parameter &
#FILE cchtable.work;                                    & includes max_ch &
#FILE fchpfr.work;           & after max_format/max_parameter/max_ch decl's &
#FILE fchtable.work;

BYTE TABLE basis_param :=                            & indexed by parameter &
      0,
      s11,         & s11   &
      s21,         & s21   &
      s12,         & s12   &
      s22,         & s22   &
      s11,         & z1    &
      s22,         & s2    &
      s11,         & y1    &
      s22,         & y2    &
      null_param,  & user1 &
      null_param,  & user2 &
      null_param,  & user3 &
      null_param;  & user4 &

BYTE TABLE refl_trans  :=                            & indexed by parameter &
      refl,        & s11   &
      trans,       & s21   &
      refl,        & s12   &
      trans,       & s22   &
      refl,        & z1    &
      refl,        & s2    &
      refl,        & y1    &
      refl,        & y2    &
      null_param,  & user1 &
      null_param,  & user2 &
      null_param,  & user3 &
      null_param;  & user4 &
```

```
$EJECT;
COMMENT                                                          recall_pfr
***********************************************************************
*
***********************************************************************
;
PROCEDURE  recall_pfr;                                            ENTRY;
   BEGIN & recall_pfr &
      INTEGER temp_domain,
              temp_parameter,
              temp_format;

      & get new values from parameter-format-response memory &
      temp_domain    := entry_ch_integer( ch_domain );
      temp_parameter := entry_ch_integer( ch_param );
      temp_format    := format[ temp_domain,
                                temp_parameter,
                                current_entry_ch
                              ];
      set_entry_ch_integer(temp_format, ch_format);
      set_entry_ch_integer(basis_param[temp_parameter],
                           ch_basis_s_param
                          );
      set_entry_ch_integer(refl_trans[temp_parameter], ch_refl_trans);
      set_entry_ch_integer(parameter_descriptor[ temp_parameter,
                                                 parameter_conversion
                                               ],
                           ch_param_conversion
                          );
      IF type_of_grat[ temp_format ] <> rectangular THEN
         temp_format := fmt_log_polar;    & all polars use same values &
      set_entry_ch_real( scale[ temp_format,
                                temp_parameter,
                                current_entry_ch
                              ],
                         ch_scale
                       );
      set_entry_ch_real( ref_position[ temp_format,
                                       temp_parameter,
                                       current_entry_ch
                                     ],
                         ch_ref_position
                       );
      set_entry_ch_real( ref_value[ temp_format,
                                    temp_parameter,
                                    current_entry_ch
                                  ],
                         ch_ref_value
                       );
      set_entry_ch_real( elec_delay[ temp_parameter,
                                     current_entry_ch
                                   ],
                         ch_elec_delay
                       );
   END;  & recall_pfr &
```

```
$EJECT;
COMMENT                                                          configure
***********************************************************************
*
***********************************************************************
;
PROCEDURE  configure;                                             ENTRY;
   BEGIN & configure &
      INTEGER i;

      & PARAMETER DESCRIPTOR &                & to be read from test-set &

      FOR i := 1 UNTIL max_parameter_entry DO
         BEGIN & for &
            parameter_descriptor[z1,i]        :=
            parameter_descriptor[y1,i]        :=
                                    parameter_descriptor[s11,i];

            parameter_descriptor[z2,i]        :=
            parameter_descriptor[y2,i]        :=
                                    parameter_descriptor[s22,i];
         END;  & for &
      parameter_descriptor[z1,parameter_conversion]   := conv_s_to_z;
      parameter_descriptor[z2,parameter_conversion]   := conv_s_to_z;
      parameter_descriptor[y1,parameter_conversion]   := conv_s_to_y;
      parameter_descriptor[y2,parameter_conversion]   := conv_s_to_y;

   END;  & configure &

END$
```

```
INTEGER CONSTANT

cmd_plot_all := 268,
cmd_plot_trace := 269,
cmd_plot_graticule := 270,
cmd_plot_marker := 271,
cmd_plot_text := 272,
cmd_ch1_pen := 274,
cmd_list_trace := 276,
cmd_system_params := 277,
cmd_op_params := 278,
cmd_quadrant_11 := 279,
cmd_quadrant_21 := 280,
cmd_quadrant_12 := 281,
cmd_quadrant_22 := 282,
cmd_quadrant_full := 283,
cmd_pen1 := 284,
cmd_pen2 := 285,
cmd_pen3 := 286,
cmd_pen4 := 287,
cmd_pen5 := 288,
cmd_pen6 := 289,
cmd_pen7 := 290,
cmd_pen8 := 291,
cmd_print_params := 292,
cmd_plot_params := 293,
cmd_next_op_param := 294,
cmd_group2 := 0;
```

```
FPLOT.WORK.PD8510               THU, DEC 22, 1983, 10:53 AM     PAGE  1

COMMENT
  This is a software generated file !!!
  Changes must be made in SKINFO.WORK
  Run GENSK.LANI to re-generate file;

SUBROUTINE proc2;  ENTRY;
BEGIN

CASE command_token-268 OF
BEGIN
& 268 &
select_plot_buffer (all);
& 269 &
select_plot_buffer (trace);
& 270 &
select_plot_buffer (grid);
& 271 &
select_plot_buffer (markers);
& 272 &
select_plot_buffer (annotations);
& 273 &
BEGIN END;
& 274 &
BEGIN END;
& 275 &
BEGIN END;
& 276 &
IF printer_connected THEN
  BEGIN
    abort_sweep;
    list_trace_values;
    restart_sweep;
  END;
& 277 &
select_plot_param (sys_params);
& 278 &
select_plot_param (op_params);
& 279 &
select_plot_quadrant (upper_left);
& 280 &
select_plot_quadrant (lower_left);
& 281 &
select_plot_quadrant (upper_right);
& 282 &
select_plot_quadrant (lower_right);
& 283 &
select_plot_quadrant (full_page);
& 284 &
select_pen(1);
& 285 &
select_pen (2);
& 286 &
select_pen (3);
& 287 &
select_pen (4);
```

```
FPLOT.WORK.PD8510               THU, DEC 22, 1983, 10:53 AM     PAGE  2

& 288 &
select_pen (5);
& 289 &
select_pen (6);
& 290 &
select_pen (7);
& 291 &
select_pen (8);
& 292 &
IF printer_connected THEN
  output_parameters;
& 293 &
dump_to_plotter;
& 294 &
next_op_param;
END;
END proc2;
```

```
SPLOT.WORK.PD8510               THU, DEC 22, 1983, 10:53 AM     PAGE  1

A68KL,P, "plot"

BEGIN

#FILE cdebug.work;
#FILE fterm.work;
#FILE ffmt.work;
#FILE fstring.work;
#FILE fcnv9x.work;
#FILE cdatap.work;
#FILE fchdata.work;
#FILE fchdata2.work;
#FILE cchconst.work;
#FILE fchtable.work;
#FILE fprivib.work;
#FILE foutib.work;
#FILE foutib2.work;
#FILE fcommand.work;
#FILE fparmtbl.work;
#FILE ftpmgr2.work;
#FILE cmenu.work;
#FILE fmenu.work;
#FILE fcontrol.work;
#FILE cscreen.work;
#FILE cplot.work;
#FILE fdispram.work;
#FILE crins.work;
#FILE fkernel.work;
#FILE fgratic.work;
#FILE fdguser.work;

& The following #FILES are for error messages &

#FILE cmsgplot.work;
#FILE cmsgpriv.work;
#FILE futil3.work;
#FILE futil2.work;

BYTE CONSTANT
  comma       := 44,
  term        := 59,          & semi-colon terminator           &
  CR          := 13,
  LF          := 10;

INTEGER CONSTANT
  string_size := 25,
  all         := 0,           & choice of 5 display buffers to plot &
  entry_info  := 0,
  trace       := 1,
  grid        := 2,
  markers     := 3,
  annotations := 4,
  op_params   := 5,
  sys_params  := 6,
  dg_user     := 6,
```

```
SPLOT.WORK.PD8510               THU, DEC 22, 1983, 10:53 AM  -  PAGE  2

  softkeys    := 7,
  full_page   := 0,           & indices into x/y offset table used &
  lower_left  := 1,           & to plot to a particular quadrant   &
  lower_right := 2,
  upper_left  := 3,
  upper_right := 4;

DOUBLE CONSTANT
  x_min := -260,
  x_max := 3835,
  y_min := -50,
  y_max := 4045,
  string_format := Z07000600;    & integer to ascii conversion format  &

INTEGER TABLE buffer_start :=
  & entry info &   start_display+1, start_display+1,
  & trace info &   trace1_position, trace2_position,
  & graticule  &   graticule1_position, graticule2_position,
  & markers    &   mkr11_position, mkr21_position,
  & annotations&   param1_position, param2_position,
  & params     &   text_position, text_position,
  & user disp. &   user_display, user_display,
  & softkeys   &   sk11_position, sk11_position;

INTEGER TABLE buffer_end :=
  & entry info &   entry_aux_position + entry_aux_size,
                   entry_aux_position + entry_aux_size,
  & trace info &   trace1m_display + trace_size,
                   trace2m_display + trace_size,
  & graticule  &   ref_line1_display+ref_line_size,
                   ref_line2_display+ref_line_size,
  & markers    &   mkr18_display+mkr_size, mkr28_display+mkr_size,
  & annotations&   end_ch1_position, end_ch2_position,
  & params     &   sk11_position, sk11_position,
  & user disp. &   character_set, character_set,
  & softkeys   &   sk_highlight_position+sk_highlight_size,
                   sk_highlight_position+sk_highlight_size;

ALPHA TABLE pen_number :=
  "0;","1;","2;","3;","4;","5;","6;","7;","8;";

INTEGER
  plot_buffer,
  new_pen,
  current_pen;

GLOBAL BOOLEAN
  plot_to_hpib;             & flag to send HPGL commands to public HPIB &

BOOLEAN
  service_plot,             & flag to copy entire display for document'n&
  abort_plot;

BYTE ARRAY
  xtra_string [-1:6],
  plot_string [-1:string_size];
```

```
ALPHA
  aux_string,
  xy_string;
```

```
$EJECT;
COMMENT
$DOC+

NAME--
  init_strings
************************************************************************
*
* SHORT DESCRIPTION--
*   initializes plotting strings
*
* EXTENDED DESCRIPTION--
*   This routine initializes strings used to send commands to the
*   plotter.
*
* INPUTS--
*   none
*
* OUTPUTS--
*   none
*
* ROUTINES CALLED--
*   none
*
* ERROR CONDITIONS AND RECOVERY-- none
*
* NOTES--
*
* AUTHOR--
*
************************************************************************
*
* INITIAL REFINEMENT--
*   set maximum string length byte
*   set address of string to point to a byte array
*
************************************************************************
*
* REVISION LOG--
*
************************************************************************
DECLARATION--
;
SUBROUTINE init_strings;
&
$DOC-&

BEGIN
  plot_string [-1] := string_size;
  xtra_string [-1] := 6;
  aux_string:= ADRS (xtra_string);
  xy_string := ADRS (plot_string);
END init_strings;
```

```
$EJECT;
COMMENT
$DOC+

NAME--
  plotter_connected
************************************************************************
*
* SHORT DESCRIPTION--
*   checks if a plotter is connected to the 8510
*
* EXTENDED DESCRIPTION--
*   This routine checks if a plotter is connected on the private bus of
*   the 8510 by writing a command to the plotter's address that sets the
*   plotter's default state.  If the attempt to write to the plotter
*   fails then an error message is displayed indicating that a plotter
*   is not connected.
*
* INPUTS--
*   none
*
* OUTPUTS--
*   TRUE  = plotter is connected
*   FALSE = plotter is not connected
*
* ROUTINES CALLED--
*   wrt_priv_ib
*   clear_message
*   warn
*
* ERROR CONDITIONS AND RECOVERY--
*   none
*
* NOTES--
*   A call to "clear_message" is made before displaying the error
*   message because a general private HP-IB bus error message is also
*   displayed when an attempt to write to a device on the private bus
*   fails.  In order to display the most recent error message, any
*   previous error message must be cleared.
*
* AUTHOR--
*
************************************************************************
*
* INITIAL REFINEMENT--
*   IF writing to the plotter fails THEN
*     clear general private HP-IB error message
*     display unconnected plotter error message
*     return a value of FALSE
*   ELSE
*     return a value of TRUE
*
************************************************************************
*
* REVISION LOG--
```

```
************************************************************************
$DOC-;
BOOLEAN SUBROUTINE plotter_connected;
BEGIN
  IF NOT wrt_priv_ib (plotter, no_fun, "DF;" &default conditions&) THEN
    BEGIN
      clear_message (priv_ib_add_err);
      warn (no_plotter);
      plotter_connected := FALSE;
    END
  ELSE
    plotter_connected := TRUE;
END plotter_connected;
```

```
SPLOT.WORK.PD8510            THU, DEC 22, 1983, 10:53 AM      PAGE   7

$EJECT;
COMMENT
$DOC+

NAME--
  printer_connected
************************************************************************
*
* SHORT DESCRIPTION--
*   checks if a printer is connected to the 8510
*
* EXTENDED DESCRIPTION--
*   This routine checks if a plotter is connected on the private bus of
*   the 8510 by writing a linefeed to the printer's address.  If the
*   attempt to write to the printer fails, then an error message is
*   displayed indicating that a printer is not connected.
*
* INPUTS--
*   none
*
* OUTPUTS--
*   TRUE  = printer is connected
*   FALSE = printer is not connected
*
* ROUTINES CALLED--
*   wrt_priv_ib
*   clear_message
*   warn
*
* ERROR CONDITIONS AND RECOVERY--
*   none
*
* NOTES--
*   A call to "clear_message" is made before displaying the error
*   message because a general private HP-IB bus error message is also
*   displayed when an attempt to write to a device on the private bus
*   fails.  In order to display the most recent error message, any
*   previous error message must be cleared.
*
* AUTHOR--
*
************************************************************************
*
* INITIAL REFINEMENT--
*   IF writing to the printer fails THEN
*     clear general private HP-IB error message
*     display unconnected printer error message
*     return a value of FALSE
*   ELSE
*     return a value of TRUE
*
************************************************************************
*
* REVISION LOG--
*
************************************************************************
```

```
SPLOT.WORK.PD8510            THU, DEC 22, 1983, 10:53 AM      PAGE   8

$DOC-;
BOOLEAN SUBROUTINE printer_connected;
BEGIN
  IF NOT wrt_priv_ib (printer, clr_fun, "  ") THEN
    BEGIN
      clear_message (priv_ib_add_err);
      warn (no_printer);
      printer_connected := FALSE;
    END
  ELSE
    printer_connected := TRUE;
END printer_connected;
```

```
SPLOT.WORK.PD8510            THU, DEC 22, 1983, 10:53 AM      PAGE   9

$EJECT;
COMMENT
$DOC+

NAME--
  plot
************************************************************************
*
* SHORT DESCRIPTION--  plots a segment of display RAM on plotter
*
* EXTENDED DESCRIPTION--
*   This routine reads from the display gen. RAM from a starting
*   address and translates each display generator control word to
*   HPGL strings to be sent to an external plotter via the private
*   HPIB. Each display RAM word is translated into one of the following:
*
*         - attribute           = absolute/relative plotting
*         - jump to new addr.   = general purpose branch around
*         - subroutine branch   = drawing characters
*         - subroutine return   = return from drawing characters
*         - x/y coordinate      = x,y coordinate w/ pen up or down
*
*   X,Y vectors are always forced into x,y pairs such that if a
*   jump word (or any other control word) were to follow an x vector,
*   then the next vector encountered would be designated as the x
*   vector.  Each x,y pair is then converted into a string seperated by
*   commas, and sent out to the plotter via the private HPIB.
*   These vectors are all plotted absolute to the 0,0 vector since the
*   relative stroking of vectors in the display generator uses values
*   that require modula 4095 in the negative direction.  This requires
*   a running sum of x and y coordinates be kept as each relative x/y
*   vector is read and added to the sum.  A modula 4095 is done on each
*   x/y sum in order to get the absolute x/y position.
*
*   A mini-stack is created for each jump to subroutine word which holds
*   the next display word to return to.
*
* INPUTS--
*   start_pos = starting address of display RAM to dump to plotter
*   end_pos   = ending address of display RAM to dump to plotter
*
* OUTPUTS--
*   hardcopy plot
*
* ROUTINES CALLED--
*   wrt_priv_ib
*   append_ch
*   append_string
*
* ERROR CONDITIONS AND RECOVERY--
*   none
*
* NOTES--
*   All character text is stroked from the display gen. to the plotter
*   through the JSRs to individual character vector sets in display
*   memory (therefore the plotter's character set is not used).
```

```
SPLOT.WORK.PD8510            THU, DEC 22, 1983, 10:53 AM      PAGE  10

*
*   Any plot in progress can be aborted by pressing any front panel key.
*   This sets a global flag which is checked after each access to a
*   display word.
*
* AUTHOR--
*
************************************************************************
*
* INITIAL REFINEMENT--
*   pick up plotter pen
*   loop until plot is aborted OR end of display segment is read:
*     check 2 MSBs of each display word for the following control bits
*       0: attribute/return from character subroutine
*             pick up/put down plotter pen for blank/non-blank attribute
*             return to calling display word and read next display word
*       1: x/y coordinate
*             collect x,y pair
*             convert to string and dump to plotter
*       2: branch to character subroutine
*       3: jmp to given address
*
************************************************************************
*
* REVISION LOG--
*
************************************************************************
DECLARATION--
;
PROCEDURE plot (start_pos, end_pos);
  VALUE start_pos, end_pos;  INTEGER start_pos, end_pos;
&
$DOC-&

 BEGIN

  DOUBLE CONSTANT
    DG_base := %100000,          & display gen. vectors              &
    CH_base := %106000;          & character set vectors             &
  INTEGER CONSTANT
    max_RTNs    := 4,            & hardware stack size for display RTNs&
    EOD_pattern := %0800,
    NOP_pattern := %0A00,
    PR_pattern  := %0300,
    INC_pattern := %0500,
    RTS_bit     := 13,
    blank_bit   := 12,
    neg_bit     := 11;
  INTEGER POINTER
    DG_ptr;                      & contents of display memory word    &
  DOUBLE
    end_of_display_buffer,
    DG_address = DG_ptr;
  DOUBLE ARRAY
    RTN_address [0:max_RTNs];    & return address stack for display   &
  INTEGER
```

```
  x_abs, y_abs,
  X, Y,                          & x/y coordinate display vector      &
  x_plot_offset, y_plot_offset,& x,y offsets for quadrant plotting    &
  RTN_ptr,                       & return address stack pointer       &
  attribute;
BOOLEAN
  EOD_found,
  blank_vector,
  char_rel,
  xy_rel,
  plot_rel,
  x_vector,
  pen_up;

COMMENT
  The following tables contain offsets for plotting one of the 4
  possible quadrants or a full page.  They are indexed by constants
  which describe which quadrant is being plotted
;
INTEGER TABLE
  x_offset := 0,-100,1950,-100,1950;
INTEGER TABLE
  y_offset := 0,-50,-50,2050,2050;

&-----------------------------------------------------------------&

SUBROUTINE RTS;
BEGIN
  IF RTN_ptr >= 0 THEN
    BEGIN
      & return to calling address and advance to next display word &
      STPNTR (DG_ptr, RTN_address[RTN_ptr]);
      RTN_ptr := RTN_ptr - 1;
    END
  ELSE
    BEGIN & debug &
      WSTR("ERROR:  RTS from "); WHex(DG_address,8);
      WSTR(" = "); WHex(DG_ptr,8); CRLF;
      STPNTR (DG_ptr, end_of_display_buffer);
    END;
END RTS;

&-----------------------------------------------------------------&

SUBROUTINE JMP;
BEGIN
  STPNTR (DG_ptr, DG_base+ALEFT(DG_ptr AND %3FFF,1));
  x_vector := TRUE;
  plot_rel := (xy_rel AND (DG_address<CH_base)) OR (char_rel);
END JMP;

&-----------------------------------------------------------------&

SUBROUTINE JSR;
BEGIN
  RTN_address[RTN_ptr:=RTN_ptr+1] := DG_address;
```

```
  JMP;
END JSR;

&-----------------------------------------------------------------&

SUBROUTINE load_xy;
BEGIN
  IF x_vector THEN                          & compute x display vector &
    BEGIN
      x_vector := FALSE;
      x_abs := (DG_ptr + (IF plot_rel THEN x_abs ELSE 0)) AND %OFFF;
      X := (IF plot_quadrant=full_page THEN x_abs ELSE
          (ALEFT(x_abs,2)/9) + x_plot_offset);        & DIV 2.25      &
      blank_vector := IBIT (DG_ptr, blank_bit);
    END
  ELSE
    BEGIN         & compute y display vector and output x,y vectors &
      x_vector := TRUE;
      y_abs := (DG_ptr + (IF plot_rel THEN y_abs ELSE 0)) AND %OFFF;
      Y := (IF plot_quadrant=full_page THEN y_abs ELSE
          (ALEFT(y_abs,2)/9) + y_plot_offset);        & DIV 2.25      &
      plot_string [0] := 0;
      COMMENT
      IF plot_to_hpib OR service_plot THEN
        BEGIN
          X := X - x_min
          Y := Y - y_min
        END;
      IF blank_vector AND NOT pen_up THEN
        BEGIN
          pen_up := TRUE;
          append_string (xy_string, ";PU;PA");
        END
      ELSE
      IF NOT blank_vector AND pen_up THEN
        BEGIN
          pen_up := FALSE;
          append_string (xy_string, ";PD;PA");
        END
      ELSE
      IF plot_to_hpib THEN    & LF terminated last x,y pair over bus &
        append_string (xy_string,"PA")
      ELSE
        append_ch (xy_string, comma);     & delimiter after last x,y &
      & convert X and Y values to strings &
      append_string (xy_string, append_ch (
                      format_double (X, aux_string, string_format),
                      comma));
      append_string (xy_string,
                      format_double (Y, aux_string, string_format));
      IF NOT plot_to_hpib THEN
        urt_priv_ib (plotter, pa, xy_string)
      ELSE
        BEGIN
          append_ch(xy_string,10);       & append LF &
          abort_plot :=
```

```
            NOT (string_out_ok (xy_string) AND next_xfer_ready);
        END;
    END;
  STPNTR (DG_ptr, DG_address+2);        & advance to next display word &
END load_xy;

&-----------------------------------------------------------------&

SUBROUTINE load_attribute;
BEGIN
  IF NOT (EOD_found:=(attribute:=DG_ptr AND %OFOO)=EOD_pattern) THEN
    BEGIN
      IF DG_address < CH_base THEN
        xy_rel := attribute=PR_pattern;
      char_rel := attribute=INC_pattern;
      IF IBIT (DG_ptr, RTS_bit) THEN
        RTS;
      STPNTR (DG_ptr, DG_address+2);
      plot_rel := (xy_rel AND (DG_address<CH_base)) OR (char_rel);
    END;
END load_attribute;

&-----------------------------------------------------------------&

IF NOT abort_plot THEN
  BEGIN
    acquire( trace_marks );
    x_abs :=  y_abs := 0;
    X := Y := 0;
    RTN_ptr := -1;
    EOD_found:=blank_vector:=char_rel:=xy_rel:=plot_rel:= FALSE;
    x_vector  := pen_up := TRUE;
    STPNTR (DG_ptr, DG_base+ (2*start_pos));
    end_of_display_buffer := DG_base + (2*end_pos);
    x_plot_offset := x_offset [plot_quadrant];
    y_plot_offset := y_offset [plot_quadrant];
    IF NOT plot_to_hpib THEN
      urt_priv_ib (plotter, pa, ";PU;PA0,0");
    IF plot_debug THEN
      BEGIN
        WSTR("PLOT START="); WHex(DG_address,8); WHEX(start_pos);
        CRLF; WSTR("PLOT END @: "); WHex(end_of_display_buffer,8);
        WHEX(end_pos); CRLF;
      END;
    DO BEGIN
      & debug for display words inserted here &
      CASE RIGHT (DG_ptr,14) OF                & get display opcode &
        BEGIN
          load_attribute;                      & 0 &
          load_xy;                             & 1 &
          JSR;                                 & 2 &
          JMP;                                 & 3 &
        END case;
      abort_plot := abort_plot OR abort_command;
    END UNTIL EOD_found OR abort_plot OR
        ((DG_address >= end_of_display_buffer) AND
```

```
         (DG_address < CH_base));
    release( trace_marks );
  END;
END plot;
```

```
#EJECT;
COMMENT
$DOC+

NAME--
  do_plot_setup
************************************************************************
*
* SHORT DESCRIPTION--
*   picks up set up pen color and plots display buffer
*
* EXTENDED DESCRIPTION--
*   This routine executes the set up plot corresponding to the
*   channel of the display buffer(s) to be plotted.  The pen for that
*   channel is picked up and a plot routine is called to plot the
*   chosen display buffer.
*
* INPUTS--  none
*
* OUTPUTS-- none
*
* ROUTINES CALLED-- none
*
* ERROR CONDITIONS AND RECOVERY-- none
*
* NOTES--
*
* AUTHOR--
*
************************************************************************
*
* INITIAL REFINEMENT--
*
************************************************************************
*
* REVISION LOG--
*
************************************************************************
DECLARATION--
;
PROCEDURE do_plot_setup (channel, buffer);
  VALUE channel, buffer;
  INTEGER channel, buffer;
BEGIN
  IF NOT abort_plot THEN
  IF display_8510_on OR (buffer = dg_user) THEN
  BEGIN
    IF (new_pen:=plotter_pen[channel]) <> current_pen THEN
      BEGIN
        wrt_priv_ib (plotter, no_fun, "SP");
        wrt_priv_ib (plotter, no_fun, pen_number[current_pen:=new_pen]);
      END;
    buffer := 2*buffer + channel-1;
    plot (buffer_start[buffer], buffer_end[buffer]);
  END;
END do_plot_setup;
```

```
#EJECT;
COMMENT
$DOC+

NAME--
  case_plot_buffer
************************************************************************
*
* SHORT DESCRIPTION--
*   selects display buffer(s) to be plotted
*
* EXTENDED DESCRIPTION--
*   This routine does a case selection on which display buffer(s) to
*   plot.  Flags are first set depending on whether channel 1 and 2
*   display information is being displayed (since display "jumps" are
*   not embedded to jump around either of the channel displays for
*   single channel cases).  These flags are then used to determine
*   whether one or both channel displays are plotted.
*
* INPUTS--  none
*
* OUTPUTS-- none
*
* ROUTINES CALLED--
*   plot
*   abort_sweep
*   restart_sweep
*
* ERROR CONDITIONS AND RECOVERY--
*   none
*
* NOTES--
*   The sweep is aborted prior to calling the plot routines and is
*   restarted after all plotting has been completed or aborted.
*
* AUTHOR--
*
************************************************************************
*
* INITIAL REFINEMENT--
*   set flags determining which channels are displayed
*   select current display buffer(s) to plot:
*     all of display
*     traces
*     graticule
*     markers
*     text
*   (For traces, graticules, markers, text:  check flags to indicate
*    which channels are being display.)
*
************************************************************************
*
* REVISION LOG--
*
************************************************************************
DECLARATION--
```

```
;
PROCEDURE case_plot_buffer;
&
$DOC-&

BEGIN
  BOOLEAN plot_ch1, plot_ch2;

SUBROUTINE plot_trace;
  BEGIN
    IF plot_ch1 THEN
      do_plot_setup (ch1, trace);
    IF plot_ch2 THEN
      do_plot_setup (ch2, trace);
  END;

SUBROUTINE plot_graticule;
  BEGIN
    IF plot_ch1 THEN
      do_plot_setup (ch1, grid);
    IF plot_ch2 THEN
      IF NOT ((trace_mode = overlay) AND
              (graticule_type(ch1)=graticule_type(ch2))) THEN
      do_plot_setup (ch2, grid);
  END;

SUBROUTINE plot_markers;
  BEGIN
    IF plot_ch1 THEN
      do_plot_setup (ch1, markers);
    IF plot_ch2 THEN
      do_plot_setup (ch2, markers);
  END;

SUBROUTINE plot_text;
  BEGIN
    IF plot_ch1 THEN
      do_plot_setup (ch1, annotations);
    IF plot_ch2 THEN
      do_plot_setup (ch2, annotations);
  END;

SUBROUTINE plot_entry_stuff;
    do_plot_setup (current_entry_ch, entry_info);

& main case_plot_buffer & current_pen := 0;
  plot_ch1 := (trace_mode <> single_ch) OR (current_entry_ch = ch1);
  plot_ch2 := (trace_mode <> single_ch) OR (current_entry_ch = ch2);
  abort_sweep;
  IF directory_on THEN        & op/sys parameters or tape directory &
    do_plot_setup (current_entry_ch, op_params)
  ELSE
  CASE plot_buffer OF
    BEGIN
```

```
SPLOT.WORK.PD8510              THU, DEC 22, 1983, 10:53 AM     PAGE  19

      BEGIN   & everything but softkeys except on external HP-IB plots &
        IF service_plot THEN
          do_plot_setup (current_entry_ch, softkeys);
        do_plot_setup (current_entry_ch, dg_user);
        plot_entry_stuff;
        plot_trace;
        plot_graticule;
        IF marker_state <> 0 THEN
          plot_markers;
        plot_text;
      END;
      plot_trace;                 & traces &
      plot_graticule;             & graticule &
      plot_markers;               & markers &
      BEGIN                       & annotations &
        plot_entry_stuff;
        plot_text;
      END;
    END;
  restart_sweep;
END case_plot_buffer;
```

```
SPLOT.WORK.PD8510              THU, DEC 22, 1983, 10:53 AM     PAGE  20

$EJECT;
COMMENT
$DOC+

NAME--
  dump_to_plotter
************************************************************************
*
* SHORT DESCRIPTION--
*   sets up initial plotter information and determines a segments of
*   display gen. RAM to output to plotter
*
* EXTENDED DESCRIPTION--
*   This routine sets up the following plotting conditions to send to
*   the plotter via the private HPIB:
*        - pen color
*        - plotting quadrant (upper left, upper right, etc.)
*        - scaling units
*   The pen color and plotting quadrant are based on the user's
*   selection from the softekys (or their default values are used).
*   The scaling factors are computed from the plotter's P1,P2 values
*   (plot unit limits) through nested subroutines COMPUTE_SCALE and
*   CHANGE_SCALE.  A 4x5 aspect ratio along the respective X and Y axes
*   are computed in the scaling units such that 4095 x 4095 scaled units
*   are centered within the P1,P2 boundary.
*
*   example:    +-------+-------------+-------+ P2
*               |     ^ |             |       |
*               |     | | 4096 x 4096 |       |          x = (5/4)y
*               |     y |    scaled   |       |          y = (4/5)x
*               |     | |    units    |       |
*               |     v |             |       |
*             P1+-------+-------------+-------+
*                       <------x----->
*
*   After the scaled unit limits have been output to the plotter, the
*   PLOT routine is called with the starting and ending address of the
*   segment(s) of display gen. RAM vectors to be sent to the plotter.
*   These segment(s) of display RAM are determined by the user from a
*   softkey selection (has a default value) of displays to plot:
*
*        - all       = (default) all of disply except softkeys and error
*        - trace     = data traces
*        - graticule
*        - markers
*        - text      = annotations and active function lines
*                                  --+
*        - operating parameters  |  channel and measurement information
*        - system parameters     |  (presented in text format)
*                                  --+
*   These individual display choices allows the user to change pen
*   colors for different parts of the display.
*
* INPUTS--  none
*
* OUTPUTS-- none
```

```
SPLOT.WORK.PD8510              THU, DEC 22, 1983, 10:54 AM     PAGE  21

*
* ROUTINES CALLED--
*   clr_priv_ib
*   wrt_priv_ib
*   append_string
*   append_ch
*   CMV9A
*   warn
*
* ERROR CONDITIONS AND RECOVERY--
*   An initial attempt is made to output to the plotter in order to
*   detect whether or not a plotter is connected to the system.  This
*   enables the routine to initiate or abort a plot, in which case an
*   error message is displayed indicating that a plotter is not
*   connected to the system.
*
* NOTES--
*   A plot in progress can be aborted by pressing any front panel key.
*
*   Plotting functions will interface with plotter models including and
*   manufactured after the HP9872B (ie: 9872C,7470A). This is due to the
*   use of the scaling (SC) feature implemented by these plotters.
*
* AUTHOR--
*
************************************************************************
*
* INITIAL REFINEMENT--
*   reset plot abort flag
*   set up output strings to plotter
*   IF plotter is not connected THEN
*     display warning message
*   ELSE
*     compute and output scaling units to plotter
*     output current pen color selection to plotter
*     IF plot has not been aborted THEN
*       call plotting routine (PLOT) w/ starting and ending display
*       address parameters of display segment(s) to be plotted
*     output command to plotter to store pen
*     IF plot was aborted THEN
*       display warning message
*
************************************************************************
*
* REVISION LOG--
*
************************************************************************
DECLARATION--
;
PROCEDURE dump_to_plotter;
&
$DOC-&

BEGIN
  DOUBLE
    p1x, p1y, p2x, p2y,
```

```
SPLOT.WORK.PD8510              THU, DEC 22, 1983, 10:54 AM     PAGE  22

    x_range, y_range,
    x_scale, y_scale;
  INTEGER
    index;
  BYTE ARRAY outp1p2 [-1:string_size];
  ALPHA p1p2_string;

  &-----------------------------------------------------------------&

  SUBROUTINE compute_scale;
  BEGIN
    y_scale := (ALEFT((x_range:=ABS(p2x-p1x)),2)+2)/5;   & +2 to round &
    IF y_scale > (y_range:=ABS(p2y-p1y)) THEN
      BEGIN   & x = y*(5/4) &
      x_scale := IF (y_range AND %F0000000)=0 THEN
                   ARIGHT (y_range*5+2, 2)
                 ELSE
                   ARIGHT (y_range+2,2) * 5;
      p1x := ARIGHT (x_range-x_scale, 1);          & extra x units DIV 2 &
      p1x := IF (p1x AND %FFFC0000)=0 THEN         & * 4K if enough bits &
               (ALEFT(p1x,12)+ARIGHT(x_scale,1)) / x_scale   & round &
             ELSE                                  & avoid overflow     &
               ALEFT (DOUBLE (REAL(p1x)/REAL(x_scale)),12);
      p2x := x_max + p1x;
      p1x := x_min - p1x;
      p2y := y_max;
      p1y := y_min;
      END
    ELSE      & y = x*(4/5) &
      BEGIN
      p1y := ARIGHT (y_range-y_scale, 1);          & extra y units DIV 2 &
      p1y := IF (p1y AND %FFFC0000)=0 THEN         & * 4K if enough bits &
               (ALEFT(p1y,12)+ARIGHT(y_scale,1)) / y_scale   & round &
             ELSE                                  & avoid overflow     &
               ALEFT (DOUBLE (REAL(p1y)/REAL(y_scale)),12);
      p2y := y_max + p1y;
      p1y := y_min - p1y;
      p2x := x_max;
      p1x := x_min;
      END;
  END compute_scale;

  &-----------------------------------------------------------------&

  DOUBLE SUBROUTINE get_next_number;
    get_next_number := CMV9A (ADRS(outp1p2), index);

  &-----------------------------------------------------------------&

  SUBROUTINE append_next_number;
    append_string (p1p2_string, aux_string);

  &-----------------------------------------------------------------&

  SUBROUTINE change_scale;
  BEGIN
```

```
    p1p2_string := read_priv_ib (plotter, no_fun, "OP;", p1p2_string);
    IF plot_debug THEN
      BEGIN WSTR("OP: "); WSTR(p1p2_string); CRLF; END;
    & converts P1/P2 string to doubles to compute scaling units &
    p1x := get_next_number;
    p1y := get_next_number;
    p2x := get_next_number;
    p2y := get_next_number;
    compute_scale;
    & convert scaling units to string form to output to plotter &
    append_ch (format_double (p1x, p1p2_string, string_format), comma);
    append_ch (format_double (p2x, aux_string, string_format), comma);
    append_next_number;
    append_ch (format_double (p1y, aux_string, string_format), comma);
    append_next_number;
    append_ch (format_double (p2y, aux_string, string_format), term);
    append_next_number;
    IF plot_debug THEN
      BEGIN WSTR("new scale: "); WSTR(p1p2_string); CRLF; END;
  END change_scale;

  &-----------------------------------------------------------------&

  index := 1;
  abort_plot := plot_to_hpib := FALSE;
  init_strings;
  outp1p2[-1] := string_size;
  p1p2_string := ADRS (outp1p2);
  IF plotter_connected THEN
    BEGIN
      service_plot := FALSE;
      change_scale;
      clr_priv_ib (plotter);
      wrt_priv_ib (plotter, clr_fun, "SC");
      wrt_priv_ib (plotter, no_fun, p1p2_string);
      IF NOT (abort_plot:=abort_command) THEN
        case_plot_buffer;
      wrt_priv_ib (plotter, clr_fun, ";PU;SP0;PA-260,-50;DF;");
    END; & if plotter is hooked up &
  IF abort_plot THEN
    warn (plot_aborted);
END dump_to_plotter;
```

```
$EJECT;
COMMENT
$DOC+

NAME--
  select_pen
**********************************************************************
*
* SHORT DESCRIPTION--
*   update pen color variable
*
* EXTENDED DESCRIPTION--
*   This routine updates the pen color to be used by the plotter.
*   It is invoked by the softkey functions corresponding to selecting
*   one of 8 possible plotter pen colors.  Firmware for each plotter
*   handles pen color numbers that are out of range (ie: selecting pen
*   color 7 on a 2-color plotter will modulo 2 on the pen selection).
*   The previous menu is generated after the pen color is selected.
*
* INPUTS--   pen_color = (1..8)
*
* OUTPUTS--  none
*
* ROUTINES CALLED--
*   hilight_on
*   previous_menu
*
* ERROR CONDITIONS AND RECOVERY--
*   none
*
* NOTES--
*
* AUTHOR--
*
**********************************************************************
*
* INITIAL REFINEMENT--
*   Hilight softkey corresponding to pen selected
*   Set global variable with pen number of pen selected
*   Return to the previous softkey menu
*
**********************************************************************
*
* REVISION LOG--
*
**********************************************************************
DECLARATION--
;
PROCEDURE select_pen (number);
  VALUE number; INTEGER number;
&
$DOC-&

BEGIN
  hilight_on (cmd_pen1, cmd_pen8 );
  wrt_disp_int (ADRS(plotter_pen[current_entry_ch]),(new_pen:=number));
```

```
  previous_menu;
END select_pen;
```

```
$EJECT;
COMMENT
$DOC+

NAME--
  select_plot_buffer
**********************************************************************
*
* SHORT DESCRIPTION--
*   update display buffer to be plotted
*
* EXTENDED DESCRIPTION--
*   This routine updates the display buffer to be plotted by the
*   plotter.  It is invoked by the softkey functions corresponding to
*   a selection of display areas to be plotted:
*       all of display
*       trace only
*       graticule only
*       markers only
*       text only
*
* INPUTS--   display buffer constant
*
* OUTPUTS--  none
*
* ROUTINES CALLED--
*   wrt_disp_int
*   dump_to_plotter
*
* ERROR CONDITIONS AND RECOVERY--
*   none
*
* NOTES--
*   The selection of individual display buffers allows for creating
*   multi-color plots (by selecting a pen color prior to a plot buffer).
*
* AUTHOR--
*
**********************************************************************
*
* INITIAL REFINEMENT--
*   Hilight display buffer selected to be plotted
*   Set global variable containing current display buffer with value of
*     selected display buffer
*
**********************************************************************
*
* REVISION LOG--
*
**********************************************************************
DECLARATION--
;
PROCEDURE select_plot_buffer (buffer);                          ENTRY;
  VALUE buffer; INTEGER buffer;
&
$DOC-&
```

```
BEGIN
  plot_buffer := buffer;
  dump_to_plotter;
  pop_menu (COPY_MENU);
END;
```

```
#EJECT;
COMMENT
$DOC+

NAME--
  select_plot_param
**************************************************************************
*
* SHORT DESCRIPTION--
*   update parameter list to printed/plotted
*
* EXTENDED DESCRIPTION--
*   This routine updates the parameter list to be printed or plotted
*   and put up on the display.
*   It is invoked by the softkey corresponding to the parameter list
*   selected: operating or systen parameters
*
* INPUTS--   parameter list constant
*
* OUTPUTS--  none
*
* ROUTINES CALLED--
*   list_op_params
*   list_sys_params
*
* ERROR CONDITIONS AND RECOVERY--
*   none
*
* NOTES--
*
* AUTHOR--
*
**************************************************************************
*
* INITIAL REFINEMENT--
*   Set global variable containing parameter list to value of parameter
*     list selected
*   Display parameter list selected
*
**************************************************************************
*
* REVISION LOG--
*
**************************************************************************
DECLARATION--
;
PROCEDURE select_plot_param (param);
  VALUE param; INTEGER param;
&
$DOC-&

BEGIN
  plot_to_hpib := FALSE;
  plot_buffer := param;
  abort_sweep;           & sweep restarted when display is turned off &
  IF param = op_params THEN
```

```
    list_op_params
  ELSE
    BEGIN
      blank_softkey(7);   & delete [NEXT PAGE] softkey for systen parm &
      list_sys_params;
    END;
END;
```

```
#EJECT;
COMMENT
$DOC+

NAME--
  select_plot_quadrant
**************************************************************************
*
* SHORT DESCRIPTION--
*   updates and determines position to plot display
*
* EXTENDED DESCRIPTION--
*   This routine determines the position to plot a selected display
*   buffer. It is invoked by a softkey corresponding to one of 5 areas
*   of the total available plotting area to plot:
*        full page
*        upper left quadrant
*        lower left quadrant
*        upper right quadrant
*        lower right quadrant
*   Upon selection of one of the above choices to plot, a local routine
*   is called to starting plotting the display buffer selected prior
*   to choosing a plotting quadrant.
*
* INPUTS--  plotting quadrant constant
*
* OUTPUTS-- none
*
* ROUTINES CALLED--
*   hilight_on
*   dump_to_plotter
*
* ERROR CONDITIONS AND RECOVERY--
*   none
*
* NOTES--
*
* AUTHOR--
*
**************************************************************************
*
* INITIAL REFINEMENT--
*   Hilight selected plot quadrant
*   Set global variable containg plot quadrant to value of selected
*     plotting quadrant
*   Call routine to plot to selected plot quadrant
*
**************************************************************************
*
* REVISION LOG--
*
**************************************************************************
DECLARATION--
;
PROCEDURE select_plot_quadrant (quadrant);
  VALUE quadrant; INTEGER quadrant;
```

```
&
$DOC-&

BEGIN
  hilight_on (cmd_quadrant_11, cmd_quadrant_full);
  wrt_disp_int (ADRS(plot_quadrant), quadrant);
  previous_menu;
END;
```

```
#EJECT;
SUBROUTINE output_parameters;
BEGIN
  IF plot_buffer = op_params THEN
    list_op_param_page
  ELSE
    list_sys_params;
END output_parameters;
```

```
#EJECT;
COMMENT
$DOC+

NAME--
  output_plot
************************************************************************
*
* SHORT DESCRIPTION--
*   sends plot strings to an external controller
*
* EXTENDED DESCRIPTION--
*   This routine is used to set up and send plot strings (normally
*   written directly to the plotter) to an external controller via
*   public HP-IB.  A flag is set indicating to the local plotting
*   routines that strings conataining HPGL plot commands are to be
*   sent over the public bus instead of the private bus (directly to
*   plotter).
*
*   Plotting quadrant information is saved prior to calling the local
*   plot routines.  It is then set to a full page plot in order to
*   eliminate scaling x,y coordinates for quadrant plotting, and
*   restored after returning from the plotting routines.
*
* INPUTS-- none
*
* OUTPUTS-- none
*
* ROUTINES CALLED--
*   acquire
*   release
*   init_strings
*   case_plot_buffer
*   warn
*   string_out_ok
*
* ERROR CONDITIONS AND RECOVERY--
*   none
*
* NOTES--
*   The string "PU"+LF is the last string output.  This currently
*   acts as a terminator for the OUTPUT PLOT command.
*
* AUTHOR--
*
************************************************************************
*
* INITIAL REFINEMENT--
*   acquire use of public HPIB resource
*   initialize plot strings
*   call routine to setup and do external plot
*   IF plot was aborted THEN
*     display warning message
*   ELSE
*     send a "PU" (pen up) command    {terminator ???}
*   release use of public HPIB resource
```

```
*
************************************************************************
*
* REVISION LOG--
*
************************************************************************
DECLARATION--
;
PROCEDURE output_plot;                                              ENTRY;
&
$DOC-&

BEGIN
  INTEGER old_quadrant;
  acquire (pubib_output);
  init_strings;
  byte_avail := plot_to_hpib := TRUE;
  abort_plot := FALSE;
  old_quadrant := plot_quadrant;          & save current plot_quadrant &
  wrt_disp_int (ADRS(plot_quadrant), full_page);
  abort_sweep;
  plot (start_display+1, character_set);
  restart_sweep;
  wrt_disp_int (ADRS(plot_quadrant), old_quadrant);
  IF abort_plot THEN
    warn (plot_aborted);
  string_out_ok ("PU ");
  byte_avail := abort_command := plot_to_hpib := FALSE;
  release (pubib_output);
END output_plot;
```

```
SPLOT.WORK.PD8510              THU, DEC 22, 1983, 10:54 AM     PAGE  35

#EJECT;
PROCEDURE documentation_plot;                                    ENTRY;
BEGIN
  INTEGER old_buffer;
  IF plotter_connected THEN
    BEGIN
      clr_priv_ib (plotter);
      service_plot := TRUE;
      old_buffer := plot_buffer;
      plot_buffer := all;
      case_plot_buffer;
      plot_buffer := old_buffer;
    END;
END documentation_plot;


#FILE fplot.work;

END$
```

```
FPLOTTER.WORK.PD8510           THU, DEC 22, 1983, 10:54 AM     PAGE   1

PROCEDURE select_plot_buffer (buffer);
  VALUE buffer; INTEGER buffer;,                                 EXTERNAL.L;
PROCEDURE output_plot;                                           EXTERNAL.L;

EXTERNAL BOOLEAN plot_to_hpib.L;
```

```
CPRIVIB.WORK.PD8510            THU, DEC 22, 1983, 10:54 AM     PAGE   1

& priv_ib_lun_table indices &
INTEGER CONSTANT  not_used_lun :=  0,     & private HP-IB luns.        &
                  source       :=  1,
                  test_set     :=  2,
                  plotter      :=  3,     & must coordinate constants &
                  printer      :=  4,     & with others in SLUNPLUS   &
                  priv_ib_pass :=  5,     & that share a bubble array.&
                  source_2     :=  6,
                  test_set_2   :=  7,
  & SYMTAB prob   lo_source    :=  8,     n/u&
  & SYMTAB prob   lo_source_2  :=  9,     n/u&
                  user_device_1:= 10,
                  user_device_2:= 11,
             & limited to 16 actual luns &
                  major        := 16,     & non-private HP-IB luns     &
                  minor        := 17,
                  illegal_lun  := 31,

                  lun_max      := 31;     & MUST BE UPDATED !!!!!!!!! &

                  COMMENT  user display index and user display address
                           uses 31  (declared in cdguser.work)
                           ;


& active functions for private hp_ib devices -- MUST AGREE WITH SPRIVIB&
                                          &sources&
INTEGER CONSTANT  no_fun         := -1, & doesn't change active function &
                  clr_fun        := -2, & forces next function to be sent&
                                          &sources&
                  fa             := 0,  & start frequency &
                  fb             := 1,  & stop frequency  &
                  cf             := 2,  & center frequency &
                  df             := 3,  & delta frequency / span &
                  st             := 4,  & sweep time &
                  pl             := 5,  & power level &
                  cw             := 6,  & c.w. frequency &
                  sv             := 7,  & save   - same as test-set &
                  rc             := 8,  & recall - same as test-set &
                  sm             := 9,  & manual sweep frequency &
                  sf             := 10, & frequency step size &
                  tl             := 11, & sweep time limit &
                  sn             := 12, & number of points, step sweep &
                  s1             := 13, & swept mode &
                  sw0            := 14, & swap to most recent AL1 state &
                  sw1            := 15, & swap opposite sw1 &
                  display_off    := 16, & turn off source displays &
                  display_on     := 17, & turn on  source displays &
                  sl1            := 18, & power slope on &
                  sl0            := 19, & power slope off &
                                          &  test-set &
                  oi             := 20, & output id string (test set) &
                  pe             := 21, & port enable (test set) &
                  ic             := 22, & instrument configure (test set)&
                  mx             := 23, & max recall state (test set) &
```

```
CPRIVIB.WORK.PD8510            THU, DEC 22, 1983, 10:54 AM     PAGE   2

                  atten1         := 24, & attenuator 1 &
                  atten2         := 25, & attenuator 2 (test set) &
                  rm             := 26, & service request mask (test set)&
                                          & plotter &
                  pa             := 27,
                  pr             := 28;
```

```
FPRIVIB.WORK.PD8510            THU, DEC 22, 1983, 10:54 AM     PAGE   1


#FILE cprivib.work;

PROCEDURE clr_priv_ib(lun); VALUE lun; INTEGER lun;             EXTERNAL;
BOOLEAN PROCEDURE wrt_priv_ib_source(fun,str); VALUE fun,str;
   INTEGER fun; ALPHA str;                                       EXTERNAL;
BOOLEAN PROCEDURE wrt_priv_ib(lun,fun,str); VALUE lun,fun,str;
   INTEGER lun,fun; ALPHA str;                                   EXTERNAL;
ALPHA PROCEDURE read_priv_ib(lun,fun,outstr,instr);
   VALUE lun,fun,outstr,instr;  INTEGER lun,fun;
   ALPHA outstr,instr;                                           EXTERNAL;
```

```
SPRIVIB.WORK.PD8510            THU, DEC 22, 1983, 10:54 AM     PAGE   1


M68KL,P,"privib"
BEGIN
COMMENT
************************** FILE: SPRIVIB  ***************************
*
*                    private HP-IB Interface drivers
*
*********************************************************************
*
*  OCT 1981          JOHN BARR
*
*********************************************************************
* The 8510 is THE controller on a private hp_ib bus. This bus is used
* for control of the accessory instruments needed to make a measurement.
* i.e. - source, test set, plotters, and etc. The 8510 is THE controller
* and will not pass control. It is either the talker or the listener on
* all data transfers. It has the capablitily to respond to SRQ and will
* do a serial poll in response.
*
* 8510 HP-IB compatilblity code
*    C1,C2,C3,C4,C28,SH1,AH1,TalkerOnly,ListenerOnly,SRO,RLO,PPO,DCO,DTO
* Requires of connected instruments
*    CO,SH1,AH1,T2/4,L2,SRO/1,RLO/1/2,PPx,DC1,DTO/1
*********************************************************************
*ENTRYS
* init_priv_ib    -- initializes private hp-ib and sends IFC
* set_priv_ib_lun -- sets the actual priv hp_ib address for a LUN
* get_priv_ib_lun -- get the actual priv hp-ib address for a LUN
* clr_priv_ib     -- sends selected device clr (SDC) to priv hp_ib dev
* trig_priv_ib    -- sends group execute trigger (GET) to priv hp-ib dev
* set_ren_priv_ib -- sets REN and sends local lockout(LLO) to priv hp-ib
* clr_ren_priv_ib -- clears REN and LLO for priv hp_ib
* poll_priv_ib    -- serial poll of a single priv hp-ib device
* intrpt_priv_ib  -- interrupt routine for byte-in(BI) and byte-out(BO)
* priv_ib_srq --interrupt process routine for priv hp-ib service request
* wrt_priv_ib     -- outputs strings to private hp-ib
*                    returns boolean false if no listening device
* wrt_priv_ib_source -- outputs strings to private hp-ib source
*                    returns boolean false if no listening device
* read_priv_ib    -- outputs a request to private hp_ib/awaits respond
* syntax_check_priv_ib -- checks if string (a function) if valid syntax
*********************************************************************
*
*  The private hp-ib is NOT A PROCESS, it runs on the stack of the call-
* ing or interrupted process. The private hp-ib is a shared resource and
* at the time when it is requested, its avaliblity will be check.
* If not available, the calling process will be suspended. (see kernel
* description -- accquire and release). The actual I/O will be done
* by interrupt I/O of buffers. The calling procedure will be suspended
* till I/O buffer is finished (awaiting a "signal"). The interrupt
* routine will sent the signal when the buffer is finish.
*
*  The private hp_ib_srq is handled seperate from the private hp_ib. The
* hardware is serperate and in manys ways the function is also.
* A private hp_ib srq when serviced will cause the priv_ib_srq
```

```
SPRIVIB.WORK.PD8510            THU, DEC 22, 1983, 10:54 AM     PAGE   2


* PROCESS to start, which will poll the private ib and determine the
* cause.
*********************************************************************
*  The device identifing will be via a logical unit table (LUN) were the
* actual private hpi-ib address held.  This allows changes of addresses
* to occur at a single point and the calling routines to use constant
* values.
*
*   The private hp-ib will before doing a addressing sequence checking
* what happen in the past and if the no changes are need it will skip
* the addressing sequence and save time.
*
*   Also, there is an active function table for each priv hp-ib device
* so that they are signified by constants and not strings, and if
* requested function is the active function, it will not be send.
*
*********************************************************************
*   The drivers below will set up a series of commands and buffers
* that contain the sequence of events to occur on the private hp-ip
* Once these commands and buffers are setup, the driver procedures
* will start the interrupt program and the drivers will wait tilled
* signaled. The interrupt program will,on each interrupt, decide what
* next to be done, and do it until the command list is exhaused, when
* it will send the finished signal.
*   The commands are 1)send address data, 2)read data, 3)write data,
* 4)null, and 5)finished. There can and normally will be more than
* one command in a sequence. The buffers are the source or destenation
* for data if any.
*********************************************************************
end of comment;
```

```
SPRIVIB.WORK.PD8510            THU, DEC 22, 1983, 10:54 AM     PAGE   3


#EJECT;
#FILE cprivib.work;
#FILE fkernel.work;
#FILE fkernel2.work;
#FILE fkernel3.work;
#FILE fkernel4.work;
#FILE ffifo.work;
#FILE fintrpt.work;
#FILE cids.work;
#FILE crins.work;
#FILE cdebug.work;                                        &debug&
#FILE fterm.work;                                         &debug&
#FILE futil.work;                          & for priv_ib_lun_table &
#FILE flunplus.work;               & for save_ and recall_lunplus &
#FILE fmbngr.work;
```

```
SPRIVIB.WORK.PD8510          THU, DEC 22, 1983, 10:54 AM     PAGE  4

#EJECT;
COMMENT
*************************************************************************
*INTERNAL SPEC for variable used by priv_ib
*
* valid_listener        boolean flag for returning hp_ib bus errors
* priv_ib_command       array holding info on nature of information trans
* cmd_ton               array(str) holding address sequence where private
*                         hp_ib is talker and  someone else listener
* cmd_lon               array(str) holding address sequence where private
*                         hp_ib is listener and someone else talker
* cmd_spd               array(str) holding address sequence for spd
* cmd_ctr               index for priv_ib_command
* item_ctr              index for item in data arrays (priv_ib_data_ptr)
* priv_ib_ptr_buf       contains address of buffers of data(in/out)
* priv_ib_data_ptr      pointer use to address data buffers
* priv_ib_last_address  storage location of last address device
* priv_ib_lun_table     lookup table of lun to actual address
* priv_ib_act_fun_table table of last active function for given lun
* priv_ib_fun_table     table of address to active fun number to string
*                            lookup tables for given lun
* fifo_sup_brk          fifo storage area for storage of srq sweep
*                            status message from source
*
*  IMPLICIT VARIABLES
* lun   -- logical unit number -- values range from 1 to lun_max
*                                        0=null (issues '? as listen add)
* fun   -- active function number -- values range from 1 to ??
*                                        -1=no active function selection
*                                           (doesn't change active fun)
*                                        -2=no active function selection
*                                           (next active fun won't match)
*************************************************************************
end of comment;

INTEGER CONSTANT commands_max:=5;
BOOLEAN  valid_listener;
GLOBAL INTEGER  valid_priv_luns;
BYTE ARRAY priv_ib_command[0:commands_max];
BYTE ARRAY cmd_ton[0:5],cmd_lon[0:3],cmd_spd[0:3];
INTEGER cmd_ctr,item_ctr;
DOUBLE ARRAY priv_ib_ptr_buf[0:commands_max-1];
BYTE POINTER priv_ib_data_ptr;
BYTE priv_ib_last_address;
BYTE CONSTANT     set_latn:=1,set_ton:=2,ascii_data:=4;
INTEGER CONSTANT latn_bit:=0,ton_bit:=1,ascii_bit:=2;
BYTE CONSTANT     null_cmd:=%FF,finish_cmd:=0,
                  send_address:=ascii_data + set_ton  +  set_latn,
                  write_data:=  ascii_data + set_ton,
                  read_data:=   ascii_data;
BYTE CONSTANT     finish_handshake:=3,handshake_holdoff_on_eoi_eos:=%86,
                  handshake_holdoff_on_eoi:=%82,
                  handshake_holdoff_on_all:=%81,
                  talker_only:=%80,listen_only:=%40;
BYTE CONSTANT     power_on_clr:=0,power_on_reset:=2,clk_4Mhz:=%24,
                  enable_bi_bo_err:=7;
```

```
SPRIVIB.WORK.PD8510          THU, DEC 22, 1983, 10:54 AM     PAGE  5

BYTE CONSTANT    untalk:=%5F,unlisten:='?,spe:=%18,spd:=%19,lf:=10;
INTEGER CONSTANT sdc:=%4,llo:=%11,get:=%8;

ALPHA TABLE priv_ib_fun_list :=
                    "FR","FB","CF","DF","ST","PL","CW", &source&
                    "SV","RC","S3","SF","TL","SN","S1",
                    "SWO","SW1","DUO","DU1","SL1","SLO",
                    "OI","PE","IC","MX","A1","A2","RM", &test set&
                    "PR","PR";                           &plotter&

BYTE ARRAY priv_ib_act_fun_table[1:lun_max];

INTEGER CONSTANT null:=0;
BYTE CONSTANT byte_zero:=0;

INTEGER CONSTANT swp_brk_fifo_size:=5;
GLOBAL INTEGER ARRAY fifo_swp_brk[-6:swp_brk_fifo_size];

BYTE io=%FFFFFE01;
BYTE BITFIELD misc_io_status=io+%A0:
              priv_ib_lsrq_sense,priv_ib_ldav_sense,
              misc_io_status_not_used(3);
EXTERNAL BYTE BITFIELD flag1_save:
              priv_ib_latn,priv_ib_lren,priv_ib_lifc;

BYTE flag1=io+%A8;
BYTE priv_ib=io+%40;
BYTE priv_ib_data=priv_ib+%0,
     priv_ib_status1=priv_ib+%2,priv_ib_status2=priv_ib+%4,
     priv_ib_ir_mask1=priv_ib+%2,priv_ib_ir_mask2=priv_ib+%4,
     priv_ib_serial_poll_status=priv_ib+%6,
     priv_ib_add_status=priv_ib+%8,priv_ib_add_mode=priv_ib+%8,
     priv_ib_aux=priv_ib+%A,
     priv_ib_address0=priv_ib+%C,priv_ib_address1=priv_ib+%E,
     priv_ib_eos_code=priv_ib+%E;

PROCEDURE get_next_cmd;                                     FORWARD;
```

```
SPRIVIB.WORK.PD8510          THU, DEC 22, 1983, 10:54 AM     PAGE  6

#EJECT;
COMMENT *****************************************************************
* acquire_priv_ib and release_priv_ib are for doing the kernel functions
* and handling the enable/disabling of priv_ib_srq. This must be done
* to prevent a priv_ib_srq from being serviced while the priv_ib is
* being used -- possible suspend of the active process
*
* The disable must be done before and after the acquire because it is
* an interruptable operation that could re_enable the srq after the
* the disenable but before the acquire finished
*************************************************************************
end of comment;
SUBROUTINE acquire_priv_ib;
    BEGIN irdis(private_ib_srq_vctr);
          acquire(priv_ib_resource);
          irdis(private_ib_srq_vctr);
          cmd_ctr:=0;
    END  acquire_riv_ib;


SUBROUTINE release_priv_ib;
    BEGIN
          release(priv_ib_resource);
          preempt;
          iren(private_ib_srq_vctr);
    END release_priv_ib;
```

```
SPRIVIB.WORK.PD8510          THU, DEC 22, 1983, 10:54 AM     PAGE  7

#EJECT;
COMMENT
*************************************************************************
* start_and_wait_priv_ib does the final setup of the command lists for
*    the interrupt handler of private hp_ib.
*
*  Set all unused commands in the command list to the finish_cmd.
*  Initialize cmd_ctr and call get_next_cmd which will start up the
*    interrupt handler -- if needed.
*  Wait for the finished signal.
*  Set up cmd_ctr so that another command list could be generated.
*************************************************************************
end of comment;
SUBROUTINE start_and_wait_priv_ib;
    BEGIN
    WHILE cmd_ctr <= commands_max  DO
        BEGIN
        priv_ib_command[cmd_ctr]:=finish_cmd;
        cmd_ctr:=cmd_ctr + 1;
        END while;
    cmd_ctr:=-1;

    get_next_cmd;

    wait(priv_ib_signal);
    cmd_ctr:=0;
    END start_and_wait_priv_ib;

COMMENT
*************************************************************************
* start_wait_and_release_priv_ib does a start_and_wait and went finish
*        realeases the private hp_ib.
*
*************************************************************************
end of comment;
SUBROUTINE start_wait_and_release_priv_ib;
    BEGIN
    start_and_wait_priv_ib;
    release_priv_ib;
    END start_wait_and_release_priv_ib;
```

```
SPRIVIB.WORK.PD8510          THU, DEC 22, 1983, 10:54 AM     PAGE  8

$EJECT;
COMMENT
****************************************************************************
* ton_priv_ib sets up the needed private hp_ib commands in the command
*    list, so that a private hp_ib device is addressed to listen and
*    the priv_ib is ready to talk -- it will also sent an universal
*    command, if requested.
*
* NOTE: if listening device is already addressed, the re-addressing
*       will be skipped.
****************************************************************************
* Look up and create the proper ascii addressing code for the logic
*       unit number requested.
* IF address code has changed since last time
*     THEN create a proper adressing sequence
*            save new address for checking next time
* ELSE place the null action code in the command list
* IF an univeral command request
*     THEN tack the code request on the end of the address sequence
*            in case the command code was null,make it send_addressing
* Bump the command counter by 1
****************************************************************************
end of comment;
PROCEDURE ton_priv_ib(lun,extra_cmd); VALUE lun,extra_cmd;
                                     INTEGER lun,extra_cmd;

   BEGIN
   BYTE priv_ib_address,extra_cmd_byte=extra_cmd + 1;

   priv_ib_ptr_buf[cmd_ctr]:=ADRS(cmd_ton);
   priv_ib_address:=TURN(priv_ib_lun_table[lun],%E0,%20);
   IF priv_ib_address#priv_ib_last_address THEN
      BEGIN
      cmd_ton[1]:=unlisten;
      cmd_ton[2]:=(priv_ib_last_address:=priv_ib_address);
      cmd_ton[3]:=untalk;
      cmd_ton[0]:=3;
      priv_ib_command[cmd_ctr]:=send_address;
      END if
   ELSE
      BEGIN
      cmd_ton[0]:=0;
      priv_ib_command[cmd_ctr]:=null_cmd;
      END else;
   IF extra_cmd#0 THEN
      BEGIN
      cmd_ton[0]:=cmd_ton[0]+1;
      cmd_ton[cmd_ton[0]]:=extra_cmd_byte;
      priv_ib_command[cmd_ctr]:=send_address;
      IF priv_ib_out_debug THEN BEGIN WSTR("IBcmd:");          &debug&
            WHex( lun , 2 ); WHex( extra_cmd , 2 ); CRLF; END; &debug&
      END if;
   cmd_ctr:=cmd_ctr+1;
   END ton_priv_ib;


COMMENT
```

```
SPRIVIB.WORK.PD8510          THU, DEC 22, 1983, 10:54 AM     PAGE  9

****************************************************************************
* lon_priv_ib sets up the neccessary commands in the command list
*    so that the request device on the private hp_ib will become a
*    talker.
*
* NOTE: if the deivce is already a talker, the raddressing sequence
*       will be skipped.
****************************************************************************
* Look up and create the proper ascii addressing code for the logic
*       unit number requested.
* IF address code has changed since last time
*     THEN create a proper adressing sequence
*            save new address for checking next time
* ELSE place the null action code in the command list
* Bump the command counter by 1
****************************************************************************
end of comment;
PROCEDURE lon_priv_ib(lun); VALUE lun; INTEGER lun;
   BEGIN
   BYTE priv_ib_address;

   priv_ib_ptr_buf[cmd_ctr]:=ADRS(cmd_lon);
   priv_ib_address:=TURN(priv_ib_lun_table[lun],%E0,%40);
   IF priv_ib_address#priv_ib_last_address THEN
      BEGIN
      cmd_lon[1]:=unlisten;
      cmd_lon[2]:=(priv_ib_last_address:=priv_ib_address);
      cmd_lon[0]:=2;
      priv_ib_command[cmd_ctr]:=send_address;
      END if
   ELSE  priv_ib_command[cmd_ctr]:=null_cmd;
   cmd_ctr:=cmd_ctr+1;
   END lon_priv_ib;
```

```
SPRIVIB.WORK.PD8510          THU, DEC 22, 1983, 10:54 AM     PAGE  10

$EJECT;
COMMENT
****************************************************************************
* get_priv_priv_ib_lun and set_priv_ib_lun allow access to the outer
*    world of the mapping of lun to actual private hp_ib adresses.
*
* these functions are used for a few other items that are tied to the
*    instrument, and not to save/recall or preset states, such as
*    public hp-ib addresses, request mask, etc.
*
****************************************************************************
end of comment;
INTEGER PROCEDURE get_priv_ib_lun(lun); VALUE lun; INTEGER lun; ENTRY;
   get_priv_ib_lun:=priv_ib_lun_table[lun];

PROCEDURE set_priv_ib_lun(lun,new_add); VALUE lun,new_add;
                                        INTEGER lun; BYTE new_add;ENTRY;

   BEGIN & set_priv_ib_lun &
      IF lun <= lun_max THEN
         priv_ib_lun_table[lun] := new_add;
      save_lunplus;                       & save the priv_ib_lun_table &
   END;  & set_priv_ib_lun &


COMMENT
****************************************************************************
* reset_priv_ib_act_funs clears the memory on the last active function
* sent to a particular lun -- need for power on and should be cleared
* if any priv_ib pass though is done( devices effected but not table )
****************************************************************************
end of comment;                                                    ENTRY;
PROCEDURE reset_priv_ib_act_funs;
   BEGIN
   INTEGER index;
   FOR index := 1 TO lun_max DO
      priv_ib_act_fun_table[ index ] := no_fun ;
   END reset_priv_ib_act_funs;
```

```
SPRIVIB.WORK.PD8510          THU, DEC 22, 1983, 10:54 AM     PAGE  11

$EJECT;
COMMENT
****************************************************************************
* EXTERNAL SPEC for clr_priv_ib
*
*    FUNCTION: sent a selective device clear to selected priv_ib device
*
* DECLARATION INFO:
*    PROCEDURE clr_priv_ib(lun)
*         VALUE lun   INTEGER lun
*       INPUT: lun  -- logical unit number on the private hp_ib
*
*  EXTERNAL EFFECTS:
*     The private hp_ib will be acquired for duration, and the calling
*          process will be suspended also for duration.
*     The selected device will be effect in some way ??
*     The active device may be changed.
****************************************************************************
* INTERNAL SPEC
*  acquire the private hp_ib
*  set up the needed addressing sequence with a selective device clr
*  transmit and when done return and release priv_ib
****************************************************************************
end of comment;
PROCEDURE clr_priv_ib(lun); VALUE lun; INTEGER lun;                ENTRY;
   BEGIN
   acquire_priv_ib;
   ton_priv_ib(lun,sdc);
   start_wait_and_release_priv_ib;
   END clr_priv_ib;

COMMENT
****************************************************************************
* EXTERNAL SPEC for trig_priv_ib
*
*   FUNCTION: sent a group execute trigger to selected priv_ib device
*
* DECLARATION INFO:
*    PROCEDURE trig_priv_ib(lun)
*         VALUE lun   INTEGER lun
*       INPUT: lun  -- logical unit number on the private hp_ib
*
*  EXTERNAL EFFECTS:
*     The private hp_ib will be acquired for duration, and the calling
*          process will be suspended also for duration.
*     The selected device will be effect in some way ??
*     The active device may be changed.
****************************************************************************
* INTERNAL SPEC
*  acquire the private hp_ib
*  set up the needed addressing sequence with a group execute trigger
*  transmit and when done return and release priv_ib
****************************************************************************
end of comment;
PROCEDURE trig_priv_ib(lun); VALUE lun; INTEGER lun;               ENTRY;
   BEGIN
```

```
   acquire_priv_ib;
   ton_priv_ib(lun,get);
   start_wait_and_release_priv_ib;
   END trig_priv_ib;
```

```
#EJECT;
COMMENT
***********************************************************************
* EXTERNAL SPEC for set_ren_priv_ib
*
*    FUNCTION: set ren true and sent a local lockout to priv_ib
*
* DECLARATION INFO:
*    SUBROUTINE set_ren_priv_ib
*
*  EXTERNAL EFFECTS:
*     The private hp_ib will be acquired for duration, and the calling
*          process will be suspended also for duration.
*     The priv_ib now has REN tue and future address sequence will cause
*           devices to go to remote and return to local inhibited (llo).
***********************************************************************
* INTERNAL SPEC
*  acquire the private hp_ib
*  set up the needed sequence to sent local lockout - no addressing need_
*  transmit and when done return and release priv_ib
***********************************************************************
end of comment;
SUBROUTINE set_ren_priv_ib;                                       ENTRY;
   BEGIN
   acquire_priv_ib;
   priv_ib_lren:=0; flag1:=flag1_save;
   ton_priv_ib(not_used_lun,llo);
   start_wait_and_release_priv_ib;
   END set_ren_priv_ib;


COMMENT
***********************************************************************
* EXTERNAL SPEC for clr_ren_priv_ib
*
*  FUNCTION: clr (set false) REN -- which also clears local lockout
*
* DECLARATION INFO
*    SUBROUTINE clr_ren_priv_ib
***********************************************************************
end of comment;
SUBROUTINE clr_ren_priv_ib;                                       ENTRY;
   BEGIN
   priv_ib_lren:=1; flag1:=flag1_save;
   END set_ren_priv_ib;
```

```
#EJECT;
COMMENT
***********************************************************************
*EXTERNAL SPEC for poll_priv_ib
*
*   FUNCTION:conducts a serial poll on the selected private hp_ib device
*
*   DECLARATION INFO
*      INTEGER PROCEDURE poll_priv_ib(lun)
*         VALUE lun    INTEGER lun
*       INPUT: lun  -- logical unit number on the private hp_ib
*       OUTPUT:poll_priv_ib -- return value -- serial poll status
*
*  EXTERNAL EFFECTS:
*     The private hp_ib will be acquired for duration, and the calling
*          process will be suspended also fur duration.
*     The active device may be changed.
*     The status byte of the lun will be read and probably cleared
***********************************************************************
* INTERNAL SPEC
*  acquire private hp_ib
*  set_up an addressing sequence including Serial Poll Enable
*  set up read buffer location in command list
*  set up Serial Poll Disanble command sequence
*  start sequences and wait till finish
*  return value
*  release private hp_ib
***********************************************************************
* TIMING INFO 1mS highlevel interrupt and get_next_cmd
end of comment;
INTEGER PROCEDURE poll_priv_ib_sub(lun); VALUE lun; INTEGER lun;
   BEGIN
   BYTE ARRAY poll_result[-1:2];

   priv_ib_last_address:=unlisten;
   lon_priv_ib(lun);
   cmd_lon[0]:=3;
   cmd_lon[3]:=cmd_lon[2];
   cmd_lon[2]:=spe;

   poll_result[-1]:=1;
   priv_ib_command[cmd_ctr]:=read_data;
   priv_ib_ptr_buf[cmd_ctr]:=ADRS(poll_result);
   cmd_ctr:=cmd_ctr + 1;

      &cmd_spd setup in init&
   priv_ib_command[cmd_ctr]:=send_address;
   priv_ib_ptr_buf[cmd_ctr]:=ADRS(cmd_spd);
   cmd_ctr:=cmd_ctr+1;

   start_and_wait_priv_ib;

   & acculmulate status bits?? &
   IF priv_ib_poll_debug THEN BEGIN WSTR("Poll:");WHEX(lun);     &debug&
                                 WHEX(poll_result[1]); CRLF;END;&debug&
```

```
   poll_priv_ib_sub:=INTEGER(poll_result[1]) AND %OFF;
   END poll_priv_ib_sub;


COMMENT
***********************************************************************
end of comment;
INTEGER PROCEDURE poll_priv_ib(lun); VALUE lun; INTEGER lun;      ENTRY;
   BEGIN
   INTEGER response;

   acquire_priv_ib;
   IF TBIT( valid_priv_luns , lun )
     THEN response := poll_priv_ib_sub( lun )
   ELSE
      BEGIN
         warn(priv_ib_add_err);
         response := 0;
      END;
   release_priv_ib;
   poll_priv_ib := response ;
   END poll_priv_ib;
```

```
SPRIVIB.WORK.PD8510             THU, DEC 22, 1983, 10:54 AM      PAGE  16

#EJECT;
COMMENT
************************************************************************
INTERNAL SPEC for get_next_cmd
*   determine for command list what the state of the private hp_ib
*     hardware should be in or if finished send the finish signal
*
*   NOTE:these hardware commands will cause interrupts to occur
*        and the interrupts will transfer the buffer contents
************************************************************************
*   search command list for next non-null_cmd
*   if next_cmd is finished THEN sent finished signal and preempt
*                                     ( make sure all regs are pushed )
*   ELSE set ATN true to prevent bus activity
*        depending on nature of command set talker only or listener only
*                  set end on eos and eoi or just eoi
*                  set atn true or false
*        enable bi_bo_err interrupts
************************************************************************
******** TIMING INFO 250uS -- ASSEMBLE CODE ?????***********************
end of comment;
PROCEDURE get_next_cmd;
   BEGIN
   BYTE next_cmd;

   DO cmd_ctr:=cmd_ctr+1
      UNTIL (next_cmd:=priv_ib_command[cmd_ctr]) # null_cmd;

   item_ctr:=0;


   IF next_cmd = finish_cmd THEN
      BEGIN
      priv_ib_ir_mask1:=byte_zero;
      send(priv_ib_signal);
      preempt;
      END
   ELSE
      BEGIN
      STPNTR(priv_ib_data_ptr,priv_ib_ptr_buf[cmd_ctr]);
      DO &null& UNTIL priv_ib_ldav_sense; &let previous talker finish&
      priv_ib_latn:=0; flag1:=flag1_save;

      priv_ib_aux:=finish_handshake;
      IF TBIT(next_cmd,ton_bit) THEN priv_ib_add_mode:=talker_only
                                &will cause immediate bo&
                                &however priv_ib interrupts should&
                                &be disable/inhibited at this time&
      ELSE priv_ib_add_mode:=listen_only;
      priv_ib_aux:=power_on_clr;

      IF TBIT(next_cmd,ascii_bit) THEN
         BEGIN
         priv_ib_eos_code:=lf;
         priv_ib_aux:=handshake_holdoff_on_eoi_eos;
         END if
```

```
SPRIVIB.WORK.PD8510             THU, DEC 22, 1983, 10:54 AM      PAGE  17

      ELSE priv_ib_aux:=handshake_holdoff_on_eoi;

      IF TBIT(next_cmd,latn_bit) THEN priv_ib_latn:=0
      ELSE priv_ib_latn:=1;
      flag1:=flag1_save;

      priv_ib_ir_mask1:=enable_bi_bo_err;
      END else;

   END get_next_cmd;
```

```
SPRIVIB.WORK.PD8510             THU, DEC 22, 1983, 10:54 AM      PAGE  18

#EJECT;
COMMENT
************************************************************************
* INTERNAL SPEC for intrpt_priv_ib
*  Service the private hp_ib interrupts and signal waiting processes
*       went done
************************************************************************
* read private hp_ib status and re_enable m68000 interrupts (note:
*        9519 fence is still set so that lower interrupts are inhibited
* IF bi is cause THEN
*    THEN update buffer length
*         if buffer is full -- inhibit future inputs
*         fetch and store data into buffer -note- new bi may now occur
* ELSE IF err THEN
*             not vaild listner -- therefore terminate output
*             send warning message
* ELSE *must have been bo -- only bi,bo enabled/cannot? occur together*
*      IF buffer not empty THEN output next byte -new bo may now occur
* IF end condition has occur 1)EOI on input , 2)input buffer full
*                            3)output buffer empty
*      get next command from command list
* acknouldge priv_ib interrupt -- dropping 9519 fence
************************************************************************
* TIMING INFO
*      approx 100 uSec/byte out/in
*         interrupt          6+            To improve assemble code
*         save reg/setup M   20            the coding section
*         code               50            AND cut down on the reg/M
*         irack               5            save  -- need about 4
*         restore reg/m      20            Would need to be careful
*         RTE                 5            about BSR/JSR reg use
*  get_next_command is about 250uS and needs improvement
************************************************************************
                         < QUESTIONS:
                           1. Should CR/LF be deleted ( or any nonprint
                              ing Char) from input data? (in ASCII mode
                           2. Should EOI be sent (in ASCII mode) on EOS
end of comment;
INTERRUPT intrpt_priv_ib;                                         ENTRY;
   BEGIN
   INTEGER bug_mark = %0CA;  &DEBUG&
   BYTE BITFIELD status_temp:end,dec,err,bo,bi;

   bug_mark := %1234;        &DEBUG&
   status_temp:=priv_ib_status1;
   ASSEMBLE( ANDI =HF8FF,SR); &enable higher interrupts&
   status_temp:=status_temp OR priv_ib_status1; &pickup end bit&

   item_ctr:=item_ctr+1;


   IF bi THEN
      BEGIN
      priv_ib_data_ptr[0]:=item_ctr;
      IF item_ctr>=priv_ib_data_ptr[-1] THEN
         BEGIN
```

```
SPRIVIB.WORK.PD8510             THU, DEC 22, 1983, 10:54 AM      PAGE  19

         end:=1;
         priv_ib_aux:=handshake_holdoff_on_all;
         END if;
      priv_ib_data_ptr[item_ctr]:=priv_ib_data;
      END if bi
   ELSE IF err THEN
      BEGIN  .
      end:=1;
      valid_listener := FALSE;
      warn(priv_ib_add_err);
      priv_ib_aux:=power_on_clr;     &temp ??&
      END else err
   ELSE &must be bo ?&
      BEGIN
      IF item_ctr<=priv_ib_data_ptr[0] THEN
         priv_ib_data:=priv_ib_data_ptr[item_ctr]
      ELSE end:=1;
      END else bo;

& error checking for no listener at this address ???? &

   IF end THEN get_next_cmd;

   bug_mark := 0;               &DEBUG&
   ASSEMBLE( ORI =H0700,SR);     &DISABLE  INTERRUPTS TILL RTE&
   irack(private_ib_vctr);

   END intrpt_priv_ib;
```

```
$EJECT;
COMMENT
*************************************************************************
* EXTERNAL SPEC for init_priv_ib
*
* FUNCTION: initailize the private hp_ib after power on or restart
*           to function as the controller on the private hp_ib bus
*
* DECLARATION INFO
*      PROCEDURE init_priv_ib
*         INPUT/OUTPUT: none
*
* EXTERNAL EFFECTS
*      halts and resets the private hp_ib
*      sends an IFC to all private hp_ib devices -- unaddressing then
*      resets the active fun tables, priv_ib resource id and signals
*************************************************************************
* INTERNAL SPEC
*      set the private at 4Mhz clock with bi_bo irq NOT enabled
*      REN and ATN set true and IFC pulsed true
*      clear out active function tables, and setup cmd_spd
*      initailize signals and resources and fifos
*************************************************************************
end of comment;
PROCEDURE init_priv_ib;                                        ENTRY;
  BEGIN

   priv_ib_aux:=power_on_reset;
   priv_ib_ir_mask1:=byte_zero;
   priv_ib_ir_mask2:=byte_zero;
   priv_ib_aux:=clk_4Mhz;
   priv_ib_aux:=power_on_clr;

   priv_ib_lren:=0;
   priv_ib_latn:=0;

   priv_ib_lifc:=0;        flag1:=flag1_save;
   REPEAT 25 DO TRAP(refresh_vctr); & min IFC pulse width  >100uS &
   priv_ib_lifc:=1;   flag1:=flag1_save;

   recall_lunplus;                       & recall the priv_ib_lun_table &
   priv_ib_last_address:=unlisten;
   valid_priv_luns  := 0;
   reset_priv_ib_act_funs;
   cmd_spd[0]:=2;
   cmd_spd[1]:=spd;
   cmd_spd[2]:=untalk;          &is this needed?&
   signal_init(priv_ib_signal,0);
   resource_init(priv_ib_resource);

   END init_priv_ib;
```

```
$EJECT;
COMMENT
*************************************************************************
*  EXTERNAL SPEC for wrt_priv_ib
*    FUNCTION:an active function,if selected and str (usually data)
*             is written via private hp_ib to selected device
*
*  DECLARATION INFO
*    BOOLEAN PROCEDURE wrt_priv_ib(lun,fun,str)
*         VALUE lun,fun,str
*         INTEGER lun,fun   ALPHA str
*    INPUT: lun  -- logical unit number on the private hp_ib
*           fun  -- active function select code
*           str  -- str to be outputted after active function and
*    OUTPUT: wrt_priv_ib
*              False if no listening device, True if there is
*
*  EXTERNAL EFFECTS:
*    The private hp_ib will be acquired for duration, and the calling
*        process will be suspended also for duration.
*    The active device and its active function may be changed.
*************************************************************************
* INTERNAL SPEC
* acquire  private hp_ib
* set boolean flag true
* setup the address sequence need for a write
* IF active request is valid and different then last time
*    THEN set up command list for active fun
*         look up in active function table apporiate str to output
*         remember new acrive function for next time
* ELSE set command list o null function
* IF str has length -- not null
*    THEN set up command list to output string
* ELSE set command list to null function
* bump command list counter by 1
* start transmitting command list and wait till finish
* release private hp_ib
* Return boolean
*************************************************************************
end of comment;
PROCEDURE wrt_priv_ib_sub(lun,fun,str); VALUE lun,fun,str;
                      INTEGER lun,fun; ALPHA str;

   BEGIN
   DOUBLE fun_adr;
   ALPHA  fun_ptr = fun_adr;
   DOUBLE address_str=str;

   ton_priv_ib(lun,null);

   IF fun>=0 AND fun # priv_ib_act_fun_table[lun]  THEN
      BEGIN
          priv_ib_act_fun_table[lun]:=fun;
          priv_ib_command[cmd_ctr]:=write_data;
          fun_ptr :=  priv_ib_fun_list[fun] ;
          priv_ib_ptr_buf[cmd_ctr]:=fun_adr;
          IF priv_ib_out_debug THEN BEGIN WSTR("fun=");          &debug&
```

```
                                   WSTR(fun_ptr); END;    &debug&
      END
   ELSE IF fun = clr_fun THEN
      BEGIN & else if &
        priv_ib_act_fun_table[lun] := no_fun;
        priv_ib_command[cmd_ctr]:=null_cmd;
      END & else if &
   ELSE
      priv_ib_command[cmd_ctr]:=null_cmd;
   cmd_ctr:=cmd_ctr+1;

   IF LENGTH(str)#0 THEN
      BEGIN
        priv_ib_command[cmd_ctr]:=write_data;
        priv_ib_ptr_buf[cmd_ctr]:=address_str;
        IF priv_ib_out_debug THEN BEGIN WSTR(str); CRLF; END;   &debug&
      END if
   ELSE  priv_ib_command[cmd_ctr]:=null_cmd;
   cmd_ctr:=cmd_ctr+1;
   END wrt_priv_ib_sub;


BOOLEAN PROCEDURE wrt_priv_ib(lun,fun,str); VALUE lun,fun,str;
                    INTEGER lun,fun; ALPHA str;              ENTRY;
   BEGIN
   acquire_priv_ib;
   valid_listener := TRUE;
   wrt_priv_ib_sub(lun,fun,str);
   start_and_wait_priv_ib;
   IF valid_listener THEN valid_priv_luns :=SBIT( valid_priv_luns, lun )
                      ELSE valid_priv_luns :=RBIT( valid_priv_luns, lun);
   wrt_priv_ib    := valid_listener;
   release_priv_ib;
   END wrt_priv_ib;

BOOLEAN PROCEDURE wrt_priv_ib_source(fun,str);      VALUE fun,str;
                    INTEGER fun; ALPHA str;                     ENTRY;
   BEGIN
   wrt_priv_ib_source := wrt_priv_ib(source,fun,str);
   END ;
```

```
$EJECT;
COMMENT
*************************************************************************
*  EXTERNAL SPECICATION FOR read_priv_ib
*
*  FUNCTION: will request an output item from the private HP_IB device
*            and read as string the response.
*
*  DECLARATION INFO:
*    ALPHA PROCEDURE read_priv_ib(lun,fun,outstr,instr)
*         VALUE lun,fun,outstr,instr
*         INTEGER lun,fun   ALPHA outstr,instr
*    INPUT: lun  -- logical unit number on the private hp_ib
*           fun  -- active function select code
*           outstr -- str to be outputted after active function and
*                        before reading begins
*           instr  -- str where the result is to be stored
*    OUTPUT:read_priv_ib -- str where the result was stored
*                        same as instr
*
*  EXTERNAL EFFECTS:
*    The private hp_ib will be acquired for duration, and the calling
*        process will be suspended also for duration.
*    The active device and its active function may be changed.
*************************************************************************
*  INTERNAL SPEC
*  after acquiring the private hp_ib , the command list for outputting
*      the active function and any extra output string will be done
*  then the command list for the read operation is set_up
*  After the total command list is set up, the transfer is started
*************************************************************************
end of comment;
ALPHA PROCEDURE read_priv_ib(lun,fun,outstr,instr);
               VALUE lun,fun,outstr,instr;  INTEGER lun,fun;
                      ALPHA outstr,instr;                      ENTRY;
BEGIN
   DOUBLE add_instr = instr;
   BYTE POINTER bp  = instr;

   acquire_priv_ib;
   wrt_priv_ib_sub(lun,fun,outstr);

   lon_priv_ib(lun);

   priv_ib_command[cmd_ctr]:=read_data;
   priv_ib_ptr_buf[cmd_ctr]:=add_instr;
   cmd_ctr:=cmd_ctr+1;
   IF TBIT( valid_priv_luns , lun )
       THEN start_and_wait_priv_ib
   ELSE
       BEGIN
       warn(priv_ib_add_err);
       bp[ 0 ] := 0;
       END;

   IF priv_ib_in_debug THEN WSTR(instr);                       &debug&
```

```
SPRIVIB.WORK.PD8510              THU, DEC 22, 1983, 10:54 AM      PAGE  24

   release_priv_ib;
   read_priv_ib:=instr;
   END read_priv_ib;
```

```
SPRIVIB.WORK.PD8510              THU, DEC 22, 1983, 10:54 AM      PAGE  25

#EJECT;
COMMENT
************************************************************************
*
* EXTERNAL SPEC for syntax_check_priv_ib
*
* FUNCTION:  verifies that the HP_IB listner
*            understand a particular command string. Used in determining
*            capablities of device  -- phase_lock vs open_looped source
*
* DECLARATION INFO
*       BOOLEAN PROCEDURE syntax_check_priv_ib(lun,str)
*          VALUE lun,str
*          INTEGER lun     ALPHA str
*
*       INPUT: lun  -- logical unit number on the private hp_ib
*              str  -- str containing syntax to be check
*       OUTPUT: syntax_check_priv_ib -- calling name returns if
*                       a syntax error was not caused
*
*  EXTERNAL EFFECTS:
*     The private hp_ib will be acquired for duration, and the calling
*         process will be suspended also for duration.
*     The active device may be changed.
************************************************************************
* INTERNAL SPEC
*
* output to the selected device, the desired string
* output addition spaces (blanks) to force hardware delay till the
*        prevoius string has been completely processed
* via serial poll check the syntax invalid status bit
* send selective device clear to clear syntax error, output requests,
*        or whatever caused by the outputted string
************************************************************************
end of comment;
BOOLEAN PROCEDURE syntax_check_priv_ib(lun,str);
                              VALUE lun,str;  INTEGER lun; ALPHA str;
                                                            ENTRY;
   BEGIN
   acquire_priv_ib;
   wrt_priv_ib_sub(lun,no_fun,str);
   start_and_wait_priv_ib;
   wrt_priv_ib_sub(lun,no_fun,"  ");&make sure recieving device has str&
   start_and_wait_priv_ib;
   syntax_check_priv_ib:=NOT TBIT( poll_priv_ib_sub(lun) ,5);
                              &bit number may not be valid for all lun&
   ton_priv_ib(lun,sdc);
   priv_ib_act_fun_table[lun]:=no_fun;
   start_wait_and_release_priv_ib;
   END syntax_check_priv_ib;
```

```
SPRIVIB.WORK.PD8510              THU, DEC 22, 1983, 10:54 AM      PAGE  26

#EJECT;
COMMENT
end of comment;
PROCEDURE priv_ib_srq;                        &priv_ib_srq process& ENTRY;
   BEGIN
   INTEGER poll,
           count;
   INTEGER CONSTANT rsv                 := 6,
                    source_settled      := 3,
                    source_syntax_err   := 5,
                    test_set_temp_err   := 0,
                    test_set_unable     := 2,
                    test_set_settled    := 3,
                    test_set_syntax_err := 5;
   INTEGER CONSTANT max_count := 10;

   iradr(ADRS(intrpt_priv_ib_srq),private_ib_srq_vctr);
                                                              & DEBUG &
   COMMENT needs to be able to handle SRQ asserted upon entry.  As it
   is now, it will not service an SRQ until all SRQs are unasserted and
   then one or more are reasserted.;

loop:
   waitio(private_ib_srq_vctr);

   count := 0;

   DO  & must loop until no srq since srq is wired-or &
      BEGIN
      IF NOT priv_ib_lsrq_sense THEN                        & 0 = TRUE &
         IF TBIT( (poll := poll_priv_ib(source)), rsv ) THEN
            BEGIN
            IF TBIT(poll,source_settled)
               THEN write_fifo(fifo_swp_brk,poll);
            IF TBIT(poll,source_syntax_err)
               THEN warn(source_ib_err);
            END;

      IF NOT priv_ib_lsrq_sense THEN                        & 0 = TRUE &
         IF TBIT( (poll := poll_priv_ib(test_set)), rsv ) THEN
            BEGIN & test set &
            IF TBIT( poll, test_set_settled ) THEN
               send( test_set_ready );
            IF TBIT( poll, test_set_syntax_err ) THEN
               warn( test_set_ib_err );
            IF TBIT( poll, test_set_temp_err ) THEN
               warn( test_set_overtemp );
            IF TBIT( poll, test_set_unable ) THEN
               warn( illegal_test_set_operation );
            END;  & test set &

      count := count + 1;
      END
   UNTIL ( priv_ib_lsrq_sense OR (count > max_count) );    & _sense is &
                                                          &   0 true. &
   IF NOT priv_ib_lsrq_sense THEN                          &  0 = TRUE &
```

```
SPRIVIB.WORK.PD8510              THU, DEC 22, 1983, 10:54 AM      PAGE  27

      warn( priv_ib_srq_err );

   & acculmulate status bits &

   & BE CAREFUL not to poll a device that is not connected &

   GO TO loop;

   END priv_ib_srq;


SUBROUTINE init_swp_brk_fifo;                                     ENTRY;
   BEGIN
      init_fifo( fifo_swp_brk,
                 swp_brk_fifo_size,
                 swp_brk_fifo,
                 swp_brk_fifo_not_full,
                 swp_brk_fifo_not_empty );
   END;

END$
```

```
FPRIVIB2.WORK.PD8510          THU, DEC 22, 1983, 10:54 AM     PAGE   1

PROCEDURE set_priv_ib_lun(lun,new_add); VALUE lun,new_add;
                                 INTEGER lun; BYTE new_add;      EXTERNAL;
INTEGER PROCEDURE get_priv_ib_lun(lun); VALUE lun; INTEGER lun;EXTERNAL;
PROCEDURE trig_priv_ib(lun); VALUE lun; INTEGER lun;            EXTERNAL;
SUBROUTINE set_ren_priv_ib;                                     EXTERNAL;
SUBROUTINE clr_ren_priv_ib;                                     EXTERNAL;
INTERRUPT intrpt_priv_ib;                                       EXTERNAL;
PROCEDURE priv_ib_srq;              &priv_ib_srq process&       EXTERNAL;
PROCEDURE reset_priv_ib_act_funs;                               EXTERNAL;
```

```
FPRIVIB3.WORK.PD8510          THU, DEC 22, 1983, 10:54 AM     PAGE   1

PROCEDURE reset_priv_ib_act_funs;                               EXTERNAL;
INTEGER PROCEDURE poll_priv_ib(lun); VALUE lun; INTEGER lun;    EXTERNAL;
BOOLEAN PROCEDURE syntax_check_priv_ib(lun,str);
                                 VALUE lun,str;  INTEGER lun; ALPHA str;
                                                                EXTERNAL;
```

```
FPROCS.WORK.PD8510            THU, DEC 22, 1983, 10:54 AM     PAGE   1

SUBROUTINE proc0;         EXTERNAL.L;
SUBROUTINE proc1;         EXTERNAL.L;
SUBROUTINE proc2;         EXTERNAL.L;
SUBROUTINE proc3;         EXTERNAL.L;
SUBROUTINE proc4;         EXTERNAL.L;
SUBROUTINE proc5;         EXTERNAL.L;
SUBROUTINE proc6;         EXTERNAL.L;
SUBROUTINE proc7;         EXTERNAL.L;
SUBROUTINE proc8;         EXTERNAL.L;
SUBROUTINE proc9;         EXTERNAL.L;
SUBROUTINE proc10;         EXTERNAL.L;
SUBROUTINE proc11;         EXTERNAL.L;
SUBROUTINE proc12;         EXTERNAL.L;
  IF (command_token <= 465) AND (command_token > 334) THEN
    proc0 ELSE
  IF (command_token <= 43) AND (command_token > 0) THEN
    proc1 ELSE
  IF (command_token <= 294) AND (command_token > 267) THEN
    proc2 ELSE
  IF (command_token <= 59) AND (command_token > 43) THEN
    proc3 ELSE
  IF (command_token <= 82) AND (command_token > 59) THEN
    proc4 ELSE
  IF (command_token <= 121) AND (command_token > 82) THEN
    proc5 ELSE
  IF (command_token <= 129) AND (command_token > 121) THEN
    proc6 ELSE
  IF (command_token <= 208) AND (command_token > 152) THEN
    proc7 ELSE
  IF (command_token <= 267) AND (command_token > 245) THEN
    proc8 ELSE
  IF (command_token <= 309) AND (command_token > 294) THEN
    proc9 ELSE
  IF (command_token <= 334) AND (command_token > 309) THEN
    proc10 ELSE
  IF (command_token <= 152) AND (command_token > 129) THEN
    proc11 ELSE
  IF (command_token <= 245) AND (command_token > 208) THEN
    proc12 ELSE
  warn(invalid_command);
```

```
CPRTDATA.WORK.PD8510          THU, DEC 22, 1983, 10:54 AM     PAGE   1

INTEGER CONSTANT
  print_freq := 2857,
  print_time := 2871,
  print_aux := 2880,
  c_file_10 := -1;
```

```
CPUBIB.WORK.PD8510                  THU, DEC 22, 1983, 10:54 AM     PAGE  1


COMMENT
  Values for setting serial poll bits for possible SRQ's.
  Each value (power of 2) has a bit set corresponding to
  its SRQ bit.  There are up to 16 possible SRQ reasons.
;                                                    *
INTEGER CONSTANT

  bit0   := 1,
  key_pressed_srq   := 2,
  bit2   := 4,
  bit3   := 8,
  bit4   := %10,
  hardware_fail_srq := %20,
  bit6   := %40,
  bit7   := %80,
  problem_srq       := %100,
  entry_complete_srq:= %200,
  power_on_srq      := %400,
  op_failed_srq     := %800,
  op_complete_srq   := %1000,
  syntax_error_srq  := %2000,
  RQS_srq           := %4000,
  extended_status_srq:=%8000;
```

```
FPUBIB.WORK.PD8510                  THU, DEC 22, 1983, 10:55 AM     PAGE  1


EXTERNAL INTEGER
  serial_poll_status.L,         & 2 bytes of serial poll status       &
  serial_poll_ext.L;            & backup status for pending SRQ       &

SUBROUTINE clear_serial_poll;                                  EXTERNAL.L;
PROCEDURE set_serial_poll (status);
  VALUE status; INTEGER status;                                EXTERNAL.L;
PROCEDURE request_mask (spoll_mask);
  VALUE spoll_mask; INTEGER spoll_mask;                        EXTERNAL.L;

BOOLEAN PROCEDURE input_block(dest,length,src_type,dest_type);
  VALUE dest,src_type,dest_type;
  DOUBLE dest; INTEGER length,src_type,dest_type;              EXTERNAL.L;

EXTERNAL BOOLEAN remote;
SUBROUTINE local_key;                                          EXTERNAL.L;
SUBROUTINE update_hpib_leds;                                   EXTERNAL.L;
PROCEDURE set_major_address (addr); VALUE addr; BYTE addr;     EXTERNAL.L;
PROCEDURE set_minor_address (addr); VALUE addr; BYTE addr;     EXTERNAL.L;

PROCEDURE pass_thru_command (cmd_char);
  VALUE cmd_char;  BYTE cmd_char;                              EXTERNAL.L;

PROCEDURE hpib_listener;                                       EXTERNAL.L;
```

```
SPUBIB.WORK.PD8510                  THU, DEC 22, 1983, 10:55 AM     PAGE  1


M68KL,P,"pubIB"

BEGIN

@FILE fterm.work;                                                  & DEBUG $
#FILE fterm2.work;                                                 & DEBUG &
#FILE cdebug.work;                                                 & DEBUG &
#FILE futil3.work;
#FILE cmessag0.work;
#FILE cmsgib.work;
#FILE foutib2.work;
#FILE fprivib.work;
#FILE fprivib2.work;
#FILE flunplus.work;
#FILE cdguser.work;
#FILE fcontrol.work;
#FILE ffifo.work;
#FILE ffifos.work;
#FILE cids.work;
#FILE crins.work;
#FILE fkernel.work;
#FILE fkernel4.work;
#FILE fdguser.work;
#FILE cparser.work;
#FILE coutput.work;
#FILE fdispram.work;
#FILE fsize.work;

BYTE CONSTANT irack_item := %78+public_ib_vctr;

INTEGER CONSTANT
      BI   := 0,
      BO   := 1,
      ERR  := 2,
      DVC  := 3,
      EOI  := 5,
      RSV  := 6,
      REMC := 1,
      LLOC := 2,
      SPC  := 3,
      REM  := 4,
      LLO  := 5,
      MJMN := 0,
      TA   := 1,
      LA   := 2,

      ext_status    := 7,          & bit indicating extended status byte &

      remote_LED    := 0,
      listen_LED    := 1,
      talk_LED      := 2,
      SRQ_LED       := 3;

GLOBAL INTEGER
  serial_poll_status,           & 2 bytes of serial poll status        &
```

```
SPUBIB.WORK.PD8510                  THU, DEC 22, 1983, 10:55 AM     PAGE  2


  serial_poll_ext;              & backup status for pending SRQ        &

INTEGER
  inbuf_word,                   & word buffer to write to display RAM  &
  serial_poll_mask,             & mask bits to enable serial poll SRQs &
  inbuf_ptr,                    & input data block buffer pointer      &
  block_in_lgth;                & input data block length (# bytes)    &

INTEGER POINTER inbuf;          & input data block read dest. (listen) &

BYTE io_base              = %FFFFFE01,
     int_status1_enable = io_base+%22,
     int_status2_enable = io_base+%24,
     int_status1_reg    = io_base+%22,
     int_status2_reg    = io_base+%24,
     serial_poll_reg    = io_base+%26,
     aux_register       = io_base+%2A,
     data_in_reg        = io_base+%20,
     data_out_reg       = io_base+%20,
     address_mode       = io_base+%28,
     address_status     = io_base+%28,
     address_reg        = io_base+%2C,
     HPIB_LEDs          = io_base+%80,

     MSByte_in          = inbuf_word,
     LSByte_in          = inbuf_word+1,

     SP_byte            = serial_poll_status,
     SP_mask            = serial_poll_mask;

BOOLEAN
  EOI_found,                    & flag indicating EOI found w/ data    &
  BI_pending,                   & flag indicating residual data byte   &
  stop_parse,                   & flag  to stop parsing BI bytes       &
  block_io;                     & flag to buffer BI data bytes         &

GLOBAL BOOLEAN
  command_pass_thru,            & flag indicating pass thru option     &
  remote;                       & determines remote/local state        &

COMMENT
  The following variables are used by the public HPIB interrupt routine
  in order to speed up interrupt processing by using in-line calls to
  the send(signal) subroutine
;
EXTERNAL INTEGER ARRAY counter[0:max_rin];
EXTERNAL BYTE ARRAY link[0:max_rin];
EXTERNAL INTEGER ready;         & change to DOUBLE if max_process > 15 &
INTEGER POINTER talker,listener;
INTEGER talk_process, listen_process;
```

```
#EJECT;
& DEBUG SUBROUTINES &

SUBROUTINE output_debug;
BEGIN
  WSTR("Abort blk out:"); WHEX(outbuf_ptr); CRLF;
END output_debug;

PROCEDURE block_in_debug (dest, lgth);
  VALUE dest, lgth;  DOUBLE dest;  INTEGER lgth;
BEGIN
  WSTR ("INPUT BLOCK @ "); WHex (dest,8); WHEX(lgth);
  WSTR(" bytes"); CRLF;
END block_in_debug;
```

```
#EJECT;
COMMENT
$DOC+

NAME--
  update_hpib_leds
**********************************************************************
*
* SHORT DESCRIPTION--
*   turns on/off talk/listen HPIB LEDs
*
* EXTENDED DESCRIPTION--
*   Updates the "talk" and "listen" LEDs according to the HPIB chip's
*   (8291) address status register.  HPIB address state changes are not
*   triggered by interrupts in efforts to speed up other public HPIB
*   interrupts and bypass the extra check for addressing changes.
*   Instead, a clock routine, INTRPT_TIC, calls this routine every
*   ??? usecs to turn on/off the talk/listen LEDs according to the
*   chip's address status register, ADDRESS_STATUS (memory mapped).
*
* INPUTS--   none
*
* OUTPUTS--  none
*
* ROUTINES CALLED-- none
*
* ERROR CONDITIONS AND RECOVERY--
*
* NOTES--
*   68K registers should not be used unless they are saved and
*   restored in INTRPT_TIC.
*
* AUTHOR--
*
**********************************************************************
*
* INITIAL REFINEMENT--
*   Check address status register of 8291:
*   If listen bit is set then turn on listen LED
*   Else turn off listen LED
*   If talk bit is set then turn on talk LED
*   Else turn off talk LED
*
**********************************************************************
*
* REVISION LOG--
*
**********************************************************************
DECLARATION--
;
SUBROUTINE update_hpib_leds;                                  ENTRY;
&
$DOC-&

BEGIN
  IF TBIT(address_status,LA) THEN
```

```
    HPIB_LEDs := RBIT(HPIB_LEDs,listen_LED)  & turn on listen LED &
  ELSE
    HPIB_LEDs := SBIT(HPIB_LEDs,listen_LED); & turn off listen LED&
  IF TBIT(address_status,TA) THEN
    HPIB_LEDs := RBIT(HPIB_LEDs,talk_LED)    & turn on talk LED   &
  ELSE
    HPIB_LEDs := SBIT(HPIB_LEDs,talk_LED);   & turn off talk LED  &
END update_hpib_leds;
```

```
#EJECT;
COMMENT
$DOC+

NAME--
  set_major_address
**********************************************************************
*
* SHORT DESCRIPTION--
*   set major address in HPIB chip (8291)
*
* EXTENDED DESCRIPTION--
*   Sets the major talk/listen address, ADDR, which is written to the
*   chip's address register, ADDRESS_REG (memory mapped byte variable).
*
* INPUTS--
*   ADDR = byte value parameter representing the major address
*
* OUTPUTS--
*   modified local global, ADDRESS_REG with value of ADDR.
*
* ROUTINES CALLED-- none
*
* ERROR CONDITIONS AND RECOVERY--
*
* NOTES--
*
* AUTHOR--
*
**********************************************************************
*
* INITIAL REFINEMENT--
*   set chip's address register to value of ADDR
*
**********************************************************************
*
* REVISION LOG--
*
**********************************************************************
DECLARATION--
;
PROCEDURE set_major_address (addr); VALUE addr; BYTE addr;      ENTRY;
&
$DOC-&

BEGIN
  address_reg := addr;
END set_major_address;
```

```
$EJECT;
COMMENT
$DOC+

NAME--
  set_minor_address
*************************************************************************
*
* SHORT DESCRIPTION--
*   set minor address in HPIB chip (8291)
*
* EXTENDED DESCRIPTION--
*   Sets the minor talk/listen address, ADDR, which is written to the
*   chip's address register, ADDRESS_REG (memory mapped byte variable).
*   The 8th bit (bit 7) of ADDRESS_REG is set to indicate that a minor
*   address is being set.
*
* INPUTS--
*   ADDR = byte value parameter representing the minor address
*
* OUTPUTS--
*   modified local global, ADDRESS_REG with value of ADDR.
*
* ROUTINES CALLED--
*
* ERROR CONDITIONS AND RECOVERY--
*
* NOTES--
*
* AUTHOR--
*
*************************************************************************
*
* INITIAL REFINEMENT--
*   Set chip's address register with value of ADDR OR'd with 80Hex
*   to indicate the minor talk/listen address.
*
*************************************************************************
*
* REVISION LOG--
*
*************************************************************************
DECLARATION--
;
PROCEDURE set_minor_address (addr); VALUE addr; BYTE addr;        ENTRY;
&
$DOC-&

BEGIN
  address_reg := X80 OR addr;
END set_minor_address;
```

```
$EJECT;
COMMENT
$DOC+

NAME--
  set_serial_poll
*************************************************************************
*
* SHORT DESCRIPTION--
*   set SRQ status bits for public HPIB serial polling
*
* EXTENDED DESCRIPTION--
*   This routine collects incoming SRQ bits that are to be set in the
*   status byte and generate service requests (SRQs) depending on the
*   bits set in the service request mask.  The following variables are
*   used in handling and processing SRQs:
*
*      serial_poll_status: MSByte = status that goes on chip
*                          LSByte = extended status bits
*      serial_poll_mask:   MSByte = status mask assoc. w/ chip
*                          LSByte = extended status mask bits
*      serial_poll_ext:    pending status used to accumulate status bits
*                          while RSV bit set in current status word
*      serial_poll_reg:    R/W byte on chip
*      SP_status:          MSByte of serial_poll_status that goes to chip
*      SP_mask:            MSByte of serial_poll_mask
*
*   If a mask bit unmasks a corresponding status bit then an SRQ is
*   generated by setting the RSV bit in the chip's serial poll register.
*   Since a new status cannot be written to the chip until its SRQ has
*   been serviced (serial polled), then a pending status word,
*   serial_poll_ext, accumulates status bits until the current status
*   byte has been read.
*
* INPUTS--   status = bit pattern of status bits to be written
*
* OUTPUTS--  SRQ on bus if SRQ mask enables any set status bits
*
* ROUTINES CALLED--  none
*
* ERROR CONDITIONS AND RECOVERY--
*
* NOTES--
*
* AUTHOR--
*
*************************************************************************
*
* INITIAL REFINEMENT--
*   if SRQ pending then
*     save serial poll bits in pending status, serial_poll_ext
*   else
*     collect serial poll bits from current and pending status and
*       status just passed in parameter, status
*     clear pending status
*     write current collection of status bits to chip
```

```
*     if status mask unmasks any SRQ bit then
*       check and set extended bit if reason in extended status byte
*       assert SRQ
*
*************************************************************************
*
* REVISION LOG--
*
*************************************************************************
DECLARATION--
;
PROCEDURE set_serial_poll (status);
  VALUE status;  INTEGER status;                              ENTRY;
&
$DOC-&

BEGIN
  IF TBIT(SP_byte,RSV) THEN
  BEGIN
    serial_poll_ext := serial_poll_ext OR status;
    IF spoll_debug THEN
      BEGIN WSTR("Pending stat ="); WHEX(serial_poll_ext); CRLF; END;
  END
  ELSE
    BEGIN
      serial_poll_status := serial_poll_status OR status OR
                            serial_poll_ext;
      IF spoll_debug THEN
      BEGIN
        WSTR("curr stat ="); WHEX(serial_poll_status); CRLF;
        WSTR("stat to set  ="); WHEX(status); CRLF;
        WSTR("pending stat ="); WHEX(serial_poll_ext); CRLF;
      END;
      serial_poll_ext := 0;             & clear copy of status word &
      serial_poll_reg := SP_byte;            & write status to chip &
      IF (serial_poll_mask AND serial_poll_status)<>0 THEN
        BEGIN
          IF spoll_debug THEN
            BEGIN WSTR("send SRQ"); CRLF; END;
          IF (SP_byte AND SP_mask)=0 THEN
            & set bit indicating reason in extended bit &
            SP_byte := SBIT (SP_byte, ext_status);
          serial_poll_reg := SP_byte := SBIT (SP_byte,RSV);
        END;
    END;
END set_serial_poll;
```

```
$EJECT;
COMMENT
$DOC+

NAME--
  clear_serial_poll
*************************************************************************
*
* SHORT DESCRIPTION--
*   clears serial poll SRQ variables
*
* EXTENDED DESCRIPTION--
*   This routine clears the current status byte, extended status byte,
*   and the chip's serial poll register from which the status byte is
*   read, then reissues a new status (if any is in the pending status
*   word, serial_poll_ext.
*
* INPUTS--   none
*
* OUTPUTS--  none
*
* ROUTINES CALLED--
*   set_serial_poll
*
* ERROR CONDITIONS AND RECOVERY--  none
*
* NOTES--
*
* AUTHOR--
*
*************************************************************************
*
* INITIAL REFINEMENT--
*   clear status word (primary and extended)
*   clear serial poll register (primary status byte on chip)
*   If new serial poll status pending then
*     set new serial poll status
*
*************************************************************************
*
* REVISION LOG--
*
*************************************************************************
DECLARATION--
;
SUBROUTINE clear_serial_poll;                                 ENTRY;
&
$DOC-&

BEGIN
  serial_poll_reg := serial_poll_status := 0;
  serial_poll_ext := 0;
  IF spoll_debug THEN
    BEGIN WSTR("status cleared"); CRLF; END;
END;
```

```
SPUBIB.WORK.PD8510              THU, DEC 22, 1983, 10:55 AM     PAGE  11

$EJECT;
COMMENT
$DOC+

NAME--
  request_mask
*************************************************************************
*
* SHORT DESCRIPTION--
*   sets serial polling mask for SRQs
*
* EXTENDED DESCRIPTION--
*   This routine sets the current status mask used to issue SRQs on
*   certain bits set in the status word.  The mask requested is passed
*   as a 16-bit integer whose MSByte contain the primary status byte
*   mask corresponding to the HPIB chip's serial poll register, and the
*   LSByte contain extended information bits which did could not be put
*   the primary status byte.  ANDing the status mask (serial_poll_mask)
*   and the current status word (serial_poll_status) will cause an SRQ
*   on non-zero results.
*
* INPUTS--   spoll_mask = mask used to issue SRQs
*
* OUTPUTS--  serial_poll_mask = mask used to issue SRQs
*
* ROUTINES CALLED-- none
*
* ERROR CONDITIONS AND RECOVERY--
*
* NOTES--
*
* AUTHOR--
*
*************************************************************************
*
* INITIAL REFINEMENT--
*   assign input parameter (spoll_mask) to serial_poll_mask
*
*************************************************************************
*
* REVISION LOG--
*
*************************************************************************
DECLARATION--
;
PROCEDURE request_mask (spoll_mask);
  VALUE spoll_mask; INTEGER spoll_mask;                          ENTRY;
&
$DOC-&

BEGIN
  serial_poll_mask := spoll_mask;
  IF spoll_debug THEN
    BEGIN WSTR("request mask ="); WHEX(spoll_mask); CRLF; END;
END request_mask;
```

```
SPUBIB.WORK.PD8510              THU, DEC 22, 1983, 10:55 AM     PAGE  12

$EJECT;
COMMENT
$DOC+

NAME--
  init_pub_hpib
*************************************************************************
*
* SHORT DESCRIPTION--  initialize HPIB chip (8291) and variables
*
* EXTENDED DESCRIPTION--
*   Initialize various registers in the chip to reset the input line,
*   enable certain interrupts, match the chip's clock speed, set itself
*   to talker/listener addressing mode, enable holdoff on device clear
*   (stop handshake to be later resumed by 68K processor), and execute
*   power on.  Local global (module) variables for serial polling and
*   flagging talk/listen states are also initialized, and HPIB LEDs
*   are all turned off.
*
*   The following interrupts are enabled:
*     GET = group execute trigger     (status1, bit 5)
*     DVC = device clear              (status1, bit 3)
*     ERR = interface error           (status1, bit 2)
*     BO  = byte out                  (status1, bit 1)
*     BI  = byte in                   (status1, bit 0)
*     SPC = serial poll complete      (status2, bit 3)
*     LLOC= local lockout change      (status2, bit 2)
*     REMC= remote/local change       (status2, bit 1)
*
*   This routine is called on power up/instrument preset by the public
*   HPIB listener process, hpib_listener, created by the operating
*   system kernel.
*
* INPUTS--  none
*
* OUTPUTS--
*   Initialized memory mapped 8291 registers:
*     aux_register
*     int_status1_enable
*     int_status2_enable
*     address_mode
*   Initialized HPIB addressing LEDs:
*     HPIB_LEDs
*   Initialized local global variables:
*     remote
*     BI_pending
*     EOI_found
*     device_clear
*
* ROUTINES CALLED--
*   clear_serial_poll
*
* ERROR CONDITIONS AND RECOVERY--
*   none
*
* NOTES--
```

```
SPUBIB.WORK.PD8510              THU, DEC 22, 1983, 10:55 AM     PAGE  13

*
* AUTHOR--
*
*************************************************************************
*
* INITIAL REFINEMENT--
*   pulse RESET input line on chip
*   write interrupt masks to interrupt registers to enable interrupts
*   set chip to talker/listener addressing mode
*   match chip's clock rate to that of the processor
*   enable handshake holdoff on device clear
*   reset chip to power up state
*   clear serial poll register and variables
*   clear talker/listener flags
*
*************************************************************************
*
* REVISION LOG--
*
*************************************************************************
DECLARATION--
;
SUBROUTINE init_pub_hpib;
&
$DOC-&

BEGIN
  aux_register := 2;              & pulse RESET input line &
  int_status1_enable := %2F;      & set interrupt masks    &
  int_status2_enable := %FE;
  address_mode := 1;              & mode 1 addressing      &
  serial_poll_ext := 0;
  clear_serial_poll;
  aux_register := %28;            & match clock            &
  aux_register := %80;            & enable RFD hold on DVC &
  aux_register := 0;              & power on chip          &
  HPIB_LEDs := %FF;               & turn off HPIB LEDs &
  command_pass_thru :=
    remote := BI_pending := EOI_found := device_clear := FALSE;
  & initialize in-line SEND(signal) for interrupt rtn. &
  STPNTR (talker, ADRS(counter[hpib_byte_out]));
  STPNTR (listener, ADRS(counter[hpib_cmd_ready]));
  talk_process := SBIT (%0000, pub_ib_out_id);
  listen_process := SBIT (%0000, pub_ib_in_id);
END init_pub_hpib;
```

```
SPUBIB.WORK.PD8510              THU, DEC 22, 1983, 10:55 AM     PAGE  14

$EJECT;
COMMENT
$DOC+

NAME--                                                    buffer_DG_word
*************************************************************************
*
* SHORT DESCRIPTION--
*   buffers 2 data input bytes read from HP-IB data register
*
* EXTENDED DESCRIPTION--
*   This routine reads input data bytes from the HP-IB data register
*   and buffers 2 bytes at a time in order to write a word into the
*   memory destination located in display RAM (since bytes cannot be
*   written into display RAM).  This routine is used mainly by input
*   data block routines that transfer a block of data from a remote
*   controller to the 8510.  The destination data array generally
*   resides in display RAM.
*
* INPUTS--
*   data_in_reg = (global) input data byte from HP-IB
*
* OUTPUTS--
*   inbuf array = (global) destination array for input data bytes
*
* ROUTINES CALLED--
*   none
*
* ERROR CONDITIONS AND RECOVERY--
*   none
*
* NOTES--
*   Temporary variables are allocated to duplicate global variables
*   that are used by the public HP-IB interrupt so that a copy of
*   these values exist when the interrupt routine changes them
*   after the data byte is read.
*
*   The duplicated variables are INBUF_PTR and INBUF_WORD which
*   respectively points to the next word in the display memory
*   destination and contains the value of that next word.
*
* AUTHOR--
*
*************************************************************************
*
* INITIAL REFINEMENT--
*
*************************************************************************
*
* REVISION LOG--
*
*************************************************************************
DECLARATION--
;
PROCEDURE buffer_DG_word;
&
```

```
SPUBIB.WORK.PD8510            THU, DEC 22, 1983, 10:55 AM     PAGE  15

$DOC-&

BEGIN
  INTEGER temp_ptr, temp_word;
  BYTE temp_byte_in = temp_word + 1;
  temp_ptr := inbuf_ptr;
  IF TBIT(temp_ptr,0) THEN
    BEGIN
      temp_word := inbuf_word;
      temp_byte_in := data_in_reg;
      inbuf[temp_ptr/2] := temp_word;
    END
  ELSE
    MSByte_in := data_in_reg;
END buffer_DG_word;
```

```
SPUBIB.WORK.PD8510            THU, DEC 22, 1983, 10:55 AM     PAGE  16

#EJECT;
COMMENT
$DOC+

NAME--
  empty_parser_FIFO
***********************************************************************
*
* SHORT DESCRIPTION-- empty out public HPIB parser FIFO
*
* EXTENDED DESCRIPTION--
*   This function is a local routine which reads the public HPIB parser
*   FIFO, public_ib_fifo, and writes the value read (lower byte) into an
*   input buffer, INBUF, until the FIFO is empty, the maximum number of
*   input data bytes has been read from the FIFO, or an EOI value,
*   hpib_eoi, had been read from the FIFO.
*   This function is primarily used during a block mode input when the
*   public HPIB is addressed to LISTEN and leading bytes of input data
*   are written into the parser's FIFO before they can be flagged and
*   detoured to be written immediately into the input data buffer.
*
* INPUTS--  none
*
* OUTPUTS--
*   Returns TRUE if an EOI character is encountered in the parser FIFO,
*   returns FALSE otherwise.
*
* ROUTINES CALLED--
*   empty_fifo
*   read_fifo
*
* ERROR CONDITIONS AND RECOVERY--
*   none
*
* NOTES--
*   When emptying the parser's FIFO, only the lower byte of each word
*   read from the FIFO is written to the input buffer.
*
* AUTHOR--
*
***********************************************************************
*
* INITIAL REFINEMENT--
*   While parser FIFO is not empty and EOI value not read do
*     Read FIFO value and put into input buffer, INBUF.
*   Return TRUE if EOI value read, FALSE otherwise.
*
***********************************************************************
*
* REVISION LOG--
*
***********************************************************************
DECLARATION--
;
BOOLEAN PROCEDURE empty_parser_FIFO;
&
```

```
SPUBIB.WORK.PD8510            THU, DEC 22, 1983, 10:55 AM     PAGE  17

$DOC-&

BEGIN
  INTEGER fifo_val;
  & empty public_ib_fifo into destination address &
  fifo_val := 0;
  WHILE NOT empty_fifo(public_ib_fifo) AND (fifo_val <> hpib_eoi) DO
    IF ((inbuf_ptr:=inbuf_ptr+1) <= block_in_lgth) THEN
    BEGIN
      IF (fifo_val:=read_fifo(public_ib_fifo))<>hpib_eoi THEN
        & inbuf[inbuf_ptr] := fifo_val --> pair up bytes for DG RAM &
        IF TBIT(inbuf_ptr,0) THEN
          BEGIN
            LSByte_in := fifo_val;
            inbuf[inbuf_ptr/2] := inbuf_word;
            IF blk_mode_debug THEN
              BEGIN
                WSTR(" FIFO="); WHEX(inbuf_ptr); WHEX(inbuf_word); CRLF;
              END;
          END
        ELSE
          MSByte_in := fifo_val;
    END;
  empty_parser_FIFO := (fifo_val=hpib_eoi);
END empty_parser_FIFO;
```

```
SPUBIB.WORK.PD8510            THU, DEC 22, 1983, 10:55 AM     PAGE  18

#EJECT;
COMMENT
$DOC+

NAME--
  read_hpib
***********************************************************************
*
* SHORT DESCRIPTION-- read input data byte from HPIB chip (8291)
*
* EXTENDED DESCRIPTION--
*   This is a local routine invoked only when public HPIB is addressed
*   to listen and is in an input data block mode.  It updates the input
*   buffer pointer, INBUF_PTR, and checks if the value is less than the
*   specified data block size, BLOCK_IN_LGTH.  If the pointer does not
*   aqual or exceed the number of input data bytes, then the DATA IN
*   register is read from the chip and written to the input data buffer,
*   otherwise a signal is sent to indicate the end of the data transfer.
*   This signal is waited for in the input data block routine,
*   INPUT_BLOCK, invoked by the parser upon parsing an input data block
*   command.
*
* INPUTS--  none
*
* OUTPUTS--  none
*
* ROUTINES CALLED--
*   send
*
* ERROR CONDITIONS AND RECOVERY--
*
* NOTES--
*   The last input data byte is read after the signal has been received
*   indicating the end of the data block has been reached.  At this
*   point, block mode flags are cleared to resume regular parsing and
*   buffer pointers are reset.  (See input_block)
*
* AUTHOR--
*
***********************************************************************
*
* INITIAL REFINEMENT--
*   increment input data buffer pointer
*   if input data buffer pointer < input data block length then
*     read input data byte from chip and put into input data buffer
*   else
*     send signal indicating the end of input data block
***********************************************************************
*
* REVISION LOG--
*
***********************************************************************
DECLARATION--
;
SUBROUTINE read_hpib;
```

```
SPUBIB.WORK.PD8510              THU, DEC 22, 1983, 10:55 AM      PAGE 19

&
$DOC-&

BEGIN
  IF ((inbuf_ptr:=inbuf_ptr+1) < block_in_lgth) AND
     NOT TBIT(address_status,EOI) THEN
    buffer_DG_word
  ELSE
  IF inbuf_ptr = block_in_lgth THEN
    send (block_read_done)
  ELSE
    BI_pending := TRUE;
END read_hpib;
```

```
SPUBIB.WORK.PD8510              THU, DEC 22, 1983, 10:55 AM      PAGE 20

#EJECT;
SUBROUTINE input_data;
BEGIN
  IF BI_pending THEN
    BEGIN
      BI_pending := FALSE;
      read_hpib;
    END;
  wait (block_read_done);
  buffer_DG_word;
  IF NOT TBIT(block_in_lgth,0) THEN
    inbuf[block_in_lgth/2] := inbuf_word;
  IF device_clear THEN
    send (dvc_done);
END input_data;
```

```
SPUBIB.WORK.PD8510              THU, DEC 22, 1983, 10:55 AM      PAGE 21

#EJECT;
BOOLEAN PROCEDURE binary_input (dest, length);
  VALUE dest;  DOUBLE dest;  INTEGER length;
BEGIN
  BOOLEAN EOI_in_FIFO;
  STPNTR(inbuf,dest);
  inbuf_ptr := -1;
  block_in_lgth := length -1;
  IF NOT (EOI_in_FIFO:=empty_parser_FIFO) OR
     (inbuf_ptr < block_in_lgth) THEN
    BEGIN
      block_io := TRUE;
      input_data;
    END;
  binary_input := TBIT(address_status,EOI) OR EOI_in_FIFO
                  OR (inbuf_ptr >= length-1);
END binary_input;
```

```
SPUBIB.WORK.PD8510              THU, DEC 22, 1983, 10:55 AM      PAGE 22

#EJECT;
COMMENT
  Inputs IEEE formatted data points from controller to
  8510 in either 3-word complex or real format (binary).
  IEEE to binary conversion is done on each point after coming over
  the bus and prior to storing the value in its destination array
;
BOOLEAN PROCEDURE IEEE_input (dest, lgth, src_format, dest_format);
  VALUE dest, lgth, src_format, dest_format;
  DOUBLE dest;  INTEGER lgth, src_format, dest_format;
BEGIN
  BOOLEAN
    neg;                           & flag indicating negative value      &
  INTEGER
    debug_lgth,
    bias,                          & IEEE exponent bias for dbl/single   &
    shft,                          & number of bits to shift exponent    &
    exp_size;                      & IEEE dbl/single exponent size       &
  DOUBLE ARRAY
    IEEE_value[0:1];               & conversion buffer for each point    &
  REAL real_value, real_part, imag_part;
  DOUBLE
    exponent,
    dbl_real = real_value,
    mantissa = IEEE_value[0],
    low_mant = IEEE_value[1];
  INTEGER exp = exponent+2, MSWord = IEEE_value[0];
  INTEGER MSreal = real_value, LSreal = real_value + 2;

  &-------------------------------------------------------------&

  SUBROUTINE buffer_data_bytes;
  BEGIN
    inbuf_ptr := -1;
    IF NOT block_io THEN
      BEGIN
        empty_parser_FIFO;
        IF (block_io := (inbuf_ptr < block_in_lgth)) THEN
          input_data;
      END
    ELSE
      input_data;
    IF blk_mode_debug THEN
      BEGIN
        WHEX (debug_lgth - lgth);
        WSTR(" ieee:"); WHex(mantissa,8); WHex(low_mant,8);
      END;
  END buffer_data_bytes;

  &-------------------------------------------------------------&

  REAL SUBROUTINE convert_to_real;     & from IEEE floating pt. format &
  BEGIN
    buffer_data_bytes;
    IF (mantissa = 0) AND (low_mant = 0) THEN
      real_value := 0.0
```

```
    ELSE
      BEGIN
        IF (neg := TBIT (MSWord,15)) THEN
          MSWord := RBIT (MSWord,15);          & clear sign bit &
        exp := RIGHT (MSWord, shft) - bias;
        IF (exp < -128) THEN                   & set to max. neg. value &
          real_value := Z80000080
        ELSE
        IF (exp > 127) THEN                    & set to max. pos. value &
          real_value := Z7FFFFF7F
        ELSE
          BEGIN
            mantissa := (LEFT (mantissa, exp_size)) OR
                        (RIGHT (low_mant, 32-exp_size));
            mantissa := RBIT (mantissa,31);     & clear sign bit &
            mantissa := SBIT (mantissa,30);     & shift back implicit 1 &
            dbl_real := (mantissa AND ZFFFFFF00) OR
                        (exponent AND Z0FF);
            IF neg THEN
              real_value := -real_value;         & floating pt. negate &
          END;
      END;
    convert_to_real := real_value;
    IF blk_mode_debug THEN
      BEGIN WSTR(" real:"); WHex(dbl_real,8); CRLF; END;
  END convert_to_real;

  &------------------------------------------------------------&

  SUBROUTINE convert_to_3_words;
  BEGIN
    real_part := convert_to_real;
    imag_part := convert_to_real;
    & JSR CNV1E_save --- converts 2 reals to 3-word complex &
    ASSEMBLE(
      MOVE.L  real_part,R0;
      MOVE.L  imag_part,R1;
      MOVE.L  dest,R8;
      JSRX    CNV1E_save;
      MOVE.L  R8,dest
    );
  END convert_to_3_words;

  &------------------------------------------------------------&

  BOOLEAN SUBROUTINE block_read_complete;
  BEGIN
    block_read_complete := ((lgth:=lgth-1)<=0) OR device_clear;
  END block_read_complete;

  &------------------------------------------------------------&

  debug_lgth := lgth;
  STPNTR (inbuf, ADRS(IEEE_value));
  & check destination formats &
  IF src_format = output_ieee_single THEN
```

```
    BEGIN
      block_in_lgth := 3;   & byte 0-3 &
      bias := 126;          & -1 for implied 1 shifted back in mant. &
      exp_size := shft := 7;
    END
  ELSE
  IF src_format = output_ieee_double THEN
    BEGIN
      block_in_lgth := 7;   & byte 0-7 &
      bias := 1022;         & -1 for implied 1 shifted back in mant. &
      exp_size := 10;
      shft := 4;
    END;
  IF dest_format = output_from_user3 THEN
    DO
      convert_to_3_words
    UNTIL block_read_complete
  ELSE
  IF dest_format = output_from_integer THEN
    binary_input (dest, lgth)
  ELSE
    warn (command_not_implemented);
  IEEE_input := (lgth <= 0);
END IEEE_input;
```

```
#EJECT;
COMMENT
$DOC+

NAME--
  input_block
*********************************************************************
*
* SHORT DESCRIPTION-- input data block from public HPIB
*
* EXTENDED DESCRIPTION--
*   This is a global function which is called by the public HPIB parser
*   upon parsing a data block mode command.  It sets up block mode flags
*   which prevent data bytes from being written to the parser FIFO and
*   causes them to be written directly into the input data buffer,
*   INBUF.  It also sets up the input data buffer address to be written
*   to via INBUF, and the maximum number of bytes to be written,
*   block_in_lgth.  Leading data bytes which were written to the FIFO
*   before these flags could be set up are read from the FIFO and
*   written to INBUF via the function empty_parser_FIFO.
*
*   If an EOI value is found in the FIFO or the number of data bytes
*   written equals block_in_lgth (empty_parser_FIFO = TRUE) then
*   all block mode flags, buffers, and pointers are reset, and the
*   routine returns the status of the block transfer.  Otherwise, a
*   signal, hpib_read_done, is waited for prior to the afore mentioned
*   re-initializations and status return.  While waiting for the signal
*   signal indicating the completion of the data block transfer, public
*   HPIB "byte in" interrupts (data byte to be read from chip) are
*   processed through the interrupt routine (writes data byte read
*   to INBUF instead of parser FIFO) until an EOI is found or the
*   maximum number of data bytes has been read.
*
* INPUTS--
*   dest = address of input data buffer pointed to by INBUF
*   lgth = max. number of input bytes allowed assigned to BLOCK_IN_LGTH
*
* OUTPUTS--
*   status of block transfer:
*     lgth = variable parameter returning number of actual bytes read
*     input_block = boolean function value indicating whether or not
*       EOI was included in the input data block
*
* ROUTINES CALLED--
*   empty_parser_FIFO
*   wait
*   send
*
* ERROR CONDITIONS AND RECOVERY--
*   none
*
* NOTES--
*   If the entire input block was not read from the FIFO, then the
*   last data byte is read after the hpib_read_done signal is received
*   and all flags and pointers have been reset.  This holds off further
*   "byte in" interrupts until the end of the routine before returning
```

```
*   to the public HPIB parser.
*   If the device clear flag is set then a signal is sent at the end of
*   the routine indicating that the data block transfer is complete
*   regardless of whether or not all the input data bytes have been
*   transferred.
*
* AUTHOR--
*
*********************************************************************
*
* INITIAL REFINEMENT--
*   set up input data buffer and maximum block length (in bytes)
*   set flags to write data from chip to input buffer instead of parser
*   empty parser FIFO into input buffer
*   if end of data block then reset flags and pointers
*   else wait for end of data block and then reset flags and pointers
*
*********************************************************************
*
* REVISION LOG--
*
*********************************************************************
DECLARATION--
;
BOOLEAN PROCEDURE input_block(dest,length,dest_type,src_type);
  VALUE dest,dest_type,src_type;
  DOUBLE dest; INTEGER length,dest_type,src_type;               ENTRY;
&
$DOC-&

BEGIN
  INTEGER save_lgth,                          & # points being input &
          byte_factor;             & # bytes to divide to get # points &
  input_block := FALSE;
  stop_parse := TRUE;
  IF blk_mode_debug THEN
    block_in_debug (dest, length);
  IF (src_type = output_binary) THEN
    input_block := binary_input (dest, length)
  ELSE
  IF src_type = output_ascii THEN
    warn (command_not_implemented)
  ELSE  & IEEE format &
    BEGIN
      byte_factor := IF src_type=output_ieee_single THEN 4 ELSE 8;
      IF dest_type = output_from_user3 THEN
        byte_factor := 2*byte_factor    & complex IEEE needs real/imag &
      ELSE
      IF dest_type = output_from_integer THEN
        byte_factor := 2;
      save_lgth := length := length/byte_factor;
      IF length <> number_of_points THEN
        warn (block_input_length_error)
      ELSE
        BEGIN
          input_block := IEEE_input (dest,length,src_type,dest_type);
```

```
        IF length < 0 THEN length := 0;
      END;
    & return in "length" the number of bytes actually input &
    length := byte_factor * (save_lgth-length);
  END;
stop_parse := block_io := FALSE;
IF (BI_pending) OR (inbuf_ptr > block_in_lgth) THEN
  BEGIN                      & non-input data byte in chip &
    BI_pending := FALSE;
    send (hpib_cmd_ready);
  END;
IF blk_mode_debug THEN
  BEGIN WSTR("end input"); CRLF; END;
END input_block;
```

```
$EJECT;
COMMENT
$DOC+

NAME--
  pass_thru_command
***********************************************************************
*
* SHORT DESCRIPTION--
*   passes data byte from public HPIB through to private HPIB
*
* EXTENDED DESCRIPTION--
*   (still going thru changes in definition/implementation)
*   -1 = pass thru to plot to user display
*
* INPUTS--   public HPIB data in register
*
* OUTPUTS--  none
*
* ROUTINES CALLED--
*
* ERROR CONDITIONS AND RECOVERY--
*
* NOTES--
*
* AUTHOR--
*
***********************************************************************
*
* INITIAL REFINEMENT--
*
***********************************************************************
*
* REVISION LOG--
*
***********************************************************************
DECLARATION--
;
PROCEDURE pass_thru_command (cmd_char);
  VALUE cmd_char;  BYTE cmd_char;                              ENTRY;
&
$DOC-&

BEGIN
  BYTE TABLE cmd_byte := 1,0;
  cmd_byte[1] := cmd_char;
  IF NOT command_pass_thru THEN
    BEGIN
      command_pass_thru := TRUE;
      abort_sweep;                          & stop private bus activity &
      COMMENT
      IF system is in 'local' THEN  ???
        put system in 'remote'      ???
      ;
    END;
  IF priv_ib_lun_table[priv_ib_pass] = user_display_address THEN
```

```
    parse_user_graphics (cmd_char)
  ELSE
    wrt_priv_ib (priv_ib_pass, no_fun, ADRS(cmd_byte));
  IF pass_thru_debug THEN
    BEGIN
      WSTR("pass thru: "); WCHAR(cmd_byte[1]);
      CRLF;
    END;
END pass_thru_command;
```

```
$EJECT;
SUBROUTINE pass_thru_done;
BEGIN
  & put system back in remote ???? &
  command_pass_thru := FALSE;
  reset_priv_ib_act_funs;   & is this done on a 'local' ??? &
  restart_sweep;
  IF pass_thru_debug THEN
    BEGIN WSTR("end pass thru"); CRLF; END;
END;
```

```
SPUBIB.WORK.PD8510            THU, DEC 22, 1983, 10:55 AM      PAGE  31

$EJECT;
COMMENT
$DOC+

NAME--
  public_HPIB
************************************************************************
*
* SHORT DESCRIPTION-- processes interrupts from public HPIB
*
* EXTENDED DESCRIPTION--
*   This interrupt routine reads the two interrupt status registers from
*   the HPIB chip (8291), saves them in temporary variables and checks
*   the following bits for the interrupt reason and responds accordingly
*
*     DVC  = (status 1, bit 3)   device clear
*            set device clear flag
*            send signal, hpib_cmd_ready, to listener process,
*            HPIB_listener
*     BO   = (status 1, bit 1)   byte out
*            if output byte in chip then write another one to chip
*            (addressed to talk = sets 1st byte out interrupt, therefore
*            wait for 1st byte to be written by another routine before
*            before writing another byte to the chip)
*     BI   = (status 1, bit 0)   byte in
*            if block mode then
*              read data byte from chip to input data buffer
*            else
*              send signal, hpib_cmd_ready, to listener process,
*              HPIB_listener
*     REMC = (status 2, bit 1)   remote/local change
*            set remote flag and light remote LED if in remote
*            otherwise turn off remote LED
*     SPC  = (status 2, bit 3)   serial poll complete
*            clear primary status byte
*
*   Sending signals via "send" routine are done in-line in order to
*   maximize the speed of processing interrupts.
*
* INPUTS--   none
*
* OUTPUTS--  none
*
* ROUTINES CALLED--  none
*
* ERROR CONDITIONS AND RECOVERY--
*   none
*
* NOTES--
*   No subroutines/procedures calls are made from this routine unless
*   they use only registers 0,7-9.
*   Address state change interrupts are not enabled in order to gain
*   speed in processing more important interrupts and bypassing the
*   extra interrupt bit check used primarily to turn on/off HPIB LEDs.
*   Since access to the chip's address status register does not destroy
*   that register's contents, the system clock routine is used to update
```

```
SPUBIB.WORK.PD8510            THU, DEC 22, 1983, 10:55 AM      PAGE  32

*   the talk/listen LEDs according to the talk/listen bits set in that
*   register.
*   Unfortunately, there is no way of treating remote/local state
*   changes similarly since that information is found in the interrupt
*   status word whose value is reset once it is read.
*
* AUTHOR--
*
************************************************************************
*
* INITIAL REFINEMENT--
*   read interrupt status registers 1 and 2
*   if device clear bit is set then
*     set device clear flag and send signal to listening process
*   if byte in bit is set then
*     read chip if block mode is in effect
*     otherwise send signal to listeneing process (which reads chip)
*   if byte out bit is set then
*     write to chip if chip has already been written to
*   if remote/local change then
*     set remote flag and light remote LED if remote bit set
*     otherwise turn off remote LED
*
************************************************************************
*
* REVISION LOG--
*
************************************************************************
DECLARATION--
;
USE REGISTER 0,7-9;

INTERRUPT public_hpib;
&
$DOC-&

BEGIN

  BYTE status1,status2, ircmd1 = io_base+%92;
  INTEGER loc2 = %0CA,
          loc3 = %0CC,
          loc1 = %0C8;
  loc1 := %ABCD;
  status1 := int_status1_reg;
  status2 := int_status2_reg;
  IF pub_ib_debug THEN
  BEGIN
    WSTR("STAT 1 ="); WHEX(status1);
    WSTR(" STAT 2 ="); WHEX(status2); CRLF;
    WSTR("ADDR STAT ="); WHEX(address_status);
    WSTR("SER POLL ="); WHEX(serial_poll_reg); CRLF;
  END;

  IF TBIT (status1, DVC) THEN
    BEGIN
      IF ib_int_debug THEN
```

```
SPUBIB.WORK.PD8510            THU, DEC 22, 1983, 10:55 AM      PAGE  33

        BEGIN WSTR("DVC"); CRLF; END;
      device_clear := TRUE;
      & send (hpib_cmd_ready) &
      IF (listener := listener+1) <= 0 THEN
        ready := ready OR listen_process;    & must be uninterruptible &
    END;

  IF TBIT (status1,BI) THEN
    BEGIN
      IF ib_int_debug THEN
        BEGIN WSTR("BI"); CRLF; END;
      COMMENT --- may not be needed
      IF (TBIT (address_status, AJMN)) THEN
        GO TO pass_cmd;
      IF byte_avail THEN
        BEGIN  & abort block output transfer &
          byte_avail := FALSE;
          status1 := RBIT (status1,BO);
          IF outbuf_ptr < block_out_lgth THEN
          BEGIN
            & send (block_write_done) &
            IF (counter[block_write_done]:=counter[block_write_done]+1)
              <= 0 THEN
              BEGIN
                ASSEMBLE( MOVE   SR,-(S) );      & save status word &
                ASSEMBLE( ORI    =H0700,SR);     & disable interrupts &
                ready := SBIT (ready,link[block_write_done]);
                ASSEMBLE( MOVE   (S)+,SR );      & restore status word &
              END;
            outbuf_ptr := block_out_lgth;
          END;
        END;
      IF block_io THEN   & input data block &
      BEGIN
        IF ((inbuf_ptr:=inbuf_ptr+1) < block_in_lgth) AND
          NOT TBIT(address_status,EOI) THEN
          & inbuf[inbuf_ptr] := data_in_reg &
          IF TBIT(inbuf_ptr,0) THEN
            BEGIN
              LSByte_in := data_in_reg;
              inbuf[inbuf_ptr/2] := inbuf_word;
            END
          ELSE
            MSByte_in := data_in_reg
        ELSE
        IF inbuf_ptr = block_in_lgth THEN
          & send (block_read_done) &
          BEGIN
            IF (counter[block_read_done]:=counter[block_read_done]+1)<=0
            THEN
            BEGIN
              ASSEMBLE( MOVE   SR,-(S) );      & save status word &
              ASSEMBLE( ORI    =H0700,SR);     & disable interrupts &
              ready := SBIT (ready,link[block_read_done]);
              ASSEMBLE( MOVE   (S)+,SR );      & restore status word &
            END;
```

```
SPUBIB.WORK.PD8510            THU, DEC 22, 1983, 10:55 AM      PAGE  34

            END
          ELSE
            BI_pending := TRUE;
        END
        ELSE
        pass_cmd:
          & send (hpib_cmd_ready) &
          IF (listener := listener+1) <= 0 THEN
            ready := ready OR listen_process;  & must be uninterruptible &
      END;

  IF TBIT (status1,BO) THEN
  BEGIN
    IF ib_int_debug THEN
      WSTR("BO:");
    IF byte_avail THEN
    BEGIN
      IF (outbuf_ptr:=outbuf_ptr+1) < block_out_lgth THEN
        data_out_reg := outbuf[outbuf_ptr]
      ELSE
      IF outbuf_ptr = block_out_lgth THEN
        BEGIN
          data_out_reg := outbuf[outbuf_ptr];
          & send (block_write_done) &
          IF (counter[block_write_done]:=counter[block_write_done]+1)<=0
            THEN
            BEGIN
              ASSEMBLE( MOVE   SR,-(S) );      & save status word &
              ASSEMBLE( ORI    =H0700,SR);     & disable interrupts &
              ready := SBIT (ready,link[block_write_done]);
              ASSEMBLE( MOVE   (S)+,SR );      & restore status word &
            END;
        END;
      IF BO_debug THEN
        IF outbuf_ptr > block_out_lgth THEN
        BEGIN
          WSTR("?");
          CRLF;
        END;
    END
    ELSE
      & send(hpib_byte_out) &
      IF (talker:=talker+1) <= 0 THEN
        ready := ready OR talk_process;       & must be uninterruptible &
  END;

  IF TBIT (status2, REMC) THEN
  BEGIN
    IF ib_int_debug THEN
      BEGIN WSTR("REMC"); CRLF; END;
    IF (remote:=TBIT (status2, REM)) THEN
      HPIB_LEDs := RBIT(HPIB_LEDs,remote_LED)   & turn on remote LED &
    ELSE
      HPIB_LEDs := SBIT(HPIB_LEDs,remote_LED);  & turn off remote LED &
  END;
```

```
  IF TBIT (status2, SPC) THEN
  BEGIN  & generated only in response (read serial poll status) to SRQ &
    IF ib_int_debug THEN
      BEGIN WSTR("SPC"); CRLF; END;
    SP_byte := serial_poll_reg := 0;         & clear status byte &
    IF serial_poll_ext <> 0 THEN             & get new status    &
      BEGIN
        serial_poll_status := serial_poll_status OR serial_poll_ext;
        serial_poll_reg := SP_byte;
        serial_poll_ext := 0;
        IF (serial_poll_mask AND serial_poll_status) <> 0 THEN
          serial_poll_reg := SP_byte := SBIT(SP_byte,RSV);
      END;
  END;

  loc1 := 0;
  ircnd1 := irack_item;                      & re_enable HPIB interrupts &
END pub_hpib;

USE REGISTER 0-13;
```

```
$EJECT;
COMMENT
$DOC+

NAME--
  reset_hpib
***********************************************************************
*
* SHORT DESCRIPTION--
*   processes device clear interrupt
*
* EXTENDED DESCRIPTION--
*   This is a local routine which aborts any HPIB block I/O in progress,
*   writes a device clear value to the public HPIB parser FIFO, clears
*   serial poll information, and finishes the handshake held off by the
*   device clear interrupt.
*   A wait on the signal, dvc_done, allows any current data block
*   transfers to finish and return to calling parser routines whether or
*   not all bytes were transferred before finishing the handshake
*   between controller and addressee.
*
* INPUTS--  none
*
* OUTPUTS--
*   possible incomplete data block transfer
*
* ROUTINES CALLED--
*   send
*   wait
*   write_fifo
*   clear_serial_poll
*
* ERROR CONDITIONS AND RECOVERY--
*   none
*
* NOTES--
*   Signals are sent to abort data block transfers since waits for these
*   signals are set up immediately after data block I/O flags have been
*   set to read/write directly to/from chip on each BI/BO interrupt.
*   Therefore, partial data block transfers may result if a device clear
*   were to occur before the transfer is completed.
*
* AUTHOR--
*
***********************************************************************
*
* INITIAL REFINEMENT--
*   If inputting data block then
*     send block_read_done signal to abort data transfer and
*     wait for signal indicating data transfer has been aborted
*   IF outputting data block then
*     send block_write_done signal to abort data transfer and
*     wait for signal indicating data transfer has been aborted
*   write device clear value to public HPIB parser FIFO
*   clear serial poll information
*   complete handshake between controller and talker/listener
```

```
*
***********************************************************************
*
* REVISION LOG--
*
***********************************************************************
DECLARATION--

;
SUBROUTINE reset_hpib;
&
$DOC-&

BEGIN
  IF block_io AND (inbuf_ptr < block_in_lgth) THEN
    BEGIN      & abort receiving data block &
      send (block_read_done);
      wait (dvc_done);
      IF blk_mode_debug THEN
        BEGIN WSTR("Input aborted"); CRLF; END;
    END;
  IF byte_avail THEN
    BEGIN
      byte_avail := FALSE;
      IF outbuf_ptr < block_out_lgth THEN
        BEGIN      & abort sending data block &
          send (block_write_done);
          wait (dvc_done);
          block_out_lgth := 0;
          IF blk_mode_debug THEN
            BEGIN WSTR("Output aborted"); CRLF; END;
        END
    END;
  write_fifo (public_ib_fifo, hpib_dcl);
  device_clear := FALSE;
  clear_serial_poll;
  serial_poll_mask := serial_poll_ext := 0;
  aux_register := %0F;              & continue from RFD holdoff &
END reset_hpib;
```

```
$EJECT;
COMMENT
$DOC+

NAME--
  local_key
***********************************************************************
*
* SHORT DESCRIPTION--  responds to [LOCAL] key entry
*
* EXTENDED DESCRIPTION--
*   Sets HPIB chip (8291) to return to local mode, then clears the
*   chip to enable it to exit local mode once it is addressed to listen.
*   This is all done by setting control and command bits in the chip's
*   auxiliary register, AUX_REGISTER (memory mapped byte variable):
*     1101 = return to local,  0101 = clear local
*
* INPUTS--   none
*
* OUTPUTS--  none
*
* ROUTINES CALLED-- none
*
* ERROR CONDITIONS AND RECOVERY-- none
*
* NOTES--
*
* AUTHOR--
*
***********************************************************************
*
* INITIAL REFINEMENT--
*   set return to local mode on 8291 via auxiliary register
*   set exit local mode on 8291 via auxiliary register
*
***********************************************************************
*
* REVISION LOG--
*
***********************************************************************
DECLARATION--

;
SUBROUTINE local_key;                                          ENTRY;
&
$DOC-&

BEGIN
  aux_register := %D;   & return to local &
  aux_register := %5;   & clear local mode&
  IF byte_avail THEN
    BEGIN                               & abort block output transfer &
      byte_avail := FALSE;
      IF outbuf_ptr < block_out_lgth THEN
        BEGIN
          send (block_write_done);
          block_out_lgth := 0;
```

```
SPUBIB.WORK.PD8510            THU, DEC 22, 1983, 10:55 AM     PAGE  39

        END;
      IF BO_debug THEN
        output_debug;
    END
  ELSE
  IF block_io AND (inbuf_ptr < block_in_lgth) THEN  & abort input xfer &
    send (block_read_done);
  & flush out parser fifo here ??? &
  write_fifo (public_ib_fifo, hpib_dcl);
  IF command_pass_thru THEN
    pass_thru_done;
END;
```

```
SPUBIB.WORK.PD8510            THU, DEC 22, 1983, 10:55 AM     PAGE  40

$EJECT;
COMMENT
$DOC+

NAME--
  hpib_listener
**********************************************************************
*
* SHORT DESCRIPTION--
*   processes HPIB device clear and byte in interrupts
*
* EXTENDED DESCRIPTION--
*   This routine is a scheduled process created by the main host
*   software.  It initializes various public HPIB variables through
*   calls to initialization routines and then goes into an idle loop
*   which waits on the signal, hpib_cmd_ready, sent by the public HPIB
*   interrupt routine on interrupts from device clear and byte in.
*
*   A device clear interrupt invokes the routine, reset_hpib.
*
*   The byte in interrupts handled by this routine are primarily HPIB
*   command mnemonics which are read from the HPIB chip and put into
*   the public HPIB parser FIFO, public_ib_fifo.  Any pending signal
*   received after block mode is in effect either puts the data byte
*   from the chip into the input block buffer after the data bytes still
*   left in the parser FIFO, or sets a flag (byte_straggler) which
*   indicates that a data byte is still in the chip.  This flag will
*   inform the block mode routine (input_block), invoked by the parser,
*   that a data byte still needs to be read from the chip into the
*   input buffer (this also allows successive data bytes being sent from
*   the controller to be read).
*
* INPUTS--   none
*
* OUTPUTS--  none
*
* ROUTINES CALLED--
*   reset_hpib
*   wait
*   send
*   empty_parser_FIFO
*   read_hpib
*   write_fifo
*
* ERROR CONDITIONS AND RECOVERY--
*
* NOTES--
*   The HPIB interrupt routine sends a signal to this process so that
*   it can return immediately from interrupt and not spend extra time
*   possible process swapping to handle the interrupt reason.
*
* AUTHOR--
*
**********************************************************************
*
* INITIAL REFINEMENT--
```

```
SPUBIB.WORK.PD8510            THU, DEC 22, 1983, 10:55 AM     PAGE  41

*   initialize public HPIB variables, flags, and signals
*   loop forever:
*     wait for hpib_cmd_ready signal
*     if device clear then call device clear routine, reset_hpib
*     else
*     if block mode then
*       if data in parser fifo then empty into input buffer and
*         read data byte from chip into input buffer
*       else set flag indicating data byte still in chip
*     else
*       check for eoi
*       write data byte from chip into parser fifo
*       if eoi found then write eoi value into parser fifo
*
**********************************************************************
*
* REVISION LOG--
*
**********************************************************************
DECLARATION--
;
PROCEDURE hpib_listener;                                        ENTRY;
&
$DOC-&

BEGIN

  PROCEDURE iradr(Adrs,bit);
    VALUE Adrs,bit; DOUBLE Adrs; BYTE bit;                  EXTERNAL;

  init_pub_hpib;                                 & public HPIB init's   &
  stop_parse := block_io := FALSE;
  signal_init (block_write_done,0);
  signal_init (hpib_cmd_ready,0);                & signal initialization&
  iradr (ADRS(public_hpib),public_ib_vctr);      & interrupt init's     &

loop:                                            & idle loop process:   &
    wait (hpib_cmd_ready);                       & BI interrupt sent    &
    IF device_clear THEN
      reset_hpib
    ELSE
    IF stop_parse THEN                           & in block mode routine &
      BEGIN
        IF blk_mode_debug THEN
          BEGIN
            WSTR("BI pending"); WHEX(inbuf_ptr); CRLF;
          END;
        IF block_io THEN
          read_hpib
        ELSE
          BI_pending := TRUE;
      END
    ELSE                                      & public HPIB command mnemonics &
      BEGIN
        EOI_found := TBIT (address_status,EOI);
        IF TBIT (address_status, MJMM) THEN
```

```
SPUBIB.WORK.PD8510            THU, DEC 22, 1983, 10:55 AM     PAGE  42

          write_fifo (public_ib_fifo, (hpib_pass_thru OR data_in_reg))
        ELSE
          BEGIN
            IF command_pass_thru THEN
              pass_thru_done;
            write_fifo (public_ib_fifo, data_in_reg);
          END;
        IF EOI_found THEN
          write_fifo (public_ib_fifo, hpib_eoi);
        IF block_io THEN    & process pending signal during block mode &
          IF empty_parser_FIFO OR (inbuf_ptr=block_in_lgth) THEN
            send (block_read_done);
      END;
  GO TO loop;

END hpib_listener;

END$
```

```
MPYTABLE.WORK.PD8510            THU, DEC 22, 1983, 10:55 AM     PAGE   1

COMMENT
GLOBAL INTEGER MPYCP=ZFFFFF800;
GLOBAL INTEGER ADDCP=ZFFFFF80E;
GLOBAL INTEGER MultInit1 = ZFFFFF816;          & need to add to source &
GLOBAL INTEGER MultInit2 = ZFFFFF81C;     *    & need to add to source &
GLOBAL INTEGER SUBCP=ZFFFFF81E;
GLOBAL INTEGER MPYFP=ZFFFFF82E;
GLOBAL INTEGER ADDFP=ZFFFFF836;
GLOBAL INTEGER SUBFP=ZFFFFF840;
GLOBAL INTEGER MDFR=ZFFFFF84A;
COMMENT
GLOBAL INTEGER XXXXX=ZFFFFF856;
GLOBAL INTEGER MODFR=ZFFFFF86C;
GLOBAL INTEGER MDSFR=ZFFFFF894;
GLOBAL INTEGER XFM2P=ZFFFFF8A4;
GLOBAL INTEGER MPLOG=ZFFFFF8C8;
GLOBAL INTEGER MINTP=ZFFFFF8D0;
GLOBAL INTEGER XFM2Q=ZFFFFF8DA;
GLOBAL INTEGER MPYDI=ZFFFFF8FA;
GLOBAL INTEGER LLDA0=ZFFFFF906;
GLOBAL INTEGER LLDA2=ZFFFFF90A;
GLOBAL INTEGER LLDMY=ZFFFFF90E;
GLOBAL INTEGER ROEXP=ZFFFFF912;
GLOBAL INTEGER MPYLF=ZFFFFF914;
GLOBAL INTEGER ADDLF=ZFFFFF918;
GLOBAL INTEGER SUBLF=ZFFFFF91A;
GLOBAL INTEGER DIVFP=ZFFFFF91E;
GLOBAL INTEGER MYNRM=ZFFFFF922;
GLOBAL INTEGER MDBDG=ZFFFFF926;
GLOBAL INTEGER MRLDG=ZFFFFF930;
GLOBAL INTEGER MPLDG=ZFFFFF942;
GLOBAL INTEGER MSHFT=ZFFFFF950;
COMMENT
GLOBAL INTEGER MPYDV=ZFFFFF956;
COMMENT
GLOBAL INTEGER MPCPX=ZFFFFF95A;
COMMENT
GLOBAL INTEGER MPDVR=ZFFFFF962;
COMMENT
GLOBAL INTEGER IFCAL=ZFFFFF966;
GLOBAL INTEGER IFCAM=ZFFFFF976;
GLOBAL INTEGER MCPDIV  =  IFCAM + 28;
GLOBAL INTEGER MPYAV=ZFFFFF9A4;
GLOBAL INTEGER CPXMR=ZFFFFF9BA;
GLOBAL INTEGER MCPMP=ZFFFFF9BE;
GLOBAL INTEGER CPINV=ZFFFFF9CC;
GLOBAL INTEGER DADLF=ZFFFFF9E0;
```

```
AQUAD.WORK.PD8510               THU, DEC 22, 1983, 10:55 AM     PAGE   2

      EXG     R1,R3
CMPA  CMP.L   R2,R0      COMPARE MSH 4 / 8.25 uS
      BNE     CMPA0      IN NOT EQUAL THEN DONE
      CMP.L   R3,R1      CHECK LSH
      BEQ     CMPA0      DONE IF EQUAL
      BHI     CMPA3      TREAT SECOND COMPARE AS UNSIGNED
      MOVE    #9,CCR     SET CONDITION CODE LESS THAN
CMPA0 RTS
CMPA3 MOVE    #0,CCR     SET CONDITION CODE GREATER THAN
      RTS
*
*     LDRAT   = 14.5  uS
*     LDRAA   = 13.75 uS
*     LDRAG   = 14    uS
*     LDRAM   = 14    uS
*
LDRAT MOVEM.L 8(S),R2-R3  FETCH OPERAND FROM STACK  14.5 uS
      MOVE.L 4(S),12(S)   FIX UP STACK
      MOVE.L (S),8(S)
      ADDQ.L #8,S          DELETE GARBAGE FROM STACK
      RTS
*
LDRAA EXG     R3,R9      SAVE R9;R3=GARBAGE  13.75 uS
      MOVE.L 4(S),R9     GET ADDRESS OF POINTER
      ADD     (R9),R9    ADD INDEX
      MOVEM.L (R9),R2/R9  FETCH OPERAND
      EXG     R3,R9      RESTORE R9
      ADDQ.L #2,4(S)     INCREMENT RETURN ADRS
      RTS
*
LDRAG EXG     R3,R9      SAVE R9;R3=GARBAGE  14 uS
      MOVE.L 4(S),R9     GET ADRS OF POINTER
      MOVE    (R9),R9    GET OFFSET FROM G
      MOVEM.L (R9),R2/R9  FETCH OPERAND
      EXG     R3,R9      RESTORE R9
      ADDQ.L #2,4(S)     INCREMENT RETURN ADRS
      RTS
*
LDRAM EXG     R3,R9      SAVE R9   14 uS
      MOVE.L 4(S),R9     GET ADRS OF POINTER
      MOVE    (R9),R9    GET OFFSET FROM M
      MOVEM.L 0(M,R9),R2/R9  FETCH OPERAND
      EXG     R3,R9      RESTORE R9
      ADDQ.L #2,4(S)     INCREMENT RETURN ADRS
      RTS
*
*
MPY9  MOVE.L R0,-(S)
      BPL     MY910      POSITIVE SO SKIP
      NEG.L   R1
      NEGX.L R0
MY910 EOR.L   R2,(S)     SET SIGN OF RESULT
      TST.L   R2
      BPL     MY920      SKIP IF PLUS
      NEG.L   R3
      NEGX.L R2
```

```
AQUAD.WORK.PD8510               THU, DEC 22, 1983, 10:55 AM     PAGE   1

ASMB,R
      NED QUAD
      NAM QUAD,7,"JTB 23.10.81"
*
      ENT MPYA,DIVA,DVRA,MPY9,DIV9
      ENT ABSA,NEGA,CMPA,CPRA
      ENT MPYAA,MPYAM,MPYAT,MPYAG
      ENT DIVAA,DIVAM,DIVAT,DIVAG
      ENT DVRAA,DVRAM,DVRAT,DVRAG
      ENT CMPAA,CMPAM,CMPAT,CMPAG
      ENT CPRAA,CPRAM,CPRAT,CPRAG
      ENT LDRAA,LDRAM,LDRAT,LDRAG
      ENT CNV5A,CNV4A,CNV3A,CNV2A
      ENT CNVA5,CNVA4,CNVA3,CNVA2
*
      EXT CNV32,CNV23
*
R0    REG 0
R1    REG 1
R2    REG 2
R3    REG 3
R4    REG 4
R5    REG 5
R6    REG 6
R8    REG 8
R9    REG 9
R10   REG 10
R11   REG 11
G     REG 13
M     REG 14
S     REG 15
*
ABSA  TST.L  R0
      BGE    NEGX
NEGA  NEG.L  R1
      NEGX.L R0
NEGX  RTS
*
*
CMPAA BSR     LDRAA     21.5 / 25.75 uS
      BRA     CMPA
CMPAG BSR     LDRAG     21.75 / 26 uS
      BRA     CMPA
CMPAM BSR     LDRAM     21.75 / 26 uS
      BRA     CMPA
CMPAT BSR     LDRAT     22.25 / 27 uS
      BRA     CMPA
CPRAA BSR     LDRAA     23 / 27.25 uS
      BRA     CPRA
CPRAG BSR     LDRAG     23.25 / 27.5 uS
      BRA     CPRA
CPRAM BSR     LDRAM     23.25 / 27.5 uS
      BRA     CPRA
CPRAT BSR     LDRAT     22.5 / 26.75 uS
CPRA  EXG     R0,R2     5.5 / 9.75 uS
```

```
AQUAD.WORK.PD8510               THU, DEC 22, 1983, 10:55 AM     PAGE   3

MY920 CMP.L   R2,R0      SELECT SMALLER OPERAND
      BLT     MY935       FOR R0-R1
      BNE     MY930
      CMP.L   R3,R1      COMPARE 2ND HALF
      BLS     MY935
MY930 EXG     R0,R2
      EXG     R1,R3
MY935 MOVEM.L R0-R3/R8-R10,-(S) PUT OPERANDS ON STACK  '
*
*  STACK:
*  R10
*  R9
*  R8
*  MULTIPLICAND LSH
*  MULTIPLICAND MSH
*  MULTIPLIER   LSH
*  MULTIPLIER   MSH
*
      LEA     8(S),R8
      MOVE.L S,R9        SET POINTERS FOR MPY
MY945 MOVEQ   #0,R2
      MOVE.L R2,-(S)     CLEAR AREA IN STACK
      MOVE.L R2,-(S)     CLEAR AREA IN STACK
      MOVE.L R2,-(S)     CLEAR AREA IN STACK
      MOVE.L R2,-(S)       FOR RESULT
      MOVE.L S,R10      RESULT POINTER
      MOVEQ   #3,R3     MAJOR LOOP COUNTER
MY950 MOVEQ   #3,R2     MINOR LOOP COUNTER
MY951 MOVE    (R9)+,R0  FETCH MULTIPLIER WORD
      BNE     MY952     SKIP IF NOT ZERO
      ADDQ.L #2,R10
      DBRA    R3,MY951  TRY NEXT WORD
      BRA     MY954
MY952 MOVE    (R8)+,R1  GET MULTIPLICAND WORD
      BEQ     MY953     SKIP IF ZERO
      MULU    R0,R1
      ADD.L   R1,(R10)  ADD TO PARTIAL PRODUCT
      BCC     MY953
      ADDQ.L #1,-4(R10)
      BCC     MY953
      ADDQ.L #1,-8(R10)
      BCC     MY953
      ADDQ.L #1,-12(R10)
MY953 ADDQ.L #2,R10     INCREMENT POINTER
      DBRA    R2,MY952  LOOP TO NEXT WORD
      SUBQ.L #8,R8      RESET POINTER
      LEA     -6(R10),R10 RESET
      DBRA    R3,MY950  LOOP UNTIL ALL WORDS DONE
MY954 MOVEM.L (S)+,R0-R3  FETCH RESULT
      LEA     16(S),S   DELETE OPERANDS
      MOVEM.L (S)+,R8-R10 RESTORE REGISTERS
      TST.L   (S)+
      BPL     MY955     CHECK SIGN FOR RESULT
      NEG.L   R3
      NEGX.L R2
      NEGX.L R1
```

```
      NEGX.L R0
MY955 RTS
*
*
*     64 / 64  BINARY DIVIDE
*
DIV9  CLR    -(S)
      TST.L  R0
      BPL    DIV91
      NEG.L  R1
      NEGX.L R0
      NOT    (S)
DIV91 TST.L  R2
      BPL    DIV92
      NEG.L  R3
      NEGX.L R2
      NOT.B  (S)
DIV92 MOVEM.L R0-R6/R8,-(S)  PUT OPERANDS ON STACK
      CLR.L  -(S)
      CLR.L  -(S)       ZERO MSH OF DIVIDEND
*
DIV93 MOVE.L S,R8          INITIALIZE POINTER
      MOVEQ  #15,R4
DV950 MOVE.B (R8)+,R0
      DBNE   R4,DV950
      LSL    #3,R4       MPY BY 8
      BMI    ZERORESULT
DV952 ADDQ   #1,R4
      LSR.B  #1,R0       NOW FIND THE BIT
      BNE    DV952       R4=# BITS IN DIVIDEND/REMAINDER
      LEA    16(S),R8
      MOVEQ  #7,R5
DV954 MOVE.B (R8)+,R0    FIND NON-ZERO BYTE
      DBNE   R5,DV954
      LSL    #3,R5       MPY BY 8
      BMI    DIVBYZERO
DV955 ADDQ   #1,R5
      LSR.B  #1,R0       NOW FIND BIT
      BNE    DV955       R5=# BITS IN DIVISOR
      MOVE   R4,R6       NOW COMPUTE # BITS FOR QUOTIENT
      SUB    R5,R6       R6=# BITS IN QUOT-1
      BMI    ZERORESULT
      CMP    =D64,R6     CHECK FOR OVERFLOW
      BGE    DIVBYZERO     BAIL OUT IF OVERFLOW
      CMP    =D16,R5
      BLS    DIV16       CAN DO WITH 16 BIT DIVIDES
      CMP    =D31,R5
      BLS    DIV32       CAN DO WITH 32 BIT DIVIDES
DIV64 ADD    #64,R5     REQUIRES A 64 BIT DIVIDE
      SUB    R4,R5       COMPUTE # BITS TO PRESHIFT REMAINDER
      MOVEQ  #7,R3
      AND    R5,R3
      ADD    R3,R6       ADD 0-7 TO # BITS TO GENERATE
      LSR    #4,R5       SHIFT BIT 3 INTO CARRY
      MOVEM.L (S)+,R0-R3 GET DIVIDEND
      BCC    DV64A
```

```
      ROL.L  #8,R0
      ROL.L  #8,R1
      ROL.L  #8,R2
      ROL.L  #8,R3
      MOVE.B R1,R0
      MOVE.B R2,R1
      MOVE.B R3,R2
      CLR.B  R3
      BRA    DV64A
DV64B SWAP   R0
      SWAP   R1
      SWAP   R2
      SWAP   R3
      MOVE   R1,R0
      MOVE   R2,R1
      MOVE   R3,R2
      CLR    R3
DV64A DBRA   R5,DV64B
      MOVEM.L (S)+,R4-R5  GET DIVISOR
      BRA    DV642
DV640 LSL.L  #1,R3       SHIFT REMAINDER/QUOT 1 BIT
      ROXL.L #1,R2
      ROXL.L #1,R1
      ROXL.L #1,R0
DV642 CMP.L  R4,R0       CHECK FOR LOGICAL LESS THAN
      DBCC   R6,DV640    LOOP UNTIL HIGH OR EQUAL
      BHI    DV643       HIGH SO GO DO IT
      BCS    DV645       SKIP IF LOOP COUNT EXHAUSTED
      CMP.L  R5,R1       CHECK LOW REG IF =
      DBCC   R6,DV640    LOOP BACK IF LOW
      BCS    DV645       SKIP IF LOOP EXIT
DV643 SUB.L  R5,R1       SUBTRACT DIVISOR FROM REMAINDER
      SUBX.L R4,R0
      ADDQ   #1,R3       INSERT QUOTIENT BIT
      DBRA   R6,DV640
DV645 EXG    R0,R2
      EXG    R1,R3       R0 = QUOTIENT
DV646 MOVEM.L (S)+,R4-R6/R8  RESTORE REGISTERS
      TST.B  1(S)        CHECK REMAINDER SIGN
      BPL    DV647
      NEG.L  R3
      NEGX.L R2
DV647 TST    (S)+        GET SIGN OF RESULT
      BPL    DV648       RESULT SIGN
      NEG.L  R1
      NEGX.L R0
DV648 RTS
*
DIV16 MOVE   22(S),R2   16 BIT DIVISOR
      MOVEQ  #0,R3
      MOVEQ  #7,R1
      MOVE.L S,R8
DV160 MOVE   (R8)+,R3  TRY A WORD
      DBNE   R1,DV160  LOOP UNTIL NON-ZERO
      CMP    R2,R3     SEE IF LESS THAN DIVISOR
      BHI    DV166     GO DO DIVIDE
```

```
      BNE    DV161       SKIP IF LOGICAL LESS
      MOVEQ  #1,R3
      BRA    DV167
DV161 SWAP   R3
      BRA    DV167
DV165 MOVE   (R8)+,R3
DV166 DIVU   R2,R3
DV167 MOVE   R3,-2(R8)
      DBRA   R1,DV165  LOOP UNTIL DONE
      CLR    R3
      SWAP   R3
      MOVEQ  #0,R2       REMAINDER COMPLETE
DV168 ADDQ.L #8,S        DELETE MSH OF REMAINDER
      MOVEM.L (S)+,R0-R1  GET RESULT
      ADDQ.L #8,S        DELETE DIVISOR
      BRA    DV646       GO DO SIGN STUFF
*
DIV32 MOVE.L S,R8
      MOVEQ  #3,R6
      MOVEQ  #0,R2
DV320 MOVE.L (R8)+,R0  GET FIRST DOUBLE WORD OF REMAINDER
      DBNE   R6,DV320
      CMP.L  20(S),R0
      BHI    DV326      GO DO DIVIDE IF > DIVISOR
      BNE    DV321
      MOVEQ  #1,R0
      MOVEQ  #0,R1
      BRA    DV327
DV321 MOVE.L R0,R1       MOVE DIVIDEND TO REMAINDER
      MOVEQ  #0,R0       CLEAR QUOTIENT
      BRA    DV327       GO TRY NEXT DOUBLE WORD
DV325 MOVE.L (R8)+,R0    FETCH NEXT OPERAND
DV326 MOVEQ  #32,R3      BIT COUNTER FOR DIV3L
      MOVE.L 20(S),R1    GET DIVISOR
      PEA    DV327       PUSH RETURN ADDRESS
      MOVEM.L R2-R3,-(S) SAVE REGISTERS FOR DIV3L
      CLR    -(S)          SIGN OF RESULT FOR DIV3L
      JMPX   DIV3L
DV327 MOVE.L R0,-4(R8)    STORE QUOTIENT PORTION
      MOVE.L R1,R2       POSITION REMAINDER FOR NEXT DIVIDE
      DBRA · R6,DV325    GO DO NEXT DOUBLE WORD
      MOVEQ  #0,R3
      EXG    R2,R3       REMAINDER NOW SET UP
      BRA    DV168       GO GET RESULT AND FIXUP SIGNS
*
*  STACK:
*  SIGN RESULT,SIGN REMAINDER   (ONE BYTE EACH)
*  R8
*  R6
*  R5
*  R4
*  DIVISOR LSH
*  DIVISOR MSH
*  QUOTIENT LSH
*  QUOTIENT MSH
*  REMAINDER LSH
```

```
*  REMAINDER MSH
*
*
DIVBYZERO   MOVE.L =H19999999,R0
      MOVE.L NINES,R1
      BRA    ZEROR
NINES HEX 9999,9999
*
ZERORESULT  MOVEQ #0,R0
      MOVEQ  #0,R1
ZEROR ADDQ.L #8,S            DELETE MSH REMAINDER
      MOVEM.L (S)+,R2-R3     GET REMAINDER
      ADDQ.L #8,S            DELETE DIVISOR
      BRA    DV646
*
*
MPYAA JSR    LDRAA           NOTE COULD CHANGE BRA TO JMP'S
      BRA    MPYA
MPYAG JSR    LDRAG
      BRA    MPYA
MPYAM JSR    LDRAM
      BRA    MPYA
MPYAT JSR    LDRAT
MPYA  JSR    MPY9              128 BIT RESULT
      MOVE.L R2,R0             64 BIT RESULT IS IN R2/R3
      MOVE.L R3,R1
      RTS
*
DIVAA JSR    LDRAA
      BRA    DIVA
DIVAG JSR    LDRAG
      BRA    DIVA
DIVAM JSR    LDRAM
      BRA    DIVA
DIVAT JSR    LDRAT
DIVA  JMP    DIV9
*
DVRAA JSR    LDRAA
      BRA    DVRA
DVRAG JSR    LDRAG
      BRA    DVRA
DVRAM JSR    LDRAM
      BRA    DVRA
DVRAT JSR    LDRAT
*
DVRA  EXG    R2,R0
      EXG    R3,R1
      JMP    DIV9
*
*
*
*
CNV5A EXTS   R0
CNV4A EXTS.L R0
CNV3A TST.L  R0
      SMI    R1
```

```
      EXTS   R1
      EXTS.L R1
*
CNVA5:CNVA4:CNVA3   EXG R0,R1
      RTS
*
*
*
CNV2A TST.B  R0          ZERO?
      BLT    UNFLW
      CMP.B  =D64,R0     TOO LARGE ?
      BGE    OVFLW
      MOVE.W R2,-(S)     OPERATING SPACE
      CLR.W  R2          need word for DBRA loop
      CMP.B  =D32,R0     TOO BIG FOR A DOUBLE ?
      BLT    CONV        NO
      MOVE.B R0,R2       YES -- COPY EXP always positive no EXTS needed
      MOVE.B =D31,R0     HOW BIG TOO BIG
      SUB.B  R0,R2       Result is always 1 to 32 -- R2 will be a word
CONV  JSR    CNV23
      JSR    CNV3A
      TST.W  R2          WAS DOUBLE OK
      BLE    CEXIT       YES
      SUB.W  #1,R2
CLOOP LSL.L  #1,R1       NO --TWO REG SHIFT -- SLOW
      ROXL.L #1,R0
      DBRA   R2,CLOOP
CEXIT MOVE.W (S)+,R2       RESTORE REG
      RTS
*
UNFLW CLR.L  R0
      CLR.L  R1
      RTS
OVFLW TST.L  R0
      BLT    OVFLWNEG
      MOVE.L =H7FFFFFFF,R0
      MOVE.L =D-1,R1
      RTS
OVFLWNEG MOVE.L=H80000000,R0
      CLR.L R1
      RTS
*
*
*
CNVA2 MOVE   R2,-(S)      NEED TEMP STORAGE
      CLR    R2          EXP NORMALIZING COUNTER
NRMA2 TST.L  R1          NORMALIZE TOP BIT OF R1 = ALL BITS OF R0  SLOW!!
      BMI    NRMNG
      TST.L  R0
      BEQ    NRMFI       R0 ALL ZERO AND R1 SIGN POSTIVE
      BRA    NRMLP
NRMNG CMP.L  =D-1,R0
      BEQ    NRMFI       R0 ALL ONES AND R1 SIGN NEGATIVE
NRMLP ADD    #1,R2       INC SHIFT COUNT
      ASR.L  #1,R0       TWO REG ARTHIMTIC SHIFT
      ROXR.L #1,R1
```

```
      BRA    NRMA2
*
NRMFI MOVE.L R1,R0
      JSR    CNV32
      ADD.B  R2,R0       DENORMALIZE RESULT
      MOVE   (S)+,R2
      RTS
      END
```

```
INTEGER CONSTANT
      power_on_recall := 0,
      test_recall     := 1,
      preset_recall   := 2,
      normal_recall   := 3;
```

```
#FILE crecall.work;

EXTERNAL INTEGER recall_type;

PROCEDURE  do_recall;                              EXTERNAL.L;
```

```
SRECALL.WORK.PD8510              THU, DEC 22, 1983, 10:55 AM      PAGE   1


M68KL,P,"recall"
BEGIN

#FILE crecall.work;                                    & for recall types &
#FILE cchtable.work;                                           & for ch_... &
#FILE cmessag2.work;                                   & for all_messages &
#FILE cyadc.work;                                         & for test_port &
#FILE fannot.work;
#FILE fbreak.work;                                  & for coupled_break &
#FILE fchdata.work;                               & for number_of_groups &
#FILE fchdata2.work;
#FILE fchtab3.work;
#FILE fchtable.work;
#FILE fcontvar.work;
#FILE cdisplay.work;
#FILE fdisplay.work;
#FILE fgratic.work;
#FILE fifgain.work;
#FILE finit.work;
#FILE fpfr.work;                           & for recall_pfr and configure &
#FILE fpubib.work;
#FILE fscreen0.work;                    & for blank_ and enable_display &
#FILE fscreen1.work;                                   & for title_array &
#FILE ftitle.work;                                     & for write_title &
#FILE fsize.work;
#FILE fstimuli.work;
#FILE ftrace.work;
#FILE futil2.work;
#FILE fdomain.work;                            & for partial_set_domain &
#FILE fcouple.work;                           & for init_coupled_status &
#FILE fmemmgr.work;                                  & for reset_memory &
#FILE fcal0.work;                                      & correction_off &
#FILE cprivib.work;                                & for major and minor &
#FILE fprivib2.work;                              & for get_priv_ib_lun &
#FILE ftestset.work;                              & for preset_test_set &
#FILE factive.work;                       & for select_active_function &

INTEGER CONSTANT  single_ch := 2;                & duplicated from cdatap &

PROCEDURE  annotate_format;                                      EXTERNAL;

GLOBAL INTEGER recall_type;
```

```
SRECALL.WORK.PD8510              THU, DEC 22, 1983, 10:55 AM      PAGE   2


#EJECT;
COMMENT                                                            ch_recall
****************************************************************************
*
*   That portion of do_recall that is similar for both channels.
*
****************************************************************************
;
PROCEDURE  ch_recall;
   BEGIN & ch_recall &
      DOUBLE trace_base,
             trace_m_base;
      QUAD   temp_quad;

      temp_quad := entry_ch_quad( ch_gate_center );
      temp_quad := temp_quad +
                   temp_quad -
                   entry_ch_quad(ch_gate_start);
      set_entry_ch_quad( temp_quad, ch_gate_stop );

      partial_set_domain;

      update_start_stop_center_span;
      init_ch_stimuli;
      correction_off;

      init_group_control_vars;  & Do it this now.   Repeated thereafter&
                                &    before each group begins.         &
      recall_pfr;
      annotate_ref_value;
      annotate_ref_position;
      annotate_scale;
      annotate_parameter;
      annotate_format;
      init_trace;                      & includes annotate_math_and_memory &

   END;  & ch_recall &
```

```
SRECALL.WORK.PD8510              THU, DEC 22, 1983, 10:55 AM      PAGE   3


#EJECT;
COMMENT                                                            do_recall
****************************************************************************
*
* BE CAREFUL OF THE ORDER IN WHICH OPERATIONS ARE PERFORMED !!!
*
****************************************************************************
;
PROCEDURE  do_recall;                                                 ENTRY;
   BEGIN & do_recall &
      INTEGER temp_number_of_groups,
              i;
      QUAD    half_span;

      blank_display;

      temp_number_of_groups := number_of_groups;
      number_of_groups := 0;
      init_coupled_status;
      preset_test_set;         & should be before preset_source (why?) &
      IF recall_type <> normal_recall THEN
         preset_source;

      reset_acquisition_descriptor;
      reset_memory;         & release all data arrays for re-allocation &

      configure;
      init_break;
      partial_select_entry_ch( 1 );
      init_correction;        & needs current_entry_ch to be initialized &
      init_stds;
      init_stimuli;         & sets step_size and indirectly calls build &


      & CHANNEL-INDEPENDENT PARAMETERS &

      & these are stored, but must be overridden except for power on &

      set_major_address( get_priv_ib_lun(major) );
      set_minor_address( get_priv_ib_lun(minor) );

      srq_mask_primary := 0;
      srq_mask_secondary := 0;
      request_mask( LEFT(srq_mask_primary,8) OR
                    (srq_mask_secondary AND %00FF)
                  );

      new_if_gain_port( test_port );        & also highlights soft keys &


      & CHANNEL 1 DEPENDENT PARAMETERS &

      ch_recall;


      & CHANNEL 2 DEPENDENT PARAMETERS &
```

```
SRECALL.WORK.PD8510              THU, DEC 22, 1983, 10:55 AM      PAGE   4


      partial_select_entry_ch( 2 );      & must be different than below &
      ch_recall;


      & GENERAL INITIALIZATION &

      select_entry_ch( 1 );     & different than above -- forces update &
      IF trace_mode <> single_ch THEN
         trace_and_graticule;
&     ELSE
         select_entry_ch already did it.
&
      init_output;
      init_markers;

      & Compute ch_gate_stop -- used for gate marker display purposes. &
      half_span := entry_ch_quad(ch_gate_center) -
                   entry_ch_quad(ch_gate_start);
      set_entry_ch_quad( entry_ch_quad(ch_gate_start) +
                         half_span +
                         half_span,
                       ch_gate_stop
                     );

      MOVE title_array := title_line, +( 1 + title_line[-1] );
      write_title;
      clear_message( all_messages );               & clear message line &
      select_active_function( IF ( (recall_type = normal_recall) OR
                                   (recall_type = preset_recall)
                                 ) THEN
                                 active_off
                              ELSE
                                 active_revision
                            );
      enable_display;
      number_of_groups := temp_number_of_groups;

   END;  & do_recall &

END$
```

```
FRECALL2.WORK.PD8510          THU, DEC 22, 1983, 10:56 AM     PAGE   1

PROCEDURE  ch_recall;                                    EXTERNAL.L;
```

```
CRESP.WORK.PD8510             THU, DEC 22, 1983, 10:56 AM     PAGE   1

INTEGER CONSTANT

cmd_elect_delay := 44,
cmd_auto_delay := 45,
cmd_phase_offset := 46,
cmd_if_avg_on := 48,
cmd_if_avg_off := 49,
cmd_smoothing_on := 50,
cmd_smoothing_off := 51,
cmd_if_test_port := 52,
cmd_if_ref_port := 53,
cmd_if_no_gain := 54,
cmd_if_12db_gain := 55,
cmd_if_24db_gain := 56,
cmd_if_36db_gain := 57,
cmd_if_48db_gain := 58,
cmd_if_gain_auto := 59,
cmd_group3 := 0;
```

```
FRESP.WORK.PD8510             THU, DEC 22, 1983, 10:56 AM     PAGE   1

COMMENT
  This is a software generated file !!!
  Changes must be made in SKINFO.WORK
      GENSK.LANI to re-generate file;

SUBROUTINE proc3;  ENTRY;
BEGIN

CASE command_token-44 OF
BEGIN
& 44 &
select_active_function( active_electrical_length );
& 45 &
warn( command_not_implemented );
& 46 &
select_active_function( active_phase_offset );
& 47 &
warn( command_not_implemented );
& select_active_function( active_magnitude_offset ); &
& 48 &
if_average_on;
& 49 &
if_average_off;
& 50 &
display_smoothing_on;
& 51 &
display_smoothing_off;
& 52 &
new_if_gain_port( test_port );
& 53 &
new_if_gain_port( ref_port );
& 54 &
new_if_gain( if_no_gain );
& 55 &
new_if_gain( if_12db_gain );
& 56 &
new_if_gain( if_24db_gain );
& 57 &
new_if_gain( if_36db_gain );
& 58 &
new_if_gain( if_48db_gain );
& 59 &
new_if_gain( auto_range );
END;
END proc3;
```

```
SRESPONS.WORK.PD8510          THU, DEC 22, 1983, 10:56 AM     PAGE   1

M68KL,P,"response"
BEGIN

#FILE fcommand.work;          & command_token &
#FILE factive.work;
#FILE cresp.work;
#FILE futil.work;
#FILE fmenu.work;
#FILE cyadc.work;
#FILE fifgain.work;
#FILE faverage.work;

GLOBAL                                             & used by IFGAIN       &
BYTE TABLE cmd_if_gain :=  cmd_if_gain_auto,       & map if gain to cmd_  &
                           cmd_if_no_gain,         &   see cresp and      &
                           cmd_if_12db_gain,       &        cyadc.        &
                           cmd_if_24db_gain,
                           cmd_if_36db_gain,
                           cmd_if_48db_gain;
GLOBAL                                             & used by IFGAIN       &
BYTE TABLE cmd_if_port :=  cmd_if_test_port,       & map port to cmd_     &
                           cmd_if_ref_port;        &   see cresp and      &
                                                   &        cyadc.        &

#FILE fresp.work;

END$
```

```
SRETRACE.WORK.PD8510              THU, DEC 22, 1983, 10:56 AM     PAGE   1

M68KL,P,"retrace"
BEGIN

#FILE crins.work;
#FILE fkernel.work;
#FILE fkernel4.work;


SUBROUTINE init_retrace;                                              ENTRY;
   BEGIN & init_retrace &

      signal_init(enable_group_ready, 0);
      signal_init(group_ready, 0);

   END;  & init_retrace &


PROCEDURE retrace;      & a process &                                 ENTRY;
   BEGIN & retrace &

loop:
      wait(enable_group_ready);       & 'control' is ready to begin      &
                                      &    the next group.               &
COMMENT ..._raw_ready signals are not initialized the first pass thru.
      WHILE pending(ch1_raw_ready) OR pending(ch2_raw_ready) DO
         preempt;                     & Wait until all data is displayed&
      send(group_ready);              & This will not be                 &
                                      &    done until all data           &
                                      &    processing (higher priority) &
                                      &    is complete.                  &
COMMENT this is time dependent on yadc processing the data quickly.  We
      should perform retrace synchronization some other way.
      ;
      GO TO loop;

   END;  & retrace &

END$
```

```
CRINS.WORK.PD8510                 THU, DEC 22, 1983, 10:56 AM     PAGE   1

COMMENT                             resource identification numbers (rin)
A resource number is used as a semaphore to limit access to a resource
to only one process at a time.  A resource is acquired by calling
acquire(rin) and released by calling release(rin).  The numerical
order of resource numbers is not significant.  Resource numbers are also
used as signals for communicating between modules.  Resource numbers may
also be used for coordination of producer-consumer situations, including
handling limited buffer sizes.

All resource numbers must be initialized.
  Initialize shared resources by calling      resource_init(rin)
  Initialize signals by calling               signal_init(rin,0)
  Initialize the "... _not_full" signal
       by calling                             signal_init(rin,buffersize)
  Initialize the "... _not_empty" signal
       by calling                             signal_init(rin,0)

                   resource                                      using
                 --- name ---                                --- module ---
                 minimum value          := %10
;
INTEGER CONSTANT min_rin                := %10,              & kernel      &
                 token_buffer           := %10,              & command     &
                 token_buffer_not_full  := %11,              & command     &
                 token_buffer_not_empty := %12,              & command     &
                 control_variables      := %13,              & control     &
                 acquisition_variables  := %14,              & command     &
                 processing_variables   := %15,              & command and &
                                                             &  processing &
                 delay_timer_resource   := %16,              & kernel      &
                 priv_ib_resource       := %17,              &  priv_ib    &
                 priv_ib_signal         := %18,              &  priv_ib    &
                 swp_brk_fifo           := %19,              & sweep_break &
                 swp_brk_fifo_not_full  := %1A,              & sweep_break &
                 swp_brk_fifo_not_empty := %1B,              & sweep_break &
                 pause_list             := %1C,              & kernel      &
                 ch1_raw_ready          := %1D,              & contvar     &
                 ch2_raw_ready          := %1E,              & contvar     &
                 raw_ready_bit_bucket   := %1F,              & contvar     &
                 enable_group_ready     := %20,              & retrace and &
                                                             &    control  &
                 group_ready            := %21,              & retrace and &
                                                             &    control  &
                 keybd_fifo             := %22,              & botkbd and  &
                                                             &    topkbd   &
                 keybd_fifo_not_full    := %23,              & botkbd and  &
                                                             &    topkbd   &
                 keybd_fifo_not_empty   := %24,              & botkbd and  &
                                                             &    topkbd   &
                 hpib_cmd_ready         := %25,              & pub HPIB cmd&
                 pub_ib_fifo            := %26,              & hpibcmd and &
                                                             &    pubib    &
                 pub_ib_fifo_not_full   := %27,              & hpibcmd and &
                                                             &    pubib    &
                 pub_ib_fifo_not_empty  := %28,              & hpibcmd and &
```

```
CRINS.WORK.PD8510                 THU, DEC 22, 1983, 10:56 AM     PAGE   2

                                                             &    pubib    &
                 active_function_rin    := %29,              & active      &
                 entry_string_ready     := %2A,              &parser,output&
                                                             &topkbd,active&
                 block_read_done        := %2B,              & HPIB blk rd.&
                 entry_string           := %2C,              &parser,topkbd&
                                                             &  and active &
                 block_write_done       := %2D,
                 hpib_byte_out          := %2E,              & pubib BO int&
                 aborted                := %2F,              & control and &
                                                             &    break.   &
                 dvc_done               := %30,              & device clear&
                 group_ready_rin        := %31,
                 pubib_output           := %32,
                 memory_src             := %33,              & memory alloc&
                 trace_marks            := %34,              & marker      &
                 continue_signal        := %35,
                 array_fifo             := %36,              & array       &
                 array_fifo_not_full    := %37,              & array       &
                 array_fifo_not_empty   := %38,              & array       &
                 take_sweep_done        := %39,              & active and  &
                                                             &    control  &
                 test_set_ready         := %3A,              & privib and  &
                                                             &    testset  &

                 max_rin                := %3A;              & kernel      &
COMMENT
                        IMPORTANT !!!

  ---------- UPDATE max_rin above when adding a new rin ! ------------
  ---------- and recompile 'kernel' to allocate new array ------------
  ---------- sizes.                                        ------------
;
```

```
SRPG.WORK.PD8510                  THU, DEC 22, 1983, 10:56 AM     PAGE   1

M68KL,P,"rpg"
BEGIN

#FILE cids.work;
#FILE fiocnfig.work;
#FILE fkernel2.work;
#FILE fkernel3.work;
#FILE fintrpt.work;
#FILE crins.work;
#FILE ffifo.work;
#FILE ffifos.work;
#FILE fpubib.work;

   INTEGER rpg_dat = io + %C0;

   BYTE CONSTANT rpg_tim_mod := %70,    & timer#1=mode0, binary,        &
                                        &   load lsb first              &
                 rpg_tim_lsb := %10,    & lsb = fraction ( 10000/256 ) &
                 rpg_tim_msb := %27;    & msb =      mod ( 10000/256 ) &
   BYTE CONSTANT zero := 0;

   BYTE rpg_clr = io + %89,
        rpg_tim = io + %63,
        tim_cmd = io + %67;


   SUBROUTINE reset_rpg;                                              ENTRY;
      BEGIN
         & 8253 does not allow timer loading to be interrupted per      &
         & Intel Information Sheet 1-2-79 "How the 8253 Really Works". &
         ASSEMBLE( MOVE SR,     -(S) );             & Push status word   &
         ASSEMBLE( ORI  #H0700, SR   );           & Disable interrupts &

         rpg_clr := zero;
         tim_cmd := rpg_tim_mod;
         rpg_tim := rpg_tim_lsb;
         rpg_tim := rpg_tim_msb;

         ASSEMBLE( MOVE (S)+,   SR   );                & Restore status word&
      END reset_rpg;


   PROCEDURE rpg;        & a process &                                ENTRY;
   BEGIN

         reset_rpg;
         iradr( ADRS(intrpt_rpg), rpg_vctr );

 loop:   waitio(rpg_vctr);
         IF NOT remote THEN
            write_fifo( token_fifo, (-rpg_dat) OR %FF00 );
              & "-rpg_dat" because RPG is wired reverse of RPG counter &
         reset_rpg;
```

```
SRPG.WORK.PD8510            THU, DEC 22, 1983, 10:56 AM     PAGE  2

      GO TO loop;

   END rpg;

END$
```

```
CSCREEN.WORK.PD8510         THU, DEC 22, 1983, 10:56 AM     PAGE  1

$FILE cscreen2.work;            & soft-key and menu character constants &

INTEGER CONSTANT
   longest_function_label := 26,
   words_per_ch   := 28,                       & see character set    &
                                               & statistics, 6 Oct 83 &
   ch1_annot_col   := 3,                            & screen positions &
   ch2_annot_col   := 28,
   title_row       := 5,
   title_col       := ch1_annot_col,
   error_row       := 6,
   error_col       := 4,
   function_row    := 8,
   function_col    := 4,
   entry_row       := 9,
   entry_col       := 6,
   entry_aux_row   := 10,
   entry_aux_col   := ch1_annot_col,
   xgrat           := 128,                            & for graticule &
   ygrat           := 384,                            & for graticule &
   max_grat        := 3200,                           & for graticule &
   enhancement_col:= 1,
   dirty_row       := 6,
   correction_row  := 7,
   averaging_row   := 8,
   smoothing_row   := 9,
   gating_row      := 10,
   math_row        := 11,
   delay_row       := 12,
   external_row    := 13,
   offset_row      := 14,
   sk_x            := 3424,                     & soft key coordinates &
   sk11_y          := 3966,
   sk12_y          := 3838,
   sk21_y          := 3418,
   sk22_y          := 3290,
   sk31_y          := 2870,
   sk32_y          := 2742,
   sk41_y          := 2322,
   sk42_y          := 2194,
   sk51_y          := 1774,
   sk52_y          := 1646,
   sk61_y          := 1226,
   sk62_y          := 1098,
   sk71_y          := 678,
   sk72_y          := 550,
   sk81_y          := 130,
   sk82_y          := 2,
   trace1_x        := xgrat,
   trace1_y        := ygrat + max_grat/2,
   trace1n_x       := xgrat,
   trace1n_y       := ygrat + max_grat/2,
   trace2_x        := xgrat,
   trace2_y        := ygrat + max_grat/2,
   trace2n_x       := xgrat,
```

```
CSCREEN.WORK.PD8510         THU, DEC 22, 1983, 10:56 AM     PAGE  2

   trace2n_y       := ygrat + max_grat/2,
   param_row       := 1,
   param1_col      := ch1_annot_col,
   param2_col      := ch2_annot_col,
   format1_col     := ch1_annot_col + 11,
   format2_col     := ch2_annot_col + 11,
   ref_row         := 2,
   ref1_col        := ch1_annot_col,
   ref2_col        := ch2_annot_col,
   scale_row       := 3,
   scale1_col      := ref1_col + 4,
   scale2_col      := ref2_col + 4,
   mkr_row         := 4,
   mkr1_col        := ch1_annot_col,
   mkr1_real_col   := mkr1_col + 2,
   mkr1_imag_col   := mkr1_col + 13,
   mkr2_col        := ch2_annot_col,
   mkr2_real_col   := mkr2_col + 2,
   mkr2_imag_col   := mkr2_col + 13,
   mkr_stim_row    := 30,
   mkr1_stim_col   := ch1_annot_col,
   mkr2_stim_col   := ch2_annot_col,
   start_row       := 31,
   start_col       := (ch1_annot_col+ch2_annot_col)/2,
   start1_col      := ch1_annot_col,
   start2_col      := ch2_annot_col,
   stop_row        := 32,
   stop_col        := start_col,
   stop1_col       := start1_col,
   stop2_col       := start2_col,


& display block allocations. &

   start_display := 0,
   start_size    := 10,                     & fixed by "init_screen" &

& error &
   error_position := start_display + start_size,
   error_display  := error_position + 4,
   error_size     := 48,

& title &
   title_position := error_display + error_size,
   title_display  := title_position + 4,
   title_size     := 50,                      & change also schdata &

& blank screen &
   blank_screen      := title_display + title_size,

& function &
   function_position := blank_screen + 1,
   function_display  := function_position + 4,
   function_string_size := longest_function_label,
   function_size     := function_string_size *
```

```
CSCREEN.WORK.PD8510         THU, DEC 22, 1983, 10:56 AM     PAGE  3

   words_per_ch,

& text (overlays function) &
   text_position      := function_position,
   text_display       := function_display,
   text_size          := function_size,

& entry &
   entry_position     := function_display + function_size,
   entry_display      := entry_position + 4,
   entry_string_size := 20,
   entry_size         := entry_string_size * words_per_ch,
   entry2_position    := entry_display + entry_size,
   entry2_display     := entry2_position + 4,

& entry_aux &
   entry_aux_position := entry2_display + entry_size,
   entry_aux_display  := entry_aux_position + 4,
   entry_aux_size     := title_size + 4,      & title is longest use.  &
                                              & 4 extra for title arrow &
& enhancement annotation &
   dirty_position       := entry_aux_display + entry_aux_size,
   dirty_display        := dirty_position + 4,
   enhancement_size     := 1,
   gating_position      := dirty_display + enhancement_size,
   gating_display       := gating_position + 2,
   correction_position := gating_display + enhancement_size,
   correction_display  := correction_position + 2,
   averaging_position  := correction_display + enhancement_size,
   averaging_display   := averaging_position + 2,
   smoothing_position  := averaging_display + enhancement_size,
   smoothing_display   := smoothing_position + 2,
   delay_position      := smoothing_display + enhancement_size,
   delay_display       := delay_position + 2,
   math_position       := delay_display + enhancement_size,
   math_display        := math_position + 2,
   external_position   := math_display + enhancement_size,
   external_display    := external_position + 2,
   offset_position     := external_display + enhancement_size,
   offset_display      := offset_position + 2,

& sk11 &
   sk11_position := offset_display + enhancement_size,
   sk11_display  := sk11_position + 6,
   sk1_size      := 11,               & sk2_size + 1 for sk_bracket_n &
& sk12 &
   sk12_position := sk11_display + sk1_size,
   sk12_display  := sk12_position + 4,
   sk2_size      := 10,                         & must be even # bytes &
& sk21 &
   sk21_position := sk12_display + sk2_size,
   sk21_display  := sk21_position + 6,
& sk22 &
   sk22_position := sk21_display + sk1_size,
   sk22_display  := sk22_position + 4,
& sk31 &
```

```
CSCREEN.WORK.PD8510            THU, DEC 22, 1983, 10:56 AM     PAGE   4

     sk31_position := sk22_display + sk2_size,
     sk31_display  := sk31_position + 6,
   & sk32 &
     sk32_position := sk31_display + sk1_size,
     sk32_display  := sk32_position + 4,
   & sk41 &
     sk41_position := sk32_display + sk2_size,
     sk41_display  := sk41_position + 6,
   & sk42 &
     sk42_position := sk41_display + sk1_size,
     sk42_display  := sk42_position + 4,
   & sk51 &
     sk51_position := sk42_display + sk2_size,
     sk51_display  := sk51_position + 6,
   & sk52 &
     sk52_position := sk51_display + sk1_size,
     sk52_display  := sk52_position + 4,
   & sk61 &
     sk61_position := sk52_display + sk2_size,
     sk61_display  := sk61_position + 6,
   & sk62 &
     sk62_position := sk61_display + sk1_size,
     sk62_display  := sk62_position + 4,
   & sk71 &
     sk71_position := sk62_display + sk2_size,
     sk71_display  := sk71_position + 6,
   & sk72 &
     sk72_position := sk71_display + sk1_size,
     sk72_display  := sk72_position + 4,
   & sk81 &
     sk81_position := sk72_display + sk2_size,
     sk81_display  := sk81_position + 6,
   & sk82 &
     sk82_position := sk81_display + sk1_size,
     sk82_display  := sk82_position + 4,
   & sk_highlight &
     sk_hilight_off := sk82_display + sk2_size,

     sk_highlight_position := sk_hilight_off + 1,
     sk_highlight_display  := sk_highlight_position + 4,
     sk_highlight_size     := 30,

   & hop skip and jump &
     jump_all := sk_highlight_display + sk_highlight_size,

   & CHANNEL 1 &
     channel1_position := jump_all + 1,

   & jump over channel 1 &
     jump_channel1 := channel1_position,

   & trace update mark &
     update_mark1_position := jump_channel1 + 1,
     update_mark1_display  := update_mark1_position + 4,
     update_mark_size      := 6,
```

```
CSCREEN.WORK.PD8510            THU, DEC 22, 1983, 10:56 AM     PAGE   5

   & traces &
     trace1_position := update_mark1_display + update_mark_size,
     trace1_display  := trace1_position + 4,
     trace_size      := 810,

   & trace id mark &
     trace_mark1_position := trace1_display + trace_size,
     trace_mark1_display  := trace_mark1_position + 4,
     trace_mark_size      := 9,

   & end trace 1 &
     end_trace1 := trace_mark1_display + trace_mark_size,

   & memory trace &
     trace1m_position := end_trace1,
     trace1m_display  := trace1m_position + 4,

   & marker 1 &
     mkr11_position := trace1m_display + trace_size,
     mkr11_display  := mkr11_position + 4,
     mkr_size       := 7,

   & marker 2 &
     mkr12_position := mkr11_display + mkr_size,
     mkr12_display  := mkr12_position + 4,

   & marker 3 &
     mkr13_position := mkr12_display + mkr_size,
     mkr13_display  := mkr13_position + 4,

   & marker 4 &
     mkr14_position := mkr13_display + mkr_size,
     mkr14_display  := mkr14_position + 4,

   & marker 5 &
     mkr15_position := mkr14_display + mkr_size,
     mkr15_display  := mkr15_position + 4,

   & marker 6 - gate start &
     mkr16_position := mkr15_display + mkr_size,
     mkr16_display  := mkr16_position + 4,

   & marker 7 - gate center &
     mkr17_position := mkr16_display + mkr_size,
     mkr17_display  := mkr17_position + 4,

   & marker 8 - gate stop &
     mkr18_position := mkr17_display + mkr_size,
     mkr18_display  := mkr18_position + 4,

   & channel 1 graticule &
     graticule1_position := mkr18_display + mkr_size,
     graticule1_display  := graticule1_position + 4,
     graticule_size      := 2000,

   & channel 1 reference line &
```

```
CSCREEN.WORK.PD8510            THU, DEC 22, 1983, 10:56 AM     PAGE   6

     ref_line1_position := graticule1_display + graticule_size,
     ref_line1_display  := ref_line1_position + 4,
     ref_line_size      := 10,

     hilight_ch1 := ref_line1_display + ref_line_size,

   & parameter 1 &
     param1_position := hilight_ch1 + 1,
     param1_display  := param1_position + 4,
     param_size      := 8,

   & math 1 &
   & no position vectors -- follows param1 immediately &
     math1_display  := param1_display + param_size,
     math_size      := 8,

   & format 1 &
     format1_position:= math1_display + math_size,
     format1_display := format1_position + 4,
     format_size     := 9,

   & reference value label 1 &
     ref1_label_position := format1_display + format_size,
     ref1_label_display  := ref1_label_position + 4,
     ref_label_size      := 4,

   & reference value 1 &
   & no position vectors -- follows ref1_label immediately &
     ref1_display := ref1_label_display + ref_label_size,
     ref_size     := 14,

   & reference suffix 1 &
   & no position vectors -- follows ref1 immediately &
     ref1_suffix_display := ref1_display + ref_size,
     ref_suffix_size     := 6,

   & scale/div 1 &
     scale1_position := ref1_suffix_display + ref_suffix_size,
     scale1_display  := scale1_position + 4,
     scale_size      := 13,

   & scale suffix 1 &
   & no position vectors -- follows scale1 immediately &
     scale1_suffix_display := scale1_display + scale_size,
     scale_suffix_size     := 7,

   & marker value label 1 &
     mkr1_label_position := scale1_suffix_display + scale_suffix_size,
     mkr1_label_display  := mkr1_label_position + 4,
     mkr_label_size      := 6,

   & marker real value 1 &
     mkr1_real_position := mkr1_label_display + mkr_label_size,
     mkr1_real_display := mkr1_real_position + 4,
     mkr_display_size  := 15,
```

```
CSCREEN.WORK.PD8510            THU, DEC 22, 1983, 10:56 AM     PAGE   7

   & marker imag value 1 &
     mkr1_imag_position := mkr1_real_display + mkr_display_size,
     mkr1_imag_display  := mkr1_imag_position + 4,

   & marker stimulus value 1 &
     mkr1_stim_position := mkr1_imag_display + mkr_display_size,
     mkr1_stim_display  := mkr1_stim_position + 4,
     stim_size          := 15,

   & marker stimulus suffix suffix 1 &
   & no position vectors -- follows mkr1_stim_display immediately &
     mkr1_stim_suffix_display := mkr1_stim_display + stim_size,
     stim_suffix_size         := 5,

   & start/center mode 1 &
     start1_mode_position := mkr1_stim_suffix_display + stim_suffix_size,
     start1_mode_display  := start1_mode_position + 4,
     stim_mode_size       := 6,

   & start/center 1 &
   & no position vectors -- follows start1_mode immediately &
     start1_display  := start1_mode_display + stim_mode_size,

   & start/center suffix 1 &
   & no position vectors -- follows start1_display immediately &
     start1_suffix_display := start1_display + stim_size,

   & stop/span mode 1 &
     stop1_mode_position := start1_suffix_display + stim_suffix_size,
     stop1_mode_display  := stop1_mode_position + 4,

   & stop/span 1 &
   & no position vectors -- follows stop1_mode immediately &
     stop1_display  := stop1_mode_display + stim_mode_size,

   & stop/span suffix 1 &
   & no position vectors -- follows stop1_display immediately &
     stop1_suffix_display := stop1_display + stim_size,

     hilight_ch1_off := stop1_suffix_display + stim_suffix_size,

   & end of channel 1 &
     end_ch1_position := hilight_ch1_off + 1,

   & CHANNEL 2 &                  & size constants are same as channel 1 &
     channel2_position := end_ch1_position,

   & jump over channel 2 &
     jump_channel2 := channel2_position,

   & trace update mark &
     update_mark2_position := jump_channel2 + 1,
     update_mark2_display  := update_mark2_position + 4,

   & traces &
     trace2_position := update_mark2_display + update_mark_size,
```

```
   trace2_display  := trace2_position + 4,

& trace id mark -- no position vector, uses last trace point &
   trace_mark2_display  := trace2_display + trace_size,

   end_trace2           := trace_mark2_display + trace_mark_size,

& memory trace &
   trace2m_position := end_trace2,
   trace2m_display  := trace2m_position + 4,

& marker 1 &
   mkr21_position := trace2m_display + trace_size,
   mkr21_display  := mkr21_position + 4,

& marker 2 &
   mkr22_position := mkr21_display + mkr_size,
   mkr22_display  := mkr22_position + 4,

& marker 3 &
   mkr23_position := mkr22_display + mkr_size,
   mkr23_display  := mkr23_position + 4,

& marker 4 &
   mkr24_position := mkr23_display + mkr_size,
   mkr24_display  := mkr24_position + 4,

& marker 5 &
   mkr25_position := mkr24_display + mkr_size,
   mkr25_display  := mkr25_position + 4,

& marker 6 - gate start &
   mkr26_position := mkr25_display + mkr_size,
   mkr26_display  := mkr26_position + 4,

& marker 7 - gate center &
   mkr27_position := mkr26_display + mkr_size,
   mkr27_display  := mkr27_position + 4,

& marker 8 - gate stop &
   mkr28_position := mkr27_display + mkr_size,
   mkr28_display  := mkr28_position + 4,

& channel 2 graticule &
   graticule2_position := mkr28_display + mkr_size,
   graticule2_display  := graticule2_position + 4,

& channel 2 reference line &
   ref_line2_position := graticule2_display + graticule_size,
   ref_line2_display  := ref_line2_position + 4,

   hilight_ch2 := ref_line2_display + ref_line_size,

& parameter 2 &
   param2_position := hilight_ch2 + 1,
   param2_display  := param2_position + 4,
```

```
& math 2 &
& no position vectors -- follows param2 immediately &
   math2_display  := param2_display + param_size,

& format 2 &
   format2_position:= math2_display + math_size,
   format2_display := format2_position + 4,

& refence value label 2 &
   ref2_label_position := format2_display + format_size,
   ref2_label_display  := ref2_label_position + 4,

& reference value 2 &
& no position vectors -- follows ref2_label immediately &
   ref2_display := ref2_label_display + ref_label_size,

& reference suffix 2 &
& no position vectors -- follows ref2 immediately &
   ref2_suffix_display := ref2_display + ref_size,

& scale/div 2 &
   scale2_position := ref2_suffix_display + ref_suffix_size,
   scale2_display  := scale2_position + 4,

& scale suffix 2 &
& no position vectors -- follows scale2 immediately &
   scale2_suffix_display := scale2_display + scale_size,

& marker value label 2 &
   mkr2_label_position := scale2_suffix_display + scale_suffix_size,
   mkr2_label_display  := mkr2_label_position + 4,

& marker real value 2 &
   mkr2_real_position := mkr2_label_display + mkr_label_size,
   mkr2_real_display := mkr2_real_position + 4,

& marker imag value 2 &
   mkr2_imag_position := mkr2_real_display + mkr_display_size,
   mkr2_imag_display  := mkr2_imag_position + 4,

& marker stimulus value 2 &
   mkr2_stim_position := mkr2_imag_display + mkr_display_size,
   mkr2_stim_display  := mkr2_stim_position + 4,

& marker stimulus suffix suffix 2 &
& no position vectors -- follows mkr2_stim_display immediately &
   mkr2_stim_suffix_display := mkr2_stim_display + stim_size,

& start/center mode 2 &
   start2_mode_position := mkr2_stim_suffix_display + stim_suffix_size,
   start2_mode_display  := start2_mode_position + 4,

& start/center 2 &
& no position vectors -- follows start2_mode immediately &
   start2_display  := start2_mode_display + stim_mode_size,
```

```
& start/center suffix 2 &
& no position vectors -- follows start2_display immediately &
   start2_suffix_display := start2_display + stim_size,

& stop/span mode 2 &
   stop2_mode_position := start2_suffix_display + stim_suffix_size,
   stop2_mode_display  := stop2_mode_position + 4,

& stop/span 2 &
& no position vectors -- follows stop2_mode immediately &
   stop2_display  := stop2_mode_display + stim_mode_size,

& stop/span suffix 2 &
& no position vectors -- follows stop2_display immediately &
   stop2_suffix_display := stop2_display + stim_size,

   hilight_ch2_off := stop2_suffix_display + stim_suffix_size,

& end of channel 2 &
   end_ch2_position := hilight_ch2_off + 1,

& update raw marks &
   update_raw_position := end_ch2_position,
   update_raw_display  := update_raw_position + 4,
   update_raw_size      := 3,

& user display &
   user_display := update_raw_display + update_raw_size,

& end position &
   end_position  := %2FFF,

& character set &
   character_set := %3000;
```

| n | 2n | mH | 2nH | addr | description |
|---|---|---|---|---|---|
| 0 | 0 | 0000 | 0000 | 100000 | = start_display |
| 10 | 20 | 000A | 0014 | 100014 | = error_position |
| 14 | 28 | 000E | 001C | 10001C | = error_display |
| 62 | 124 | 003E | 007C | 10007C | = title_position |
| 66 | 132 | 0042 | 0084 | 100084 | = title_display |
| 116 | 232 | 0074 | 00E8 | 1000E8 | = blank_screen |
| 117 | 234 | 0075 | 00EA | 1000EA | = function_position |
| 121 | 242 | 0079 | 00F2 | 1000F2 | = function_display |
| 117 | 234 | 0075 | 00EA | 1000EA | = text_position |
| 121 | 242 | 0079 | 00F2 | 1000F2 | = text_display |
| 849 | 1698 | 0351 | 06A2 | 1006A2 | = entry_position |
| 853 | 1706 | 0355 | 06AA | 1006AA | = entry_display |
| 1413 | 2826 | 0585 | 0B0A | 100B0A | = entry2_position |
| 1417 | 2834 | 0589 | 0B12 | 100B12 | = entry2_display |
| 1977 | 3954 | 07B9 | 0F72 | 100F72 | = entry_aux_position |
| 1981 | 3962 | 07BD | 0F7A | 100F7A | = entry_aux_display |
| 2035 | 4070 | 07F3 | 0FE6 | 100FE6 | = sk11_position |
| 2041 | 4082 | 07F9 | 0FF2 | 100FF2 | = sk11_display |
| 2052 | 4104 | 0804 | 1008 | 101008 | = sk12_position |
| 2056 | 4112 | 0808 | 1010 | 101010 | = sk12_display |
| 2066 | 4132 | 0812 | 1024 | 101024 | = sk21_position |
| 2072 | 4144 | 0818 | 1030 | 101030 | = sk21_display |
| 2083 | 4166 | 0823 | 1046 | 101046 | = sk22_position |
| 2087 | 4174 | 0827 | 104E | 10104E | = sk22_display |
| 2097 | 4194 | 0831 | 1062 | 101062 | = sk31_position |
| 2103 | 4206 | 0837 | 106E | 10106E | = sk31_display |
| 2114 | 4228 | 0842 | 1084 | 101084 | = sk32_position |
| 2118 | 4236 | 0846 | 108C | 10108C | = sk32_display |
| 2128 | 4256 | 0850 | 10A0 | 1010A0 | = sk41_position |
| 2134 | 4268 | 0856 | 10AC | 1010AC | = sk41_display |
| 2145 | 4290 | 0861 | 10C2 | 1010C2 | = sk42_position |
| 2149 | 4298 | 0865 | 10CA | 1010CA | = sk42_display |
| 2159 | 4318 | 086F | 10DE | 1010DE | = sk51_position |
| 2165 | 4330 | 0875 | 10EA | 1010EA | = sk51_display |
| 2176 | 4352 | 0880 | 1100 | 101100 | = sk52_position |
| 2180 | 4360 | 0884 | 1108 | 101108 | = sk52_display |
| 2190 | 4380 | 088E | 111C | 10111C | = sk61_position |
| 2196 | 4392 | 0894 | 1128 | 101128 | = sk61_display |
| 2207 | 4414 | 089F | 113E | 10113E | = sk62_position |
| 2211 | 4422 | 08A3 | 1146 | 101146 | = sk62_display |
| 2221 | 4442 | 08AD | 115A | 10115A | = sk71_position |
| 2227 | 4454 | 08B3 | 1166 | 101166 | = sk71_display |
| 2238 | 4476 | 08BE | 117C | 10117C | = sk72_position |
| 2242 | 4484 | 08C2 | 1184 | 101184 | = sk72_display |
| 2252 | 4504 | 08CC | 1198 | 101198 | = sk81_position |
| 2258 | 4516 | 08D2 | 11A4 | 1011A4 | = sk81_display |
| 2269 | 4538 | 08DD | 11BA | 1011BA | = sk82_position |
| 2273 | 4546 | 08E1 | 11C2 | 1011C2 | = sk82_display |
| 2283 | 4566 | 08EB | 11D6 | 1011D6 | = sk_hilight_off |
| 2284 | 4568 | 08EC | 11D8 | 1011D8 | = sk_highlight_position |
| 2288 | 4576 | 08F0 | 11E0 | 1011E0 | = sk_highlight_display |
| 2318 | 4636 | 090E | 121C | 10121C | = jump_all |
| 2319 | 4638 | 090F | 121E | 10121E | = channel1_position |

```
DSCREEN.WORK.PD8510          THU, DEC 22, 1983, 10:56 AM     PAGE  2

 2319  4638 090F 121E 10121E = jump_channel1
 2320  4640 0910 1220 101220 = update_mark1_position
 2324  4648 0914 1228 101228 = update_mark1_display
 2330  4660 091A 1234 101234 = trace1_position
 2334  4668 091E 123C 10123C = trace1_display
 3144  6288 0C48 1890 101890 = trace_mark1_position
 3148  6296 0C4C 1898 101898 = trace_mark1_display
 3157  6314 0C55 18AA 1018AA = end_trace1
 3157  6314 0C55 18AA 1018AA = trace1n_position
 3161  6322 0C59 18B2 1018B2 = trace1n_display
 3971  7942 0F83 1F06 101F06 = mkr11_position
 3975  7950 0F87 1F0E 101F0E = mkr11_display
 3982  7964 0F8E 1F1C 101F1C = mkr12_position
 3986  7972 0F92 1F24 101F24 = mkr12_display
 3993  7986 0F99 1F32 101F32 = mkr13_position
 3997  7994 0F9D 1F3A 101F3A = mkr13_display
 4004  8008 0FA4 1F48 101F48 = mkr14_position
 4008  8016 0FA8 1F50 101F50 = mkr14_display
 4015  8030 0FAF 1F5E 101F5E = mkr15_position
 4019  8038 0FB3 1F66 101F66 = mkr15_display
 4026  8052 0FBA 1F74 101F74 = mkr16_position
 4030  8060 0FBE 1F7C 101F7C = mkr16_display
 4037  8074 0FC5 1F8A 101F8A = mkr17_position
 4041  8082 0FC9 1F92 101F92 = mkr17_display
 4048  8096 0FD0 1FA0 101FA0 = mkr18_position
 4052  8104 0FD4 1FA8 101FA8 = mkr18_display
 4059  8118 0FDB 1FB6 101FB6 = graticule1_position
 4063  8126 0FDF 1FBE 101FBE = graticule1_display
 6063 12126 17AF 2F5E 102F5E = ref_line1_position
 6067 12134 17B3 2F66 102F66 = ref_line1_display
 6077 12154 17BD 2F7A 102F7A = hilight_ch1
 6078 12156 17BE 2F7C 102F7C = param1_position
 6082 12164 17C2 2F84 102F84 = param1_display
 6090 12180 17CA 2F94 102F94 = math1_display
 6098 12196 17D2 2FA4 102FA4 = format1_position
 6102 12204 17D6 2FAC 102FAC = format1_display
 6111 12222 17DF 2FBE 102FBE = ref1_label_position
 6115 12230 17E3 2FC6 102FC6 = ref1_label_display
 6119 12238 17E7 2FCE 102FCE = ref1_display
 6133 12266 17F5 2FEA 102FEA = ref1_suffix_display
 6139 12278 17FB 2FF6 102FF6 = scale1_position
 6143 12286 17FF 2FFE 102FFE = scale1_display
 6156 12312 180C 3018 103018 = scale1_suffix_display
 6163 12326 1813 3026 103026 = mkr1_label_position
 6167 12334 1817 302E 10302E = mkr1_label_display
  173 12346 181D 303A 10303A = mkr1_real_position
   77 12354 1821 3042 103042 = mkr1_real_display
    5    30 000F 001E 10001E = mkr_display_size
    2 12384 1830 3060 103060 = mkr1_imag_position
    6 12392 1834 3068 103068 = mkr1_imag_display
    1 12422 1843 3086 103086 = start1_node_position
    5 12430 1847 308E 10308E = start1_node_display
      12442 184D 309A 10309A = start1_display
  62  12472 185C 30B8 1030B8 = start1_suffix_display
 6241 12482 1861 30C2 1030C2 = stop1_node_position
 6245 12490 1865 30CA 1030CA = stop1_node_display
```

```
DSCREEN.WORK.PD8510          THU, DEC 22, 1983, 10:56 AM     PAGE  3

 6251 12502 186B 30D6 1030D6 = stop1_display
 6266 12532 187A 30F4 1030F4 = stop1_suffix_display
 6271 12542 187F 30FE 1030FE = hilight_ch1_off
 6272 12544 1880 3100 103100 = end_ch1_position
 6272 12544 1880 3100 103100 = channel2_position
 6272 12544 1880 3100 103100 = jump_channel2
 6273 12546 1881 3102 103102 = update_mark2_position
 6277 12554 1885 310A 10310A = update_mark2_display
 6283 12566 188B 3116 103116 = trace2_position
 6287 12574 188F 311E 10311E = trace2_display
 7097 14194 1BB9 3772 103772 = trace_mark2_display
 7106 14212 1BC2 3784 103784 = end_trace2
 7106 14212 1BC2 3784 103784 = trace2n_position
 7110 14220 1BC6 378C 10378C = trace2n_display
 7920 15840 1EF0 3DE0 103DE0 = mkr21_position
 7924 15848 1EF4 3DE8 103DE8 = mkr21_display
 7931 15862 1EFB 3DF6 103DF6 = mkr22_position
 7935 15870 1EFF 3DFE 103DFE = mkr22_display
 7942 15884 1F06 3E0C 103E0C = mkr23_position
 7946 15892 1F0A 3E14 103E14 = mkr23_display
 7953 15906 1F11 3E22 103E22 = mkr24_position
 7957 15914 1F15 3E2A 103E2A = mkr24_display
 7964 15928 1F1C 3E38 103E38 = mkr25_position
 7968 15936 1F20 3E40 103E40 = mkr25_display
 7975 15950 1F27 3E4E 103E4E = mkr26_position
 7979 15958 1F2B 3E56 103E56 = mkr26_display
 7986 15972 1F32 3E64 103E64 = mkr27_position
 7990 15980 1F36 3E6C 103E6C = mkr27_display
 7997 15994 1F3D 3E7A 103E7A = mkr28_position
 8001 16002 1F41 3E82 103E82 = mkr28_display
 8008 16016 1F48 3E90 103E90 = graticule2_position
 8012 16024 1F4C 3E98 103E98 = graticule2_display
10012 20024 271C 4E38 104E38 = ref_line2_position
10016 20032 2720 4E40 104E40 = ref_line2_display
10026 20052 272A 4E54 104E54 = hilight_ch2
10027 20054 272B 4E56 104E56 = param2_position
10031 20062 272F 4E5E 104E5E = param2_display
10039 20078 2737 4E6E 104E6E = math2_display
10047 20094 273F 4E7E 104E7E = format2_position
10051 20102 2743 4E86 104E86 = format2_display
10060 20120 274C 4E98 104E98 = ref2_label_position
10064 20128 2750 4EA0 104EA0 = ref2_label_display
10068 20136 2754 4EA8 104EA8 = ref2_display
10082 20164 2762 4EC4 104EC4 = ref2_suffix_display
10088 20176 2768 4ED0 104ED0 = scale2_position
10092 20184 276C 4ED8 104ED8 = scale2_display
10105 20210 2779 4EF2 104EF2 = scale2_suffix_display
10112 20224 2780 4F00 104F00 = mkr2_label_position
10116 20232 2784 4F08 104F08 = mkr2_label_display
10122 20244 278A 4F14 104F14 = mkr2_real_position
10126 20252 278E 4F1C 104F1C = mkr2_real_display
10141 20282 279D 4F3A 104F3A = mkr2_imag_position
10145 20290 27A1 4F42 104F42 = mkr2_imag_display
10160 20320 27B0 4F60 104F60 = start2_node_position
10164 20328 27B4 4F68 104F68 = start2_node_display
10170 20340 27BA 4F74 104F74 = start2_display
```

```
DSCREEN.WORK.PD8510          THU, DEC 22, 1983, 10:56 AM     PAGE  4

10185 20370 27C9 4F92 104F92 = start2_suffix_display
10190 20380 27CE 4F9C 104F9C = stop2_node_position
10194 20388 27D2 4FA4 104FA4 = stop2_node_display
10200 20400 27D8 4FB0 104FB0 = stop2_display
10215 20430 27E7 4FCE 104FCE = stop2_suffix_display
10220 20440 27EC 4FD8 104FD8 = hilight_ch2_off
10221 20442 27ED 4FDA 104FDA = end_ch2_position
10221 20442 27ED 4FDA 104FDA = update_raw_position
10225 20450 27F1 4FE2 104FE2 = update_raw_display
10224 20448 27F0 4FE0 104FE0 = user_display
12287 24574 2FFF 5FFE 105FFE = end_position
```

```
FSCREEN.WORK.PD8510          THU, DEC 22, 1983, 10:56 AM     PAGE  1

#FILE cscreen.work;                          & for screen constants &
#FILE fscreen0.work;        & for print_string, blank_display, etc. &
#FILE fscreen1.work;                 & for string arrays and alphas &
```

```
JSCREEN.WORK.PD8510            THU, DEC 22, 1983, 10:56 AM     PAGE   1

!job screen,librn.pd8510,work;outclass=,1
!continue
!purge yscreen
!build yscreen;rec=-1276,,v,ascii
!ed
e cscreen.work
f xscreen
v/{{_display|_position|jump_|blank_screen}}/d
v/^INTEGER CONSTANT/d
1,$s/INTEGER CONSTANT //
1,$s/[^A-Z^a-z^0-9^_].*$//
1,$s/$/,/
$s/,/;/
0a
M68KL,P BEGIN
#FILE cscreen.work;
#LIST;
INTEGER TABLE yscreen :=
.
$a
END$
.
wq xscreen
!com68k xscreen,,yscreen
!ed
e yscreen
)u uscreen.work
wq xscreen
!purge dscreen
!build dscreen;rec=-1276,,v,ascii;nocctl
!file input=xscreen
!file output=dscreen,old
!run pscreenp.work
!purge xscreen
!purge yscreen
!ed
e dscreen
wq
!tell librn.pd8510; ============== jscreen done ===================
!tell ucc.pd8510; =============== jscreen done ===================
!eoj
```

```
SSCREEN.WORK.PD8510            THU, DEC 22, 1983, 10:56 AM     PAGE   1

M68KL,P,"screen"
BEGIN

#FILE cdisplay.work;
#FILE fdisplay.work;
#FILE fdisply2.work;
#FILE fdisptbl.work;
#FILE cscreen.work;
#FILE fiocnfig.work;
#FILE cactive2.work;                              & for keypad_suffix_size &

ALPHA PROCEDURE init_string(string, max_length);
   VALUE string, max_length;
   ALPHA string;
   BYTE  max_length;                                                EXTERNAL;

& title &
GLOBAL  BYTE ARRAY title_array[-1:title_size];
GLOBAL  ALPHA title;

& error &
GLOBAL  BYTE ARRAY error_array[-1:error_size];
GLOBAL  ALPHA error;

& function &
GLOBAL  BYTE ARRAY function_array[-1:function_string_size];
GLOBAL  ALPHA function;

& entry &
GLOBAL  BYTE ARRAY entry_array[-1:entry_string_size+keypad_suffix_size];
GLOBAL  ALPHA entry;
GLOBAL  BOOLEAN entry_flip_flop;

& entry_aux &
GLOBAL  BYTE ARRAY entry_aux_array[-1:entry_aux_size];
GLOBAL  ALPHA entry_aux;
```

```
SSCREEN.WORK.PD8510            THU, DEC 22, 1983, 10:56 AM     PAGE   2

#EJECT;
COMMENT                                                      screen_table
*************************************************************************
*
*************************************************************************
;
INTEGER TABLE screen_table :=

& error &
dg_movech2_new_adr, error_position, error_row, error_col,
dg_jmp_new_adr, error_display, error_display+error_size,

& title &
dg_movech2_new_adr, title_position, title_row, title_col,
dg_jmp, title_display+title_size,

& blank screen &
dg_setattribute_new_adr, blank_screen, eod,
dg_setattribute_new_adr, 1, nop,

& function &
dg_movech2_new_adr, function_position, function_row, function_col,
dg_jmp_new_adr, function_display, function_display+function_size,

& entry &
dg_movech2_new_adr, entry_position, entry_row, entry_col,
dg_jmp_new_adr, entry_display, entry_display+entry_size,
dg_movech2_new_adr, entry2_position, entry_row, entry_col,
dg_jmp_new_adr, entry2_display, entry2_display+entry_size,

& entry aux &
dg_movech2_new_adr, entry_aux_position, entry_aux_row, entry_aux_col,
dg_jmp_new_adr, entry_aux_display, entry_aux_display+entry_aux_size,

& enhancement annotation &
dg_movech2_new_adr, dirty_position, dirty_row, enhancement_col,
dg_printch, ' ,

dg_movech_new_adr, gating_position, gating_row, enhancement_col,
dg_printch, ' ,

dg_movech_new_adr, correction_position, correction_row, enhancement_col,
dg_printch, ' ,

dg_movech_new_adr, averaging_position, averaging_row, enhancement_col,
dg_printch, ' ,

dg_movech_new_adr, smoothing_position, smoothing_row, enhancement_col,
dg_printch, ' ,

dg_movech_new_adr, delay_position, delay_row, enhancement_col,
dg_printch, ' ,

dg_movech_new_adr, math_position, math_row, enhancement_col,
dg_printch, ' ,
```

```
SSCREEN.WORK.PD8510            THU, DEC 22, 1983, 10:56 AM     PAGE   3

dg_movech_new_adr, external_position, external_row, enhancement_col,
dg_printch, ' ,

dg_movech_new_adr, offset_position, offset_row, enhancement_col,
dg_printch, ' ,

& SOFT KEYS &

& sk11 &
dg_move2_new_adr, sk11_position, sk_x, sk11_y,
dg_printch, null,
dg_printch, null,
dg_jmp_new_adr, sk11_display, sk11_display+sk1_size,
& sk12 &
dg_move2_new_adr, sk12_position, sk_x, sk12_y,
dg_jmp_new_adr, sk12_display, sk12_display+sk2_size,

& sk21 &
dg_move2_new_adr, sk21_position, sk_x, sk21_y,
dg_printch, null,
dg_printch, null,
dg_jmp_new_adr, sk21_display, sk21_display+sk1_size,
& sk22 &
dg_move2_new_adr, sk22_position, sk_x, sk22_y,
dg_jmp_new_adr, sk22_display, sk22_display+sk2_size,

& sk31 &
dg_move2_new_adr, sk31_position, sk_x, sk31_y,
dg_printch, null,
dg_printch, null,
dg_jmp_new_adr, sk31_display, sk31_display+sk1_size,
& sk32 &
dg_move2_new_adr, sk32_position, sk_x, sk32_y,
dg_jmp_new_adr, sk32_display, sk32_display+sk2_size,

& sk41 &
dg_move2_new_adr, sk41_position, sk_x, sk41_y,
dg_printch, null,
dg_printch, null,
dg_jmp_new_adr, sk41_display, sk41_display+sk1_size,
& sk42 &
dg_move2_new_adr, sk42_position, sk_x, sk42_y,
dg_jmp_new_adr, sk42_display, sk42_display+sk2_size,

& sk51 &
dg_move2_new_adr, sk51_position, sk_x, sk51_y,
dg_printch, null,
dg_printch, null,
dg_jmp_new_adr, sk51_display, sk51_display+sk1_size,
& sk52 &
dg_move2_new_adr, sk52_position, sk_x, sk52_y,
dg_jmp_new_adr, sk52_display, sk52_display+sk2_size,

& sk61 &
dg_move2_new_adr, sk61_position, sk_x, sk61_y,
```

```
dg_printch, null,
dg_printch, null,
dg_jmp_new_adr, sk61_display, sk61_display+sk1_size,
& sk62 &
dg_move2_new_adr, sk62_position, sk_x, sk62_y,
dg_jmp_new_adr, sk62_display, sk62_display+sk2_size,

& sk 71 &
dg_move2_new_adr, sk71_position, sk_x, sk71_y,
dg_printch, null,
dg_printch, null,
dg_jmp_new_adr, sk71_display, sk71_display+sk1_size,
& sk72 &
dg_move2_new_adr, sk72_position, sk_x, sk72_y,
dg_jmp_new_adr, sk72_display, sk72_display+sk2_size,

& sk81 &
dg_move2_new_adr, sk81_position, sk_x, sk81_y,
dg_printch, null,
dg_printch, null,
dg_jmp_new_adr, sk81_display, sk81_display+sk1_size,
& sk82 &
dg_move2_new_adr, sk82_position, sk_x, sk82_y,
dg_jmp_new_adr, sk82_display, sk82_display+sk2_size,

& sk_highlight &
dg_setattribute_new_adr, sk_hilight_off, dimoff,
dg_move2_new_adr, sk_highlight_position, sk_x, sk82_y,
dg_jmp_new_adr, sk_highlight_display,
   sk_highlight_display+sk_highlight_size,


& jump all &
dg_setattribute_new_adr, jump_all, nop,


& CHANNEL 1 &

&jump1 &
dg_setattribute_new_adr, jump_channel1, nop,

& trace1 &
dg_move2_new_adr, trace1_position, trace1_x, trace1_y,
dg_jmp_new_adr, trace1_display, trace1_display+trace_size,
& trace mark1 &
dg_jmp_new_adr,trace_mark1_position,trace_mark1_display+trace_mark_size,
& trace update mark &
dg_jmp_new_adr, update_mark1_position,
   update_mark1_display+update_mark_size,

& trace1n &
dg_move2_new_adr, trace1n_position, trace1n_x, trace1n_y,
dg_jmp_new_adr, trace1n_display, trace1n_display+trace_size,

& markers &
dg_jmp_new_adr, mkr11_position, mkr11_display+mkr_size,
```

```
dg_jmp_new_adr, mkr12_position, mkr12_display+mkr_size,
dg_jmp_new_adr, mkr13_position, mkr13_display+mkr_size,
dg_jmp_new_adr, mkr14_position, mkr14_display+mkr_size,
dg_jmp_new_adr, mkr15_position, mkr15_display+mkr_size,
dg_jmp_new_adr, mkr16_position, mkr16_display+mkr_size,
dg_jmp_new_adr, mkr17_position, mkr17_display+mkr_size,
dg_jmp_new_adr, mkr18_position, mkr18_display+mkr_size,

& graticule 1 &
dg_move2_new_adr, graticule1_position, xgrat, ygrat,
dg_jmp_new_adr, graticule1_display, graticule1_display+graticule_size,

& ref line 1 &
dg_jmp_new_adr, ref_line1_position, ref_line1_display+ref_line_size,

& hilight 1 &
dg_setattribute_new_adr, hilight_ch1, dimoff,

& parameter 1 &
dg_movech2_new_adr, param1_position, param_row, param1_col,
dg_jmp_new_adr, param1_display, param1_display+param_size,

& math 1 &
dg_jmp_new_adr, math1_display, math1_display+math_size,

& format 1 &
dg_movech2_new_adr, format1_position, param_row, format1_col,
dg_jmp_new_adr, format1_display, format1_display+format_size,

& reference value label 1 &
dg_movech2_new_adr, ref1_label_position, ref_row, ref1_col,
dg_jmp_new_adr, ref1_label_display, ref1_label_display+ref_label_size,
& reference value 1 &
dg_jmp_new_adr, ref1_display, ref1_display+ref_size,
& reference suffix 1 &
dg_jmp_new_adr, ref1_suffix_display,ref1_suffix_display+ref_suffix_size,

& scale 1 &
dg_movech2_new_adr, scale1_position, scale_row, scale1_col,
dg_jmp_new_adr, scale1_display, scale1_display+scale_size,
& scale suffix 1 &
dg_jmp_new_adr, scale1_suffix_display,
   scale1_suffix_display+scale_suffix_size,

& marker display 1 &
dg_movech2_new_adr, mkr1_label_position, mkr_row, mkr1_col,
dg_jmp_new_adr, mkr1_label_display, mkr1_label_display+mkr_label_size,
& marker real value &
dg_movech2_new_adr, mkr1_real_position, mkr_row, mkr1_real_col,
dg_jmp_new_adr, mkr1_real_display, mkr1_real_display+mkr_display_size,
& marker imaginary value &
dg_movech2_new_adr, mkr1_imag_position, mkr_row, mkr1_imag_col,
dg_jmp_new_adr, mkr1_imag_display, mkr1_imag_display+mkr_display_size,

& marker 1 stimulus value &
dg_movech2_new_adr, mkr1_stim_position, mkr_stim_row, mkr1_stim_col,
```

```
dg_jmp_new_adr, mkr1_stim_display,
   mkr1_stim_display+stim_size,
& marker 1 stimulus suffix &
dg_jmp_new_adr, mkr1_stim_suffix_display,
   mkr1_stim_suffix_display+stim_suffix_size,

& start/center mode 1 &
dg_movech2_new_adr, start1_mode_position, start_row, start1_col,
dg_jmp_new_adr, start1_mode_display, start1_mode_display+stim_mode_size,
& start/center1 &
dg_jmp_new_adr, start1_display, start1_display+stim_size,
& start/center suffix 1 &
 jmp_new_adr, start1_suffix_display,
   start1_suffix_display+stim_suffix_size,

 stop/span mode &
 movech2_new_adr, stop1_mode_position, stop_row, stop1_col,
 jmp_new_adr, stop1_mode_display, stop1_mode_display+stim_mode_size,
 stop/span 1 &
 jmp_new_adr, stop1_display, stop1_display+stim_size,
& stop/span suffix &
dg_jmp_new_adr, stop1_suffix_display,
   stop1_suffix_display+stim_suffix_size,

& hilight 1 off &
dg_setattribute_new_adr, hilight_ch1_off, dimoff,

& CHANNEL 2 &

& jump2 &
dg_setattribute_new_adr, jump_channel2, nop,

& trace2 &
dg_move2_new_adr, trace2_position, trace2_x, trace2_y,
dg_jmp_new_adr, trace2_display, trace2_display+trace_size,
& trace2 mark &
dg_jmp_new_adr, trace_mark2_display,trace_mark2_display+trace_mark_size,
& trace2 update mark &
dg_jmp_new_adr, update_mark2_position,
   update_mark2_display+update_mark_size,

& trace2n &
dg_move2_new_adr, trace2n_position, trace2n_x, trace2n_y,
dg_jmp_new_adr, trace2n_display, trace2n_display+trace_size,

& markers &
dg_jmp_new_adr, mkr21_position, mkr21_display+mkr_size,
dg_jmp_new_adr, mkr22_position, mkr22_display+mkr_size,
dg_jmp_new_adr, mkr23_position, mkr23_display+mkr_size,
dg_jmp_new_adr, mkr24_position, mkr24_display+mkr_size,
dg_jmp_new_adr, mkr25_position, mkr25_display+mkr_size,
dg_jmp_new_adr, mkr26_position, mkr26_display+mkr_size,
dg_jmp_new_adr, mkr27_position, mkr27_display+mkr_size,
dg_jmp_new_adr, mkr28_position, mkr28_display+mkr_size,

& graticule 2 &
```

```
dg_move2_new_adr, graticule2_position, xgrat, ygrat,
dg_jmp_new_adr, graticule2_display, graticule2_display+graticule_size,

& ref line 2 &
dg_jmp_new_adr, ref_line2_position, ref_line2_display+ref_line_size,

& highlight 2 &
dg_setattribute_new_adr, hilight_ch2, dimoff,

& parameter 2 &
dg_movech2_new_adr, param2_position, param_row, param2_col,
dg_jmp_new_adr, param2_display, param2_display+param_size,

& math 2 &
dg_jmp_new_adr, math2_display, math2_display+math_size,

& format 2 &
dg_movech2_new_adr, format2_position, param_row, format2_col,
dg_jmp_new_adr, format2_display, format2_display+format_size,

& reference value label 2 &
dg_movech2_new_adr, ref2_label_position, ref_row, ref2_col,
dg_jmp_new_adr, ref2_label_display, ref2_label_display+ref_label_size,
& reference value 2 &
dg_jmp_new_adr, ref2_display, ref2_display+ref_size,
& reference suffix 2 &
dg_jmp_new_adr, ref2_suffix_display,ref2_suffix_display+ref_suffix_size,

& scale 2 &
dg_movech2_new_adr, scale2_position, scale_row, scale2_col,
dg_jmp_new_adr, scale2_display, scale2_display+scale_size,
& scale suffix 2 &
dg_jmp_new_adr, scale2_suffix_display,
   scale2_suffix_display+scale_suffix_size,

& marker display 2 &
dg_movech2_new_adr, mkr2_label_position, mkr_row, mkr2_col,
dg_jmp_new_adr, mkr2_label_display, mkr2_label_display+mkr_label_size,
& marker real value &
dg_movech2_new_adr, mkr2_real_position, mkr_row, mkr2_real_col,
dg_jmp_new_adr, mkr2_real_display, mkr2_real_display+mkr_display_size,
& marker imaginary value &
dg_movech2_new_adr, mkr2_imag_position, mkr_row, mkr2_imag_col,
dg_jmp_new_adr, mkr2_imag_display, mkr2_imag_display+mkr_display_size,

& marker 2 stimulus value &
dg_movech2_new_adr, mkr2_stim_position, mkr_stim_row, mkr2_stim_col,
dg_jmp_new_adr, mkr2_stim_display,
   mkr2_stim_display+stim_size,
& marker 2 stimulus suffix &
dg_jmp_new_adr, mkr2_stim_suffix_display,
   mkr2_stim_suffix_display+stim_suffix_size,

& start/center mode 2 &
dg_movech2_new_adr, start2_mode_position, start_row, start2_col,
dg_jmp_new_adr, start2_mode_display, start2_mode_display+stim_mode_size,
```

SSCREEN.WORK.PD8510 THU, DEC 22, 1983, 10:57 AM PAGE 8

```
& start/center 2 &
dg_jmp_new_adr, start2_display, start2_display+stim_size,
& start/center suffix 2 &
dg_jmp_new_adr, start2_suffix_display,
   start2_suffix_display+stim_suffix_size,

& stop/span mode 2 &
dg_movech2_new_adr, stop2_mode_position, stop_row, stop2_col,
dg_jmp_new_adr, stop2_mode_display, stop2_mode_display+stim_mode_size,
& stop/span 2 &
dg_jmp_new_adr, stop2_display, stop2_display+stim_size,
& stop/span suffix 2 &
dg_jmp_new_adr, stop2_suffix_display,
   stop2_suffix_display+stim_suffix_size,

& hilight 2 off &
dg_setattribute_new_adr, hilight_ch2_off, dimoff,

& update raw mark &
dg_jmp_new_adr, update_raw_position,
   update_raw_display+update_raw_size,

& user display &
dg_jmp_new_adr, user_display, end_position,

dg_stop;
```

SSCREEN.WORK.PD8510 THU, DEC 22, 1983, 10:57 AM PAGE 9

```
%EJECT;
COMMENT                                                          print_string
*************************************************************************
*                                                                       *
* EXTERNAL SPECIFICATION FOR print_string                               *
*                                                                       *
* FUNCTION: to write a string into the display memory, taking care of   *
*           all jump linkages between display blocks.                   *
*                                                                       *
* DECLARATION INFORMATION:                                              *
*    PROCEDURE  print_string(string,blocklength,block)                  *
*      VALUE    string,blocklength,block                                *
*      INTEGER blocklength,block                                        *
*      ALPHA   string                                                   *
*                                                                       *
*    INPUT:   block         integer     word offset of block from start *
*                                       of display ram.                 *
*             blocklength integer       max number of words in block.   *
*             string        alpha       string to be displayed.         *
*                                                                       *
*    OUTPUT:  none                                                      *
*                                                                       *
* EXTERNAL EFFECTS:  none                                               *
*                                                                       *
* COMMENTS:  The blocks are defined in file FSCREEN.  Each block is     *
*            preceeded by a positioning vector.  Each block is          *
*            is expected to terminate with a display jump to the        *
*            location immediately following the block                   *
*            (block+blocklen = positioning vector for the next block).  *
*            Note that the jump is not required if the string fills     *
*            the entire block, since it has the same result.            *
*                                                                       *
*            In order to avoid extraneous vectors on the display        *
*            during the write operation, the terminating jump should    *
*            be entered first, and the string entered from last        *
*            character to first.                                        *
*                                                                       *
*************************************************************************
*                                                                       *
* LOGIC INFORMATION FOR print_string                                    *
*                                                                       *
* MODULES CALLED: printch                                               *
*                                                                       *
* INITIAL REFINEMENT:                                                   *
*                                                                       *
*    IF string_length < blocklength THEN                                *
*      block[string_length + 1] := display jump to block+blocklength.  *
*    FOR index := end_of_string TO beginning_of_string DO               *
*      block[index] := string[index].  & watch for string_length=0 &   *
*                                                                       *
*************************************************************************
;
PROCEDURE print_string(string,blocklength,block);
   VALUE string,blocklength,block;
   INTEGER blocklength,block;
   ALPHA string;                                               ENTRY;
```

SSCREEN.WORK.PD8510 THU, DEC 22, 1983, 10:57 AM PAGE 10

```
   BEGIN  & print_string &
      COMMENT does not check to make sure string length is not greater
         than blocklength;
      INTEGER i,a;
      BYTE POINTER ptr;
      DOUBLE stringaddr = string;

      STPNTR(ptr,stringaddr);

      i := ptr[0];
      IF i >= blocklength THEN              & seldom >= blocklength &
         BEGIN & if &
            IF i > blocklength THEN         & ELSE is faster than   &
               i := blocklength;            &     THEN portion.     &
         END & if &
      ELSE                                  & usually < blocklength &
         a := jmp(block+i, block+blocklength);
      WHILE i > 0 DO
         BEGIN  & while &
            a := printch(block+i-1, ptr[i]);
            i := i-1;
         END while;
   END; & print_string &
```

SSCREEN.WORK.PD8510 THU, DEC 22, 1983, 10:57 AM PAGE 11

```
%EJECT;
COMMENT                                                      print_big_string
*************************************************************************
*
* allow about 10 locations in "block" for each character.
*
* will not handle characters that contain jumps or jump subroutines.
*
*************************************************************************
;
PROCEDURE  print_big_string(string,blocklength,block);
   VALUE   string,blocklength,block;
   INTEGER blocklength,block;
   ALPHA   string;                                             ENTRY;
   BEGIN & print_big_string &
      INTEGER CONSTANT jmp_table   := %3000;& offset to base of jmp tbl &
      INTEGER CONSTANT jump        := %C000,
                       loadxy      := %4000,
                       return      := %2000,
                       op_mask     := %C000,
                       rtn_op_mask:= %E000,
                       jump_mask   := %3FFF;
      INTEGER      i,
                   ch,
                   block_end,
                   coord,                       & x or y coordinate &
                   from,     & display generator address in char. set &
                   to;       & display generator destination address  &
      INTEGER dg_data;
      INTEGER POINTER  dg_ptr;
      BYTE POINTER str;
      DOUBLE stringaddr = string;

      STPNTR(str,stringaddr);
      STPNTR(dg_ptr, ADRS(dgram) );

      block_end := block + blocklength; & not testing for excess length&
      to := jmp(block, block_end);            & skip over until done &

      IF str[0] > 0 THEN
         FOR i := 1 TO str[0] DO
            BEGIN & for &
               ch := %00FF AND INTEGER( str[i] );      & get character &
               dg_data := dg_ptr[jmp_table+ch];      & get table's jump &

               IF (dg_data AND op_mask) = jump THEN
                  BEGIN & if &
                     from := dg_data AND jump_mask;
                     dg_data := dg_ptr[from];

                     WHILE ( ((dg_data AND rtn_op_mask) <> return)
                           AND (to <= (block_end-2))  & room for RTS &
                           ) DO
                        BEGIN & while &
                           IF (dg_data AND op_mask) = loadxy THEN
                                    & multiply coordinate and     &
```

```
SSCREEN.WORK.PD8510              THU, DEC 22, 1983, 10:57 AM     PAGE  12

                                    & keep opcode and attributes &
                     BEGIN & if &
                        coord := dg_data AND %OFFF;
                        & 12-bit sign extension &
                        IF coord > %07FF THEN
                           coord := coord OR %F000;
                        & mpy coordinate by 1.375 &
                        dg_data := ( ( coord + ARIGHT(coord,1)
                                             - ARIGHT(coord,3)
                                   ) AND %OFFF
                                 ) OR (dg_data AND %F000);
                     END;  & if &
                  dg_ptr[to] := dg_data;
                  to := to + 1;
                  dg_data := dg_ptr[from:=from+1];
               END;  & while &

            IF ((dg_data AND rtn_op_mask) = return) THEN
               BEGIN & if &
                  & mask off return opcode but leave attribute&
                  dg_ptr[to] := dg_data AND %1FFF;
                  to := to + 1;
               END   & if &
            ELSE & stopped in the middle of a character &
               to := setattribute(to, charincroff);& to:=to+1 &

         END;  & if &
      END;  & for &

   IF to < block_end THEN                   & jump over unused locations &
      to := jmp(to, block_end);
   setattribute(block, nop);                  & allow it to be displayed &

END;  & print_big_string &
```

```
SSCREEN.WORK.PD8510              THU, DEC 22, 1983, 10:57 AM     PAGE  13

#EJECT;                                                        blank_display
COMMENT
****************************************************************************
*
****************************************************************************
;                                                                     ENTRY;
SUBROUTINE blank_display;
   BEGIN & blank_display &
      setattribute( blank_screen, eod );             & blank the display &
   END;  & blank_display &
```

```
SSCREEN.WORK.PD8510              THU, DEC 22, 1983, 10:57 AM     PAGE  14

#EJECT;                                                       enable_display
COMMENT
****************************************************************************
*
****************************************************************************
;                                                                     ENTRY;
SUBROUTINE enable_display;
   BEGIN & enable_display &
      setattribute( blank_screen, nop );          & reenable the display &
   END;  & enable_display &
```

```
SSCREEN.WORK.PD8510              THU, DEC 22, 1983, 10:57 AM     PAGE  15

#EJECT;                                                          init_screen
COMMENT
****************************************************************************
*
****************************************************************************
;                                                                     ENTRY;
PROCEDURE init_screen;
   BEGIN  & init_screen &                                          & DEBUG &
      INTEGER i;
      INTEGER addr;

      addr := init_display;
      addr := jmp( addr, start_display+start_size );
      & any changes must also be reflected in "start_size " in CSCREEN &

      & enter position vector prefixes for each block &
      & and initialize associated strings, if any     &
      addr := display_from_table( addr, ADRS(screen_table) );

      addr := lb(title_display, "SYSTEM INITIALIZATION IN PROGRESS");
      addr := jmp(addr,title_display+title_size);

      error := ADRS(error_array);
      error := init_string(error,error_size);

      title_array[-1] := title_size;
      title_array[0]  := 0;
      title := ADRS(title_array);      & initialized from machine state &

      function := ADRS(function_array);
      function := init_string(function,function_string_size);

      entry_flip_flop := TRUE;
      entry := ADRS(entry_array);
      entry := init_string(entry,entry_string_size);

      entry_aux := ADRS(entry_aux_array);
      entry_aux := init_string(entry_aux,entry_aux_size);

 & ANNOTATION &

      print_string("REF ", ref_label_size, ref1_label_display);
      print_string("REF ", ref_label_size, ref2_label_display);

   END init_screen;

 END$
```

```
USCREEN.WORK.PD8510          THU, DEC 22, 1983, 10:57 AM    PAGE  1


1
1,/ DEC /-2d
$
? DEC ?
+
.,$d
1,$s/^ *[0-9]* *//
1,$s/^.* DEC /DEC /
1,$s/^ *//
1,$s/[,;]//
g/DEC /.-1,.j
1,$s/ *DEC */ =    /
1,$s/ *$//
1,$s/^\([^ ]*\).*\([ 0-9]\{5,5\}\)$/\2 = \1/
```

```
XSCREEN.WORK.PD8510          THU, DEC 22, 1983, 10:57 AM    PAGE  1

M68KL,P BEGIN
#FILE cscreen.work;
$LIST;
INTEGER TABLE yscreen :=
END$
```

```
YSCREEN.WORK.PD8510          THU, DEC 22, 1983, 10:57 AM    PAGE  1

   23.8.83)           THU, DEC 22, 1983,  6:03 AM
      8KL,P BEGIN
      NTEGER TABLE yscreen :=
       ORB
      NDS
    c  $yscreen:
    5  END$
       ^
  ERROR 2
missing NUMBER

  1 ERRORS
 KSPMAX=3 NSPMAX=9 SSPMAX=7191 BSPMAX=1 CSPMAX=0 DSPMAX=1
 FSPMAX=0 PSPMAX=0 RSPMAX=0 QSPMAX=0
ELAPSED TIME 0:10
CPU TIME 0:03
```

```
FSCREENO.WORK.PD8510         THU, DEC 22, 1983, 10:57 AM    PAGE  1

PROCEDURE  print_string(string,blocklength,block);
   VALUE   string,blocklength,block;
   INTEGER blocklength,block;                                  EXTERNAL.L;
   ALPHA   string;
PROCEDURE  print_big_string(string,blocklength,block);
   VALUE   string,blocklength,block;
   INTEGER blocklength,block;                                  EXTERNAL.L;
   ALPHA   string;                                             EXTERNAL.L;
SUBROUTINE blank_display;                                      EXTERNAL.L;
SUBROUTINE enable_display;
```

```
FSCREEN1.WORK.PD8510          THU, DEC 22, 1983, 10:57 AM     PAGE   1

& CHANGES MUST BE DUPLICATED IN f/sactv2.work &

& title &
EXTERNAL BYTE ARRAY title_array[-1:1];
EXTERNAL ALPHA title;

& error &
EXTERNAL BYTE ARRAY error_array[-1:1];
EXTERNAL ALPHA error;

& function &
EXTERNAL BYTE ARRAY function_array[-1:1];
EXTERNAL ALPHA function;

& entry &
EXTERNAL BYTE ARRAY entry_array[-1:1];
EXTERNAL ALPHA entry;
EXTERNAL BOOLEAN entry_flip_flop;

& entry aux &
EXTERNAL BYTE ARRAY entry_aux_array[-1:1];
EXTERNAL ALPHA entry_aux;
```

```
CSCREEN2.WORK.PD8510          THU, DEC 22, 1983, 10:57 AM     PAGE   1

#FILE cchars.work;

INTEGER CONSTANT hilight_1      := 128,
                 hilight_2      := 129,
                 hilight_3      := 130,
                 hilight_4      := 131,
                 hilight_5      := 132,
                 hilight_6      := 133,
                 hilight_7      := 134,
                 hilight_8      := 135,
                 hilight_9      := 136,
                 hilight_10     := 137,
                 sk_indicator   := 144,
                 sk_bracket_2   := 145,
                 sk_bracket_3   := 146,
                 sk_bracket_4   := 147,
                 sk_bracket_5   := 148,
                 sk_bracket_6   := 149,
                 sk_bracket_7   := 150,
                 sk_bracket_8   := 151;
```

```
FSCREEN2.WORK.PD8510          THU, DEC 22, 1983, 10:57 AM     PAGE   1

COMMENT these include offset for hardware inclusion of ldxy instruction;
EXTERNAL INTEGER trace1_base.L,
                 trace2_base.L,
                 trace1_m_base.L,
                 trace2_m_base.L;
```

```
SSCREEN2.WORK.PD8510          THU, DEC 22, 1983, 10:57 AM     PAGE   1

M68KL,P,"scrn2"
BEGIN

#FILE fiocnfig.work;                              & for dg_ldxy &
#FILE cscreen.work;                & for trace..._display constants &

COMMENT these include offset for hardware inclusion of ldxy instruction;
GLOBAL INTEGER trace1_base.L    = dg_ldxy + 2*trace1_display,
               trace2_base.L    = dg_ldxy + 2*trace2_display,
               trace1_m_base.L  = dg_ldxy + 2*trace1m_display,
               trace2_m_base.L  = dg_ldxy + 2*trace2m_display;

END$
```

```
SSCREENP.WORK.PD8510              THU, DEC 22, 1983, 10:57 AM     PAGE   1

$LIST OFF$
$USLINIT$
PROGRAM screen_constants( input, output );

{ converts a number (including leading blanks) in the first 5 characters
  of a line to four numbers -- n, 2*n, hex(n), hex(2*n) -- and outputs
  the expanded line.
}

CONST
   hex_chars  = '0123456789ABCDEF';
   line_max   = 80;  {maximum length of an input line}
   hex_max    = 4;    {maximum length of a hex string}

TYPE
   line_index = 0..line_max;
   line_type  = STRING[line_max];
   hex_index  = 0..hex_max;
   hex_type   = STRING[hex_max];

VAR
   line_in,
   line_out   : line_type;
   number     : integer;
   dummy      : line_index;

FUNCTION  hex( number:integer ):hex_type;
   VAR
      position : hex_index;
      temp_string : hex_type;
   BEGIN {hex}
      position := hex_max;
      temp_string := strrpt( '0', hex_max );
      WHILE ( (number > 0) AND (position > 0) ) DO
         BEGIN {while}
            temp_string[position] := hex_chars[ 1 + (number MOD 16) ];
            number := number DIV 16;
            position := position - 1;
         END;  {while}
      hex := temp_string;
   END;  {hex}

BEGIN {screen_constants}

writeln( output, 'n':6, '2n':6, 'nH':5, '2nH':5, 'addr':7,
                 'description':14 );
writeln( output );

WHILE NOT eof( input ) DO
   BEGIN {while}

      readln( input, line_in );
      line_in := strrtrim( line_in );

      strread( line_in, 1, dummy, number );
```

```
SSCREENP.WORK.PD8510              THU, DEC 22, 1983, 10:57 AM     PAGE   2

      strdelete( line_in, 1, dummy-1 );

      write(output, number:6, (2*number):6 );
      write(output, hex(number):5, hex(2*number):5 );
      write(output, ' 10', hex(2*number):4 );
      writeln( output, line_in );

   END;  {while}

END.  {screen_constants}
```

```
FSIZE.WORK.PD8510                 THU, DEC 22, 1983, 10:57 AM     PAGE   1

INTEGER SUBROUTINE number_of_points;                           EXTERNAL;
INTEGER SUBROUTINE array_size;                                 EXTERNAL;
INTEGER SUBROUTINE block_size;                                 EXTERNAL;
```

```
SSIZE.WORK.PD8510                 THU, DEC 22, 1983, 10:57 AM  -  PAGE   1

M68KL,P,"size"
BEGIN

#FILE fchdata.work;                                    & for header_size &
#FILE cmbmgr.work;

INTEGER TABLE   data_array_size :=                 & indexed by step_size &
& 0             &    0,                  & # bytes per complex data array &
&  1 = 801 pts &  801 * 6,
&  2 = 401 pts &  401 * 6,
&  3           &    0,
&  4 = 201 pts &  201 * 6,
&  5           &    0,
&  6           &    0,
&  7           &    0,
&  8 = 101 pts &  101 * 6,
&  9           &    0,
& 10           &    0,
& 11           &    0,
& 12           &    0,
& 13           &    0,
& 14           &    0,
& 15           &    0,
& 16 =  51 pts &   51 * 6;

INTEGER TABLE   data_block_size :=                 & indexed by step_size &
                                           & # bytes per storage data block &
& 0            &    0,
&  1 = 801 pts &  (((801 * 6) + header_size) OR %003F) + 1,
&  2 = 401 pts &  (((401 * 6) + header_size) OR %003F) + 1,
&  3           &    0,
&  4 = 201 pts &  (((201 * 6) + header_size) OR %003F) + 1,
&  5           &    0,
&  6           &    0,
&  7           &    0,
&  8 = 101 pts &  (((101 * 6) + header_size) OR %003F) + 1,
&  9           &    0,
& 10           &    0,
& 11           &    0,
& 12           &    0,
& 13           &    0,
& 14           &    0,
& 15           &    0,
& 16 =  51 pts &  ((( 51 * 6) + header_size) OR %003F) + 1;

INTEGER TABLE   number_of_pts :=                   & indexed by step_size &
&  0 &    0,
&  1 &  801,
&  2 &  401,
&  3 &    0,
&  4 &  201,
&  5 &    0,
&  6 &    0,
&  7 &    0,
&  8 &  101,
&  9 &    0,
```

```
SSIZE.WORK.PD8510            THU, DEC 22, 1983, 10:58 AM     PAGE  2

& 10 &    0,
& 11 &    0,
& 12 &    0,
& 13 &    0,
& 14 &    0,
& 15 &    0,
& 16 &   51;
```

```
SSIZE.WORK.PD8510            THU, DEC 22, 1983, 10:58 AM     PAGE  3

#EJECT;
COMMENT                                                   number_of_points
***************************************************************************
*
***************************************************************************
;
INTEGER SUBROUTINE number_of_points;                                ENTRY;
   BEGIN & number_of_points &
      number_of_points := number_of_pts[step_size];
   END;  & number_of_points &
```

```
SSIZE.WORK.PD8510            THU, DEC 22, 1983, 10:58 AM     PAGE  4

#EJECT;
COMMENT                                                         array_size
***************************************************************************
*
***************************************************************************
;
INTEGER SUBROUTINE array_size;                                      ENTRY;
   BEGIN & array_size &
      array_size := data_array_size[step_size];
   END;  & array_size &
```

```
SSIZE.WORK.PD8510            THU, DEC 22, 1983, 10:58 AM     PAGE  5

#EJECT;
COMMENT                                                         block_size
***************************************************************************
*
***************************************************************************
;
INTEGER SUBROUTINE block_size;                                      ENTRY;
   BEGIN & block_size &
      block_size := data_block_size[step_size];
   END;  & block_size &

END$
```

FSK.WORK.PD8510 THU, DEC 22, 1983, 10:58 AM PAGE 1

```
sbotkbd
scommand
scontrol
scontvar
smarker
sparam
sparser
srespons
stopkbd
```

USK.WORK.PD8510 THU, DEC 22, 1983, 10:58 AM PAGE 1

```
)i off
e skinfo.work
1
/^\$/
1,.d
v/^[0-9A-Z]/d
1,$s/^./#FILE c/
1,$s/$/;/
1,$s/\.L;/;/
wq ccmddecl.work
```

DSKEY.WORK.PD8510 THU, DEC 22, 1983, 10:58 AM PAGE 1

DSKEY.WORK.PD8510 THU, DEC 22, 1983, 10:58 AM PAGE 2

```
#EJECT;
COMMENT
$DOC+

NAME--
  skey
*************************************************************************
*
* SHORT DESCRIPTION--
*   contains tables which configure softkey menus
*
* EXTENDED DESCRIPTION--
*   This is a seperately compiled module which contains the following
*   tables of information used to generated softkey menus:
*
*      - softkey menu tables, SKSO..SKSn (where n=number of menus)
*      - table of addresses to softkey menu configuration tables
*      - table of softkey annotations
*      - table of indices to table of softkey annotations
*        (indexed by command code value of each softkey)
*
*   These tables are generated by a pre-processor which uses an input
*   file containing the actual softkey menu information in a modifiable
*   and picturesque format.
*
* INPUTS--
*   none
*
* OUTPUTS--
*   none
*
* ROUTINES CALLED--
*   none
*
* ERROR CONDITIONS AND RECOVERY--
*   none
*
* NOTES--
*   Any changes to be made in these tables must be made in the input
*   file (SKINFO) to the program (GENSK) which generates these tables.
*
* AUTHOR--
*
*************************************************************************
*
* INITIAL REFINEMENT--
*   NA
*
*************************************************************************
*
* REVISION LOG--
*
*************************************************************************
DECLARATION--
  INTEGER TABLE SKSO..SKSn
  DOUBLE TABLE MENU
```

```
DSKEY.WORK.PD8510           THU, DEC 22, 1983, 10:58 AM     PAGE  3

  INTEGER TABLE LBL_INDEX
  ALPHA TABLE SK_LABEL

$DOC-;
```

```
DSKEY.WORK.PD8510           THU, DEC 22, 1983, 10:58 AM     PAGE  4

#EJECT;
COMMENT
$DOC+

NAME--
  SKS0..SKSn
************************************************************************
*
* SHORT DESCRIPTION--
*   Tables of softkey menu configuration
*
* EXTENDED DESCRIPTION--
*   Each menu table is variable in length depending on the number of
*   softkeys per menu and how many of those softkeys bring up other
*   menus.  The tables are configured as follows:
*
*      +-----------------------------------+
*      | B15 | B14 | B13 |....| B2 | B1 | B0 | softkey position bitmap
*      +-----------------------------------+
*      | B15 | .... | B8 |   not used      | "next menu" bitmap
*      +-----------------------------------+
*      |  softkey command token value      |
*      +-----------------------------------+
*      |  "next menu" number based on bitmap |
*      +-----------------------------------+
*                        :
*                        :
*      +-----------------------------------+
*      |  softkey command token value      | up to 8 possible softkeys
*      +-----------------------------------+
*      |  "next menu" number based on bitmap | up to 8 "next menu" ptrs
*      +-----------------------------------+
*
*   The first word of each table contains 8 bit pairs (B0/B1..B14/B15)
*   corresponding to 8 softkey positions on the display (top to bottom).
*   Each pair of bits can contain a value indicating the following:
*      0 = no active softkey in this softkey position
*      1 = active softkey containing 1 line of annotation
*      2 = active softkey containing 2 lines of annotation
*
*   The most significant byte (B8..B15) of the second word contains a
*   bitmap where each set bit corresponds to softkeys which bring up
*   another menu.  The least significant byte of this word is not used
*   as part of the configuration.
*
*   The rest of the words in each table are command token values
*   corresponding to each active softkey as they occur in the softkey
*   position bitmap.  These words are followed by softkey menu numbers
*   only if the "next menu" bitmap indicates another menu is to be
*   brought up by that softkey.
*
* INPUTS--
*   none
*
* OUTPUTS--
*   none
```

```
DSKEY.WORK.PD8510           THU, DEC 22, 1983, 10:58 AM     PAGE  5

*
* ROUTINES CALLED--
*   none
*
* ERROR CONDITIONS AND RECOVERY--
*   none
*
* NOTES--
*
* AUTHOR--
*
************************************************************************
*
* INITIAL REFINEMENT--
*   MR
*
************************************************************************
*
* REVISION LOG--
*
************************************************************************

DECLARATION--

  INTEGER TABLE SKS0
          :
          :
  INTEGER TABLE SKSn

$DOC-;
```

```
DSKEY.WORK.PD8510           THU, DEC 22, 1983, 10:58 AM     PAGE  6

#EJECT;
COMMENT
$DOC+

NAME--
  SK_MENU
************************************************************************
*
* SHORT DESCRIPTION--
*   Table of softkey menu addresses
*
* EXTENDED DESCRIPTION--
*   This table contains the addresses of each softkey menu configuration
*   table.  Each menu configuration is identified by an integer constant
*   which is used an an index into this table in order to access the
*   corresponding address for that menu.
*
* INPUTS--
*   none
*
* OUTPUTS--
*   none
*
* ROUTINES CALLED--
*   none
*
* ERROR CONDITIONS AND RECOVERY--
*   none
*
* NOTES--
*
* AUTHOR--
*
************************************************************************
*
* INITIAL REFINEMENT--
*   MR
*
************************************************************************
*
* REVISION LOG--
*
************************************************************************

DECLARATION--

  DOUBLE TABLE SK_MENU

$DOC-;
```

```
DSKEY.WORK.PD8510            THU, DEC 22, 1983, 10:58 AM     PAGE   7

#EJECT;
COMMENT
$DOC+

NAME--
  SK_LABEL
*************************************************************************
*
* SHORT DESCRIPTION--
*   Table of softkey annotations
*
* EXTENDED DESCRIPTION--
*   This table contains strings from 1 to 10 characters long which are
*   used to label softkeys.  Each string is unique and occurs only once
*   in this table.  Softkeys which share common strings or simply have
*   unique strings use this table to look up the labels needed to
*   display the annotated menu.
*
*   The table is indexed using a pair of values from another table.
*   These values index the strings which correspond to the first and
*   second line (if any) of each softkey function.
*
* INPUTS--
*   none
*
* OUTPUTS--
*   none
*
* ROUTINES CALLED--
*   none
*
* ERROR CONDITIONS AND RECOVERY--
*   none
*
* NOTES--
*
* AUTHOR--
*
*************************************************************************
*
* INITIAL REFINEMENT--
*   NA
*
*************************************************************************
*
* REVISION LOG--
*
*************************************************************************
DECLARATION--

  GLOBAL ALPHA TABLE SK_LABEL

$DOC-;
```

```
DSKEY.WORK.PD8510            THU, DEC 22, 1983, 10:58 AM     PAGE   8

#EJECT;
COMMENT
$DOC+

NAME--
  LBL_INDEX
*************************************************************************
*
* SHORT DESCRIPTION--
*   Table of indices to table of softkey labels
*
* EXTENDED DESCRIPTION--
*   This table contain indices which occur in pairs used to index the
*   table of softkey labels (SK_LABEL) in order to access the first and
*   second line (if any) of each softkey.  If a softkey contains only
*   one line, then the second index of the index pair will be 0 (which
*   indexes a blank line).
*
*   The index pairs are arranged in order of softkey command token
*   values.  This enables a command token value multiplied by 2 to
*   to index into the location of an index pair.
*
* INPUTS--
*   none
*
* OUTPUTS--
*   none
*
* ROUTINES CALLED--
*   none
*
* ERROR CONDITIONS AND RECOVERY--
*   none
*
* NOTES--
*
* AUTHOR--
*
*************************************************************************
*
* INITIAL REFINEMENT--
*   NA
*
*************************************************************************
*
* REVISION LOG--
*
*************************************************************************

DECLARATION--

  GLOBAL INTEGER TABLE LBL_INDEX

$DOC-;
```

```
FSKEY.WORK.PD8510            THU, DEC 22, 1983, 10:58 AM     PAGE   1

EXTERNAL DOUBLE TABLE SK_MENU.L;
EXTERNAL ALPHA TABLE SK_LABEL.L;
EXTERNAL INTEGER TABLE LBL_INDEX.L;
```

```
SSKEY.WORK.PD8510            THU, DEC 22, 1983, 10:58 AM     PAGE   1

M68KL,P,"skey" BEGIN

#FILE cmenu.work;
#FILE cscreen.work;
COMMENT
  Configures bit pairs to correspond to softkeys that are used.
  SKnm = softkey position n contains m lines.
  BSKn = softkey position n that brings up another menu
  n    = 1..8
  m    = 0..2
;
INTEGER CONSTANT
  SK11 := 1,
  SK12 := 2,
  SK13 := 3,
  SK21 := 4,
  SK22 := 8,
  SK23 := %C,
  SK31 := %10,
  SK32 := %20,
  SK33 := %30,
  SK41 := %40,
  SK42 := %80,
  SK43 := %C0,
  SK51 := %100,
  SK52 := %200,
  SK53 := %300,
  SK61 := %400,
  SK62 := %800,
  SK63 := %C00,
  SK71 := %1000,
  SK72 := %2000,
  SK73 := %3000,
  SK81 := %4000,
  SK82 := %8000,
  SK83 := %C000,
  BSK1 := %100,
  BSK2 := %200,
  BSK3 := %400,
  BSK4 := %800,
  BSK5 := %1000,
  BSK6 := %2000,
  BSK7 := %4000,
  BSK8 := %8000;
COMMENT
      The rest of this file is software generated by GENSK.LANI,
      Any changes must be made to the input file, SKINFO.WORK.
      ***********************************************************
      The following are softkey menu tables configured as follows:
        word 1 = MSByte: corresponding keys that bring up new menus
                 LSByte: menu's highlight bitmap
        word 2 = menu configuration using constants SKnm
        word 3 = keycode number corresponding to softkeys used
         etc.
        word N = up to 10 keycode values
```

```
;
INTEGER TABLE SKS0 :=        & TAPE_MENU &
BSK8+0,
SK11+SK21+SK31+SK41+SK51+SK82+0,
  1,   & "DIRECTORY"  &
  2,   & "STORE"   &
  3,   & "LOAD"   &
  4,   & "DELETE"   &
  5,   & "UN-DELETE"   &
  6,   & "INITIALIZE" "TAPE" &
INIT_TAPE_MENU;

INTEGER TABLE SKS1 :=        & INIT_TAPE_MENU &
0,
SK12+SK21+0,
  7,   & "INIT TAPE?" "YES" &
  8;   & "NO"   &

INTEGER TABLE SKS2 :=        & DIRECTORY_MENU &
0,
SK12+SK42+SK52+SK72+SK82+0,
  9,   & "RESTORE" "DISPLAY" &
 10,   & "NEXT" "PAGE" &
 11,   & "PREVIOUS" "PAGE" &
 12,   & "FIRST" "PAGE" &
 13;   & "LAST" "PAGE" &

INTEGER TABLE SKS3 :=        & DATA2_MENU &
0,
SK12+SK21+SK32+SK52+SK82+0,
 14,   & "RAW" "DATA" &
 15,   & "DATA"   &
 16,   & "FORMATTED" "DATA" &
 17,   & "USER" "DISPLAY" &
 18;   & "MACHINE" "DUMP" &

INTEGER TABLE SKS4 :=        & DATA1_MENU &
BSK8+0,
SK12+SK22+SK32+SK42+SK51+SK62+SK71+SK81+0,
 19,   & "INSTRUMENT" "STATE" &
 20,   & "INSTRUMENT" "STATES 1-5" &
 21,   & "MEMORY" "TRACE" &
 22,   & "MEMORY" "TRACES 1-4" &
 23,   & "CAL SET"   &
 24,   & "CAL SETS" "1-8" &
 25,   & "CAL KIT"   &
 26,   & "MORE"   &
DATA2_MENU;

INTEGER TABLE SKS5 :=        & ABORT_MENU &
0,
```

```
SK11+0,
 27;   & "ABORT"   &

INTEGER TABLE SKS6 :=        & FILE_MENU &
0,
SK12+SK22+SK32+SK42+SK52+SK62+SK72+SK82+0,
 28,   & "DATA TYPE " "* FILE 1" &
 29,   & " " "* FILE 2" &
 30,   & " " "* FILE 3" &
 31,   & " " "* FILE 4" &
 32,   & " " "* FILE 5" &
 33,   & " " "* FILE 6" &
 34,   & " " "* FILE 7" &
 35;   & " " "* FILE 8" &

INTEGER TABLE SKS7 :=        & REG_MENU &
0,
SK12+SK22+SK32+SK42+SK52+SK62+SK72+SK82+0,
 36,   & "DATA TYPE " "* 1 " &
 37,   & " " "* 2 " &
 38,   & " " "* 3 " &
 39,   & " " "* 4 " &
 40,   & "(POWER UP)" "* 5 " &
 41,   & " " "* 6 " &
 42,   & " " "* 7 " &
 43;   & " " "LAST STATE" &

INTEGER TABLE SKS8 :=        & RESPONSE_MENU &
0,
SK12+SK21+SK32+SK42+SK52+SK61+SK72+SK81+0,
 44,   & "ELECTRICAL"+sk_bracket_2 "DELAY" &
 45,   & "AUTO DELAY"   &
 46,   & "PHASE" "OFFSET" &
 47,   & "MAGNITUDE" "OFFSET" &
 48,   & "AVERAGING"+sk_bracket_2 "ON/RESTART" &
 49,   & "OFF"   &
 50,   & "SMOOTHING"+sk_bracket_2 "ON " &
 51;   & "OFF"   &

INTEGER TABLE SKS9 :=        & IF_GAIN_MENU &
BSK1+BSK2+0,
SK12+SK22+0,
 52,   & "TEST"+sk_bracket_2 "AMP. GAIN" &
IF_GAIN_MENU2,
 53,   & "REFERENCE" "AMP. GAIN" &
IF_GAIN_MENU2;

INTEGER TABLE SKS10 :=        & IF_GAIN_MENU2 &
0,
SK12+SK21+SK31+SK41+SK51+SK61+0,
 54,   & "GAIN"+sk_bracket_6 "0 (MIN.)" &
```

```
 55,   & " 1 "   &
 56,   & " 2 "   &
 57,   & " 3 "   &
 58,   & "4 (MAX.)"   &
 59;   & "AUTO"   &

INTEGER TABLE SKS11 :=        & STIMULUS_MENU &
[illegible]1+BSK3+BSK8+0,
[illegible]K22+SK32+SK52+SK61+SK71+SK81+0,
[illegible]   & "POWER" "MENU" &
[illegible]MENU,
[illegible]   & "SWEEP" "TIME" &
[illegible]   & "NUMBER of" "POINTS" &
[illegible]TS_MENU,
[illegible]   & "SINGLE"+sk_bracket_3 "POINT" &
[illegible]   & "RAMP"   &
[illegible]   & "STEP"   &
 26,   & "MORE"   &
STIMULUS2_MENU;

INTEGER TABLE SKS12 :=        & N_POINTS_MENU &
0,
SK12+SK21+SK31+SK41+0,
 66,   & "POINTS:"+sk_bracket_4 "51 " &
 67,   & "101"   &
 68,   & "201"   &
 69;   & "401"   &

INTEGER TABLE SKS13 :=        & POWER_MENU &
0,
SK11+SK32+SK41+SK62+SK71+0,
 70,   & "POWER"   &
 71,   & "SLOPE"+sk_bracket_2 "ON " &
 72,   & "OFF"   &
 73,   & "ATTENUATOR"+sk_bracket_2 "PORT 1" &
 74;   & "PORT 2"   &

INTEGER TABLE SKS14 :=        & STIMULUS2_MENU &
0,
SK11+SK21+SK32+SK41+SK52+SK71+SK81+0,
 75,   & sk_bracket_4 half_vt+"HOLD" &
 76,   & "SINGLE"   &
 77,   & "NUMBER of" "GROUPS" &
 78,   & "CONTINUAL"   &
 79,   & "STIMULUS" "OFFSET" &
 80,   & sk_bracket_2 half_vt+"Ch1 = Ch2" &
 81;   & "Ch1 "+163+" Ch2"   &

INTEGER TABLE SKS15 :=        & DEVICE_READY_MENU &
0,
SK22+0,
```

```
 82;   & "PRESS TO" "CONTINUE" &

INTEGER TABLE SKS16 :=        & PARAM_MENU &
BSK7+0,
SK11+SK21+SK31+SK41+SK72+0,
 83,   & "a"+177+sk_bracket_4   &
 84,   & "b"+178   &
 85,   & "a"+178   &
 86,   & "b"+177   &
 87,   & "REDEFINE" "PARAMETER" &
REDEF_MENU;

INTEGER TABLE SKS17 :=        & REDEF_MENU &
BSK1+BSK2+BSK3+BSK4+BSK5+0,
SK12+SK21+SK31+SK42+SK51+SK62+SK82+0,
 88,   & "REDEFINE"+sk_bracket_6 "DRIVE" &
REDEF_DRIVE_MENU,
 89,   & "PHASE LOCK"   &
REDEF_LOCK_MENU,
 90,   & "NUMERATOR"   &
REDEF_NUM_MENU,
 91,   & "DENOMI-" "NATOR" &
REDEF_DENOM_MENU,
 92,   & "CONVERSION"   &
REDEF_CONV_MENU,
 93,   & "PARAMETER" "LABEL" &
 94;   & "REDEFINE" "DONE" &

INTEGER TABLE SKS18 :=        & REDEF_DRIVE_MENU &
0,
SK12+SK21+SK31+0,
 95,   & "DRIVE"+sk_bracket_3 "PORT 1" &
 96,   & "PORT 2"   &
 97;   & "NONE"   &

INTEGER TABLE SKS19 :=        & REDEF_LOCK_MENU &
0,
SK12+SK21+SK31+0,
 98,   & "LOCK to"+sk_bracket_3 "a1 " &
 99,   & "a2 "   &
100;   & "NONE"   &

INTEGER TABLE SKS20 :=        & REDEF_NUM_MENU &
BSK5+0,
SK12+SK21+SK31+SK41+SK52+0,
101,   & "NUMERATOR"+sk_bracket_5 "b1 " &
102,   & "b2 "   &
103,   & "a1 "   &
104,   & "a2 "   &
105,   & "SERVICE" "SELECTIONS" &
REDEF_NUM2_MENU;
```

```
INTEGER TABLE SKS21 :=          & REDEF_NUM2_MENU &
0,
SK12+SK22+SK32+SK41+SK51+SK61+SK71+SK81+0,
106,   & "100 kHz"+sk_bracket_8 "TEST CAL" &
107,   & "100 kHz" "REF CAL" &
108,   & "DETECTOR" "GROUND" &
109,   & "ADC GROUND"   &
110,   & "VCAL"   &
111,   & "VREF"   &
112,   & "TEMP. 1"   &
113;   & "TEMP. 2"   &

INTEGER TABLE SKS22 :=          & REDEF_DENOM_MENU &
0,
SK12+SK21+SK31+SK41+0,
114,   & "DENOM."+sk_bracket_4 "a1 " &
115,   & "a2 "   &
116,   & "b1 "   &
117;   & "NO RATIO"   &

INTEGER TABLE SKS23 :=          & REDEF_CONV_MENU &
0,
SK12+SK21+SK31+SK41+0,
118,   & "CONVERT"+sk_bracket_4 "to   S" &
119,   & "to 1/S"   &
120,   & "to   Z"   &
121;   & "to   Y"   &

INTEGER TABLE SKS24 :=          & FORMAT_MENU &
0,
SK11+SK22+SK32+SK42+SK52+SK62+SK71+SK81+0,
122,   & sk_bracket_8 half_vt+"SWR" &
123,   & "LINEAR" "MAGNITUDE" &
124,   & "POLAR w/" "LIN MKR" &
125,   & "POLAR w/" "LOG MKR" &
126,   & "POLAR w/" "Re/Im MKR" &
127,   & "INVERTED" "SMITH" &
128,   & "IMAGINARY"   &
129;   & "REAL"   &

INTEGER TABLE SKS25 :=          & DOMAIN_MENU &
BSK2+BSK6+BSK7+0,
SK11+SK22+SK32+SK42+SK62+SK71+0,
130,   & sk_bracket_4 half_vt+"FREQUENCY" &
131,   & "TIME" "LOW PASS" &
LOW_PASS_FREQ,
132,   & "TIME" "BAND PASS" &
133,   & "AUX. VOLT" "OUTPUT" &
134,   & "SPECIFY"+sk_bracket_2 "TIME" &
TIME_SETUP_MENU,
```

```
135,   & "GATE"   &
GATE_SETUP_MENU;

INTEGER TABLE SKS26 :=          & LOW_PASS_FREQ &
0,
SK22+0,
136;   & "SET FREQ." "(LOW PASS)" &

INTEGER TABLE SKS27 :=          & TIME_SETUP_MENU &
0,
SK12+SK21+SK52+SK61+SK71+0,
137,   & "LOW PASS:"+sk_bracket_2 "STEP" &
138,   & "IMPULSE"   &
139,   & "WINDOW:"+sk_bracket_3 "MAXIMUM" &
140,   & "NORMAL"   &
141;   & "MINIMUM"   &

INTEGER TABLE SKS28 :=          & GATE_SETUP_MENU &
BSK7+0,
SK12+SK21+SK32+SK41+SK51+SK61+SK71+0,
142,   & "GATE"+sk_bracket_2 "ON" &
143,   & "OFF"   &
144,   & "GATE"+sk_bracket_4 "START" &
145,   & "STOP"   &
146,   & "CENTER"   &
147,   & "SPAN"   &
148,   & "GATE SHAPE"   &
GATE_SHAPE_MENU;

INTEGER TABLE SKS29 :=          & GATE_SHAPE_MENU &
0,
SK52+SK61+SK71+SK81+0,
149,   & "GATE SHAPE"+sk_bracket_4 "MAXIMUM" &
150,   & "WIDE"   &
151,   & "NORMAL"   &
152;   & "MINIMUM"   &

INTEGER TABLE SKS30 :=          & CAL_MENU &
BSK8+0,
SK12+SK21+SK32+SK52+SK62+SK72+SK81+0,
153,   & "CORRECTION"+sk_bracket_3 "ON" &
154,   & "OFF"   &
155,   & "SELECT" "CAL SET" &
156,   & "CALIBRATE"+sk_bracket_3 "( KIT #1 )" &
157,   & "CALIBRATE" "( KIT #2 )" &
158,   & "RESUME CAL" "SEQUENCE" &
 26,   & "MORE"   &
MORE_CAL;

INTEGER TABLE SKS31 :=          & MORE_CAL &
```

```
BSK1+BSK5+BSK6+0,
SK12+SK21+SK32+SK52+SK62+SK82+0,
159,   & "REFERENCE" "PLANES" &
REF_PLANE_MENU,
160,   & "SET Z"+176   &
161,   & "CAL SWEEP" "VOLTAGE" &
162,   & "MODIFY KIT"+sk_bracket_2 "( KIT #1 )" &
MODIFY_CAL_KIT_MENU,
163,   & "MODIFY KIT" "( KIT #2 )" &
MODIFY_CAL_KIT_MENU,
164;   & "DELETE A" "CAL SET" &

INTEGER TABLE SKS32 :=          & REF_PLANE_MENU &
0,
SK31+SK41+0,
165,   & sk_bracket_2 half_vt+"PLANE 1" &
166;   & "PLANE 2"   &

INTEGER TABLE SKS33 :=          & CAL_TYPE_MENU &
0,
SK22+SK42+SK52+SK62+SK72+SK82+0,
167,   & "SET FREQ." "(LOW PASS)" &
168,   & "FREQUENCY"+sk_bracket_5 "RESPONSE" &
169,   & "S"+177+177+"  " "1-PORT" &
170,   & "S"+178+178+"  " "1-PORT" &
171,   & "ONE-PATH" "2-PORT" &
172;   & "FULL" "2-PORT" &

INTEGER TABLE SKS34 :=          & PORT_ONE_REFL &
0,
SK12+SK21+SK31+SK82+0,
173,   & "S"+177+177+"  "+sk_bracket_3 "PORT1 STD1" &
174,   & "PORT1 STD2"   &
175,   & "PORT1 STD3"   &
176;   & "SAVE" "S"+177+177+" CAL" &

INTEGER TABLE SKS35 :=          & PORT_TWO_REFL &
0,
SK12+SK21+SK31+SK82+0,
177,   & "S"+178+178+"  "+sk_bracket_3 "PORT2 STD1" &
178,   & "PORT2 STD2"   &
179,   & "PORT2 STD3"   &
180;   & "SAVE" "S"+178+178+" CAL" &

INTEGER TABLE SKS36 :=          & CAL_MENU2 &
BSK1+BSK2+BSK3+0,
SK11+SK22+SK31+SK82+0,
181,   & sk_bracket_3 half_vt+"REFLECT'N" &
REFLECTION_MENU,
182,   & "TRANS-" "MISSION" &
TRANSMISSION_MENU,
```

```
183,   & "ISOLATION"   &
ISOLATION_MENU,
184;   & "SAVE" "2-PORT CAL" &

INTEGER TABLE SKS37 :=          & REFLECTION_MENU &
0,
SK12+SK21+SK31+SK42+SK51+SK61+SK82+0,
173,   & "S"+177+177+"  "+sk_bracket_3 "PORT1 STD1" &
174,   & "PORT1 STD2"   &
175,   & "PORT1 STD3"   &
177,   & "S"+178+178+"  "+sk_bracket_3 "PORT2 STD1" &
178,   & "PORT2 STD2"   &
179,   & "PORT2 STD3"   &
185;   & "REFLECT'N" "DONE" &

INTEGER TABLE SKS38 :=          & TRANSMISSION_MENU &
0,
SK22+SK32+SK42+SK52+SK82+0,
186,   & "FWD.TRANS." "FWD_TRANS_" &
187,   & "FWD.MATCH" "FWD_MATCH_" &
188,   & "REV.TRANS." "REV_TRANS_" &
189,   & "REV.MATCH" "REV_MATCH_" &
190;   & "TRANS." "DONE" &

INTEGER TABLE SKS39 :=          & ISOLATION_MENU &
0,
SK32+SK52+SK62+SK82+0,
191,   & "OMIT" "ISOLATION" &
192,   & "FWD ISOL'N" "FWD_ISOLN_" &
193,   & "REV ISOL'N" "REV_ISOLN_" &
194;   & "ISOLATION" "DONE" &

INTEGER TABLE SKS40 :=          & CAL_MENU3 &
BSK1+BSK2+BSK3+0,
SK11+SK22+SK31+SK82+0,
195,   & sk_bracket_3 half_vt+"REFLECT'N" &
SIMPLE_REFLECTION_MENU,
196,   & "TRANS-" "MISSION" &
SIMPLE_TRANSMISSION_MENU,
197,   & "ISOLATION"   &
SIMPLE_ISOLATION_MENU,
184;   & "SAVE" "2-PORT CAL" &

INTEGER TABLE SKS41 :=          & SIMPLE_REFLECTION_MENU &
0,
SK12+SK21+SK31+SK82+0,
173,   & "S"+177+177+"  "+sk_bracket_3 "PORT1 STD1" &
174,   & "PORT1 STD2"   &
175,   & "PORT1 STD3"   &
198;   & "REFLECT'N" "DONE" &
```

SSKEY.WORK.PD8510 THU, DEC 22, 1983, 10:58 AM PAGE 10

```
INTEGER TABLE SKS42 :=        & SIMPLE_TRANSMISSION_MENU &
0,
SK22+SK32+SK82+0,
186,   & "FWD.TRANS." "FWD_TRANS_" &
187,   & "FWD.MATCH" "FWD_MATCH_" &
190;   & "TRANS." "DONE" &

INTEGER TABLE SKS43 :=        & SIMPLE_ISOLATION_MENU &
0,
SK32+SK52+SK82+0,
191,   & "OMIT" "ISOLATION" &
192,   & "FWD ISOL'N" "FWD_ISOLN_" &
194;   & "ISOLATION" "DONE" &

INTEGER TABLE SKS44 :=        & STD_CLASS_MENU &
0,
SK11+SK21+SK31+SK41+SK51+SK61+SK71+SK82+0,
199,   & "STANDARD 1"   &
200,   & "STANDARD 2"   &
201,   & "STANDARD 3"   &
202,   & "STANDARD 4"   &
203,   & "STANDARD 5"   &
204,   & "STANDARD 6"   &
205,   & "STANDARD 7"   &
206;   & "STANDARDS " "DONE" &

INTEGER TABLE SKS45 :=        & SLIDING_LOAD_MENU &
0,
SK12+SK82+0,
207,   & "SLIDE IS" "SET" &
208;   & "SLIDING" "LOAD DONE" &

INTEGER TABLE SKS46 :=        & MODIFY_CAL_KIT_MENU &
BSK3+0,
SK12+SK32+SK42+SK62+SK82+0,
209,   & "SELECT" "STANDARD" &
210,   & "SPECIFY" "STD CLASS" &
SPECIFY_CLASS_MENU,
211,   & "LABEL" "STD CLASS" &
212,   & "LABEL" "CAL KIT" &
213;   & "DONE" "(DEFINED)" &

INTEGER TABLE SKS47 :=        & MODIFY_STDS_MENU &
BSK1+BSK2+BSK3+BSK4+BSK5+0,
SK12+SK21+SK31+SK42+SK52+0,
214,   & "STD TYPE"+sk_bracket_5 "OPEN" &
DEFINE_OPEN_MENU,
215,   & "SHORT"   &
DEFINE_SHORT_MENU,
216,   & "LOAD"    &
```

SSKEY.WORK.PD8510 THU, DEC 22, 1983, 10:58 AM PAGE 11

```
DEFINE_LOAD_MENU,
217,   & "DELAY/" "THRU" &
SPECIFY_OFFSET_MENU,
218,   & "ARBITRARY" "IMPEDANCE" &
SPECIFY_Z_MENU;

INTEGER TABLE SKS48 :=        & DEFINE_OPEN_MENU &
BSK6+0,
SK11+SK21+SK31+SK62+SK71+SK82+0,
219,   & " C"+176+" "   &
220,   & " C"+177+" "   &
221,   & " C"+178+" "   &
222,   & "SPECIFY" "OFFSET" &
SPECIFY_OFFSET_MENU,
223,   & "LABEL STD"   &
224;   & "DONE" "(DEFINED)" &

INTEGER TABLE SKS49 :=        & DEFINE_SHORT_MENU &
BSK6+0,
SK62+SK71+SK82+0,
222,   & "SPECIFY" "OFFSET" &
SPECIFY_OFFSET_MENU,
223,   & "LABEL STD"   &
224;   & "DONE" "(DEFINED)" &

INTEGER TABLE SKS50 :=        & DEFINE_LOAD_MENU &
BSK6+0,
SK41+SK51+SK62+SK71+SK82+0,
225,   & sk_bracket_2 half_vt+"FIXED" &
226,   & "SLIDING"   &
222,   & "SPECIFY" "OFFSET" &
SPECIFY_OFFSET_MENU,
223,   & "LABEL STD"   &
224;   & "DONE" "(DEFINED)" &

INTEGER TABLE SKS51 :=        & SPECIFY_Z_MENU &
BSK6+0,
SK11+SK21+SK31+SK41+SK51+SK62+SK71+SK82+0,
219,   & " C"+176+" "   &
220,   & " C"+177+" "   &
221,   & " C"+178+" "   &
225,   & sk_bracket_2 half_vt+"FIXED" &
226,   & "SLIDING"   &
222,   & "SPECIFY" "OFFSET" &
SPECIFY_OFFSET_MENU,
223,   & "LABEL STD"   &
224;   & "DONE" "(DEFINED)" &

INTEGER TABLE SKS52 :=        & SPECIFY_OFFSET_MENU &
0,
SK12+SK22+SK32+SK42+SK52+SK61+SK71+SK82+0,
```

SSKEY.WORK.PD8510 THU, DEC 22, 1983, 10:58 AM PAGE 12

```
227,   & "OFFSET" "DELAY" &
228,   & "OFFSET" "LOSS" &
229,   & "OFFSET" " Z"+176+" " &
230,   & "LOWER" "FREQUENCY" &
231,   & "UPPER" "FREQUENCY" &
232,   & sk_bracket_2 half_vt+"COAX" &
233,   & "WAVEGUIDE"   &
234;   & "DONE" "(DEFINED)" &

INTEGER TABLE SKS53 :=        & SPECIFY_CLASS_MENU &
BSK7+0,
SK12+SK21+SK31+SK42+SK51+SK61+SK71+SK82+0,
235,   & "S"+177+177+":  " "1st STD" &
236,   & "2nd STD"   &
237,   & "3rd STD"   &
238,   & "S"+178+178+":  " "1st STD" &
239,   & "2nd STD"   &
240,   & "3rd STD"   &
241,   & "MORE"   &
SPECIFY_CLASS_MENU2,
242;   & "DONE" "(SPEC'D)" &

INTEGER TABLE SKS54 :=        & SPECIFY_CLASS_MENU2 &
0,
SK12+SK21+SK42+SK82+0,
243,   & "TRANS.:" "FWD STD" &
244,   & "REV STD"   &
245,   & "FREQUENCY" "RESP. STD" &
242;   & "DONE" "(SPEC'D)" &

INTEGER TABLE SKS55 :=        & DISPLAY_MENU &
BSK2+BSK7+0,
SK12+SK22+SK31+SK41+SK52+SK62+SK72+SK82+0,
246,   & "SINGLE "+sk_bracket_2 "CHANNEL" &
247,   & "DUAL   " "CHANNEL" &
DUAL_CH_MENU,
248,   & sk_bracket_4 half_vt+"DATA" &
249,   & "MEMORY"   &
250,   & "DATA "+38 "MEMORY" &
251,   & "MATH" "(...)" &
252,   & "SELECT" "DEFAULTS" &
DISPLAY_DEFAULT_MENU,
253;   & "DATA "+169 "MEMORY" &

INTEGER TABLE SKS56 :=        & DUAL_CH_MENU &
0,
SK12+SK22+0,
254,   & "2 CHANNEL"+sk_bracket_2 "OVERLAY" &
255;   & "2 CHANNEL" "SPLIT" &

INTEGER TABLE SKS57 :=        & DISPLAY_DEFAULT_MENU &
```

SSKEY.WORK.PD8510 THU, DEC 22, 1983, 10:58 AM PAGE 13

```
BSK5+BSK7+0,
SK12+SK21+SK31+SK41+SK51+SK72+0,
256,   & "MEMORY"+sk_bracket_5 " 1 " &
257,   & " 2 "   &
258,   & " 3 "   &
259,   & " 4 "   &
260,   & "MORE"   &
MEMORY_MENU,
261,   & "MATH" "OPERATIONS" &
MATH_MENU;

INTEGER TABLE SKS58 :=        & MEMORY_MENU &
0,
SK52+SK62+0,
262,   & "DATA from"+sk_bracket_2 "CHANNEL 1" &
263;   & "DATA from" "CHANNEL 2" &

INTEGER TABLE SKS59 :=        & MATH_MENU &
0,
SK42+SK52+SK62+SK72+0,
264,   & "DATA"+sk_bracket_4 "+ MEMORY" &
265,   & "DATA" "- MEMORY" &
266,   & "DATA" mpy_char+" MEMORY" &
267;   & "DATA" "/ MEMORY" &

INTEGER TABLE SKS60 :=        & COPY_MENU &
BSK6+BSK7+BSK8+0,
SK12+SK21+SK31+SK41+SK51+SK62+SK72+SK81+0,
268,   & "PLOT"+sk_bracket_5 "ALL" &
269,   & "TRACE"   &
270,   & "GRATICULE"   &
271,   & "MARKER(S)"   &
272,   & "TEXT"   &
273,   & "SELECT" "QUADRANT" &
PLOT_SETUP_MENU,
274,   & "SELECT" "PEN COLOR" &
PEN_MENU,
275,   & "MORE"   &
PLOTPARM_MENU;

INTEGER TABLE SKS61 :=        & PLOTPARM_MENU &
BSK7+BSK8+0,
SK12+SK72+SK82+0,
276,   & "LIST TRACE" "VALUES" &
277,   & "SYSTEM"+sk_bracket_2 "PARAMETERS" &
COPY2_MENU,
278,   & "OPERATING" "PARAMETERS" &
COPY2_MENU;

INTEGER TABLE SKS62 :=        & PLOT_SETUP_MENU &
0,
```

```
SSKEY.WORK.PD8510              THU, DEC 22, 1983, 10:58 AM     PAGE  14

SK22+SK32+SK42+SK52+SK62+0,
279,   & "X -   LEFT"+sk_bracket_5 "- -  UPPER" &
280,   & "- -   LEFT" "X -  LOWER" &
281,   & "- X  RIGHT" "- -  UPPER" &
282,   & "- -  RIGHT" "- X  LOWER" &
283;   & "X X   FULL" "X X   PAGE" &

INTEGER TABLE SKS63 :=        & PEN_MENU &
0,
SK12+SK21+SK31+SK41+SK51+SK61+SK71+SK81+0,
284,   & "PEN"+sk_bracket_8 " 1 " &
285,   & " 2 "   &
286,   & " 3 "   &
287,   & " 4 "   &
288,   & " 5 "   &
289,   & " 6 "   &
290,   & " 7 "   &
291;   & " 8 "   &

INTEGER TABLE SKS64 :=        & COPY2_MENU &
0,
SK12+SK21+SK31+SK81+0,
  9,   & "RESTORE" "DISPLAY" &
292,   & sk_bracket_2 half_vt+"PRINT" &
293,   & "PLOT"   &
294;   & "NEXT PAGE"   &

INTEGER TABLE SKS65 :=        & MARKER_MENU &
BSK7+BSK8+0,
SK12+SK21+SK31+SK41+SK51+SK62+SK72+SK81+0,
295,   & "MARKER"+sk_bracket_6 "        1 " &
296,   & "        2 "   &
297,   & "        3 "   &
298,   & "        4 "   &
299,   & "        5 "   &
300,   & "ALL" "OFF" &
301,   & delta_char+" MODE" "MENU" &
DELTA_MARKER_MENU,
 26,   & "MORE"   &
MARKER2_MENU;

INTEGER TABLE SKS66 :=        & DELTA_MARKER_MENU &
0,
SK11+SK21+SK31+SK41+SK51+SK62+0,
302,   & sk_bracket_6 half_vt+delta_char+" REF = 1" &
303,   & delta_char+" REF = 2"   &
304,   & delta_char+" REF = 3"   &
305,   & delta_char+" REF = 4"   &
306,   & delta_char+" REF = 5"   &
307;   & delta_char+" MODE" "OFF" &
```

```
SSKEY.WORK.PD8510              THU, DEC 22, 1983, 10:58 AM     PAGE  15

INTEGER TABLE SKS67 :=        & MARKER2_MENU &
0,
SK72+SK81+0,
308,   & "MARKER to"+sk_bracket_2 "MINIMUM" &
309;   & "MAXIMUM"   &

INTEGER TABLE SKS68 :=        & SYSTEM_MENU &
BSK1+BSK2+BSK8+0,
SK11+SK22+SK32+SK82+0,
310,   & "TITLE"   &
TITLE_MENU,
311,   & "HP-IB" "ADDRESSES" &
HPIB_MENU,
312,   & "CRT" "OFF" &
313,   & "SERVICE" "FUNCTIONS" &
SERVICE_MENU;

INTEGER TABLE SKS69 :=        & TITLE_MENU &
0,
SK12+SK31+SK41+SK62+SK81+0,
314,   & "SELECT" "LETTER" &
315,   & "SPACE"   &
316,   & "BACKSPACE"   &
317,   & "ERASE" "TITLE" &
318;   & "DONE"   &

INTEGER TABLE SKS70 :=        & HPIB_MENU &
0,
SK12+SK21+SK31+SK41+SK51+SK61+SK71+SK81+0,
319,   & "8510 HP-IB"+sk_bracket_8 "ADDRESS" &
320,   & "SYSTEM BUS"   &
321,   & "SOURCE"   &
322,   & "TEST SET"   &
323,   & "PLOTTER"   &
324,   & "PRINTER"   &
325,   & "AUTO CMD"   &
326;   & "PASS THRU"   &

INTEGER TABLE SKS71 :=        & SERVICE_MENU &
BSK4+0,
SK12+SK22+SK31+SK41+SK51+SK61+SK71+SK81+0,
327,   & "SOFTWARE" "REVISION" &
328,   & "SYSTEM BUS"+sk_bracket_2 "'LOCAL'" &
329,   & "'REMOTE'"   &
330,   & "IF GAIN"   &
IF_GAIN_MENU,
331,   & sk_bracket_3 half_vt+"LOCATION" &
332,   & "PEEK"   &
333,   & "POKE"   &
334;   & "TEST MENU"   &
```

```
SSKEY.WORK.PD8510              THU, DEC 22, 1983, 10:58 AM     PAGE  16

COMMENT  Softkey menu table containing addresses of
         softkey menus indexed by menu number;

GLOBAL DOUBLE TABLE SK_MENU :=
  ADRS(SKS0),
  ADRS(SKS1),
  ADRS(SKS2),
  ADRS(SKS3),
  ADRS(SKS4),
  ADRS(SKS5),
  ADRS(SKS6),
  ADRS(SKS7),
  ADRS(SKS8),
  ADRS(SKS9),
  ADRS(SKS10),
  ADRS(SKS11),
  ADRS(SKS12),
  ADRS(SKS13),
  ADRS(SKS14),
  ADRS(SKS15),
  ADRS(SKS16),
  ADRS(SKS17),
  ADRS(SKS18),
  ADRS(SKS19),
  ADRS(SKS20),
  ADRS(SKS21),
  ADRS(SKS22),
  ADRS(SKS23),
  ADRS(SKS24),
  ADRS(SKS25),
  ADRS(SKS26),
  ADRS(SKS27),
  ADRS(SKS28),
  ADRS(SKS29),
  ADRS(SKS30),
  ADRS(SKS31),
  ADRS(SKS32),
  ADRS(SKS33),
  ADRS(SKS34),
  ADRS(SKS35),
  ADRS(SKS36),
  ADRS(SKS37),
  ADRS(SKS38),
  ADRS(SKS39),
  ADRS(SKS40),
  ADRS(SKS41),
  ADRS(SKS42),
  ADRS(SKS43),
  ADRS(SKS44),
  ADRS(SKS45),
  ADRS(SKS46),
  ADRS(SKS47),
  ADRS(SKS48),
  ADRS(SKS49),
  ADRS(SKS50),
  ADRS(SKS51),
```

```
SSKEY.WORK.PD8510              THU, DEC 22, 1983, 10:58 AM     PAGE  17

  ADRS(SKS52),
  ADRS(SKS53),
  ADRS(SKS54),
  ADRS(SKS55),
  ADRS(SKS56),
  ADRS(SKS57),
  ADRS(SKS58),
  ADRS(SKS59),
  ADRS(SKS60),
  ADRS(SKS61),
  ADRS(SKS62),
  ADRS(SKS63),
  ADRS(SKS64),
  ADRS(SKS65),
  ADRS(SKS66),
  ADRS(SKS67),
  ADRS(SKS68),
  ADRS(SKS69),
  ADRS(SKS70),
  ADRS(SKS71),
  0;

COMMENT  Softkey labels accessed by key label tables;

GLOBAL ALPHA TABLE SK_LABEL :=
  &  0 &  " ",
  &  1 &  "DIRECTORY",
  &  2 &  "STORE",
  &  3 &  "LOAD",
  &  4 &  "DELETE",
  &  5 &  "UN-DELETE",
  &  6 &  "INITIALIZE",
  &  7 &  "TAPE",
  &  8 &  "INIT TAPE?",
  &  9 &  "YES",
  & 10 &  "NO",
  & 11 &  "RESTORE",
  & 12 &  "DISPLAY",
  & 13 &  "NEXT",
  & 14 &  "PAGE",
  & 15 &  "PREVIOUS",
  & 16 &  "FIRST",
  & 17 &  "LAST",
  & 18 &  "RAW",
  & 19 &  "DATA",
  & 20 &  "FORMATTED",
  & 21 &  "USER",
  & 22 &  "MACHINE",
  & 23 &  "DUMP",
  & 24 &  "INSTRUMENT",
  & 25 &  "STATE",
  & 26 &  "STATES 1-5",
  & 27 &  "MEMORY",
  & 28 &  "TRACE",
  & 29 &  "TRACES 1-4",
```

```
& 30 &  "CAL SET",
& 31 &  "CAL SETS",
& 32 &  "1-8",
& 33 &  "CAL KIT",
& 34 &  "MORE",
& 35 &  "ABORT",
& 36 &  "DATA TYPE ",
& 37 &  "* FILE 1",
& 38 &  " ",
& 39 &  "* FILE 2",
& 40 &  "* FILE 3",
& 41 &  "* FILE 4",
& 42 &  "* FILE 5",
& 43 &  "* FILE 6",
& 44 &  "* FILE 7",
& 45 &  "* FILE 8",
& 46 &  "* 1 ",
& 47 &  "* 2 ",
& 48 &  "* 3 ",
& 49 &  "* 4 ",
& 50 &  "(POWER UP)",
& 51 &  "* 5 ",
& 52 &  "* 6 ",
& 53 &  "* 7 ",
& 54 &  "LAST STATE",
& 55 &  "ELECTRICAL"+sk_bracket_2,
& 56 &  "DELAY",
& 57 &  "AUTO DELAY",
& 58 &  "PHASE",
& 59 &  "OFFSET",
& 60 &  "MAGNITUDE",
& 61 &  "AVERAGING"+sk_bracket_2,
& 62 &  "ON/RESTART",
& 63 &  "OFF",
& 64 &  "SMOOTHING"+sk_bracket_2,
& 65 &  "ON ",
& 66 &  "TEST"+sk_bracket_2,
& 67 &  "AMP. GAIN",
& 68 &  "REFERENCE",
& 69 &  "GAIN"+sk_bracket_6,
& 70 &  "0 (MIN.)",
& 71 &  " 1 ",
& 72 &  " 2 ",
& 73 &  " 3 ",
& 74 &  "4 (MAX.)",
& 75 &  "AUTO",
& 76 &  "POWER",
& 77 &  "MENU",
& 78 &  "SWEEP",
& 79 &  "TIME",
& 80 &  "NUMBER of",
& 81 &  "POINTS",
& 82 &  "SINGLE"+sk_bracket_3,
& 83 &  "POINT",
& 84 &  "RAMP",
& 85 &  "STEP",
```

```
& 86 &  "POINTS:"+sk_bracket_4,
& 87 &  "51 ",
& 88 &  "101",
& 89 &  "201",
& 90 &  "401",
& 91 &  "SLOPE"+sk_bracket_2,
& 92 &  "ATTENUATOR"+sk_bracket_2,
& 93 &  "PORT 1",
& 94 &  "PORT 2",
& 95 &  sk_bracket_4,
& 96 &  half_vt+"HOLD",
& 97 &  "SINGLE",
& 98 &  "GROUPS",
& 99 &  "CONTINUAL",
& 100 &  "STIMULUS",
& 101 &  sk_bracket_2,
& 102 &  half_vt+"Ch1 = Ch2",
& 103 &  "Ch1 "+163+" Ch2",
& 104 &  "PRESS TO",
& 105 &  "CONTINUE",
& 106 &  "a"+177+sk_bracket_4,
& 107 &  "b"+178,
& 108 &  "a"+178,
& 109 &  "b"+177,
& 110 &  "REDEFINE",
& 111 &  "PARAMETER",
& 112 &  "REDEFINE"+sk_bracket_6,
& 113 &  "DRIVE",
& 114 &  "PHASE LOCK",
& 115 &  "NUMERATOR",
& 116 &  "DENOMI-",
& 117 &  "NATOR",
& 118 &  "CONVERSION",
& 119 &  "LABEL",
& 120 &  "DONE",
& 121 &  "DRIVE"+sk_bracket_3,
& 122 &  "NONE",
& 123 &  "LOCK to"+sk_bracket_3,
& 124 &  "a1 ",
& 125 &  "a2 ",
& 126 &  "NUMERATOR"+sk_bracket_5,
& 127 &  "b1 ",
& 128 &  "b2 ",
& 129 &  "SERVICE",
& 130 &  "SELECTIONS",
& 131 &  "100 kHz"+sk_bracket_8,
& 132 &  "TEST CAL",
& 133 &  "100 kHz",
& 134 &  "REF CAL",
& 135 &  "DETECTOR",
& 136 &  "GROUND",
& 137 &  "ADC GROUND",
& 138 &  "VCAL",
& 139 &  "VREF",
& 140 &  "TEMP. 1",
& 141 &  "TEMP. 2",
```

```
& 142 &  "DENOM."+sk_bracket_4,
& 143 &  "NO RATIO",
& 144 &  "CONVERT"+sk_bracket_4,
& 145 &  "to  S",
& 146 &  "to 1/S",
& 147 &  "to  Z",
& 148 &  "to  Y",
& 149 &  sk_bracket_8,
& 150 &  half_vt+"SWR",
& 151 &  "LINEAR",
& 152 &  "POLAR w/",
& 153 &  "LIN MKR",
& 154 &  "LOG MKR",
& 155 &  "Re/Im MKR",
& 156 &  "INVERTED",
& 157 &  "SMITH",
& 158 &  "IMAGINARY",
& 159 &  "REAL",
& 160 &  half_vt+"FREQUENCY",
& 161 &  "LOW PASS",
& 162 &  "BAND PASS",
& 163 &  "AUX. VOLT",
& 164 &  "OUTPUT",
& 165 &  "SPECIFY"+sk_bracket_2,
& 166 &  "GATE",
& 167 &  "SET FREQ.",
& 168 &  "(LOW PASS)",
& 169 &  "LOW PASS:"+sk_bracket_2,
& 170 &  "IMPULSE",
& 171 &  "WINDOW:"+sk_bracket_3,
& 172 &  "MAXIMUM",
& 173 &  "NORMAL",
& 174 &  "MINIMUM",
& 175 &  "GATE"+sk_bracket_2,
& 176 &  "ON",
& 177 &  "GATE"+sk_bracket_4,
& 178 &  "START",
& 179 &  "STOP",
& 180 &  "CENTER",
& 181 &  "SPAN",
& 182 &  "GATE SHAPE",
& 183 &  "GATE SHAPE"+sk_bracket_4,
& 184 &  "WIDE",
& 185 &  "CORRECTION"+sk_bracket_3,
& 186 &  "SELECT",
& 187 &  "CALIBRATE"+sk_bracket_3,
& 188 &  "( KIT #1 )",
& 189 &  "CALIBRATE",
& 190 &  "( KIT #2 )",
& 191 &  "RESUME CAL",
& 192 &  "SEQUENCE",
& 193 &  "PLANES",
& 194 &  "SET Z"+176,
& 195 &  "CAL SWEEP",
& 196 &  "VOLTAGE",
& 197 &  "MODIFY KIT"+sk_bracket_2,
```

```
& 198 &  "MODIFY KIT",
& 199 &  "DELETE A",
& 200 &  half_vt+"PLANE 1",
& 201 &  "PLANE 2",
& 202 &  "FREQUENCY"+sk_bracket_5,
& 203 &  "RESPONSE",
& 204 &  "S"+177+177+"  ",
& 205 &  "1-PORT",
& 206 &  "S"+178+178+"  ",
& 207 &  "ONE-PATH",
& 208 &  "2-PORT",
& 209 &  "FULL",
& 210 &  "S"+177+177+"  "+sk_bracket_3,
& 211 &  "PORT1 STD1",
& 212 &  "PORT1 STD2",
& 213 &  "PORT1 STD3",
& 214 &  "SAVE",
& 215 &  "S"+177+177+" CAL",
& 216 &  "S"+178+178+"  "+sk_bracket_3,
& 217 &  "PORT2 STD1",
& 218 &  "PORT2 STD2",
& 219 &  "PORT2 STD3",
& 220 &  "S"+178+178+" CAL",
& 221 &  sk_bracket_3,
& 222 &  half_vt+"REFLECT'N",
& 223 &  "TRANS-",
& 224 &  "MISSION",
& 225 &  "ISOLATION",
& 226 &  "2-PORT CAL",
& 227 &  "REFLECT'N",
& 228 &  "FWD.TRANS.",
& 229 &  "FWD_TRANS_",
& 230 &  "FWD.MATCH",
& 231 &  "FWD_MATCH_",
& 232 &  "REV.TRANS.",
& 233 &  "REV_TRANS_",
& 234 &  "REV.MATCH",
& 235 &  "REV_MATCH_",
& 236 &  "TRANS.",
& 237 &  "OMIT",
& 238 &  "FWD ISOL'N",
& 239 &  "FWD_ISOLN_",
& 240 &  "REV ISOL'N",
& 241 &  "REV_ISOLN_",
& 242 &  "S"+177+177+sk_bracket_3,
& 243 &  "STANDARD 1",
& 244 &  "STANDARD 2",
& 245 &  "STANDARD 3",
& 246 &  "STANDARD 4",
& 247 &  "STANDARD 5",
& 248 &  "STANDARD 6",
& 249 &  "STANDARD 7",
& 250 &  "STANDARDS ",
& 251 &  "SLIDE IS",
& 252 &  "SET",
& 253 &  "SLIDING",
```

```
& 254 &   "LOAD DONE",
& 255 &   "STANDARD",
& 256 &   "SPECIFY",
& 257 &   "STD CLASS",
& 258 &   "(DEFINED)",
& 259 &   "STD TYPE"+sk_bracket_5,
& 260 &   "OPEN",
& 261 &   "SHORT",
& 262 &   "DELAY/",
& 263 &   "THRU",
& 264 &   "ARBITRARY",
& 265 &   "IMPEDANCE",
& 266 &   " C"+176+" ",
& 267 &   " C"+177+" ",
& 268 &   " C"+178+" ",
& 269 &   "LABEL STD",
& 270 &   half_vt+"FIXED",
& 271 &   "LOSS",
& 272 &   " Z"+176+" ",
& 273 &   "LOWER",
& 274 &   "FREQUENCY",
& 275 &   "UPPER",
& 276 &   half_vt+"COAX",
& 277 &   "WAVEGUIDE",
& 278 &   "S"+177+177+":  ",
& 279 &   "1st STD",
& 280 &   "2nd STD",
& 281 &   "3rd STD",
& 282 &   "S"+178+178+":  ",
& 283 &   "(SPEC'D)",
& 284 &   "TRANS.:",
& 285 &   "FWD STD",
& 286 &   "REV STD",
& 287 &   "RESP. STD",
& 288 &   "SINGLE "+sk_bracket_2,
& 289 &   "CHANNEL",
& 290 &   "DUAL   ",
& 291 &   half_vt+"DATA",
& 292 &   "DATA "+38,
& 293 &   "MATH",
& 294 &   "(...)",
& 295 &   "DEFAULTS",
& 296 &   "DATA "+169,
& 297 &   "2 CHANNEL"+sk_bracket_2,
& 298 &   "OVERLAY",
& 299 &   "2 CHANNEL",
& 300 &   "SPLIT",
& 301 &   "MEMORY"+sk_bracket_5,
& 302 &   " 4 ",
& 303 &   "OPERATIONS",
& 304 &   "DATA from"+sk_bracket_2,
& 305 &   "CHANNEL 1",
& 306 &   "DATA from",
& 307 &   "CHANNEL 2",
& 308 &   "DATA"+sk_bracket_4,
& 309 &   "+ MEMORY",
```

```
& 310 &   "- MEMORY",
& 311 &   mpy_char+" MEMORY",
& 312 &   "/ MEMORY",
& 313 &   "PLOT"+sk_bracket_5,
& 314 &   "ALL",
& 315 &   "GRATICULE",
& 316 &   "MARKER(S)",
& 317 &   "TEXT",
& 318 &   "QUADRANT",
& 319 &   "PEN COLOR",
& 320 &   "LIST TRACE",
& 321 &   "VALUES",
& 322 &   "SYSTEM"+sk_bracket_2,
& 323 &   "PARAMETERS",
& 324 &   "OPERATING",
& 325 &   "X -   LEFT"+sk_bracket_5,
& 326 &   "- -  UPPER",
& 327 &   "- -   LEFT",
& 328 &   "X -  LOWER",
& 329 &   "- X  RIGHT",
& 330 &   "- -  RIGHT",
& 331 &   "- X  LOWER",
& 332 &   "X X   FULL",
& 333 &   "X X   PAGE",
& 334 &   "PEN"+sk_bracket_8,
& 335 &   " 5 ",
& 336 &   " 6 ",
& 337 &   " 7 ",
& 338 &   " 8 ",
& 339 &   half_vt+"PRINT",
& 340 &   "PLOT",
& 341 &   "NEXT PAGE",
& 342 &   "MARKER"+sk_bracket_6,
& 343 &   "         1 ",
& 344 &   "         2 ",
& 345 &   "         3 ",
& 346 &   "         4 ",
& 347 &   "         5 ",
& 348 &   delta_char+" MODE",
& 349 &   sk_bracket_6,
& 350 &   half_vt+delta_char+" REF = 1",
& 351 &   delta_char+" REF = 2",
& 352 &   delta_char+" REF = 3",
& 353 &   delta_char+" REF = 4",
& 354 &   delta_char+" REF = 5",
& 355 &   "MARKER to"+sk_bracket_2,
& 356 &   "TITLE",
& 357 &   "HP-IB",
& 358 &   "ADDRESSES",
& 359 &   "CRT",
& 360 &   "FUNCTIONS",
& 361 &   "LETTER",
& 362 &   "SPACE",
& 363 &   "BACKSPACE",
& 364 &   "ERASE",
& 365 &   "8510 HP-IB"+sk_bracket_8,
```

```
& 366 &   "ADDRESS",
& 367 &   "SYSTEM BUS",
& 368 &   "SOURCE",
& 369 &   "TEST SET",
& 370 &   "PLOTTER",
& 371 &   "PRINTER",
& 372 &   "AUTO CMD",
& 373 &   "PASS THRU",
& 374 &   "SOFTWARE",
& 375 &   "REVISION",
& 376 &   "SYSTEM BUS"+sk_bracket_2,
& 377 &   "'LOCAL'",
& 378 &   "'REMOTE'",
& 379 &   "IF GAIN",
& 380 &   half_vt+"LOCATION",
& 381 &   "PEEK",
& 382 &   "POKE",
& 383 &   "TEST MENU",
& 999 &   " ";

COMMENT  Softkey label indexes for each softkey;

GLOBAL INTEGER TABLE LBL_INDEX :=
    1,  0,   & "DIRECTORY"   &
    2,  0,   & "STORE"   &
    3,  0,   & "LOAD"   &
    4,  0,   & "DELETE"   &
    5,  0,   & "UN-DELETE"   &
    6,  7,   & "INITIALIZE" "TAPE"  &
    8,  9,   & "INIT TAPE?" "YES"  &
   10,  0,   & "NO"   &
   11, 12,   & "RESTORE" "DISPLAY"  &
   13, 14,   & "NEXT" "PAGE"  &
   15, 14,   & "PREVIOUS" "PAGE"  &
   16, 14,   & "FIRST" "PAGE"  &
   17, 14,   & "LAST" "PAGE"  &
   18, 19,   & "RAW" "DATA"  &
   19,  0,   & "DATA"   &
   20, 19,   & "FORMATTED" "DATA"  &
   21, 12,   & "USER" "DISPLAY"  &
   22, 23,   & "MACHINE" "DUMP"  &
   24, 25,   & "INSTRUMENT" "STATE"  &
   24, 26,   & "INSTRUMENT" "STATES 1-5"  &
   27, 28,   & "MEMORY" "TRACE"  &
   27, 29,   & "MEMORY" "TRACES 1-4"  &
   30,  0,   & "CAL SET"   &
   31, 32,   & "CAL SETS" "1-8"  &
   33,  0,   & "CAL KIT"   &
   34,  0,   & "MORE"   &
   35,  0,   & "ABORT"   &
   36, 37,   & "DATA TYPE " "* FILE 1"  &
   38, 39,   & " " "* FILE 2"  &
   38, 40,   & " " "* FILE 3"  &
   38, 41,   & " " "* FILE 4"  &
   38, 42,   & " " "* FILE 5"  &
```

```
   38, 43,   & " " "* FILE 6"  &
   38, 44,   & " " "* FILE 7"  &
   38, 45,   & " " "* FILE 8"  &
   36, 46,   & "DATA TYPE " "* 1 "  &
   38, 47,   & " " "* 2 "  &
   38, 48,   & " " "* 3 "  &
   38, 49,   & " " "* 4 "  &
   50, 51,   & "(POWER UP)" "* 5 "  &
   38, 52,   & " " "* 6 "  &
   38, 53,   & " " "* 7 "  &
   38, 54,   & " " "LAST STATE"  &
   55, 56,   & "ELECTRICAL"+sk_bracket_2 "DELAY"  &
   57,  0,   & "AUTO DELAY"   &
   58, 59,   & "PHASE" "OFFSET"  &
   60, 59,   & "MAGNITUDE" "OFFSET"  &
   61, 62,   & "AVERAGING"+sk_bracket_2 "ON/RESTART"  &
   63,  0,   & "OFF"   &
   64, 65,   & "SMOOTHING"+sk_bracket_2 "ON "  &
   63,  0,   & "OFF"   &
   66, 67,   & "TEST"+sk_bracket_2 "AMP. GAIN"  &
   68, 67,   & "REFERENCE" "AMP. GAIN"  &
   69, 70,   & "GAIN"+sk_bracket_6 "0 (MIN.)"  &
   71,  0,   & " 1 "   &
   72,  0,   & " 2 "   &
   73,  0,   & " 3 "   &
   74,  0,   & "4 (MAX.)"   &
   75,  0,   & "AUTO"   &
   76, 77,   & "POWER" "MENU"  &
   78, 79,   & "SWEEP" "TIME"  &
   80, 81,   & "NUMBER of" "POINTS"  &
   82, 83,   & "SINGLE"+sk_bracket_3 "POINT"  &
   84,  0,   & "RAMP"   &
   85,  0,   & "STEP"   &
   86, 87,   & "POINTS:"+sk_bracket_4 "51 "  &
   88,  0,   & "101"   &
   89,  0,   & "201"   &
   90,  0,   & "401"   &
   76,  0,   & "POWER"   &
   91, 65,   & "SLOPE"+sk_bracket_2 "ON "  &
   63,  0,   & "OFF"   &
   92, 93,   & "ATTENUATOR"+sk_bracket_2 "PORT 1"  &
   94,  0,   & "PORT 2"   &
   95, 96,   & sk_bracket_4 half_vt+"HOLD"  &
   97,  0,   & "SINGLE"   &
   80, 98,   & "NUMBER of" "GROUPS"  &
   99,  0,   & "CONTINUAL"   &
  100, 59,   & "STIMULUS" "OFFSET"  &
  101,102,   & sk_bracket_2 half_vt+"Ch1 = Ch2"  &
  103,  0,   & "Ch1 "+163+" Ch2"   &
  104,105,   & "PRESS TO" "CONTINUE"  &
  106,  0,   & "a"+177+sk_bracket_4   &
  107,  0,   & "b"+178   &
  108,  0,   & "a"+178   &
  109,  0,   & "b"+177   &
  110,111,   & "REDEFINE" "PARAMETER"  &
  112,113,   & "REDEFINE"+sk_bracket_6 "DRIVE"  &
```

```
SSKEY.WORK.PD8510                THU, DEC 22, 1983, 10:58 AM     PAGE  26

  114,  0,   & "PHASE LOCK"    &
  115,  0,   & "NUMERATOR"    &
  116,117,   & "DENOMI-" "NATOR"  &
  118,  0,   & "CONVERSION"    &
  111,119,   & "PARAMETER" "LABEL"  &
  110,120,   & "REDEFINE" "DONE"  &
  121, 93,   & "DRIVE"+sk_bracket_3 "PORT 1"  &
   94,  0,   & "PORT 2"    &
  122,  0,   & "NONE"    &
  123,124,   & "LOCK to"+sk_bracket_3 "a1 "  &
  125,  0,   & "a2 "    &
  122,  0,   & "NONE"    &
  126,127,   & "NUMERATOR"+sk_bracket_5 "b1 "  &
  128,  0,   & "b2 "    &
  124,  0,   & "a1 "    &
  125,  0,   & "a2 "    &
  129,130,   & "SERVICE" "SELECTIONS"  &
  131,132,   & "100 kHz"+sk_bracket_8 "TEST CAL"  &
  133,134,   & "100 kHz" "REF CAL"  &
  135,136,   & "DETECTOR" "GROUND"  &
  137,  0,   & "ADC GROUND"    &
  138,  0,   & "VCAL"    &
  139,  0,   & "VREF"    &
  140,  0,   & "TEMP. 1"    &
  141,  0,   & "TEMP. 2"    &
  142,124,   & "DENOM."+sk_bracket_4 "a1 "  &
  125,  0,   & "a2 "    &
  127,  0,   & "b1 "    &
  143,  0,   & "NO RATIO"    &
  144,145,   & "CONVERT"+sk_bracket_4 "to   S"  &
  146,  0,   & "to 1/S"    &
  147,  0,   & "to   Z"    &
  148,  0,   & "to   Y"    &
  149,150,   & sk_bracket_8 half_vt+"SWR"  &
  151, 60,   & "LINEAR" "MAGNITUDE"  &
  152,153,   & "POLAR w/" "LIN MKR"  &
  152,154,   & "POLAR w/" "LOG MKR"  &
  152,155,   & "POLAR w/" "Re/Im MKR"  &
  156,157,   & "INVERTED" "SMITH"  &
  158,  0,   & "IMAGINARY"    &
  159,  0,   & "REAL"    &
   95,160,   & sk_bracket_4 half_vt+"FREQUENCY"  &
   79,161,   & "TIME" "LOW PASS"  &
   79,162,   & "TIME" "BAND PASS"  &
  163,164,   & "AUX. VOLT" "OUTPUT"  &
  165, 79,   & "SPECIFY"+sk_bracket_2 "TIME"  &
  166,  0,   & "GATE"    &
  167,168,   & "SET FREQ." "(LOW PASS)"  &
  169, 85,   & "LOW PASS:"+sk_bracket_2 "STEP"  &
  170,  0,   & "IMPULSE"    &
  171,172,   & "WINDOW:"+sk_bracket_3 "MAXIMUM"  &
  173,  0,   & "NORMAL"    &
  174,  0,   & "MINIMUM"    &
  175,176,   & "GATE"+sk_bracket_2 "ON"  &
   63,  0,   & "OFF"    &
  177,178,   & "GATE"+sk_bracket_4 "START"  &
```

```
SSKEY.WORK.PD8510                THU, DEC 22, 1983, 10:59 AM     PAGE  27

  179,  0,   & "STOP"    &
  180,  0,   & "CENTER"    &
  181,  0,   & "SPAN"    &
  182,  0,   & "GATE SHAPE"    &
  183,172,   & "GATE SHAPE"+sk_bracket_4 "MAXIMUM"  &
  184,  0,   & "WIDE"    &
  173,  0,   & "NORMAL"    &
  174,  0,   & "MINIMUM"    &
  185,176,   & "CORRECTION"+sk_bracket_3 "ON"  &
   63,  0,   & "OFF"    &
  186, 30,   & "SELECT" "CAL SET"  &
  187,188,   & "CALIBRATE"+sk_bracket_3 "( KIT #1 )"  &
  189,190,   & "CALIBRATE" "( KIT #2 )"  &
  191,192,   & "RESUME CAL" "SEQUENCE"  &
   68,193,   & "REFERENCE" "PLANES"  &
  194,  0,   & "SET Z"+176    &
  195,196,   & "CAL SWEEP" "VOLTAGE"  &
  197,188,   & "MODIFY KIT"+sk_bracket_2 "( KIT #1 )"  &
  198,190,   & "MODIFY KIT" "( KIT #2 )"  &
  199, 30,   & "DELETE A" "CAL SET"  &
  101,200,   & sk_bracket_2 half_vt+"PLANE 1"  &
  201,  0,   & "PLANE 2"    &
  167,168,   & "SET FREQ." "(LOW PASS)"  &
  202,203,   & "FREQUENCY"+sk_bracket_5 "RESPONSE"  &
  204,205,   & "S"+177+177+"  " "1-PORT"  &
  206,205,   & "S"+178+178+"  " "1-PORT"  &
  207,208,   & "ONE-PATH" "2-PORT"  &
  209,208,   & "FULL" "2-PORT"  &
  210,211,   & "S"+177+177+"  "+sk_bracket_3 "PORT1 STD1"  &
  212,  0,   & "PORT1 STD2"    &
  213,  0,   & "PORT1 STD3"    &
  214,215,   & "SAVE" "S"+177+177+" CAL"  &
  216,217,   & "S"+178+178+"  "+sk_bracket_3 "PORT2 STD1"  &
  218,  0,   & "PORT2 STD2"    &
  219,  0,   & "PORT2 STD3"    &
  214,220,   & "SAVE" "S"+178+178+" CAL"  &
  221,222,   & sk_bracket_3 half_vt+"REFLECT'N"  &
  223,224,   & "TRANS-" "MISSION"  &
  225,  0,   & "ISOLATION"    &
  214,226,   & "SAVE" "2-PORT CAL"  &
  227,120,   & "REFLECT'N" "DONE"  &
  228,229,   & "FWD.TRANS." "FWD_TRANS_"  &
  230,231,   & "FWD.MATCH" "FWD_MATCH_"  &
  232,233,   & "REV.TRANS." "REV_TRANS_"  &
  234,235,   & "REV.MATCH" "REV_MATCH_"  &
  236,120,   & "TRANS." "DONE"  &
  237,225,   & "OMIT" "ISOLATION"  &
  238,239,   & "FWD ISOL'N" "FWD_ISOLN_"  &
  240,241,   & "REV ISOL'N" "REV_ISOLN_"  &
  225,120,   & "ISOLATION" "DONE"  &
  221,222,   & sk_bracket_3 half_vt+"REFLECT'N"  &
  223,224,   & "TRANS-" "MISSION"  &
  225,  0,   & "ISOLATION"    &
  227,120,   & "REFLECT'N" "DONE"  &
  243,  0,   & "STANDARD 1"    &
  244,  0,   & "STANDARD 2"    &
```

```
SSKEY.WORK.PD8510                THU, DEC 22, 1983, 10:59 AM     PAGE  28

  245,  0,   & "STANDARD 3"    &
  246,  0,   & "STANDARD 4"    &
  247,  0,   & "STANDARD 5"    &
        0,   & "STANDARD 6"    &
        0,   & "STANDARD 7"    &
     120,    & "STANDARDS " "DONE"  &
     252,    & "SLIDE IS" "SET"  &
     254,    & "SLIDING" "LOAD DONE"  &
   36,255,   & "SELECT" "STANDARD"  &
  256,257,   & "SPECIFY" "STD CLASS"  &
  119,257,   & "LABEL" "STD CLASS"  &
  119, 33,   & "LABEL" "CAL KIT"  &
  120,258,   & "DONE" "(DEFINED)"  &
  259,260,   & "STD TYPE"+sk_bracket_5 "OPEN"  &
  261,  0,   & "SHORT"    &
    3,  0,   & "LOAD"    &
  262,263,   & "DELAY/" "THRU"  &
  264,265,   & "ARBITRARY" "IMPEDANCE"  &
  266,  0,   & " C"+176+" "    &
  267,  0,   & " C"+177+" "    &
  268,  0,   & " C"+178+" "    &
  256, 59,   & "SPECIFY" "OFFSET"  &
  269,  0,   & "LABEL STD"    &
  120,258,   & "DONE" "(DEFINED)"  &
  101,270,   & sk_bracket_2 half_vt+"FIXED"  &
  253,  0,   & "SLIDING"    &
   59, 56,   & "OFFSET" "DELAY"  &
   59,271,   & "OFFSET" "LOSS"  &
   59,272,   & "OFFSET" " Z"+176+" "  &
  273,274,   & "LOWER" "FREQUENCY"  &
  275,274,   & "UPPER" "FREQUENCY"  &
  101,276,   & sk_bracket_2 half_vt+"COAX"  &
  277,  0,   & "WAVEGUIDE"    &
  120,258,   & "DONE" "(DEFINED)"  &
  278,279,   & "S"+177+177+":  " "1st STD"  &
  280,  0,   & "2nd STD"    &
  281,  0,   & "3rd STD"    &
  282,279,   & "S"+178+178+":  " "1st STD"  &
  280,  0,   & "2nd STD"    &
  281,  0,   & "3rd STD"    &
   34,  0,   & "MORE"    &
  120,283,   & "DONE" "(SPEC'D)"  &
  284,285,   & "TRANS.:" "FWD STD"  &
  286,  0,   & "REV STD"    &
  274,287,   & "FREQUENCY" "RESP. STD"  &
  288,289,   & "SINGLE "+sk_bracket_2 "CHANNEL"  &
  290,289,   & "DUAL   " "CHANNEL"  &
   95,291,   & sk_bracket_4 half_vt+"DATA"  &
   27,  0,   & "MEMORY"    &
  292, 27,   & "DATA "+38 "MEMORY"  &
  293,294,   & "MATH" "(...)"  &
  186,295,   & "SELECT" "DEFAULTS"  &
  296, 27,   & "DATA "+169 "MEMORY"  &
  297,298,   & "2 CHANNEL"+sk_bracket_2 "OVERLAY"  &
  299,300,   & "2 CHANNEL" "SPLIT"  &
  301, 71,   & "MEMORY"+sk_bracket_5 " 1 "  &
```

```
SSKEY.WORK.PD8510                THU, DEC 22, 1983, 10:59 AM     PAGE  29

   72,  0,   & " 2 "    &
   73,  0,   & " 3 "    &
  302,  0,   & " 4 "    &
   34,  0,   & "MORE"    &
  293,303,   & "MATH" "OPERATIONS"  &
  304,305,   & "DATA from"+sk_bracket_2 "CHANNEL 1"  &
  306,307,   & "DATA from" "CHANNEL 2"  &
  308,309,   & "DATA"+sk_bracket_4 "+ MEMORY"  &
   19,310,   & "DATA" "- MEMORY"  &
   19,311,   & "DATA" mpy_char+" MEMORY"  &
   19,312,   & "DATA" "/ MEMORY"  &
  313,314,   & "PLOT"+sk_bracket_5 "ALL"  &
   28,  0,   & "TRACE"    &
  315,  0,   & "GRATICULE"    &
  316,  0,   & "MARKER(S)"    &
  317,  0,   & "TEXT"    &
  186,318,   & "SELECT" "QUADRANT"  &
  186,319,   & "SELECT" "PEN COLOR"  &
   34,  0,   & "MORE"    &
  320,321,   & "LIST TRACE" "VALUES"  &
  322,323,   & "SYSTEM"+sk_bracket_2 "PARAMETERS"  &
  324,323,   & "OPERATING" "PARAMETERS"  &
  325,326,   & "X -   LEFT"+sk_bracket_5 "- -  UPPER"  &
  327,328,   & "- -   LEFT" "X -  LOWER"  &
  329,326,   & "- X  RIGHT" "- -  UPPER"  &
  330,331,   & "- -  RIGHT" "- X  LOWER"  &
  332,333,   & "X X   FULL" "X X   PAGE"  &
  334, 71,   & "PEN"+sk_bracket_8 " 1 "  &
   72,  0,   & " 2 "    &
   73,  0,   & " 3 "    &
  302,  0,   & " 4 "    &
  335,  0,   & " 5 "    &
  336,  0,   & " 6 "    &
  337,  0,   & " 7 "    &
  338,  0,   & " 8 "    &
  101,339,   & sk_bracket_2 half_vt+"PRINT"  &
  340,  0,   & "PLOT"    &
  341,  0,   & "NEXT PAGE"    &
  342,343,   & "MARKER"+sk_bracket_6 "        1 "  &
  344,  0,   & "        2 "    &
  345,  0,   & "        3 "    &
  346,  0,   & "        4 "    &
  347,  0,   & "        5 "    &
  314, 63,   & "ALL" "OFF"  &
  348, 77,   & delta_char+" MODE" "MENU"  &
  349,350,   & sk_bracket_6 half_vt+delta_char+" REF = 1"  &
  351,  0,   & delta_char+" REF = 2"    &
  352,  0,   & delta_char+" REF = 3"    &
  353,  0,   & delta_char+" REF = 4"    &
  354,  0,   & delta_char+" REF = 5"    &
  348, 63,   & delta_char+" MODE" "OFF"  &
  355,174,   & "MARKER to"+sk_bracket_2 "MINIMUM"  &
  172,  0,   & "MAXIMUM"    &
  356,  0,   & "TITLE"    &
  357,358,   & "HP-IB" "ADDRESSES"  &
  359, 63,   & "CRT" "OFF"  &
```

SSKEY.WORK.PD8510 THU, DEC 22, 1983, 10:59 AM PAGE 30

```
  129,360,   & "SERVICE" "FUNCTIONS"  &
  186,361,   & "SELECT" "LETTER"  &
  362,  0,   & "SPACE"    &
  363,  0,   & "BACKSPACE"    &
  364,356,   & "ERASE" "TITLE"  &
  120,  0,   & "DONE"    &
  365,366,   & "8510 HP-IB"+sk_bracket_3 "ADDRESS"  &
  367,  0,   & "SYSTEM BUS"    &
  368,  0,   & "SOURCE"    &
  369,  0,   & "TEST SET"    &
  370,  0,   & "PLOTTER"    &
  371,  0,   & "PRINTER"    &
  372,  0,   & "AUTO CMD"    &
  373,  0,   & "PASS THRU"    &
  374,375,   & "SOFTWARE" "REVISION"  &
  376,377,   & "SYSTEM BUS"+sk_bracket_2 "'LOCAL'"  &
  378,  0,   & "'REMOTE'"    &
  379,  0,   & "IF GAIN"    &
  221,380,   & sk_bracket_3 half_vt+"LOCATION"  &
  381,  0,   & "PEEK"    &
  382,  0,   & "POKE"    &
  383,  0,   & "TEST MENU"    &
    0;

END$
```

SSKPOS.WORK.PD8510 THU, DEC 22, 1983, 10:59 AM PAGE 1

```
M68KL,P,"skpos" BEGIN

#FILE cscreen.work;

GLOBAL
INTEGER TABLE field :=                    & softkey maximum field width  &
  sk11_display,sk21_display,sk31_display,sk41_display,sk51_display,
  sk61_display,sk71_display,sk81_display,
  sk12_display,sk22_display,sk32_display,sk42_display,sk52_display,
  sk62_display,sk72_display,sk82_display;

GLOBAL
INTEGER TABLE blanks :=                   & 64*n blanks added to sk_x    &
  sk_x+640, sk_x+576, sk_x+512, sk_x+448, sk_x+384,
  sk_x+320, sk_x+256, sk_x+192, sk_x+128, sk_x+64, sk_x;

GLOBAL
INTEGER TABLE sk_line1 :=                 & y pos for 1st line of softkey&
  sk11_y, sk21_y, sk31_y, sk41_y, sk51_y, sk61_y, sk71_y, sk81_y;

GLOBAL
INTEGER TABLE sk_line2 :=                 & y pos for 2nd line of softkey&
  sk12_y, sk22_y, sk32_y, sk42_y, sk52_y, sk62_y, sk72_y, sk82_y;

END$
```

FSKPOS.WORK.PD8510 THU, DEC 22, 1983, 10:59 AM PAGE 1

```
EXTERNAL
INTEGER TABLE field.L;                    & softkey maximum field width  &
EXTERNAL
INTEGER TABLE blanks.L;                   & 64*n blanks added to sk_x    &
EXTERNAL
INTEGER TABLE sk_line1.L;                 & y pos for 1st line of softkey&
EXTERNAL
INTEGER TABLE sk_line2.L;                 & y pos for 2nd line of softkey&
```

ASQRT.WORK.PD8510 THU, DEC 22, 1983, 10:59 AM PAGE 1

```
ASMB,L
      HED M68K SQUARE ROOT ROUTINE
      NAM SQRT,7,"FIX 27.8.80"
      ENT SQRT
R0    REG 0
R1    REG 1
R2    REG 2
R3    REG 3
S     REG 15
*
*   SQRT(REAL)     420 uS EXECUTION TIME
*
SQRT  TST.L R0
      BGE  SQ05      ERROR IF ARG<=0
      JSRX NEG2
SQ05  MOVEM.L R1-R3,-(S)  SAVE REGISTERS
      MOVE.B R0,R2 GET EXPONENT
      CLR.B R0     ZERO EXPON FIELD IN A
      BTST  #0,R2  EXPON EVEN
      BEQ  SQ10    JUMP IF YES
      ASR.L #1,R0  EXPON ODD, SHIFT MANTISSA
      ADDQ.B #1,R2 AND INCREMENT EXPONENT
SQ10  ASR.B #1,R2  DIVIDE EXPONENT BY 2
      MOVE R2,-(S) SAVE NEW EXPONENT ON STACK
      CLR.L R1     INITIALIZE ROOT TO ZERO
      EXG  R0,R1
      MOVEQ =D22,R3  INITIALIZE LOOP COUNTER FOR 15 BITS
      CLR.L R2     CLEAR M
      LSL.L #1,R1  SHIFT A LEFT 1 TO DELETE SIGN
SQ25  LSR.L #1,R0  DELETE TEST BIT FROM ROOT
      LSL.L #1,R1  SHIFT A LEFT 1 BIT
      ROXL.L #1,R2 APPEND BIT TO M
      LSL.L #1,R1  GET SECOND BIT FOR M
      ROXL.L #1,R2 APPEND TO M
      ASL.L #2,R0  MPY R BY 4
      ADDQ.L #1,R0   AND ADD 1
      CMP.L R2,R0   COMPARE RESULTS
      BGT  SQ35
      SUB.L R0,R2    COMPUTE NEW M
      ADDQ.L #2,R0 SET ROOT BIT TO 1
SQ35  SUBQ #1,R3     GO DO NEXT BIT  (15.75 uS/LOOP)
      BGE  SQ25
      LSL.L #7,R0  DELETE EXTRANEOUS BIT
      CLR.B R0     CLEAR EXPONENT AREA
      MOVE (S)+,R2 GET EXPONENT
      TST.L  R0    RESULT=0?
      BEQ    SQ46  YES.
SQ40  BTST #30,R0  NORMALIZE RESULT
      BNE  SQ45    BIT <>0
      LSL.L #1,R0
      SUBQ.B #1,R2 DECREMENT EXPONENT
      BRA  SQ40
SQ45  MOVE.B R2,R0
SQ46  MOVEM.L (S)+,R1-R3  RESTORE REGISTERS
      RTS
```

RSORT.WORK.PD8510 THU, DEC 22, 1983, 10:59 AM PAGE 2

```
END
```

SSTACK.WORK.PD8510 THU, DEC 22, 1983, 10:59 AM PAGE 1

```
M68KL,P,"stack"
BEGIN

COMMENT  This is a dummy to allow reassignment of RAM pointer for stack;
GLOBAL LABEL mark_stack;

mark_stack:

END$
```

USTACK.WORK.PD8510 THU, DEC 22, 1983, 10:59 AM PAGE 1

```
1,$s/^.//
g/MESSAGE/s/^.*MESSAGE⌈/
g/SPMAX/s/^⌈/
v/⌈/d
1
/====/,$d
1,$s/SPMAX//g
1,$s/^[ ^]*//
g/^F=/.-1,.j
g/Q=/s/^\(.*\)\(S=.*\)\(D=.*\)\(F=.*\)/\1\3\2\47
0a
MAX STACK SIZES
 68KL
  50 N=400 D=800  S=18000 B=15  C=15  F=24  P=64  R=64  Q=16
   68K
    N=25  D=3000 S=32000

    13,20,28,34,40,46,52,58
    /\t/g
```

FSTDDATA.WORK.PD8510 THU, DEC 22, 1983, 10:59 AM PAGE 1

```
EXTERNAL INTEGER kit_base.L;
EXTERNAL INTEGER kit_base2.L;
```

```
SSTDDATA.WORK.PD8510            THU, DEC 22, 1983, 10:59 AM      PAGE   1

M68KL,P,"stddata"
BEGIN

#FILE cstds.work;                                          & type2 values   &
#FILE ccal.work;                                           & for std_type's &

COMMENT                                                    cal_kit_descriptor
*****************************************************************************
*
*****************************************************************************
FIRST STD KIT
;
& calibration kit label &
BYTE    TABLE a00 := 10,07,'(,' ,'7,'m,'m,' ,'),' ,' ,' ;  & kit label &
& class lists of calibration standards &
BYTE    TABLE b00 :=  1, 2, 0, 0, 0, 0, 0, 0,           & port1_1st_std &
                      1, 1, 0, 0, 0, 0, 0, 0,           & port1_2nd_std &
                      3, 9,10,12, 0, 0, 0, 0,           & port1_3rd_std &
                      1, 9, 0, 0, 0, 0, 0, 0,           & isoln_fwd_std &
                      1,11, 0, 0, 0, 0, 0, 0,           & match_fwd_std &
                      1,11, 0, 0, 0, 0, 0, 0,           & trans_fwd_std &
                      1, 2, 0, 0, 0, 0, 0, 0,           & port2_1st_std &
                      1, 1, 0, 0, 0, 0, 0, 0,           & port2_2nd_std &
                      3, 9,10,12, 0, 0, 0, 0,           & port2_3rd_std &
                      1, 9, 0, 0, 0, 0, 0, 0,           & isoln_rev_std &
                      1,11, 0, 0, 0, 0, 0, 0,           & match_rev_std &
                      1,11, 0, 0, 0, 0, 0, 0,           & trans_rev_std &
                      3, 1, 2,11, 0, 0, 0, 0;           & freq_resp_std &
& class labels &
BYTE    TABLE c00 := 10,05,'O,'P,'E,'N,' ,' ,' ,' ,' ,' , & port1_1st_ &
                     10,05,'S,'H,'O,'R,'T,' ,' ,' ,' ,' , & port1_2nd_ &
                     10,05,'L,'O,'A,'D,'S,' ,' ,' ,' ,' , & port1_3rd_ &
                     10,10,'I,'S,'O,'L,'',',N,' ,'S,'T,'D, & isoln_fwd_ &
                     10,04,'T,'H,'R,'U,' ,' ,' ,' ,' ,' , & match_fwd_ &
                     10,04,'T,'H,'R,'U,' ,' ,' ,' ,' ,' , & trans_fwd_ &
                     10,05,'O,'P,'E,'N,' ,' ,' ,' ,' ,' , & port2_1st_ &
                     10,05,'S,'H,'O,'R,'T,' ,' ,' ,' ,' , & port2_2nd_ &
                     10,05,'L,'O,'A,'D,'S,' ,' ,' ,' ,' , & port2_3rd_ &
                     10,10,'I,'S,'O,'L,'',',N,' ,'S,'T,'D, & isoln_rev_ &
                     10,04,'T,'H,'R,'U,' ,' ,' ,' ,' ,' , & match_rev_ &
                     10,04,'T,'H,'R,'U,' ,' ,' ,' ,' ,' , & trans_rev_ &
                     10,08,'R,'E,'S,'P,'O,'N,'S,'E,' ,' ; & freq_resp_ &

& std #  1 &
REAL    TABLE a01 := 0, 999e9,                              & fmin, fmax &
                     50.0, 0.0, 0.0,                   & Zo, delay, loss &
                     0.0, 0.0, 0.0, 0.0;         & c0, c1, c2, Zterminal &
BYTE    TABLE c01 := 10,06,' ,'S,'H,'O,'R,'T,' ,' ,' ,' ;       & label &
BYTE    TABLE d01 := std_short, 0;                    & std_type, type2&
& std #  2 &
REAL    TABLE a02 := 0, 999e9,                              & fmin, fmax &
                     50.0, 0.0, 0.0,                   & Zo, delay, loss &
                     90.5,0.0,78.5, 0.0;           &c0, c1, c2, Zterminal&
BYTE    TABLE c02 := 10,06,' ,'O,'P,'E,'N,' ,' ,' ,' ,' ;       & label &
BYTE    TABLE d02 := std_open , 0;                    & std_type, type2&
```

```
SSTDDATA.WORK.PD8510            THU, DEC 22, 1983, 10:59 AM      PAGE   2

& std #  3 &
REAL    TABLE a03 := .749e9, 2.001e9,                       & fmin, fmax &
                     50.0,&4.998cm&166.7684e-12, 5e8,  &Zo, delay, loss&
                     0.0, 0.0, 0.0, 0.0;         & c0, c1, c2, Zterminal &
BYTE    TABLE c03 := 10,08,' ,'S,'H,'O,'R,'T,'#,'3,' ,' ;        & label &
BYTE    TABLE d03 := std_short, 0;                    & std_type, type2&
& std #  4 &
REAL    TABLE a04 := 1.999e9, 4.001e9,                      & fmin, fmax &
                     50.0,&2.495cm& 83.2522e-12, 5e8,  &Zo, delay, loss&
                     0.0, 0.0, 0.0, 0.0;         & c0, c1, c2, Zterminal &
BYTE    TABLE c04 := 10,08,' ,'S,'H,'O,'R,'T,'#,'4,' ,' ;        & label &
BYTE    TABLE d04 := std_short, 0;                    & std_type, type2&
& std #  5 &
REAL    TABLE a05 := 3.999e9, 8.001e9,                      & fmin, fmax &
                     50.0,&1.2459cm& 41.5720e-12,5e8,  &Zo, delay, loss&
                     0.0, 0.0, 0.0, 0.0;         & c0, c1, c2, Zterminal &
BYTE    TABLE c05 := 10,08,' ,'S,'H,'O,'R,'T,'#,'5,' ,' ;        & label &
BYTE    TABLE d05 := std_short, 0;                    & std_type, type2&
& std #  6 &
REAL    TABLE a06 := 7.999e9, 12.001e9,                     & fmin, fmax &
                     50.0,&.73152cm& 24.4087e-12,5e8,  &Zo, delay, loss&
                     0.0, 0.0, 0.0, 0.0;         & c0, c1, c2, Zterminal &
BYTE    TABLE c06 := 10,08,' ,'S,'H,'O,'R,'T,'#,'6,' ,' ;        & label &
BYTE    TABLE d06 := std_short, 0;                    & std_type, type2&
& std #  7 &
REAL    TABLE a07 := 11.999e9, 18.601e9,                    & fmin, fmax &
                     50.0,&.52248cm& 17.4336e-12,5e8,  &Zo, delay, loss&
                     0.0, 0.0, 0.0, 0.0;         & c0, c1, c2, Zterminal &
BYTE    TABLE c07 := 10,08,' ,'S,'H,'O,'R,'T,'#,'7,' ,' ;        & label &
BYTE    TABLE d07 := std_short, 0;                    & std_type, type2&
& std #  8 &
REAL    TABLE a08 := 16.999e9,32.501e9,                     & fmin, fmax &
                     50.0, 0.0, 0.0,                  & Zo, delay, loss &
                     0.0, 0.0, 0.0, 0.0;         & c0, c1, c2, Zterminal &
BYTE    TABLE c08 := 10,08,' ,'S,'H,'O,'R,'T,'#,'8,' ,' ;        & label &
BYTE    TABLE d08 := std_short, 0;                    & std_type, type2&
& std #  9 &
REAL    TABLE a09 := 0, 999e9,                              & fmin, fmax &
                     50.0, 0.0, 0.0,                  & Zo, delay, loss &
                     0.0, 0.0, 0.0, 0.0;         & c0, c1, c2, Zterminal &
BYTE    TABLE c09 := 10,09,'B,'R,'O,'A,'D,'B,'A,'N,'D,' ;        & label &
BYTE    TABLE d09 := std_load,  0;                    & std_type, type2&
& std # 10 &
REAL    TABLE a10 := 1.999e9,999.000e9,                     & fmin, fmax &
                     50.0, 0.0, 0.0,                  & Zo, delay, loss &
                     0.0, 0.0, 0.0, 0.0;         & c0, c1, c2, Zterminal &
BYTE    TABLE c10 := 10,07,'S,'L,'I,'D,'I,'N,'G,' ,' ;           & label &
BYTE    TABLE d10 := std_load,  sliding;              & std_type, type2&
& std # 11 &
REAL    TABLE a11 := 0, 999e9,                              & fmin, fmax &
                     50.0, 0.0, 0.0,                  & Zo, delay, loss &
                     0.0, 0.0, 0.0, 0.0;         & c0, c1, c2, Zterminal &
BYTE    TABLE c11 := 10,06,' ,'T,'H,'R,'U,' ,' ,' ,' ;          & label &
BYTE    TABLE d11 := std_thru,  0;                    & std_type, type2&
& std # 12 &
REAL    TABLE a12 := 0,2.001e9,                             & fmin, fmax &
```

```
SSTDDATA.WORK.PD8510            THU, DEC 22, 1983, 10:59 AM      PAGE   3

                     50.0, 0.0, 0.0,                  & Zo, delay, loss &
                     0.0, 0.0, 0.0, 0.0;         & c0, c1, c2, Zterminal &
BYTE    TABLE c12 := 10,07,'L,'O,'W,'B,'A,'N,'D,' ,' ,' ;        & label &
BYTE    TABLE d12 := std_load,  0;                    & std_type, type2&
& std # 13 &
REAL    TABLE a13 := 0, 999e9,                              & fmin, fmax &
                     50.0, 0.0, 0.0,                  & Zo, delay, loss &
                     0.0, 0.0, 0.0, 0.0;         & c0, c1, c2, Zterminal &
BYTE    TABLE c13 := 10,09,'(,'L,'O,'A,'D,' ,'#,'5,'),' ;        & label &
BYTE    TABLE d13 := std_load,  0;                    & std_type, type2&
& std # 14 &
REAL    TABLE a14 := 0, 999e9,                              & fmin, fmax &
                     50.0, 0.0, 0.0,                  & Zo, delay, loss &
                     0.0, 0.0, 0.0, 0.0;         & c0, c1, c2, Zterminal &
        TABLE c14 := 10,09,'(,'L,'O,'A,'D,' ,'#,'6,'),' ;        & label &
        TABLE d14 := std_load,  0;                    & std_type, type2&
      : 15 &
        TABLE a15 := 0, 999e9,                              & fmin, fmax &
                     50.0, 0.0, 0.0,                  & Zo, delay, loss &
                     90.5,0.0,78.5, 0.0;          &c0, c1, c2, Zterminal&
        TABLE c15 := 10,09,'(,'O,'P,'E,'N,' ,'#,'1,'),' ;        & label &
BYTE    TABLE d15 := std_open,  0;                    & std_type, type2&
& std # 16 &
REAL    TABLE a16 := 0, 999e9,                              & fmin, fmax &
                     50.0, 0.0, 0.0,                  & Zo, delay, loss &
                     79.4,0.0,40.0, 0.0;          &c0, c1, c2, Zterminal&
BYTE    TABLE c16 := 10,08,'o,'l,'d,' ,'O,'P,'E,'N,' ,' ;        & label &
BYTE    TABLE d16 := std_open,  0;                    & std_type, type2&
& std # 17 &
REAL    TABLE a17 := 0, 999e9,                              & fmin, fmax &
                     50.0, 0.0, 0.0,                  & Zo, delay, loss &
                     0.0, 0.0, 0.0, 0.0;         & c0, c1, c2, Zterminal &
BYTE    TABLE c17 := 10,09,'(,'O,'P,'E,'N,' ,'#,'3,'),' ;        & label &
BYTE    TABLE d17 := std_open,  0;                    & std_type, type2&
& std # 18 &
REAL    TABLE a18 := 0, 999e9,                              & fmin, fmax &
                     50.0, 0.0, 0.0,                  & Zo, delay, loss &
                     0.0, 0.0, 0.0, 0.0;         & c0, c1, c2, Zterminal &
BYTE    TABLE c18 := 10,09,'(,'O,'P,'E,'N,' ,'#,'4,'),' ;        & label &
BYTE    TABLE d18 := std_open,  0;                    & std_type, type2&
& std # 19 &
REAL    TABLE a19 := 0, 999e9,                              & fmin, fmax &
                     50.0, 0.0, 0.0,                  & Zo, delay, loss &
                     0.0, 0.0, 0.0, 0.0;         & c0, c1, c2, Zterminal &
BYTE    TABLE c19 := 10,09,'(,'T,'H,'R,'U,' ,'#,'1,'),' ;        & label &
BYTE    TABLE d19 := std_thru,  0;                    & std_type, type2&
& std # 20 &
REAL    TABLE a20 := 0, 999e9,                              & fmin, fmax &
                     50.0, 0.0, 0.0,                  & Zo, delay, loss &
                     0.0, 0.0, 0.0, 0.0;         & c0, c1, c2, Zterminal &
BYTE    TABLE c20 := 10,09,'(,'T,'H,'R,'U,' ,'#,'2,'),' ;        & label &
BYTE    TABLE d20 := std_thru,  0;                    & std_type, type2&
& std # 21 &
REAL    TABLE a21 := 0, 999e9,                              & fmin, fmax &
                     50.0, 0.0, 0.0,                  & Zo, delay, loss &
                     0.0, 0.0, 0.0, 0.0;         & c0, c1, c2, Zterminal &
```

```
SSTDDATA.WORK.PD8510            THU, DEC 22, 1983, 10:59 AM      PAGE   4

BYTE    TABLE c21 := 10,09,'(,'T,'H,'R,'U,' ,'#,'3,'),' ;        & label &
BYTE    TABLE d21 := std_thru,  0;                    & std_type, type2&
& std # 22 &
REAL    TABLE a22 := 0, 999e9,                              & fmin, fmax &
                     50.0, 0.0, 0.0,                  & Zo, delay, loss &
                     0.0, 0.0, 0.0, 0.0;         & c0, c1, c2, Zterminal &
BYTE    TABLE c22 := 10,09,'(,'T,'H,'R,'U,' ,'#,'4,'),' ;        & label &
BYTE    TABLE d22 := std_thru,  0;                    & std_type, type2&

& filler &
BYTE    TABLE e22 := 0,0,0,0,0,0,0,0,0,0,0,0,0,0,0,0,
                     0,0,0,0,0,0,0,0,0,0,0,0,0,0,0,0,
                     0,0,0,0,0,0,0,0,0,0,0,0,0,0,0,0,
                     0,0,0,0,0,0,0,0,0,0,0,0,0,0,0,0;


COMMENT                                                    cal_kit_descriptor
*****************************************************************************
*
*****************************************************************************
SECOND STD KIT
;
& calibration kit label &
BYTE    TABLE a50 := 10,09,'(,' ,'3,'.,'5,'m,'m,' ,'),' ;
& class lists of calibration standards &
BYTE    TABLE b50 :=  1, 2, 0, 0, 0, 0, 0, 0,           & port1_1st_std &
                      1, 1, 0, 0, 0, 0, 0, 0,           & port1_2nd_std &
                      3, 9,10,12, 0, 0, 0, 0,           & port1_3rd_std &
                      1, 9, 0, 0, 0, 0, 0, 0,           & isoln_fwd_std &
                      1,11, 0, 0, 0, 0, 0, 0,           & match_fwd_std &
                      1,11, 0, 0, 0, 0, 0, 0,           & trans_fwd_std &
                      1, 2, 0, 0, 0, 0, 0, 0,           & port2_1st_std &
                      1, 1, 0, 0, 0, 0, 0, 0,           & port2_2nd_std &
                      3, 9,10,12, 0, 0, 0, 0,           & port2_3rd_std &
                      1, 9, 0, 0, 0, 0, 0, 0,           & isoln_rev_std &
                      1,11, 0, 0, 0, 0, 0, 0,           & match_rev_std &
                      1,11, 0, 0, 0, 0, 0, 0,           & trans_rev_std &
                      3, 1, 2,11, 0, 0, 0, 0;           & freq_resp_std &
& class labels &
BYTE    TABLE c50 := 10,05,'O,'P,'E,'N,' ,' ,' ,' ,' ,' , & port1_1st_ &
                     10,05,'S,'H,'O,'R,'T,' ,' ,' ,' ,' , & port1_2nd_ &
                     10,05,'L,'O,'A,'D,'S,' ,' ,' ,' ,' , & port1_3rd_ &
                     10,10,'I,'S,'O,'L,'',',N,' ,'S,'T,'D, & isoln_fwd_ &
                     10,04,'T,'H,'R,'U,' ,' ,' ,' ,' ,' , & match_fwd_ &
                     10,04,'T,'H,'R,'U,' ,' ,' ,' ,' ,' , & trans_fwd_ &
                     10,05,'O,'P,'E,'N,' ,' ,' ,' ,' ,' , & port2_1st_ &
                     10,05,'S,'H,'O,'R,'T,' ,' ,' ,' ,' , & port2_2nd_ &
                     10,05,'L,'O,'A,'D,'S,' ,' ,' ,' ,' , & port2_3rd_ &
                     10,10,'I,'S,'O,'L,'',',N,' ,'S,'T,'D, & isoln_rev_ &
                     10,04,'T,'H,'R,'U,' ,' ,' ,' ,' ,' , & match_rev_ &
                     10,04,'T,'H,'R,'U,' ,' ,' ,' ,' ,' , & trans_rev_ &
                     10,08,'R,'E,'S,'P,'O,'N,'S,'E,' ,' ; & freq_resp_ &

& std #  1 &
REAL    TABLE a51 := 0, 999e9,                              & fmin, fmax &
```

```
SSTDDATA.WORK.PD8510          THU, DEC 22, 1983, 10:59 AM    PAGE  5

                    50.0,&.5000cm& 16.6835@-12, 1@9,  &Zo, delay, loss&
                    0.0, 0.0, 0.0, 0.0;         & c0, c1, c2, Zterminal &
BYTE    TABLE c51 := 10,06,'S,'H,'O,'R,'T,' ,' ,' ,' ,' ;          & label &
BYTE    TABLE d51 := std_short, 0;                          & std_type, type2&
& std #  2 &
REAL    TABLE a52 := 0, 999@9,                                 & fmin, fmax &
                    50.0,&.4340cm& 14.4481@-12, 1@9,  &Zo, delay, loss&
                    48.0,300.0,15,0.0;             &c0, c1, c2, Zterminal&
BYTE    TABLE c52 := 10,06,'O,'P,'E,'N,' ,' ,' ,' ,' ;          & label &
BYTE    TABLE d52 := std_open,  0;                          & std_type, type2&
& std #  3 &
REAL    TABLE a53 := .749@9, 2.001@9,                          & fmin, fmax &
                    50.0,&5.498cm&183.4520@-12, 1@9,  &Zo, delay, loss&
                    0.0, 0.0, 0.0, 0.0;         & c0, c1, c2, Zterminal &
BYTE    TABLE c53 := 10,07,'S,'H,'O,'R,'T,'#,'3,' ,' ,' ;       & label &
BYTE    TABLE d53 := std_short, 0;                          & std_type, type2&
& std #  4 &
REAL    TABLE a54 := 1.999@9, 4.001@9,                         & fmin, fmax &
                    50.0,&2.995cm& 99.9357@-12, 1@9,  &Zo, delay, loss&
                    0.0, 0.0, 0.0, 0.0;         & c0, c1, c2, Zterminal &
BYTE    TABLE c54 := 10,07,'S,'H,'O,'R,'T,'#,'4,' ,' ,' ;       & label &
BYTE    TABLE d54 := std_short, 0;                          & std_type, type2&
& std #  5 &
REAL    TABLE a55 := 3.999@9, 8.001@9,                         & fmin, fmax &
                    50.0,&1.7459cm& 58.2545@-12, 1@9, &Zo, delay, loss&
                    0.0, 0.0, 0.0, 0.0;         & c0, c1, c2, Zterminal &
BYTE    TABLE c55 := 10,07,'S,'H,'O,'R,'T,'#,'5,' ,' ,' ;       & label &
BYTE    TABLE d55 := std_short, 0;                          & std_type, type2&
& std #  6 &
REAL    TABLE a56 := 7.999@9, 12.001@9,                        & fmin, fmax &
                    50.0,&1.2315cm& 41.0922@-12, 1@9, &Zo, delay, loss&
                    0.0, 0.0, 0.0, 0.0;         & c0, c1, c2, Zterminal &
BYTE    TABLE c56 := 10,07,'S,'H,'O,'R,'T,'#,'6,' ,' ,' ;       & label &
BYTE    TABLE d56 := std_short, 0;                          & std_type, type2&
& std #  7 &
REAL    TABLE a57 := 11.999@9,18.501@9,                        & fmin, fmax &
                    50.0,&1.0225cm& 34.1171@-12, 1@9, &Zo, delay, loss&
                    0.0, 0.0, 0.0, 0.0;         & c0, c1, c2, Zterminal &
BYTE    TABLE c57 := 10,07,'S,'H,'O,'R,'T,'#,'7,' ,' ,' ;       & label &
BYTE    TABLE d57 := std_short, 0;                          & std_type, type2&
& std #  8 &
REAL    TABLE a58 := 0, 999@9,                                 & fmin, fmax &
                    50.0, 0.0, 0.0,                      & Zo, delay, loss &
                    0.0, 0.0, 0.0, 0.0;         & c0, c1, c2, Zterminal &
BYTE    TABLE c58 := 10,10,'(,'S,'H,'O,'R,'T,' ,'#,'8,');        & label &
BYTE    TABLE d58 := std_short, 0;                          & std_type, type2&
& std #  9 &
REAL    TABLE a59 := 0, 999@9,                                 & fmin, fmax &
                    50.0, 0.0, 0.0,                      & Zo, delay, loss &
                    0.0, 0.0, 0.0, 0.0;         & c0, c1, c2, Zterminal &
BYTE    TABLE c59 := 10,09,'B,'R,'O,'A,'D,'B,'A,'N,'D,' ;        & label &
BYTE    TABLE d59 := std_load,  0;                          & std_type, type2&
& std # 10 &
REAL    TABLE a60 := 3.999@9,999.000@9,                        & fmin, fmax &
                    50.0, 0.0, 0.0,                      & Zo, delay, loss &
                    0.0, 0.0, 0.0, 0.0;         & c0, c1, c2, Zterminal &
```

```
SSTDDATA.WORK.PD8510          THU, DEC 22, 1983, 10:59 AM    PAGE  6

BYTE    TABLE c60 := 10,07,'S,'L,'I,'D,'I,'N,'G,' ,' ,' ;       & label &
BYTE    TABLE d60 := std_load,  sliding;                    & std_type, type2&
& std # 11 &
REAL    TABLE a61 := 0, 999@9,                                 & fmin, fmax &
                    50.0, 0.0, 0.0,                      & Zo, delay, loss &
                    0.0, 0.0, 0.0, 0.0;         & c0, c1, c2, Zterminal &
BYTE    TABLE c61 := 10,06,' ,'T,'H,'R,'U,' ,' ,' ,' ,' ;        & label &
BYTE    TABLE d61 := std_thru,  0;                          & std_type, type2&
& std # 12 &
REAL    TABLE a62 := 0, 4.001@9,                               & fmin, fmax &
                    50.0, 0.0, 0.0,                      & Zo, delay, loss &
                    0.0, 0.0, 0.0, 0.0;         & c0, c1, c2, Zterminal &
BYTE    TABLE c62 := 10,07,'L,'O,'W,'B,'A,'N,'D,' ,' ,' ;        & label &
BYTE    TABLE d62 := std_load,  0;                          & std_type, type2&
& std # 13 &
REAL    TABLE a63 := 0, 999@9,                                 & fmin, fmax &
                    50.0, 0.0, 0.0,                      & Zo, delay, loss &
                    0.0, 0.0, 0.0, 0.0;         & c0, c1, c2, Zterminal &
BYTE    TABLE c63 := 10,09,'(,'L,'O,'A,'D,' ,'#,'5,'),' ;        & label &
BYTE    TABLE d63 := std_load,  0;                          & std_type, type2&
& std # 14 &
REAL    TABLE a64 := 0, 999@9,                                 & fmin, fmax &
                    50.0, 0.0, 0.0,                      & Zo, delay, loss &
                    0.0, 0.0, 0.0, 0.0;         & c0, c1, c2, Zterminal &
BYTE    TABLE c64 := 10,09,'(,'L,'O,'A,'D,' ,'#,'6,'),' ;        & label &
BYTE    TABLE d64 := std_load,  0;                          & std_type, type2&
& std # 15 &
REAL    TABLE a65 := 0, 999@9,                                 & fmin, fmax &
                    50.0, 0.0, 0.0,                      & Zo, delay, loss &
                    48.0,300.0,15.0, 0.0;           &c0,c1,c2, Zterminal&
BYTE    TABLE c65 := 10,09,'(,'O,'P,'E,'N,' ,'#,'1,'),' ;        & label &
BYTE    TABLE d65 := std_open,  0;                          & std_type, type2&
& std # 16 &
REAL    TABLE a66 := 0, 999@9,                                 & fmin, fmax &
                    50.0,&.50000cm& 16.6835@-12, 1@9, &Zo, delay, loss&
                    -9.7,2150.0,-39.0,0.0;         &c0, c1, c2, Zterminal&
BYTE    TABLE c66 := 10,08,'M,'a,'l,'e,'O,'P,'E,'N,' ,' ;        & label &
BYTE    TABLE d66 := std_open,  0;                          & std_type, type2&
& std # 17 &
REAL    TABLE a67 := 0, 999@9,                                 & fmin, fmax &
                    50.0,&.50000cm& 16.6835@-12, 1@9, &Zo, delay, loss&
                    21.0, -760.0, 0.0,  0.0;     &c0, c1, c2, Zterminal&
BYTE    TABLE c67 := 10,10,'F,'e,'m,'a,'l,'e,'O,'P,'E,'N;         & label &
BYTE    TABLE d67 := std_open,  0;                          & std_type, type2&
& std # 18 &
REAL    TABLE a68 := 0, 999@9,                                 & fmin, fmax &
                    50.0, 0.0, 0.0,                      & Zo, delay, loss &
                    0.0, 0.0, 0.0, 0.0;         & c0, c1, c2, Zterminal &
BYTE    TABLE c68 := 10,09,'(,'O,'P,'E,'N,' ,'#,'4,'),' ;        & label &
BYTE    TABLE d68 := std_open,  0;                          & std_type, type2&
& std # 19 &
REAL    TABLE a69 := 0, 999@9,                                 & fmin, fmax &
                    50.0, 0.0, 0.0,                      & Zo, delay, loss &
                    0.0, 0.0, 0.0, 0.0;         & c0, c1, c2, Zterminal &
BYTE    TABLE c69 := 10,09,'(,'T,'H,'R,'U,' ,'#,'1,'),' ;        & label &
BYTE    TABLE d69 := std_thru,  0;                          & std_type, type2&
```

```
SSTDDATA.WORK.PD8510          THU, DEC 22, 1983, 10:59 AM    PAGE  7

& std # 20 &
REAL    TABLE a70 := 0, 999@9,                                 & fmin, fmax &
                    50.0, 0.0, 0.0,                      & Zo, delay, loss &
                    0.0, 0.0, 0.0, 0.0;         & c0, c1, c2, Zterminal &
BYTE    TABLE c70 := 10,09,'(,'T,'H,'R,'U,' ,'#,'2,'),' ;        & label &
BYTE    TABLE d70 := std_thru,  0;                          & std_type, type2&
& std # 21 &
REAL    TABLE a71 := 0, 999@9,                                 & fmin, fmax &
                    50.0, 0.0, 0.0,                      & Zo, delay, loss &
                    0.0, 0.0, 0.0, 0.0;         & c0, c1, c2, Zterminal &
BYTE    TABLE c71 := 10,09,'(,'T,'H,'R,'U,' ,'#,'3,'),' ;        & label &
BYTE    TABLE d71 := std_thru,  0;                          & std_type, type2&
& std # 22 &
REAL    TABLE a72 := 0, 999@9,                                 & fmin, fmax &
                    50.0, 0.0, 0.0,                      & Zo, delay, loss &
                    0.0, 0.0, 0.0, 0.0;         & c0, c1, c2, Zterminal &
BYTE    TABLE c72 := 10,09,'(,'T,'H,'R,'U,' ,'#,'4,'),' ;        & label &
BYTE    TABLE d72 := std_thru,  0;                          & std_type, type2&

& filler &
BYTE    TABLE e72 := 0,0,0,0,0,0,0,0,0,0,0,0,0,0,0,0,
                     0,0,0,0,0,0,0,0,0,0,0,0,0,0,0,0,
                     0,0,0,0,0,0,0,0,0,0,0,0,0,0,0,0,
                     0,0,0,0,0,0,0,0,0,0,0,0,0,0,0,0;


GLOBAL INTEGER kit_base = a00;
GLOBAL INTEGER kit_base2= a50;

END$
```

```
CSTDMENU.WORK.PD8510          THU, DEC 22, 1983, 10:59 AM    PAGE  1

INTEGER CONSTANT

cmd_select_std := 209,
cmd_specify_classes := 210,
cmd_label_classes := 211,
cmd_label_cal_kit := 212,
cmd_cal_kit_defined := 213,
cmd_define_open := 214,
cmd_define_short := 215,
cmd_define_load := 216,
cmd_define_air_line := 217,
cmd_define_z := 218,
cmd_open_c0 := 219,
cmd_open_c1 := 220,
cmd_open_c2 := 221,
cmd_specify_offset := 222,
cmd_label_cal_std := 223,
cmd_cal_std_defined := 224,
cmd_fixed_load := 225,
cmd_sliding_load := 226,
cmd_offset_delay := 227,
cmd_offset_loss := 228,
cmd_offset_z0 := 229,
cmd_offset_min_f := 230,
cmd_offset_max_f := 231,
cmd_coax := 232,
cmd_waveguide := 233,
cmd_port1_1st_std := 235,
cmd_port1_2nd_std := 236,
cmd_port1_3rd_std := 237,
cmd_port2_1st_std := 238,
cmd_port2_2nd_std := 239,
cmd_port2_3rd_std := 240,
cmd_std_class_specified := 242,
cmd_trans_fwd_std := 243,
cmd_trans_rev_std := 244,
cmd_freq_resp_std := 245,
cmd_group12 := 0;
```

```
FSTDMENU.WORK.PD8510          THU, DEC 22, 1983, 10:59 AM     PAGE   1

COMMENT
  This is a software generated file !!!
  Changes must be made in SKINFO.WORK
  Run GENSK.LANI to re-generate file;

SUBROUTINE proc12;  ENTRY;
BEGIN

CASE command_token-209 OF
BEGIN
& 209 &
select_active_function( active_std_id );
& 210 &
tell( select_std_class );
& 211 &
warn( command_not_implemented );
& 212 &
warn( command_not_implemented );
& 213 &
cal_kit_defined;
& 214 &
define_std( std_open );
& 215 &
define_std( std_short );
& 216 &
BEGIN
   hilight_load_type;
   define_std( std_load );
END;
& 217 &
BEGIN
   hilight_offset_type;
   define_std( std_thru );
END;
& 218 &
BEGIN
   hilight_load_type;
   define_std( std_z );
END;
& 219 &
select_active_function( active_open_c0 );
& 220 &
select_active_function( active_open_c1 );
& 221 &
select_active_function( active_open_c2 );
& 222 &
hilight_offset_type;
& 223 &
warn( command_not_implemented );
& 224 &
pop_menu( MODIFY_CAL_KIT_MENU );
& 225 &
define_type2( fixed );
& 226 &
define_type2( sliding );
```

```
FSTDMENU.WORK.PD8510          THU, DEC 22, 1983, 10:59 AM     PAGE   2

& 227 &
select_active_function( active_offset_delay );
& 228 &
select_active_function( active_offset_loss );
& 229 &
select_active_function( active_offset_z0 );
& 230 &
select_active_function( active_offset_min_freq );
& 231 &
select_active_function( active_offset_max_freq );
& 232 &
define_type2( coax );
& 233 &
define_type2( waveguide );
& 234 &
previous_menu;
& 235 &
std_class( port1_1st_std );
& 236 &
std_class( port1_2nd_std );
& 237 &
std_class( port1_3rd_std );
& 238 &
std_class( port2_1st_std );
& 239 &
std_class( port2_2nd_std );
& 240 &
std_class( port2_3rd_std );
& 241 &
BEGIN END;
& 242 &
pop_menu(MODIFY_CAL_KIT_MENU);
& 243 &
std_class( trans_fwd_std );
& 244 &
std_class( trans_rev_std );
& 245 &
std_class( freq_resp_std );
END;
END proc12;
```

```
CSTDS.WORK.PD8510             THU, DEC 22, 1983, 10:59 AM     PAGE   1

INTEGER CONSTANT                              & std_characteristic &
      coax              := 0,               & bit 0 = coax/waveguide &
      waveguide         := 1,
      fixed             := 0,               & bit 1 = fixed/sliding  &
      sliding           := 2;
INTEGER CONSTANT                              & classes of standards &
      port1_1st_std     := 0,
      port1_2nd_std     := 1,
      port1_3rd_std     := 2,
      isoln_fwd_std     := 3,
      match_fwd_std     := 4,
      trans_fwd_std     := 5,
      port2_1st_std     := 6,
      port2_2nd_std     := 7,
      port2_3rd_std     := 8,
      isoln_rev_std     := 9,
      match_rev_std     :=10,
      trans_rev_std     :=11,
      freq_resp_std     :=12,
      port_offset       := port2_1st_std - port1_1st_std,
      port_size         := port_offset;
INTEGER CONSTANT
      f_min_index       :=  0, & REAL &
      f_max_index       :=  1, & REAL &
      z0_index          :=  2, & REAL &
      delay_index       :=  3, & REAL &
      loss_index        :=  4, & REAL &
      c0_index          :=  5, & REAL &
      c1_index          :=  6, & REAL &
      c2_index          :=  7, & REAL &
      z_index           :=  8, & REAL &
      type_index        := 48, & BYTE &
      type2_index       := 49; & BYTE &
```

```
FSTDS.WORK.PD8510             THU, DEC 22, 1983, 10:59 AM     PAGE   1

#FILE cstds.work;

EXTERNAL INTEGER last_class_element;

SUBROUTINE hilight_last_class;                              EXTERNAL.L;
SUBROUTINE hilight_last_element;                            EXTERNAL.L;
PROCEDURE  select_cal_kit( kit );
   VALUE   kit;
   INTEGER kit;                                             EXTERNAL.L;
PROCEDURE  init_stds;                                       EXTERNAL.L;
PROCEDURE  set_element( element );
   VALUE   element;
   INTEGER element;                                         EXTERNAL.L;
PROCEDURE  annotate_std_classes;                            EXTERNAL.L;
PROCEDURE  set_std_class( class );
   VALUE   class;
   INTEGER class;                                           EXTERNAL.L;
INTEGER PROCEDURE std_measured( f_min, f_max, class );
   & by reference &
   REAL    f_min, f_max;
   INTEGER class;                                           EXTERNAL.L;
BOOLEAN PROCEDURE frequency_covered;                        EXTERNAL.L;
DOUBLE PROCEDURE standard_specs( frequency, class );
   VALUE   frequency, class;
   REAL    frequency;
   INTEGER class;                                           EXTERNAL.L;
```

```
SSTDS.WORK.PD8510            THU, DEC 22, 1983, 10:59 AM      PAGE   1

M68KL,P,"stds"
BEGIN

#FILE factive.work;                          & for select_active_fcn &
#FILE factive2.work;                         & for select_active_off &
#FILE fcommand.work;                             & for command_token &
#FILE cstds.work;
#FILE cstds2.work;
#FILE ccal.work;                                   & for std_... types &
#FILE fcal.work;                                   & for acquire_data &
#FILE ccalmenu.work;            & for cmd_cal_type_menu and cmd_class_done &
#FILE cstdmenu.work;
#FILE cmenu.work;                                  & for menu names &
#FILE fmenu.work;                                  & for change_softkey &
#FILE cmessag0.work;              & for command_not_implemented & & DEBUG &
#FILE cmessag1.work;
#FILE cmsgcal.work;
#FILE futil3.work;                                 & for tell, warn &
#FILE cchtable.work;
#FILE fchtable.work;                          & for set_entry_ch_integer &
#FILE fmbmgr.work;                            & for save_ and recall_data &
#FILE ctpmgr.work;                                 & for cal_std_file &
#FILE cscreen2.work;                               & for sk_bracket_8 &
#FILE fdispram.work;                               & for wrt_disp_byte &
#FILE fcontrol.work;                          & for measurement_restart &
#FILE ccontvar.work;                               & for s21, etc. &
#FILE fparam.work;                                 & for new_parameter &
#FILE crins.work;                             & for active_function_rin &
#FILE fkernel.work;                                & for acquire, release &

COMMENT  this array is now a fixed allocation in the file smarkmen.;
EXTERNAL BYTE ARRAY cal_kit_array.L[0:cal_kit_array_size-1]; & markmen &
```

```
SSTDS.WORK.PD8510            THU, DEC 22, 1983, 10:59 AM      PAGE   2

#EJECT;
INTEGER current_class;                                & class   # (0-7) &
INTEGER current_element;                              & element # (1-7) &
GLOBAL INTEGER last_class_element;
GLOBAL INTEGER current_std_id;                        & standard number &

BYTE TABLE class_param :=
   s11,  & port1_1st_std &
   s11,  & port1_2nd_std &
   s11,  & port1_3rd_std &
   s21,  & isoln_fwd_std &
   s11,  & match_fwd_std &
   s21,  & trans_fwd_std &
   s22,  & port2_1st_std &
   s22,  & port2_2nd_std &
   s22,  & port2_3rd_std &
   s12,  & isoln_rev_std &
   s22,  & match_rev_std &
   s12,  & trans_rev_std &
   0;    & freq_resp_std &

INTEGER TABLE class_elements :=
   std_class_1 + port1_1st_std * class_list_size,
   std_class_1 + port1_2nd_std * class_list_size,
   std_class_1 + port1_3rd_std * class_list_size,
   std_class_1 + isoln_fwd_std * class_list_size,
   std_class_1 + match_fwd_std * class_list_size,
   std_class_1 + trans_fwd_std * class_list_size,
   std_class_1 + port2_1st_std * class_list_size,
   std_class_1 + port2_2nd_std * class_list_size,
   std_class_1 + port2_3rd_std * class_list_size,
   std_class_1 + isoln_rev_std * class_list_size,
   std_class_1 + match_rev_std * class_list_size,
   std_class_1 + trans_rev_std * class_list_size,
   std_class_1 + freq_resp_std * class_list_size;

INTEGER TABLE cmd_element :=
           0,
   cmd_class_std1,
   cmd_class_std2,
   cmd_class_std3,
   cmd_class_std4,
   cmd_class_std5,
   cmd_class_std6,
   cmd_class_std7;

INTEGER TABLE std_class_label :=
   std_class_label1 + port1_1st_std * (label_size+2),
   std_class_label1 + port1_2nd_std * (label_size+2),
   std_class_label1 + port1_3rd_std * (label_size+2),
   std_class_label1 + isoln_fwd_std * (label_size+2),
   std_class_label1 + match_fwd_std * (label_size+2),
   std_class_label1 + trans_fwd_std * (label_size+2),
   std_class_label1 + port2_1st_std * (label_size+2),
   std_class_label1 + port2_2nd_std * (label_size+2),
   std_class_label1 + port2_3rd_std * (label_size+2),
```

```
SSTDS.WORK.PD8510            THU, DEC 22, 1983, 10:59 AM      PAGE   3

   std_class_label1 + isoln_rev_std * (label_size+2),
   std_class_label1 + match_rev_std * (label_size+2),
   std_class_label1 + trans_rev_std * (label_size+2),
   std_class_label1 + freq_resp_std * (label_size+2);

INTEGER TABLE cmd_class   :=
   cmd_port1_std1,        & port1_1st_std &
   cmd_port1_std2,        & port1_2nd_std &
   cmd_port1_std3,        & port1_3rd_std &
   cmd_fwd_isolation,     & isoln_fwd_std &
   cmd_fwd_match,         & match_fwd_std &
   cmd_fwd_transmission,& trans_fwd_std &
   :nd_port2_std1,        & port2_1st_std &
   :-d_port2_std2,        & port2_2nd_std &
     : port2_std3,        & port2_3rd_std &
      rev_isolation,      & isoln_rev_std &
      rev_match,          & match_rev_std &
      rev_transmission,& trans_rev_std &
      response_type;      & freq_resp_std &

[illegible] [illegible]BLE std_class_line  :=
   [illegible]    & port1_1st_std &
   1,    & port1_2nd_std &
   1,    & port1_3rd_std &
   2,    & isoln_fwd_std &
   2,    & match_fwd_std &
   2,    & trans_fwd_std &
   2,    & port2_1st_std &
   1,    & port2_2nd_std &
   1,    & port2_3rd_std &
   2,    & isoln_rev_std &
   2,    & match_rev_std &
   2,    & trans_rev_std &
   2;    & freq_resp_std &

INTEGER TABLE cmd_cal_kit :=
      0,              & 0 index is not used &
      cmd_cal_kit_1,
      cmd_cal_kit_2;

INTEGER TABLE cmd_modify_cal_kit :=
      0,              & 0 index is not used &
      cmd_modify_cal_kit_1,
      cmd_modify_cal_kit_2;

INTEGER TABLE cmd_load_type :=
      cmd_fixed_load,
      cmd_sliding_load;

INTEGER TABLE cmd_offset_type :=
      cmd_coax,
      cmd_waveguide;

INTEGER TABLE cmd_std_type :=
      cmd_define_open,
      cmd_define_short,
```

```
SSTDS.WORK.PD8510            THU, DEC 22, 1983, 11:00 AM      PAGE   4

      cmd_define_load,
      cmd_define_air_line,
      cmd_define_z;

INTEGER kit_number;                                   & cal kit number &
DOUBLE  cal_kit;                          & address of cal kit descriptor &
GLOBAL DOUBLE cal_std_addr;               & address of cal std descriptor &

INTEGER ARRAY max_measured_std[ port1_1st_std:freq_resp_std ];
DOUBLE  ARRAY cal_std_addrs[ port1_1st_std:freq_resp_std,
                  1:class_size
             ];
```

```
SSTDS.WORK.PD8510                THU, DEC 22, 1983, 11:00 AM     PAGE   5

#EJECT;
COMMENT                                                      hilight_offset_type
**********************************************************************
*
**********************************************************************
;
PROCEDURE  hilight_offset_type;
   BEGIN & hilight_offset_type &
      BYTE POINTER type2;

      STPNTR( type2, cal_std_addr + type2_offset );
      hilight_key( cmd_offset_type[ type2 AND Z0001 ],
                   cmd_coax,
                   cmd_waveguide
                 );
   END;  & hilight_offset_type &
```

```
SSTDS.WORK.PD8510                THU, DEC 22, 1983, 11:00 AM     PAGE   6

#EJECT;
COMMENT                                                        hilight_load_type
**********************************************************************
*
**********************************************************************
;
PROCEDURE  hilight_load_type;
   BEGIN & hilight_load_type &
      BYTE POINTER type2;

      STPNTR( type2, cal_std_addr + type2_offset );
      hilight_key( cmd_load_type[ ARIGHT(type2,1) AND Z0001 ],
                   cmd_fixed_load,
                   cmd_sliding_load
                 );
   END;  & hilight_load_type &
```

```
SSTDS.WORK.PD8510                THU, DEC 22, 1983, 11:00 AM     PAGE   7

#EJECT;
COMMENT                                                         hilight_std_type
**********************************************************************
*
**********************************************************************
;
PROCEDURE  hilight_std_type;
   BEGIN & hilight_std_type &
      BYTE POINTER std_type;

      STPNTR( std_type, cal_std_addr + type_offset );
      hilight_key( cmd_std_type[ std_type ],
                   cmd_define_open,
                   cmd_define_z
                 );
   END;  & hilight_std_type &
```

```
SSTDS.WORK.PD8510                THU, DEC 22, 1983, 11:00 AM     PAGE   8

#EJECT;
COMMENT                                                       hilight_last_class
**********************************************************************
*
**********************************************************************
;
SUBROUTINE hilight_last_class;                                        ENTRY;
   BEGIN & hilight_last_class &
      hilight_command( cmd_class[current_class] );
   END;  & hilight_last_class &
```

```
$EJECT;
COMMENT                                              hilight_last_element
*************************************************************************
*
*************************************************************************
;
SUBROUTINE hilight_last_element;                               ENTRY;
   BEGIN & hilight_last_element &
      hilight_command( cmd_element[current_element] );
   END;  & hilight_last_element &
```

```
$EJECT;
COMMENT                                              update_kit_label
*************************************************************************
*
*************************************************************************
;
PROCEDURE update_kit_label(kit_number);
   VALUE kit_number;                                           ENTRY;
   INTEGER kit_number;
   BEGIN
     change_softkey( cal_kit + std_kit_label,
                     cmd_cal_kit_1-1+kit_number,
                     2
                   );
   END update_kit_label;
```

```
$EJECT;
COMMENT                                              select_cal_kit
*************************************************************************
*
*  kit_number must be either 1 or 2 only -- guaranteed since generated
*  only by soft-keys or a recalled state previously set via soft-keys.
*
*************************************************************************
;
PROCEDURE  select_cal_kit( kit );
   VALUE   kit;                                                ENTRY;
   INTEGER kit;
   BEGIN & select_cal_kit &

      hilight_key(cmd_cal_kit[kit],cmd_cal_kit_1,cmd_cal_kit_2);
      hilight_key(cmd_modify_cal_kit[kit],
                  cmd_modify_cal_kit_1,
                  cmd_modify_cal_kit_2
                 );
      kit_number := kit;
      cal_kit := ADRS( cal_kit_array );                        & DEBUG &
      recall_data( cal_kit, cal_std_file, kit );
      update_kit_label( kit );

   END;  & select_cal_kit &
```

```
$EJECT;
COMMENT                                              init_stds
*************************************************************************
*
*************************************************************************
;
PROCEDURE  init_stds;                                          ENTRY;
   BEGIN & init_stds &
      INTEGER i,
              j;

      current_std_id   := std_undefined;
      cal_kit := ADRS( cal_kit_array );                        & DEBUG &

      IF recall_data( cal_kit, cal_std_file, 1 ) THEN
         update_kit_label( 1 );
      IF recall_data( cal_kit, cal_std_file, 2 ) THEN
         update_kit_label( 2 );

      current_std_id := 1;

   END;  & init_stds &
```

```
#EJECT;
COMMENT                                                       set_std_addr
**********************************************************************
*
**********************************************************************
;
PROCEDURE  set_std_addr( std_no );
   VALUE   std_no;
   INTEGER std_no;
   BEGIN & set_std_addr &
      cal_std_addr := cal_kit +
                      std_def_1 +
                      (std_no - 1) * std_size;
   END;  & set_std_addr &
```

```
#EJECT;
COMMENT                                                            std_id
**********************************************************************
*
*  Selects the specified (id) standard for subsequent modification of
*  its values.
*
**********************************************************************
;
PROCEDURE  std_id( id );
   VALUE   id;
   INTEGER id;                                                   ENTRY;
   BEGIN & std_id &
      current_std_id := id;
      set_std_addr( current_std_id );
      hilight_std_type;
      gen_menu( MODIFY_STDS_MENU, 1 );

      release( active_function_rin );                & acquired in active &
      select_active_off( active_std_id );
      acquire( active_function_rin );                   & restore access &
   END;  & std_id &
```

```
#EJECT;
COMMENT                                                        define_std
**********************************************************************
*
*  Specify standard type
*
**********************************************************************
;
PROCEDURE  define_std( std_type );
   VALUE   std_type;
   BYTE    std_type;
   BEGIN & define_std &
      hilight_on( cmd_define_open, cmd_define_z );
      wrt_disp_byte( cal_std_addr + type_offset,  std_type );

      hilight_key( cmd_fixed_load, cmd_fixed_load, cmd_sliding_load );
      hilight_key( cmd_coax, cmd_coax, cmd_waveguide );
      wrt_disp_byte( cal_std_addr + type2_offset, 0        );
   END;  & define_std &
```

```
#EJECT;
COMMENT                                                      define_type2
**********************************************************************
*
**********************************************************************
;
PROCEDURE  define_type2( type2 );
   VALUE   type2;
   BYTE    type2;
   BEGIN & define_type2 &
      BYTE POINTER type2_ptr;

      STPNTR( type2_ptr, cal_std_addr + type2_offset );
      wrt_disp_byte( ADRS(type2_ptr), (type2 OR type2_ptr) );
      hilight_load_type;                                           & DEBUG &
      hilight_offset_type;                                         & DEBUG &
   END;  & define_type2 &
```

```
SSTDS.WORK.PD8510               THU, DEC 22, 1983, 11:00 AM     PAGE  17

$EJECT;
COMMENT                                                         std_class
**********************************************************************
*
*  Selects the specified class (id) for entering a list of standards.
*  Clears any existing list for the specified class.
*
**********************************************************************
;
PROCEDURE  std_class( id );
   VALUE   id;
   INTEGER id;
   BEGIN & std_class & current_class := id;
      wrt_disp_byte( cal_kit + class_elements[current_class], 0 );
                                                  & reset this std class &
      tell( specify_std_class );
      select_active_function( active_std_class );

END;  & std_class &
```

```
SSTDS.WORK.PD8510               THU, DEC 22, 1983, 11:00 AM     PAGE  18

$EJECT;
COMMENT                                                 std_class_element
**********************************************************************
*
*  Adds the specified standard (id) to the list of elements that make
*  up the current class.
*
**********************************************************************
;
PROCEDURE  std_class_element( id );
   VALUE   id;
   INTEGER id;                                                   ENTRY;
   BEGIN & std_class_element &
      INTEGER index;
      BYTE POINTER class_element;

      STPNTR( class_element,
              cal_kit + class_elements[current_class]
            );

      index := 1 + class_element[0];
      IF index <= class_size THEN
         BEGIN & if &
            wrt_disp_byte( ADRS(class_element[index]), id    );
            wrt_disp_byte( ADRS(class_element[0]),     index );
         END   & if &
      ELSE
         warn( exceeded_std_class_limit );

   END;  & std_class_element &
```

```
SSTDS.WORK.PD8510               THU, DEC 22, 1983, 11:00 AM     PAGE  19

$EJECT;
COMMENT                                                   cal_kit_defined
**********************************************************************
*
**********************************************************************
;
SUBROUTINE cal_kit_defined;
   BEGIN & cal_kit_defined &
      save_data( cal_kit,
                 cal_kit_array_size,
                 cal_std_file,
                 kit_number
               );                                   & store in bubble &
      & this call can be moved to routine which modifies actual label &
      update_kit_label( kit_number );
      previous_menu;
      current_std_id   := std_undefined;
   END;  & cal_kit_defined &
```

```
SSTDS.WORK.PD8510               THU, DEC 22, 1983, 11:00 AM     PAGE  20

$EJECT;
COMMENT                                                       set_element
**********************************************************************
*
*  Select the element of a class (1-7) to be subsequently measured.
*  Look up the appropriate standard number.
*
**********************************************************************
;
PROCEDURE  set_element( element );
   VALUE   element;
   INTEGER element;                                              ENTRY;
   BEGIN & set_element &
      BYTE POINTER std_type,
                   class_element;

      current_element := element;

      STPNTR( class_element,
              cal_kit + class_elements[current_class]
            );

      set_std_addr( class_element[element] );

      STPNTR( std_type, type_offset + cal_std_addr );

      IF (std_type[1] AND sliding) = 0 THEN              & not sliding &
         acquire_data
      ELSE                                                   & sliding &
         BEGIN
         gen_menu( SLIDING_LOAD_MENU, 1 );
         tell( slide_load );
         END;

   END;  & set_element &
```

```
#EJECT;
COMMENT                                              annotate_std_classes
*************************************************************************
*
*  Annotate the classes.  Called from set_cal_type.
*
*************************************************************************
;
PROCEDURE  annotate_std_classes;                                  ENTRY;
   BEGIN & annotate_std_classes &
      INTEGER class;

      FOR class := port1_1st_std UNTIL trans_rev_std DO
         change_softkey( std_class_label[class] + cal_kit,
                         cmd_class[class],
                         std_class_line[class]
                       );

   END;  & annotate_std_classes &
```

```
#EJECT;
COMMENT                                                     set_std_class
*************************************************************************
*
*  Specifies the class from which standards will be selected during cal.
*
*************************************************************************
;
PROCEDURE  set_std_class( class );
   VALUE   class;
   INTEGER class;                                                 ENTRY;
   BEGIN & set_std_class &
      BYTE POINTER class_element;
      INTEGER std,
              index;
      ALPHA   std_label;

      current_class := class;

      IF current_class <> freq_resp_std THEN
         new_parameter( class_param[current_class] );

      STPNTR( class_element,
              cal_kit + class_elements[current_class]
            );
      last_class_element := INTEGER( class_element[0] );

      max_measured_std[current_class] := 0;

      IF last_class_element > 1 THEN
         BEGIN & more than one std in this class &
            hilight_off( cmd_class_std1, cmd_class_std7 );

            & All keys have to be changed or cleared in case the menu  &
            & displayed as the result of a "prior menu", or similar    &
            FOR std := 1 UNTIL class_size DO                   & 1 to 7 &
               BEGIN & for &
                  IF std > last_class_element THEN
                     std_label := " "
                  ELSE
                     std_label := cal_kit + std_def_1 + label_offset +
                                  (std_size * (class_element[std]-1));
                  change_softkey( std_label,
                                  cmd_element[std],
                                  1
                                );
               END;  & for &                  & must be before gen_menu() &
            change_softkey( std_class_label[current_class] + cal_kit,
                            cmd_class_done,
                            1
                          );                  & must be before gen_menu() &

            gen_menu( STD_CLASS_MENU, 1 );

            IF last_class_element < 7 THEN
               FOR std := last_class_element UNTIL 6 DO      & 0 to 7 &
```

```
                  blank_softkey( std );     & must be after gen_menu() &

            tell( connect_std );
         END   & more than one std in this class &
      ELSE & single standard &
         set_element( 1 );                        & set-up and measure it &

   END;  & set_std_class &
```

```
#EJECT;
COMMENT                                                      std_measured
*************************************************************************
*
*  Add the current standard to the list of standards measured.  Return
*  its f_min and f_max.
*
*************************************************************************
;
INTEGER PROCEDURE std_measured( f_min, f_max, class );
   & by reference &
   REAL    f_min, f_max;
   INTEGER class;                                                 ENTRY;
   BEGIN & std_measured &
      BOOLEAN move_stds;
      INTEGER i;
      REAL POINTER std;
      BYTE POINTER byte_ptr = std;

      & check if this std has already been measured &
      move_stds := FALSE;
      IF max_measured_std[current_class] >= 1 THEN
         FOR i := 1 UNTIL max_measured_std[current_class] DO
            IF move_stds THEN
               cal_std_addrs[current_class,(i-1)] :=
                                       cal_std_addrs[current_class,i]
            ELSE IF cal_std_addrs[current_class,i] = cal_std_addr
                 THEN
                    move_stds := TRUE;
      IF NOT move_stds THEN
         max_measured_std[current_class] :=
                                 max_measured_std[current_class] + 1;

      & place this standard in the list of measured standards &
      cal_std_addrs[current_class,max_measured_std[current_class]] :=
                                                           cal_std_addr;

      & return the frequency limits of this standard &
      STPNTR( std, cal_std_addr );
      f_min := std[ f_min_index ];
      f_max := std[ f_max_index ];
      class := current_class;
      std_measured := INTEGER( byte_ptr[type2_offset] );

   END;  & std_measured &
```

```
SSTDS.WORK.PD8510              THU, DEC 22, 1983, 11:00 AM     PAGE  25

#EJECT;
COMMENT                                                     frequency_covered
*************************************************************************
*
*  Returns TRUE if the current frequency range has been covered by
*  standards measured since the most recent set_std_class(), FALSE
*  otherwise.
*
*************************************************************************
;
BOOLEAN PROCEDURE frequency_covered;                                ENTRY;
   BEGIN & frequency_covered &
      BYTE    used;
      BOOLEAN covered;                          & temporary result &
      INTEGER i,
              j;
      REAL    min,
              max,
              band_start,
              band_stop,
              temp_min,
              temp_max;
      QUAD    temp_quad;
      REAL POINTER std;

      covered := FALSE;
      used := 0;

      IF max_measured_std[current_class] > 0 THEN
         BEGIN & if &

            & compute stop frequency &
            band_stop := REAL( entry_ch_quad(ch_center_frequency) );
            band_stop := (2 * band_stop) -
                  REAL( entry_ch_quad(ch_start_frequency) );
            & and start frequency &
            band_start := REAL( entry_ch_quad(ch_start_frequency) );

            j := 0;
            min := 1.0E37;                          & a very big_number &
            FOR i := 1 UNTIL max_measured_std[current_class] DO
               BEGIN & for &
                  STPNTR( std, cal_std_addrs[current_class,i] );
                  temp_min := std[f_min_index];
                  temp_max := std[f_max_index];
                  IF ( (temp_min < min)       AND
                       (temp_min < band_stop)  AND
                       (temp_max > band_start)
                     ) THEN      & part of standard is in current band &
                     BEGIN & if &
                        j := i;
                        min := temp_min;
                        max := temp_max;
                     END;  & if &
               END;  & for &
```

```
SSTDS.WORK.PD8510              THU, DEC 22, 1983, 11:00 AM     PAGE  26

            & check for coverage &
            IF min <= band_start THEN
               BEGIN & if &
                  used := SBIT( used, j );

                  & cumbersome, but smaller than a sort &
                  FOR i := 1 UNTIL max_measured_std[current_class] DO
                     FOR j := 1 UNTIL max_measured_std[current_class] DO
                        IF NOT TBIT(used,j) THEN
                           BEGIN & if &
                              STPNTR( std, cal_std_addrs[
                                                   current_class,
                                                   j
                                                    ]
                                    );
                              IF std[f_min_index] < max THEN
                                 BEGIN & if &
                                    temp_max := std[f_max_index];
                                    IF temp_max > max THEN
                                       max := temp_max;
                                    used := SBIT(used,j);
                                 END;  & if &
                           END;  & if &

                  IF max >= band_stop THEN
                     covered := TRUE;
               END;  & if &
         END;  & if &

      frequency_covered := covered;

   END;  & frequency_covered &
```

```
SSTDS.WORK.PD8510              THU, DEC 22, 1983, 11:00 AM     PAGE  27

#EJECT;
COMMENT                                                     standard_specs
*************************************************************************
*
*  Returns the address of the REAL ARRAY containing the specifications
*  of the standard in the class for the specified frequency.
*  Individual specifications are indexed by the ..._index constants in
*  cstds.work.
*
*************************************************************************
;
DOUBLE PROCEDURE standard_specs( frequency, class );
   VALUE   frequency, class;
   REAL    frequency;
   INTEGER class;                                                   ENTRY;
   BEGIN & standard_specs &
      INTEGER i;
      BOOLEAN done;
      REAL POINTER std;

      done := FALSE;
      i := max_measured_std[class];
      WHILE ( (i > 0) AND (NOT done) ) DO
         BEGIN & while &
            STPNTR( std, cal_std_addrs[class,i] );
                  & take_data must use the same banding rules &
            IF ( (std[f_min_index] <= frequency) AND
                 (std[f_max_index] >= frequency)
               ) THEN
               done := TRUE
            ELSE
               i := i - 1;
         END;  & while &

      standard_specs := cal_std_addrs[class,i];

   END;  & standard_specs &


OFILE fstdmenu.work;

END$
```

```
CSTDS2.WORK.PD8510             THU, DEC 22, 1983, 11:00 AM     PAGE   1

INTEGER CONSTANT
     min_stds          :=  1,
     max_stds          := 22,

     label_size        := 10,
     class_size        :=  7,
     class_list_size   := class_size + 1,

     std_kit_label     :=  1,  & indexed as [-1:label_size] &
     std_class_1       := 12,
     std_class_label1  :=117,  & indexed as [-1:label_size] &
     std_def_1         :=272,
     f_min_offset      :=  0,  & real &
     f_max_offset      :=  4,  & real &
     z0_offset         :=  8,  & real &
     delay_offset      := 12,  & real &
     loss_offset       := 16,  & real &
     c0_offset         := 20,  & real &
     c1_offset         := 24,  & real &
     c2_offset         := 28,  & real &
     z_offset          := 32,  & real &
     label_offset      := 37,  & indexed as [-1:label_size] &
     type_offset       := 48,  & byte &
     type2_offset      := 49,  & byte &

     std_size          := 50,

     cal_kit_size      := (std_def_1) +              & kit_label +       &
                          (std_size * max_stds),     & std descriptors &

     cal_kit_array_size := ((cal_kit_size - 1) OR %003F) + 1;
```

FSTDS2.WORK.PD8510 THU, DEC 22, 1983, 11:00 AM PAGE 1

```
#FILE cstds2.work;

EXTERNAL INTEGER current_std_id;
EXTERNAL DOUBLE  cal_std_addr;

PROCEDURE update_kit_label(kit_number);
   VALUE kit_number;
   INTEGER kit_number;                               EXTERNAL.L;
PROCEDURE  std_id( id );
   VALUE   id;
   INTEGER id;                                       EXTERNAL.L;
PROCEDURE  std_class_element( id );
   VALUE   id;
   INTEGER id;                                       EXTERNAL.L;
```

FSTIM.WORK.PD8510 THU, DEC 22, 1983, 11:00 AM PAGE 1

```
COMMENT
  This is a software generated file !!!
  Changes must be made in SKINFO.WORK
  Run GENSK.LANI to re-generate file;

SUBROUTINE proc4;  ENTRY;
BEGIN

CASE command_token-60 OF
BEGIN
& 60 &
BEGIN END;
 61 &
   _active_function(active_sweep_time);

     ND;


     ght_on( cnd_cw, cnd_stepped);
     ode;


BEGIN
  hilight_on( cnd_cw, cnd_stepped);
  swept_mode;
END;
& 65 &
BEGIN
  hilight_on( cnd_cw, cnd_stepped);
  stepped_mode;
END;
& 66 &
new_step_size( 16 );
& 67 &
new_step_size( 8 );
& 68 &
new_step_size( 4 );
& 69 &
new_step_size( 2 );
& 70 &
select_active_function(active_source_power);
& 71 &
BEGIN
   hilight_on( cnd_power_slope, cnd_power_slope_off );
   set_entry_ch_integer( power_slope_on, ch_power_slope_mode );
   wrt_priv_ib_source( sl1, newline);
   select_active_function( active_power_slope );
END;
& 72 &
BEGIN
   hilight_on( cnd_power_slope, cnd_power_slope_off );
   set_entry_ch_integer( power_slope_off, ch_power_slope_mode );
   select_active_off( active_power_slope );
   wrt_priv_ib_source( sl0, "");
END;
```

CSTIM.WORK.PD8510 THU, DEC 22, 1983, 11:00 AM PAGE 1

```
INTEGER CONSTANT

cnd_power_menu := 60,
cnd_sweep_time := 61,
cnd_n_points_menu := 62,
cnd_cw := 63,
cnd_swept := 64,
cnd_stepped := 65,
cnd_51_points := 66,
cnd_101_points := 67,
cnd_201_points := 68,
cnd_401_points := 69,
cnd_source_power := 70,
cnd_power_slope := 71,
cnd_power_slope_off := 72,
cnd_atten_port1 := 73,
cnd_atten_port2 := 74,
cnd_hold := 75,
cnd_single := 76,
cnd_n_groups_kbd := 77,
cnd_continuous := 78,
cnd_couple_stimulus := 80,
cnd_uncouple_stimulus := 81,
cnd_group4 := 0;
```

FSTIM.WORK.PD8510 THU, DEC 22, 1983, 11:00 AM PAGE 2

```
& 73 &
select_active_function(active_atten_port1);
& 74 &
select_active_function(active_atten_port2);
& 75 &
hold_sweep;
& 76 &
single_sweep;
& 77 &
select_active_function(active_n_groups_kbd);
& 78 &
continuous_sweep;
& 79 &
BEGIN                                                                & DEBUG &
warn(command_not_implemented );                                      & DEBUG &
& select_active_function( active_stimulus_offset ); &                & DEBUG &
END;
& 80 &
BEGIN
  hilight_on( cnd_couple_stimulus, cnd_uncouple_stimulus );
  set_coupled_stimulus_status( TRUE );
END;
& 81 &
BEGIN
  hilight_on( cnd_couple_stimulus, cnd_uncouple_stimulus );
  set_coupled_stimulus_status( FALSE );
END;
& 82 &
BEGIN
   previous_menu;
   device_reversed;
END;
END;
END proc4;
```

```
FSTIMUL2.WORK.PD8510          THU, DEC 22, 1983, 11:00 AM     PAGE   1

EXTERNAL INTEGER source_points;

PROCEDURE  update_stimulus_step_size;                          EXTERNAL;
```

```
SSTIMUL2.WORK.PD8510          THU, DEC 22, 1983, 11:00 AM     PAGE   1

M68KL,P,"stim2"
BEGIN

#FILE fcommand.work;                                 & command_token &
#FILE fcontrol.work;
#FILE fchdata.work;
#FILE fstring.work;
#FILE fprivib.work;
#FILE ffmt.work;
#FILE fbreak.work;
#FILE cchars.work;
#FILE cchtable.work;
#FILE fchtable.work;
#FILE fchtab2.work;                                     & for ch_quad &
#FILE fchtab3.work;
#FILE cstimuli.work;                             & for power_slope_... &
#FILE fstimul3.work;                          & for annotate_stimulus &
#FILE fcontvar.work;                              & for new_step_size &
#FILE fcontv2.work;                                     & for rebuild &
#FILE factive.work;
#FILE factive2.work;                            & for active_function &
#FILE fstables.work;                               & for format_table &
#FILE fmenu.work;                                   & for hilight_... &
#FILE futil.work;
#FILE fcouple.work;                                 & for set_coupled &
#FILE cstin.work;
#FILE ftestset.work;                            & for device_reversed &

GLOBAL INTEGER source_points; & last number of points 8510 told source &

DOUBLE CONSTANT    points_fmt        := Z07000400;
```

```
SSTIMUL2.WORK.PD8510          THU, DEC 22, 1983, 11:00 AM     PAGE   2

#EJECT;
COMMENT                                        update_stimulus_step_size
*************************************************************************
*
*************************************************************************
;
PROCEDURE  update_stimulus_step_size;                             ENTRY;
   BEGIN & update_stimulus_step_size &
      INTEGER CONSTANT sn_string_size := 6;
      INTEGER number_of_points,
              prefix,
              postfix;
      BYTE    ARRAY    sn_string[-1 : sn_string_size];

      sn_string[ -1 ]  := sn_string_size;
      sn_string[ 0 ]   := 0;           & initialize to empty (0 length) &

      number_of_points := 800 / step_size;
      IF source_points <> number_of_points THEN
         BEGIN & if &
            source_points := number_of_points;
            sn_string := append_string( format_double( source_points,
                                                       sn_string,
                                                       points_fmt
                                                     ),
                                        newline
                                      );
         END;  & if &
&     ELSE leave sn_string empty &

      IF NOT coupled_ch( ch_start_frequency ) THEN   & all source fcns &
         BEGIN & if &                                & are uncoupled   &
            break_entry_control( 3-current_entry_ch ); & and both ch's &
            wrt_priv_ib_source( sn, sn_string );       & need changing &
            break_entry_control( current_entry_ch );
         END;  & if &
      wrt_priv_ib_source( sn, sn_string );
      wrt_priv_ib_source( clr_fun, "" );

   END;  & update_stimulus_step_size &
```

```
SSTIMUL2.WORK.PD8510          THU, DEC 22, 1983, 11:00 AM     PAGE   3

#EJECT;
COMMENT                                                   swept_stimulus
*************************************************************************
*
*************************************************************************
;
SUBROUTINE swept_stimulus;
   BEGIN & swept_stimulus &
      IF sweep_mode <> swept THEN
         BEGIN & if &
            select_active_off( active_cw );
            IF NOT coupled_ch(ch_start_frequency) THEN &all source fcns&
               BEGIN & if &          & are uncoupled and need changing &
                  break_entry_control( 3 - current_entry_ch );
                  IF sweep_mode = single_pt THEN
                     wrt_priv_ib_source( fa, newline );
                  wrt_priv_ib_source( s1, newline );
                  break_entry_control( current_entry_ch );
               END;  & if &
            IF sweep_mode = single_pt THEN
               BEGIN & if &
                  wrt_priv_ib_source( fa, newline );
                  rebuild := TRUE;             & remove array processing &
                  annotate_stimulus;
               END;  & if &
            wrt_priv_ib_source( s1, newline );
            wrt_priv_ib_source( clr_fun, "" );
            sweep_mode := swept;
         END;  & if &
   END;  & swept_stimulus &
```

```
SSTIMUL2.WORK.PD8510          THU, DEC 22, 1983, 11:00 AM     PAGE   4

#EJECT;
COMMENT                                                   stepped_stimulus
***************************************************************************
*
***************************************************************************
;
SUBROUTINE stepped_stimulus;
   BEGIN & stepped_stimulus &
      IF sweep_mode <> stepped THEN
         BEGIN & if &
            select_active_off( active_cw );
            IF NOT coupled_ch(ch_start_frequency) THEN &all source fcns&
               BEGIN & if &          & are uncoupled and need changing &
                  break_entry_control( 3 - current_entry_ch );
                  IF sweep_mode = single_pt THEN
                     wrt_priv_ib_source( fa, newline );
                  break_entry_control( current_entry_ch );
               END;  & if &
            IF sweep_mode = single_pt THEN
               BEGIN & if &
                  wrt_priv_ib_source( fa, newline );
                  rebuild := TRUE;            & remove array processing &
                  annotate_stimulus;
               END;  & if &
            sweep_mode := stepped;
            update_stimulus_step_size;  & puts source in stepped sweep &
         END;  & if &
   END;  & stepped_stimulus &
```

```
SSTIMUL2.WORK.PD8510          THU, DEC 22, 1983, 11:00 AM     PAGE   5

#EJECT;
COMMENT                                                            cw_mode
***************************************************************************
*
* EXTERNAL SPECIFICATION FOR cw_mode
*
* FUNCTION: Aborts any active "sweep", sets sweep mode to cw, and
*           resumes activity.
*
* PARAMETER DESCRIPTION:
*
*    INPUT:  none
*
*    OUTPUT: none
*
***************************************************************************
*
* LOGIC INFORMATION FOR cw_mode
*
* INTIAL REFINEMENT:
*
*    abort_sweep
*    IF source functions are uncoupled THEN
*       swap source foreground and background
*       set stimulus to cw mode
*       swap source foreground and background, returning to original
*    set stimulus to cw mode
*    restart_sweep
*
***************************************************************************
;
PROCEDURE  cw_mode;
   BEGIN & cw_mode &
      INTEGER CONSTANT cw_string_size := 32;
      BYTE ARRAY cw_array[-1:cw_string_size];
      ALPHA      cw_string;

      IF sweep_mode <> single_pt THEN
         BEGIN & if &

            IF ( (active_function >= active_start) AND
                 (active_function <= active_span)
               ) THEN
               select_active_function( active_cw );

            abort_sweep;

            cw_string := ADRS(cw_array);
            cw_string := init_string(cw_string, cw_string_size);

            sweep_mode := single_pt;

            IF NOT coupled_ch(ch_start_frequency) THEN &all source fcns&
               BEGIN & if &          & are uncoupled and need changing &
                  break_entry_control( 3 - current_entry_ch );
                  wrt_priv_ib_source(
```

```
SSTIMUL2.WORK.PD8510          THU, DEC 22, 1983, 11:00 AM     PAGE   6

                        cw,
                        append_ch(
                           format_quad(
                              ch_quad( ch_center_frequency,
                                       3 - current_entry_ch
                                     ),
                              cw_string,
                              format_table[frequency_format]
                                     ),
                           newline
                              )
                           );
                  break_entry_control( current_entry_ch );
               END;  & if &
            wrt_priv_ib_source(
                     cw,
                     append_ch( format_quad(
                              ch_quad( ch_center_frequency,
                                       current_entry_ch
                                     ),
                              cw_string,
                              format_table[frequency_format]
                                     ),
                           newline
                         )
                      );

            rebuild := TRUE;              & set up for array processing &
            annotate_stimulus;
            restart_sweep;

         END;  & if &

   END;  & cw_mode &
```

```
SSTIMUL2.WORK.PD8510          THU, DEC 22, 1983, 11:00 AM     PAGE   7

#EJECT;
COMMENT                                                         swept_mode
***************************************************************************
*
* EXTERNAL SPECIFICATION FOR swept_mode
*
* FUNCTION: Aborts any active sweep, sets sweep mode to swept, and.
*           resumes sweep activity.
*
* PARAMETER DESCRIPTION:
*
*    INPUT:  none
*
*    OUTPUT: none
*
***************************************************************************
*
* LOGIC INFORMATION FOR swept_mode
*
* INTIAL REFINEMENT:
*
*    abort_sweep
*    set stimulus to swept mode
*    restart_sweep
*
***************************************************************************
;
SUBROUTINE swept_mode;
   BEGIN & swept_mode &
      abort_sweep;
      swept_stimulus;
      restart_sweep;
   END;  & swept_mode &
```

```
SSTIMUL2.WORK.PD8510            THU, DEC 22, 1983, 11:00 AM     PAGE   8

#EJECT;
COMMENT                                                         stepped_mode
****************************************************************************
*
* EXTERNAL SPECIFICATION FOR stepped_mode
*
* FUNCTION: Aborts any active sweep, sets sweep mode to stepped, and.
*           resumes sweep activity.
*
* PARAMETER DESCRIPTION:
*
*    INPUT:  none
*
*    OUTPUT: none
*
****************************************************************************
*
* LOGIC INFORMATION FOR stepped_mode
*
* INTIAL REFINEMENT:
*
*    abort_sweep
*    set stimulus to stepped mode
*    restart_sweep
*
****************************************************************************
;
SUBROUTINE stepped_mode;
   BEGIN & stepped_mode &
      abort_sweep;
      stepped_stimulus;
      restart_sweep;
   END;  & stepped_mode &
```

```
SSTIMUL2.WORK.PD8510            THU, DEC 22, 1983, 11:00 AM     PAGE   9

#EJECT;
COMMENT                                          set_soupled_stimulus_status
****************************************************************************
*
****************************************************************************
;
PROCEDURE  set_coupled_stimulus_status( state );
   VALUE   state;
   BOOLEAN state;
   BEGIN & set_coupled_stimulus_status &
      abort_sweep;

      set_coupled_status( state, couple_source );
      IF ( ch_integer(ch_domain,1) = ch_integer(ch_domain,2) ) THEN
         set_coupled_status( state, couple_stimulus );

      rebuild := TRUE;
      annotate_stimulus;
      restart_sweep;
   END;  & set_coupled_stimulus_status &


#FILE fstim.work;

END$
```

```
FSTIMUL3.WORK.PD8510            THU, DEC 22, 1983, 11:00 AM     PAGE   1

PROCEDURE  annotate_stimulus;                                  EXTERNAL;
```

```
SSTIMUL3.WORK.PD8510            THU, DEC 22, 1983, 11:00 AM     PAGE   1

M68KL,P,"stim3"
BEGIN

#FILE fstring.work;                               & for append_string &
#FILE fdisplay.work;
#FILE fscreen.work;
#FILE cchtable.work;
#FILE fchtable.work;                            & for current_entry_ch &
#FILE fchtab2.work;
#FILE fchtab3.work;                                  & for coupled_ch &
#FILE fchdata.work;                                  & for sweep_mode &
#FILE ffmt.work;
#FILE cdatap.work;                                   & for ...._domain &
#FILE cstimuli.work;                            & for start_stop, etc. &
#FILE ccontvar.work;

DOUBLE CONSTANT    freq_annot_fmt := %27300F09,
                   aux_annot_fmt  := %16000FF3,
                   time_annot_fmt := %16000FF6;
```

```
SSTIMUL3.WORK.PD8510          THU, DEC 22, 1983, 11:00 AM     PAGE   2

$EJECT;
COMMENT                                                   annotate_stimulus
***********************************************************************
*
***********************************************************************
;
PROCEDURE  annotate_stimulus;                                       ENTRY;
   BEGIN & annotate_stimulus &
      BYTE     ARRAY    string[ -1 : stim_size ];
      DOUBLE   annot_fmt;
      INTEGER dg_addr;
      INTEGER start_node_display,
              stop_node_display,
              start_display,
              stop_display,
              stop_suffix_display;
      INTEGER ch,
              first_ch,
              last_ch,
              domain;

      string[-1] := stim_size;

      & make this table driven &                                & DEBUG &
      IF coupled_ch(ch_start_stimulus) THEN
         BEGIN & if &
            first_ch := last_ch := current_emtry_ch;
            IF first_ch = 1 THEN
               BEGIN & if &
                  dg_addr := movech2(start1_node_position,
                                     start_row,
                                     start_col
                                    );
                  dg_addr := movech2(stop1_node_position,
                                     stop_row,
                                     stop_col
                                    );
                  dg_addr := jmp(start2_node_position,
                                 start2_suffix_display+stim_suffix_size
                                );
                  dg_addr := jmp(stop2_node_position,
                                 stop2_suffix_display+stim_suffix_size
                                );
               END   & if &
            ELSE
               BEGIN & else &
                  dg_addr := movech2(start2_node_position,
                                     start_row,
                                     start_col
                                    );
                  dg_addr := movech2(stop2_node_position,
                                     stop_row,
                                     stop_col
                                    );
                  dg_addr := jmp(start1_mode_position,
                                 start1_suffix_display+stim_suffix_size
```

```
SSTIMUL3.WORK.PD8510          THU, DEC 22, 1983, 11:00 AM     PAGE   3

                                );
                  dg_addr := jmp(stop1_node_position,
                                 stop1_suffix_display+stim_suffix_size
                                );
               END;  & else &
         END   & if &
      ELSE
         BEGIN & else &
            first_ch := 1;
            last_ch := 2;
            dg_addr := movech2(start1_node_position,
                               start_row,
                               start1_col
                              );
            dg_addr := movech2(stop1_node_position,stop_row,stop1_col);
            dg_addr := movech2(start2_node_position,
                               start_row,
                               start2_col
                              );
            dg_addr := movech2(stop2_node_position,stop_row,stop2_col);
         END;  & else &

      FOR ch := first_ch TO last_ch DO
         BEGIN & for &
            domain := ch_integer(ch_domain, ch);
            IF domain = freq_domain THEN
               annot_fmt := freq_annot_fmt
            ELSE IF domain = aux_domain THEN
               annot_fmt := aux_annot_fmt
            ELSE & domain = time_domain or tdr_domain &
               annot_fmt := time_annot_fmt;

            IF ch = 1 THEN
               BEGIN & if &
                  start_node_display   := start1_node_display;
                  stop_node_display    := stop1_node_display;
                  start_display        := start1_display;
                  stop_display         := stop1_display;
                  stop_suffix_display  := stop1_suffix_display;
               END   & if &
            ELSE &  = 2 &
               BEGIN & else &
                  start_node_display   := start2_node_display;
                  stop_node_display    := stop2_node_display;
                  start_display        := start2_display;
                  stop_display         := stop2_display;
                  stop_suffix_display  := stop2_suffix_display;
               END;  & else &

            IF ( (sweep_mode = single_pt) AND
                 (domain <> time_domain)  AND
                 (domain <> tdr_domain)
               ) THEN
               BEGIN & if single_pt &
                  print_string( " C.W.",
                                stim_node_size,
```

```
SSTIMUL3.WORK.PD8510          THU, DEC 22, 1983, 11:00 AM     PAGE   4

                                start_node_display
                              );
                  jmp( stop_node_display,
                       stop_suffix_display + stim_suffix_size
                     );
                  print_string( format_quad( ch_quad(ch_center_stimulus,
                                                     ch
                                                    ),
                                             string,
                                             annot_fmt
                                           ),
                                stim_size,
                                start_display
                              );
                  print_string( "", stim_size, stop_display );
               END   & if single_pt &
            ELSE IF ch_integer( ch_stimulus_mode, ch ) = start_stop THEN
               BEGIN & else if start_stop &
                  print_string( "START ",
                                stim_node_size,
                                start_node_display
                              );
                  print_string( "STOP  ",
                                stim_node_size,
                                stop_node_display
                              );
                  print_string( format_quad( ch_quad( ch_start_stimulus,
                                                      ch
                                                    ),
                                             string,
                                             annot_fmt
                                           ),
                                stim_size,
                                start_display
                              );
                  print_string( format_quad( ch_quad( ch_stop_stimulus,
                                                      ch
                                                    ),
                                             string,
                                             annot_fmt
                                           ),
                                stim_size,
                                stop_display
                              );
               END   & else if start_stop &
            ELSE & center/span mode &
               BEGIN & else center_span &
                  print_string( "CENTER",
                                stim_node_size,
                                start_node_display
                              );
                  print_string( "SPAN  ",
                                stim_node_size,
                                stop_node_display
                              );
                  print_string( format_quad( ch_quad(ch_center_stimulus,
```

```
SSTIMUL3.WORK.PD8510          THU, DEC 22, 1983, 11:00 AM     PAGE   5

                                                      ch
                                                    ),
                                             string,
                                             annot_fmt
                                           ),
                                stim_size,
                                start_display
                              );
                  print_string( format_quad( ch_quad( ch_span_stimulus,
                                                      ch
                                                    ),
                                             string,
                                             annot_fmt
                                           ),
                                stim_size,
                                stop_display
                              );
               END;  & else center_span &
         END;  & for &

   END;  & annotate_stimulus &

END$
```

```
CSTIMULI.WORK.PD8510            THU, DEC 22, 1983, 11:00 AM     PAGE   1

INTEGER CONSTANT  center_span      := 0,              & stimulus mode &
                  start_stop       := 1,
                  no_stimulus_mode := -1;
INTEGER CONSTANT  power_slope_off  := 0,              & power slope mode &
                  power_slope_on   := 1;  &
```

```
FSTIMULI.WORK.PD8510            THU, DEC 22, 1983, 11:00 AM     PAGE   1

#FILE cstimuli.work;

PROCEDURE  set_stimulus_mode( new_stimulus_mode );
   VALUE   new_stimulus_mode;                                   EXTERNAL;
   INTEGER new_stimulus_mode;                                   EXTERNAL;
PROCEDURE  update_start_stop_center_span;                       EXTERNAL;
PROCEDURE  update_start;                                        EXTERNAL;
PROCEDURE  update_center;
BOOLEAN PROCEDURE enter_frequency_n_time( string, effective_now );
   VALUE   string, effective_now;
   ALPHA   string;                                              EXTERNAL;
   BOOLEAN effective_now;
QUAD PROCEDURE frequency_at_point(point_number);
   VALUE   point_number;                                        EXTERNAL;
   INTEGER point_number;
QUAD PROCEDURE entry_frequency_at_point(point_number);
   VALUE   point_number;                                        EXTERNAL;
   INTEGER point_number;
QUAD PROCEDURE entry_stimulus_at_point(point_number);
   VALUE   point_number;                                        EXTERNAL;
   INTEGER point_number;
INTEGER PROCEDURE point_at_ch_stimulus(stimulus_value, ch);
   VALUE   stimulus_value, ch;
   INTEGER ch;                                                  EXTERNAL;
   QUAD    stimulus_value;
INTEGER PROCEDURE point_at_frequency(frequency_value);
   VALUE frequency_value;                                       EXTERNAL;
   QUAD  frequency_value;
BOOLEAN PROCEDURE  step_stimulus( stimulus_value );
   VALUE   stimulus_value;                                      EXTERNAL;
   INTEGER stimulus_value;                                      EXTERNAL;
PROCEDURE  set_aux_out;
PROCEDURE  urt_priv_ib_source_freq(start_frequency, stop_frequency);
   VALUE   start_frequency, stop_frequency;                     EXTERNAL;
   QUAD    start_frequency, stop_frequency;                     EXTERNAL;
PROCEDURE  init_source;                                         EXTERNAL;
SUBROUTINE preset_source;
```

```
SSTIMULI.WORK.PD8510            THU, DEC 22, 1983, 11:01 AM     PAGE   1

[illegible].P."stimuli"

      [illegible]debug.work;                        & for forced_step &
      [illegible]iocnfig.work;
[illegible] cchtable.work;
#FILE fchtable.work;
#FILE fchtab2.work;
#FILE fchtab3.work;
#FILE fprivib.work;
#FILE ffmt.work;
#FILE factive.work;
#FILE factive2.work;
#FILE facttbl.work;
#FILE fxadc.work;
#FILE fdatap1.work;                         & for active_function_rin &
#FILE crins.work;                                       & for release &
#FILE fkernel.work;                        & for conditional_acquire &
#FILE fkernel4.work;
#FILE cstimuli.work;                             & for source_points &
#FILE fstimul2.work;                         & for annotate_stimulus &
#FILE fstimul3.work;
#FILE fcmv9x.work;                                & for group_number &
#FILE fcontrol.work;          & for partial_new_step_size and constants &
#FILE fcontvar.work;                               & for step_source &
#FILE fbreak.work;                                   & for append_ch &
#FILE fstring.work;                                    & for newline &
#FILE cchars.work;                                   & for step_size &
#FILE fchdata.work;                          & for update_domain_vars &
#FILE fdomain.work;

INTEGER aux_out_dac = botton + %2E;

DOUBLE CONSTANT   power_fmt        := %0004000F,
                  frequency_fmt    := %0000000F;
DOUBLE &CONSTANT& sweep_time_fmt   =  power_fmt; & trick the compiler &
                                                 & dont make 2 copies &

BOOLEAN source_initialized;
QUAD    temp;

BOOLEAN postponed_values;
INTEGER postponed_entry_ch,
        postponed_domain;
QUAD    postponed_start,
        postponed_center;
REAL    postponed_sweep_time;
```

```
SSTIMULI.WORK.PD8510            THU, DEC 22, 1983, 11:01 AM     PAGE   2

#EJECT;
COMMENT                                               set_stimulus_mode
************************************************************************
*
************************************************************************
;
PROCEDURE  set_stimulus_mode( new_stimulus_mode );
   VALUE   new_stimulus_mode;                                    ENTRY;
   INTEGER new_stimulus_mode;
   BEGIN & set_stimulus_mode &
      IF new_stimulus_mode <> entry_ch_integer(ch_stimulus_mode) THEN
         BEGIN & if &
            set_entry_ch_integer( new_stimulus_mode, ch_stimulus_mode );
            annotate_stimulus;
         END;  & if &
   END;  & set_stimulus_mode &
```

```
#EJECT;
COMMENT                                        update_start_stop_center_span
**********************************************************************
*
* EXTERNAL SPECIFICATION FOR update_start_stop_center_span
*
* FUNCTION:
*    To compute the stimulus stop and span values from the start and
* center values of the currently active domain, and store those values
* into the entry channel table along with the start and center as
* stimulus values -- e.g. ch_start_stimulus.
*
* DECLARATION INFORMATION:
*    INPUT:  none
*
*    OUTPUT:  none
*
* EXTERNAL EFFECTS:
*    none.
*
**********************************************************************
*
* LOGIC INFORMATION FOR update_start_stop_center_span
*
* PROCEDURES CALLED:
*
* INITIAL REFINEMENT:
*
*    stop := center + center - start.
*    span := stop - start.
*
**********************************************************************
;
PROCEDURE  update_sscs_ch( ch, domain );
   VALUE   ch, domain;
   INTEGER ch, domain;
   BEGIN & update_sscs_ch &
      INTEGER ch_start,
              ch_center;
      QUAD    start,
              stop,
              center,
              span;

      CASE domain OF
         BEGIN & case &
& freq_domain &    BEGIN & freq_domain &
                      ch_start  := ch_start_frequency;
                      ch_center := ch_center_frequency;
                   END;  & freq_domain &
& time_domain &    BEGIN & band_pass time_domain &
& band_pass   &       ch_start  := ch_start_time;
                      ch_center := ch_center_time;
                      update_domain_vars;
                   END;  & band_pass time_domain &
& time_domain &    BEGIN & low_pass time_domain &
```

```
& low_pass    &       ch_start  := ch_start_time;
                      ch_center := ch_center_time;
                      update_domain_vars;
                   END;  & low_pass time_domain &
& aux_domain  &    BEGIN & aux_domain &
                      ch_start  := ch_start_aux_out;
                      ch_center := ch_center_aux_out;
                   END;  & aux_domain &
         END;  & case &

      start  := ch_quad( ch_start, ch );
      center := ch_quad( ch_center, ch );

      set_ch_quad( start,  ch_start_stimulus,  ch );
      set_ch_quad( center, ch_center_stimulus, ch );

      stop   := center + center - start;
      span   := stop - start;

      set_ch_quad( stop, ch_stop_stimulus, ch );
      set_ch_quad( span, ch_span_stimulus, ch );

      annotate_stimulus;

      set_active_limits( start, stop, active_marker1 ); & same all mkrs&

   END;  & update_sscs_ch &


SUBROUTINE update_start_stop_center_span;                          ENTRY;
   BEGIN & update_start_stop_center_span &
      update_sscs_ch( current_entry_ch, entry_ch_integer(ch_domain) );
   END;  & update_start_stop_center_span &
```

```
#EJECT;
COMMENT                                                    update_start
**********************************************************************
*
*  Updates ch_start_<domain> based on ch_center_stimulus and
*  ch_span_stimulus.  Useful for new center or span values.
*
*  start, stop, center, and span ch_...._stimulus values are then
*  updated from the ch_start_<domain> and ch_center_<domain> value, so
*  the value of ch_center_<domain> must be valid before calling this
*  routine.
*
**********************************************************************
;
PROCEDURE  update_start;                                        ENTRY;
   BEGIN & update_start &
      set_entry_ch_quad( ( entry_ch_quad(ch_center_stimulus) -
                             entry_ch_quad(ch_span_stimulus)/2
                         ),
                         get_active( get_chtable_index, active_start )
                       );
      update_start_stop_center_span;
   END;  & update_start &
```

```
#EJECT;
COMMENT                                                   update_center
**********************************************************************
*
*  Updates ch_center_<domain> based on ch_start_stimulus and
*  ch_stop_stimulus.  Useful for new start or stop values.
*
*  start, stop, center, and span ch_...._stimulus values are then
*  updated from the ch_start_<domain> and ch_center_<domain> value, so
*  the value of ch_start_<domain> must be valid before calling this
*  routine.
*
**********************************************************************
;
PROCEDURE  update_center;                                       ENTRY;
   BEGIN & update_center &
      set_entry_ch_quad( ( entry_ch_quad(ch_start_stimulus) +
                             entry_ch_quad(ch_stop_stimulus)
                         ) / 2,
                         get_active( get_chtable_index, active_center )
                       );
      update_start_stop_center_span;
   END;  & update_center &
```

```
#EJECT;
COMMENT                                                    enter_frequency_n_time
************************************************************************
*
* EXERNAL SPECIFICATION FOR enter_frequency_m_time
*
* FUNCTION:
*    To enter the values of start frequency, center frequency, and
* sweep time returned from the source as the result of a new entry
* for one of the three.  Processes the string received from a source
* in response to the "OC" request.
*
* DECLARATION INFORMATION:
*    INPUT:  string       The ASCII string returned from the source in
*                         the form NR "," NR "," NR <cr> <lf>, where
*                         NR refers to the numeric data type defined in
*                         the HP-IB code and format conventions P728, and
*                         <cr> and <lf> refer to the ASCII characters.
*
*    OUTPUT:  none
*
* EXTERNAL EFFECTS:
*    Changes the internal values maintained for the source for the
* entry channel.
*
************************************************************************
*
* LOGIC INFORMATION FOR enter_frequency_n_time
*
* PROCEDURES CALLED:
*    CNV9A
*    CNV92
*
* INITIAL REFINEMENT:
*
*    initialize temporary string.
*
*    copy first (start frequency) value into temporary string.
*    convert temporary string to a quad integer.
*    store the quad integer value into the entry channel's table.
*
*    copy second (stop frequency) value into temporary string.
*    convert temporary string to a quad integer.
*    store the quad integer value into the entry channel's table.
*
*    copy third (sweep time) value into temporary string.
*    convert temporary string to a integer.
*    store the integer value into the entry channel's table.
*
*    update the start, stop, center, and span values in the channel
*          table.
*
************************************************************************
;
BOOLEAN PROCEDURE enter_frequency_n_time( string, effective_now );
   VALUE   string, effective_now;
```

```
   ALPHA   string;
   BOOLEAN effective_now;                                          ENTRY;
   BEGIN & enter_frequency_n_time &
      INTEGER index;
      QUAD    half_span;

      IF ( effective_now          AND
           postponed_values       AND
           (postponed_entry_ch <> current_entry_ch)
         ) THEN
         BEGIN & if &
            set_ch_quad( postponed_start,
                         ch_start_frequency,
                         postponed_entry_ch
                       );
            set_ch_quad( postponed_center,
                         ch_center_frequency,
                         postponed_entry_ch
                       );
            set_ch_real( postponed_sweep_time,
                         ch_sweep_time,
                         postponed_entry_ch
                       );
            update_sacs_ch( postponed_entry_ch, postponed_domain );
            postponed_values := FALSE;
            enter_frequency_n_time := TRUE;
         END   & if &
      ELSE
         enter_frequency_n_time := FALSE;

      index := 1;
      postponed_start      := CNV9A( string, index );
      postponed_center     := CNV9A( string, index );
      postponed_sweep_time := CNV92( string, index );

      IF sweep_mode = single_pt THEN
         BEGIN & if &
            read_priv_ib( source, no_fun, "OPCW", string );
            index := 1;
            postponed_center := CNV9A( string, index );
         END;  & if &

      IF effective_now THEN
         BEGIN & if &
            set_entry_ch_quad( postponed_start,
                               ch_start_frequency
                             );
            set_entry_ch_quad( postponed_center,
                               ch_center_frequency
                             );
            set_entry_ch_real( postponed_sweep_time,
                               ch_sweep_time
                             );

            IF entry_ch_integer(ch_domain) = freq_domain THEN
               BEGIN & if &
```

```
                  update_start_stop_center_span;
                  IF conditional_acquire( active_function_rin ) THEN
                     BEGIN & if &   & making sure it's available first &
                        release( active_function_rin );
                        select_active_function(active_previous);
                     END;  & if &
                  control_data_proc_freq(1);          & temp until can  &
                  control_data_proc_freq(2);          & handle coupling &
               END;  & if &

            group_number := 0;        & used to restart avaraging factor &
         END   & if &
      ELSE
         BEGIN & else &
            postponed_values    := TRUE;
            postponed_entry_ch := current_entry_ch;
            postponed_domain   := entry_ch_integer( ch_domain );
         END;  & else &

   END;  & enter_frequency_n_time &
```

```
#EJECT;
COMMENT                                                      frequency_at_point
************************************************************************
*
* EXTERNAL SPECIFICATION FOR frequency_at_point
*
* FUNCTION
*    Computes and returns a quad stimulus value, given a point number,
* based on the acquisition channel and its stimulus range.  The function
* inplemented is
* point_number < start,frequency_at_point(point_number)
*                          = start frequency
* point_number < stop, frequency_at_point(point_number)
*                          = stop frequency
* otherwise,          frequency_at_point(point_number) = start_stimulus
*                          + (frequency span)*(point_number/span)
*
* PARAMETER DESCRIPTION:
*
*    INPUT:  point_number          start <= point_number <= stop
*
*    OUTPUT: frequency_at_point    the corresponding stimulus value
*
* USAGE:
*    stimulus := frequency_at_point(this_point)
*
* EXTERNAL EFFECTS:
*
* COMMENTS:
*
************************************************************************
*
* LOGIC INFORMATION FOR frequency_at_point
*
* INITIAL REFINEMENT:
*
************************************************************************
;
QUAD PROCEDURE frequency_at_point(point_number);
   VALUE   point_number;
   INTEGER point_number;                                           ENTRY;
   BEGIN & frequency_at_point &
      QUAD start_frq,
           center_frq,
           half_span;

      IF sweep_mode = single_pt THEN
         frequency_at_point := acquisition_ch_quad(ch_center_frequency)
      ELSE
         BEGIN & sweep_mode <> single_pt &
            start_frq  := acquisition_ch_quad(ch_start_frequency);
            center_frq := acquisition_ch_quad(ch_center_frequency);

            IF point_number <= start THEN
               frequency_at_point := start_frq
            ELSE IF point_number >= stop THEN
```

```
SSTIMULI.WORK.PD8510            THU, DEC 22, 1983, 11:01 AM     PAGE  11

               BEGIN & else if &
                  frequency_at_point :=
                                    center_frq + center_frq - start_frq;
               END   & else if &
             ELSE
               BEGIN & else &
                  half_span := center_frq - start_frq;
                  frequency_at_point := start_frq +
                                       ( (half_span + half_span)
                                         * point_number
                                         + center
                                       ) / span;
                                         & "center" is for rounding &
               END;  & else &
           END;  & sweep_mode <> single_pt &

   END;  & frequency_at_point &


QUAD PROCEDURE entry_value_at_point(point_number, ch_start, ch_center);
   VALUE   point_number, ch_start, ch_center;
   INTEGER point_number, ch_start, ch_center;
   BEGIN & entry_value_at_point &
     QUAD start_value,
          center_value,
          half_span;

     start_value  := entry_ch_quad(ch_start);
     center_value := entry_ch_quad(ch_center);

     IF point_number <= start THEN
        entry_value_at_point := start_value
     ELSE IF point_number >= stop THEN
        BEGIN & else if &
           entry_value_at_point :=
                          center_value + center_value - start_value;
        END   & else if &
     ELSE
        BEGIN & else &
           half_span := center_value - start_value;
           entry_value_at_point := start_value +
                                  ( (half_span + half_span)
                                    * point_number
                                    + center
                                  ) / span;
                                    & "center" is for rounding &
        END;  & else &

   END;  & entry_value_at_point &


QUAD PROCEDURE entry_frequency_at_point(point_number);
   VALUE   point_number;
   INTEGER point_number;                                        ENTRY;
```

```
SSTIMULI.WORK.PD8510            THU, DEC 22, 1983, 11:01 AM     PAGE  12

   BEGIN & entry_frequency_at_point &

      IF sweep_mode = single_pt THEN
         point_number := center;

      entry_frequency_at_point := entry_value_at_point(
                                               point_number,
                                               ch_start_frequency,
                                               ch_center_frequency
                                               );

   END;  & entry_frequency_at_point &


QUAD PROCEDURE entry_stimulus_at_point(point_number);
   VALUE   point_number;
   INTEGER point_number;                                        ENTRY;
   BEGIN & entry_stimulus_at_point &

      IF sweep_mode = single_pt THEN
         point_number := center;

      entry_stimulus_at_point := entry_value_at_point(
                                               point_number,
                                               ch_start_stimulus,
                                               ch_center_stimulus
                                               );

   END;  & entry_stimulus_at_point &
```

```
SSTIMULI.WORK.PD8510            THU, DEC 22, 1983, 11:01 AM     PAGE  13

#EJECT;
COMMENT                                            point_at_frequency
**********************************************************************
*
* EXTERNAL SPECIFICATION FOR point_at_frequency
*
* FUNCTION
*    Computes and returns point number corresponding to the given
* frequency, based on the acquisition channel and its frequency range.
* The frequency is rounded to the nearest point number, not truncated.
*
* PARAMETER DESCRIPTION:
*
*    INPUT:  frequency            start <= frequency <= stop
*
*    OUTPUT: point_at_frequency    the corresponding point
*
* USAGE:
*    this_point := point_at_frequency(this_frequency_value)
*
* EXTERNAL EFFECTS:
*
* COMMENTS:
*
**********************************************************************
*
* LOGIC INFORMATION FOR point_at_frequency
*
* INTIAL REFINEMENT:
*
* get start and center frequencies.
* IF frequency_value <= start frequency THEN
*    return point number 0
* ELSE IF frequency_value >= stop frequency THEN
*    return point number 800
* ELSE
*              800*(frequency-start) + span/2[for rounding]
*    return    ---------------------------------------------
*                       span
*
**********************************************************************
;
INTEGER PROCEDURE point_at_ch_value(value, ch, ch_start, ch_center);
   VALUE   value, ch, ch_start, ch_center;
   INTEGER ch, ch_start, ch_center;
   QUAD    value;
   BEGIN & point_at_ch_value &
     QUAD start_frq,
          center_frq,
          half_span;

     start_frq  := ch_quad(ch_start, ch);
     center_frq := ch_quad(ch_center, ch);

     IF start_frq = center_frq THEN        & single_pt is handled by &
        point_at_ch_value := stop          & pt_at_ch_stimulus below &
```

```
SSTIMULI.WORK.PD8510            THU, DEC 22, 1983, 11:01 AM     PAGE  14

      ELSE                                       & "stop" is next lock pt. &
         BEGIN & start_frq <> center_frq &

            IF value <= start_frq THEN
               point_at_ch_value := 0
            ELSE IF value >= (center_frq + center_frq - start_frq)
                  THEN
               point_at_ch_value := stop
            ELSE
               BEGIN & else &
                  half_span := center_frq - start_frq;
                  point_at_ch_value := ( 800*(value-start_frq) +
                                        half_span
                                      ) / (half_span + half_span);
               END;  & else &
         END;  & start_frq <> center_frq &

   END;  & point_at_ch_value &


INTEGER PROCEDURE point_at_ch_stimulus(stimulus_value, ch);
   VALUE   stimulus_value, ch;
   INTEGER ch;
   QUAD    stimulus_value;                                      ENTRY;
   BEGIN & point_at_ch_stimulus &

      IF sweep_mode = single_pt THEN
         point_at_ch_stimulus := center
      ELSE
         point_at_ch_stimulus := point_at_ch_value( stimulus_value,
                                               ch,
                                               ch_start_stimulus,
                                               ch_center_stimulus
                                             );

   END;  & point_at_ch_stimulus &


INTEGER PROCEDURE point_at_frequency(frequency_value);
   VALUE frequency_value;
   QUAD  frequency_value;                                       ENTRY;
   BEGIN & point_at_frequency &

      point_at_frequency := point_at_ch_value( frequency_value,
                                          current_acquisition_ch,
                                          ch_start_frequency,
                                          ch_center_frequency
                                        );

   END;  & point_at_frequency &
```

```
SSTIMULI.WORK.PD8510          THU, DEC 22, 1983, 11:01 AM     PAGE  15

#EJECT;
COMMENT                                                      step_stimulus
************************************************************************
*
************************************************************************
;
BOOLEAN PROCEDURE  step_stimulus( stimulus_value );
   VALUE   stimulus_value;
   INTEGER stimulus_value;                                          ENTRY;
   BEGIN & step_stimulus &

COMMENT
      IF stimulus is frequency THEN;
      step_stimulus := step_source( stimulus_value );

COMMENT
      if stimulus is other that frequency, must call break_fifo check
      routine and return the boolean success value;

   END; & step_stimulus &
```

```
SSTIMULI.WORK.PD8510          THU, DEC 22, 1983, 11:01 AM     PAGE  16

#EJECT;
COMMENT                                                        set_aux_out
************************************************************************
*
************************************************************************
;
PROCEDURE  set_aux_out;                                             ENTRY;
   BEGIN & set_aux_out &
      INTEGER data;
      data := INTEGER( entry_ch_quad(ch_center_aux_out) );
      IF data < -2048 THEN
         data := -2048
      ELSE IF data > 2047 THEN
         data := 2047;
      aux_out_dac := data;
   END;  & set_aux_out &
```

```
SSTIMULI.WORK.PD8510          THU, DEC 22, 1983, 11:01 AM     PAGE  17

#EJECT;
COMMENT                                             wrt_priv_ib_source_freq
************************************************************************
*
*
************************************************************************
;
PROCEDURE  wrt_priv_ib_source_freq( start_frequency, stop_frequency );
   VALUE  start_frequency, stop_frequency  ;
   QUAD   start_frequency, stop_frequency  ;                        ENTRY;
   BEGIN
      INTEGER CONSTANT string_size := 23;
      BYTE    ARRAY    string[ -1 : string_size ];

      string[-1] := string_size;
      wrt_priv_ib_source(
                fa,
                append_ch( format_quad( start_frequency,
                                        string,
                                        frequency_fmt
                                      ),
                           newline
                         )
              );
      wrt_priv_ib_source(
                fb,
                append_ch( format_quad( stop_frequency,
                                        string,
                                        frequency_fmt
                                      ),
                           newline
                         )
              );
   END;  & wrt_priv_ib_source_freq &
```

```
SSTIMULI.WORK.PD8510          THU, DEC 22, 1983, 11:01 AM     PAGE  18

#EJECT;
COMMENT                                                        init_source
************************************************************************
*
*  This routine used to talk to the source in start/stop or center/span,
*  depending upon the stimulus_mode.
*
************************************************************************
;
PROCEDURE  init_source;                                             ENTRY;
   BEGIN & init_source &
      QUAD start_frequency,
           stop_frequency,
           center_frequency;
      INTEGER CONSTANT string_size := 23;
      BYTE    ARRAY    string[ -1 : string_size ];

      string[-1] := string_size;

      start_frequency  := entry_ch_quad( ch_start_frequency );
      center_frequency := entry_ch_quad( ch_center_frequency );
      stop_frequency   := center_frequency + center_frequency
                                           - start_frequency;

      wrt_priv_ib_source_freq( start_frequency, stop_frequency );

      wrt_priv_ib_source(
                st,
                append_ch( format_real( entry_ch_real(ch_sweep_time),
                                        string,
                                        sweep_time_fmt
                                      ),
                           newline
                         )
              );
      wrt_priv_ib_source(
                pl,
                append_ch(
                          format_real( entry_ch_real(ch_source_power),
                                       string,
                                       power_fmt
                                     ),
                          newline
                         )
              );
      IF entry_ch_integer(ch_power_slope_mode) = power_slope_off THEN
         wrt_priv_ib_source(  sl0, newline )
      ELSE & power slope on &
         wrt_priv_ib_source(
                   sl1,
                   append_ch( format_real(
                                 entry_ch_real(ch_power_slope),
                                 string,
                                 power_fmt
                                 ),
                              newline
```

```
SSTIMULI.WORK.PD8510          THU, DEC 22, 1983, 11:01 AM     PAGE  19

                    )
             );
   END;  & init_source &
```

```
SSTIMULI.WORK.PD8510          THU, DEC 22, 1983, 11:01 AM     PAGE  20

#EJECT;
COMMENT                                                                 init_ch_stimuli
*************************************************************************************
*
*************************************************************************************
;
SUBROUTINE init_ch_stimuli;                                                   ENTRY;
   BEGIN & init_ch_stimuli &

      IF NOT ( coupled_ch(ch_start_frequency) AND
               source_initialized
             ) THEN
         init_source;
&     ELSE coupled and initialized, so don't need to do it again.          &

      source_initialized := TRUE;

   END;  & init_ch_stimuli &
```

```
SSTIMULI.WORK.PD8510          THU, DEC 22, 1983, 11:01 AM     PAGE  21

#EJECT;
COMMENT                                                         preset_source
*************************************************************************************

   -*********************************************************************************

      INE preset_source;                                              ENTRY;
      N & preset_source &
      ir_priv_ib(source);                          & selective device clear &
      ource_points := 0;
      rt_priv_ib_source(  clr_fun, "IPNA1RM"+O+"CS" );
      urt_priv_ib_source(  display_off, " " );
   END;  & preset_source &
```

```
SSTIMULI.WORK.PD8510          THU, DEC 22, 1983, 11:01 AM     PAGE  22

#EJECT;
COMMENT                                                                 init_stimuli
*************************************************************************************
*
* EXTERNAL SPECIFICATION FOR init_stimuli
*
* FUNCTION
*    To initialize the channel-independent source functions.
*
* PARAMETER DESCRIPTION:
*
*    INPUT:  none
*
*    OUTPUT: none
*
* EXTERNAL EFFECTS:
*
* COMMENTS:
*
*************************************************************************************
*
* LOGIC INFORMATION FOR init_stimuli
*
* INTIAL REFINEMENT:
*
*************************************************************************************
;
SUBROUTINE init_stimuli;                                                      ENTRY;
   BEGIN & init_stimuli &

      source_initialized := FALSE;
      postponed_values := FALSE;

      clr_priv_ib(source);                              & selective device clear &
      IF NOT                                                           & DEBUG &
      wrt_priv_ib_source(clr_fun,"NA1RM"+O+"CSRM"+Z28)
         THEN forced_step := 1;                                        & DEBUG &

      source_points := 0;               & clear to force setting it below &
      partial_new_step_size( step_size );

   END;  & init_stimuli &

END$
```

```
RSTRING.WORK.PD8510          THU, DEC 22, 1983, 11:01 AM     PAGE   1

RSMB,R
  HED string functions
  NAM string,"WCC     PD8510  "
  ENT clear_string
  ENT init_string
  ENT append_ch
  ENT append_string
*
R0 REG 0    REGISTERS: M68KL - 4 FEB 1980
R1 REG 1
R2 REG 2
R3 REG 3
R4 REG 4
R5 REG 5
R6 REG 6
R7 REG 7
R8 REG 8
R9 REG 9
R10 REG 10
R11 REG 11
R12 REG 12
R13 REG 13
R14 REG 14
R15 REG 15
G REG 13
M REG 14
S REG 15
* The following string operators have been added instead of using those
* from M68K.UPSOFT.  These contain overflow checking, and use ALPHAs
* instead of BYTE ARRAYs for the parameters.  This allows the calling
* program to pass either an ALPHA or a BYTE ARRAY.  The 8510 is using
* a BYTE ARRAY with dimensions [-1:max_size] in order to include an
* array size value in addition to the string length.  One only needs
* to set the array size value once prior to any use.  It will not be
* modified by any of these routines.  It may be set by calling the
* "init_string" procedure, or by the statement
*               string[-1] := max_size;
* These 8510 strings behave normally when passed to a procedure
* expecting a normal ALPHA parameter (such as John's WSTR), but allow us
* to provide some additional protection in routines that write into the
* string or append characters or other strings to the string.
*
* It may be of interest to note that a literal "" does not result in a
* null (zero length) string, but rather is changed by the compiler into
* " ".  We will be defining a globally available null string that may
* be used if required, or an existing string may be set to a null string
* by the procedure "clear_string".
*
* These string operators utilize a "string" defined as follows:
*    BYTE ARRAY string[-1:max_size]
* where string[0] contains the lengthe of the current string contained
* in the array, and string[-1] contains the maximum length of the array
* -- string[-1] := max_size.  This array is passed as an ALPHA to the
* procedures below.  The string operators return the ALPHA to allow
* then to be used as parameters for other procedures, but the string
```

```
RSTRING.WORK.PD8510          THU, DEC 22, 1983, 11:01 AM     PAGE   2

* is modified in the original byte array regardless of whether the
* return value is used.
*
* ALPHA PROCEDURE clear_string(string);
*    VALUE string;
*    ALPHA string;                                            EXTERNAL;
*
* Clears the string, i.e. sets the length of the string to zero.
*
clear_string EQU *
  MOVE.L R0,R12
  CLR.B  (R12)          string[0] := 0;
  RTS
*
* ALPHA PROCEDURE init_string(string, max_length);
*    VALUE string, max_length;
*    ALPHA string;
*    BYTE  max_length;                                        EXTERNAL;
*
* Initializes the string array and clears the string, i.e. sets the
* size (string[-1]) of the array to max_length, and sets the length of
* the string to zero.
*
init_string EQU *
  MOVE.L R0,R12
  MOVE.B 5(S),-1(R12) string[-1] := max_size;  (second parameter)
  CLR.B  (R12)          string[0]  := 0;
  MOVE.L (S)+,R8        save return address temporarily
  ADDQ.L =D2,S          delete parameter
  JMP    (R8)           return
*
* ALPHA PROCEDURE append_ch(string,ch);
*    VALUE string, ch;
*    ALPHA string;
*    BYTE ch;                                                 EXTERNAL;
*
* Appends the character, ch, onto the end of the string.  If the string
* completely fills the available space, the last character of the string
* is overwritten with the character.  If the character is a backspace,
* the string length is reduced by one unless it is already zero.
*
* CAUTION:  Due to the effect of appending a backspace described above
* append_ch is not normally suitable for appending BINARY data.  It may
* be appropriate to use append_string, which does not check for
* the backspace character, or to use a different approach for appending
* binary data.
*
append_ch EQU *
  MOVE.L R0,R12         R12 := string (type ALPHA);
  MOVE.B 5(S),R7        R7  := ch;
  CMP.B  =D8,R7         IF ch = backspace
  BNE    NOTBS
  TST.B  (R12)             IF string[0] <= 0
  BLE    END1                 return;
  SUB.B  =D1,(R12)         ELSE string[0] := string[0] - 1;
  BRA    END1                 return;
```

```
RSTRING.WORK.PD8510          THU, DEC 22, 1983, 11:01 AM     PAGE   3

NOTBS: ADD.B =D1,(R12) ELSE string[0] := string[0] + 1;
  MOVE.B (R12),R7        R7 := string[0];
  CMP.B  -1(R12),R7      IF string[0] > string[-1]
  BLE    MOVE
  SUB.B  =D1,(R12)          string[0] := string[0] - 1;
  MOVE.B (R12),R7           R7 := string[0];
MOVE: EXTS   R7
  MOVE.B 5(S),0(R12,R7)  string[ string[0] ] := ch;
END1: MOVE.L (S)+,R8  save return address temporarily
  ADDQ.L =D2,S          delete parameter
  JMP    (R8)           return
*
* ALPHA PROCEDURE append_string(string, string2);
*    VALUE string, string2;
*    ALPHA string, string2;                                   EXTERNAL;
*
* Appends string2 onto the end of string.  If the result would exceed
* the space available for string, the trailing characters of string2
* are lost.  Unlike append_ch, backspace characters in either string
* have no effect.
*
* In general, register assignments are as follows:
*   R0 -> value parameter string (ALPHA)
*   R0 -> return value (ALPHA)
*   R1 -> count = number of characters in string2 to add to string.
*   R7 -> temporary accumulater for computing count (R1) and end of
*         string (R9).
*   R8 -> string (ALPHA)
*   R9 -> end of string (ALPHA), the place to add the next character.
*   R12-> string2 (ALPHA)
*
append_string EQU *
  MOVE.L 4(S),R12       R12 := string2 (type ALPHA)
  MOVE.B (R12),R1       R1 := count;    ( string2[0] )
  MOVE.L R0,R8          IF count > (string[-1] - string[0])
  MOVE.B -1(R8),R7
  SUB.B  (R8),R7
  CMP.B  R7,R1
  BLE    SHORT
  MOVE.B R7,R1             count := string[-1] - string[0];
SHORT: TST.B R1         IF count <= 0
  BLE    END2                return
  MOVE.B (R8),R7        ELSE
  ADD.B  R1,(R8)           string[0] := string[0] + count;
  ADD.B  =D1,R7            MOVE string[ string[0]+1 ] :=
  EXTS   R7                      string2[1], +(count);
  MOVE   R7,R9
  ADD.L  R0,R9
  LEA    1(R12),R12
  EXTS   R1
  BRA    SKIP
LOOP: MOVE.B (R12)+,(R9)+    { the actual move }
SKIP: DBRA R1,LOOP
END2: MOVE.L (S)+,R8  save return address temporarily
  ADDQ.L =D4,S          delete parameter
  JMP    (R8)           return
```

```
RSTRING.WORK.PD8510          THU, DEC 22, 1983, 11:01 AM     PAGE   4

*
  END
```

```
FSTRING.WORK.PD8510                 . DEC 22, 1983, 11:01 AM     PAGE   1

ALPHA PROCEDURE clear_string(string);
   VALUE   string;
   ALPHA   string;                                         EXTERNAL;
ALPHA PROCEDURE init_string(string, max_length);
   VALUE   string, max_length;
   ALPHA   string;
   BYTE    max_length;                                     EXTERNAL;
ALPHA PROCEDURE append_ch(string, ch);
   VALUE   string, ch;
   ALPHA   string;
   BYTE    ch;                                             EXTERNAL;
ALPHA PROCEDURE append_string(string1, string2);
   VALUE   string1, string2;
   ALPHA   string1, string2;                               EXTERNAL;
```

```
CSYSTEM.WORK.PD8510          THU, DEC 22, 1983, 11:01 AM     PAGE   1

INTEGER CONSTANT

cmd_title := 310,
cmd_hpib_info := 311,
cmd_crt_off := 312,
cmd_service_menu := 313,
cmd_erase_title := 317,
cmd_title_done := 318,
cmd_8510_addr := 319,
cmd_system_bus_addr := 320,
cmd_source_addr := 321,
cmd_test_set_addr := 322,
cmd_plotter_addr := 323,
cmd_printer_addr := 324,
cmd_auto_cmd_addr := 325,
cmd_pass_thru_addr := 326,
cmd_revision := 327,
cmd_privib_local := 328,
cmd_privib_remote := 329,
cmd_if_gain_menu := 330,
cmd_peek_poke_addr := 331,
cmd_peek := 332,
cmd_poke := 333,
cmd_test_menu := 334,
cmd_group10 := 0;
```

```
FSYSTEM.WORK.PD8510          THU, DEC 22, 1983, 11:01 AM     PAGE   1

COMMENT
  This is a software generated file !!!
  Changes must be made in SKINFO.WORK
  Run GENSK.LANI to re-generate file;

SUBROUTINE proc10;  ENTRY;
BEGIN

CASE command_token-310 OF
BEGIN
& 310 &
select_active_function( active_title );
& 311 &
BEGIN END;
& 312 &
warn(command_not_implemented);
& 313 &
BEGIN END;
& 314 &
enter_title_char( char_index );
& 315 &
enter_title_char( space_index );
& 316 &
enter_title_char( backspace_index );
& 317 &
erase_title;
& 318 &
BEGIN
   select_active_off( active_title );
   previous_menu;
END;
& 319 &
select_active_function( active_8510_hpib_addr );
& 320 &
select_active_function( active_system_bus_hpib_addr );
& 321 &
select_active_function( active_source_hpib_addr );
& 322 &
select_active_function( active_testset_hpib_addr );
& 323 &
select_active_function( active_plotter_hpib_addr );
& 324 &
select_active_function( active_printer_hpib_addr );
& 325 &
select_active_function( active_ch_cmd_hpib_addr );
& 326 &
select_active_function( active_pass_thru_hpib_addr );
& 327 &
select_active_function( active_revision );
& 328 &
BEGIN
   hilight_on( cmd_privib_local, cmd_privib_remote );
   abort_sweep;
   clr_rem_priv_ib;
   wrt_priv_ib_source(  display_on, " " );
```

```
FSYSTEM.WORK.PD8510          THU, DEC 22, 1983, 11:01 AM     PAGE   2

END;
& 329 &
BEGIN
   hilight_on( cmd_privib_local, cmd_privib_remote );
   abort_sweep;
COMMENT
   set_rem_priv_ib;
COMMENT
   wrt_priv_ib_source(  display_off, " " );
   reset_priv_ib_act_funs;
   restart_sweep;
END;
& 330 &
BEGIN END;
& 331 &
select_active_function( active_address );
& 332 &
select_active_function( active_peek );
& 333 &
select_active_function( active_poke );
& 334 &
BEGIN
   trap_15_type := service_trap;
   TRAP(15);
END;
END;
END proc10;
```

```
SSYSTEM.WORK.PD8510                THU, DEC 22, 1983, 11:01 AM     PAGE   1


M68KL,P,"system"

BEGIN

#FILE futil.work;                          &
#FILE csystem.work;
#FILE factive.work;                        & for select_active_function &
#FILE factive2.work;                          & for select_active_off &
#FILE fprivib.work;
#FILE fprivib2.work;
#FILE fcommand.work;                       & for command_token value &
#FILE fkernel.work;
#FILE crims.work;
#FILE fcontrol.work;                   & for abort_sweep and restart_sweep &
#FILE fmenu.work;
#FILE cdebug.work;                           & for trap_15_type, etc. &
#FILE ftitle.work;                 & for enter_title_char and title_done &


#FILE fsystem.work;

END$
```

```
FTABLE.WORK.PD8510                THU, DEC 22, 1983, 11:01 AM     PAGE   1


GLOBAL INTEGER TABLE log_table:=-32765,-31311,-29899,-28529,
 -27198,-25902,-24642,-23414, -22217,-21050,-19911,-18799,
 -17712,-16649,-15611,-14594, -13599,-12624,-11669,-10733,
  -9815, -8914, -8031, -7163,  -6312, -5475, -4653, -3845,
  -3050, -2269, -1500,  -744,    1;

GLOBAL INTEGER TABLE atn_table:=-32768,-32107,-31424,-30719,
 -29992,-29242,-28469,-27671, -26849,-26002,-25130,-24232,
 -23307,-22357,-21379,-20376, -19346,-18290,-17208,-16101,
 -14970,-13815,-12638,-11440, -10222, -8986, -7734, -6467,
 -5189, -3900, -2605, -1304, 0;
```

```
FTACO.WORK.PD8510                THU, DEC 22, 1983, 11:02 AM     PAGE   1


 SUBROUTINE TPINT;                                          EXTERNAL;
 INTEGER PROCEDURE TPST;                                    EXTERNAL;
 INTEGER SUBROUTINE TPErr;                                  EXTERNAL;
 BOOLEAN SUBROUTINE REW;                                    EXTERNAL;
 BOOLEAN PROCEDURE TPRED(Add,Len); VALUE Add; DOUBLE Add;
                            INTEGER Len;                    EXTERNAL;
 BOOLEAN PROCEDURE TPWRT(Add,Len); VALUE Add,Len; DOUBLE Add;
                            INTEGER Len;                    EXTERNAL;
 BOOLEAN SUBROUTINE TPmark;                                 EXTERNAL;
 BOOLEAN SUBROUTINE TPready;                                EXTERNAL;
 BOOLEAN PROCEDURE TPseek(pos); VALUE pos; INTEGER pos;     EXTERNAL;
 INTEGER SUBROUTINE TPrecord;                               EXTERNAL;
```

```
STACO.WORK.PD8510                THU, DEC 22, 1983, 11:02 AM     PAGE   1

COMMENT
*********************  FILE: TACO.JTB.PD8510  **********************
*
*               Cartridge Tape Drive (TACO) Module
*
********************************************************************
*
*        Sept 25 1981                          VERISION A03.01.01
*         JOHN BARR
*
*
*             MODIFIED FOR A68K BOARD System
********************************************************************
*
*  ENTRY POINTS
*
*
*
*
* The tape on the 8510 front panel uses the DC-100 tape cardridge. The
*      cardridge can hold 105-140K Words of information depending on
*      format and updatability (of individual records). The tape will
*      be used to store internal program (probaby requiring 50% of a
*      tape), user stored calibration coefficients, and save/recall
*      states. In addition, it is intended to load service routines via
*      the tape.
*
*    SPECS
*      FORMAT:
*             SIF - Standard Interchage Format -- See Jan/10/78 Memo
*                   SIF is a file/record structure on the tape - It
*                   makes no mention of the data (type or structure).
*                   Data encoding is done on space seperation of flux
*                   reversal (a 'one' is 1.75 longer than a 'zero').
*                   A file consist of FILE MARK followed by 'n'
*                   RECORDS. There can be 2047 files of 4096 records,
*                   if tape capacity allows.
*                   A FILE MARK is a data record plus file gap. Its
*                   data record can contain information but may be
*                   null (sometimes it is called RECORD 0).
*                   RECORDS are a data record plus a record gap,
*                   numbered 1 to n for each file.
*                   A data record consist of a header plus max of
*                   128 words of data plus trailer. Each header
*                   contains the file#, record#, # of bytes contain
*                   in the body, if updatable, and apporoiate check-
*                   sums.
*                   Updatability means that a record may be rewritten
*                   independently of the other records, i.e. there
*                   was enought space allocated orginal for the worst
*                   case record.
*                   NOTE:End-of-file is signal by existence of end of
*                   tape or start of another file.
*
*
*
*                   SIF Tapes can be used with the 9845/35, 9875
```

STACO.WORK.PD8510 THU, DEC 22, 1983, 11:02 AM PAGE 2

```
*                    Tape perpherial, Future terminals, Capricorn 85.
*                    CANNOT by 9825 or 264X Terminals.
*                    Use with the above allowed systems will require
*                    a special program.  See Note on TPmark.
*      Capacity (words):
*          109K     9845/35 Format -Single File  850 Updatable Records
*          110K     Max Updatable  -Single File  861 Updatable Records
*          143K     Non-Updatable  -Single File 1120 * 128Word Records
*
*                 Usable Tape 3360 inches
*                            12.5 inches for End Of Track
*                            2.50+-.375    File Gap
*                            1.0 +-.15     Record Gap
*                            2.75          Updatable Rec/File Header
*                            1.85          Average! 128Word Nonupdate
*
*               Capacity = # of words stored in Records
*                     If packed 128 Words/Records
*                  3360= # of File Headers * ( .25 + 2.50+-.375) +
*                           # of Records in all Files *
*                                   (1.0+-.15 + ( 2.75 OR 1.85))
*
*                 NOTE: If files are packed in they can be read by
*                       any SIF system, but not all SIF systems can
*                       pack data on as tight. therefore if dupication
*                       or generation of tapes on another tape system is
*                       desired the 9845 is the botton limit.
*     TRANSFER RATE:
*             Typical multi-record            .7 Kword/Sec
*             Worst Case Single record Burst 2.2 Kword/Sec
*             Single Track  50K Words         35 Secs
*             Total Tape                     100 Secs
*             REWIND                          19 Secs
*             Average Access                 ??6 Secs
*
************************************************************************
*
*   DATA STRUCTURES
*
*    NOTE:TACO uses inverted information (all but Checksums are fixed)
*
*  TACObodych(ecksum)
*  TPbodych(ecksum)    (sum of words in body)
*  TACOheadch(ecksum)
   TPheadch(ecksum)    (sum of file,record and length words)
   TPlenwd -- lenght word in header
         BIT 0-7  Actual bytes used - 1 ( FF=256 bytes)
         BIT 8-15 Alocated Bytes -1  (Updatable if odd)
   TPrecwd -- Record word in header
         BIT 0-11 Record number
         BIT 12-15 Field field (used with reserved bit)
*  TPfilewd -- File word in header
*        BIT 0-10 File number
*        BIT 11-12 Type =00 ->Empty,#00 -> not Empty
*        BIT 13 Resevred bit (Exchangability=1)
*        BIT 14 = 0
```

STACO.WORK.PD8510 THU, DEC 22, 1983, 11:02 AM PAGE 3

```
*        BIT 15 File identifier record = 1
*  TRK1rec  -- record number of first record on Trk1
*  TPermun -- detail error information  ( not presently, if ever used )
*  TPrec    -- last record number read or written
*  TPfile   -- DELETED ALWAYS = 1 in new format
*  TPstatus -- Tape status -- see below
*
*
* TPstatus
*BIT                 BIT                 BIT                  BIT
* 0 HOLE detected    4 in Gap            8                    12
* 1 Cartout          5 Trk 0 or 1        9                    13
* 2 ESTS Drive fault 6 @EndofValidData 10 Position known     14
* 3 WPR set          7 @BeginOfTape     11 Check(sum)err     15 RECempty
*
************************************************************************
*
*      I/O ADDRESS    + IO BASE of %FE00
*     DEC HEX BINARY
*
*      0   0 000 X000      R:CHECKSUM         W:THRESHOLD        **
*      2   2 000 X010      R/W: TACH                              *   TACO
*      4   4 000 X100      R:STATUS           W:INSTRUCTION       *   TAPE
*      6   6 000 X110      R/W: DATA                             **CONTROLLER
************************************************************************
end of comment;
GLOBAL INTEGER      TACOdata=IO+%06,TACOtach=IO+%02,
       TACOchecksum=IO+%00,TACOthres=IO+%00,
       TACOstatus=IO+%04,TACOcnd=IO+%04;
INTEGER  MiscStatus=IO+%A0;

GLOBAL INTEGER TPIns,TPCmd,Tach;
GLOBAL BOOLEAN Wait,TPError,Read_body;
GLOBAL INTEGER TPstatus,
        TPrec,TPermum,
        TPfilewd,TPrecwd,TPlenwd,
        TPheadck,TACOheadck,
        TPbodyck,TACObodyck;
INTEGER CONSTANT  rec_per_track := 426,
                  TRK1rec:=rec_per_track,     TRK0last_rec:=TRK1rec - 1,
                  TRK0last_rec1:=TRK0last_rec -1, TRK1rec1:=TRK1rec + 1,
                  TRK1last_rec :=TRK1rec+TRK1rec-1,
                  TRK1last_rec1:=TRK1last_rec -1;
INTEGER CONSTANT &MiscStatus& TACOirq:=2,TACOerror:=0;
INTEGER CONSTANT &TPstatus bit positions& HOLE:=0,Cartout:=1,Ests:=2,
        WPR:=3,Gap:=4,Trk:=5,EVD:=6,BOT:=7,
        Pos:=10,Checkerr:=11,RECempty:=15,&13-14 not used&
         &Tape TPIns bit position& Mod:=6,FST:=7,Fgap:=8,FWD:=15;


BOOLEAN PROCEDURE Rdnextrec(Add,Len); VALUE Add; DOUBLE Add;
                                                INTEGER Len; FORWARD;


&TACO WRITE ROUTINES -- TEMP SHORTHAND&
SUBROUTINE TPCMD;       TACOcnd:=NOT(TPIns OR TPCmd) ;
```

STACO.WORK.PD8510 THU, DEC 22, 1983, 11:02 AM PAGE 4

```
&TACO READ ROUTINES -- TEMP SHORTHAND&
SUBROUTINE TPrdstat;
   TPstatus:=TURN(TPstatus,NOT (TACOstatus),%3F);

SUBROUTINE CLRstatus;
   BEGIN TPCmd:=@034000; TPCMD; END;


&WAIT FOR INTERRUT RESPSONSE&
SUBROUTINE TPCmdwait;
   BEGIN
        TPCMD;
        WHILE TBIT(MiscStatus,TACOirq) DO;
        TPrdstat;
        TPError:= NOT TBIT(MiscStatus,TACOerror) ;
   END;

SUBROUTINE TPCmdwaitclr;
            BEGIN   TPCmdwait;
       IF TBIT(TPstatus,HOLE) THEN BEGIN CLRstatus; TPError:=FALSE; END;
            END;


&BASIC TAPE MOVEMENT ROUTINES&
SUBROUTINE MovTilir;
   BEGIN  TACOtach:=NOT Tach; TPCmd:=@074000; TPCmdwaitclr; END;

SUBROUTINE FastFwdIr;
   BEGIN TPIns:=@100200; MovTilir; END;

SUBROUTINE SlowFwdIr;
   BEGIN TPIns:=@100000; MovTilir; END;

SUBROUTINE FastRevIr;
   BEGIN TPIns:=@000200; MovTilir; END;

SUBROUTINE SlowRevIr;
   BEGIN TPIns:=@000000; MovTilir; END;

SUBROUTINE STOPTAPE;
   BEGIN TPCmd:=@011000; TPCmdwait; END;

SUBROUTINE STOPNOW;
   BEGIN TPCmd:=@010000; TPCMD; END;

SUBROUTINE StopRecGap;
   BEGIN TPIns:=RBIT(TPIns,Fgap); TPCmd:=@041000; &IR went stop&
                          TPCmdwaitclr; END;

SUBROUTINE SlowRevGap;
   BEGIN Tach:=-200; SlowRevIr; StopRecGap; E

SUBROUTINE GapCount;
   BEGIN TACOtach:=NOT Tach; TPCmd:=@060000;
```

STACO.WORK.PD8510 THU, DEC 22, 1983, 11:02 AM PAGE 5

```
   END;

SUBROUTINE  FastFwdGaps;
  BEGIN TPIns:=@100200;   GapCount;    END;

SUBROUTINE  FastRevGaps;
  BEGIN TPIns:=@000200;   GapCount;    END;


&BASIC TAPE READ ROUTINES&
INTEGER SUBROUTINE READCK;
  BEGIN TPCmd:=@076000; TPIns:=@100000; TPCmdwait;
                     READCK:= TACOdata; END;
INTEGER SUBROUTINE READ6;
  BEGIN TPCmd:=@072000; TPIns:=@100000; TPCmdwait;
                     READ6:= NOT TACOdata; END;


&BASIC TAPE WRITE ROUTINES&
SUBROUTINE WrtGap;
   BEGIN  TACOtach:=NOT Tach; TPCmd:=@054000;
          TPIns:=@100000;  TPCmdwaitclr; END;
PROCEDURE Wrtinned(Data); VALUE Data; INTEGER Data;
   BEGIN     TACOdata:=NOT Data;
        TPCmd:=@006000; TPIns:=@100000;    TPCmdwait;    END;
PROCEDURE Wrtsyn6(Data); VALUE Data; INTEGER Data;
  BEGIN     TACOdata:=NOT Data;
        TPCmd:=@062000; TPIns:=@100000;    TPCmdwait;    END;
SUBROUTINE Wrtcheck;
  BEGIN TPCmd:=@066000; TPIns:=@100000;    TPCmdwait;    END;


&TRACK CONTROL&
SUBROUTINE TRACK0;
    BEGIN
          TPrec := -1;
          TPIns:=RBIT(TPIns,Mod); TPCmd:=@014000; TPCMD; TPrdstat; END;
SUBROUTINE TRACK1;
    BEGIN
          TPrec := TRK1rec - 1;
          TPIns:=SBIT(TPIns,Mod); TPCmd:=@014000; TPCMD;
                                  TPIns:=RBIT(TPIns,Mod); TPrdstat; END;
```

```
STACD.WORK.PD8510            THU, DEC 22, 1983, 11:02 AM     PAGE  6

%EJECT; COMMENT
*************************************************************************
*Position and Posunknown set and cleared the position flags in
*        the status word
*
*  Position is called to change a the position flag and it is passed
*    the new position point and anyother is cleared.
*  Pos -- the position flags are valid
*  BOT -- @ begining of tape (load point) -- the normal rewind position
*            of either physical track
*  EVD -- @ logical end of tape -- no more data on tape
*
*  Posunknown clears all position flags, and present and Trk1 file and
*      record information. Pos is set false.
*************************************************************************
end of comment;
PROCEDURE Position(Pospoint); VALUE Pospoint; INTEGER Pospoint;
BEGIN
    TPstatus:=RBIT(TPstatus,BOT);
    TPstatus:=RBIT(TPstatus,EVD);
    TPstatus:=SBIT(TPstatus,Pospoint);
    TPstatus:=SBIT(TPstatus,Pos);
    IF TBIT(TPstatus,BOT) THEN TPrec:=-1;
END Position;

SUBROUTINE  Posunknown;
BEGIN
   Position(Pos);
   TPstatus:=RBIT(TPstatus,Pos);
   TPrec:=-2;
END;
```

```
STACD.WORK.PD8510            THU, DEC 22, 1983, 11:02 AM     PAGE  7

%EJECT; COMMENT
*************************************************************************
*Rewind is the basic rewind the tape to load point routine.
*
*    It has no parameters and returns TRUE if the rewind was done.
*        It will updated position flags.
*
* If presently at BOT just backups to the load point hole and the moves
*   forward past it.
* If not at BOT then go forward approx 1.5 inches or next hole, then
*   go in reverse looking for a double hole ( two holes within 1 inch)
*  When they are found, the tape will start forward till 14 inches
*   without a hole occur (double hole pairs are spaced 12 inches).
* The tape is slowed down and continues till load point where it stops.
*
* If TPError has occured, the tape is stop ( it may be still searching)
*  the position flags are cleared and Rewind returns FALSE.
* If no TPError, the position is set to BOT and Rewind returns TRUE.
* Errors are drive faults or Cartout. Hole detect is not an error here.
* Track 0 is selected.
*
* A routine FullRewind use to exist -- it would do a rewind and find out
*   what was the first file/record on track1 -- however this is fixed
*   for the chosen tape format
*************************************************************************
end of comment;

BOOLEAN SUBROUTINE Rewind;
BEGIN
 IF NOT TBIT(TPstatus,BOT) THEN
     BEGIN
     Tach:=-1500; FastFwdIr;
     DO
        BEGIN
            DO  BEGIN Tach:=1; FastRevIr; END
                UNTIL TBIT(TPstatus,HOLE) OR TPError;
            Tach:=-1000; FastRevIr;    END
        UNTIL TBIT(TPstatus,HOLE)  OR  TPError;
     DO BEGIN Tach:=-14000; FastFwdIr; END
        UNTIL NOT TBIT(TPstatus,HOLE)  OR  TPError;
     END ELSE &at BOT&
         BEGIN Tach:=-5000; SlowRevIr; END;

     Tach:=-14000;  SlowFwdIr;
     TRACKO;
     IF  TPError THEN  BEGIN STOPNOW; Posunknown;  END
         ELSE Position(BOT);
 Rewind:=NOT TPError;
 END  Rewind;

 COMMENT
*************************************************************************
*  INgap verifies that the tape in is valid point to start a read.
*
*   It has no input parameters and will return true if OK to read.
*
```

```
STACD.WORK.PD8510            THU, DEC 22, 1983, 11:02 AM     PAGE  8

*   If at BOT then first record gap is found, and INgap is TRUE if
*          not TPError.
*   If at EVD , INgap is set FALSE.
*   If not at BOT or EVD, then must be in a record gap, INgap is TRUE.
*************************************************************************
end of comment;
BOOLEAN SUBROUTINE INgap;
BEGIN
IF TBIT(TPstatus,BOT) THEN
    BEGIN
        Tach:=-1000; SlowFwdIr;
        IF TBIT(TPstatus,Gap) THEN   STOPTAPE
            ELSE StopRecGap;
        Position(Pos);
    END  ;
IF TBIT(TPstatus,EVD) THEN TPError:=TRUE;

INgap:=NOT TPError;
END INgap;
```

```
STACD.WORK.PD8510            THU, DEC 22, 1983, 11:02 AM     PAGE  9

%EJECT;COMMENT
*************************************************************************
*
*  TPINT is the poweron intialization routine.
*
*  It has no input or output parameters.
*
*  It intializates variables and clears position and error flags.
*************************************************************************
end of comment;
SUBROUTINE TPINT;                        ENTRY;
BEGIN
  TPIns:=0;
  TPError:=FALSE;
  CLRstatus;
  TPstatus:=0;
  Posunknown;
  TPrdstat;              & may not be neccessary&
END  TPINT ;
```

```
#EJECT; COMMENT
*************************************************************************
*TPST is an integer function returning tape status.
*
*  TPST is an integer function call with no input parameters, returns
*         the full tape status word.
*
*  It reads the present tape status and clears position if needed.
*    It also saves if a drive fault has occured.
*  It then clears the tape status and rereads the status and adds
*    back in if a drivefault had occured.
*
*  In doing this double read of tape status, Cartout or ESTS is recorded
*    but the routinue returns present status (plus ESTS). A clrstatus
*    will remove these flags if the problem or state is no longer true.
*************************************************************************
end of comment;
INTEGER PROCEDURE TPST;
BEGIN
 BOOLEAN Drivefault;
    TPrdstat;
    IF (TBIT(TPstatus,Cartout) OR TBIT(TPstatus,Ests) ) THEN Posunknown;
    Drivefault:=TBIT(TPstatus,Ests);
    CLRstatus;
    TPrdstat;
    IF Drivefault THEN TPstatus:=SBIT(TPstatus,Ests);
    TPST:=TPstatus;
END TPST ;
```

```
#EJECT; COMMENT
*************************************************************************
* TPErr reports the present status with reading TACO.
*       Used for determining why a Tape failure occured.
*           or the status after a completed operation
*************************************************************************
end of comment;
INTEGER SUBROUTINE TPErr;
      TPErr:=TPstatus;

COMMENT
*************************************************************************
* TPrecord is used to report the record number of the last record (r/w)
*      NOTE: -1 means tape position at BOT
*            -2 means tape position unknown
*************************************************************************
end of comment;
INTEGER SUBROUTINE TPrecord;
      TPrecord:=TPrec;
```

```
#EJECT; COMMENT
*************************************************************************
*TPready prepares the tape for use and checks if a tape is in.
*      Boolean function that returns if the tape position is still known
*
*   NOTE: use to do a rewind if position unknown/failed only if tape out
*************************************************************************
end of comment;
BOOLEAN SUBROUTINE TPready;              ENTRY;
BEGIN
    TPST;
    TPError:=NOT TBIT(TPstatus,Pos);
    TPready:=NOT TPError;
    TPready;

   ENT
    Gap(-> gap in read error occured ??) at track EVD
    no more at tape EVD ELSE rewind and prepare to read next record
   uld be simplified now due to fix record format -- EVD at Rec425, 851;
   LEAN SUBROUTINE EVDTEST;
   EGIN
  IF TBIT(TPstatus,Gap) THEN BEGIN
       TPError:=FALSE;
       CLRstatus;
       IF TBIT(TPstatus,Trk) THEN
              BEGIN TPError:=TRUE;  Position(EVD); END
          ELSE IF Rewind THEN BEGIN TRACK1; INgap; TPrec := TRK1rec;END;
       EVDTEST:= NOT TPError;
       END
     ELSE EVDTEST:=FALSE;
  END EVDTEST;
```

```
#EJECT; COMMENT
*************************************************************************
*Rdnextrec is the basic read next record routine.
*   No input parameters, returns TRUE if read sucessful.
*   The Data read is stored at "Add", and all the file , record, and
*        and position flags are approiately updated.
*
*   Reasons for readfail : Cartout, ESTS (drive fail), EVD,
*                   or Check(sum)err.  (Check TPstatus)
*
*  The threshold reg is set for read and the checksum reg is cleared.
*  The tape is assumed to be in a gap . A read command is given and if
*    it is not successful an TPError occurs. If the TPError is because
*    of an EVD of this track, if this is not trk1 and there is data on
*    Trk1, a rewind will occur and the read will try again. If the
*    failure was due to true EVD or Carout or ESTS--Error is left FALSE.
*  The tape (if not error) will then read the three header words, and
*    the header chekcsum. The TACO checksum will be read and clear to
*      check later.
*  If the body part of the record is not entpy the number of words as
*    calculated from the Bytes Used in the length word will be read and
*     the tape and TACO body checksum will be read and the record
*      status set not empty.   (A Read_body flag is also checked)
*  If the body is empty, the length and checksum are set to zero.
*  The checksum are checked and if they donot compair and there had
*     been no other error, the record will be reread for three trys.
*  At this point if any error has occured the tape will be stopped
*     and if not EVD the position flags cleared.
*  However if no TPErrors the tape will searched till gap and stop.
*     position, file, and record flags set.
*************************************************************************
end of comment;
BOOLEAN PROCEDURE Rdnextrec(Add,Len);VALUE Add;        &forward declared&
                            DOUBLE Add;   INTEGER Len;&forward declared&

BEGIN
 INTEGER Pass,Bytelen,Index,Stratch;
 INTEGER POINTER MemPtr;

 BOOLEAN SUBROUTINE CheckOK;
  BEGIN
  CheckOK:=TRUE;
  IF NOT((TPheadck=TACOheadck) AND (TPbodyck=TACObodyck) OR TPError )
        THEN IF Pass>3 THEN BEGIN TPstatus:=SBIT(TPstatus,Checkerr);
                                  TPError:=TRUE; END
                     ELSE BEGIN  SlowRevGap;;
                                  CheckOK:=FALSE; END;
  END CheckOK;

Rdnextrec:=FALSE;
IF TPready THEN IF INgap THEN
BEGIN
  STPNTR(MemPtr,Add);
  TACOthres:= NOT @03060;
 Stratch:=TACOchecksum;
 Pass:=0;
```

```
STACO.WORK.PD8510              THU, DEC 22, 1983, 11:02 AM     PAGE  14

 DO BEGIN
    TPstatus:=RBIT(TPstatus,Checkerr);
    TPstatus:=SBIT(TPstatus,RECempty);
    DO TPfileud:=READ6 UNTIL NOT EVDTEST;

    IF NOT TPError THEN BEGIN
      TPrecud:=READ6;
      TPlenud:=READ6;
      TPheadck:=READCK;
      TACOheadck:=TACOchecksum;
      IF ((TPfileud AND Z1800)MO) AND Read_body THEN BEGIN
         Bytelen:=TPlenud AND ZFF;
         FOR Index:=0 UNTIL RIGHT(Bytelen,1) DO MemPtr[Index]:=READ6;
         Bytelen:=Bytelen+1;
         TPstatus:=RBIT(TPstatus,RECempty);
         TPbodyck:=READCK;
         TACObodyck:=TACOchecksum;    END
       ELSE BEGIN Bytelen:=0;  TPbodyck:=TACObodyck:=0;  END;
     Pass:=Pass+1;
   END;
  END UNTIL CheckOK;

  IF TPError THEN BEGIN STOPNOW;
                      IF NOT TBIT(TPstatus,EVD) THEN Posunknown; END
          ELSE BEGIN StopRecGap;
                      Position( Pos);
                      TPrec :=TPrecud  AND ZFFF;
                      Len:=Bytelen;
                 END;
  Rdnextrec:=NOT TPError;
  END;

END Rdnextrec;
```

```
STACO.WORK.PD8510              THU, DEC 22, 1983, 11:02 AM     PAGE  15

#EJECT; COMMENT
************************************************************************
*TPRED is basic tape read
*
************************************************************************
end of comment;
BOOLEAN PROCEDURE  TPRED(Add,Len); VALUE Add; DOUBLE Add;
                                                     INTEGER Len;  ENTRY;
BEGIN
   Read_body:=TRUE;
   TPRED:=Rdnextrec(Add,Len);
 END TPRED;

COMMENT
************************************************************************
* TPrd_header does a normal read without reading the body
*
*   Body buffer is in monitor ram BUT is not actually used
************************************************************************
end of comment;
BOOLEAN SUBROUTINE TPrd_header;
BEGIN INTEGER Len;
      Read_body:=FALSE;
      TPrd_header:=Rdnextrec(ADRS(Parm0),Len);
END TPrd_header;


BOOLEAN SUBROUTINE REW;              ENTRY;
BEGIN
    TPST;
    IF TBIT(TPstatus,Cartout) THEN REW:=FALSE
        ELSE  BEGIN TPError:=TRUE; REW:= Rewind;  END;
END REW;
```

```
STACO.WORK.PD8510              THU, DEC 22, 1983, 11:02 AM     PAGE  16

#EJECT; COMMENT
************************************************************************
*TPWRT will write the next record. It assume the file structure
*      is premarked.
*  It will return TRUE if write occured.
*
*
*
*  The write protect is checked first and if not protected
*      The file, record and length word and empty bit are fixed
*      The threshold and checksum regs are initialized.
*      The file header and file body ( if length is nonzero ) is then
*      written. If there were no
*      errors then next gap is found and the tape stops, else the tape
*      stops in place.
*
*      NO test for Holes is done since this tape is premarked!!!!!
*
************************************************************************
end of comment;
COMMENT
************************************************************************
*   TPWRT is the basic next record write routine
************************************************************************
end of comment;
BOOLEAN PROCEDURE  TPWRT(Add,Len); VALUE Add,Len; DOUBLE Add;
                                            INTEGER Len;    ENTRY;
BEGIN
 INTEGER Index,Stratch,Length;
 INTEGER POINTER MemPtr;

TPWRT:=FALSE;
IF TPready THEN IF INgap THEN
BEGIN
   STPNTR(MemPtr,Add);
   IF TBIT(TPstatus,WPR) THEN TPError:=TRUE
       ELSE BEGIN

          TPrecud:=TPrec:=TPrec+1;
          TPfileud:=(IF TPrec=0 THEN Z8001 ELSE 1);
          Length:=RIGHT(Len+1,1);
          TPlenud:=((Len-1) AND ZFF) OR ZFF00;
          TPfileud:= (IF Length=0 THEN (TPfileud AND ZE7FF)
                                   ELSE (TPfileud OR  Z1800));

          TACOthres:=NOT @63060;
          Stratch:=TACOchecksum;

          DO Wrtsyn6(TPfileud) UNTIL NOT EVDTEST;
          IF NOT TPError THEN BEGIN
             Wrtsyn6(TPrecud);
             Wrtsyn6(TPlenud);
             Wrtcheck;
             Stratch:=TACOchecksum;

             IF LengthMO THEN
```

```
STACO.WORK.PD8510              THU, DEC 22, 1983, 11:02 AM     PAGE  17

                 FOR Index:=0 TO Length-1 DO Wrtsyn6(MemPtr[Index]);
               Wrtcheck;
               Wrtcheck;  &POSTAMBLE&
               END;
            END;

    IF TPError THEN
          BEGIN STOPNOW;  Posunknown; END
     ELSE StopRecGap;

    TPWRT:=NOT TPError;
 END;
END TPWRT;
```

```
STACO.WORK.PD8510              THU, DEC 22, 1983, 11:02 AM     PAGE  18

#EJECT; COMMENT
************************************************************************
************************************************************************
end of comment;
PROCEDURE wrt_init_record;
BEGIN
INTEGER stratch;

IF TBIT( TPstatus, WPR ) THEN TPError := TRUE
 ELSE
   BEGIN
   TPrecwd := TPrec := TPrec + 1;
   IF TPrec # 0 THEN TPfilewd := 1 ELSE TPfilewd := %8001;
   TPlenwd := %FF00;

   TACOthres := NOT @63060;

   IF TPrec # 1 THEN Tach := -1000 ELSE Tach := -2500;
   WrtGap;
   stratch   := TACOchecksum;

   Wrtimmed( TPfilewd );
   Wrtsyn6(  TPrecwd );
   Wrtsyn6(  TPlenwd );
   Wrtcheck;
   stratch   := TACOchecksum;

   #REPEAT 151 DO Wrtsyn6( %FFFF );

   END;

END wrt_init_record;
```

```
STACO.WORK.PD8510              THU, DEC 22, 1983, 11:02 AM     PAGE  19

#EJECT; COMMENT
************************************************************************
* TPmark will mark the tape with the needed file structure, erasing an
*  previous information. This file structure is one file, 852 records.
*
******
** NOTE
*   This format is readable by the 9845/35 , and 9875A. It fails on the
*   HP85 for lack of a File Zero -- which is not required for SIF!!!!!
*   If a file Zero existed the 9845/35 cannot read it but will skip it.
*
*
*  Do twice the following : Rewind the tape, back up 1/2 inch, and
*     do 426 times: Write a record gap ( unless Rec=1 then a File gap)
*     then write a empty file with a data block of 256 bytes of FF's
*     with the proper header. EXIT if a tape error occurs.
*     After the 426 records write an EVD gap.
*  Rewind and report success or failure.
************************************************************************
end of comment;
BOOLEAN PROCEDURE TPmark;
BEGIN
INTEGER track_count,
        rec_count;

   track_count:=-1;

   WHILE ( track_count := track_count + 1 ) <= 1
         AND NOT TPError DO
     BEGIN
     IF REW THEN
        BEGIN
        IF track_count # 0 THEN TRACK1;
        Tach := -700; SlowFwdIr;

        rec_count := 0;
        WHILE ( rec_count := rec_count + 1) <= rec_per_track
              AND NOT TPError
           DO
              wrt_init_record ;
        IF NOT TPError THEN
           BEGIN Tach := -13000;  WrtGap; END;
        END;
     STOPNOW;
     Posunknown;
     END track loop;

      TPmark := NOT TPError;;

      REW;

 END TPmark;
```

```
STACO.WORK.PD8510              THU, DEC 22, 1983, 11:02 AM     PAGE  20

#EJECT; COMMENT
************************************************************************
* TPseek(pos) will seek (find) and position the tape proir to the rec
*           number selected.
*
* TPseek will use a combination of trk switching, fast rev/fwd , and
*        slow reading of record headers to position the tape.
*
* First a check of special conditions are made : first or last records
*        on a track, or the tape is aready at requested position.
*    ..ng the present position and track, and the new position and track
*        a rec_offset(minus=rev,plus=forward of present position) will
*        be computed. A high speed gap counting routine will be called
*       to position the tape approx 1-2 records away. A record read will
*    .ead of record header will verify position, if not correct yet the
*       will either back up or continue forward till in position or TPErr
************************************************************************
  .f comment;
 ..EAN PROCEDURE TPseek(new_pos); VALUE new_pos; INTEGER new_pos;
.EGIN
  INTEGER  rec_offset,change_flg,TPrec_temp;

  TPrec_temp := TPrec;
  IF new_pos >= TRK1rec   THEN  TRACK1 ELSE TRACK0;   & destorys TPrec &
  TPrec        := TPrec_temp;
  IF TPrec # TRK0last_rec THEN TPrec := TPrec + 1;

  IF TPready AND new_pos<=TRK1last_rec AND new_pos>=0 THEN
     BEGIN
     IF (new_pos <= 1)  OR
         ( (new_pos >= TRK1rec) AND (new_pos <= TRK1rec1 ) )  THEN
       BEGIN    &want near beginning of a track &
       Rewind; & sets track0,TPrec = -1 &
       IF new_pos>=TRK1rec THEN  TRACK1 ;
     . END
     ELSE
     IF new_pos = TPrec THEN  &cannot do for first recs on track&
        SlowRevGap              &want record just done &
     ELSE
     IF  (new_pos >= TRK1last_rec1) OR
       ( (new_pos >= TRK0last_rec1) AND (new_pos <= TRK0last_rec) ) THEN
        BEGIN            & want the end of a track &
        Tach := -1000; & large &    FastFwdGaps;   & will stop at EVD &
        Tach := -5000;  SlowRevIr;
        REPEAT 4 DO
           BEGIN
           SlowRevGap; CLRstatus;
           END back up from EVD loop;
        END
      ELSE
        BEGIN       & want record not at present, or near end/beginning&
        rec_offset := new_pos  - TPrec ;
        change_flg := 0;
        IF TPrec   >=TRK1rec THEN
           BEGIN   change_flg := change_flg + 1;
                   rec_offset:=rec_offset + rec_per_track;  END;
```

```
STACO.WORK.PD8510              THU, DEC 22, 1983, 11:02 AM     PAGE  21

        IF new_pos>=TRK1rec THEN
           BEGIN   change_flg := change_flg + 1;
                   rec_offset:=rec_offset - rec_per_track;  END;

        IF rec_offset>=3 THEN
           BEGIN      change_flg  := change_flg OR %1;
                      Tach:=2-rec_offset; FastFwdGaps; END
        ELSE IF rec_offset<=-3 THEN
           BEGIN      change_flg  := change_flg OR %1;
                      Tach:=rec_offset+2; FastRevGaps; END;

        IF TBIT(change_flg,0) THEN
           BEGIN  &INgap if tracks change or major move&
           Tach:=-200; SlowFwdIr;
           IF TBIT(TPstatus,Gap) THEN   STOPTAPE
                ELSE StopRecGap;
           END;
        END;

     WHILE TPrd_header AND (TPrec # new_pos) AND (NOT TPError) DO
        IF TPrec>new_pos THEN
              REPEAT (TPrec - new_pos + 1) DO SlowRevGap;
     SlowRevGap;

     END
 ELSE TPError := TRUE;

STOPNOW;

TPseek:= (NOT TPError) AND ( TPrec = new_pos );

TPrec := TPrec - 1;
END TPseek;
```

```
STACO.WORK.PD8510              THU, DEC 22, 1983, 11:02 AM     PAGE  22

#EJECT;COMMENT ********** END OF TACO SUBROUTINES  *************;

COMMENT
**************************************************************************
* TAPEntry is a fudge routine that except to find a value on the stack
*          that selects one of N TACO routines.
*
* TAPEntry DOESNOT !!!! use the normal calling conventions.
*
*  Stack Parm        ROUTINE
*     0          SUBROUTINE TPINT
*     1          INTEGER PROCEDURE TPST/
*     2          INTEGER SUBROUTINE TPErr/
*     3          BOOLEAN SUBROUTINE REW/
*     4          BOOLEAN PROCEDURE TPRED(Add,Len)/ VALUE Add/
*                                            DOUBLE Add/ INTEGER Len/
*     5          BOOLEAN PROCEDURE TPWRT(Add,Len)/ VALUE Add,Len/
*                                            DOUBLE Add/ INTEGER Len/
*     6          BOOLEAN SUBROUTINE INgap/
*     7          BOOLEAN SUBROUTINE TPready/
*     9          BOOLEAN PROCEDURE TPmark/
*    10          BOOLEAN PROCEDURE TPseek(pos)/VALUE pos/INTEGER pos/
*    11          INTEGER SUBROUTINE TPrecord/
**************************************************************************
end of comment;
SUBROUTINE TAPEntry;
BEGIN
     ASSEMBLE(  MOVE (S)+,R1;
                MOVE.L $RAM$.L,G;
                CMPI =D11,R1;
                BEQ  TPrecord;
                CMPI =D10,R1;
                BEQ  TPseek;
                CMPI =D9,R1;
                BEQ  TPmark;
                CMPI =D7,R1;
                BEQ  TPready;
                CMPI =D6,R1;
                BEQ  INgap;
                CMPI =D5,R1;
                BEQ  TPWRT;
                CMPI =D4,R1;
                BEQ  TPRED;
                CMPI =D3,R1;
                BEQ  REW;
                CMPI =D2,R1;
                BEQ  TPErr;
                CMPI =D1,R1;
                BEQ  TPST;
                BRA  TPINT );
END TAPEntry;
```

```
FTERM.WORK.PD8510              THU, DEC 22, 1983, 11:02 AM     PAGE   1

  SUBROUTINE CRLF; EXTERNAL;
  PROCEDURE WSTR(STR); VALUE STR; ALPHA STR; EXTERNAL;
  PROCEDURE WHEX(NUM); VALUE NUM; INTEGER NUM; EXTERNAL;
  PROCEDURE WHex(Num,Width); VALUE Num,Width;
                             QUAD Num; INTEGER Width; EXTERNAL;
```

```
ATENA.WORK.PD8510              THU, DEC 22, 1983, 11:02 AM     PAGE   1

ASMB,R
        HED     ten times quad
        NAM     TENA,"WCC PD8510"
        ENT     TENA
RO      REG     O
R1      REG     1
S       REG     15
TENA    EQU     *
        ASL.L   #1,     R1
        ROXL.L  #1,     RO      times 2
FIVEA   EQU     *
        MOVE.L  RO,     -(S)
        MOVE.L  R1,     -(S)
        ASL.L   #1,     R1
        ROXL.L  #1,     RO      times 2
        ASL.L   #1,     R1
        ROXL.L  #1,     RO      times 2
        ADD.L   (S)+,   R1
        BCC     CC
        ADDQ.L  #1,     RO      no ADDX.L memory to register
CC:     ADD.L   (S)+,   RO      plus the saved value
        RTS
        END
```

```
STERM.WORK.PD8510              THU, DEC 22, 1983, 11:02 AM     PAGE   1

M68KL,P,"TERM"
BEGIN

BYTE ARRAY BA[-1:16];
BYTE ACIASC=%FFFFFE8B,ACIAD=%FFFFFE89;
BYTE CONSTANT byte_zero:=0, baud_clk_mode:= %86;
BYTE timer_cmd = %FFFFFE67, baud_clk = %FFFFFE65;
INTEGER CONSTANT Tx:=0,Rx:=1;

#FILE cids.work;
@FILE ffmt.work;

PROCEDURE WCHAR(C);VALUE C;BYTE C; ENTRY;
BEGIN DO BEGIN END UNTIL TBIT(ACIASC,Tx); ACIAD:=C; END;


SUBROUTINE  set_up_output;
BEGIN BA[-1]:=16; WCHAR( %20 );    END;


PROCEDURE WSTR(SR);VALUE SR;ALPHA SR;  ENTRY;
BEGIN
LABEL LOOP,LOOP_CHECK;
ASSEMBLE(
             MOVE.L   RO,  R8      ;
             MOVE.B  (R8)+,   R1   ;
             EXTS.W   R1           ;
             BRA      LOOP_CHECK   ;
   LOOP:     MOVE.B  (R8)+,   RO   ;
             BSR      WCHAR        ;
 LOOP_CHECK: DBRA R1, LOOP         );
END;


SUBROUTINE CRLF;                                                 ENTRY;
BEGIN
   LABEL LOOP;
   WCHAR(13); WCHAR(10);
   ASSEMBLE( MOVE.W   =D2500,RO;
      LOOP:  TRAP  1            ;
             DBRA     RO, LOOP    ) ;
             & 2.5mS   delay For 9600 baud&
 END;


PROCEDURE WNUM(NUM);   VALUE NUM;   DOUBLE NUM; ENTRY;
BEGIN
      set_up_output;
      WSTR(format_double(NUM,ADRS(BA),%01000C00));
      END;

PROCEDURE WQUAD(x); VALUE x; QUAD x;                         ENTRY;
BEGIN
      set_up_output;
      WSTR(format_quad(x,ADRS(BA),%01000D00));
```

```
END;

PROCEDURE WREAL(NUM); VALUE NUM;    REAL NUM; ENTRY;
BEGIN
      set_up_output;
      WSTR(format_real(NUM,ADRS(BA),%30000D06));
      END;

PROCEDURE WCPX(NUM); VALUE NUM; COMPLEX NUM; ENTRY;
BEGIN REAL X=NUM,Y=NUM+4;
      WREAL(X); WSTR(","); WREAL(Y);
      END;


PROCEDURE WHex(NUM,WIDTH); VALUE NUM,WIDTH; QUAD NUM; INTEGER WIDTH;
                                                        ENTRY;
BEGIN
      set_up_output;
      WSTR(format_quad(NUM,ADRS(BA),
             %60000000+LEFT(DOUBLE(WIDTH),8)+DOUBLE(WIDTH)) );
END;

PROCEDURE WHEX(NUM); VALUE NUM; INTEGER NUM; ENTRY;
  WHex(NUM,4);

BYTE SUBROUTINE RCHAR; ENTRY;
  BEGIN DO BEGIN END UNTIL TBIT(ACIASC,Rx); WCHAR(RCHAR:=ACIAD); END;



END$

INTEGER PROCEDURE RHEX; ENTRY;
  BEGIN
  BYTE Char;
  INTEGER Temp;

  Temp:=0;
  WCHAR('?);
  WHILE ( (Char:=RCHAR) # 13 AND Char # %20 AND Char # ', ) DO
    BEGIN
      IF Char=8 THEN Temp:=RIGHT(Temp,4)
      ELSE IF Char>='0 AND Char<='9 THEN
              Temp:=LEFT(Temp,4)+( Char AND %F)
      ELSE IF Char>='A AND Char<='F THEN
              Temp:=LEFT(Temp,4)+(Char AND %7)+9
      ELSE IF Char>='a AND Char<='f THEN
              Temp:=LEFT(Temp,4)+(Char AND %7)+9
      ELSE BEGIN Temp:=0; WCHAR(7); END;
    END;
   RHEX:=Temp;  CRLF;
   END;

PROCEDURE acia_speed(count); VALUE count;   BYTE  count;      ENTRY;
BEGIN   timer_cmd:=baud_clk_mode;
        baud_clk:=count;
```

```
        baud_clk:=byte_zero;
END acia_speed;
```

```
  PROCEDURE WCHAR(C); VALUE C; BYTE C; EXTERNAL;
  PROCEDURE WQUAD(NUM);  VALUE NUM; QUAD NUM; EXTERNAL;
```

```
 PROCEDURE WNUM(NUM); VALUE NUM; DOUBLE NUM; EXTERNAL;
 PROCEDURE WREAL(NUM); VALUE NUM; REAL NUM; EXTERNAL;
 PROCEDURE WCPX(NUM); VALUE NUM; COMPLEX NUM; EXTERNAL;
 &INTEGER PROCEDURE RHEX; EXTERNAL; &
```

```
FTESTSET.WORK.PD8510           THU, DEC 22, 1983, 11:02 AM    PAGE   1

BOOLEAN SUBROUTINE slow_test_set;                 EXTERNAL.L;  & DEBUG &
SUBROUTINE device_reversed;                                  EXTERNAL.L;
BOOLEAN PROCEDURE  set_test_set( new_param, lock_required );
   VALUE   new_param;
   INTEGER new_param;
   BOOLEAN lock_required;                                    EXTERNAL.L;
PROCEDURE  build_test_set;                                   EXTERNAL.L;
SUBROUTINE redefine_test_set;                                EXTERNAL.L;
PROCEDURE  preset_test_set;                                  EXTERNAL.L;
```

```
STESTSET.WORK.PD8510           THU, DEC 22, 1983, 11:02 AM    PAGE   2

#EJECT;
INTEGER CONSTANT id_size        :=   127,  & test-set id string size  &
                 old_id_size    :=    20,
                 reverse_dev_bit := %0040,  & reverse device flag bit  &
                 phase_lock_bit := %0010,  & lock bit in speed word   &
                 speed_mask     := %0003,
                 rebuilt        := max_acquisition_param + 1,
                 string_size    :=     6;

INTEGER CONSTANT non_functional :=    -1,  & non functional function  &
                 reverse_dev    :=     0,  & manually reverse device  &
                 slow           :=     1,  & automatic; wait for srq  &
                 fast           :=     2;  & automatic; fast          &

INTEGER CONSTANT no_ports       :=     0,  & port configure bits      &
                 a1             :=     1,  & for IC command.          &
                 b1             :=     2,
                 a2             :=     4,
                 b2             :=     8;

DOUBLE  CONSTANT test_set_format := %07000500;

BOOLEAN test_set_present,
        waiting_for_device_rdy;
INTEGER old_param,            & the last parameter set up by the testset &
        old_param_index;      & the last parameter's acq param tbl index &
```

```
STESTSET.WORK.PD8510           THU, DEC 22, 1983, 11:02 AM    PAGE   1

M68KL,P,"testset"
BEGIN

#FILE fterm.work;                                            & DEBUG &
#FILE cdebugc0.work;                                         & DEBUG &
#FILE cyadc.work;
#FILE cchtable.work;
#FILE fchtable.work;                                  & for set_ch_quad &
#FILE fchtab2.work;                                       & for ch_quad &
#FILE fchdata2.work;                                       & for old_id &
#FILE fcontvar.work;                              & for max_parameter &
#FILE cdatap.work;             & for freq_domain, max_domain, max_format &
#FILE fchpfr.work;
#FILE fprivib.work;
#FILE fprivib2.work;                                 & for trig_priv_ib &
#FILE fstring.work;
#FILE fcnv9x.work;
#FILE fkernel.work;                                        & for wait() &
#FILE fkernel4.work;                                & for signal_init() &
#FILE crins.work;                                 & for continue_signal &
#FILE cmessag1.work;          & for reverse_device and forward_device &
#FILE futil2.work;                                  & for clear_message &
#FILE futil3.work;                                  & for tell and warn &
#FILE cnewline.work;                                      & for newline &
#FILE ffmt.work;                                   & for format_integer &
#FILE facttbl.work;                              & for set_active_limit &
#FILE cactive.work;                                  & for active_start &
#FILE fdispram.work;                                & for wrt_disp_byte &
#FILE frecall.work;                                   & for recall_type &
#FILE cmenu.work;                               & for DEVICE_READY_MENU &
#FILE fmenu.work;                                        & for gen_menu &
#FILE fbreak.work;                                   & for break_paused &
#FILE fcontrol.work;                                & for restart_sweep &
```

```
STESTSET.WORK.PD8510           THU, DEC 22, 1983, 11:02 AM    PAGE   3

#EJECT;
COMMENT                              switching_speed and test_set_speed
**********************************************************************
*
*   "switching_speed" ARRAY:
*   switching_speed contains the test-set switching speed for a given
*   switchable port (driven, phase-lock, numerator, or denominator).
*
*   "test_set_speed" ARRAY:
*   test_set_speed is a symmetric square matrix containing the switching
*   speed from one parameter to another with the two parameters as
*   indices into the array.  It could be a lower- or upper-triangular
*   matrix, but computing the index would take more space and be slower
*   than the additional array locations.  The diagonal (from_param =
*   to_param) is reserved for switching times from the parameter in
*   effect prior to a build_test_set to the first one after -- otherwise
*   the diagonal elements are not used.
*
*   TEST SET SWITCHING TIMING:
*   test_set is stable about 300 microseconds after a
*   trigger.  It is not ready to accept another trigger for
*   about 3 milliseconds.  It takes about 6.29 milliseconds to
*   stabilize after an "RCO," (from the time the "RCO" has been
*   accepted by the test set software and the "," is loaded
*   into the HP-IB I.C. until all is processed and stable).
*   It takes about 5.44 milliseconds to stabilize after the
*   test-set software reads the "," from the HP-IB I.C..
*   [ as of 22 Nov 83 ]
*
**********************************************************************
;
BYTE    ARRAY switching_speed[ numerator_port:attenuator ],
              test_set_speed [ 1:max_parameter, 1:max_parameter ];
                                          & could be lower-triangular, &
                                          & but indexing is too slow.  &
INTEGER ARRAY configuration  [ 1:max_parameter],
              port_enable    [ 1:max_parameter];
```

```
STESTSET.WORK.PD8510          THU, DEC 22, 1983, 11:02 AM     PAGE   4

#EJECT;
BYTE TABLE port_map :=                  & indexed by 3*port_type + port &
     0, 0, 0,                           & port_type = 0 is illegal.     &
     num_no_ratio,    & numerator_port,   0 &
     num_b1,          & numerator_port,   1 &
     num_b2,          & numerator_port,   2 &
     denom_no_ratio,  & denominator_port, 0 &
     denom_a1,        & denominator_port, 1 &
     denom_a2,        & denominator_port, 2 &
     driven_none,     & driven_port,      0 &
     driven_a1,       & driven_port,      1 &
     driven_a2,       & driven_port,      2 &
     lock_donot_care, & phase_lock_port,  0 &
     lock_to_a1,      & phase_lock_port,  1 &
     lock_to_a2;      & phase_lock_port,  2 &

BYTE TABLE numerator_control_bits :=  & indexed by numerator port type &
     b1,              & num_b1 &      & MUST coincide with constants  &
     b2,              & num_b2 &      & from cyadc.work.               &
     a2,              & num_a2 &
     a1,              & num_a1 &
     no_ports,        & num_100kHz_cal and num_no_ratio &
     no_ports,        & num_detector_gnd   &
     no_ports,        & num_ref_100kHz_cal &
     no_ports,        & num_adc_gnd        &
     no_ports,        & num_vcal           &
     no_ports,        & num_vref           &
     no_ports,        & num_temp1          &
     no_ports,        & num_temp2          &
     no_ports;        & num_analog_in      &
BYTE TABLE denominator_control_bits :=& indexed by denom'tor port type &
     b1,              & denom_b1 &
     a1,              & denom_a1 &
     a2,              & denom_a2 &
     no_ports,        & denom_100khz_cal &
     no_ports;        & denom_detector_gnd and denom_no_ratio &
BYTE TABLE lock_control_bits :=     & indexed by phase-lock port type &
     a1,              & lock_to_a1 &
     a2;              & lock_to_a2 &
                      & and lock_donot_care &
ALPHA TABLE number_string :=
     "0"+newline,
     "1"+newline,
     "2"+newline,
     "3"+newline,
     "4"+newline,
     "5"+newline,
     "6"+newline,
     "7"+newline,
     "8"+newline,
     "9"+newline,
     "10"+newline,
     "11"+newline,
     "12"+newline,
     "13"+newline,
     "14"+newline,
```

```
STESTSET.WORK.PD8510          THU, DEC 22, 1983, 11:02 AM     PAGE   5

     "15"+newline;
                                                               & DEBUG &
                                                               & DEBUG &
                                                               & DEBUG &
BOOLEAN SUBROUTINE slow_test_set;                      ENTRY;  & DEBUG &
  BEGIN & slow_test_set &                                      & DEBUG &
     slow_test_set := (switching_speed[driven_port] = non_functional);
  END;  & slow_test_set &                                      & DEBUG &
```

```
STESTSET.WORK.PD8510          THU, DEC 22, 1983, 11:02 AM     PAGE   6

#EJECT;
COMMENT                                                  device_reversed
**************************************************************************
*
* EXTERNAL SPECIFICATION FOR device_reversed
*
* FUNCTION: Resumes a measurement after the user indicates that the
*           device direction has been changed and the device is ready.
*
* PARAMETER DESCRIPTION:
*
*    INPUT:  none
*
*    OUTPUT: none
*
**************************************************************************
*
* LOGIC INFORMATION FOR device_reversed
*
* INITIAL REFINEMENT:
*
*    restart_sweep.
*
**************************************************************************
;
SUBROUTINE device_reversed;                                       ENTRY;
  BEGIN & device_reversed &
     IF waiting_for_device_rdy THEN
        restart_sweep;
     & otherwise, it is just a spurious input &
  END;  & device_reversed &
```

```
STESTSET.WORK.PD8510          THU, DEC 22, 1983, 11:02 AM     PAGE   7

#EJECT;
COMMENT                                                     tell_reverse
**************************************************************************
*
**************************************************************************
;
INTEGER PROCEDURE tell_reverse( parameter );
  VALUE   parameter;
  INTEGER parameter;
  BEGIN & tell_reverse &
     INTEGER device_message;

     IF ( parameter_descriptor[ param[parameter], driven_port ] AND
          reverse_dev_bit
        ) <> 0 THEN
        device_message := reverse_device
     ELSE
        device_message := forward_device;

     tell( device_message );
     tell_reverse := device_message;

  END;  & tell_reverse &
```

```
#EJECT;
COMMENT                                                        set_test_set
*************************************************************************
*
*  Set up test set for the specified param, based on the parameter
*  descriptor.  If the new acquisition parameter (new_param_index) is
*  the same as the prior one, no operation is performed.  For this
*  reason the diagonal elements of the test_set_speed matrix are
*  saved for remembering the previous parameter's switching speeds --
*  see the description above for the test_set_speed array.
*
*  lock_required = TRUE if either the driven or the phase-lock port
*  have changed, indicating a need to phase-lock.
*
*  Reurns FALSE if the pause for device reversal was aborted.
*
*************************************************************************
;
BOOLEAN PROCEDURE  set_test_set( new_param_index, lock_required );
   VALUE   new_param_index;
   INTEGER new_param_index;
   BOOLEAN lock_required;                                     ENTRY;
   BEGIN & set_test_set &
      BYTE    speed,
              lock;
      BOOLEAN success_status;
      INTEGER device_message;
      LABEL   exit;

      lock_required := FALSE;
      success_status := TRUE;

      IF test_set_present AND (new_param_index <> old_param_index) THEN
         BEGIN & if &
            IF old_param_index = rebuilt THEN
               BEGIN & if &
                  old_param_index := new_param_index;
                  old_param := param[old_param_index];
               END;  & if &

            IF new_param_index = (old_param_index + 1) THEN
               trig_priv_ib( test_set )
            ELSE
               wrt_priv_ib( test_set,
                            rc,
                            number_string[new_param_index-1]
                          );

            lock := test_set_speed[ param[new_param_index], old_param ];
            speed := lock AND speed_mask;

            & WAIT IF NECESSARY &
            IF speed <> fast THEN
               IF speed = slow THEN
                  wait( test_set_ready )                & wait for srq &
               ELSE IF speed = reverse_dev THEN
```

```
                  BEGIN & else if &
                     device_message := tell_reverse( new_param_index );
                     gen_menu( DEVICE_READY_MENU, 1 );
                     waiting_for_device_rdy := TRUE;
                     release(control_variables);
                     success_status := break_paused;         & wait &
                     acquire(control_variables);
                     waiting_for_device_rdy := FALSE;
                     clear_message( device_message );
                  END   & else if &
               ELSE & speed = non_functional &
                  warn( illegal_test_set_operation );

            old_param_index := new_param_index;
            old_param := param[old_param_index];
            IF (lock AND phase_lock_bit) <> 0 THEN
               lock_required := TRUE;
         END;  & if &

exit: set_test_set := success_status;

   END;  & set_test_set &
```

```
@EJECT;
COMMENT                                                      build_test_set
*************************************************************************
*
* EXTERNAL SPECIFICATION FOR build_test_set
*
* FUNCTION
*    Set up test-set(s)'s save/recall registers for the parameters
*    described by the parameter descriptor.  Tables for test-set
*    switching speed and whether re-phase-lock is required are built for
*    use by set_test_set.
*
* PARAMETER DESCRIPTION:
*
*    INPUT:  none
*
*    OUTPUT: none
*
* EXTERNAL EFFECTS: Tables are built for use by set_test_set.
*
* COMMENTS:
*
*************************************************************************
*
* LOGIC INFORMATION FOR build_test_set
*
* INITIAL REFINEMENT:
*
*************************************************************************
;
PROCEDURE  build_test_set;                                     ENTRY
   BEGIN & build_test_set &
      BYTE    speed,
              parameter;
      INTEGER from_param,
              to_param;

      & clear test set &
COMMENT something of this sort may be necessary for dual test-set oper'n
      IF test_set_present THEN
         wrt_priv_ib( test_set,
                      clr_fun,
                      "PE0,IC0,SV0,1,2,3,4,5,6,7,MX0"+newline
                    );

      IF ( (test_set_present) AND
           (last_acquisition_param >= first_acquisition_param)
         ) THEN
         BEGIN & if test_set_present &

            speed := fast OR phase_lock_bit;

            FOR to_param := first_acquisition_param UNTIL
                                          last_acquisition_param DO
               BEGIN & to param &
                  parameter := param[ to_param ];
```

```
                  wrt_priv_ib( test_set,
                               ic,
                               number_string[configuration[parameter]]
                             );
                  IF port_enable[parameter] <> non_functional THEN
                     wrt_priv_ib( test_set,
                                  pe,
                                  number_string[port_enable[parameter]]
                                );
                  wrt_priv_ib( test_set,
                               sv,
                               number_string[to_param-1]
                             );
                  IF to_param > first_acquisition_param THEN
                     FOR from_param := first_acquisition_param UNTIL
                                                      (to_param - 1) DO
                        IF ( ( speed_mask AND
                               test_set_speed[ parameter,
                                               param[from_param]
                                             ]
                             ) = reverse_dev
                           ) THEN
                           speed := reverse_dev OR phase_lock_bit;
               END;  & to param &

            FOR parameter := 1 UNTIL max_parameter DO
               test_set_speed[ parameter, parameter ] := speed;

            wrt_priv_ib( test_set,
                         mx,
                         number_string[ last_acquisition_param - 1 ]
                       );

         END;  & if test_set_present &

      old_param_index := rebuilt;  & assures no match with a parameter &

   END;  & build_test_set &
```

```
STESTSET.WORK.PD8510            THU, DEC 22, 1983, 11:02 AM     PAGE  12

#EJECT;
COMMENT                                                   compute_speed_matrix
***************************************************************************
*
***************************************************************************
                                                              &
;
PROCEDURE  compute_speed_matrix;
   BEGIN & compute_speed_matrix &
      BYTE    speed,
              temp,
              from_num_port,
              from_denom_port,
              from_driven_port,
              from_lock_port,
              to_num_port,
              to_denom_port,
              to_driven_port,
              to_lock_port;
      INTEGER to_param,
              from_param,
              port_control_bits;

      INTEGER PROCEDURE get_port( parameter, port );& this saves space &
         VALUE parameter, port;                    & for indexing.    &
         BYTE  parameter, port;
         BEGIN & get_port &
            get_port := parameter_descriptor[ parameter, port ];
         END;  & get_port &

      FOR to_param := 1 UNTIL max_parameter DO
         BEGIN & for to_param &

            to_num_port    := get_port(to_param, numerator_port);
            to_denom_port  := get_port(to_param, denominator_port);
            to_driven_port := get_port(to_param, driven_port);
            to_lock_port   := get_port(to_param, phase_lock_port);

            port_control_bits :=
                           numerator_control_bits[   to_num_port    ] OR
                           denominator_control_bits[ to_denom_port  ] OR
                           lock_control_bits[        to_lock_port   ];

            configuration[ to_param ] := port_control_bits AND %000F;

            IF switching_speed[driven_port] <> non_functional THEN
               port_enable[ to_param ] := to_driven_port AND %003F
            ELSE
               port_enable[ to_param ] := non_functional;


            IF to_param > 1 THEN
               FOR from_param := 1 UNTIL (to_param - 1) DO
                  BEGIN & for from_param &
                     speed := fast;

                     from_num_port     := get_port(from_param,
```

```
STESTSET.WORK.PD8510            THU, DEC 22, 1983, 11:03 AM     PAGE  13

                                                   numerator_port
                                                   );
                     from_denom_port  := get_port(from_param,
                                                   denominator_port
                                                   );
                     from_driven_port := get_port(from_param,
                                                   driven_port
                                                   );
                     from_lock_port   := get_port(from_param,
                                                   phase_lock_port
                                                   );

                     & NUMERATOR PORT SWITCHING SPEED &
                     IF ( (to_num_port <> from_num_port) AND
                          (to_num_port <= num_a1)        AND
                          (from_num_port <= num_a1)
                        ) THEN
                        BEGIN & if &
                           temp := switching_speed[ numerator_port ];
                           IF temp < speed THEN & get slowest speed &
                              speed := temp;
                        END;  & if &

                     & DENOMINATOR PORT SWITCHING SPEED &
                     IF ( (to_denom_port <> from_denom_port) AND
                          (to_denom_port <= denom_a2)        AND
                          (from_denom_port <= denom_a2)
                        ) THEN
                        BEGIN & if &
                           temp := switching_speed[denominator_port];
                           IF temp < speed THEN & get slowest speed &
                              speed := temp;
                        END;  & if &

                     & DRIVEN PORT SWITCHING SPEED &
                     IF to_driven_port <> from_driven_port THEN
                        BEGIN & if &
                           IF ( (to_driven_port XOR from_driven_port)
                                 AND reverse_dev_bit
                              ) <> 0 THEN          & reverse device &
                              temp := reverse_dev
                           ELSE
                              temp := switching_speed[ driven_port ];
                           IF temp < speed THEN & get slowest speed &
                              speed := temp;
                        END;  & if &

                     & PHASE-LOCK PORT SWITCHING SPEED &
                     IF ( (to_lock_port <> from_lock_port) AND
                          (to_lock_port <= lock_to_a2)     AND
                          (from_lock_port <= lock_to_a2)
                        ) THEN
                        BEGIN & if &
                           temp := switching_speed[phase_lock_port];
                           IF temp < speed THEN & get slowest speed &
                              speed := temp;
```

```
STESTSET.WORK.PD8510            THU, DEC 22, 1983, 11:03 AM     PAGE  14

                        END;  & if &

                     & CHECK IF NEED TO PHASE-LOCK &
                     IF ( (from_lock_port   <> to_lock_port) OR
                          (from_driven_port <> to_driven_port)
                        ) THEN
                        speed := speed OR phase_lock_bit;

                     test_set_speed[ from_param, to_param ] := speed;
                     test_set_speed[ to_param, from_param ] := speed;

                  END;  & for from_param &

            test_set_speed[ to_param, to_param ] := fast;

         END;  & for to_param &

   END;  & compute_speed_matrix &
```

```
STESTSET.WORK.PD8510            THU, DEC 22, 1983, 11:03 AM     PAGE  15

#EJECT;
COMMENT                                                     redefine_test_set
***************************************************************************
*
***************************************************************************
;
SUBROUTINE redefine_test_set;                                        ENTRY;
   BEGIN & redefine_test_set &
      compute_speed_matrix;
      old_param := s11;        & Well, you have to start with something &
      old_param_index := rebuilt;
   END;  & redefine_test_set &
```

```
STESTSET.WORK.PD8510          THU, DEC 22, 1983, 11:03 AM      PAGE  16

$EJECT;
COMMENT                                                       preset_test_set
*****************************************************************************
*
* EXTERNAL SPECIFICATION FOR preset_test_set
*
* FUNCTION
*    To initialize the test-set.
*
* PARAMETER DESCRIPTION:
*
*    INPUT:  none
*
*    OUTPUT: none
*
* EXTERNAL EFFECTS:
*
* COMMENTS:
*
*****************************************************************************
*
* LOGIC INFORMATION FOR preset_test_set
*
* INITIAL REFINEMENT:
*
*****************************************************************************
;
PROCEDURE  preset_test_set;                                             ENTRY;
   BEGIN & preset_test_set &
      BYTE ARRAY id_array[-1:id_size];
      BYTE    parm,
              temp,
              atten_nmbr,
              ch_atten_port;
      BOOLEAN test_set_changed;
      INTEGER chan,
              parameter,
              domain,
              port_type,
              index;
      ALPHA   id_string;
      QUAD    min,
              mid,
              max;

      SUBROUTINE set_atten;
         BEGIN & set_atten &
            wrt_priv_ib(test_set,
                        atten_nmbr,
                        append_ch(format_real(
                                  ch_real( ch_atten_port, chan ),
                                  id_string,
                                  format_table[test_set_atten_format]
                                             ),
                                 newline
                                )
```

```
STESTSET.WORK.PD8510          THU, DEC 22, 1983, 11:03 AM      PAGE  17

                       );
         END;  & set_atten &


      & initialize string &
      id_string := ADRS(id_array);
      id_string := init_string( id_string, id_size );

      clr_priv_ib(test_set);
      test_set_present := wrt_priv_ib( test_set,
                                       clr_fun,
                                       "IPRM255CS" + newline
                                     );
      IF test_set_present THEN
         read_priv_ib(test_set, oi, "", id_string)
      ELSE
         id_string := append_string( id_string,
                         ";5.0E08,1.8E10;4.5E07,9.99E11;" +
                         "1,1,1,1;2,1,1,1;1,2,2,2;2,2,2,2;2,2,2,2,0;"
                                   );
      IF test_set_debug THEN                                       & DEBUG &
         BEGIN & if &                                              & DEBUG &
            CRLF; WSTR(id_string); CRLF;                           & DEBUG &
         END;  & if &                                              & DEBUG &

COMMENT  this code allows the 8510 to avoid overwriting user modified
         parameter definitions as long as the physical test set has not
         changed.  It must be modified to assure that the proper data
         is build into the parameter definitions for power-on, preset,
         recall, etc.          ;
      test_set_changed := FALSE;
      index := 1;
      WHILE id_array[index] <> '; DO
         BEGIN & while &
            IF index <= old_id_size THEN
               BEGIN & if &
                  IF old_id[index] <> id_array[index] THEN
                     test_set_changed := TRUE;
                  wrt_disp_byte( ADRS(old_id[index]), id_array[index] );
               END;  & if &
            index := index + 1;
         END;  & while &
      test_set_changed := TRUE;   & override the above result && DEBUG &

      IF test_set_changed THEN
         BEGIN & if &
            index := index + 1;                     & skip over semi-colon &

            & test-set specification frequency limits &
            min := CNV9A( id_string, index );
            max := CNV9A( id_string, index );
            IF ( (recall_type = preset_recall) OR
                 (recall_type = test_recall)
               ) THEN
               BEGIN & if &
                  mid := (max + min)/2;
```

```
STESTSET.WORK.PD8510          THU, DEC 22, 1983, 11:03 AM      PAGE  18

                  FOR chan := 1 UNTIL 2 DO
                     BEGIN & for &
                        set_ch_quad( min, ch_start_frequency,  chan);
                        set_ch_quad( mid, ch_center_frequency, chan);
                     END;  & for &
               END;  & if &

            & hard (absolute) test-set frequency limits &
            min := CNV9A( id_string, index );
            max := CNV9A( id_string, index );

            & changing domains is a kludge, but nice solution is pain. &
            FOR chan := 1 UNTIL 2 DO
               BEGIN & for &
                  domain := ch_integer( ch_domain, chan );
                  set_ch_integer( freq_domain, ch_domain, chan );
                  ch_set_active_limits( min, max, active_start, chan );
                  set_ch_integer( domain, ch_domain, chan );
               END;  & for &

            & GET PARAMETER DESCRIPTIONS &
            FOR parameter := s11 UNTIL s22 DO
               FOR port_type := numerator_port UNTIL phase_lock_port DO
                  BEGIN & for &

                     temp := CNV9A(id_string,index);

                     IF temp = 0 THEN
                        BEGIN & if &
                           CASE parameter-1 OF & get param, other port &
                              BEGIN & case &
                     & s11 &     parm := s22;
                     & s21 &     parm := s12;
                     & s12 &     parm := s21;
                     & s22 &     parm := s11;
                              END;  & case &
                           temp := parameter_descriptor[ parm,
                                                         port_type
                                                       ];
                           IF port_type = driven_port THEN
                              temp := temp OR reverse_dev_bit;
                        END   & if &
                     ELSE
                        temp := port_map[ 3*port_type + temp ];

                     parameter_descriptor[parameter, port_type] := temp;

                  END;  & for &

            & GET SWITCHING SPEEDS &
            FOR port_type := numerator_port UNTIL attenuator DO
               BEGIN & for &
                  temp := CNV9A(id_string, index);
                  IF temp = 0 THEN
                     temp := non_functional;
                  switching_speed[port_type] := temp;
```

```
STESTSET.WORK.PD8510          THU, DEC 22, 1983, 11:03 AM      PAGE  19

               END;  & for &

            IF switching_speed[attenuator] <> non_functional THEN
               BEGIN & if attenuator present &
                  chan := 1;  & until two test-set capability is added &
                  atten_nmbr := atten1;
                  ch_atten_port := ch_atten_port1;
                  set_atten;

                  atten_nmbr := atten2;
                  ch_atten_port := ch_atten_port2;
                  set_atten;
               END;  & if attenuator present &

            compute_speed_matrix;

         END;  & if &

      old_param := s11;       & Well, you have to start with something &
      old_param_index := rebuilt;

   END;  & preset_test_set &

END$                                                             & DEBUG &
            IF test_set_debug THEN                               & DEBUG &
               BEGIN & if debug &                                & DEBUG &
                  WSTR("test-set(f/t): ");                       & DEBUG &
                  WHEX(old_param_index);                         & DEBUG &
                  WHEX(new_param_index);                         & DEBUG &
                  CRLF;                                          & DEBUG &
               END;  & if debug &                                & DEBUG &


      IF test_set_debug THEN                                     & DEBUG &
         BEGIN & if debug &                                      & DEBUG &
            CRLF;                                                & DEBUG &
            WSTR("compute test_set_speed: ");                    & DEBUG &
            CRLF;                                                & DEBUG &
            FOR from_param := 1 UNTIL max_parameter DO           & DEBUG &
               BEGIN & for from_param &                          & DEBUG &
                  WHEX( from_param ); WSTR("  ");                & DEBUG &
                  FOR to_param := 1 UNTIL max_parameter DO       & DEBUG &
                     BEGIN & for to_param &                      & DEBUG &
                        WHEX(test_set_speed[ from_param,         & DEBUG &
                                             to_param            & DEBUG &
                                           ]                     & DEBUG &
                            );                                   & DEBUG &
                     END;  & for to_param &                      & DEBUG &
                  CRLF;                                          & DEBUG &
               END;  & for from_param &                          & DEBUG &
            CRLF;                                                & DEBUG &
         END;  & if debug &                                      & DEBUG &
```

```
FTIME.WORK.PD8510              THU, DEC 22, 1983, 11:03 AM     PAGE   1

PROCEDURE  control_data_proc_time( channel );
   VALUE channel; INTEGER channel;                               EXTERNAL.L;
PROCEDURE  array_datap( ch ) ;  VALUE ch;   INTEGER ch;          EXTERNAL.L;
PROCEDURE tdr_check;                                             EXTERNAL.L;
```

```
STIME.WORK.PD8510              THU, DEC 22, 1983, 11:03 AM     PAGE   1

M68KL,P,"time"
BEGIN
COMMENT
**************************************************************************
* This module contains the code for the TIME DOMAIN and GATING functions
*
*
* things to do
*     combine and place in subroutine the MPYE and save in memory ??
*     replace preempt in mpy_array, fftun, etc with preempt and read
*                                                    array fifo
**************************************************************************
;

#FILE cdebug.work;                                              &DEBUG&
#FILE fterm.work;                                               &DEBUG&
#FILE fterm2.work;                                              &DEBUG&
#FILE fterm3.work;                                              &DEBUG&
#FILE fdatap.work;
#FILE futil.work;
#FILE futil2.work;
#FILE fkernel.work;
#FILE fkernel4.work;                                           &preempt&
#FILE fchdata.work;
#FILE cchtable.work;
#FILE fchtable.work;                                   &current_entry_ch&
#FILE fchtab2.work;                                    &ch_quad, ch_real&
#FILE fmemmgr.work;
#FILE fsize.work;
#FILE fstimuli.work;

PROCEDURE copy_user3( from_addr, to_addr, size );
                     VALUE from_addr, to_addr, size;
                    DOUBLE from_addr, to_addr; INTEGER size; EXTERNAL;
PROCEDURE ifft(adr);      VALUE adr;      DOUBLE adr;          EXTERNAL.L;
PROCEDURE  fft(adr);      VALUE adr;      DOUBLE adr;          EXTERNAL.L;
PROCEDURE fftun(adr);     VALUE adr;      DOUBLE adr;          EXTERNAL.L;
REAL PROCEDURE BESI(x);   VALUE x;        REAL x;              EXTERNAL;
REAL PROCEDURE SQRT(x);   VALUE x;        REAL x;              EXTERNAL;
REAL PROCEDURE  SIN(x);   VALUE x;        REAL x;              EXTERNAL;
REAL PROCEDURE  COS(x);   VALUE x;        REAL x;              EXTERNAL;
SUBROUTINE MPYE_ptrs;                                          EXTERNAL;
SUBROUTINE MPYE_ptr;                                           EXTERNAL;
SUBROUTINE MPYE;                                               EXTERNAL;
SUBROUTINE DIVE_ptr;                                           EXTERNAL;
SUBROUTINE fetch_CMVE1;                                        EXTERNAL;
REAL PROCEDURE CMV2E(x); VALUE x;         REAL x;              EXTERNAL;
SUBROUTINE magE;                                               EXTERNAL.L;
SUBROUTINE angE;                                               EXTERNAL.L;
SUBROUTINE DVR2;                                               EXTERNAL;
SUBROUTINE fst_trig_long;                                      EXTERNAL.L;
SUBROUTINE fst_trig;                                           EXTERNAL.L;
SUBROUTINE array_correct;                                      EXTERNAL.L;
SUBROUTINE array_elec_length;                                  EXTERNAL.L;
EXTERNAL REAL TwoPi, Pi;
```

```
STIME.WORK.PD8510              THU, DEC 22, 1983, 11:03 AM     PAGE   2


DOUBLE dp_scr_array_time,
       dp_scr_array_freq,
       chirp_array,
       stim_array,
       gate_array,
       pre_gate_array,
       post_gate_array,
       old_FsTs;
INTEGER num_pts,
        chan,
        domain,
        gate_domain,
        stim,
        flag;
REAL   Fo,  Fs,
       gate_cen_Fs,
       x0;                              &computed dc values&
INTEGER CONSTANT impulse := impulse_tdr,
        nop := 0,    mpy  := 1,   sum := 2;

GLOBAL                                                          &debug&
INTEGER TABLE time_wind := 0,   6,   13;
INTEGER TABLE  pre_wind := 4;
INTEGER TABLE gate_wind := 2,   5,  5,    8;
INTEGER TABLE gate_size := 2,   2,  5,   10;
```

```
STIME.WORK.PD8510              THU, DEC 22, 1983, 11:03 AM     PAGE   3

#EJECT;COMMENT                                                  tdr_check
**************************************************************************
*
**************************************************************************
;
PROCEDURE tdr_check;                                               ENTRY;
BEGIN
 QUAD step ,
      pts ;
   pts := QUAD(number_of_points);
   step:=(( 2 * ch_quad( ch_center_frequency ,current_entry_ch ) )
              - ch_quad( ch_start_frequency , current_entry_ch ) )/ pts;
   IF step < 45000000 THEN step := 45000000;
   wrt_priv_ib_source_freq( step, pts * step );
   tell( tdr_freq_change );

   COMMENT  -- beware of 8350 reounding problems
            compute and compare old and new start/centers ;

END  tdr_check;
```

```
STIME.WORK.PD8510                THU, DEC 22, 1983, 11:03 AM     PAGE   4

#EJECT;COMMENT                                              control_data_proc_time
**************************************************************************
*
**************************************************************************
;
PROCEDURE  control_data_proc_time( channel );
   VALUE   channel;
   INTEGER channel;                                                  ENTRY;
   BEGIN & control_data_proc_time &
      flag := 0;
   END;  & control_data_proc_time &
```

```
STIME.WORK.PD8510                THU, DEC 22, 1983, 11:03 AM     PAGE   5

#EJECT;COMMENT
**************************************************************************
*
* results in a fracitional part x 2^^32
**************************************************************************
;
DOUBLE PROCEDURE cyc_frac(x);     VALUE x;      REAL x;           ENTRY;
BEGIN
BYTE xexp=x+3, exp;
DOUBLE xd=x;

  exp := xexp+1;
  xd  := xd AND %FFFFFF00;
  cyc_frac := IF  exp<0  THEN  ARIGHT(xd,-exp)  ELSE  ALEFT(xd,exp);

END cyc_frac;
```

```
STIME.WORK.PD8510                THU, DEC 22, 1983, 11:03 AM     PAGE   6

#EJECT; COMMENT
**************************************************************************
*  compute_dc_value is a copy of Dave's routine from his report
*
*  Averaging the pt-1, pt_2 values would provide more dc stability, and
*    improve baseline stability also.
*  Probaby a fix value exp averaging that is reset on any control_time
*    changes and on measurment restart, and ??????????
**************************************************************************
end of comment;
PROCEDURE   compute_dc_value;
BEGIN
REAL x1, y1,
     x2, y2,
     x_delta,   x_temp,
     raduis,    x_center;

ASSEMBLE( MOVE.L dp_scr_array_freq, R8;
          JSR    fetch_CMVE1;   MOVE.L R0,x1;   MOVE.L R1,y1;
          ADD.W  #6,R8;
          JSR    fetch_CMVE1;   MOVE.L R0,x2;   MOVE.L R1,y2);

 IF ABS( (x_delta := x2 - x1 ) ) >.001 THEN
    BEGIN     & x seperation enought to aviod noise or DIV by Zero &
    x_center := .5 *( x2 + x1 + ( y2 + y1 )*( y2 - y1 ) / ( x_delta ));
                              & DANGER   x2 = x1 problems &
    x_temp   :=   x1 - x_center;
    raduis   :=   SQRT(  ( x_temp*x_temp ) + ( y1*y1 )  ) ;
    x0       :=   x_center  +  ( IF y1<0 THEN raduis ELSE -(raduis) ) ;
    END
   ELSE  & signal too small or too close &
    x0 := x1;
 CMV2E( x0 );
 ASSEMBLE( MOVE.L  dp_scr_array_time, R8;       MOVE.W =H0, (R8)+;
           NOP;                                 MOVE.W  R0, (R8)+;
           NOP;                                 MOVE.W  R1, (R8)+   );
END;


REAL PROCEDURE   compute_tg0_value;
BEGIN
REAL delta_ang ;
  ASSEMBLE( MOVE.L dp_scr_array_time, R8;
            MOVE.L (R8)+,     R0;             MOVE.W (R8)+,    R1;
            JSR    DIVE_ptr;
            JSR    angE;
            MOVE.L  R0, delta_ang   );
   compute_tg0_value := delta_ang / ( 360. * Fs );
END compute_tg0_value;
```

```
STIME.WORK.PD8510                THU, DEC 22, 1983, 11:03 AM     PAGE   7

#EJECT;COMMENT
**************************************************************************
*
*   sum in ramp portion of step response
*     see Dave's report pg6,7, this is presently only the linear portion
**************************************************************************
;
PROCEDURE td_ramp(adr, FsTo, FsTs, pts);
              VALUE adr, FsTo, FsTs, pts;
              DOUBLE adr;  REAL FsTo, FsTs;  INTEGER pts;
 BEGIN
   DOUBLE ptr12 = REGISTER 12;                       & freeze use of R12 &
   REAL t, correction;

   t  := FsTo;
   ptr12 := adr;

   REPEAT pts DO                  &do the H(0) * Fs * T ramp correction &
      BEGIN
      correction  :=   ( x0 * t ) ;
      ASSEMBLE (  MOVE.W  =H0,   (R12)+;    & clear imag part &
                  MOVE.L  correction, R0;
                  MOVE.L  (R12),  R1;        JSRX  ADD2;
                  SWAP    R0;                MOVE.W   R0,(R12)+;
                  SWAP    R0;                MOVE.W   R0,(R12)+   );
      t       :=  t + FsTs;                              &becomes FsT &
      END pts loop;

 END td_ramp;
```

```
STIME.WORK.PD8510                THU, DEC 22, 1983, 11:03 AM    PAGE  8

#EJECT;COMMENT
************************************************************************
*
*   two array multiply
************************************************************************

;
PROCEDURE array_mpy( adr1, adr2, pts);
           VALUE adr1,adr2,      & input1, input2 ( output )&
                 pts; INTEGER pts;    & array size &
          DOUBLE adr1,adr2;
BEGIN
INTEGER loopctr = REGISTER 7;
LABEL loop, test;
   ASSEMBLE(
                 MOVE.L  adr1,  R8;
                 MOVE.L  adr2,  R10;
                 MOVE.L   R10,  R13;
                 MOVE.W  pts,   loopctr;
                 BRA     test;
          loop: JSR     MPYE_ptrs;
                 SWAP    R0;                  MOVE.W  R0,  (R13)+;
                 SWAP    R0;                  MOVE.W  R0,  (R13)+;
                 NOP;                         MOVE.W  R1,  (R13)+;
          test: DBRA    loopctr, loop                              );

   preempt;
 END array_mpy
```

```
STIME.WORK.PD8510                THU, DEC 22, 1983, 11:03 AM    PAGE  9

#EJECT;COMMENT
************************************************************************
          zero out imag part ( only real )
************************************************************************

;
 PROCEDURE array_zero_imag(adr, pts ); VALUE adr ,pts ;
                                               DOUBLE adr;     INTEGER pts ;
 BEGIN
  INTEGER loopctr=REGISTER 7;
  LABEL loop, test;
  ASSEMBLE(
            MOVE.L   adr,  R8;
            MOVE.W   pts,  loopctr;
            BRA      test;
      loop: MOVE.W   =H0,(R8);
            ADDQ     #6,  R8;
      test: DBRA     loopctr, loop              );
 END array_zero_imag;

COMMENT
************************************************************************
          zero out array  R11 has ptr,  R4 has repeat count
************************************************************************

;
SUBROUTINE  array_zero;
BEGIN
LABEL loop, test;
ASSEMBLE(
                BRA     test;
        loop:   MOVE.W  =H0,(R11)+;    NOP;
                MOVE.W  =H0,(R11)+;    NOP;
                MOVE.W  =H80,    (R11)+;
        test:   DBRA    R4,    loop           );
END array_zero;

PROCEDURE user3_zero( addr, numb);
                VALUE addr, numb; DOUBLE addr; INTEGER numb;       ENTRY;
BEGIN
    ASSEMBLE(   MOVE numb, R4;  MOVE.L addr, R11;  BSR array_zero );
END user3_zero;
```

```
STIME.WORK.PD8510                THU, DEC 22, 1983, 11:03 AM    PAGE  10

#EJECT; COMMENT
************************************************************************
* builds the chirp array -- builds it in three stages
*       stage 1 the zero pt
*       stage 2 the first and last segments which are mirror images
*               and are pts - 1 long
*       stage 3 the middle segment is zeroed out -- this is size+1-2*pts
************************************************************************

end of comment;
PROCEDURE build_chrip( adr, pts, FsTs );  VALUE adr, pts, FsTs;
                                  DOUBLE adr, FsTs;  INTEGER pts;
BEGIN
INTEGER POINTER ptr11=REGISTER 11, ptr12=REGISTER 12;
DOUBLE ang_delta=REGISTER 5, ang_inc=REGISTER 6, ang=REGISTER 7;
INTEGER loopctr =REGISTER 4;
LABEL loop, test;

     STPNTR(ptr11, adr); STPNTR(ptr12, adr+6144);
     ASSEMBLE(MOVE.W =H0,(R11)+;      MOVE =H4000, (R11)+    ;
              MOVE.W =H1,(R11)+           );  & set first val = 1.0&

     ang_delta :=  -FsTs;
     ang_inc   := ang := ARIGHT(ang_delta,1);
      ASSEMBLE(                                  & R11 is first segment &
              MOVE.W pts, loopctr;               & R12 is last  segment &
              SUB    #1, loopctr;
              BRA    test;
       loop:  MOVE.L ang, R0;            JSR  fst_trig_long;
              SWAP   R0;                 MOVE.W   R0, (R11)+;    &imag&
              SWAP   R0;                 MOVE.W   R0, (R11)+;    &real&
              ADD.L  ang_delta,ang_inc;  MOVE.W  =H0, (R11)+;    &exp &
              ADD.L  ang_inc,ang;        MOVE.W  =H0, -(R12);    &exp &
              NOP    R0;                 MOVE.W   R0, -(R12);    &real&
              SWAP   R0;                 MOVE.W   R0, -(R12);    &imag&
       test:  DBRA   loopctr, loop                 );

      ASSEMBLE(
               MOVE.W =D1024, loopctr;     ADD.W  #1,     loopctr;
               SUB.W   pts,   loopctr;     SUB.W  pts,    loopctr;
               BSR     array_zero      );    &  R11 is adr, R4 count &

     ifft(adr); fftun (adr);                   & includes a preempt &

END build_chirp;
```

```
STIME.WORK.PD8510                THU, DEC 22, 1983, 11:03 AM    PAGE  11

#EJECT;COMMENT
************************************************************************
* special routine for use by the run time chirp
************************************************************************

end of comment;
SUBROUTINE mpy_chirp;
    BEGIN
    LABEL loop, test;
    INTEGER loopctr=REGISTER 4;
    DOUBLE ang_delta=REGISTER 5, ang_inc=REGISTER 6, ang=REGISTER 7;
    ASSEMBLE(
                  BRA     test;
            loop: MOVE.L  ang, R0;  JSR fst_trig_long;  CLR.W R1;
                  MOVE.L  R11,  R8;
                  JSR     MPYE_ptr;
                  SWAP    R0;                 MOVE.W   R0, (R11)+;
                  SWAP    R0;                 MOVE.W   R0, (R11)+;
                  ADD.L   ang_inc, ang;       MOVE.W   R1, (R11)+;
                  ADD.L   ang_delta, ang_inc;
            test: DBRA    loopctr, loop                         );
END mpy_chirp;
```

```
STIME.WORK.PD8510              THU, DEC 22, 1983, 11:03 AM     PAGE  12

#EJECT;COMMENT
****************************************************************************
****************************************************************************
end of comment;
PROCEDURE chirpxfm(adr1,adr2,pts,FsTs,FsTo,FoTs,FoTo);
    VALUE adr1,adr2,  & adr ptr to scr and chirp arrays &
          pts,       & # of freq pts available , # of time points &
          FsTs,FsTo,    & FreqStepTimeStep, FreqStepTimeInit  products &
          FoTs,FoTo:    & FreqInitTimeStep, FreqInitTimeInit  products &
    DOUBLE adr1,adr2;
    INTEGER pts; DOUBLE FsTs,FsTo,FoTs,FoTo;
BEGIN
    DOUBLE ang_delta=REGISTER 5, ang_inc=REGISTER 6, ang=REGISTER 7;
    INTEGER POINTER ptr11=REGISTER 11, ptr12=REGISTER 12;
    INTEGER loopctr=REGISTER 4;

      &  the actual chirp-Z code &
      &  see DAVE'S paper        &

    ang_delta := FsTs;
    ang_inc   := ang := FsTo + ARIGHT(ang_delta,1);
    ang_inc   := ang_inc  + ang_delta;
    loopctr:=pts-1;
    STPNTR(ptr11,adr1+6);           & skip first mpy -- it is by one &
    mpy_chirp;

    ASSEMBLE(  MOVE.W   =D1024, loopctr;     SUB.W  pts, loopctr;
               BSR      array_zero                );



    ifft(adr1); fftun(adr1);                   & includes a preempt &

    &NOTE: UNSCRAMBLING NOT REQUIRED IN CHIRPXFM IF A SECOND
          FFT IS WRITTEN THAT ACCEPTS SCRAMBLED INPUTS.&


    array_mpy( adr2, adr1, 1024 );                   & CONVOLUTION &

    fft(adr1); fftun(adr1);                    & includes a preempt &



    STPNTR(ptr11, adr1);
    ang_delta := FsTs;
    ang_inc   := FoTs + ARIGHT(ang_delta,1);       ang := FoTo;
    loopctr:=pts;                                  &mpy by  down chirp &
    mpy_chirp;

  END chirpxfm;
```

```
STIME.WORK.PD8510              THU, DEC 22, 1983, 11:03 AM     PAGE

#EJECT; COMMENT
****************************************************************************
*generate a window array -- with various parameters
****************************************************************************
;
REAL PROCEDURE td_window(adr, wind_parm, mode, pts, opt);
     VALUE  adr,wind_parm,mode, & array adr,  window parm, mode&
            pts,opt;            & number of data pts,&
       DOUBLE adr; INTEGER wind_parm, mode, pts, opt;
 BEGIN
  REAL parm,X,G,FN,SUM,norm;  INTEGER N;  BOOLEAN rect;
  DOUBLE POINTER ptr12=REGISTER 12;
  COMMENT                                          mode
                                                     0 BASEBAND
                                                   2,3 PASS BAND    RF,RF-ENV ;

   IF mode = tdr_domain THEN   N:= 0  ELSE N:= -ARIGHT(pts-1, 1) ;
   SUM:=0.;

   FN := 2.0/REAL(pts -1);                                        &rf modes&
   IF mode = tdr_domain THEN FN := .5 * FN;                       &baseband&

   rect := ( wind_parm = 0 );
   parm := REAL( wind_parm );

   norm:=1./BESI(parm);


   STPNTR(ptr12,adr);                  &besi and Sqrt do not use reg12&
  REPEAT pts DO                                 &compute/store window loop&
   BEGIN
    X:=REAL(N)*FN;

    IF (N=0) OR rect THEN G:=1.0 ELSE
     G:=BESI( parm * SQRT( 1- X*X ) )  * norm ;              &bess&


    IF opt = sum THEN BEGIN                                          &sum&
       IF N>0 AND mode=tdr_domain THEN G:=2.*G;&double for non dc terms&
       SUM:=SUM+G; END;                                     & MOVE ???? &

    CNV2E( G );

    IF opt = mpy THEN ASSEMBLE(   MOVE.L R12,R8; JSR MPYE_ptr   );

    ASSEMBLE( SWAP R0;     MOVE.W R0,(R12)+; SWAP R0;  MOVE.W R0,(R12)+;
              ADD.W #1,N;  MOVE.W R1,(R12)+    );
  END pts loop ;

  preempt;
  td_window:=SUM;
  END td_window;
```

```
STIME.WORK.PD8510              THU, DEC 22, 1983, 11:03 AM     PAGE  14

#EJECT;COMMENT
****************************************************************************
*
****************************************************************************
;
PROCEDURE td_stim(adr,stim,parm,mode,pts);
   VALUE adr,stim,parm, & array adr, stim,  windowparm &
               mode,pts ;& window mode, # of freq pts, int pt posit&
          DOUBLE adr; INTEGER parm,stim,mode,pts;
 BEGIN
  COMMENT STIM 0  IMPULSE
               1  STEP
               2  SQUARE WAVE       END;
  REAL G1,G0,G,GS;
  INTEGER POINTER ptr12=REGISTER 12;
  INTEGER  N;
  BOOLEAN REALG;

  G1:=td_window(adr,parm,mode,pts, sum);            &create window first&
                                                     &remember area &
        &COMPENSATE FOR LACK OF 1/N IF ifft&
  G0:= 1.0/(G1*1024.);       &Normalize to height,&
  GS:=-1.0/(1024.*TwoPi);  &for step \ area is 1, no normalizing needed&

  STPNTR(ptr12,adr); N:=0;
  REPEAT pts DO BEGIN
   REALG := TRUE;
   IF stim = impulse THEN  G := G0
    ELSE  BEGIN IF N<>0 THEN BEGIN G:=GS/REAL(N);  REALG := FALSE; END
                ELSE  G:=%400000F6 &1/2048&;               END else ;

   CNV2E( G );
   IF NOT REALG THEN                       &remove &        &zero real ie 1/j&
               ASSEMBLE(SWAP R0);  & poor man's 1/j  swap real/imag  &

   ASSEMBLE( MOVE.L R12,R8;  JSR  MPYE_ptr;
             SWAP R0;     MOVE.W R0,(R12)+;  SWAP R0;  MOVE.W R0,(R12)+;
             ADD.W #1,N;  MOVE.W R1,(R12)+   );      &create window/stim&
   END loop;                                           & overstore window &

  END td_stim ;
```

```
STIME.WORK.PD8510              THU, DEC 22, 1983, 11:03 AM     PAGE  15

#EJECT; COMMENT.
****************************************************************************
****************************************************************************
end of comment;
PROCEDURE do_time_domain;
BEGIN
REAL To, Ts, tg0;

DOUBLE FoTo, FoTs, FsTo, FsTs, phase ;
INTEGER wind ;

    To  :=  REAL( ch_quad( ch_start_time , chan ) );
    Ts  :=  REAL( ch_quad( ch_center_time, chan ) )  - To ;
    To  := To * 1@-15;      Ts  := Ts * 2@-15 / REAL( num_pts - 1 );

    FoTo := cyc_frac( Fo * To );          &Fo has special val in Env &
    FoTs := cyc_frac( Fo * Ts );
    FsTo := cyc_frac( Fs * To );
    FsTs := cyc_frac( Fs * Ts );


         & add freq / time  / window / stim  change test &
         &  here    or in calling routine  -- for gating use &
    IF FsTs # old_FsTs THEN BEGIN  old_FsTs := FsTs;   flag := 0;  END;
```

```
#EJECT;
  IF (memory_stolen(chirp_array, td_chirp_arrays_id, (6144+array_size))
          OR ( flag = 0) ) AND (chirp_array # 0) THEN
      BEGIN
      tell( comp_time_coeff );
      build_chrip( chirp_array , num_pts, *FsTs );
      IF domain = tdr_domain THEN
         BEGIN
         stim := ch_integer( ch_tdr_stimulus_type , chan );
         END
       ELSE  &time_domain domain&
         BEGIN
         stim :=  impulse;
         END;
      wind      := time_wind[  ch_integer( ch_time_window, chan ) ];
      stim_array :=  chirp_array  + 6144;
      td_stim(  stim_array , stim, wind,  domain, num_pts );
      clear_message( comp_time_coeff );
      END;

   IF chirp_array # 0 THEN
      BEGIN

      IF domain = tdr_domain THEN
         BEGIN
           & correct dc phase for phase offset &
         phase := DOUBLE(ch_real(ch_phase_offset, chan) * -728.17778 );
         ASSEMBLE(  MOVE.L  phase,  R0;                     &2**18 / 360 &
                    JSR     fst_trig;             CLR.W  R1;
                    MOVE.L  dp_scr_array_time, R8;
                    JSR     MPYE_ptr;
                    MOVE.L  dp_scr_array_time, R8;
                    SWAP    R0;      MOVE.W  R0, (R8)+;
                    SWAP    R0;      MOVE.W  R0, (R8)+;
                    SWAP    R0;      MOVE.W  R1, (R8) ;
                    MOVE.W  R1,R0;   MOVE.L  R0, *0       );
         tg0 :=  compute_tg0_value ;
         END;

      array_mpy( stim_array, dp_scr_array_time, num_pts );
                                                   &window / stim &
      chirpxfm(  dp_scr_array_time, chirp_array,  num_pts,
                 FsTs, FsTo, FoTs, FoTo  );

      IF domain = tdr_domain THEN
         BEGIN
         IF stim = impulse_tdr THEN
               array_zero_imag(dp_scr_array_time, num_pts )
          ELSE td_ramp( dp_scr_array_time, Fs*(To-tg0),Fs*Ts, num_pts);
         END tdr_domain cleanup ;

      release_auxiliary_memory( chirp_array ,td_chirp_arrays_id  ) ;
      END
   ELSE
      warn( exceeded_available_memory );
```

```
END do_time_domain;
```

```
#EJECT; COMMENT
**********************************************************************
**********************************************************************
end of comment;
PROCEDURE build_gate( gate_adr, pts, gate_parm, real_only_flg );
                 VALUE gate_adr, gate_parm, pts, real_only_flg;
        DOUBLE gate_adr; INTEGER gate_parm, pts; BOOLEAN real_only_flg;
BEGIN
  INTEGER loopctr=REGISTER 4;
  DOUBLE   temp12=REGISTER 12;       & prevents local use of R12  &
  DOUBLE   exp_step,
           exp_parm,
           temp = exp_parm;
  REAL Go, GoFs, GnFs, GspanFs,
       pt_0,
       sin_step, sin_den,
       sin_real,
       n_real;
  INTEGER  n, loop,
       mant_pt_0 = pt_0,  exp_pt_0 = pt_0 + 2;

    pts := ( (pts-1)/gate_size[gate_parm]) + 1 ;  &MAX GATE -TDR mode??&

    GoFs:= Fs * ( Go := REAL(ch_quad(ch_gate_start, chan))*1@-15 );
    GnFs:= Fs * ( 2.0 * REAL(ch_quad(ch_gate_center,chan))*1@-15 - Go );
    IF (GspanFs := GnFs - GoFs ) > 1.0 THEN  GspanFs:= 1.0;

    pt_0  :=  GspanFs / 1024.;            &scaling fft ???????&
    sin_step := Pi * GspanFs ;
    sin_den  := Pi * 512. ;               &scaling fft ???????&

    IF real_only_flg THEN
      BEGIN   pt_0 := pt_0 * 2.0 ;  sin_den :=  sin_den / 2.;  END;

    gate_cen_Fs := ( GoFs + GnFs ) / 2. ;
    exp_step := exp_parm := cyc_frac( -gate_cen_Fs );

    ASSEMBLE(     MOVE.L  gate_adr, R12;        MOVE.W  pts,   loop;
                  MOVE.W  =H0,       (R12)+;    SUB.W   #1,    loop;
                  MOVE.W  mant_pt_0,(R12)+;     MOVE.W  #1,    n;
                  MOVE.W  exp_pt_0, (R12)+         );
```

```
#EJECT;
    REPEAT loop DO
      BEGIN
      n_real:= REAL( n );
      sin_real := SIN( sin_step * n_real ) / (sin_den * n_real) ;
                     & SIN  does not use R12 --- rewrite this mess  &
      ASSEMBLE(   MOVE.L  exp_parm, R0;     JSR fst_trig_long;
                  CLR.W   -(S);             MOVE.L  R0, -(S);
                  MOVE.L  sin_real, R0;     JSR CMV2E;
                  MOVE.L  S,    R8;         JSR MPYE_ptr;
                  SWAP    R0;               MOVE.W  R0,    (R12)+;
                  SWAP    R0;               MOVE.W  R0,    (R12)+;
                  ADD.W   #6, S;            MOVE.W  R1,    (R12)+   );
      n := n + 1;
      exp_parm  := exp_parm  +  exp_step;
      END loop;

    ASSEMBLE(   MOVE.L  R12, R11;                          & zero fill &
                MOVE.W  =D1024, loopctr;     SUB.W  pts,   loopctr;
                BSR     array_zero      );    &  R11 is adr, R4 count &

    td_window( gate_adr, gate_wind[ gate_parm ], tdr_domain,
                         pts,  mpy );

    fft( gate_adr );    fftun( gate_adr );     &only the real part used&
                                               & perhaps shorter array &
                                               & includes a preempt &

END build_gate;
```

```
STIME.WORK.PD8510                THU, DEC 22, 1983, 11:03 AM     PAGE 20

#EJECT; COMMENT
**********************************************************************
**********************************************************************
end of comment;
PROCEDURE gate( data_adr, gate_adr, pts, real_only_flg);
        VALUE  data_adr, gate_adr, pts, real_only_flg ;
        DOUBLE data_adr, gate_adr; INTEGER pts; BOOLEAN real_only_flg;
BEGIN
  LABEL exp_test,loop, test;
  INTEGER offset;
  INTEGER loopctr=REGISTER 4;

      offset := 6 * pts;
      ASSEMBLE(                              & zero fill data array&
              MOVE.L data_adr,  R11;         ADD.W  offset,  R11;
              MOVE.W =D1024, loopctr;        SUB.W  pts,   loopctr;
              BSR     array_zero      );       &  R11 is adr, R4 count &

      IF real_only_flg THEN
         ASSEMBLE(                                     &half 1st pt??&
              MOVE.L  data_adr,    R11;      ADD.W   #4,  R11;
              MOVE.W  (R11),       R0;       SUB.B   #1,  R0;
              BVC     exp_test;              ADD.B   #1,  R0;
      exp_test:MOVE.W   R0,        (R11)     );

      fft( data_adr );    fftun( data_adr );& includes a preempt &


     ASSEMBLE(
               MOVE.L  gate_adr, R10;   MOVE.L  data_adr,  R8;
               MOVE.W  =D1024,loopctr;  MOVE.L   R8,       R13;
               MOVE.L  #-1,       R5;
               BTST    =D0,  real_only_flg;
               BEQ     test;              &if flg false (0) branch &
               MOVE.L  =HOFFFF,  R5;      &real data only mask&
               BRA     test;
         loop: MOVE.L   (R8)+,  R0;      MOVE.W  (R8)+,  R1;
               AND.L    R5,     R0;
               CLR.L    R2;              ADDQ    #2,    R10;
               MOVE.W   (R10)+, R2;      MOVE.W  (R10)+, R3;
               JSR      MPYE;
               SWAP     R0;              MOVE.W  R0,  (R13)+;
               SWAP     R0;              MOVE.W  R0,  (R13)+;
               NOP;                      MOVE.W  R1,  (R13)+;
         test: DBRA     loopctr, loop                            );

      ifft( data_adr );   fftun( data_adr );& includes a preempt &

END gate;
```

```
STIME.WORK.PD8510                THU, DEC 22, 1983, 11:03 AM     PAGE 21

#EJECT; COMMENT
**********************************************************************
*
*will at first use a fft size array ( adr ) but after  gating only
* the freq size array elements will be used
**********************************************************************
end of comment;
PROCEDURE build_gate_comp( adr, pts, gate_parm, real_value_only);
                    VALUE adr, pts, gate_parm, real_value_only;
         DOUBLE adr;  INTEGER gate_parm, pts;  BOOLEAN real_value_only;
BEGIN
DOUBLE temp,
       ang_delta=REGISTER 5, ang=REGISTER 6;
INTEGER loopctr = REGISTER 7;
LABEL loop1, loop2, test1, test2;

   temp      := - cyc_frac( gate_cen_Fs * Fo / Fs );
   ang_delta := - cyc_frac( gate_cen_Fs );
   ang       := temp;
   ASSEMBLE(
              MOVE.L  adr,  R13;
              MOVE.W  pts,   loopctr;
              BRA     test1;
       loop1: MOVE.L  ang, R0;  JSR fst_trig_long;
              SWAP    R0;                 MOVE.W   R0, (R13)+;
              SWAP    R0;                 MOVE.W   R0, (R13)+;
              ADD.L   ang_delta, ang: MOVE.W  =H0, (R13)+;
       test1: DBRA    loopctr, loop1                             );

   td_window( adr, pre_wind& gate_parm &, domain,  pts, mpy );

   gate( adr, gate_array, pts, real_value_only );


   ASSEMBLE(
              MOVE.L  adr,  R10;
              MOVE.L  R10,  R13;
              MOVE.W  pts,   loopctr;
              BRA     test2;
       loop2: MOVE.L  (R10)+, R0;      MOVE.W  (R10)+,  R1;
              JSR     magE;
              MOVE.L  =F1.0,  R1;      JSR     DVR2;
                                       MOVE.W  =H0, (R13)+;
              SWAP    R0;              MOVE.W  R0,  (R13)+;
              SWAP    R0;              MOVE.W  R0,  (R13)+;
       test2: DBRA    loopctr, loop2                             );


   pre_gate_array := adr + array_size;
   td_window( pre_gate_array, pre_wind&gate_parm&, domain, pts, nop );
END build_gate_comp;
```

```
STIME.WORK.PD8510                THU, DEC 22, 1983, 11:03 AM     PAGE 22

#EJECT; COMMENT
**********************************************************************
**********************************************************************
end of comment;
PROCEDURE do_gating;
BEGIN
INTEGER gate_parm;

   IF ( memory_stolen(gate_array, td_gate_arrays_id, 2*6144)  OR
      (flag = 0) OR (gate_domain # domain) )  AND (gate_array # 0) THEN
      BEGIN
      tell( comp_gate_coeff );
      gate_parm :=  ch_integer( ch_gate_window , chan ) ;
      build_gate( gate_array,  num_pts, gate_parm, domain=tdr_domain );

      post_gate_array := gate_array + 6144;
      build_gate_comp( post_gate_array, num_pts,
                             gate_parm, domain=tdr_domain );
      gate_domain := domain;
      clear_message( comp_gate_coeff );
      END;

   IF gate_array # 0 THEN
      BEGIN

      &Pre_comp&
      array_mpy( pre_gate_array, dp_scr_array_time, num_pts );

      gate( dp_scr_array_time, gate_array,
                              num_pts, domain=tdr_domain);

      &Post Comp &                                         &real mpy&
      array_mpy( post_gate_array, dp_scr_array_time, num_pts );

      release_auxiliary_memory( gate_array ,td_gate_arrays_id  ) ;
      END
     ELSE
      warn( exceeded_available_memory );

END do_gating;
```

```
STIME.WORK.PD8510                THU, DEC 22, 1983, 11:03 AM     PAGE 23

#EJECT; COMMENT
**********************************************************************
*
* HISTORY
* 8/9/83 -- error in computing Fs fixed
**********************************************************************
end of comment;
PROCEDURE array_datap( ch );   VALUE ch;   INTEGER  ch;          ENTRY;
BEGIN
DOUBLE ptrs_base = REGISTER 11;
DOUBLE vars_base = REGISTER 12;
DOUBLE POINTER dp_ptrs = ptrs_base;
INTEGER point, num_pts_freq;
DOUBLE  dp_d;
```

```
STIME.WORK.PD8510            THU, DEC 22, 1983, 11:03 AM     PAGE  24

EJECT;
  IF ( dp_scr_array_time := request_memory( 6144 ) ) # 0  THEN
       BEGIN
       chan := ch;
       domain := ch_integer( ch_domain, chan );

num_pts := num_pts_freq  := number_of_points;
       dp_scr_array_freq := dp_scr_array_time;
       Fo   := REAL( ch_quad( ch_start_frequency , chan ) );
       Fs   :=  frequency_step( chan );

IF domain = tdr_domain THEN
          BEGIN
          num_pts := num_pts + 1;
          dp_scr_array_freq := dp_scr_array_freq + 6;
          Fo       := 0.0 ;
          END  tdr_domain domain ;

set_vars_ptrs_base( 0 );                              &restore&
       dp_d     := dp_ptrs[ dp_d_ptr   ];

ASSEMBLE( MOVE num_pts_freq, R7; MOVE.L dp_scr_array_freq, R13 );
       array_correct;

IF domain = tdr_domain THEN compute_dc_value;
             & debug for testing gate shapes &                 & DEBUG &
 IF gate_debug THEN ASSEMBLE( MOVE.W num_pts_freq,      R0;    & DEBUG &
                              JSRX   CNV42;                    & DEBUG &
                              MOVE.L dp_scr_array_time, R11;   & DEBUG &
                              MOVE.W  =H0000,(R11)+;SWAP R0;   & DEBUG &
                              MOVE.W  R0,    (R11)+;SWAP R0;   & DEBUG &
                              MOVE.W  R0,    (R11)+;           & DEBUG &
                              MOVE.W  num_pts_freq,     R4;    & DEBUG &
                              BSR     array_zero           );  & DEBUG &

IF ch_integer( ch_gating , chan )  = gate_on THEN
          do_gating;

& skip if elec_length/phase offset / para conv off &
       set_vars_ptrs_base( 0 );                              &restore&
       ASSEMBLE( MOVE num_pts_freq, R7; MOVE.L dp_scr_array_freq, R13 );
       array_elec_length;

IF ( domain = tdr_domain ) OR ( domain = time_domain ) THEN
          do_time_domain;      & will need to make # pts same for output& copy_user3( dp_scr_array_freq, dp_d       , num_pts_freq );

set_vars_ptrs_base( 0 );                              &restore&
       REPEAT num_pts_freq  DO
              ASSEMBLE(  JSRX     update_d_loop.L    );

flag := 1;
       release_memory( dp_scr_array_time );
       END
```

```
STIME.WORK.PD8510            THU, DEC 22, 1983, 11:03 AM     PAGE  25

    ELSE
       warn( exceeded_available_memory );

END array_datap;
END$
*************************************************************************


PROCEDURE dump( adr, num );  VALUE adr, num; DOUBLE adr; INTEGER num;
BEGIN
INTEGER loop;
REAL x,y;
FOR loop := 0 TO num DO
   BEGIN
   WNUM( loop );
   ASSEMBLE (   MOVE.L adr,  R8;      JSR fetch_CNVE1;
                MOVE.L  R1, y;        JSR WREAL;          ADD.L #6, adr );
                WREAL( y );     CRLF;
   END loop;
END dump;

MOVEM.L R0-R13,-(S); AND.W =HOFF,R1;MOVE.L R0,R2; MOVE.W R1,R2; SWAP R0;
MOVE.W R1,R0; MOVE.L R0,-(S); MOVE.L R2,-(S); MOVE loopctr,R0;
EXTS.L  R0;
JSR WNUM;MOVE.L (S)+,R0;JSR WREAL;MOVE.L (S)+,R0;JSR WREAL;JSR CRLF;
MOVEM.L (S)+,R0-R13;

ASSEMBLE(  MOVE.L   gate_adr,  temp );
IF time_debug THEN
FOR n:= 0 TO 300  DO
  BEGIN  WREAL(n);
  ASSEMBLE( MOVE.L temp, R12;     MOVE.W (R12)+,R1;     MOVE.L (R12)+, R0;
            MOVE.L  R12,temp;     AND.L  =HFFFF00FF,R0;   JSR WREAL );
  CRLF;     REPEAT  4000 DO TRAP( 1);                          END;
```

```
FTIME2.WORK.PD8510           THU, DEC 22, 1983, 11:03 AM     PAGE   1

PROCEDURE user3_zero( addr, numb);
                 VALUE addr, numb; DOUBLE addr; INTEGER numb; EXTERNAL.L;
```

```
CTITLE.WORK.PD8510           THU, DEC 22, 1983, 11:03 AM     PAGE   1

INTEGER CONSTANT space_index     := -1,
                 backspace_index := -2;
```

```
FTITLE.WORK.PD8510            THU, DEC 22, 1983, 11:03 AM     PAGE  1

#FILE ctitle.work;

EXTERNAL INTEGER char_index;

SUBROUTINE erase_title;                                     EXTERNAL.L;
PROCEDURE  select_title_char( index );
   VALUE   index;
   INTEGER index;                                           EXTERNAL.L;
PROCEDURE  write_title;                                     EXTERNAL.L;
PROCEDURE  enter_title_char( index );
   VALUE   index;
   INTEGER index;                                           EXTERNAL.L;
```

```
STITLE.WORK.PD8510            THU, DEC 22, 1983, 11:03 AM     PAGE  1

M68KL,P,"title"
BEGIN

#FILE fdisplay.work;
#FILE fscreen.work;
#FILE fstring.work;                                 & for append_ch &
#FILE futil.work;                                          & for tell &
#FILE cactive.work;                              & for active_title &
#FILE factive2.work;          & for active_function and active_title &
#FILE fchdata2.work;                               & for title_line &
#FILE ctitle.work;                 & for space_ and backspace_index &
#FILE fdispram.work;                             & for wrt_disp_str &


ALPHA CONSTANT title_set := "ABCDEFGHIJKLMNOPQRSTUVWXYZ. 0123456789"
                            + "()+-" + mpy_char + "/=" + 225
                            + 226 + gamma_char + 177 + 178;

DOUBLE  title_set_addr = title_set;
GLOBAL INTEGER char_index;
```

```
STITLE.WORK.PD8510            THU, DEC 22, 1983, 11:03 AM     PAGE  2

#EJECT;
COMMENT                                             select_title_char
*************************************************************************
*
*************************************************************************
;
PROCEDURE  select_title_char( index );
   VALUE   index;
   INTEGER index;                                              ENTRY;
   BEGIN & select_title_char &
      INTEGER addr;

      char_index := index;

      addr := lb( entry_aux_display, title_set );
      addr := movech( addr,
                      entry_aux_row + 1,
                      title_col - 1 + index
                    );
      addr := printch( addr, up_arrow );
      addr := jmp(addr, entry_aux_display + entry_aux_size);

   END;  & select_title_char &
```

```
STITLE.WORK.PD8510            THU, DEC 22, 1983, 11:03 AM     PAGE  3

#EJECT;
COMMENT                                                   write_title
*************************************************************************
*
*************************************************************************
;
PROCEDURE  write_title;                                        ENTRY;
   BEGIN & write_title &
      print_string( title, title_size, title_display );
      wrt_disp_str( ADRS(title_line),
                    title
                  );
   END;  & write_title &
```

```
STITLE.WORK.PD8510              THU, DEC 22, 1983, 11:03 AM     PAGE   4

#EJECT;
COMMENT                                                         enter_title_char
************************************************************************
*
************************************************************************
;
PROCEDURE  enter_title_char( index );
   VALUE   index;
   INTEGER index;                                                 ENTRY;
   BEGIN & enter_title_char &
      BYTE POINTER ch;

      IF active_function <> active_title THEN
         tell( title_function_not_active )
      ELSE
         BEGIN & else &
            IF index = backspace_index THEN & backspace &
               append_ch( title, bs )
            ELSE IF index = space_index THEN & space &
               append_ch( title, ' ' )
            ELSE & not backspace or space &
               BEGIN & else &
                  STPNTR( ch, title_set_addr );
                  append_ch( title, ch[char_index] );
               END;  & else &
            write_title;
         END;  & else &

   END;  & enter_title_char &
```

```
STITLE.WORK.PD8510              THU, DEC 22, 1983, 11:03 AM     PAGE   5

#EJECT;
COMMENT                                                              erase_title
************************************************************************
*
************************************************************************
;
SUBROUTINE erase_title;                                               ENTRY;
   BEGIN & erase_title &
      clear_string( title );
      write_title;
   END;  & erase_title &

END$
```

```
FTOPKBD.WORK.PD8510             THU, DEC 22, 1983, 11:03 AM     PAGE   1

EXTERNAL INTEGER key_token;
```

```
STOPKBD.WORK.PD8510             THU, DEC 22, 1983, 11:03 AM     PAGE   1

M68KL,P,"topkbd"
BEGIN

#FILE cids.work;
#FILE fiocnfig.work;
#FILE fkernel.work;
#FILE fkernel2.work;
#FILE fkernel3.work;
#FILE fintrpt.work;
#FILE crins.work;
#FILE ffifo.work;
#FILE ffifos.work;
#FILE fpubib.work;
#FILE cpubib.work;
#FILE fcommand.work;                            & for abort_command &
#FILE cmessag2.work;                             & for all_messages &
#FILE futil2.work;                              & for clear_message &
#FILE fnumber.work;                                & for get_number &
#FILE fkeys.work;                     & for top_key_table and cmd_... &

BYTE CONSTANT key_clk := %23,        & clock prescaler := 3          &
              key_mod := %02,        & n-key rollover, encoded scan &
              key_erf := %E0,        & clear error flag             &
              key_out := %40,        & set output fifo mode         &
              key_clr := %C1;        & clear key fifo               &
INTEGER CONSTANT key_max       :=  35,
                 key_stat_mask := %0F;

BYTE key_data = io + %81,
     key_stat = io + %83,
     key_cmd  = io + %83;
INTEGER key_code;
GLOBAL INTEGER key_token;


SUBROUTINE init_keyboard_fifo;                                    ENTRY;
   BEGIN
      init_fifo( keyboard_fifo,
                 keyboard_fifo_size,
                 keybd_fifo,
                 keybd_fifo_not_full,
                 keybd_fifo_not_empty );
   END;


SUBROUTINE init_top_keyboard;
   BEGIN & init_top_keyboard &
      key_cmd := key_mod;
      key_cmd := key_clk;
      key_cmd := key_erf;
      key_cmd := key_out;
      key_cmd := key_clr;
   END;  & init_top_keyboard &
```

```
STOPKBD.WORK.PD8510          THU, DEC 22, 1983, 11:04 AM     PAGE  2



& a process &
PROCEDURE  top_key;                                           ENTRY;
   BEGIN & top_key &

      init_top_keyboard;
      iradr( ADRS(intrpt_top_key), top_key_vctr );

loop: IF (key_stat AND key_stat_mask) = 0 THEN
            waitio(top_key_vctr);  & wait for next keyboard interrupt. &
      abort_command := TRUE;
      IF TBIT(key_stat,6) THEN
         BEGIN
            key_cmd := key_clr;
            IF NOT remote THEN
               write_fifo( keyboard_fifo, cmd_illegal );
         END if tbit
      ELSE
         BEGIN
            key_code := INTEGER(key_data) AND %003F;
            IF key_code > key_max THEN
               BEGIN & if &
                  IF NOT remote THEN
                     write_fifo( keyboard_fifo, cmd_illegal );
               END   & if &
            ELSE
               BEGIN & else &
                  key_token := top_key_table[key_code];
                  set_serial_poll( key_pressed_srq );
                  IF NOT remote THEN
                     write_fifo(keyboard_fifo, key_token);
               END;  & else &
         END else not tbit;

      GO TO loop;

   END; & top_key &



& a process &
PROCEDURE keyboard;                                           ENTRY;
   BEGIN  & keyboard &
      INTEGER token;

loop: token := read_fifo( keyboard_fifo );

      IF token < 0 THEN     & these keys require parsing (0-9,., etc.) &
         BEGIN & if &
            acquire( entry_string );
            token := get_number(token);   & rtns term'r or non-numeric &
                                          & that aborted the entry.    &
            clear_message( all_messages );    & clear warning messages &
            write_fifo( token_fifo, token );
```

```
STOPKBD.WORK.PD8510          THU, DEC 22, 1983, 11:04 AM     PAGE  3

            IF ((token <= cmd_u4) AND (token >= cmd_enter)) THEN
               BEGIN & if &
                  wait( entry_string_ready );
                  set_serial_poll( entry_complete_srq );
               END;  & if &
            release( entry_string );
         END   & if &
      ELSE IF NOT ((token <= cmd_u4) AND (token >= cmd_enter)) THEN
         & ignore extraneous terminators &
         BEGIN & else if &
            clear_message( all_messages );    & clear warning messages &
            write_fifo( token_fifo, token );
         END;  & else if &

      GO TO loop;

   END;  & keyboard &

END$
```

```
FTOPKEYS.WORK.PD8510         THU, DEC 22, 1983, 11:04 AM     PAGE  1

#FILE ccmddecl.work;

   INTEGER CONSTANT offset         := -64,         & negative values &
                    zero_token     := offset + 0,  & keep these      &
                    one_token      := offset + 1,  & separate from   &
                    two_token      := offset + 2,  & command token   &
                    three_token    := offset + 3,  & values.         &
                    four_token     := offset + 4,
                    five_token     := offset + 5,
                    six_token      := offset + 6,
                    seven_token    := offset + 7,
                    eight_token    := offset + 8,
                    nine_token     := offset + 9,
                    decimal_token  := offset + 10,
                    minus_token    := offset + 11,
                    backspace_token := offset + 13;

   INTEGER TABLE key_table:=
            cmd_u4,                & 0 &
            nine_token,            & 1 &
            eight_token,           & 2 &
            seven_token,           & 3 &
            cmd_illegal,           & 4 &
            cmd_illegal,           & 5 &
            cmd_key_1,             & 6 &
            cmd_key_5,             & 7 &
            cmd_u3,                & 8 &
            six_token,             & 9 &
            five_token,            & 10 &
            four_token,            & 11 &
            cmd_entry_off,         & 12 &
            cmd_illegal,           & 13 &
            cmd_key_2,             & 14 &
            cmd_key_6,             & 15 &
            cmd_u2,                & 16 &
            three_token,           & 17 &
            two_token,             & 18 &
            one_token,             & 19 &
            cmd_down,              & 20 &
            cmd_illegal,           & 21 &
            cmd_key_3,             & 22 &
            cmd_key_7,             & 23 &
            cmd_enter,             & 24 &
            minus_token,           & 25 &
            decimal_token,         & 26 &
            zero_token,            & 27 &
            cmd_up,                & 28 &
            cmd_prior_menu,        & 29 &
            cmd_key_4,             & 30 &
            cmd_key_8,             & 31 &
            cmd_illegal,           & 32 &
            cmd_mkrval,            & 33 &
            backspace_token,       & 34 &
            cmd_illegal;           & 35 &
```

```
CTOPMISC.WORK.PD8510         THU, DEC 22, 1983, 11:04 AM     PAGE  1

INTEGER CONSTANT done_tone  := 0,
                 tone_1     := 1,
                 tone_2     := 2,
                 error_tone := 3;
```

```
FTOPMISC.WORK.PD8510          THU, DEC 22, 1983, 11:04 AM     PAGE   1

#FILE ctopmisc.work;

EXTERNAL BYTE flag1_save.L, & memory image of flag registers          &
              flag2_save.L; & required only for proto2.               &
                            &    proto3 is a read/write location.     &
PROCEDURE beep(tone);
   VALUE tone;
   INTEGER tone;                                          EXTERNAL.L;
```

```
STOPMISC.WORK.PD8510          THU, DEC 22, 1983, 11:04 AM     PAGE   1

M68KL,P,"topmisc"
BEGIN

#FILE fiocnfig.work;
#FILE fkernel3.work;
#FILE cdebug.work;                                              & DEBUG &

BYTE flag1_addr = io + %A9, & HPIB #1 ifc,ren,atn; beeper; crt disable &
     flag2_addr = io + %B1; & leds                                     &

GLOBAL BYTE flag1_save,     & memory image of flag registers           &
            flag2_save;     & required only for proto2.                &
                            &    proto3 is a read/write location.      &

BYTE CONSTANT zero := 0;

PROCEDURE beep(tone);
   VALUE tone;
   INTEGER tone;                                                ENTRY;
   BEGIN  & beep &
     BYTE CONSTANT tone_mask := %18;

     IF NOT beeper_off THEN                                     & DEBUG &
        BEGIN & if &                                            & DEBUG &
          flag1_save := ( (LEFT(tone,3) AND tone_mask) OR
                          (flag1_save AND NOT tone_mask) );  & set tone &
          flag1_save := SBIT(flag1_save,5);                  & beep on  &
          flag1_addr := flag1_save;
          REPEAT 30000 DO;                                      & DEBUG &
COMMENT                                                         & DEBUG &
          pause(4);                              & pause 500 milliseconds &
          flag1_save := RBIT(flag1_save,5);                  & beep off &
          flag1_addr := flag1_save;
        END;  & if &                                            & DEBUG &

   END beep;


SUBROUTINE init_top_misc;                                       ENTRY;
   BEGIN
     flag1_save := zero;        & beeper off, crt on, hpib asserted &
     flag1_addr := flag1_save;
     flag2_save := %FF;         & all leds off                      &
     flag2_addr := flag2_save;
   END init_top_misc;

END$
```

```
STPDUMP.WORK.PD8510           THU, DEC 22, 1983, 11:04 AM     PAGE   1

M68KL,"tpdump"
BEGIN
#FILE fterm.work;
&
#FILE ftaco.work;
&
COMMENT  use if tape code is to be in RAM , not ROM ;
INTEGER IO=%FFFFFE00;DOUBLE ARRAY parm[0:63]; INTEGER Parm0=parm[0];
#FILE staco.work;

BYTE ARRAY      tape_data[0:255];

ALPHA TABLE menu:="0       Rewind             1      Find Record",
                  "2       Read Record        3      Read Continous",
                  "4       Initialize",
& need to add tape copy routines ??, and ???  &
                  "                           7      Return to Monitor";

PROCEDURE  display_menu;
  BEGIN
  INTEGER index;

  WSTR(""+27+"m"+27+"H"+27+"J");                     & home and clear screen&
  FOR index:=0 TO 3 DO BEGIN WSTR( menu[index] ); CRLF; END;
  CRLF;
  WSTR(""+27+"1");                           &memory lock&
  END display_menu;


INTEGER SUBROUTINE request_item;
  BEGIN
        request_item:=RHEX;
        WSTR(""+27+"&a5y1C"+27+"J")     &cursor position&
  END request_item;


PROCEDURE wrt_err(mes); VALUE mes;   ALPHA mes;
  BEGIN
  REPEAT 5 DO CRLF;
  WSTR("     ******"); WSTR(mes); WSTR("****** ");
  REPEAT 2 DO CRLF;
  WSTR("           Tape Status ="); WHEX(TPErr);
  CRLF;
  END;


PROCEDURE  dump_line(byte_ptr,count) ;
           VALUE byte_ptr,count;  BYTE POINTER byte_ptr; INTEGER count;
  BEGIN
  INTEGER POINTER int_ptr = byte_ptr;
  INTEGER index;

  IF count>16 THEN count:=16;
```

```
STPDUMP.WORK.PD8510           THU, DEC 22, 1983, 11:04 AM     PAGE   2

  FOR index:=0 TO ( (count+1) /2)-1 DO WHEX( int_ptr[index] );
  WSTR(""+27+"&a48C"+27+"y");                       &monitor functions on&
  FOR index:=0 TO count-1  DO IF (byte_ptr[index] AND %7F) = 13 THEN
                         WCHAR(%7F)
                         ELSE WCHAR( byte_ptr[index] );
  WSTR(""+27+"Z"+8+8+"  ");                           &display functions off&
  CRLF;
  END dump_line;


BOOLEAN PROCEDURE  dump_record;
  BEGIN
  INTEGER index,length;

  dump_record:=TRUE;
  CRLF;

  IF TPRED( ADRS(tape_data), length ) THEN
     BEGIN
     WSTR( "  Tape Record # = "); WNUM(TPrecord);
     WSTR( "  Record Length = "); WNUM(length); WSTR(" bytes");
     CRLF;
     IF length = 0 THEN
         wrt_err(" EMPTY RECORD ")
     ELSE FOR index:=0 STEP 16 WHILE index < length
            DO  dump_line( ADRS(tape_data[index]), length - index  );
     END
  ELSE
     BEGIN
       wrt_err("Tape read error");
       dump_record:=FALSE;
     END;
  END dump_record;


display_menu;
TPINT;
REW;

WHILE TRUE DO
  BEGIN
  CASE request_item
  BEGIN
&0&   IF NOT REW THEN wrt_err("Rewind Error");
&1&   BEGIN
        WSTR("Enter record # ");
        IF NOT TPseek(RHEX) THEN
                   wrt_err("Tape seek error");
      END;
&2&   IF dump_record THEN;
&3&   WHILE dump_record DO;
&4&   IF NOT TPmark THEN
                   wrt_err("Tape marking error");
```

```
STPDUMP.WORK.PD8510            THU, DEC 22, 1983, 11:04 AM     PAGE   3

&5&  ;
&6&  ;
&7&  TRAP(15);
  END case;

END infinite loop;

END$
```

```
FTPMGR.WORK.PD8510             THU, DEC 22, 1983, 11:04 AM     PAGE   1

#FILE ctpmgr.work;

& Saves a tape file from RAM data block &
PROCEDURE record_file (ram_addr, byte_lgth, file_id, mbm_pg);
  VALUE ram_addr,byte_lgth,file_id,mbm_pg;  DOUBLE ram_addr,byte_lgth;
  INTEGER file_id, mbm_pg;                                     EXTERNAL;

& Restores a file from tape to bubble or RAM &
PROCEDURE restore_file (ram_addr, file_id, dest);
  VALUE ram_addr, file_id, dest;  DOUBLE ram_addr;
  INTEGER file_id, dest;                                       EXTERNAL;

INTEGER PROCEDURE scan_directory (dir_ptr, file_id);
  VALUE dir_ptr,file_id;  INTEGER dir_ptr,file_id;             EXTERNAL;

PROCEDURE delete_file (file_type,file_id);
  VALUE file_type,file_id; INTEGER file_type,file_id;          EXTERNAL;

PROCEDURE undelete_file;                                       EXTERNAL;
PROCEDURE list_directory;                                      EXTERNAL;
BOOLEAN SUBROUTINE valid_directory;                            EXTERNAL;
PROCEDURE init;   & init tapes &                               EXTERNAL;
SUBROUTINE init_tape_mgr;                                      EXTERNAL;

EXTERNAL                & byte counts for appended tape file data   &
INTEGER ARRAY file_byte_cnt [0:max_file_appends];

EXTERNAL                & addresses of appended tape file data      &
DOUBLE ARRAY file_address [0:max_file_appends];

EXTERNAL
ALPHA TABLE file_type;
```

```
CTPMGR.WORK.PD8510             THU, DEC 22, 1983, 11:04 AM     PAGE   1

INTEGER CONSTANT

   pwr_on_state := 5,    & bubble register for power up state &
   preset_state := 6,    & bubble index for preset state info. &
   prior_state  := 7,    & bubble index for last state info. &

   tape_device  := 1,
   mbm_device   := 2,
   HPIB_device  := 3,

   module       := 1,

   max_file_appends := 5,

   & state_file thru cal_set must always be contiguous !!! &
   state_file   := 1,    & must occur before cal_file &
   memory_file  := 2,    & memory data   = M &
   cal_std_file := 3,
   cal_file     := 4,    & must occur after state_file&
   state_set    := 5,
   memory_set   := 6,
   cal_std_set  := 7,
   cal_set      := 8,
   s_param_file := 9,    & raw data = RAW_BASE &
   display_file := 10,   & display memory &
   format_file  := 11,   & formatted data = F &
   data_file    := 12,   & data = D &
   machine_file := 15;
```

```
STPMGR.WORK.PD8510             THU, DEC 22, 1983, 11:04 AM     PAGE   1

M68KL,P,"TPMGR"

BEGIN

COMMENT-------------8510 TAPE MANAGER---------------------------------+
|                                                                      |
|  This illustrious "can of worms" contain what some may refer to as  |
|  the basic I/O routines for the 8510 data tape files which transfer|
|  data to tape from bubble or RAM, and from tape to bubble or RAM.   |
|                                                                      |
|    record_file(file_id, byte_lgth, dest, pg)       {RAM/mbm to tape}|
|    restore_file (file_id, ram_ptr, reg_num)        {tape to RAM/mbm}|
|                                                                      |
|  The following tape information and utility routines are included: |
|                                                                      |
|    delete_file  (data_type, file_number)                             |
|    undelete_file                                                     |
|    list_directory                                                    |
|    scan_directory (blk_num, file_id)      {looks for a tape file  }  |
|    valid_directory {validates tape format and loads unloaded tape}  |
|    load_tape       {reads in tape directory and duplicate}           |
|    init            {initializes and formats tapes}                   |
|    tape_error      {displays error message regarding tape status}   |
|                                                                      |
+---------------------------------------------------------------------;

#FILE ftaco.work;
#FILE fmbm.work;
#FILE fmbmgr.work;
#FILE fmemmgr.work;
#FILE fmenu.work;
#FILE cmsgtape.work;
#FILE cmessag2.work;
#FILE futil4.work;
#FILE futil3.work;
#FILE futil2.work;
#FILE cactv1.work;                                    & for active_off &
#FILE factv1.work;                          & for select_active_function &
#FILE cdisplay.work;                        & for directory listing      &
#FILE fdisplay.work;
#FILE fcommand.work;                        & for command_token          &
#FILE cscreen.work;                         & screen info for directory  &
#FILE ctpmgr.work;                          & tape file constants        &
#FILE cdtmgr.work;                          & command_token values       &
#FILE cdebugc4.work;                        & DEBUG                      &
#FILE fterm.work;                           & DEBUG                      &
#FILE frecall.work;                         & recall machine state/dump  &
#FILE fcontrol.work;                        & abort/restart sweeps       &
#FILE fdatamgr.work;                        & for machine dump info      &

INTEGER CONSTANT
  max_blk:= 84,           & maximum block number on tape                 &
  first_blk:= 0,          & first block number on tape                   &
  first_blk_avail:= 170,  & byte index in directory to 1st empty block&
  blks_avail:= 171,       & directory byte index to no. avail blocks   &
```

```
  empty_file:= 0,         & unused file type                          &
  tape_id:= Z8510,        & 8510 tape identifier for tape validation  &
  id_word:= 86,           & directory word index for 8510 tape id     &
  dir_lgth:= 176;         & number of bytes used by tape directories  &

GLOBAL &for debug purposes&
INTEGER ARRAY directory_wordbuf [0:127];  &indexes directory by words&
BYTE POINTER  directory_bytebuf;          &indexes directory by bytes&
DOUBLE directory_bufptr=directory_bytebuf;&pointer to file directory &

GLOBAL &for debug purposes&
INTEGER ARRAY tape_wordbuf [0:127];       &all-purpose tape buffers  &
BYTE POINTER  tape_bytebuf;               &via word or byte index    &
DOUBLE  tape_bufptr=tape_bytebuf;         &Pointer to tape buffers   &
DOUBLE POINTER tape_double;

GLOBAL                    & byte counts for appended tape file data   &
INTEGER ARRAY file_byte_cnt [0:max_file_appends];

GLOBAL                    & addresses of appended tape file data      &
DOUBLE ARRAY file_address [0:max_file_appends];

& DO NOT put this table in display memory !!! &
GLOBAL
ALPHA TABLE file_type :=
  "",
  "INST STATE",
  "MEMORY",
  "CAL KIT",
  "CAL SET",
  "STATES 1-5",
  "MEMORY 1-4",
  "KITS 1-2",
  "CAL 1-8",
  "RAW DATA",
  "DISPLAY",
  "FORMATTED",
  "DATA",
  "          ",
  "          ",
  "MACH. DUMP";

INTEGER dir_blk,          & pointer thru directory for listing to crt &
        deleted_blk,      & last block to be deleted, (-1 if none)    &
        deleted_file;     & last tape file to be deleted              &

BOOLEAN directory_ok,     & flag to determine valid tape directory    &
        backup_ok,        & flag to determine valid dup. directory    &
        tape_ok,          & flag to determine valid tape in drive     &
        abort_tape_fn;    & flag to abort current tape function       &

GLOBAL
BOOLEAN directory_on;
```

```
#EJECT;
COMMENT
$DOC+

NAME--
  tape_error
**********************************************************************
*
* SHORT DESCRIPTION--
*   displays an error message describing a tape malfunction
*
* EXTENDED DESCRIPTION--
*   Checks the tape status word to determine the tape malfunction and
*   displays the appropriate message describing it.
*
* INPUTS--
*   none
*
* OUTPUTS--
*   error message to display gen
*
* ROUTINES CALLED--
*   TPErr
*
* ERROR CONDITIONS AND RECOVERY--
*   none
*
* NOTES--
*   This routine will only be called if the tape/tape drive is really
*   in trouble (i.e. screwy tape or malfunctioning drive).
*
* AUTHOR--
*
**********************************************************************
*
* INITIAL REFINEMENT--
*   check current tape status word
*   display appropriate message depending on bit(s) set in status word
*
**********************************************************************
*
* REVISION LOG--
*
**********************************************************************
DECLARATION--
;
PROCEDURE tape_error;
&
$DOC-&

BEGIN
  INTEGER tape_status, msg;
  tape_status := TPErr;
  IF TBIT(tape_status,1) THEN warn (no_tape)          ELSE
    BEGIN
      IF TBIT(tape_status,3) THEN msg:= write_protect_macro ELSE
```

```
      IF TBIT(tape_status,2) THEN msg:= tape_drive_macro    ELSE
      IF TBIT(tape_status,6) THEN msg:= format_macro        ELSE
      IF TBIT(tape_status,11) THEN msg:= checksum_macro     ELSE
        msg:= unknown_macro;
      macro_warn (tape_errors, msg);
    END;
END tape_error;
```

```
#EJECT;
COMMENT
$DOC+

NAME--
  directory_off
**********************************************************************
*
* SHORT DESCRIPTION--
*   replaces tape directory display with regular trace data display
*
* EXTENDED DESCRIPTION--
*   This routine eliminates the tape directory display, restores the
*   the regular display, and returns to the previous softkey menu which
*   displayed the various tape functions.
*
* INPUTS--  none
*
* OUTPUTS-- none
*
* ROUTINES CALLED--
*   set_attribute
*   jmp
*   previous_menu
*
* ERROR CONDITIONS AND RECOVERY--
*   none
*
* NOTES--
*
* AUTHOR--
*
**********************************************************************
*
* INITIAL REFINEMENT--
*   clear directory flag
*   restore data/annotation display
*   reset tape directory file pointer
*   generate previous menu (tape menu)
*
**********************************************************************
*
* REVISION LOG--
*
**********************************************************************
DECLARATION--
;
SUBROUTINE directory_off;                                      ENTRY;
&
$DOC-&

BEGIN
  #FILE fdisptbl.work;
  #FILE ccmdcase.work;
  #FILE cplot.work;
  INTEGER TABLE screen_info :=
```

```
    & text display &
    dg_jmp_new_adr,function_display,function_display+function_size,
    & entry &
    dg_movech2_new_adr,entry_position,entry_row,entry_col,
    dg_jmp_new_adr,entry_display,entry_display+entry_size,
    dg_movech2_new_adr,entry2_position,entry_row,entry_col,
    dg_jmp_new_adr,entry2_display,entry2_display+entry_size,
    dg_stop;

  IF (command_token <> cmd_next_page)      AND
     (command_token <> cmd_prev_page)      AND
     (command_token <> cmd_first_page)     AND
     (command_token <> cmd_last_page)      AND
     (command_token <> cmd_print_params)   AND
     (command_token <> cmd_plot_params)    AND
     (command_token <> cmd_next_op_param)  THEN
  BEGIN
    directory_on := FALSE;
    IF command_token <> cmd_prior_menu THEN
      previous_menu;
    & restore regular display &
    setattribute (jump_all, nop);
    & reset values in text display overlay area &
    dir_blk := display_from_table (dir_blk, ADRS(screen_info));
    dir_blk := 0;
    restart_sweep;
  END;
END directory_off;
```

```
#EJECT;
COMMENT
$DOC+

NAME--
  init_tape_vars
***********************************************************************
*
* SHORT DESCRIPTION--
*   initializes tape function variables
*
* EXTENDED DESCRIPTION--
*   This routine initializes all tape function variables and turns off
*   any directory displayed.  It is primarily used when loading a new
*   tape or initializing one.
*
* INPUTS--  none
*
* OUTPUTS-- none
*
* ROUTINES CALLED--
*   directory_off
*
* ERROR CONDITIONS AND RECOVERY--
*   none
*
* NOTES--
*
* AUTHOR--
*
***********************************************************************
*
* INITIAL REFINEMENT--
*   If directory is displayed then
*     turn off directory and put up regular display
*   clear all tape function flags
*
***********************************************************************
*
* REVISION LOG--
*
***********************************************************************
DECLARATION--
;
SUBROUTINE init_tape_vars;
&
$DOC-&

BEGIN
  IF directory_on THEN
    directory_off;
  tape_ok := directory_ok := backup_ok := abort_tape_fn := FALSE;
  dir_blk := deleted_file := 0;
  deleted_blk := -1;
END init_tape_vars;
```

```
#EJECT;
COMMENT
$DOC+

NAME--
  load_tape
***********************************************************************
*
* SHORT DESCRIPTION--
*   loads a copy of the tape directory in RAM
*
* EXTENDED DESCRIPTION--
*   Loads and initializes tape directory in RAM and sets a flag to
*   all user function tape operations if a valid tape is in the drive
*
* INPUTS--  none
*
* OUTPUTS-- none
*
* ROUTINES CALLED--
*   tell
*   warn
*   TPRED
*   REW
*
* ERROR CONDITIONS AND RECOVERY--
*
* NOTES--
*
* AUTHOR--
*
***********************************************************************
*
* INITIAL REFINEMENT--
*
***********************************************************************
*
* REVISION LOG--
*
***********************************************************************
DECLARATION--
;
PROCEDURE load_tape;
&
$DOC-&

BEGIN
  INTEGER rec_lgth;
  BOOLEAN format_ok;

  BOOLEAN SUBROUTINE dir_ok;
    dir_ok := directory_ok := TPRED(directory_bufptr,rec_lgth);

  TPINT;
  init_tape_vars;
  tell (loading_tape);
```

```
  & verifying directories &
  IF NOT REW THEN
    tape_error
  ELSE
  IF NOT abort_command THEN
    BEGIN

      COMMENT
        check directory and backup directory
        check directory format
      ;
      format_ok := FALSE;
      IF dir_ok THEN
        format_ok := rec_lgth = dir_lgth;
      IF (backup_ok:=TPRED(directory_bufptr,rec_lgth)) THEN
        format_ok := rec_lgth = dir_lgth
      ELSE
        IF (directory_ok:=REW) THEN          & recover from bad backup &
          dir_ok;

      IF NOT directory_ok AND NOT backup_ok THEN
        tape_error
      ELSE
      IF NOT
        (format_ok:=tape_ok:= directory_wordbuf[id_word]=tape_id) THEN
        macro_warn (tape_errors,format_macro); &check for valid tape id&
    END;
  tape_ok := tape_ok AND NOT (abort_tape_fn:=abort_command);
END load_tape;
```

```
STPMGR.WORK.PD8510              THU, DEC 22, 1983, 11:04 AM     PAGE  10

#EJECT;
COMMENT
$DOC+

NAME--
  valid_directory
***********************************************************************
*
* SHORT DESCRIPTION--
*
* EXTENDED DESCRIPTION--
*
* INPUTS--
*
* OUTPUTS--
*
* ROUTINES CALLED--
*
* ERROR CONDITIONS AND RECOVERY--
*
* NOTES--
*
* AUTHOR--
*
***********************************************************************
*
* INITIAL REFINEMENT--
*
***********************************************************************
*
* REVISION LOG--
*
***********************************************************************
DECLARATION--
;
BOOLEAN SUBROUTINE valid_directory;                             ENTRY;
&
$DOC-&

BEGIN
  IF NOT TPready OR NOT tape_ok OR abort_tape_fn THEN
    load_tape;
  IF tape_ok THEN
  IF (NOT directory_ok AND backup_ok)  OR
     (directory_ok AND NOT backup_ok)  THEN
    warn (using_backup);
  valid_directory := tape_ok AND (directory_ok OR backup_ok);
END valid_directory;
```

```
STPMGR.WORK.PD8510              THU, DEC 22, 1983, 11:04 AM     PAGE  11

#EJECT;
COMMENT
$DOC+

NAME--
  list_directory
***********************************************************************
*
* SHORT DESCRIPTION--
*
* EXTENDED DESCRIPTION--
*
* INPUTS--
*
* OUTPUTS--
*
* ROUTINES CALLED--
*
* ERROR CONDITIONS AND RECOVERY--
*
* NOTES--
*
* AUTHOR--
*
***********************************************************************
*
* INITIAL REFINEMENT--
*
***********************************************************************
*
* REVISION LOG--
*
***********************************************************************
DECLARATION--
;
PROCEDURE list_directory;                                       ENTRY;
&
$DOC-&

BEGIN
  INTEGER list, dir_blk_cnt, i;

  SUBROUTINE print_num;
  BEGIN
    list := printch (list,(i/10)+48);
    list := printch (list,(i MOD 10)+48);
  END print_num;

  SUBROUTINE new_line;
    list := crlf (list);

  IF valid_directory THEN
    BEGIN
      INTEGER n,cnt;
      INTEGER ARRAY dir_copy [0:max_blk];
```

```
STPMGR.WORK.PD8510              THU, DEC 22, 1983, 11:04 AM     PAGE  12

      i := n := 0;
      cnt := -1;

      & count number of files on tape &
      FOR i := first_blk TO max_blk DO
        IF directory_bytebuf[LEFT(i,1)+1] > 0 THEN
          dir_copy[cnt:=cnt+1] := directory_wordbuf[i];

      & determine directory listing choice &
      IF (command_token = cmd_directory) OR
        (command_token = cmd_first_page) THEN
        dir_blk := 0
      ELSE
      IF (command_token = cmd_prev_page) THEN
        BEGIN
          IF dir_blk <= 10 THEN
            cnt := 0                    & can't previous from 1st  &
          ELSE
          IF dir_blk > cnt THEN         & page previous to last pg &
            dir_blk := cnt - (10+(cnt MOD 10))
          ELSE                          & all other previous pages &
            dir_blk := (IF dir_blk > 21 THEN dir_blk-21 ELSE 0)
        END
      ELSE
      IF (command_token = cmd_last_page) THEN
        IF cnt > 10 THEN                    & check for more than 1 pg &
          IF (dir_blk := cnt MOD 10) > 0 THEN
            dir_blk := cnt - dir_blk        & partial last page &
          ELSE
            dir_blk := cnt - 10;            & full last page &

      IF (dir_blk <= cnt) OR (cnt < 0) THEN
        BEGIN
          IF NOT directory_on THEN
            BEGIN
              directory_on := TRUE;
              abort_sweep;    & restart sweep in directory off routine &
              select_active_function (active_off);  & clear active fn. &
              jmp (jump_all, end_position);         & turn off display &
            END;
          & directory headings &
          list := lb(text_display,"     TAPE DIRECTORY");
          new_line; new_line;
          list := lb(list," FILE        NO.   BLOCK SIZE");
          IF cnt >= 0 THEN
            DO BEGIN  & list tape directory &
              dir_blk_cnt := dir_copy [dir_blk];
              list := movech (list, n+12, 1);
              list := lb(list,file_type[RIGHT(dir_blk_cnt,12)]);
              list := movech (list, n+12, 14);
              list := printch(list,RIGHT((dir_blk_cnt AND %0F00),8)+48);
              list := lb(list,"      ");
              i := (dir_blk_cnt AND %0FF);
              print_num;
            END UNTIL ((dir_blk:=dir_blk+1)>cnt) OR ((n:=n+1)=10);
          & brief tape directory summary &
```

```
STPMGR.WORK.PD8510              THU, DEC 22, 1983, 11:04 AM     PAGE  13

              i := cnt+1;
              new_line; new_line;
              print_num;
              list := lb(list," FILES ON TAPE");
              new_line;
              i := (directory_bytebuf[blks_avail]);
              print_num;
              list := lb(list," BLOCKS LEFT ON TAPE");
              list := jmp (list, entry_aux_position);
            END directory display;
        END if valid_directory;
END list_directory;
```

```
#EJECT;
COMMENT
$DOC+

NAME--
  update_directory
*************************************************************************
*
* SHORT DESCRIPTION--
*   updates directory and duplicate directory on tape
*
* EXTENDED DESCRIPTION--
*   This function writes the current tape (and duplicate) directory on
*   on tape from a current copy kept in RAM.  The RAM copy is used to
*   do file searches, file deletions, and file writes without having to
*   access the tape each time.  The tape's primary directory is written
*   into record 0, and its duplicate is written into record 1.
*
*   Global flags (BACKUP_OK, DIRECTORY_OK) are set accordingly depending
*   on whether or not each directory was written successfully to tape.
*   This function will return a TRUE value if either or both directories
*   were successfully written, and a FALSE value if neither directory
*   was successfully written.
*
* INPUTS--   none
*
* OUTPUTS--
*   TRUE  = either primary or backup directory written to tape w/o fail
*   FALSE = both attempts to write primary or backup directories failed
*
* ROUTINES CALLED--
*   REW
*   TPWRT
*   TPseek
*   tape_error
*
* ERROR CONDITIONS AND RECOVERY--
*   Tape failure --> displays warning message, FALSE value returned
*
* NOTES--
*   A tape is still valid as long as either primary or duplicate
*   directory is valid.
*
* AUTHOR--
*
*************************************************************************
*
* INITIAL REFINEMENT--
*   Clear flags which indicate valid directories
*   If tape does not rewind successfully then
*     display error message
*   else
*     If RAM copy of directory is written successfully on tape then
*       set flags indicating valid tape directories
*     else
*       if RAM copy of directory is written successfully to backup then
```

```
*         set valid backup directory flag
*       else
*         display error message
*   return TRUE if either primary or duplicate directory flag is set
*   return FALSE if neither primary or dupliate directory flag is set
*
*************************************************************************
*
* REVISION LOG--
*
*************************************************************************
DECLARATION--
;
BOOLEAN SUBROUTINE update_directory;
&
$DOC-&

BEGIN

  BOOLEAN SUBROUTINE dir_ok;
    dir_ok := backup_ok := TPWRT (directory_bufptr,dir_lgth);

  update_directory := directory_ok := backup_ok := FALSE;
  IF NOT REW THEN              & get records 0,1 for directory updates &
    tape_error
  ELSE
  IF NOT (abort_tape_fn:=abort_command) THEN
    BEGIN
      IF (directory_ok := TPWRT (directory_bufptr,dir_lgth)) THEN
        dir_ok
      ELSE  & rely on backup directory &
      IF NOT (backup_ok :=TPseek(1)) THEN
        tape_error
      ELSE
      IF NOT dir_ok THEN
        tape_error;
      update_directory := directory_ok OR backup_ok;
    END;
END update_directory;
```

```
#EJECT;
COMMENT
$DOC+

NAME--
  init
*************************************************************************
*
* SHORT DESCRIPTION--
*   initializes tape format and directory
*
* EXTENDED DESCRIPTION--
*   This routine corresponds to the softkey [INITIALIZE TAPE] whose
*   function is to mark and format a tape and its directory.
*
* INPUTS--   none
*
* OUTPUTS--  none
*
* ROUTINES CALLED--
*   TPmark
*   warn
*   tell
*   tape_error
*
* ERROR CONDITIONS AND RECOVERY--
*   none
*
* NOTES--
*   When the tape is being marked and formatted, a lower level tape
*   intrinsic is used.  This low-level routine DOES NOT check for
*   front panel keyboard interrupts which will automatically abort the
*   tape initialization.  (Could be a problem)
*
* AUTHOR--
*
*************************************************************************
*
* INITIAL REFINEMENT--
*
*************************************************************************
*
* REVISION LOG--
*
*************************************************************************
DECLARATION--
;
PROCEDURE init;                                              ENTRY;
&
$DOC-&

BEGIN
  INTEGER i;
  tell (initializing_tape);
  IF NOT REW THEN
    tape_error
```

```
  ELSE
  IF abort_command THEN
    warn (init_aborted)
  ELSE
  IF TPmark THEN
    BEGIN
      init_tape_vars;
      FOR i:= 0 TO 127 DO directory_wordbuf[i]:=0;
      directory_wordbuf[id_word] := tape_id;
      directory_wordbuf[max_blk+1]:= %0055;  &1st avail and #avail blks&
      IF (tape_ok := update_directory) THEN
        acknowledge (tape_init)
      ELSE
      IF abort_tape_fn THEN
        warn (init_aborted);
    END
  ELSE
    tape_error;
  previous_menu;
END init;
```

```
%EJECT;
COMMENT
$DOC+

NAME--
  scan_directory
************************************************************************
*
* SHORT DESCRIPTION--
*   does a tape file search
*
* EXTENDED DESCRIPTION--
*   This routine scans the tape directory (copy of directory in RAM)
*   for a particular file (FILE_ID) starting at a given directory entry
*   (DIR_PTR).  It returns the directory entry (0..84) if the file is
*   found, otherwise it returns a -1 indicating that the file does not
*   exist on tape.
*
*   This function is also used to search for additional file extenions
*   if a tape file occupies more than one block which corresponds to a
*   directory entry.
*
* INPUTS--
*   FILE_ID = tape file identified by a byte wide value containing the
*             data type (0..15 = upper 4 bits)  and
*             file number (1..8 = lower 4 bits).
*   DIR_PTR = which directory entry (corresponds to tape blocks 0..84)
*             to start scanning from
*
* OUTPUTS--
*   directory entry (0..84) if file is found
*   -1 if file is not found
*
* ROUTINES CALLED--  none
*
* ERROR CONDITIONS AND RECOVERY--
*   range checks file ids and directory entry pointers
*
* NOTES--
*
* AUTHOR--
*
************************************************************************
*
* INITIAL REFINEMENT--
*   If starting directory entry pointer is within range then
*     check each directory entry for requested tape file (file_id)
*   If tape file found then
*     return directory entry
*   else
*     return -1
*
************************************************************************
*
* REVISION LOG--
*
```

```
************************************************************************
DECLARATION--
;
INTEGER PROCEDURE scan_directory (dir_ptr, file_id);
  VALUE dir_ptr, file_id;  INTEGER dir_ptr;  BYTE file_id;      ENTRY;
&
$DOC-&

BEGIN
  BOOLEAN found;
  found:=FALSE;
  IF (dir_ptr <= max_blk) AND (dir_ptr >= first_blk) THEN
  WHILE NOT (found := (directory_bytebuf[LEFT(dir_ptr,1)] = file_id))
        AND (dir_ptr < max_blk)   DO  dir_ptr := dir_ptr+1;
  scan_directory := (IF found THEN dir_ptr ELSE -1);
END scan_directory;
```

```
%EJECT;
COMMENT
$DOC+

NAME--
  delete_file
************************************************************************
*
* SHORT DESCRIPTION--
*
* EXTENDED DESCRIPTION--
*   Scans directory for FILE_TYPE and FILE_ID and deletes that file
*   by marking directory block(s) with empty file types and updating
*   the bytes which contain the first available block and number of
*   total available blocks.
*
* INPUTS--
*
* OUTPUTS--
*
* ROUTINES CALLED--
*
* ERROR CONDITIONS AND RECOVERY--
*
* NOTES--
*
* AUTHOR--
*
************************************************************************
*
* INITIAL REFINEMENT--
*
************************************************************************
*
* REVISION LOG--
*
************************************************************************
DECLARATION--
;
PROCEDURE delete_file (file_type, file_id);
VALUE file_type, file_id;  INTEGER file_type, file_id;          ENTRY;
&
$DOC-&

BEGIN
  INTEGER blk_no;
  BYTE file;
  IF valid_directory THEN
  IF (blk_no:=scan_directory(first_blk,
     (file := LEFT(file_type,4) OR file_id))) < 0 THEN
    warn (no_file_found)
  ELSE
    BEGIN
      tell(deleting_file);
      deleted_blk := blk_no;
      deleted_file := directory_wordbuf[blk_no];
```

```
      IF directory_bytebuf[first_blk_avail] > blk_no THEN
        directory_bytebuf [first_blk_avail] := blk_no;
      DO BEGIN
        directory_bytebuf[blks_avail]:=directory_bytebuf[blks_avail]+1;
        directory_wordbuf[blk_no] := empty_file;
      END UNTIL (blk_no:=scan_directory (blk_no+1,file)) < 0;
      IF update_directory THEN
        acknowledge (file_deleted)
      ELSE
        deleted_blk := -1;            & file not deleted successfully &
    END;
  IF abort_tape_fn THEN
    macro_warn (file_aborted, delete_macro);
END delete_file;
```

```
STPMGR.WORK.PD8510              THU, DEC 22, 1983, 11:04 AM     PAGE  22

$EJECT;
COMMENT
$DOC+

NAME--
  undelete_file
*************************************************************************
*
* SHORT DESCRIPTION--
*   recovers a file that has just been deleted
*
* EXTENDED DESCRIPTION--
*   "Undeletes" the last file deleted provided a file has not been
*   saved after the last deletion (indicated by DELETED_BLK = -1).
*   Scans directory for FILE_TYPE and FILE_ID and deletes that file
*
* INPUTS--
*
* OUTPUTS--
*
* ROUTINES CALLED--
*
* ERROR CONDITIONS AND RECOVERY--
*
* NOTES--
*
* AUTHOR--
*
*************************************************************************
*
* INITIAL REFINEMENT--
*
*************************************************************************
*
* REVISION LOG--
*
*************************************************************************
DECLARATION--
;
PROCEDURE undelete_file;                                      ENTRY;
&
$DOC-&

BEGIN
  IF valid_directory THEN   & first check if tape is ok &
  IF deleted_blk >= 0 THEN
  BEGIN
    INTEGER blks_rescued;
    tell (undeleting_file);
    directory_bytebuf[blks_avail] := directory_bytebuf[blks_avail] -
                           (blks_rescued:=deleted_file AND %OF);
    directory_wordbuf[deleted_blk] := deleted_file;
    deleted_file := deleted_file AND %FF00;      & mask out file length &
    WHILE ((blks_rescued:=blks_rescued-1)>0) AND
      ((deleted_blk:=scan_directory(deleted_blk+1,
      RIGHT(deleted_file,8)))> 0)  DO
```

```
STPMGR.WORK.PD8510              THU, DEC 22, 1983, 11:04 AM     PAGE  23

    directory_wordbuf[deleted_blk] := deleted_file;
    directory_bytebuf[first_blk_avail] :=
      scan_directory (deleted_blk+1, empty_file);
    IF update_directory THEN
      BEGIN
        acknowledge (file_undeleted);
        deleted_blk := -1;
      END;
  END
    ELSE
  macro_warn (file_error, undelete_macro);
  IF abort_tape_fn THEN
    macro_warn (file_aborted, undelete_macro);
END undelete_file;
```

```
STPMGR.WORK.PD8510              THU, DEC 22, 1983, 11:04 AM     PAGE  24

$EJECT;
COMMENT
$DOC+

NAME--
  record_file
*************************************************************************
*
* SHORT DESCRIPTION--
*
* EXTENDED DESCRIPTION--
*   Saves the file, FILE_ID, through FILE_WRITE.  FILE_LENGTH computes
*   and returns the number of blocks (BLK_SIZE) in the file.
*   FILE_WRITE buffers the file information to be written to tape one
*   record (128 words at a time using DATA_PTR as an offset relative
*   to the information (accessed via ram_addr).
*   FROM_MBM indicates whether the data being recorded is from
*   bubble memory (TRUE) or from RAM (FALSE).
*
* INPUTS--
*
* OUTPUTS--
*
* ROUTINES CALLED--
*
* ERROR CONDITIONS AND RECOVERY--
*
* NOTES--
*   For writing machine dumps, the following order of recording is done:
*      - data bubble (module 1)
*      - formatted data
*      - data
*      - raw
*
* AUTHOR--
*
*************************************************************************
*
* INITIAL REFINEMENT--
*
*************************************************************************
*
* REVISION LOG--
*
*************************************************************************
DECLARATION--
;
PROCEDURE record_file (ram_addr, byte_lgth, file_id, mbm_pg);
  VALUE ram_addr,byte_lgth,file_id,mbm_pg;  DOUBLE ram_addr, byte_lgth;
  INTEGER file_id, mbm_pg;                                      ENTRY;
&
$DOC-&

BEGIN
  INTEGER POINTER info_ptr=ram_addr;
  DOUBLE  lgth, blk_sz;
```

```
STPMGR.WORK.PD851C              THU, DEC 22, 1983, 11:04 AM     PAGE  25

  INTEGER blk_size=blk_sz+2, & number of tape blocks to needed for file&
          blk_ptr,           & current tape block being written to    &
          blk_buf,           & record counter for each tape block write&
          data_type;
  INTEGER
    data_ptr,                & data buffer pointer                    &
    appends;                 & appending data info. in file to write  &
  BOOLEAN wrote_ok,          & redundancy checking during tape writes &
          purged_file;       & attempt to write over existing file    &

&***********************************************************************&

  SUBROUTINE file_append;
  BEGIN
    INTEGER app_reg = REGISTER 6;
    app_reg := appends;
    IF (app_reg:=app_reg+1) <= max_file_appends  THEN
      IF (byte_lgth := file_byte_cnt [app_reg]) > 0 THEN
        BEGIN                       & append another data block to file &
          STPNTR( info_ptr, (ram_addr:=file_address[app_reg]) );
          data_ptr := -128;         & reset to beginning of buffer &
        END;
    appends := app_reg;
  END file_append;

&***********************************************************************&

  SUBROUTINE get_next_block;
  BEGIN
    blk_ptr := scan_directory (blk_ptr+1,empty_file);
    blk_buf := 0;                  & reset record count for next tape block &
    IF (wrote_ok := TPseek (blk_ptr*10+2)) THEN
      IF (mbm_pg >= 0)  THEN   & buffer next data block if from bubble &
        BEGIN
          wrote_ok := read_mbm(ram_addr, set_add_mbm(mbm_pg,0,
                      (IF byte_lgth>=2560 THEN 2559 ELSE byte_lgth-1)));
          data_ptr := -128;                 & reset to beginning of buffer &
        END;
  END get_next_block;

&***********************************************************************&

  SUBROUTINE tape_write;
  BEGIN
    IF (wrote_ok := ram_addr <> 0) THEN
    DO BEGIN    & write to file &
      IF dump_debug THEN
        BEGIN
          IF mbm_pg >= 0 THEN
            BEGIN WSTR("pg"); WHEX(mbm_pg); END
          ELSE
            BEGIN WHex(ram_addr,8); WHex(byte_lgth,8); END;
          WSTR(" --> blk");
          WHEX(blk_ptr); IF NOT wrote_ok THEN WHEX(status_mbm);
          CRLF;
        END;
```

```
      DO  blk_buf:=blk_buf+1  UNTIL                          & write a block &
        NOT (wrote_ok:=TPWRT(ADRS(info_ptr[data_ptr:=data_ptr+128]),
        (IF byte_lgth>256 THEN 256 ELSE byte_lgth))) OR
        (abort_tape_fn := abort_command)             OR
        ((byte_lgth := byte_lgth - 256) <= 0)        OR
        (blk_buf = 10);
      & mark tape block in directory with file ID &
      directory_bytebuf[LEFT(blk_ptr,1)] := file_id;
      IF mbn_pg < 0 THEN            & no file appends from bubble data &
        IF (byte_lgth <= 0) THEN
          file_append;
      IF (byte_lgth > 0) AND (blk_buf = 10) THEN
        get_next_block;
    END UNTIL NOT wrote_ok       OR
              abort_tape_fn      OR
              (byte_lgth <= 0);
  END tape_write;

&**********************************************************************&

  SUBROUTINE copy_bubble_1;
  BEGIN
    IF bubble_ok THEN
    IF (ram_addr := request_memory (2560) ) = 0 THEN
      fatal (exceeded_available_memory)
    ELSE
      BEGIN
        STPNTR (info_ptr, ram_addr);
        mbn_pg := 0;
        byte_lgth := 131072;                & 2048 mbn pages * 64 bytes &
        & 1 tape block (2560 bytes) - 256 bytes of file header = 2303 &
        wrote_ok := read_mbn(ram_addr, set_add_mbn(mbn_pg,0,2303));
        IF wrote_ok THEN
          tape_write;
        release_memory (ram_addr);
        mbn_pg := -1;                & reset to load RAM data from tape &
        data_ptr := -128;
        get_next_block;
      END;
  END copy_bubble_1;

&**********************************************************************&

  BOOLEAN SUBROUTINE file_write;
  BEGIN
    tell(recording_file);
    directory_bytebuf[(blk_ptr:=directory_bytebuf    & file hdr block: &
    [first_blk_avail])*2+1] := blk_size;             & file size       &
    directory_bytebuf[blks_avail] :=
    & update # avail blks &   directory_bytebuf[blks_avail]-blk_size;
    IF NOT (wrote_ok:= TPseek(blk_ptr*10+2)) THEN
      tape_error
    ELSE
      BEGIN  & 1st record contains file info &
        deleted_blk := -1;
        tape_double&0& := byte_lgth;
```

```
        IF data_type = memory_set THEN
          & copy memory trace directory from bubble &
          MOVE tape_wordbuf[2] := mbn_dir[mem_dir_offset], +(5)
        ELSE
        IF data_type = cal_set THEN
          & copy cal data directory from bubble &
          MOVE tape_wordbuf[2] := mbn_dir&0&, +(mem_dir_offset)
        ELSE
          & copy appending file byte lgths into file info. record &
          MOVE tape_wordbuf[2]:=file_byte_cnt&0&,+(max_file_appends+1);
        IF (wrote_ok := TPWRT(tape_bufptr,256)) THEN
          BEGIN
            IF (data_type=machine_file) THEN
              copy_bubble_1;
            IF wrote_ok AND NOT abort_tape_fn THEN
              BEGIN
                IF file_byte_cnt[1]>0 THEN  & check for appending file &
                BEGIN
                  byte_lgth:=file_byte_cnt&0&; & byte lgth to 1st file &
                  STPNTR(info_ptr,(ram_addr:=file_address&0&));
                END;
                tape_write;
              END;
          END;
        IF NOT abort_tape_fn THEN
        IF wrote_ok THEN                        & update 1st avail blk &
          directory_bytebuf[first_blk_avail] :=
          scan_directory (blk_ptr+1, empty_file)
        ELSE
          BEGIN
            load_tape;                        & retrieve old directory&
            macro_warn (file_error, record_macro);
          END;
      END;
    file_write := wrote_ok AND NOT abort_tape_fn;
  END file_write;

&**********************************************************************&

  BOOLEAN SUBROUTINE room_on_tape;
  BEGIN
    blk_sz := (IF ((lgth:=byte_lgth+256) MOD 2560) > 0 THEN
               (lgth/2560)+1  ELSE
               (lgth/2560));
    IF directory_bytebuf[blks_avail] < blk_size THEN
      BEGIN
        IF purged_file THEN
          undelete_file;
        room_on_tape := FALSE;
        warn(no_tape_room);
      END
    ELSE
      room_on_tape := TRUE;
  END file_length;

&**********************************************************************&
```

```
  IF TBIT(TPErr,3) THEN
    macro_warn (tape_errors, write_protect_macro)
  ELSE
  IF valid_directory THEN
    BEGIN
      blk_buf := 1;           & record counter for each tape block write&
      appends := 0;           & appending data info. in file to write   &
      data_ptr:= -128;        & data buffer pointer                     &
      data_type := RIGHT(file_id,4);
      IF dump_debug THEN
        BEGIN
          WSTR("RECORDING"); WHex(byte_lgth,8); WSTR(" bytes from ");
          IF mbn_pg<0 THEN WHex(ram_addr,8)
          ELSE WHEX(mbn_pg); WHEX(file_id); CRLF;
        END;
      IF (purged_file:=(scan_directory(first_blk,file_id)>=0)) THEN
        delete_file (data_type, file_id AND %000F);
      IF room_on_tape THEN
        IF file_write AND update_directory THEN
          acknowledge (file_recorded);
      IF abort_tape_fn THEN
        macro_warn (file_aborted, record_macro);
    END;
END record_file;
```

```
#EJECT;
COMMENT
$DOC+

NAME--
  restore_file
************************************************************************
*
* SHORT DESCRIPTION--
*
* EXTENDED DESCRIPTION--
*   Restores file contents of FILE_ID into RAM via INFO_PTR, or into
*   bubble buffered through INFO_PTR.  This is determined by DEST,
*   in which a value of 0 indicates restoration to RAM, and a non-zero
*   (positive) value indicates a page number in bubble to start
*   restoring to.
*
* INPUTS--
*
* OUTPUTS--
*
* ROUTINES CALLED--
*
* ERROR CONDITIONS AND RECOVERY--
*
* NOTES--
*   For reading machine dumps, the following order of restoring is done:
*     - data bubble (module 1)
*     - formatted data
*     - data
*     - raw
*
* AUTHOR--
*
************************************************************************
*
* INITIAL REFINEMENT--
*
************************************************************************
*
* REVISION LOG--
*
************************************************************************
DECLARATION--
;
PROCEDURE restore_file (ram_addr, file_id, dest);
  VALUE ram_addr, file_id, dest;  DOUBLE ram_addr;
  INTEGER file_id, dest;                                          ENTRY;
&
$DOC-&

BEGIN
  #FILE ftrace.work;
  #FILE cdatap.work;
  INTEGER POINTER info_ptr=ram_addr;
  INTEGER blk_no,                             & tape block number      &
```

```
STPMGR.WORK.PD8510            THU, DEC 22, 1983, 11:05 AM      PAGE  30

        rec_lgth,                         & # bytes/tape record     &
        i,                                & temporary debug variable&
        data_type,                        & type of data on file    &
        src_pts,                          & # points being restored &
        msg,                              & error message number    &
        blk_buf,                          & records/block counter   &
        mbm_block_cnt,                    & tape block counter      &
        cnt;                              & tape records/bubble data&
  INTEGER data,                           & data buffer/ram pointer &
        appends;                          & appending file data cntr&
  DOUBLE  lgth;                           & # bytes/data file       &
  INTEGER ARRAY restore_file_cnt [0:max_file_appends];
  BOOLEAN read_ok;

&**********************************************************************&

  BOOLEAN SUBROUTINE ok_to_restore_file;
  BEGIN
    IF NOT (read_ok:=TPRED(tape_bufptr,rec_lgth)) THEN  &tape file info&
      tape_error
    ELSE
    IF dest >= 0 THEN                              & read from bubble &
      BEGIN
        lgth := tape_double&0&;
        IF data_type = memory_file THEN
          & mem_dir_offset index contains reg num to restore to &
          mbm_dir[mem_dir_offset+mbm_dir[mem_dir_offset]] := lgth
        ELSE
        IF data_type = memory_set THEN        & restore mbm memory info &
          MOVE mbm_dir[mem_dir_offset] := tape_wordbuf[2],+(5)
        ELSE
        IF data_type = cal_file THEN
          BEGIN
            & cal_dir_offset index contains reg num to restore to &
            cnt := mbm_dir[cal_dir_offset];
            IF (read_ok := ok_to_save_cal (cnt, lgth)) THEN
              dest := get_start_pg (cal_file, cnt);
          END
        ELSE
        IF data_type = cal_set THEN              & restore mbm cal info &
          MOVE mbm_dir&0& := tape_wordbuf[2], +(mem_dir_offset);
      END
    ELSE
      BEGIN
        MOVE restore_file_cnt&0&:=tape_wordbuf[2],+(max_file_appends+1);
        lgth:=(IF restore_file_cnt[1]>0 THEN restore_file_cnt&0& ELSE
                                              tape_double&0&);
        IF data_type=machine_file THEN
          BEGIN
            dest := cnt := 0;
            lgth := 131072       & 2048 mbm pages * 64 bytes &
          END
        ELSE
        IF dest < 0 THEN          & range check # points for RAM data &
        IF NOT (read_ok := restore_file_cnt&0&=file_byte_cnt&0&) THEN
          BEGIN
```

```
STPMGR.WORK.PD8510            THU, DEC 22, 1983, 11:05 AM      PAGE  31

            src_pts := restore_file_cnt&0&/300;      & 50 pts * 6 bytes &
            IF (src_pts=8) THEN
              msg := restore_401_macro      ELSE
            IF (src_pts=4) THEN
              msg := restore_201_macro      ELSE
            IF (src_pts=2) THEN
              msg := restore_101_macro      ELSE
              msg := restore_51_macro;
            macro_warn (restore_pts_error, msg);
          END;
      END;
    ok_to_restore_file := read_ok;
  END ok_to_restore_file;

&**********************************************************************&

  SUBROUTINE get_next_block;
  BEGIN
    blk_buf := 0;                 & reset block buffer count for tape  &
    blk_no := scan_directory (blk_no+1, file_id);
    read_ok := TPseek (blk_no*10+2);                   & get next block &
  END get_next_block;

&**********************************************************************&

  SUBROUTINE write_next_block;
  BEGIN
    IF lgth > 0 THEN
    DO BEGIN                                          & read in 1 block &
      cnt     := cnt + 1;                             & records for mbm &
      lgth    := lgth - 256;                          & read a record   &
      blk_buf := blk_buf + 1;                         & # records read  &
    END UNTIL
      (abort_tape_fn := abort_command) OR
      NOT (read_ok:=TPRED(ADRS(info_ptr[data:=data+128]),rec_lgth)) OR
      (lgth <= 0) OR (blk_buf = 10);
  END write_next_block;

&**********************************************************************&

  SUBROUTINE append_data_info;
  BEGIN
    INTEGER app_reg = REGISTER 6;
    app_reg := appends;
    IF (app_reg:=app_reg+1) <= max_file_appends THEN
      IF (lgth:=restore_file_cnt[app_reg]) > 0 THEN
        BEGIN
          data := -128;
          STPNTR(info_ptr,(ram_addr:=file_address[app_reg]));
        END;
    appends := app_reg;
  END append_data_info;

&**********************************************************************&

  BOOLEAN SUBROUTINE read_aborted;
```

```
STPMGR.WORK.PD8510            THU, DEC 22, 1983, 11:05 AM      PAGE  32

    read_aborted := NOT read_ok OR abort_tape_fn;

&**********************************************************************&

  SUBROUTINE read_debug;
  BEGIN
    IF dump_debug THEN
      BEGIN
        WSTR("blk"); WHEX(blk_no); WSTR(" -->");
        IF dest < 0 THEN
          BEGIN WHex(ram_addr,8); WHex(lgth,8); END
        ELSE
          BEGIN WSTR("pg"); WHEX(dest); END;
        CRLF;
      END;
  END read_debug;

&**********************************************************************&

  SUBROUTINE read_tape;
  BEGIN
    IF (read_ok := ram_addr <> 0) THEN
    IF NOT read_aborted THEN
    DO BEGIN                               & read and restore the file &
      read_debug;
      write_next_block;
      IF NOT read_aborted THEN
        IF dest >= 0 THEN          & write to bubble starting @ pg dest &
          BEGIN
            data := -128;          & reset mbm buffer ptr for next blk  &
            COMMENT
            read_ok := wrt_mbm (ram_addr, set_add_mbm(dest,0,
                        (cnt-1)*256+rec_lgth-1));
            read_ok := wrt_mbm_ok (ram_addr, dest,
                                 (cnt-1)*256+rec_lgth-1);
            cnt := 0;
          END
        ELSE
          IF lgth <= 0 THEN        & check for appending data files     &
            append_data_info;
      IF (blk_buf=10) AND (lgth > 0) THEN
        get_next_block;
    END UNTIL read_aborted OR (lgth<=0);
  END read_tape;

&**********************************************************************&

COMMENT  >>>> POTENTIAL PROBLEM <<<<
  could be a problem here if user decides to abort
  machine dump restore from tape !!!!
;
  SUBROUTINE restore_the_world;
  BEGIN
    IF bubble_ok THEN                    & get a buffer to restore bubble&
      IF (ram_addr:=request_memory(2560)) = 0 THEN
        fatal (exceeded_available_memory)
```

```
STPMGR.WORK.PD8510            THU, DEC 22, 1983, 11:05 AM      PAGE  33

      ELSE
        BEGIN
          STPNTR (info_ptr,ram_addr);
          read_tape;                   & restore data bubble (module 1)&
          release_memory (ram_addr);
          IF NOT read_aborted THEN
            BEGIN
              dest := appends := -1;        & reset to restore RAM data &
              append_data_info;
              DO BEGIN
                get_next_block;
                read_debug;
                write_next_block;      & should be inst. state portion &
              END UNTIL read_aborted OR (lgth <= 0);
              do_recall;               & set up memory for d,f, and raw&
              abort_sweep;
              new_data(machine_file);  & get memory addr for d,f,raw   &
              append_data_info;        & get next appending file &
              IF blk_buf=10 THEN
                get_next_block;
              read_tape;               & read the rest of machine state&
            END;
        END
  END restore_the_world;

&**********************************************************************&

  data_type := RIGHT(file_id,4);
  IF (blk_no:= scan_directory (first_blk,file_id))<0 THEN
    warn (no_file_found)
  ELSE
  IF NOT TPseek (blk_no*10+2) THEN
    tape_error
  ELSE
  IF valid_directory THEN
  IF ok_to_restore_file THEN
    BEGIN
      IF dump_debug THEN
        BEGIN
          WSTR("RESTORING"); WHex(lgth,8); WSTR(" bytes from tape to ");
          IF dest<0 THEN WHex(ram_addr,8)
          ELSE WHEX(dest); WHEX(file_id); CRLF;
        END;

      blk_buf := 1;                          & records/block counter    &
      mbm_block_cnt :=                       & tape block counter       &
      cnt :=                                 & tape records/bubble data&
      appends := 0;                          & appending file data cntr&
      data := -128;                          & data buffer/ram pointer &
      tell (restoring_file);
      abort_sweep;
      IF (data_type = machine_file) THEN
        restore_the_world                    & restore machine dump &
      ELSE
        BEGIN
          read_tape;
```

```
STPMGR.WORK.PD8510            THU, DEC 22, 1983, 11:05 AM      PAGE  34

        IF dest < 0 THEN                     & tape to RAM restore &
          BEGIN
            IF (data_type = data_file) THEN
              partial (update_d)
            ELSE                             &
            IF data_type = format_file THEN
              partial (update_f);
          END
        ELSE                                 & tape to mbm restore &
          IF read_ok THEN                    & update bubble directory  &
            read_ok := update_mbm_dir
          ELSE
            bubble_ok;                       & get old bubble directory &
      END;

    restart_sweep;
    IF abort_tape_fn THEN
      compute_warn (data_type_str, abort_restore)
    ELSE
    IF read_ok THEN
      acknowledge (file_restored)
    ELSE
      macro_warn (file_error, restore_macro);
  END; &IF read_ok, ok to restore file&
END restore_file;
```

```
STPMGR.WORK.PD8510            THU, DEC 22, 1983, 11:05 AM      PAGE  35

$EJECT;
COMMENT
$DOC+

NAME--
  init_tape_mgr
************************************************************************
*
* SHORT DESCRIPTION--
*   initializes variables for tpmgr
*
* EXTENDED DESCRIPTION--
*
* INPUTS--
*
* OUTPUTS--
*
* ROUTINES CALLED--
*
* ERROR CONDITIONS AND RECOVERY--
*
* NOTES--
*
* AUTHOR--
*
************************************************************************
*
* INITIAL REFINEMENT--
*
************************************************************************
*
* REVISION LOG--
*
************************************************************************
DECLARATION--
;
SUBROUTINE init_tape_mgr;                                          ENTRY;
&
$DOC-&

BEGIN
  STPNTR(directory_bytebuf, ADRS(directory_wordbuf));
  STPNTR(tape_bytebuf, ADRS(tape_wordbuf));
  STPNTR(tape_double, ADRS(tape_wordbuf));
  FOR dir_blk := 0 TO 127 DO
    directory_wordbuf[dir_blk] := 0;
  directory_on := FALSE;
  init_tape_vars;
END init_tape_mgr;

END$
```

```
FTPMGR2.WORK.PD8510           THU, DEC 22, 1983, 11:05 AM      PAGE   1

SUBROUTINE directory_off;                                     EXTERNAL;
EXTERNAL BOOLEAN directory_on;
```

```
CTRACE.WORK.PD8510            THU, DEC 22, 1983, 11:05 AM      PAGE   1

BYTE CONSTANT ch1_ref_line_mark := '>,
              ch2_ref_line_mark := '<,
              ch1_trace_mark    := 169,               & right arrow &
              ch2_trace_mark    := 168;               & left  arrow &

INTEGER CONSTANT  m_off     := 0,           & state of memory trace &
                  m_on      := 1,
                  d_off     := 0,           & state of data trace   &
                  d_on      := 1;

INTEGER CONSTANT  trace_all_off        := 0,            & trace_type &
                  trace_data           := 1,
                  trace_data_into_mem  := 2,

                  trace_mem_limit      := 3,    & first mode using mem &
                  trace_mem            := 3,
                  trace_data_and_mem   := 4,

                  trace_math_limit     := 5,   & first mode using math &
                  trace_data_plus_mem  := 5,
                  trace_data_minus_mem := 6,
                  trace_data_times_mem := 7,
                  trace_data_div_mem   := 8;

INTEGER CONSTANT  no_mem    := 0,
                  mem1      := 1,
                  mem2      := 2,
                  mem3      := 3,
                  mem4      := 4,
                  data1     := 5,
                  data2     := 6,
                  cal1      := 7,
                  cal2      := 8,
                  cal3      := 9,
                  cal4      := 10,
                  cal5      := 11,
                  cal6      := 12,
                  cal7      := 13,
                  cal8      := 14;
```

```
FTRACE.WORK.PD8510              THU, DEC 22, 1983, 11:05 AM     PAGE   1

#FILE ctrace.work;
#FILE ftrace0.work;                                              & for partial &
PROCEDURE  ch_partial( update_block, ch );
   VALUE   update_block, ch;
   INTEGER update_block, ch;                                     EXTERNAL.L;
PROCEDURE  annotate_math_and_mem( trace_type );
   VALUE   trace_type;
   INTEGER trace_type;                                           EXTERNAL.L;
PROCEDURE  annotate_ref_position;                                EXTERNAL.L;
```

```
STRACE.WORK.PD8510              THU, DEC 22, 1983, 11:05 AM     PAGE   1

M68KL,P,"trace"
BEGIN

#FILE fdatap.work;
#FILE fscreen.work;
#FILE cdisplay.work;
#FILE fdisplay.work;
#FILE cchtable.work;
#FILE fchtable.work;
#FILE fchtab2.work;
#FILE fchtab3.work;
#FILE ctrace.work;
#FILE fmarker.work;
#FILE fgratic.work;
#FILE fannot.work;
#FILE ffifo.work;
#FILE ffifos.work;
#FILE carray.work;


ALPHA TABLE math_annotation :=
      "",                         & trace off -- never used &
      "",                         & data only &
      "",                         & d_into_m  -- never used &
      bs+"M-only",                & mem only  -- "bs" over nil param annot &
      " & M",                     & d and m   &
      "+M",                       & d_plus_m  &
      "-M",                       & d_minus_m &
      mpy_char+"M",               & d_mpy_m   &
      "/M";                       & d_div_m   &

INTEGER TABLE math_m_display :=
      math1_display,
      math2_display;
```

```
STRACE.WORK.PD8510              THU, DEC 22, 1983, 11:05 AM     PAGE   2

                                                                 partial
*************************************************************************

* See also init_group_control_vars.

*************************************************************************
;
PROCEDURE  ch_partial( update_block, ch );
   VALUE   update_block, ch;
   INTEGER update_block, ch;                                     ENTRY;
   BEGIN & ch_partial &
      INTEGER fifo_word;
      BYTE    fifo_word_upper = fifo_word,
              fifo_word_lower = fifo_word+1;

      fifo_word_upper := ( BYTE(ch) AND array_ch_mask ) OR
                         array_update_mask;

      IF ch_integer(ch_m_state,ch) = m_on THEN
         BEGIN & if &
            fifo_word_lower := update_m;
            write_fifo( array_update_fifo, fifo_word );
         END;  & if &

      IF ( (ch_integer(ch_d_state,ch) = d_on) AND
           (update_block <> update_m )
         ) THEN
         BEGIN & if &
            fifo_word_lower := update_block;
            write_fifo( array_update_fifo, fifo_word );
         END;  & if &

   END;  & ch_partial &


PROCEDURE  partial( update_block );
   VALUE   update_block;
   INTEGER update_block;                                         ENTRY;
   BEGIN & partial &
      ch_partial( update_block, current_entry_ch );
   END;  & partial &
```

```
STRACE.WORK.PD8510              THU, DEC 22, 1983, 11:05 AM     PAGE   3

#EJECT;
COMMENT                                            annotate_ref_position
*************************************************************************
*
*************************************************************************
;
PROCEDURE  annotate_ref_position;                                ENTRY;
   BEGIN & annotate_ref_position &
      INTEGER POINTER specs;
      INTEGER ref_line_position,
              ref_line_display,
              x_ref_line,
              y_ref_line,
              addr,               & current display generator address &
              ch;
      REAL ref_position;

      FOR ch := 1 UNTIL max_ch DO
         BEGIN & for &
            IF ch = 1 THEN
               BEGIN & if &
                  STPNTR( specs, ADRS(grat1_specs) );
                  ref_line_position := ref_line1_position;
                  ref_line_display  := ref_line1_display;
               END   & if &
            ELSE
               BEGIN & else &
                  STPNTR( specs, ADRS(grat2_specs) );
                  ref_line_position := ref_line2_position;
                  ref_line_display  := ref_line2_display;
               END;  & else &

            addr := ref_line_position;
            IF specs[grat_type] = rectangular THEN
               BEGIN & if &
                  ref_position := ch_real( ch_ref_position, ch );
                  IF ( (ref_position < 0.0) OR
                       (ref_position > 10.0)
                     ) THEN
                     addr := jmp( addr, ref_line_display+ref_line_size )
                  ELSE
                     BEGIN & else &
                        x_ref_line := specs[grat_x];
                        y_ref_line := specs[grat_y] + INTEGER(
                                   ref_position * REAL(specs[div_y])
                                                               );
                        addr := move2(addr,x_ref_line,y_ref_line);
                        addr := setattribute(ref_line_display, incr);
                        IF ch = 1 THEN
                           BEGIN & if &
                              addr := move(addr, -48, -80);
                              addr := printch(addr, ch1_ref_line_mark);
                              addr := move(addr, -16,  80);
                              addr := plot(addr,
                                          10*specs[div_x],
                                           0,
```

```
STRACE.WORK.PD8510          THU, DEC 22, 1983, 11:05 AM     PAGE   4

                                        normal,
                                        slow
                                       );           & reference line &
                         END   & if &
                      ELSE
                         BEGIN & else &
                            addr := plot(addr,
                                        10*specs[div_x],
                                        0,
                                        normal,
                                        slow
                                       );           & reference line &
                            addr := move(addr,   0, -80);
                            addr := printch(addr, ch2_ref_line_mark);
                            addr := move(addr, -64,  80);
                         END;  & else &
                      addr := setattribute(addr, incroff);
                   END;  & else &
             END;  & if &

          addr := jmp(addr, ref_line_display + ref_line_size);

       END;  & for &

   END;  & annotate_ref_position &
```

```
STRACE.WORK.PD8510          THU, DEC 22, 1983, 11:05 AM     PAGE   5

#EJECT;
COMMENT                                                annotate_math_and_mem
****************************************************************************
*
****************************************************************************
;
PROCEDURE  annotate_math_and_mem( trace_type );
   VALUE   trace_type;
   INTEGER trace_type;                                              ENTRY;
   BEGIN & annotate_math_and_mem &

      annotate_parameter;         & turn on/off param for m-only off/on &
      print_string( math_annotation[ trace_type ],
                    math_size, math_m_display[current_entry_ch - 1]);

   END;  & annotate_math_and_mem &

END$
```

```
ETRACEO.WORK.PD8510         THU, DEC 22, 1983, 11:05 AM     PAGE   1

& update starting points            &
INTEGER CONSTANT update_proc_vars   :=0,
                 update_raw_array   :=1,
                 update_raw         :=2,       & later inc these by one &
                 update_d           :=3,
                 update_m           :=4,
                 update_f &rect&    :=5,
                 update_f_polar     :=6;         &not used in call&
```

```
FTRACEO.WORK.PD8510         THU, DEC 22, 1983, 11:05 AM     PAGE   1

PROCEDURE  partial( update_block );
   VALUE   update_block;
   INTEGER update_block;                                      EXTERNAL.L;
```

```
FTRACE2.WORK.PD8510          THU, DEC 22, 1983, 11:05 AM      PAGE   1


SUBROUTINE annotate_math_op;                               EXTERNAL.L;
PROCEDURE  repaint_traces;                                 EXTERNAL.L;
PROCEDURE  release_mem;                                    EXTERNAL.L;
```

```
STRACE2.WORK.PD8510          THU, DEC 22, 1983, 11:05 AM      PAGE   2


#EJECT;
COMMENT                                                          release_mem
****************************************************************************
*
****************************************************************************
;
PROCEDURE  release_mem;                                           ENTRY;
   BEGIN & release_mem &
      INTEGER array_num;

      FOR array_num := 1 UNTIL last_array DO
         BEGIN & for &
            memory_user[array_num] :=
                  RBIT( memory_user[array_num], current_entry_ch );
            IF ( (memory_numb[array_num] <> 0) AND
                 (memory_user[array_num] = 0)
               ) THEN   & it was allocated AND other ch isn't using it &
               BEGIN & if &
                  release_array( memory_addr[array_num] );
                  memory_numb[array_num] := 0;
               END;  & if &
         END;  & for &

   END;  & release_mem &
```

```
STRACE2.WORK.PD8510          THU, DEC 22, 1983, 11:05 AM      PAGE   1


M68KL,P,"trac2"
BEGIN

TYPELENGTH USER3:6;

#FILE ftrace.work;
#FILE cmenu.work;
#FILE fmenu.work;
#FILE fcontv2.work;                                         & for rebuild &
#FILE fsize.work;
#FILE fcontrol.work;
#FILE cchtable.work;
#FILE fchtable.work;
#FILE fchtab2.work;
#FILE fchdata.work;
#FILE fgratic.work;
#FILE cdisp.work;
#FILE cmessag2.work;
#FILE futil3.work;                                             & for warn &
#FILE fmbmgr.work;                     & for save_data() and recall_data() &
#FILE ctpmgr.work;                                      & for memory_file &
#FILE fcommand.work;                                  & for command_token &
#FILE fmemmgr.work;                     & for request_ and release_array &
#FILE fdisplay.work;
#FILE fscreen.work;
#FILE fdatap.work;

PROCEDURE copy_user3( from_addr, to_addr, size );
                      VALUE from_addr, to_addr, size;
                     DOUBLE from_addr, to_addr; INTEGER size; EXTERNAL;



INTEGER CONSTANT last_array := 2;
DOUBLE ARRAY memory_addr[1:last_array];         & address of memory array &
BYTE   ARRAY memory_numb[1:last_array],          & memory # in this array &
             memory_user[1:last_array];         & ch's bit set when using &

ALPHA TABLE math_annotation :=
   & 0  math_d_plus_m        & "( + )",
   & 1  math_d_minus_m       & "( - )",
   & 2  math_d_times_m       & "( "+mpy_char+" )",
   & 3  math_d_divided_by_m  & "( / )";
```

```
STRACE2.WORK.PD8510          THU, DEC 22, 1983, 11:05 AM      PAGE   3


#EJECT;
COMMENT                                                              get_mem
****************************************************************************
*
*  Releases any currently held memory for the current entry channel,
*  checks to see if the requested data memory is already in memory
*  else allocates space for it and reads it in from bubble.
*  If successful, fills the data memory tables, sets the channel table
*  value for ch_m_base, and returns TRUE. Else it releases the memory,
*  clears the data memory tables, sets the channel table value for
*  ch_m_base to 0, and returns FALSE.
*
****************************************************************************
;
BOOLEAN PROCEDURE get_mem( mem_id );
   VALUE   mem_id;
   INTEGER mem_id;
   BEGIN & get_mem &
      BOOLEAN success;
      INTEGER array_num ,
              use_this_array,
              an_open_array;

      success := TRUE;
      release_mem; & release array(s) currently in use by this channel &

      & see if the desired memory number is already in ram &
      use_this_array := 0;
      an_open_array  := 0;     & at least one is always open & & DEBUG &
      FOR array_num  := 1 UNTIL last_array DO
         BEGIN & for &
            IF memory_numb[array_num ] = mem_id THEN
               use_this_array := array_num
            ELSE IF memory_numb[array_num ] = 0 THEN
               an_open_array := array_num ;
         END;  & for &

      IF use_this_array = 0 THEN
         BEGIN & if not already in ram &
            use_this_array := an_open_array;
            IF ( memory_addr[use_this_array]
                    := request_array( block_size )
               ) <> 0 THEN
               BEGIN & if ram allocation successful &
                  memory_user[use_this_array] :=
                                 SBIT( memory_user[use_this_array],
                                       current_entry_ch
                                     );
                  memory_numb[use_this_array] := mem_id;
                  set_entry_ch_double( memory_addr[use_this_array],
                                       ch_m_base
                                     );
                  success := recall_data( entry_ch_double( ch_m_base )
                                                         - header_size,
                                       memory_file,
                                       mem_id
```

STRACE2.WORK.PD8510 THU, DEC 22, 1983, 11:05 AM PAGE 4

```
                                  );
          END  & if ram allocation successful &
        ELSE
          BEGIN & if ram allocation not successful &
            success := FALSE;
            warn( exceeded_available_memory );
          END;  & if ram allocation not successful &
      END  & if not already in ram &
    ELSE & desired memory was already in ram &
      memory_user[use_this_array] :=
            SBIT( memory_user[use_this_array], current_entry_ch );

    IF NOT success THEN
      BEGIN & if &
        release_mem;
        set_entry_ch_double( 0, ch_m_base);
      END;  & if &

    get_mem := success;

  END;  & get_mem &
```

STRACE2.WORK.PD8510 THU, DEC 22, 1983, 11:05 AM PAGE 5

```
#EJECT;
COMMENT                                                        data_on
************************************************************************
*
************************************************************************
;
SUBROUTINE data_on;
  BEGIN & data_on &
    set_entry_ch_integer( d_on, ch_d_state );
    IF current_entry_ch = 1 THEN
      move(trace1_position, trace1_x, trace1_y)
    ELSE & entry ch = 2 &
      move(trace2_position, trace2_x, trace2_y);
  END;  & data_on &
```

STRACE2.WORK.PD8510 THU, DEC 22, 1983, 11:05 AM PAGE 6

```
#EJECT;
COMMENT                                                        data_off
************************************************************************
*
************************************************************************
;
SUBROUTINE data_off;
  BEGIN & data_off &
    IF current_entry_ch = 1 THEN
      jmp( trace1_position, end_trace1 )          & ch 1 data trace &
    ELSE & entry ch = 2 &
      jmp( trace2_position, end_trace2 );         & ch 2 data trace &
    set_entry_ch_integer( d_off, ch_d_state );
    abort_sweep;
  END;  & data_off &
```

STRACE2.WORK.PD8510 THU, DEC 22, 1983, 11:05 AM PAGE 7

```
#EJECT;
COMMENT                                                        mem_off
************************************************************************
*
************************************************************************
;
SUBROUTINE mem_off;
  BEGIN & mem_off &
    IF current_entry_ch = 1 THEN
      jmp( trace1m_position,                      & ch 1 memory trace &
           trace1m_display + trace_size
         )
    ELSE & entry ch = 2 &
      jmp( trace2m_position,                      & ch 2 memory trace &
           trace2m_display + trace_size
         );
    set_entry_ch_integer( m_off, ch_m_state );
  END;  & mem_off &
```

```
#EJECT;
COMMENT                                                              mem_on
***************************************************************************
*
*  Sets the channel table value for ch_m_state to m_on, turns on the
*  CRT memory trace, and updates the positioning vecotr to avoid a line
*  to the first point.
*
***************************************************************************
;
PROCEDURE  mem_on;
   BEGIN & mem_on &
      INTEGER position,
              display,
              x,
              y,
              dg_addr;

      set_entry_ch_integer( m_on, ch_m_state );

      & turn on CRT memory trace &
      IF current_entry_ch = 1 THEN
         BEGIN & if &
            position := trace1m_position;
            display  := trace1m_display;
         END   & if &
      ELSE & entry_ch = 2 &
         BEGIN & else &
            position := trace2m_position;
            display  := trace2m_display;
         END   & else &

      & update first position vector (to avoid a line) &
      dg_addr := dg_read_xy( display, x, y );
      dg_addr := move2( position, x, y );

   END;  & mem_on &
```

```
#EJECT;
COMMENT                                                       data_into_mem
***************************************************************************
*
***************************************************************************
;
PROCEDURE  data_into_mem( mem_id );
   VALUE   mem_id;
   INTEGER mem_id;
   BEGIN & data_into_mem &
      INTEGER array_num,
              other_ch;

      save_data( entry_ch_double(ch_d_base) - header_size,
                 block_size,
                 memory_file,
                 mem_id
               );

      & see if any channel is looking at this memory number &
      FOR array_num  := 1 UNTIL last_array DO
         IF memory_numb[array_num ] = mem_id THEN
            copy_user3( entry_ch_double(ch_d_base),
                        memory_addr[array_num ],
                        number_of_points
                      );

      IF entry_ch_integer(ch_trace_math) <> math_off THEN
         partial( update_d )              & will also update mem if on &
      ELSE IF entry_ch_integer(ch_m_state) = m_on THEN
         partial( update_m );

      IF trace_mode <> single_ch THEN
         BEGIN & if &
            other_ch := 3 - current_entry_ch;
            IF ch_integer( ch_trace_math, other_ch ) <> math_off THEN
               ch_partial( update_d, other_ch )
            ELSE IF ch_integer( ch_m_state, other_ch ) = m_on THEN
               ch_partial( update_m, other_ch );
         END;  & if &

   END;  & data_into_mem &
```

```
#EJECT;
COMMENT                                                          select_mem
***************************************************************************
*
*  Allocates memory if necessary (true memory array, not data or cal),
*  and sets the channel table value for ch_m_base.  Returns TRUE if
*  successful, FALSE otherwise.
*
***************************************************************************
;
BOOLEAN PROCEDURE select_mem( mem_id );
   VALUE   mem_id;
   INTEGER mem_id;
   BEGIN & select_mem &
      BOOLEAN result;

      IF ( (mem_id <= mem4) AND (mem_id >= mem1) )THEN
         result := get_mem( mem_id )
      ELSE IF mem_id <= data2 THEN  & measured data &
         BEGIN & else measured data &
            set_entry_ch_double( ch_double( ch_d_base,
                                            1 - data1 + mem_id
                                          ),
                                 ch_m_base
                               );
            result := TRUE;
         END   & else measured data &
      ELSE
         result := FALSE;                              & bad mem_id number &

      select_mem := result;
   END;  & select_mem &
```

```
#EJECT;
COMMENT                                              partial_set_trace_type
***************************************************************************
*
*  NOTE:  Must leave memory allocated and in ram even for data_and_mem
*  in order to be able to update scale/div, etc., quickly.
*
***************************************************************************
;
PROCEDURE  partial_set_trace_type( trace_type );
   VALUE   trace_type;
   INTEGER trace_type;
   BEGIN & partial_set_trace_type &
      BOOLEAN old_mem,
              old_data,
              new_mem,
              new_data;


      old_mem  := new_mem  := entry_ch_integer( ch_m_state ) = m_on;
      old_data := new_data := entry_ch_integer( ch_d_state ) = d_on;

      IF trace_type <> trace_data_into_mem THEN
         BEGIN & if not d->m &

            & MEMORY &
            IF trace_type >= trace_mem_limit THEN       & will need ram &
               BEGIN & if &
                  IF NOT select_mem(entry_ch_integer(ch_mem_nmbr)) THEN
                     BEGIN & if unsuccessful &
                        trace_type := trace_data;
                        hilight_key( cmd_data, cmd_data, cmd_math );
                     END;  & if unsuccessful &
               END   & if &
            ELSE                                      & will not need ram &
               release_mem;

            & MATH &
            IF trace_type >= trace_math_limit THEN   & common for math &
               BEGIN & if &
                  new_data := TRUE;
                  new_mem := FALSE;
               END   & if &
            ELSE                                          & turn off math &
               BEGIN & else &
                  set_entry_ch_integer( math_off, ch_trace_math );
               END;  & else &

         END;  & if not d->m &


      CASE trace_type OF
         BEGIN & case &

& off &          BEGIN & off &
                    new_data := FALSE;
```

```
                  new_mem := FALSE;
               END;  & off &
& data &       BEGIN & data &
                  new_data := TRUE;
                  new_mem := FALSE;
               END;  & data &
& data -> mem &  data_into_mem( entry_ch_integer(ch_mem_nmbr) );
& memory &     BEGIN & memory &
                  new_data := FALSE;
                  new_mem := TRUE;
               END;  & memory &
& data and mem &  BEGIN & data and memory &
                  new_data := TRUE;
                  new_mem := TRUE;
               END;  & data and memory &
& data + mem &   set_entry_ch_integer( math_d_plus_m,  ch_trace_math );
& data - mem &   set_entry_ch_integer( math_d_minus_m, ch_trace_math );
& data * mem &   set_entry_ch_integer( math_d_times_m, ch_trace_math );
& data / mem &   set_entry_ch_integer( math_d_divided_by_m,
                                        ch_trace_math
                                      );

         END  & case &
      ELSE
         BEGIN & else case &                     & same as data only &
            release_mem;
            new_data := TRUE;
            new_mem := FALSE;
         END;  & else case &


      IF new_mem XOR old_mem THEN     & memory trace state has changed &
         IF new_mem THEN
            mem_on
         ELSE
            mem_off;

      IF new_data XOR old_data THEN  & data trace state has changed &
         BEGIN & if &
            IF new_data THEN
               data_on
            ELSE
               data_off;
            rebuild := TRUE;
         END;  & if &

      IF trace_type <> trace_data_into_mem THEN
         BEGIN & if &
            annotate_math_and_mem(trace_type);
            partial( update_d );  & else done by data_into_mem routine &
         END;  & if &

      IF rebuild THEN
         restart_sweep;      & no operation unless "control" is in idle &

   END;  & partial_set_trace_type &
```

```
#EJECT;
COMMENT                                                      set_trace_type
***********************************************************************
*
***********************************************************************
;
PROCEDURE  set_trace_type( trace_type );
   VALUE   trace_type;
   INTEGER trace_type;
   BEGIN & set_trace_type &
      IF trace_type <> trace_data_into_mem THEN
         hilight_on( cmd_data, cmd_math );
      partial_set_trace_type( trace_type );
   END;  & set_trace_type &
```

```
#EJECT;
COMMENT                                                    select_trace_mode
***********************************************************************
*
***********************************************************************
;
PROCEDURE  select_trace_mode( mode );
   VALUE   mode;
   BYTE    mode;
   BEGIN & select_trace_mode &
      IF mode <> trace_mode THEN
         BEGIN & if &
            abort_sweep;
            IF mode = single_ch THEN
               BEGIN & single channel &
                  hilight_on( cmd_single_ch, cmd_dual_ch );
                  hilight_off( cmd_overlay, cmd_split );
               END   & single channel &
            ELSE
               BEGIN & dual channel &
                  hilight_on( cmd_overlay, cmd_split );
                  hilight_key(cmd_dual_ch, cmd_single_ch, cmd_dual_ch);
               END;  & dual channel &
            pop_menu( DISPLAY_MENU );
            trace_mode := mode;
            rebuild := TRUE;
            trace_and_graticule;
            partial( update_d );
            IF trace_mode <> single_ch THEN
               BEGIN & if &
                  ch_partial( update_d, 3-current_entry_ch );
               END;  & if &
            restart_sweep;
         END;  & if &
   END;  & select_trace_mode &
```

```
#EJECT;
COMMENT                                                        select_memory
****************************************************************************
*
****************************************************************************
;
PROCEDURE  select_memory( memory );
   VALUE   memory;
   INTEGER memory;
   BEGIN & select_memory &
      hilight_on( cmd_memory1, cmd_memory_ch2 );
      pop_menu( DISPLAY_MENU );
      set_entry_ch_integer( memory, ch_mem_nmbr );
   END;  & select_memory &
```

```
#EJECT;
COMMENT                                                     annotate_math_op
****************************************************************************
*
****************************************************************************
;
SUBROUTINE annotate_math_op;                                          ENTRY;
   BEGIN & annotate_math_op &
      change_softkey( math_annotation[ entry_ch_integer(ch_math_op) -
                                       trace_math_limit
                                     ],
                      cmd_math,
                      2
                    );
   END;  & annotate_math_op &
```

```
#EJECT;
COMMENT                                                        select_math_op
****************************************************************************
*
****************************************************************************
;
PROCEDURE  select_math_op( op );
   VALUE   op;
   INTEGER op;
   BEGIN & select_math_op &
      hilight_on( cmd_d_plus_m, cmd_d_div_m );
      set_entry_ch_integer( op, ch_math_op );
      annotate_math_op;
      pop_menu( DISPLAY_MENU );
   END;  & select_math_op &
```

```
#EJECT;
COMMENT                                                       repaint_traces
****************************************************************************
*
****************************************************************************
;
PROCEDURE  repaint_traces;                                            ENTRY;
   BEGIN & repaint_traces &
      INTEGER trace_type;

      IF entry_ch_integer( ch_m_state ) = m_on THEN
         IF entry_ch_integer( ch_d_state ) = d_on THEN
            trace_type := trace_data_and_mem
         ELSE
            trace_type := trace_mem
      ELSE & m_off and d_on (can't have both m_off and d_off) &
         IF entry_ch_integer( ch_trace_math ) = math_off THEN
            trace_type := trace_data
         ELSE
            trace_type := entry_ch_integer( ch_math_op );

      partial_set_trace_type( trace_type );

   END;  & repaint_traces &
```

```
STRACE2.WORK.PD8510            THU, DEC 22, 1983, 11:05 AM    PAGE  20

#EJECT;
COMMENT                                                              init_trace
**************************************************************************
*
**************************************************************************
;
PROCEDURE  init_trace;                                                ENTRY;
   BEGIN & init_trace &
      INTEGER array_num,
              trace_type;

      mem_off;
      data_off;

      FOR array_num  := 1 UNTIL last_array DO
         BEGIN & for &
            memory_addr[array_num ] := 0;                          & DEBUG &
            memory_numb[array_num ] := 0;
            memory_user[array_num ] := 0;
         END;  & for &

      annotate_math_op;
      repaint_traces;

   END;  & init_trace &

#FILE fdisp.work;

ENDS
```

```
STRIGTBL.WORK.PD8510            THU, DEC 22, 1983, 11:05 AM    PAGE   1

M68KL,P,"trigtbl"  BEGIN

 EXTERNAL  DOUBLE ARRAY sine_cos.L[0:1024];    &word access in disp ram&
 EXTERNAL INTEGER MODFR;

 DOUBLE SINTH=REGISTER 1, COSTH=REGISTER 2, SINDTH, COSDTH;
 INTEGER ILOOP;
 INTEGER MPTR=REGISTER 9;

 PROCEDURE save_sin_cos( val , adr );
                        VALUE val, adr; DOUBLE val; INTEGER adr;
       ASSEMBLE( MOVE.W adr, R5;          ADD.W  R5, R5;     ADD.W R5,R5;
             LEA sine_cos.L,R11;    ADD.W  R5,R11;
             SWAP R0;               MOVE.W R0,(R11)+        ;
             SWAP R0;               MOVE.W R0,(R11)        );

 SUBROUTINE sin_cos_iter;
  BEGIN
  FOR ILOOP:=1 TO 255 DO
     BEGIN ASSEMBLE(
       LEA MODFR, MPTR;
       MOVE.L COSDTH, (R9)+;
       MOVE.L SINTH,  (R9)+;
       MOVE.L COSTH,  (R9)+;
       MOVE.L COSTH,  (R9)+;
       MOVE.L SINTH,  (R9)+);
     SINTH:=SINTH+Z08000; IF OVERFLOW THEN SINTH:=Z7FFF0000;
     COSTH:=COSTH+Z08000; IF OVERFLOW THEN COSTH:=Z7FFF0000;
     ASSEMBLE(
       SWAP COSTH;
       MOVE COSTH, SINTH);
     save_sin_cos( SINTH , ILOOP );
     ASSEMBLE(
       MOVE.L (R9)+, SINTH;
       MOVE.L (R9)+, COSTH;
       MOVE.L SINDTH, (R9)+;
       ADD.L  (R9)+, SINTH;
       SUB.L  (R9)+, COSTH);
     END;
  END sin_cos_iter;

 SUBROUTINE init_trig; ENTRY;
 BEGIN
  SINTH:=SINDTH:=13176712;
  COSTH:=COSDTH:=2147443228;
  sin_cos_iter;
  FOR ILOOP:=1 STEP 1 UNTIL 255 DO
      BEGIN
      COSTH:=sine_cos[ILOOP];
      ASSEMBLE(SWAP COSTH; NEG COSTH);
      save_sin_cos( COSTH , ILOOP + 256 );
      ASSEMBLE(SWAP COSTH; NEG COSTH);
      save_sin_cos( COSTH , ILOOP + 512 );
      ASSEMBLE(SWAP COSTH; NEG COSTH);
      save_sin_cos( COSTH , ILOOP + 768 );
```

```
STRIGTBL.WORK.PD8510            THU, DEC 22, 1983, 11:05 AM    PAGE   2

      END;
   save_sin_cos( Z00007FFF ,    0 );
   save_sin_cos( Z00007FFF , 1024 );
   save_sin_cos( Z7FFF0000 ,  256 );
   save_sin_cos( Z00008000 ,  512 );
   save_sin_cos( Z80000000 ,  768 );
  END build_trig;
ENDS
```

```
FUART.WORK.PD8510            THU, DEC 22, 1983, 11:05 AM    PAGE   1
```

SWART.WORK.PD8510 THU, DEC 22, 1983, 11:05 AM PAGE 1

SWART.WORK.PD8510 THU, DEC 22, 1983, 11:05 AM PAGE 2

CUTIL.WORK.PD8510 THU, DEC 22, 1983, 11:06 AM PAGE 1

```
BYTE CONSTANT
  macro_char :=  '?;
```

FUTIL.WORK.PD8510 THU, DEC 22, 1983, 11:06 AM PAGE 1

```
#FILE cmessage.work;
#FILE futil3.work;
```

```
SUTIL.WORK.PD8510              THU, DEC 22, 1983, 11:06 AM      PAGE   1

M68KL,P,"util"
BEGIN

#FILE cutil.work;
#FILE cids.work;
#FILE fscreen.work;
#FILE ftopmisc.work;
#FILE fpubib.work;
#FILE cpubib.work;
#FILE foutib.work;                         & for wrt_pubib_string &
#FILE cmsgnbn.work;                     & for bubble failure messages &
#FILE cmessag2.work;
#FILE cdebug.work;                                            & DEBUG &
#FILE fterm.work;                                             & DEBUG &
#FILE falphas.work;
#FILE fstring.work;
#FILE ffmt.work;


INTEGER CONSTANT tell_severity  := 0,
                 warn_severity  := 1,
                 fatal_severity := 2,
                 null_severity  := -1,
                 macro_mode     := -1,
                 string_size    := 60;
DOUBLE  CONSTANT error_format   := Z27000500;

INTEGER  prior_severity,
         held_severity,
         held_message;

ALPHA macro_msg;
BYTE ARRAY macro_str [0:string_size];

ALPHA TABLE prefix :=
   " ",
   "CAUTION: ",
   "ERROR: ";
```

```
SUTIL.WORK.PD8510              THU, DEC 22, 1983, 11:06 AM      PAGE   2

#EJECT;
COMMENT                                                                   util
.........................................................................
.
. This module defines the following utility procedures.
.    tell
.    warn
.    fatal
.
.........................................................................
;
PROCEDURE  print_message( message_number, severity );
   VALUE   message_number, severity;
   INTEGER message_number, severity;
   BEGIN & print_message &
      IF ( (severity > prior_severity) OR
         (message_number = null_message)
         ) THEN
         BEGIN & if &
            IF severity > tell_severity THEN
               prior_severity := severity
            ELSE
               prior_severity := null_severity;
            held_severity := severity;
            clear_string(error);
            append_string(error, prefix[severity]);
            IF message_number <> macro_mode THEN
               BEGIN
                  held_message := message_number;
                  macro_msg := ADRS(byte_list) + message_number;
               END;
            append_string(error, macro_msg);
            print_string( error, error_size, error_display );
         END;  & if &
      IF message_debug THEN                                        & DEBUG &
         BEGIN & if &                                              & DEBUG &
            WHEX( message_number );                                & DEBUG &
            clear_string(error);                                   & DEBUG &
            append_string(error, prefix[severity]);                & DEBUG &
            IF message_number <> macro_mode THEN                   & DEBUG &
               macro_msg := ADRS(byte_list) + message_number;      & DEBUG &
            append_string(error, macro_msg);                       & DEBUG &
            WSTR( error );                                         & DEBUG &
            CRLF;                                                  & DEBUG &
         END;  & if &                                              & DEBUG &
   END;  & print_message &
```

```
SUTIL.WORK.PD8510              THU, DEC 22, 1983, 11:06 AM      PAGE   3

      get_macro(macro_insert, message_number, severity);
       macro_insert, message_number, severity;
       macro_insert;
   INTEGER message_number, severity;
   BEGIN & get_macro &
      INTEGER lgth, lgth2,
              i = REGISTER 6;
      BYTE POINTER str1,
                   str2 = macro_insert;

      IF severity > prior_severity THEN   & update message number held &
         held_message := message_number;
      macro_msg := ADRS(macro_str);
      STPNTR(str1, ADRS(byte_list) + message_number);
      & check for string overflows in original and macro strings &
      lgth := (IF str1 > string_size THEN string_size ELSE str1);
      lgth2:= (IF (lgth+str2) > string_size THEN (string_size-lgth)
                                             ELSE str2);
      i := 0;
      DO i:=i+1 UNTIL ((str1[i] = macro_char) OR (i = lgth))
         ;
      MOVE macro_str := str1, +(i+1); & copy to macro char or str1 end &
      IF (str1[i] = macro_char) AND (lgth2 > 0) THEN
         BEGIN
            MOVE macro_str[i] := str2[1], +(lgth2);
                                              & insert macro string &
            MOVE macro_str[i+str2]:= str1[i+1],+(lgth-i);
                                              & copy rest of string &
            macro_str := lgth + lgth2 - 1;    & set new string lgth &
         END;                     & -1 accounts for macro char &
      print_message (macro_mode, severity);
      IF severity = warn_severity THEN
         BEGIN
            beep(error_tone);
            set_serial_poll( problem_srq );
         END;
   END;  & get_macro &
```

```
SUTIL.WORK.PD8510              THU, DEC 22, 1983, 11:06 AM      PAGE   4

#EJECT;
COMMENT                                                                   tell
*************************************************************************
*
* EXTERNAL SPECIFICATION FOR tell
*
* FUNCTION: To print a message to the user.  The message displayed
*           is specified by the message parameter declared in file
*           "cmessage".
*
* PARAMETER DESCRIPTION:
*
*    INPUT:  message      the message to be displayed (index from file
*                         "cmessage").
*
*    OUTPUT: none
*
* USAGE:
*    #FILE cmessage.
*    tell( calibration_prompt ).
*
* EXTERNAL EFFECTS:
*
* COMMENTS:
*
*************************************************************************
*
* LOGIC INFORMATION FOR tell
*
* INITIAL REFINEMENT:
*    print message
*
*************************************************************************
;
PROCEDURE tell( message_number );
   VALUE   message_number;
   INTEGER message_number;                                          ENTRY;
   BEGIN & tell &
      print_message( message_number, tell_severity );
   END; & tell &


PROCEDURE  macro_tell( message_number, macro_number);
   VALUE   message_number, macro_number;
   INTEGER message_number, macro_number;                            ENTRY;
      BEGIN & macro_tell &
         get_macro( ADRS(byte_list) + macro_number,
                    message_number,
                    tell_severity);
      END;  & macro_tell &


PROCEDURE  compute_tell( string, message_number );
   VALUE   string, message_number;
   ALPHA   string;
   INTEGER message_number;                                          ENTRY;
```

```
   BEGIN & compute_tell &
      get_macro(string, message_number, tell_severity);
   END;  & compute_tell &


PROCEDURE  acknowledge(message_number);
   VALUE   message_number;
   INTEGER message_number;                                 ENTRY
   BEGIN
      tell(message_number);
      beep(done_tone);
   END aknowledge;
```

```
#EJECT;
COMMENT                                                               warn
***********************************************************************
*
* EXTERNAL SPECIFICATION FOR warn
*
* FUNCTION
*    Identical to "tell" except "WARNING: " is prefixed to the selected
* message. The maximum message length is reduced by 9 characters since
* the "WARNING: " has to fit in the same space.
*
* PARAMETER DESCRIPTION:
*
*    INPUT:  message       the message to be displayed.
*
*    OUTPUT: none
*
* USAGE:
*    #FILE cmessage.
*    warn( no_tape_in_drive ).
*
* EXTERNAL EFFECTS:
*
* COMMENTS:
***********************************************************************
*
* LOGIC INFORMATION FOR warn
*
* INITIAL REFINEMENT:
*    prefix "WARNING: " to the message
*    display message
*
***********************************************************************
;
PROCEDURE warn(message_number);
   VALUE   message_number;
   INTEGER message_number;                                    ENTRY;
      BEGIN & warn &
         beep(error_tone);
         print_message(message_number, warn_severity);
         set_serial_poll( problem_srq );
      END;  & warn &


PROCEDURE  macro_warn(message_number, macro_number);
   VALUE   message_number, macro_number;
   INTEGER message_number, macro_number;                      ENTRY;
   BEGIN & macro_warn &
      get_macro( ADRS(byte_list)+macro_number,
                 message_number,
                 warn_severity);
   END;  & macro_warn &


PROCEDURE  compute_warn(string, message_number);
```

```
   VALUE   string, message_number;
   ALPHA   string;
   INTEGER message_number;                                 ENTRY;
   BEGIN & compute_warn &
      get_macro (string, message_number, warn_severity);
   END;  & compute_warn &
```

```
#EJECT;
COMMENT                                                              fatal
***********************************************************************
*
* EXTERNAL SPECIFICATION FOR fatal
*
* FUNCTION
*    Identical to "tell" except "ERROR: " is prefixed to the selected
* message. The maximum message length is reduced by 7 characters since
* the "ERROR: " has to fit in the same space.  The "fatal" function
* also prints the address for the calling routine and causes the
* processor to hang.
*
* PARAMETER DESCRIPTION:
*
*    INPUT:  message       the message to be displayed.
*
*    OUTPUT: none
*
* USAGE:
*    #FILE cmessage.
*    fatal( phase_lock_error ).
*
* EXTERNAL EFFECTS:
*
* COMMENTS:
***********************************************************************
*
* LOGIC INFORMATION FOR fatal
*
* INITIAL REFINEMENT:
*    prefix "ERROR: " to the message
*    display message
*    display calling routine's address
*    cause the processor to hang (repeating memory refreshes)
***********************************************************************
;
PROCEDURE fatal( message_number );
   VALUE   message_number;
   INTEGER message_number;                                    ENTRY;
   BEGIN & fatal &

      COMMENT
        Check for error message numbers that could occur on power up
        prior to loading message strings from bubble to RAM since bubble
        may be trashed by then;
      IF (message_number = un_init_mbn) OR
         (message_number = bubble_init_error) THEN
        BEGIN
          IF (held_message := message_number) = un_init_mbn THEN
            macro_msg := "UNINITIALIZED DATA"
          ELSE
            macro_msg := "UNABLE TO SAVE/RECALL DATA";
          message_number := macro_mode;
```

```
        END;

      beep(error_tone);
      print_message( message_number, fatal_severity );
      set_serial_poll( problem_srq );
hang: TRAP(refresh_vctr);                & refresh in case interrupts off&
      GO TO hang;                        & so nothing happens to message &
                                         &   until it can be read.      &
   END; & fatal &
```

```
#EJECT;
COMMENT                                                         clear_message
*************************************************************************
*
* EXTERNAL SPECIFICATION FOR clear_message
*
* FUNCTION: To clear a message from the screen.  The message currently
*           displayed will be cleared if it is the same as the specified
*           message.
*
* PARAMETER DESCRIPTION:
*
*    INPUT:  message       the message to be cleared (index from file
*                          "cmessage").
*
*    OUTPUT: none
*
* USAGE:
*    #FILE cmessage.
*    clear_message( calibration_prompt ).
*
* EXTERNAL EFFECTS:
*
* COMMENTS:
*
*************************************************************************
*
* LOGIC INFORMATION FOR clear_message
*
* INITIAL REFINEMENT:
*    IF message_number = held_message THEN
*       tell( null_message ).
*
*************************************************************************
;
PROCEDURE clear_message( message_number );
   VALUE   message_number;
   INTEGER message_number;                                      ENTRY;
   BEGIN & clear_message &
      IF ( (message_number = held_message) OR
           (message_number = all_messages)
         ) THEN
         tell( null_message );
   END; & clear_message &
```

```
#EJECT;
COMMENT                                                         output_error
*************************************************************************
*
*************************************************************************
;
PROCEDURE  output_error;                                        ENTRY;
   BEGIN & output_error &
      BYTE ARRAY output_array[-1:string_size];
      ALPHA      output_string;
      BYTE       fmt;
      & initialize string &
      output_string := ADRS( output_array );
      output_string := init_string( output_string, string_size );
      append_ch( format_integer( held_message,
                                 output_string,
                                 error_format
                               ),
                 ','
               );
      append_ch( output_string, '"' );
      append_string( output_string, prefix[held_severity] );
      append_string( output_string, macro_msg );
      append_ch( output_string, '"' );
      append_ch( output_string, newline );
      wrt_pubib_string( output_string );
      tell( null_message );        & clear message and "held_" values &
   END;  & output_error &


SUBROUTINE init_message;                                        ENTRY;
   BEGIN
      prior_severity := null_severity;
      held_severity := tell_severity;
      held_message := null_message;
      macro_msg := ADRS(byte_list)+null_message;
   END;

END$
```

```
COMMENT  must be used with either cmessage or futil for message_number;

PROCEDURE  fatal( message_number );
   VALUE   message_number;
   INTEGER message_number;                                      EXTERNAL;
PROCEDURE clear_message( message_number );
   VALUE   message_number;
   INTEGER message_number;                                      EXTERNAL;
PROCEDURE  output_error;                                        EXTERNAL;
```

FUTIL3.WORK.PD8510 THU, DEC 22, 1983, 11:06 AM PAGE 1

```
PROCEDURE  tell( message_number );
   VALUE   message_number;
   INTEGER message_number;                                  EXTERNAL;
PROCEDURE  warn( message_number );
   VALUE   message_number;
   INTEGER message_number;                                  EXTERNAL;
PROCEDURE  acknowledge(message_number);
  VALUE    message_number;
  INTEGER  message_number;                                  EXTERNAL;
```

FUTIL4.WORK.PD8510 THU, DEC 22, 1983, 11:06 AM PAGE 1

```
$FILE cutil.work;

PROCEDURE macro_tell ( message_number, macro_number);
   VALUE message_number, macro_number;
   INTEGER message_number, macro_number;                    EXTERNAL;

PROCEDURE compute_tell ( string, message_number );
   VALUE   string, message_number;
   ALPHA   string;
   INTEGER message_number;                                  EXTERNAL;

PROCEDURE macro_warn (message_number, macro_number);
  VALUE   message_number, macro_number;
  INTEGER message_number, macro_number;                     EXTERNAL;

PROCEDURE compute_warn (string, message_number);
  VALUE   string, message_number;
  ALPHA   string;
  INTEGER message_number;                                   EXTERNAL;
```

OUTPUTO.WORK.PD8510 THU, DEC 22, 1983, 11:06 AM PAGE 1

```
8RAM$         000100
swp_gn        000108
TwoPi         000112
Pi            000116
Pi2           00011A
Pi4           00011E
Pi8           000122
Sqrt2         000126
deg_to_radia00012A
speed_of_lig00012E
speed_of_lig000132
$DATE$        00032A
ch_dp_ptrs    000456
type_of_grat0004A8
s_coeff       00066A
cpx_1         000692
time_wind     000786
cmd_if_gain   0008EC
cmd_if_port   0008F2
file_type     000920
title_size2   000AE8
entry_size2   000AEA
function_siz000AEC
entry_aux_si000AEE
title_displa000AF0
entry_displa000AF2
entry2_displ000AF4
function_dis000AF6
entry_aux_di000AF8
TENI          000EBE
TWOX          000FF6
EXP           0010C2
SIN           0010D6
COS           00117E
ATAN          00121A
BESI          00129C
exp_cmplx     001316
LOG2          00137C
NEG1          001430
RNEG1         00143A
ADD1A         00144C
ADD1G         001452
ADD1M         001458
ADD1T         00145E
ADD1          001462
SUB1A         001474
SUB1G         00147A
SUB1M         001480
SUB1T         001486
SBR1A         00148C
SBR1G         001492
SBR1M         001498
SBR1T         00149E
SBR1          0014A6
SUB1          0014AA
```

OUTPUTO.WORK.PD8510 THU, DEC 22, 1983, 11:06 AM PAGE 2

```
MPY1A         0014BC
MPY1G         0014C2
MPY1M         0014C8
MPY1T         0014CE
MPY1          0014D2
exp_overflow00150A
DIV1A         001518
DIV1G         00151E
DIV1M         001524
DIV1T         00152A
DVR1A         001530
DVR1G         001536
DVR1M         00153C
DVR1T         001542
DVR1          001546
DIV1          00154A
CMV2E         00158C
CMV1E_save    0015B4
CMV1E         0015C6
fetch_CMVE1   001642
CMVE1         001646
CMVe1         001648
CMVE20_1      001656
copy_user3    001670
MPYE_ptrs     00169E
MPYE          0016B0
MPYE_ptr      0016BE
ADDE          0016DE
ADDE_ptr      0016EE
SBRE          00171C
SBRE_ptr      001722
SUBE          001728
SUBE_ptr      001736
DVRE          001744
DVRE_ptr      00174E
DIVE          001788
DIVE_ptr      001792
ABS2          0017A0
NEG2          0017A4
RABS2         0017BC
RNEG2         0017C0
MPY2T         0017C8
MPY2M         0017CE
MPY2G         0017D4
MPY2A         0017DA
MPY2          0017DE
ADD2T         00180A
ADD2M         001810
ADD2G         001816
ADD2A         00181C
ADD2          001820
SUB2T         001862
SUB2M         001868
SUB2G         00186E
SUB2A         001874
SBR2T         00187A
```

```
OUTPUTO.WORK.PD8510            THU, DEC 22, 1983, 11:06 AM     PAGE  3

SBR2M        001880
SBR2G        001886
SBR2A        00188C
SBR2         001890
SUB2         001892
CMP2T        001898
CMP2M        00189E
CMP2G        0018A4
CMP2A        0018AA
CPR2T        0018B0
CPR2M        0018B6
CPR2G        0018BC
CPR2A        0018C2
CPR2         0018C6
CMP2         0018C8
MOD2G        0018D0
MOD2A        0018D6
MOD2         0018DE
DIV2T        0018F4
DIV2M        0018FA
DIV2G        001900
DIV2A        001906
DVR2T        00190C
DVR2M        001912
DVR2G        001918
DVR2A        00191E
DVR2         001922
DIV2         001924
CNV13        0019CE
CNV15        0019CE
CNV23        0019CE
CNV25        0019CE
CNV52        001A02
CNV42        001A04
CNV51        001A08
CNV41        001A0A
CNV31        001A0C
CNV32        001A0E
CNV14        001A20
CNV24        001A20
MPY3T        001A40
MPY3M        001A46
MPY3G        001A4C
MPY3A        001A52
MPY3         001A56
MPY3L        001A64
ABSA         001AAA
NEGA         001AAE
CMPAA        001AB4
CMPAG        001AB8
CMPAM        001ABC
CMPAT        001AC0
CPRAA        001AC4
CPRAG        001AC8
CPRAM        001ACC
CPRAT        001AD0
```

```
OUTPUTO.WORK.PD8510            THU, DEC 22, 1983, 11:06 AM     PAGE  4

CPRA         001AD2
CMPA         001AD6
LDRAT        001AEC
LDRAA        001B00
LDRAG        001B14
LDRAM        001B28
MPY9         001B3E
DIV9         001BC8
MPYAA        001D54
MPYAG        001D5A
MPYAM        001D60
MPYAT        001D66
MPYA         001D6A
DIVAA        001D74
DIVAG        001D7A
DIVAM        001D80
DIVAT        001D86
DIVA         001D8A
DVRAA        001D8E
DVRAG        001D94
DVRAM        001D9A
DVRAT        001DA0
DVRA         001DA4
CNV5A        001DAC
CNV4A        001DAE
CNV3A        001DB0
CNVA3        001DB8
CNVA4        001DB8
CNVA5        001DB8
CNV2A        001DBC
CNVA2        001E10
MOD3G        001E3A
MOD3A        001E3E
MOD3         001E40
LDR2T        001E48
LDR2M        001E5A
LDR2G        001E6E
LDR2A        001E80
DIV3T        001E92
DIV3M        001E96
DIV3G        001E9A
DIV3A        001E9E
DVR3T        001EA2
DVR3M        001EA6
DVR3G        001EAA
DVR3A        001EAE
DVR3         001EB0
DIV3         001EB2
DIV3L        001EF0
DIV3R        001F1A
SQRT         001F30
CASE         001F90
wrt_disp_qua001FA8
wrt_disp_dbl001FB8
wrt_disp_rea001FB8
wrt_disp_int001FBE
```

```
OUTPUTO.WORK.PD8510            THU, DEC 22, 1983, 11:06 AM     PAGE  5

wrt_disp_byt001FC4
wrt_disp_str001FEC
preempt      0020A0
send         0020BE
wait         0020EE
awaited      002130
pending      002148
waitio       002160
acquire      002194
conditional_002216e
release      00224C
delay        00228E
pause        0022F6
terminate    0023A4
abort        0023C0
run          0023E0
create       00245E
signal_init  00251E
resource_ini002540
intrpt_botto00255E
intrpt_rpg   002594
intrpt_top_k0025CA
intrpt_uart  002600
intrpt_priv_002636
intrpt_delay00266C
intrpt_tick  0026AE
init_kernel  002712
snapshot     00284A
init_fifo    00290C
write_fifo   002A2E
read_fifo    002A8C
empty_fifo   002B3E
draw         002B72
xdraw        002B80
ydraw        002B08
move         002C00
move2        002C40
movech       002C66
movech2      002CAE
plot         002CD4
printch      002026
crlf         002054
lb           002080
setattribute002DD8
jmp          002E04
jsr          002E2C
rts          002E54
dg_write     002E84
dg_read      002EA6
dg_read_xy   002ECA
print_hex    002EFE
dg_hex       002F2A
init_display002F74
clear_displa002FE2
irint        002FFC
iradr        00308A
```

```
OUTPUTO.WORK.PD8510            THU, DEC 22, 1983, 11:06 AM     PAGE  6

irrdy        0030E4
iren         0030EC
irdis        0030F4
irclr        0030FC
irset        003104
irack        00310C
irirr        003120
clear_string003130
init_string  003136
append_ch    003146
append_strin003176
CNV92        0031B2
CNV9A        003414
format_integ0036EC
format_doubl0036EE
format_quad  003736
format_real  00376A
format_3_cmp00378C
bcd_of_int   003B70
WCHAR        003E28
WSTR         003E4E
CRLF         003E68
WNUM         003E80
WQUAD        003EA2
WREAL        003EC8
WCPX         003EEE
WHex         003F10
WHEX         003F52
RCHAR        003F6E
limit_quad   003F86
select_activ00420C
select_activ0047D6
enter_active0047EC
rpg_entry    00541A
step_entry   005732
keypad_entry0059F2
marker_value005AF4
marker_to    005B88
auto_scale   005C02
output_activ005EAA
output_ident005F1A
init_active  005F68
ch_integer   005FFC
ch_real      006062
ch_quad      0060EA
ch_double    006164
acquisition_0061DA
acquisition_0061EC1
acquisition_0061FEd
acquisition_006210b
entry_ch_int006222
entry_ch_rea006234
entry_ch_qua006246
entry_ch_dou006258
set_ch_integ0062D6
set_ch_doubl00634E
```

OUTPUTO.WORK.PD8510 THU, DEC 22, 1983, 11:06 AM PAGE 7

```
set_ch_real 006302
set_entry_ch0063F0e
set_entry_ch00640Ae
set_ch_quad 006424
set_entry_ch0064A8
set_entry_ch0064C4
select_coupl0064E2
coupled_ch  0065A0
partial_sele0065BAr
select_entry0065CC
select_acqui006674_
init_ch_tabl0066AC
set_stimulus00670C
update_start00691C
update_start006930
update_cente00696C
enter_freque0069AAt
frequency_at006B0A
entry_freque006C8E
entry_stimul006CB8p
point_at_ch_006DC8
point_at_fre006DF8
step_stimulu006E14
set_aux_out 006E24
wrt_priv_ib_006E58_
init_source 006EB4
init_ch_stim006F8A
preset_sourc006FAA
init_stimuli006FCA
reset_acqui00070A0d
partial_new_007566
new_step_siz007720
set_up_param007744
set_dp_ptrs 0078A8
init_group_c00799E_
init_control007A38b
init_mbm    007A58
test_mbm    007A76
parms_mbm   007A7E
set_add_mbm 007A86
status_mbm  007A8E
read_mbm    007A96
wrt_mbm     007A9E
read_boot_mb007AA6
wrt_boot_mbm007AAE
TPINT       007ABA
TPST        007AC0
TPErr       007AC6
REW         007ACC
TPRED       007AD2
TPWRT       007AD8
INgap       007ADE
TPready     007AE4
TPmark      007AEA
TPseek      007AF0
TPrecord    007AF6
```

OUTPUTO.WORK.PD8510 THU, DEC 22, 1983, 11:06 AM PAGE 8

```
update_doma1007B08
partial_set_007B38
proc11       007CD6
mark0        007E5C
set_vars_ptr00806E
frequency_st008084
data_proc_ch0080C8
data_proc_ch008106
reset_data_p008172
control_data00817Cf
control_data008358
update_data_0085B6
log_lin_ang 0086B8
min_max      008718
beep         0087E2
init_top_mis00882E
uart_process00885C
init_keyboar008886
top_key      0088C0
keyboard     00896E
get_number   0089FA
init_bottom_008C1A
bottom_key   008C3A
reset_rpg    008CE0
rpg          008D02
bottom_box   008D46
init_output 008E3E
pub_ib_outpu008F8Ac
pub_ib_forma008FA4c
pub_ib_outpu008FB2
pub_ib_input0091FEt
pub_ib_input009212
proc0        00936C
abort_sweep 009A42
restart_swee009AAA
measurement_009AB8t
hold_sweep   009ABE
single_sweep009ACA
continuous_s009ADA
n_sweep      009AEA
control      009F74
init_public_00A0A6o
parser       00A30C
print_string00A9A4
print_big_st00AA1E
blank_displa00ABBA
enable_displ00ABC6
init_screen 00ABD2
update_hpib_00AD36
set_major_ad00AD64
set_minor_ad00AD72
set_serial_p00AD84
clear_serial00AE5C
request_mask00AE82
input_block 00B33C
pass_thru_co00B45E
```

OUTPUTO.WORK.PD8510 THU, DEC 22, 1983, 11:06 AM PAGE 9

```
local_key   00B8A2
hpib_listene00B918
list_op_para00C188
list_op_para00C22A
next_op_para00C23E
list_sys_par00C246
list_trace_v00C2F6
string_out_o00C4CE
wrt_pubib_st00C57C
next_xfer_re00C5F6
output_block00CAA8
output_statu00CBA8
output_tape 00CCCE
hpib_talker 00CCE8
release_mem 00CDE6
annotate_mat00D412
repaint_trac00D45C
init_trace  00D4BC
proc8       00D4FE
graticule_ty00D67A
partial_trac00DF88g
trace_and_gr00E270
init_gratic 00E29A
get_frequenc00E324
disable_phas00E380_
check_abort 00E3FA
break_entry_00E8041
break_acq_co00E846
coupled_brea00E85E
init_break  00E930
maintain_swe00E970
step_source 00ED82
phase_lock  00EE42
trigger_yadc00EE4E
break_idle  00EE78
break_paused00EE8A
intrpt_yadc 00EF02
init_yadc   00F12A
control_yadc00F164
set_if_gain 00F238
init_auto_ra00F244
check_overlo00F266
auto_ranging00F280
control_rece00F326
calib_yadc  00FDE0
correct_tabl00FEAA
conv_table  00FEBE
math_table  00FECE
fmt_table   00FEE2
update_table00FF12
conv_to_z   00FF8E
conv_to_y   00FFC4
conv_to_reci00FFC6
logE        00FFD6
angE        010048
magE        010150
```

OUTPUTO.WORK.PD8510 THU, DEC 22, 1983, 11:06 AM PAGE 10

```
array_correc01018E
array_elec_10101F0
compute_data01022E
update_d_loo0102AA
dec_smoothin01030A
one_port_cor0104B2
two_port_cor0104CE
machine_dump010612
new_data     0106D4
gen_cal_info010B12
gen_save_mem0108BA
gen_last_reg010D32
save_last_st010D3C
save         010D56
recall       010D84
recall_prese010D84e
recall_power010E02a
proc1        010E58
cal_size     01104E
restore_para011090
deallocate_c01109C
partial_allo01112Ca
init_correct011188
cal_acquisit011FAAn
acquire_data011FDA
proc7        012082
clear_param_0123A2
correction_o012406
correction_o012616
param_correc012654h
save_cal     012680
init_cal0    0127BE
recall_pfr   0127EE
configure    012920
slow_test_se0129CC
device_rever0129DC
set_test_set012A32
build_test_s012B64
preset_test_012F16
tdr_check    0132D4
control_data01335A
cyc_frac     013368
user3_zero   013590
array_datap 013FAA
set_coupled_01412E
init_coupled014182s
init_user_gr01421E
parse_user_g01453E
annotate_par0146CA
annotate_mkr014724
annotate_ref014A5E
annotate_sca014B0A
update_scale014B04
update_ref_v014BF8
annotate_enh014C1Cn
set_xadc_ste014D8A
```

```
OUTPUTO.WORK.PD8510          THU, DEC 22, 1983, 11:06 AM     PAGE 11

force_trig_y014DC4
reset_xadc  014DF8
init_xadc   014E10
array_update014E68
init_array_u014F74
packed_sin_c014F98
intersect_an014FEA
arc         01509C
r_circle    015252
x_circle    01538A
do_recall   0155F6
hilight_last0157DC
hilight_last0157ECn
select_cal_k0157FC
update_kit_l01584E
init_stds   01586E
std_id      0158E0
std_class_el0159C6
set_element 015A4A
annotate_std015AB2
set_std_clas015AF0
std_measured015C0E
frequency_co015CEC
standard_spe015E88
proc12      015F06
fst_trig_lon0160CC
fst_trig    0160D0
fst_sqrt    016106
proc3       016170
init_token_f016246
command     01627A
new_if_gain 01647E
new_if_gain_0164EA
new_paramete01656E
proc5       016654
total_delay 016876
if_average_o01698A
if_average_o0169B2
display_smoo0169D4
display_smoo0169F8o
init_retrace016A1E
retrace     016A34
mark1       016A4A
select_titleF08004
write_title F08050
enter_title_F0807A
proc10      F08118
reset_first_F08270
put_update_mF0836E
select_plot_F08EFE
output_plot F08F8C
documentatioF09020
proc2       F09056
display_fromF09264
ch_partial  F093D6
partial     F09448
```

```
OUTPUTO.WORK.PD8510          THU, DEC 22, 1983, 11:06 AM     PAGE 12

annotate_refF09458i
annotate_matF0960Am
mark_dg_baseF09800
mark_dg_top F0E15C
mark_stack  F0F544
memtop      F0F544
membottom   F1EA7A
sine_cos    F1EA7C
cal_kit_arraF1FA80
trace1_base F21276
trace1_m_basF218EC
trace2_base F23188
trace2_m_basF237F6
mbm_prgm_staF9FC00
directory_ofFF807A
valid_directFF81FE
list_directoFF825C
init        FF85A2
scan_directoFF8640
delete_file FF86A0
undelete_filFF876C
record_file FF8840
restore_fileFF8D4C
init_tape_mgFF9286
reset_memoryFF9544
request_memoFF97DC
request_arraFF9876
release_memoFF98EA
release_arraFF99F8
release_auxiFF9A2Am
memory_stoleFF9A9A
wrt_mbm_ok  FF9BEC
bubble_ok   FF9C46
get_start_pgFF9CFE
update_mbm_dFF9E8A
clear_cal   FFA1CA
cal_seg_sizeFFA2A2
cal_seg_avaiFFA2EA
ok_to_save_cFFA316
save_data   FFA436
record_data FFA62A
read_data_heFFA844
recall_data FFA87A
restore_dataFFA9CE
load_dg_dataFFAA74
recall_lunplFFAB7A
save_lunplusFFABDE
init_save_reFFABFA
highlight_meFFAE2E
blank_softkeFFAF28
kill_softkeyFFAF78
init_softkeyFFAFA4
change_softkFFAFC2
hilight_off FFB03A
hilight_commFFB15A
hilight_commFFB236k
```

```
OUTPUTO.WORK.PD8510          THU, DEC 22, 1983, 11:06 AM     PAGE 13

hilight_on  FFB240
hilight_key FFB258
gen_menu    FFB27A
process_softFFB54A
previous_menFFB588
pop_menu    FFB5EC
get_priv_ib_FFB81C
set_priv_ib_FFB832
reset_priv_iFFB85Cf
clr_priv_ib FFB880
trig_priv_ibFFB89E
set_ren_privFFB8BC
clr_ren_privFFB8DC
poll_priv_ibFFB984
intrpt_priv_FFBA7A
init_priv_ibFFB834
wrt_priv_ib FFBCA4
wrt_priv_ib_FFBD02
read_priv_ibFFBD1A
syntax_checkFFBD98i
priv_ib_srq FFBE04
init_sup_brkFFBED8
update_stimuFFBF82e
proc4       FFC274
annotate_stiFFC3F6
tell        FFC966
macro_tell  FFC978
compute_tellFFC99E
acknowledge FFC9B8
warn        FFC9CC
macro_warn  FFC9F4
compute_warnFFCA1A
fatal       FFCA34
clear_messagFFCA8E
output_errorFFCAAA
init_messageFFCB36
ifft        FFCB9E
fft         FFCBAE
fftwn       FFCCE6
get_active  FFCE86
ch_active_suFFCEA0
active_suffiFFCEC8
ch_active_foFFCED8
active_formaFFCF2C
active_limitFFCF3C
set_active_lFFCF9E
init_trig   FFD0A6
annotate_forFFD170
new_format_pFFD1C8
new_format  FFD1F2
proc6       FFD248
number_of_poFFD2CE
array_size  FFD2DC
block_size  FFD2EA
select_markeFFD342
select_ref_mFFD3BC
```

```
OUTPUTO.WORK.PD8510          THU, DEC 22, 1983, 11:06 AM     PAGE 14

marker_pointFFD4F4
ch_marker_vaFFD54E
marker_valueFFD592
ch_mkr_valueFFD5A2
mkr_value   FFD606
mkr_stimulusFFD614
mkr_stimulusFFD654
put_marker  FFD686
partial_updaFFD850
update_markeFFD888
init_markersFFD898
proc9       FFD8FC
mark3       FFD9FC
plot_to_hpibFFDA96
char_index  FFDAC8
active_markeFFDACA
source_pointFFDB20
valid_priv_lFFDB24
fifo_sup_brkFFDB82
menu_level  FFDB8E
level_info  FFDB90
mbm_dir     FFDC1A
directory_woFFDE96
tape_wordbufFFDF9A
file_byte_cnFFE0A2
file_addressFFE0AE
directory_onFFE0D4
command_tokeFFE0D8
command_pendFFE0DA
abort_commanFFE0DC
last_class_eFFE0E2
current_std_FFE0E4
cal_std_addrFFE0EC
recall_type FFE276
display_on  FFE27C
default_cal_FFE3F6
cal_type    FFE406
cal_in_progrFFE408
cal_coeffs_aFFE40A
measuring_stFFE40C
tape_mbm_fn FFE42C
file_num    FFE434
reg_num     FFE436
data_type   FFE438
data_addr   FFE43A
data_byte_cnFFE43E
data_type_stFFE442
xctrl_save  FFE4B4
yadc_avg_facFFE4C6
yadc_avg_facFFE4C8
yadc_raw_masFFE4CA
ref_overloadFFE4CC
tst_overloadFFE4CE
yadc_raw_ptrFFE4D0
yadc_raw_sigFFE4D4
adc_correctiFFE8D41
```

```
OUTPUTO.WORK.PD8510          THU, DEC 22, 1983, 11:06 AM     PAGE  15

test_tables FFE8E0
ref_tables  FFE944
trig_flag   FFE9A0
mpl_flg     FFE9A1
grat1_specs FFEA7E
grat2_specs FFEA82
outbuf_ptr  FFEA98
block_out_lgFFEA9A
outbuf      FFEA9C
byte_avail  FFEAA0
device_clearFFEAA2
serial_poll_FFEB68
serial_poll_FFEB6A
command_passFFEB80
remote      FFEB82
title_array FFEB91
title       FFEBC4
error_array FFEBC9
error       FFEBFA
function_arrFFEBFF
function    FFEC1A
entry_array FFEC1F
entry       FFEC3A
entry_flip_fFFEC3E
entry_aux_arFFEC41
entry_aux   FFEC78
block_bufferFFEC7C
group_numberFFECA6
key_token   FFECB4
flag1_save  FFECB6
flag2_save  FFECB7
ch_dp_scr__0FFECB8
ch_dp_scr__1FFEEA0
ch_dp_scr__2FFF088
ch_dp_ptrs_0FFF270
ch_dp_ptrs_1FFF294
ch_dp_ptrs_2FFF2B8
ch_dp_vars_0FFF2DC
ch_dp_vars_1FFF340
ch_dp_vars_2FFF3A4
system_z0   FFF408
current_acquFFF40Cn
last_param_sFFF40E
last_param_oFFF410
last_acquisiFFF41Aa
param       FFF41B
ch          FFF423
raw_base    FFF428
raw_put     FFF448
dp_raw_base FFF468
array_proceeFFF49C
rebuild     FFF49E
dump_size   FFF4D8
save_size   FFF4DC
last_state_sFFF4E0
current_acquFFF4E2n
```

```
OUTPUTO.WORK.PD8510          THU, DEC 22, 1983, 11:06 AM     PAGE  16

current_entrFFF4E4
scaled      FFF4E6
log_scale_faFFF4E8i
active_functFFF4EA
active_fcn_vFFF4EC
peek_n_poke FFF4FC
rpg_algorithFFF500
step_algoritFFF501
mkr_algorithFFF502
keypad_algorFFF503
display_formFFF504
token_fifo  FFF53E
keyboard_fifFFF55C
public_ib_fiFFF57A
array_updateFFF598
running     FFF5AA
ready       FFF5AE
link        FFF5B0
counter     FFF626
stack_top   FFF7FC
ADDCP       FFF80E
MultInit1   FFF816
MultInit2   FFF81C
SUBCP       FFF81E
MPYFP       FFF82E
ADDFP       FFF836
SUBFP       FFF840
MDFR        FFF84A
MDDFR       FFF86C
MDSFR       FFF894
XFM2P       FFF8A4
MPLOG       FFF8C8
MINTP       FFF8D0
XFM2Q       FFF8DA
MPYDI       FFF8FA
LLDA0       FFF906
LLDA2       FFF90A
LLDMY       FFF90E
RDEXP       FFF912
MPYLF       FFF914
ADDLF       FFF918
SUBLF       FFF91A
DIVFP       FFF91E
AYNRM       FFF922
MDBDG       FFF926
MRLOG       FFF930
APLOG       FFF942
MSHFT       FFF950
IFCAM       FFF976
MCPDIV      FFF992
MPYAV       FFF9A4
CPXMR       FFF9BA
MCPMP       FFF9BE
CPINV       FFF9CC
DADLF       FFF9E0
mbm_misc_staFFFC00g
```

```
OUTPUTO.WORK.PD8510          THU, DEC 22, 1983, 11:06 AM     PAGE  17

mbm_sub_prgmFFFC00
```

```
FXADC.WORK.PD8510            THU, DEC 22, 1983, 11:06 AM     PAGE   1

PROCEDURE  set_xadc_step_size(step_size);
   VALUE   step_size;
   INTEGER step_size;                                        EXTERNAL.L;
SUBROUTINE force_trig_xadc;                                  EXTERNAL.L;
```

```
SXADC.WORK.PD8510              THU, DEC 22, 1983, 11:06 AM     PAGE   1

M68KL,P,"xadc"
BEGIN

#FILE fkernel3.work;
#FILE fbreak.work;
#FILE fiocnfig.work;


INTEGER CONSTANT normal_201  := %04,       & 201 points/sweep.         &
                 stop_sweep  := %10;       & Track analog sweep; Reset &
                                           & staircase and auto-zero.  &
INTEGER CONSTANT delay_1_mSec := 31,       & 32 uSec increments        &
                 min_delay    :=  0;

INTEGER CONSTANT zero        := 0;

INTEGER xmode = bottom + %38,
        xadc_gn = bottom + %30,
        xcmd1 = bottom + %32,
        xposctr = bottom + %36,
        xctr0   = bottom + %3A,
        xctr1   = bottom + %3C,
        xcmd2 = bottom + %3E,
        pictl = bottom + %7C;

EXTERNAL INTEGER swp_gn;
COMMENT
   refer to BBDOC.JT8 for more detailed definitions.
;

COMMENT
   local storage for $5102 registers with multiple functions per word.
;
INTEGER CONSTANT &for set_bb_xmode&
        force_trigger := %80, clr_trigger  := %00, trigger_mask  := %80,
        load_xctr_1uS_res := %24, clr_load_xctr := %00,
        load_xctr_with_resolution_mask := %27,   load_xctr_mask := %20,
        set_init_yadc := %00, clr_init_yadc:= %08, init_yadc_mask:= %08;



PROCEDURE  set_xadc_step_size(new_step_size);
   VALUE   new_step_size;
   INTEGER new_step_size;                                          ENTRY;
   BEGIN & set_xadc_step_size &

      xcmd2 := ( new_step_size - 1 )  OR %10;

   END;  & set_xadc_step_size &
```

```
SXADC.WORK.PD8510              THU, DEC 22, 1983, 11:06 AM     PAGE   2

#EJECT;

COMMENT                                                      set_bb_xmode
**************************************************************************
*
* EXTERNAL SPECIFICATION FOR set_bb_xmode
*
* FUNCTION: Changes only the requested bits of the bottom box register
*           xmode. This register (see bottom boc documentation) controls
*           force trigger modes,polarity of pulse output,loading of
*           timing counters, initializing state machine,and resolution
*           of timing counters.
*           Because of the nature of the hardware, past xmode values
*           have to ORed into the new new value sent.
*
* PARAMETER DESCRIPTION:
*
*    INPUT:  xmode_value        Desired bit values to be set
*
*            xmode_mask         Bit pattern of bits to be effected
*                                1 = effect      0 = no effect
*
* USAGE:
*
*          set_bb_xmode(forced_trigger,trigger_mask)
*
* EXTERNAL EFFECTS:
*     The OWN variable will be updated with the lastest bit pattern.
*     The use of wrong bit patterns could cause BAD effects.
*
* COMMENTS:
*
**************************************************************************
*
* LOGIC INFORMATION FOR set_bb_xmode
*
* INTIAL REFINEMENT:
*
*
* NOTE -- for some uses it is expected that this routine takes aleast
*         11 uSecs.     ( ie setting force processor trigger )
*
**************************************************************************
;
PROCEDURE set_bb_xmode(xmode_value,xmode_mask);
    VALUE xmode_value,xmode_mask;  INTEGER xmode_value,xmode_mask;
BEGIN
   OWN INTEGER xmode_save;

   xmode_save := TURN( xmode_save, xmode_value, xmode_mask );
   xmode := xmode_save;

END set_bb_xmode;
```

```
SXADC.WORK.PD8510              THU, DEC 22, 1983, 11:06 AM     PAGE   3

#EJECT;
COMMENT
**************************************************************************
*
* NOTE: trigger_mode is set true here, it must be set false by
*       the calling routine.
**************************************************************************
;
SUBROUTINE force_trig_yadc;                                        ENTRY;
BEGIN
   last_trigger := 0;
   trigger_mode := 1;
   first_trigger:= 1;

   ASSEMBLE( MOVE SR,-(S);  ORI =H0700,SR );
   set_bb_xmode(force_trigger,trigger_mask);

    & the force trig must be cleared before the second conversion
       of a multiple trigger measure starts -- thereofore interrupts
       will be disable to prevent a process swap / long interrupt &

   set_bb_xmode(clr_trigger,trigger_mask); &watch min pulse width 11u&
   ASSEMBLE(  MOVE  (S)+, SR  );

END force_trig_yadc;
```

```
SXADC.WORK.PD8510              THU, DEC 22, 1983, 11:06 AM     PAGE   4

#EJECT;
SUBROUTINE reset_xadc;                                             ENTRY;
   BEGIN
      set_bb_xmode( set_init_yadc, init_yadc_mask );
      set_bb_xmode( clr_init_yadc, init_yadc_mask );
      delay( delay_1_mSec );       & allow time for YADC trig &
   END;
```

```
SXADC.WORK.PD8510                THU, DEC 22, 1983, 11:06 AM     PAGE   5

#EJECT;

PROCEDURE  init_xadc;                                            ENTRY;
   BEGIN & init_xadc &
      INTEGER xstat;

      xadc_gn:=swp_gn;

      set_bb_xmode( %04, %FF );

      reset_xadc;
      xctr0 := 200;
      xctr1 := zero;

      set_bb_xmode( load_xctr_1uS_res, load_xctr_with_resolution_mask );
      set_bb_xmode( clr_load_xctr,     load_xctr_mask );
      set_xadc_step_size(normal_201);

      xstat := xposctr;              & clear lsrq by reading xposctr &
      xcmd1 := stop_sweep;
      pictl := zero;                 & 8620 interface turned off &

   END;  & init_xadc &
END$
```

```
SXMBM.WORK.PD8510                THU, DEC 22, 1983, 11:06 AM     PAGE   1

M68KL,P,"xmbm" BEGIN USE REGISTER 0-11;

GLOBAL LABEL     parms_mbm,set_add_mbm, status_mbm  ,read_mbm, wrt_mbm;
GLOBAL LABEL     test_mbm ,read_boot_mbm,wrt_boot_mbm;
LABEL            mbm_code_entry_pt;
GLOBAL
INTEGER  mbm_sub_prgm_sel      =%FFFFFC00,
         mbm_misc_status_reg   =%FFFFFC00,
         mbm_prgm_start_add    =%FFF9FC00;
INTEGER CONSTANT Zero:=0;

BOOLEAN SUBROUTINE init_mbm ;                                    ENTRY;
BEGIN
            & is the improper parmeter call  mismatch a problem
                 or is the fact that the first parmeter is in RO OK!!!&
                      & Floating buss is tricky to test&
                      & Could Toggle a bit and test ???&
   IF (%C AND mbm_misc_status_reg AND mbm_misc_status_reg)=%C THEN
         BEGIN mbm_sub_prgm_sel:=%82; GO TO mbm_code_entry_pt; END;
   init_mbm :=FALSE;
END init_mbm ;

test_mbm :      mbm_sub_prgm_sel:=%80;  GO TO mbm_code_entry_pt;
parms_mbn:      mbm_sub_prgm_sel:=%83;  GO TO mbm_code_entry_pt;
set_add_mbm:    mbm_sub_prgm_sel:=%84;  GO TO mbm_code_entry_pt;
status_mbm:     mbm_sub_prgm_sel:=%85;  GO TO mbm_code_entry_pt;
read_mbm:       mbm_sub_prgm_sel:=%86;  GO TO mbm_code_entry_pt;
wrt_mbm:        mbm_sub_prgm_sel:=%88;  GO TO mbm_code_entry_pt;
read_boot_mbm: mbm_sub_prgm_sel:=%8A;  GO TO mbm_code_entry_pt;
wrt_boot_mbm:  mbm_sub_prgm_sel:=%8C;

mbm_code_entry_pt:   ASSEMBLE(JMP $mbm_prgm_start_add.L);

END$
```

```
SXTACO.WORK.PD8510               THU, DEC 22, 1983, 11:06 AM     PAGE   1

M68KL,P,"XTACO"
BEGIN
DOUBLE TAPEVector=%64; &Containts location of TAPEEntry&
COMMENT
############ THE FOLLOWING IS IN THE MONITOR  #####################
********************************************************************
* TAPEntry is a fudge routine that except to find a value on the stack
*          that selects one of N TACO routines.
*
* TAPEntry DOESNOT !!!!! use the normal calling conventions.
*
*  Stack Parm       ROUTINE
*     0          SUBROUTINE TPINT
*     1          INTEGER PROCEDURE TPST/
*     2          INTEGER SUBROUTINE TPErr/
*     3          BOOLEAN SUBROUTINE REW/
*     4          BOOLEAN PROCEDURE TPRED(Add,Len)/ VALUE Add/
*                                          DOUBLE Add/ INTEGER Len/
*     5          BOOLEAN PROCEDURE TPWRT(Add,Len)/ VALUE Add,Len/
*                                          DOUBLE Add/ INTEGER Len/
*     6          BOOLEAN SUBROUTINE INgap/
*     7          BOOLEAN SUBROUTINE TPready/
*     9          BOOLEAN SUBROUTINE TPmark/
*    10          BOOLEAN PROCEDURE TPseek(pos)/VALUE pos/INTEGER pos/
*    11          INTEGER SUBROUTINE TPrecord/
********************************************************************
end of comment;

GLOBAL LABEL TPINT,TPST,TPErr,REW,TPRED,TPWRT;
GLOBAL LABEL INgap,TPready;
GLOBAL LABEL TPseek,TPrecord,TPmark;
LABEL TAPEntry;

TPINT:       ASSEMBLE(   MOVE =D0,-(S);   BRA TAPEntry  );
TPST:        ASSEMBLE(   MOVE =D1,-(S);   BRA TAPEntry  );
TPErr:       ASSEMBLE(   MOVE =D2,-(S);   BRA TAPEntry  );
REW:         ASSEMBLE(   MOVE =D3,-(S);   BRA TAPEntry  );
TPRED:       ASSEMBLE(   MOVE =D4,-(S);   BRA TAPEntry  );
TPWRT:       ASSEMBLE(   MOVE =D5,-(S);   BRA TAPEntry  );
INgap:       ASSEMBLE(   MOVE =D6,-(S);   BRA TAPEntry  );
TPready:     ASSEMBLE(   MOVE =D7,-(S);   BRA TAPEntry  );
TPmark:      ASSEMBLE(   MOVE =D9,-(S);   BRA TAPEntry  );
TPseek:      ASSEMBLE(   MOVE =D10,-(S);   BRA TAPEntry  );
TPrecord:    ASSEMBLE(   MOVE =D11,-(S);   BRA TAPEntry  );

TAPEntry:ASSEMBLE( MOVE.L $TAPEVector,-(S);  RTS );

END$
```

```
CYADC.WORK.PD8510                THU, DEC 22, 1983, 11:06 AM     PAGE   1

#FILE caverage.work;                                  & for avg_on, etc. &

COMMENT These are the values for the data acquisition control variables.
        The name in brackets is the channel table index value.  The
        channel table pointer used must be consistent with the data
        type.
;
& numerator  port for measure &          & changes affect STESTSET.WORK &
INTEGER CONSTANT    num_b1               := 0,          & and SDELAY.WORK &
                    num_b2               := 1,
                    num_a2               := 2,
             &following are non-ratio modes&
                    num_a1               := 3,
                    num_100khz_cal       := 4,
                    num_detector_gnd     := 5,
                    num_no_ratio         := num_detector_gnd,
                    num_ref_100khz_cal   := 6,
                    num_adc_gnd          := 7,
                    num_vcal             := 8,
                    num_vref             := 9,
                    num_temp1            :=10,
                    num_temp2            :=11,
                    num_analog_in        :=12;

& denominator port -- if a ratio mode selected in numerator&
                                         & changes affect STESTSET.WORK &
INTEGER CONSTANT    denom_b1             := 0,          & and SDELAY.WORK &
                    denom_a1             := 1,
                    denom_a2             := 2,          & 3 skipped &
                    denom_100khz_cal     := num_100khz_cal,
                    denom_detector_gnd   := num_detector_gnd,
                    denom_no_ratio       := denom_detector_gnd;

& driven port &
INTEGER CONSTANT    driven_none          := 0,
                    driven_a1            := 1,
                    driven_a2            := 2;

& phase lock port &                      & changes affect STESTSET.WORK &
INTEGER CONSTANT    lock_to_a1           := 0,
                    lock_to_a2           := 1,
                    lock_donot_care      := 2,    & effectively a1 &
                    caling               :=-1;

& i.f. gain        &
INTEGER CONSTANT    auto_range           := 0,
                    if_no_gain           := 1,
                    if_12db_gain         := 2,
                    if_24db_gain         := 3,
                    if_36db_gain         := 4,
                    if_48db_gain         := 5,
        & only for caling &
                    if_all_off           := 6,
                    if_1st_on            := 7,
                    if_2nd_on            := 8,
```

```
CYADC.WORK.PD8510               THU, DEC 22, 1983, 11:06 AM     PAGE   2

                 if_3th_on          := 9,
                 if_4th_on          :=10;
& if gain port   &
INTEGER CONSTANT  test_port         := 0,
                  ref_port          := 1;

INTEGER CONSTANT . adc_cal_only     := 0,
                  adc_if_offset_cal := 1,
                  full_if_cal       := 2,
                  force_cal         := -1;
```

```
FYADC.WORK.PD8510               THU, DEC 22, 1983, 11:06 AM     PAGE   1

PROCEDURE control_yadc(raw_put,average_mode,average_factor,
                       raw_ready_count,raw_ready_mask);
  VALUE  raw_put,average_mode,average_factor,raw_ready_count,
         raw_ready_mask;
  DOUBLE  raw_put,raw_ready_count;
  BYTE    average_mode;
  INTEGER average_factor,raw_ready_mask;
                                                              EXTERNAL.L;
PROCEDURE control_receiver(numerator,denominator,phase_lock_port,
                        num_gain_range,denom_gain_range );
                VALUE   numerator,denominator,phase_lock_port,
                        num_gain_range,denom_gain_range ;
                BYTE    numerator,denominator,phase_lock_port,
                        num_gain_range,denom_gain_range ;
                                                              EXTERNAL.L;
PROCEDURE calib_yadc(cal_level); VALUE cal_level; INTEGER cal_level;
                                                              EXTERNAL.L;
PROCEDURE init_auto_range;                                    EXTERNAL.L;
PROCEDURE auto_ranging(acq_param); VALUE acq_param; INTEGER acq_param;
                                                              EXTERNAL.L;
SUBROUTINE set_if_gain;                                       EXTERNAL.L;
SUBROUTINE check_overload;                                    EXTERNAL.L;
#FILE cyadc.work;
```

```
SYADC.WORK.PD8510               THU, DEC 22, 1983, 11:06 AM     PAGE   1

M68KL,P,"yadc"
BEGIN
COMMENT
************************************************************************
* This file is to contain
*      1) intrpt_yadc
*      2) init_yadc
*      3) control_yadc
*      4) control_reciever
*      5) set_if_gain
*      6) calib_yadc
*
*
*  Major items to do
*      2) make use of overlapp times available after multipier  GO's
*      5) computed goto's in critical paths
*      7) document !!!!!
*
*   Make the triggered mode 20 bits for CW and if cal modes --
*      includes 20 H matrix ( may be there ) , 20 bit  averaging (done),
*       20 bit ratio , and 20 bit  store ( done ).
*   Will probaby have to work on if cal to use 20 bits
************************************************************************
end of comment;

#FILE cdebug.work;                                          & DEBUG &
#FILE fterm.work;                                           & DEBUG &
#FILE fterm2.work;                                          & DEBUG &
#FILE fterm3.work;                                          & DEBUG &
#FILE futil.work;                      & for warn and several messages &
#FILE cids.work;
#FILE crins.work;
#FILE fiocnfig.work;
#FILE fkernel3.work;
#FILE fintrpt.work;
#FILE fxadc.work;
#FILE fbreak.work;

#FILE ccontvar.work;
#FILE cyadc.work;

TYPELENGTH USER3: 6;
EXTERNAL INTEGER IFCAM, MPYAV, MYMRM, RDEXP;
EXTERNAL INTEGER ready;
COMPLEX PROCEDURE CMVE1( val); VALUE val; USER3 val;          EXTERNAL;
```

```
SYADC.WORK.PD8510               THU, DEC 22, 1983, 11:06 AM     PAGE   2

#EJECT;
BYTE CONSTANT     set_bottom_box_irq := Z58 + bottom_vctr;
INTEGER CONSTANT cal_avg := 16, cal_avg_bit := 4;
DOUBLE CONSTANT  adc_in_range := (-100 ) * cal_avg;
BYTE TABLE       phase_step :=37   ,27     ,17    ,7    ;&9 deg step&
INTEGER CONSTANT min_delay := 0,delay_30uS  := 1,
                 delay_60uS   := 2,   delay_100uS  := 3,
                 delay_180uS  := 5,   delay_200uS  := 6,
                 delay_250uS  := 8,   delay_1_msec := 31,
                 phase_0 := 0,  phase_90 := 1,  phase_270 := 3,
                 lsb_ydac := 4,
                 cal_ctr_limit := 50, cal_ctr_limit_max:= 200 ;

BYTE CONSTANT byte_zero := 0,
              enable_ext_ref  :=Z80, cal_sig_on  :=  34+ enable_ext_ref,
              lo_normal_phase :=Z0 , cal_sig_off := Z40+ enable_ext_ref;
INTEGER CONSTANT   zero := 0;

INTEGER adcY1L = bottom  + Z00     , adcY3L = bottom  + Z08,
        adcY4H = bottom  + Z0E,
        ydac   = bottom  + Z10     , adcctl = bottom  + Z12,
        caldac = bottom  + Z14     ,
        xctr0  = bottom  + Z3A     , xctr1  = bottom  + Z3C,
        tstgn  = bottom  + Z50     , refgn  = bottom  + Z5E,
        status = bottom  + Z7E;
BYTE    bottom_byte = bottom + 1 ;
BYTE    chsel  = bottom_byte  + Z2C,
        tstpha = bottom_byte  + Z54, calpha = bottom_byte  + Z56,
        refpha = bottom_byte  + Z5A,
        tstctl = bottom_byte  + Z52,
        refctl = bottom_byte  + Z5C;

BYTE ircmd1 = io + 1 + Z92;
BYTE ARRAY tst_mem,ref_mem
                    [ first_acquisition_param : max_acquisition_param ];
DOUBLE ARRAY yadc_scr[0:3];
DOUBLE  yadc_cal_ptr;
INTEGER signal_bit_bucket;
USER3   yadc_scr_cmplx = yadc_scr;

GLOBAL  INTEGER xctr1_save;
BOOLEAN cal_valid  , detector_cal_valid;
INTEGER cal_ctr,          cal_ctr_rate,       old_cal_level;
BYTE    yadc_ratio_mode,
        ref_mux, tst_mux ,
        ref_ctl, tst_ctl;
GLOBAL INTEGER yadc_avg_factor1, yadc_avg_factor2, yadc_raw_mask,
        ref_overload, tst_overload ;
GLOBAL DOUBLE  yadc_raw_ptr, yadc_raw_signal;
```

```
SYADC.WORK.PD8510                THU, DEC 22, 1983, 11:06 AM      PAGE   3

#EJECT;COMMENT
*************************yadc data structure*************************
*  adc_correction_table
*      This table provides the correction for the 8 bit adc readings.
*       The 256 possible 8-bit adc values are then added to the 12bit
*       adc to provide the 19 bit result. ( the 12 bit adc is filling
*       in the gaps between the 8bit adc.) The table is 256 19 bit
*       values ( using 32_bit data type ). The 8 bit dac values range
*      from -255 to 0.
*
*  test_tables/ref_tables
*      These tables contain the Quad Gain Correction ( IF detector )
*      The first 32 bits are the offset correction for the imag detector
*      The next  32 bits are the offset correction for the ref  detector
*      There are then 5 block of h-matrix correction each containing
*                  16 bits     ( 1 - h11 )
*                  16 bits        h12
*                  16 bits        h21
*                  16 bits     ( 1 - h22 )           is used negatived
*                  16 bits        exp / gain correct ( steps of 12 db )
*          The 0 block is for no  gain stages on
*          The 1 block is for one gain stage  on    ( the first stage )
*                              ( and the individual stages while caling )
*          The 2 block is for two gain stages on    ( the first two    )
*          The 3 block is for three gain stages on ( the first three )
*          The 4 block is for four  gain stages on ( all stages       )
*          The 5 block is no quad correct -- none IF item ie temperature
*
*  test_index, ref_index
*          These tables contain the index to use in the h-matrix. The
*            orginal index comes from the IF Amp boards telling what
*            gain is set. This is a 4 bit pattern ( one bit for each )
*            gain stage. This leads to 16 possible values, but only
*            five valid and will index into the blocks 0 - 4 of the
*            h-matrix tables.
*               Table gn_index is the vaules moved into test/ref_index.
*          If an non IF item ( ie temperature ) is selected then block
*            5 will be slected for all posiible inputs -- no correction
*               Table null_correction is then moved into test/ref_index.
*
*  cal_val
*         A calibration dac exists to set a test level for the 8-bit
*           adc calibration. Its exact value is not inprotant. The
*           preset values will be modified during run time so to speed
*           up the search the next calibration.
*           There is a setting for each bit 0 - 7
*********************************************************************
end of comment;
```

```
SYADC.WORK.PD8510                THU, DEC 22, 1983, 11:06 AM      PAGE   4

#EJECT;
GLOBAL DOUBLE ARRAY adc_correction_table[-255:0];
DOUBLE adc_table = adc_correction_table + 1;

INTEGER CONSTANT h_blk_size:=5;
GLOBAL INTEGER ARRAY test_tables[-4: (6*h_blk_size)-1 ];
DOUBLE  test_imag_offset = test_tables[-4],
        test_real_offset = test_tables[-2];
INTEGER ARRAY test_index[0:15];
GLOBAL INTEGER ARRAY  ref_tables[-4: (6*h_blk_size)-1 ];
DOUBLE   ref_imag_offset =  ref_tables[-4],
         ref_real_offset =  ref_tables[-2];
INTEGER ARRAY  ref_index[0:15];
INTEGER TABLE gn_index :=
          0            ,  2*h_blk_size,  2*h_blk_size,  0,&special cases&
          2*h_blk_size,  0            ,  0            ,  0,&for caling&
          2*h_blk_size,  2*h_blk_size,  2*h_blk_size,  2*h_blk_size,
          4*h_blk_size,  4*h_blk_size,
          6*h_blk_size,
          8*h_blk_size;
INTEGER TABLE null_correction :=
         10*h_blk_size, 10*h_blk_size, 10*h_blk_size, 10*h_blk_size,
         10*h_blk_size, 10*h_blk_size, 10*h_blk_size, 10*h_blk_size,
         10*h_blk_size, 10*h_blk_size, 10*h_blk_size, 10*h_blk_size,
         10*h_blk_size, 10*h_blk_size, 10*h_blk_size, 10*h_blk_size;


INTEGER TABLE cal_val := 445,  470,  505,  605,
                         805, 1200, 1985, 3565;
```

```
SYADC.WORK.PD8510                THU, DEC 22, 1983, 11:07 AM      PAGE   5

#EJECT;COMMENT
*********************************************************************
* intrpt_yadc
*        Handles the yadc interrupt and converts the adc readings to
*   needed data format and stores the results in raw mennory.
*          Must be the highest level interruptand fast !!! 180uSec
*
* Data out
*     Complex/floating data                 fixed point data ( cal )
*         IMAG                                 TEST IMAG
*         REAL                                 TEST TEST
*         EXP                                  REF  IMAG
*                                              REF  TEST
*       3-word results                      4-double results
*
* NOTE: No general subroutines may be called by intrpt_yadc because
*       the subroutines may use registers that were not saved in the
*       interrupt handling !!
*********************************************************************
end of comment;
SUBROUTINE intrpt_yadc;                                        ENTRY;
BEGIN
LABEL correct_test, correct_ref,
      store_in_raw,
      ratio_test, ratio_1, ratio_2 ,
      clr_imag,sup_avg, avg_1,   avg_2,   avg_3,
      intrpt_exit, intrpt_signal_exit, inc_ptr_exit ,
      over_1, over_2, over_3;
   INTEGER bug_mark = %OCC;  &DEBUG&

   bug_mark := %9876;
```

```
SYADC.WORK.PD8510                THU, DEC 22, 1983, 11:07 AM      PAGE   6

#EJECT;COMMENT
*********************************************************************
* The start of the interrupt does the data read and quad gain correction
*
* The test data is read first and adc gain and offset corrected.
* If in CAL mode the refrence data is then read and corrected
* Else the test data is quad corrected, and then the reference data is
*      read, adc and quad corrected.
* Then  the decision to ratio or to use only Ref or Test is made.
*
* ADC Correction
*     18 bit result = Low word \12 bits\
*                       + adc_tables( index by high word \8 bits\ )
*                       - offset \store in test_tables\
* QUAD Correction
*      Data  = Data + 1/4 * Data * H
*              Data is Real and Imag of a given converted
*              H is a 2x2 matrix -- nominally all zeros
*                it corrects for the gain and quaduarate errors of Data
*********************************************************************
end of comment;
ASSEMBLE(
   MOVEM.L  RO/R1/R2/R3/R8/R9, -(S);
   MOVEM.W  adcY1L;RO/R1/R8/R9;               & load test channel data &
   ADD.L    adc_table(R8),RO;                 & correcting adc         &
   LEA      test_imag_offset,R8;
   SUB.L    (R8)+,        RO;
   ADD.L    adc_table(R9),R1;
   SUB.L    (R8)+,        R1    );

   IF NOT trigger_mode THEN GO TO correct_test;

 ASSEMBLE(
   MOVEM.W  adcY3L,R2/R3/R8;                  & load ref  channel data &
   MOVE.W   adcY4H,R9;                        & avoid MOVEM affecting YDAC&
   ADD.L    adc_table(R8),R2;                 & correcting adc         &
   LEA      ref_imag_offset, R8;
   SUB.L    (R8)+,        R2;
   ADD.L    adc_table(R9),R3;
   SUB.L    (R8)+,        R3    );

   IF first_trigger THEN
      BEGIN
      first_trigger := 0;
      ASSEMBLE (
            MOVEM.L  RO/R1/R2/R3,  yadc_scr ); & save values in memory &

      END
    ELSE ASSEMBLE (
            LEA      yadc_scr, R8;
            ADD.L    RO,(R8)+;                 &add new value and acculmate&
            ADD.L    R1,(R8)+;
            ADD.L    R2,(R8)+;
            ADD.L    R3,(R8)+     );
```

```
    IF  TBIT( status, end_of_trigger ) THEN
      GO TO intrpt_exit  & still more triggers&
     ELSE
       BEGIN &last trigger&
       last_trigger := 1;
       ircndl := set_botton_box_irq;
       ASSEMBLE(
         BTST      #7, yadc_ratio_mode;      &EQ(0) flt pt&
         BNE       intrpt_signal_exit ;      &NE(1) cal data&

         MOVE.W    yadc_avg_factor1,R3;      &get scaling factor&
         MOVEM.L   yadc_scr,     R0-R1;      & restore test values &
         ASR.L     R3,           R0;
         ASR.L     R3,           R1;         & handle in exp ???????&

         LEA       test_imag_offset+8,R8;
         MOVE.W    tstgn,        R2;         &ifgain range for index&
         ASR.W     #3,           R2;
         BCS       over_1;
         CMP.B     =HFO,         R2;         &overload - all gains off&
         BNE       over_1;
         ADD.W     #1,tst_overload ;
 over_1: ADD.W     R2,           R2;         &convert to word index   &
         MOVE.W    R2,           R9;
         ADD.W     test_index+32(R9),R8;     &select start of coeff's &

         LEA       IFCAM+6,      R9;         &set multiply if correct &
         MOVE.L    (R8)+,        (R9)+;      &H11, H12   LDM2; LDM1;  &
         MOVE.L    (R8)+,        (R9)+;      &H21, H22   LDM3; LDM0;  &
         MOVE.L    R0,           (R9)+;      &YM         LDA0; LDA1;  &
         MOVE.L    R1,           (R9)+;      &XM; LDA2;LDA3;DUAL;SUMPR&
         MOVE.W    (R8)+,        R1;         &EXP of correction coeff &

         MOVEM.L   yadc_scr+8,   R2-R3;      & restore ref values &
         MOVE.W    yadc_avg_factor1,R0;      &get scaling factor&
         ASR.L     R0,           R2;
         ASR.L     R0,           R3;
         LEA       ref_imag_offset+8,R8;
         BRA       correct_ref  );
       END;
```

```
#EJECT;
correct_test:ASSEMBLE(
   MOVE.W   tstgn,        R2;                &ifgain range for index&
   ASR.W    #3,           R2;
   BCS      over_2;
   CMP.B    =HFO,         R2;                &overload - all gains off&
   BNE      over_2;
   ADD.W    #1,    tst_overload ;
over_2:ADD.W R2,          R2;                &convert to word index   &
   MOVE.W   R2,           R9;
   ADD.W    test_index+32(R9),R8;            &select start of coeff's &
   LEA      IFCAM+6,      R9;                &set multiply if correct &
   MOVE.L   (R8)+,        (R9)+;             &H11, H12   LDM2; LDM1;  &
   MOVE.L   (R8)+,        (R9)+;             &H21, H22   LDM3; LDM0;  &
   MOVE.L   R0,           (R9)+;             &YM         LDA0; LDA1;  &
   MOVE.L   R1,           (R9)+;             &XM; LDA2;LDA3;DUAL;SUMPR&
   MOVE.W   (R8)+,        R1;                &EXP of correction coeff &


   MOVEM.W  adcY3L,R2/R3/R8/R9;              &load ref  channel data &
   ADD.L    adc_table(R8),R2;                &correcting adc         &
   LEA      ref_imag_offset,R8;
   SUB.L    (R8)+,        R2;
   ADD.L    adc_table(R9),R3;
   SUB.L    (R8)+,        R3 );

correct_ref:ASSEMBLE(
   MOVE.W   refgn,        R0;
   ASR.W    #3,           R0;
   BCS      over_3;
   CMP.B    =HFO,         R2;                &overload - all gains off&
   BNE      over_3;
   ADD.W    #1,     ref_overload;
over_3:ADD.W R0,          R0;                &convert to word index   &
   MOVE.W   R0,           R9;
   ADD.W    ref_index+32(R9),R8;             &select start of coeff's &
   LEA      IFCAM,        R9;                &get test data if correct &
   MOVE.L   (R9)+,        R0;                &real/imag &
   ADD      (R9)+,        R1;                & add exp to H exp &


   MOVE.L   (R8)+,        (R9)+;             &H11, H12   LDM2; LDM1;  &
   MOVE.L   (R8)+,        (R9)+;             &H21, H22   LDM3; LDM0;  &
   MOVE.L   R2,           (R9)+;             &YM         LDA0; LDA1;  &
   MOVE.L   R3,           (R9)+;             &XM; LDA2;LDA3;DUAL;SUMPR&
   MOVE.W   (R8)+,        R3  );             &EXP of correction coeff &

& test for sweeping to fast &

& use computed goto's to replace bit test (bit test=computed goto time)&
& also handle inversion  is 1/S11                                       &
ASSEMBLE(
   BTST     #1,   yadc_ratio_mode;           & EQ(0) continue &
   BEQ      ratio_test;                      & NE(1) use only ref&
   MOVE     R3,           R1;
   MOVE.L   (R9)+,        R0;                & get real/imag&
```

```
   ADD      (R9),           R1;              & add exp to H exp and TERM&
swap_data:BTST #2, yadc_ratio_mode;          & EQ(0) not complex data &
   BNE      swp_avg;                         & NE(1)  complex data &
   BTST #3, yadc_ratio_mode;                 & EQ(0) donot swap &
   BEQ      clr_imag;                        & NE(1) swap real/imag y1/y2&
   SWAP     R0;
clr_imag:AND.L =HOFFFF,R0;                   & zero imag data          &
   BRA      swp_avg;
ratio_test: MOVE.L   (R9)+, R2;              & get real/imag &
   ADD      (R9)+,          R3;              & add exp to H exp and TERM &
   BTST     #0, yadc_ratio_mode;             & EQ(0) ratioing off &
   BEQ      swap_data );                     & NE(1) ratio on &
```

```
#EJECT;COMMENT
************************************************************************
* ratioing here !!!       test in r0/r1, ref in r2/r3, result r0/r1
*    see complex div documentation -- for ratioing is that without
*    overflow testing and format change
*    (A+iB)/(C+iD) = [(AC+BD)+i(BC-AD)]/(CC+DD)
*
*    First to to find /C+iD/ by loading R1,M0 with C and R3,M3 with D
*     Then C is load into M1,M2 and D into M0,M2
*     Then A is loaded into A3, and B into A1
*       Result is (BC-AD) in A2, and (AC+BD) in A0
*     But that result is Multiplied by 1/(CC+DD) loaded into M0,M2
*     And the final result is in R2,A0
************************************************************************
end of  comment;
ASSEMBLE(
   MOVE.L   R2,             (R9)+;           &LDA1,LDM0;LDA3,LDM3,SUMPR;GO&
   SUB.B    R3,             R1;              & subtract exponents         &
   ADD.B    #1,             R1;              & account for squaring       &
   MOVE.L   =H20000000,     R3;              & R3 = 1.0000000             &
   MOVE.L   R2,             (R9)+;           & LDM1,LDM3;  LDM0,LDM2;     &
   MOVE.W   (R9)+,          R2;              & Get CC+DD from LDA0        &
   MOVE.W   R2,             R3;              & Make R3 a little > 1.00000&
   BNE      ratio_1;                         & Check if R2=0 (CC+DD)      &
   MOVE.W   =H4000,         R2;              & USE TRAP DIV 0 instead ?? &
ratio_1: SUB.W (R9)+,       R1;              & RDEXP of CC+DD             &
   MOVE.L   R0,             (R9)+;           & LDA3,LDA1;  loading A,B    &
   ASR.W    #1,             R3;
   DIVS     R2,             R3;              & Get 1/(CC+DD)              &
   BVC      ratio_2;                         & check for overflow ???     &
   MOVE.W   =H4000,         R3;
   ADD.B    #1,             R1;              & bump exp for overflow      &
ratio_2: MOVE.W R3,         (R9)+;           & LDM0,M2 with 1/(CC+DD);GO &
   MOVE.L   (R9)+,          R0;              & Result from RDA2,A0        &
   ADD.W    (R9)+,          R1);             & RDEXP; TERM                &
```

```
SYADC.WORK.PD8510                THU, DEC 22, 1983, 11:07 AM      PAGE  11

#EJECT;
          &swept mode &
 swp_avg:ASSEMBLE(
   MOVE.L    yadc_raw_ptr,R9;
   MOVE.L    (R9),R8;
   MOVE.L    yadc_avg_factor1, R2;          & MSW = K, LSW = 1-K      &
   TST.W     R2;                            & test avg_factor2        &
   BEQ       store_in_raw;                  & EQ(0) K=1, no avgering &
   CMP.B     5(R8),    R1;                  & NE(1) K#0, average      &
   BEQ       avg_2;                         & EQ(0) old,new exp equal&
   BMI       avg_1;                         & MI     exps <> normalize&
   MOVE.B    R1,       R3;
   SUB.B     5(R8),    R3;
   ASR.W     R3,       R2;                  & adjust 1-K for exp delta&
   BRA       avg_2;
avg_1: MOVE.B 5(R8), R3;
   SUB.B     R1,       R3;
   ADD.B     R3,       R1;
   SWAP      R2;
   ASR.W     R3,       R2;                  & adjust K for exp delta &
   SWAP      R2;
avg_2:LEA    MPYAV+6, R9;
   MOVE.L    R0,       (R9)+;               &LDM3,2 -- New value      &
   MOVE.L    (R8),     (R9)+;               &LDM0,1 -- Old value      &
   MOVE.L    R2,       (R9)+;               &LDA3,1;G0 -- avg factors&
   MOVE.L    (R9)+,     R0;                 &RDA0,2 -- (1-K)*OLD + K*NEW&
   ADD.B     RDEXP+1,  R1;                  &RDEXP,TERM               &
   BVC       avg_3;
   MOVE      #H80,      R1;                 &assumed only underflow &
avg_3: MOVE.L   yadc_raw_ptr,R9;
store_in_raw: EQU *;
   SWAP      R0        ;
   MOVE.W    R0,(R8)+;                      &save IMAG  &
   SWAP      R0        ;
   MOVE.W    R0,(R8)+;                      &save REAL  &
   NOP                 ;
   MOVE.W    R1,(R8)+;                      & save EXP                &
inc_ptr_exit: MOVE.L   R8,(R9);             &save modified raw pointer&

intrpt_signal_exit: MOVE.L   yadc_raw_signal,R8; &inline kernel "send" &
   ADDQ.W    #1,(R8);                       & inc raw_signal &
   BGT       intrpt_exit;                   & if not waiting for signal  &
   MOVE.W    yadc_raw_mask,R0;              & ready the waiting process  &
   OR.W      R0,ready;                      & "idle" will preempt/sched  &
 intrpt_exit: CLR bus_mark;
   MOVEM.L (S)+, R0/R1/R2/R3/R8/R9;
   RTE     );
END intrpt_yadc;
```

```
SYADC.WORK.PD8510                THU, DEC 22, 1983, 11:07 AM      PAGE  12

#EJECT;COMMENT                                                       init_yadc
******************************************************************************
*                                                                            *
* EXTERNAL SPECIFICATION FOR init_yadc                                       *
*                                                                            *
* FUNCTION:                                                                  *
*                                                                            *
*                                                                            *
* DECLARATION INFORMATION:                                                   *
*                                                                            *
*    INPUT:                                                                  *
*                                                                            *
*    OUTPUT:                                                                 *
*                                                                            *
* EXTERNAL EFFECTS:                                                          *
*                                                                            *
******************************************************************************
*                                                                            *
* LOGIC INFORMATION FOR init_yadc                                            *
*                                                                            *
* MODULES CALLED:                                                            *
*                                                                            *
* INITIAL REFINEMENT:                                                        *
*                                                                            *
*                                                                            *
* NOTE: Initailization of the YADC state machine is in init_xadc
******************************************************************************
end of comment;
SUBROUTINE init_yadc_irq;
BEGIN
   iradr(  ADRS( intrpt_yadc ), y_adc_vctr );
   trigger_mode := 0;
END init_yadc_irq;

PROCEDURE  init_yadc;                                                ENTRY;
BEGIN
INTEGER index;

   cal_ctr := 0;
   cal_ctr_rate := cal_ctr_limit ;
   old_cal_level := -1;                          & never cal'ed &
   MOVE test_index := gn_index,+(16);
   MOVE  ref_index := gn_index,+(16);

END init_yadc;
```

```
SYADC.WORK.PD8510                THU, DEC 22, 1983, 11:07 AM      PAGE  13

#EJECT;COMMENT                                                    control_yadc
******************************************************************************
*                                                                            *
* EXTERNAL SPECIFICATION FOR control_yadc                                    *
*                                                                            *
* FUNCTION:                                                                  *
*                                                                            *
*                                                                            *
* DECLARATION INFORMATION:                                                   *
*                                                                            *
*    INPUT:                                                                  *
*                                                                            *
*    OUTPUT:                                                                 *
*                                                                            *
* EXTERNAL EFFECTS:                                                          *
*                                                                            *
******************************************************************************
*                                                                            *
* LOGIC INFORMATION FOR control_yadc                                         *
*                                                                            *
* MODULES CALLED:                                                            *
*                                                                            *
* INITIAL REFINEMENT:                                                        *
*                                                                            *
*                                                                            *
******************************************************************************
end of comment;
PROCEDURE control_yadc(raw_put,average_mode,avg_factor,
                       raw_ready_count,raw_ready_mask);
  VALUE    raw_put,average_mode,avg_factor,raw_ready_count
           ,raw_ready_mask;
  DOUBLE   raw_put,raw_ready_count ;
  BYTE     average_mode;
  INTEGER avg_factor,raw_ready_mask;                             ENTRY;
BEGIN

   yadc_raw_ptr     := raw_put;
   yadc_avg_factor1 :=  0 ;
   yadc_avg_factor2 :=  0 ;
   xctr1_save       :=  0 ;
   xctr1            := zero;
   xctr0            := 200;          &should this be here ????  &&debug&
   IF NOT( average_mode = avg_off) AND avg_factor > 1 THEN
      BEGIN
      IF average_mode = avg_point_to_point  THEN
         BEGIN
        ASSEMBLE( MOVE.W avg_factor, R0;      &convert to power of 2 &
                  EXTS.L R0;
                  MOVE.L R0,MYNRM;
                  MOVE.W #D30,R0;
                  ADD.B  RDEXP+1,R0;
                  EXTS.W R0;
                  MOVE.W R0,yadc_avg_factor1;
                  CLR.W  R1;
                  BSET   R0,R1;
                  SUB.W  #D1,R1;
```

```
SYADC.WORK.PD8510                THU, DEC 22, 1983, 11:07 AM      PAGE  14

                 MOVE.W R1,xctr1_save );
         END  & at single point averaging&
      ELSE
         BEGIN &swp_to_swp avg  &
         yadc_avg_factor1 := 32768 / avg_factor;
         yadc_avg_factor1 := RBIT(   yadc_avg_factor1, 0 );
         yadc_avg_factor2 := 32768 - yadc_avg_factor1;
         END;
      END; &set averaging parameters&

   yadc_raw_signal     := raw_ready_count ;
   yadc_raw_mask       := raw_ready_mask ;
END control_yadc;
```

```
SYADC.WORK.PD8510            THU, DEC 22, 1983, 11:07 AM     PAGE  15

#EJECT;COMMENT                                                set_if_gain
**********************************************************************
**********************************************************************
end of comment;
SUBROUTINE set_if_gain_sub1;
BEGIN
   tstctl   := tst_mux ;   & no gain / no autorange &
   refctl   := ref_mux ;   & no gain / no autorange &
   delay( delay_250uS );
END set_if_gain_sub1;

SUBROUTINE set_if_gain_sub2;
BEGIN
   REPEAT 4 DO
      BEGIN
      delay( delay_60uS ) ;
      tstctl    := tst_ctl;
      refctl    := ref_ctl;
      END;
END;
SUBROUTINE set_if_gain;                                       ENTRY;
BEGIN
   set_if_gain_sub1;
   set_if_gain_sub2;
   delay( delay_180uS );
END set_if_gain;
```

```
SYADC.WORK.PD8510            THU, DEC 22, 1983, 11:07 AM     PAGE  16

#EJECT;COMMENT
**********************************************************************
**********************************************************************
end of comment;
PROCEDURE init_auto_range;                                        ENTRY;
BEGIN
INTEGER index;
FOR index :=  first_acquisition_param TO  max_acquisition_param
    DO tst_mem[ index ] := -1;
END init_auto_range;


SUBROUTINE check_overload;                                        ENTRY;
IF      ( NOT TBIT( refgn, 2 ) )
   OR   ( NOT TBIT( tstgn, 2 ) ) THEN warn( if_overload );
```

```
SYADC.WORK.PD8510            THU, DEC 22, 1983, 11:07 AM     PAGE  17

#EJECT;COMMENT                                              auto_ranging
**********************************************************************
**********************************************************************
end of comment;
PROCEDURE auto_ranging( acq_param );
              VALUE   acq_param ;        INTEGER acq_param;      ENTRY;
BEGIN
BYTE POINTER tst_old, ref_old;
 STPNTR( tst_old, ADRS( tst_mem[ acq_param ] ) );
 STPNTR( ref_old, ADRS( ref_mem[ acq_param ] ) );

   IF tst_old < 0 THEN
     BEGIN   & first time init&
     IF TBIT(tst_ctl, 7 ) THEN tst_old:=0 ELSE tst_old:=tst_ctl AND Z78;
     IF TBIT(ref_ctl, 7 ) THEN ref_old:=0 ELSE ref_old:=ref_ctl AND Z78;
     END first time init;

   set_if_gain_sub1;

   tstctl  := tst_mux OR tst_old;    refctl := ref_mux OR ref_old;

   set_if_gain_sub2;

   check_overload;
   tstctl := tst_mux OR ( tst_old := tstgn AND Z78 );
   refctl := ref_mux OR ( ref_old := refgn AND Z78 );
   delay( delay_180uS );
END  auto_ranging ;
```

```
SYADC.WORK.PD8510            THU, DEC 22, 1983, 11:07 AM     PAGE  18

#EJECT;COMMENT                                          control_receiver
**********************************************************************
*                                                                    *
* EXTERNAL SPECIFICATION FOR control_receiver                        *
*                                                                    *
* FUNCTION:                                                          *
*                                                                    *
*                                                                    *
* DECLARATION INFORMATION:                                           *
*                                                                    *
*    INPUT:                                                          *
*                                                                    *
*    OUTPUT:                                                         *
*                                                                    *
* EXTERNAL EFFECTS:                                                  *
*                                                                    *
**********************************************************************
*                                                                    *
* LOGIC INFORMATION FOR control_receiver                             *
*                                                                    *
* MODULES CALLED:                                                    *
*                                                                    *
* INITIAL REFINEMENT:                                                *
*                                                                    *
*                                                                    *
* COMMENT: Could perphas create a single table with n entry rows    *
*          and 3 columns -- if_mux, adc_mux, ratio_mode --           *
*          This would tie the items related to a selection numerator *
*          closer by being on one line.                              *
**********************************************************************
end of comment;
BYTE TABLE if_gain := Z80, &auto range&
                      Z00, &no gain  &
                      Z40, &last gain stage on&
                      Z60,
                      Z70,
                      Z78, &all gain stages on&
                      Z00, &no gain  &
                      Z40, & 1st stage &
                      Z20,
                      Z10,
                      Z08; & 4th stage &
BYTE TABLE if_mux  := Z4 &b1&          , Z3 &b2 or a1& ,
                      Z2 &a2&          , Z0 &gnd&,
                      Z1 &100khz&      , Z0 &gnd&,
                      Z0 &gnd&         ,
                      Z0 &gnd&         , Z0 &gnd&,
                      Z0 &gnd&         , Z0 &gnd&,
                      Z0 &gnd&         , Z0 &gnd&;
BYTE TABLE adc_mux  :=Z8 &IF inputs&   , Z8 &IF inputs&,
                      Z8 &IF inputs&   , Z8 &IF inputs&,
                      Z8 &IF inputs&   , Z8 &IF inputs&,
                      Z8 &IF inputs&   ,
                      Z9 & adc gnd &   , Z41& vcal -- sets cal mode&,
                      ZD & volt &      , Z5 & temp &,
                      Z5 & temp &      , ZD & volt &;
```

```
SYADC.WORK.PD8510              THU, DEC 22, 1983, 11:07 AM     PAGE  19

BYTE CONSTANT         ratio := 1       ,use_ref_not_test   := 2 ,
                  complex_data := 4    ,not_complex_use_y2 := 8 ,
          not_complex_use_y1 := 0;
INTEGER CONSTANT      ratio_bit:= 0    ,complex_bit := 2;
BYTE CONSTANT         cal_mode_double_output := %80;

BYTE TABLE ratio_mode:=ratio+complex_data,ratio+complex_data,
                       ratio+complex_data,complex_data+use_ref_not_test,
                       complex_data     ,complex_data,
                       complex_data+use_ref_not_test,
                       not_complex_use_y1,not_complex_use_y1    ,
                       not_complex_use_y2,not_complex_use_y1    ,
                       not_complex_use_y2,not_complex_use_y1    ;

PROCEDURE control_receiver(numerator,denominator,phase_lock_port,
                    num_gain_range,denom_gain_range );
            VALUE   numerator,denominator,phase_lock_port,
                    num_gain_range,denom_gain_range ;
            BYTE    numerator,denominator,phase_lock_port,
                    num_gain_range,denom_gain_range ;
                                                          ENTRY;
BEGIN
INTEGER index;

   ref_mux  := if_mux[ denominator ];
   tst_mux  := if_mux[ numerator   ];

   adcctl    := adc_mux[ numerator ];

   yadc_ratio_mode := ratio_mode[ numerator ];
   IF denominator >= denom_no_ratio THEN
              yadc_ratio_mode := RBIT(yadc_ratio_mode,ratio_bit);

   IF numerator = num_a1 THEN  ref_mux  := if_mux[ denom_a1 ];
   calpha := cal_sig_off;
   IF numerator = num_ref_100khz_cal THEN
                       BEGIN
                       ref_mux  := if_mux[ denom_100khz_cal ];
                       calpha := cal_sig_on;
                       END
   ELSE IF numerator = num_100khz_cal THEN   calpha := cal_sig_on;

   IF phase_lock_port # caling THEN
     chsel  := phase_lock_port
   ELSE
     yadc_ratio_mode := cal_mode_double_output; &double output&

   tst_ctl   := tst_mux    OR  if_gain[   num_gain_range ] ;
   ref_ctl   := ref_mux    OR  if_gain[ denom_gain_range ] ;

               & time consuming change if only changed ??&
   IF NOT TBIT( yadc_ratio_mode, 7) THEN  & not used in cal mode &
     IF TBIT( yadc_ratio_mode, complex_bit) THEN
       MOVE test_index := gn_index,+(16)
     ELSE
```

```
SYADC.WORK.PD8510              THU, DEC 22, 1983, 11:07 AM     PAGE  20

       MOVE test_index := null_correction,+(16);&turn auto range off?&
END control_receiver;
```

```
SYADC.WORK.PD8510              THU, DEC 22, 1983, 11:07 AM     PAGE  21

#EJECT;COMMENT
**************************************************************************
end of comment;
PROCEDURE check_h( item ,  value );
VALUE value;
INTEGER item;   REAL value;
BEGIN
   IF ABS( value ) > .24999 THEN
      BEGIN
      cal_valid := FALSE;
      value := 0.0;
       D;
        := INTEGER ( 131072.0 * value );
       ck_h;

       ********************************************************************
       comment;
       E store_h(tables, h_data, real_gn, imag_gn);
       UE tables, h_data, real_gn, imag_gn;
      EGER POINTER tables; REAL POINTER h_data; REAL real_gn, imag_gn;
   h
      check_h( tables[ 0 ]  ,
                 ((real_gn * h_data[ 0 ]) - (imag_gn * h_data[ 4 ])
                    - 1 ));
      check_h( tables[ 1 ]  ,
                 ((imag_gn * h_data[ 6 ]) - (real_gn * h_data[ 2 ]) ) );
      check_h( tables[ 2 ]  ,
                 ((real_gn * h_data[ 4 ]) + (imag_gn * h_data[ 0 ]) ) );
      check_h( tables[ 3 ]  ,
                 ((real_gn * h_data[ 6 ]) + (imag_gn * h_data[ 2 ])
                    - 1 ));
END store_h;
```

```
SYADC.WORK.PD8510              THU, DEC 22, 1983, 11:07 AM     PAGE  22

#EJECT;COMMENT                                                    cal_adc
**************************************************************************
* cal_adc calibrates the adc -- ie it creates the table that changes   *
*    the 8 bit adc and 12 bit adc into a single 19 bit adc.            *
*    The adc consists of an 8 bit and 12 bit adcs ( both successive    *
*    approxianation ) overlapped by 2 bits. The 8 bit result is the    *
*    "most significant half" and the 12 bit fills in the gaps.         *
*    This is done by calibrating the step of the 8bit dac ( adc ) with *
*    the 12 bit adc. It assumes that each 8bit dac bit is independent of
*    any other -- to atleast 20 bits.                                  *
*                                                                      *
* cal_dac set the adc to read the cal dac instead of the usual if_inputs
*    The adc_correction_table is zeroed so that the readings of the    *
*        12bit dac will come staight thur as 12 bit readings.          *
*    The 8 bit dac is set to 2^(bit) ( note: the dac                   *
*        is bits 2 to 9 -- bit 0,1 are donot cares ).                  *
*    The 12 cal dac is move to get the reading in the 12 bit adc range.*
*    Once this is done the 8 bit dac is moved down to 2^(bit) - 1      *
*        and then back to 2^(bit) and the difference is measured.      *
*    This difference is added to previous bit differences to get a     *
*        bit weighting.                                                *
*    After all 8 bit weightings are found, they are added to together to
*        to form the adc correction table for all possible 256 values.*
**************************************************************************
end_of_comment;
BOOLEAN PROCEDURE cal_adc;
BEGIN
INTEGER index,                              & index for DO loops &
        bit,                                & index of bit number 0=lsb&
        direction,
        ypower,                             & ydac value approx 2^bit &
        temp=ypower;
DOUBLE ARRAY bit_weight[0:7];               & bit values of 8bit ADC  &
DOUBLE double_temp;

SUBROUTINE setup_trigger_yadc ;
BEGIN
   index        := index - 1;
   cal_val[bit] := cal_val[bit] + direction;
   caldac       := cal_val[bit];
   IF ( cal_val[bit] <= 0 ) OR ( cal_val[bit] >= 4095 )
      OR ( index     <= 0 )
      THEN cal_valid := FALSE;
   trigger_yadc;
END setup_trigger_yadc ;


   control_receiver( num_vcal, denom_detector_gnd,
                     caling, if_no_gain, if_no_gain );
   set_if_gain;
```

```
#EJECT;
   FOR bit := 0 TO 7 DO
      BEGIN
      ypower := LEFT( 2, bit + 1);
      ydac   := ypower;

      index      := 100;
      direction  := -1;
      DO  setup_trigger_yadc
          UNTIL ( (yadc_scr  > adc_in_range) OR NOT cal_valid );

      index      := 100;
      direction  :=  1;
      DO  setup_trigger_yadc
          UNTIL ( (yadc_scr <= adc_in_range) OR NOT cal_valid );


      ydac := ypower - lsb_ydac;
      trigger_yadc;
      double_temp := yadc_scr ;   & 1st data point -- average !!!&

      ydac := ypower ;
      trigger_yadc;
      double_temp := double_temp - yadc_scr ;


      temp := INTEGER( ARIGHT( double_temp ,  cal_avg_bit ) ) AND %FFF;
     &IF yadc_cal_debug THEN BEGIN                                    debug&
     &    WNUM( cal_val[bit] ); WHEX(temp); CRLF;END;                  debug&
         & perphas save a copy of the bit weights ???  &
         & an error in production was not found-- due to 12 bit test?&
      IF (temp>=%800) OR (temp<=%500) OR (NOT cal_valid) THEN
         BEGIN
         cal_valid := FALSE;
         double_temp := ALEFT( %FFFFF800 , cal_avg_bit );
         END error test;
      IF bit # 0 THEN FOR index := 0 TO (bit - 1) DO
                   double_temp := double_temp + bit_weight[index];
      bit_weight[bit] := double_temp;
      END bit cal loop;

   FOR index := -255 TO 0 DO
      BEGIN
      yadc_scr := 0;
      FOR bit := 0 TO 7 DO
          IF TBIT( index + 255, bit) THEN      & yadc is inverted data &
             yadc_scr := yadc_scr + bit_weight[ bit ];
      adc_correction_table[ index ] := ARIGHT(yadc_scr,cal_avg_bit);
      END build full table;

   IF NOT cal_valid THEN warn(adc_cal_failed);
   cal_adc := cal_valid;
END cal_adc;
```

```
#EJECT;COMMENT                                                      cal_offset
******************************************************************************
* cal_offset                                                                 *
*     The offset of the IF system ( with the sync detectors connected)       *
* by grounding the input of the sync detectors, reducing the IF gain         *
* to minimum ( does this matter ? ), and rotating the LO phase to the        *
* test and reference detectors 0, 90, 180 and 270 degrees ( 0%,25%,50%,      *
* and 75% of 2 PI ). These four values are averaged together to find a       *
* center and this result is the offet. Test real and imag, and Ref           *
* real and imag are all done at the same time.                               *
*  There is averaging of the raw data as set be the calib_yadc routine.      *
*  NOTE: The offset cal of the yadc is in this offset and there is no        *
*     seperate yadc offset -- however the value is approximately the same
*
* Since (??) the offset is independent of IF gain, there is one only set
******************************************************************************
end of comment;
PROCEDURE cal_offset;
BEGIN
  INTEGER step,                                  & lo_phase setting index&
          index;                                 & general DO loop index&
  DOUBLE ARRAY partial_offset[0:3];

 control_receiver( num_detector_gnd, denom_detector_gnd,
                   caling, if_no_gain, if_no_gain );
   set_if_gain;

   partial_offset[ 0 ] := 0;   partial_offset[ 1 ] := 0;
   partial_offset[ 2 ] := 0;   partial_offset[ 3 ] := 0;
```

```
#EJECT;
   FOR step := phase_0 STEP phase_90 TO phase_270 DO
      BEGIN
      refpha := phase_step[ step ];
      tstpha := phase_step[ step ];
      delay( delay_200uS ); &??&
      trigger_yadc;
      FOR index := 0 TO 3 DO  partial_offset[ index ] :=
                   partial_offset[ index ] + yadc_scr[ index ];
      END rotating lo_phase;


   test_imag_offset  := ARIGHT( partial_offset[ 0 ], cal_avg_bit +2 );
   test_real_offset  := ARIGHT( partial_offset[ 1 ], cal_avg_bit +2 );
    ref_imag_offset  := ARIGHT( partial_offset[ 2 ], cal_avg_bit +2 );
    ref_real_offset  := ARIGHT( partial_offset[ 3 ], cal_avg_bit +2 );

 &IF yadc_cal_debug THEN BEGIN                                  debug&
 &   WHex( test_imag_offset , 6 );                              debug&
 &   WHex( test_real_offset , 6 );                              debug&
 &   WHex(  ref_imag_offset , 6 );                              debug&
 &   WHex(  ref_real_offset , 6 );                              debug&
 &   CRLF;   END;                                               debug&

END cal_offset;
```

```
#EJECT;COMMENT                                              cal_sync_detector
******************************************************************************
* cal_sync_detector does the quadrature gain correctinon of the              *
*   synchronous detectors -- ie correct the phase and amplitude of the       *
*   measured data to proper quadrature ( 90 deg ) and gain relationship      *
*                                                                            *
*   It measures the real and inaginary components ( x, y respectively )      *
*   of four known signals - provided by the clock as an 100khz calib         *
*   signal with shifted phase. Using these values, their squares, and        *
*   crossproducts ( computed as x, y are measured ), a least squares         *
*   fit on the correction coeffieciants need to correct measured data        *
*   is done. These coeffiecients are then offset and scaled to minimize      *
*   storage.                                                                 *
*                                                                            *
*                                                                            *
*                                                                            *
*   CHANGES:                                                                 *
*   6/20 -- change to rotating LO not SIGNAL -- Signal path has low BW       *
******************************************************************************
end of comment;
PROCEDURE  cal_sync_detector;
BEGIN
REAL ARRAY x, y,
           h[0:7],
           x_square, y_square,
           x_times_y[0:1];
 & WARNING: Compilier bug occurs if last array > 128 bytes from first &
COMPLEX ARRAY meas[0:4];
COMPLEX data;
REAL det;
REAL POINTER xp,yp,hp;
INTEGER chan,                          & chan select 0=test, 1=ref&
        index,                         & general do index  &
        step,                          & phase index of cal signal &
        step_index,                    & 2*step index  &
        range,
        range_offset;

   control_receiver( num_100khz_cal, denom_100khz_cal,
                     caling, if_1st_on, if_1st_on );
   set_if_gain;

    x_square[ 0 ] := 0;         x_square[ 1 ] := 0;
    y_square[ 0 ] := 0;         y_square[ 1 ] := 0;
   x_times_y[ 0 ] := 0;        x_times_y[ 1 ] := 0;
```

```
SYRDC.WORK.PD8510              THU, DEC 22, 1983, 11:07 AM      PAGE  27

#EJECT;
  FOR step := phase_0 STEP phase_90 TO phase_270 DO
     BEGIN                    & appears to be 180,90,0,-90 rotation&
     refpha := phase_step[ step ];
     tstpha := phase_step[ step ];
     delay( delay_1_msec );
     trigger_yadc;

     step_index := 2 & num of channels & * step;
     FOR chan:=0 TO 1 DO
        BEGIN
        y_square[ chan ] := y_square[ chan ] +
              ( y[ chan + step_index ]
                 := REAL( yadc_scr[ 2*chan ] ) )
              * y[ chan + step_index ] ;
        x_square[ chan ] := x_square[ chan ] +
              ( x[ chan + step_index ]
                 := REAL( yadc_scr[ 2*chan + 1 ] ) )
              * x[ chan + step_index ] ;
        x_times_y[ chan ] := x_times_y[ chan ] -    & negative sum &
              ( x[ chan + step_index ] * y[ chan + step_index ] );
        END chan storing measurements;

     END phase stepping cal signal;

  FOR chan:=0 TO 1 DO
     BEGIN
     det := 2.0E6  /          & 1 / cal_signal_normalizing_factor &
                &cal_avg * 125,000 nominal cal sig level == -10dbm&
              (    x_square[ chan ] *  y_square[ chan ]
               - x_times_y[ chan ] * x_times_y[ chan ] );

     STPNTR( yp, ADRS( y[ chan ] ) );
     STPNTR( xp, ADRS( x[ chan ] ) );
     STPNTR( hp, ADRS( h[ chan ] ) );

     hp[ 0 ] := (   ( xp[ 4 ] - xp[ 0 ] ) * y_square[  chan ]
               + ( yp[ 4 ] - yp[ 0 ] ) * x_times_y[ chan ] ) * det;

     hp[ 2 ] := (   ( xp[ 4 ] - xp[ 0 ] ) * x_times_y[ chan ]
               + ( yp[ 4 ] - yp[ 0 ] ) * x_square[  chan ] ) * det;

     hp[ 4 ] := (   ( xp[ 2 ] - xp[ 6 ] ) * y_square[  chan ]
               + ( yp[ 2 ] - yp[ 6 ] ) * x_times_y[ chan ] ) * det;

     hp[ 6 ] := (   ( xp[ 2 ] - xp[ 6 ] ) * x_times_y[ chan ]
               + ( yp[ 2 ] - yp[ 6 ] ) * x_square[  chan ] ) * det;

    &IF yadc_cal_debug THEN BEGIN                               debug&
    &FOR index := 0 TO 3 DO WREAL( hp[ 2 * index ] ); CRLF; END; debug&

     END compute correction for each detector channel;
```

```
SYRDC.WORK.PD8510              THU, DEC 22, 1983, 11:07        PAGE  28

#EJECT;
  range_offset := 0;
  FOR range := 0 TO 4 DO
     BEGIN
     store_h( ADRS( test_tables[ range_offset] ), ADRS( h[ 0 ] ),
              1.0,  0.0 );
     store_h( ADRS(  ref_tables[ range_offset] ), ADRS( h[ 1 ] ),
              1.0,  0.0 );
     range_offset := range_offset + h_blk_size;
     END store h matrix;

  detector_cal_valid := cal_valid;
```

```
SYRDC.WORK.PD8510              THU, DEC 22, 1983, 11:07 AM      PAGE  29

#EJECT;
  FOR chan := 0 TO 1 DO
     BEGIN
  FOR range := if_all_off TO if_4th_on DO
     BEGIN

    IF chan=0 THEN
           control_receiver( num_100khz_cal, denom_detector_gnd,
                  lock_donot_care, range, if_all_off )
     ELSE  control_receiver( num_ref_100khz_cal, denom_detector_gnd,
                  lock_donot_care, if_all_off, range );
    set_if_gain;

    x_square      := 0;
    y_square      := 0;
    FOR step := phase_0 STEP phase_90 TO phase_270  DO
       BEGIN                  & appears to be 180,90,0,-90 &
       refpha := phase_step[ step ];
       tstpha := phase_step[ step ];

       yadc_cal_ptr := ADRS( yadc_scr );
       delay( delay_200uS );
       trigger_yadc;

       data          := CNVE1( yadc_scr_cmplx );   & change to 20 bit &
                                              & when 20 bit is done&
       y_square := y_square + y[ step  ] *
                   ( y[ step  ] := IMAG( data ) );
       x_square := x_square + x[ step  ] *
                   ( x[ step  ] := REAL( data ) );
       END phase stepping cal signal;

    det := .06/(y_square + x_square ) ; &removing nominally cal level&
                                     & approx -24 dbm signal &
    meas[ range - if_all_off ] := COMPLEX(
         ( ( x[ 2 ] - x[ 0 ] ) + ( y[ 1 ] - y[ 3 ] )  ) * det  ,
         ( ( x[ 1 ] - x[ 3 ] ) + ( y[ 0 ] - y[ 2 ] )  ) * det   );
    END range steps;
```

```
SYRDC.WORK.PD8510              THU, DEC 22, 1983, 11:07 AM      PAGE  30

#EJECT;
     range_offset := 0;
     FOR range := 0 TO ( if_4th_on - if_all_off ) DO
        BEGIN

        data  := meas[ range ] / meas[ 1 ] ;  &normalize measurements&
        IF range # ( if_1st_on - if_all_off ) THEN
           BEGIN
           IF range >= ( if_2nd_on - if_all_off )     & correct for  &
              THEN  data := data  / meas[ 0 ];  &first stage abs error&

         &IF yadc_cal_debug THEN BEGIN WCPX(data); CRLF; END;   debug&

           IF range >= ( if_3th_on - if_all_off ) THEN
                            data := ( data * meas[ range - 1] );
           meas[ range ] := data ;

           IF chan = 0 THEN
              store_h(  ADRS( test_tables[ range_offset ] ),
              ADRS( h[ 0 ] ),REAL( data ),IMAG( data ))
            ELSE
              store_h(  ADRS( ref_tables[ range_offset ] ),
              ADRS( h[ 1 ] ),REAL( data ),IMAG( data ));
           END skip 1st stage on case;

        range_offset := range_offset + h_blk_size;
        END range loop -- mod h correction for IF gains;
     END chan loop for gain calibration;

  IF  NOT cal_valid  THEN
            IF  detector_cal_valid  THEN warn(autorange_cal_failed)
                                    ELSE warn(if_cal_failed);
  refpha := lo_normal_phase;
  tstpha := lo_normal_phase;
END cal_sync_detector;
```

```
SYRDC.WORK.PD8510                    THU, DEC 22, 1983, 11:07 AM     PAGE  31

                                                              reset_yadc_tables
#EJECT;COMMENT
*************************************************************************
*************************************************************************
end of comment;
PROCEDURE reset_yadc_tables;
BEGIN
INTEGER index, range, range_offset, range_exp;
     FOR index := -255 TO 0 DO adc_correction_table[ index ] := 0;
     test_imag_offset  := 0;          test_real_offset  := 0;
      ref_imag_offset  := 0;           ref_real_offset  := 0;
     FOR index := 0 TO  (( 6*h_blk_size) - 1)  DO
        BEGIN
        test_tables[index] := 0;
         ref_tables[index] := 0;
        END clear h  matrix;
     range_offset := 4;
     range_exp    := -1;
     FOR range := 0 TO 4 DO
        BEGIN
        test_tables[ range_offset ] := range_exp;
         ref_tables[ range_offset ] := range_exp;
        range_offset := range_offset +  h_blk_size;
        range_exp    := range_exp - 2 ;
        END set up range exp;

 END reset_yadc_tables;
```

```
SYADC.WORK.PD8510                    THU, DEC 22, 1983, 11:07 AM     PAGE  32

                                                           test_yadc_responding
#EJECT;COMMENT
*************************************************************************
*************************************************************************
end of comment;
BOOLEAN SUBROUTINE test_yadc_responding;
BEGIN
   irdis( y_adc_vctr );
   irclr( y_adc_vctr );
   xctrl := 1;
   force_trig_yadc;
   delay( delay_1_msec );
   IF TBIT( irirr , y_adc_vctr ) AND  NOT TBIT( status, end_of_trigger )
      THEN BEGIN  & yadc responding &
      control_yadc( ADRS( yadc_cal_ptr ), avg_point_to_point,
                           cal_avg,            ADRS( signal_bit_bucket ),
                          SBIT( 0, idle_process )   );

      init_yadc_irq;
      END   & yadc responding  &
     ELSE
      BEGIN & yadc not responding &
      cal_valid := FALSE;
      warn( adc_not_responding  );
      END   & yadc not responsing&;
   test_yadc_responding := cal_valid;
 END test_yadc_responding;
```

```
SYADC.WORK.PD8510                    THU, DEC 22, 1983, 11:07 AM     PAGE  33

                                                                    calib_yadc
#EJECT;COMMENT
*************************************************************************
*                                                                       *
* EXTERNAL SPECIFICATION FOR calib_yadc                                 *
*                                                                       *
* FUNCTION:                                                             *
*                                                                       *
*                                                                       *
*       calib_yadc will by some algorithm determine if it is needed    *
*              ie based on time or temperature
*                                                                       *
* DECLARATION INFORMATION:                                              *
*                                                                       *
*    INPUT:   cal_level    the degree of fullness of the IF cal         *
*                                                                       *
*    OUTPUT:                                                            *
*                                                                       *
* EXTERNAL EFFECTS:                                                     *
*                                                                       *
*************************************************************************
*                                                                       *
* LOGIC INFORMATION FOR calib_yadc                                      *
*                                                                       *
* MODULES CALLED:                                                       *
*                                                                       *
* INITIAL REFINEMENT:                                                   *
*                                                                       *
*
*************************************************************************
end of comment;
PROCEDURE calib_yadc(cal_level); VALUE cal_level; INTEGER cal_level;
                                                                   ENTRY;

BEGIN

   IF cal_level = force_cal THEN
      BEGIN
      cal_ctr := 0;
      IF old_cal_level < 0 THEN cal_level := full_if_cal
       ELSE  cal_level := old_cal_level;
      END;

   IF (
      ( ( cal_ctr := cal_ctr - 1 ) <= 0 ) AND ( NOT yadc_cal_inhibit ) )
                                             OR
        (  cal_level # old_cal_level )       OR
           yadc_cal_force                    THEN
     BEGIN
     old_cal_level := cal_level;
     cal_ctr       := cal_ctr_rate ;
     IF cal_ctr_rate < cal_ctr_limit_max THEN
                        cal_ctr_rate := cal_ctr_rate + 1;


      reset_yadc_tables;
      cal_valid := TRUE;
```

```
SYADC.WORK.PD8510                    THU, DEC 22, 1983, 11:07 AM     PAGE  34


    IF test_yadc_responding AND cal_adc THEN
          BEGIN
          IF cal_level > adc_cal_only THEN
             BEGIN
             cal_offset;
             IF cal_level > adc_if_offset_cal THEN
                 cal_sync_detector;
             END;
          END
     ELSE
          BEGIN
             test_imag_offset :=  test_real_offset  :=
             ref_imag_offset  :=  ref_real_offset   :=
                  adc_correction_table[-128] ;
          END adc_cal failed;

    check_abort;

    END cal loop;

 END calib_yadc;
 END$
```

APPENDIX C

MICROCODE SOFTWARE ROUTINES FOR THE VECTOR MATH PROCESSOR

****** 6510 COMPLEX MULTIPLIER DOCUMENTATION *******

BRIEF DEFINITION OF TERMS

```
ACC:      Accumulator, represented as 2 16-bit shift registers;
          2 accumulator pairs:  ACC(0) & ACC(1), ACC(3) & ACC(4)
          Shifts are done simultaneously to both ACC pairs.
          When doing real math, operands are loaded into either
            ACC(0) or ACC(1) for 16-bit values
            ACC(0) and ACC(1) for 32-bit values (ACC(1)=lower word)
            ACC(0) and ACC(1) for 24-bit values (ACC(1)=lower 8 bits)
          When doing complex math, operands are loaded as such:
            ACC(0) or ACC(1) for imaginary part
            ACC(2) or ACC(3) for real part
          Results are read from
            ACC(0) or ACC(1) for 16-bit floating point
                             or for imag part of complex result
            ACC(0) &  ACC(1) for 32-bit floating point math
            ACC(2) &  ACC(3) for 32-bit floating point math
            ACC(2) or ACC(3) for real part of comlex result

MPY:      Multiplier, represented as 2 16-bit parallel load serial
          shift multipliers;
          4 multipliers:  MPY(0), MPY(1), MPY(2), MPY(3)
          For complex math, 2 copies of multiplicand are loaded into
            MPY pair 0&1 and MPY pair 2&3
            MPY(0) & MPY(2) contain real part
            MPY(1) & MPY(3) contain imag part
          For non-complex math, operands are loaded into
            MPY(0) for 16-bit values
            MPY(0) & MPY(1) for 32-bit values  (MPY(0)=lower word)
          Shifts are done simultaneously to both MPY pairs.

EXP:      Exponent counter, used for aligning or normalizing values
          in ACC.  Can also be used as overflow flag.
          Values usually loaded into EXP are:
            exponent sums of multiplier & multiplicand
            exponent differences of divisor & dividend
            delta exponents between adder and addend

Normalization:
          While ACC (MSB <> MSB-1) --> decrement EXP and shift ACC left

Complex Normalization:  (DUAL)
          Normalization flag set to check normalized result in either
          real accumulator pair (ACC(0) & ACC(1)) or imaginary
          accumulator pair (ACC(2) & ACC(3)), whichever gets normalized
          first; otherwise only real ACC pair is checked for
          normalization.
```

Complex Values:
represented as 16-bit imag part, 16-bit real part, 8-bit exp.

Complex Math: (SUMPR)
Enables complex values to be computed, particulary for multiplication; cannot have 32-bit MPYs in this mode.

Complex adder/subtractor: (LMPYADD)
Adds/subtracts complex conjugates.
Defaults to subtract mode; LMPYADD sets it to add mode.

Adder/Subtractor: (SSUB)
Adds/subtracts parameters prior to shifting into accumulators.
Defaults to add mode; SSUB set it to subtract mode.

MPY extension: (MEXT)
Cascade MPY pairs to 32 bits,
Cannot do complex math (SUMPR) in this mode.

MICRO-ROUTINES

UADDFPR 16-bit add or subtract

APPLICATION: floating point/complex numbers

PRECISION: 16-bit mantissa, 8-bit exponent

INPUT: 16-bit addend, 16-bit adder, (mantissa only)
8-bit "delta" exponent (difference between exponents of addend and adder)

OUTPUT: 16-bit sum (mantissa only)
8-bit exponent (normalized result to be added to larger value exponent between addend and adder)

SPEED: 3.875 usec (min)
11.375 usec (max)

SPACE: 16 words

DESCRIPTION: (ACC = adder/subtractor; MPY = addend/subtrahend)
Multiply MPY by 1 so that MPY acts like a shift reg.
Align ACC while EXP counter < 0
Align MPY while EXP counter > 0
Add/subtract mantissas (ACC <-- ACC +/- MPY)
Normalize result in ACC
Set ADD latch in adder/subtractor for rounding purposes
Round up result by 1 bit

MACRO-ROUTINES: ADDCP, SUBCP, MRLLG

UADDFP Same as UADDFPR except w/o rounding

SPEED: 2.4375 usec (min)
6.0625 usec (max)

SPACE: 12 words

MACRO-ROUTINES: XFM2P

UADDLFP 24-bit add or subract

-------

APPLICATION: floating point numbers

PRECISION: 24-bit mantissa, 8-bit exponent

INPUT: 24-bit addend, 24-bit adder, (mantissa only)
8-bit "delta" exponent (difference between exponents of addend and adder)

OUTPUT: 24-bit sum (mantissa only)
8-bit exponent (normalized result to be added to larger value exponent between addend and adder)

SPEED: 4.375 usec (min)
15.625 usec (max)

SPACE: 21 words

DESCRIPTION: (ACC = adder/subtractor; MPY = addend/subtrahend)
Clear MPY & ACC adders
Since operands are loaded into ACC & MPY left-justified (MSB=bit 31, LSB=bit 8), right justify operands:
Sign extend ACC and shift out lower 8 bits
Multiply MPY by 1 (turn into shift register) while shifting out lower 8 bits
Align ACC while EXP counter < 0
Align MPY while EXP counter > 0
Add/subtract ACC and MPY, result left justified in ACC
Shift out lower ACC bits (0-7) that are not part of result
Left justify result in ACC with leading 0's in bits 0-7
Normalize result

MACRO-ROUTINES: ADDLF, DADLF

UMPYFP 16-bit multiply

------

APPLICATION: floating point/complex numbers

PRECISION: 16-bit mantissa, 8-bit exponent

INPUT: 16-bit multiplicand, 16-bit multiplier (mantissa only)

OUTPUT: 16-bit product (mantissa only)
8-bit exponent (to be added to sum exponent of inputs)

SPEED: 4.3125 usec (min)
8.0625 usec (max)

SPACE: 11 words

DESCRIPTION: (ACC = multiplier, product; MPY = mulitplicand)
Initialize product exponent
Multiply ACC (16 bits) by MPY (16 bits) --> 32-bit product upper 16 bits in MPY, lower 16 bits in ACC Shift upper 16 bits from MPY to ACC(0) (result register)
Shift out 2 additional bits (lose 2 bits of precision to make room for possible double overflow of result)
Increment exponent to account the 2 LSBs shifted out
Normalize result.
Ignore bits 0-14 of result and round up bit 15 into bits 16-31 of result.
Normalize result.

MACRO-ROUTINES: MPLDG, IFCAM, MPYAV, MCPMF, MPCPX, MPYCP, CPINV

UMPYFPNR Same as UMPYFP except no rounding of result

SPEED: 3.000 usec (min)
4.875 usec (max)

SPACE: 8 words

MACRO-ROUTINES: IFCAM

UMPYFPRR 16-bit multiply (reverse rounding)

APPLICATION: floating point/complex numbers

PRECISION: 16-bit mantissa, 8-bit exponent

INPUT: 16-bit multiplicand, 16-bit multiplier (mantissa only)

OUTPUT: 16-bit product (mantissa only)
8-bit exponent (to be added to sum exponent of inputs)

SPEED: 4.625 usec (min)
6.375 usec (max)

SPACE: 14 words

DESCRIPTION: (ACC = multiplier, product; MPY = mulitplicand)
Same as UMPYFP except before rounding section, bit 15 of ACC is inverted so that instead of rounding up it rounds down and vice-versa
NOTE: Used to create noise in signals every n points

MACRO-ROUTINES: CPXMR

ULMPYFP 16 by 32-bit multiply

APPLICATION: floating point/complex numbers

PRECISION: 16-bit mantissa, 8-bit exponent

INPUT: 16-bit multiplicand, 32-bit multiplier (mantissa only)

OUTPUT: 16-bit product (mantissa only)
8-bit exponent (to be added to sum exponent of inputs)

SPEED: 5.3125 usec (min)
9.0625 usec (max)

SPACE: 11 words

DESCRIPTION: (ACC = multiplier; MPY = mulitplicand)
Same as UMPYFP except
Multiply 16-bit MPY by 32-bit ACC = 48-bit result
upper 16 bits in MPY, lower 32 bits in ACC

MACRO-ROUTINES: XFM2P, MPYDV, IFCAM

MPYLFRC 32-bit multiply

APPLICATION: floating point numbers

PRECISION: 32-bit mantissa, no exponent

INPUT: 32-bit multiplicand, 32-bit multiplier (mantissa only)

OUTPUT: 32-bit product (mantissa only)
exponent = 1 for mantissa overflow, 0 for no overflow SPEED: 4.8125 usec (min)
6.6875 usec (max)

SPACE: 8 words

DESCRIPTION: (ACC = multiplier; MPY = mulitplicand)
Set exponent to 0
Multiply 32-bit MPY by 32-bit ACC = 64-bit result
upper 32 bits in MPY, lower 32 bits in ACC
Shift upper 32 bits from MPY to ACC (result register)
Set exponent to 1 in case of overflow
Check for difference in actual sign bit and ACC sign bit
through normalization check
Decrement exponent counter back to 0 if signs are same,
no overflow

MACRO-ROUTINES: MDDFR

UMPYLFRC2 32-bit multiply --> result * 2

APPLICATION: floating point numbers

PRECISION: 32-bit mantissa, no exponent

INPUT: 32-bit multiplicand, 32-bit multiplier (mantissa only)

OUTPUT: 32-bit product multiplied by 2 (mantissa only)

SPEED: 4.5 usec

SPACE: 6 words

DESCRIPTION: (ACC = multiplier; MPY = mulitplicand)
Multiply 32-bit MPY by 32-bit ACC = 64-bit result
upper 32 bits in MPY, lower 32 bits in ACC
Shift bits 0-30 (31 bits, ignore MSB) from MPY to ACC
(in lieu of shifting significant 32 bits of result
into ACC and then shifting left once to multiply by 2)
NOTE: similar to MPYLFRC except for overflow checking

MACRO-ROUTINES: DIVFP

UMPYDB 32-bit multiply

APPLICATION: 32-bit integers

PRECISION: 32-bit integers

INPUT: 32-bit multiplicand, 32-bit multiplier

OUTPUT: 32-bit product (lower 32 bits of actual 64-bit result)

SPEED: 2.625 usec

SPACE: 5 words

DESCRIPTION: (ACC = multiplier; MPY = mulitplicand)
Set exponent to 0
Multiply 32-bit MPY by 32-bit ACC = 64-bit result
upper 32 bits in MPY, lower 32 bits in ACC

MACRO-ROUTINES: MPYDI

MPYFRC 16-bit multiply

APPLICATION: floating point/complex numbers

PRECISION: 16-bit mantissa, no exponent

INPUT: 16-bit multiplicand, 16-bit multiplier (mantissa only)

OUTPUT: 16-bit product (mantissa only)
exponent = 1 or 2 for mantissa overflow, 0 for no overflow SPEED: 4.1875 usec (min)
7.9375 usec (max)

SPACE: 11 words

DESCRIPTION: (ACC = multiplier; MPY = mulitplicand)
Multiply 16-bit MPY by 16-bit ACC = 32-bit result
upper 16 bits in MPY, lower 16 bits in ACC(0)
Shift upper 16 bits from MPY to ACC (result register)
Clear exponent counter
Increment exponent in case of overflow
Check for difference in actual sign bit and ACC sign bit
through normalization check
Decrement exponent counter back to 0 if signs are same,
no overflow
Ignore lower bits 0-14 and round up bit 15 into resulting
bits 16-31
Increment exponent in case of overflow in result
Check for difference in actual sign bit and ACC sign bit
through normalization check
Decrement exponent if signs are the same, indicating no
overflow

MACRO-ROUTINES: MDSFR, MINTP, MRLDG, MPLDG

UMPYLFP 24 by 32-bit multiply
------

APPLICATION: floating point

PRECISION: 32-bit mantissa, 8-bit exponent

INPUT: 32-bit multiplicand, 24-bit multiplier (mantissa only)

OUTPUT: 32-bit product (mantissa only)
8-bit exponent to be added to exponent sum of multiplicand and mulitplier SPEED: 5.000 usec (min)
6.875 usec (max)

SPACE: 10 words

DESCRIPTION: (ACC = multiplier; MPY = mulitplicand)
Set exponent to zero
Shift out lower 8 bits of ACC to get 24 significant bits
Multiply 24-bit ACC by 32-bit MPY = 56-bit result
upper 32 bits in MPY, lower 24 bits in ACC
Shift significant 32 bits of result into ACC
Normalize result

MACRO-ROUTINES: XFM2P, MPYLF

UMPYDBDG 32-bit by 16-bit multiply
--------

APPLICATION: display formatting (from complex to display scale)

PRECISION: 32-bit value

INPUT: 32-bit multiplier, 16-bit multiplicand, 8-bit exponent

OUTPUT: 32-bit product

SPEED: 4.600 usec (min)
12.125 usec (max)

SPACE: 13 words

DESCRIPTION: (ACC = multiplier; MPY = multiplicand; EXP = exponent)
Converts ACC to floating point via normalization
Multiplies 16-bit MPY by 32-bit ACC = 48-bit product
16 bits in MPY, 32 bits in ACC
Shift most significant 16 bits from MPY to ACC
Convert final result in ACC to 32-bit integer value
by shifting ACC right ABS(EXP) times provided that
EXP is negative

MACRO-ROUTINES: MDBDG

UIFCAL IF calibration
------

APPLICATION: ???

PRECISION:

INPUT:

OUTPUT:

SPEED: 5.6857 usec (min)
9.4375 usec (max)

SPACE: 14 words

DESCRIPTION: ???

UNORMALIZE — Normalize ACC contents

APPLICATION: floating point/complex/integers

PRECISION: 32-bits

INPUT: 32-bit value in ACC

OUTPUT: Normalized 32-bit value in ACC

SPEED: .875 usec (min)
4.625 usec (max)

SPACE: 7 words

DESCRIPTION: Clear adders
Sign extend ACC by 1 bit (use ACC adder)
Shift out ACC MSB from left side & decrement exponent
a maximum of 32 bits or until normalized
(ACC MSB <> ACC adder bit)
Shift in extended sign bit from ACC adder to ACC MSB
and increment exponent

MACRO-ROUTINES: MYNRM

ACCSHIFT — Shifts 32-bit register 16 bits to the right

APPLICATION: floating point/complex/integers

PRECISION: 32-bits

INPUT: 32-bit value in ACC

OUTPUT: ACC arithmetically shifted right 16 bits

SPEED: 1.50 usec

SPACE: 5 words

DESCRIPTION: Sign extend ACC in ACC adder and shift ACC right 16 bits
NOTE: Especially used for chaining multiply operations

MACRO-ROUTINES: MPLDG

USHIFT — Shifts 32-bit register to the right by EXP bits
(EXP = absolute value of negative exponent value)

```
APPLICATION:  floating point/complex/integers

PRECISION:    32-bits

INPUT:        32-bit value in ACC, 8-bit negative exponent

OUTPUT:       ACC arithmetically shifted right EXP bits

SPEED:        .75 usec (min)
              4.5 usec (max)

SPACE:        6 words

DESCRIPTION:  Sign extend ACC in ACC adder
              while exponent < 0:
                shift ACC right 1 bit and increment exponent

MACRO-ROUTINES:   MRLDG, MSHFT


MACRO-ROUTINES
==============

The following macros are arranged in alphabetical order, however,
some of them are arranged in a specific order in the multiplier source
and may need to be regarded in that order due to the current 68K
math/data processing routines' implementation.

Macros which may depend on other macros before or ahead of them are
indicated as follows:

<macro label>: description of macro
               (after <prior macro label>)
               .
               .
               detail description of each word
               .
               .
               (followed by <next macro label>)

NOTE:  when ACC's and MPY's are loaded or read, the real or imag parts
       claimed to be loaded or read may not be correct.


ADDCP:     Add 32-bit complex numbers  (mantissa only)
           16-bit real, 16-bit imag

           0) Load imag part of addend in MPY(0)
           1) Load real part of addend in MPY(2)
           3) Load imag part of augend in ACC(0)
           3) Load real part of augend in ACC(2)
           4) Load delta EXP, enable complex normalization,
              *** Execute UADDFPR ***
           5) Read imag part of result in ACC(0)
           6) Read real part of result in ACC(2)
           7) Read exponent from normalization, terminate.


ADDFP:     Add 16-bit floating point (mantissa only)

           0) Load addend in MPY(0)
           1) Load augend in ACC(0)
           2) Load delta exponent of 2 operands
              *** Execute UADDFPR ***
```

```
          3) Read result from ACC(0)
          4) Read exponent from normalization, terminate.


ADDLF:    Add 24-bit floating point (mantissa)

          0) Load EXP,
             Extend MPY to 32 bits,
             *** Execute UADDLFP ***


CPINV:    0-3:  a+bi --> a**2+b**2
          4-9:  (a+bi)(c+di) --> (a+bi)(c-di)

          0) Load ACC(1) & MPY(0) with 16-bit imag part of operand
          1) Load ACC(3) & MPY(3) with 16-bit real part of operand,
             Enable complex multiply,
             *** Execute UMPYFP ***
          2) Read real part of result in ACC(0)
          3) Read normalization exponent, terminate.
          4) Load ACC(3) with 16-bit imag part of operand
          5) Load ACC(1) with 16-bit real part of operand
          6) Load MPY(0) & MPY(2) with 16-bit real operand,
             Enable complex normalization,
             *** Execute UMPYFP ***
          7) Read 16-bit imag part of result from ACC(2)
          8) Read 16-bit real part of result from ACC(0)
          9) Read EXP for exponent, terminate


CPXMR:    Complex multiply with reverse rounding
          (after MPYAV)

          0) Load ACC(3) with 16-bit imag part
          1) Load ACC(1) with 16-bit real part,
             enable complex normalization,
             enable complex multiply,
             set ADD latch in complex adder,
             *** Execute UMPYFPRR ***

DADLF:    Add 24-bit floating pt. (mantissa) - 2 simultaneous adds

          0) Load upper 16 bits of 1st multiplicand in MPY(1)
          1) Load lower 16 bits of 1st multiplicand in MPY(0)
          2) Load upper 16 bits of 2nd multiplicand in MPY(3)
          3) Load lower 16 bits of 2nd multiplicand in MPY(2)
          4) Load upper 16 bits of 1st multiplier in ACC(0)
          5) Load lower 16 bits of 1st multiplier in ACC(1)
          6) Load upper 16 bits of 2nd multiplier in ACC(2)
          7) Load lower 16 bits of 2nd multiplier in ACC(3)
          8) Load exponent (common to both sets of operands),
             Extend MPY pairs to 32 bits,
             Enable complex normalization,
             *** Execute UADDLFP ***
          9) Read upper 16 bits of 1st result
          10)Read lower 16 bits of 1st result
          11)Read upper 16 bits of 2nd result
          12)Read lower 16 bits of 2nd result
          13)Read resulting exponent, terminate


DIVFP:    32-bit floating point divide (???)
          (after SUBLF)

          0) Load upper 16 bits of operand in MPY(1) & MPY(3)
```

1) Load lower 16 bits of operand in MPY(0) & MPY(2),
   extend MPY pairs to 32 bits,
   * Execute UMPYLFRC2 *

(followed by MYNFM)

IFCAL: If calibration (???)
(after MFDVR)

0) Load MPY(2) with 16-bit imag part of operand
1) Load MPY(1) with 16-bit real part of operand
2) Load MPY(3) with 16-bit imag part of operand
3) Load MPY(0) with 16-bit real part of operand
4) Load ACC(0) with upper 16 bits of operand
5) Load ACC(1) with lower 16 bits of operand
6) Load ACC(2) with upper 16 bits of operand
7) Load ACC(3) with lower 16 bits of operand
   Enable complex normalization,
   Enable complex multiply,
   * Execute UIFCAL *

(followed by IFCAM)

IFCAM: (???)

0) Read 16-bit result in ACC(0)
1) Read 16-bit result in ACC(3)
2) Read exponent
3) Load MPY(2) with 16-bit imag part of operand
4) Load MPY(1) with 16-bit real part of operand
5) Load MPY(3) with 16-bit imag part of operand
6) Load MPY(0) with 16-bit real part of operand
7) Load ACC(0) with upper 16 bits of operand
8) Load ACC(1) with lower 16 bits of operand
9) Load ACC(2) with upper 16 bits of operand
10) Load ACC(3) with lower 16 bits of operand
   Enable complex normalization,
   Enable complex multiply,
   * Execute UIFCAL *
11) Read 16-bit imag part of result in ACC(0)
12) Read 16-bit real part of result in ACC(2)
13) Read exponent, terminate.

14) Load ACC(1) & MPY(0) with 16-bit imag part of operand
15) Load ACC(3) & MPY(3) with 16-bit real part of operand
   Enable compelx multiply,
   * Execute UMPYFP *
16) Load MPY(1) & MPY(3) with 16-bit imag part of operand
17) Load MPY(0) & MPY(2) with 16-bit real part of operand
18) Read 16-bit real part of result in ACC(0)
19) Read exponent result from EXP
20) Load ACC(3) with 16-bit imag part of operand
21) Load ACC(1) with 16-bit real part of operand,
   enable compelx normalization,
   * Execute UMPYFPNR *
22) Load MPY(0) & MPY(2) with 16-bit real part of operand,
   Enable complex normalization,
   * Execute ULMPYFP *

(followed by MPYAV)

LLDA0: Loads ACC pairs, or reads ACC(0)

```
         0) Load ACC(0) with upper 16 bits of operand or
            Read 16-bit result from ACC(0)
         1) Load ACC(1) with lower 16 bits of operand

         (followed by LLDA2)


LLDA2:   Loads ACC pair, or reads ACC(2)
         (after LLDA0)

         0) Load ACC(2) with upper 16 bits of operand or
            Read 16-bit result from ACC(2)
         1) Load ACC(3) with lower 16 bits of operand

         (followed by LLDMY)

LLDMY:   Loads MPY(0) and MPY(1)
         (after LLDA2)

         0) Load MPY(1) with upper 16 bits of operand
         1) Load MPY(0) with lower 16 bits of operand

         (followed by RDEXP)


MCPMP:   (???)
         (after CPXMR)

         0) Load MPY(1) & MPY(3) with 16-bit imag part of operand
         1) Load MPY(0) & MPY(2) with 16-bit real part of operand
         2) Load ACC(1) with imag part of operand
         3) Load ACC(3) with real part of operand,
            Enable complex normalization,
            Enable complex multiply,
            *** Execute UMPYFP ***
         4) Read resulting exponent from EXP
         5) Read 16-bit imag part of result from ACC(0)
         6) Read 16-bit real part of result from ACC(2), terminate.

         (followed by CPINV)


MDBDG:   32-bit integer by 16-bit fraction multiply
         (after MPINRM)

         0) Load ACC(0) with upper 16 bits of operand 1
         1) Load ACC(1) with lower 16 bits of operand 1
         2) Load MPY(0) with 16-bit fraction of operand 2
         3) Load exponent of operand 2
            *** Execute UMPYDBDG ***
         4) Read upper 16 bits of result

         (followed by MRLDG)


MDDFR:   32-bit fractional multiply, OP1*OP2 and OP1*OP3

         0) Load MPY(1) & MPY(3) with upper 16 bits of operand 1
         1) Load MPY(0) & MPY(2) with lower 16 bits of operand 1
         2) Load ACC(0) with upper 16 bits of operand 2
         3) Load ACC(1) with lower 16 bits of operand 2
         4) Load ACC(2) with upper 16 bits of operand 3
         5) Load ACC(3) with lower 16 bits of operand 3
            Enable complex normalization,
            Extend MPY pairs to 32 bits,
```

```
         *** Execute MPYLFRC ***
         6) Read upper 16 bits of result 1 in ACC(0)
         7) Read lower 16 bits of result 1 in ACC(1)
         8) Read upper 16 bits of result 2 in ACC(2)
         9) Read lower 16 bits of result 2 in ACC(3)
            terminate.


MDSFR:   (???) OP1*OP3 and OP2*OP3

         0) Load MPY(0) with 16-bit imag part of operand 1
         1) Load MPY(1) with 16-bit real part of operand 1
         2) Load MPY(2) with 16-bit imag part of operand 2
         3) Load MPY(3) with 16-bit real part of operand 2
         4) Load ACC(3) with 16-bit imag part of operand 3
         5) Load ACC(1) with 16-bit real part of operand 3
            Enable complex normalization,
            Set ADD latch to complex adder,
            Enable complex multiply,
            *** Execute MPYFRC ***
         6) Read 16-bit imag part of result from ACC(0)
         7) Read 16-bit real part of reault from ACC(2), terminate.


MINIP:   (???)
         (after MPLOG)

         0) Load MPY(1) with 16-bit imag part of operand
         1) Load MPY(2) with 16-bit real part of operand
            set ADD latch in complex adder
         2) Load ACC(3) with 16-bit imag part of operand
         3) Load ACC(1) with 16-bit real part of operand
            Enable complex multiply,
            *** Execute MPYFRC ***
         4) Real 16-bit real part of result from ACC(2)
            terminate.


MPCPX:   Multiply 2 complex numbers (16-bit imag, 16-bit real)
         (after MPYDV)

         0) Load imag part of multiplicand in MPY(1) & MPY(3)
         1) Load real part of multiplicand in MPY(0) & MPY(2)
         2) Load imag part of multiplier in ACC(1)
         3) Load real part of multiplier in ACC(3),
            enable complex normalization,
            enable complex multiply,
            *** Execute UMPYFF ***

         (followed by MPDVR)


MPDVR:   Read complex result from ACC
         (after MPCPX)

         0) Read 16-bit imag result from ACC(2)
         1) Read 16-bit real result from ACC(0)

         (followd by IFCAL)


MPLDG:   (???)
         (after MRLDG)

         0) Load MPY(0) & MPY(2) with 16-bit imag part of operand 1
         1) Load MPY(1) & MPY(3) with 16-bit real part of operand 1
```

```
2) Load ACC(3) with 16-bit imag part of operand 2
3) Load ACC(1) with 16-bit real part of operand 2
   Enable complex normalization,
   Enable complex multiply,
   *** Execute UMPYFP ***
4) Read resulting exponent from EXP
5) Load MPY(0) with 16-bit operand,
   *** Execute ACCSHIFT ***
6) Load MPY(2) with 16-bit operand,
   *** Execute MPYFRC ***

(followed by MSHFT)
```

```
MPLOG:     R**2 - I**2 = take magnitude of complex value

           0) Load ACC(1) & MPY(0) with 16-bit imag part of operand
           1) Load ACC(3) & MPY(3) with 16-bit real part of operand
              enable complex multiply
              *** Execute UMPYFP ***
           2) Read 16-bit real part of result from ACC(0)
           3) Read resulting exponent from EXP, terminate.

           (followed by MINTP)
```

```
MPYAV:     (???)
           (after IPCAM)

           0) Read ACC(2) wh/ contains 16-bit imag part
           1) Read ACC(0) wh/ contains 16-bit real part
           2) Read exponent from EXP, terminate.

           3) Load MPY(3) with 16-bit imag part of operand 1
           4) Load MPY(2) with 16-bit real part of operand 1
           5) Load MPY(0) with 16-bit imag part of operand 2
           6) Load MPY(1) with 16-bit real part of operand 2
           7) Load ACC(3) with 16-bit imag part of operand 3
           8) Load ACC(1) with 16-bit real part of operand 3,
              Enable complex normalization,
              Enable complex multiply,
              Set add latch in complex adder,
              *** Execute Execute UMPYFP ***
           9) Read 16-bit imag part of result from ACC(0)
           10)Read 16-bit real part of result from ACC(2)

           (followed by CPXMR)
```

```
MPYCP:     Multiply 2 complex numbers (16-bit imag, 16-bit real)

           0) Load imag part of multiplicand in MPY(0) & MPY(2)
           1) Load real part of multiplicand in MPY(1) & MPY(3)
           2) Load imag part of multiplier in ACC(3), Clear EXP
           3) Load real part of multiplier in ACC(1),
              Enable complex normalization, enable complex math
              *** Execute UMPYFP ***
           4) Read 16-bit imag part of result from ACC(0)
           5) Read 16-bit real part of result from ACC(2)
           6) Read resulting exponent in EXP counter, terminate.
```

```
MPYDI:     Multiply 2 32-bit integers

           0) Load MPY(3) with upper 16 bits of operand 1
           1) Load MPY(2) with lower 16 bits of operand 1,
              set add latch to complex adder
```

```
         2) Load ACC(2) with upper 16 bits of operand 2
         3) Load ACC(3) with lower 16 bits of operand 2
            Extend MPY pairs to 32 bits
            *** Execute UMPYDB ***
         4) Read upper 16 bits of result from ACC(2)
         5) Read lower 16 bits of result from ACC(3)
            terminate.


MPYDV:   Used by complex divide to multiply real & imag part by const.
         (after MSHFT)

         0) Load 16-bit values into MPY(0) & MPY(2),
            enable complex normalization
            *** Execute ULMPYFP ***
         1) Read exponent counter

         (followed by MPCPX)


MPYLF:   Multiply long floating point
         (after RDEXP)

         0) Load MPY(1) with upper 16-bits of operand
         1) Load MPY(0) with lower 16 bits of operand,
            Extend MPY pairs to 32 bits,
            *** Execute UMPYLFP ***

         (followed by ADDLF)


MRLDG:   (???)
         (after MDBDG)

         0) Load ACC(0) with 16-bit operand
         1) Load EXP with exponent
         2) Load MPY(0) with 16-bit operand,
            *** Execute UADDFPR ***
         3) Read 16-bit result in ACC(0)
         4) Read resulting exponent from EXP
            terminate.

         5) Load MPY(2) with 16-bit operand
         6) Load ACC(3) with 16-bit operand,
            *** Execute UMPFRC ***
         7) Load EXP with exponent,
            *** Execute USHIFT ***
         8) Read 16-bit result in ACC(2), terminate.

         (followed by MPLDG)


MSHFT:   Shift 32-bit value ABS(EXP) bits (EXP<0)
         (after MPLDG)

         0) Load EXP,
            *** Execute USHIFT ***
         1) Read ACC(0)
         2) Read ACC(2), terminate.

         (followed by MPYDV)


MYNRM:   Normalize 32-bit value in ACC(0) & ACC(1)
         (after DIVFP)
```

```
        0) Load ACC(0) with upper 16 bits of value
        1) Load ACC(1) with lower 16 bits of value,
           *** Execute UNORMALIZE ***

        (followed by MDELG)


RDEXP:  Reads exponent
        (after LIDMY)

        0) Read exponent from EXP

        (followed by MPYLF)


SUBCP:  Subtract 16-bit complex numbers  (mantissa only)

        0) Load MPY(0) with 16-bit imag part of operand 1
           Set subtract line in adder hardware
        1) Load MPY(2) with 16-bit real part of operand 1
        2) Load ACC(0) with 16-bit imag part of operand 2
        3) Load ACC(2) with 16-bit real part of operand 2
        4) Load delta exponent into EXP,
           Enable complex normalization,
           *** Execute UADDFPR ***
        5) Read 16-bit imag part of result from ACC(0)
        6) Read 16-bit real part of result from ACC(2)
        7) Read resulting exponent from EXP, terminate.
```

We claim:

1. An RF network analyzer comprising:

a pair of synchronous detectors having a plurality of output terminals:

sample and hold means coupled to the plurality of detector output terminals for sampling and holding signals from the pair of synchronous detectors, the sample and hold means having a plurality of sample and hold output terminals to provide sample and hold output signals:

a multiplexor coupled to the plurality of sample and hold output terminals to combine the sample and hold output signals, the multiplexor having a multiplexor output terminal to provide multiplexor output signals:

analog to digital converter means for digitizing the multiplexor output signals:

the synchronous detectors, sample and hold means, multiplexor, and analog to digital converter means connected together as an IF string: and calibration means for digitally calibrating the complex gain and offset of the IF string.

2. A method for determining the true vector gain of an IF string in an RF network analyzer, said IF string having a plurality of cascaded amplifiers coupled to a parallel pair of synchronous detectors, said method comprising:

(a) turning off the gain in all of the plurality of cascaded amplifiers;

(b) grounding the input of the plurality of cascaded amplifiers;

(c) measuring the outputs of the synchronous detectors at each of four phase offsets 0, 90, 180 and 270 degrees to determine the measured offsets of the IF string; and (d) averaging the four phase offset values for each of the synchronous detectors to calculate the true complex values of the offset of the IF string.

3. A method as in claim 2 further comprising:

(e) turning on the gain of one of the plurality of cascaded amplifiers;

(f) applying a calibration frequency signal to the input of the plurality of cascaded amplifiers;

(g) measuring the outputs of the synchronous detectors at each of the four phase offsets to determine the measured complex gain of the IF string with the one amplifier on;

(h) subtracting the true complex values of the offset of the IF string to determine the offset corrected measured complex gain with the one amplifier on; and (i) calculating the least squares error fit of the offset corrected measured complex gain to determine the true complex values of the complex gain of the IF string with the one amplifier on.

4. A method as in claim 3 further comprising:

repeating steps (e) through (i) with each one of the plurality of cascaded amplifiers on one at a time; and multiplying the true complex values of the complex gains of each cascaded amplifier to calculate the true complex values of the complex gain of the entire IF string.

* * * * *